US012239016B2

(12) United States Patent
Lee et al.

(10) Patent No.: US 12,239,016 B2
(45) Date of Patent: Feb. 25, 2025

(54) ORGANIC LIGHT EMITTING ELEMENT

(71) Applicant: LG CHEM, LTD., Seoul (KR)

(72) Inventors: Woochul Lee, Daejeon (KR); Ki Dong Koo, Daejeon (KR); Ji Young Choi, Daejeon (KR); Young Seok Kim, Daejeon (KR); Joo Ho Kim, Daejeon (KR); Kongkyeom Kim, Daejeon (KR); Dongheon Kim, Daejeon (KR); Younghee Lee, Daejeon (KR); Ki Kon Lee, Daejeon (KR); Sujeong Geum, Daejeon (KR); Jung Min Yoon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 777 days.

(21) Appl. No.: 16/639,055

(22) PCT Filed: Sep. 18, 2018

(86) PCT No.: PCT/KR2018/010980
§ 371 (c)(1),
(2) Date: Feb. 13, 2020

(87) PCT Pub. No.: WO2019/059611
PCT Pub. Date: Mar. 28, 2019

(65) Prior Publication Data

US 2020/0373496 A1 Nov. 26, 2020

(30) Foreign Application Priority Data

Sep. 19, 2017 (KR) ........................ 10-2017-0120525

(51) Int. Cl.
*H10K 85/60* (2023.01)
*C09K 11/06* (2006.01)
*H10K 85/40* (2023.01)

(52) U.S. Cl.
CPC ........... *H10K 85/654* (2023.02); *H10K 85/40* (2023.02); *H10K 85/622* (2023.02);
(Continued)

(58) Field of Classification Search
CPC ............. H01L 51/0052; H01L 51/0058; H01L 51/0073; H01L 51/0074; H01L 51/0094;
(Continued)

(56) References Cited

U.S. PATENT DOCUMENTS

2010/0025661 A1* 2/2010 Wang .................. H01L 51/0052
257/E51.026
2011/0108826 A1* 5/2011 Jang ..................... H10K 85/626
257/E51.038
(Continued)

FOREIGN PATENT DOCUMENTS

JP 2005314239 A * 11/2005
JP 2010215759 A * 9/2010
(Continued)

OTHER PUBLICATIONS

Hatakeyama et al., machine translation of JP-2005-314239-A (2005) pp. 1-34. (Year: 2005).*
(Continued)

*Primary Examiner* — Dylan C Kershner
(74) *Attorney, Agent, or Firm* — BRYAN CAVE LEIGHTON PAISNER LLP

(57) ABSTRACT

Provided is an organic light emitting device comprising an anode; a cathode; and a light emitting layer provided between the anode and the cathode, wherein the light emitting layer comprises a first host material comprising a compound of Chemical Formula A:

[Chemical Formula A]

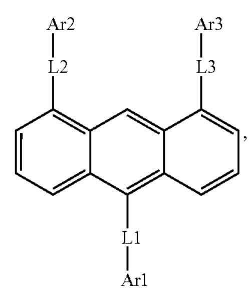

a second host material including a compound of Chemical Formula B:

[Chemical Formula B]

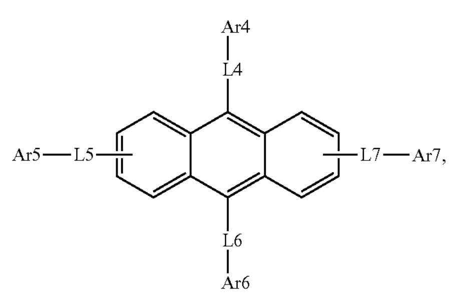

and a dopant material comprising a compound of Chemical Formula C or D:

(Continued)

[Chemical Formula C]

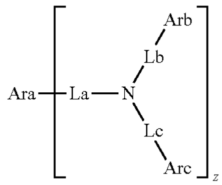

[Chemical Formula D]

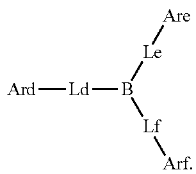

13 Claims, 1 Drawing Sheet

(52) U.S. Cl.
CPC ......... *H10K 85/626* (2023.02); *H10K 85/631* (2023.02); *H10K 85/6574* (2023.02); *H10K 85/6576* (2023.02); *C09K 11/06* (2013.01)

(58) Field of Classification Search
CPC ............... H01L 51/008; H01L 51/0054; H01L 51/0059; H01L 51/006; H01L 51/0061; C09K 11/06; C09K 2211/1014; C09K 2211/1022; H10K 85/615; H10K 85/626; H10K 85/653; H10K 85/655; H10K 85/40; H10K 85/658
See application file for complete search history.

(56) References Cited

U.S. PATENT DOCUMENTS

| | | | | |
|---|---|---|---|---|
| 2011/0114934 | A1* | 5/2011 | Kim ..................... | C07D 213/53 548/440 |
| 2015/0069344 | A1 | 3/2015 | Kim et al. | |
| 2015/0236274 | A1* | 8/2015 | Hatakeyama ............. | C07F 5/02 548/405 |
| 2015/0325800 | A1* | 11/2015 | Ito ........................ | H10K 85/615 548/440 |
| 2016/0181542 | A1 | 6/2016 | Kawamura et al. | |
| 2017/0155050 | A1 | 6/2017 | Kim et al. | |

FOREIGN PATENT DOCUMENTS

| | | |
|---|---|---|
| KR | 10-20100006979 | 1/2010 |
| KR | 10-20100007143 | 1/2010 |
| KR | 10-20150029430 | 3/2015 |
| KR | 10-20150077588 | 7/2015 |
| KR | 10-20160052526 | 5/2016 |
| KR | 10-20160119683 | 10/2016 |
| KR | 10-20170064131 | 6/2017 |
| KR | 20170116885 A * | 10/2017 |
| KR | 10-20180071850 | 6/2018 |

OTHER PUBLICATIONS

Nishizeki et al., machine translation of JP 2010-215759 (2010) pp. 1-42. (Year: 2010).*

Hatakeyama et al., "Ultrapure Blue Thermally Activated Delayed Fluorescence Molecules: Efficient HOMO-LUMO Separation by the Multiple Resonance Effect" Advanced Materials (2016) vol. 28, pp. 2777-2781. (Year: 2016).*

Lee et al., machine translation of KR-20170116885-A (2017) pp. 1-137. (Year: 2017).*

* cited by examiner

【FIG 1】
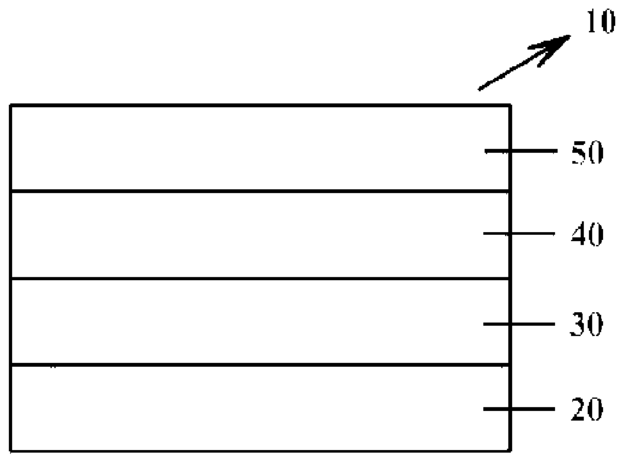
【FIG 2】
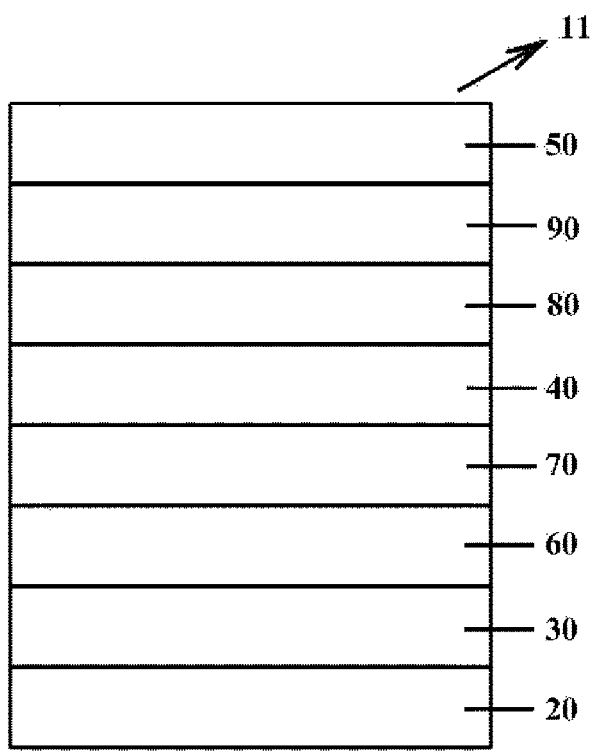

ORGANIC LIGHT EMITTING ELEMENT

CROSS-REFERENCE TO RELATED APPLICATIONS

This application is a National Stage Application of International Application No. PCT/KR2018/010980 filed on Sep. 18, 2018, which claims priority to and the benefits of Korean Patent Application No. 10-2017-0120525, filed with the Korean Intellectual Property Office on Sep. 19, 2017, the entire contents of which are incorporated herein by reference.

TECHNICAL FIELD

The present specification relates to an organic light emitting device.

BACKGROUND

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, can be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

BRIEF SUMMARY

Technical Problem

The present specification is directed to providing an organic light emitting device.

Technical Solution

One embodiment of the present specification provides an organic light emitting device including an anode; a cathode; and a light emitting layer provided between the anode and the cathode, wherein the light emitting layer includes a first host material including a compound of the following Chemical Formula A, a second host material including a compound of the following Chemical Formula B, and a dopant material including a compound of the following Chemical Formula C or D:

[Chemical Formula A]

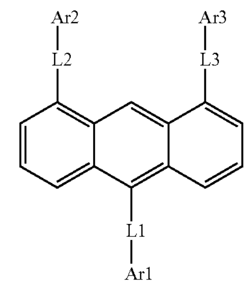

wherein in Chemical Formula A:

Ar1 to Ar3 are the same as or different from each other, and each independently is a substituted or unsubstituted aryl group, or a substituted or unsubstituted heterocyclic group; and L1 to L3 are the same as or different from each other, and each independently is a direct bond, a substituted or unsubstituted arylene group, or a substituted or unsubstituted divalent heterocyclic group;

[Chemical Formula B]

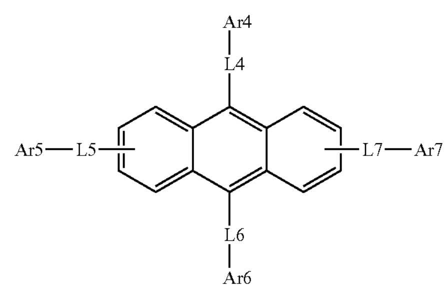

wherein in Chemical Formula B:

Ar4 to Ar7 are the same as or different from each other, and each independently is hydrogen, a substituted or unsubstituted aryl group, or a substituted or unsubstituted heterocyclic group; and L4 to L7 are the same as or different from each other, and each independently is a direct bond, a substituted or unsubstituted arylene group, or a substituted or unsubstituted divalent heterocyclic group;

[Chemical Formula C]

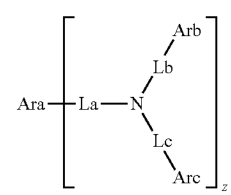

wherein in Chemical Formula C:

Ara to Arc are the same as or different from each other, and each independently is a substituted or unsubstituted aryl group, or a substituted or unsubstituted heterocyclic group;

La to Lc are the same as or different from each other, and each independently is a direct bond, a substituted or unsubstituted arylene group, or a substituted or unsubstituted divalent heterocyclic group; and z is an integer of 1 to 3, and when z is an integer of 2 or greater, structures in the parentheses are the same as or different from each other;

[Chemical Formula D]

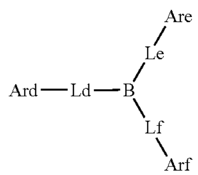

wherein in Chemical Formula D:

Ard to Arf are the same as or different from each other, and each independently is a substituted or unsubstituted aryl group, or a substituted or unsubstituted heterocyclic group, or adjacent groups bond to each other to form a substituted or unsubstituted ring; and Ld to Lf are the same as or different from each other, and each independently is a direct bond, a substituted or unsubstituted arylene group, or a substituted or unsubstituted divalent heterocyclic group.

Another embodiment of the present specification provides a solution process organic light emitting device (soluble OLED) including an anode; a cathode; and a light emitting layer provided between the anode and the cathode, wherein the light emitting layer includes a first host material including the compound of Chemical Formula A, a second host material including the compound of Chemical Formula B, and a dopant material including the compound of Chemical Formula C or D.

Advantageous Effects

An organic light emitting device according to one embodiment of the present specification is capable of enhancing efficiency, obtaining a low driving voltage and/or enhancing lifetime properties.

DESCRIPTION OF DRAWINGS

FIG. 1 illustrates an organic light emitting device (10) according to one embodiment of the present specification.

FIG. 2 illustrates an organic light emitting device (11) according to another embodiment of the present specification.

REFERENCE NUMERALS

10, 11: Organic Light Emitting Device
20: Substrate
30: First Electrode
40: Light Emitting Layer
50: Second Electrode
60: Hole Injection Layer
70: Hole Transfer Layer
80: Electron Transfer Layer
90: Electron Injection Layer

DETAILED DESCRIPTION

Hereinafter, the present specification will be described in more detail.

One embodiment of the present specification provides an organic light emitting device including an anode; a cathode; and a light emitting layer provided between the anode and the cathode, wherein the light emitting layer includes a first host material including a compound of Chemical Formula A, a second host material including a compound of Chemical Formula B, and a dopant material including a compound of Chemical Formula C or D.

Using compounds having substituents at position numbers 9 and 10 of an anthracene core structure and compounds having substituents at position numbers 1, 8 and 10 of an anthracene core structure as a light emitting layer host in an organic light emitting device can lower a driving voltage, and greatly increase a device lifetime as well as increasing light emission efficiency in the organic light emitting device.

The organic light emitting device according to one embodiment of the present specification is capable of enhancing driving voltage, efficiency and/or lifetime properties in the organic light emitting device by adjusting an anthracene-based host material included in the light emitting layer to a certain ratio.

The organic light emitting device according to one embodiment of the present specification includes a solution process organic light emitting device (soluble OLED).

In the present specification, a description of a certain part "including" certain constituents means capable of further including other constituents, and does not exclude other constituents unless particularly stated on the contrary.

In the present specification, a description of one member being placed "on" another member includes not only a case of the one member adjoining the another member but a case of still another member being present between the two members.

Examples of substituents in the present specification are described below, however, the substituents are not limited thereto.

The term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents can be the same as or different from each other.

In the present specification, the term "substituted or unsubstituted" means being substituted with one, two or more substituents selected from the group consisting of deuterium; a halogen group; a nitrile group; a nitro group; a carbonyl group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted amine group; a substituted or unsubstituted alkylamine group; a substituted or unsubstituted arylamine group; a substituted or unsubstituted arylphosphine group; a substituted or unsubstituted phosphine oxide group; a substituted or unsubstituted aryl group; and a substituted or unsubstituted heterocyclic group, or being substituted with a substituent linking two or more substituents among the substituents illustrated above, or having no substituents. For example, a "substituent linking two or more substituents" can include an aryl group substituted with an alkyl group, an aryl group substituted with an aryl group, an aryl group substituted with a silyl group, an aryl group substituted with a heterocyclic group, a heterocyclic group substituted with an alkyl group, a heterocyclic group substituted with an aryl group, a heterocyclic group substituted with a heterocyclic group, and the like. The "substituent linking two or more substituents" can be a biphenyl group. In other words, a biphenyl group can be an aryl group, or interpreted as a substituent linking two phenyl groups.

In the present specification, the halogen group can include fluorine, chlorine, bromine or iodine.

In the present specification, the number of carbon atoms of the carbonyl group is not particularly limited, but is preferably from 1 to 50. Specifically, compounds having the following structures can be included, however, the carbonyl group is not limited thereto:

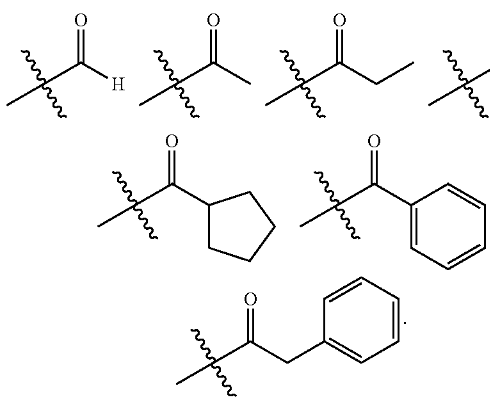

In the present specification, the alkyl group can be linear or branched, and although not particularly limited thereto, the number of carbon atoms is preferably from 1 to 50. Specifically, the number of carbon atoms is preferably from 1 to 30. More specifically, the number of carbon atoms is preferably from 1 to 20. Even more specifically, the number of carbon atoms is preferably from 1 to 10. Specific examples thereof can include a methyl group, an ethyl group, a propyl group, an n-propyl group, an isopropyl group, a butyl group, an n-butyl group, an isobutyl group, a tert-butyl group, a sec-butyl group, a 1-methylbutyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethylpropyl group, a 1,1-dimethylpropyl group, an isohexyl group, a 2-methylpentyl group, a 4-methylhexyl group, a 5-methylhexyl group and the like, but are not limited thereto.

In the present specification, the cycloalkyl group is not particularly limited, but preferably has 3 to 50 carbon atoms and more preferably has 3 to 30 carbon atoms. More specifically, the number of carbon atoms is preferably from 3 to 20. Specific examples thereof can include a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group and the like, but are not limited thereto.

In the present specification, the alkoxy group can be linear, branched or cyclic. The number of carbon atoms of the alkoxy group is not particularly limited, but is preferably from 1 to 50. Specifically, the number of carbon atoms is preferably 1 to 30. More specifically, the number of carbon atoms is preferably 1 to 20. Even more specifically, the number of carbon atoms is preferably 1 to 10. Specific examples thereof can include a methoxy group, an ethoxy group, an n-propoxy group, an isopropoxy group, an n-butoxy group, an isobutoxy group, a tert-butoxy group, a sec-butoxy group, an n-pentyloxy group, a neopentyloxy group, an isopentyloxy group, an n-hexyloxy group, a 3,3-dimethylbutyloxy group, an 2-ethylbutyloxy group, an n-octyloxy group, an n-nonyloxy group, an n-decyloxy group, a benzyloxy group, a p-methylbenzyloxy group and the like, but are not limited thereto.

In the present specification, specific examples of the amine group can include —$NH_2$, a methylamine group, a dimethylamine group, an ethylamine group, a diethylamine group, a phenylamine group, a naphthylamine group, a biphenylamine group, an anthracenylamine group, a 9-methylanthracenylamine group, a diphenylamine group, an N-phenylnaphthylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenylphenanthrenylamine group, an N-biphenylphenanthrenylamine group, an N-phenylfluorenylamine group, an N-phenylterphenylamine group, an N-phenanthrenylfluorenylamine group, an N-biphenylfluorenyl-amine group and the like, but are not limited thereto.

In the present specification, the alkyl group in the alkylamine group, the alkylthioxy group and the alkylsulfoxy group is the same as the examples of the alkyl group described above. Specifically, the alkylthioxy group can include a methylthioxy group, an ethylthioxy group, a tert-butylthioxy group, a hexylthioxy group, an octylthioxy group and the like, and the alkylsulfoxy group can include mesyl, an ethylsulfoxy group, a propylsulfoxy group, a butylsulfoxy group and the like, however, the alkylthoixy group and the alkylsulfoxy group are not limited thereto.

In the present specification, the alkenyl group can be linear or branched, and although not particularly limited thereto, the number of carbon atoms is preferably from 2 to 500. Specific examples thereof can include a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group and the like, but are not limited thereto.

In the present specification, the silyl group can be of a chemical formula of —$SiR_{100}R_{101}R_{102}$, and $R_{100}$, $R_{101}$ and $R_{102}$ can each be hydrogen, a substituted or unsubstituted alkyl group, or a substituted or unsubstituted aryl group. Specific examples of the silyl group can include a trimethylsilyl group, a triethylsilyl group, a t-butyl-dimethylsilyl group, a vinyldimethylsilyl group, a propyldimethylsilyl group, a triphenylsilyl group, a diphenylsilyl group, a phenylsilyl group and the like, but are not limited thereto.

In the present specification, specific examples of the phosphine oxide group can include a diphenylphosphine oxide group, a dinaphthylphosphine oxide group and the like, but are not limited thereto.

In the present specification, the aryl group is not particularly limited, but preferably has 6 to 50 carbon atoms, more preferably has 6 to 30 carbon atoms, and even more preferably has 6 to 20 carbon atoms. The aryl group can be monocyclic or polycyclic.

When the aryl group is a monocyclic aryl group, the number of carbon atoms is not particularly limited, but is preferably from 6 to 50. Specific examples of the monocyclic aryl group can include a phenyl group, a biphenyl group, a terphenyl group and the like, but are not limited thereto.

When the aryl group is a polycyclic aryl group, the number of carbon atoms is not particularly limited, but is preferably from 10 to 50. Specific examples of the polycyclic aryl group can include a naphthyl group, an anthracenyl group, a phenanthryl group, a triphenyl group, a pyrenyl group, a phenalenyl group, a perylenyl group, a chrysenyl group, a fluorenyl group and the like, but are not limited thereto.

In the present specification, the fluorenyl group can be substituted, and adjacent groups can bond to each other to form a ring.

When the fluorenyl group is substituted,

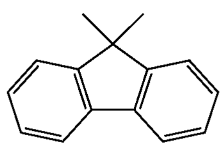,

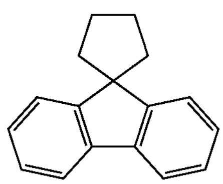,

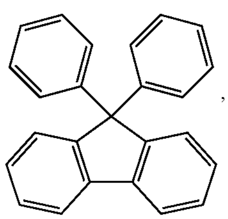,

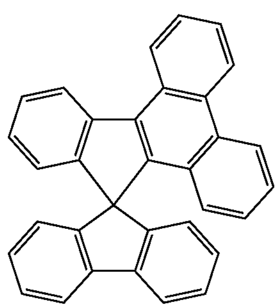,

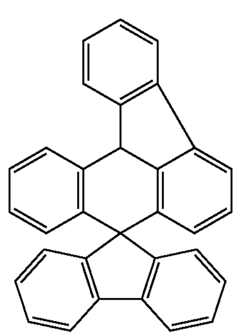,

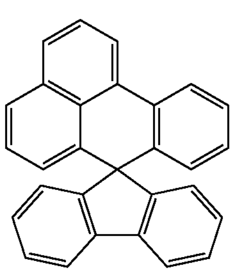,

-continued

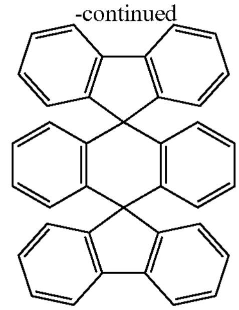

and the like can be included. However, the structure is not limited thereto.

In the present specification, an "adjacent" group can mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring can be interpreted as groups "adjacent" to each other.

In the present specification, the aryl group in the aryloxy group, the arylthioxy group, the arylsulfoxy group and the arylphosphine group is the same as the examples of the aryl group described above. Specific examples of the aryloxy group can include a phenoxy group, a p-tolyloxy group, an m-tolyloxy group, a 3,5-dimethylphenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group and the like. Specific examples of the arylthioxy group can include a phenylthioxy group, a 2-methylphenylthioxy group, a 4-tert-butylphenylthioxy group and the like, and specific examples of the arylsulfoxy group can include a benzenesulfoxy group, a p-toluenesulfoxy group and the like. However, the aryloxy group, the arylthioxy group and the arylsulfoxy group are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group can be a monocyclic aryl group or a polycyclic aryl group. The arylamine group including two or more aryl groups can include monocyclic aryl groups, polycyclic aryl groups, or both monocyclic aryl groups and polycyclic aryl groups. For example, the aryl group in the arylamine group can be selected from among the examples of the aryl group described above.

In the present specification, the heterocyclic group is a group including one or more atoms that are not carbon, that is, heteroatoms, and specifically, the heteroatom can include one or more heteroatoms selected from the group consisting of N, P, O, S, Se, Ge, Si and the like, can be monocyclic or polycyclic, and can be aromatic, aliphatic or a fused ring of aromatic and aliphatic. The number of carbon atoms is not particularly limited, but is preferably from 2 to 50 and more preferably from 2 to 30, and the heterocyclic group can be monocyclic or polycyclic. Examples of the heterocyclic group can include a thiophene group, a furanyl group, a pyrrole group, an imidazolyl group, a thiazolyl group, an oxazolyl group, an isoxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a pyridoindole group, a carbazolyl group, a benzoxazolyl group, a benzimidazolyl group, a benzothiazolyl group, a benzocarbazolyl group, a dibenzocarbazole group, a benzothiophene group, a dibenzothiophene group, a benzofuranyl group, a dibenzofuranyl group, a naphthobenzofuranyl group, a phenanthrolinyl group, a thiadiazolyl group, a phenothiazinyl group, an acenaphthopyrazine group, an acenaphthoquinoxalyl group, an indenoquinazolyl group, an indenoisoquinolyl group, an indenoquinolyl group, pteridinyl group, a phenoxazinyl group, a phenothiazinyl group, a benzoquinazolyl group, an indazolyl group, an indazole group, a benzoperimidinone group, a hydroacridyl group, an indolocarbazole group, a benzoperimidinolyl group, a benzoperimidinyl group, a spiroacridinefluorene group, and the like, but are not limited thereto.

In the present specification, the arylene group means an aryl group having two bonding sites, that is, a divalent group. Descriptions on the aryl group provided above can be applied thereto except for each being a divalent group.

In the present specification, the “ring” in the substituted or unsubstituted ring formed by adjacent groups bonding to each other means a hydrocarbon ring, or a heteroring.

In the present specification, the hydrocarbon ring can be aromatic, aliphatic or a fused ring of aromatic and aliphatic, and can be selected from among the examples of the cycloalkyl group or the aryl group except for those that are not monovalent.

In the present specification, the aromatic ring can be monocyclic or polycyclic, and can be selected from among the examples of the aryl group except for those that are not monovalent.

In the present specification, the heteroring includes one or more atoms that are not carbon, that is, heteroatoms, and specifically, the heteroatom can include one or more heteroatoms selected from the group consisting of N, P, O, S, Se, Ge, Si and the like. The heteroring can be monocyclic or polycyclic, aromatic, aliphatic or a fused ring of aromatic and aliphatic, and can be selected from among the examples of the heterocyclic group except for those that are not monovalent.

According to one embodiment of the present specification, in Chemical Formula A, L1 to L3 are the same as or different from each other, and each independently is a direct bond, a substituted or unsubstituted arylene group having 6 to 30 carbon atoms, or a substituted or unsubstituted divalent heterocyclic group having 2 to 30 carbon atoms.

According to one embodiment of the present specification, in Chemical Formula A, L1 to L3 are the same as or different from each other, and each independently is a direct bond or an arylene group.

According to one embodiment of the present specification, in Chemical Formula A, L1 to L3 are the same as or different from each other, and each independently is a direct bond or an arylene group having 6 to 50 carbon atoms.

According to one embodiment of the present specification, in Chemical Formula A, L1 to L3 are the same as or different from each other, and each independently is a direct bond, a phenylene group or a naphthylene group.

According to one embodiment of the present specification, in Chemical Formula A, Ar1 to Ar3 are the same as or different from each other, and each independently is a substituted or unsubstituted aryl group having 6 to 50 carbon atoms, or a substituted or unsubstituted heterocyclic group having 2 to 50 carbon atoms.

According to one embodiment of the present specification, in Chemical Formula A, Ar1 to Ar3 are the same as or different from each other, and each independently is an aryl group having 6 to 50 carbon atoms that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group; or a substituted or unsubstituted heterocyclic group having 2 to 50 carbon atoms substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group, and including one or more of N, P, O, S, Se, Ge and Si as a heteroatom.

According to one embodiment of the present specification, in Chemical Formula A, Ar1 to Ar3 are the same as or different from each other, and each independently is an aryl group having 6 to 50 carbon atoms that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

According to one embodiment of the present specification, in Chemical Formula A, Ar1 to Ar3 are the same as or different from each other, and each independently is an aryl group having 6 to 50 carbon atoms that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

According to one embodiment of the present specification, in Chemical Formula A, Ar1 to Ar3 are the same as or different from each other, and each independently is an aryl group having 6 to 50 carbon atoms that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group, and herein, the aryl group is a phenyl group, a biphenyl group, a terphenyl group, a naphthyl group, an anthracenyl group, a 9,10-dihydroanthracenyl group, a phenanthrylenyl group, a pyrenyl group, a fluorenyl group, a spirobifluorenyl group, a spirobenzofluorenefluorenyl group, a spirocyclopentafluorenyl group or a spirofluoreneindenophenanthrene group.

According to one embodiment of the present specification, in Chemical Formula A, Ar1 to Ar3 are the same as or different from each other, and each independently is a substituted or unsubstituted heterocyclic group including at least one of 0, S, Se, Ge, N, P and Si as a heteroatom.

According to one embodiment of the present specification, in Chemical Formula A, Ar1 to Ar3 are the same as or different from each other, and each independently is a substituted or unsubstituted heterocyclic group having 2 to 50 carbon atoms including at least one of O, S, Se, Ge, N, P and Si as a heteroatom.

According to one embodiment of the present specification, in Chemical Formula A, Ar1 to Ar3 are the same as or different from each other, and each independently is a substituted or unsubstituted dicyclic or higher heterocyclic group including at least one of O, S, Se, Ge, N, P and Si as a heteroatom.

According to one embodiment of the present specification, in Chemical Formula A, Ar1 to Ar3 are the same as or different from each other, and each independently is a substituted or unsubstituted tricyclic or higher heterocyclic group including at least one of O, S, Se, Ge, N, P and Si as a heteroatom.

According to one embodiment of the present specification, in Chemical Formula A, Ar1 to Ar3 are the same as or different from each other, and each independently can be one of the following Chemical Formula 21 or 22:

[Chemical Formula 21]

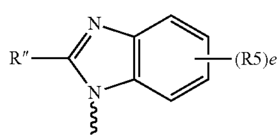

[Chemical Formula 22]

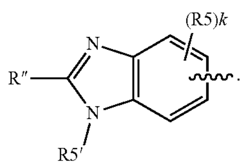

In Chemical Formulae 21 and 22:

R", R5 and R5' are the same as or different from each other, and each independently is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group, e is an integer of 0 to 4, k is an integer of 0 to 3, and when e and k are each 2 or greater, R5s are the same as or different from each other, and 〰 is a site bonding to one of L1 to L3.

According to one embodiment of the present specification, in Chemical Formula A, Ar1 to Ar3 are the same as or different from each other, and each independently is a substituted or unsubstituted tricyclic or higher heterocyclic group including at least one of O, S, Se, Ge, N, P and Si as a heteroatom, or the group of Chemical Formula 21 or 22.

According to one embodiment of the present specification, in Chemical Formula A, Ar1 to Ar3 are the same as or different from each other, and each independently is a substituted or unsubstituted aryl group, or a substituted or unsubstituted heterocyclic group, and this heterocyclic group can be one of the following Chemical Formulae 21, 23 and 24, or the heteroatom does not directly bond to one of L1 to L3:

[Chemical Formula 21]

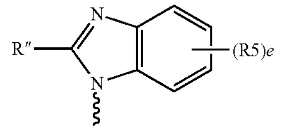

[Chemical Formula 23]

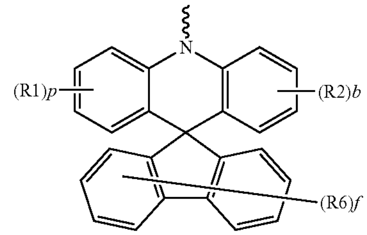

[Chemical Formula 24]

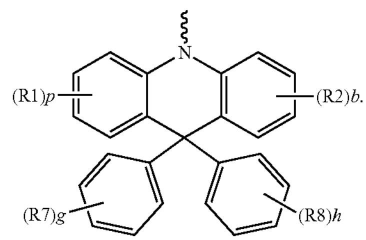

In Chemical Formulae 21, 23 and 24:

R", R1, R2, R5, R6, R7 and R8 are the same as or different from each other, and each independently is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group, b, e and p are each an integer of 0 to 4, f is an integer of 0 to 8, g and h are each an integer of 0 to 5, and when b, e, p, f, g and h are each 2 or greater, substituents in the parentheses are the same as or different from each other; and 〰 is a site bonding to one of L1 to L3.

According to one embodiment of the present specification, in Chemical Formula A, Ar1 to Ar3 are the same as or different from each other, and each can be independently one of the following Chemical Formulae 2-1 to 2-3:

[Chemical Formula 2-1]

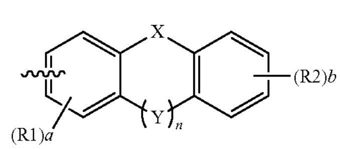

[Chemical Formula 2-2]

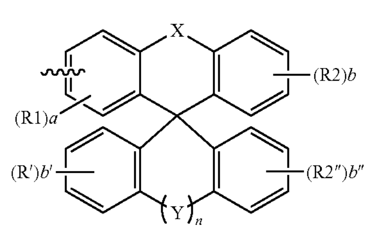

-continued

[Chemical Formula 2-3]

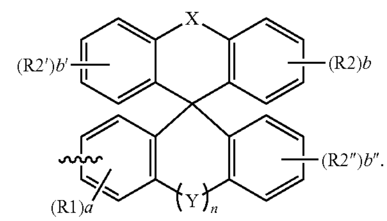

In Chemical Formulae 2-1 to 2-3:

〰 is a site bonding to one of L1 to L3;

X is O, S, Se, Ge, NR, PR or SiRR';

Y is the same as or different from X and is a direct bond, O, S, Se, Ge, NR, PR, SiRR' or CRR', n is 0 or 1, and when n is 0, hydrogen bonds to each of two positions to which Y bonds; and R, R', R1, R2, R2' and R2" are the same as or different from each other, and each independently is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group, or bond to adjacent groups to form a substituted or unsubstituted ring, a is an integer of 0 to 3, b, b' and b" are an integer of 0 to 4, and when a is 2 or greater, R1s are the same as or different from each other, and when b, b' or b" is 2 or greater, R2s, R2's or R2"s are the same as or different from each other.

According to one embodiment of the present specification, when one or more of Ar1 to Ar3 are a substituted or unsubstituted dicyclic or higher heterocyclic group, an ortho position with respect to carbon at a position where a ring of the heterocyclic group is fused, that is, carbon forming a ring for both fused two rings, preferably bonds to one of L1 to L3. For example, carbon at a position where a ring of the heterocyclic group is fused means a part marked by the following * in Chemical Formula 2-1:

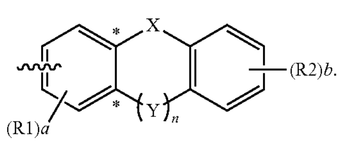

According to one embodiment of the present specification, Chemical Formulae 2-1 to 2-3 can be one of the following Chemical Formulae 2-4 to 2-7:

[Chemical Formula 2-4]

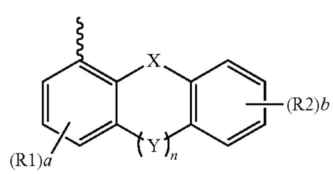

-continued

[Chemical Formula 2-5]

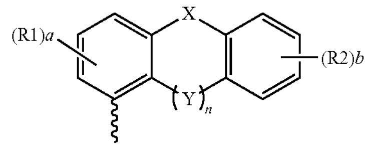

[Chemical Formula 2-6]

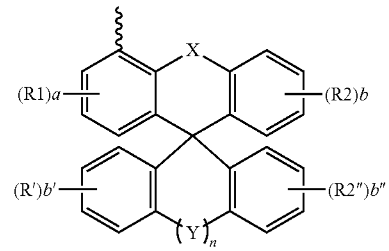

[Chemical Formula 2-7]

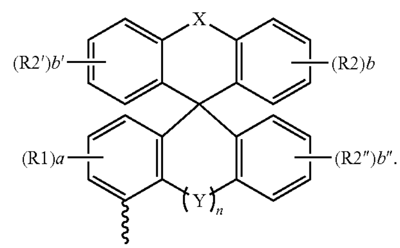

In Chemical Formulae 2-4 to 2-7, descriptions of the substituents are the same as in Chemical Formulae 2-1 to 2-3.

When a core structure bonds to an ortho position to X or Y in the structures of Chemical Formulae 2-1 to 2-7 as described above, a structure in which substituents are folded to each other is obtained decreasing a conjugation length. When a conjugation length decreases, an energy gap increases, and color purity or efficiency can increase since light emission moves to a shorter wavelength. Particularly, when using the compounds according to embodiments of the present specification as a blue host material of a light emitting layer of an organic light emitting device, the compounds having a large energy gap is advantageous.

According to one embodiment of the present specification, Chemical Formula 2-1 can be one of the following Chemical Formulae 3 to 5:

[Chemical Formula 3]

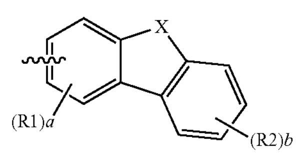

[Chemical Formula 4]

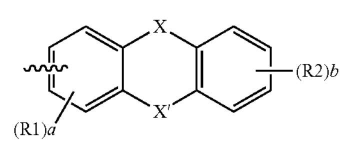

-continued

[Chemical Formula 5]

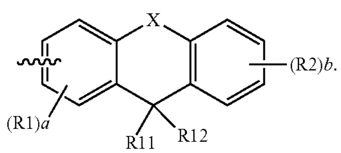

In Chemical Formulae 3 to 5:

[wavy bond] is a site bonding to one of L1 to L3;

X, R1, R2, a and b have the same definitions as in Chemical Formula 2-1, X' is the same as or different from X and is O, S, Se, Ge, NR, PR or SiRR'; and R, R', R11 and R12 are the same as or different from each other, and each independently is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group, or bond to each other to form a substituted or unsubstituted ring.

According to one embodiment of the present specification, Chemical Formula 3 can be one of the following Chemical Formulae 6 to 12:

[Chemical Formula 6]

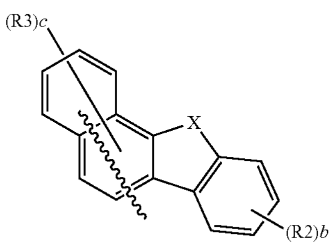

[Chemical Formula 7]

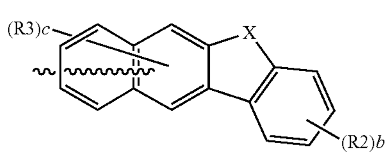

[Chemical Formula 8]

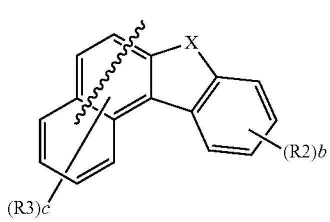

[Chemical Formula 9]

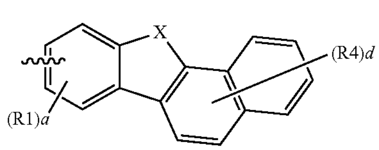

-continued

[Chemical Formula 10]

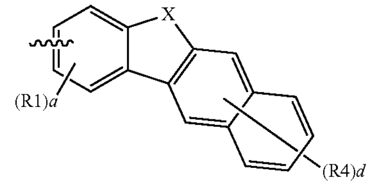

[Chemical Formula 11]

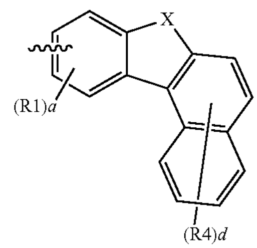

[Chemical Formula 12]

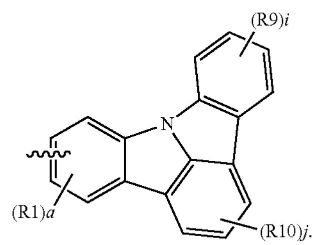

In Chemical Formulae 6 to 12:

[wavy bond] is a site bonding to one of L1 to L3;

X, R1, R2, a and b have the same definitions as in Chemical Formula 3; and

R3, R4, R9 and R10 are the same as or different from each other, and each independently is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group, c is an integer of 0 to 5, d is an integer of 0 to 6, i is an integer of 0 to 4, j is an integer of 0 to 3, and when c is an integer of 2 or greater, R3s are the same as or different from each other, when d is an integer of 2 or greater, R4s are the same as or different from each other, when i is an integer of 2 or greater, R9s are the same as or different from each other, and when j is an integer of 2 or greater, R10s are the same as or different from each other.

According to one embodiment of the present specification, Chemical Formula 2-2 can be one of the following Chemical Formula 13 or 14:

[Chemical Formula 13]

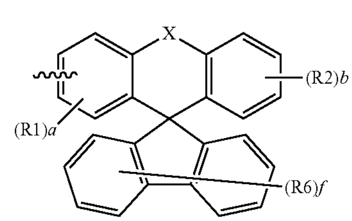

-continued

[Chemical Formula 14]

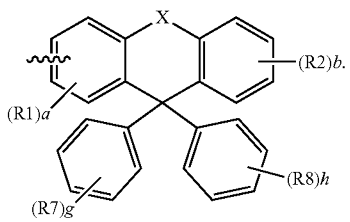

In Chemical Formulae 13 and 14:

∿ is a site bonding to one of L1 to L3;

X, R1, R2, a and b have the same definitions as in Chemical Formula 2-2; and

R6 to R8 are the same as or different from each other, and each independently is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group, f is an integer of 0 to 8, g and h are each an integer of 0 to 5, and when f, g and h are each an integer of 2 or greater, substituents in the parentheses are the same as or different from each other.

According to one embodiment of the present specification, Chemical Formula 2-3 can be one of the following Chemical Formula 15 or 16:

[Chemical Formula 15]

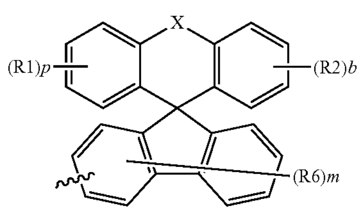

[Chemical Formula 16]

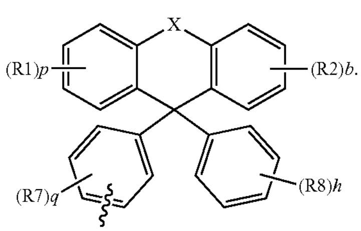

In Chemical Formulae 15 and 16:

∿ is a site bonding to one of L1 to L3;

X, R1, R2 and b have the same definitions as in Chemical Formula 2-3; and

R6 to R8 are the same as or different from each other, and each independently is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group, m is an integer of 0 to 7, h is an integer of 0 to 5, p and q are an integer of 0 to 4, and when h, m, p and q are each an integer of 2 or greater, substituents in the parentheses are the same as or different from each other.

According to one embodiment of the present specification, Chemical Formula 2-2 and 2-3 can each be one of the following Chemical Formula 17 or 18:

[Chemical Formula 17]

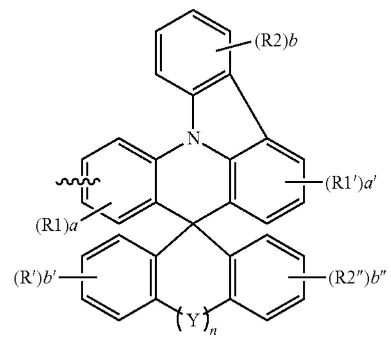

[Chemical Formula 18]

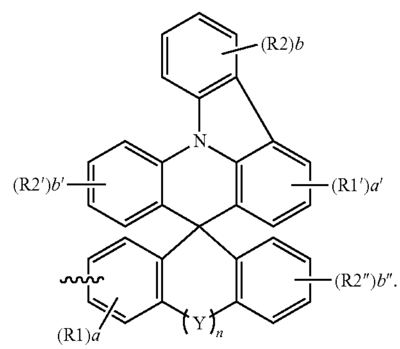

In Chemical Formulae 17 and 18:

∿ is a site bonding to one of L1 to L3;

R', R1, R2, R2', R2", Y, a, b, b', b" and n have the same definitions as in Chemical Formulae 2-2 and 2-3; and R1' is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group, a' is an integer of 0 to 3, and when a' is 2 or greater, R1's are the same as or different from each other.

According to one embodiment of the present specification, X of Chemical Formulae 2-1 to 2-7, 3 to 11, and 13 to 16 is O, S, Se or Ge.

According to one embodiment of the present specification, X of Chemical Formulae 2-1 to 2-7, 3 to 11, and 13 to 16 is NR or PR.

According to one embodiment of the present specification, X of Chemical Formulae 2-1 to 2-7, 3 to 11, and 13 to 16 is NR or PR, R is an alkyl group or an aryl group, or bonds to adjacent groups to form a ring, and R can be further substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

According to one embodiment of the present specification, X of Chemical Formulae 2-1 to 2-7, 3 to 11, and 13 to 16 is NR or PR, R is an alkyl group having 1 to 20 carbon atoms or an aryl group having 6 to 50 carbon atoms, or bonds to adjacent groups to form a ring, and R can be further substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

According to one embodiment of the present specification, X of Chemical Formulae 2-1 to 2-7, 3 to 11, and 13 to 16 is NR or PR, R is a methyl group, an ethyl group or a phenyl group, or bonds to adjacent groups to form a ring, and R can be further substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

According to one embodiment of the present specification, X of Chemical Formulae 2-1 to 2-7, 3 to 11, and 13 to 16 is SiRR', R and R' are an alkyl group or an aryl group, and R or R' can be further substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

According to one embodiment of the present specification, R11 and R12 of Chemical Formula 5 are the same as or different from each other, and each independently is an alkyl group or an aryl group.

According to one embodiment of the present specification, R11 and R12 of Chemical Formula 5 are the same as or different from each other, and each independently is an alkyl group having 1 to 50 carbon atoms or an aryl group having 6 to 50 carbon atoms.

According to one embodiment of the present specification, R11 and R12 of Chemical Formula 5 are the same as or different from each other, and each independently is a methyl group or a phenyl group.

According to one embodiment of the present specification, in Chemical Formula A, at least one of Ar1 to Ar3 is a substituted or unsubstituted heterocyclic group including at least one of 0, S, Se, Ge, N, P and Si as a heteroatom.

According to one embodiment of the present specification, in Chemical Formula A, at least one of Ar1 to Ar3 is a substituted or unsubstituted heterocyclic group having 2 to 50 carbon atoms including at least one of O, S, Se, Ge, N, P and Si as a heteroatom.

According to one embodiment of the present specification, in Chemical Formula A, at least one of Ar1 to Ar3 is a substituted or unsubstituted dicyclic or higher heterocyclic group including at least one of O, S, Se, Ge, N, P and Si as a heteroatom.

According to one embodiment of the present specification, in Chemical Formula A, at least one of Ar1 to Ar3 is a substituted or unsubstituted tricyclic or higher heterocyclic group including at least one of O, S, Se, Ge, N, P and Si as a heteroatom.

According to one embodiment of the present specification, in Chemical Formula A, when at least one of Ar1 to Ar3 is a substituted or unsubstituted heterocyclic group, the heterocyclic group can be one of Chemical Formulae 2-1 to 2-7, 3 to 18, and 21 to 24 described above.

According to one embodiment of the present specification, Chemical Formula A can be one compound selected from among the following compounds:

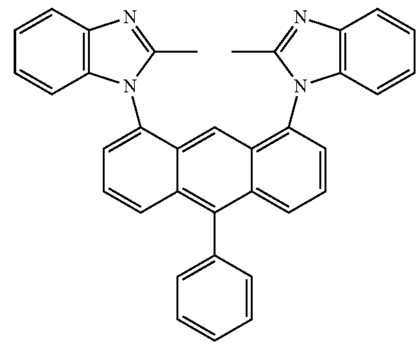

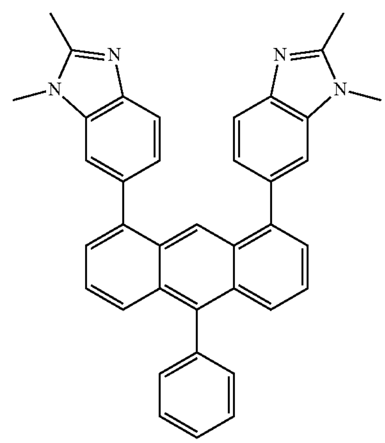

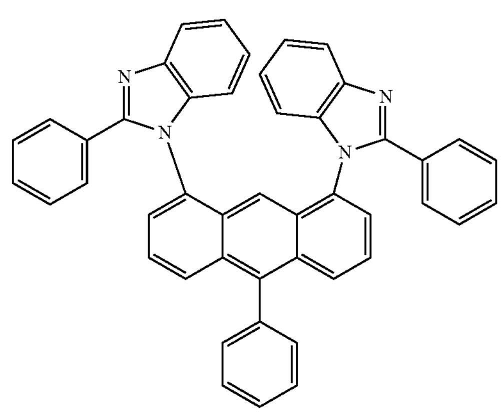

-continued
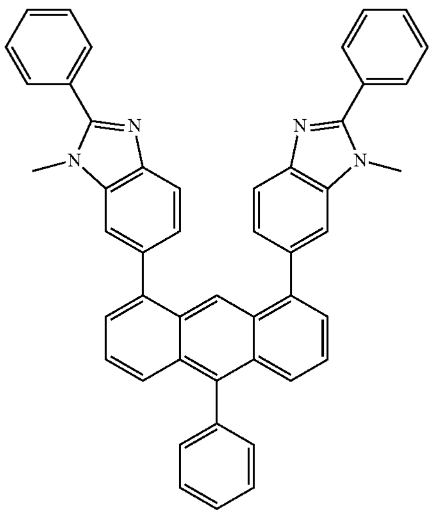
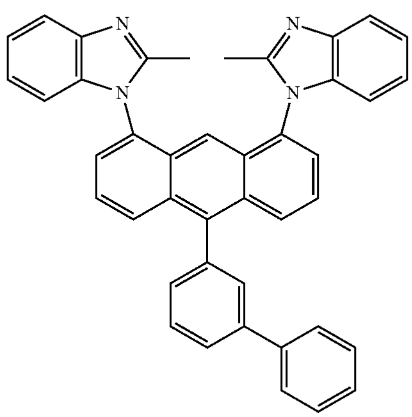
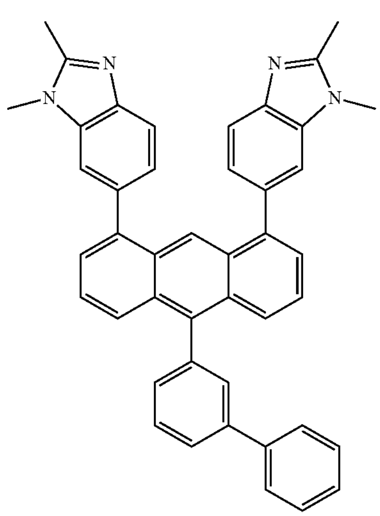
-continued
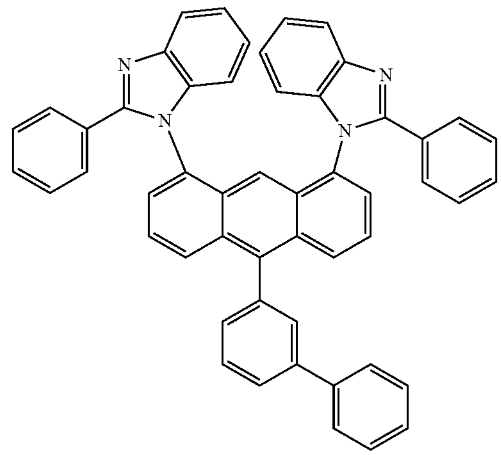
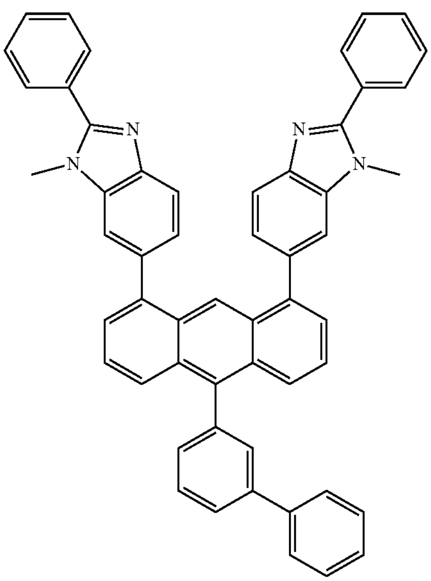
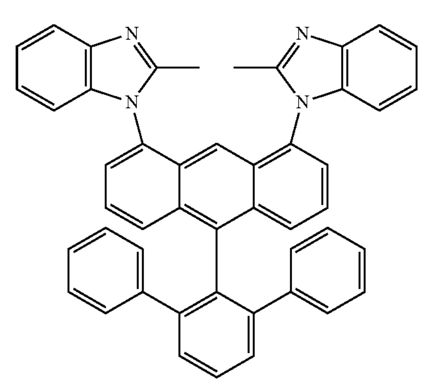

-continued
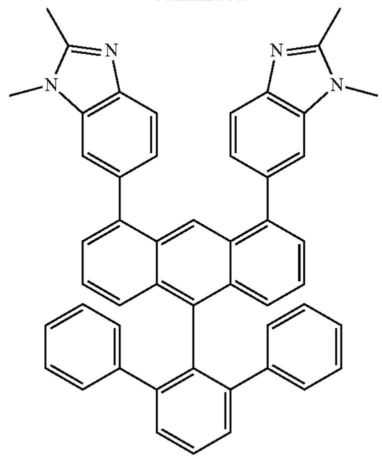
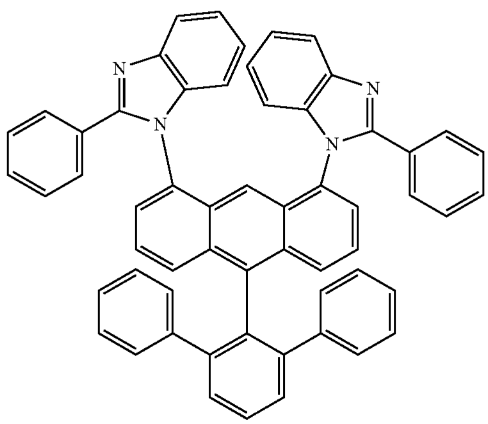
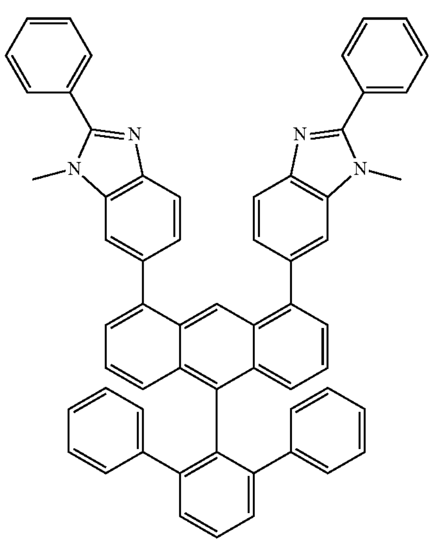
-continued
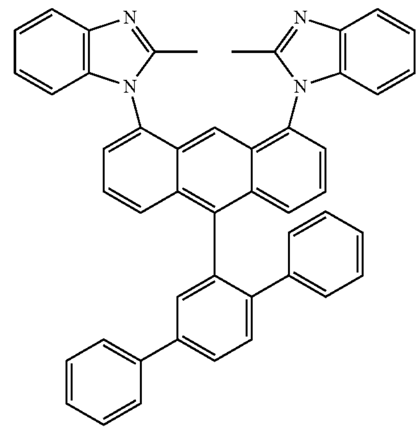
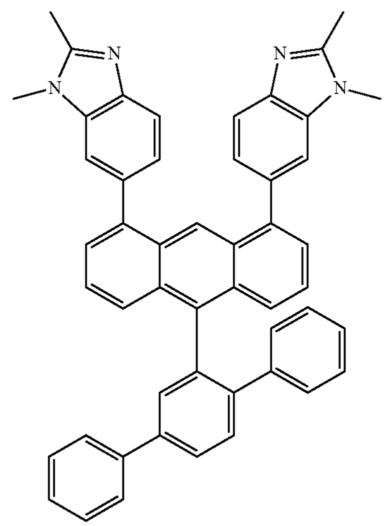
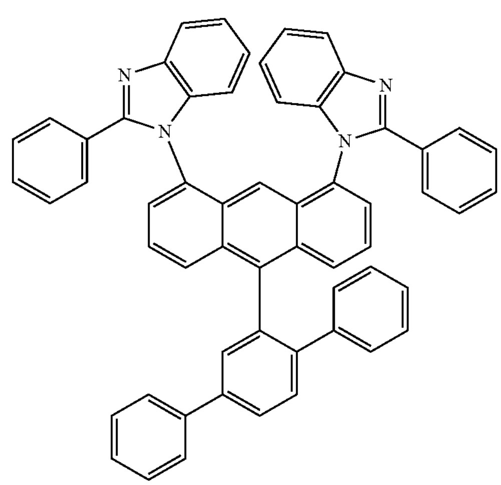

-continued
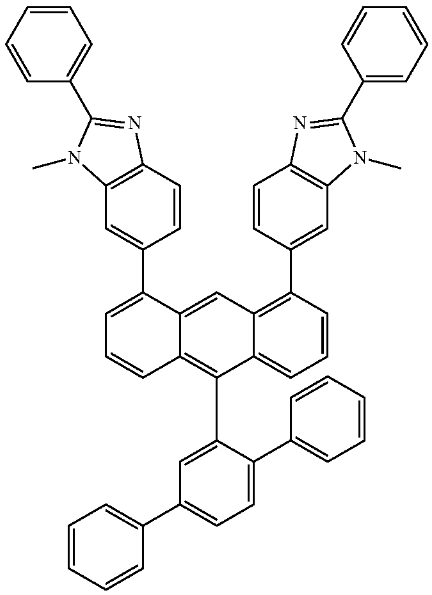
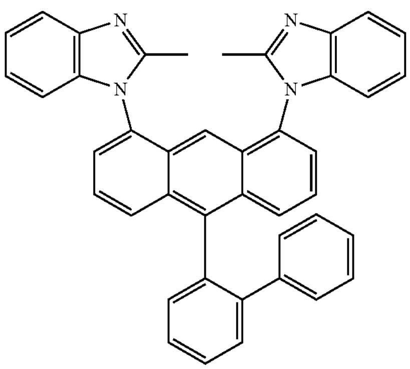
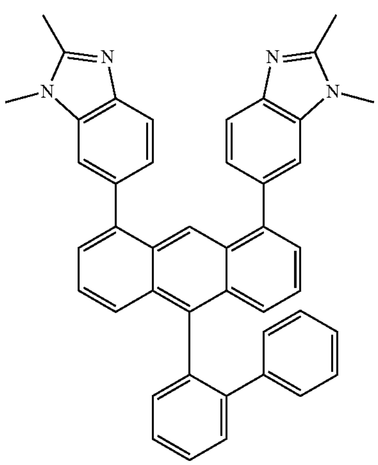
-continued
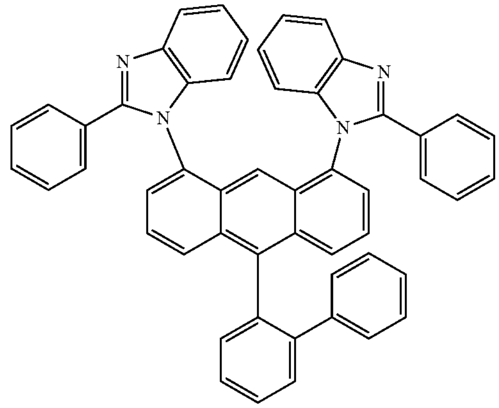
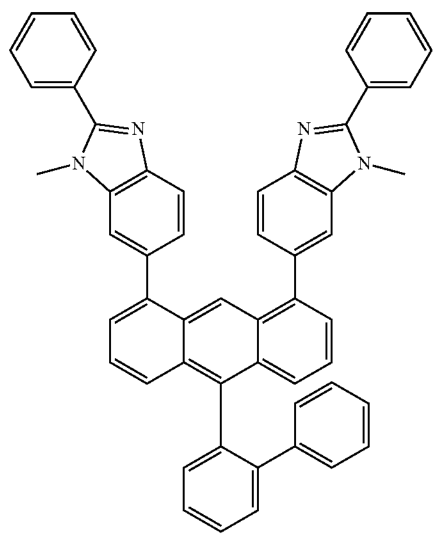
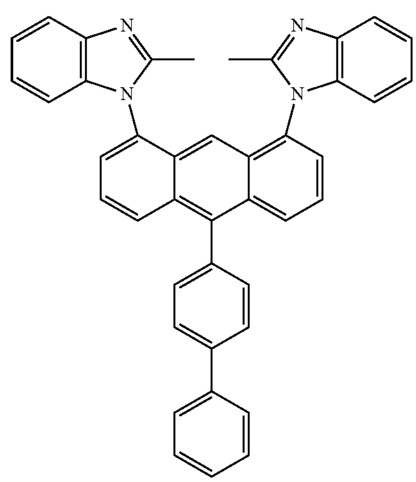

-continued
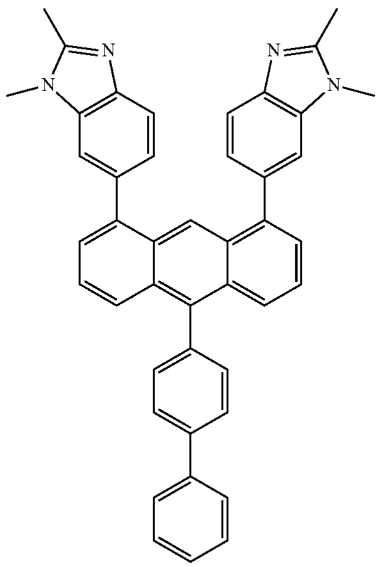
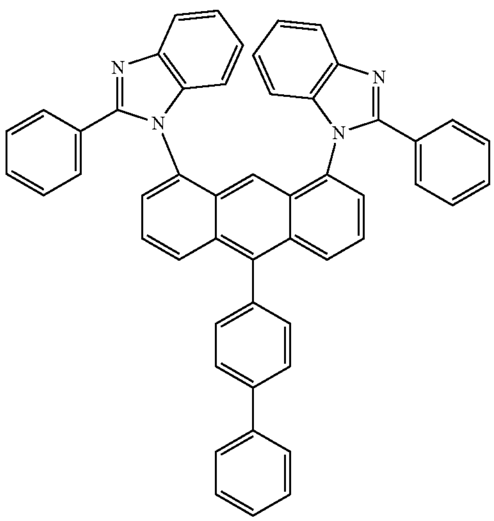
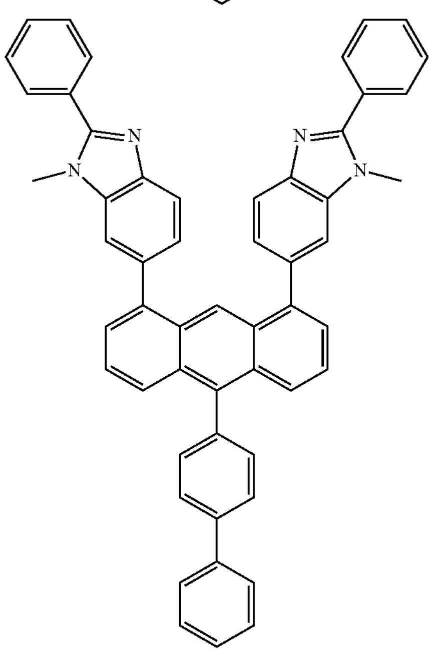
-continued
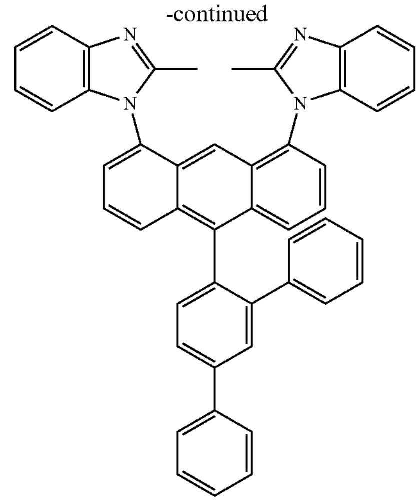
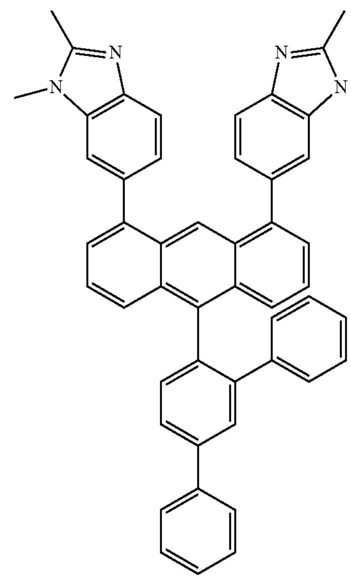
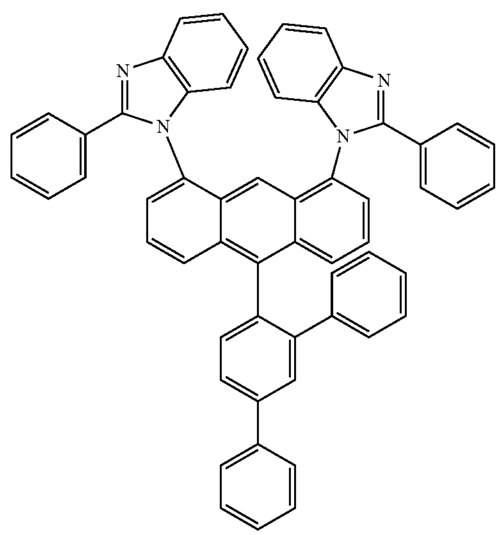

-continued
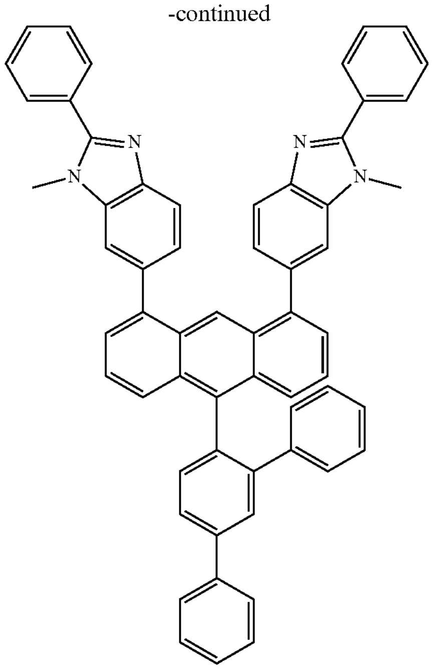
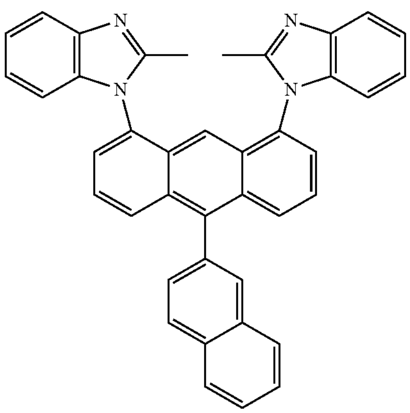
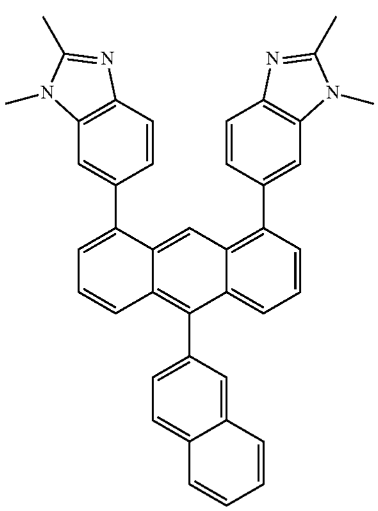
-continued
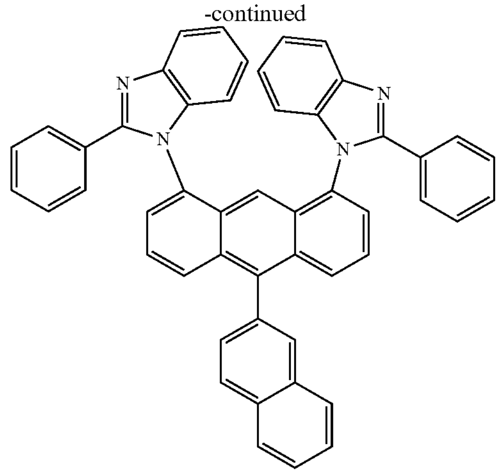
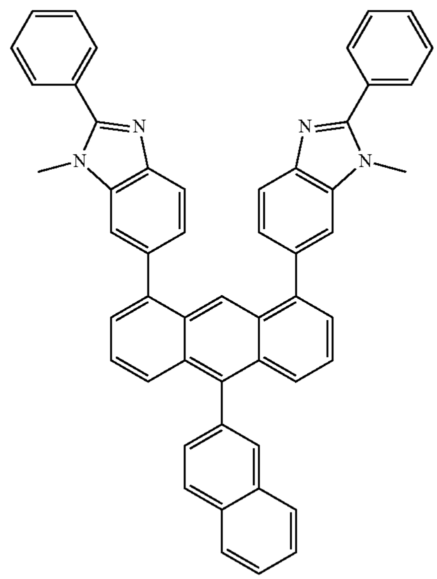
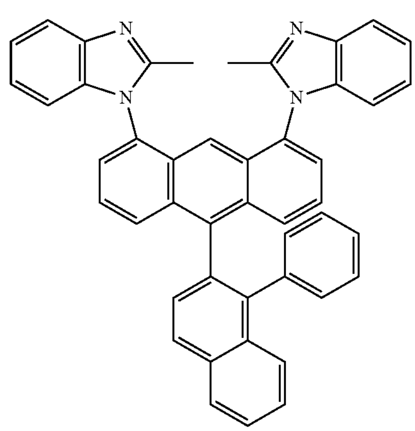

-continued
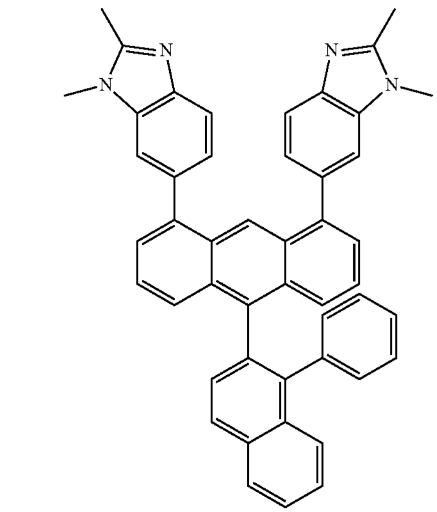
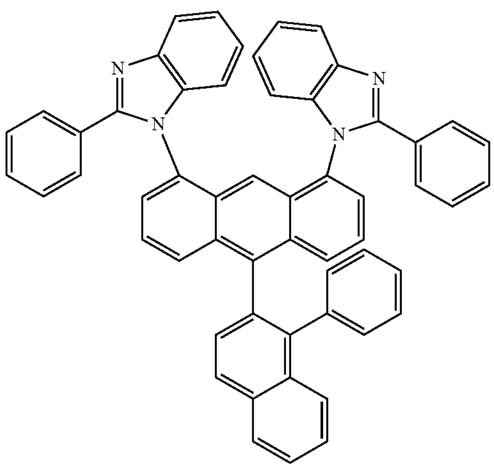
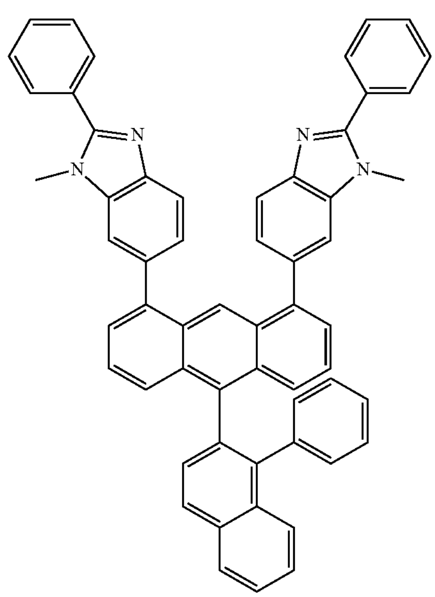
-continued
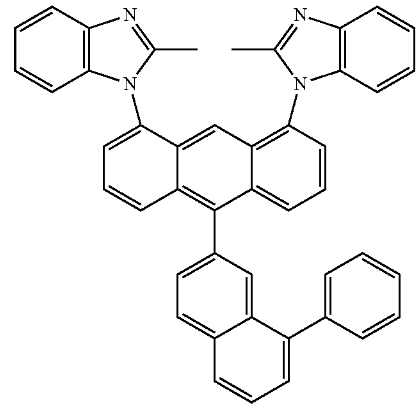
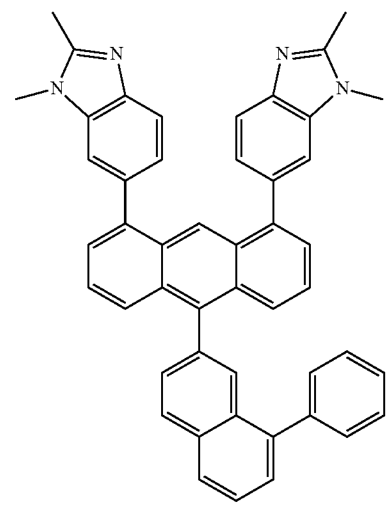
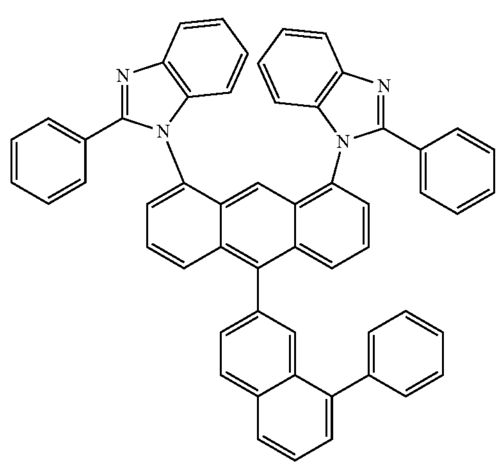

-continued
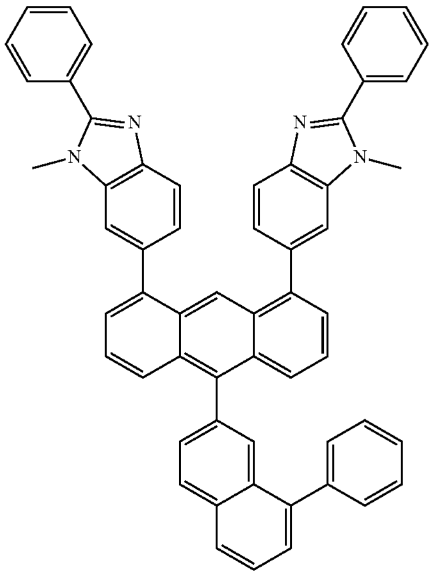
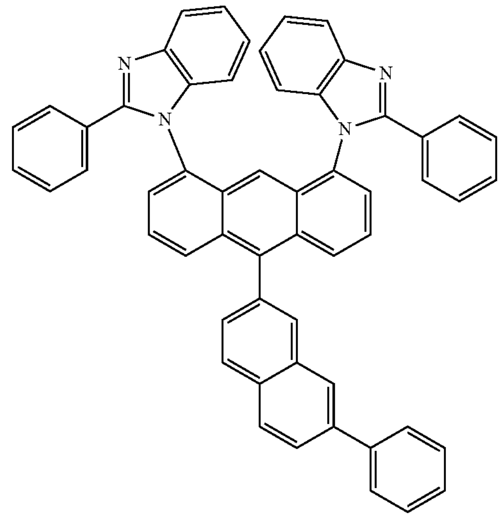
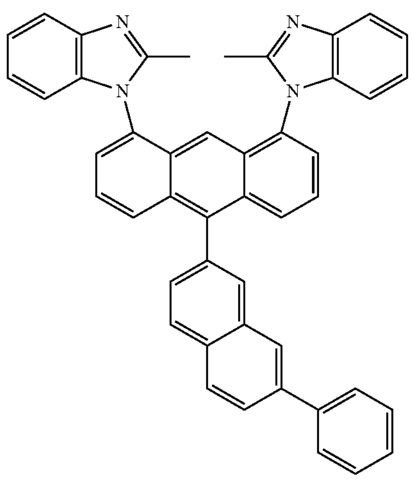
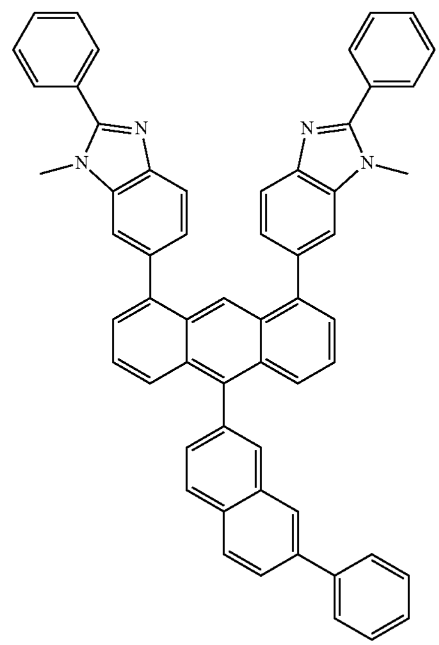
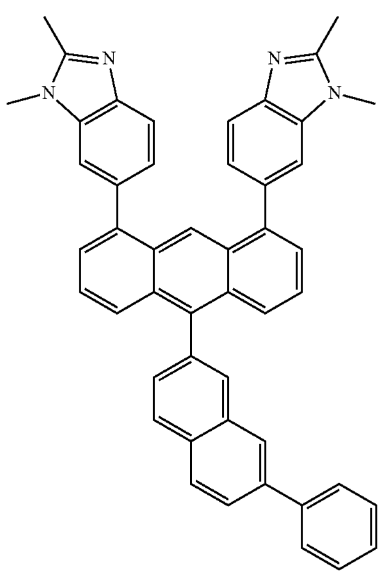
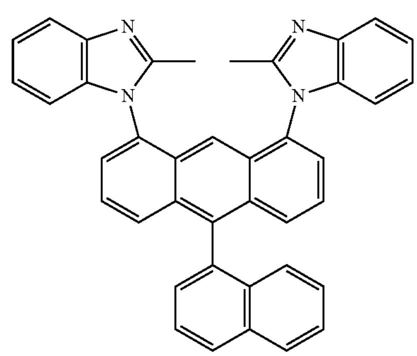
-continued -continued
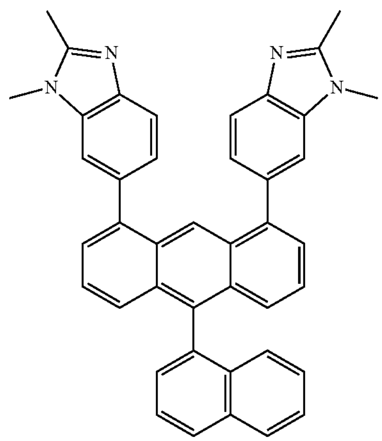
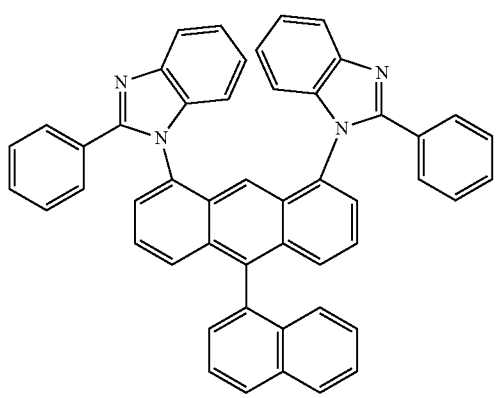
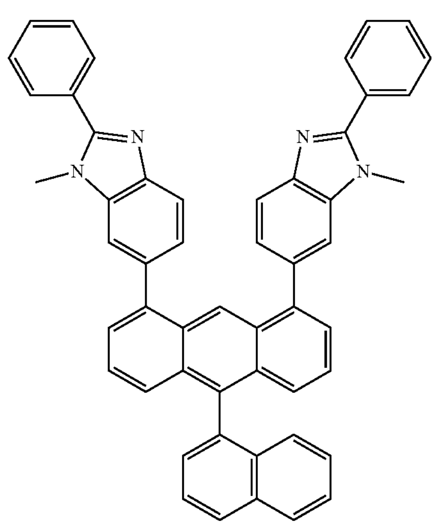
-continued
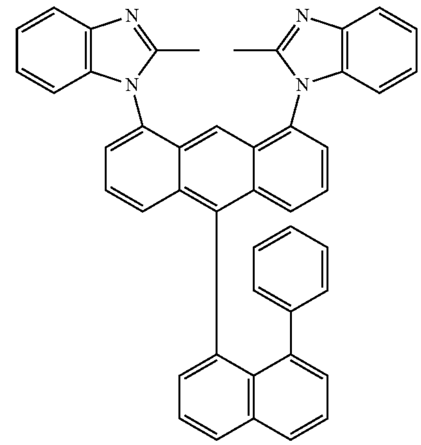
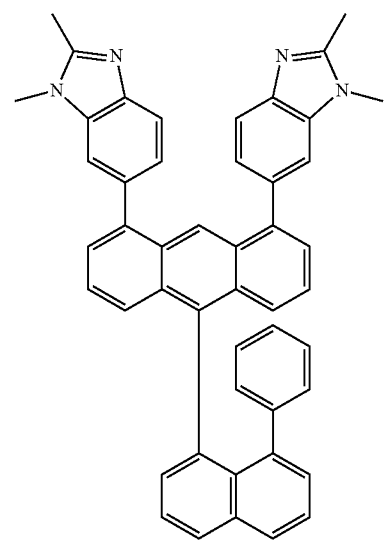
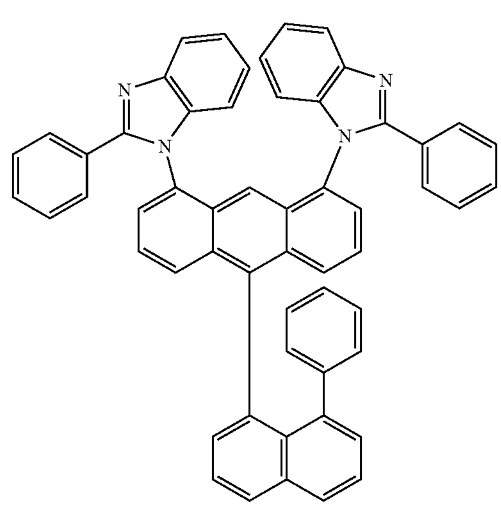

-continued
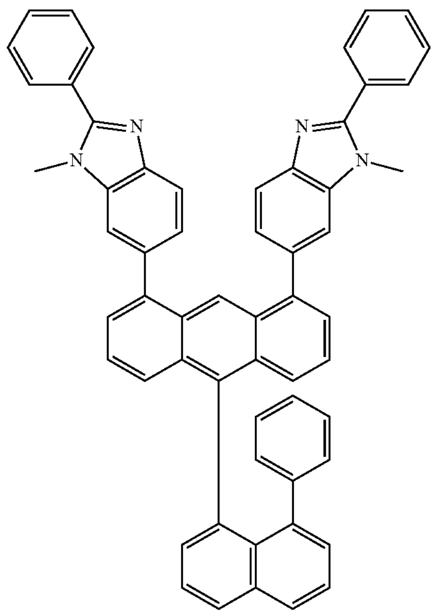
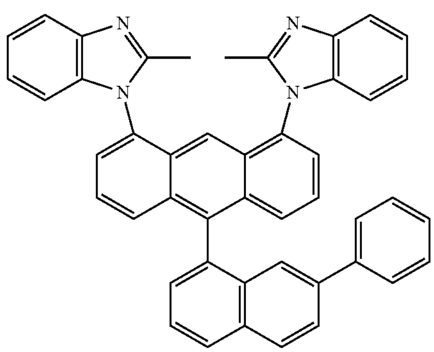
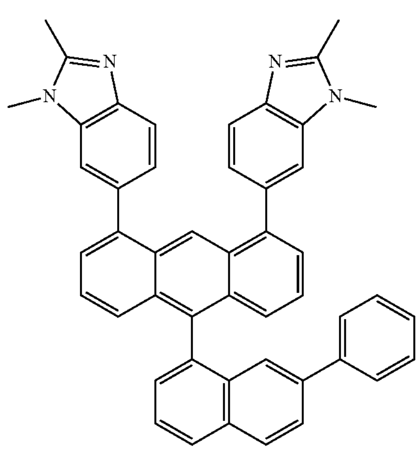
-continued
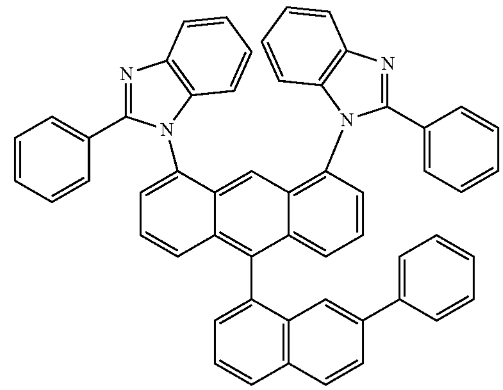
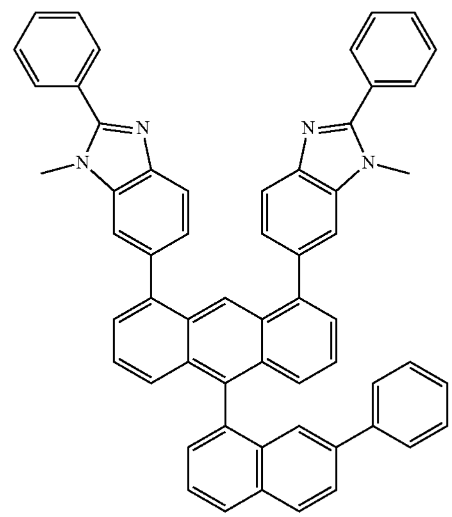
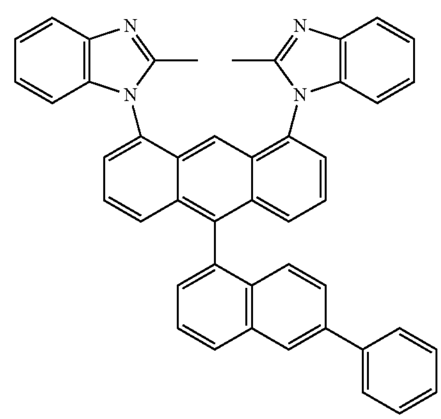

-continued
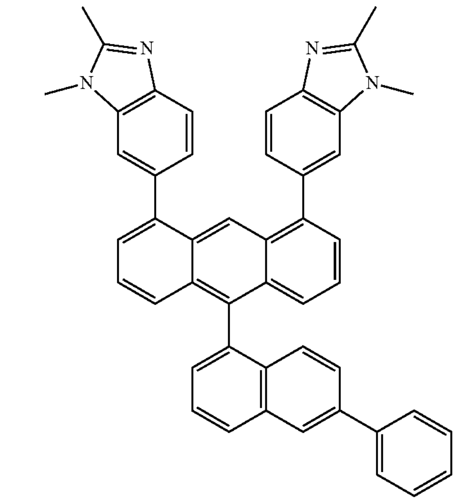
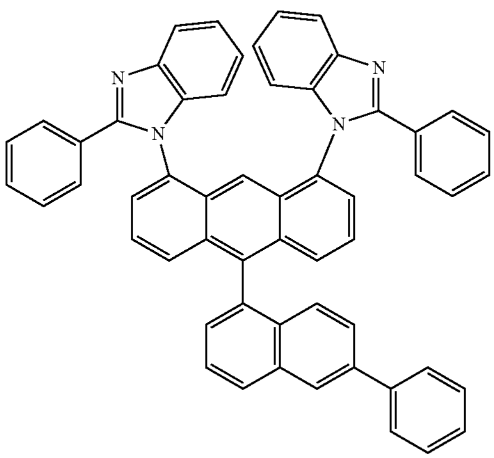
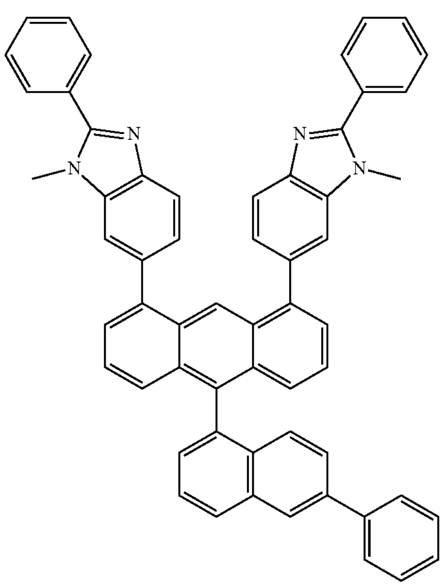
-continued
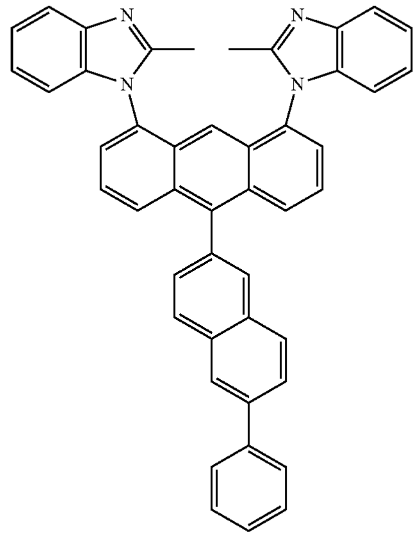
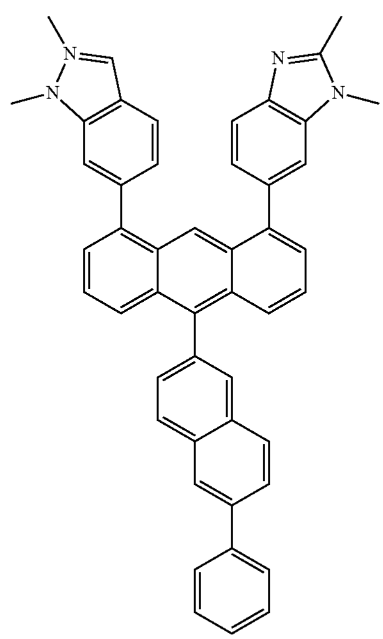

-continued
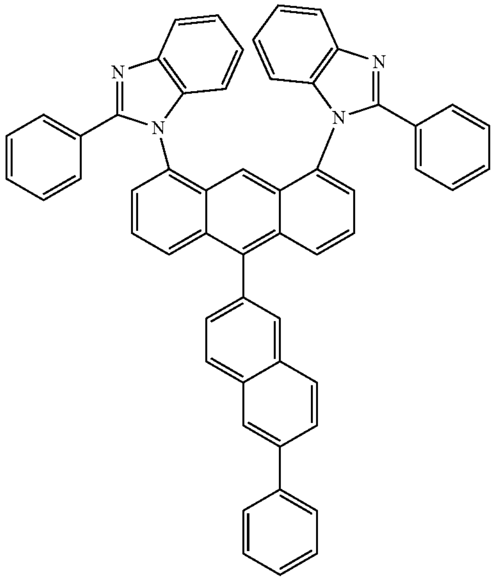
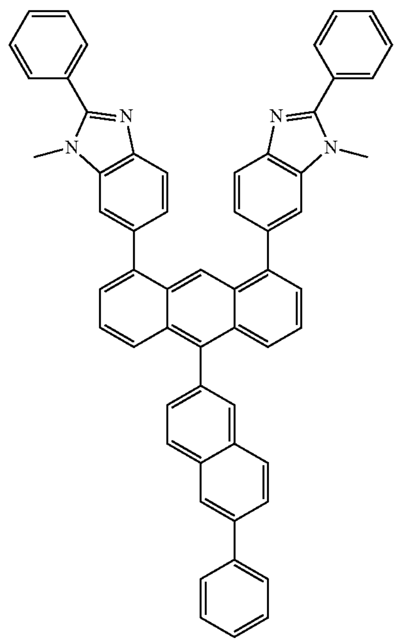
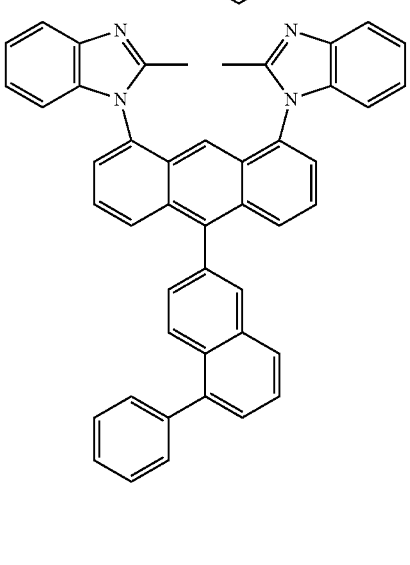
-continued
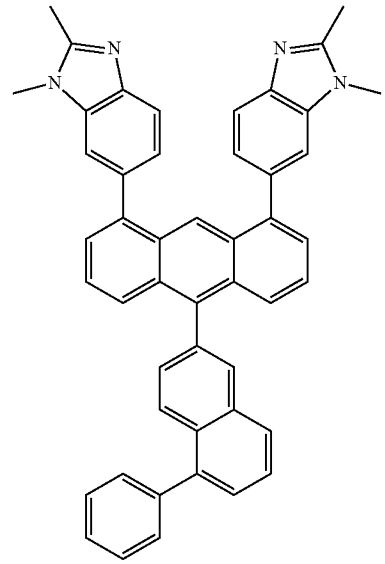
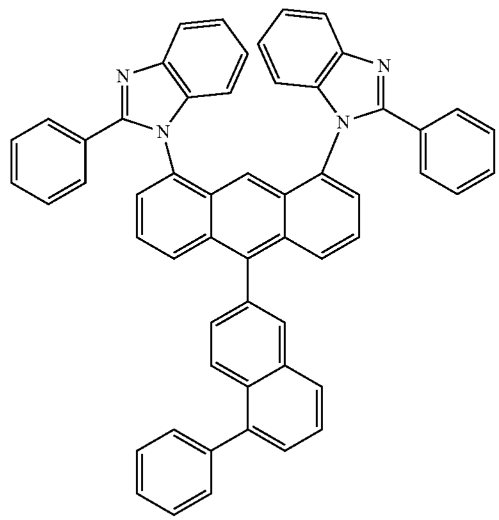
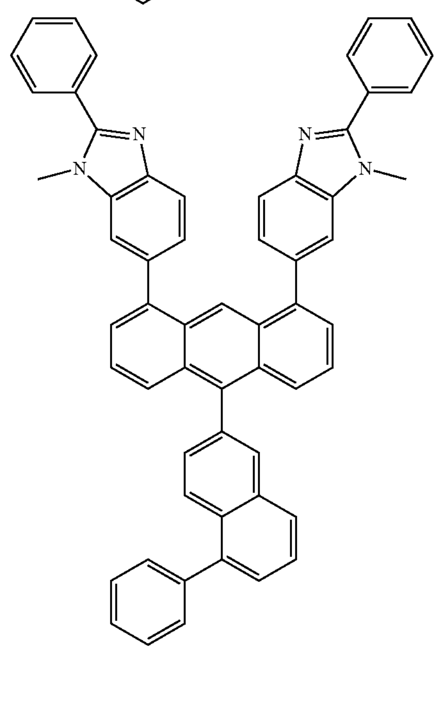

-continued
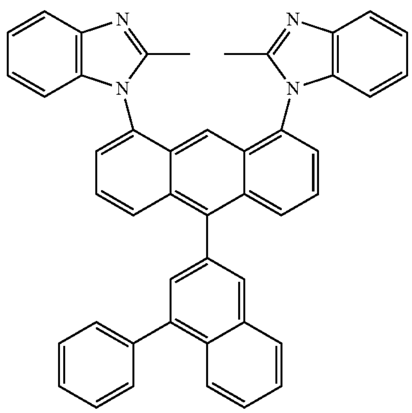
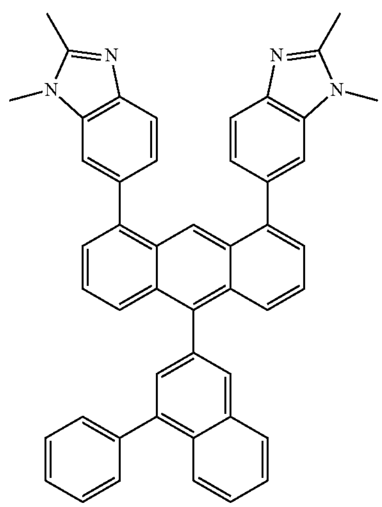
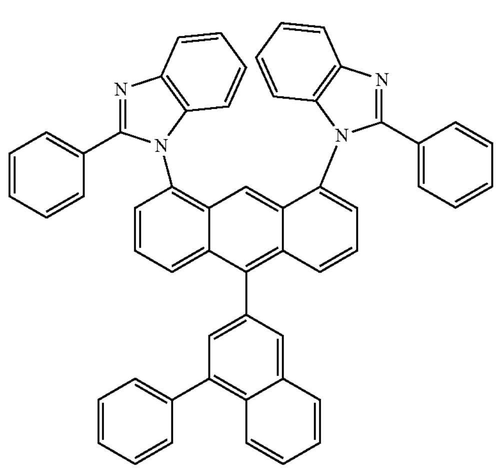
-continued
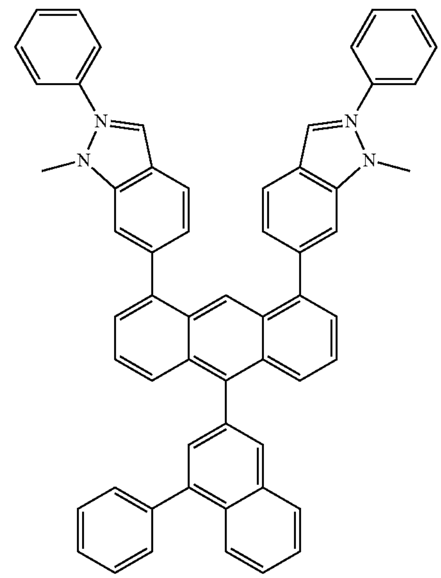
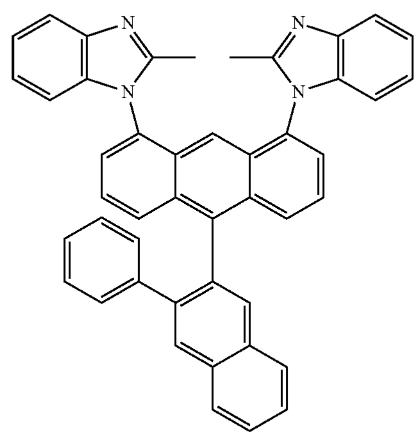
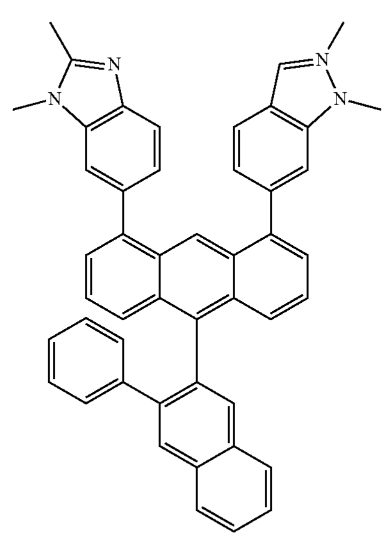

-continued
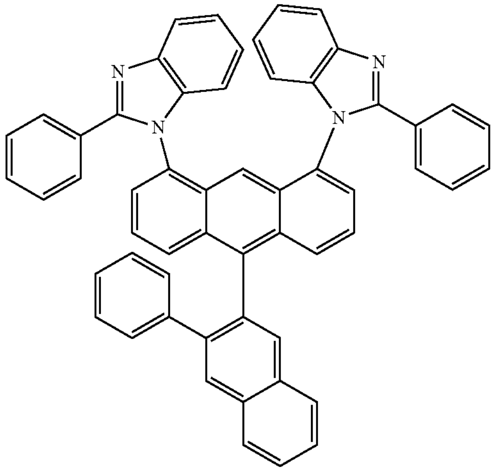
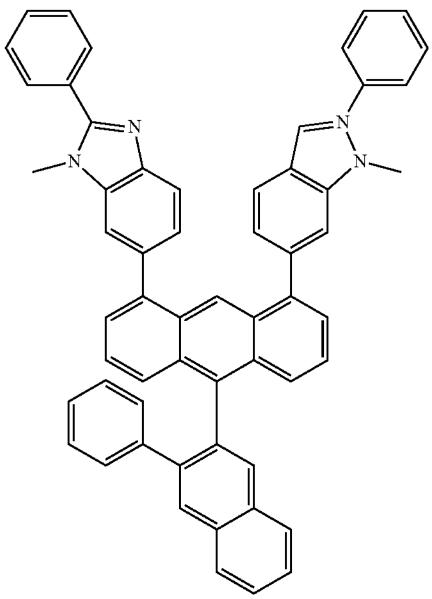
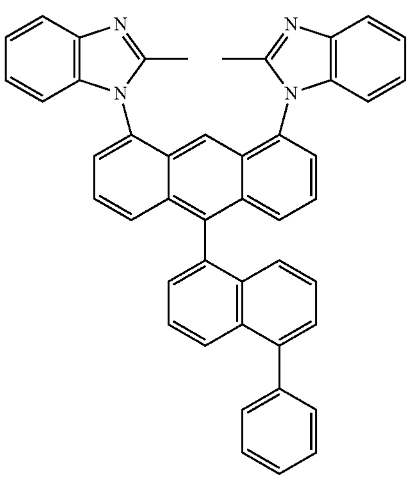
-continued
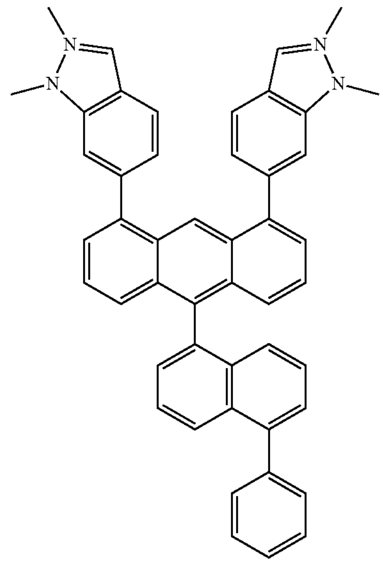
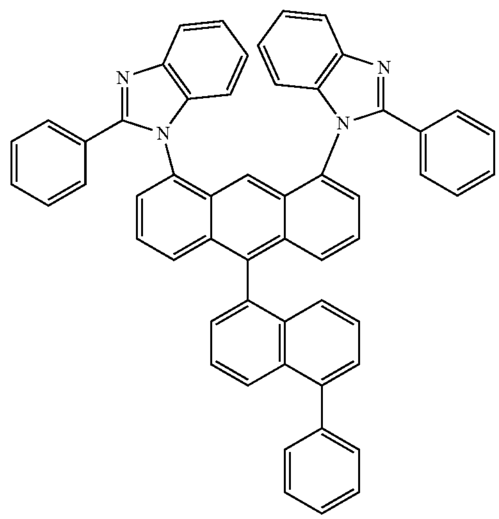
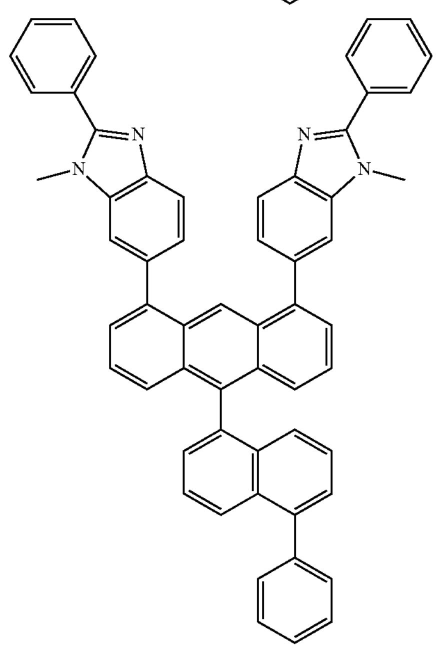

-continued
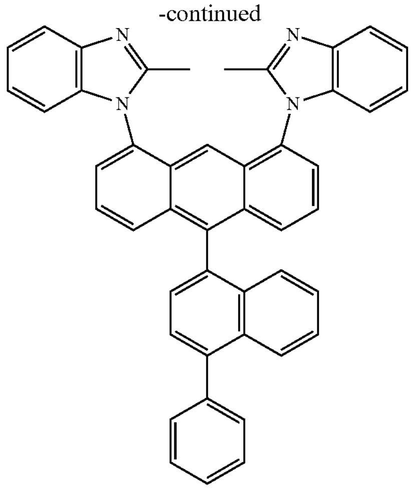
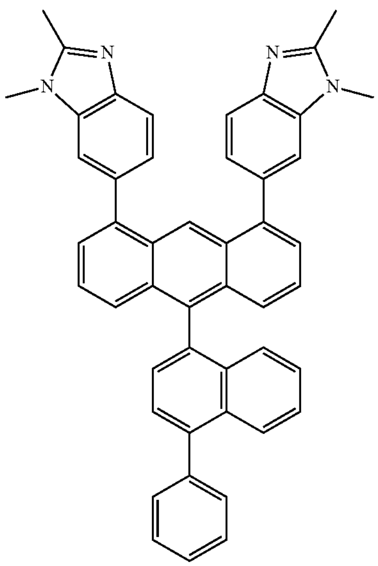
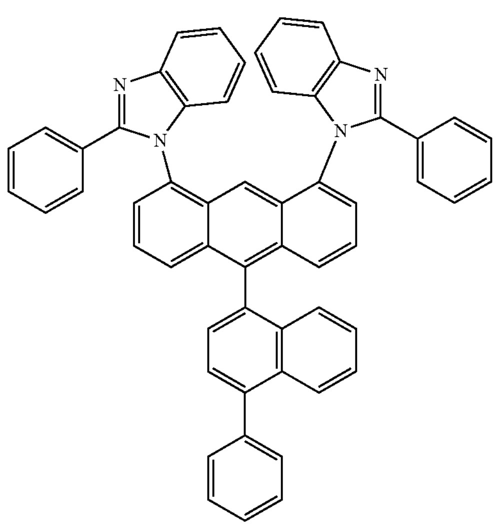
-continued
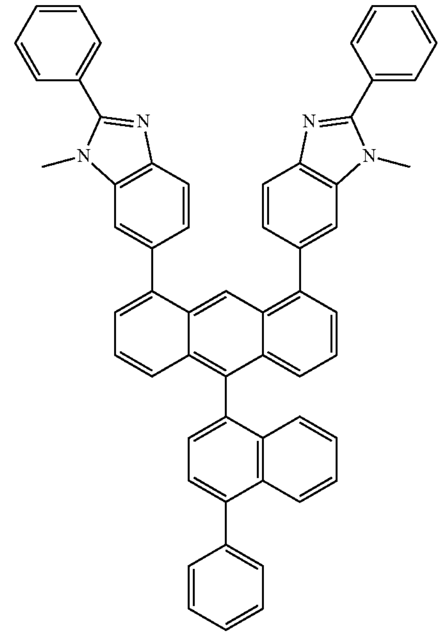
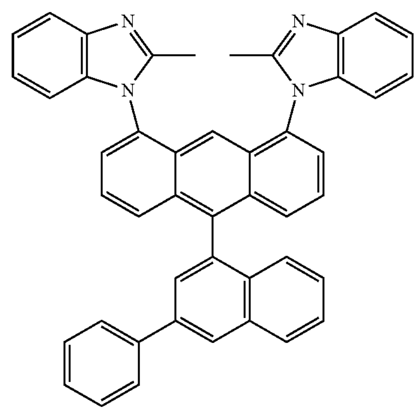
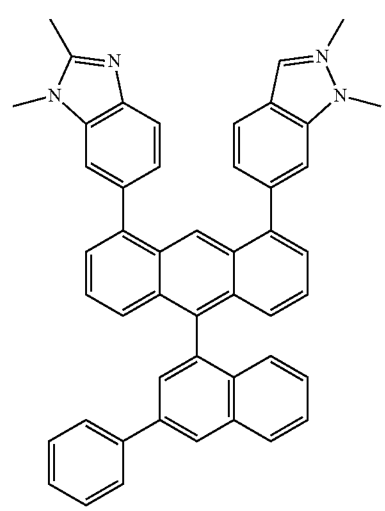

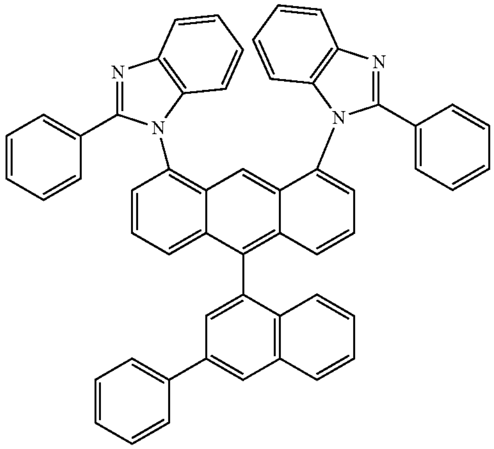
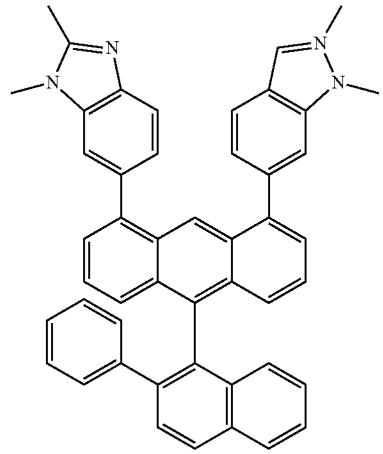
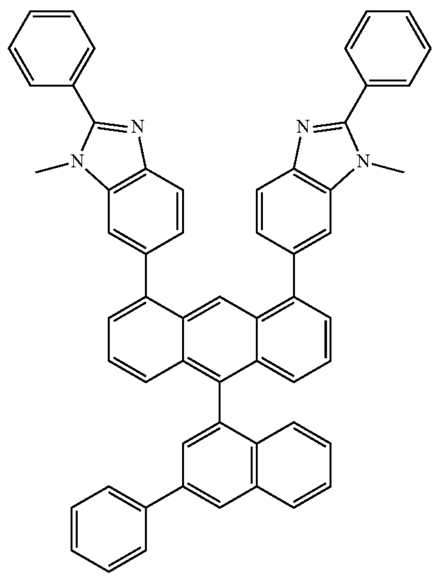
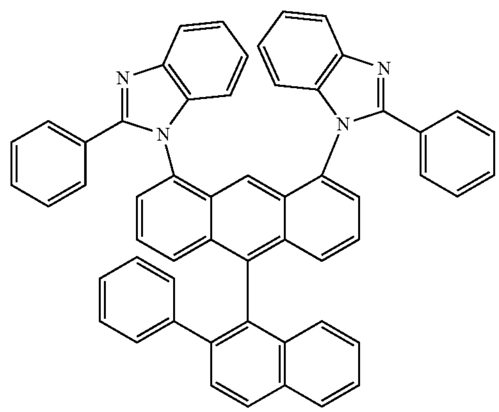
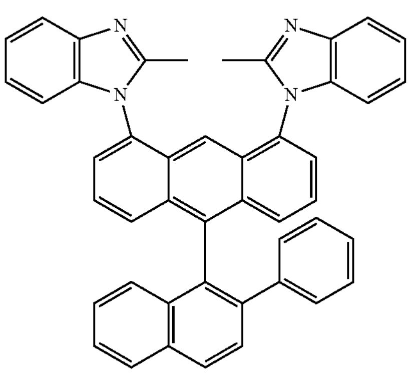
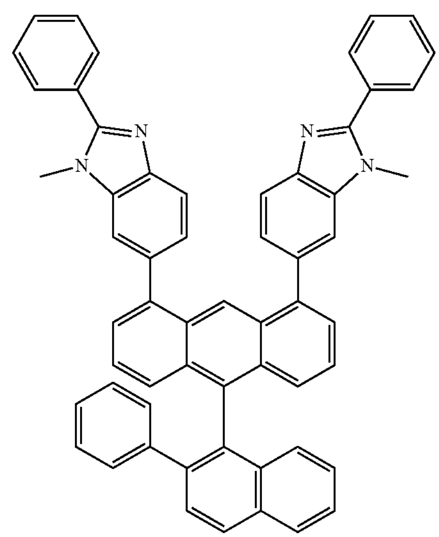

-continued
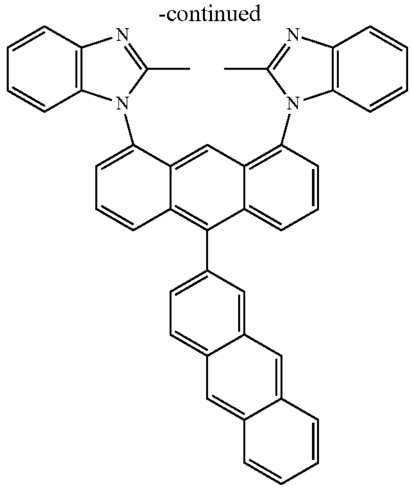
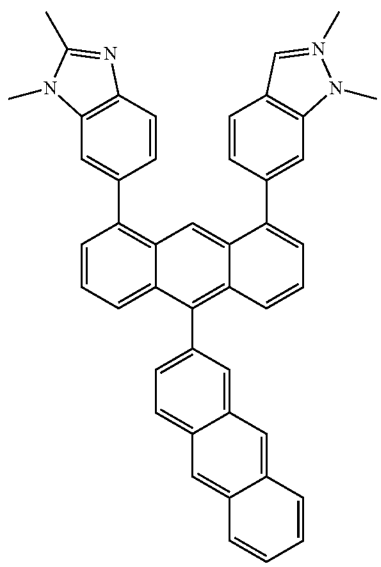
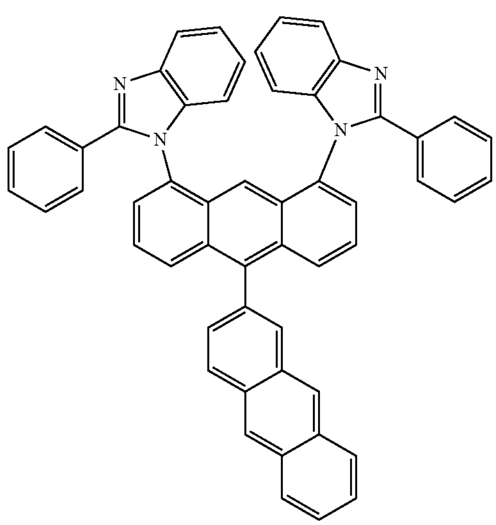
-continued
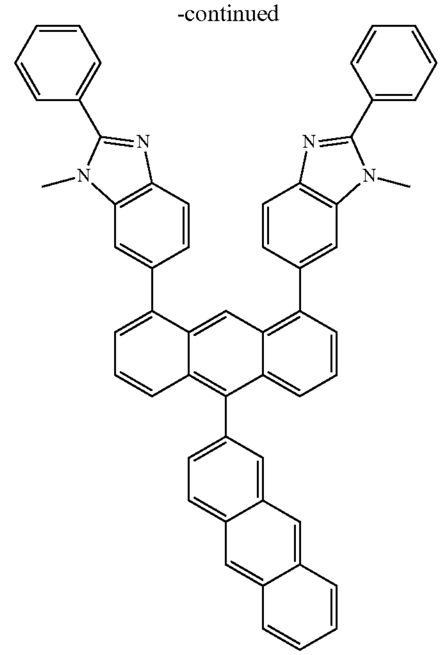
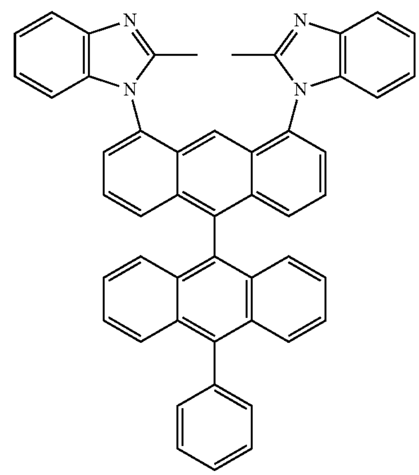
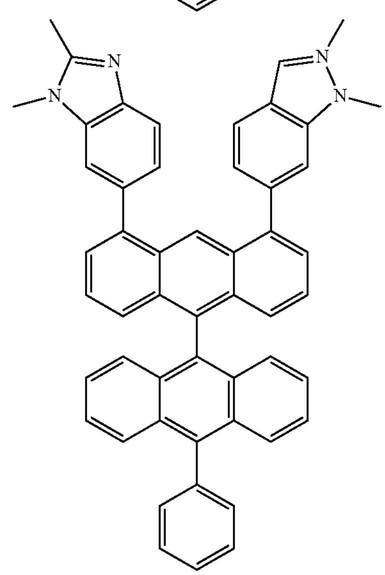

-continued
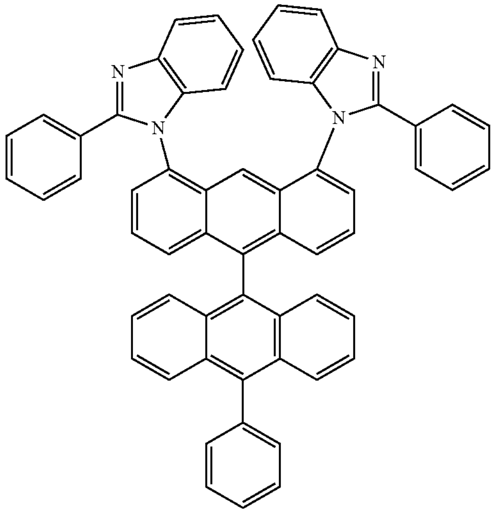
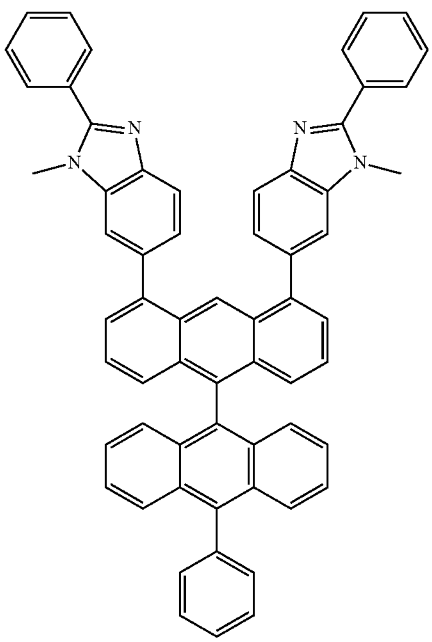
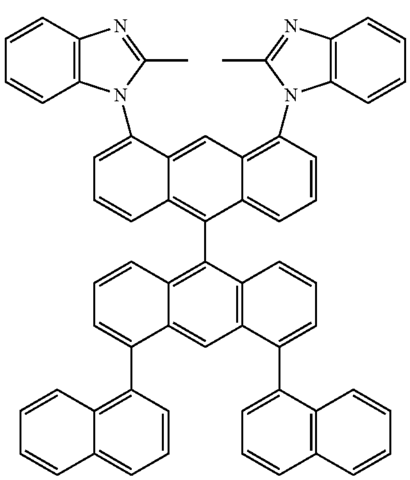
-continued
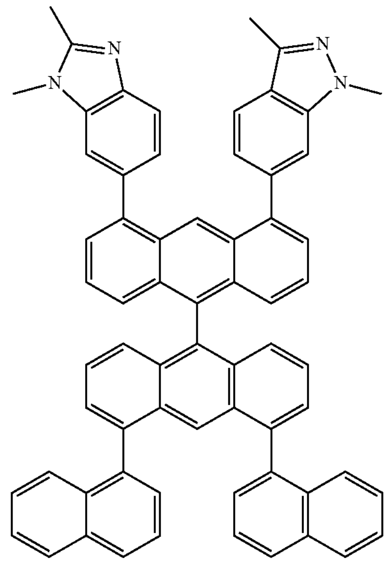
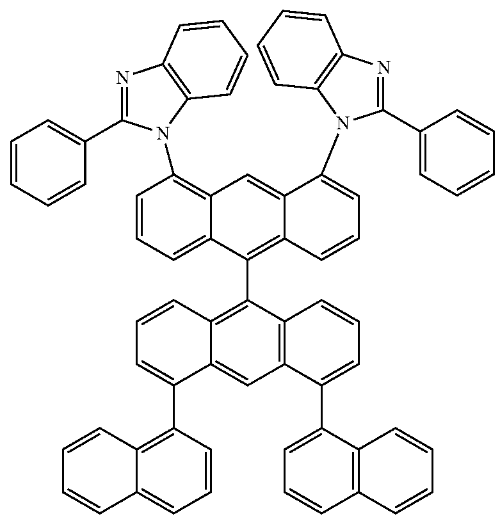
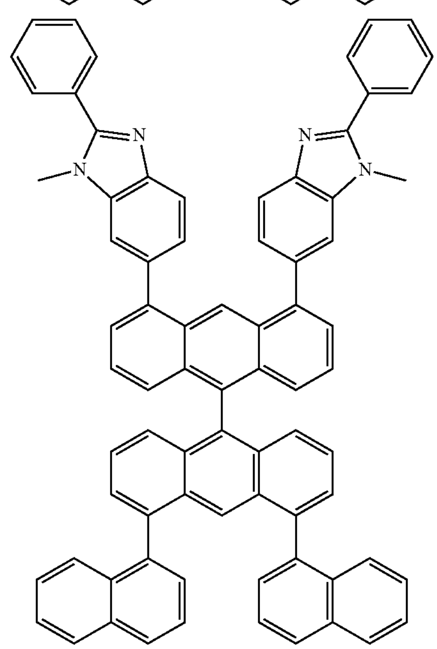

-continued
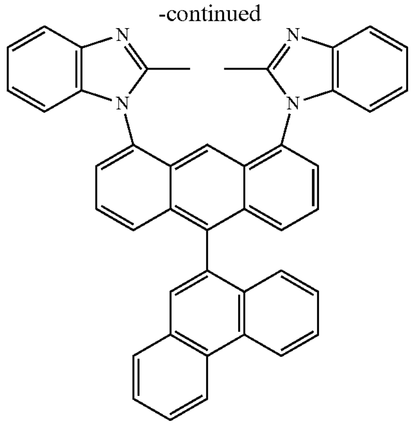
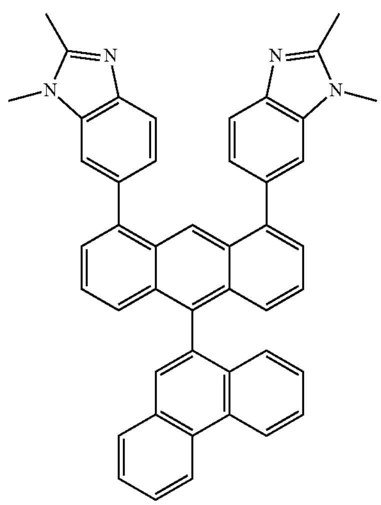
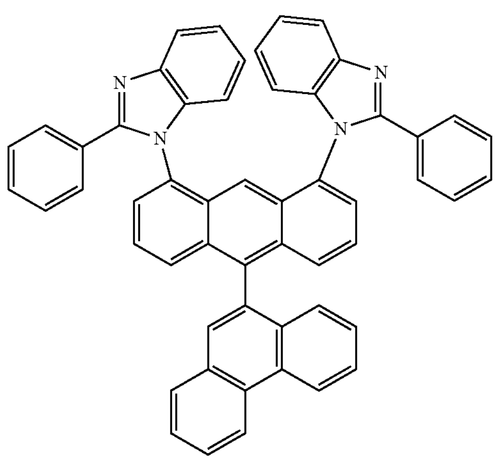
-continued
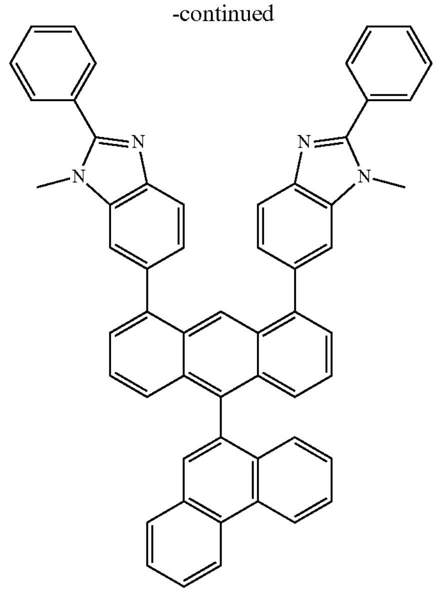
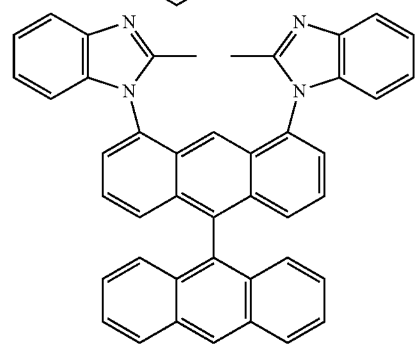
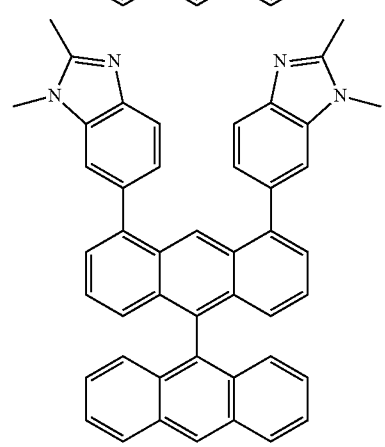
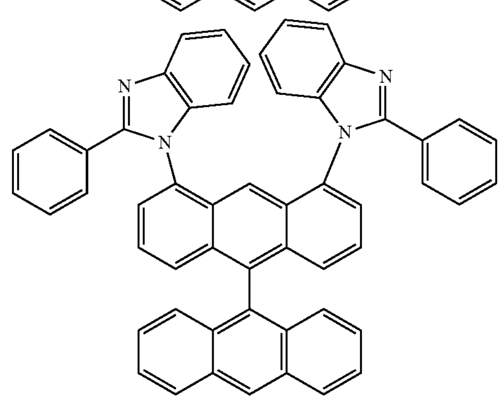

-continued
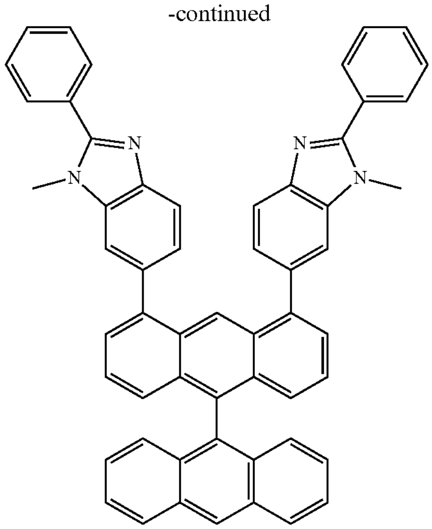
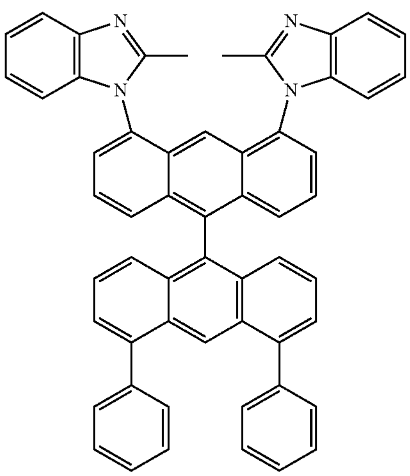
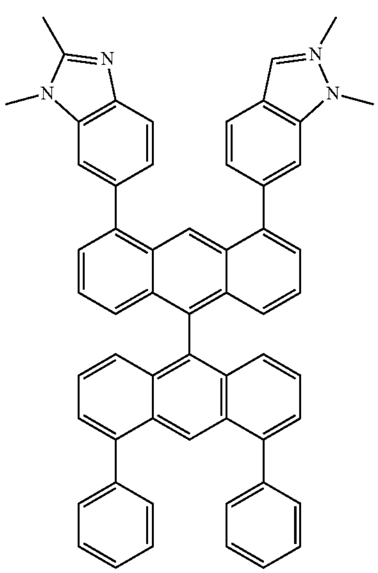
-continued
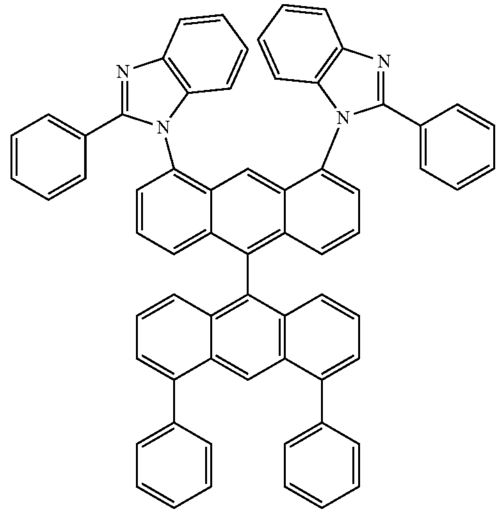
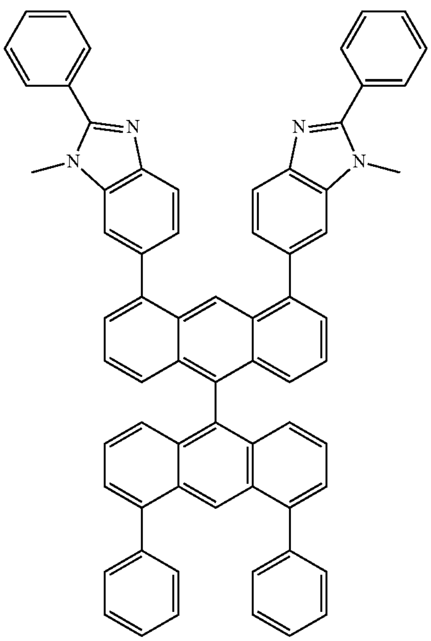
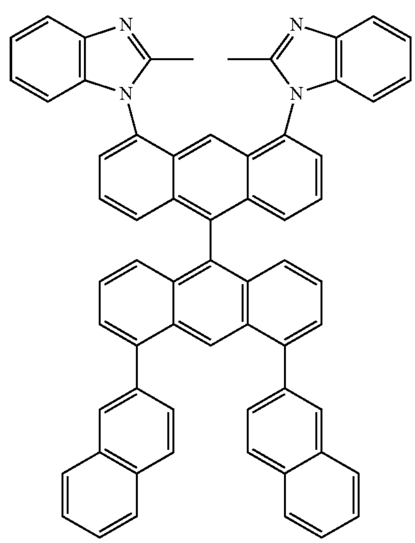

-continued
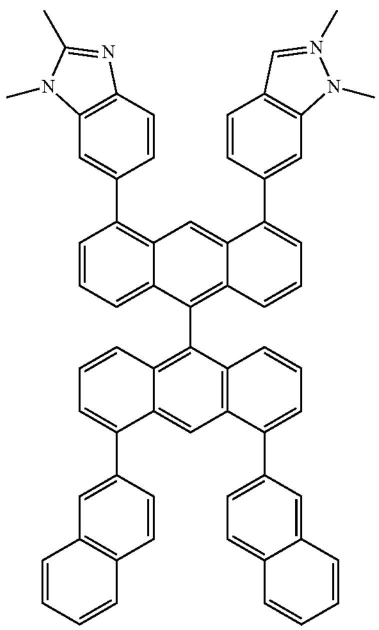
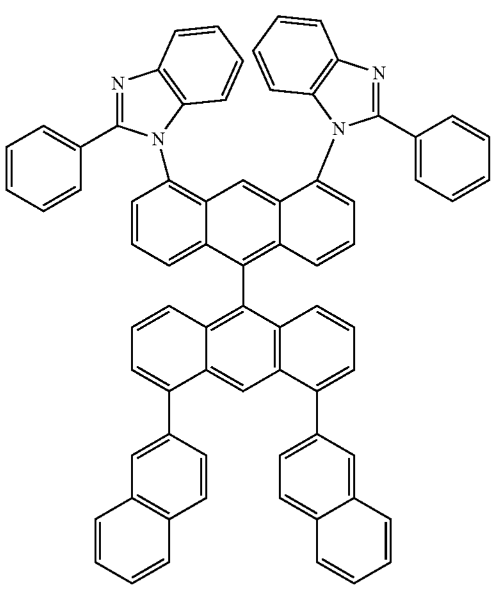
-continued
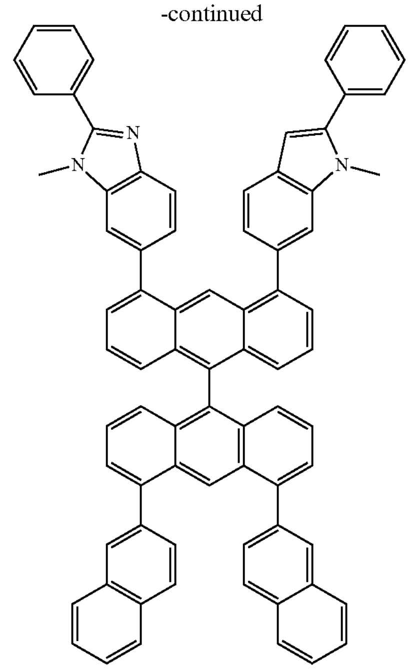
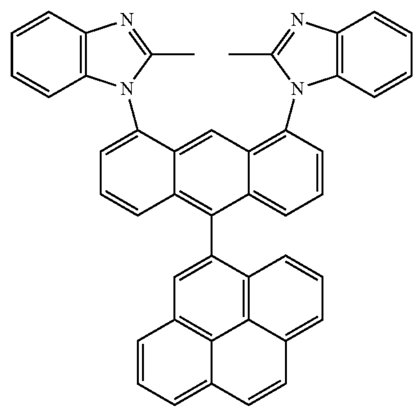
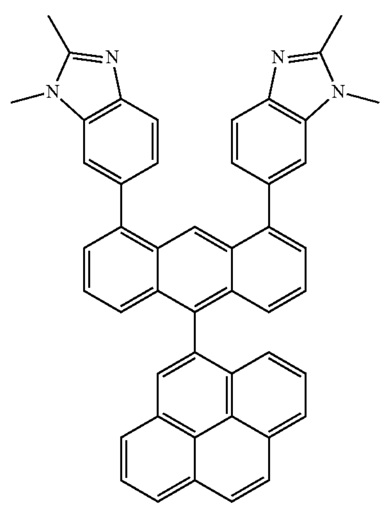

-continued
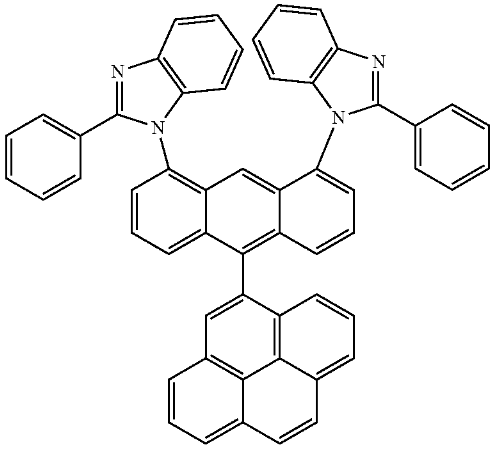
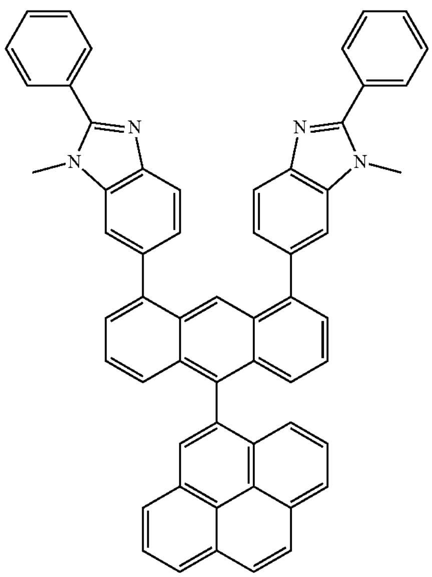
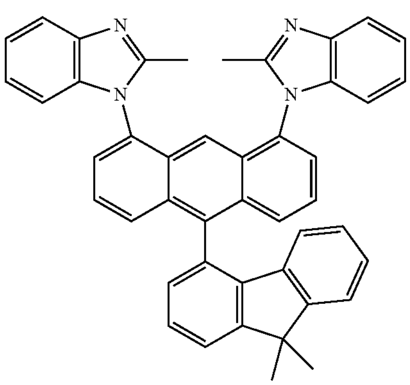
-continued
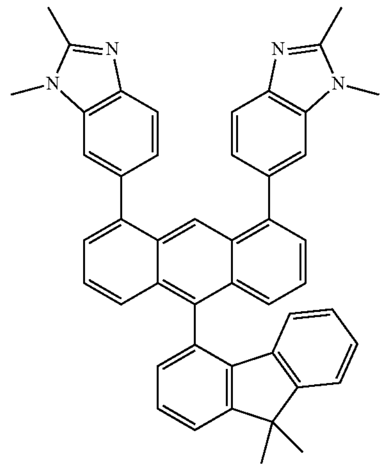
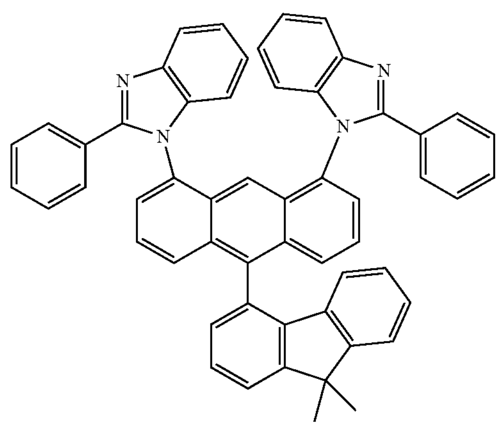
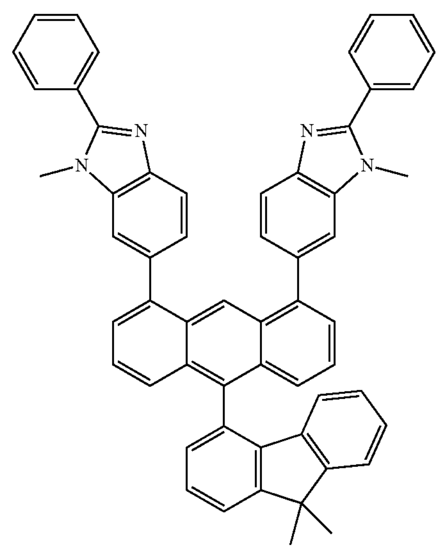

-continued
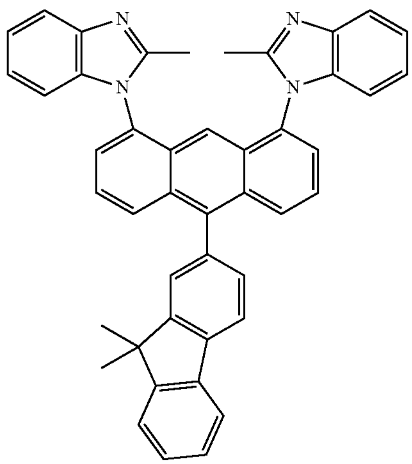
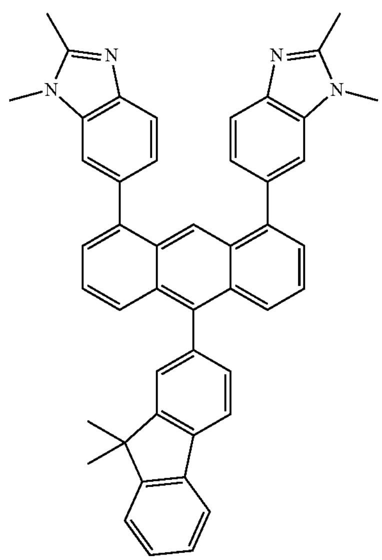
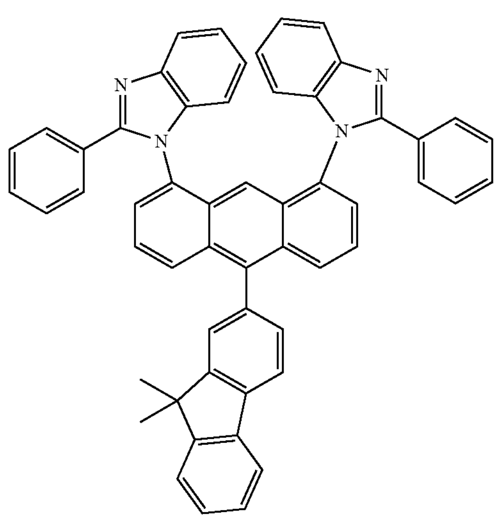
-continued
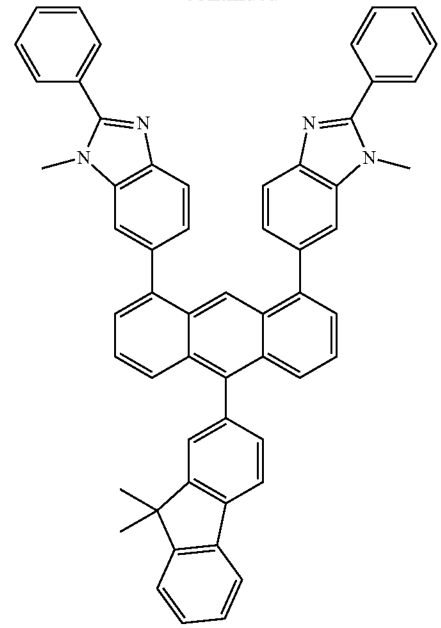
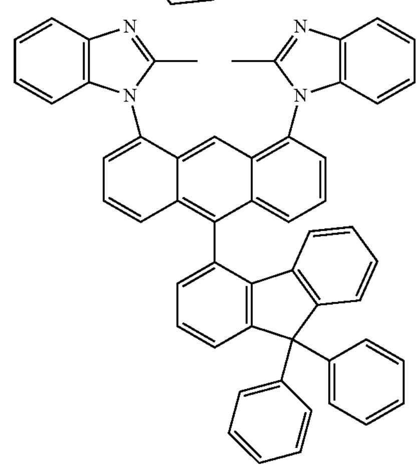
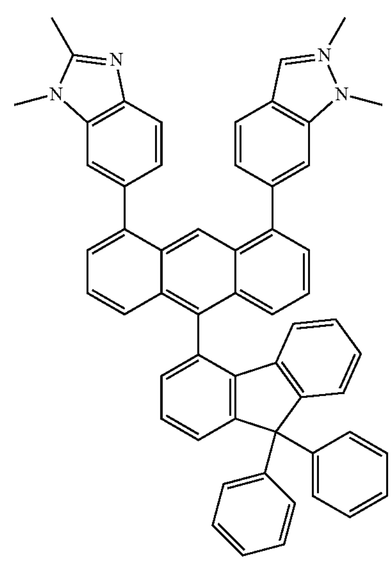

-continued
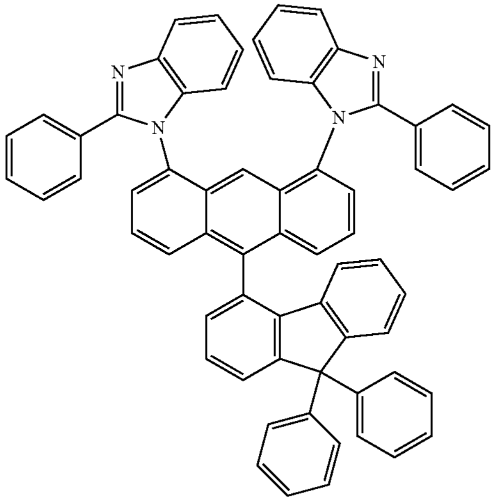
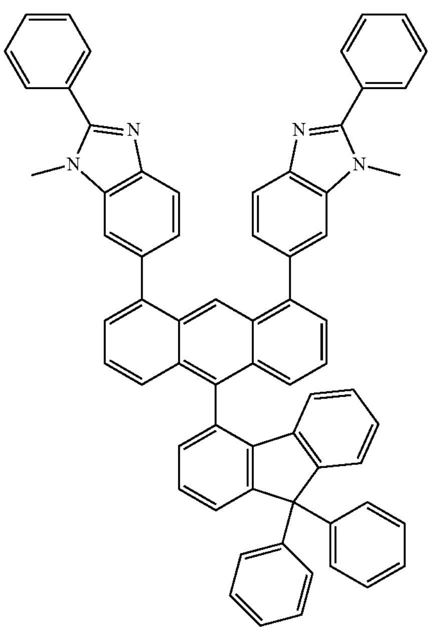
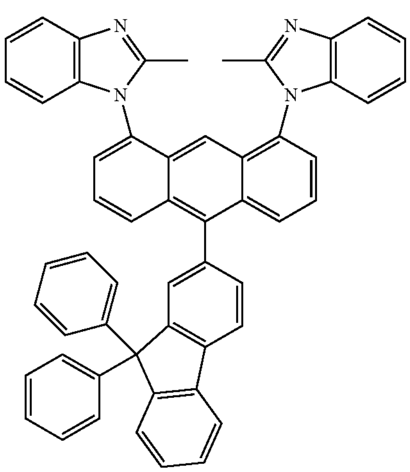
-continued
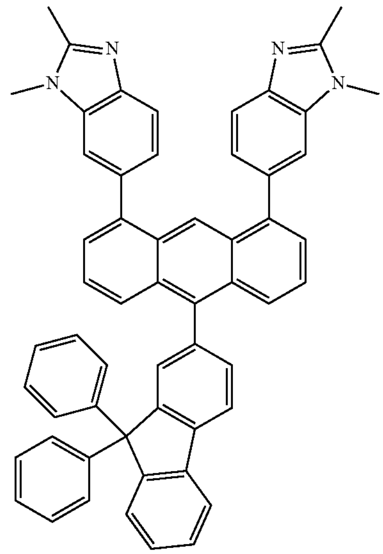
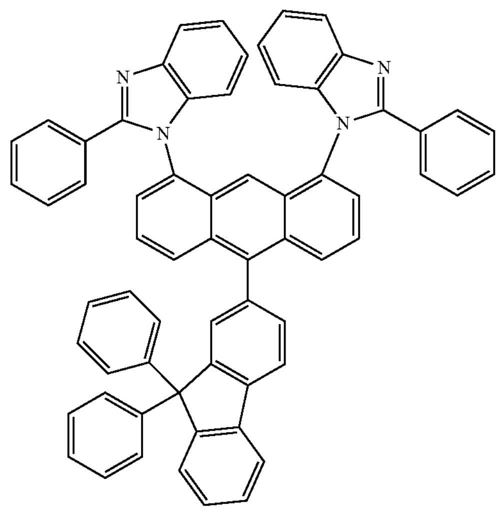
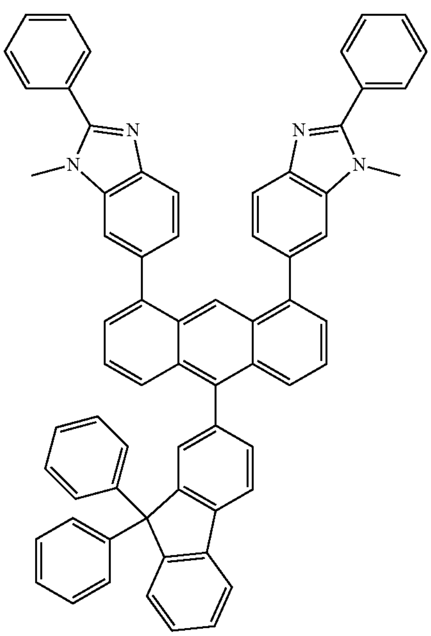

-continued
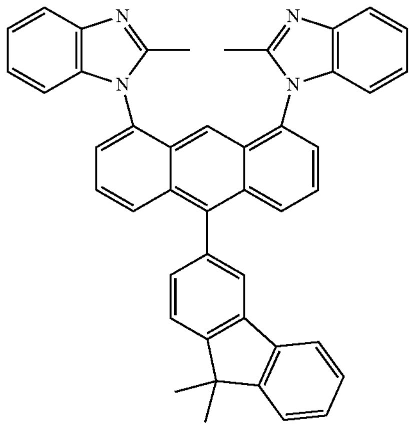
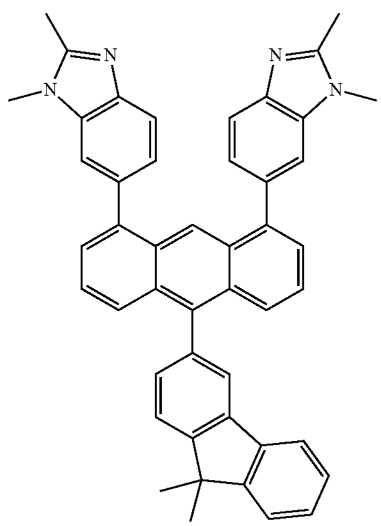
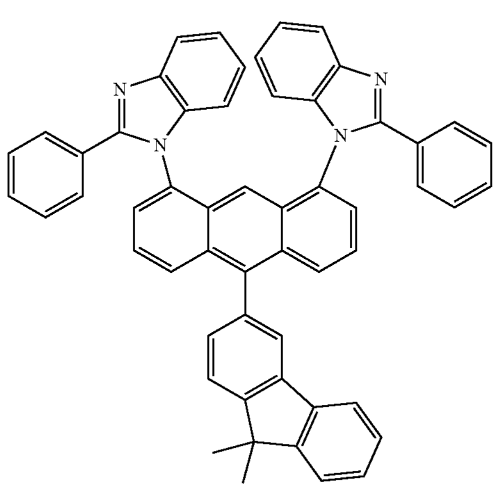
-continued
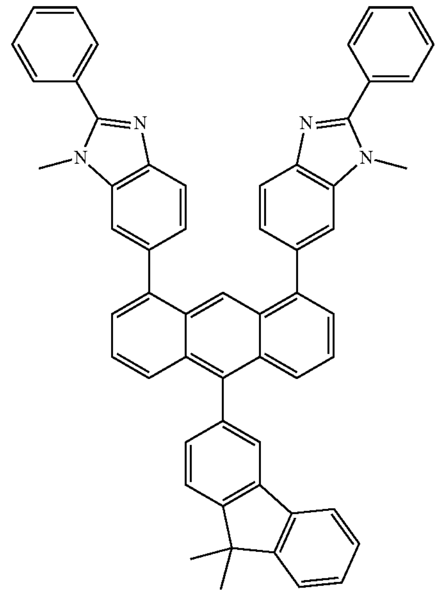
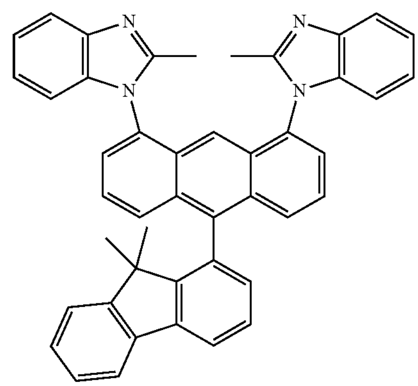
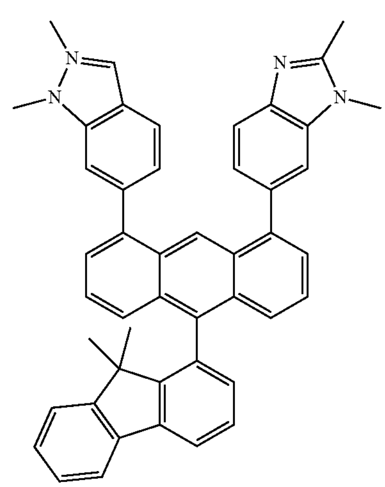

-continued
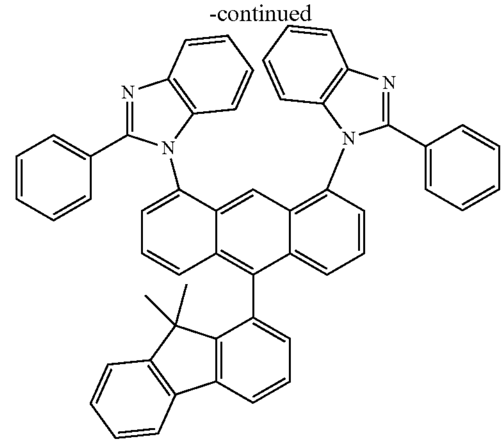
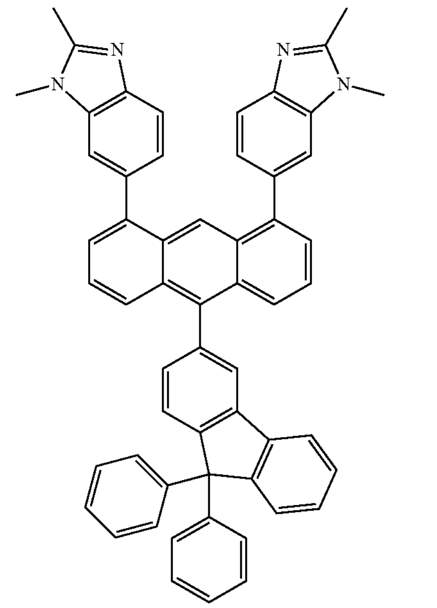
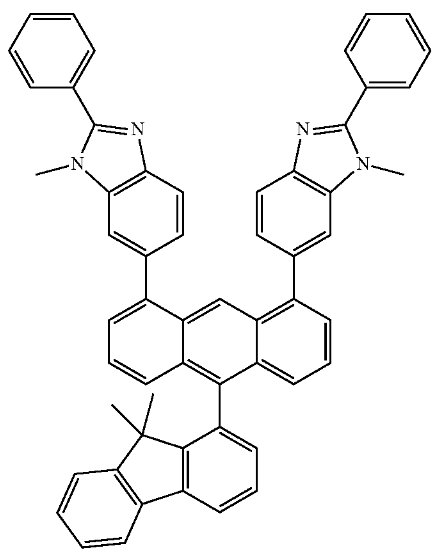
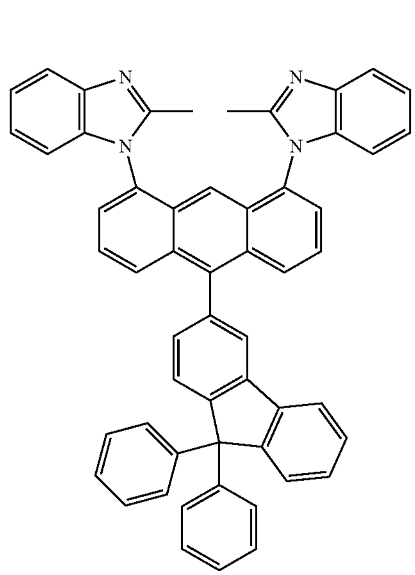
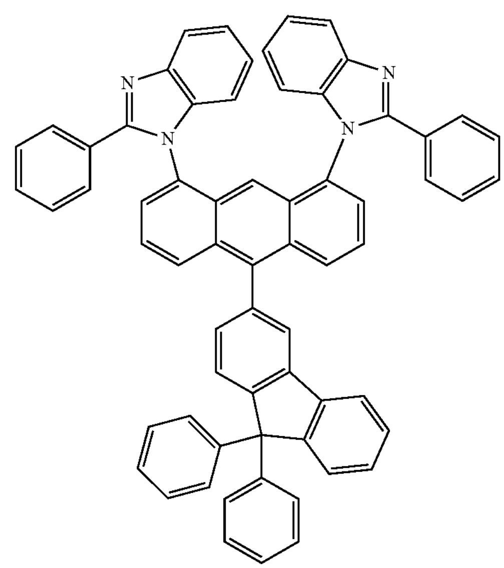

-continued
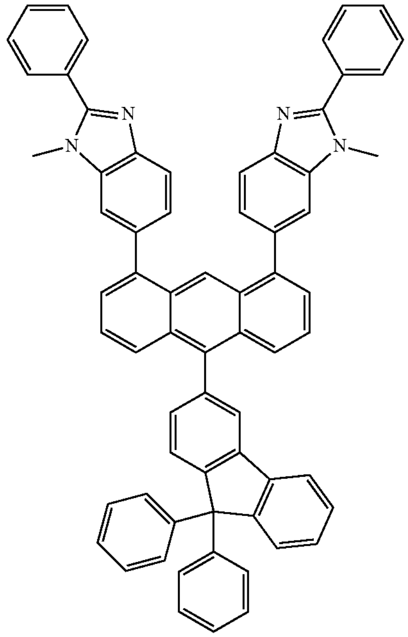
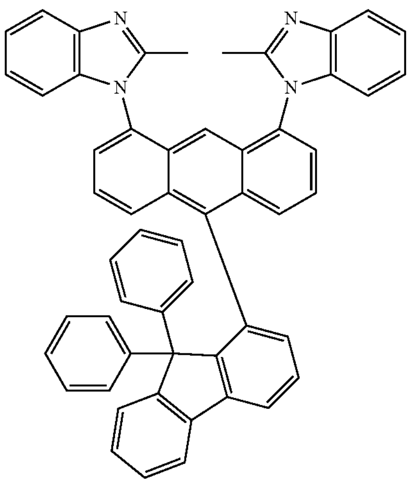
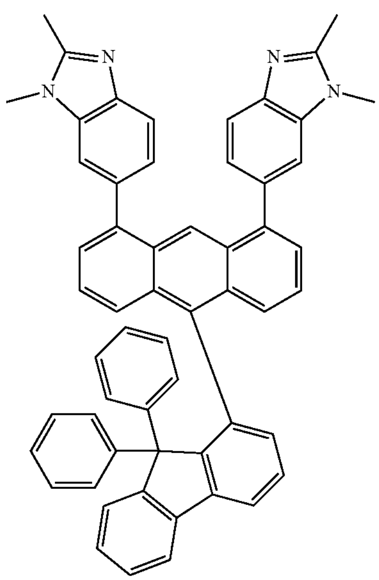
-continued
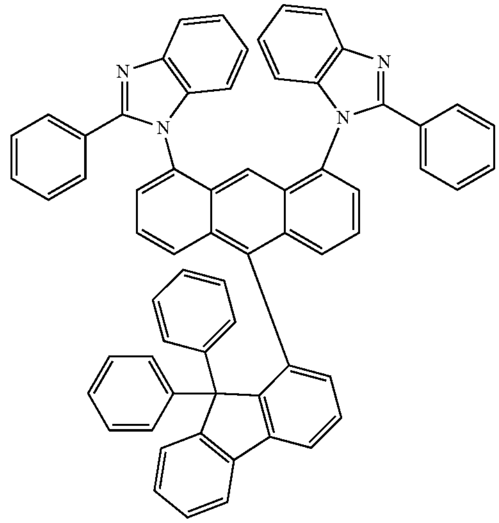
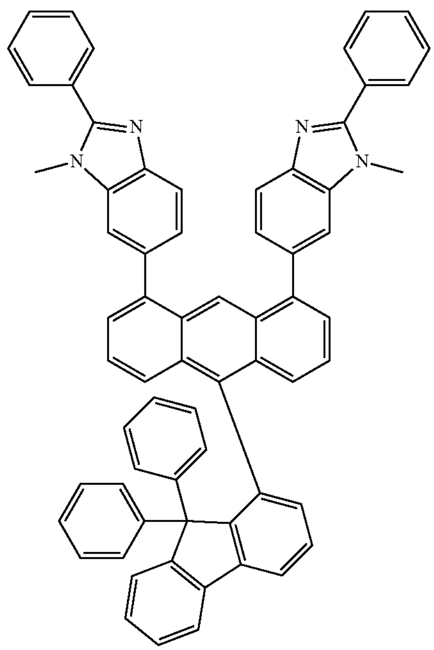
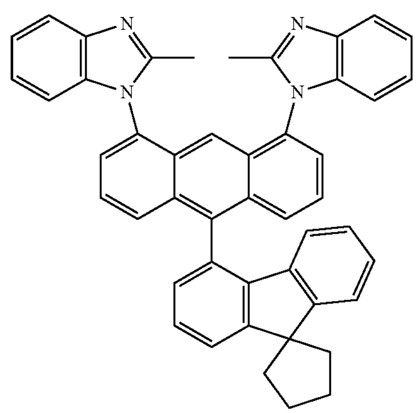

-continued
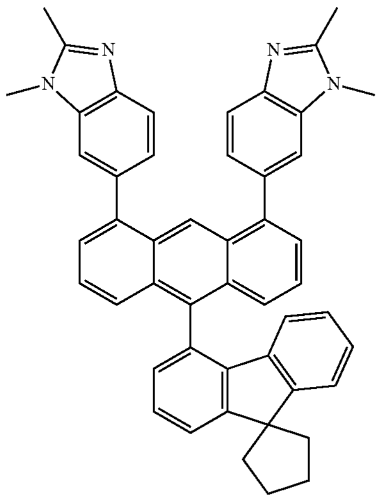
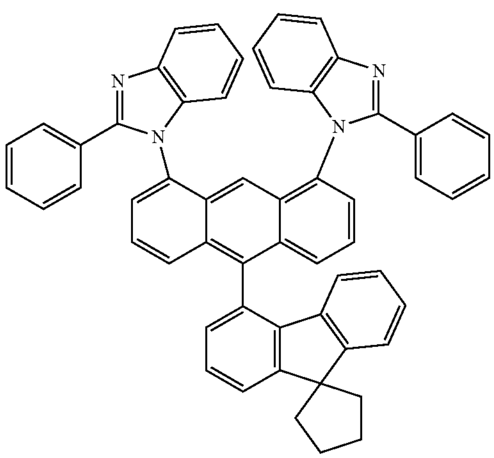
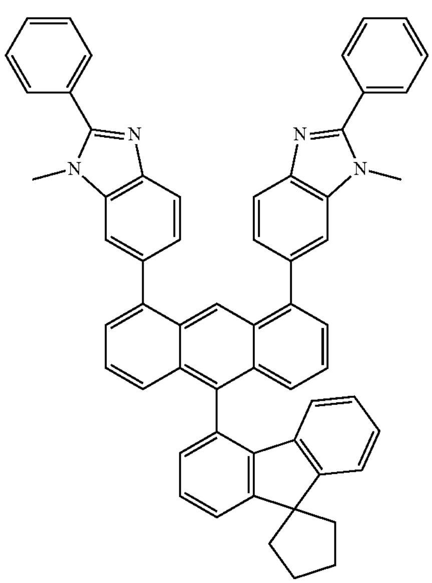
-continued
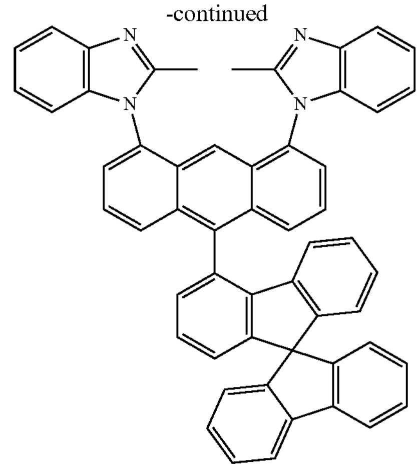
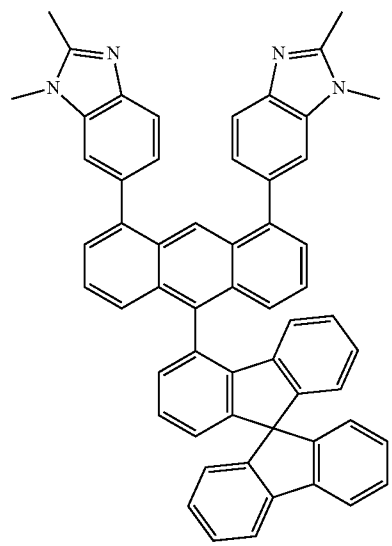
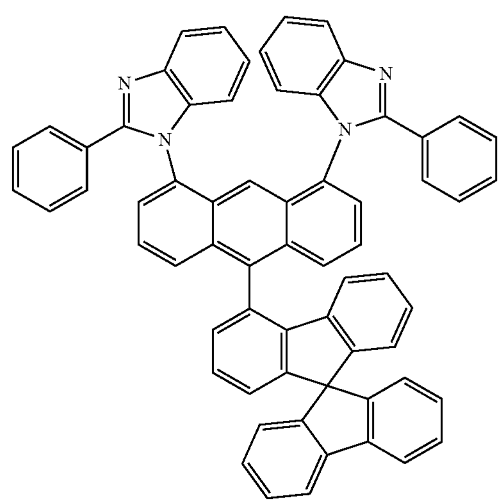

-continued
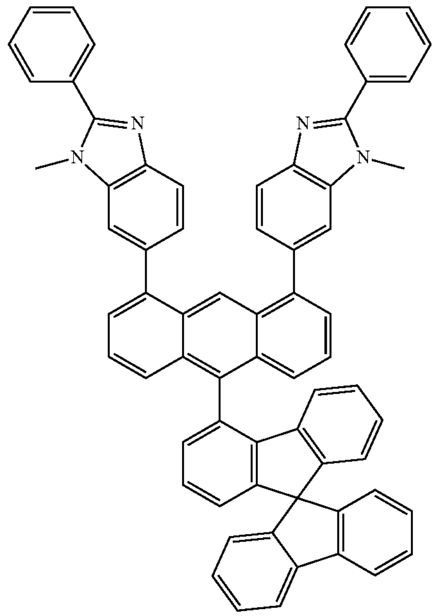
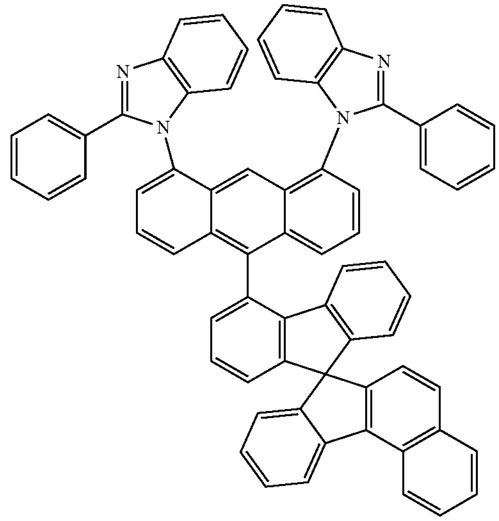
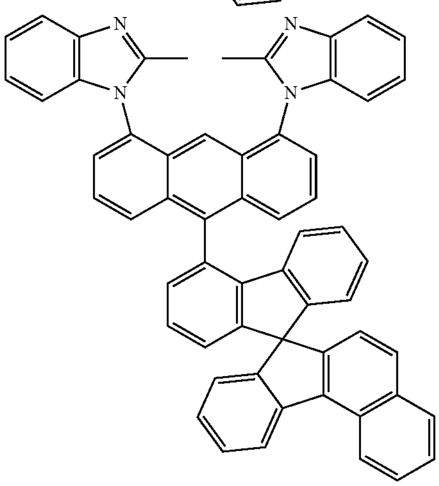
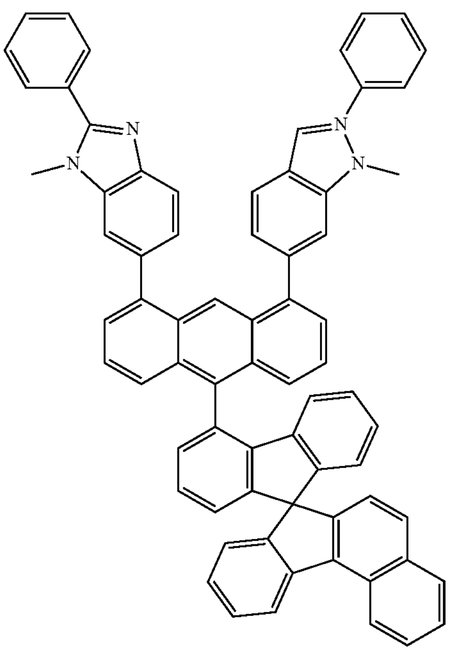
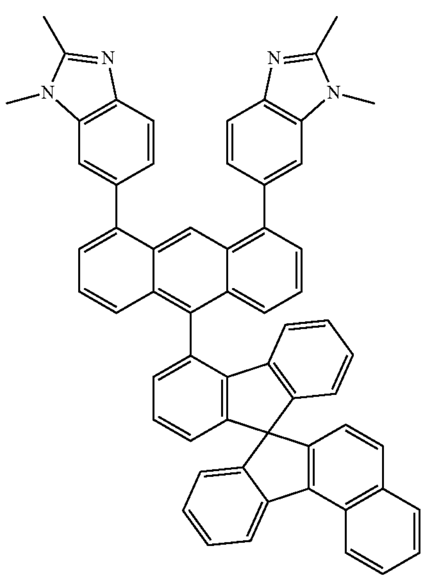
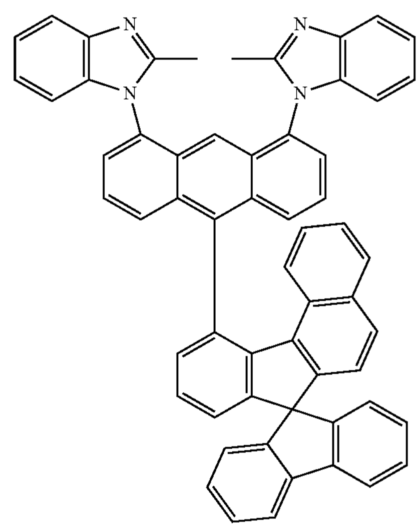
-continued -continued
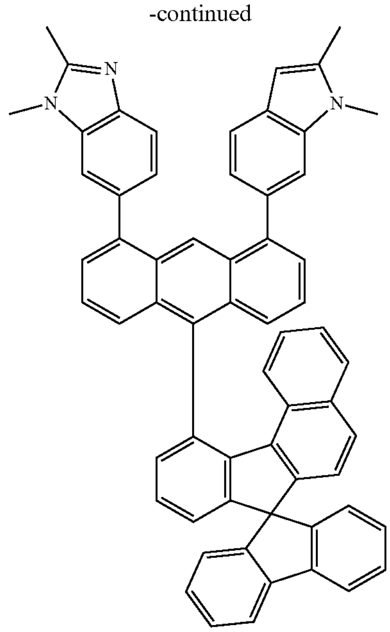
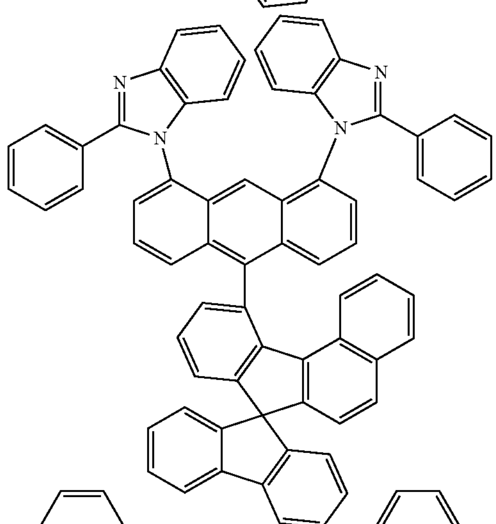
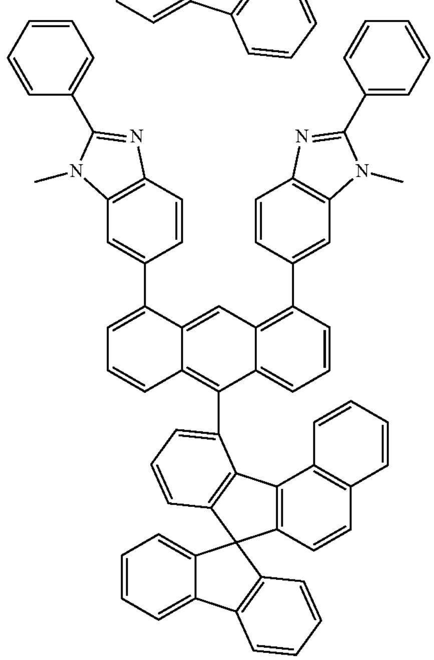
-continued
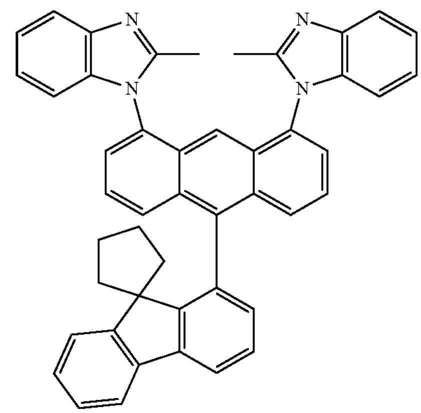
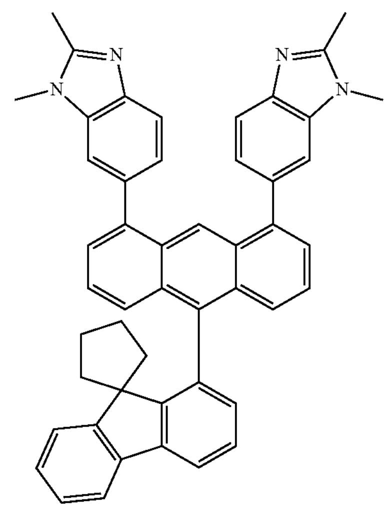
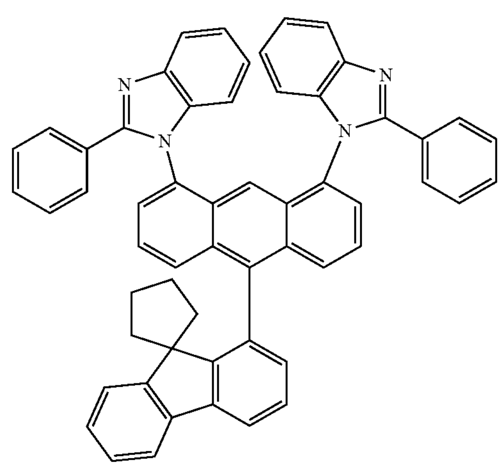

-continued
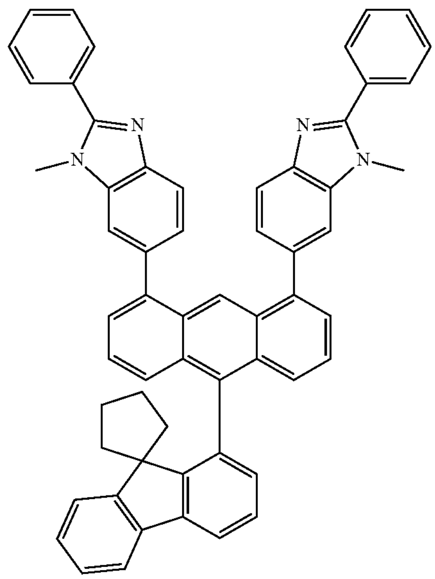
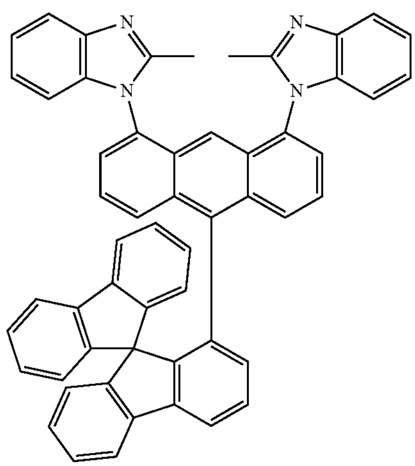
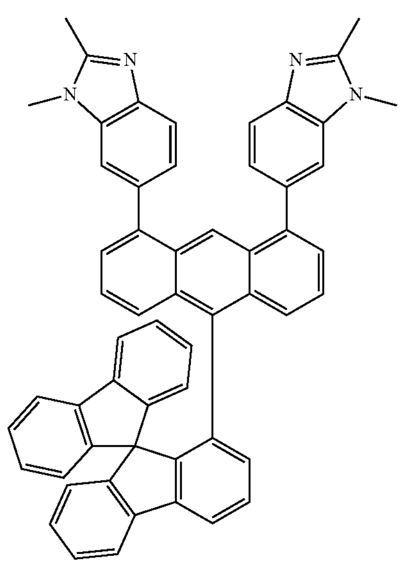
-continued
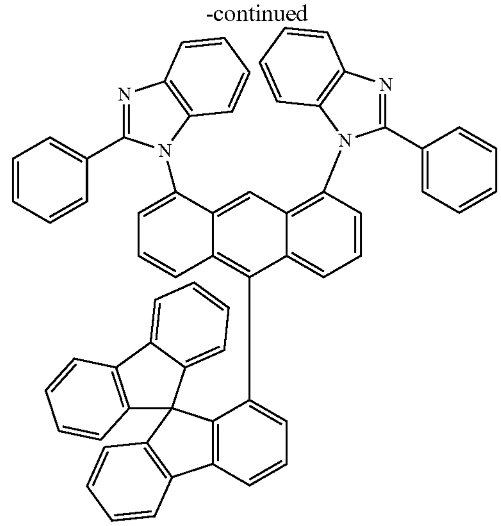
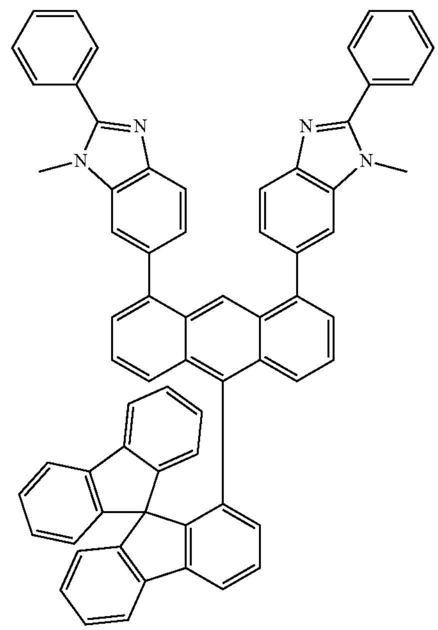
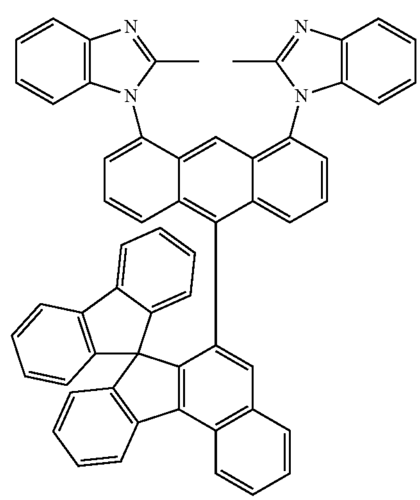

-continued
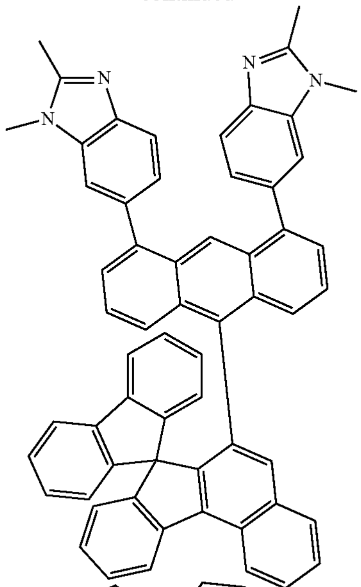
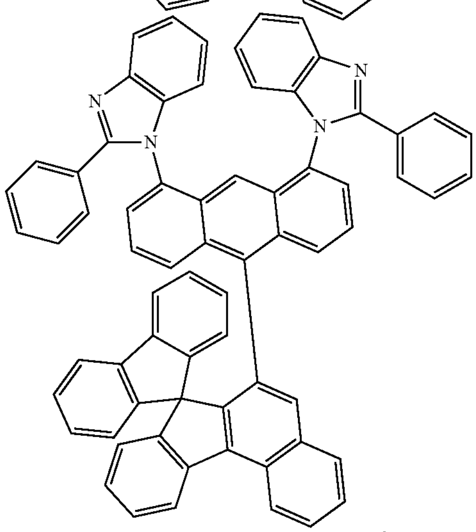
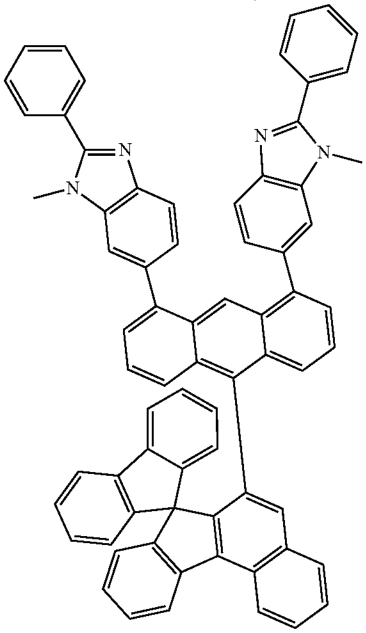
-continued
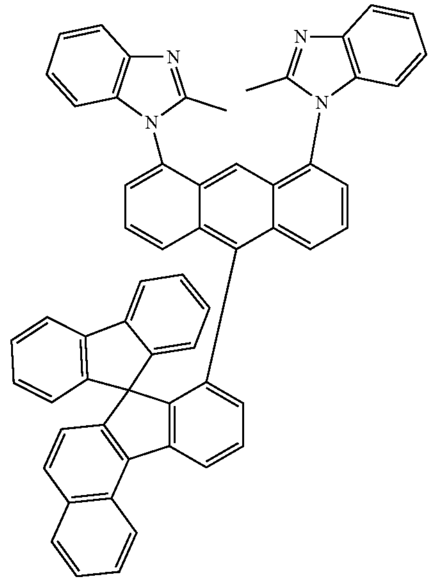
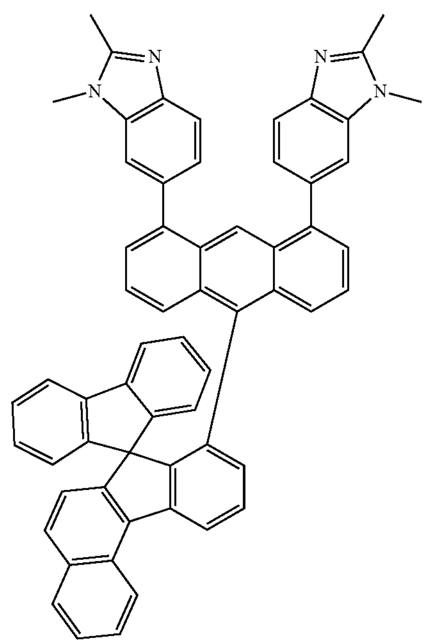

-continued
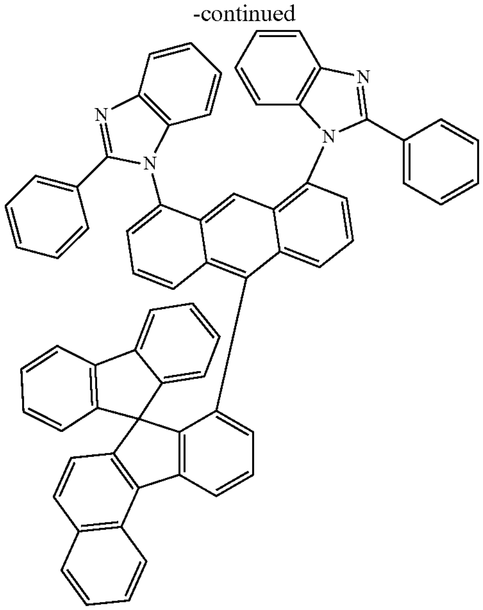
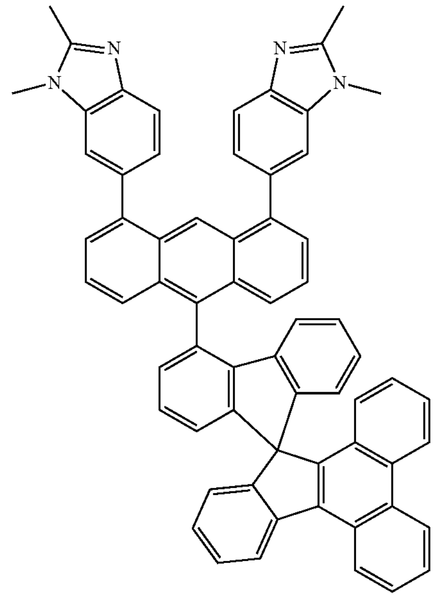
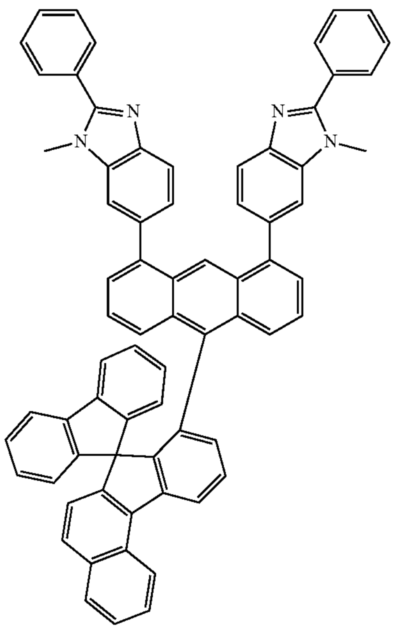
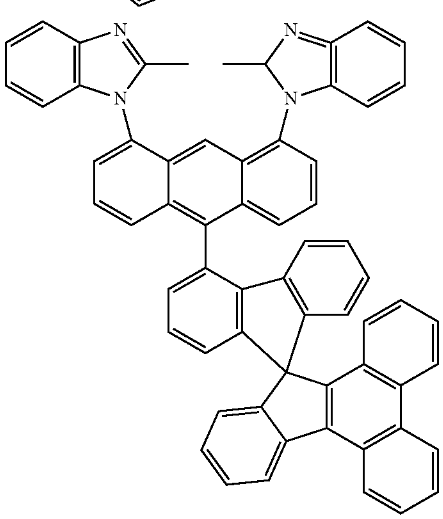
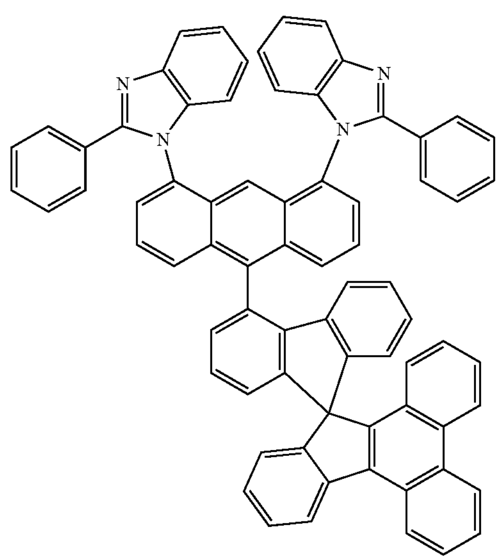

-continued
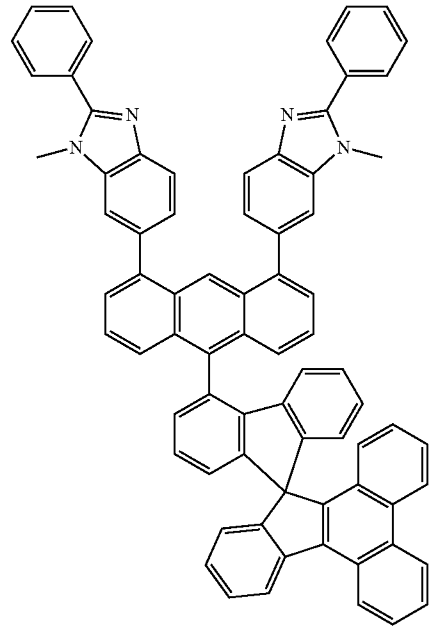
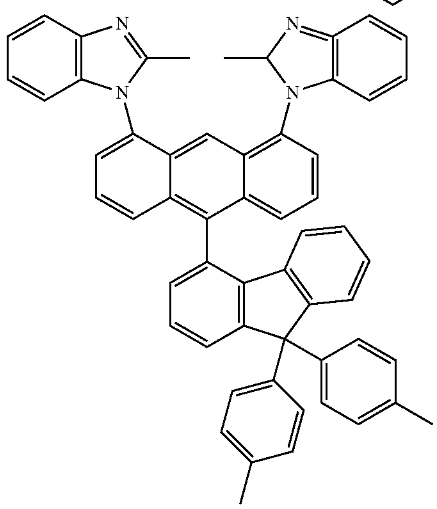
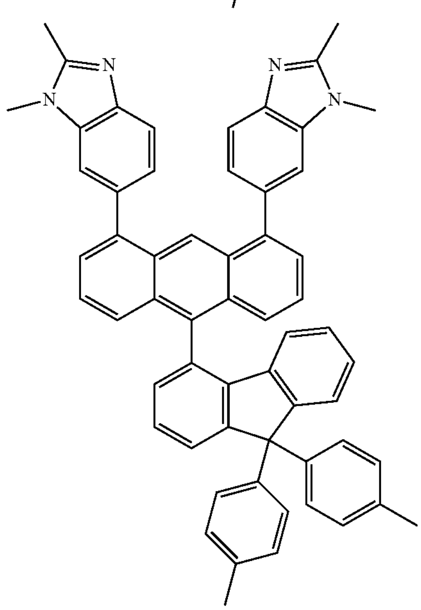
-continued
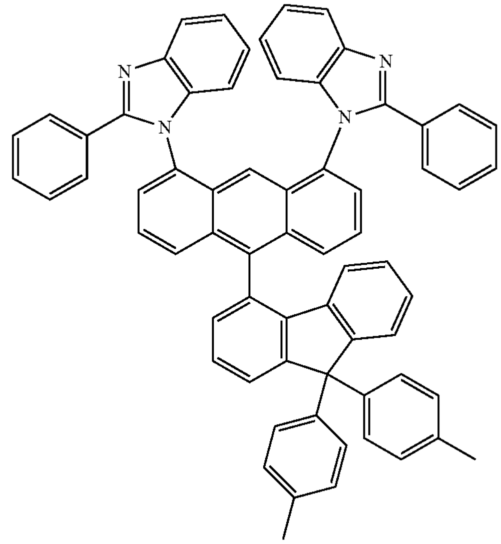
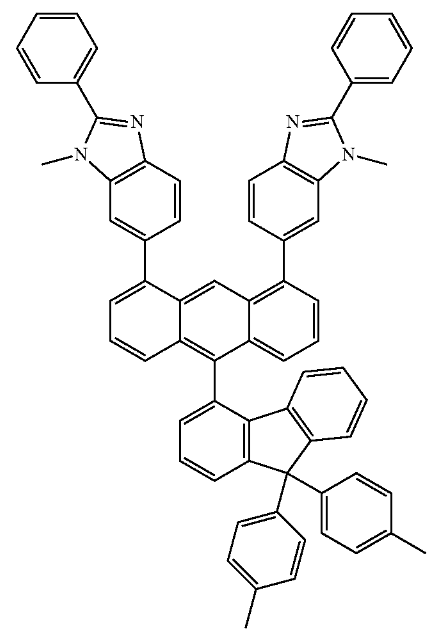
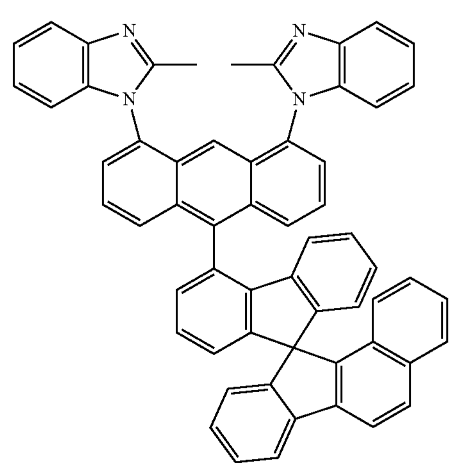

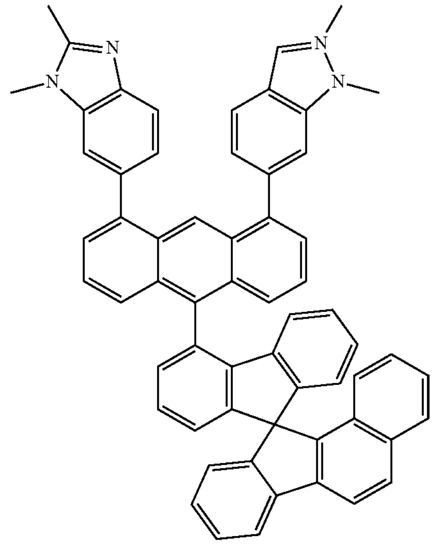
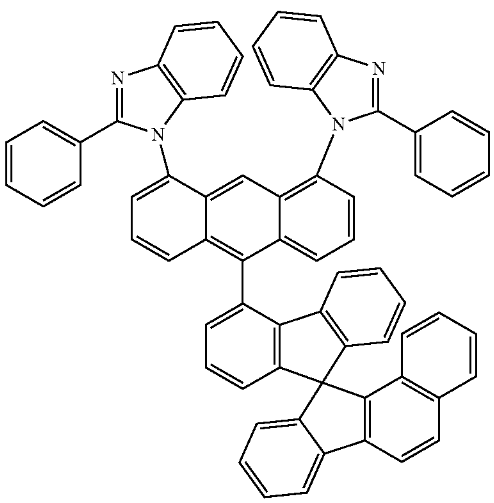
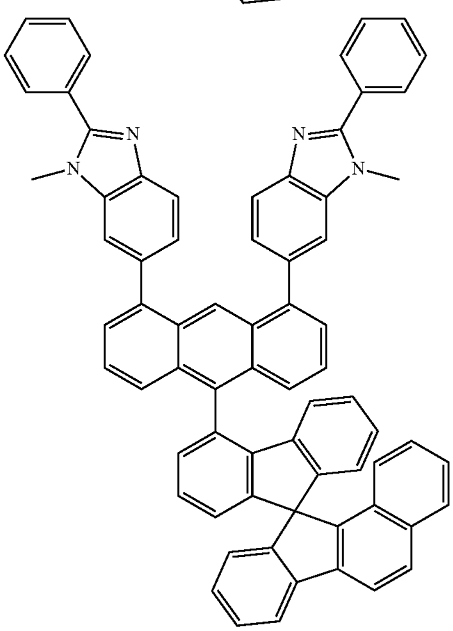
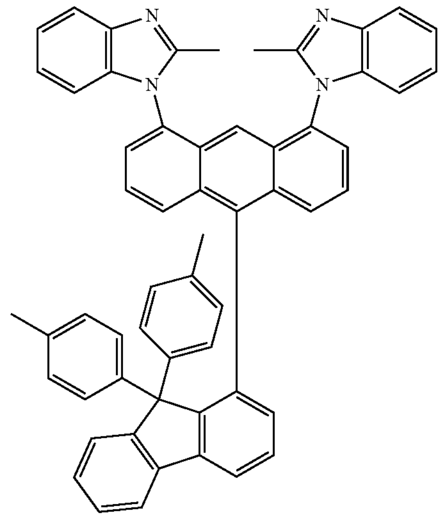
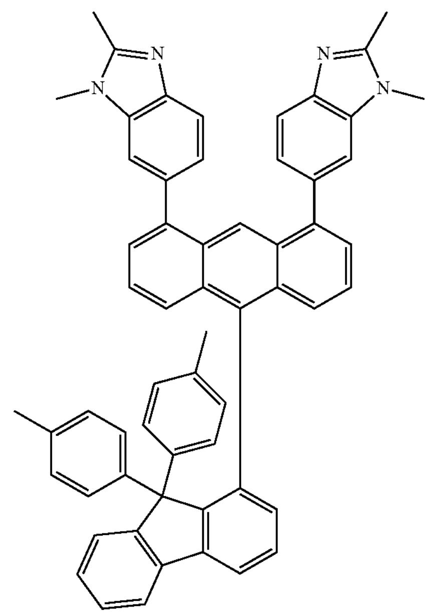
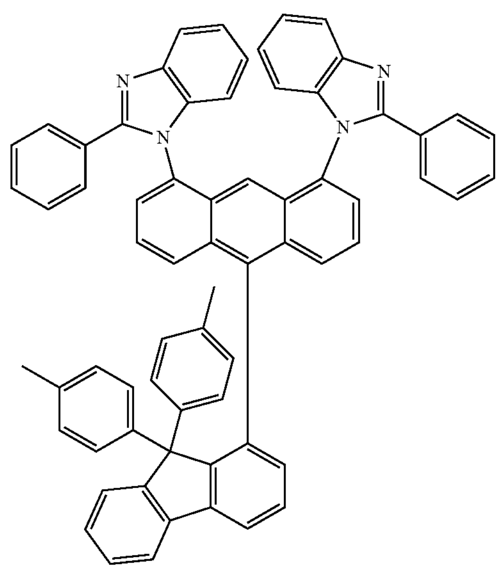

-continued
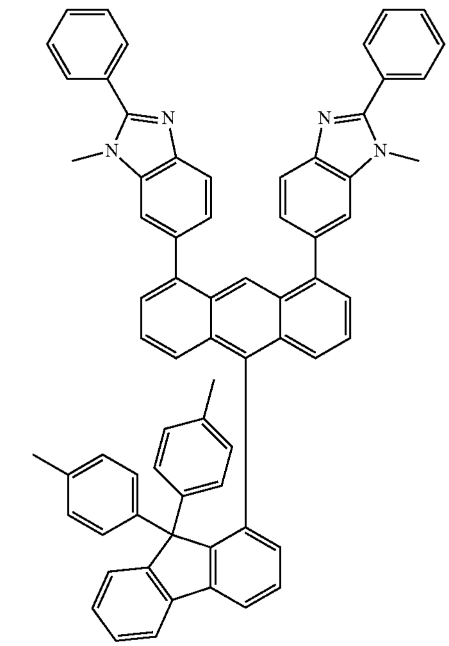
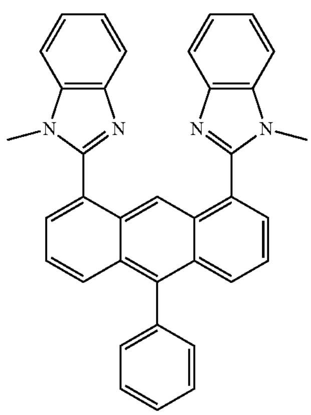
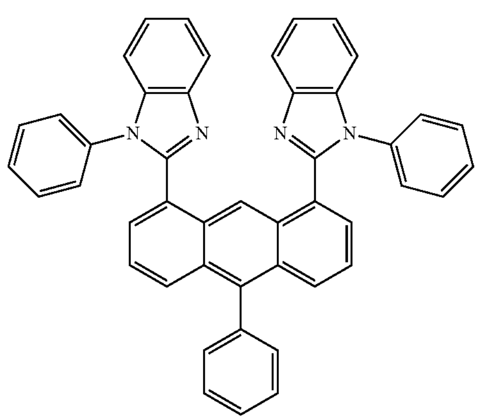
-continued
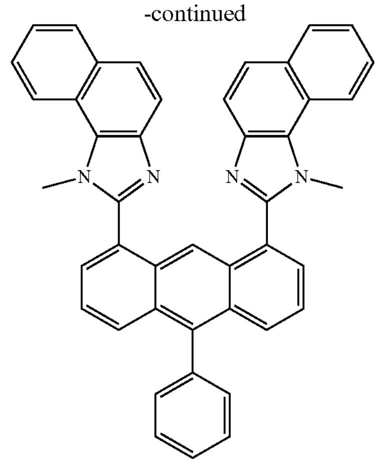
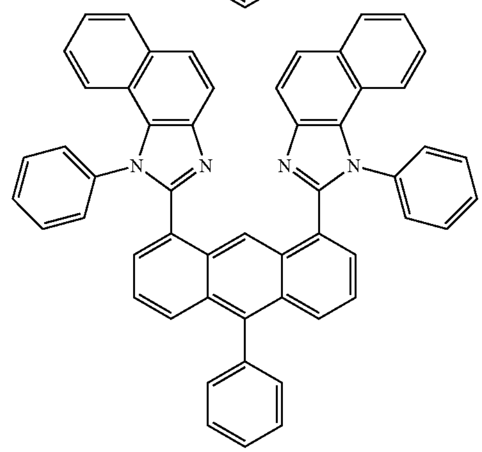
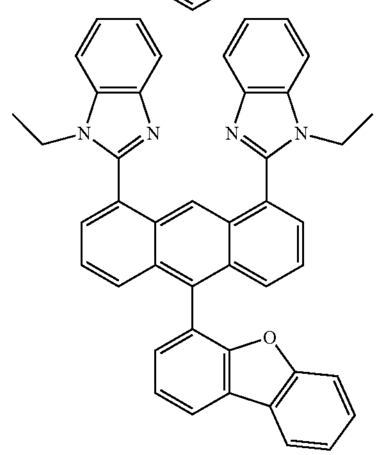
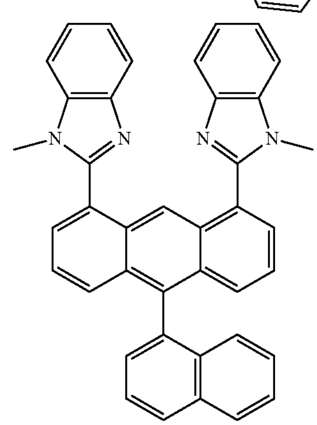

-continued
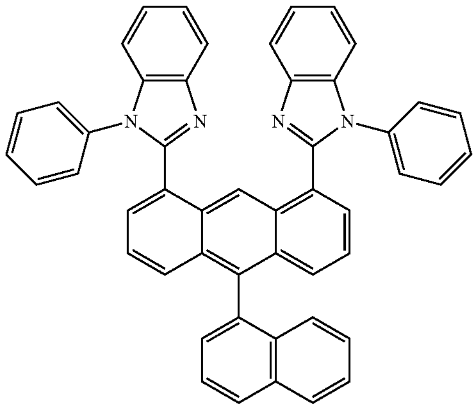
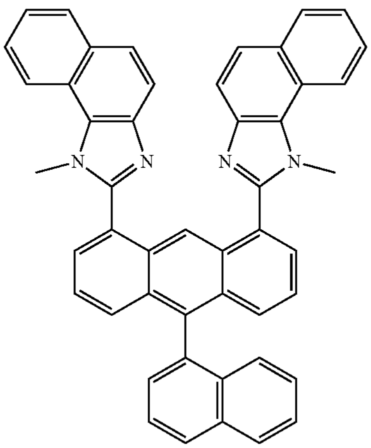
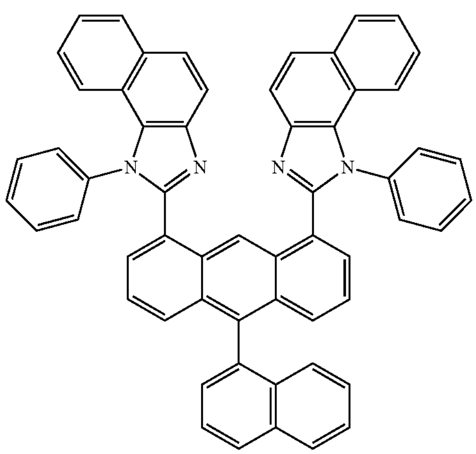
-continued
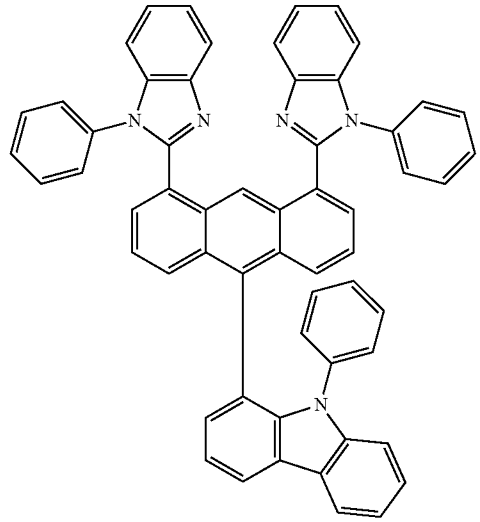
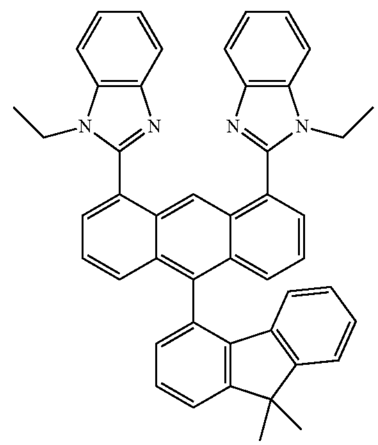
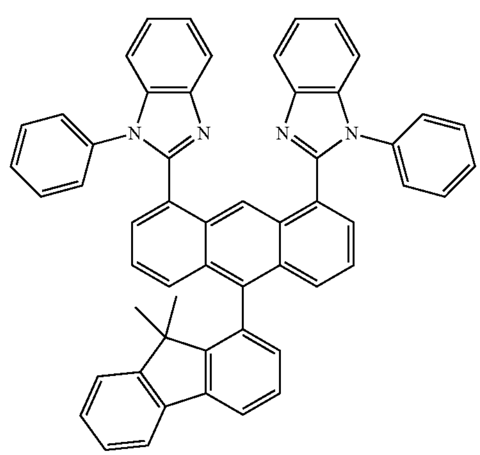

-continued
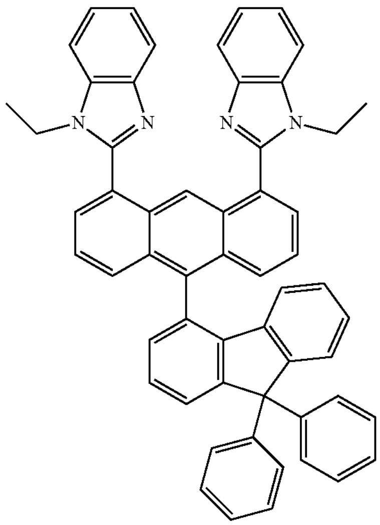
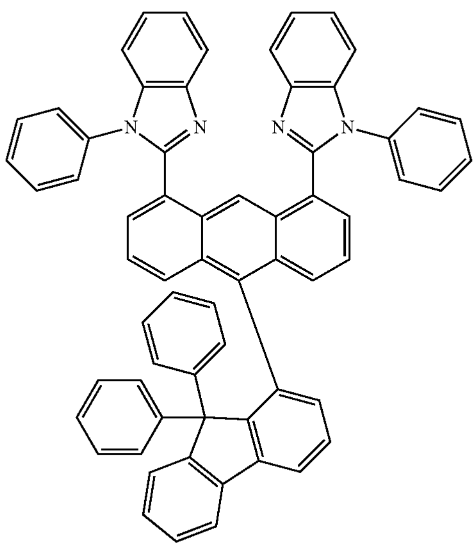
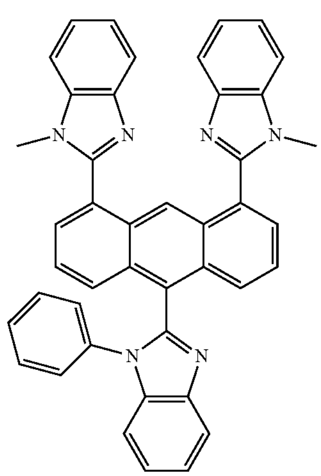
-continued
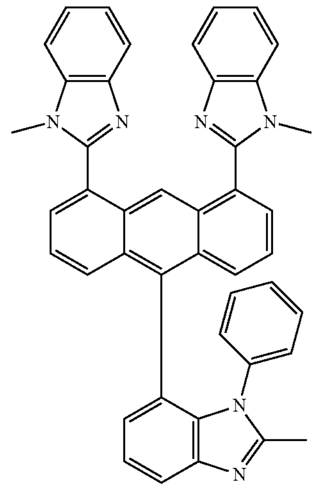
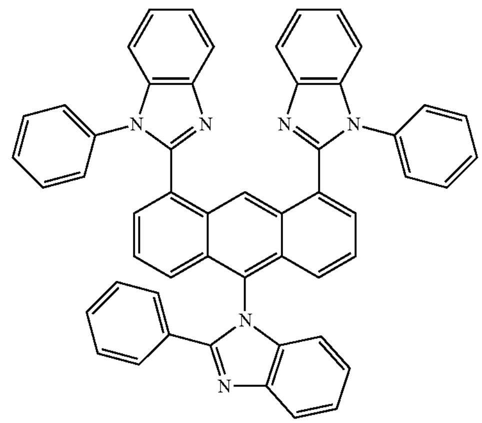
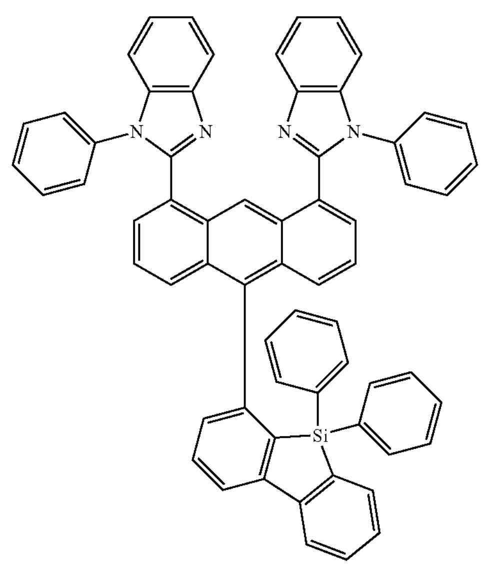

-continued
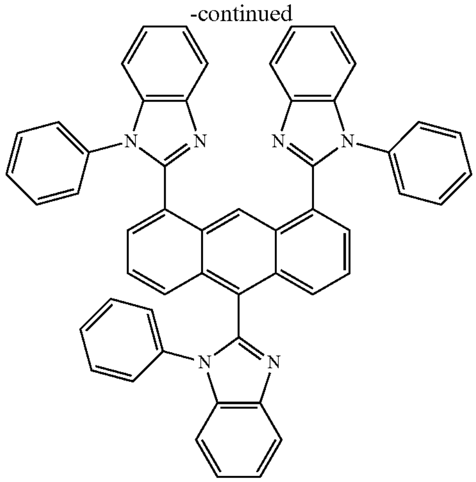
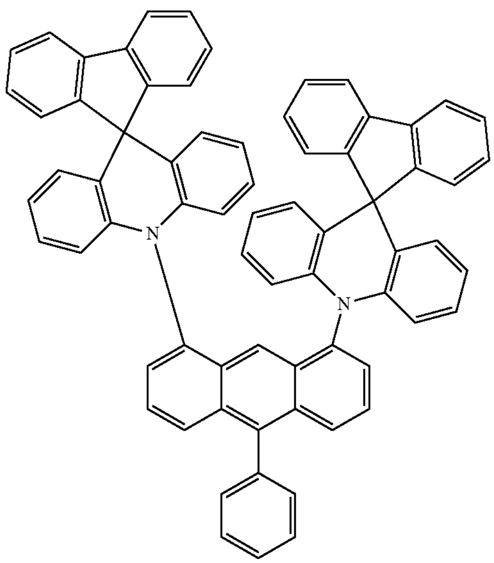
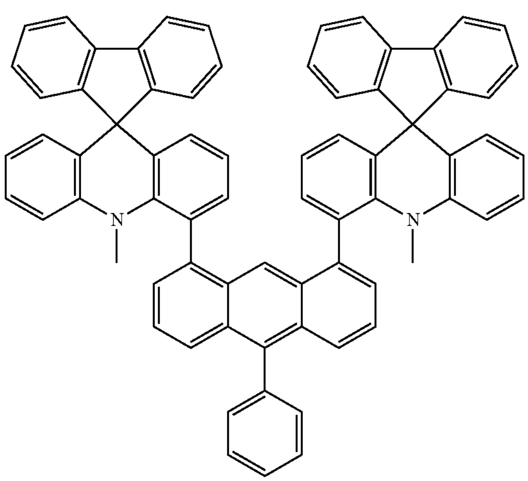
-continued
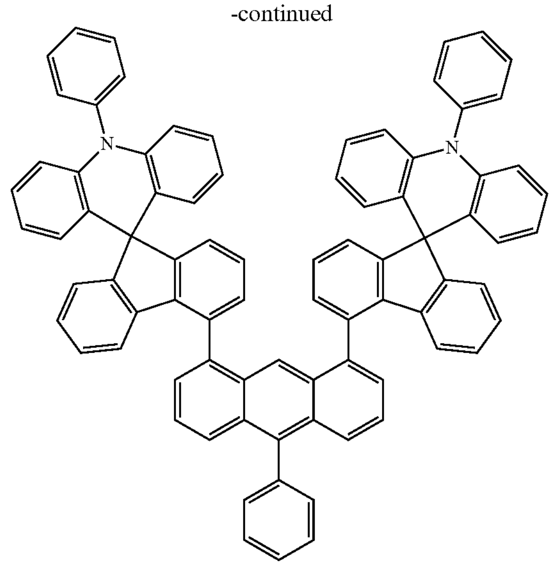
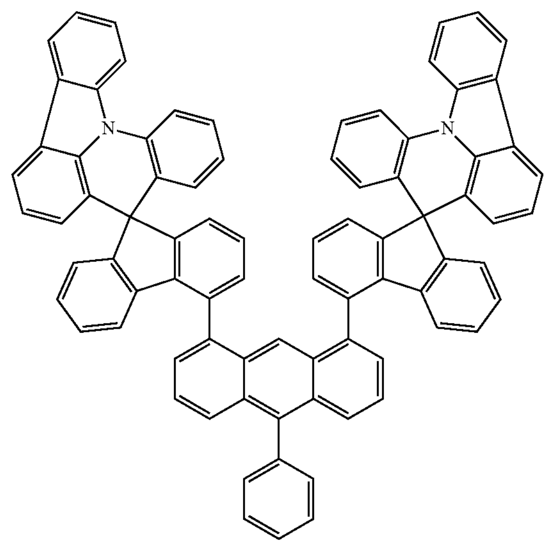
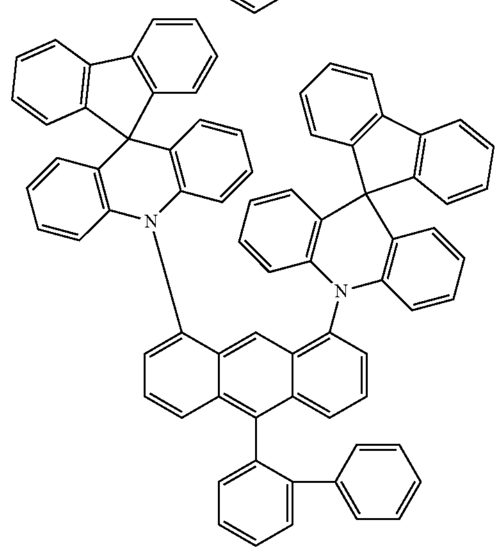

-continued
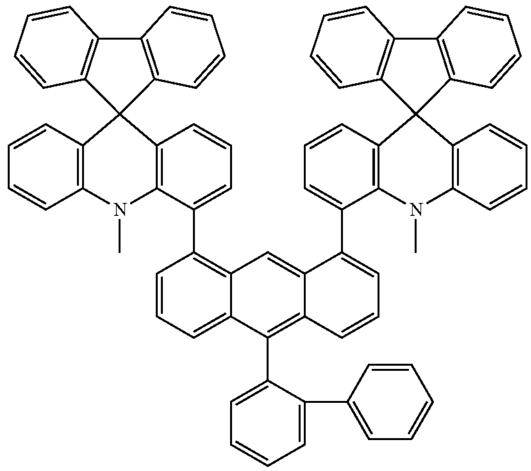
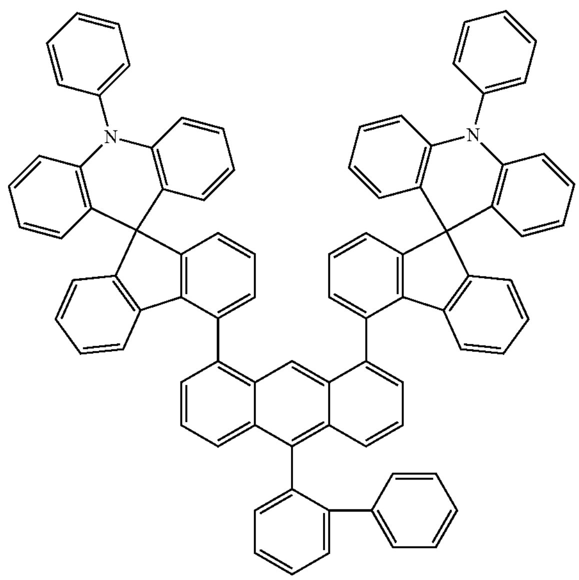
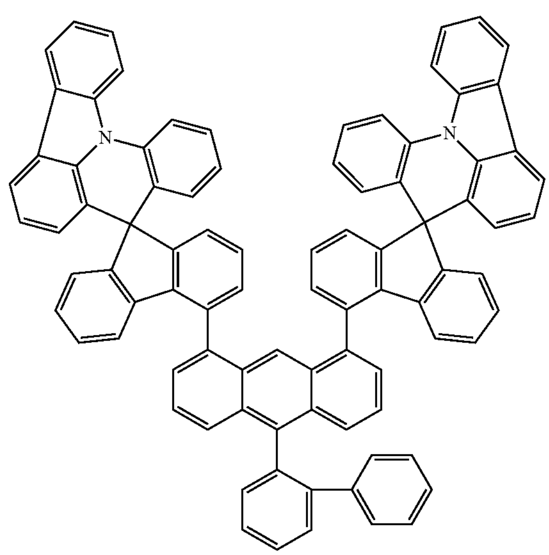
-continued
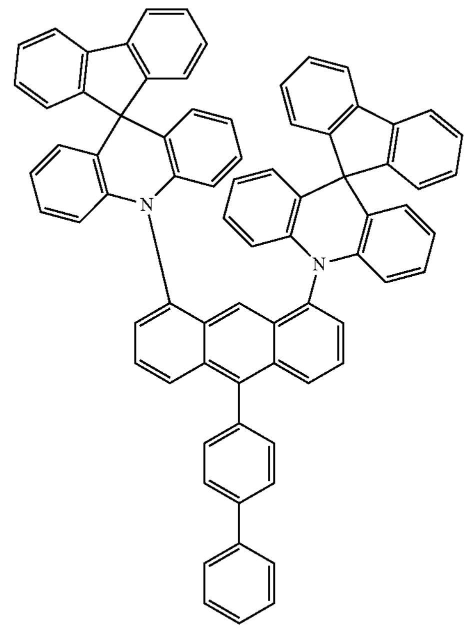
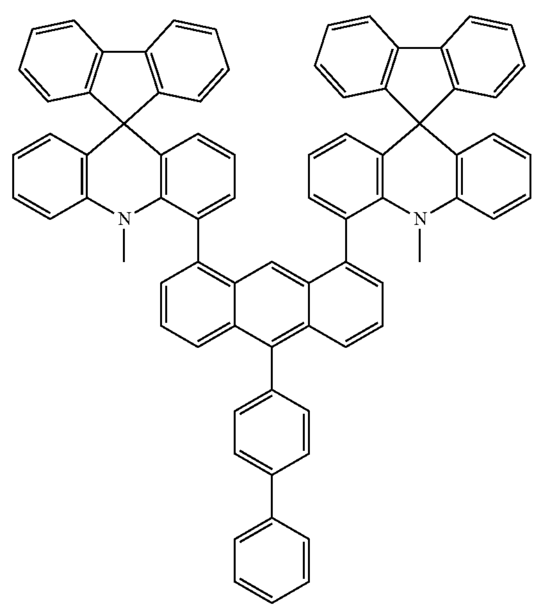

-continued
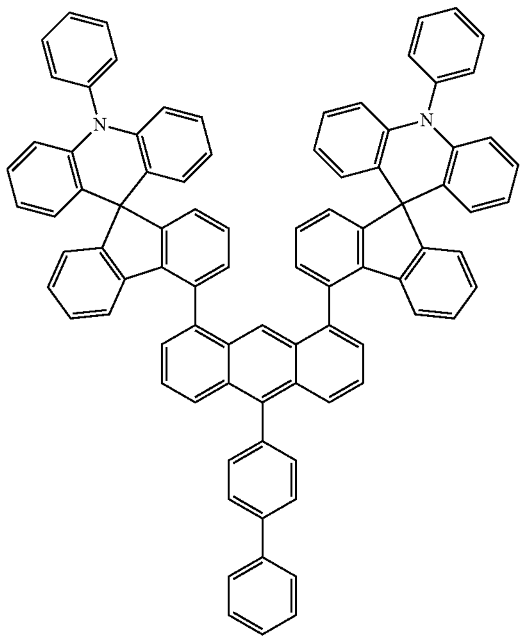
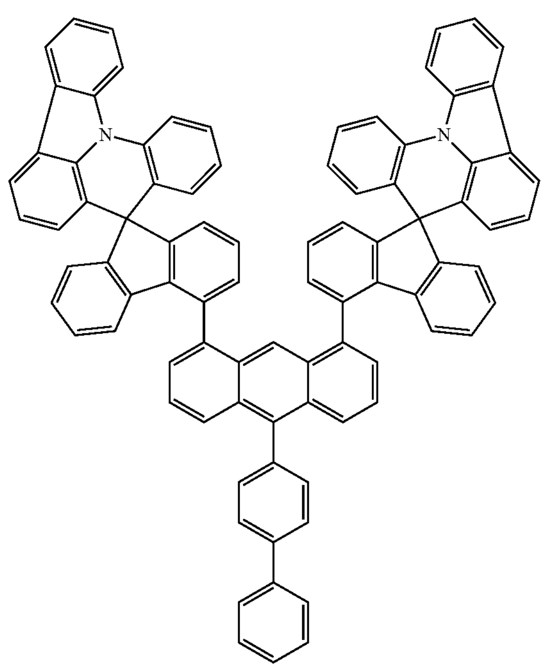
-continued
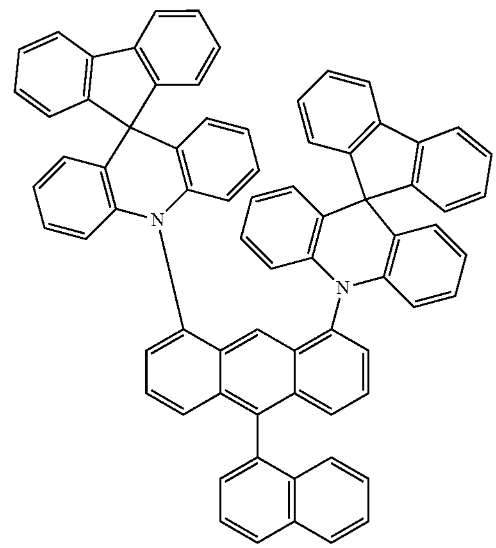
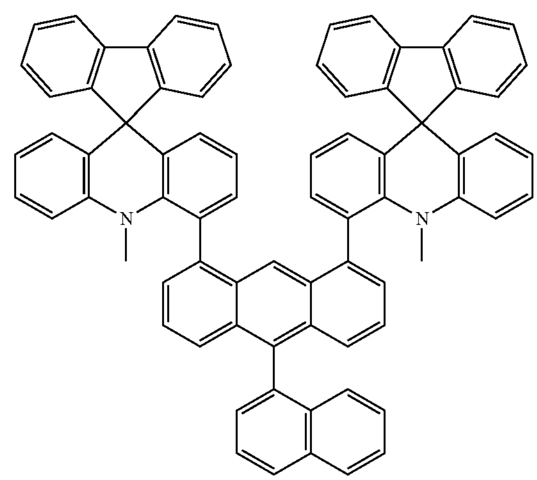
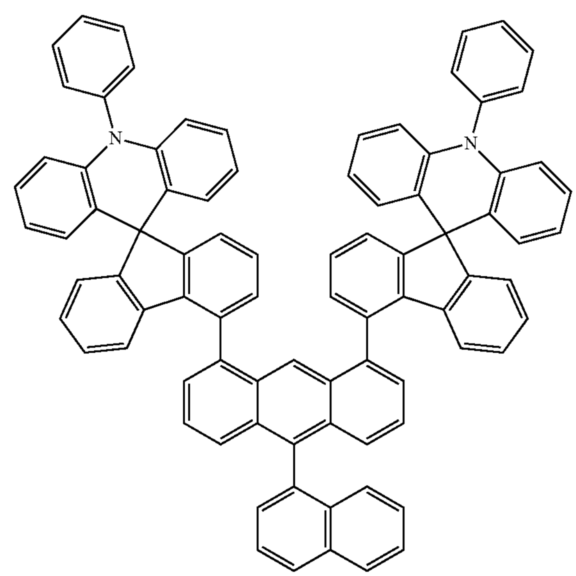

-continued
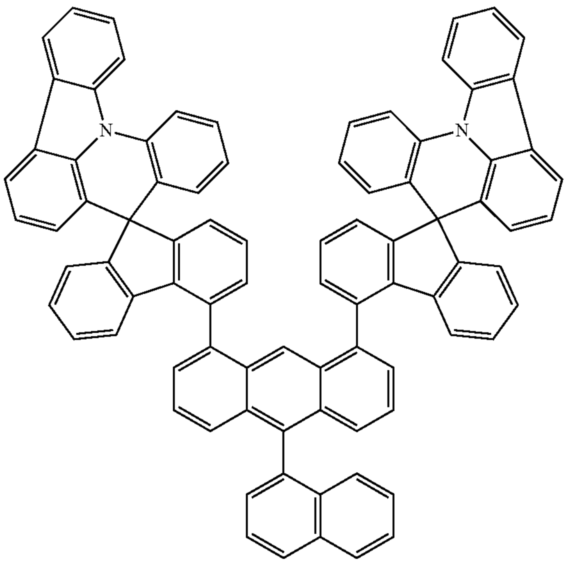
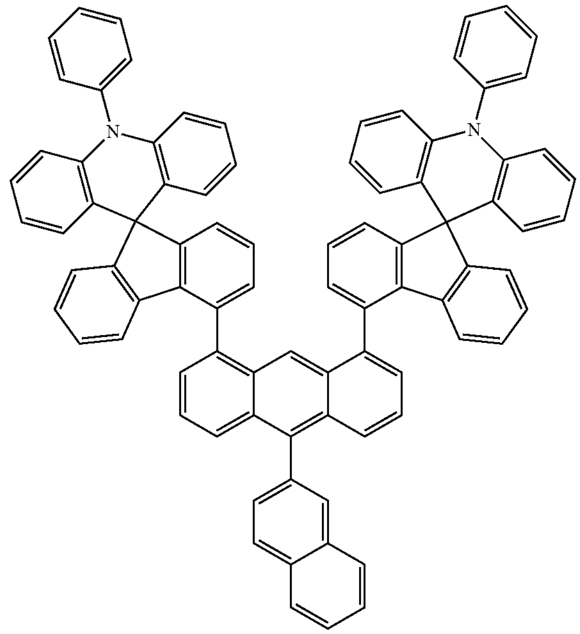
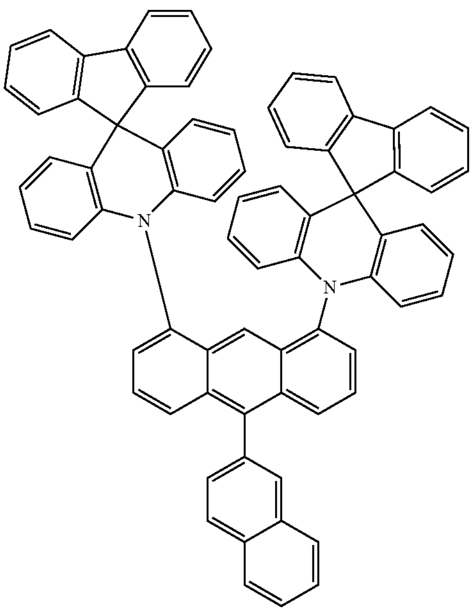
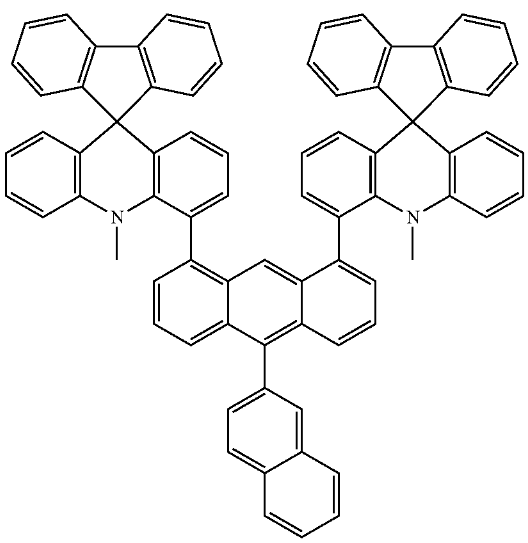
-continued
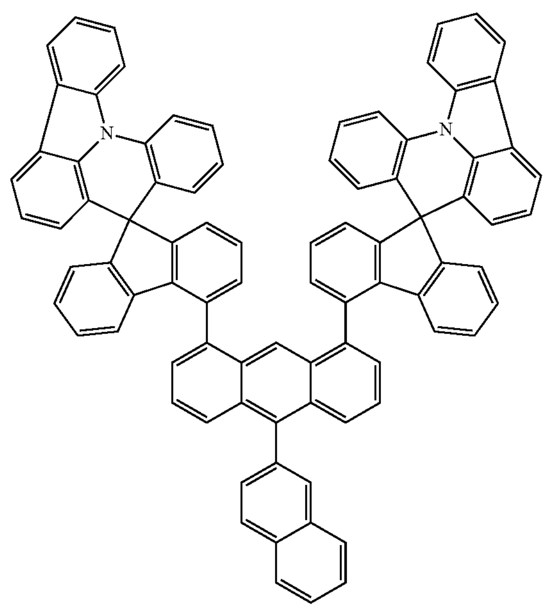

-continued
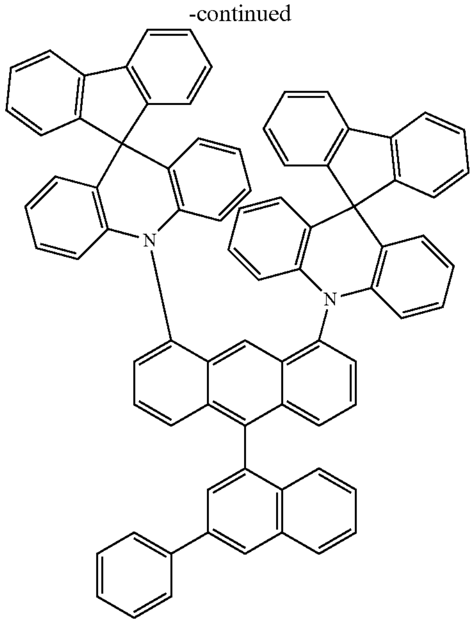
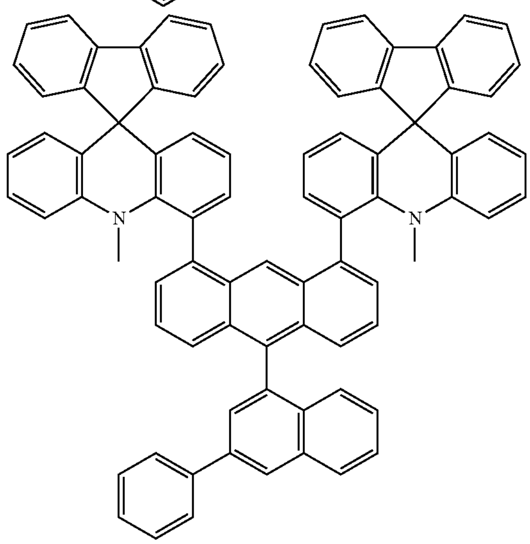
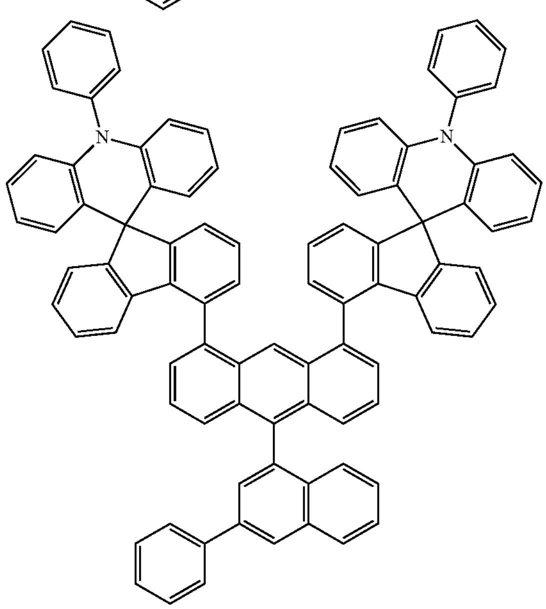
-continued
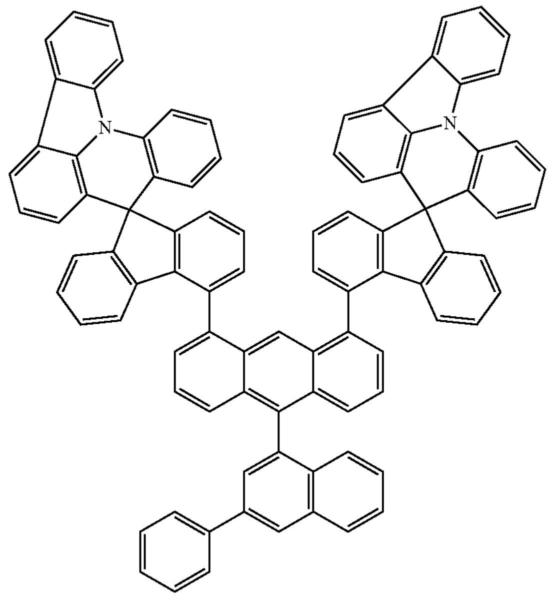
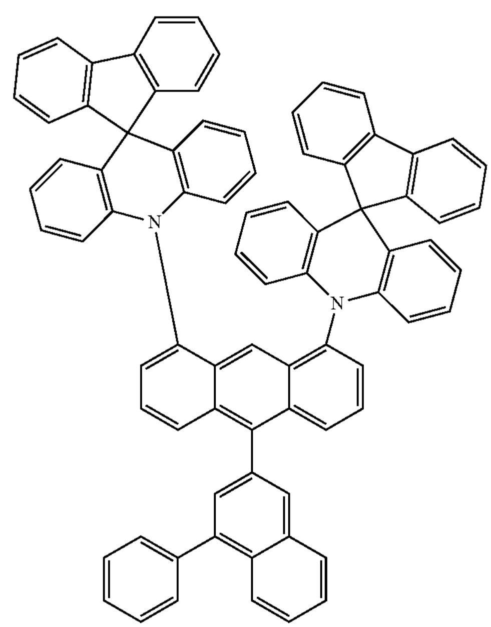

-continued
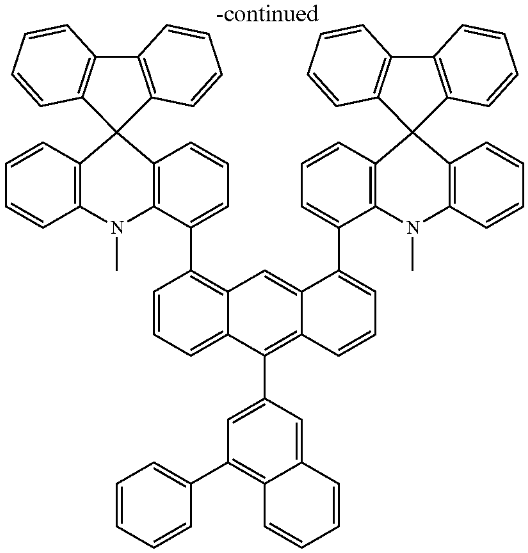
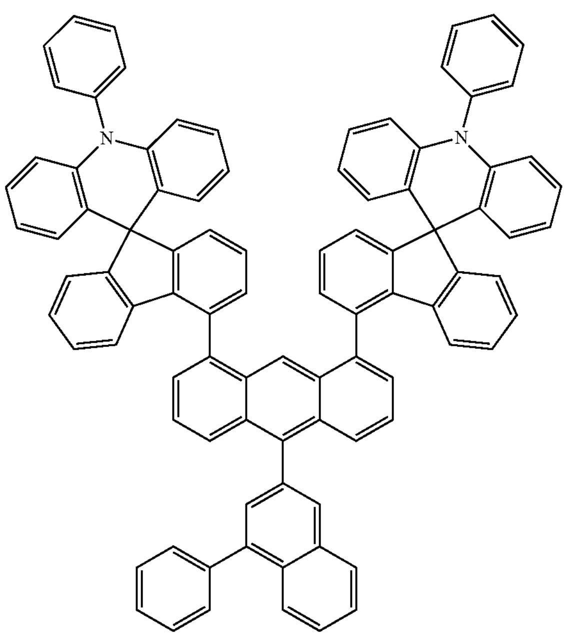
-continued
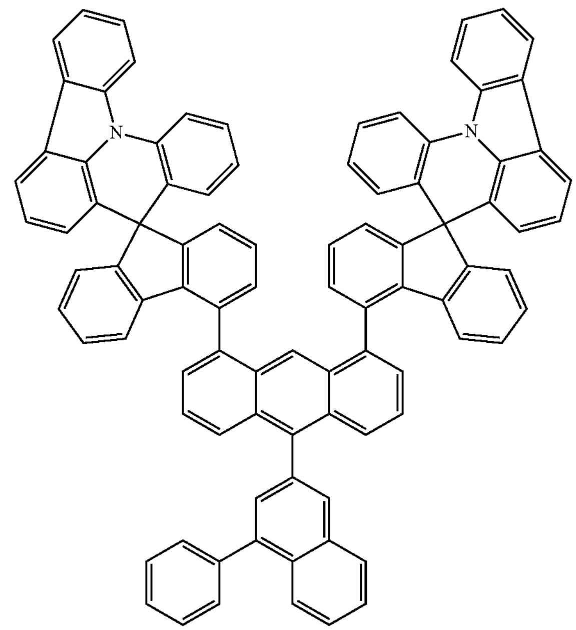
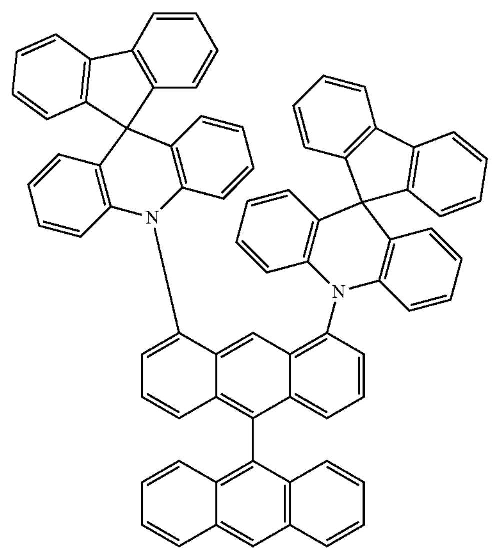
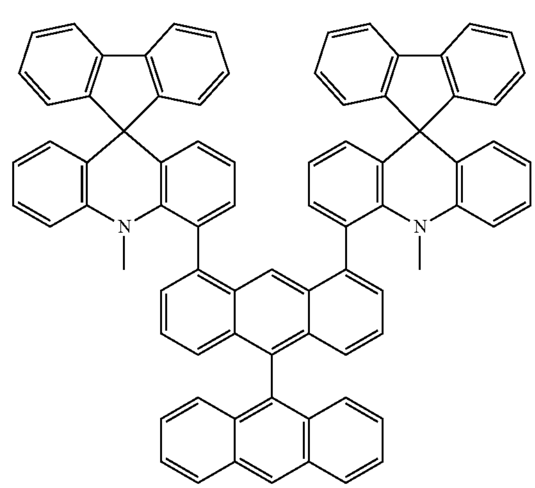

-continued
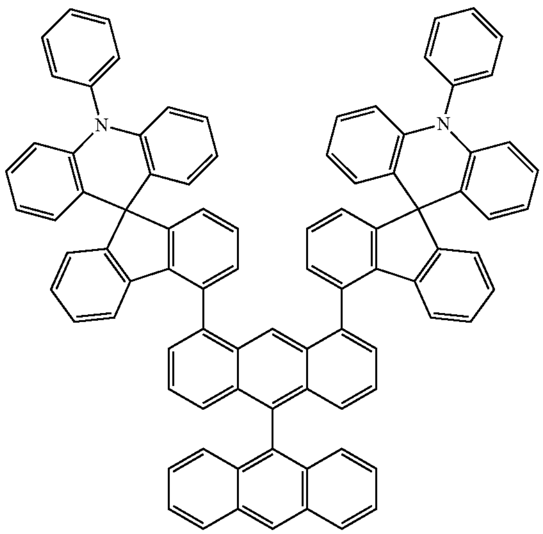
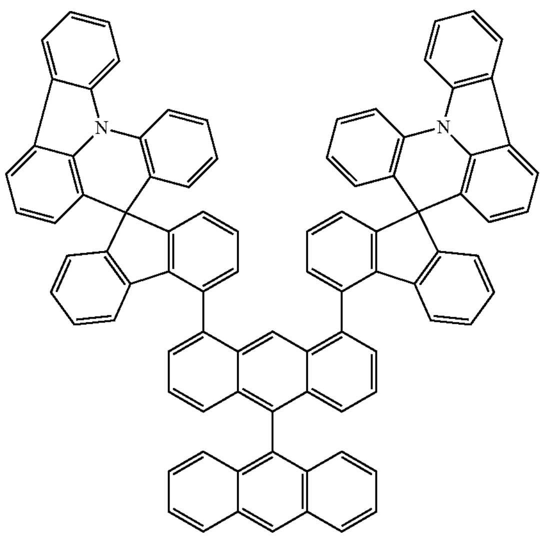
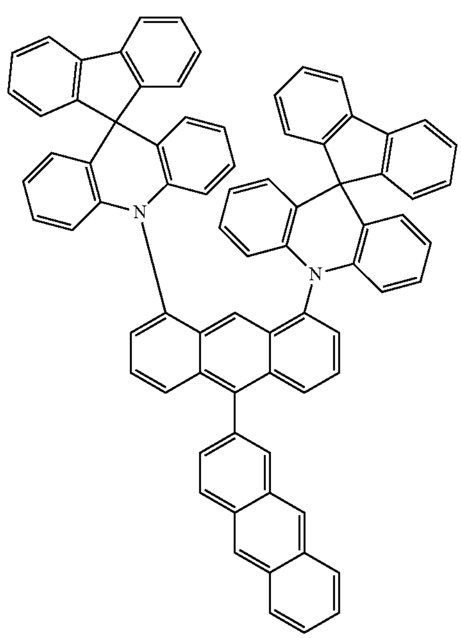
-continued
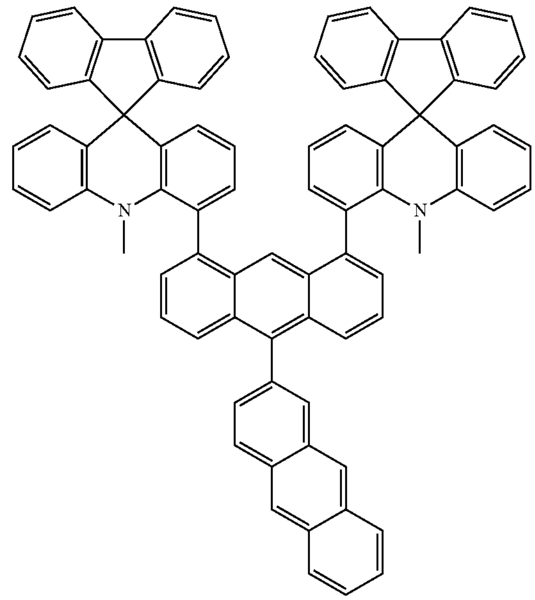
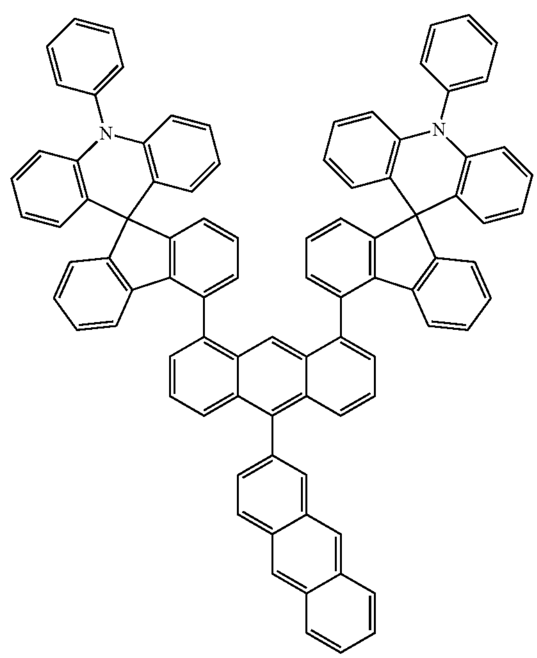

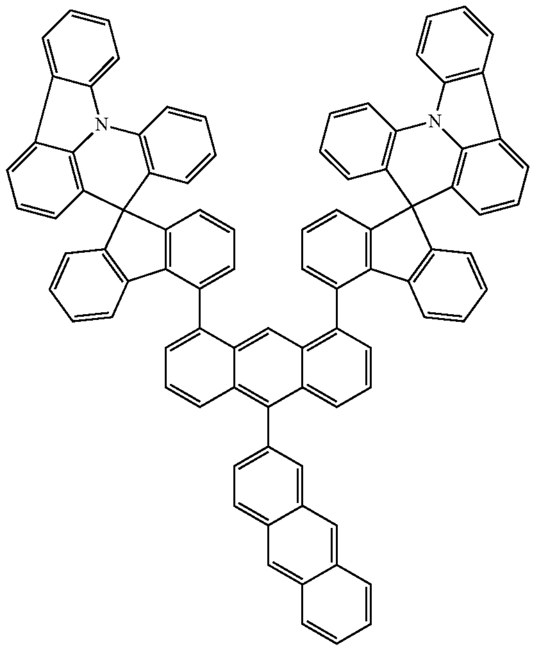
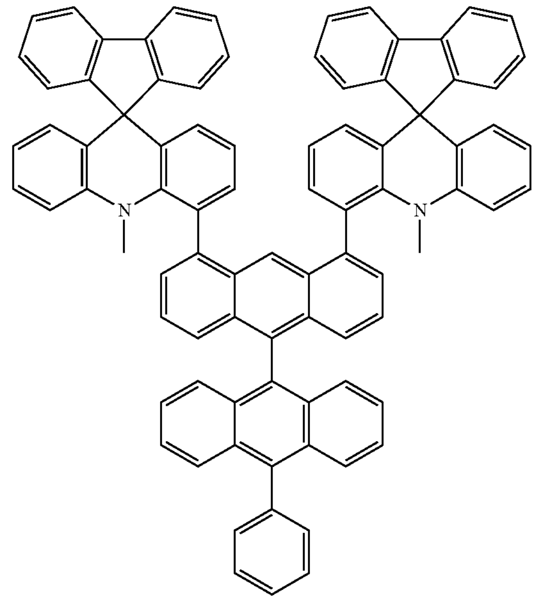
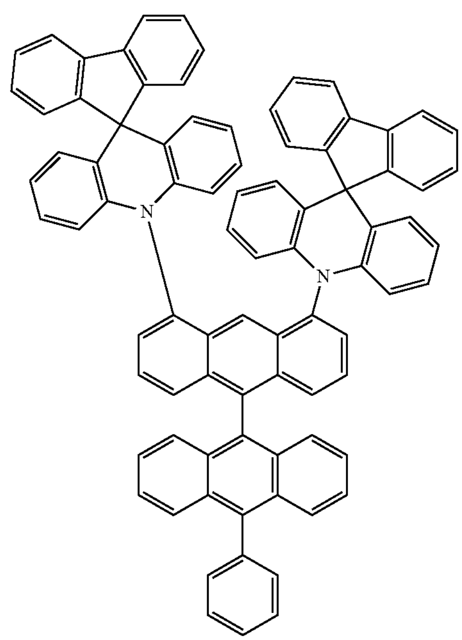
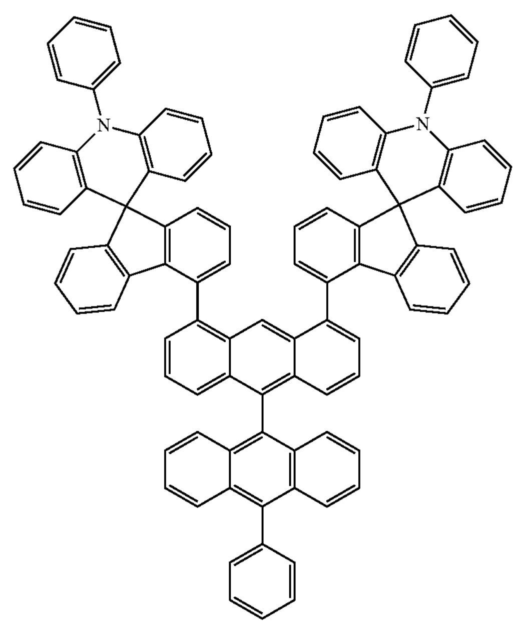

-continued
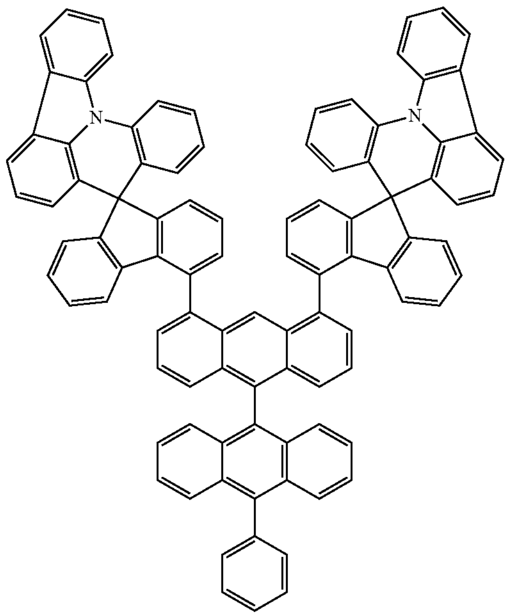
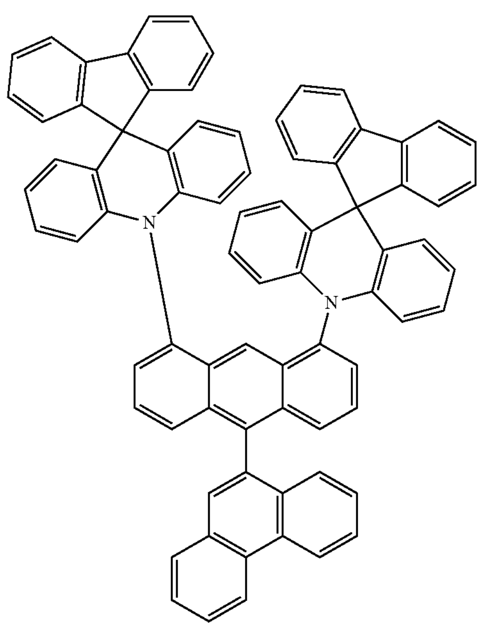
-continued
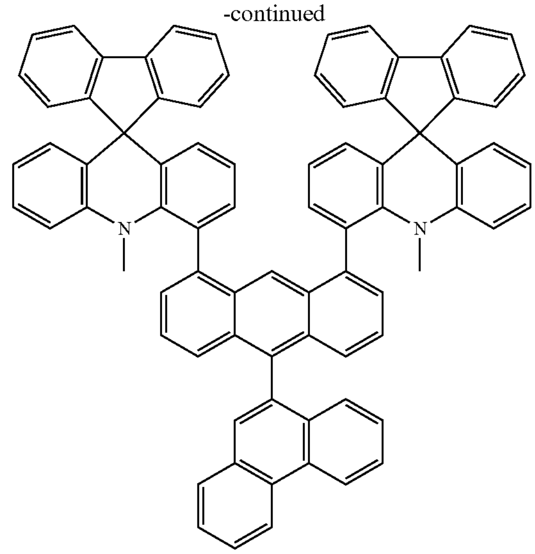
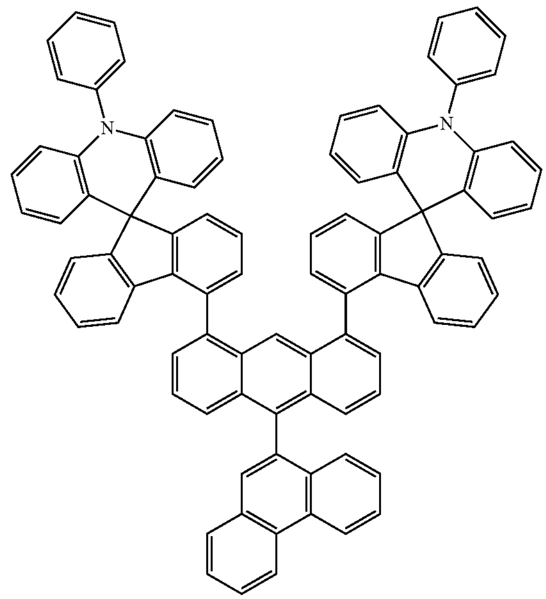
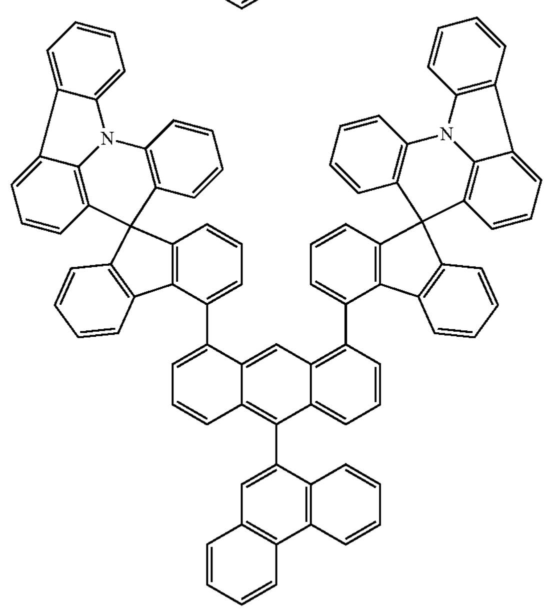

-continued
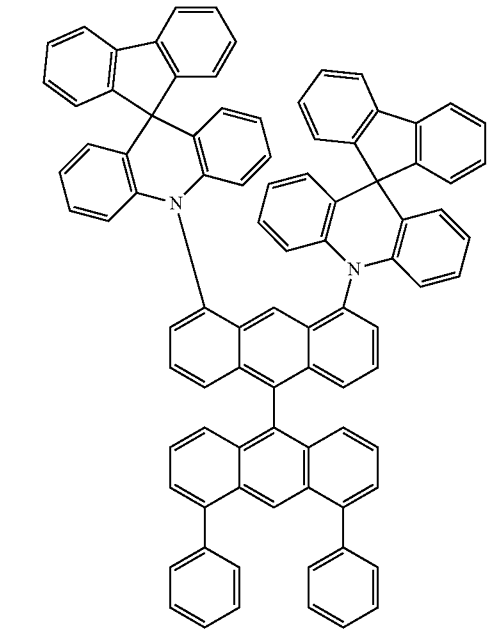
-continued
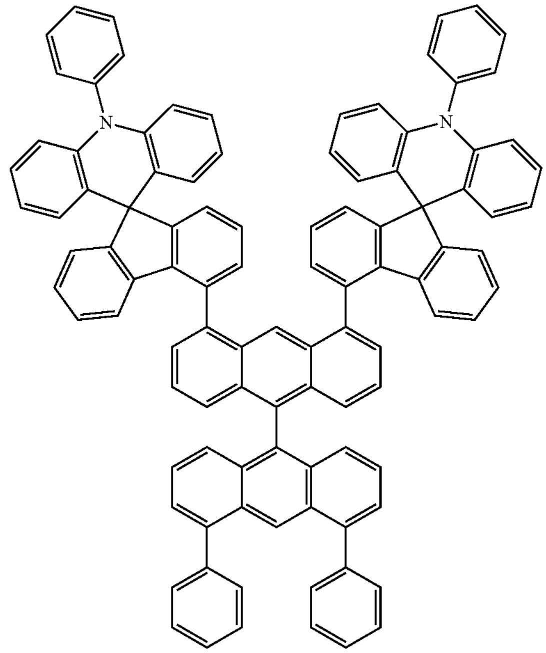
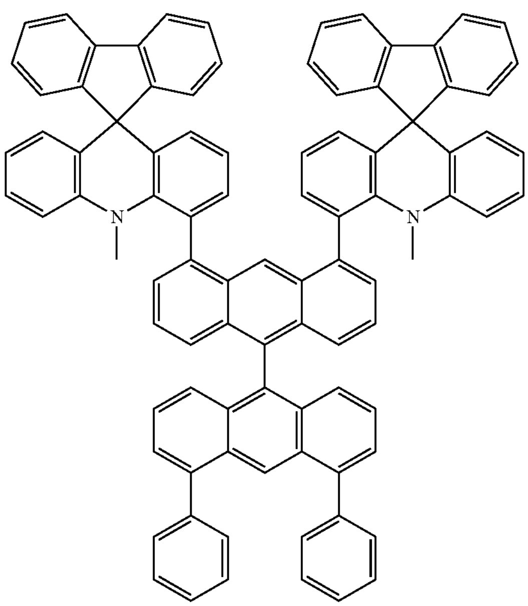
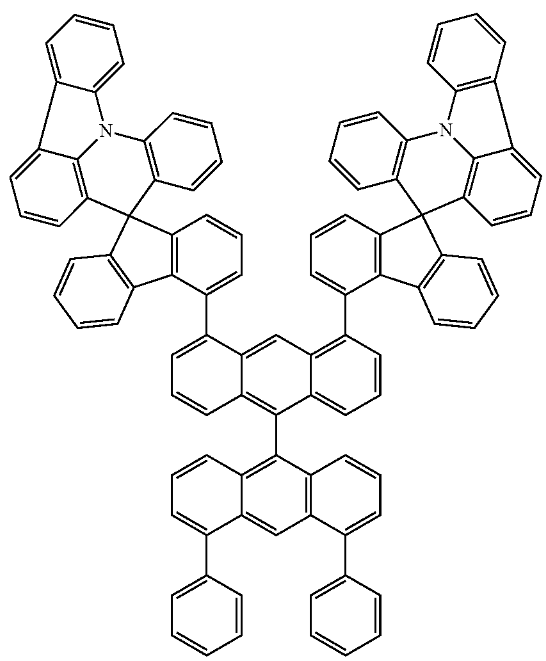

-continued
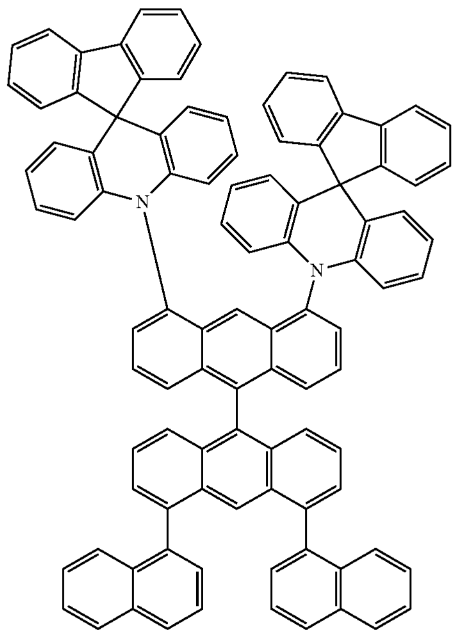
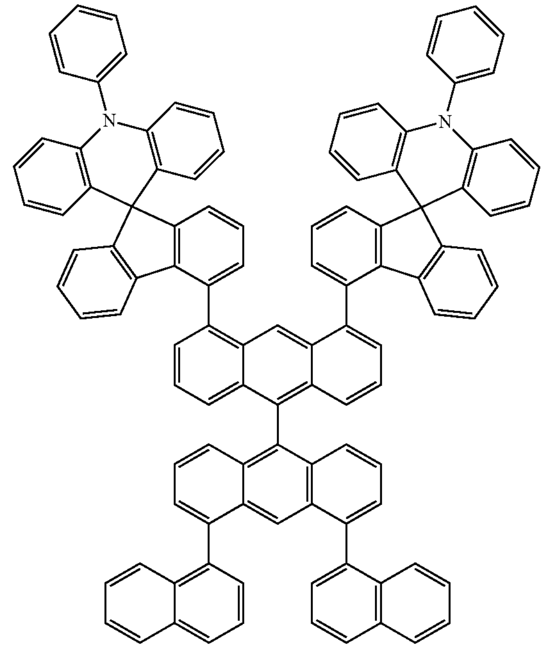
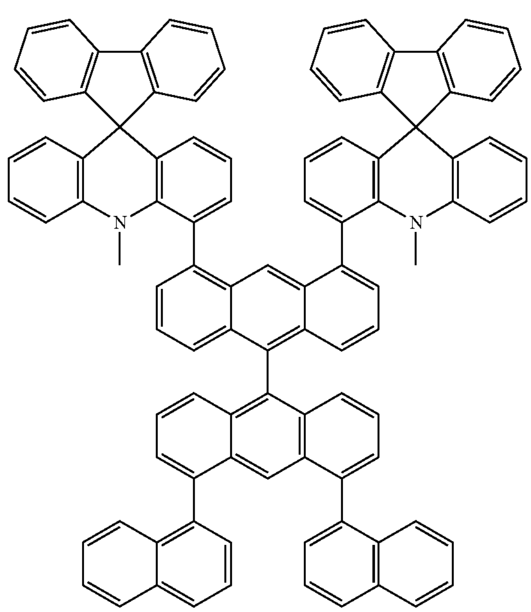
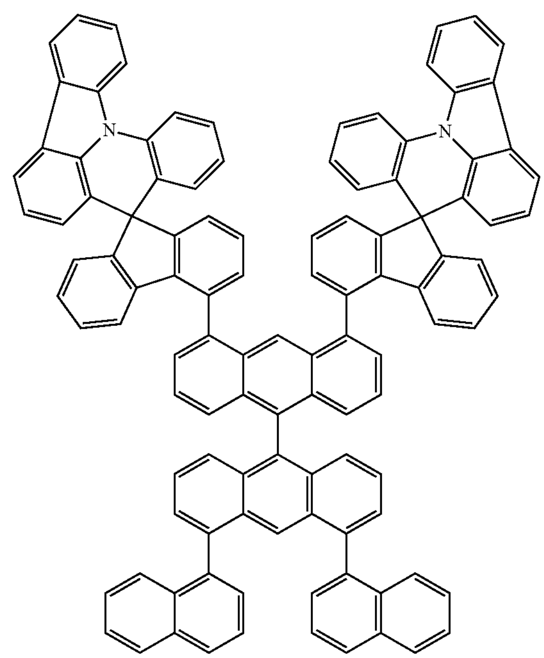
-continued

-continued
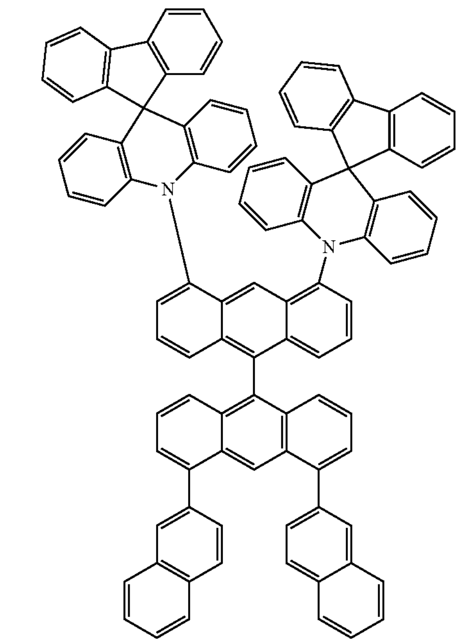
-continued
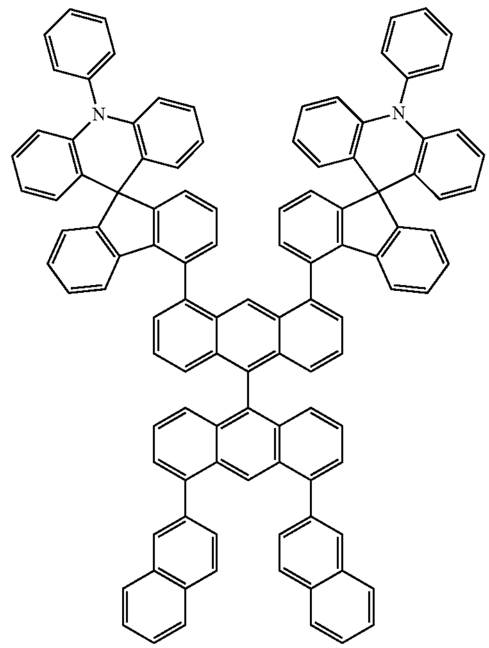
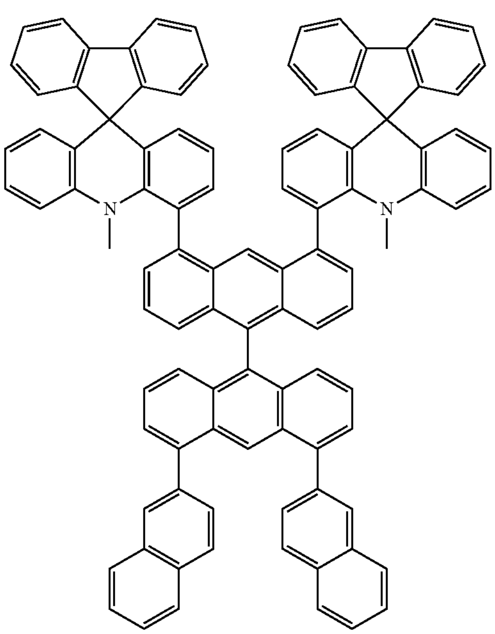
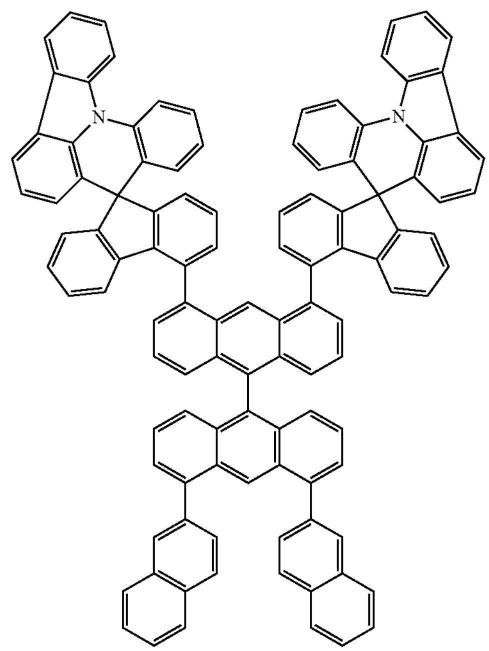

-continued
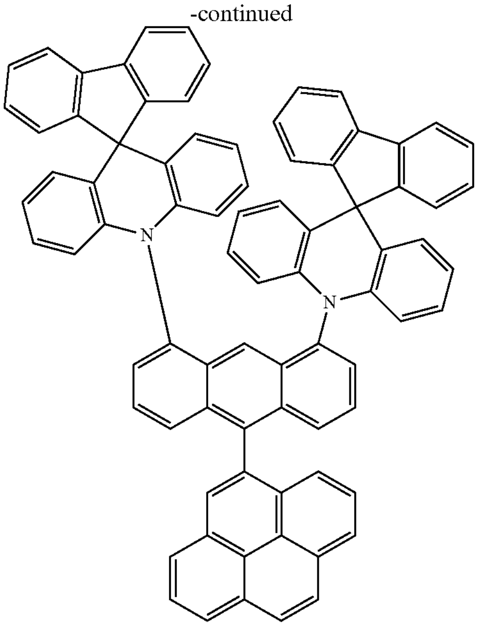
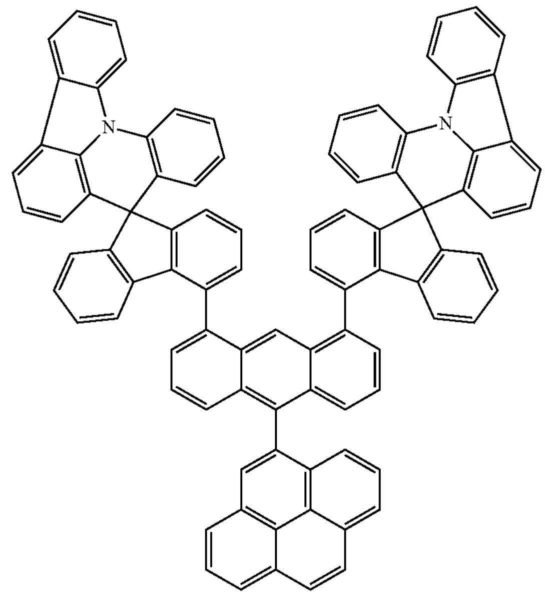 [SMILES: c1ccc2c(c1)-c1c(-c3cccc4c(-c5cc6cccc7ccc8cccc5c8c76)c5cccc(-c6cccc7c6-c6ccccc6C76c7ccccc7-n7c8ccccc8c8cccc6c87)c5cc34)cccc1C21c2ccccc2-n2c3ccccc3c3cccc1c32]
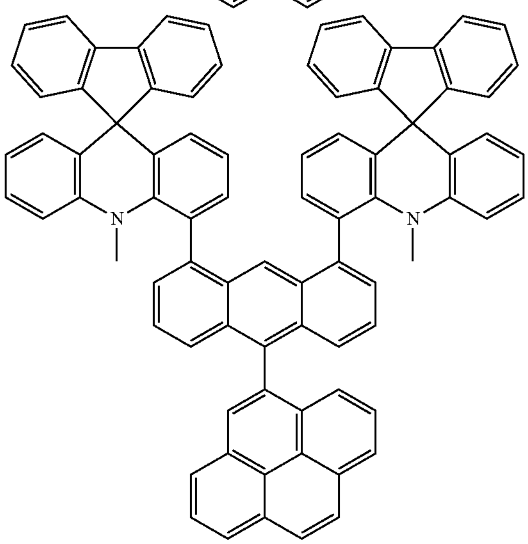
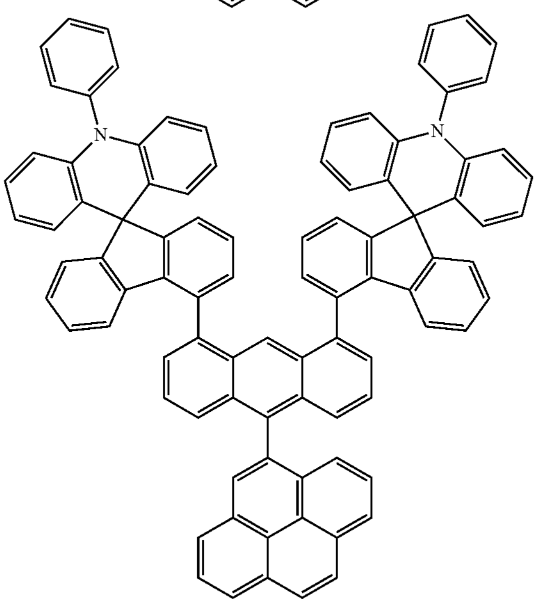
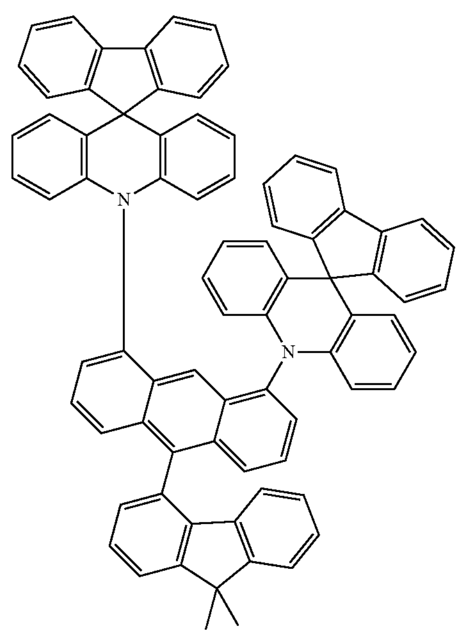

-continued
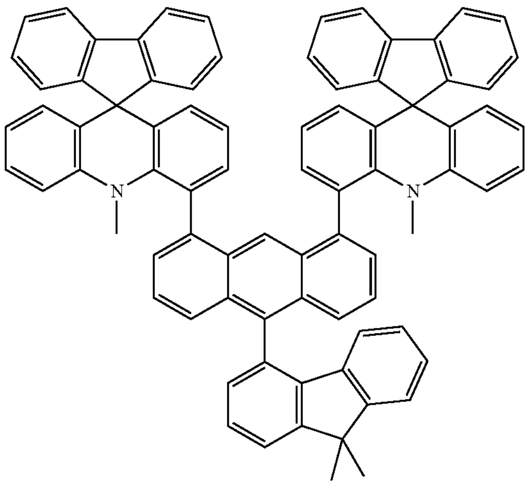
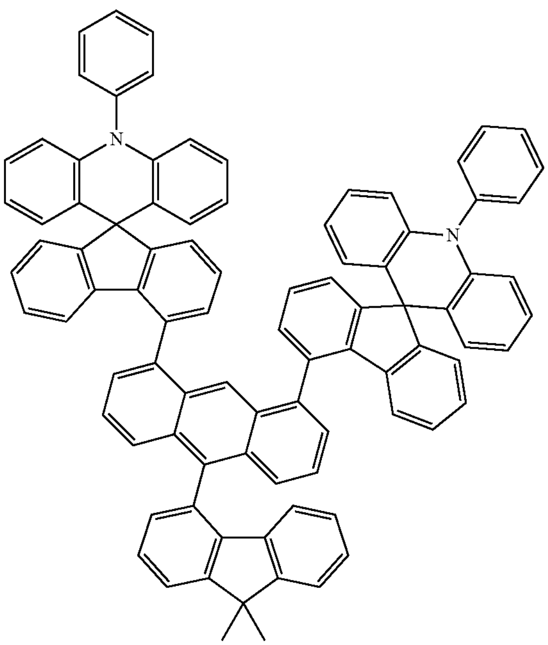
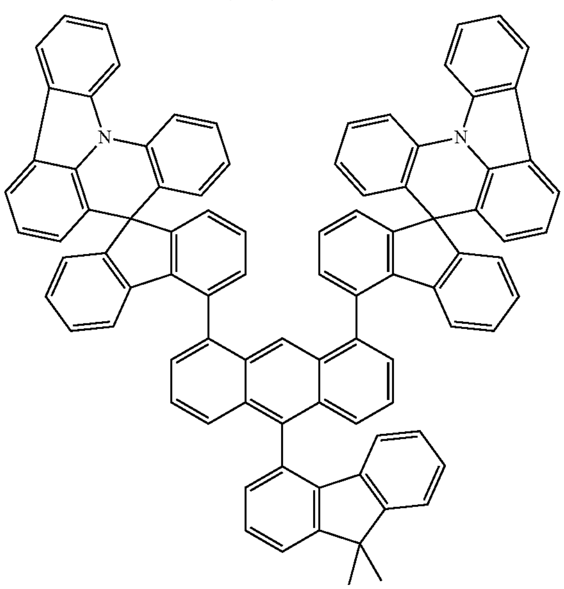
-continued
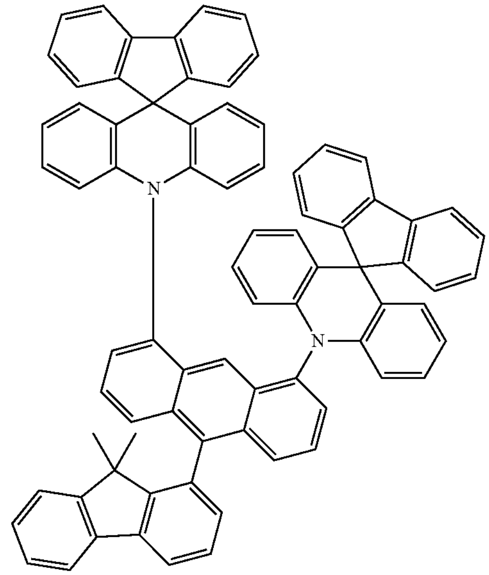
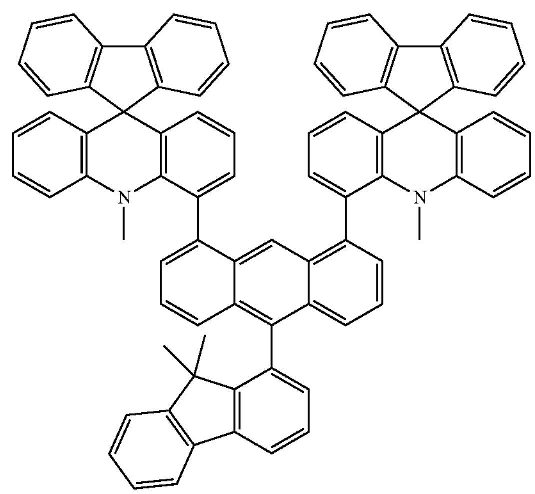
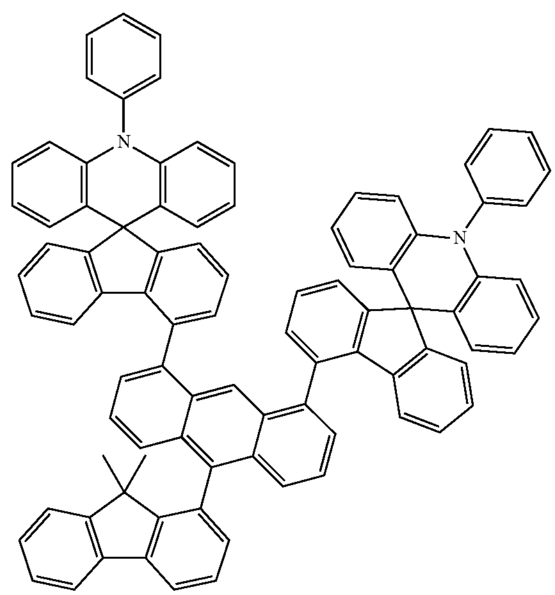

-continued
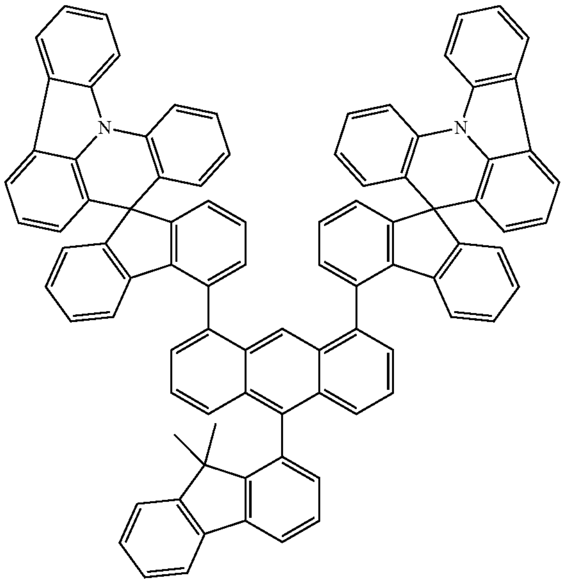
-continued
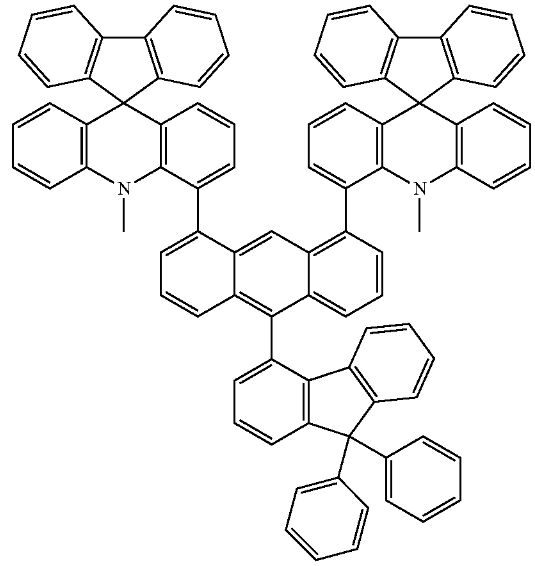
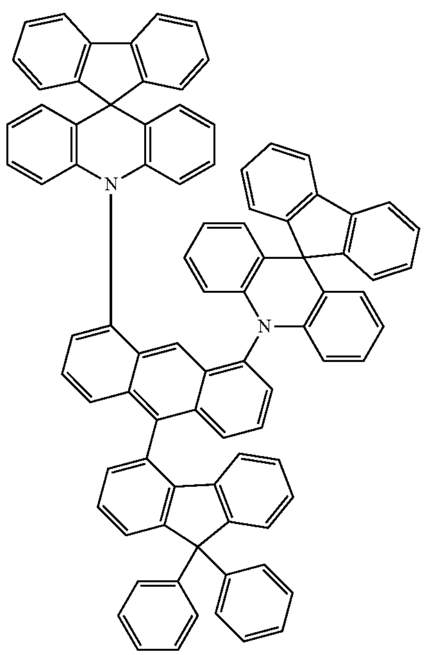
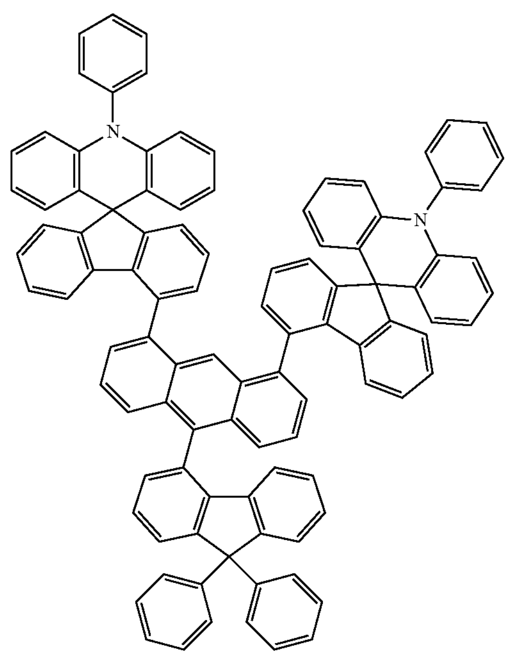

-continued
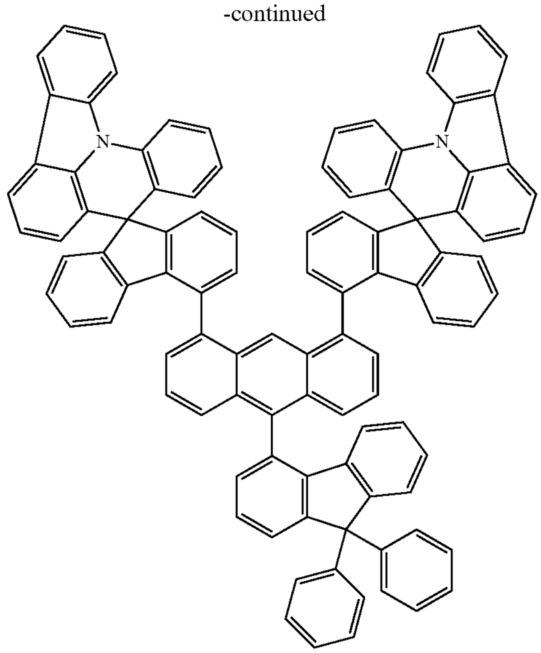
-continued
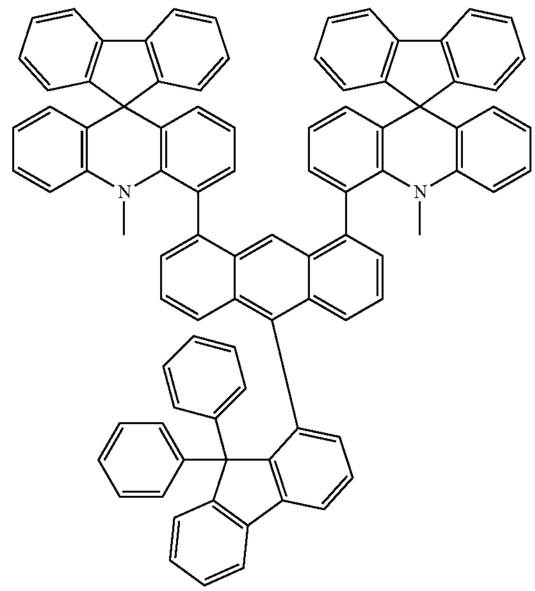
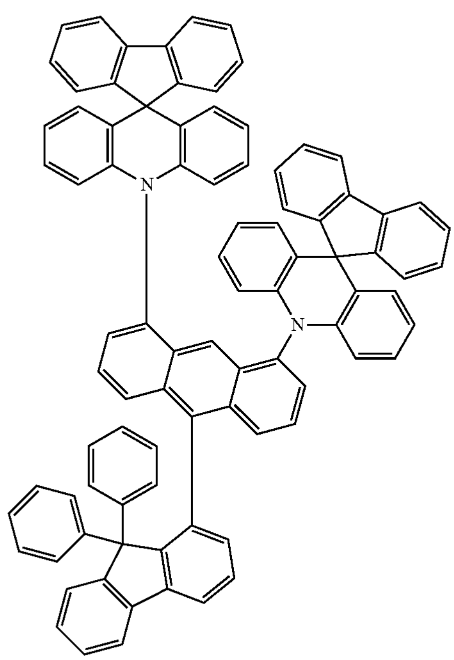
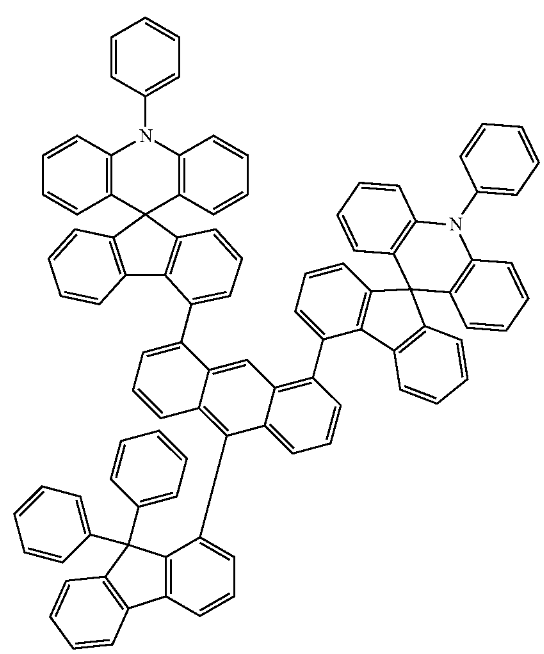

-continued
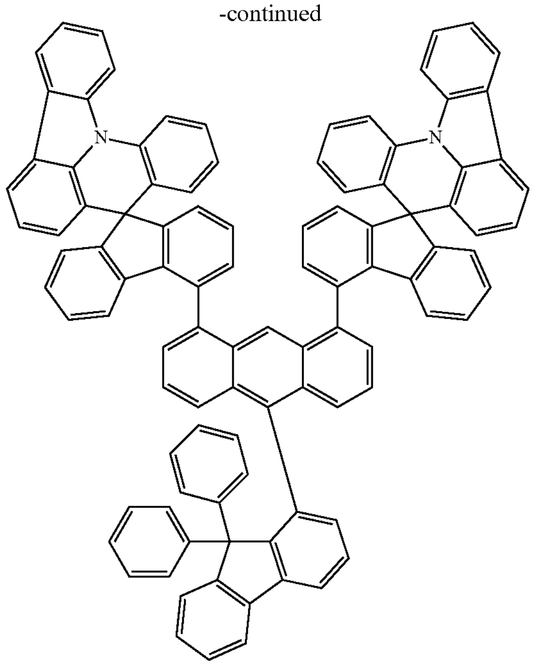
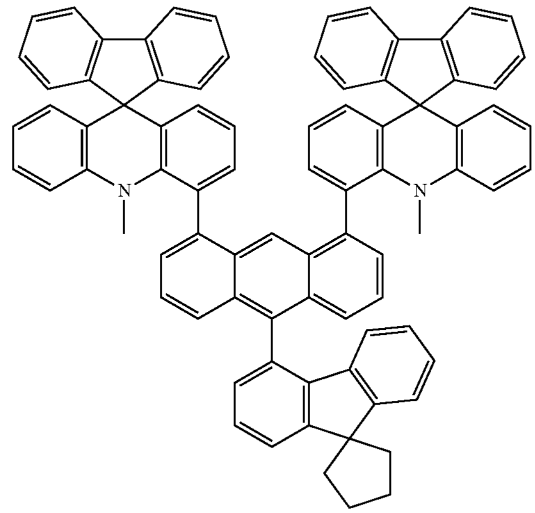
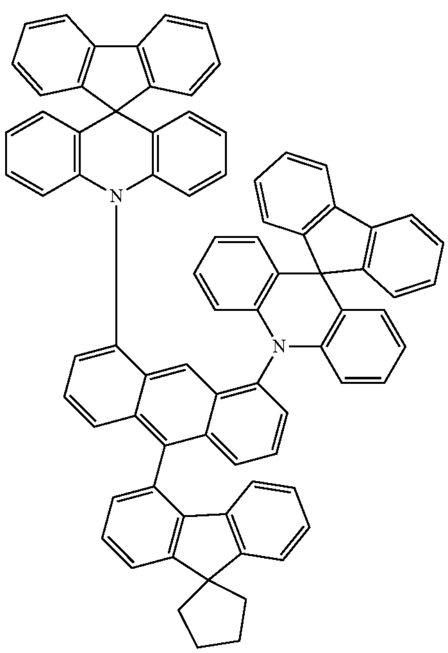
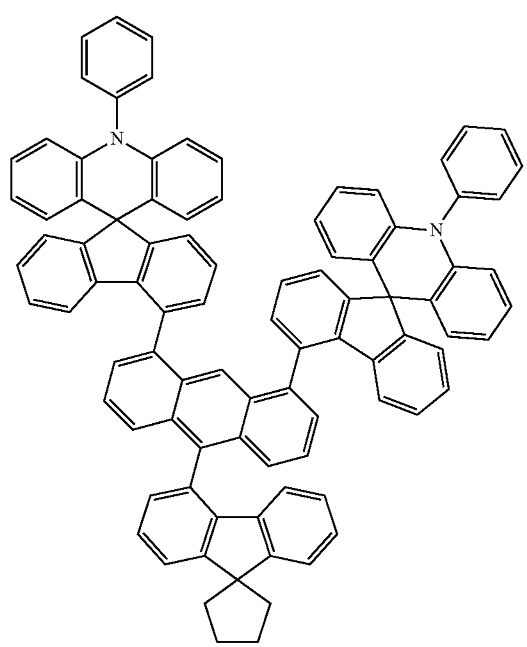

-continued
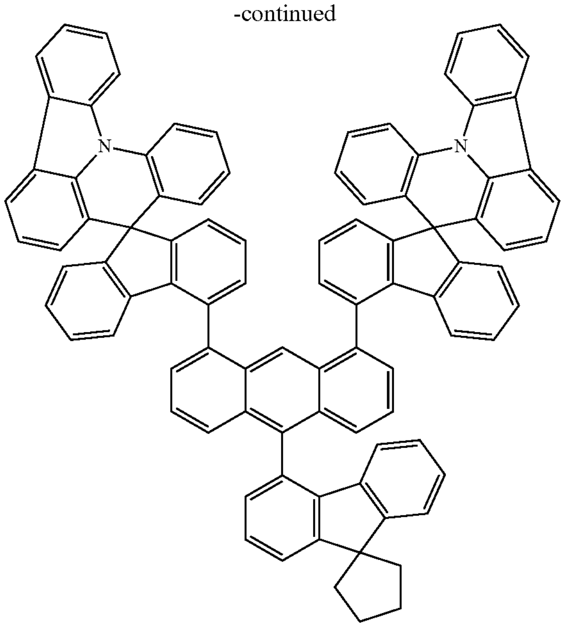
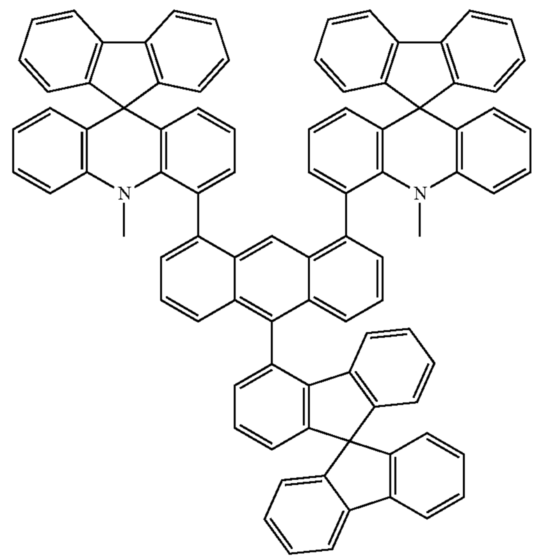
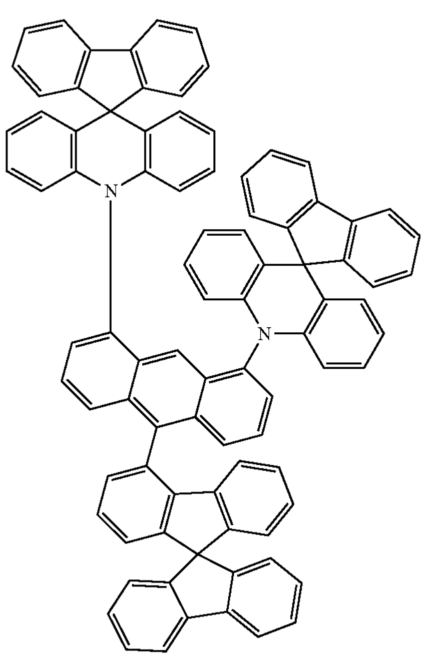
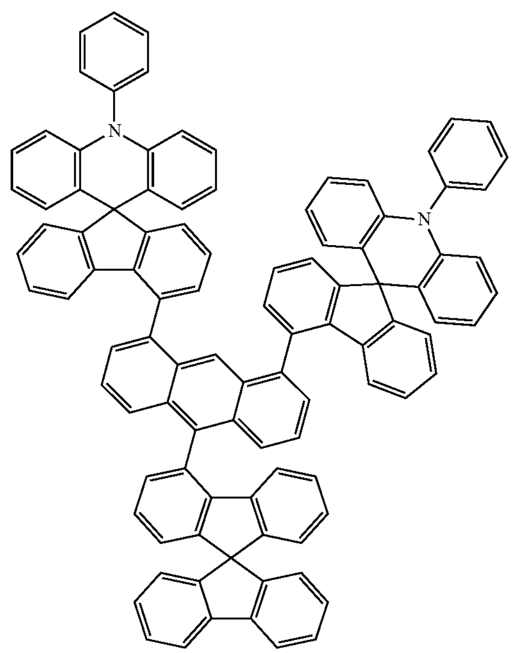

-continued
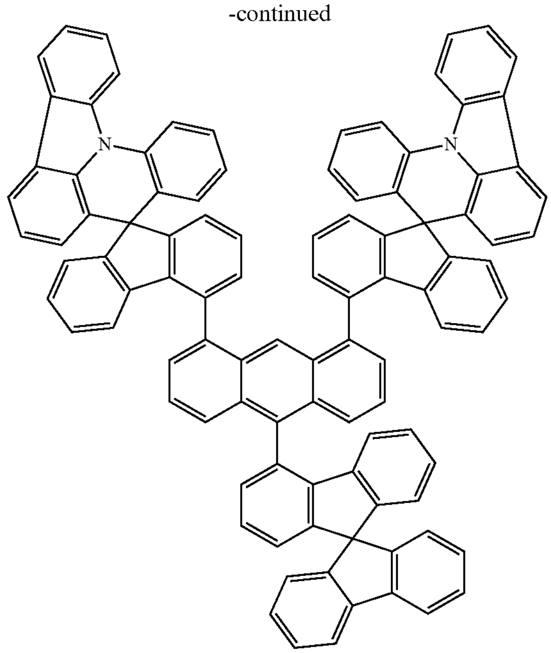
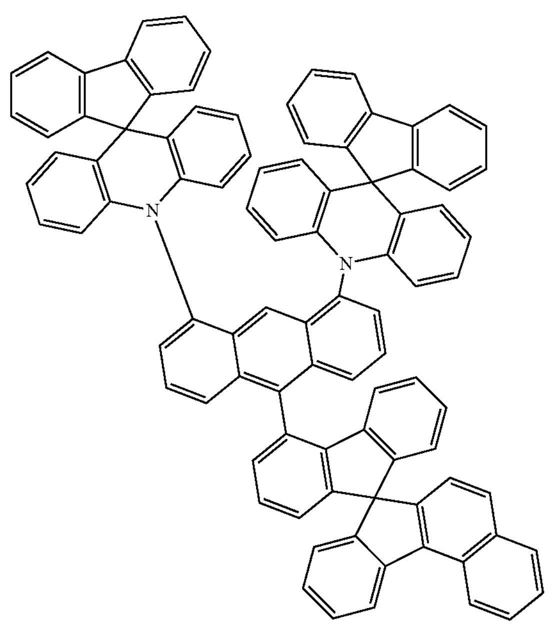
-continued
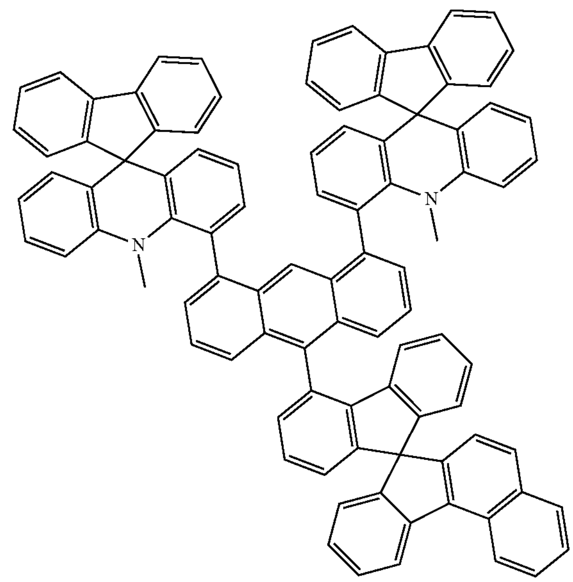
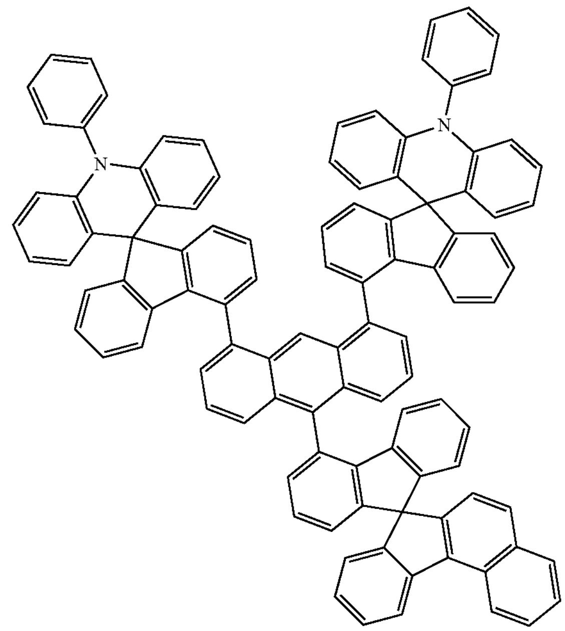

-continued
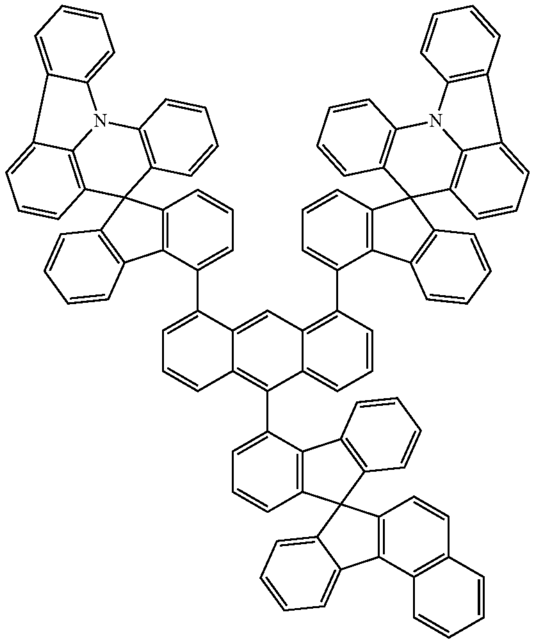
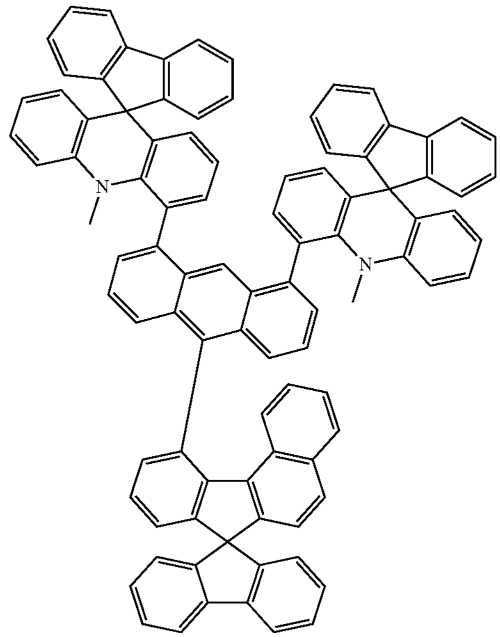
-continued
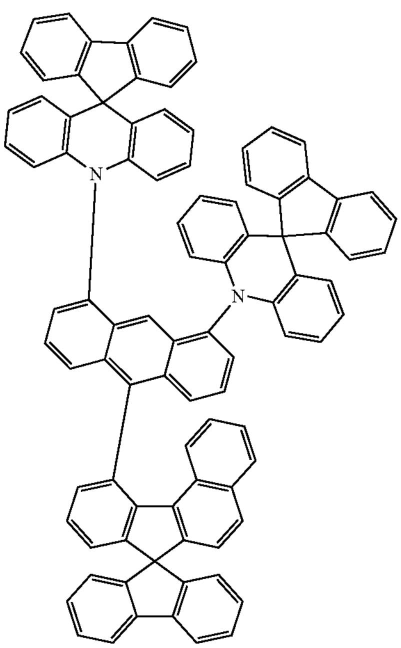
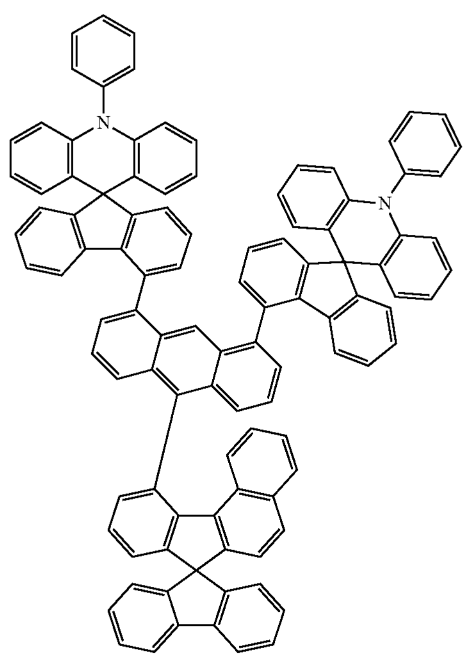

-continued
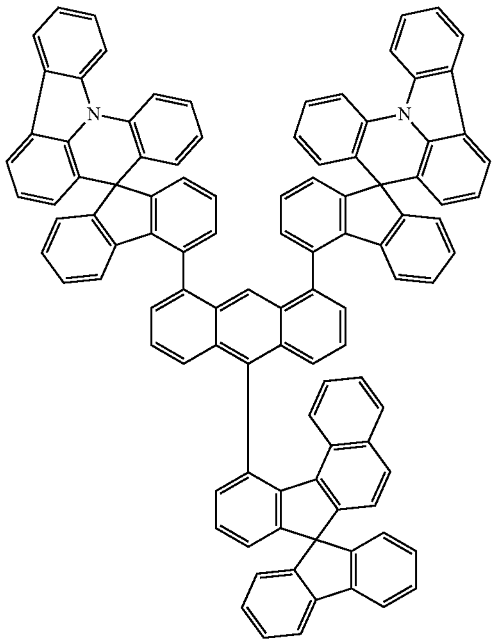
-continued
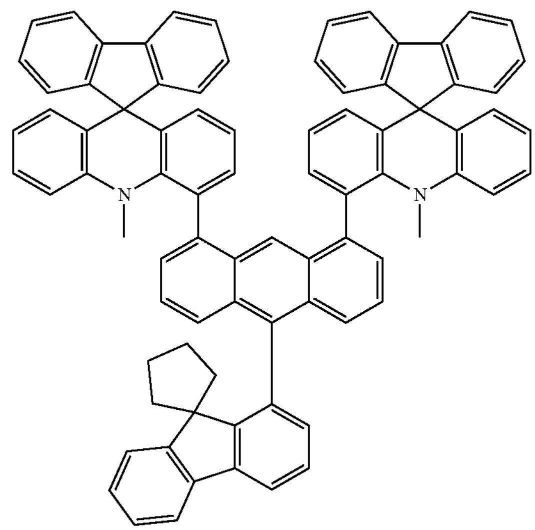
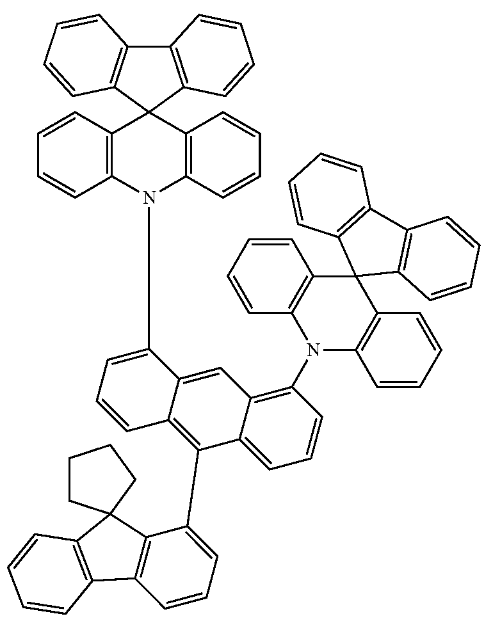
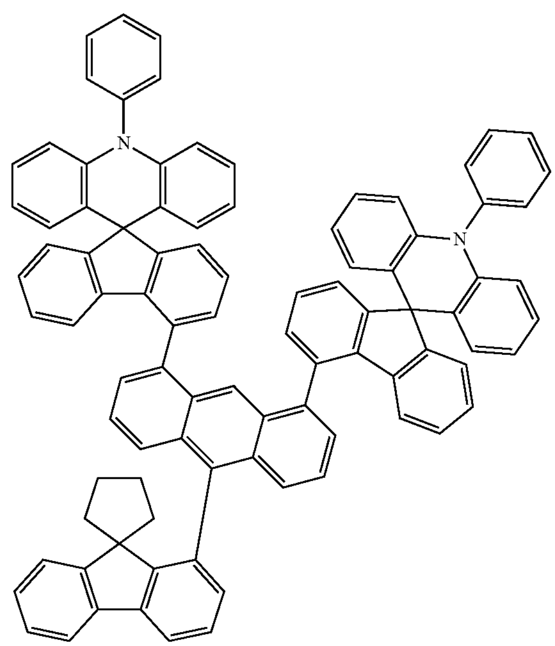

-continued
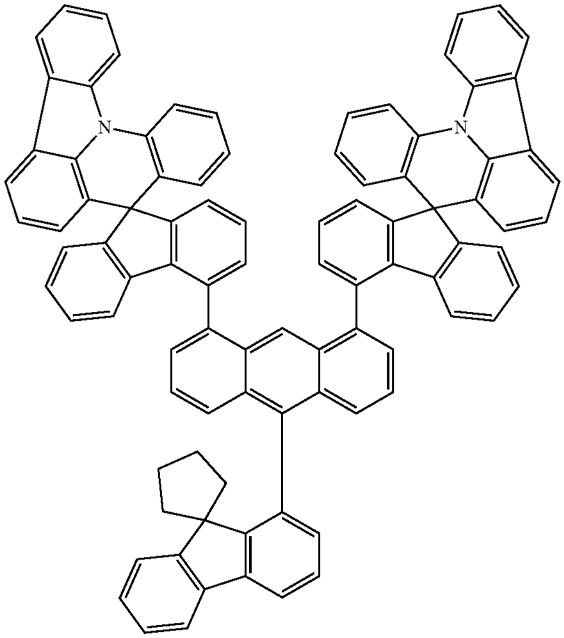
-continued
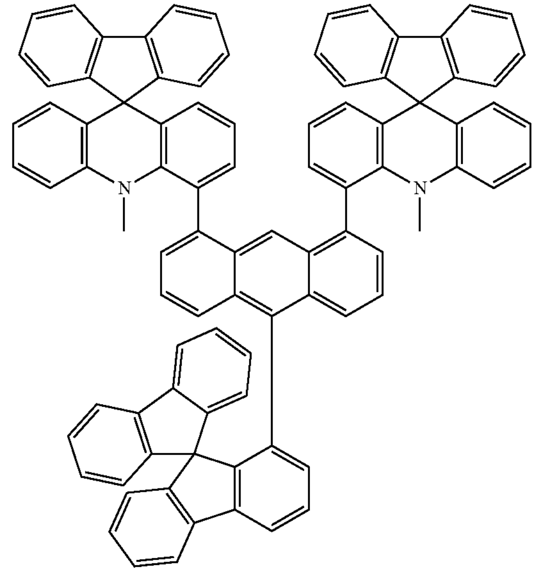
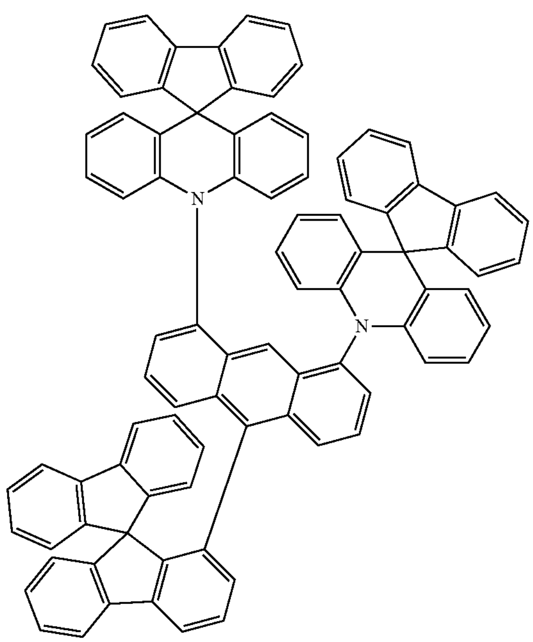
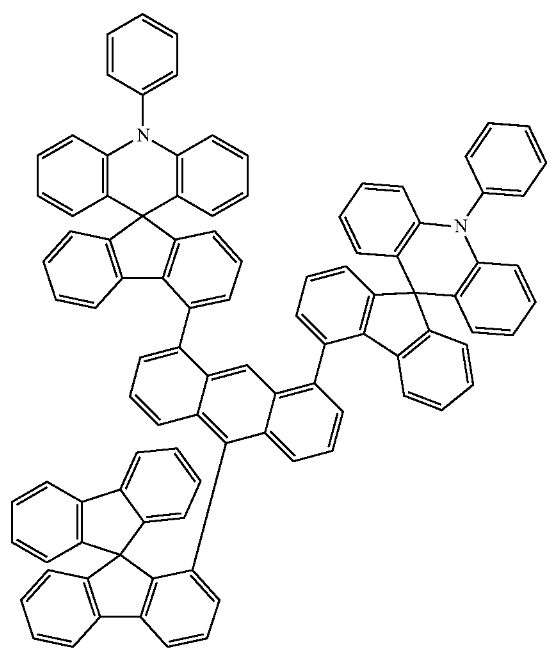

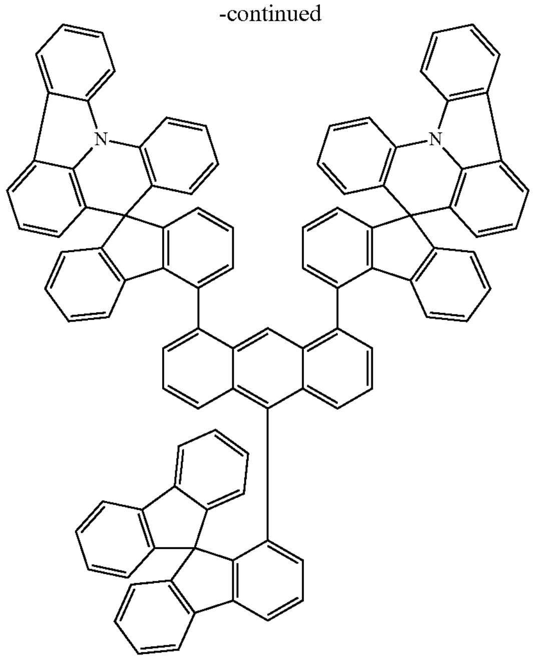
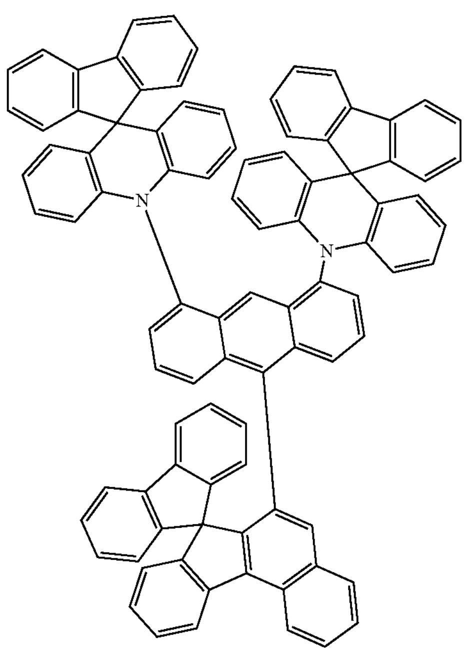
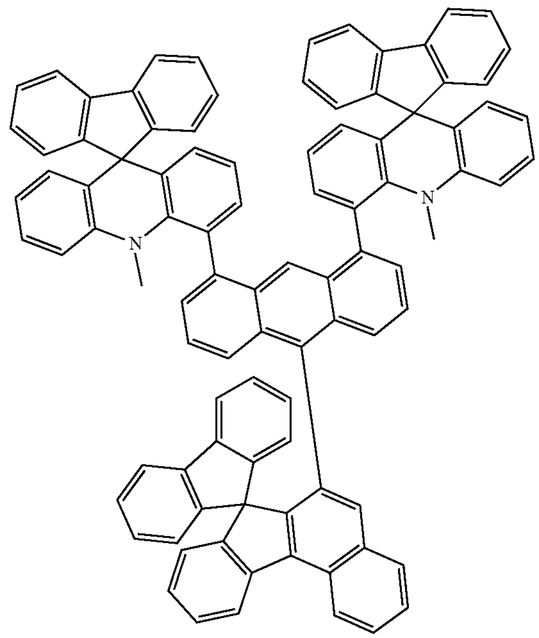
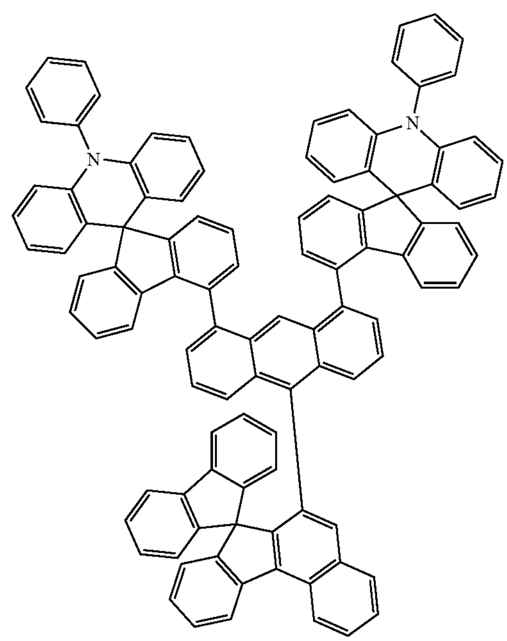

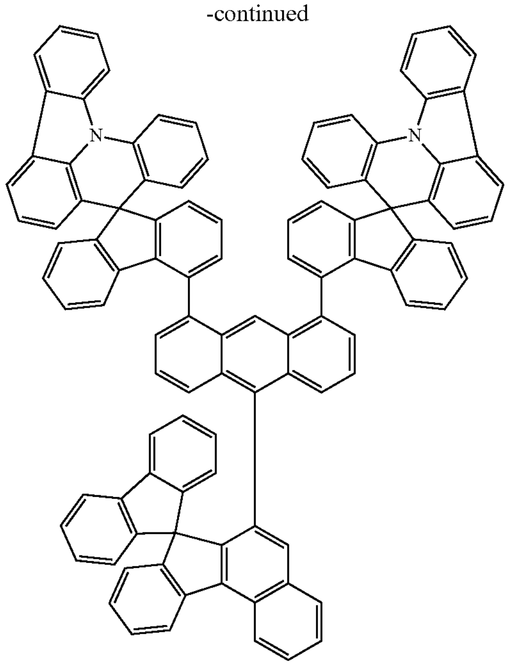
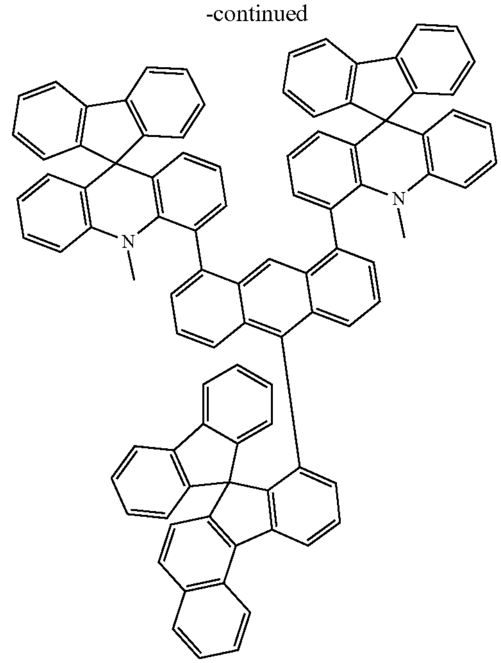
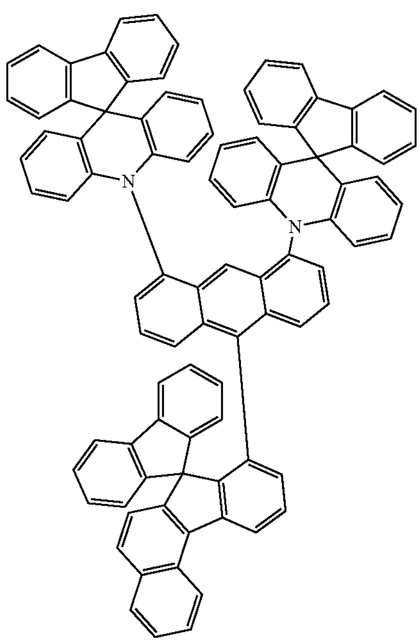
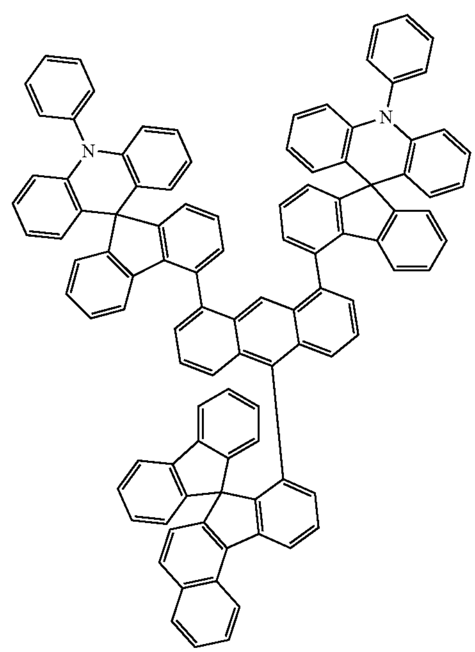

-continued
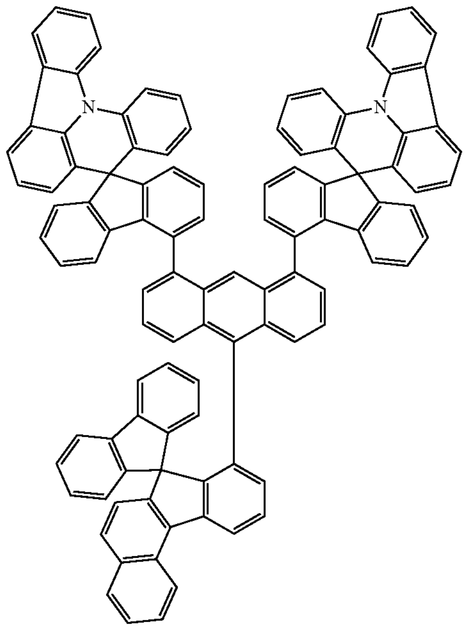
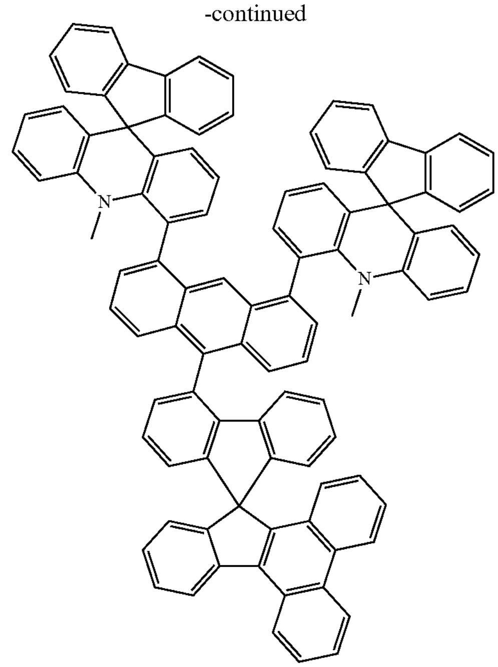
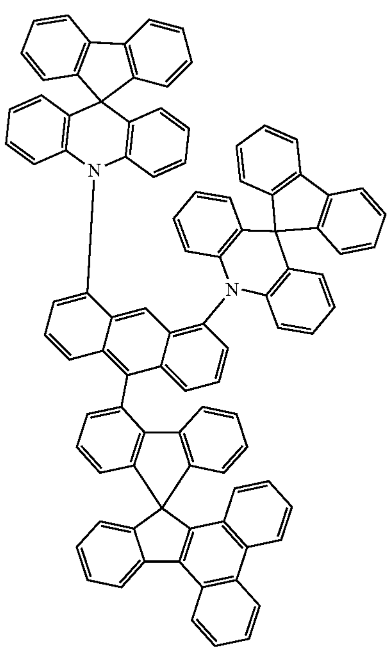
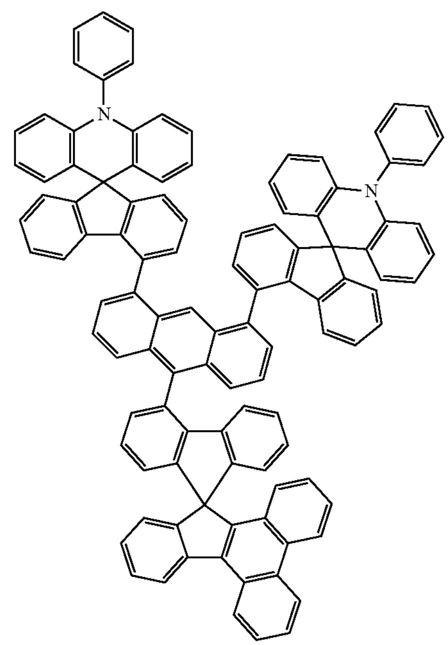

-continued
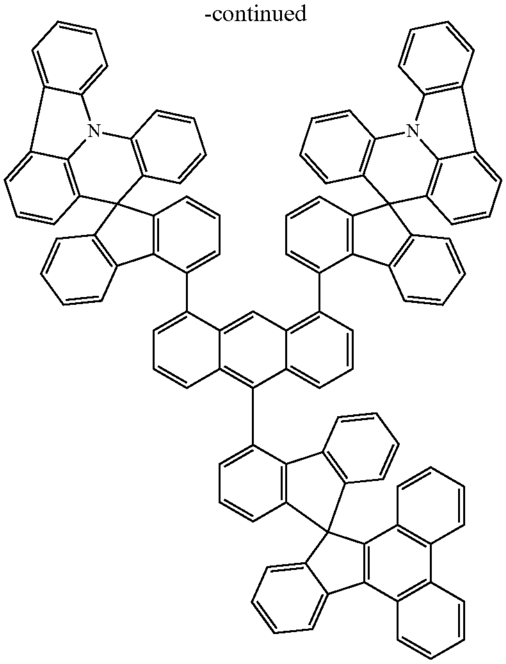
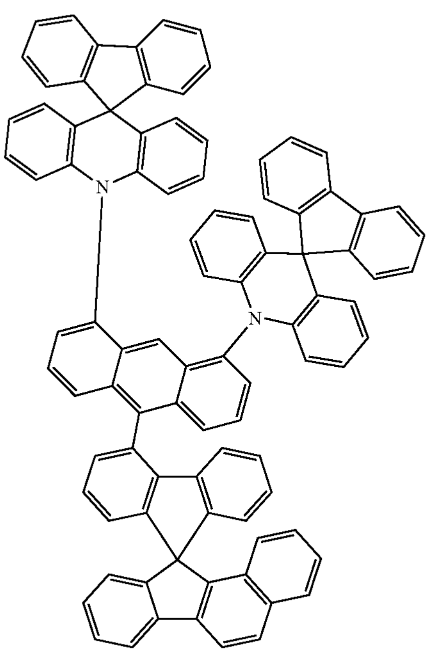
-continued
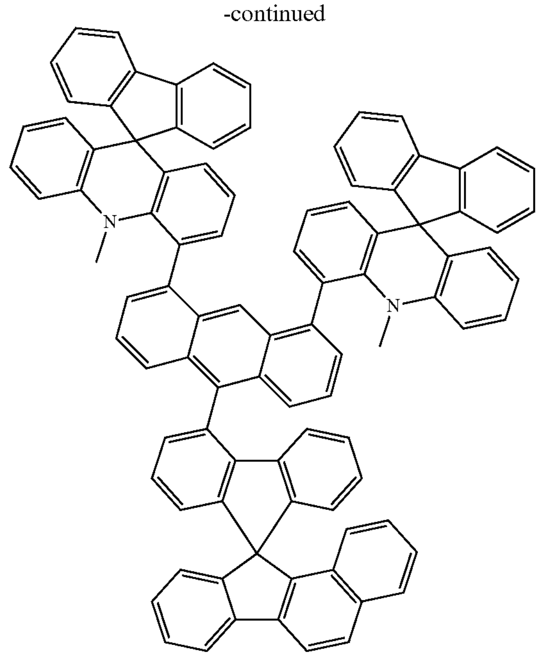
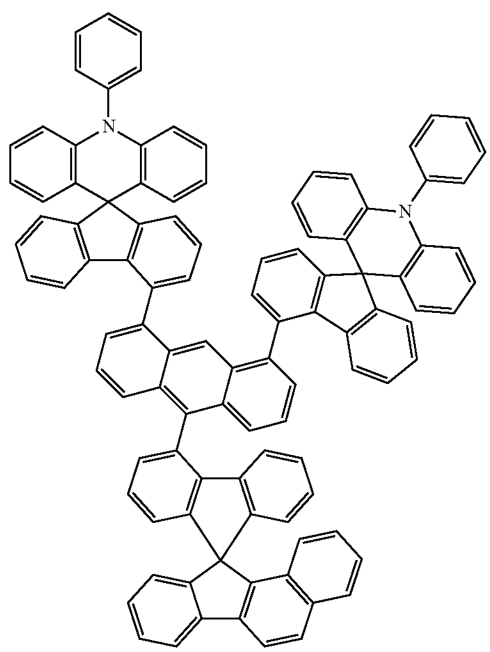

-continued
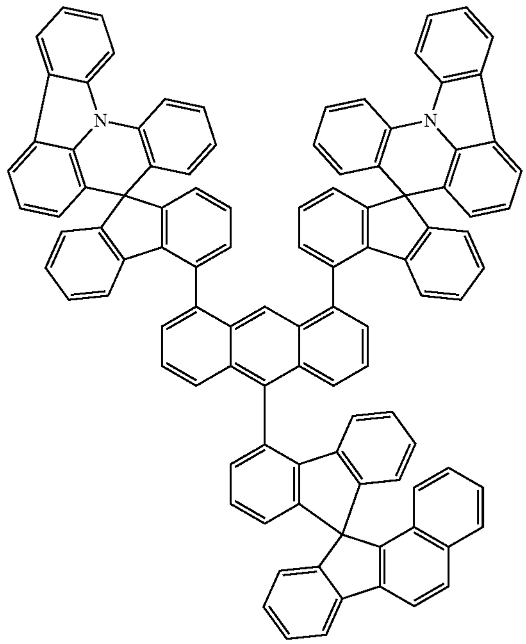
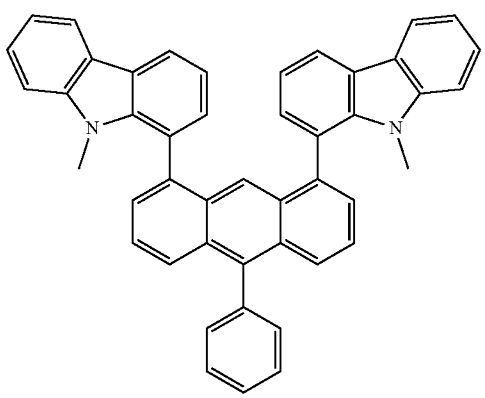
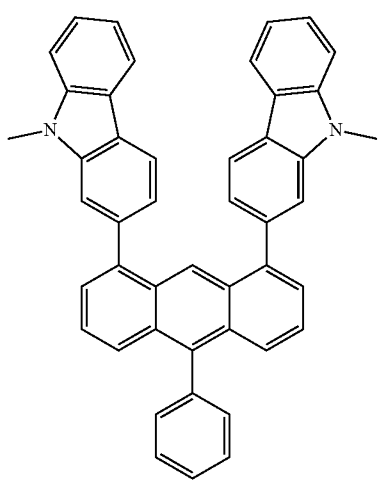
-continued
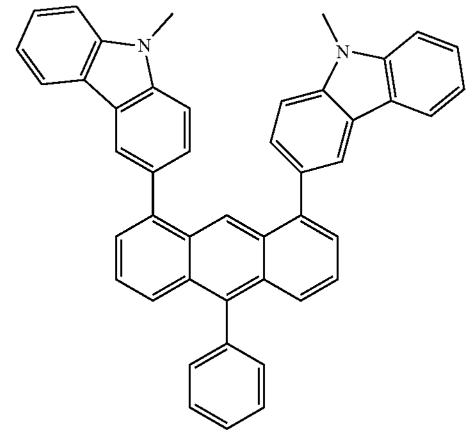
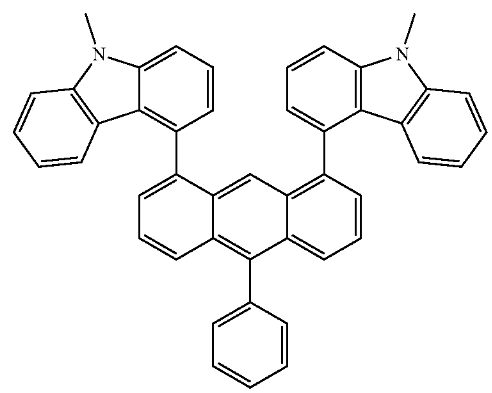
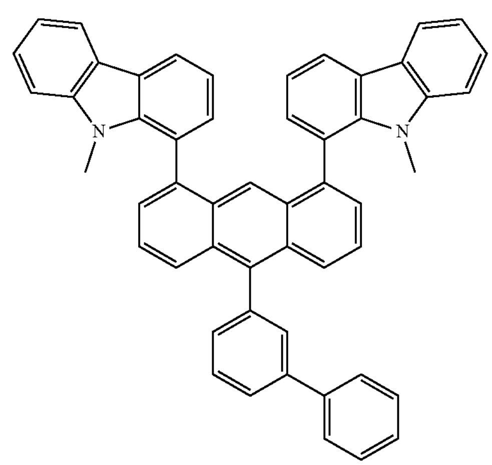

-continued
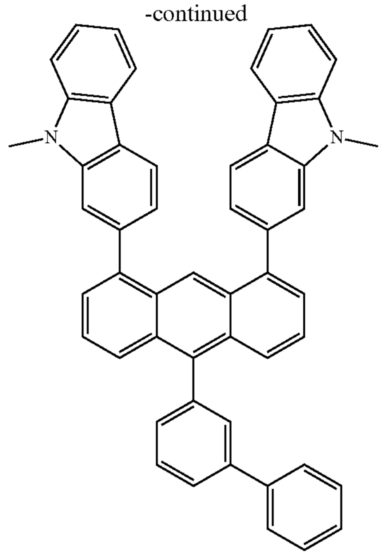
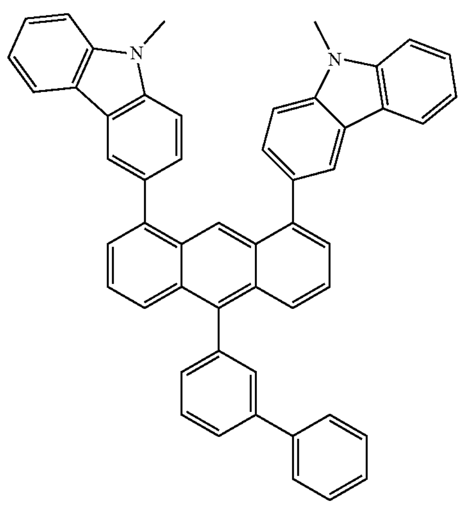
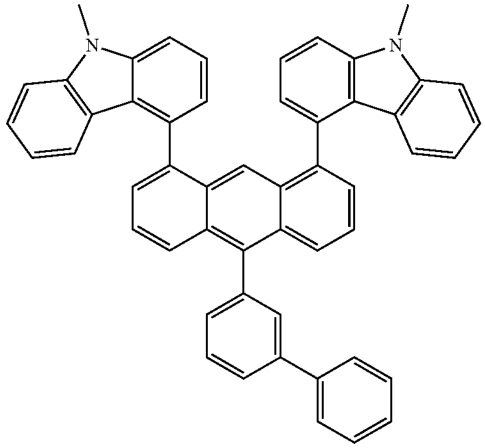
-continued
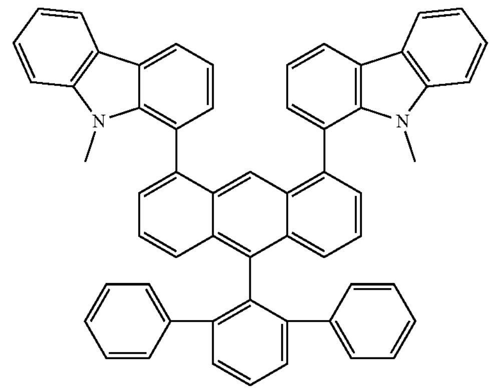
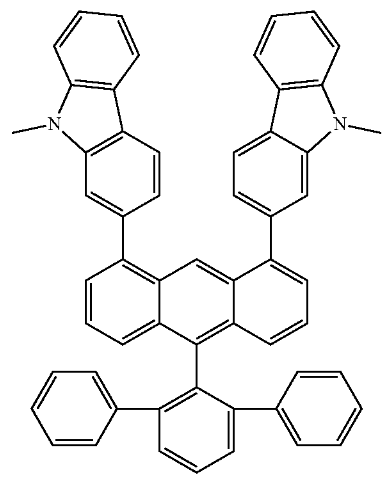
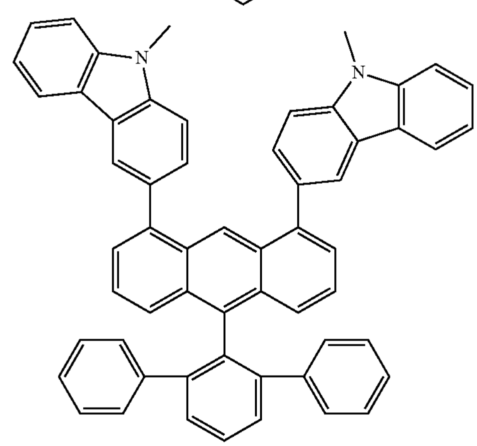
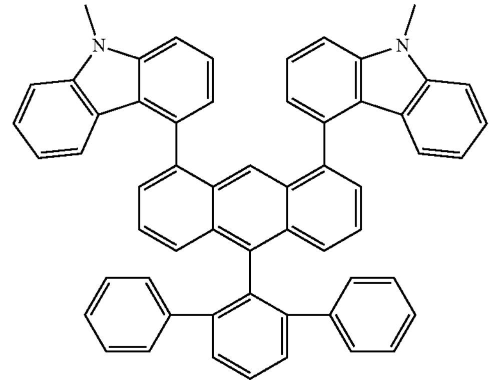

-continued
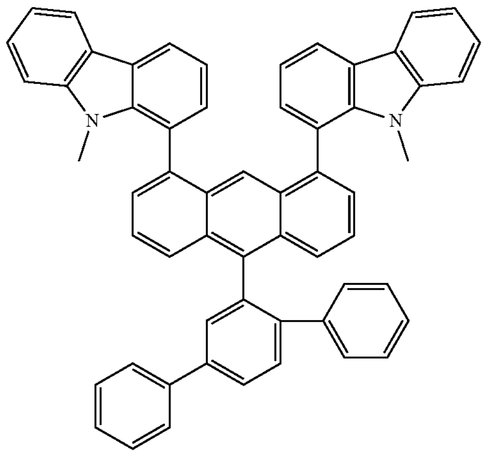
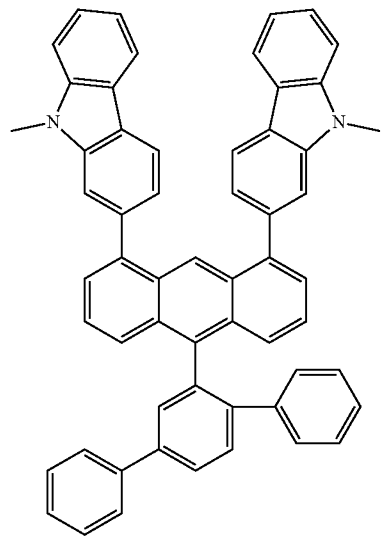
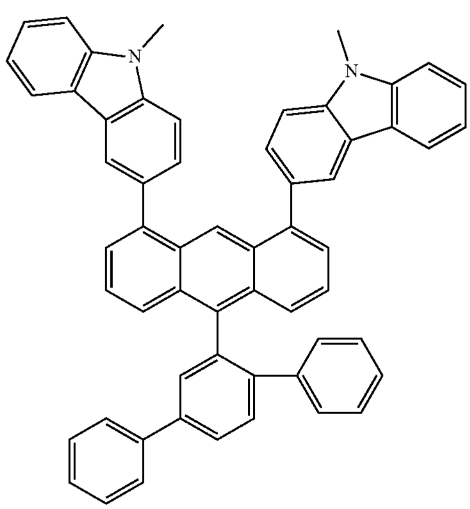
-continued
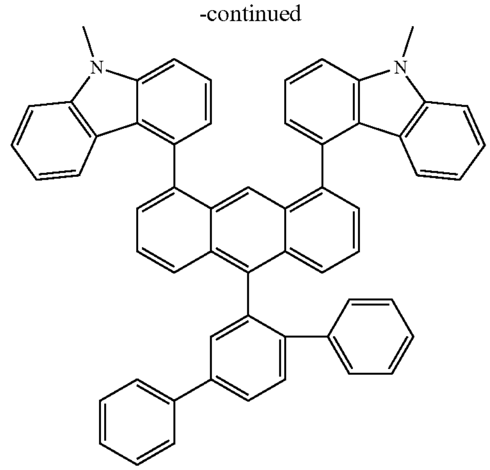
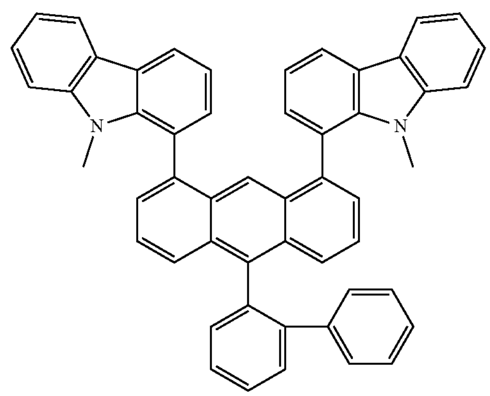
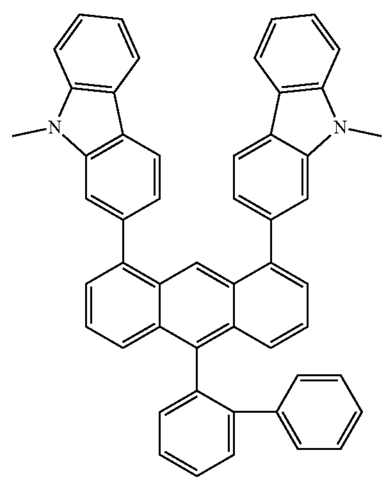

-continued
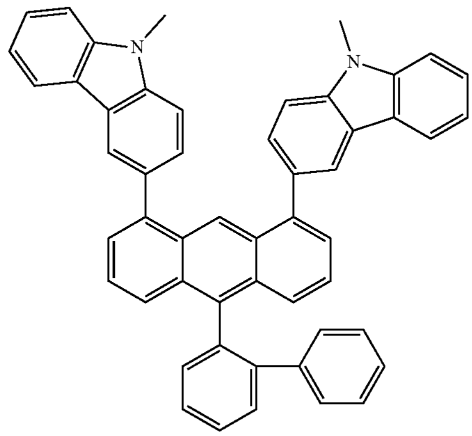
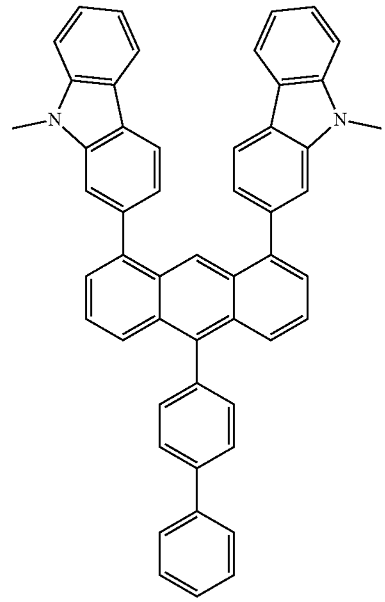
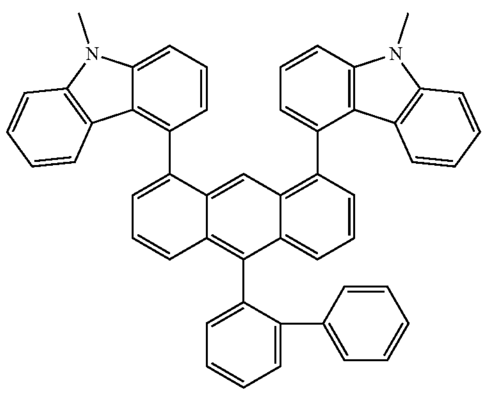
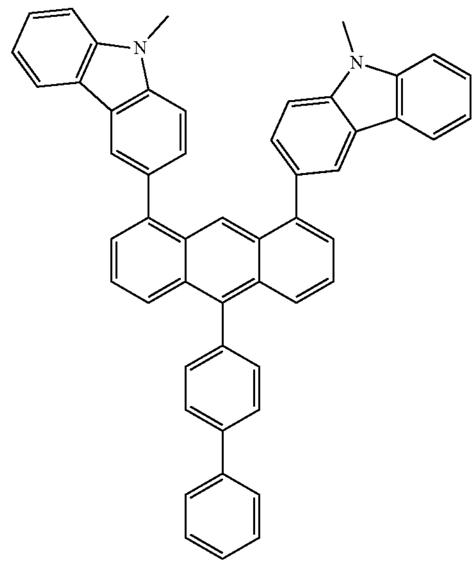
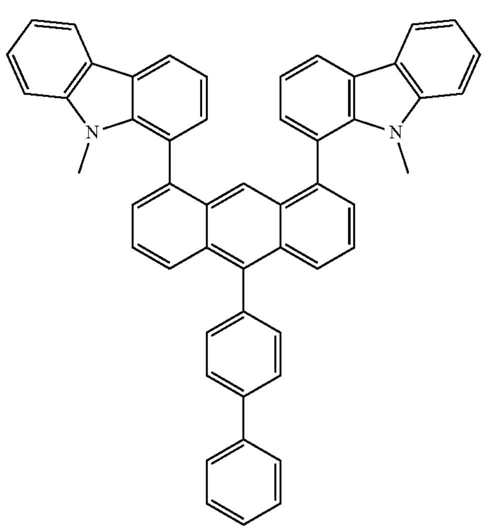
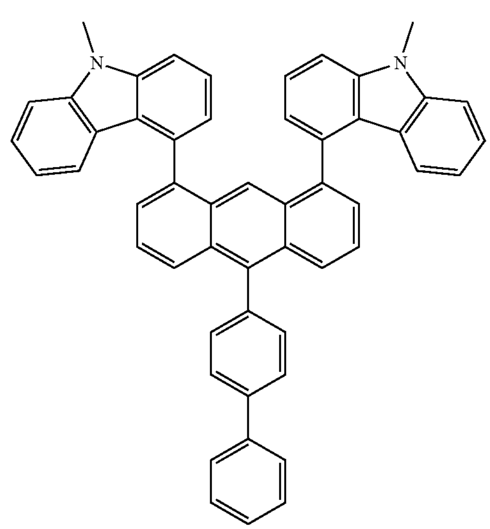
-continued

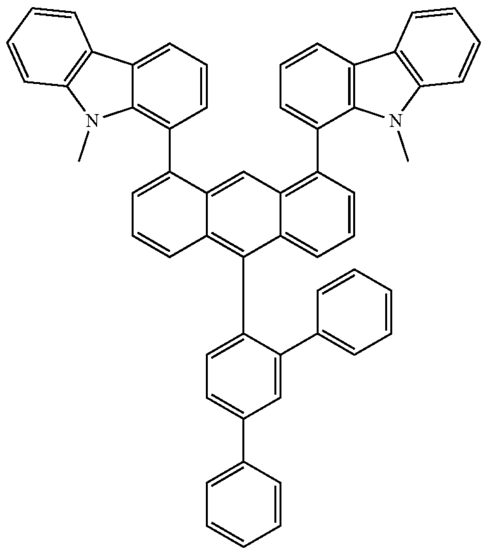
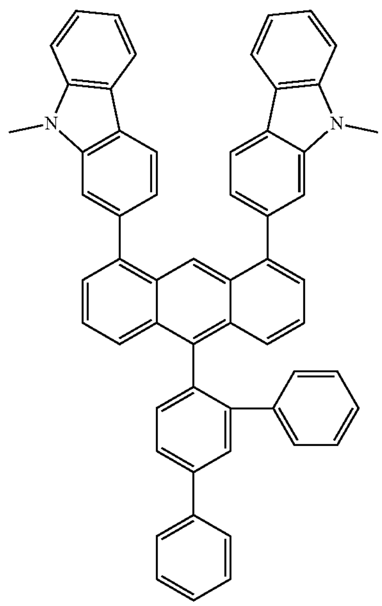
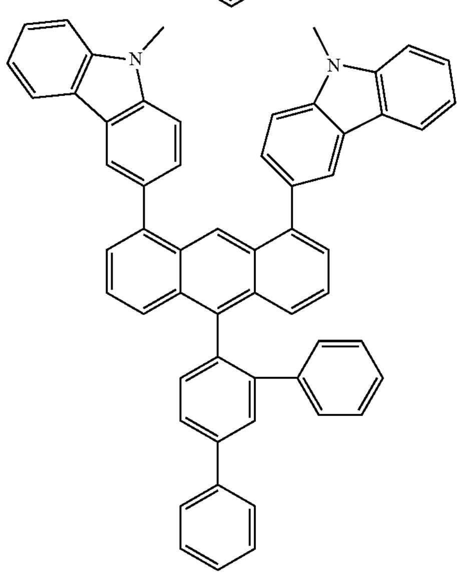
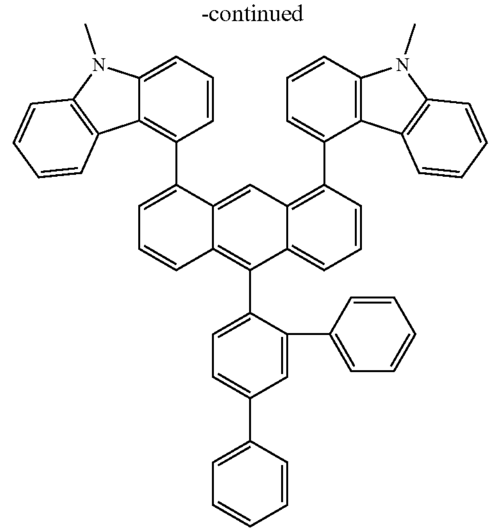
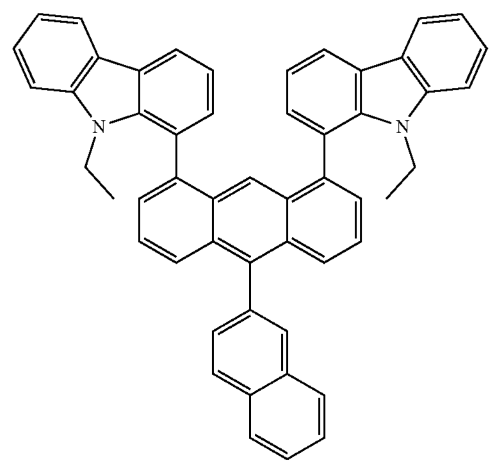
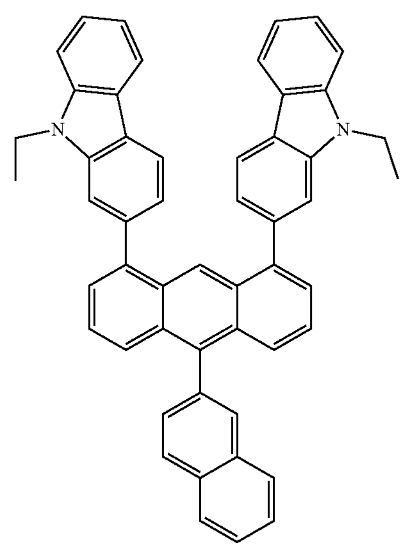

-continued
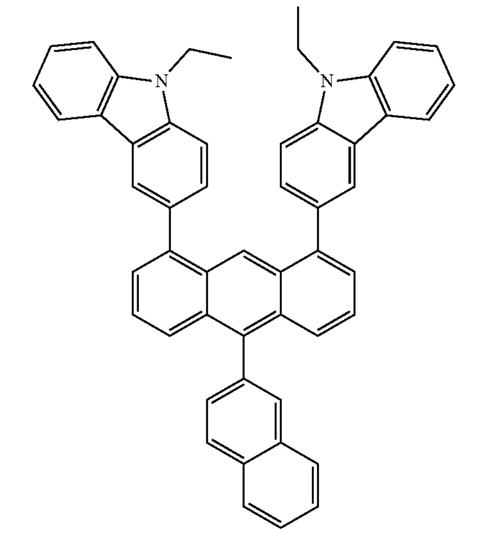
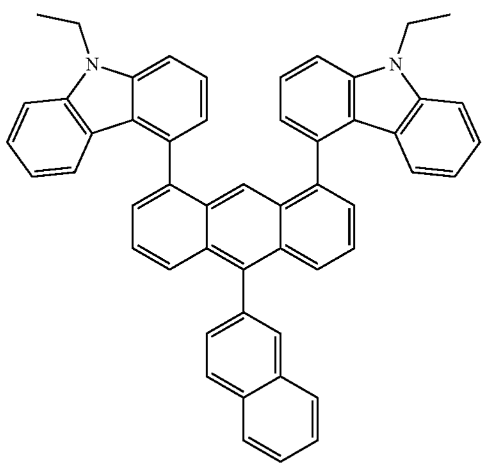
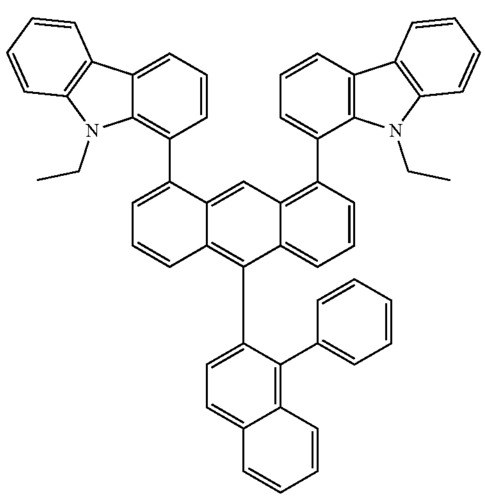
-continued
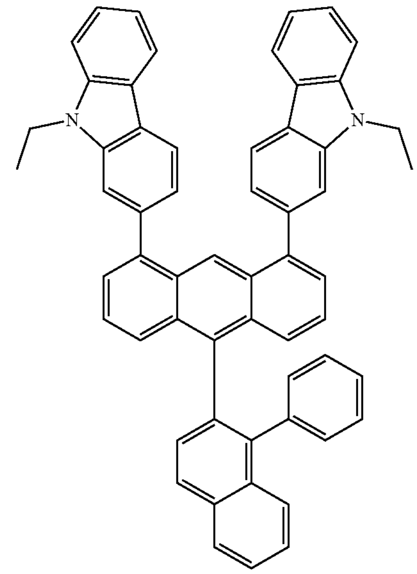
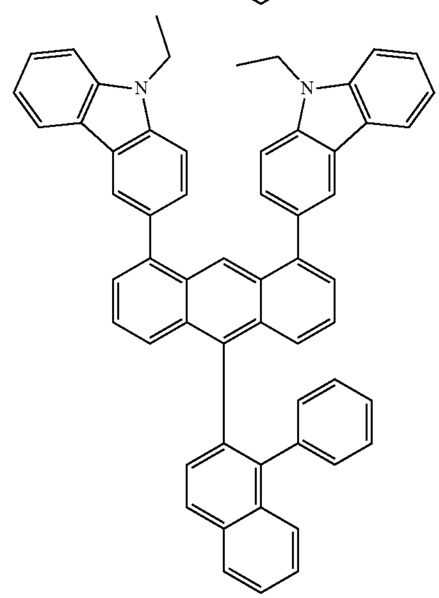
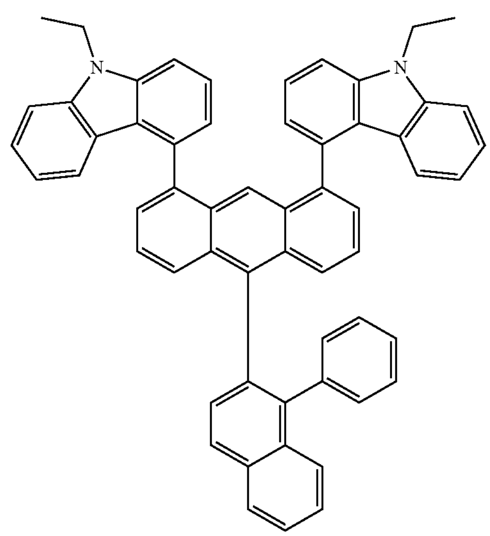

-continued
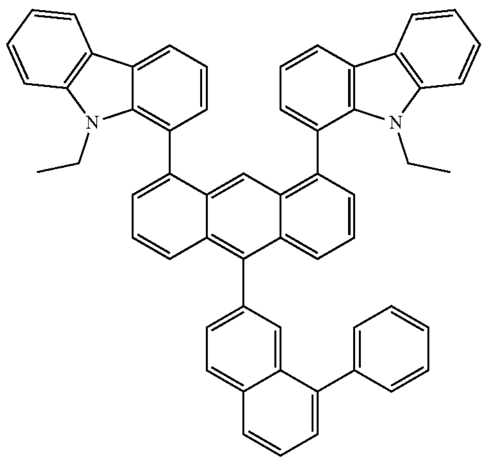
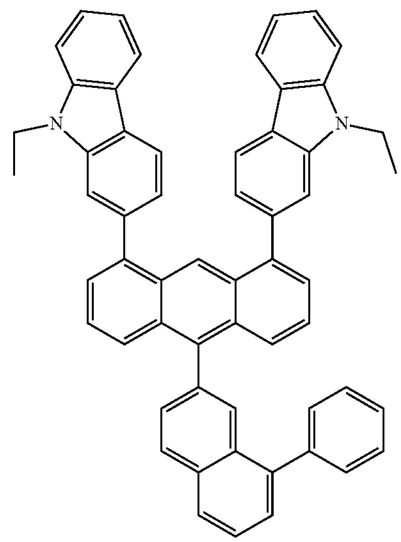
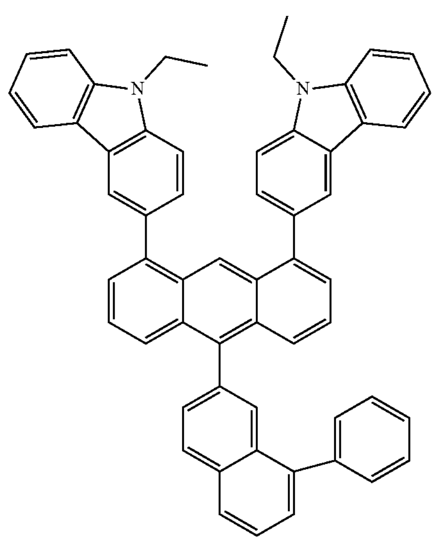
-continued
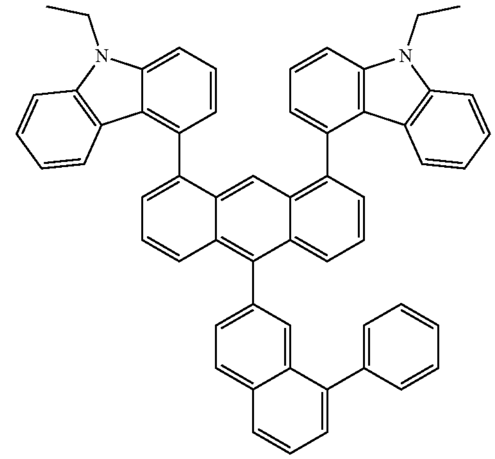
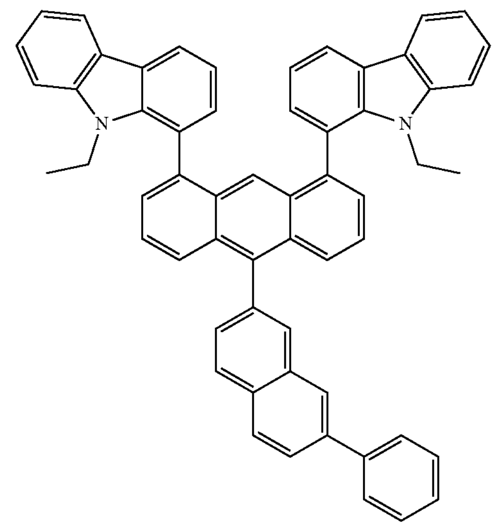
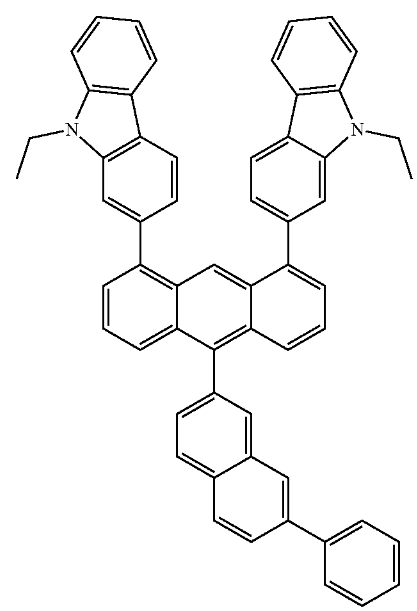

-continued
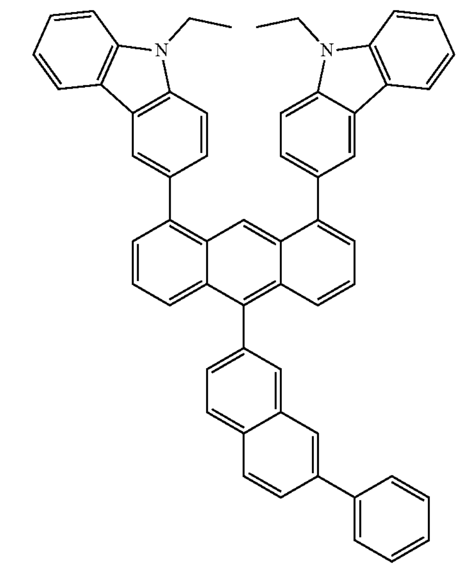
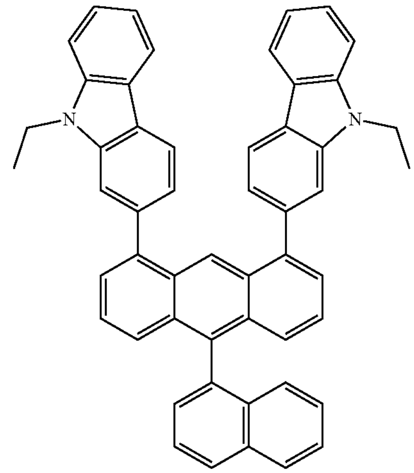
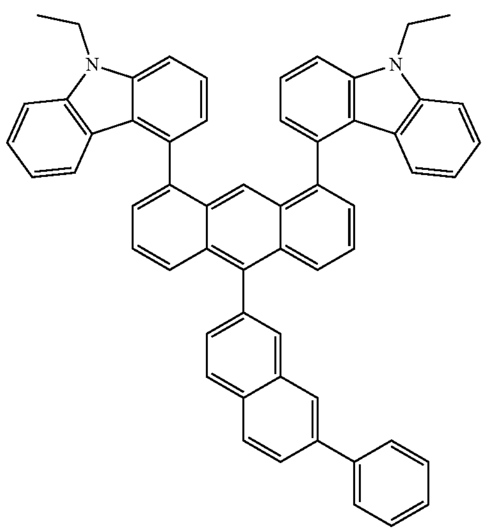
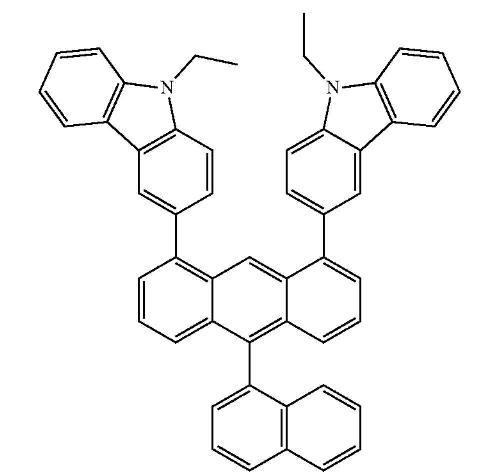
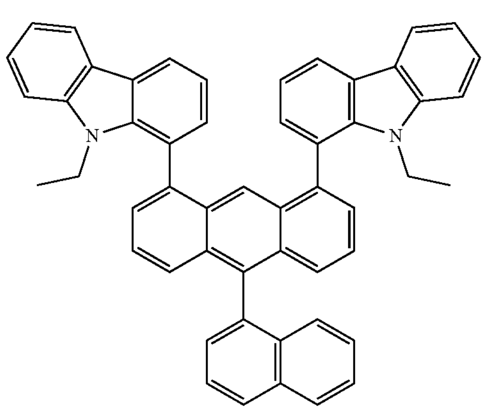
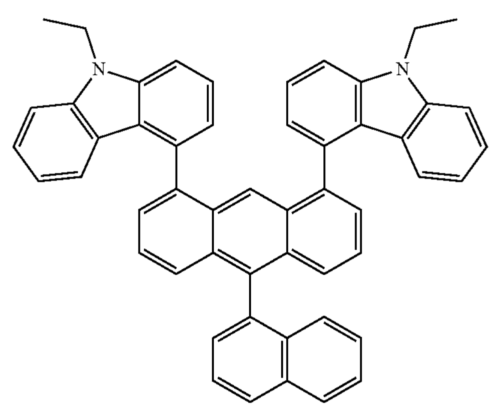

-continued
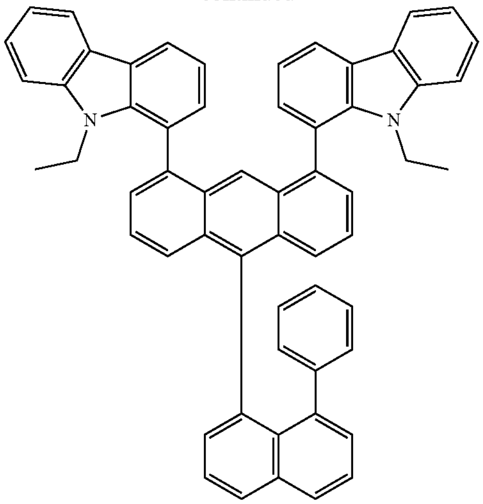
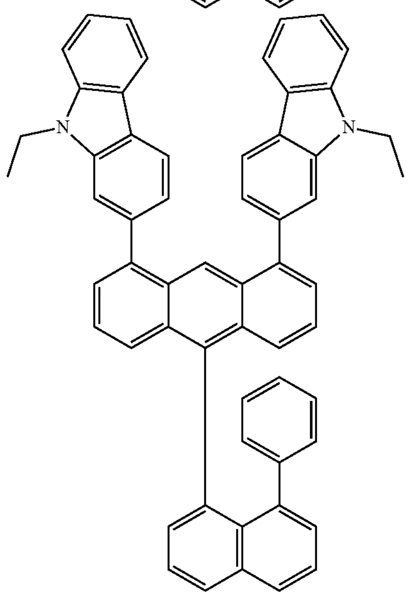
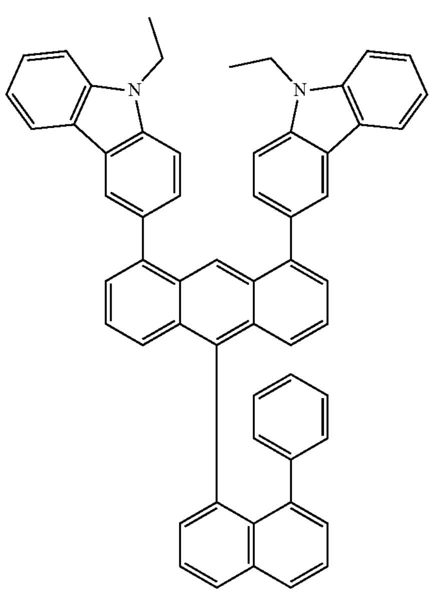
-continued
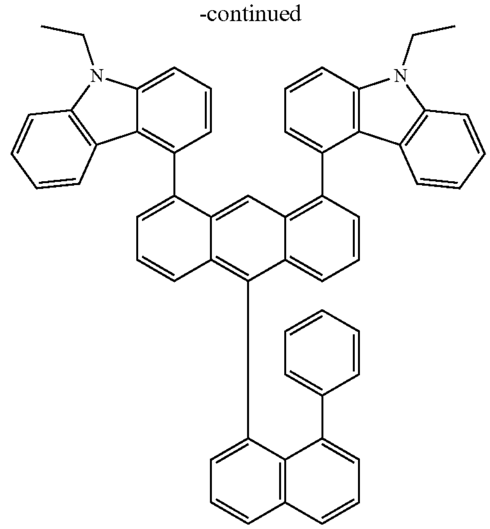
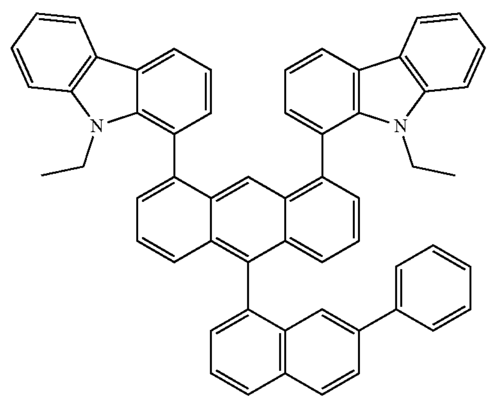
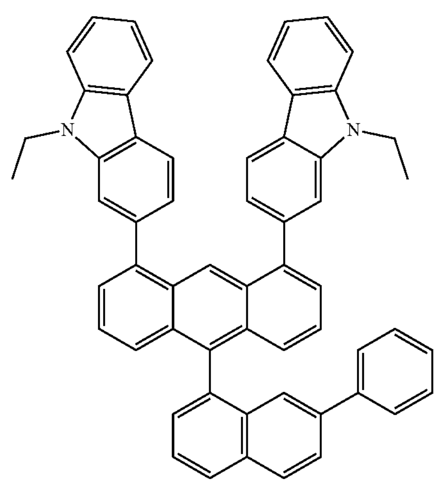

-continued
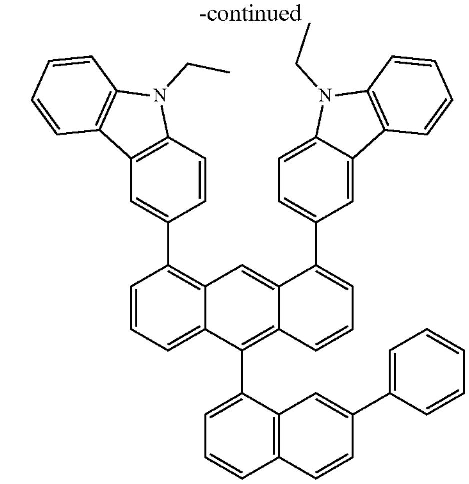
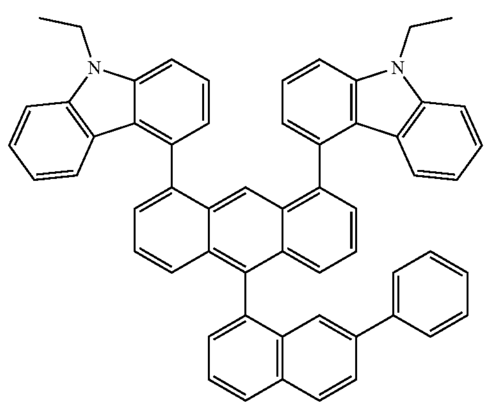
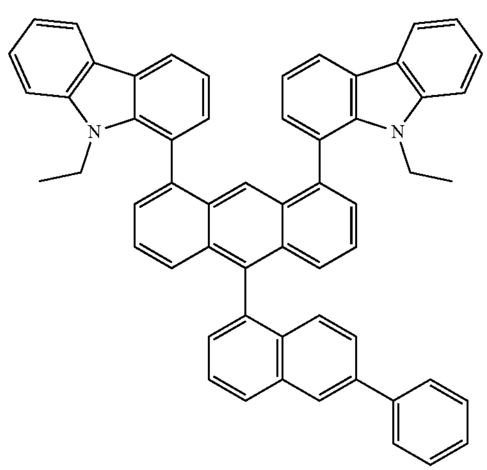
-continued
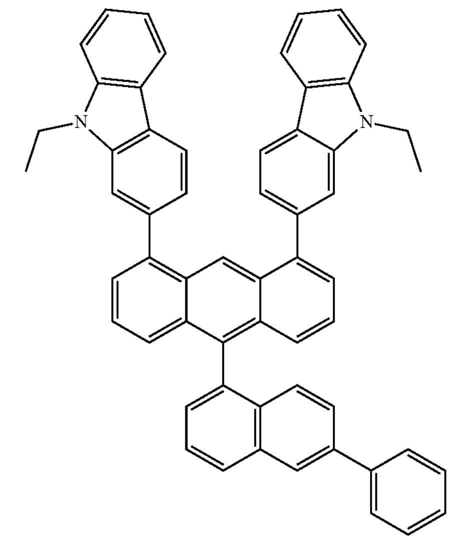
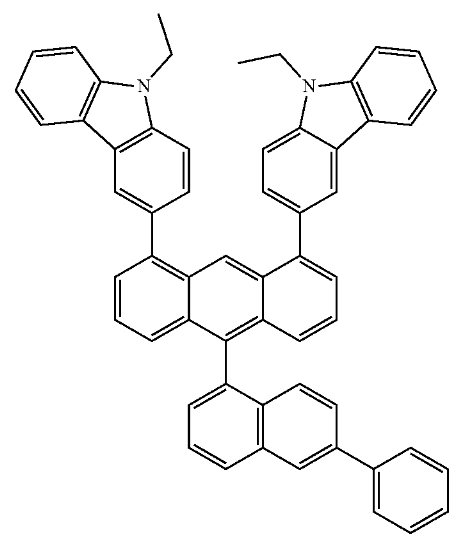
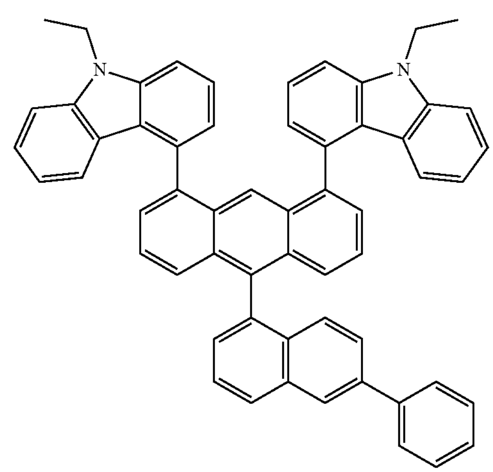

-continued
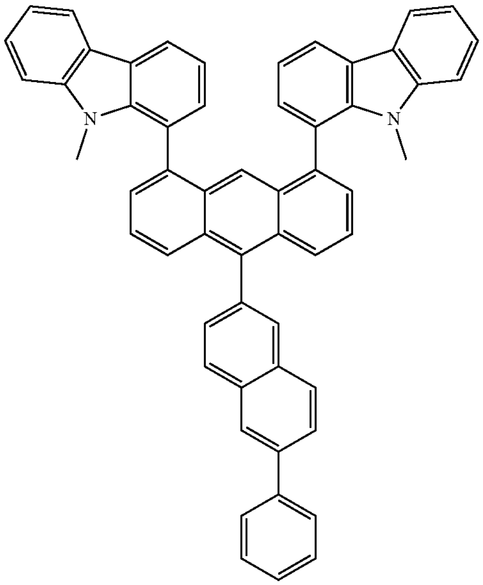
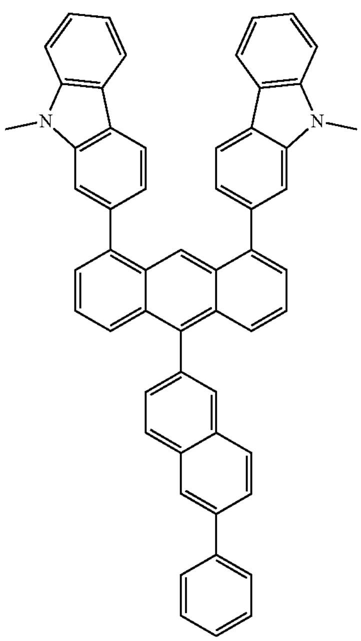
-continued
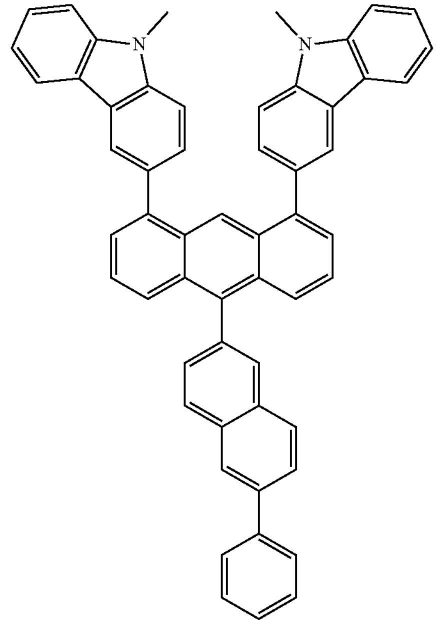
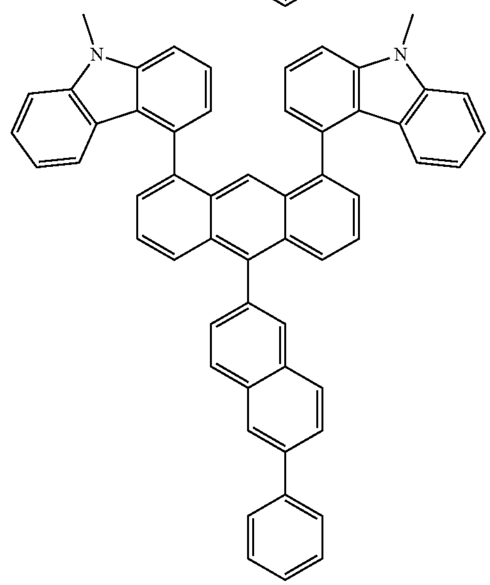
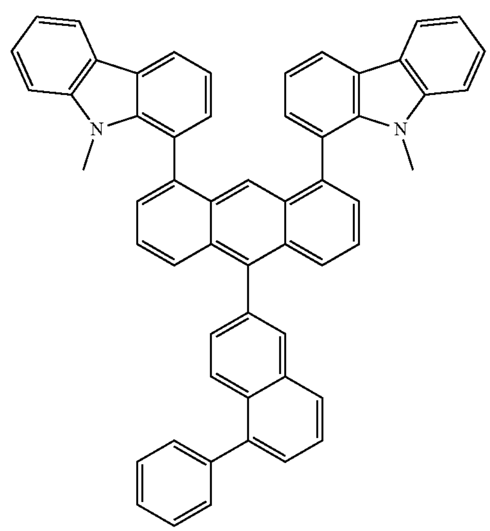

-continued
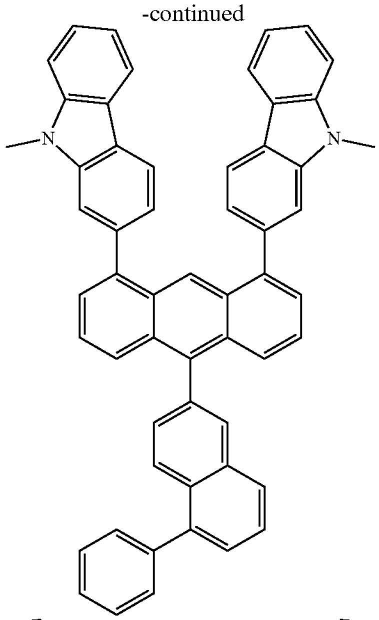
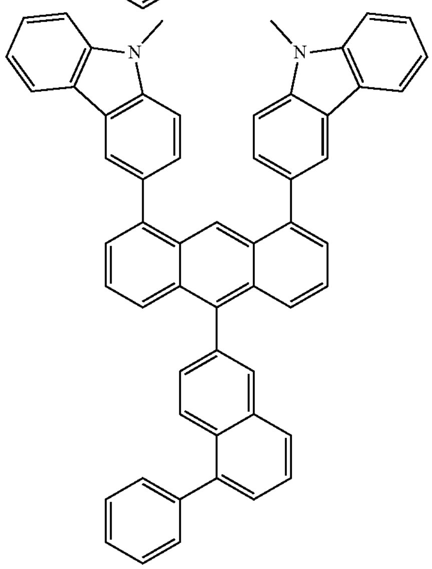
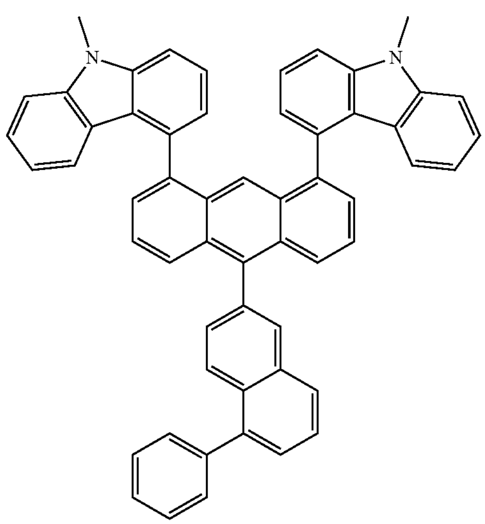
-continued
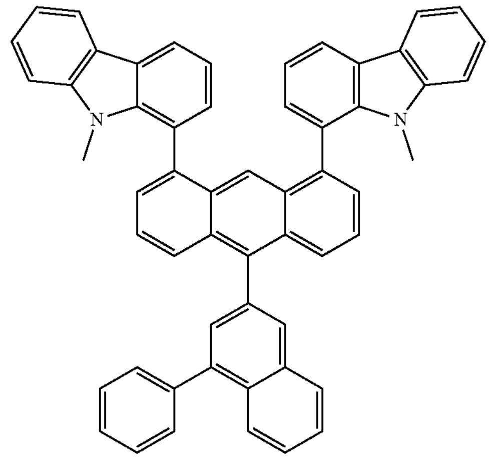
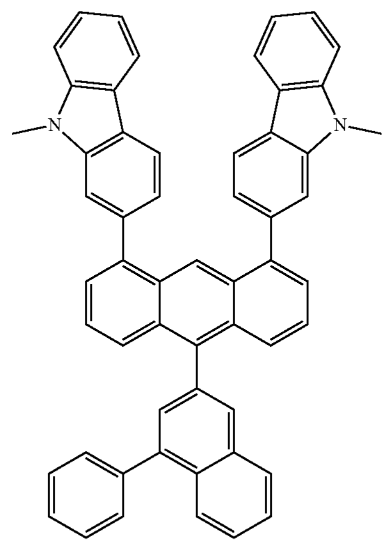
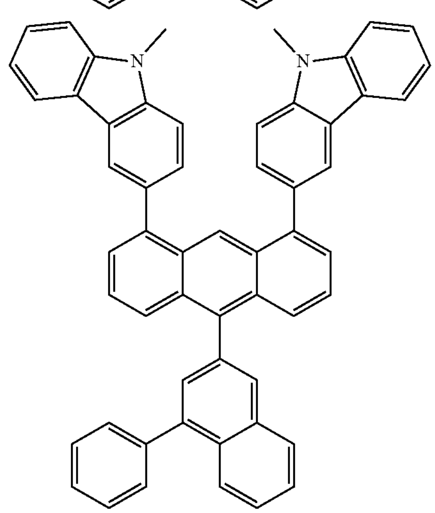

-continued
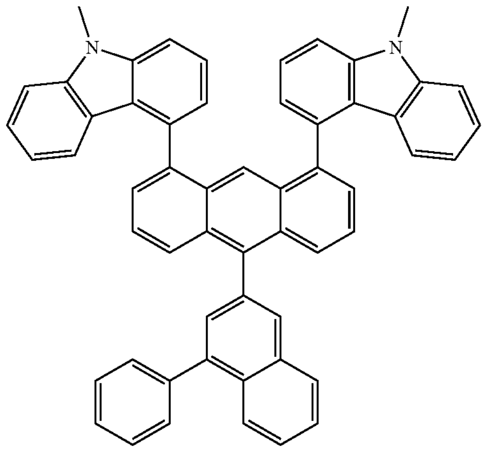
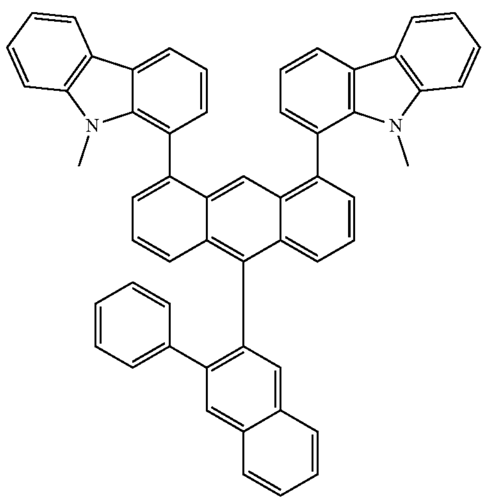
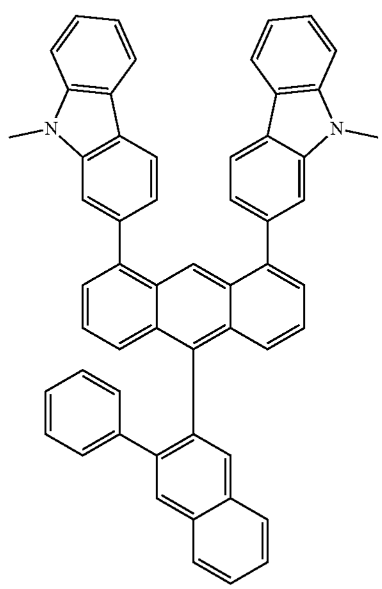
-continued
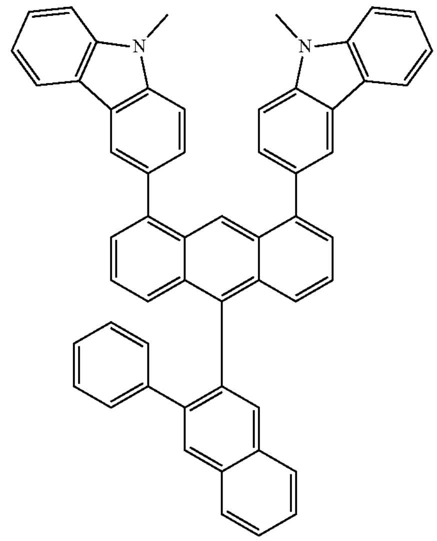
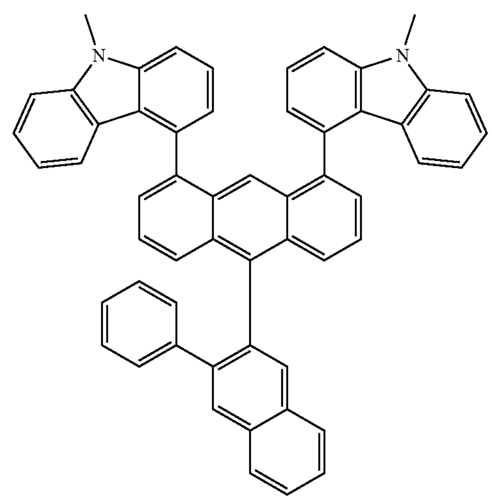
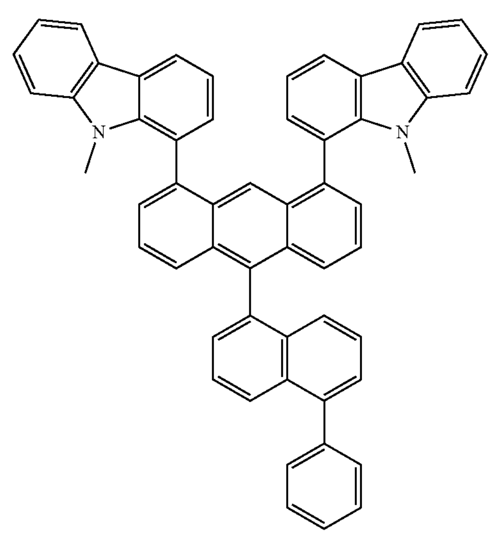

-continued
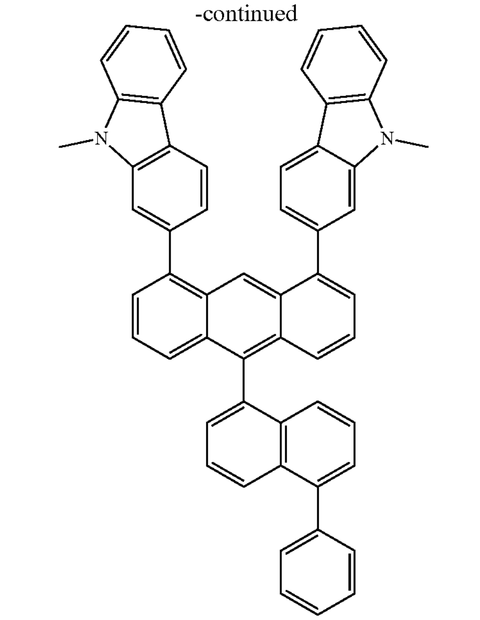
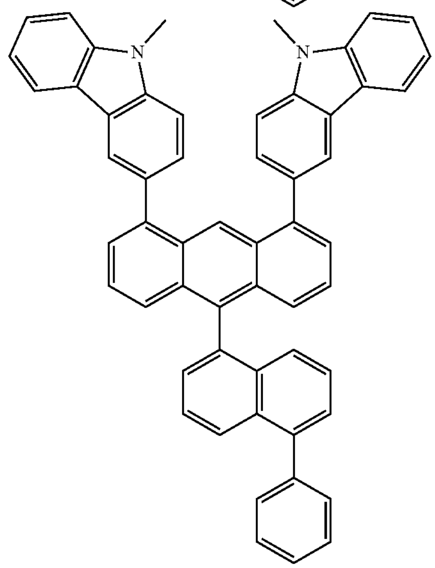
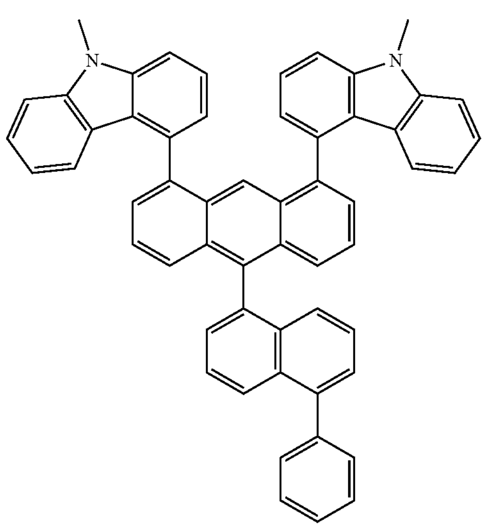
-continued
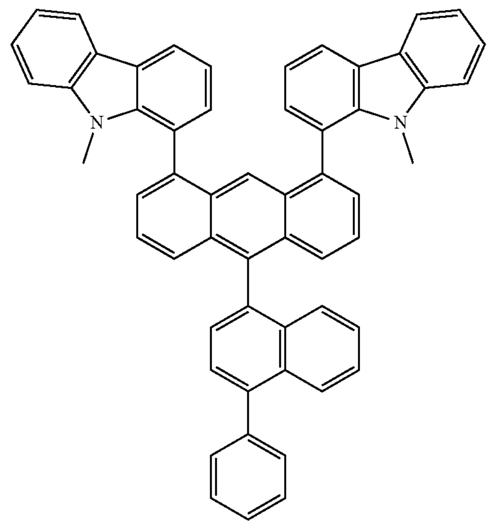
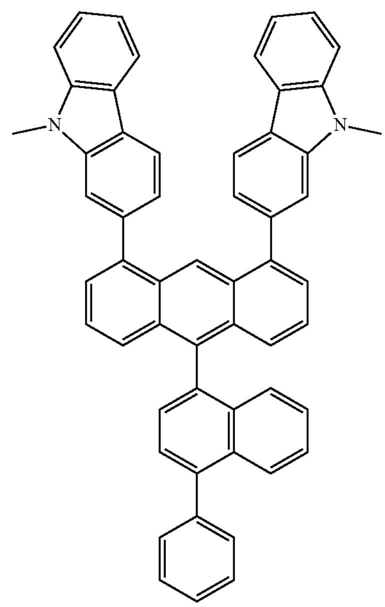
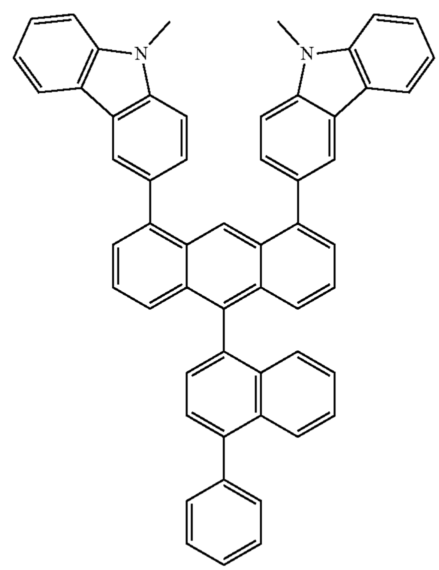

-continued
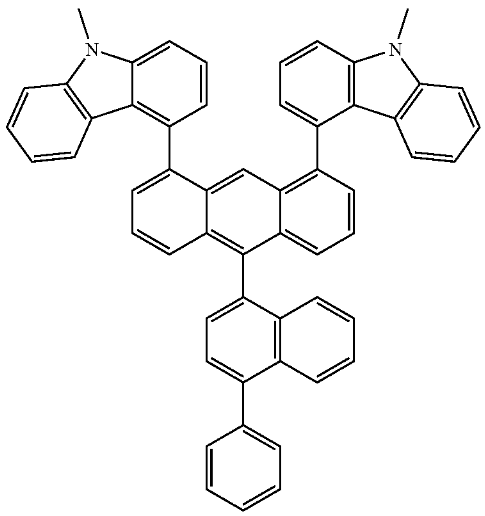
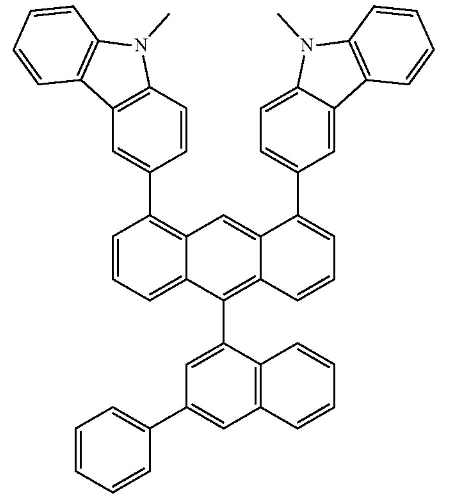
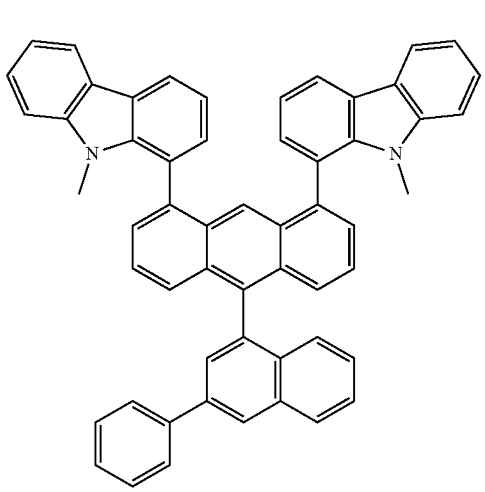
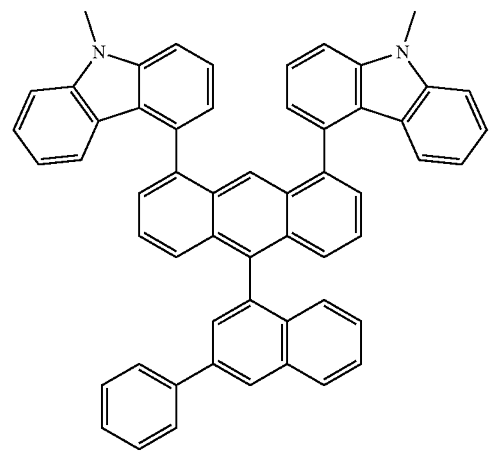
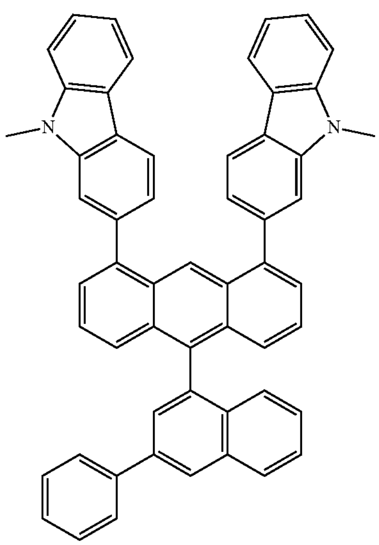
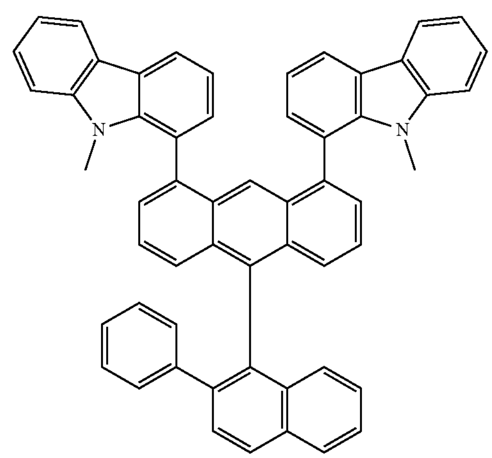
-continued -continued
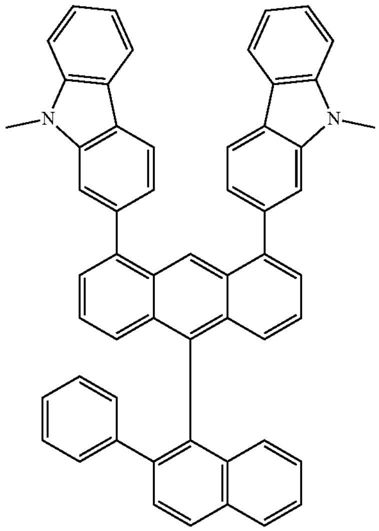
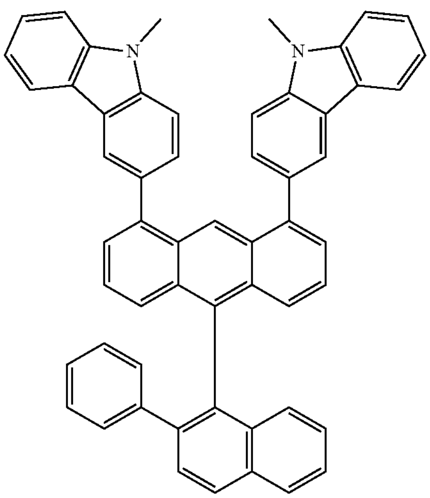
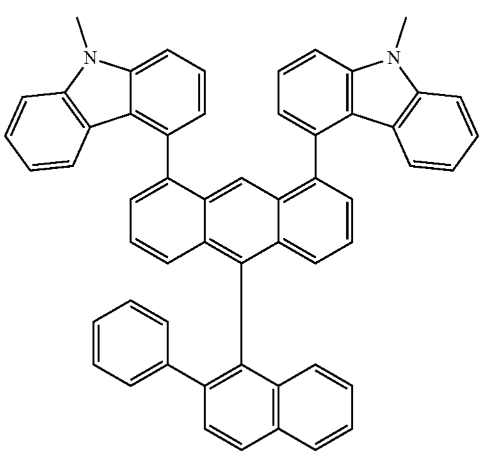
-continued
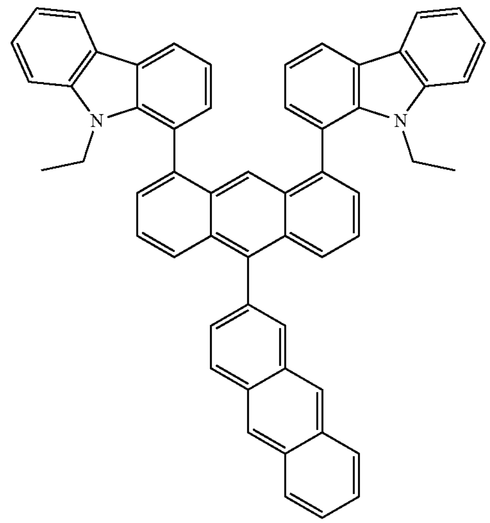
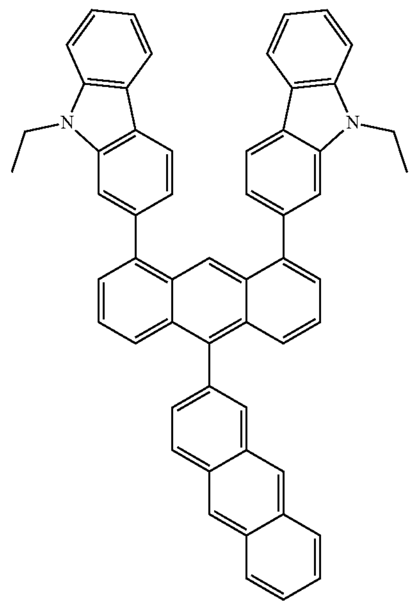
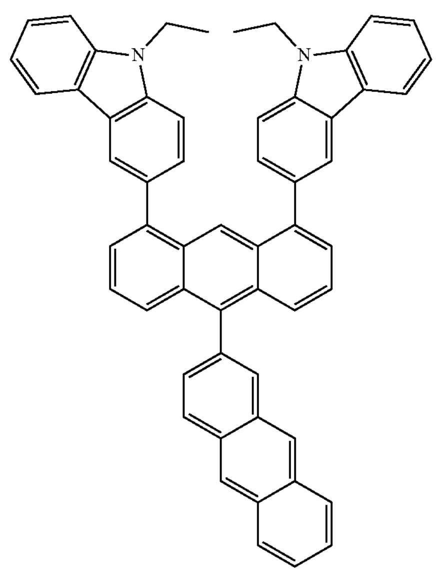

-continued
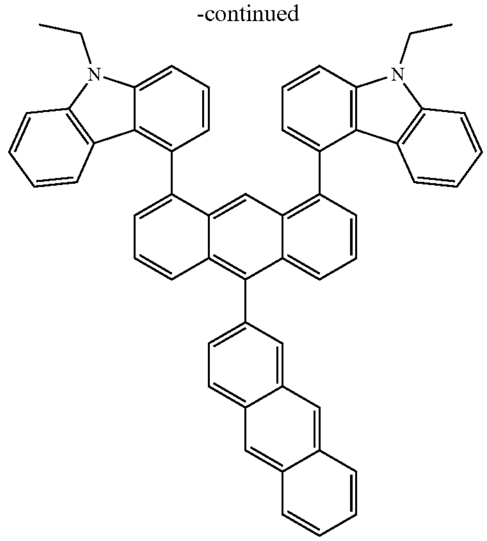
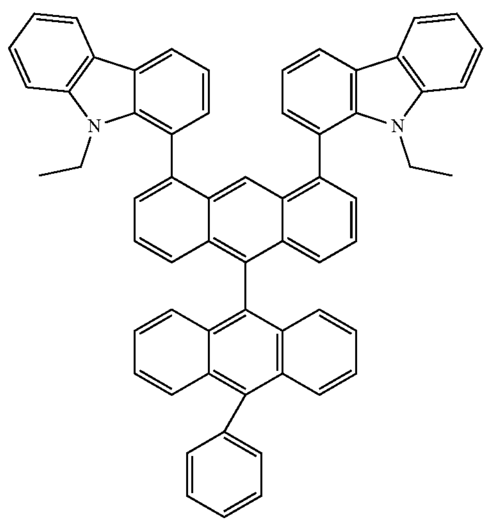
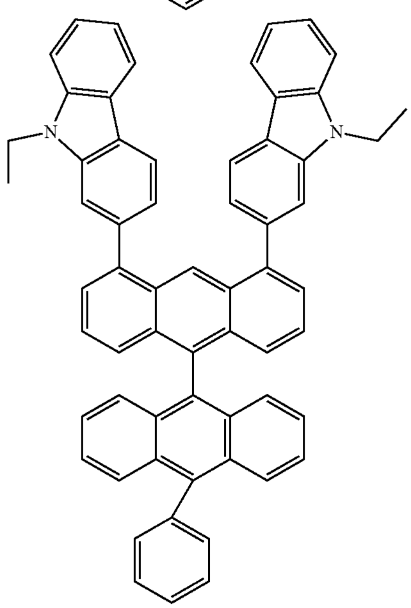
-continued
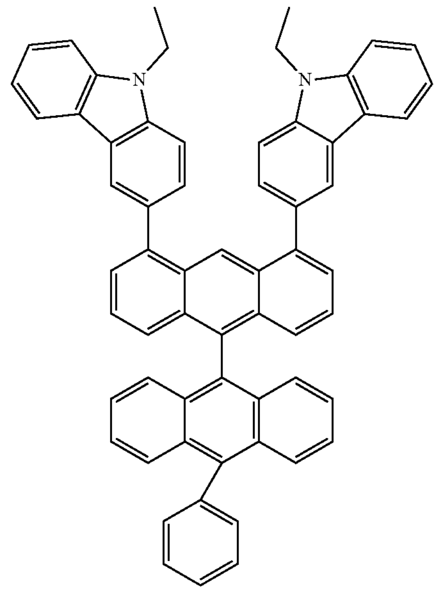
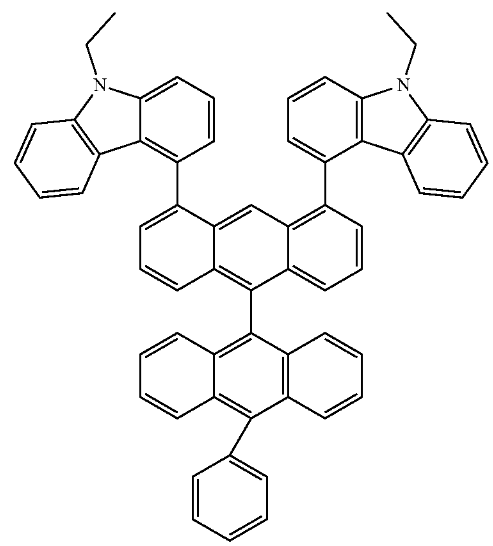
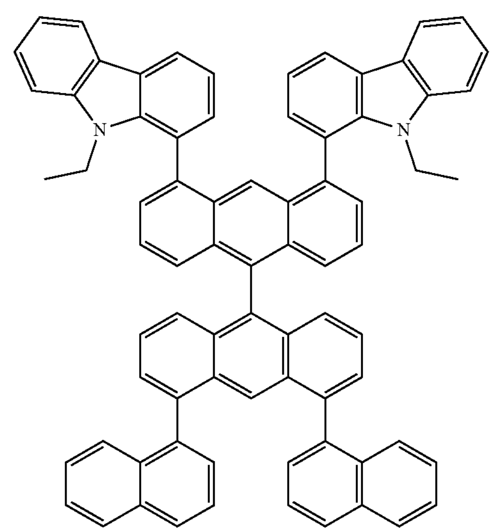

-continued
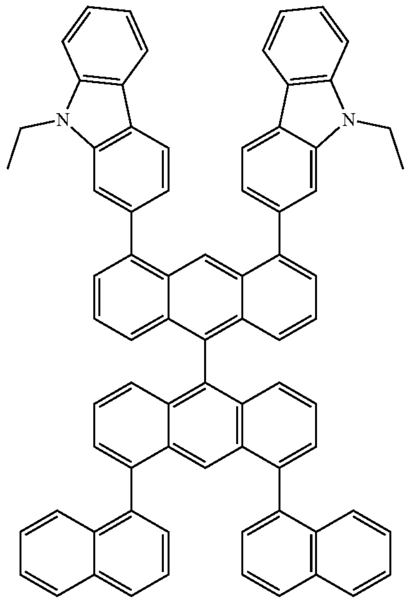
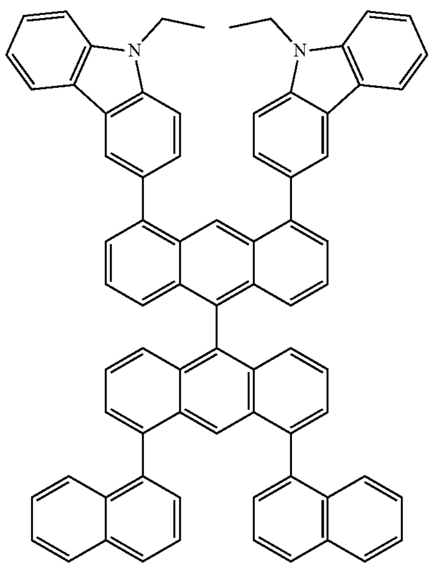
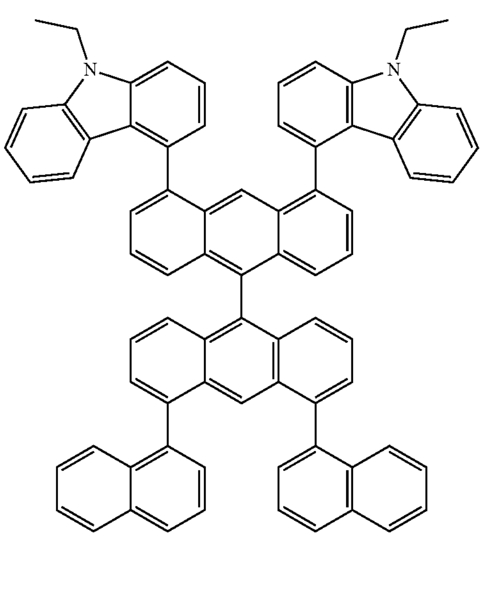
-continued
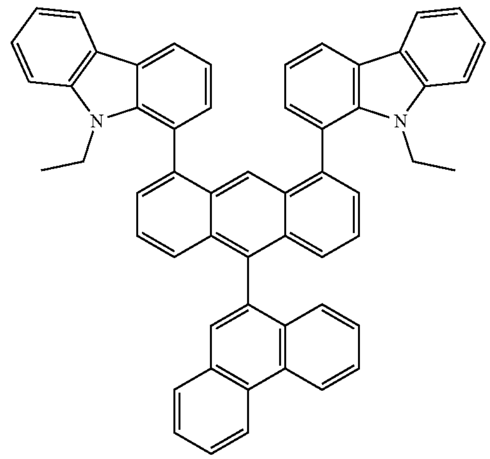
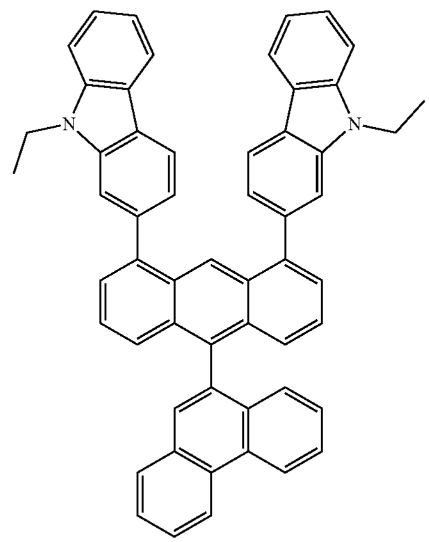
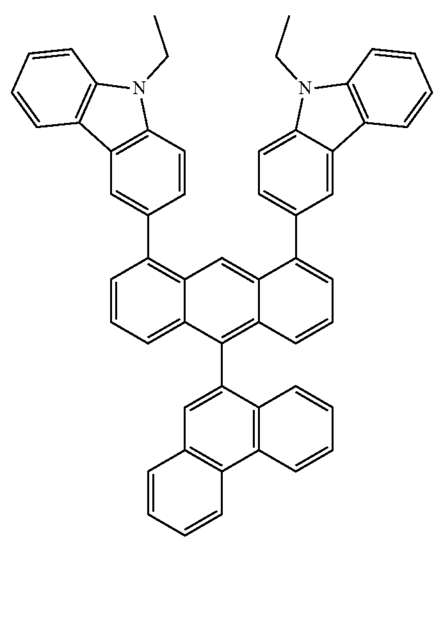

-continued
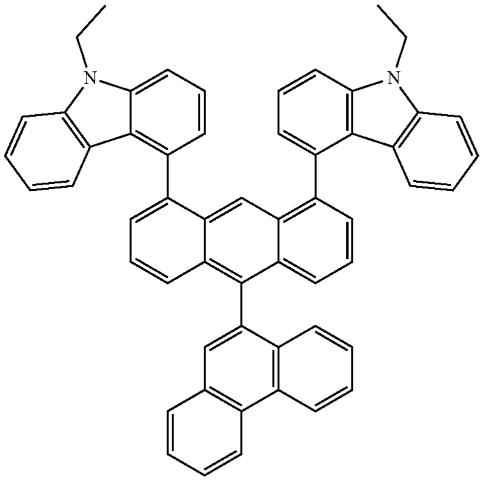
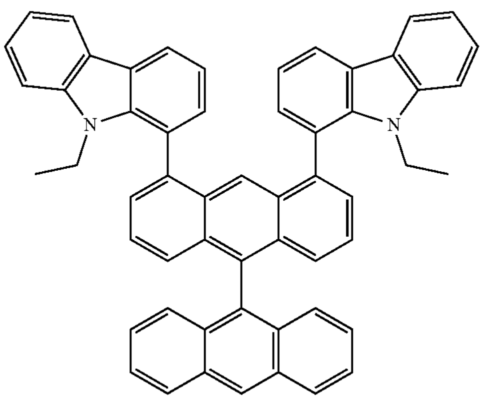
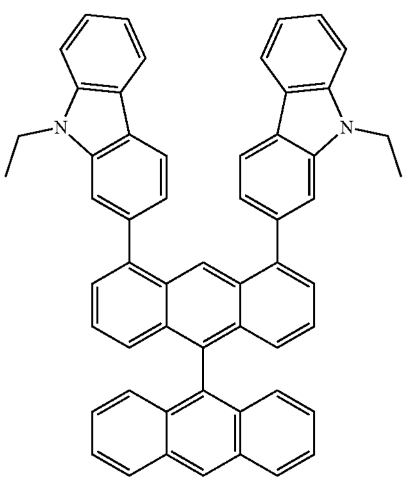
-continued
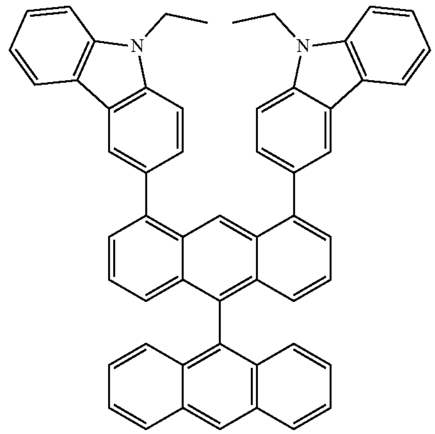
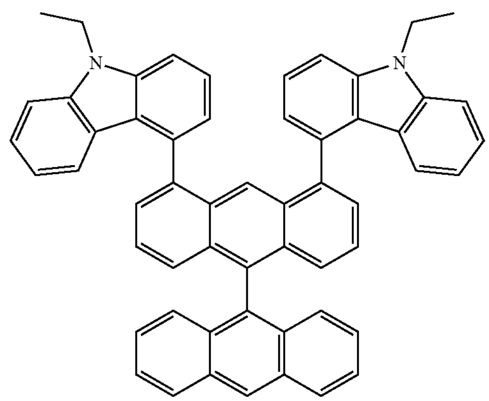
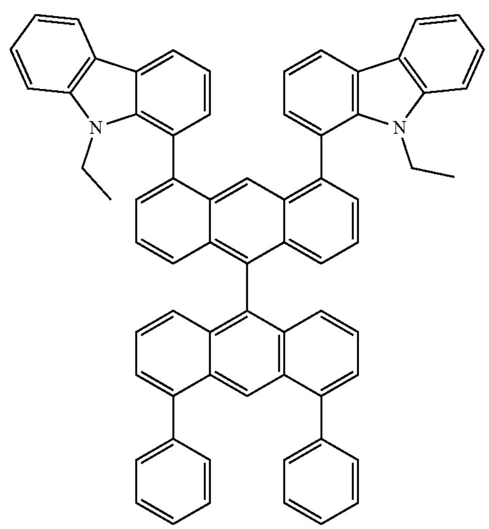

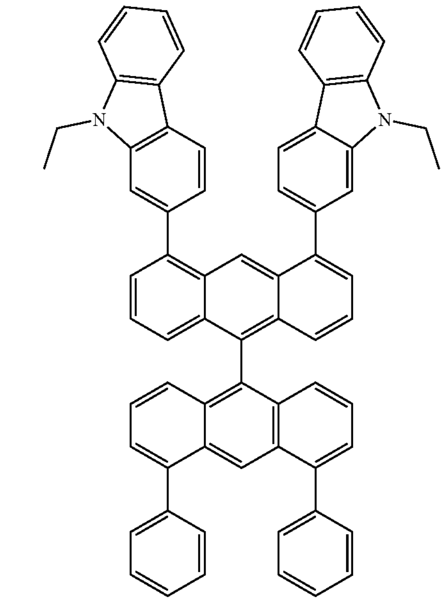
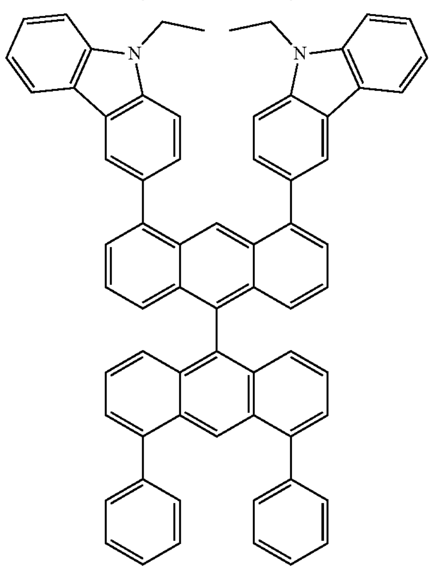
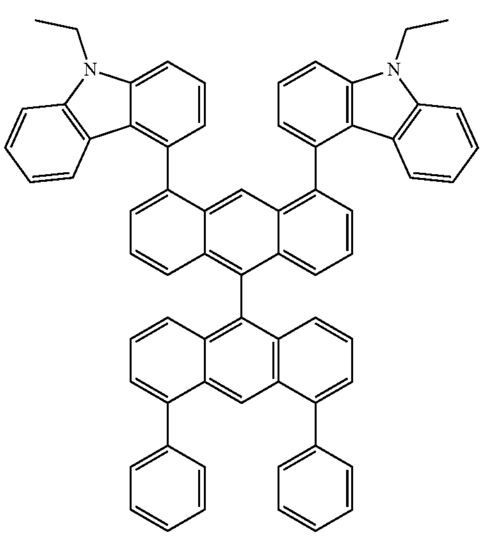
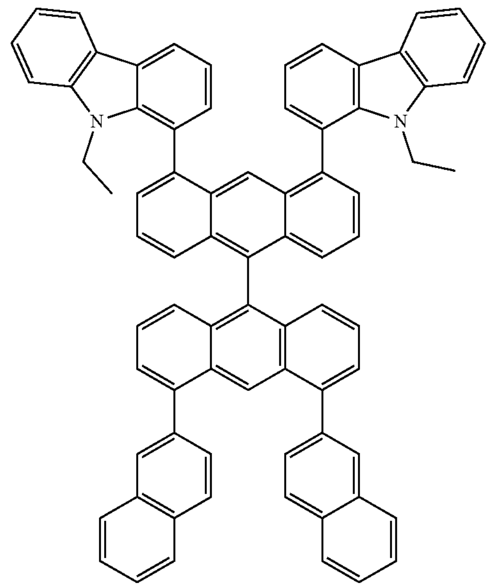
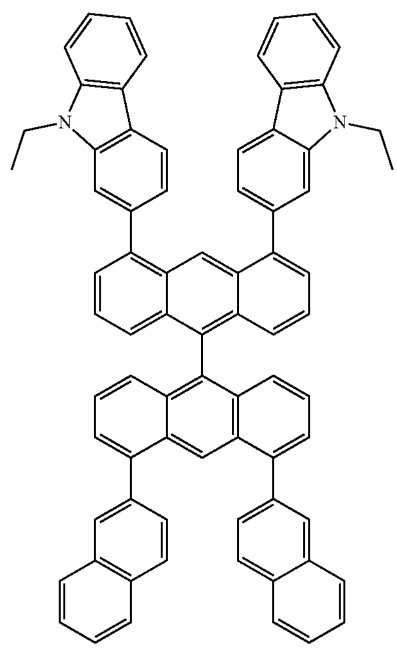

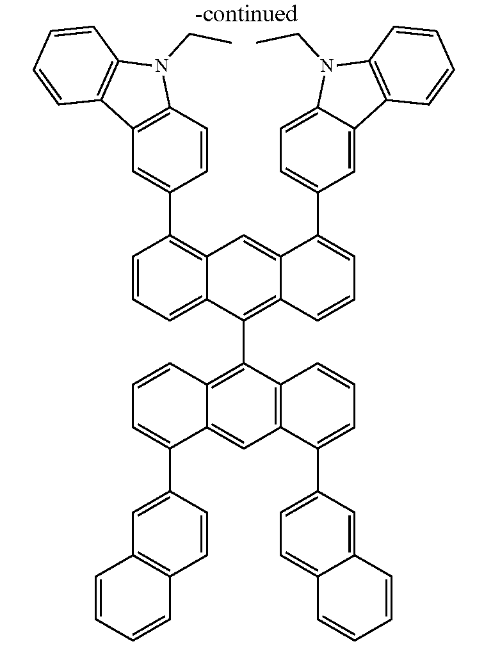
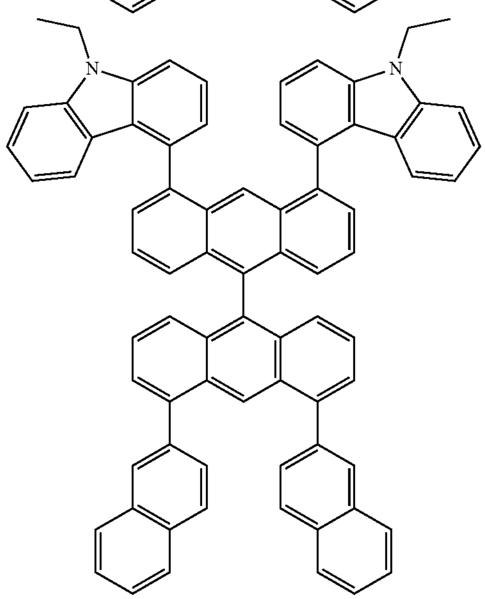
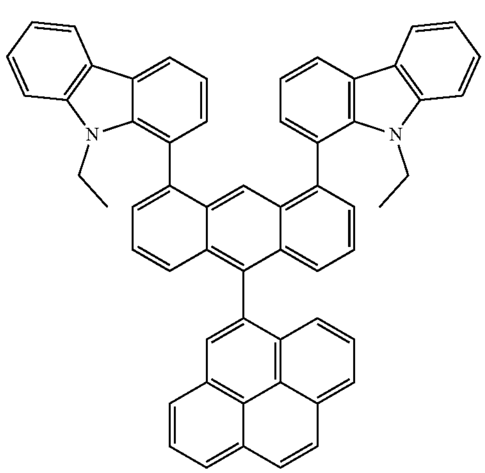
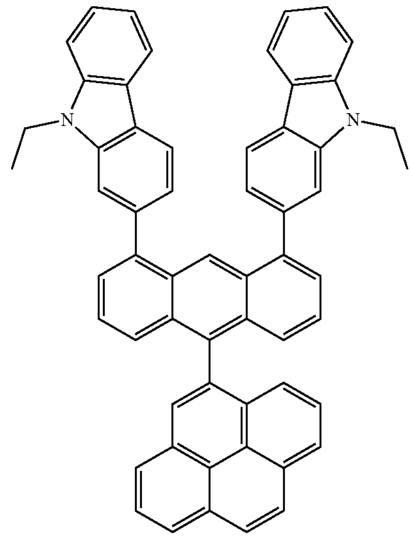
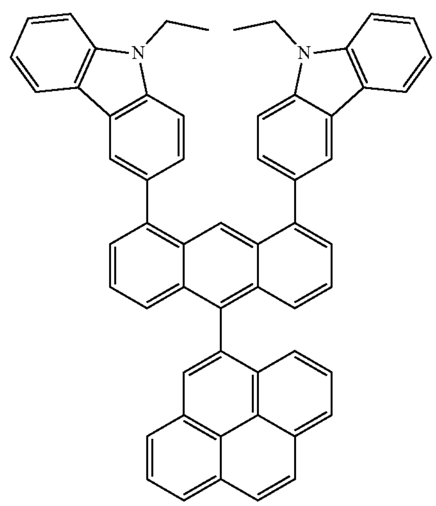
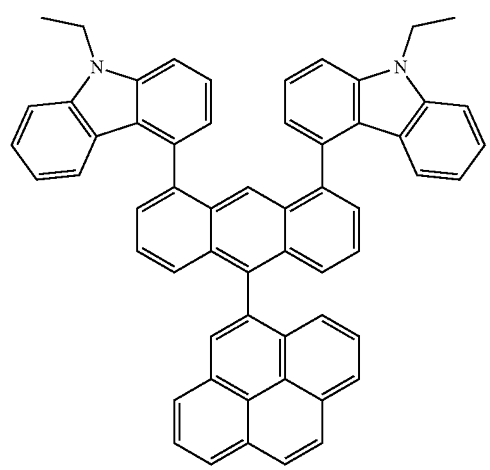

-continued
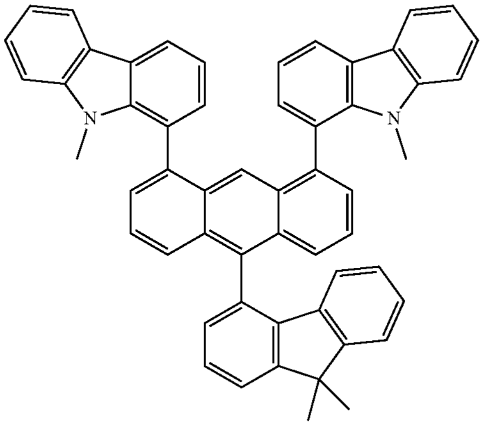
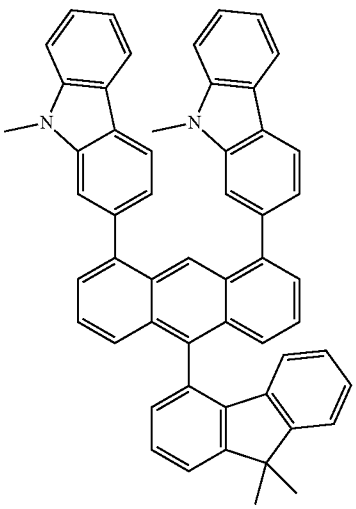
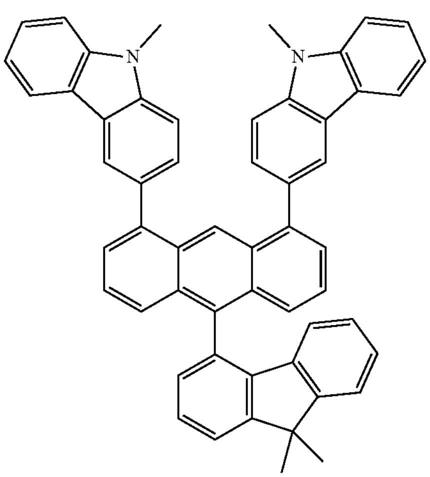
-continued
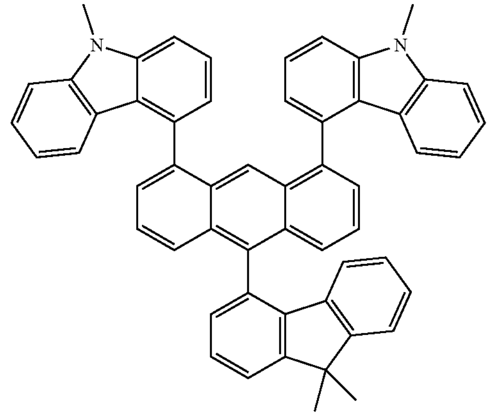
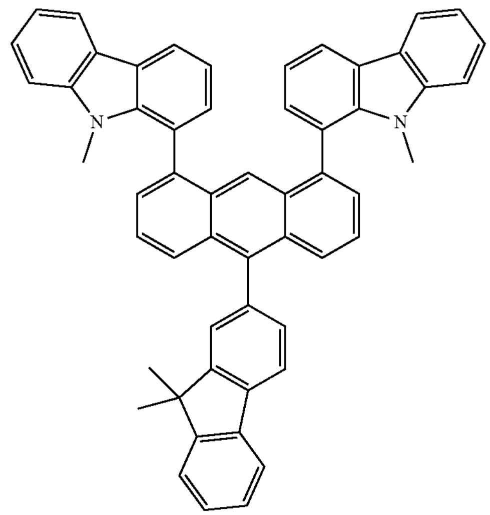
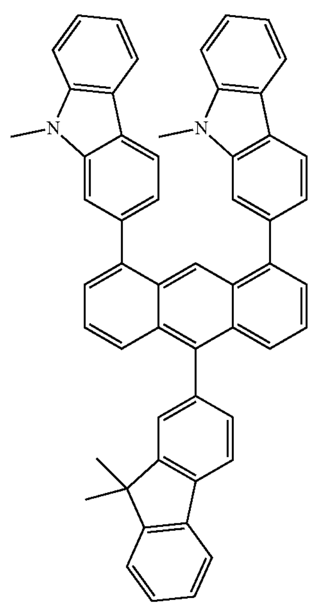

-continued
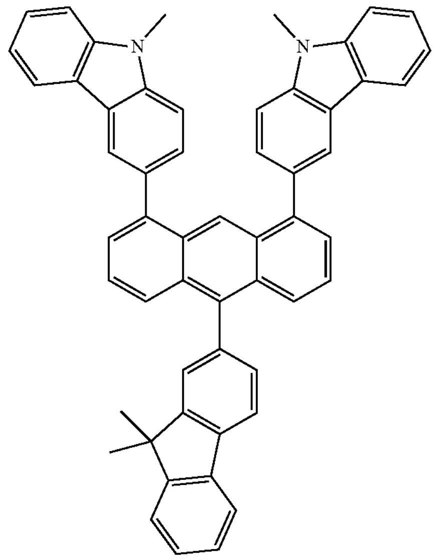
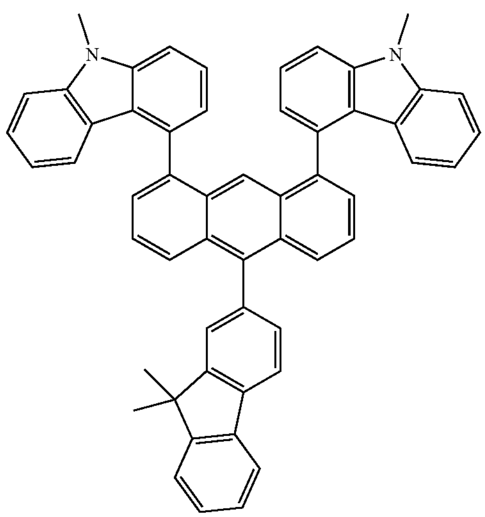
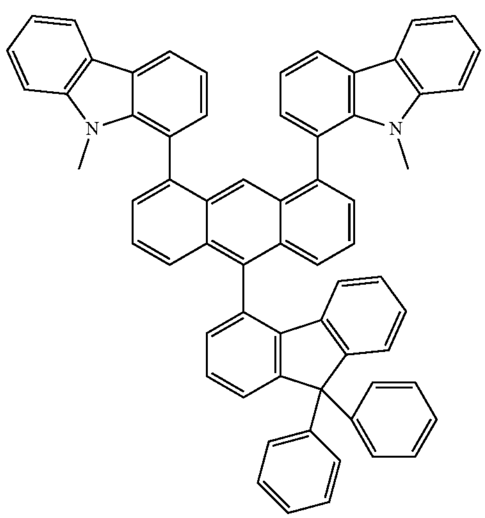
-continued
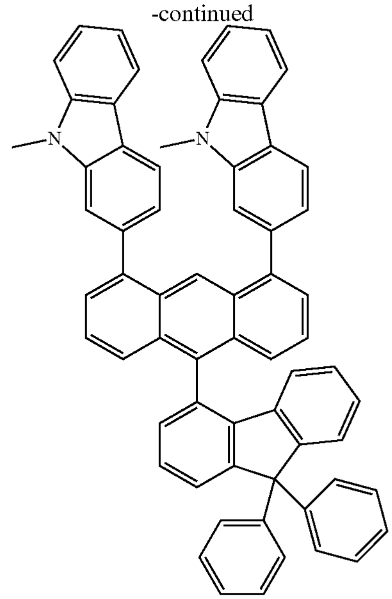
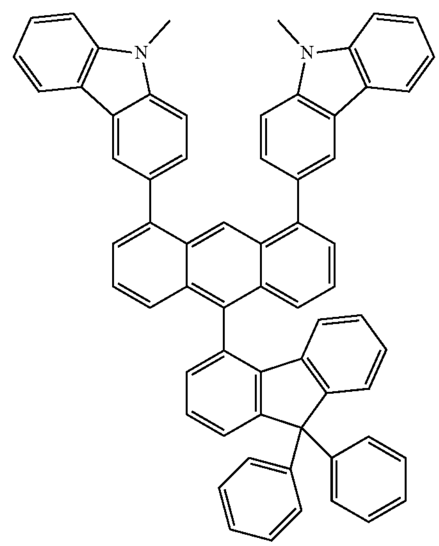
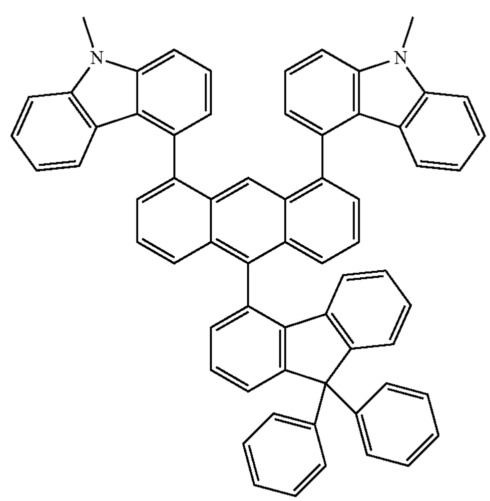

-continued
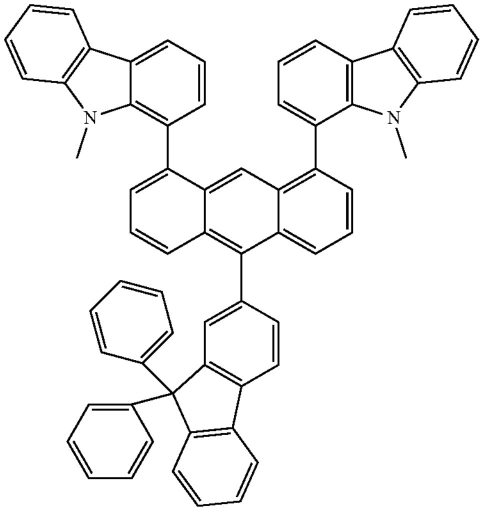
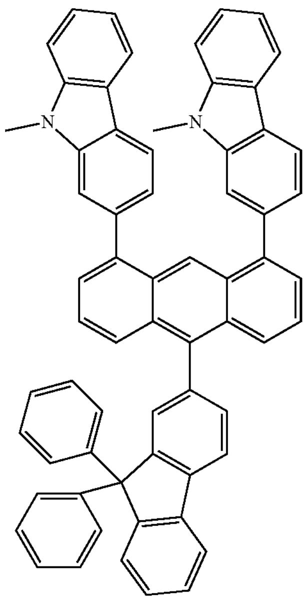
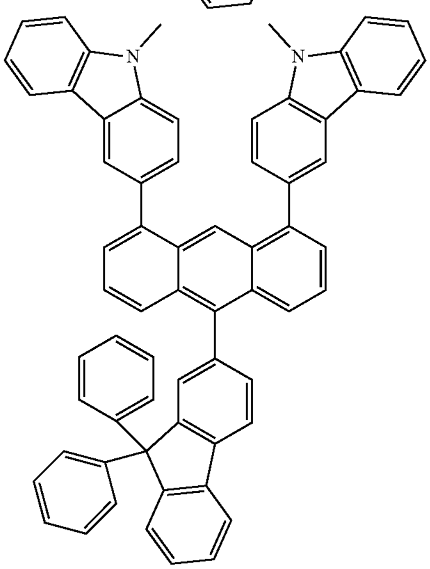
-continued
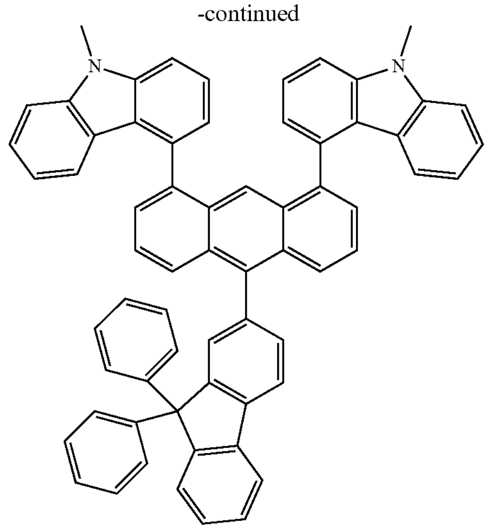
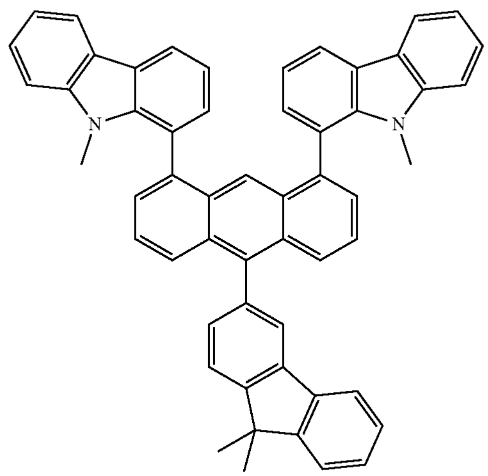
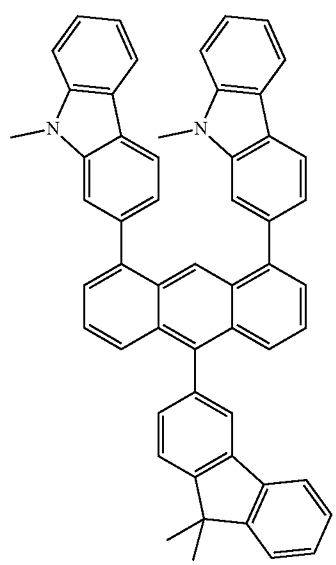

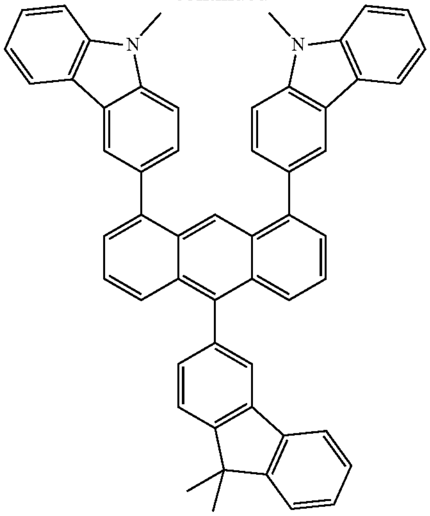
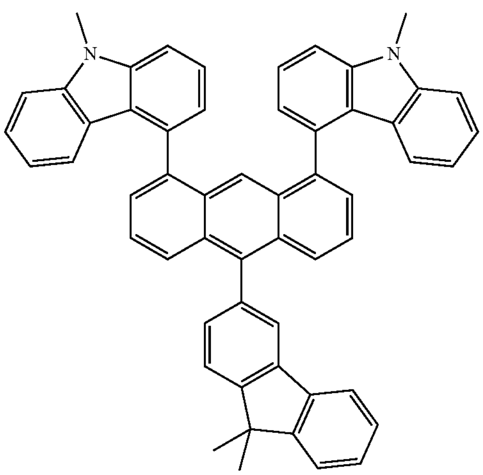
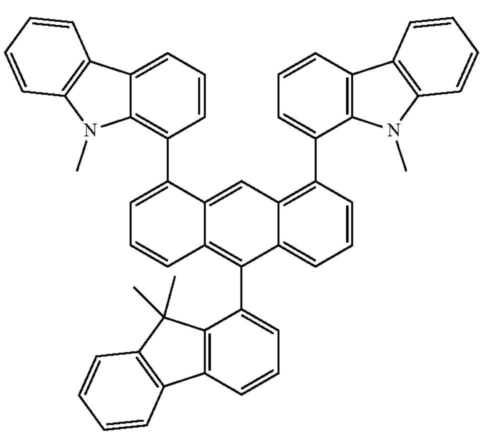
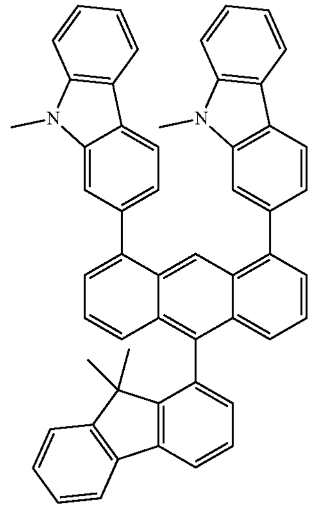
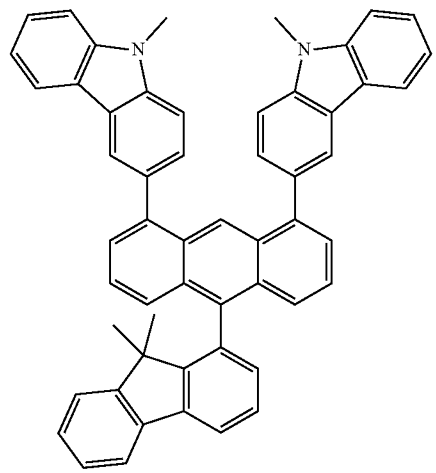
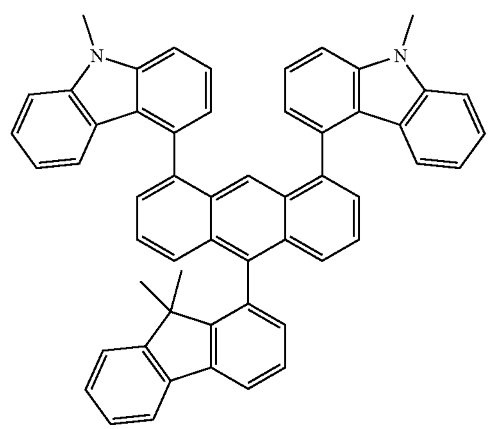
N
N

-continued
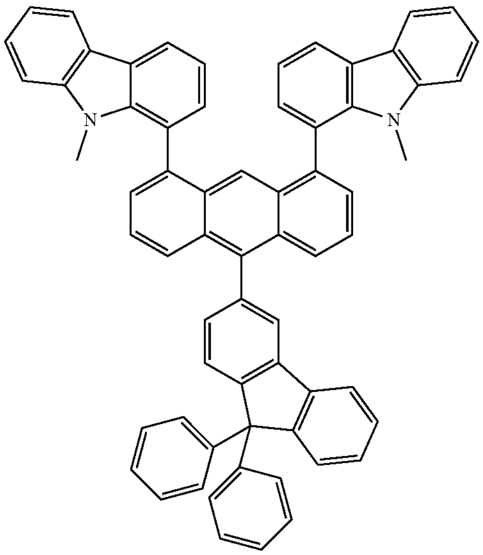
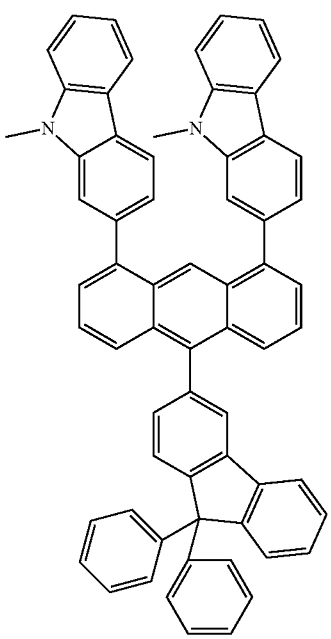
-continued
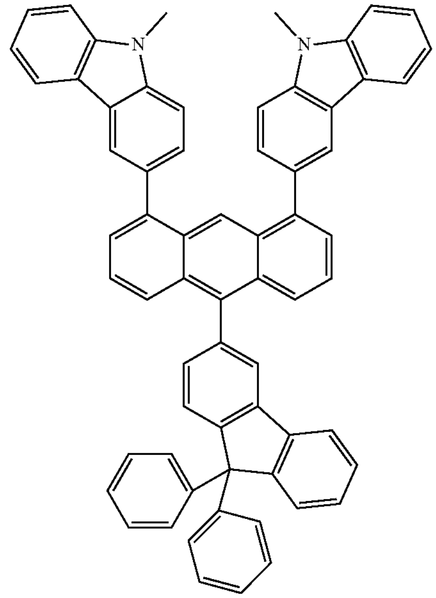
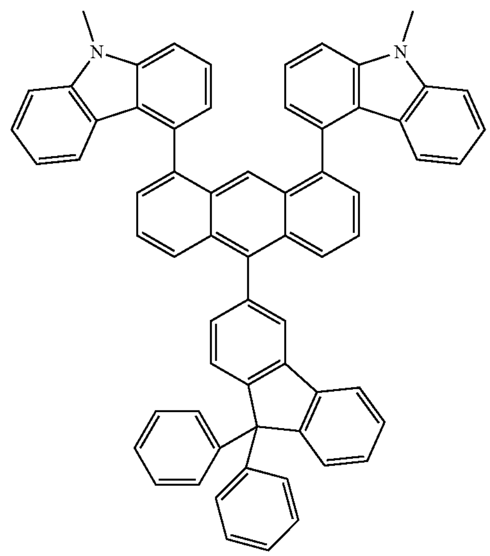
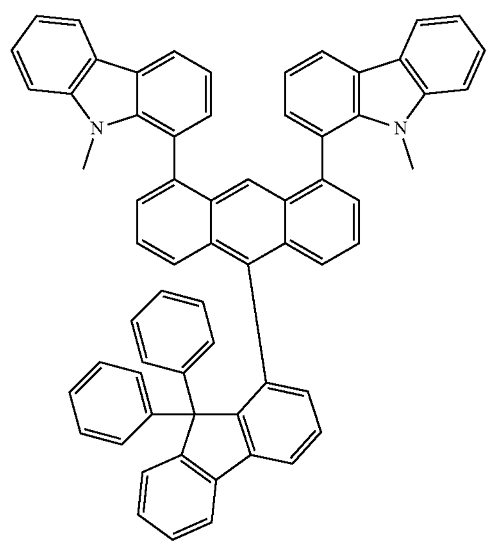

-continued
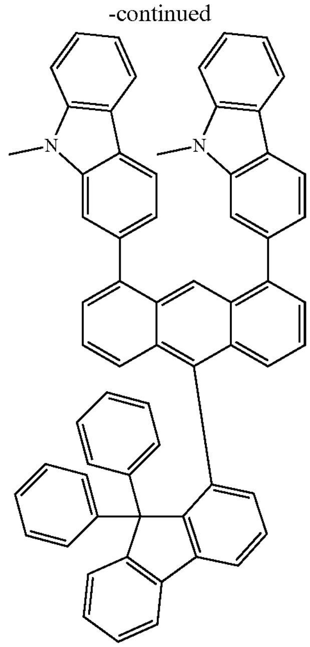
-continued
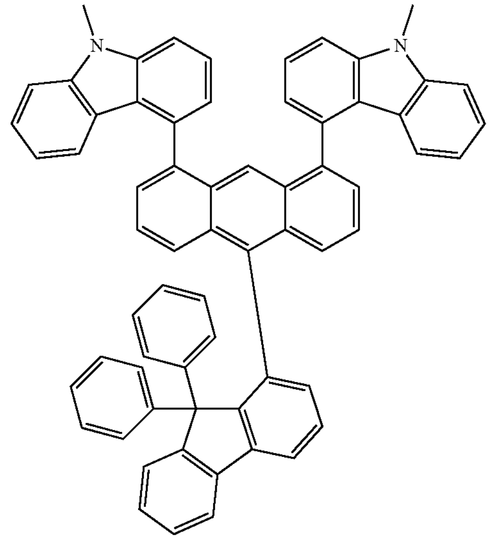
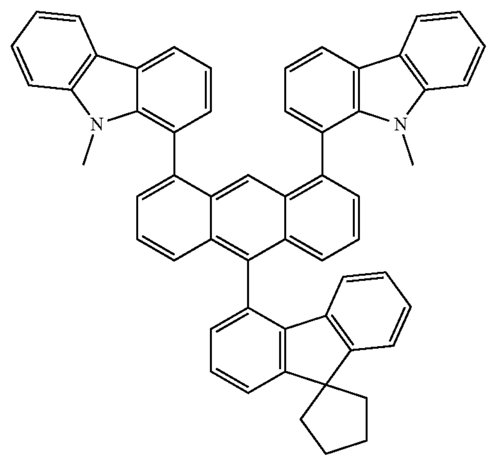
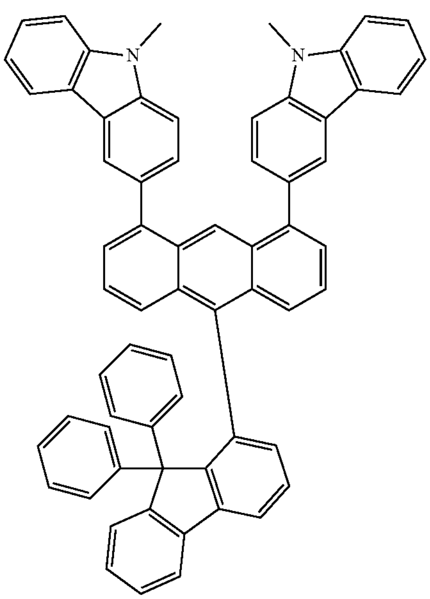
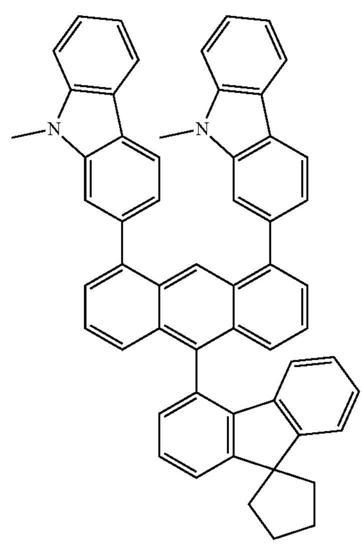

-continued
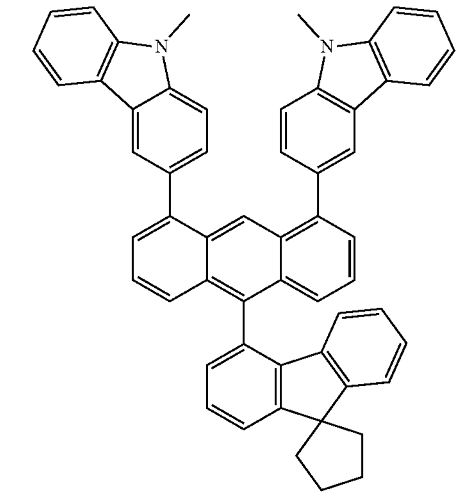
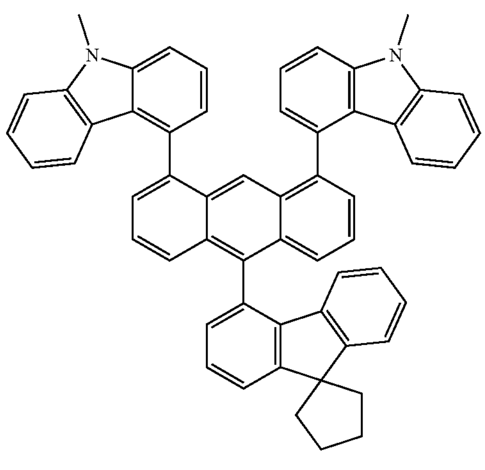
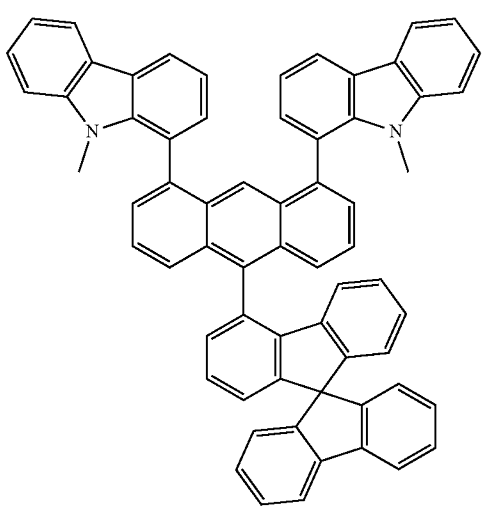
-continued
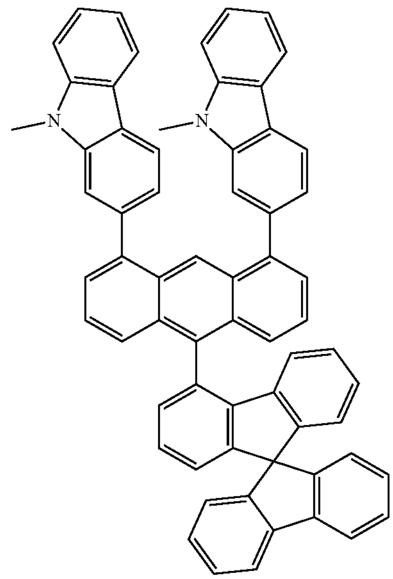
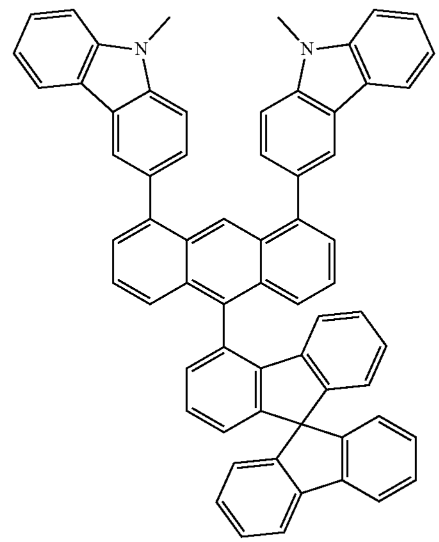
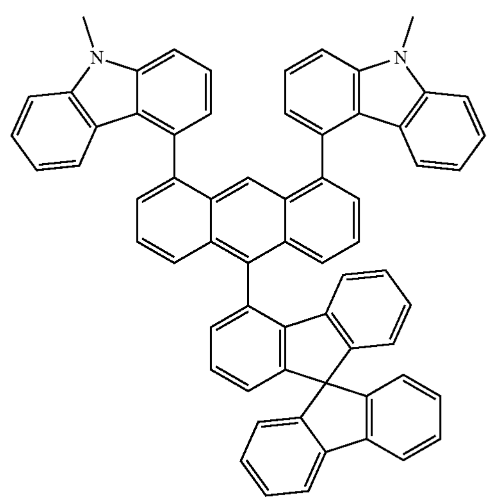

-continued
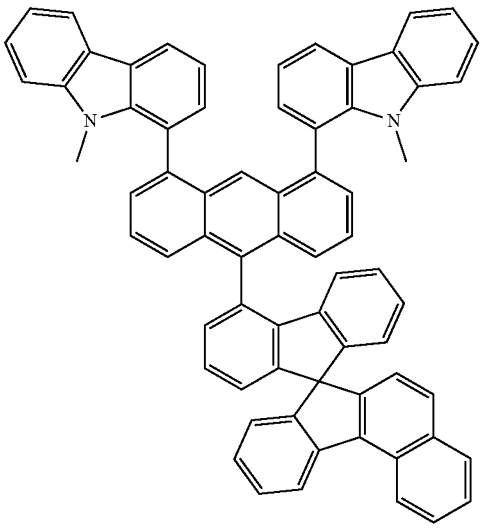
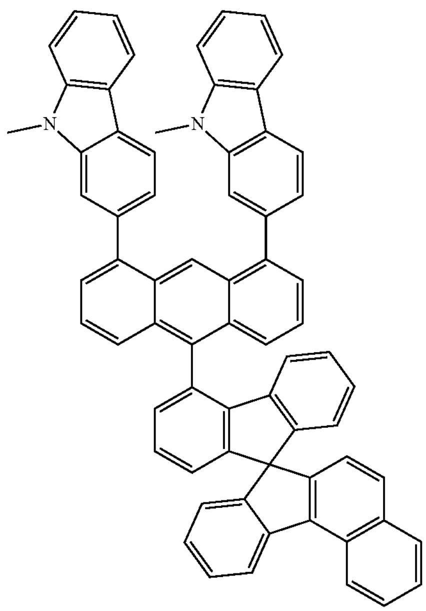
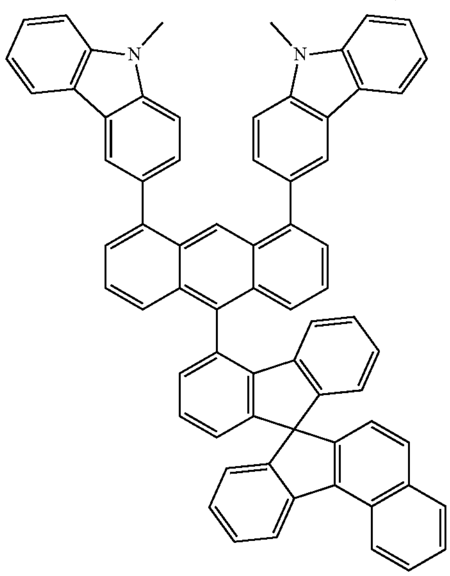
-continued
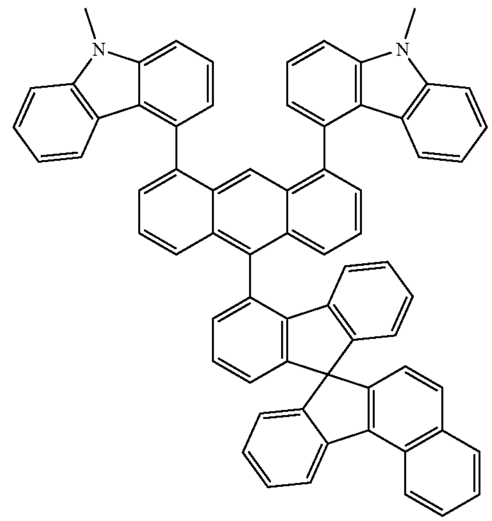
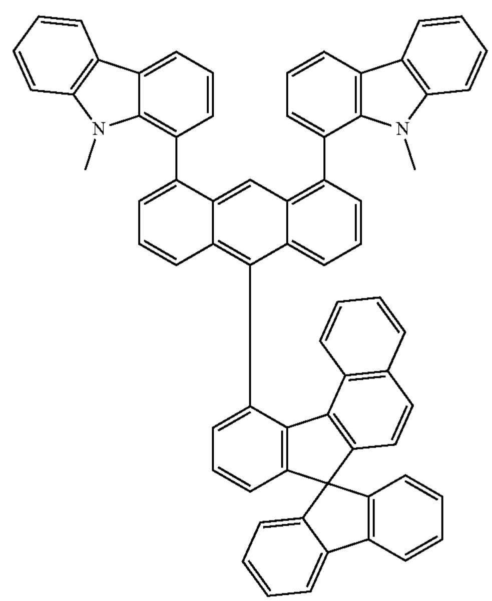

-continued
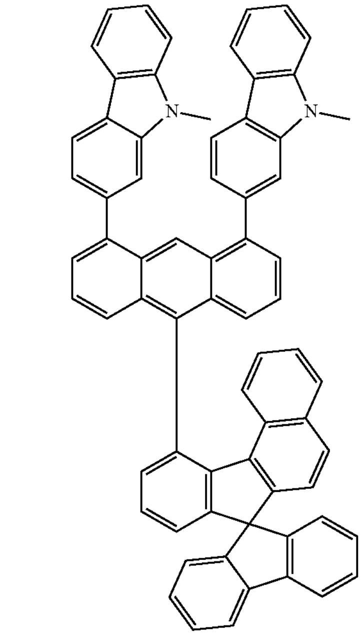
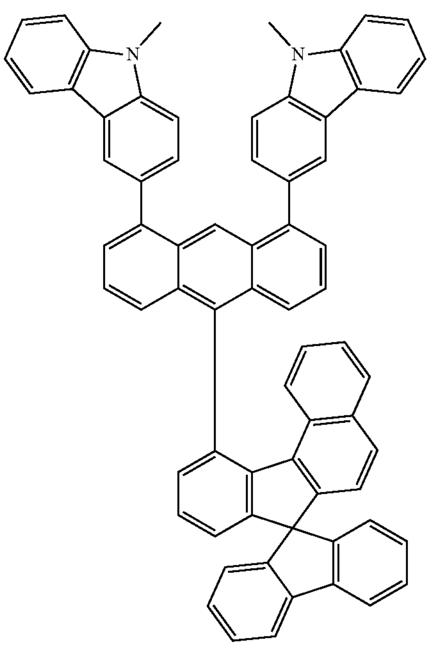
-continued
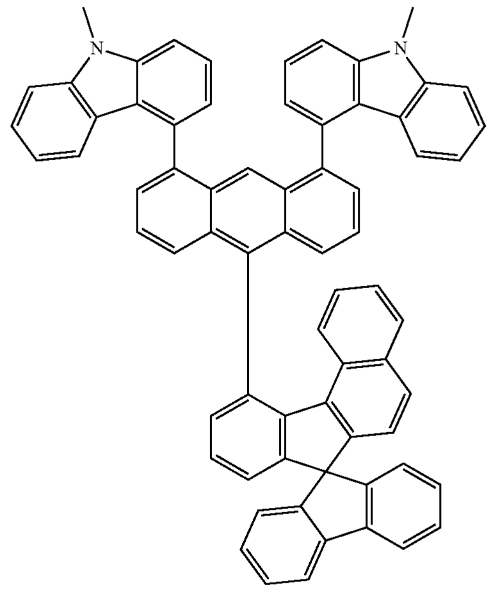
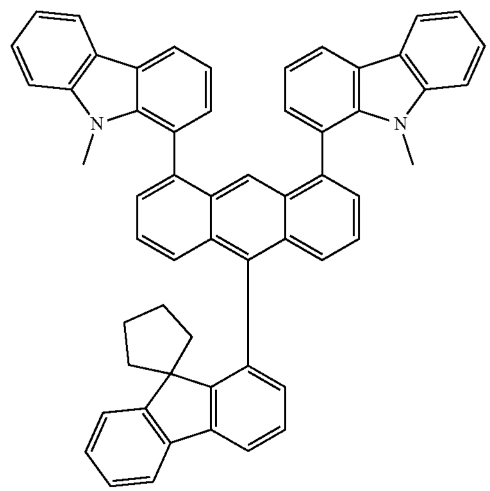
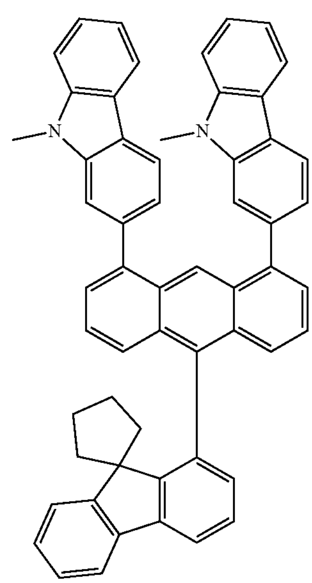

-continued
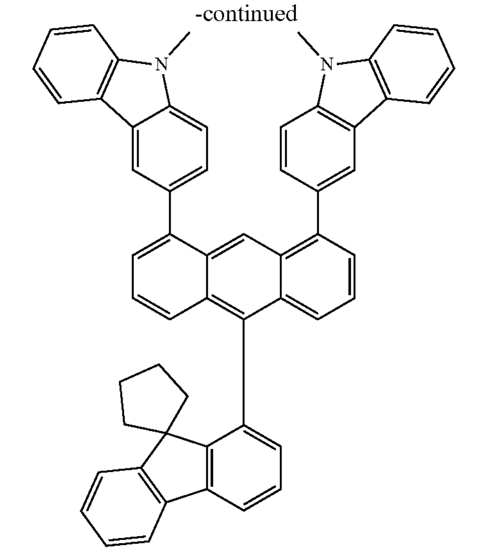
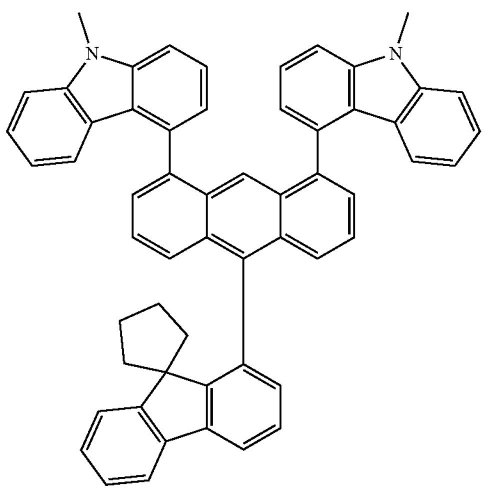
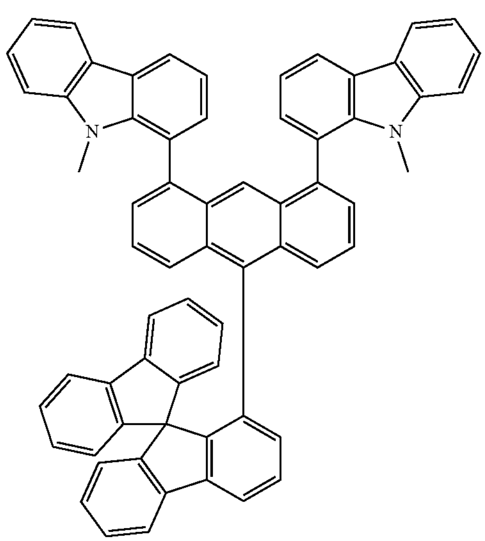
-continued
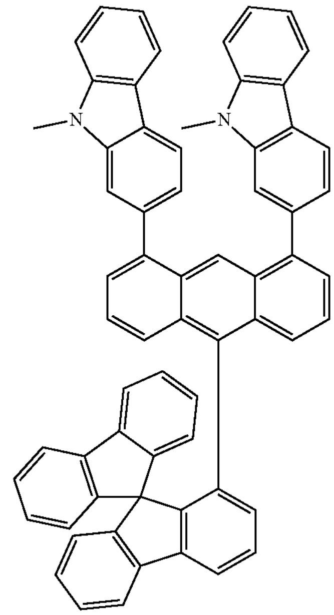
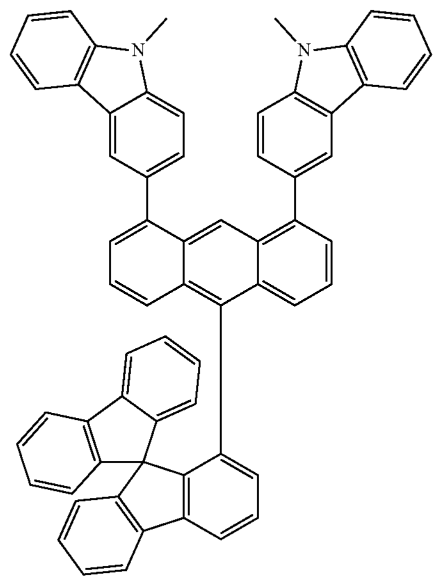
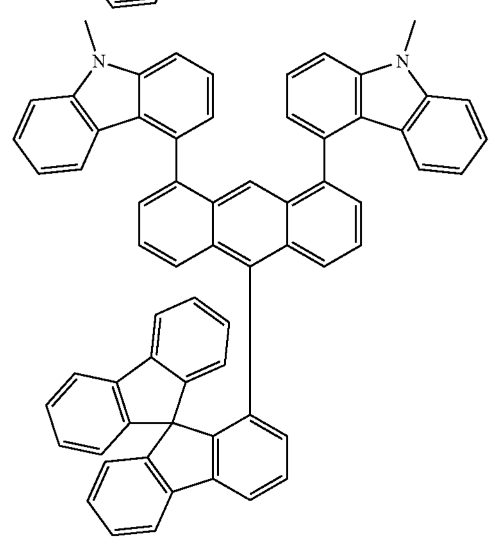

-continued
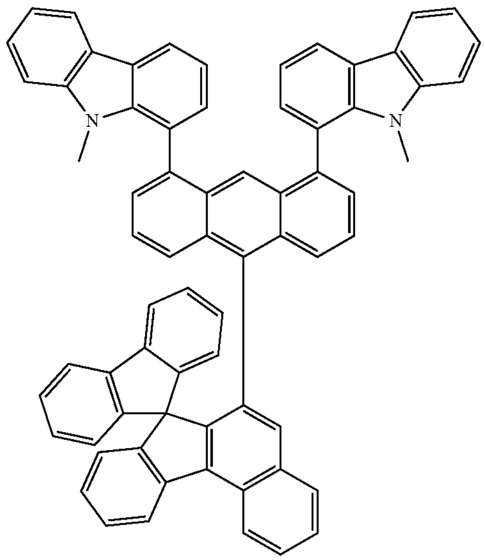
-continued
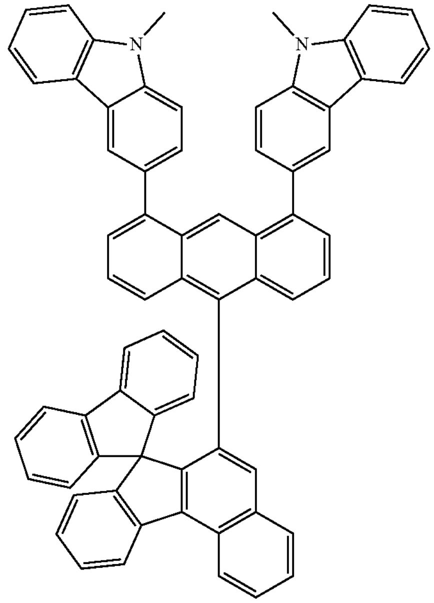
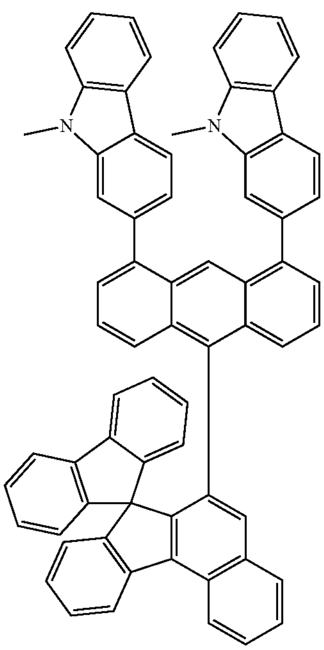
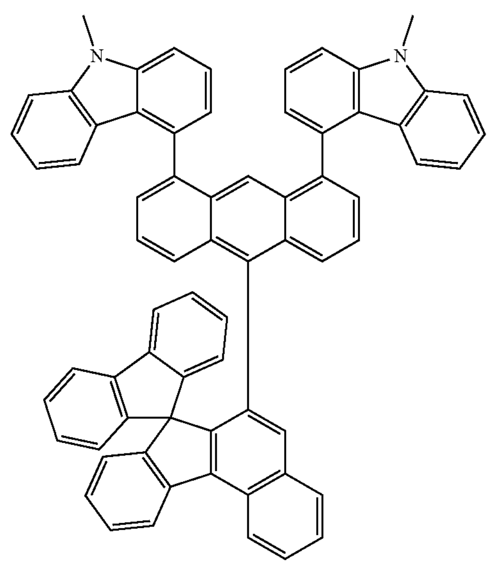

-continued
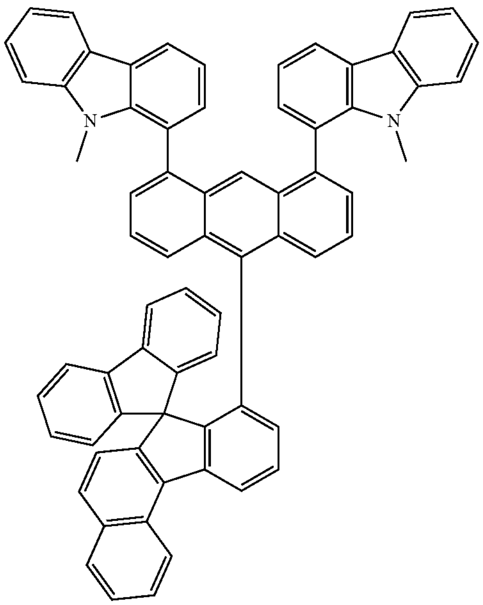
-continued
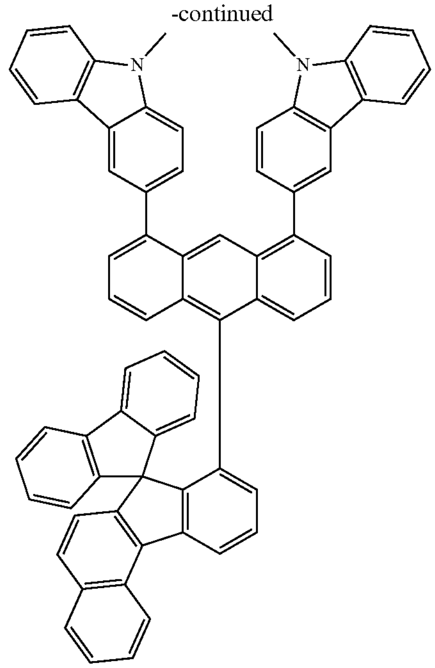
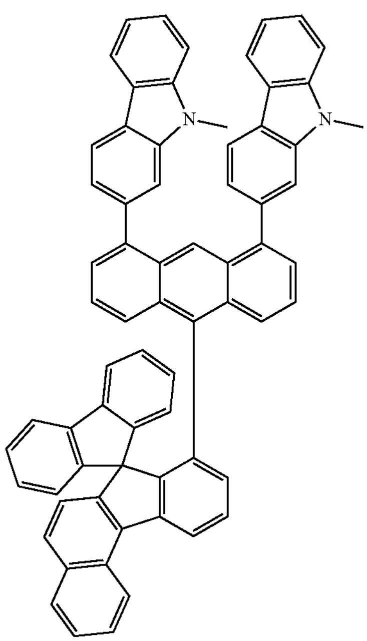
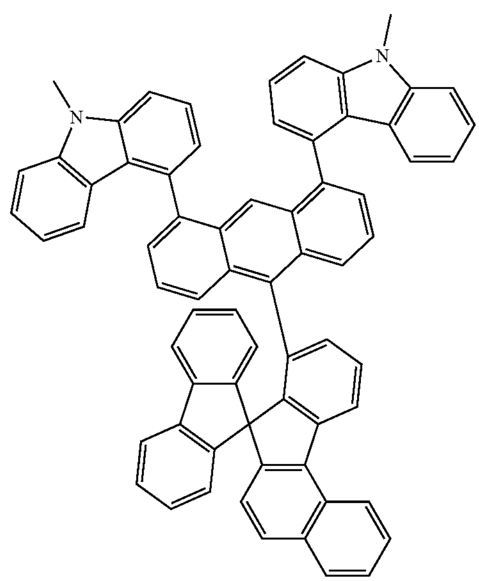

-continued
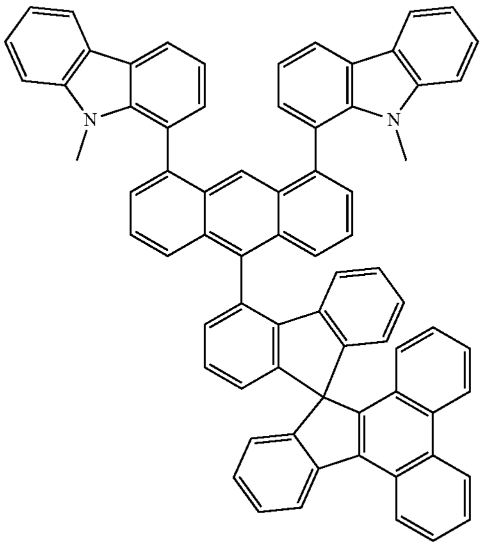
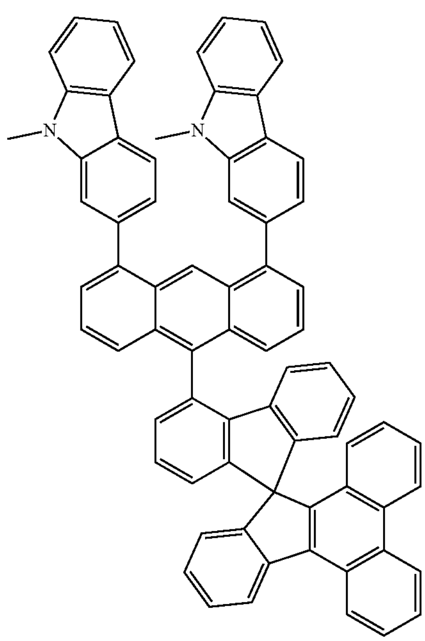
-continued
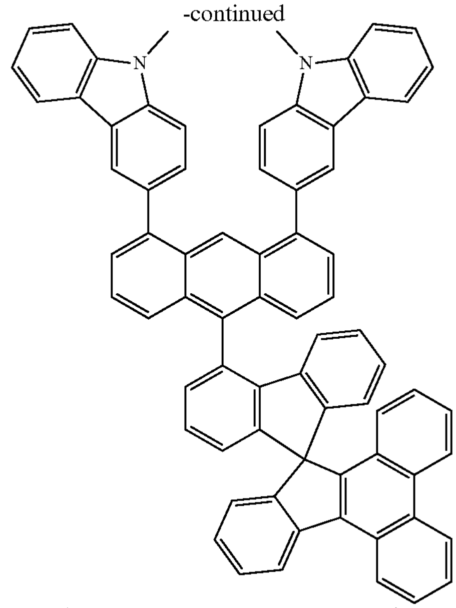
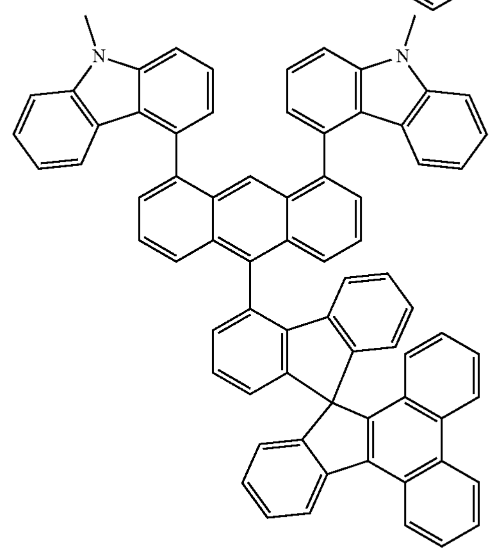
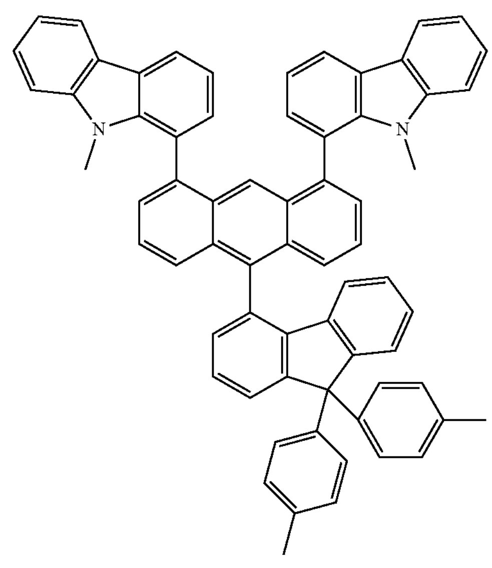

-continued
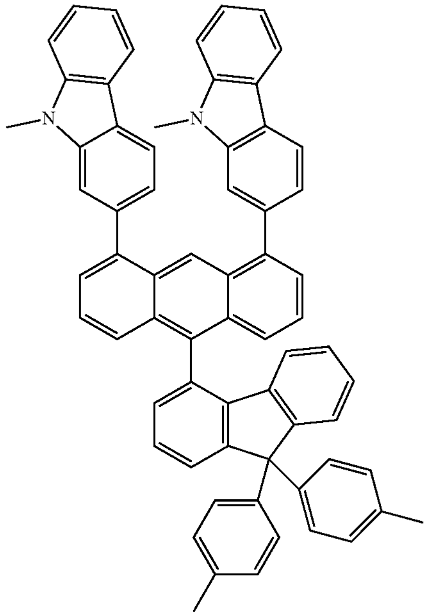
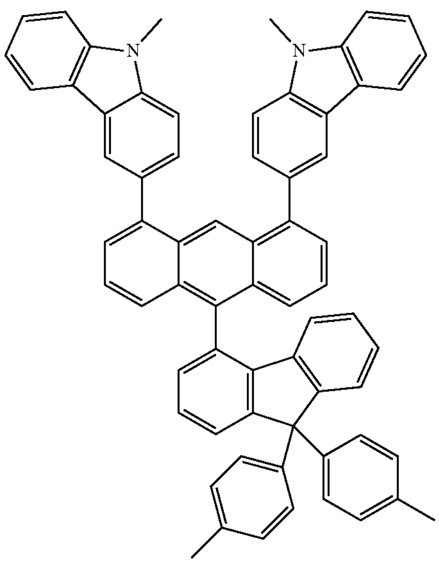
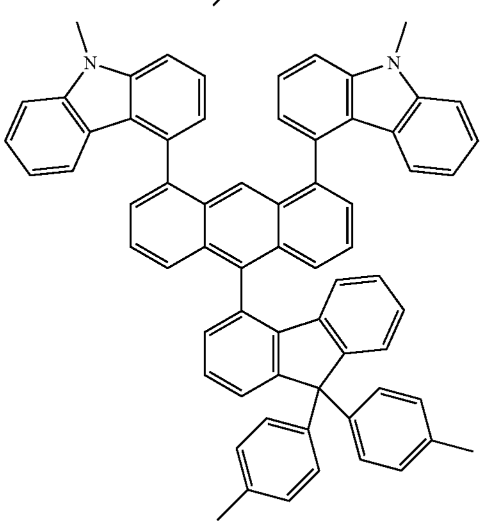
-continued
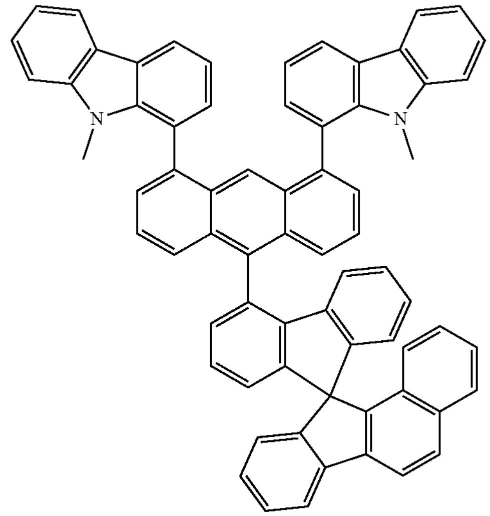
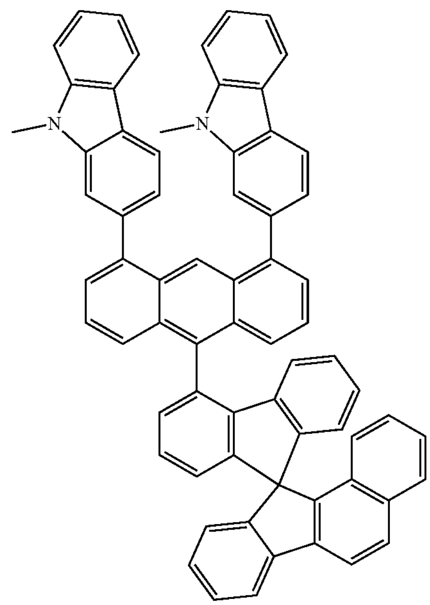
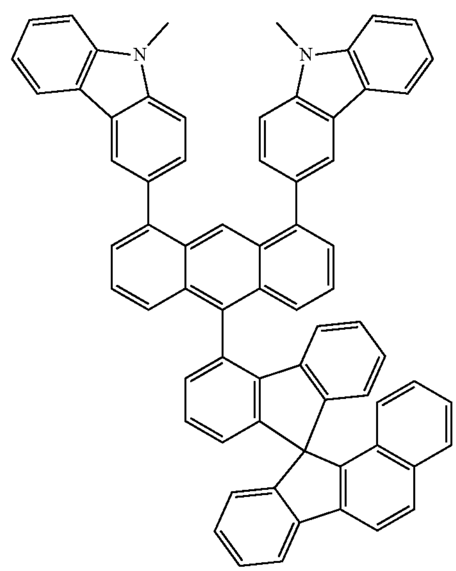

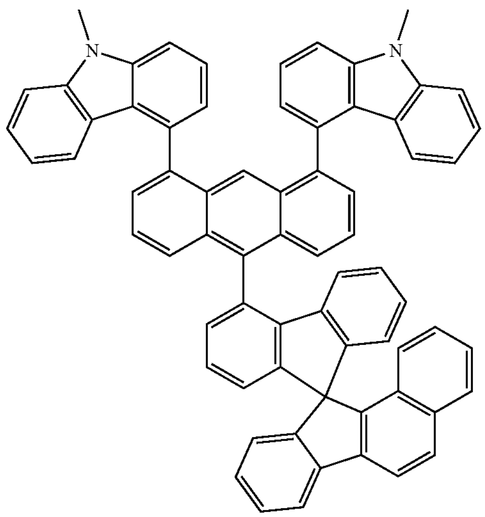
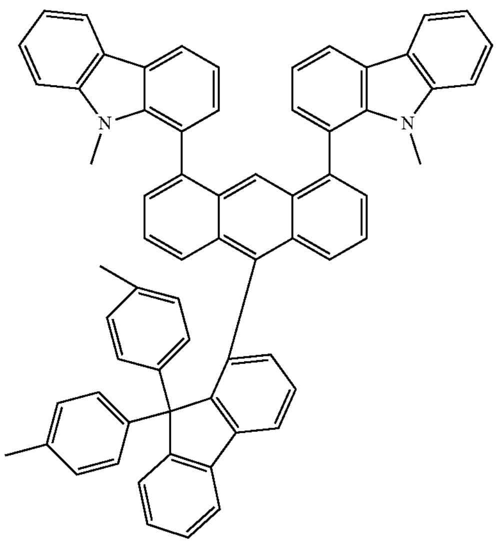
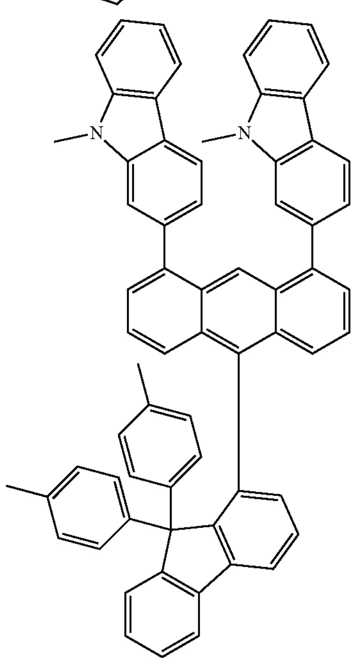
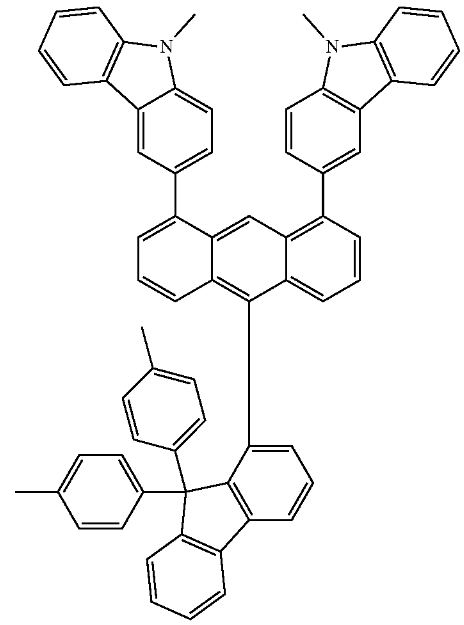
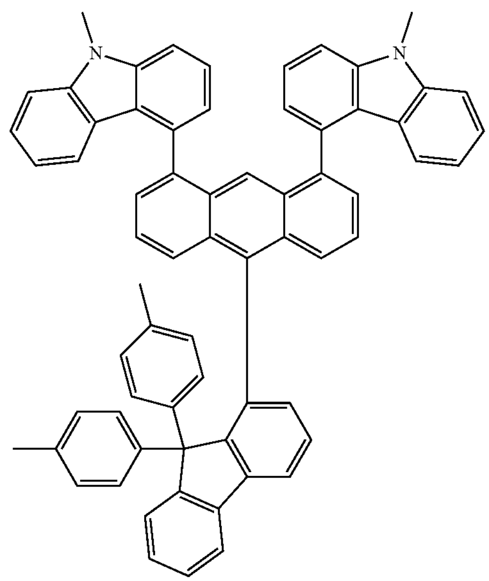
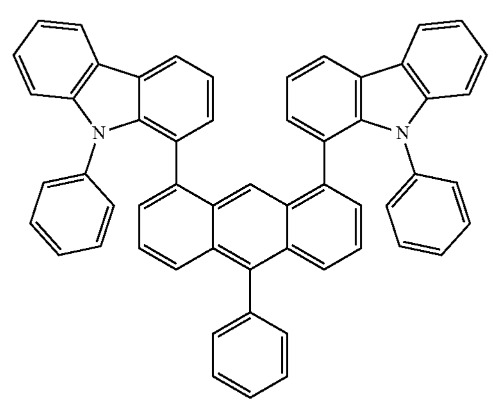

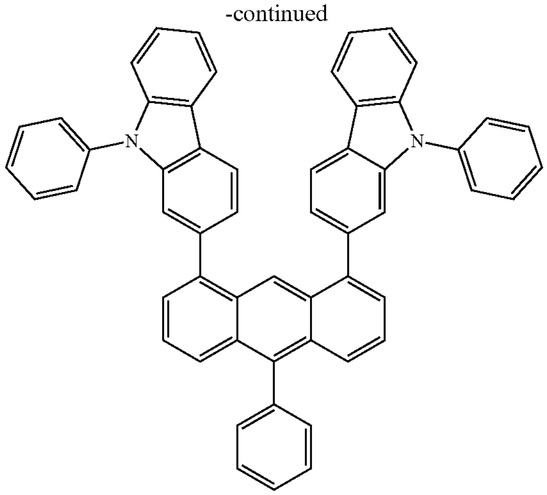
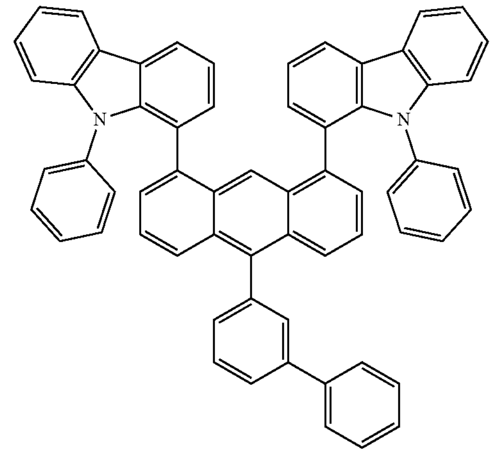
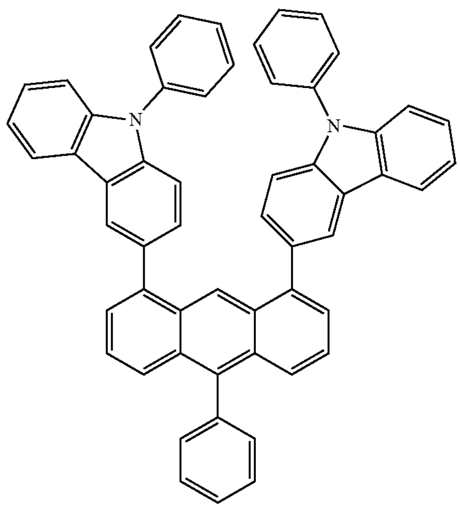
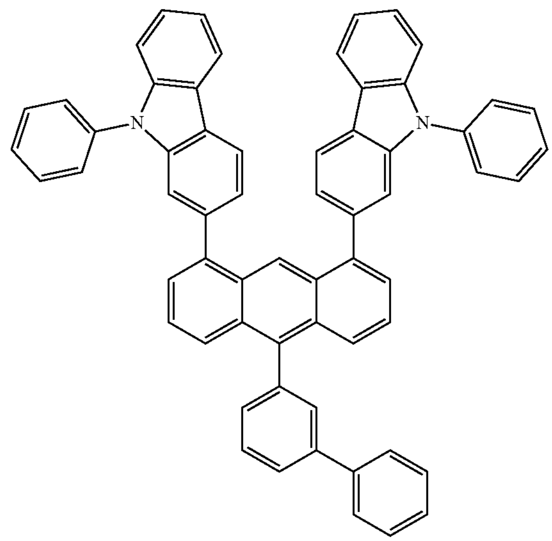
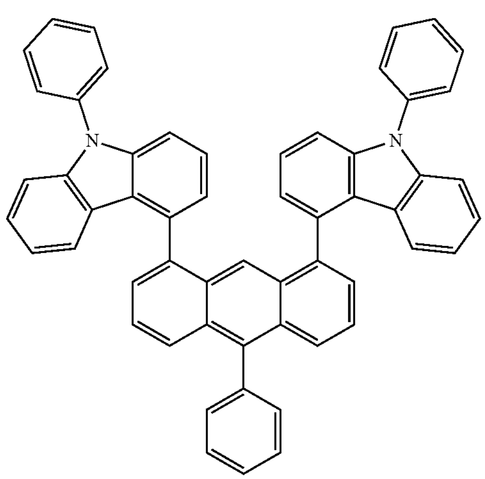
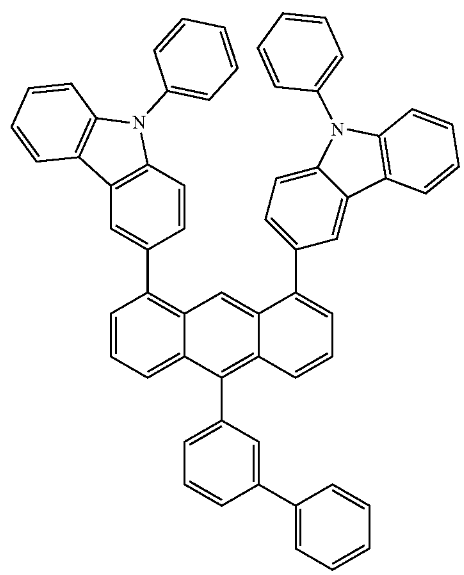

-continued
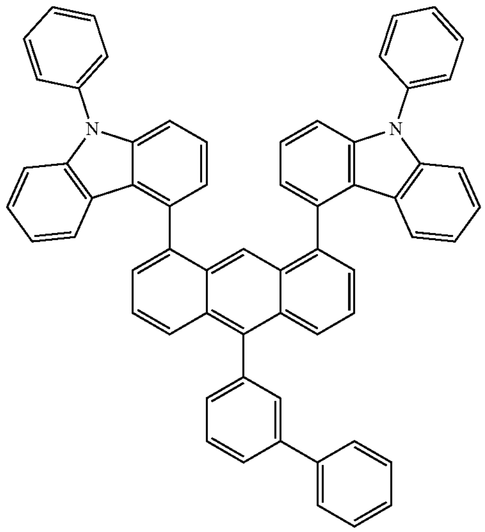
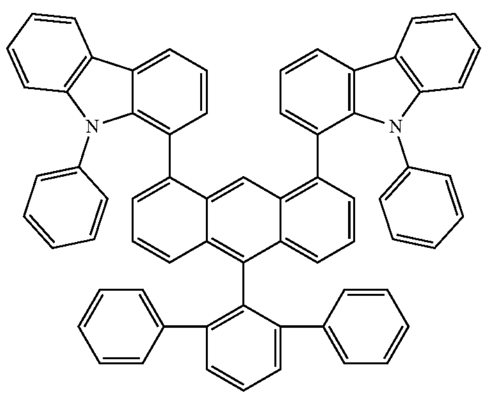
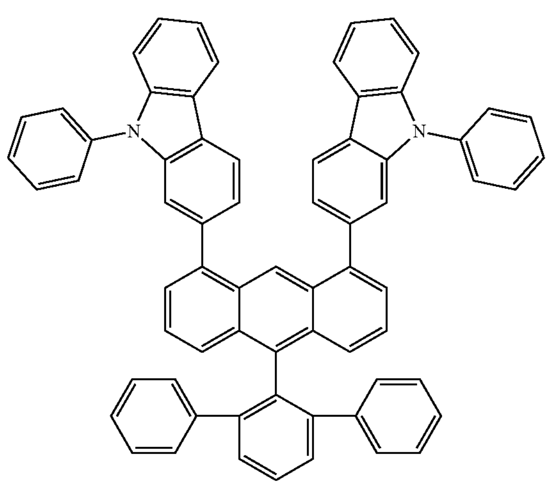
-continued
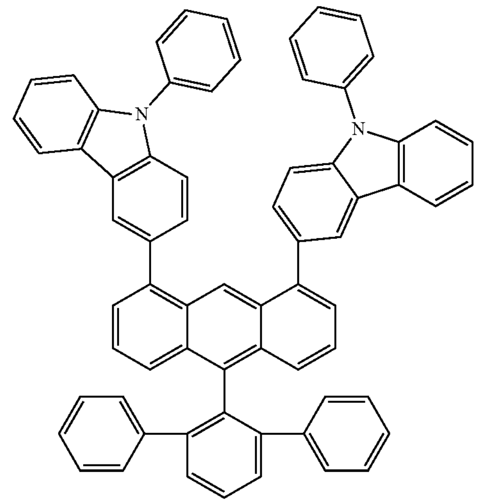
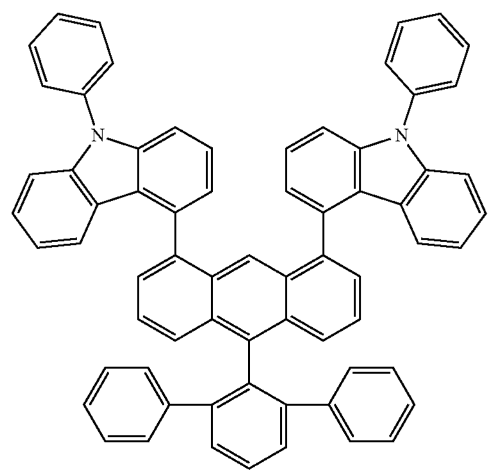
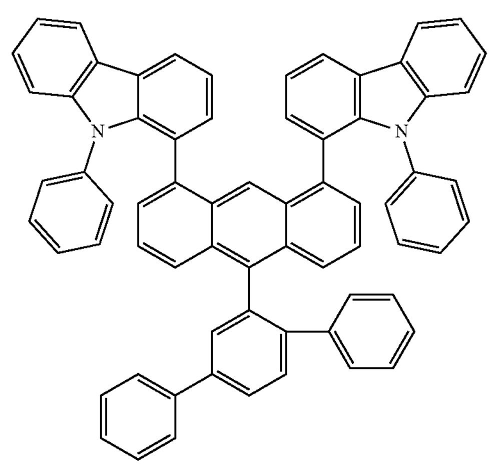

-continued
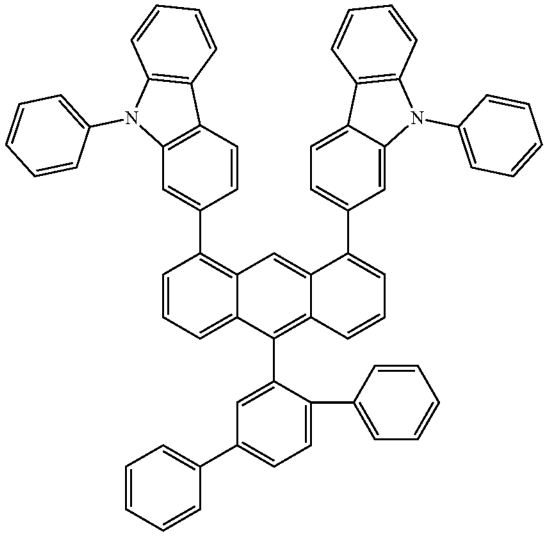
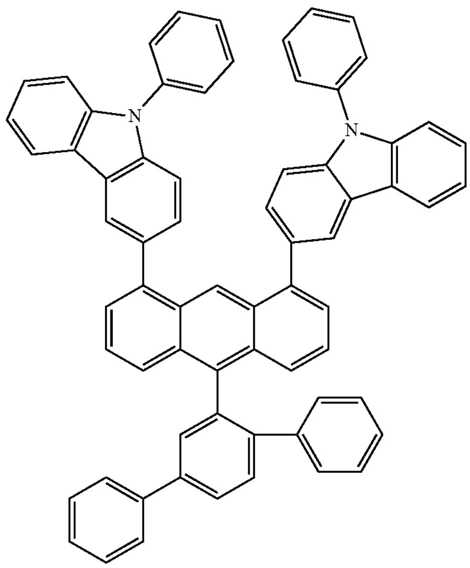
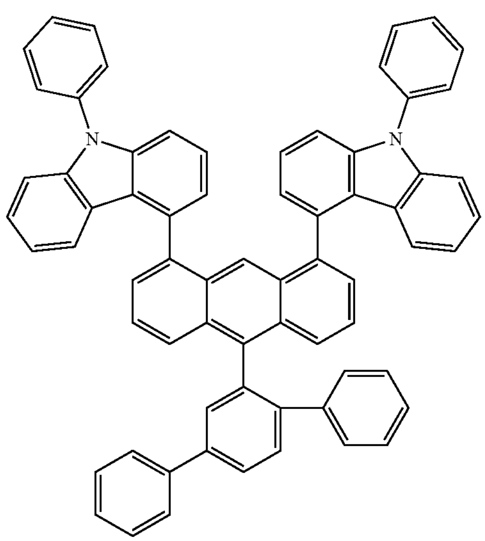
-continued
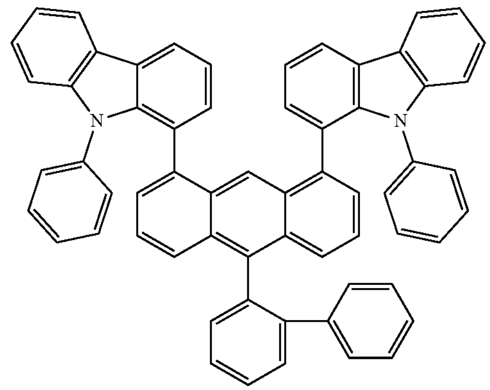
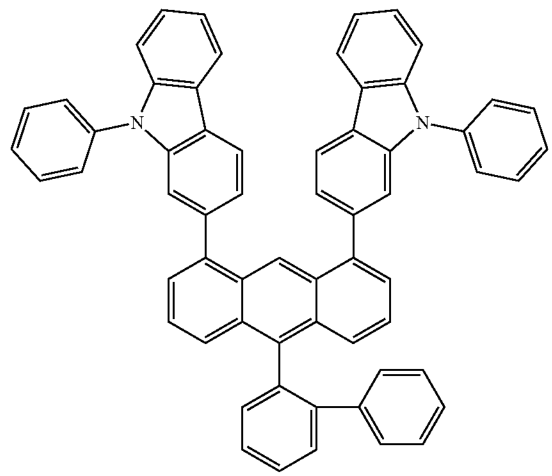
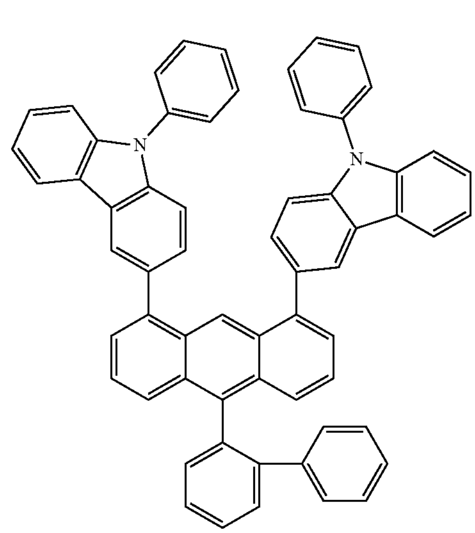

-continued
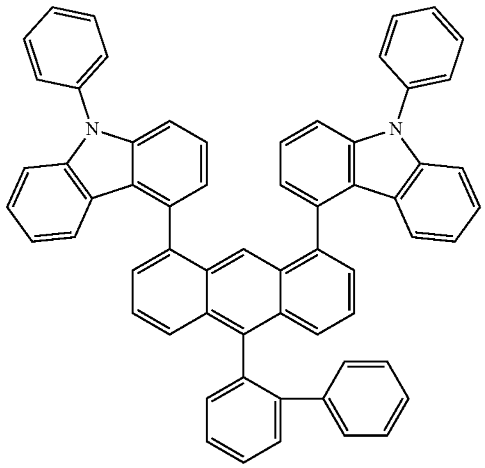
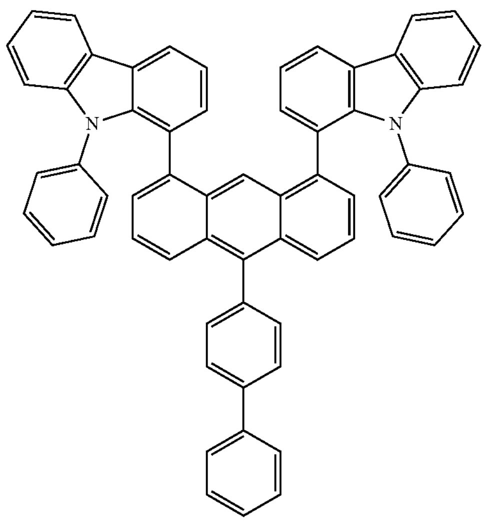
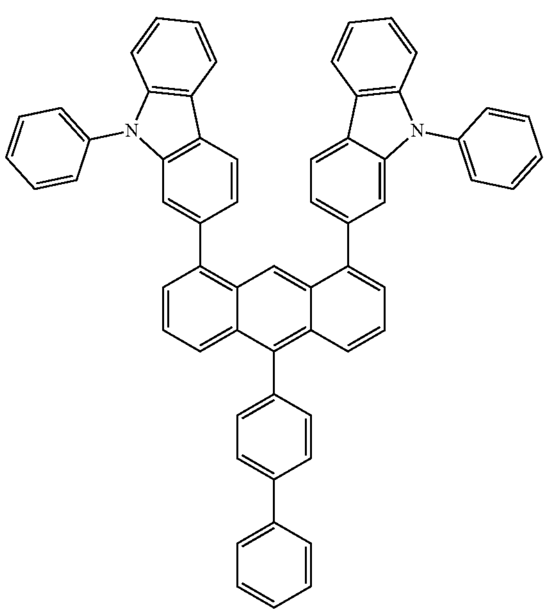
-continued
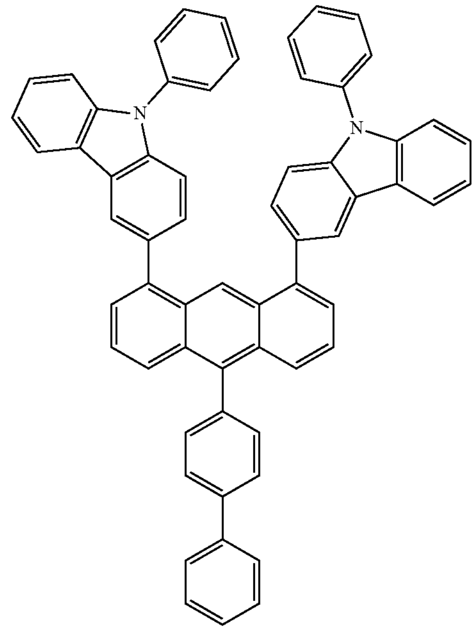
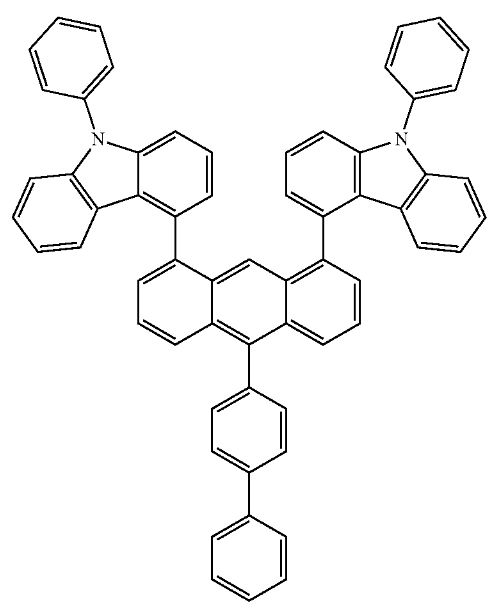

-continued
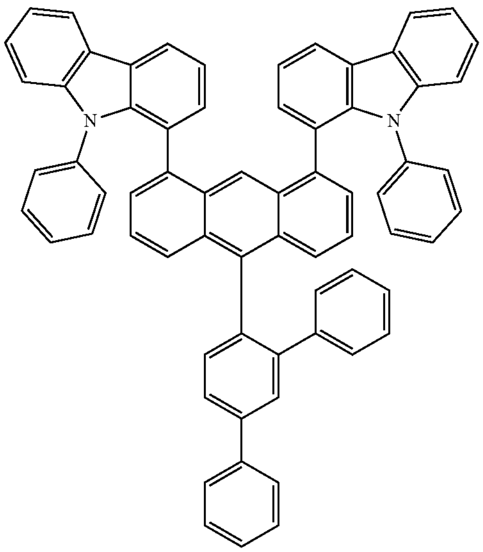
-continued
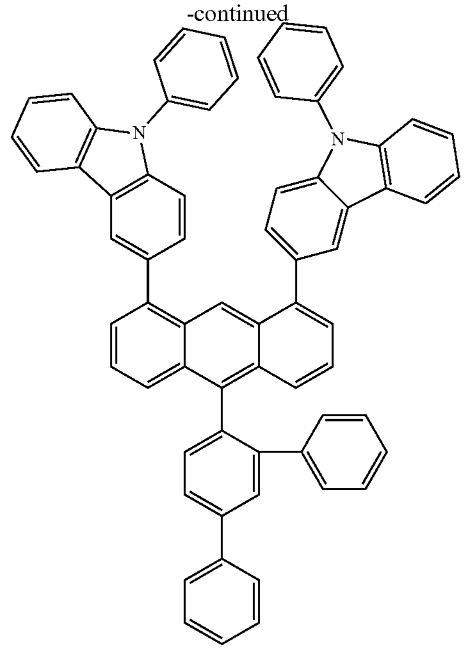
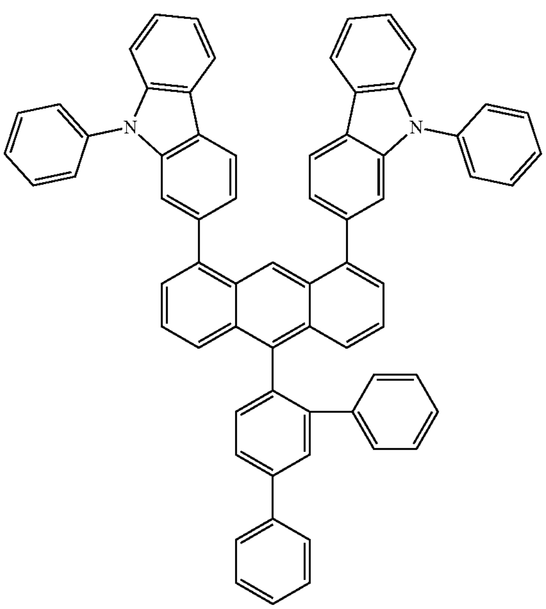
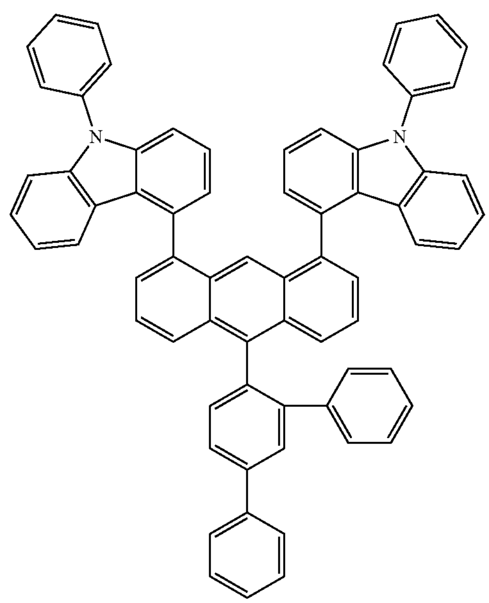

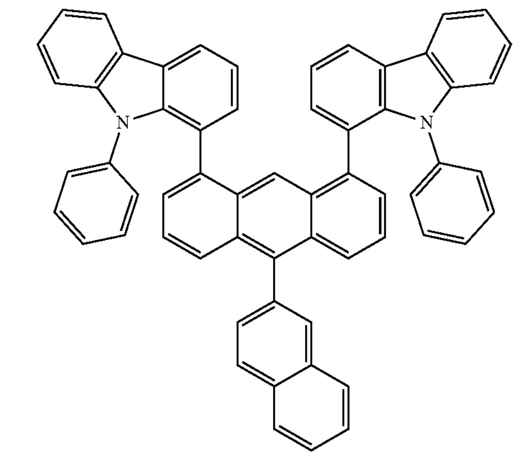
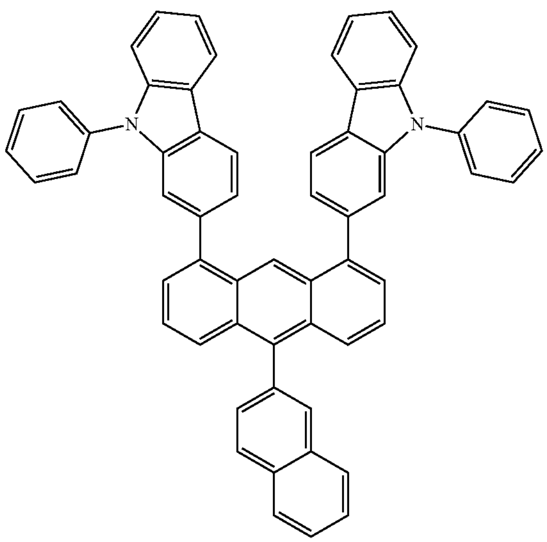
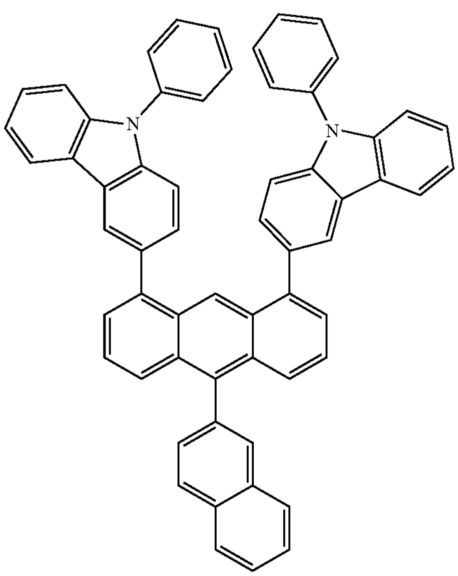
-continued
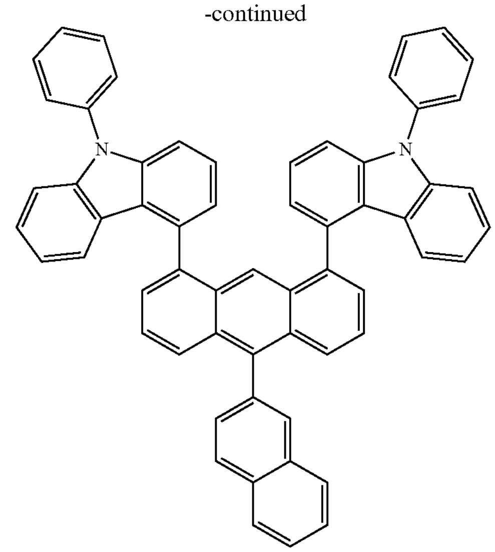
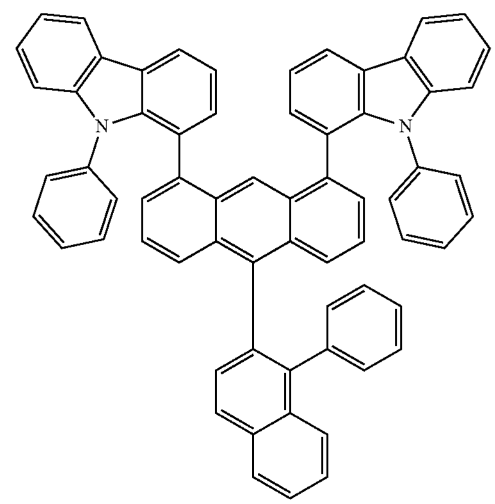
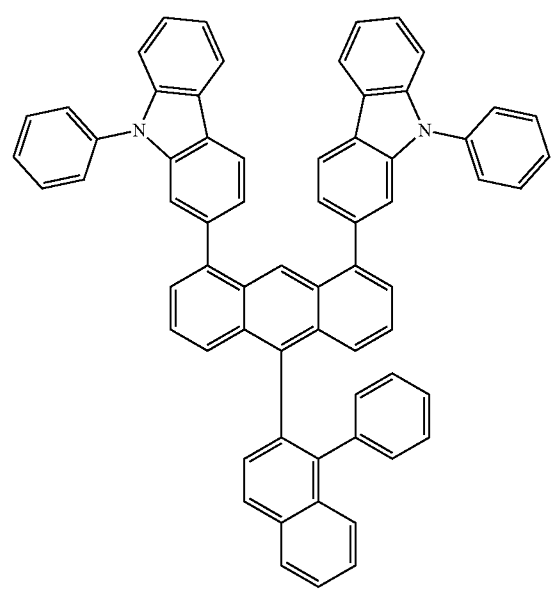

-continued
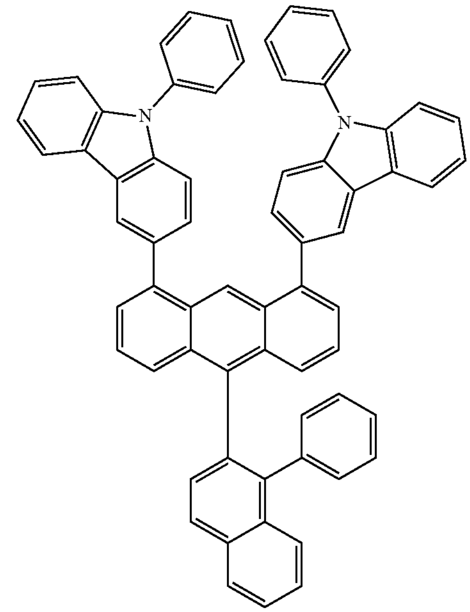
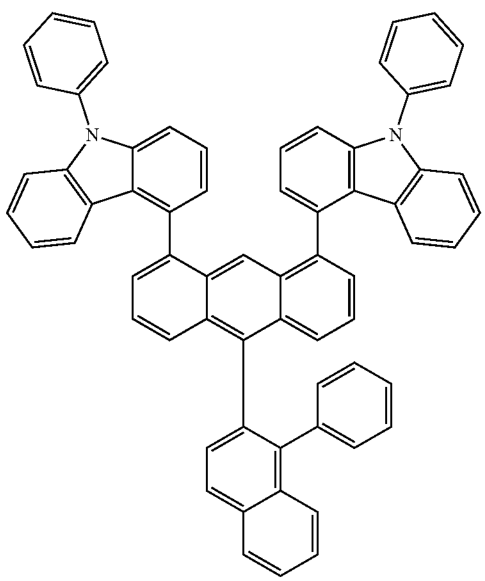
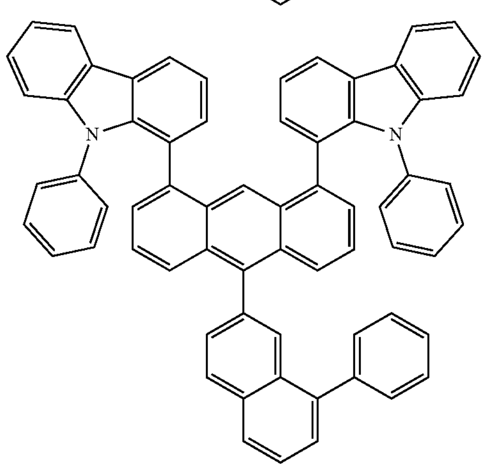
-continued
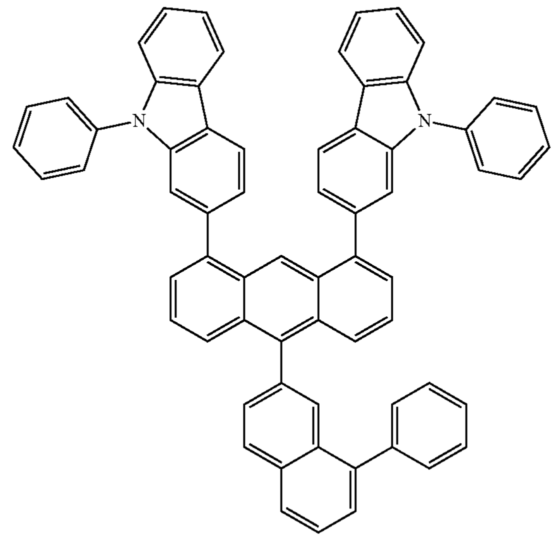
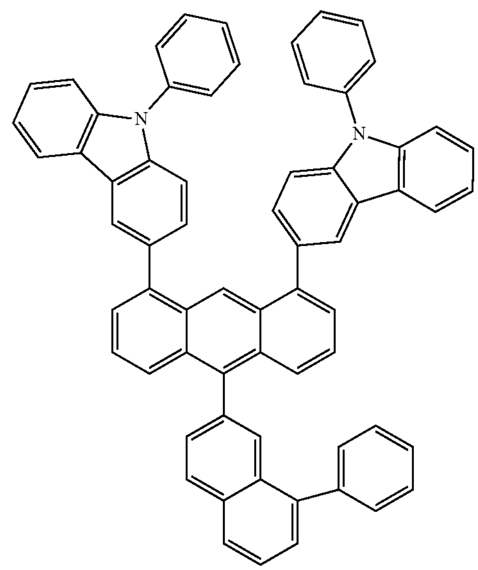
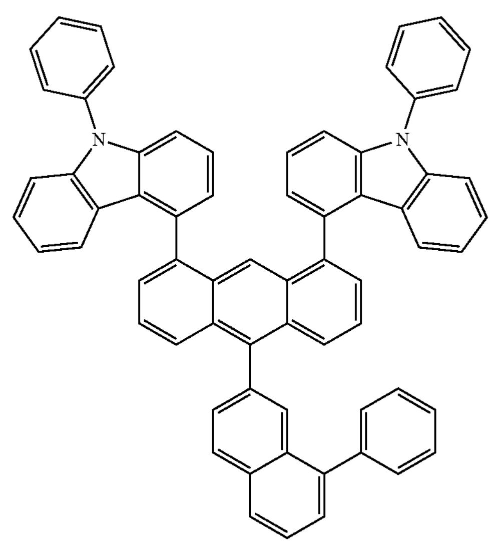

-continued
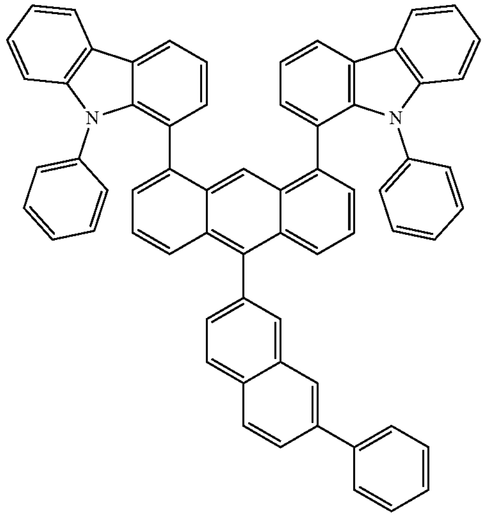
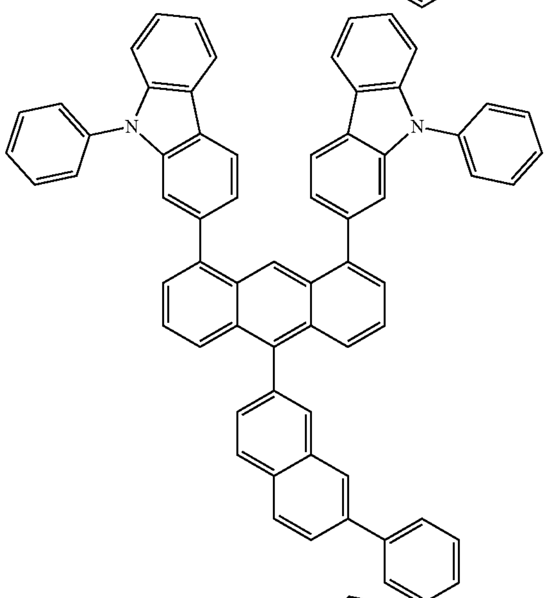
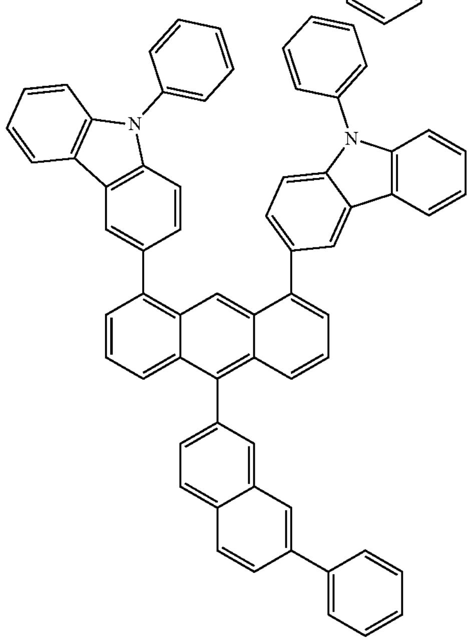
-continued
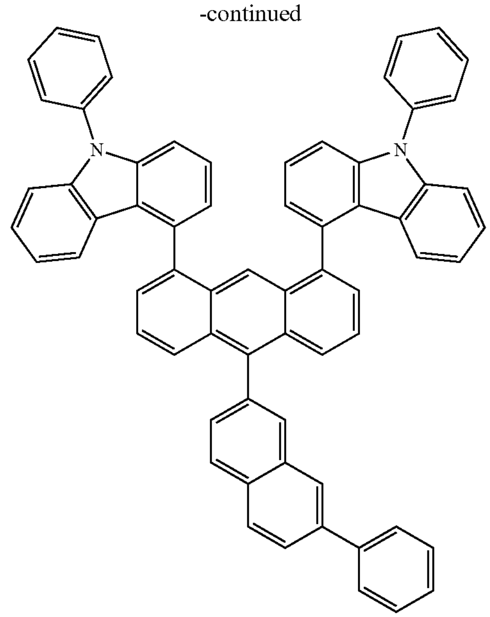
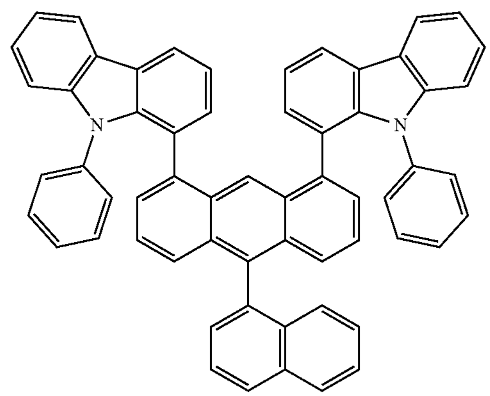
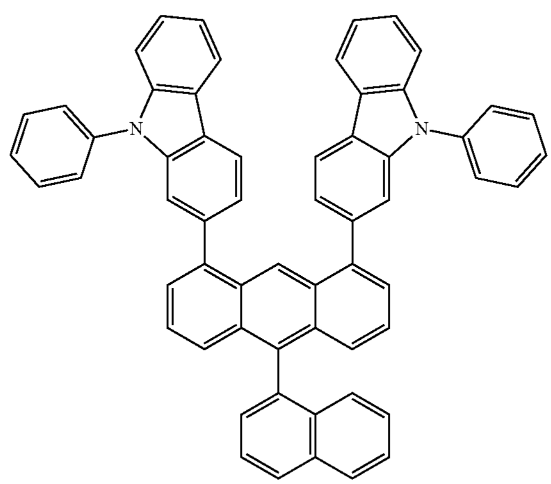

-continued
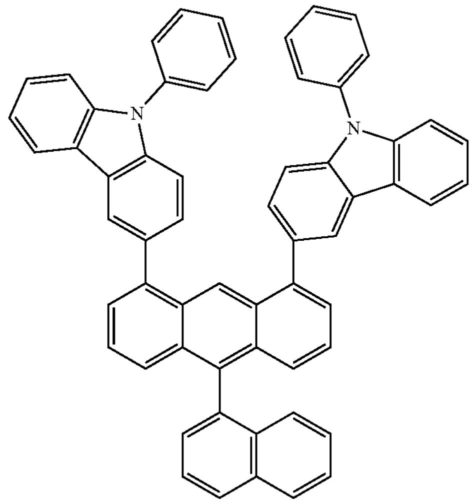
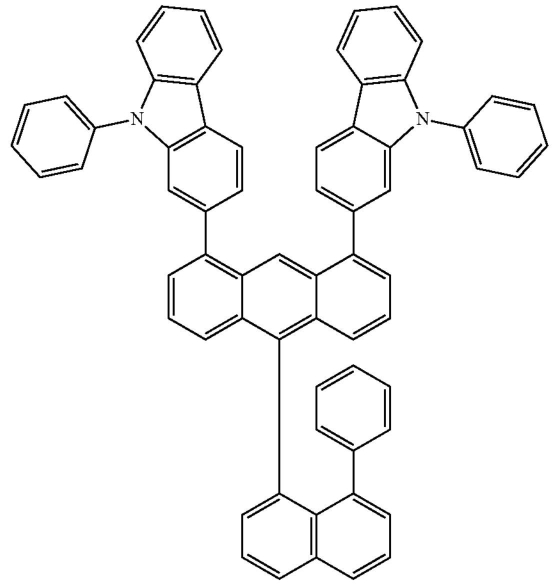
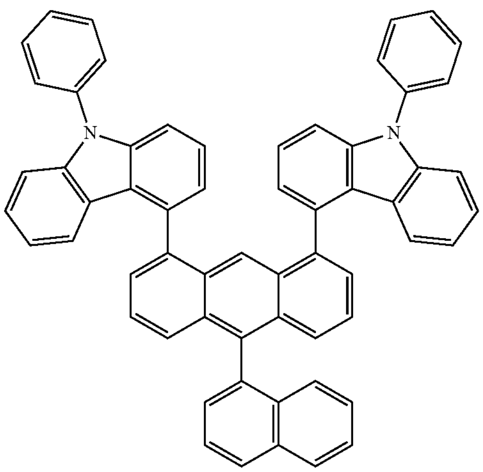
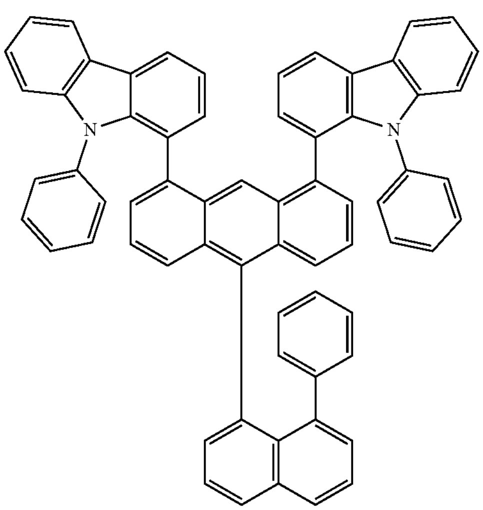
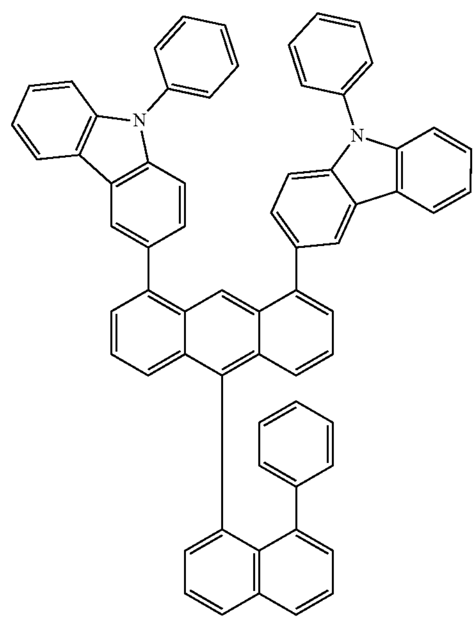

-continued
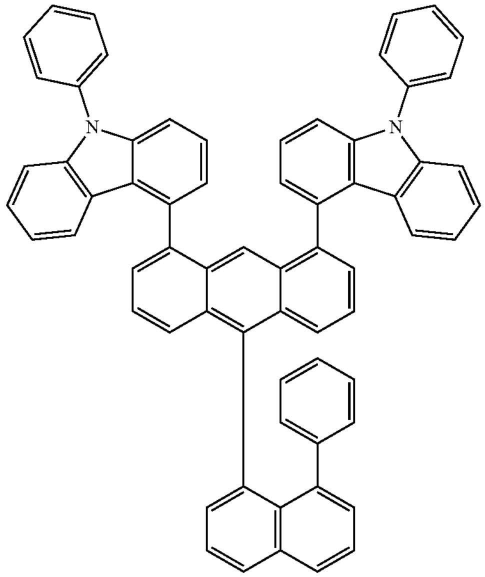
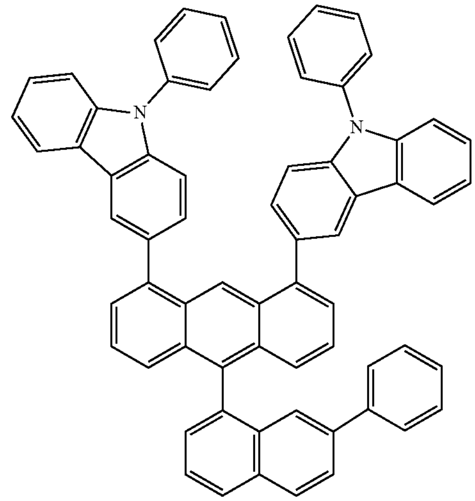
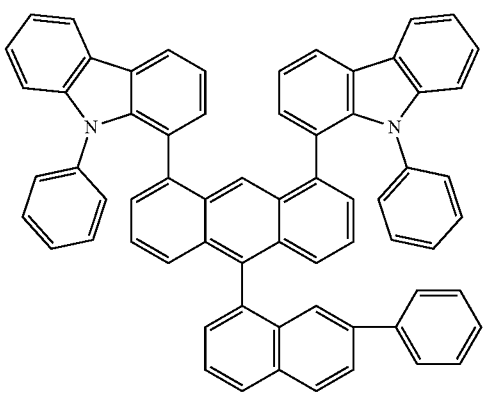
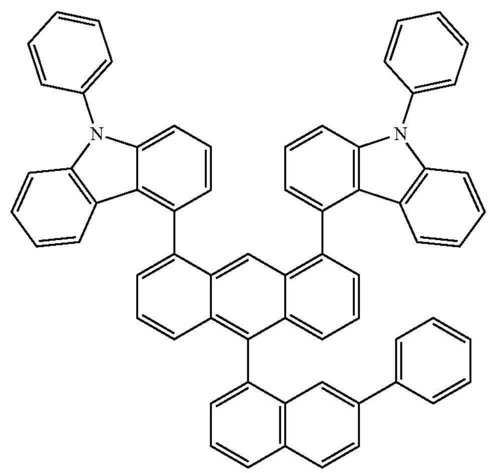
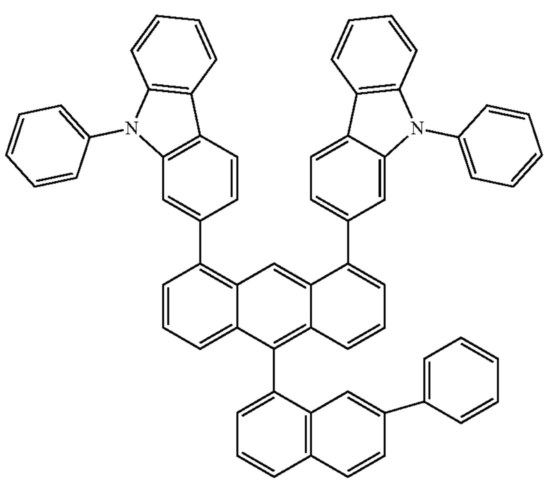
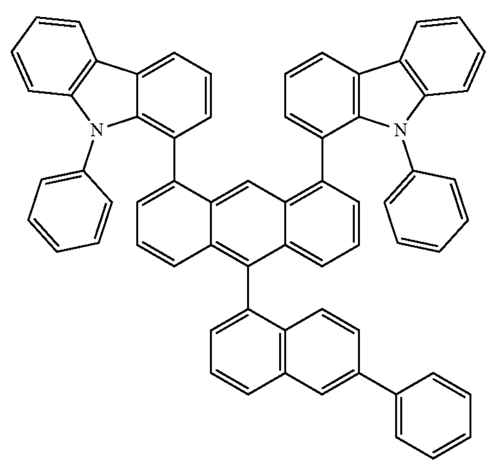

-continued
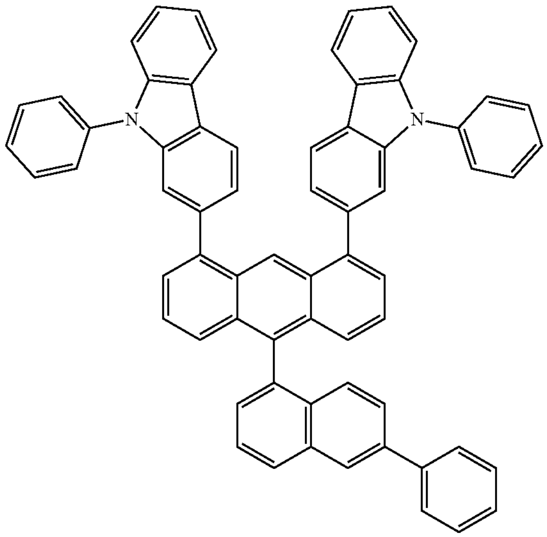
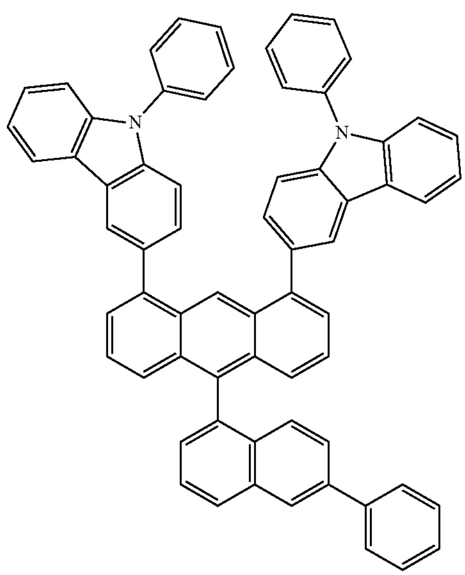
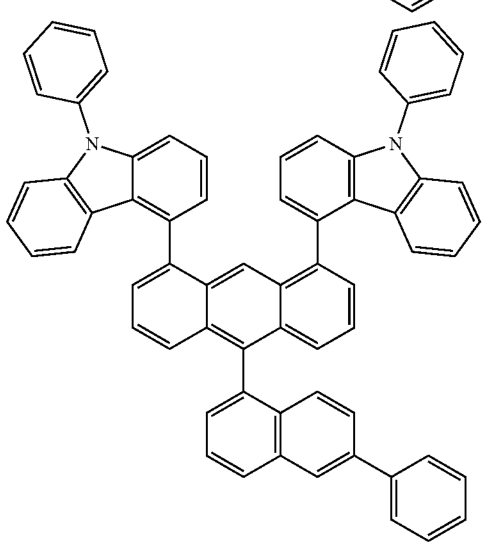
-continued
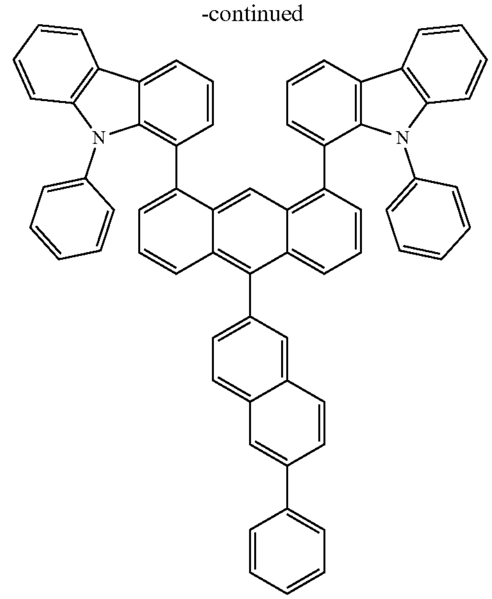
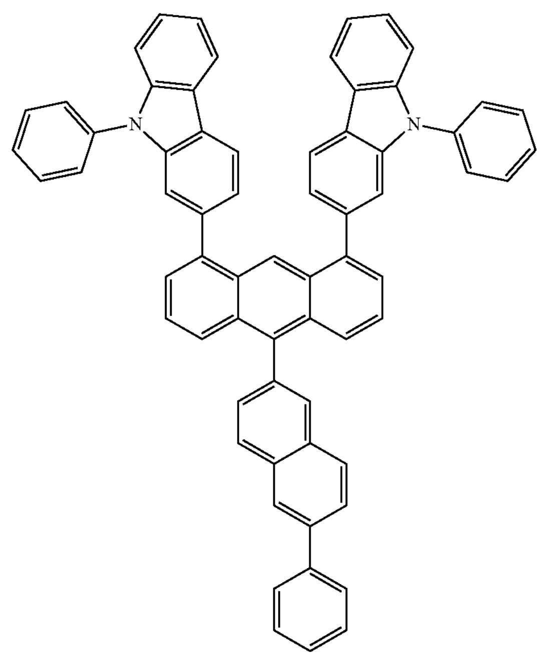

-continued
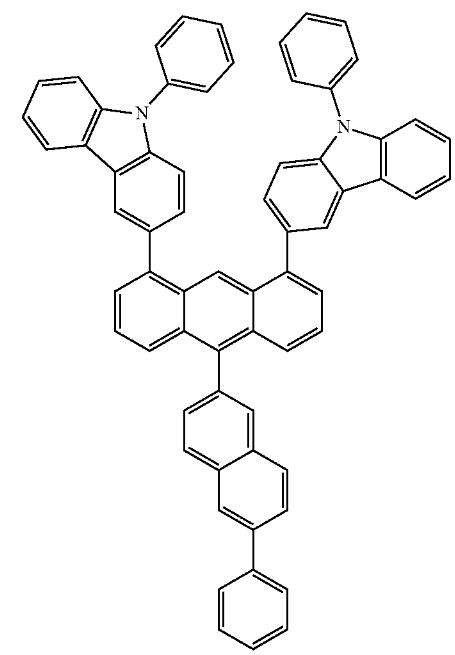
-continued
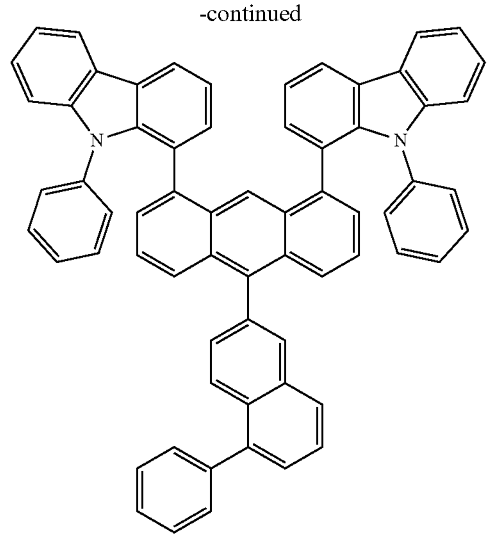
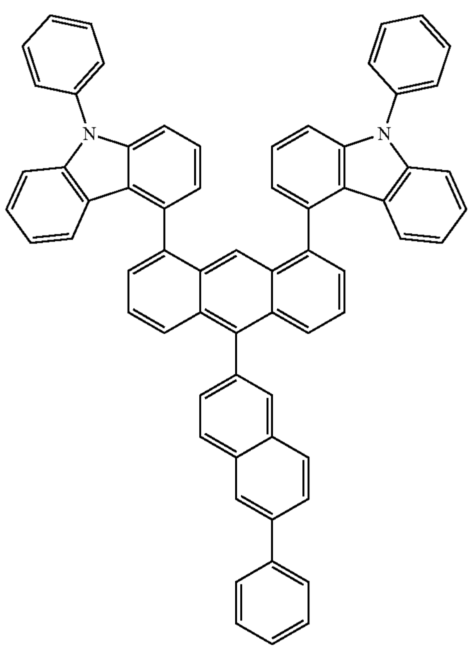
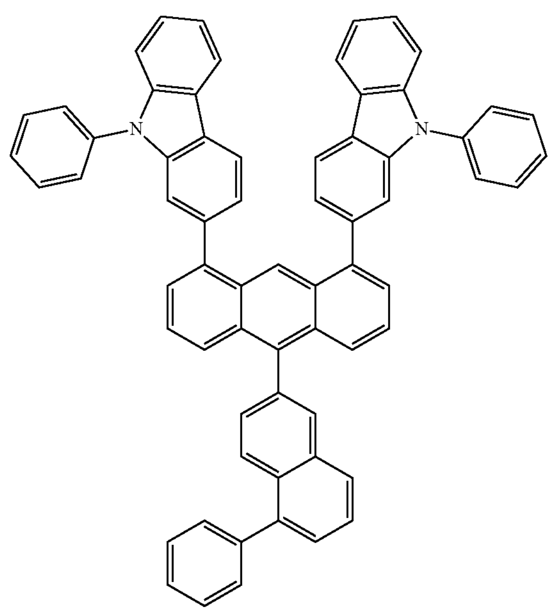

-continued
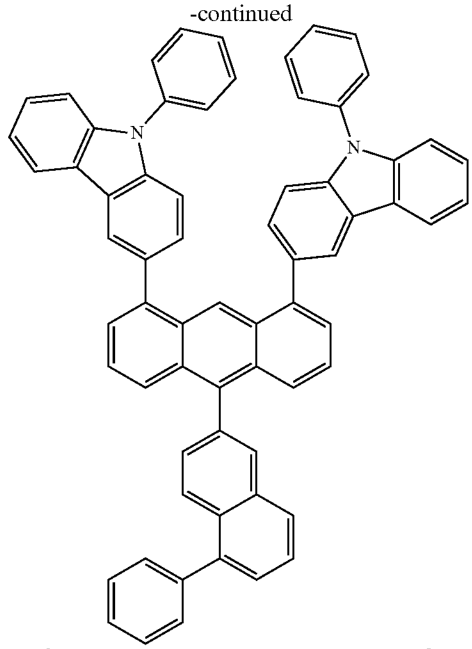
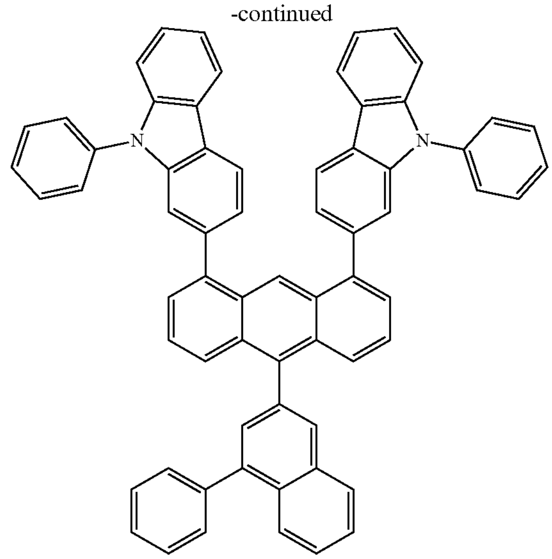
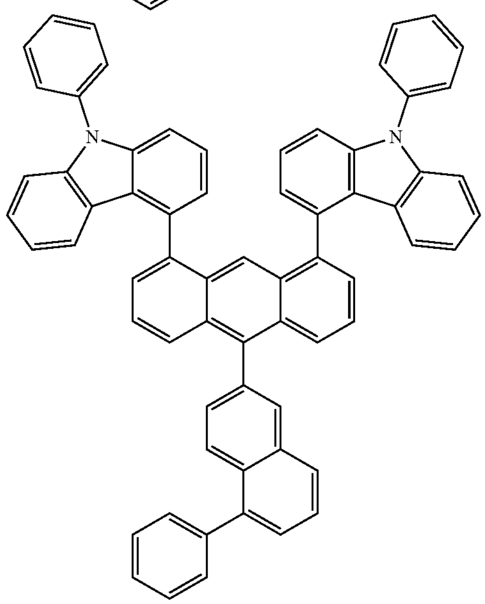
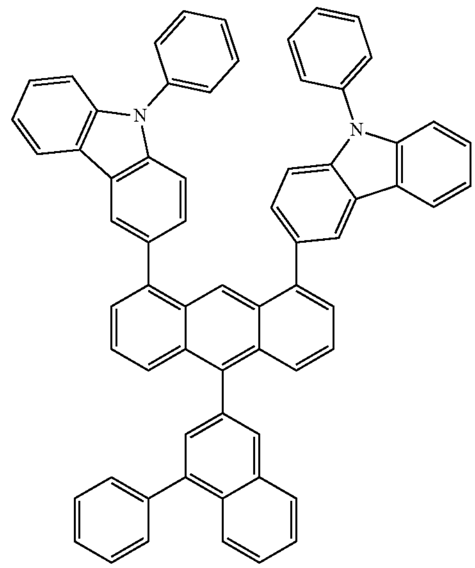
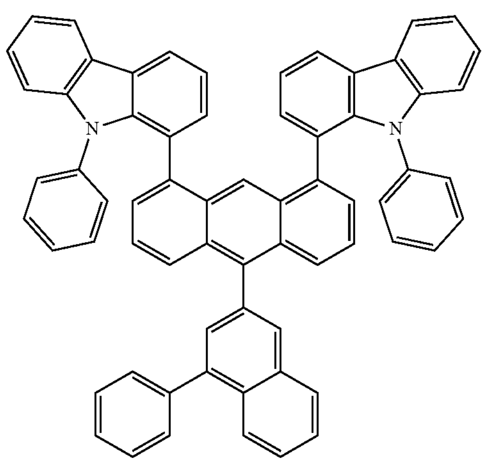
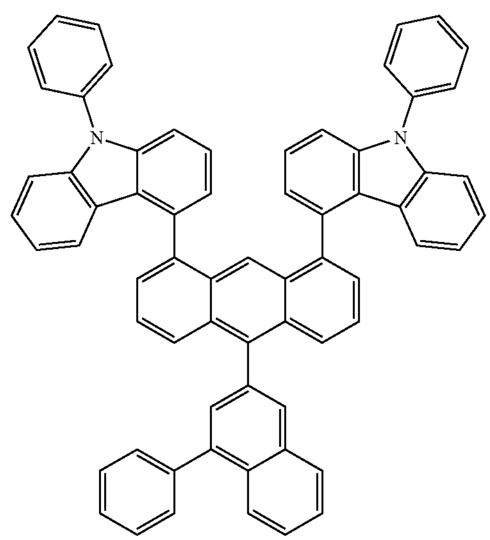

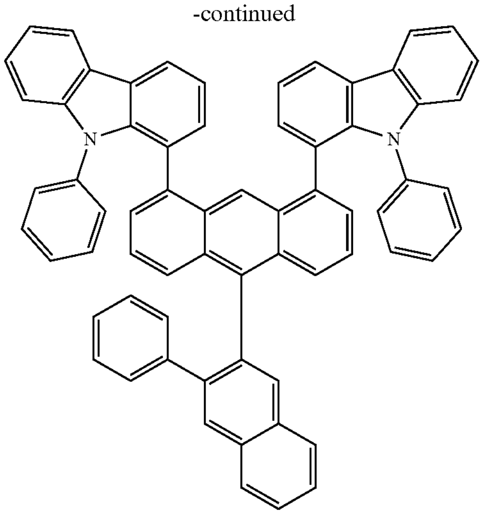
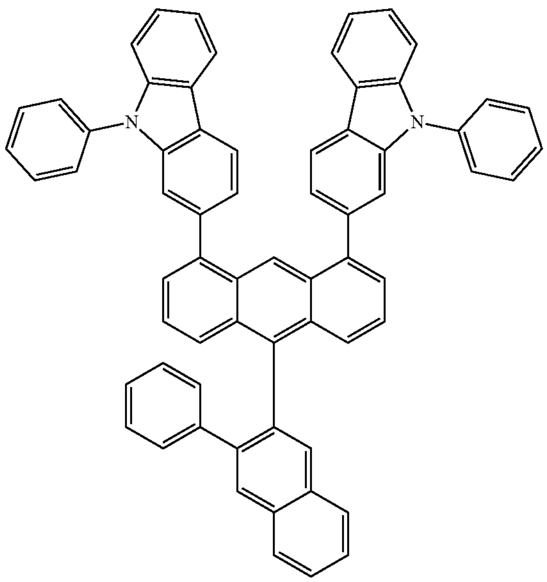
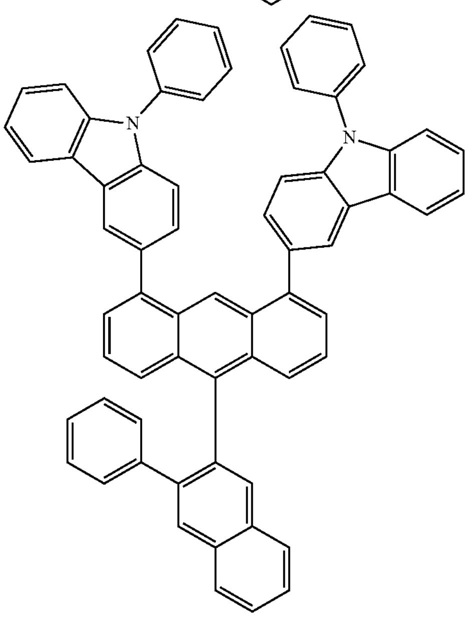
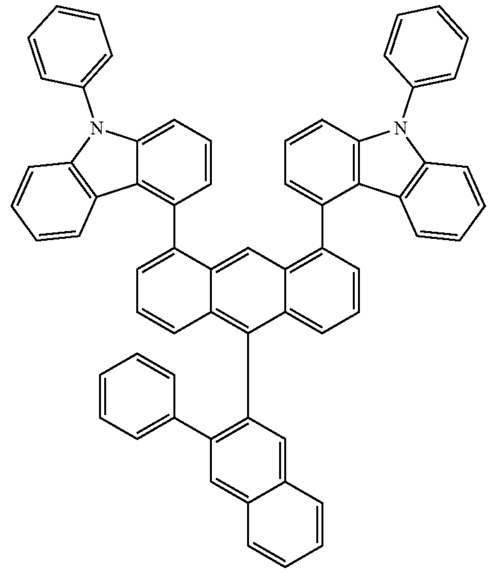
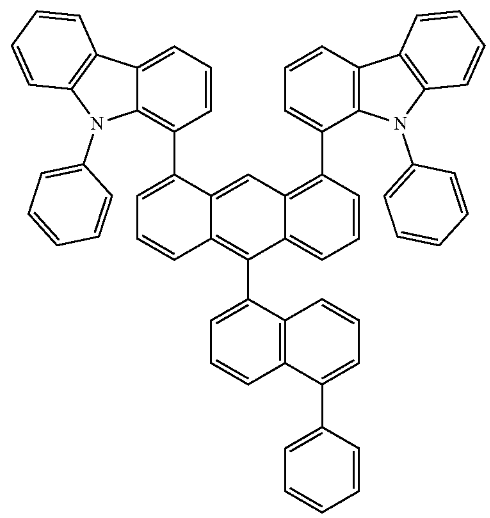
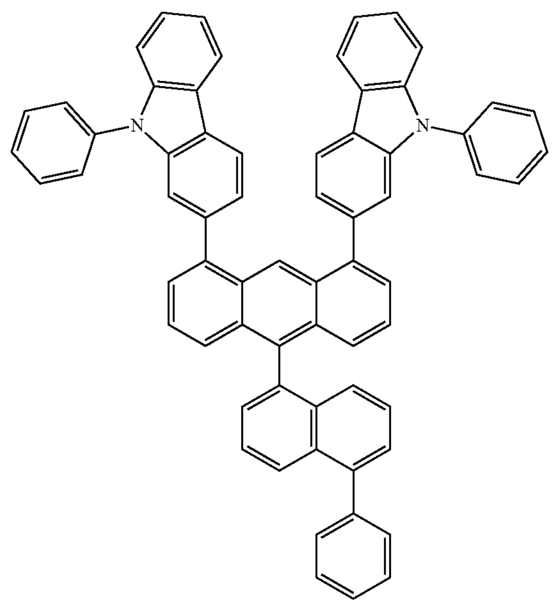

-continued
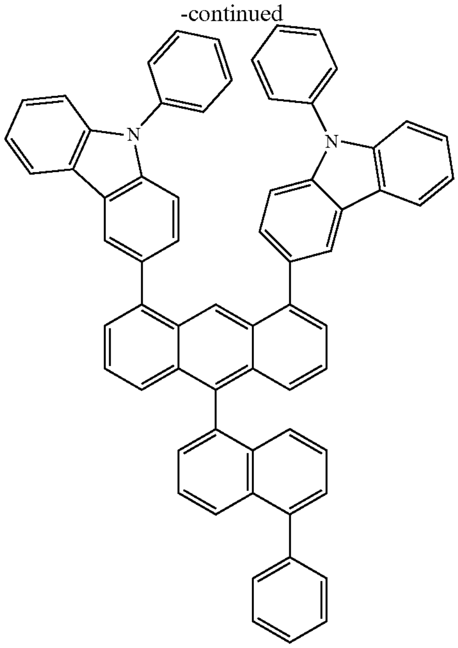
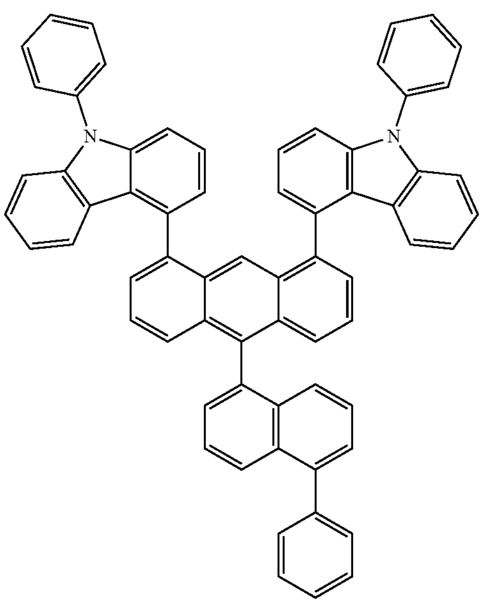
-continued
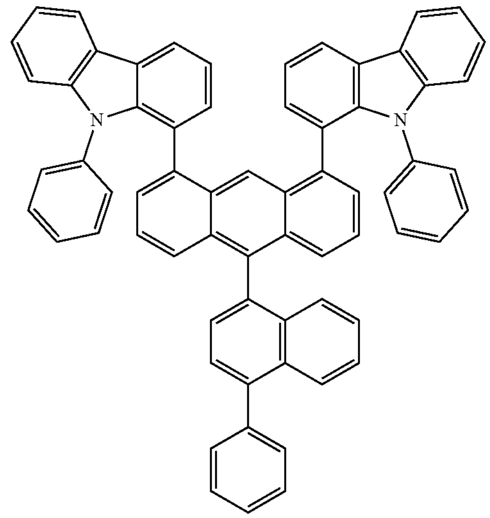
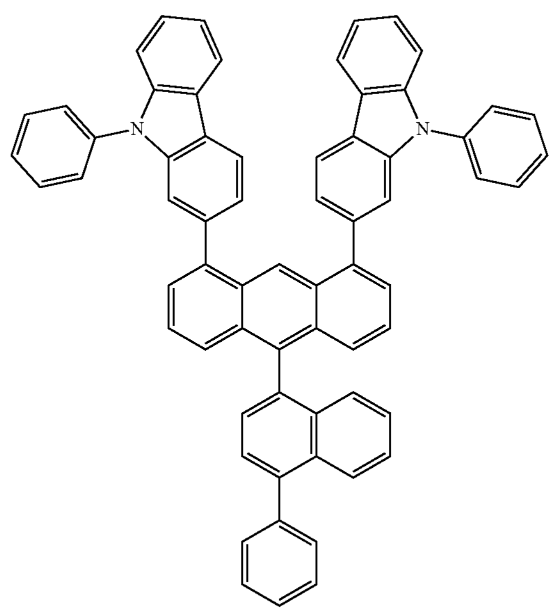

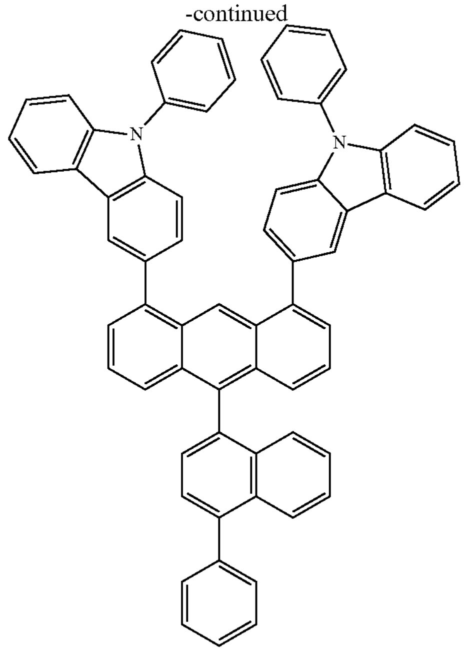
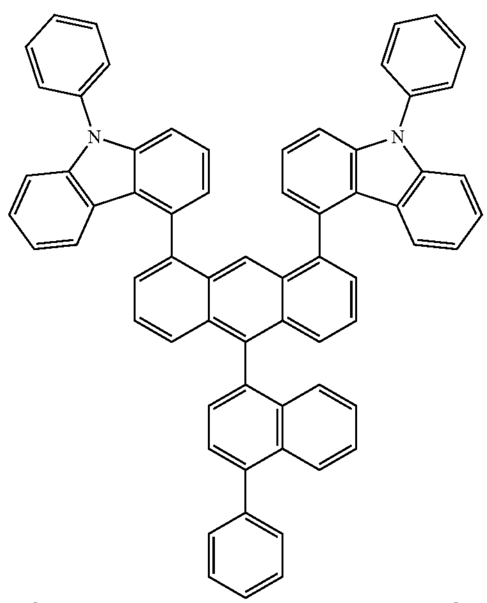
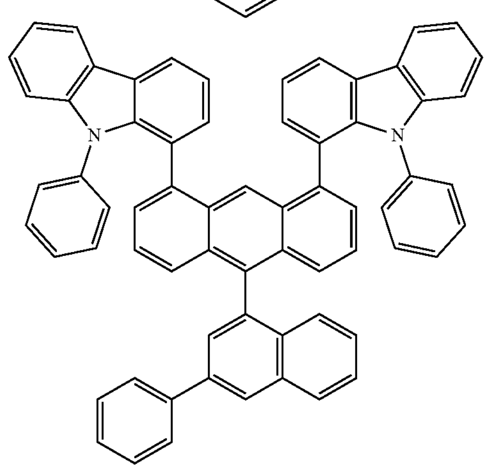
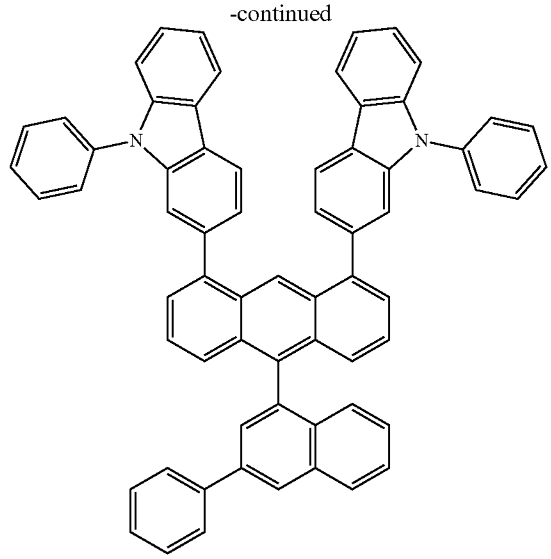
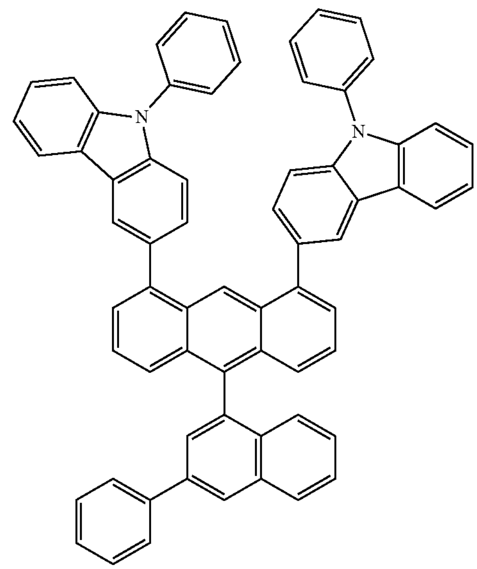
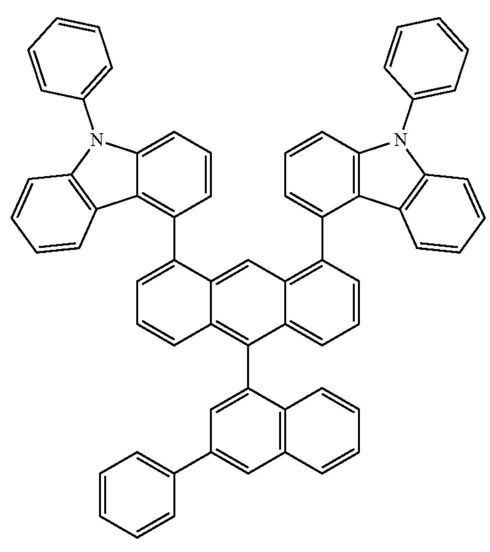

-continued
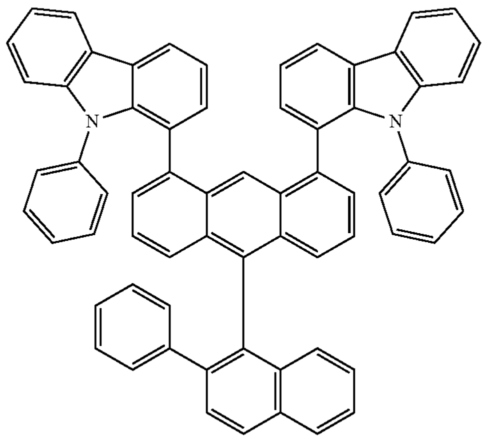
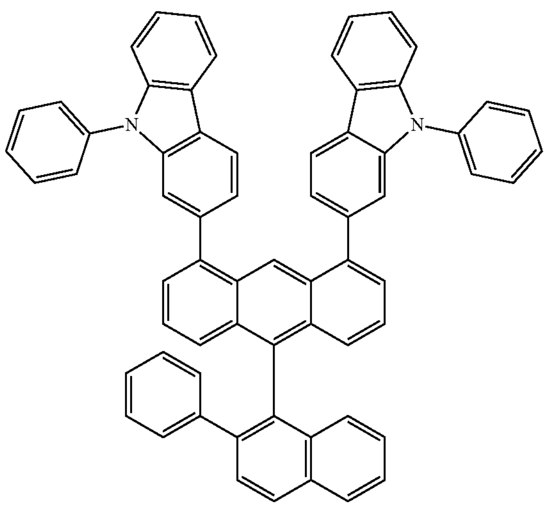
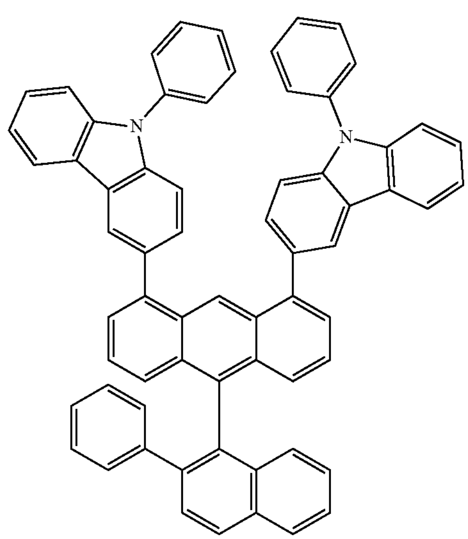
-continued
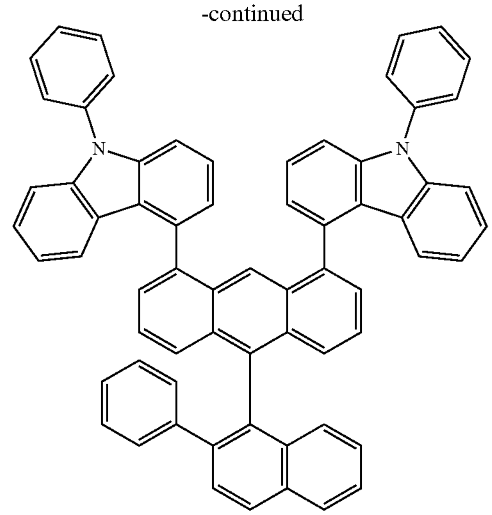
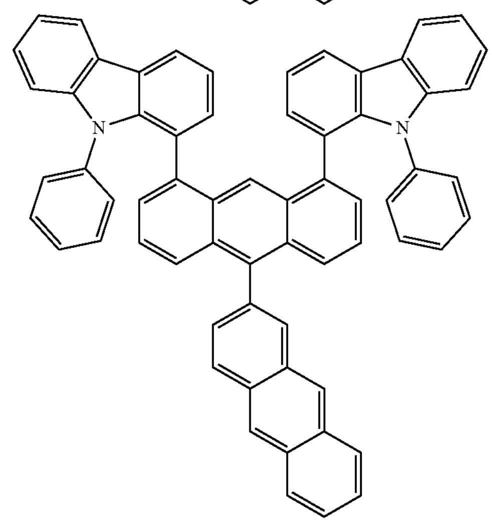
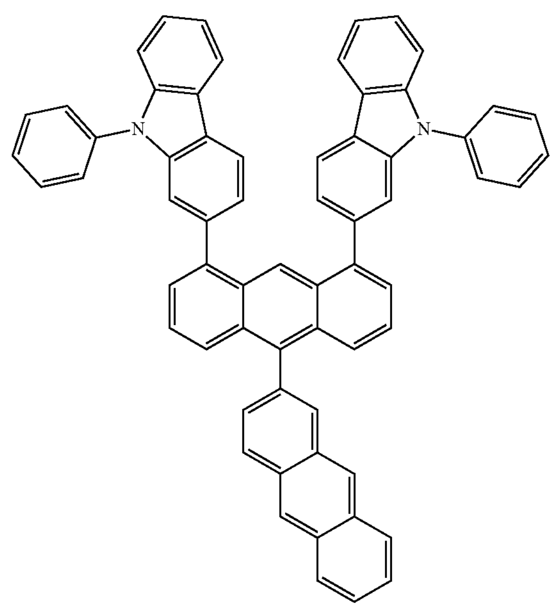

-continued
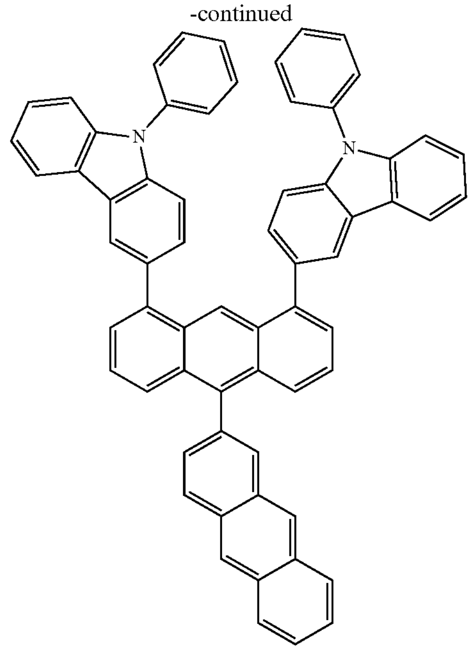
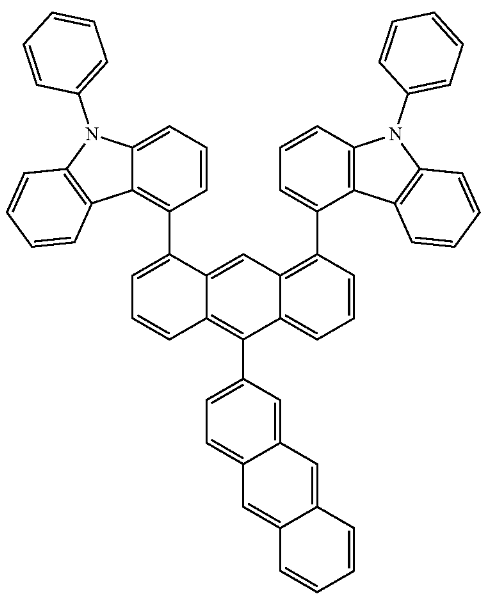
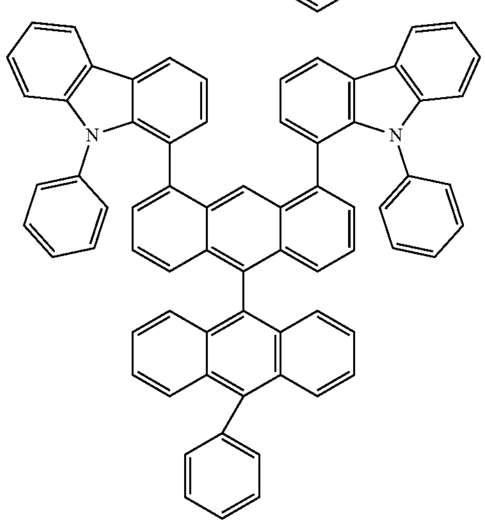
-continued
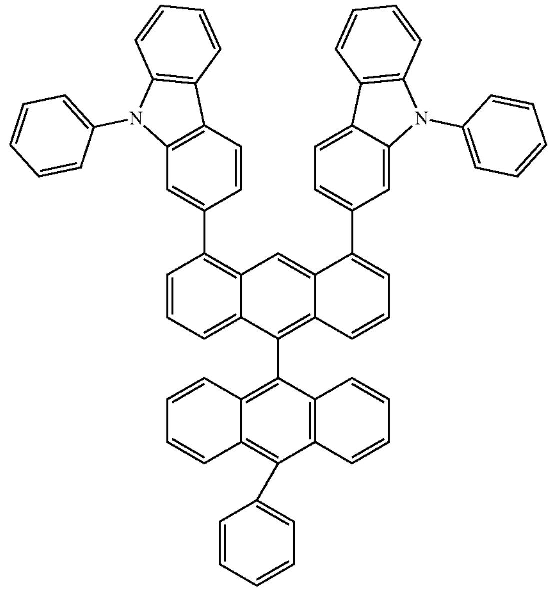
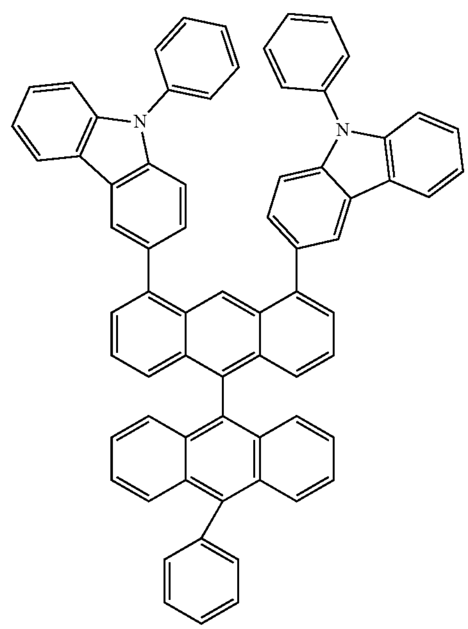

-continued
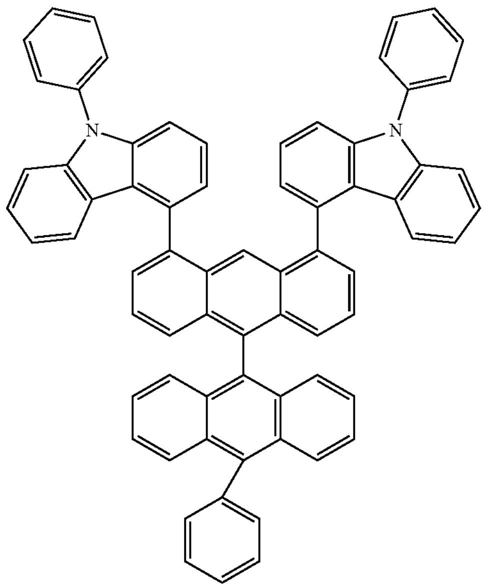
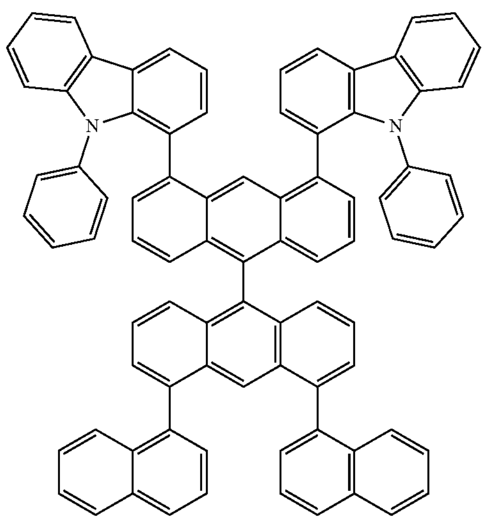
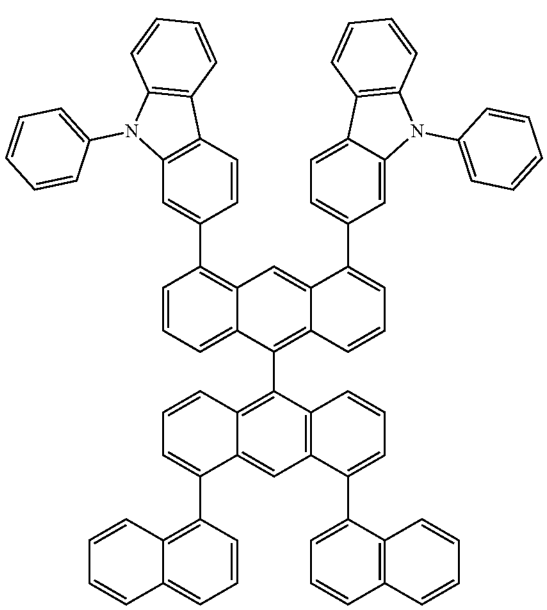
-continued
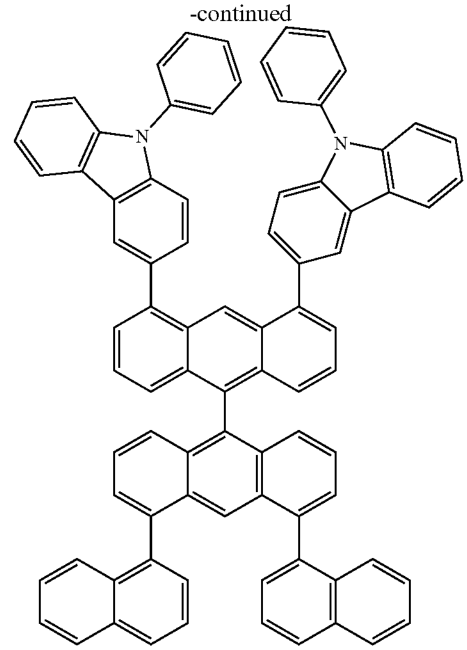
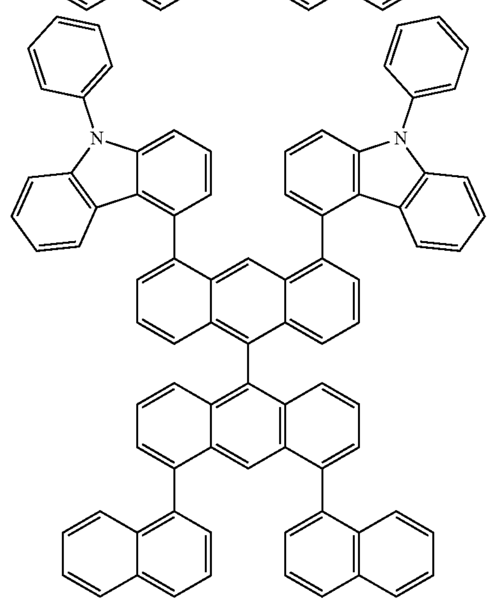
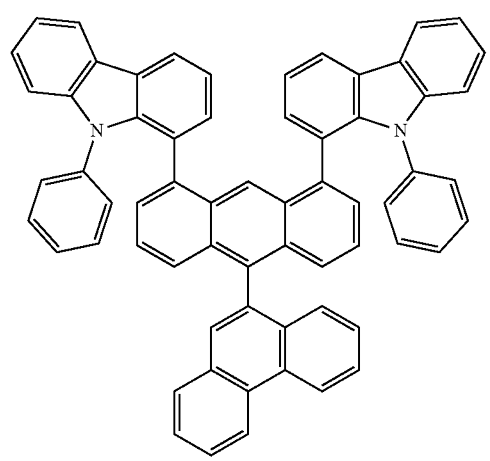

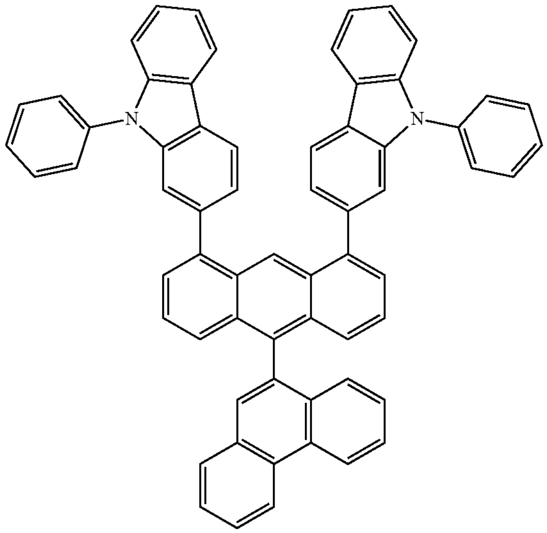
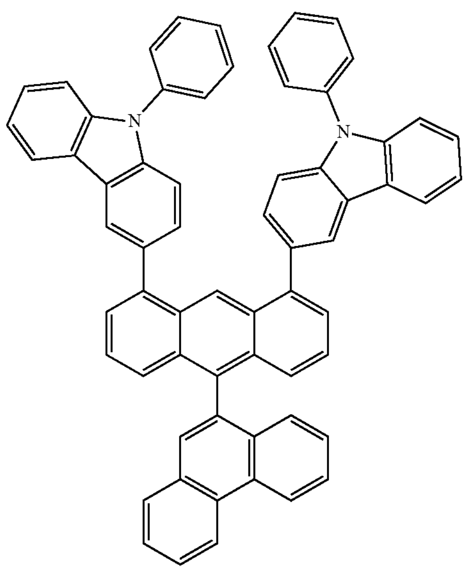
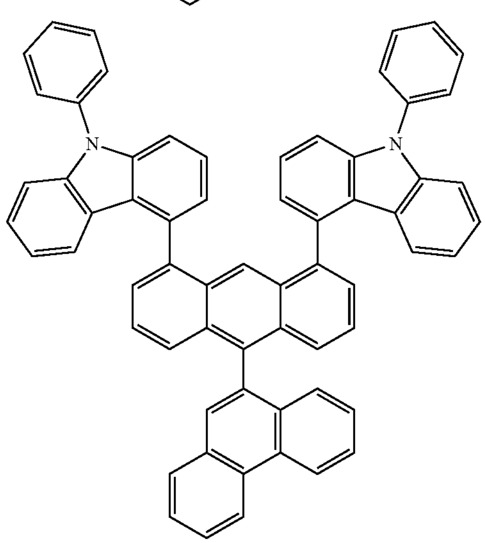
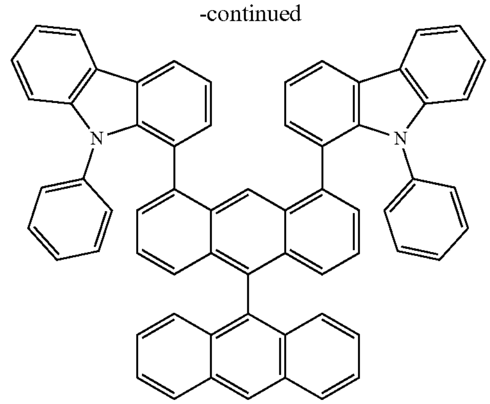
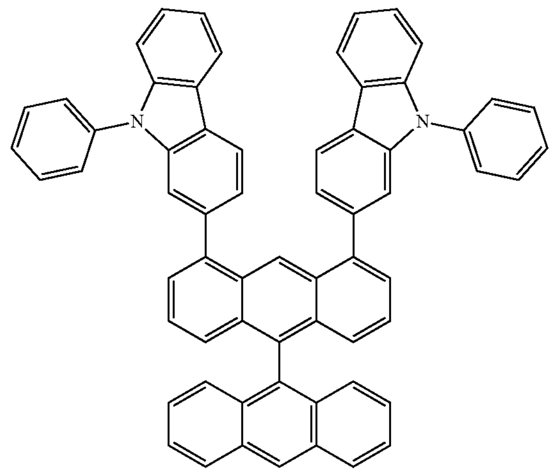
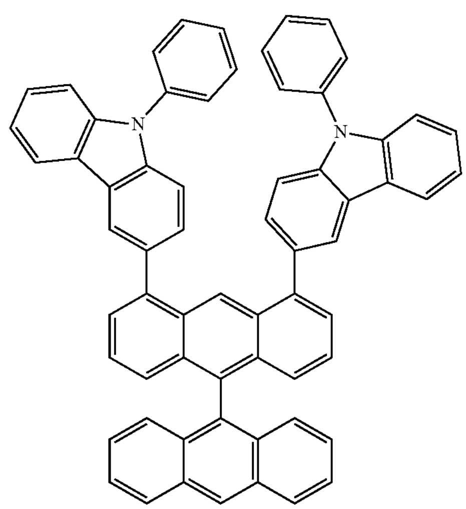

-continued
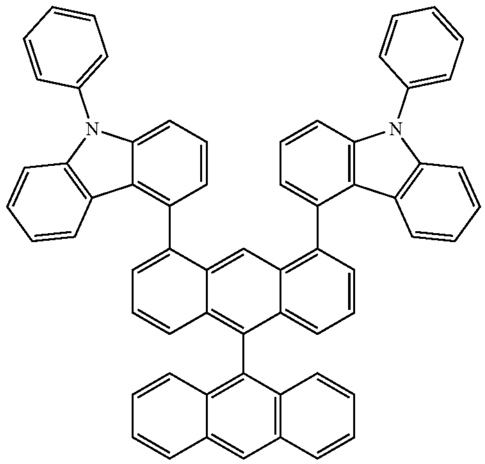
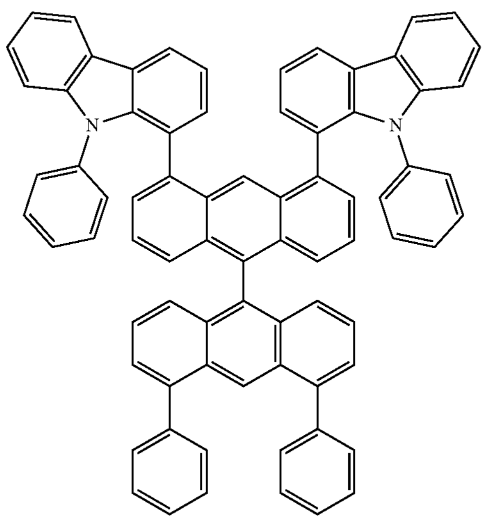
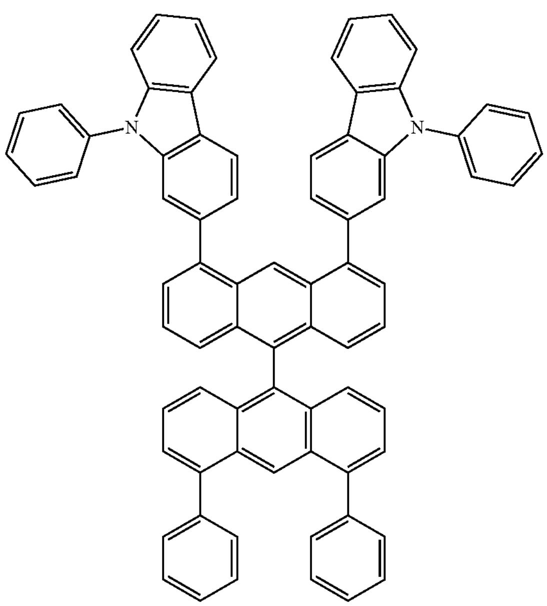
-continued
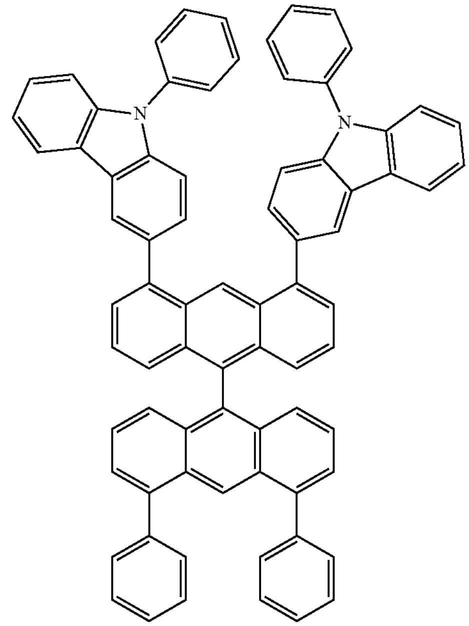
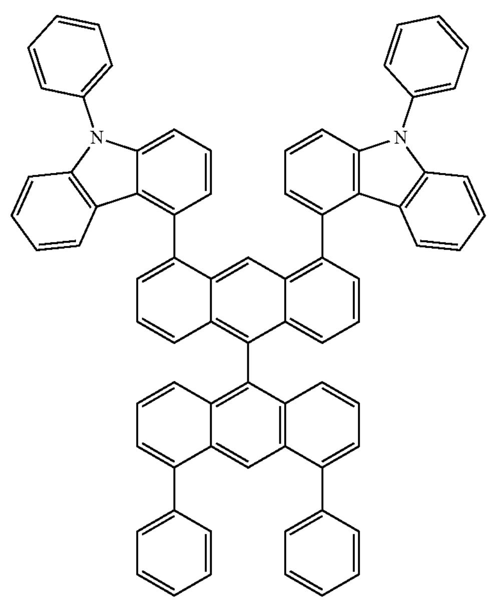

-continued
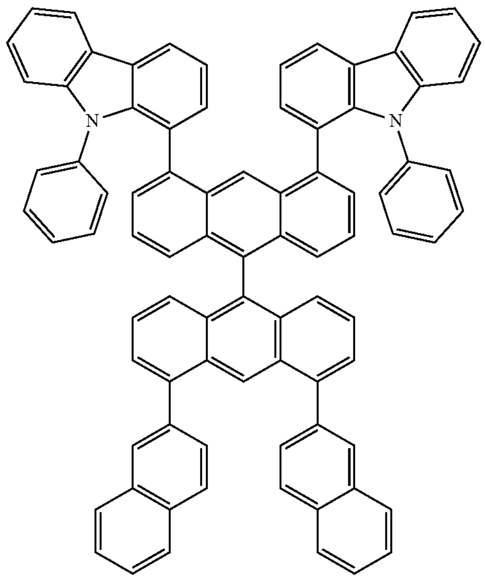
-continued
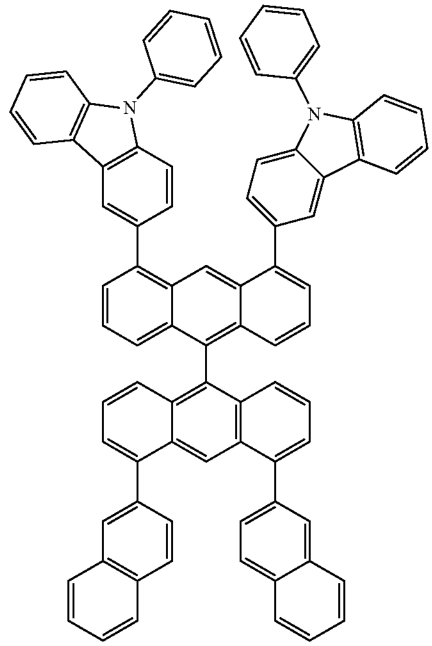
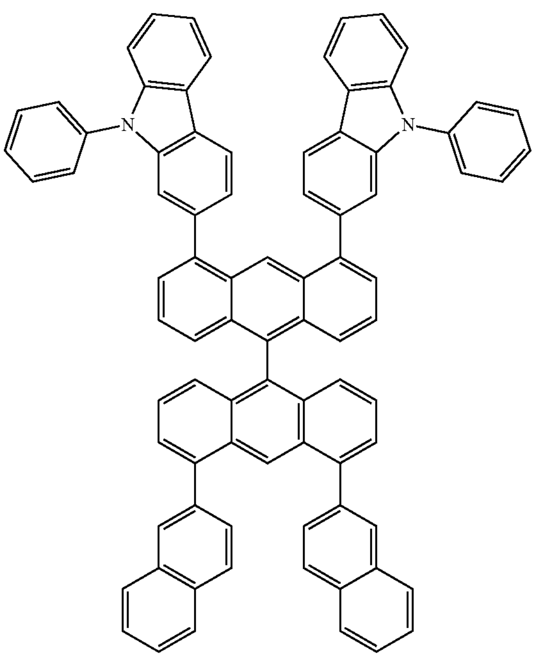
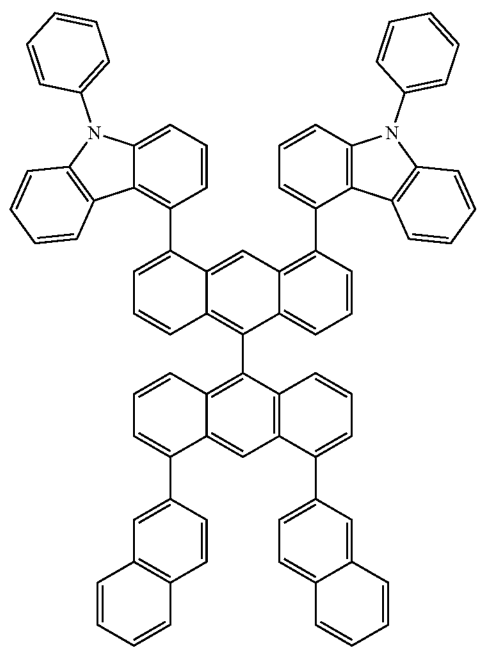

-continued
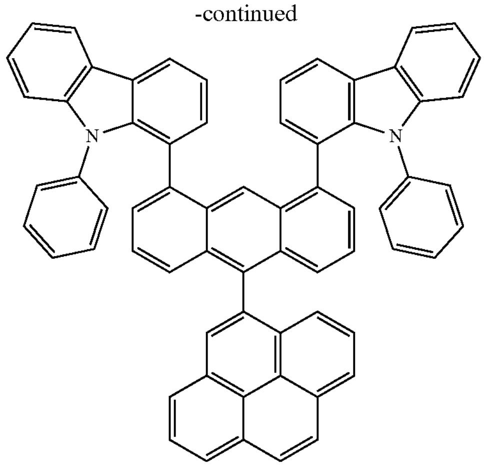
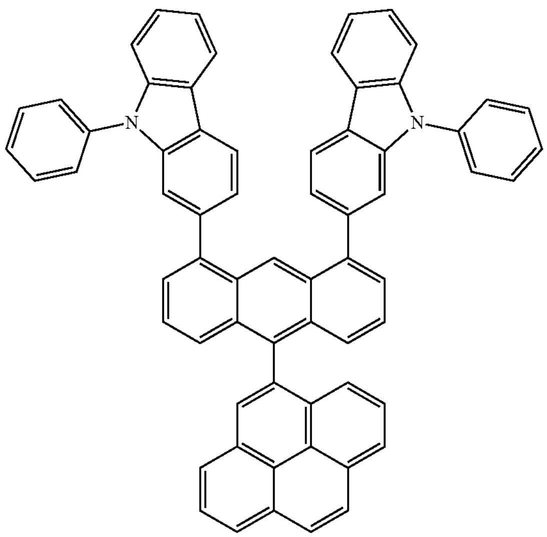
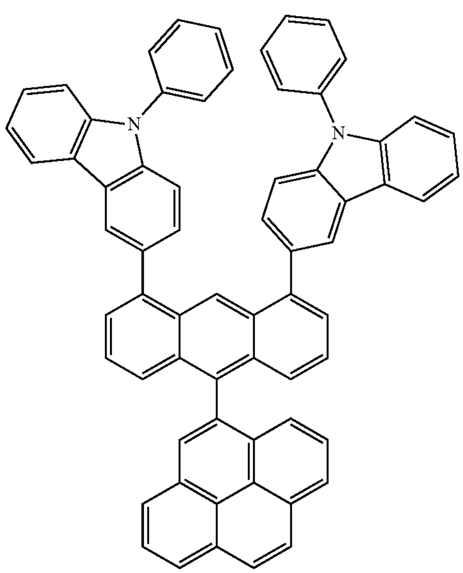
-continued
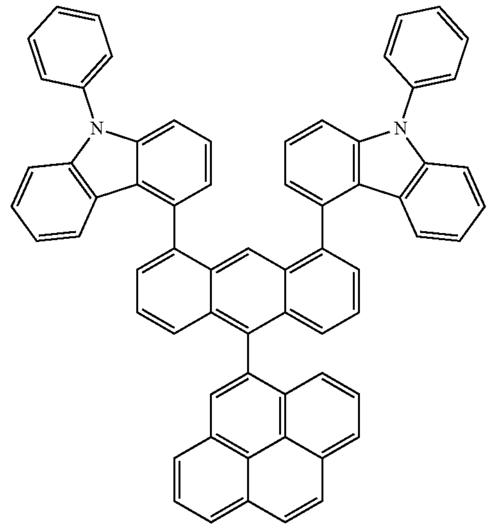
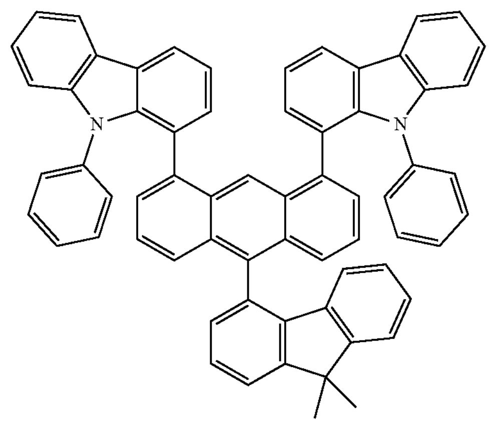
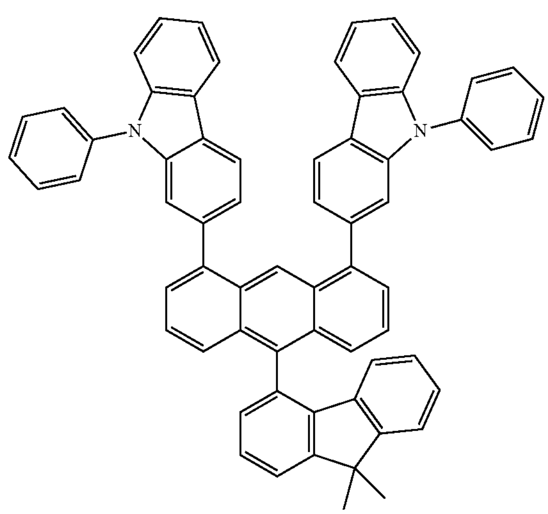

-continued
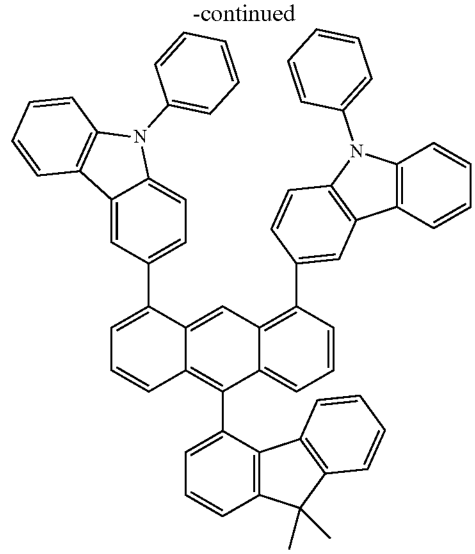
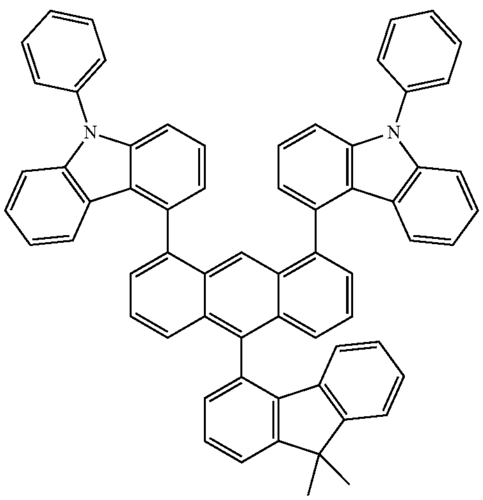
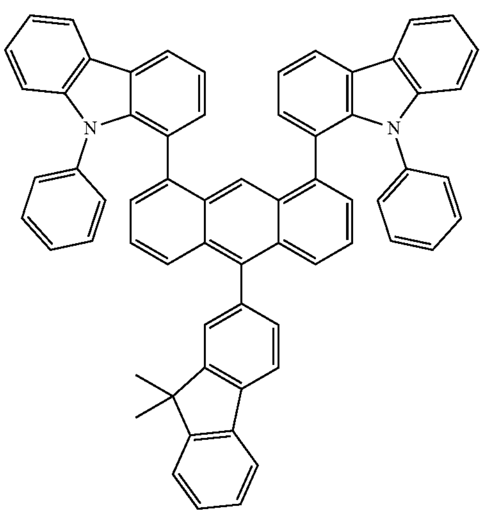
-continued
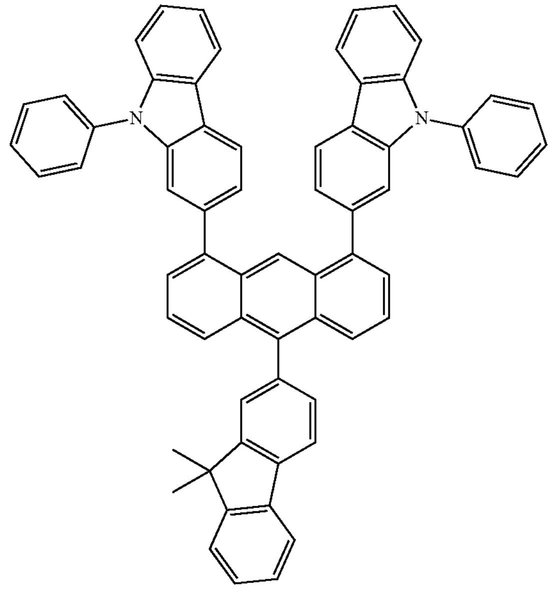
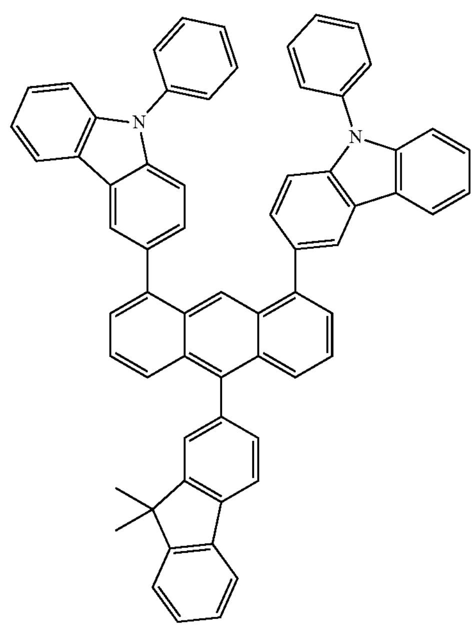

-continued
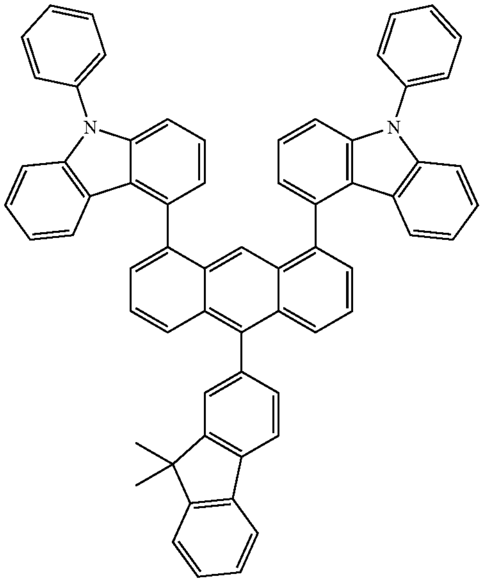
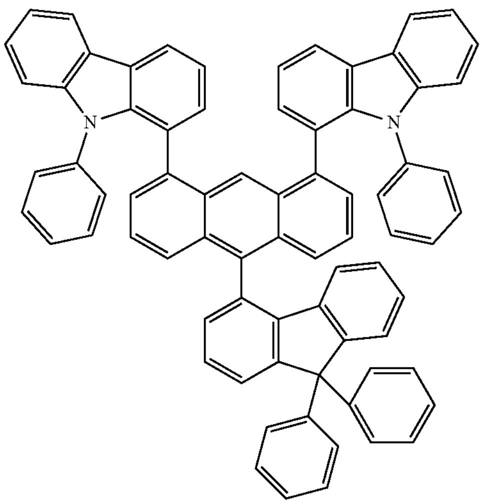
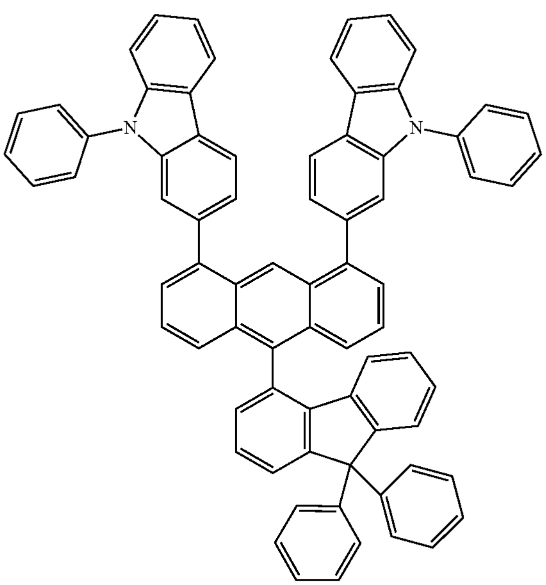
-continued
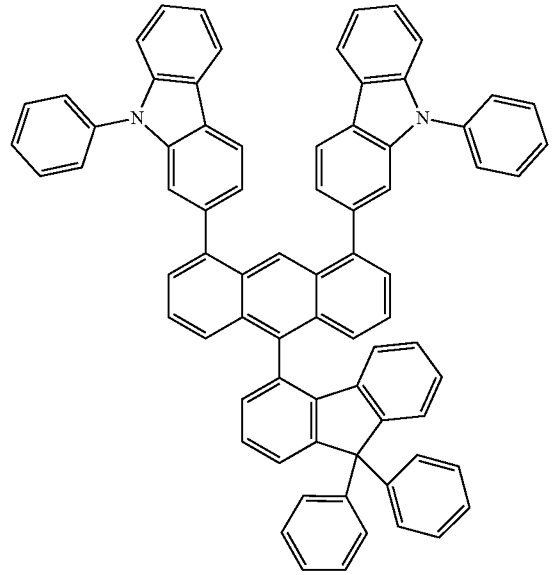
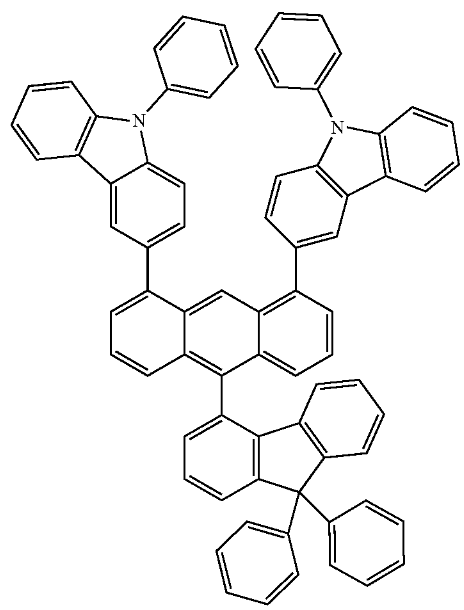

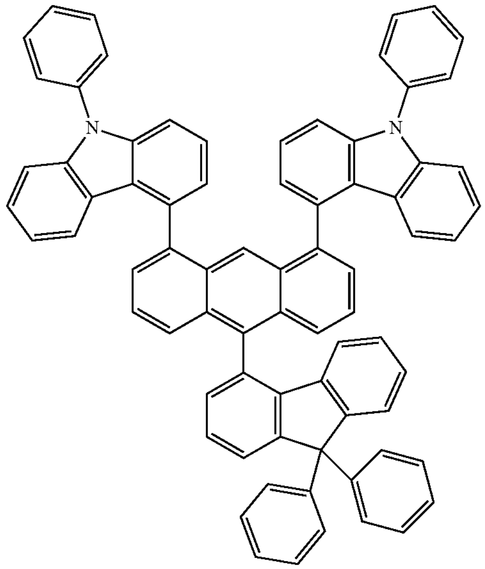
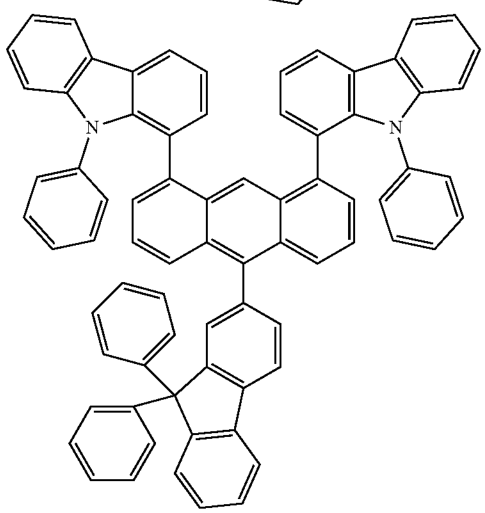
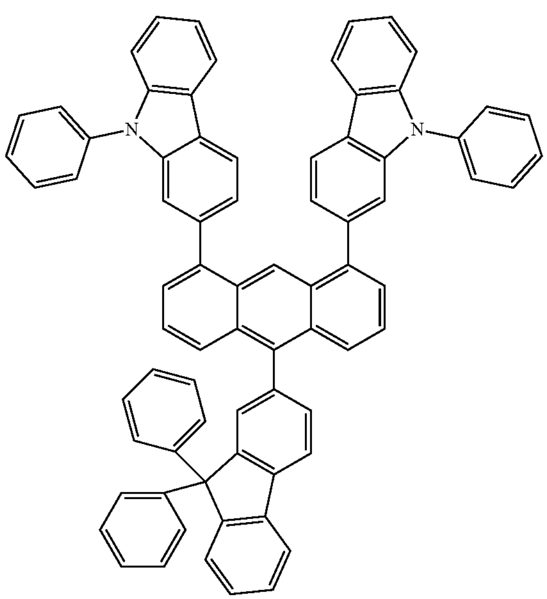
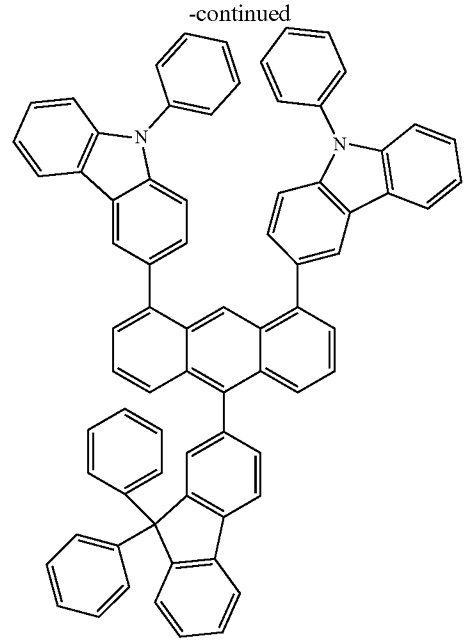
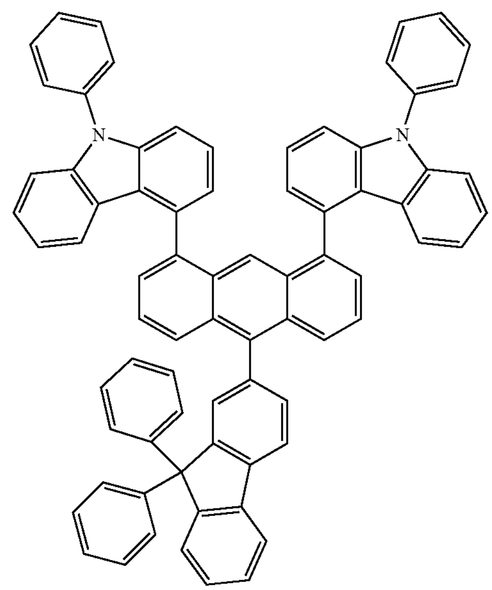
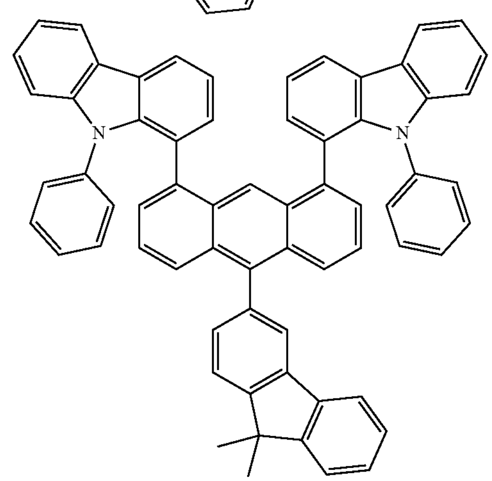

-continued
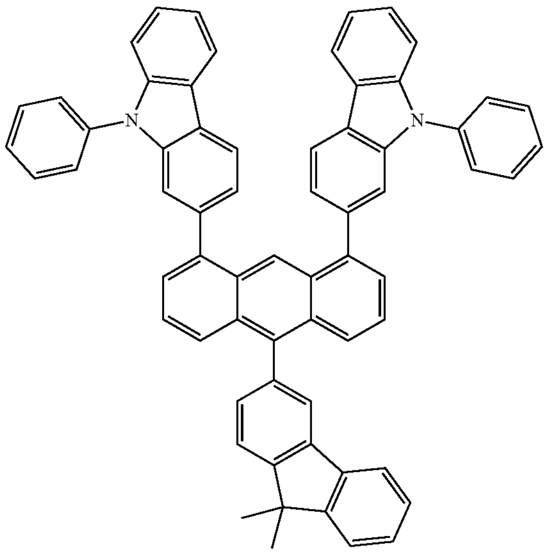
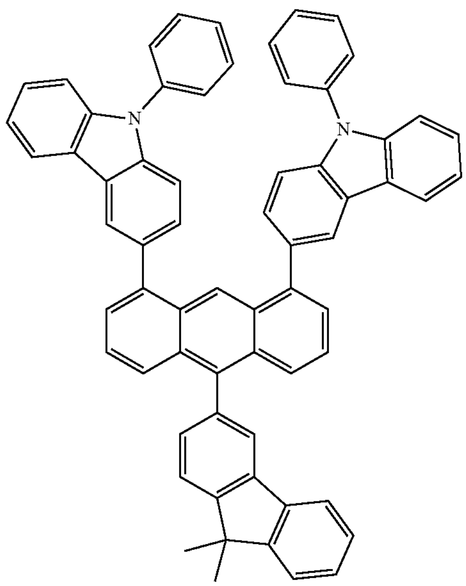
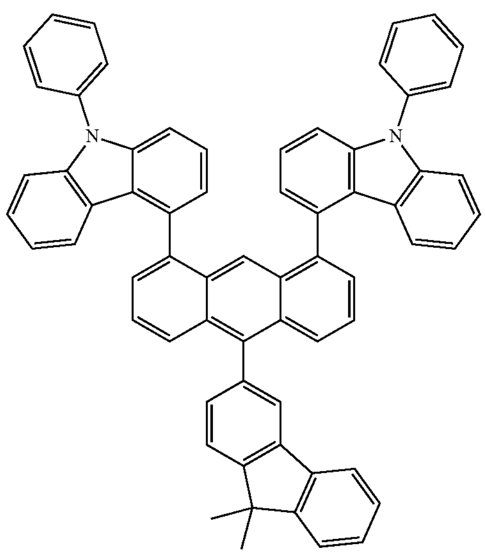
-continued
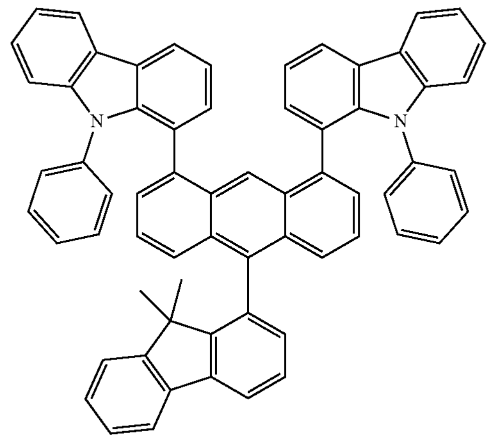
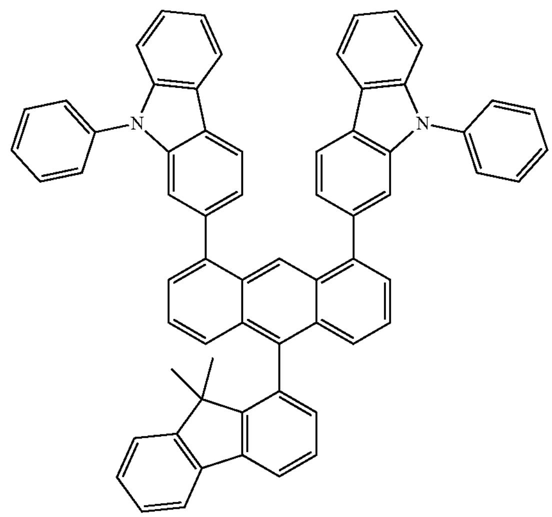
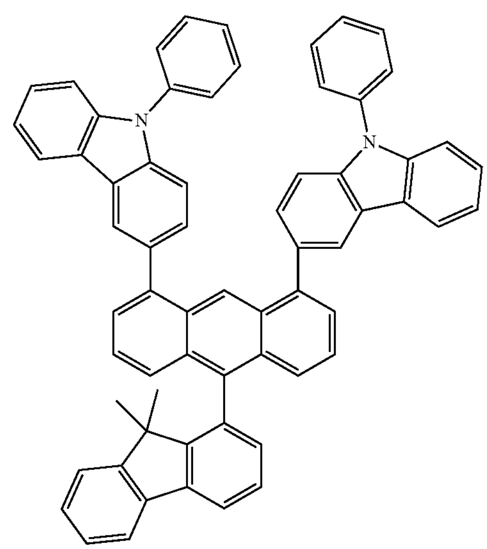

-continued
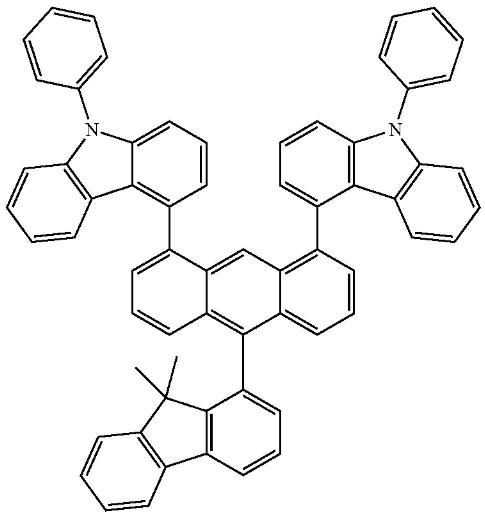
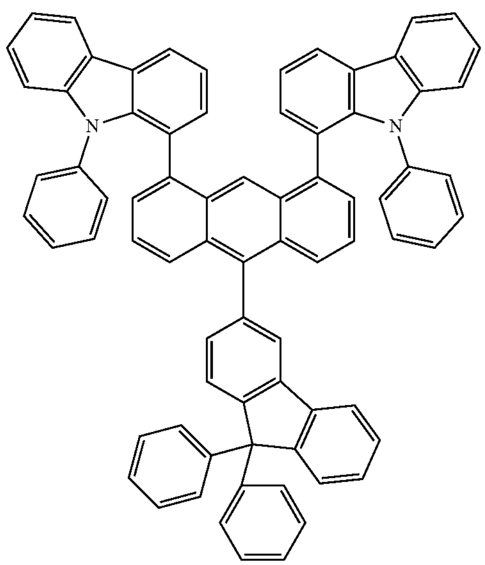
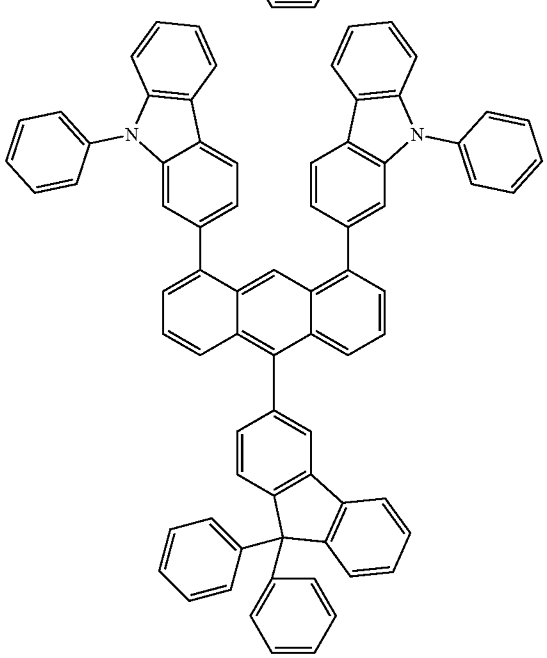
-continued
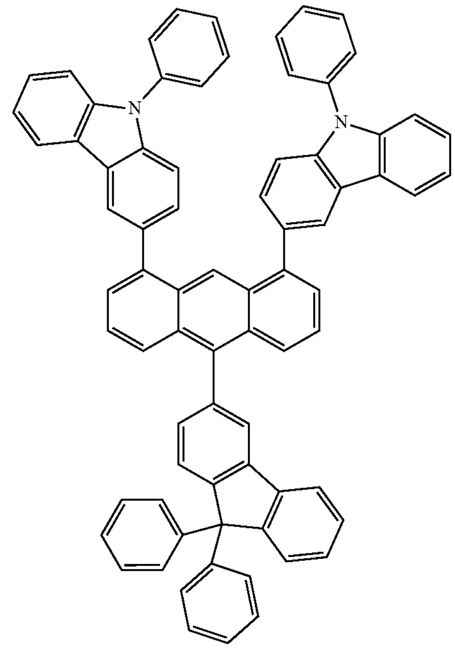
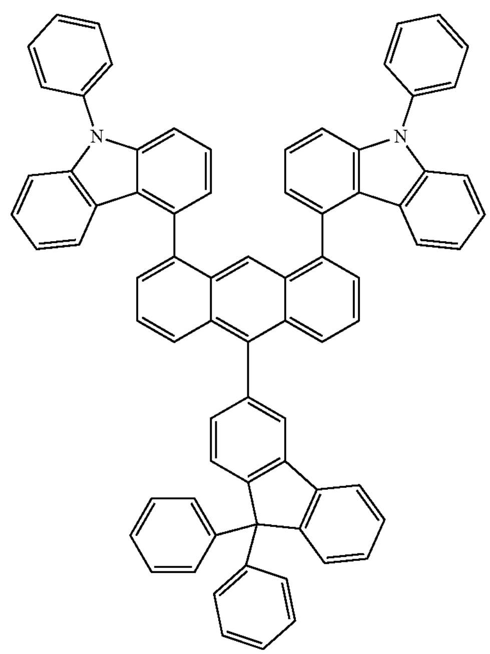

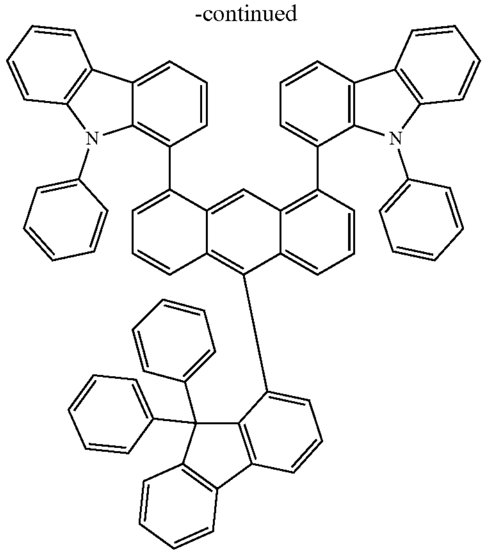
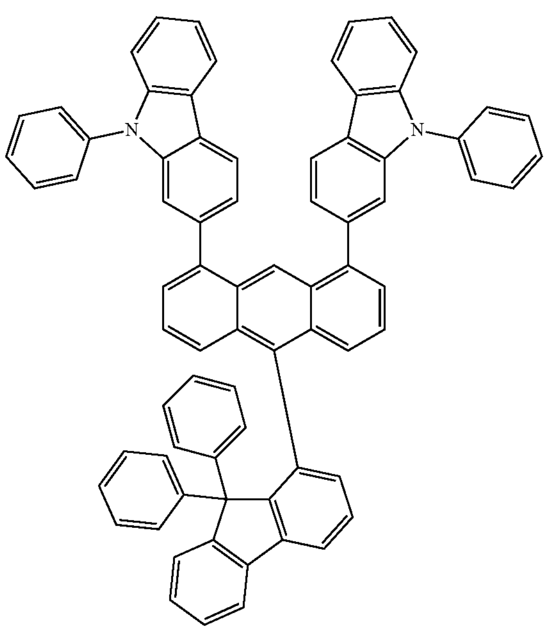
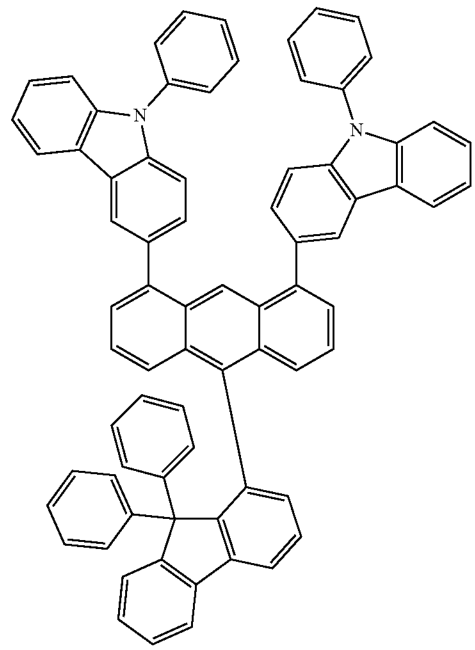
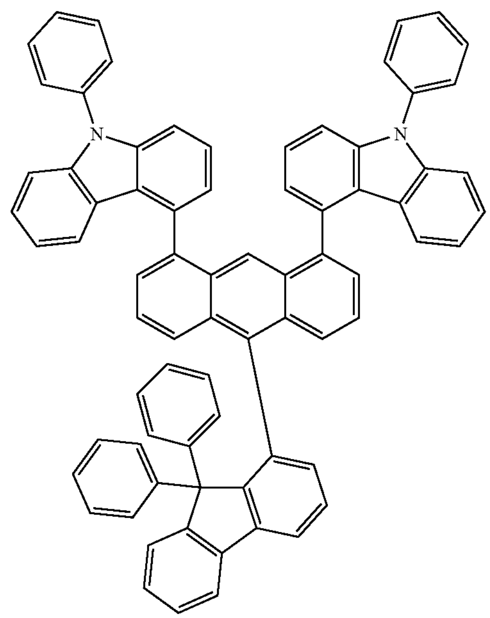
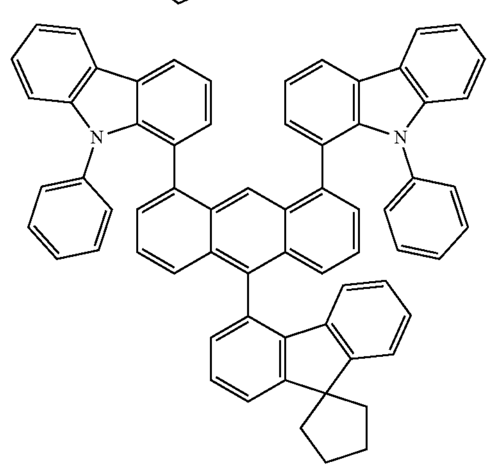

-continued
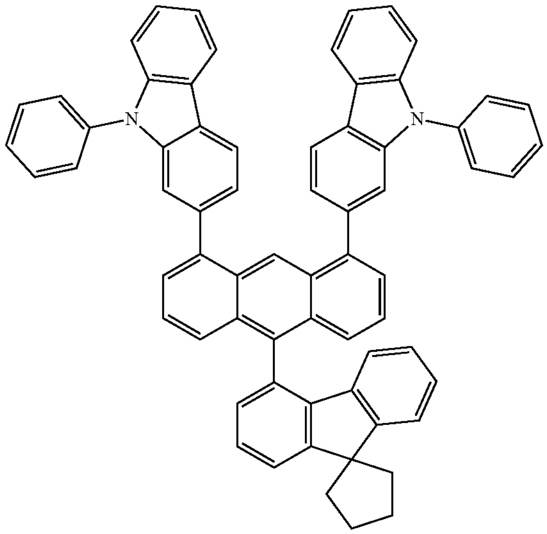
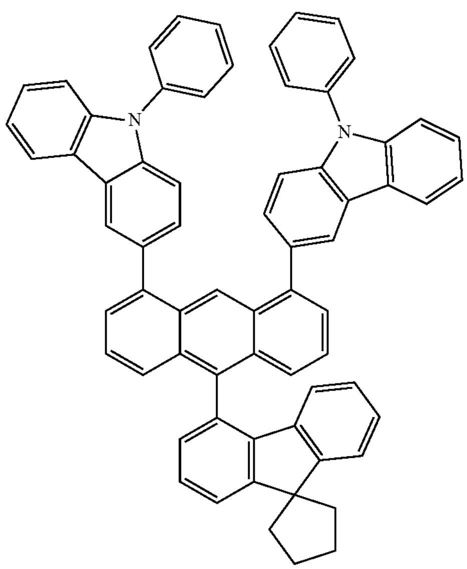
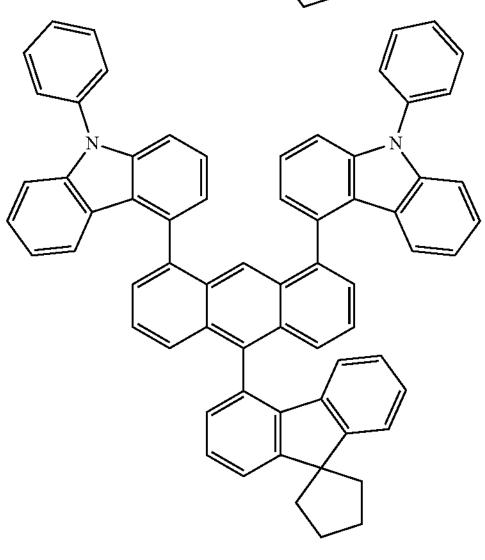
-continued
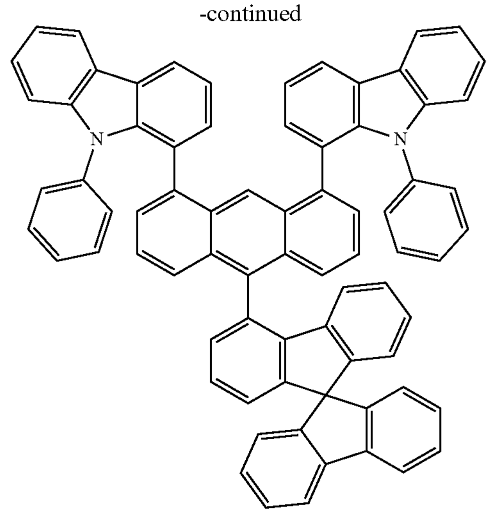
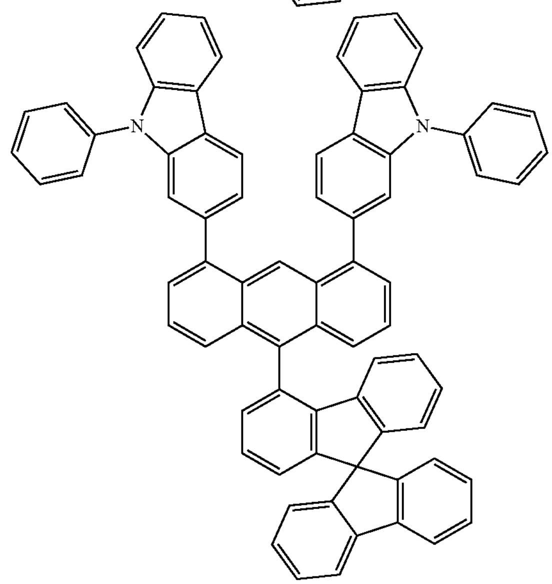
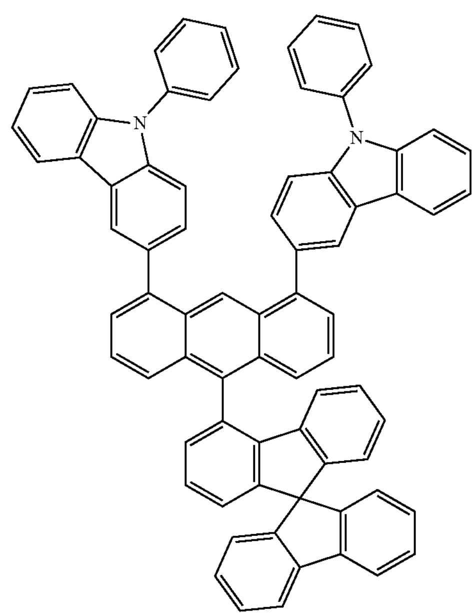

-continued
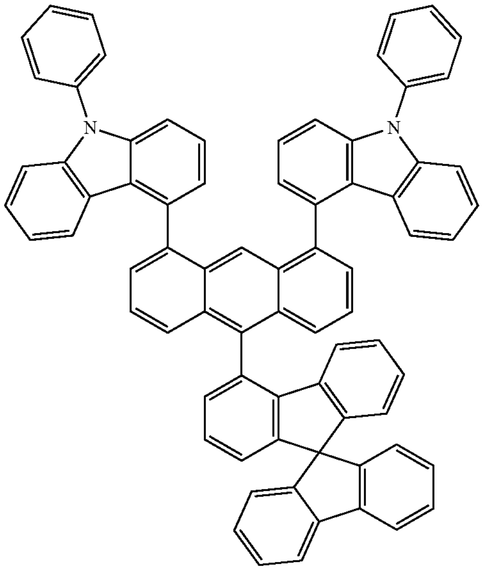
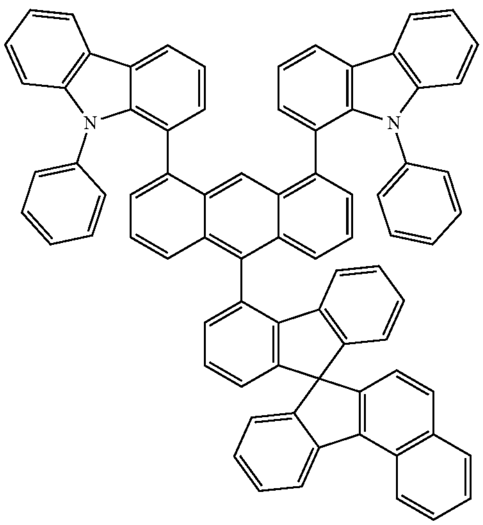
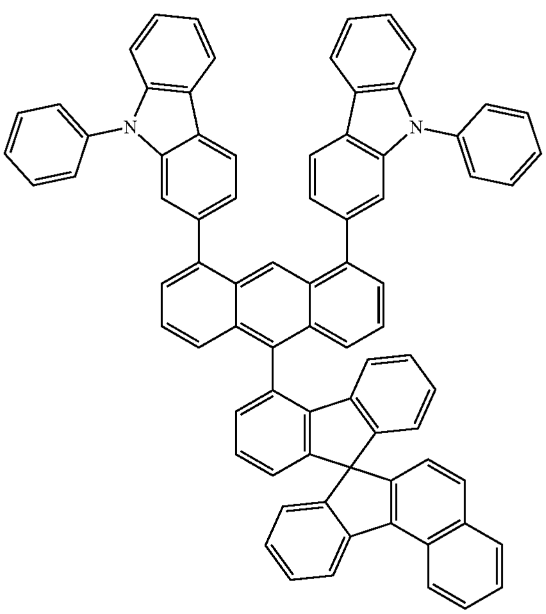
-continued
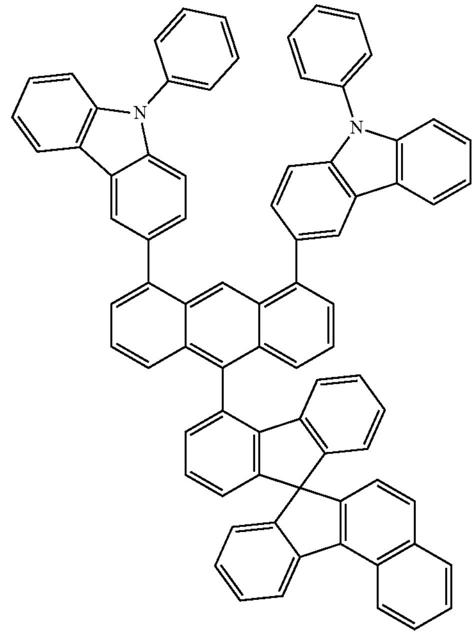
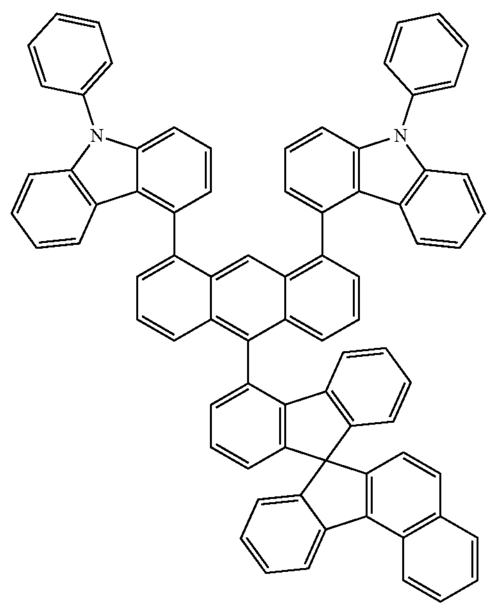

-continued
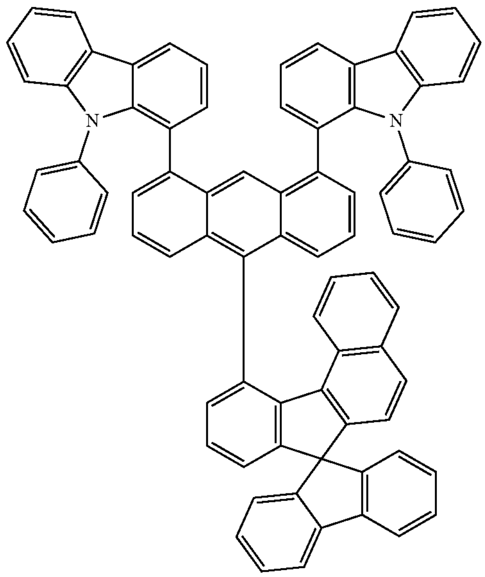
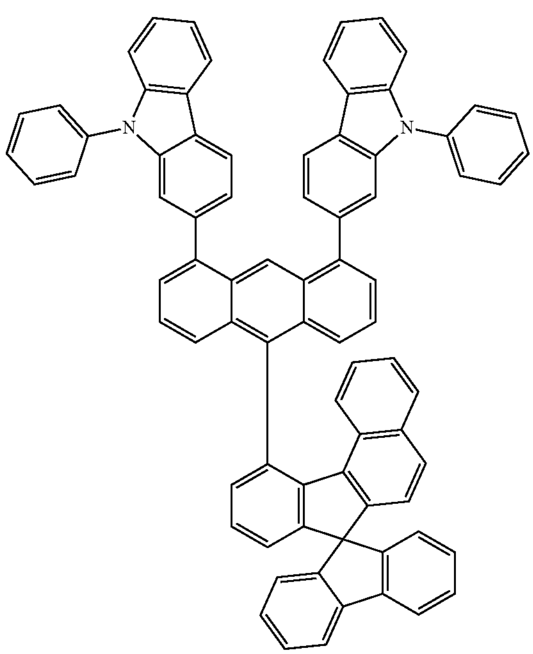
-continued
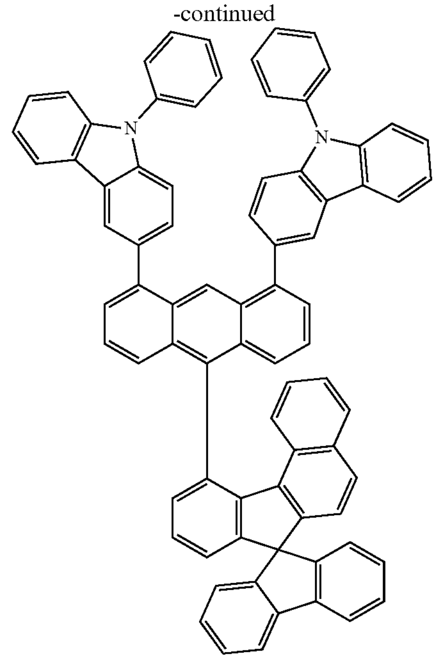
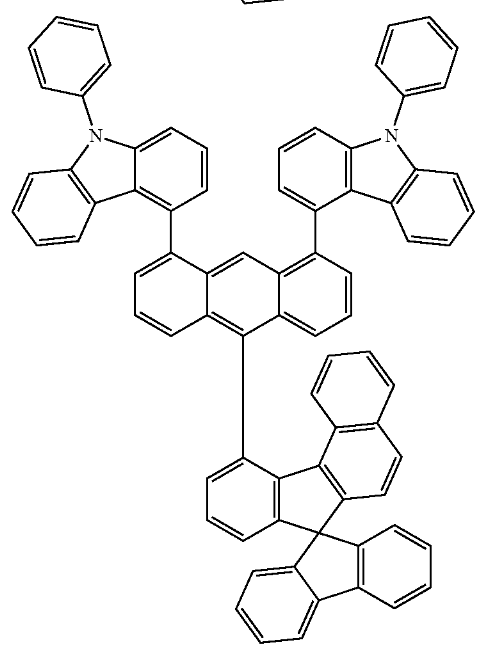
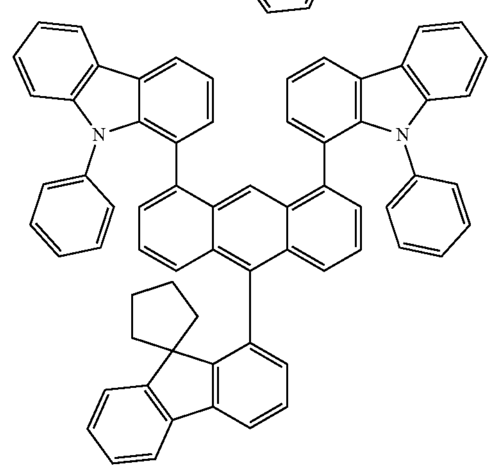

-continued
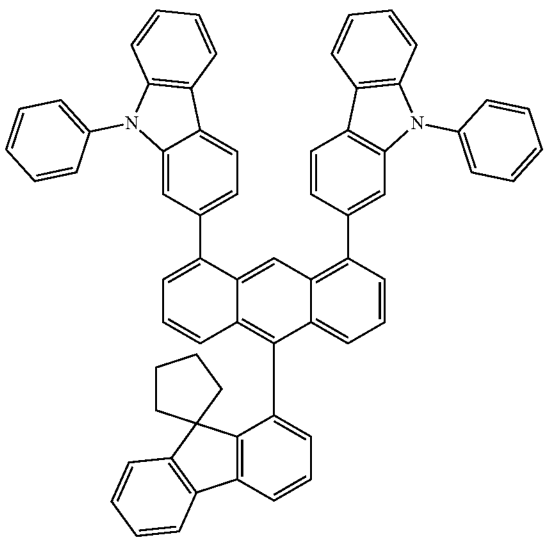
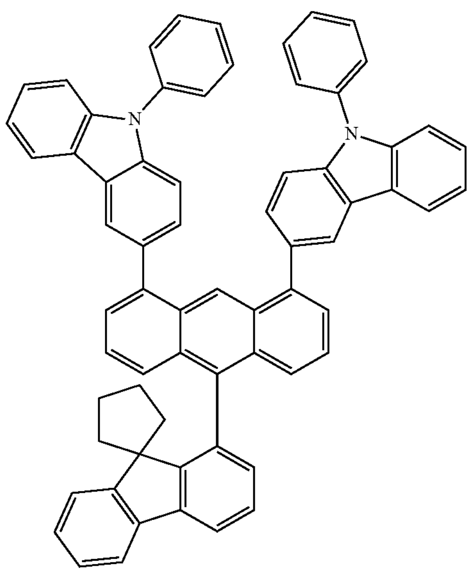
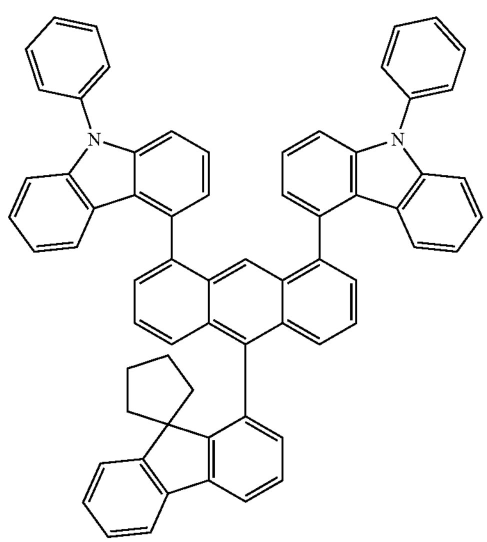
-continued
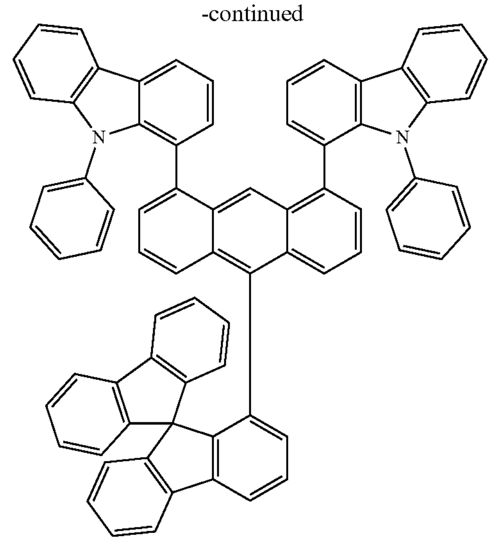
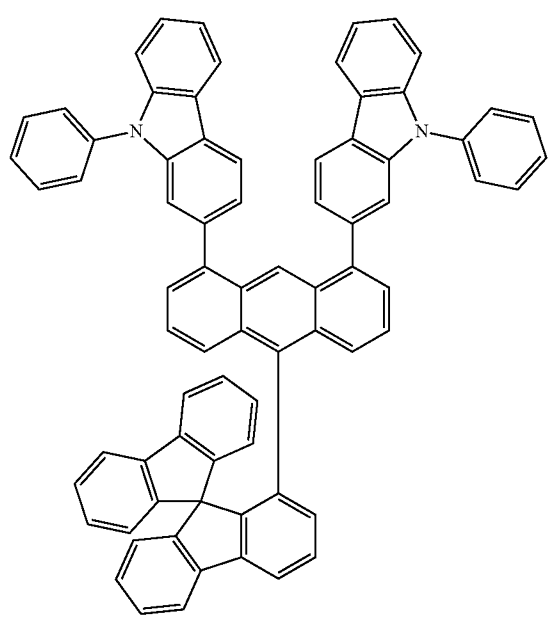

-continued
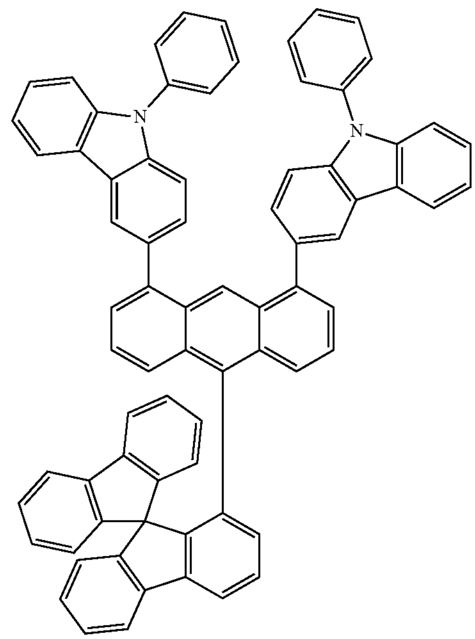
-continued
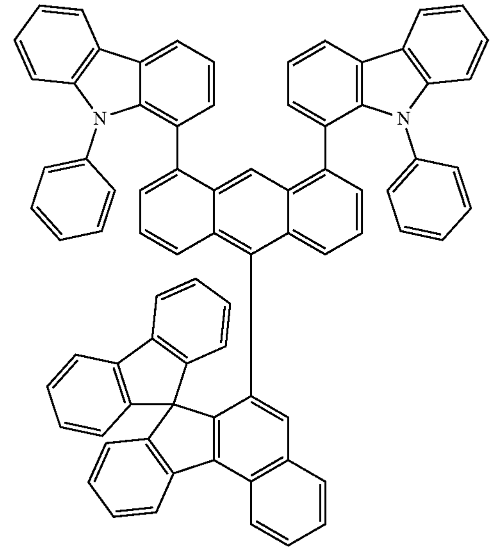
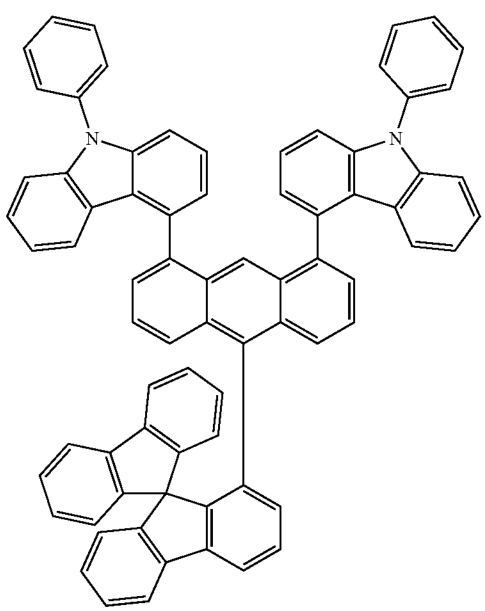
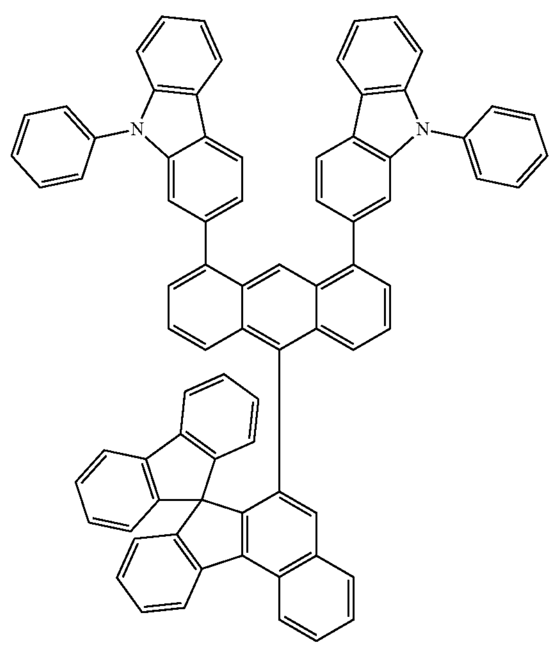

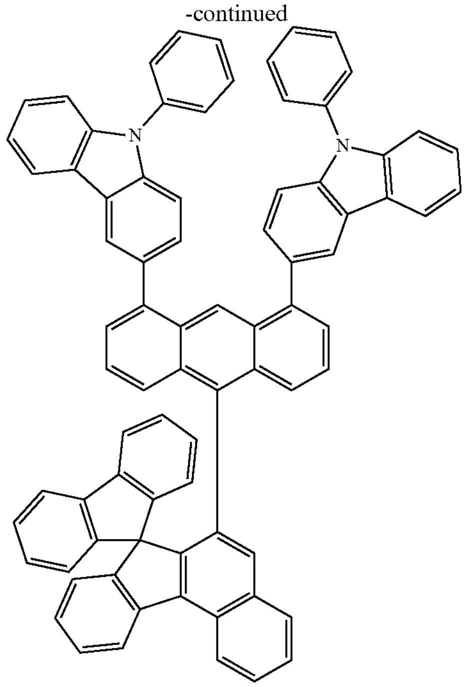
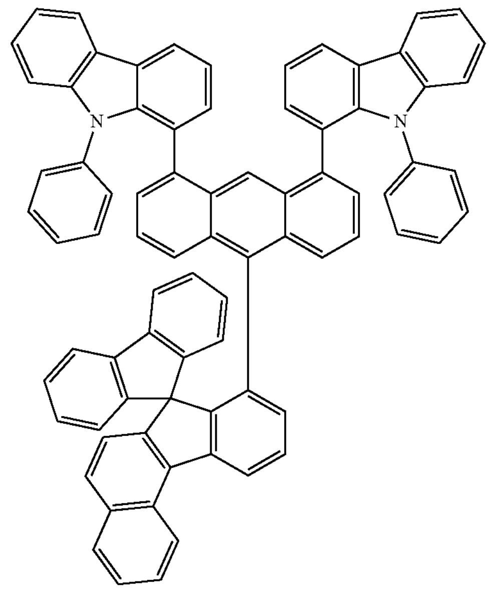
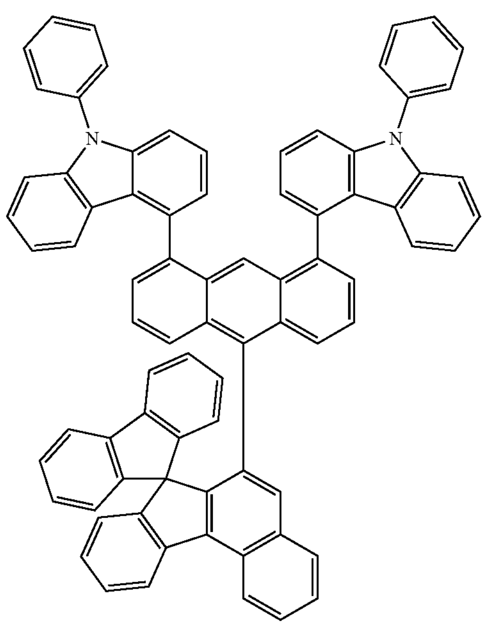
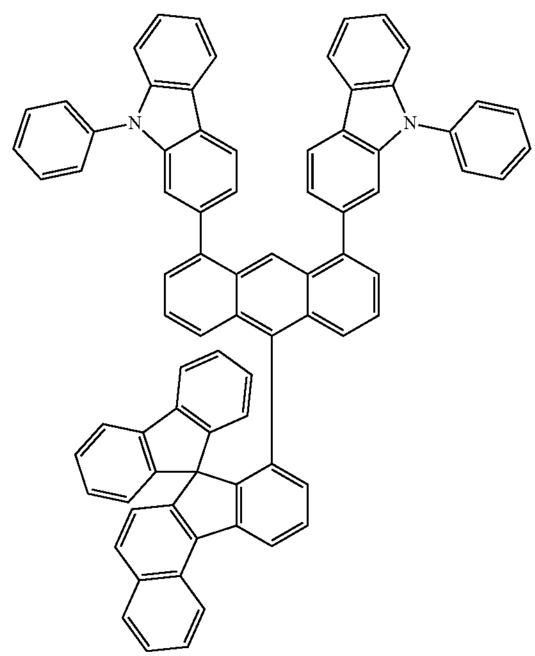

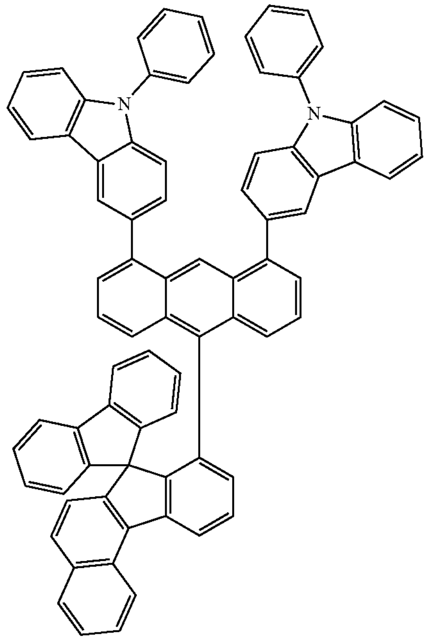
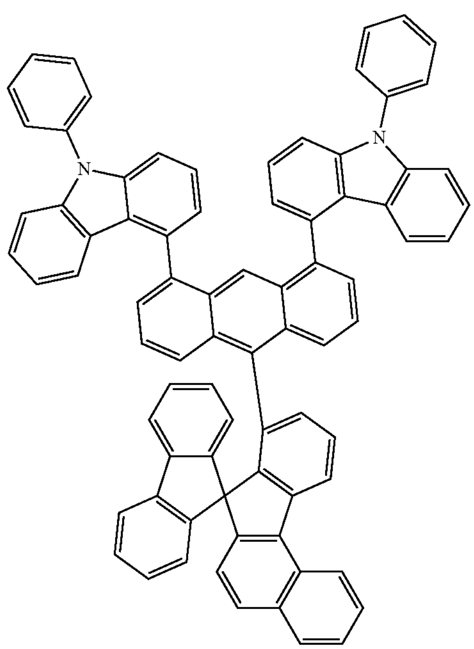
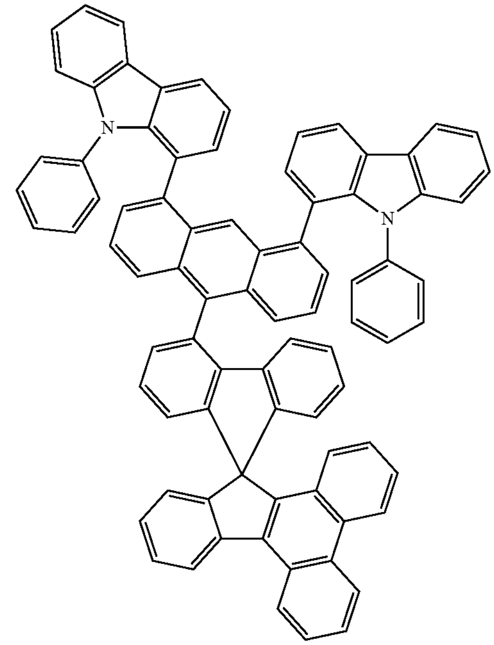
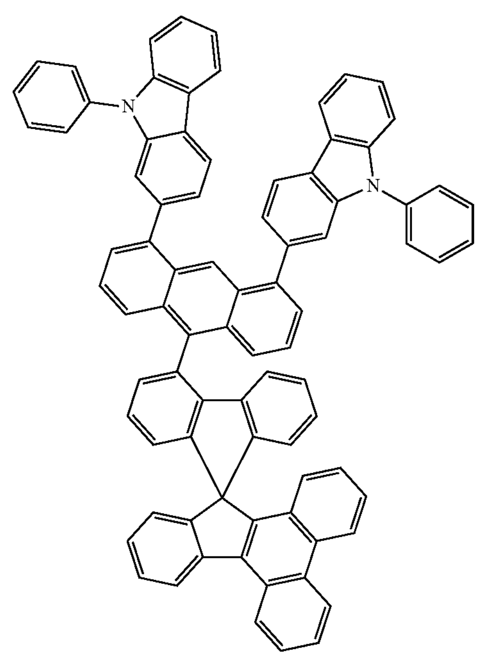

-continued
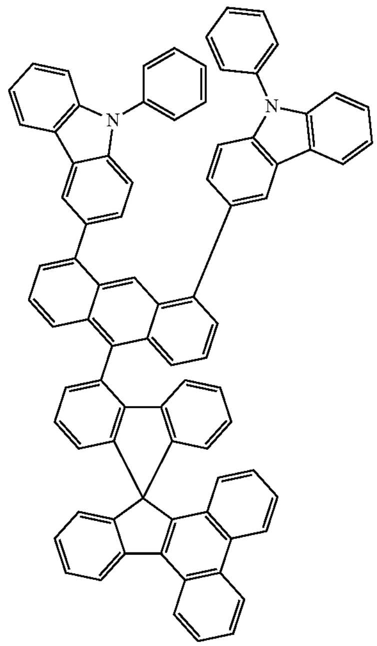
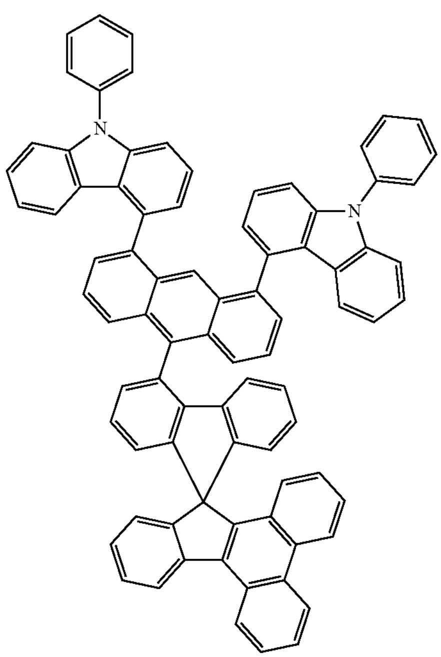
-continued
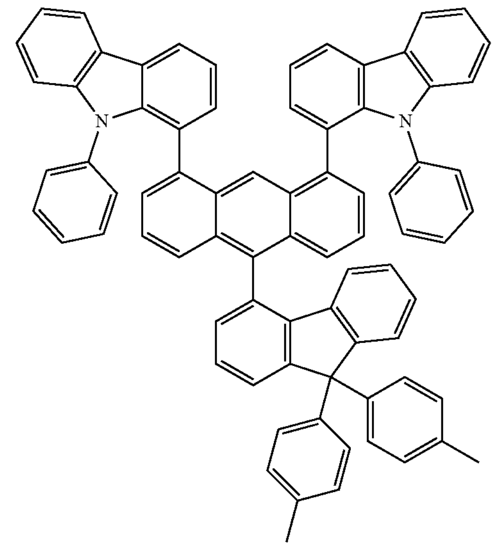
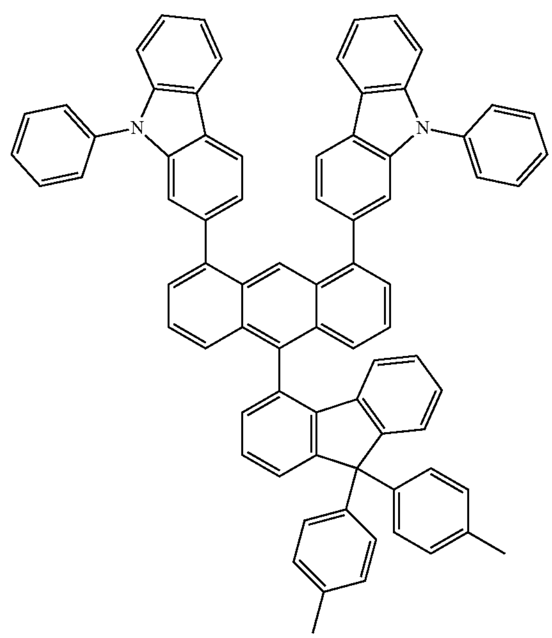

-continued
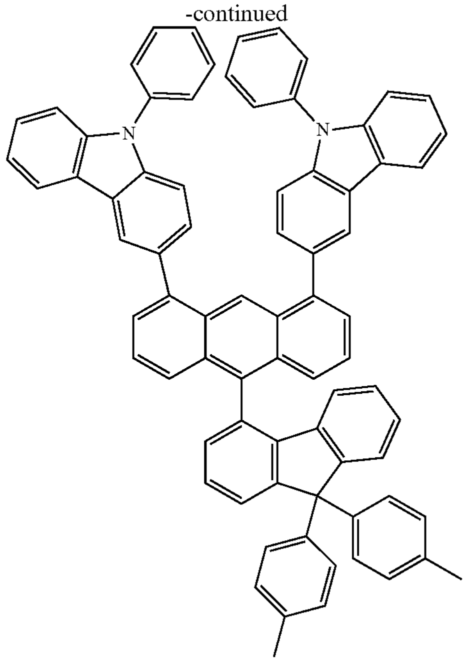
-continued
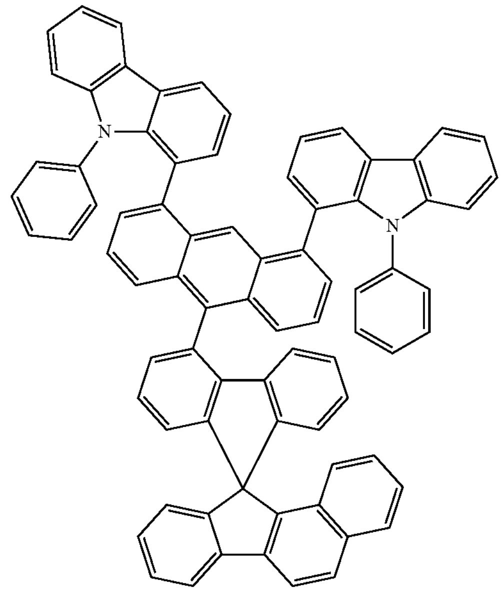
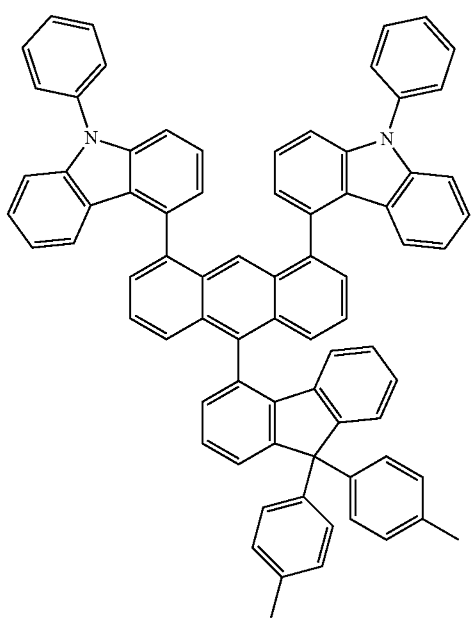
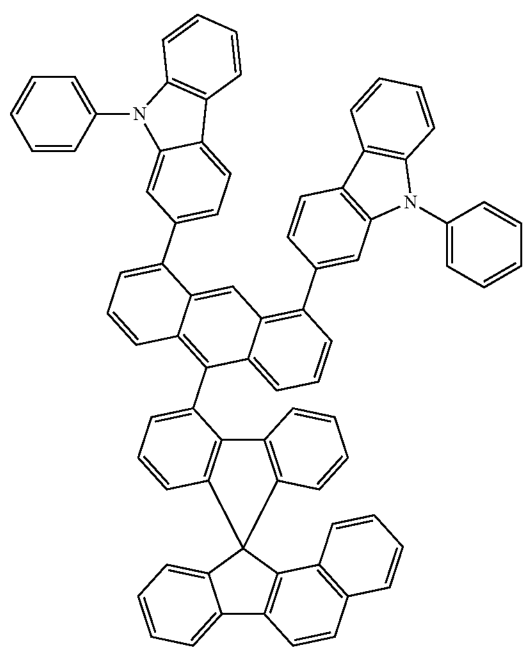

-continued
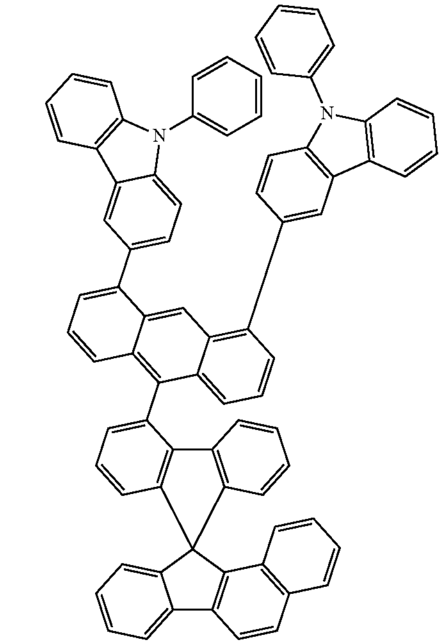
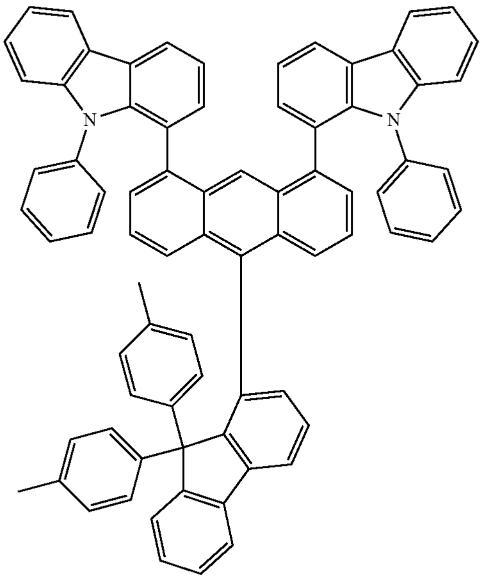
-continued
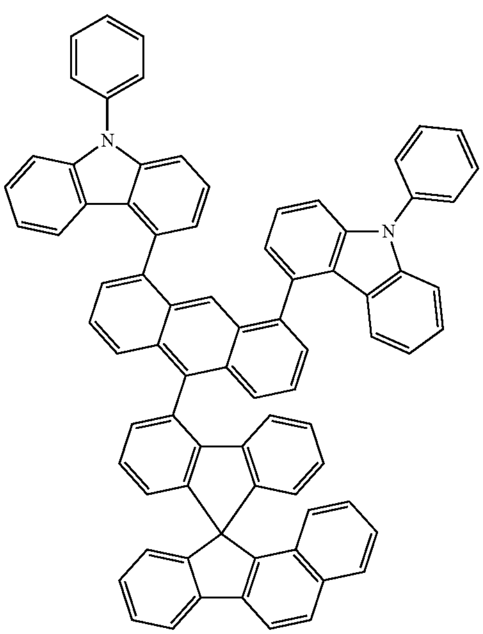
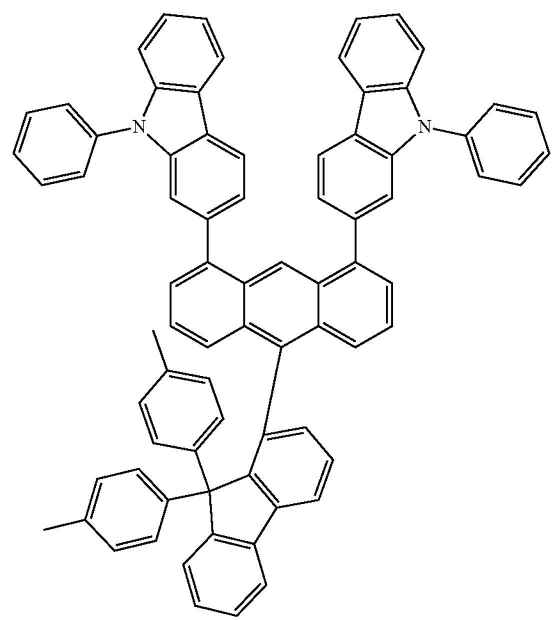

-continued
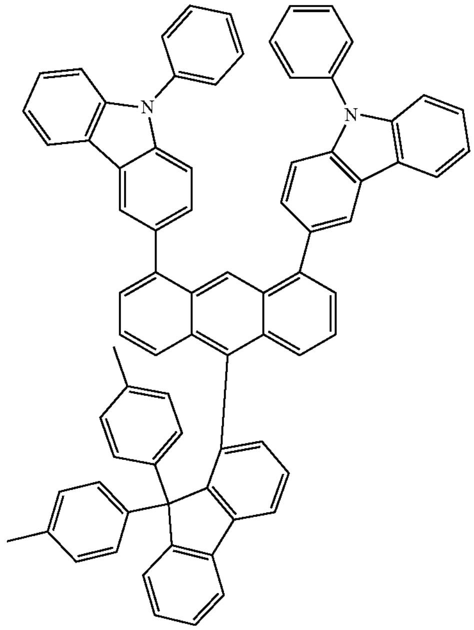
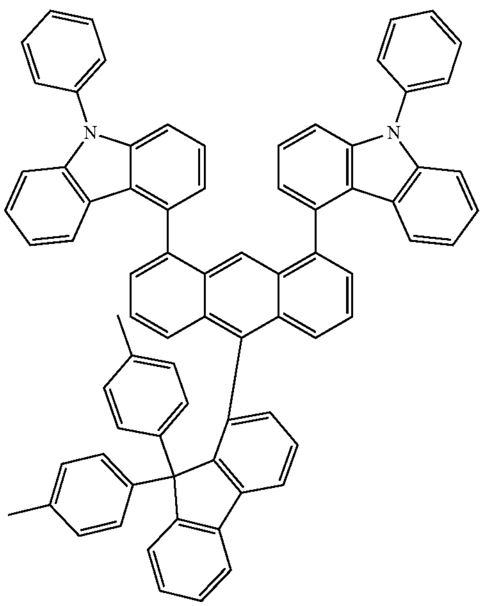
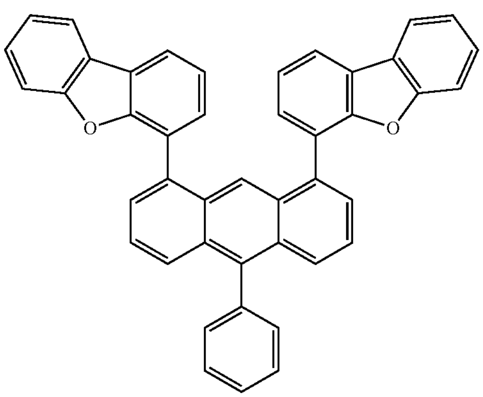
-continued
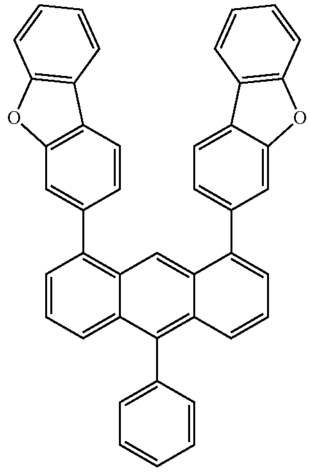
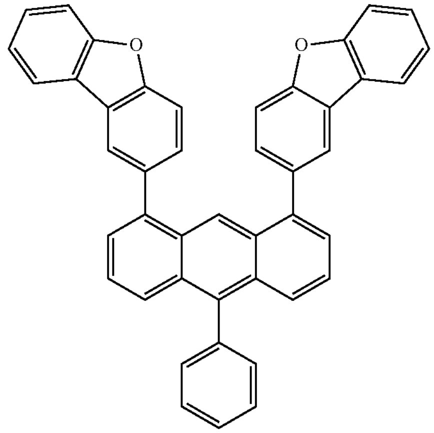
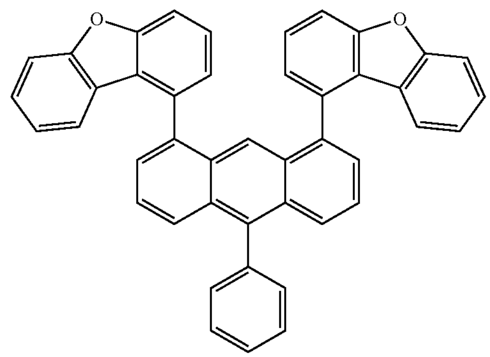
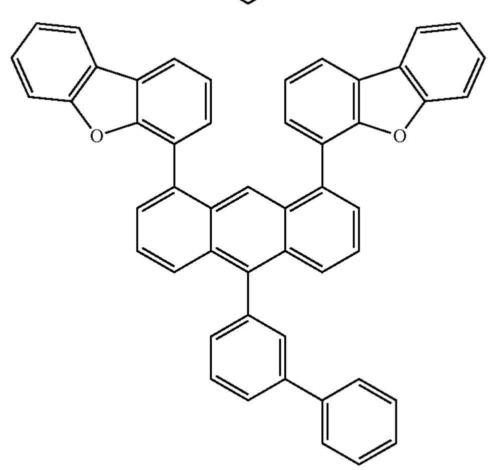

-continued
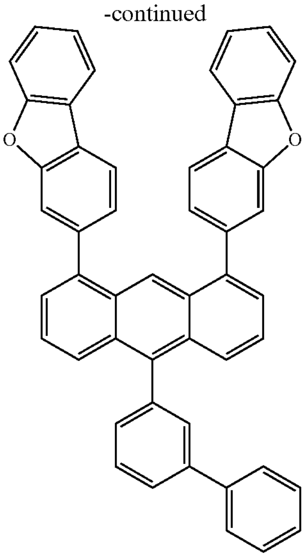
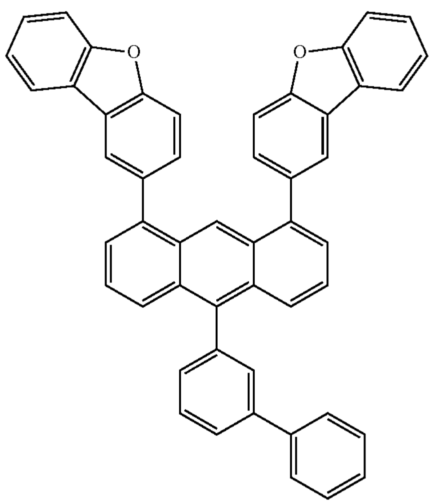
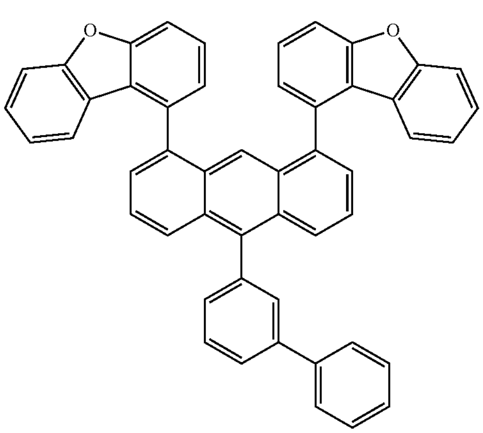
-continued
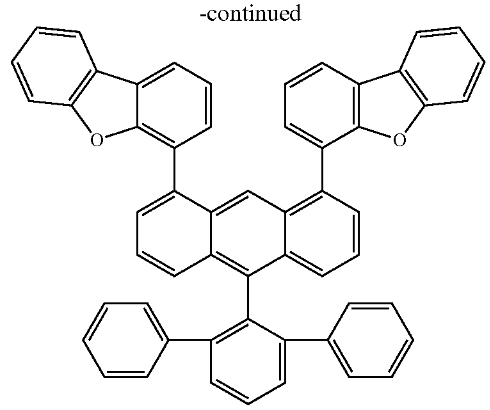
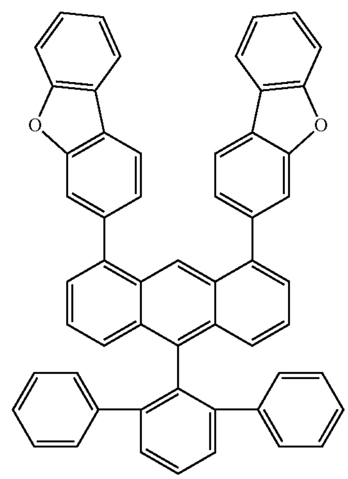
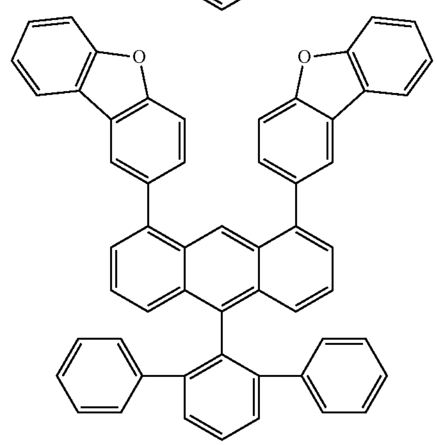
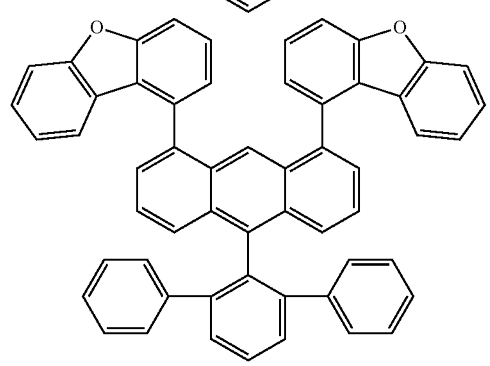

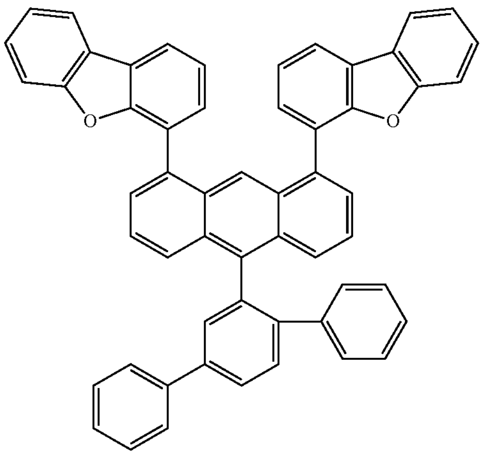
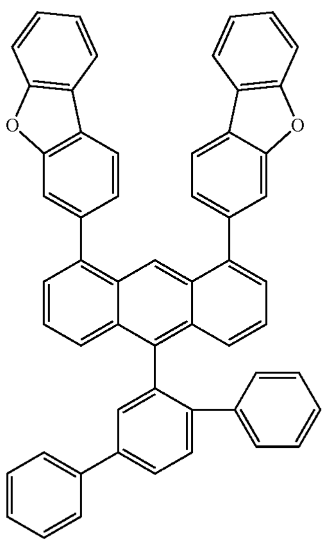
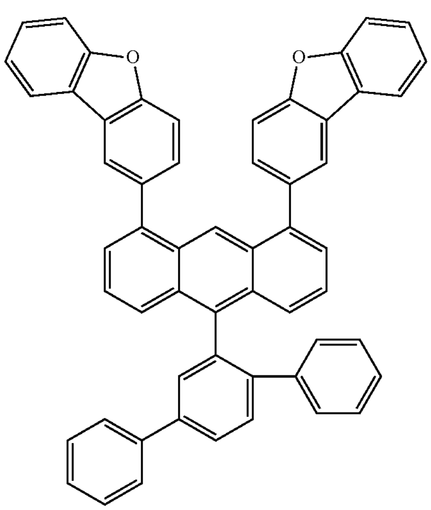
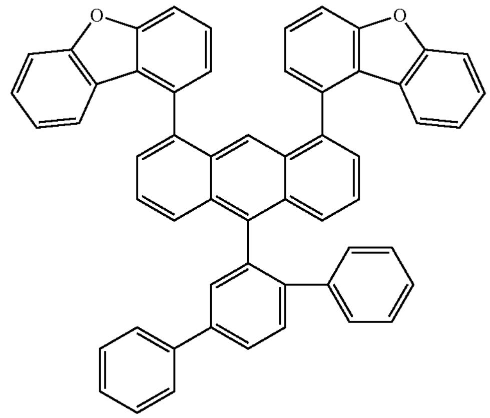
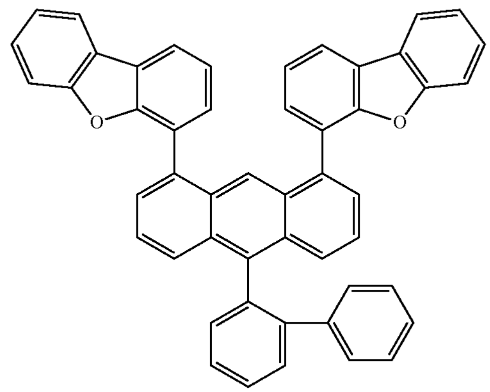
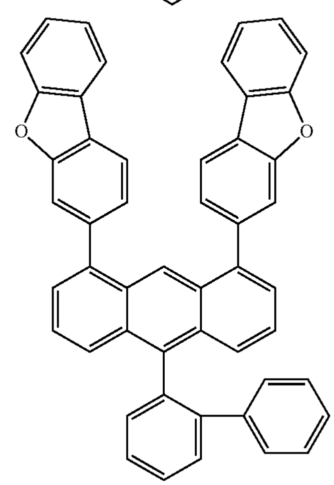
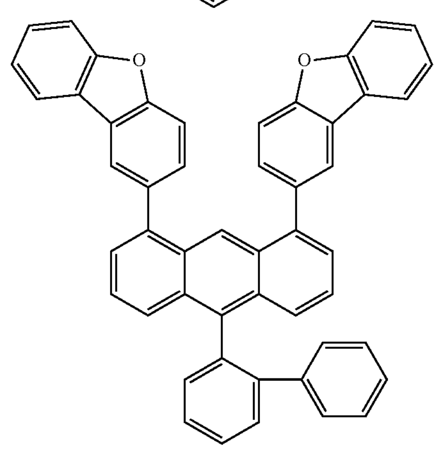

-continued
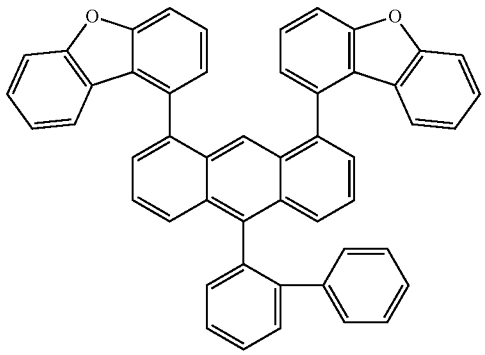
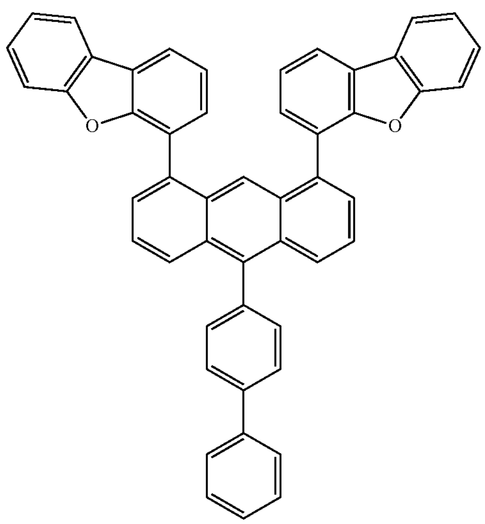
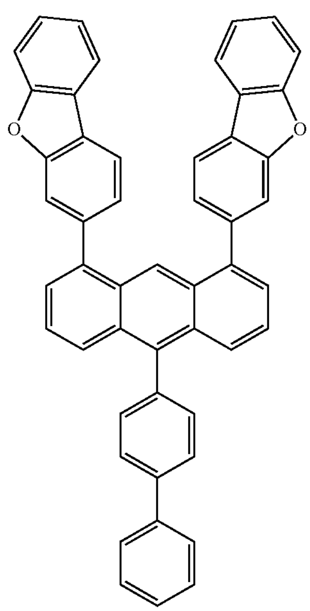
-continued
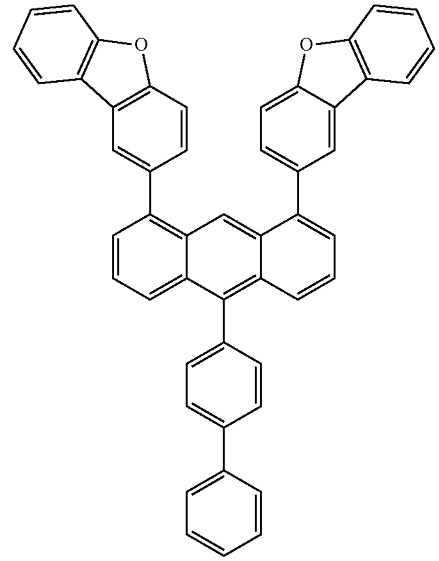
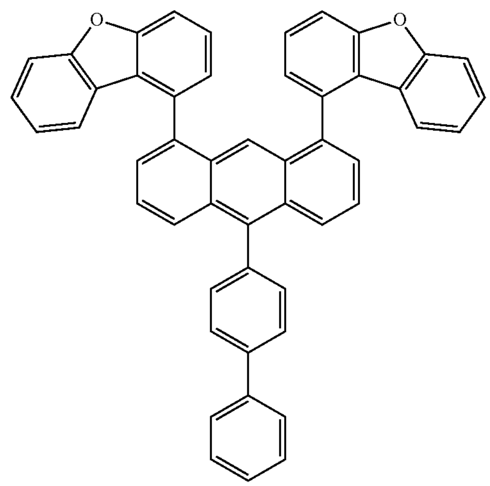
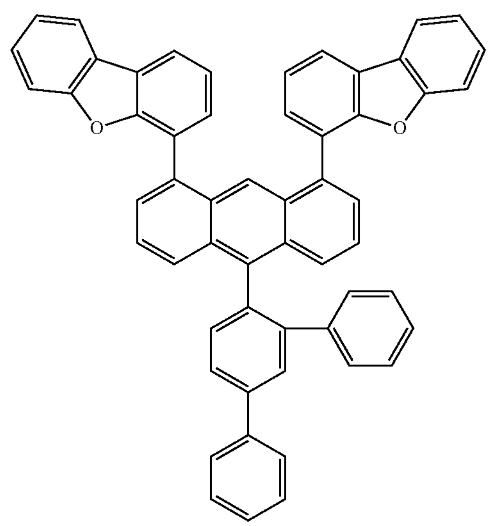

-continued
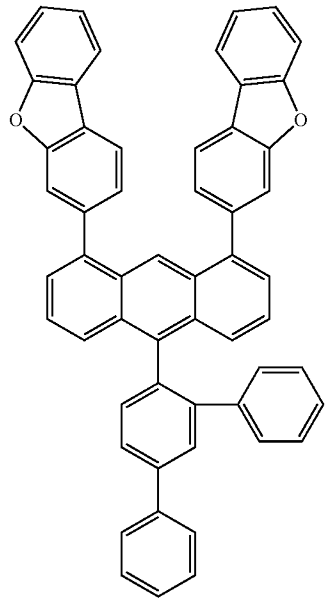
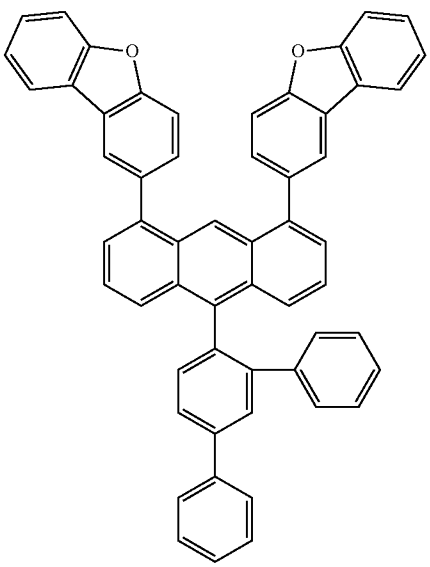
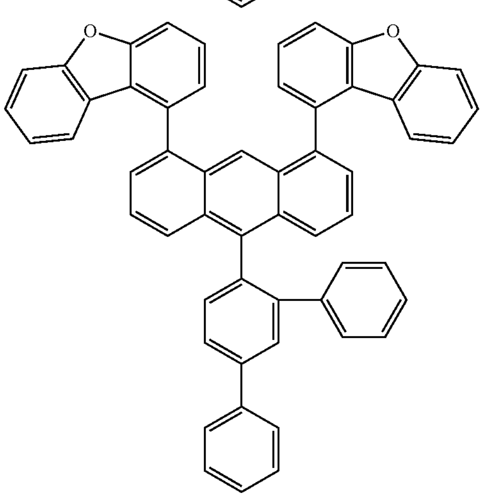
-continued
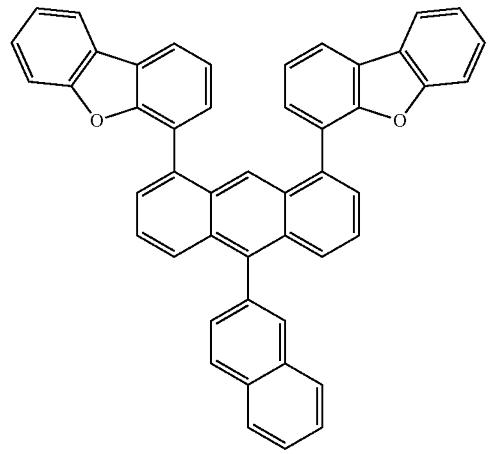
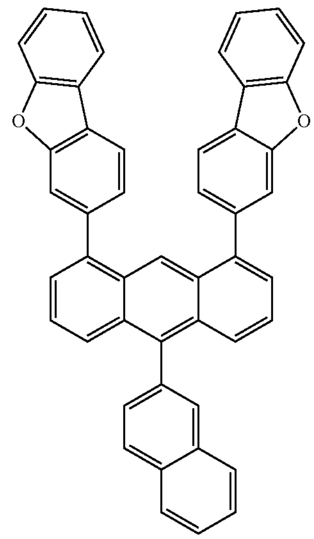
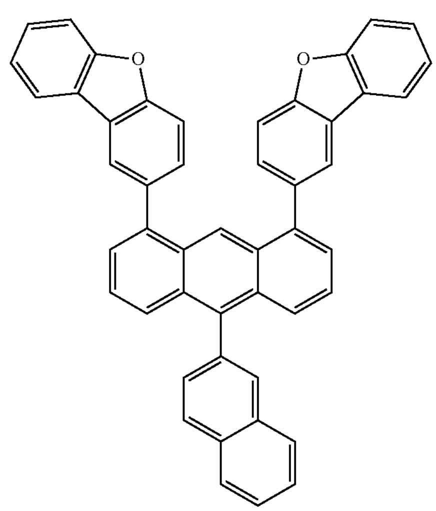

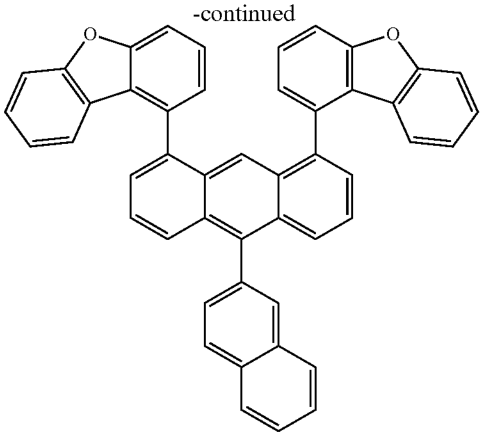
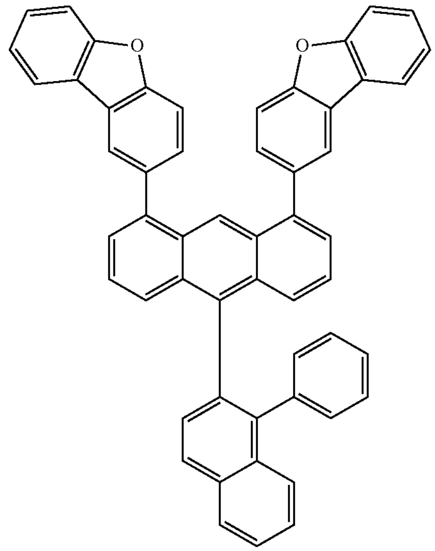
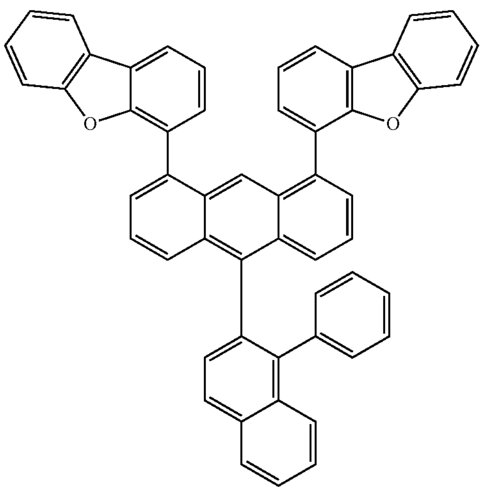
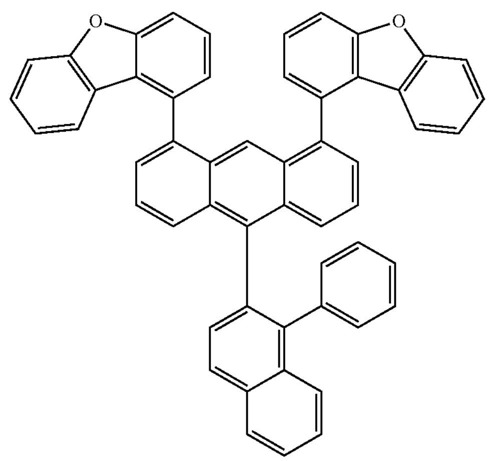
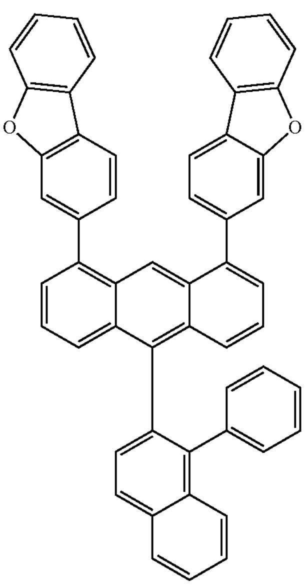
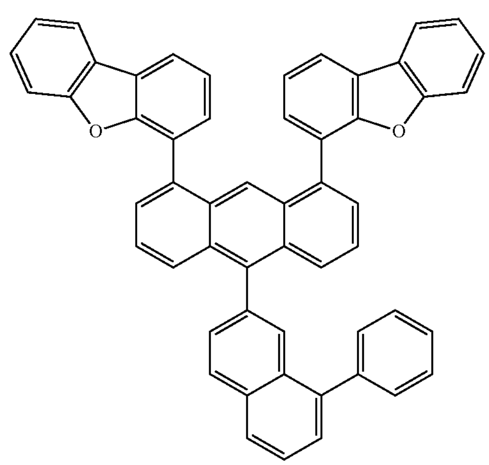

-continued
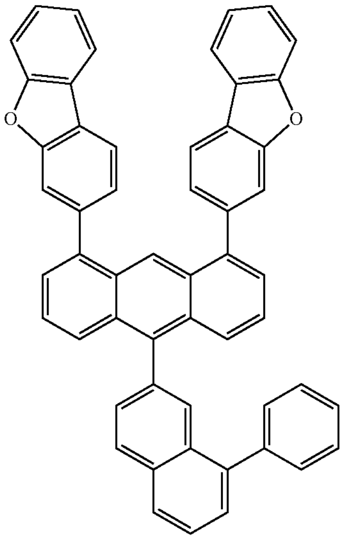
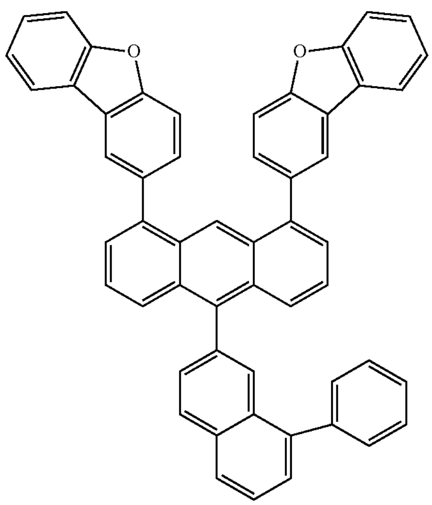
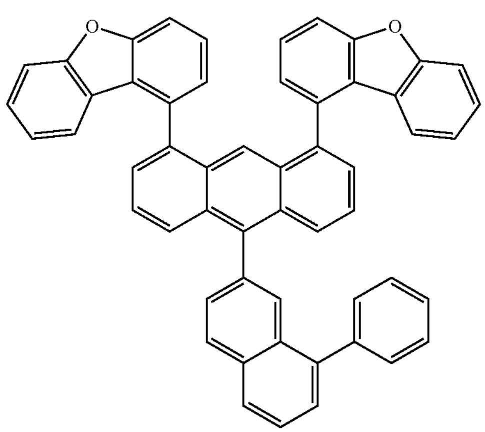
-continued
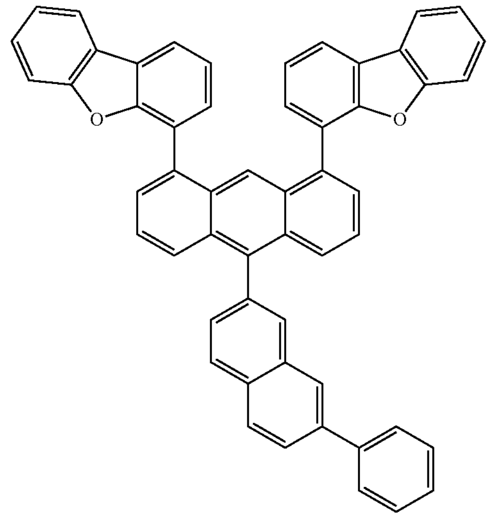
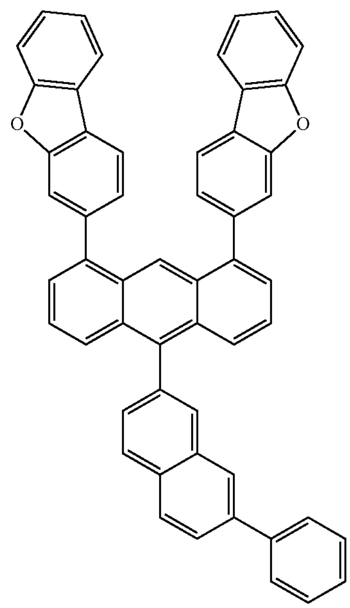
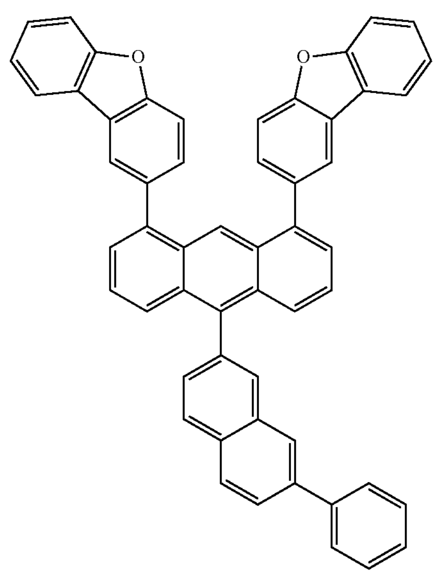

-continued
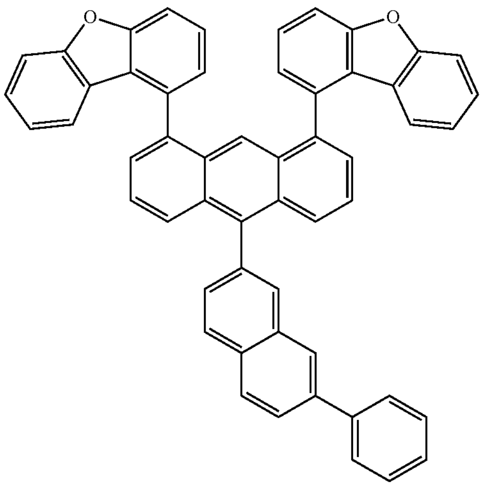
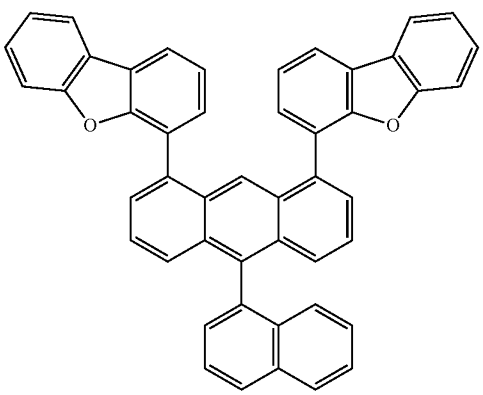
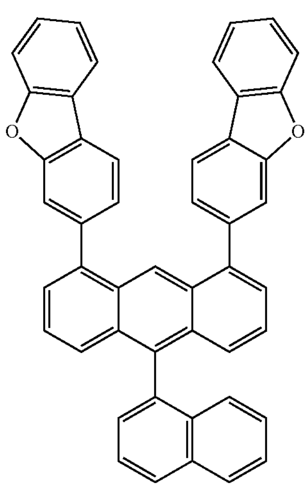
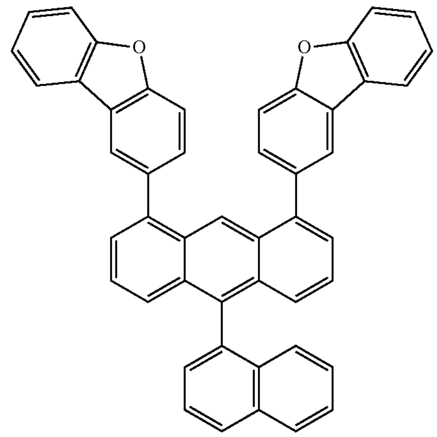
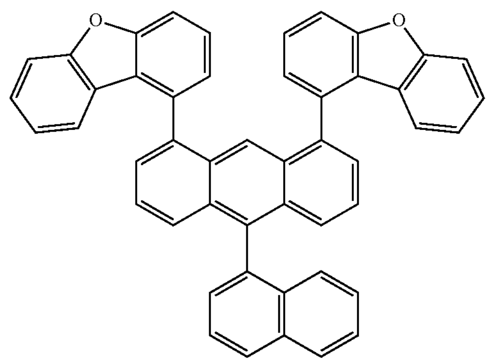
-continued
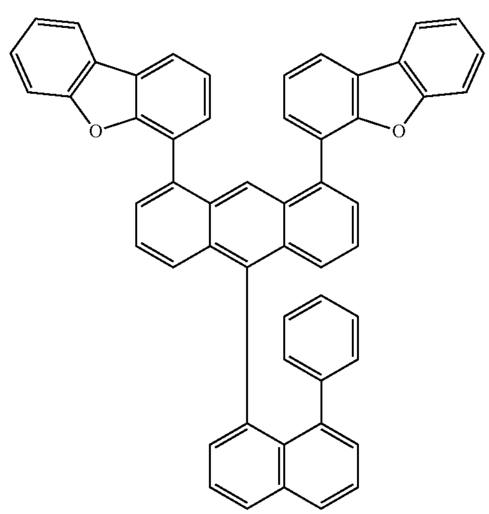

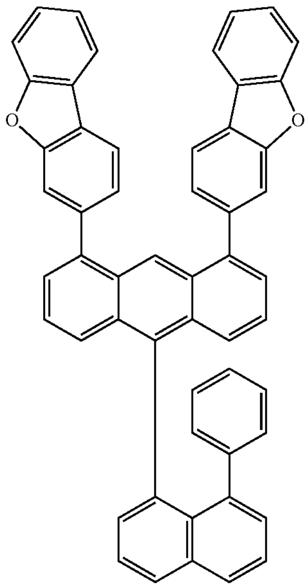
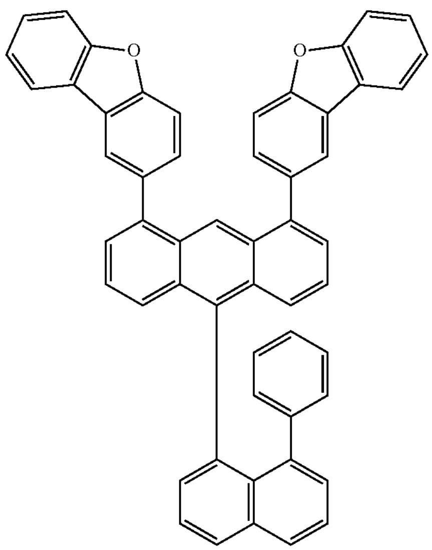
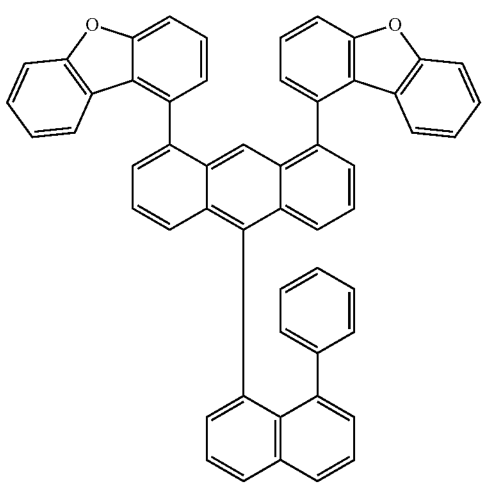
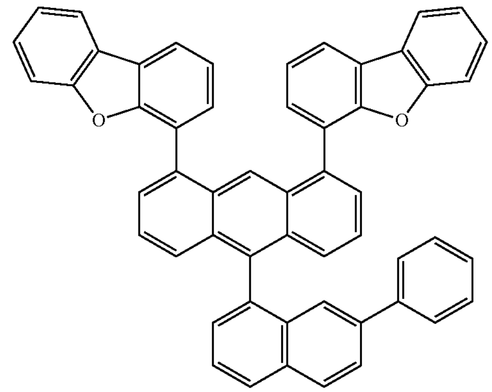
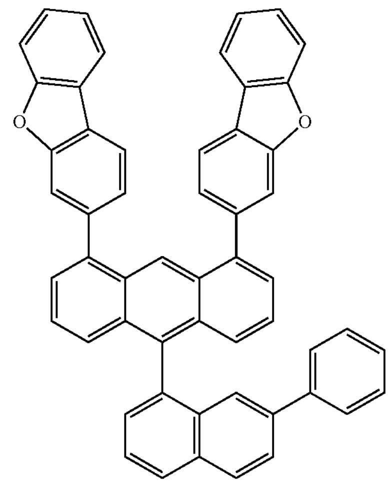
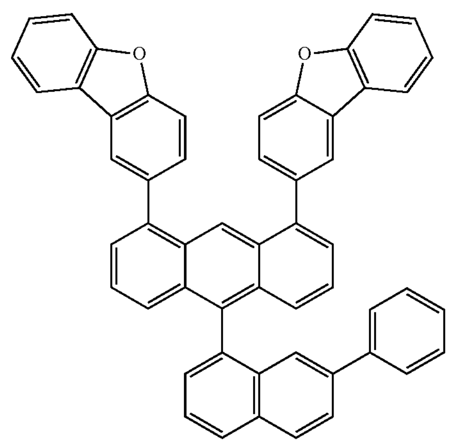
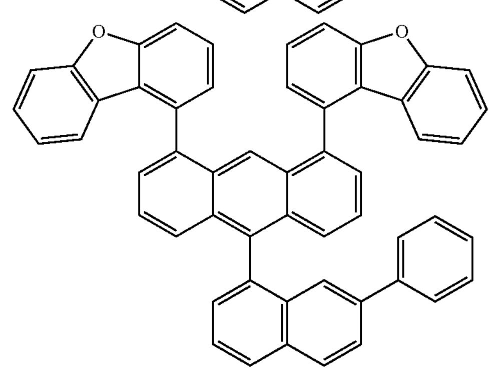

-continued
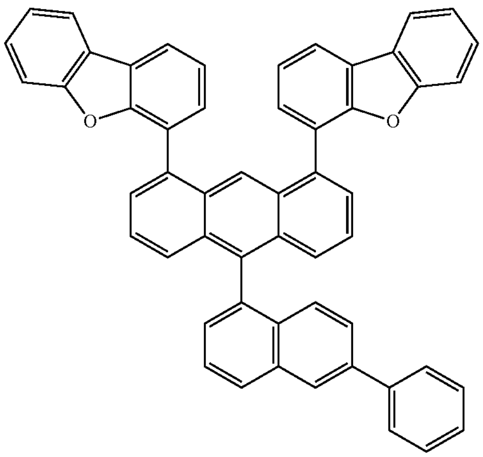
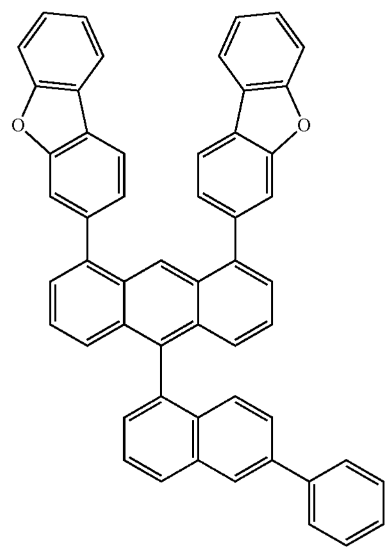
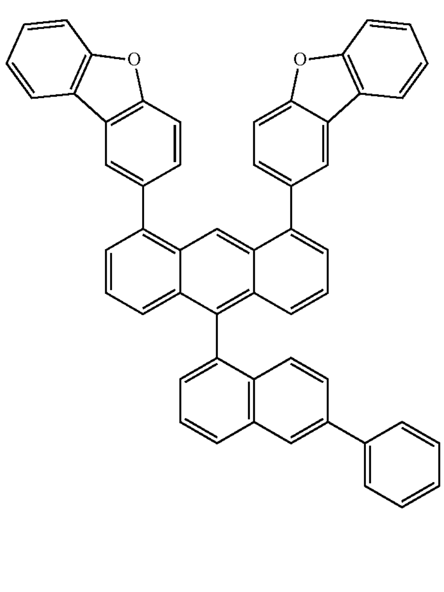
-continued
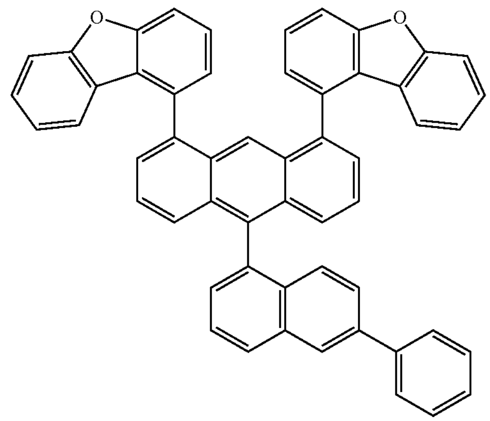
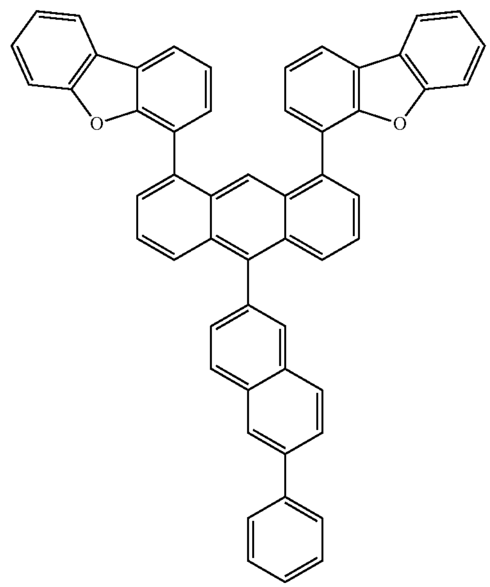
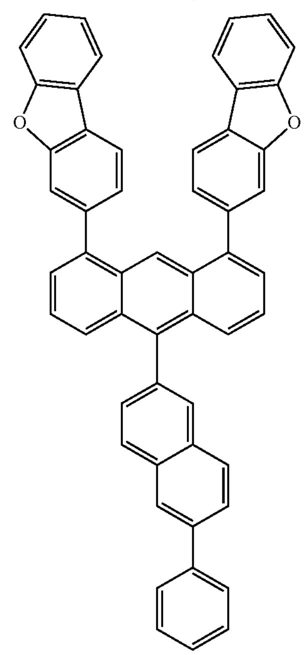

-continued
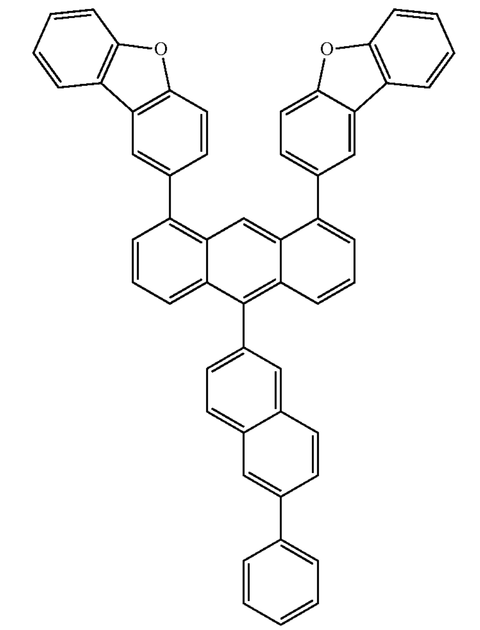
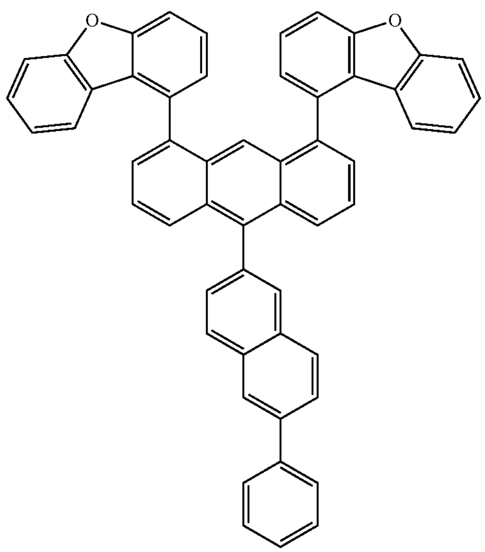
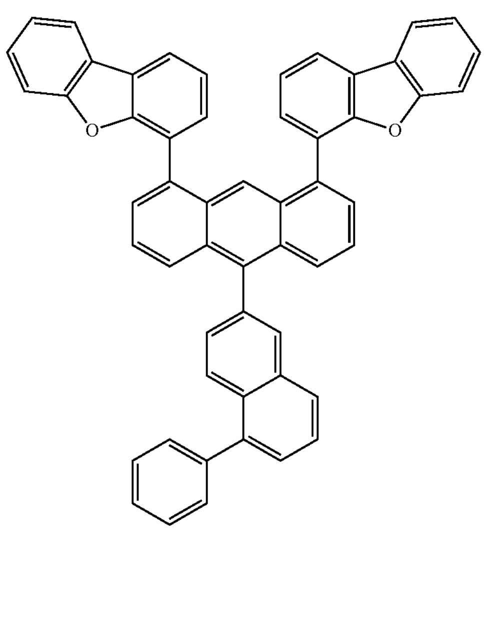
-continued
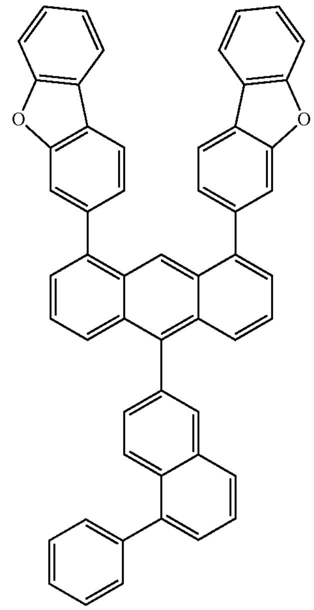
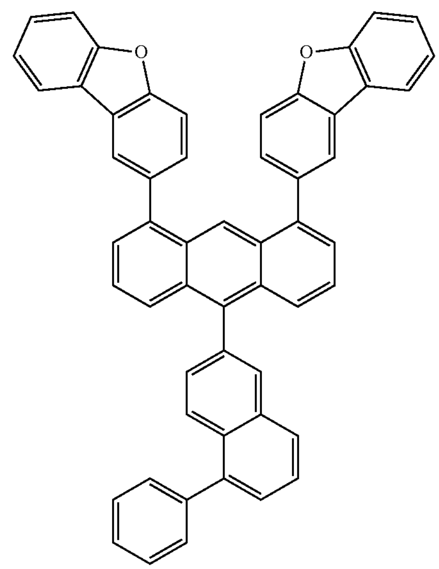
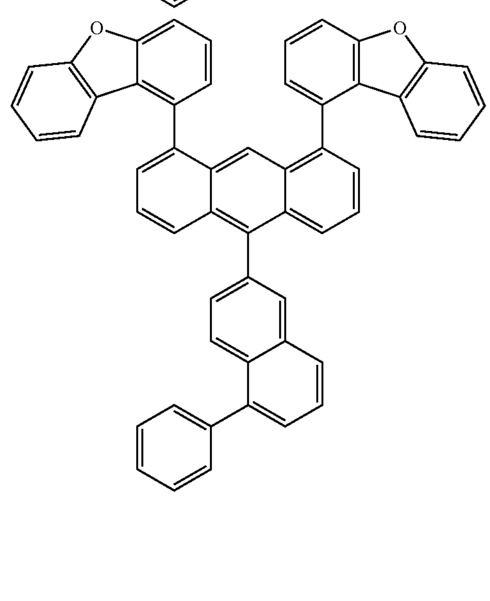

-continued
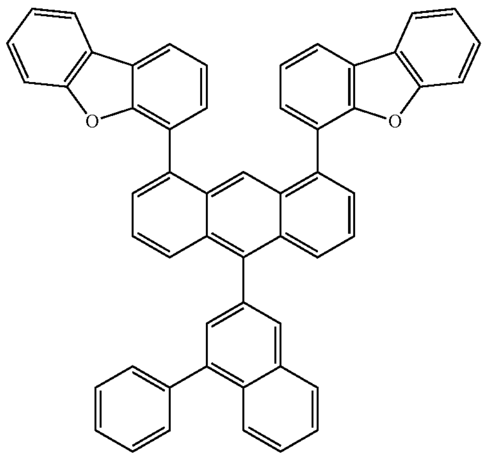
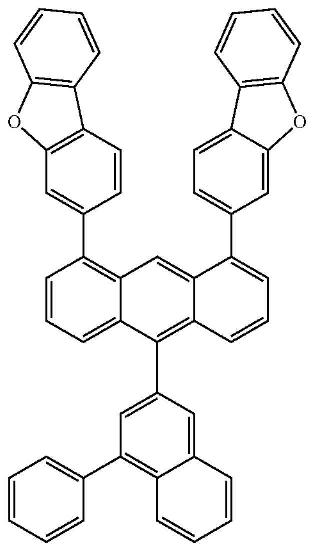
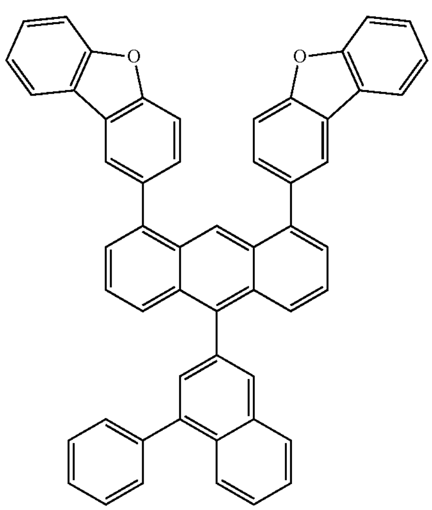
-continued
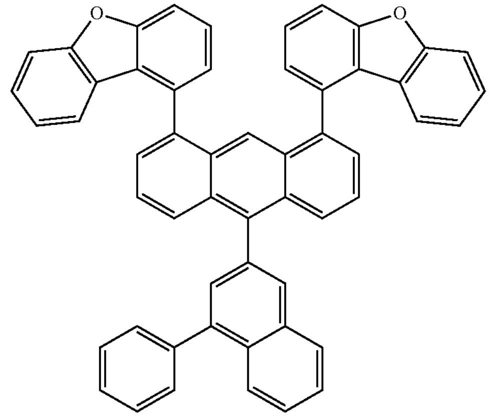
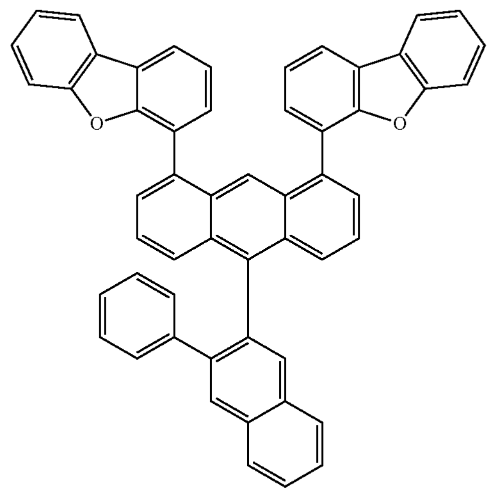
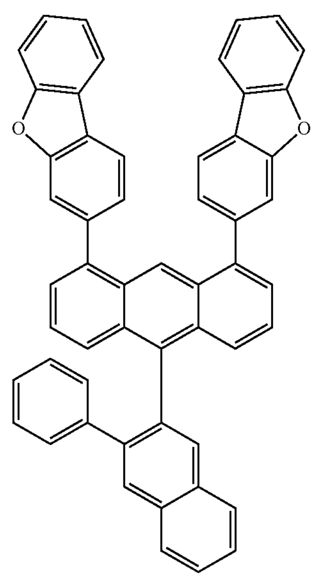

-continued
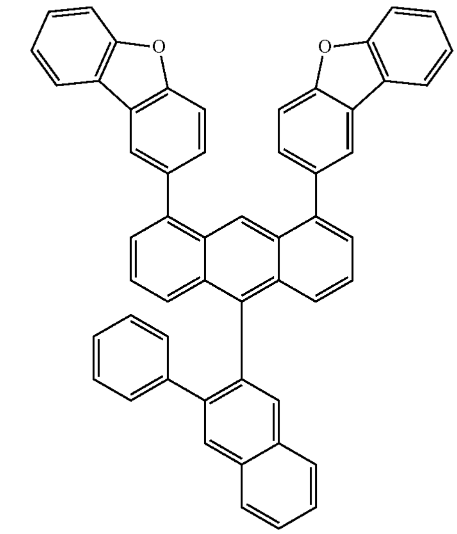
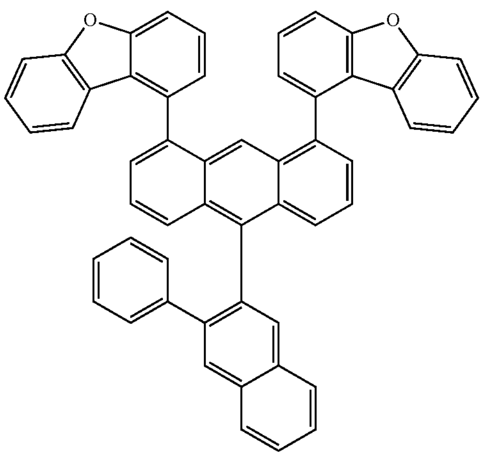
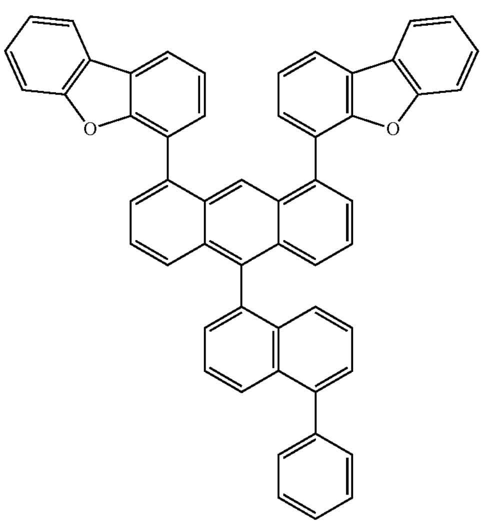
-continued
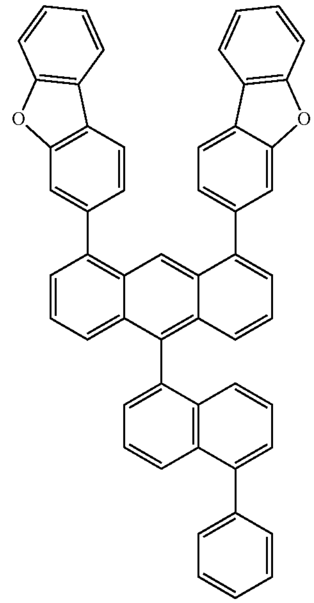
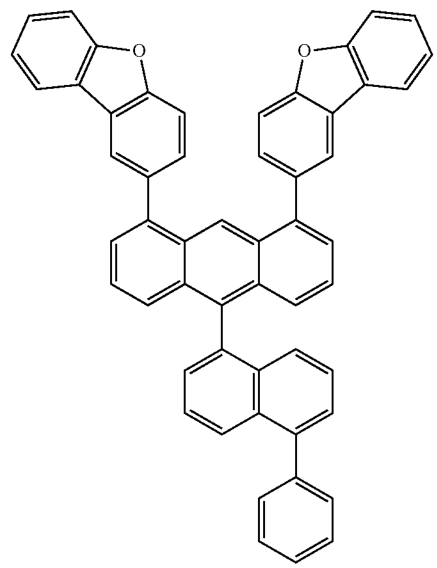
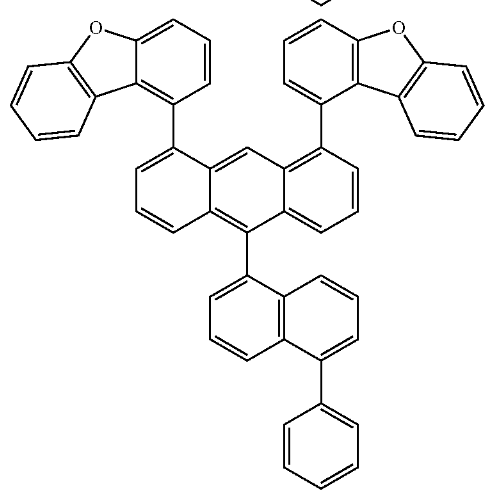

-continued
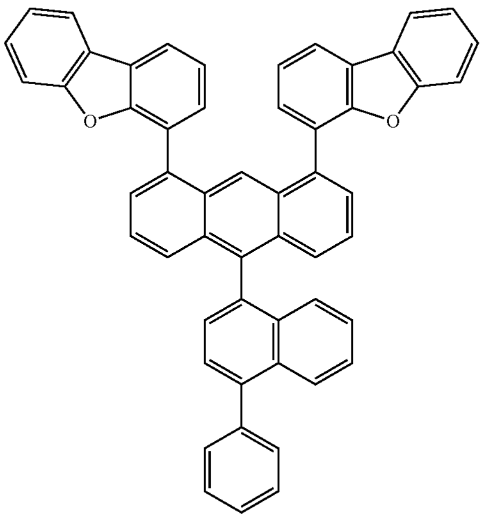
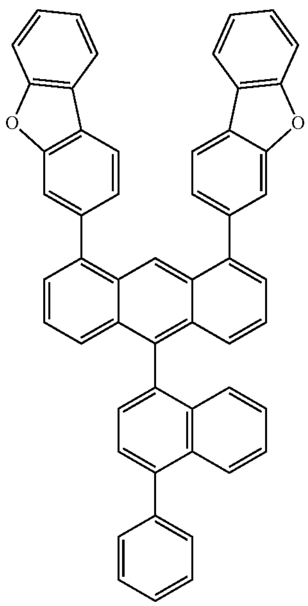
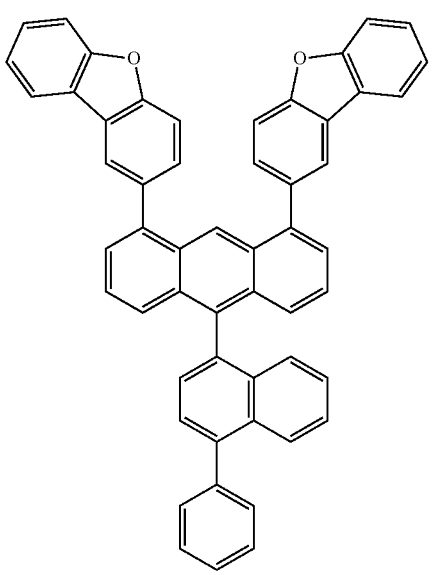
-continued
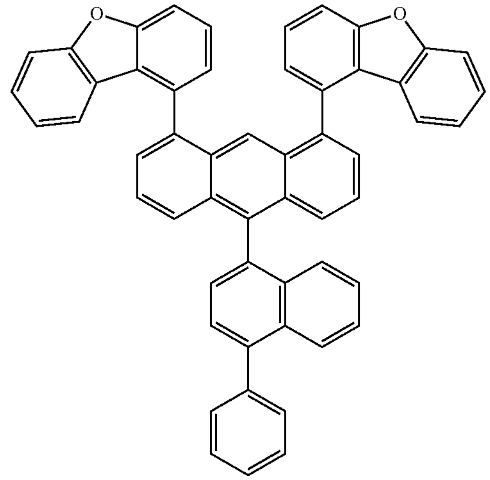
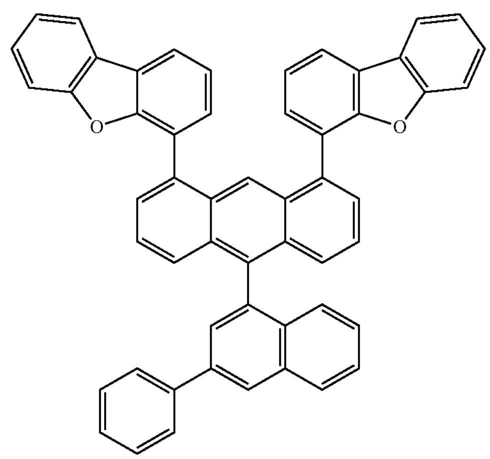
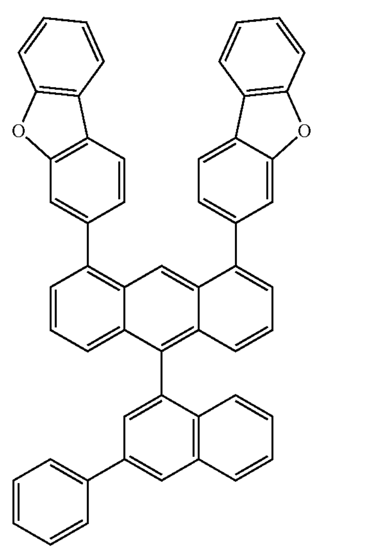

-continued
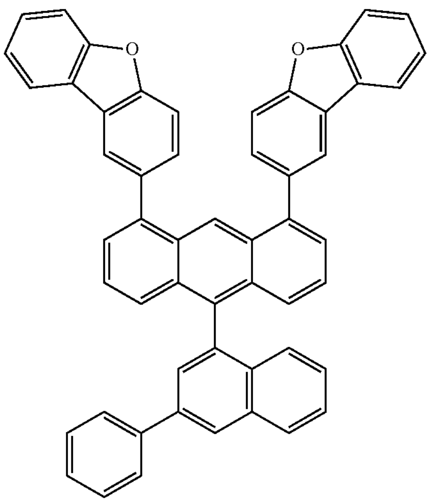
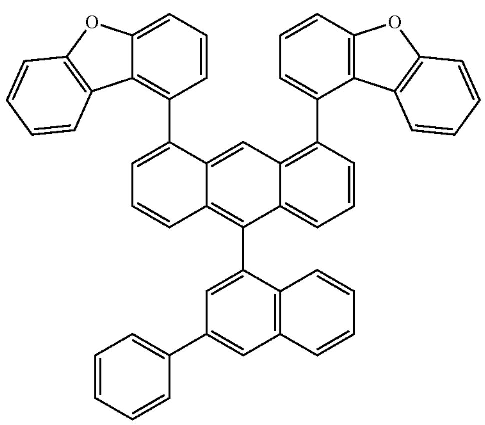
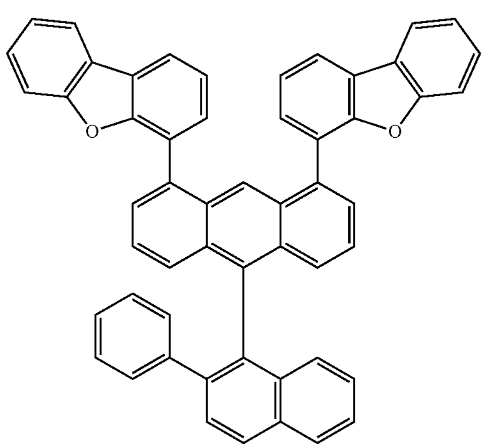
-continued
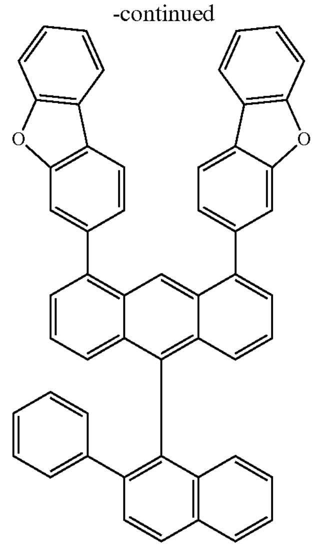
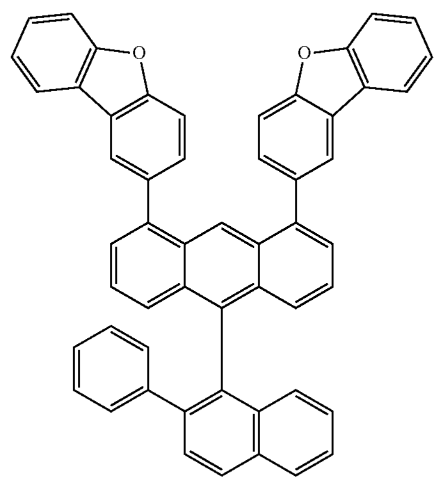
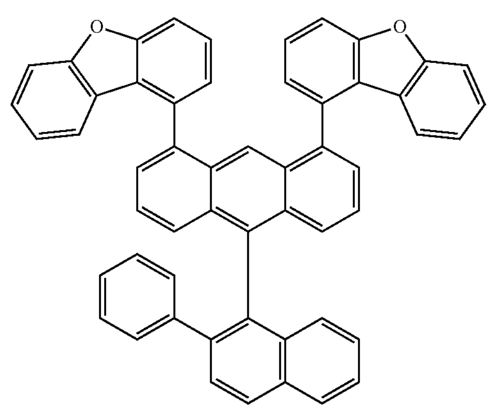

-continued
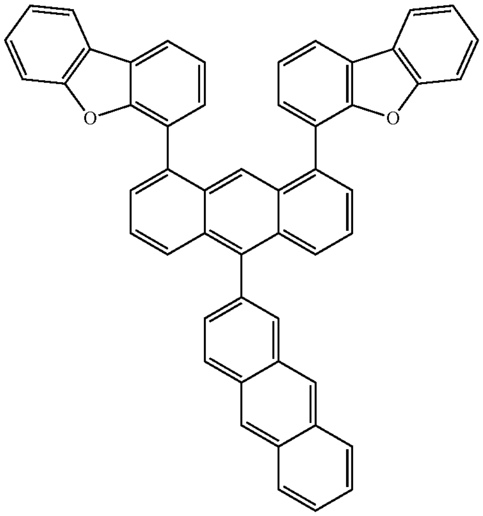
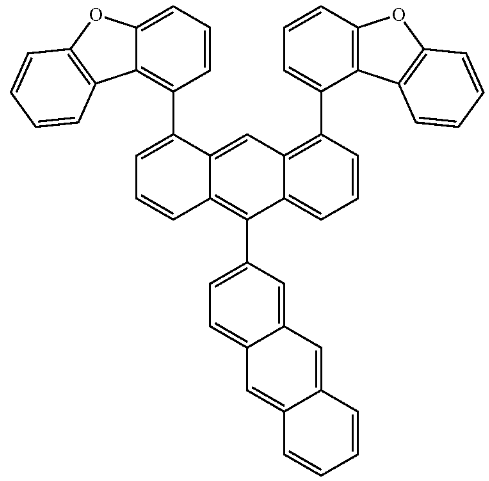
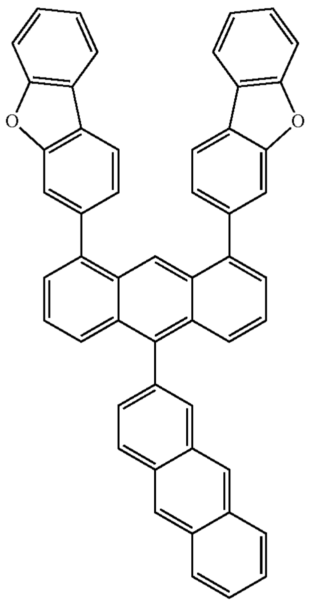
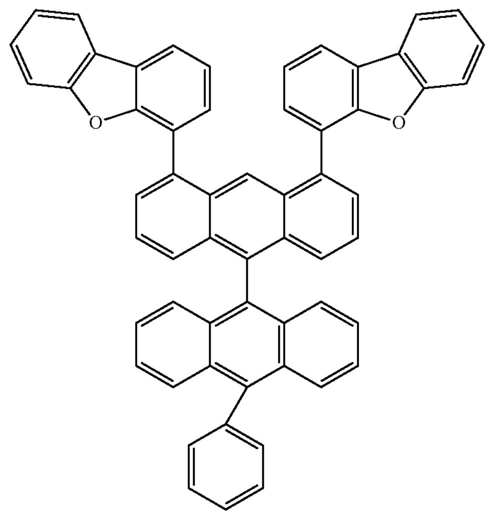
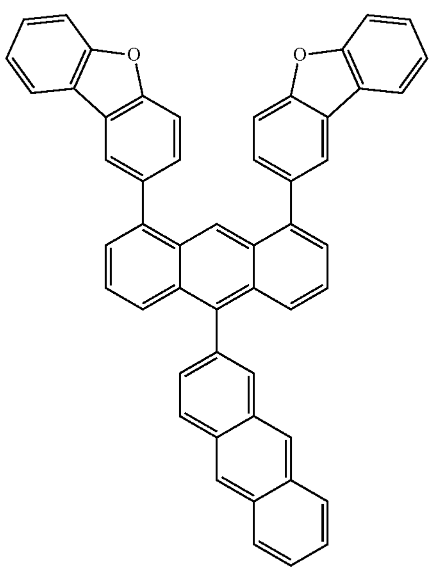
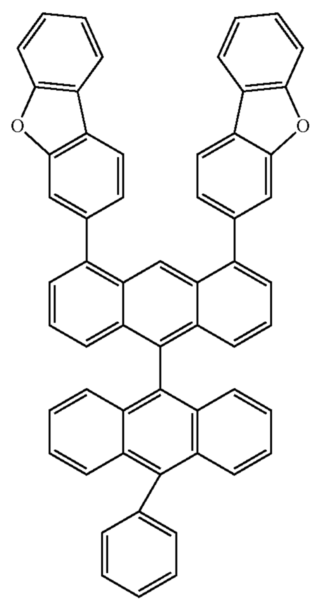

-continued
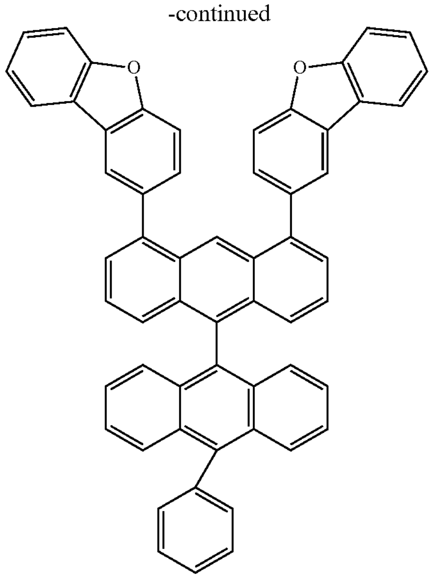
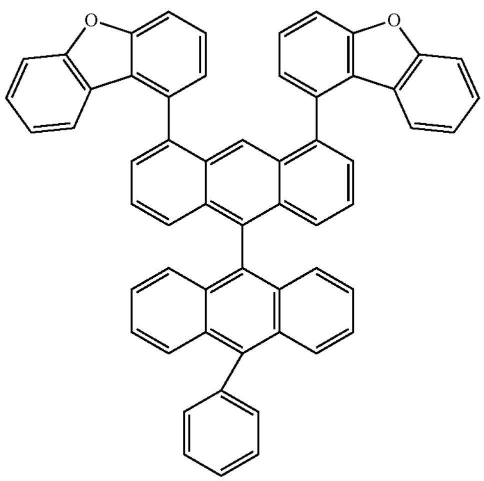
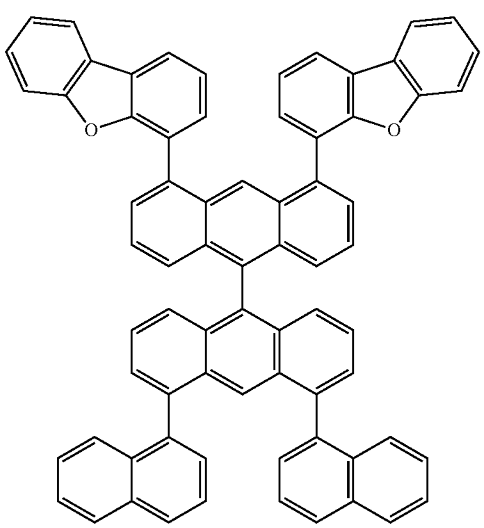
-continued
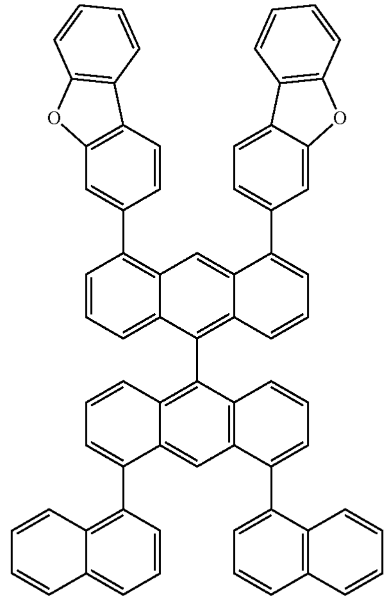
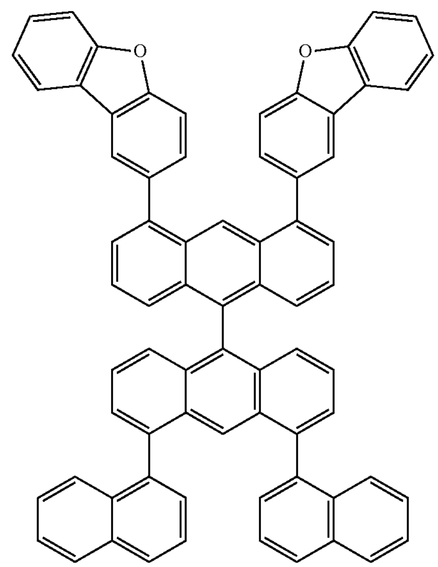
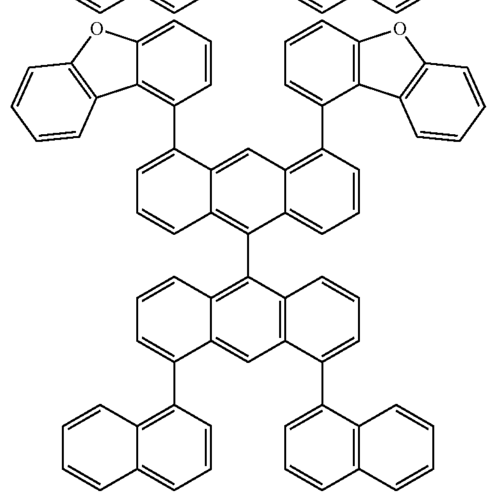

-continued
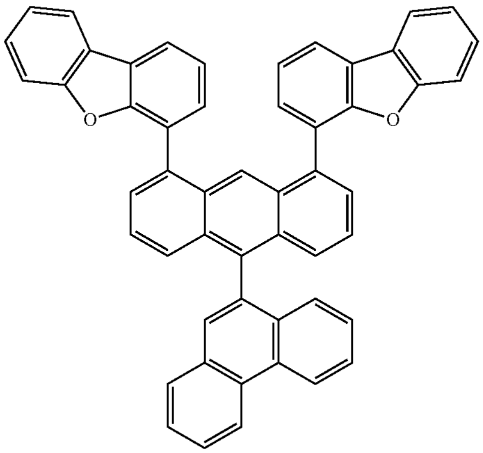
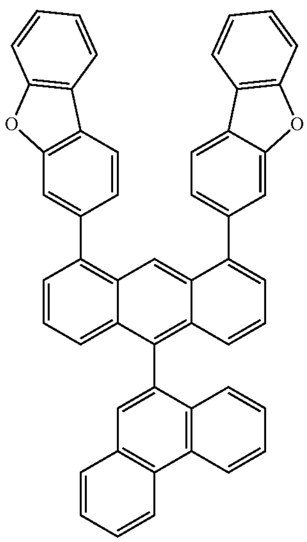
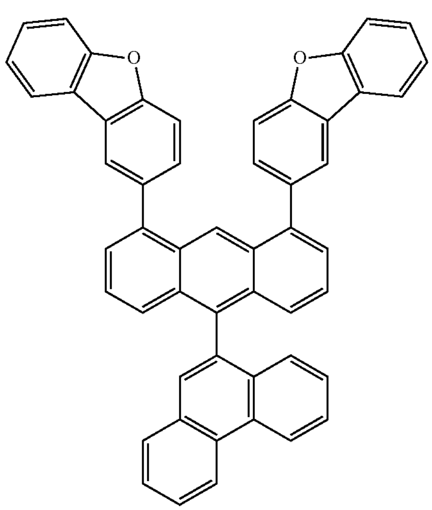
-continued
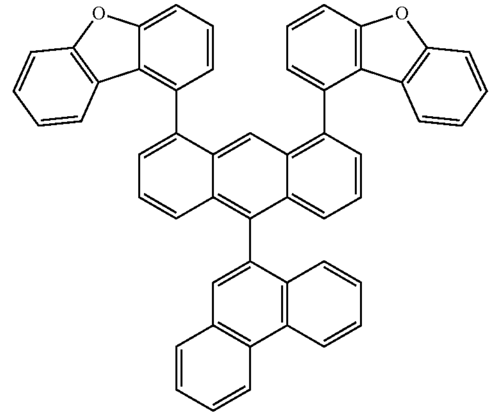
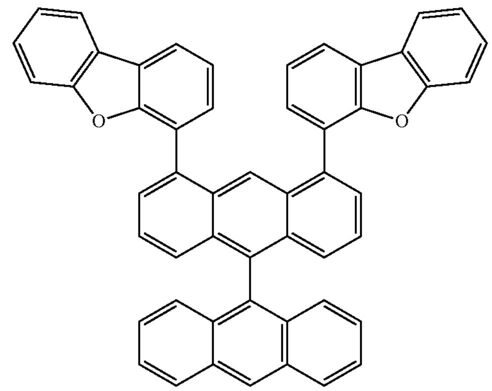
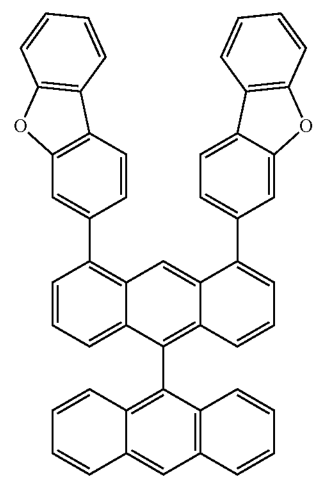
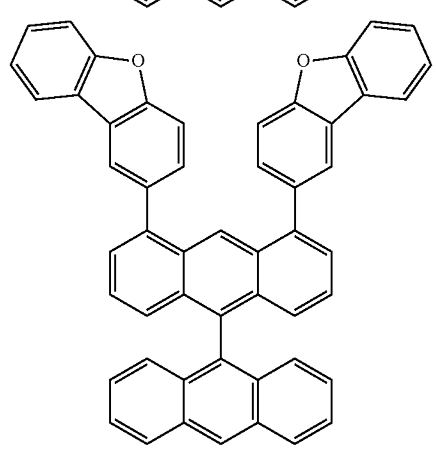

-continued
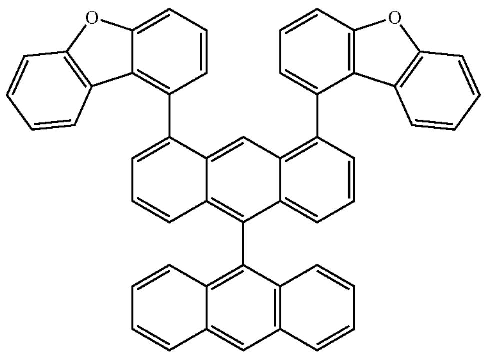
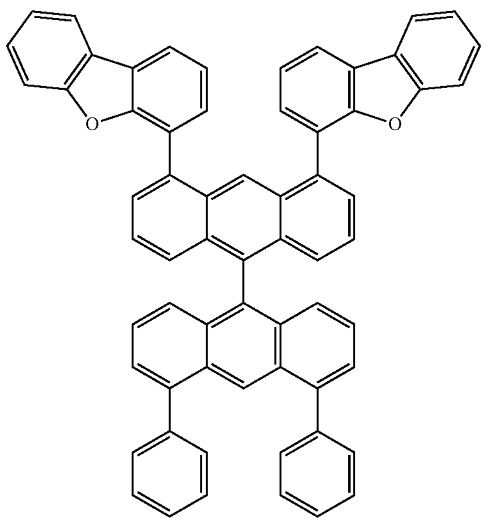
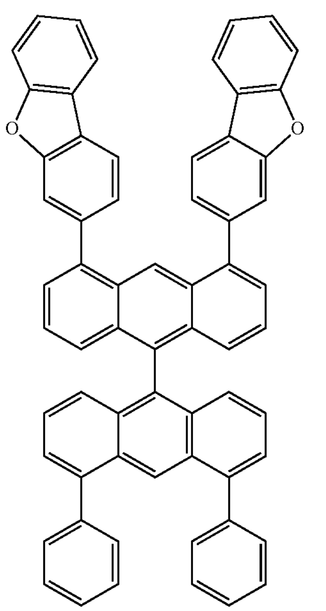
-continued
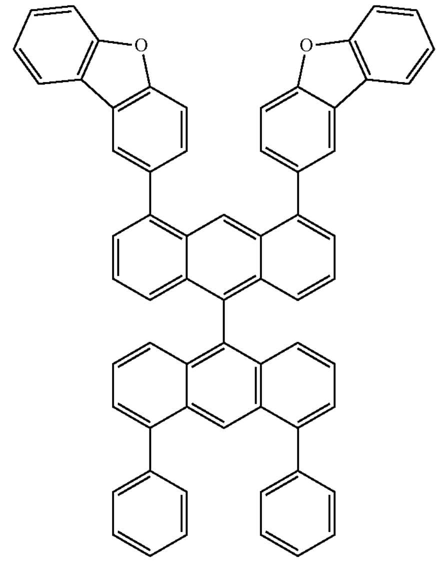
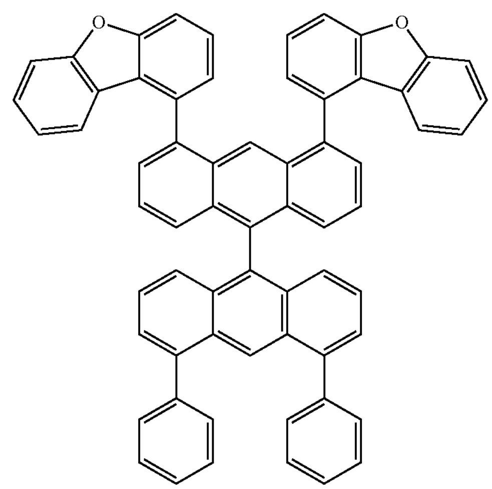
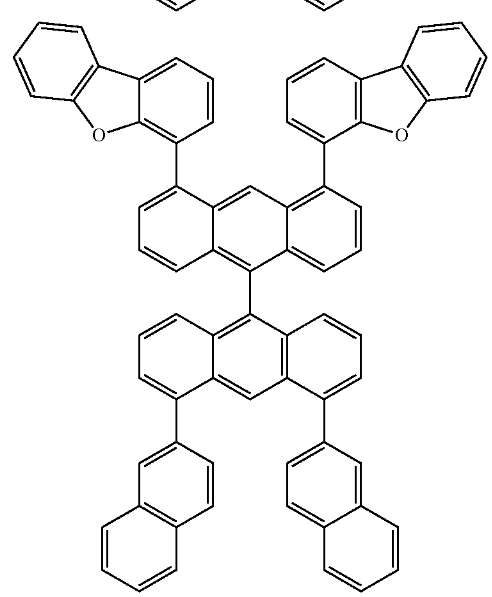

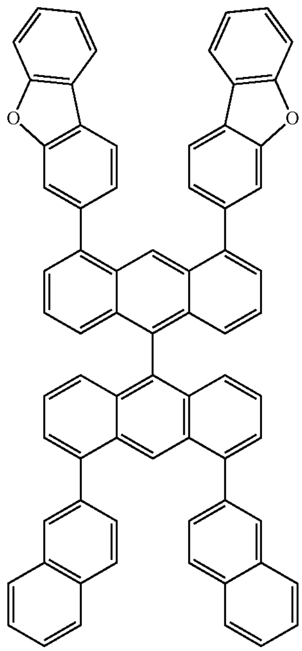
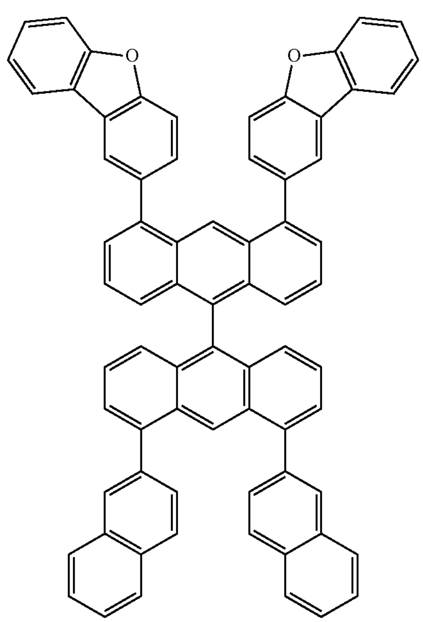
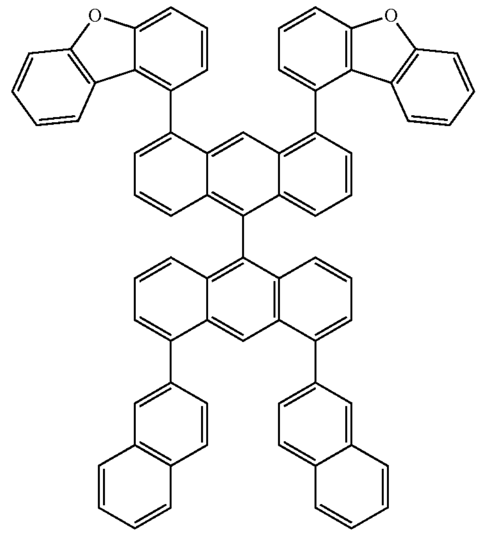
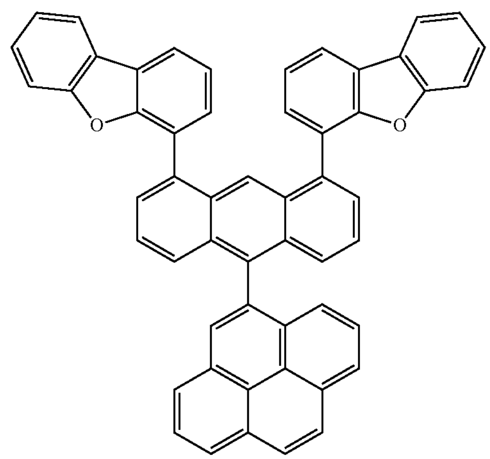
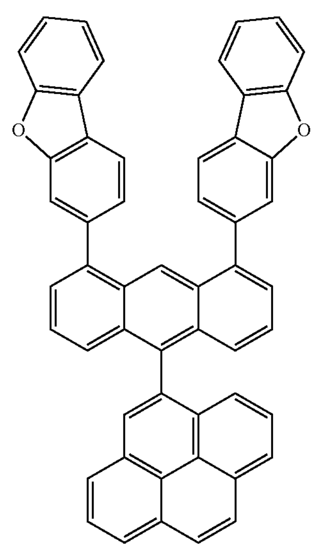

-continued
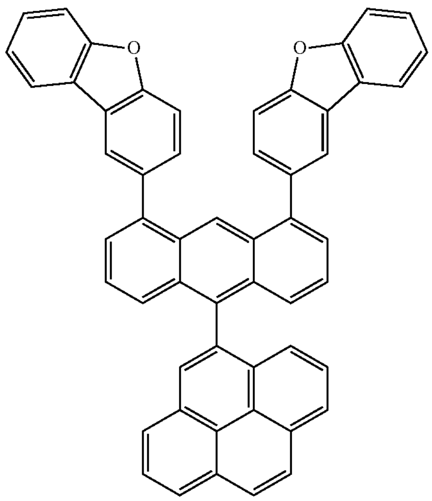
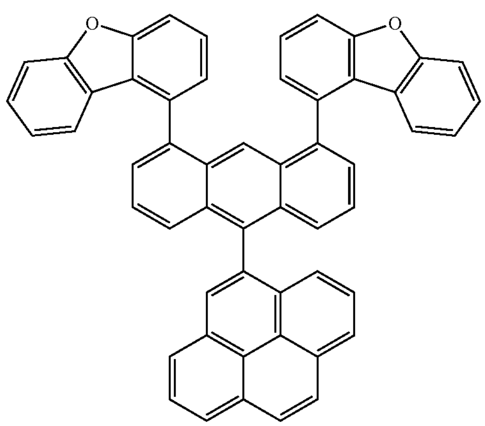
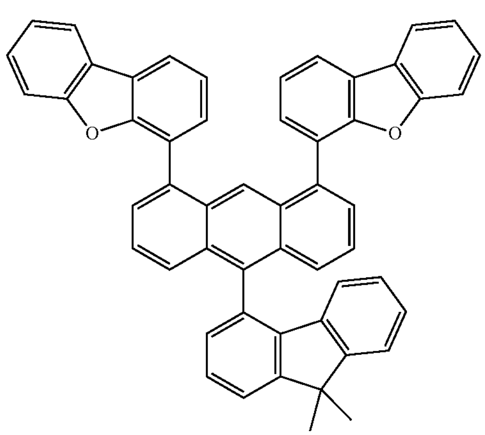
-continued
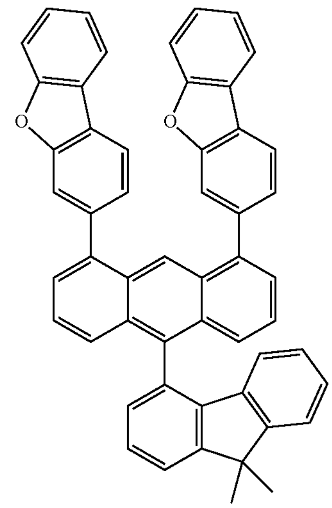
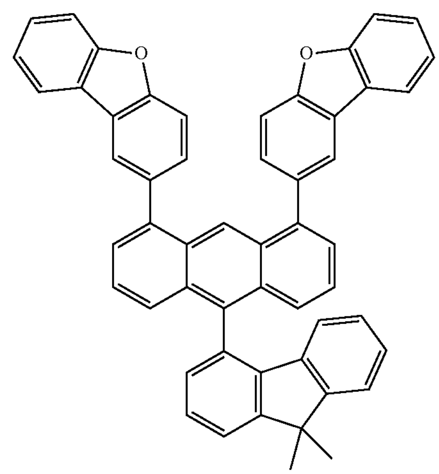
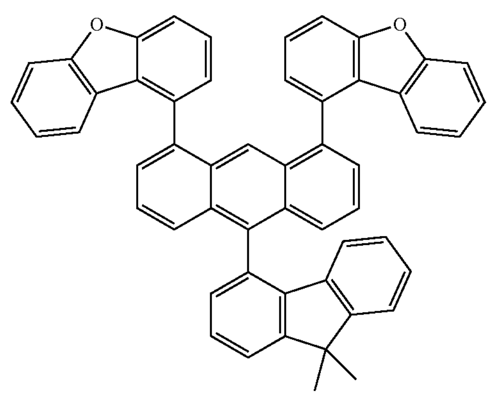

-continued
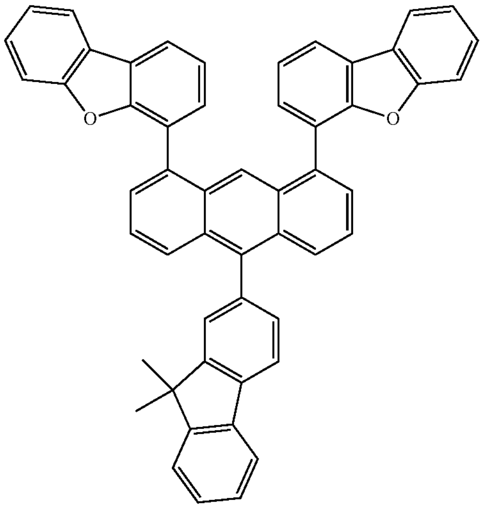
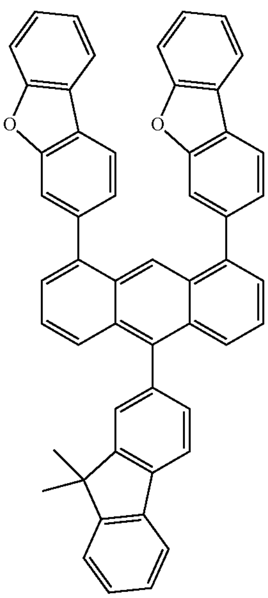
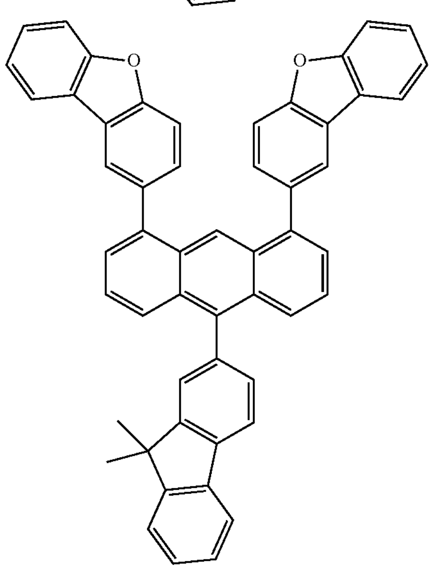
-continued
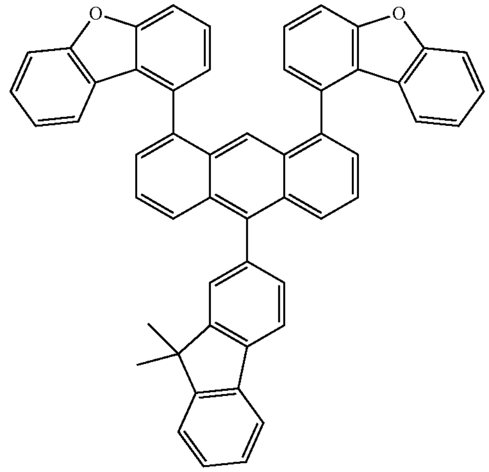
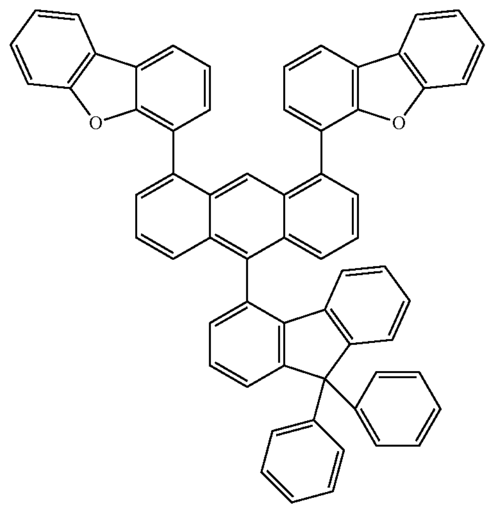
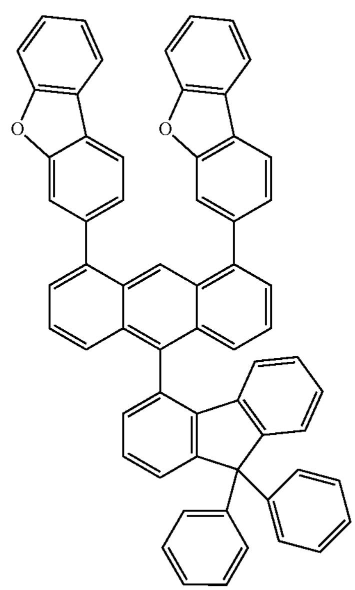

-continued
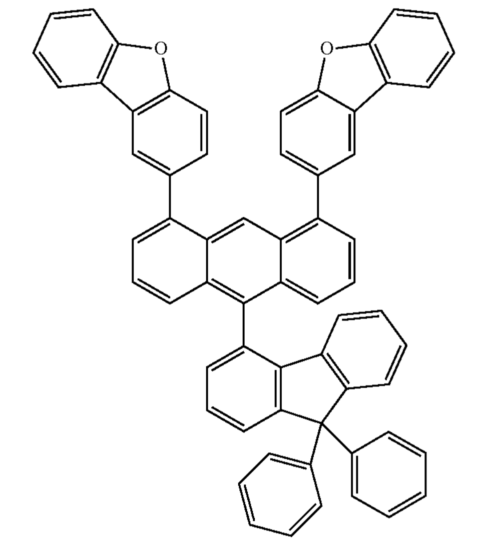
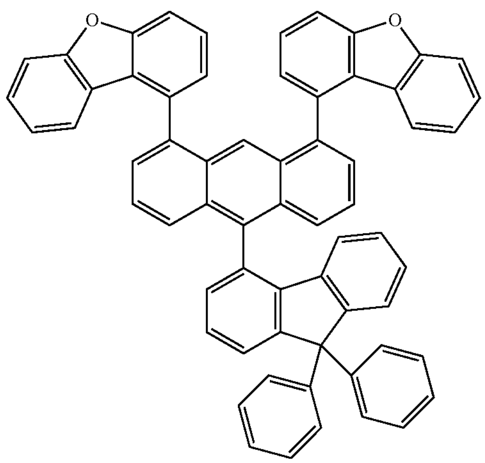
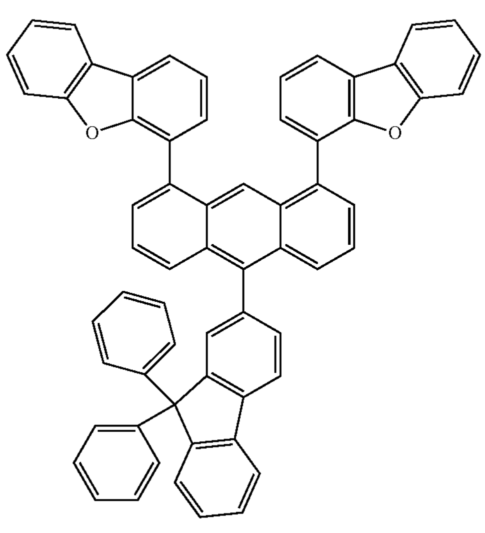
-continued
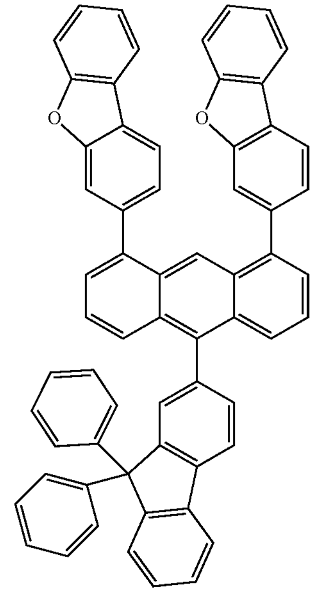
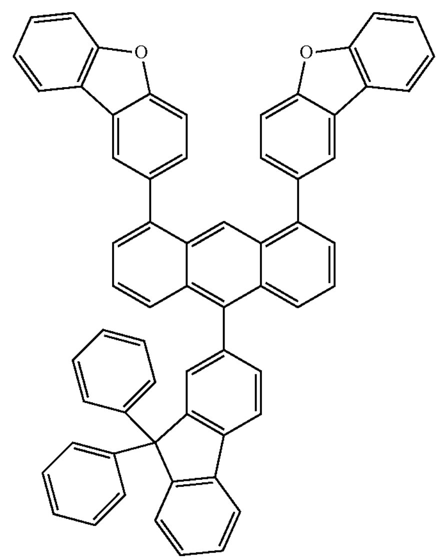
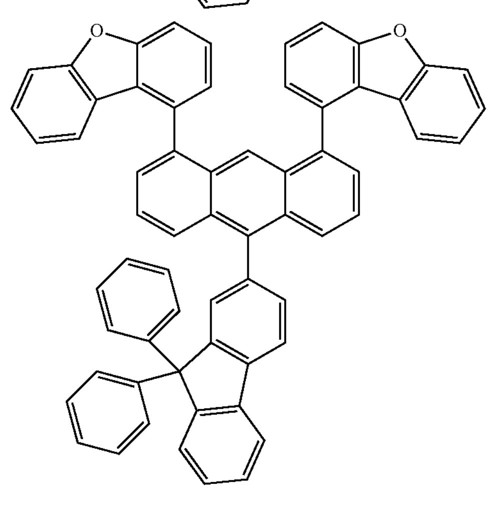

-continued
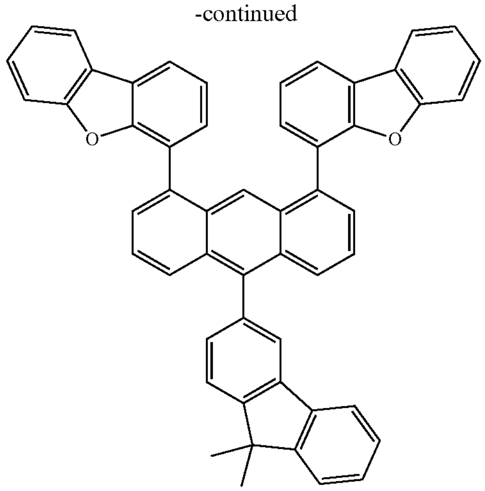
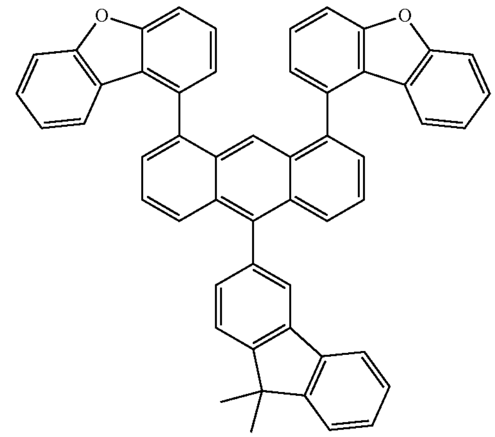
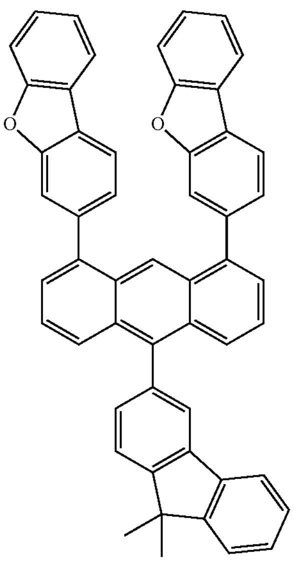
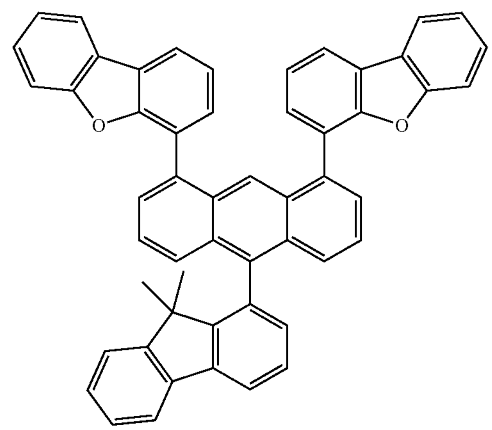
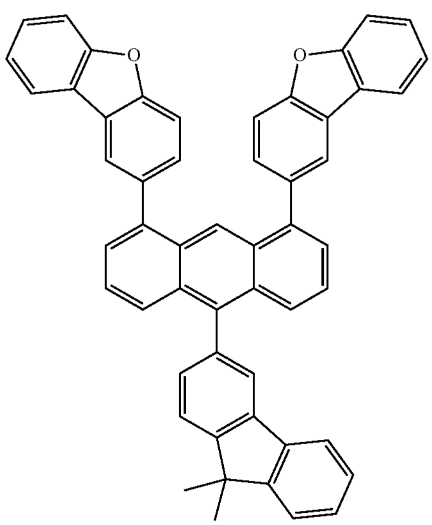
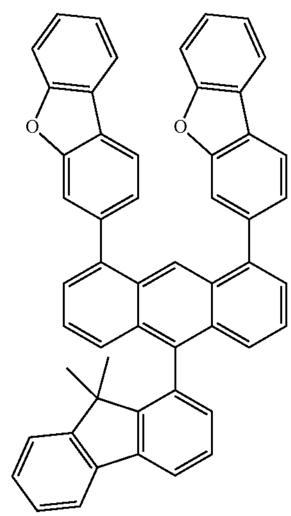
-continued -continued
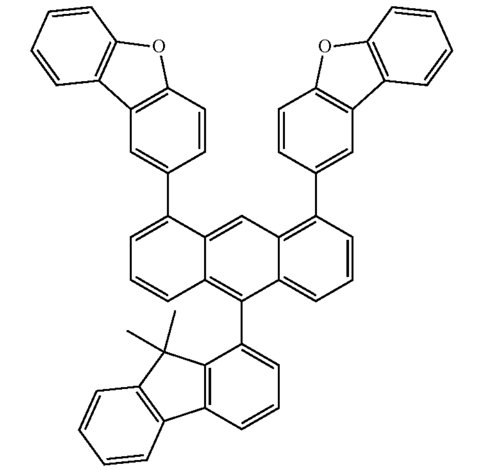
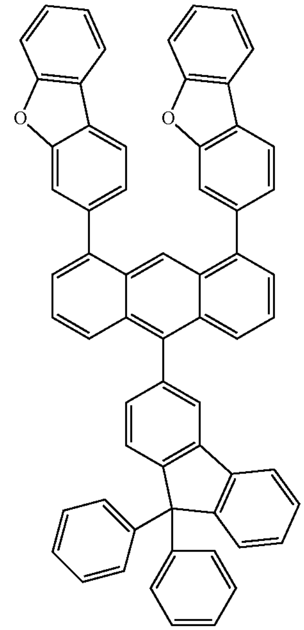
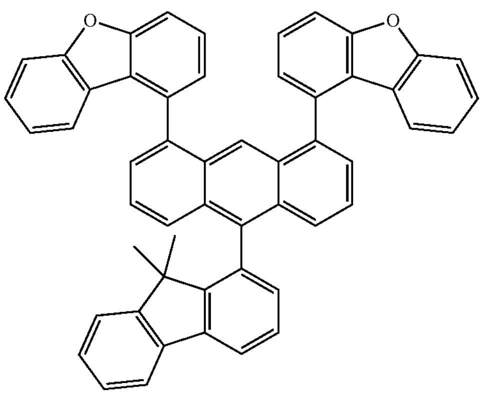
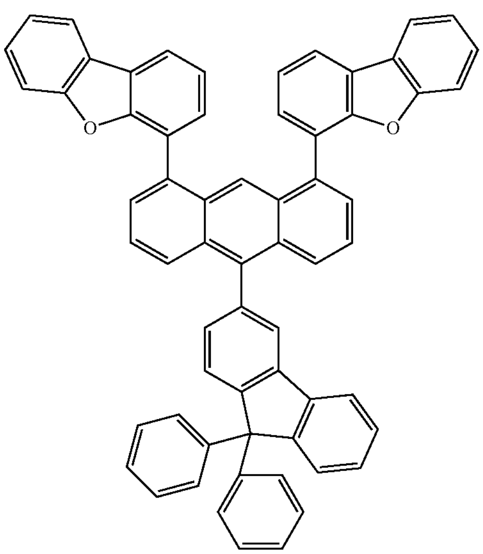
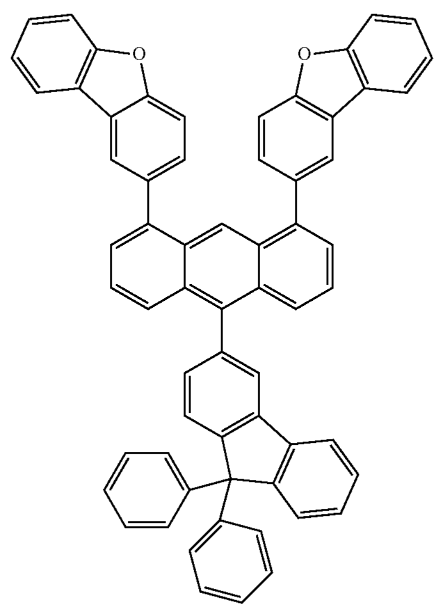
-continued -continued
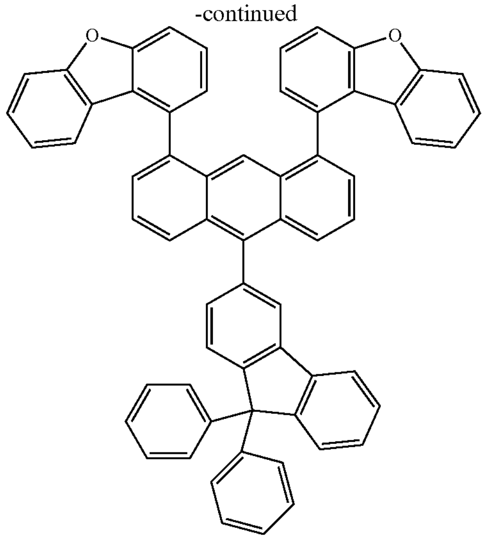
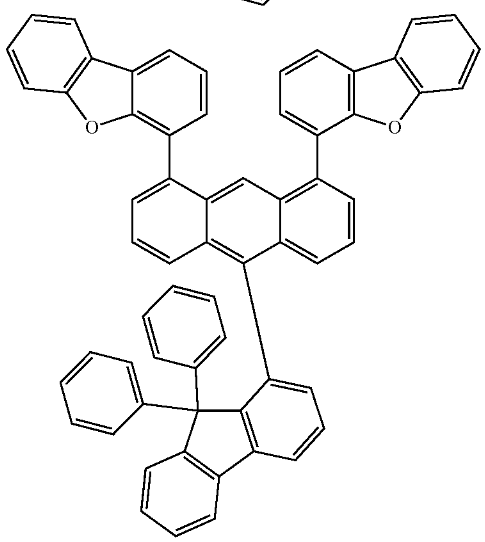
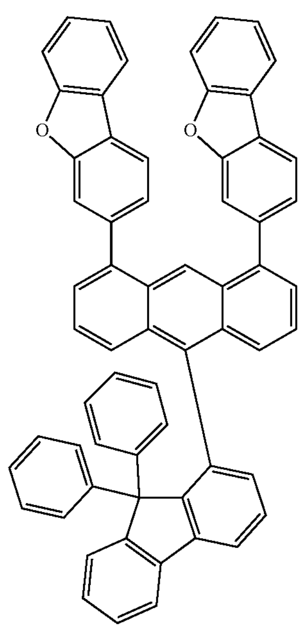
-continued
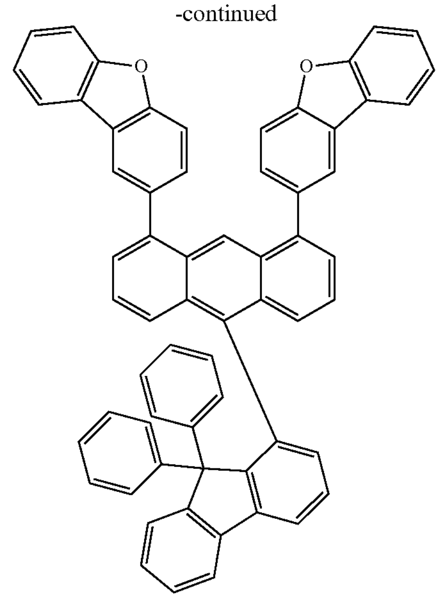
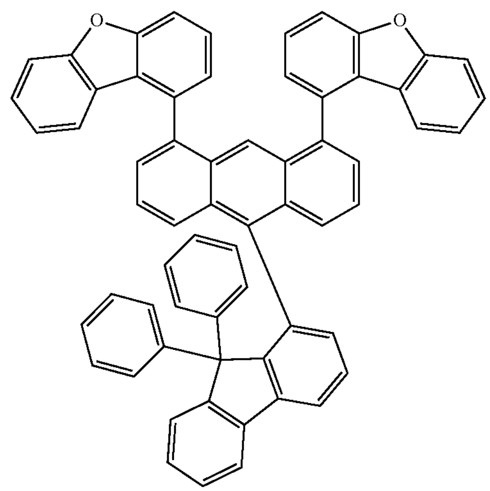
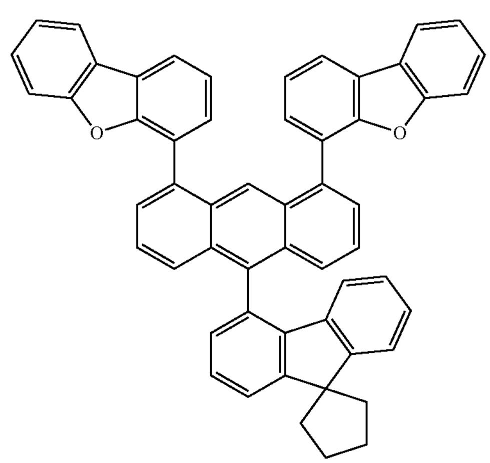

-continued
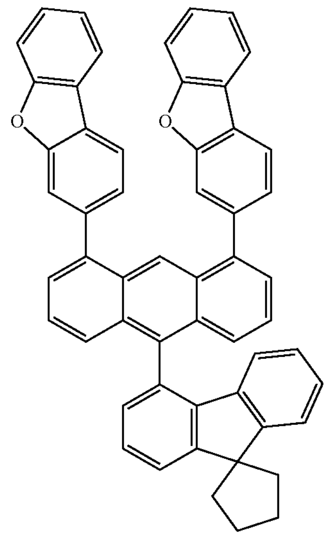
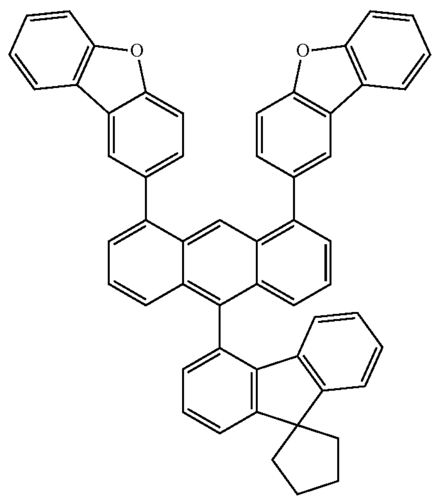
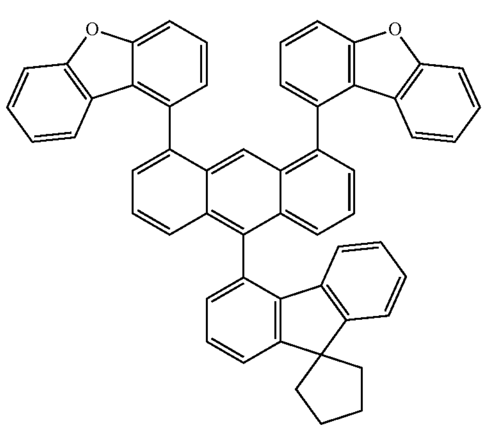
-continued
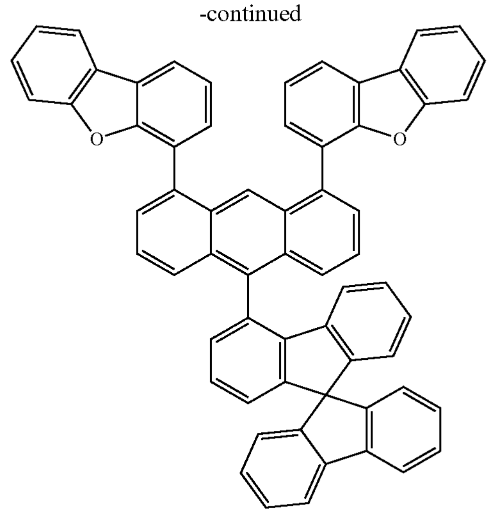
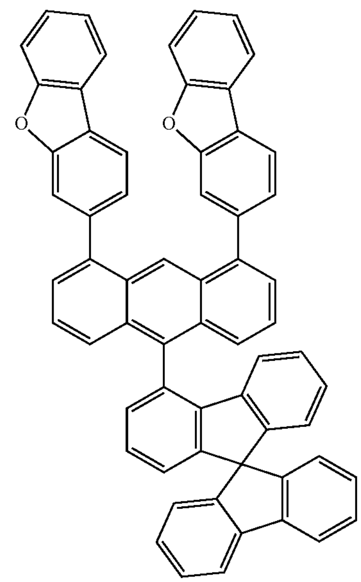
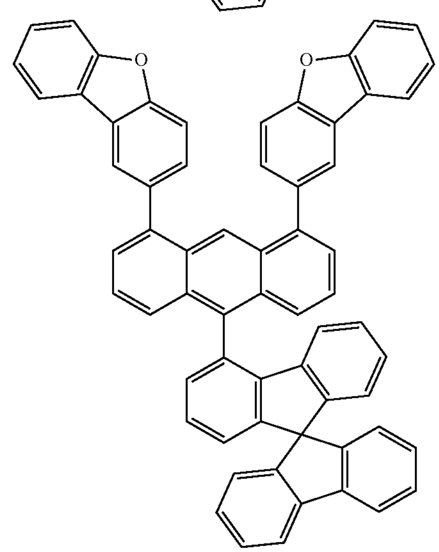

-continued
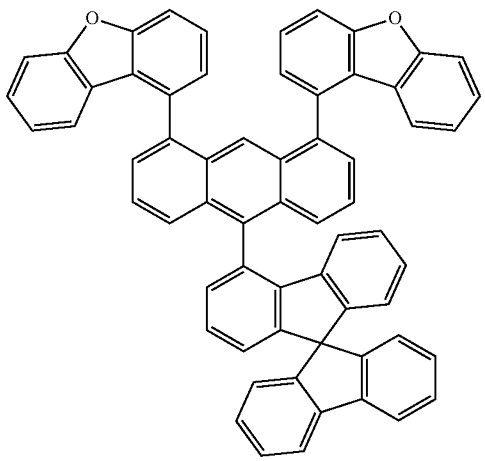
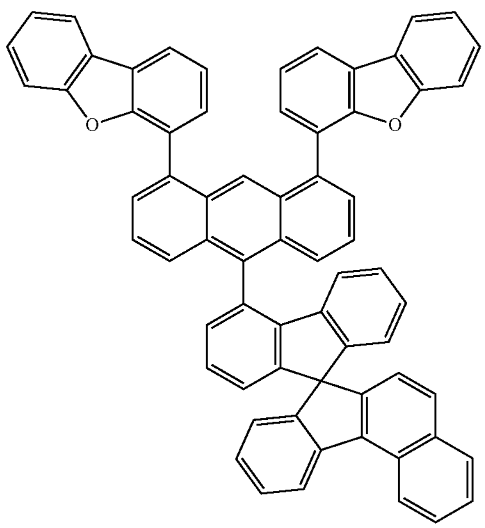
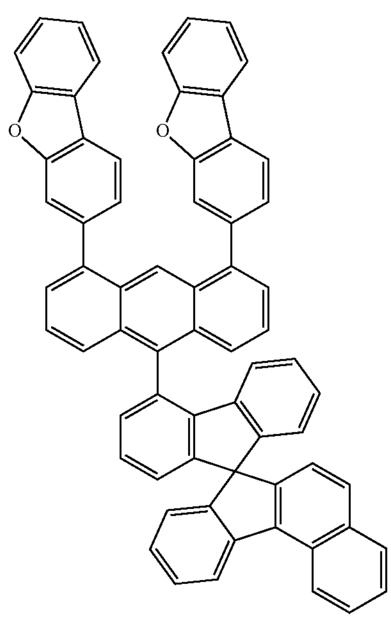
-continued
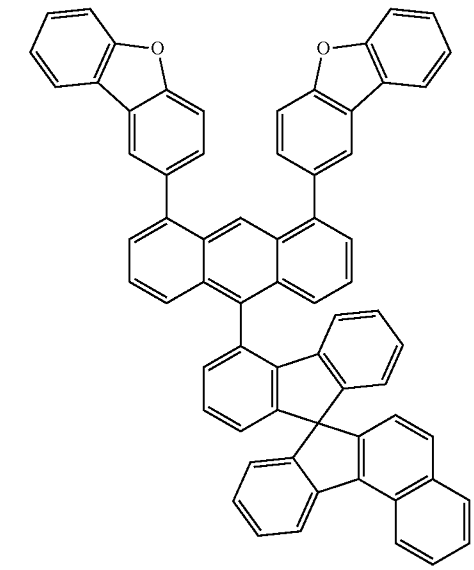
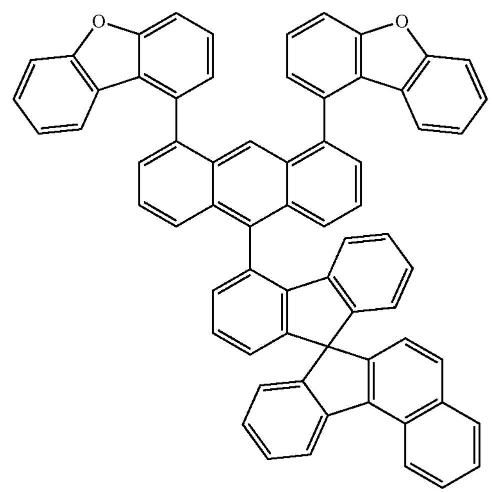
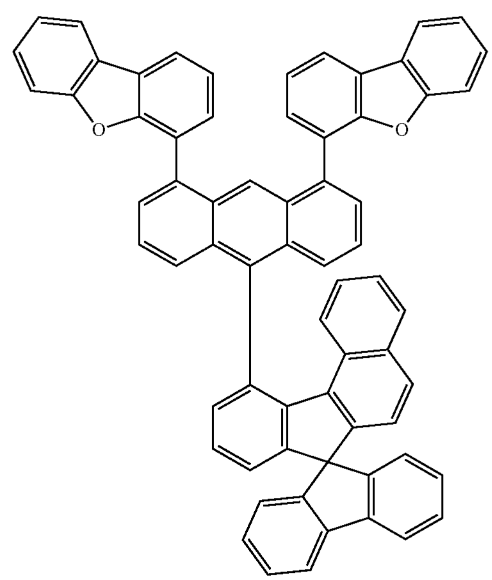

-continued
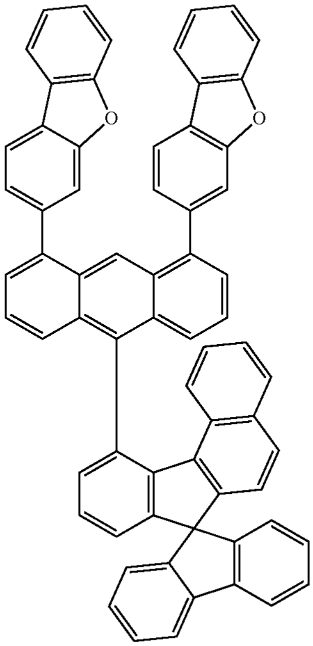
-continued
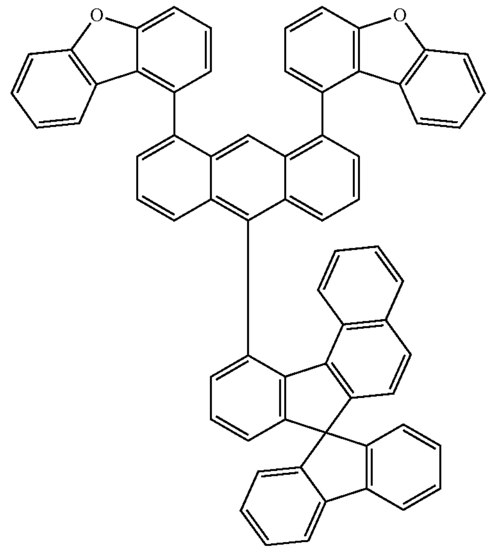
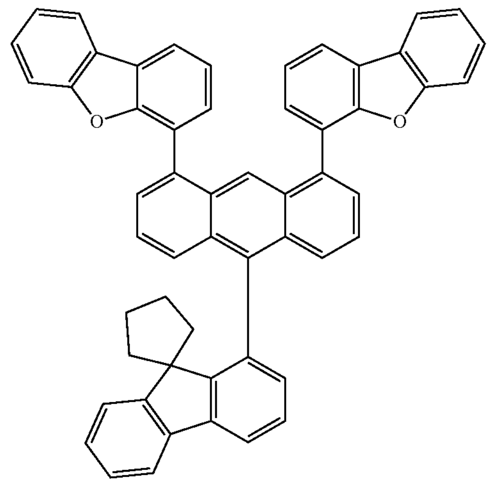
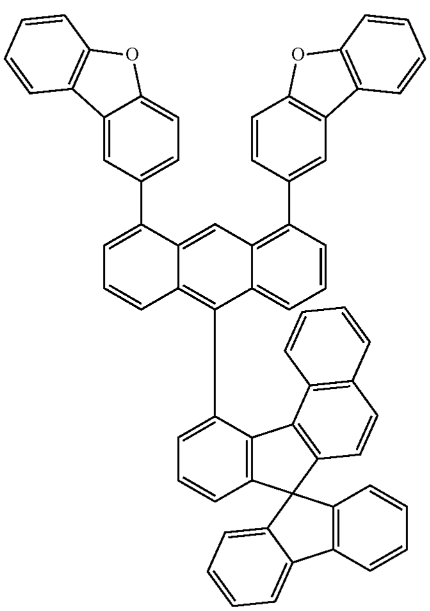
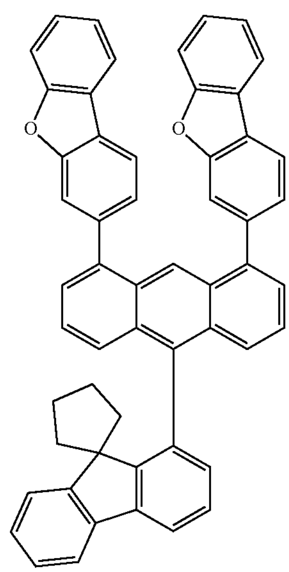

-continued
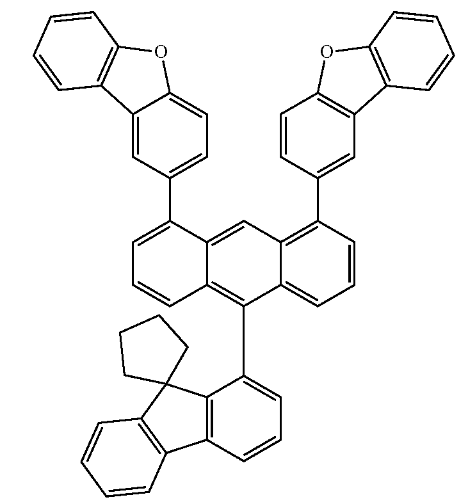
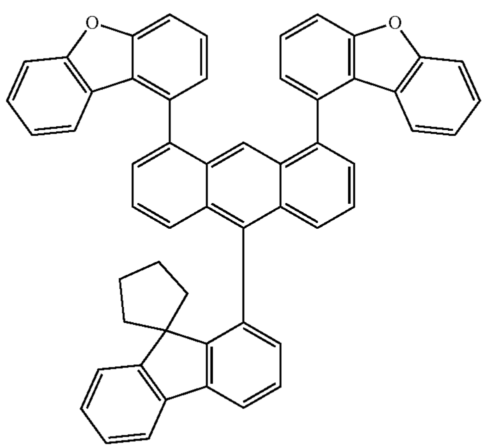
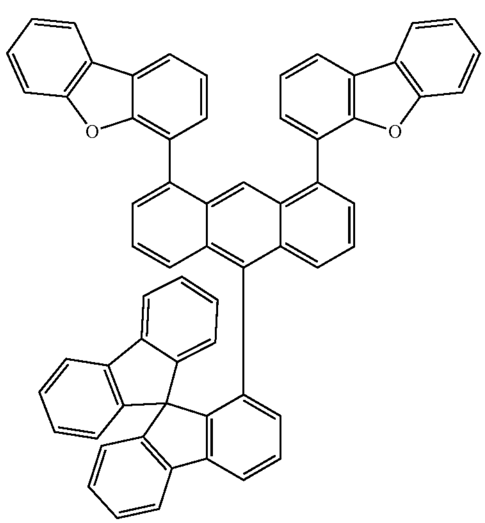
-continued
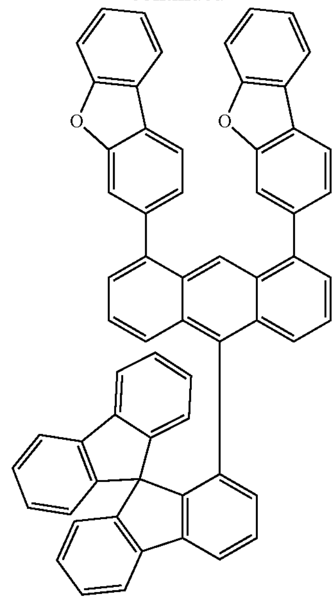
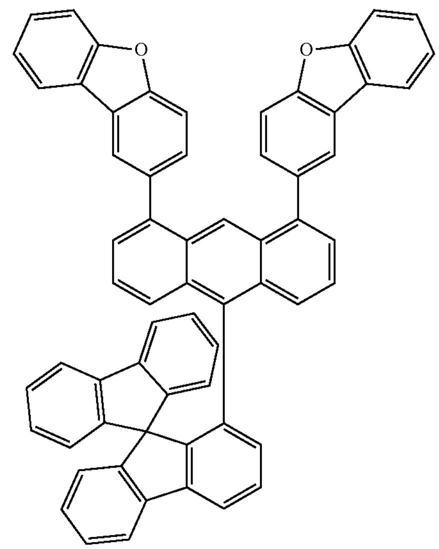
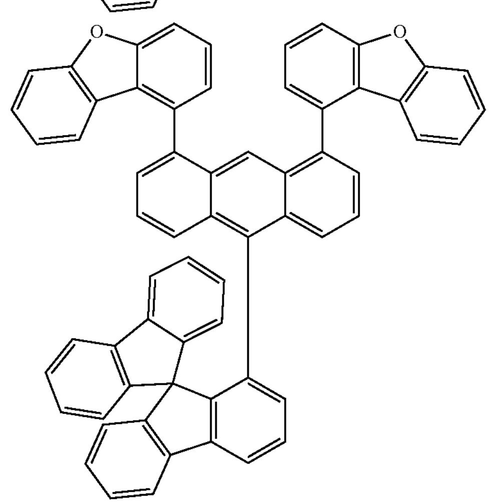

-continued
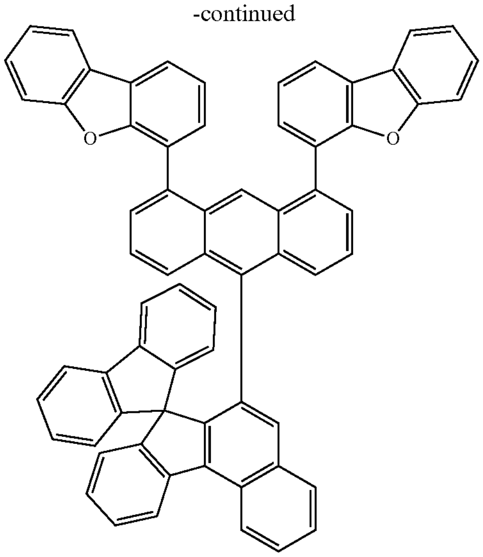
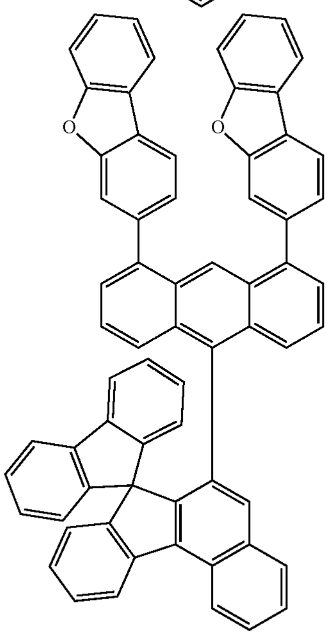
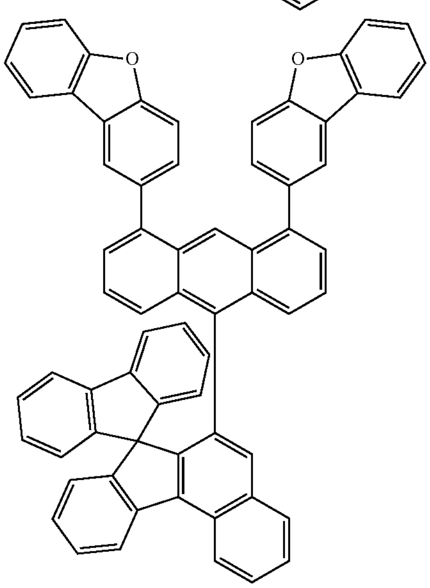
-continued
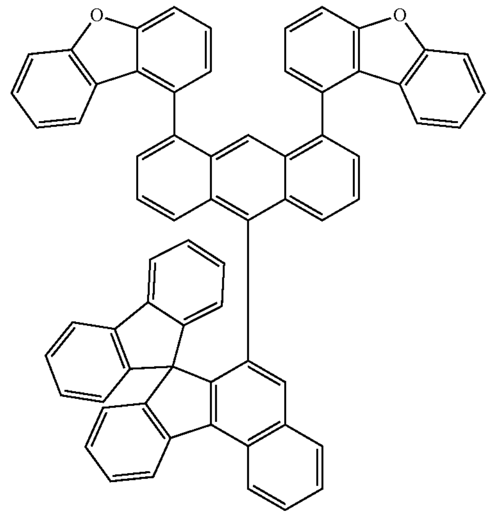
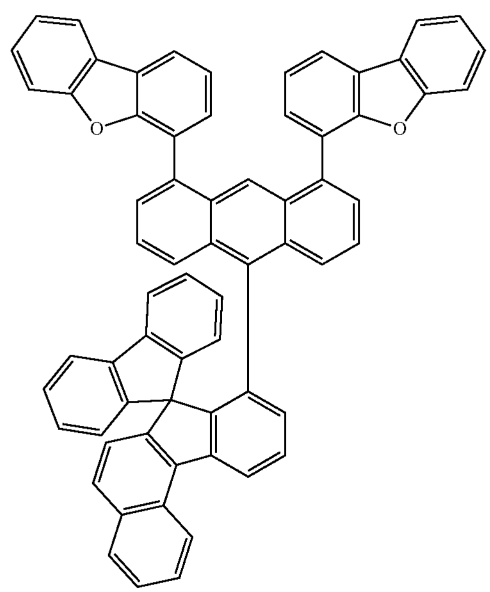

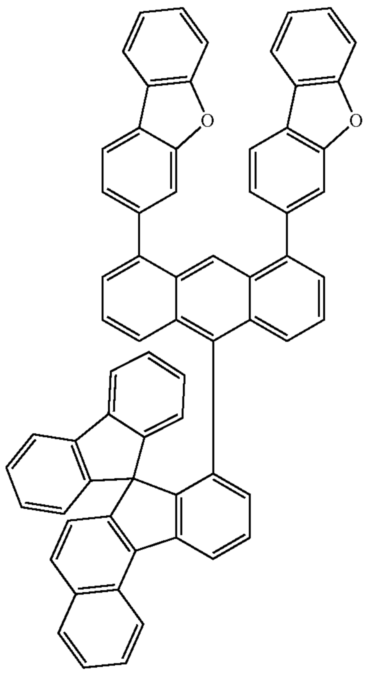
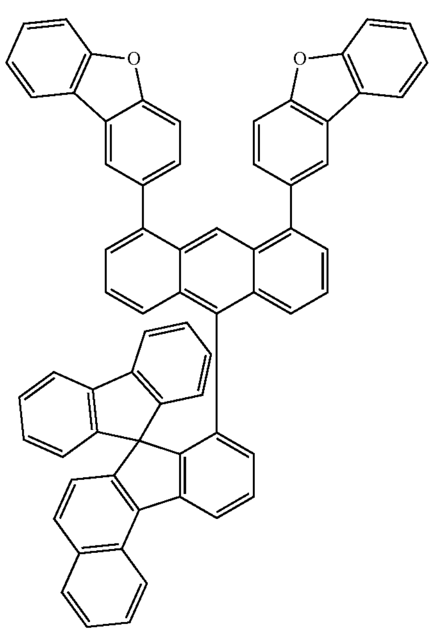
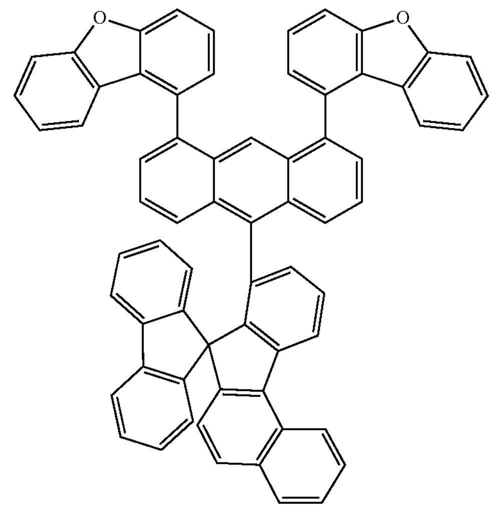
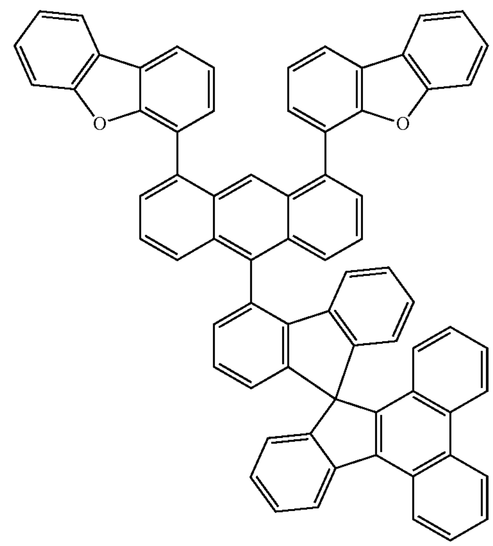
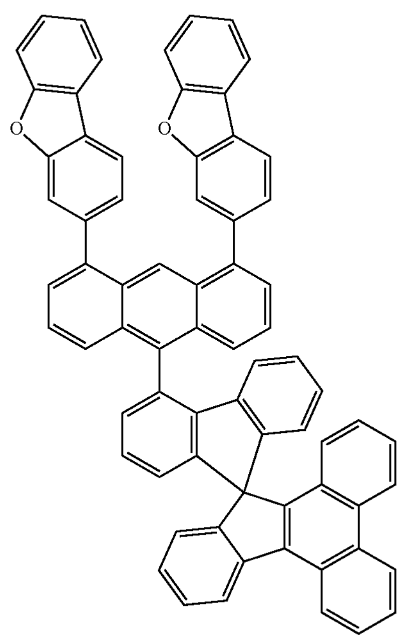

-continued
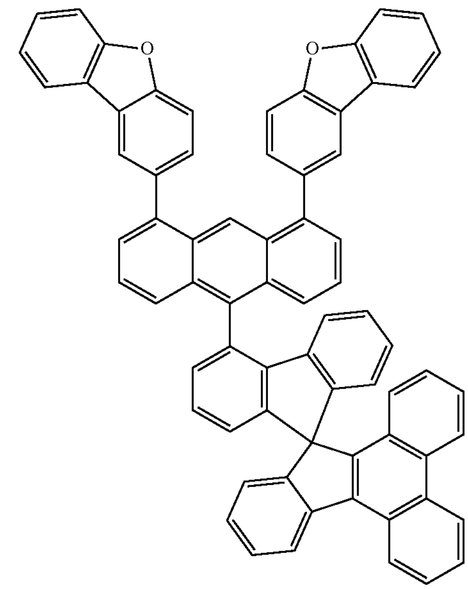
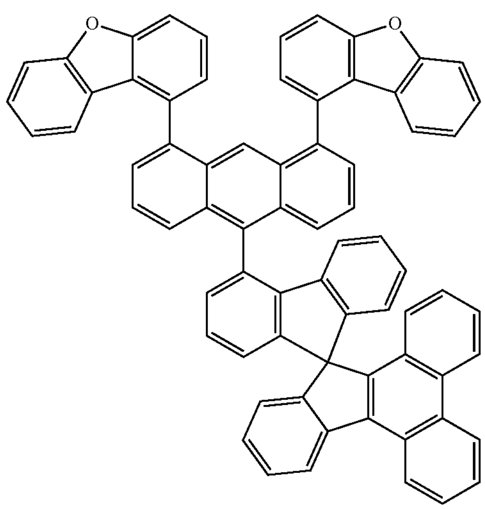
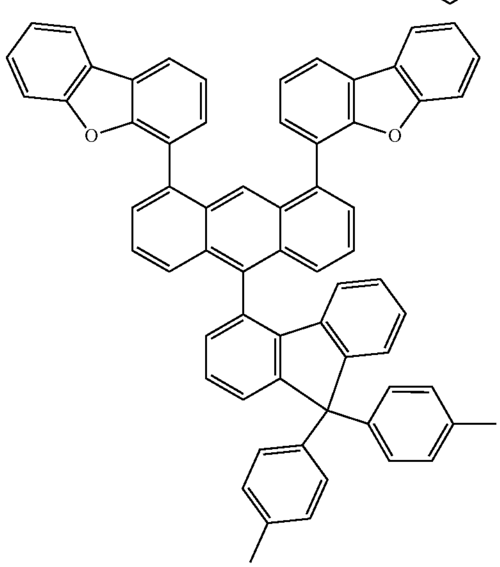
-continued
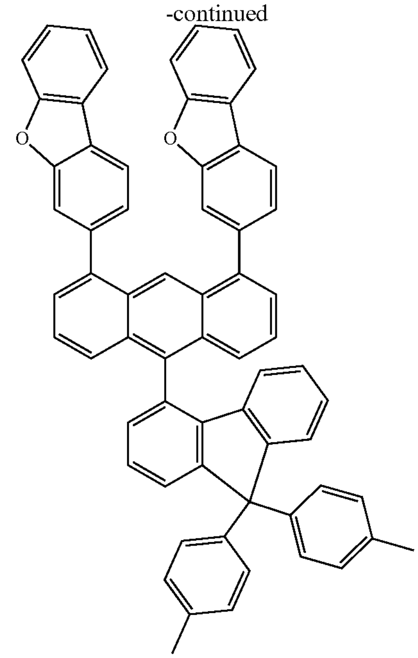
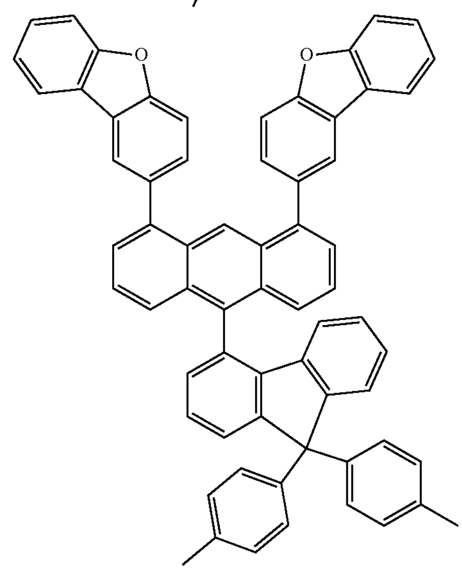
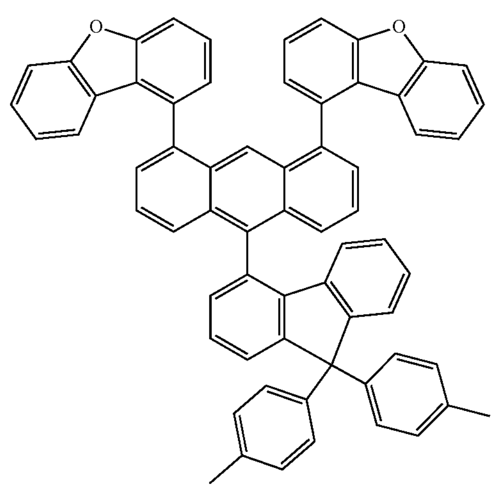

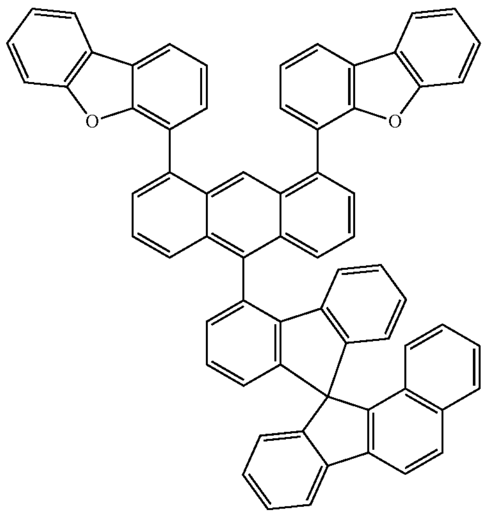
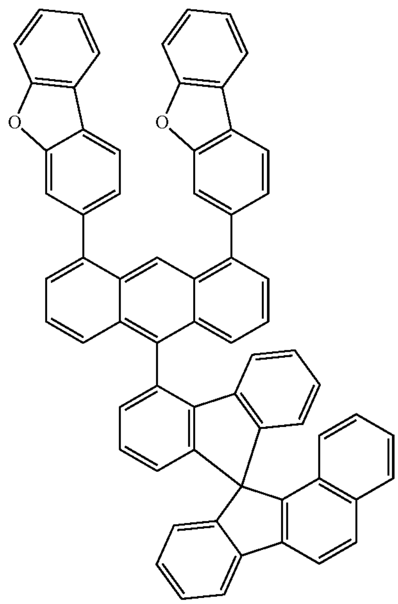
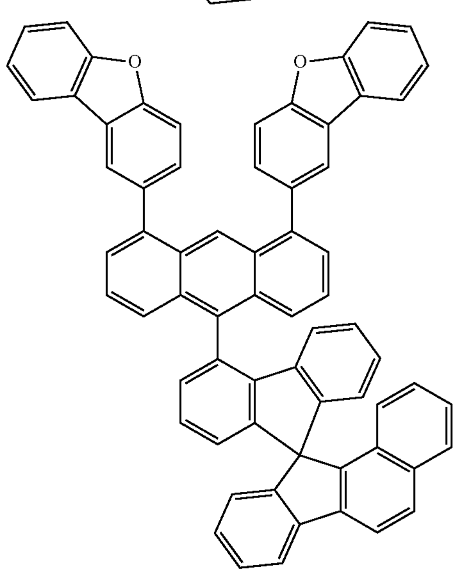
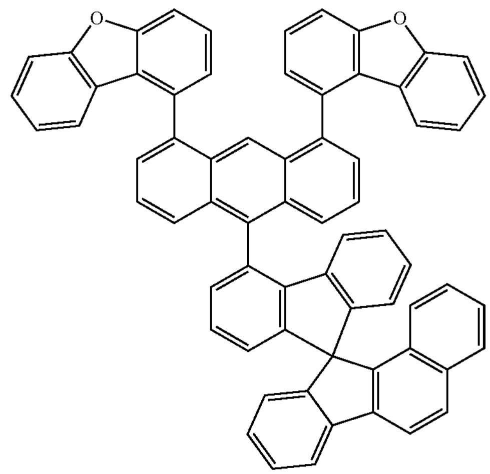
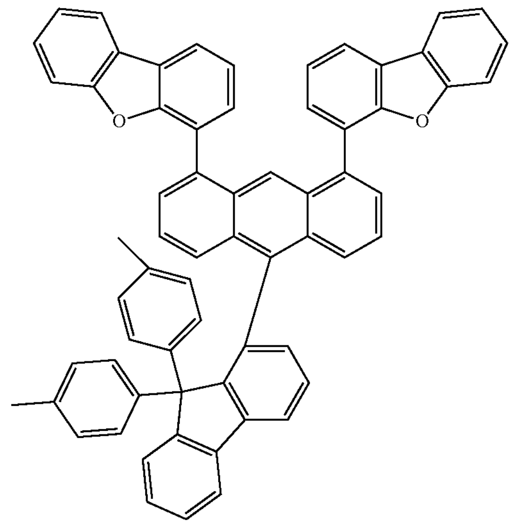
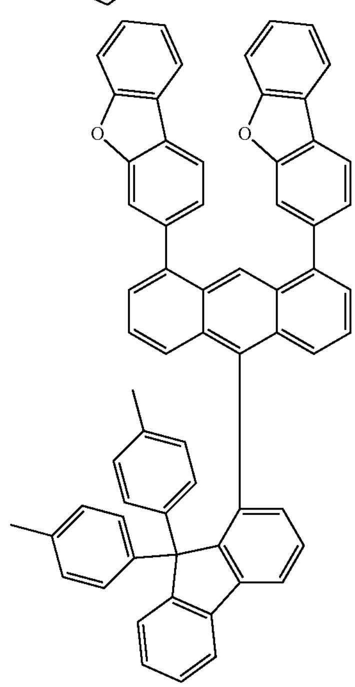

-continued
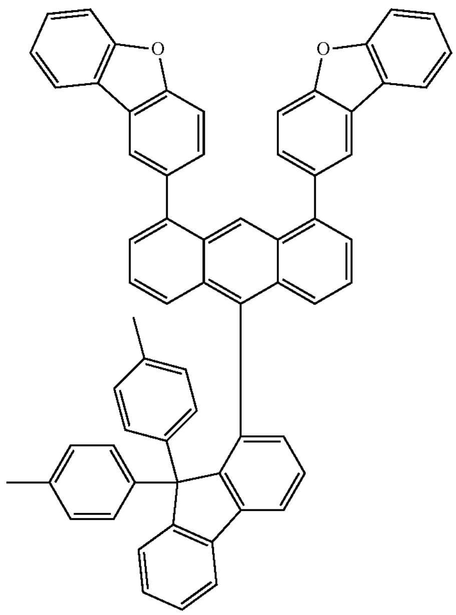
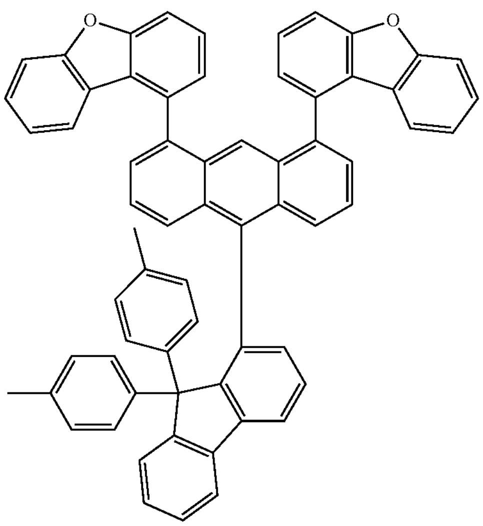
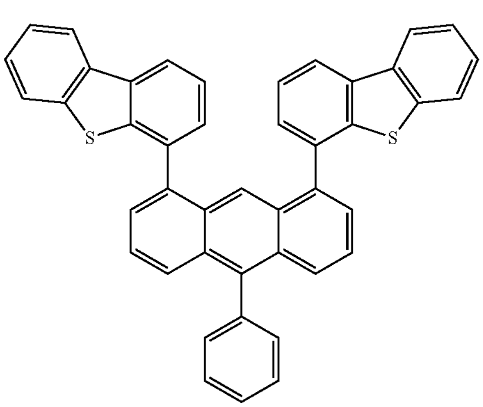
-continued
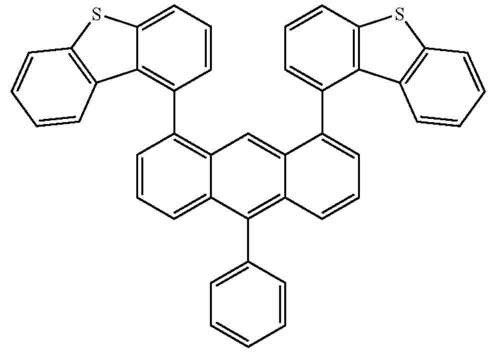
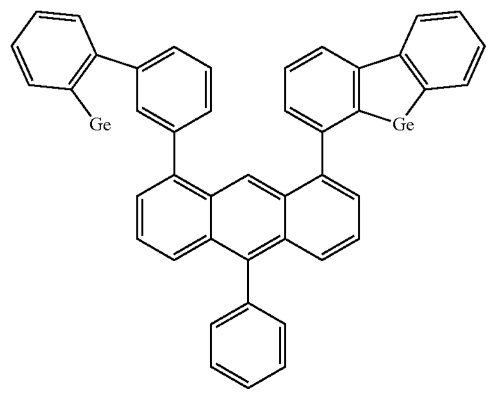
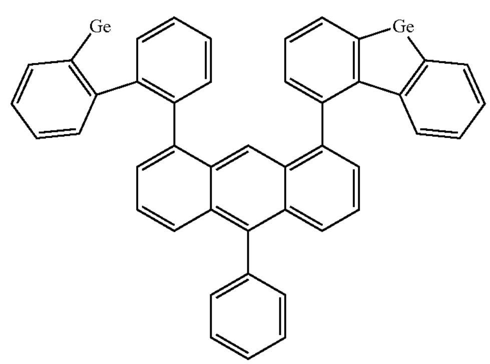
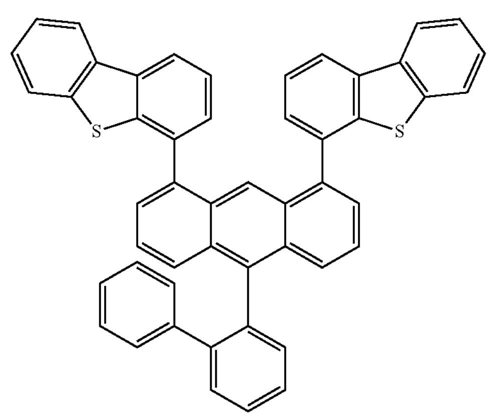

-continued
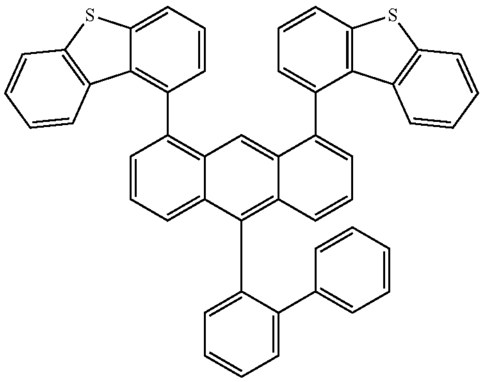
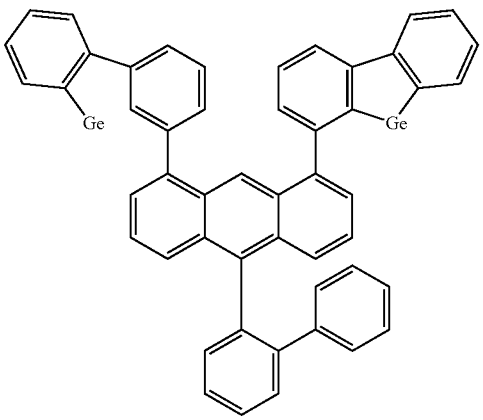
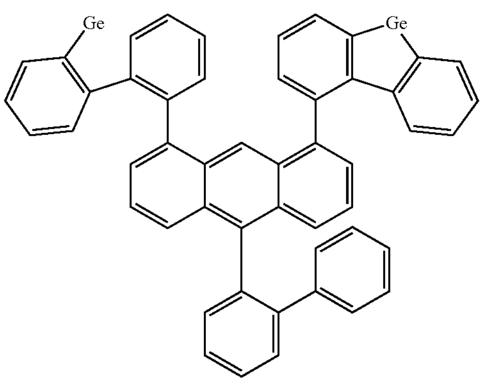
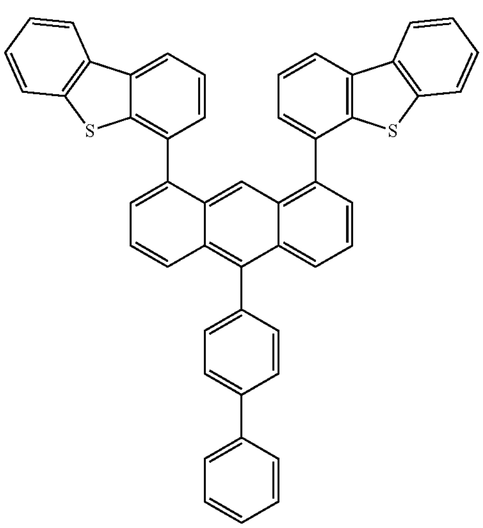
-continued
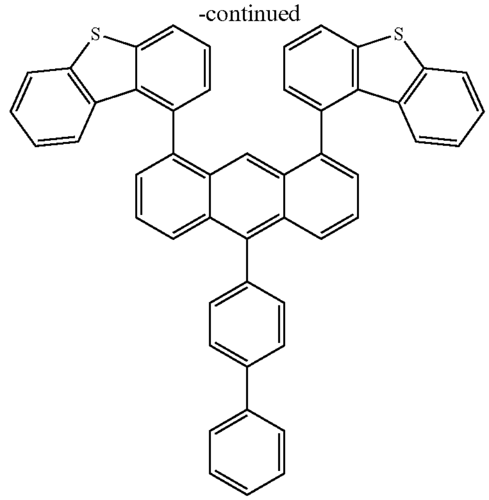
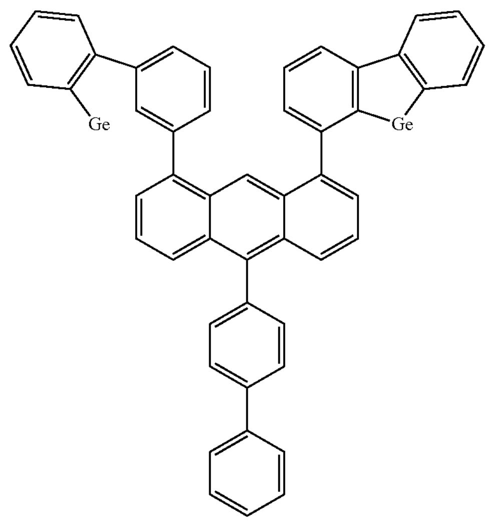
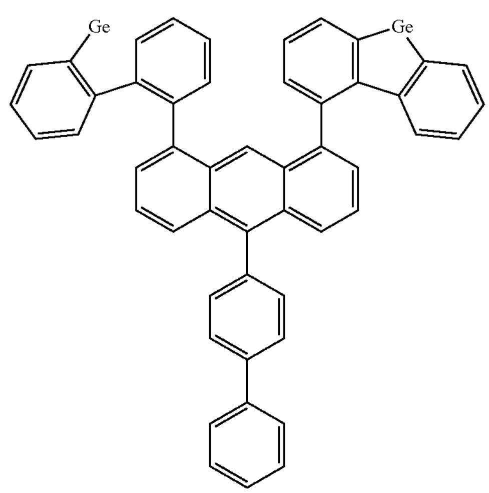

-continued
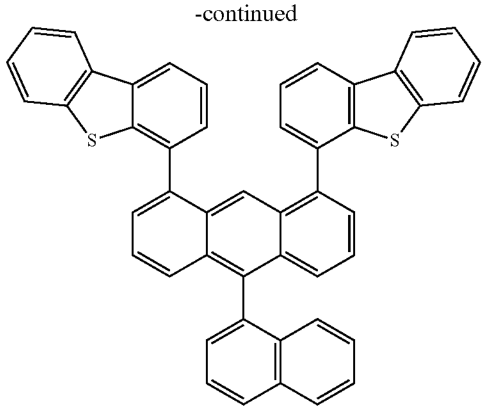
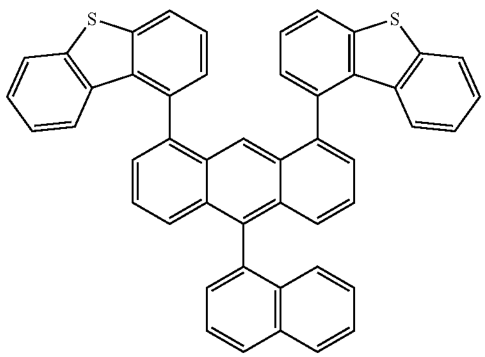
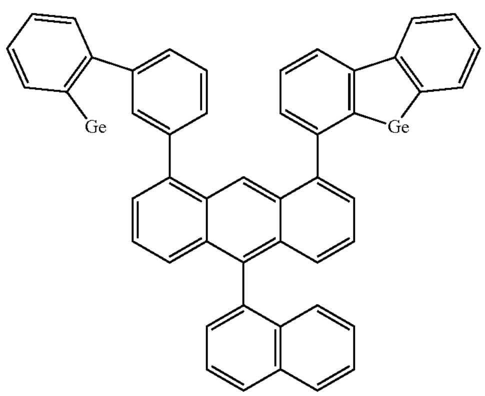
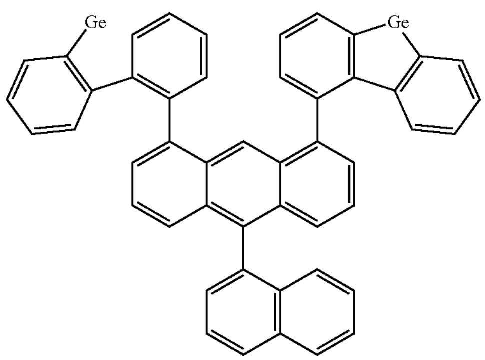
-continued
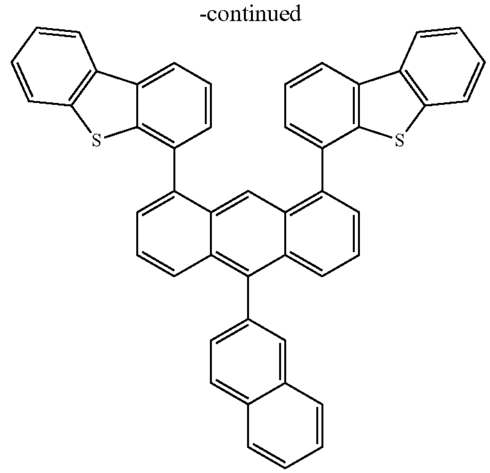
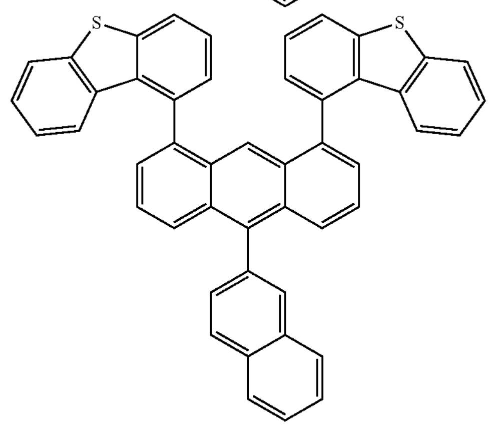
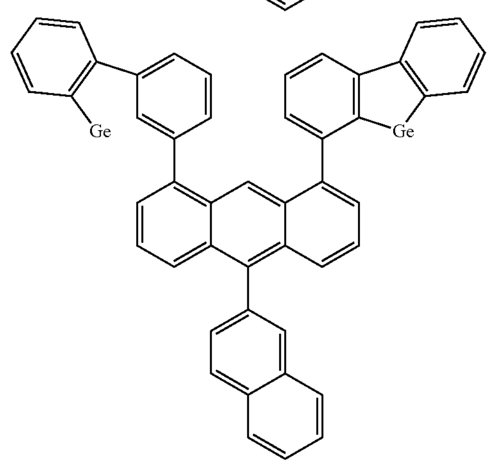
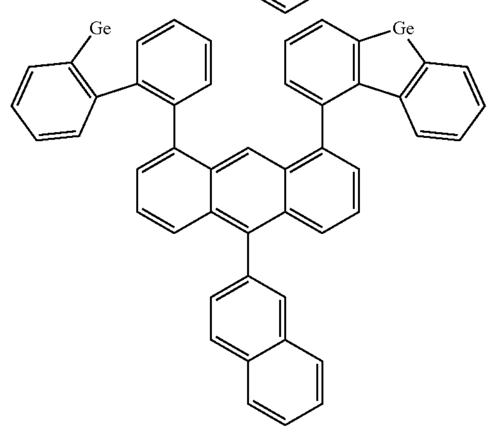

-continued
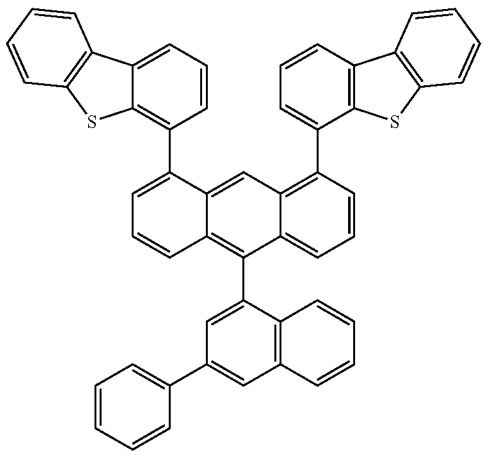
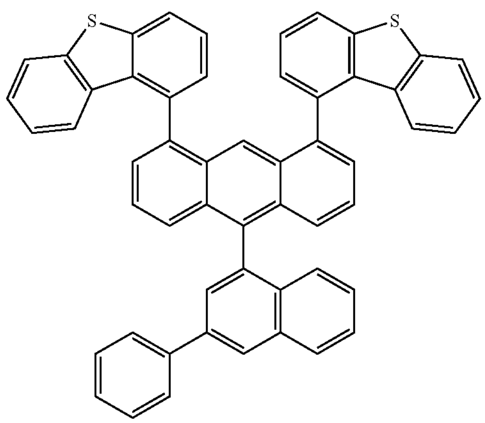
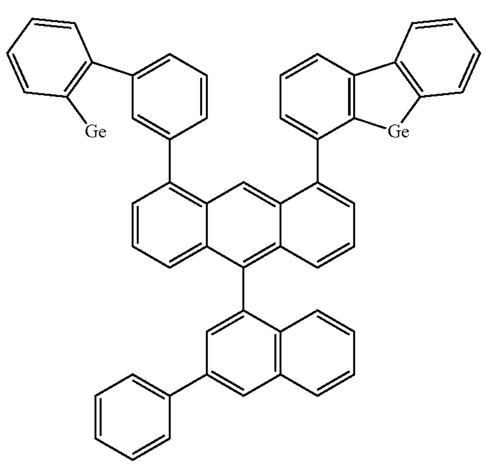
-continued
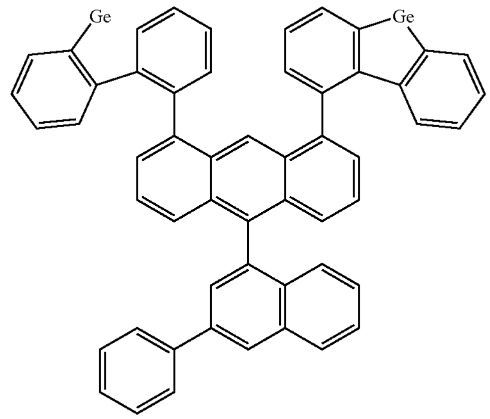
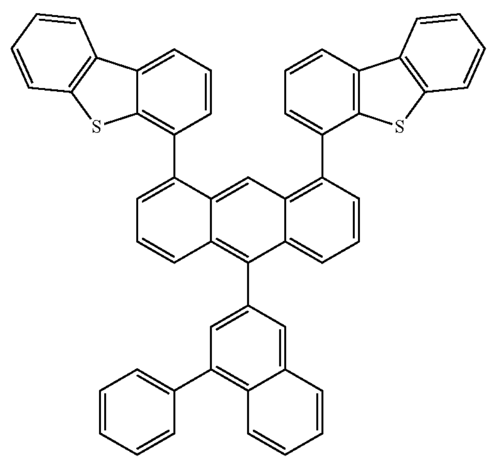
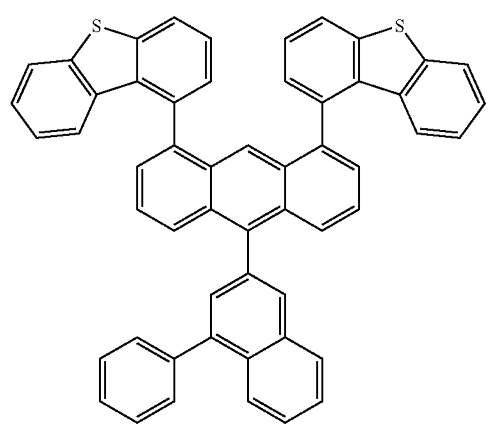

-continued
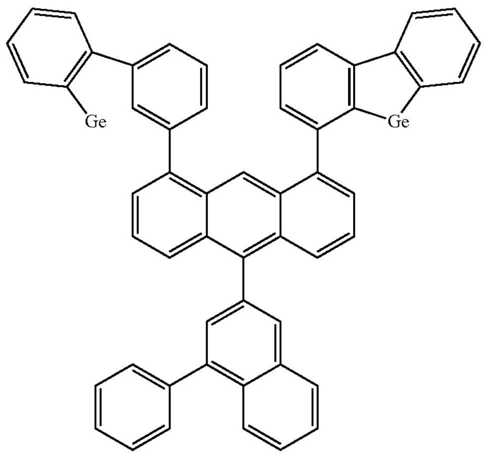
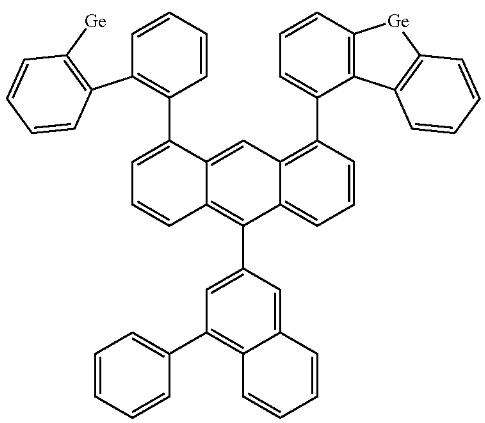
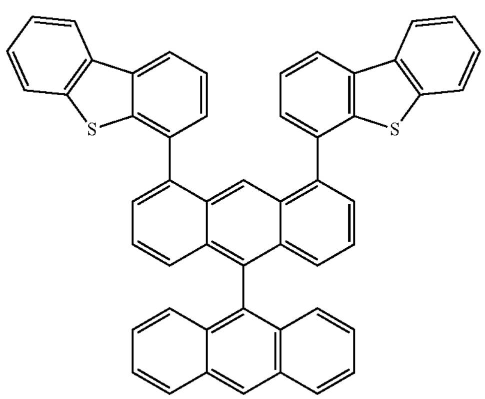
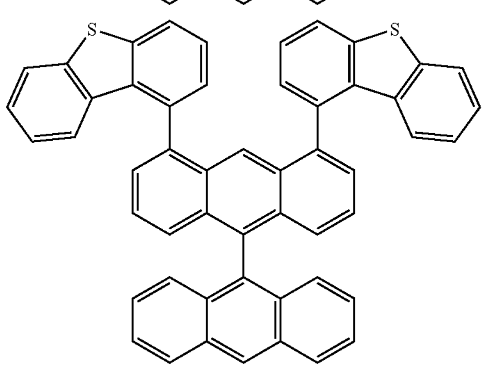
-continued
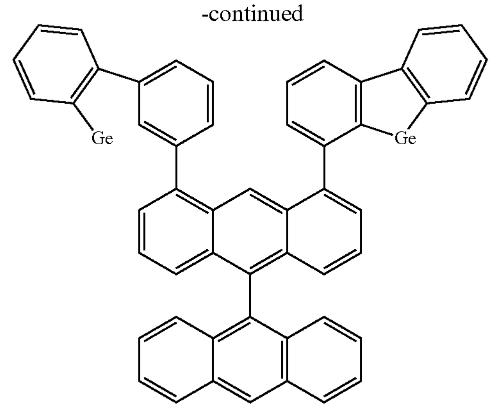
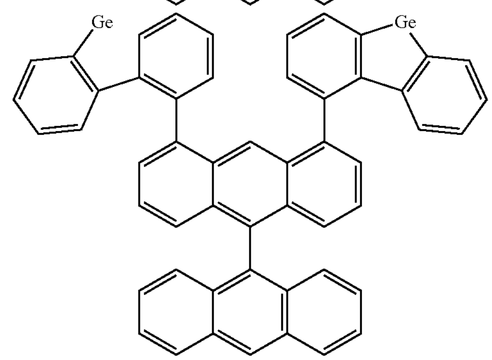
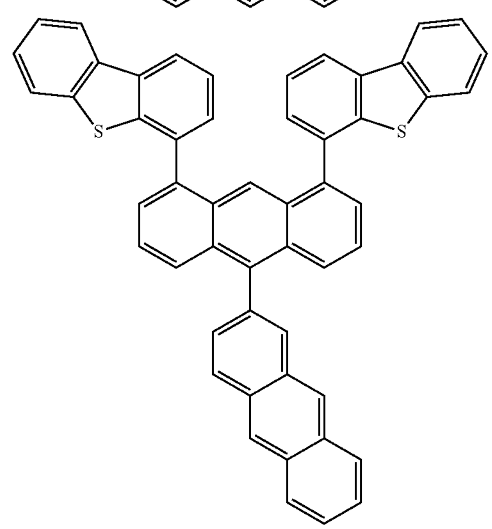
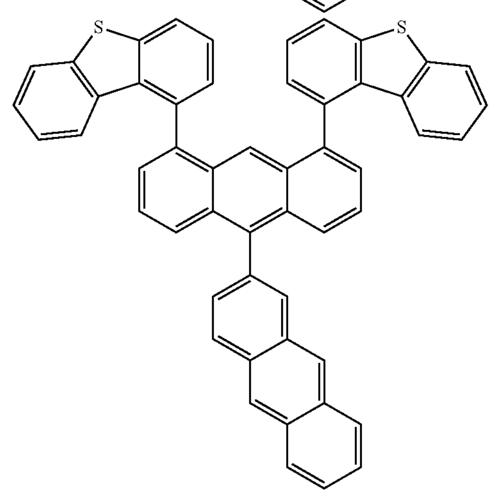

-continued
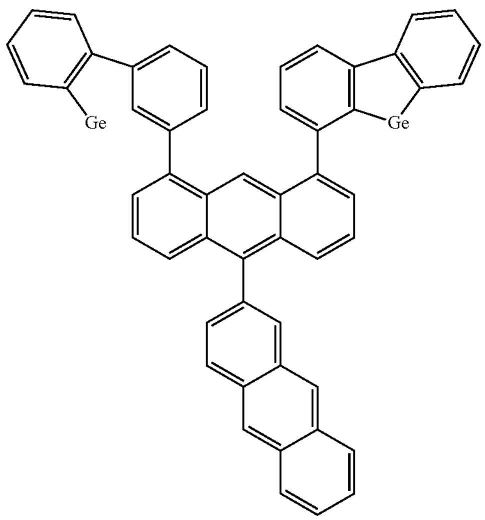
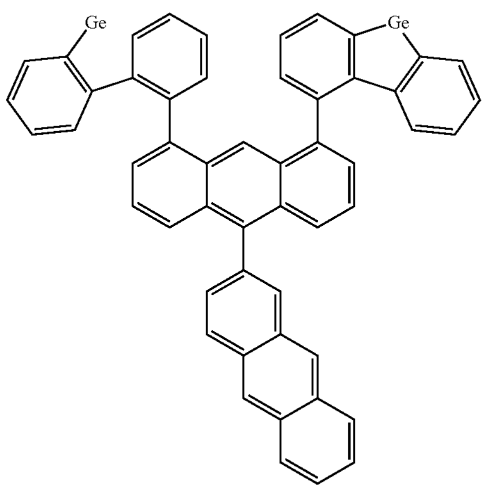
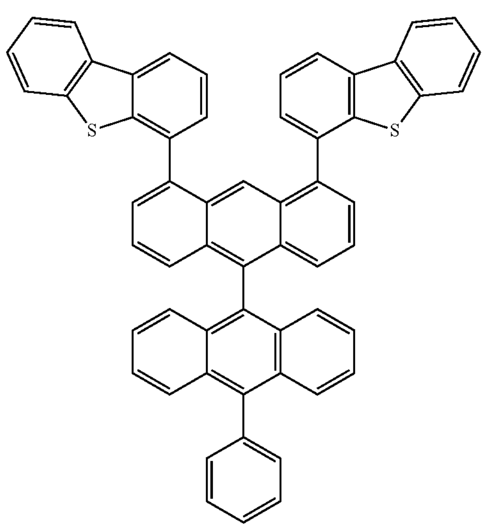
-continued
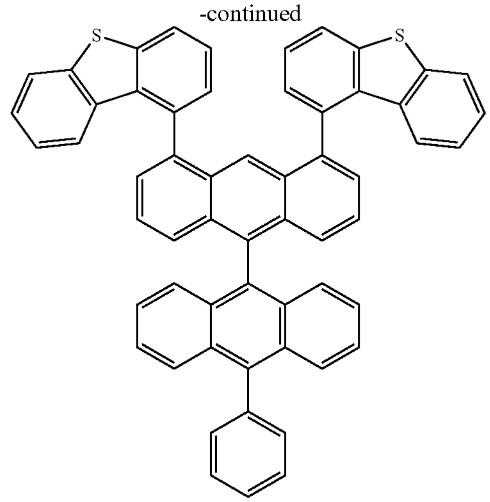
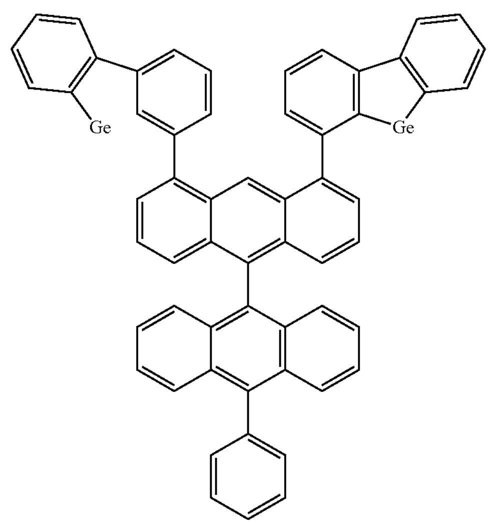
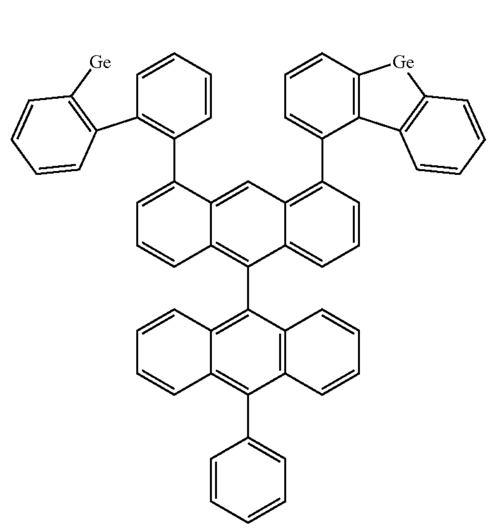

-continued
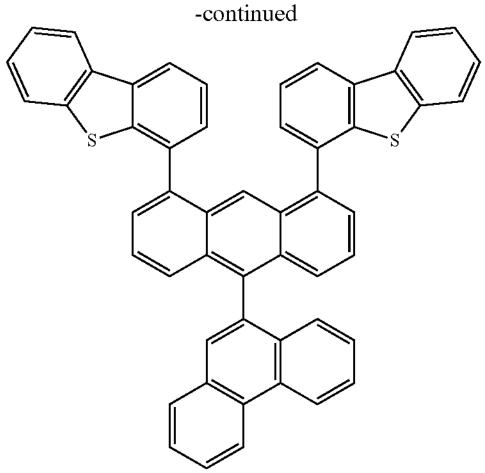
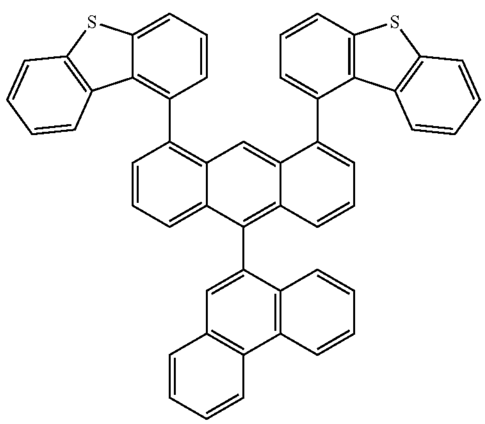
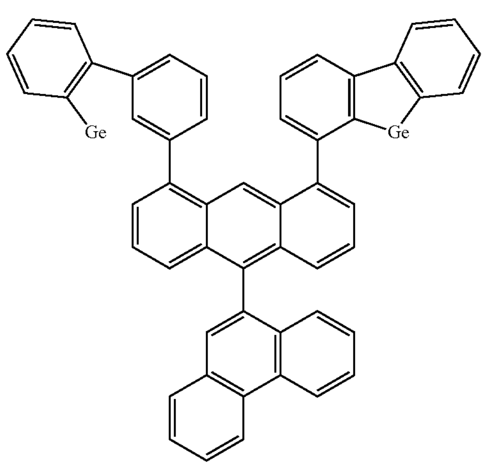
-continued
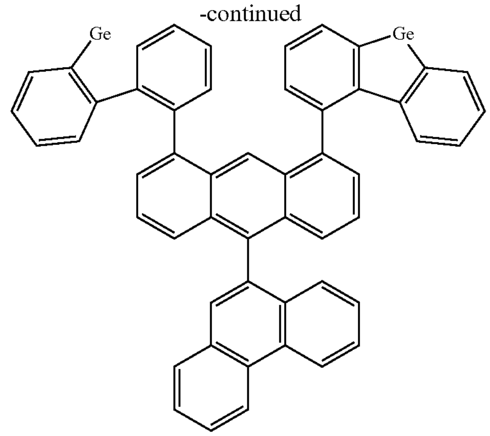
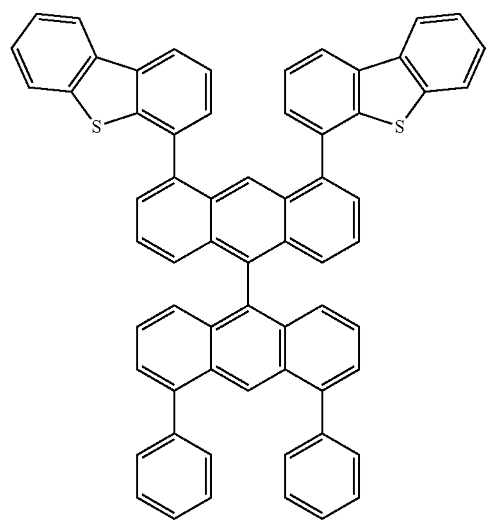
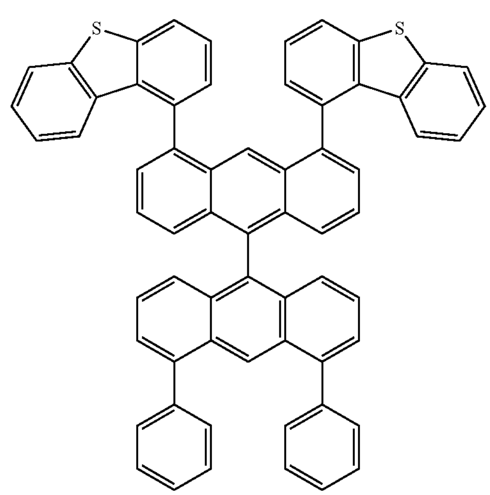

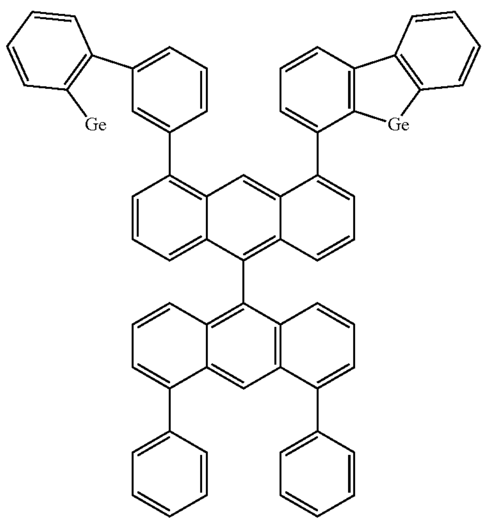
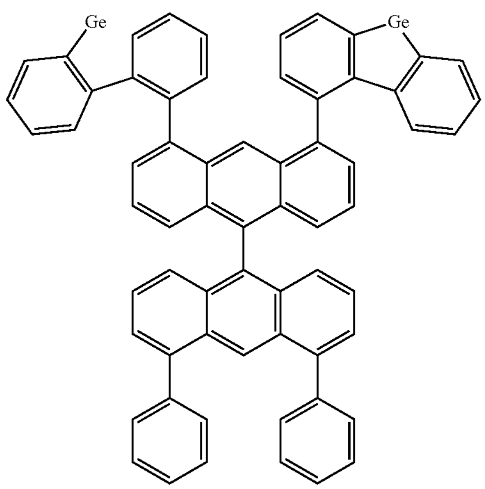
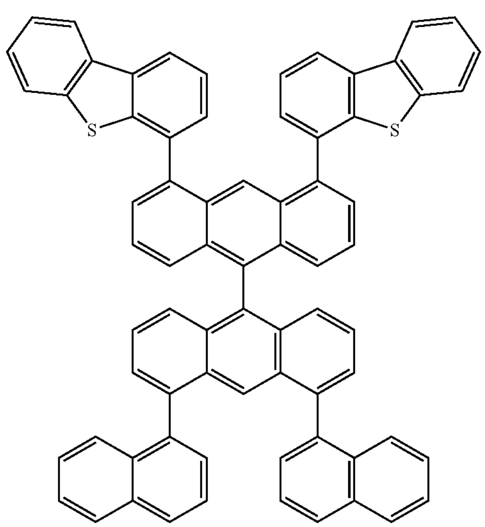
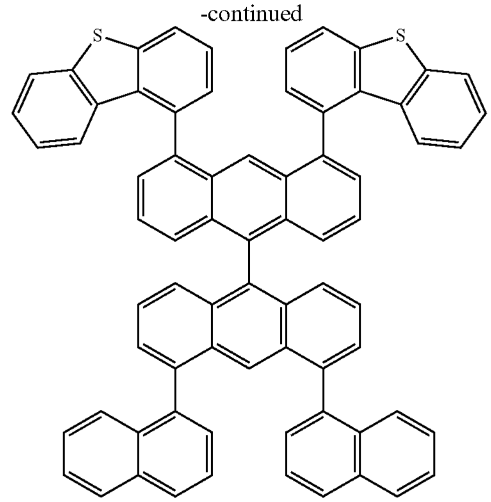
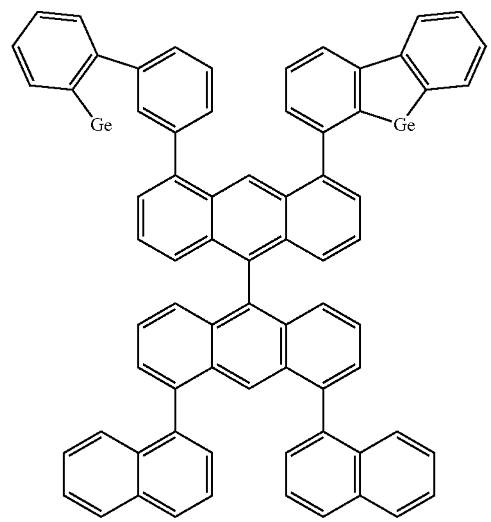
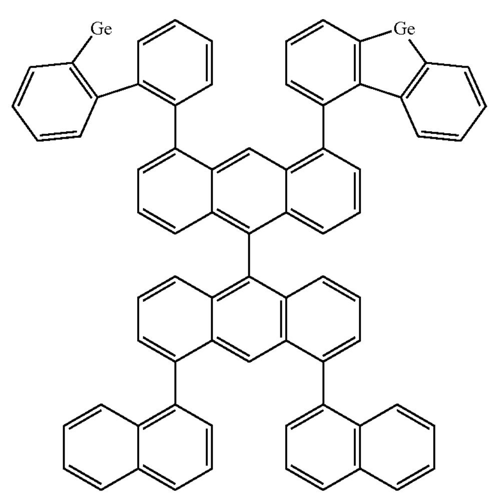

-continued
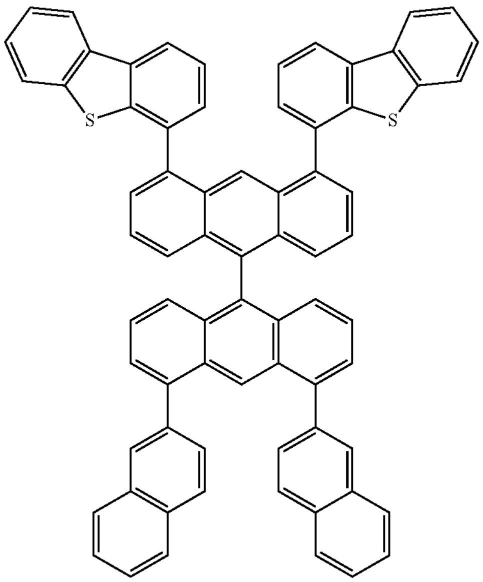
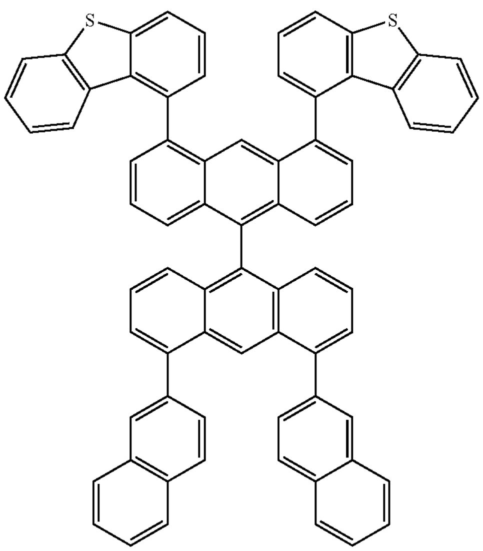
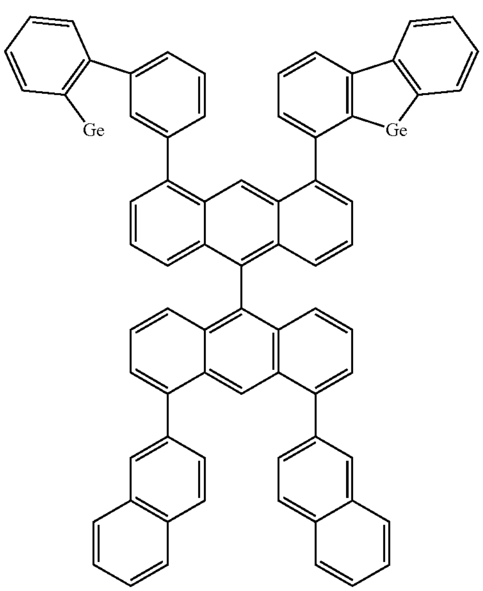
-continued
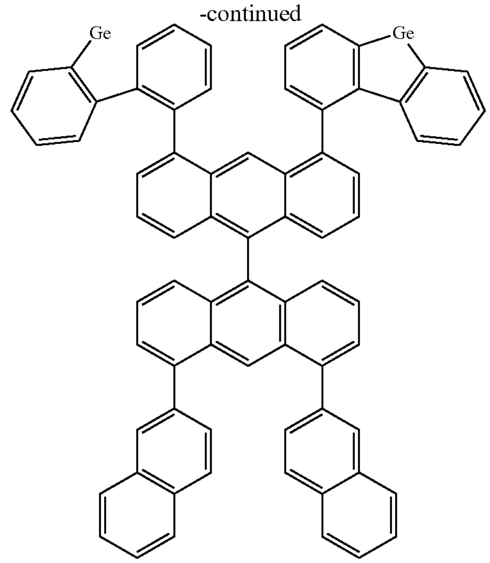
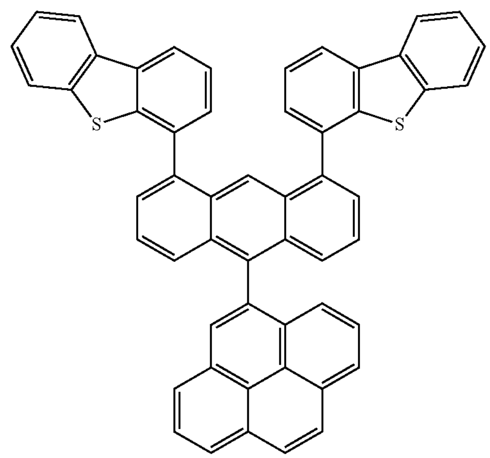
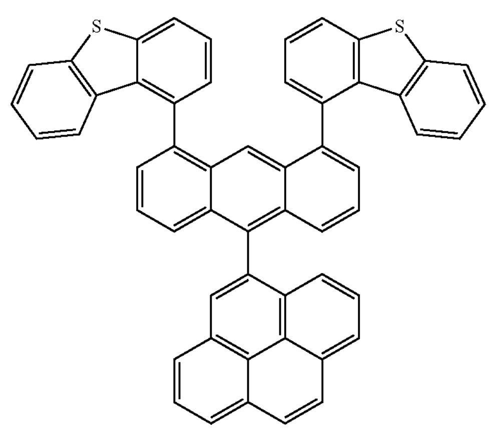

-continued
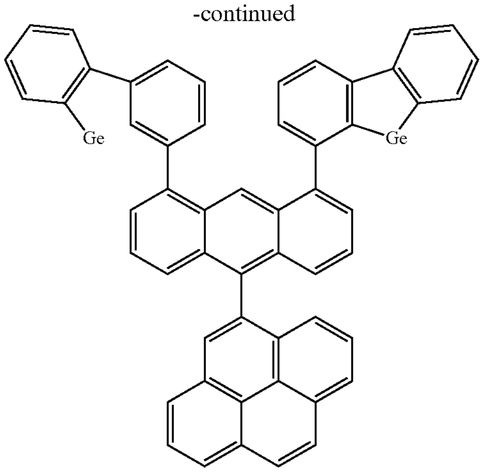
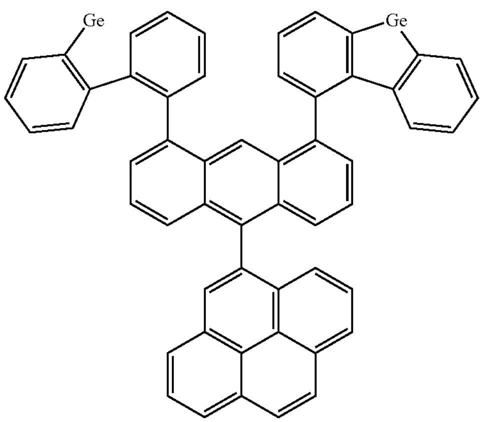
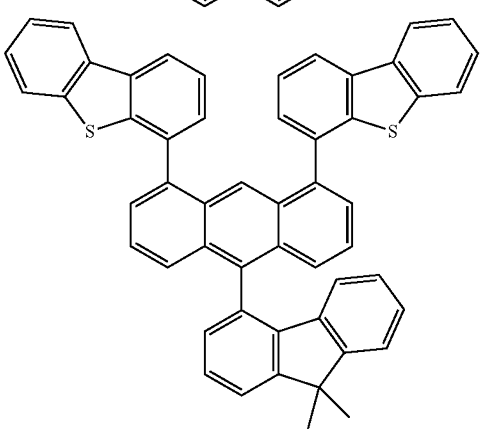
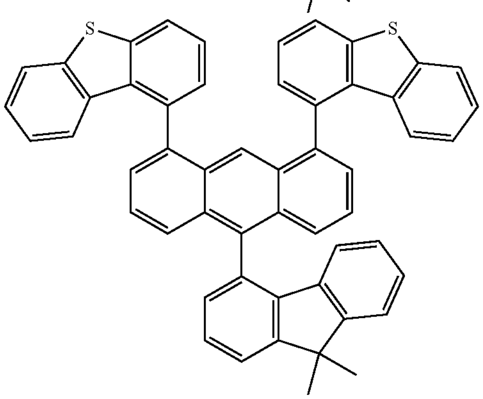
-continued
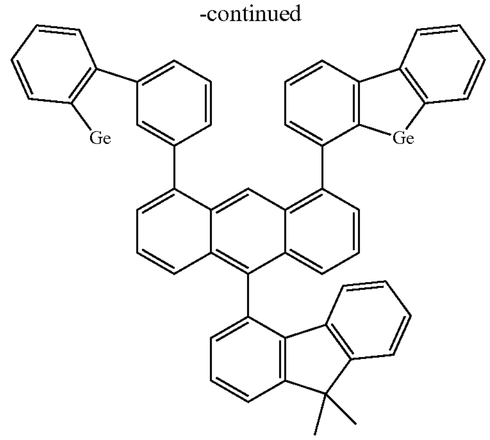
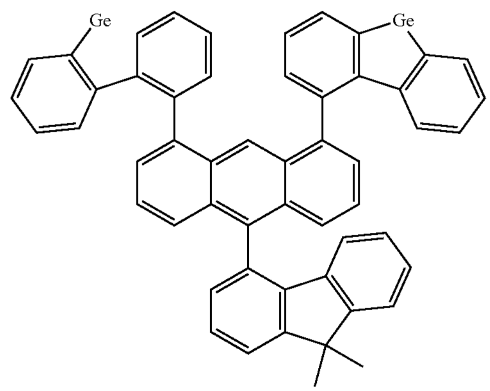
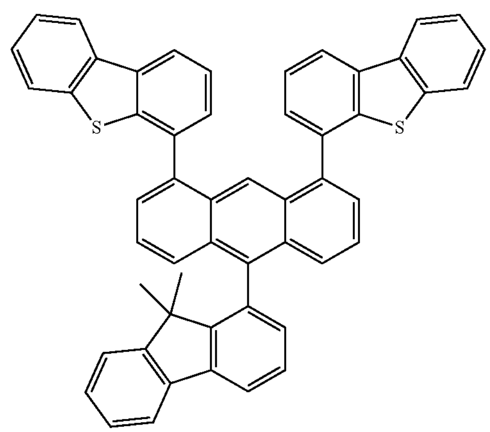
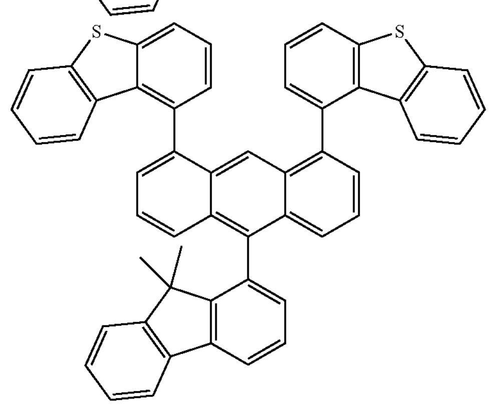

-continued
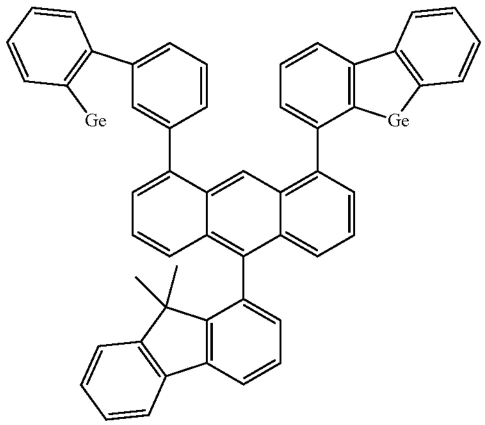
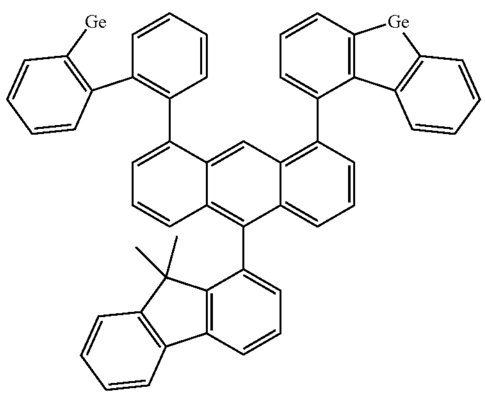
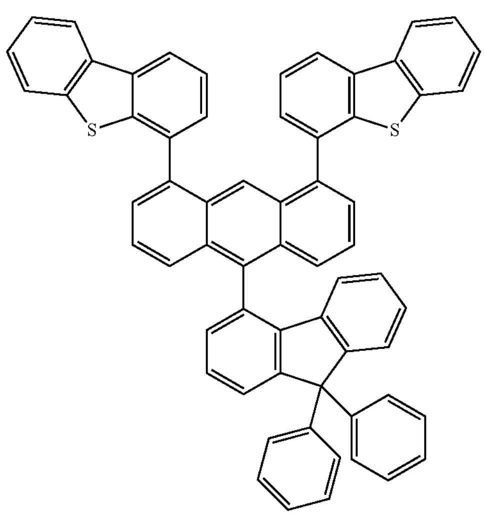
-continued
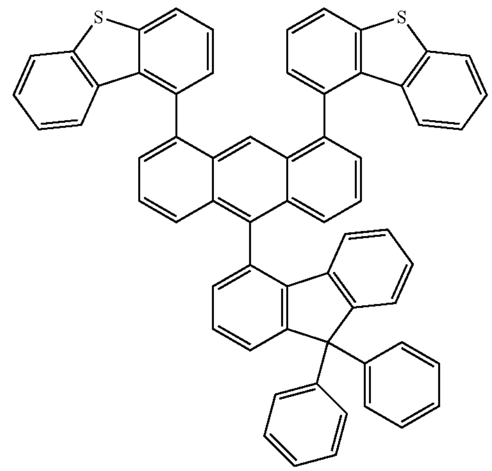
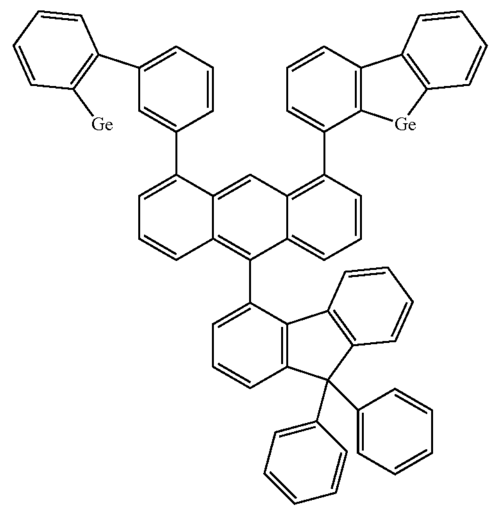
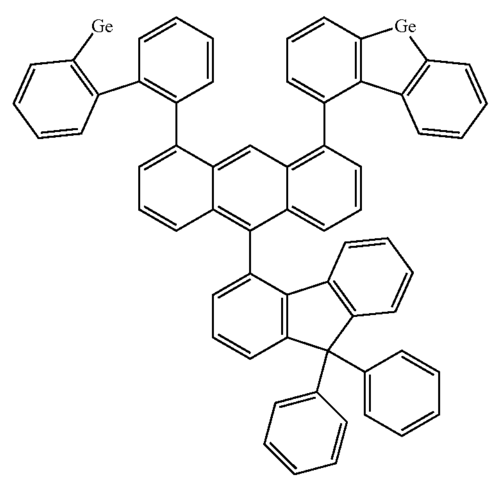

-continued
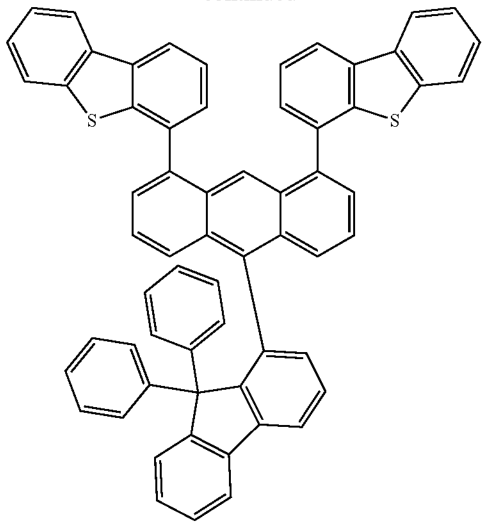
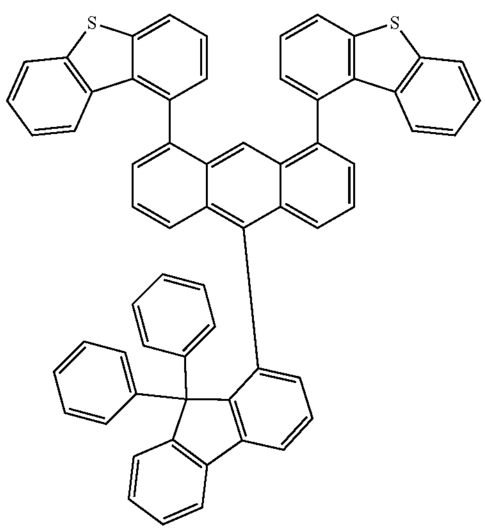
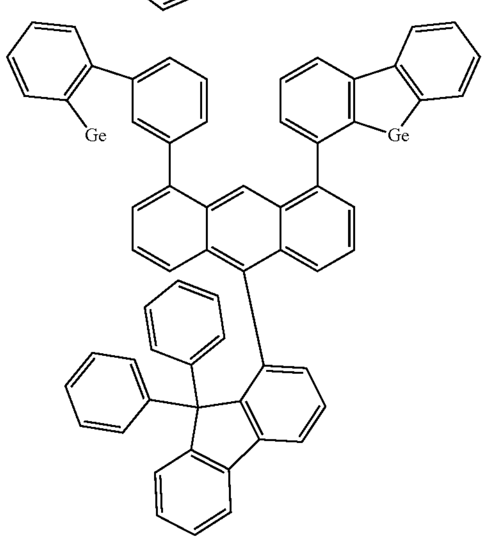
-continued
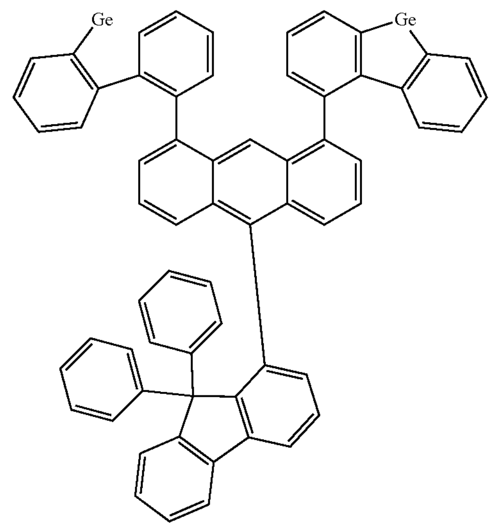
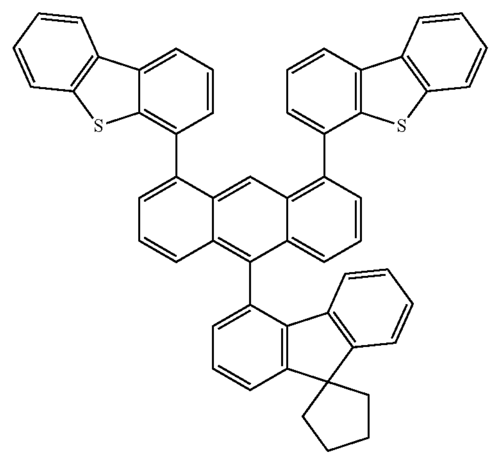
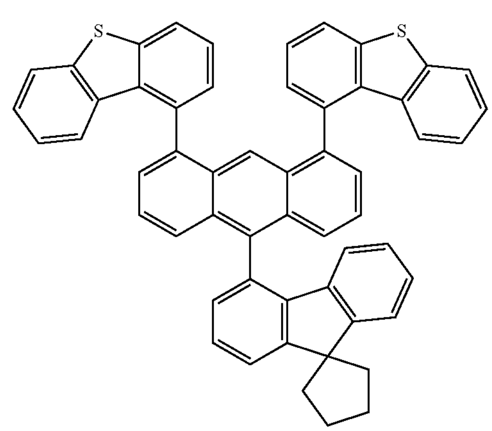

-continued
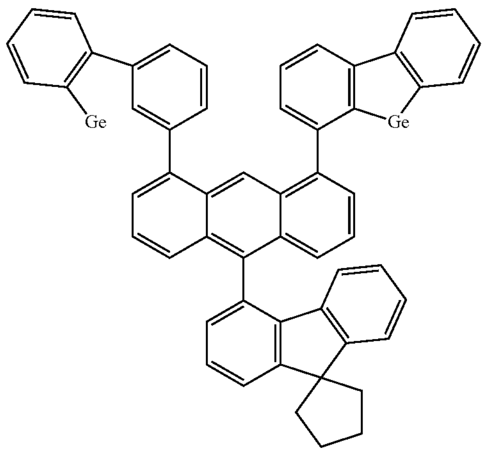
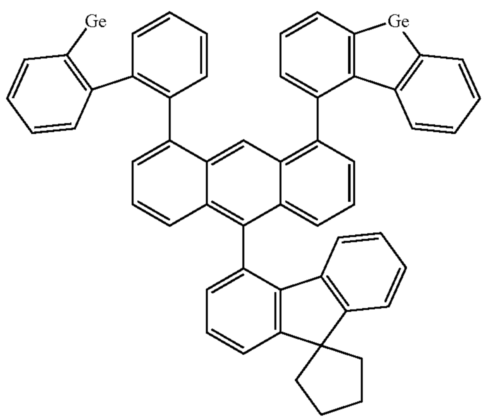
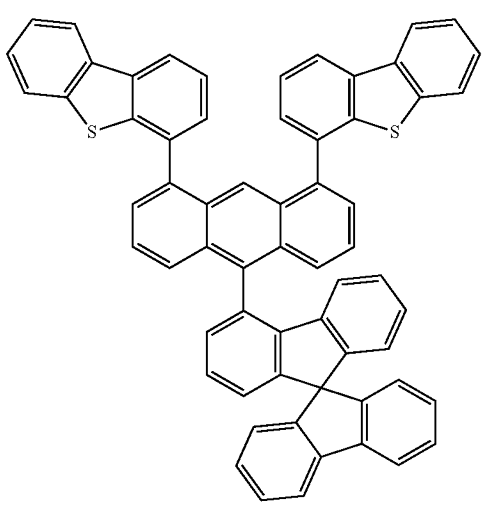
-continued
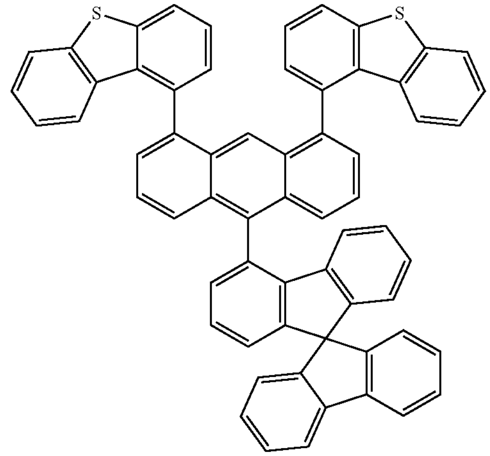
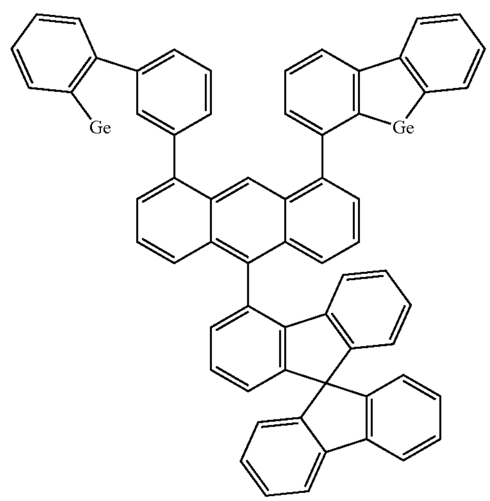
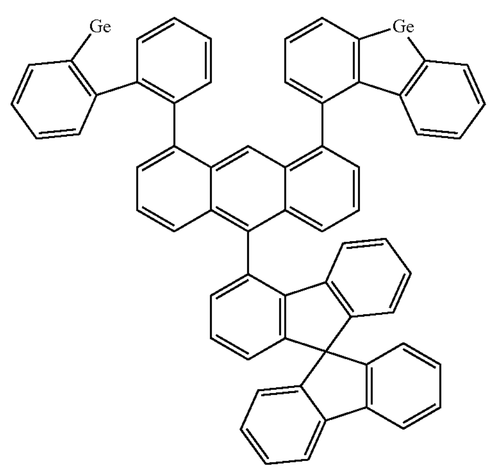

-continued
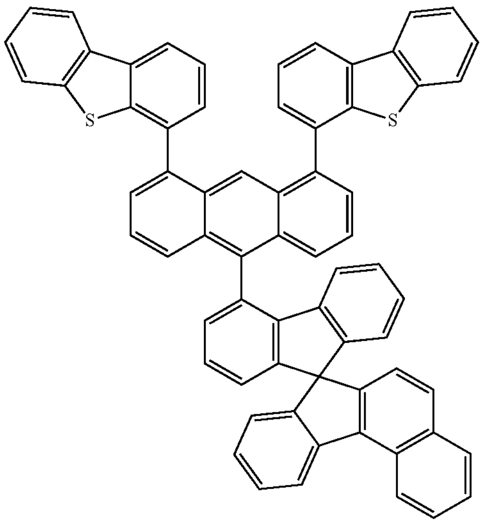
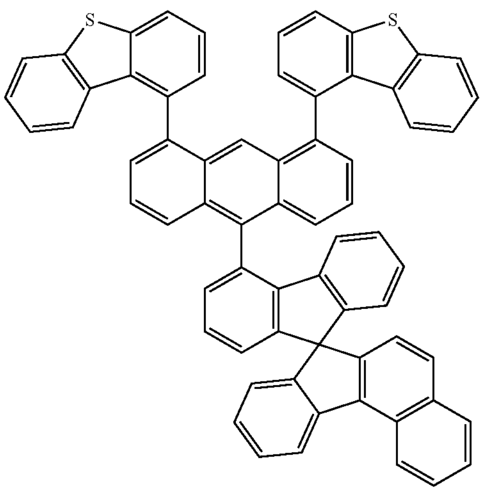
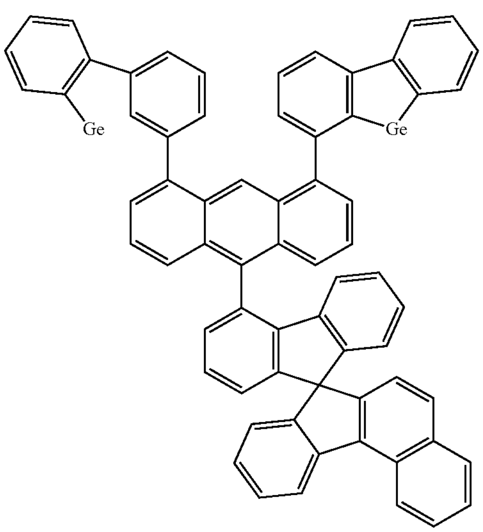
-continued
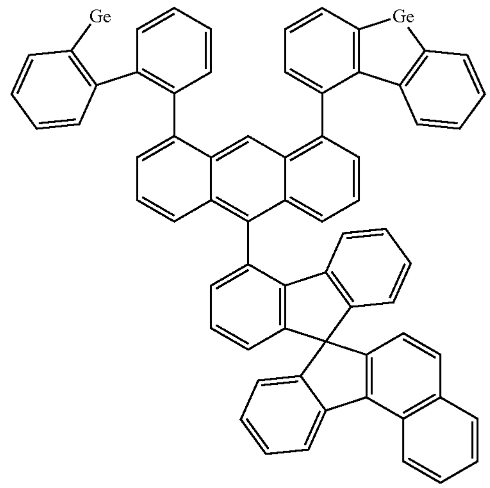
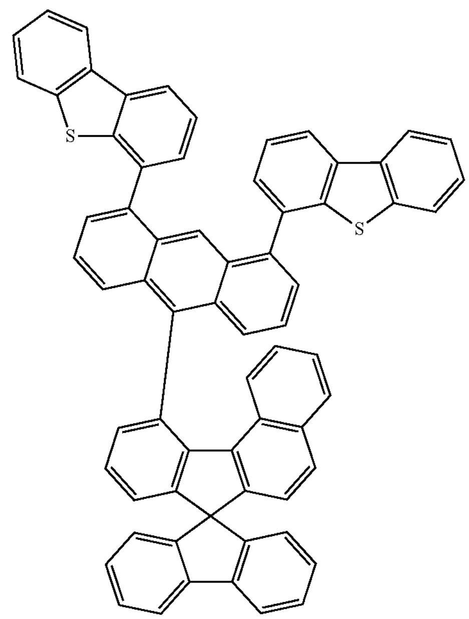
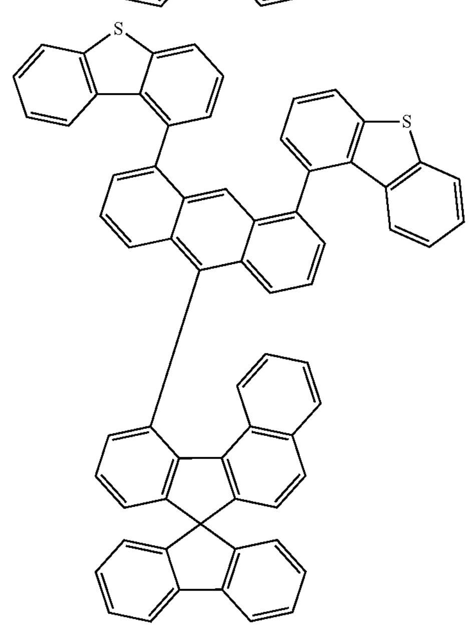

-continued
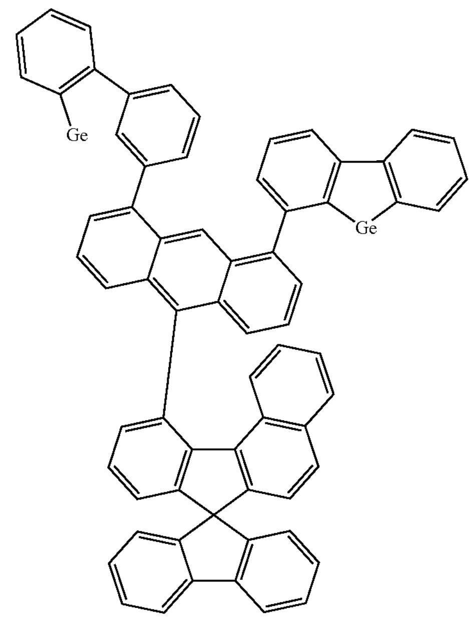
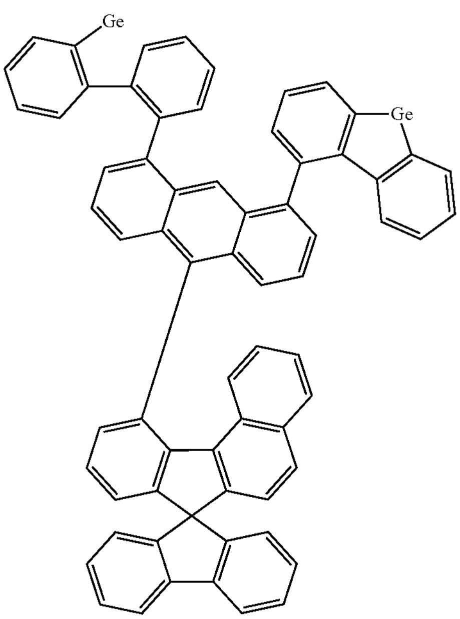
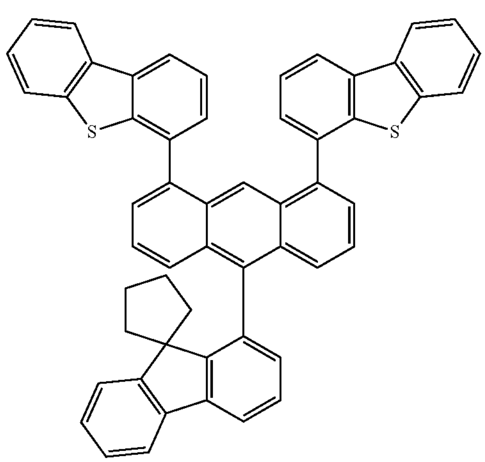
-continued
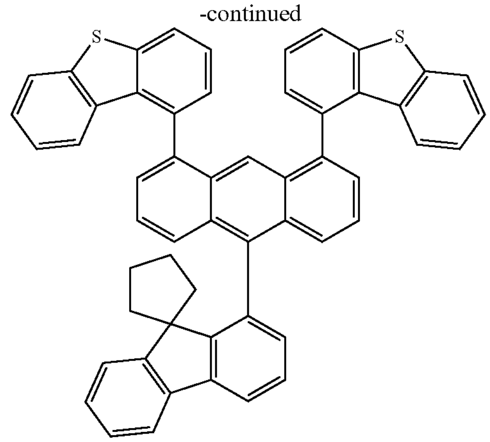
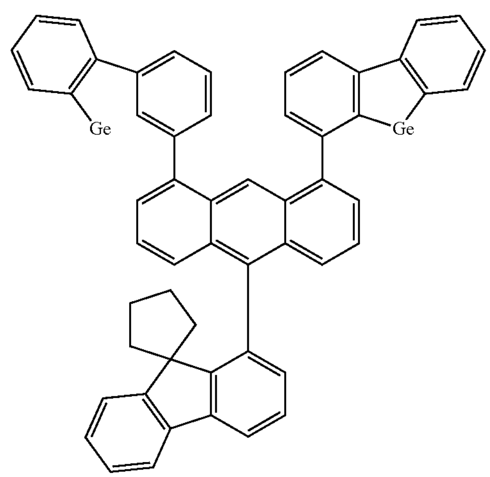
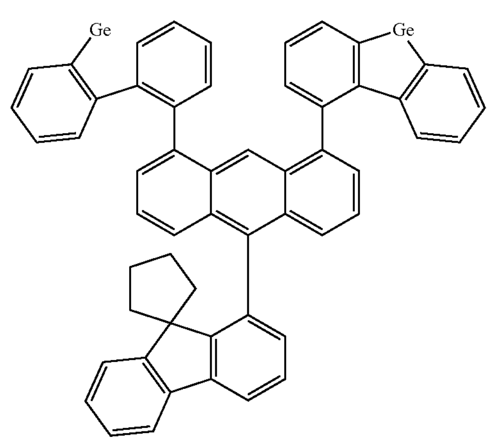

-continued
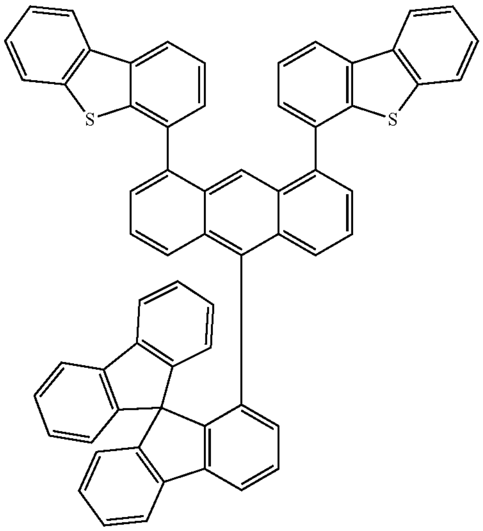
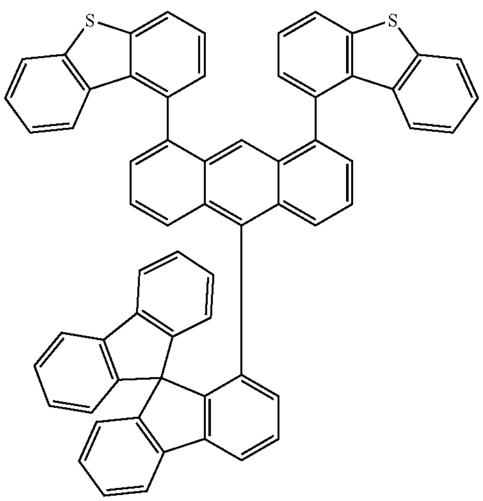
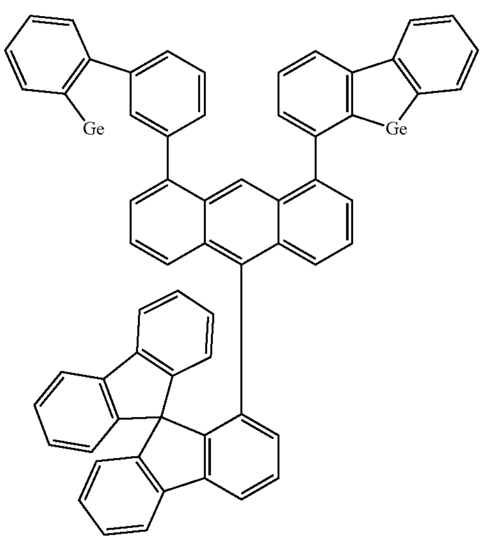
-continued
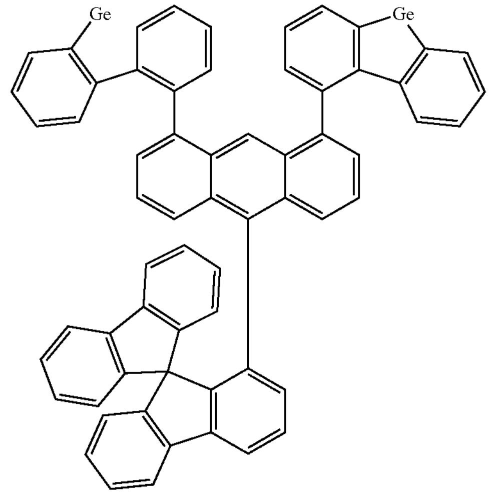
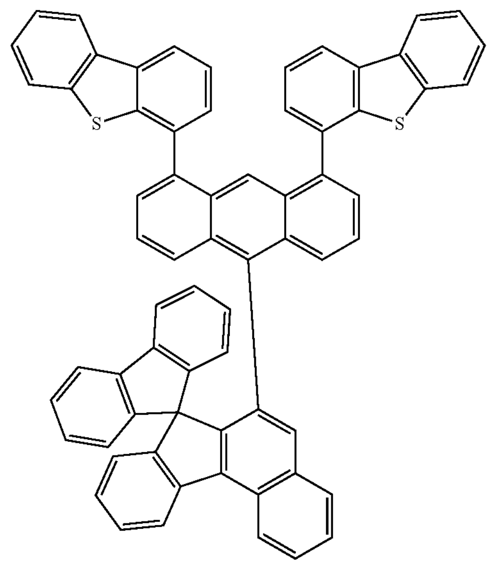
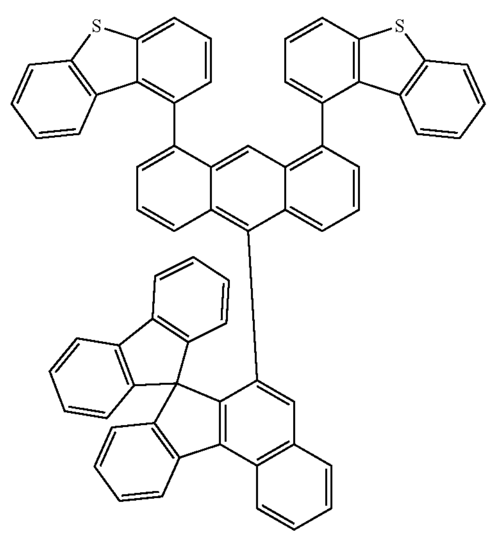

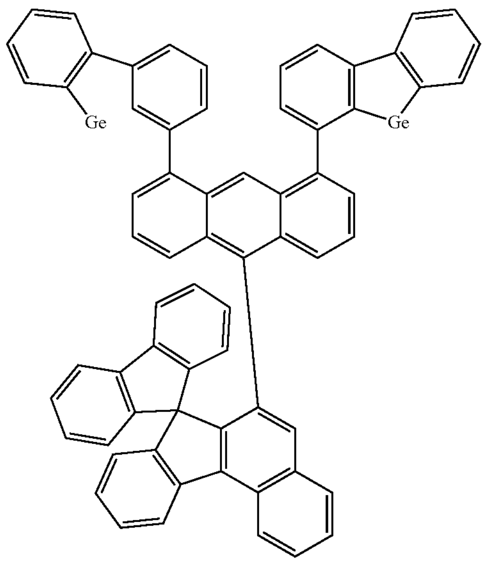
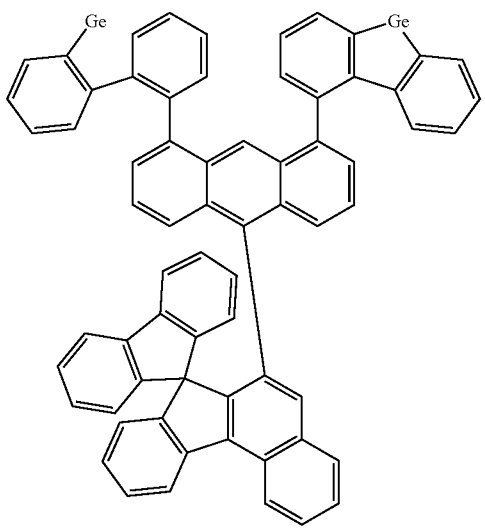
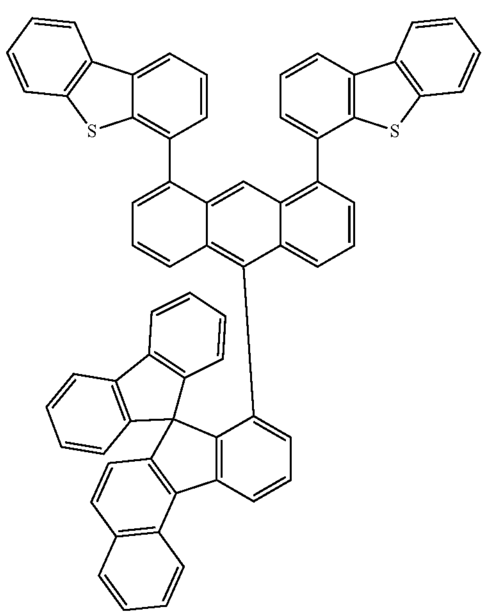
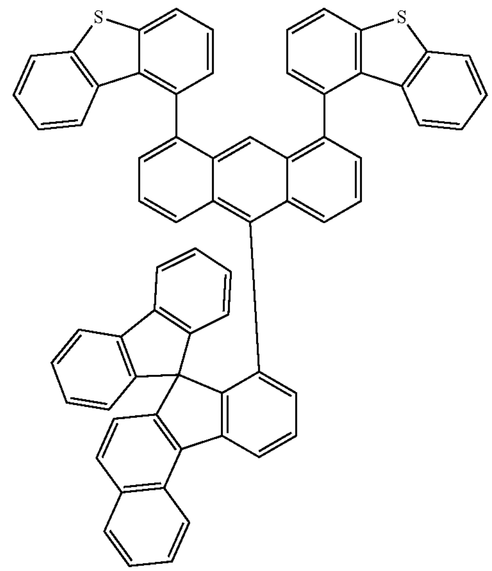
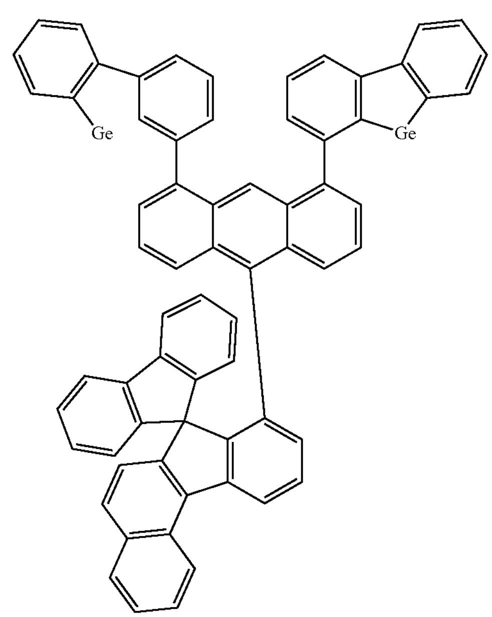

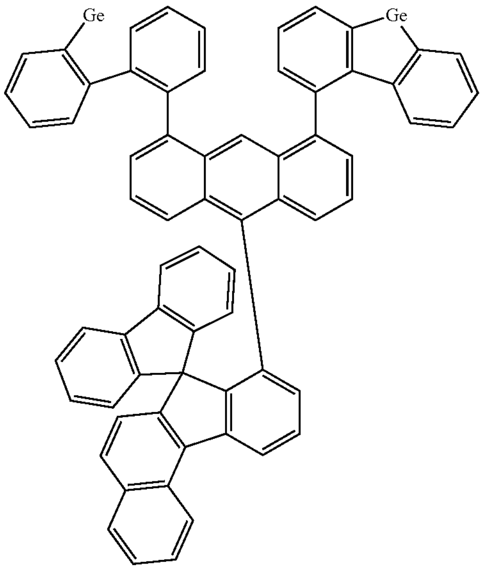
Ge
Ge
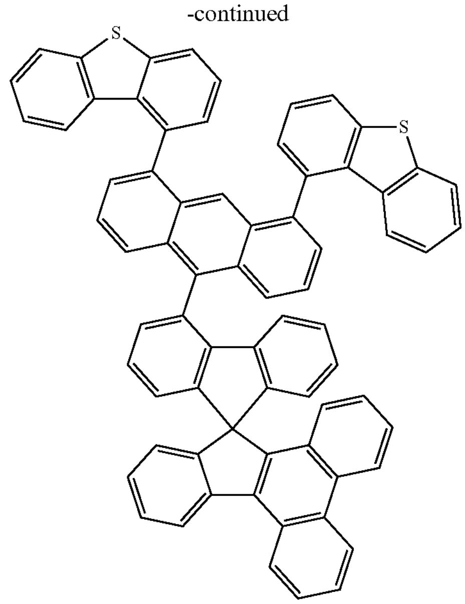
S
S
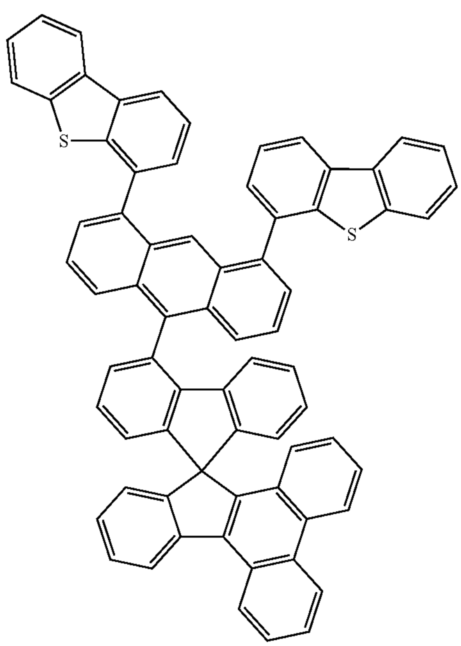
S
S
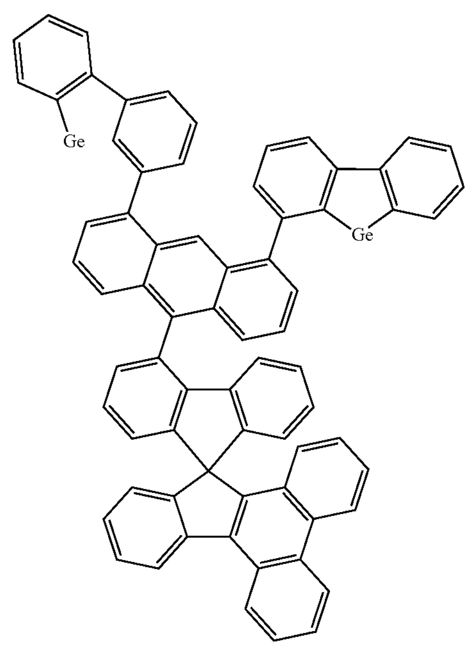
Ge
Ge

-continued
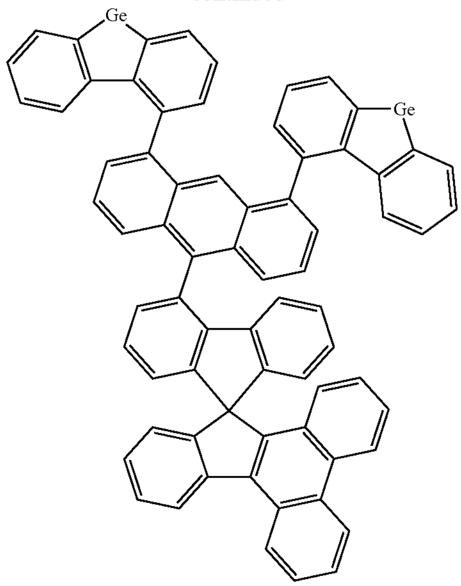
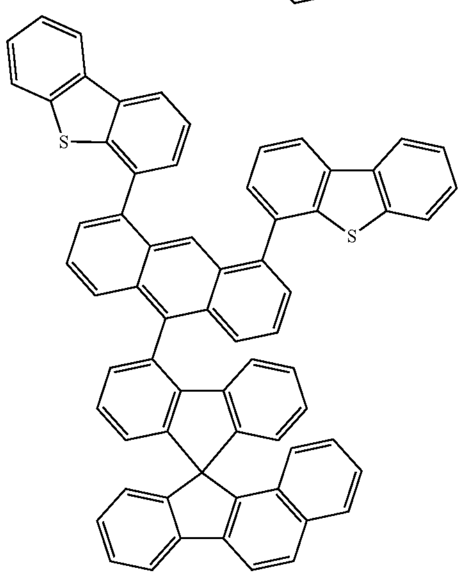
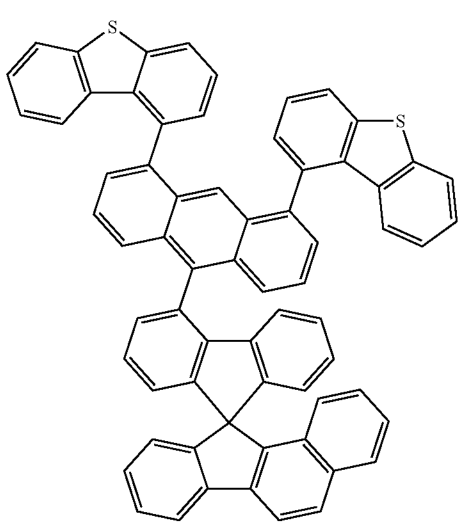
-continued
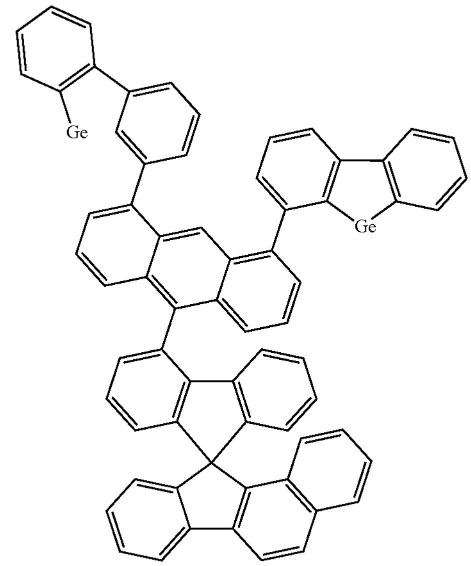
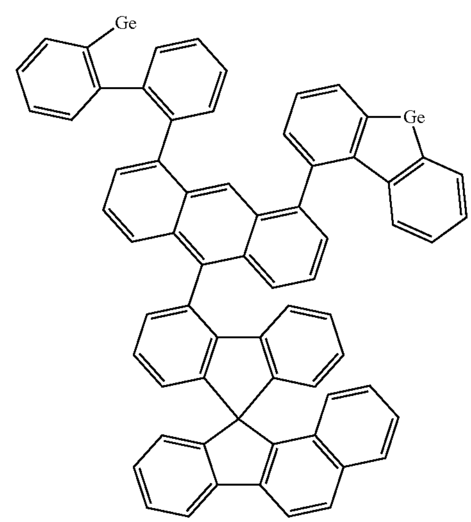
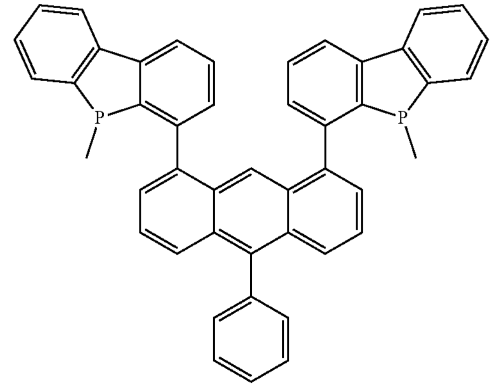

-continued
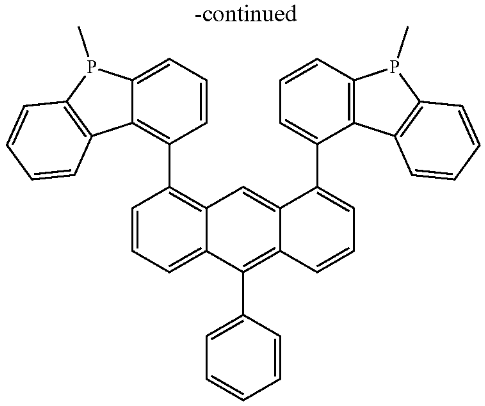
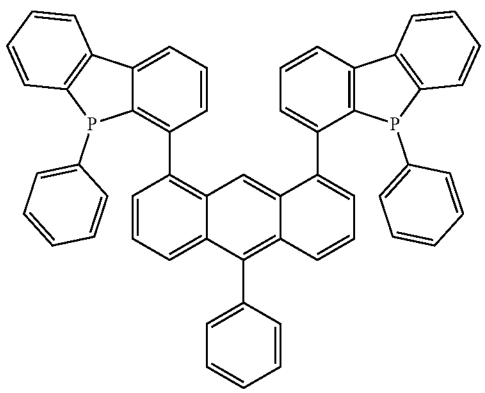
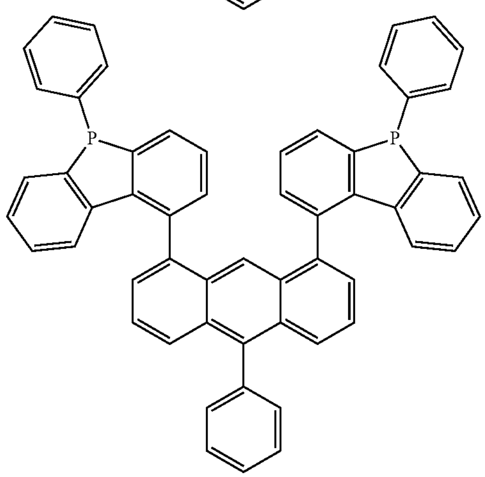
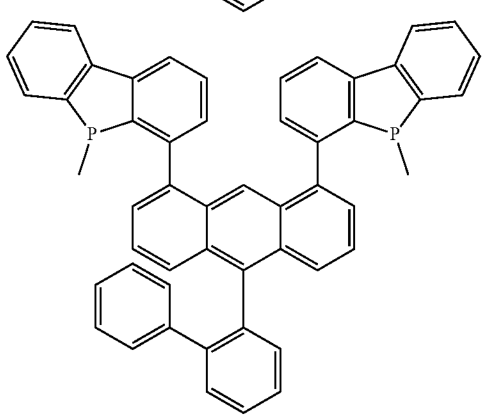
-continued
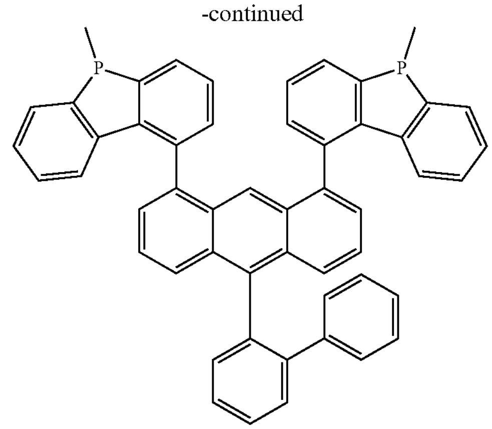
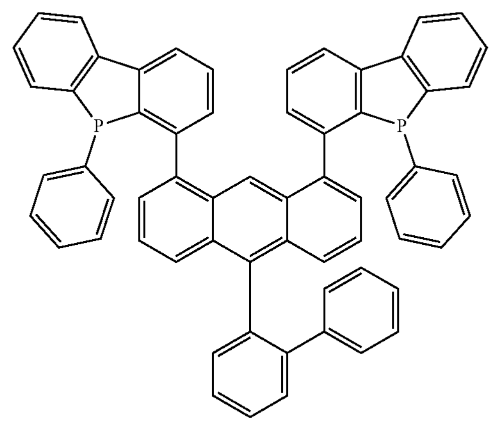
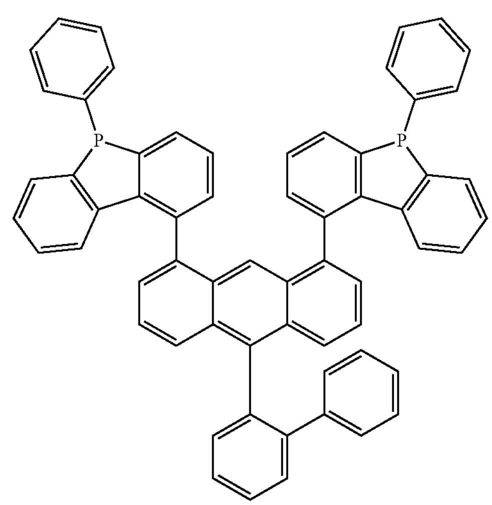

-continued
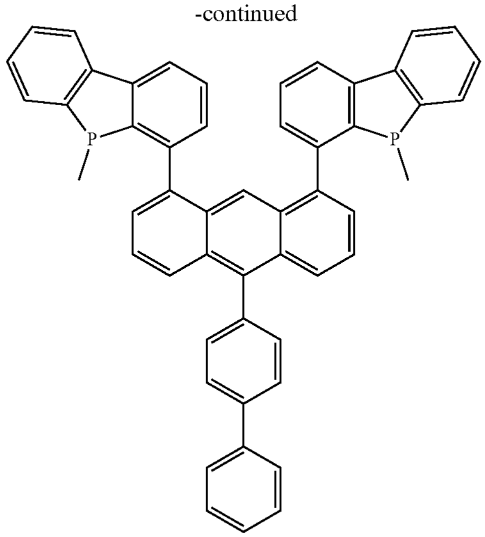
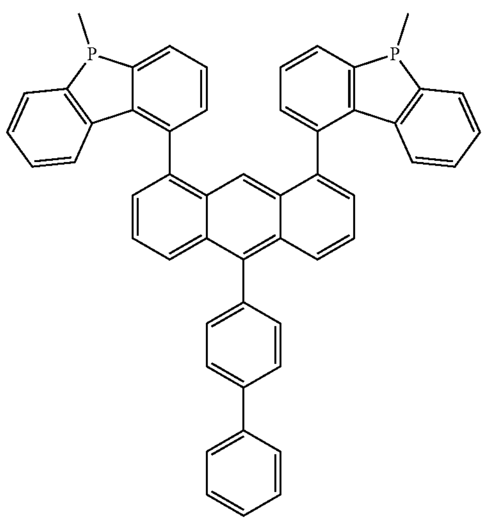
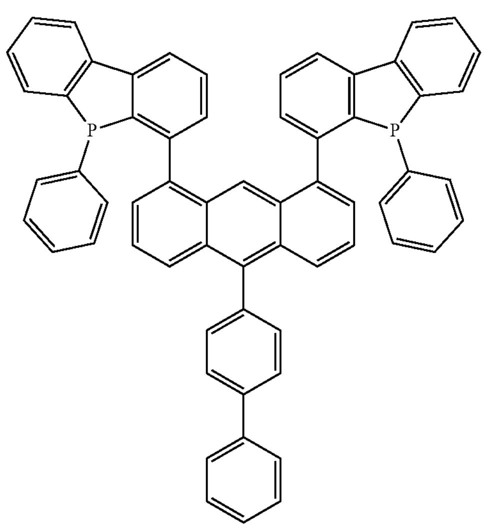
-continued
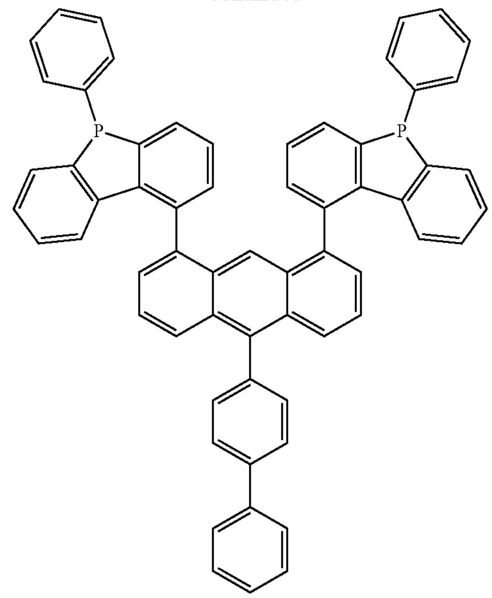
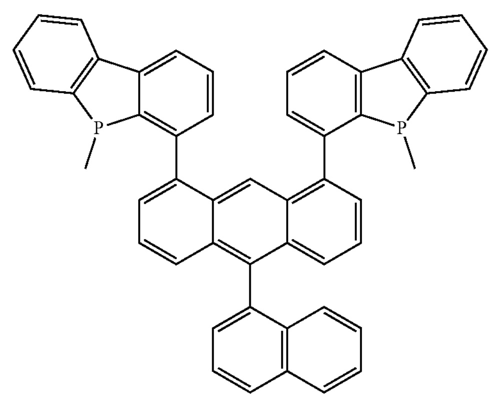
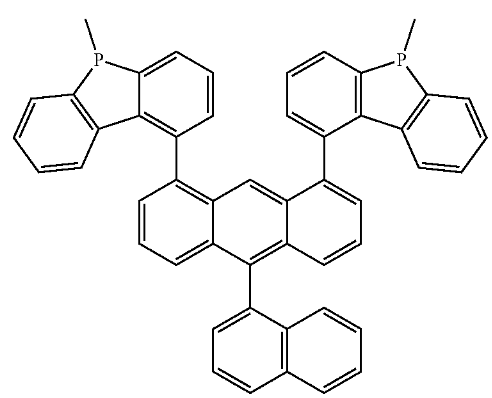

-continued
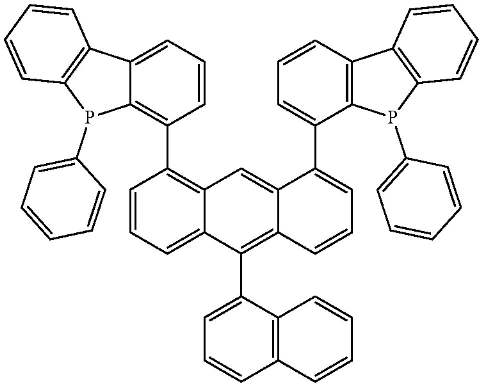
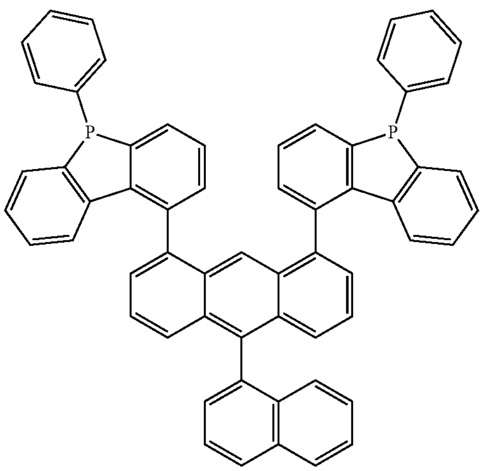
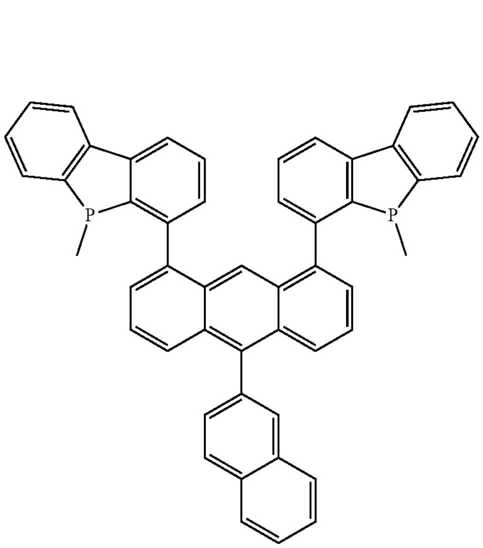
-continued
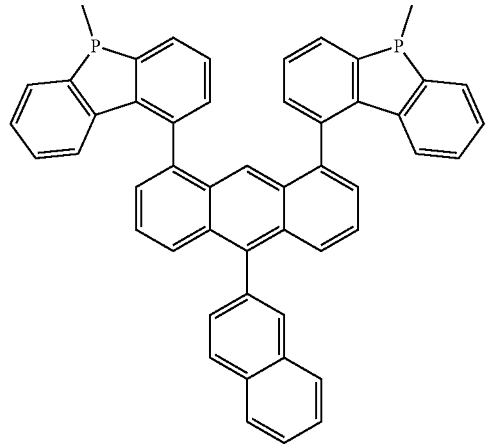
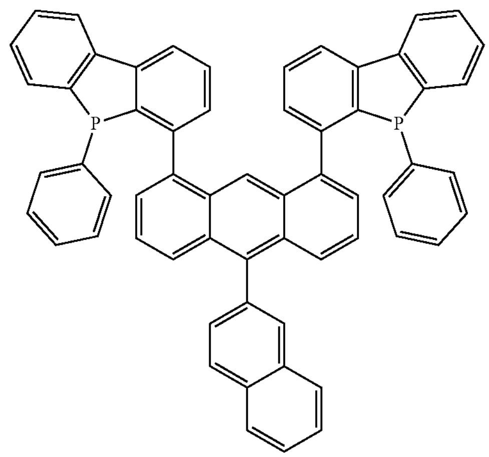
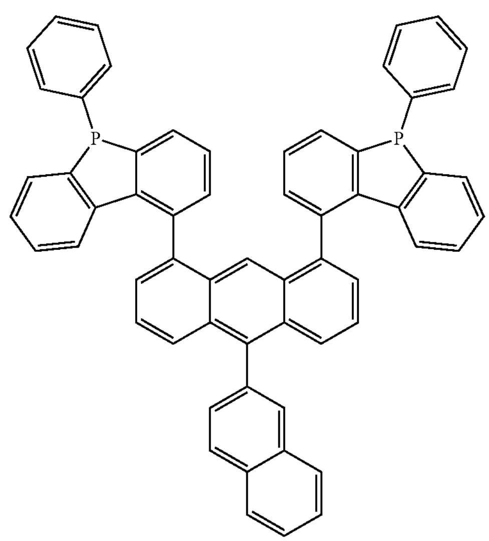

-continued
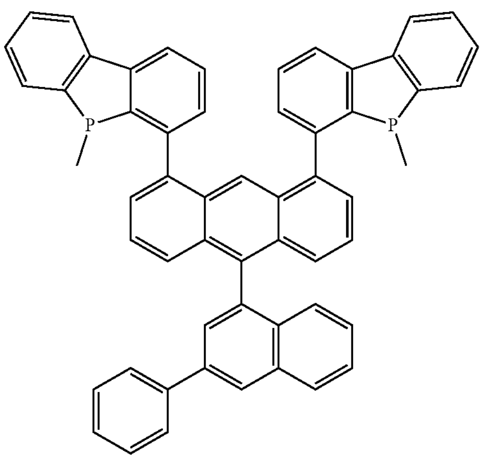
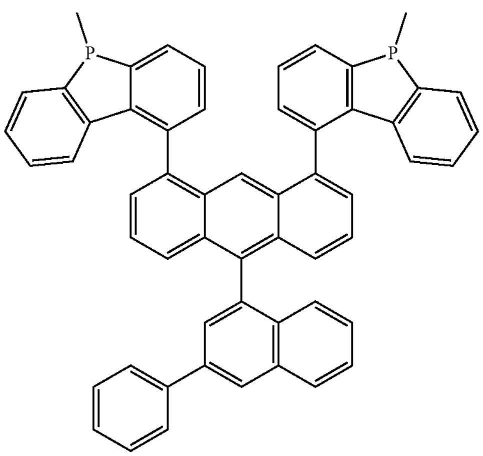
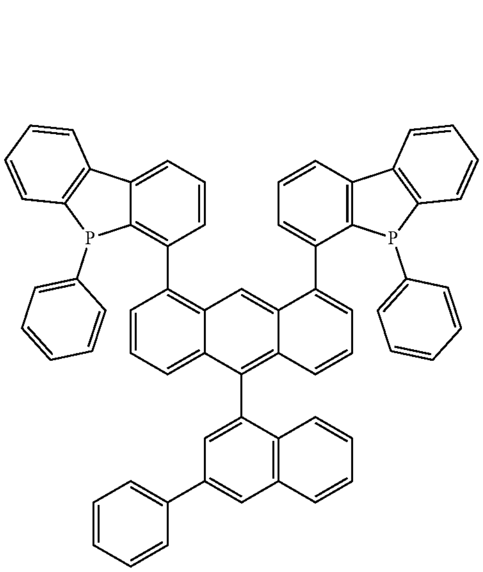
-continued
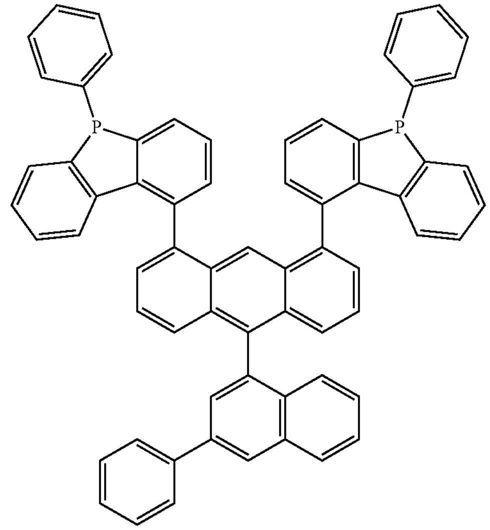
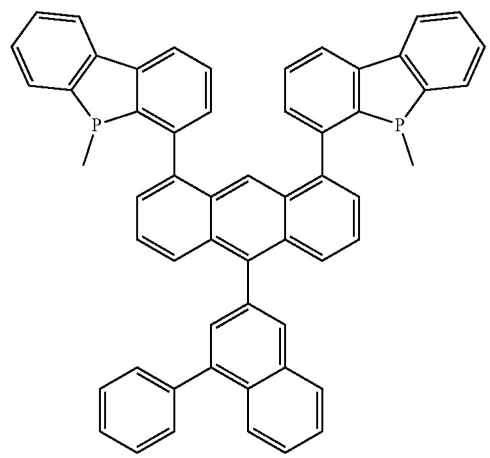
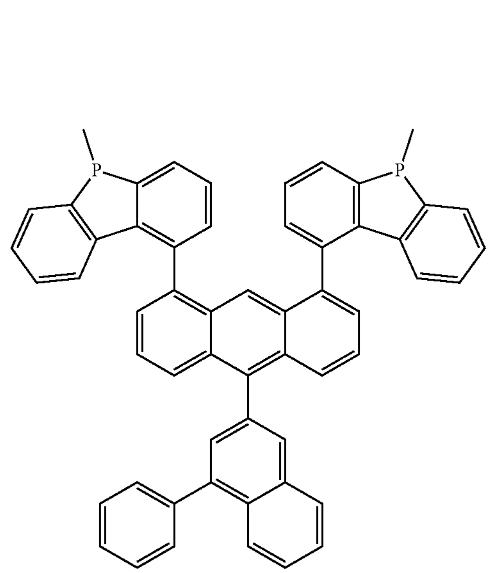

-continued
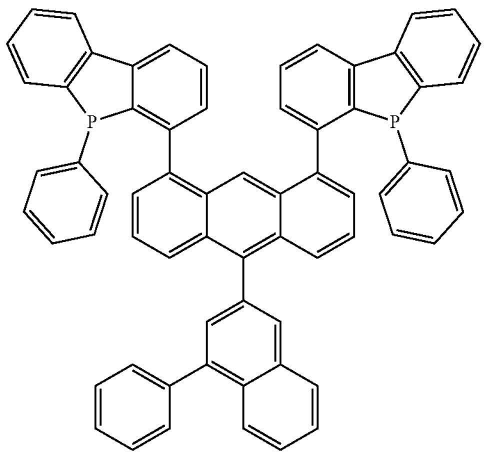
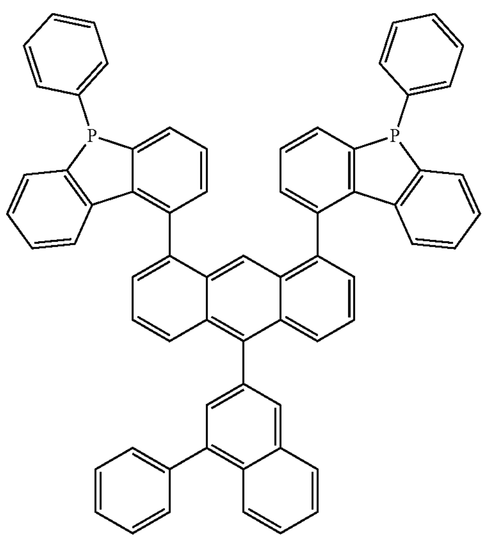
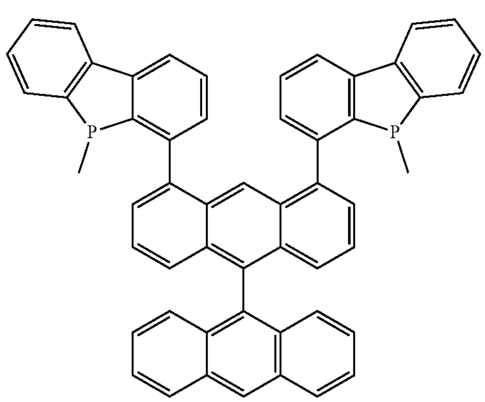
-continued
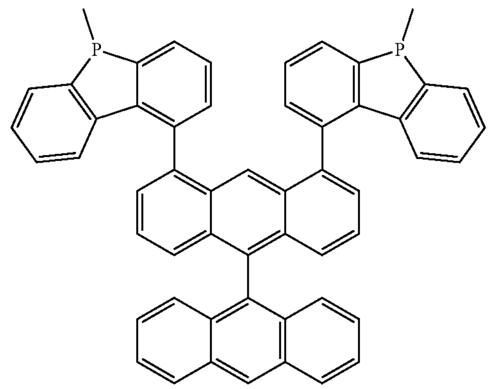
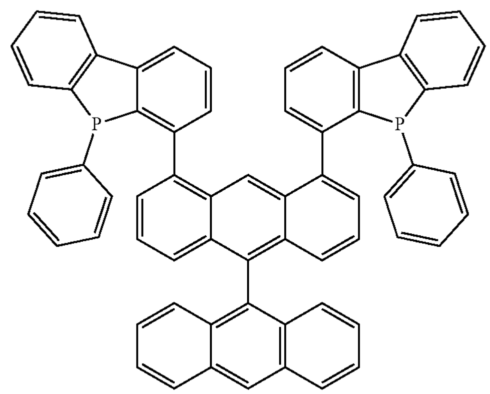
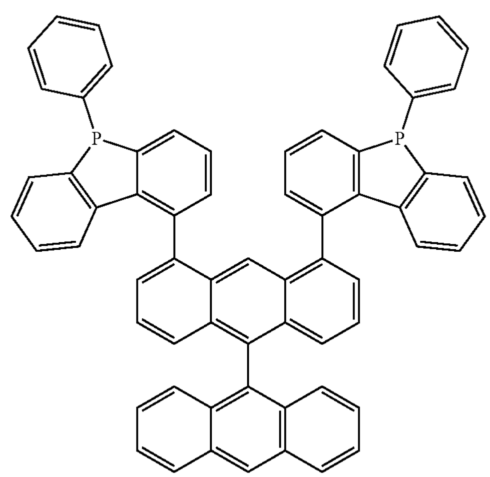

-continued
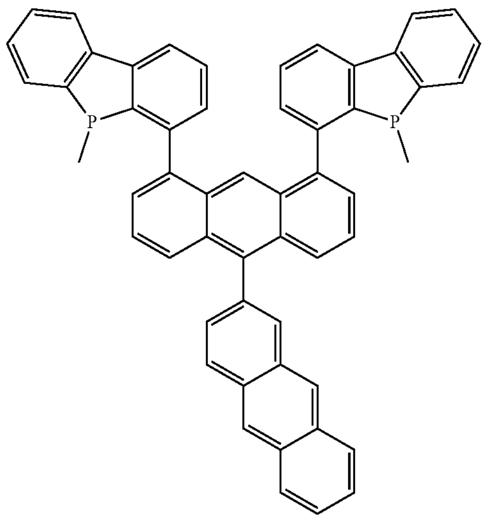
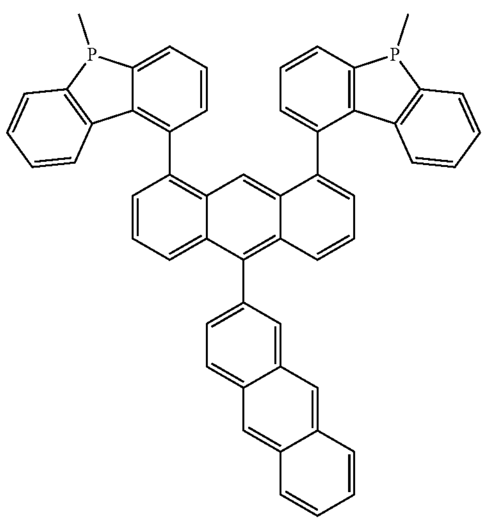
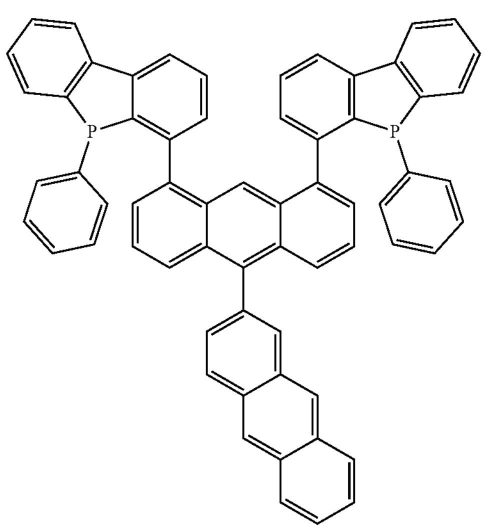
-continued
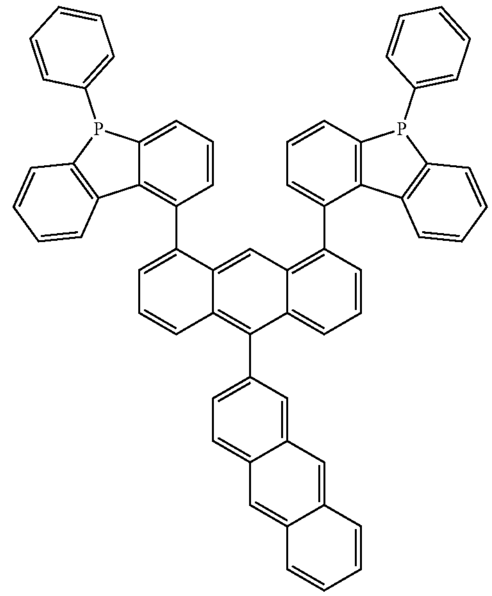
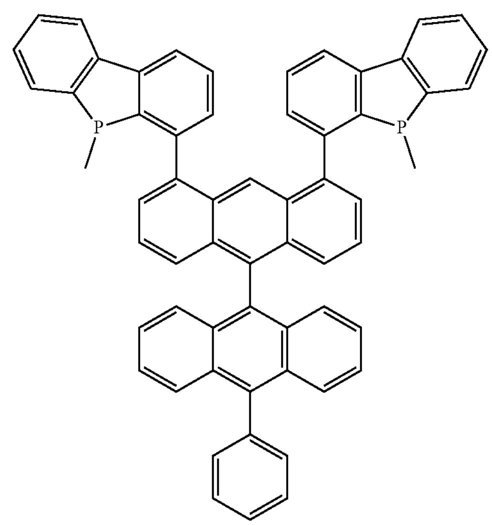
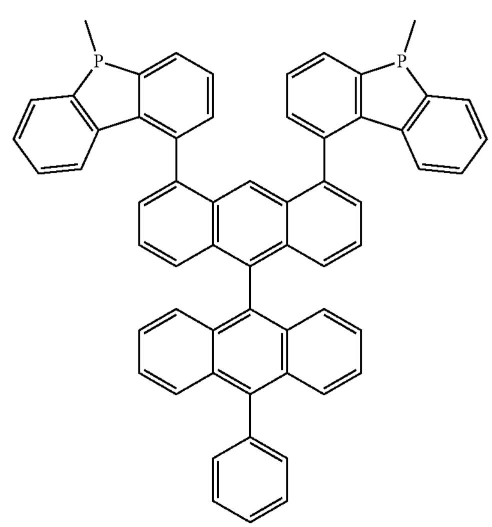

-continued
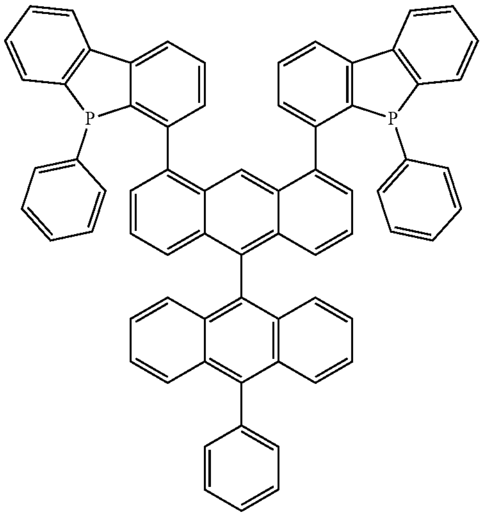
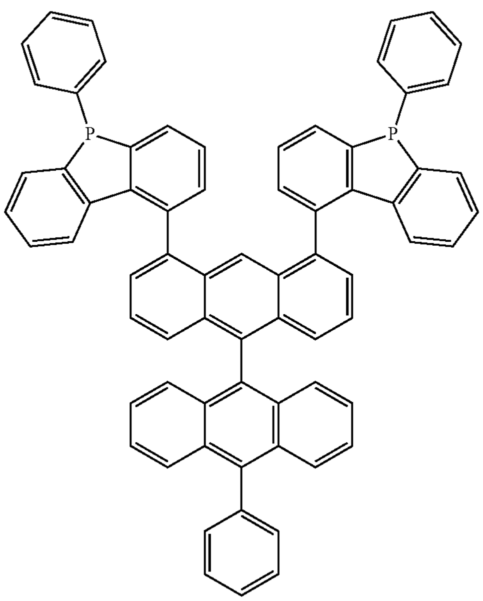
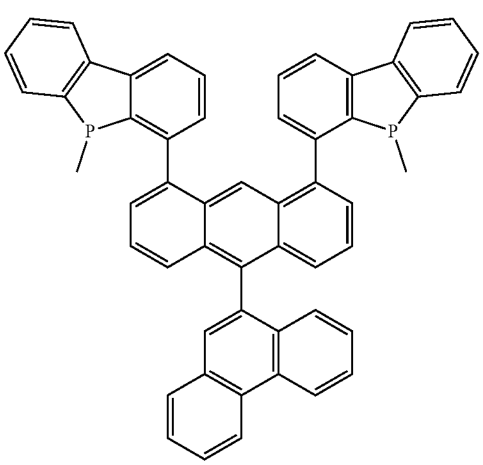
-continued
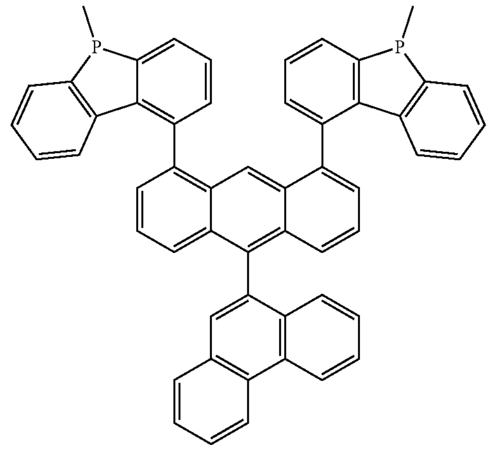
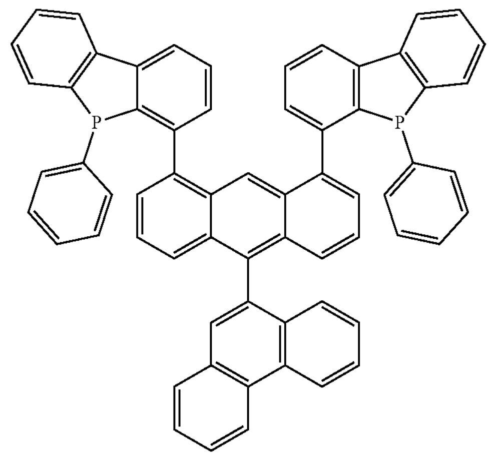
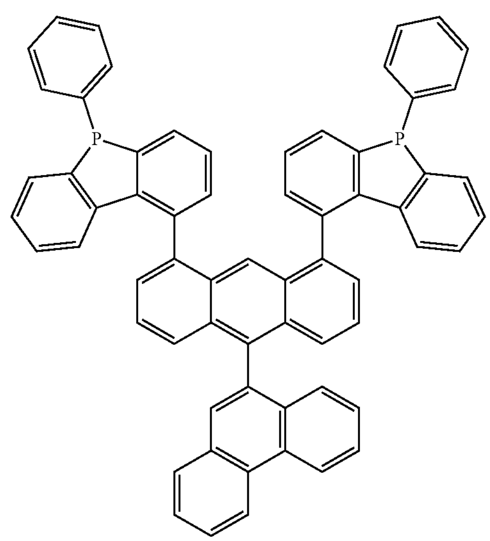

-continued
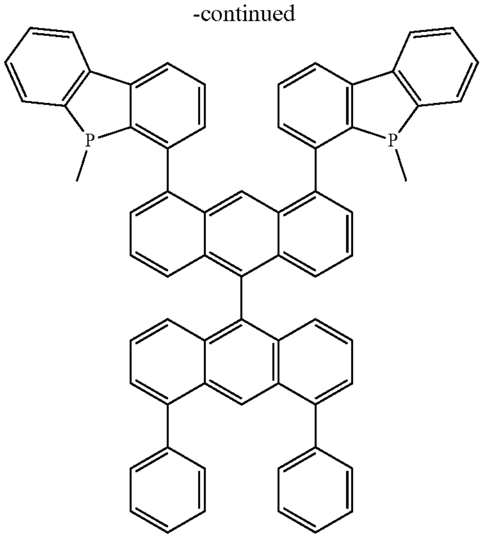
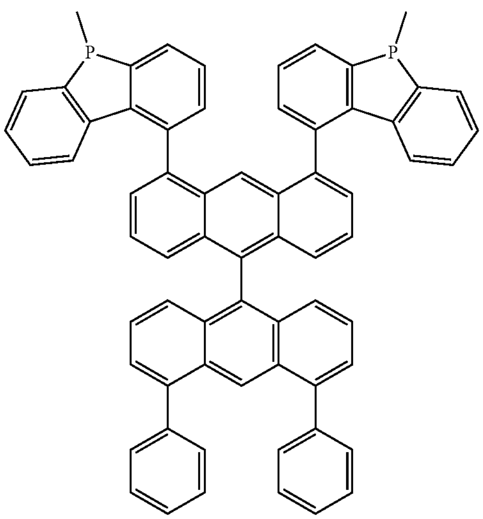
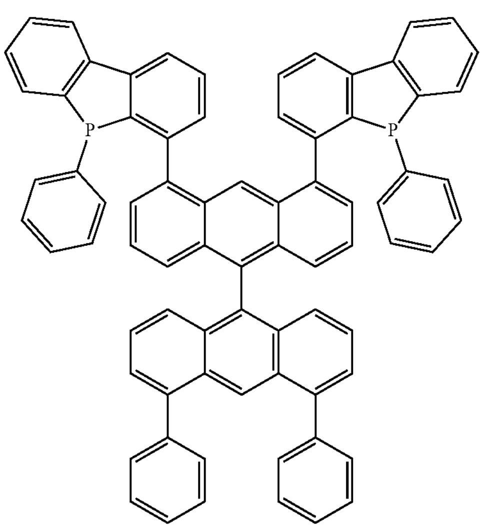
-continued
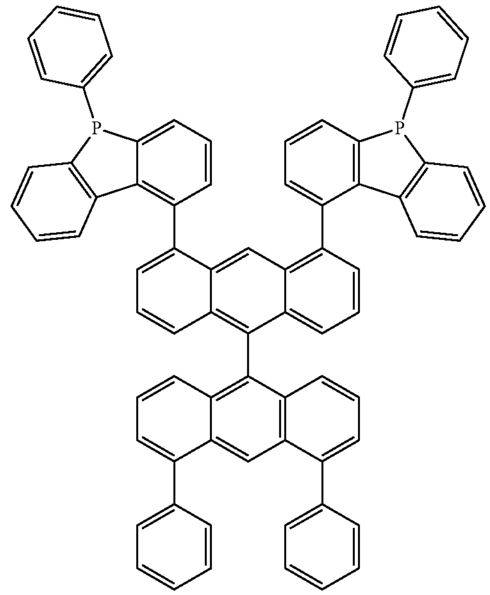
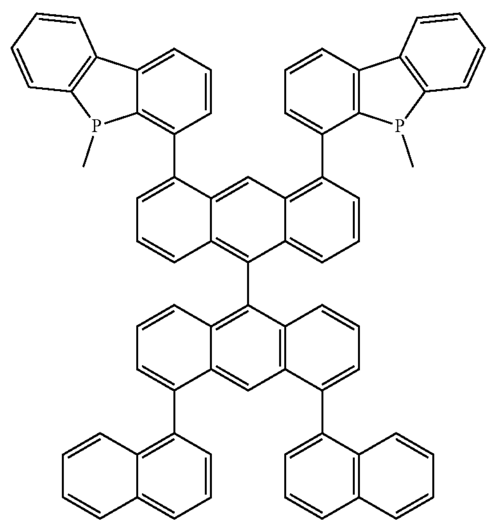
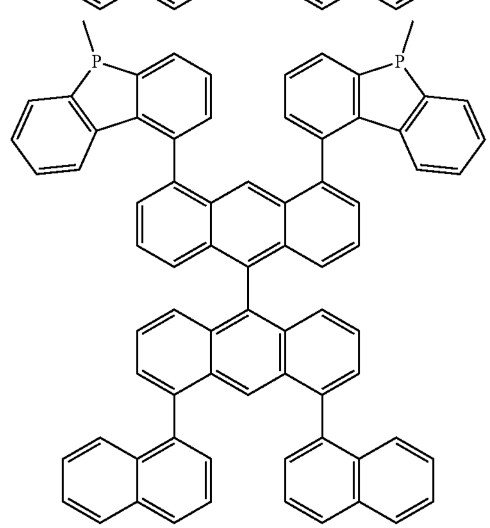

-continued
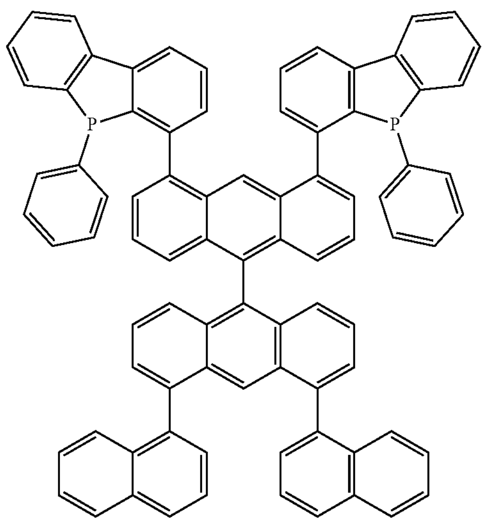
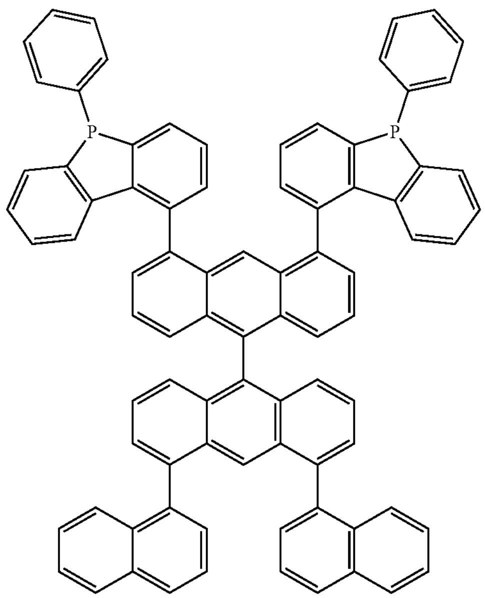
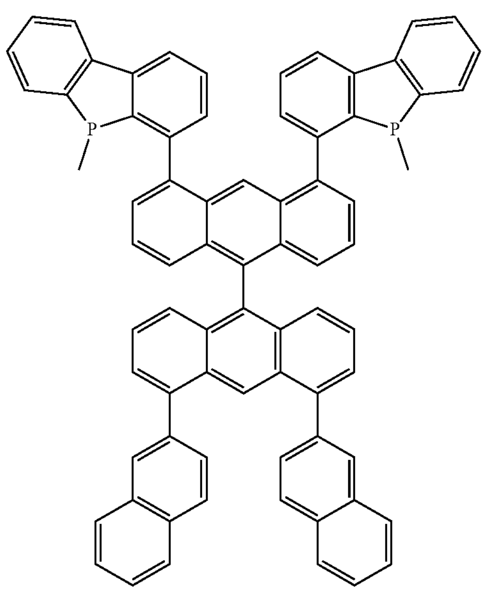
-continued
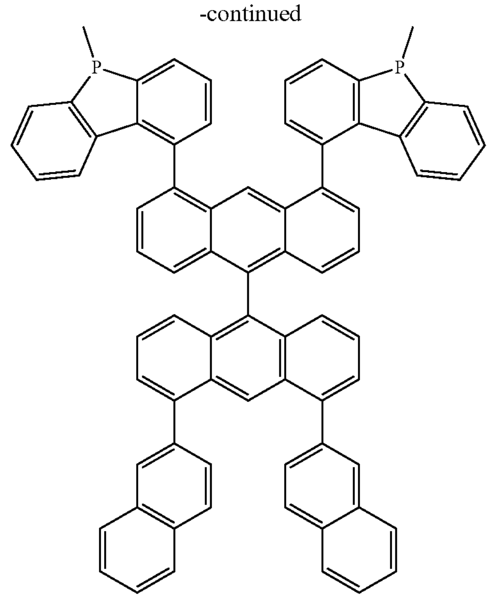
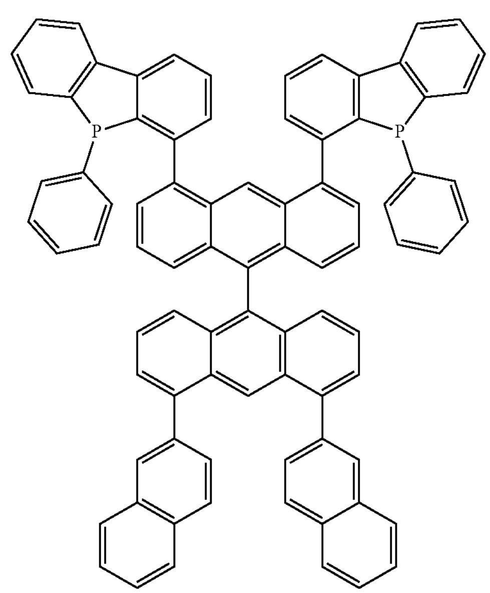

-continued
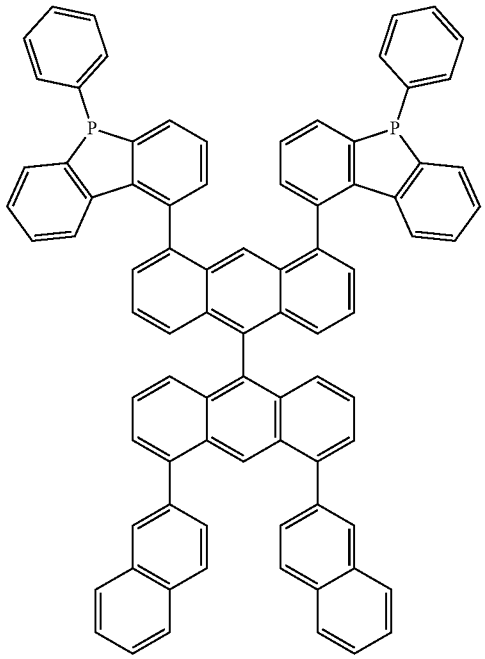
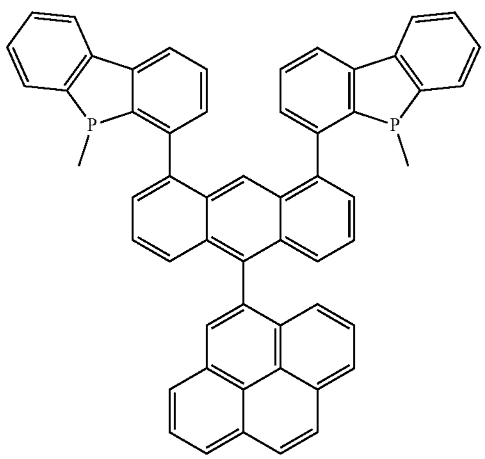
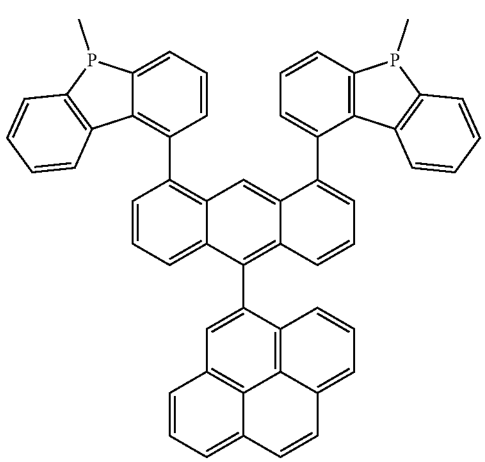
-continued
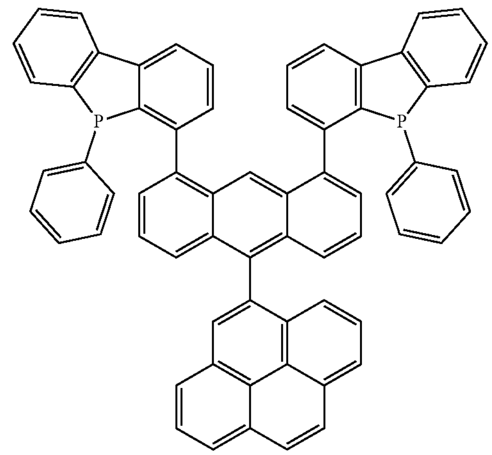
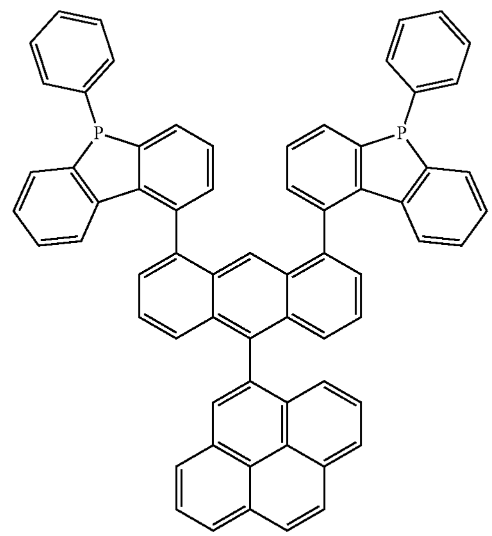
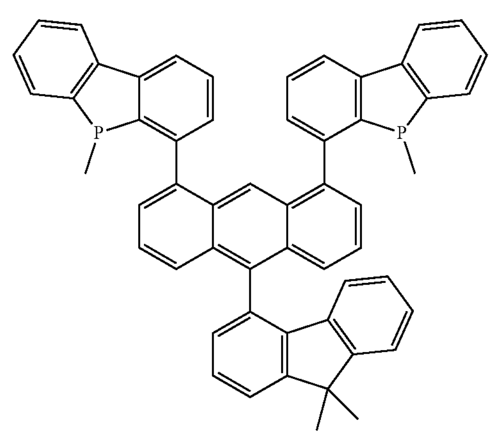

-continued
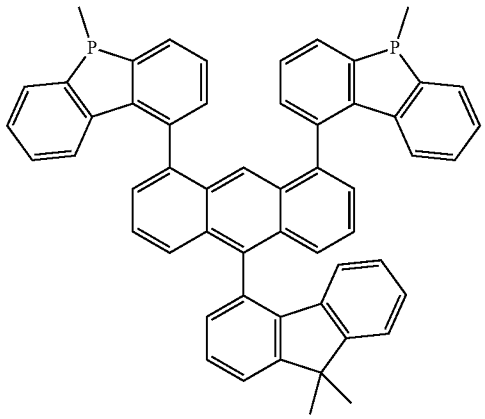
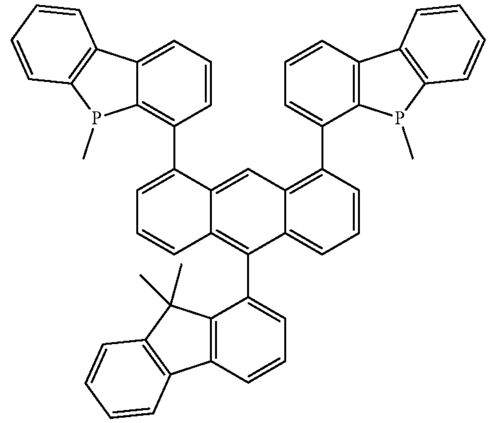
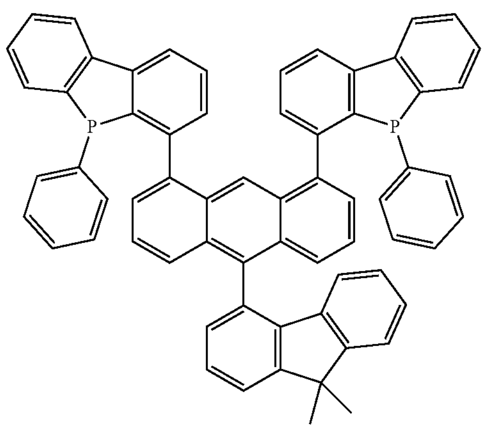
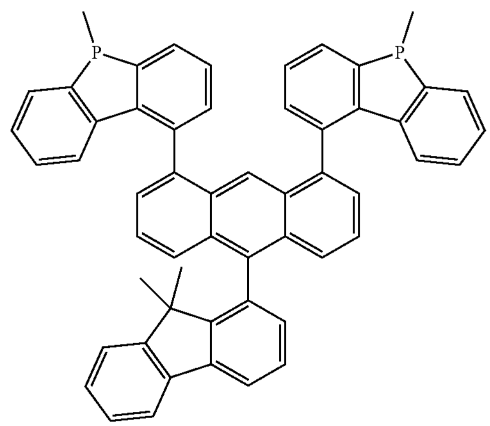
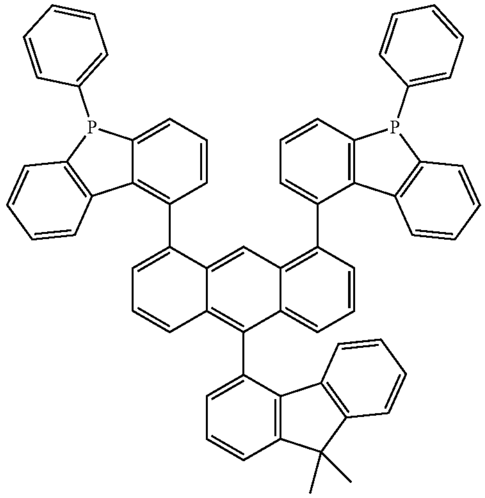
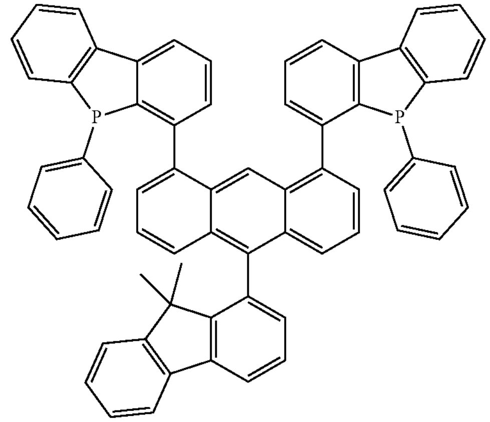
-continued -continued
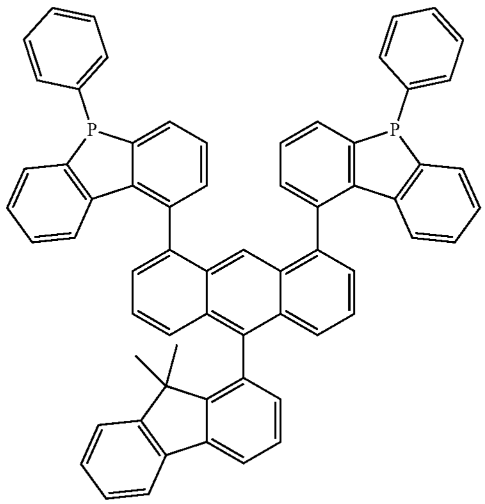
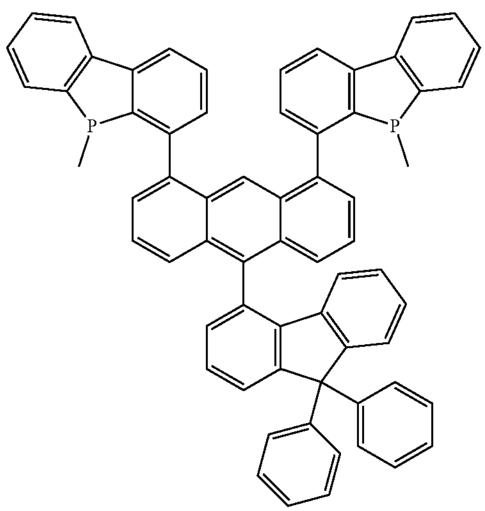
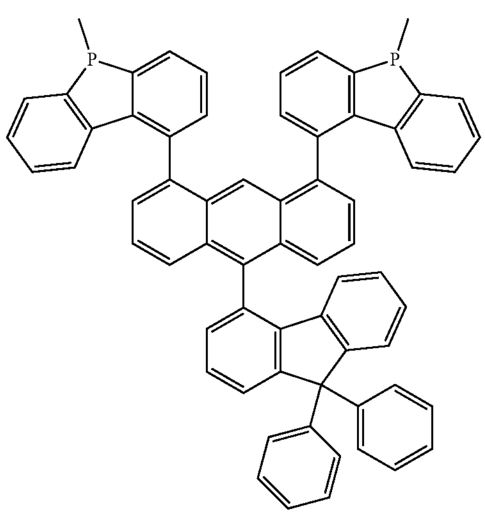
-continued
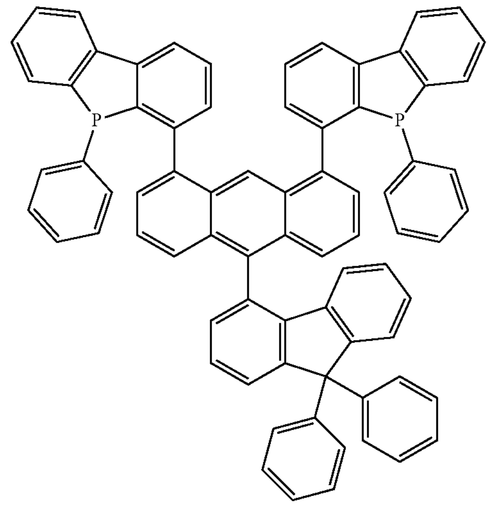
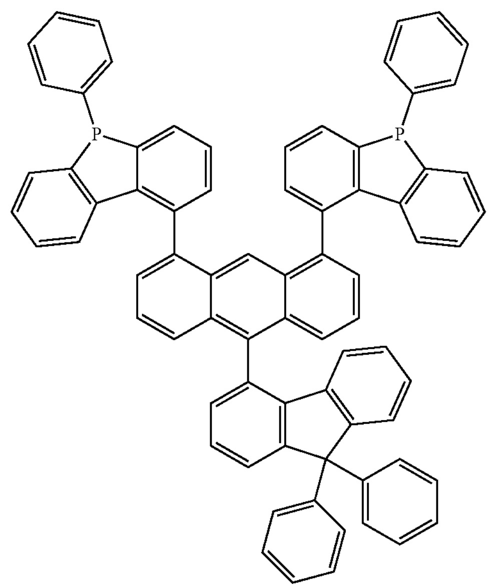
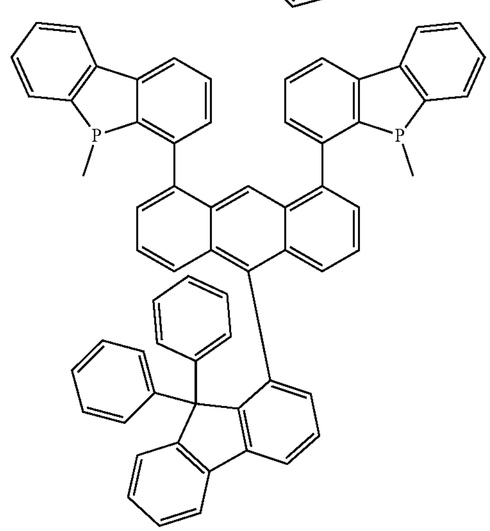

-continued
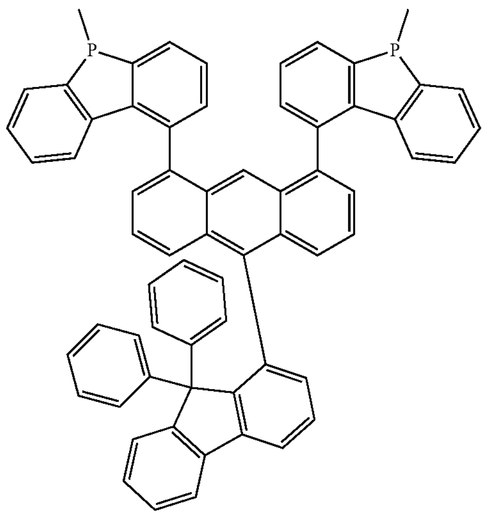
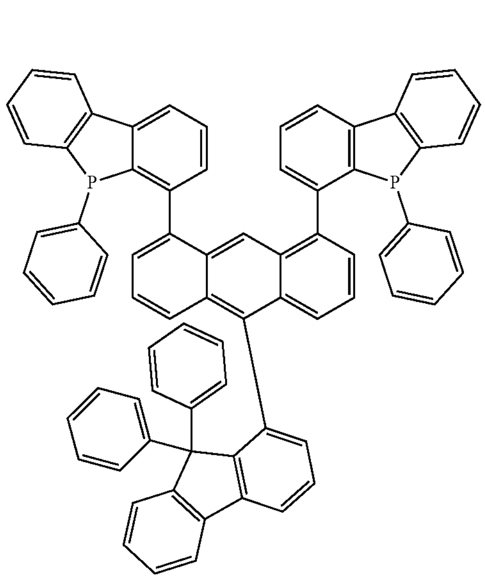
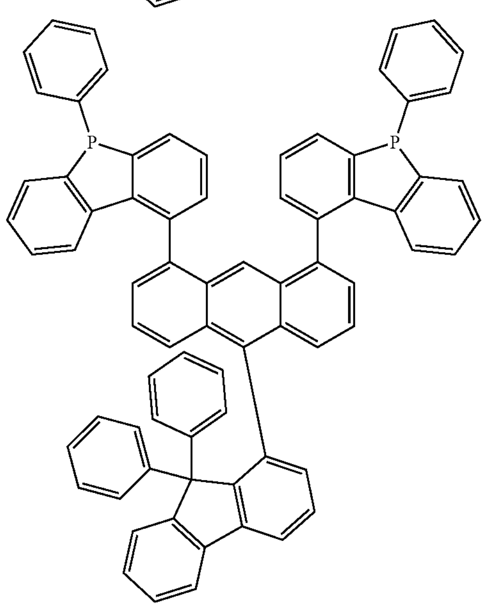
-continued
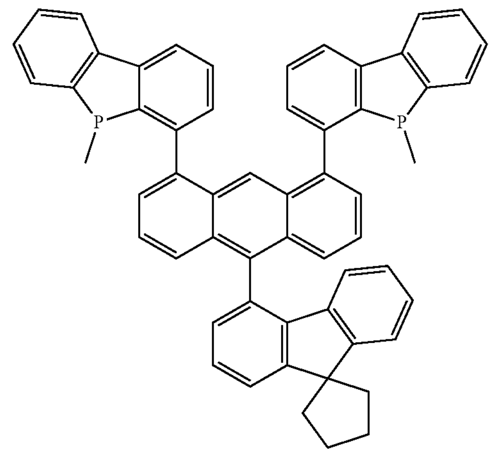
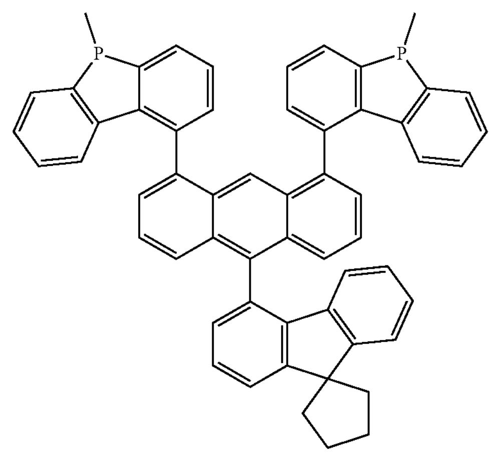
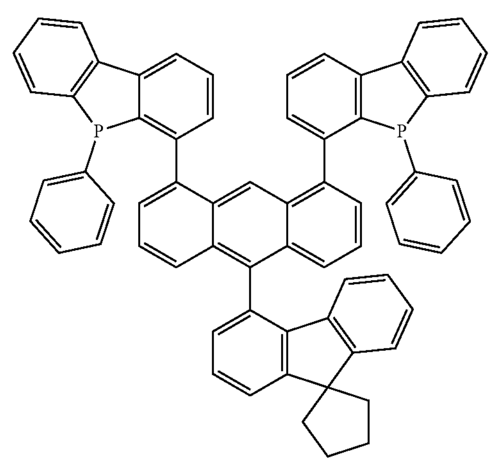

-continued
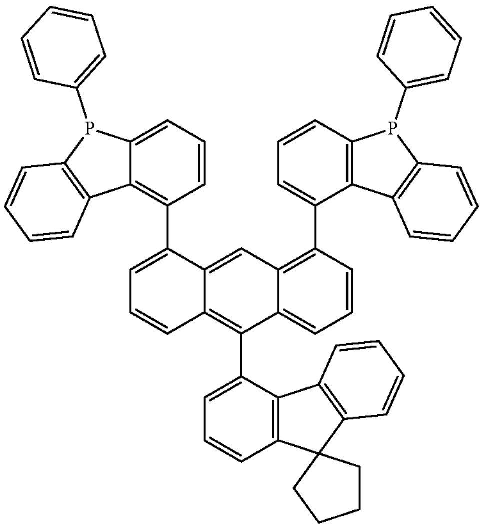
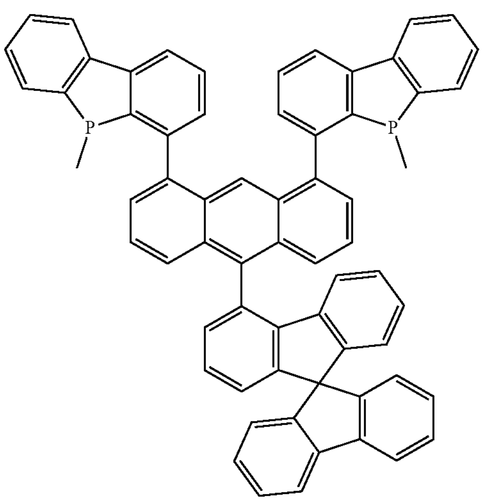
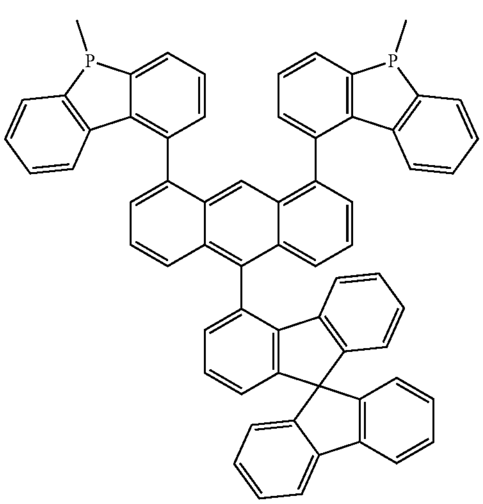
-continued
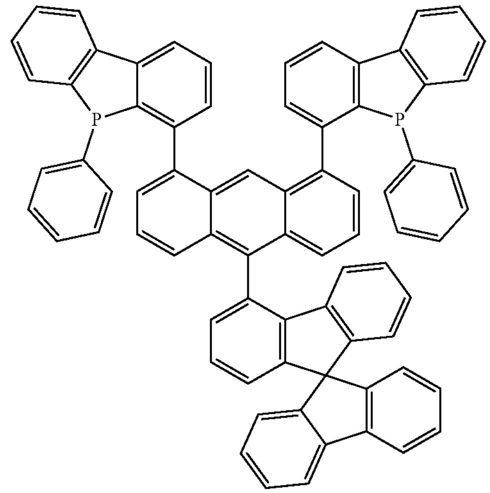
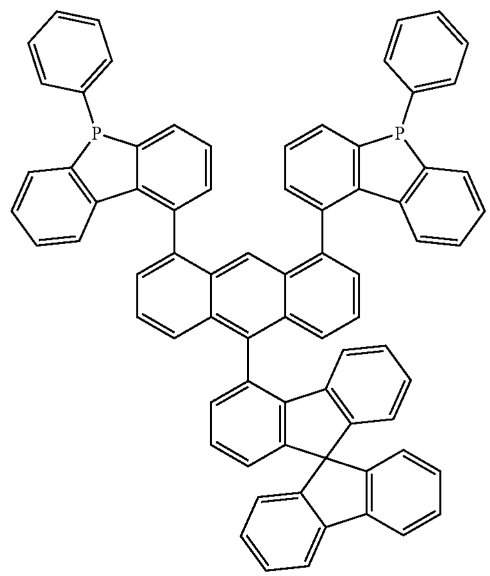
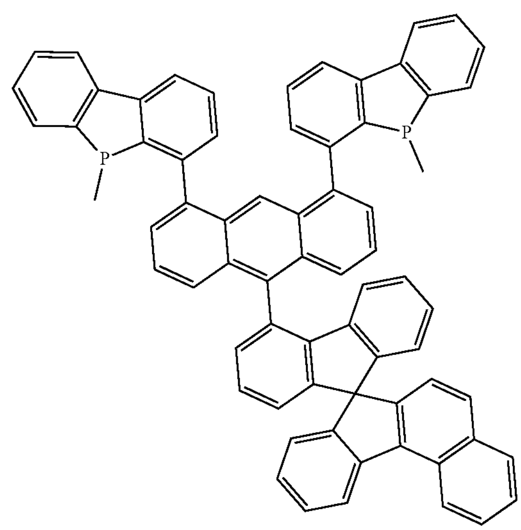

-continued
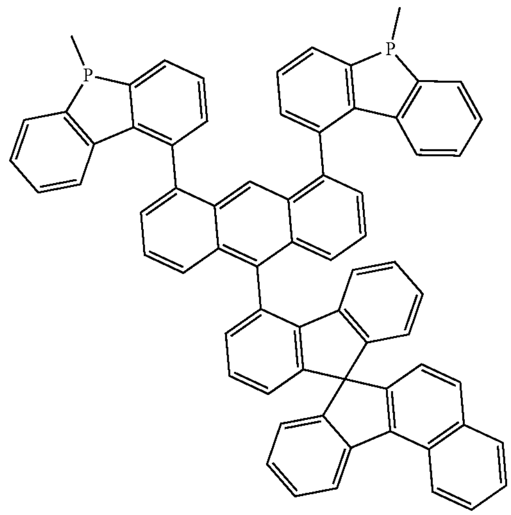
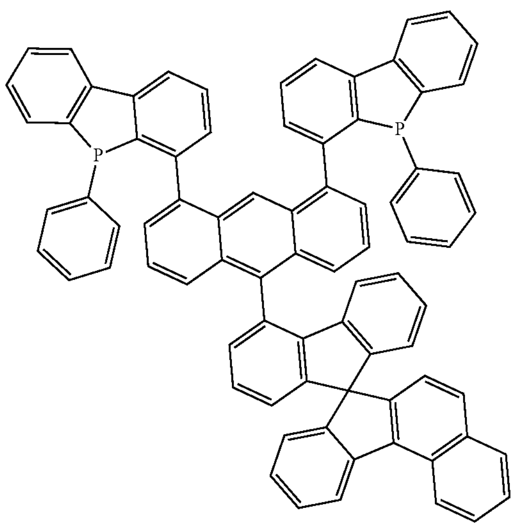
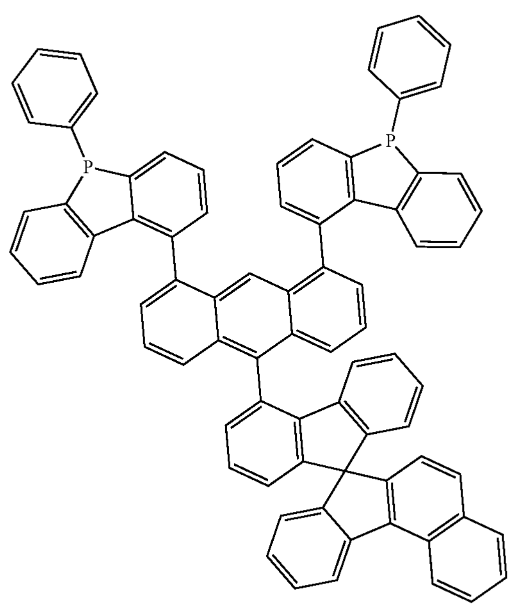
-continued
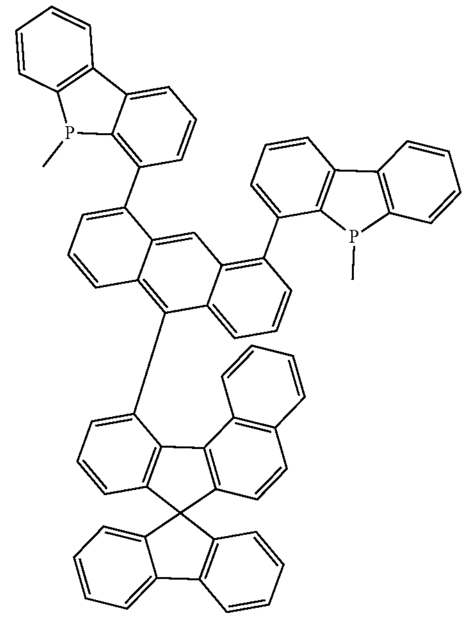
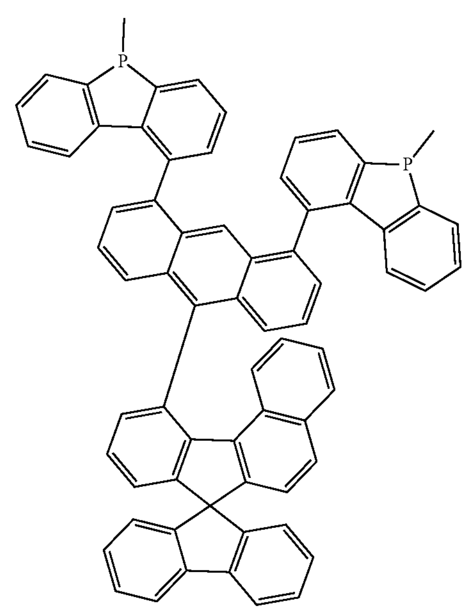

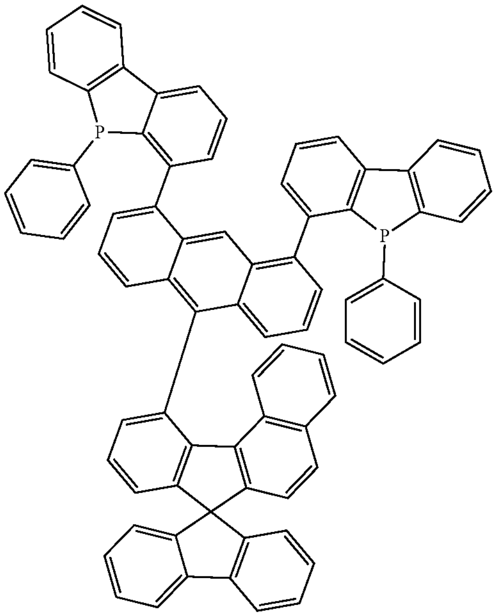
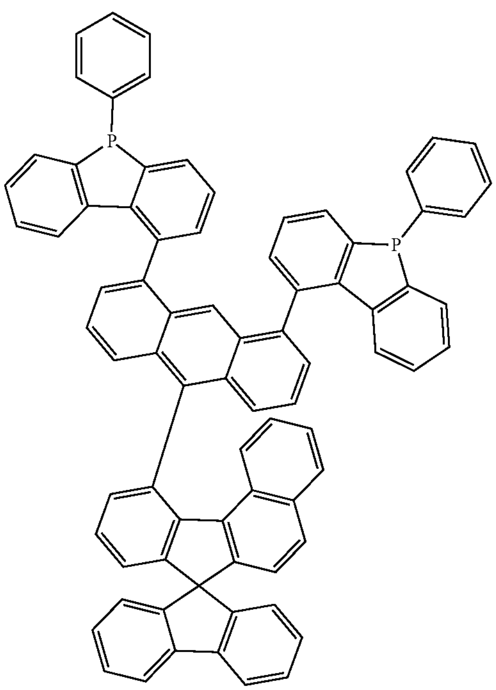
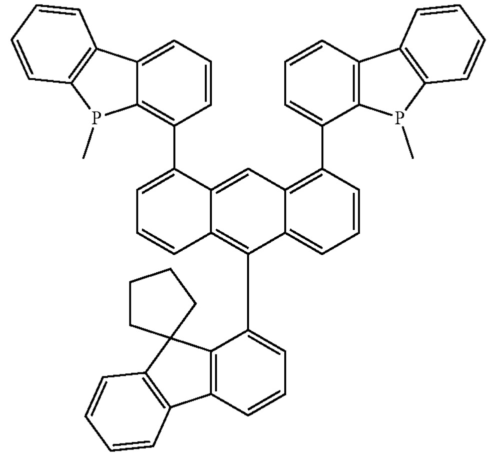
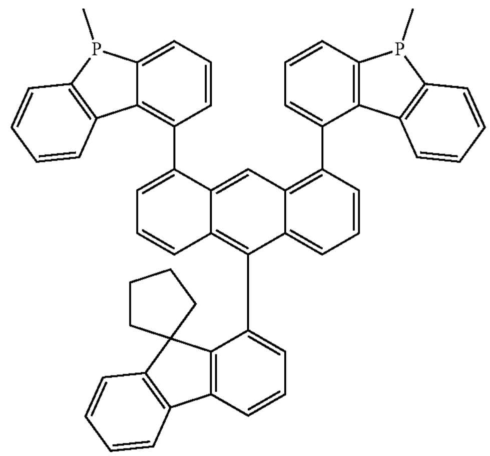
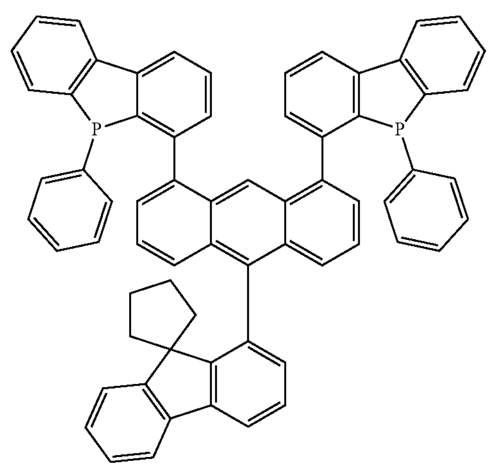

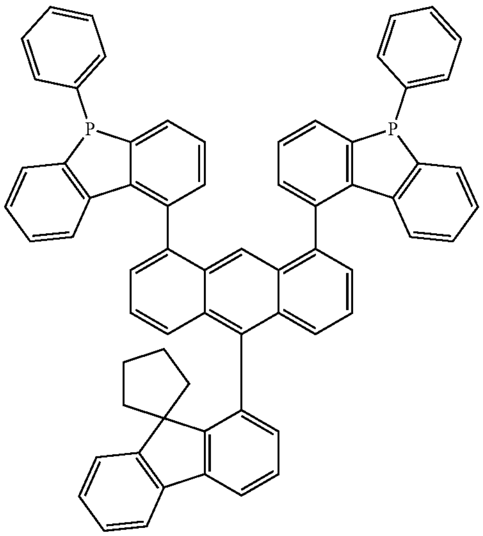
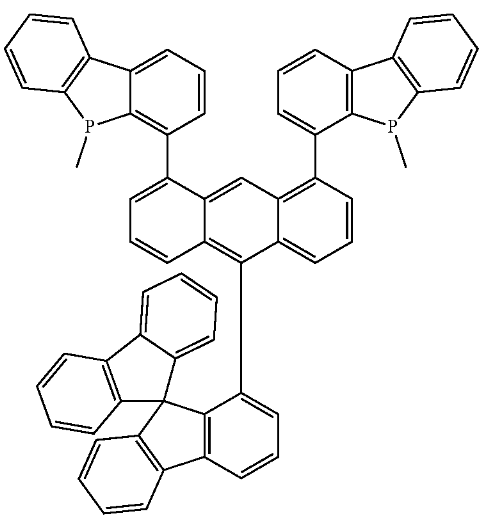
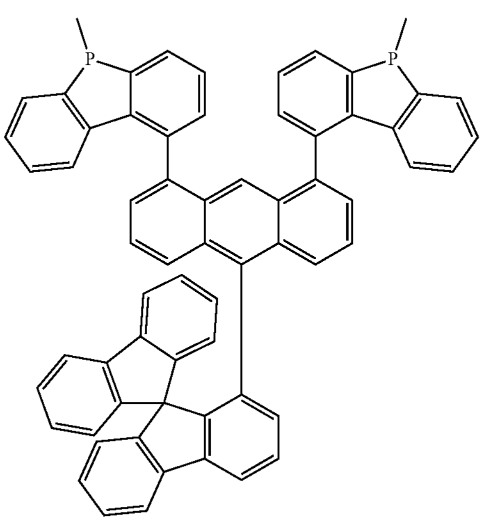
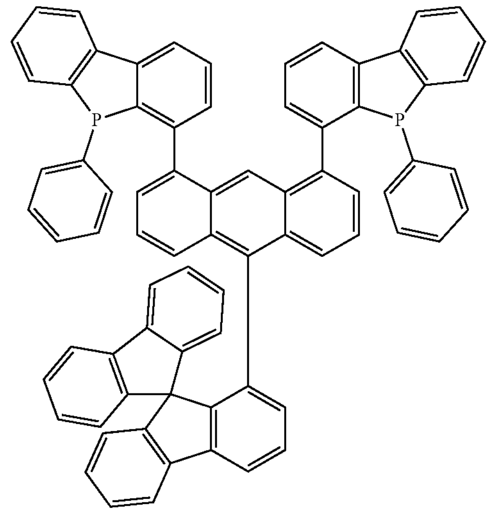
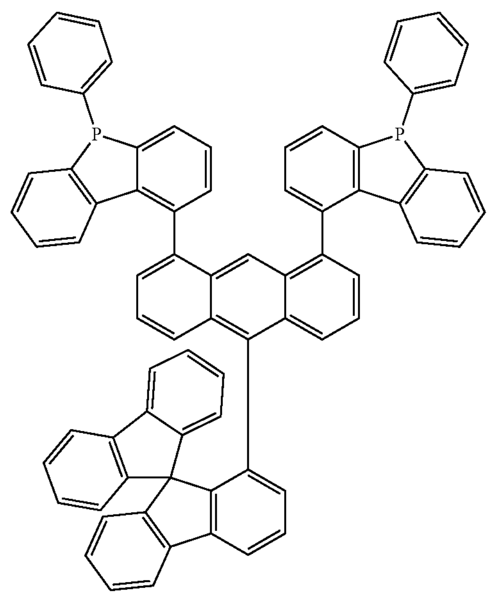
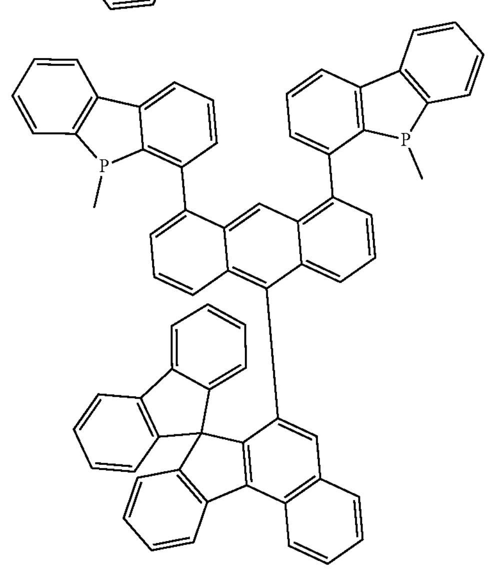

-continued
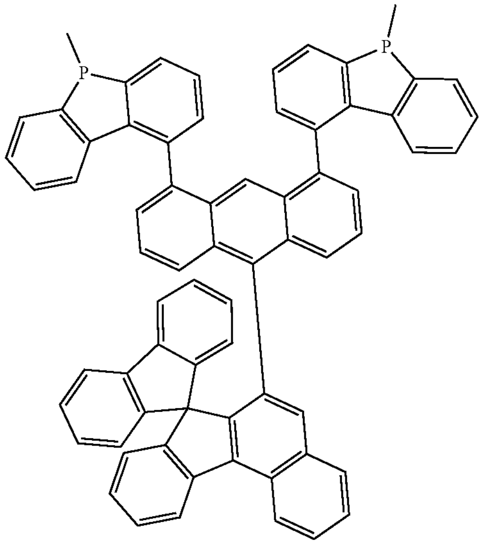
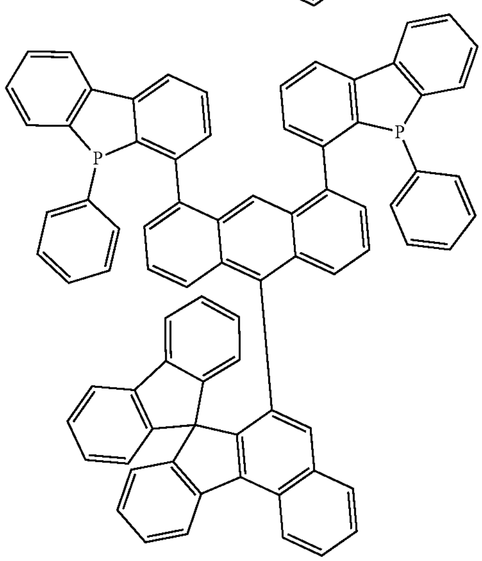
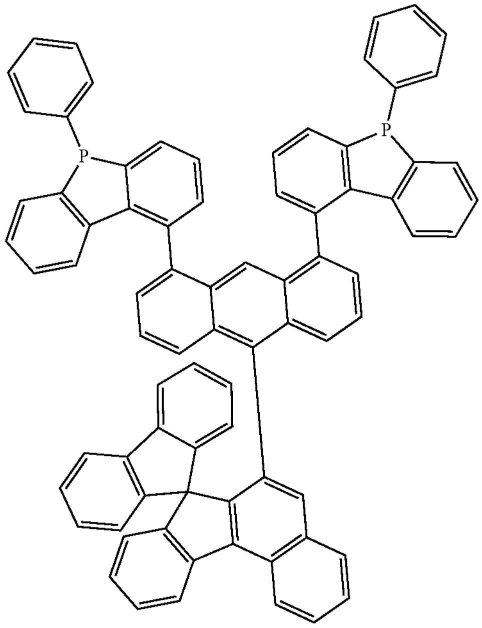
-continued
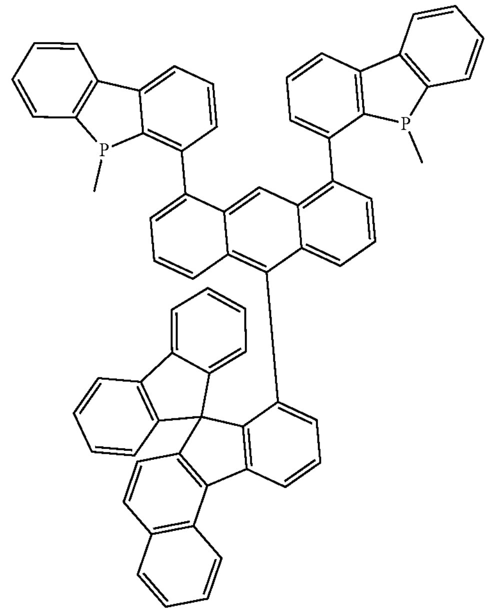
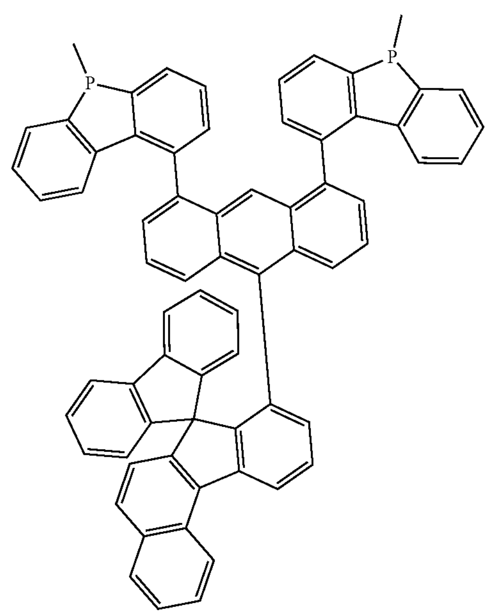

-continued
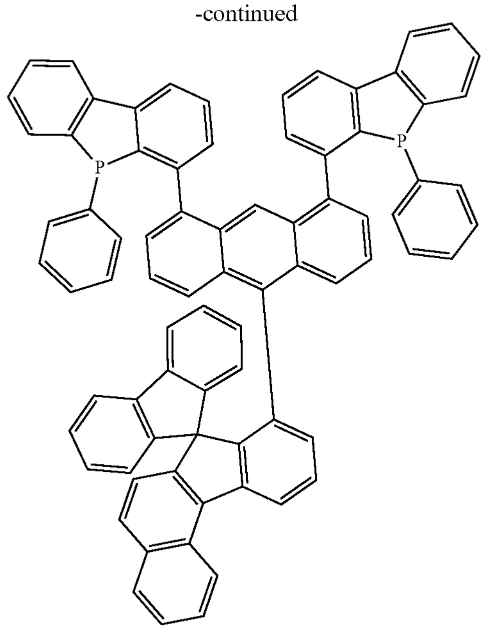
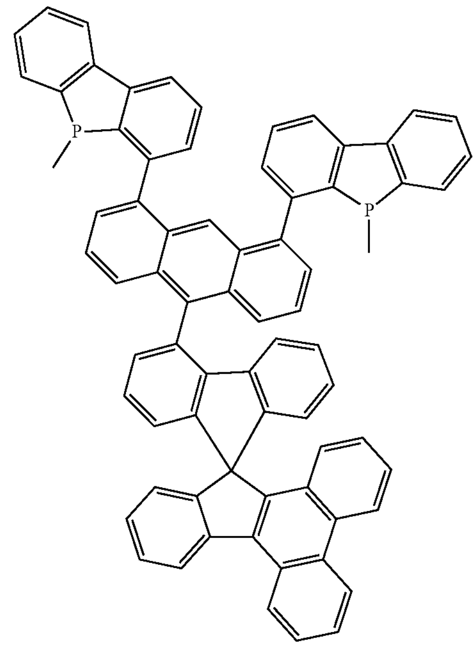
-continued
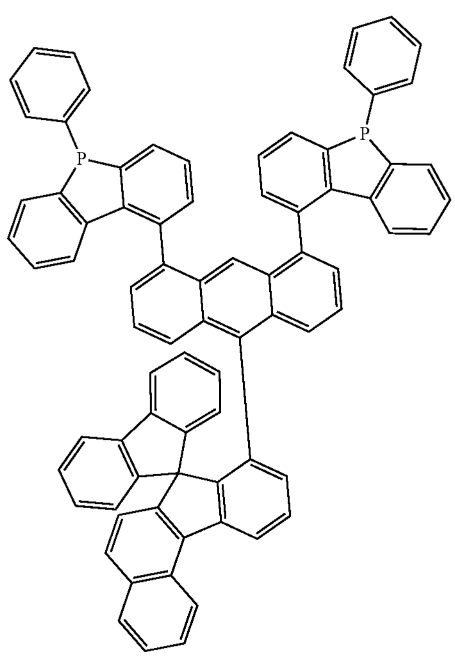
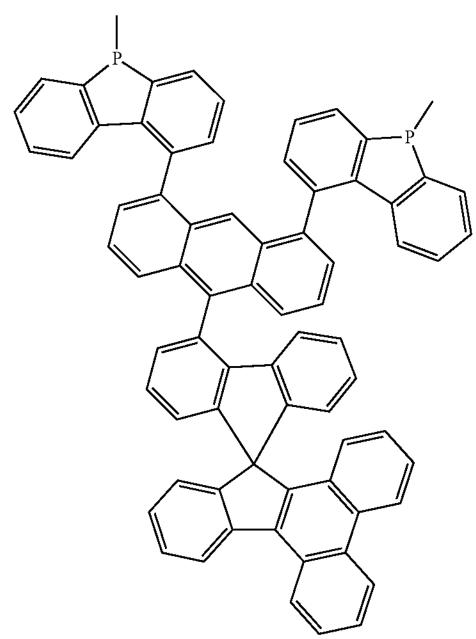

-continued
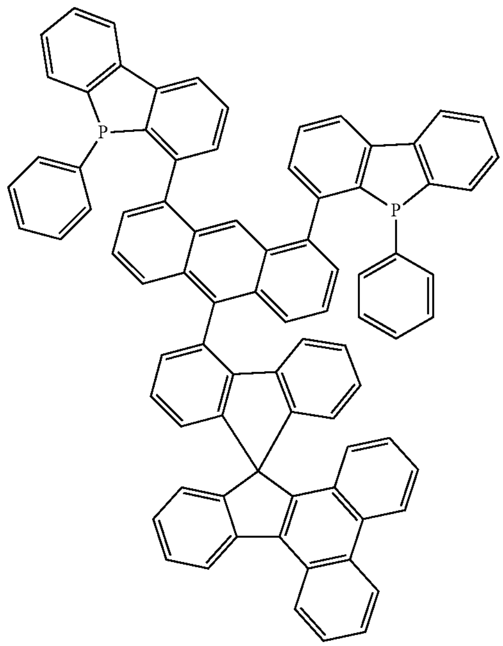
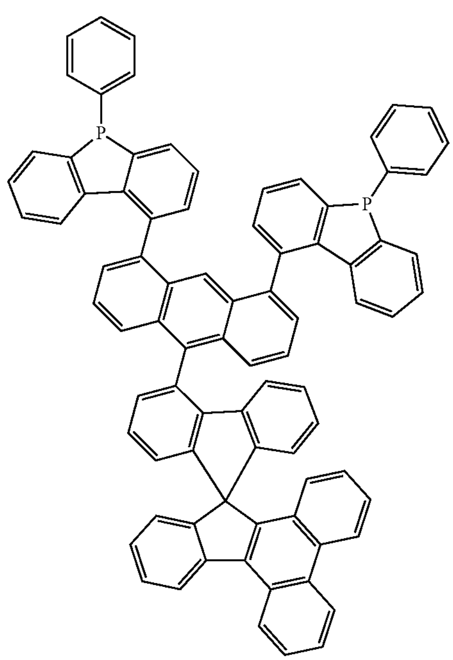
-continued
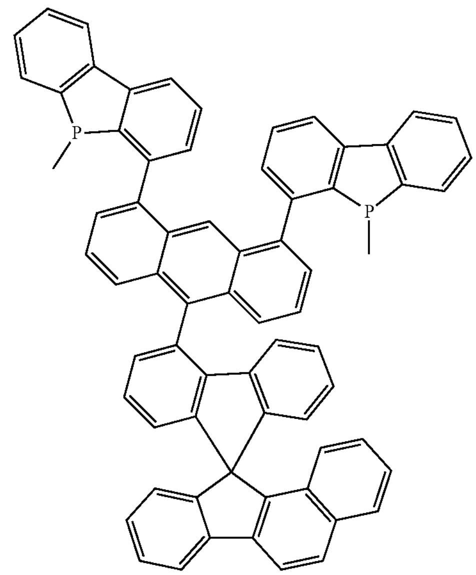
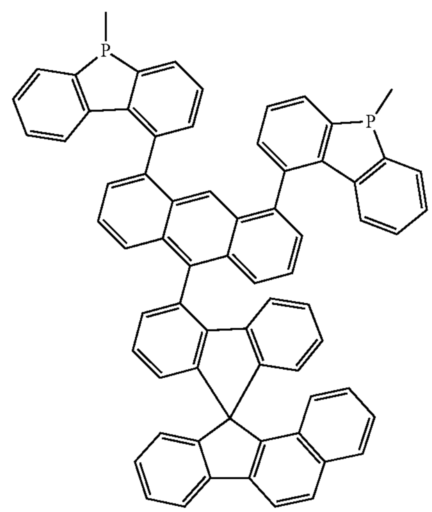
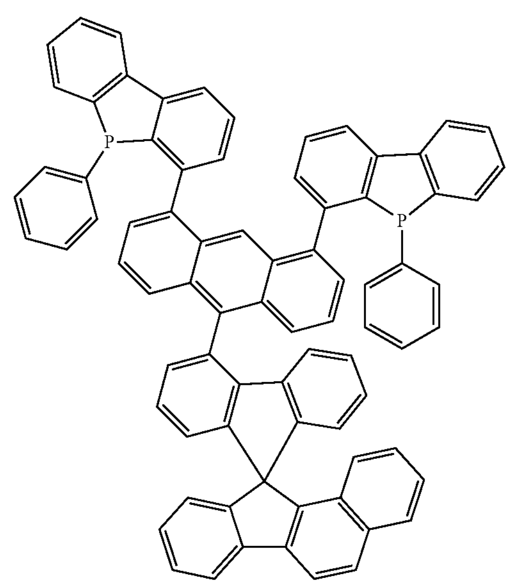

-continued
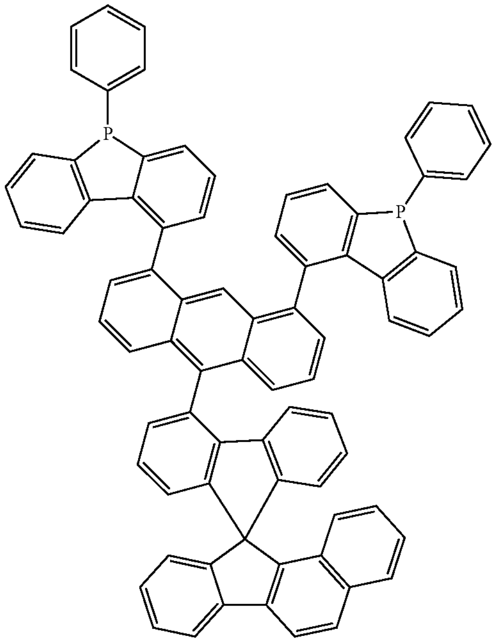
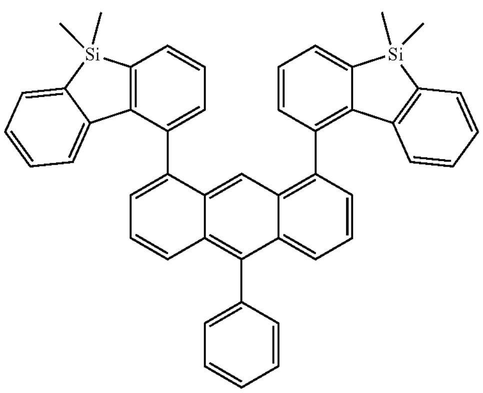
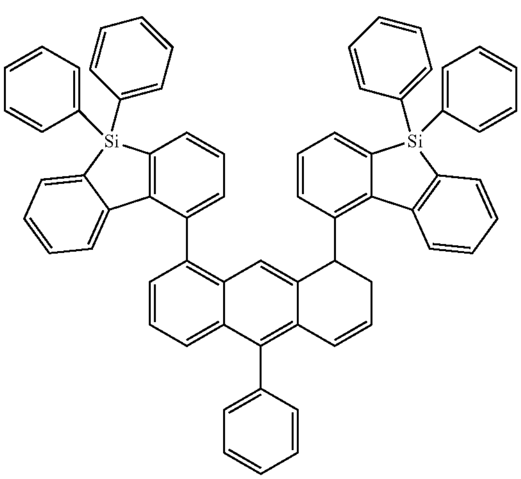
-continued
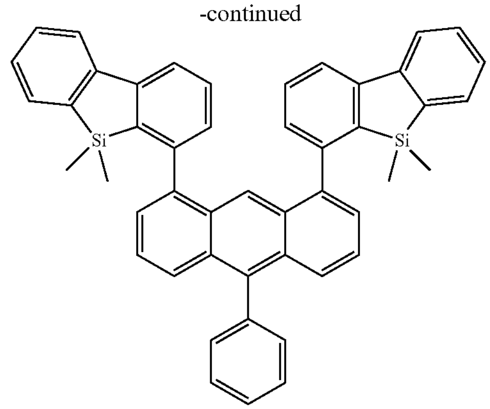
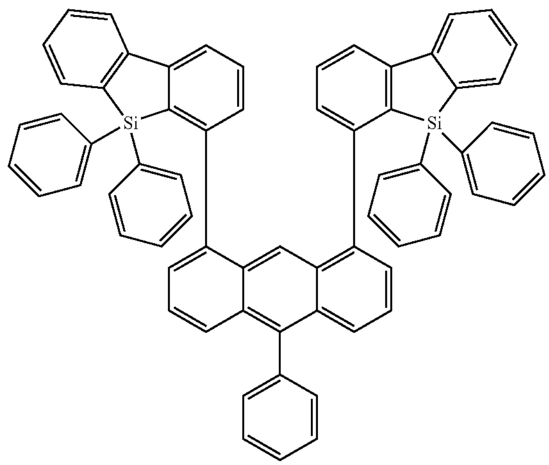
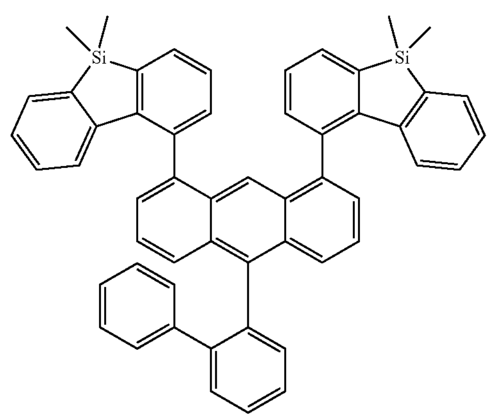

-continued
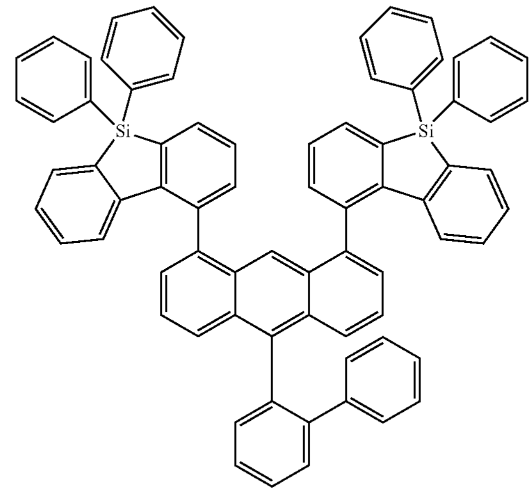
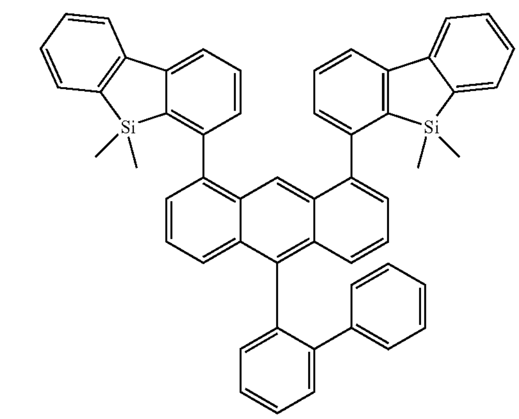
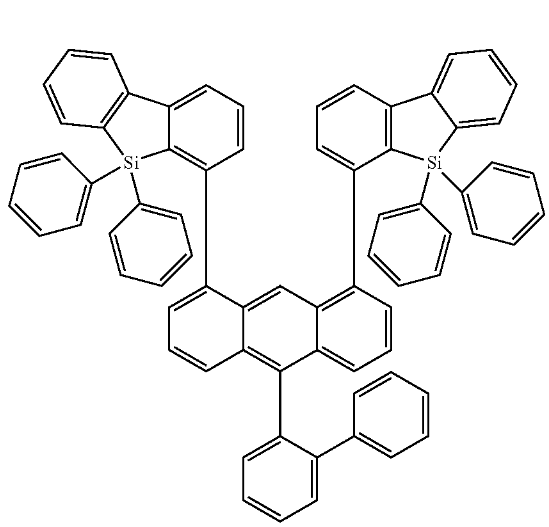
-continued
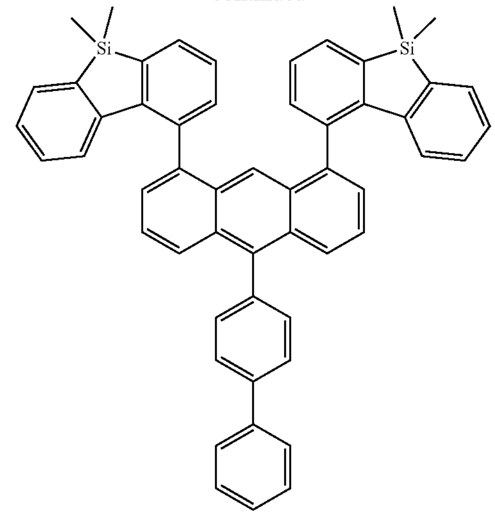
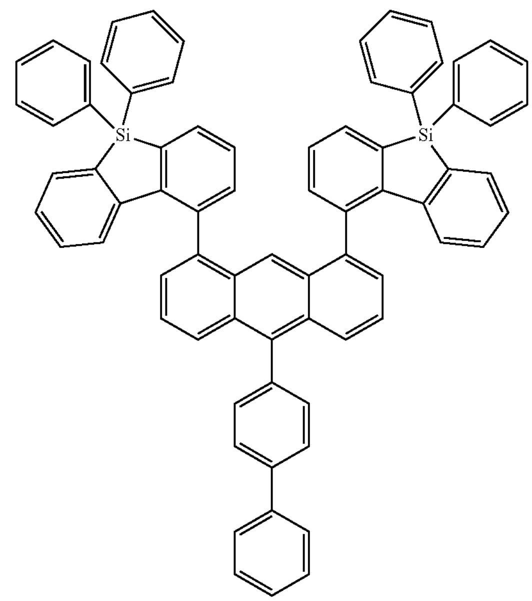
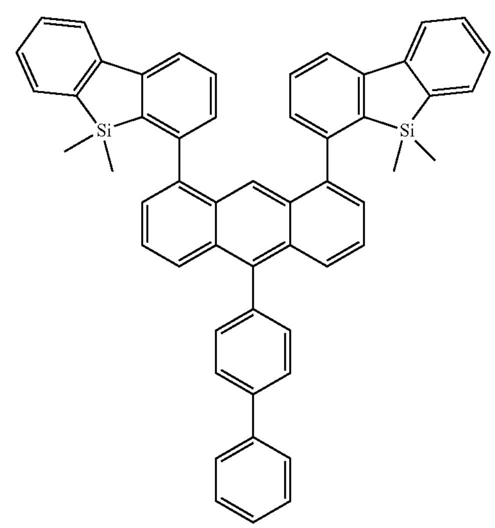

-continued
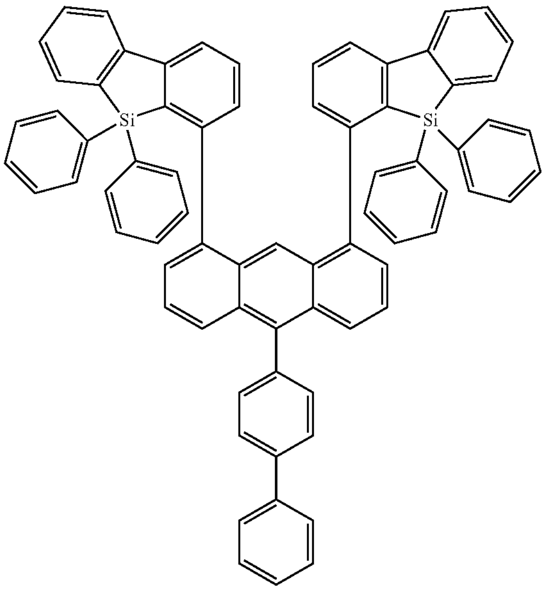
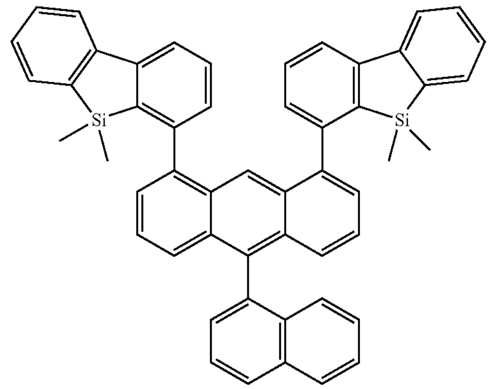
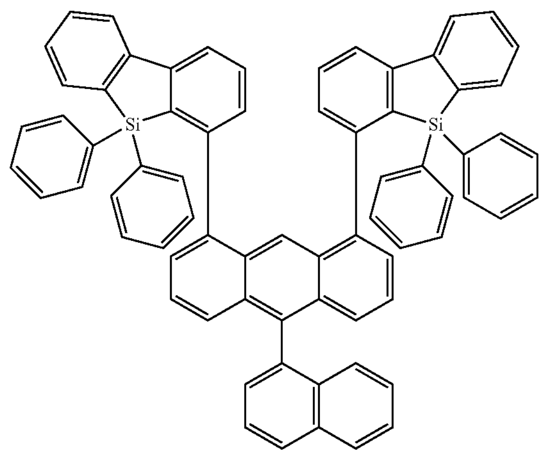
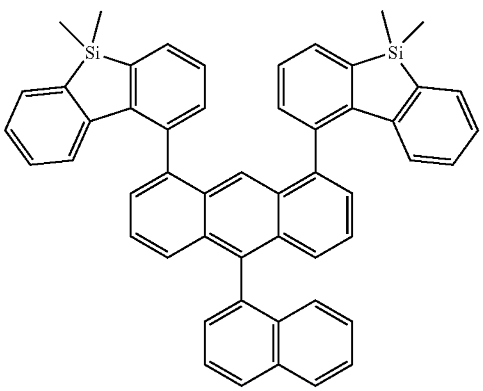
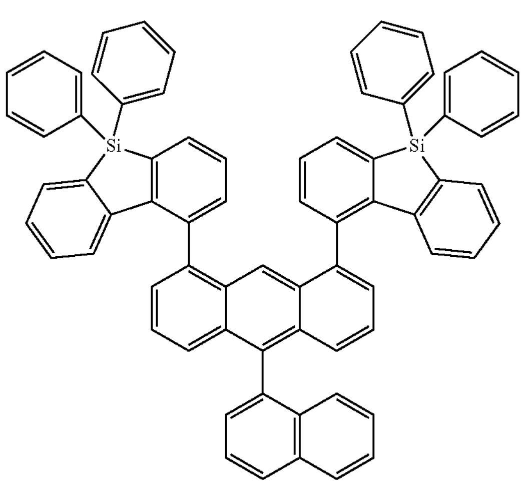
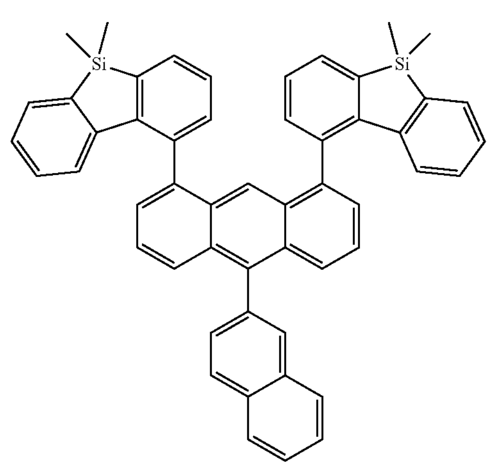
-continued -continued
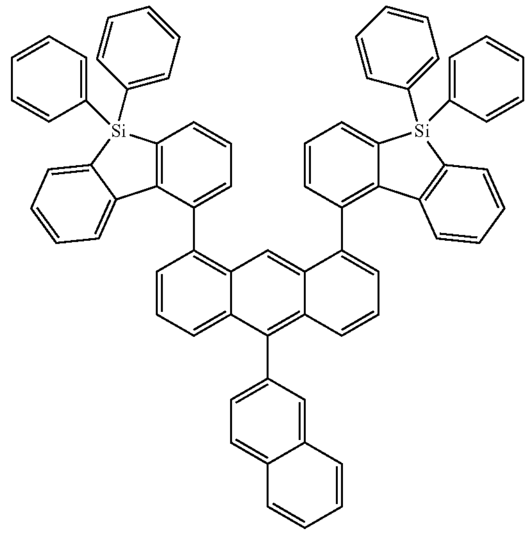
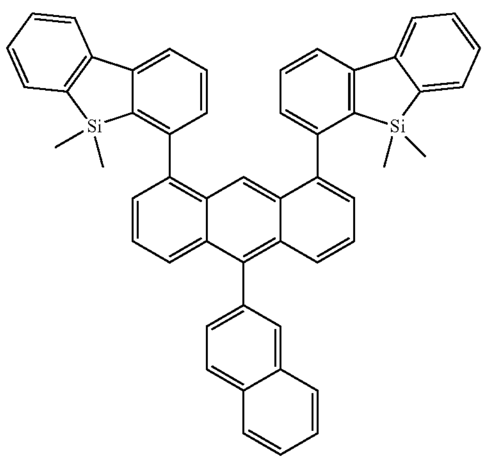
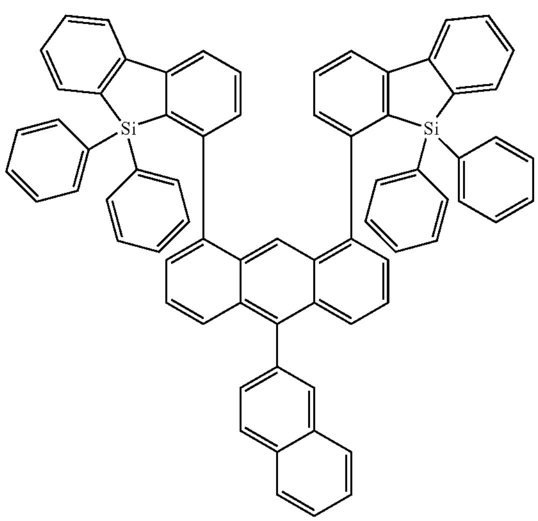
-continued
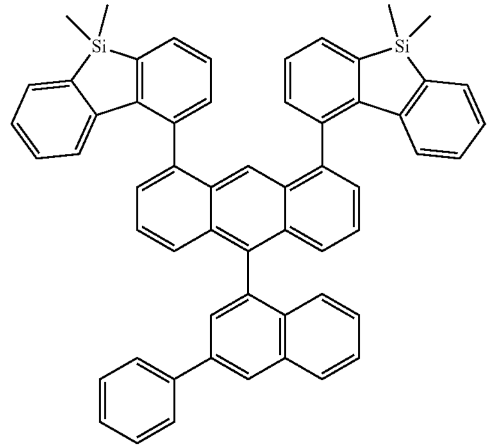
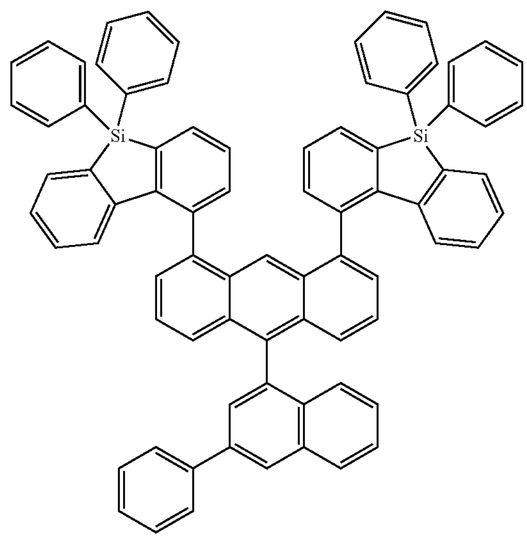
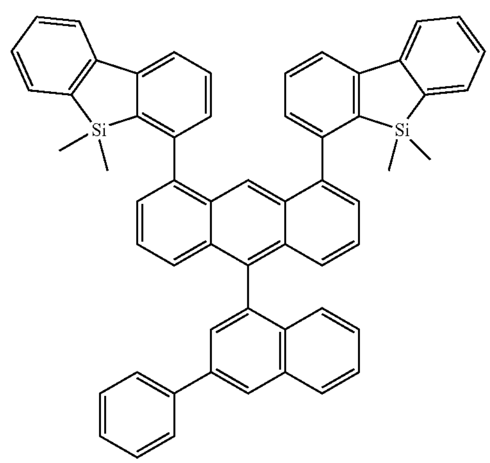

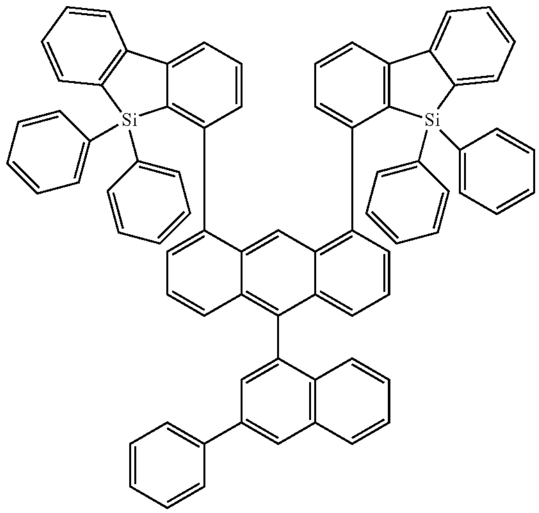
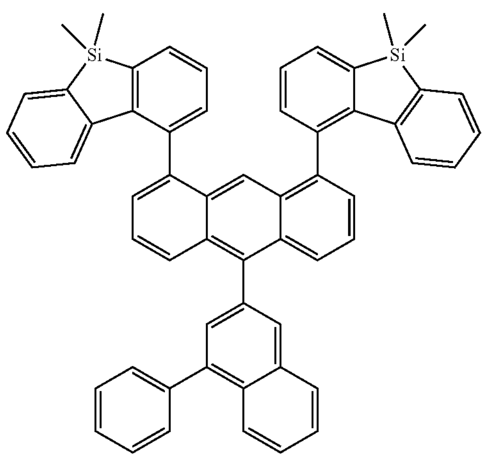
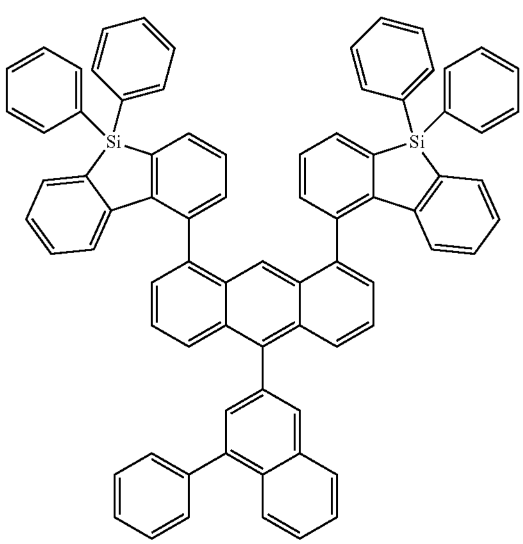
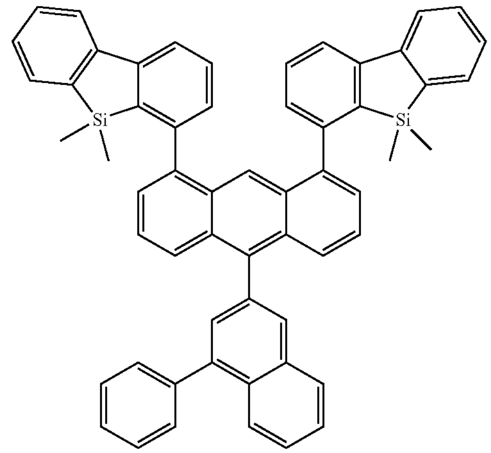
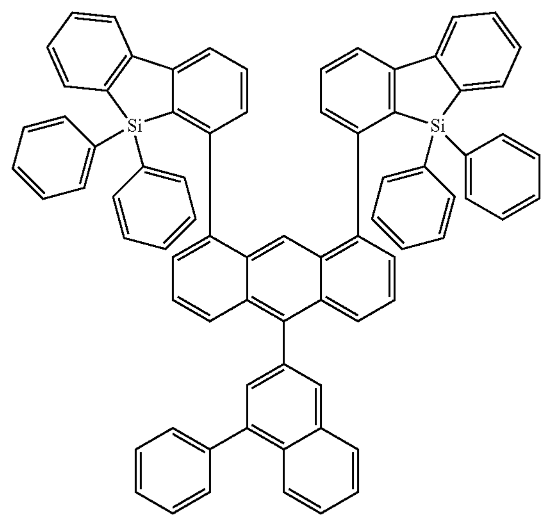
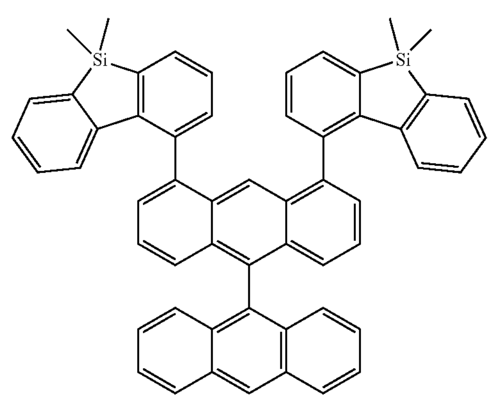

-continued
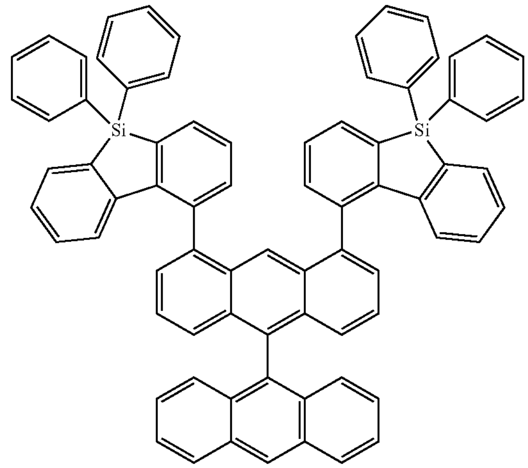
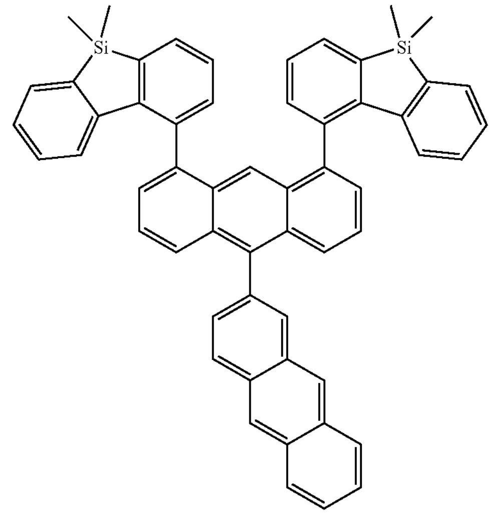
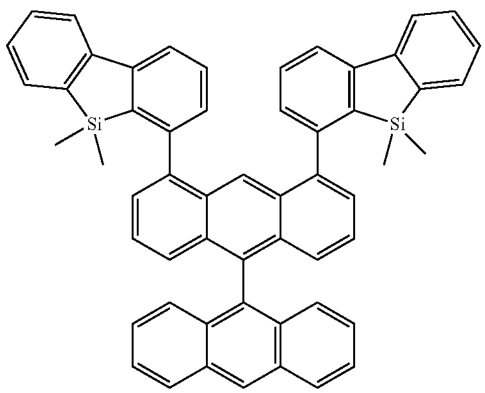
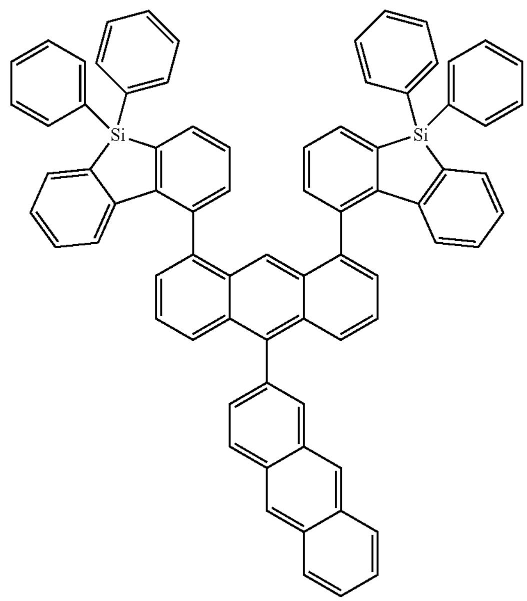
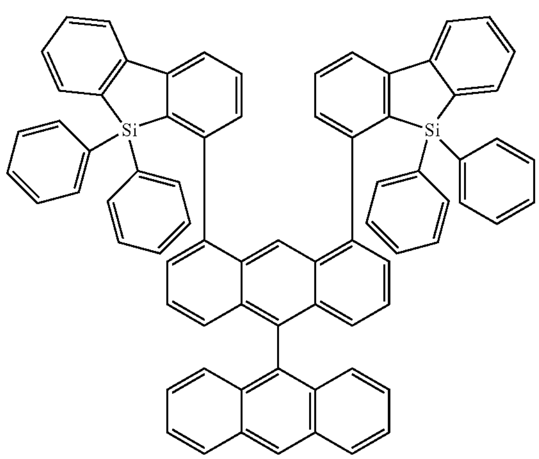
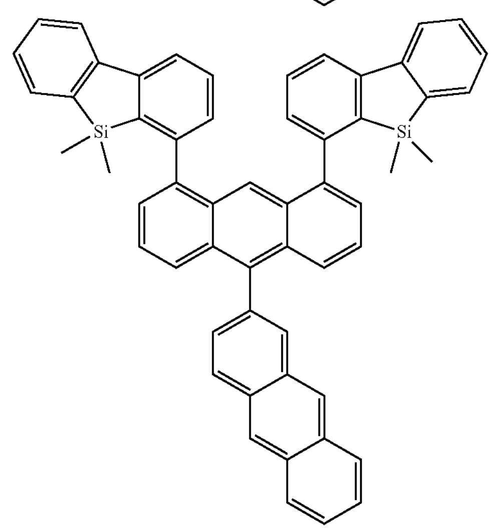

-continued
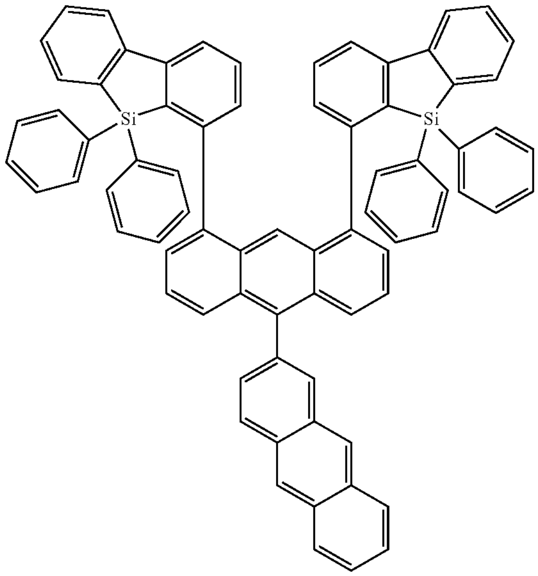
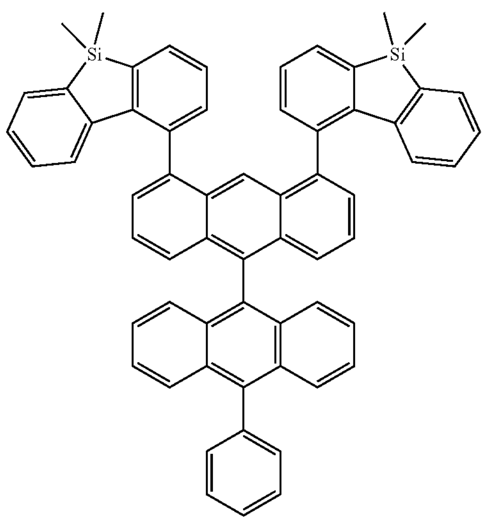
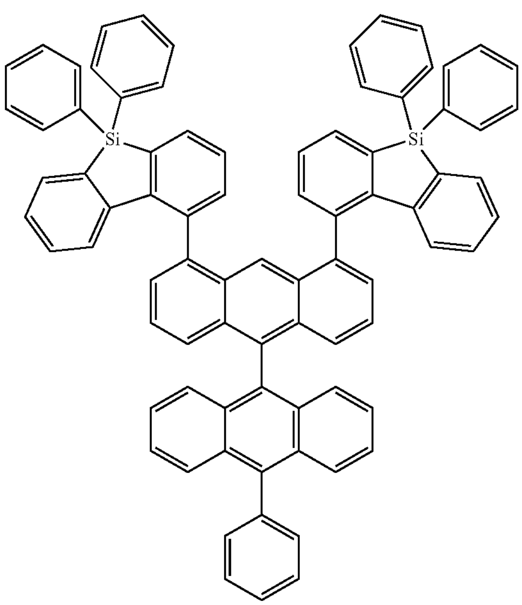
-continued
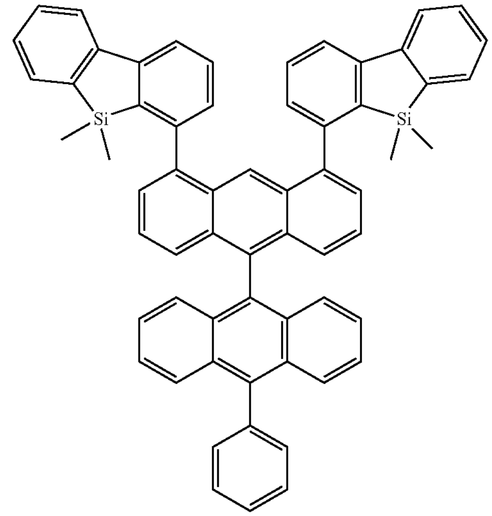
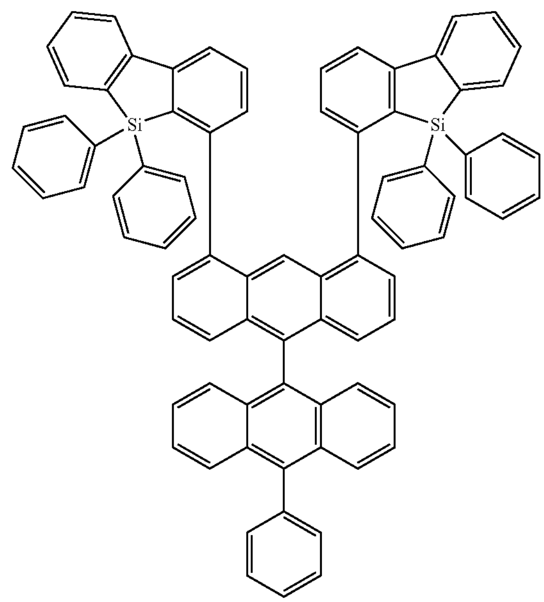
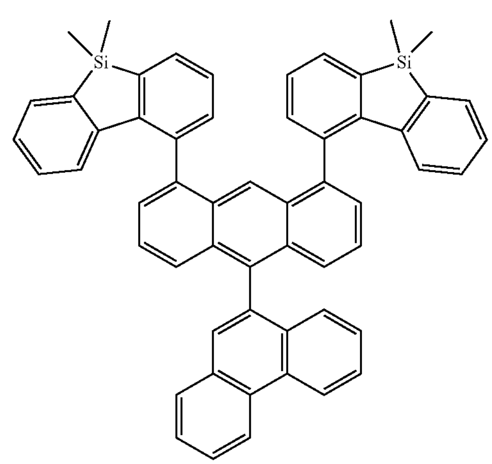

-continued
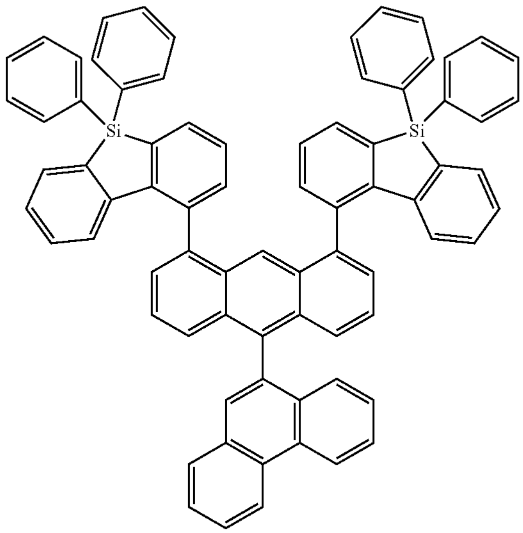
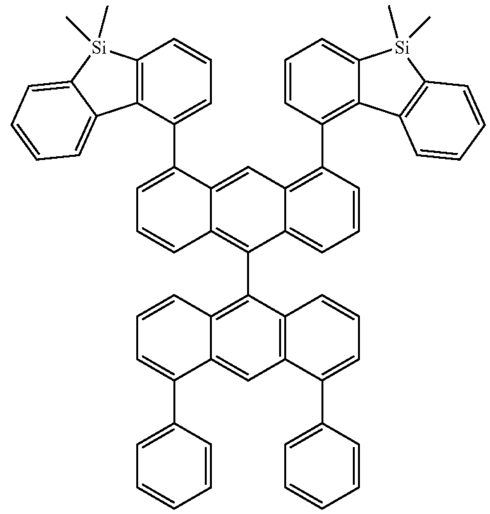
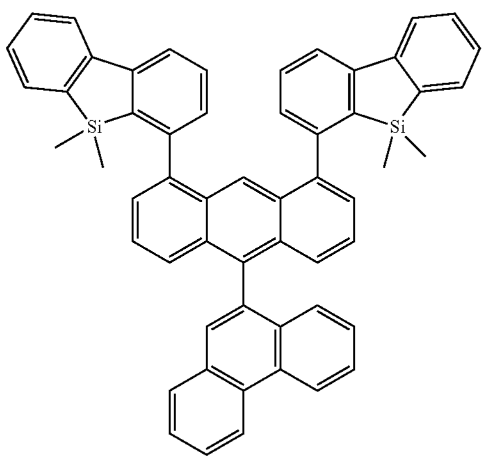
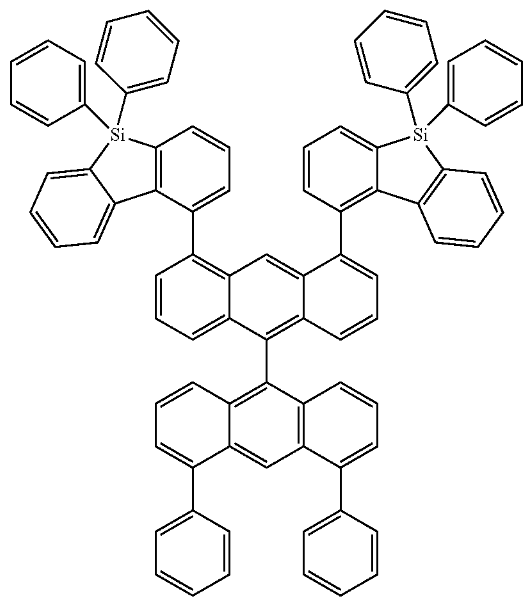
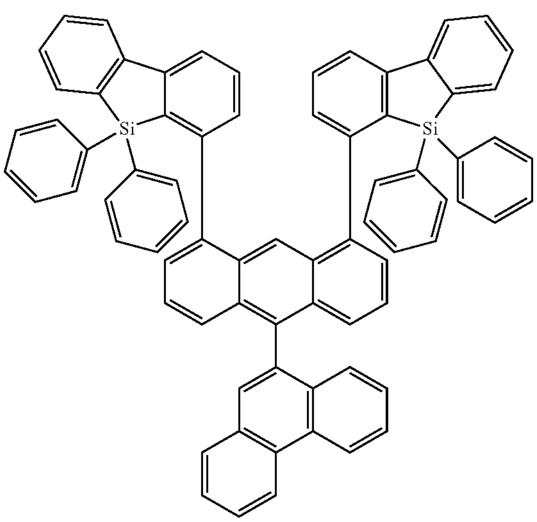
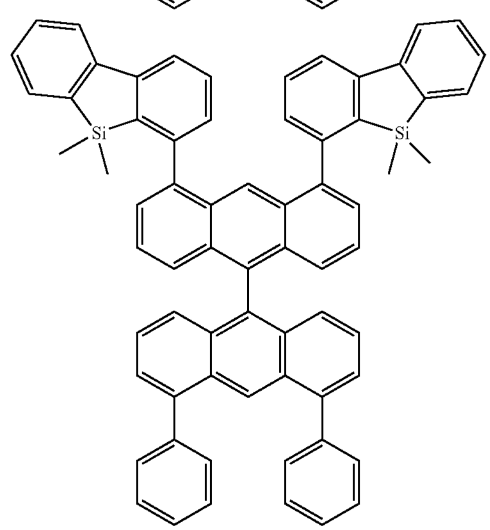

-continued
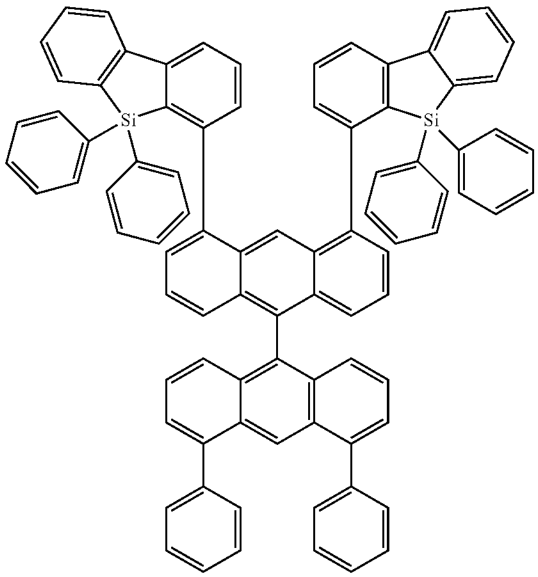
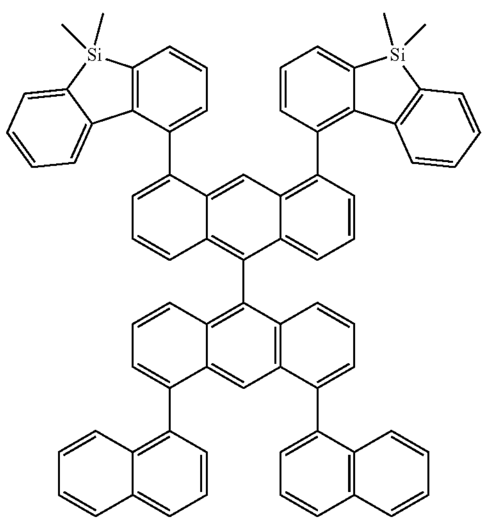
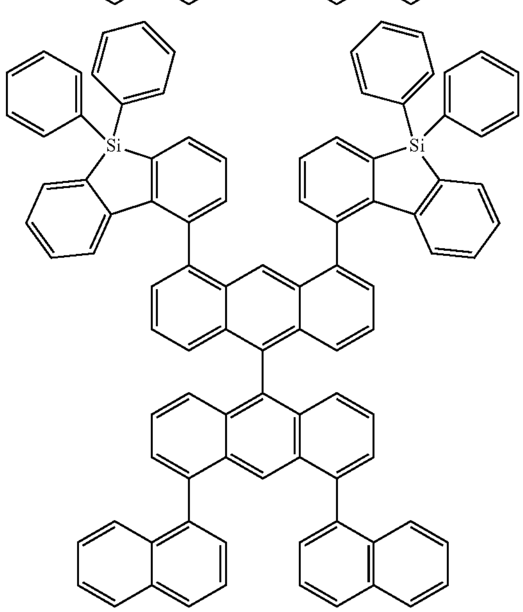
-continued
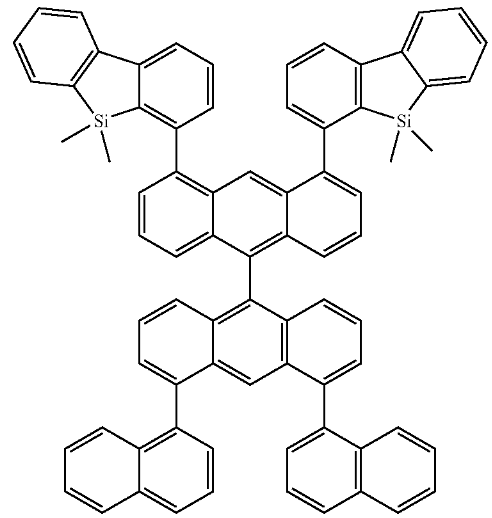
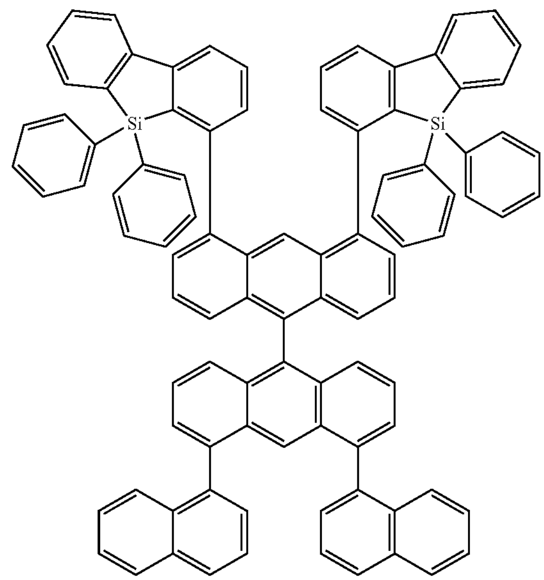
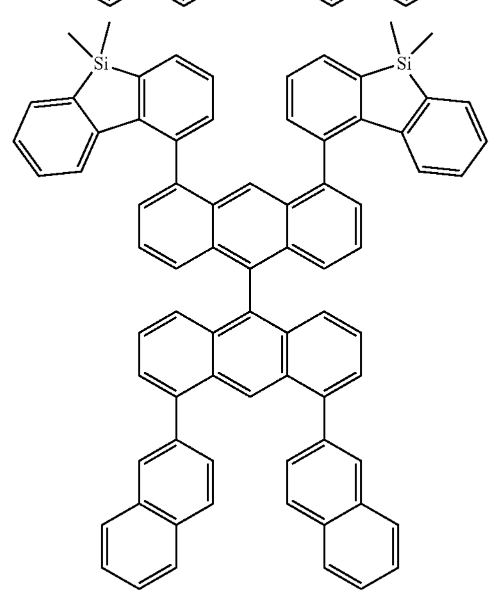

-continued
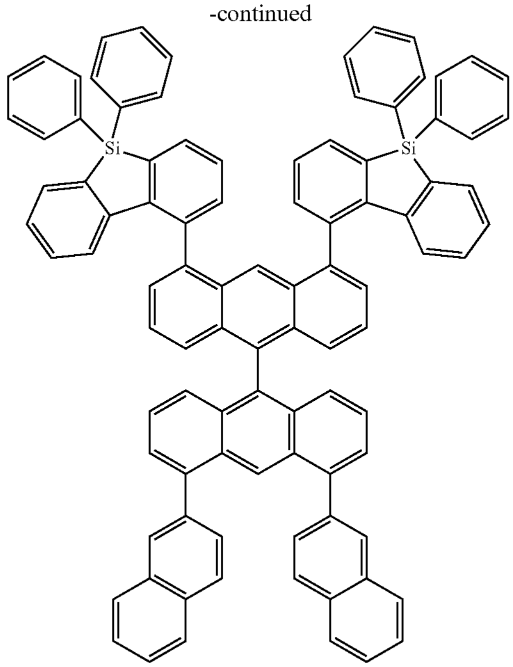
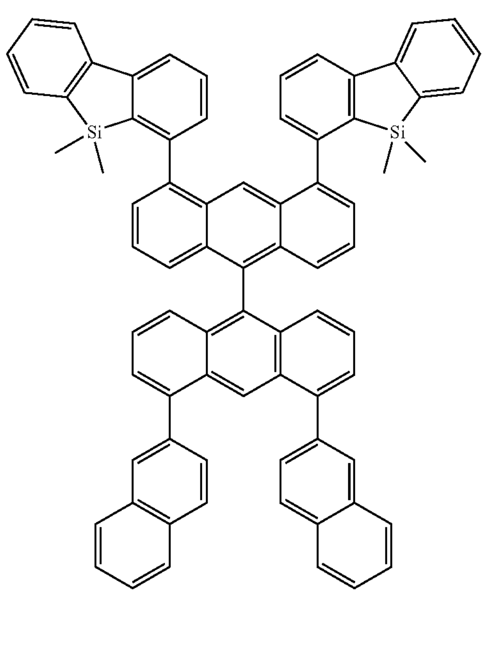
-continued
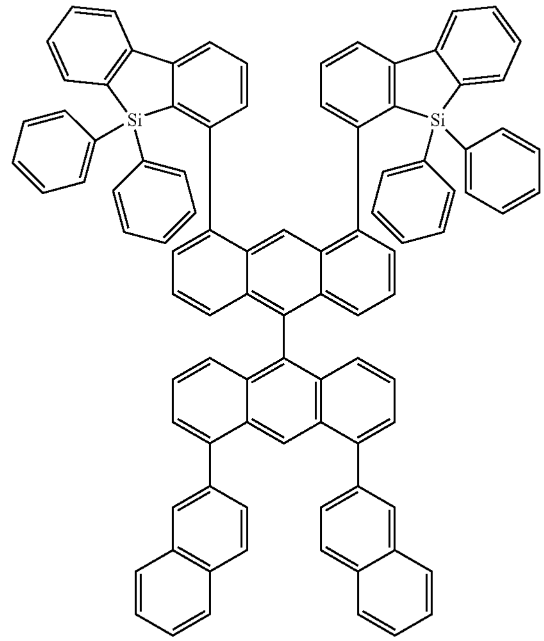
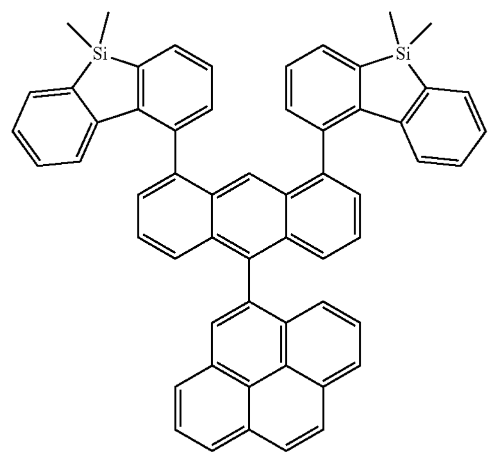
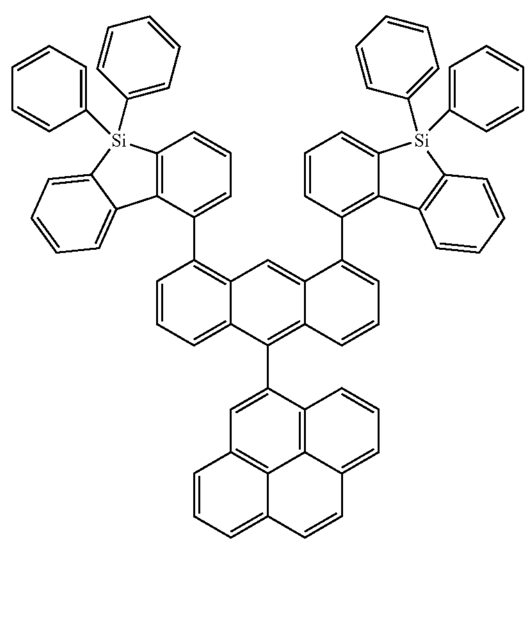

-continued
-continued
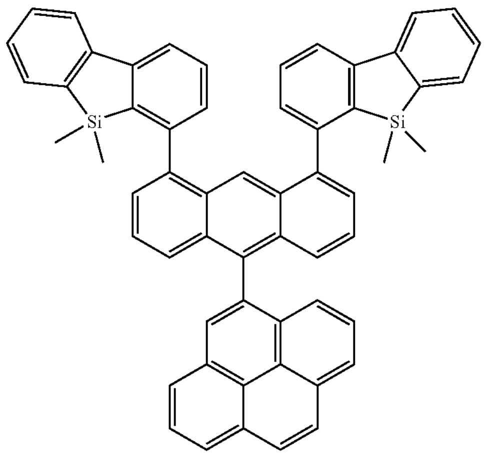
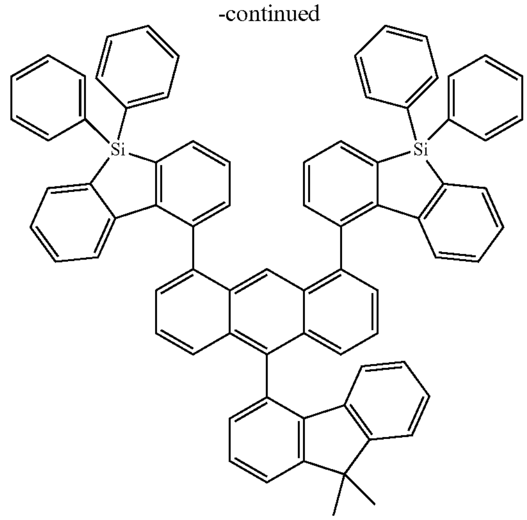
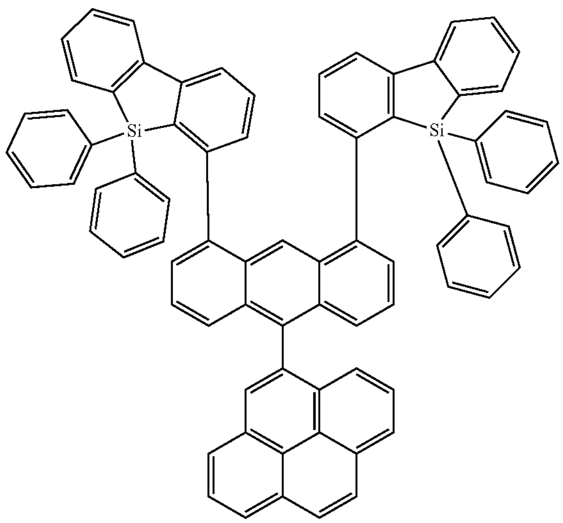
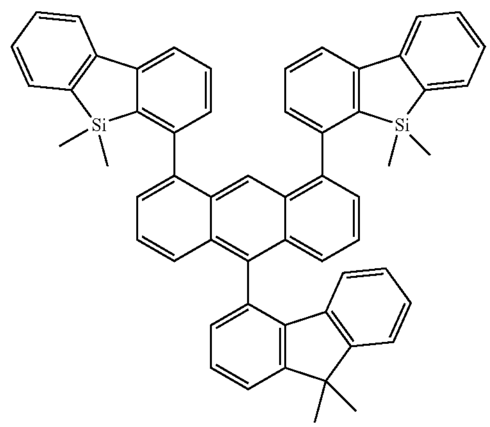
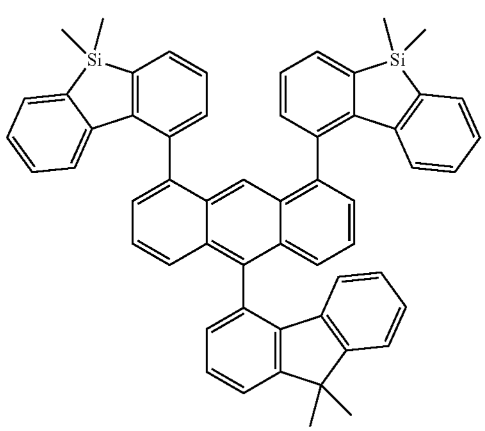
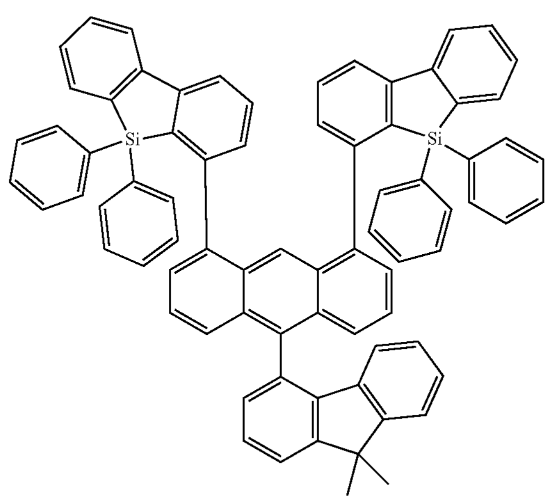

-continued
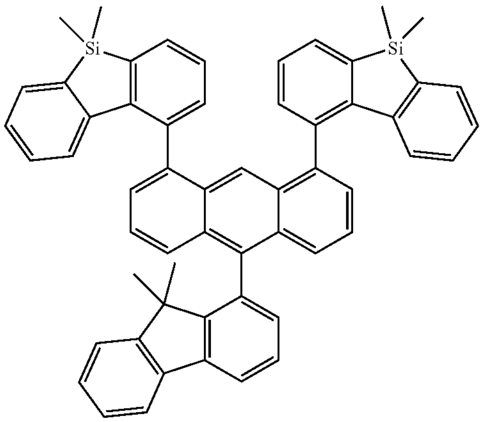
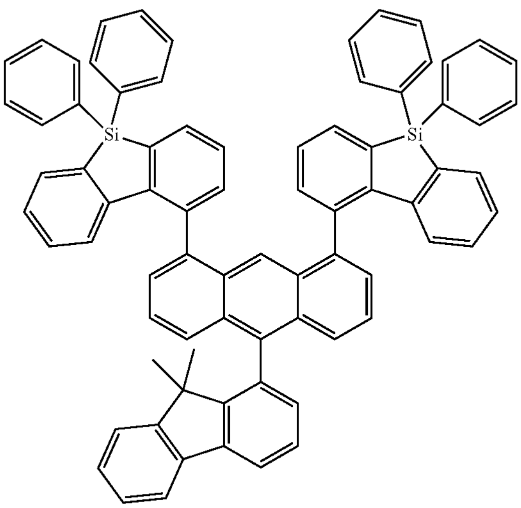
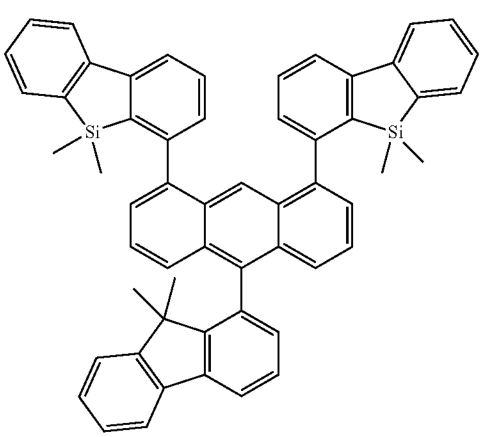
-continued
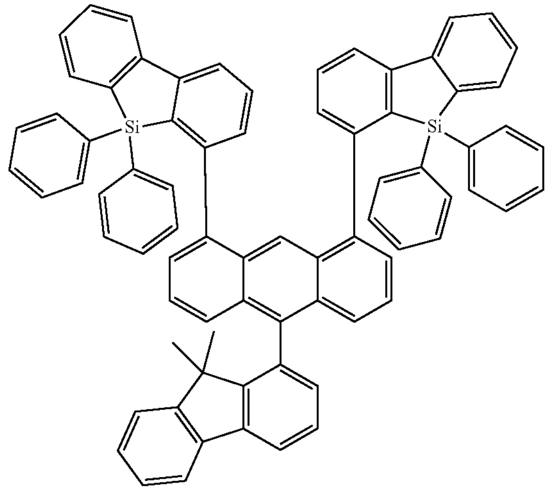
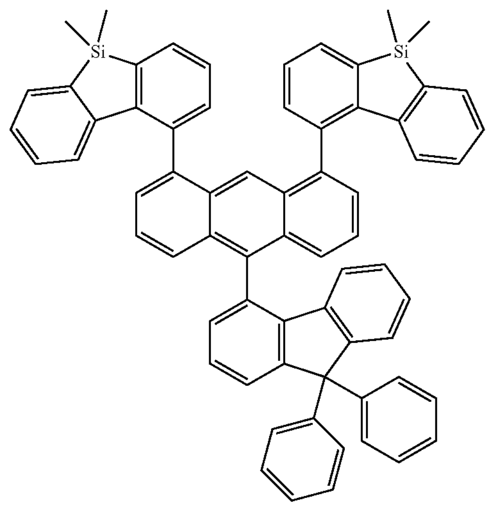
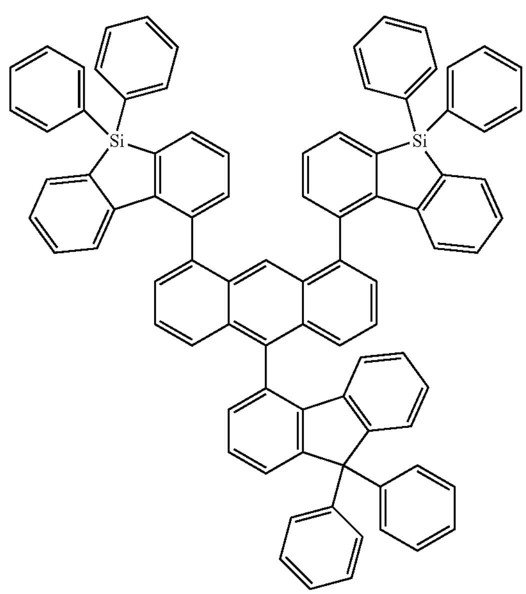

-continued
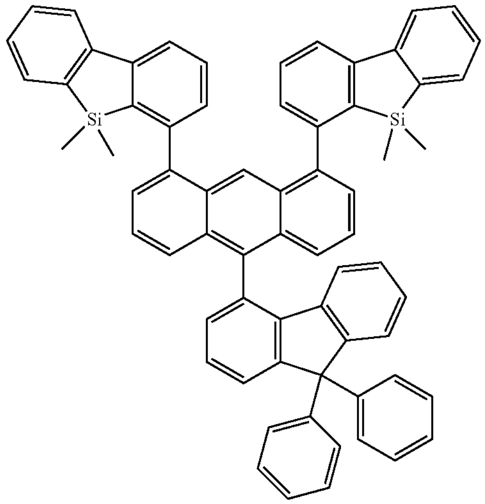
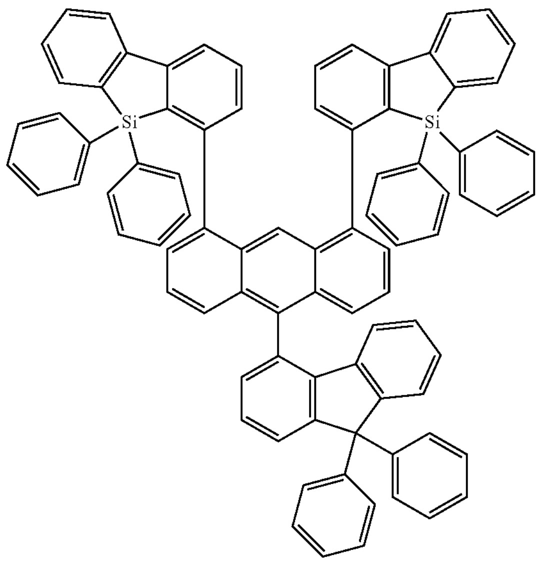
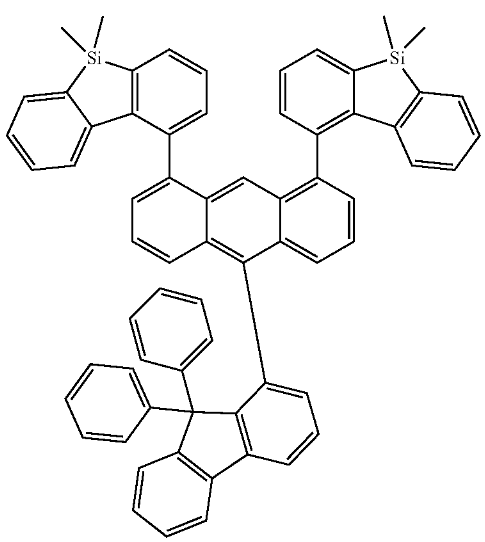
-continued
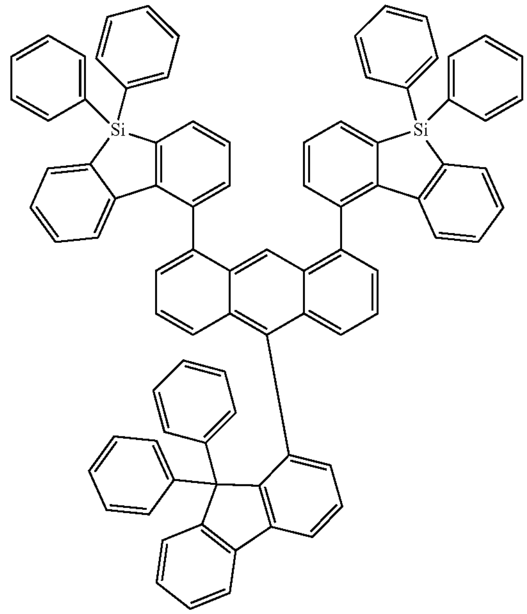
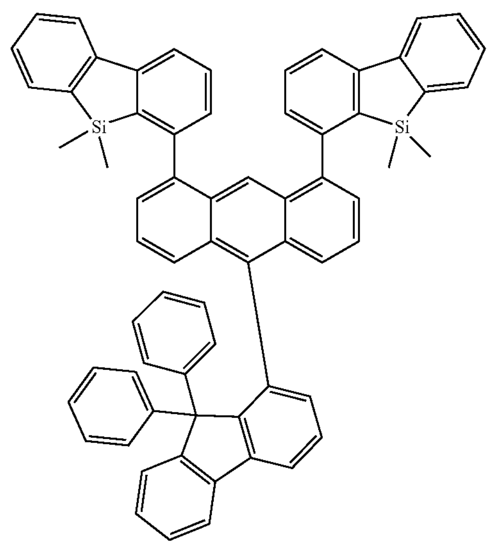

-continued
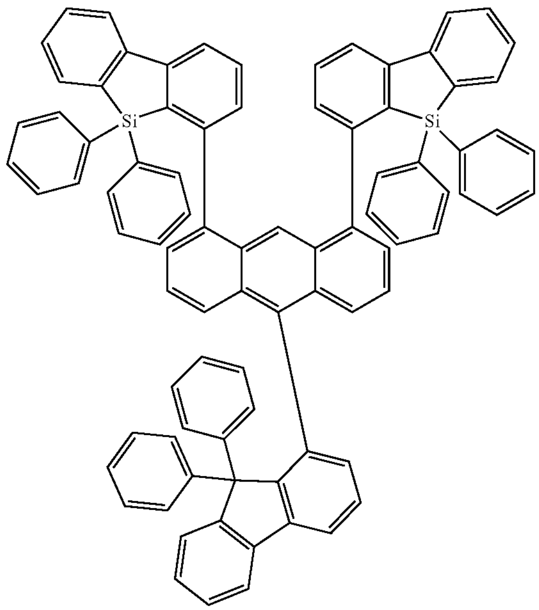
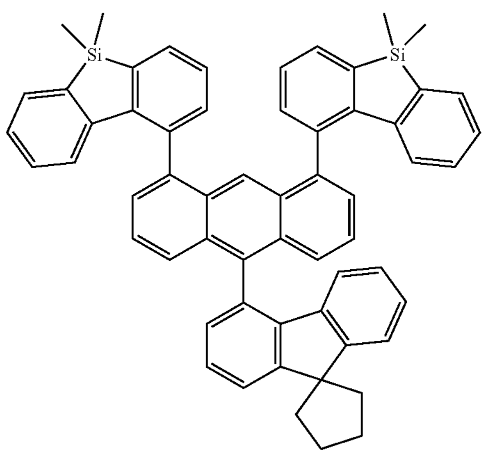
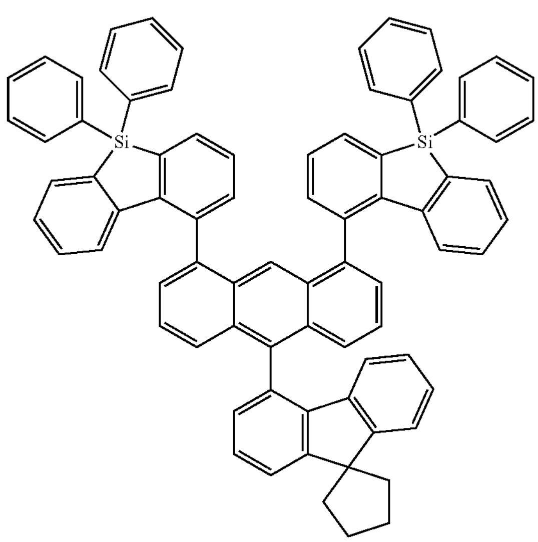
-continued
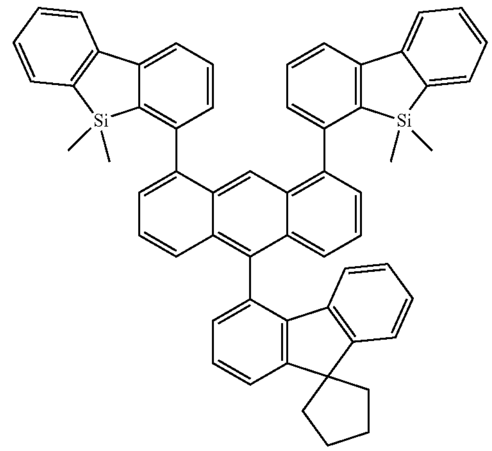
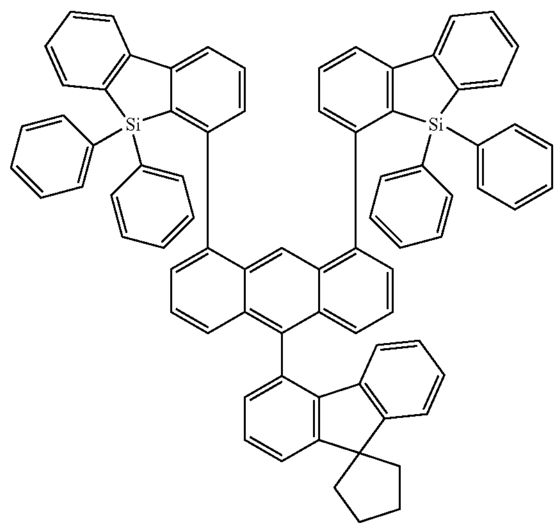
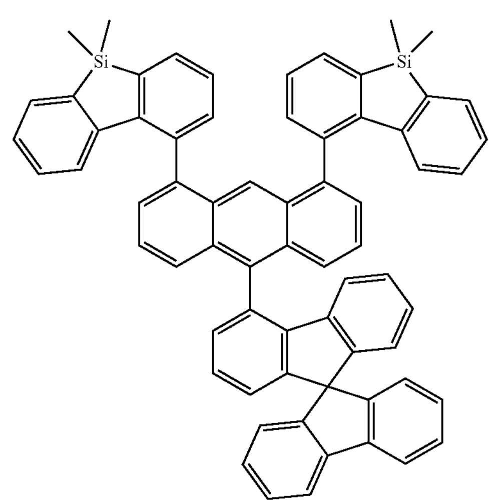

-continued
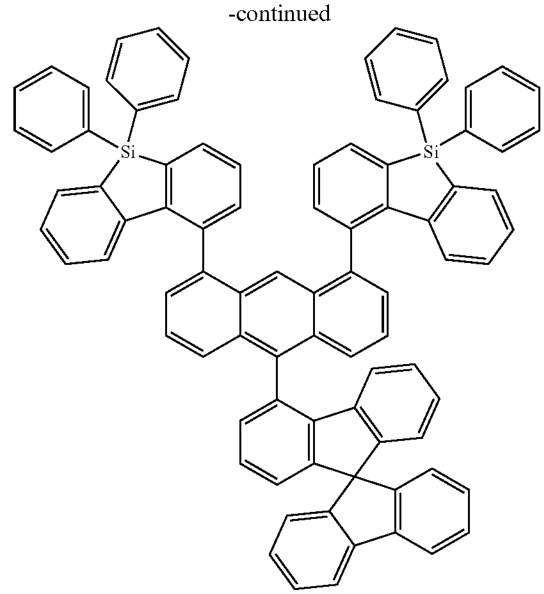
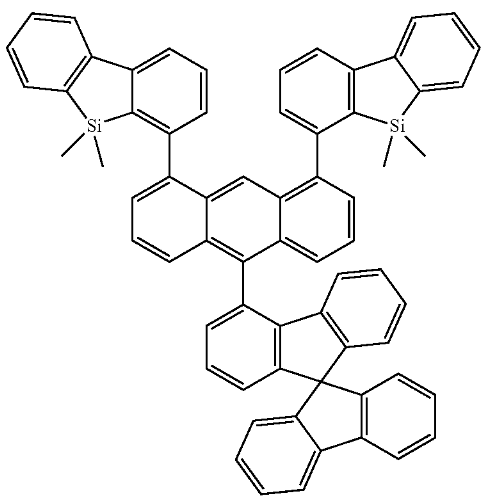
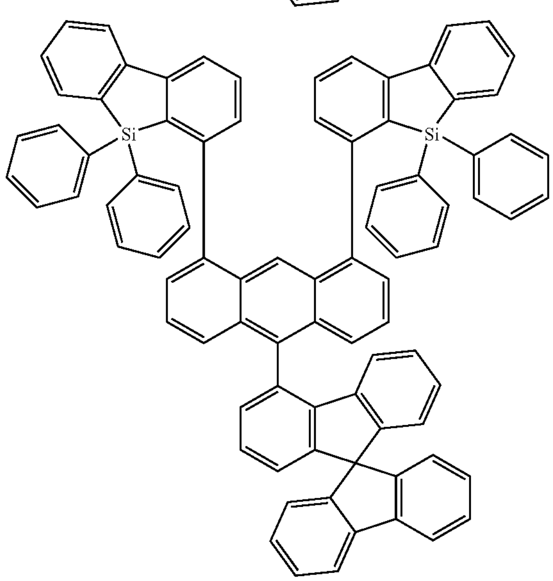
-continued
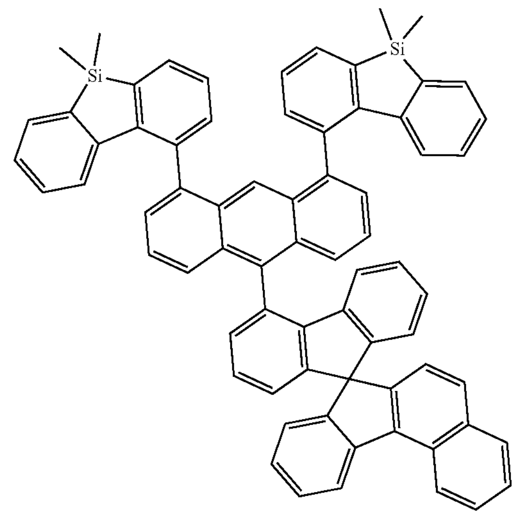
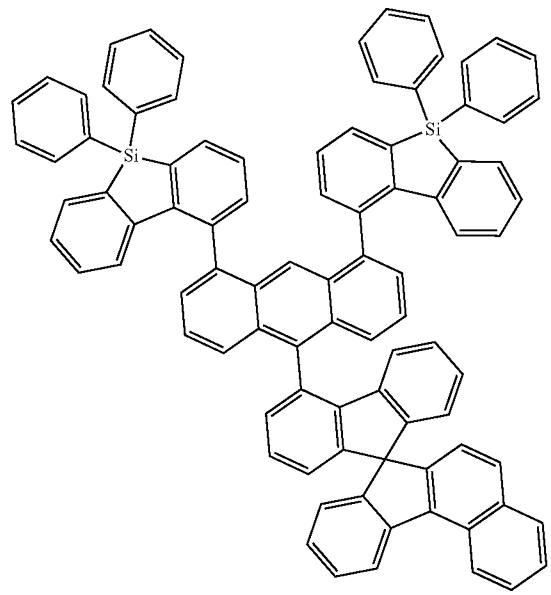
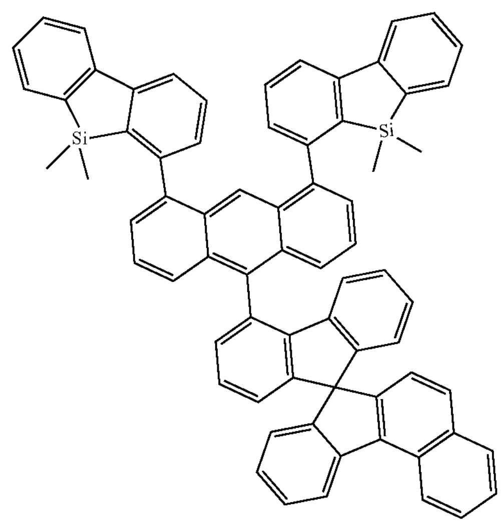

-continued
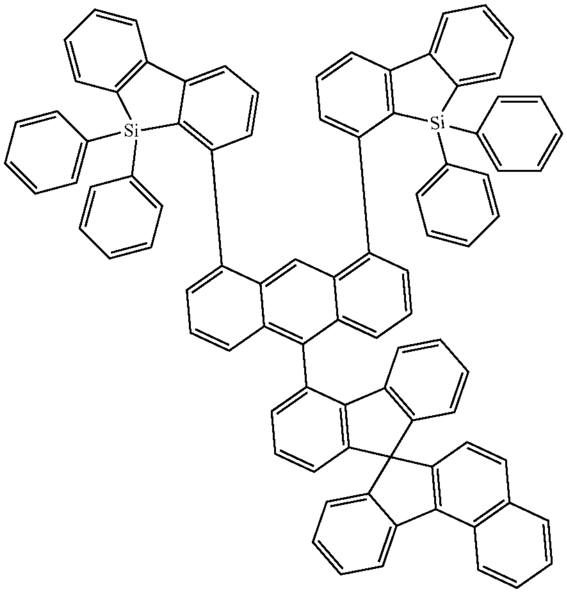
-continued
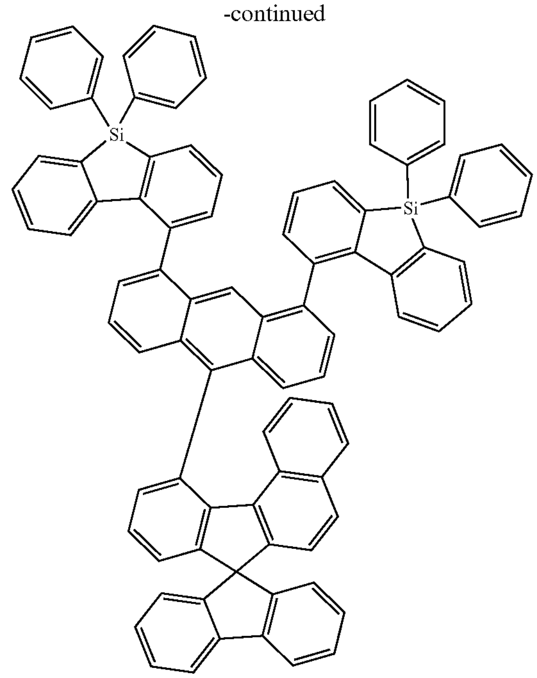
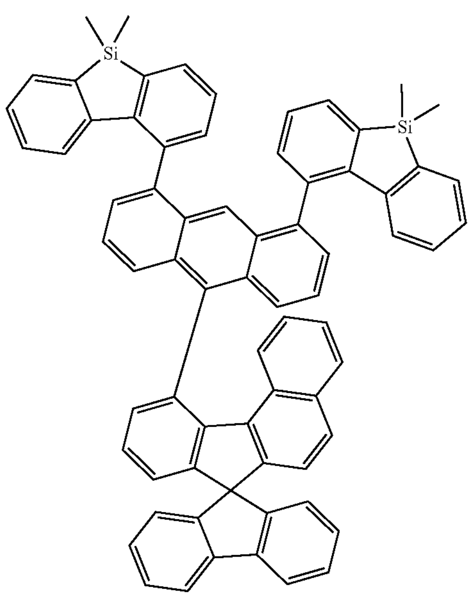
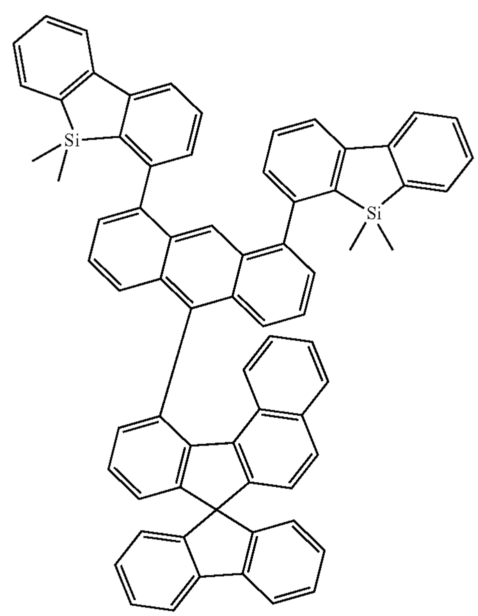

-continued
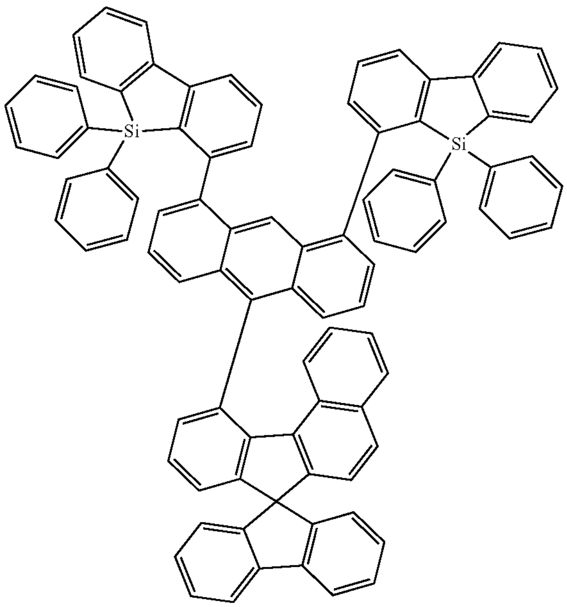
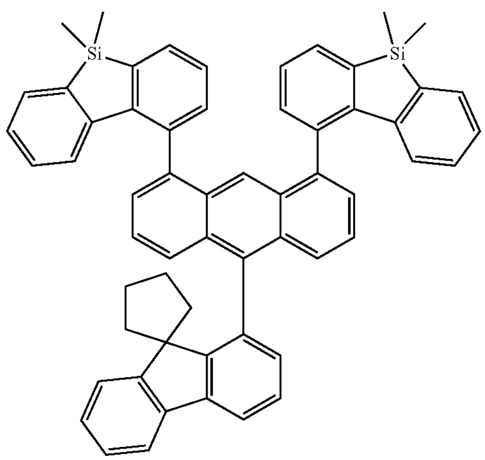
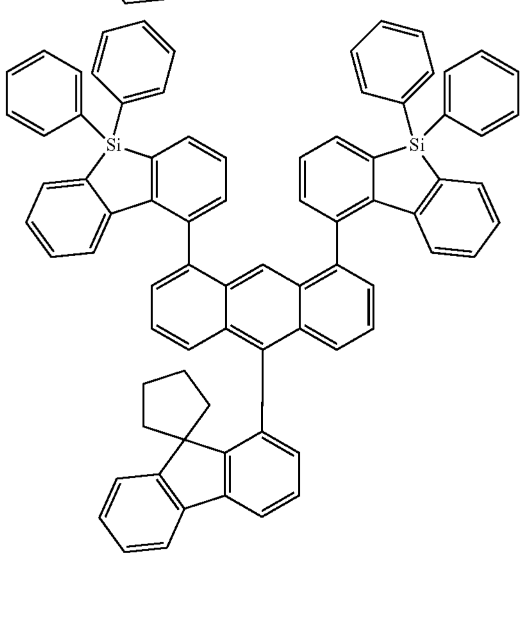
-continued
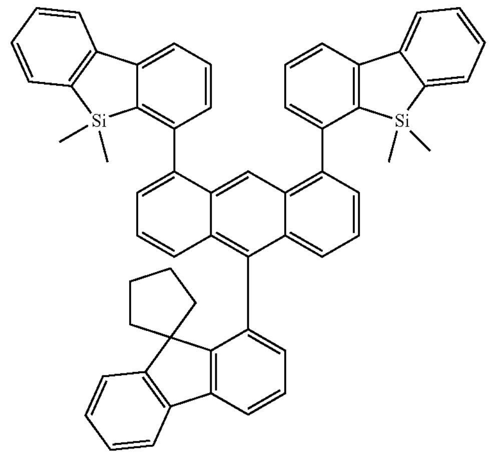
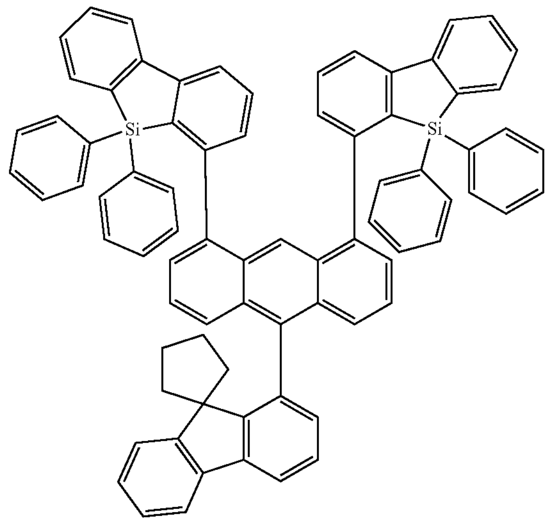
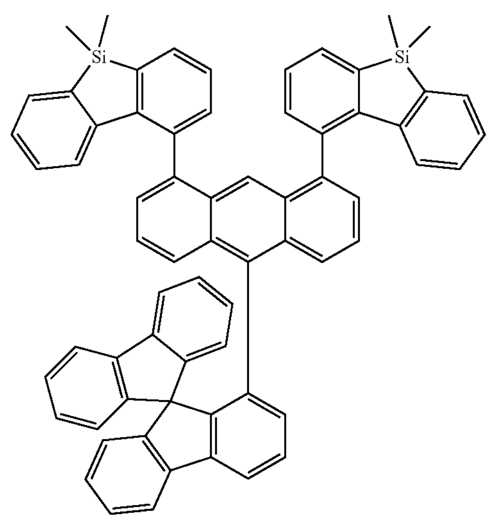

-continued
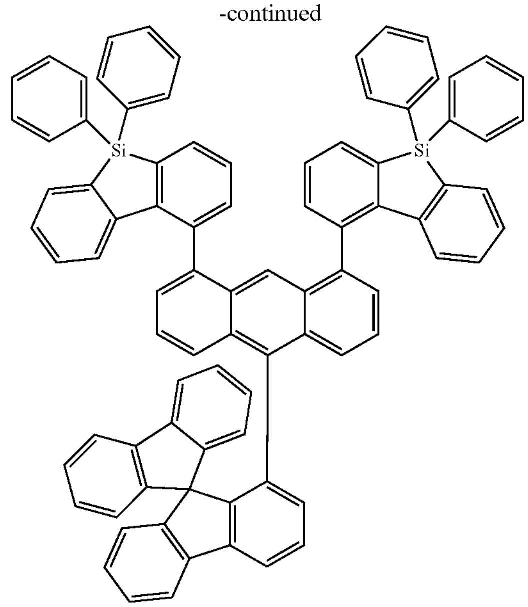
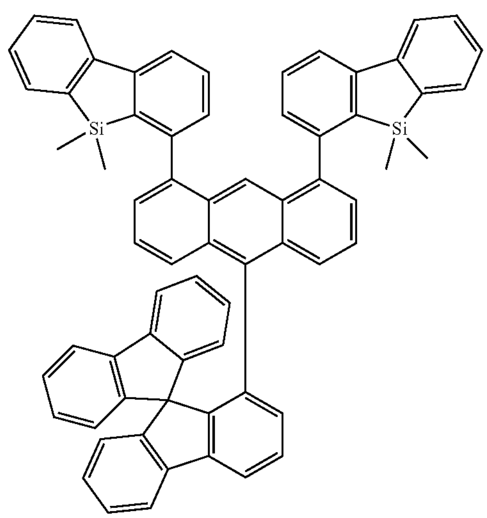
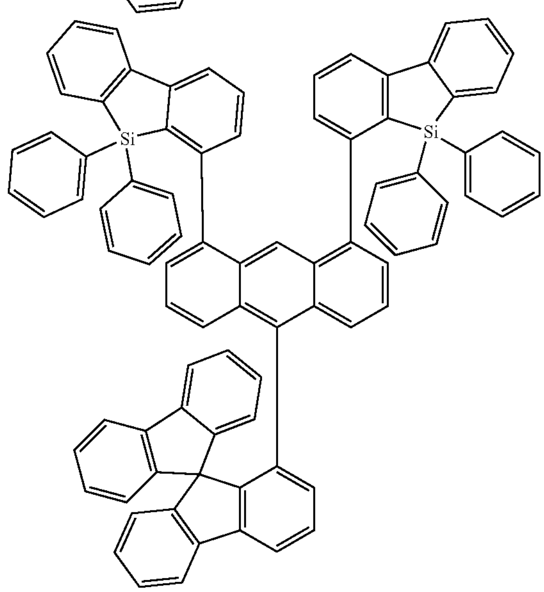
-continued
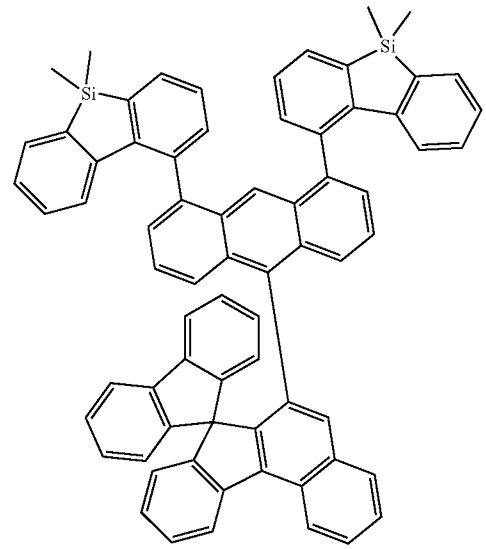
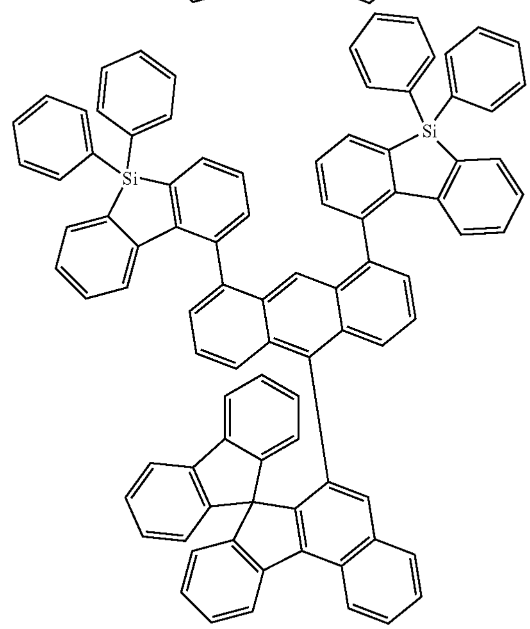
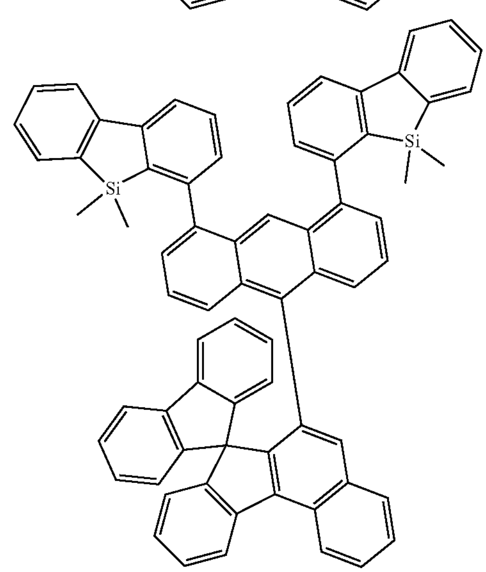

-continued
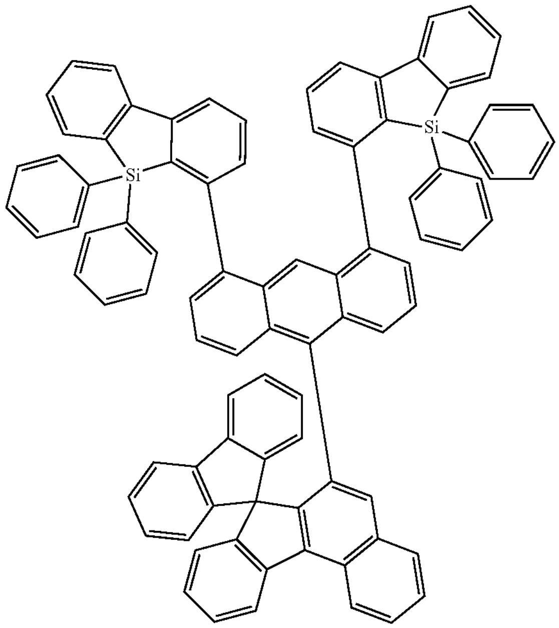
-continued
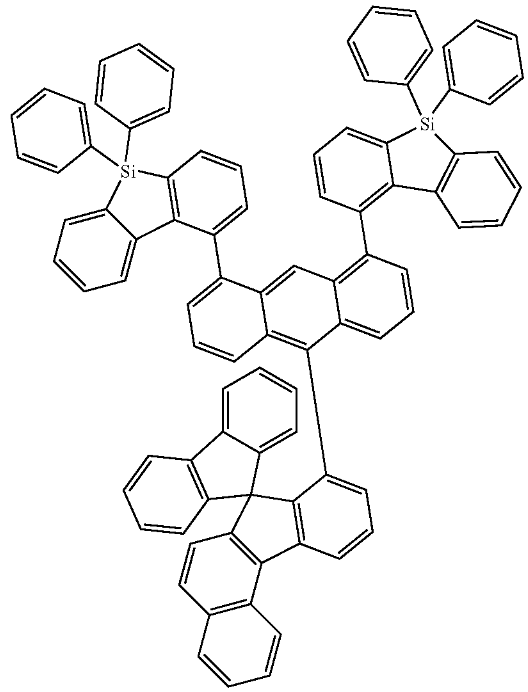
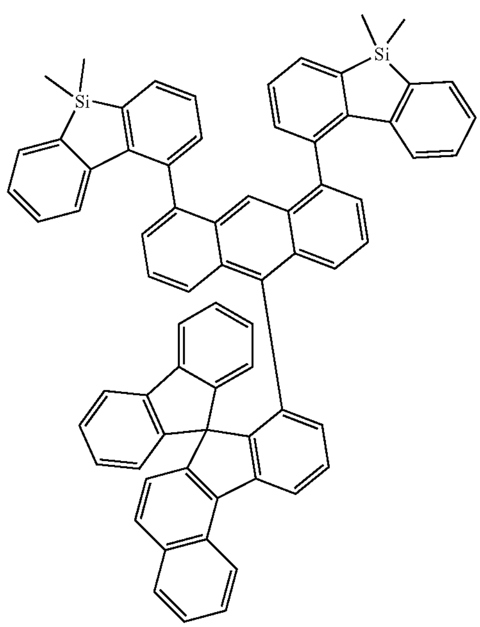
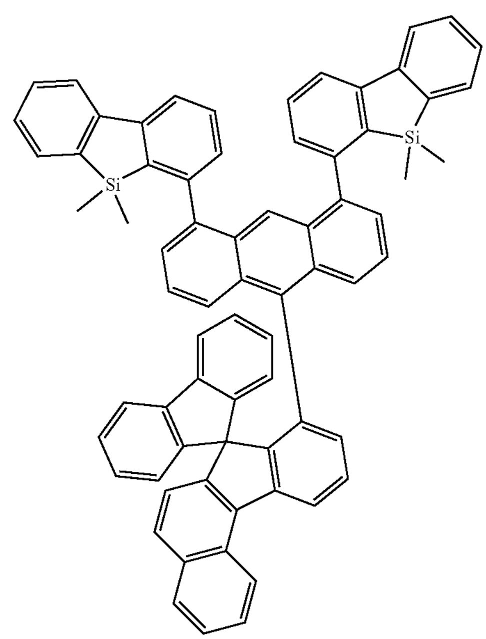

-continued
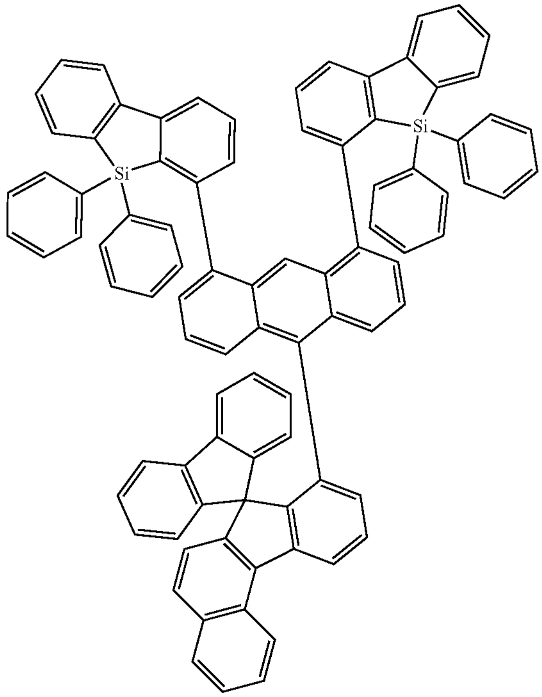
-continued
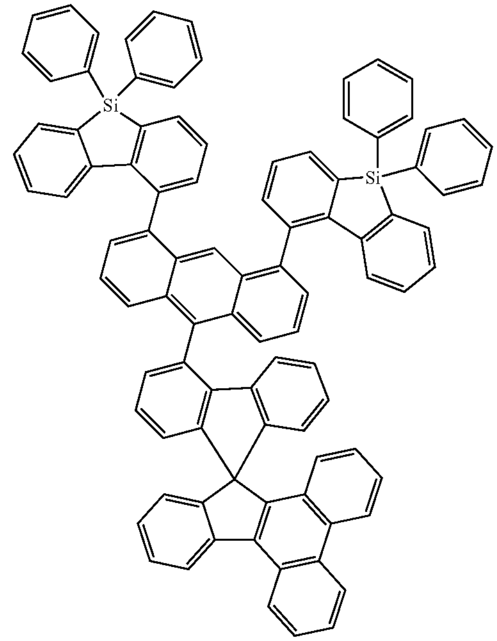
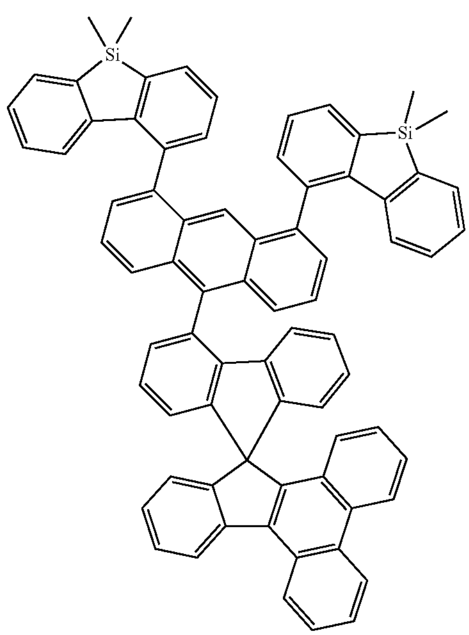
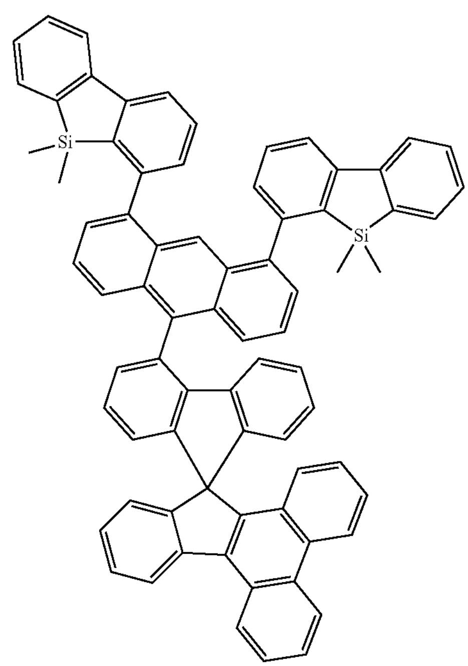

-continued
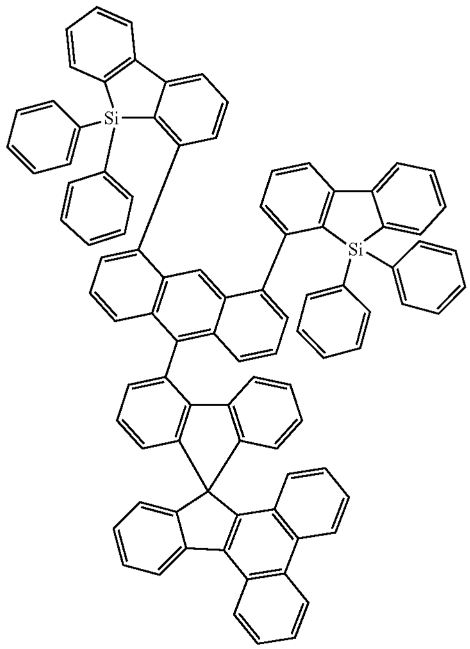
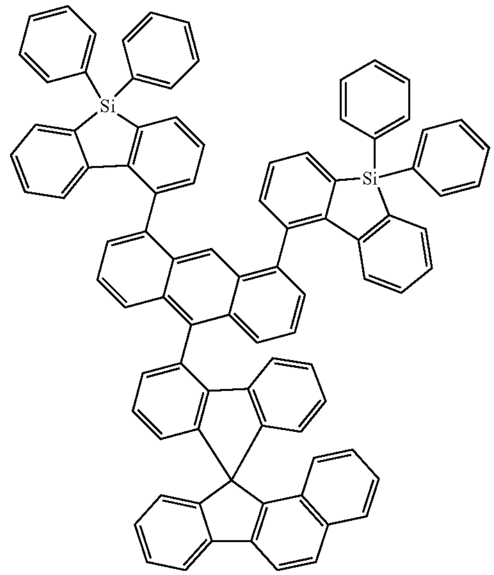
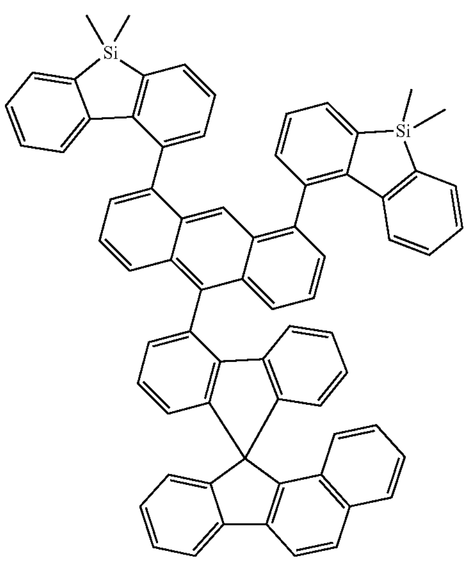
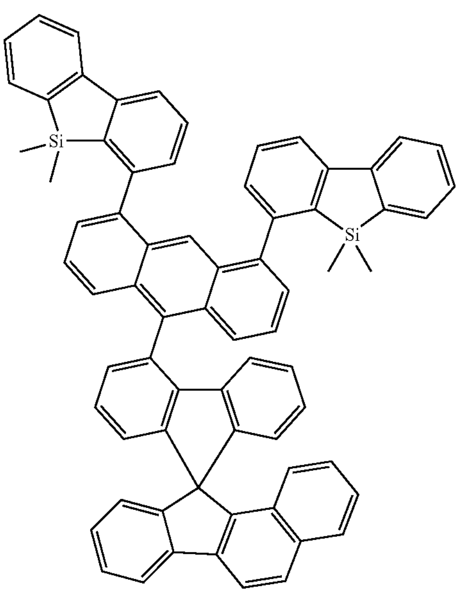
-continued

-continued
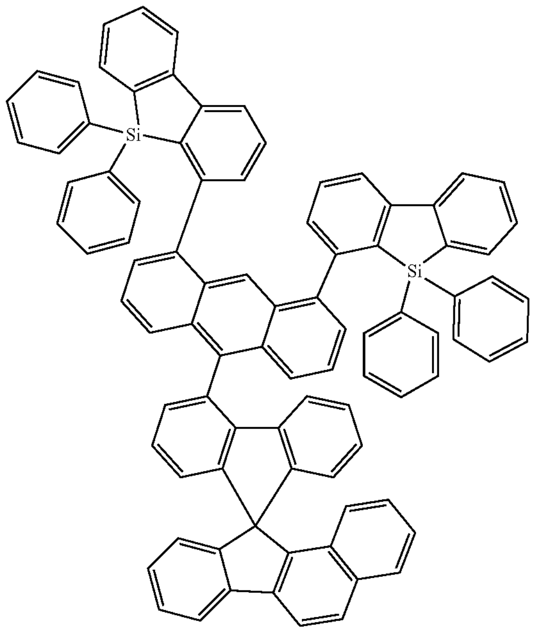
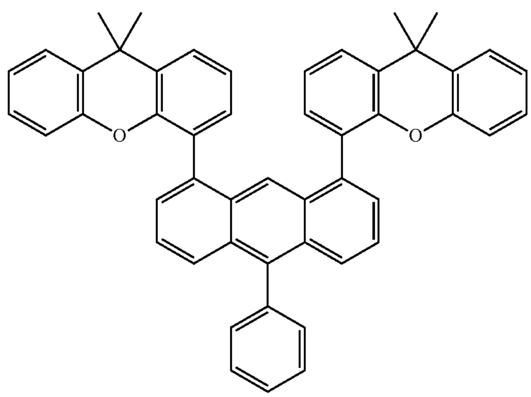
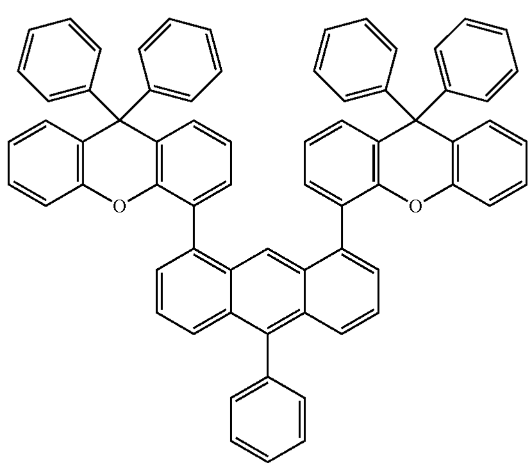
-continued
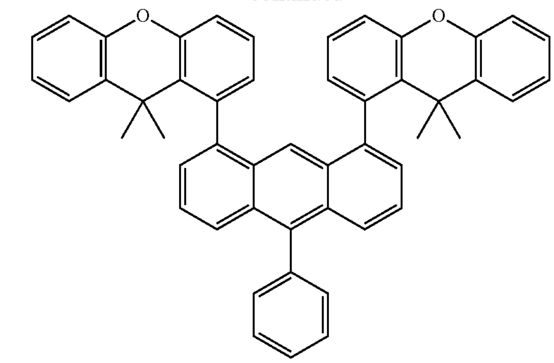
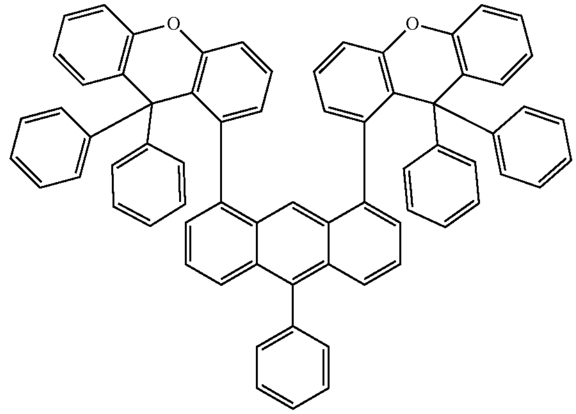
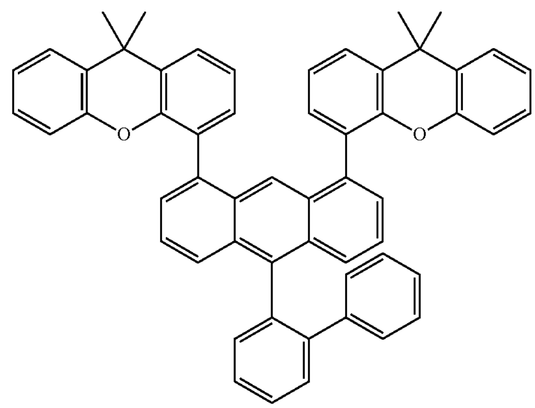
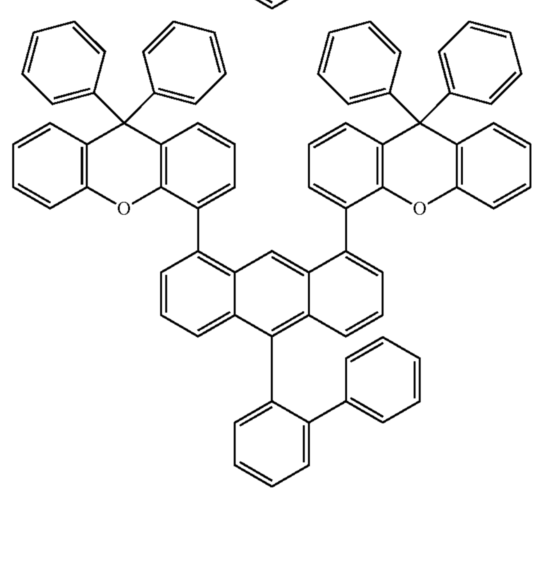

-continued
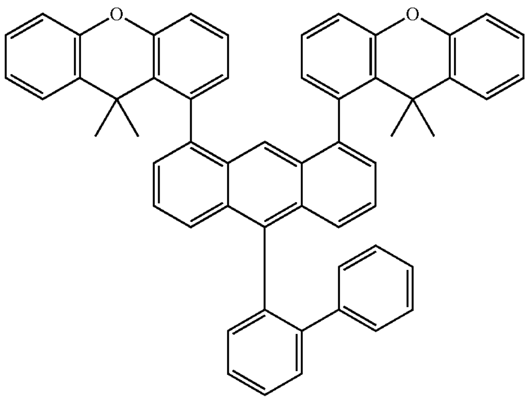
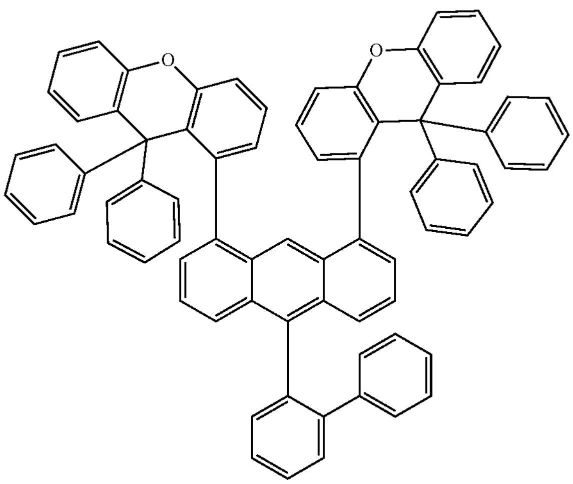
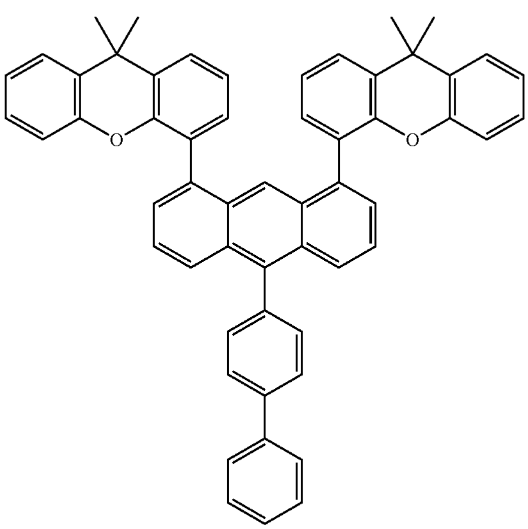
-continued
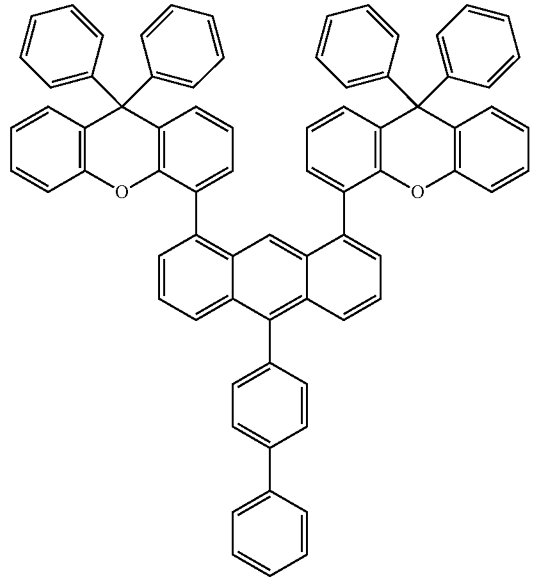
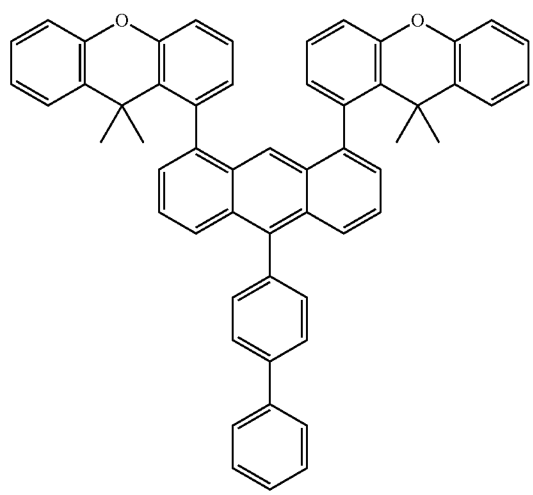
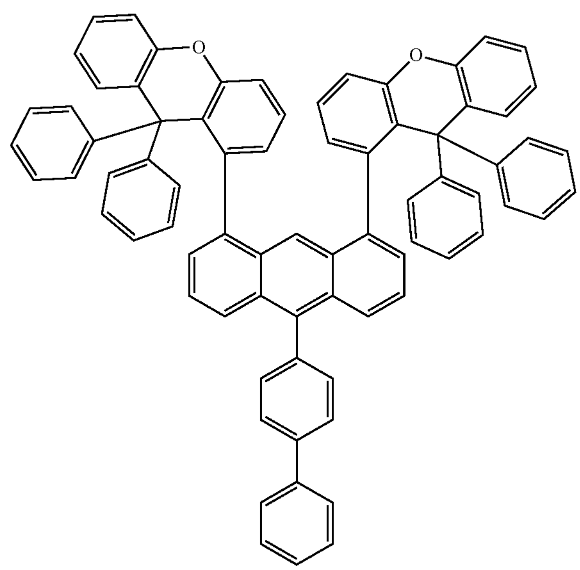

-continued
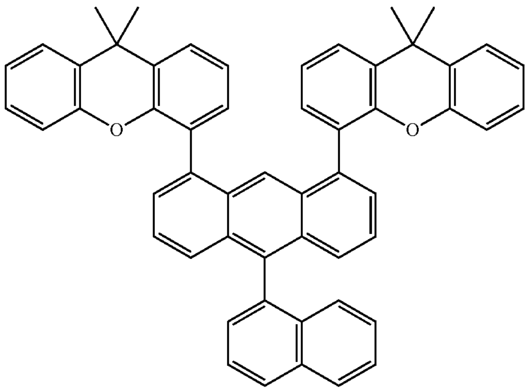
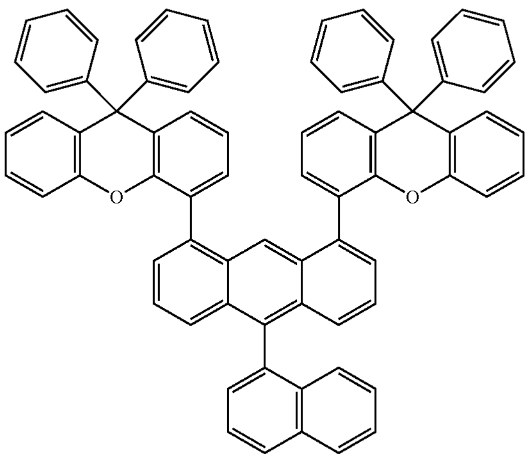
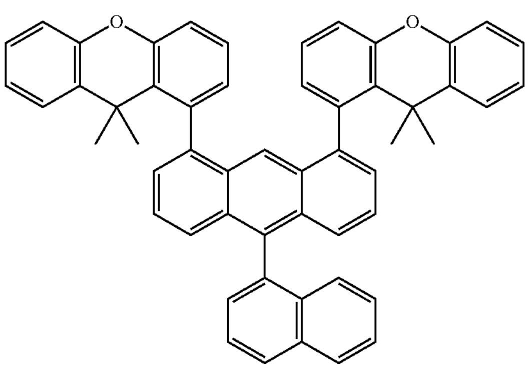
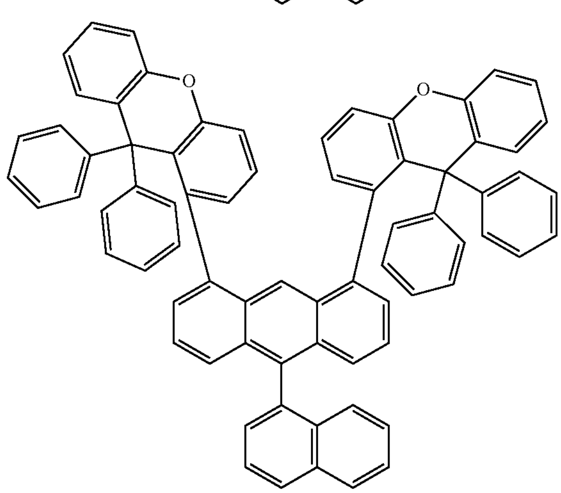
-continued
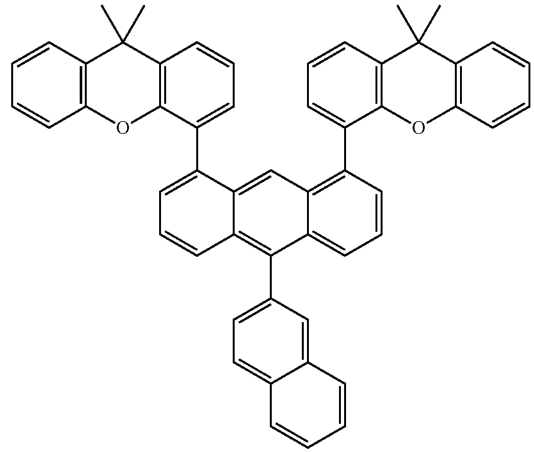
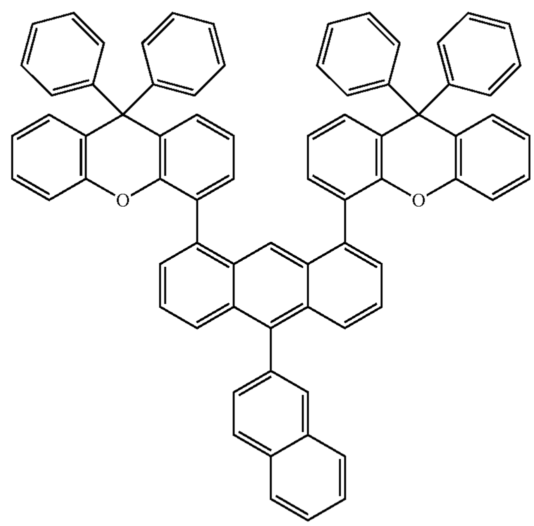
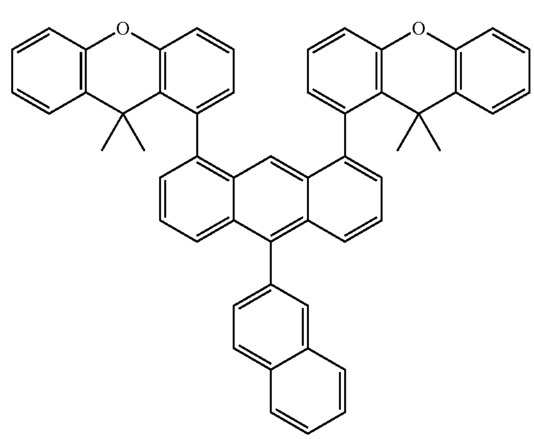

-continued
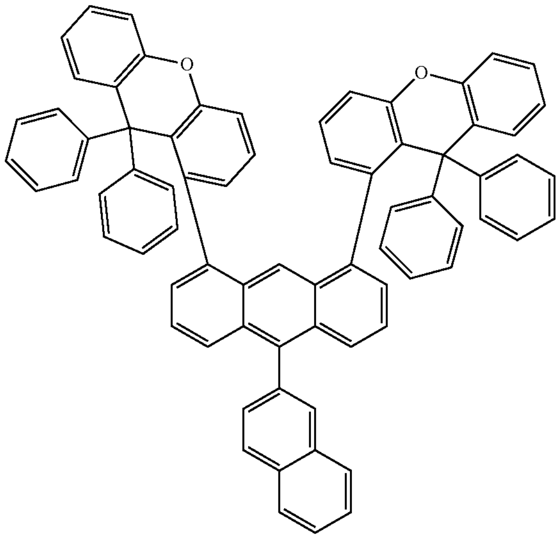
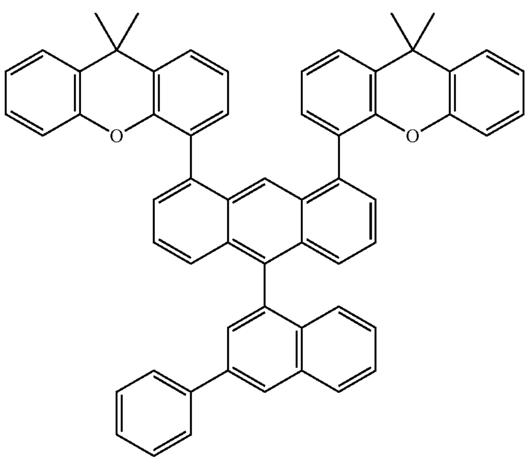
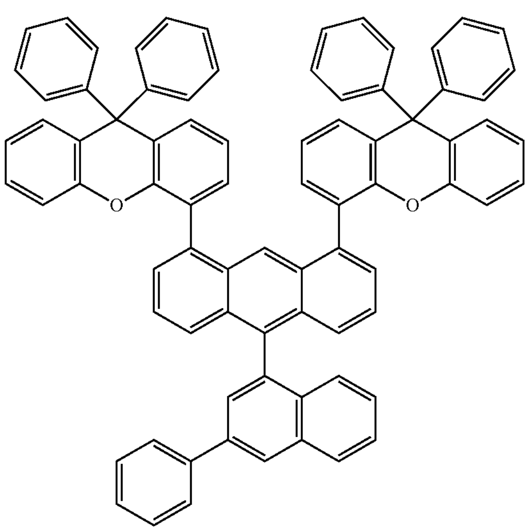
-continued
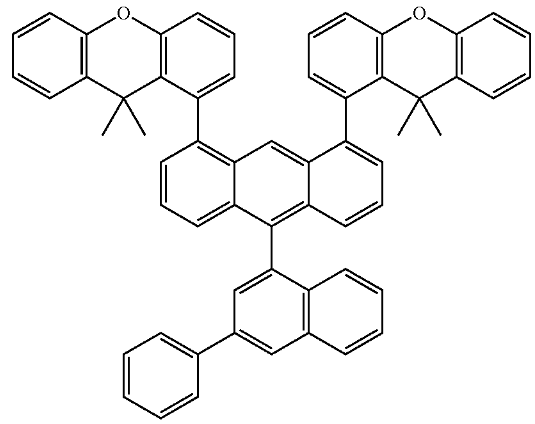
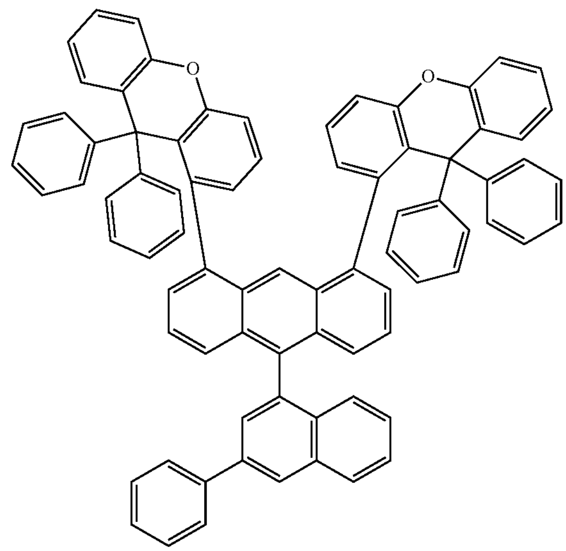
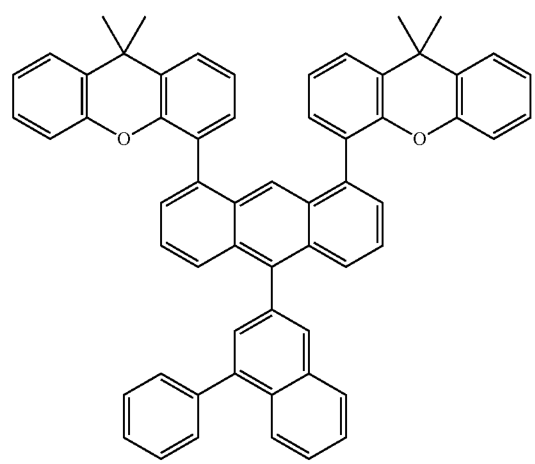

-continued
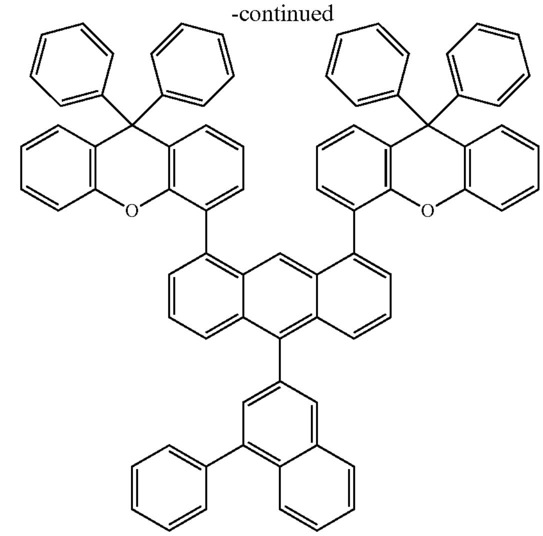
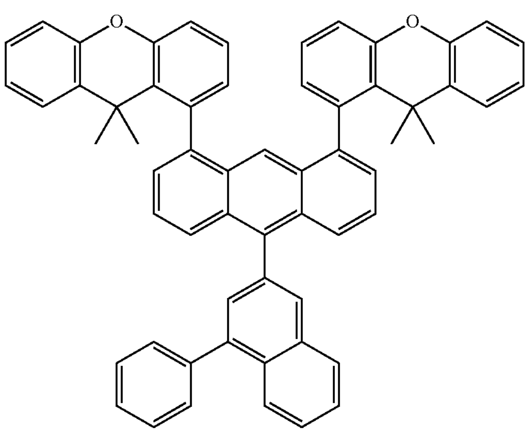
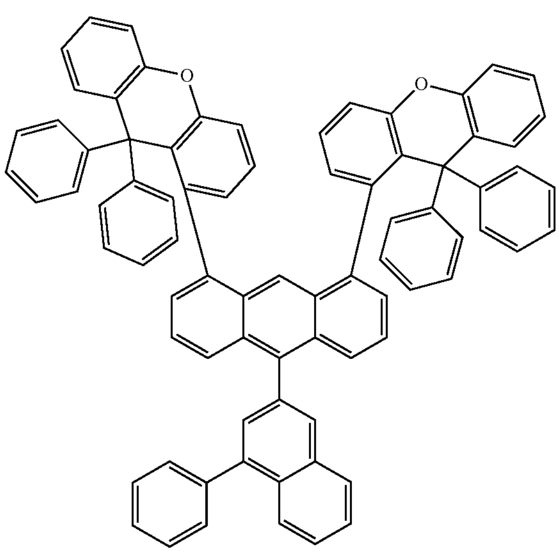
-continued
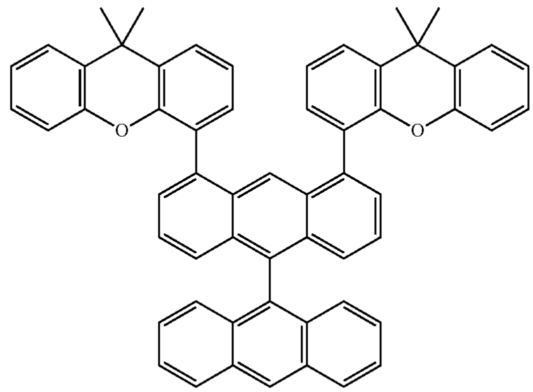
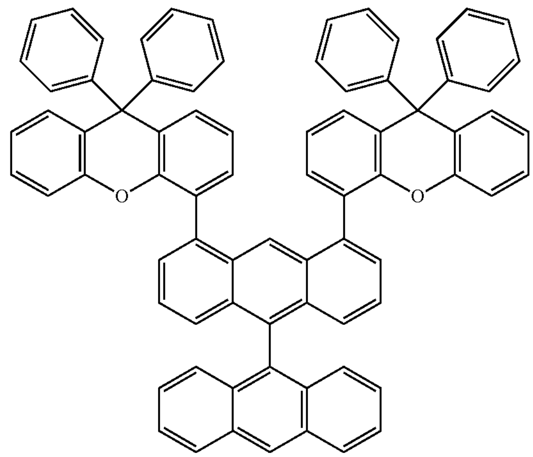
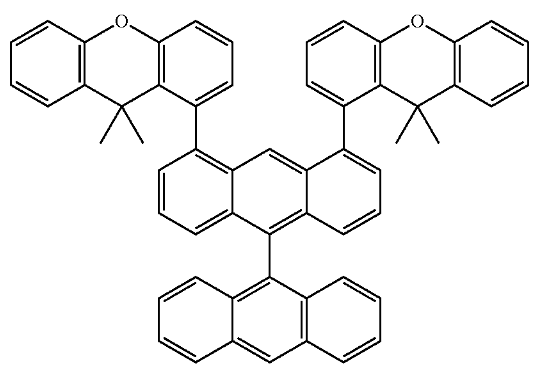
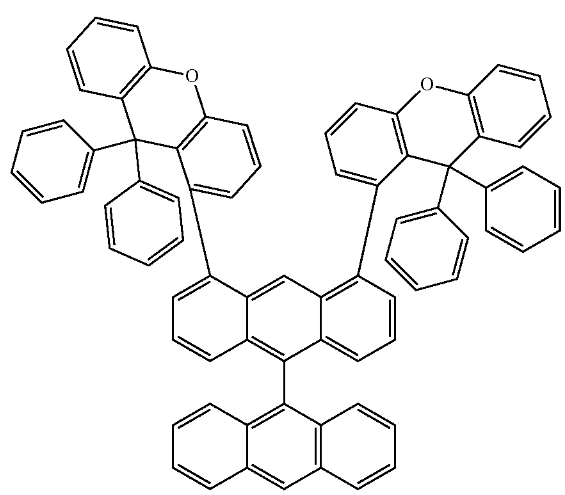

-continued
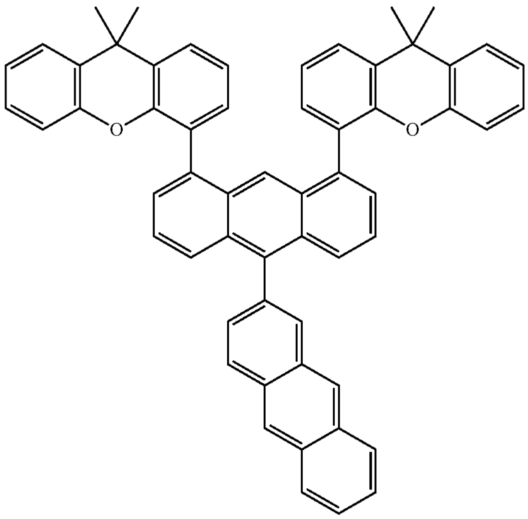
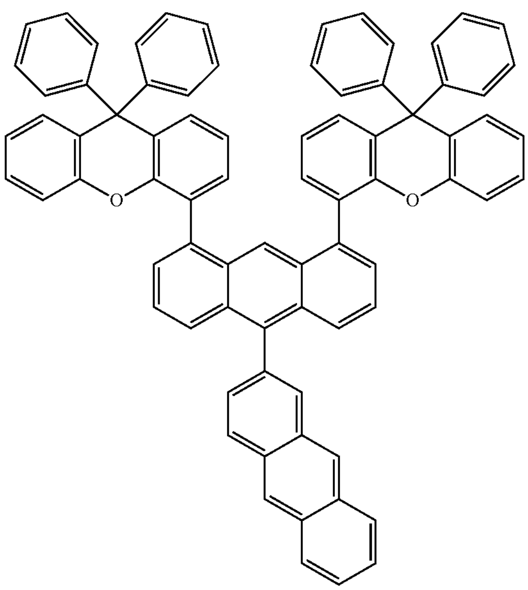
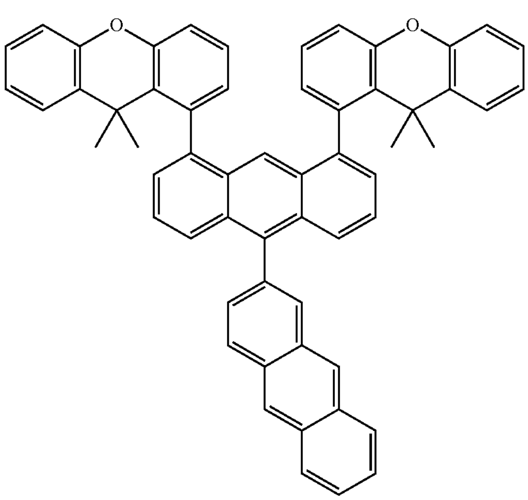
-continued
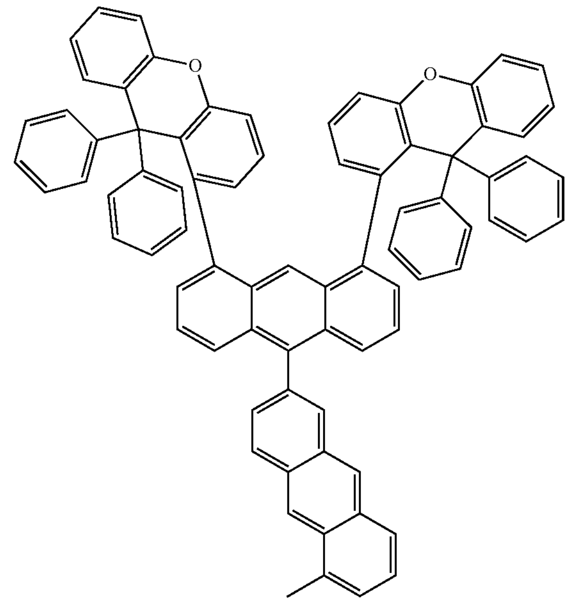
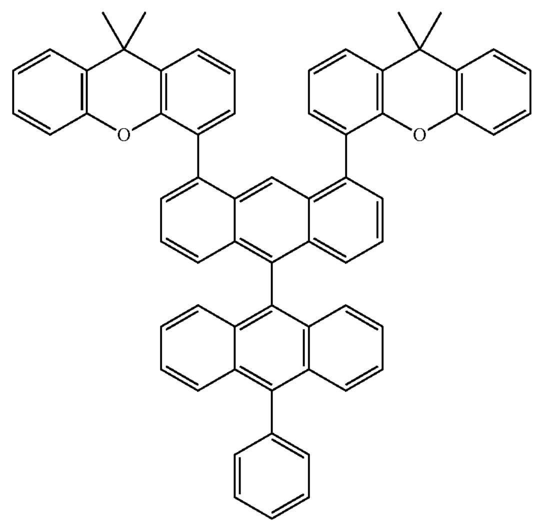
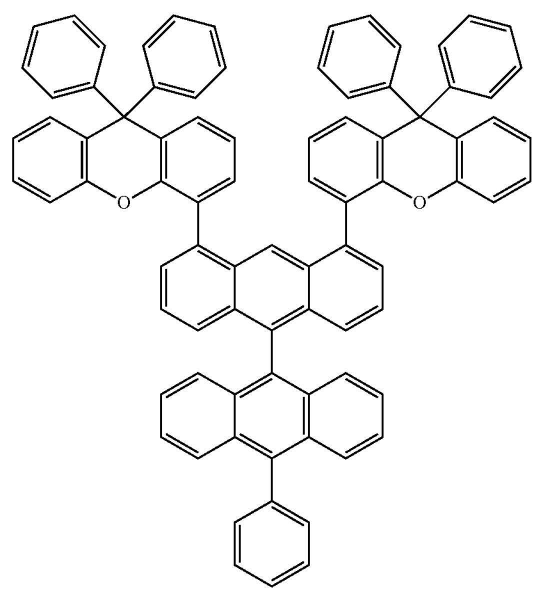

-continued
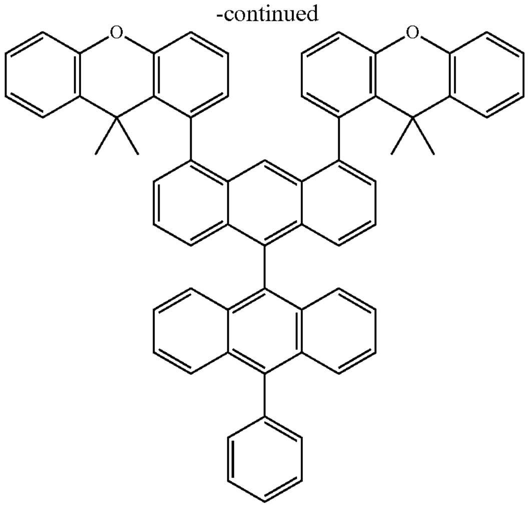
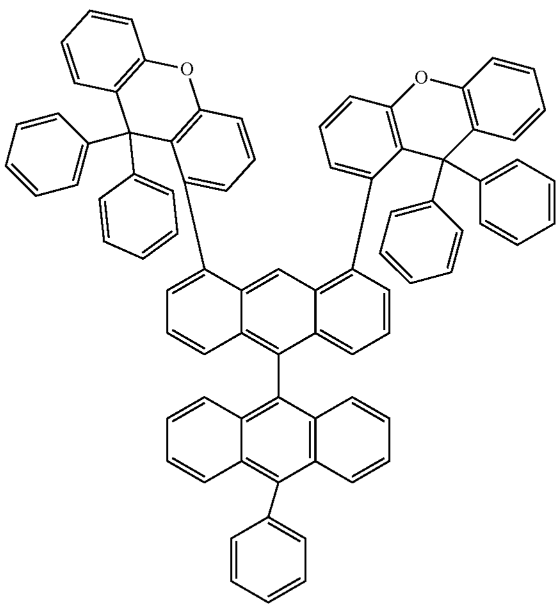
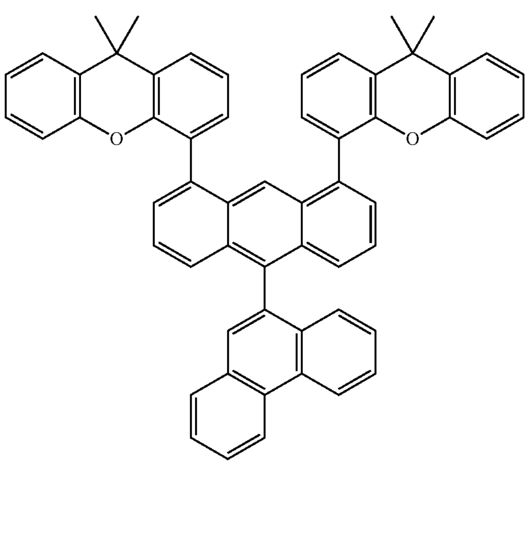
-continued
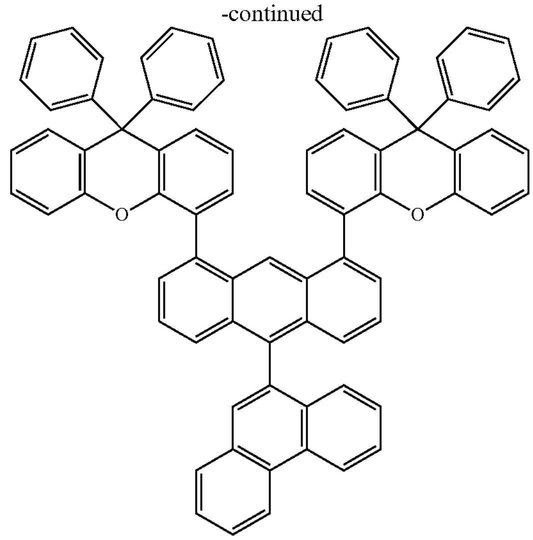
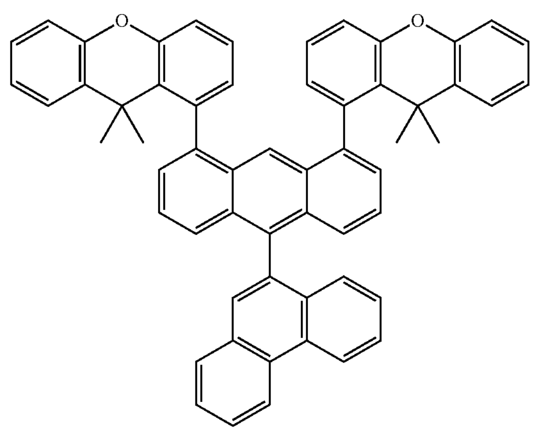
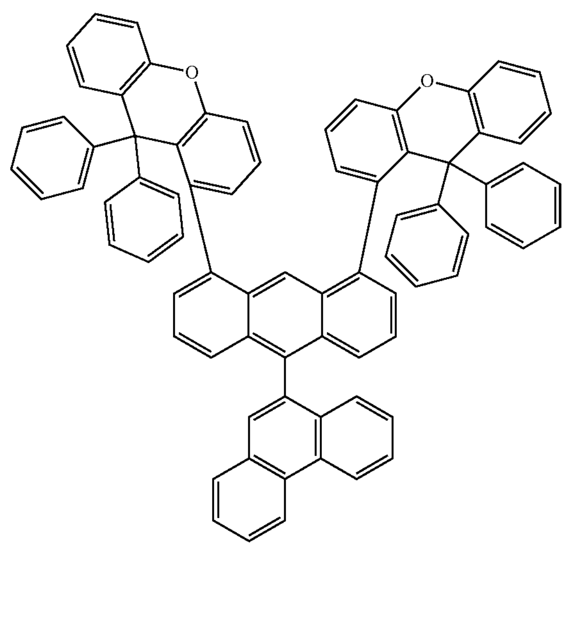

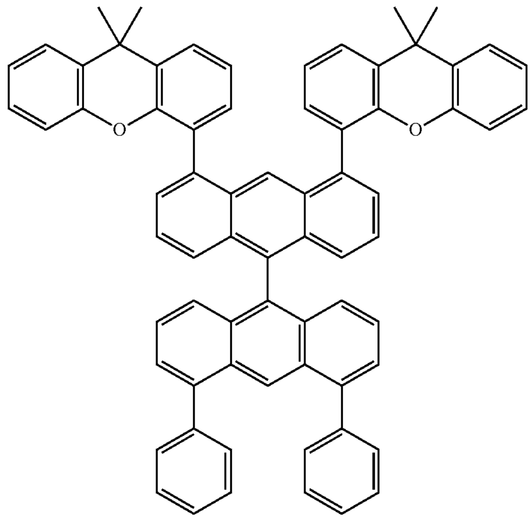
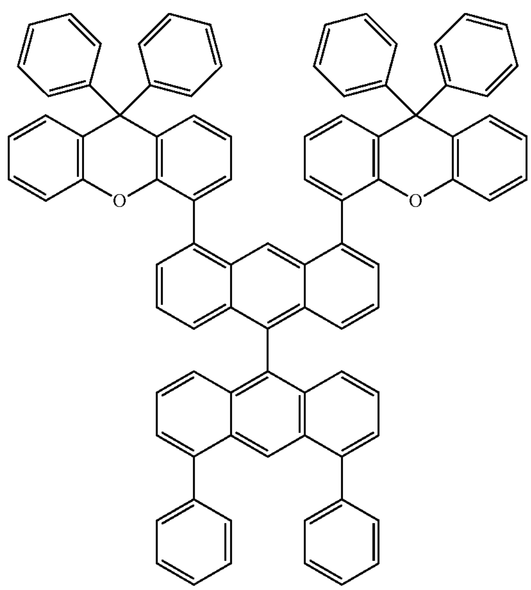
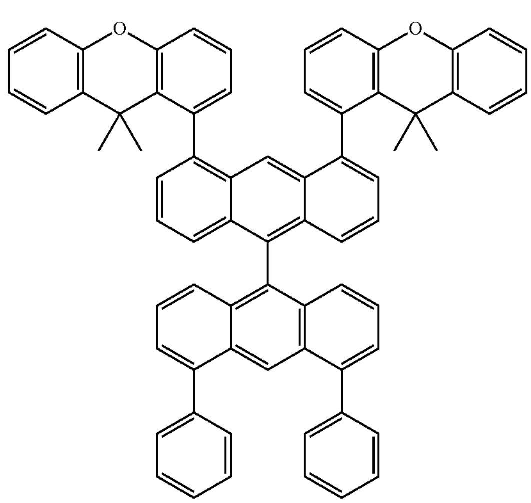
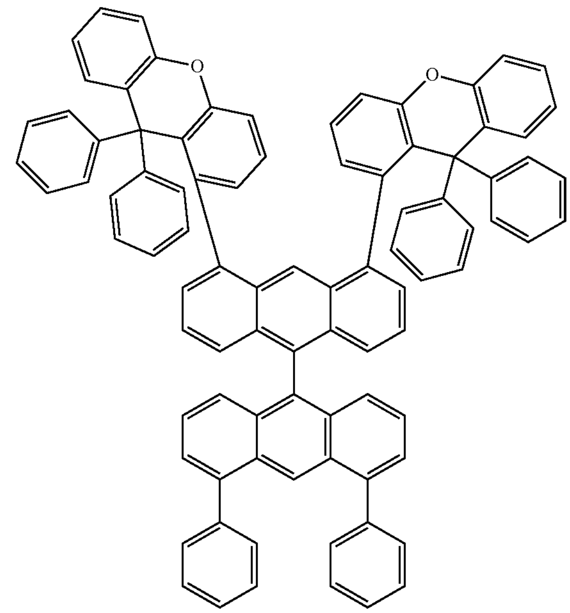
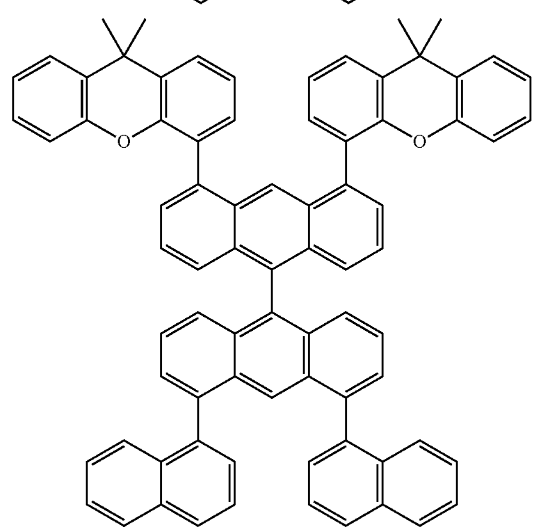
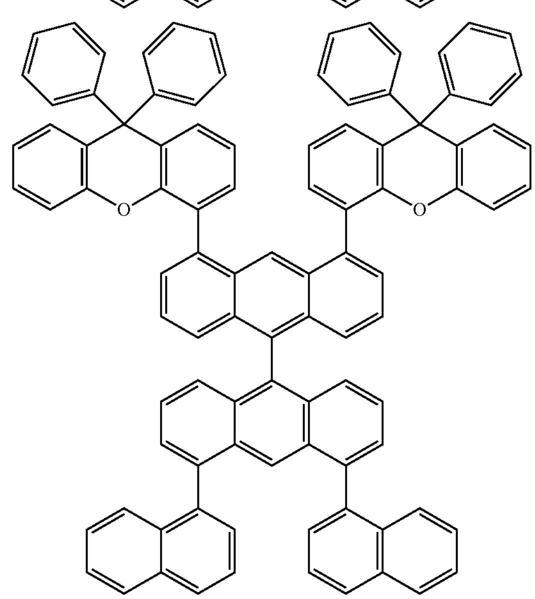

-continued
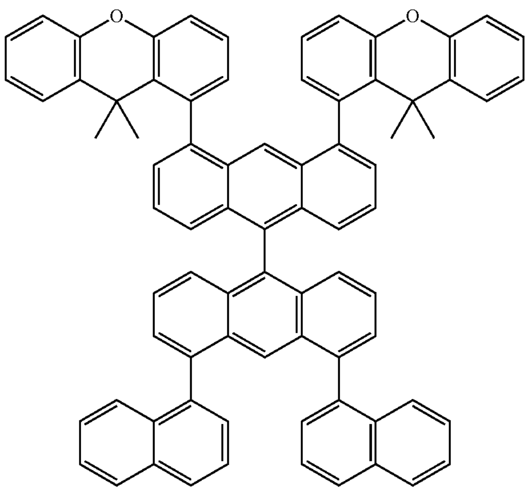
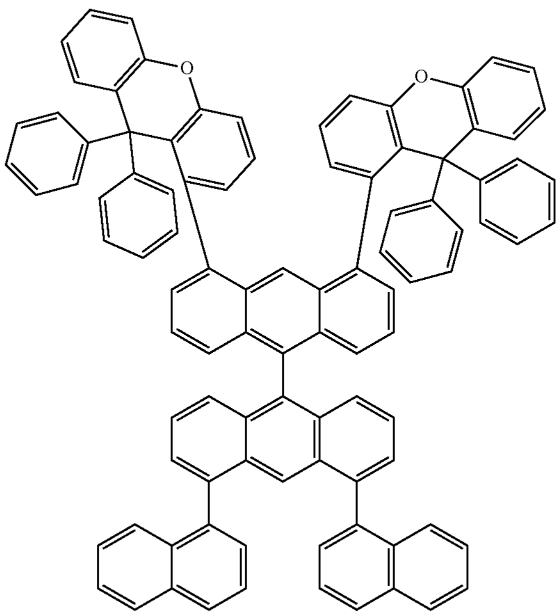
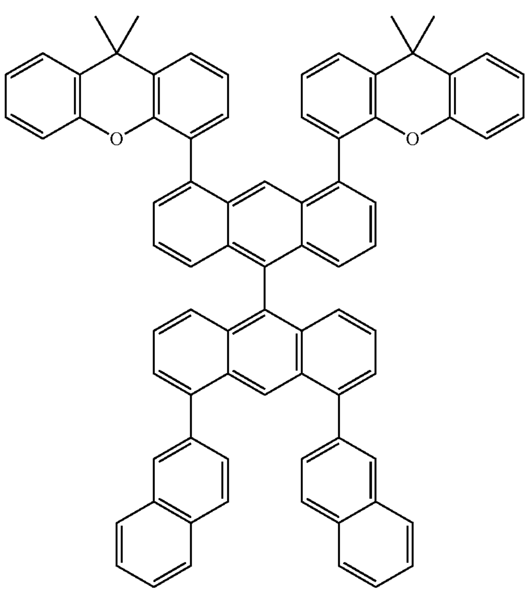
-continued
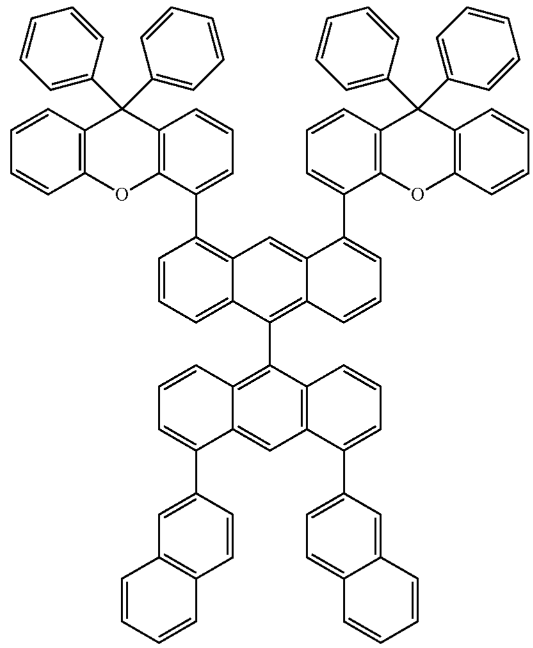
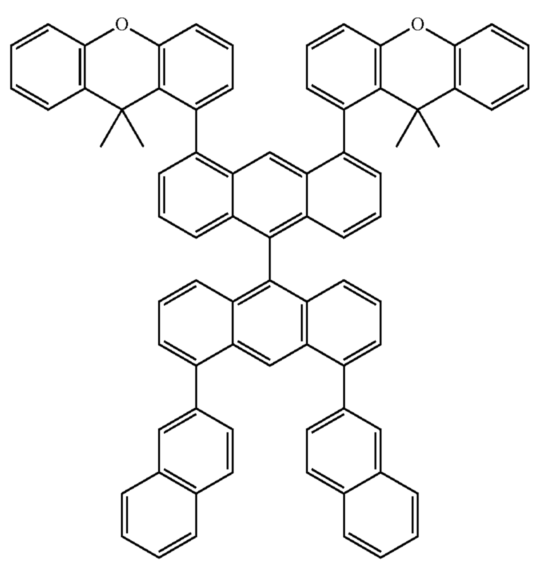

-continued
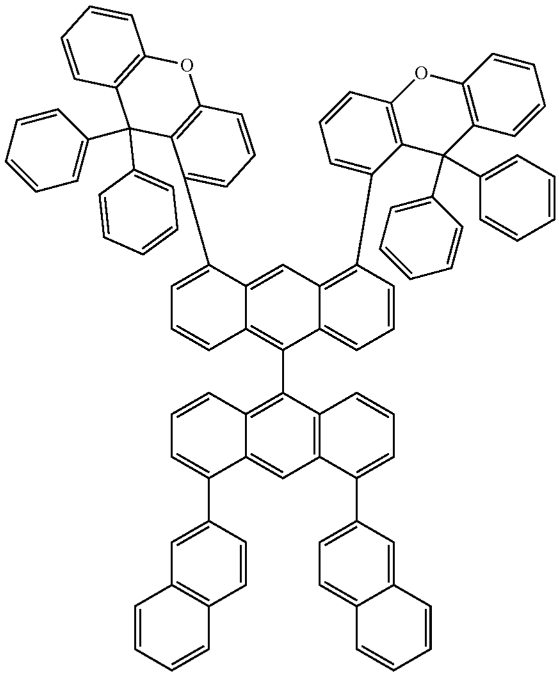
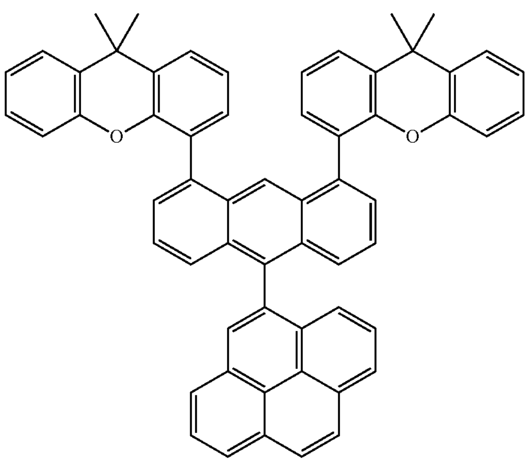
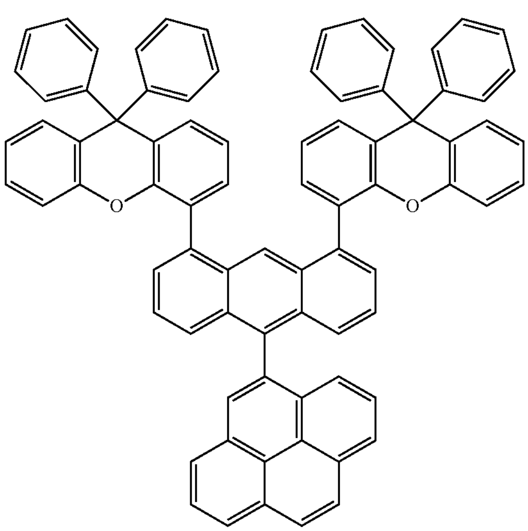
-continued
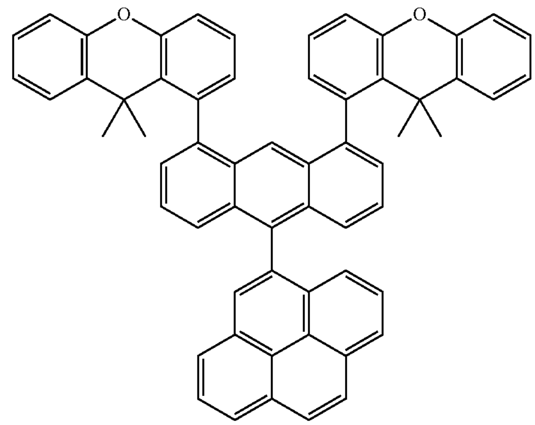
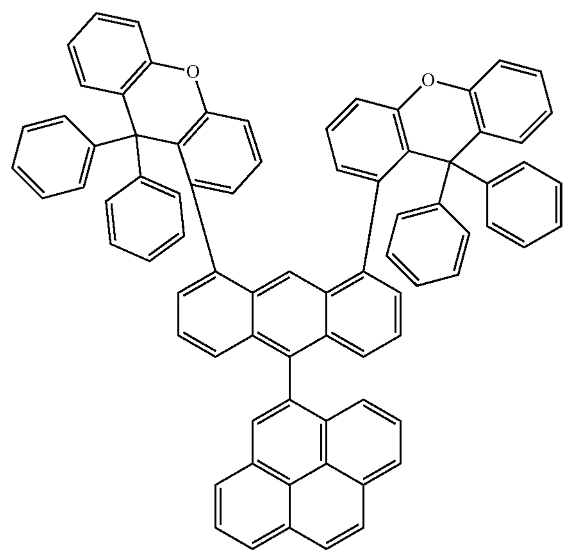
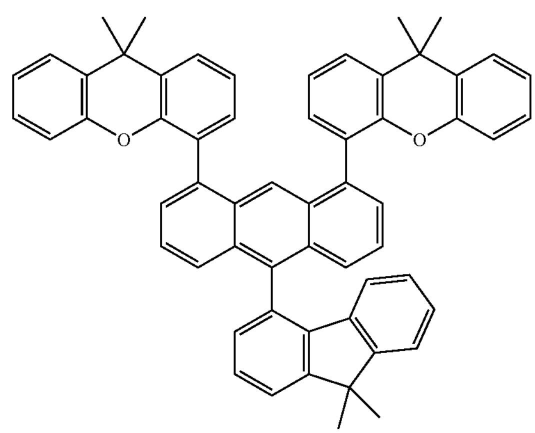

-continued
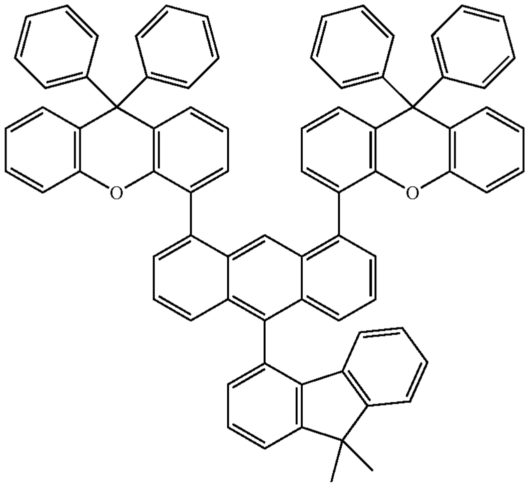
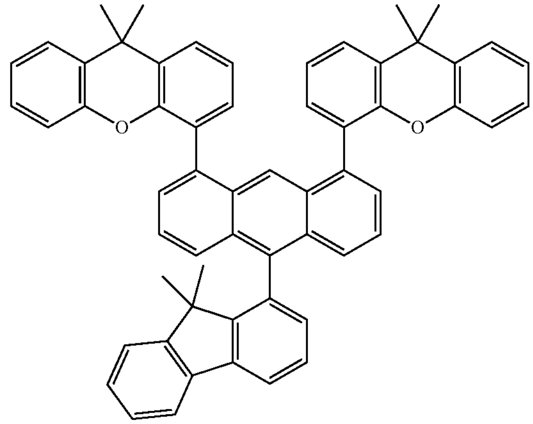
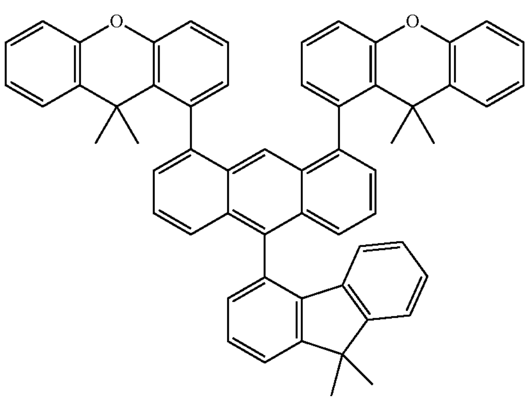
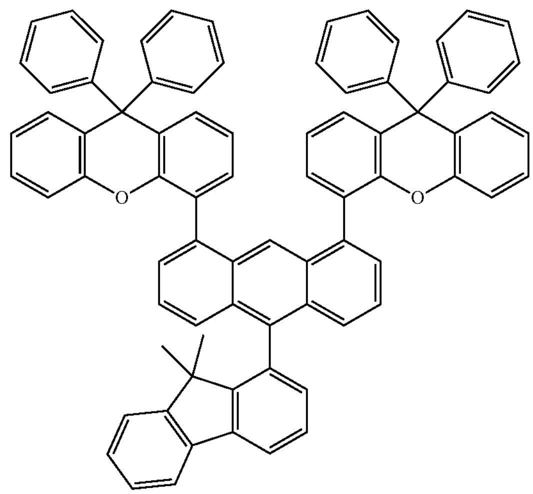
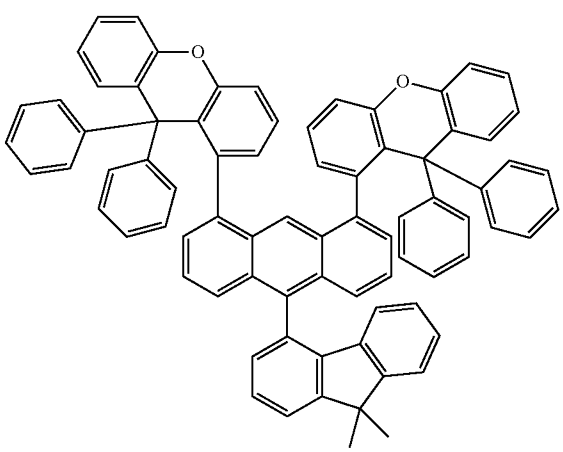
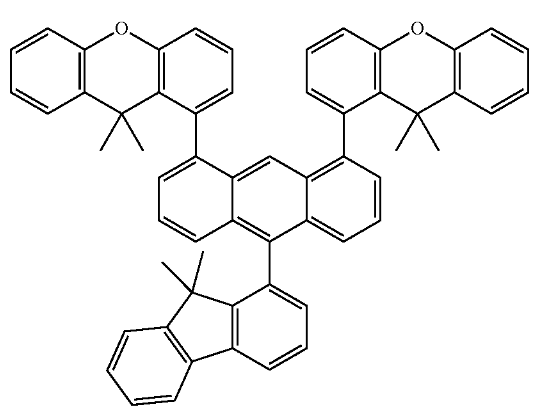
-continued

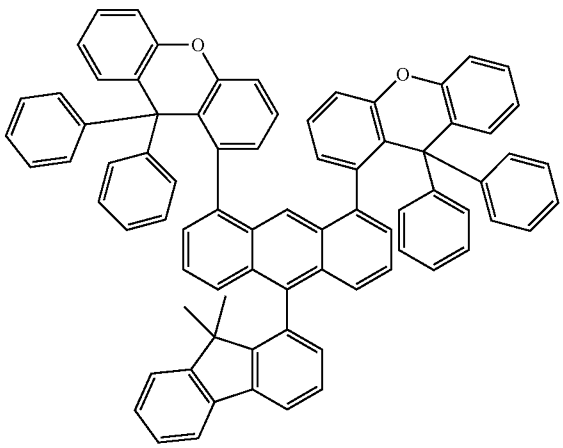
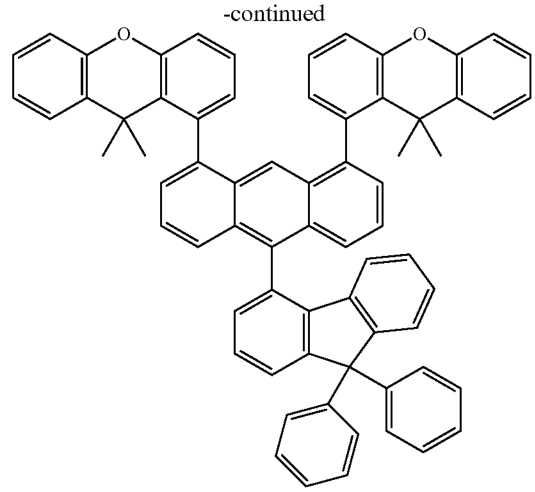
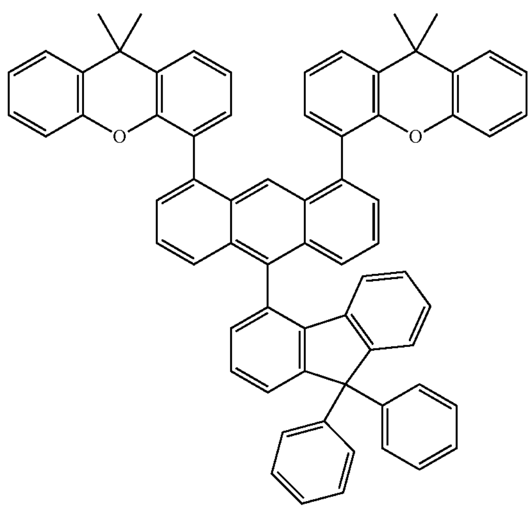
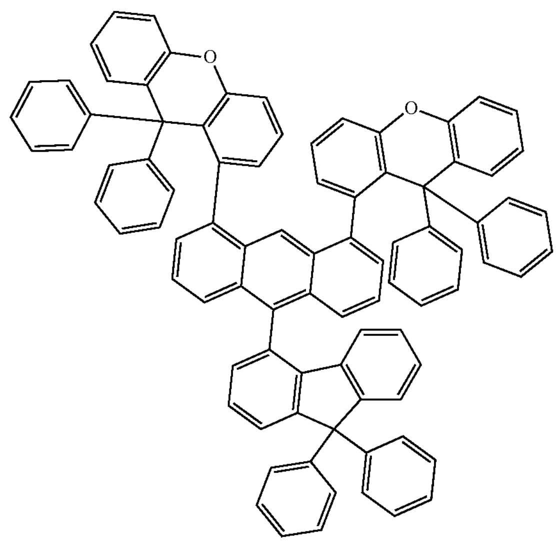
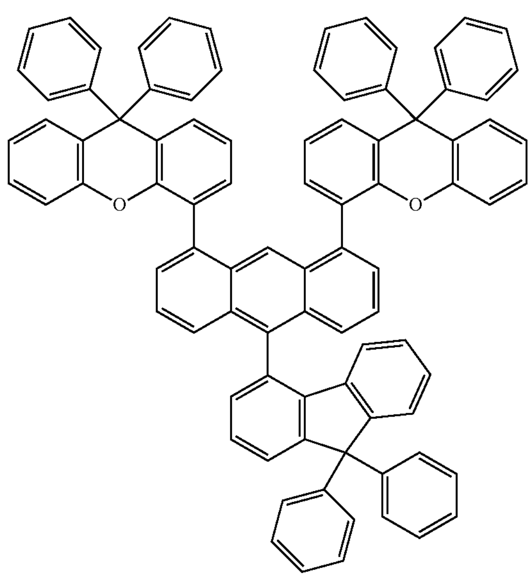
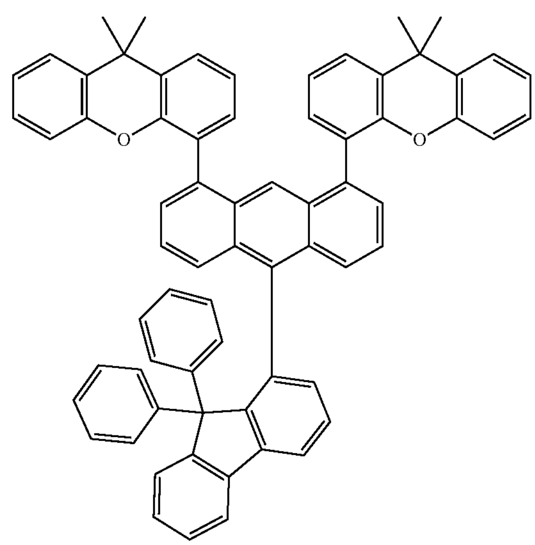

-continued
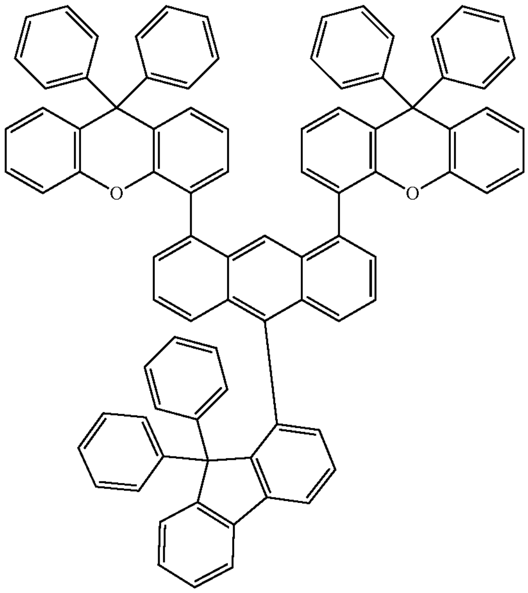
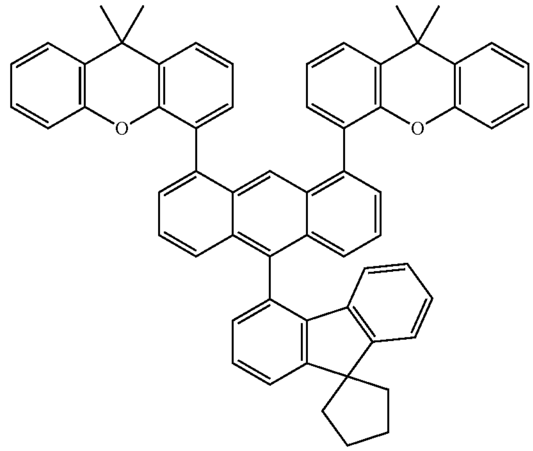
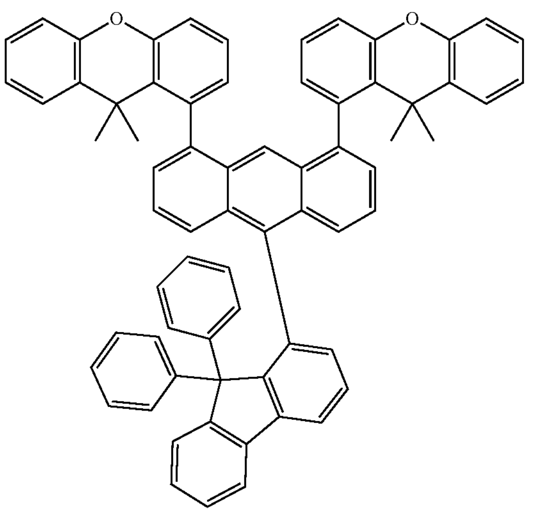
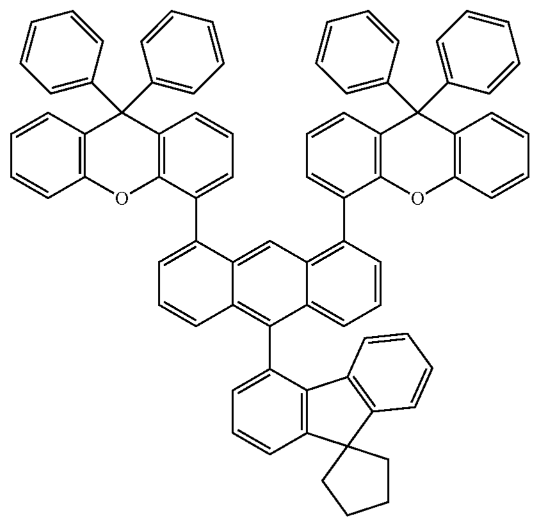
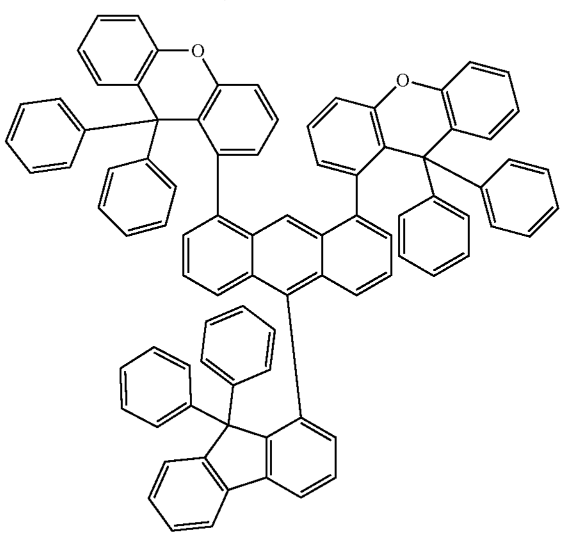
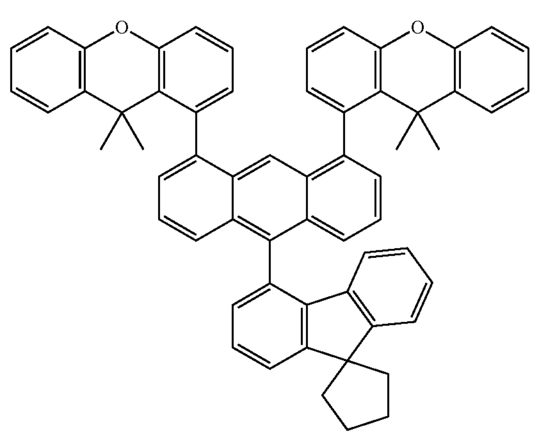
-continued -continued
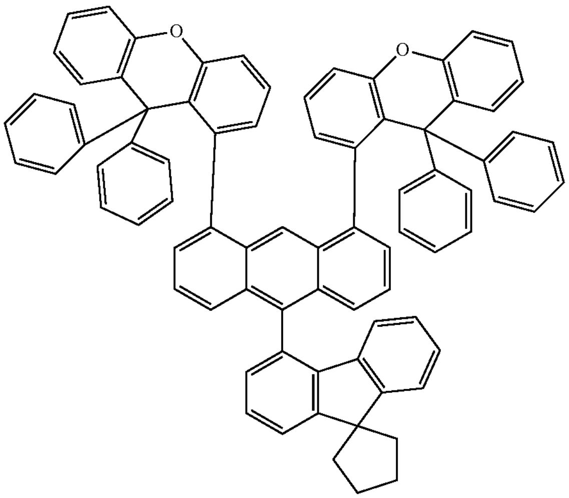
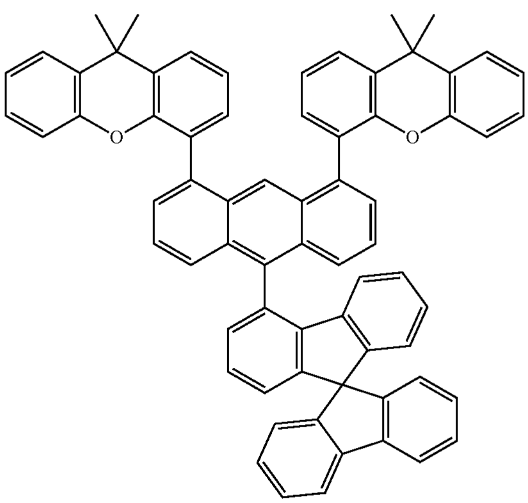
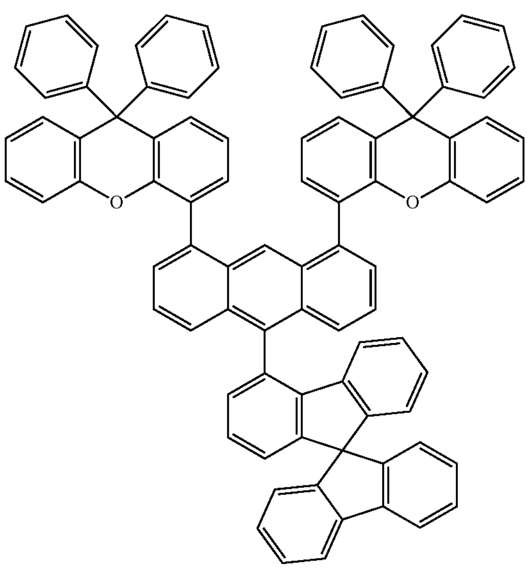
-continued
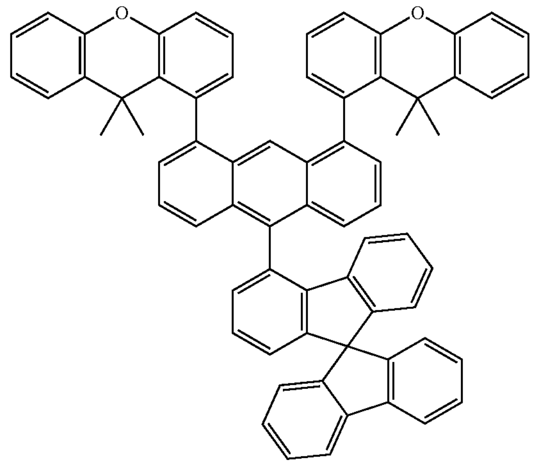
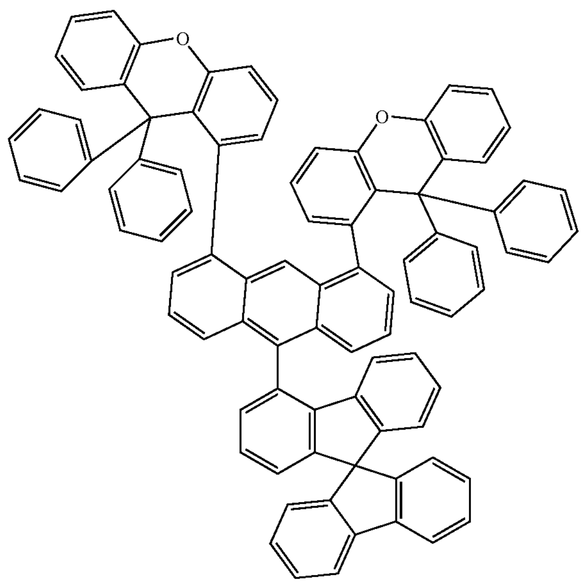
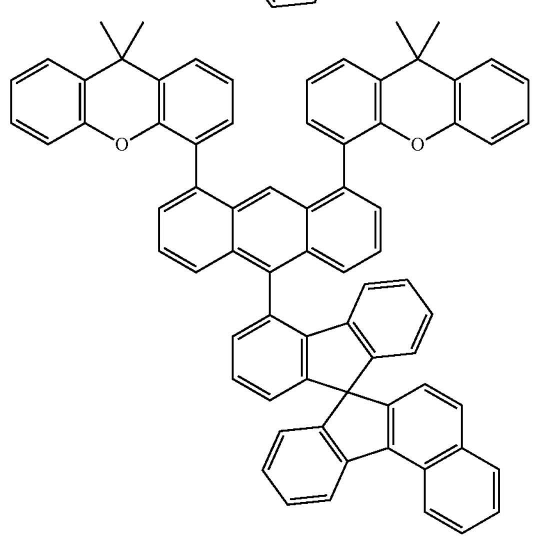

-continued
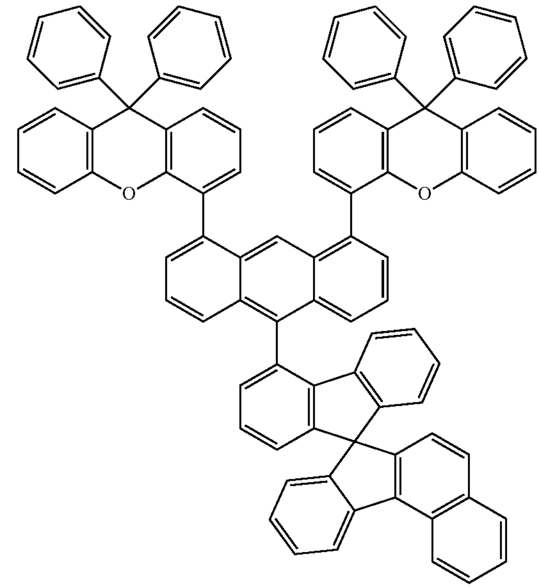
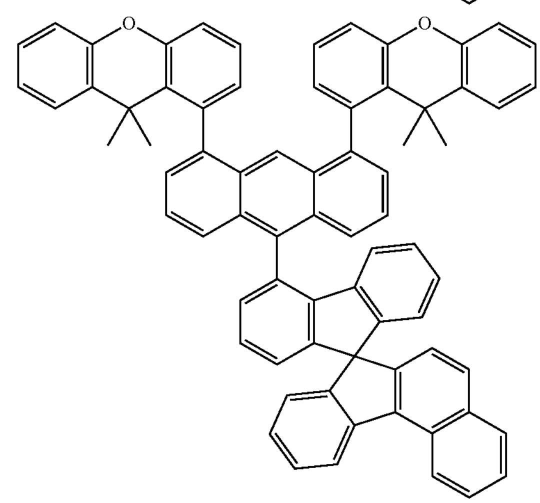
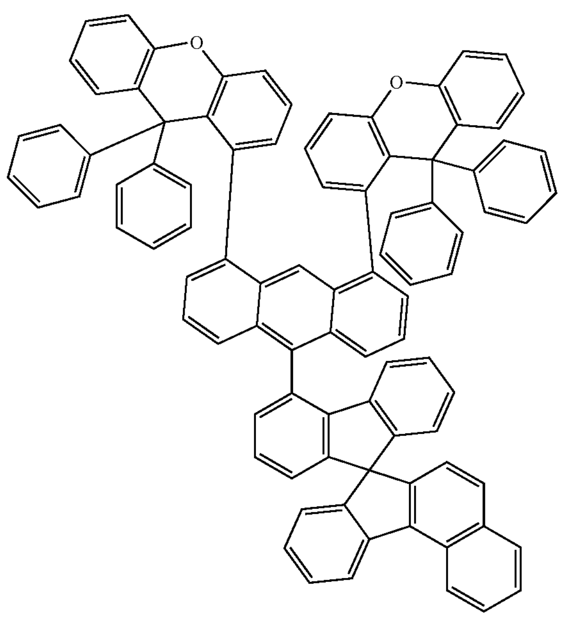
-continued
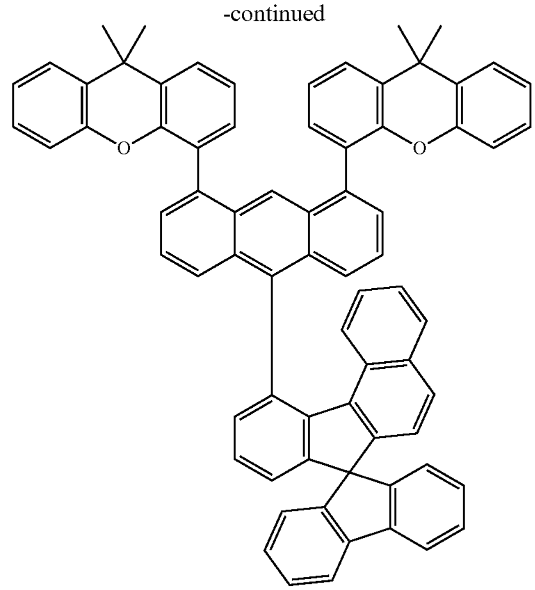
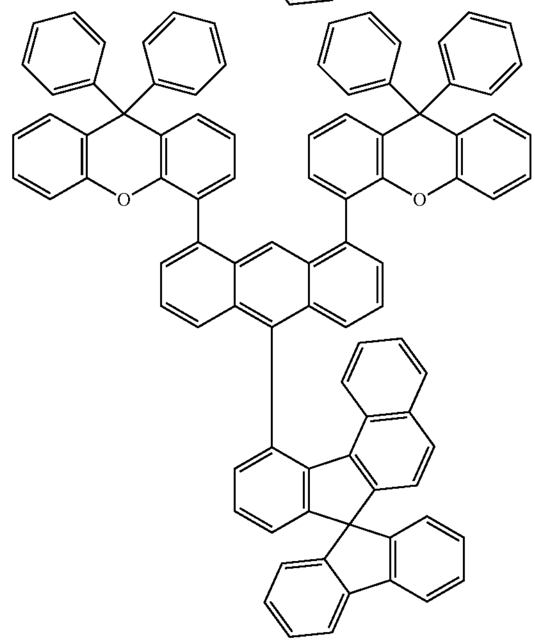
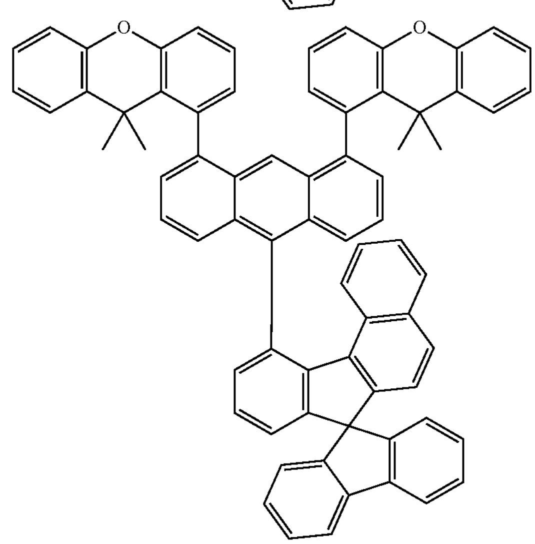

-continued
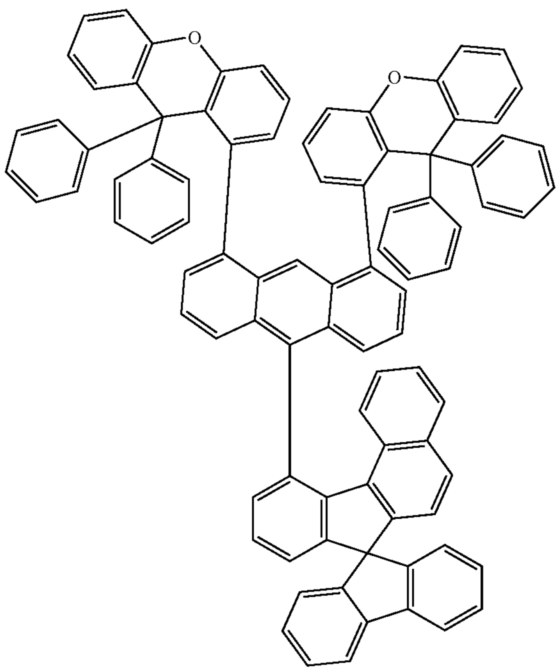
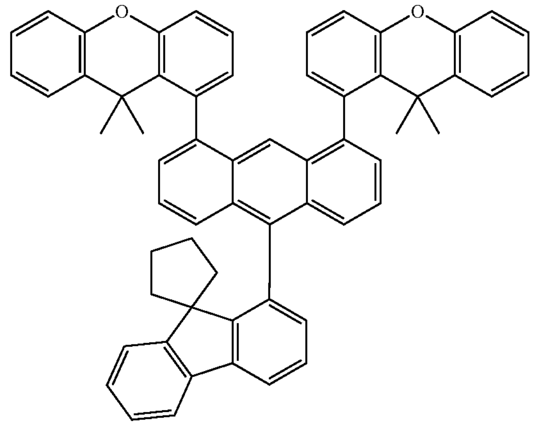
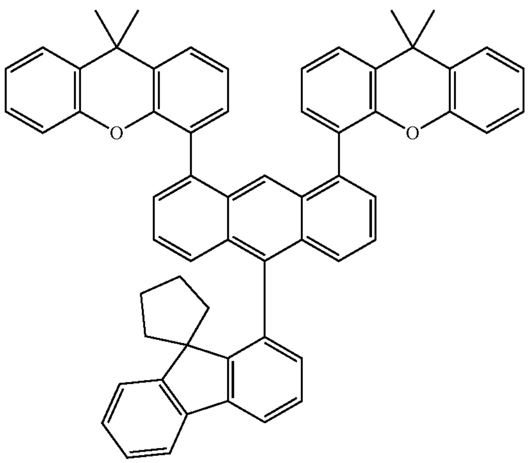
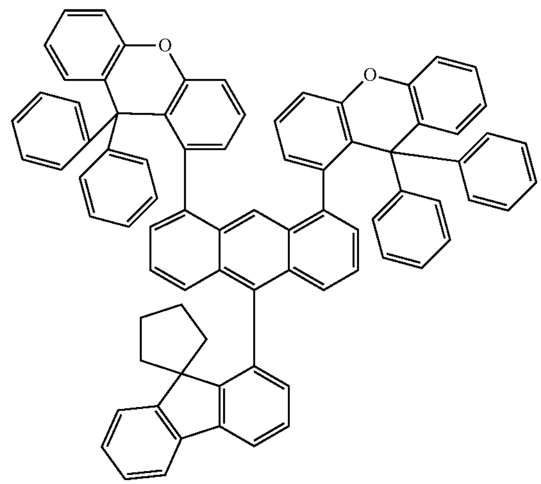
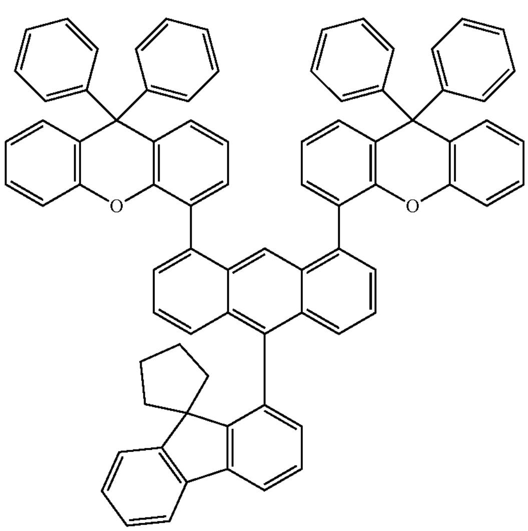
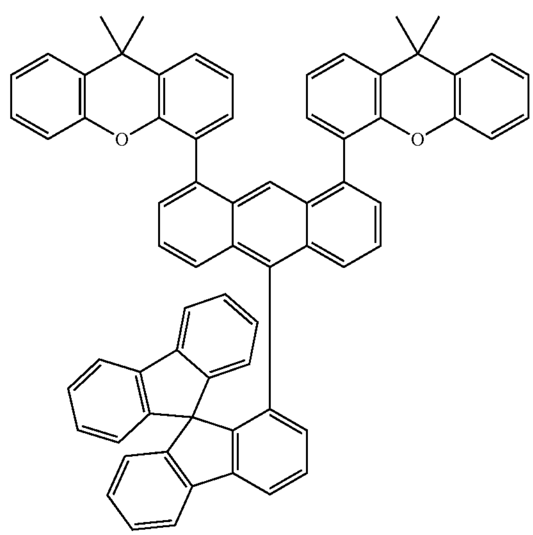
-continued

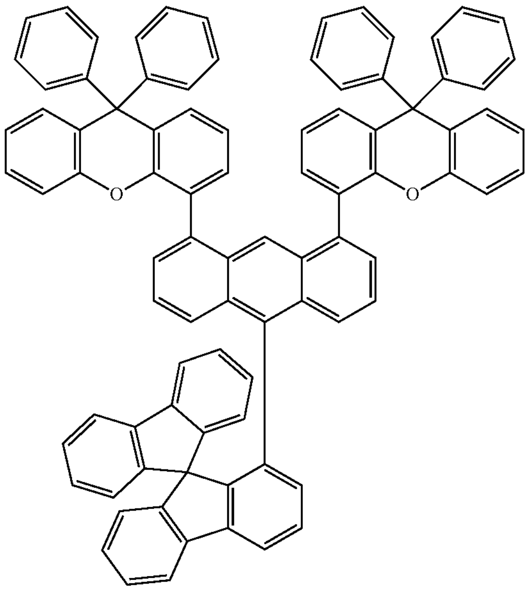
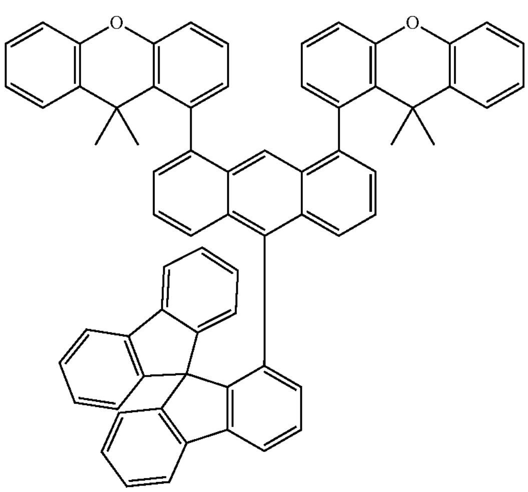
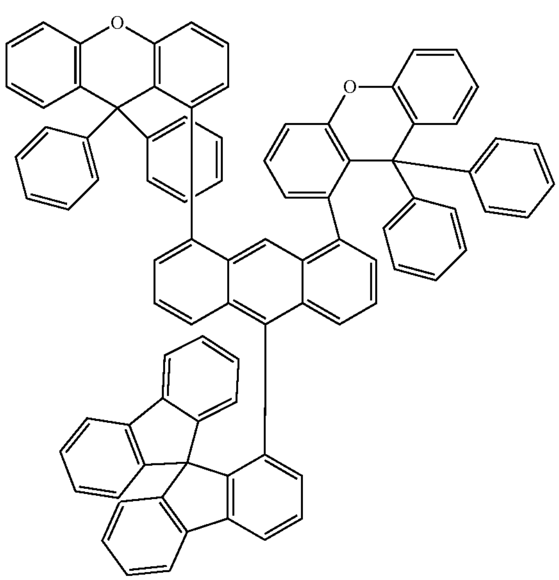
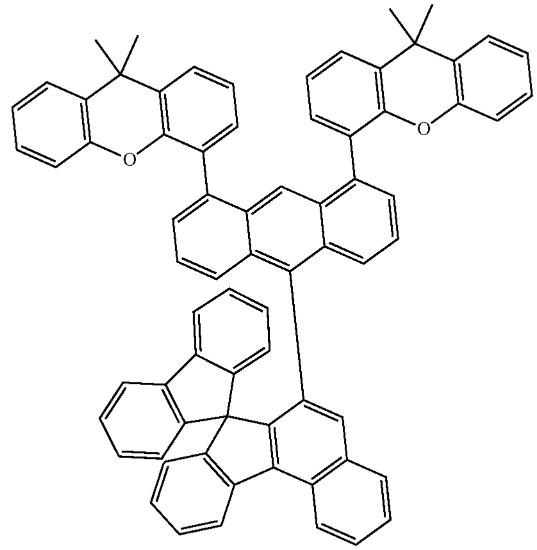
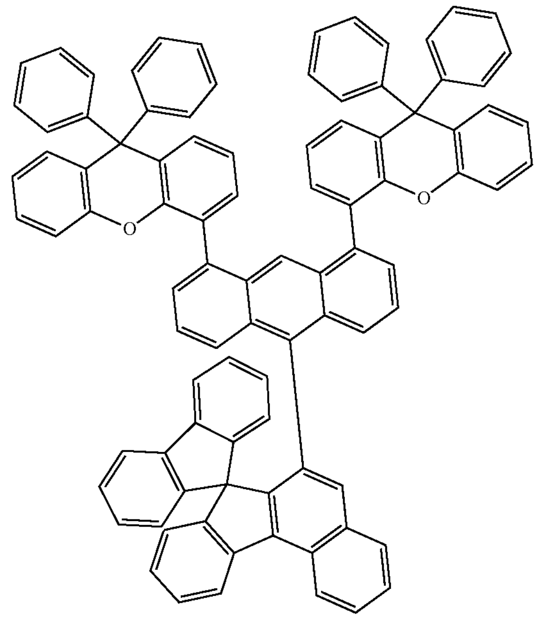
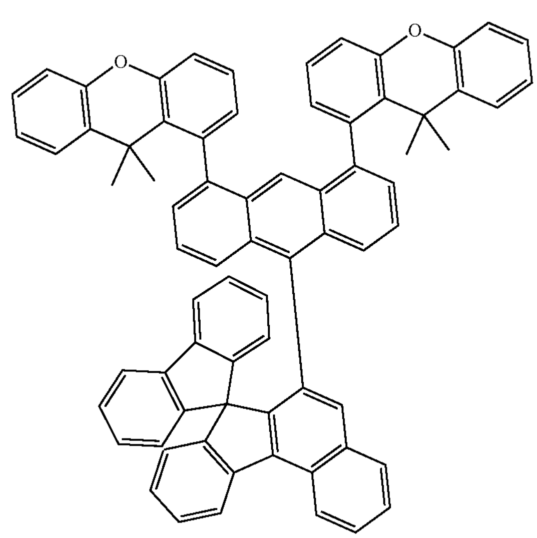

-continued
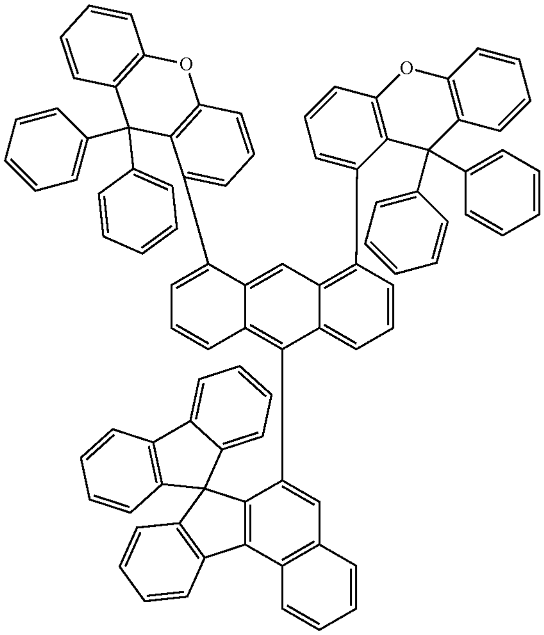
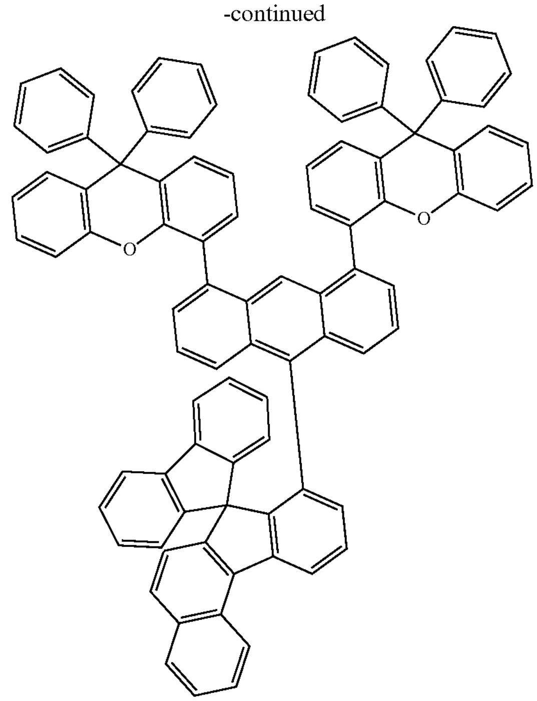
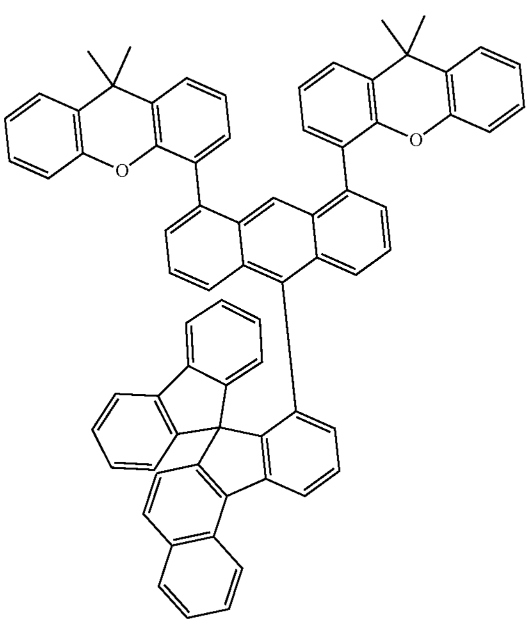
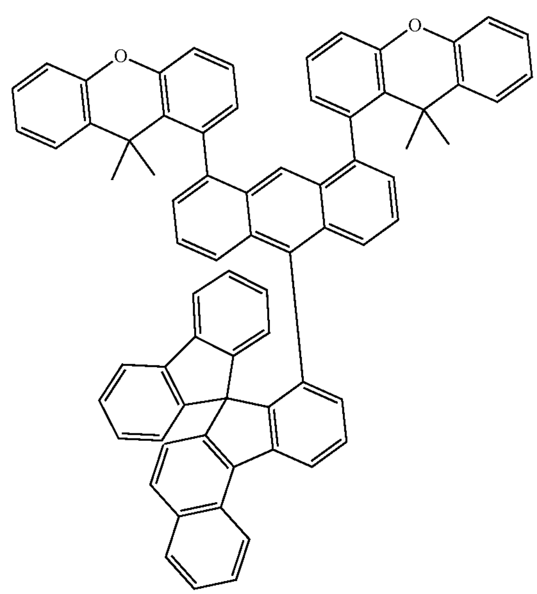

-continued
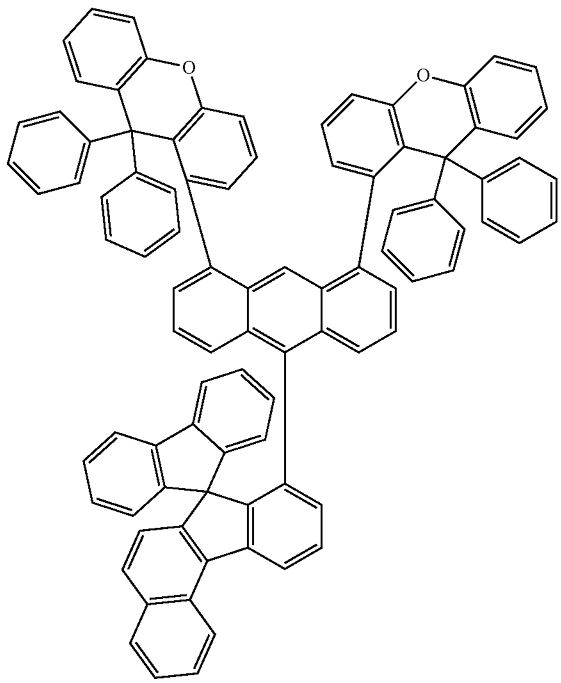 [SMILES: c1ccc(C2(c3ccccc3)c3ccccc3Oc3cccc(-c4cccc5c(-c6cccc7c6C6(c8ccccc8-c8ccccc86)c6ccc8ccccc8c6-7)c6cccc(-c7cccc8c7C(c7ccccc7)(c7ccccc7)c7ccccc7O8)c6cc45)c32)cc1]
-continued
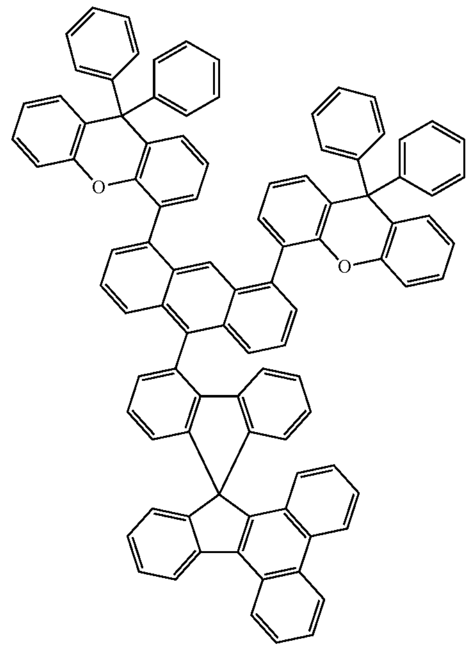
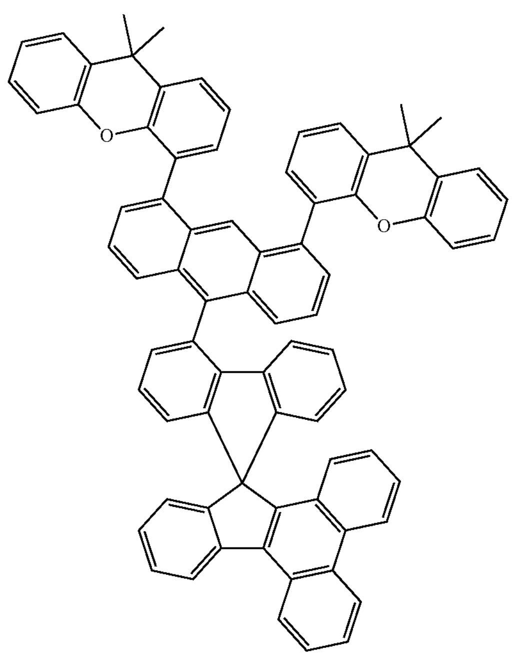
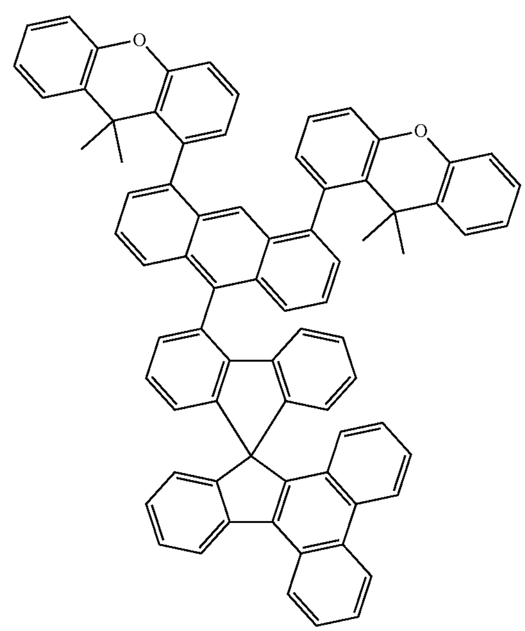

-continued
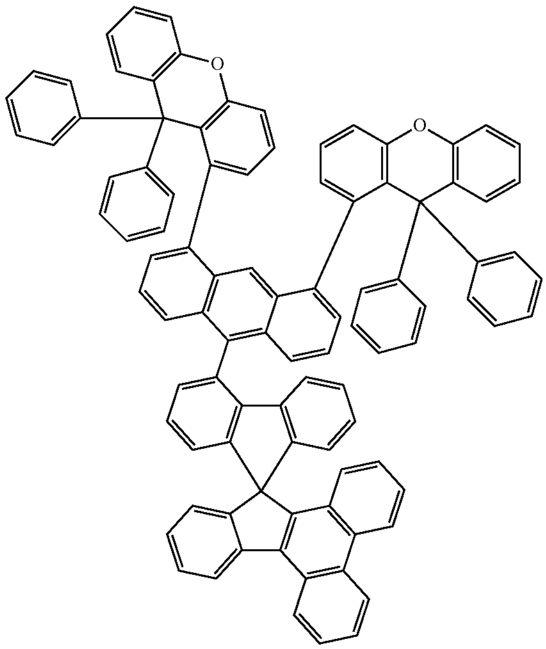
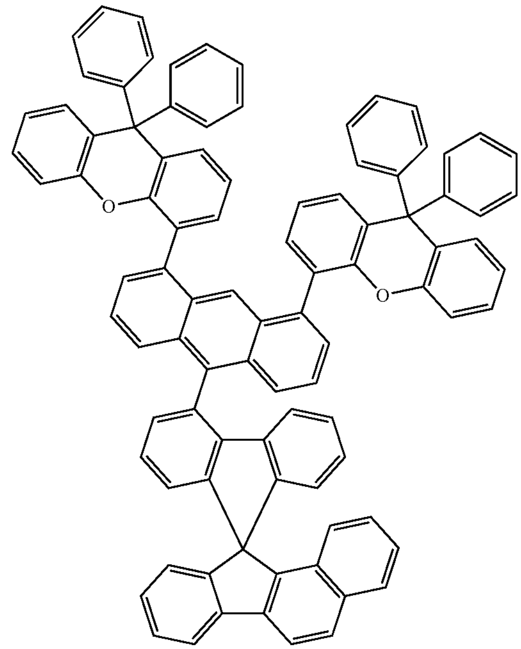
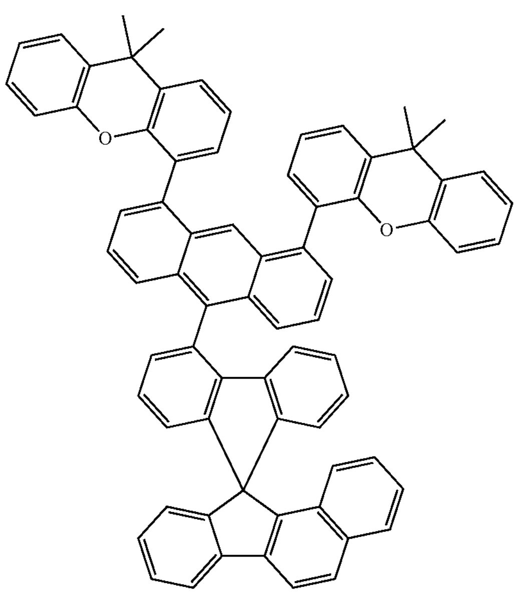
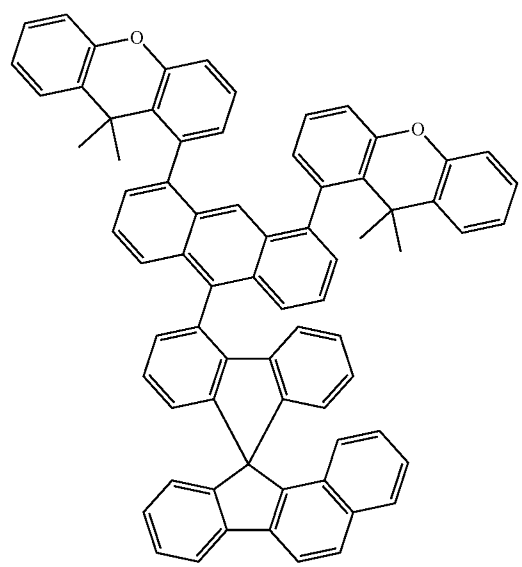

-continued
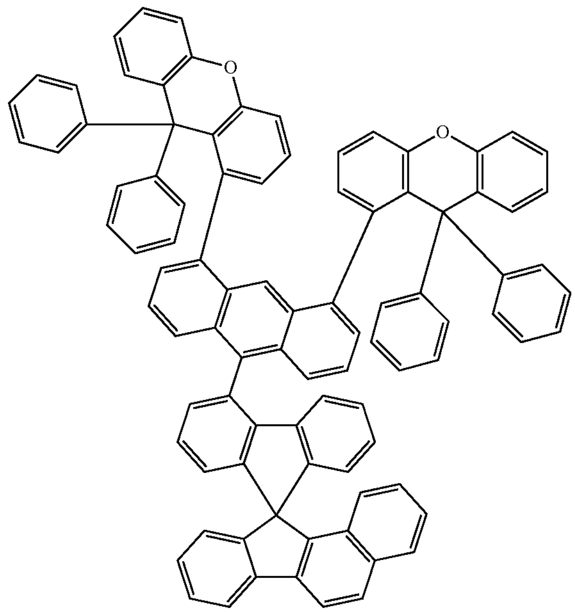
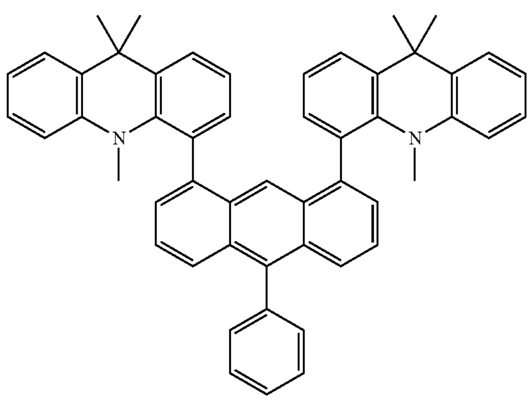
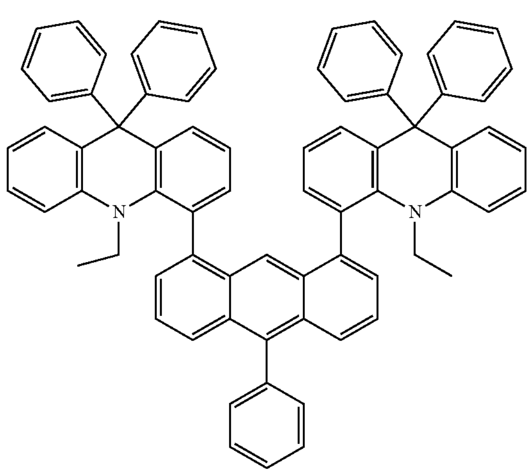
-continued
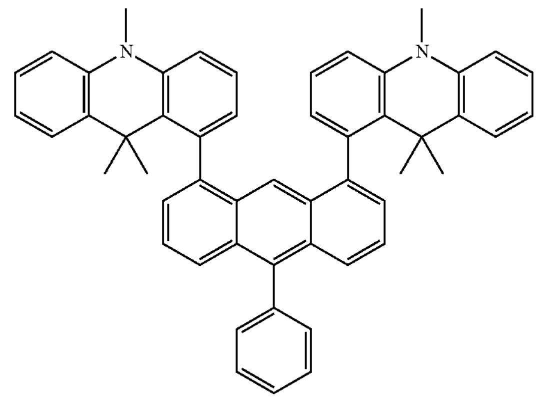
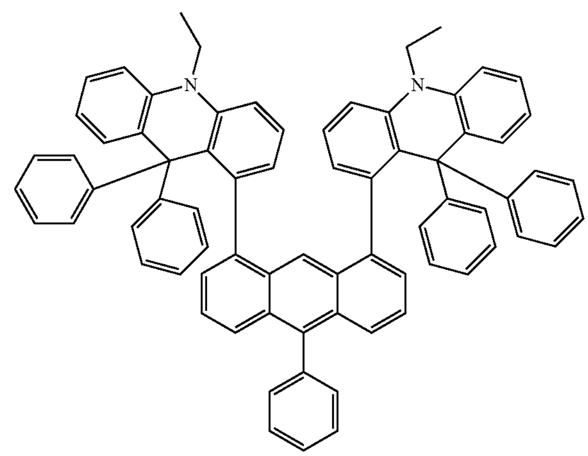
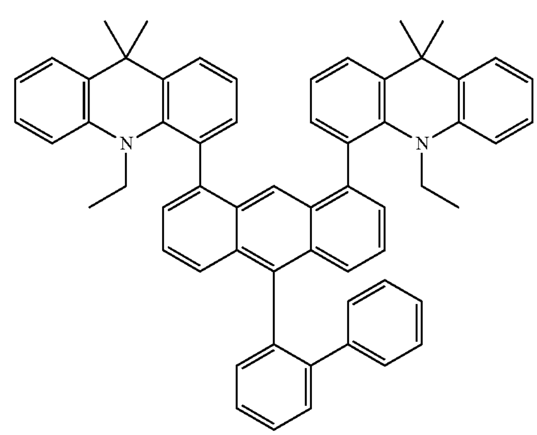

-continued
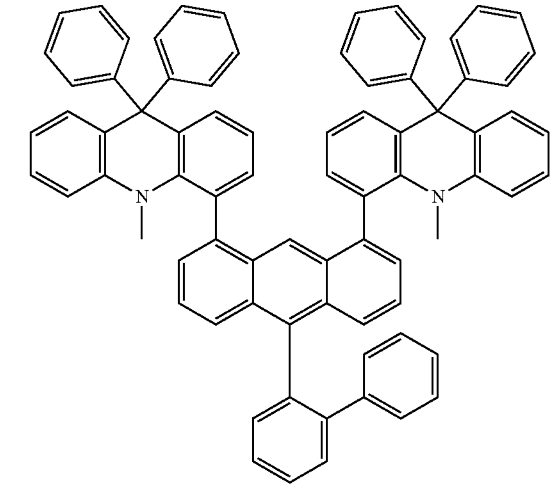
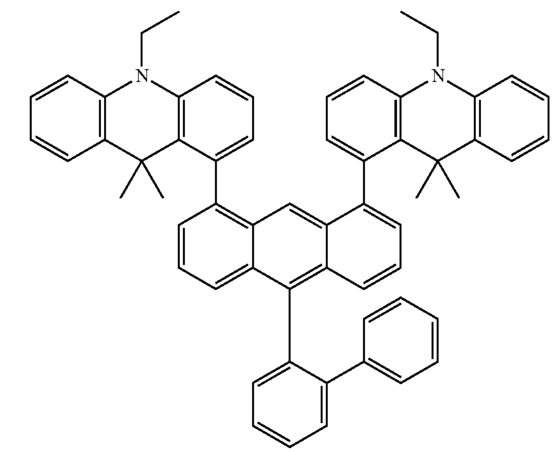
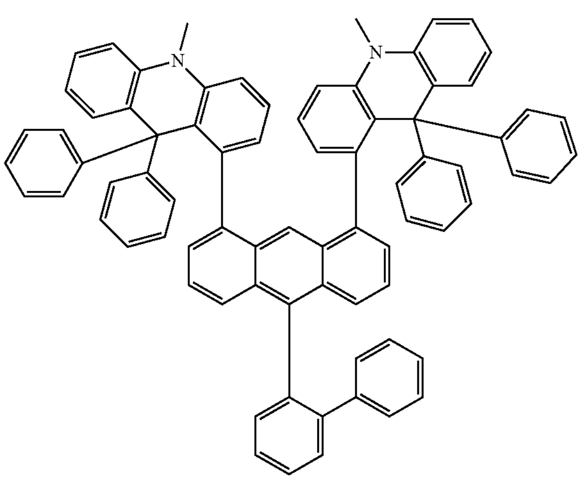
-continued
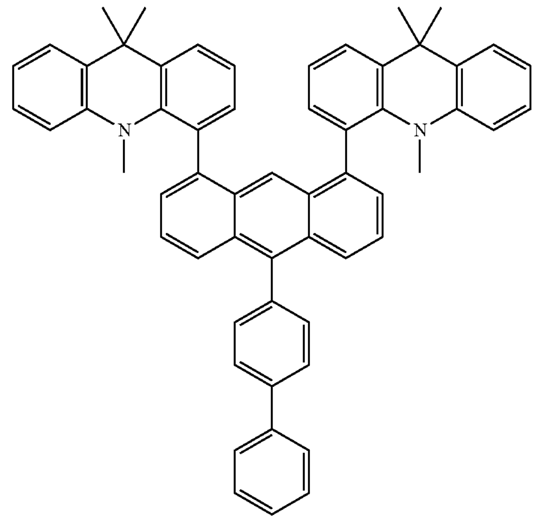
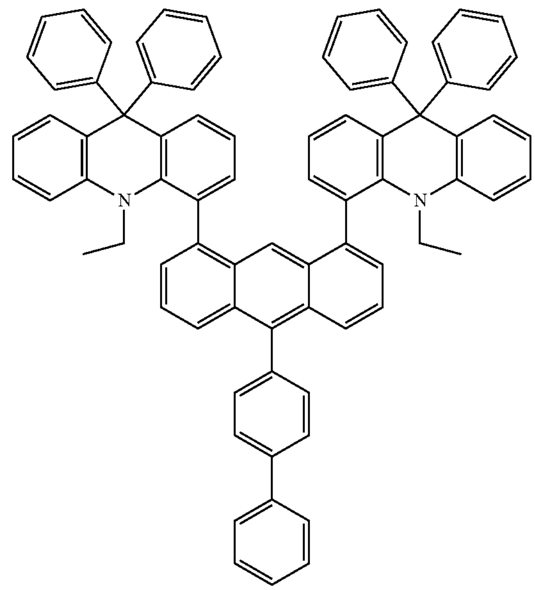
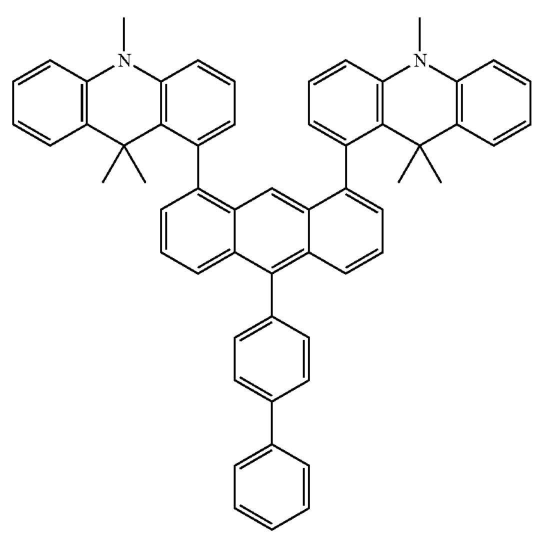

-continued
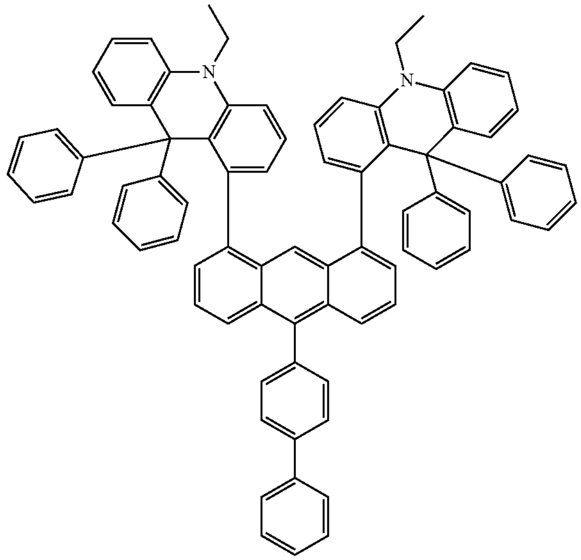
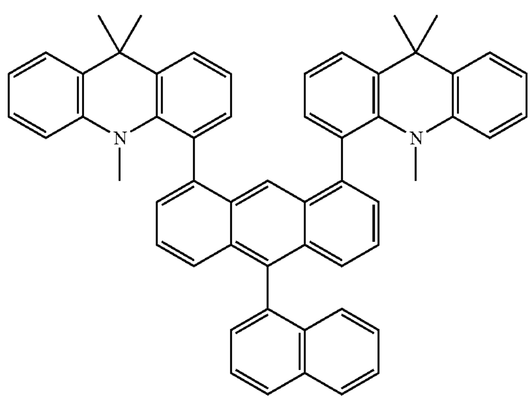
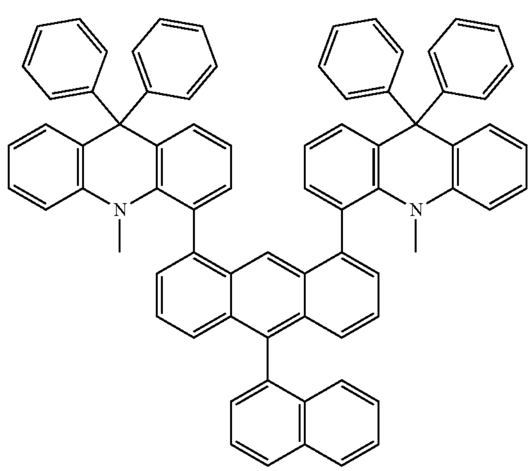
-continued
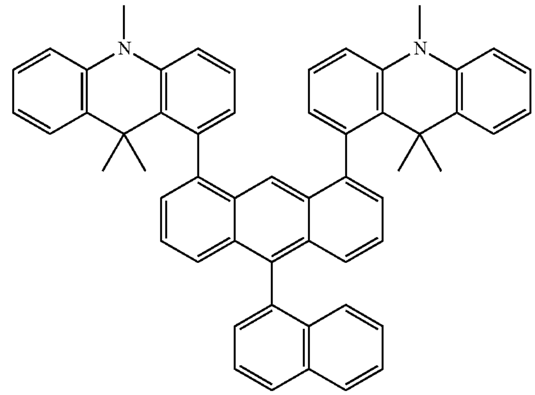
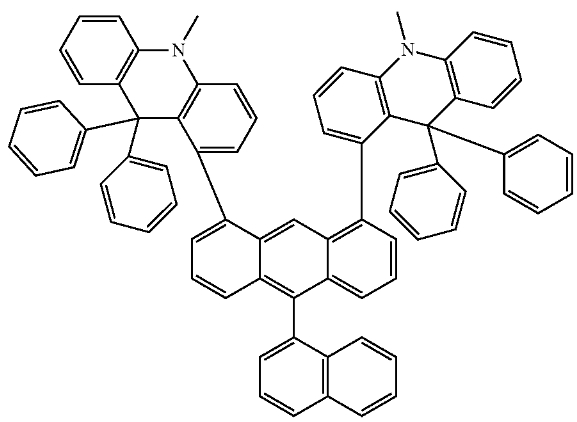
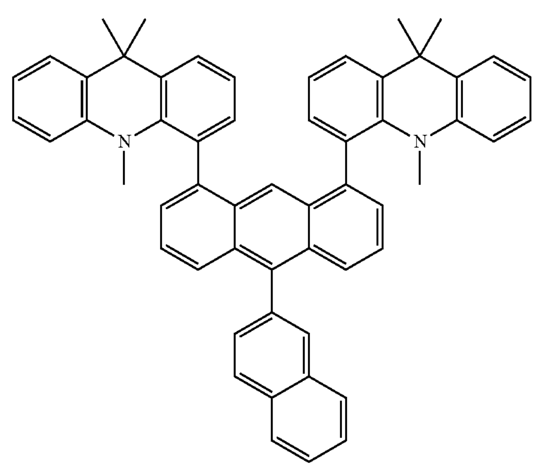

-continued
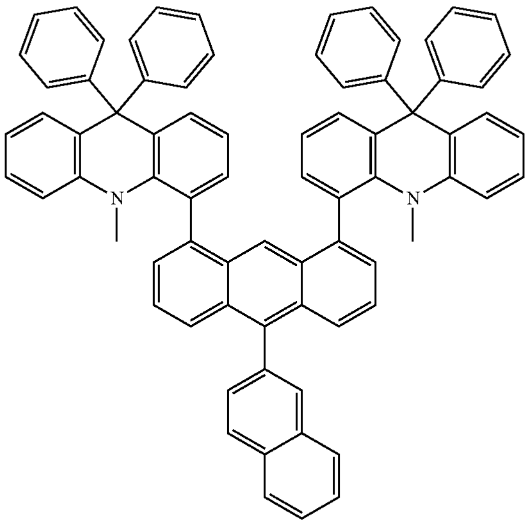
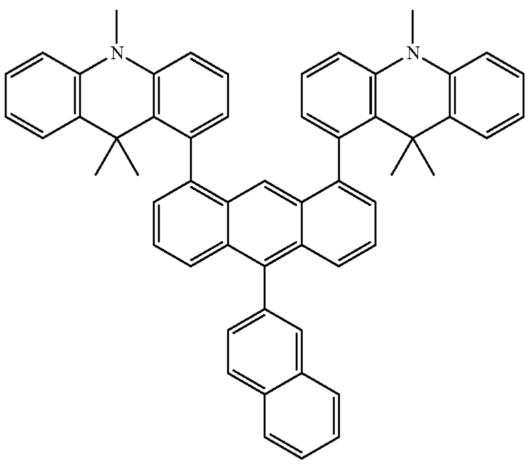
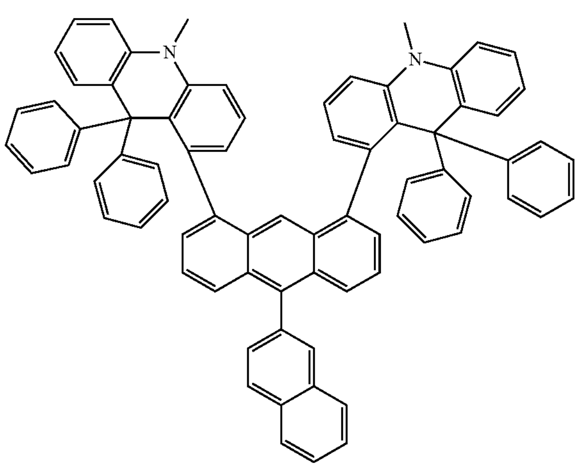
-continued
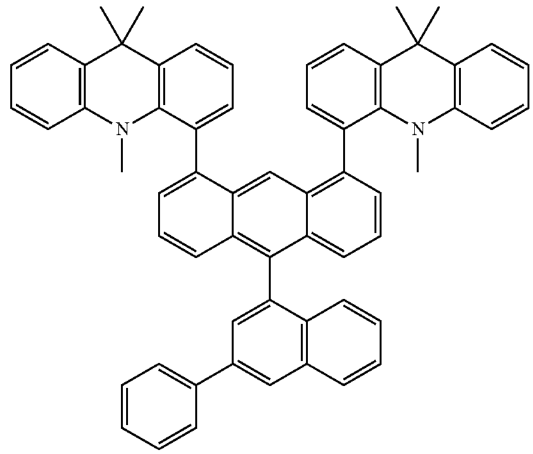
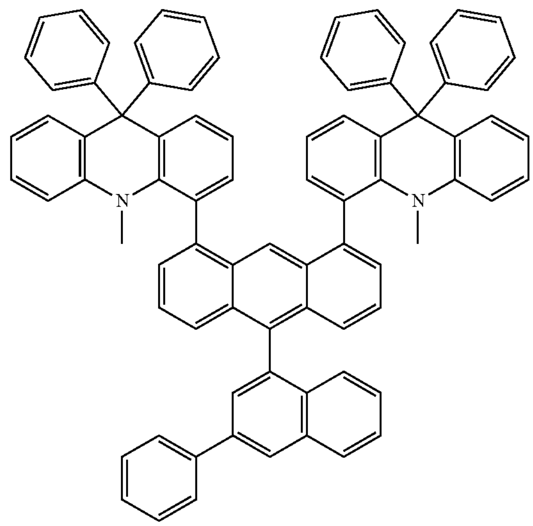
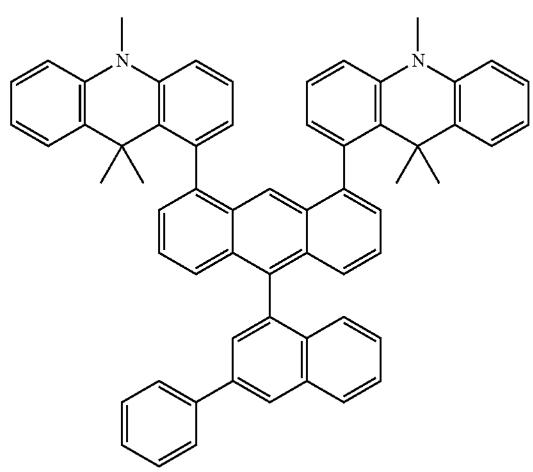

-continued
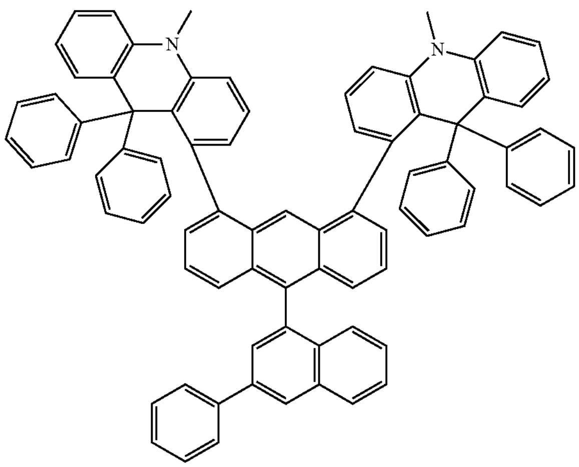
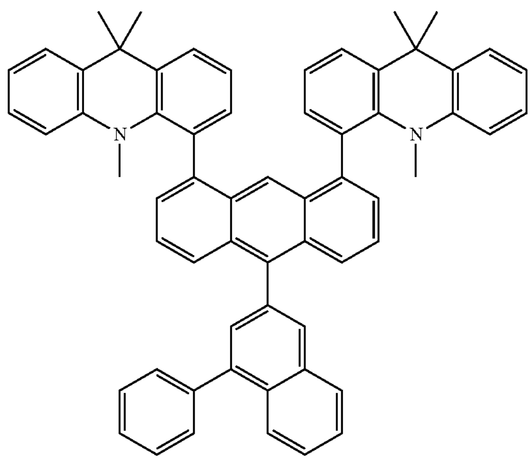
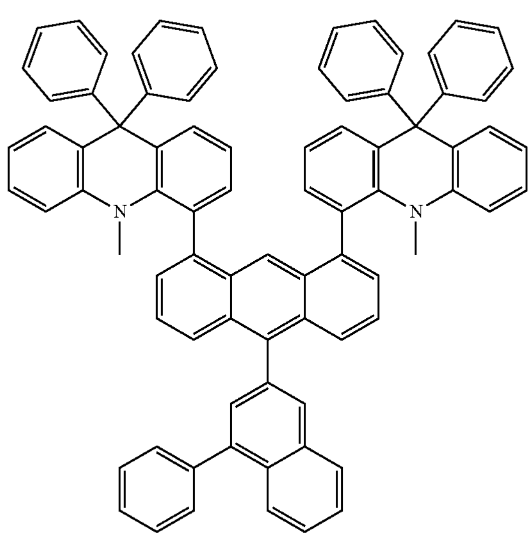
-continued
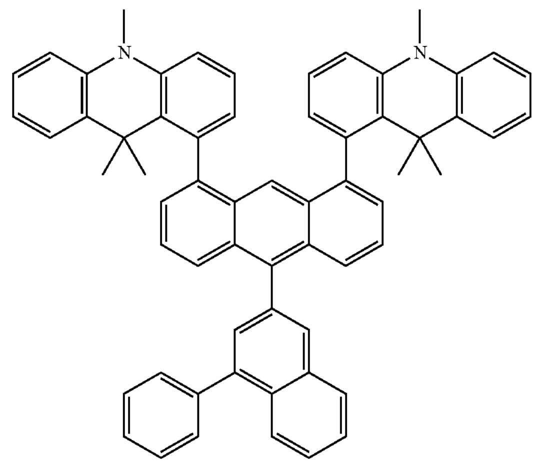
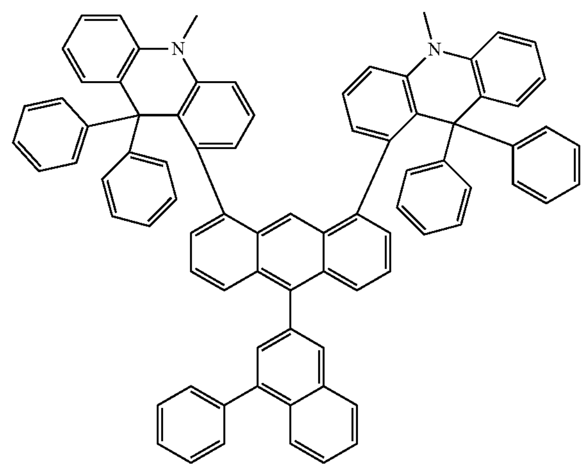
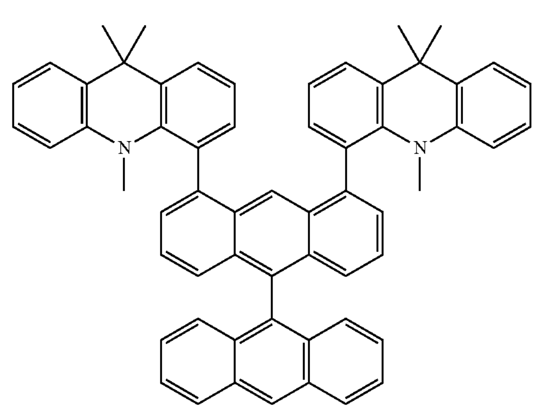

-continued
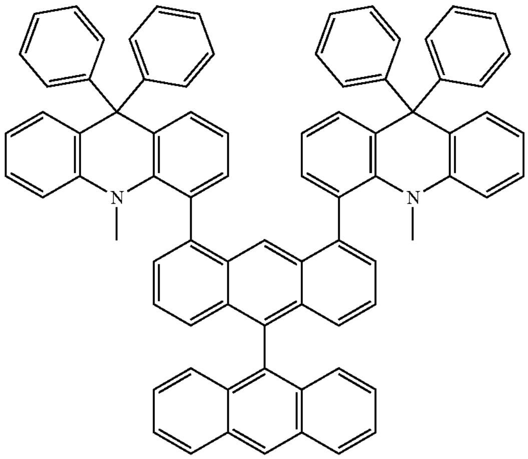
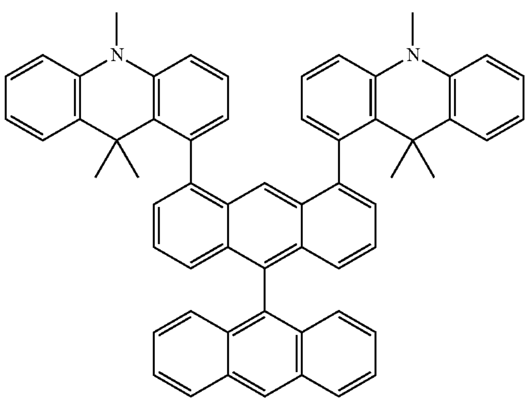
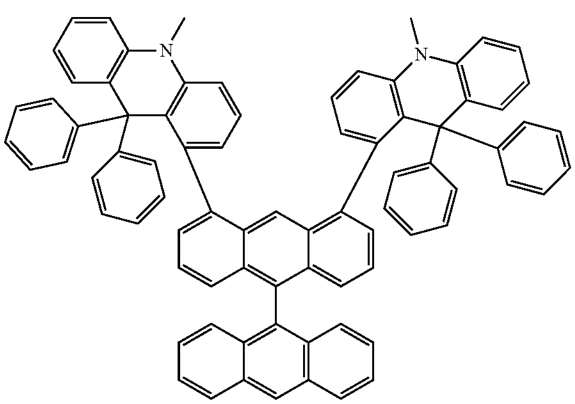
-continued
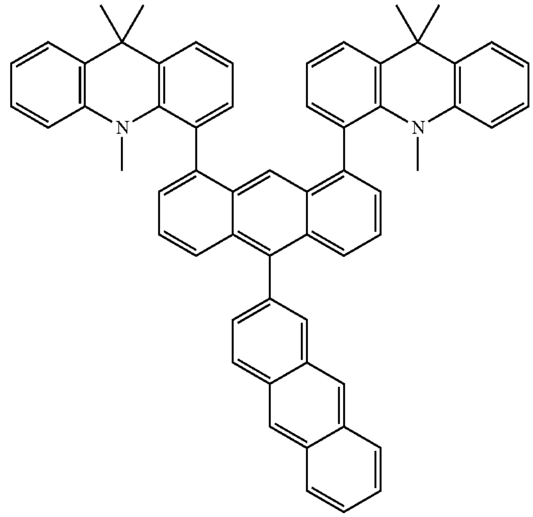
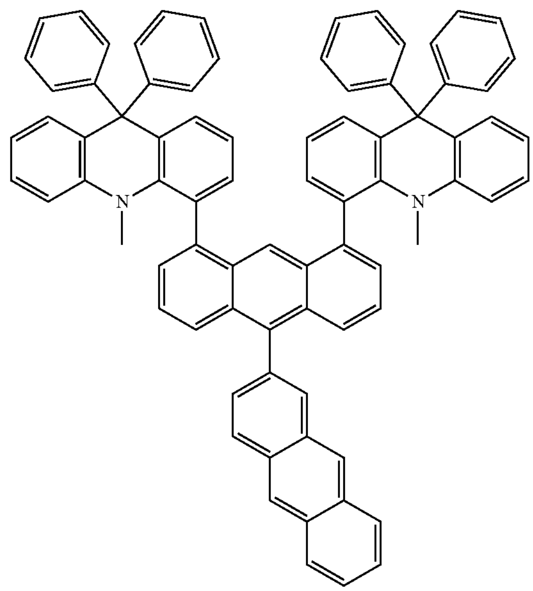
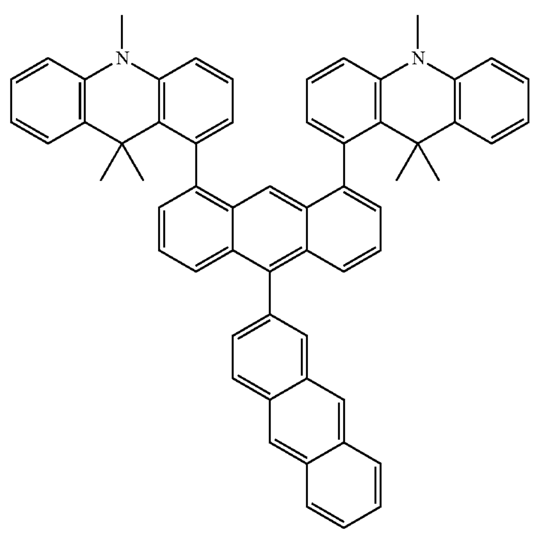

-continued
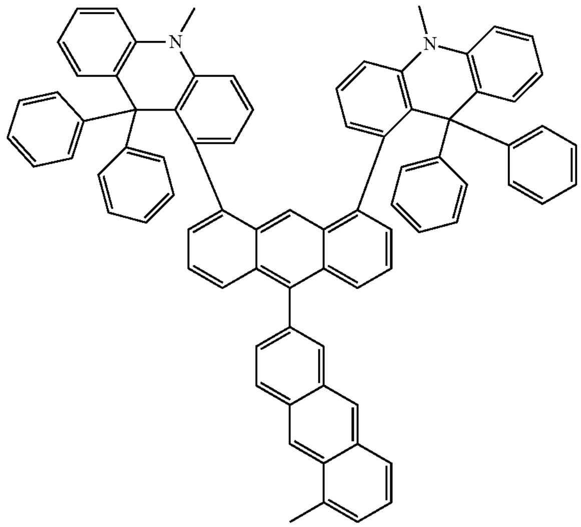
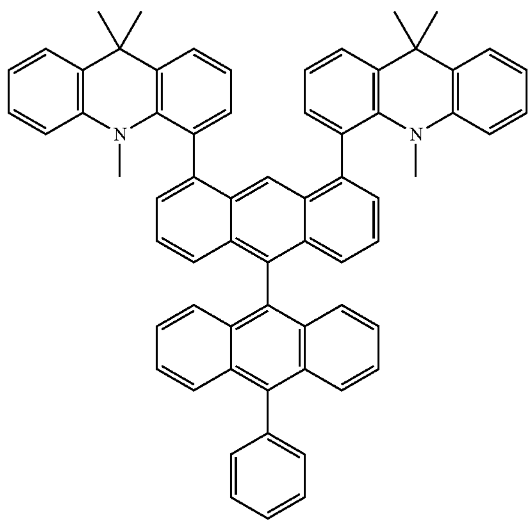
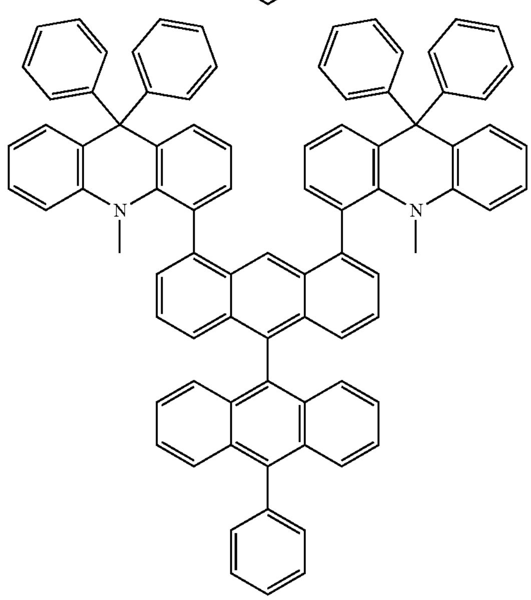
-continued
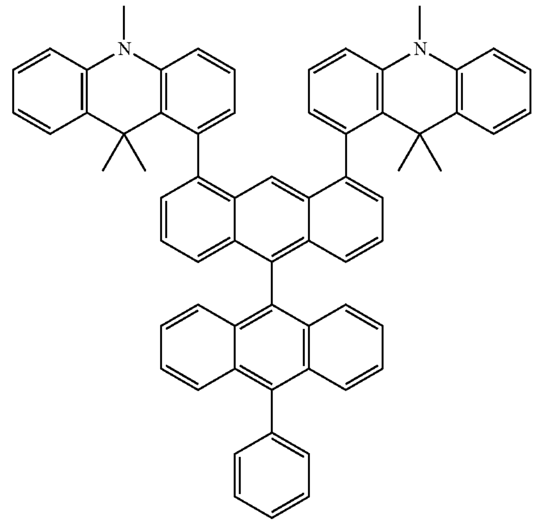
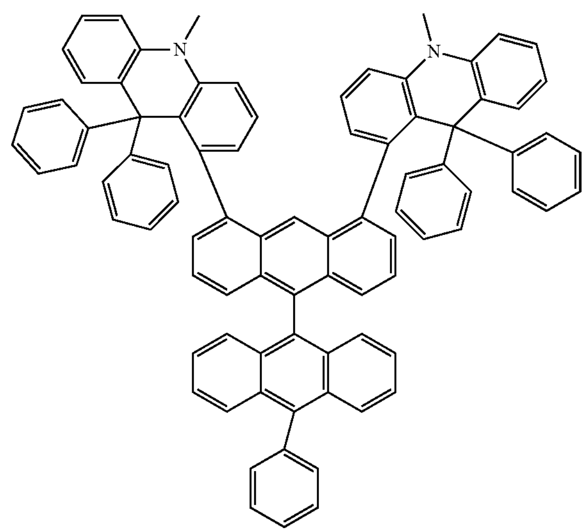
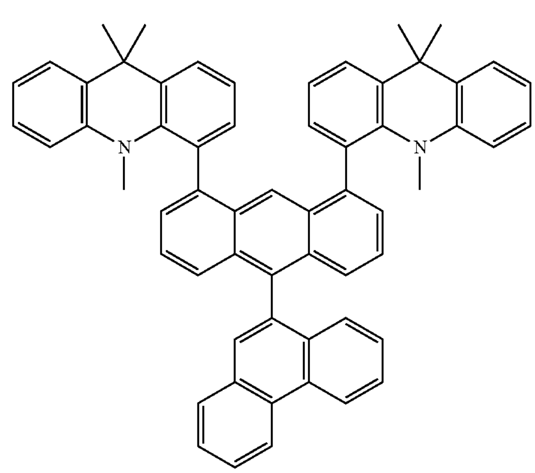

-continued
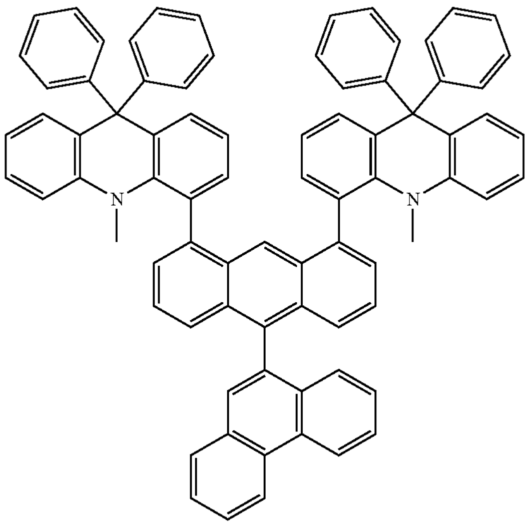
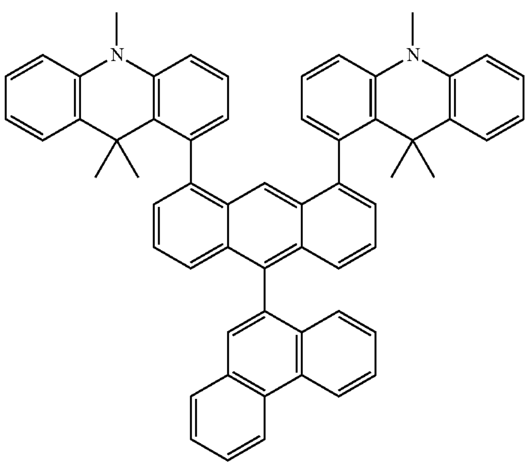
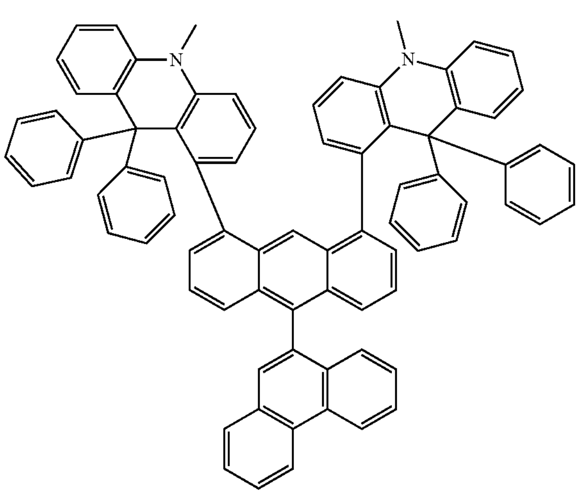
-continued
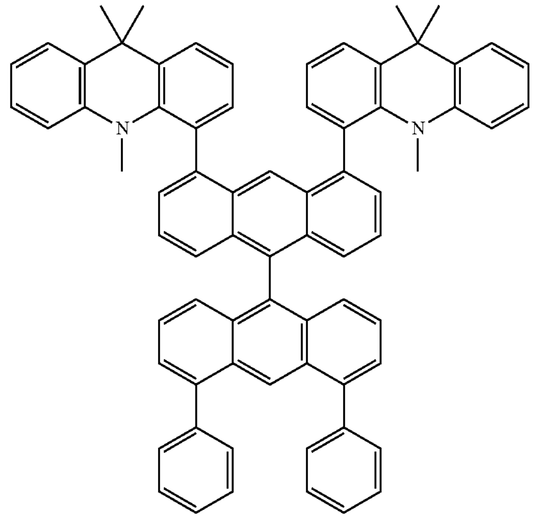
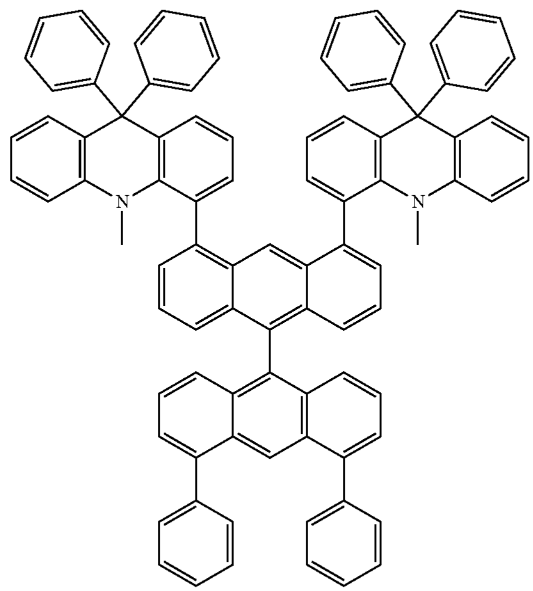
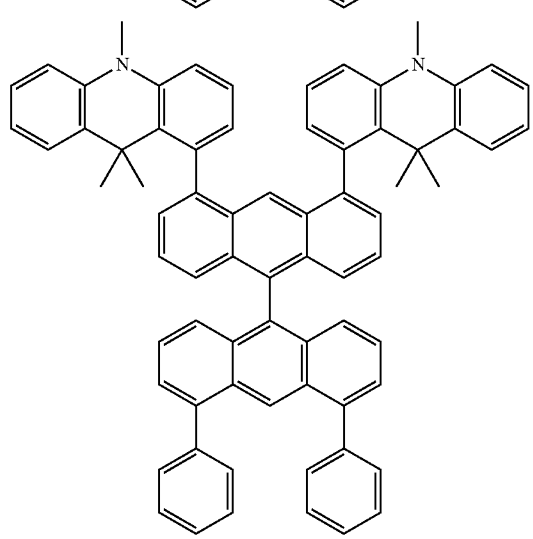

-continued
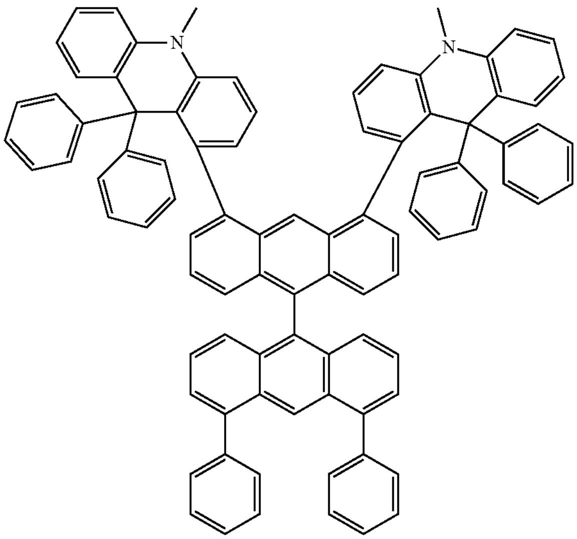
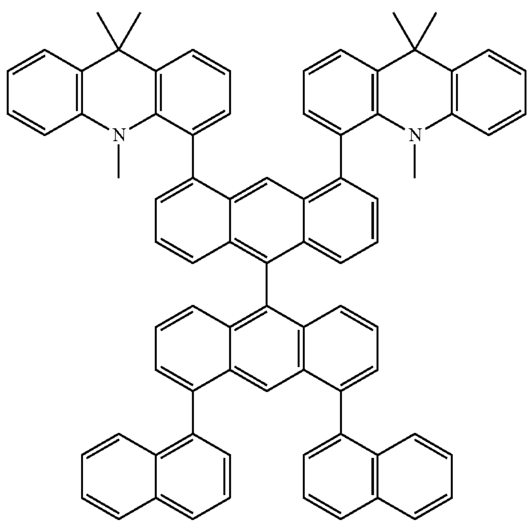
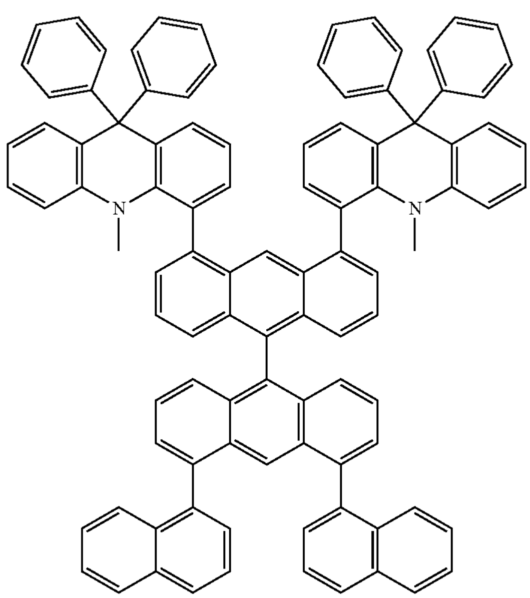
-continued
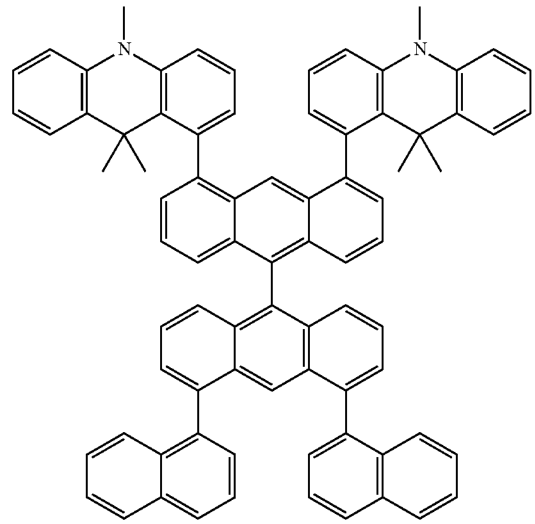
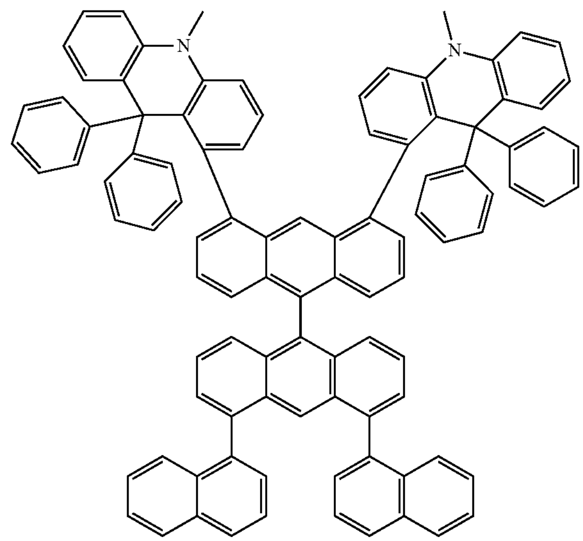
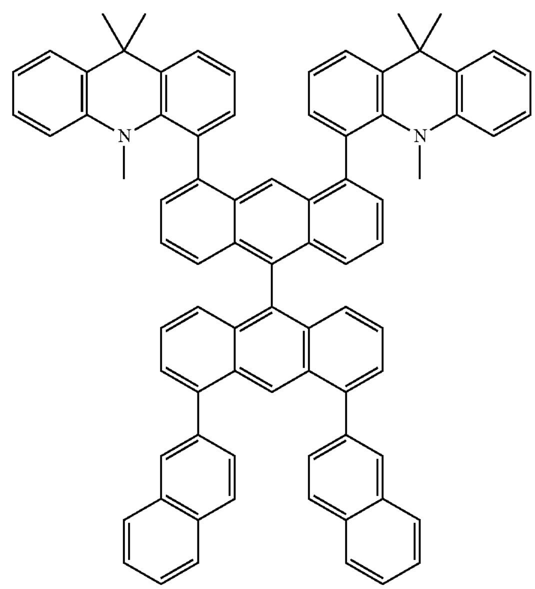

-continued
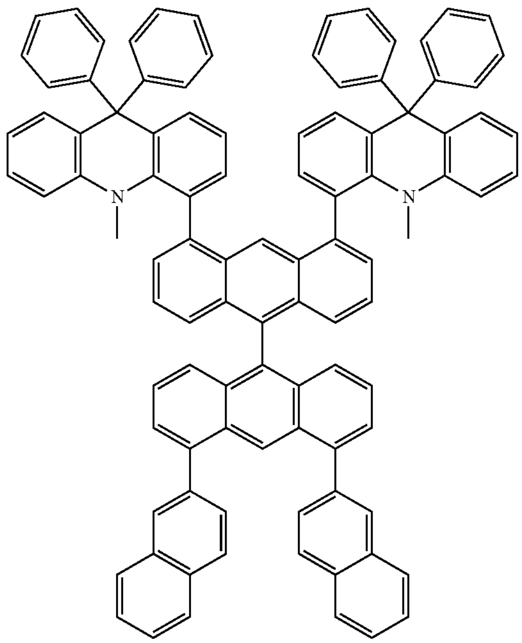
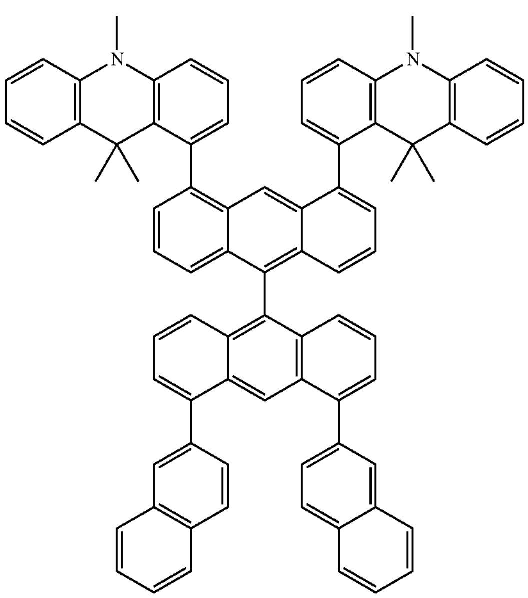
-continued
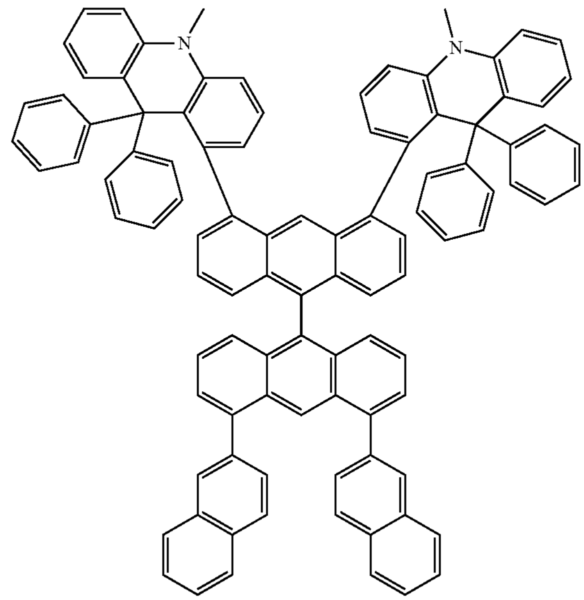
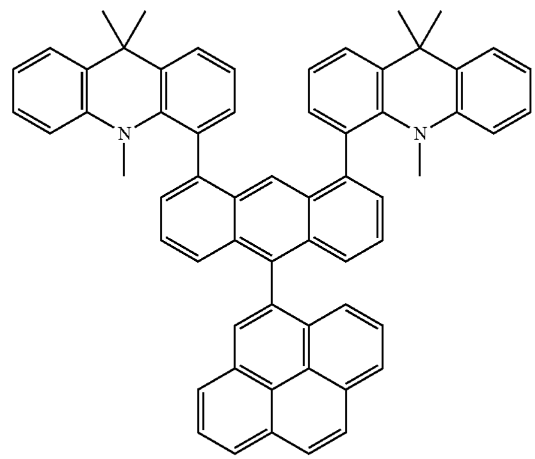
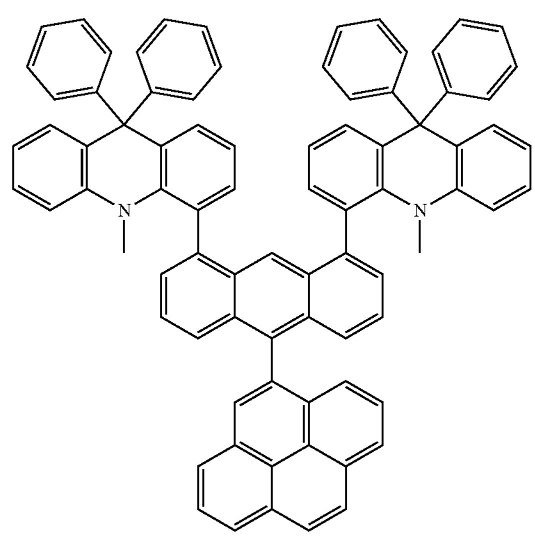

-continued
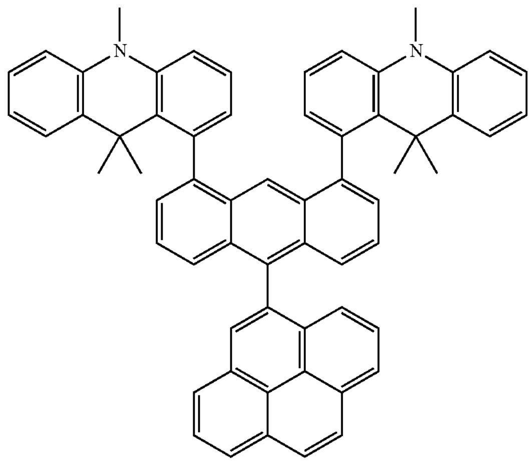
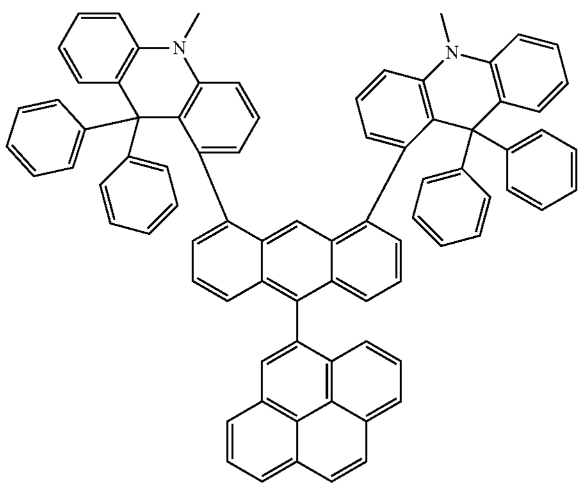
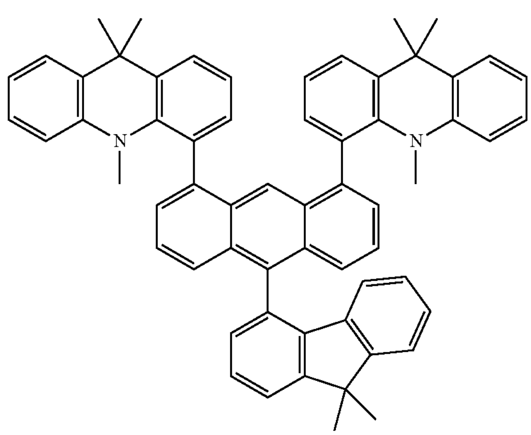
-continued
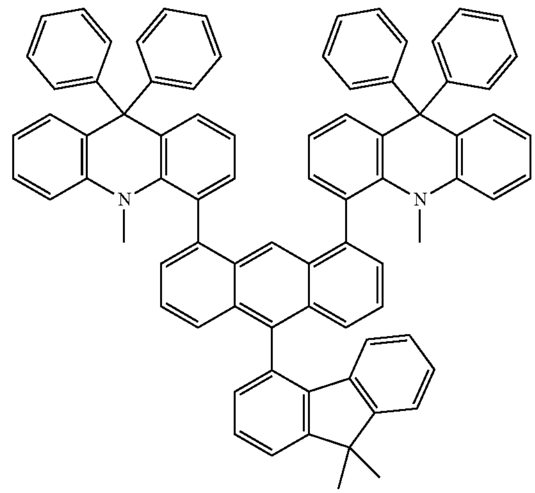
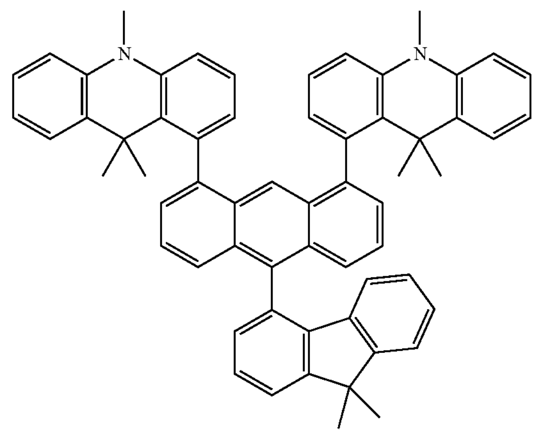
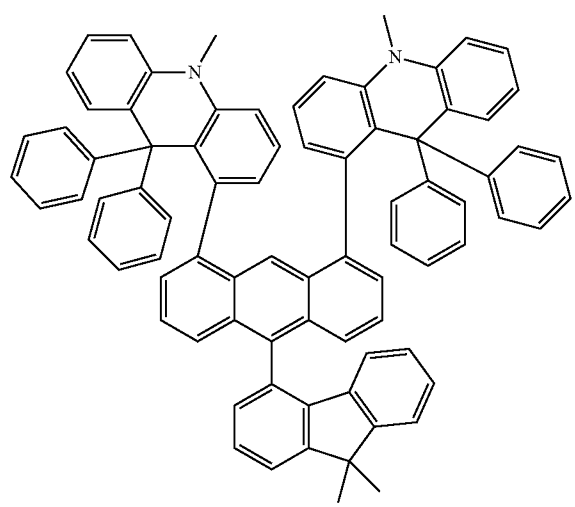

-continued
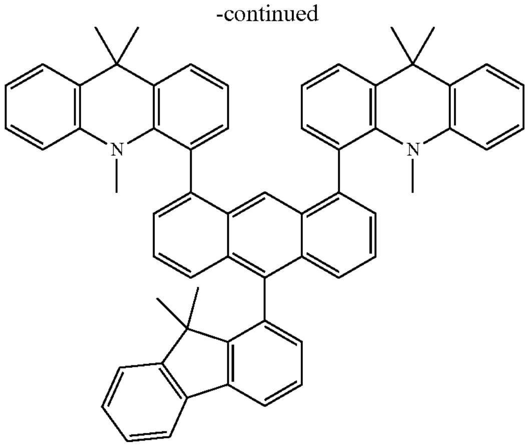
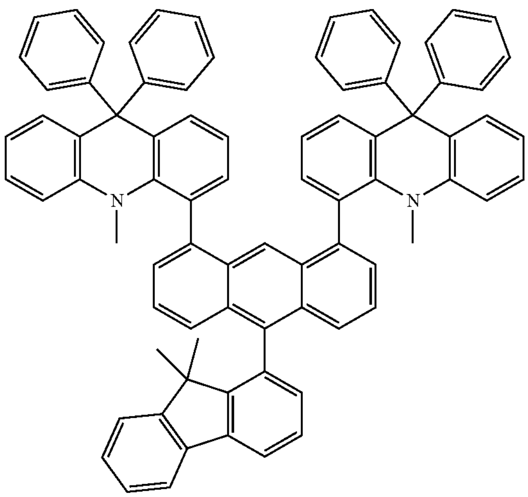
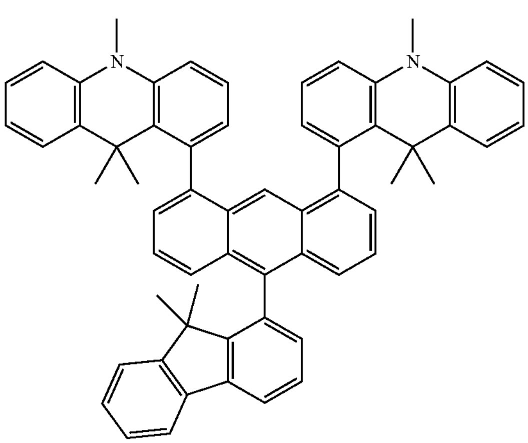
-continued
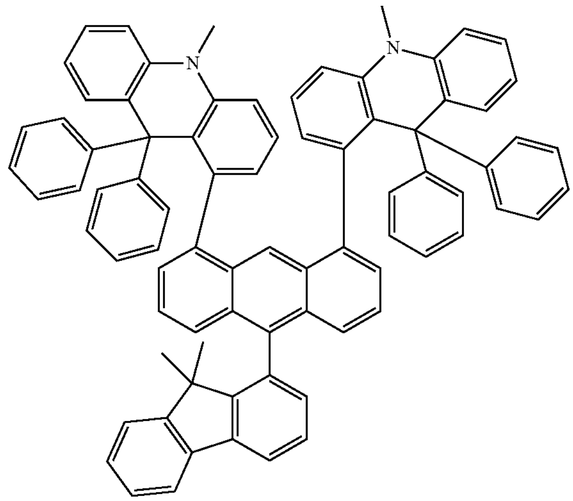
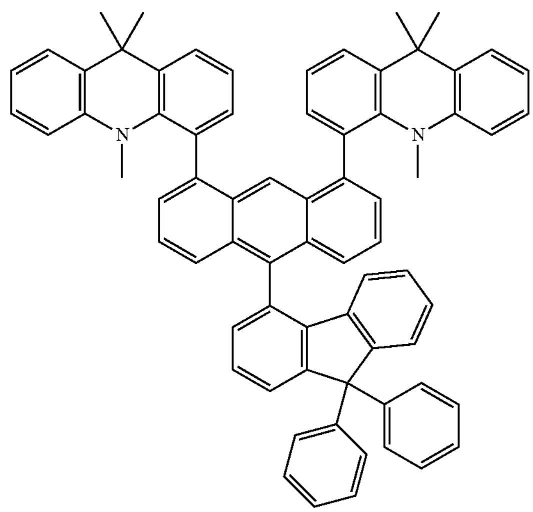
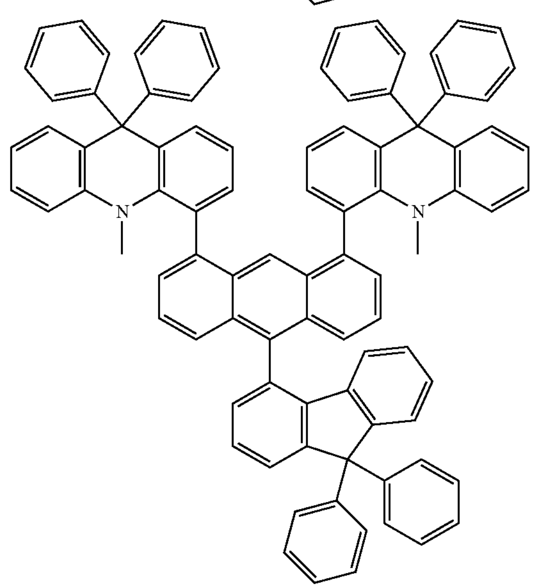

-continued
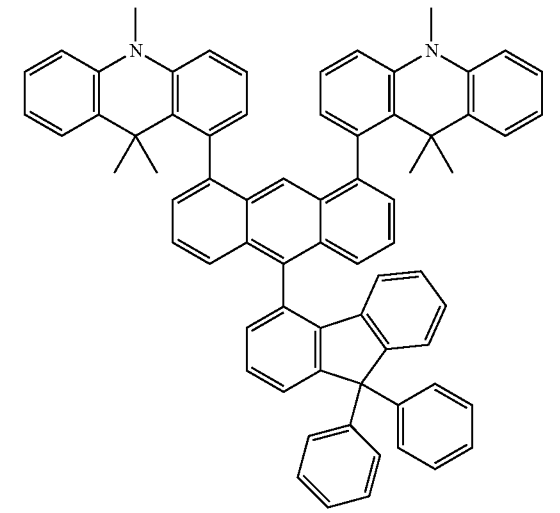
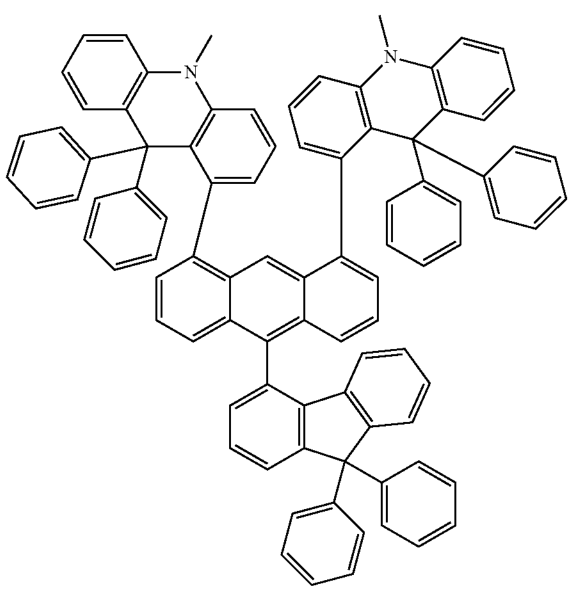
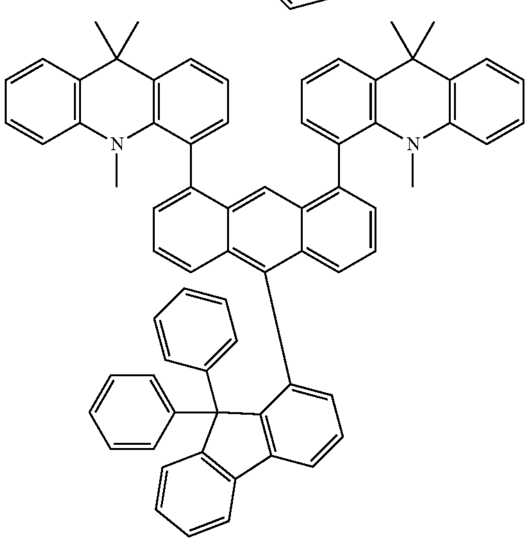
-continued
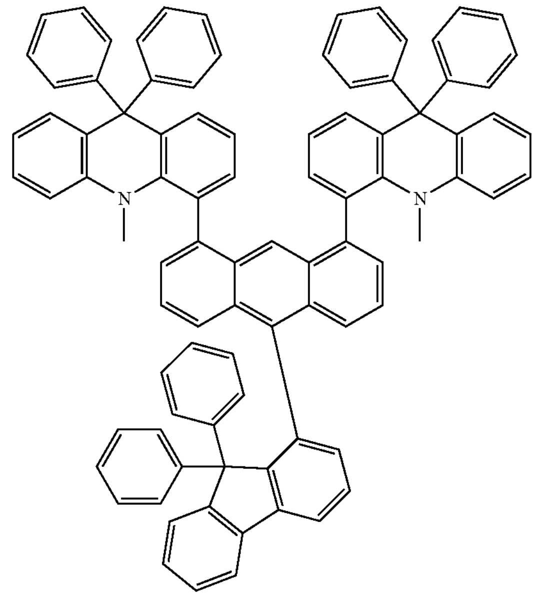
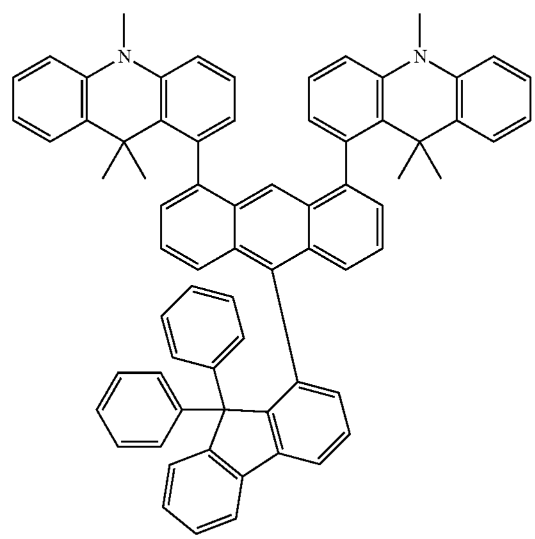
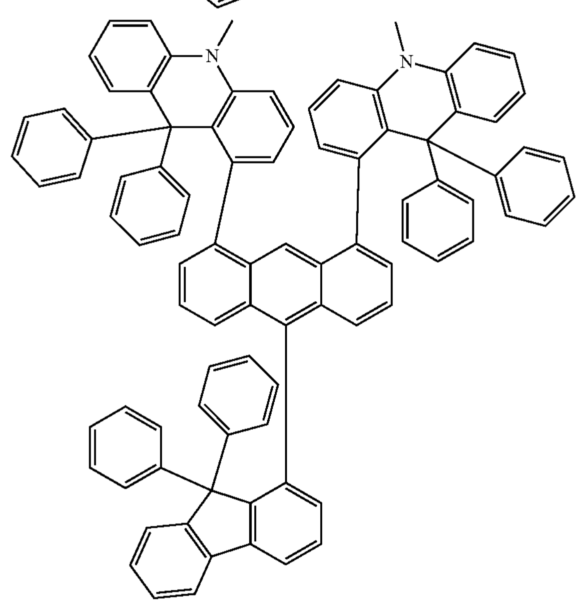

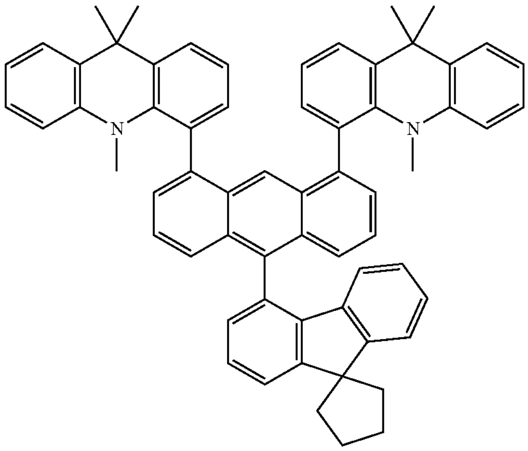
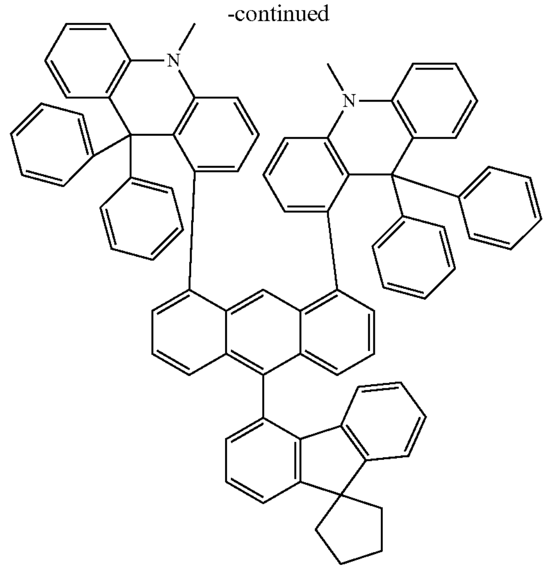
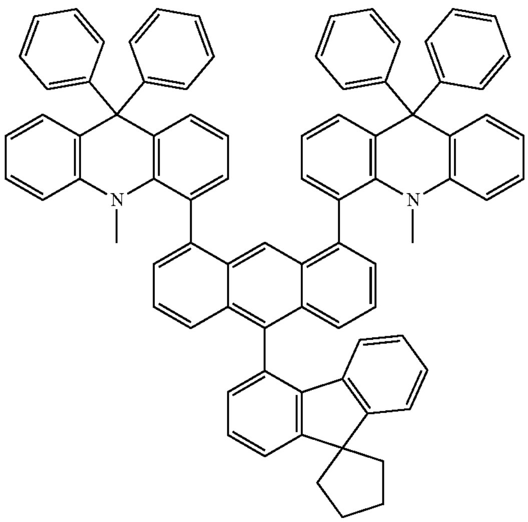
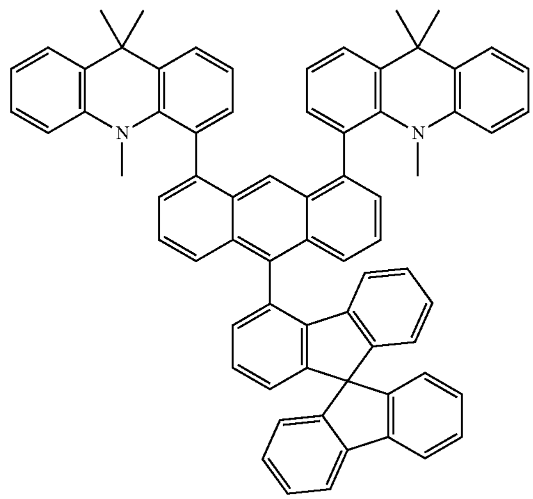
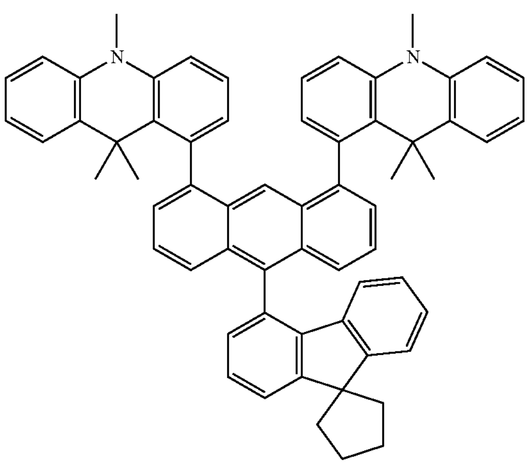
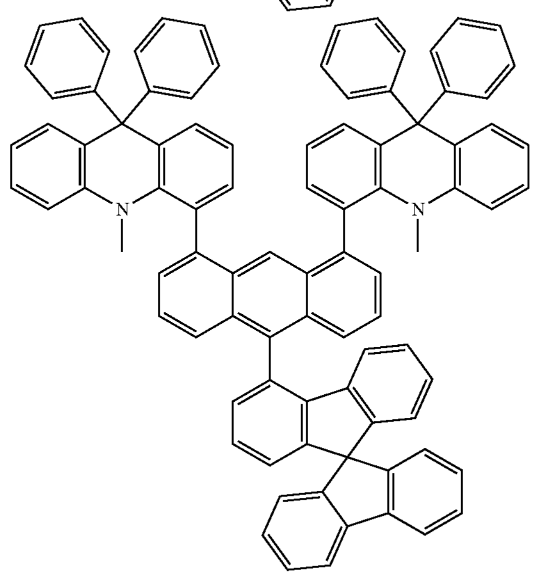

-continued
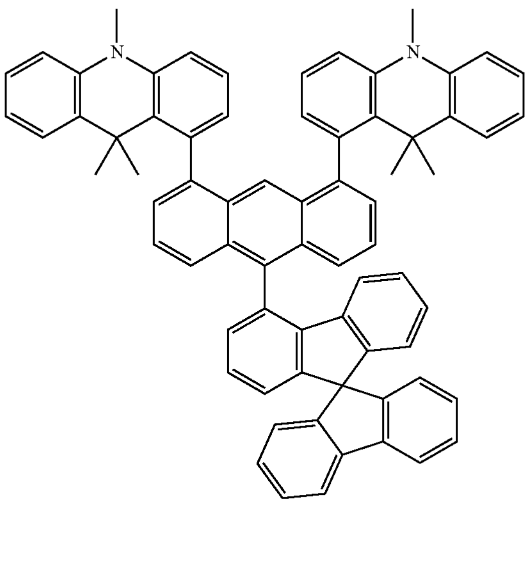
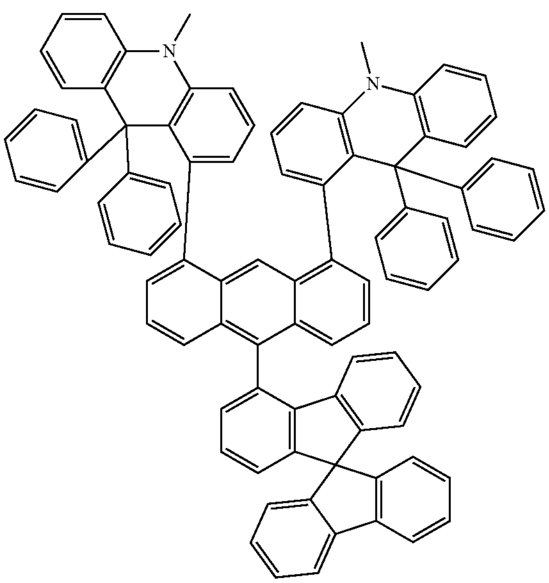
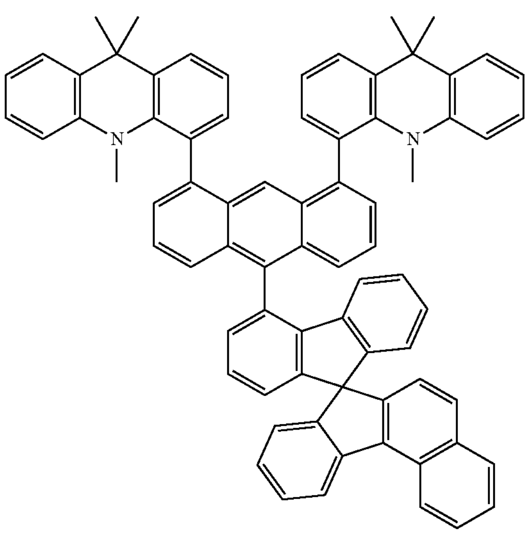
-continued
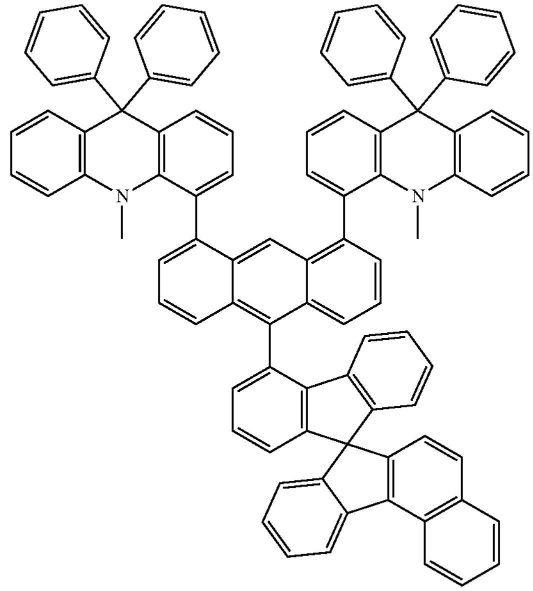
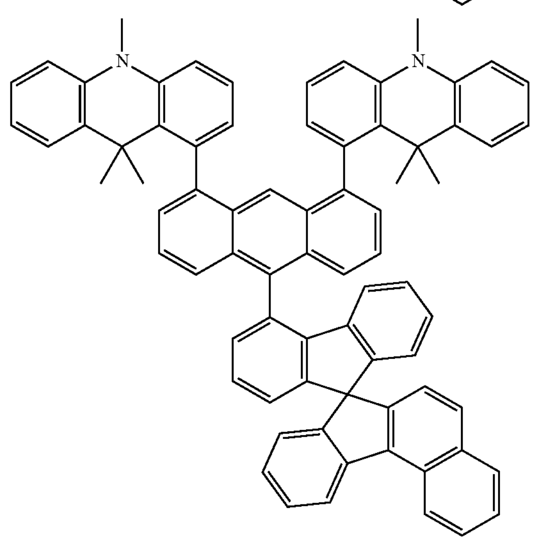
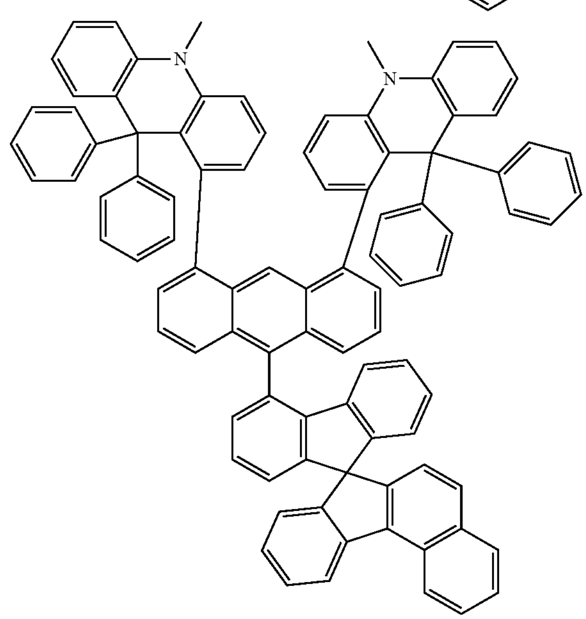

-continued
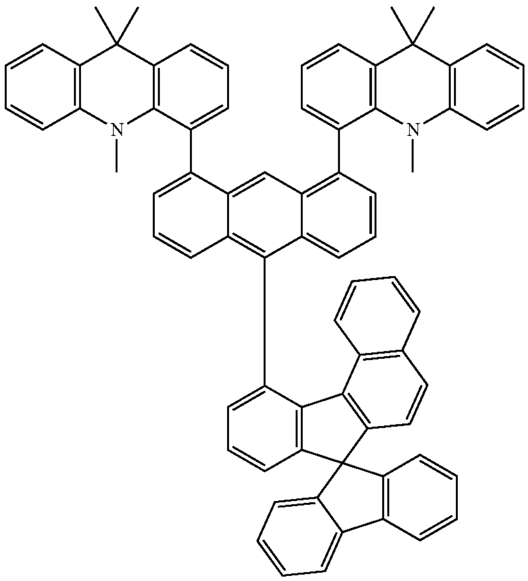
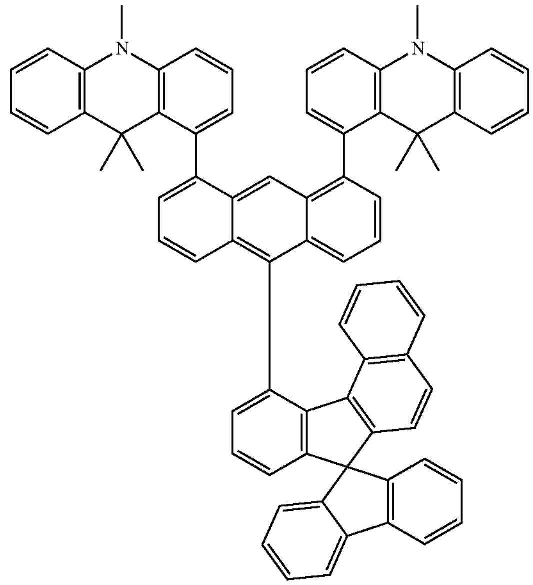
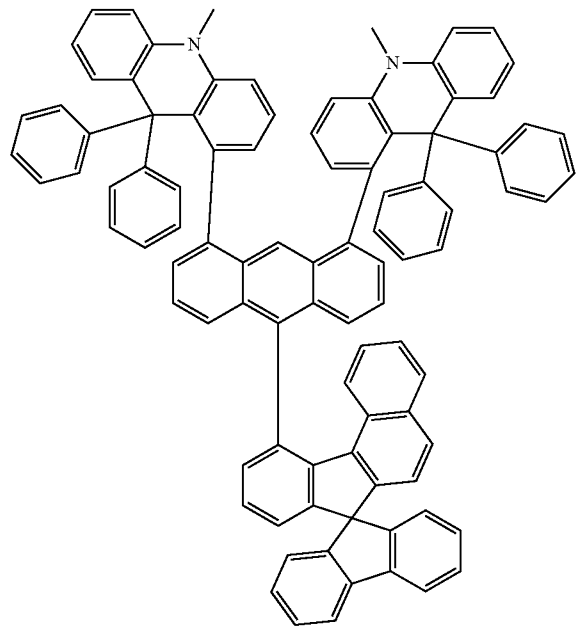
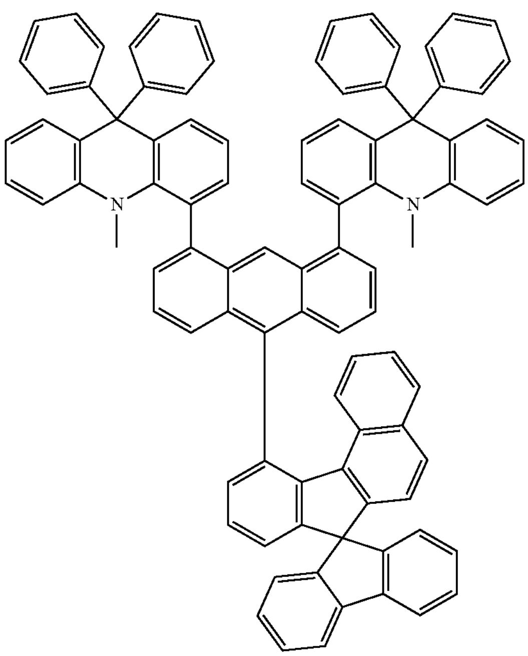
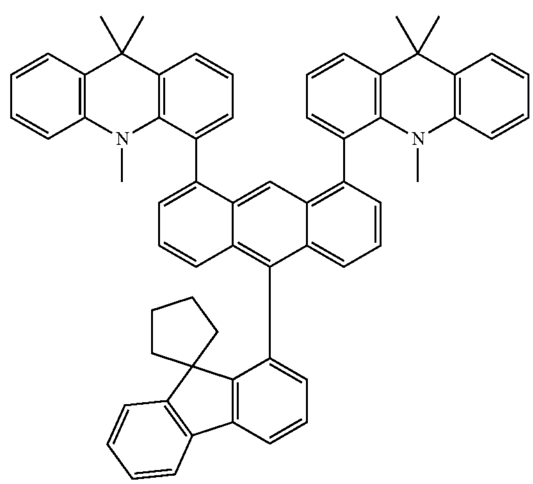
-continued -continued
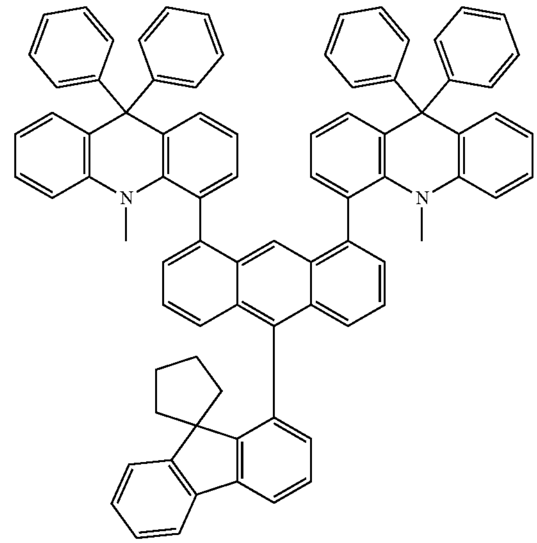
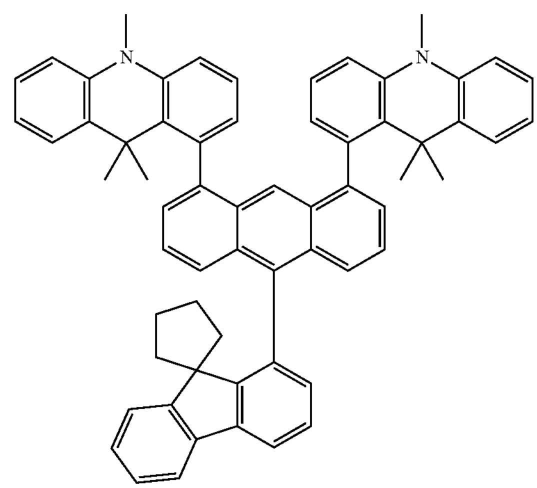
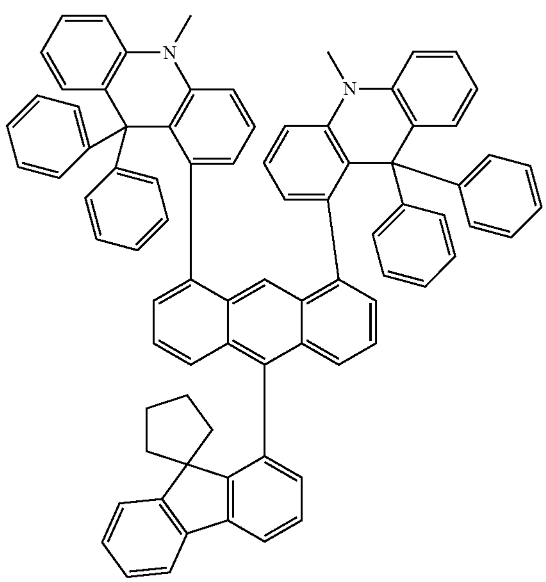
-continued
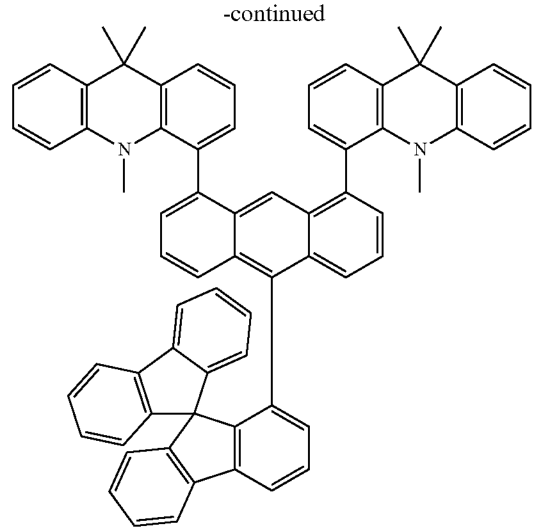
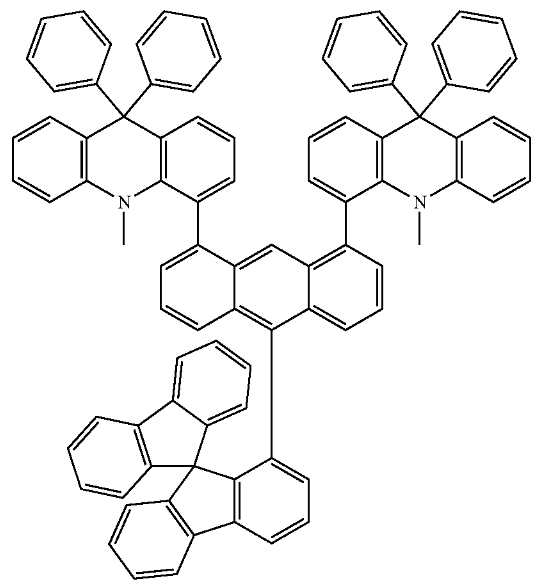
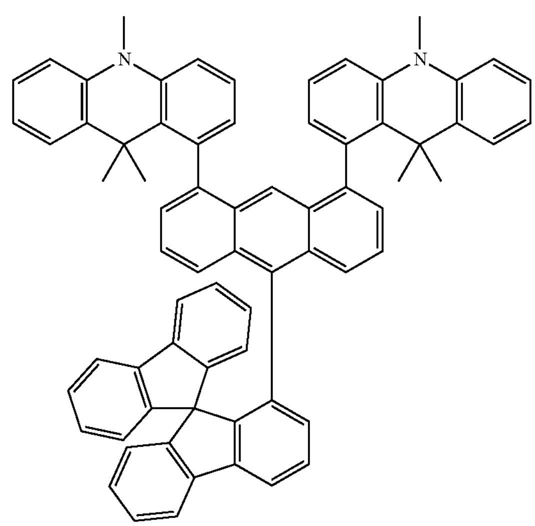

-continued
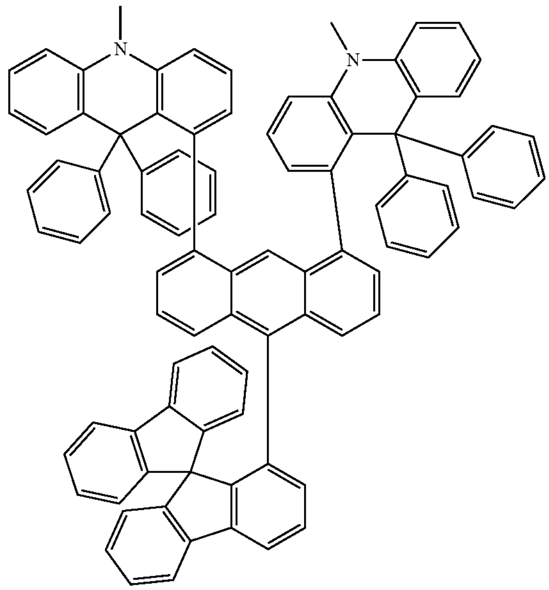
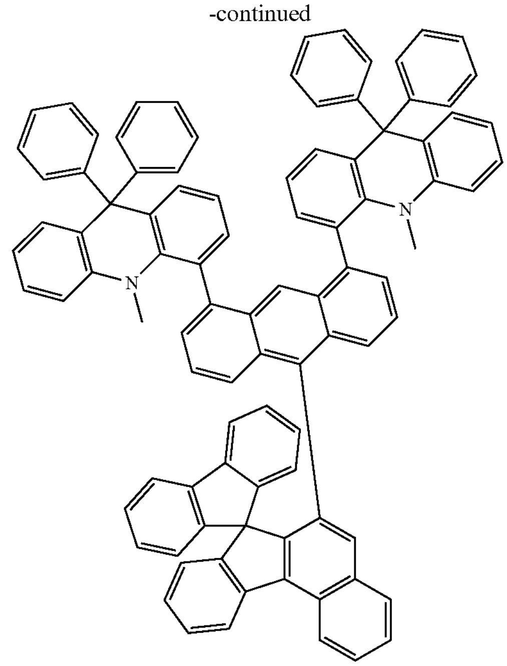
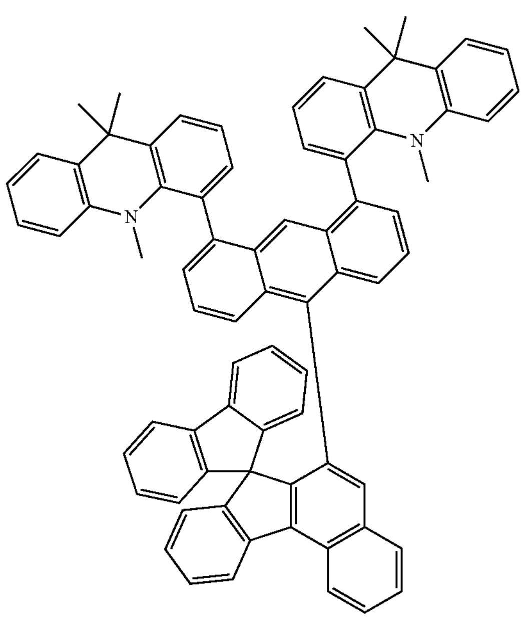
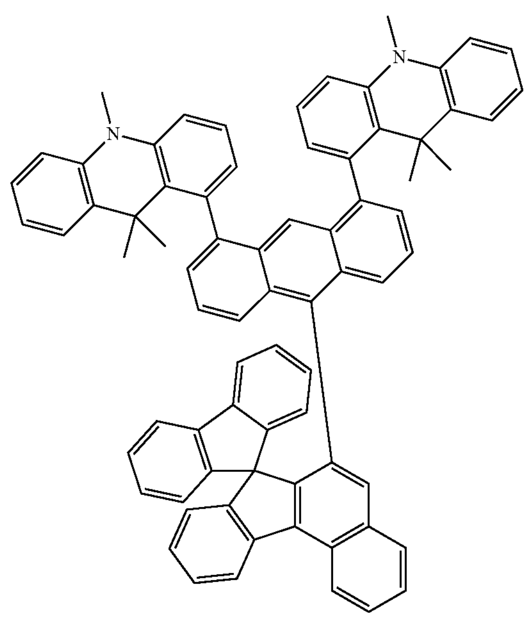

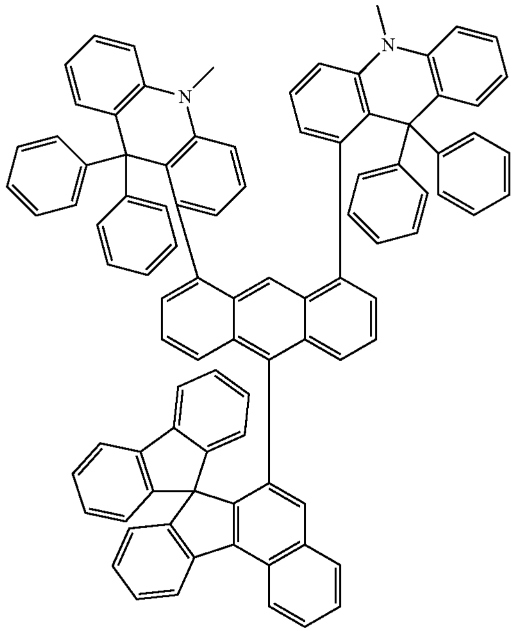
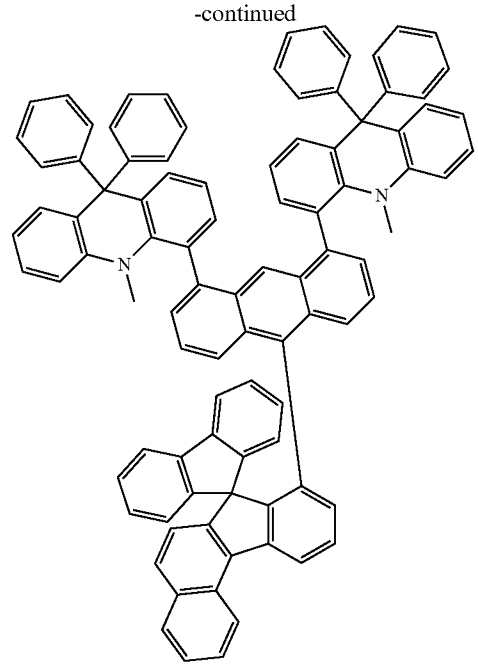
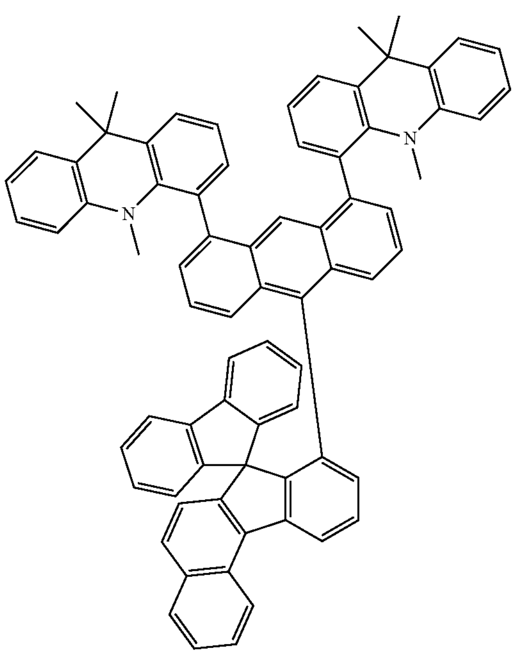
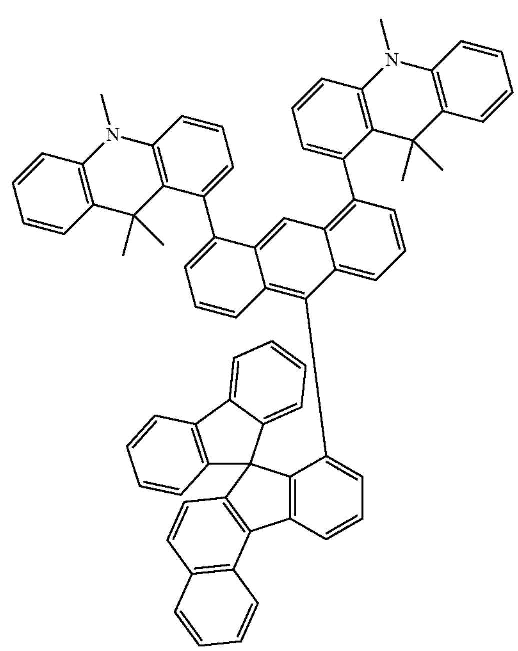

-continued
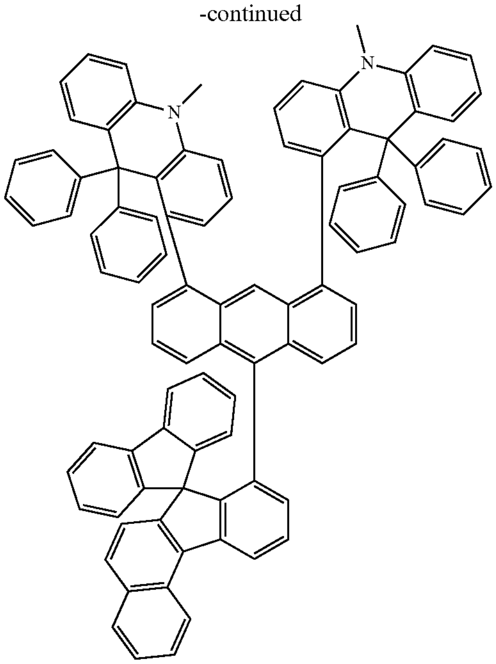
-continued
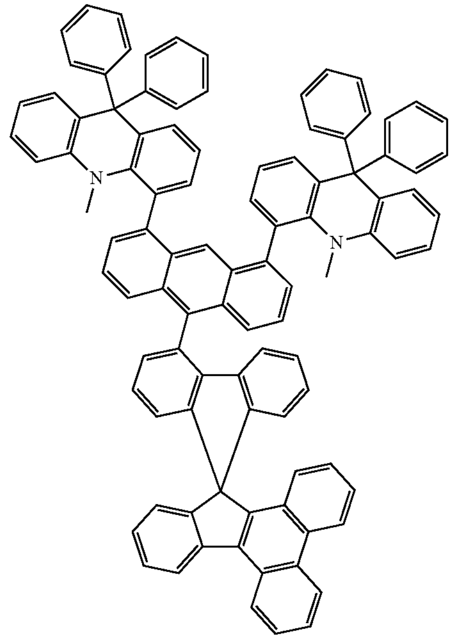
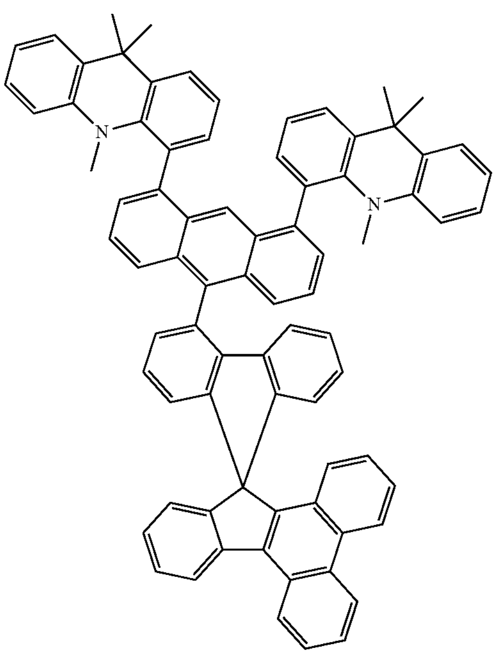
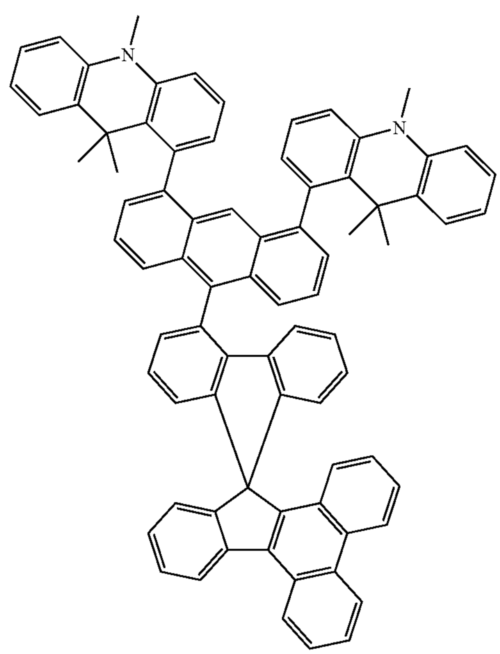

-continued
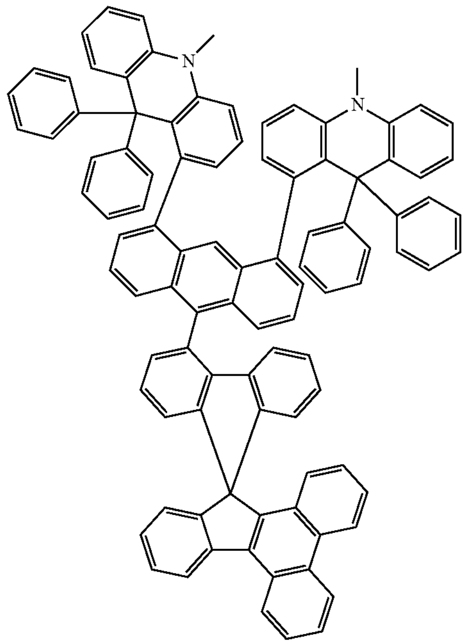
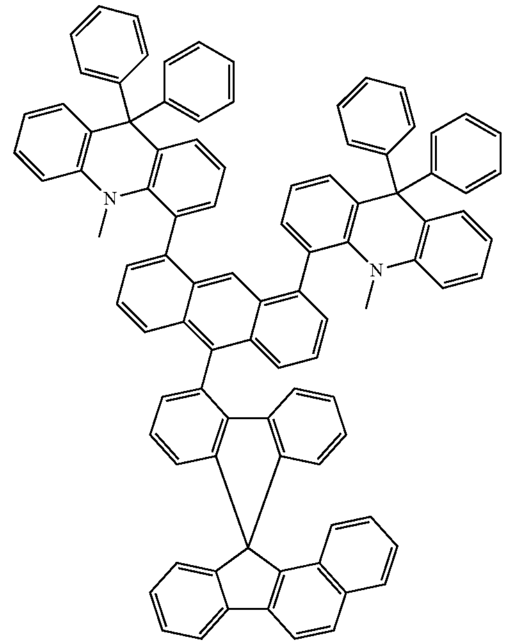
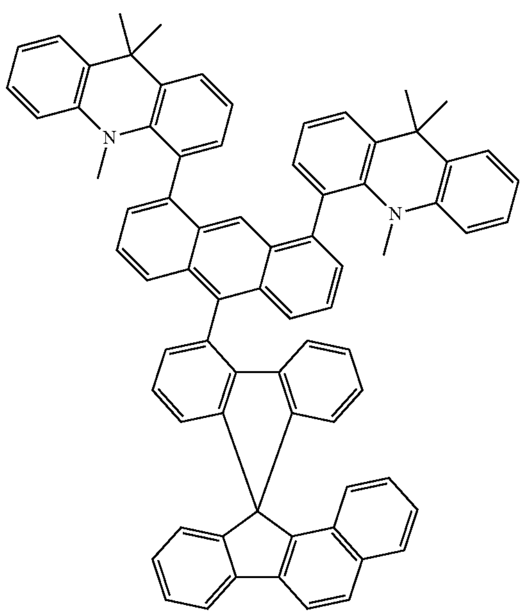
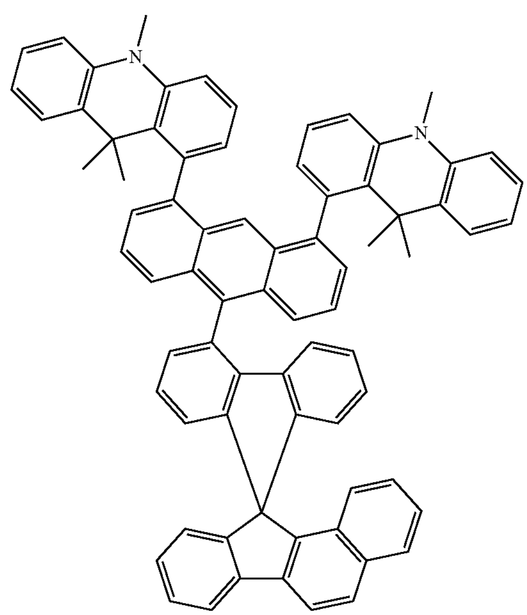

-continued
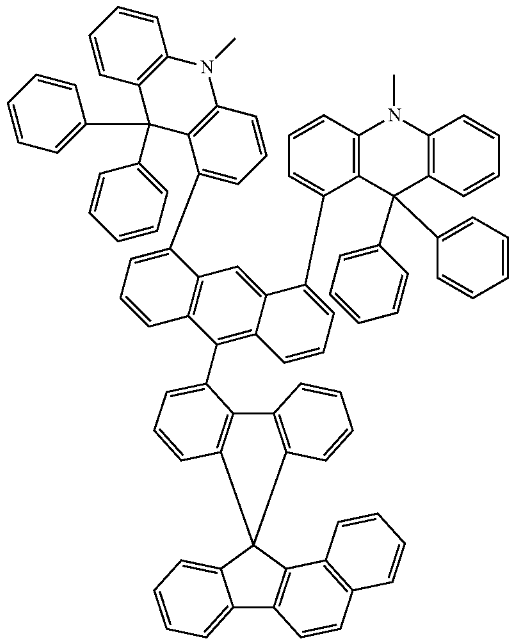
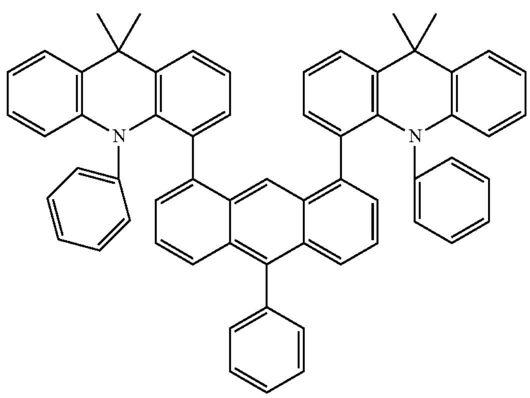
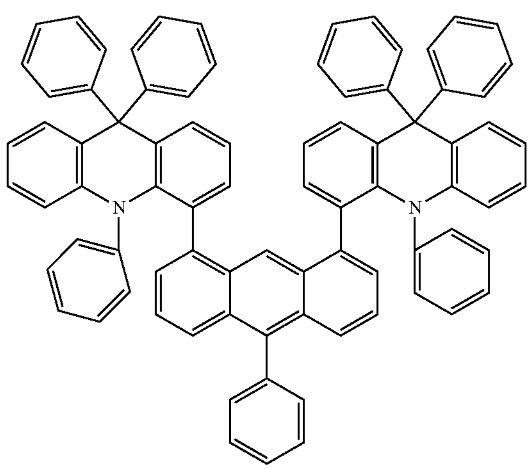
-continued
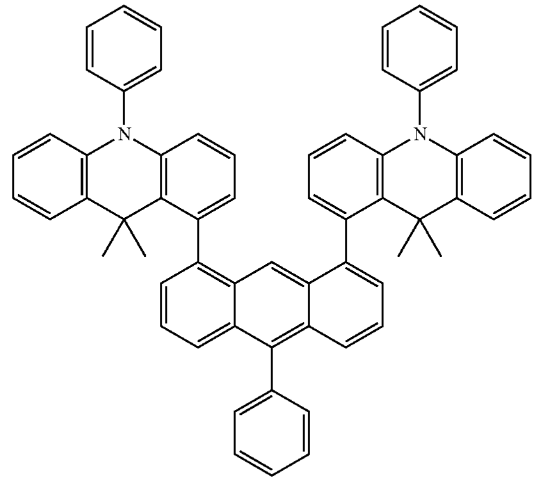
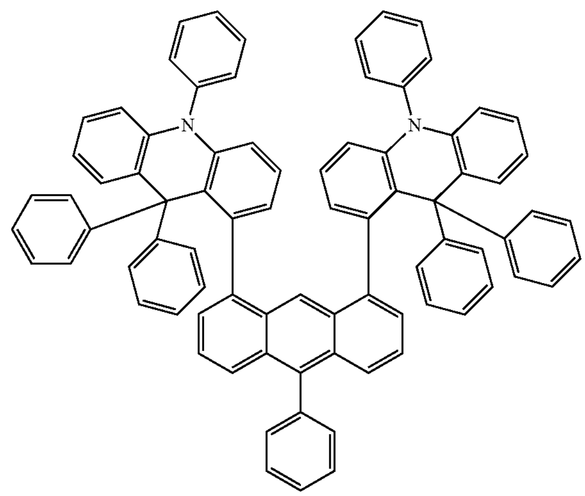
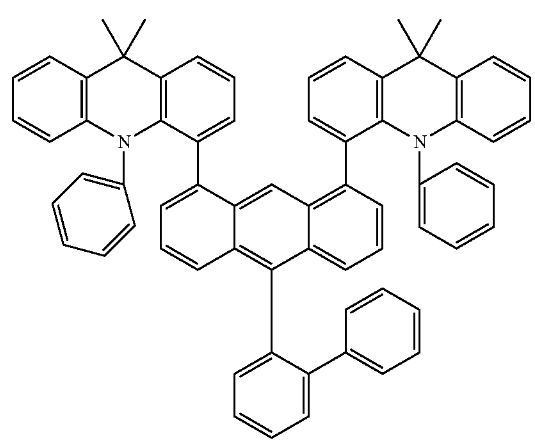

-continued
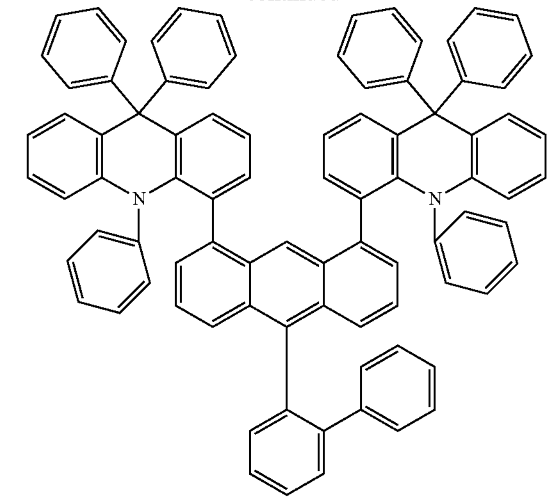
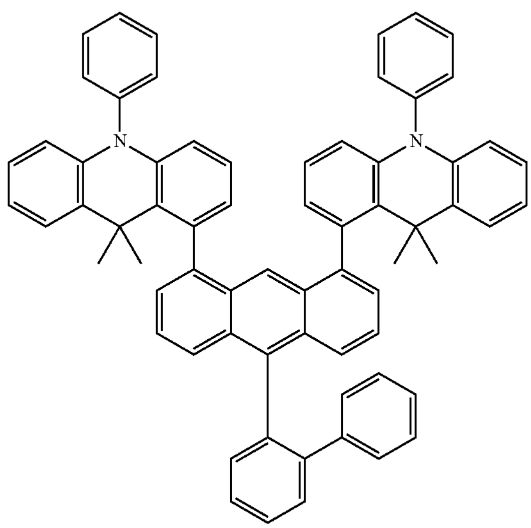
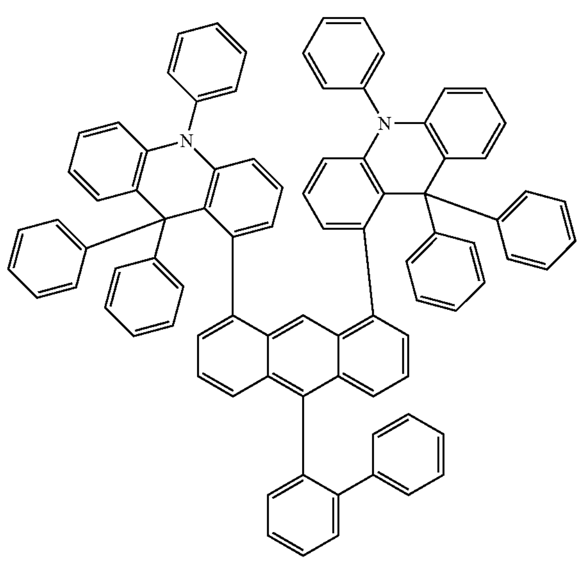
-continued
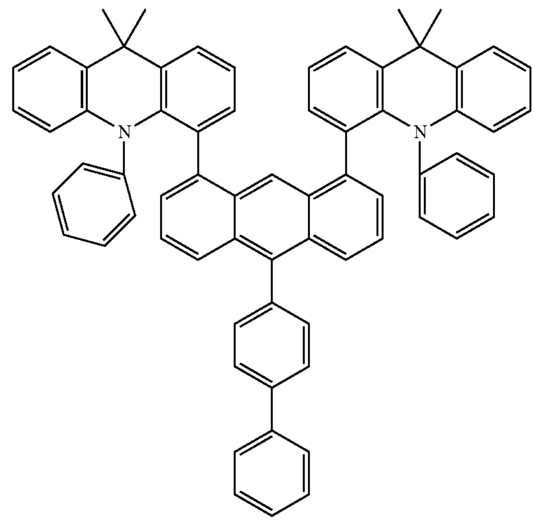
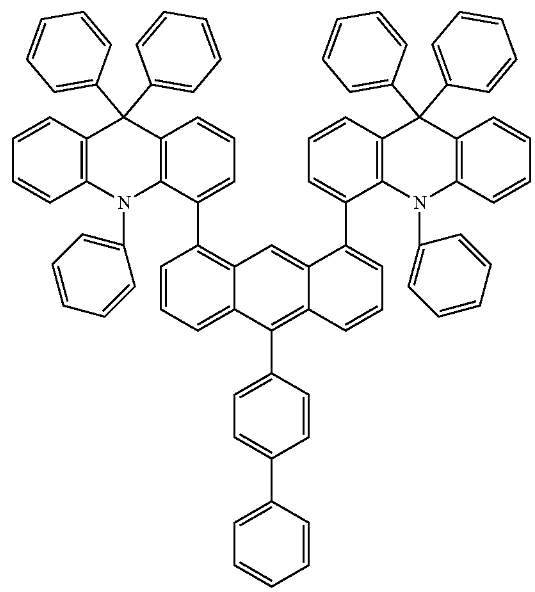
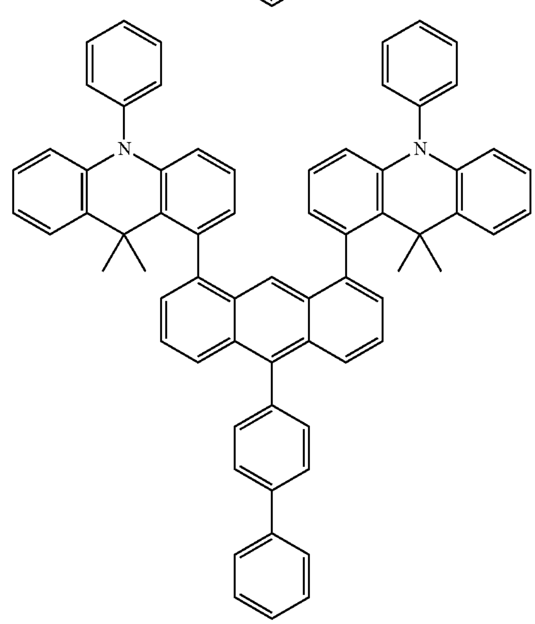

-continued
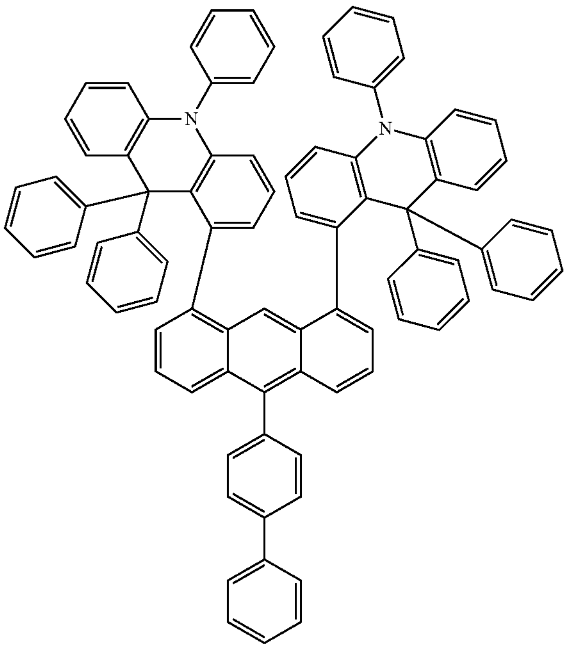
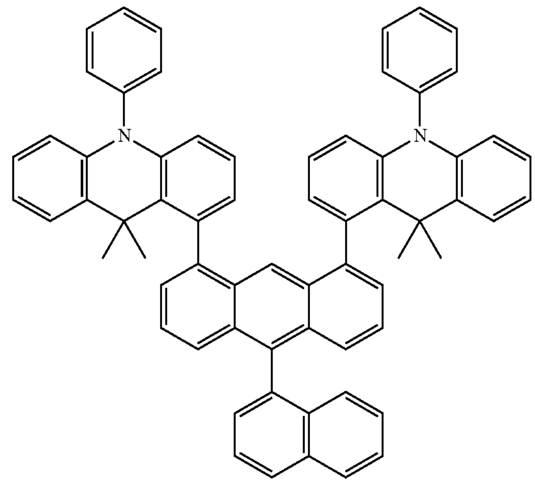
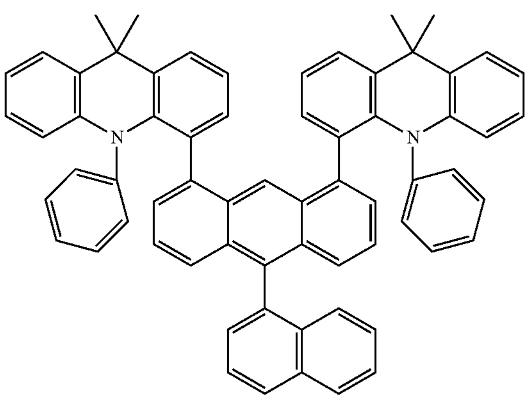
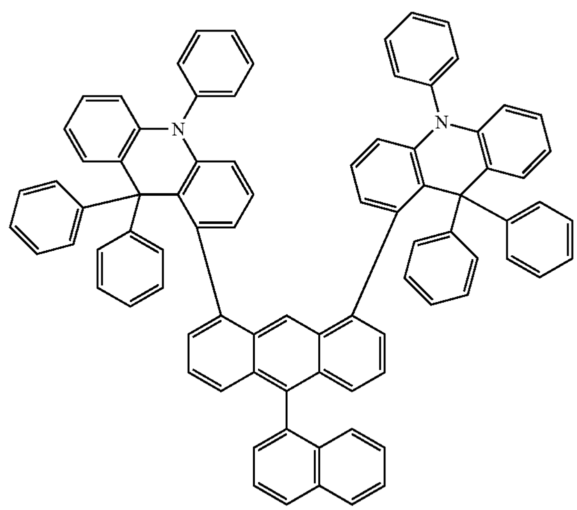
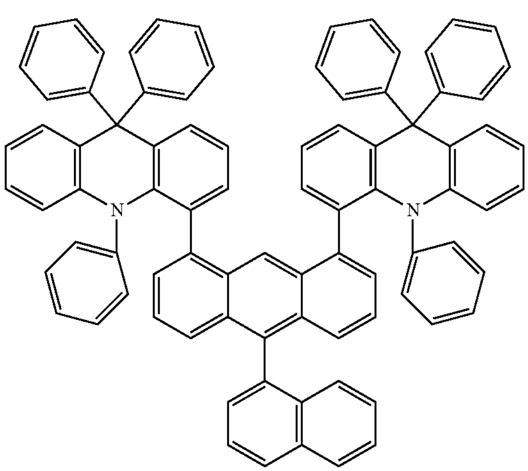
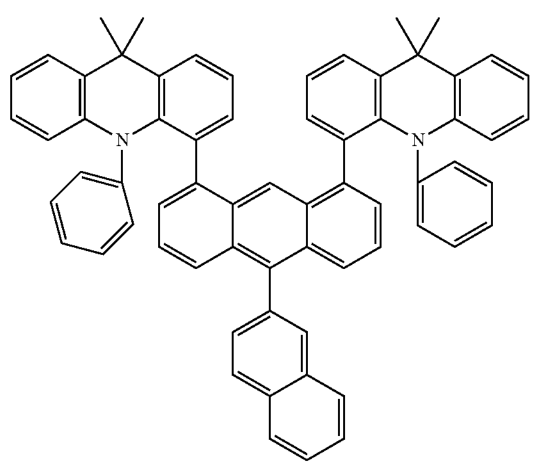
-continued -continued
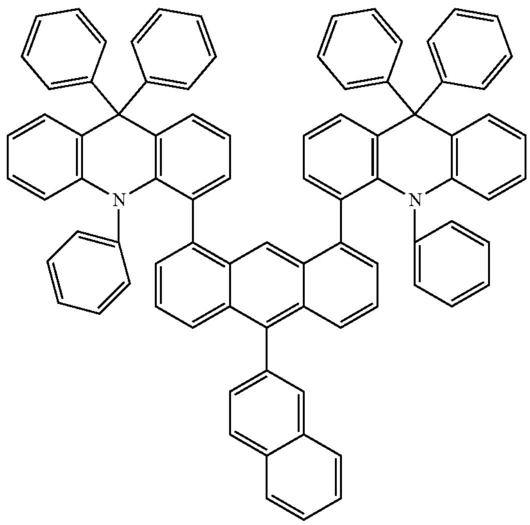
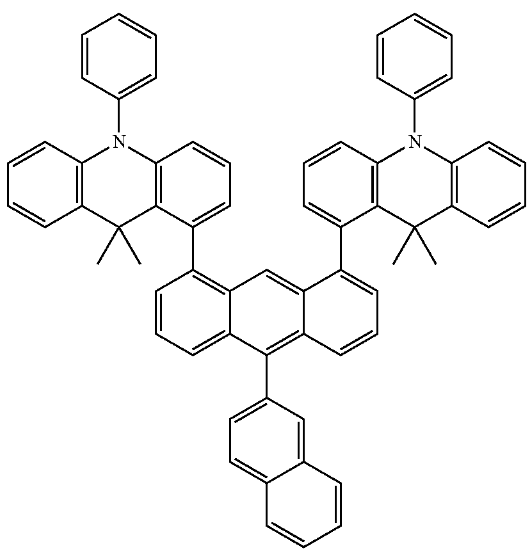
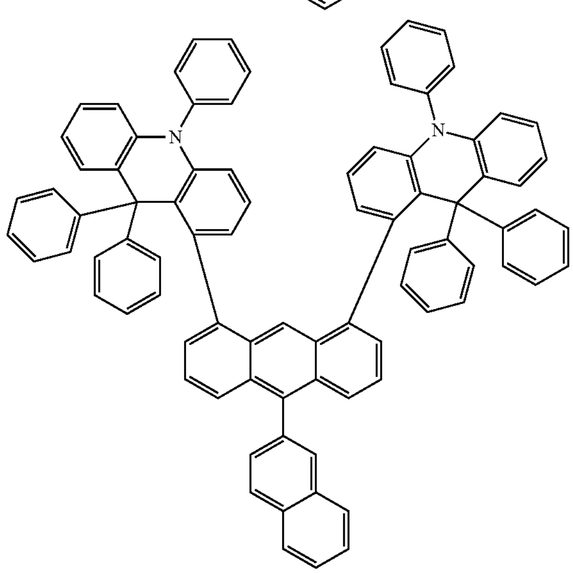
-continued
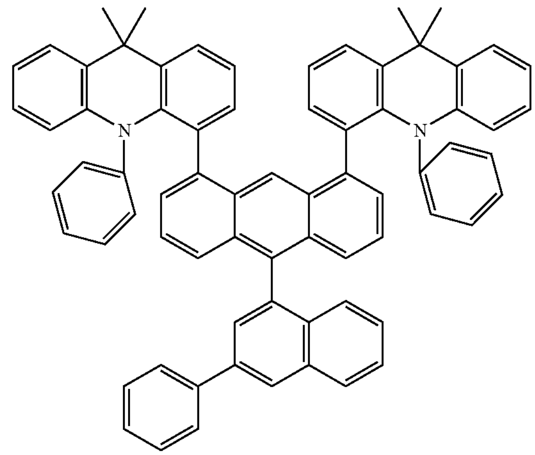
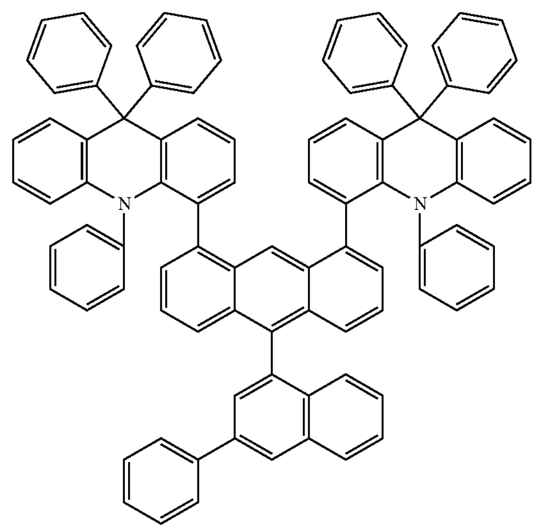
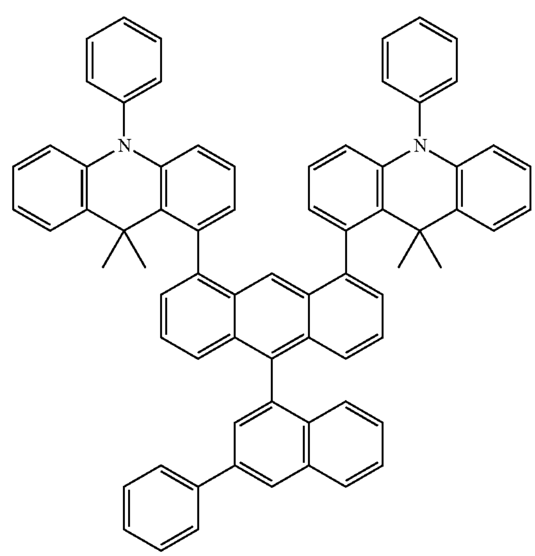

-continued
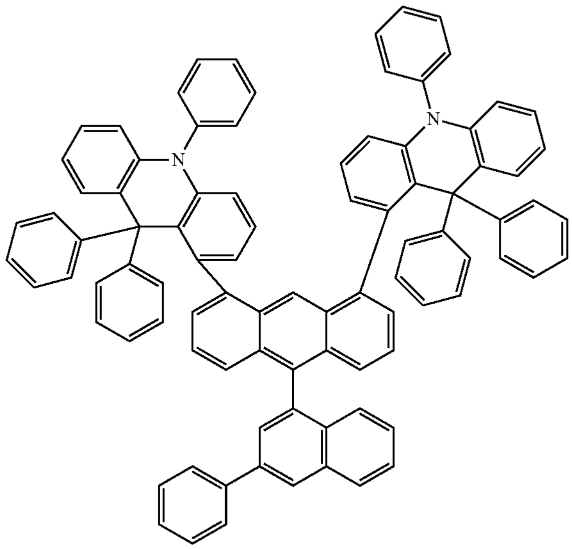
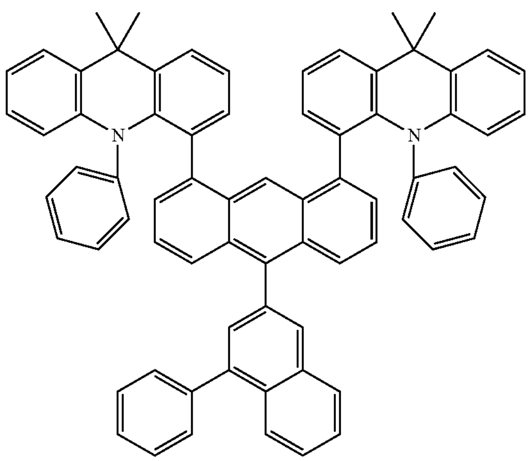
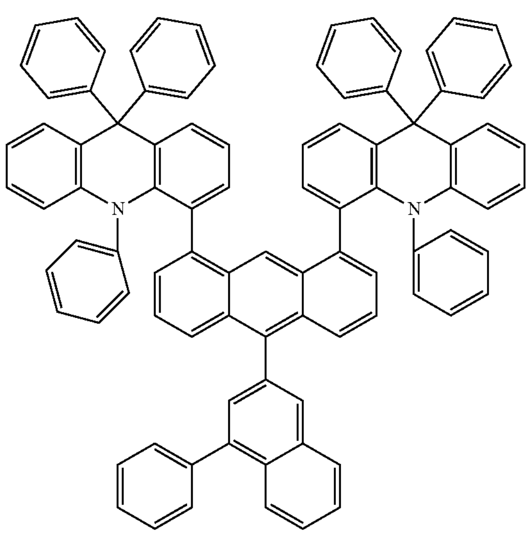
-continued
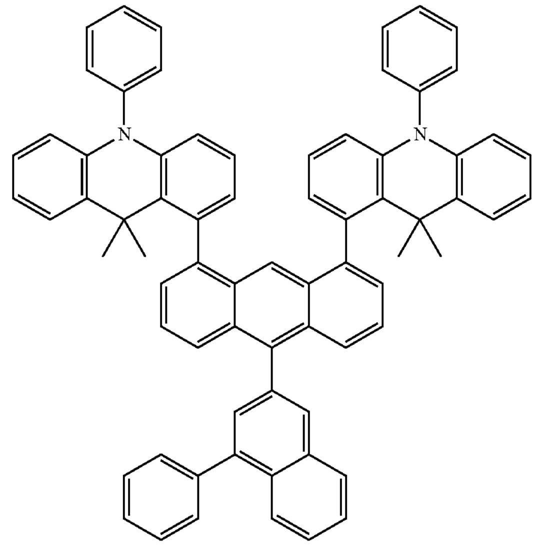
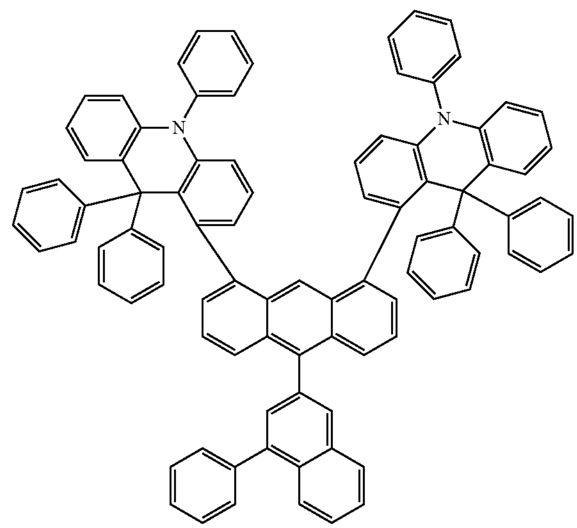
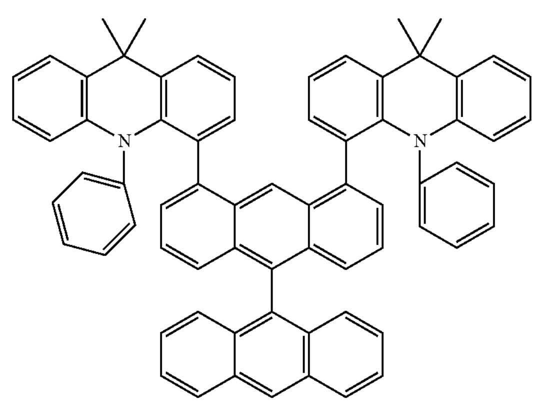

-continued
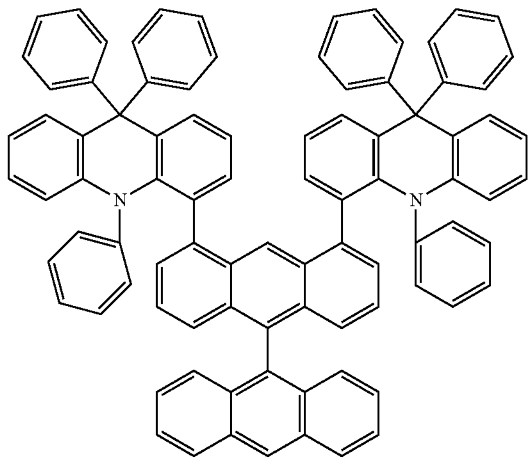
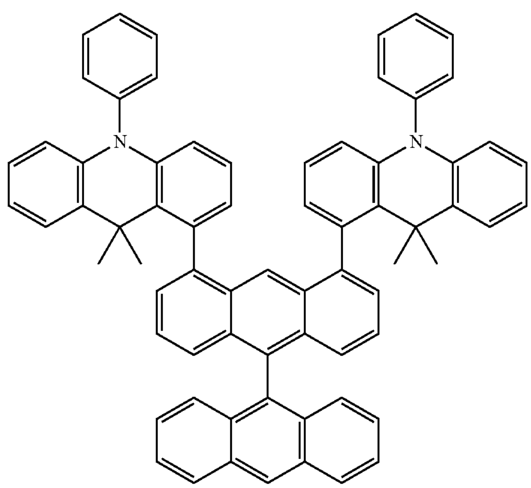
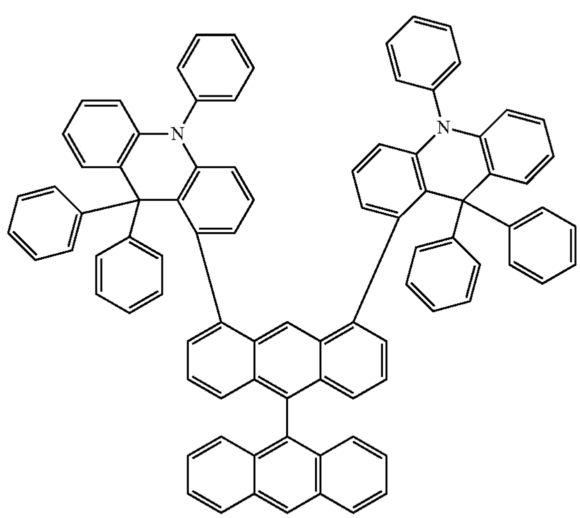
-continued
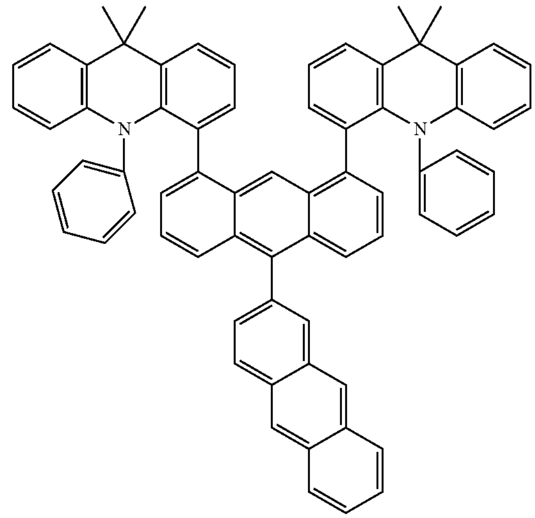
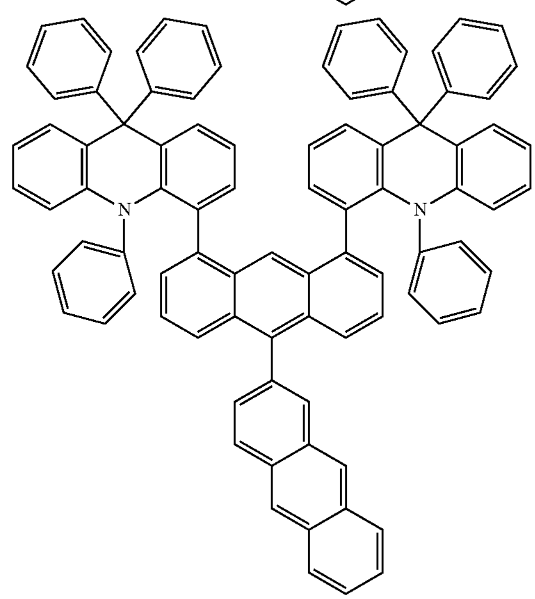
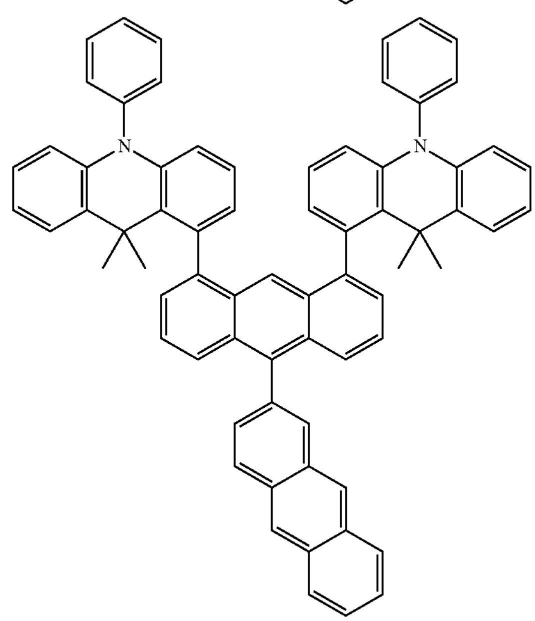

-continued
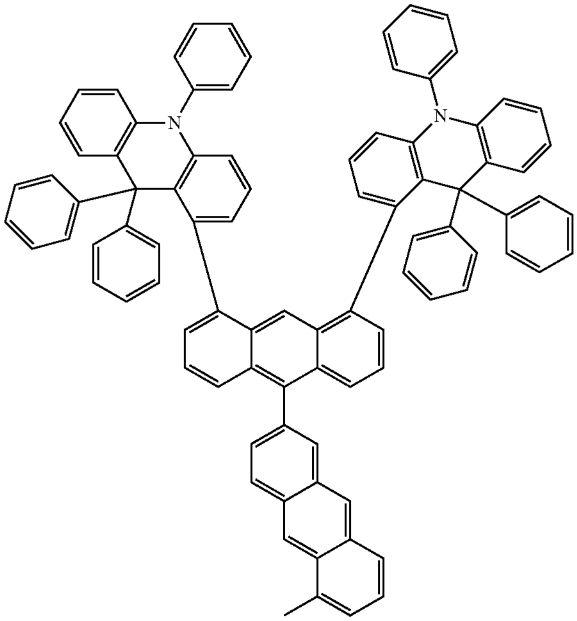
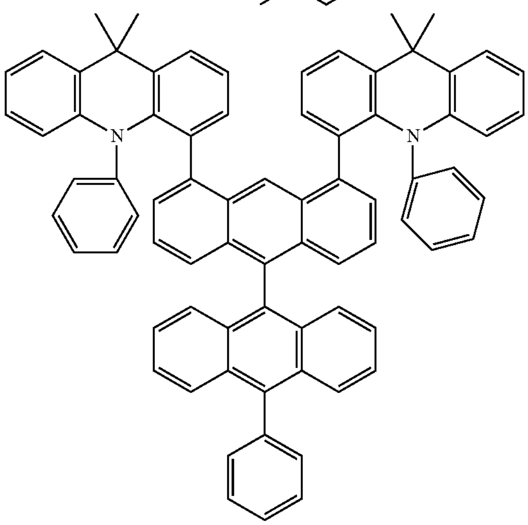
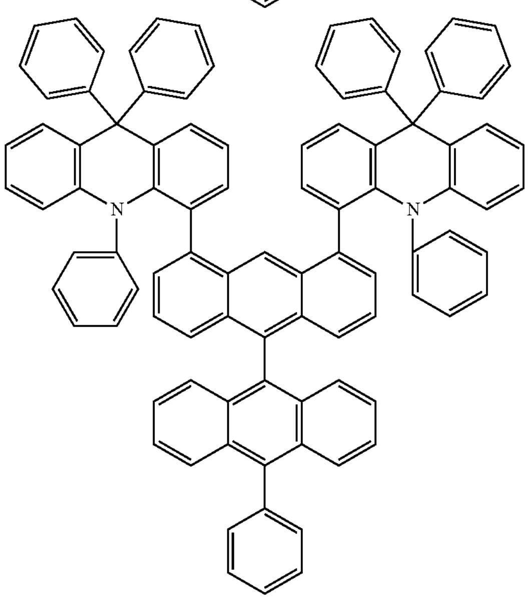
-continued
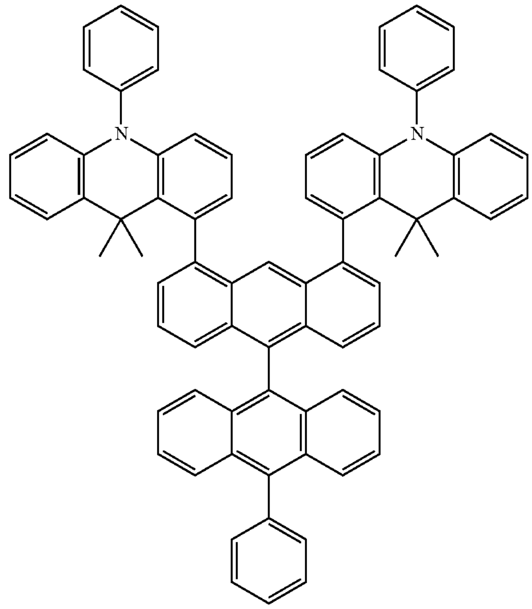
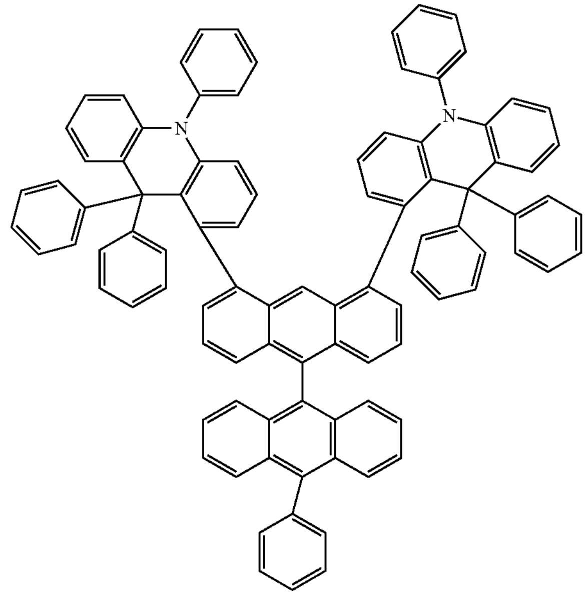
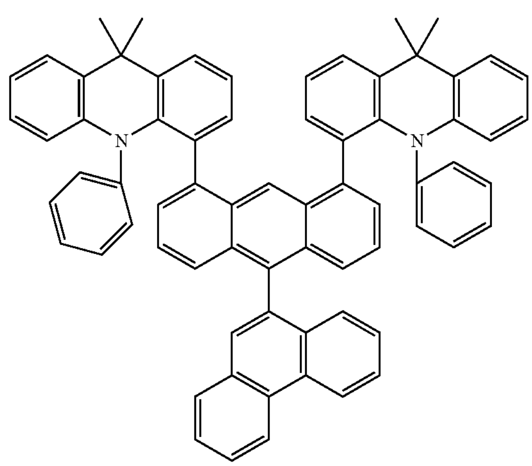

-continued
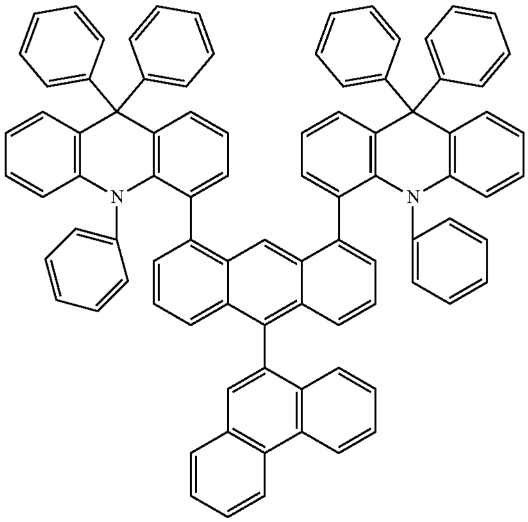
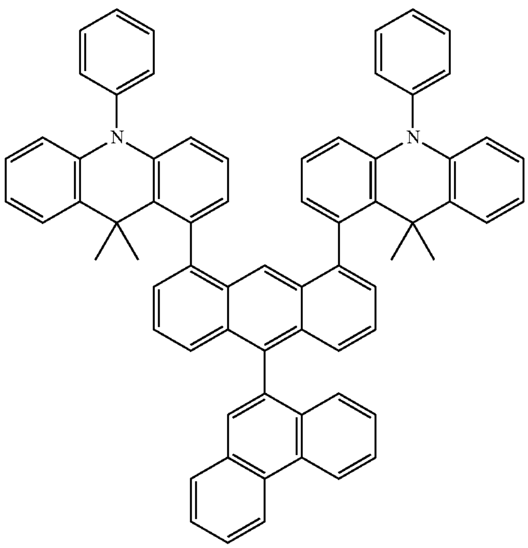
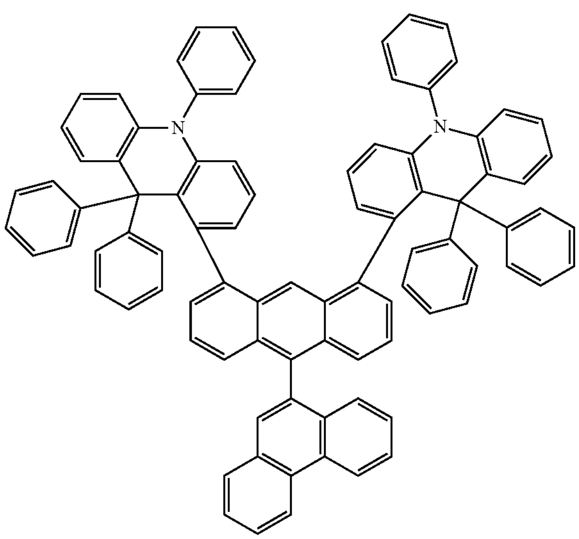
-continued
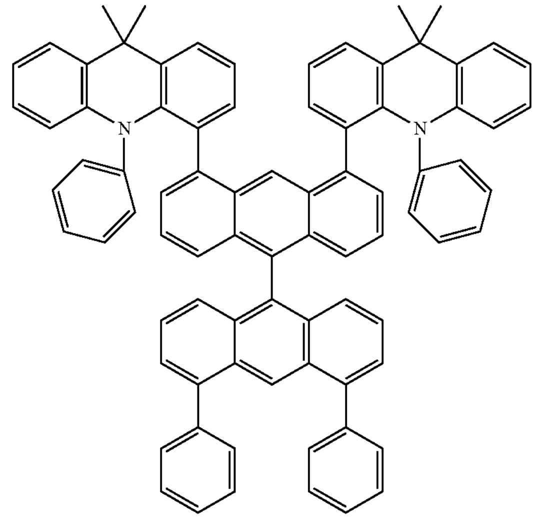
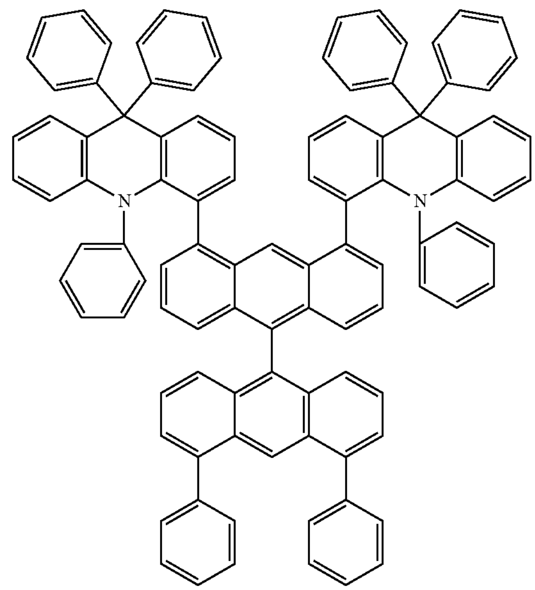
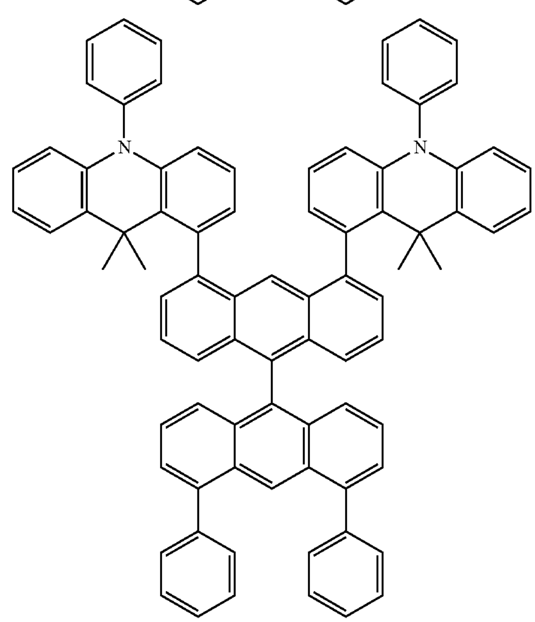

-continued
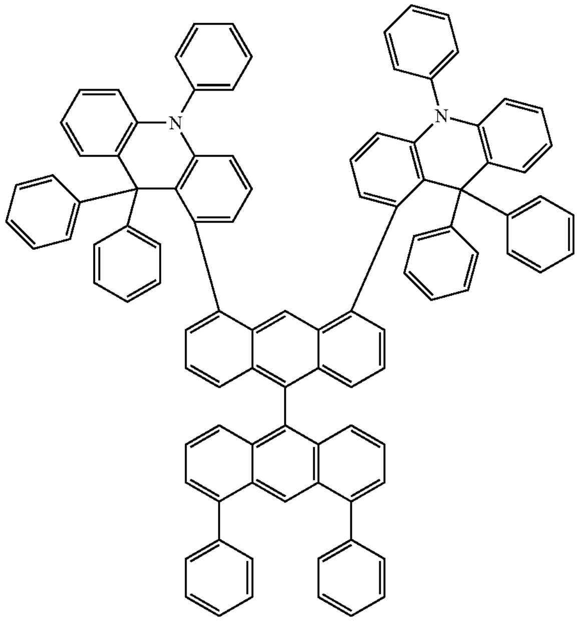
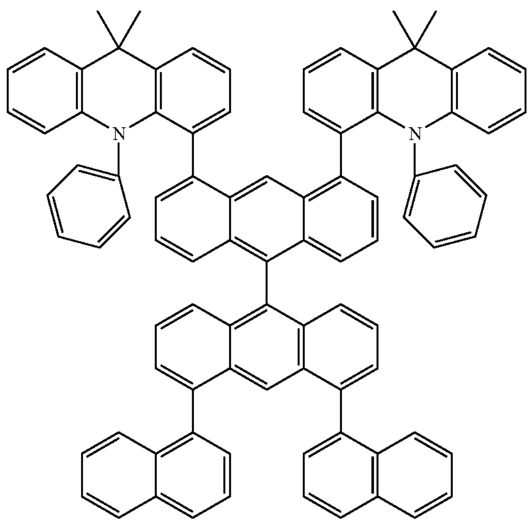
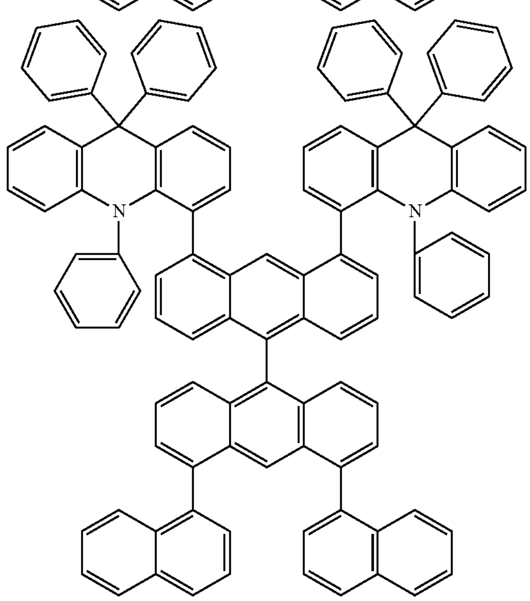
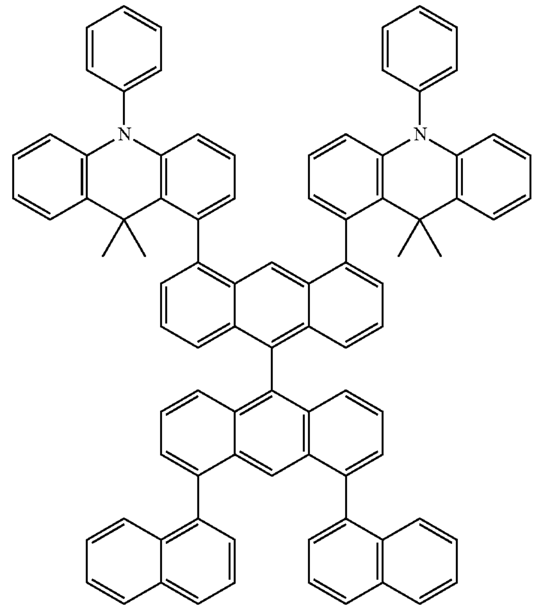
-continued
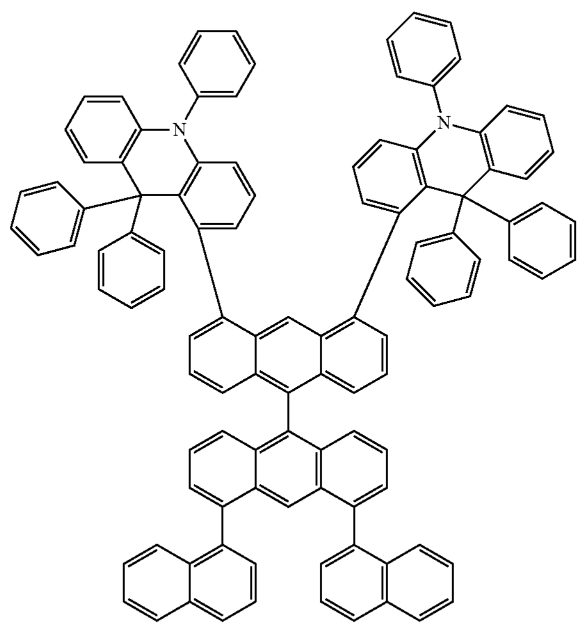

-continued
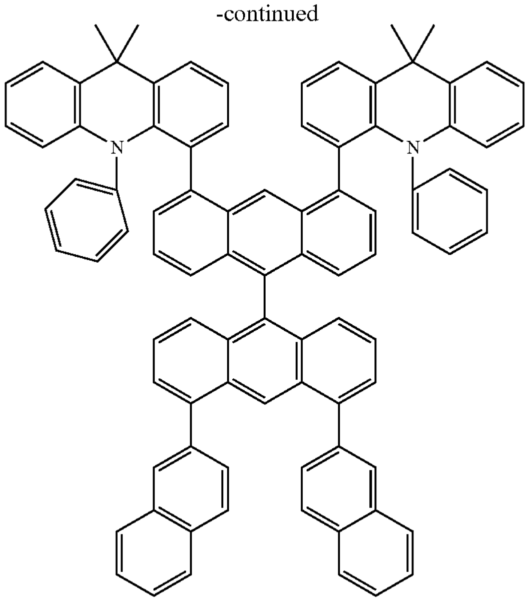
-continued
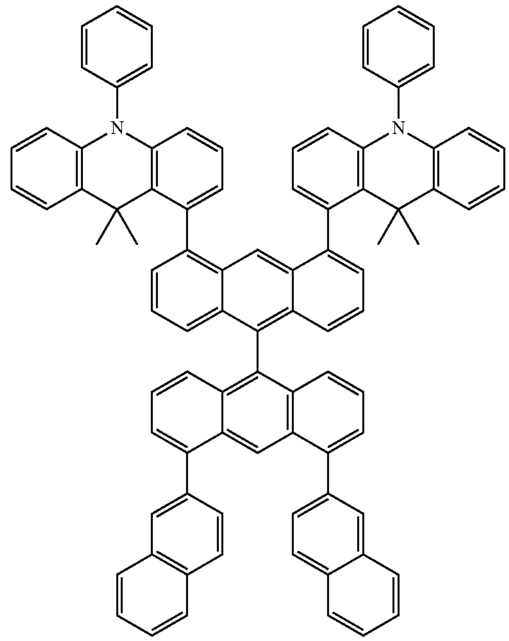
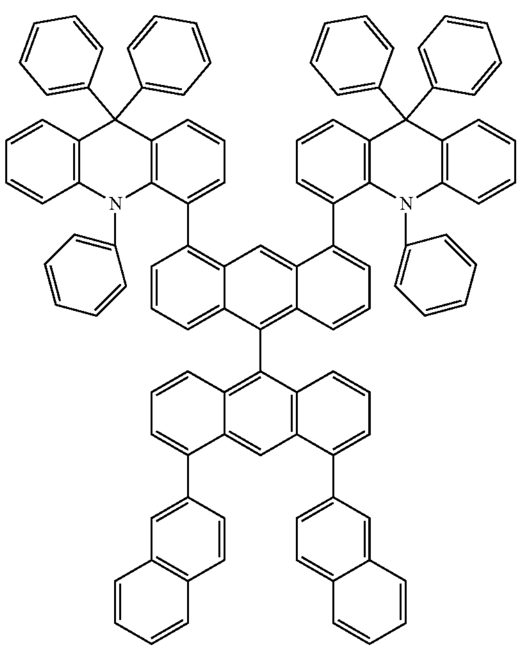
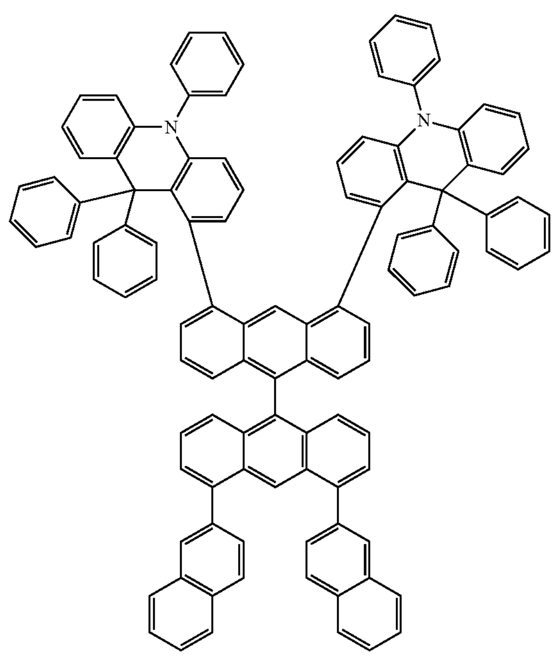

-continued
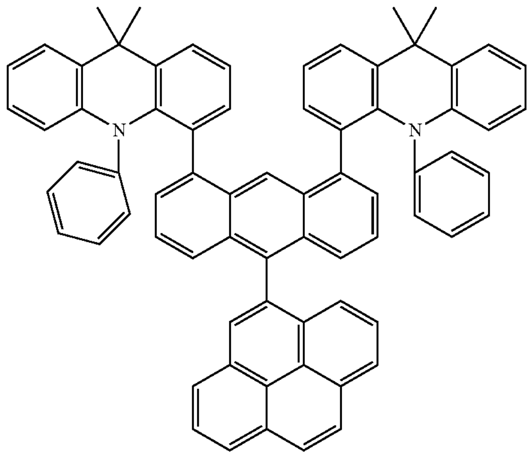
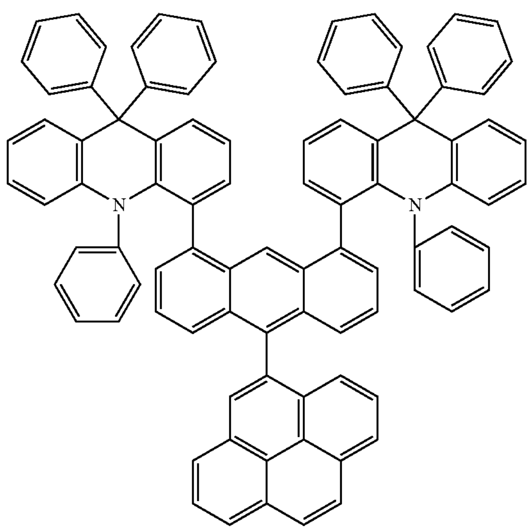
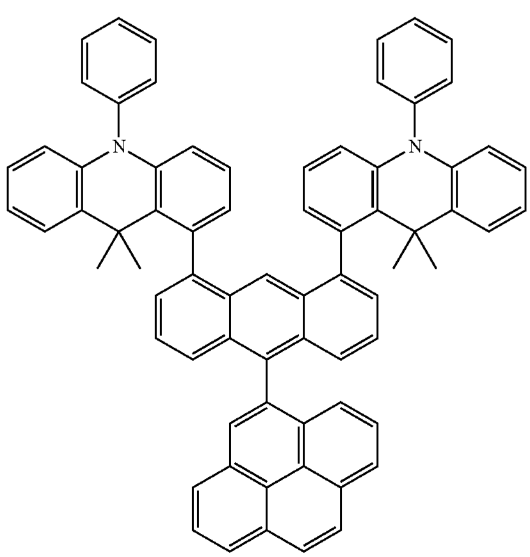
-continued
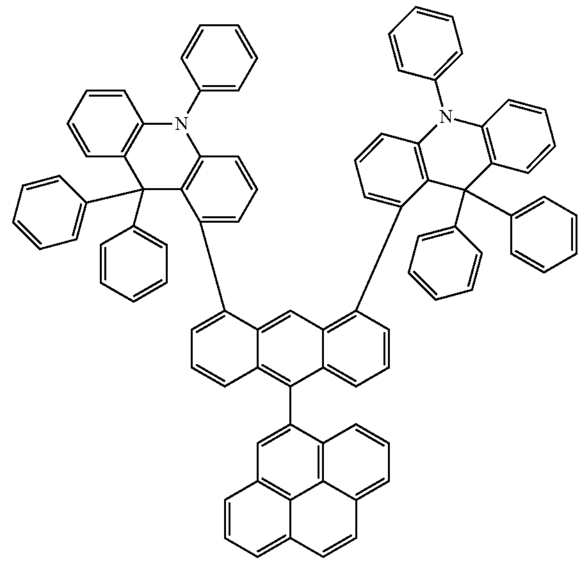
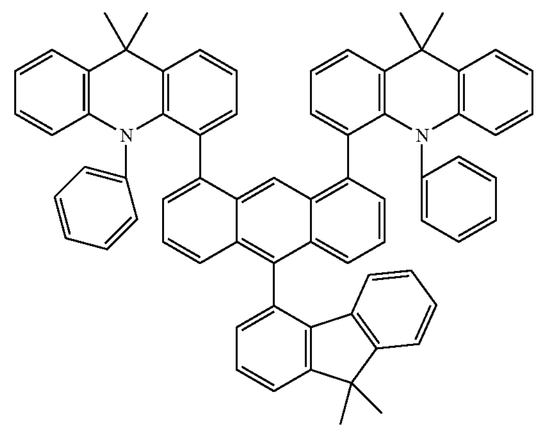
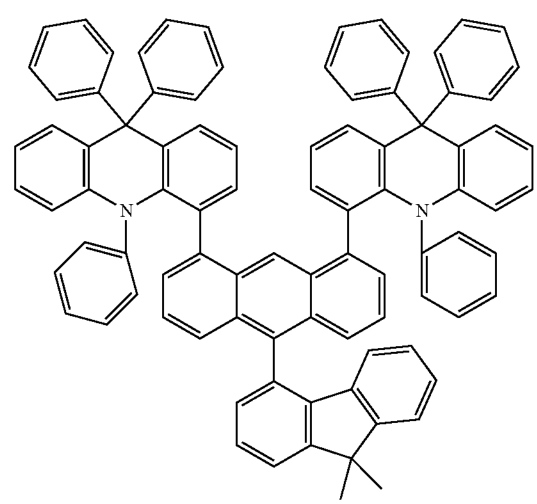

-continued
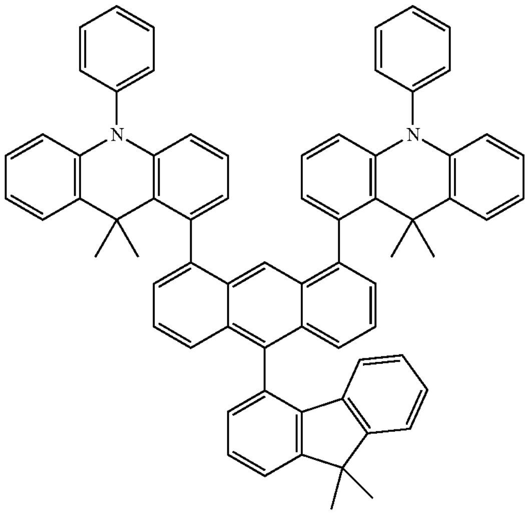
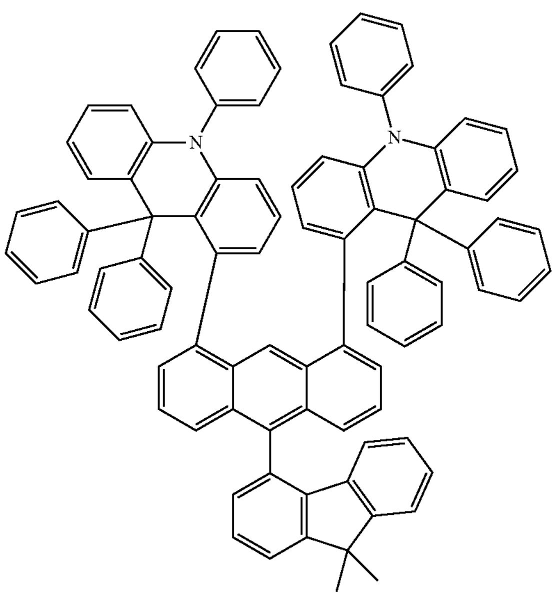
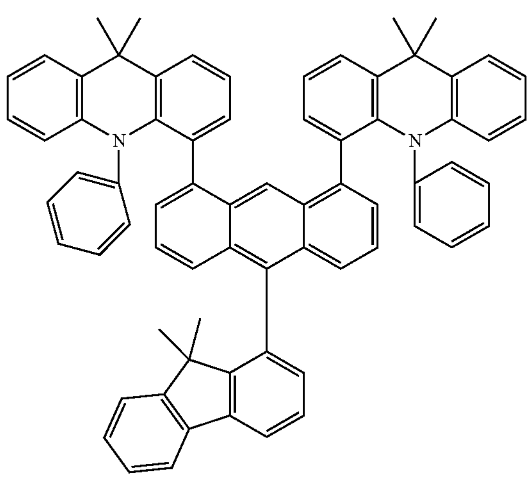
-continued
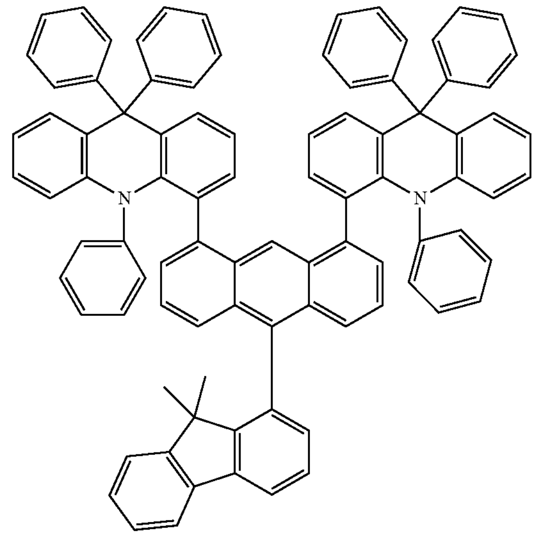
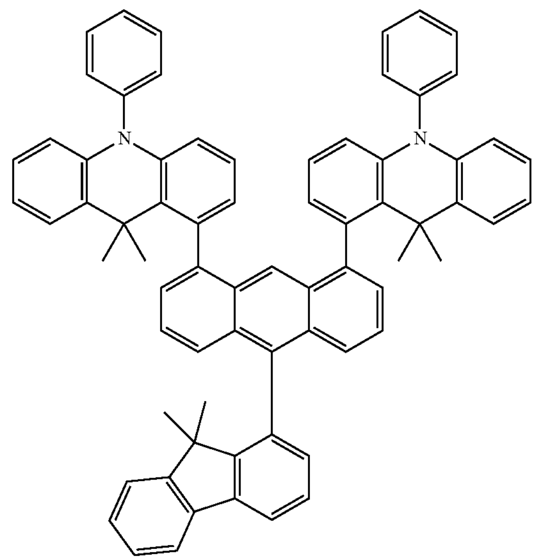
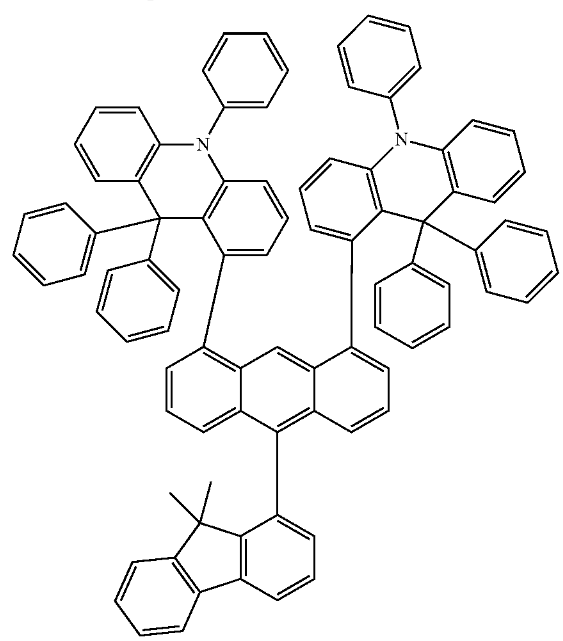

-continued
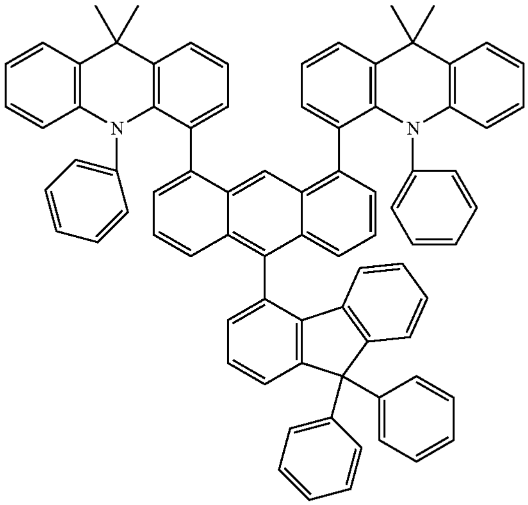
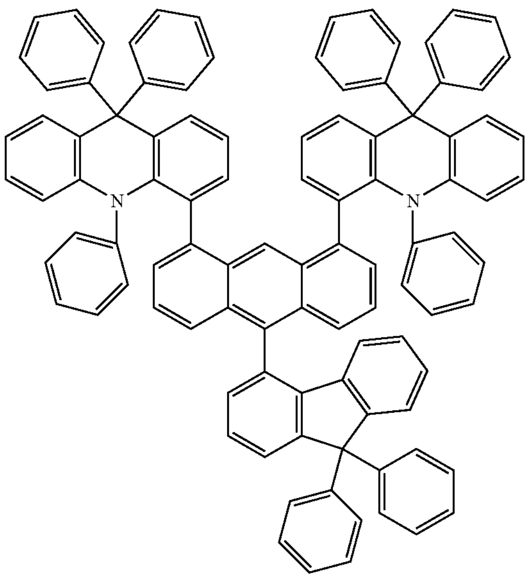
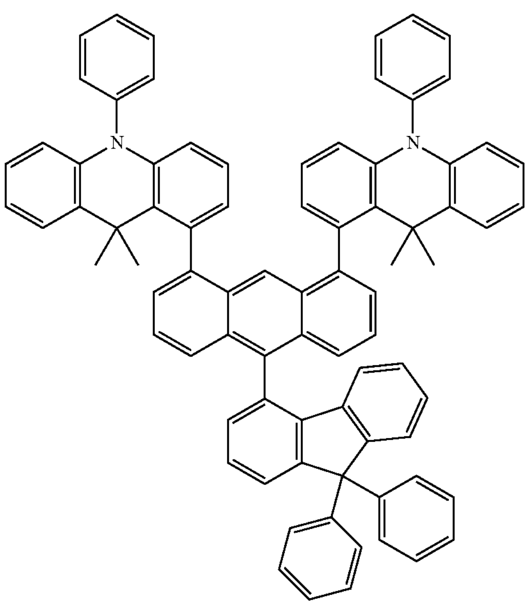
-continued
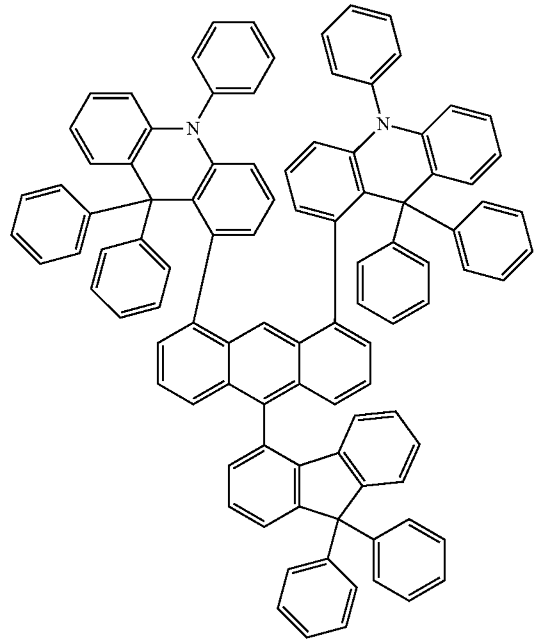
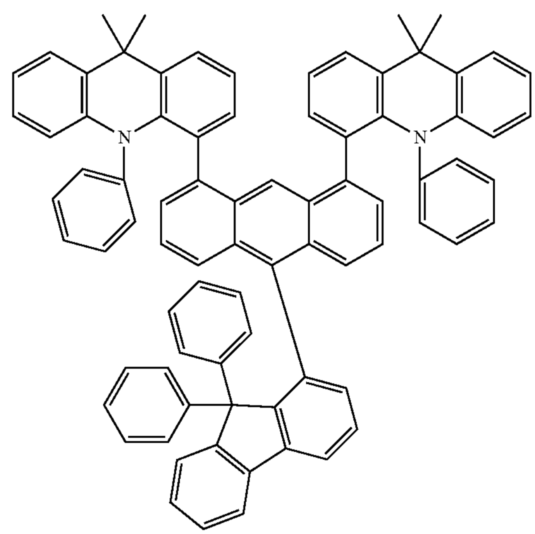

-continued
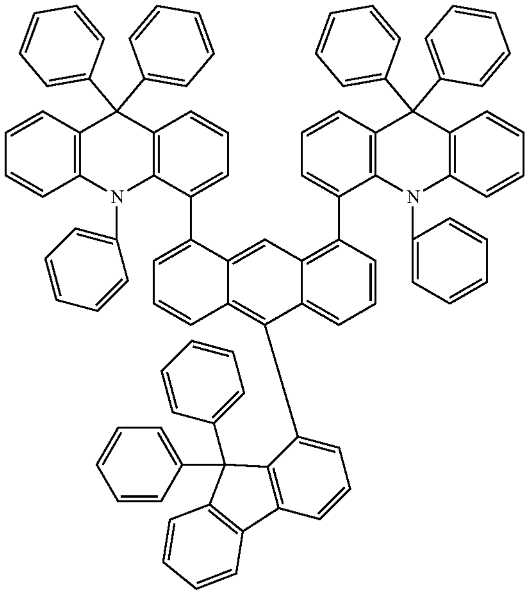
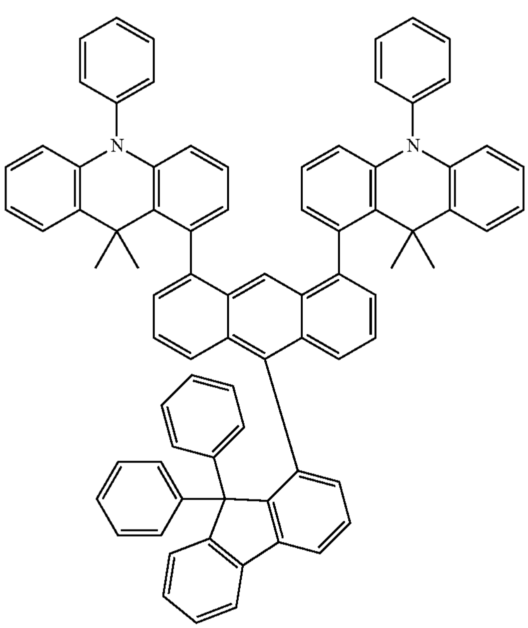
-continued
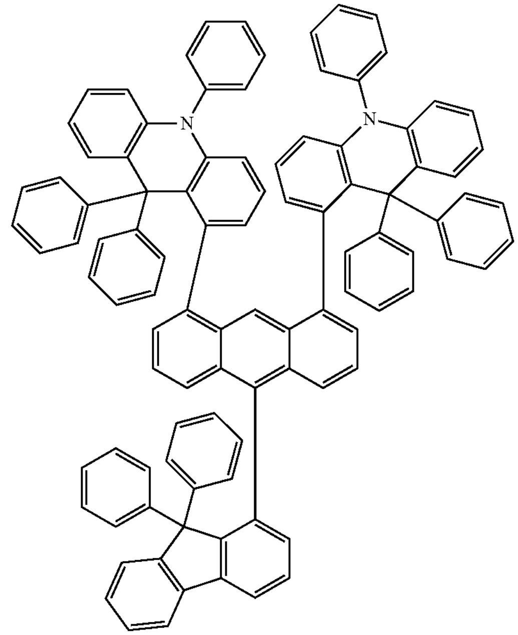
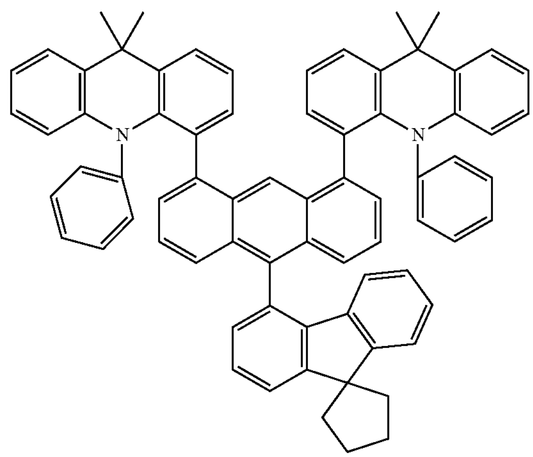
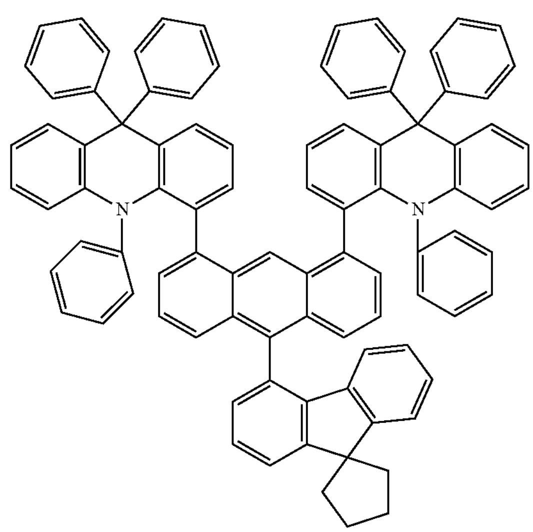

-continued
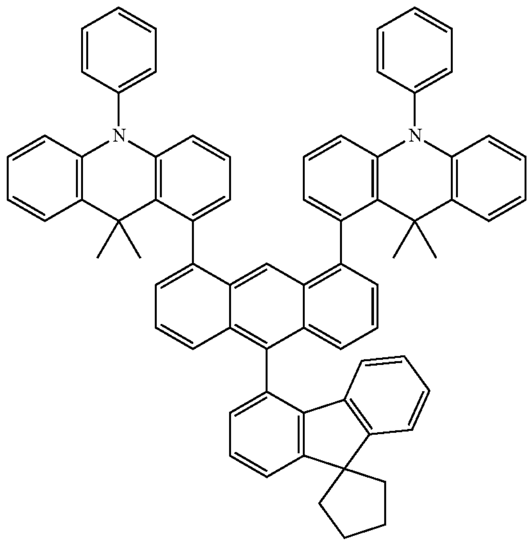
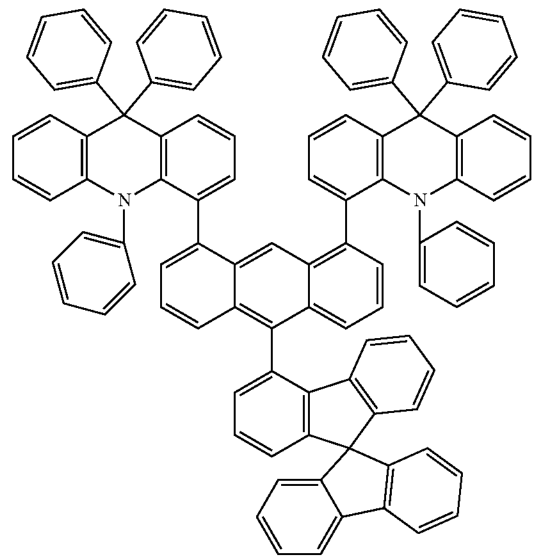
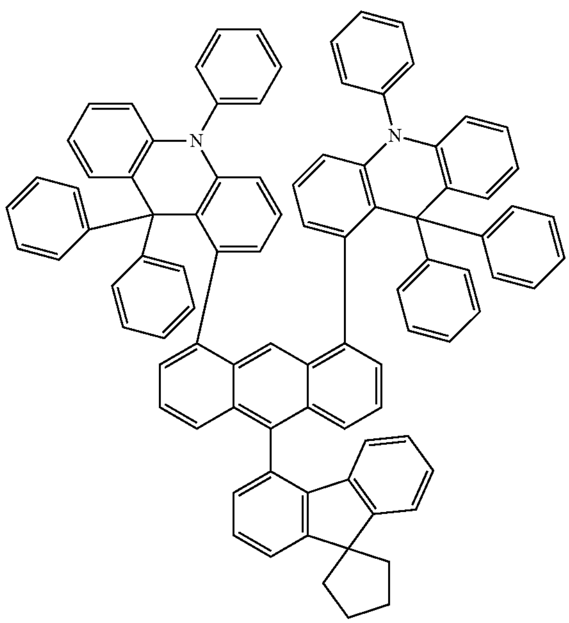
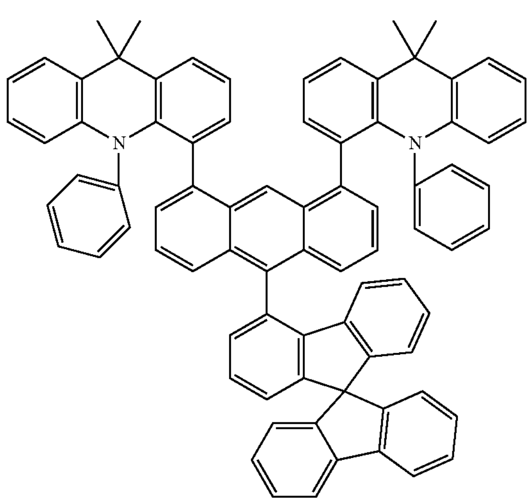
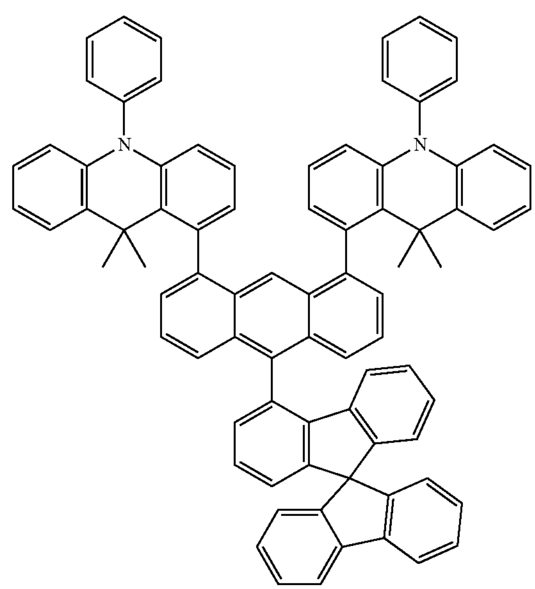

-continued
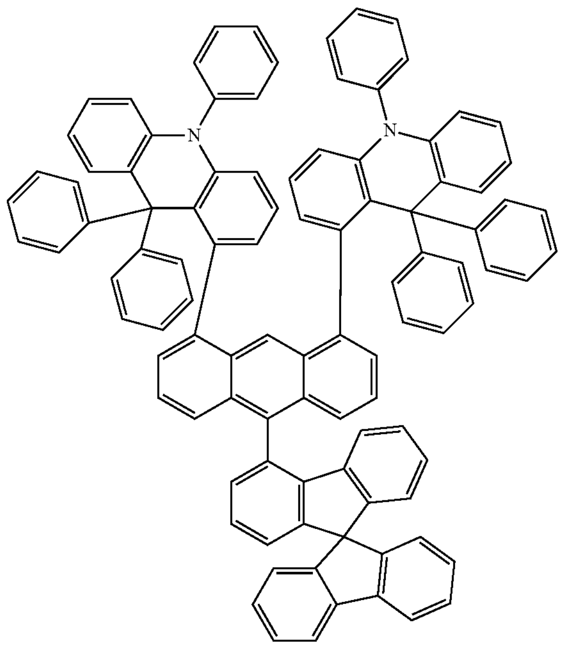
-continued
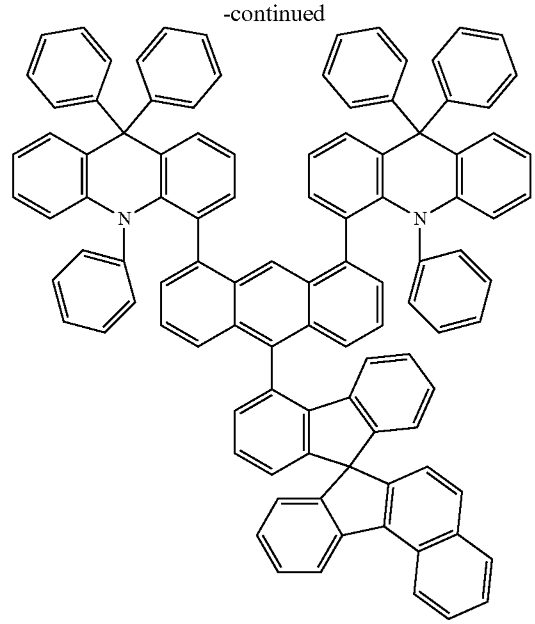
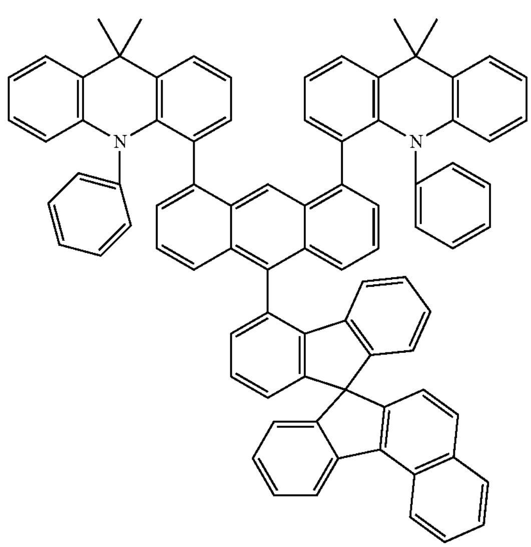
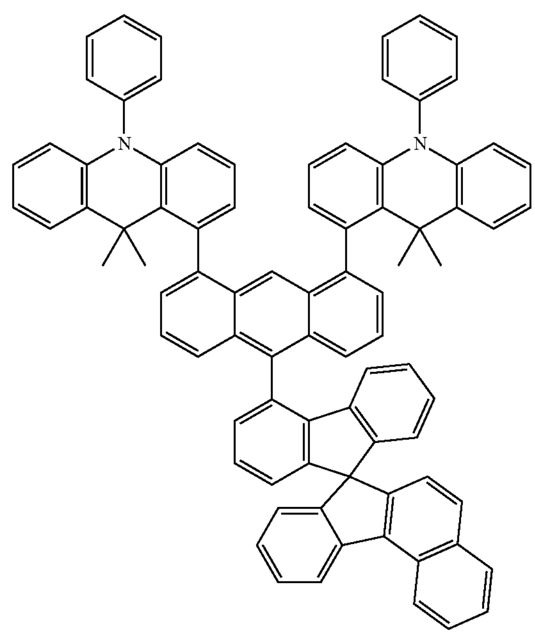

-continued
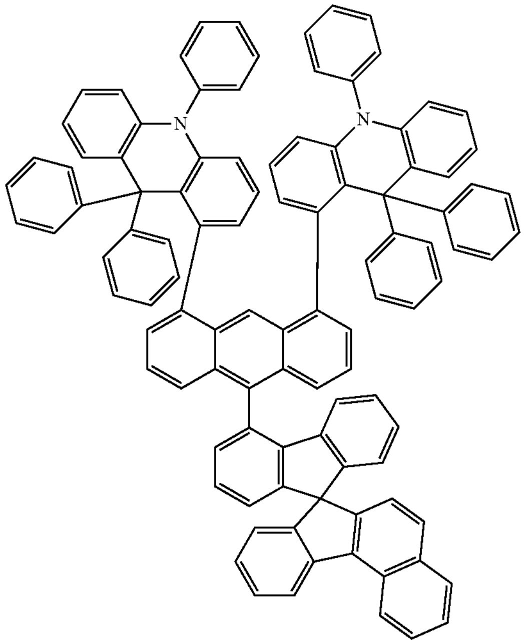
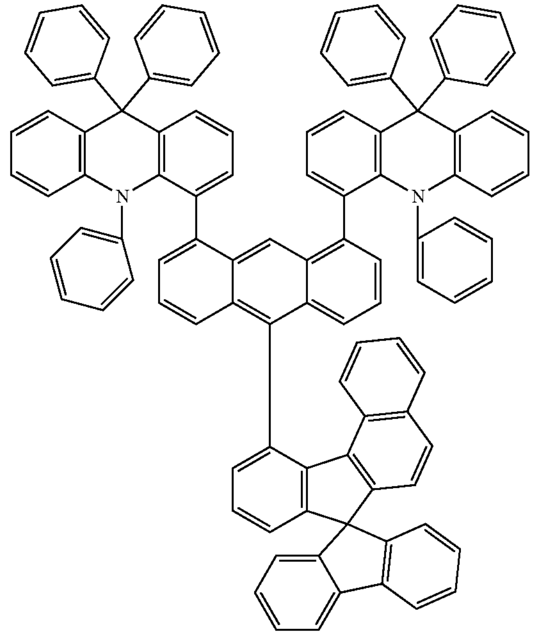
-continued
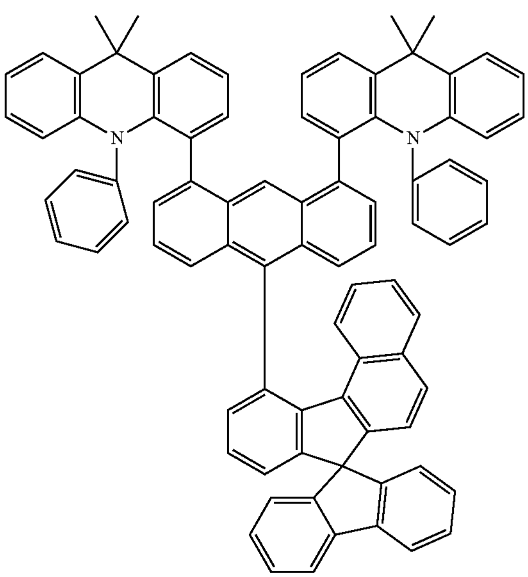
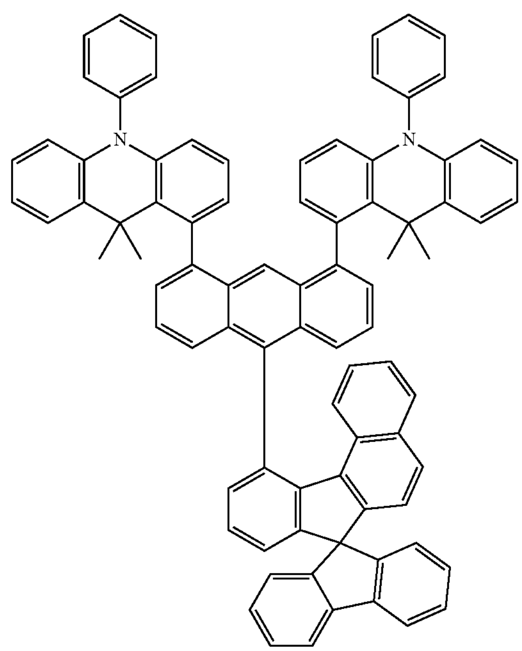

-continued
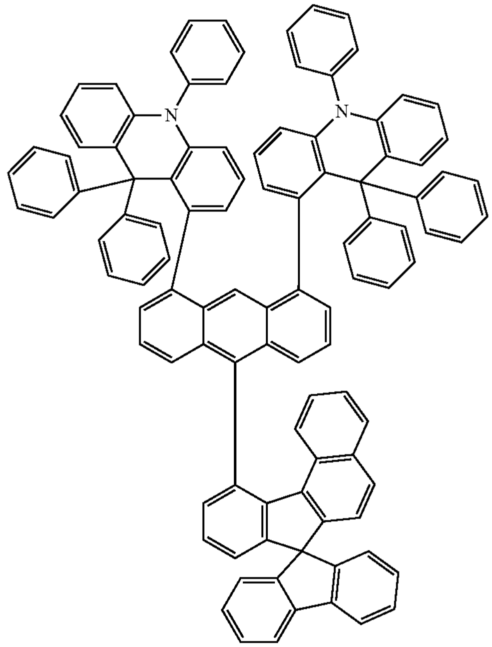
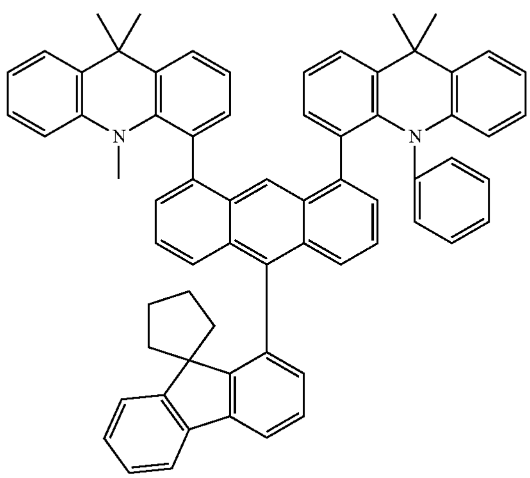
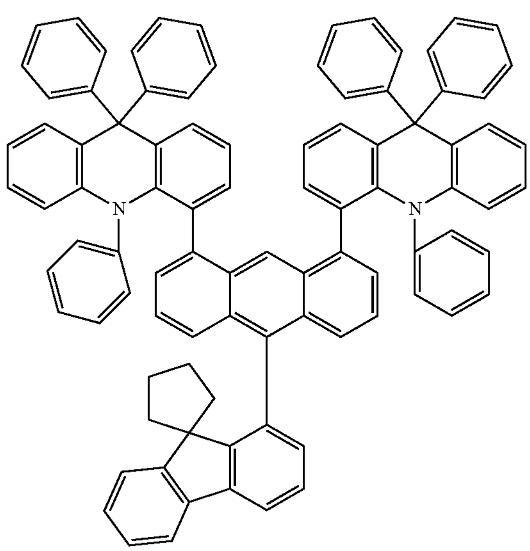
-continued
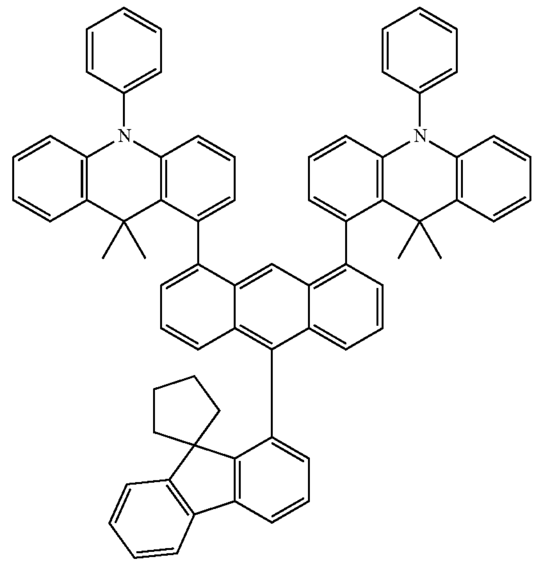
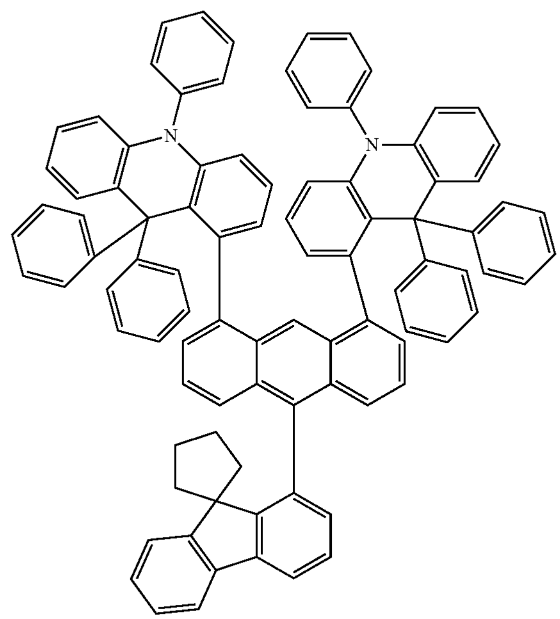
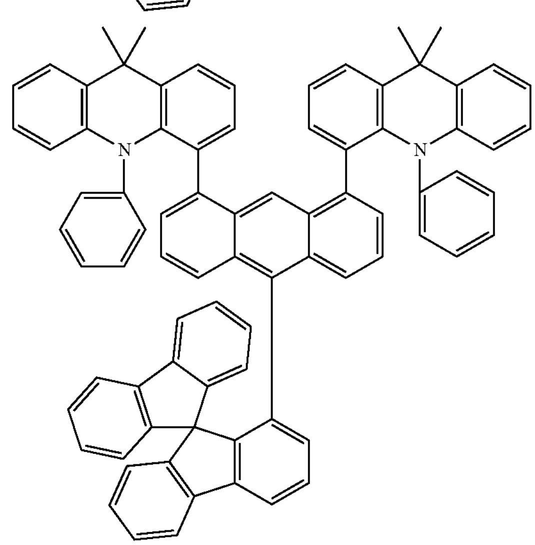

-continued
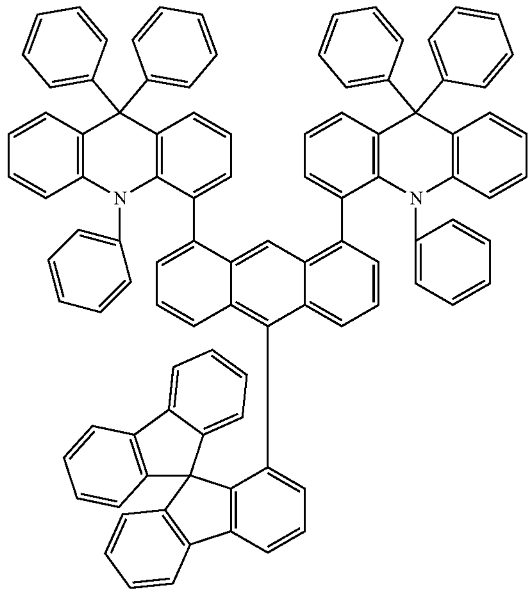
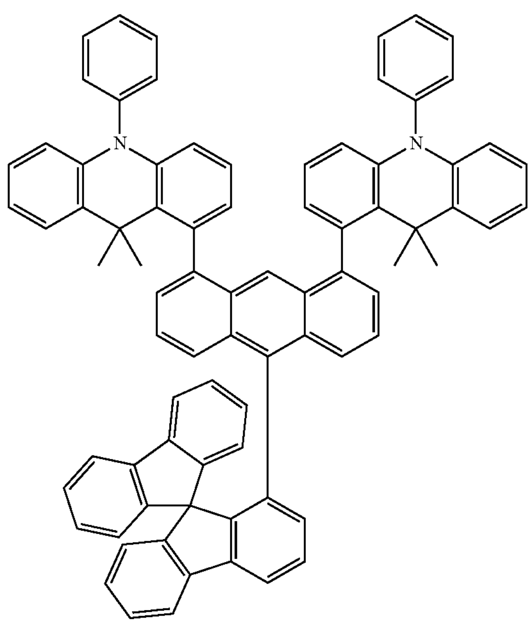
-continued
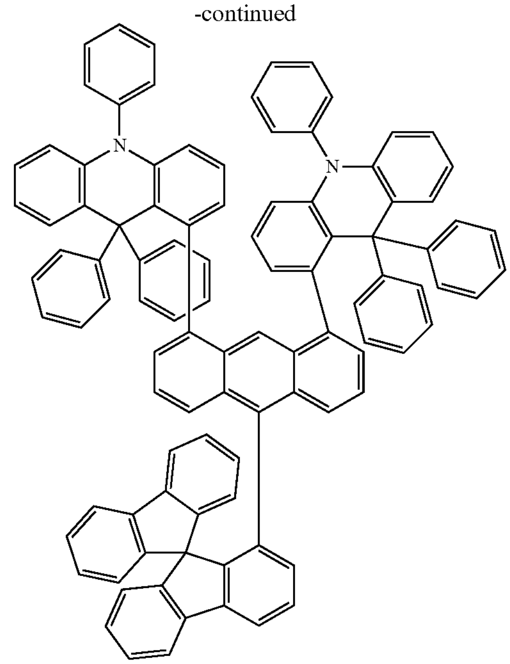
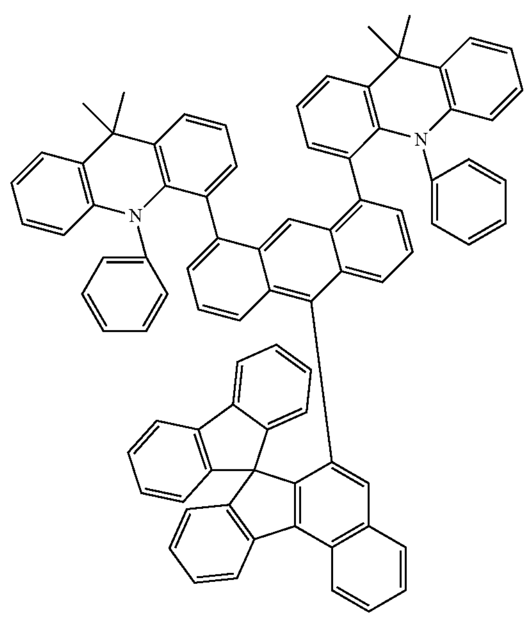

-continued
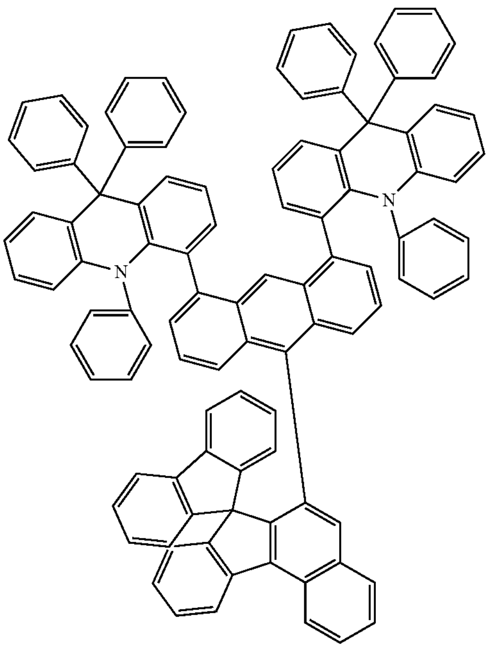
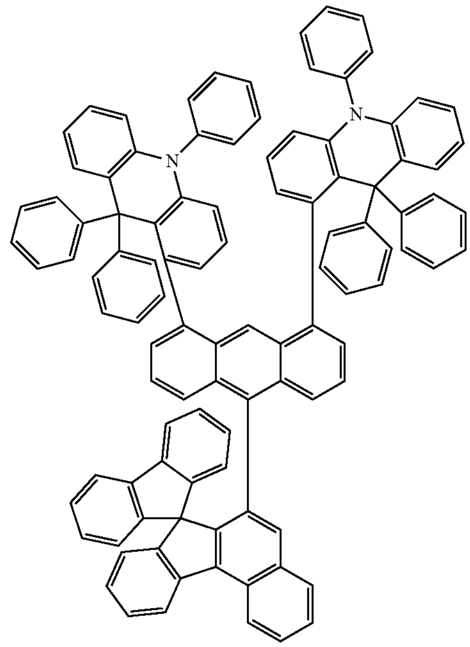
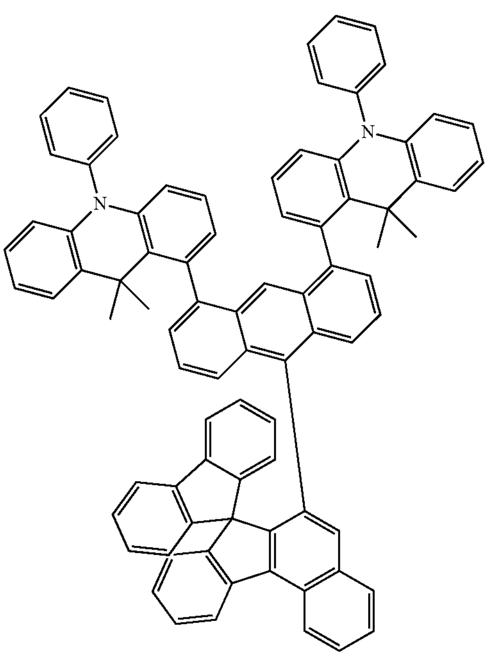
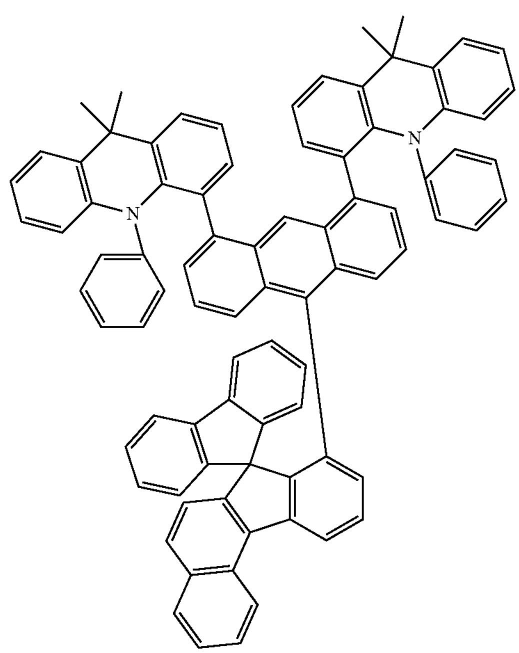

-continued
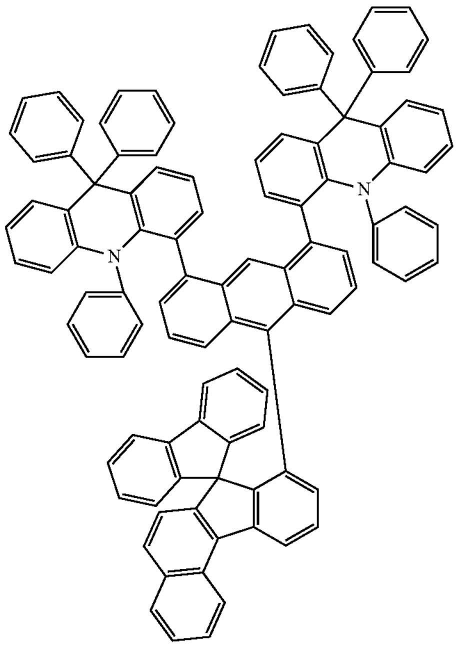
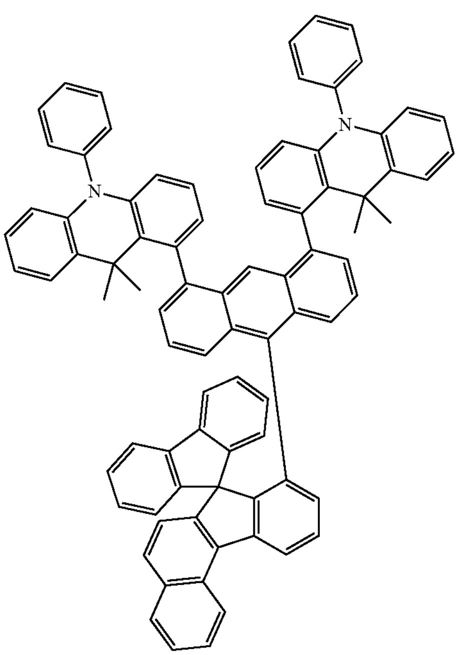
-continued
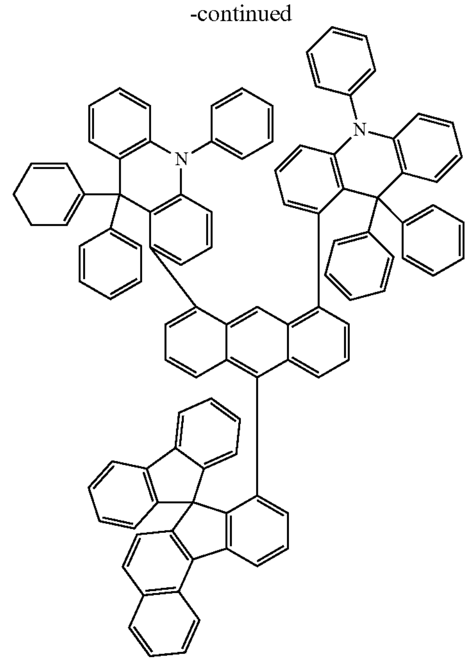
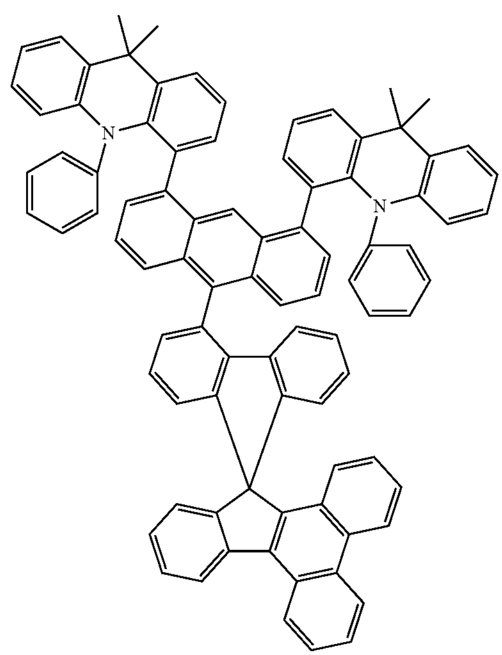

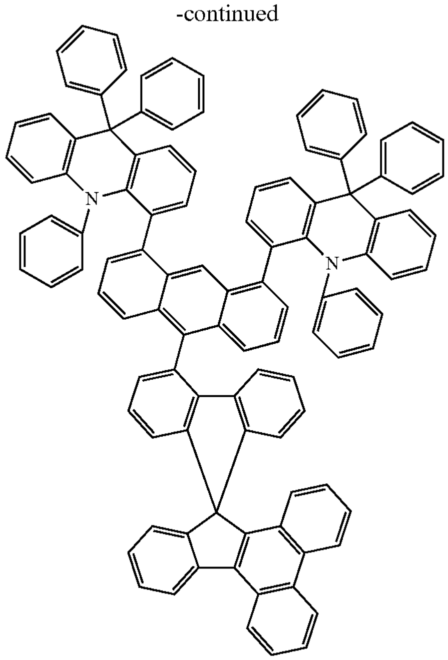
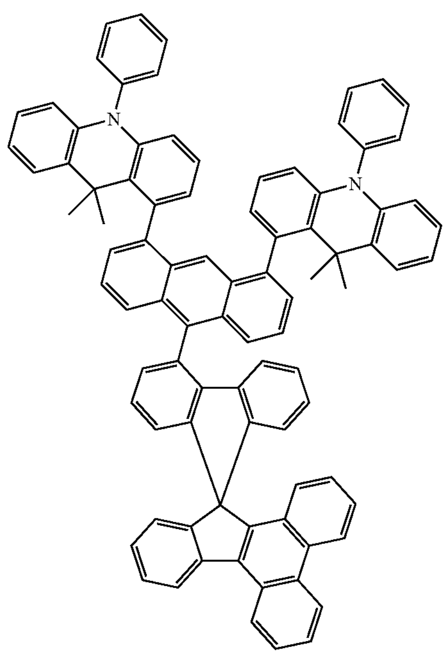
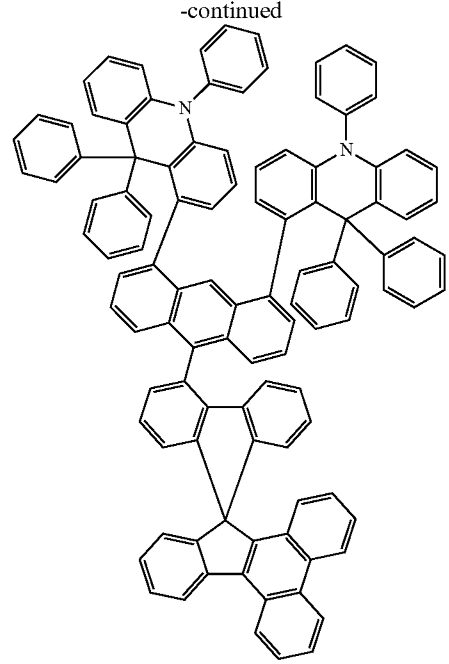
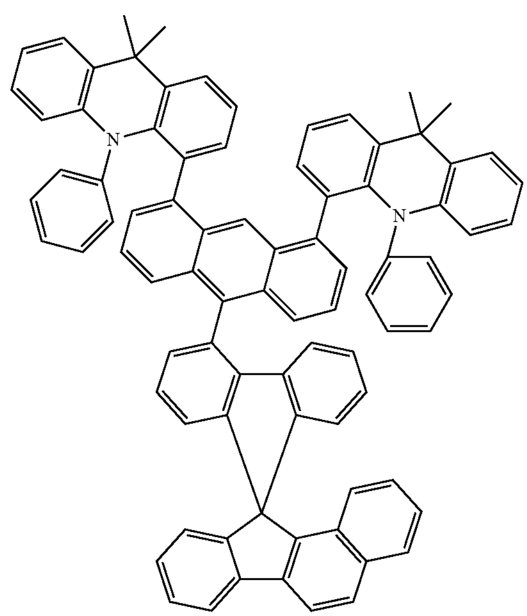

-continued
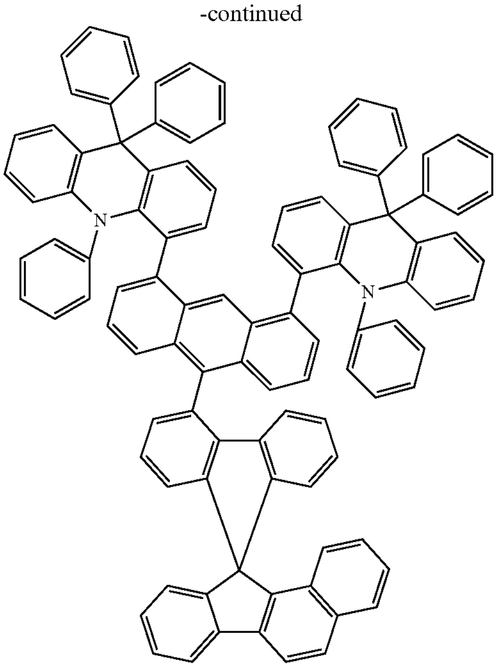
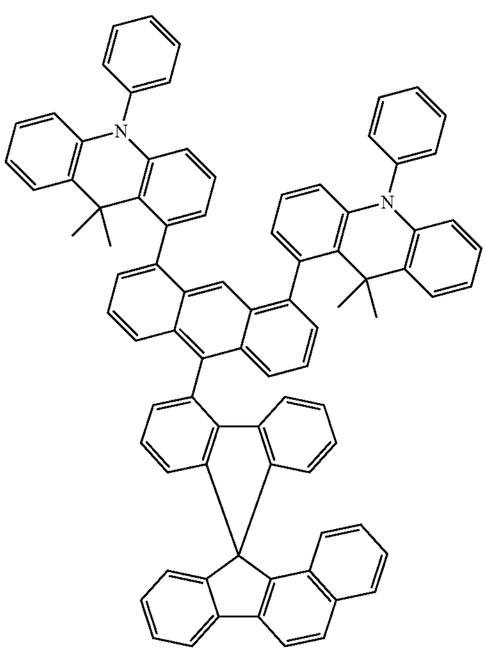
-continued
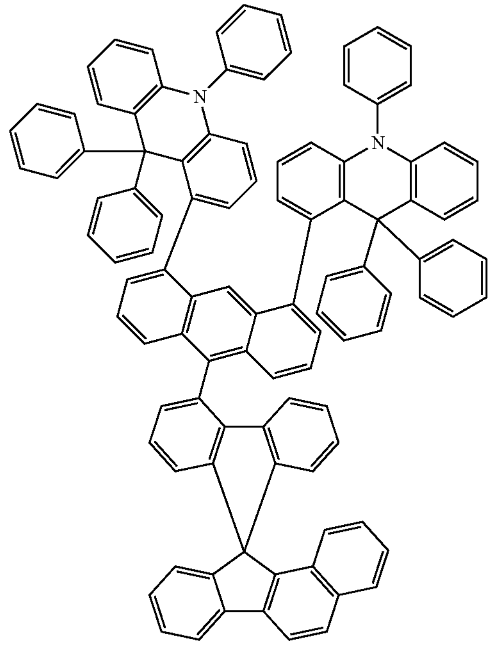
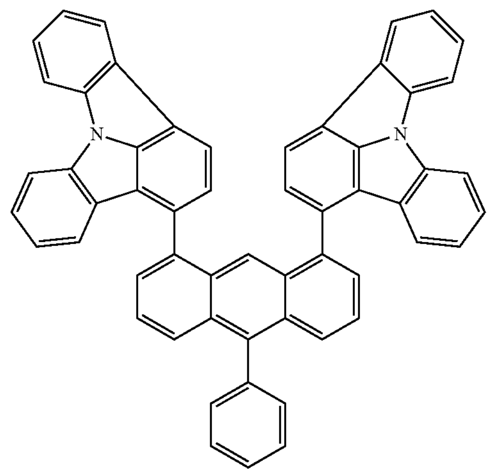
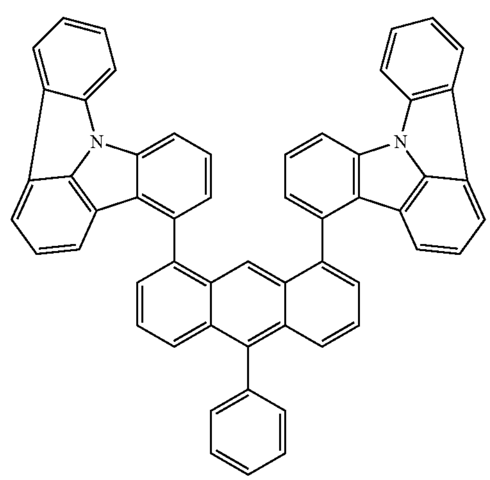

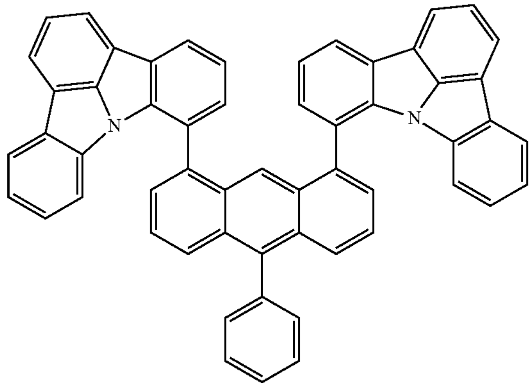
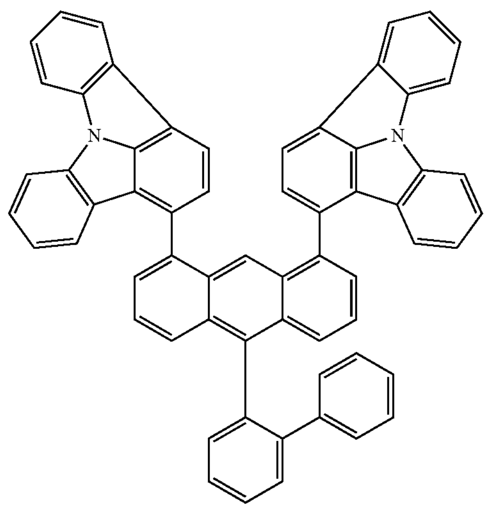
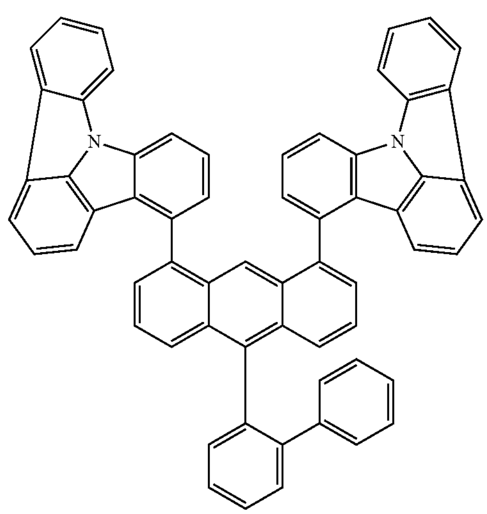
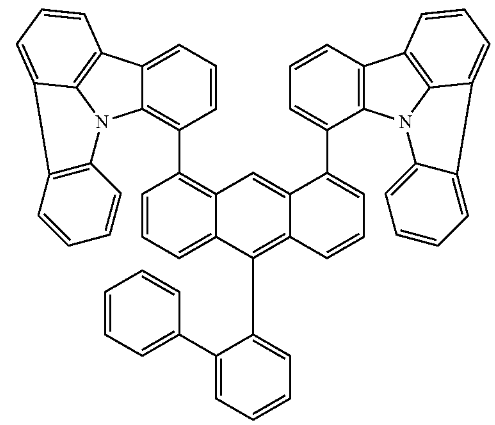
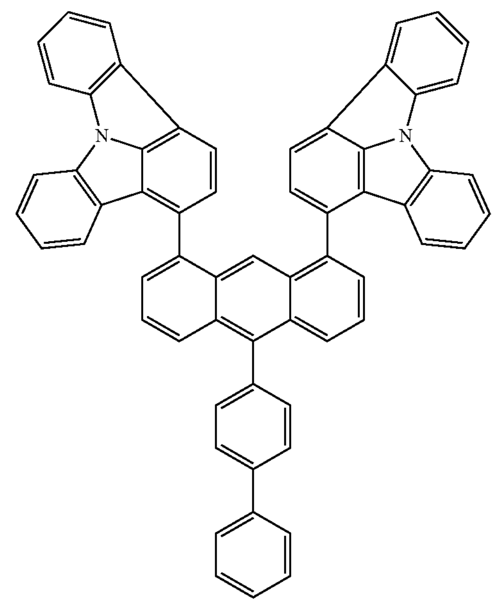
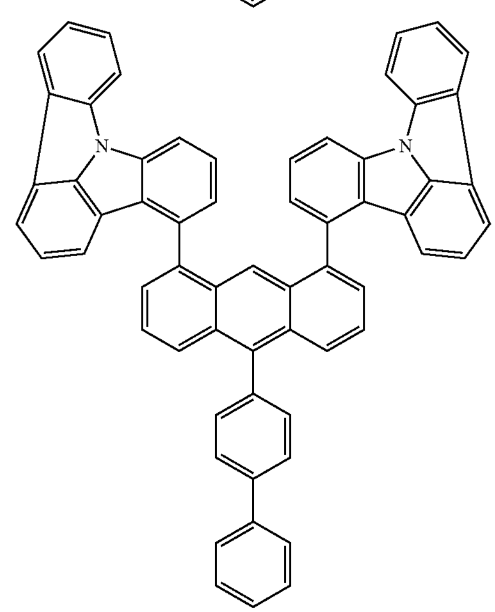

-continued
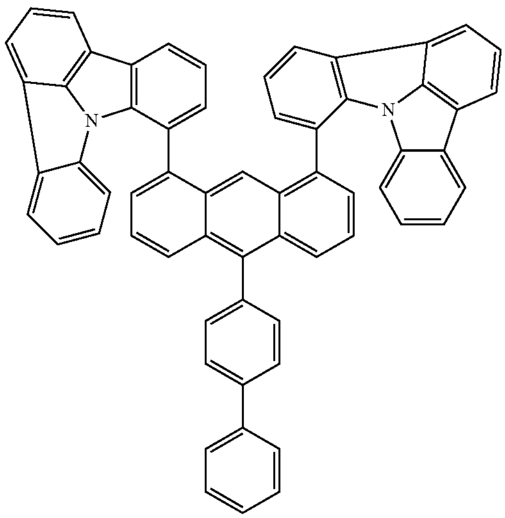
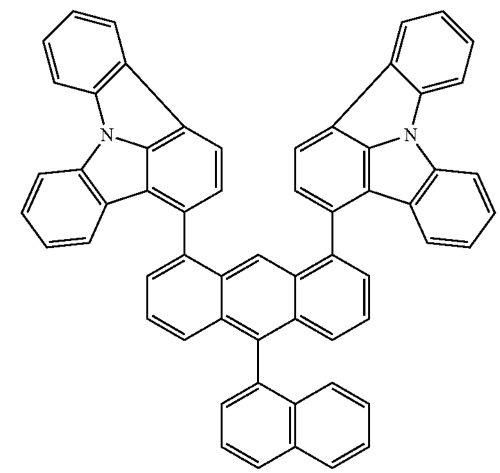
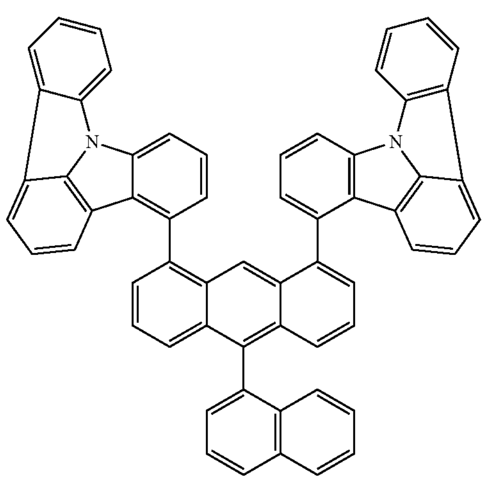
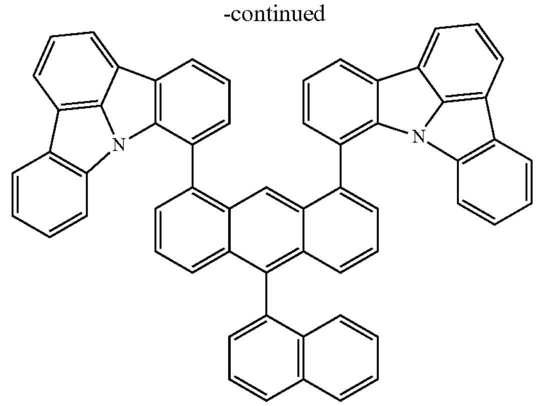
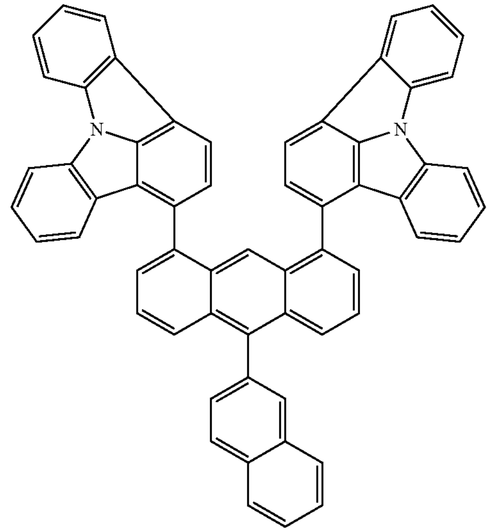
-continued
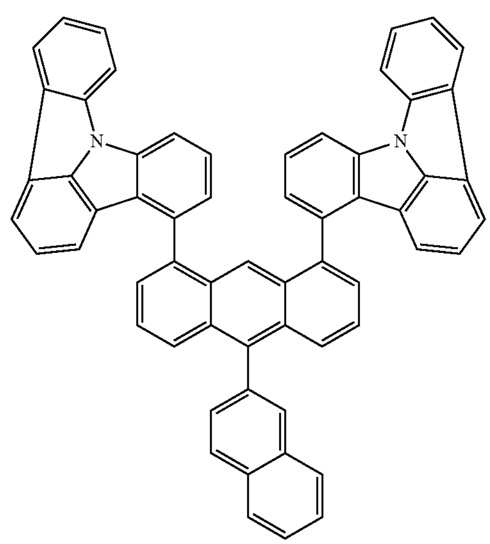

-continued
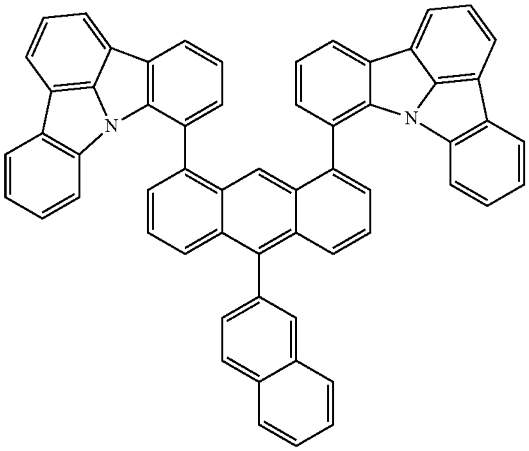
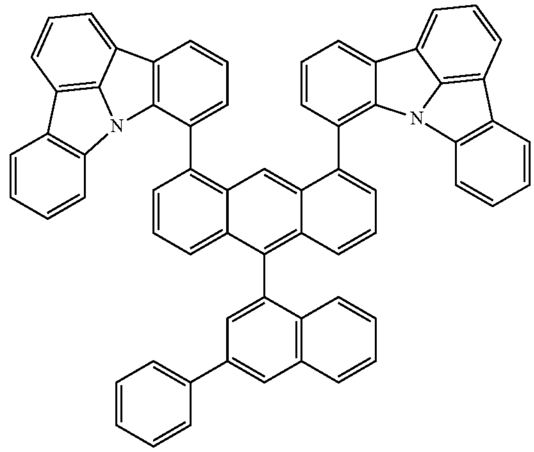
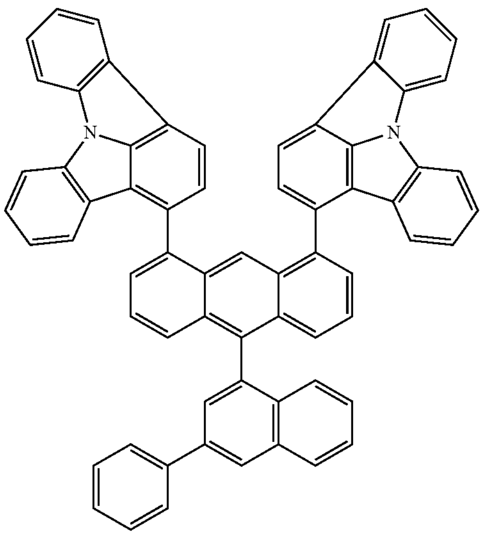
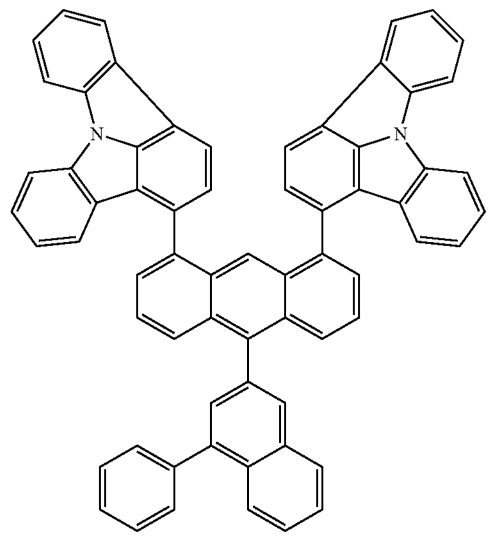
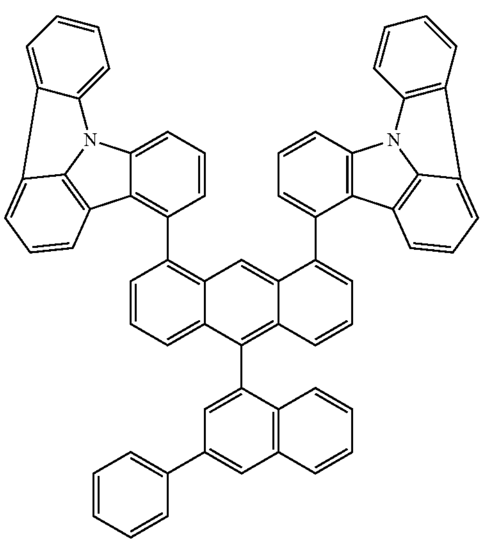
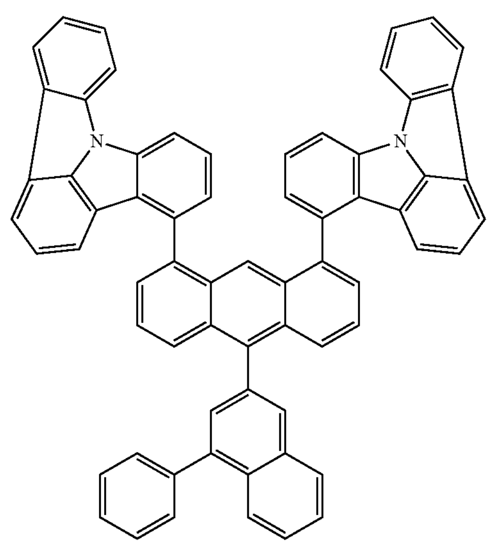

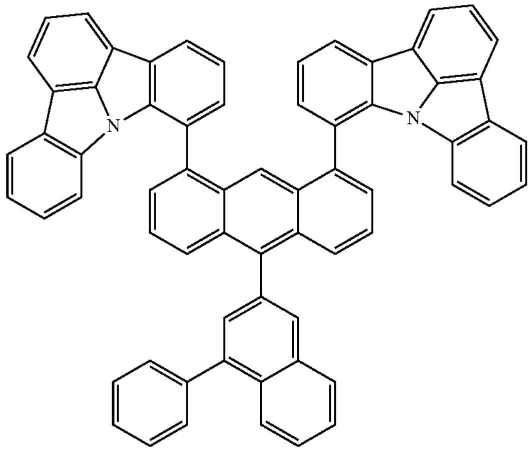
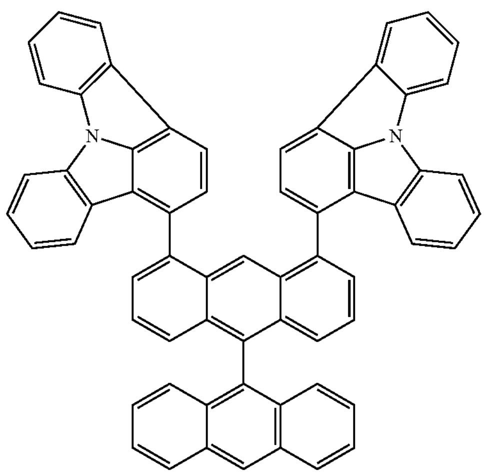
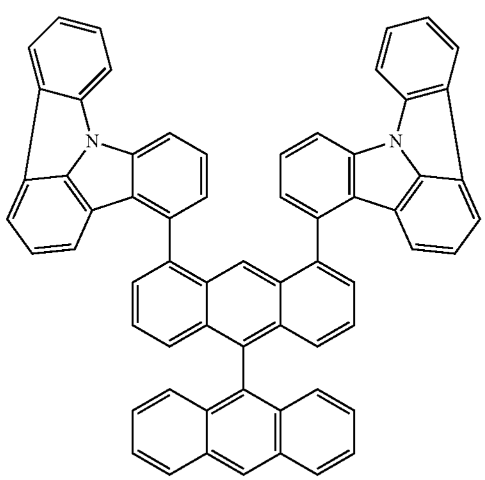
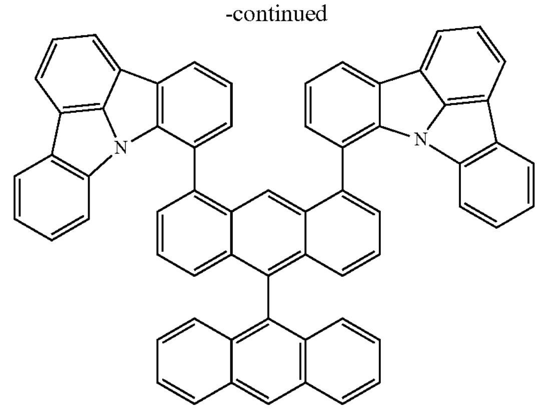
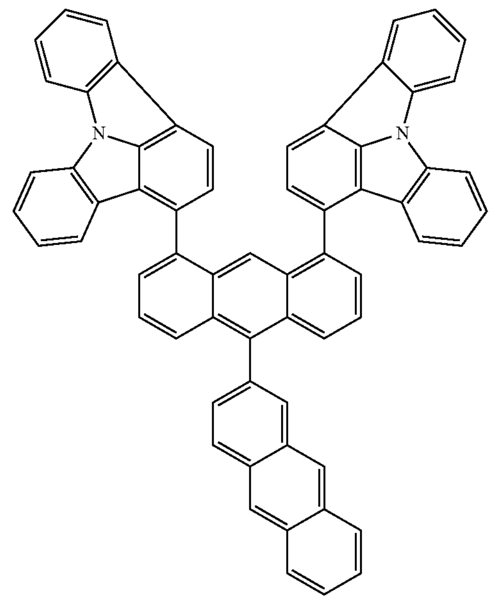
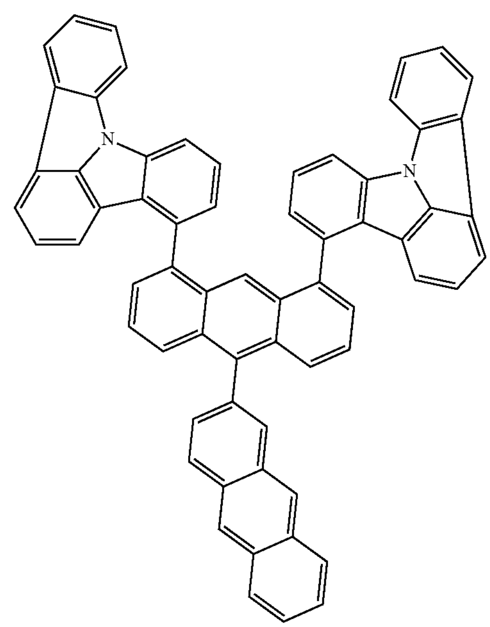

-continued
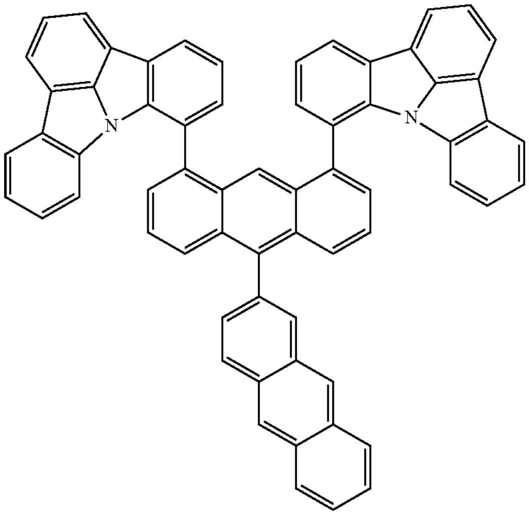
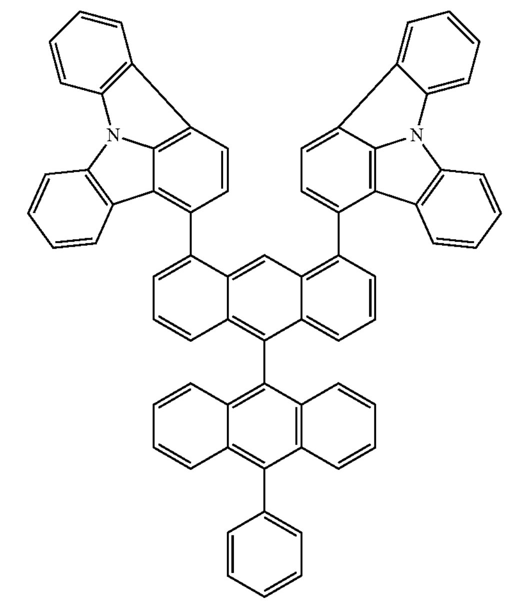
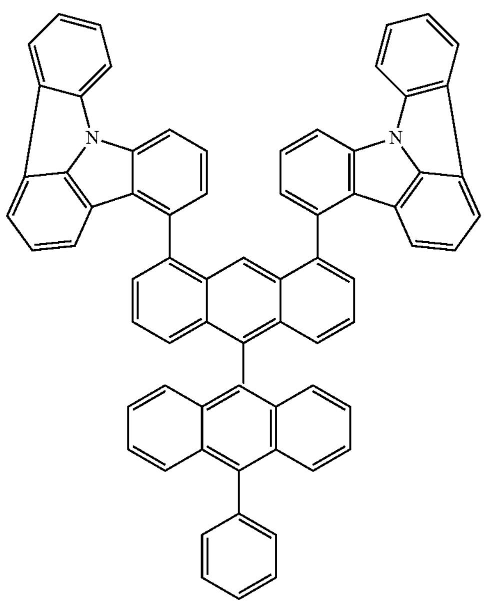
-continued
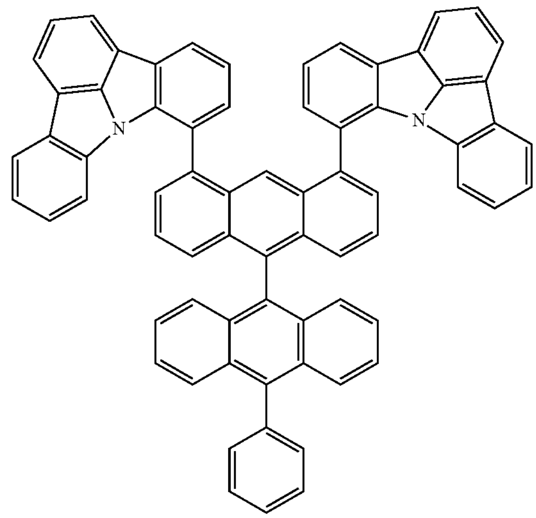
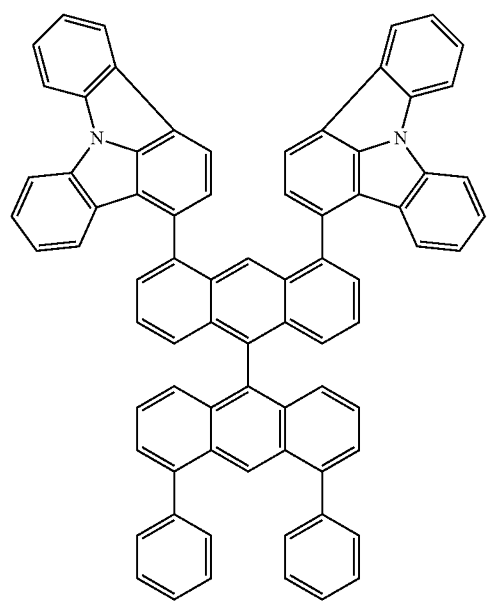

-continued
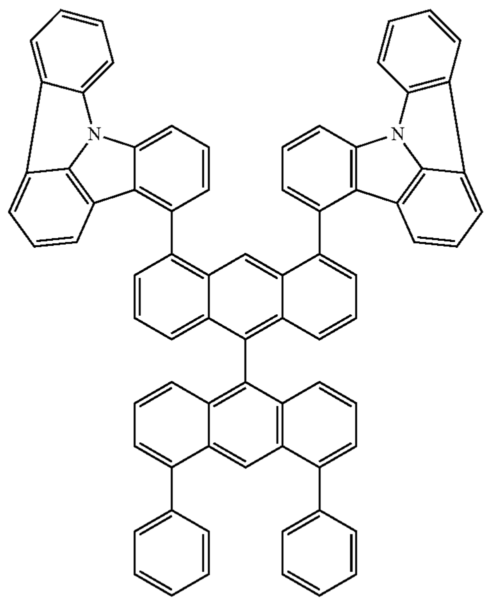
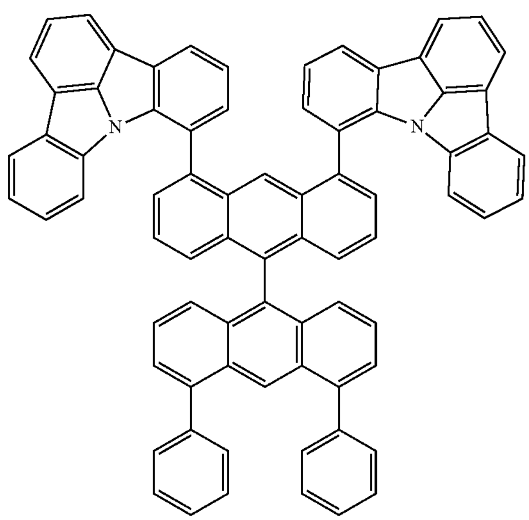
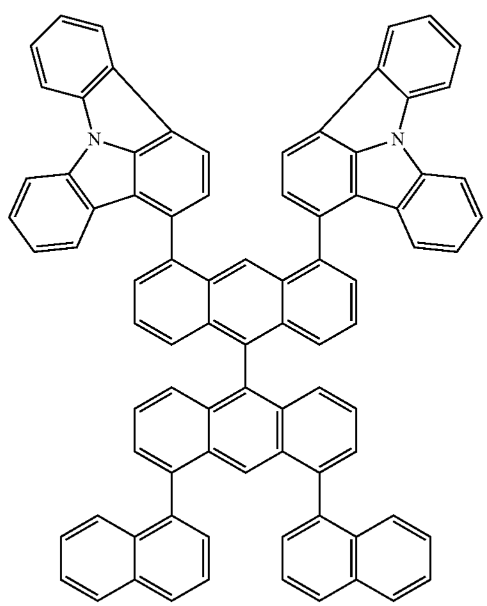
-continued
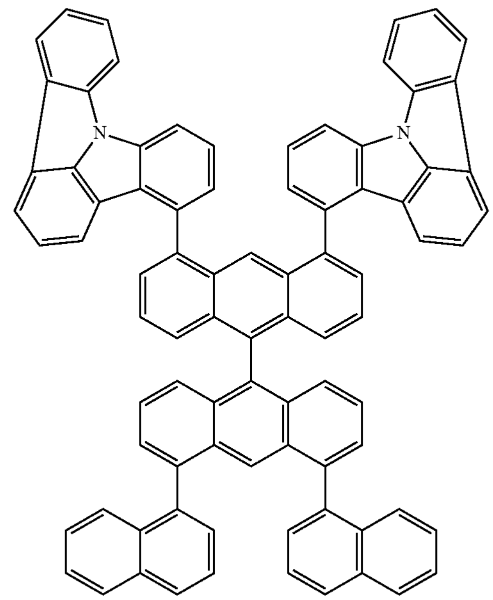
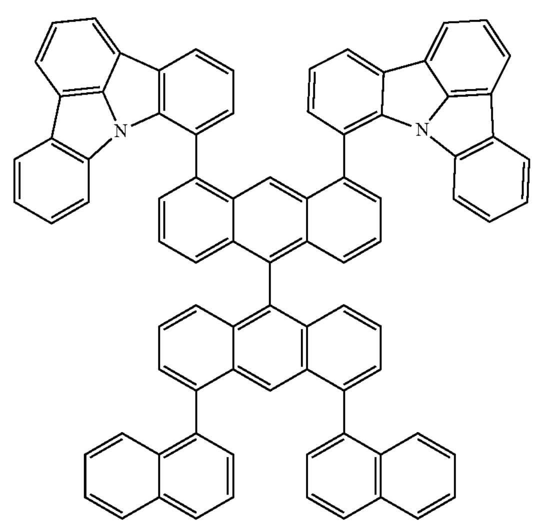

-continued
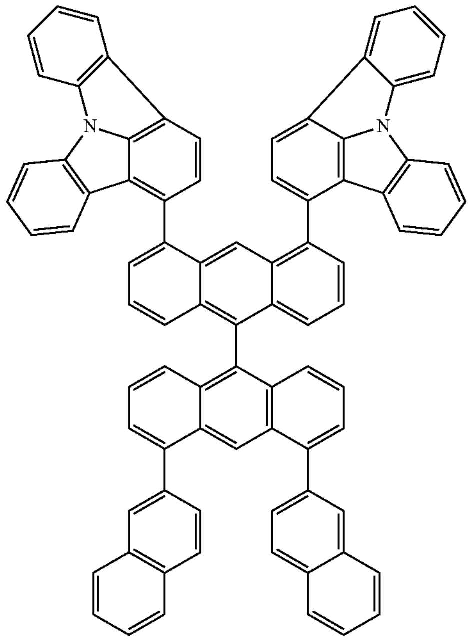
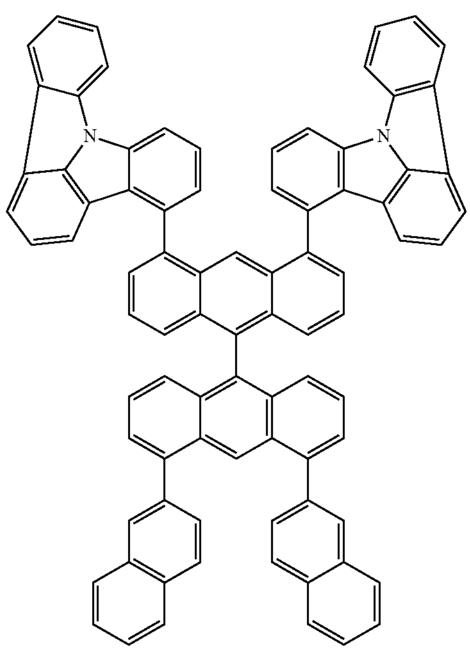
-continued
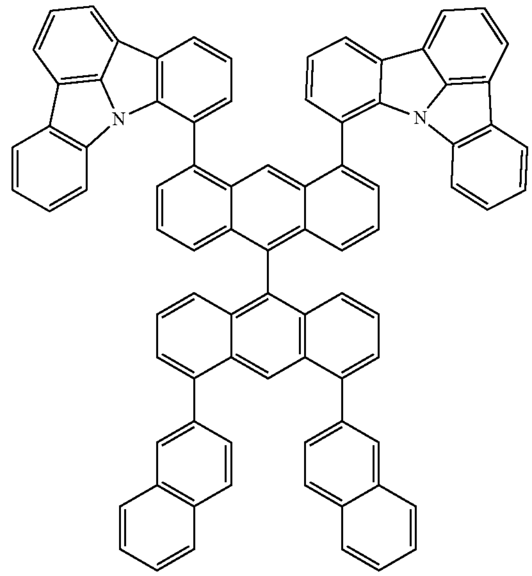
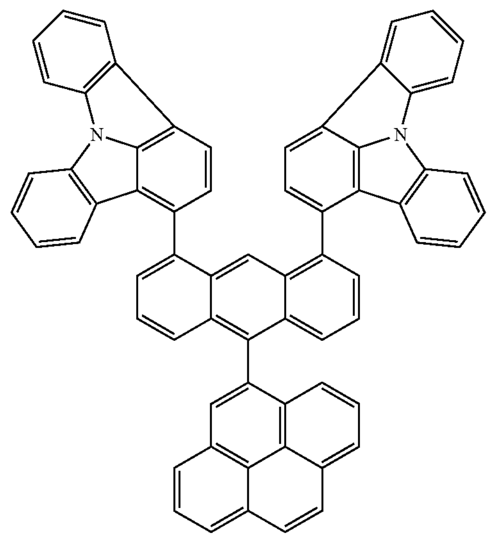
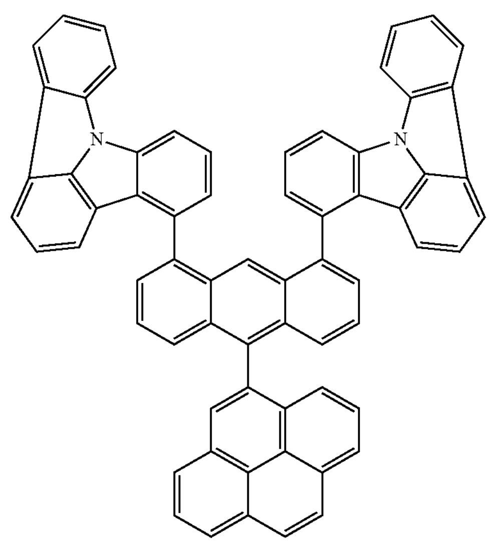

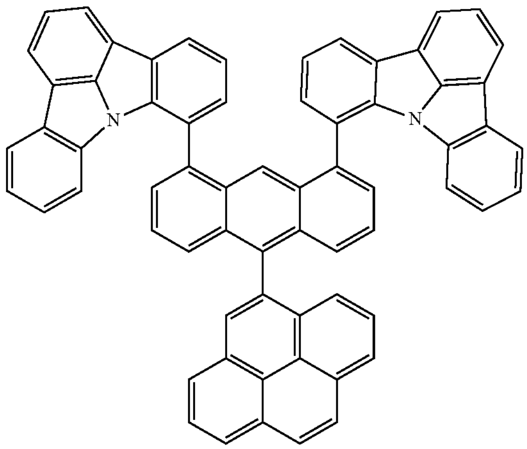
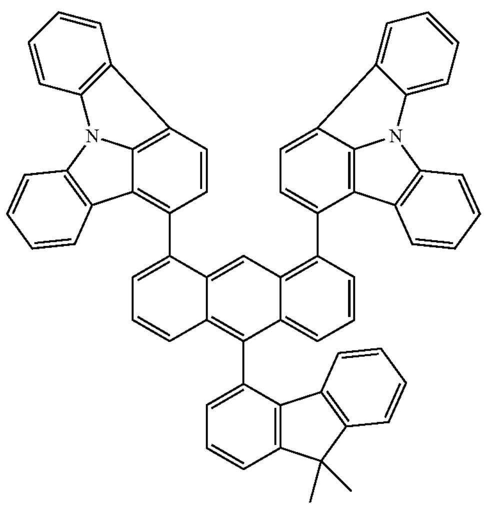
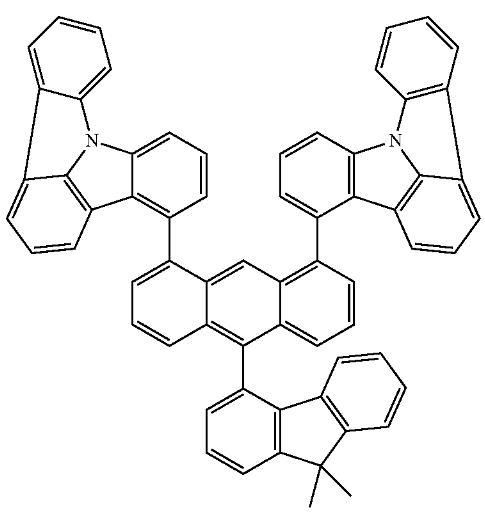
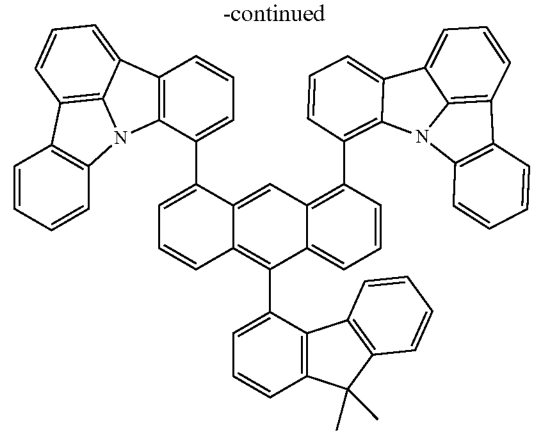
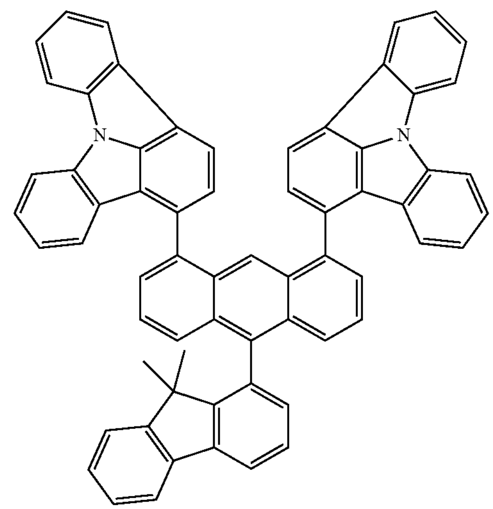
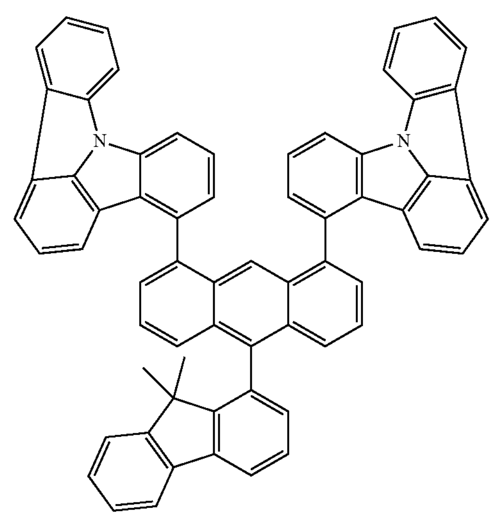

-continued
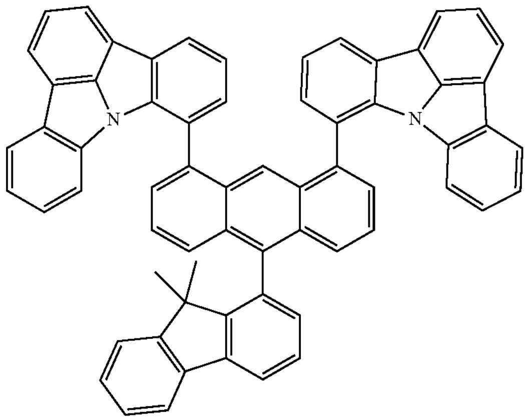
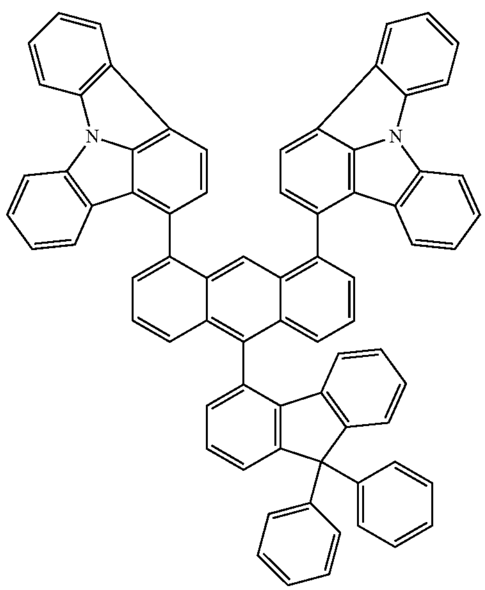
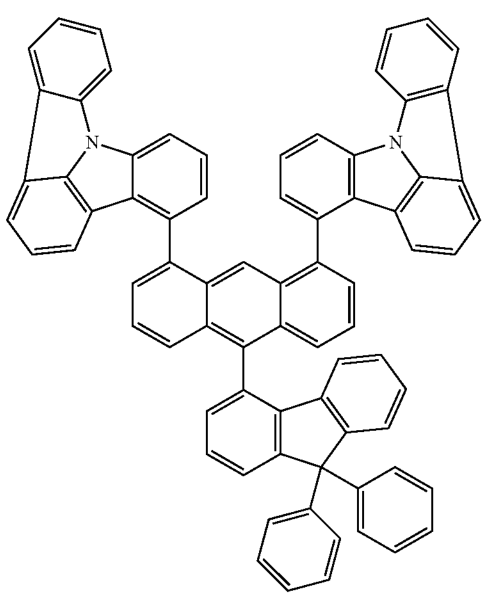
-continued
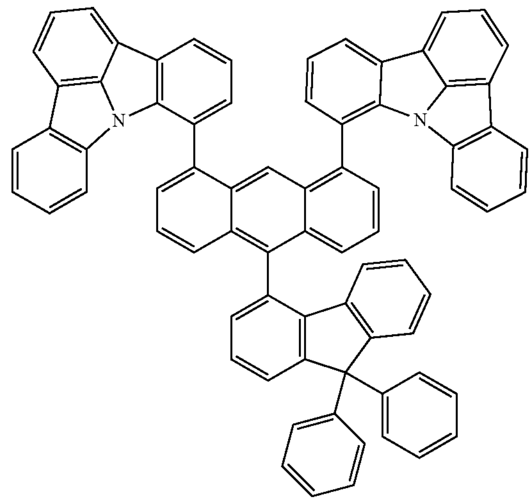
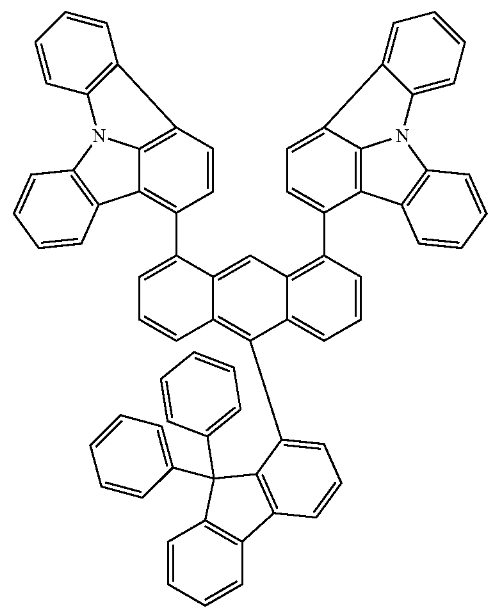
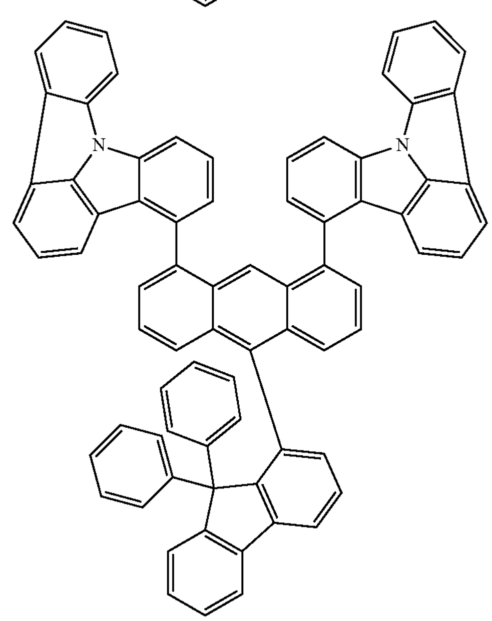

-continued
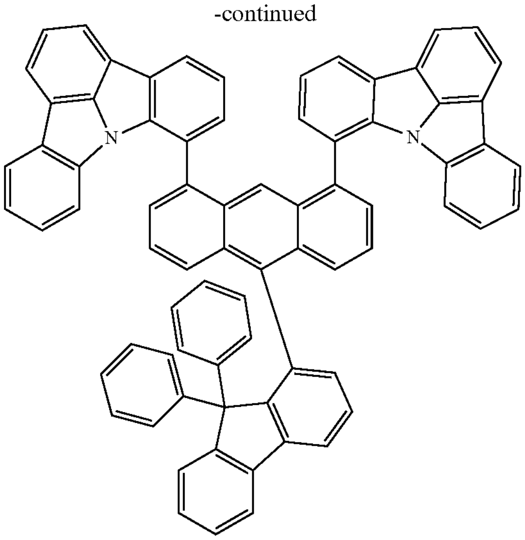
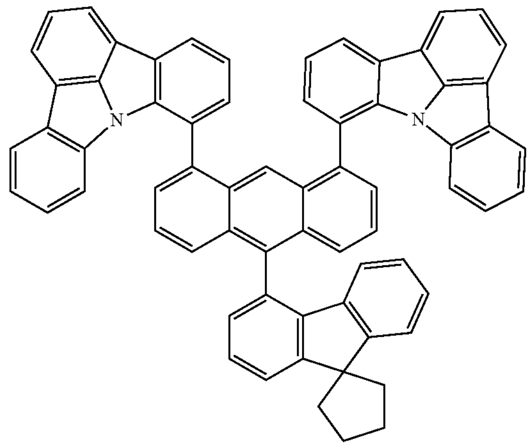
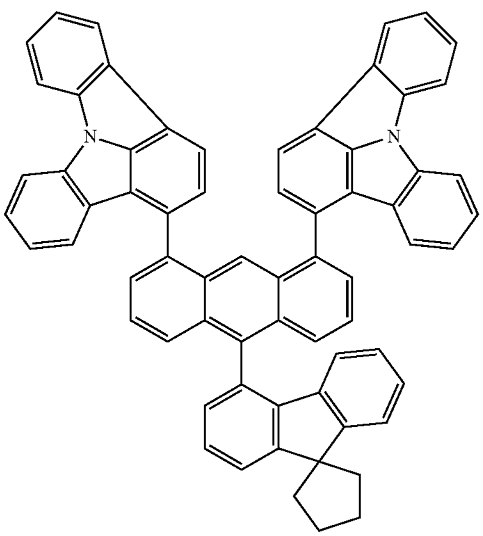
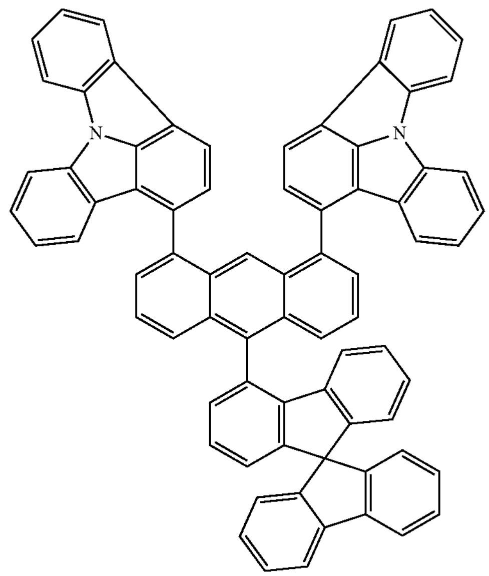
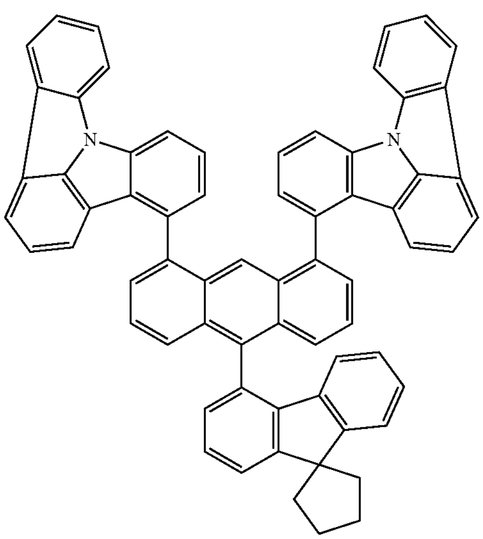
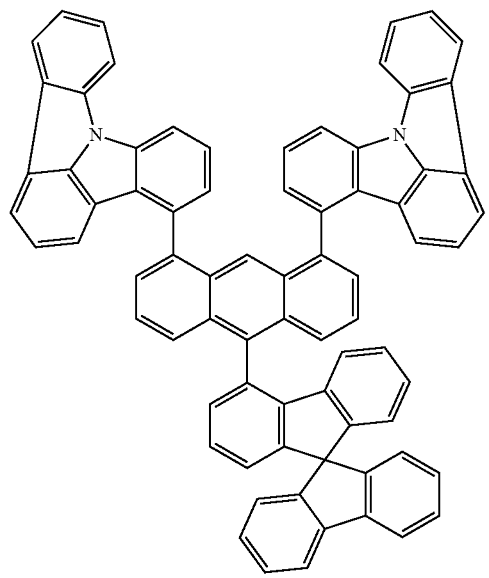
-continued -continued
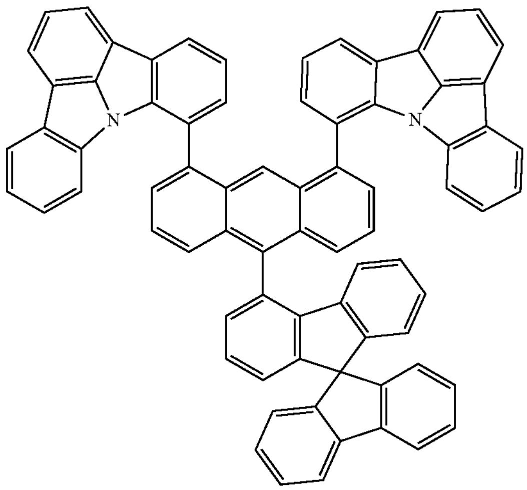
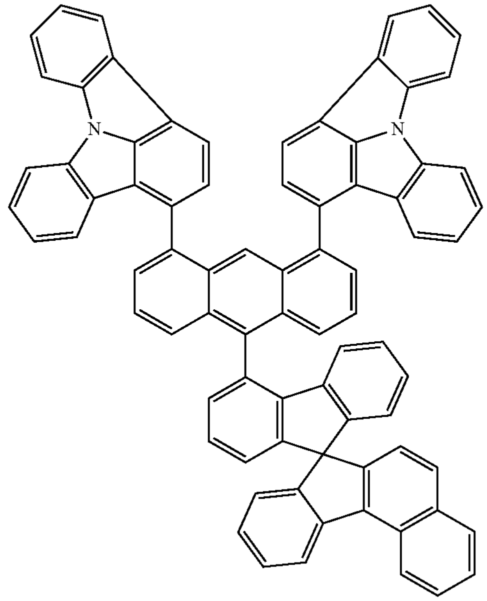
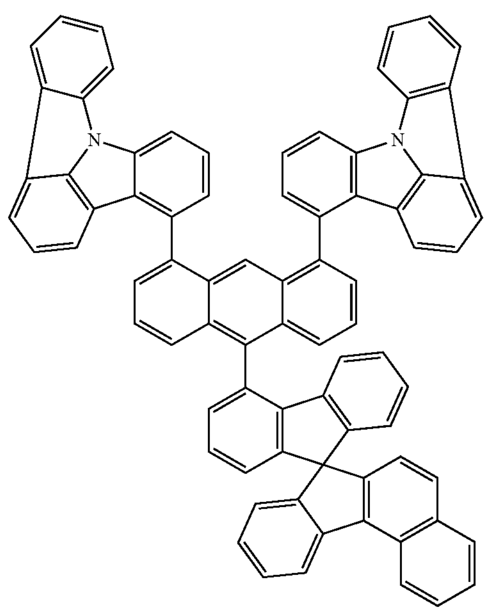
-continued
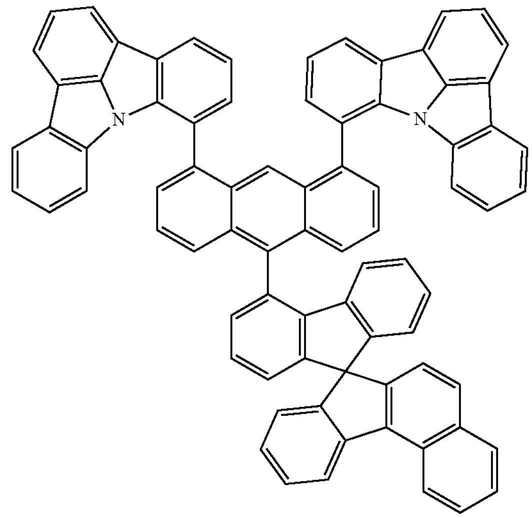
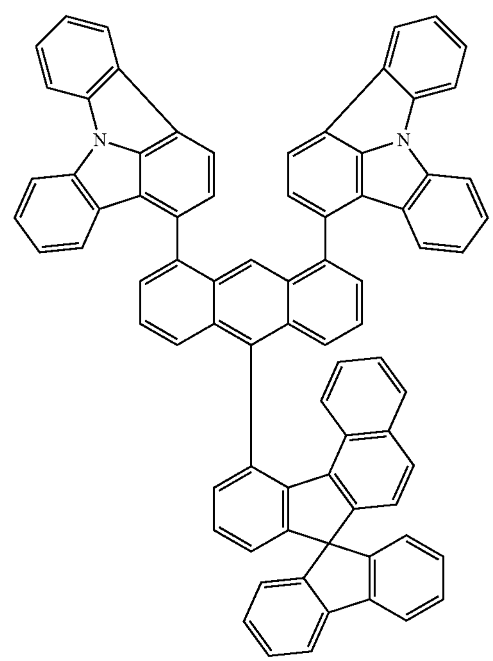

-continued
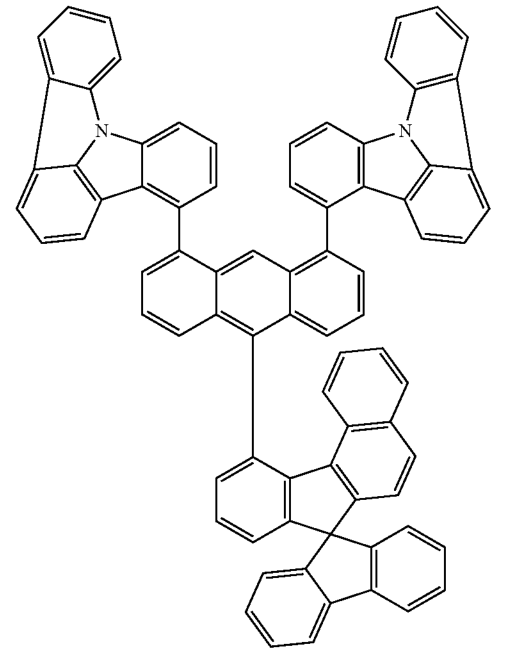
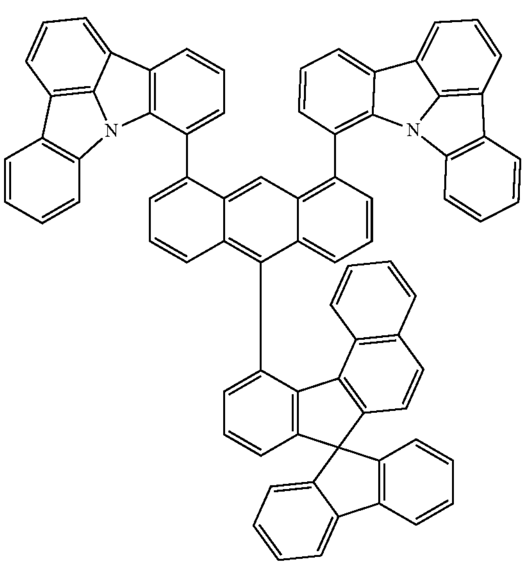
-continued
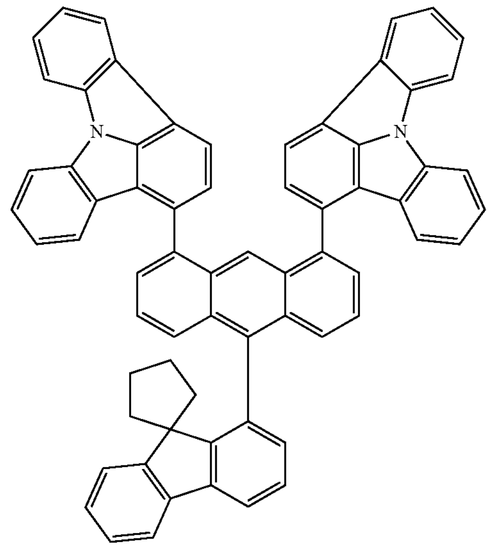
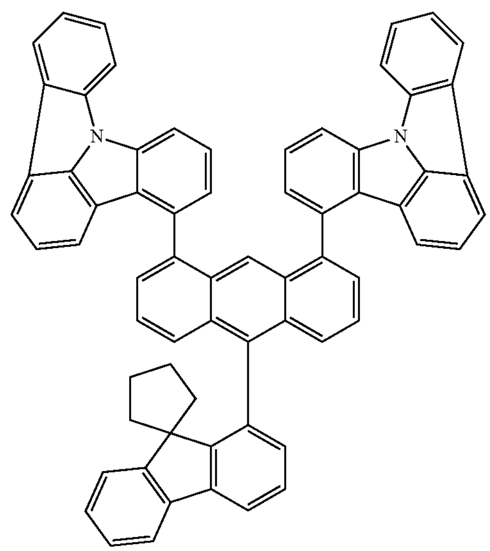
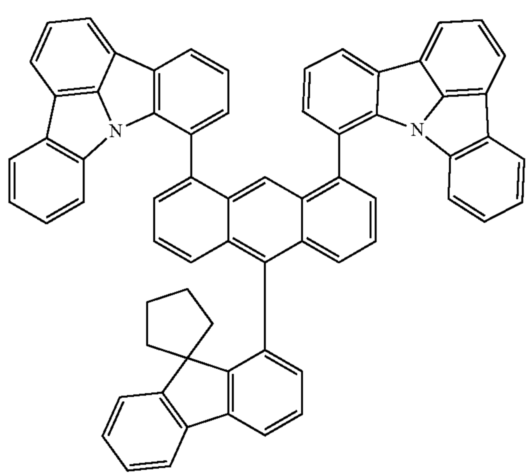

-continued
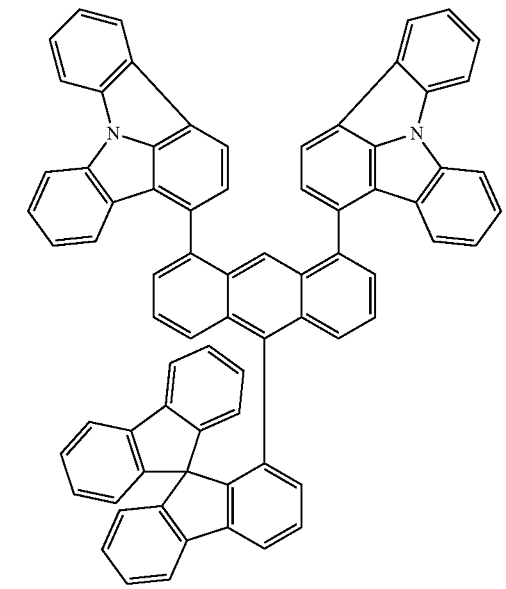
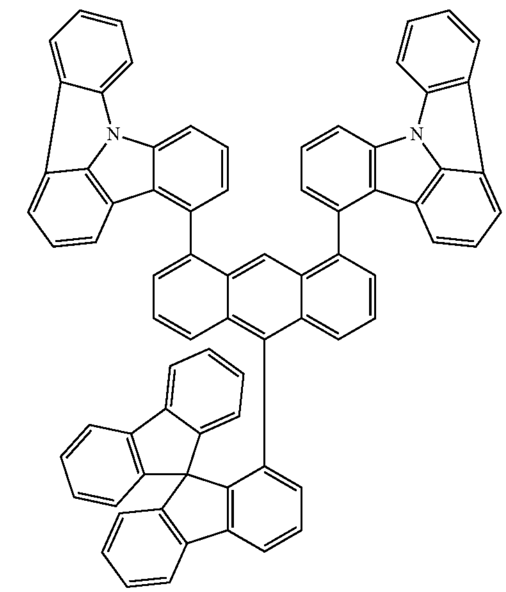
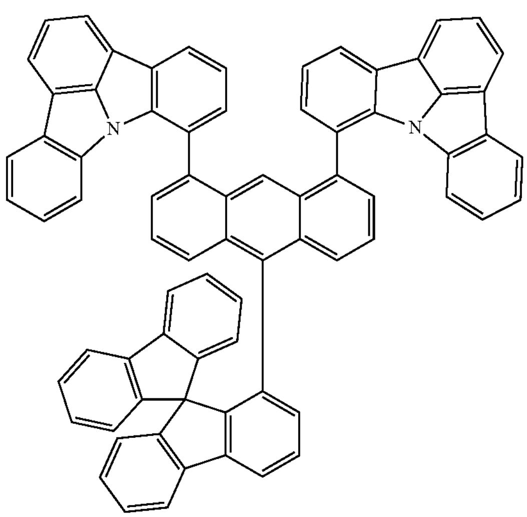
-continued
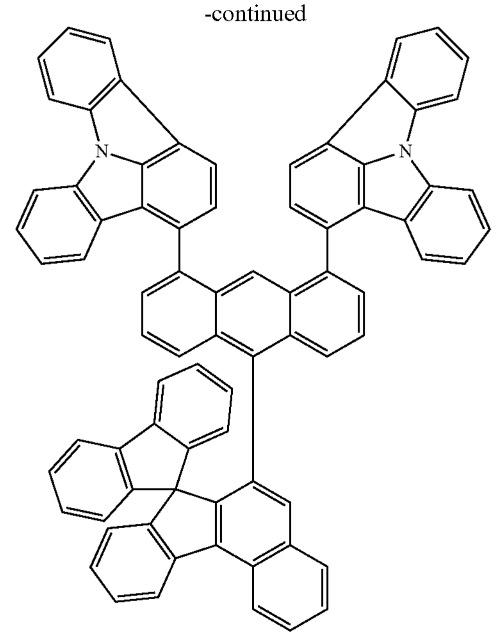
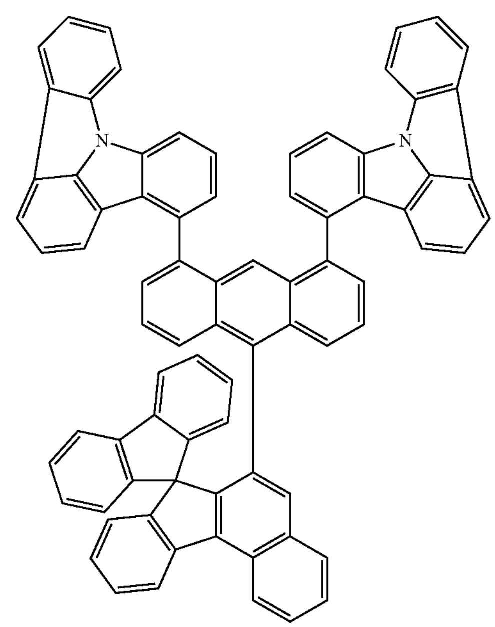

-continued
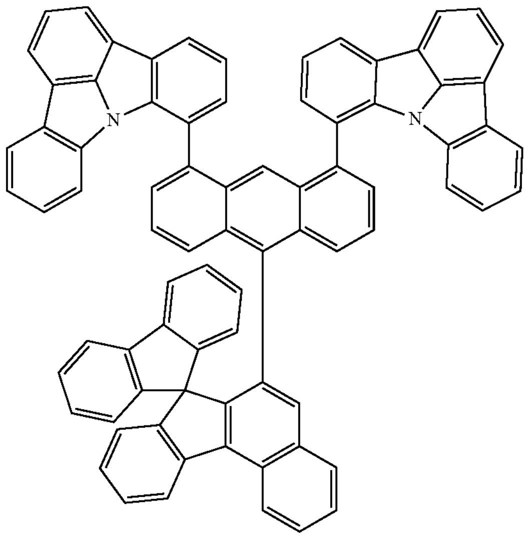
-continued
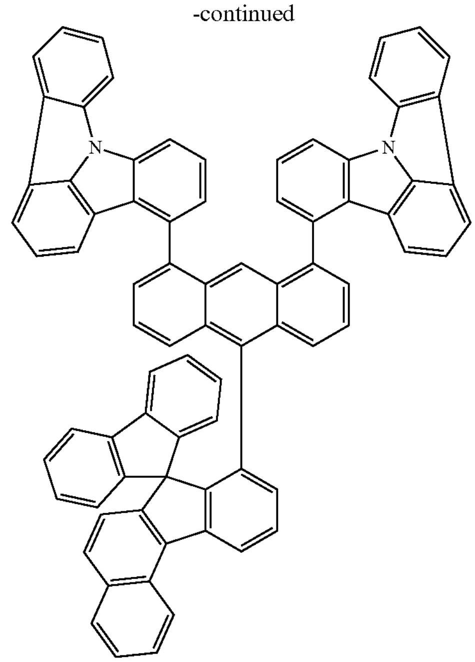
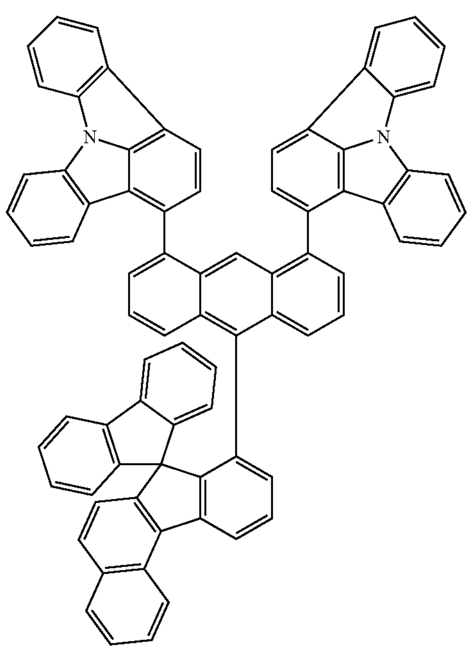
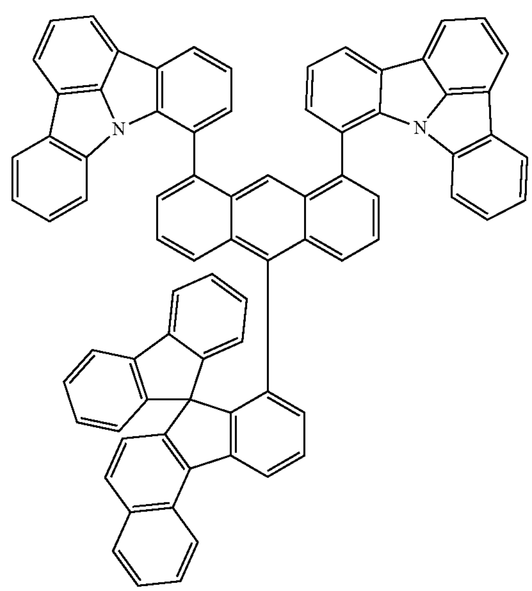

-continued
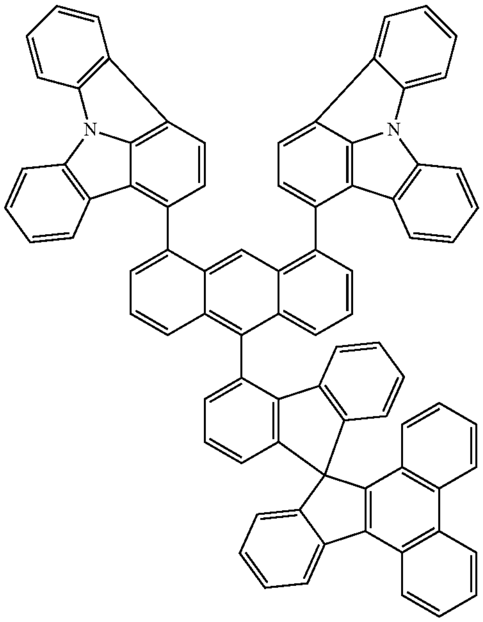
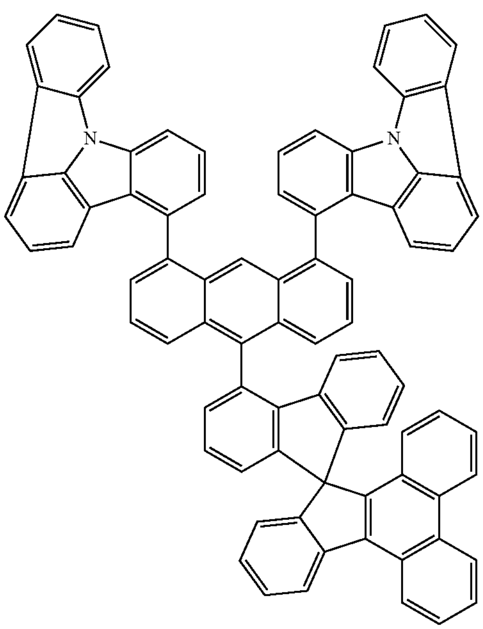
-continued
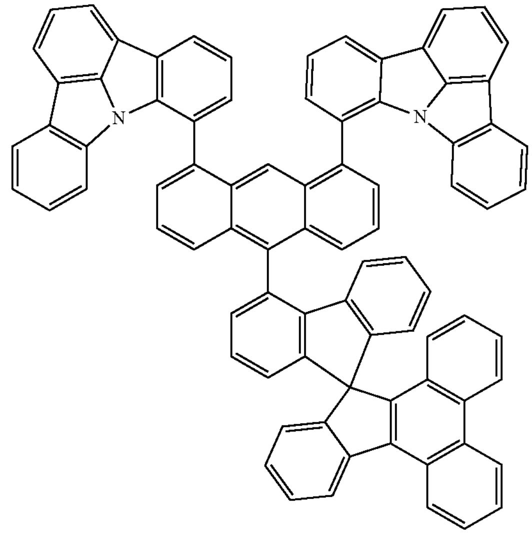
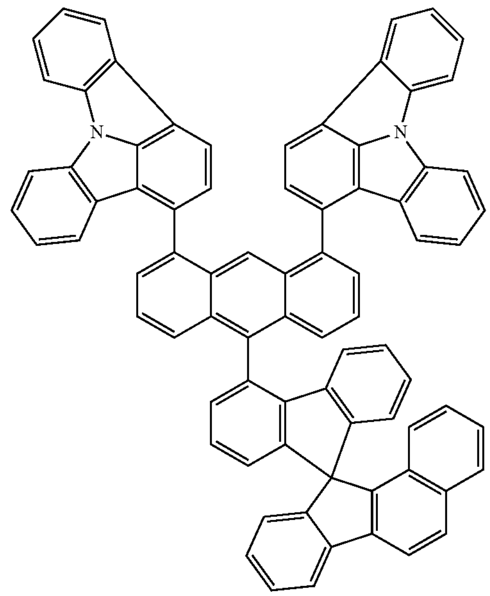
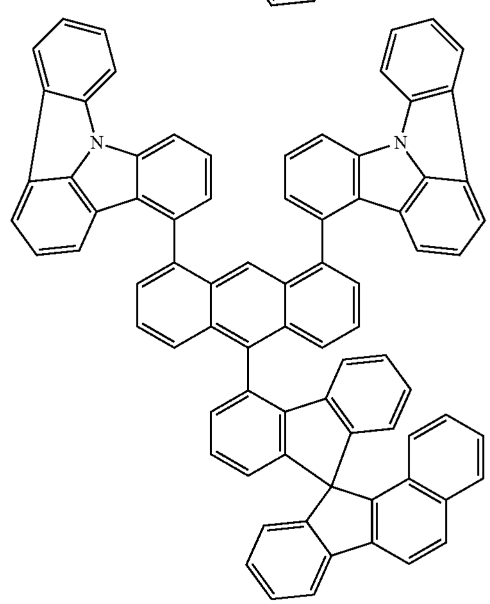

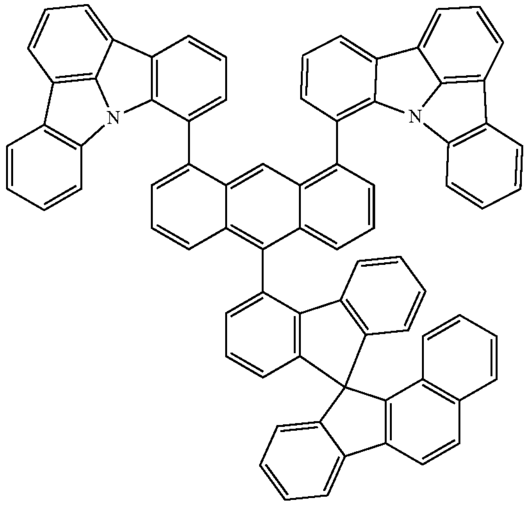
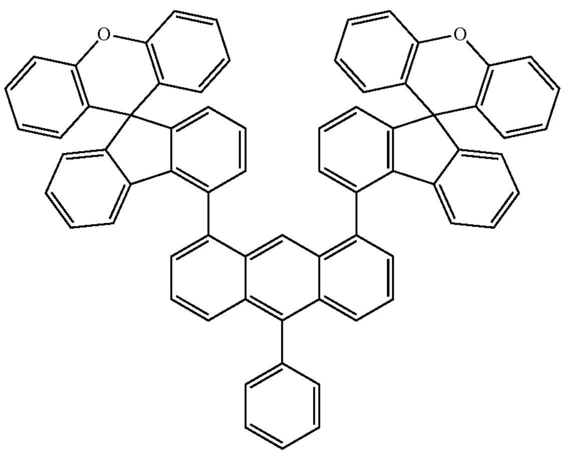
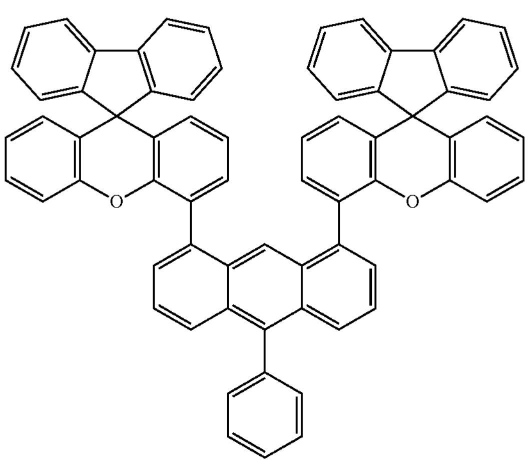
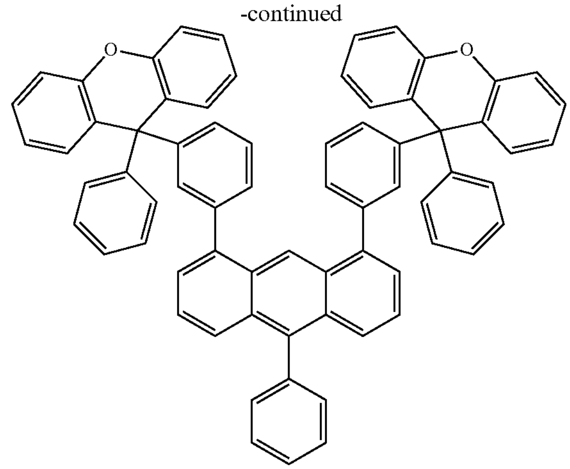
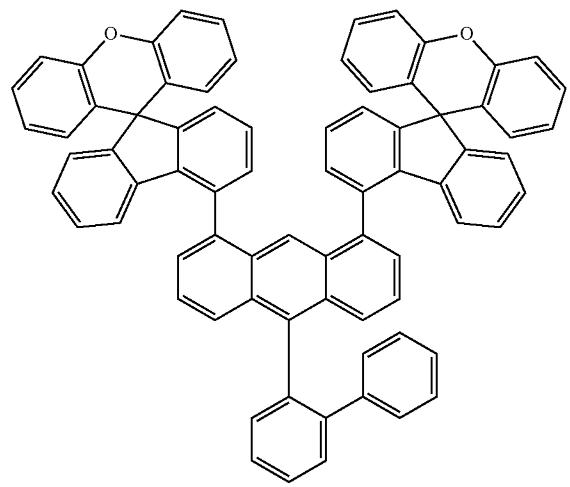
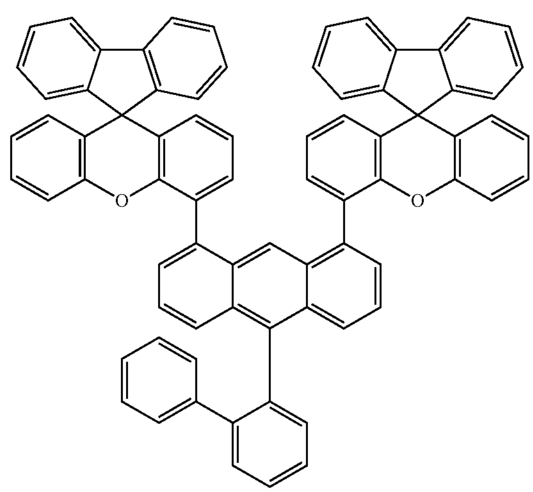

-continued
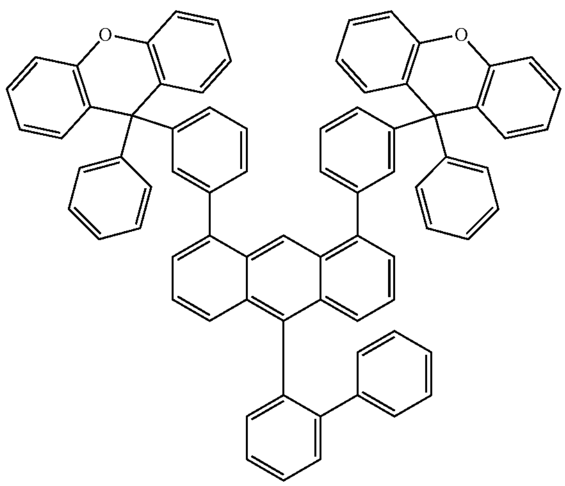
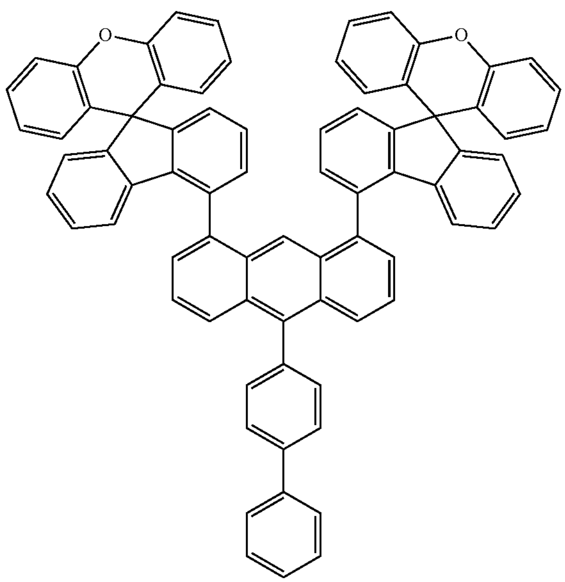
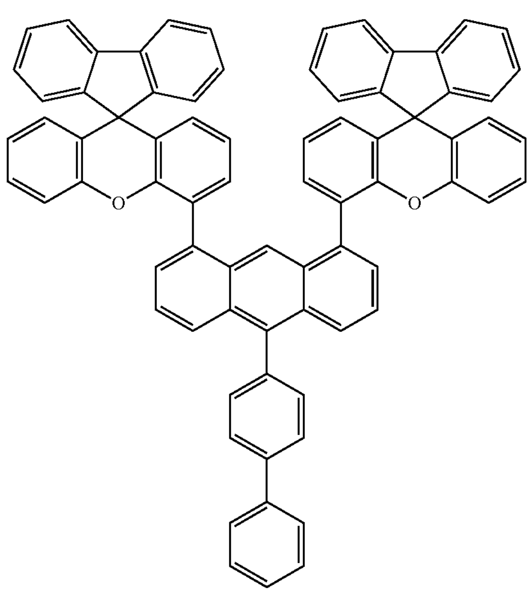
-continued
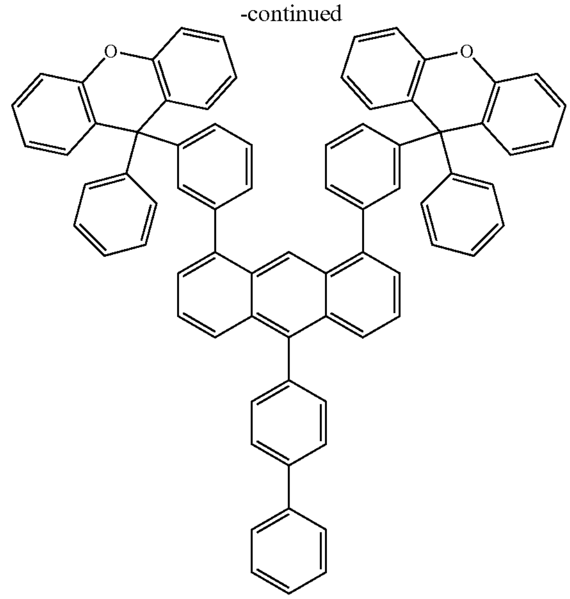
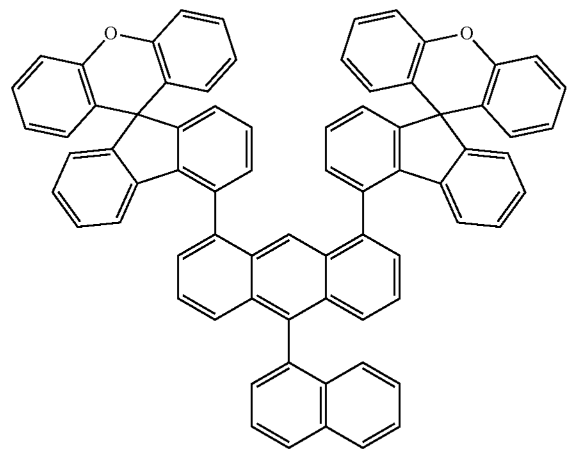
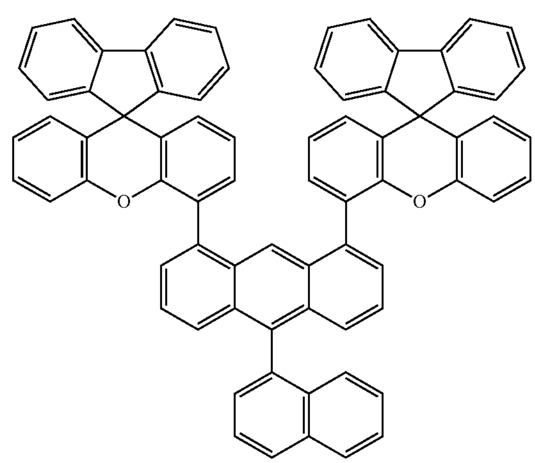

-continued
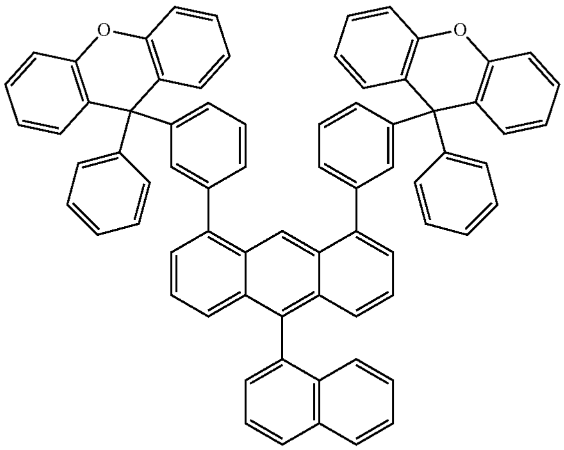
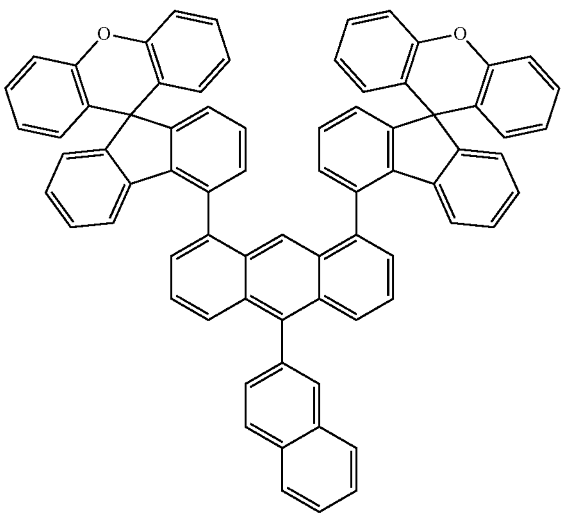
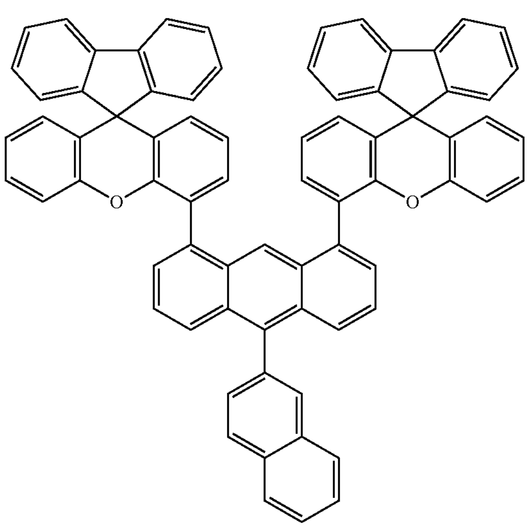
-continued
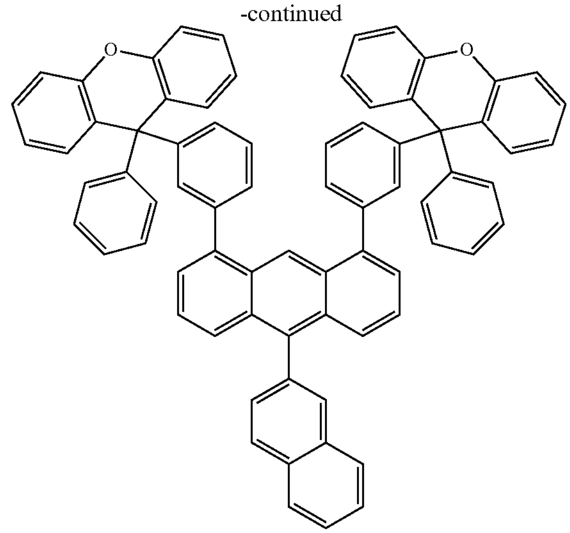
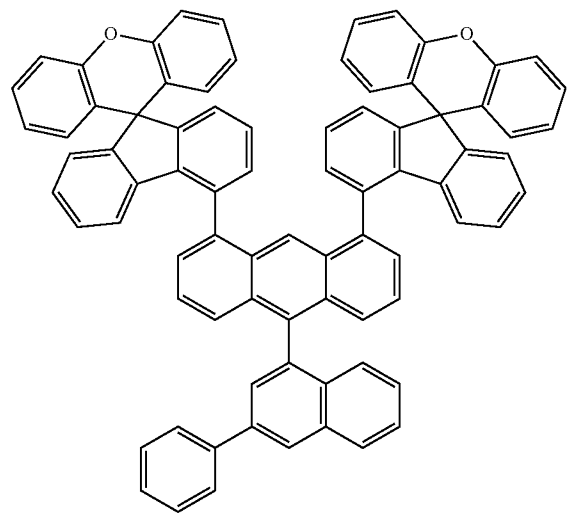
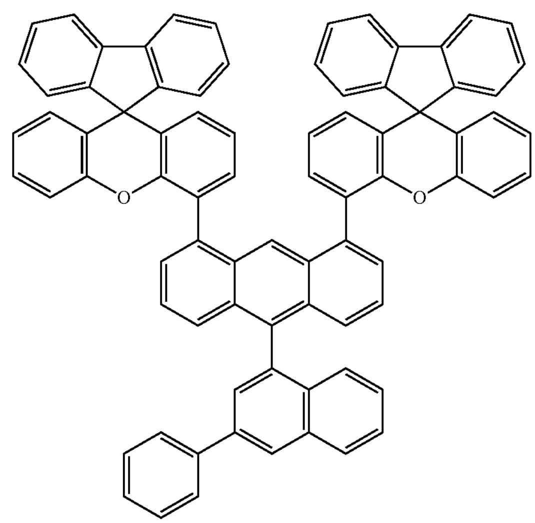

-continued
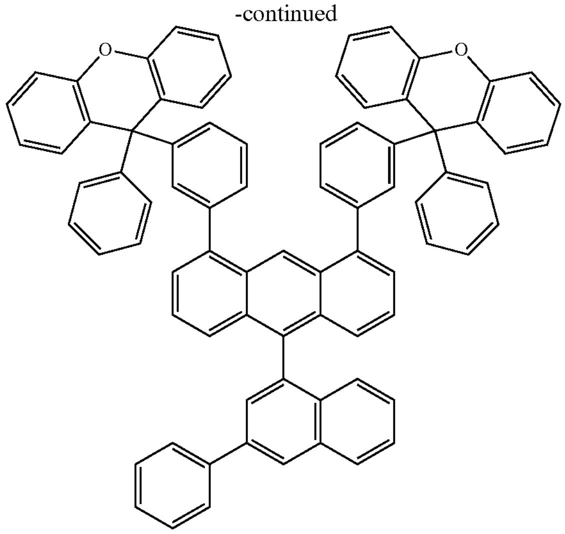
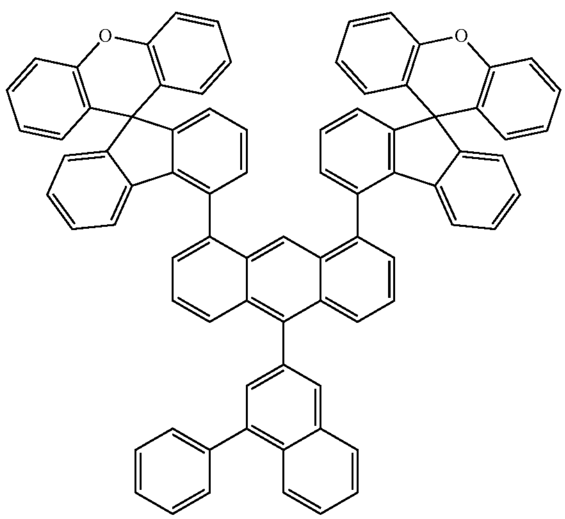
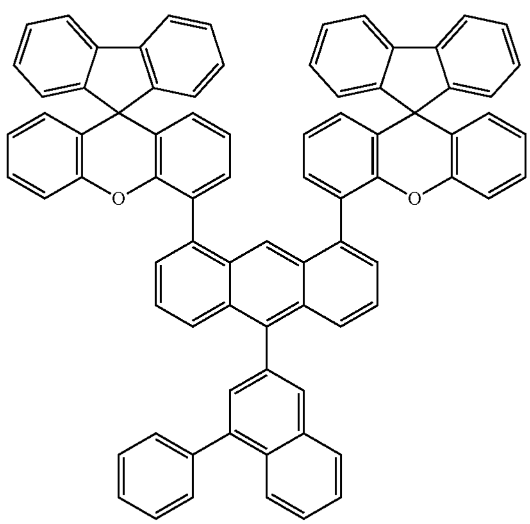
-continued
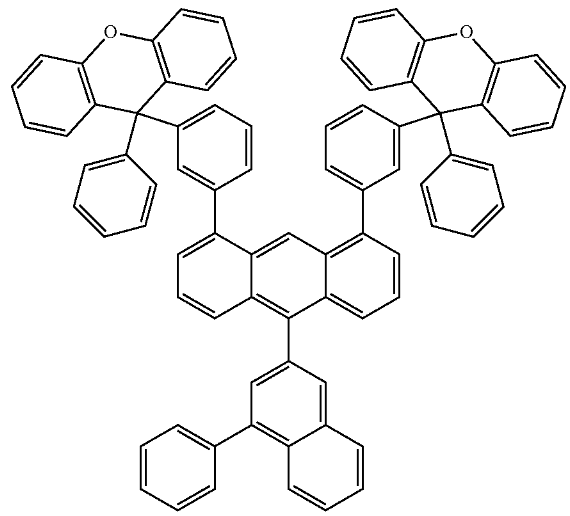
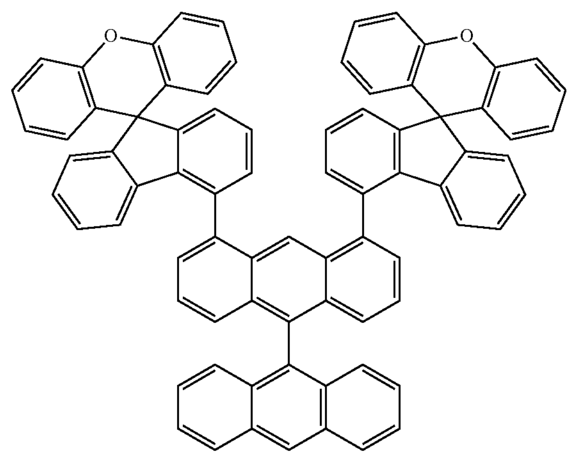
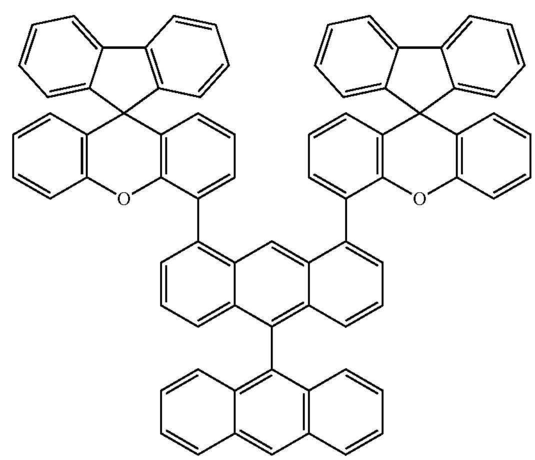

-continued
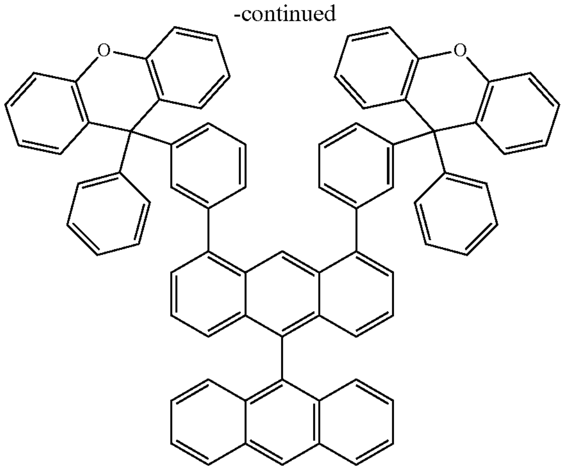
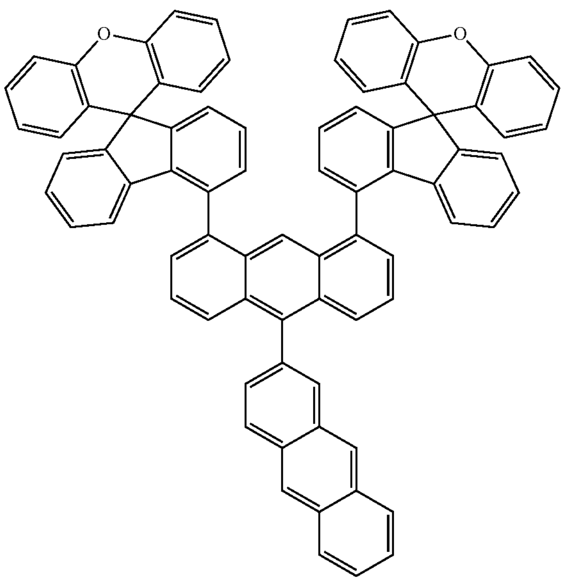
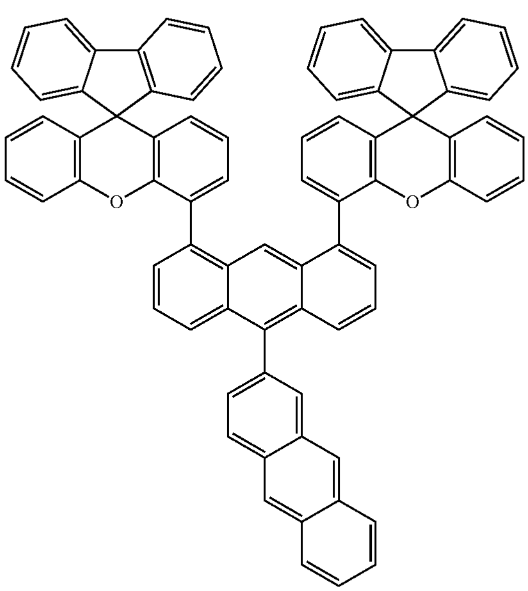
-continued
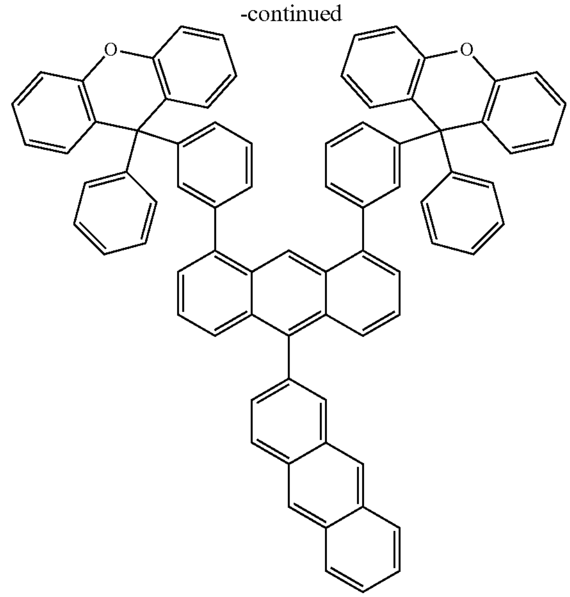
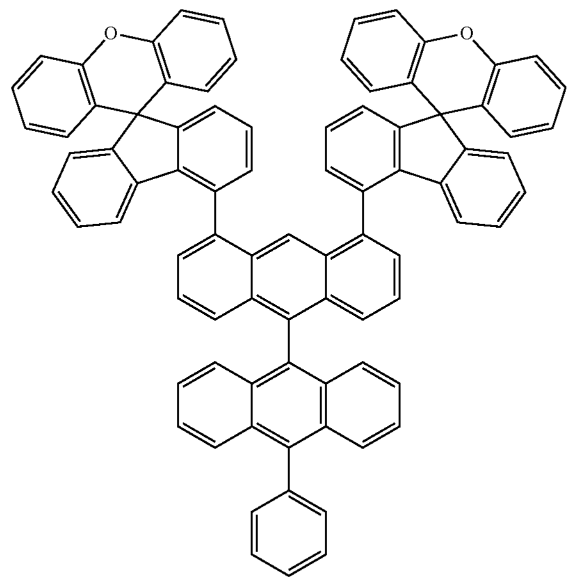
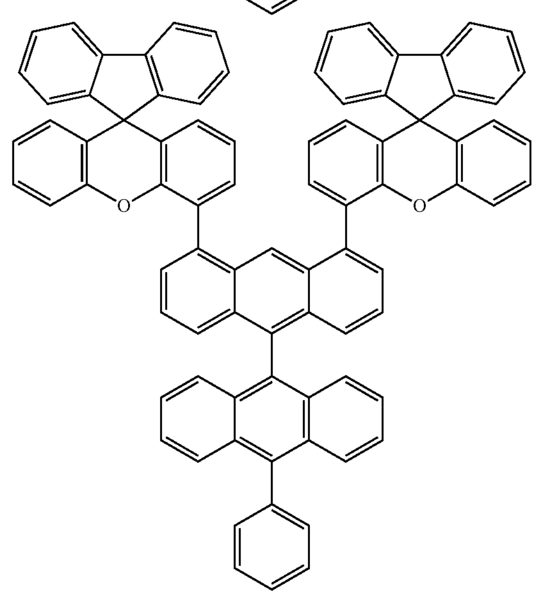

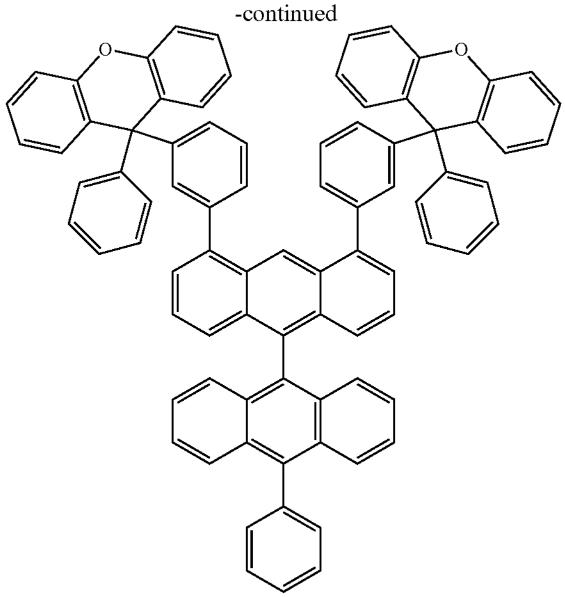
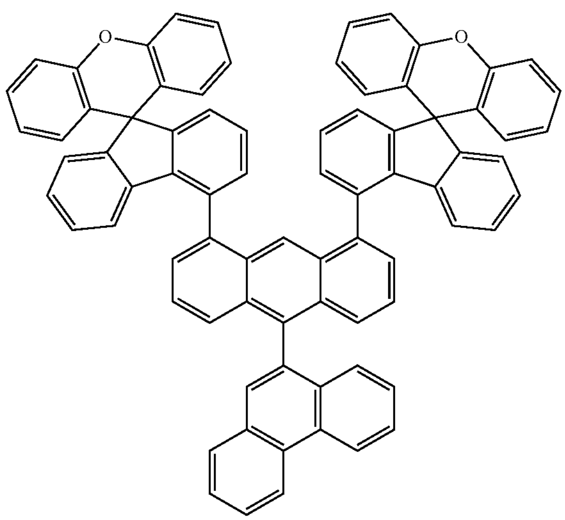
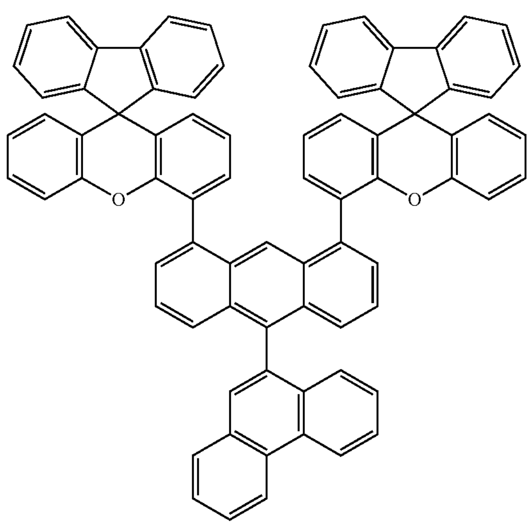
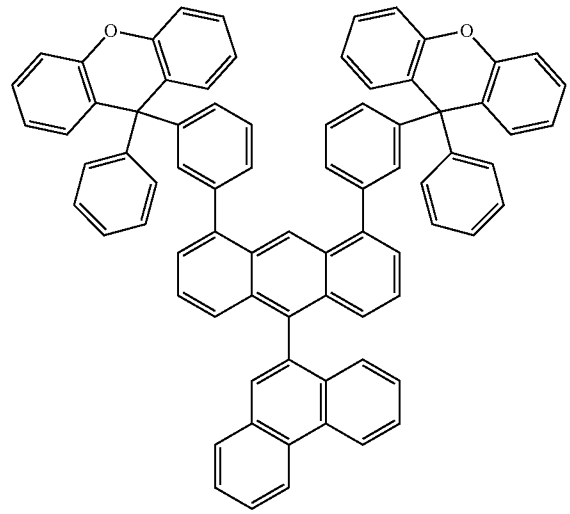
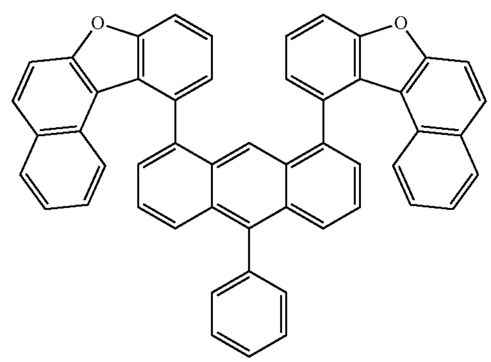
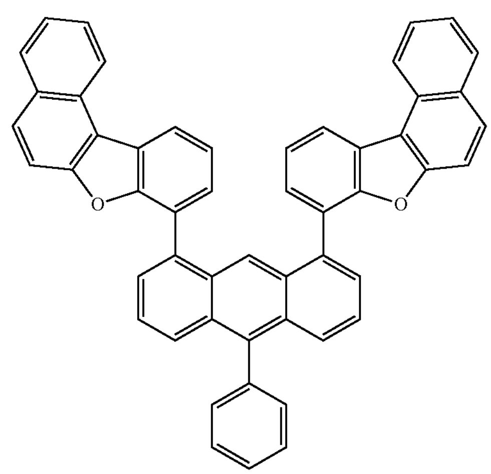

-continued
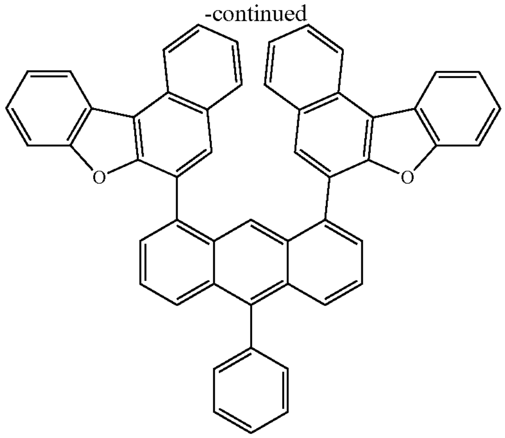
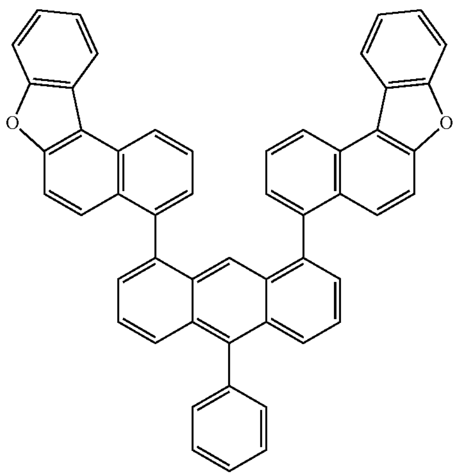
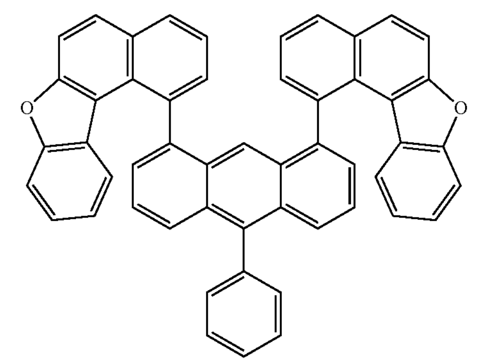
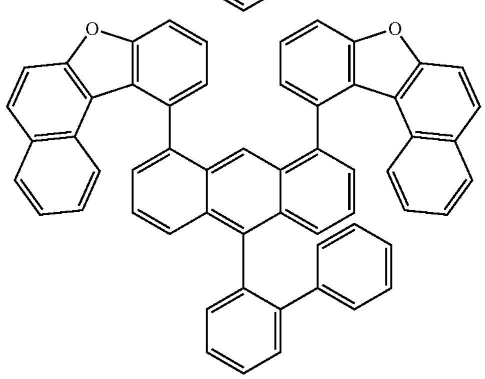
-continued
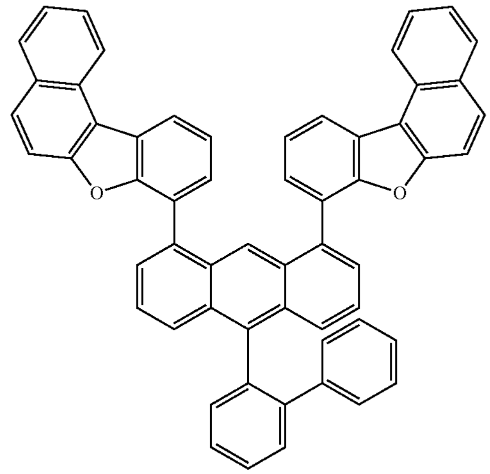
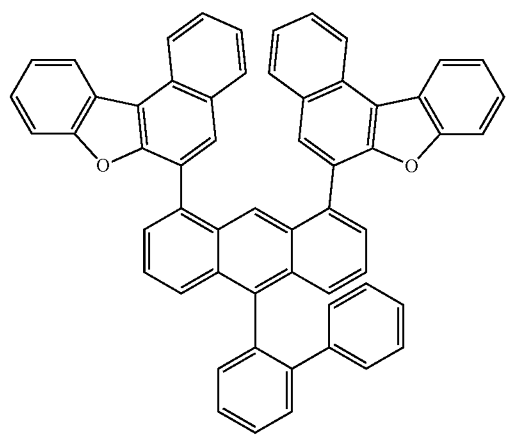
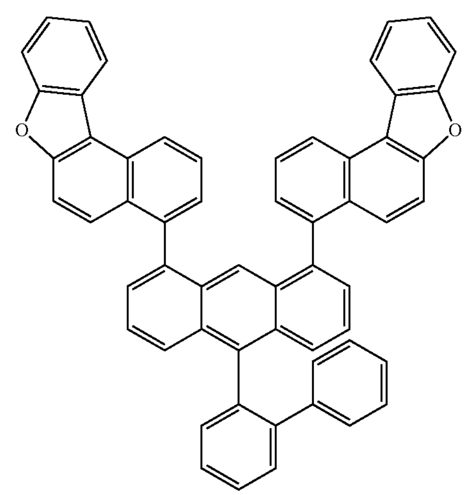

-continued
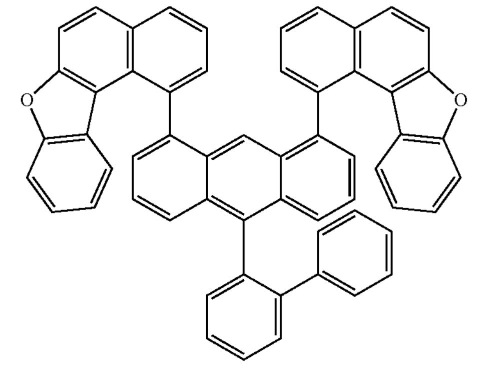
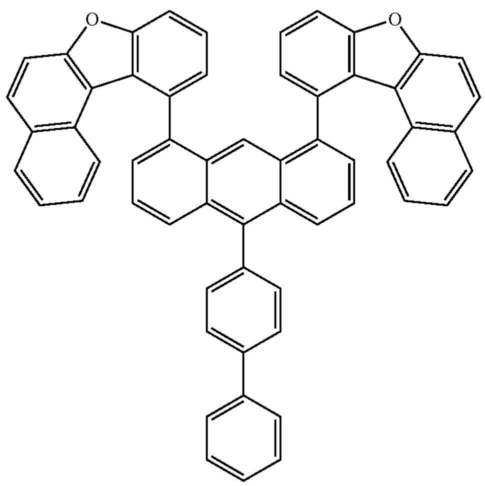
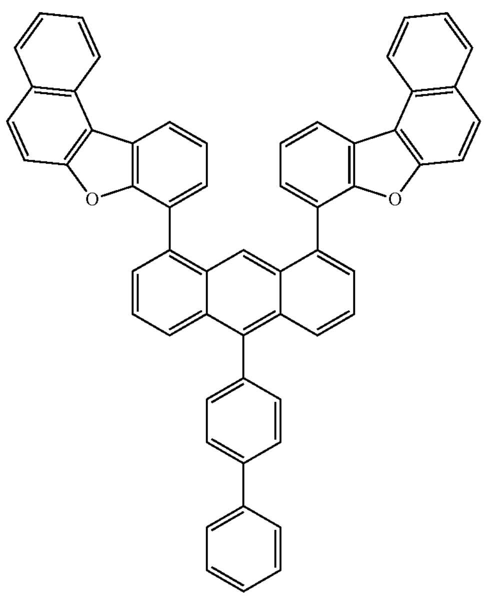
-continued
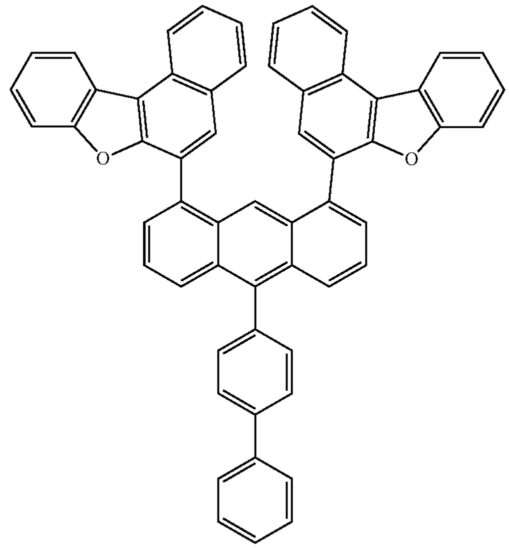
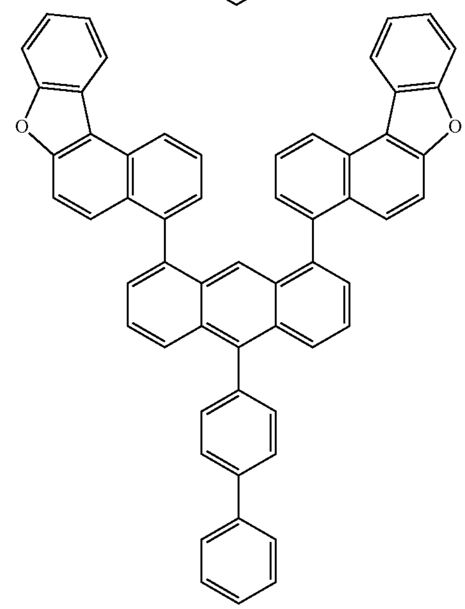
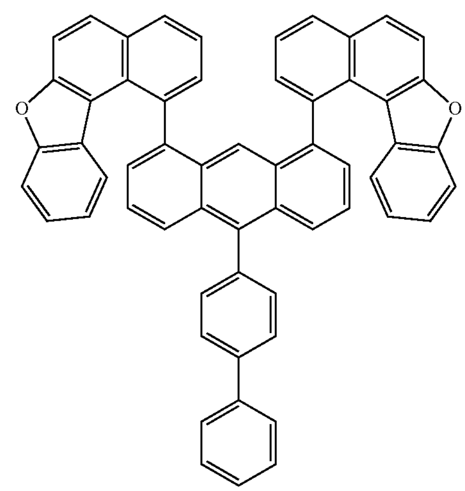

-continued
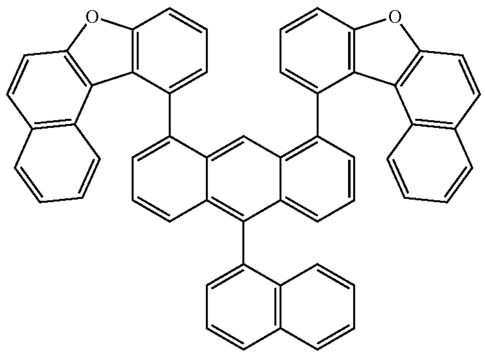
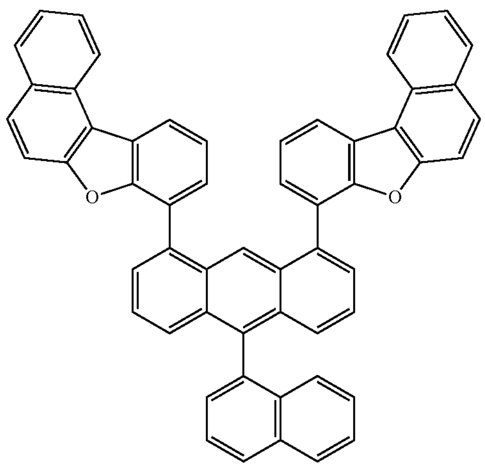
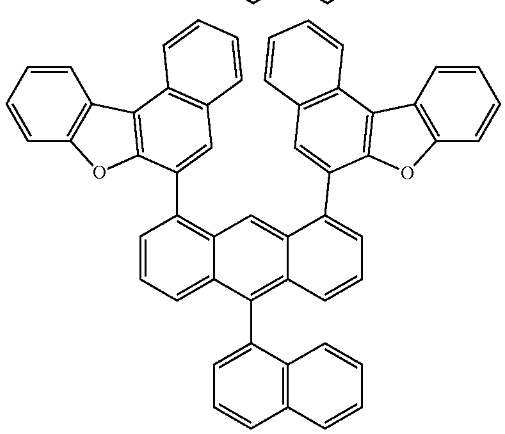
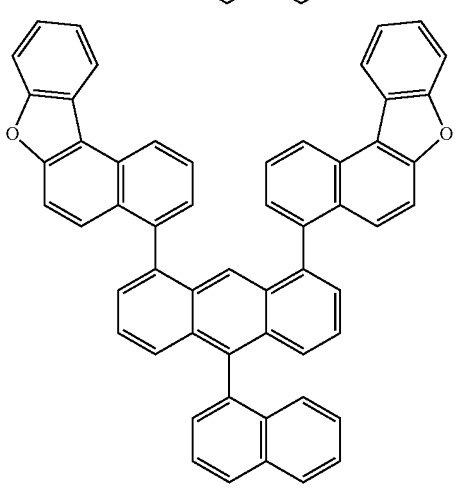
-continued
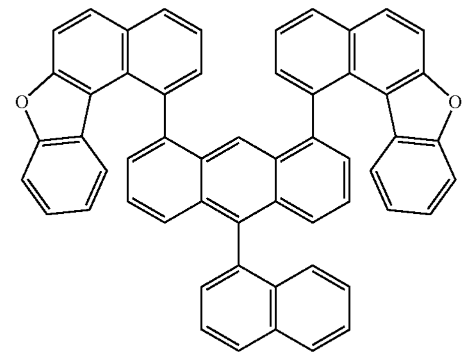
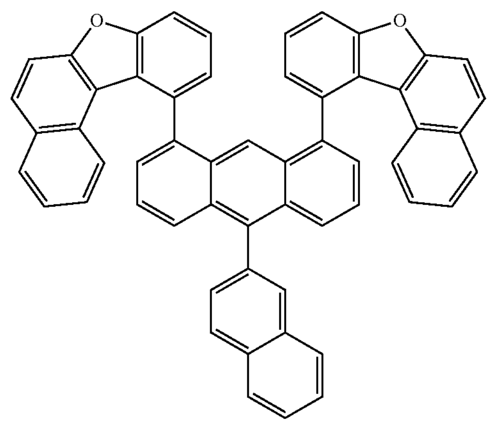
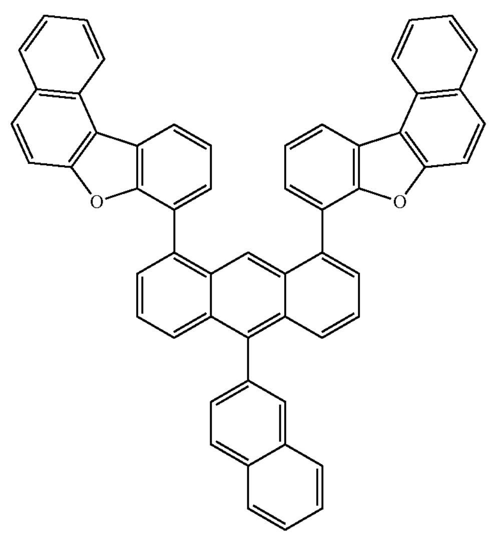

-continued
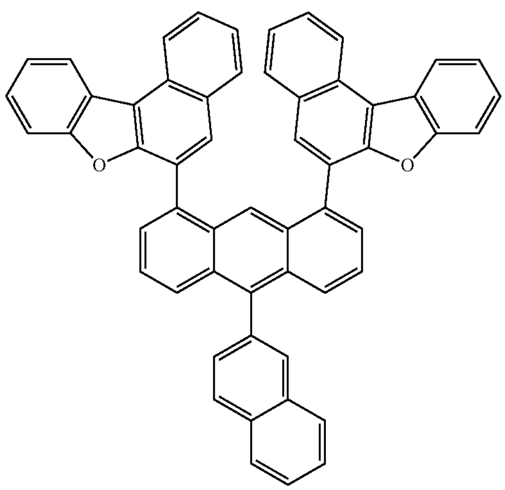
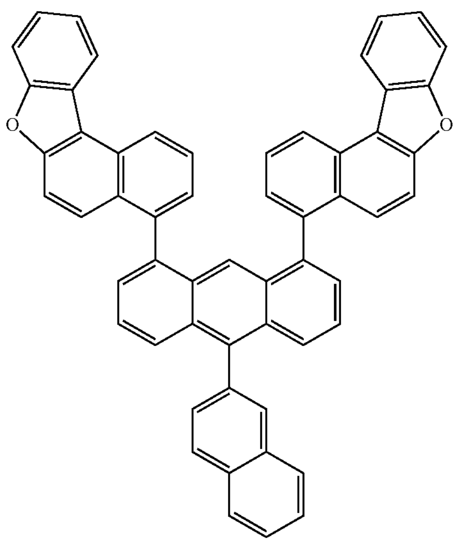
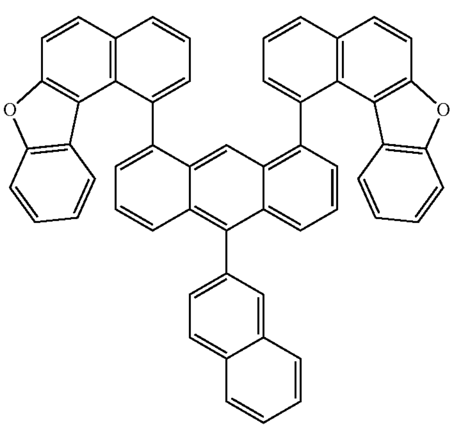
-continued
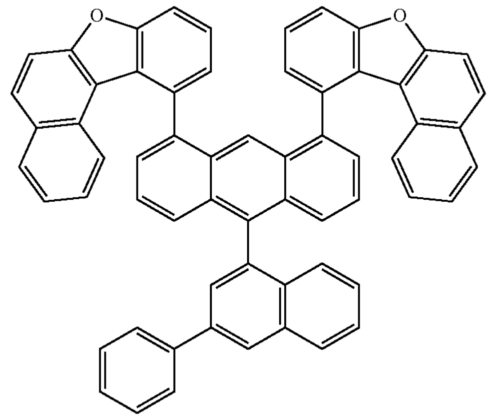
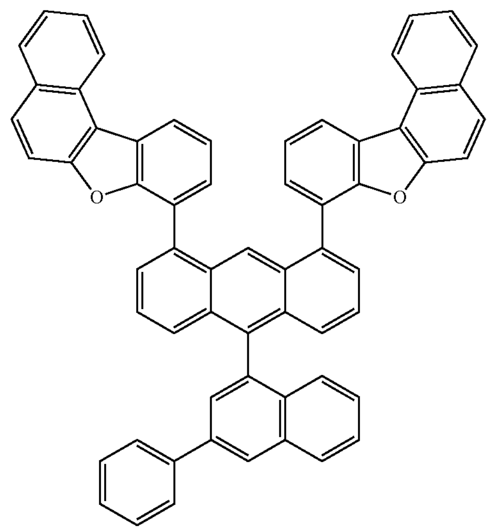
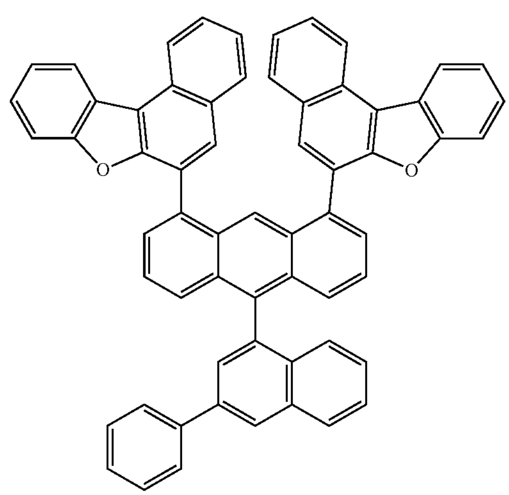

-continued
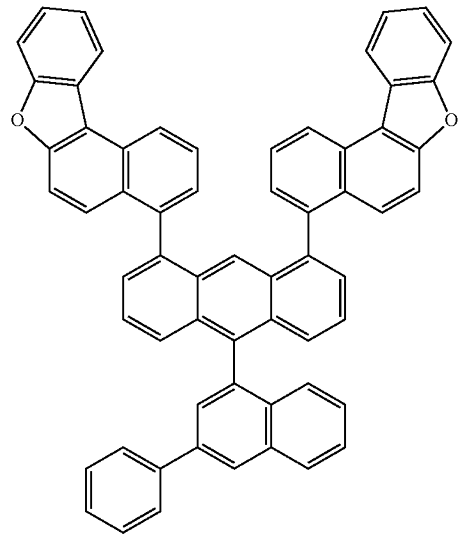
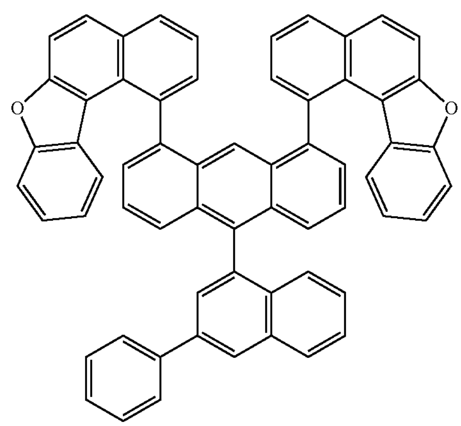
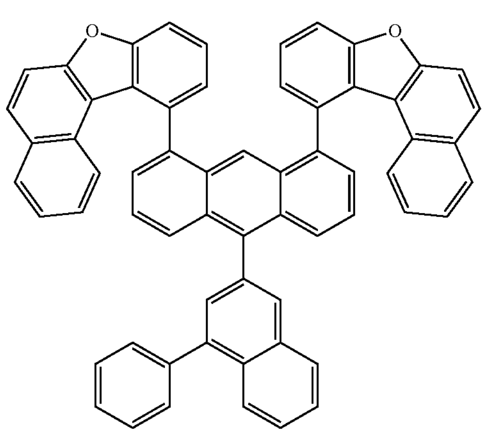
-continued
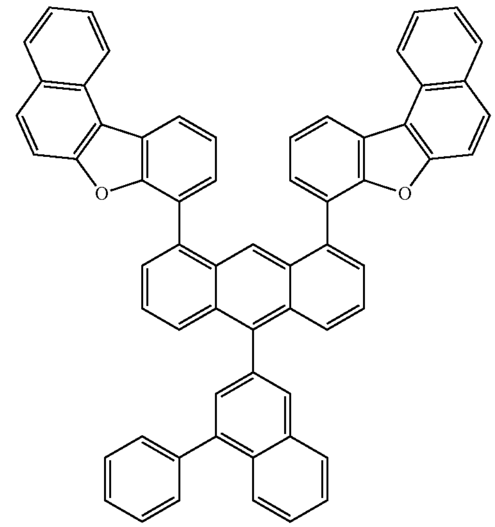
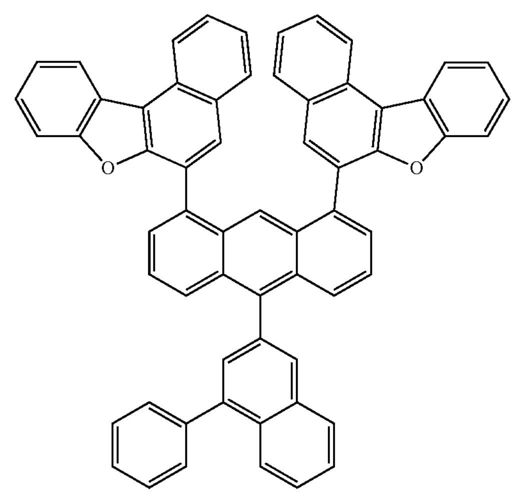
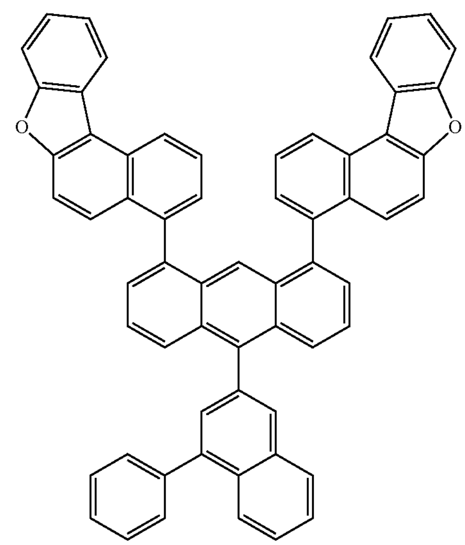

-continued
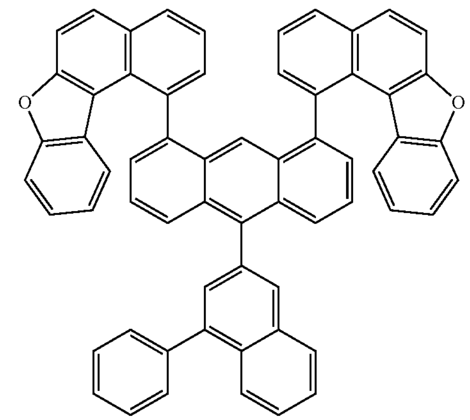
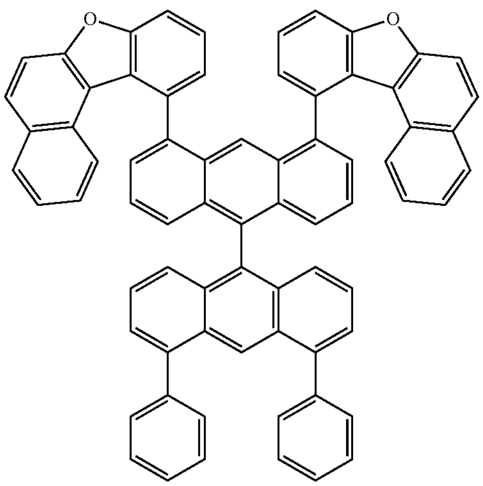
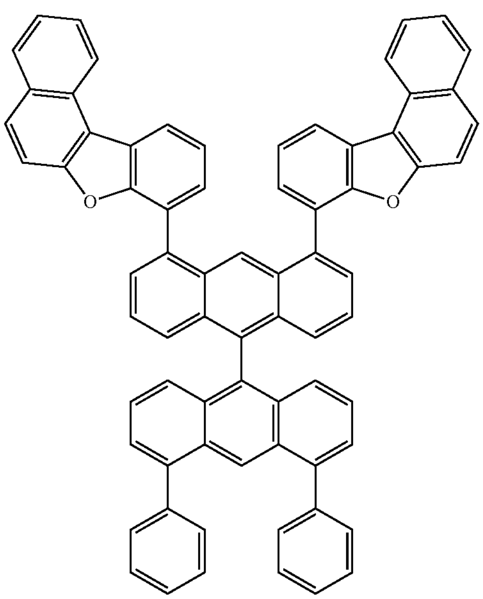
-continued
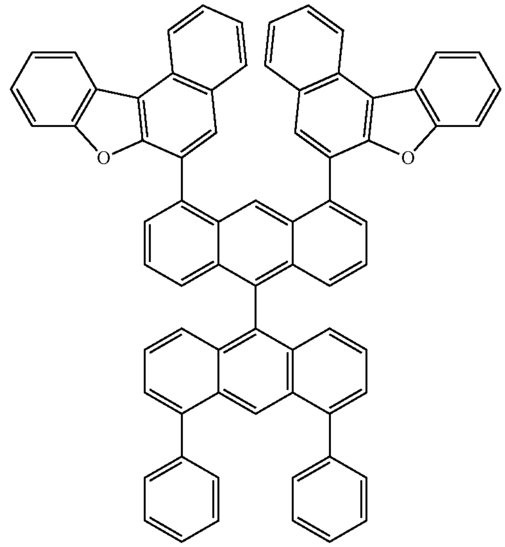
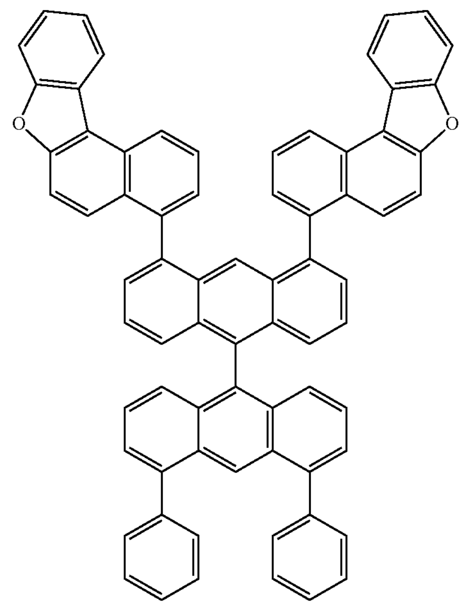
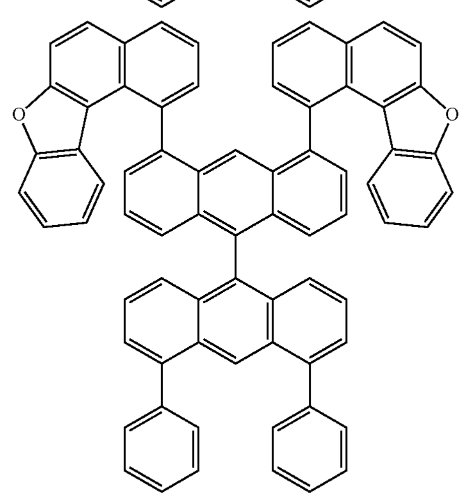

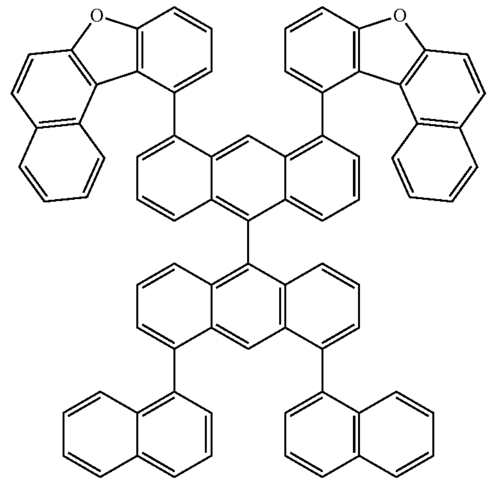
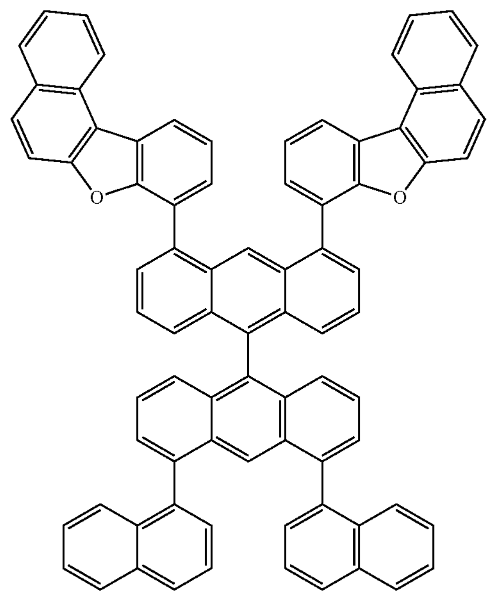
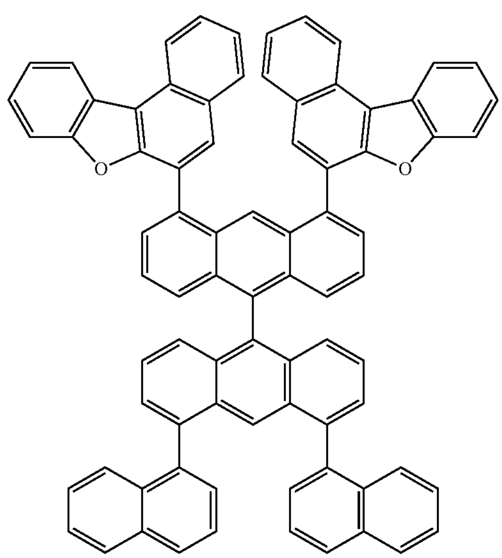
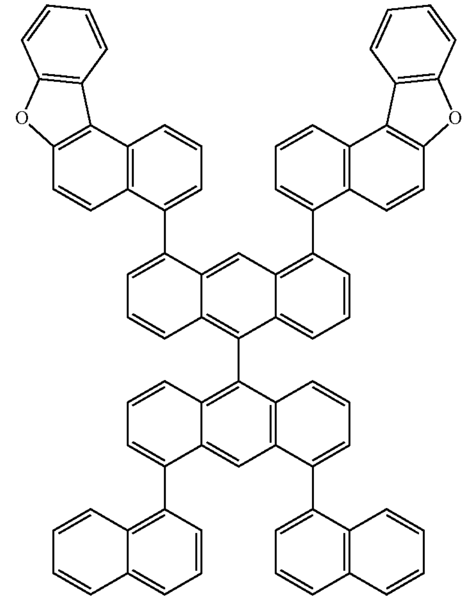
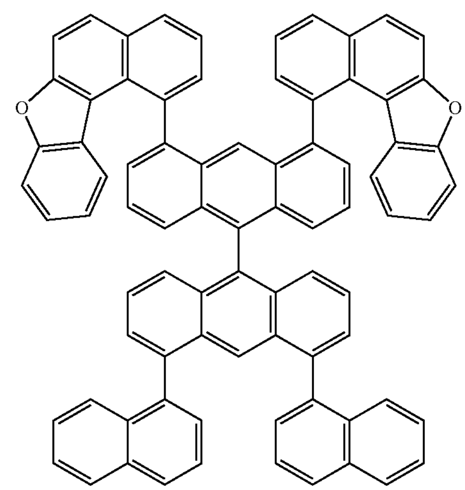
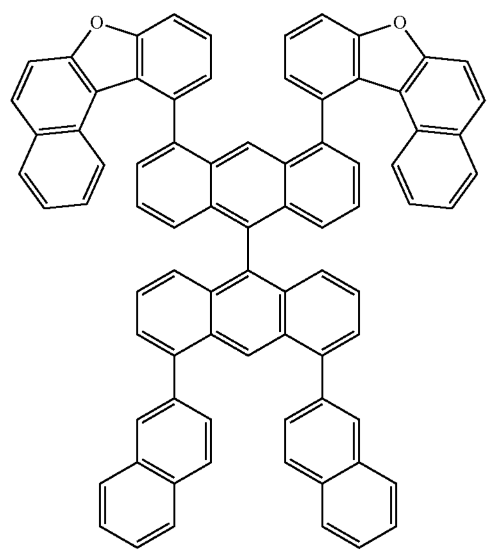

-continued
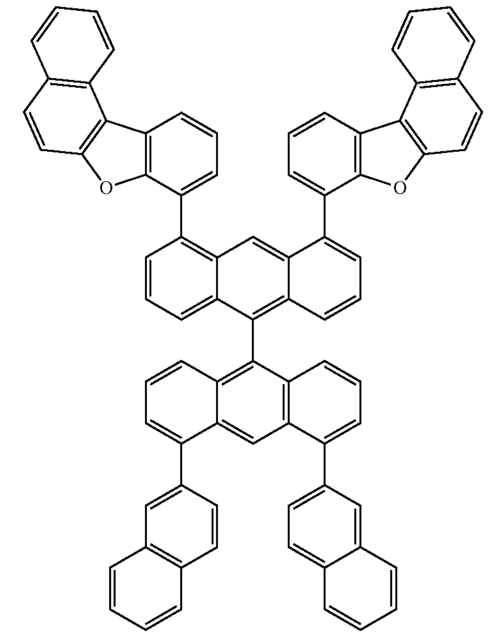
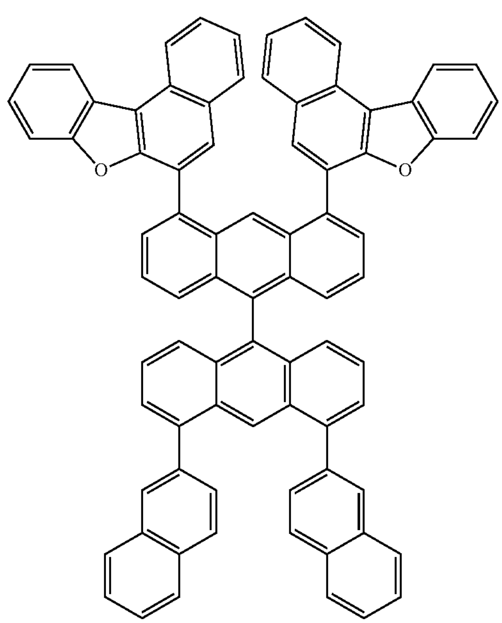
-continued
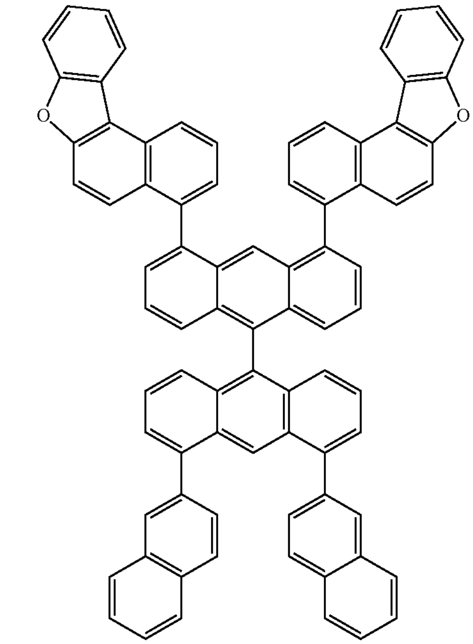
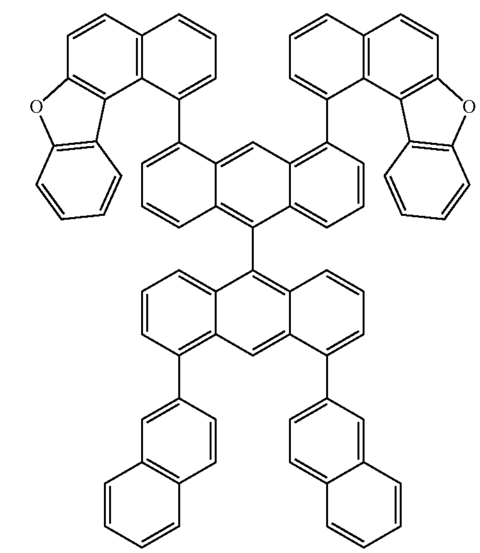
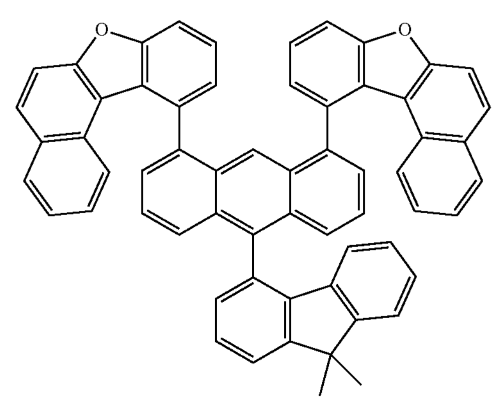

-continued
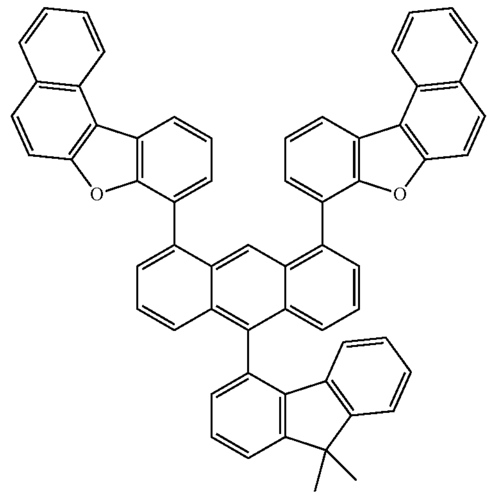
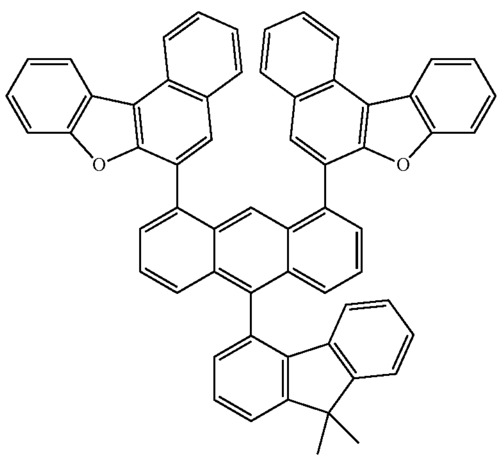
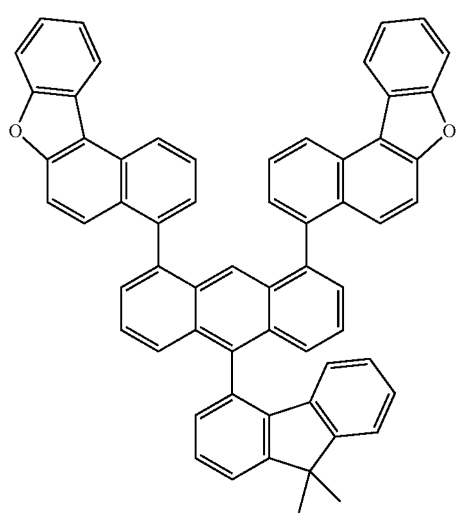
-continued
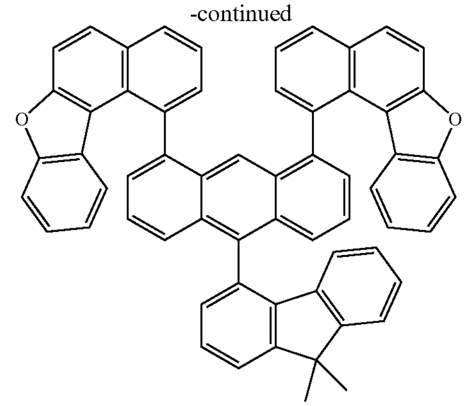
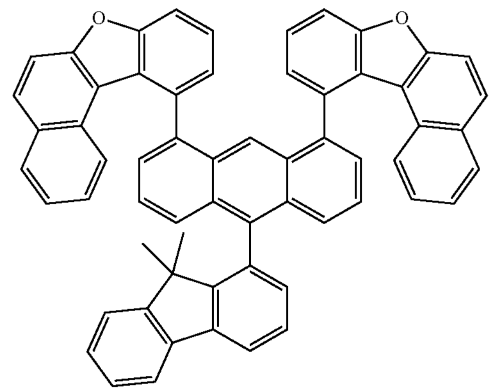
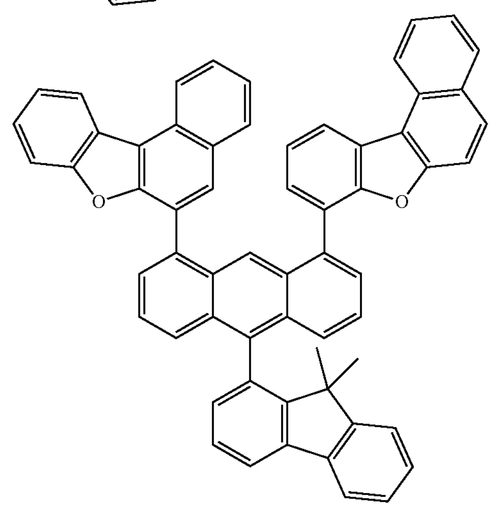
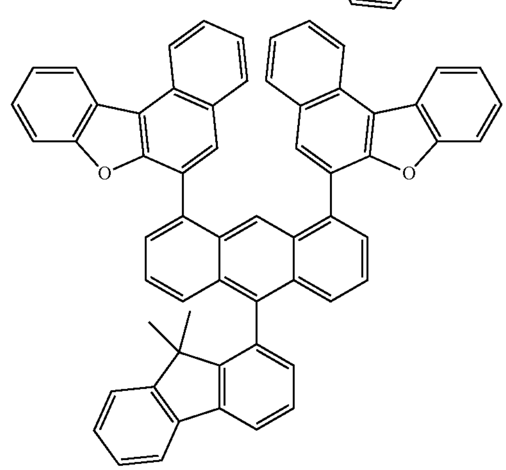

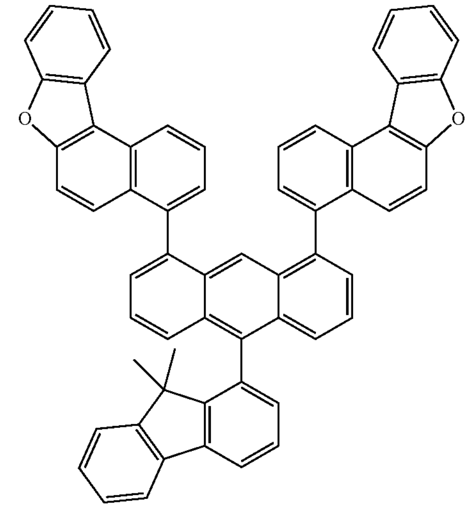
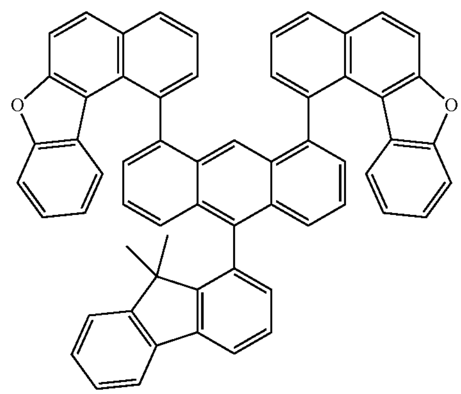
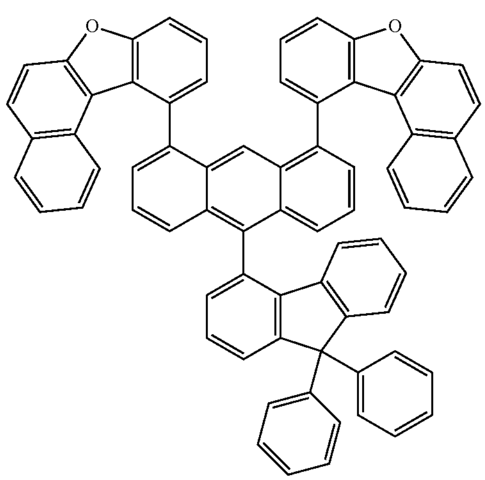
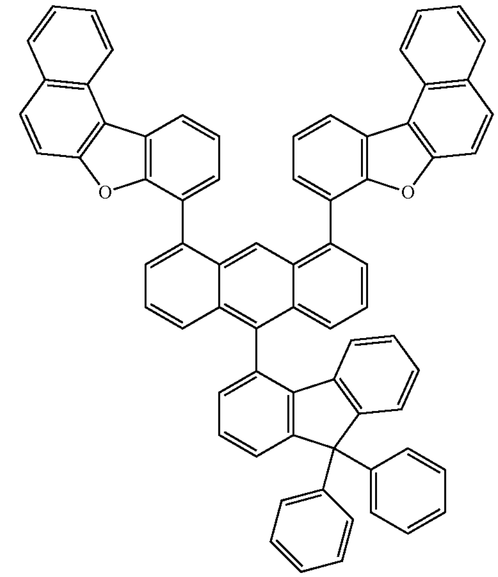
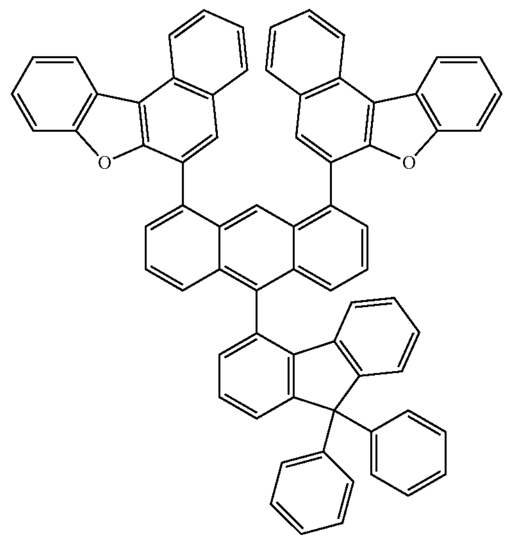
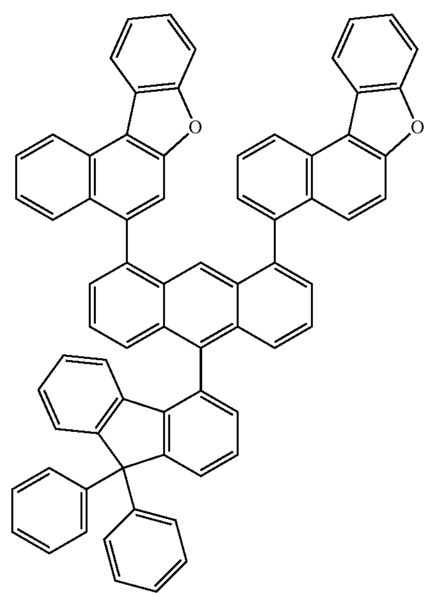

-continued
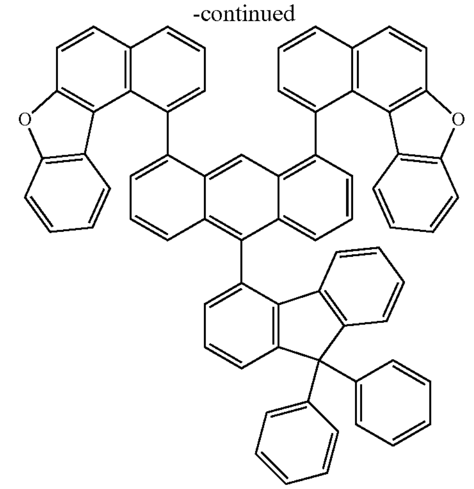
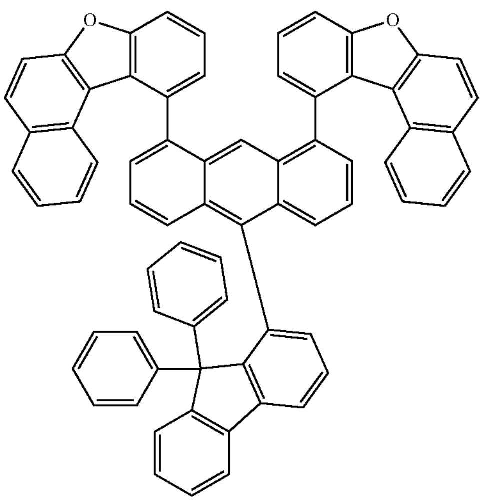
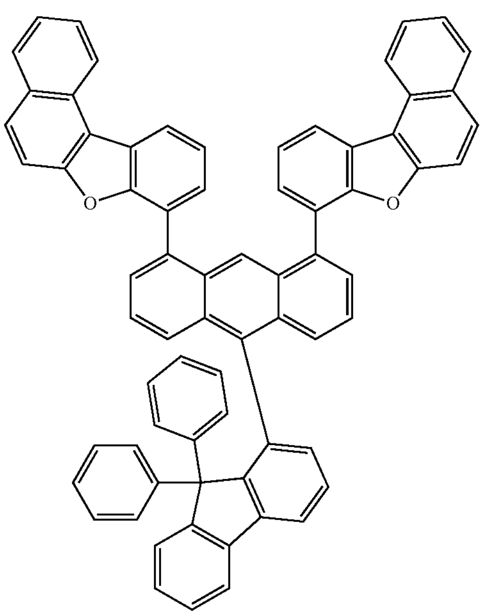
-continued
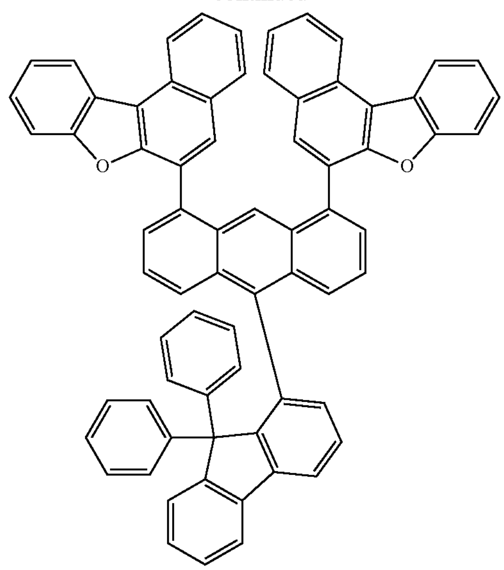
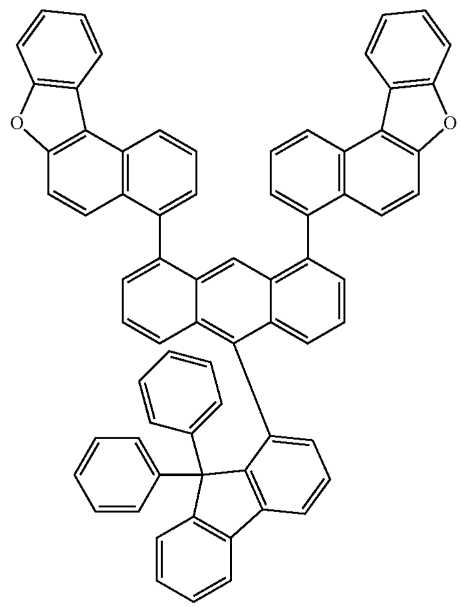
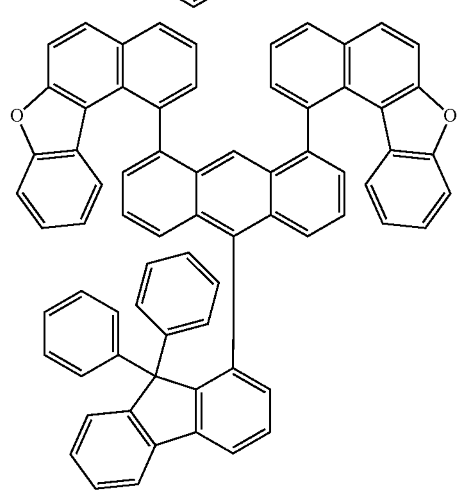

-continued
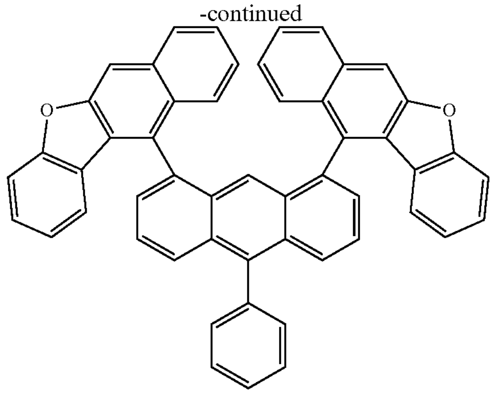
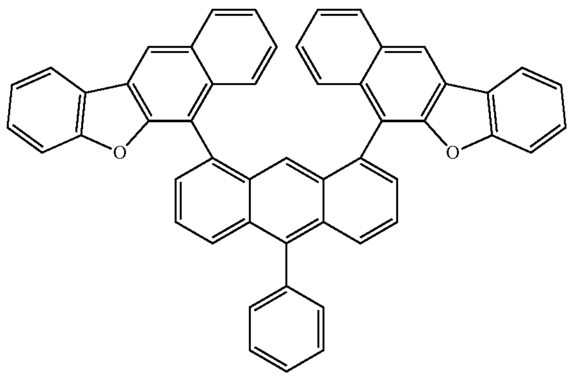
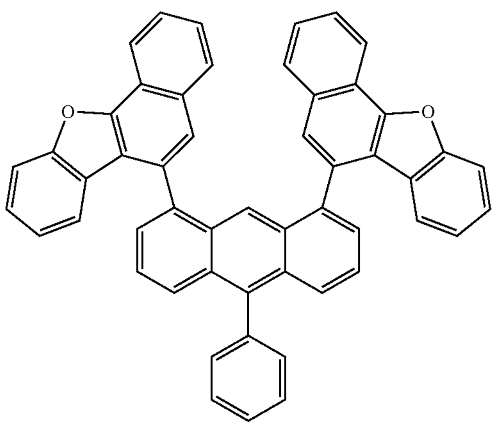
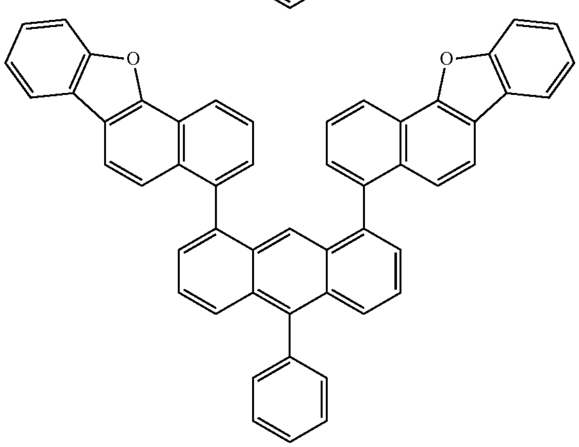
-continued
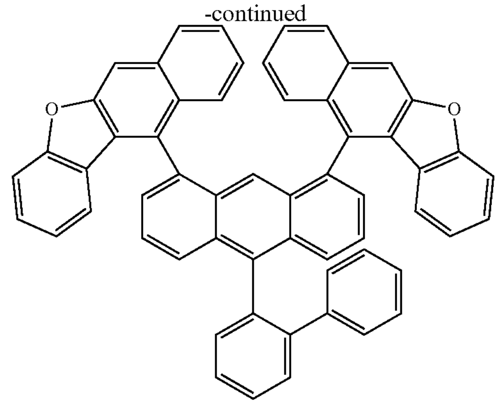
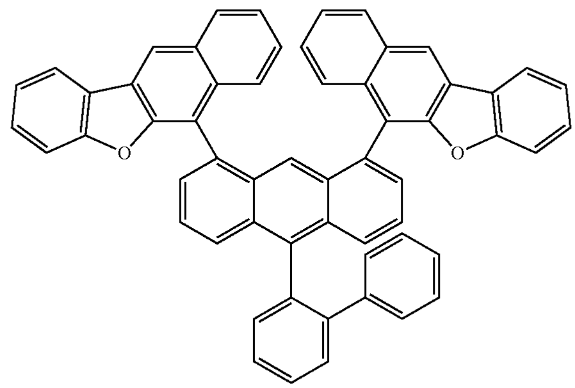
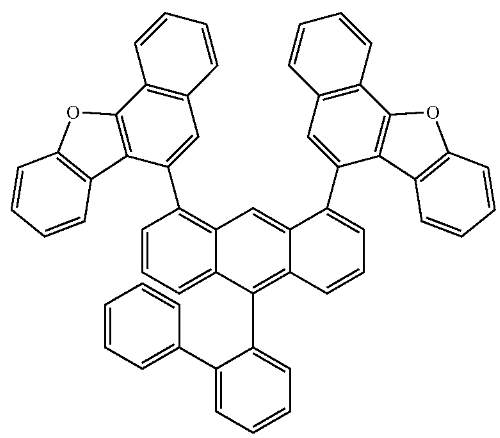
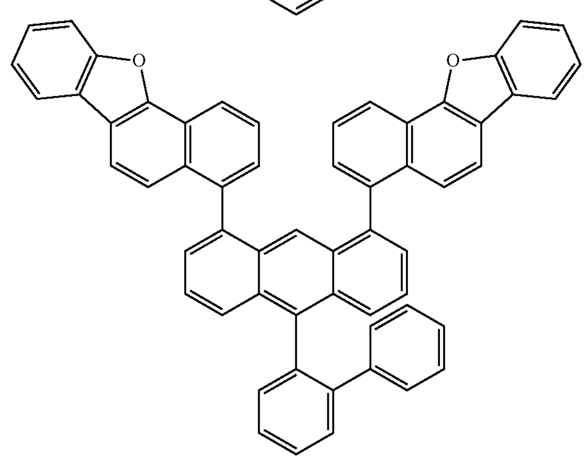

-continued
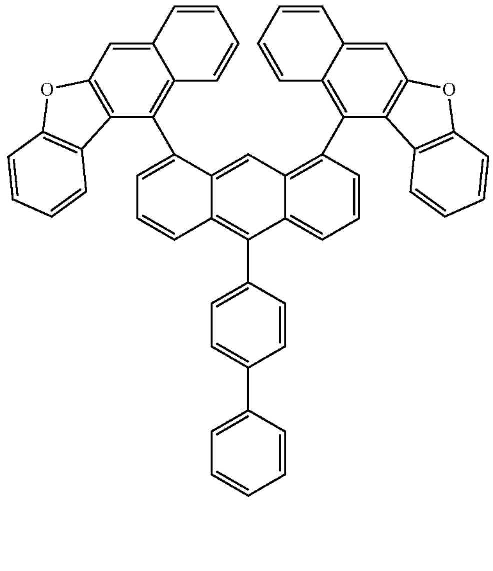
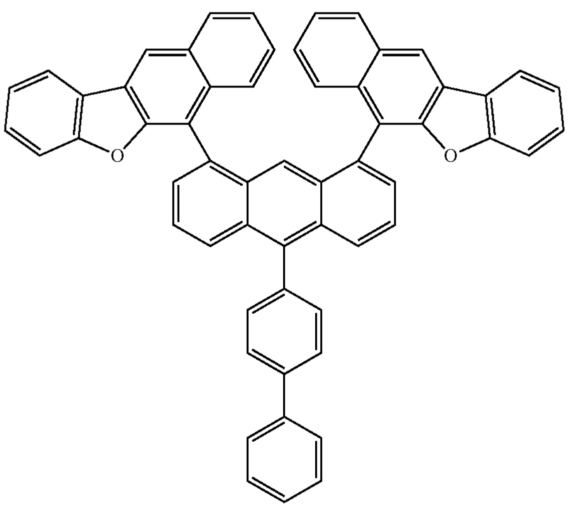
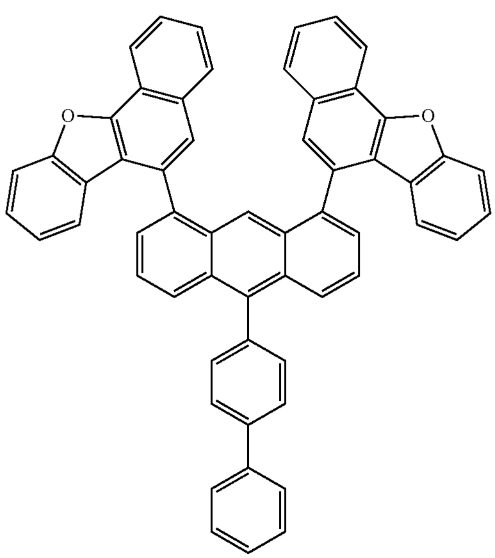
-continued
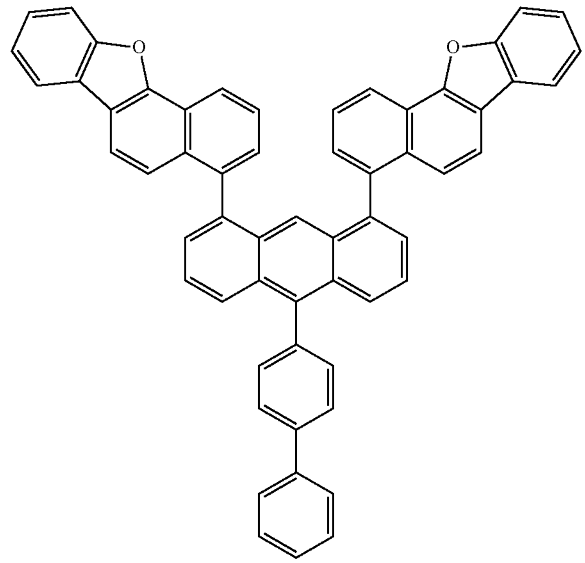
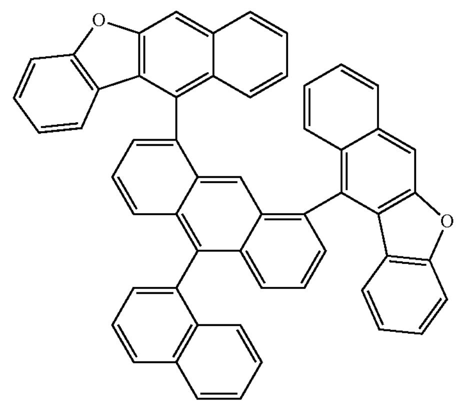
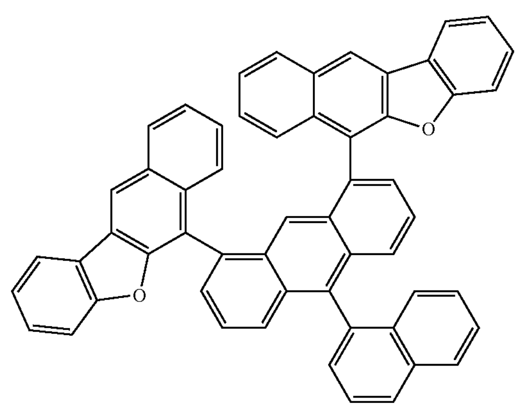

-continued
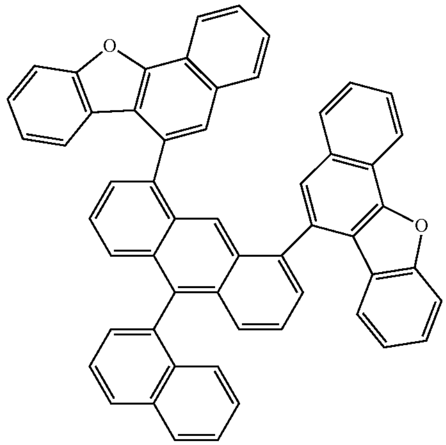
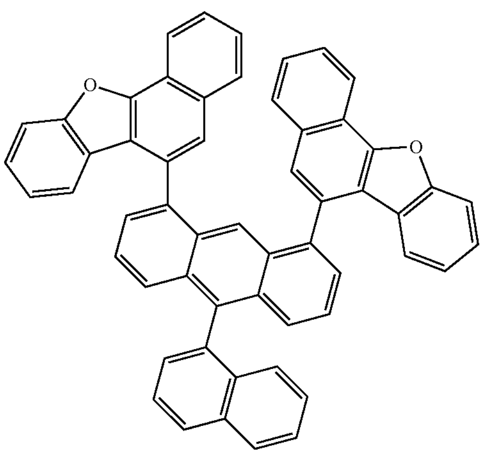
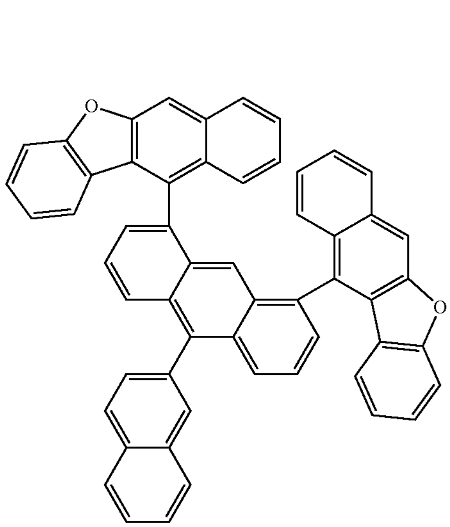
-continued
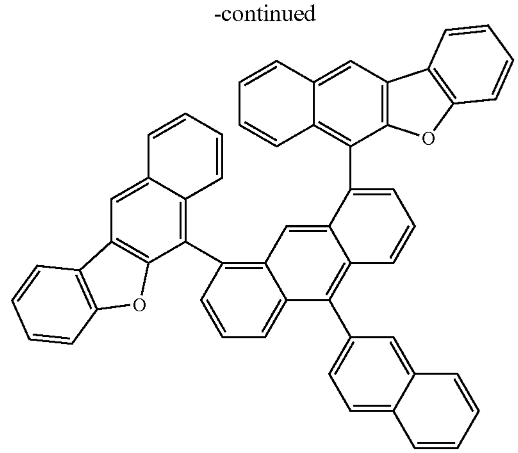
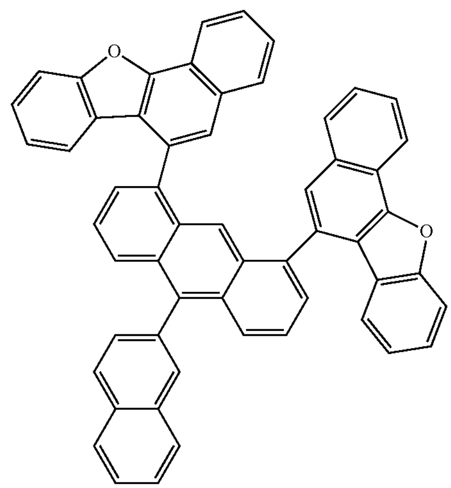
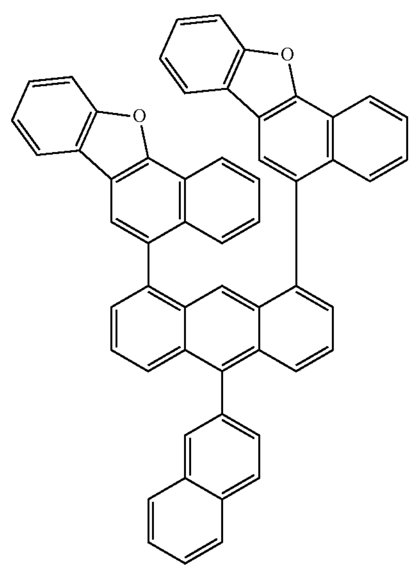

-continued
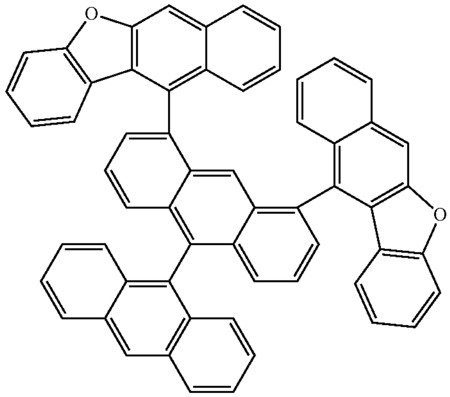
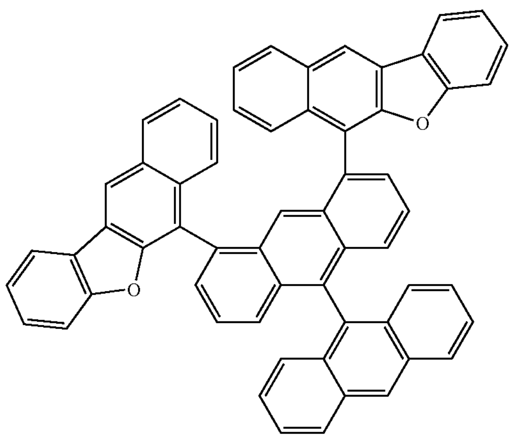
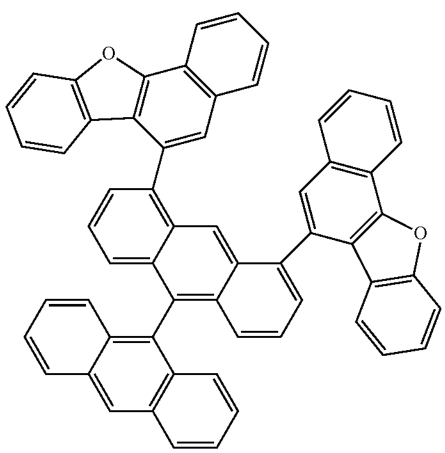
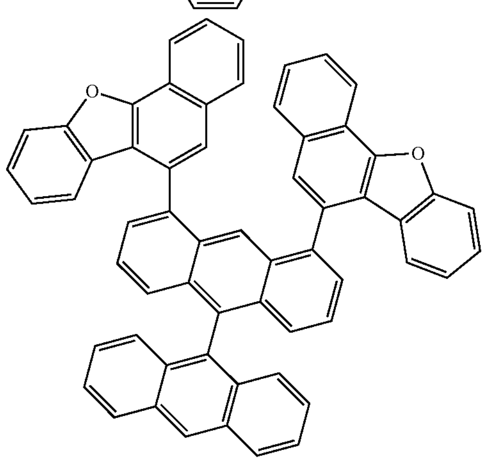
-continued
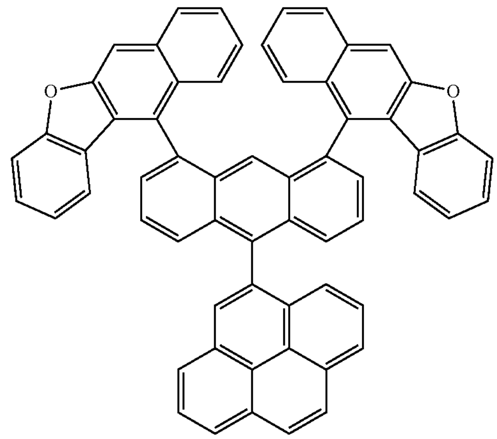
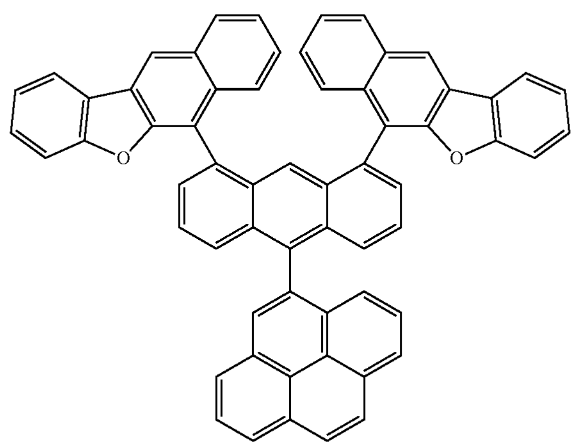
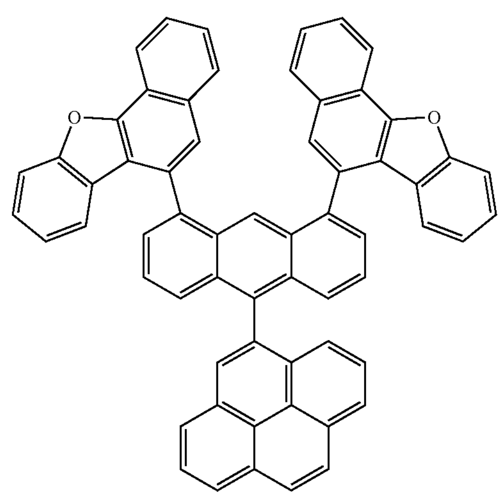

-continued
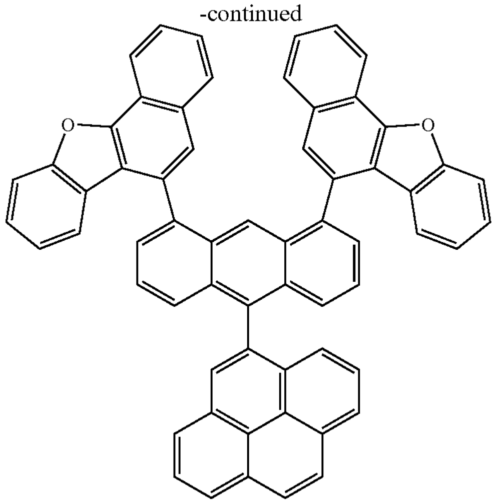
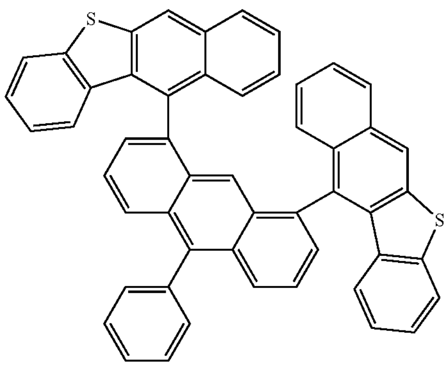
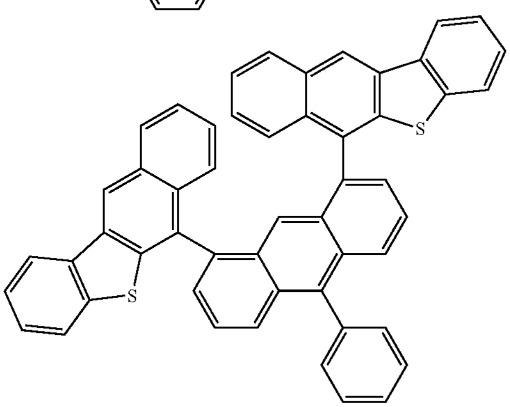
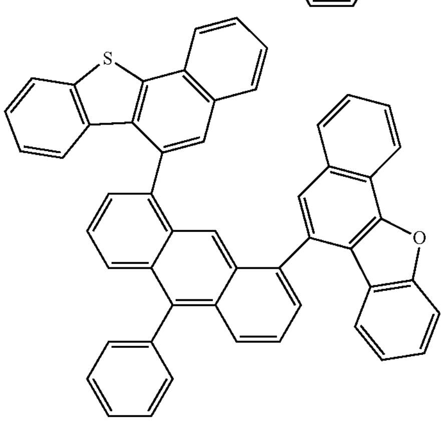
-continued
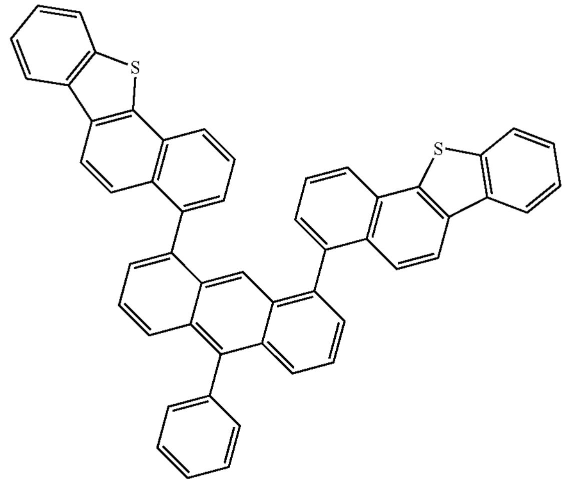
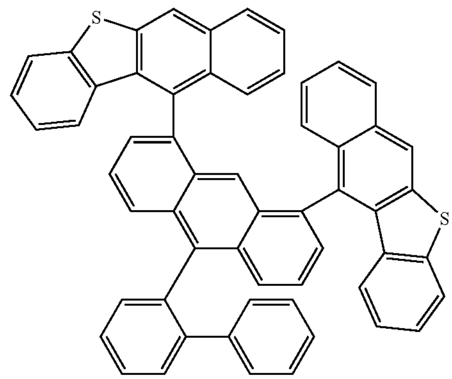
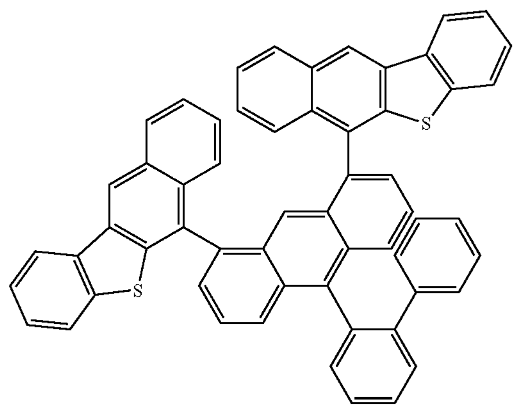
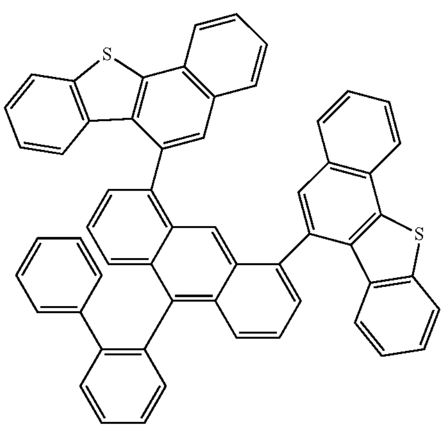

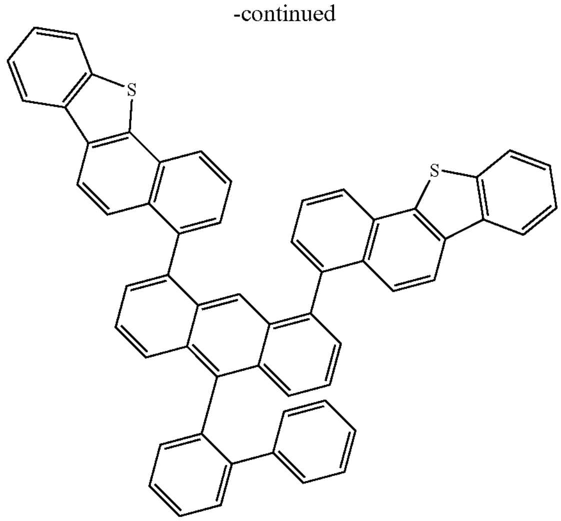
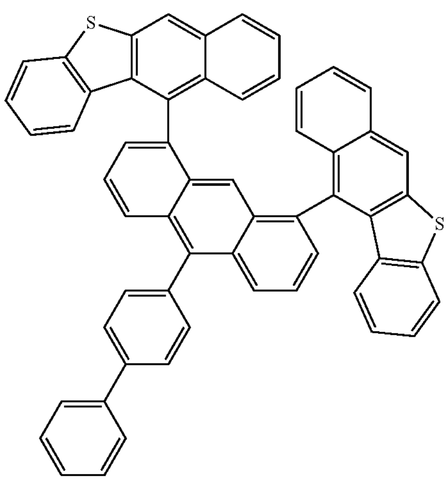
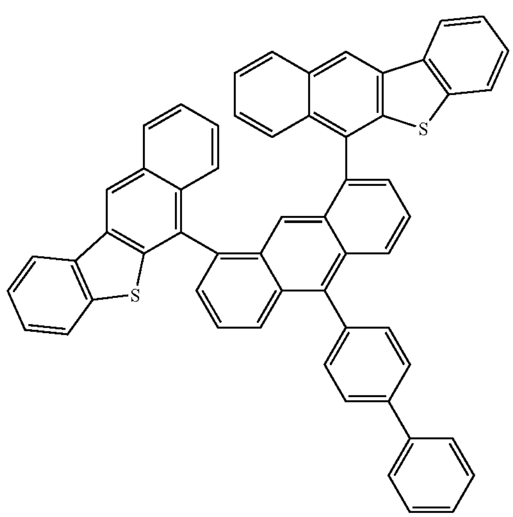
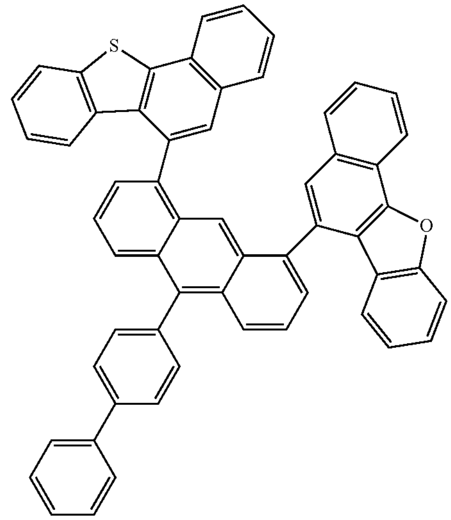
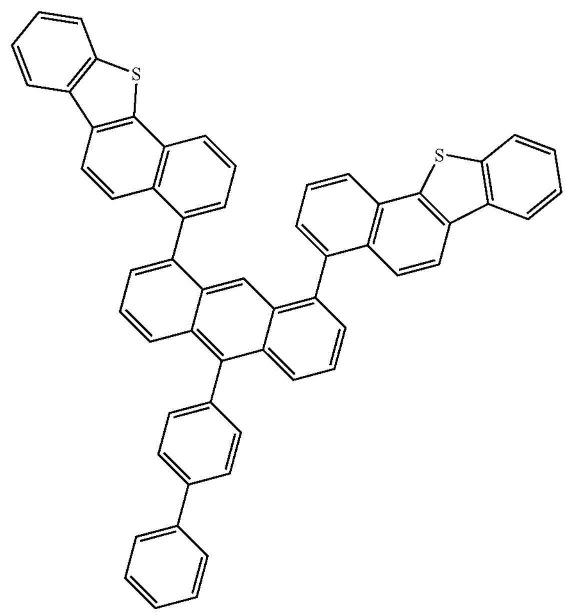
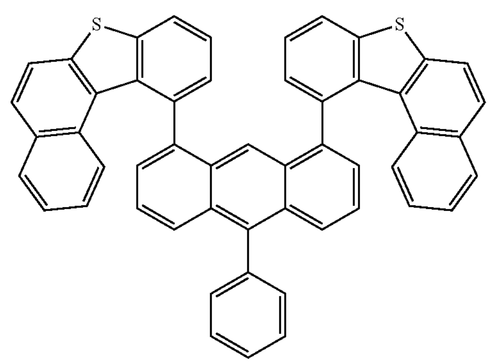

-continued
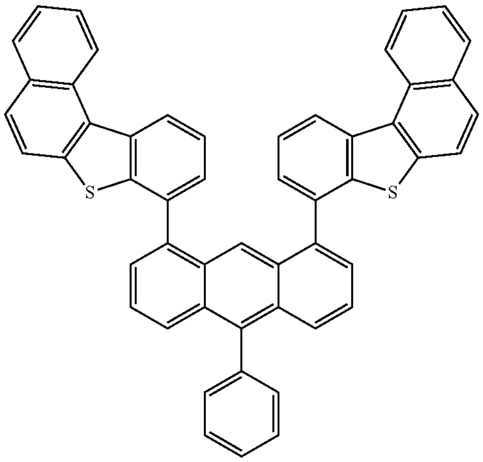
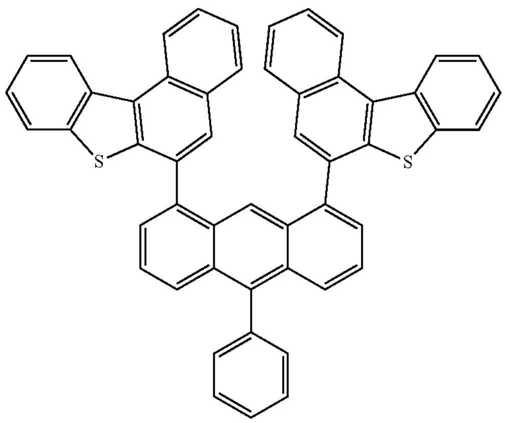
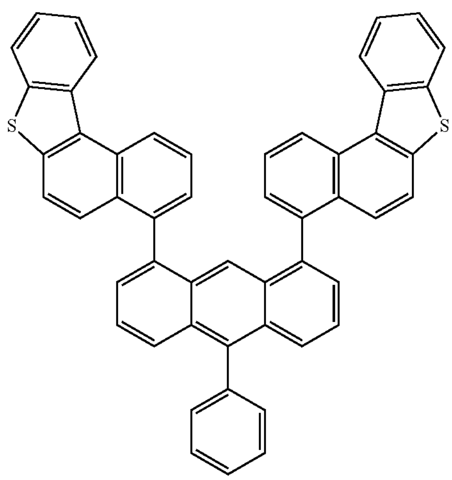
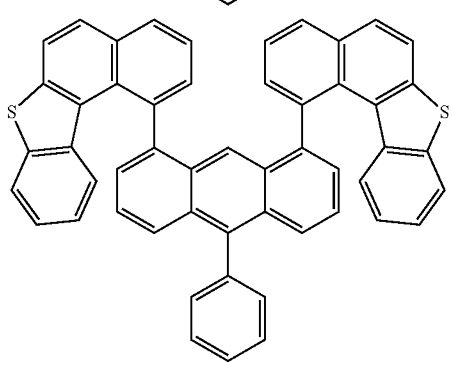
-continued
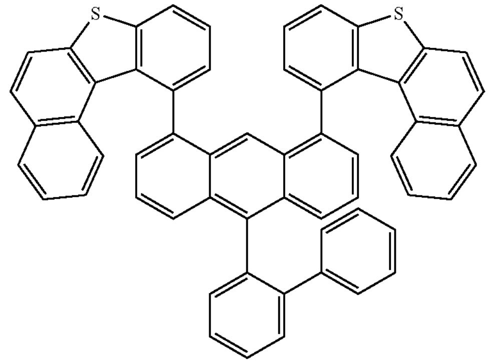
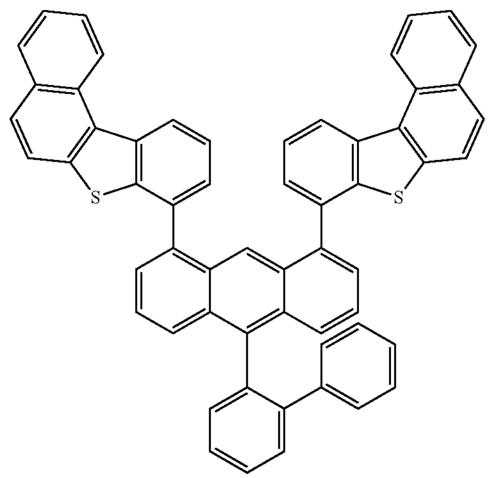
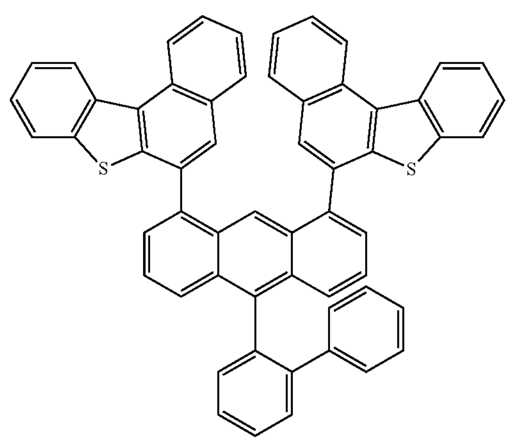

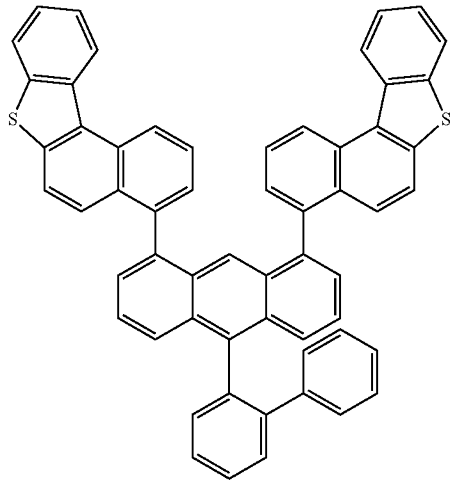
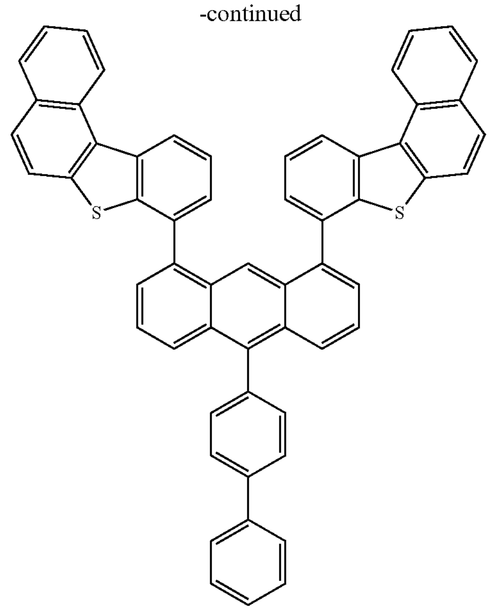
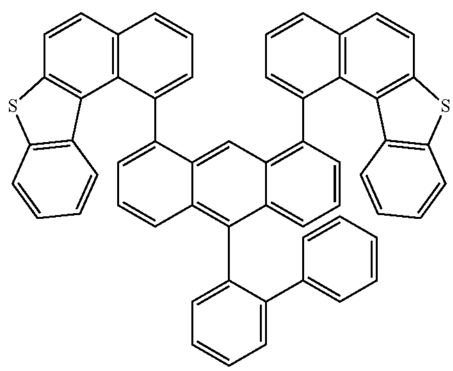
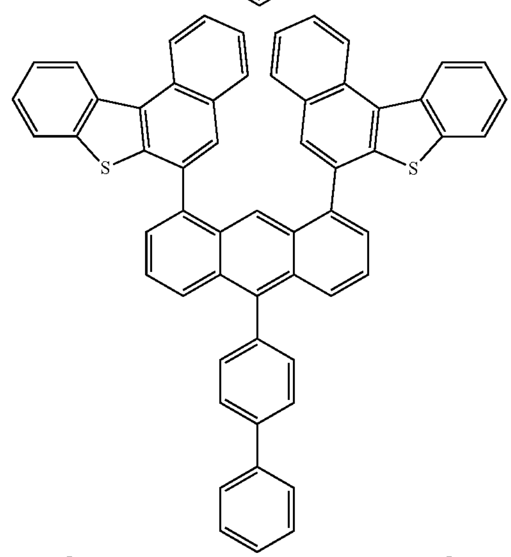
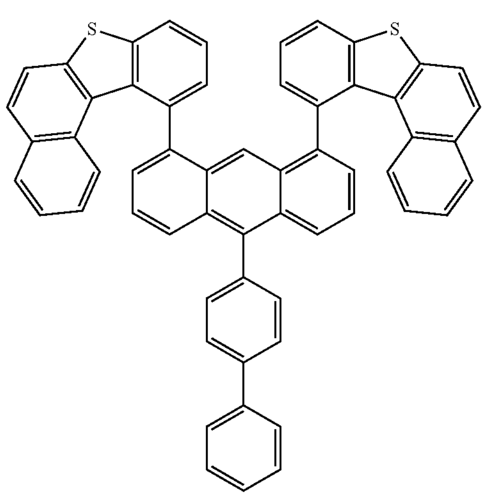
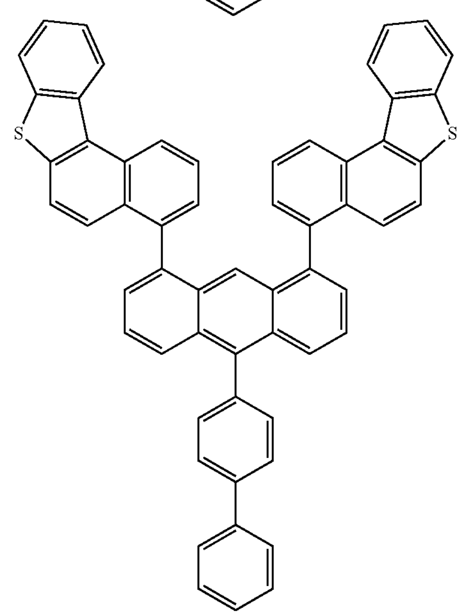
S
S -continued
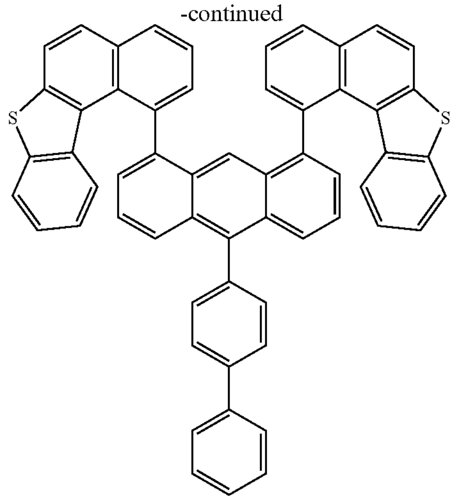
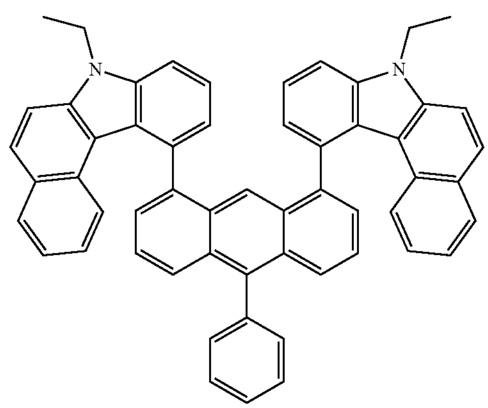
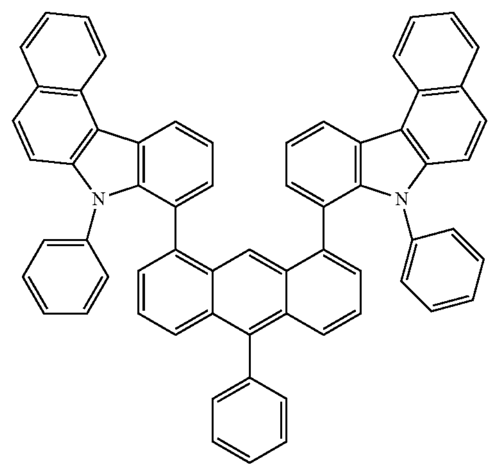
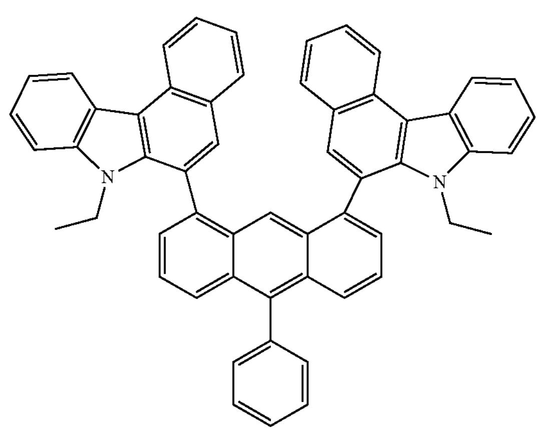

-continued
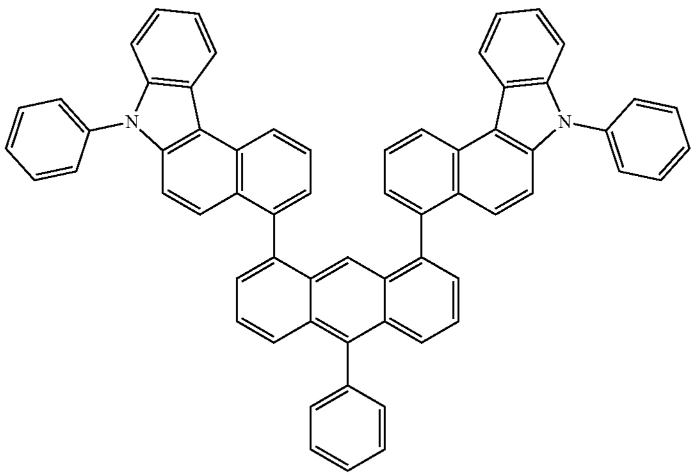
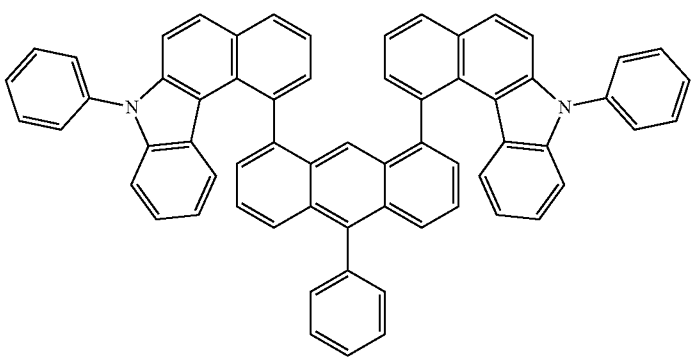
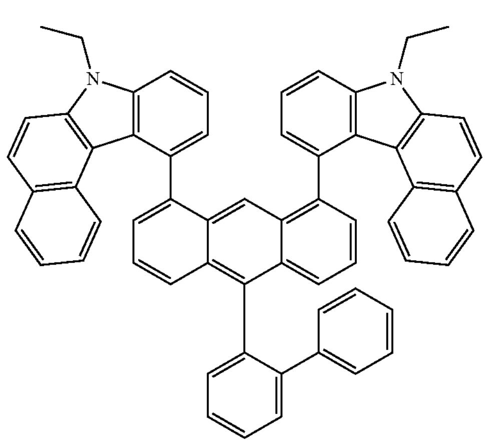
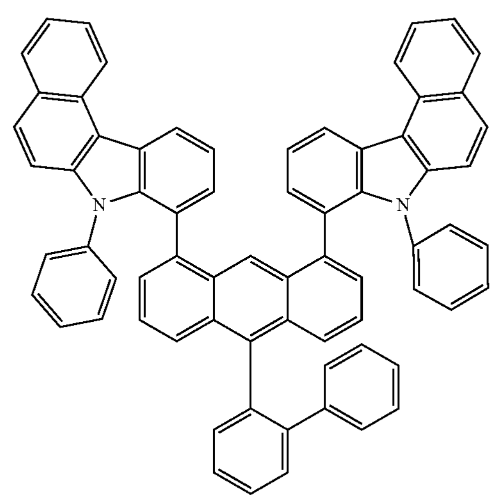

-continued
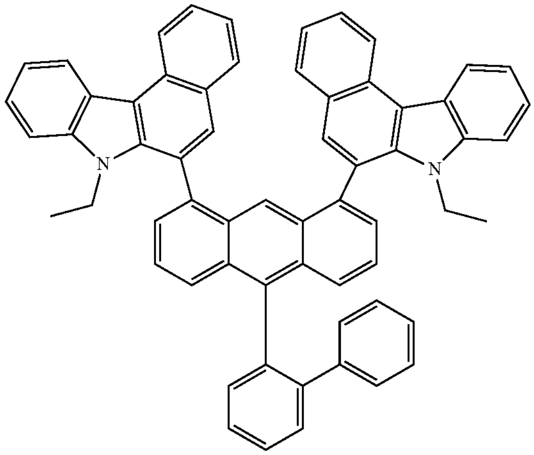
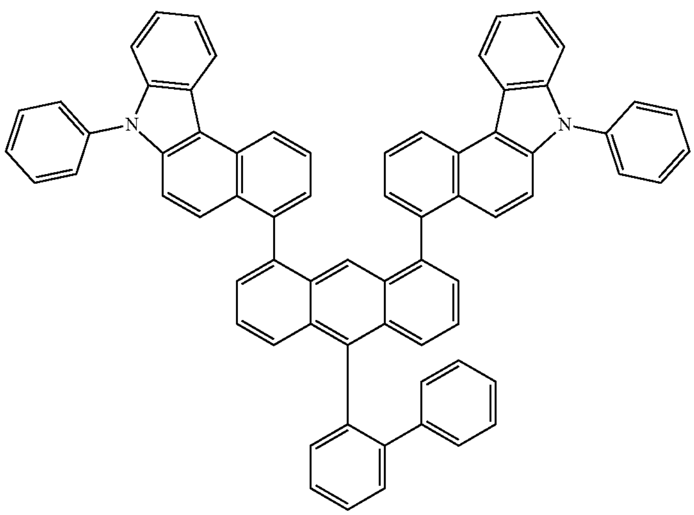
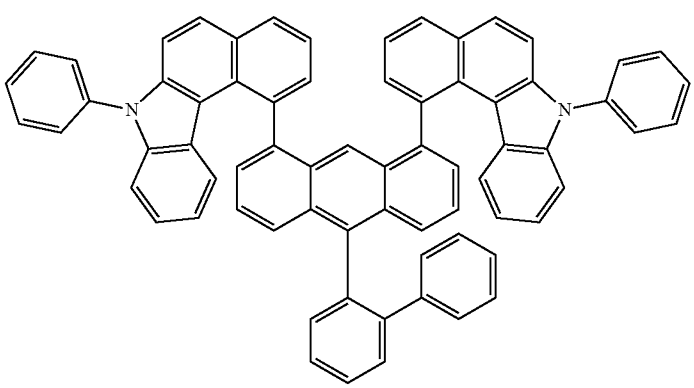

-continued
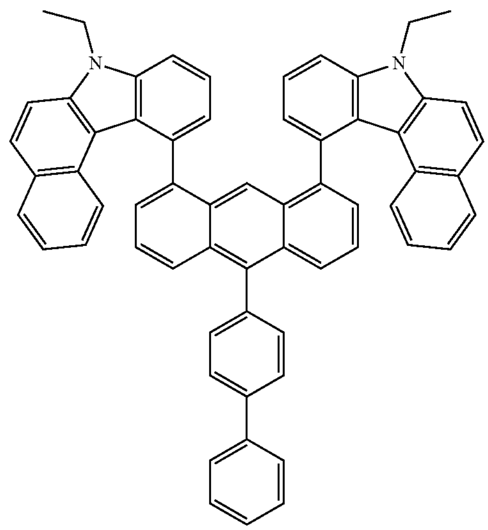
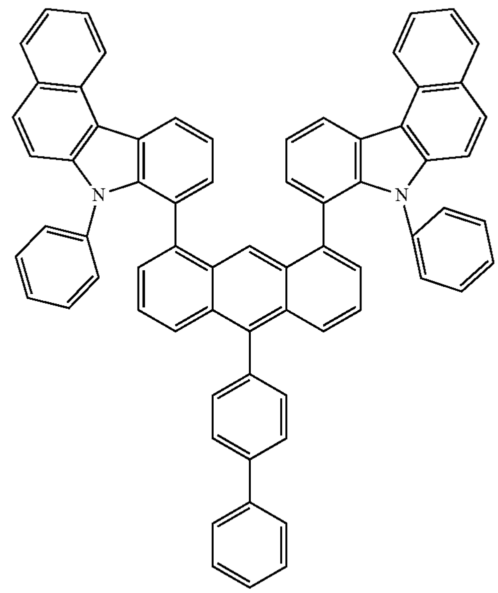
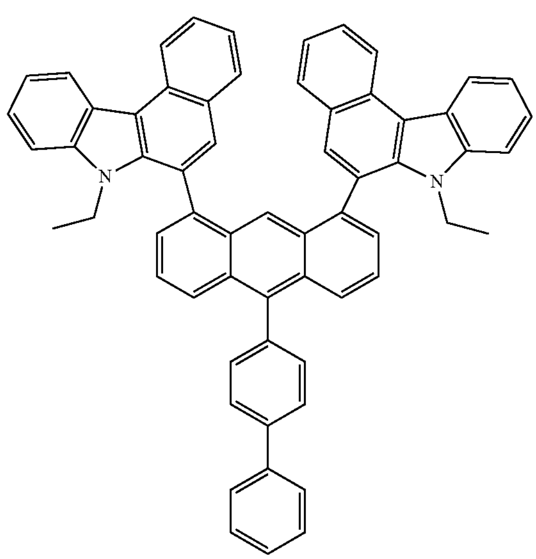

-continued
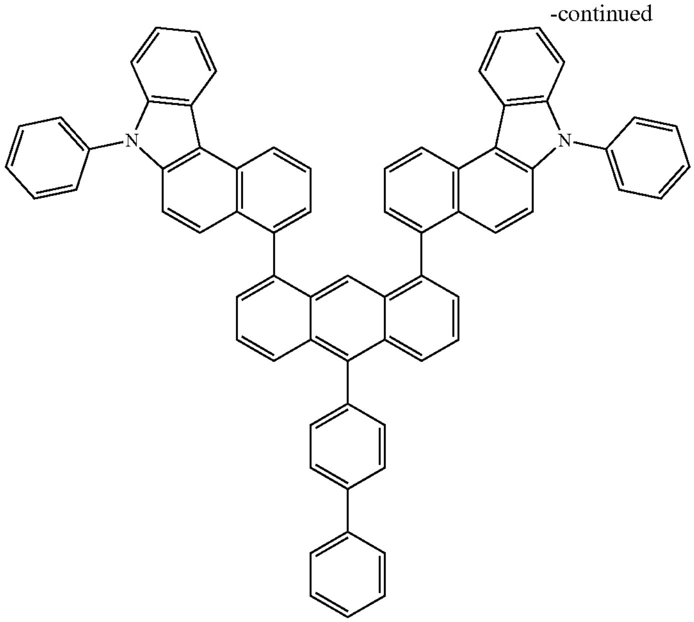
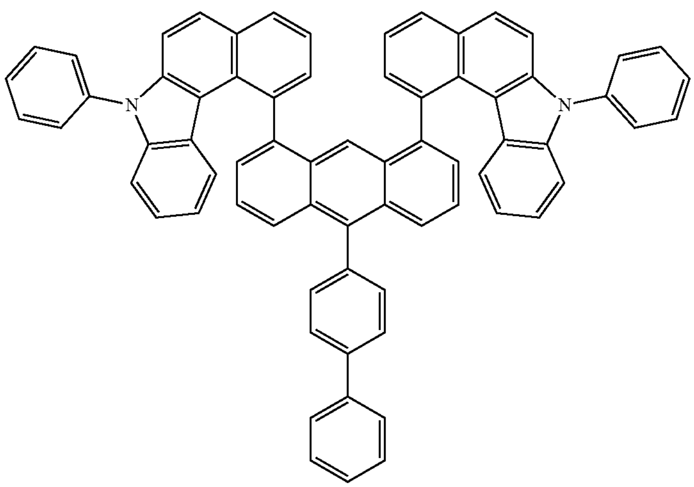 [SMILES: c1ccc(-c2ccc(-c3c4cccc(-c5cccc6ccc7c(c8ccccc8n7-c7ccccc7)c56)c4cc4c(-c5cccc6ccc7c(c8ccccc8n7-c7ccccc7)c56)cccc34)cc2)cc1]
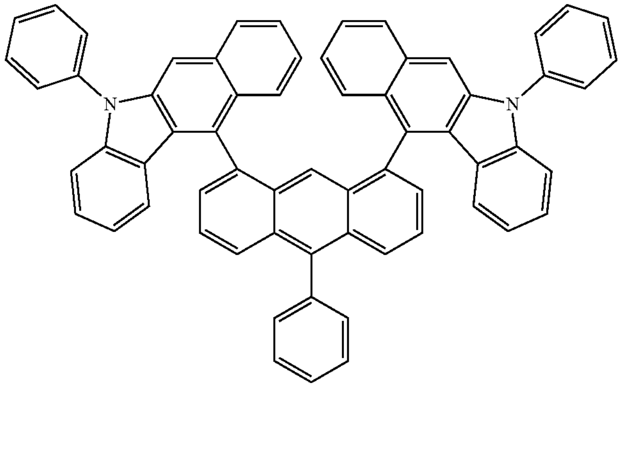

-continued
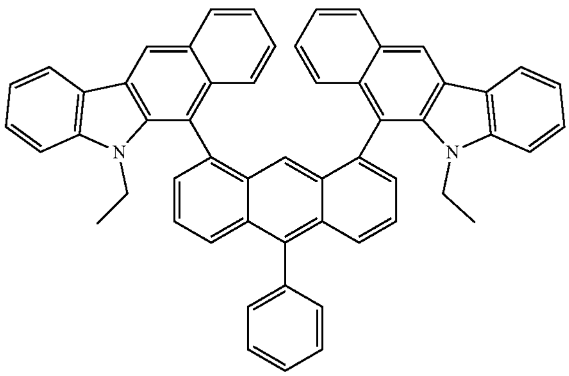
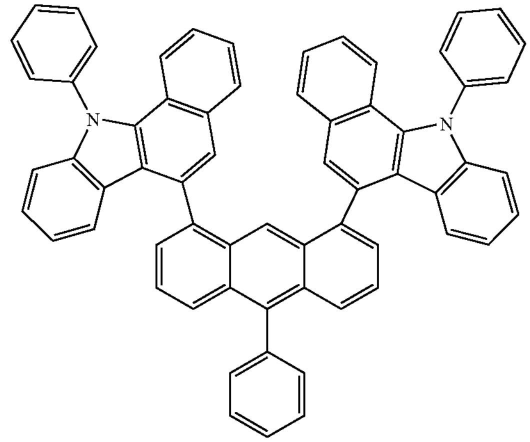
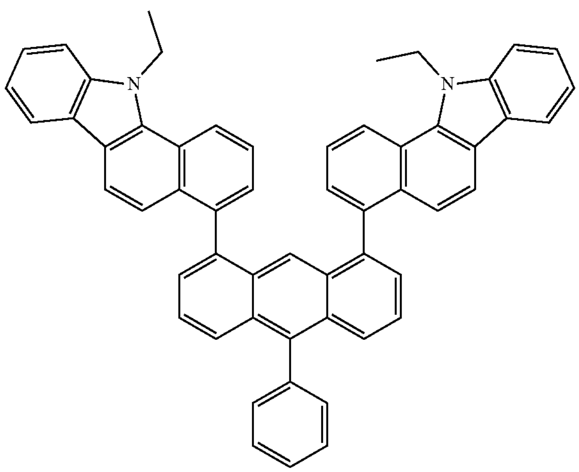
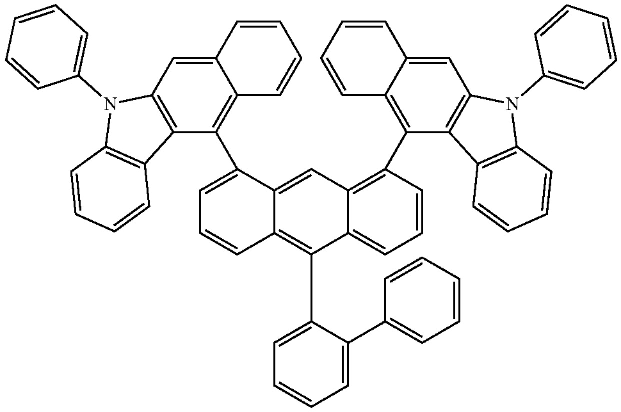

-continued
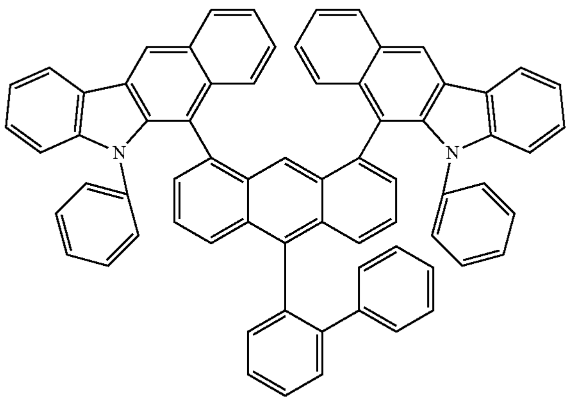
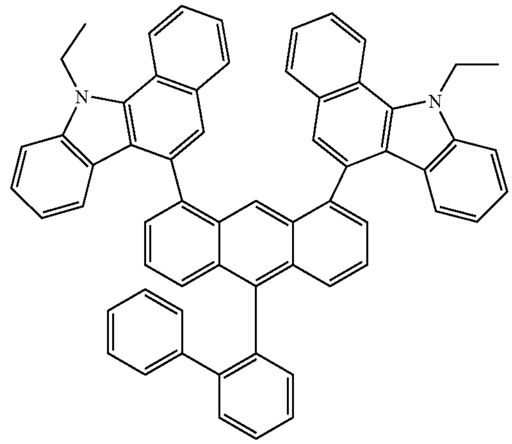
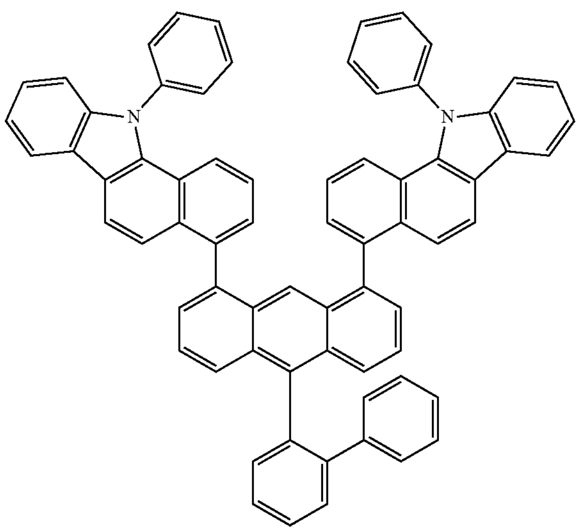
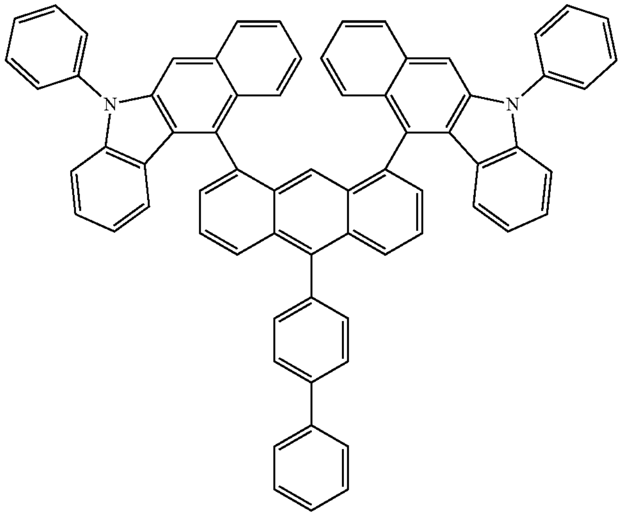

-continued
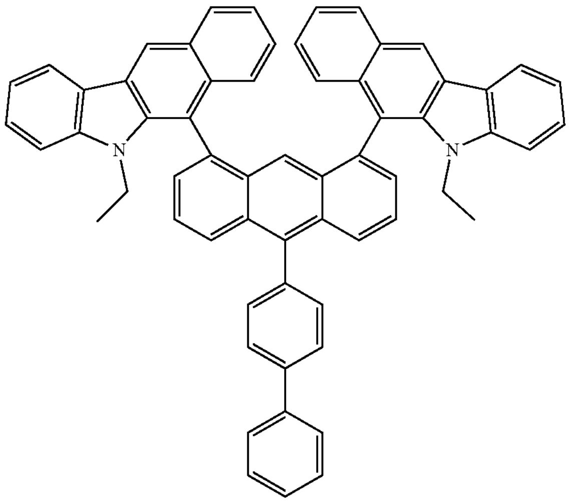
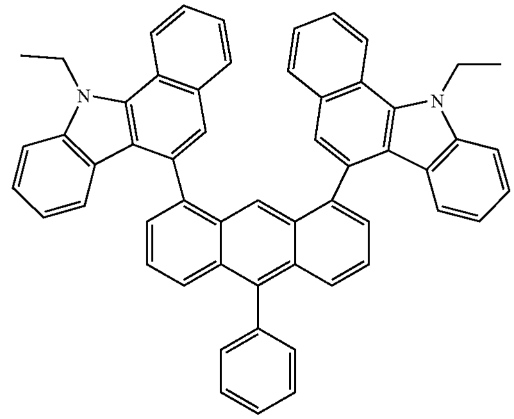
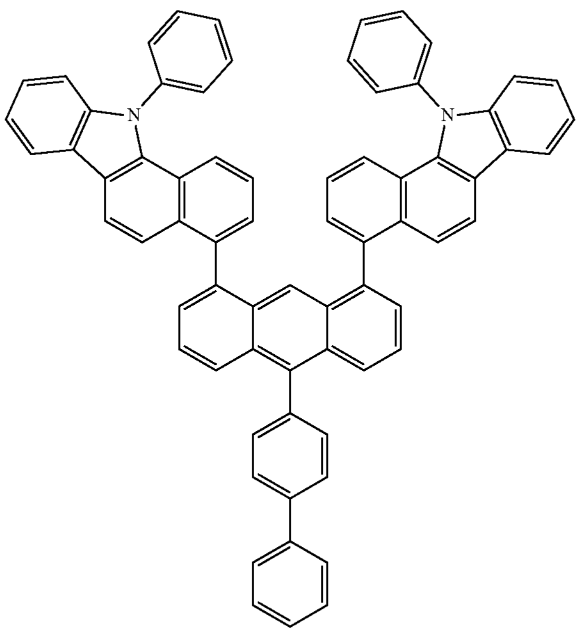
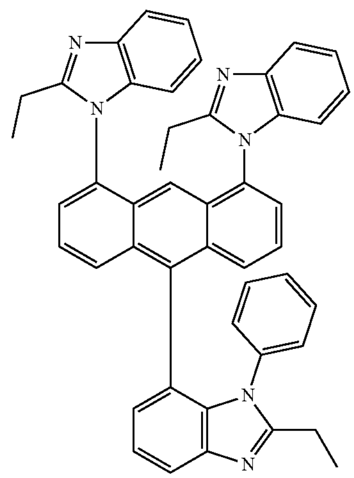
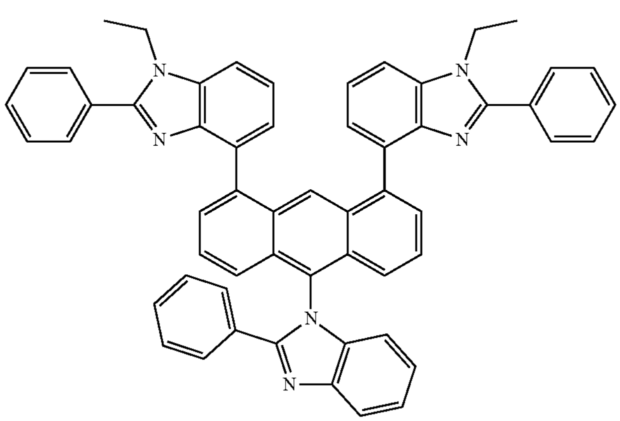
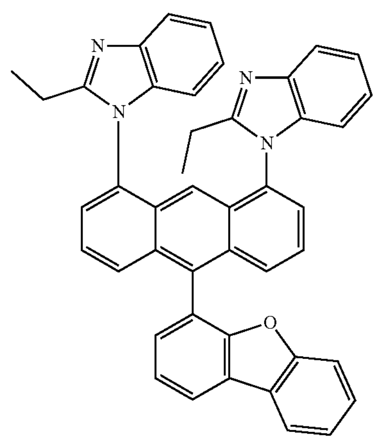

-continued
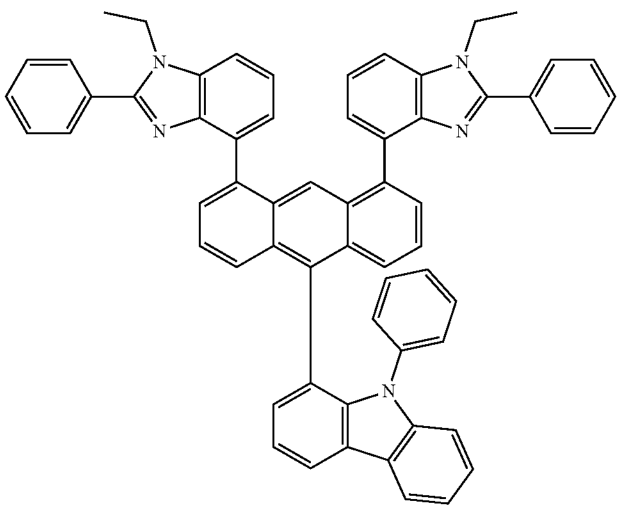
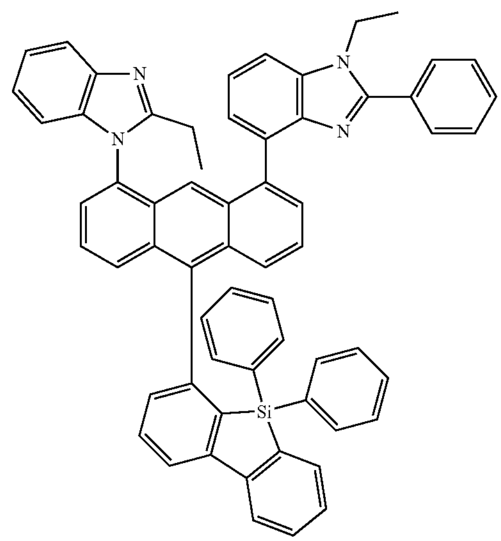
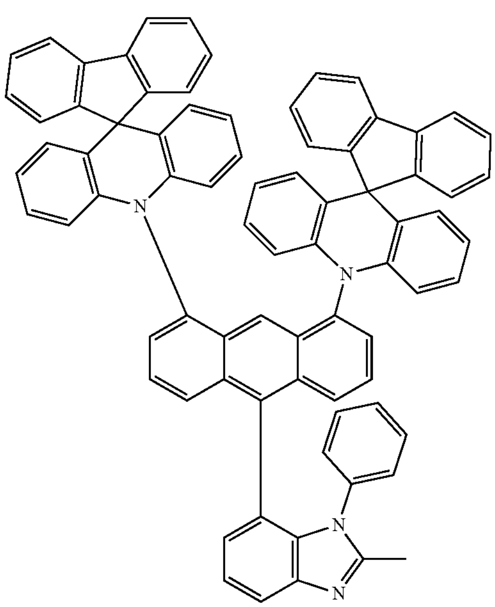
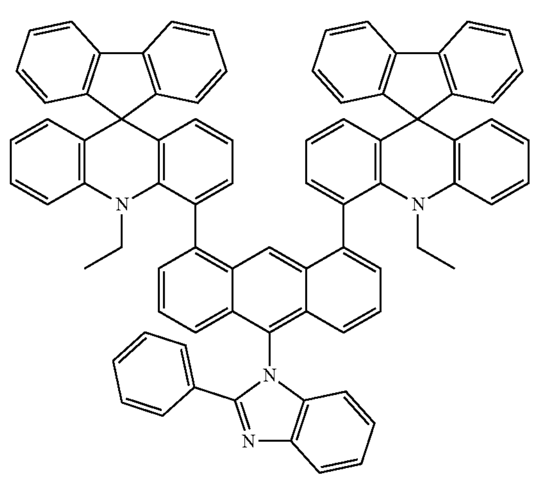

-continued
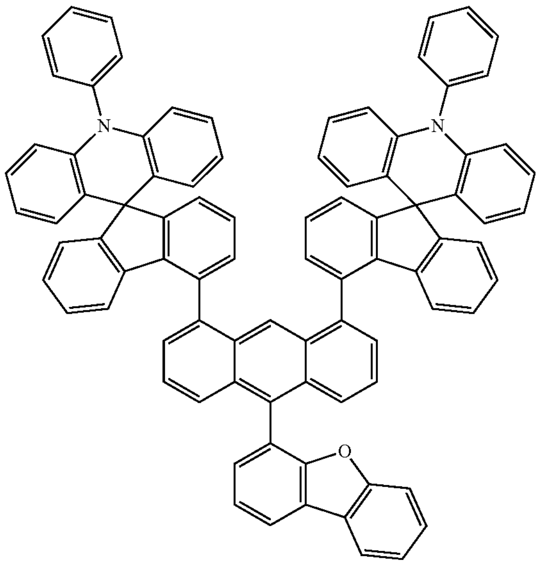
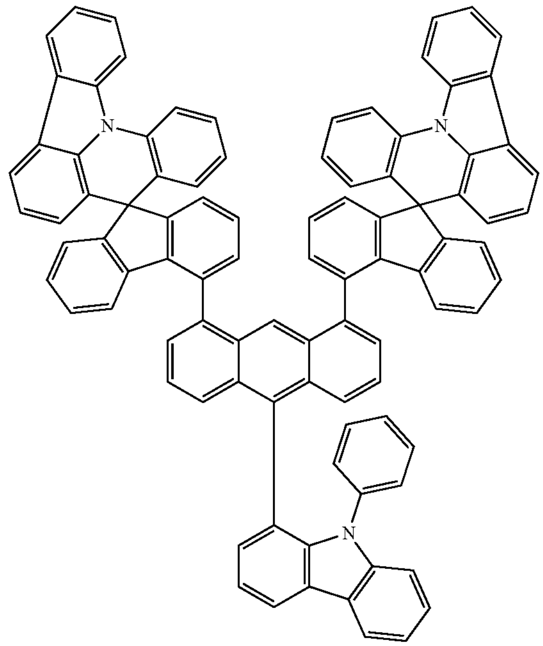
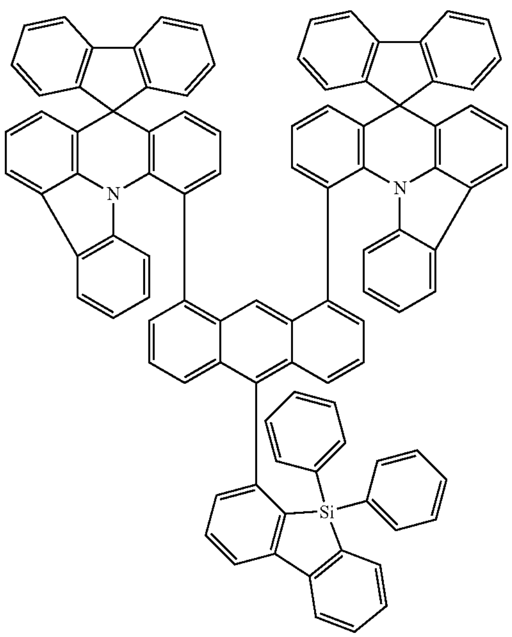
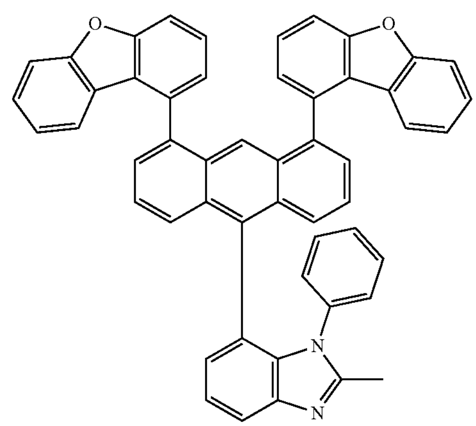
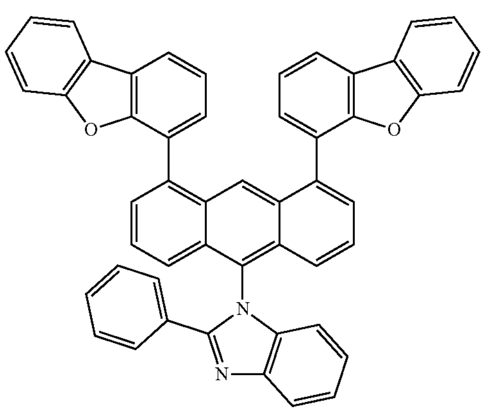
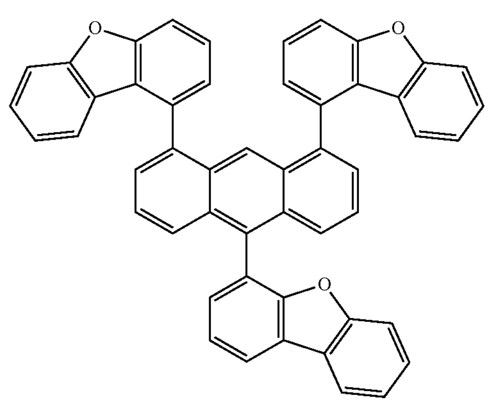

-continued
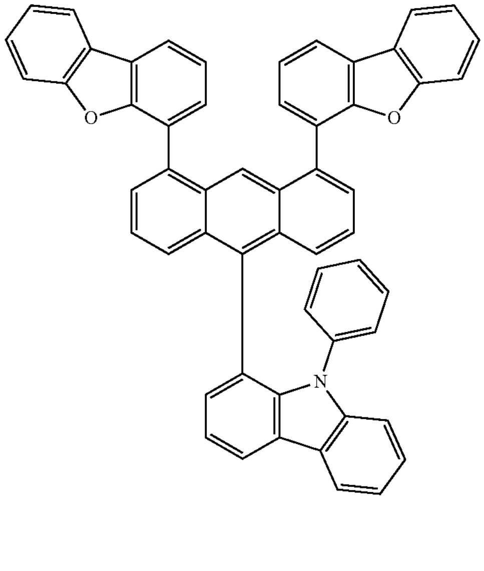
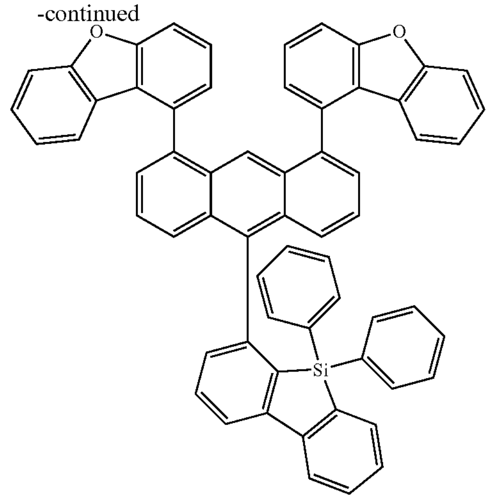
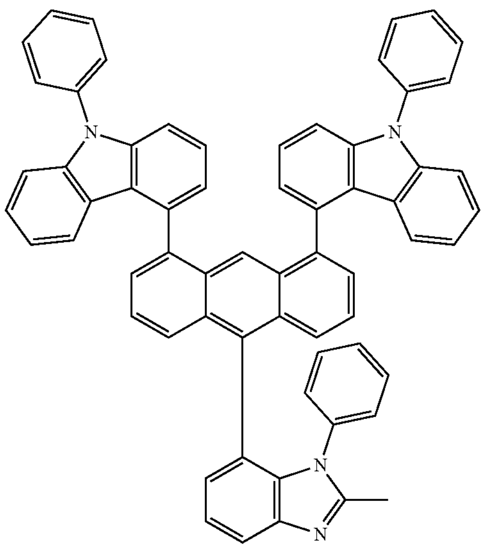
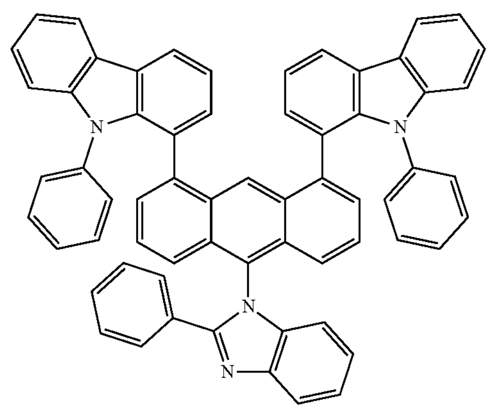
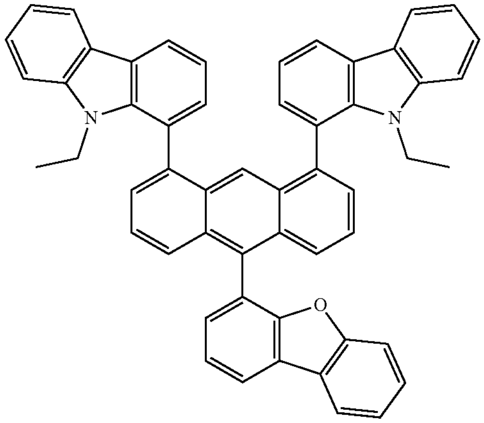
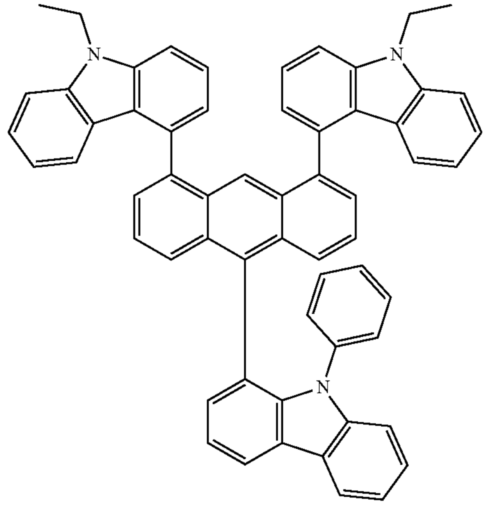

-continued
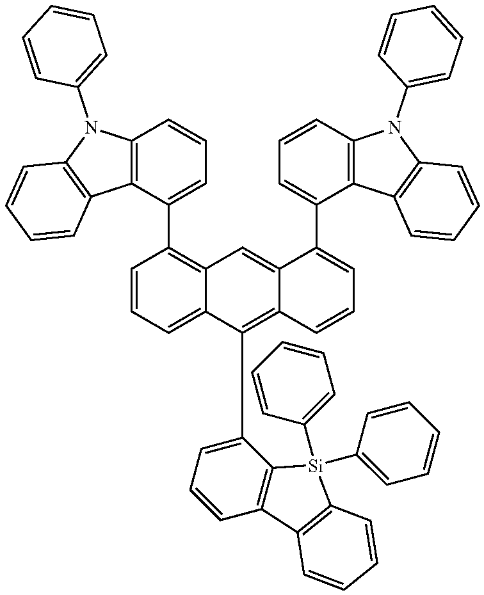
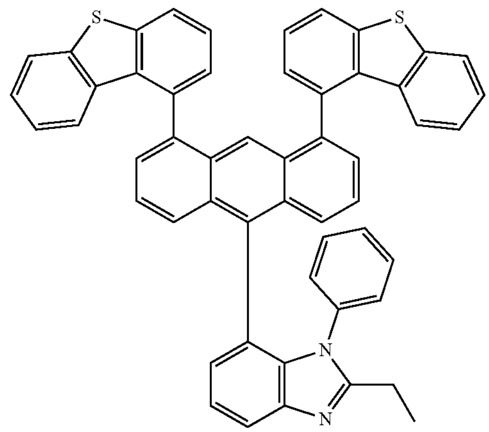
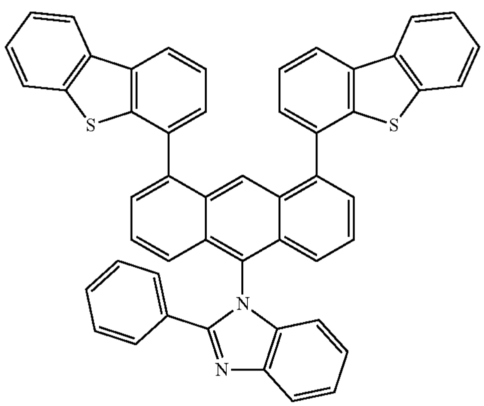
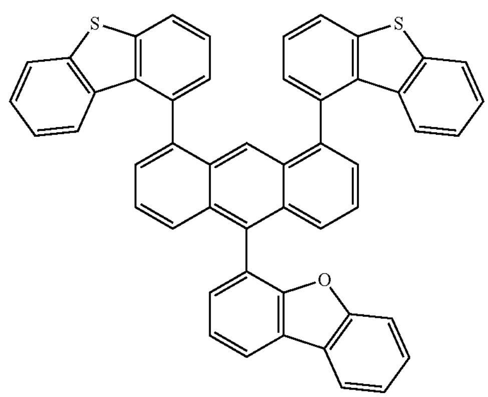
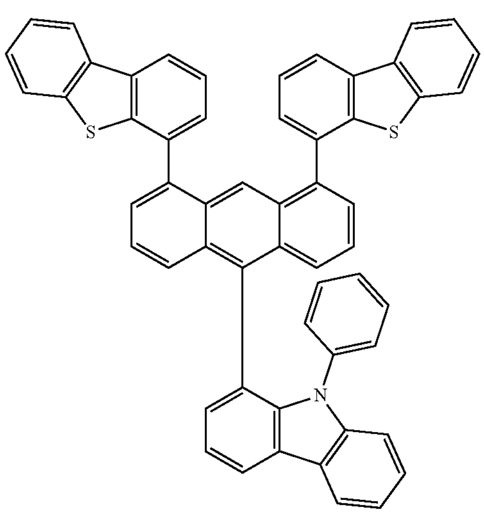
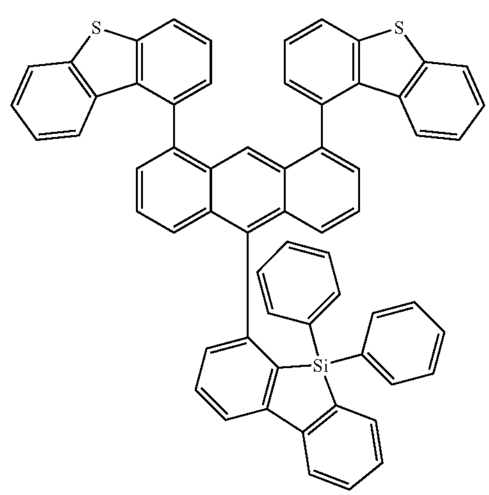

-continued
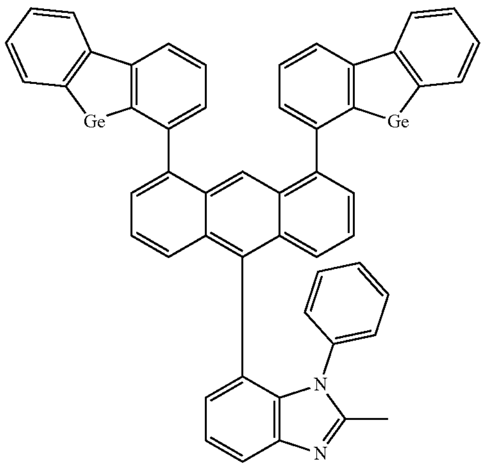
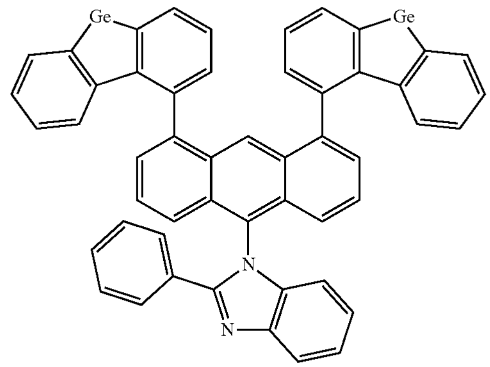
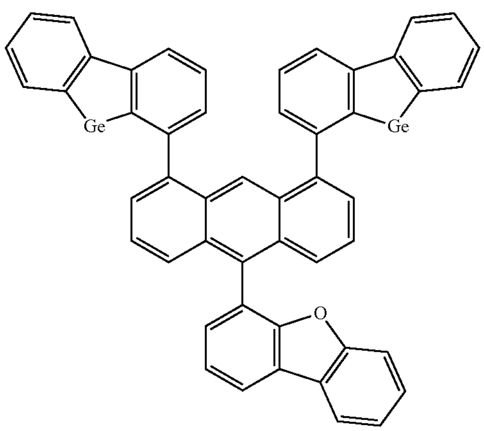
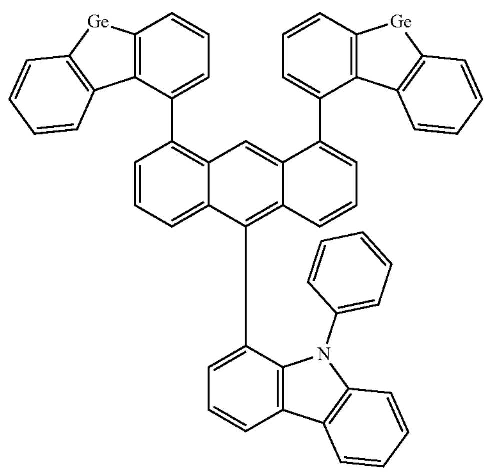
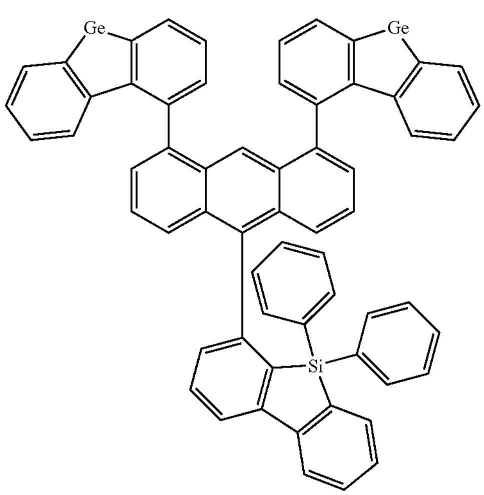
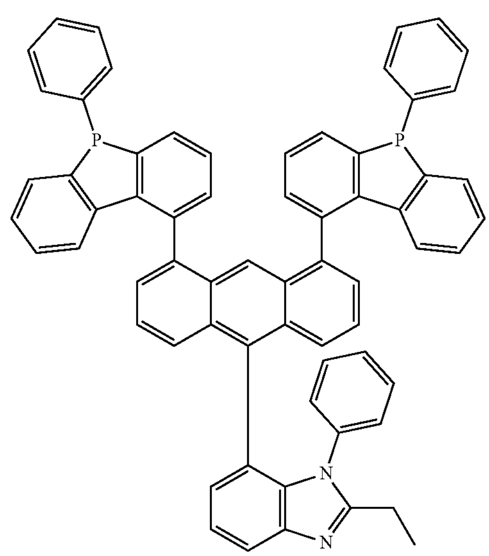

-continued
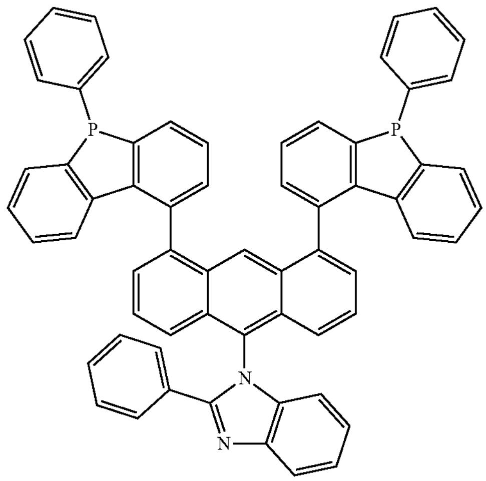
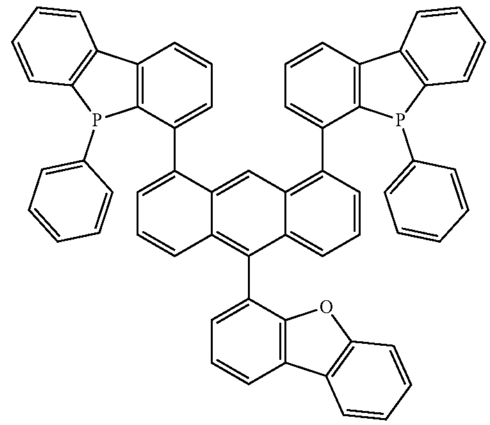
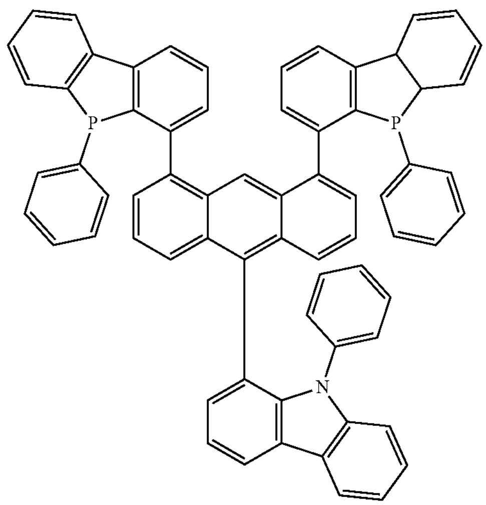
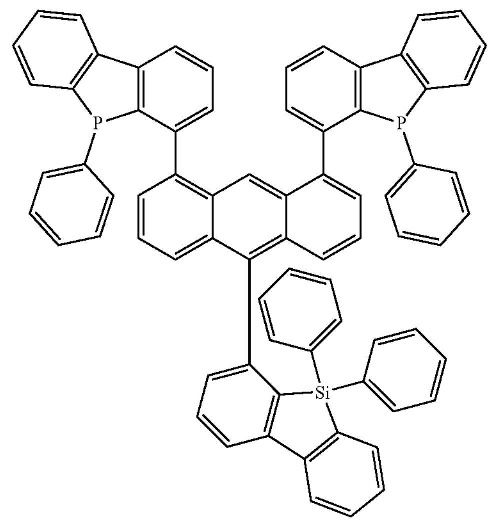
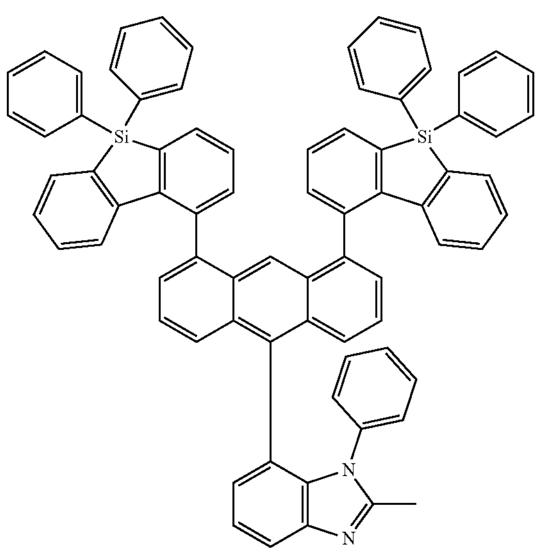
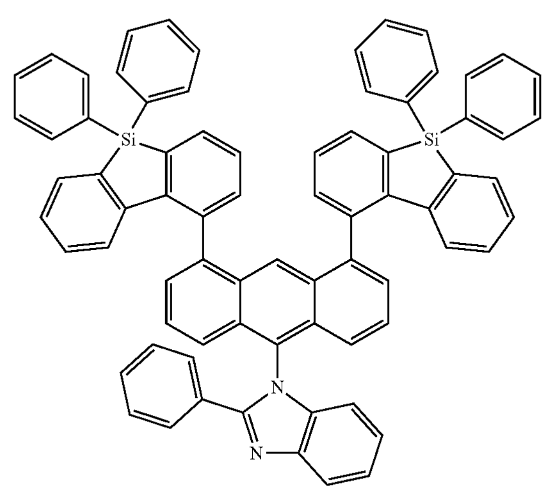

-continued
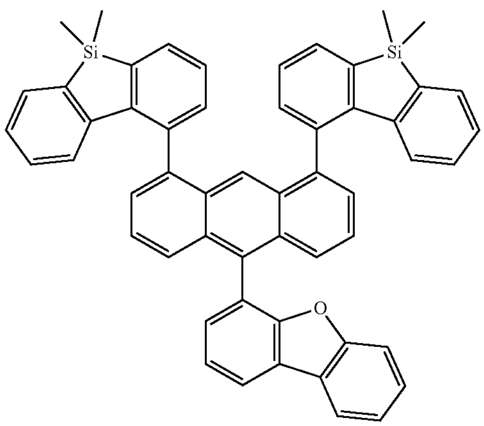
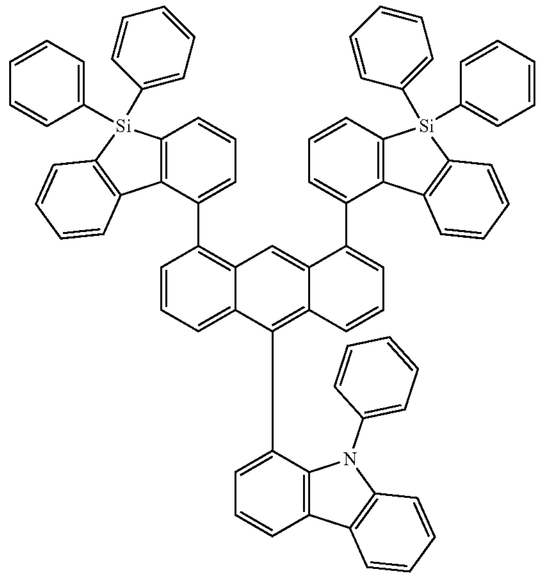
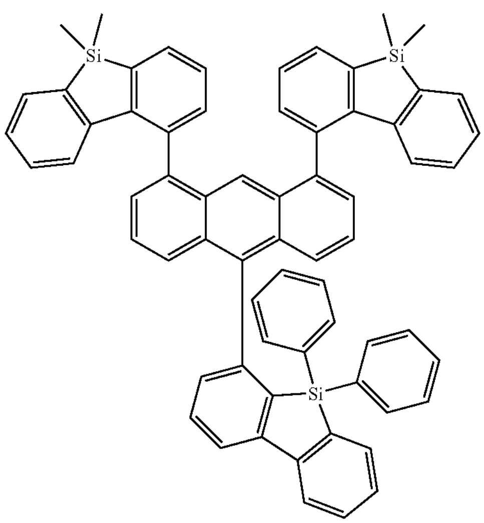
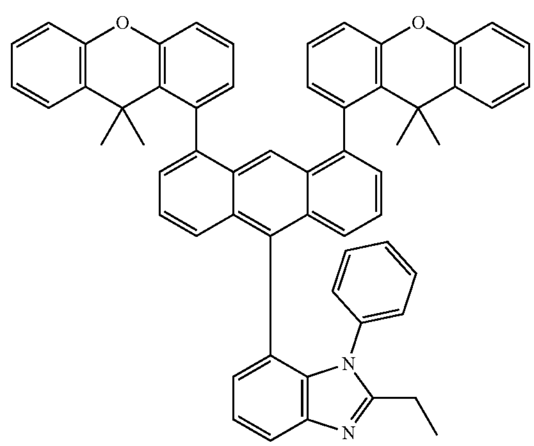
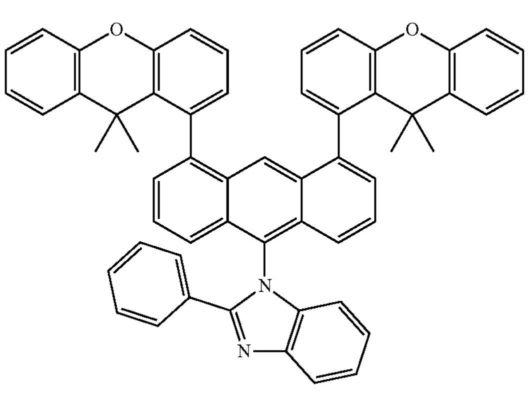
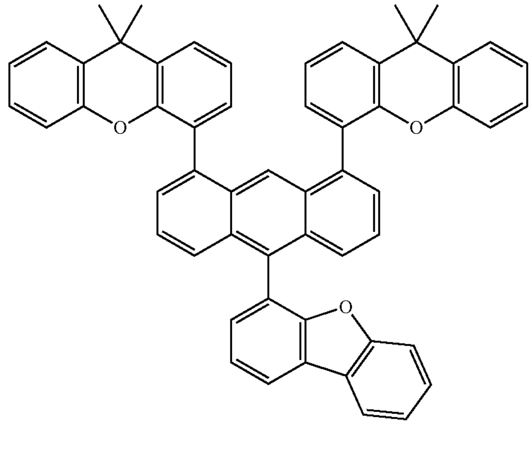

-continued
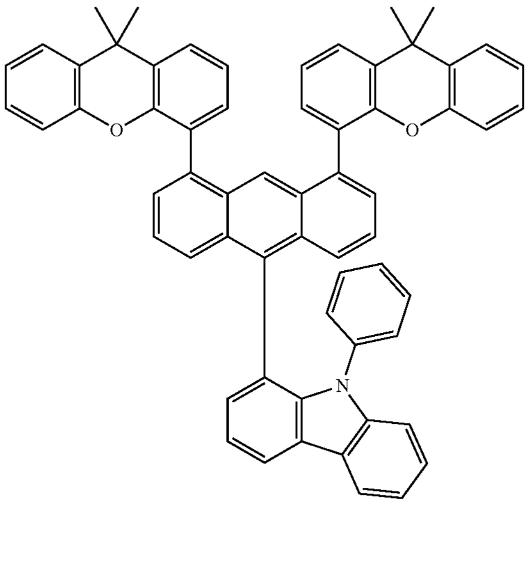
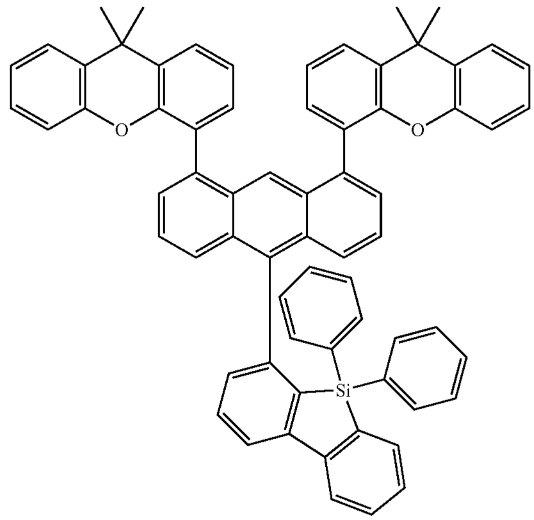
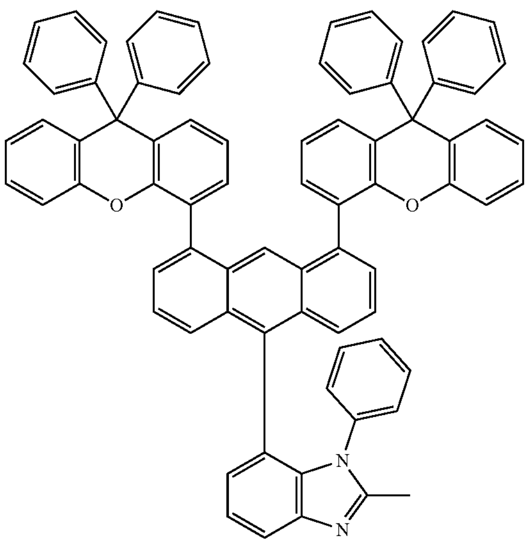
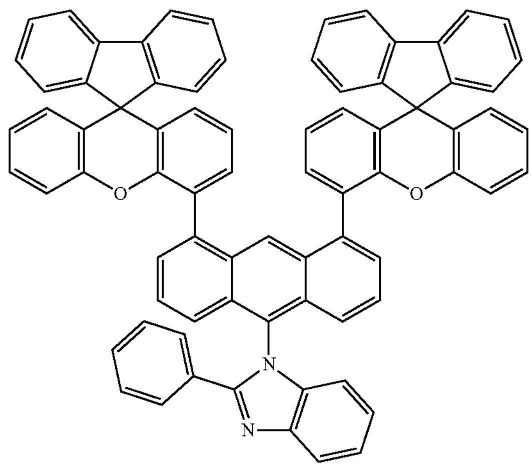
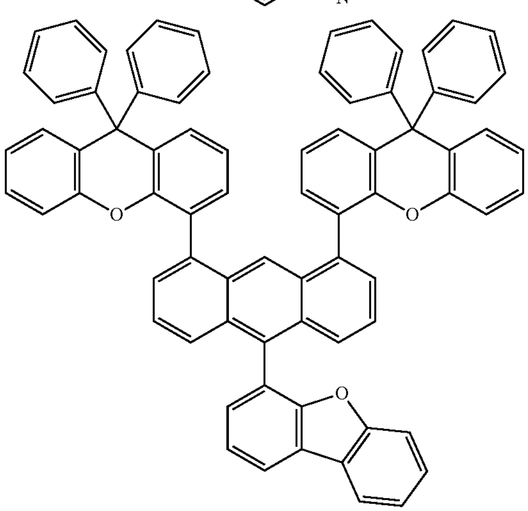
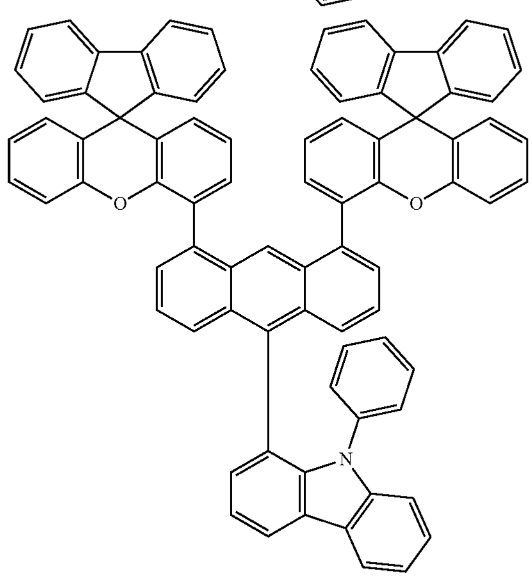

-continued
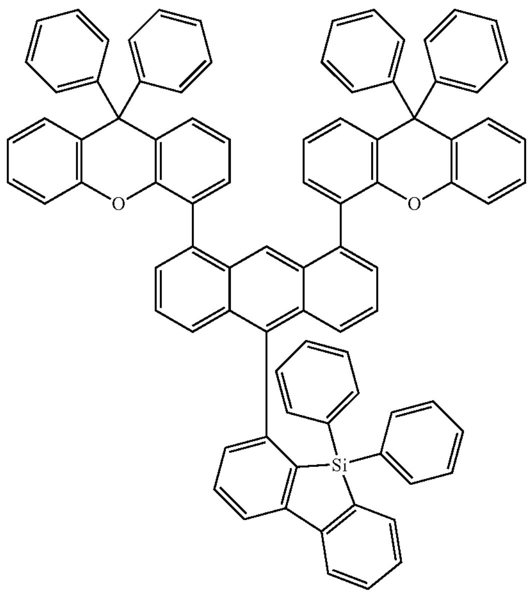
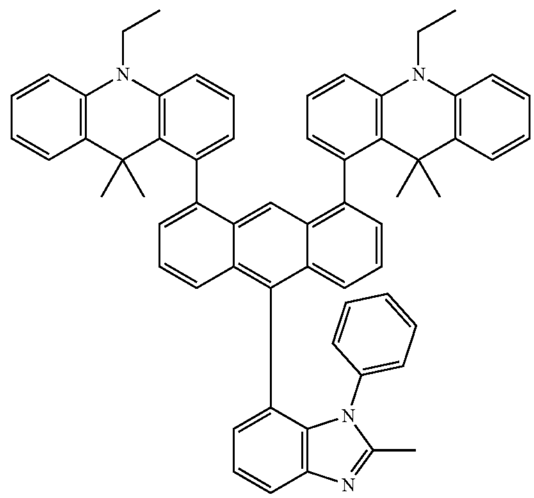
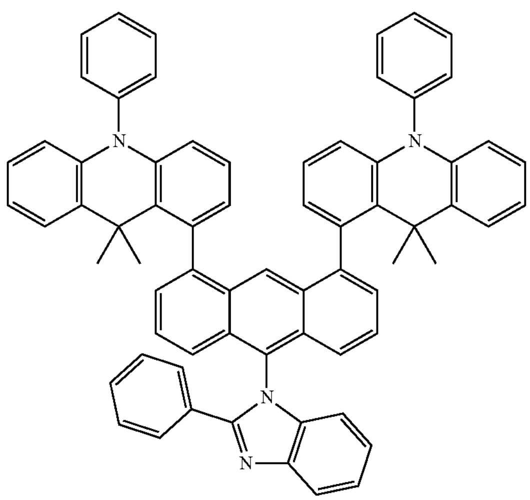
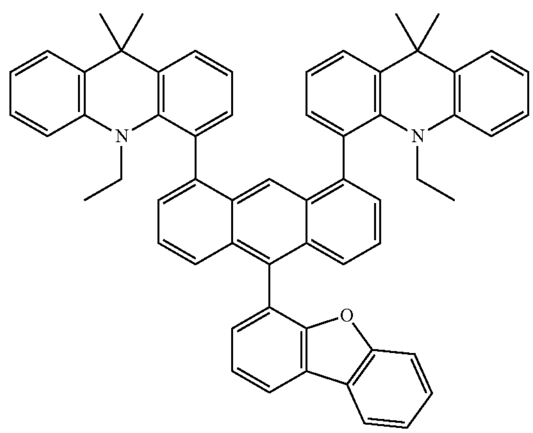
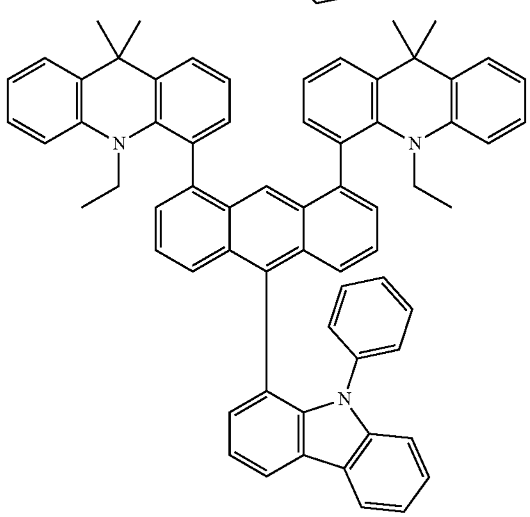
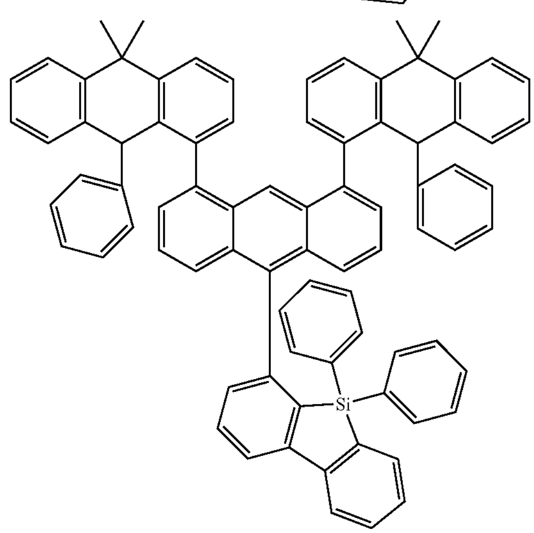

-continued
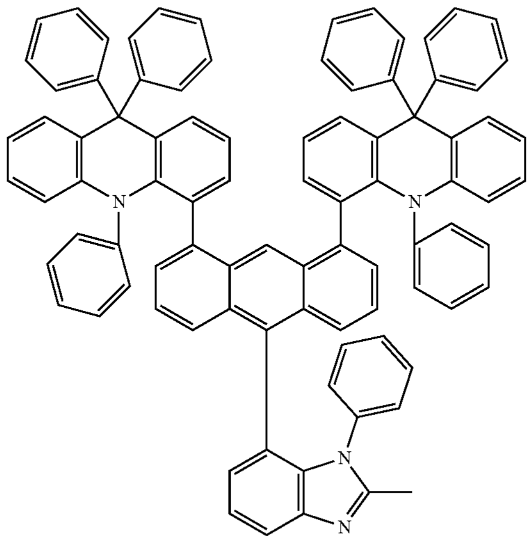
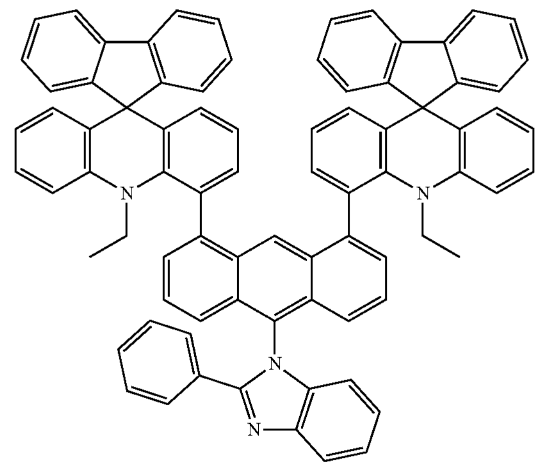
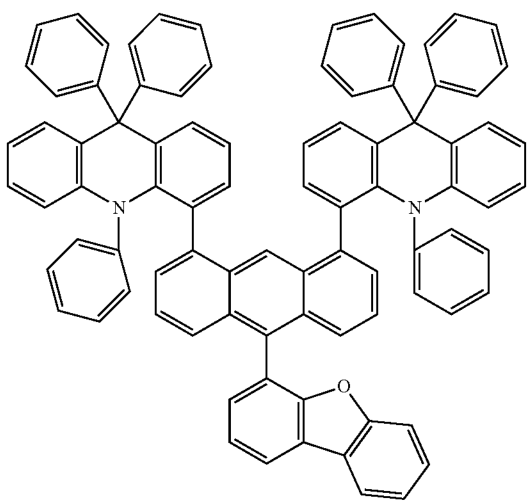
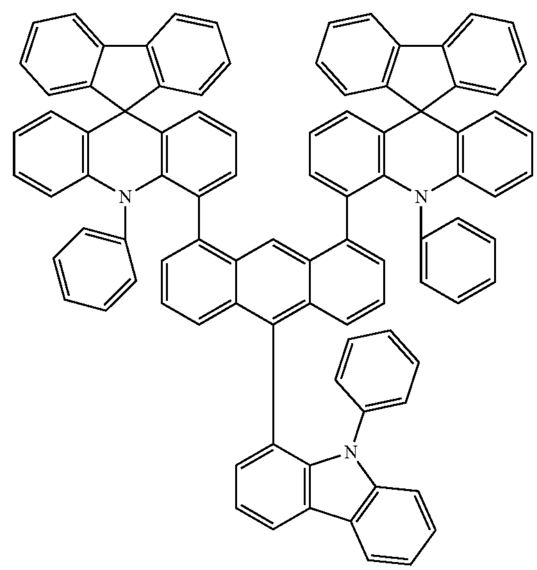
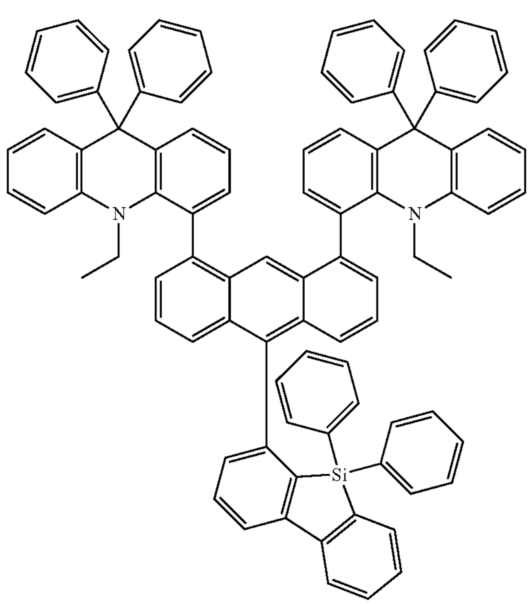
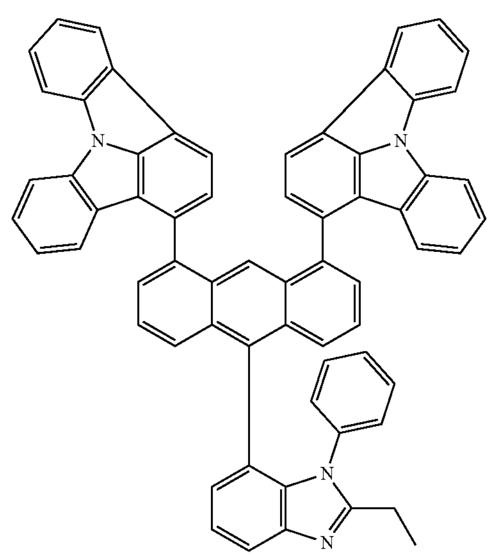

-continued
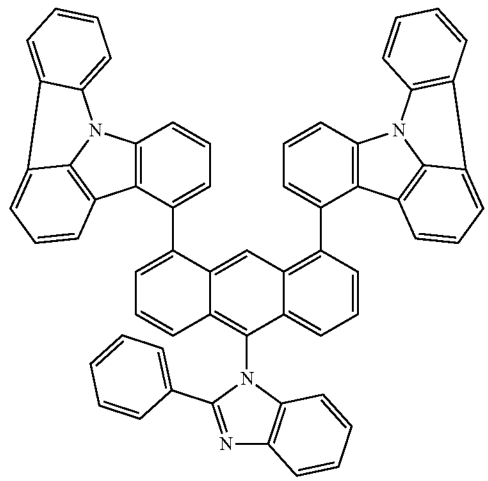
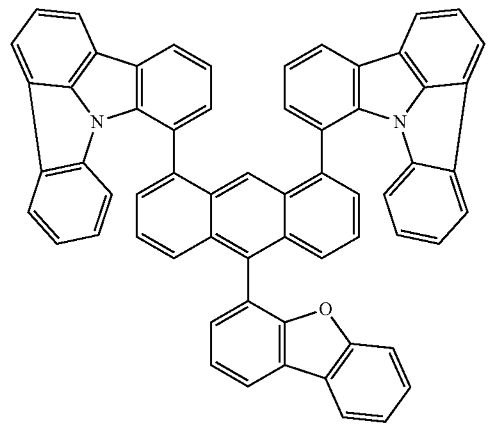
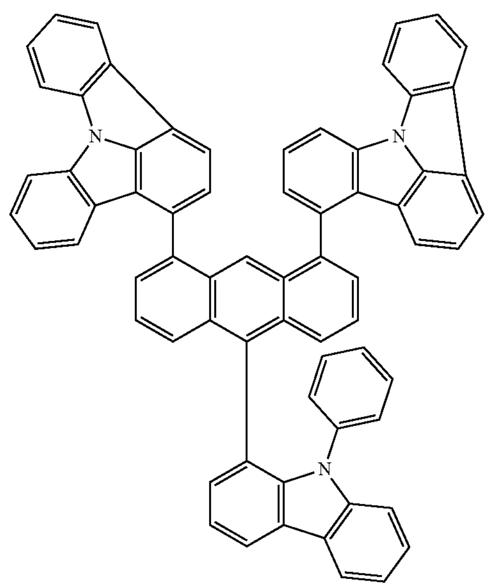
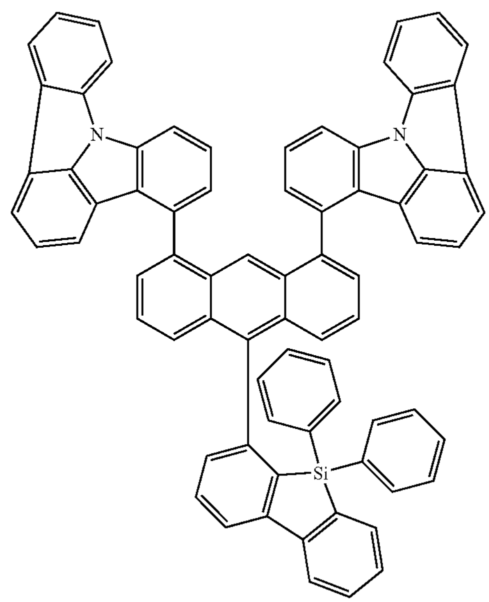
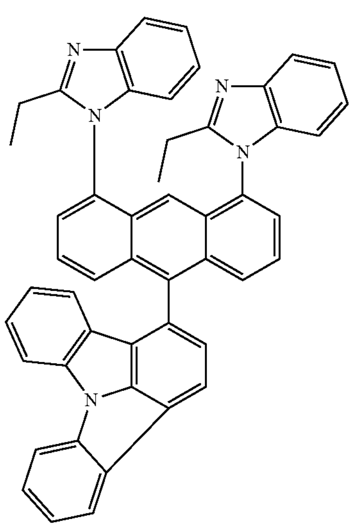
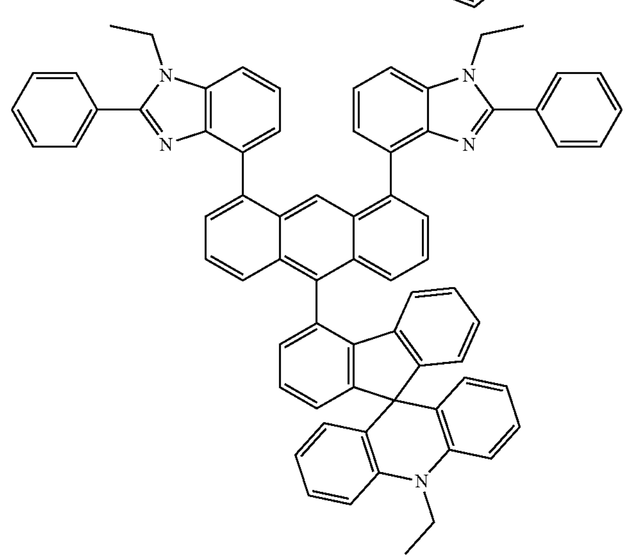

-continued
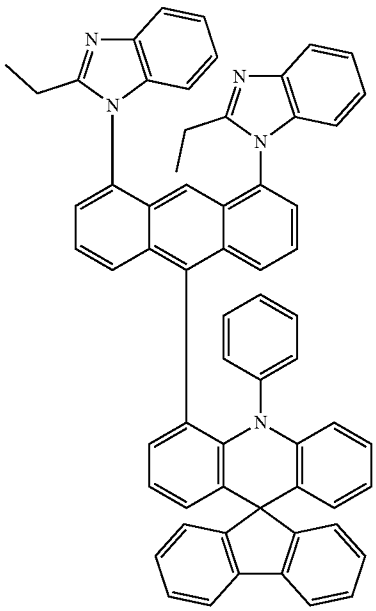
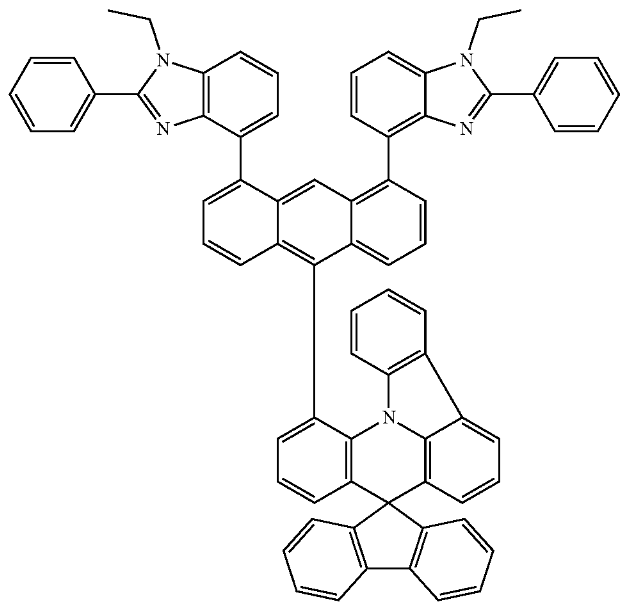
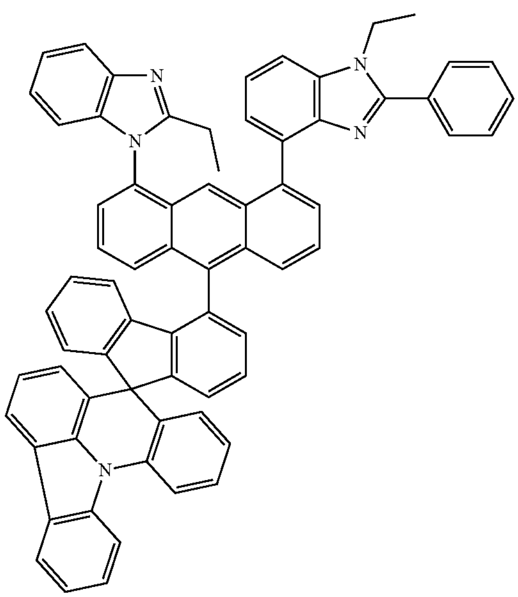
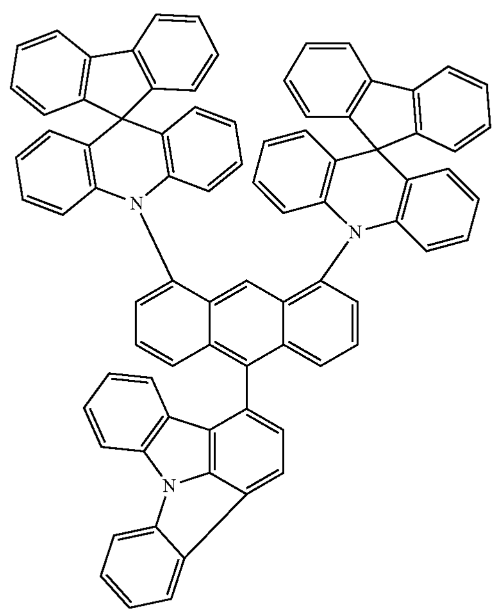

-continued
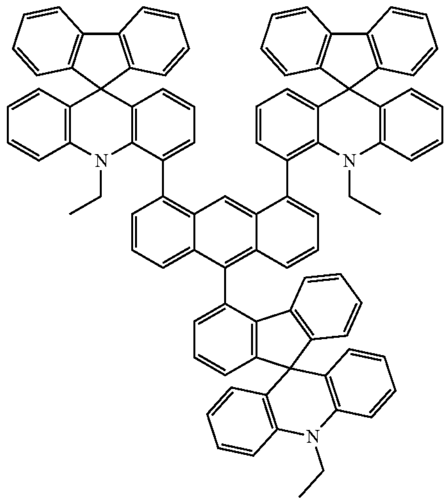
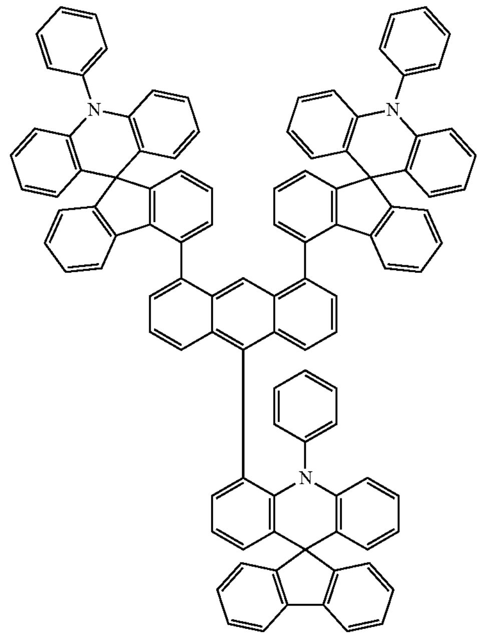
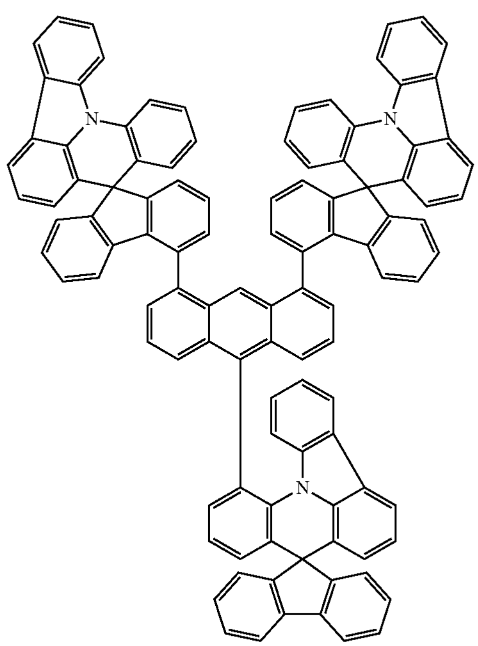
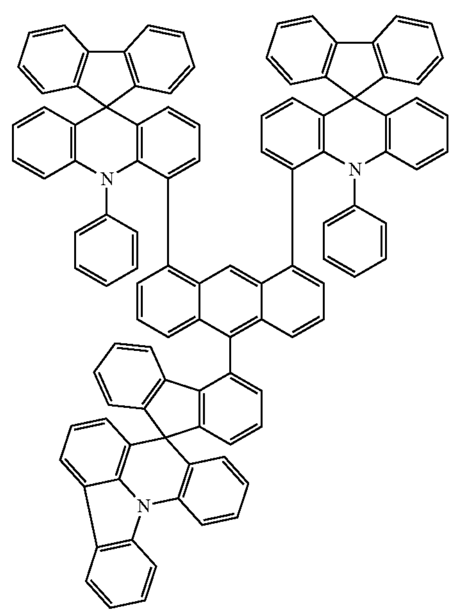

-continued
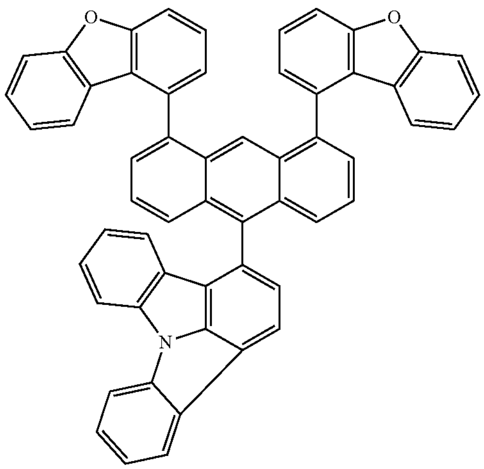
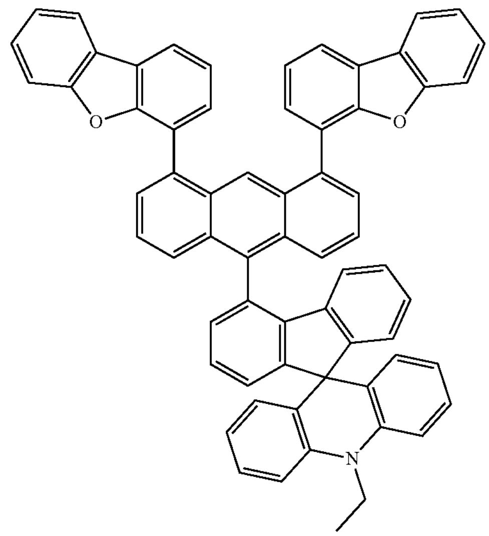
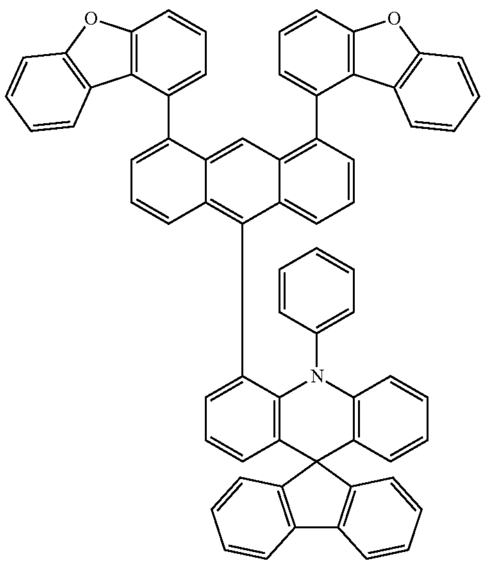
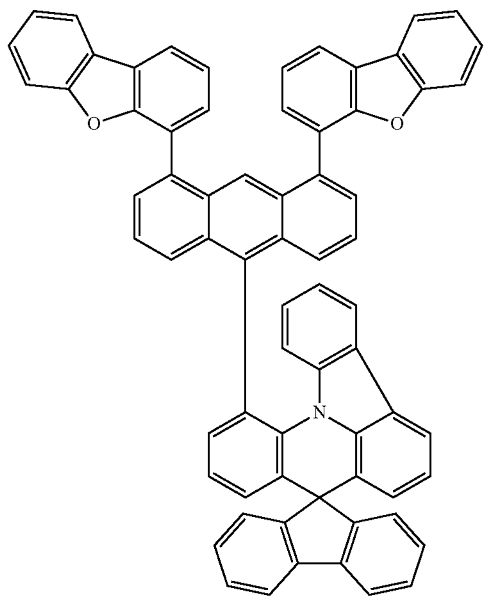
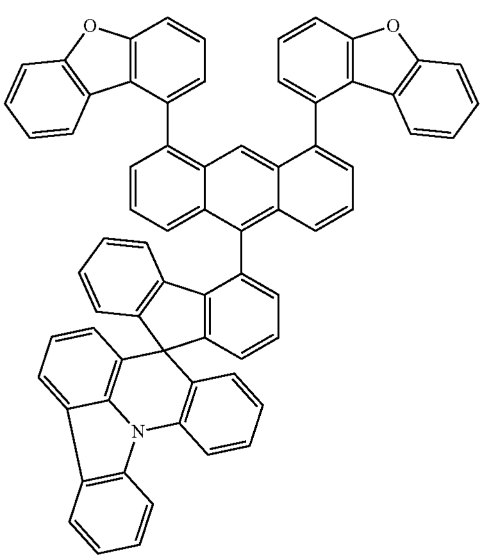
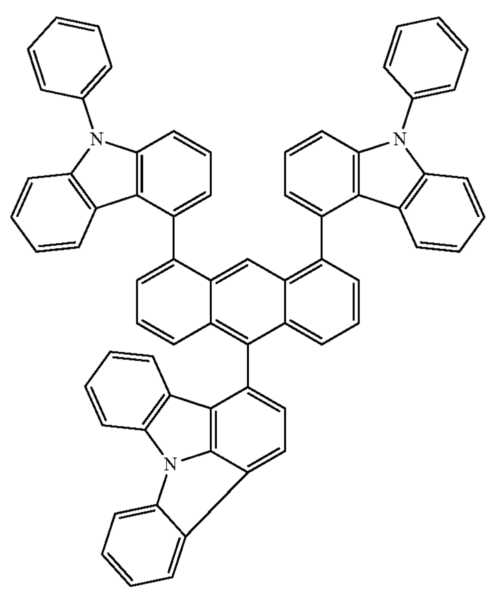

-continued
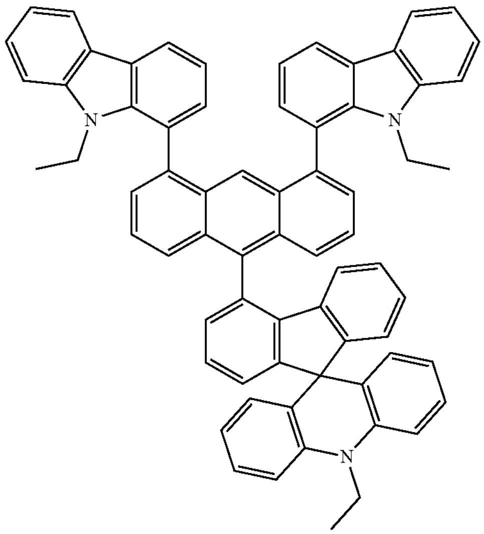
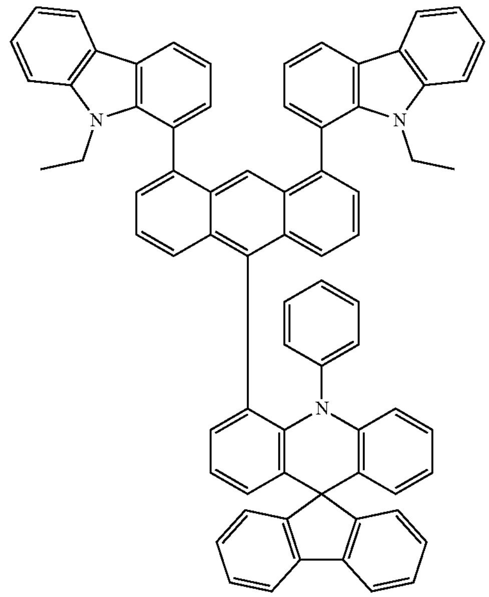
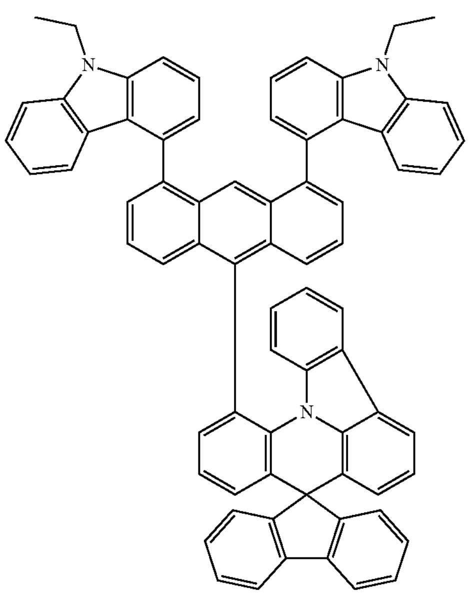
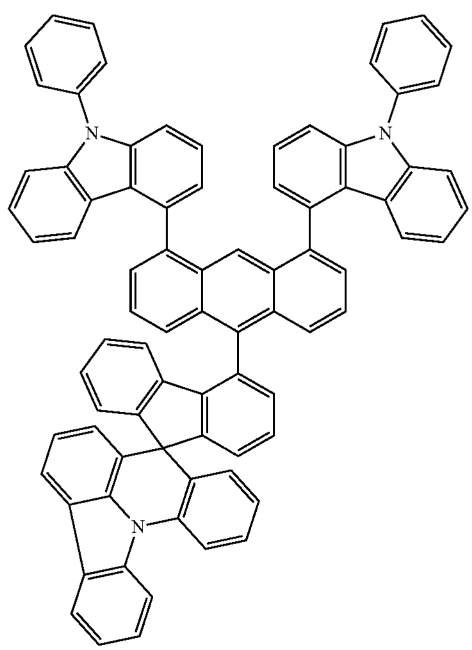

-continued
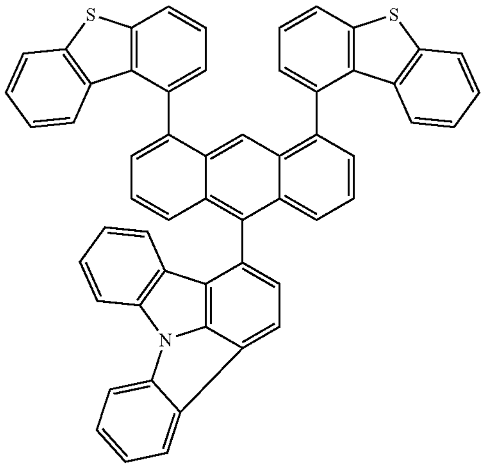
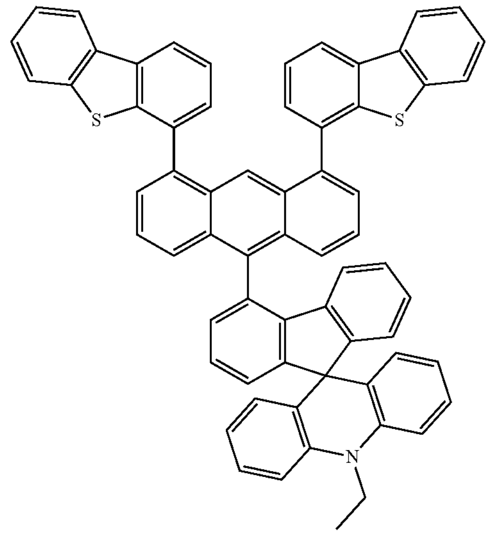
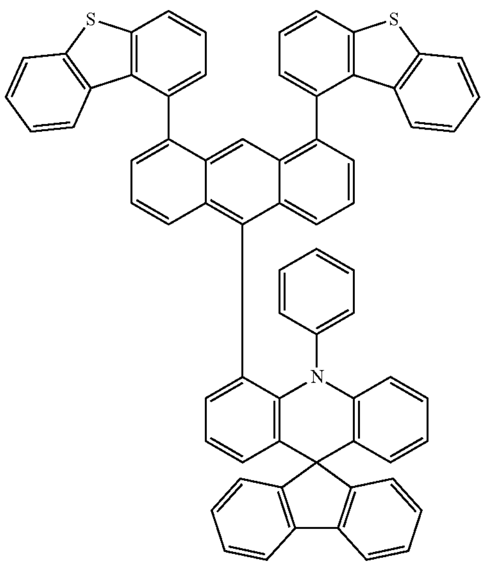
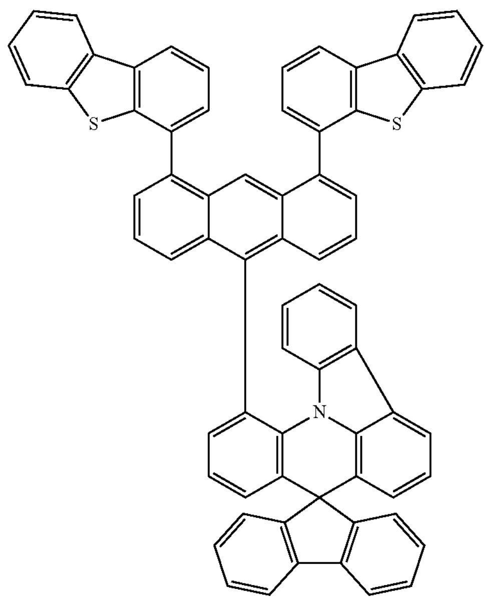
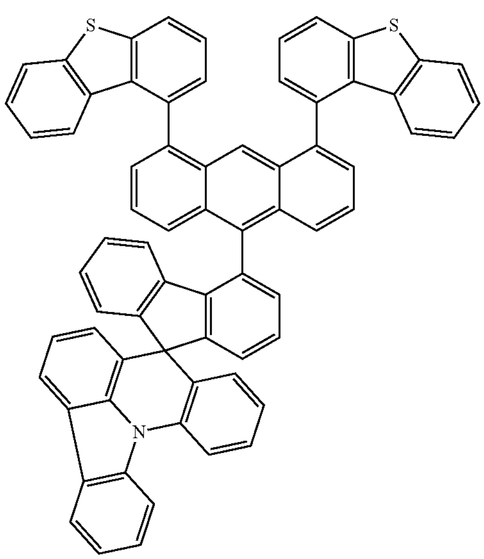
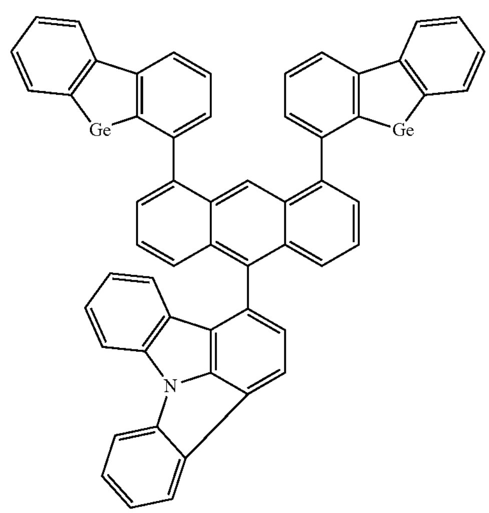

-continued
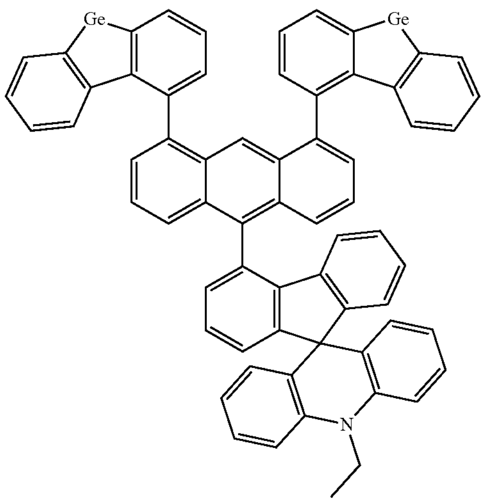
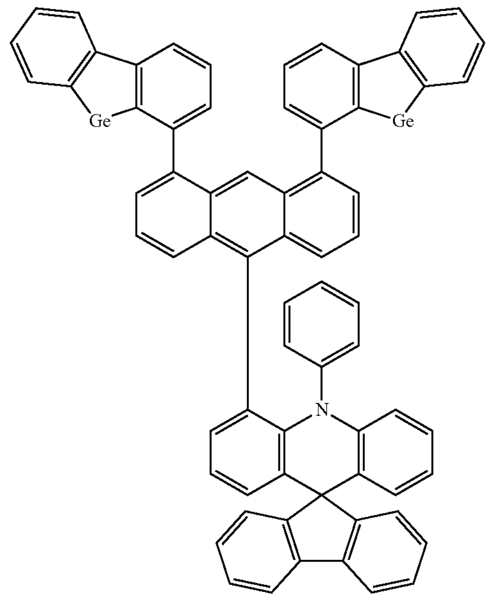
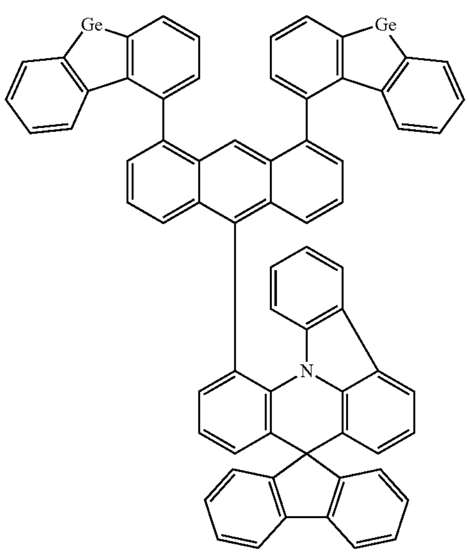
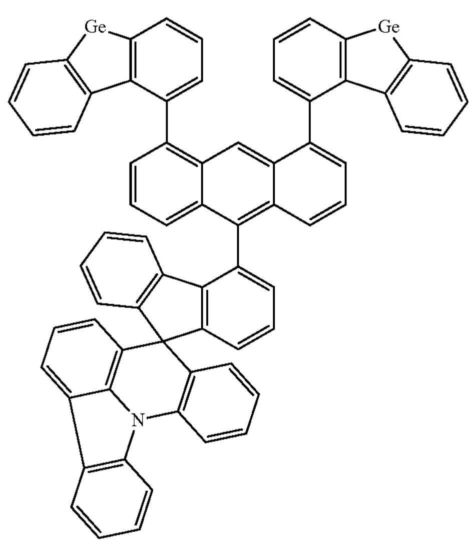

-continued
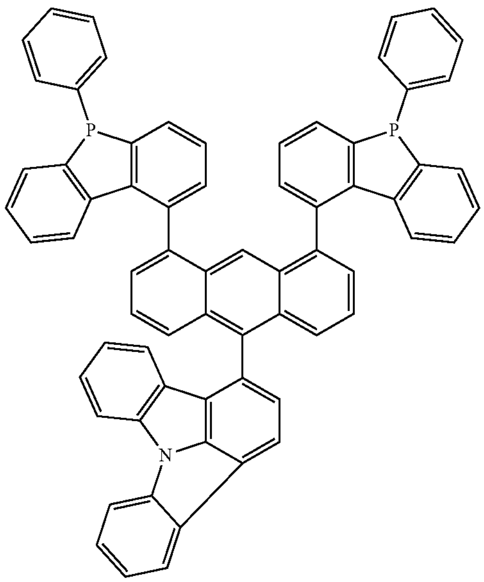
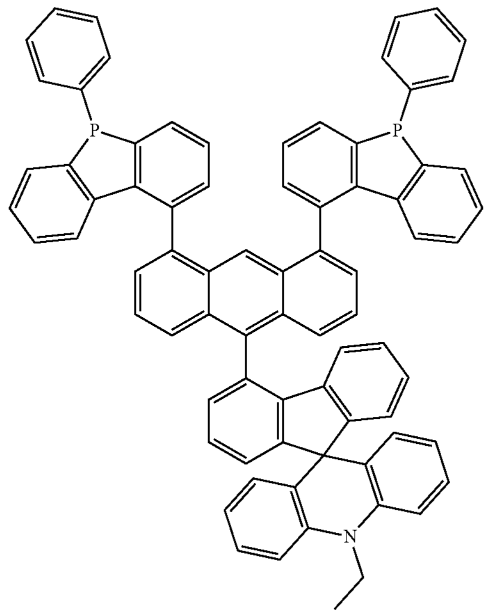
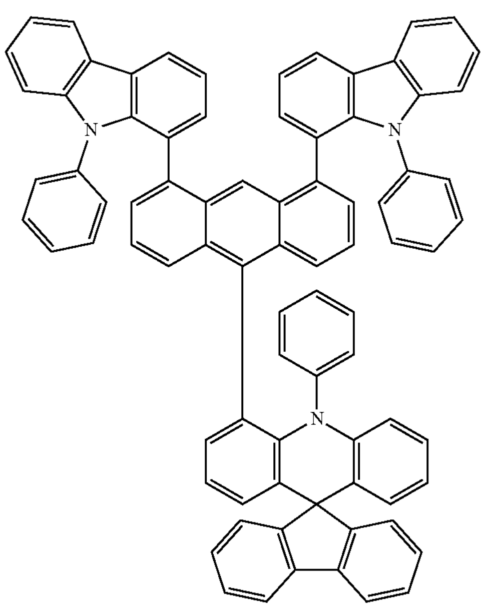
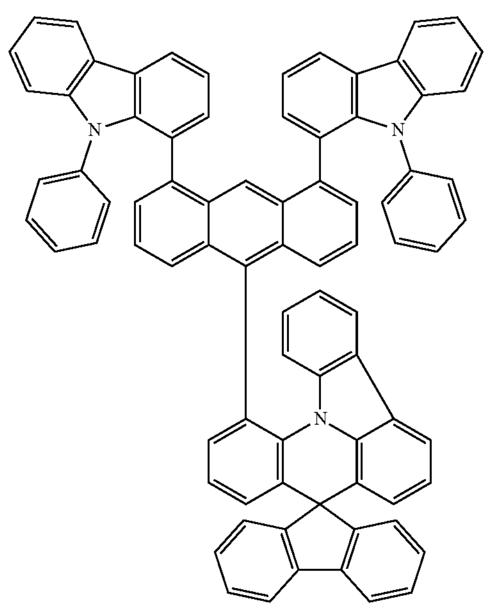

-continued
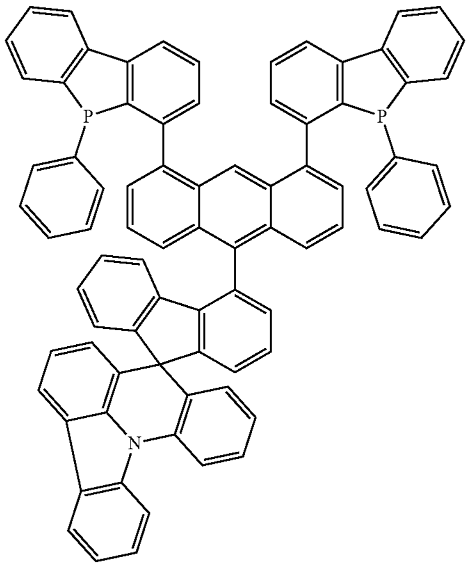
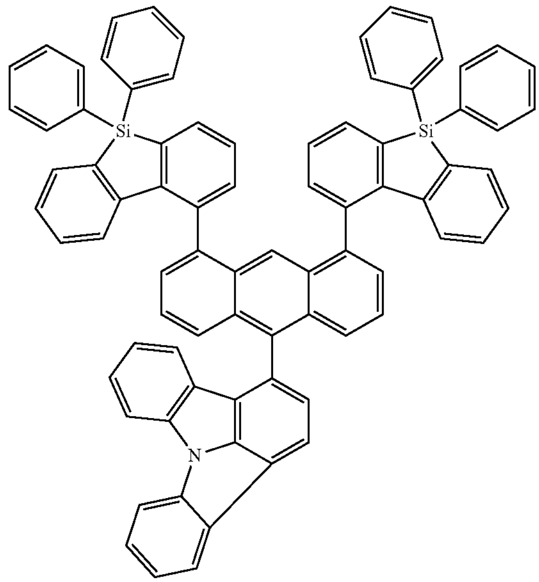
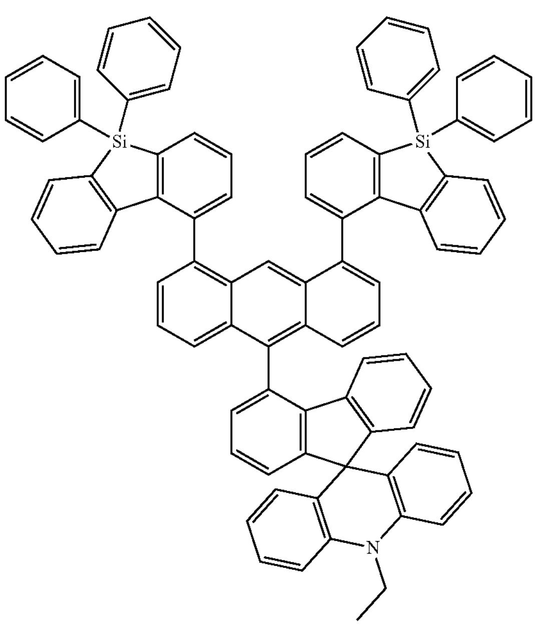
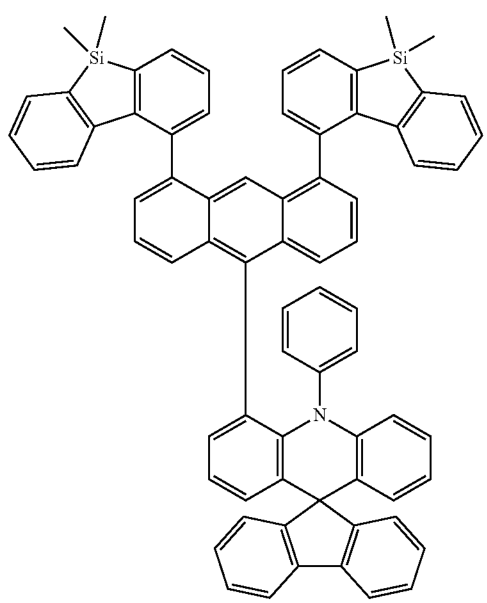

-continued
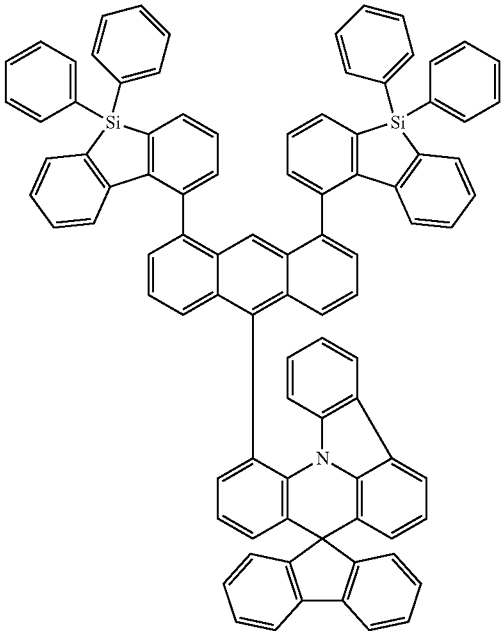
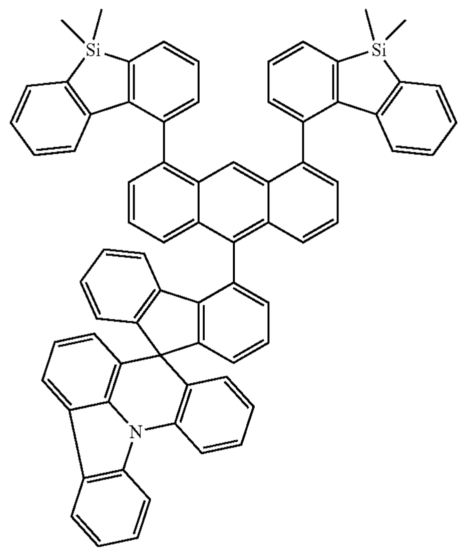
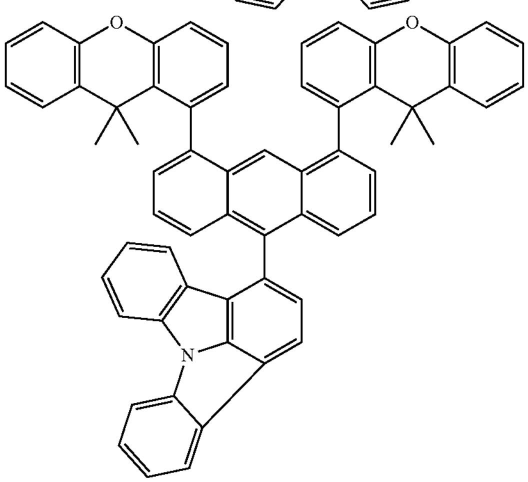
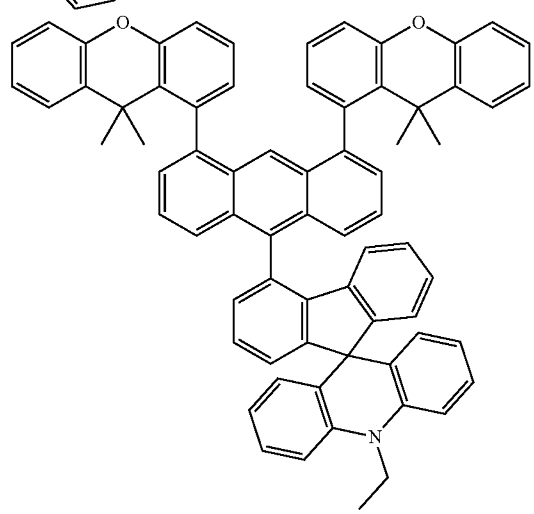
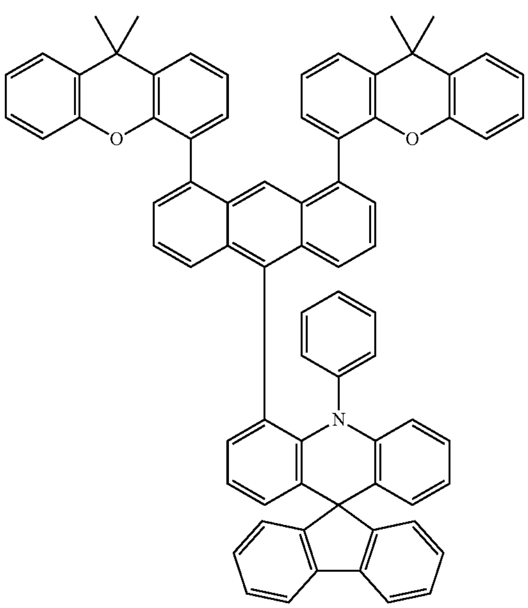
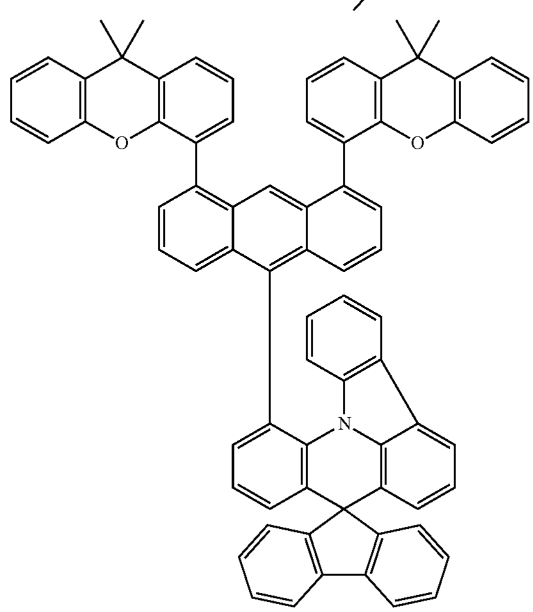

-continued
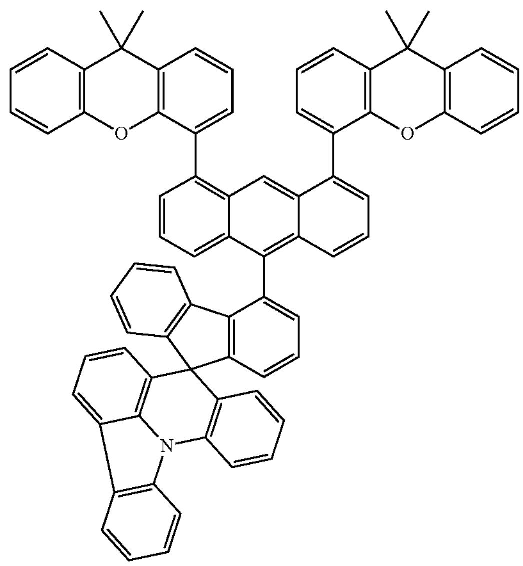
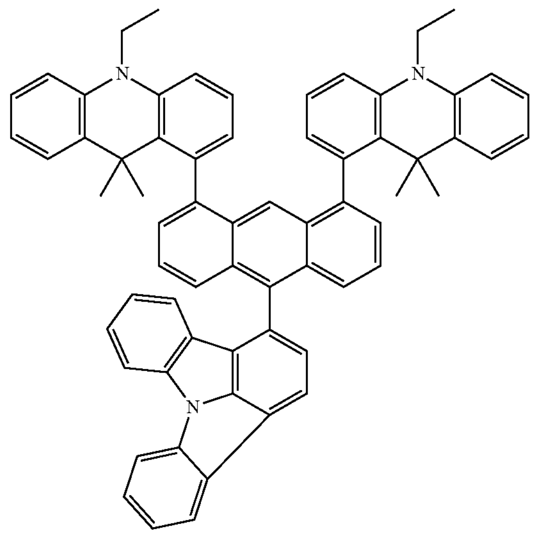
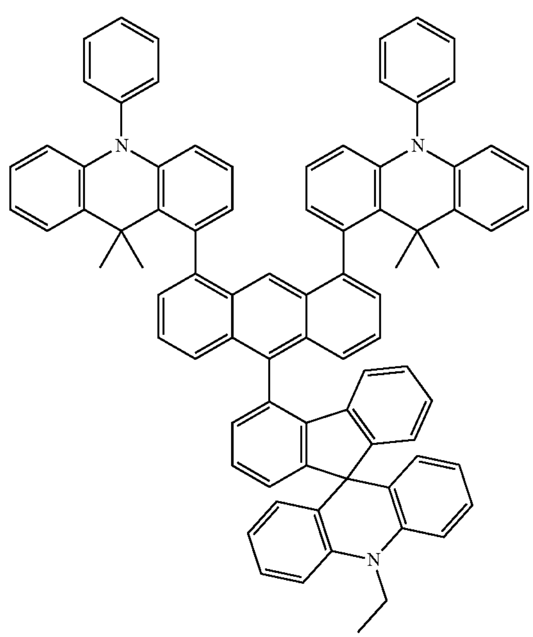
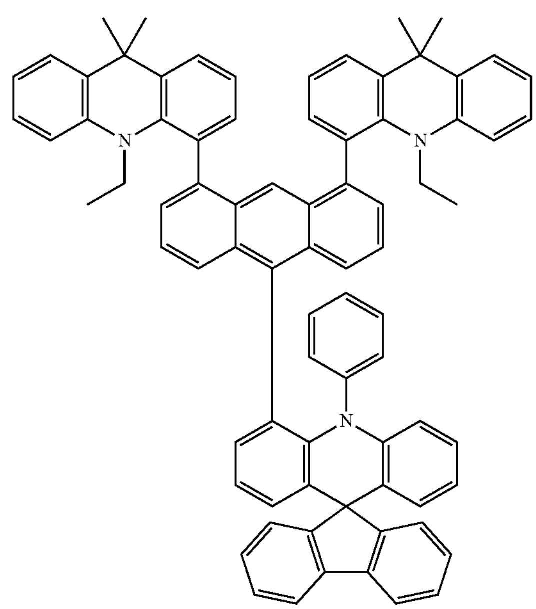

-continued
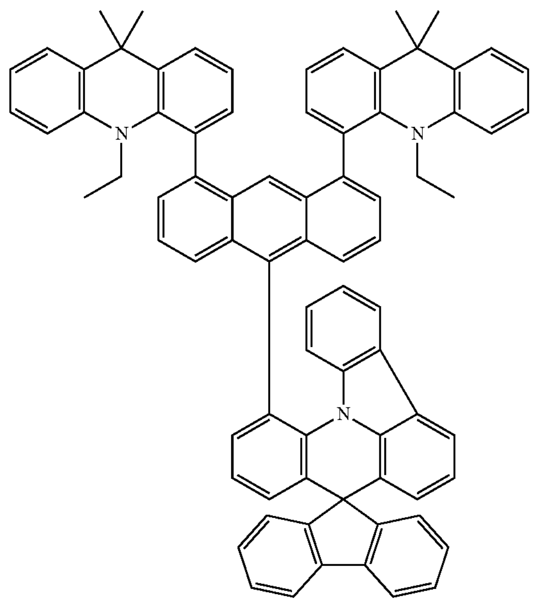
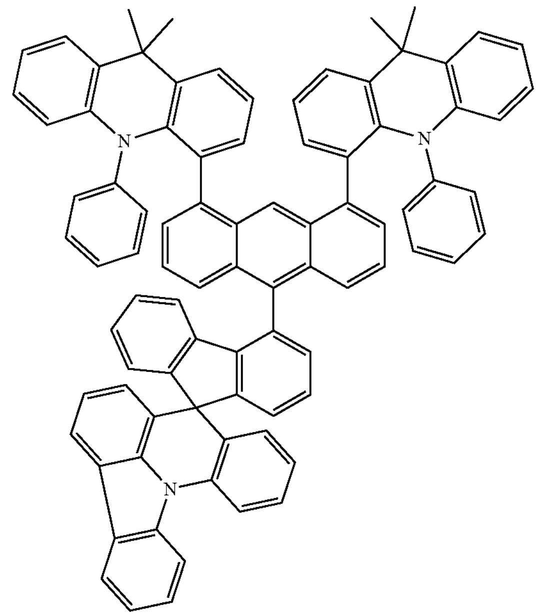
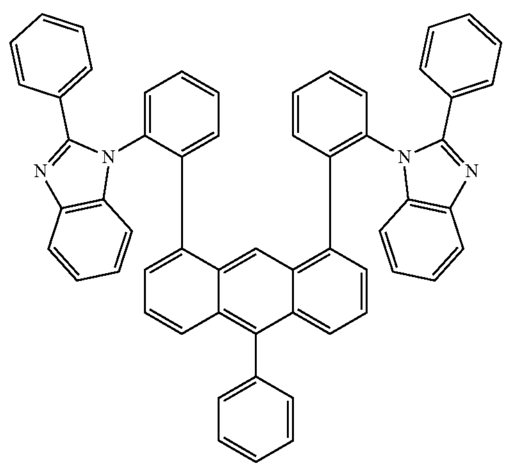
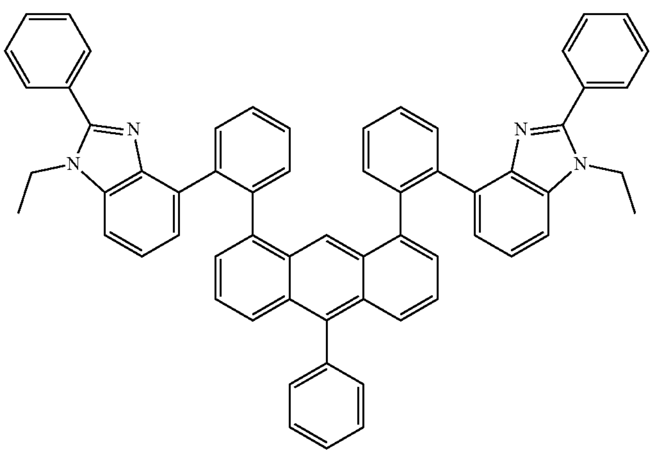
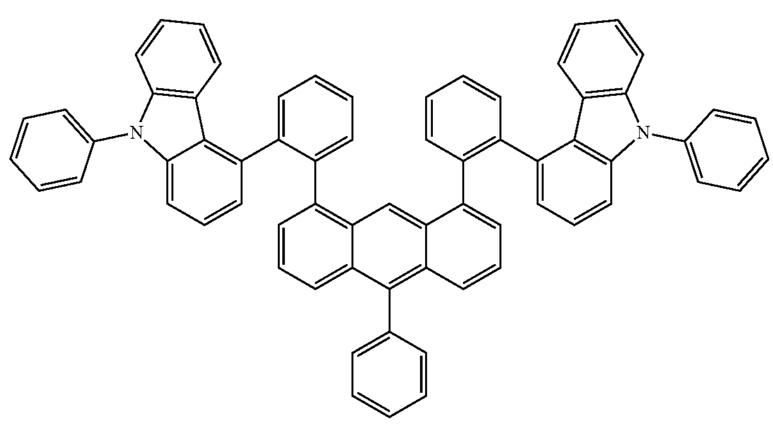

-continued
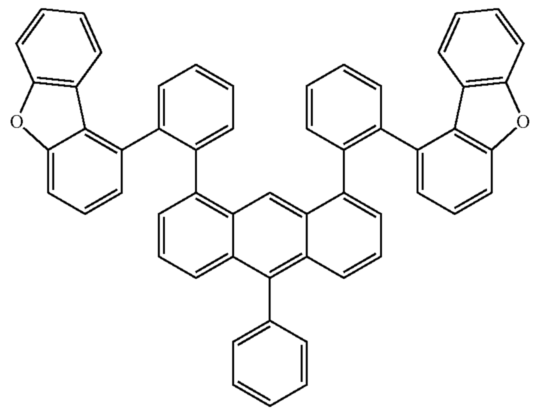
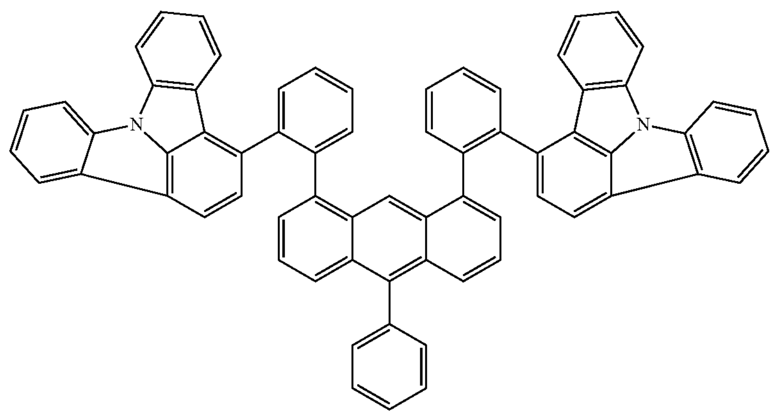
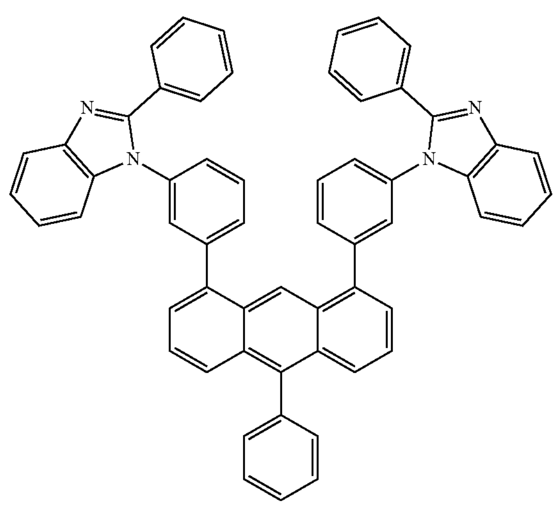
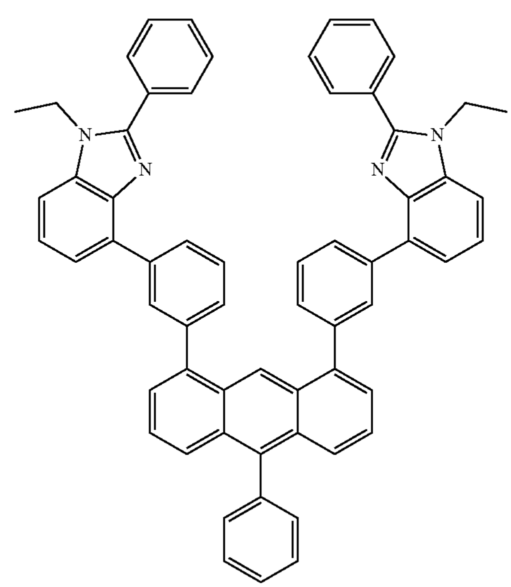

-continued
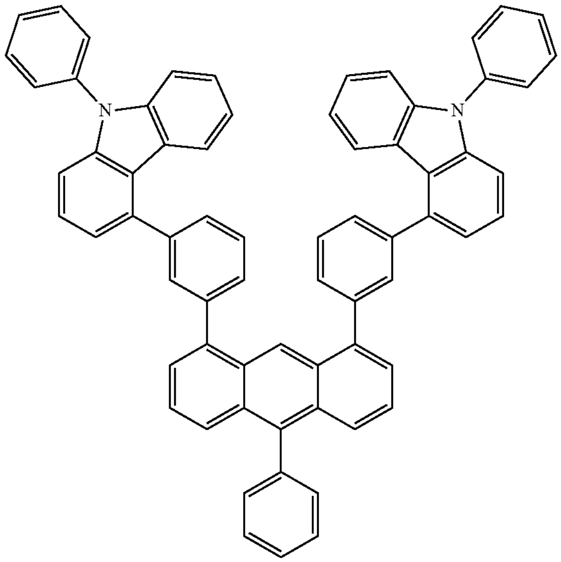
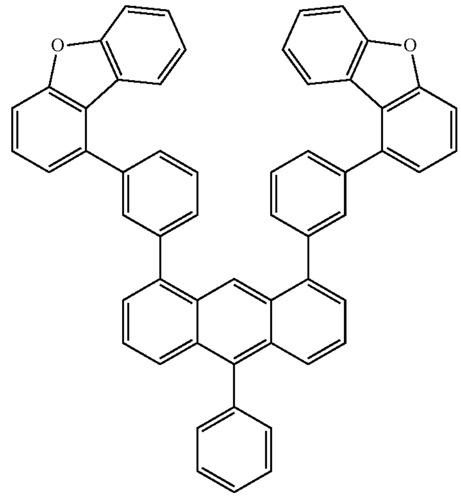
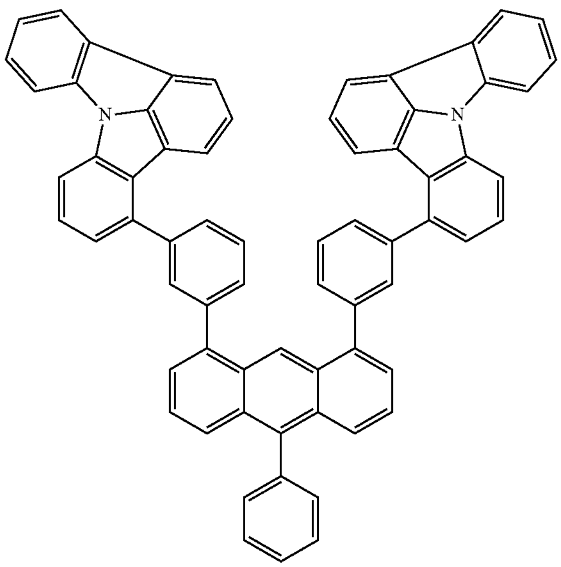
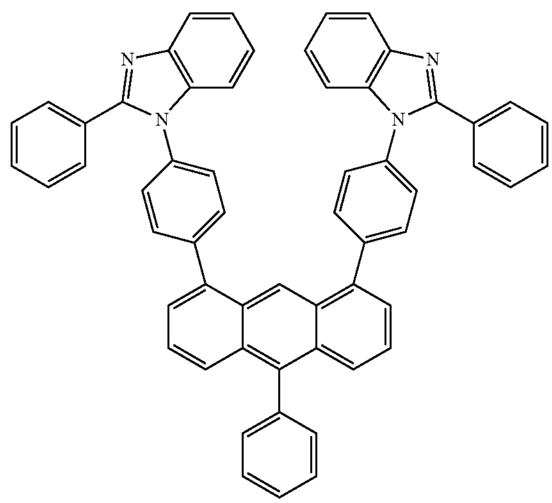
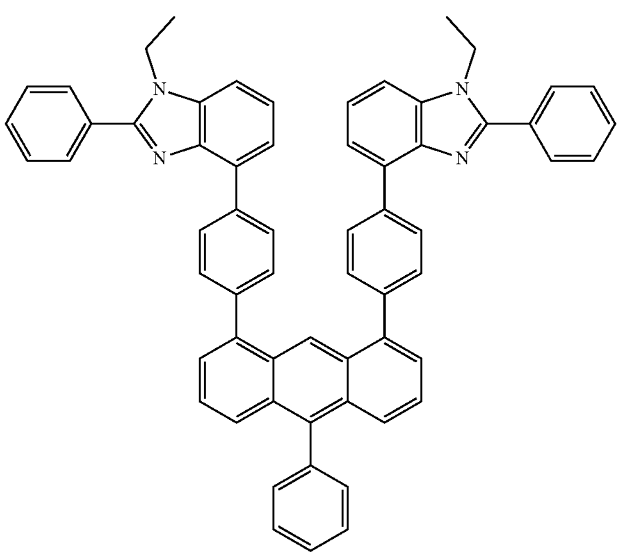
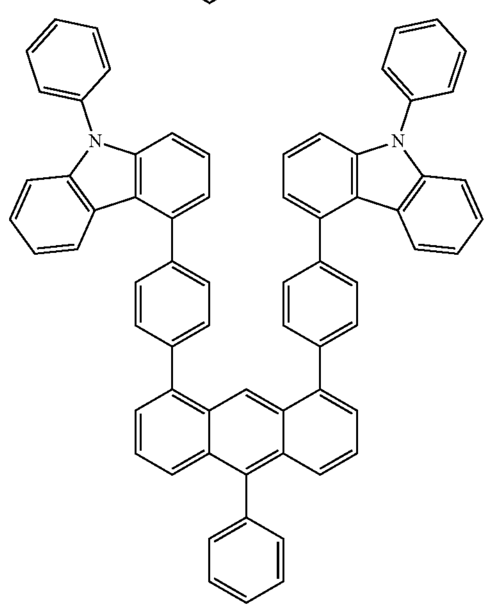

-continued
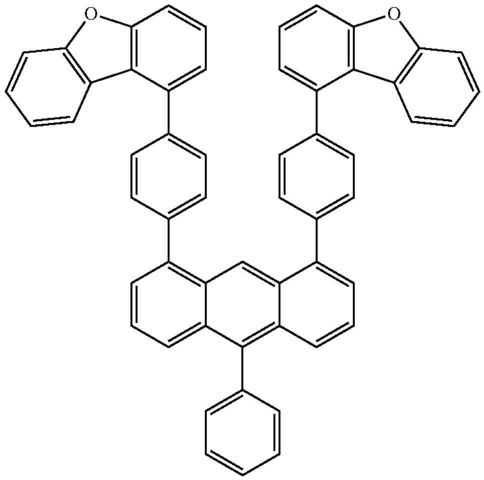
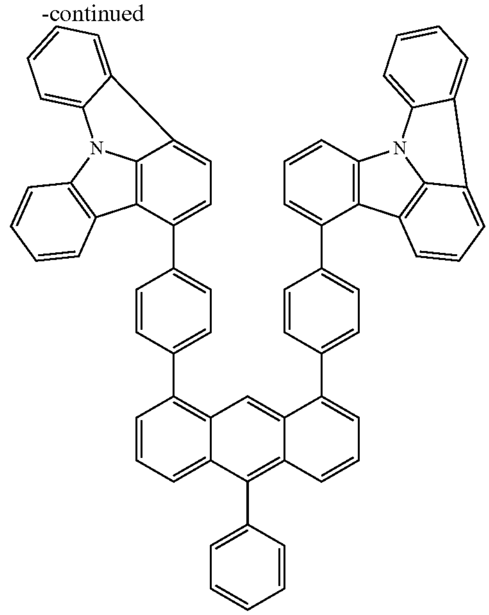
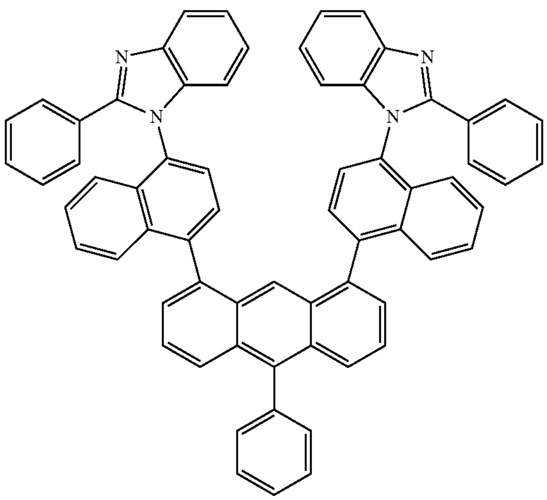
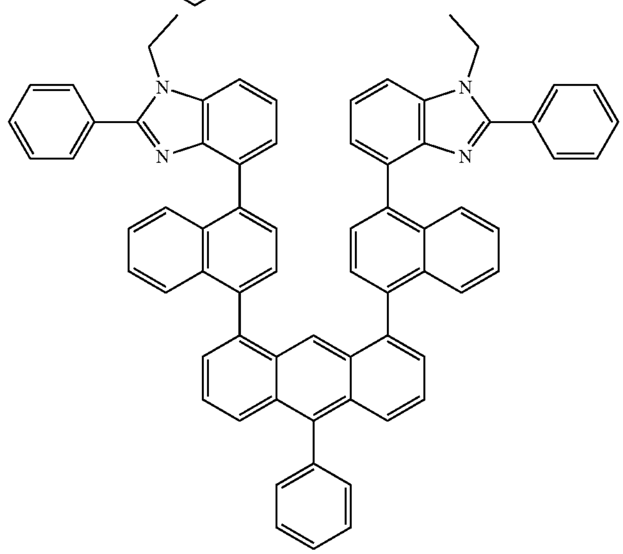
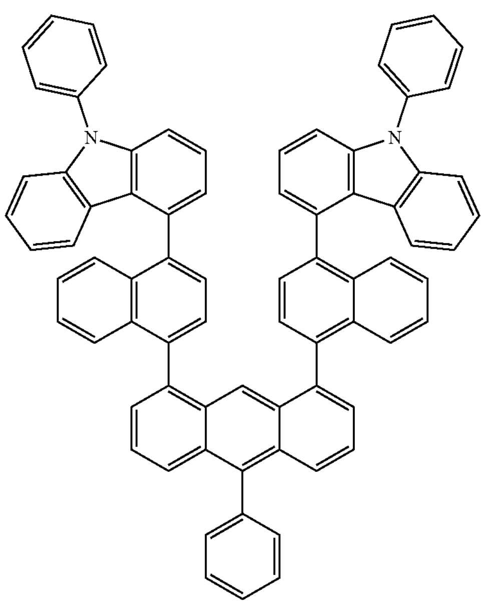
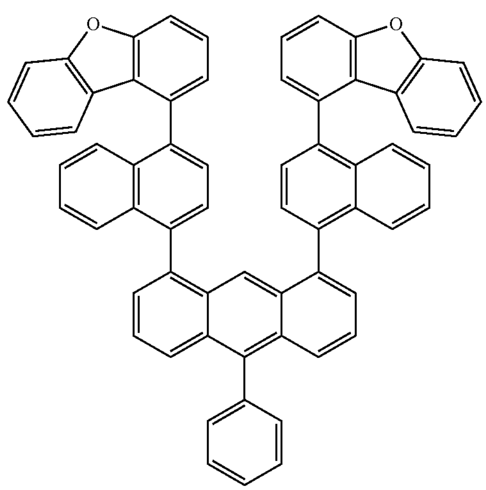

-continued
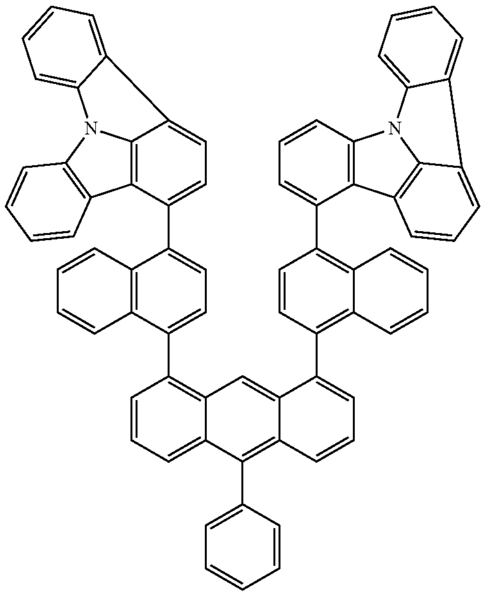
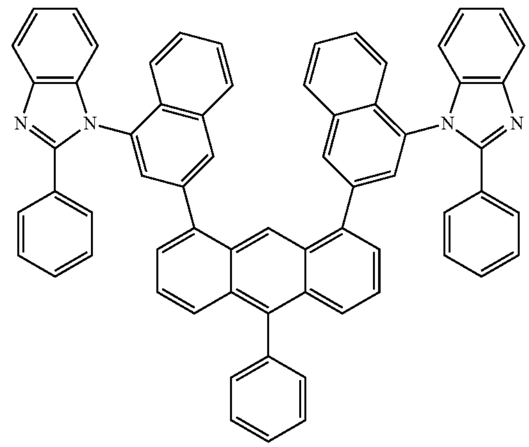
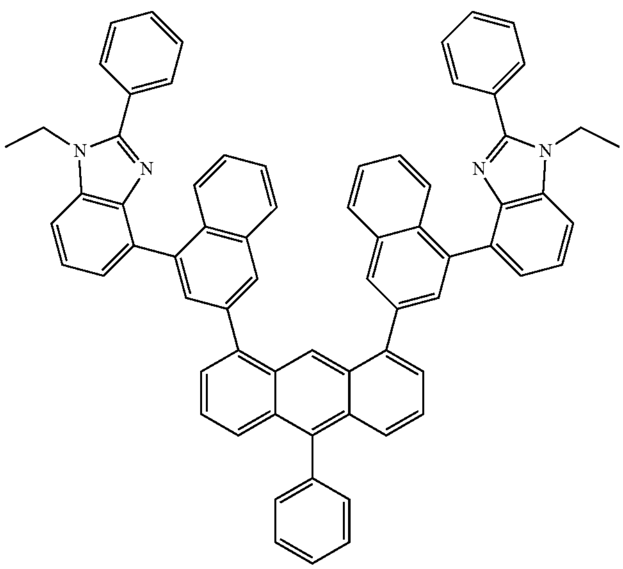
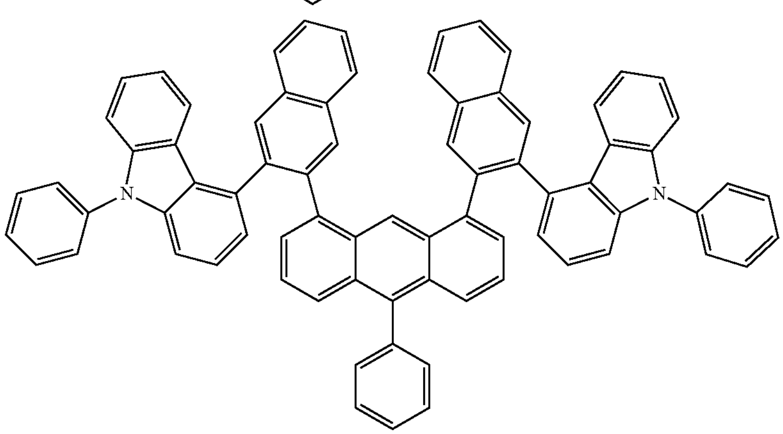

-continued
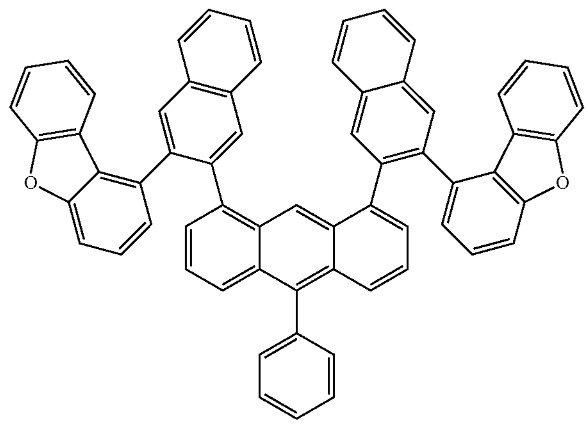
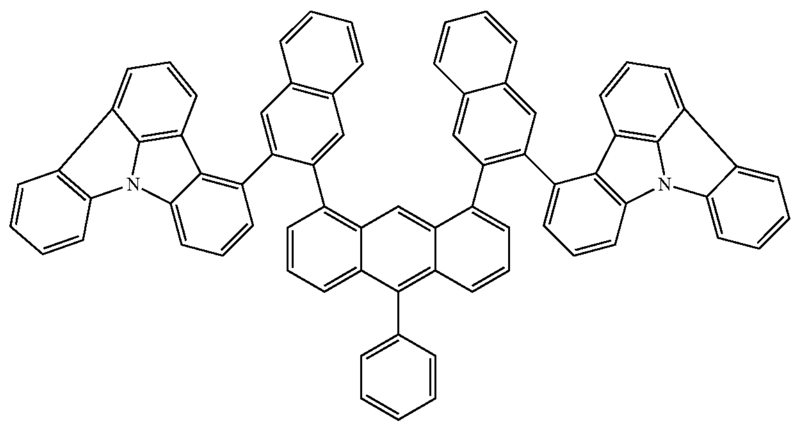
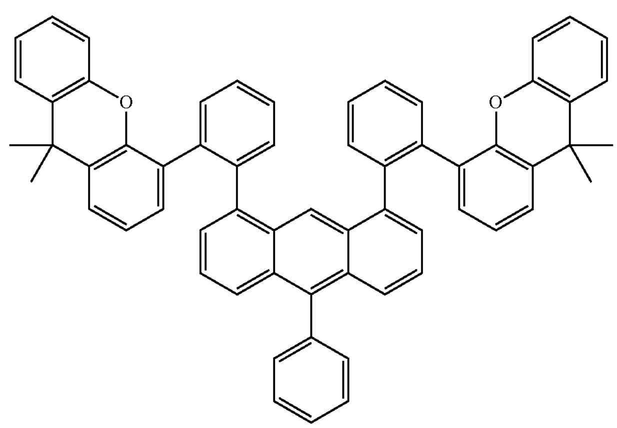
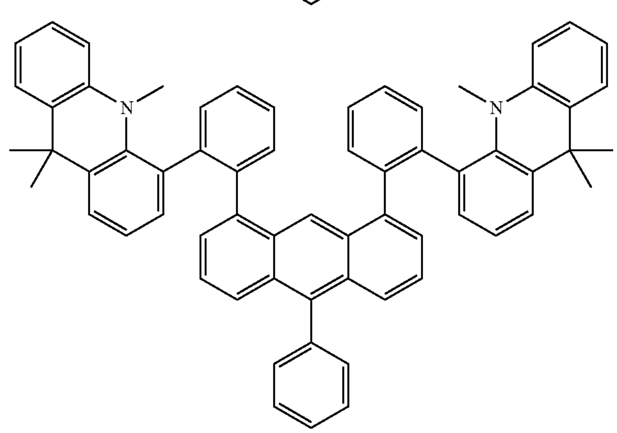

-continued
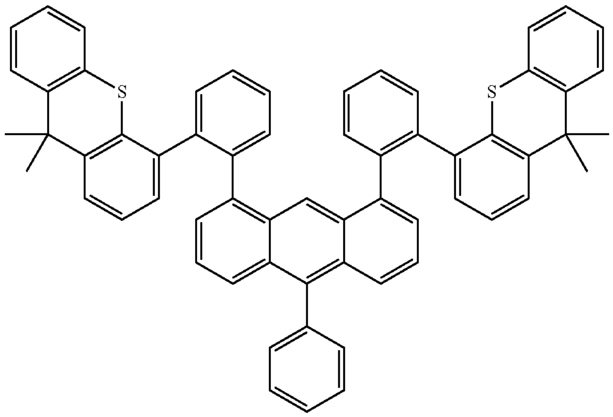
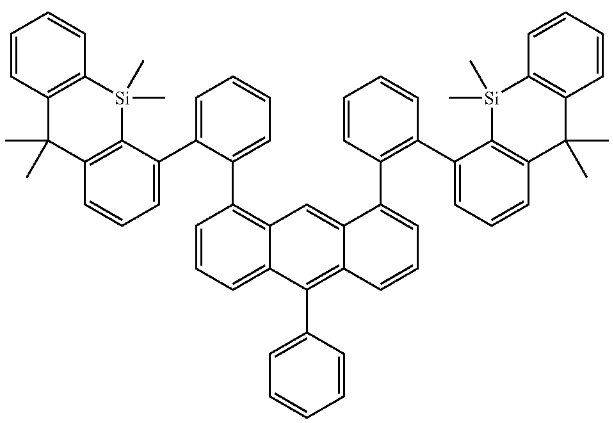
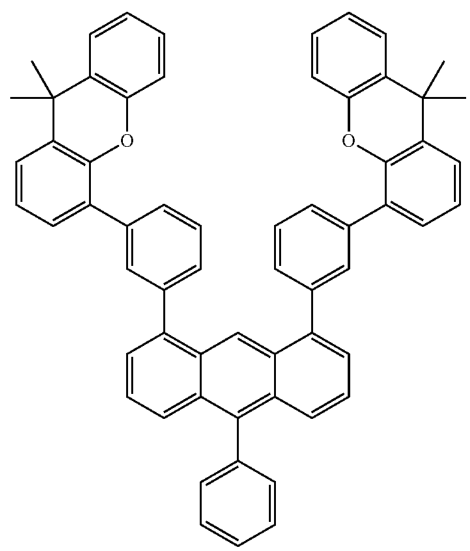
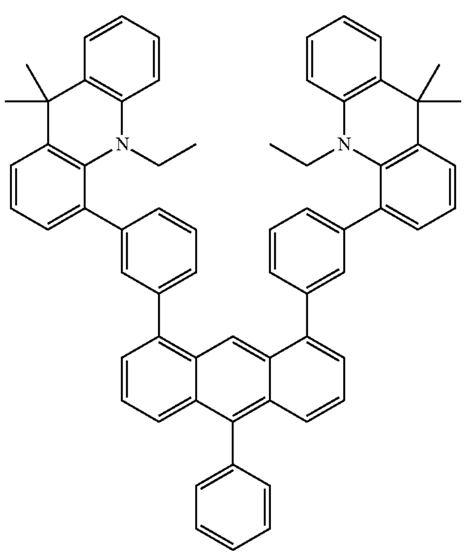
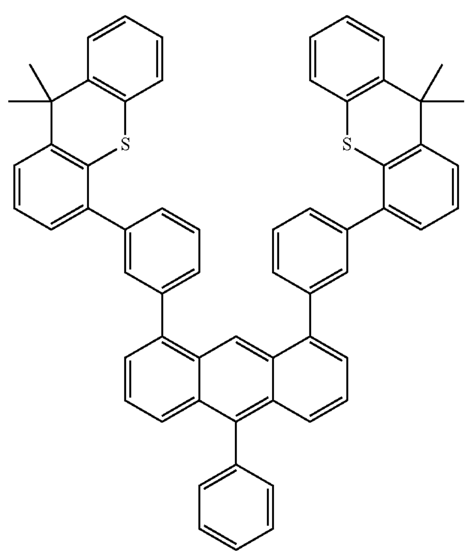

-continued
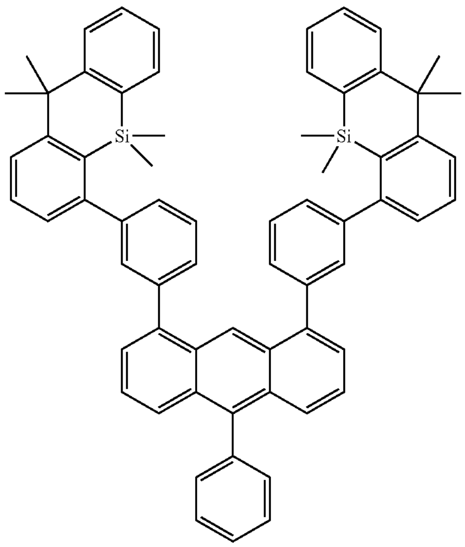
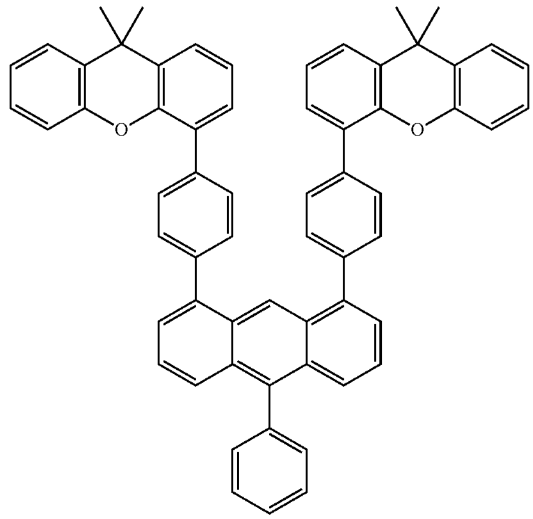
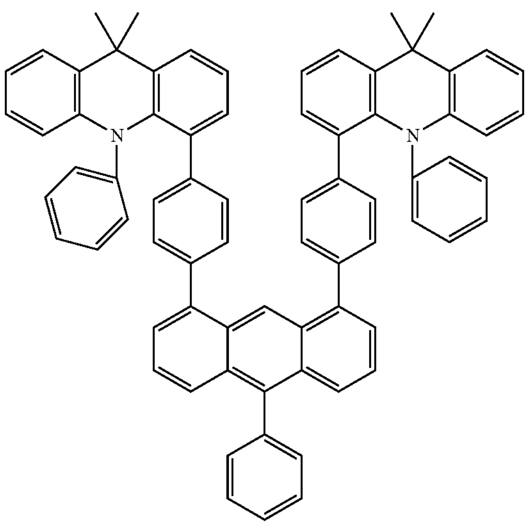
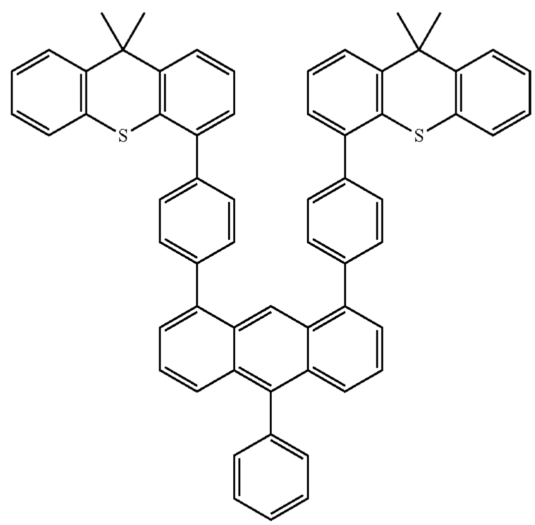
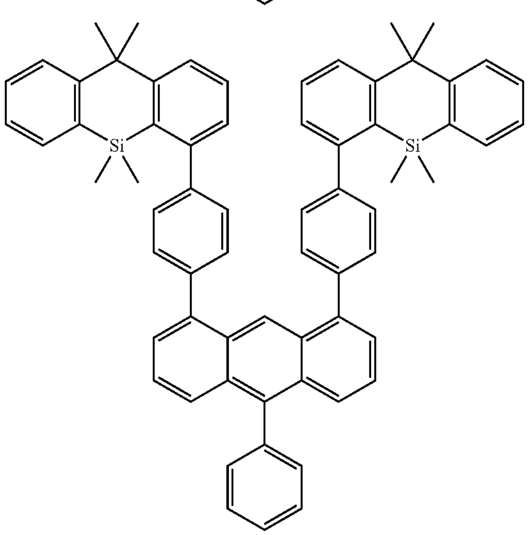
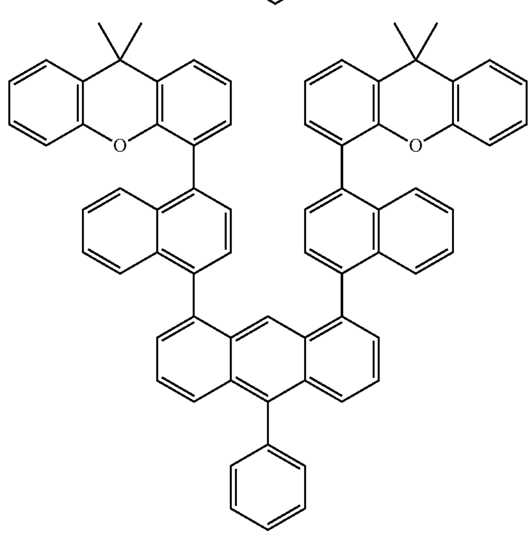

-continued
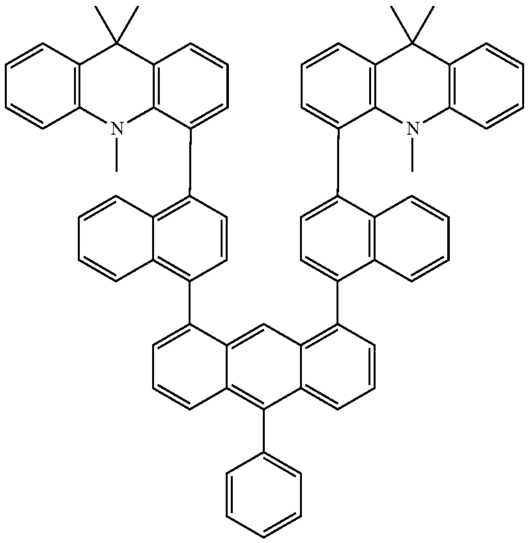
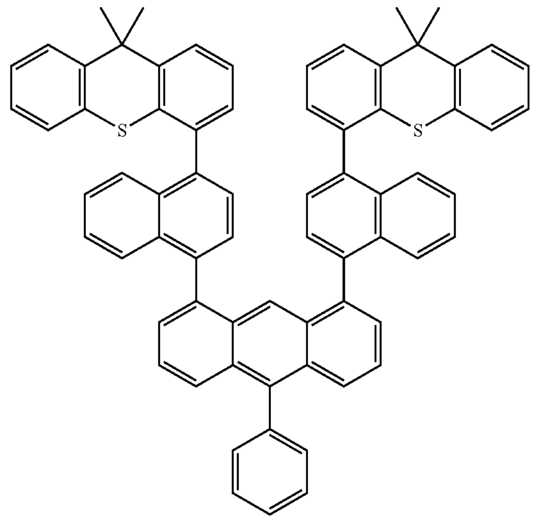
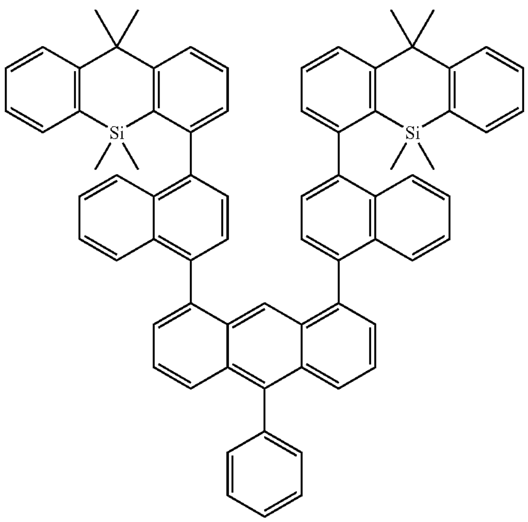
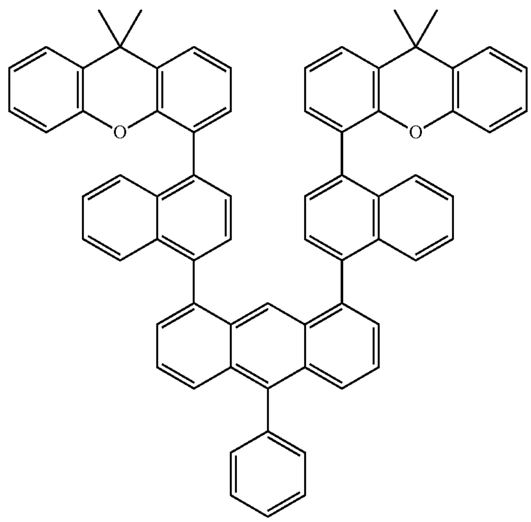
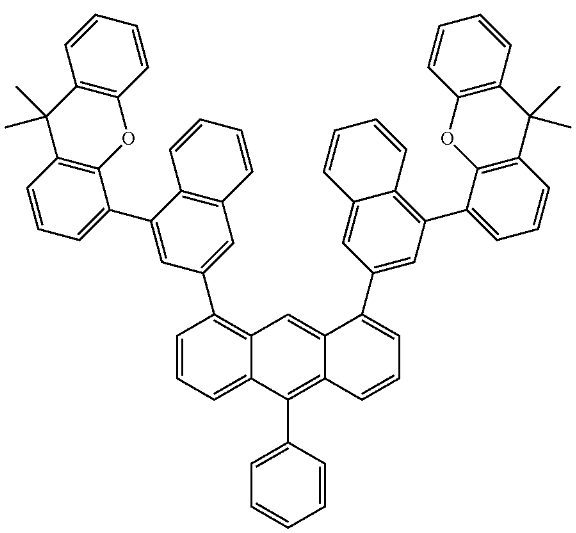

-continued
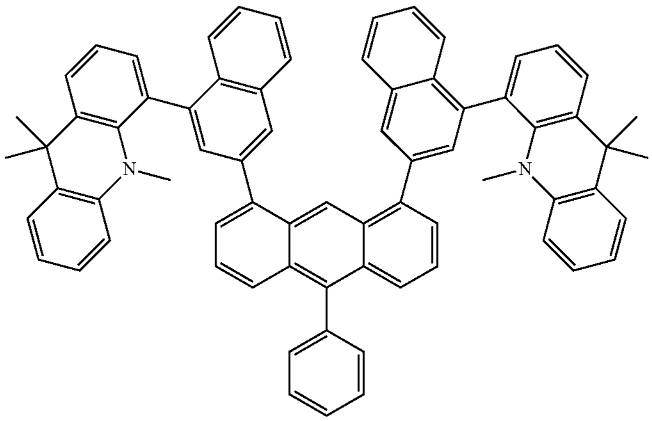
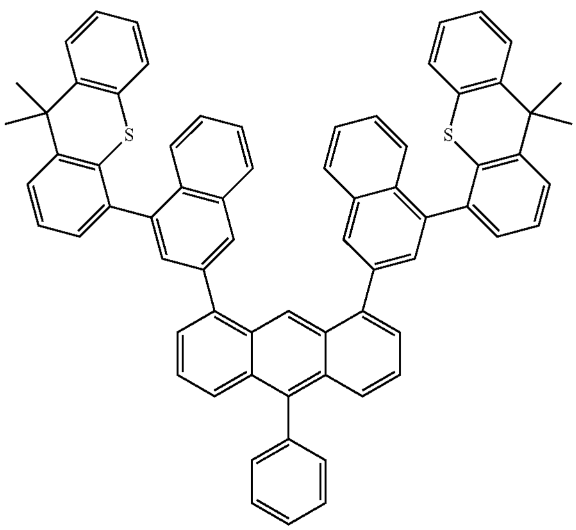
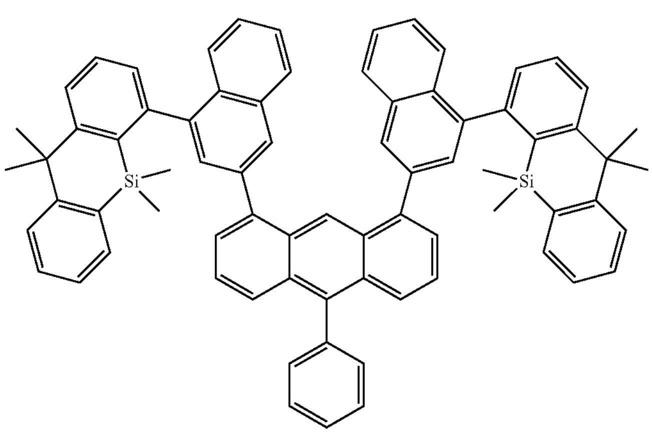

-continued
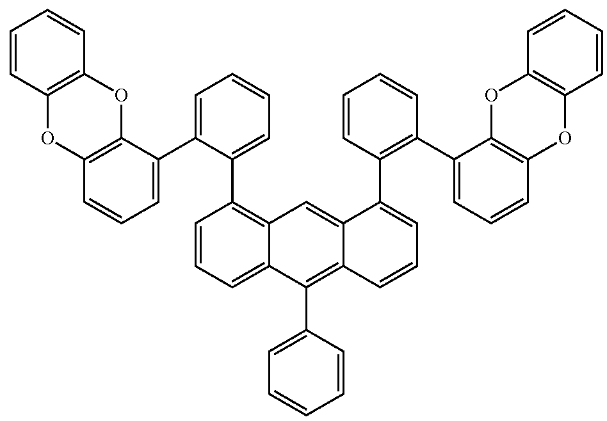
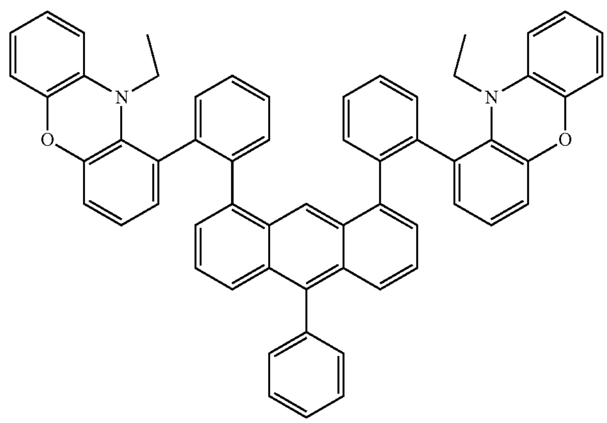
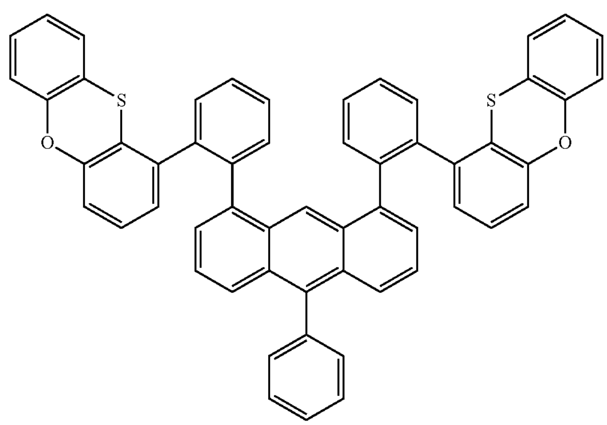
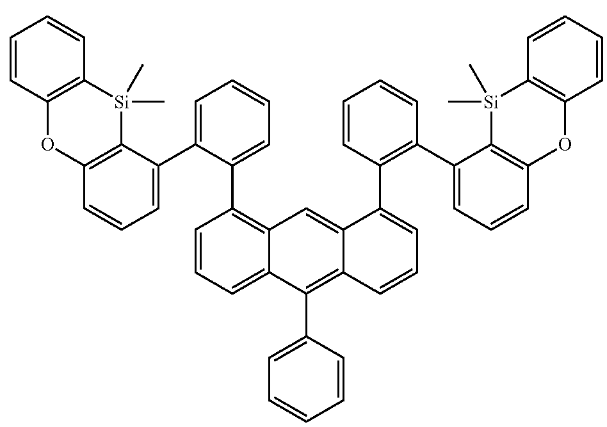

-continued
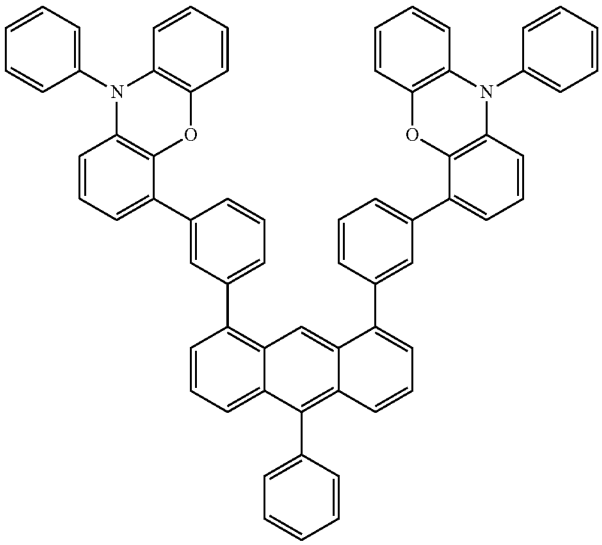
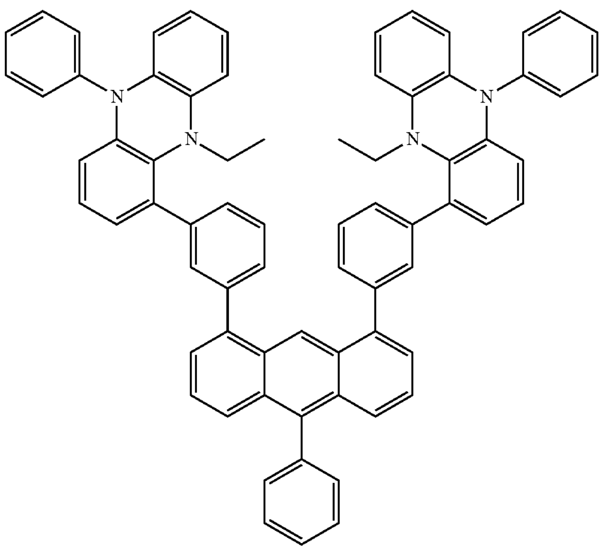
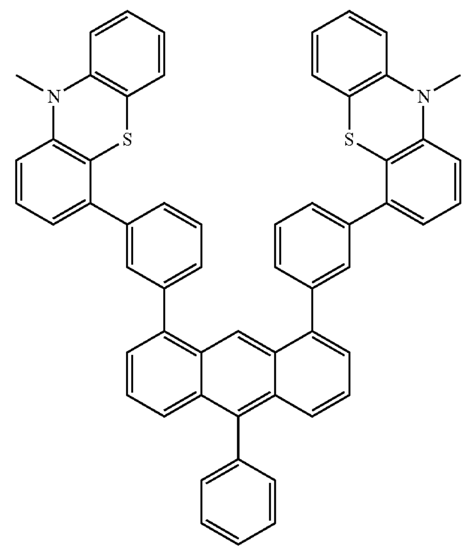
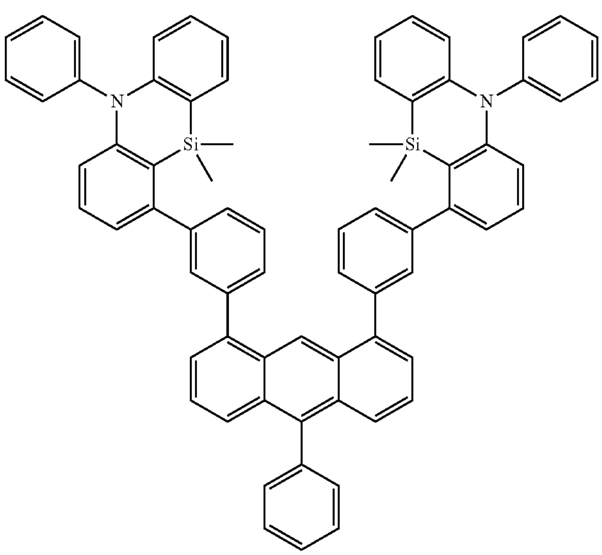
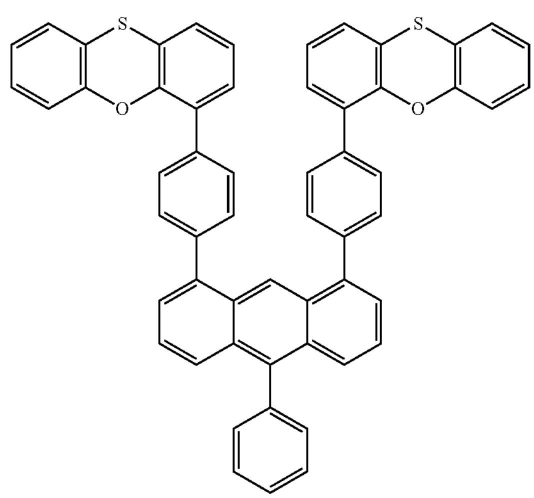

-continued
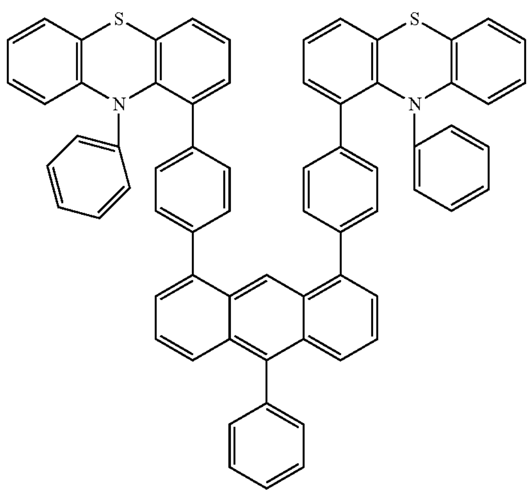
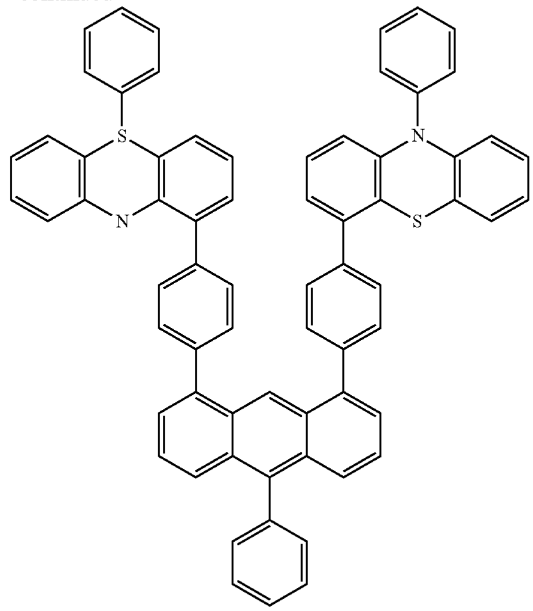
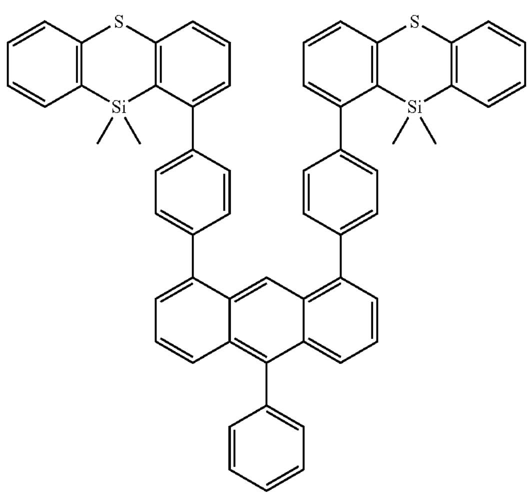
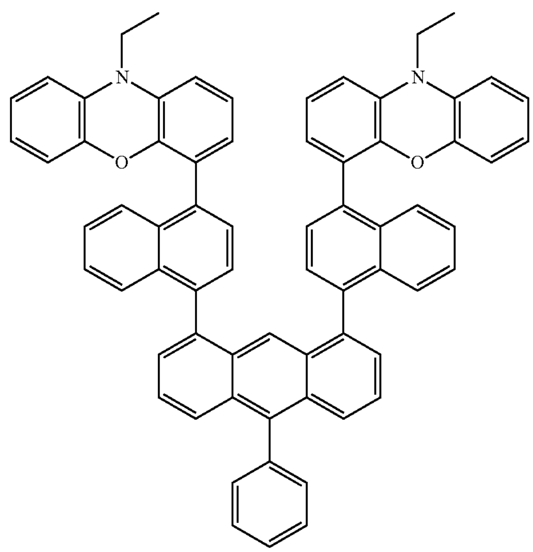
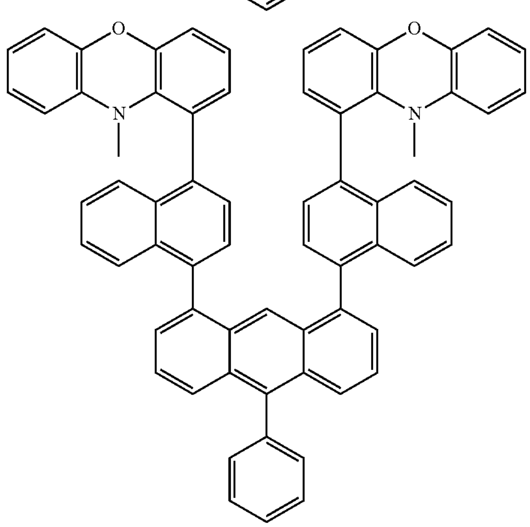
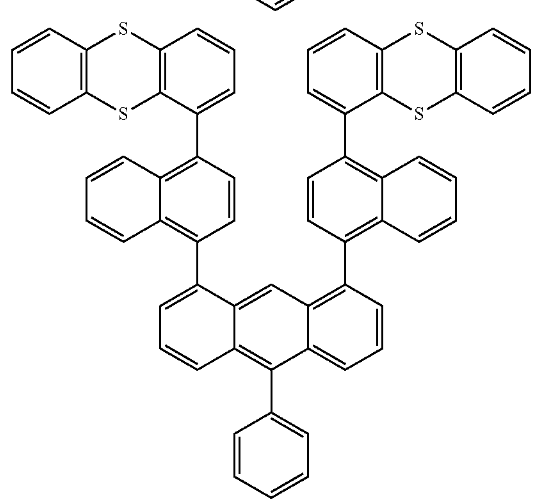

-continued
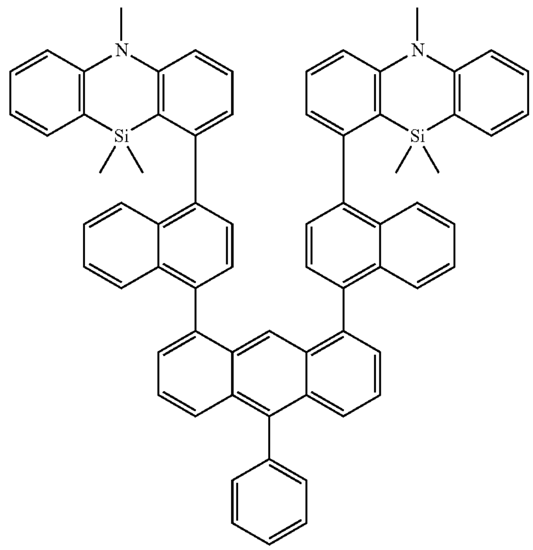
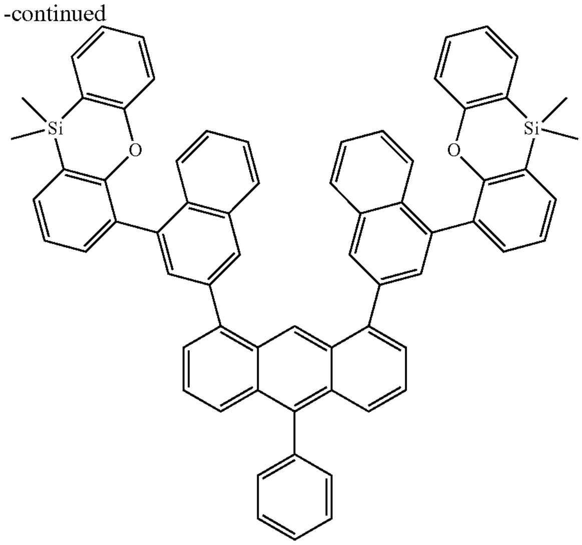
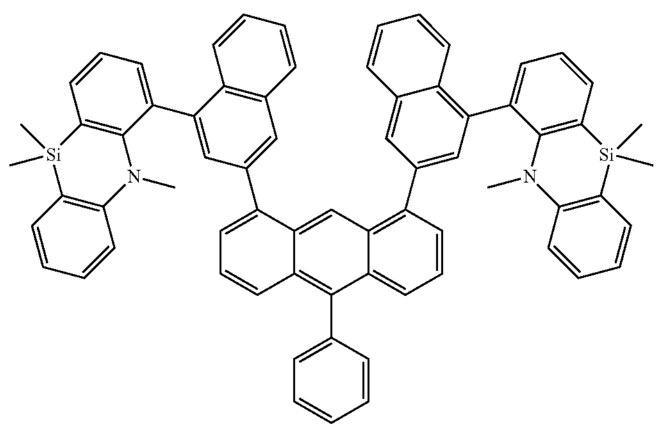
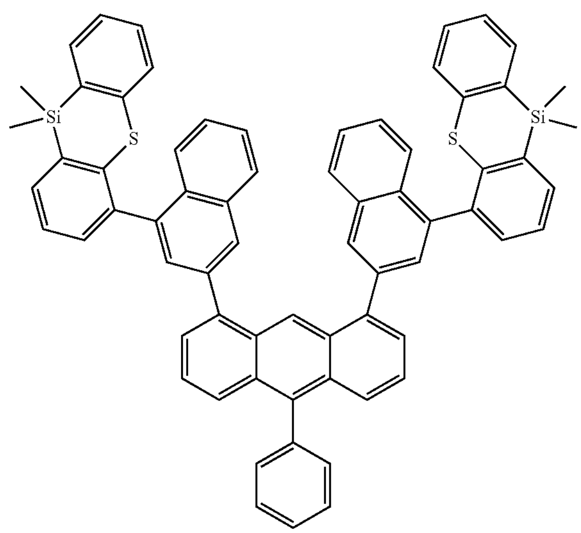

-continued
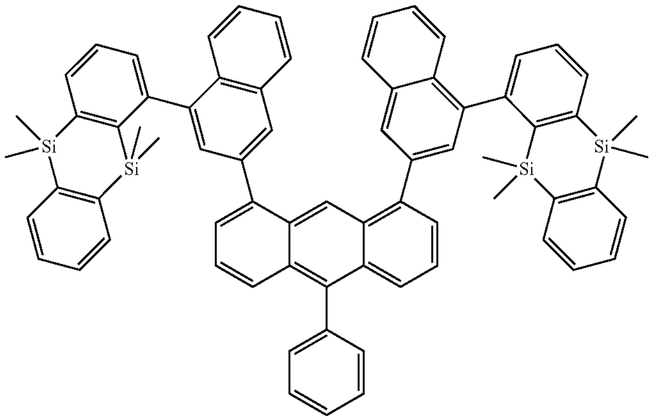
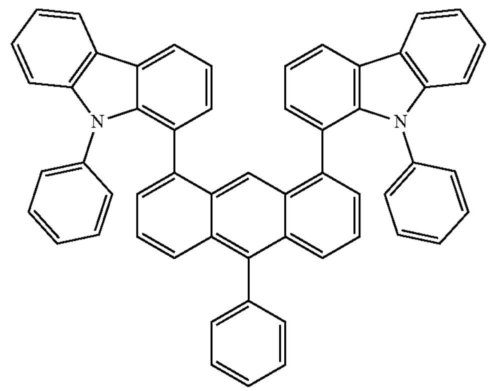
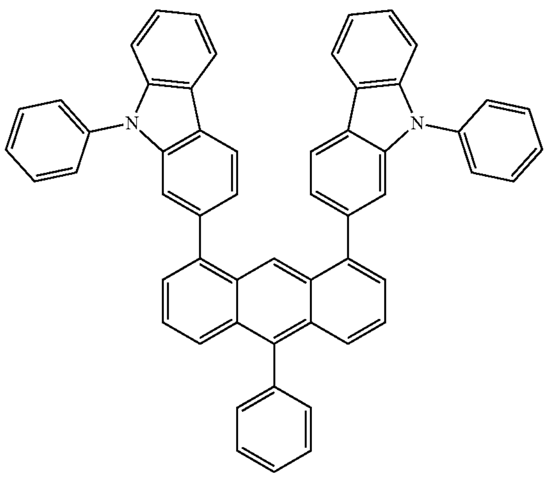
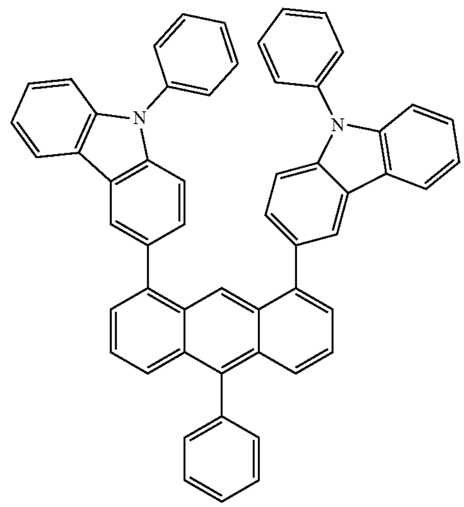
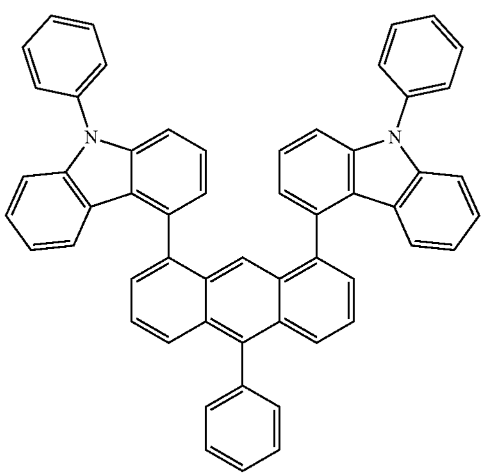
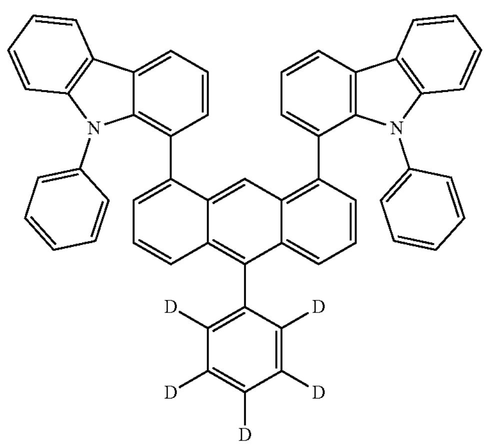

-continued
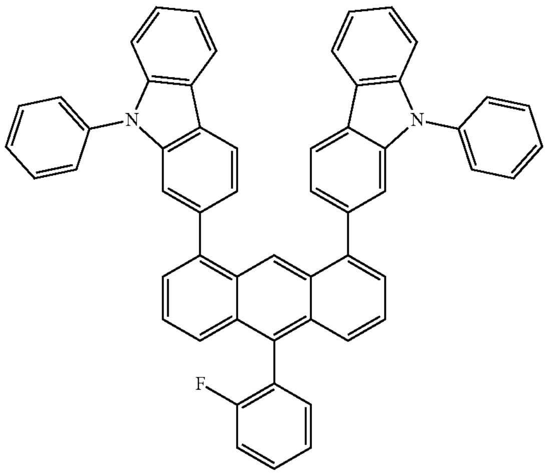
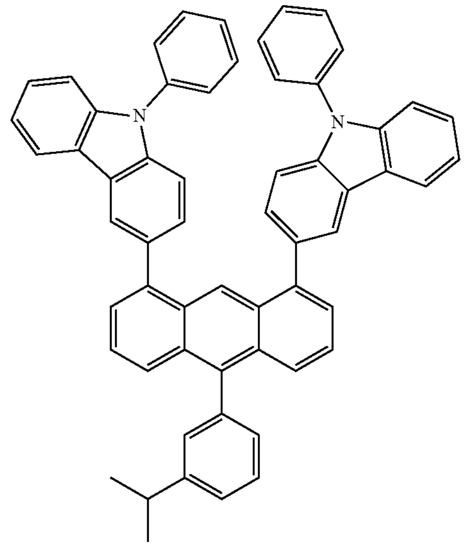
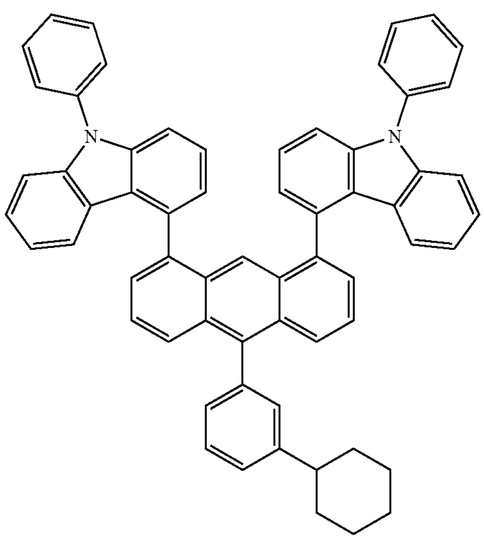
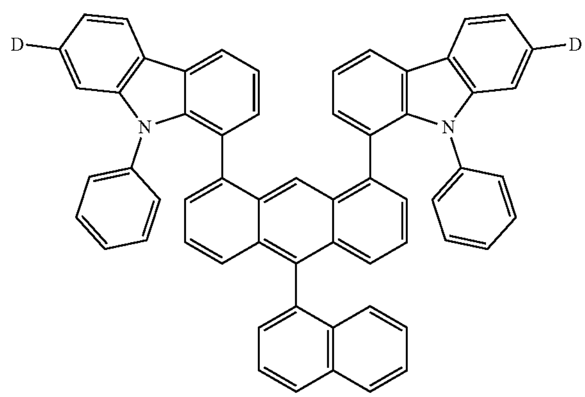
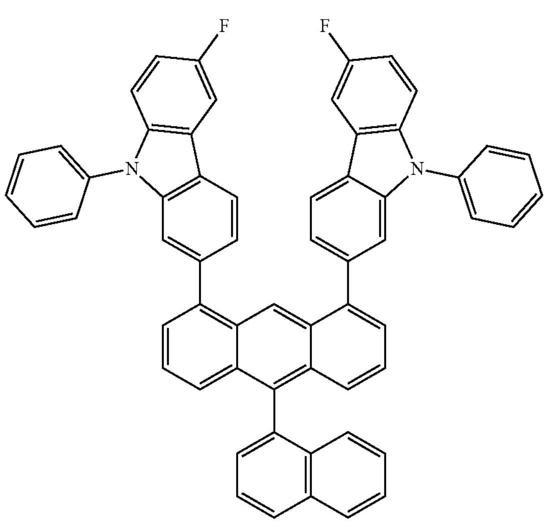
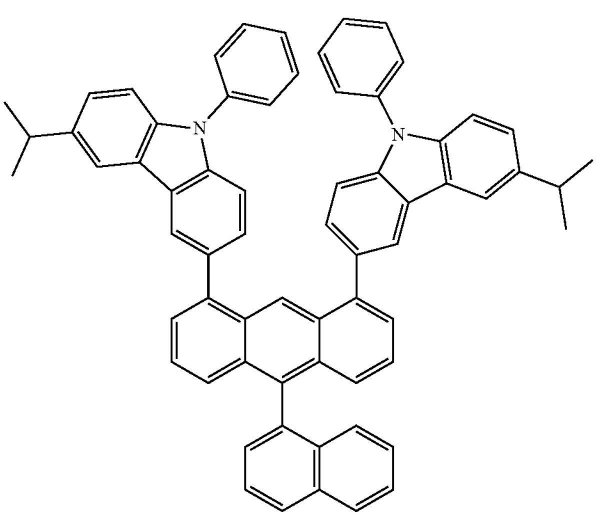

-continued
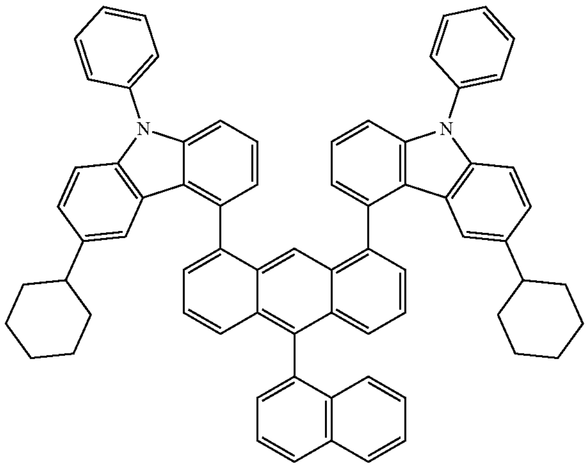
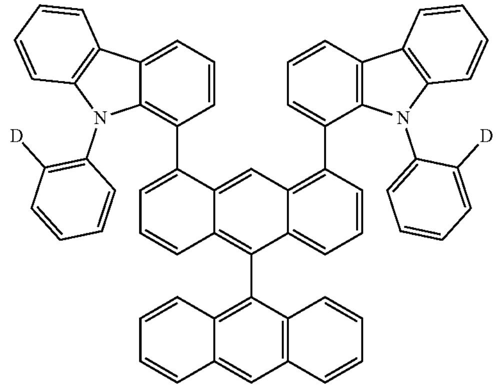
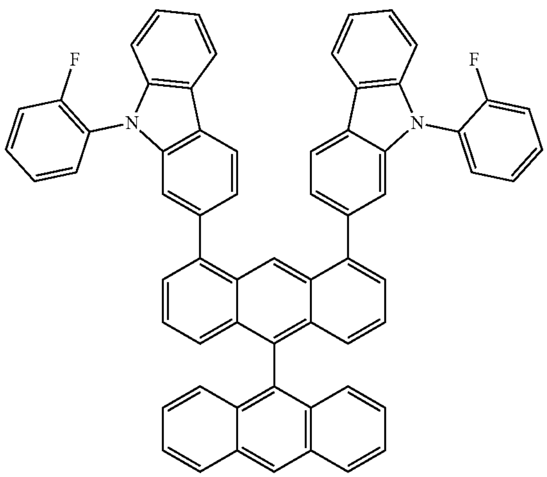
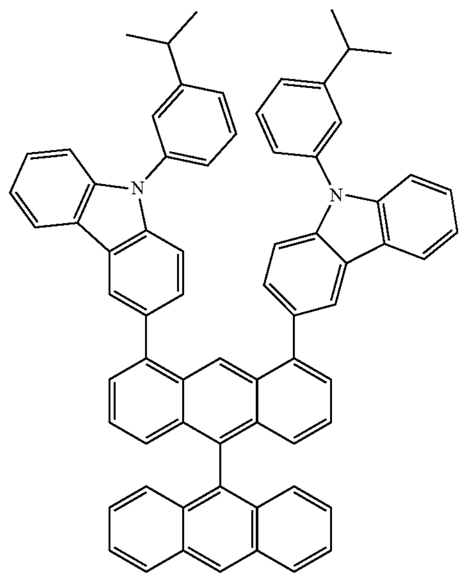
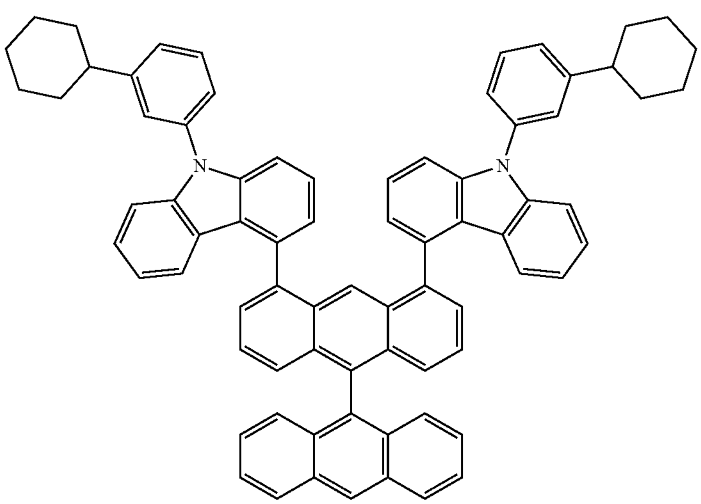
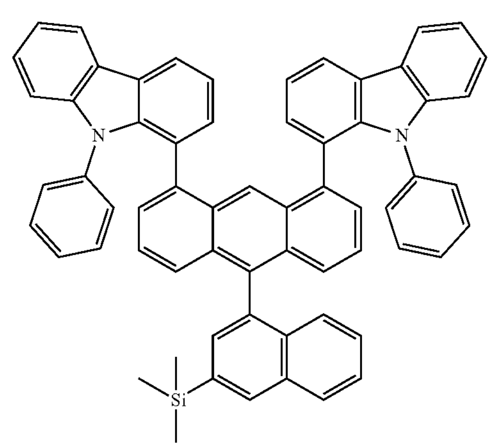

-continued
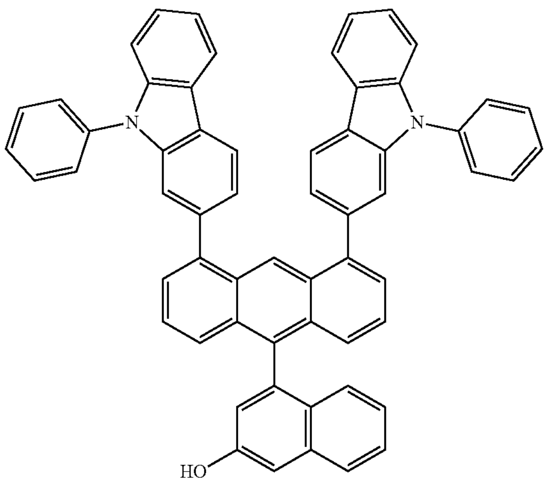
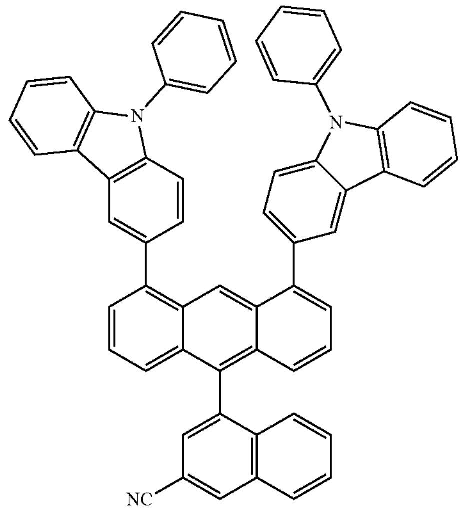
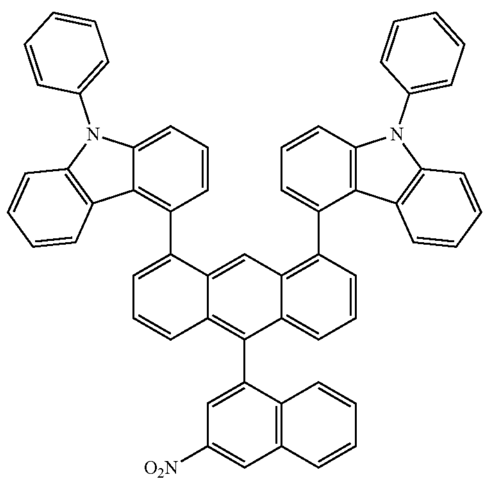
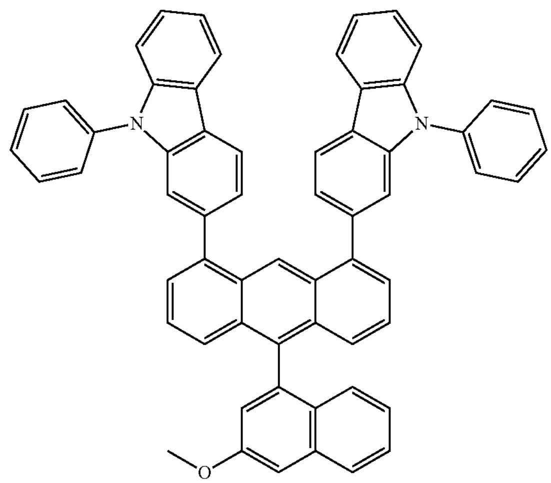
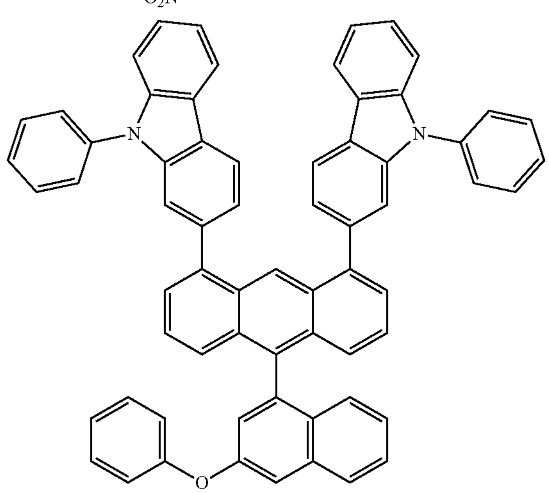
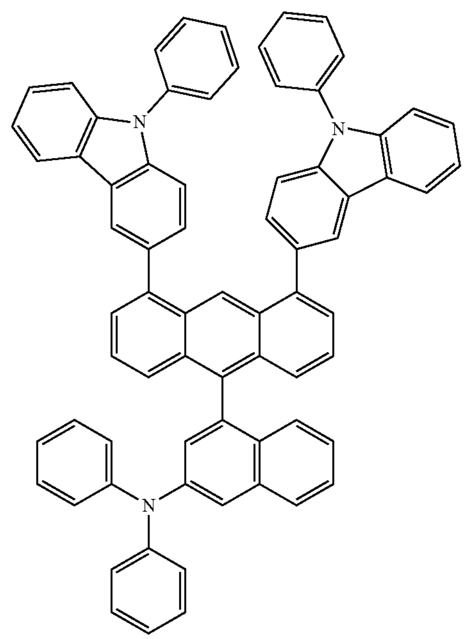

-continued
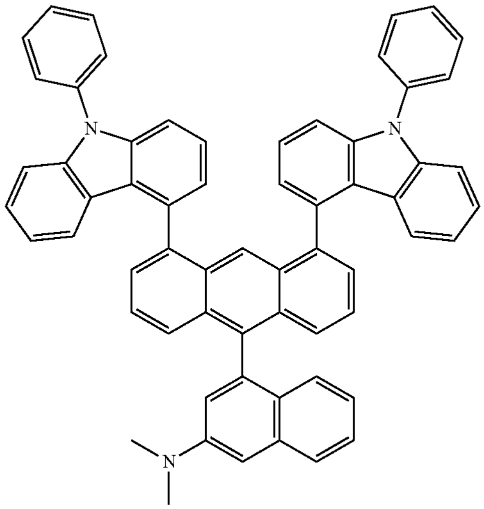
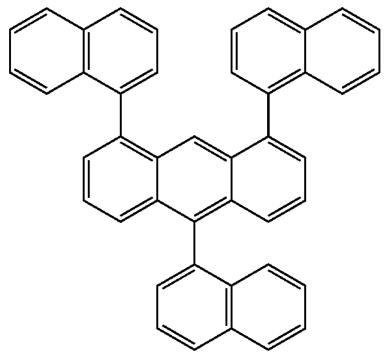
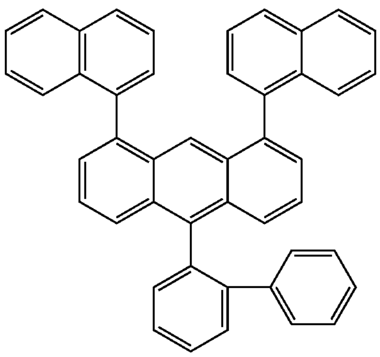
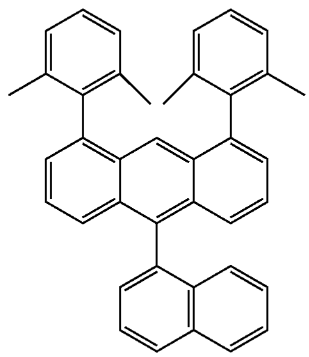
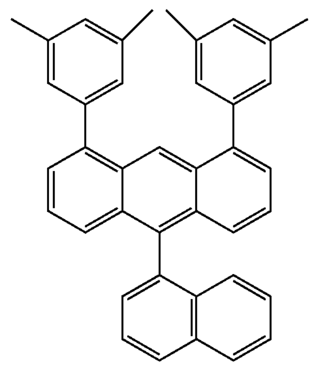
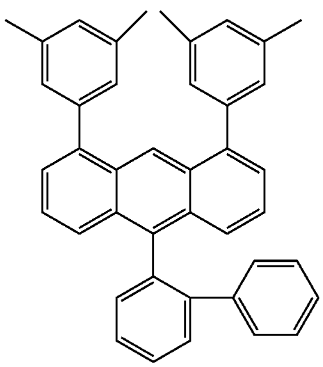
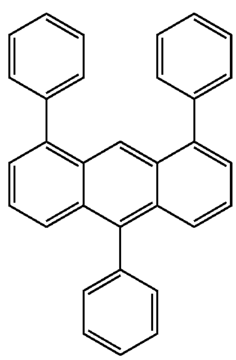
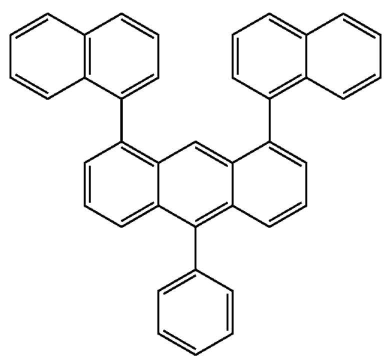
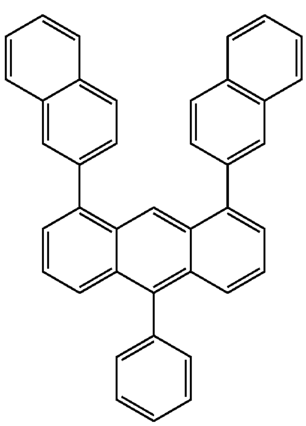
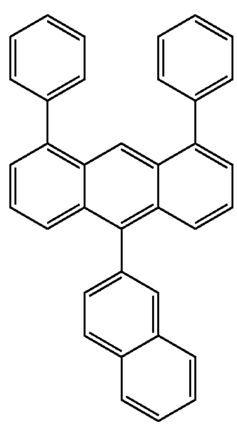
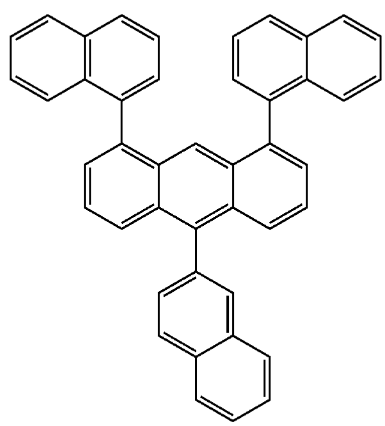

-continued
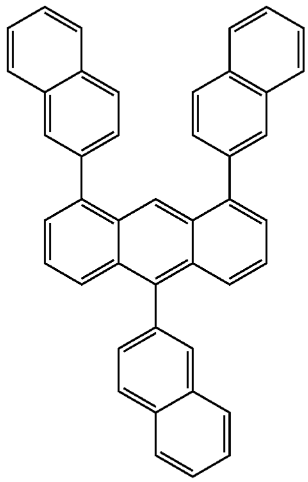
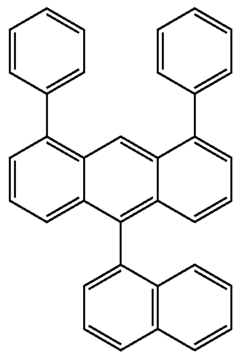
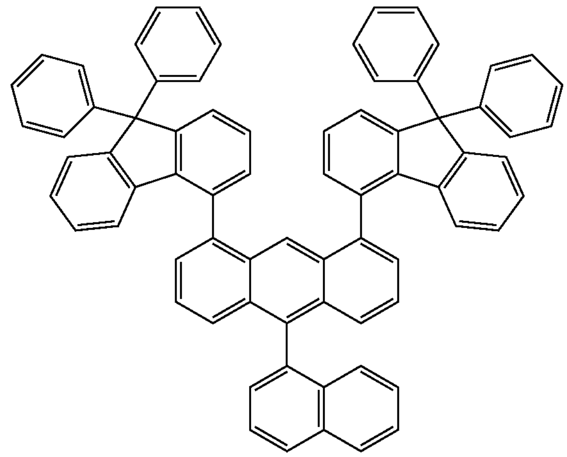
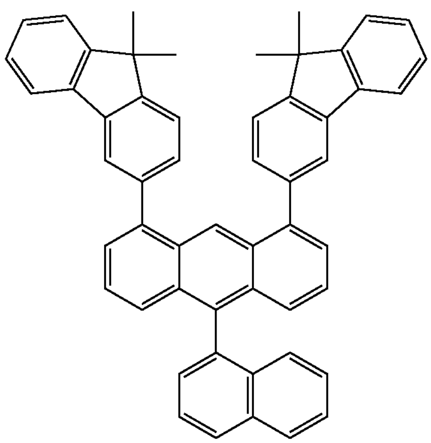
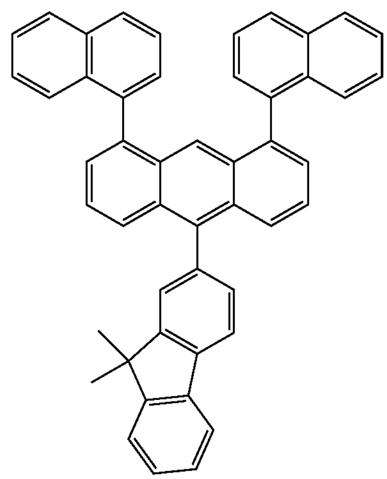
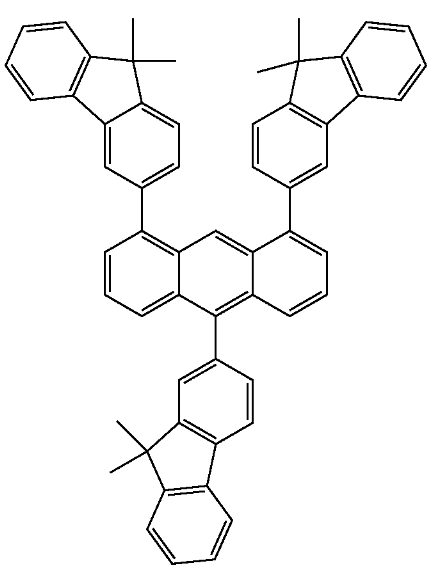
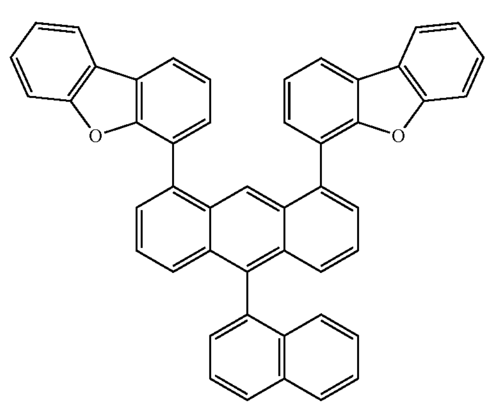

-continued
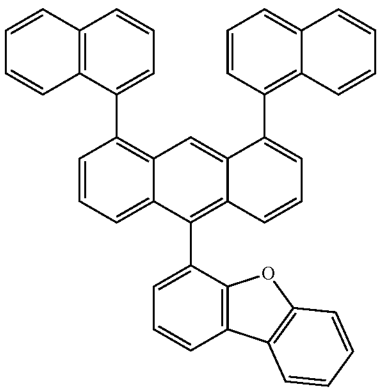
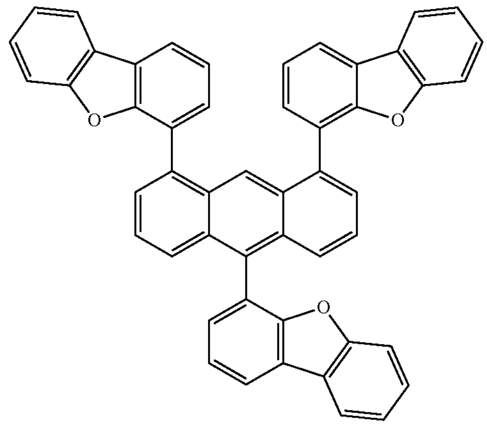
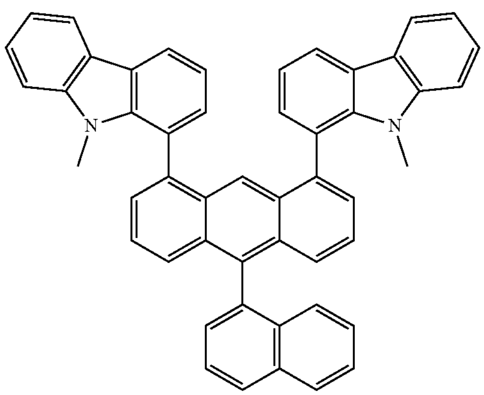
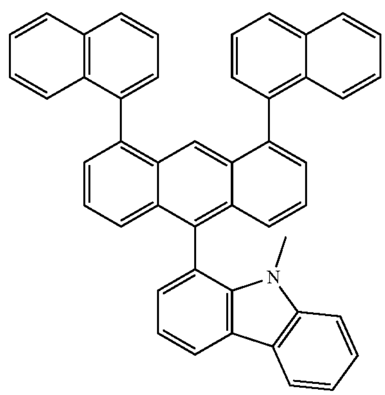
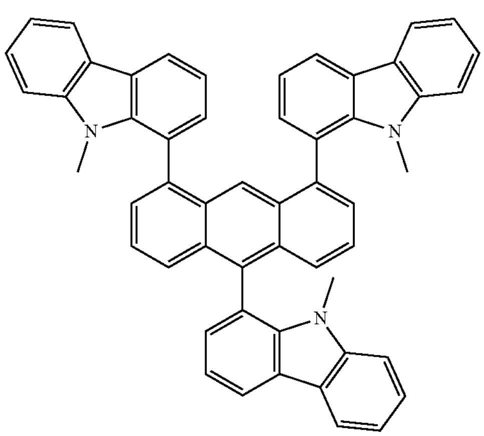
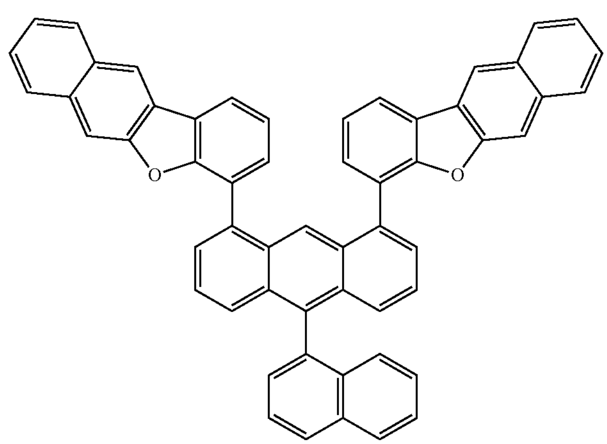

-continued
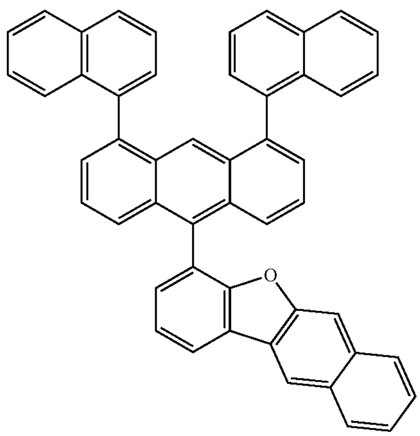
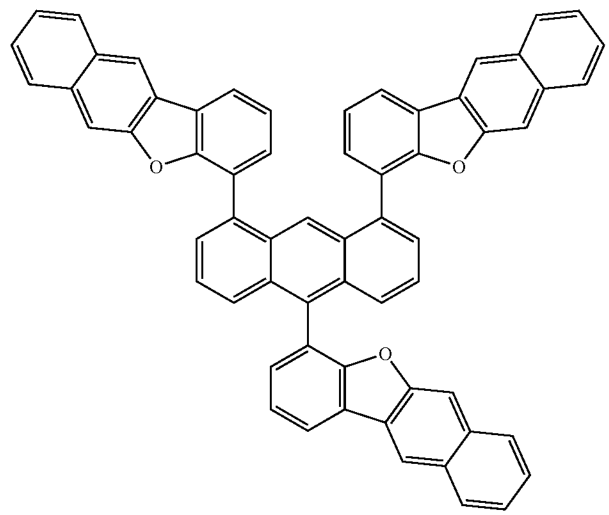
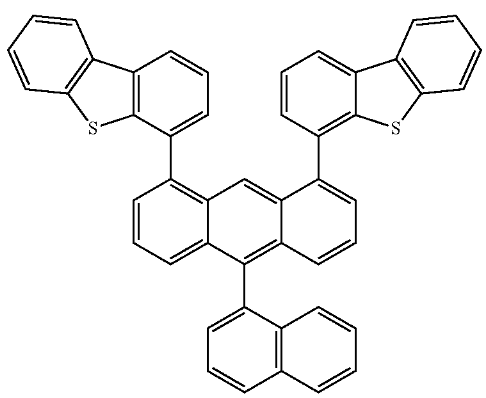
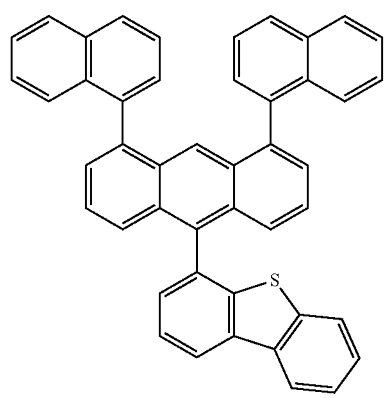
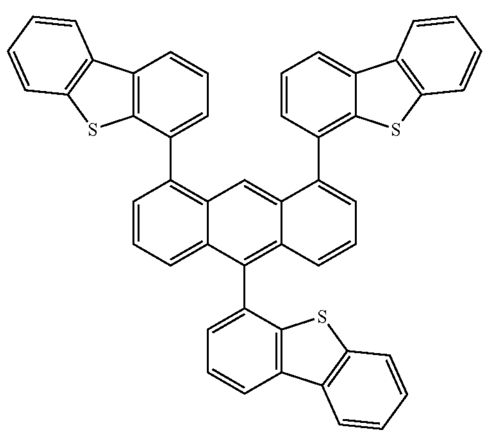
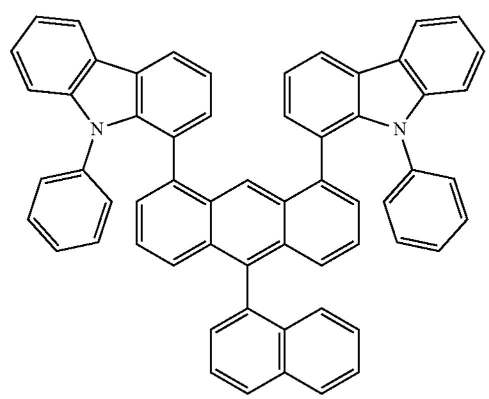

-continued
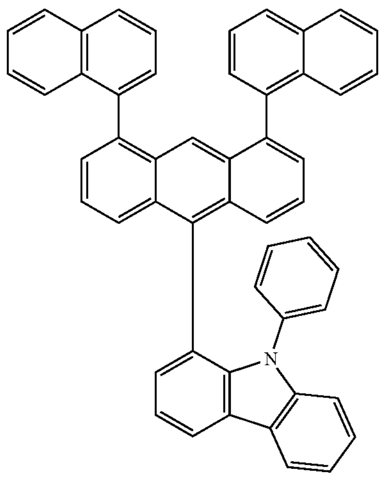
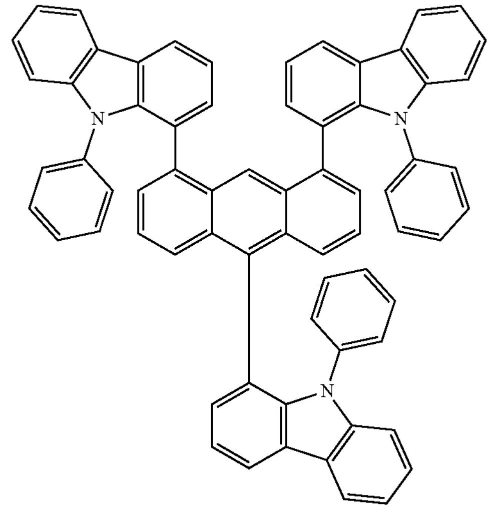
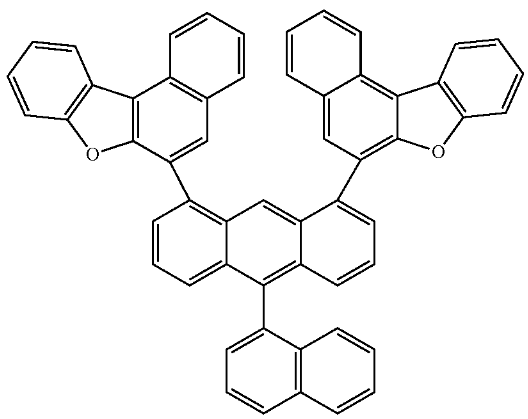
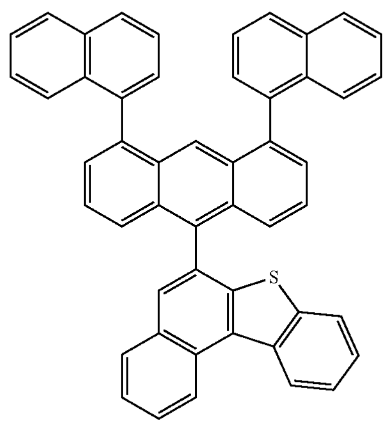
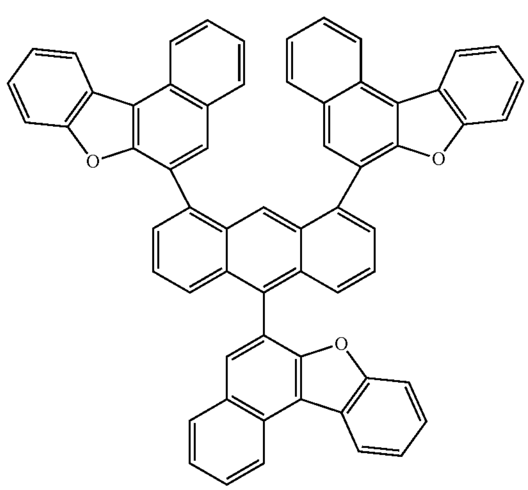
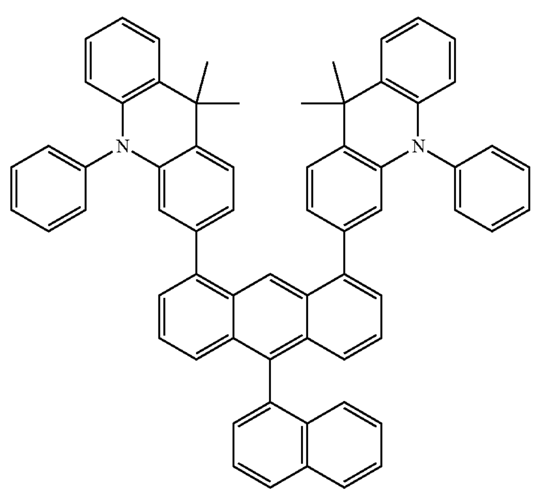

-continued
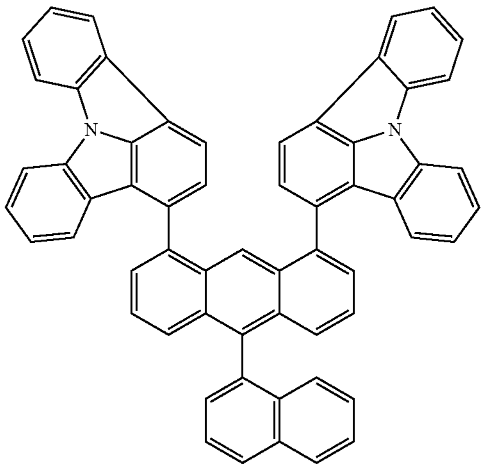
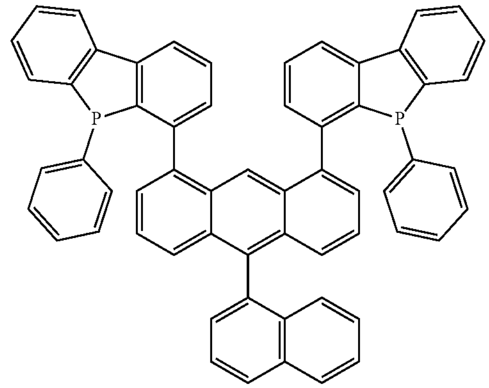
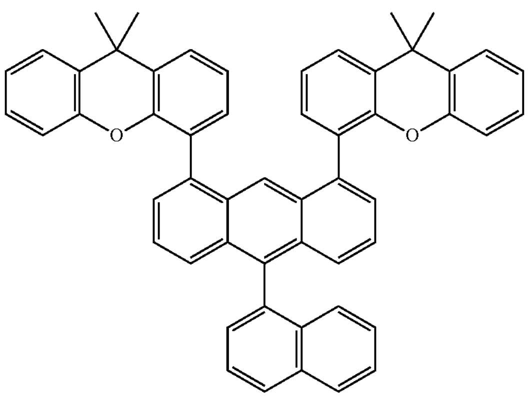
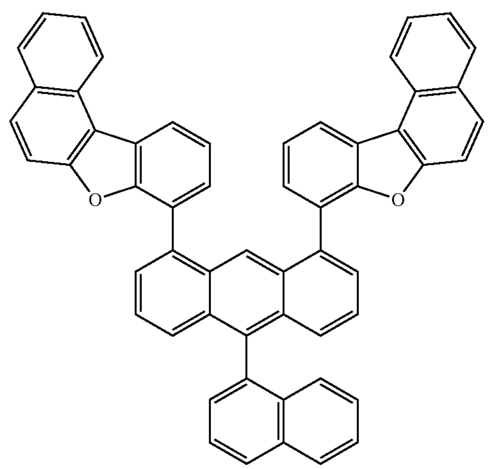
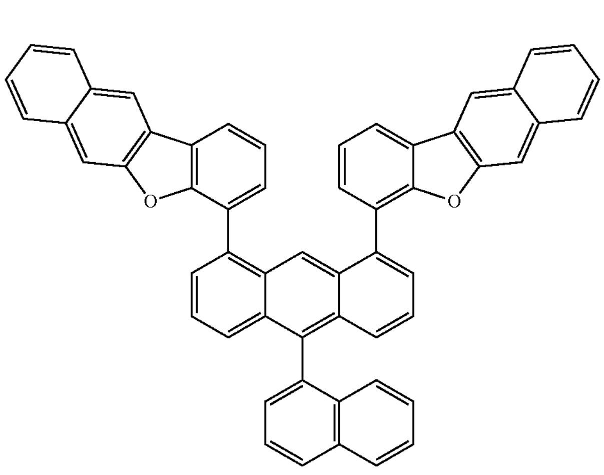

-continued
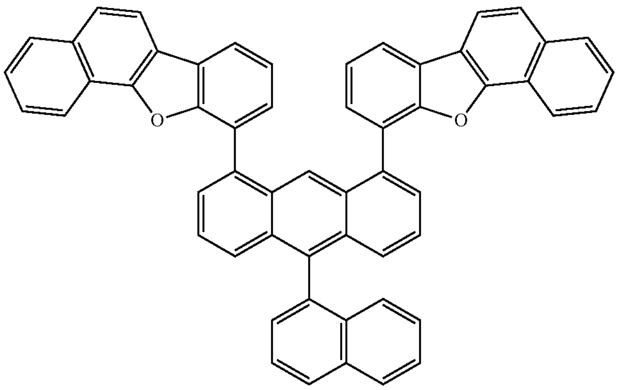
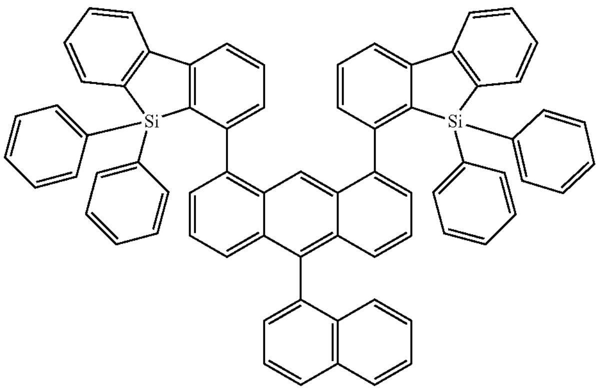
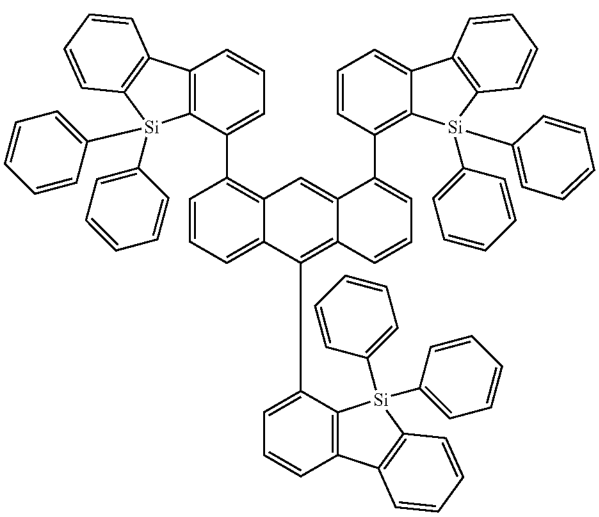
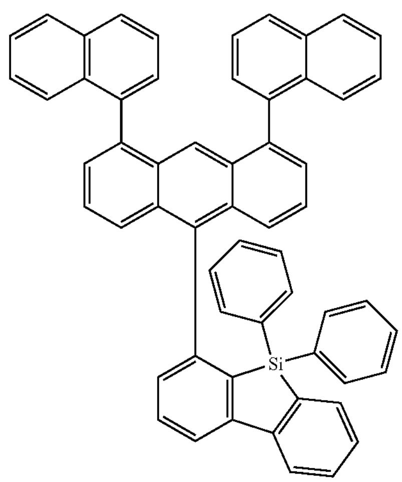
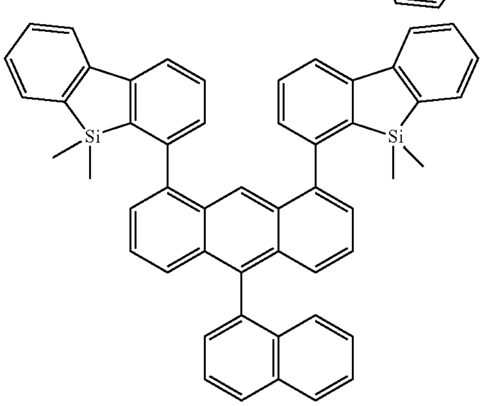
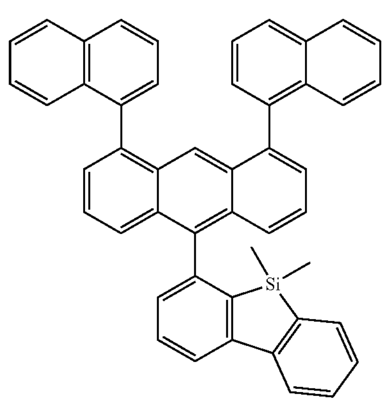

-continued
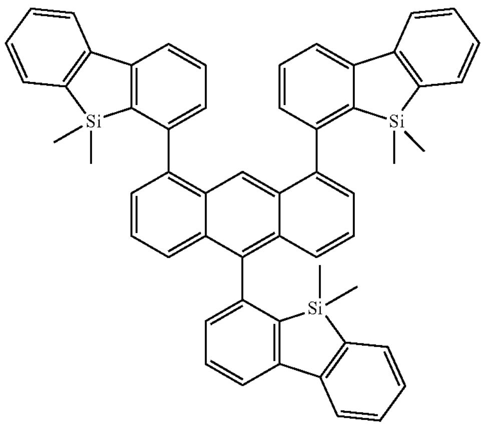
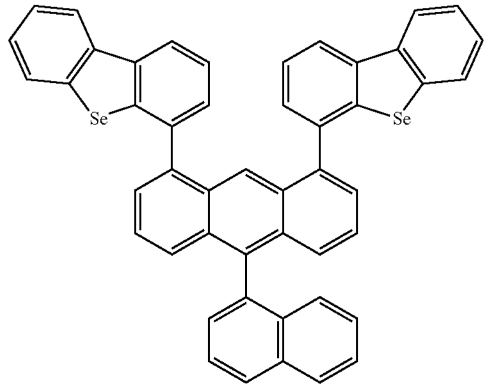
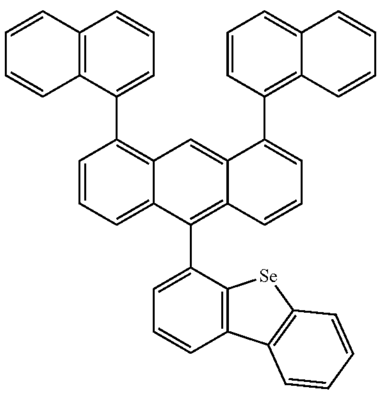
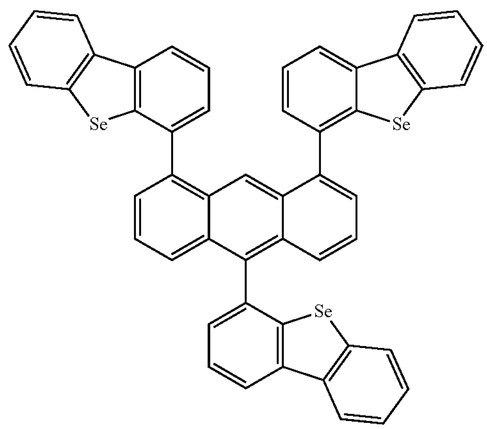
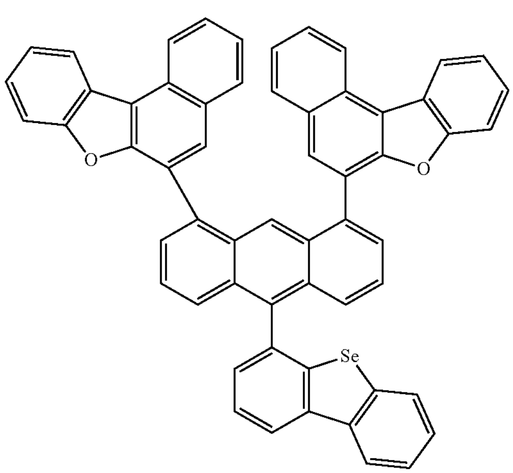
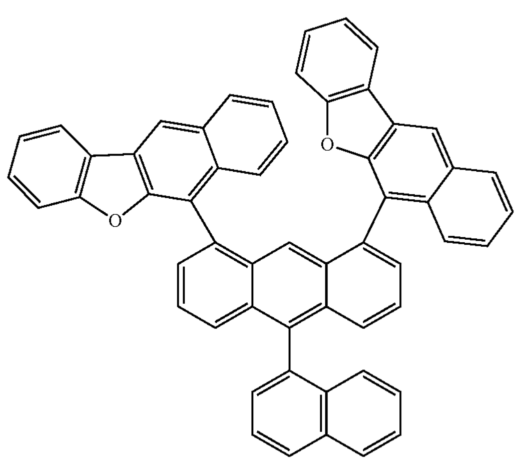

-continued
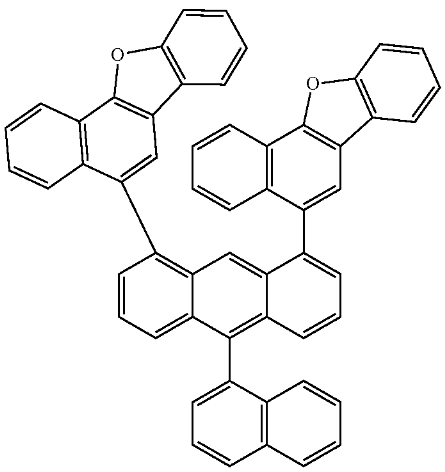
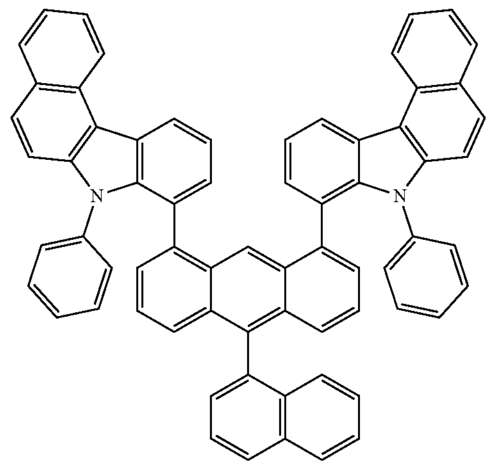
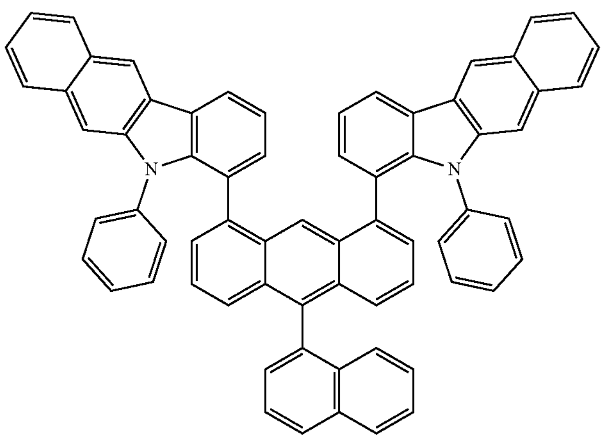
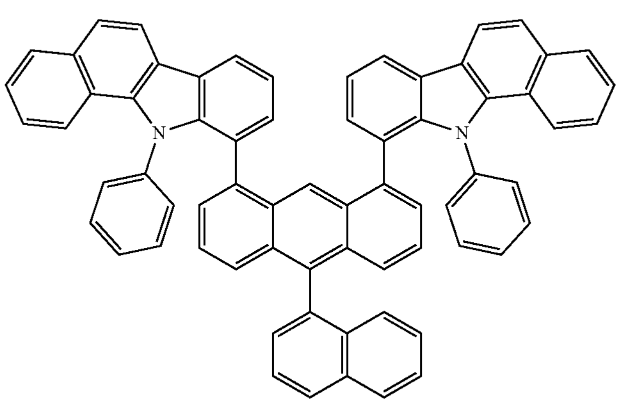
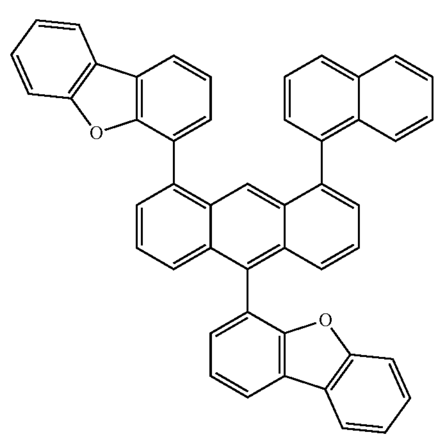

-continued
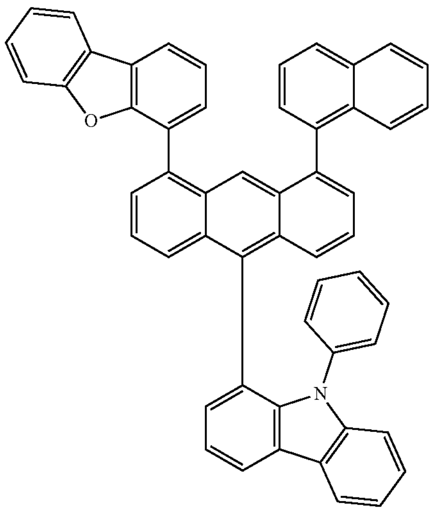
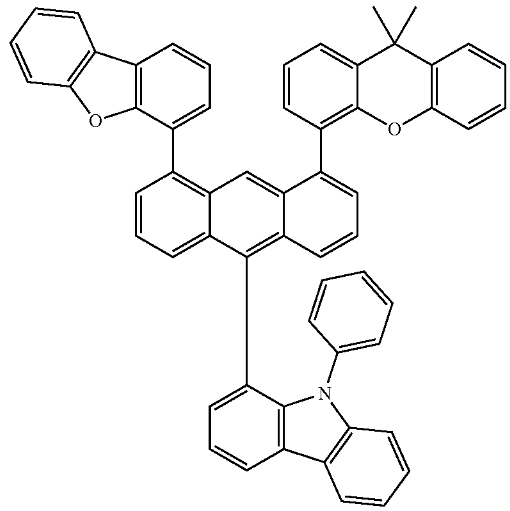
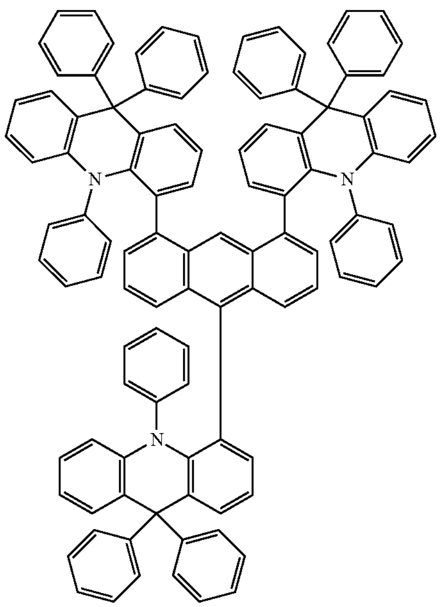
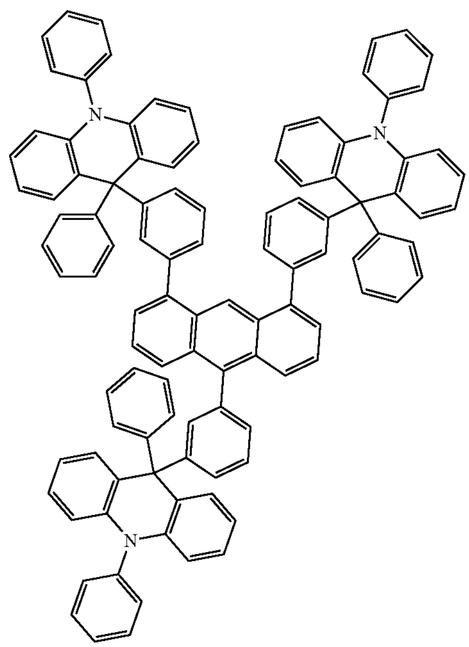
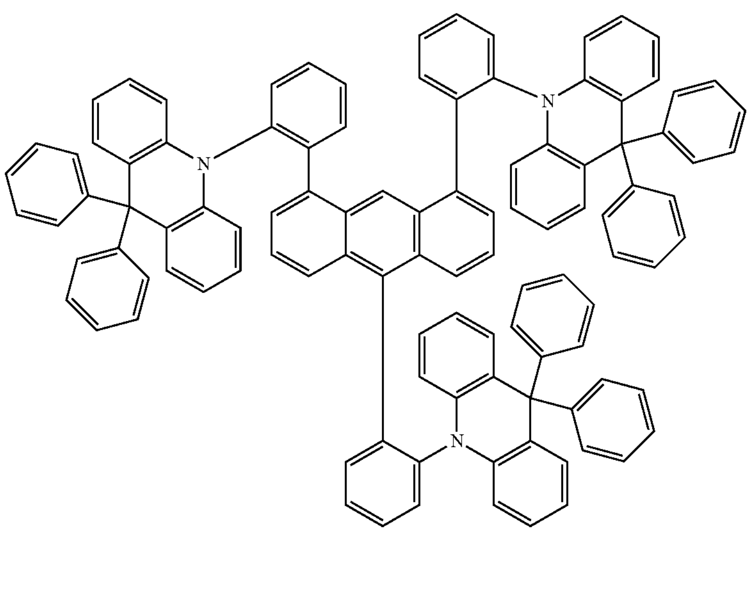

-continued

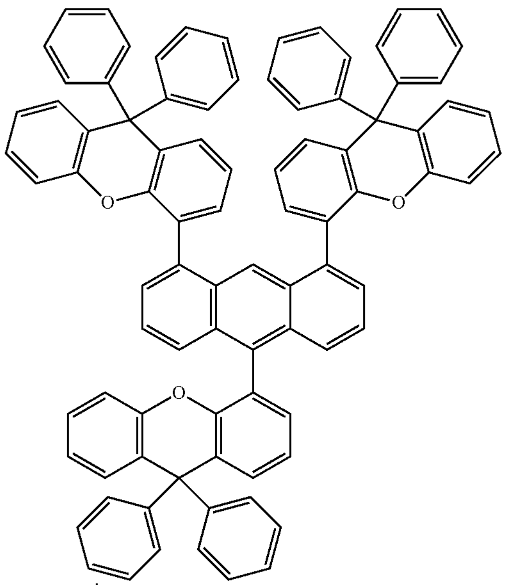

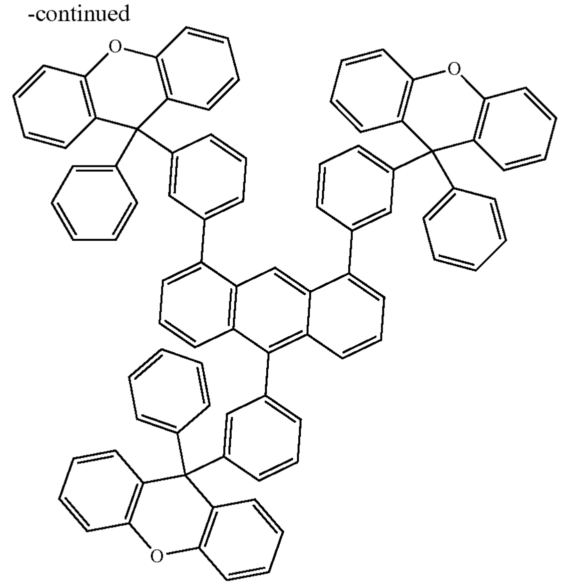

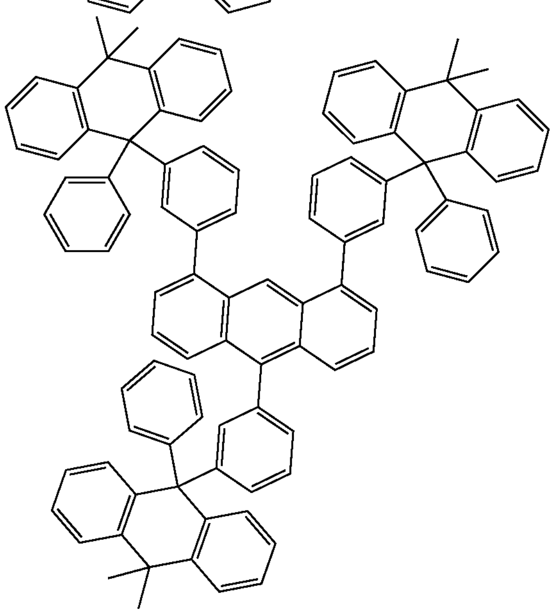

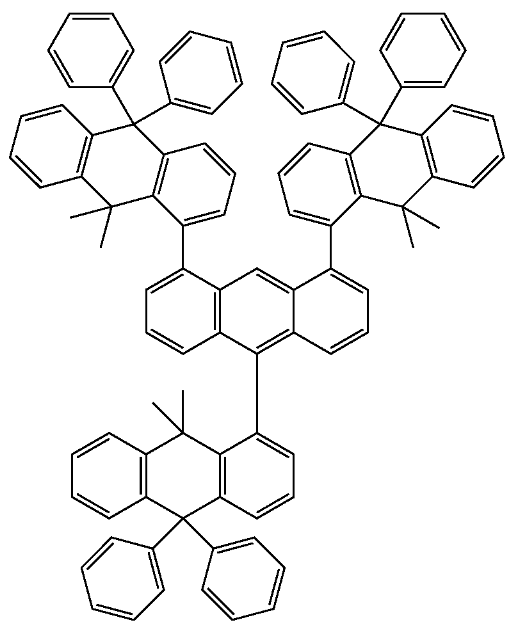

According to one embodiment of the present specification, in Chemical Formula B, L4 to L7 are the same as or different from each other, and each independently is a direct bond, a substituted or unsubstituted arylene group having 6 to 30 carbon atoms, or a substituted or unsubstituted divalent heterocyclic group having 2 to 30 carbon atoms.

According to one embodiment of the present specification, in Chemical Formula B, L4 to L7 are the same as or different from each other, and each independently is a direct bond or an arylene group.

According to one embodiment of the present specification, in Chemical Formula B, L4 to L7 are the same as or different from each other, and each independently is a direct bond or an arylene group having 6 to 50 carbon atoms.

According to one embodiment of the present specification, in Chemical Formula B, L4 to L7 are the same as or different from each other, and each independently is a direct bond, a phenylene group or a naphthylene group.

According to one embodiment of the present specification, in Chemical Formula B, Ar4 to Ar7 are the same as or different from each other, and each independently is hydrogen, a substituted or unsubstituted aryl group having 6 to 50 carbon atoms, or a substituted or unsubstituted heterocyclic group having 2 to 50 carbon atoms.

According to another embodiment, in Chemical Formula B, Ar4 to Ar7 are the same as or different from each other, and each independently is hydrogen; an aryl group having 6 to 50 carbon atoms that is unsubstituted or substituted with an aryl group having 6 to 30 carbon atoms or a heterocyclic group having 2 to 30 carbon atoms; or a heterocyclic group having 2 to 50 carbon atoms that is unsubstituted or substituted with an aryl group having 6 to 30 carbon atoms or a heterocyclic group having 2 to 30 carbon atoms.

According to one embodiment of the present specification, in Chemical Formula B, Ar4 to Ar7 are the same as or different from each other, and each independently is hydrogen; or an aryl group that is unsubstituted or substituted with hydrogen, deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

According to one embodiment of the present specification, in Chemical Formula B, Ar4 to Ar7 are the same as or different from each other, and each independently is hydrogen; or an aryl group having 6 to 60 carbon atoms that is unsubstituted or substituted with hydrogen, deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

According to one embodiment of the present specification, in Chemical Formula B, Ar4 to Ar7 are the same as or different from each other, and each independently is hydrogen; or an aryl group having 6 to 60 carbon atoms that is unsubstituted or substituted with hydrogen, deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group, and herein, the aryl group is a phenyl group, a biphenyl group, a terphenyl group, a naphthyl group, an anthracenyl group, a 9,10-dihydroanthracenyl group, a phenanthrylenyl group, a pyrenyl group, a fluorenyl group, a spirobifluorenyl group, a spirobenzofluorenefluorenyl group, a spirocyclopentafluorenyl group or a spirofluoreneindenophenanthrene group.

According to one embodiment of the present specification, in Chemical Formula B, Ar4 to Ar7 are the same as or different from each other, and each independently is hydrogen; or a substituted or unsubstituted heterocyclic group including at least one of O, S, Se, Ge, N, P and Si as a heteroatom.

According to one embodiment of the present specification, in Chemical Formula B, Ar4 to Ar7 are the same as or different from each other, and each independently is hydrogen; or a substituted or unsubstituted heterocyclic group having 2 to 50 carbon atoms including at least one of O, S, Se, Ge, N, P and Si as a heteroatom.

According to one embodiment of the present specification, in Chemical Formula B, Ar4 to Ar7 are the same as or different from each other, and each independently is hydrogen; or a substituted or unsubstituted dicyclic or higher heterocyclic group including at least one of O, S, Se, Ge, N, P and Si as a heteroatom.

According to one embodiment of the present specification, in Chemical Formula B, Ar4 to Ar7 are the same as or different from each other, and each independently is hydrogen; or a substituted or unsubstituted tricyclic or higher heterocyclic group including at least one of O, S, Se, Ge, N, P and Si as a heteroatom.

According to one embodiment of the present specification, in Chemical Formula B, Ar4 to Ar7 are the same as or different from each other, and each independently is hydrogen; or can be one of a substituted or unsubstituted thiophene group and Chemical Formulae 2-1 to 2-7, 3 to 18, and 21 to 24 described above.

In one embodiment of the present specification, in Chemical Formula B, Ar5 and Ar7 are hydrogen.

According to one embodiment of the present specification, in Chemical Formula B, at least one of Ar4 and Ar6 is a substituted or unsubstituted heterocyclic group including at least one of 0, S, Se, Ge, N, P and Si as a heteroatom.

According to one embodiment of the present specification, in Chemical Formula B, at least one of Ar4 and Ar6 is a substituted or unsubstituted heterocyclic group having 2 to 50 carbon atoms including at least one of O, S, Se, Ge, N, P and Si as a heteroatom.

According to one embodiment of the present specification, in Chemical Formula B, at least one of Ar4 and Ar6 is a substituted or unsubstituted heterocyclic group including at least one of 0, S, Se, Ge, N, P and Si as a heteroatom, and the heterocyclic group can be one of a substituted or unsubstituted thiophene group and Chemical Formulae 2-1 to 2-7, 3 to 18, and 21 to 24 described above.

According to one embodiment of the present specification, in Chemical Formula B, Ar4 and Ar6 are the same as or different from each other, and each independently is a substituted or unsubstituted heterocyclic group.

According to one embodiment of the present specification, in Chemical Formula B, Ar4 and Ar6 are the same as or different from each other, and each independently is a substituted or unsubstituted heterocyclic group including at least one of 0, S, Se, Ge, N, P and Si as a heteroatom.

According to one embodiment of the present specification, in Chemical Formula B, Ar4 and Ar6 are the same as or different from each other, and each independently is a substituted or unsubstituted heterocyclic group having 2 to 50 carbon atoms including at least one of O, S, Se, Ge, N, P and Si as a heteroatom.

According to one embodiment of the present specification, in Chemical Formula B, Ar4 and Ar6 are the same as or different from each other, and each independently is a substituted or unsubstituted heterocyclic group including at least one of 0, S, Se, Ge, N, P and Si as a heteroatom, and the heterocyclic group can be one of a substituted or unsubstituted thiophene group and Chemical Formulae 2-1 to 2-7, 3 to 18, and 21 to 24 described above.

According to one embodiment of the present specification, Chemical Formula B can be one compound selected from among the following compounds:

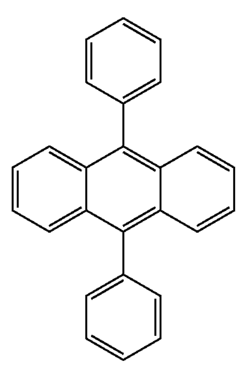

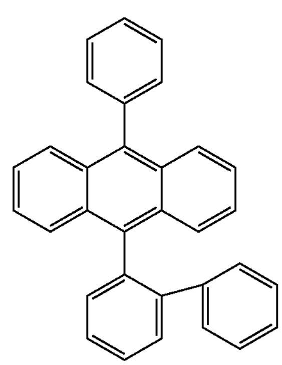

-continued
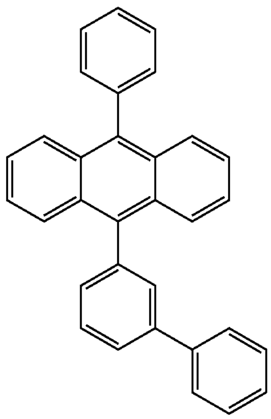
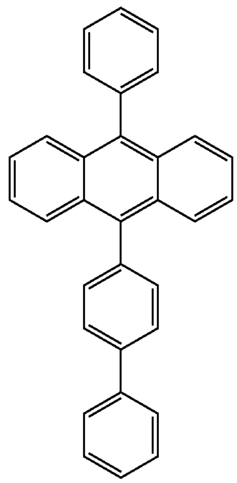
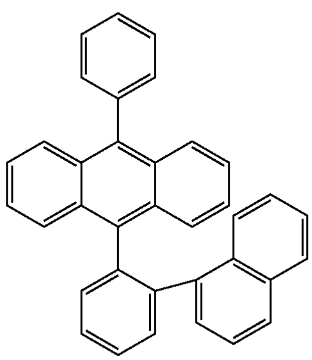
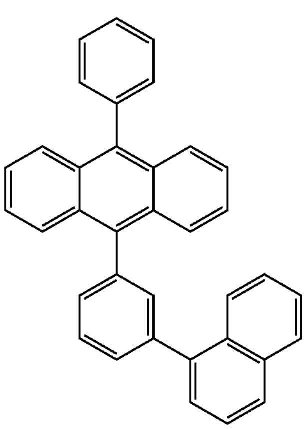
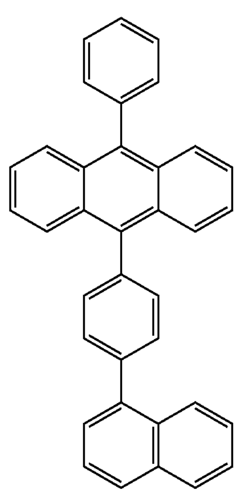
-continued
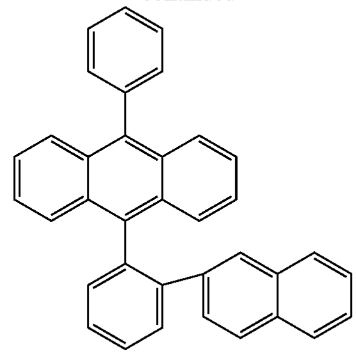
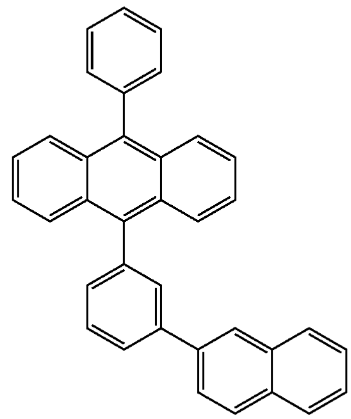
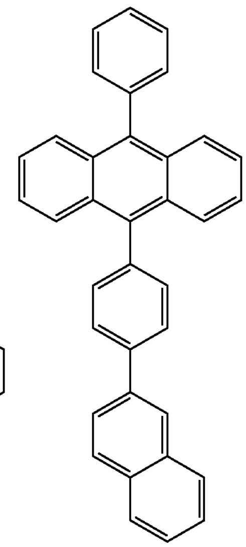
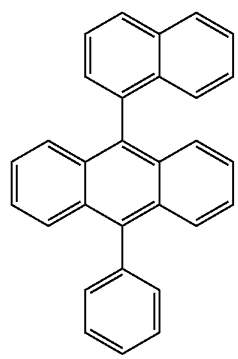
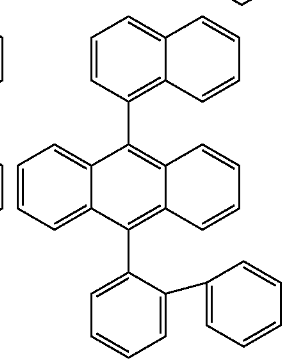
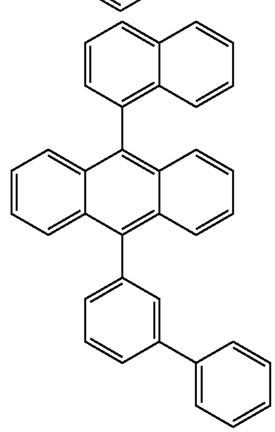
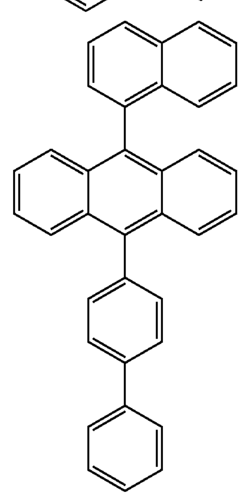

-continued
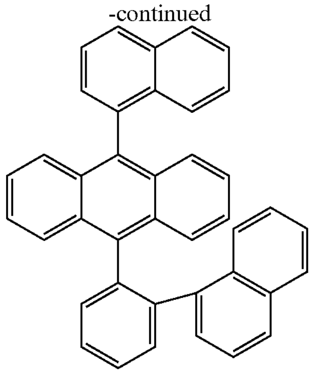
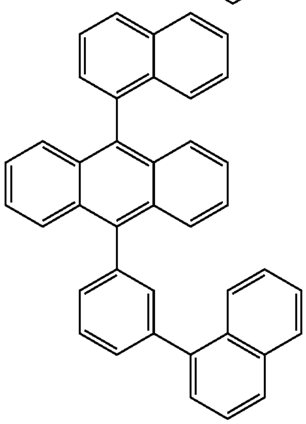
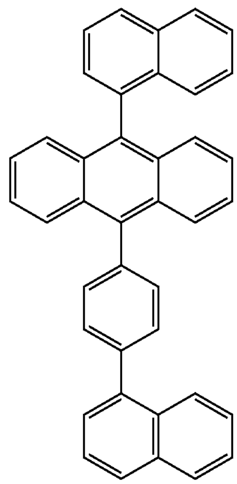
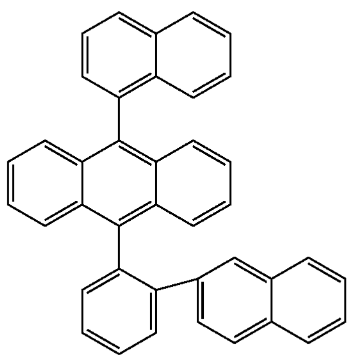
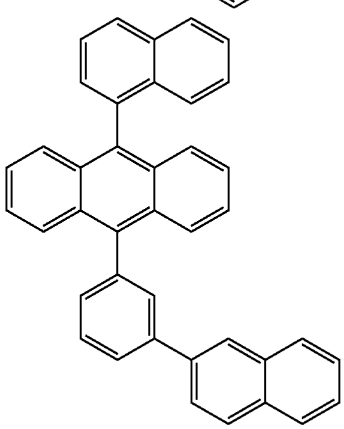
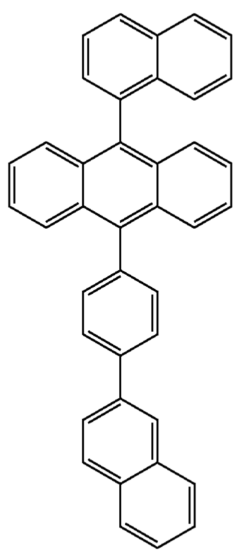
-continued
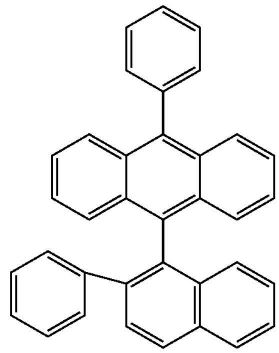
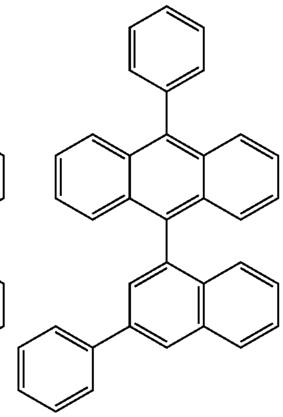
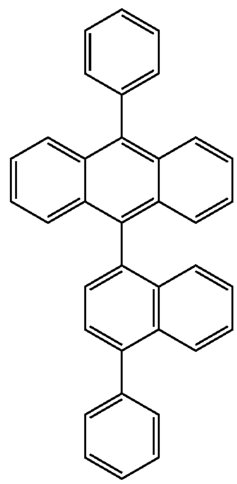
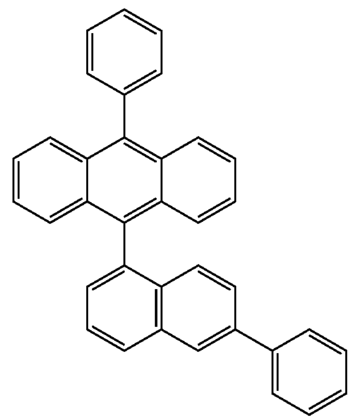
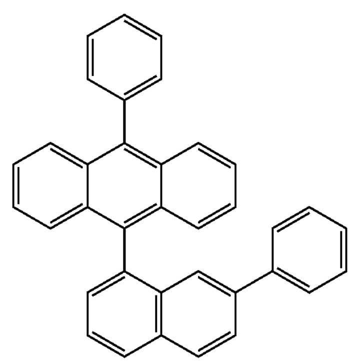
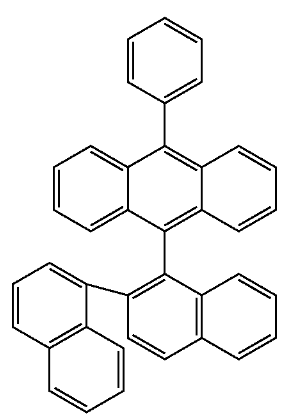

-continued
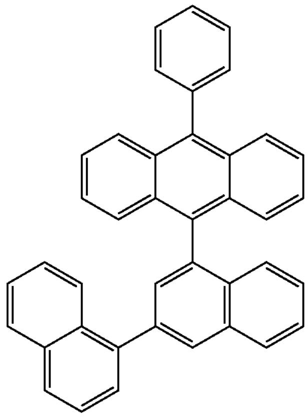
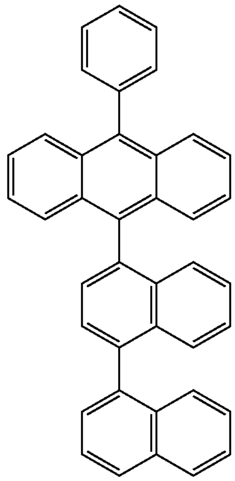
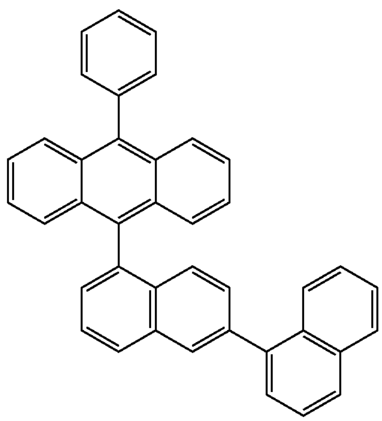
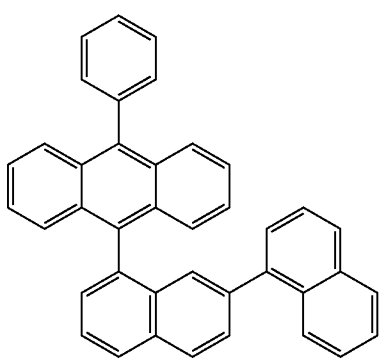
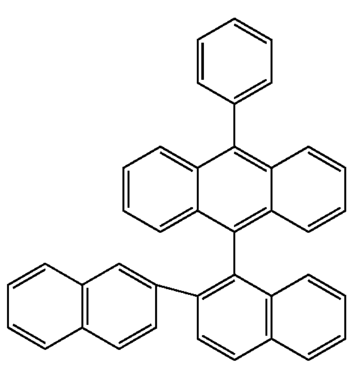
-continued
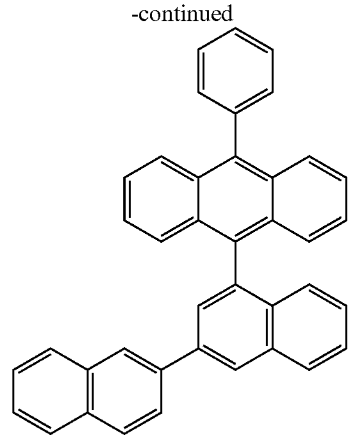
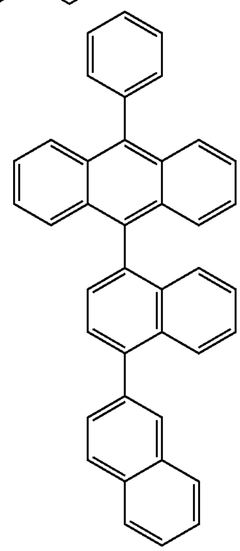
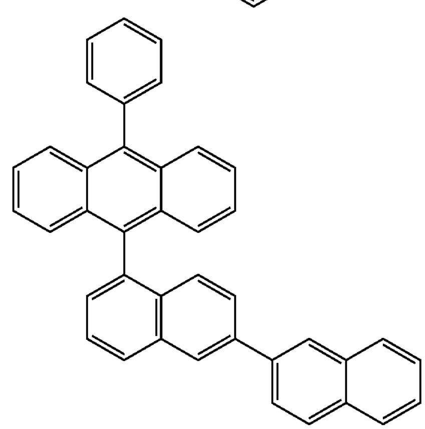
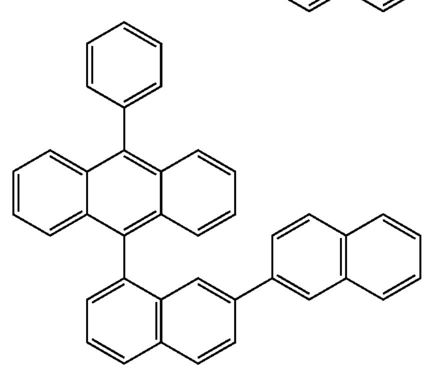

-continued
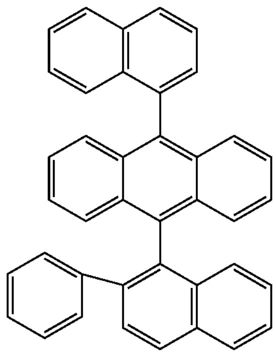
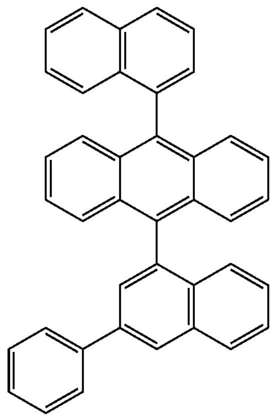
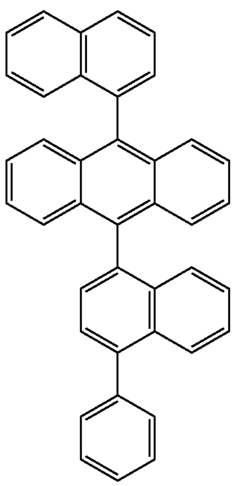
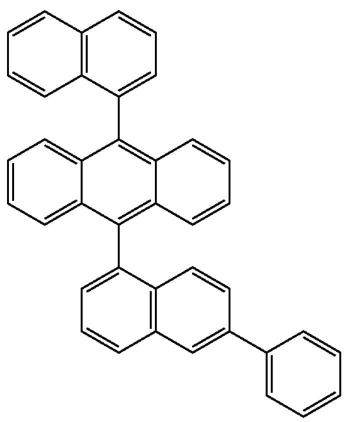
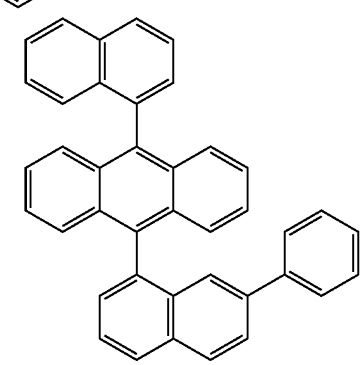
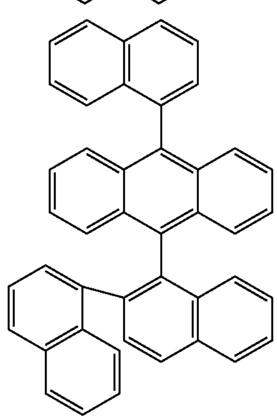
-continued
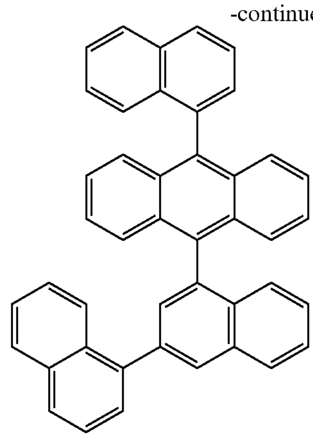
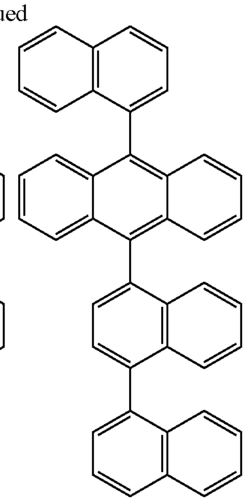
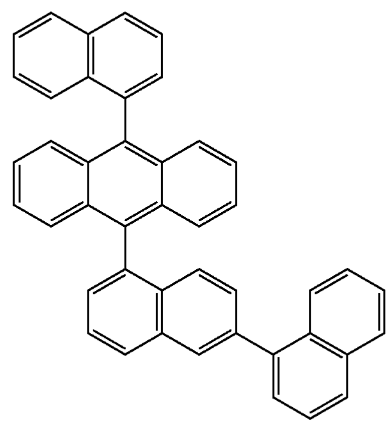
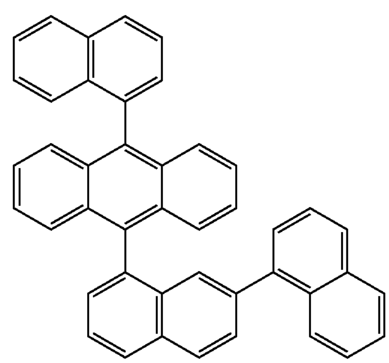
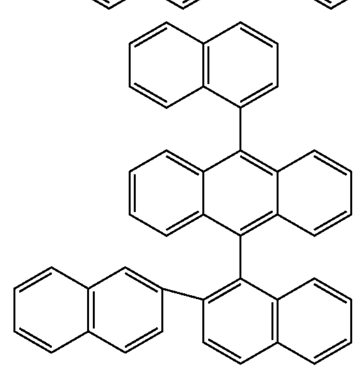

-continued
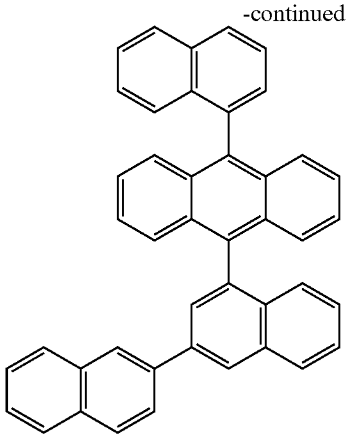
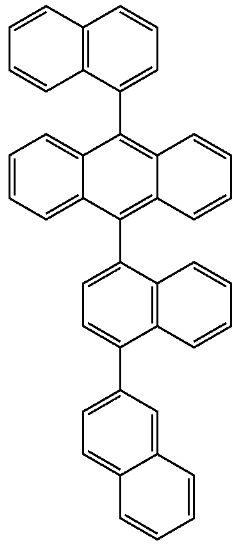
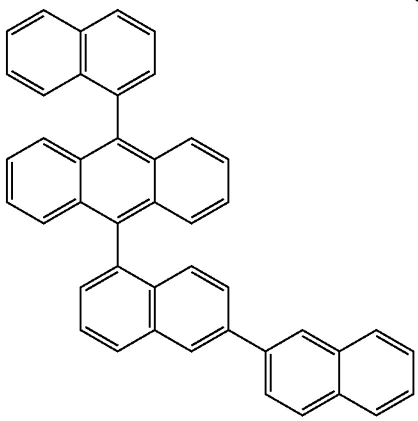
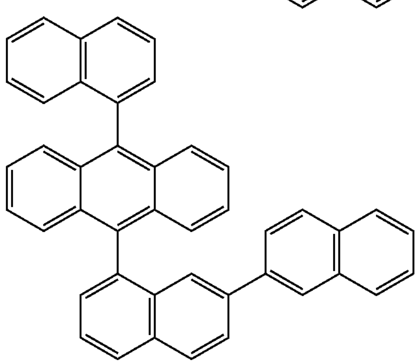
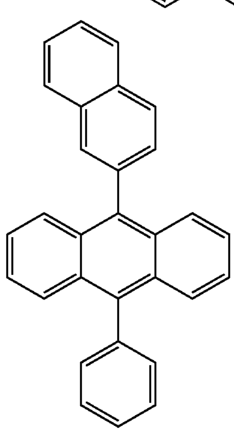
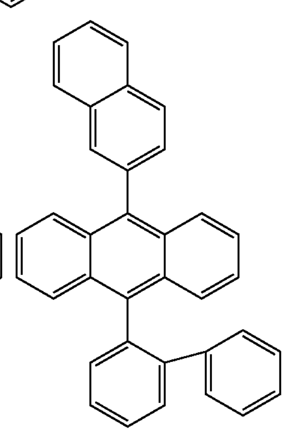
-continued
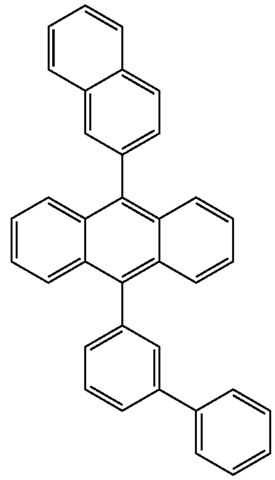
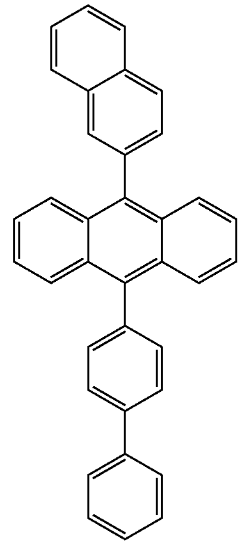
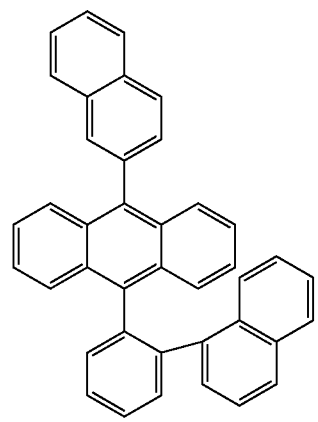
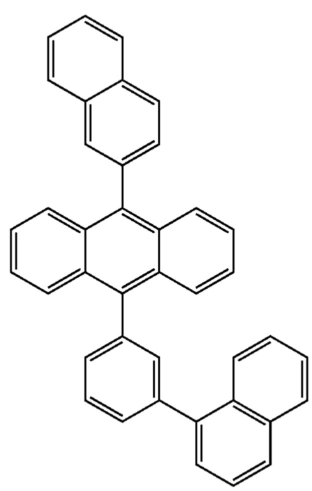
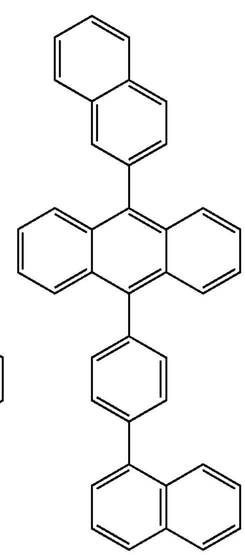

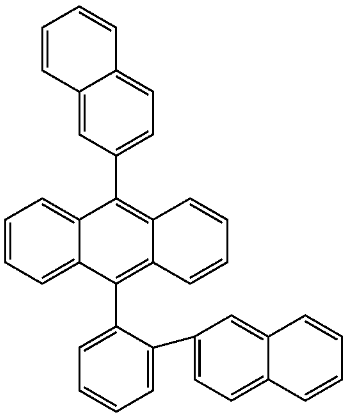
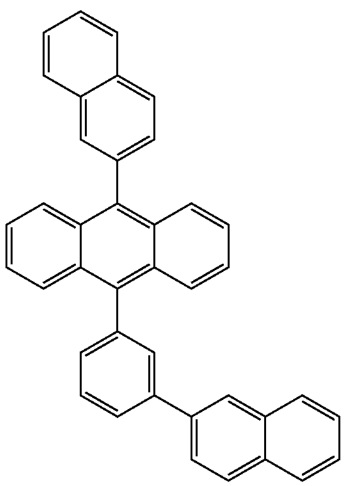
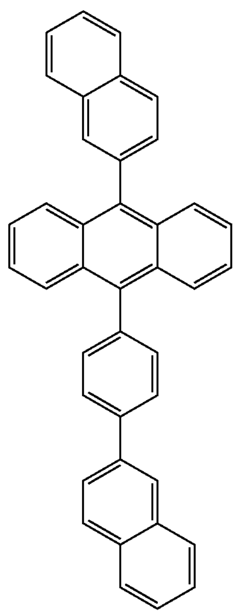
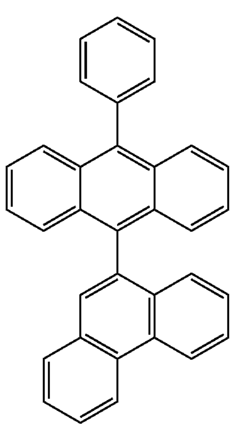
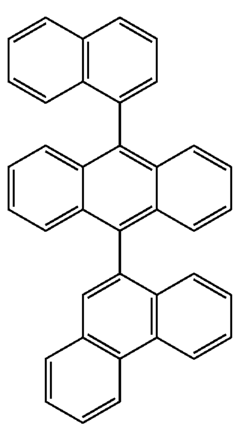
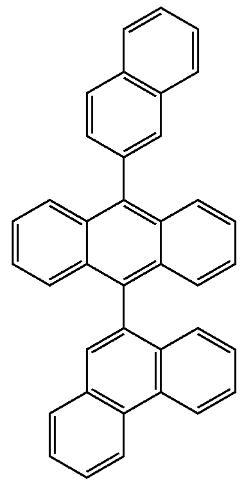
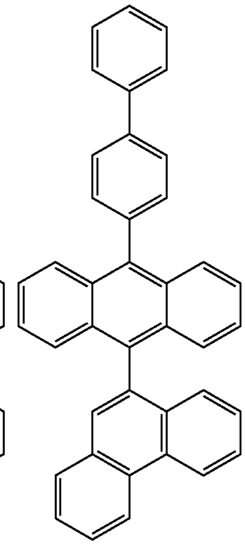
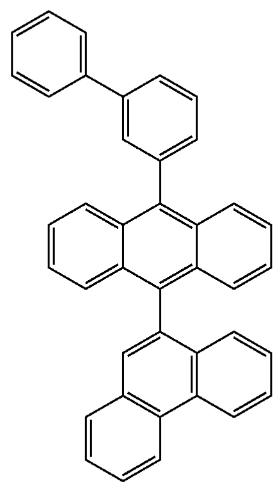
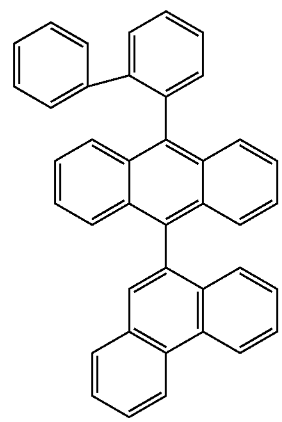
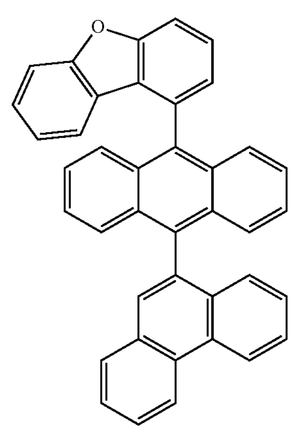
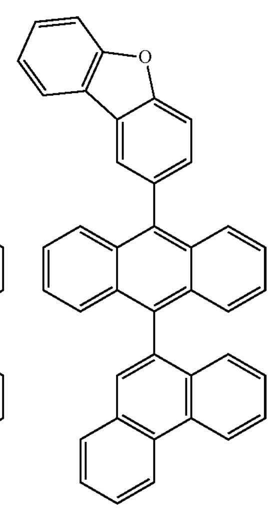

-continued
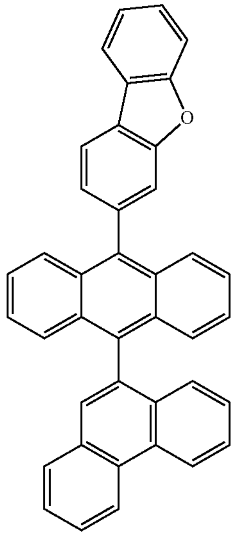
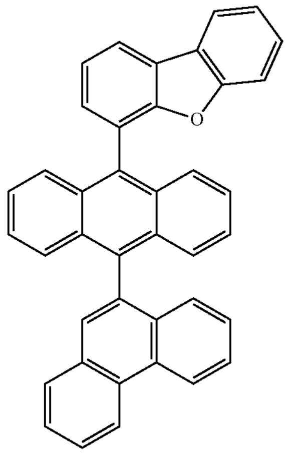
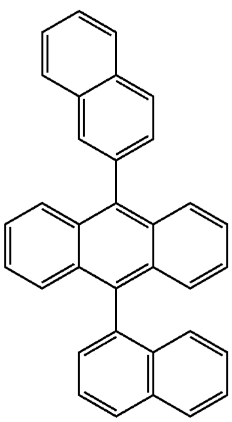
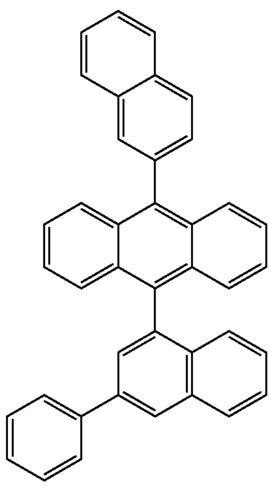
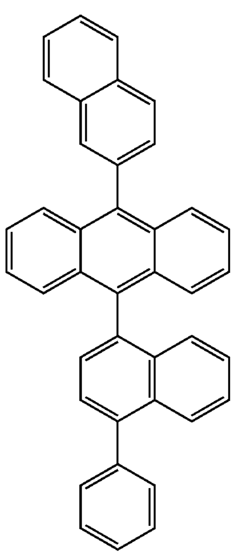
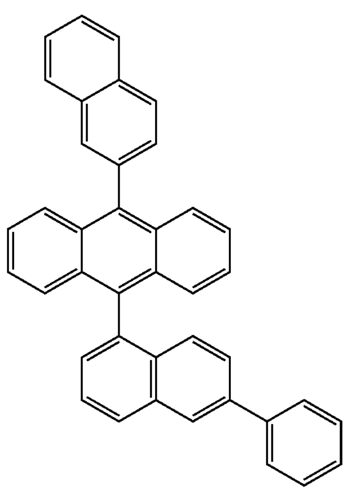
-continued
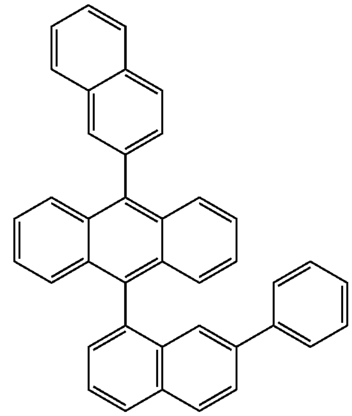
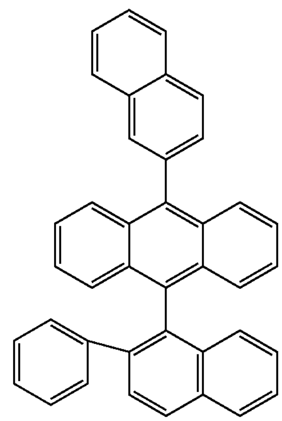
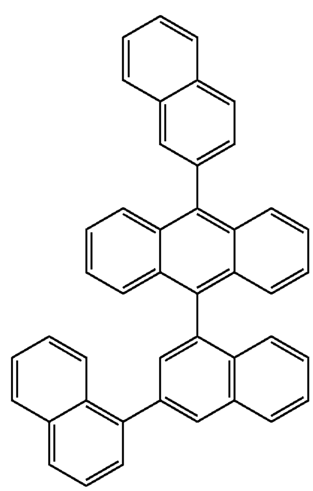
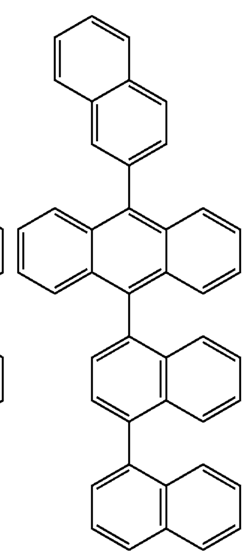

-continued
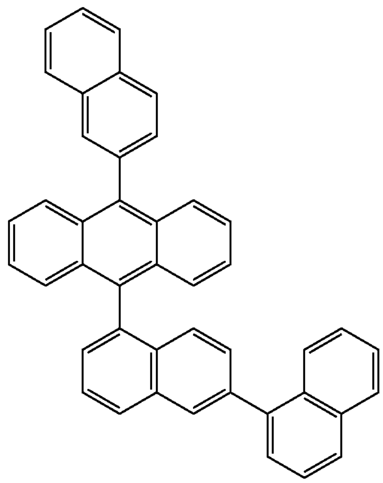
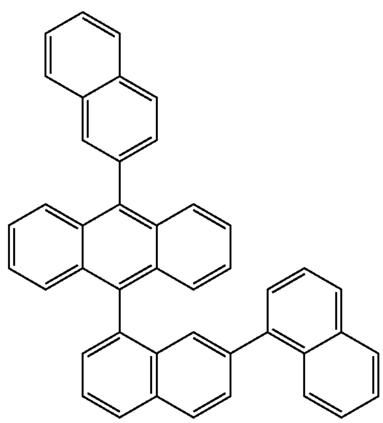
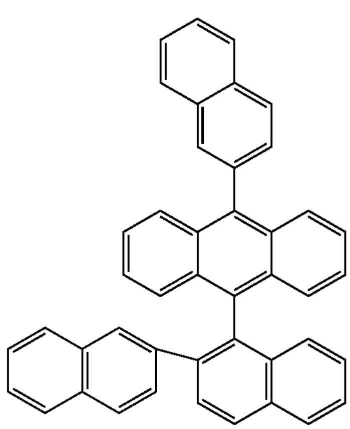
-continued
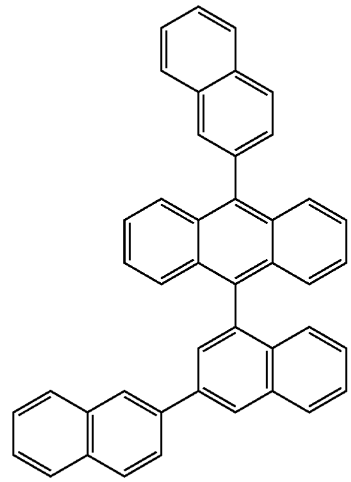
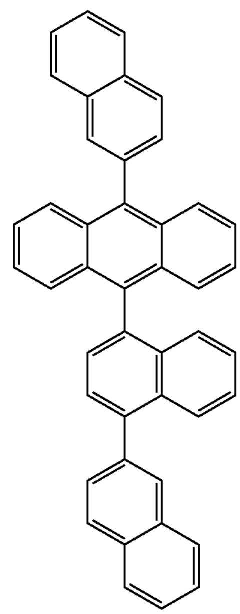
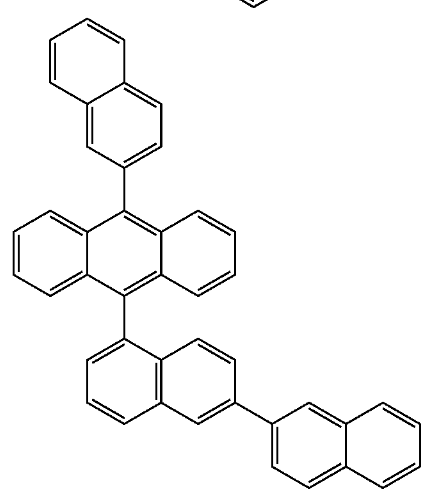

-continued
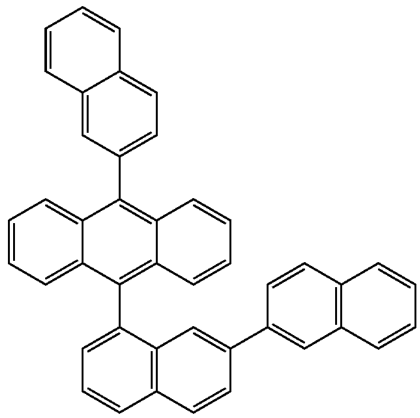
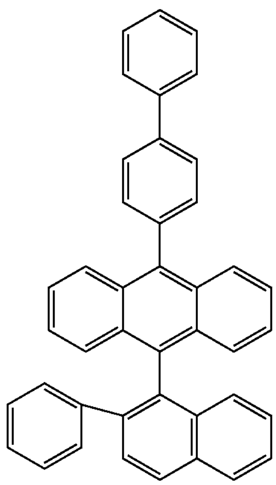
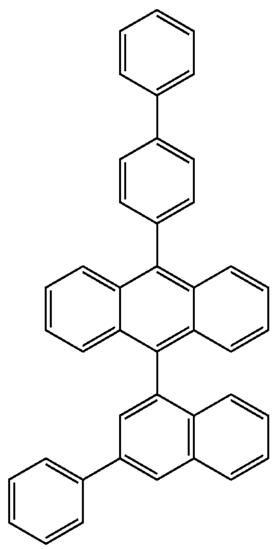
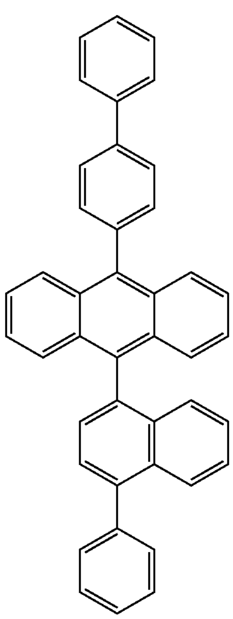
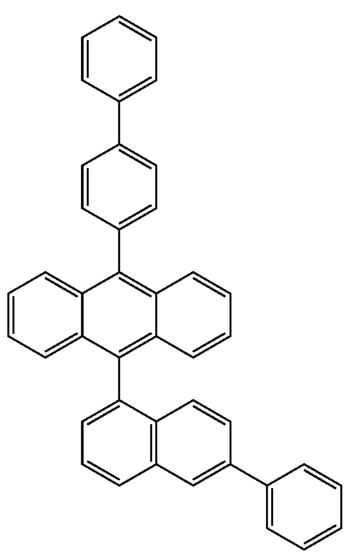
-continued
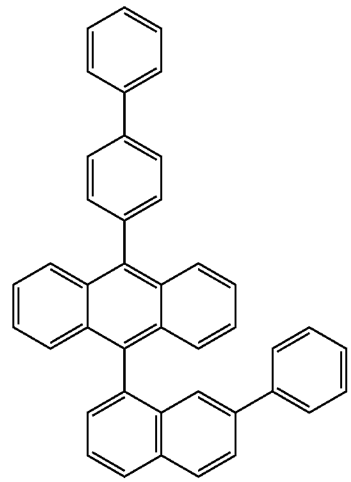
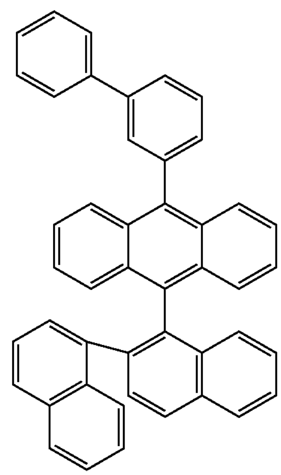
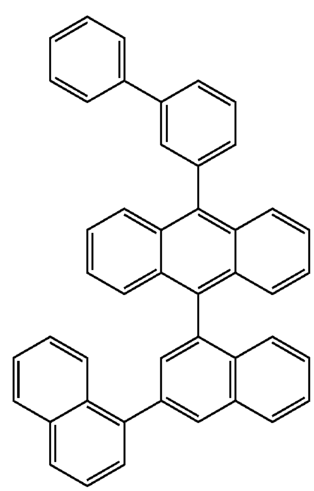
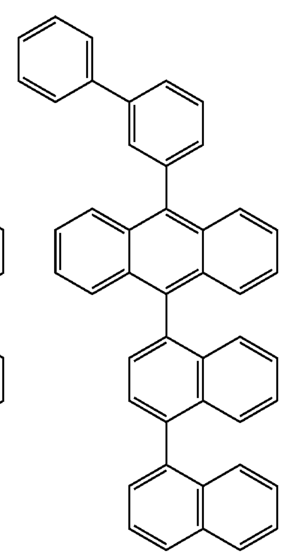

-continued
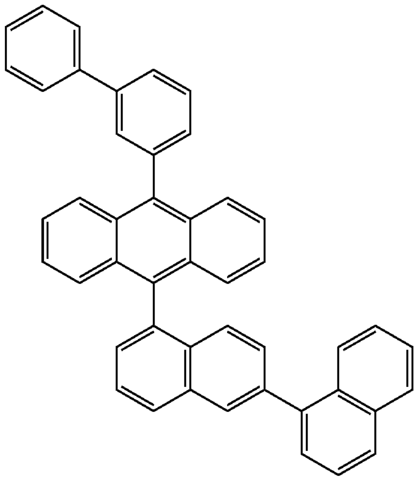
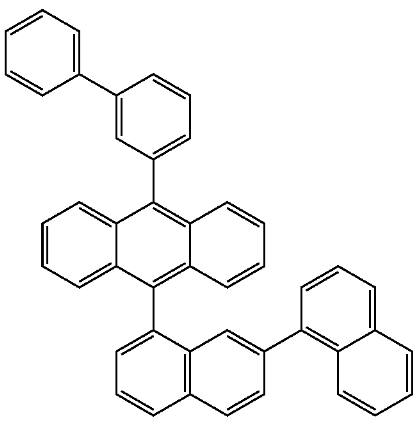
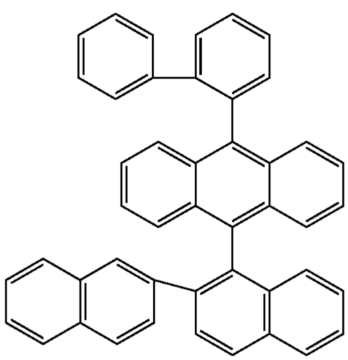
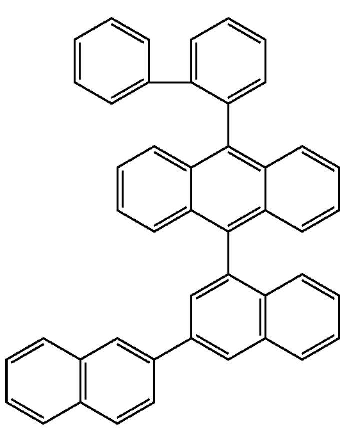
-continued
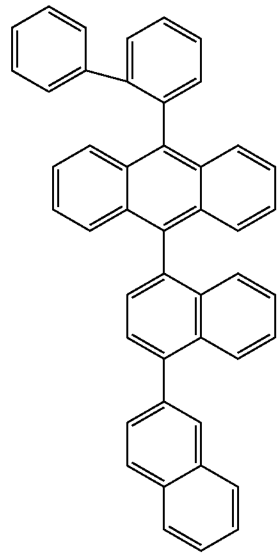
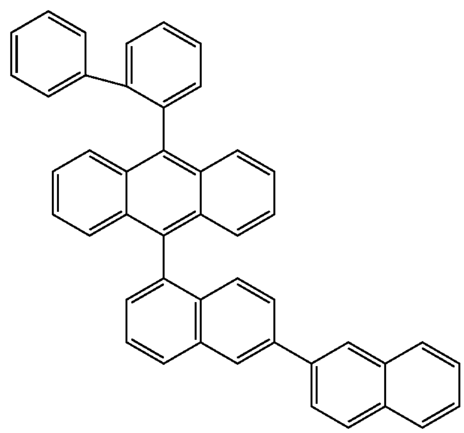
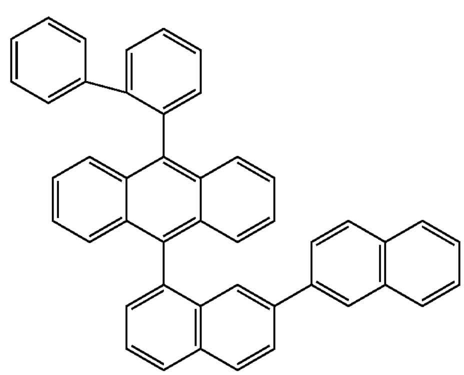

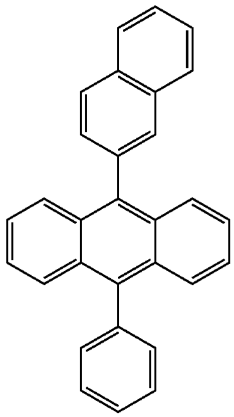
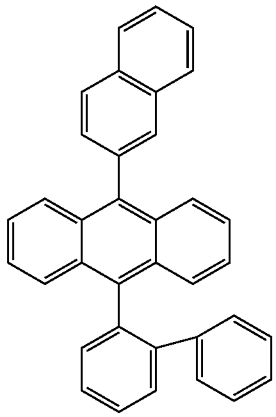
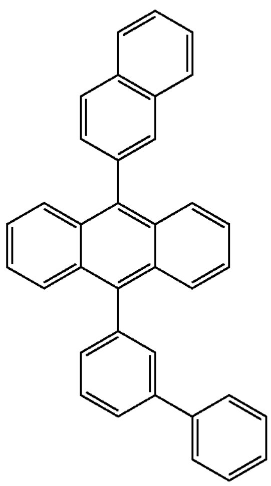
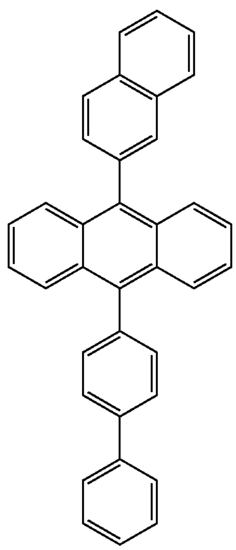
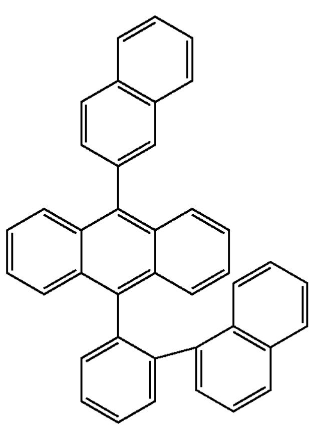
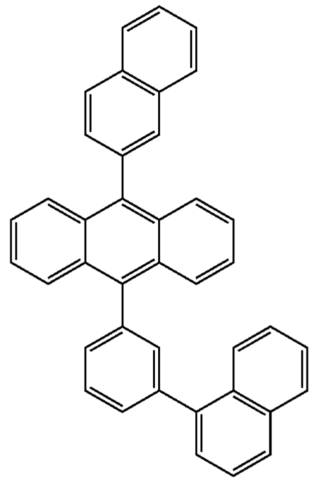
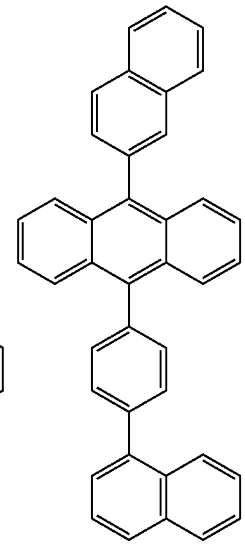
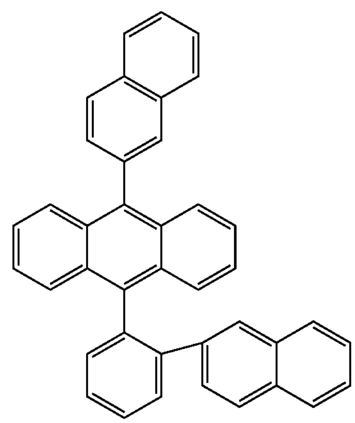
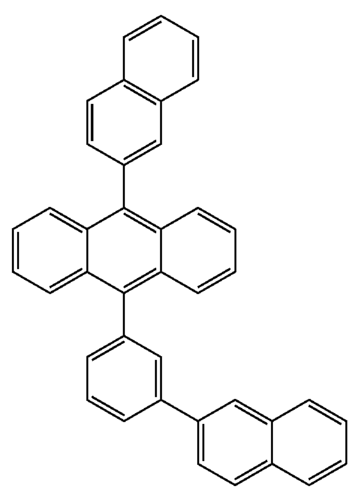
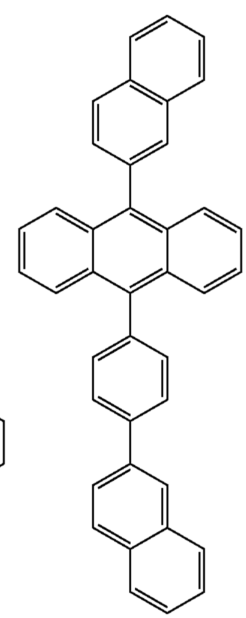

-continued
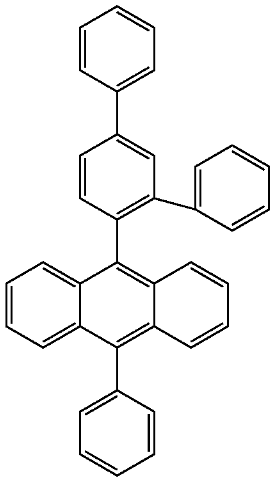
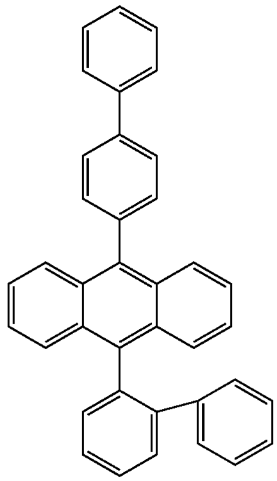
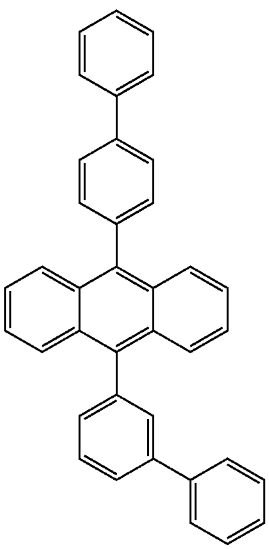
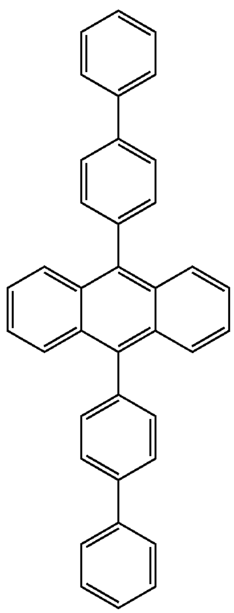
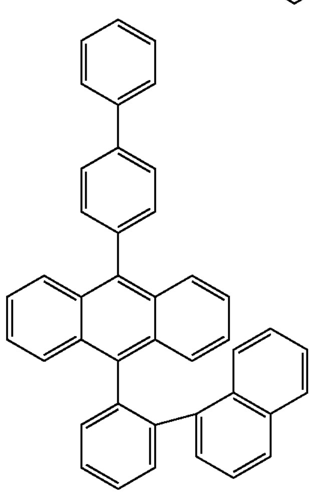
-continued
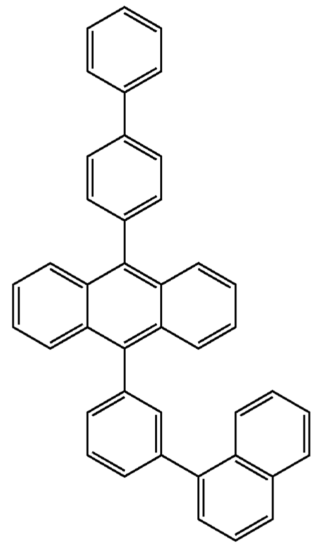
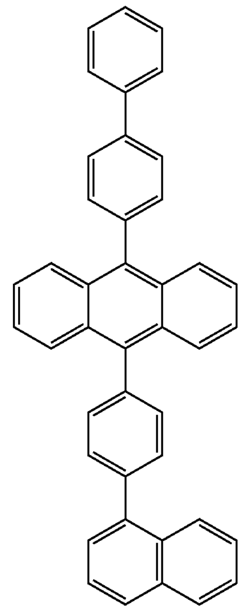
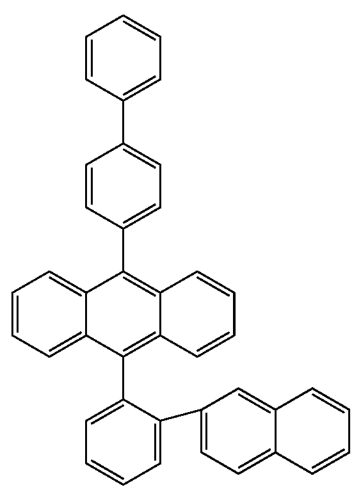

-continued
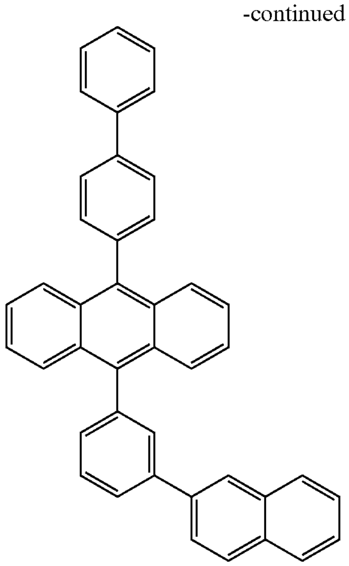
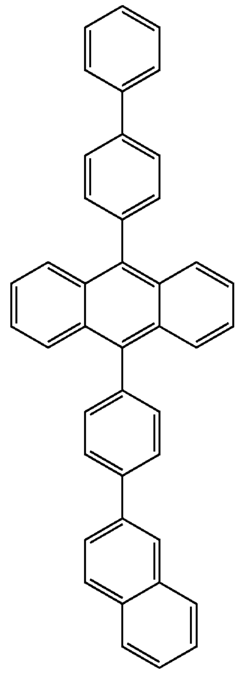
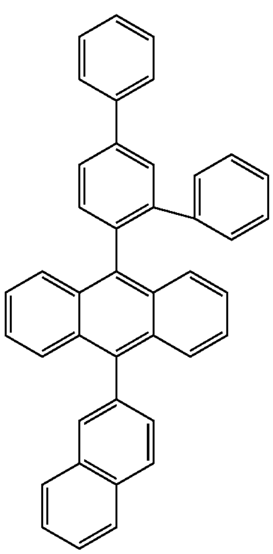
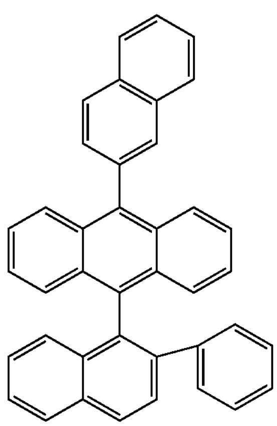
-continued
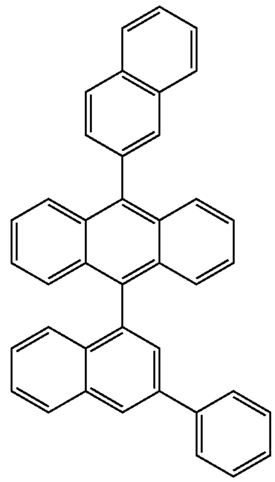
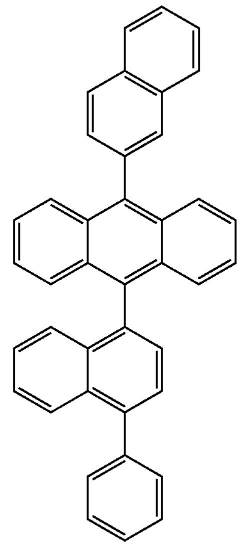
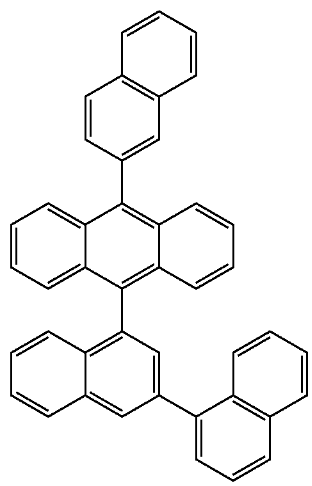
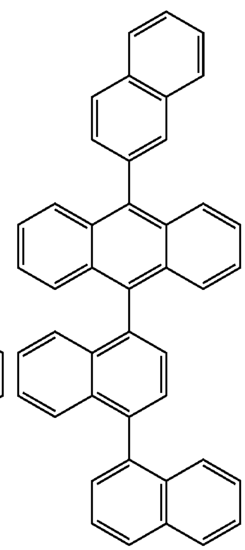
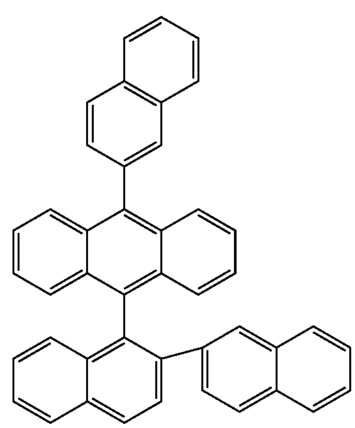

-continued
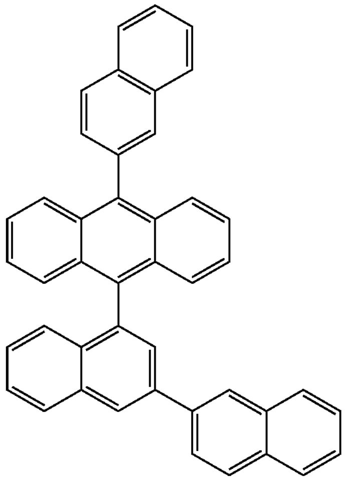
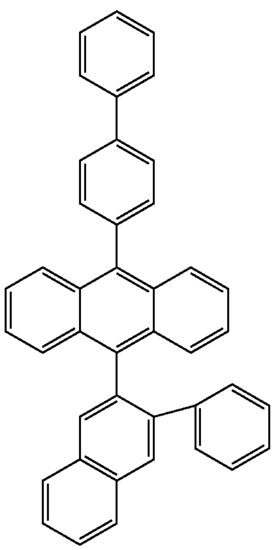
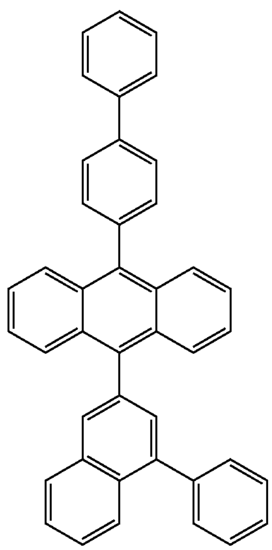
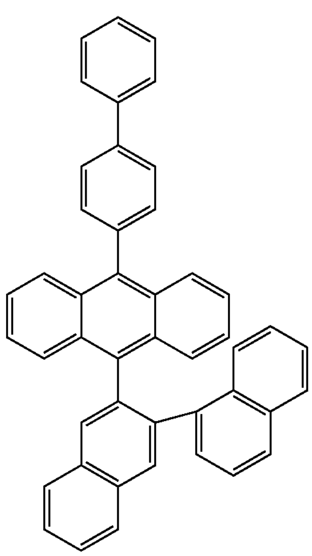
-continued
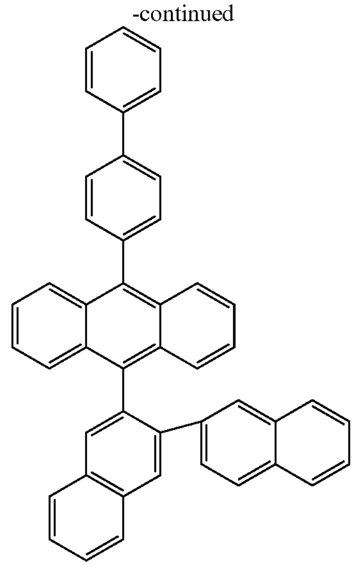
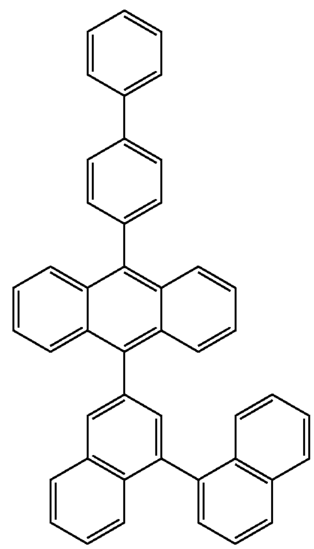
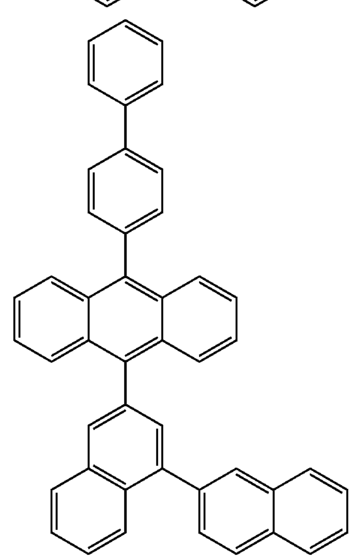

-continued
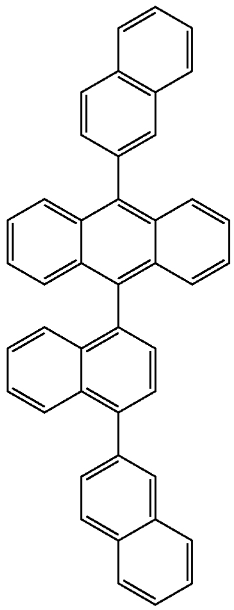
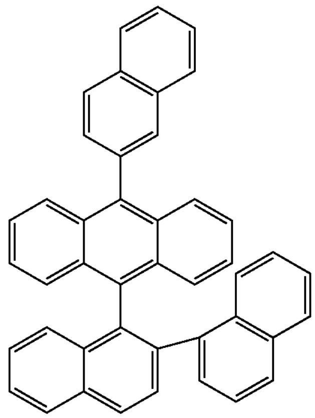
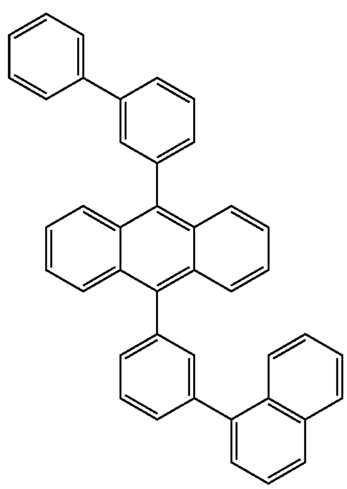
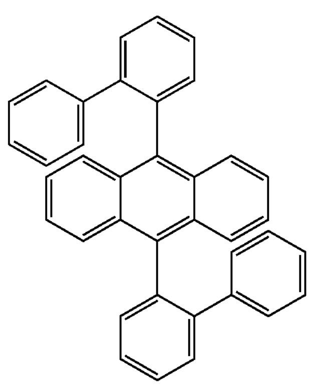
-continued
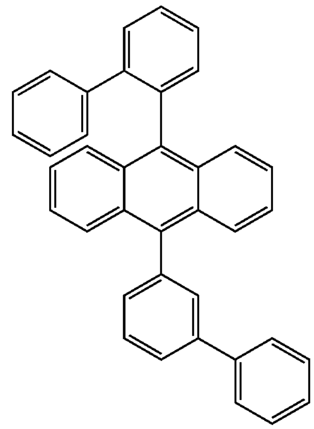
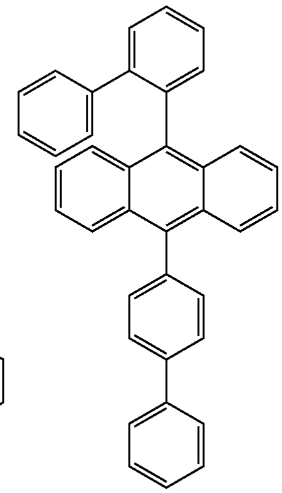
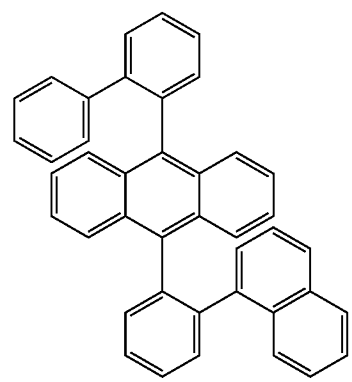
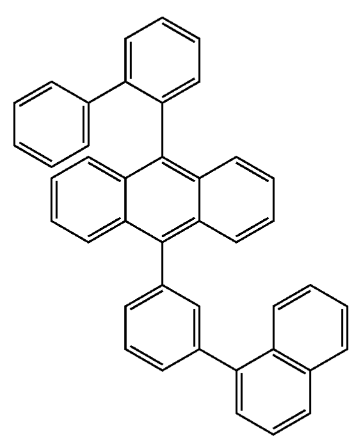

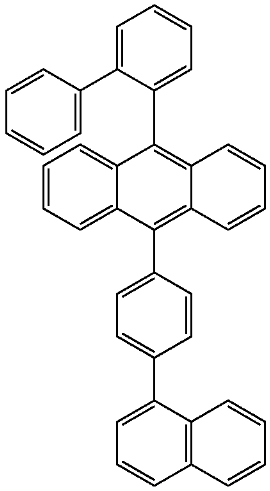
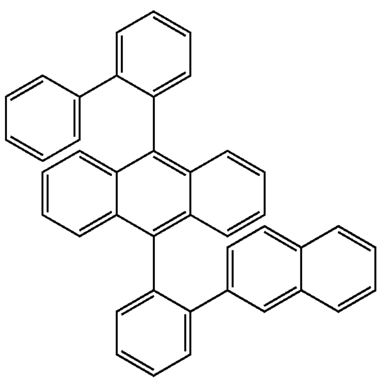
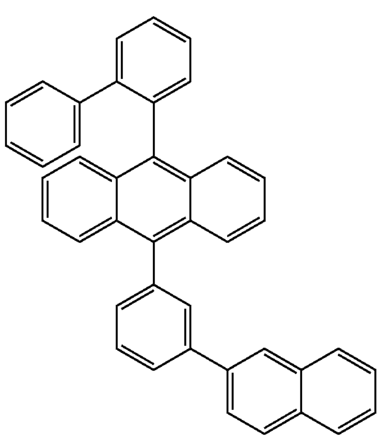
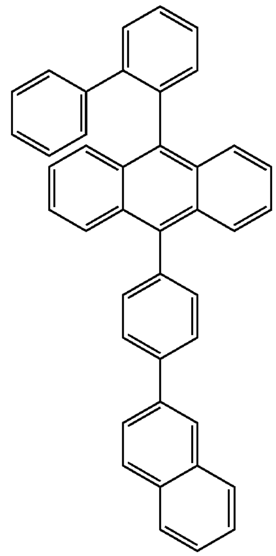
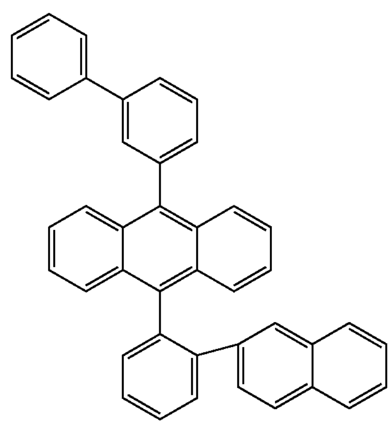
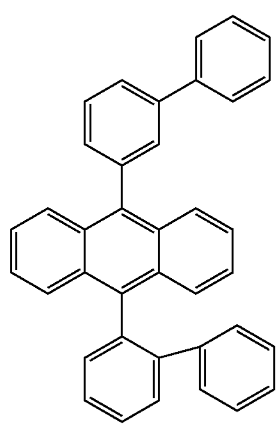
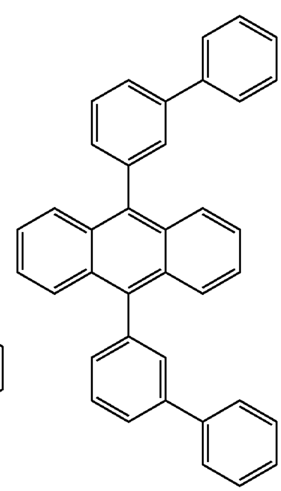

-continued
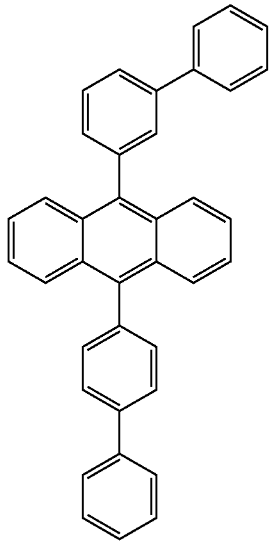
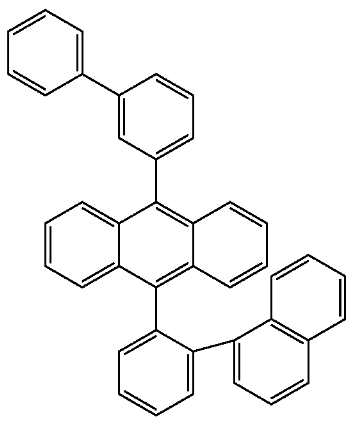
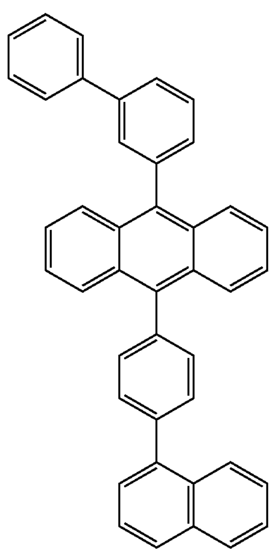
-continued
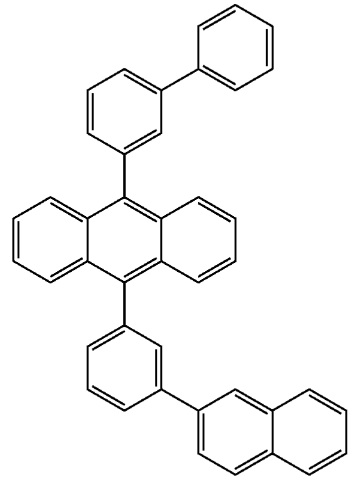
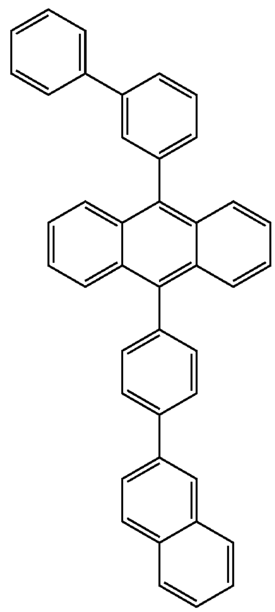
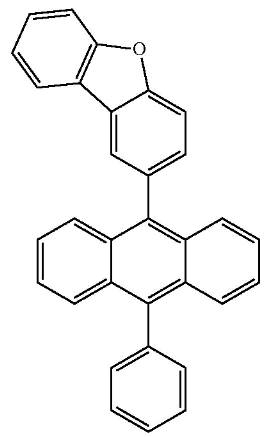
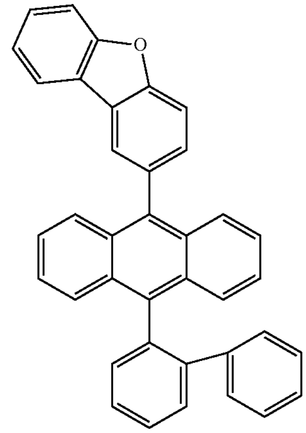

-continued
-continued
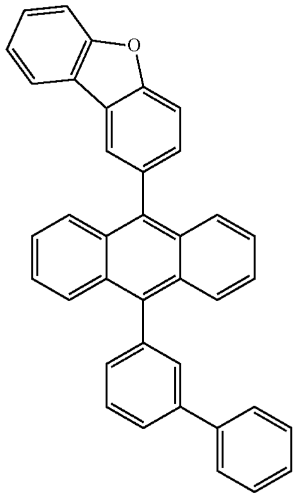
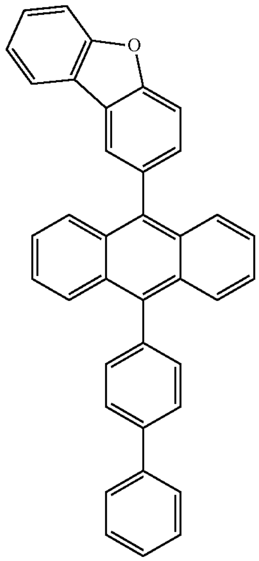
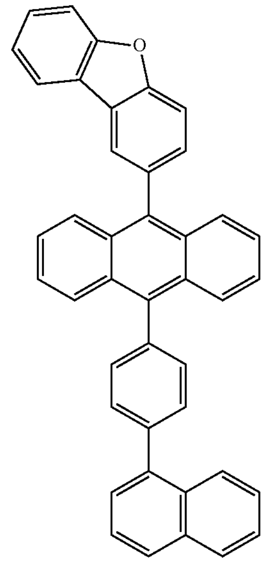
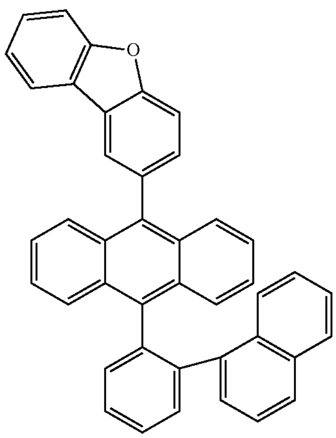
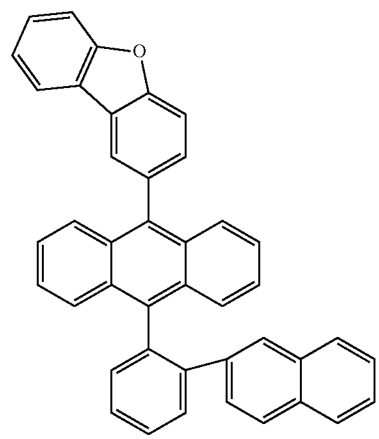
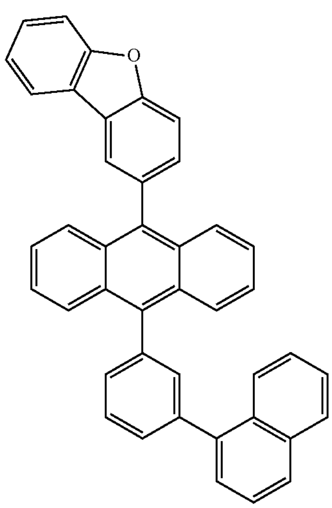
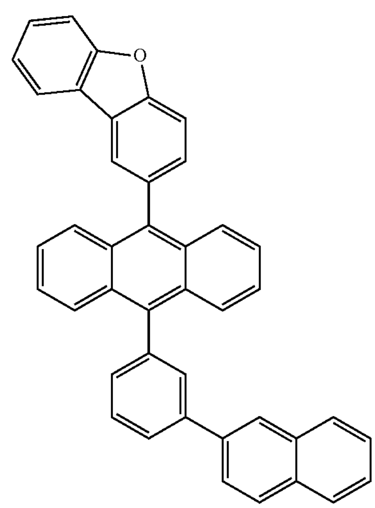

-continued
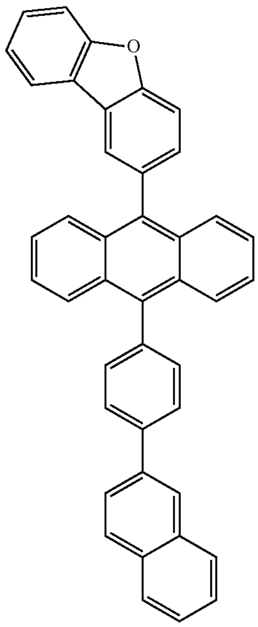
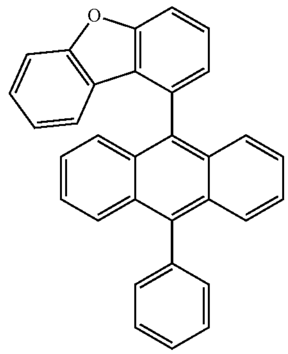
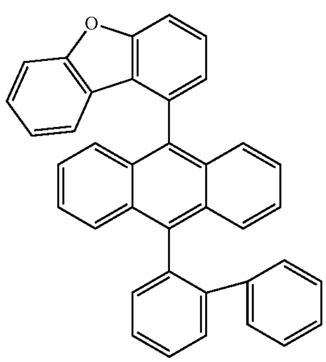
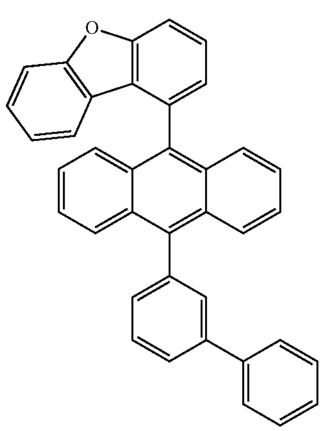
-continued
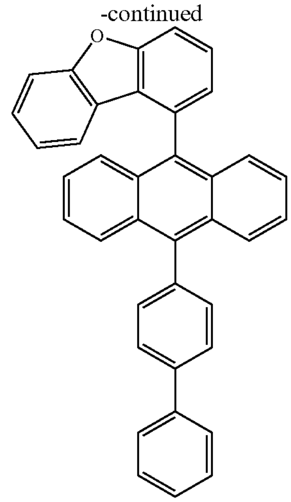
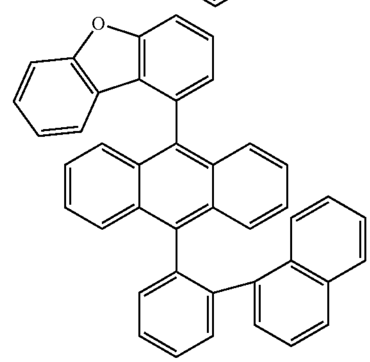
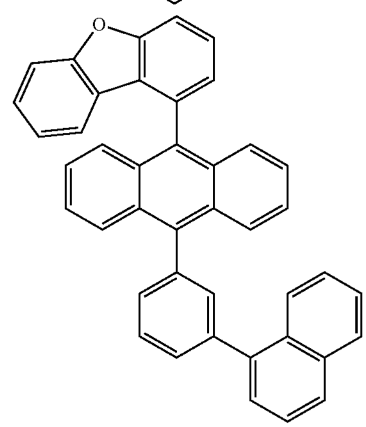
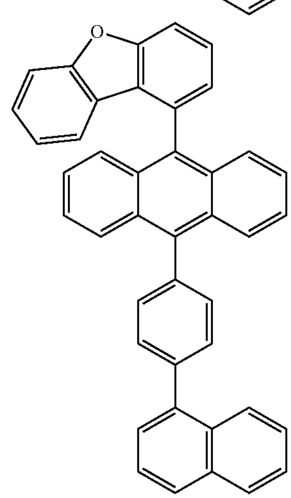

-continued
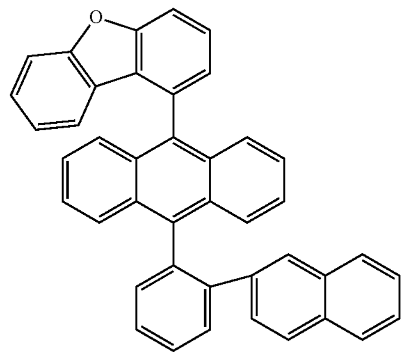
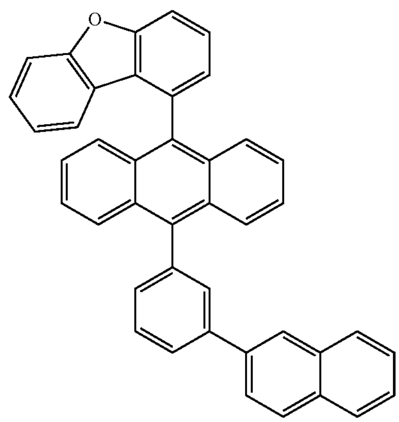
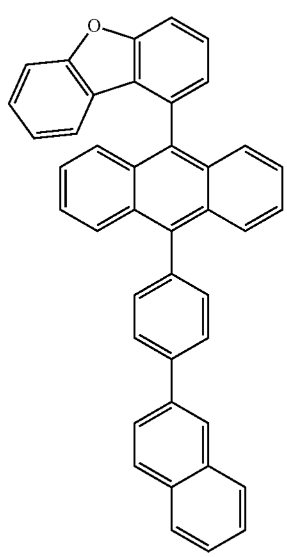
-continued
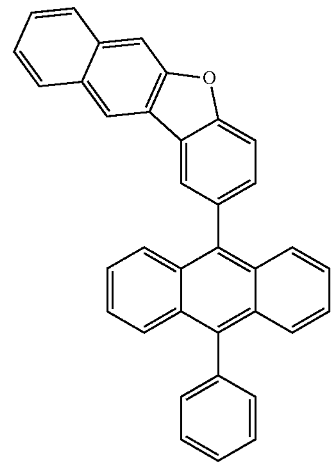
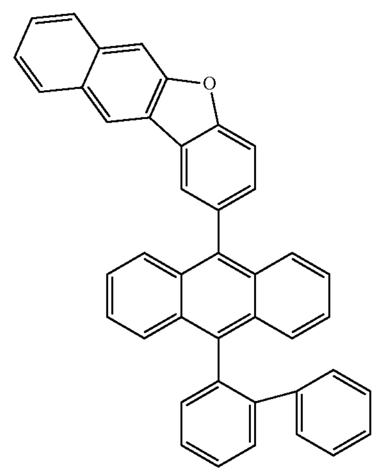
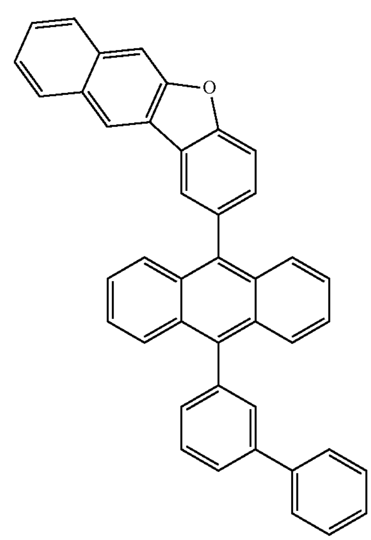

-continued
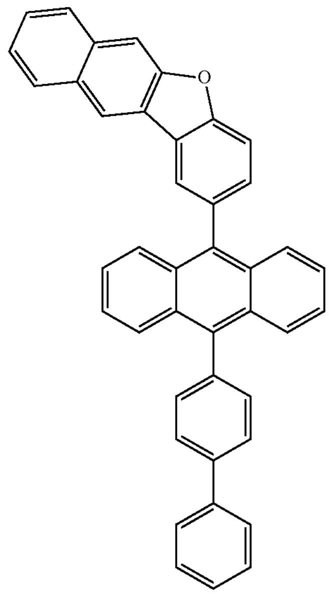
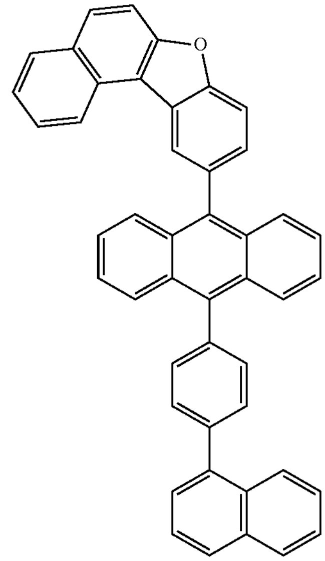
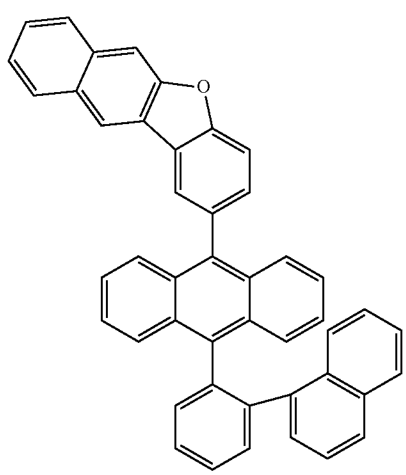
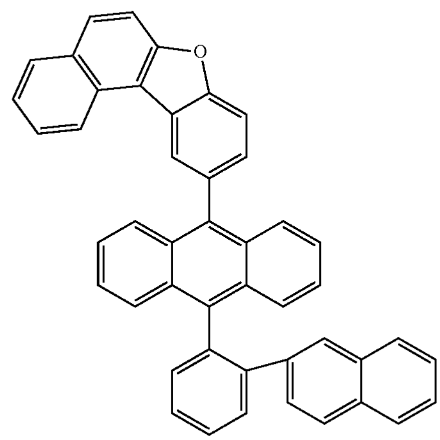
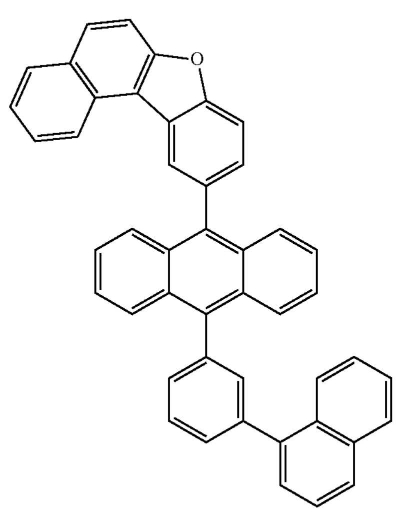
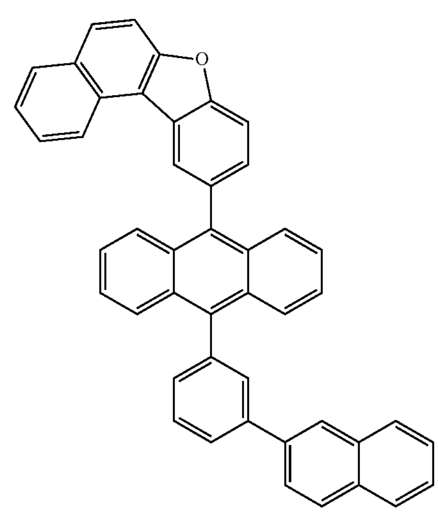
-continued

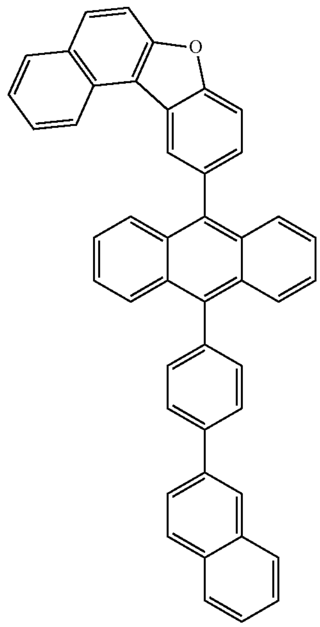
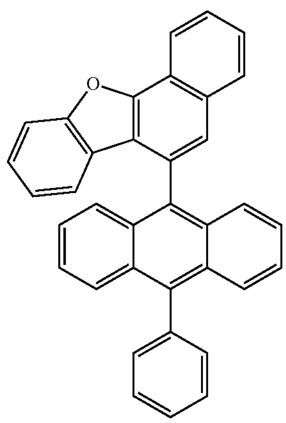
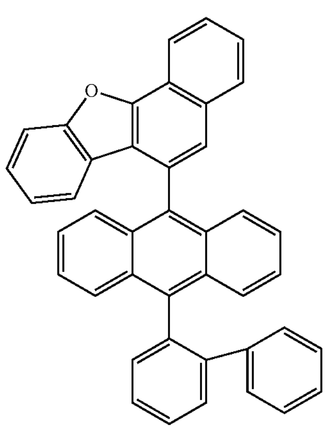
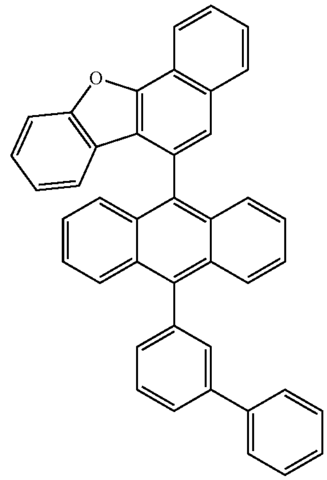
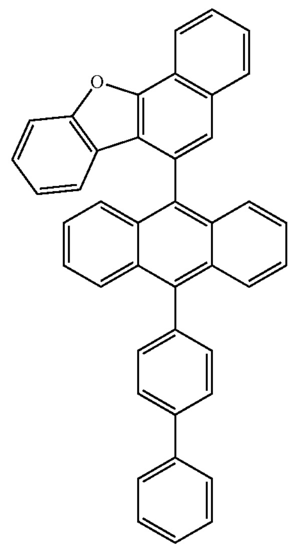
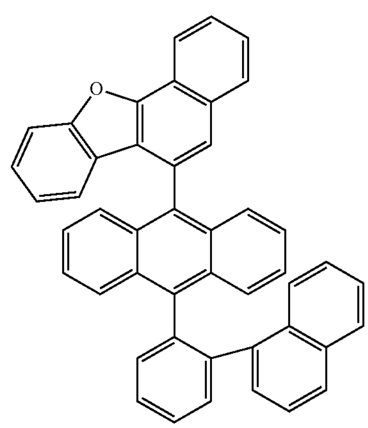

-continued
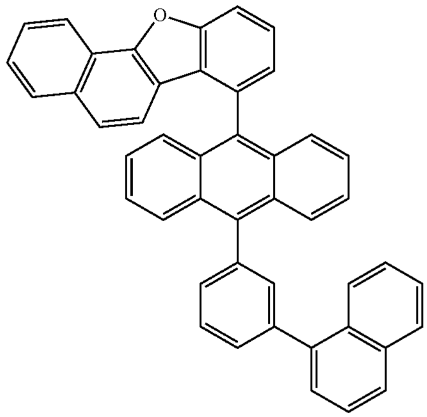
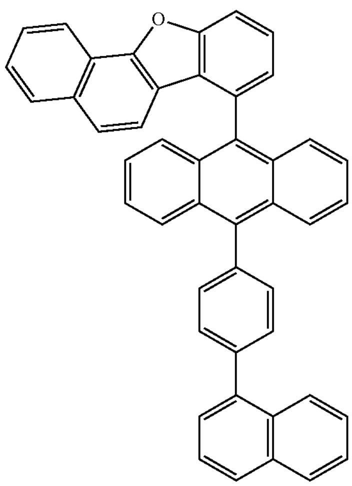
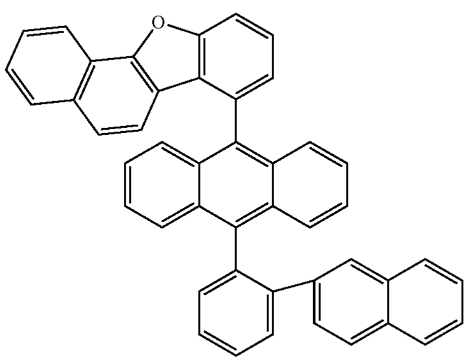
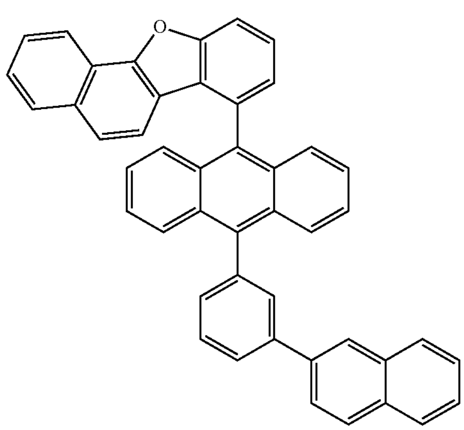
-continued
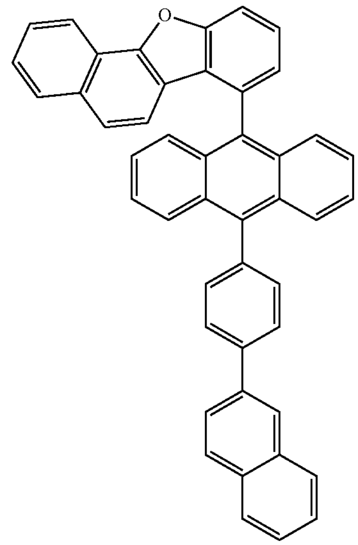
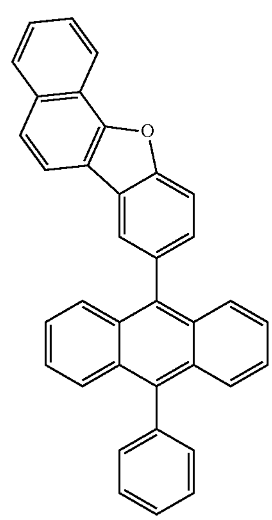
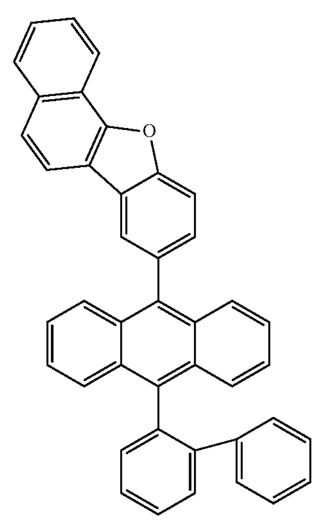

-continued
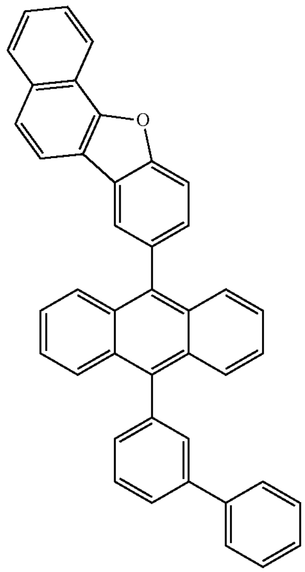
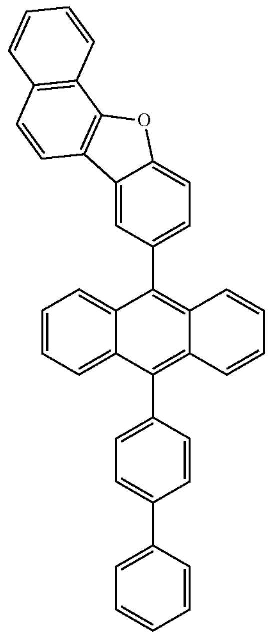
-continued
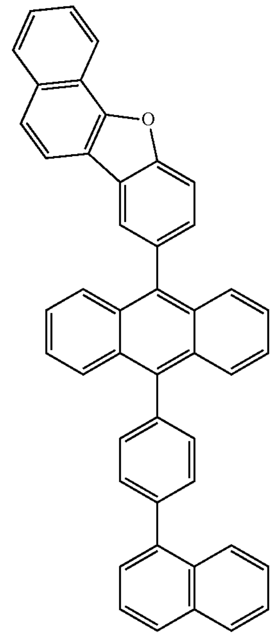
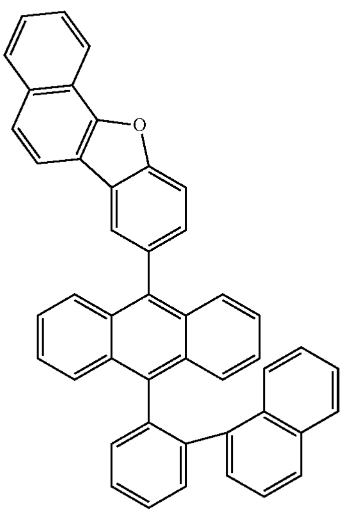
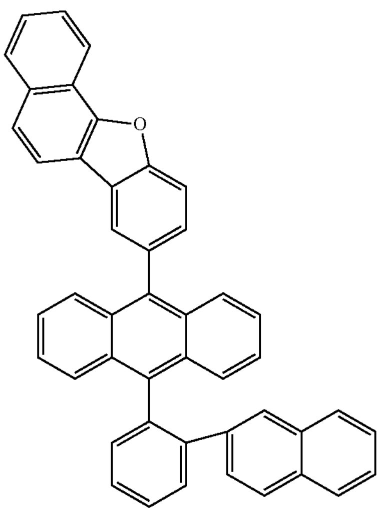
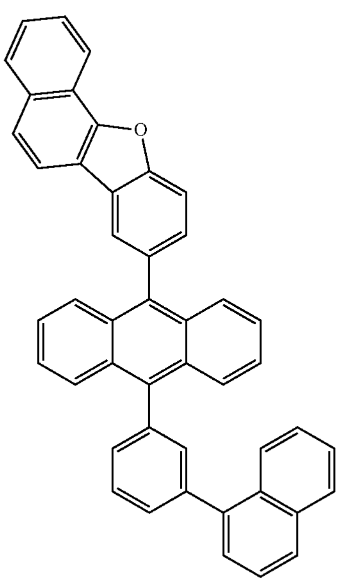
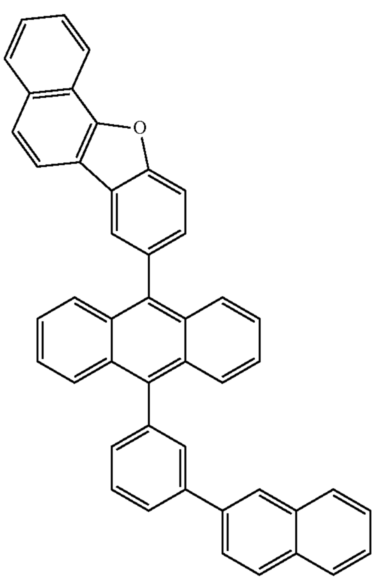

-continued
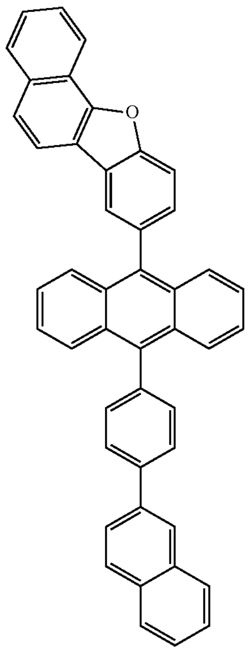
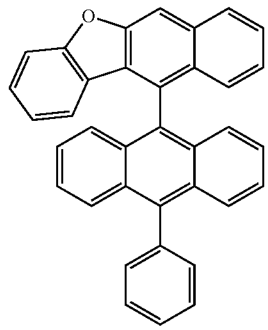
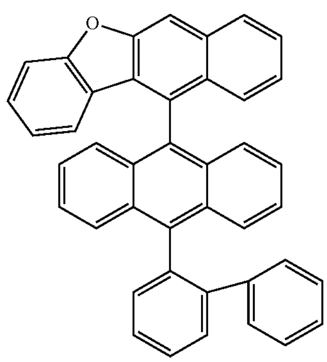
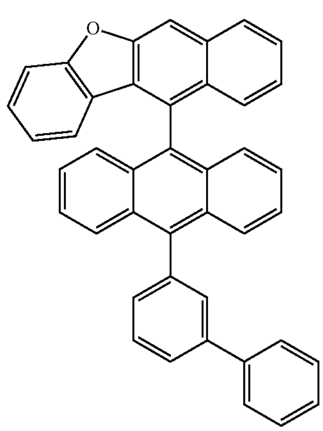
-continued
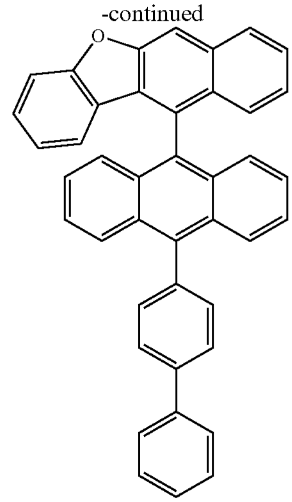
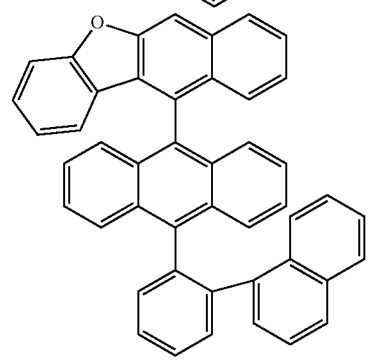
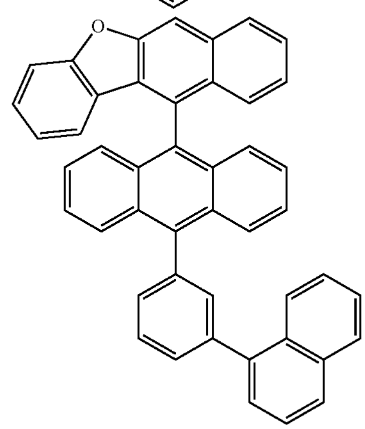
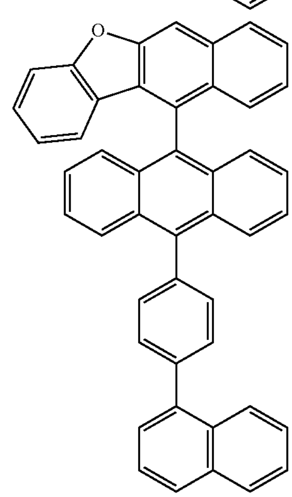

-continued
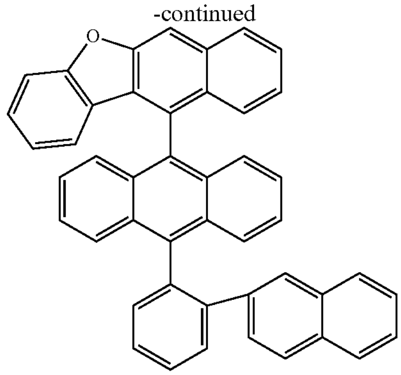
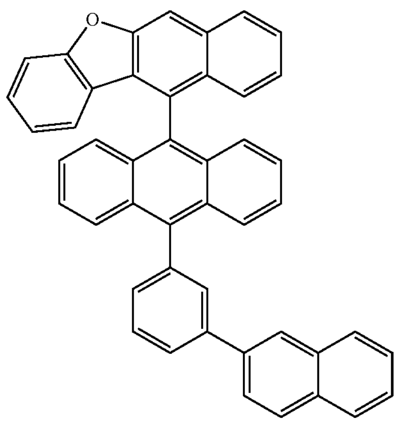
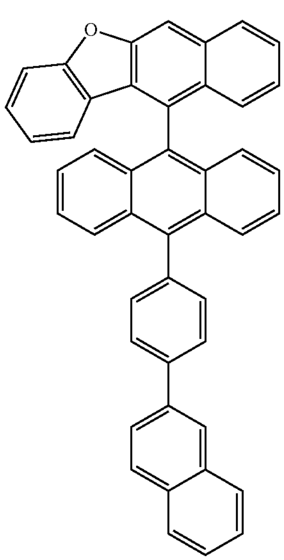
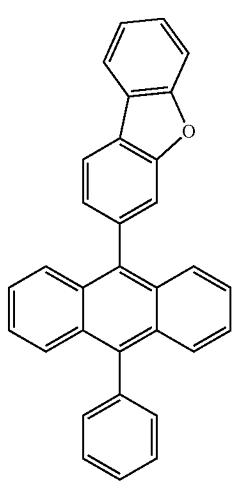
-continued
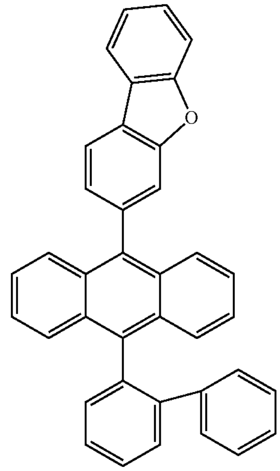
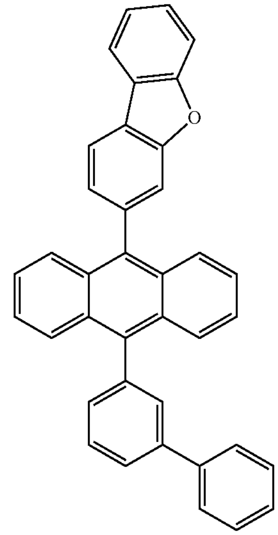
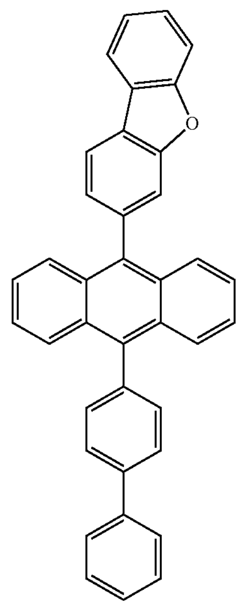
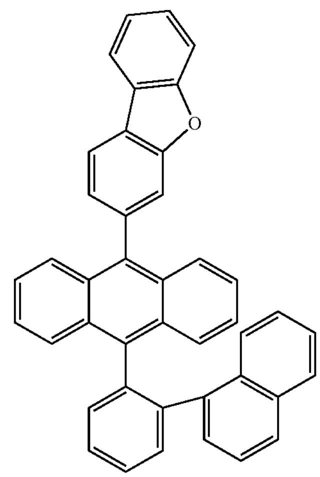
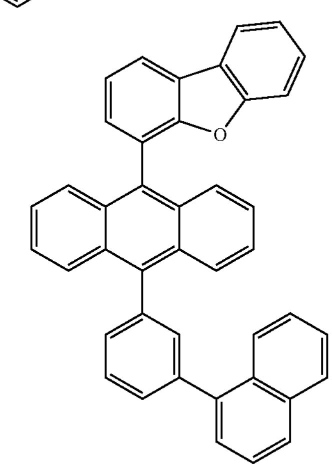

-continued
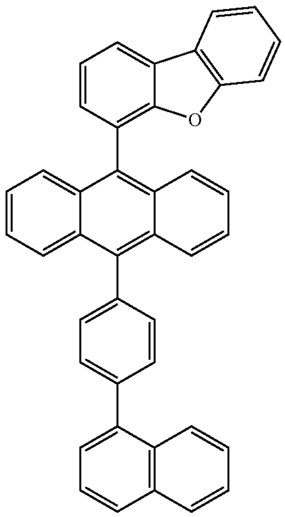 [SMILES: c1ccc2c(-c3ccc(-c4c5ccccc5c(-c5cccc6c5oc5ccccc56)c5ccccc45)cc3)cccc2c1]
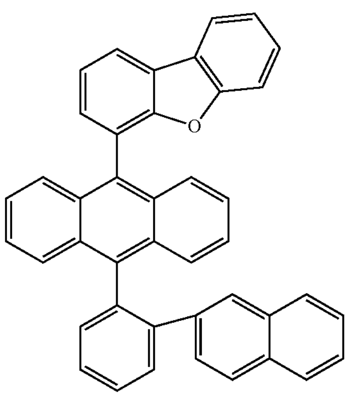
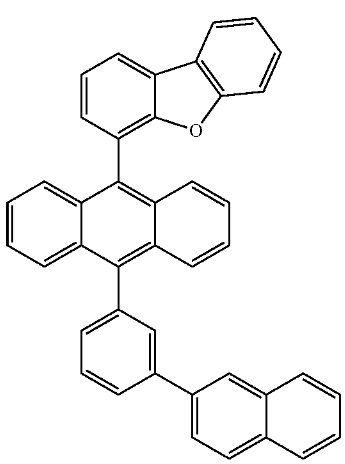
-continued
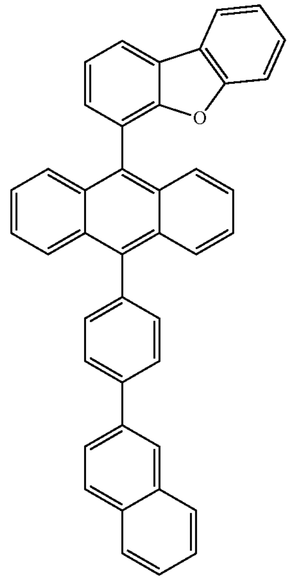 [SMILES: c1ccc2cc(-c3ccc(-c4c5ccccc5c(-c5cccc6c5sc5ccccc56)c5ccccc45)cc3)ccc2c1]
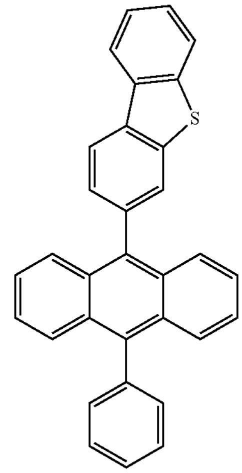
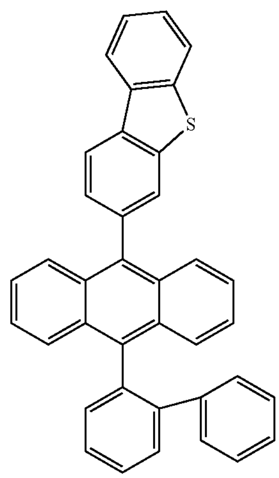
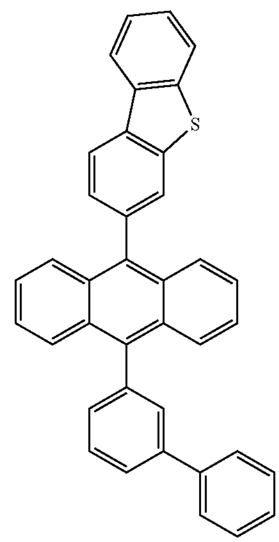
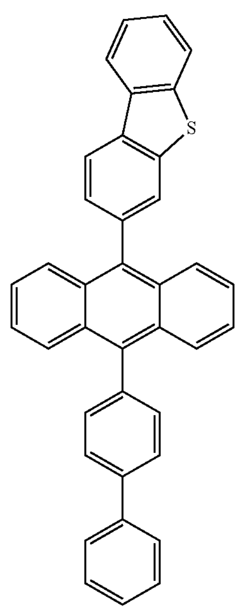
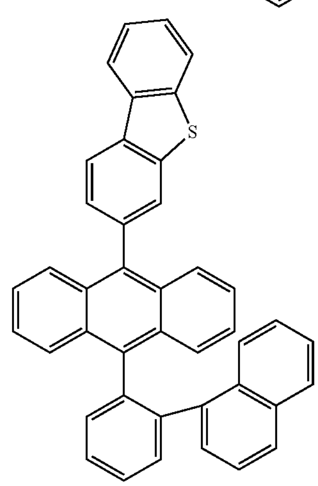

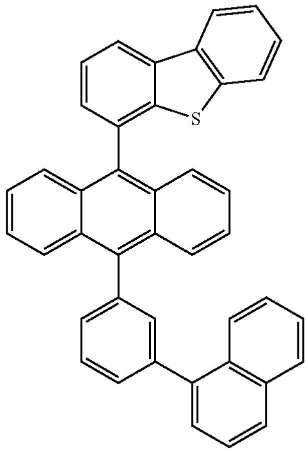
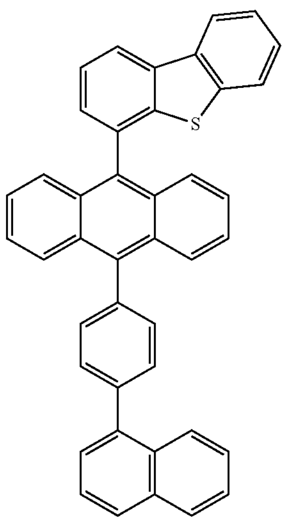
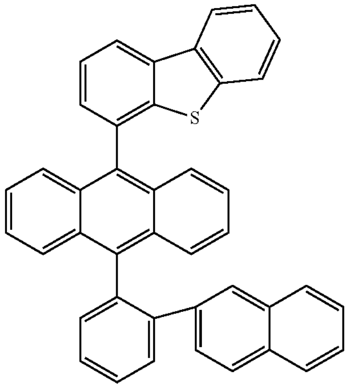
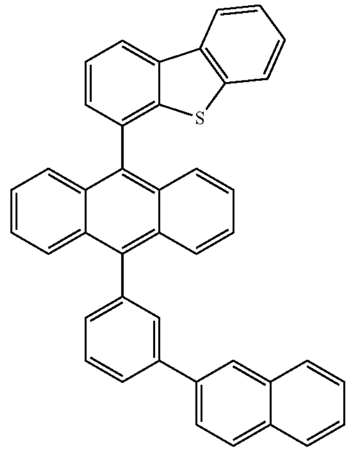
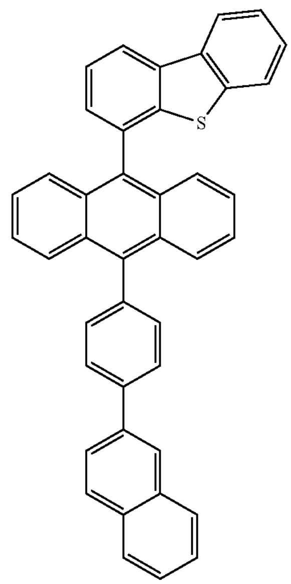
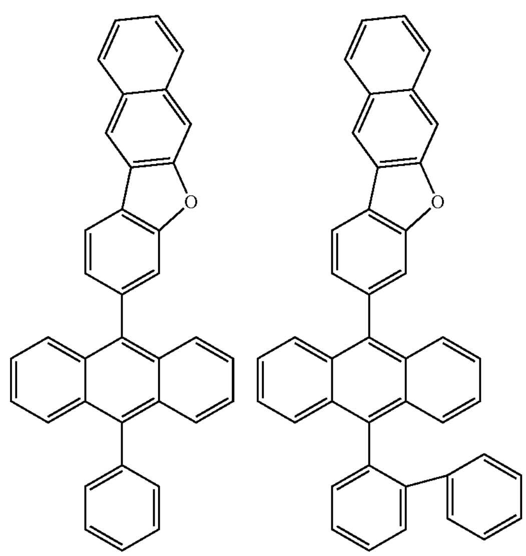

-continued
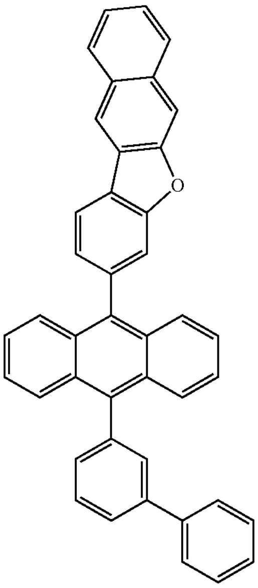
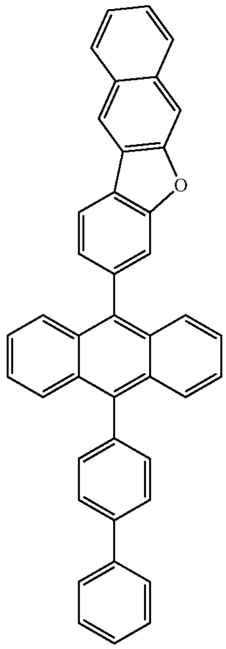
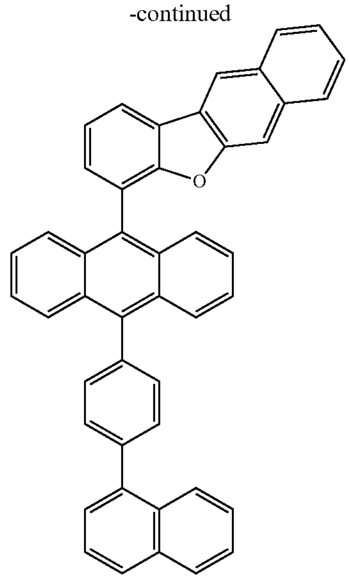
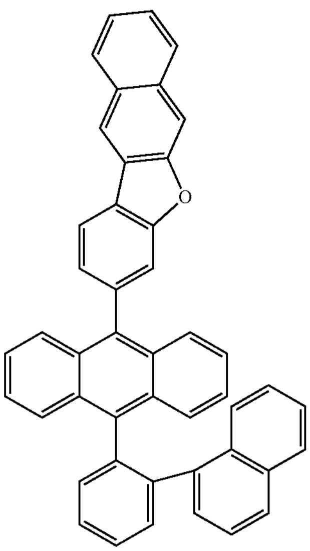
-continued
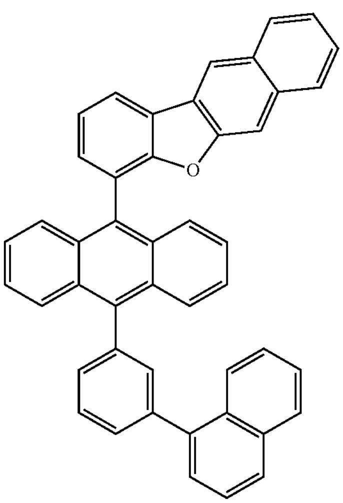
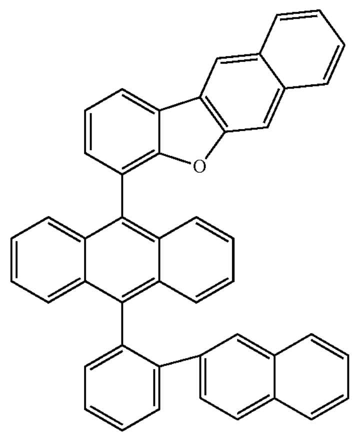
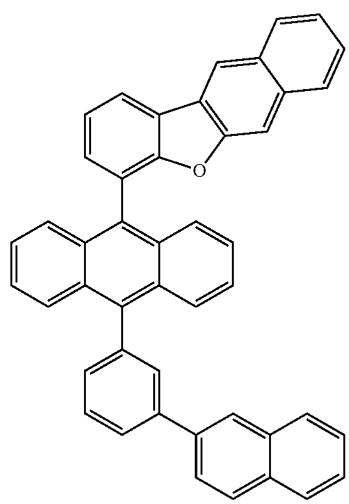

-continued
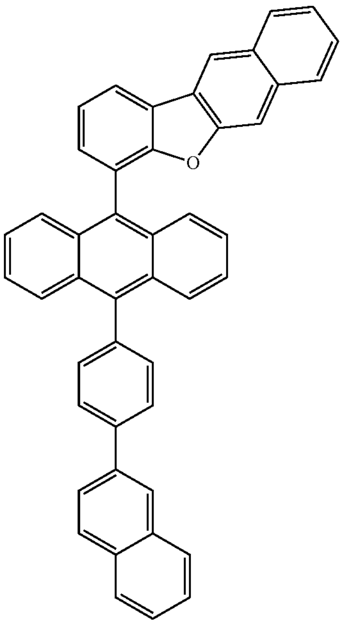
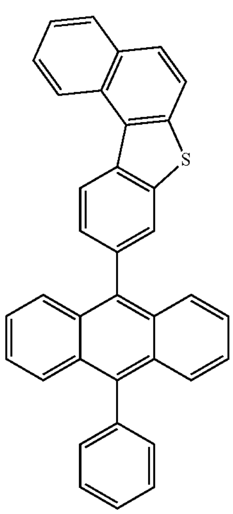
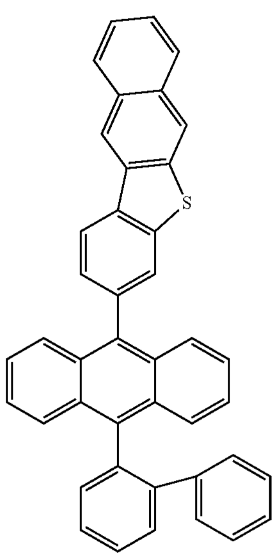
-continued
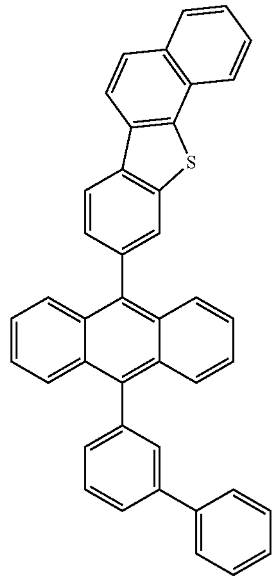
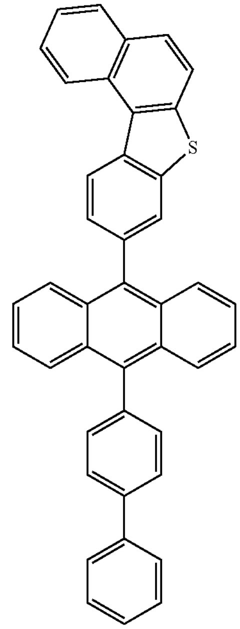
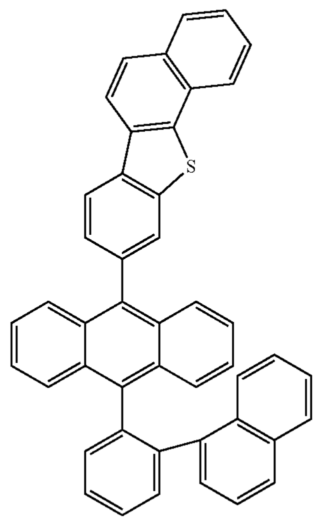
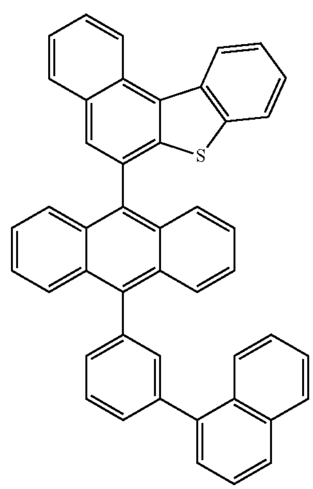

-continued
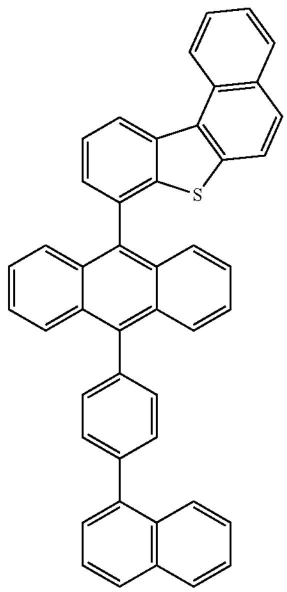
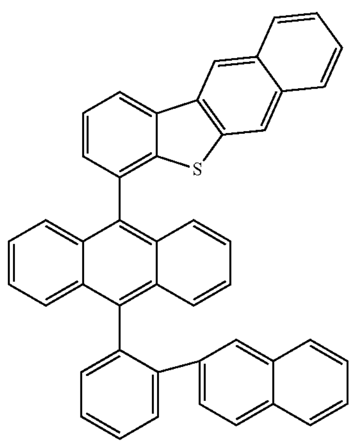
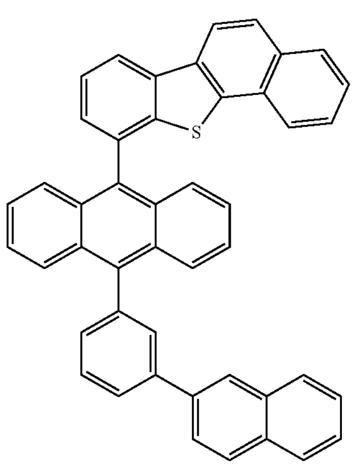
-continued
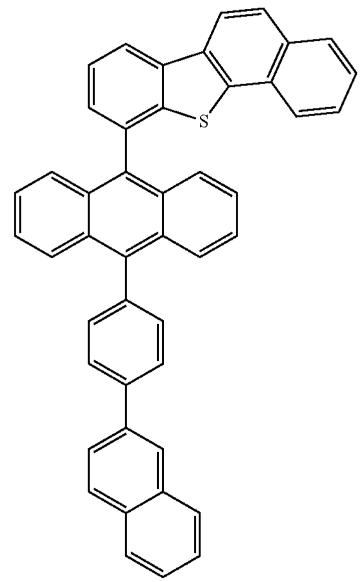
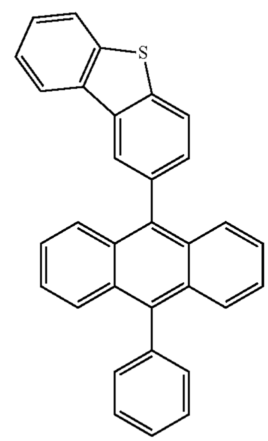
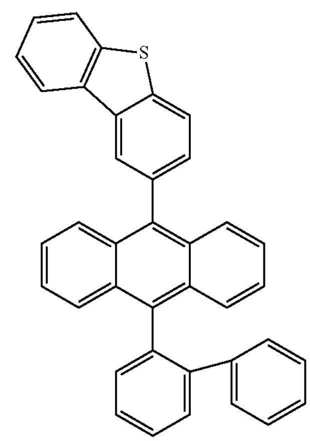
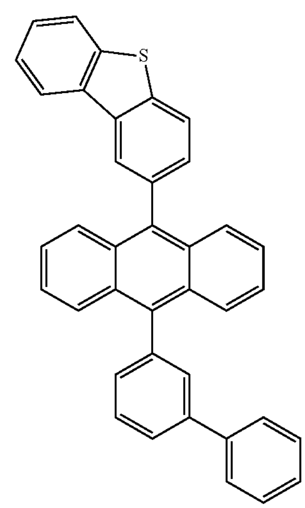
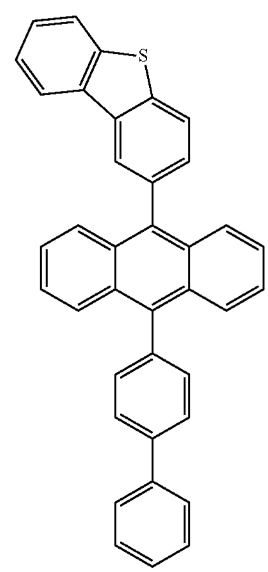

-continued
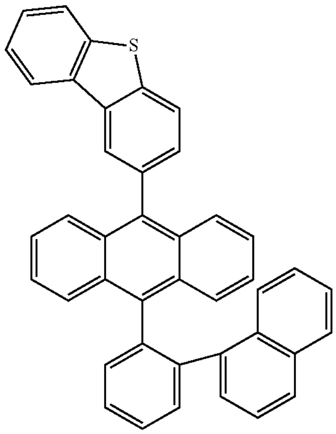
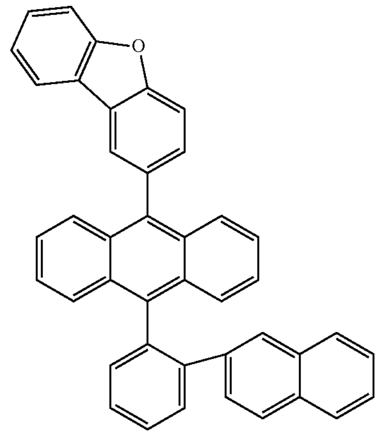
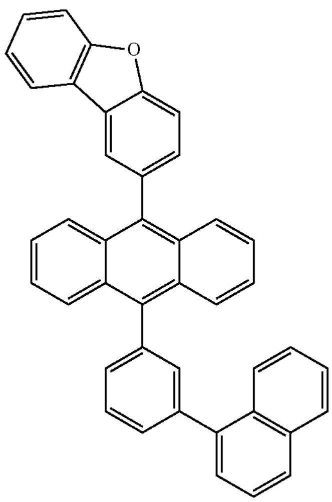
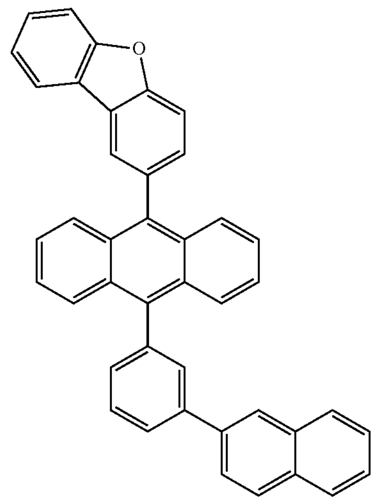
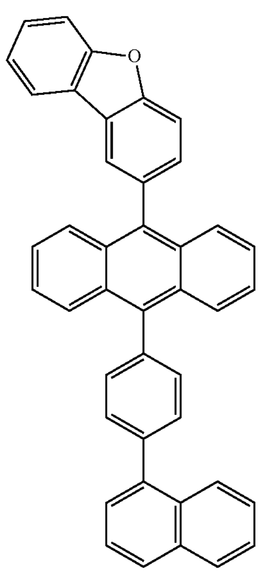
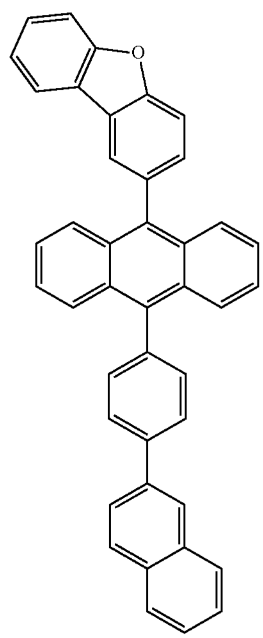
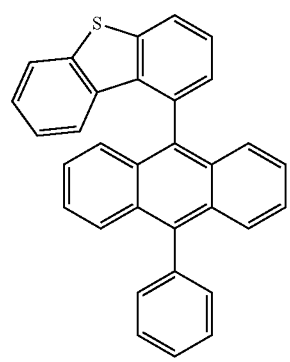

-continued
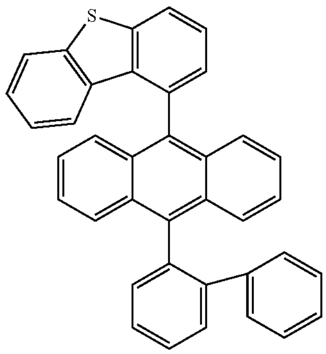
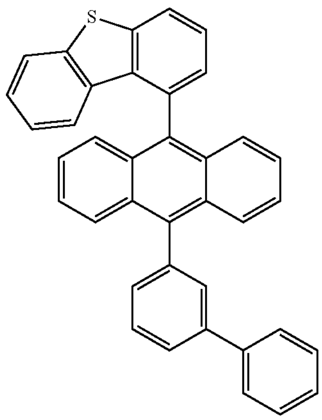
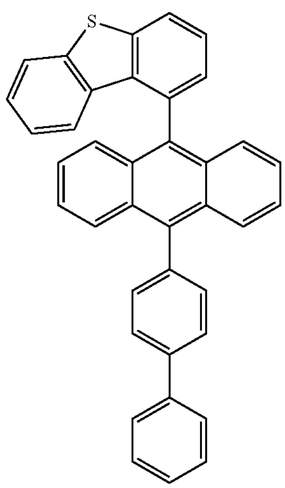
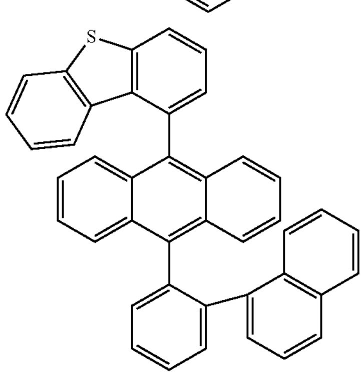
-continued
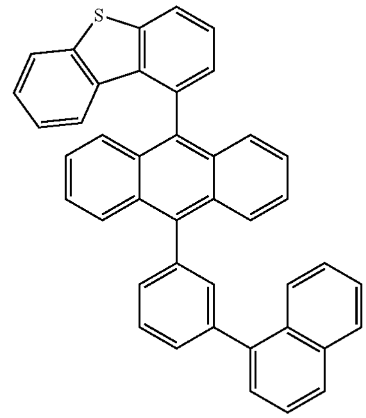
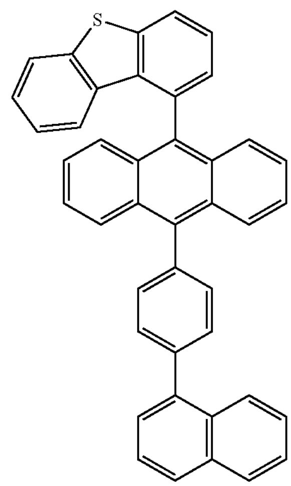
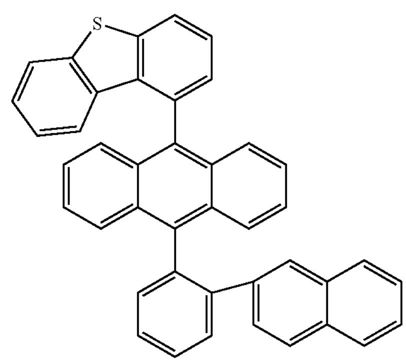
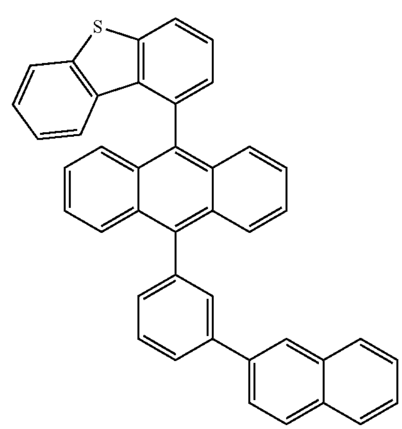

-continued
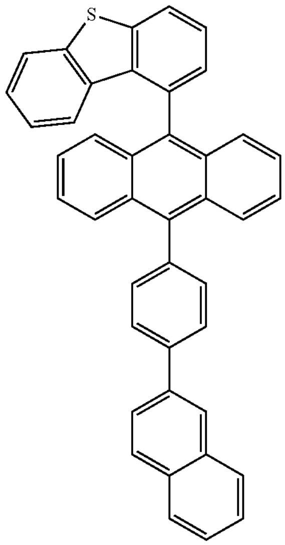
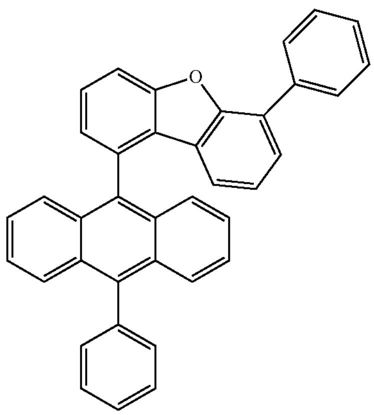
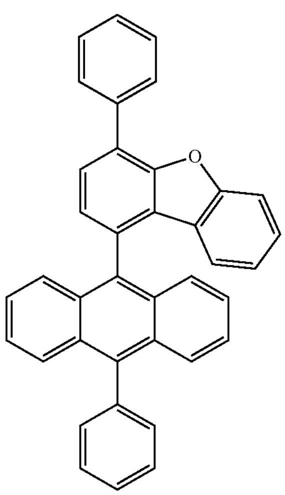
-continued
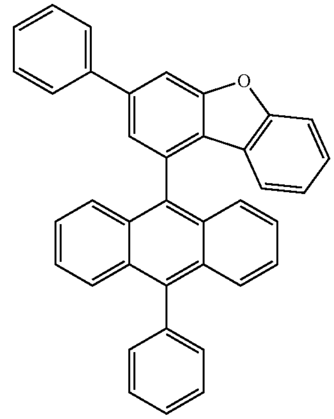
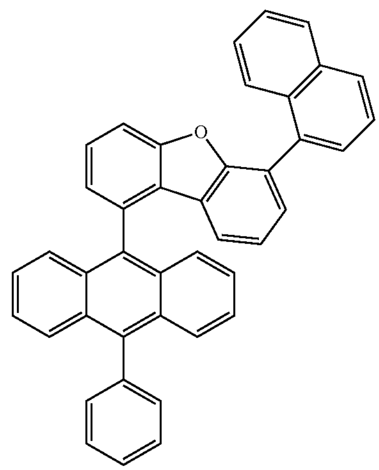
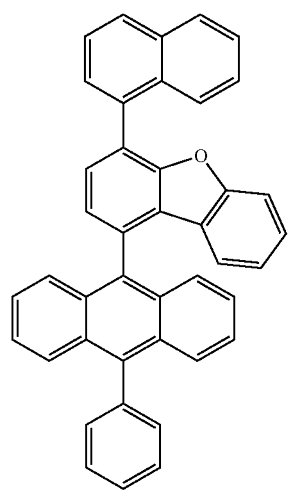

-continued
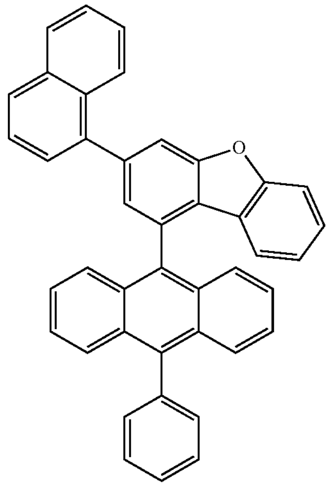
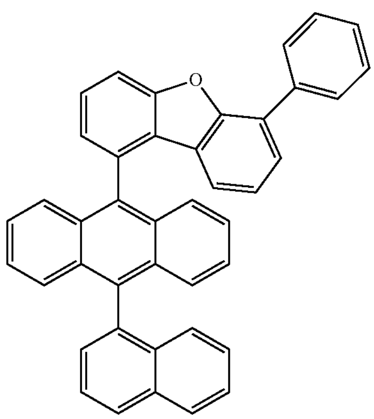
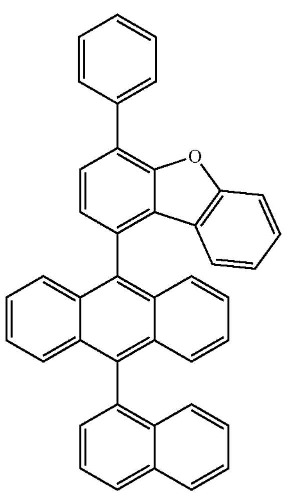
-continued
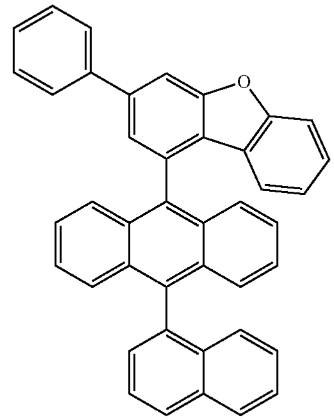
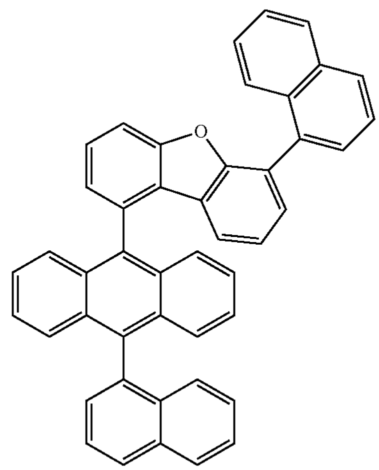
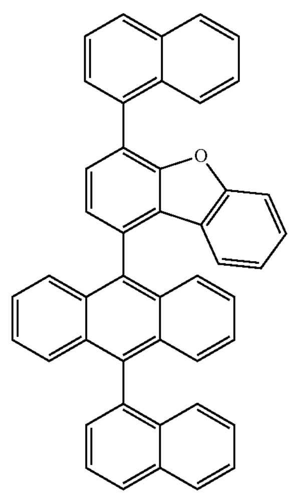

-continued
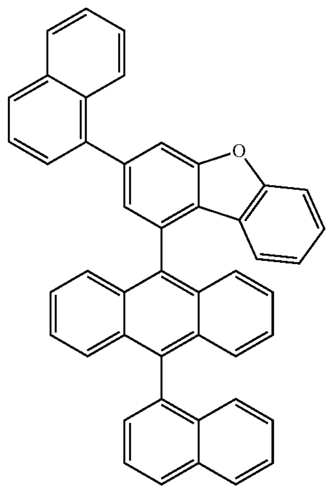
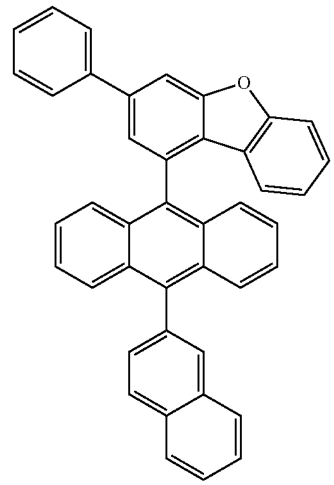
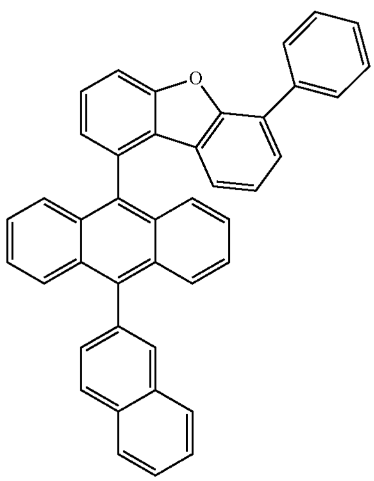
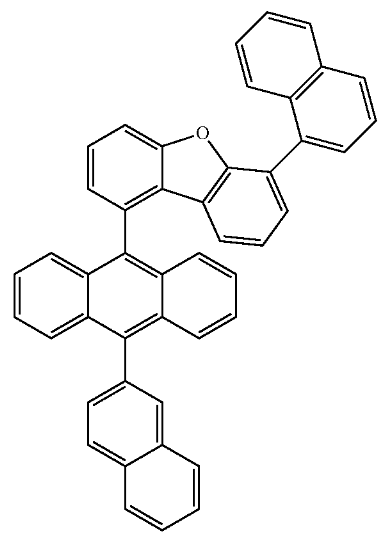
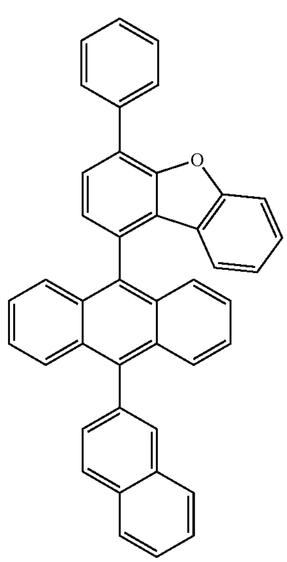
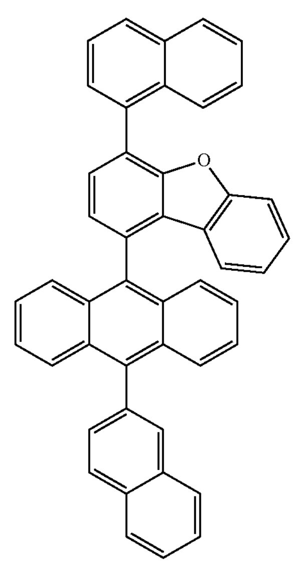

-continued
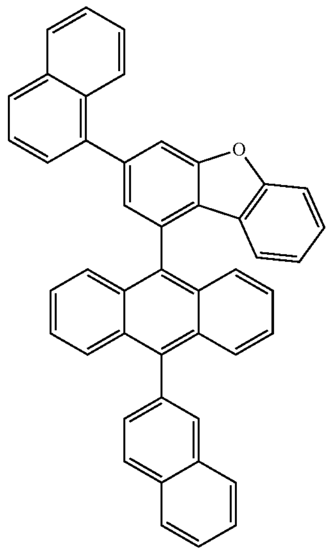
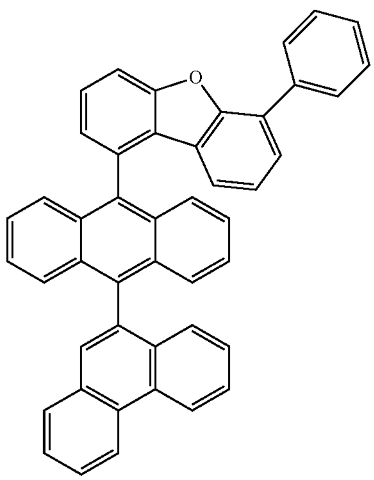
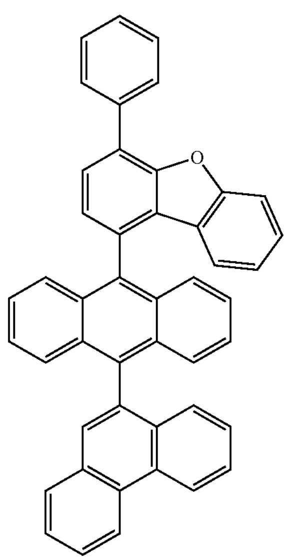
-continued
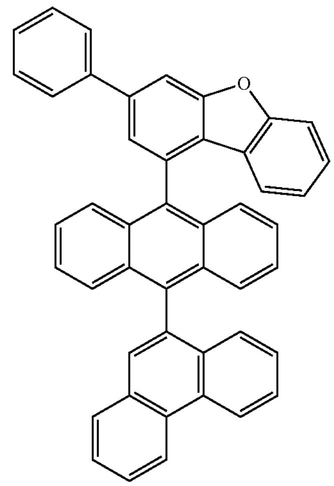
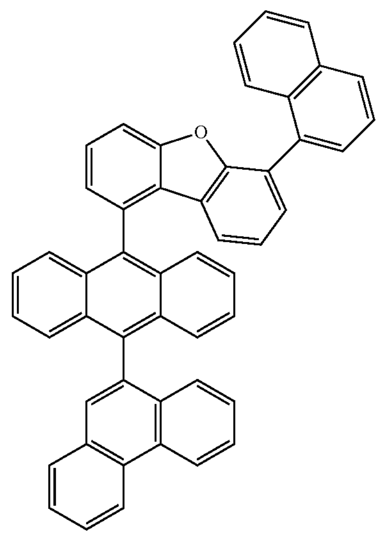
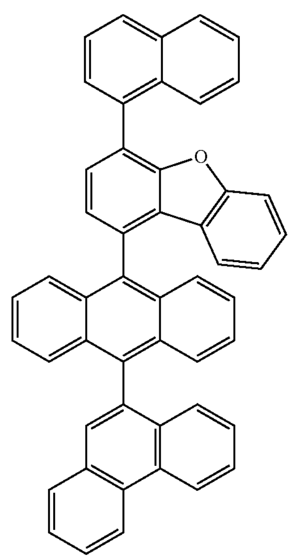

-continued
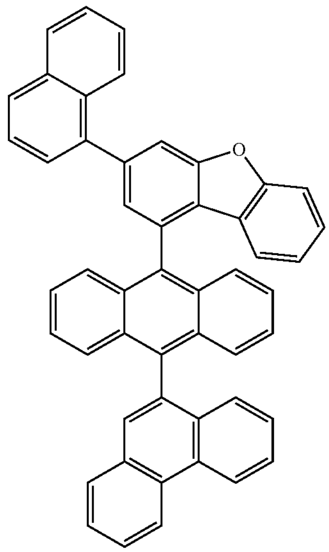
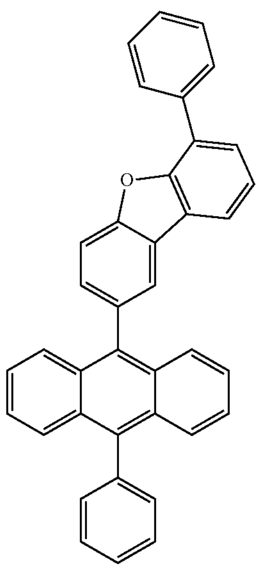
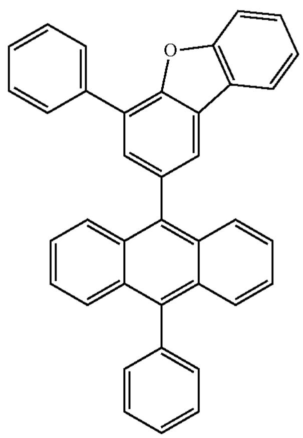
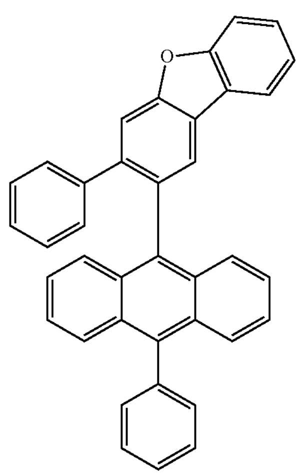
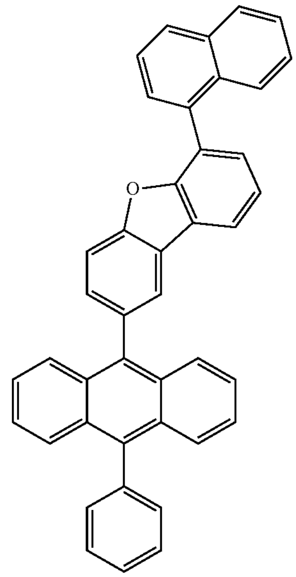
-continued
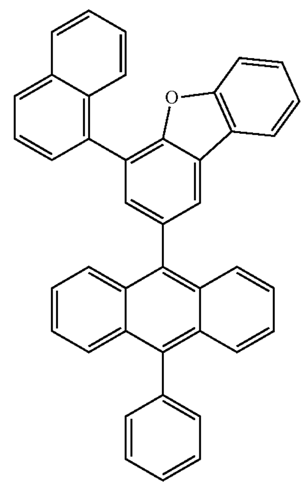
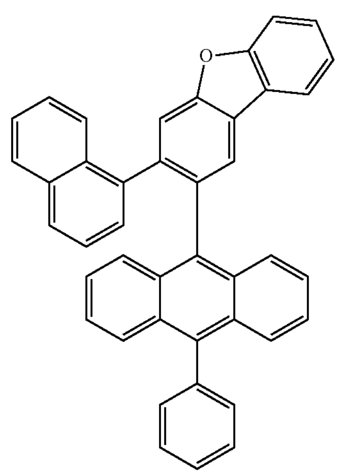

-continued
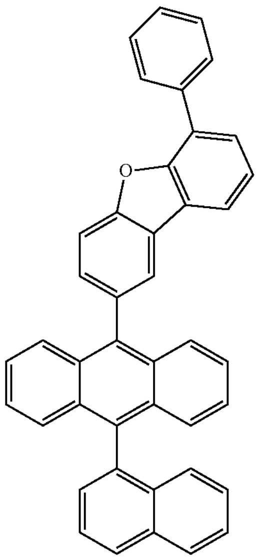
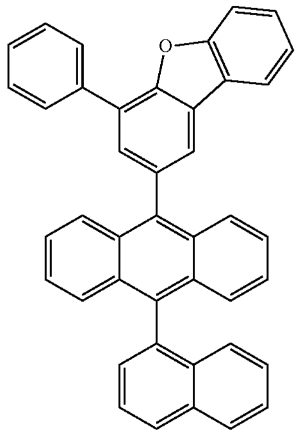
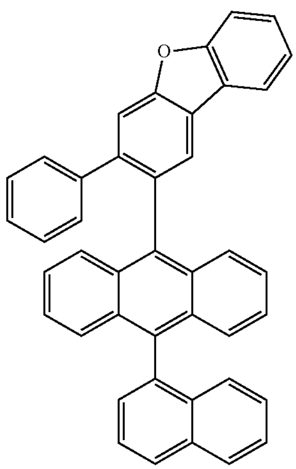
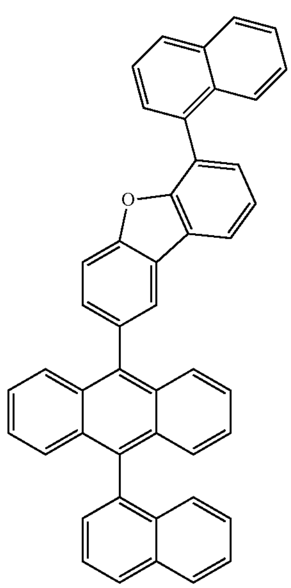
-continued
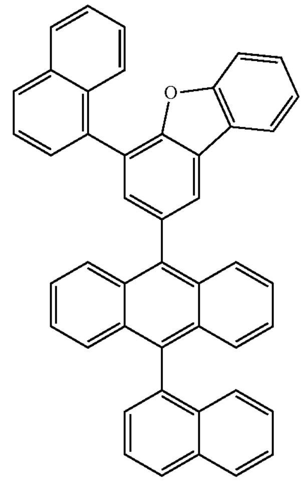
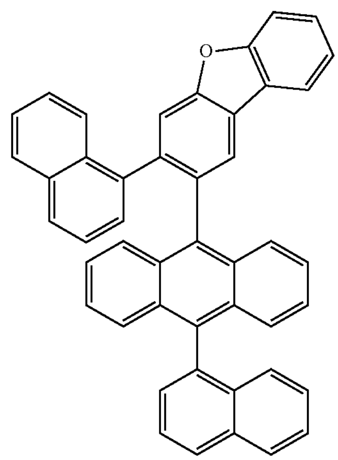
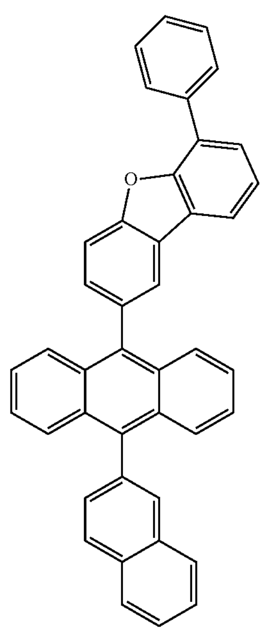
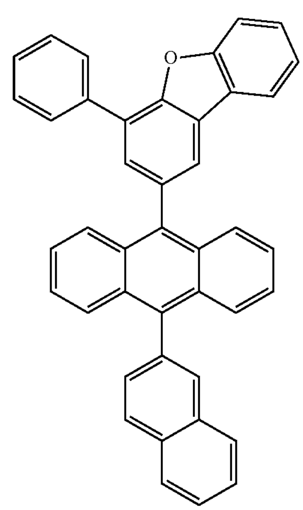

-continued
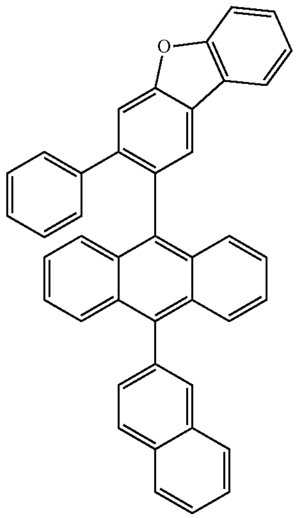
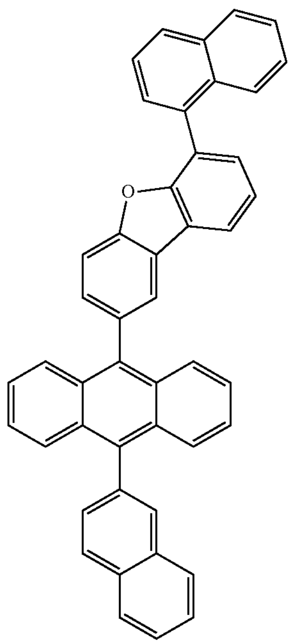
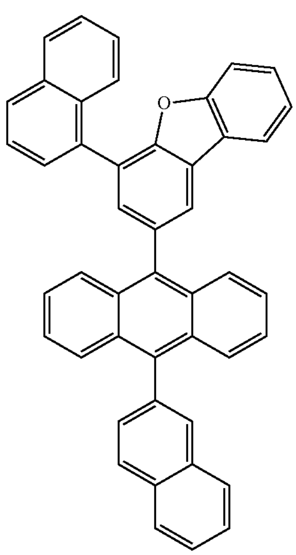
-continued
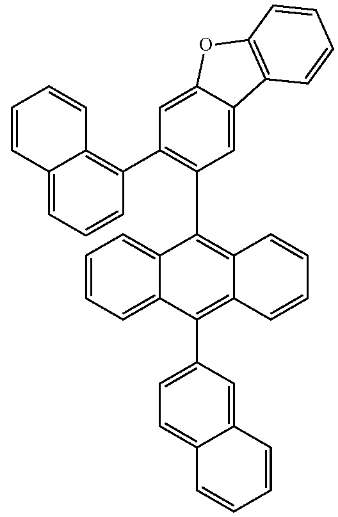
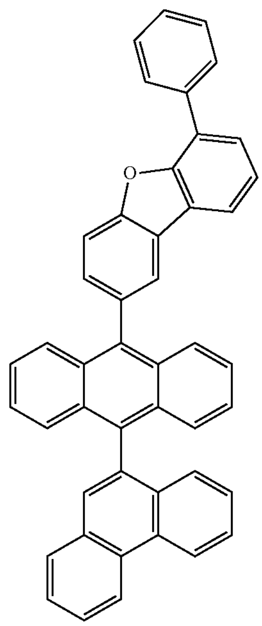
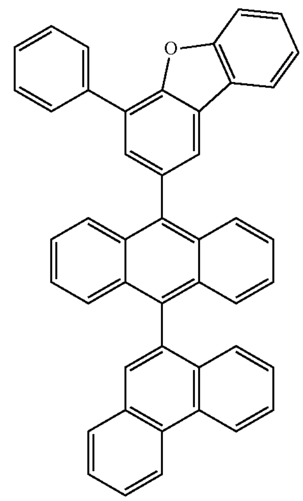
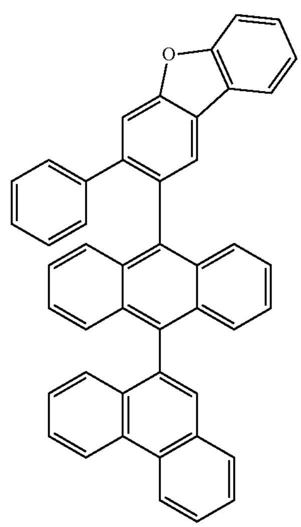

-continued
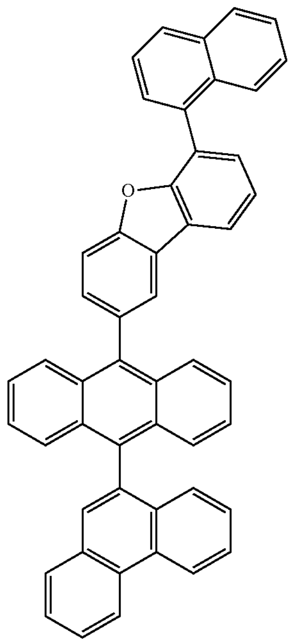
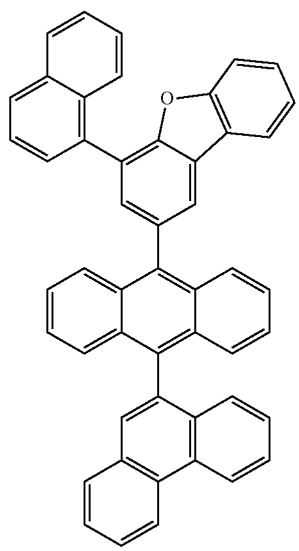
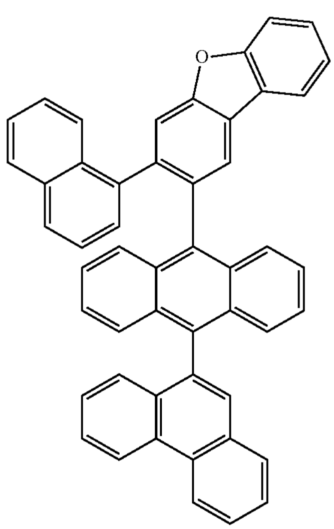
-continued
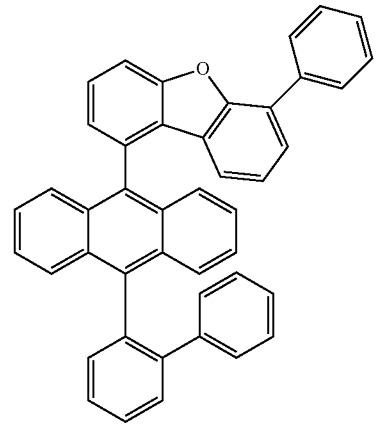
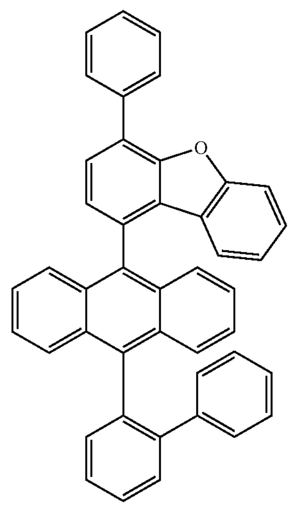
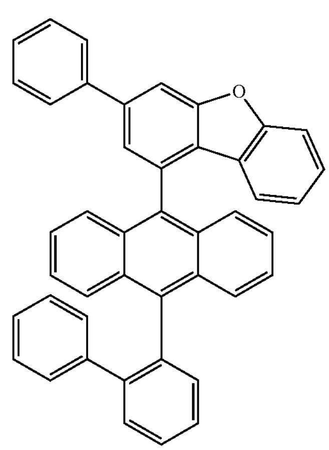

-continued
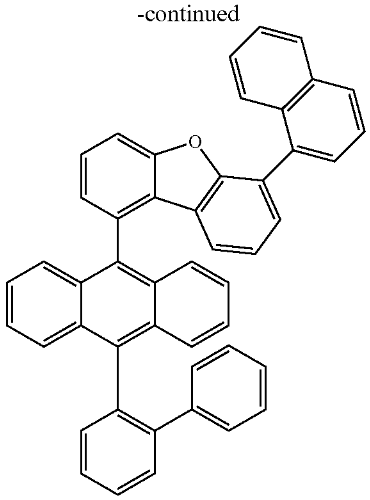
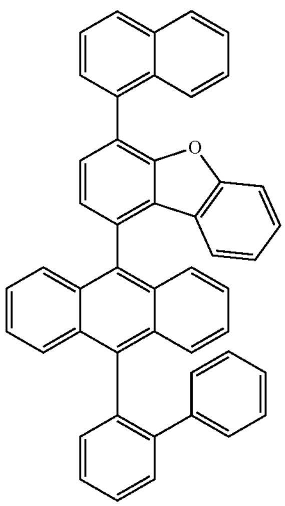
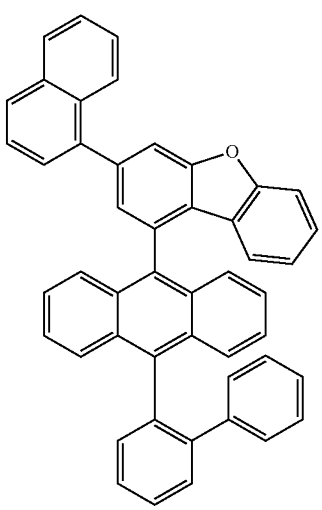
-continued
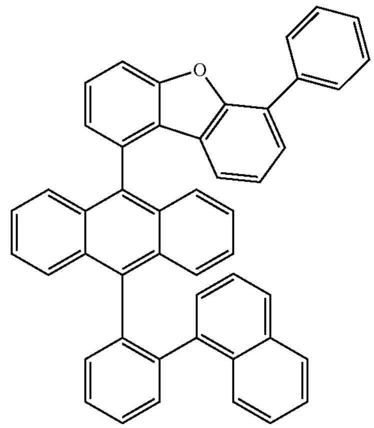
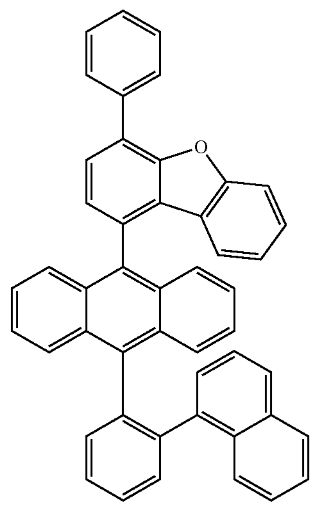
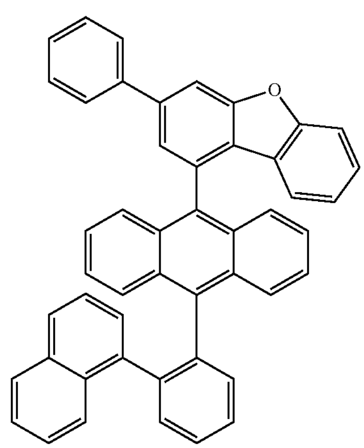

-continued
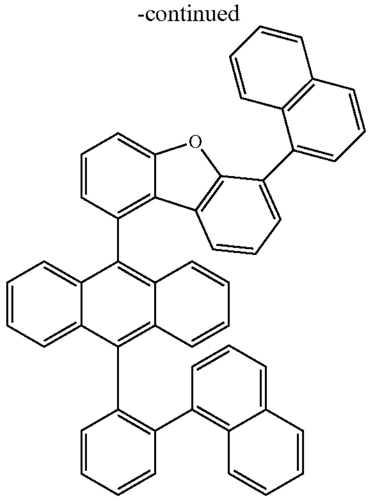
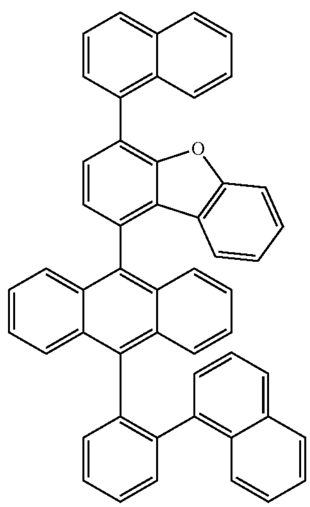
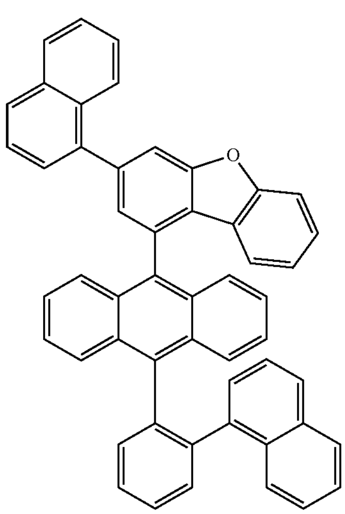
-continued
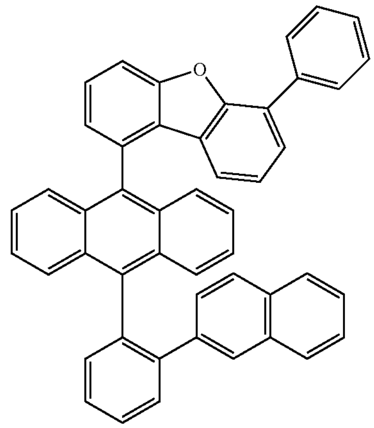
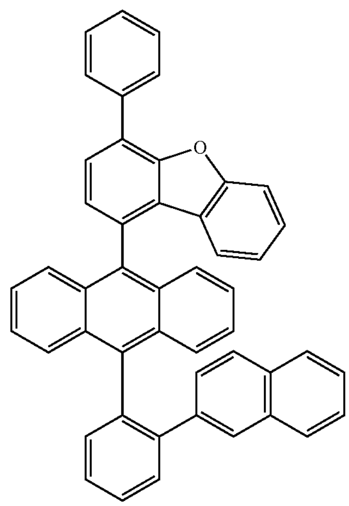
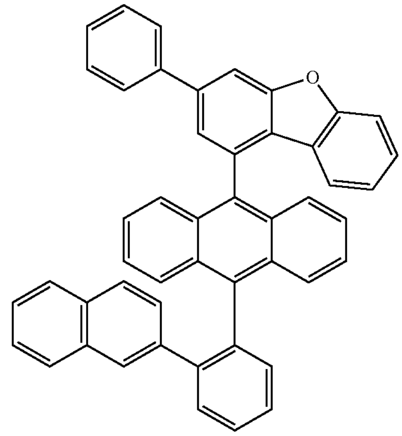

-continued
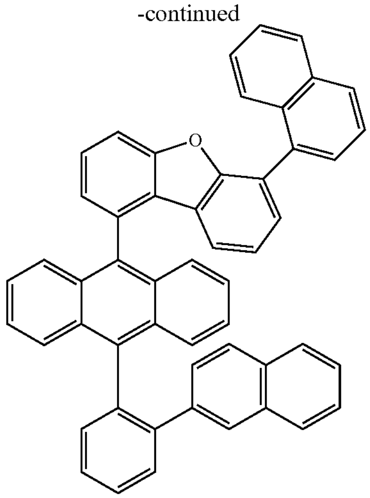
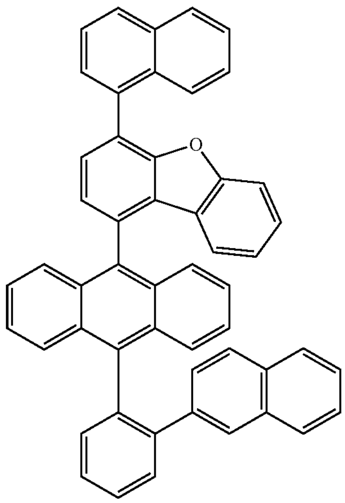
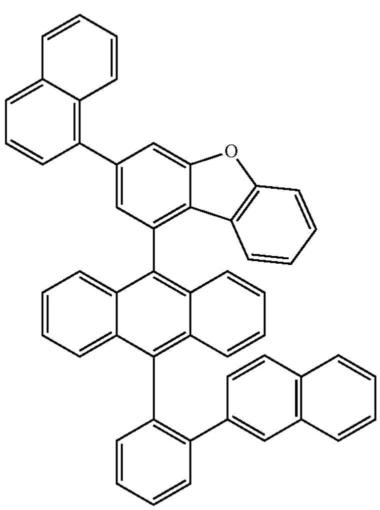
-continued
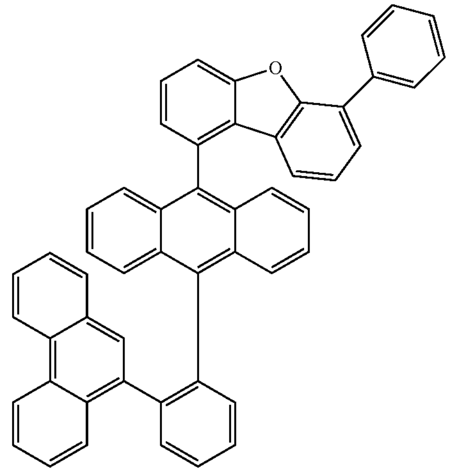
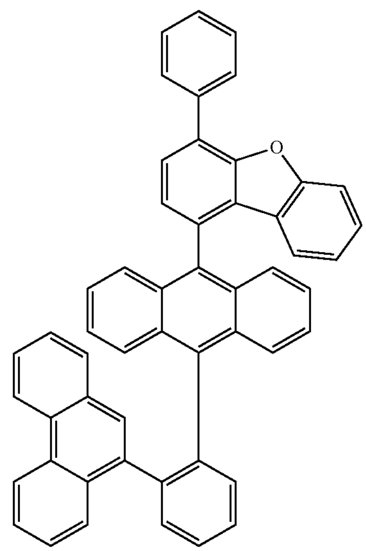
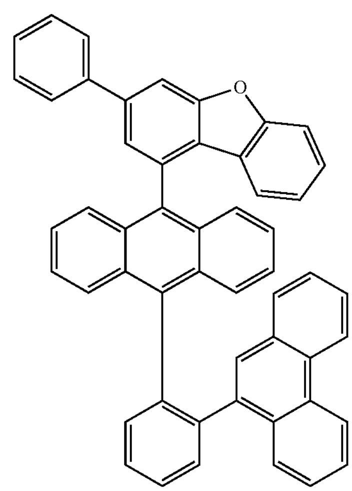

-continued
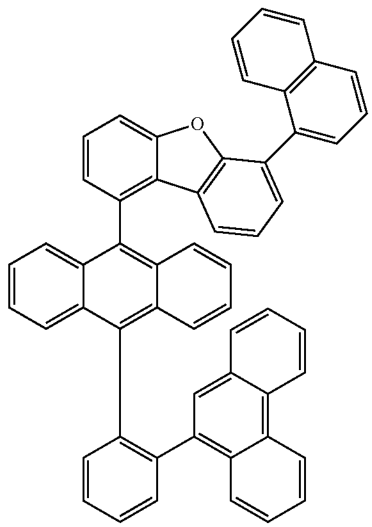
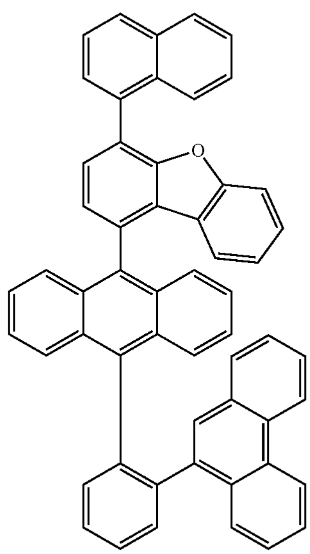
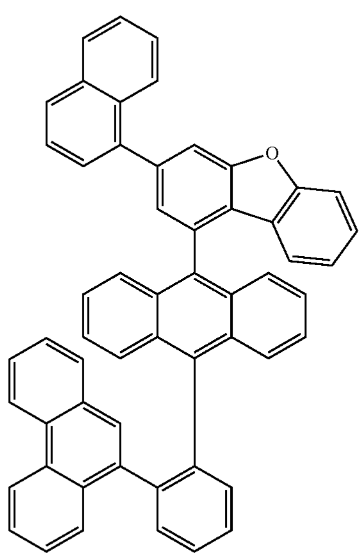
-continued
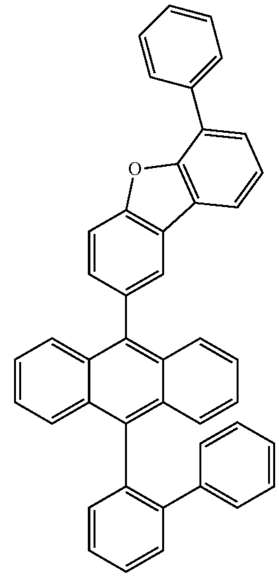
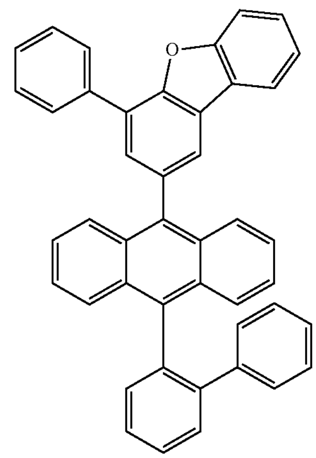
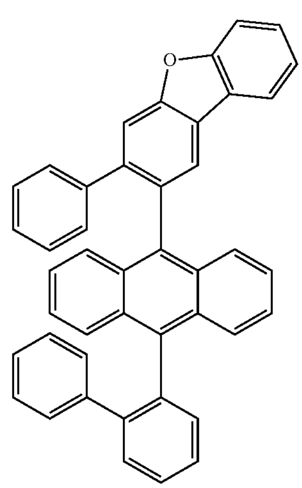
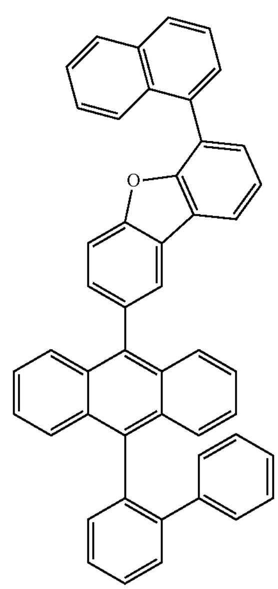

-continued
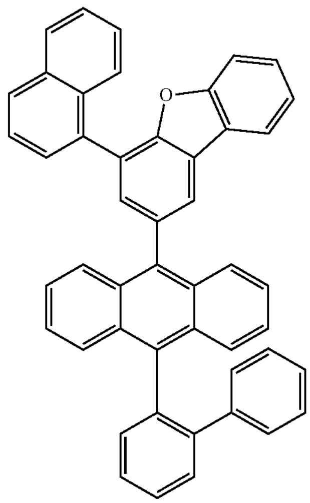
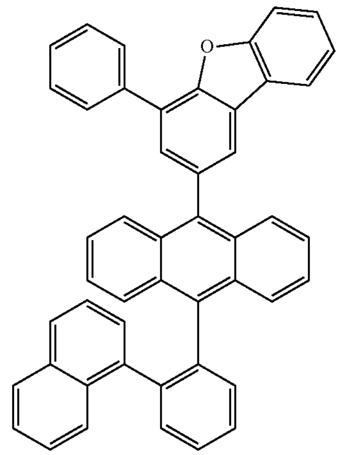
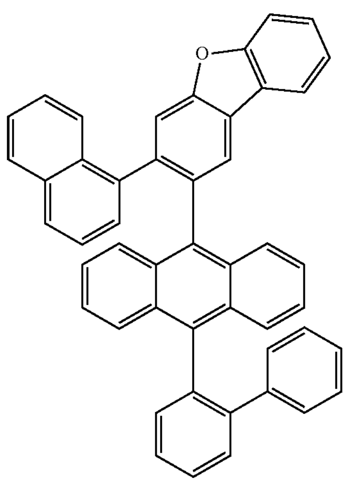
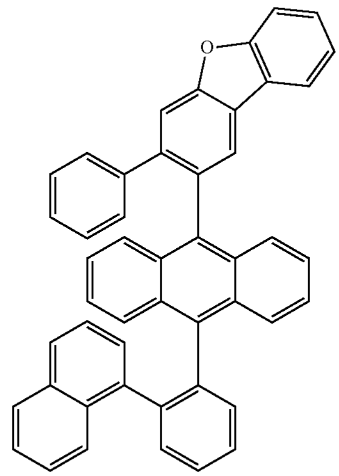
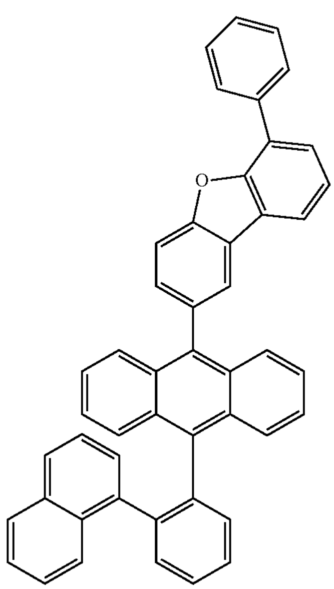
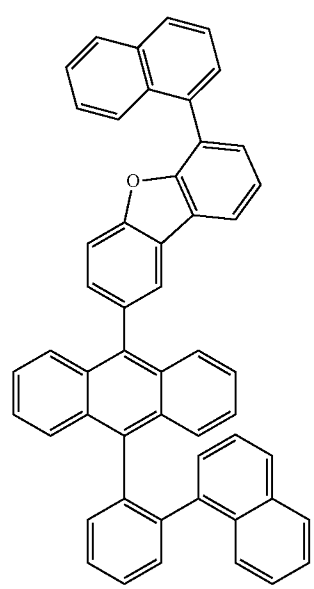
-continued -continued
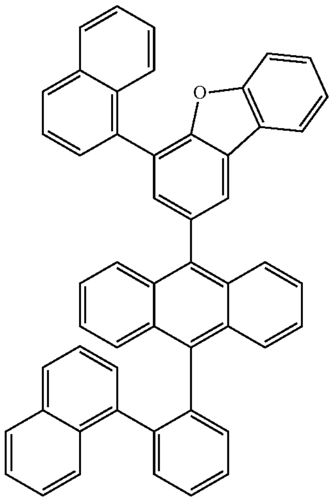
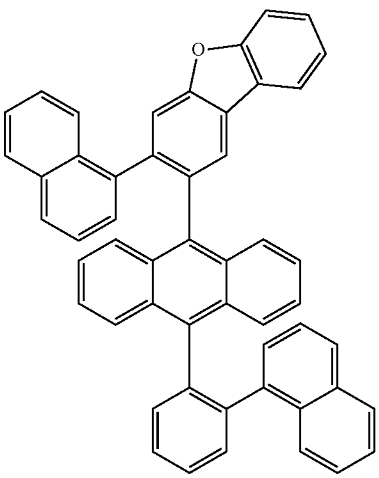
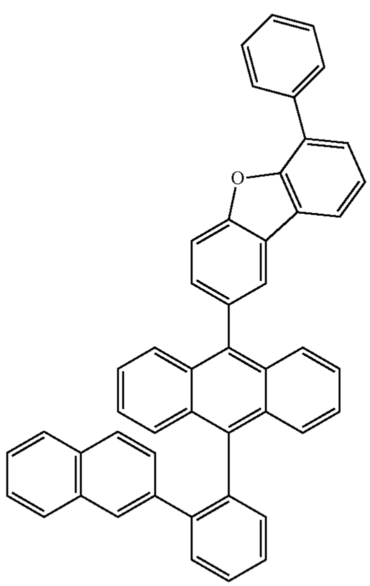
-continued
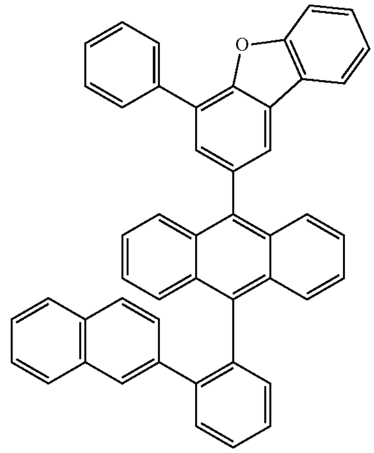
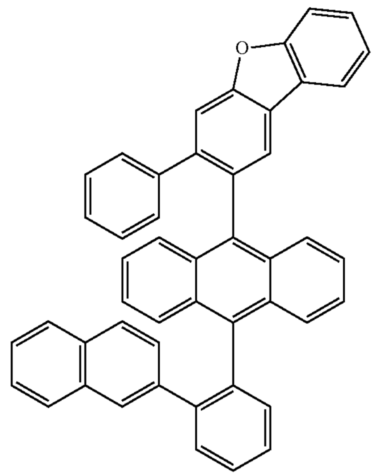
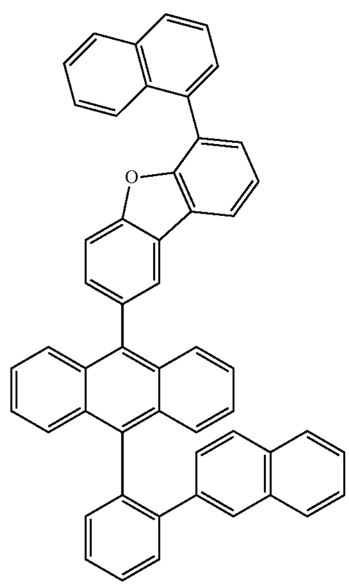

-continued
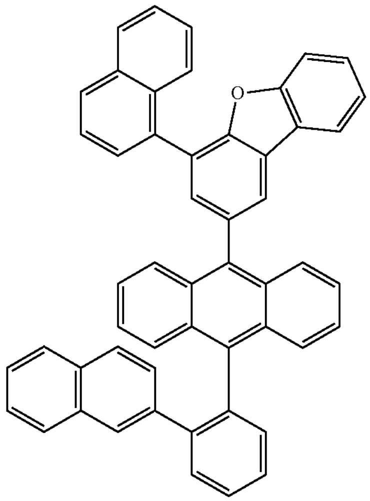
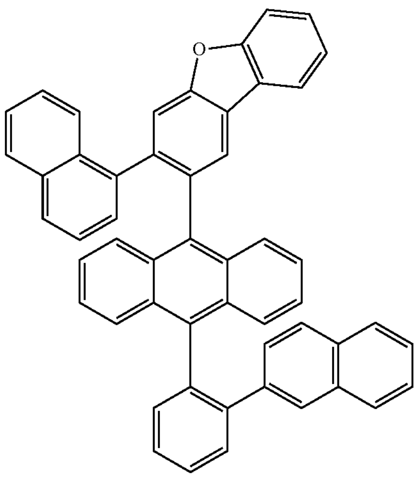
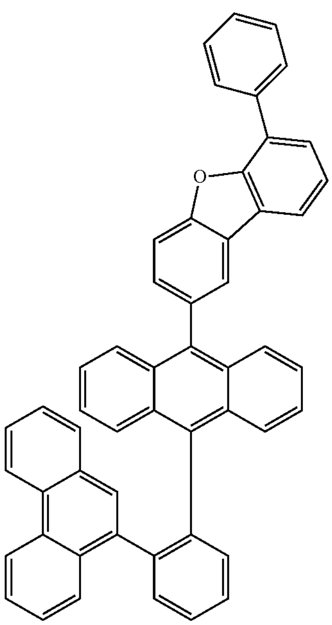
-continued
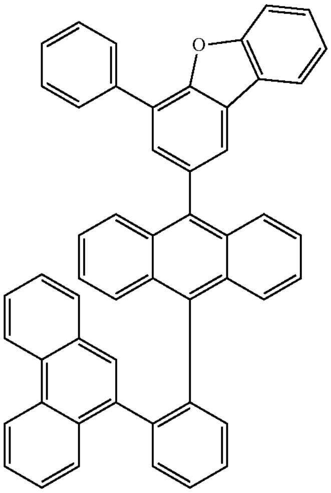
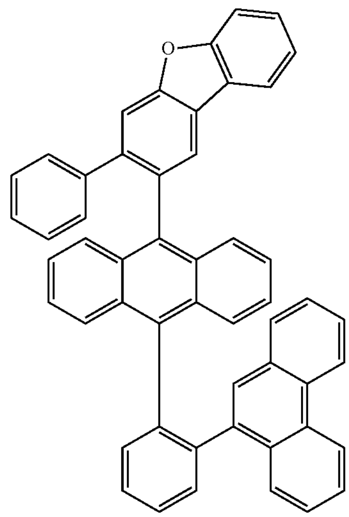
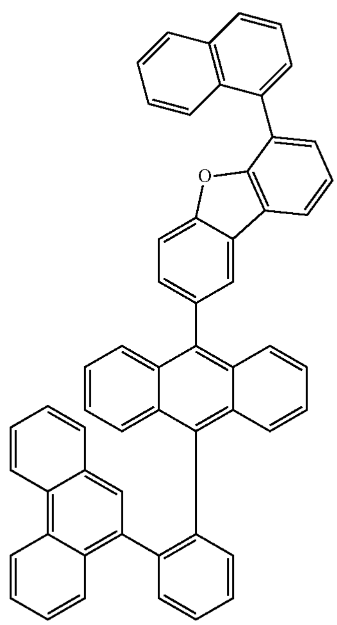

-continued

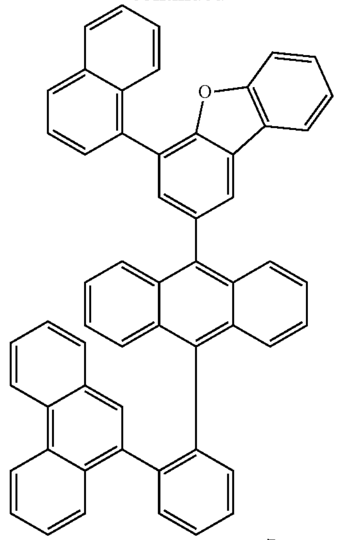

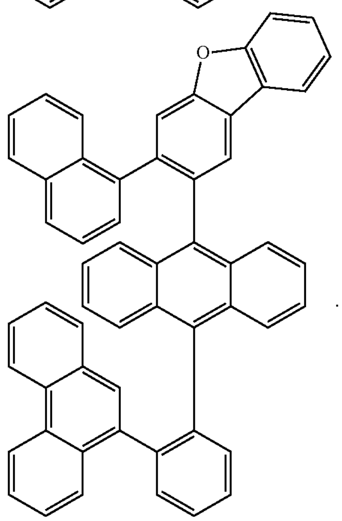

According to one embodiment of the present specification, in Chemical Formula C, La to Lc are the same as or different from each other, and each independently is a direct bond; a substituted or unsubstituted arylene group having 6 to 50 carbon atoms; or a substituted or unsubstituted divalent heterocyclic group having 2 to 50 carbon atoms.

According to one embodiment of the present specification, in Chemical Formula C, La to Lc are the same as or different from each other, and each independently is a direct bond, a substituted or unsubstituted phenylene group, a substituted or unsubstituted biphenylene group, a substituted or unsubstituted terphenylene group, a substituted or unsubstituted naphthylene group, or a substituted or unsubstituted fluorenylene group.

According to one embodiment of the present specification, in Chemical Formula C, La to Lc are the same as or different from each other, and each independently is a direct bond, a phenylene group, a biphenylene group, a terphenylene group, a naphthylene group, or a fluorenylene group that is unsubstituted or substituted with a methyl group or a phenyl group.

According to one embodiment of the present specification, in Chemical Formula C, La to Lc are the same as or different from each other, and each independently is a direct bond, a phenylene group, a biphenylene group, or a terphenylene group.

According to one embodiment of the present specification, in Chemical Formula C, Ara to Arc are the same as or different from each other, and each independently is hydrogen, a substituted or unsubstituted aryl group having 6 to 50 carbon atoms, or a substituted or unsubstituted heterocyclic group having 2 to 50 carbon atoms.

According to one embodiment of the present specification, in Chemical Formula C, Ara is a substituted or unsubstituted monovalent or higher benzofluorene group, a substituted or unsubstituted monovalent or higher fluoranthene group, a substituted or unsubstituted monovalent or higher pyrene group, or a substituted or unsubstituted monovalent or higher chrysene group.

According to one embodiment of the present specification, in Chemical Formula C, Ara is a monovalent or higher benzofluorene group that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group; a monovalent or higher fluoranthene group that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group; a monovalent or higher pyrene group that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group; or a monovalent or higher chrysene group that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

According to one embodiment of the present specification, in Chemical Formula C, Ara is a monovalent or higher benzofluorene group that is unsubstituted or substituted with deuterium, a methyl group, an ethyl group, an iso-propyl group or a tert-butyl group; a monovalent or higher fluoranthene group that is unsubstituted or substituted with deuterium, a methyl group, an ethyl group, an iso-propyl group or a tert-butyl group; a monovalent or higher pyrene group that is unsubstituted or substituted with deuterium, a methyl group, an ethyl group, an iso-propyl group or a tert-butyl group; or a monovalent or higher chrysene group that is unsubstituted or substituted with deuterium, a methyl group, an ethyl group, an iso-propyl group or a tert-butyl group.

According to one embodiment of the present specification, in Chemical Formula C, Ara is a divalent pyrene group that is unsubstituted or substituted with deuterium, a methyl group, an ethyl group, an iso-propyl group or a tert-butyl group.

According to one embodiment of the present specification, in Chemical Formula C, Arb and Arc are the same as or different from each other, and each independently is a substituted or unsubstituted aryl group having 6 to 50 carbon atoms; or a substituted or unsubstituted heterocyclic group having 2 to 50 carbon atoms.

According to one embodiment of the present specification, in Chemical Formula C, Arb and Arc are the same as or different from each other, and each independently is an aryl group having 6 to 50 carbon atoms that is unsubstituted or substituted with deuterium, an alkyl group, a nitrile group, an aryl group, an alkylsilyl group or an alkyl germanium group; or a heterocyclic group having 2 to 50 carbon atoms that is unsubstituted or substituted with deuterium, an alkyl group, a nitrile group, an aryl group, an alkylsilyl group or an alkyl germanium group.

According to one embodiment of the present specification, in Chemical Formula C, Arb and Arc are the same as or different from each other, and each independently is an aryl group having 6 to 50 carbon atoms that is unsubstituted or substituted with deuterium, a methyl group, an ethyl group, an iso-propyl group, a tert-butyl group, a nitrile group, a phenyl group, a trimethylsilyl group or a trimethylgermanium group; or a heterocyclic group having 2 to 50 carbon atoms that is unsubstituted or substituted with deuterium, a methyl group, an ethyl group, an iso-propyl group, a tert-butyl group, a nitrile group, a phenyl group, a trimethylsilyl group or a trimethylgermanium group.

According to one embodiment of the present specification, in Chemical Formula C, Arb and Arc are the same as or different from each other, and each independently is a phenyl group that is unsubstituted or substituted with deuterium, a methyl group, an ethyl group, an iso-propyl group, a tert-butyl group, a nitrile group, a phenyl group, a trimethylsilyl group or a trimethylgermanium group; a biphenyl group that is unsubstituted or substituted with deuterium, a methyl group, an ethyl group, an iso-propyl group, a tert-butyl group, a nitrile group, a phenyl group, a trimethylsilyl group or a trimethylgermanium group; a terphenyl group that is unsubstituted or substituted with deuterium, a methyl group, an ethyl group, an iso-propyl group, a tert-butyl group, a nitrile group, a phenyl group, a trimethylsilyl group or a trimethylgermanium group; or a dibenzofuran group that is unsubstituted or substituted with deuterium, a methyl group, an ethyl group, an iso-propyl group, a tert-butyl group, a nitrile group, a phenyl group, a trimethylsilyl group or a trimethylgermanium group.

According to one embodiment of the present specification, Chemical Formula C can be one compound selected from among the following compounds:

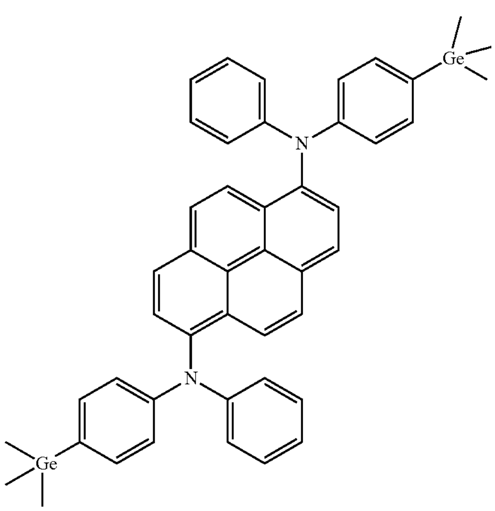

-continued

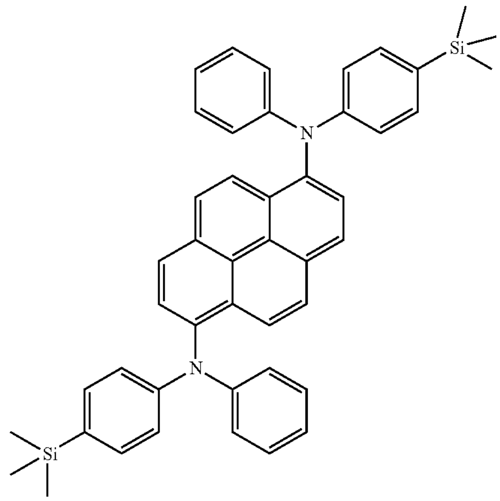

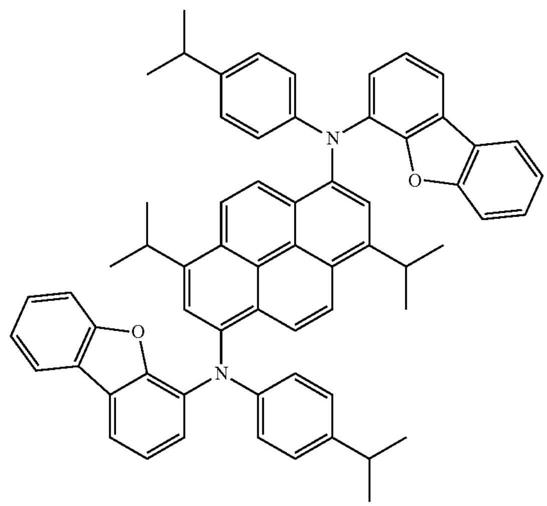

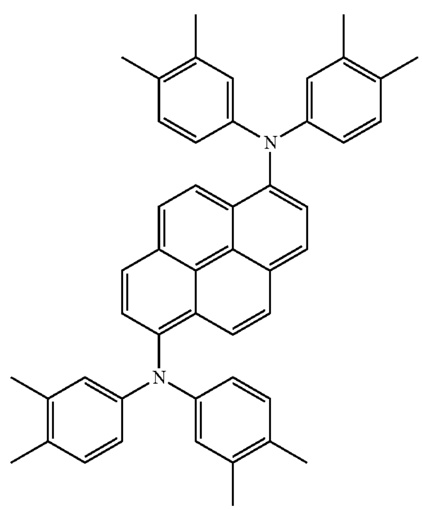

-continued
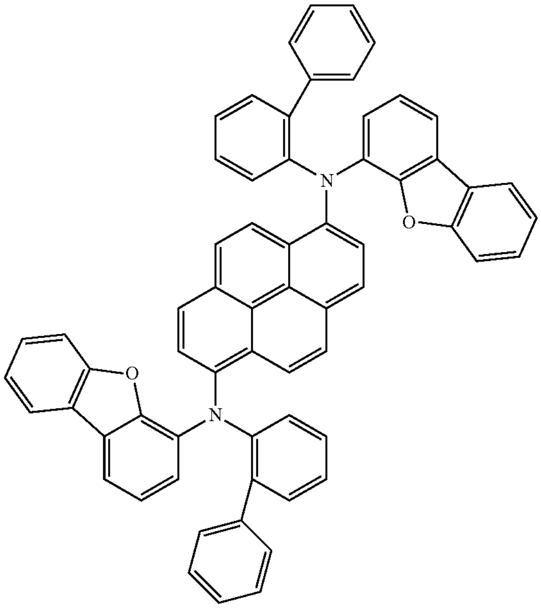
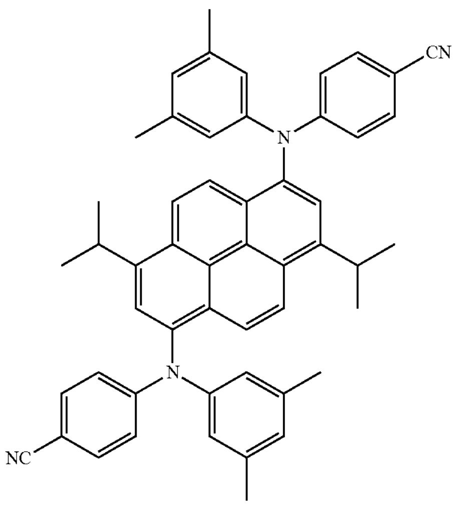
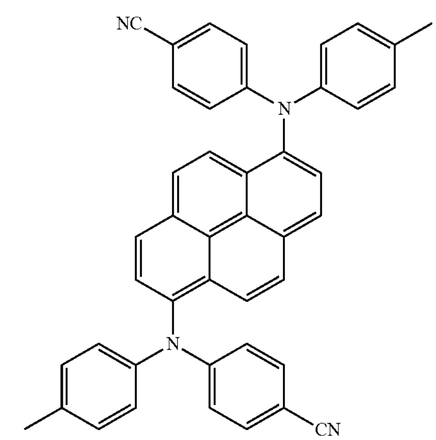
-continued
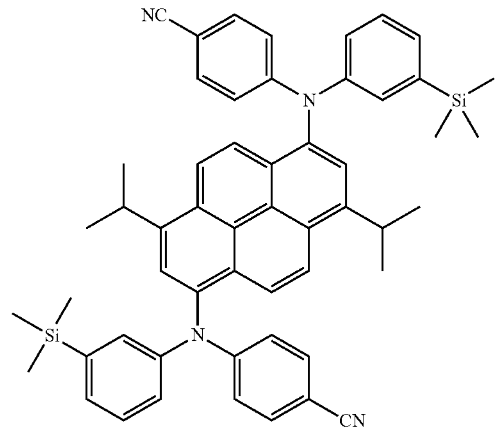
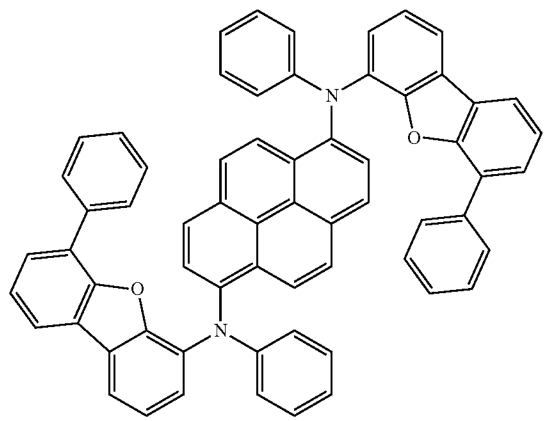
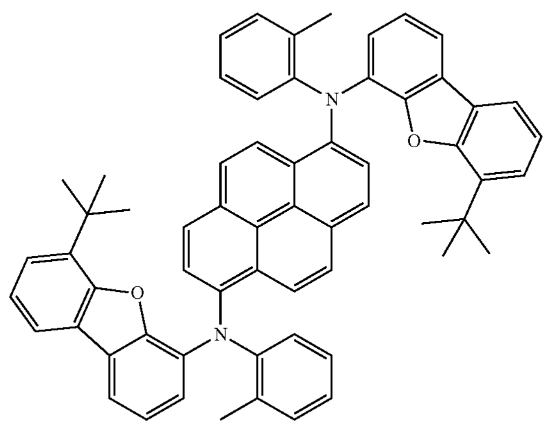
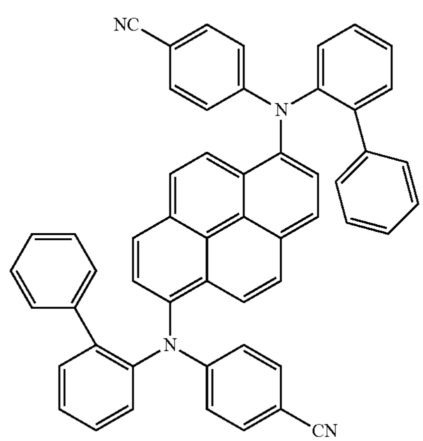

-continued

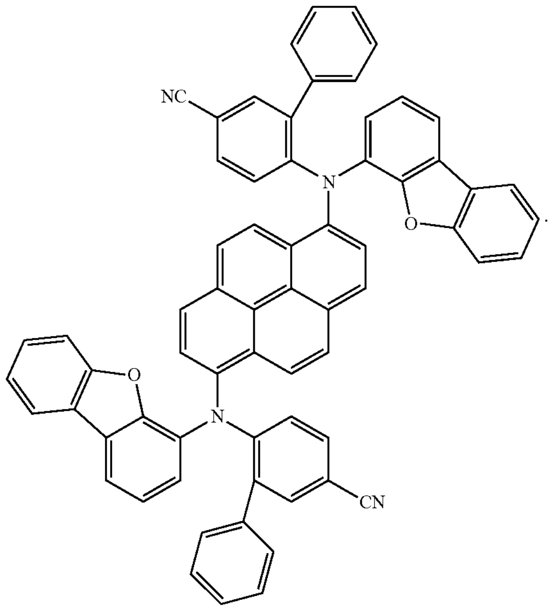

According to one embodiment of the present specification, in Chemical Formula D, Ld to Lf are the same as or different from each other, and each independently is a direct bond, a substituted or unsubstituted arylene group having 6 to 50 carbon atoms, or a substituted or unsubstituted divalent heterocyclic group having 2 to 50 carbon atoms.

According to one embodiment of the present specification, in Chemical Formula D, Ld to Lf are the same as or different from each other, and each independently is a direct bond, a substituted or unsubstituted phenylene group, a substituted or unsubstituted biphenylene group, a substituted or unsubstituted terphenylene group, a substituted or unsubstituted naphthylene group, or a substituted or unsubstituted fluorenylene group.

According to one embodiment of the present specification, in Chemical Formula D, Ld to Lf are the same as or different from each other, and each independently is a direct bond, a phenylene group, a biphenylene group, a terphenylene group, a naphthylene group, or a fluorenylene group that is unsubstituted or substituted with a methyl group or a phenyl group.

According to one embodiment of the present specification, in Chemical Formula D, Ld to Lf are the same as or different from each other, and each independently is a direct bond, a phenylene group, a biphenylene group, or a terphenylene group.

According to one embodiment of the present specification, in Chemical Formula D, Ard to Arf are the same as or different from each other, and each independently is a substituted or unsubstituted aryl group having 6 to 60 carbon atoms, or a substituted or unsubstituted heterocyclic group having 2 to 60 carbon atoms, or adjacent groups bond to each other to form a substituted or unsubstituted 18 to 30 heterorings.

According to one embodiment of the present specification, Chemical Formula D is the following Chemical Formula D-1:

[Chemical Formula D-1]

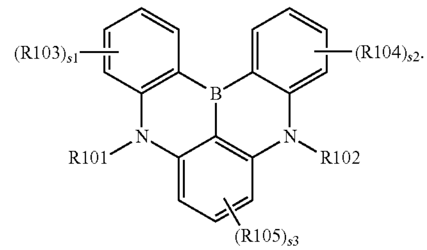

In Chemical Formula D-1:

R101 to R105 are the same as or different from each other, and each independently is hydrogen, deuterium, a substituted or unsubstituted silyl group, a substituted or unsubstituted alkyl group, a substituted or unsubstituted amine group, a substituted or unsubstituted aryl group, or a substituted or unsubstituted heterocyclic group;

s1 and s2 are each an integer of 0 to 4, and when s1 and s2 are each 2 or greater, two or more substituents in the parentheses are the same as or different from each other; and s3 is an integer of 0 to 3, and when s3 is 2 or greater, two or more R105s are the same as or different from each other.

According to one embodiment of the present specification, s1 is 0 or 1.

According to one embodiment of the present specification, s2 is 0 or 1.

According to one embodiment of the present specification, s3 is 0 or 1.

According to one embodiment of the present specification, R101 to R105 are the same as or different from each other, and each independently is hydrogen, deuterium, a substituted or unsubstituted silyl group, a substituted or unsubstituted alkyl group having 1 to 40 carbon atoms, a substituted or unsubstituted dicycloalkylamine group having 6 to 60 carbon atoms, a substituted or unsubstituted diarylamine group having 12 to 60 carbon atoms, a substituted or unsubstituted aryl group having 6 to 60 carbon atoms, or a substituted or unsubstituted heterocyclic group having 2 to 60 carbon atoms.

According to one embodiment of the present specification, Chemical Formula D can be one compound selected from among the following compounds:

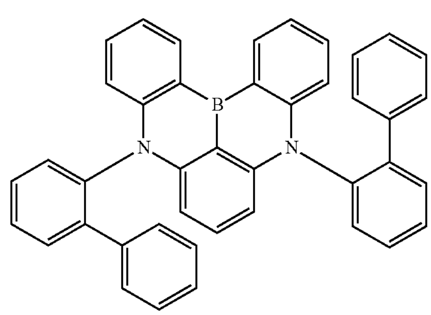

-continued
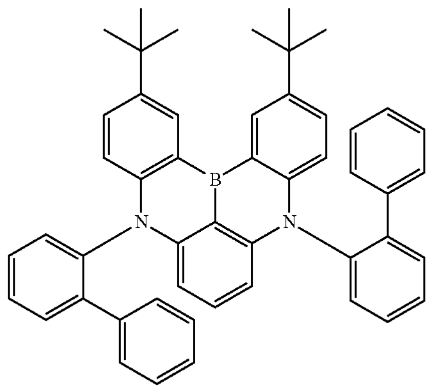
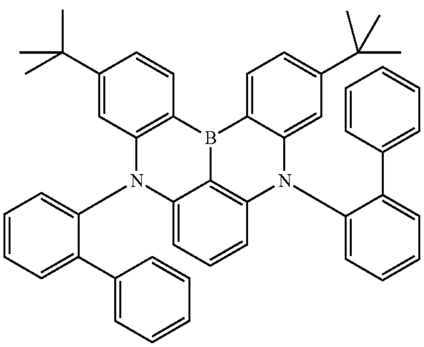
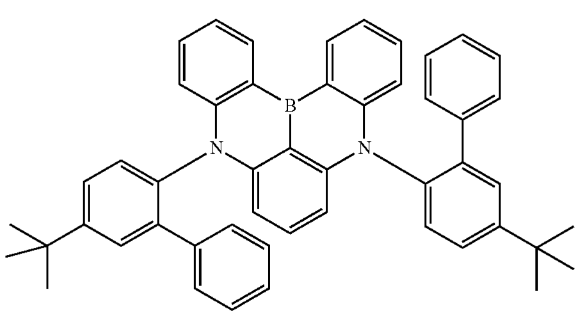
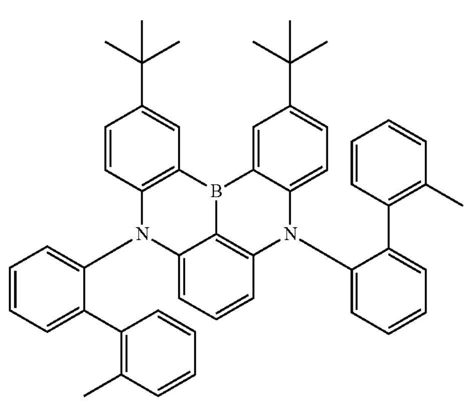
-continued
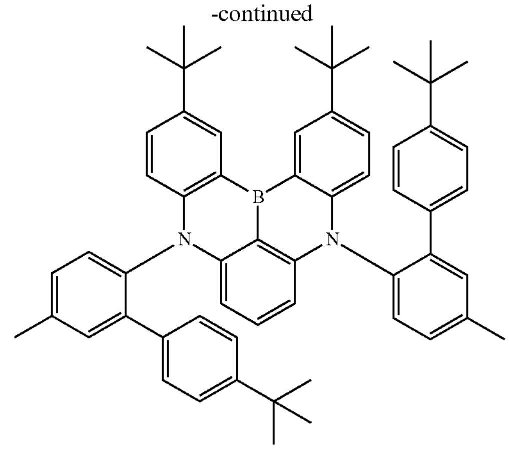
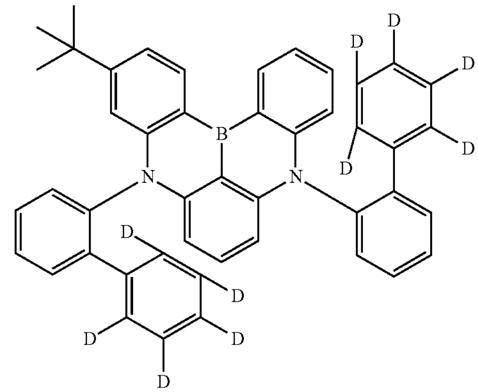
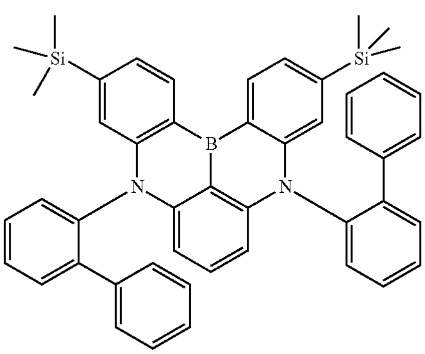
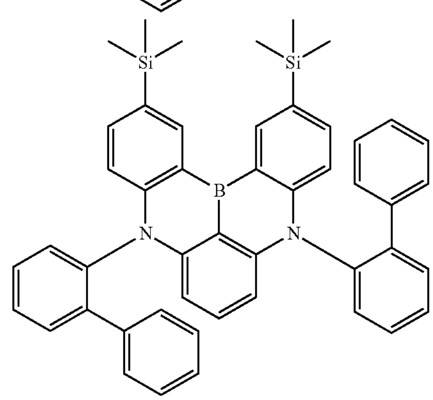

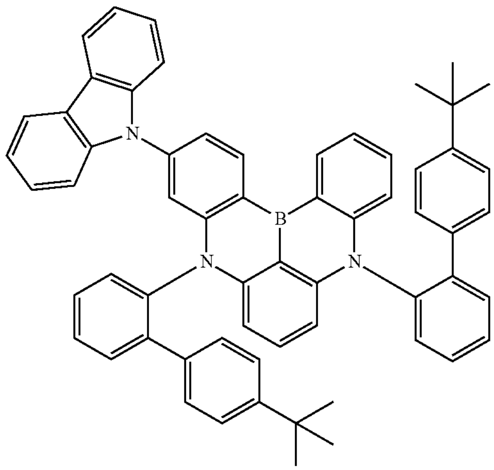
N
B
N
N
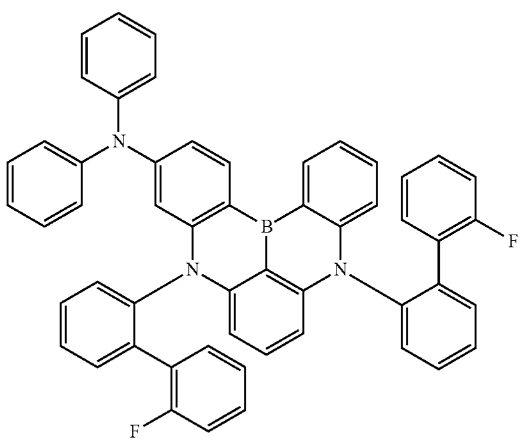
N
B
N
N
F
F
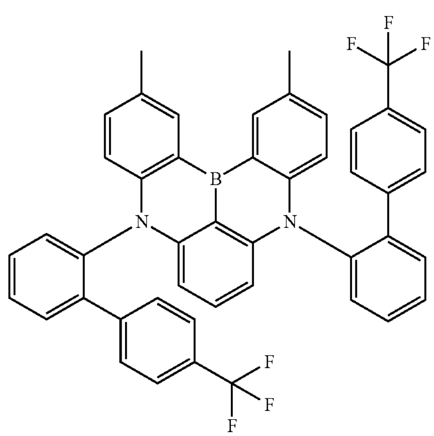
F
F
F
B
N
N
F
F
F
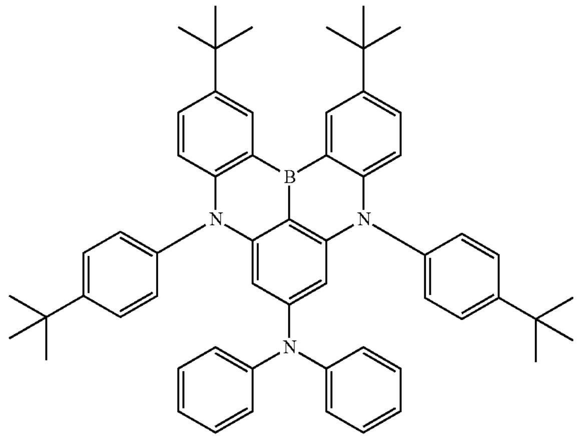
B
N
N
N
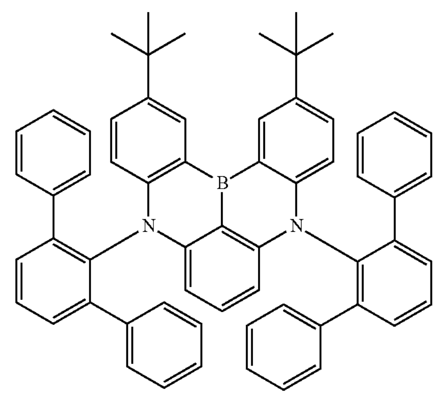
B
N
N
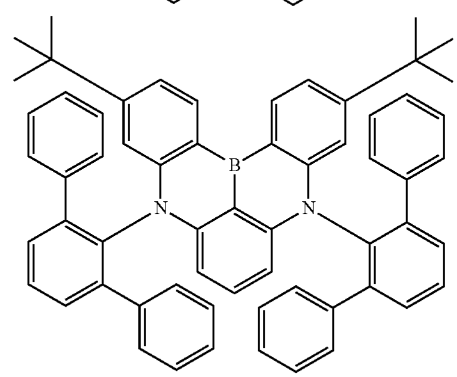
B
N
N
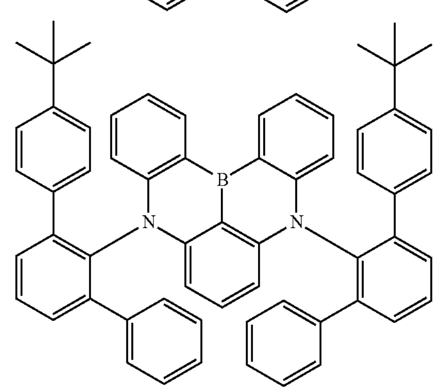
B
N
N -continued
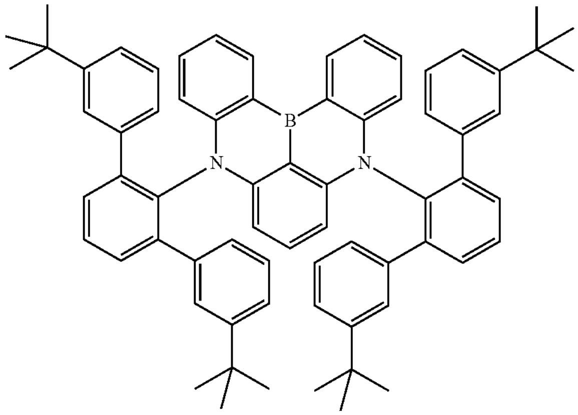
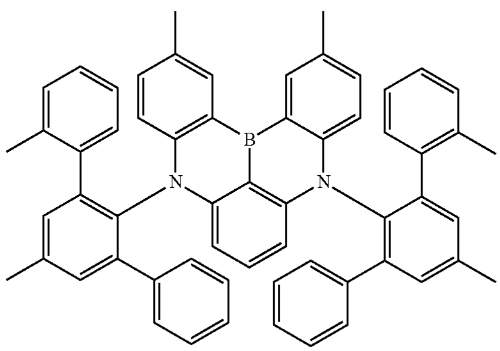
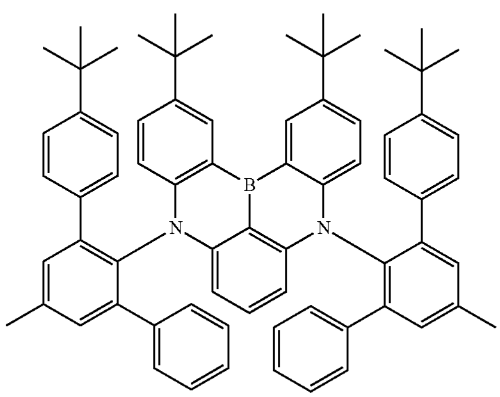
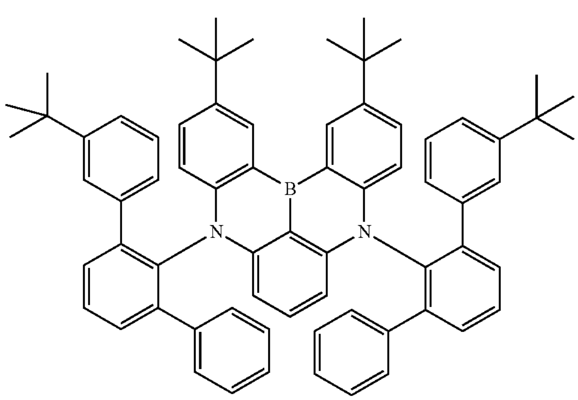
-continued
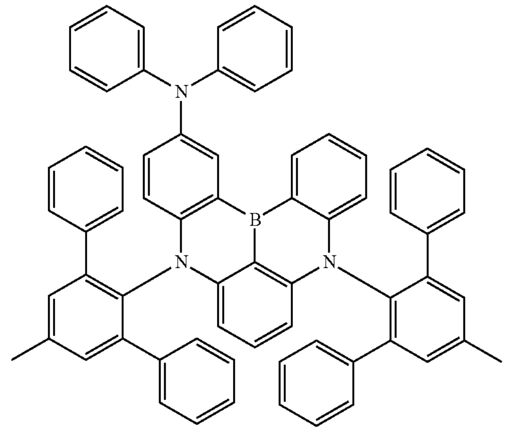
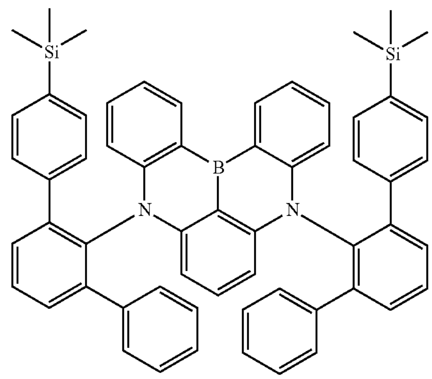
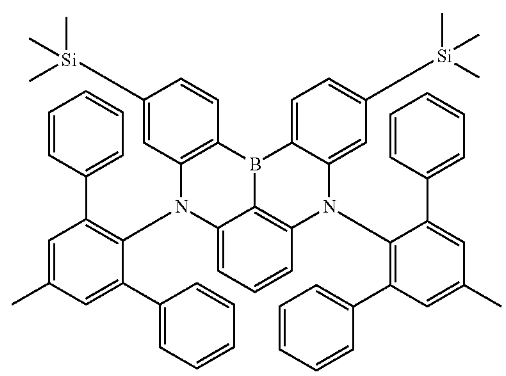
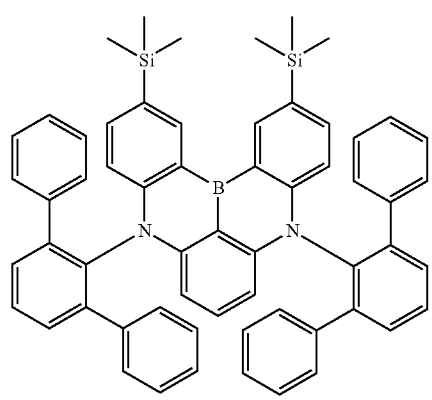

-continued
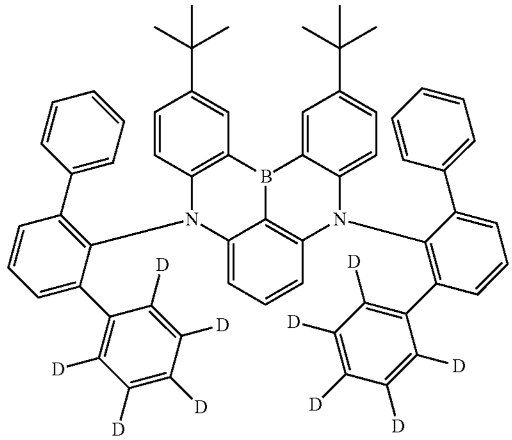
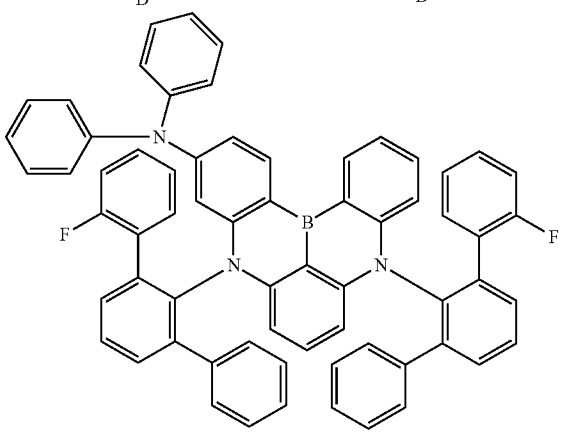
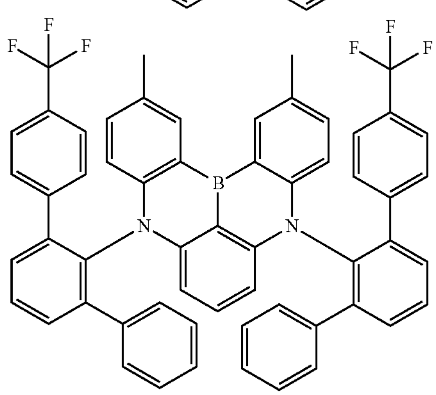
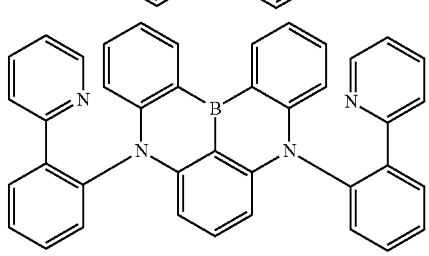
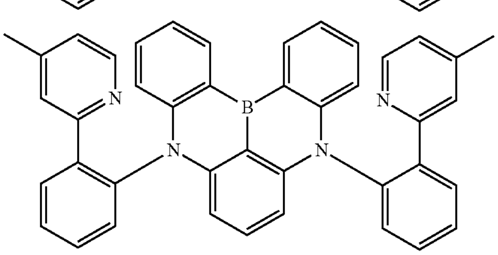
-continued
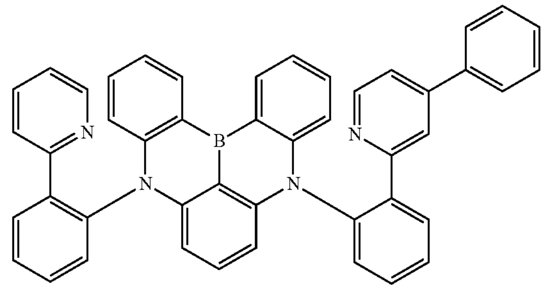
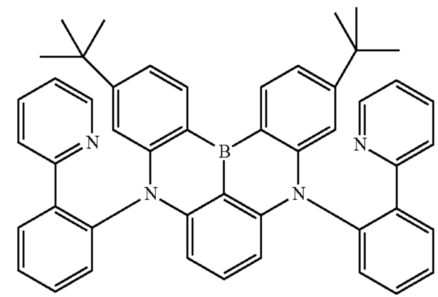
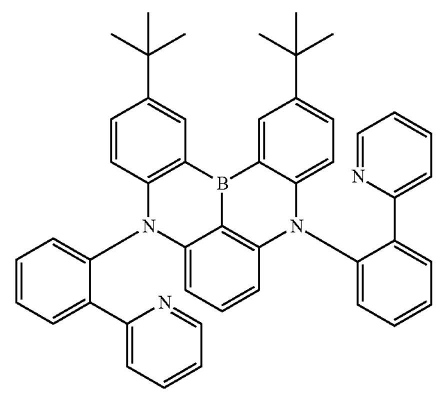
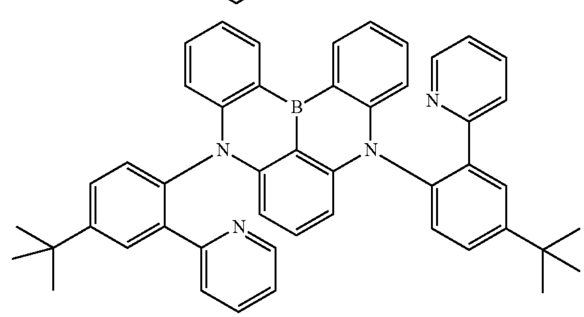
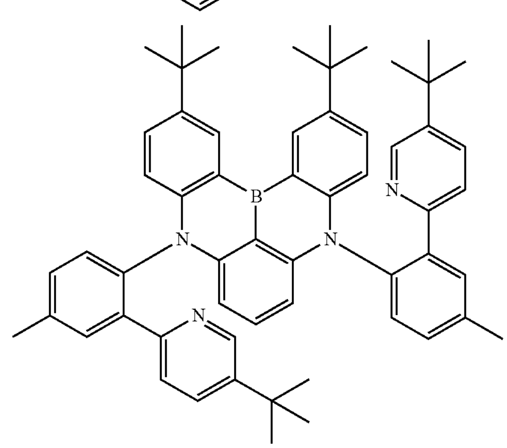

-continued
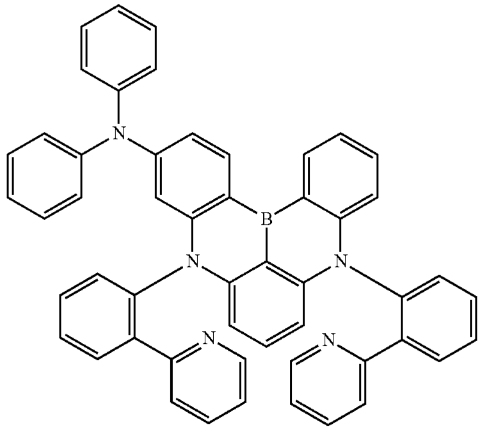
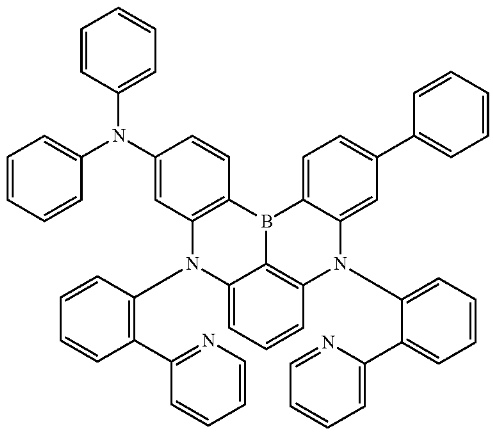
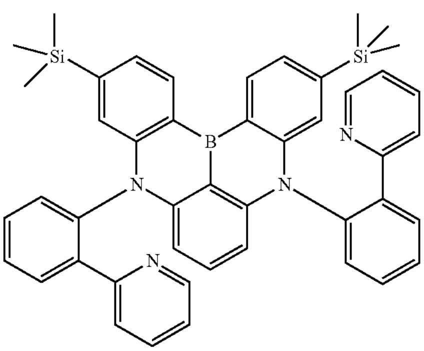
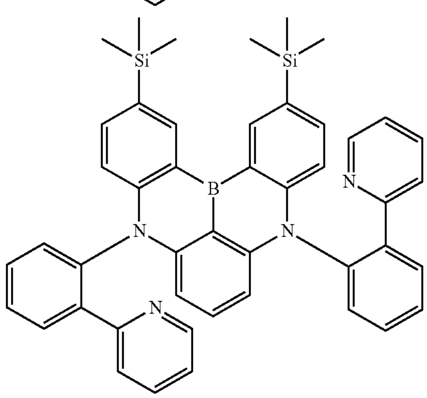
-continued
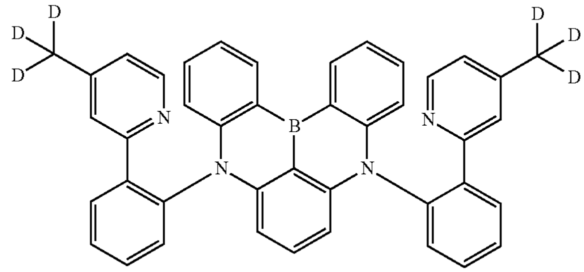
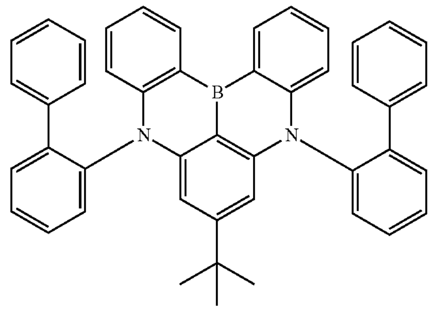
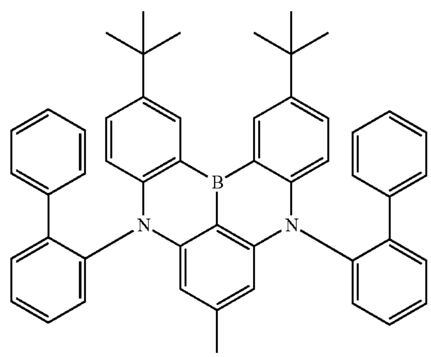
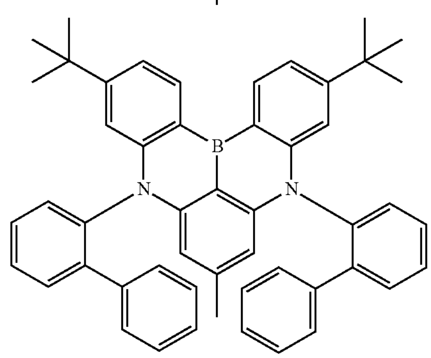
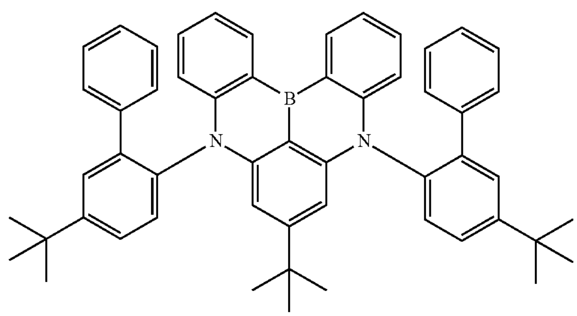

-continued
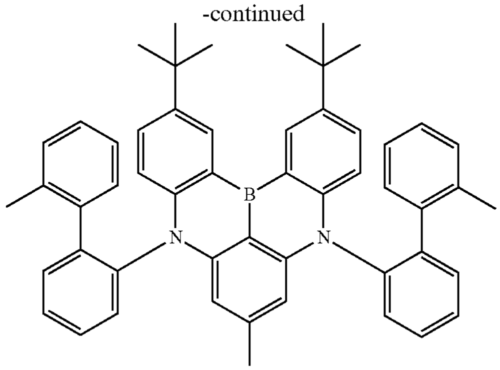
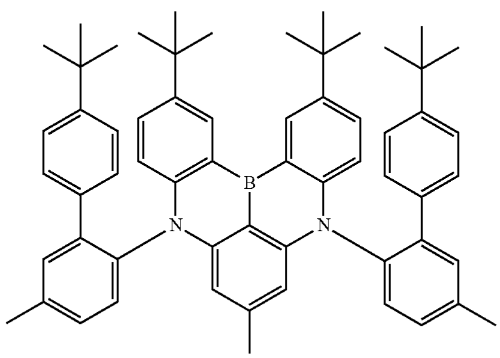
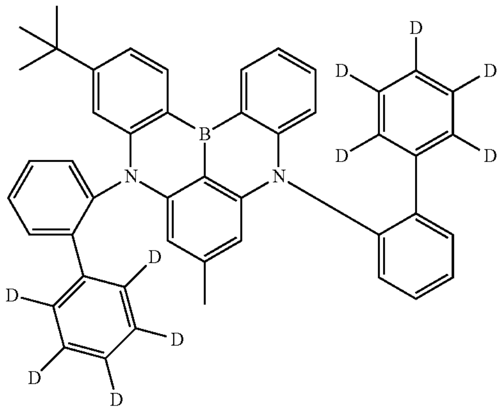
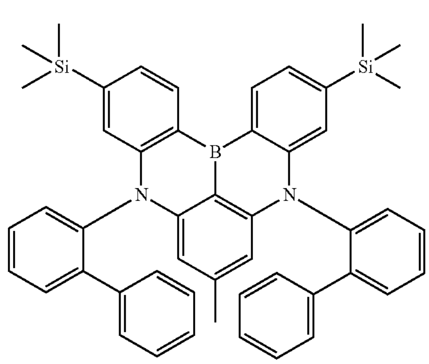
-continued
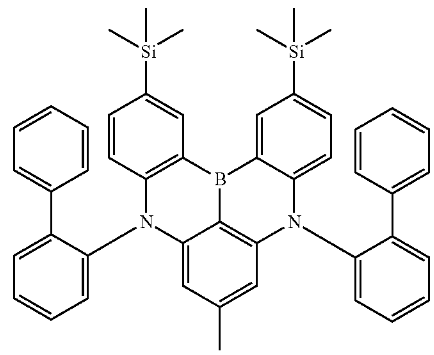
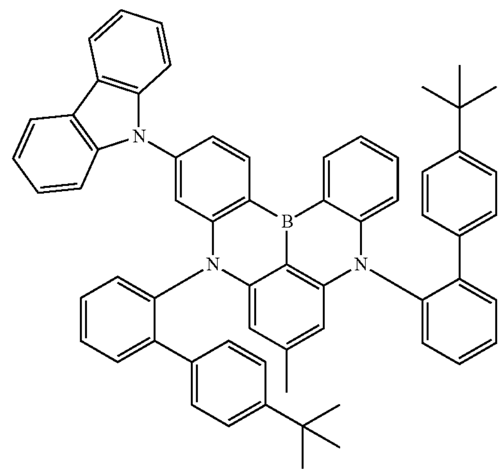
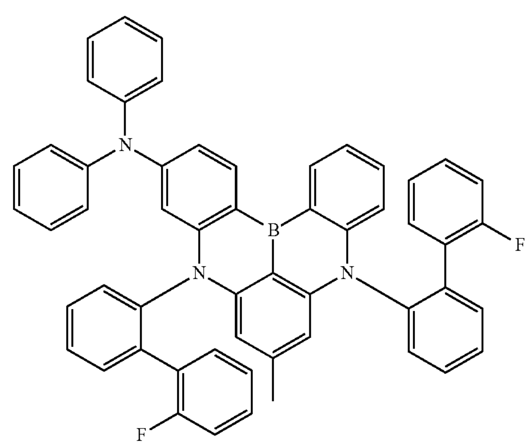
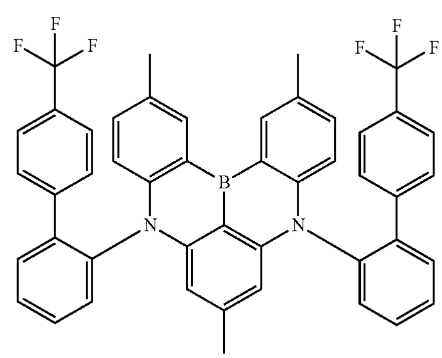

-continued
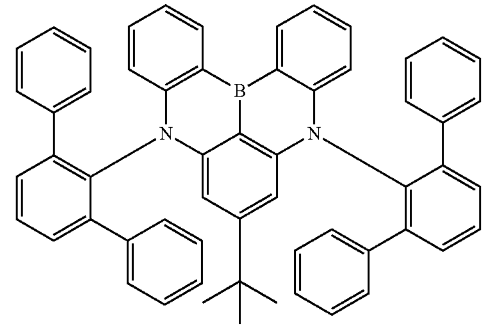
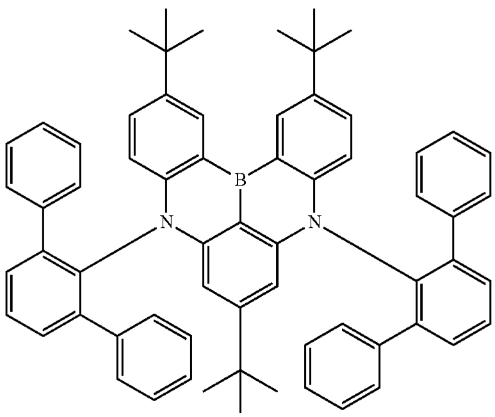
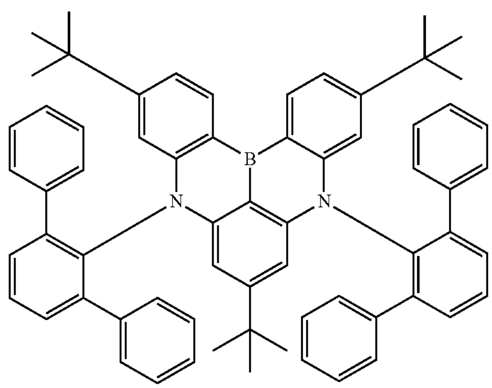
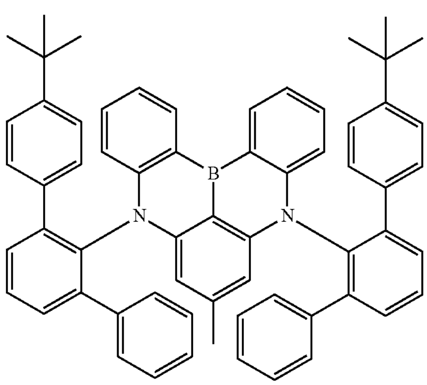
-continued
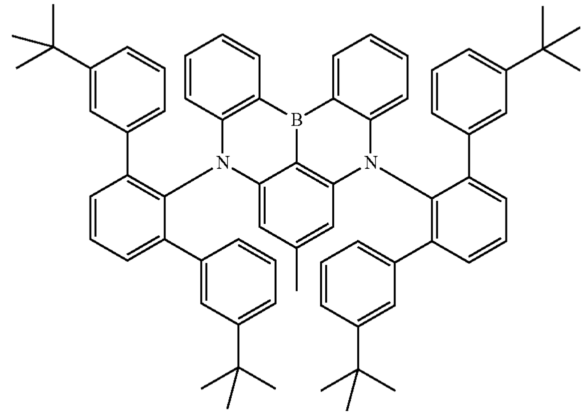
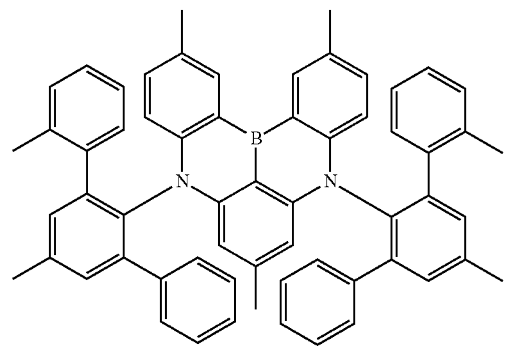
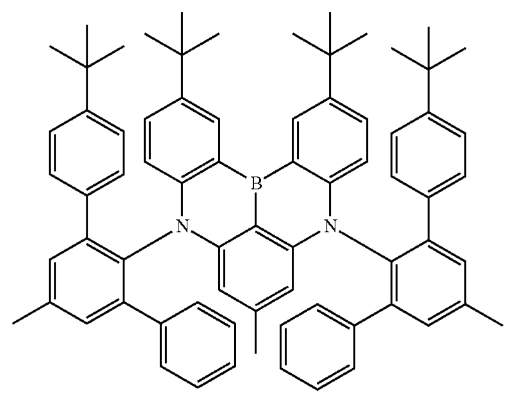
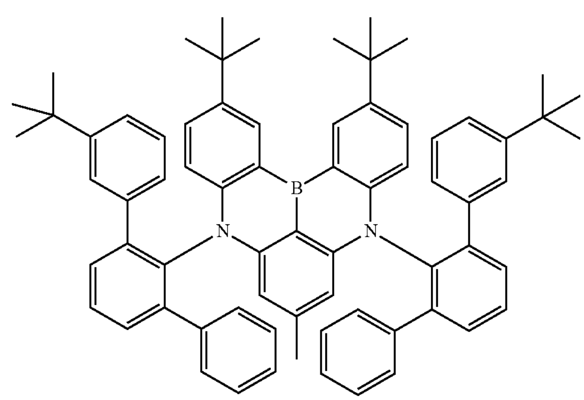

-continued
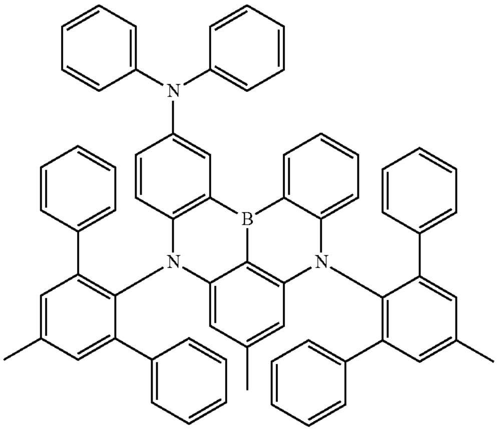
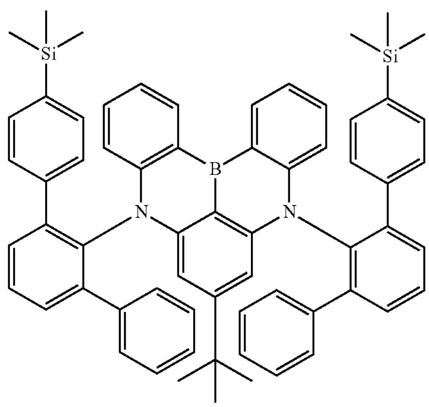
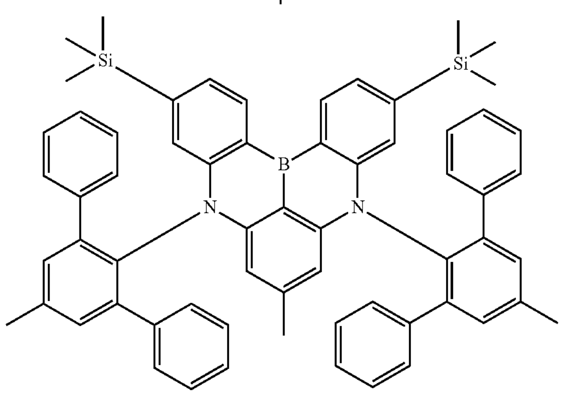
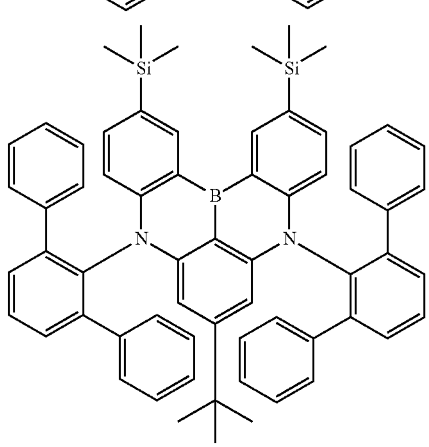
-continued
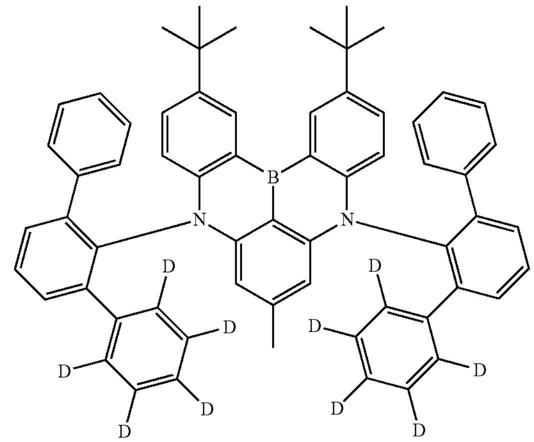
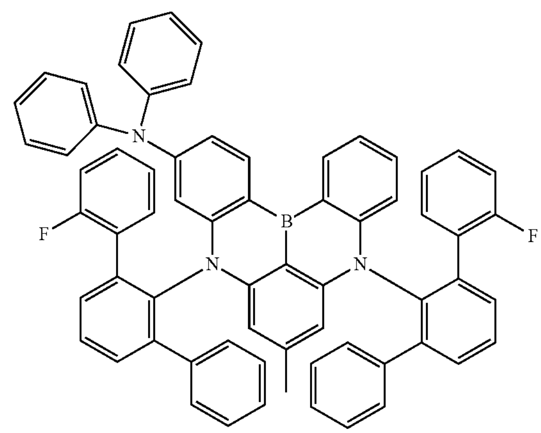
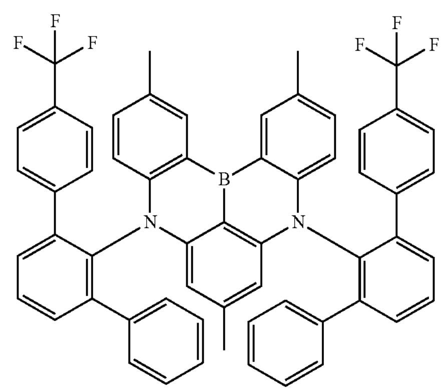
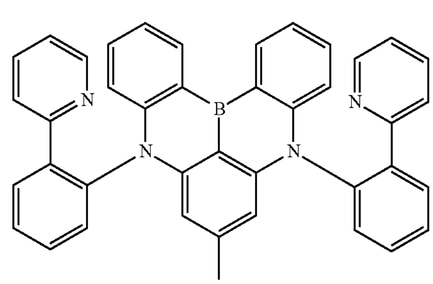

-continued
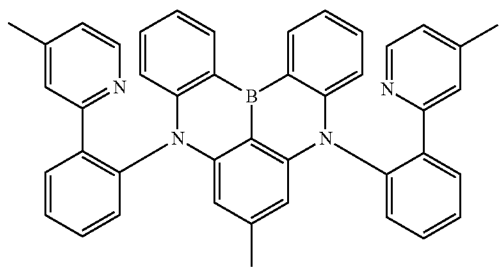
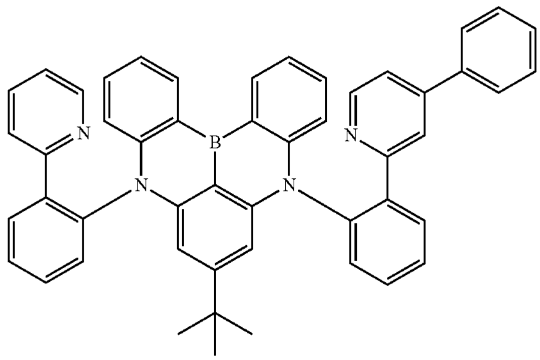
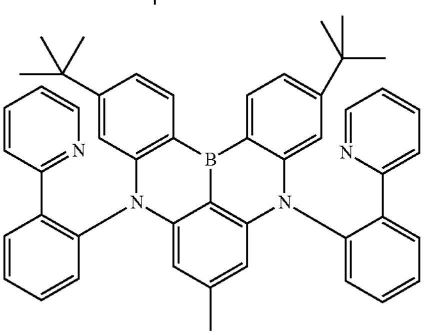
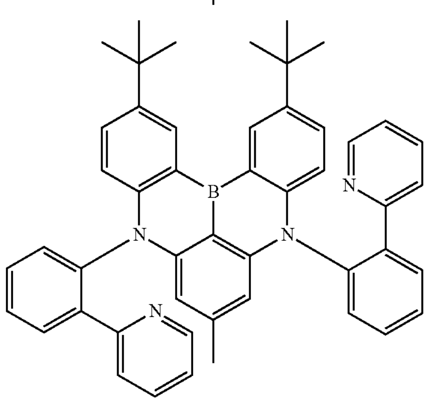
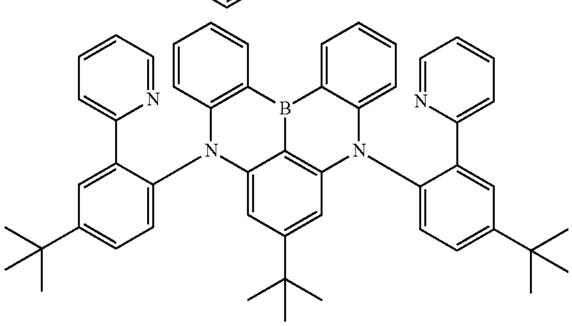
-continued
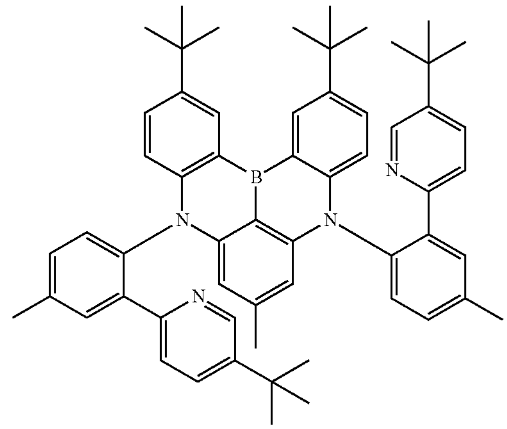
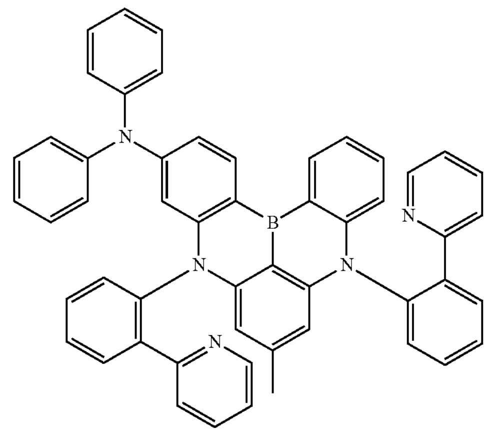
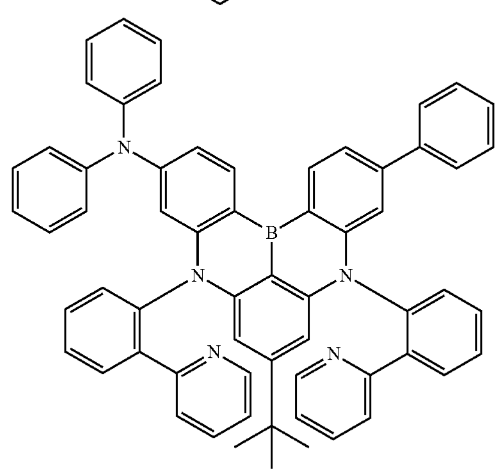
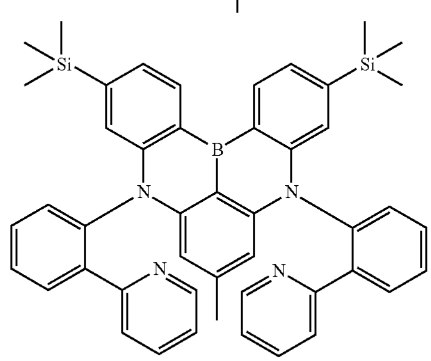

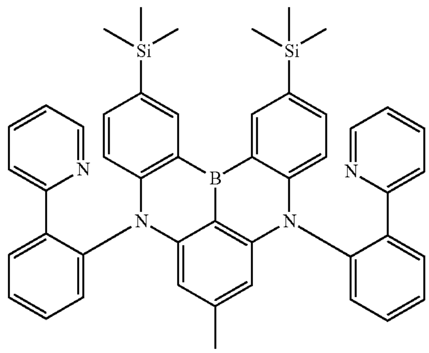
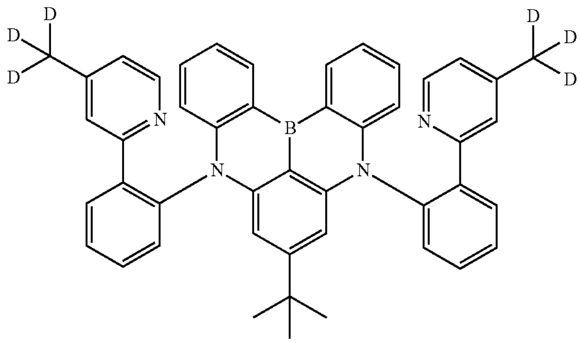
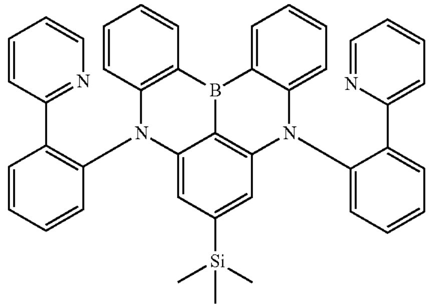
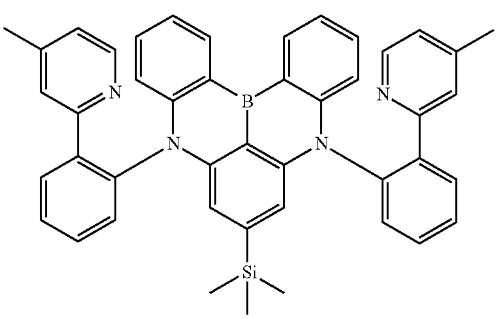
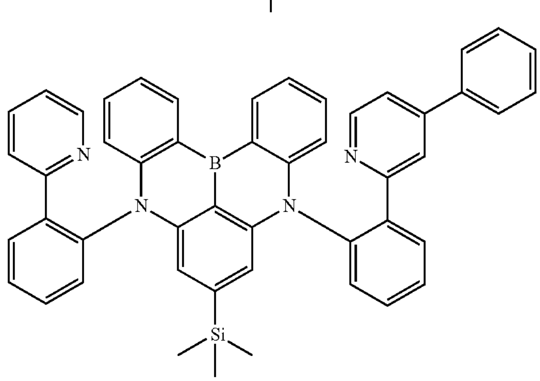
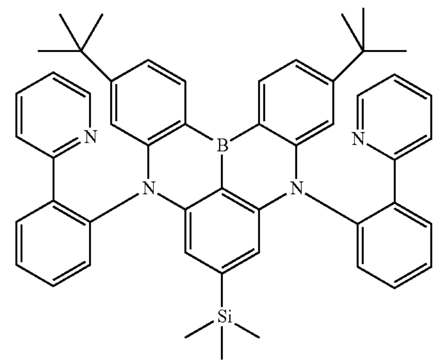
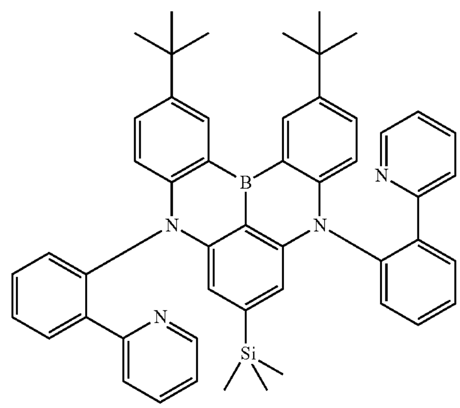
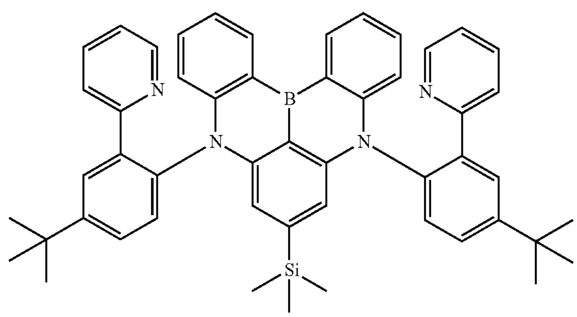
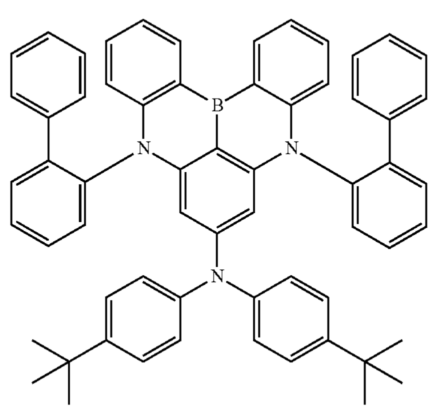

-continued
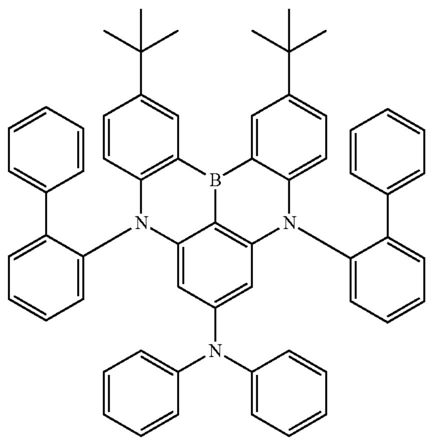
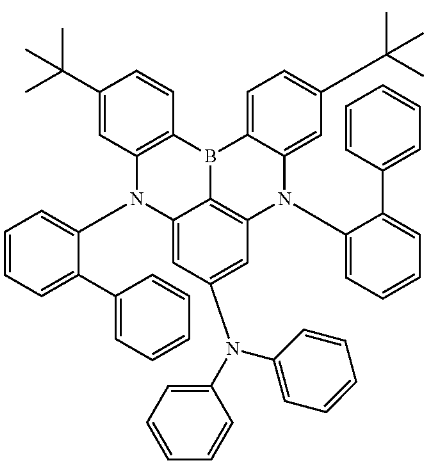
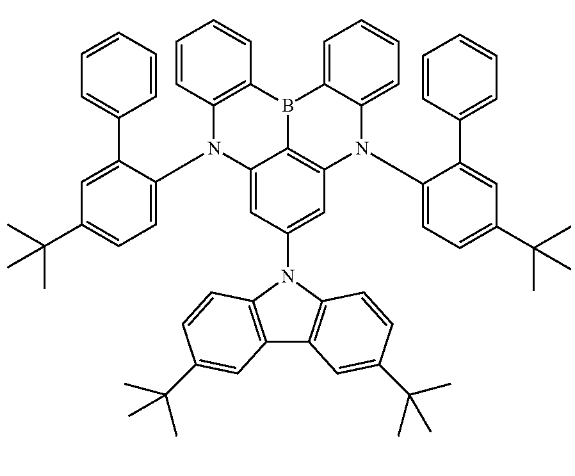
-continued
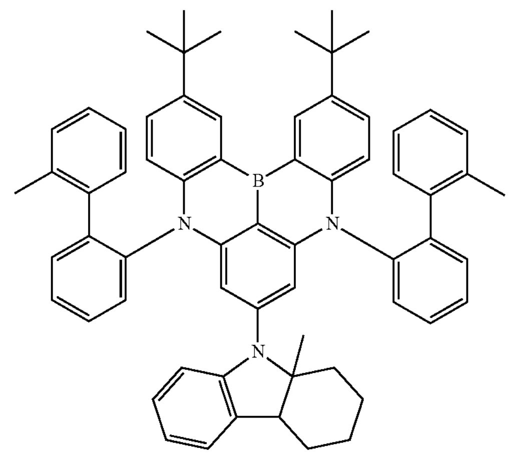
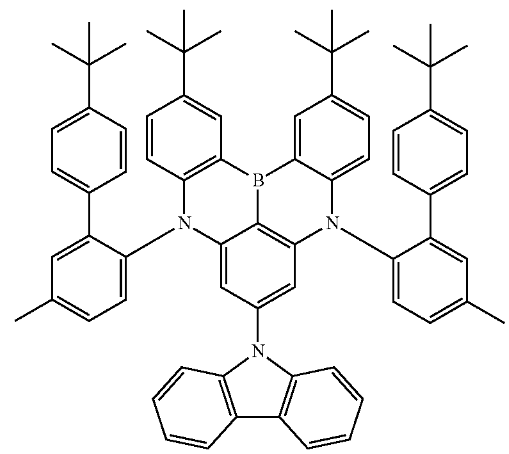
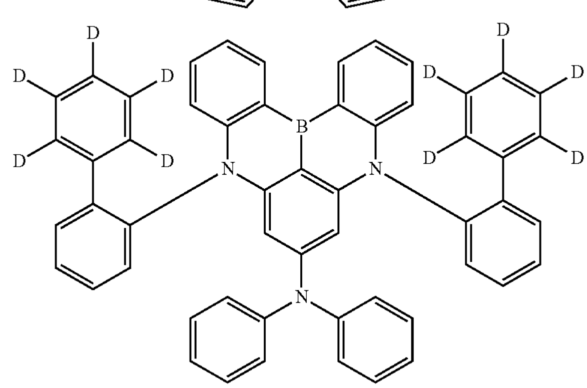
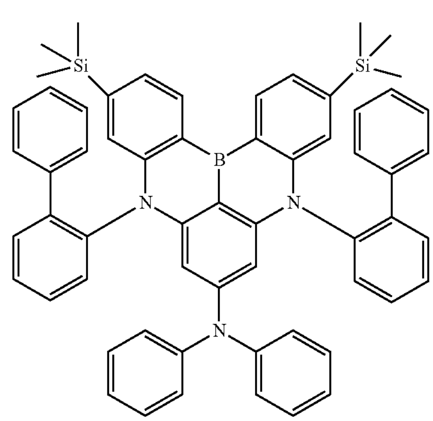

-continued
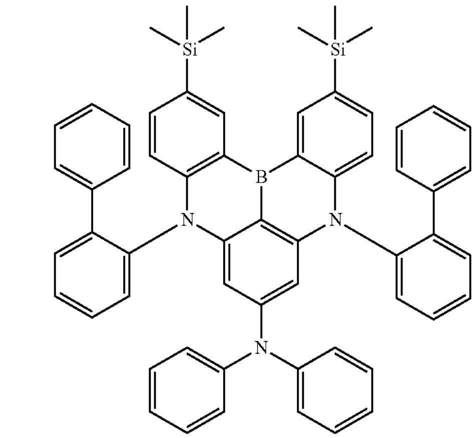
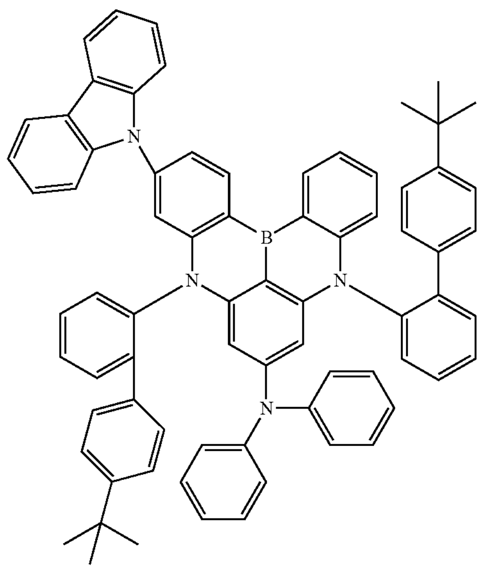
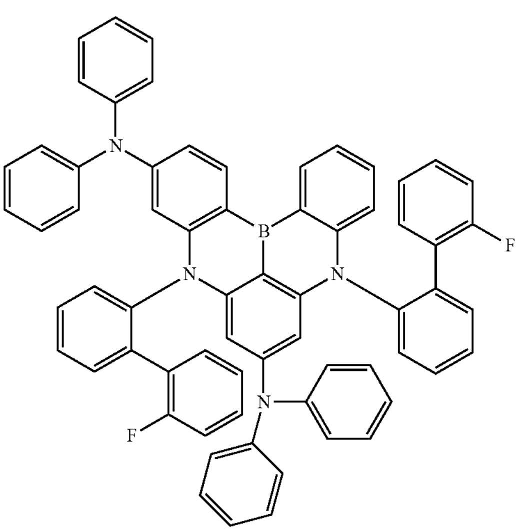
-continued
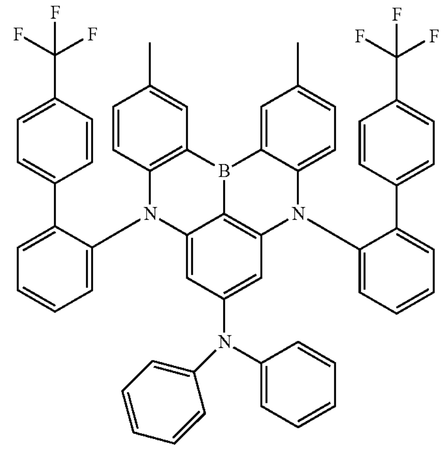
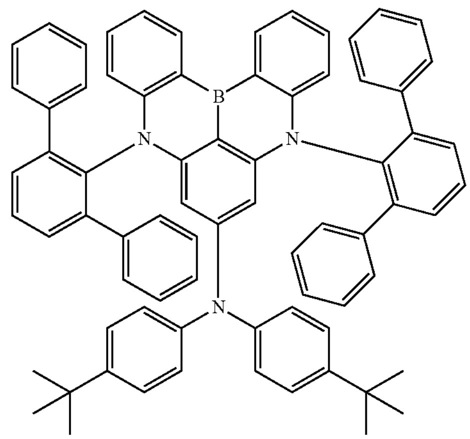
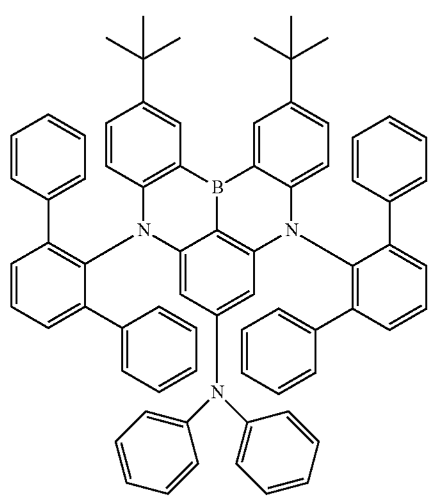

-continued
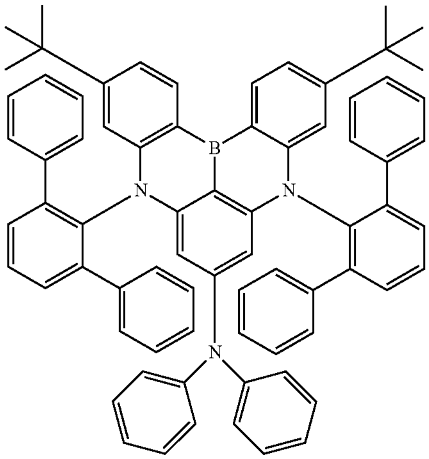
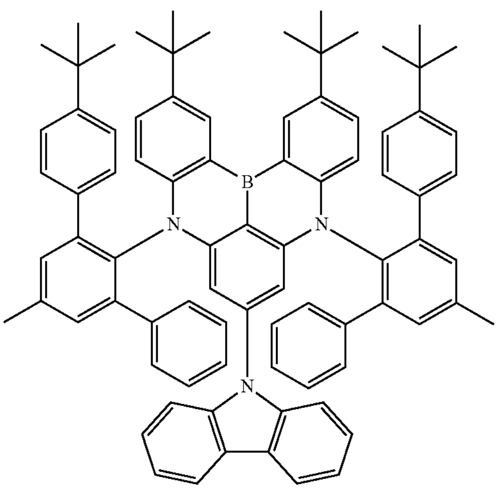
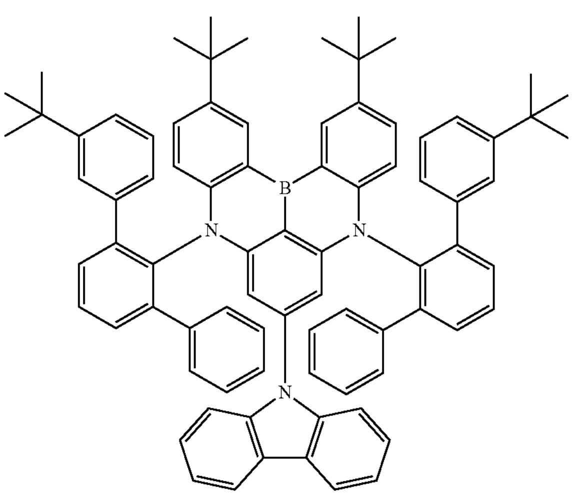
-continued
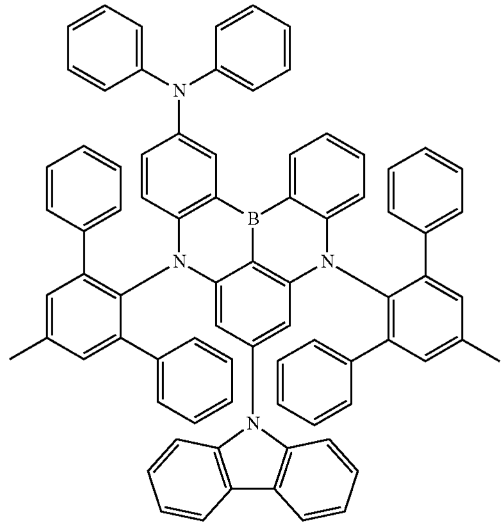
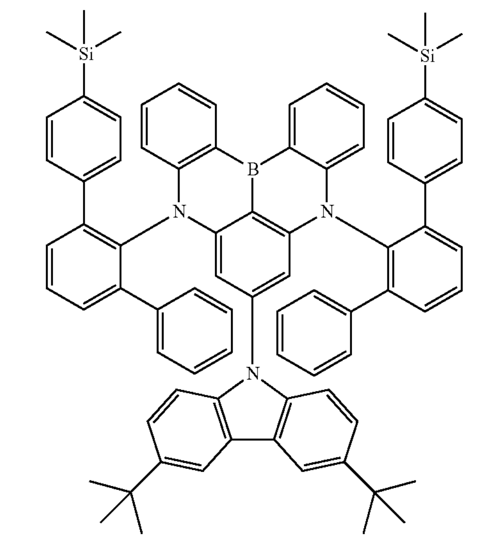
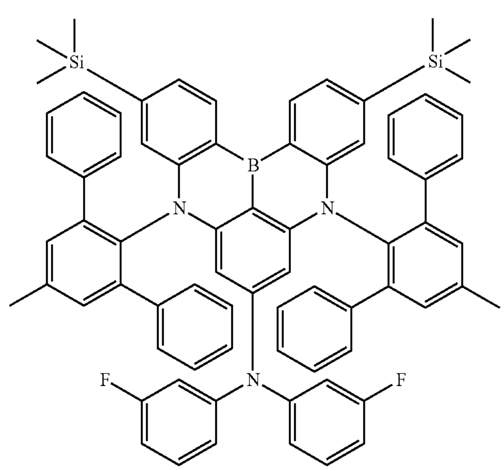

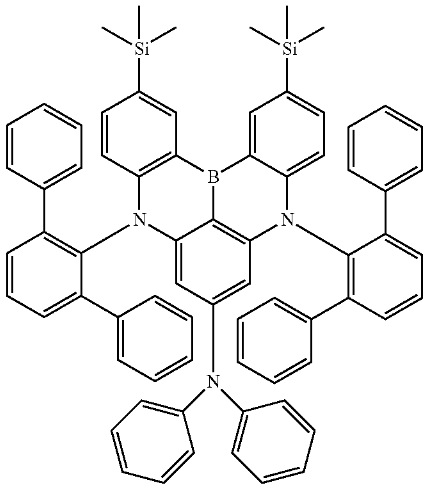
Si
Si
B
N
N
N
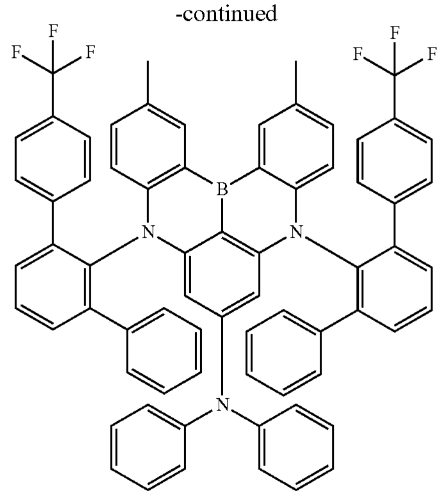
F
F
F
F
F
F
B
N
N
N
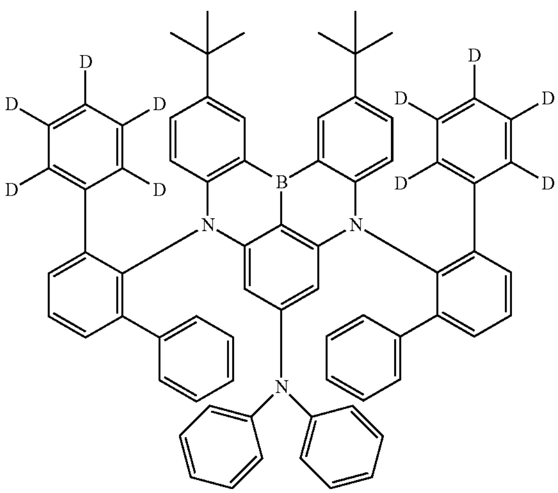
D
D
D
D
D
D
D
D
D
D
B
N
N
N
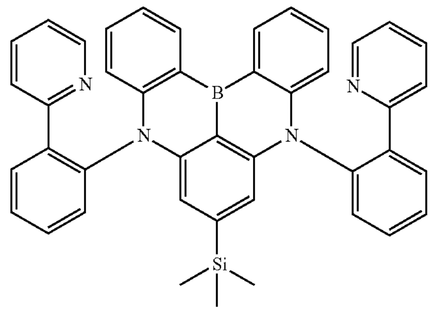
N
B
N
N
N
Si
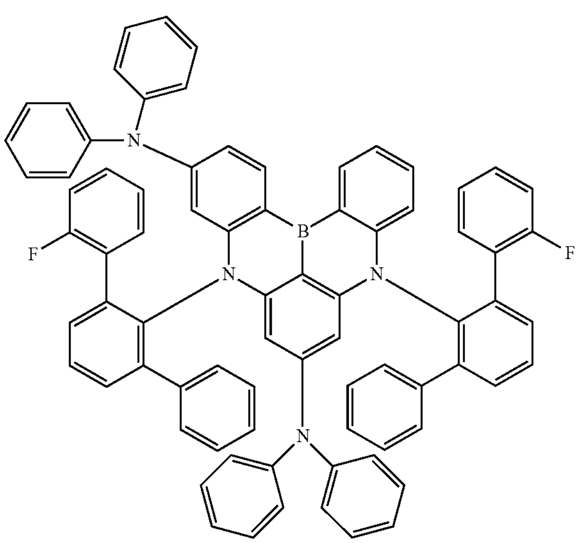
N
F
B
F
N
N
N
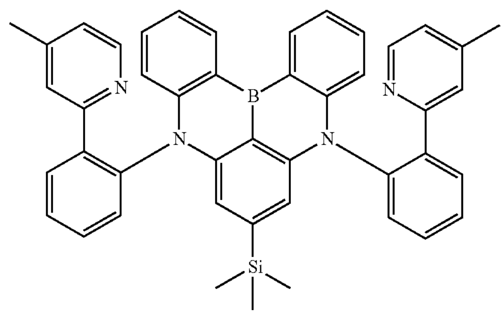
N
B
N
N
N
Si
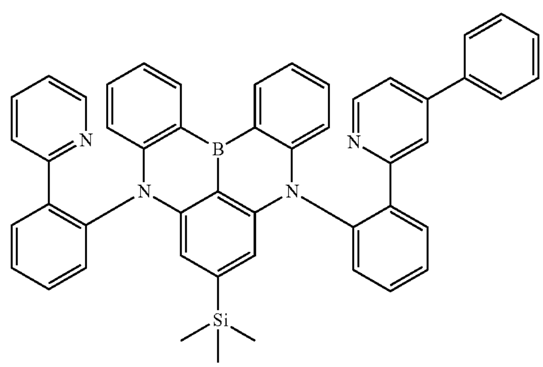
N
B
N
N
N
Si -continued
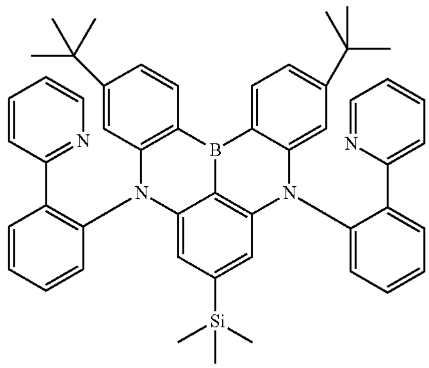
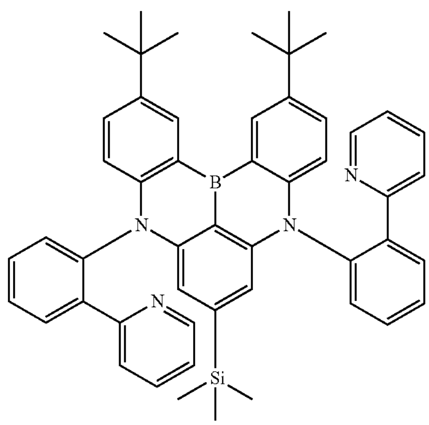
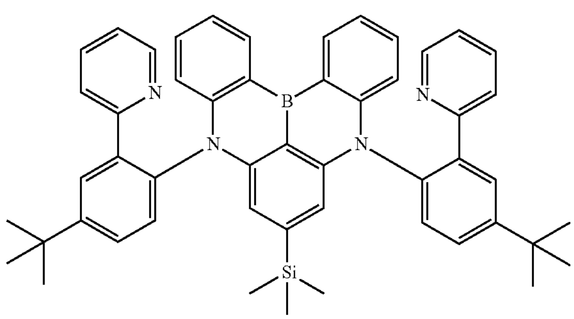
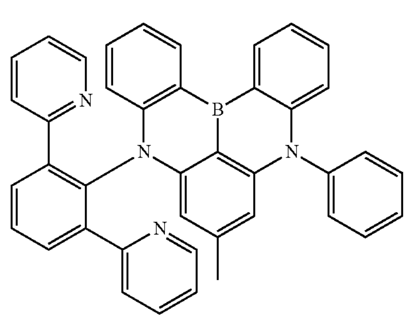
-continued
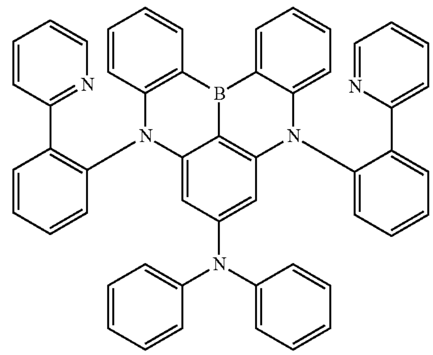
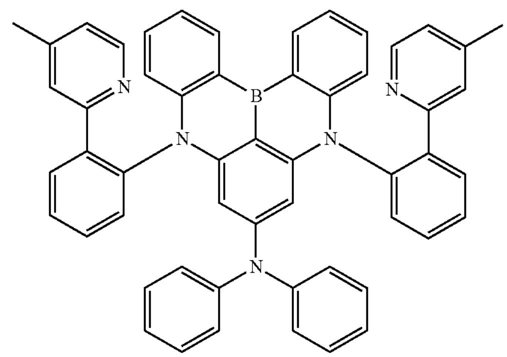
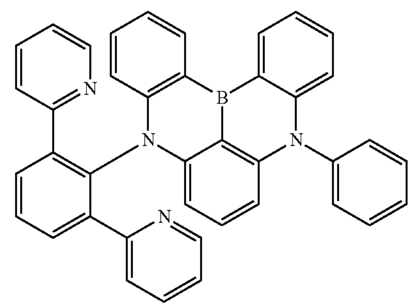
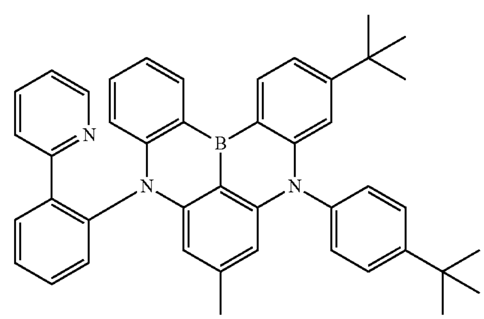
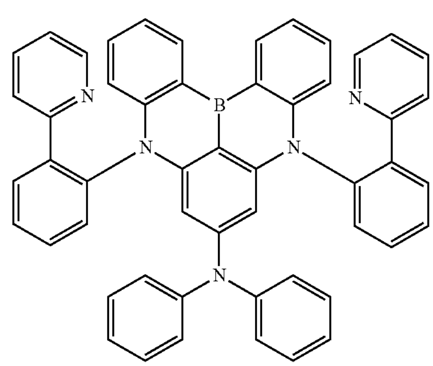

-continued

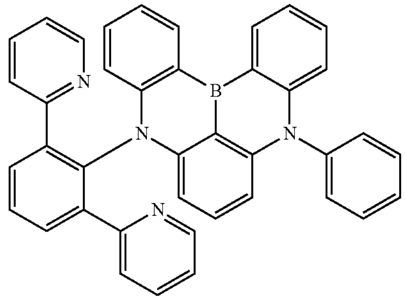

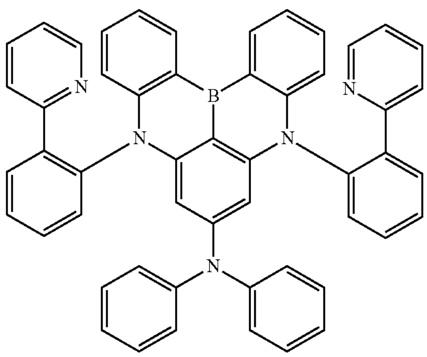

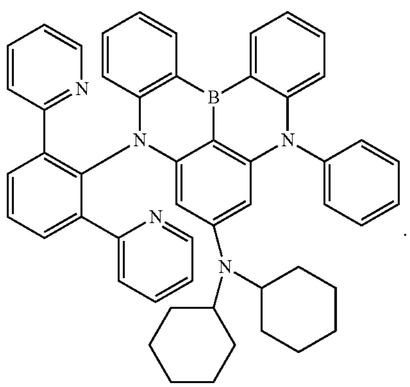

The compound of Chemical Formula A can be prepared through preparation examples to describe later. According to one example, the compound can be prepared through the following reaction scheme. Reaction conditions and starting materials can be changed to those known in the art.

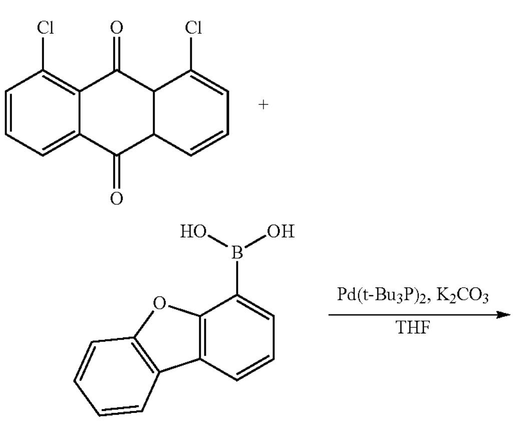

-continued

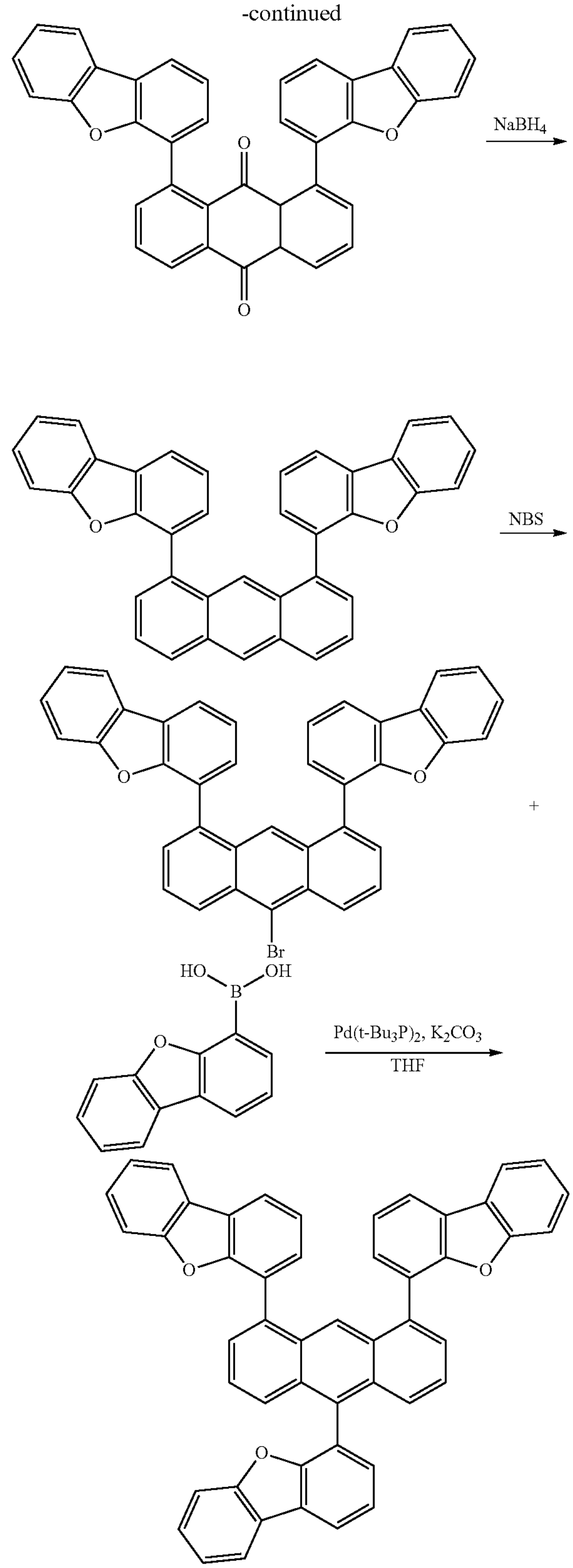

The compound of Chemical Formula B can be prepared through preparation examples to describe later. According to one example, the compound can be prepared through the following reaction scheme. Reaction conditions and starting materials can be changed to those known in the art.

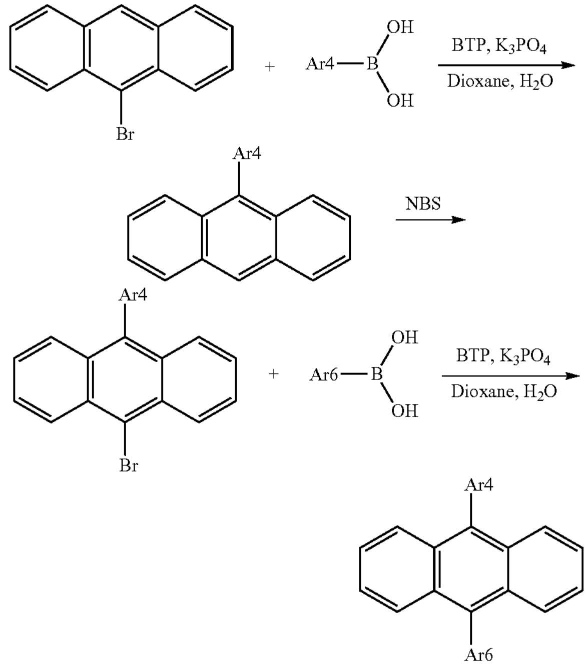

According to one embodiment of the present specification, the first host material including the compound of Chemical Formula A and the second host material including the compound of Chemical Formula B can be used in a weight ratio of 1:99 to 99:1.

The light emitting layer including the first host material and the second host material includes a dopant material. Based on the total weight of the host and the dopant included in the light emitting layer, the dopant material can be included in 0.1% by weight to 15% by weight, preferably in 1% by weight to 10% by weight, more preferably in 2% by weight to 10% by weight, and even more preferably in 2% by weight to 6% by weight. According to one embodiment of the present specification, in the light emitting layer of the organic material layer, the dopant material including the compound of Chemical Formula C or D can be included in 4% by weight based on the total weight of the host and the dopant of the light emitting layer.

The organic light emitting device according to one embodiment of the present specification includes an anode; a cathode; and a light emitting layer provided between the anode and the cathode, wherein the light emitting layer can include the first host material including the compound of Chemical Formula A, the second host material including the compound of Chemical Formula B, and the dopant material including the compound of Chemical Formula C or D. In addition thereto, one or more organic material layers selected from among a hole transfer layer, a hole injection layer, an electron blocking layer, a hole blocking layer, an electron transfer layer and an electron injection layer can be further included. However, the structure of the organic light emitting device is not limited thereto, and can include a lesser or greater number of organic material layers.

The organic light emitting device according to one embodiment of the present specification includes an anode; a cathode; and a light emitting layer provided between the anode and the cathode, wherein the light emitting layer includes the first host material including the compound of Chemical Formula A, the second host material including the compound of Chemical Formula B, and the dopant material including the compound of Chemical Formula C or D, and the organic light emitting device further includes, between the light emitting layer and the anode, one or more organic material layers selected from among an electron blocking layer, a hole transfer layer and a hole injection layer, and can include, between the light emitting layer and the cathode, one or more organic material layers selected from among a hole blocking layer, an electron transfer layer and an electron injection layer.

The electron transfer layer can further include an n-type dopant material, and the n-type dopant can be a metal complex, and an alkali metal such as Li, Na, K, Rb, Cs or Fr; an alkaline earth metal such as Be, Mg, Ca, Sr, Ba or Ra; a rare earth metal such as La, Ce, Pr, Nd, Sm, Eu, Tb, Th, Dy, Ho, Er, Em, Gd, Yb, Lu, Y or Mn; or a metal compound including one or more metals among the above-described metals can be used. However, the n-type dopant is not limited thereto, and those known in the art can be used.

Herein, the material used in the electron transfer layer and the n-type dopant material can have a weight ratio of 1:100 to 100:1, specifically 1:10 to 10:1, and more specifically 1:1. Herein, the n-type dopant material can be LiQ, but is not limited thereto.

According to one embodiment of the present specification, the organic material layer of the organic light emitting device of the present specification can be formed in a single layer structure, but can be formed in a multilayer structure in which two or more organic material layers are laminated. For example, the organic light emitting device in the present specification can have structures as illustrated in FIG. 1 and FIG. 2, however, the structure is not limited thereto.

In addition, one embodiment of the present specification provides a solution process organic light emitting device (soluble OLED) including an anode; a cathode; and a light emitting layer provided between the anode and the cathode, wherein the light emitting layer includes a first host material including the compound of Chemical Formula A, a second host material including the compound of Chemical Formula B, and a dopant material including the compound of Chemical Formula C or D.

FIG. 1 illustrates a structure of an organic light emitting device (10) in which an anode (30), a light emitting layer (40) and a cathode (50) are consecutively laminated on a substrate (20). FIG. 1 is an exemplary structure of an organic light emitting device according to one embodiment of the present specification, and other organic material layers can be further included.

FIG. 2 illustrates a structure of an organic light emitting device (11) in which an anode (30), a hole injection layer (60), a hole transfer layer (70), a light emitting layer (40), an electron transfer layer (80), an electron injection layer (90) and a cathode (50) are consecutively laminated on a substrate (20). FIG. 2 is an exemplary structure of an organic light emitting device according to an embodiment of the present specification, and other organic material layers can be further included.

The organic light emitting device of the present specification can be manufactured using materials and methods known in the art, except that one or more layers of the organic material layers include the compound of Chemical Formula A, the compound of Chemical Formula B, or the compound of Chemical Formula C or D of the present specification When the organic light emitting device includes a plurality of organic material layers, the organic material layers can be formed with materials the same as or different from each other.

For example, the organic light emitting device of the present specification can be manufactured by consecutively laminating an anode, an organic material layer and a cathode on a substrate. Herein, the organic light emitting device can be manufactured by forming an anode on a substrate by depositing a metal, a metal oxide having conductivity, or an alloy thereof using a physical vapor deposition (PVD) method such as sputtering or e-beam evaporation, and forming an organic material layer including a hole injection layer, a hole transfer layer, a light emitting layer, an electron control layer and an electron transfer layer thereon, and then depositing a material capable of being used as a cathode thereon. In addition to such a method, the organic light emitting device can also be manufactured by consecutively depositing a cathode material, an organic material layer and an anode material on a substrate. In addition, the compound of Chemical Formula 1 or Chemical Formula 3 can be formed into an organic material layer using a solution coating method as well as a vacuum deposition method when manufacturing the organic light emitting device. Herein, the solution coating method means spin coating, dip coating, doctor blading, inkjet printing, screen printing, a spray method, roll coating and the like, but is not limited thereto.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or SnO2:Sb; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al, $LiO_2$/Al or Mg/Ag, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer receiving holes from a hole injection layer and transferring the holes to a light emitting layer, and as the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

The light emitting material of the light emitting layer is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes ($Alq_3$); carbazole series compounds; dimerized styryl compounds; BAlq; 10-hydroxybenzoquinoline-metal compounds; benzoxazole, benzothiazole and benzimidazole series compounds; poly(p-phenylenevinylene) (PPV) series polymers; spiro compounds; polyfluorene; rubrene, and the like, but are not limited thereto.

The light emitting layer can include a host material and a dopant material.

The host material can include fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like can be included, and as the heteroring-containing compound, carbazole derivatives, dibenzofuran derivatives, ladder-type furan compounds, pyrimidine derivatives and the like can be included, however, the host material is not limited thereto.

The dopant material can include aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group, and arylamino group-including pyrene, anthracene, chrysene, peryflanthene and the like can be included. The styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group can be substituted or unsubstituted. Specifically, styrylamine, styryldiamine, styryltriamine, styryltetramine and the like can be included, however, the styrylamine compound is not limited thereto. As the metal complex, iridium complexes, platinum complexes and the like can be used, however, the metal complex is not limited thereto.

The electron transfer layer is a layer receiving electrons from an electron injection layer and transferring the electrons to a light emitting layer, and as the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto. The electron transfer layer can be used together with any desired cathode material as used in the art. Particularly, examples of the suitable cathode material can include common materials having low work function and having an aluminum layer or a silver layer following. Specifically, cesium, barium, calcium, ytterbium and samarium are included, and in each case, an aluminum layer or a silver layer follows.

The electron injection layer is a layer injecting electrons from an electrode, and compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The hole blocking layer is layer blocking holes from reaching a cathode, and can be generally formed under the same condition as the hole injection layer. Specific examples thereof can include oxadiazole derivatives, triazole derivatives, phenanthroline derivatives, BCP, aluminum complexes and the like, but are not limited thereto.

The metal complex compound includes 8-hydroxyquinolinato lithium, bis(8-hydroxyquinolinato)zinc, bis(8-hydroxy-quinolinato) copper, bis (8-hydroxyquinolinato) manganese, tris(8-hydroxyquinolinato)aluminum, tris(2-methyl-8-hydroxy-quinolinato)aluminum, tris(8-hydroxyquinolinato)gallium, bis(10-hydroxybenzo[h] quinolinato)berylium, bis(10-hydroxybenzo[h]-quinolinato) zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato) (2-naphtholato)gallium and the like, but is not limited thereto.

The organic light emitting device according to the present specification can be a top-emission type, a bottom-emission type or a dual-emission type depending on the materials used.

According to one embodiment of the present specification, the compound of Chemical Formula A, the compound of Chemical Formula B, or the compound of Chemical Formula C or D can be included in a solution process organic light emitting device, an organic solar cell or an organic transistor in addition to the organic light emitting device.

Hereinafter, preferred examples are provided in order to illuminate the present disclosure. However, the following examples are provided to more readily understand the present disclosure, and the present disclosure is not limited thereto.

Preparation Example 1: Preparation of Compound of Chemical

Formula A

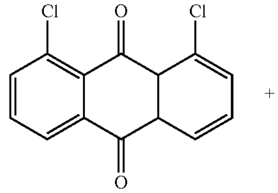

-continued

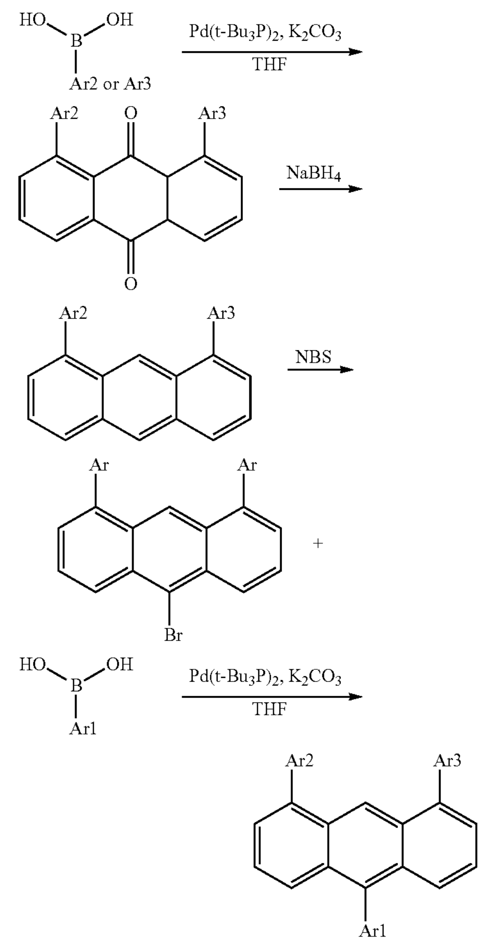

Preparation Example 2: Preparation of Compound of Chemical

Formula B

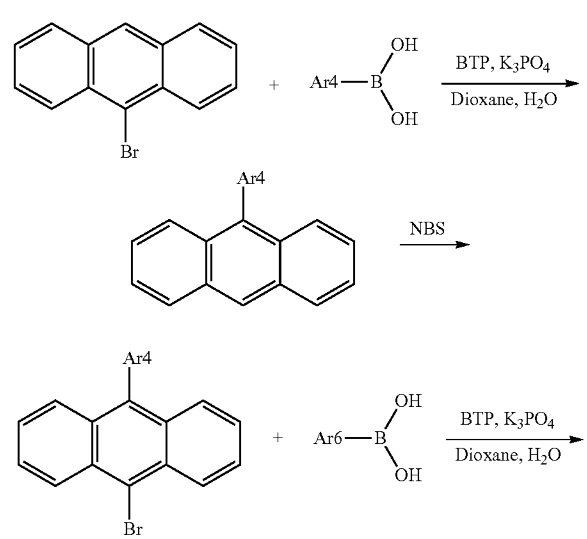

-continued

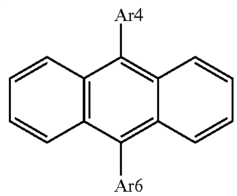

Preparation Example 3: Preparation of Compound of Chemical

Formula C

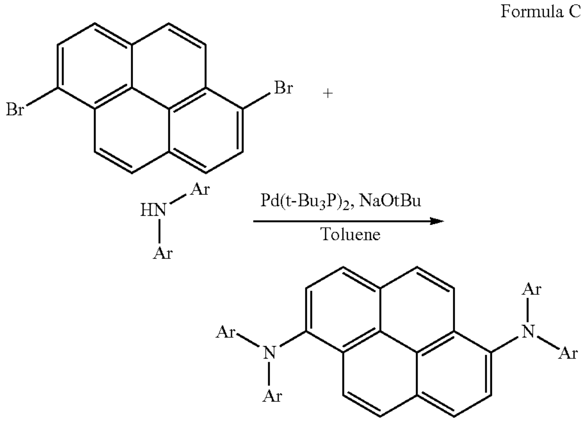

Preparation Example 4: Preparation of Compound of Chemical

Formula D

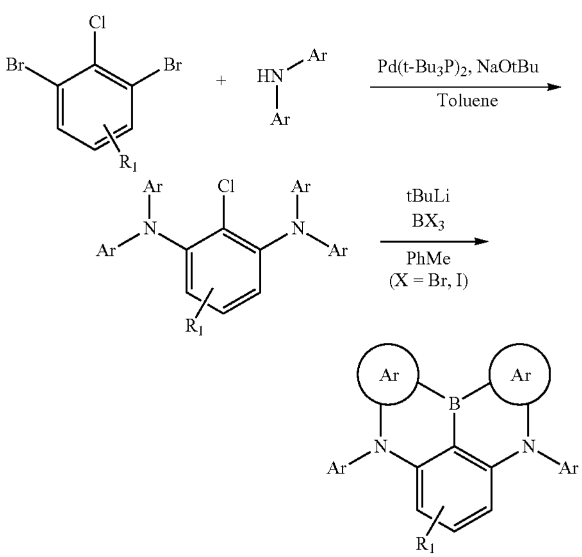

Through Preparation Examples 1 to 4, specific compounds corresponding to Chemical Formulae A, B, C and D can be prepared, and reaction conditions, starting materials and substituents can be changed to those known in the art.

Meanwhile, structures of compounds used in the following examples other than the compounds prepared in the preparation examples are each as follows:

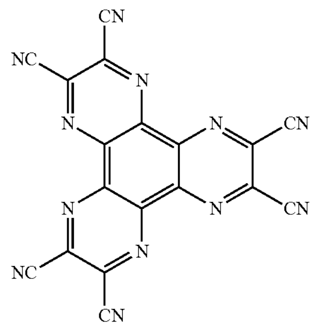

HAT-CN

HTL1

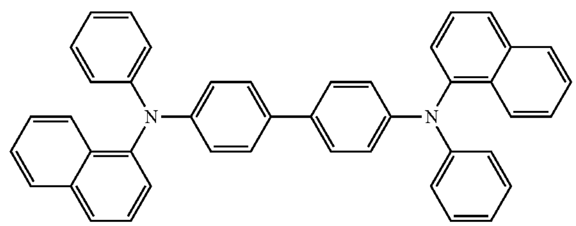

HTL2

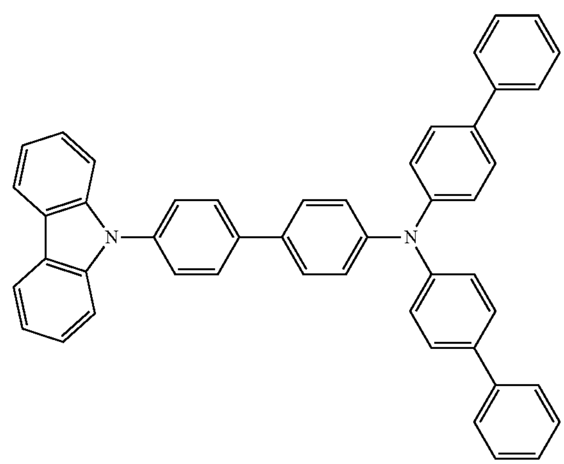

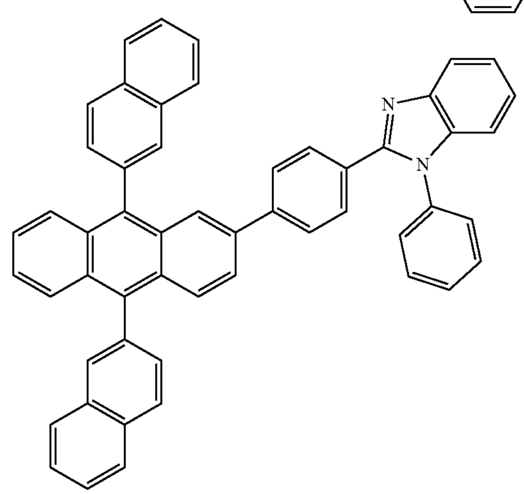

ETL

-continued
A
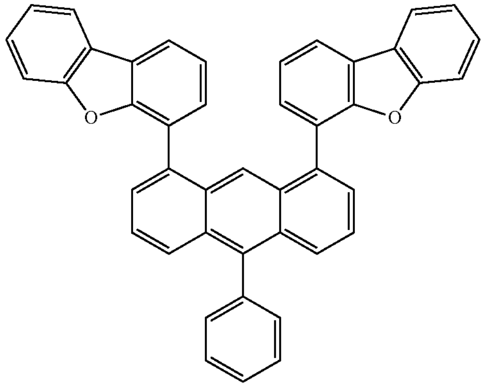
B
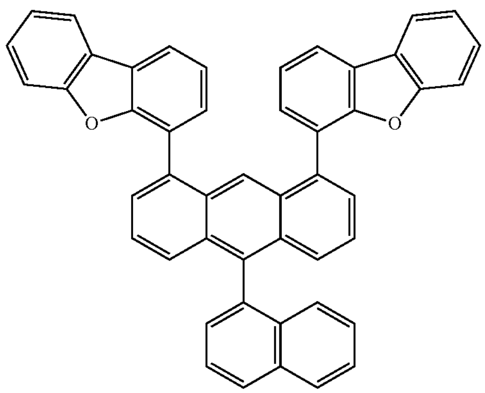
C
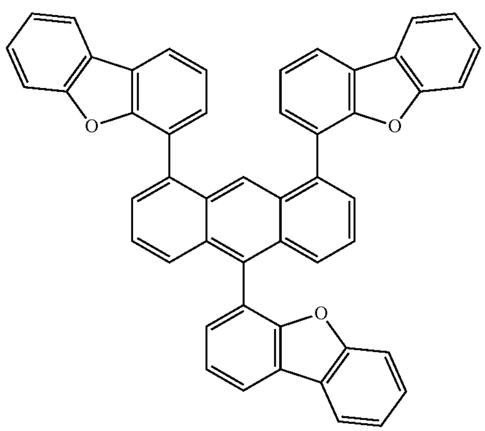
D
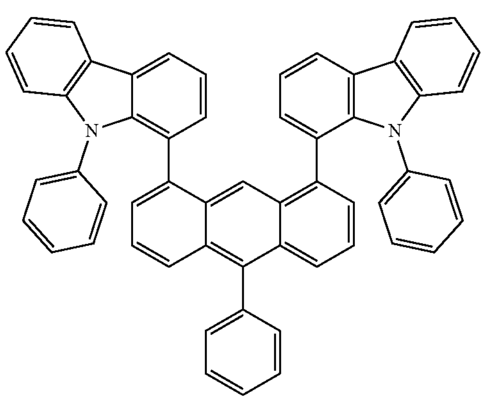
-continued
E
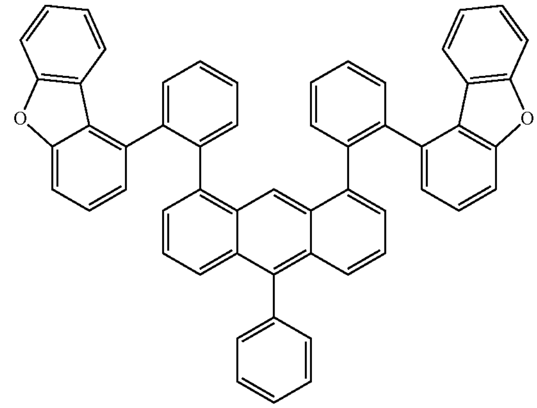
F
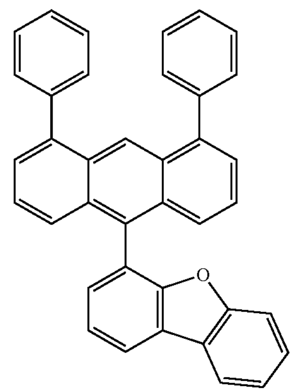
G
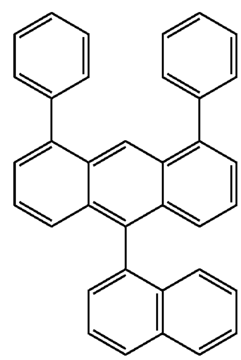
H
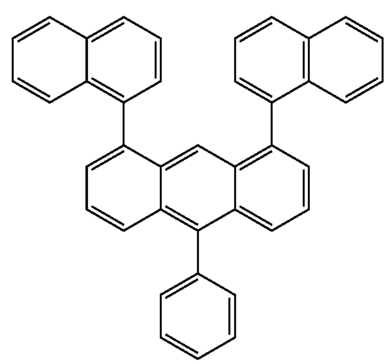

-continued
I
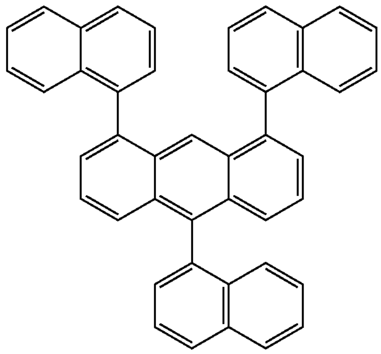
J
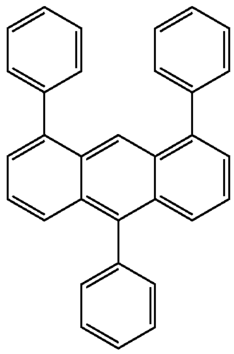
K
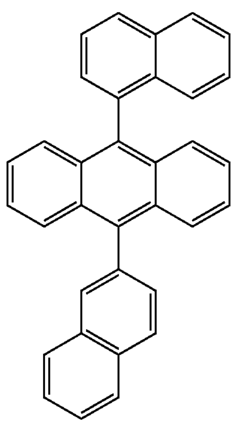
L
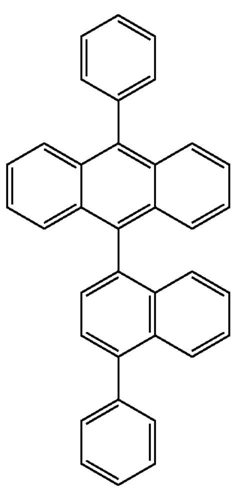
-continued
M
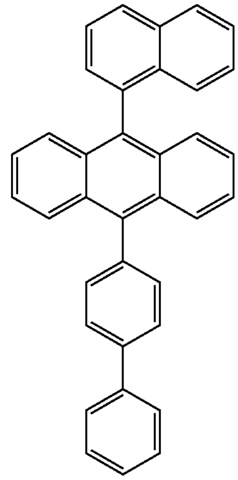
N
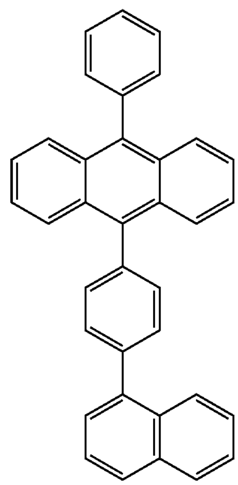
O
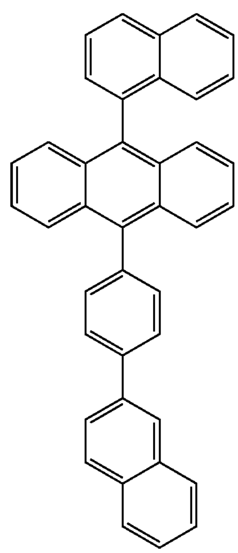

-continued
P
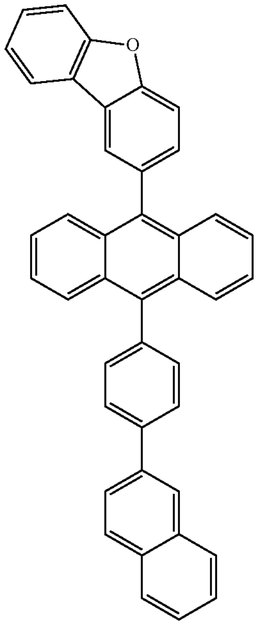
Q
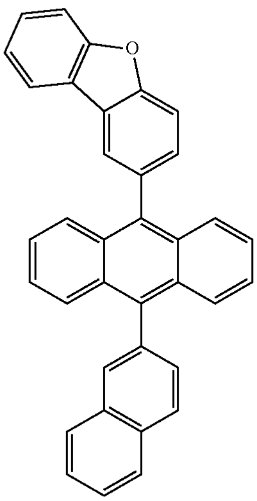
R
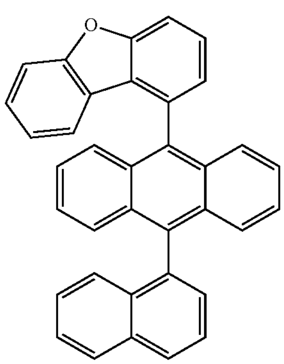
-continued
S
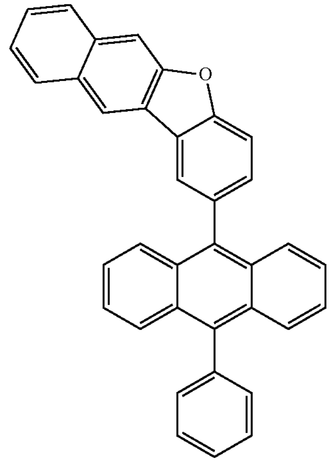
T
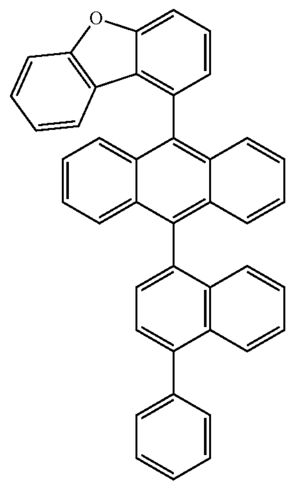
BD-A
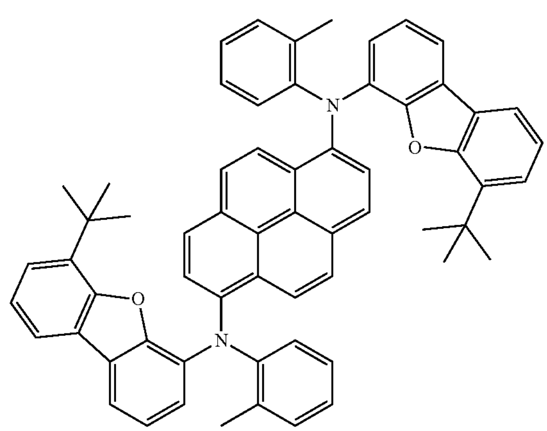

-continued

BD-B

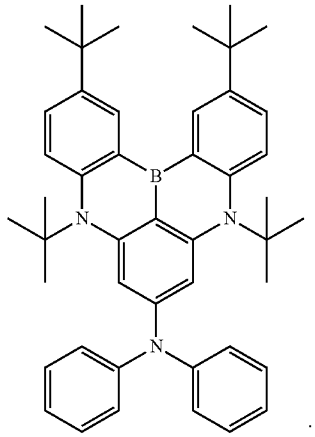

Examples 1 to 100

A glass substrate on which indium tin oxide (ITO) was coated as a thin film to a thickness of 150 nm was placed in distilled water containing dissolved detergent and ultrasonically cleaned. A product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonically cleaned with solvents of isopropyl alcohol, acetone and methanol, then dried, and then transferred to a plasma cleaner. In addition, the substrate was cleaned for 5 minutes using nitrogen plasma, and then transferred to a vacuum depositor. On the transparent ITO electrode prepared as above, a hole injection layer was formed by thermal vacuum depositing the following HAT-CN compound to a thickness of 5 nm. Subsequently, HTL1 was thermal vacuum deposited to a thickness of 100 nm and then HTL2 was thermal vacuum deposited to a thickness of 10 nm to form a hole transfer layer. Subsequently, BH1 and BH2 described in the following Table 1 or 2 were used as a host, BD described in the following Table 1 or 2 was used as a dopant, a content ratio of BH1 and BH2 was from 10:90 to 90:10 in a weight ratio, and the host and the dopant were vacuum deposited at the same time with a content of the dopant being from 1% to 10% with respect the whole host (BH1+BH2) in a weight ratio to form a light emitting layer having a thickness of 20 nm. Subsequently, an electron transfer layer was formed by vacuum depositing ETL to a thickness of 20 nm. Subsequently, an electron injection layer was formed by vacuum depositing LiF to a thickness of 0.5 nm. Subsequently, a cathode was formed by depositing aluminum to a thickness of 100 nm to manufacture an organic light emitting device.

Comparative Examples 1 to 20

Organic light emitting devices were manufactured in the same manner as in the examples except that BH1 described in the following Table 3 was used instead of BH1 and BH2 described in the following Table 1 or 2 as the host, and BD described in the following Table 3 was used instead of BD described in the following Table 1 or as the dopant.

As for device voltage and efficiency, driving voltage and light emission efficiency of the organic light emitting devices were measured at current density of 10 mA/cm$^2$, and T95 means measuring a time taken for the luminance decreasing to 95% compared to its initial luminance. The results are shown in the following Tables 1 to 3.

TABLE 1

| | | | | 10 mA/cm$^2$ Measurement Value | | T95 |
|---|---|---|---|---|---|---|
| | BH1 | BH2 | BD | Vop | Cd/A | Hour |
| Example 1 | A | K | BD-A | 3.81 | 6.85 | 215 |
| Example 2 | A | L | BD-A | 3.61 | 8.22 | 169 |
| Example 3 | A | M | BD-A | 3.99 | 6.08 | 215 |
| Example 4 | A | N | BD-A | 3.34 | 7.46 | 202 |
| Example 5 | A | O | BD-A | 3.72 | 6.67 | 163 |
| Example 6 | B | P | BD-A | 3.30 | 7.37 | 111 |
| Example 7 | B | Q | BD-A | 3.53 | 6.01 | 104 |
| Example 8 | B | R | BD-A | 3.70 | 6.39 | 107 |
| Example 9 | B | S | BD-A | 3.34 | 7.44 | 120 |
| Example 10 | B | T | BD-A | 3.66 | 6.48 | 163 |
| Example 11 | C | S | BD-A | 3.38 | 6.51 | 215 |
| Example 12 | C | T | BD-A | 3.58 | 6.70 | 176 |
| Example 13 | C | R | BD-A | 3.96 | 6.73 | 111 |
| Example 14 | C | K | BD-A | 4.01 | 6.70 | 124 |
| Example 15 | C | Q | BD-A | 3.89 | 6.83 | 137 |
| Example 16 | D | L | BD-A | 3.94 | 6.75 | 156 |
| Example 17 | D | R | BD-A | 3.76 | 6.77 | 189 |
| Example 18 | D | K | BD-A | 3.77 | 6.61 | 208 |
| Example 19 | D | N | BD-A | 4.00 | 6.77 | 143 |
| Example 20 | D | O | BD-A | 3.47 | 7.51 | 176 |
| Example 21 | E | P | BD-A | 3.94 | 6.10 | 163 |
| Example 22 | E | M | BD-A | 3.37 | 6.44 | 143 |
| Example 23 | E | N | BD-A | 4.00 | 8.41 | 156 |
| Example 24 | E | T | BD-A | 3.47 | 7.59 | 137 |
| Example 25 | E | L | BD-A | 3.73 | 6.51 | 117 |
| Example 26 | F | R | BD-A | 3.78 | 6.48 | 124 |
| Example 27 | F | S | BD-A | 3.64 | 6.65 | 104 |
| Example 28 | F | M | BD-A | 3.60 | 6.92 | 130 |
| Example 29 | F | R | BD-A | 3.77 | 6.59 | 182 |
| Example 30 | F | T | BD-A | 3.65 | 6.72 | 114 |
| Example 31 | G | K | BD-A | 4.03 | 6.10 | 130 |
| Example 32 | G | P | BD-A | 3.71 | 7.71 | 143 |
| Example 33 | G | M | BD-A | 3.36 | 7.99 | 163 |
| Example 34 | G | P | BD-A | 3.40 | 6.03 | 104 |
| Example 35 | G | O | BD-A | 3.62 | 6.56 | 111 |
| Example 36 | H | N | BD-A | 3.30 | 8.22 | 182 |
| Example 37 | H | N | BD-A | 3.66 | 6.46 | 124 |
| Example 38 | H | M | BD-A | 4.01 | 6.37 | 130 |
| Example 39 | H | Q | BD-A | 3.47 | 6.39 | 124 |
| Example 40 | H | L | BD-A | 3.47 | 6.48 | 111 |
| Example 41 | I | M | BD-A | 3.64 | 7.83 | 182 |
| Example 42 | I | S | BD-A | 3.99 | 6.75 | 117 |
| Example 43 | I | T | BD-A | 3.70 | 6.61 | 130 |
| Example 44 | I | N | BD-A | 3.94 | 7.51 | 195 |
| Example 45 | I | T | BD-A | 3.47 | 6.59 | 182 |
| Example 46 | J | O | BD-A | 3.65 | 6.72 | 156 |
| Example 47 | J | Q | BD-A | 3.94 | 6.03 | 104 |
| Example 48 | J | Q | BD-A | 3.77 | 6.77 | 111 |
| Example 49 | J | P | BD-A | 3.78 | 7.44 | 130 |
| Example 50 | J | N | BD-A | 3.81 | 6.85 | 117 |

TABLE 2

| | | | | 10 mA/cm2 Measurement Value | | T95 |
|---|---|---|---|---|---|---|
| | BH1 | BH2 | BD | Vop | Cd/A | Hour |
| Example 51 | A | K | BD-B | 3.80 | 6.77 | 212 |
| Example 52 | A | L | BD-B | 3.60 | 8.12 | 167 |
| Example 53 | A | M | BD-B | 3.98 | 6.03 | 212 |
| Example 54 | A | N | BD-B | 3.33 | 7.41 | 199 |
| Example 55 | A | 0 | BD-B | 3.71 | 6.59 | 119 |
| Example 56 | B | P | BD-B | 3.29 | 6.31 | 109 |

TABLE 2-continued

| | BH1 | BH2 | BD | 10 mA/cm2 Measurement Value Vop | Cd/A | T95 Hour |
|---|---|---|---|---|---|---|
| Example 57 | B | 4 | BD-B | 3.52 | 8.94 | 103 |
| Example 58 | B | R | BD-B | 3.69 | 6.31 | 100 |
| Example 59 | B | S | BD-B | 3.33 | 7.38 | 105 |
| Example 60 | B | T | BD-B | 3.65 | 6.41 | 161 |
| Example 61 | C | S | BD-B | 3.37 | 6.44 | 212 |
| Example 62 | C | T | BD-B | 3.57 | 6.62 | 174 |
| Example 63 | C | R | BD-B | 3.95 | 6.65 | 109 |
| Example 64 | C | K | BD-B | 4.00 | 6.62 | 122 |
| Example 65 | C | 4 | BD-B | 3.88 | 7.76 | 135 |
| Example 66 | D | L | BD-B | 3.93 | 6.67 | 154 |
| Example 67 | D | R | BD-B | 3.75 | 6.70 | 187 |
| Example 68 | D | K | BD-B | 3.76 | 6.53 | 206 |
| Example 69 | D | N | BD-B | 3.99 | 6.69 | 142 |
| Example 70 | D | 0 | BD-B | 3.46 | 7.45 | 174 |
| Example 71 | E | P | BD-B | 3.93 | 6.03 | 161 |
| Example 72 | E | M | BD-B | 3.36 | 7.37 | 142 |
| Example 73 | E | N | BD-B | 3.99 | 6.34 | 154 |
| Example 74 | E | T | BD-B | 3.46 | 6.53 | 135 |
| Example 75 | E | L | BD-B | 3.72 | 7.46 | 116 |
| Example 76 | F | R | BD-B | 3.77 | 6.41 | 122 |
| Example 77 | F | S | BD-B | 3.63 | 6.57 | 103 |
| Example 78 | F | M | BD-B | 3.59 | 7.85 | 129 |
| Example 79 | F | R | BD-B | 3.76 | 6.51 | 106 |
| Example 80 | F | T | BD-B | 3.64 | 6.64 | 103 |
| Example 81 | G | K | BD-B | 4.02 | 6.03 | 129 |
| Example 82 | G | P | BD-B | 3.70 | 6.64 | 142 |
| Example 83 | G | M | BD-B | 3.35 | 7.92 | 161 |
| Example 84 | G | P | BD-B | 3.39 | 7.96 | 103 |
| Example 85 | G | 0 | BD-B | 3.61 | 6.48 | 109 |
| Example 86 | H | N | BD-B | 3.29 | 8.12 | 180 |
| Example 87 | H | N | BD-B | 3.65 | 6.41 | 122 |
| Example 88 | H | M | BD-B | 4.00 | 6.31 | 129 |
| Example 89 | H | 4 | BD-B | 3.46 | 6.31 | 122 |
| Example 90 | H | L | BD-B | 3.46 | 6.41 | 113 |
| Example 91 | I | M | BD-B | 3.63 | 8.76 | 180 |
| Example 92 | I | S | BD-B | 3.98 | 7.67 | 116 |
| Example 93 | I | T | BD-B | 3.69 | 6.53 | 129 |
| Example 94 | I | N | BD-B | 3.93 | 7.45 | 193 |
| Example 95 | I | T | BD-B | 3.46 | 7.53 | 180 |
| Example 96 | J | 0 | BD-B | 3.64 | 6.64 | 154 |
| Example 97 | J | 4 | BD-B | 3.93 | 6.96 | 103 |
| Example 98 | J | 4 | BD-B | 3.76 | 6.70 | 109 |
| Example 99 | J | P | BD-B | 3.77 | 6.37 | 129 |
| Example 100 | J | N | BD-B | 3.80 | 6.77 | 116 |

TABLE 3

| | BH1 | BD | 10 mA/cm$^2$ Measurement Value Vop | Cd/A | T95 Hour |
|---|---|---|---|---|---|
| Comparative Example 1 | A | BD-A | 3.90 | 5.75 | 77 |
| Comparative Example 2 | B | BD-A | 4.10 | 4.31 | 73 |
| Comparative Example 3 | C | BD-A | 3.98 | 5.43 | 64 |
| Comparative Example 4 | D | BD-A | 3.93 | 4.67 | 59 |
| Comparative Example 5 | E | BD-A | 4.00 | 5.93 | 94 |
| Comparative Example 6 | F | BD-A | 3.99 | 5.68 | 85 |
| Comparative Example 7 | G | BD-A | 3.92 | 5.05 | 80 |
| Comparative Example 8 | H | BD-A | 4.12 | 5.68 | 77 |
| Comparative Example 9 | I | BD-A | 3.93 | 4.64 | 86 |
| Comparative Example 10 | J | BD-A | 3.95 | 5.77 | 96 |
| Comparative Example 11 | K | BD-B | 3.97 | 5.80 | 79 |
| Comparative Example 12 | L | BD-B | 3.97 | 5.96 | 65 |
| Comparative Example 13 | M | BD-B | 4.05 | 5.99 | 90 |
| Comparative Example 14 | N | BD-B | 4.00 | 5.96 | 87 |
| Comparative Example 15 | O | BD-B | 3.98 | 4.98 | 93 |
| Comparative Example 16 | P | BD-B | 3.93 | 5.00 | 94 |
| Comparative Example 17 | Q | BD-B | 3.95 | 4.03 | 80 |
| Comparative Example 18 | R | BD-B | 3.96 | 4.88 | 79 |

TABLE 3-continued

| | BH1 | BD | 10 mA/cm$^2$ Measurement Value Vop | Cd/A | T95 Hour |
|---|---|---|---|---|---|
| Comparative Example 19 | S | BD-B | 3.99 | 5.02 | 96 |
| Comparative Example 20 | Y | BD-B | 3.96 | 5.71 | 82 |

From the results of Tables 1 to 3, it was identified that the organic light emitting device including the compound of Chemical Formula A and the compound of Chemical Formula B according to the present disclosure as a host had high efficiency and long lifetime properties compared to the organic light emitting device including only any one type of compound between the compound of Chemical Formula A and the compound of Chemical Formula B as a host.

The invention claimed is:

1. An organic light emitting device comprising:

an anode;

a cathode; and a light emitting layer provided between the anode and the cathode, wherein the light emitting layer comprises a first host material comprising a compound of the following Chemical Formula A, a second host material comprising a compound of the following Chemical Formula B, and a dopant material comprising a compound of the following Chemical Formula C or D:

[Chemical Formula A]

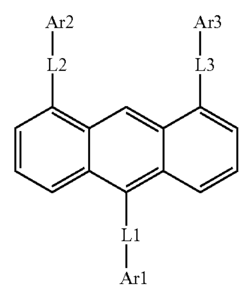

wherein in Chemical Formula A:

Ar1 to Ar3 are the same as or different from each other, and each independently is one of the following Chemical Formula 17 or 18:

[Chemical Formula 17]

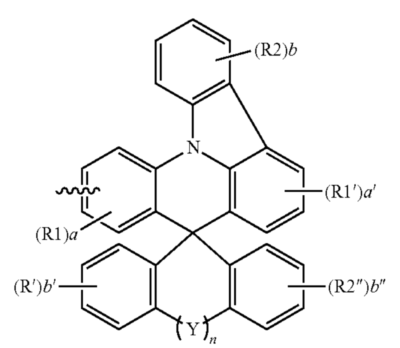

-continued

[Chemical Formula 18]

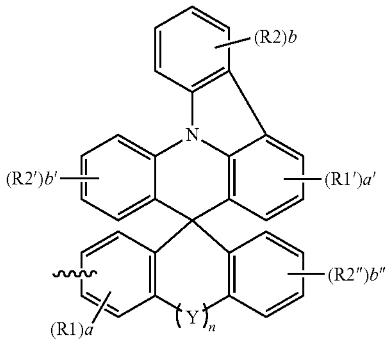

wherein in Chemical Formulae 17 and 18:

[wavy bond] is a site bonding to one of L1 to L3;

Y is a direct bond, O, S, Se, Ge, NR, PR, SiRR' or CRR', n is 0 or 1, and when n is 0, hydrogen bonds to each of two positions to which Y bonds;

R, R', R1, R2, R2' and R2" are the same as or different from each other, and each independently is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group, or bond to adjacent groups to form a substituted or unsubstituted ring;

a is an integer of 0 to 3, and when a is 2 or greater, the R1s are the same as or different from each other;

b, b' and b" are an integer of 0 to 4, and when b, b' or b" is 2 or greater, the R2s, R2's or R2"s are the same as or different from each other;

R1' is hydrogen, deuterium, a halogen group, a hydroxyl group, a silyl group, a nitrile group, a nitro group, a substituted or unsubstituted alkyl group, a substituted or unsubstituted cycloalkyl group, a substituted or unsubstituted alkoxy group, a substituted or unsubstituted aryloxy group, a substituted or unsubstituted arylamine group, a substituted or unsubstituted alkylamine group, a substituted or unsubstituted aryl group, or a substituted or unsubstituted heterocyclic group;

a' is an integer of 0 to 3, and when a' is 2 or greater, the R1's are the same as or different from each other; and L1 to L3 are the same as or different from each other, and each independently is a direct bond, a substituted or unsubstituted arylene group, or a substituted or unsubstituted divalent heterocyclic group;

[Chemical Formula B]

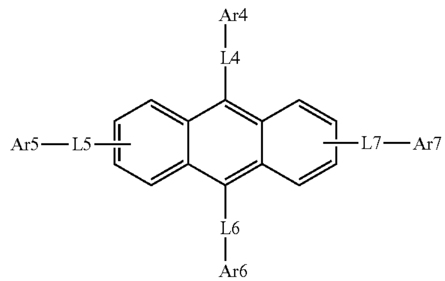

wherein in Chemical Formula B:

(a) Ar4 to Ar7 are the same as or different from each other, and each independently is hydrogen, an aryl group, or a substituted or unsubstituted tetracyclic or higher heterocyclic group, wherein at least one of Ar4 and Ar6 is a substituted or unsubstituted tetracyclic or higher heterocyclic group; and L4 to L7 are the same as or different from each other, and each independently is a direct bond, a substituted or unsubstituted arylene group, or a substituted or unsubstituted divalent heterocyclic group; or (b) Ar4 to Ar7 are the same as or different from each other, and each independently is hydrogen, an unsubstituted aryl group, or a substituted or unsubstituted tetracyclic or higher heterocyclic group; and L4 to L7 are the same as or different from each other, and each independently is a direct bond, a phenylene group or a naphthylene group;

[Chemical Formula C]

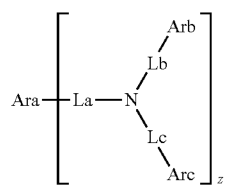

wherein in Chemical Formula C:

Ara to Arc are the same as or different from each other, and each independently is a substituted or unsubstituted aryl group, or a substituted or unsubstituted heterocyclic group;

La to Lc are the same as or different from each other, and each independently is a direct bond, a substituted or unsubstituted arylene group, or a substituted or unsubstituted divalent heterocyclic group; and z is an integer of 1 to 3, and when z is an integer of 2 or greater, structures in the parentheses are the same as or different from each other;

[Chemical Formula D]

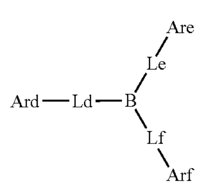

wherein in Chemical Formula D:

Ard to Arf are the same as or different from each other, and each independently is a substituted or unsubstituted aryl group, or a substituted or unsubstituted heterocyclic group, or adjacent groups bond to each other to form a substituted or unsubstituted ring; and Ld to Lf are the same as or different from each other, and each independently is a direct bond, a substituted or unsubstituted arylene group, or a substituted or unsubstituted divalent heterocyclic group.

2. An organic light emitting device comprising:

an anode;

a cathode; and a light emitting layer provided between the anode and the cathode, wherein the light emitting layer comprises a first host material comprising a compound selected from among the following compounds, a second host material comprising a compound of the following Chemical Formula B, and a dopant material comprising a compound of the following Chemical Formula C or D:

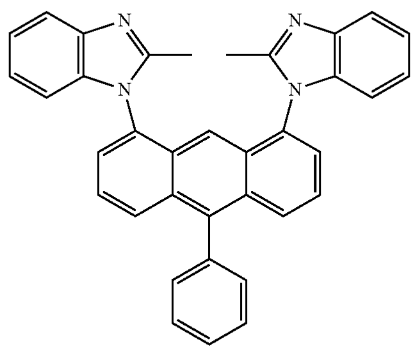

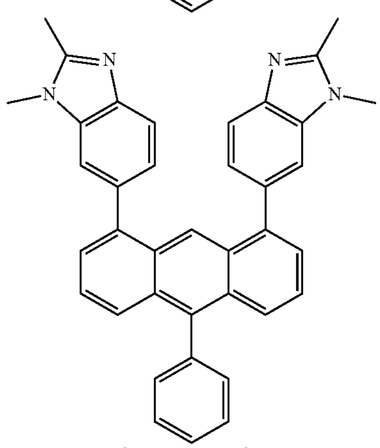

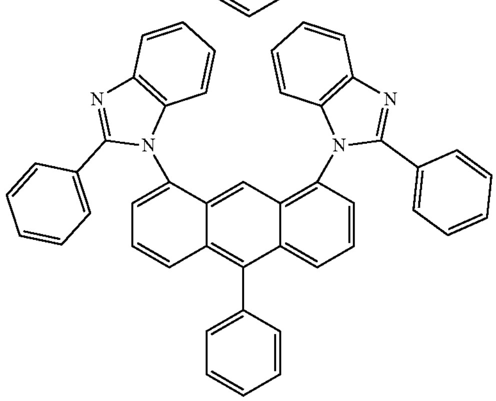

-continued

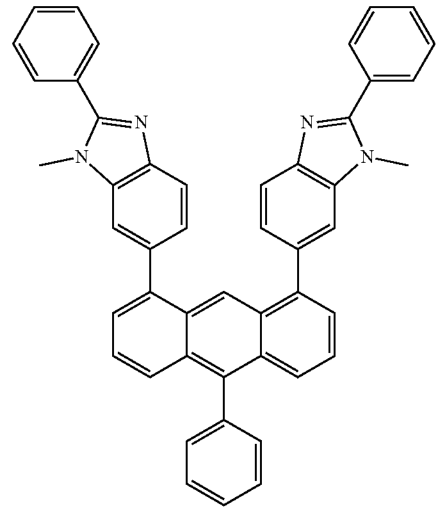

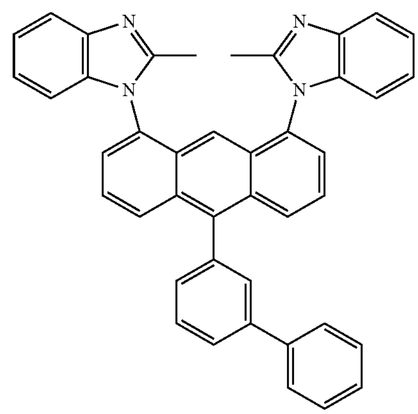

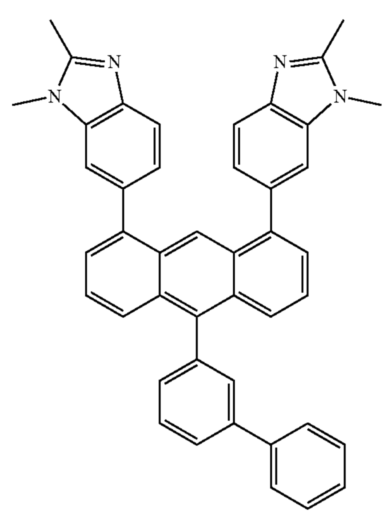

-continued
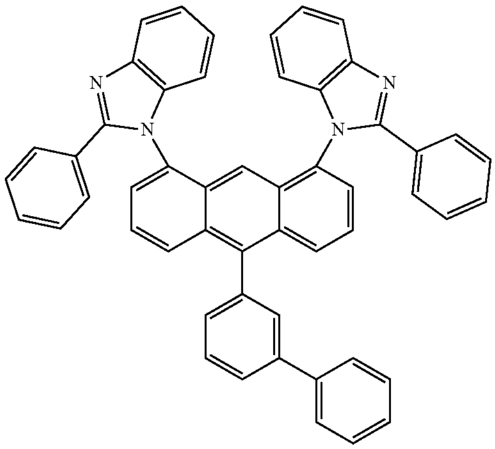
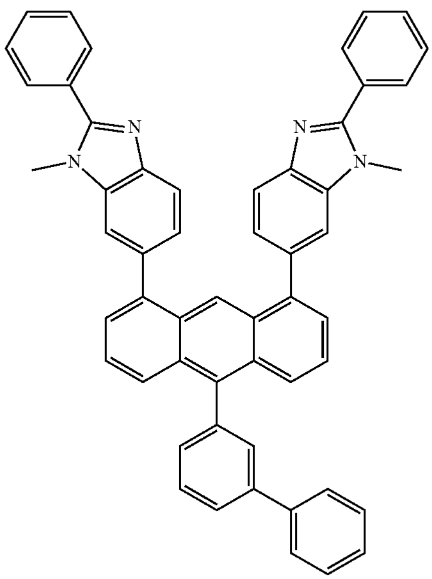
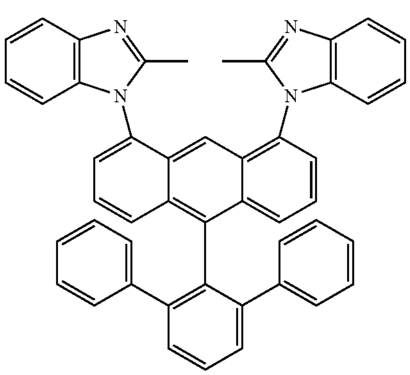
-continued
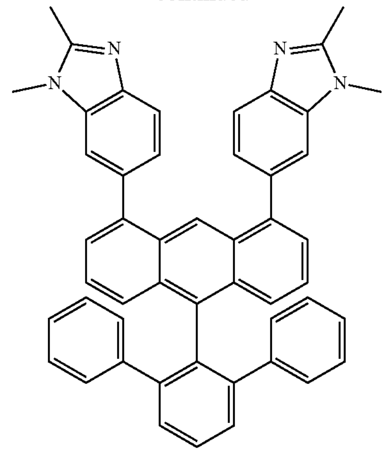
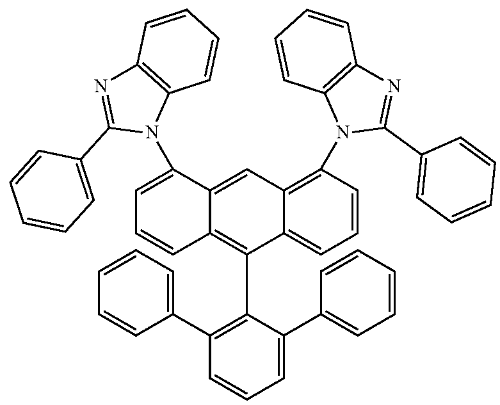
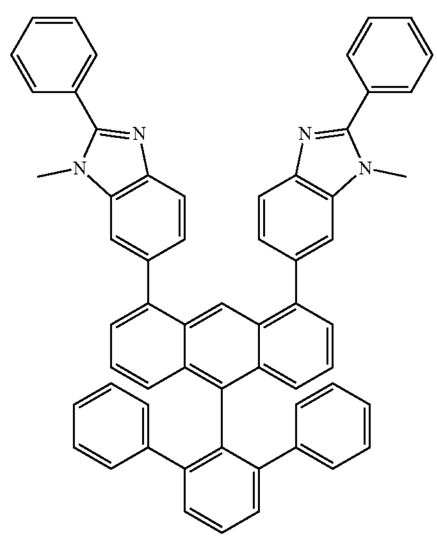

-continued
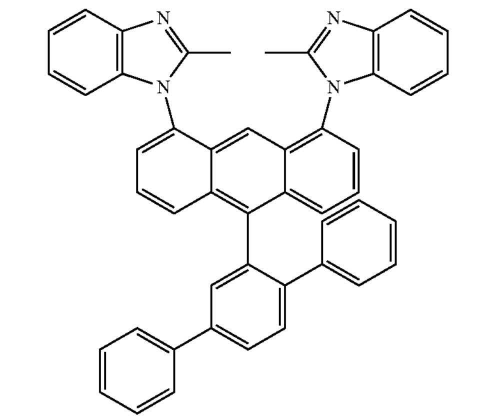
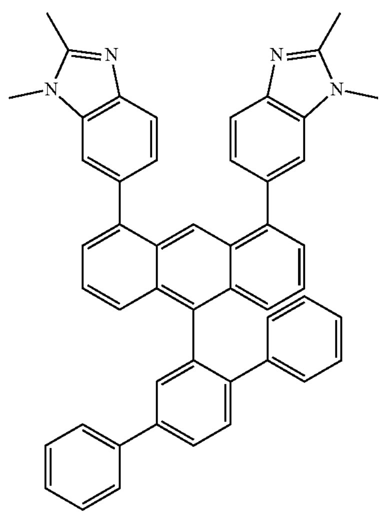
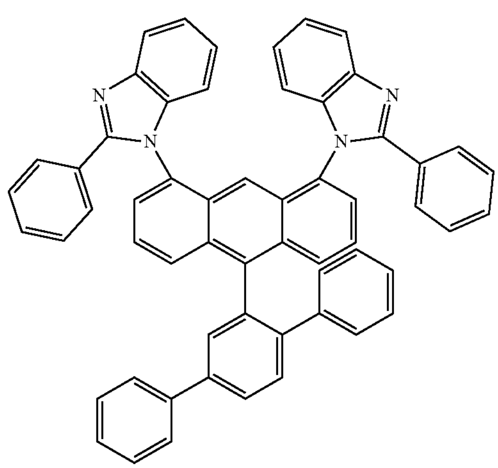
-continued
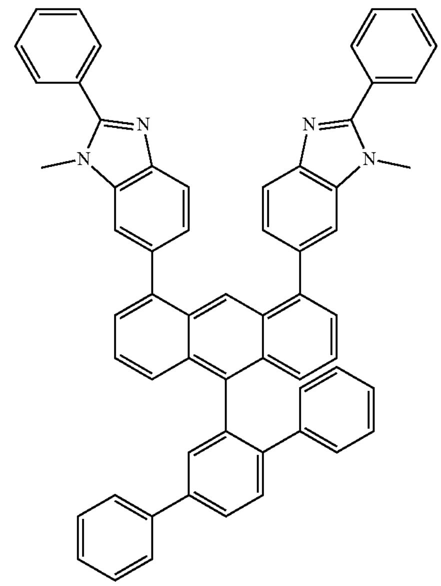 [SMILES: Cn1c(-c2ccccc2)nc2ccc(-c3cccc4c(-c5cc(-c6ccccc6)ccc5-c5ccccc5)c5cccc(-c6ccc7nc(-c8ccccc8)n(C)c7c6)c5cc34)cc21]
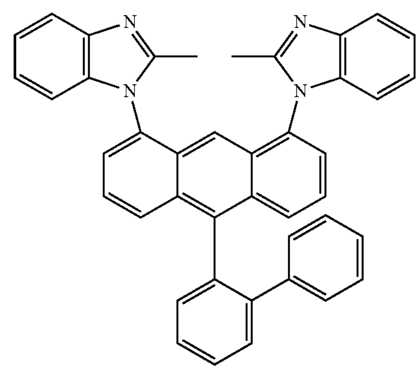
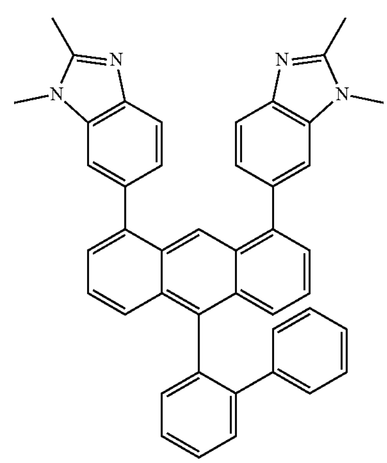

-continued
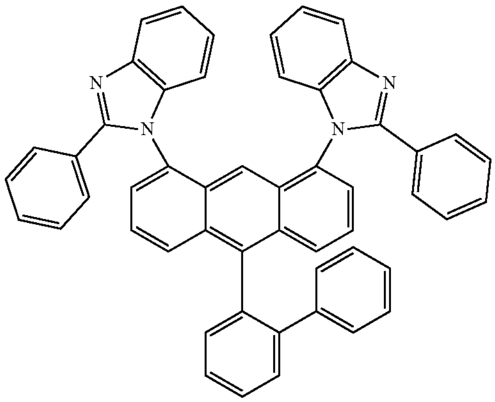
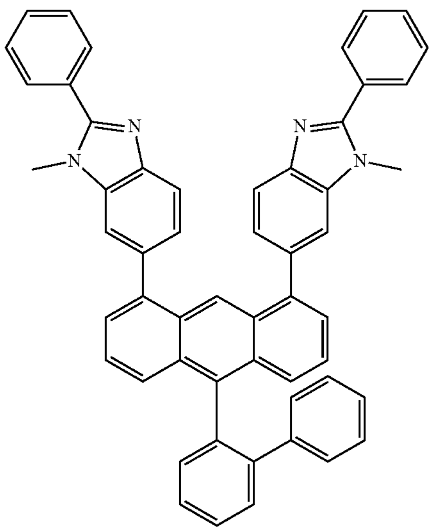
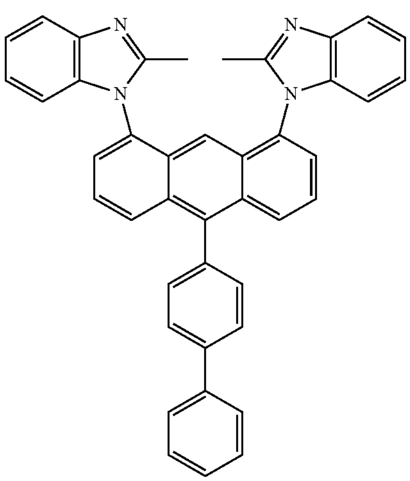
-continued
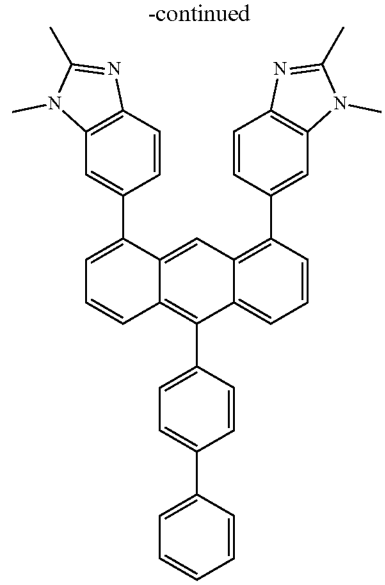
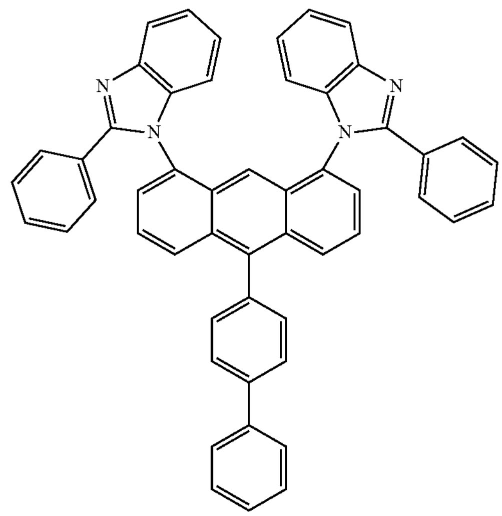
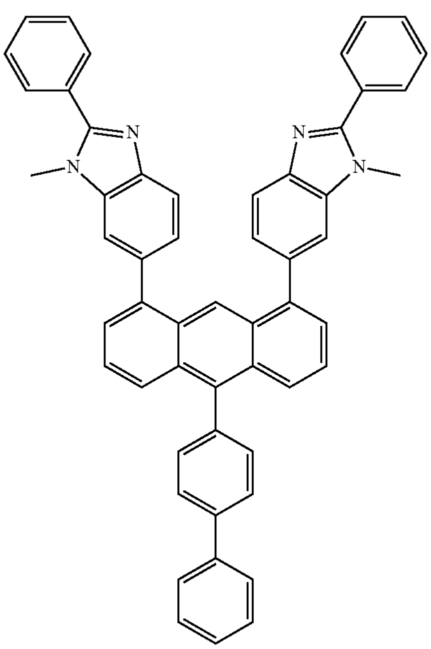 [SMILES: Cn1c(-c2ccccc2)nc2ccc(-c3cccc4c(-c5ccc(-c6ccccc6)cc5)c5cccc(-c6ccc7nc(-c8ccccc8)n(C)c7c6)c5cc34)cc21]

-continued
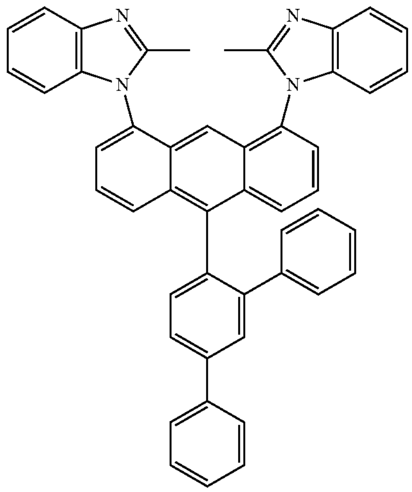
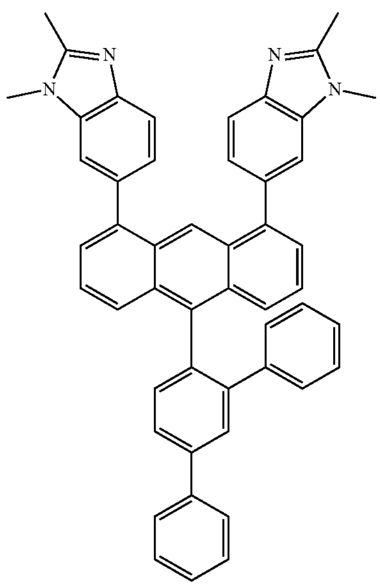
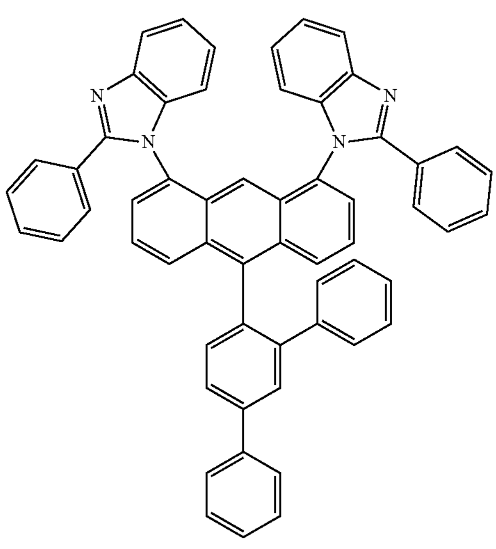
-continued
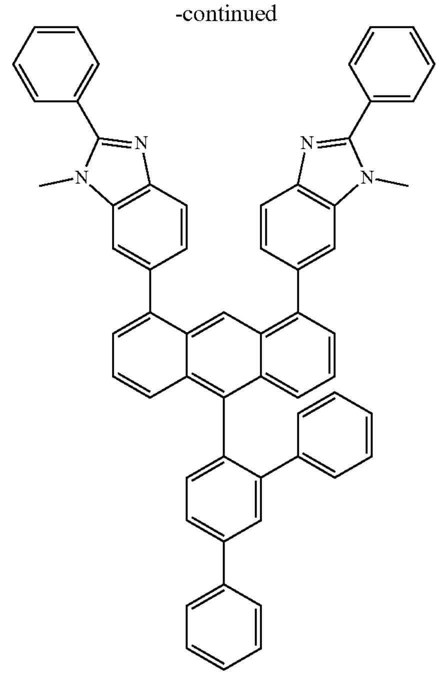
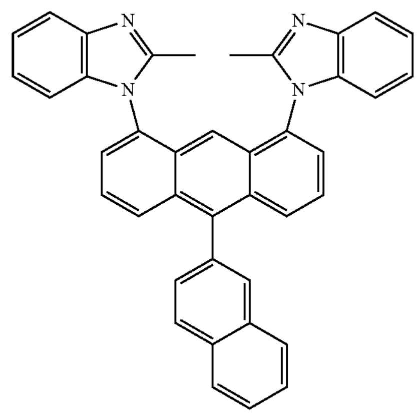
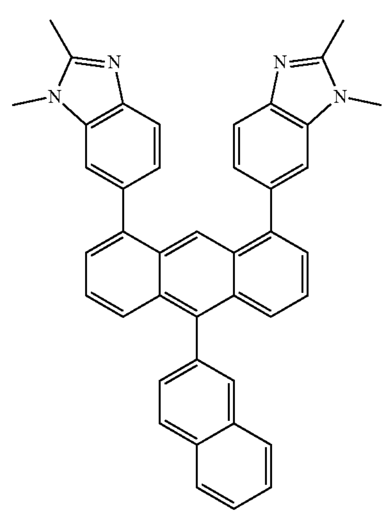

-continued
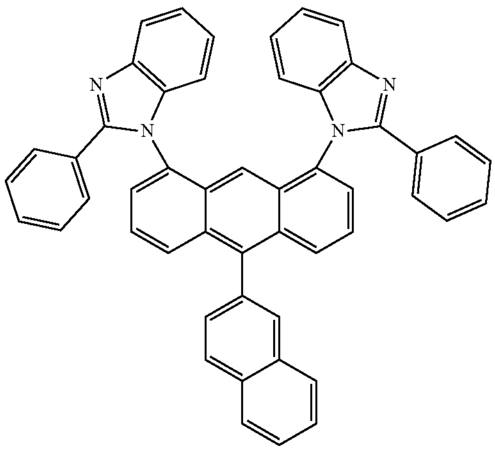
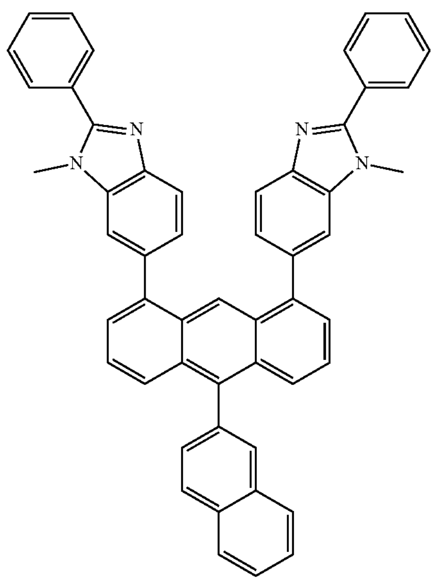
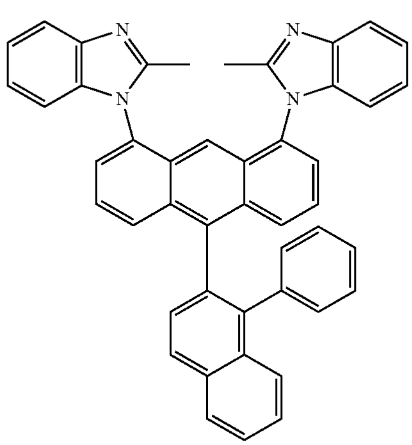
-continued
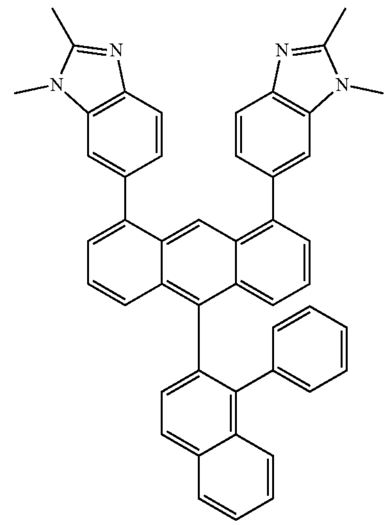
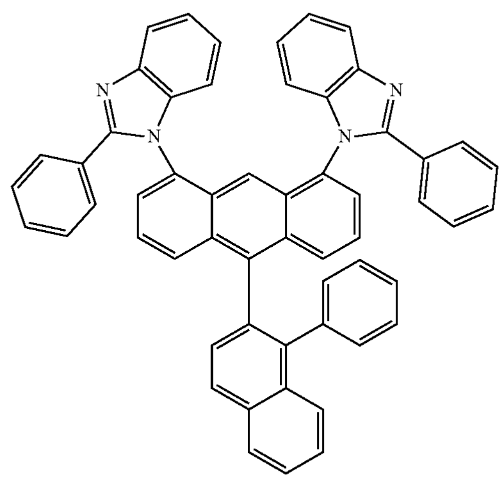
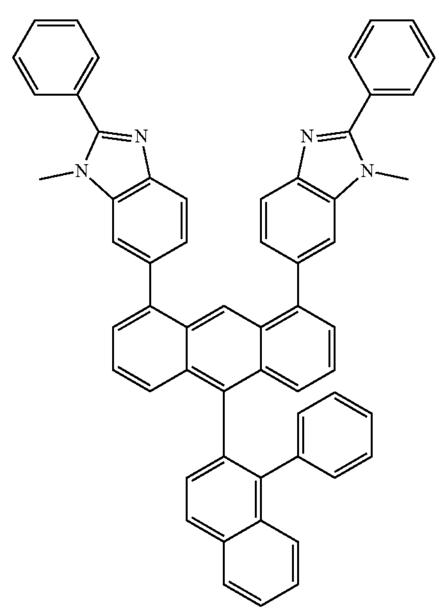

-continued
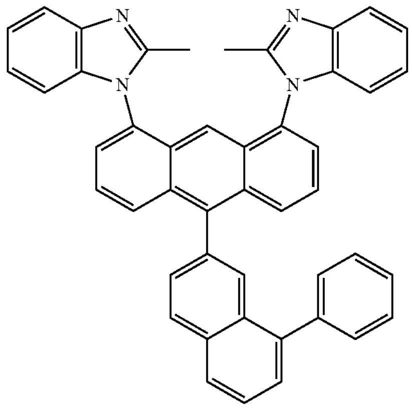
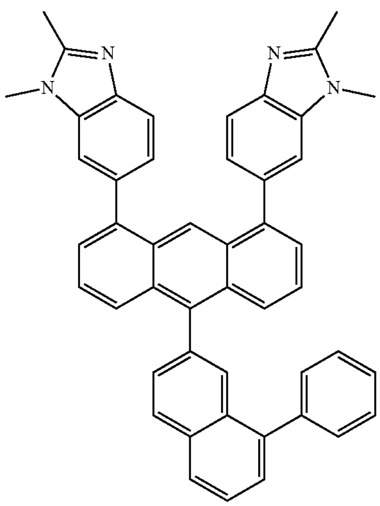
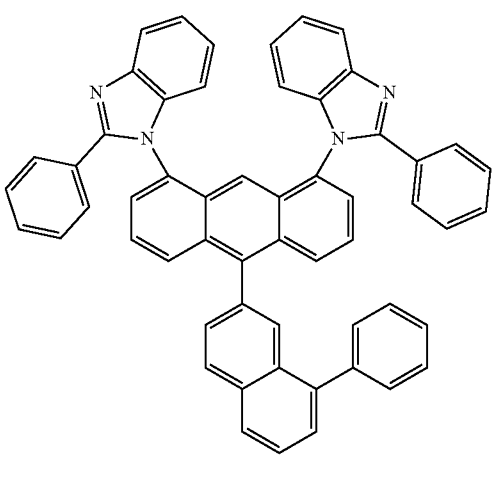
-continued
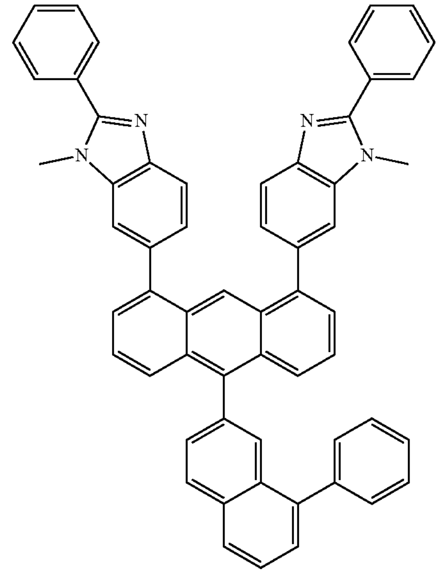
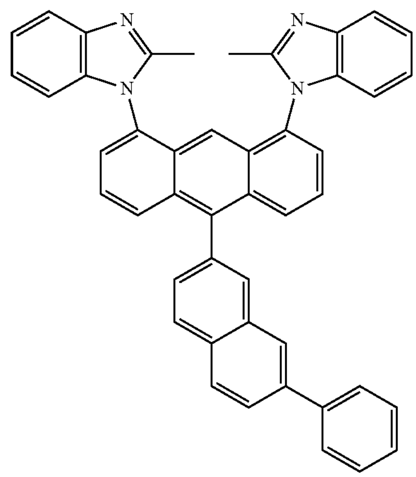
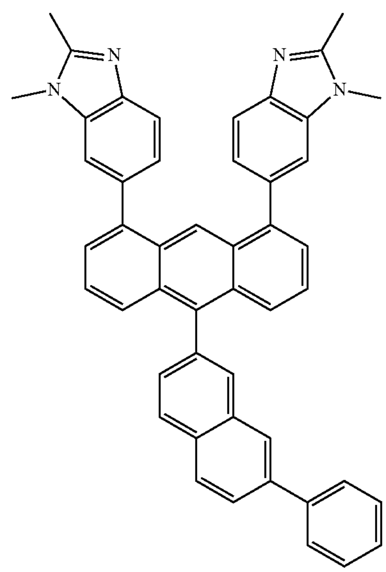

-continued
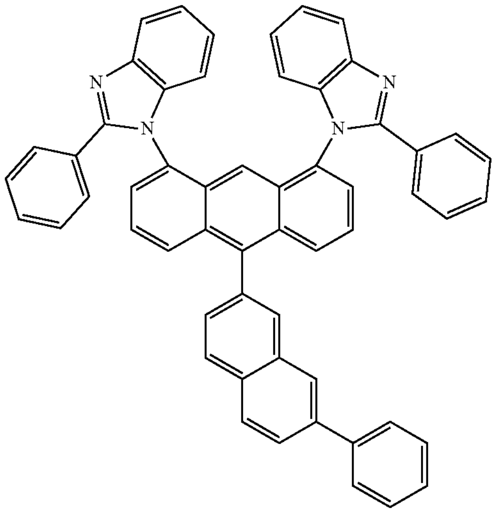
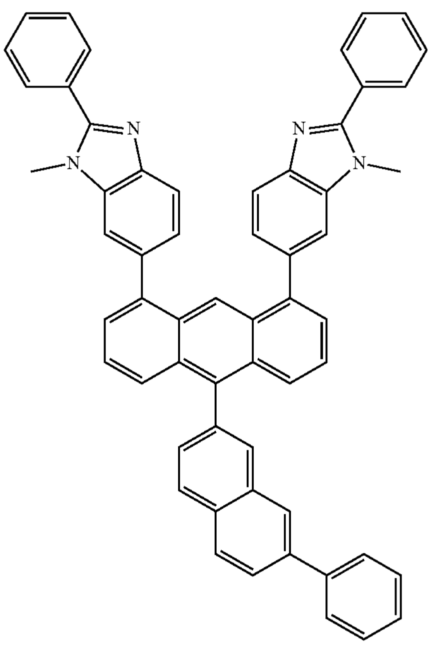
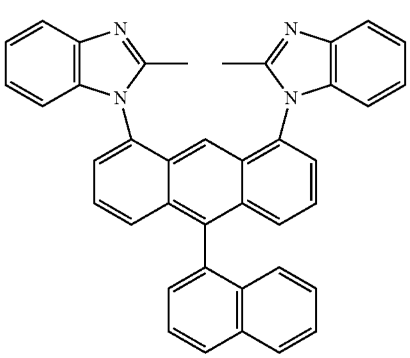
-continued
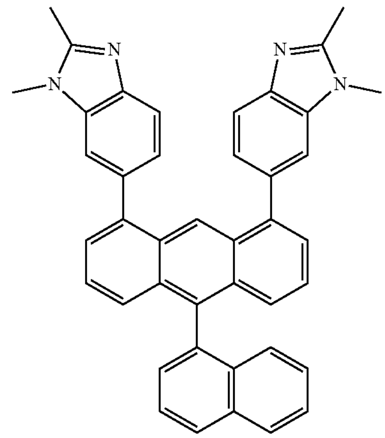
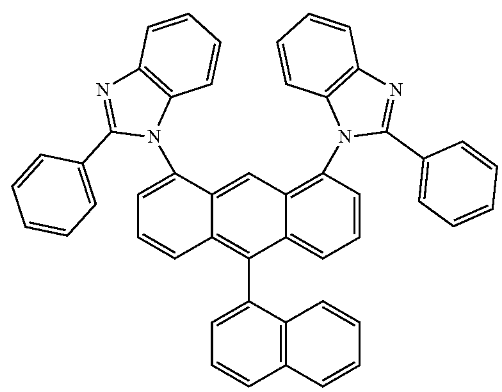
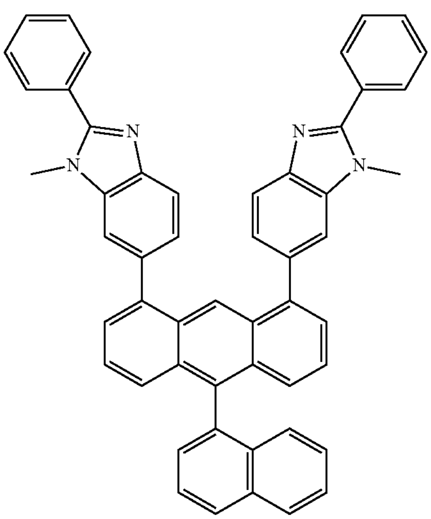

-continued
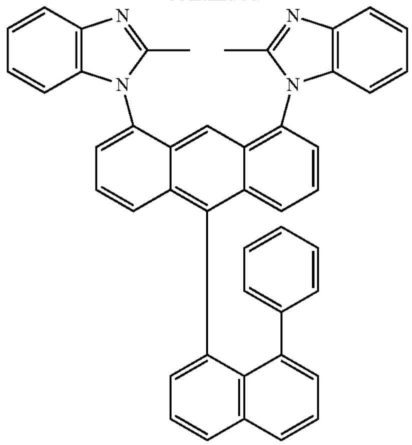
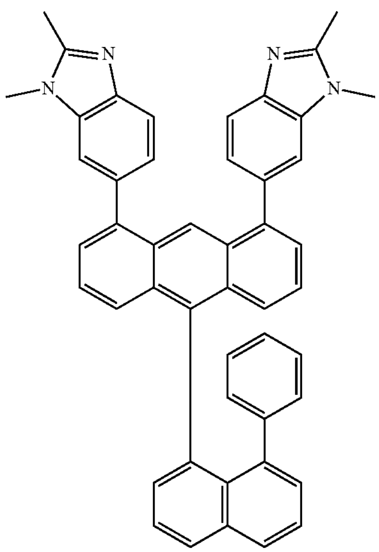
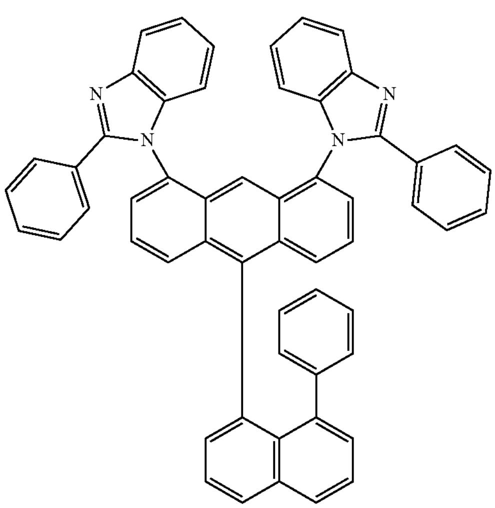
-continued
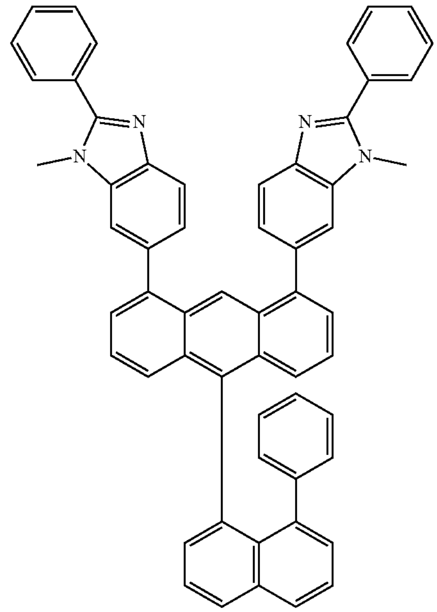
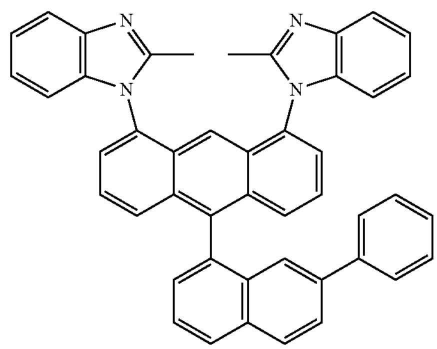
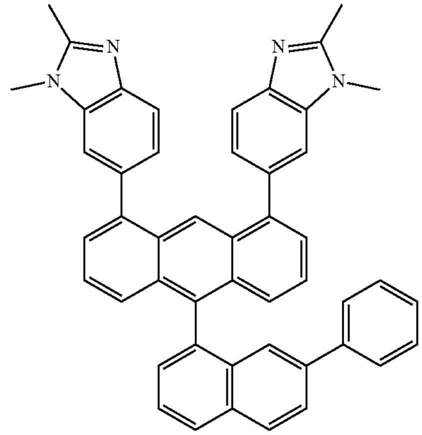

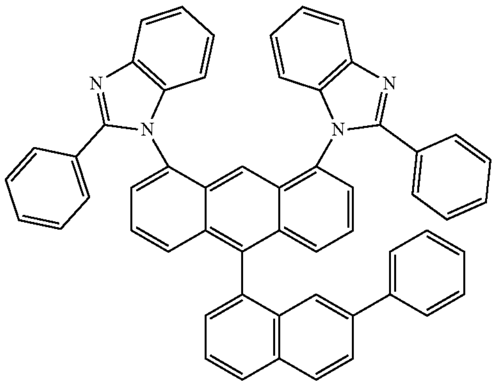
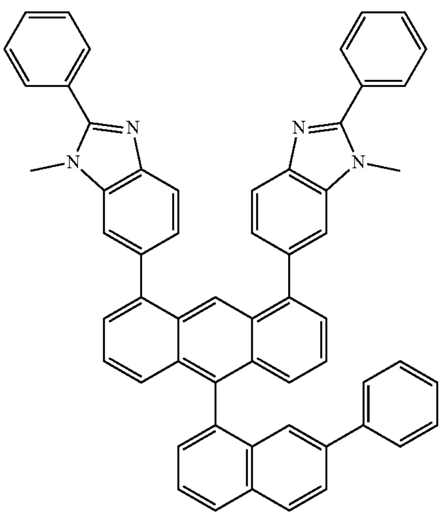
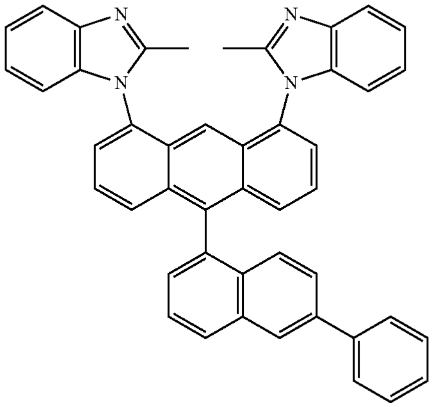
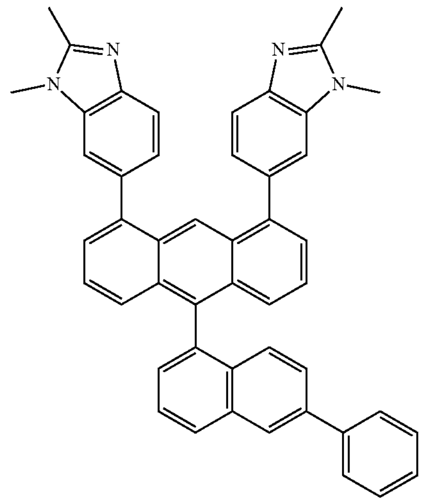
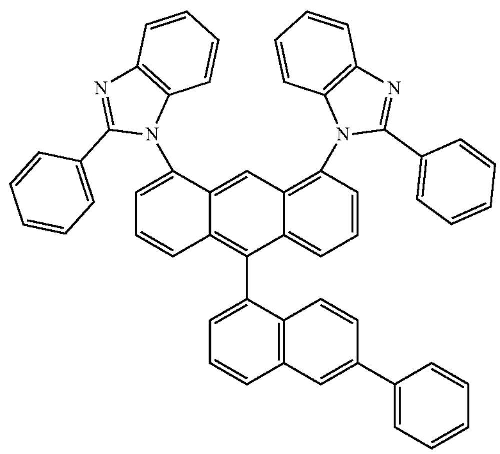
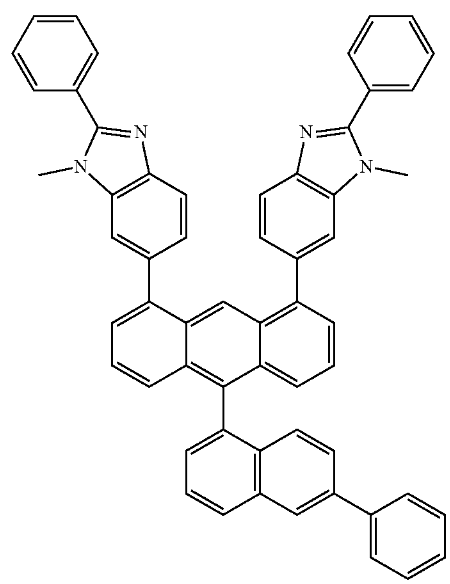

-continued
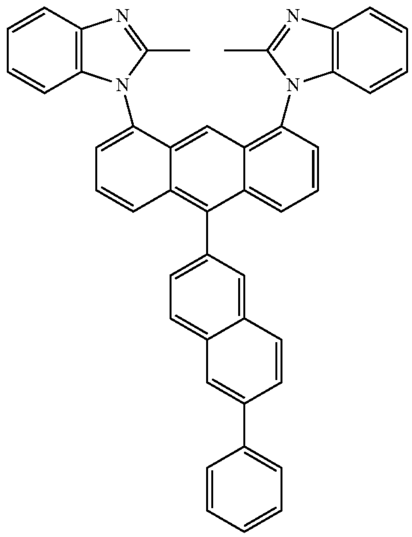
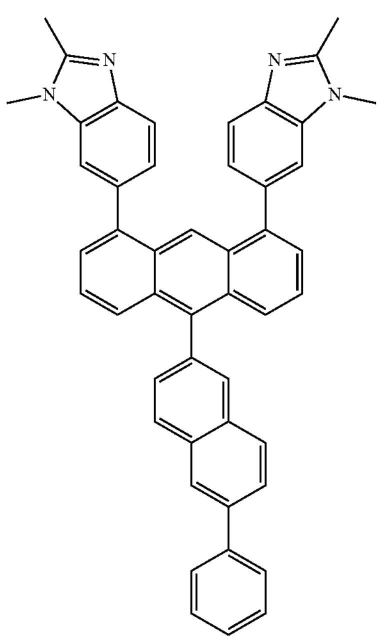
-continued
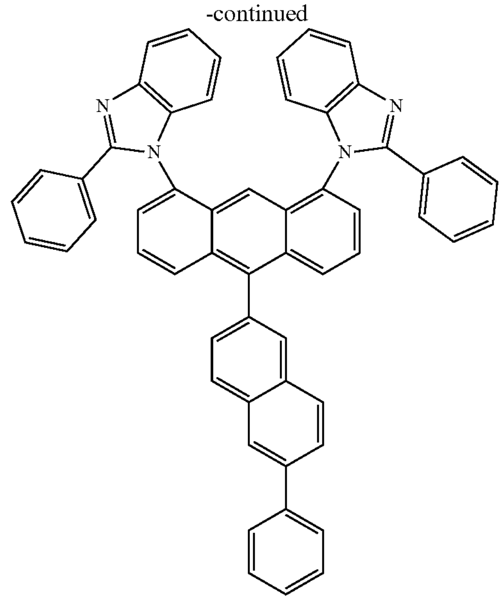
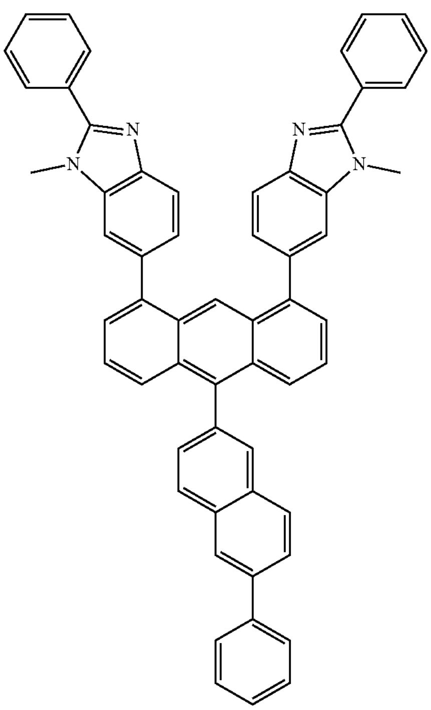

-continued
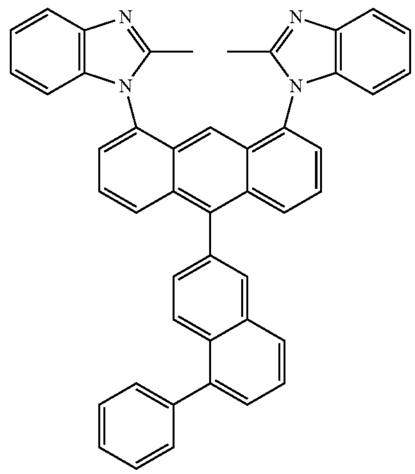
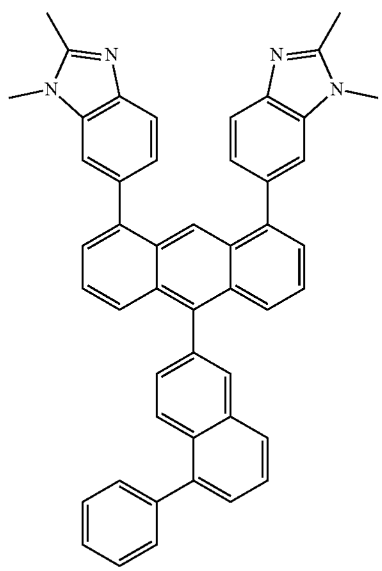
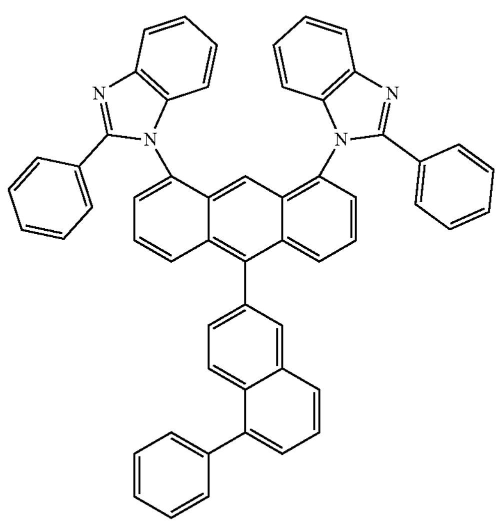
-continued
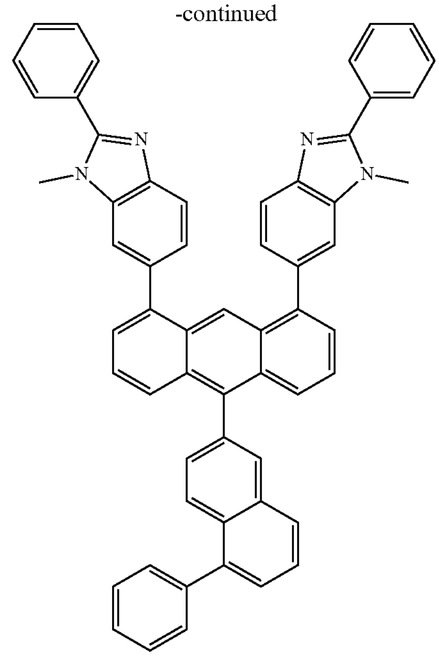
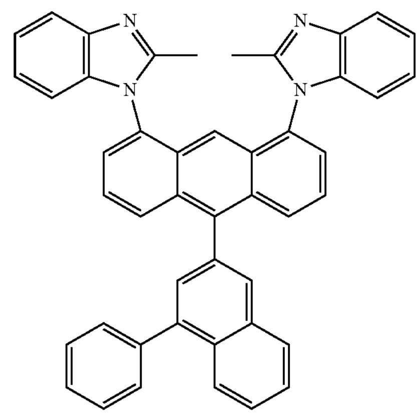
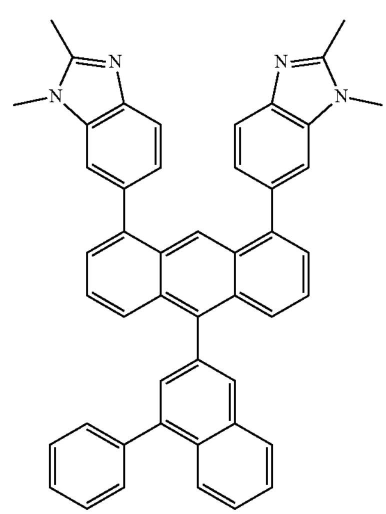

-continued
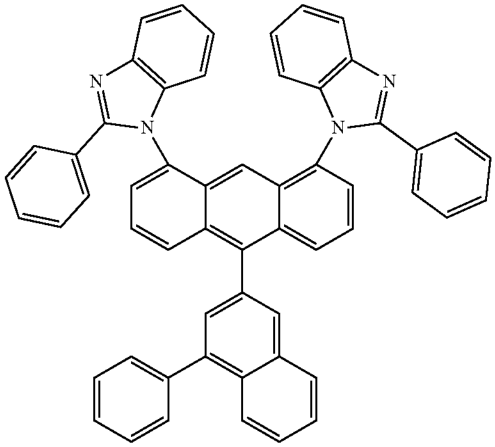
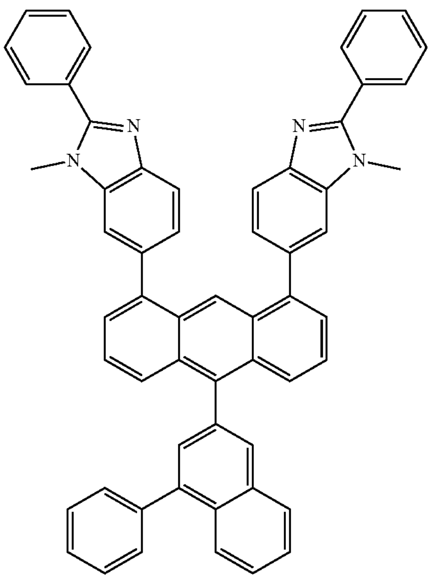
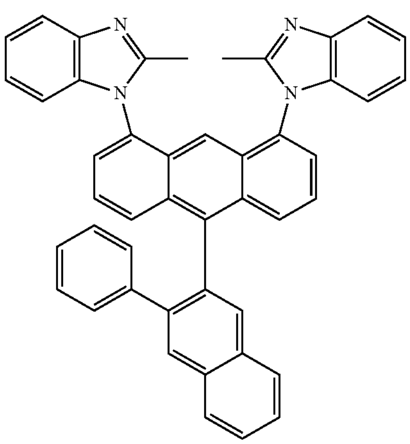
-continued
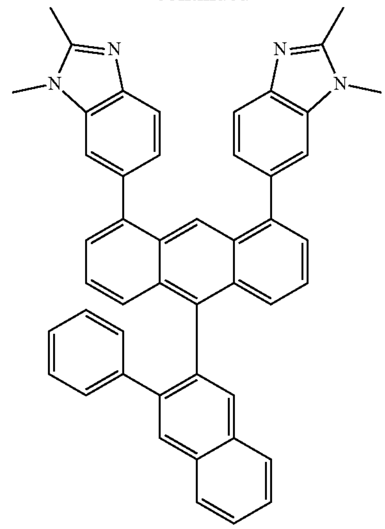
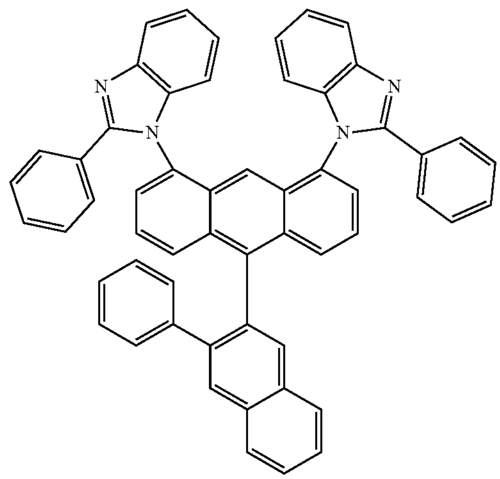
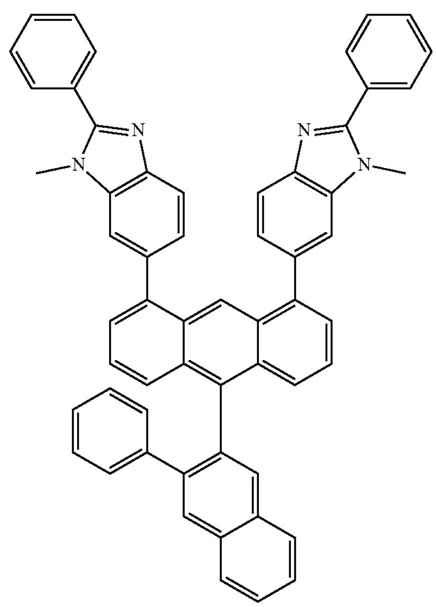

-continued
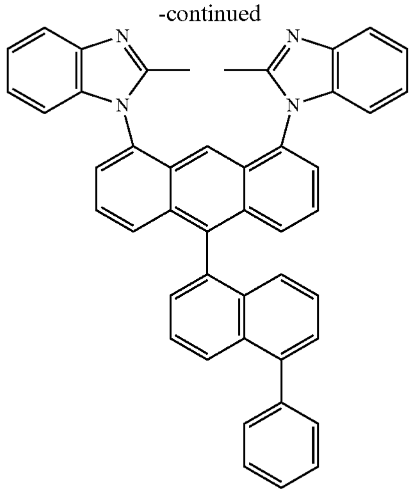
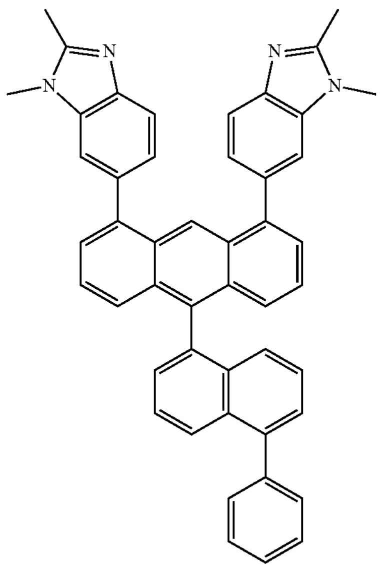
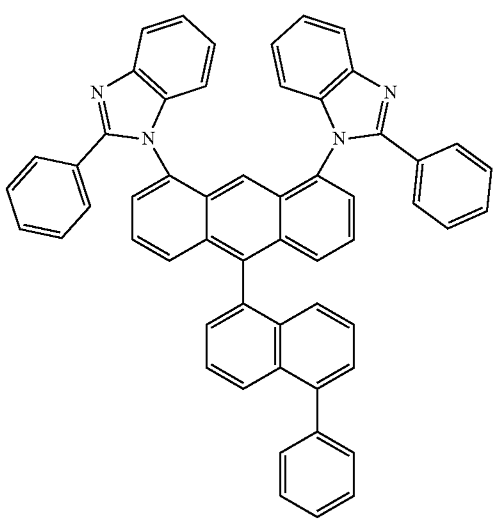
-continued
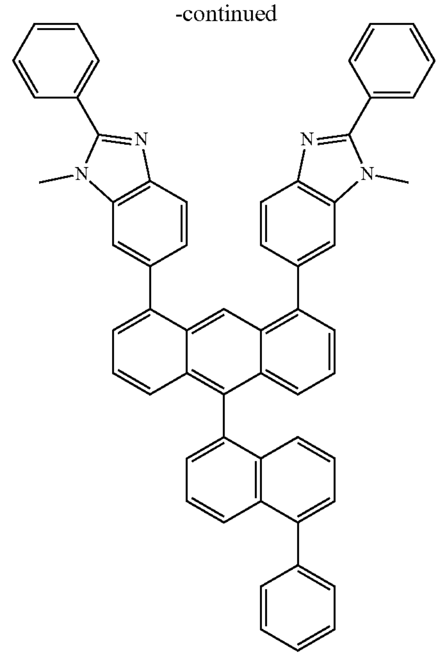
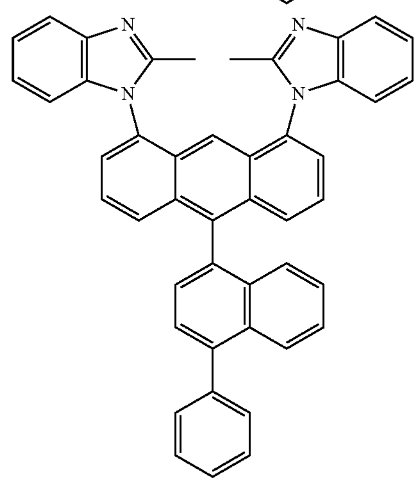
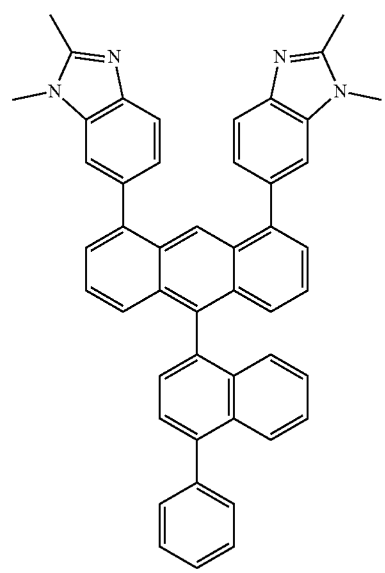

-continued
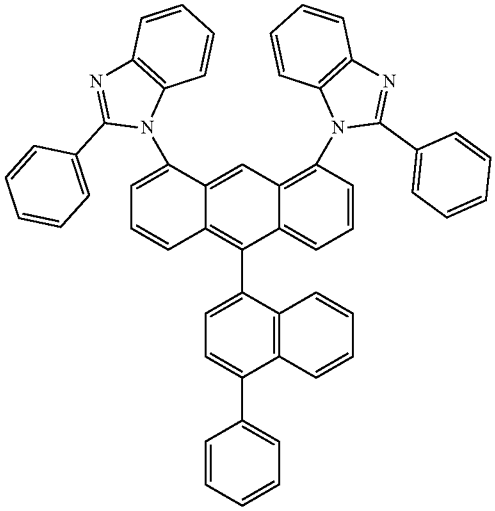
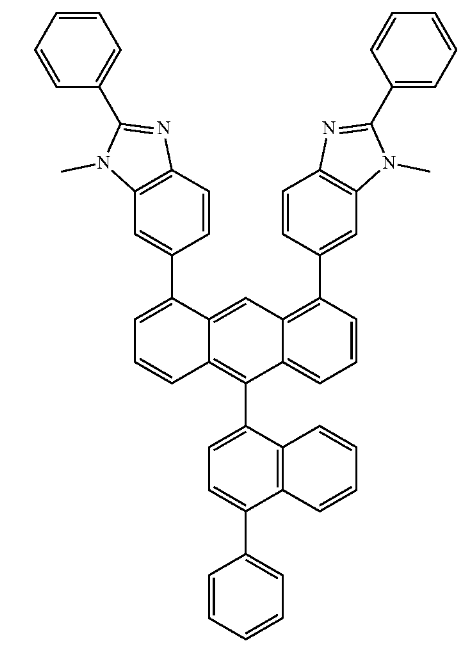
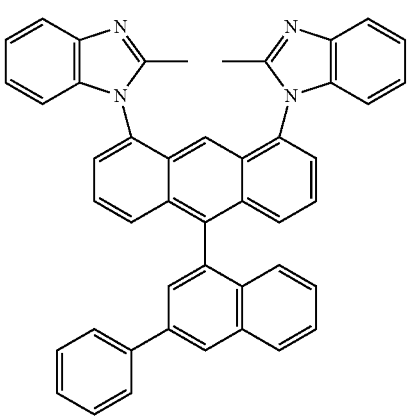
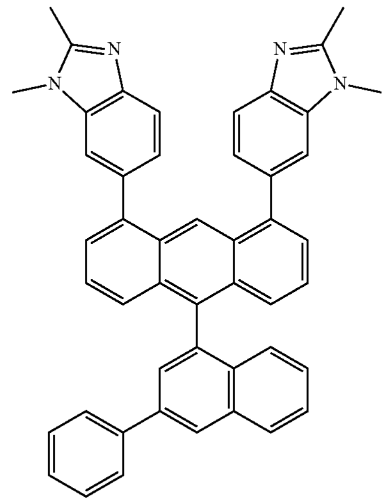
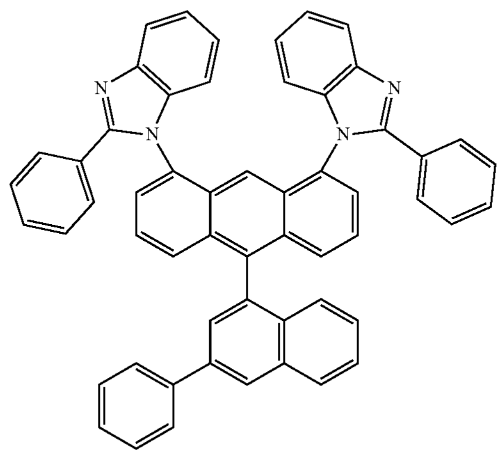
-continued
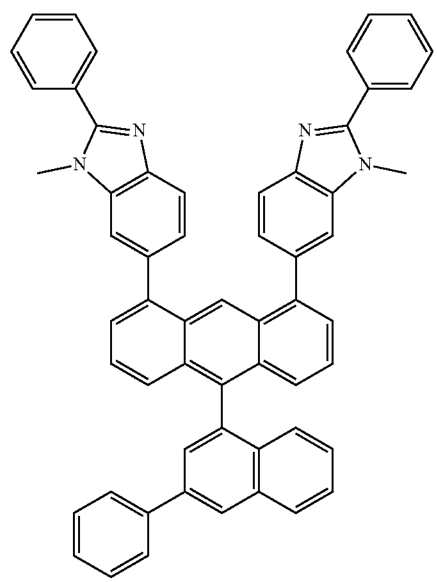

-continued
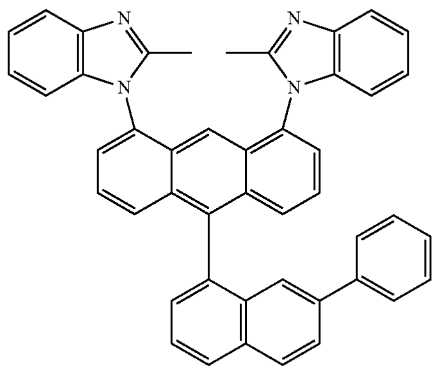
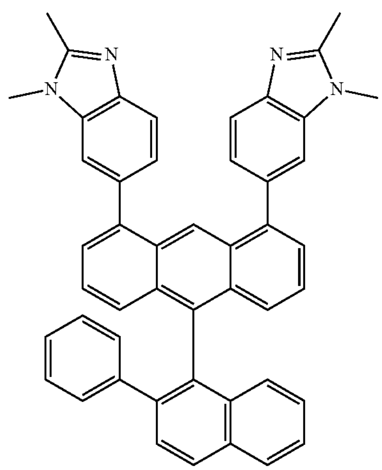
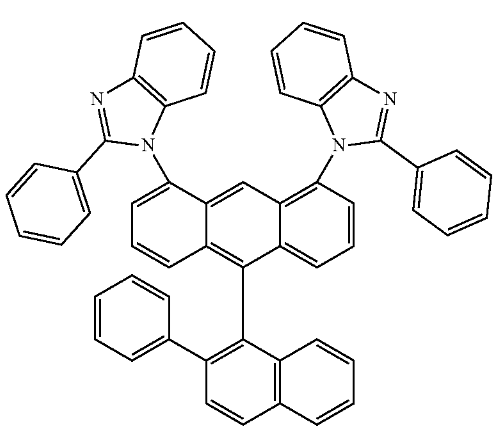
-continued
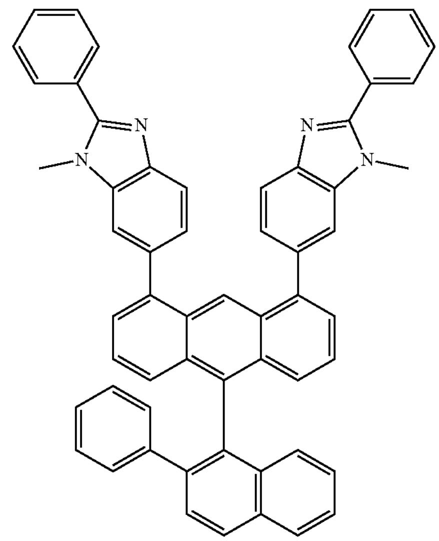
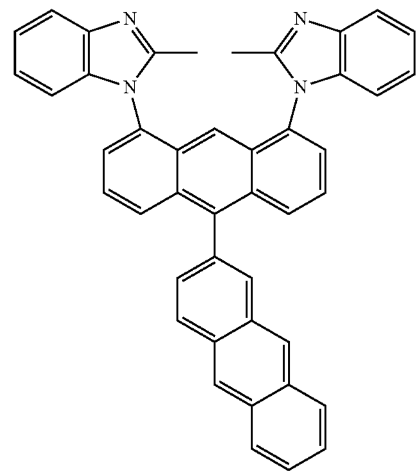
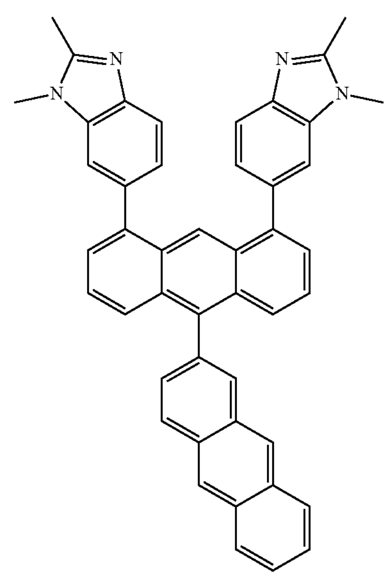

-continued
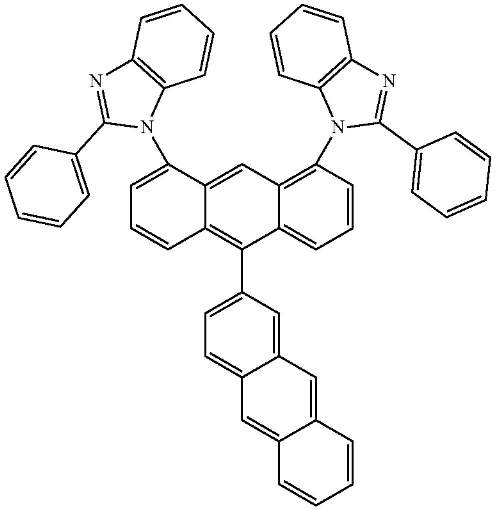
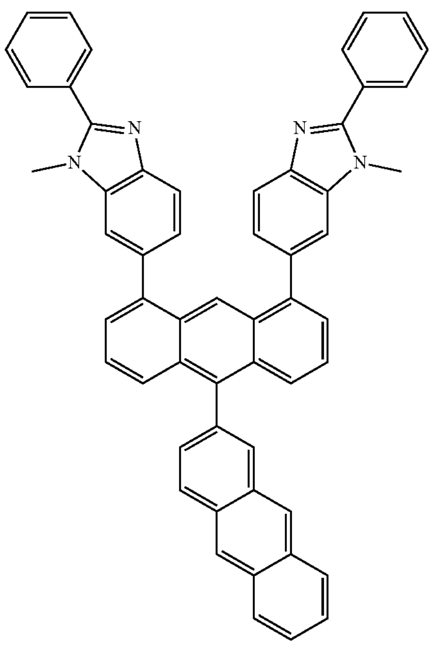
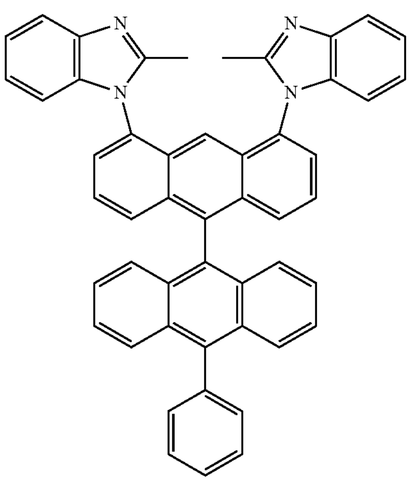
-continued
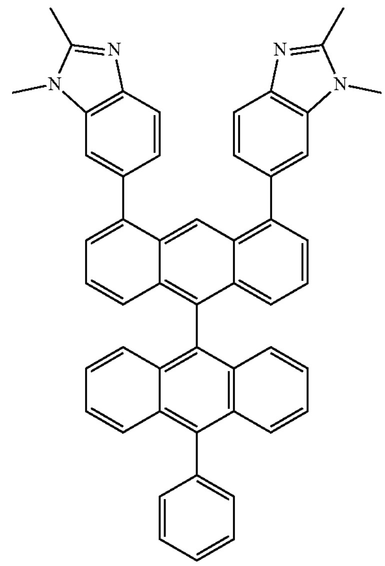
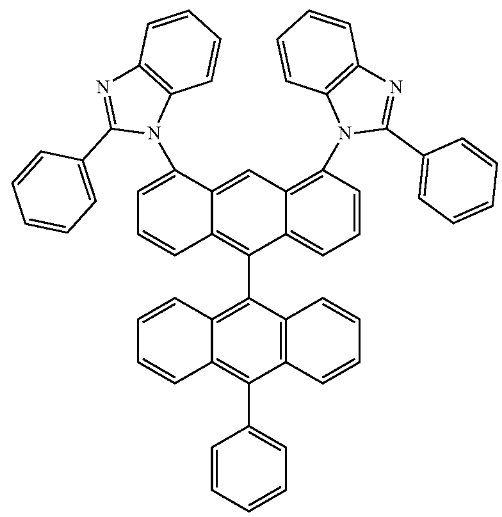
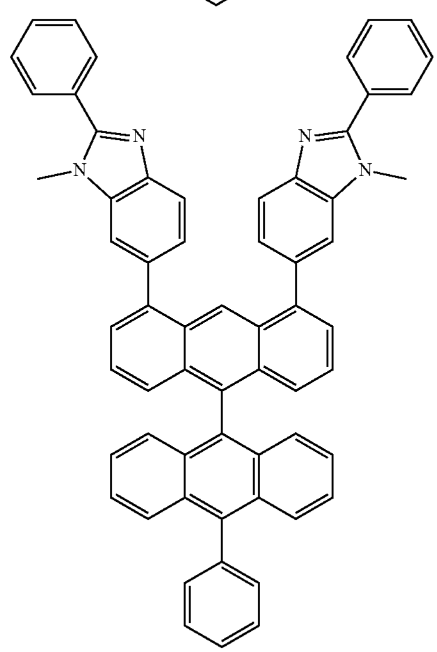

-continued
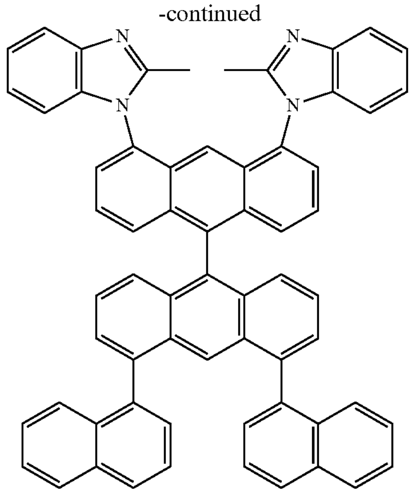
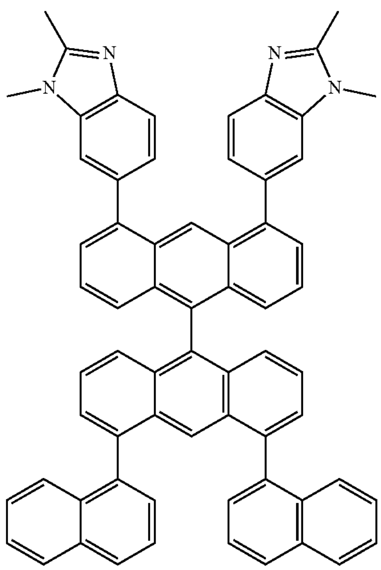
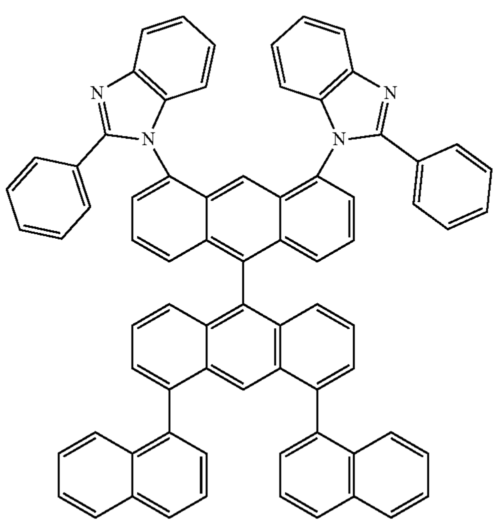
-continued
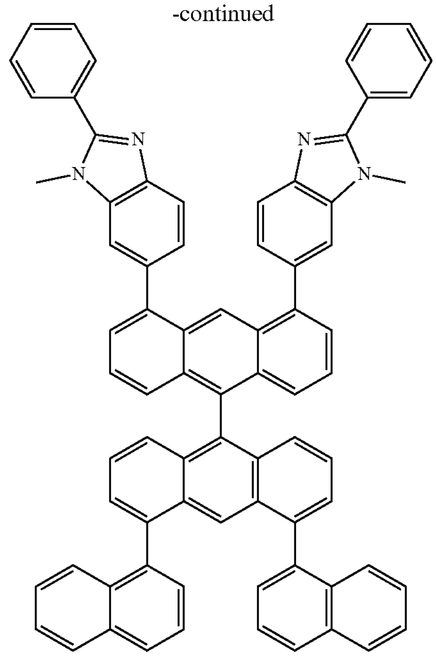
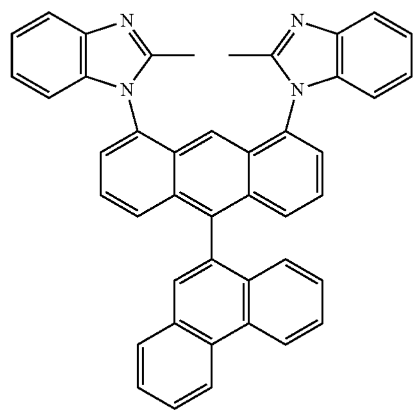
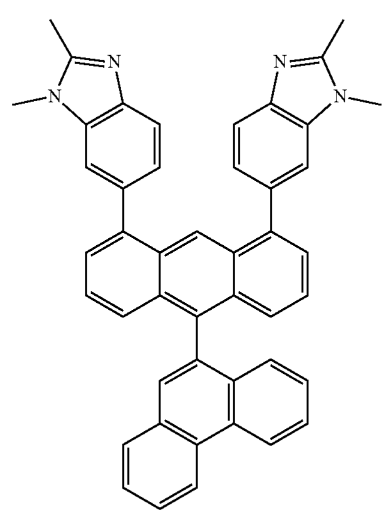

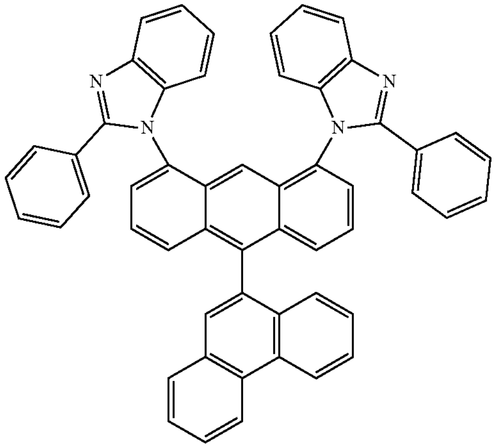
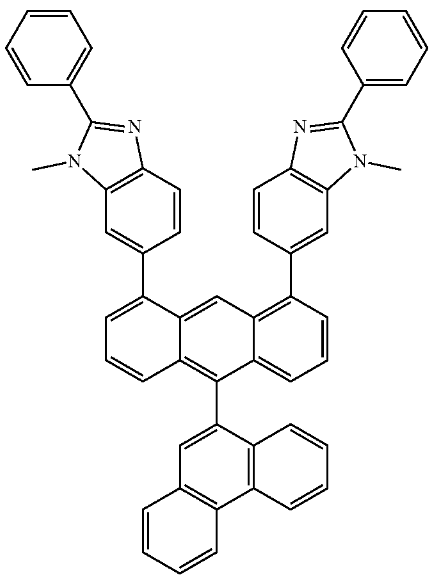
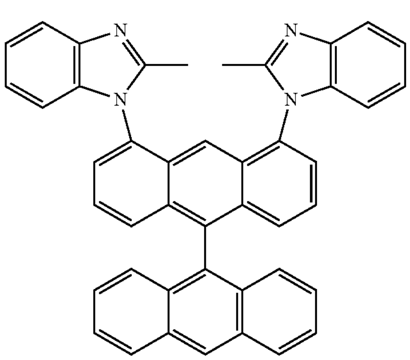
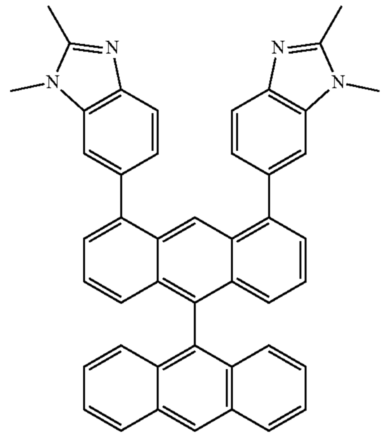
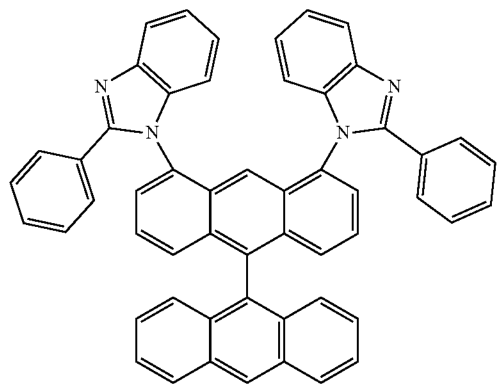
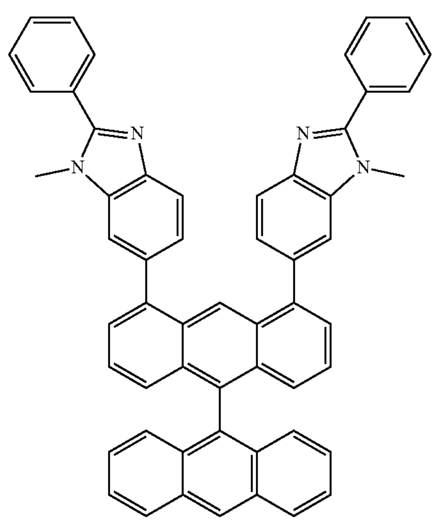

-continued
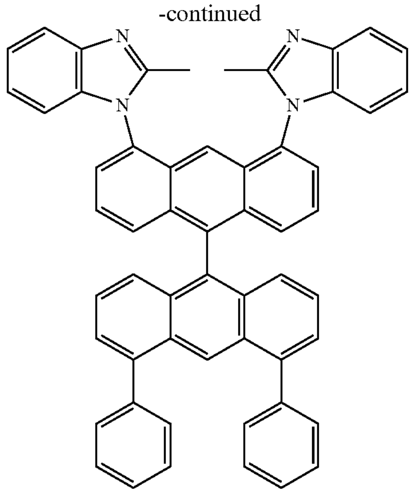
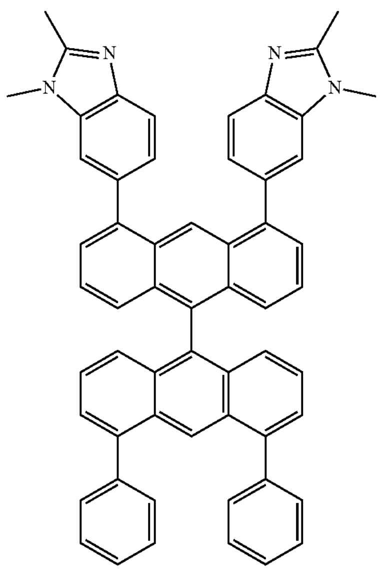
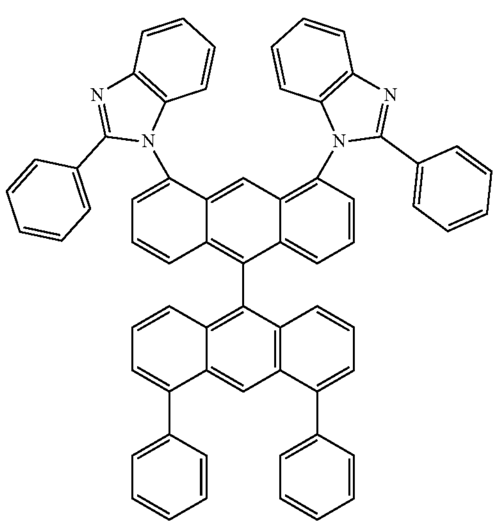
-continued
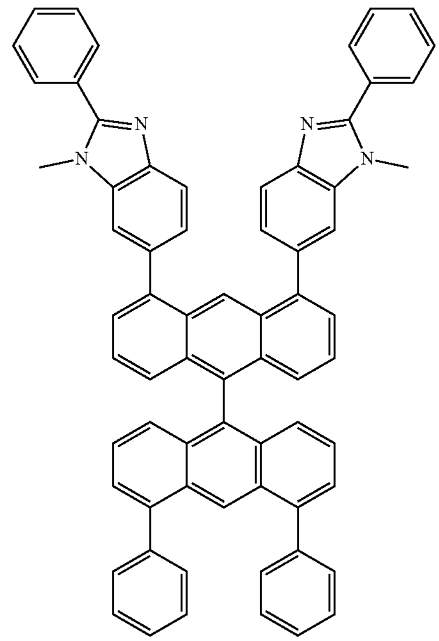
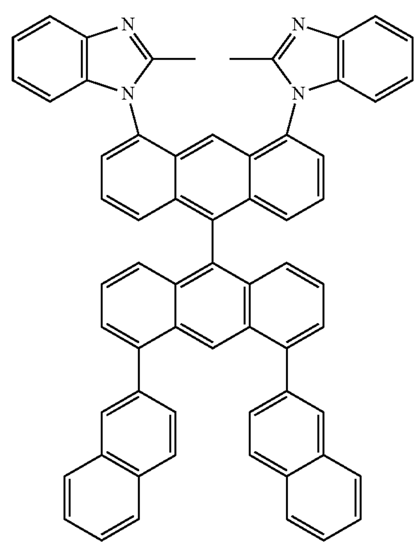

-continued
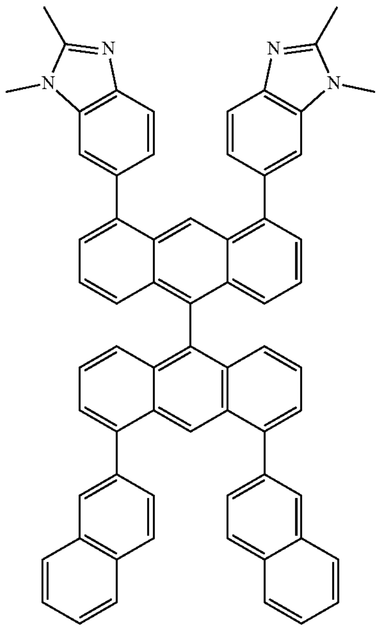
-continued
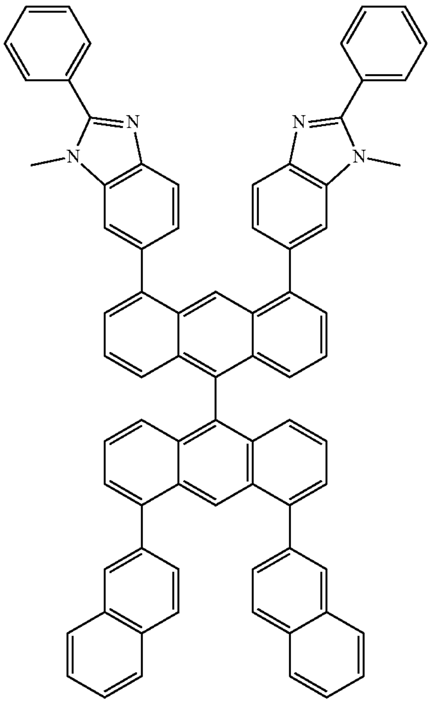
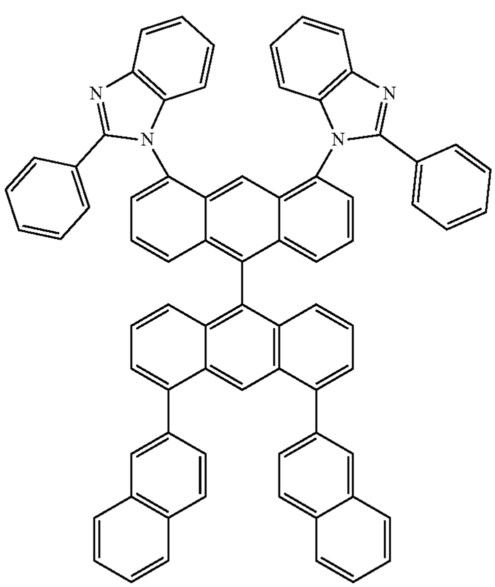
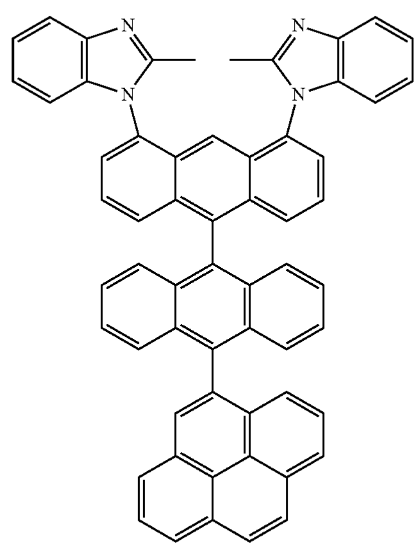

-continued
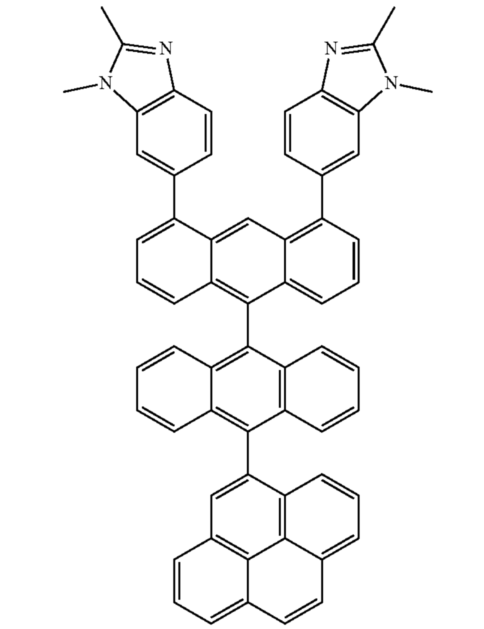
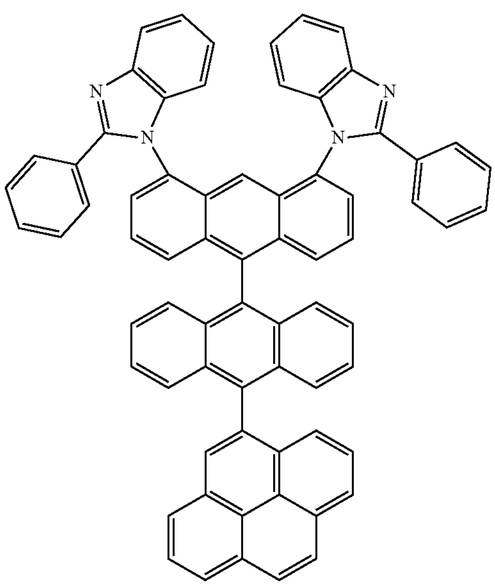
-continued
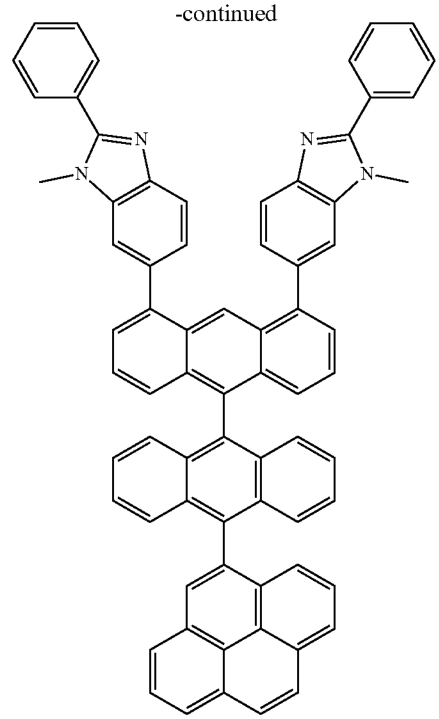
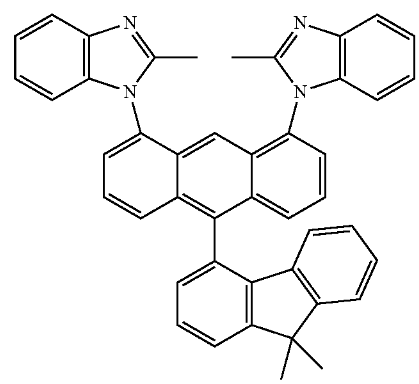
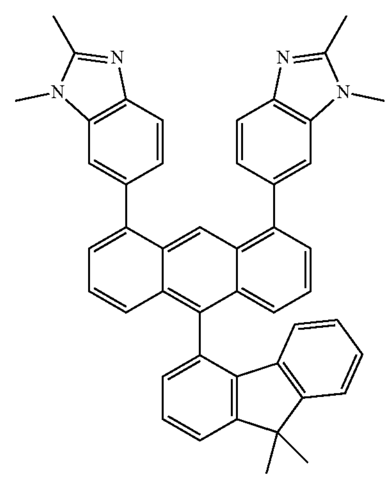

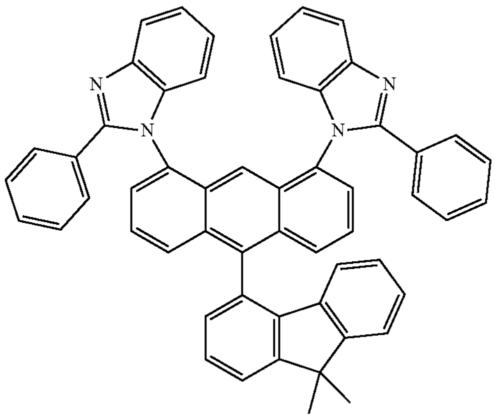
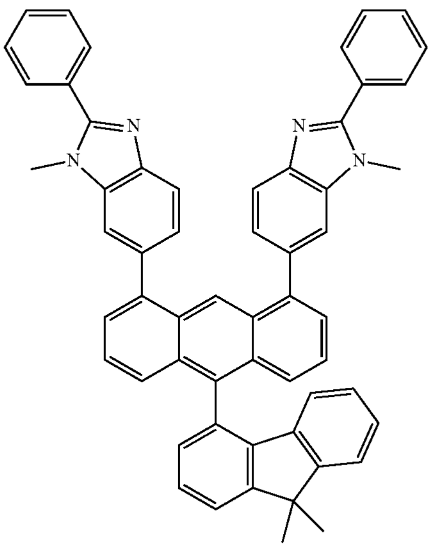
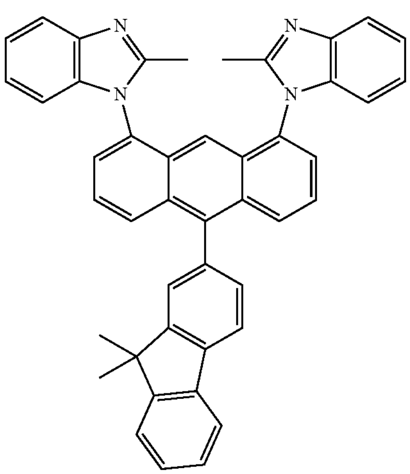
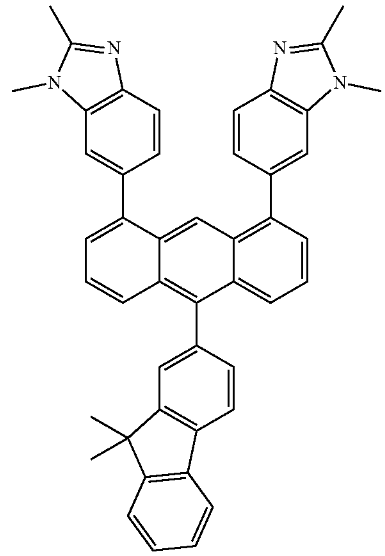
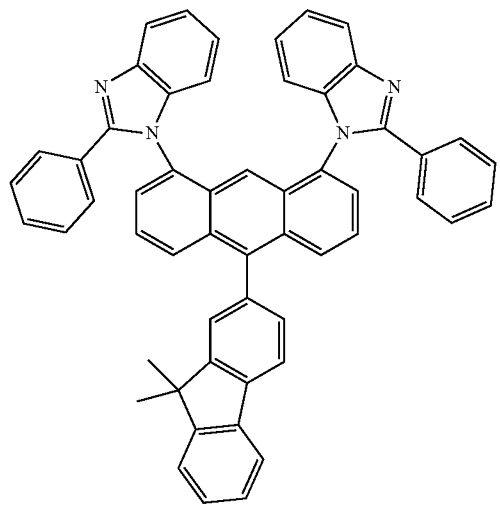
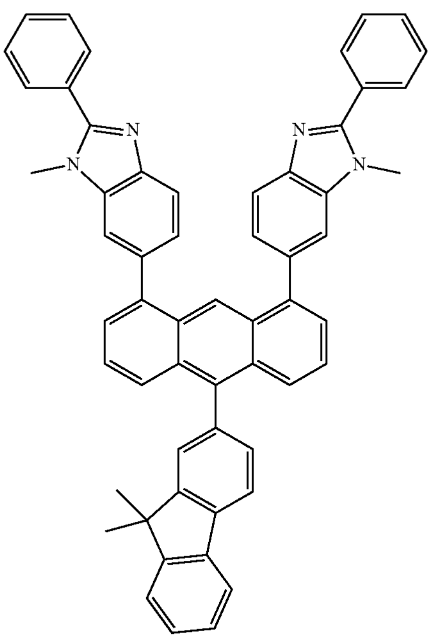

-continued
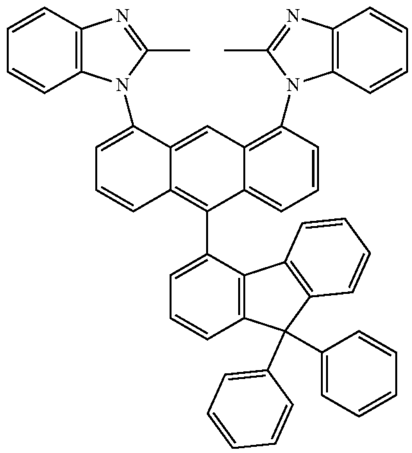
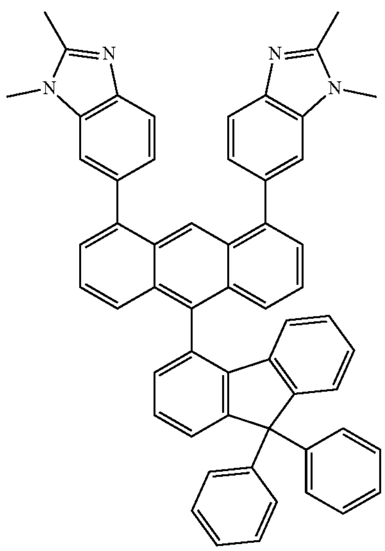
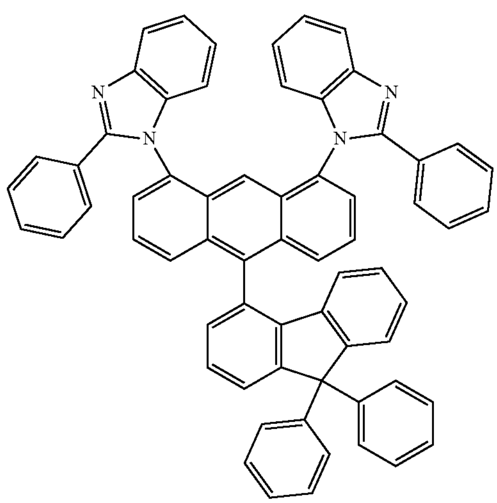
-continued
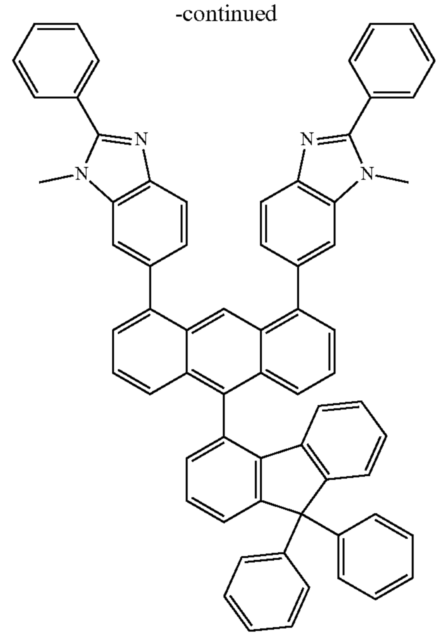
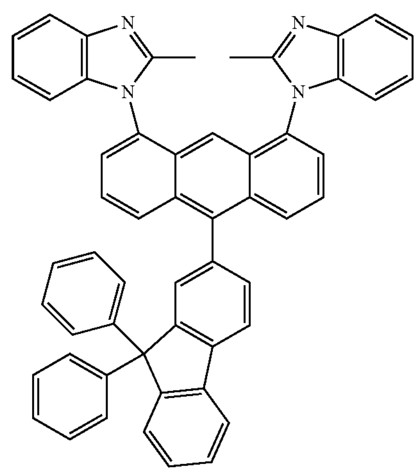
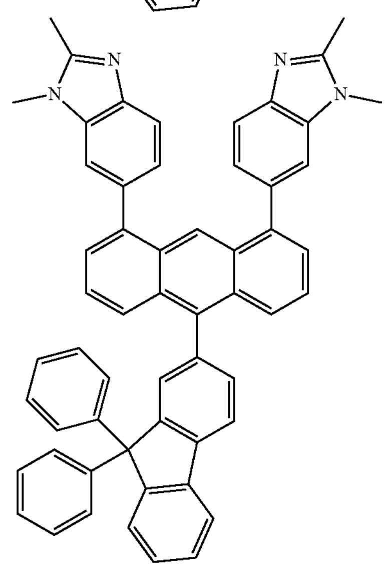

-continued
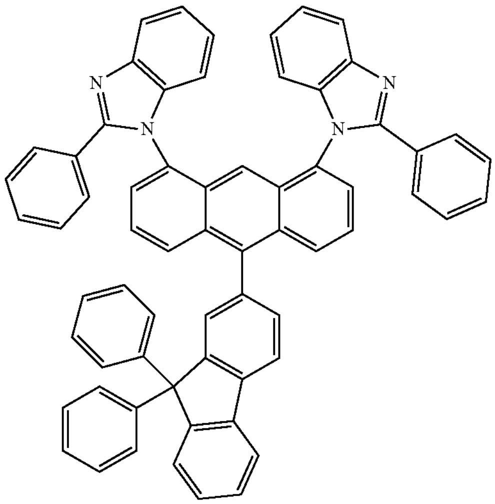
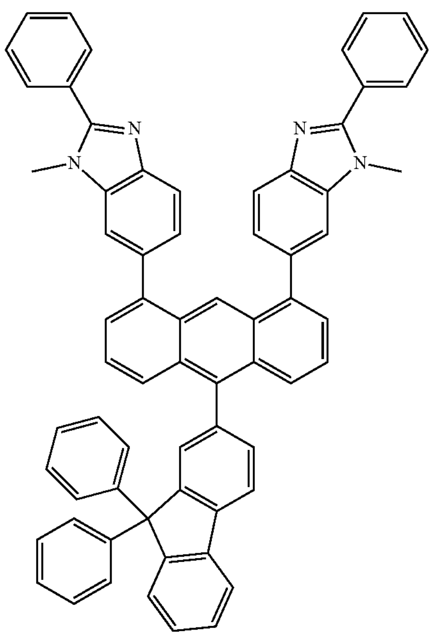
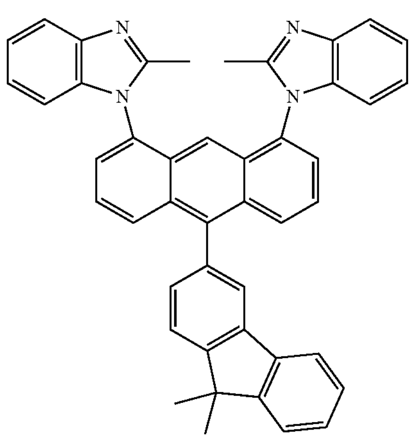
-continued
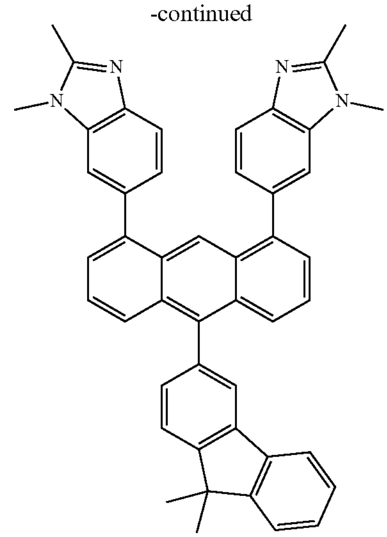
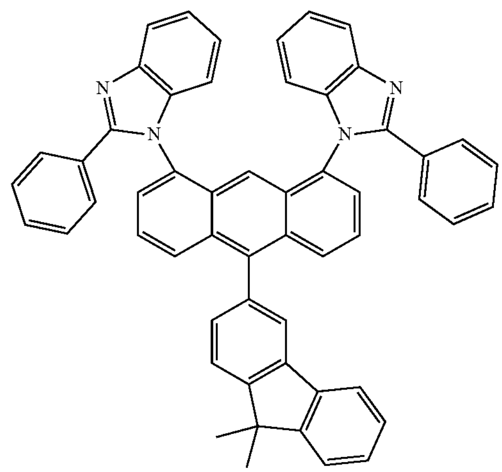
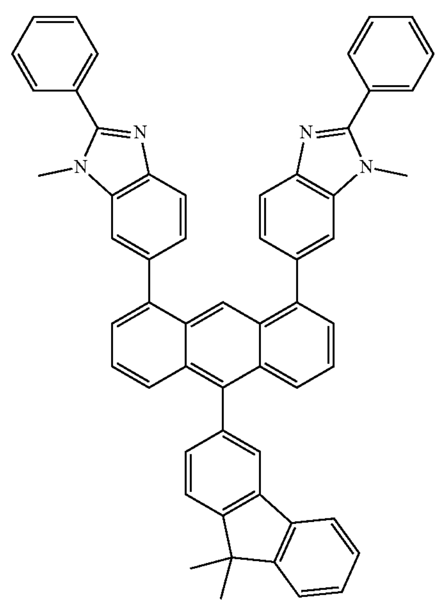

-continued
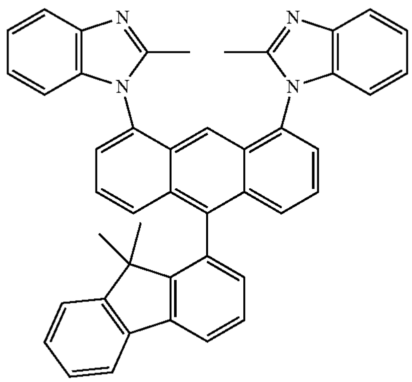
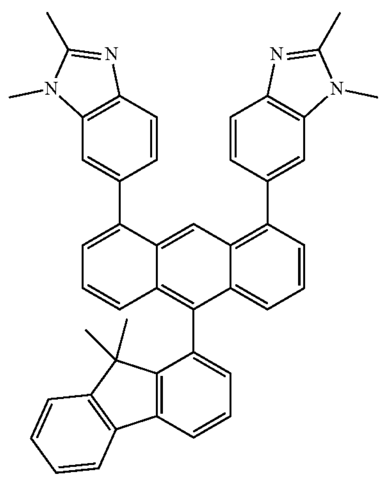
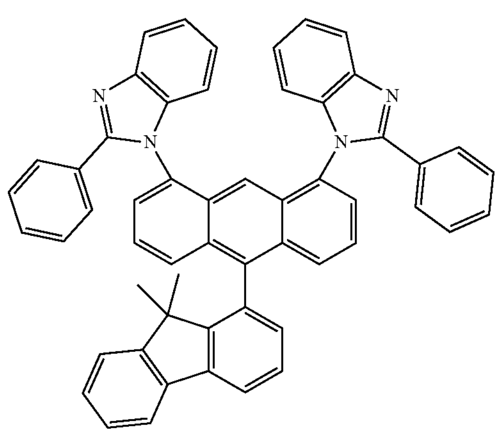
-continued
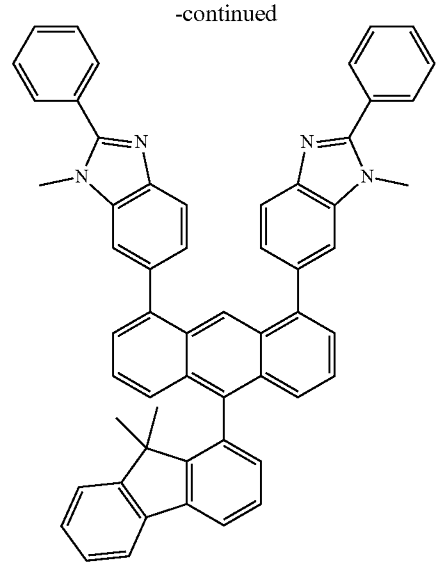
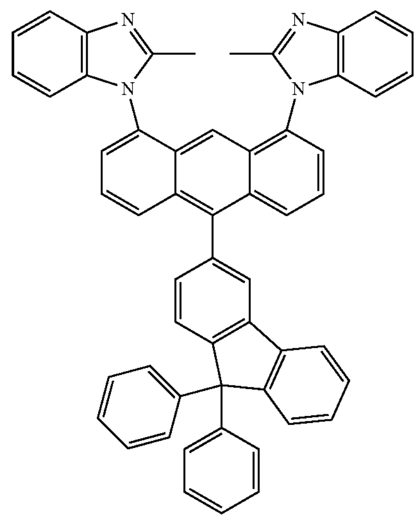
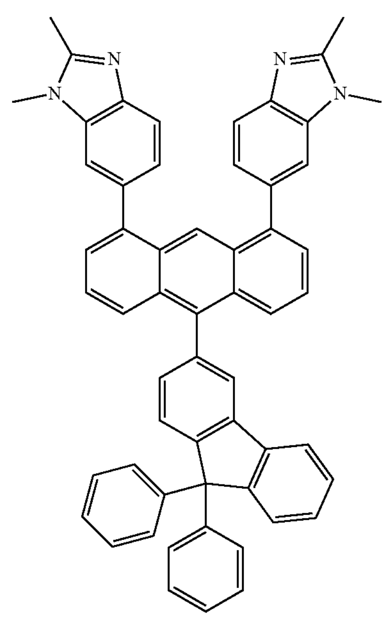

-continued
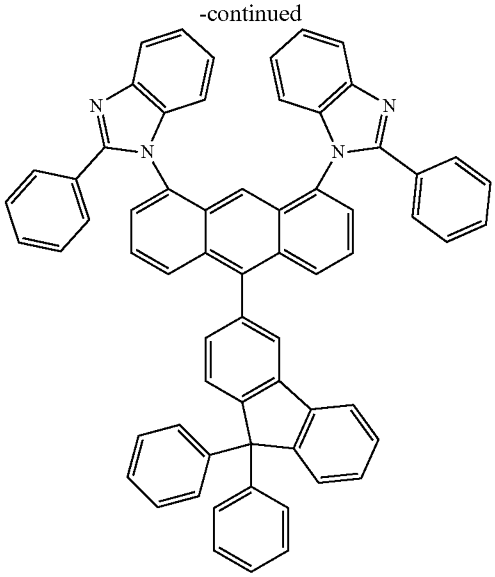
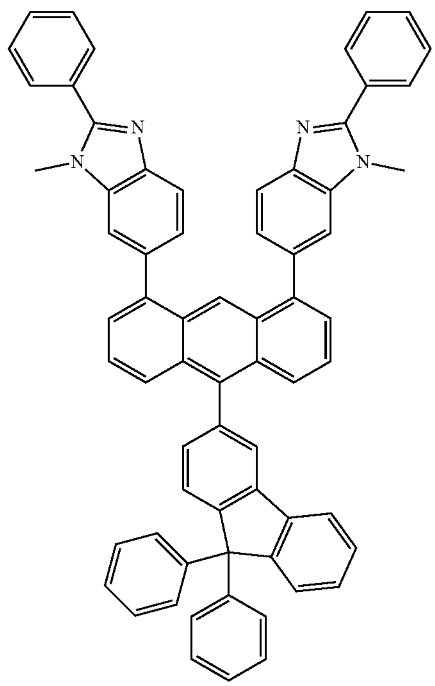
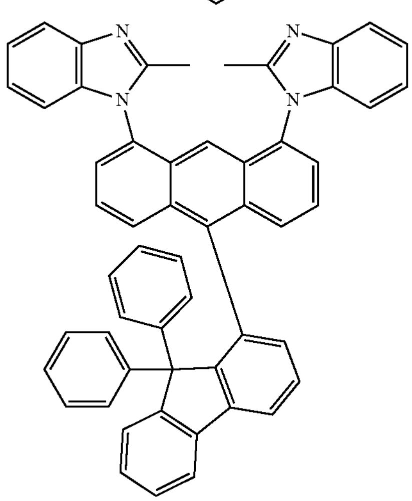
-continued
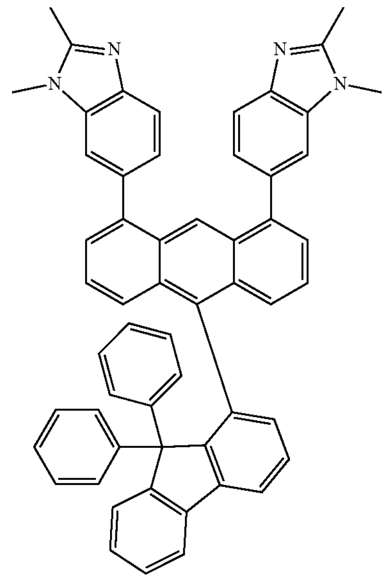
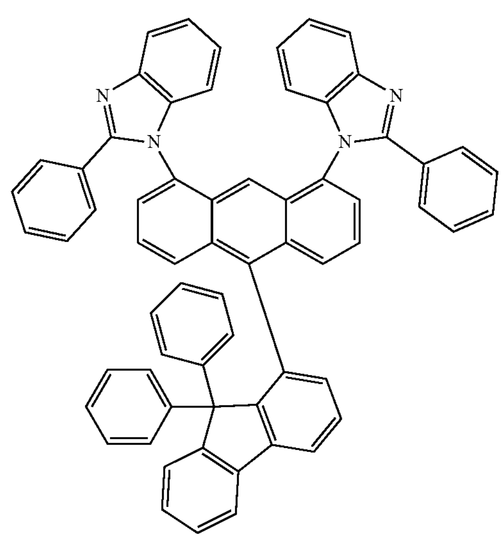

-continued
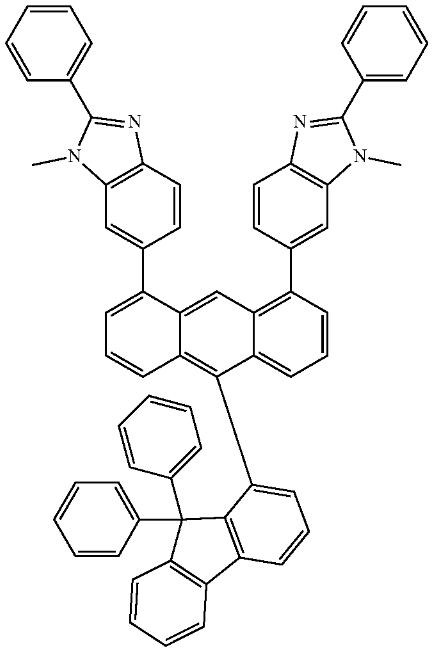
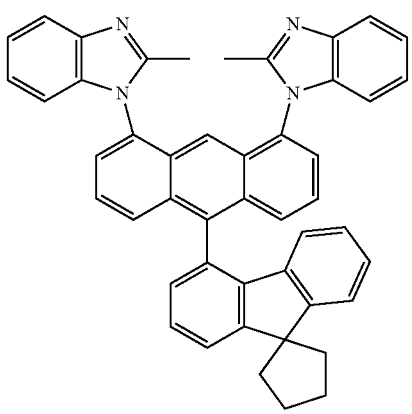
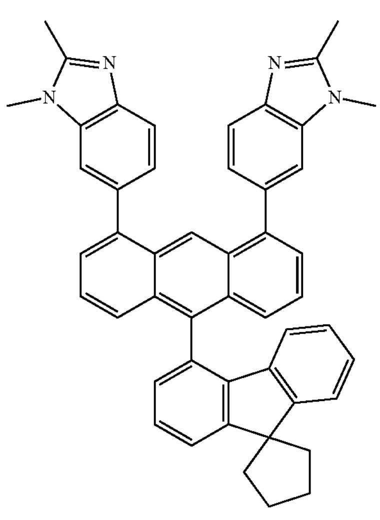
-continued
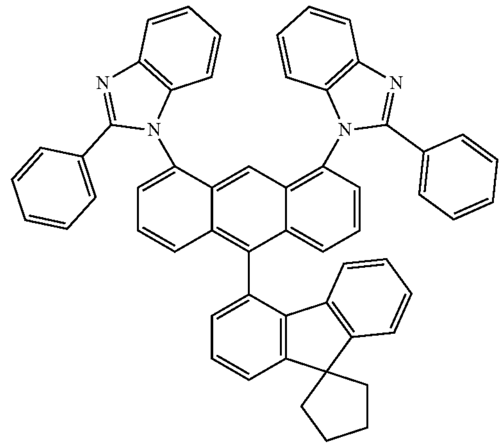
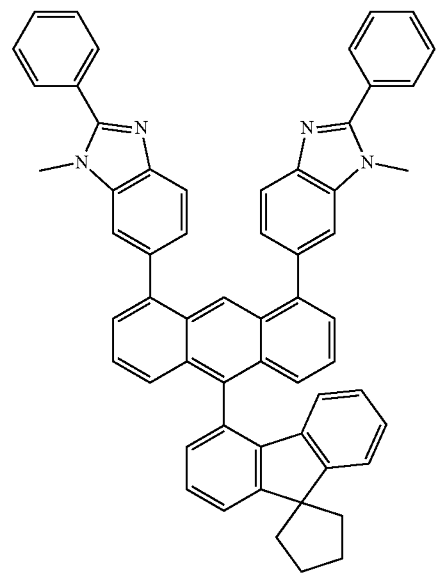
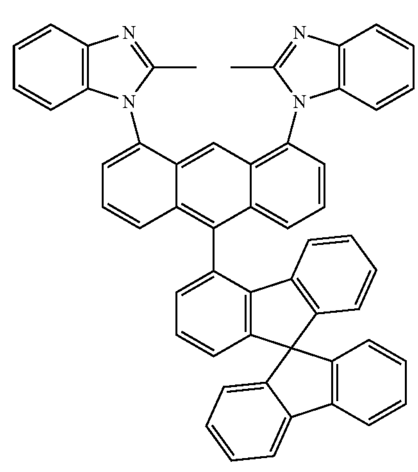

-continued
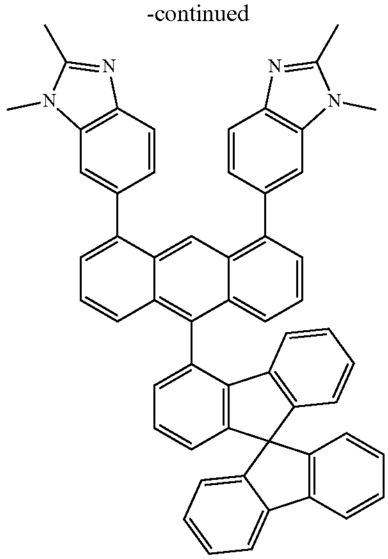
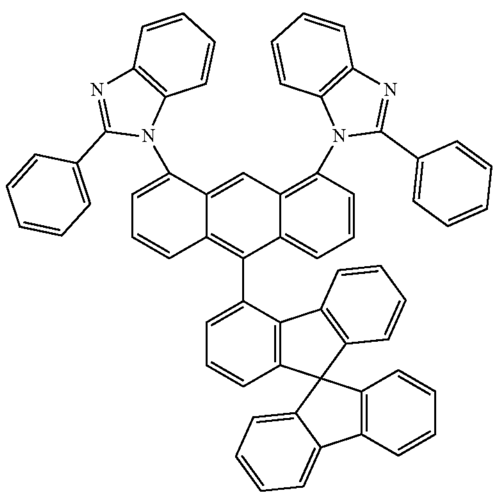
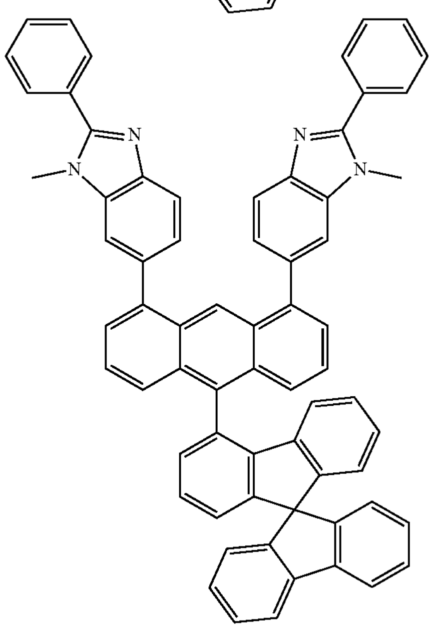
-continued
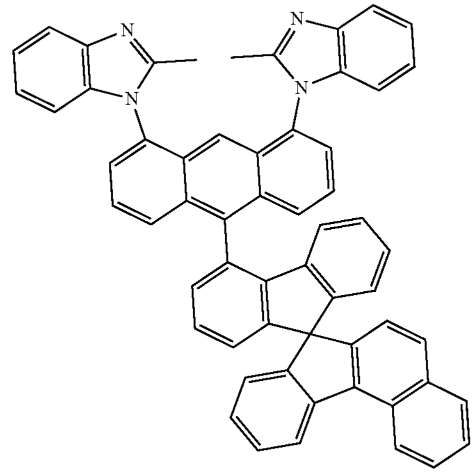
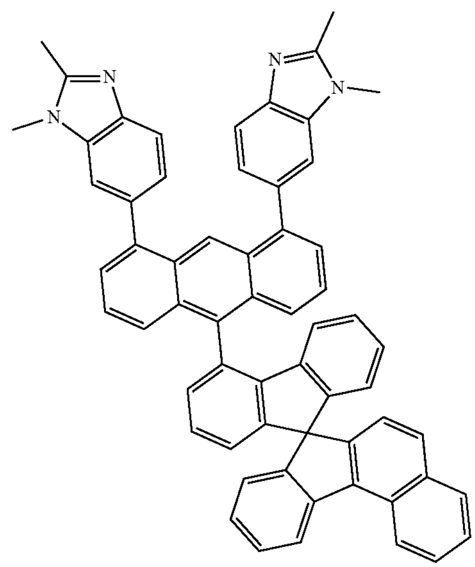
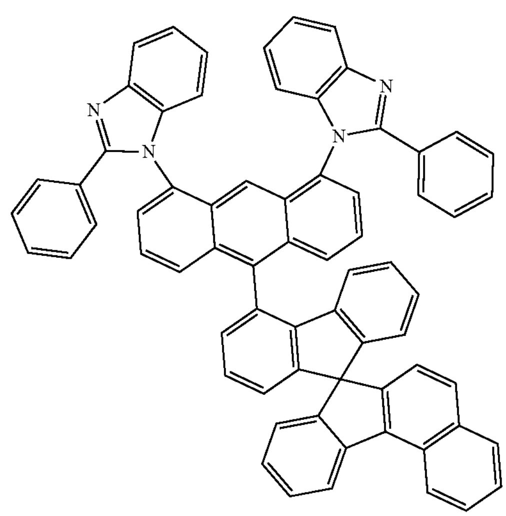

-continued
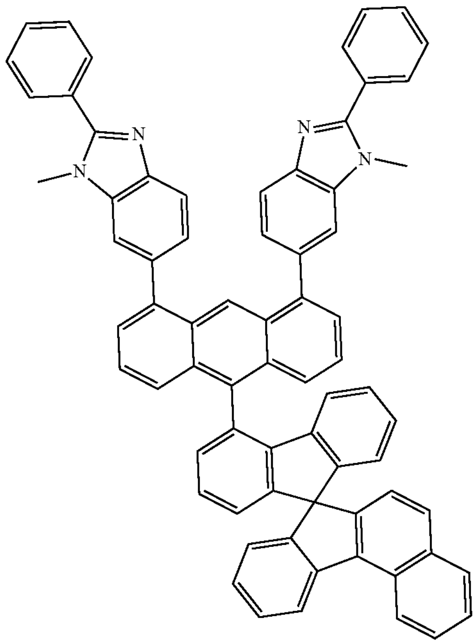
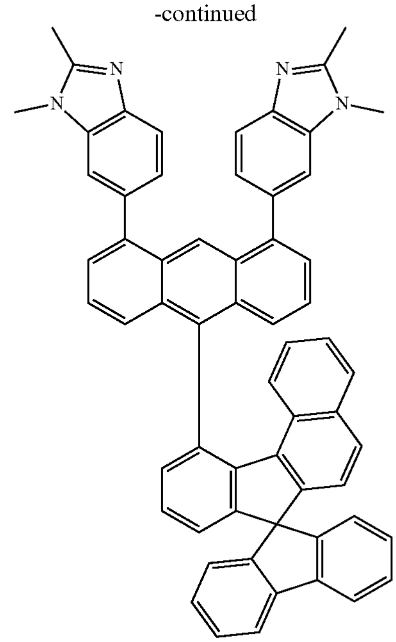
-continued
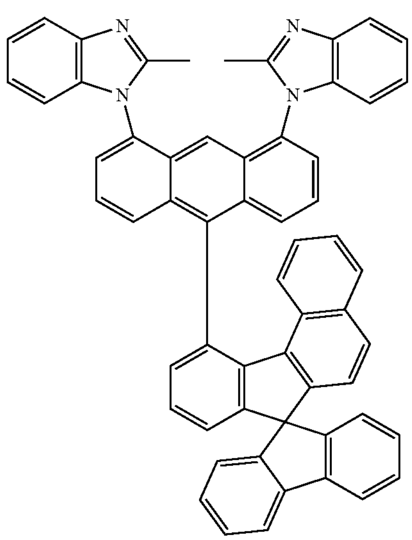
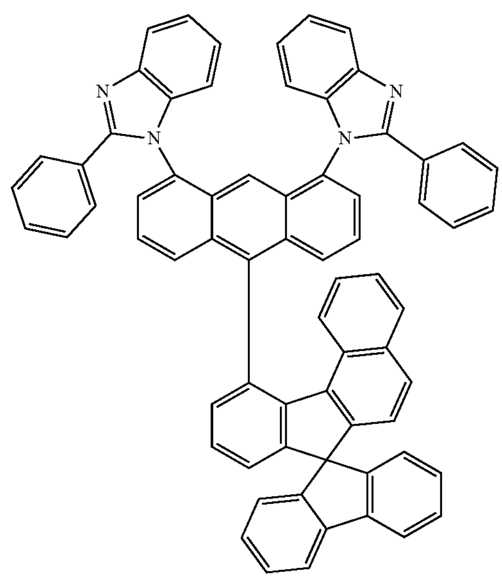

-continued
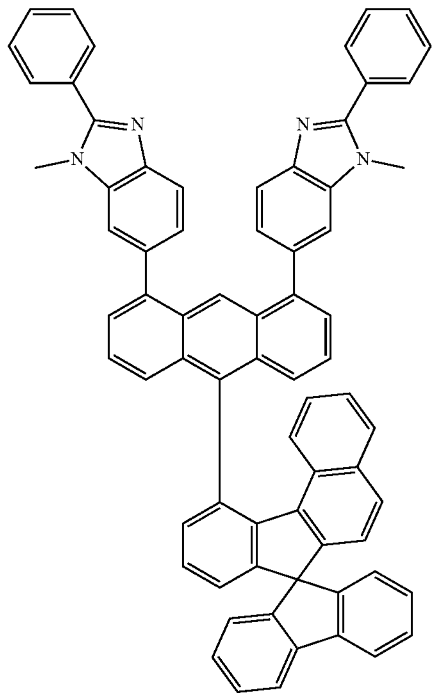
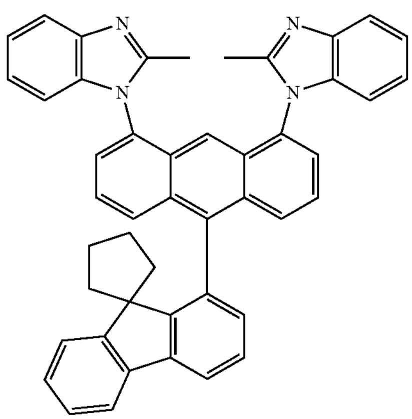
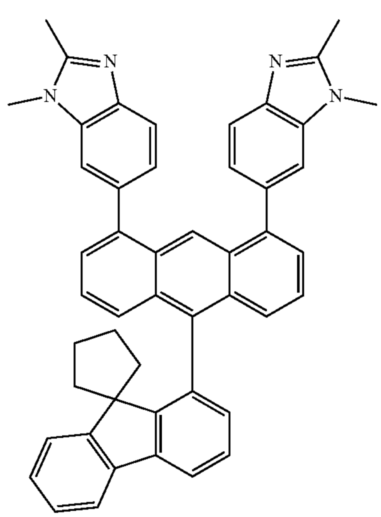
-continued
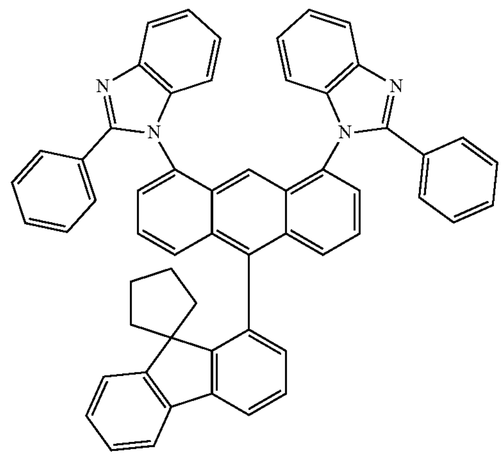
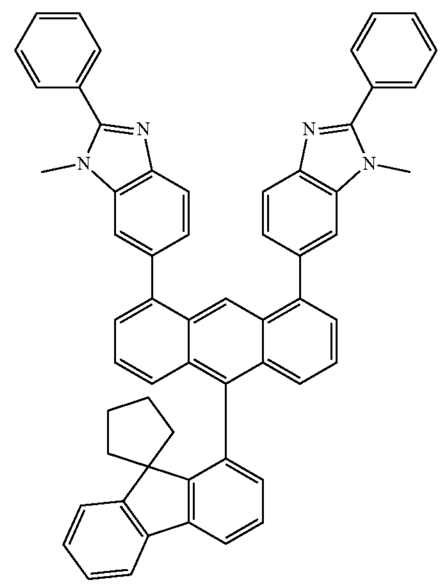
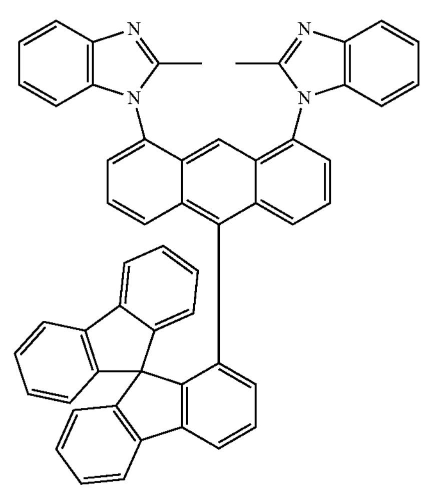

-continued
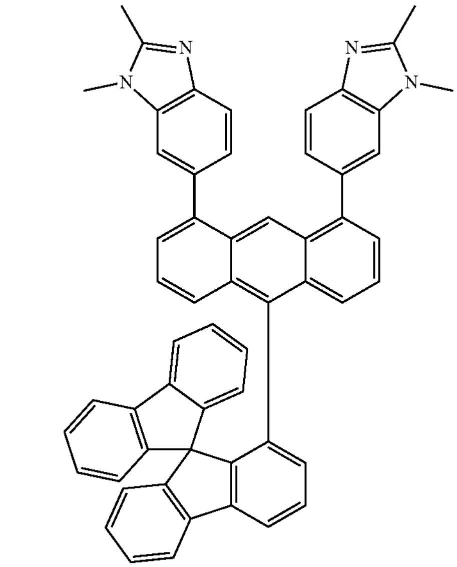
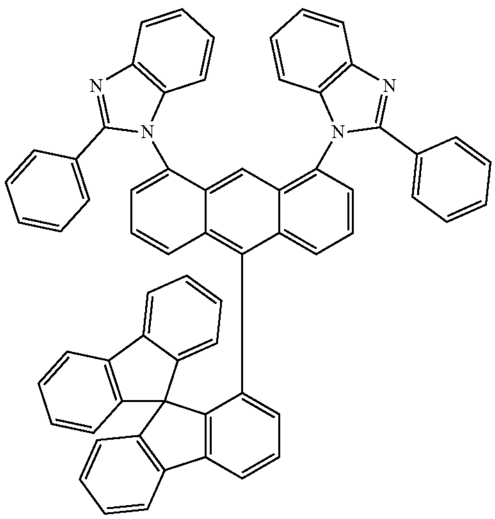
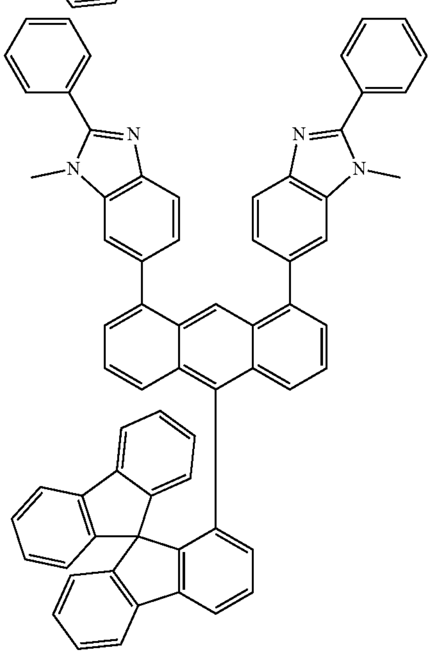
-continued
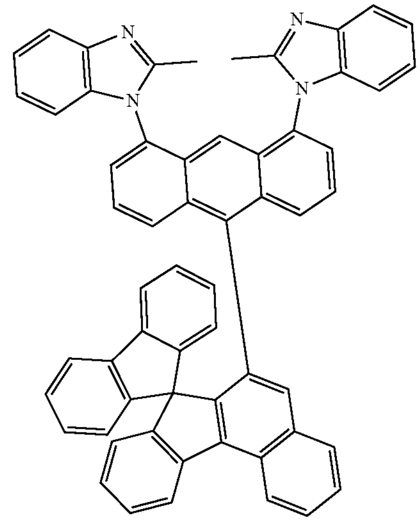
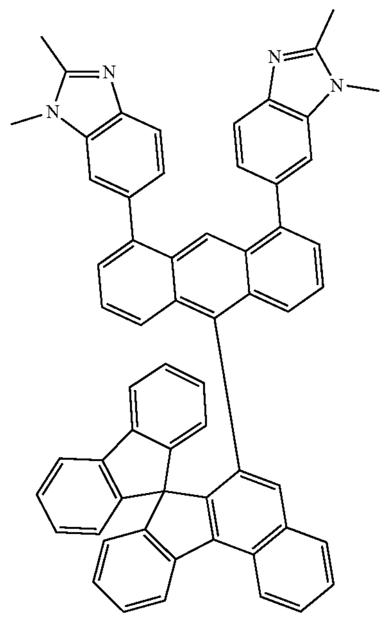
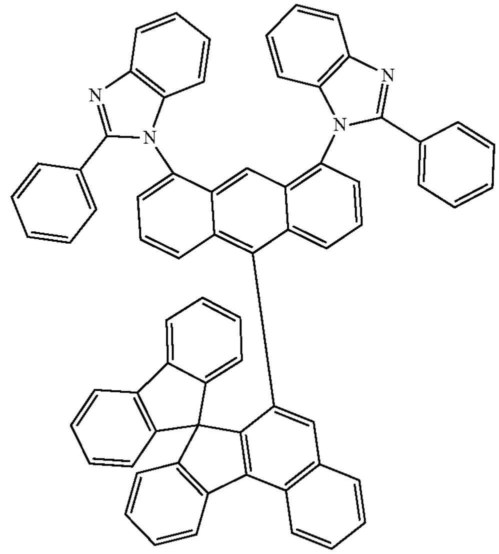

-continued
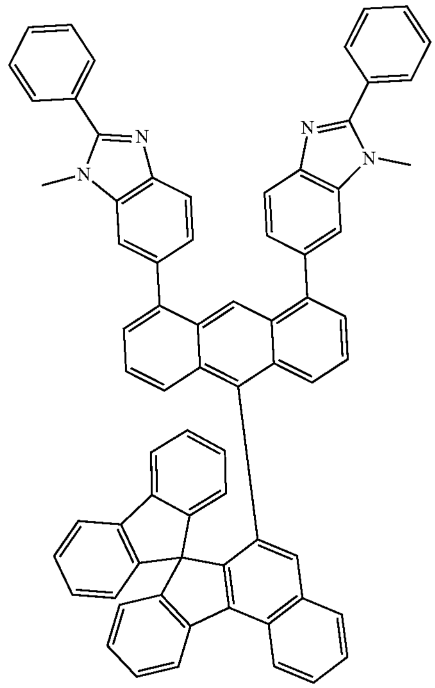
-continued
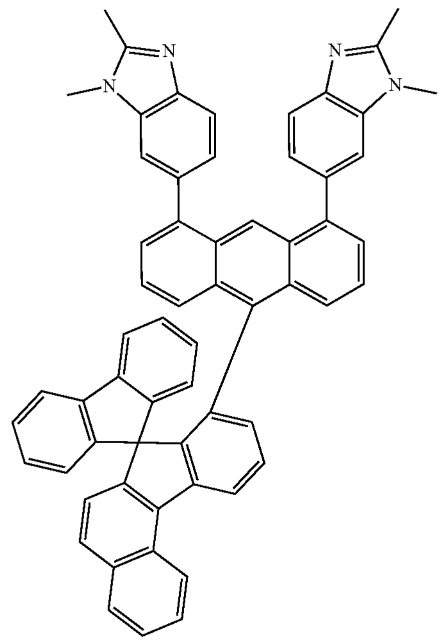
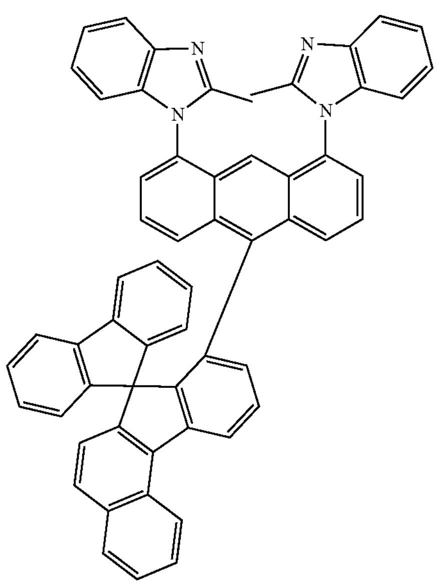
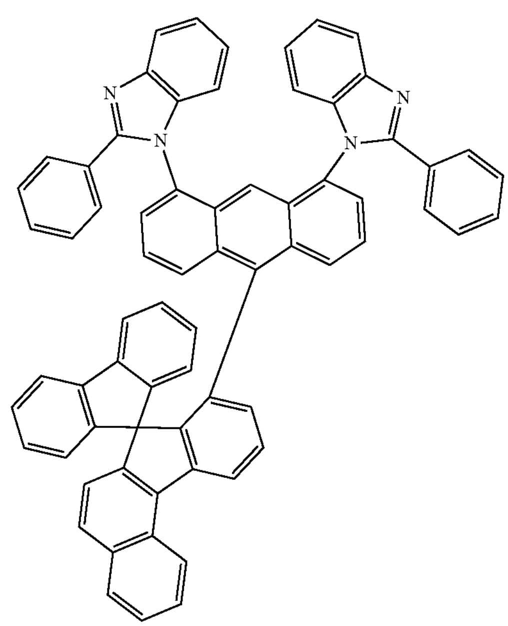

-continued
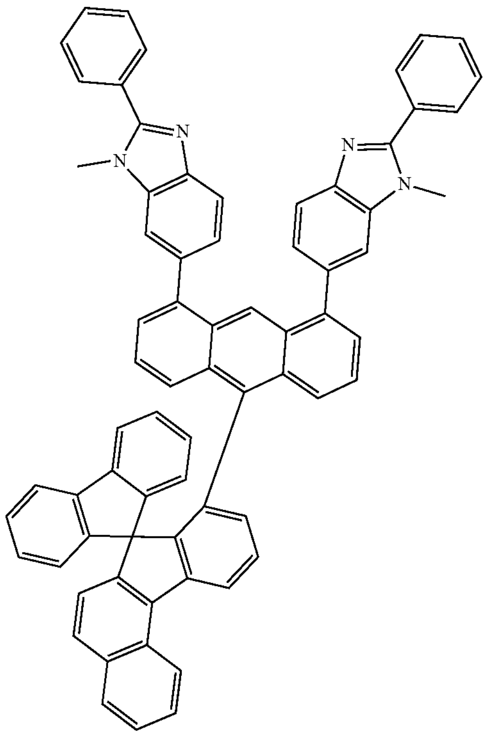
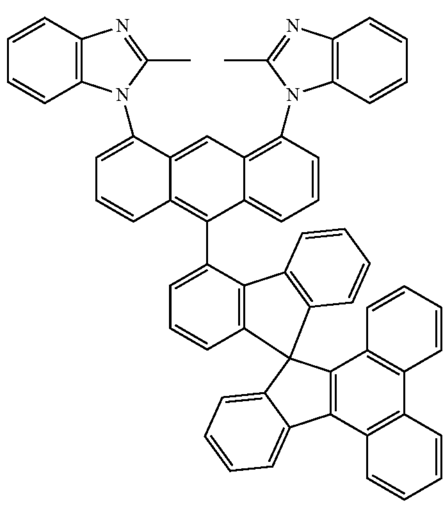
-continued
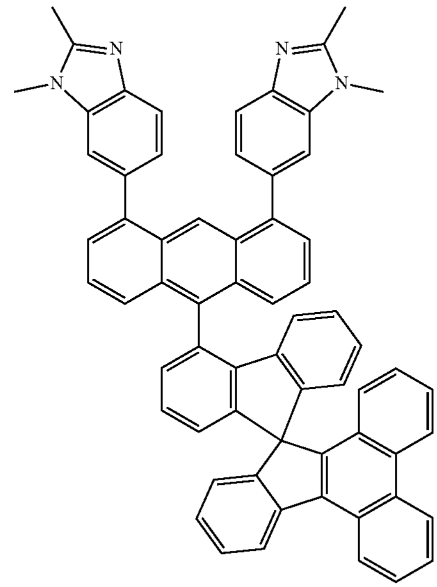
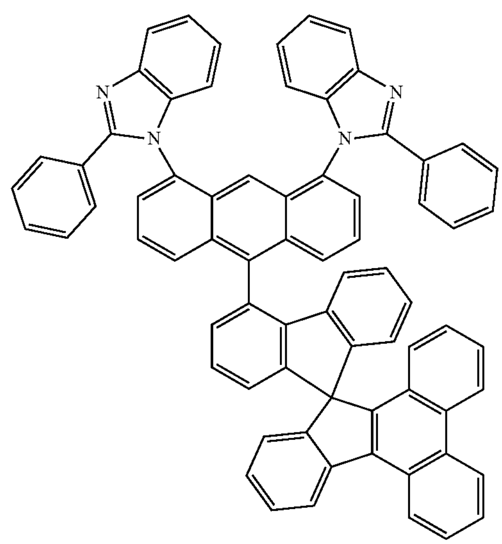

-continued
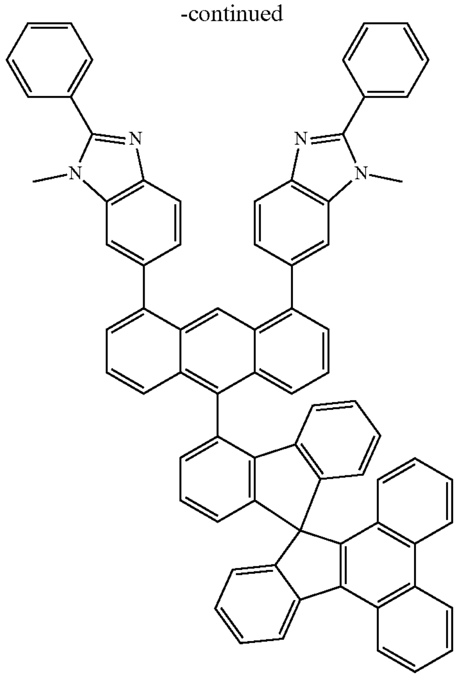
-continued
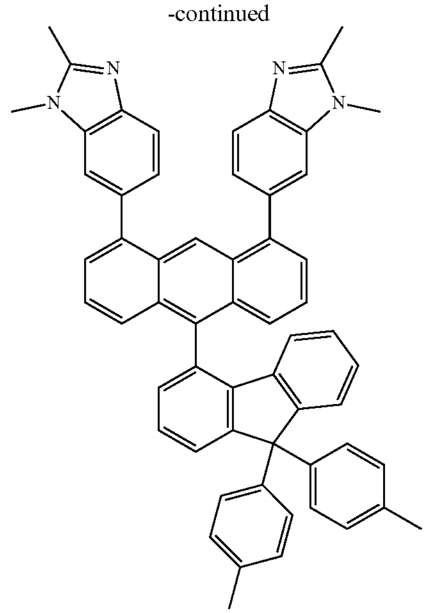
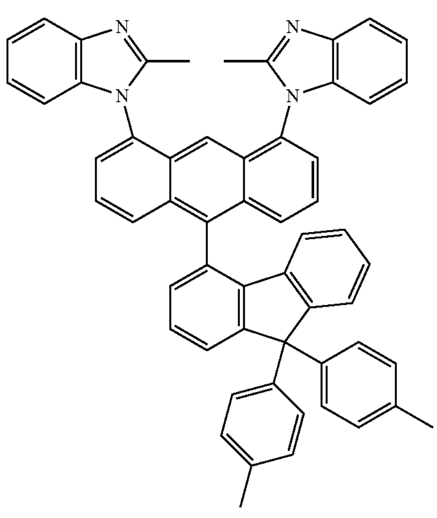
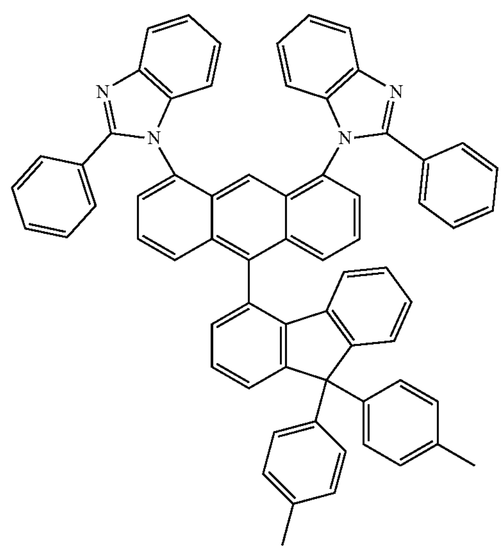

-continued
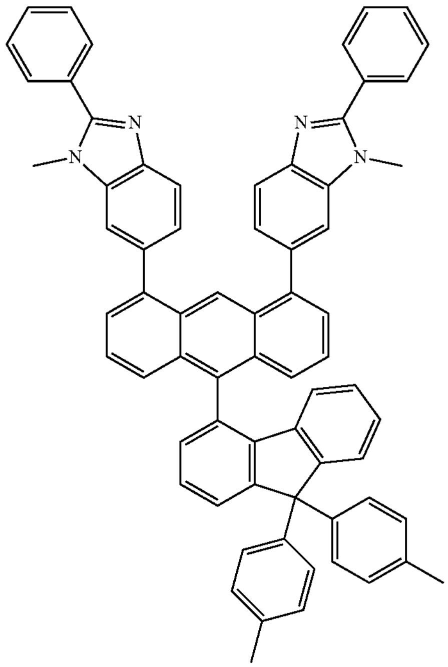
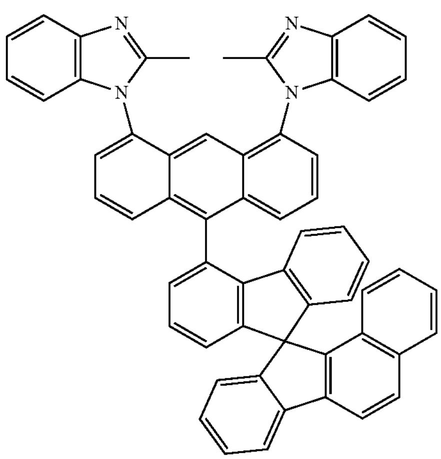
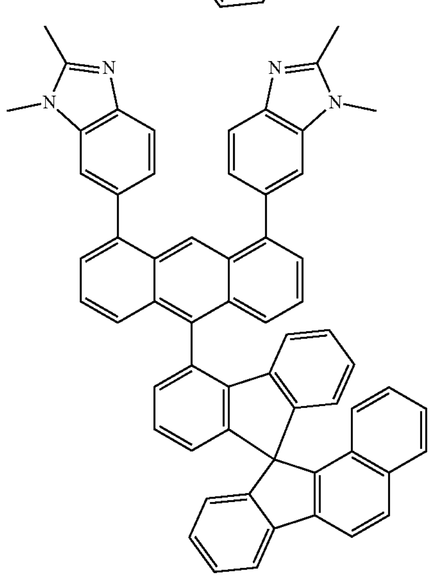
-continued
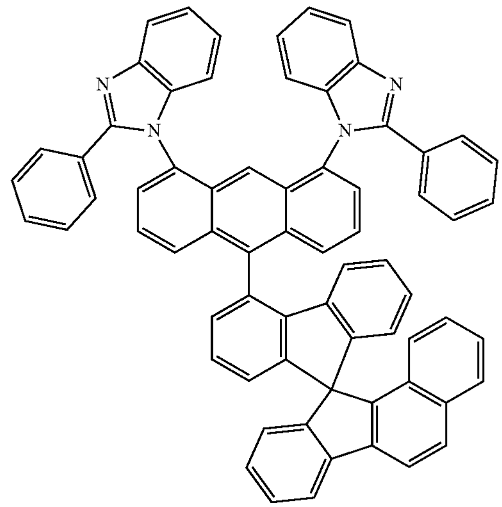
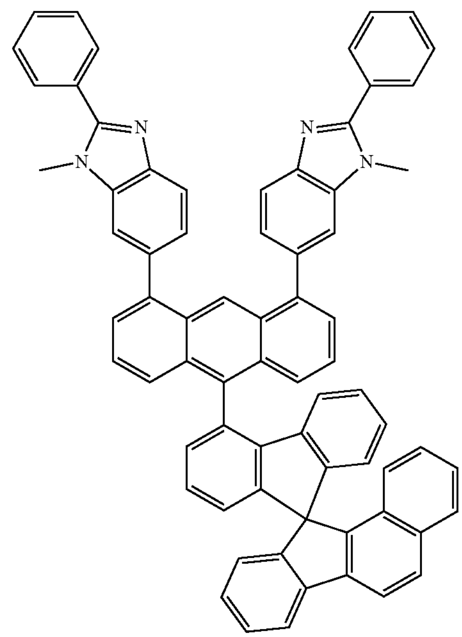
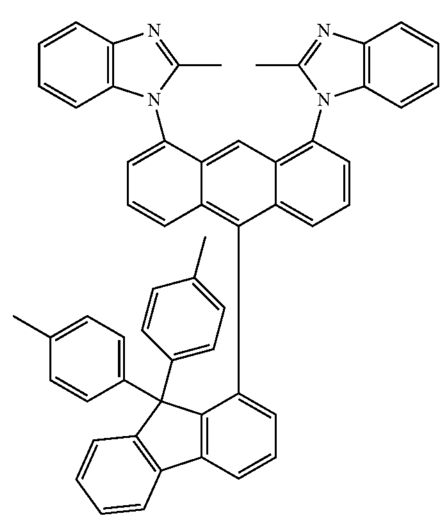

-continued
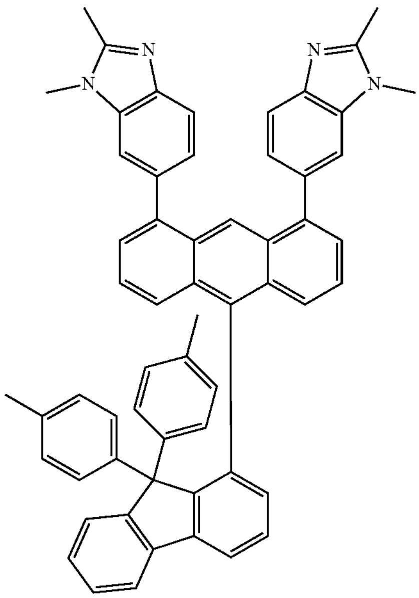
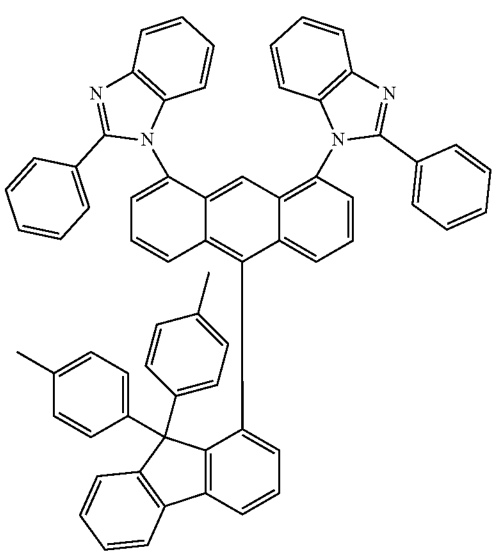
-continued
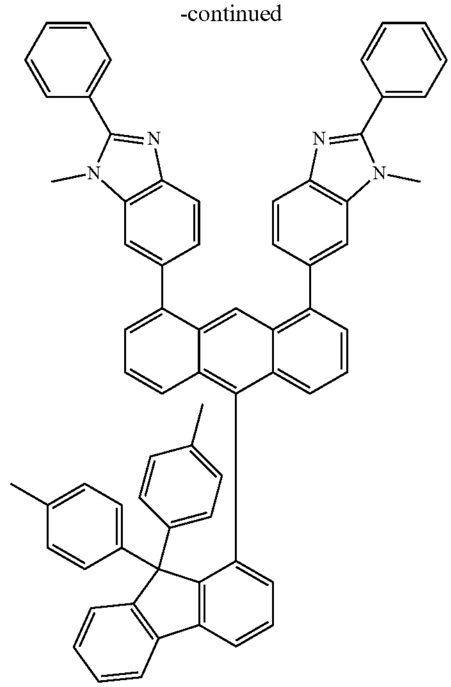
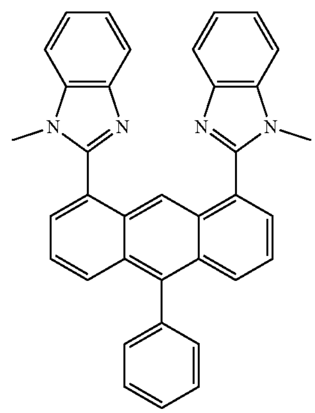
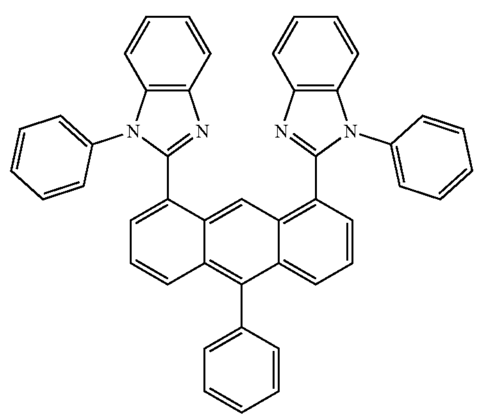

-continued
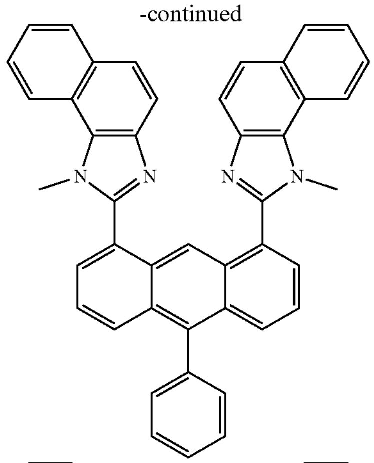
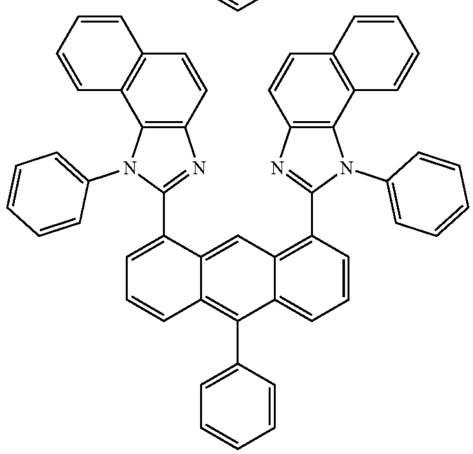
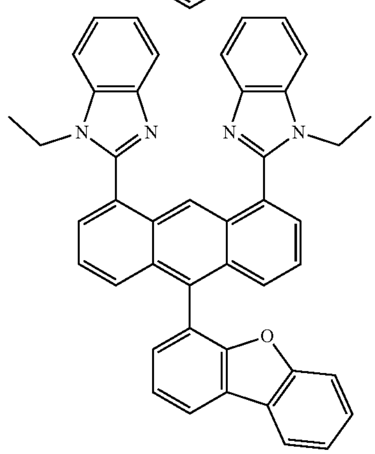
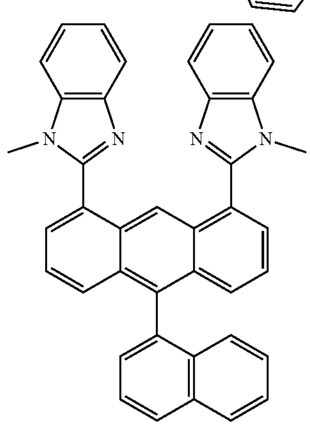
-continued
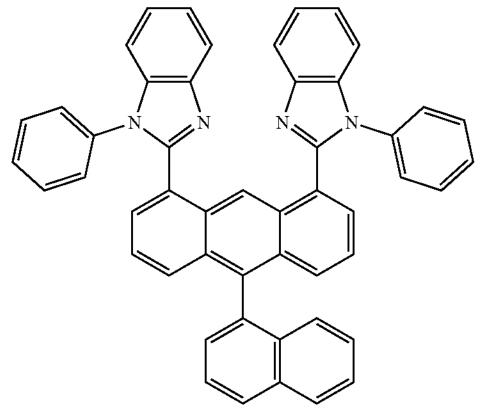
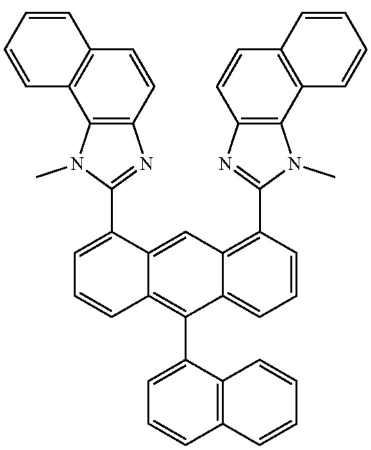
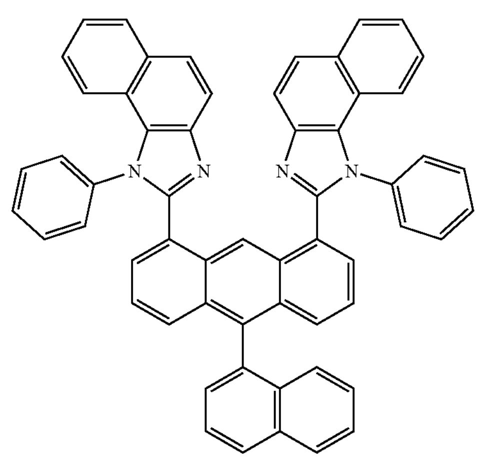

-continued
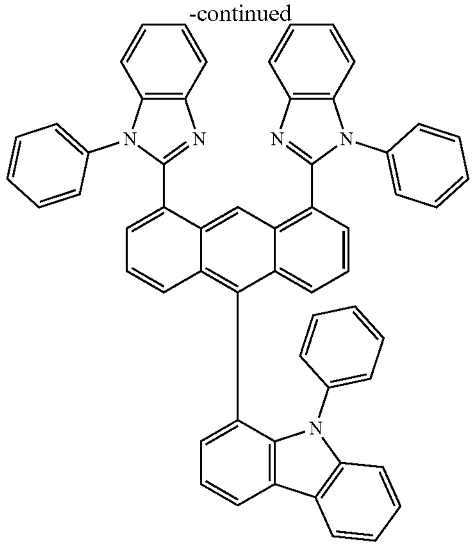
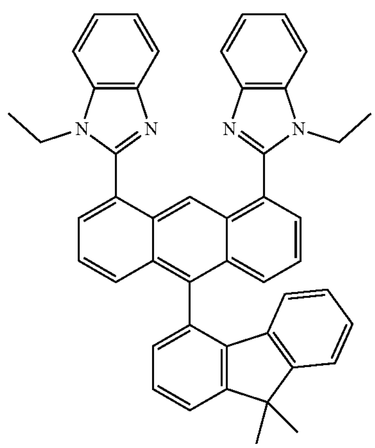
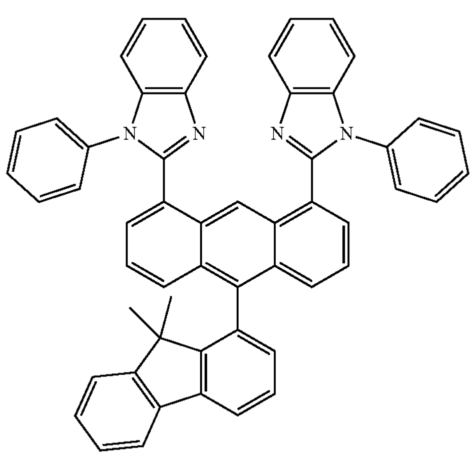
-continued
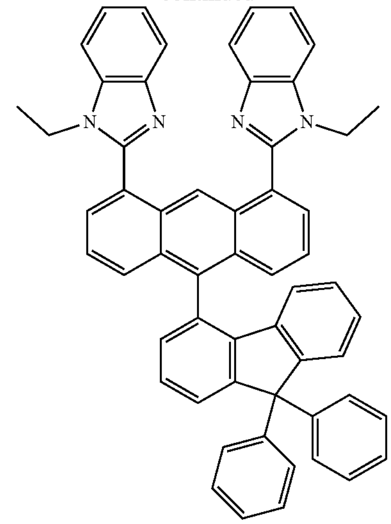
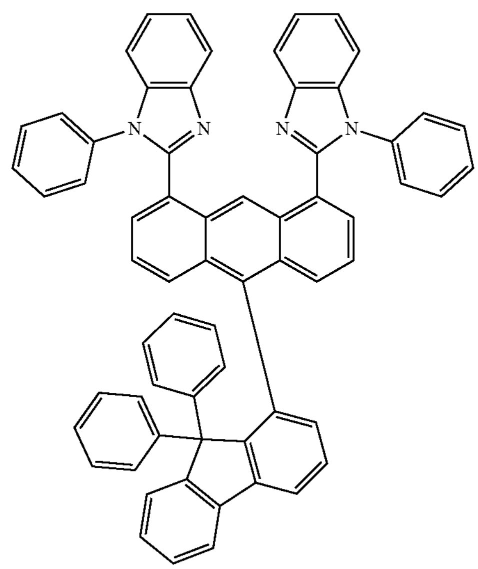
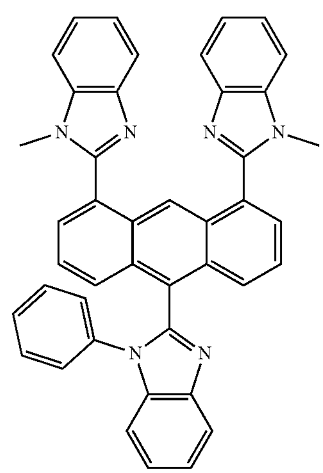

-continued
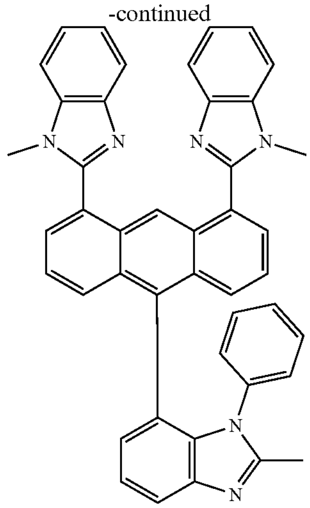
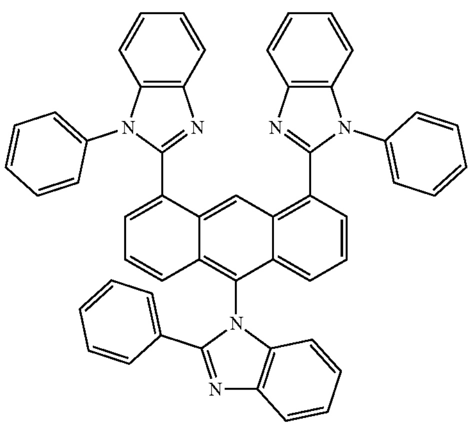
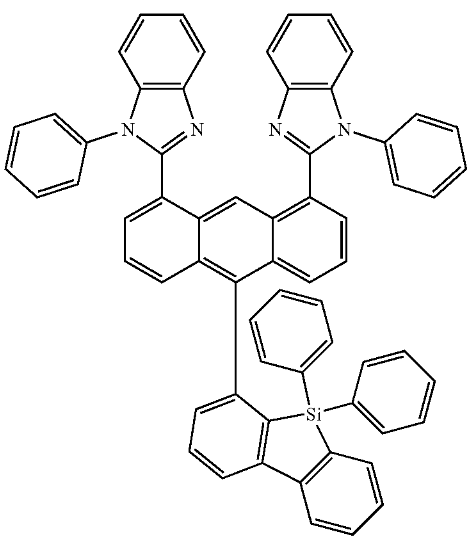
-continued
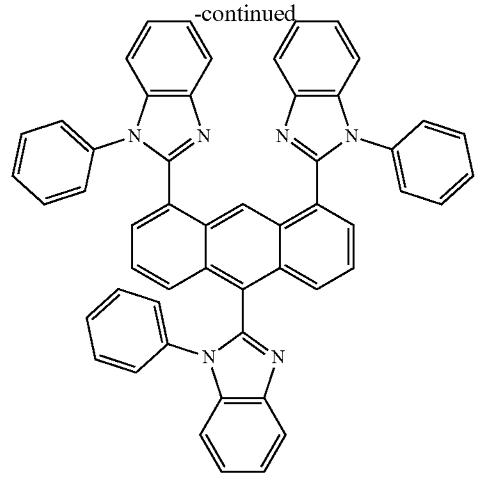
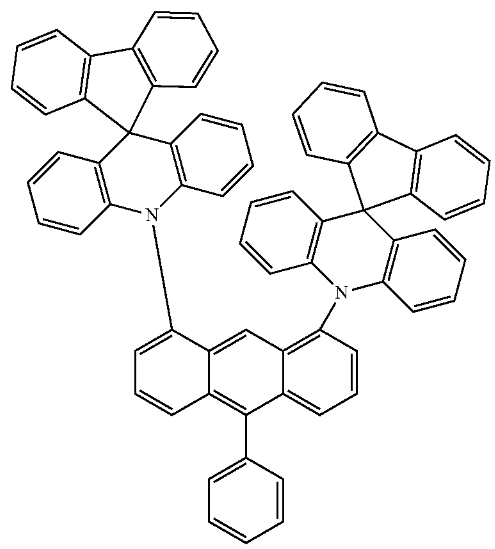
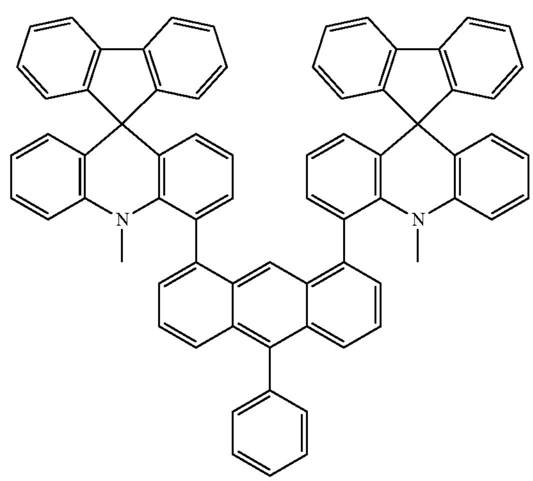

-continued
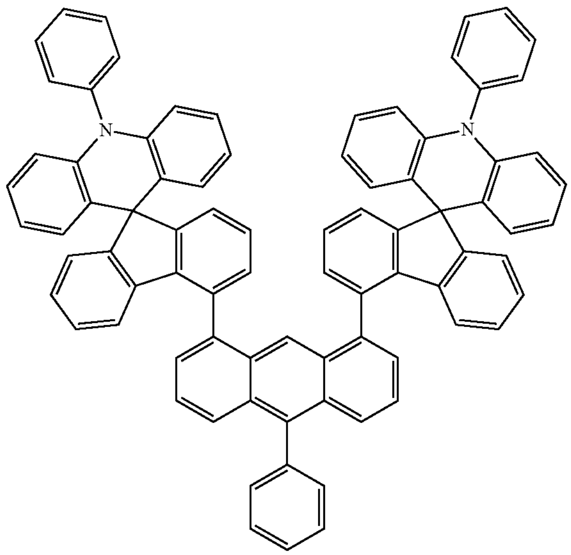
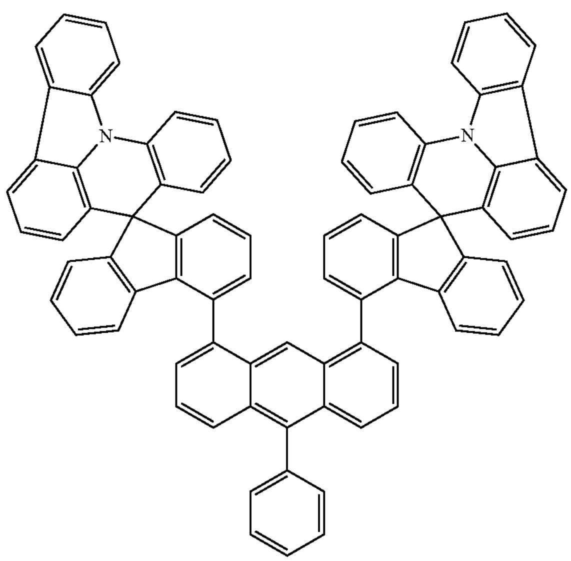
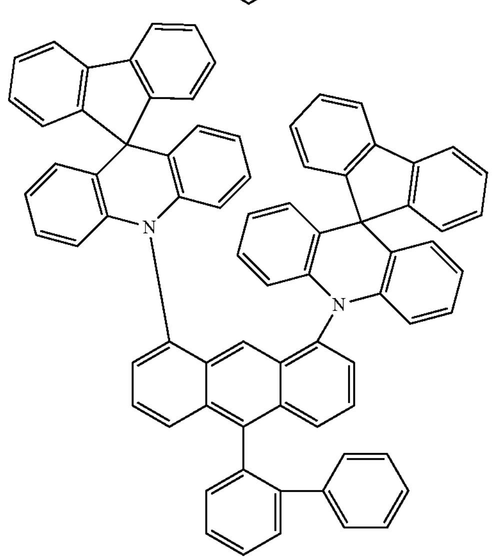
-continued
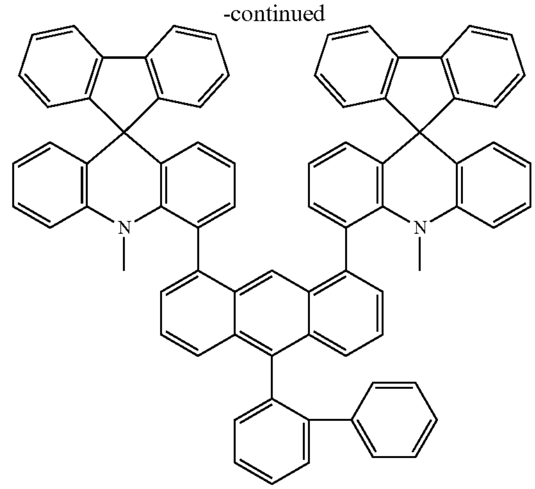
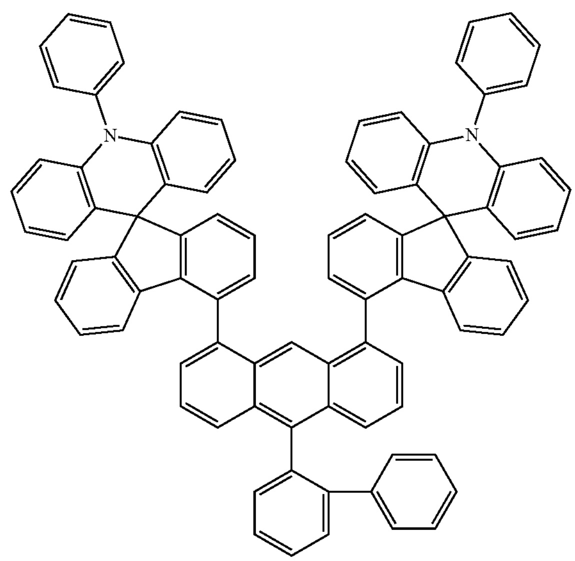
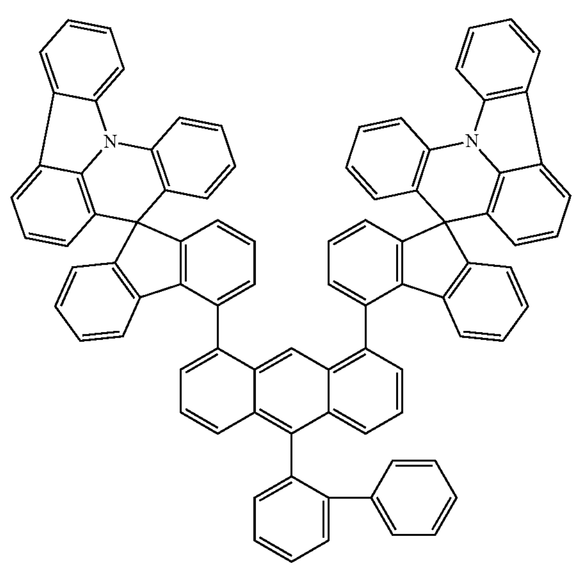

-continued
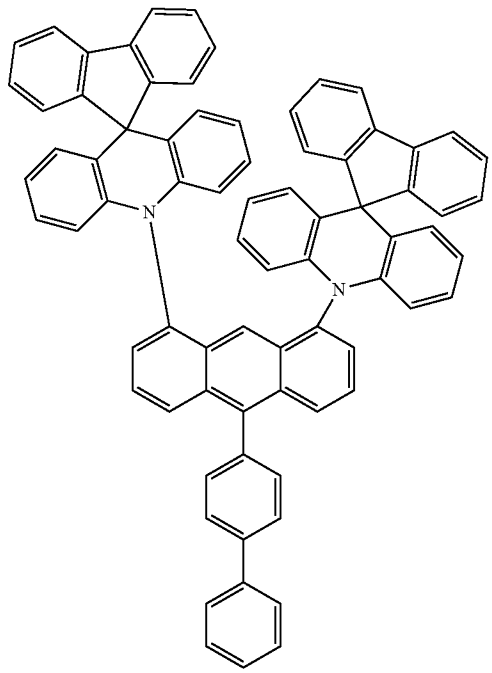
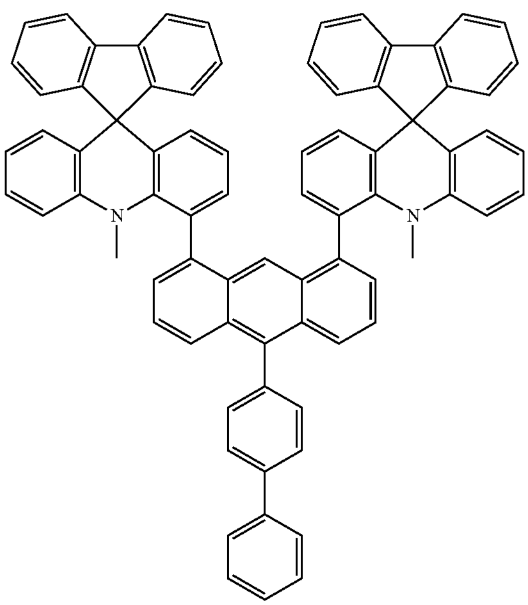
-continued
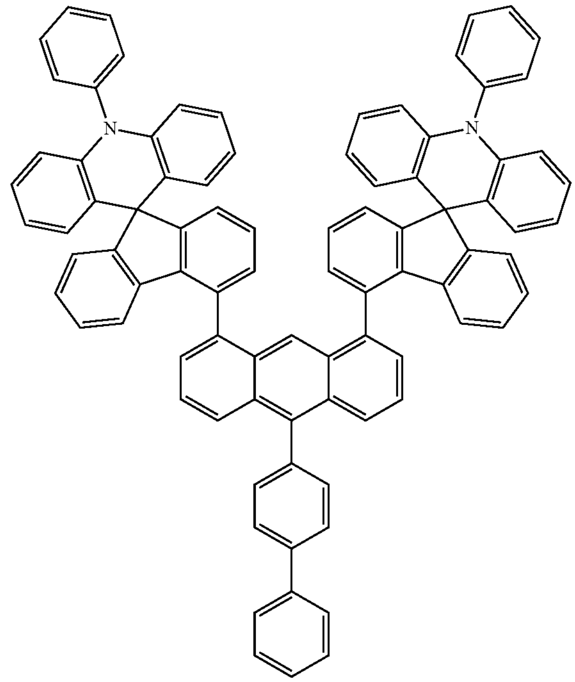
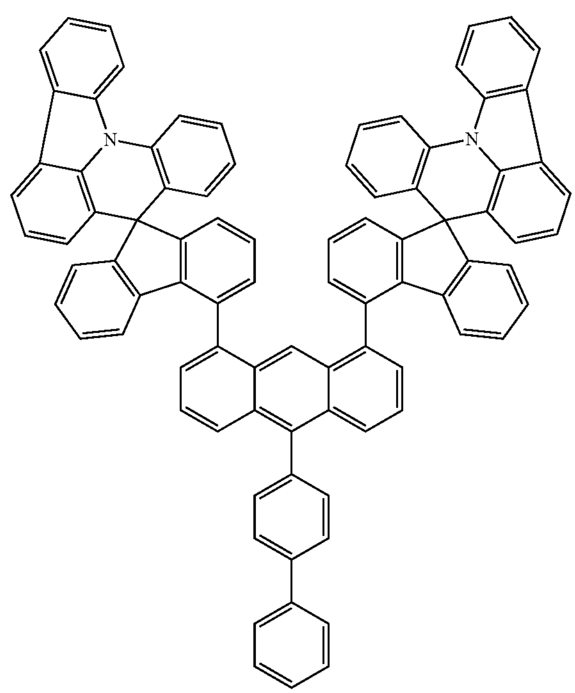

-continued
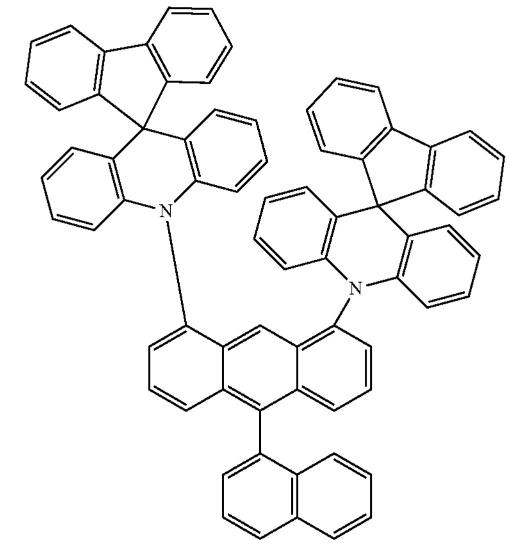
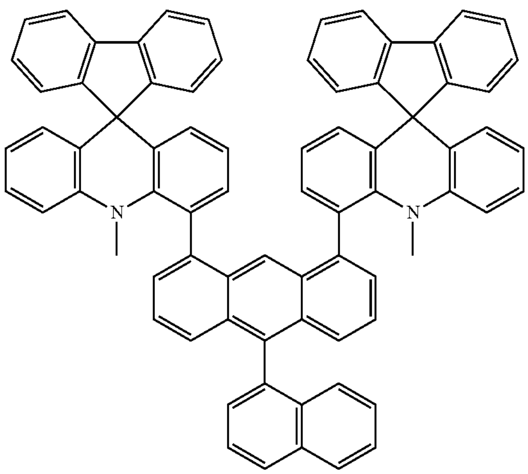
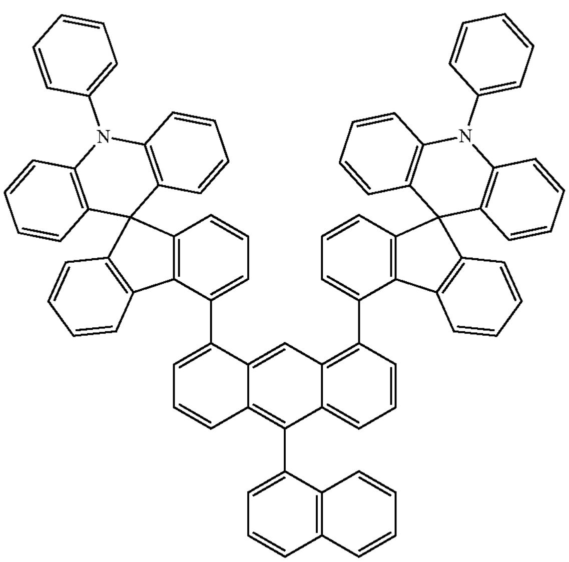
-continued
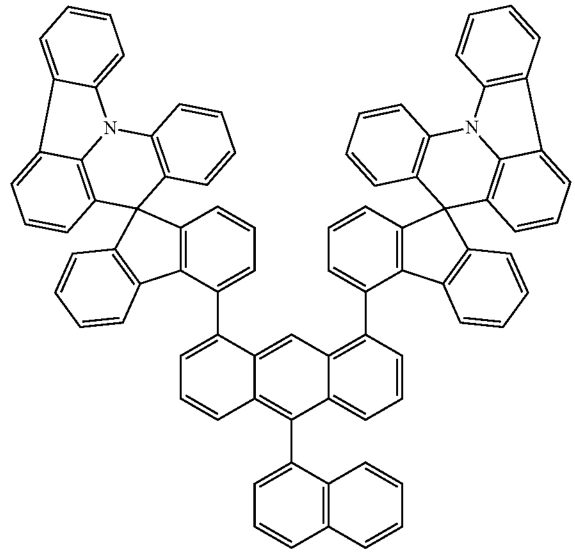
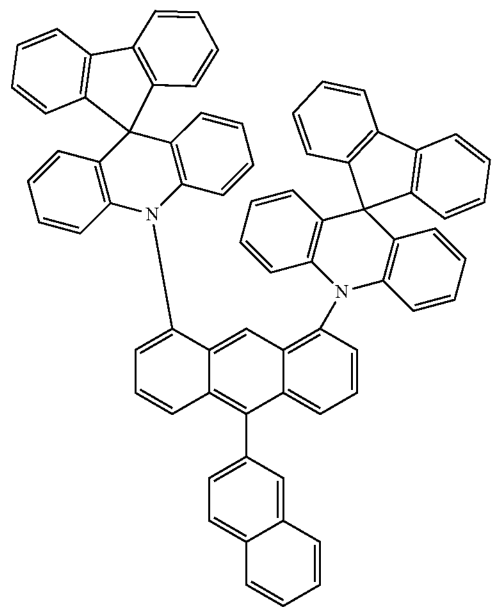
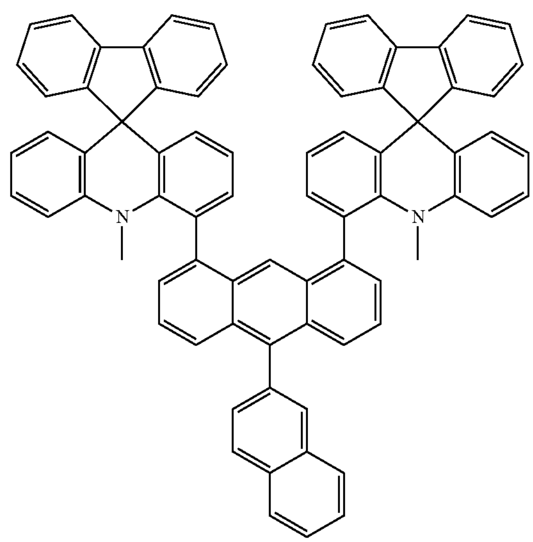

-continued
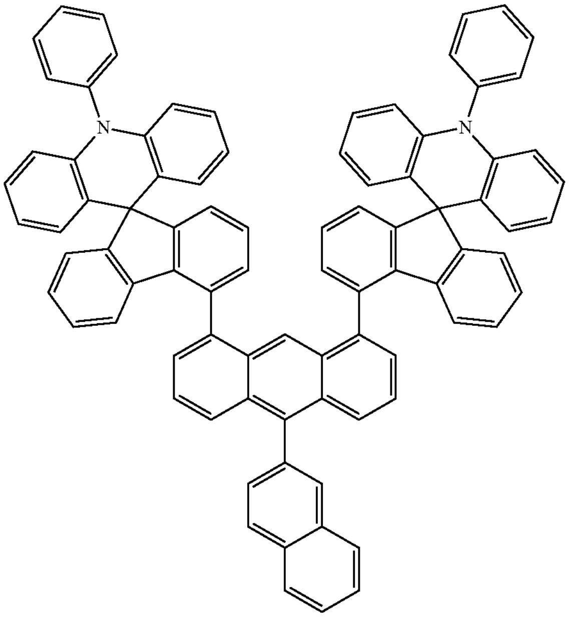
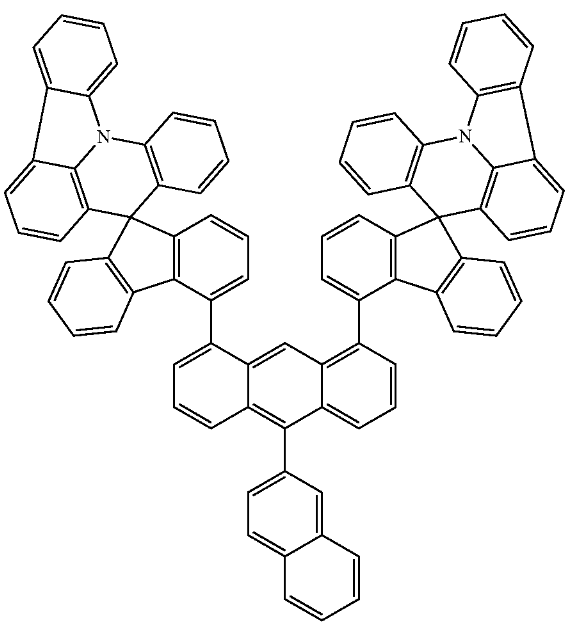
-continued
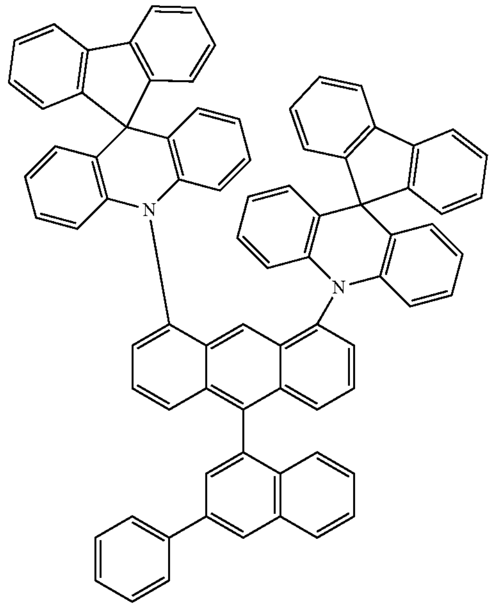
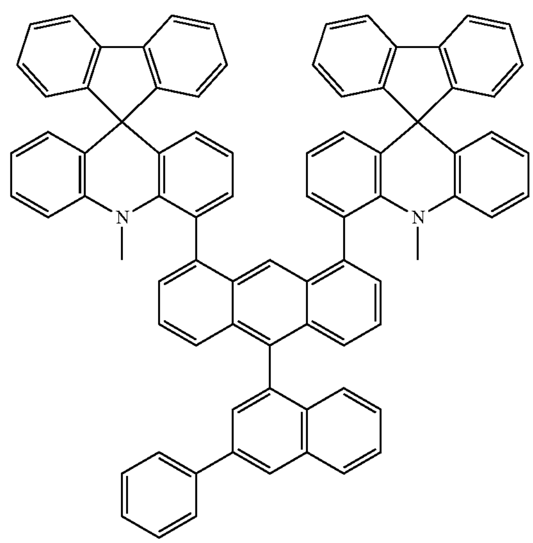

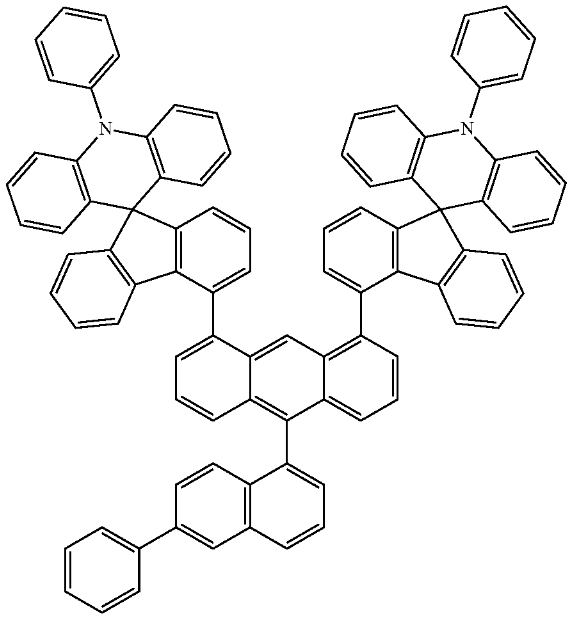
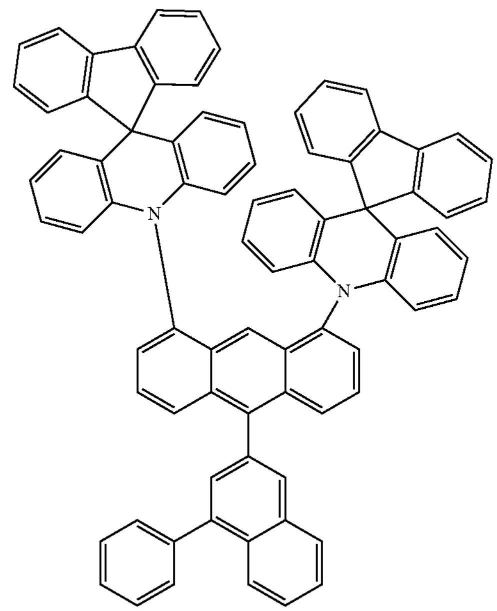
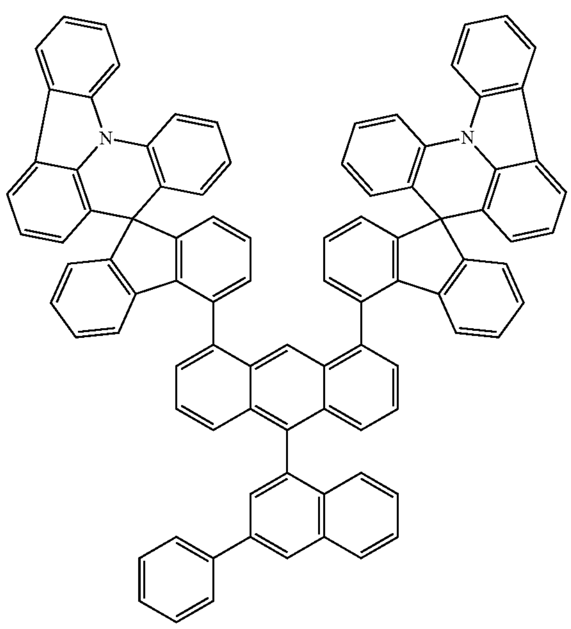
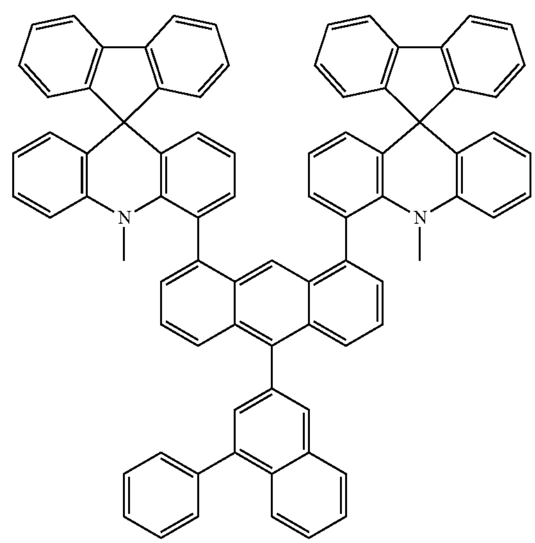

-continued
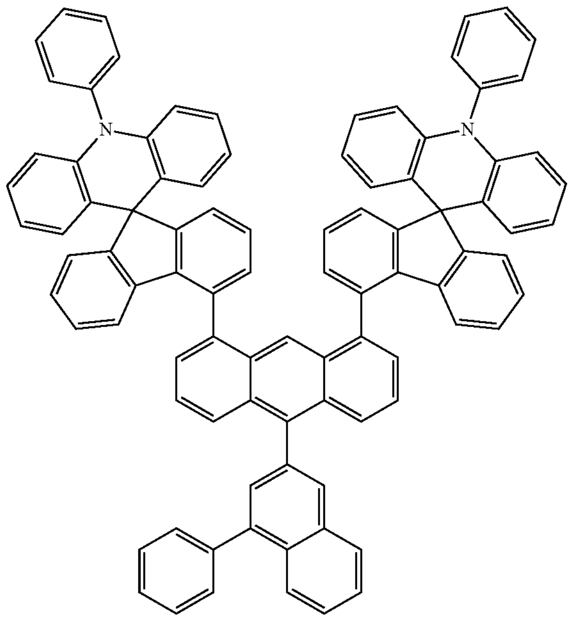
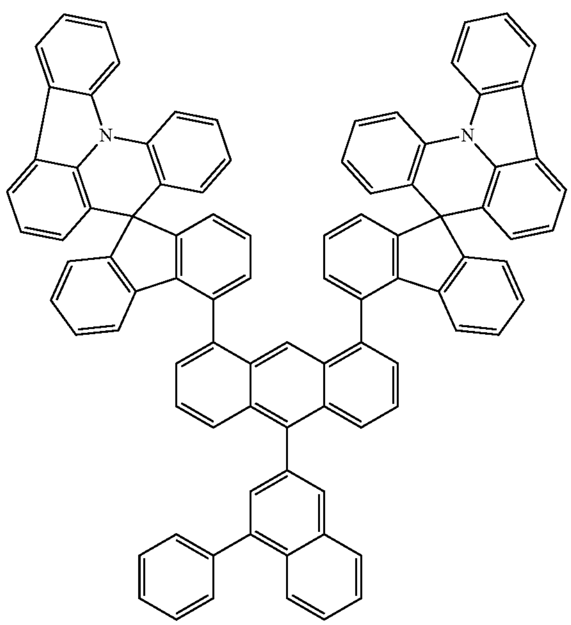
-continued
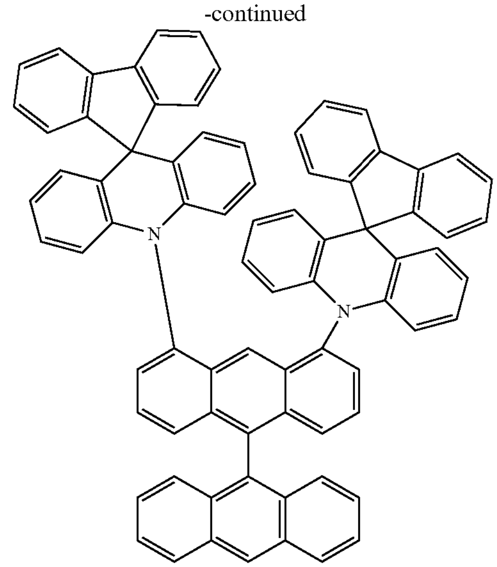
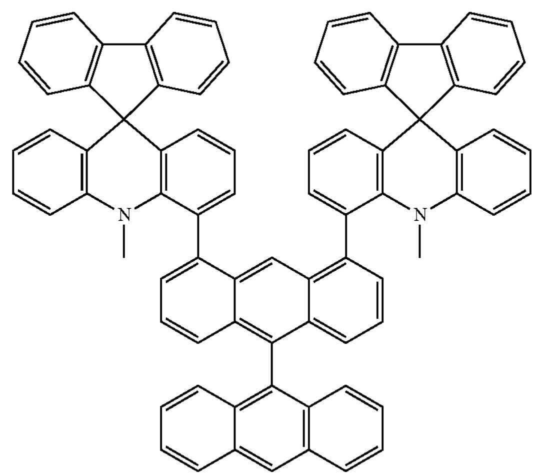
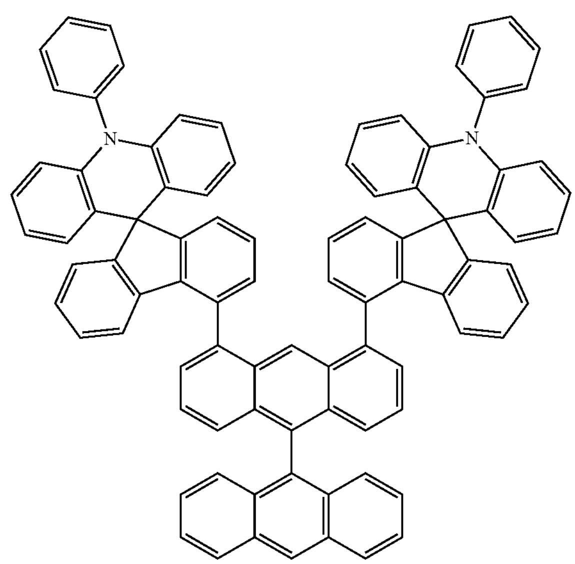

-continued
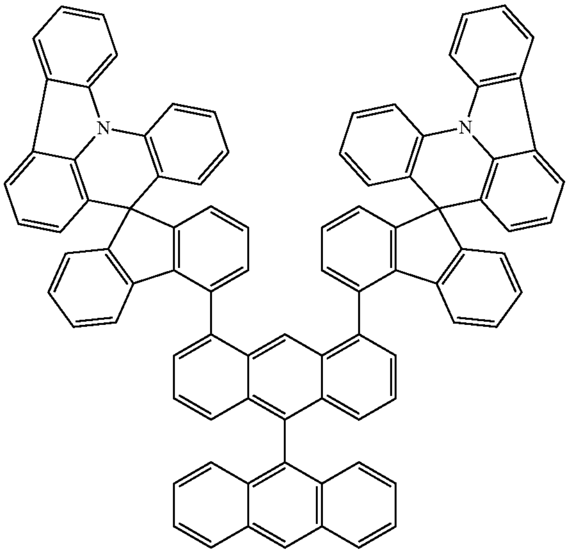
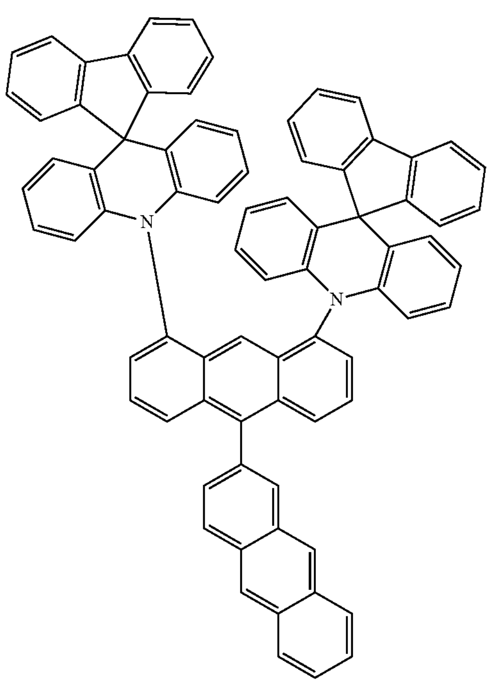
-continued
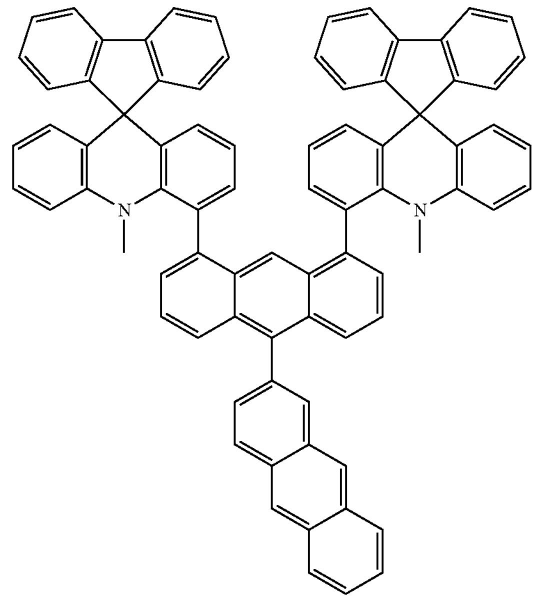
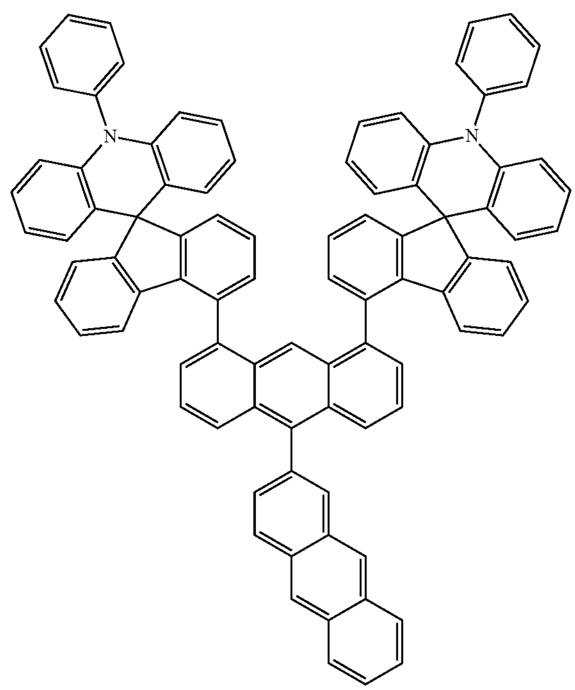

-continued
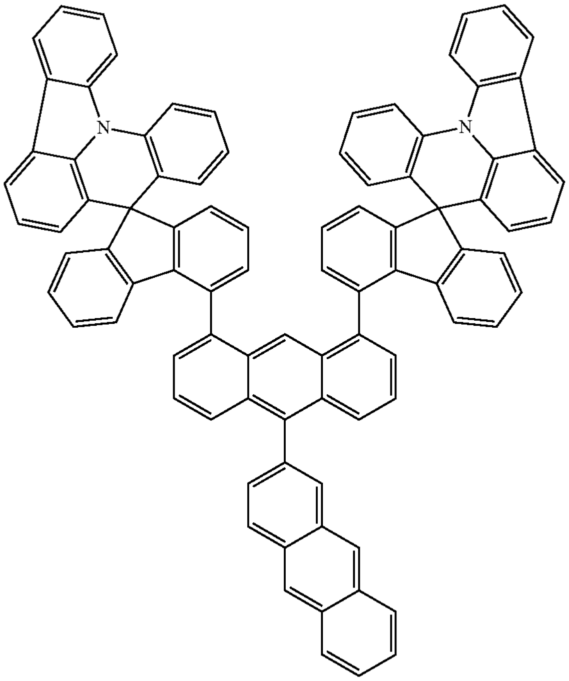
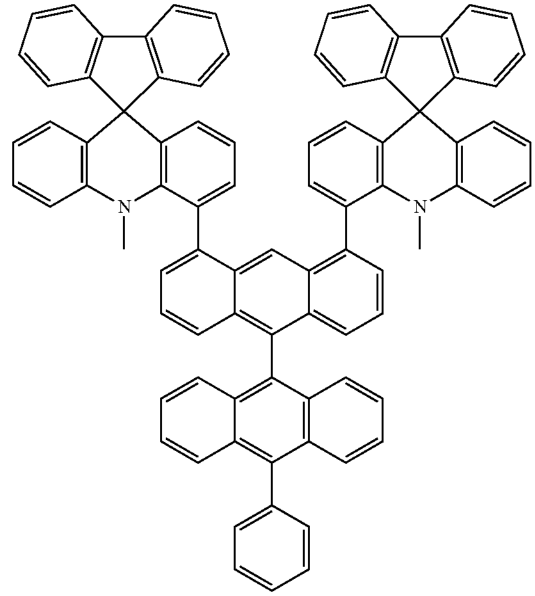
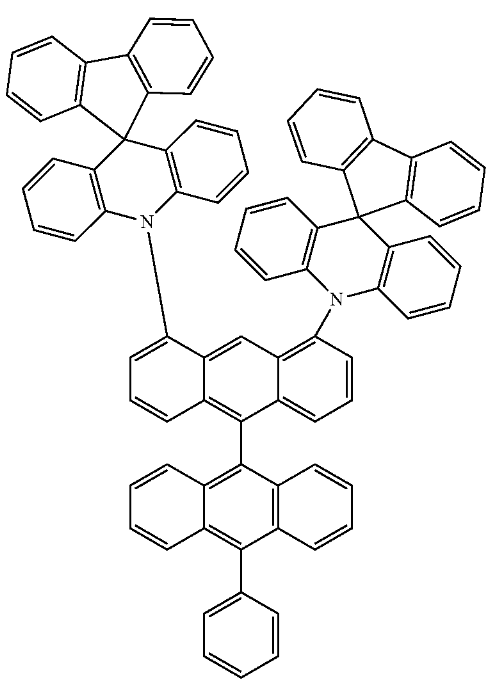
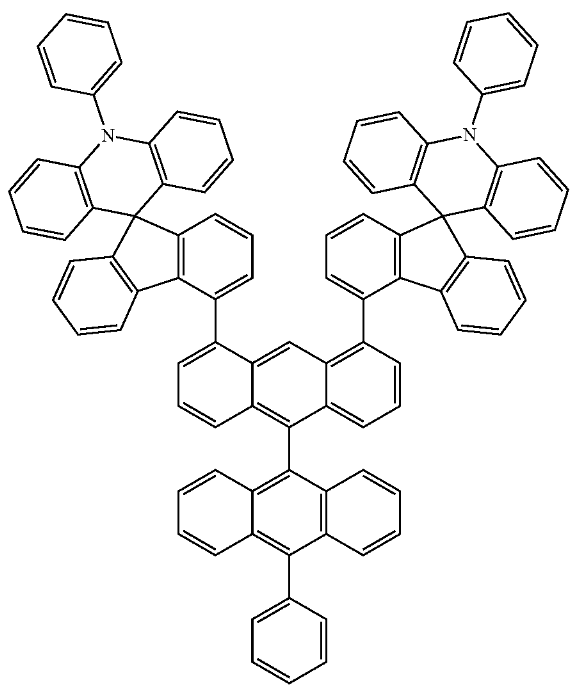

-continued
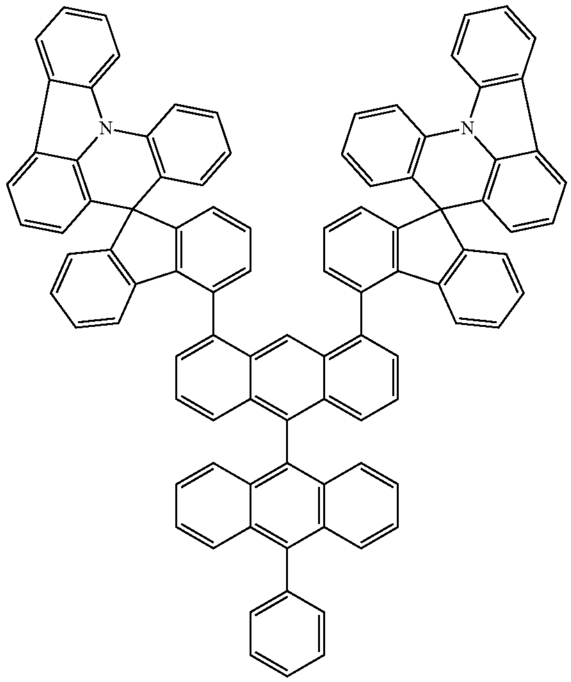
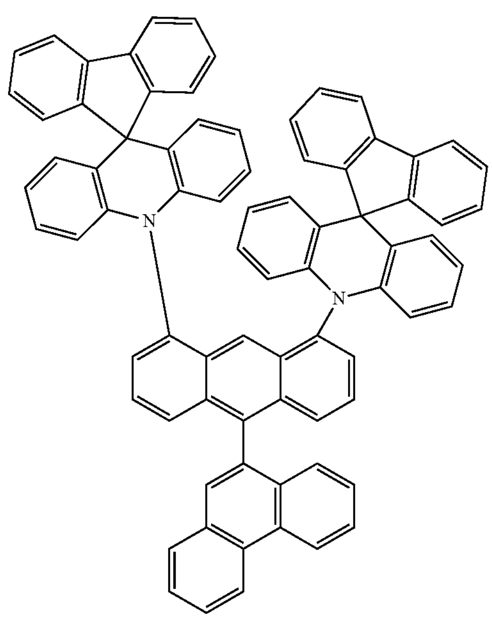
-continued
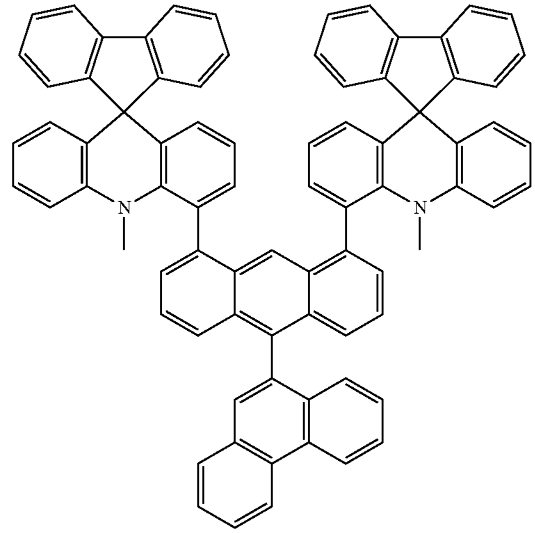
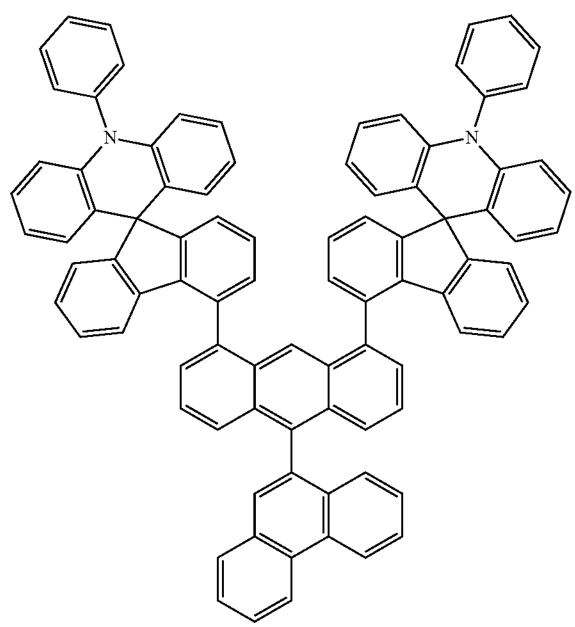

-continued
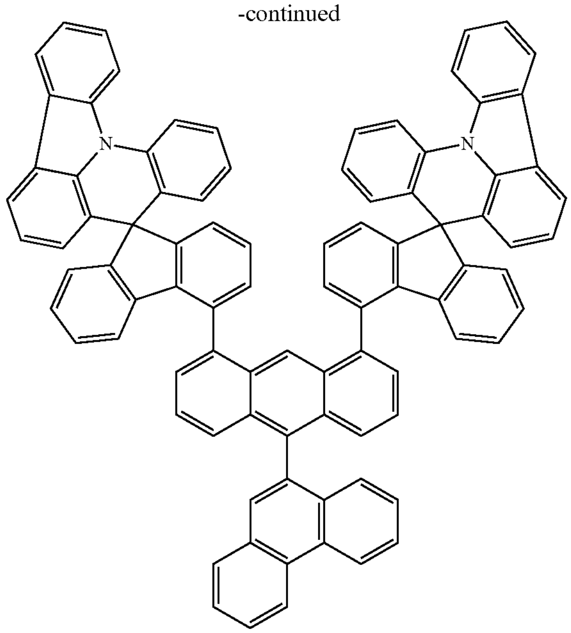
-continued
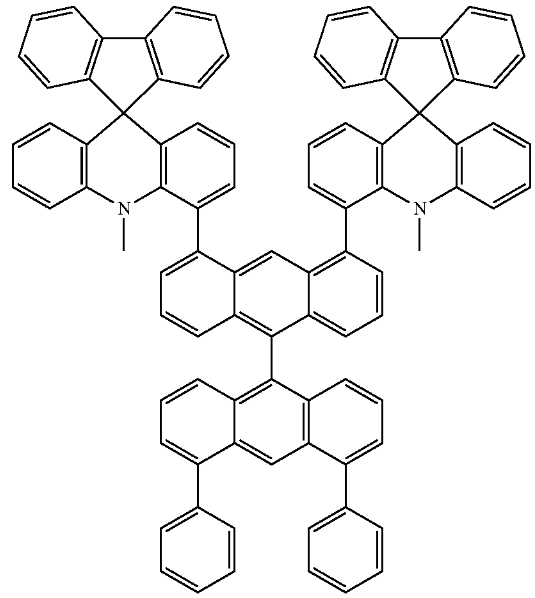
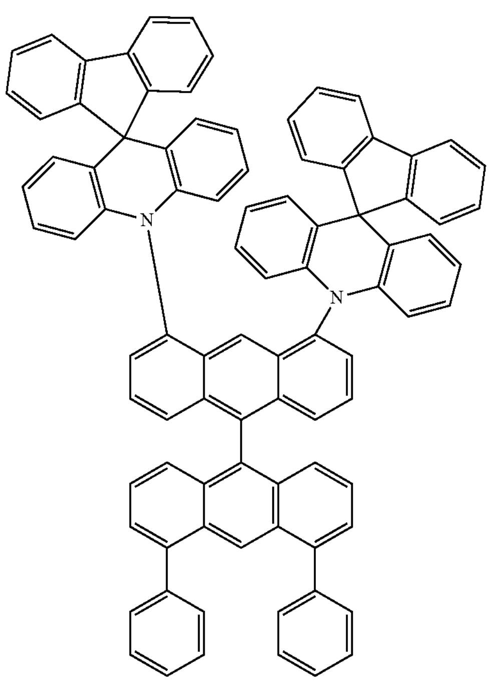
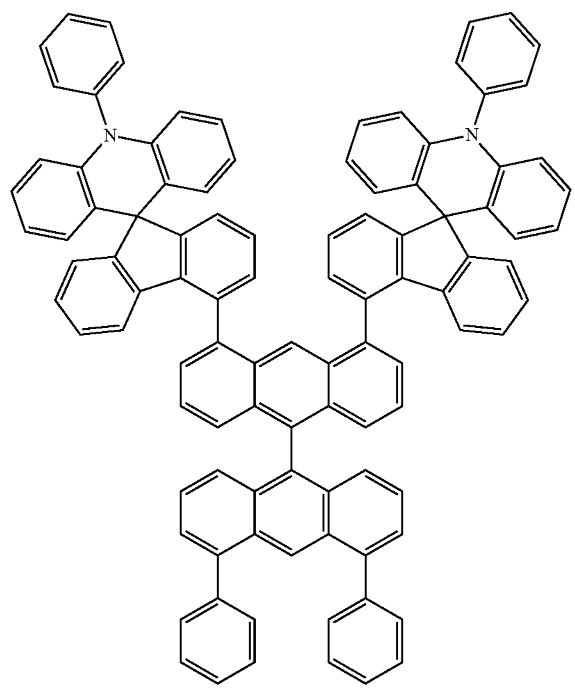

-continued
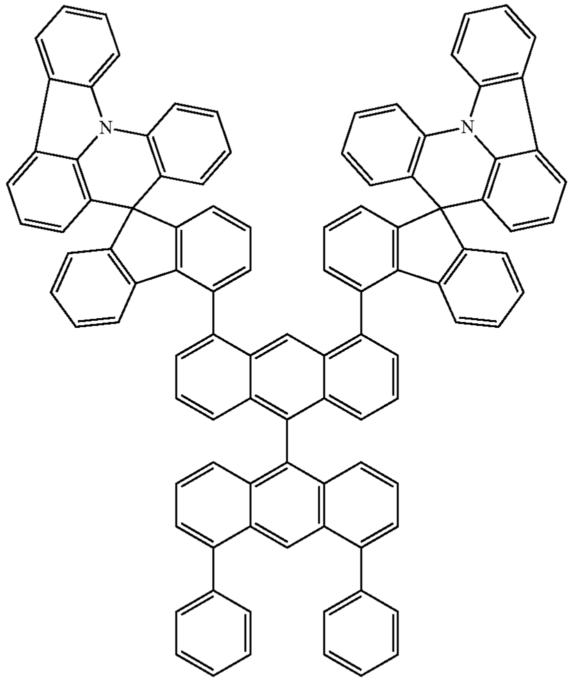
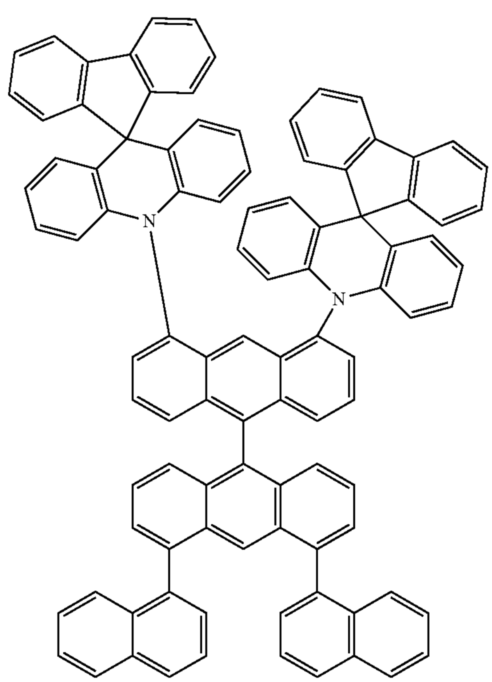
-continued
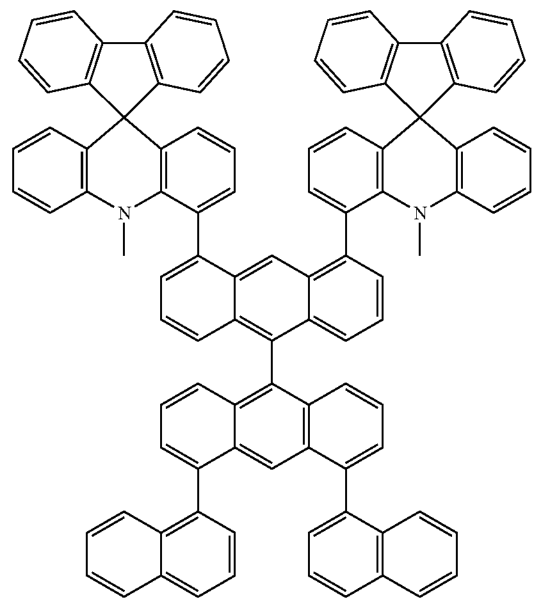
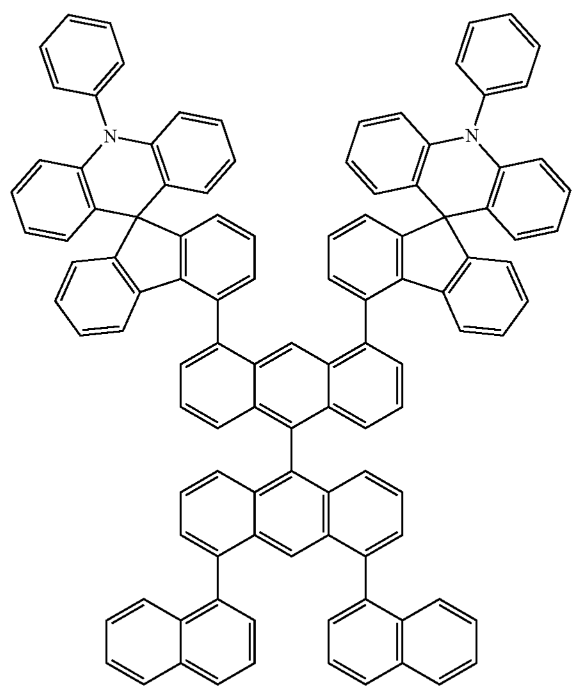

-continued
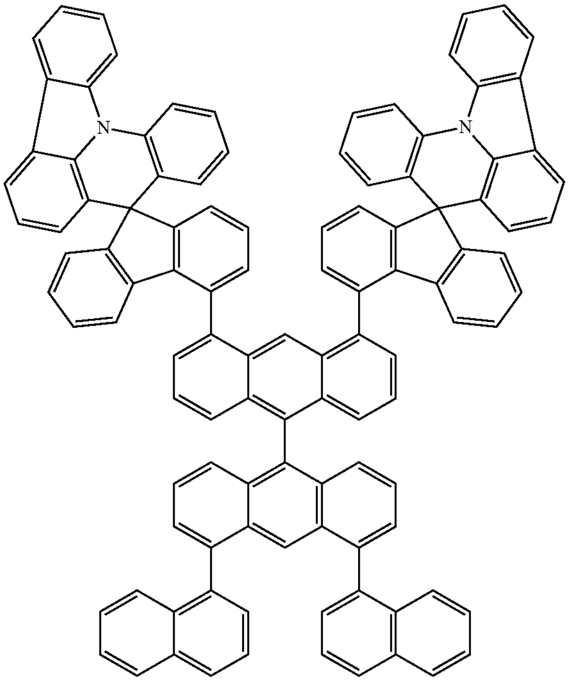
-continued
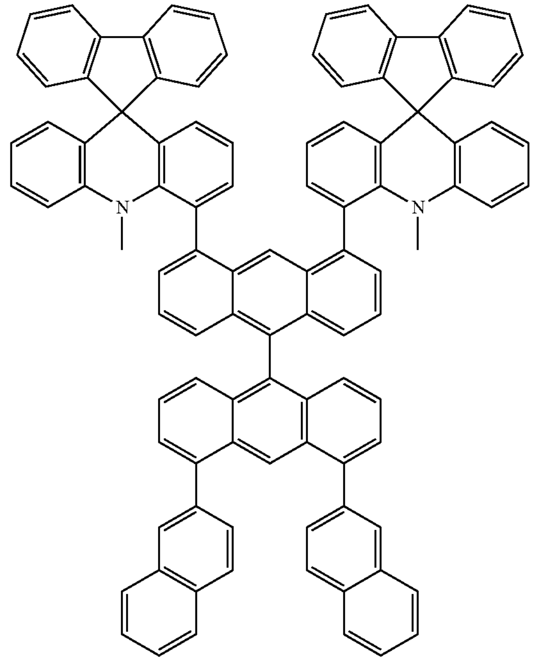
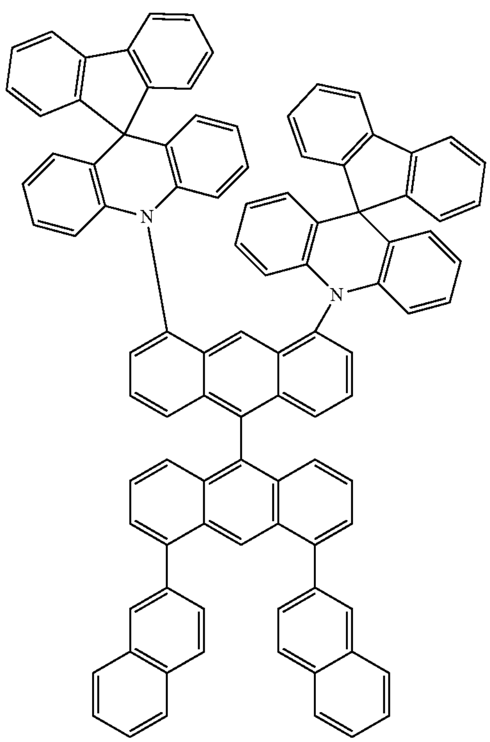
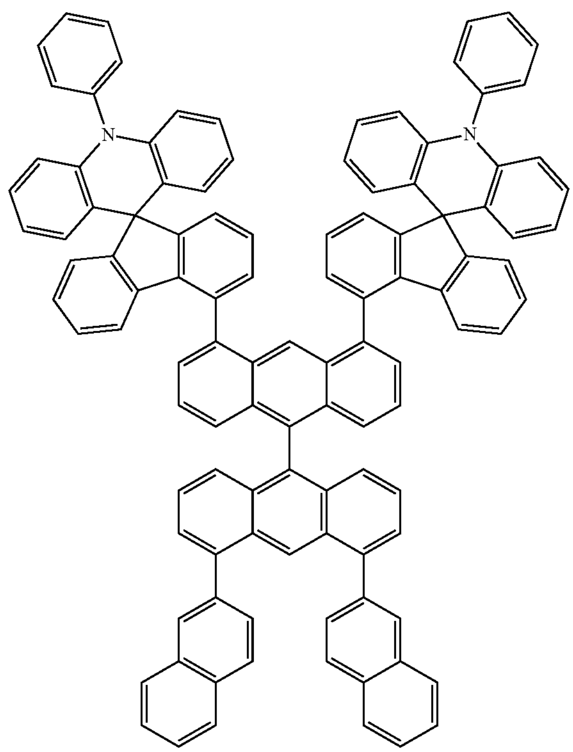

-continued
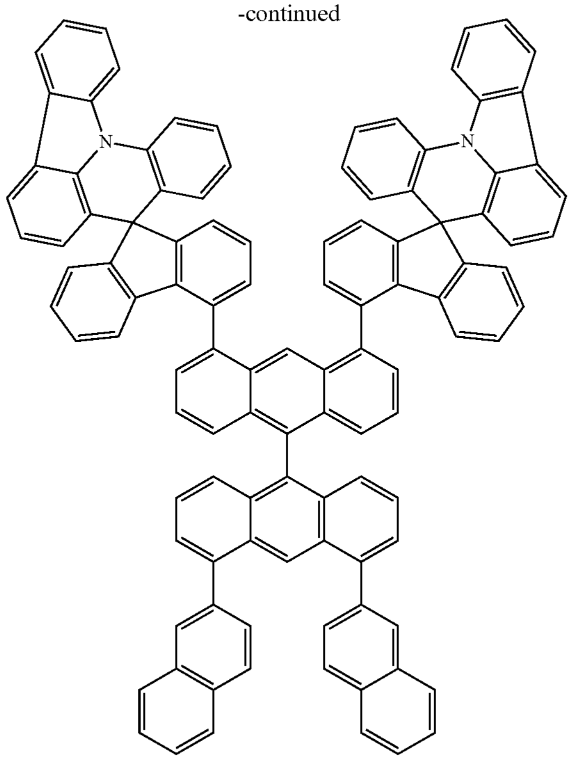
-continued
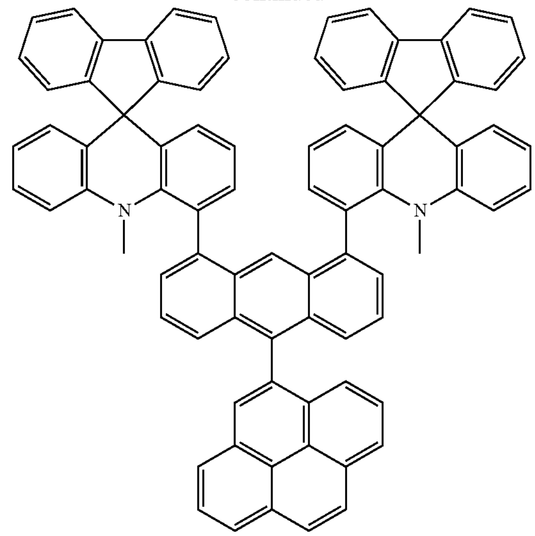
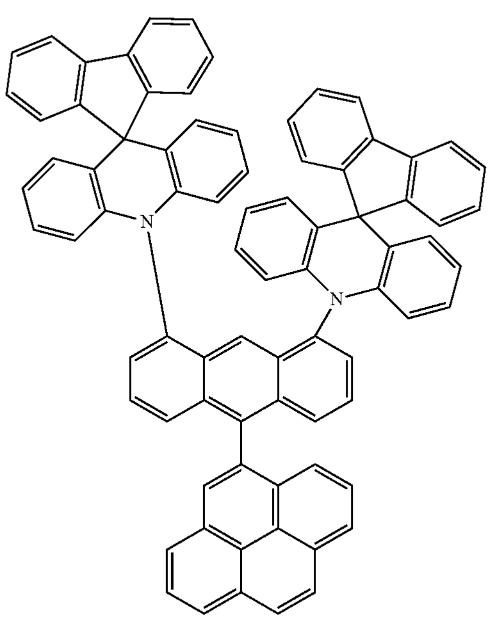
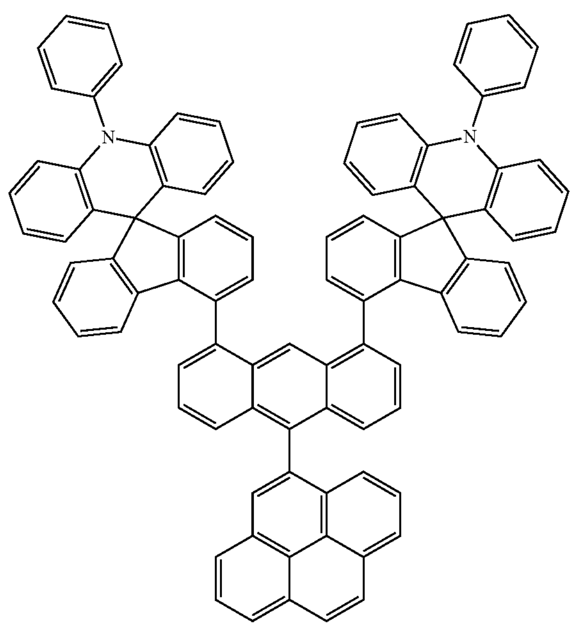

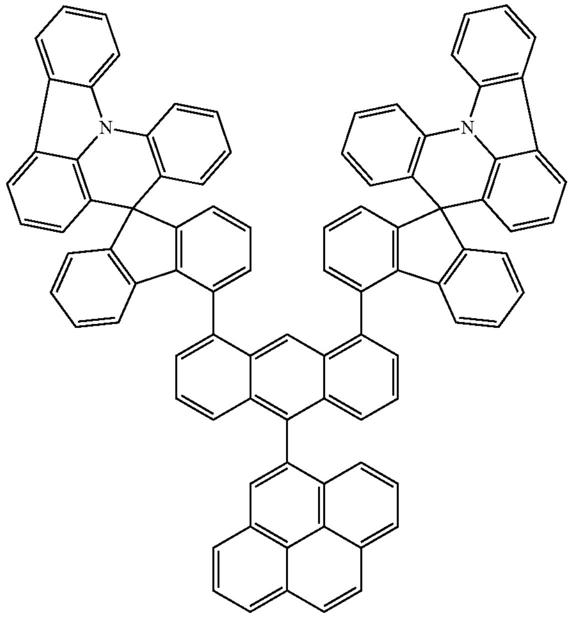
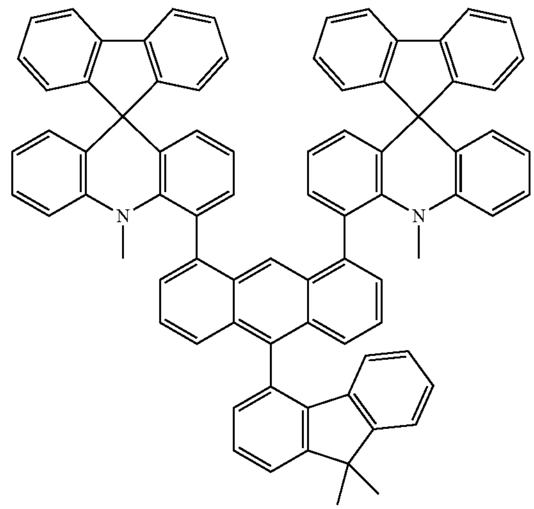
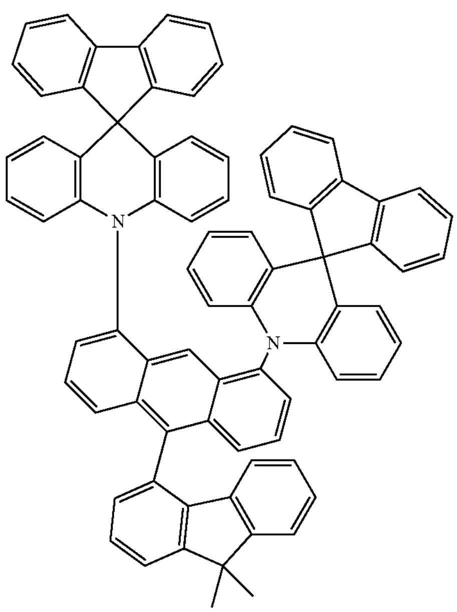
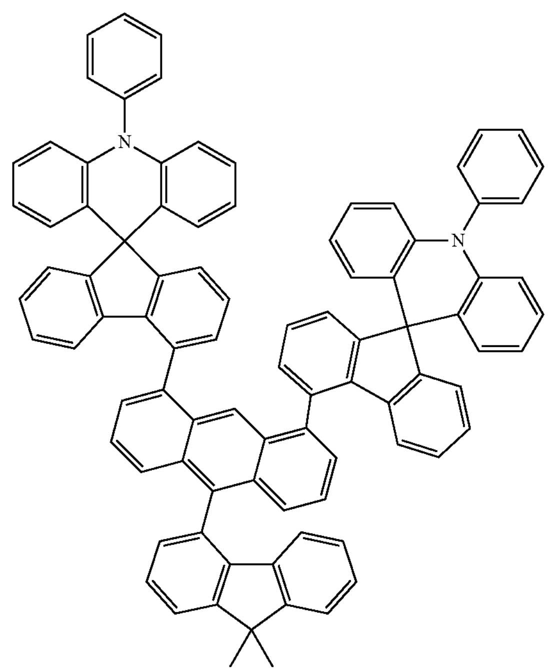

-continued
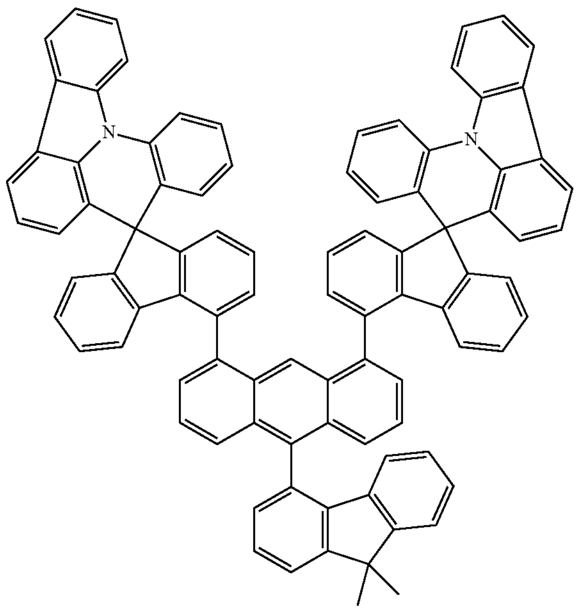
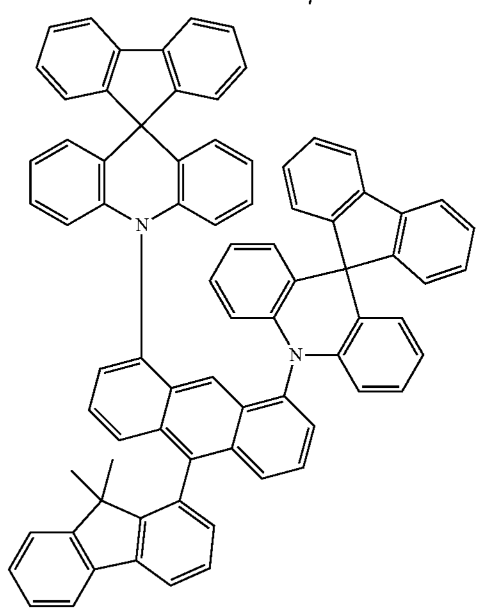
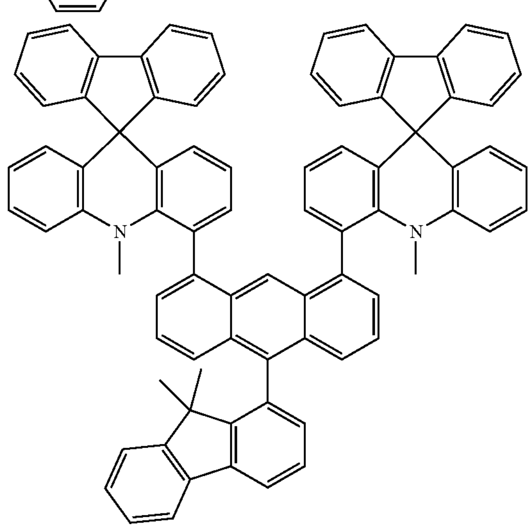
-continued
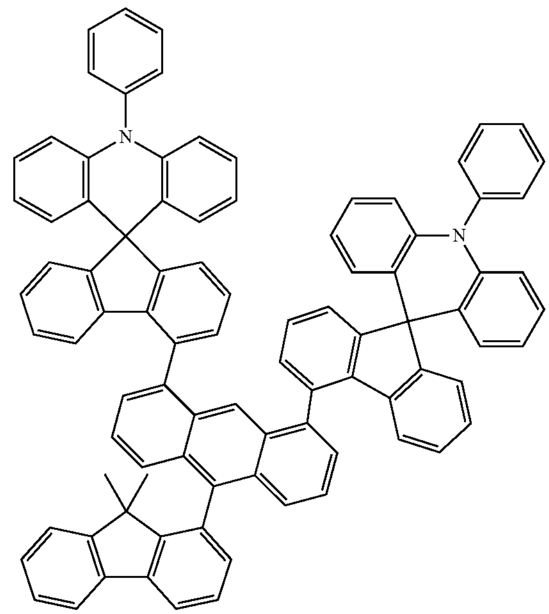
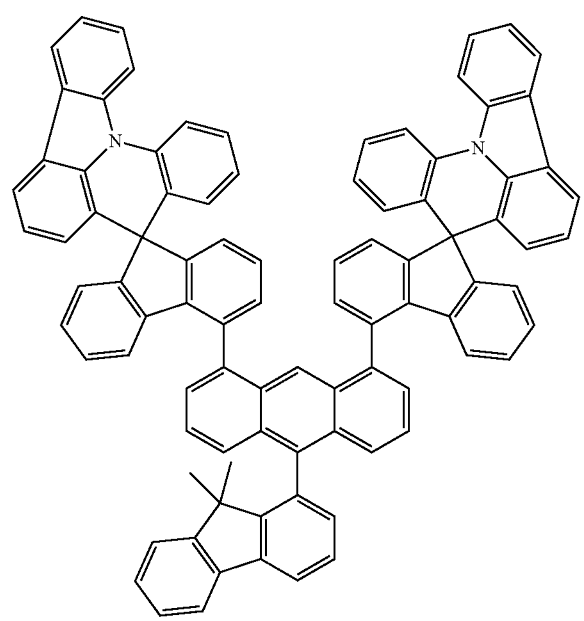

-continued
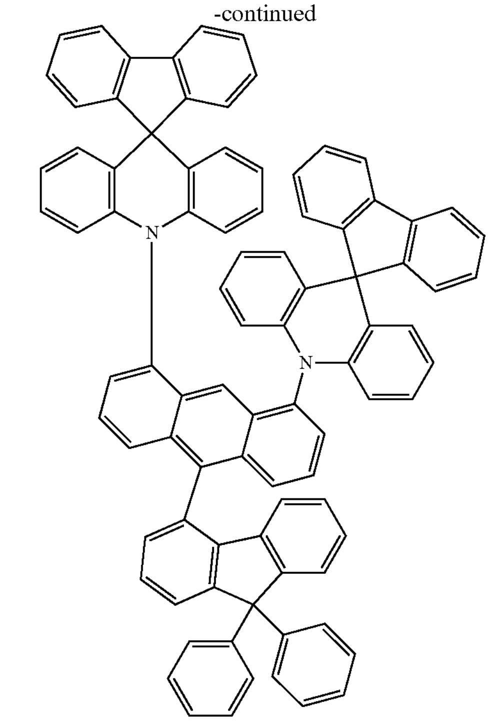
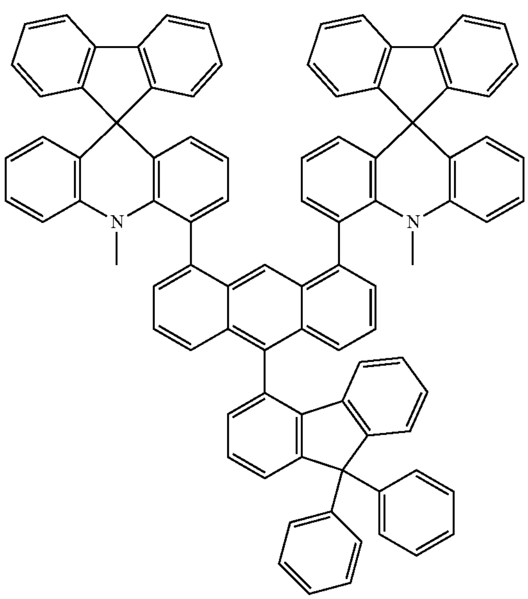
-continued
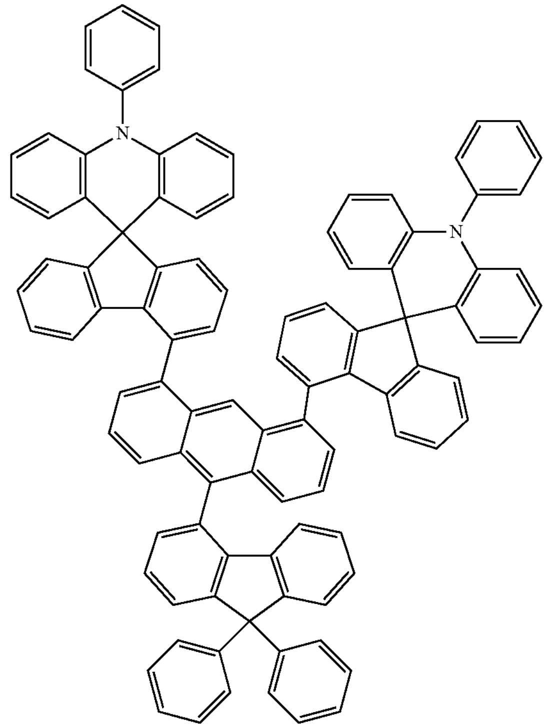
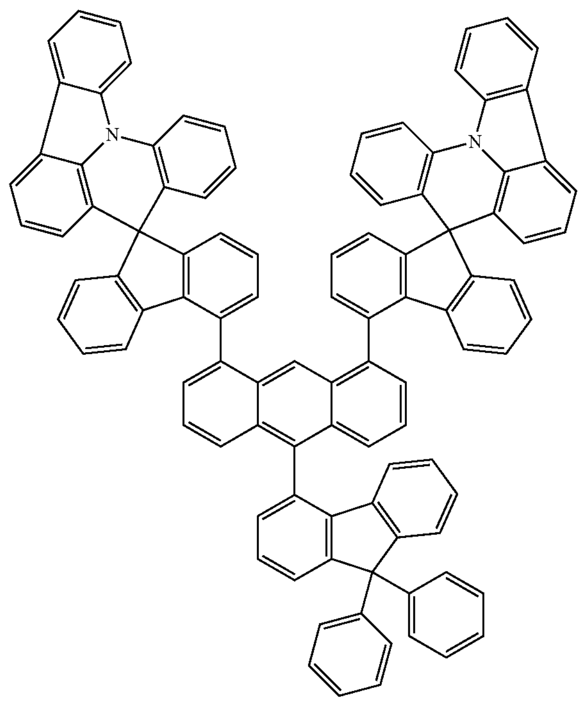

-continued
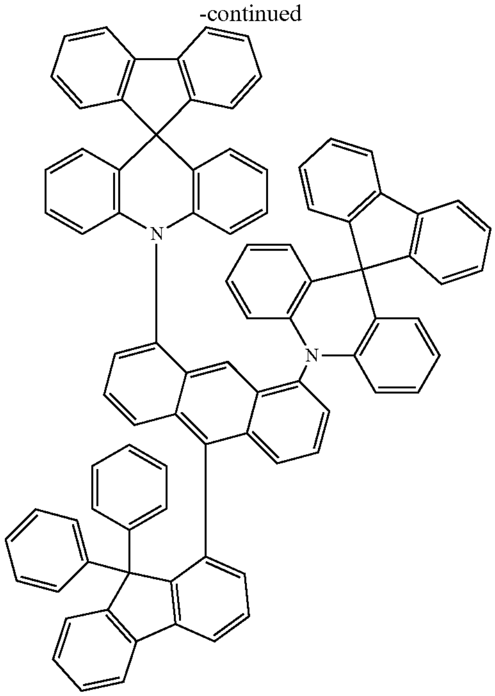
-continued
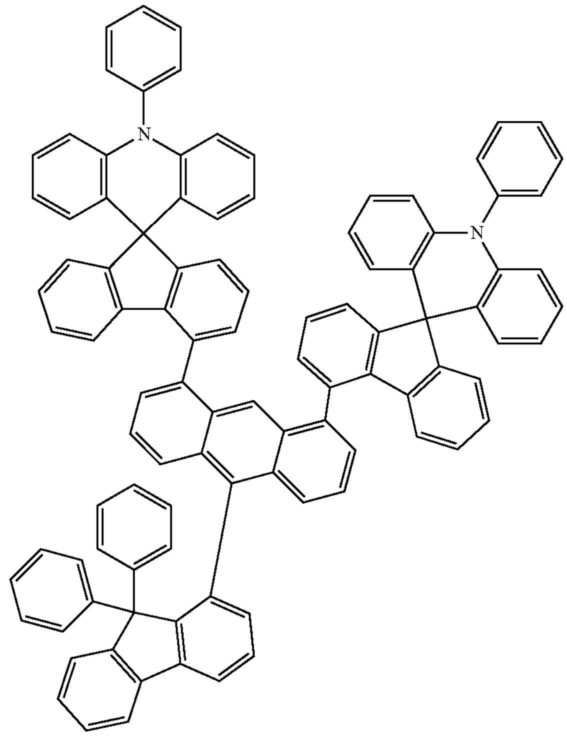
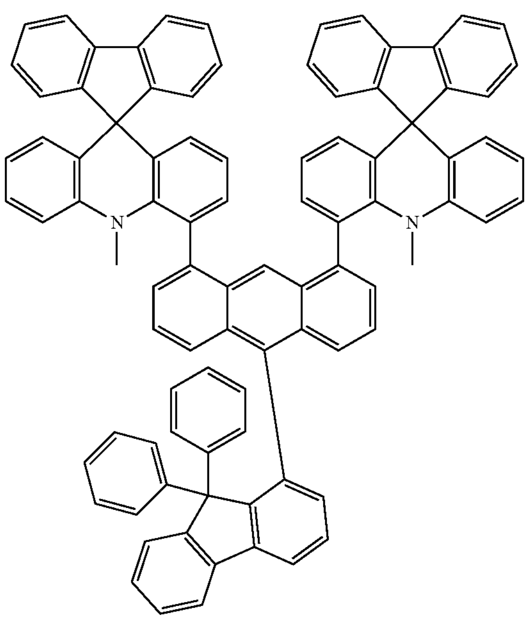
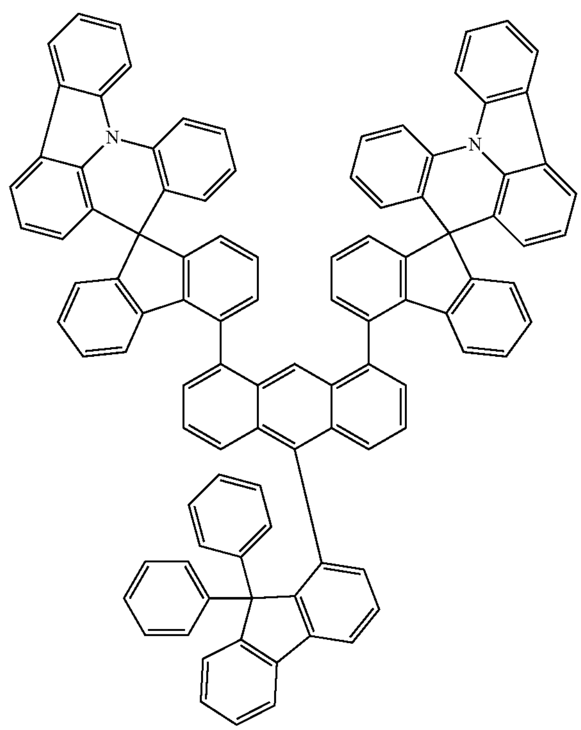

-continued
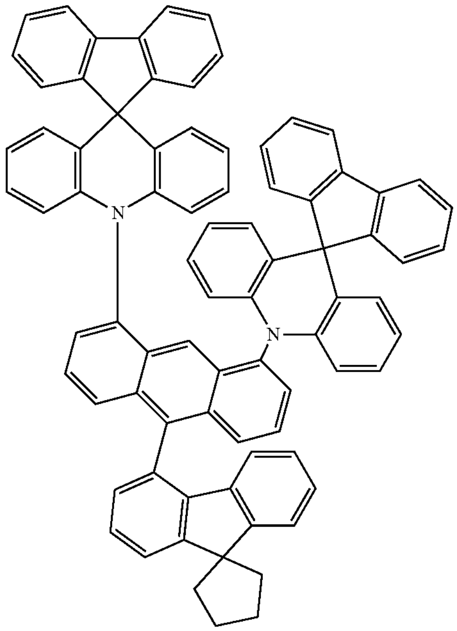
-continued
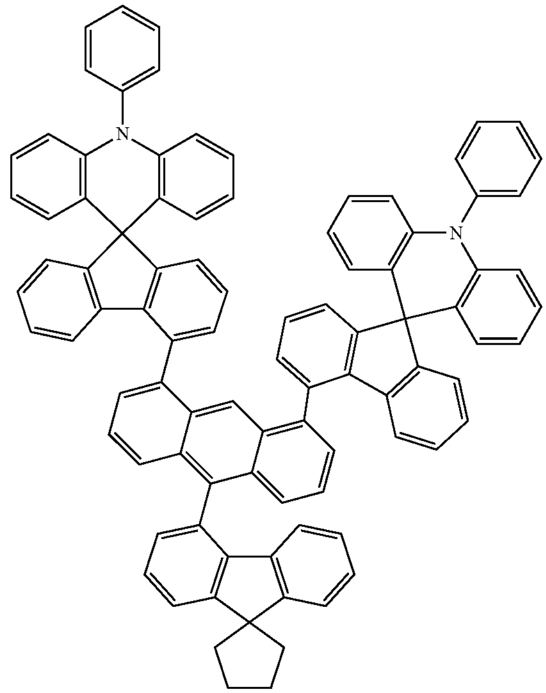
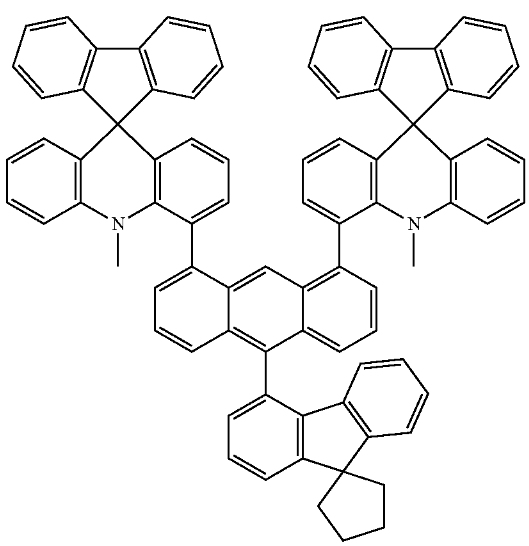
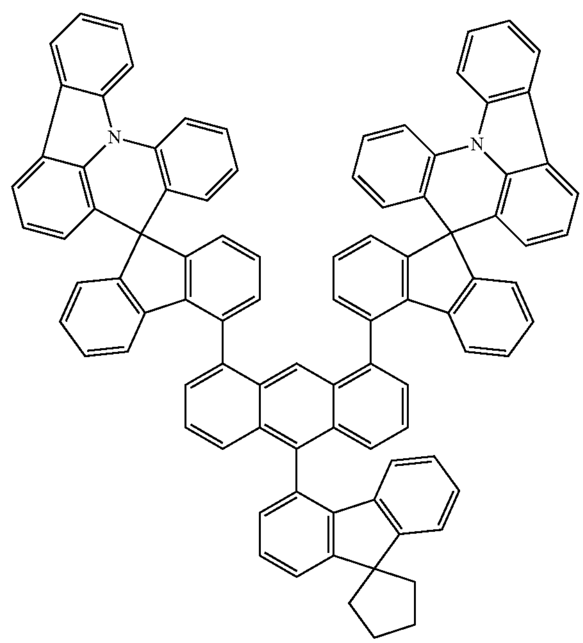

-continued
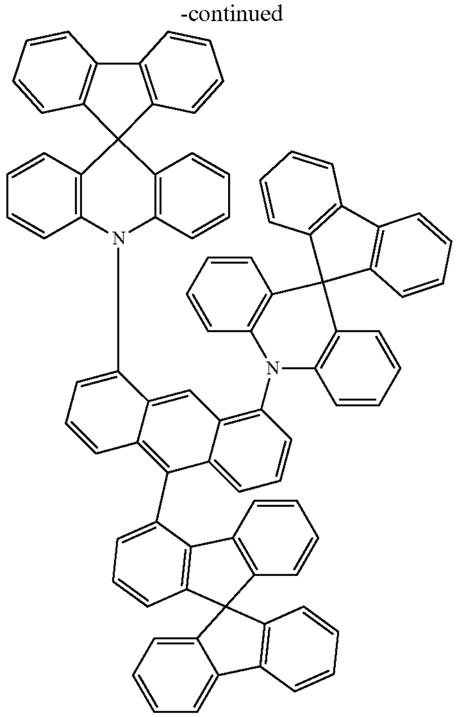
-continued
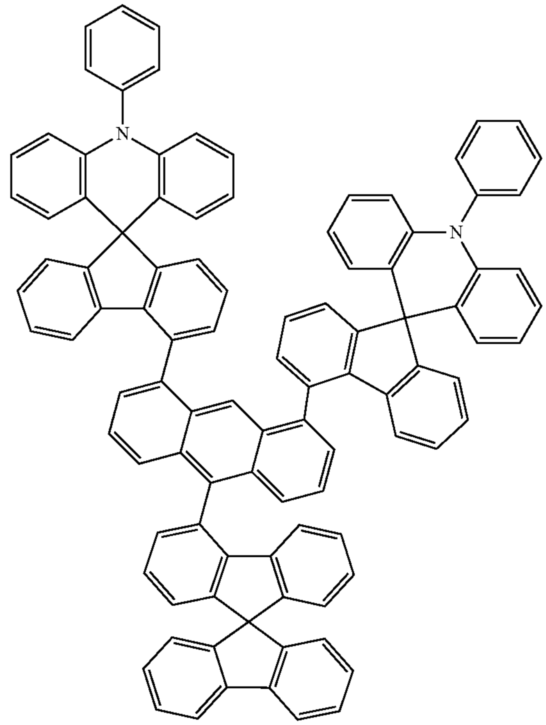
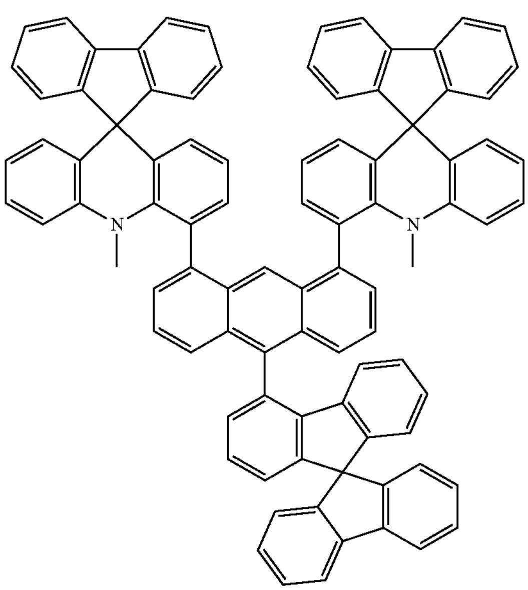
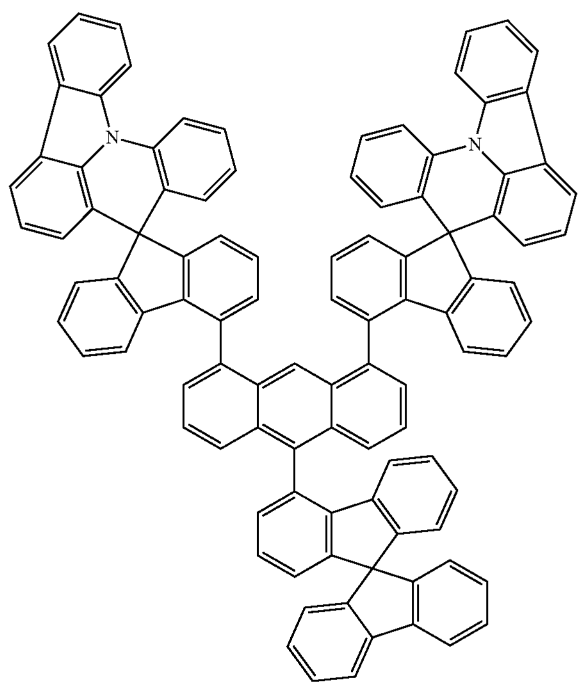

-continued
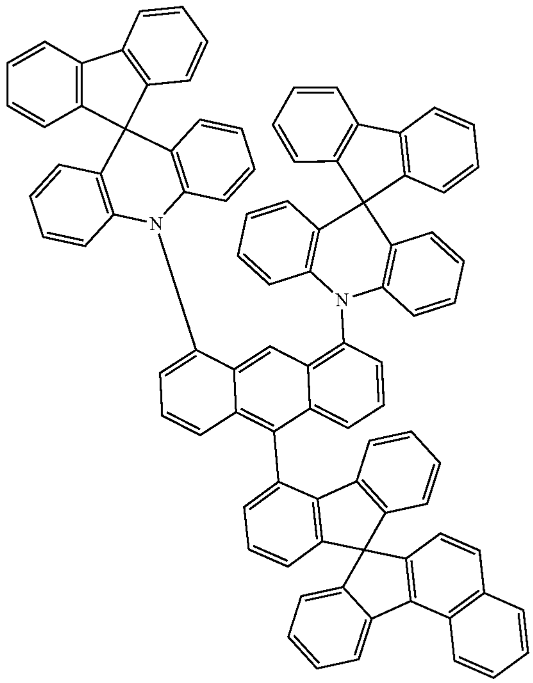
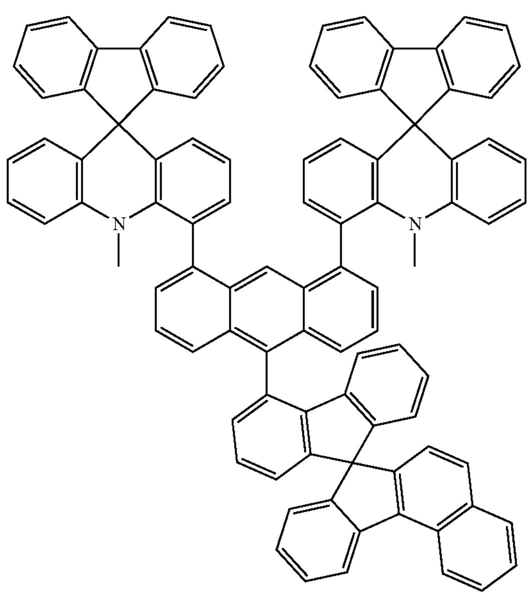
-continued
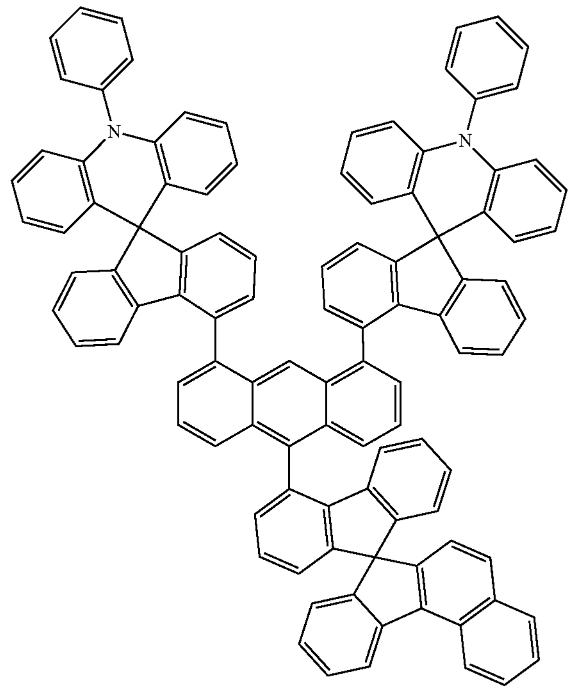
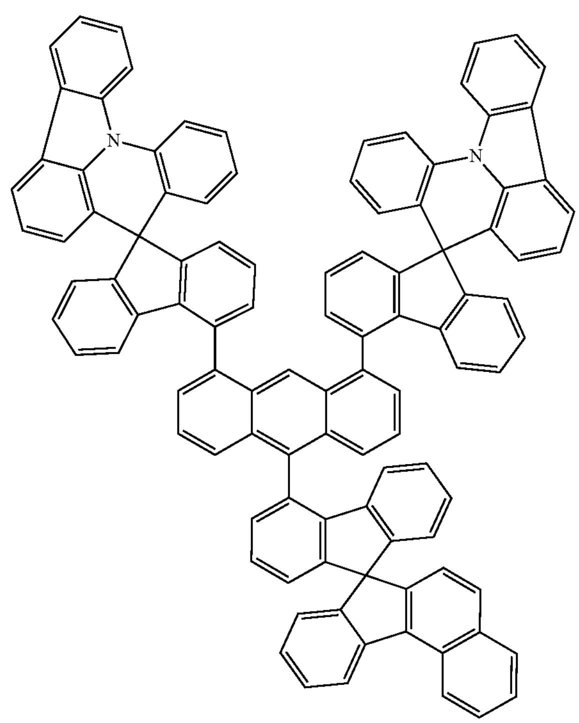

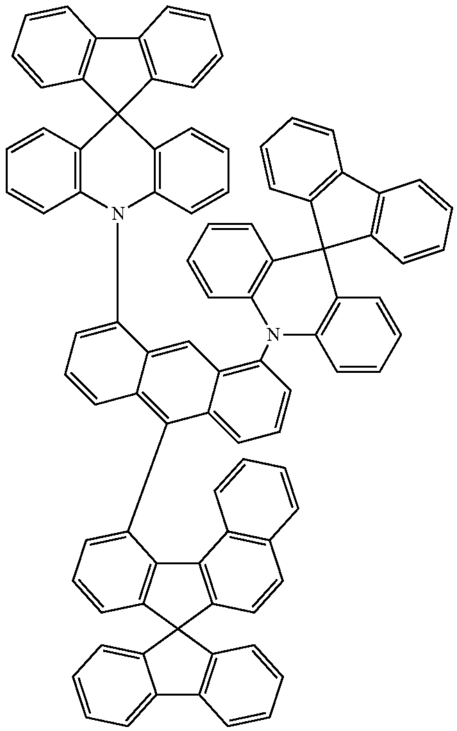
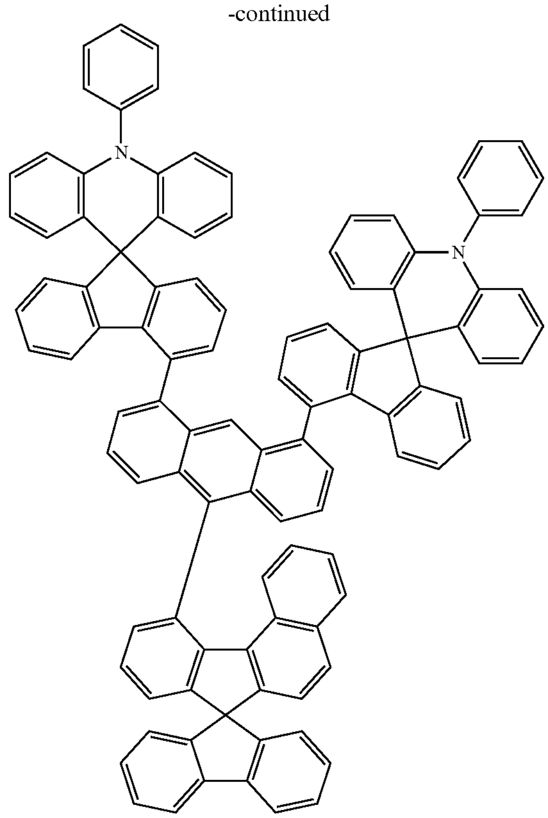
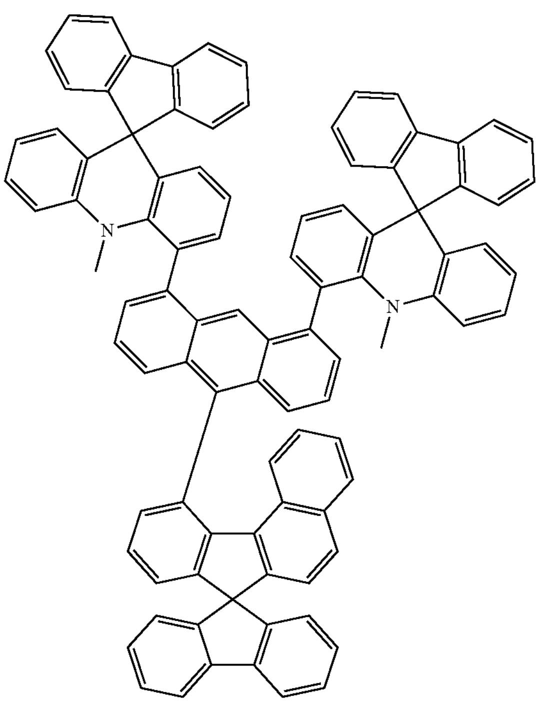
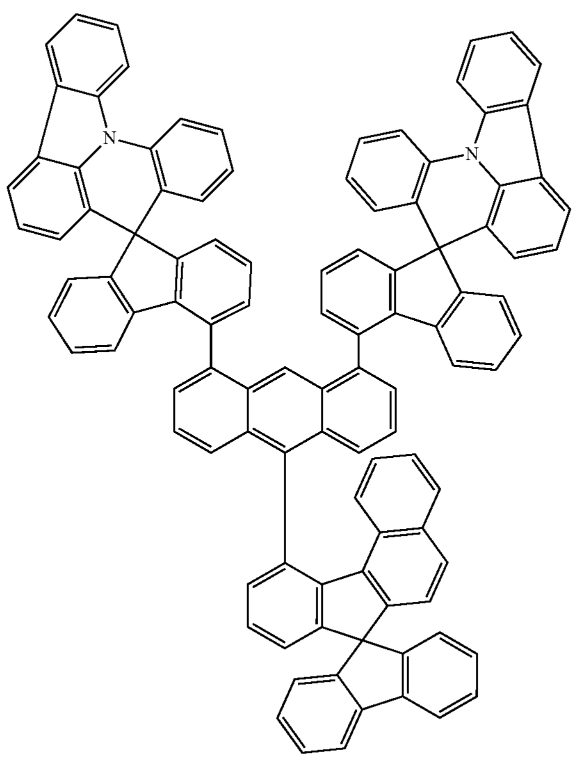
N

-continued
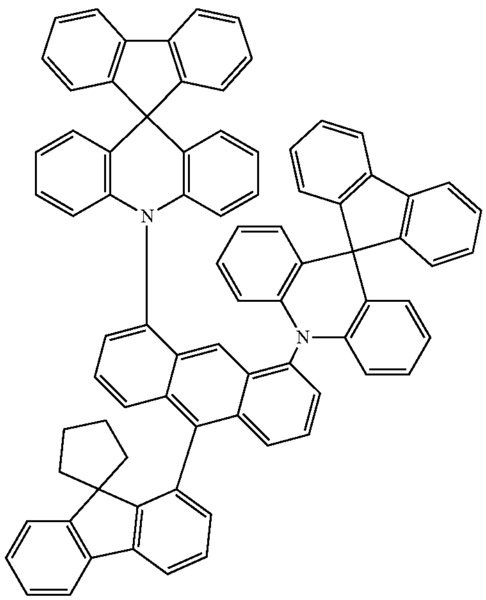
-continued
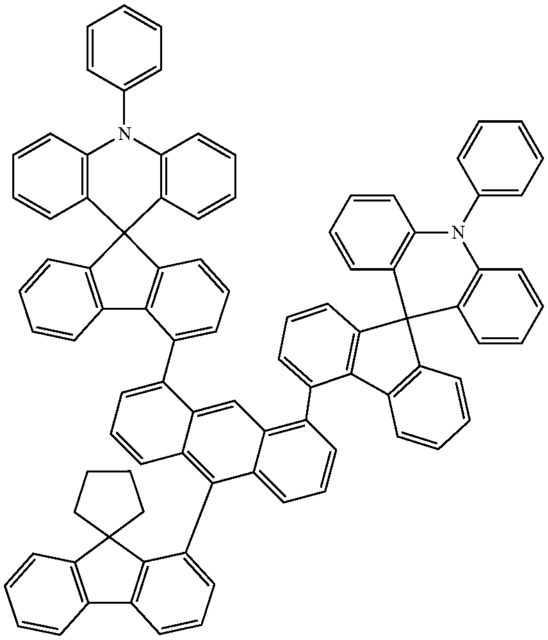
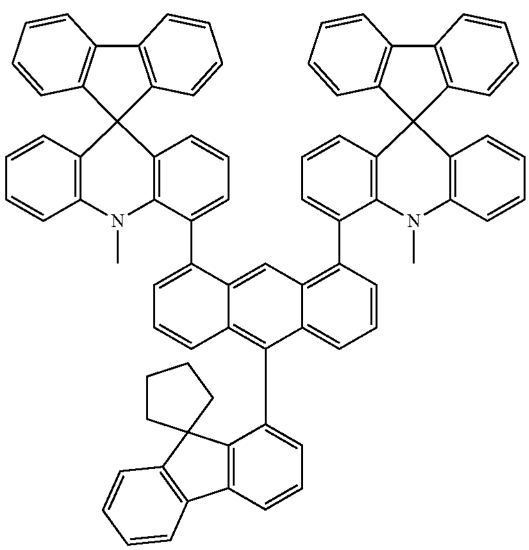
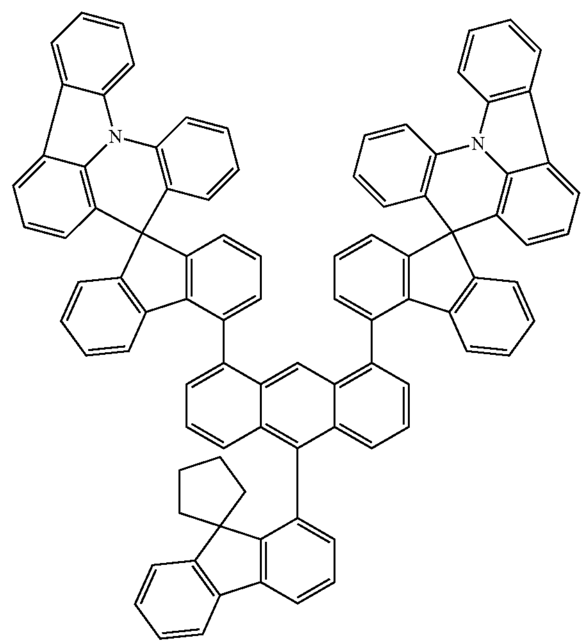

-continued
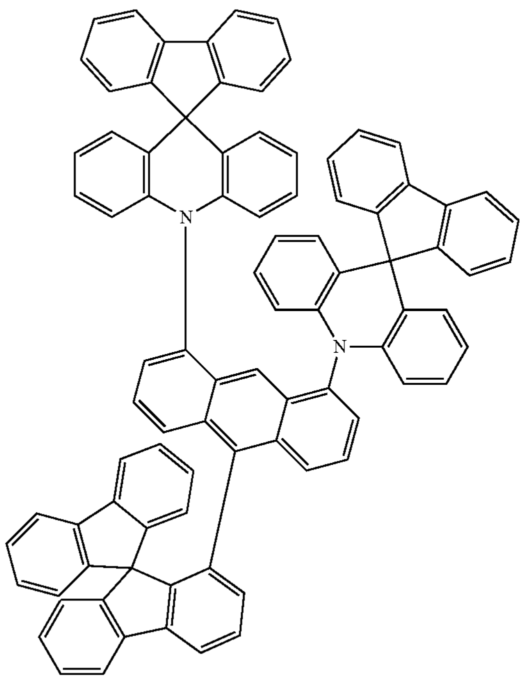
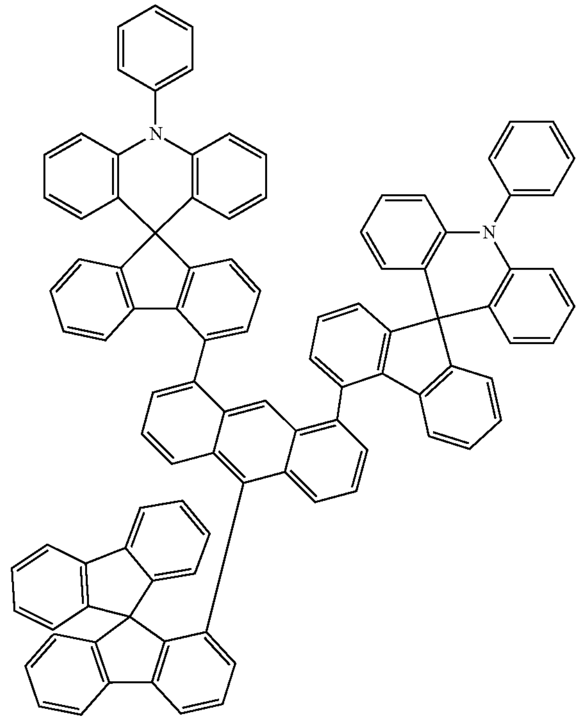
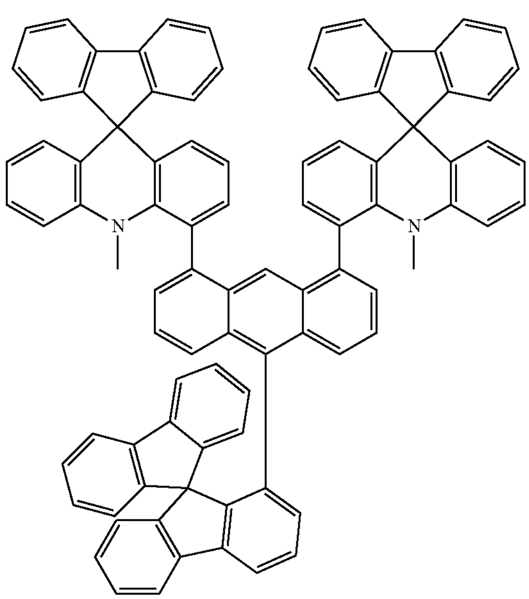
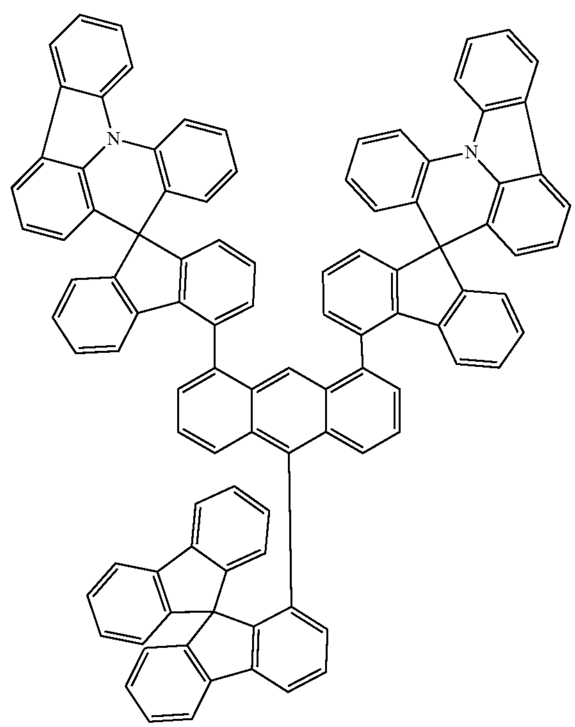
-continued

-continued
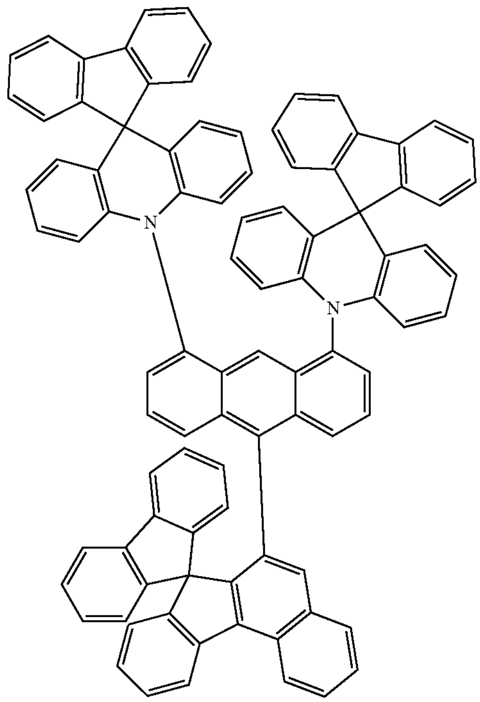
-continued
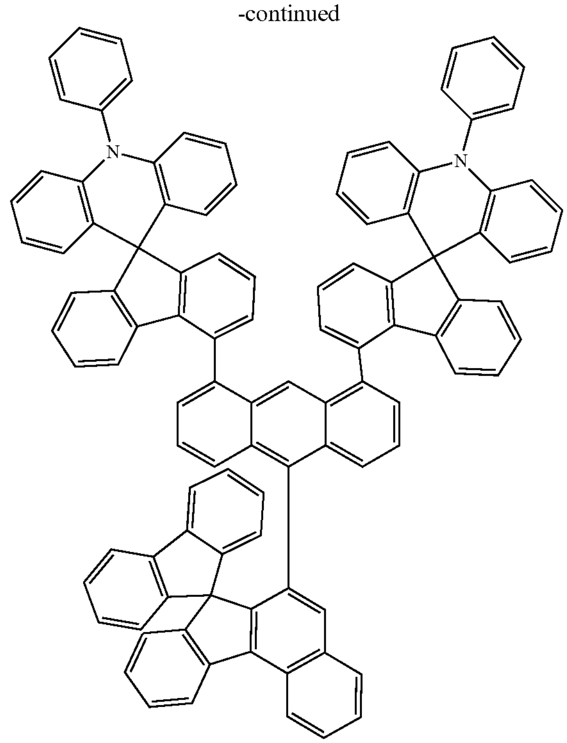
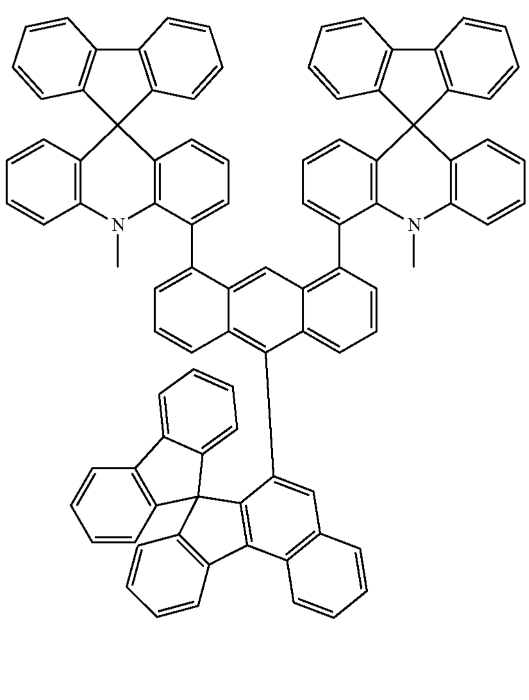
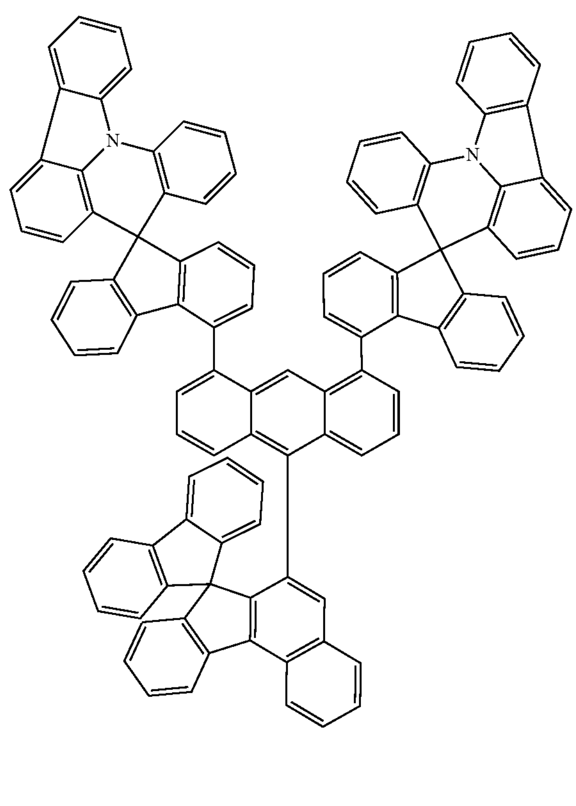

-continued
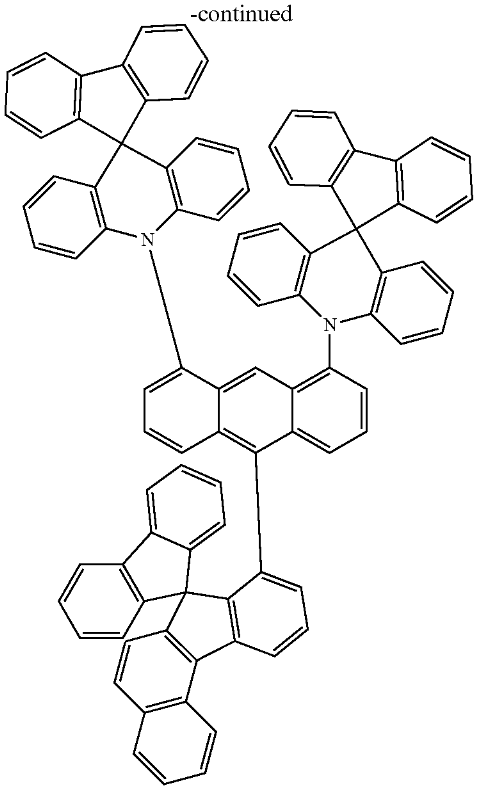
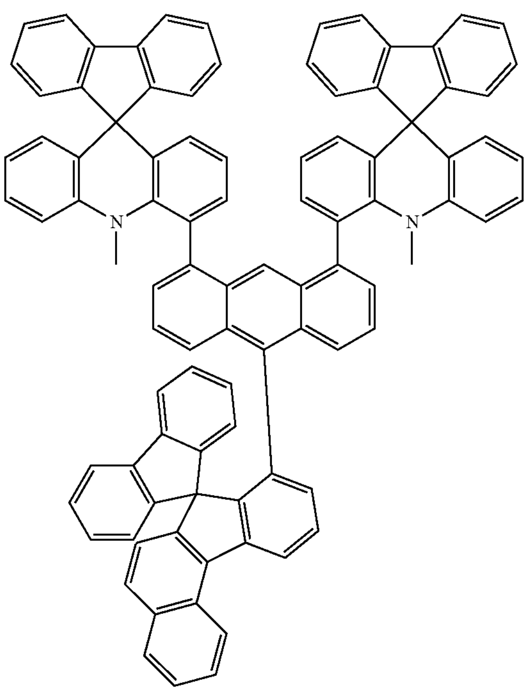
-continued
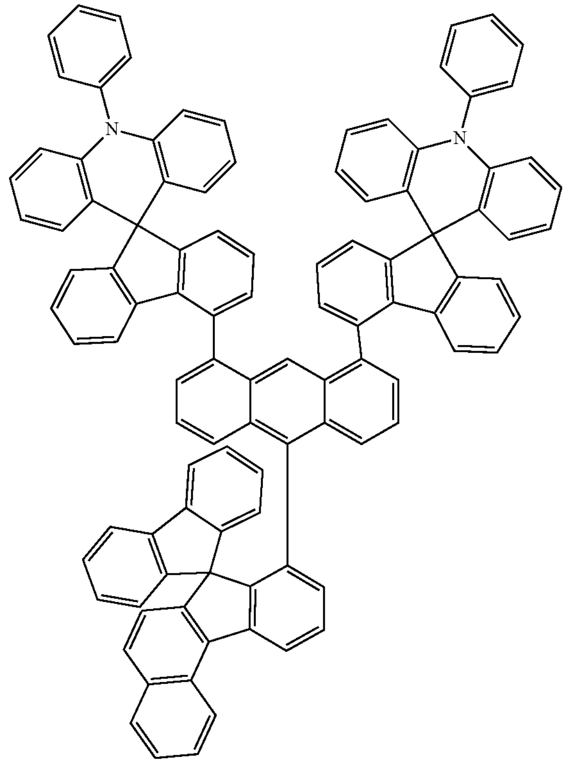
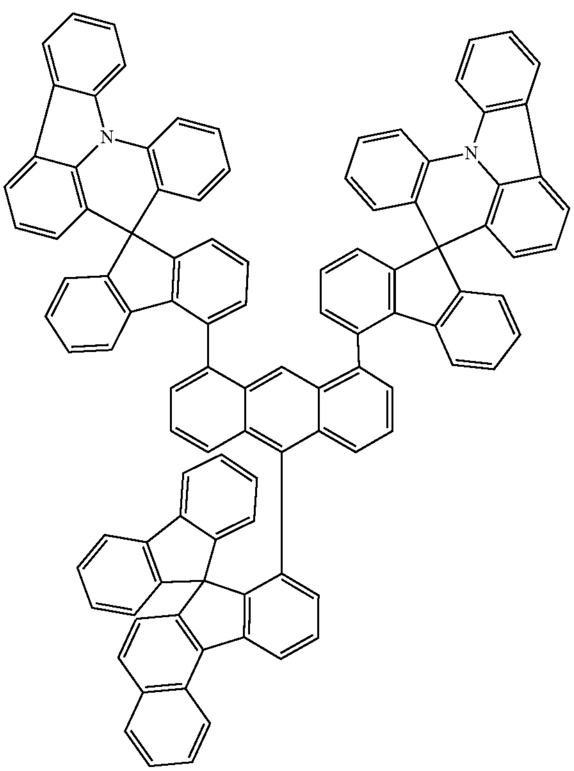

-continued
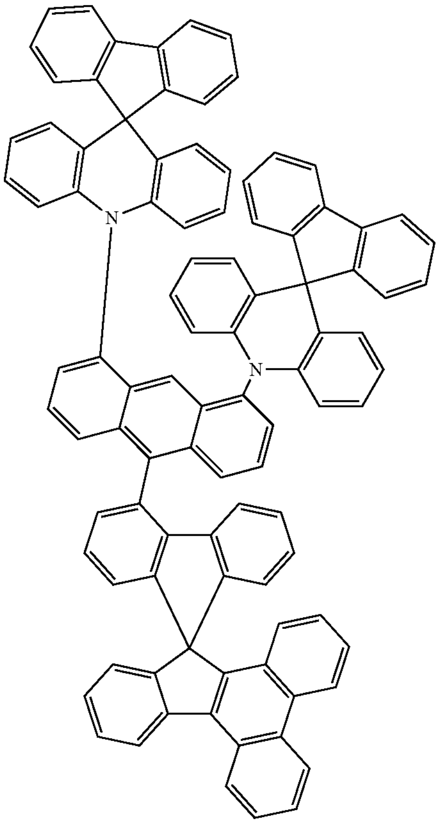
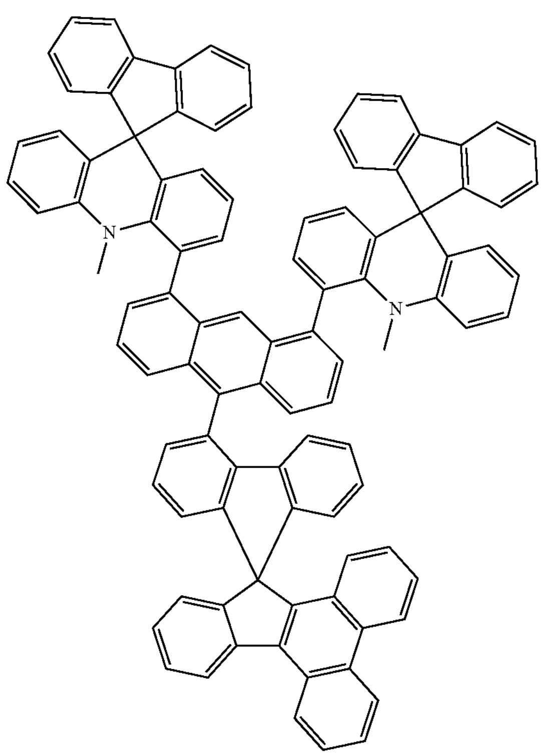
-continued
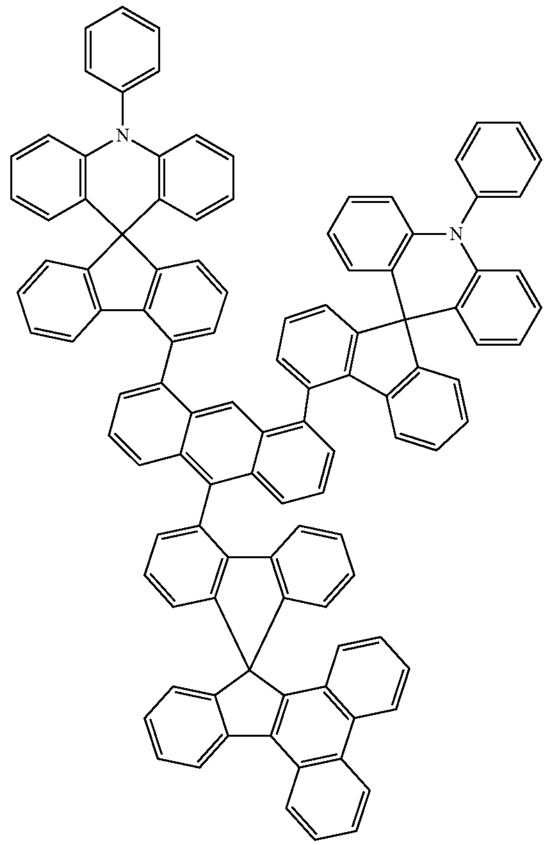
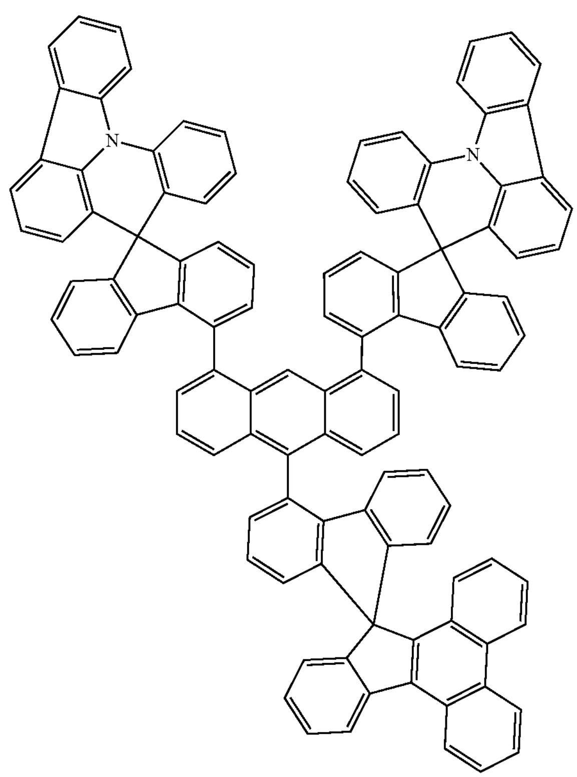

-continued
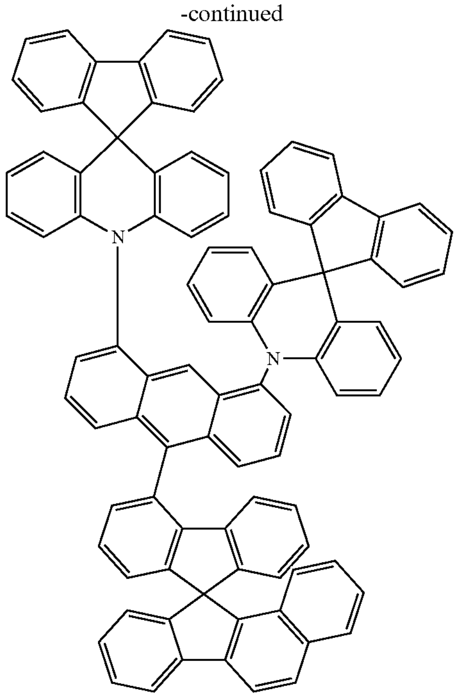
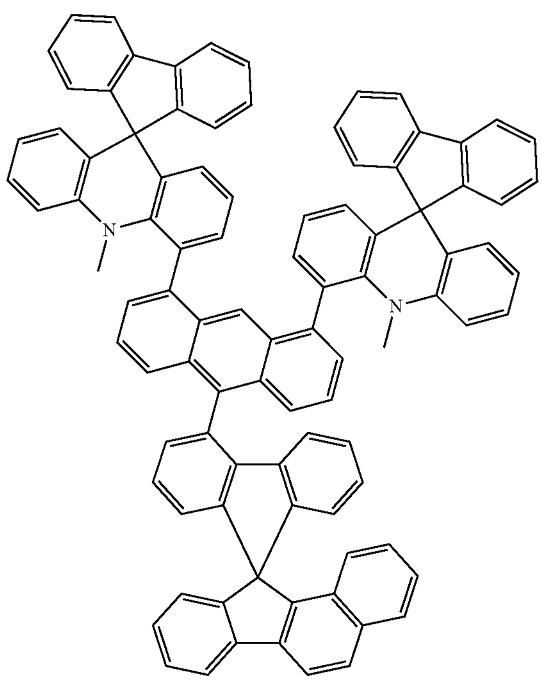
-continued
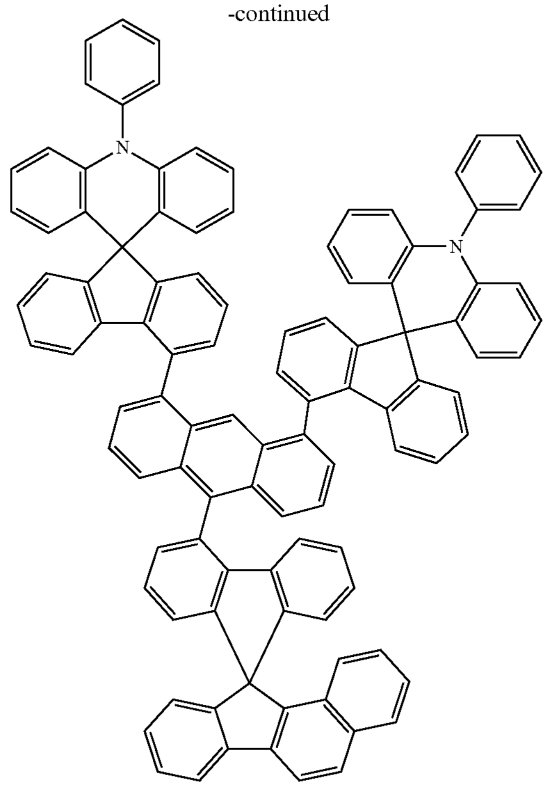
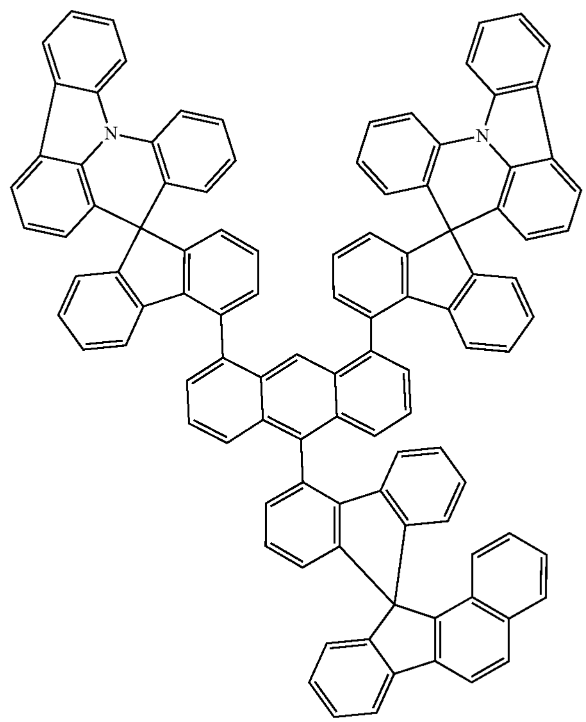

-continued
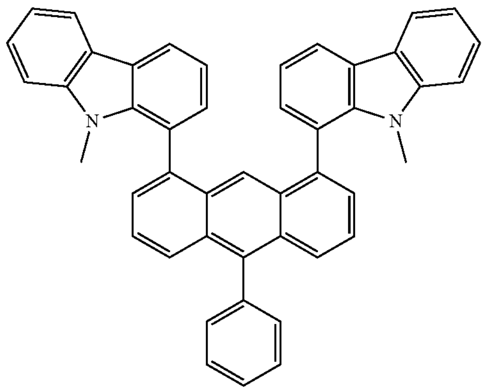
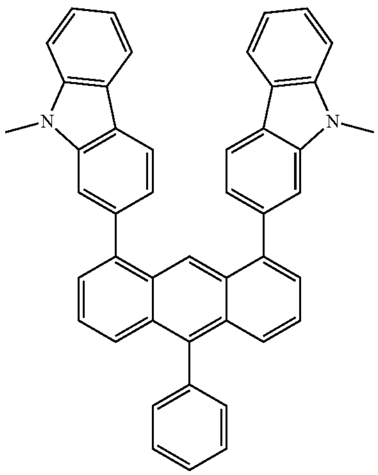
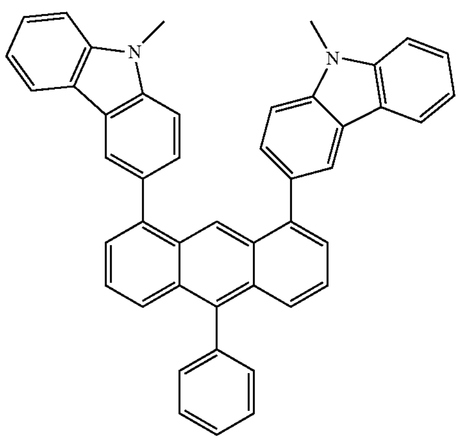
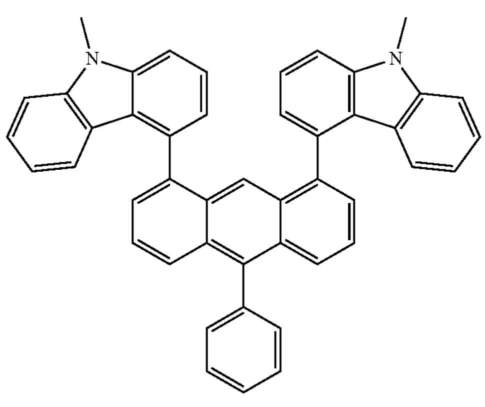
-continued
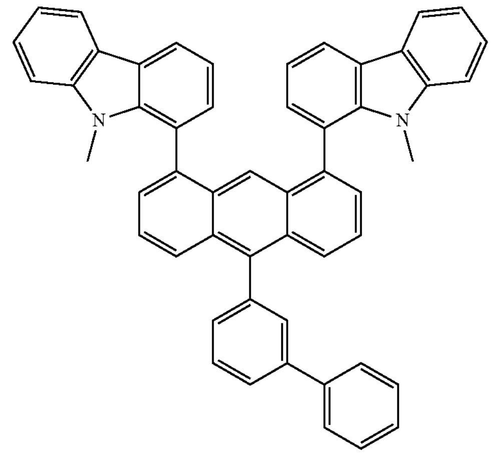
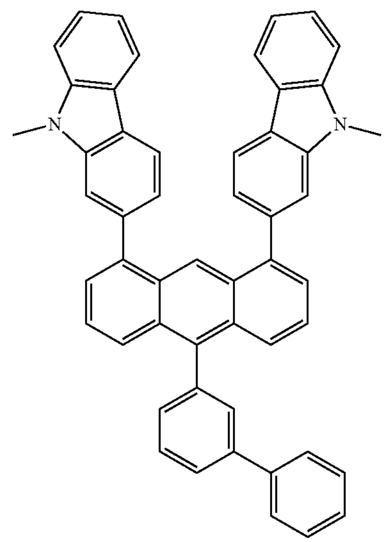
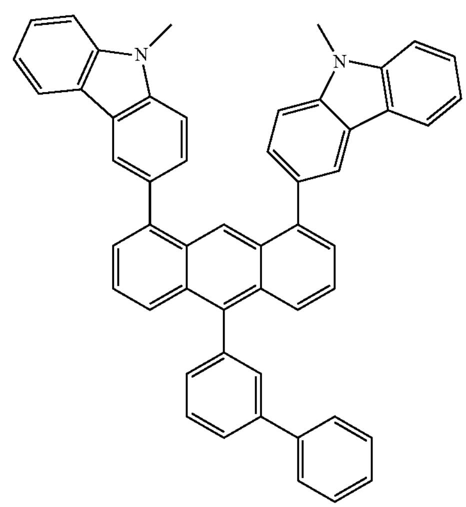

-continued
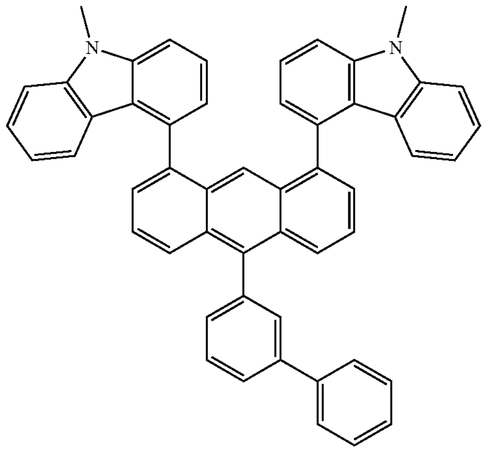
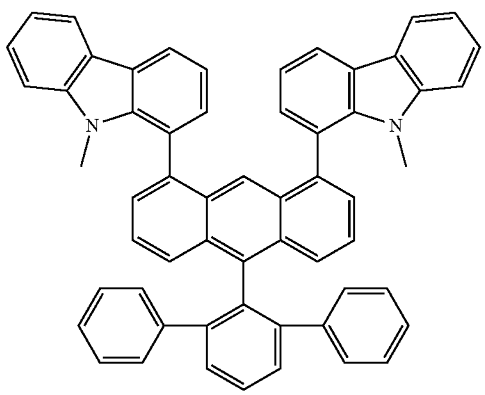
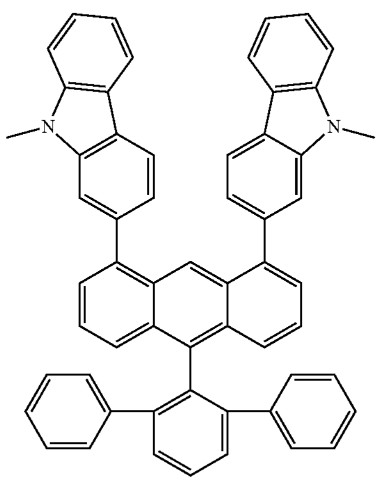
-continued
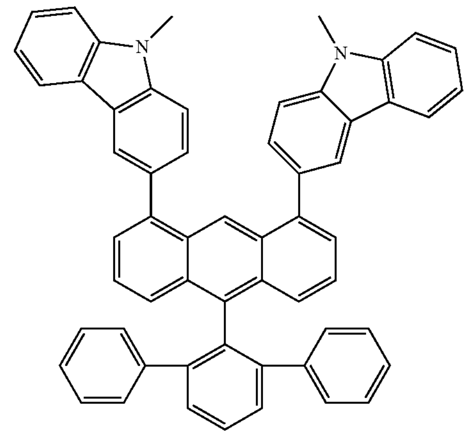
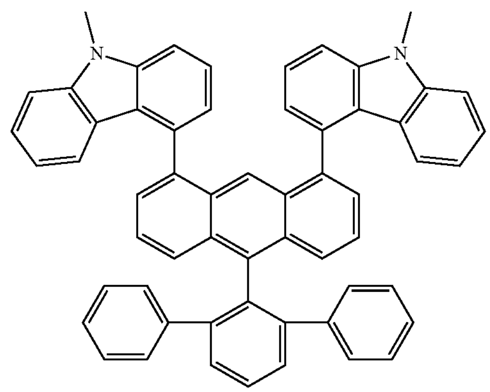
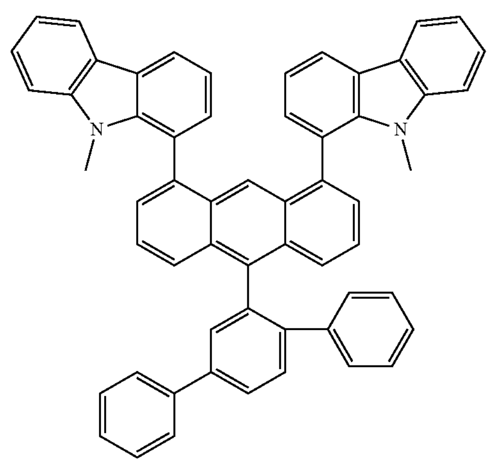

-continued
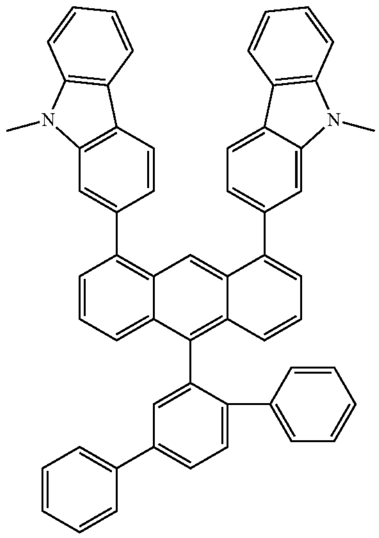
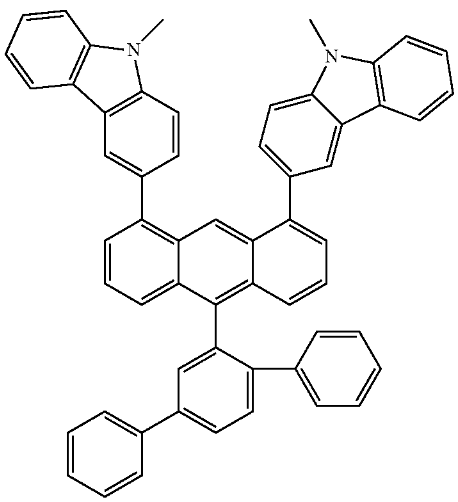
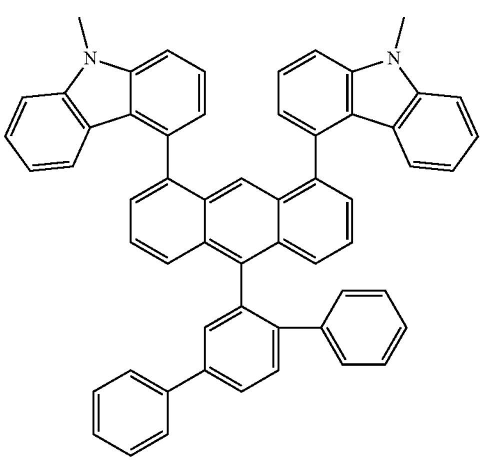
-continued
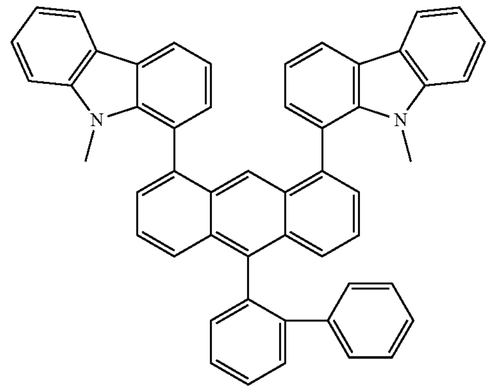
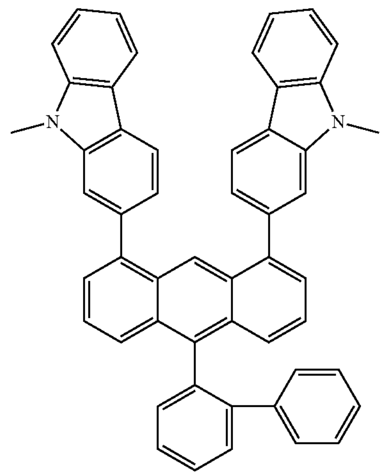
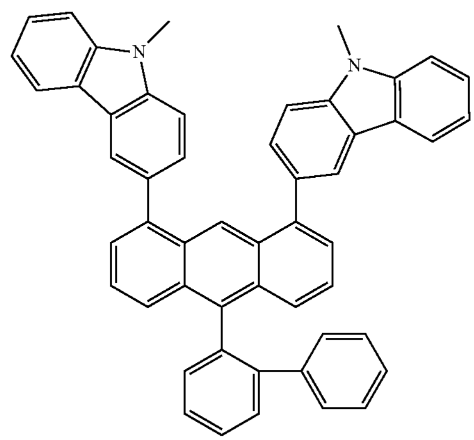
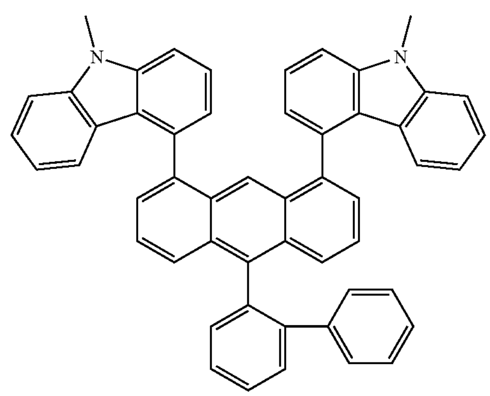

-continued
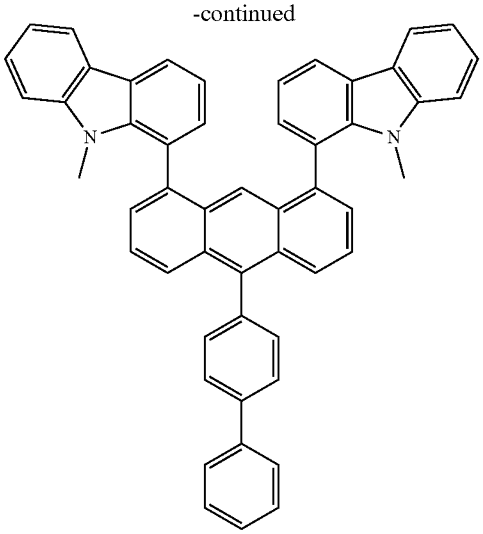
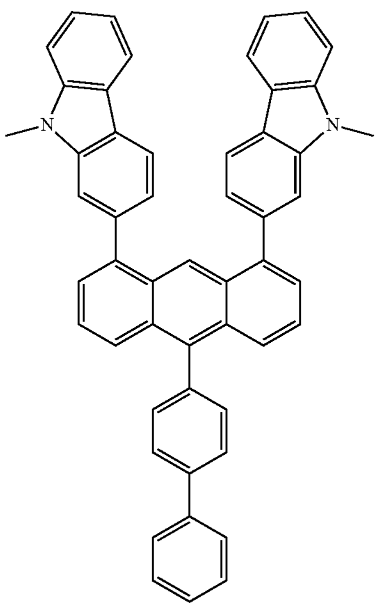
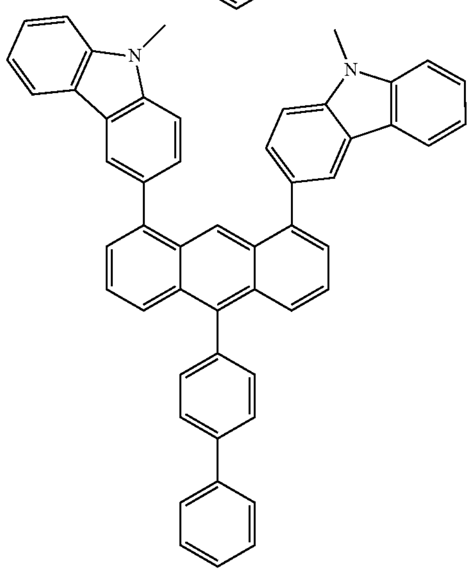
-continued
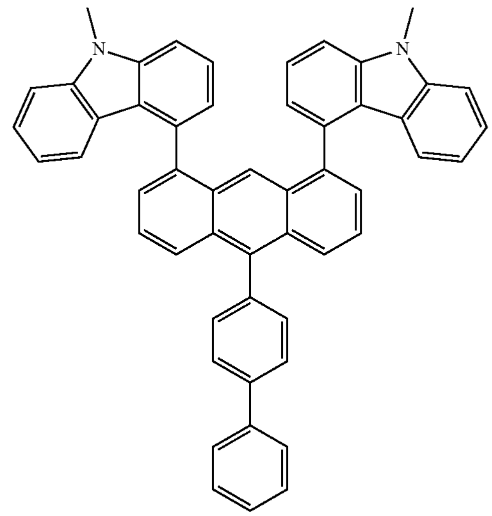
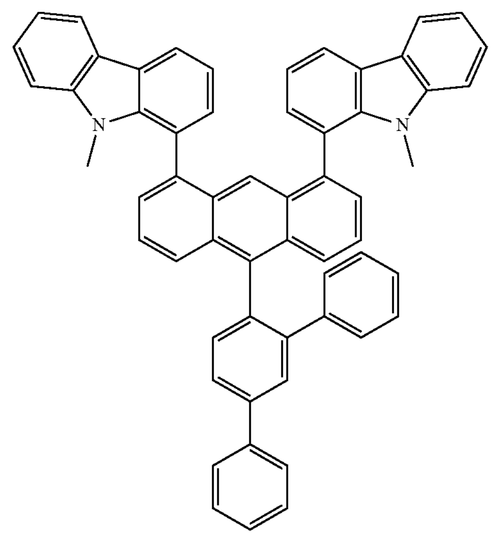
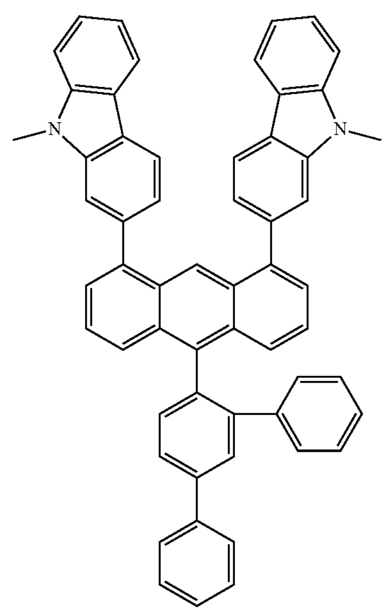

-continued
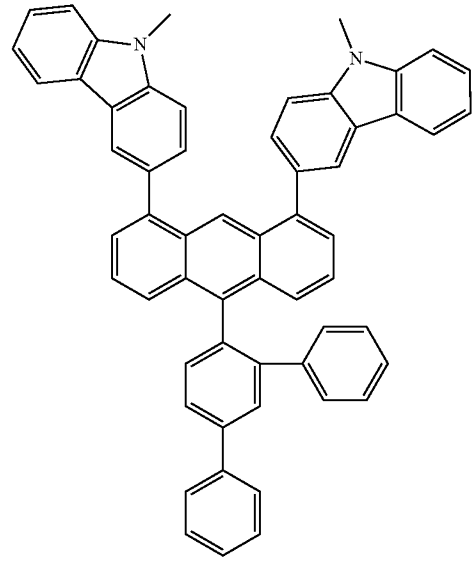
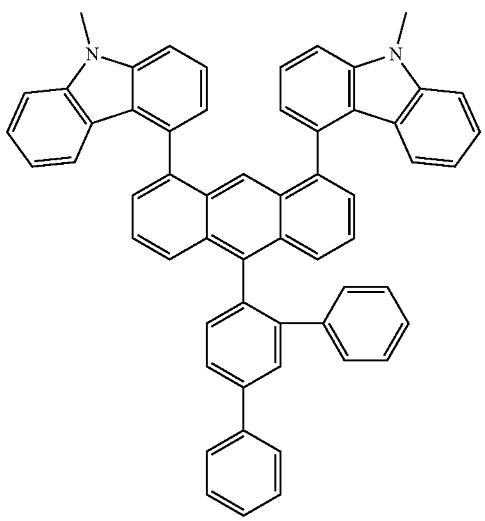
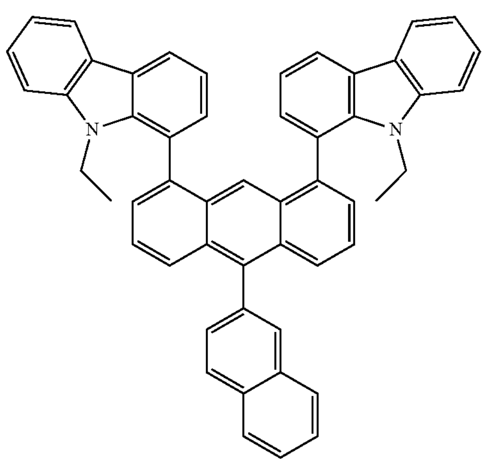
-continued
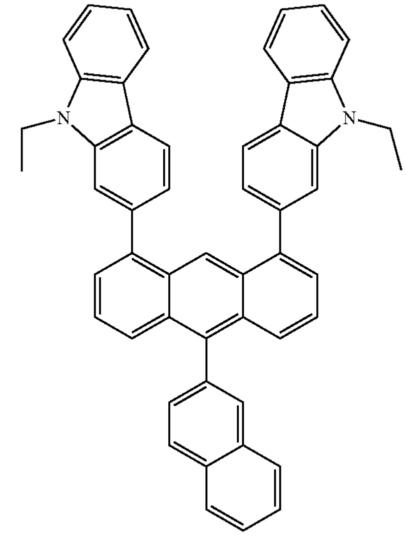
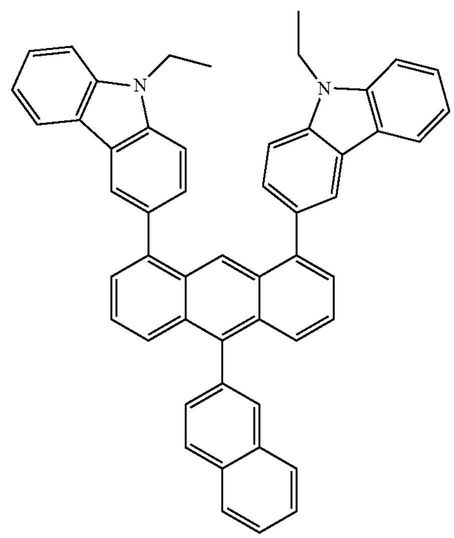
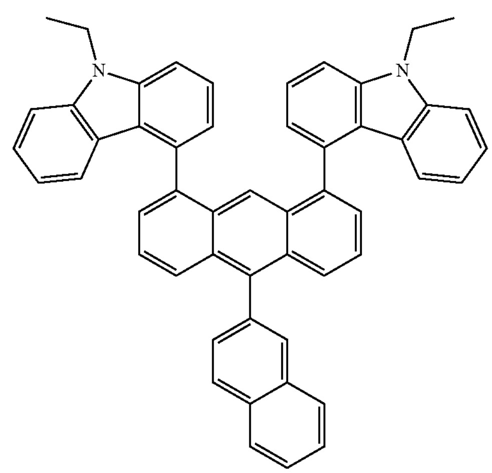

-continued
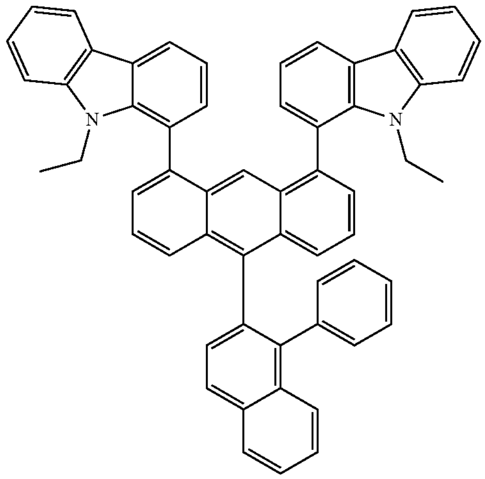
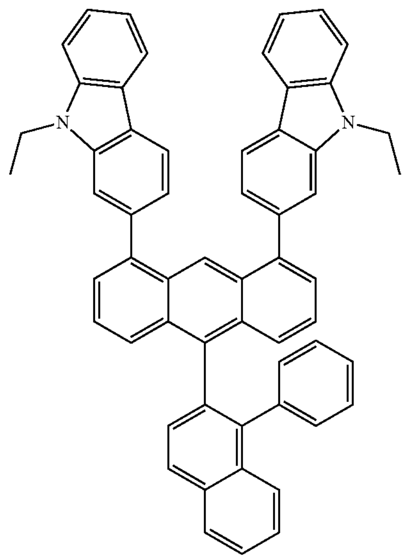
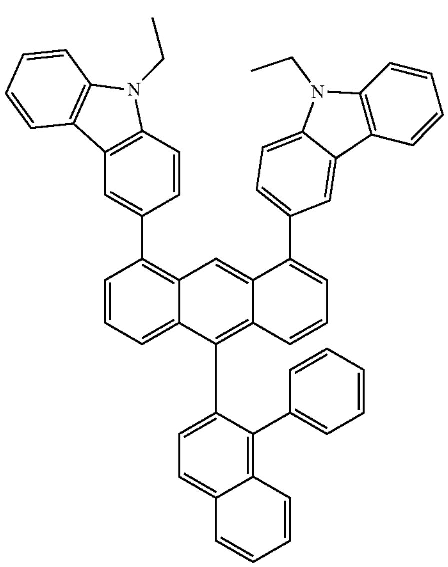
-continued
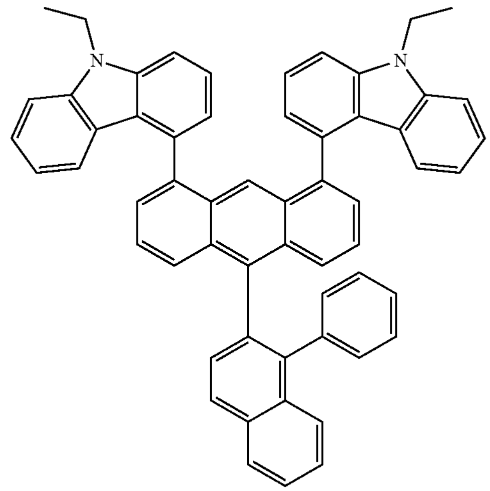
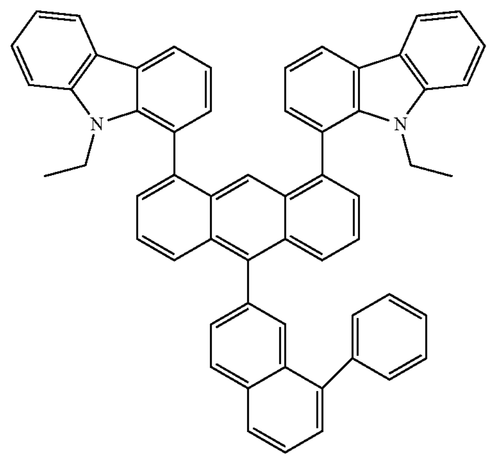
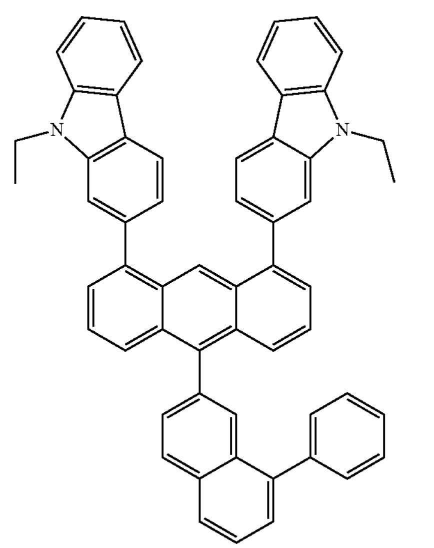

-continued
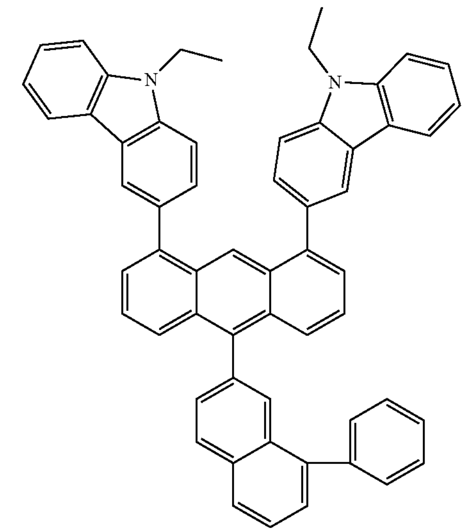
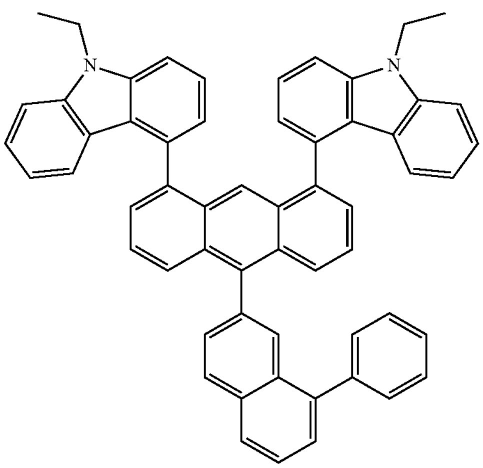
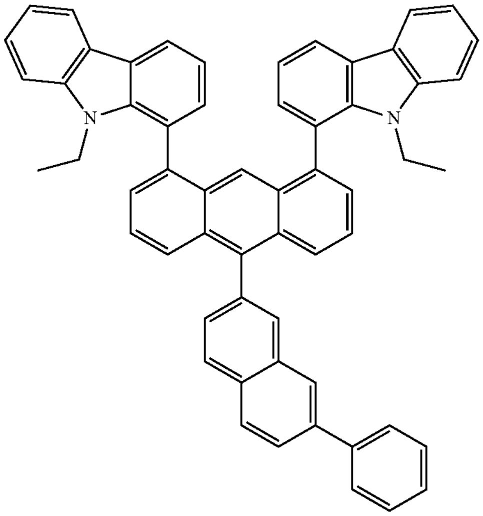
-continued
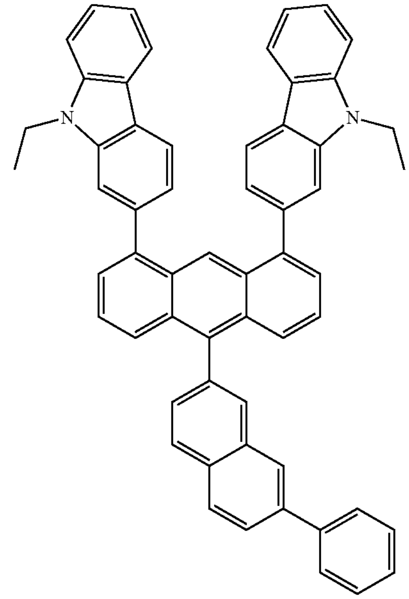
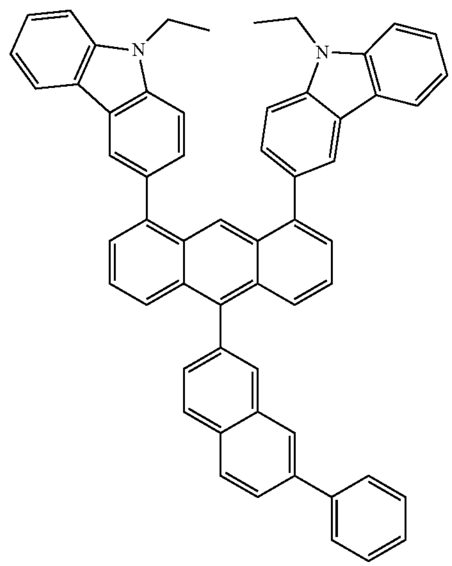
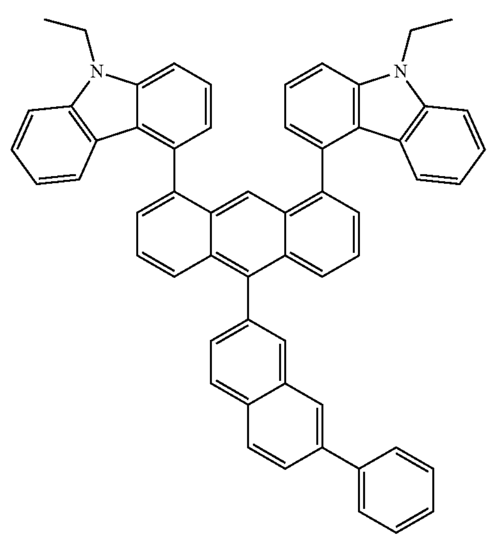

-continued
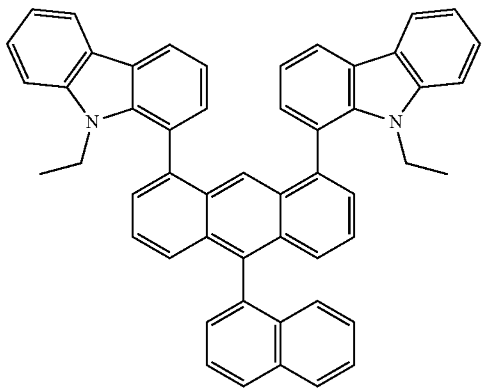
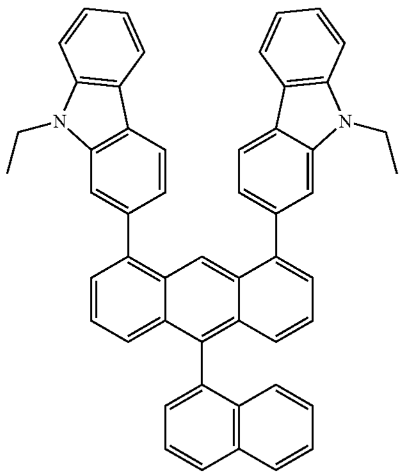
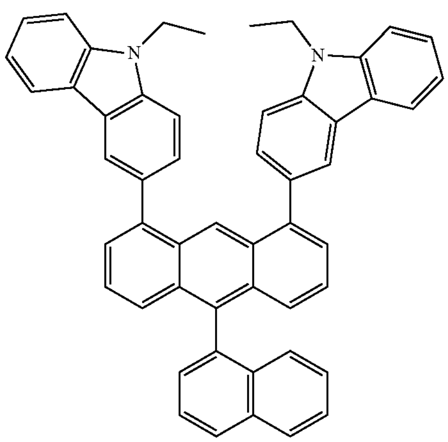
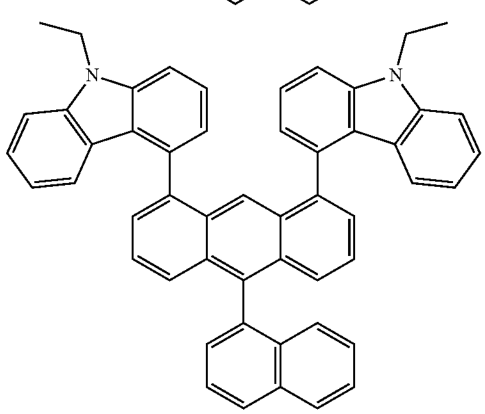
-continued
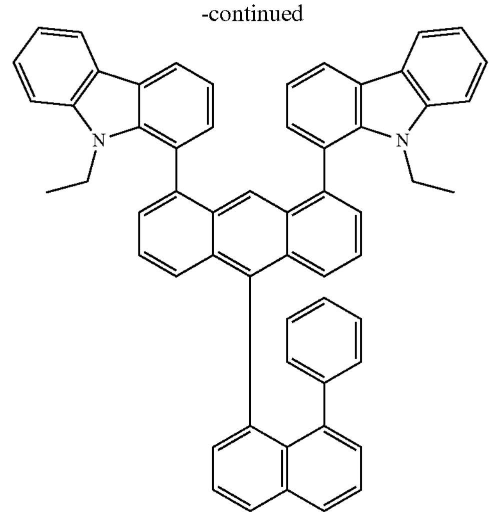
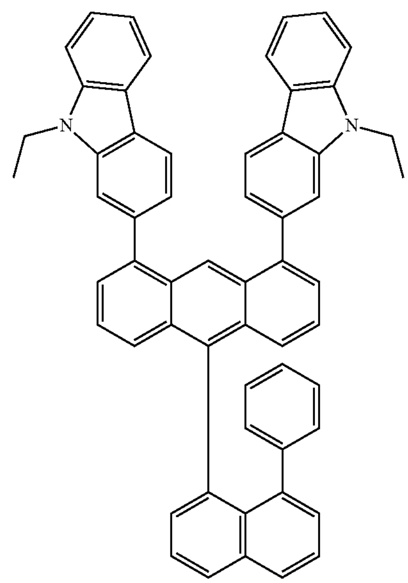
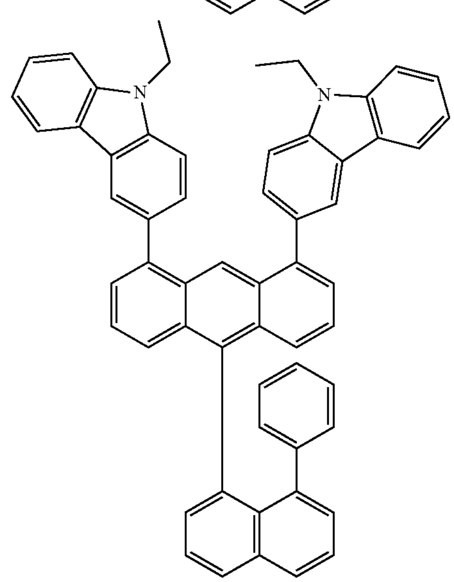

-continued
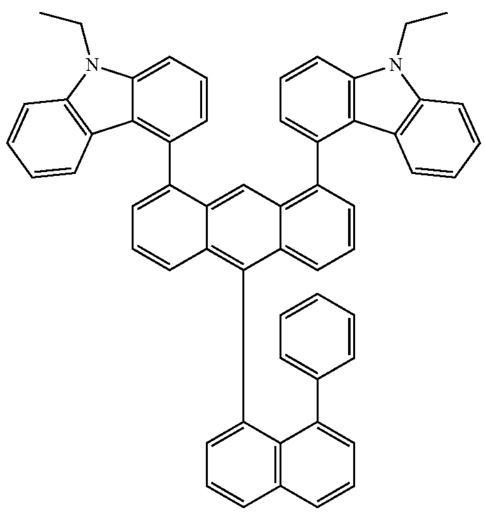
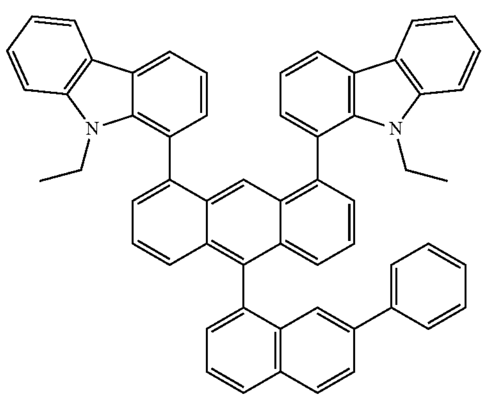
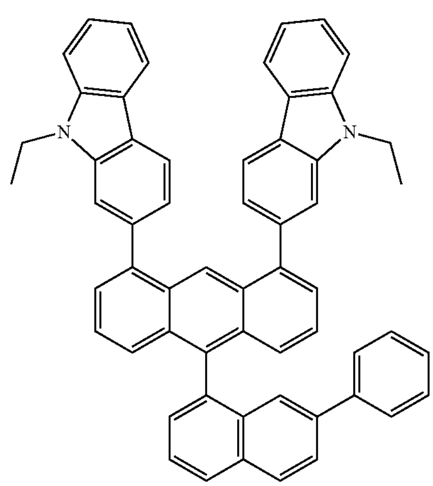
-continued
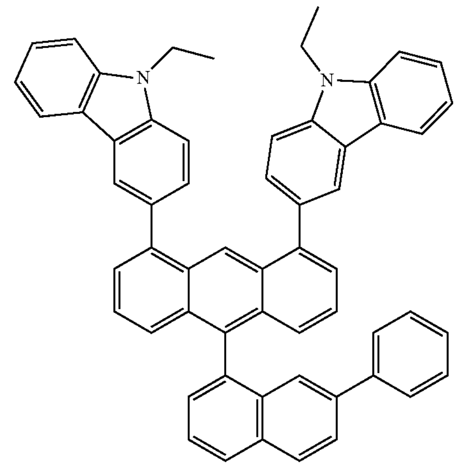
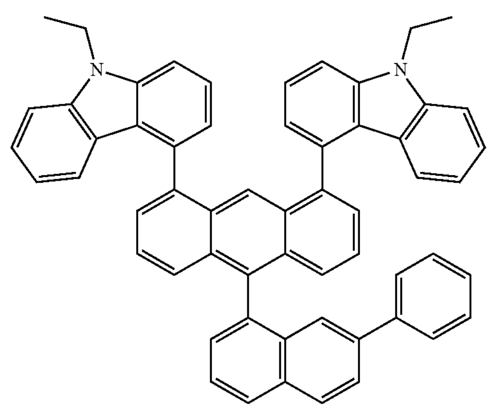
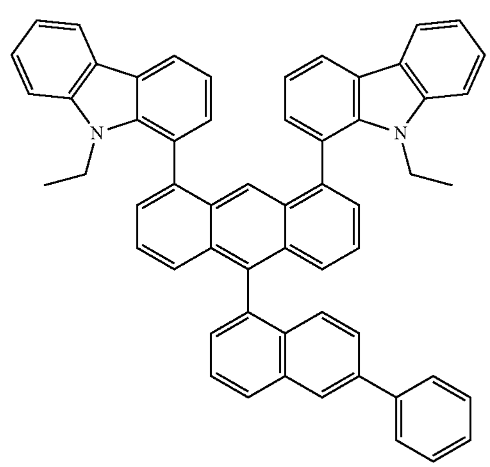

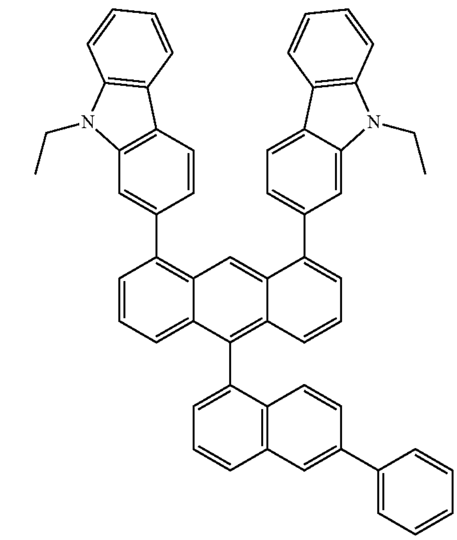
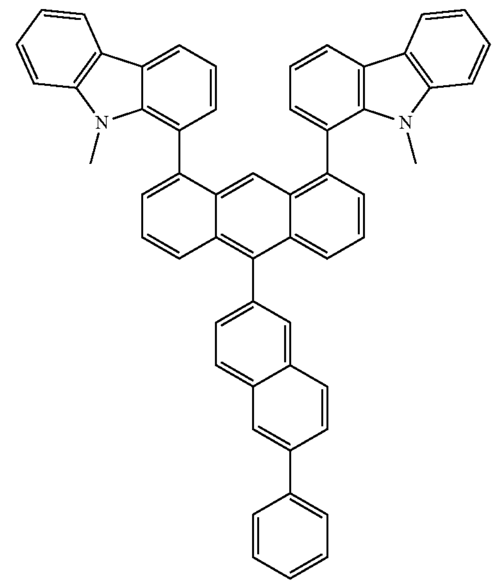
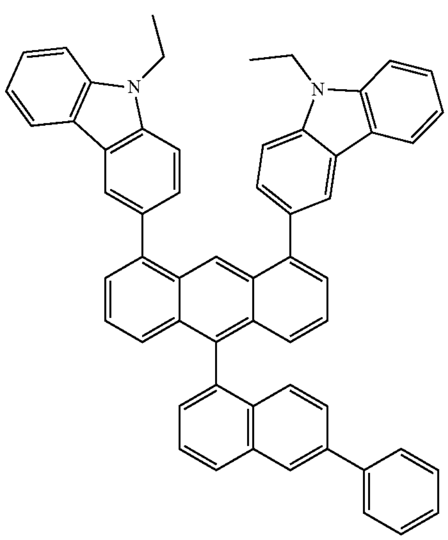
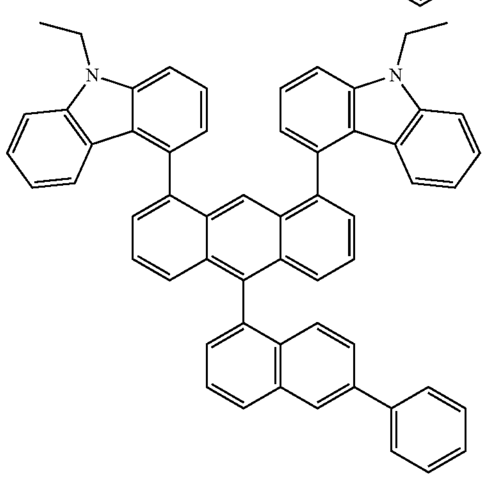
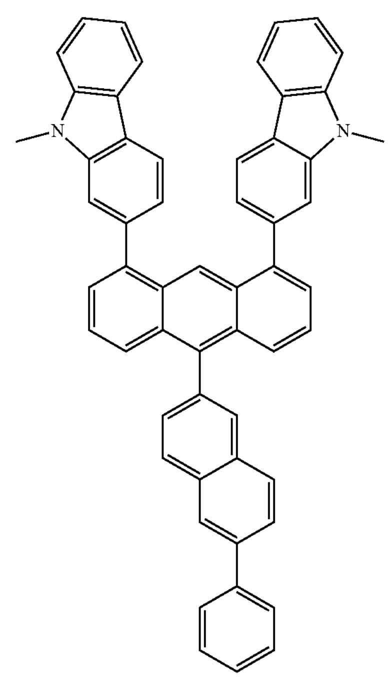
N
N

-continued
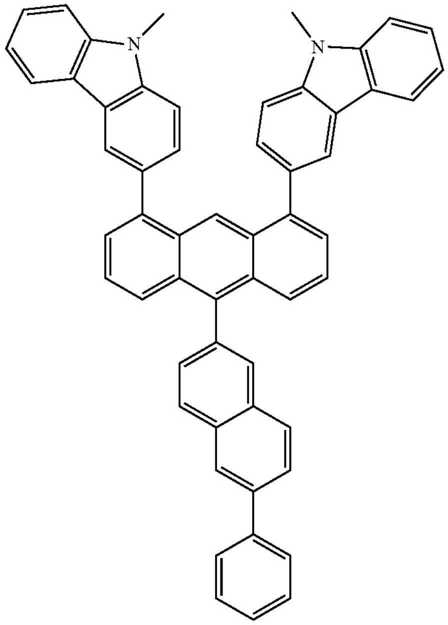
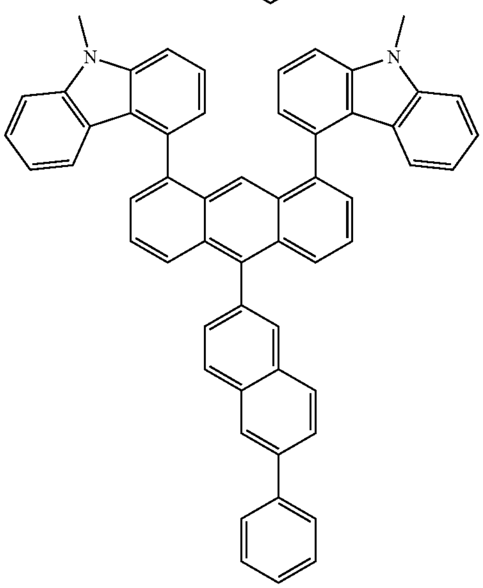
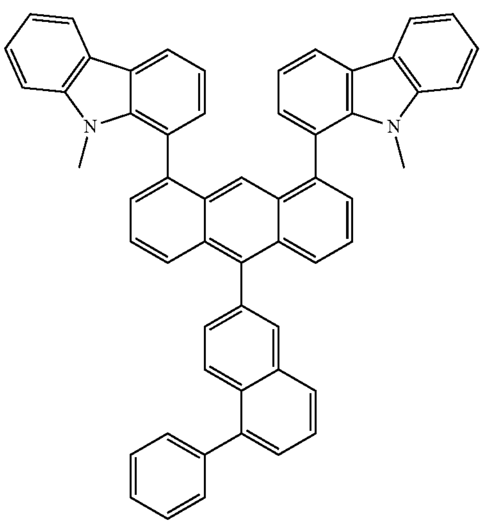
-continued
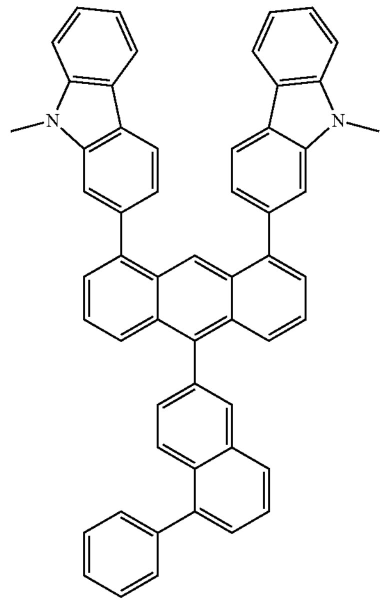
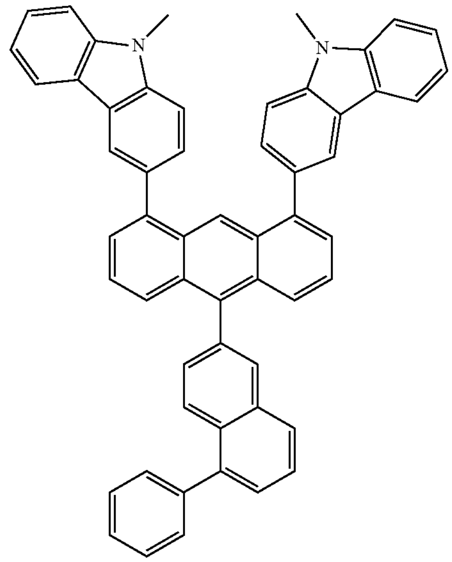
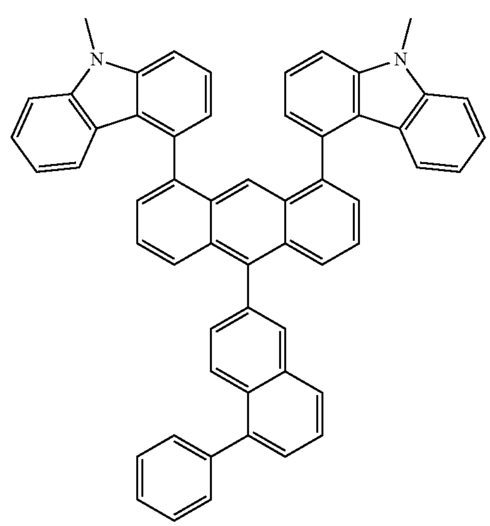

-continued
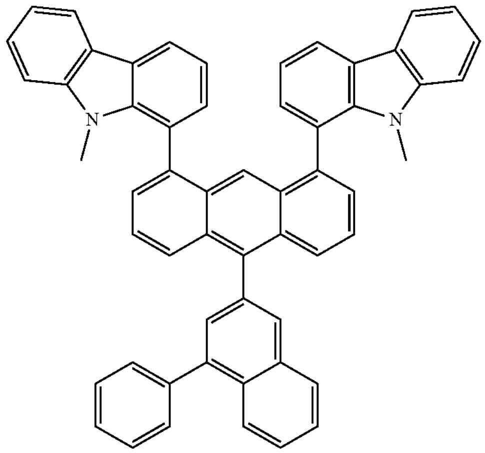
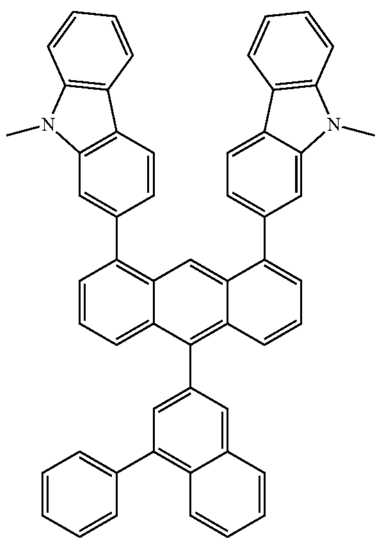
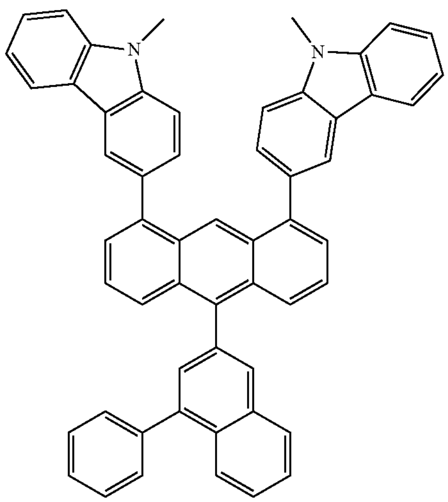
-continued
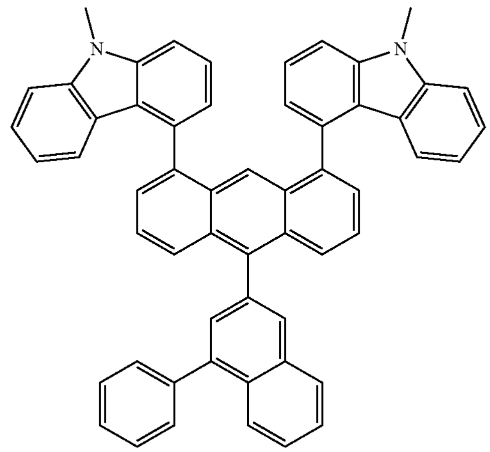
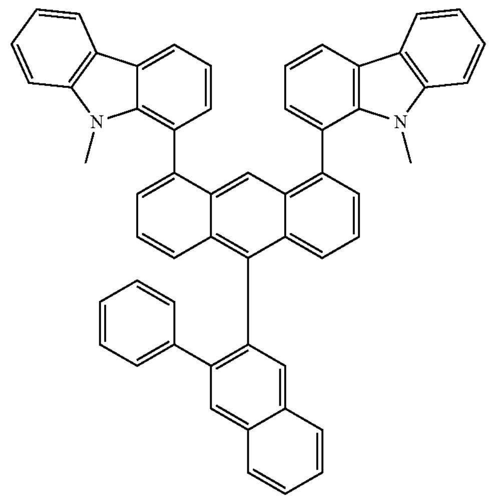
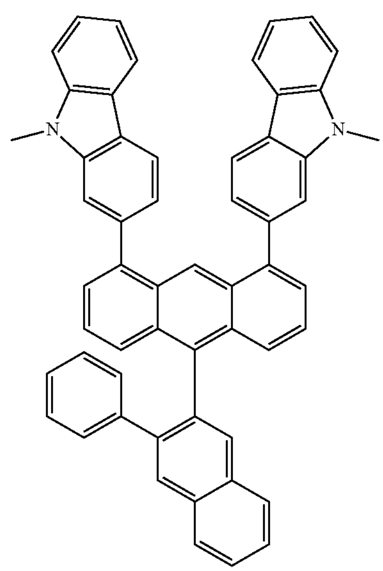

-continued
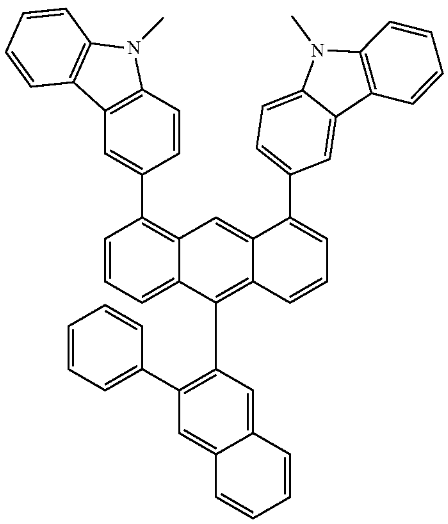
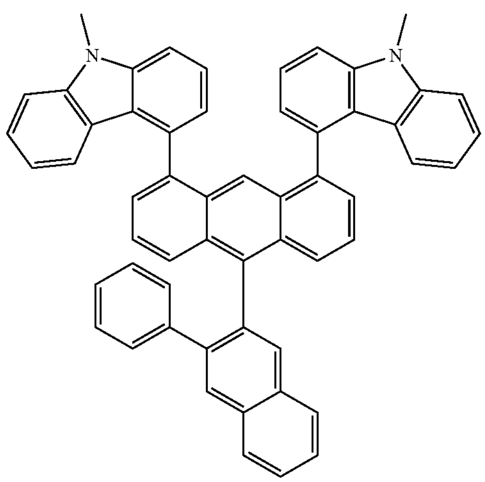
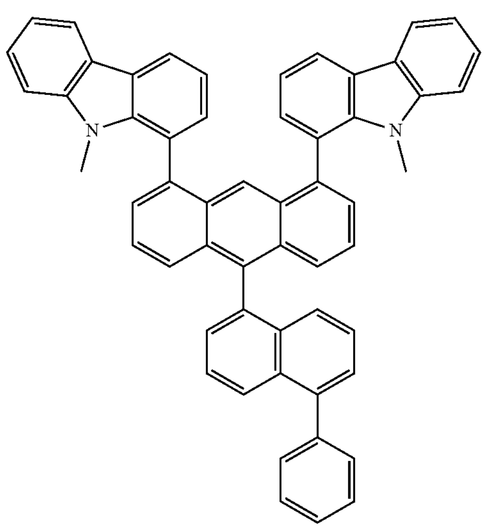
-continued
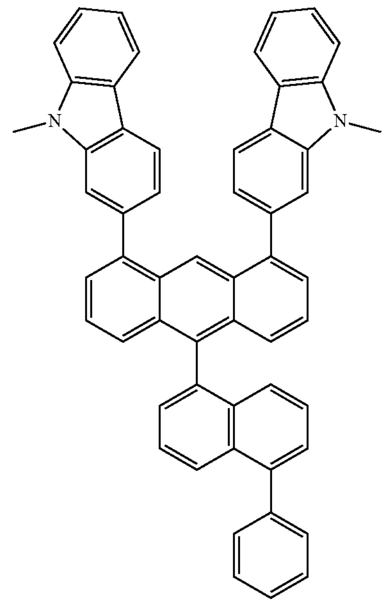
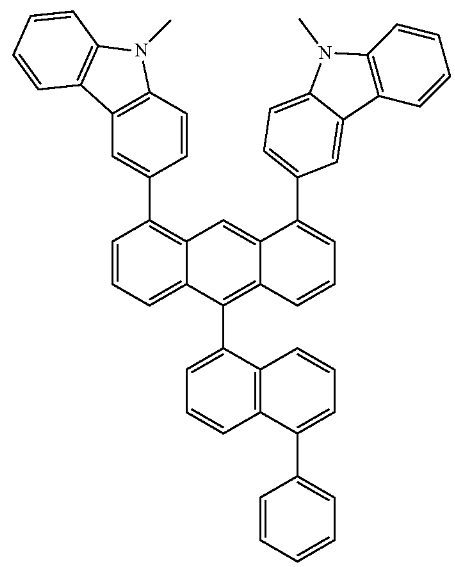
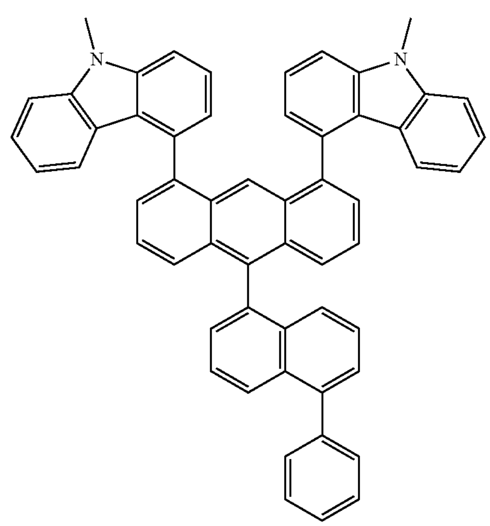

-continued
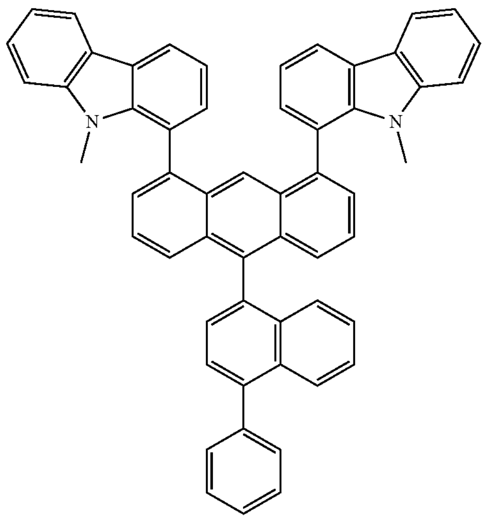
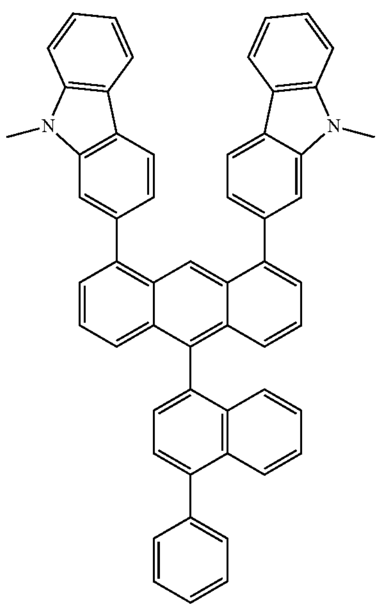
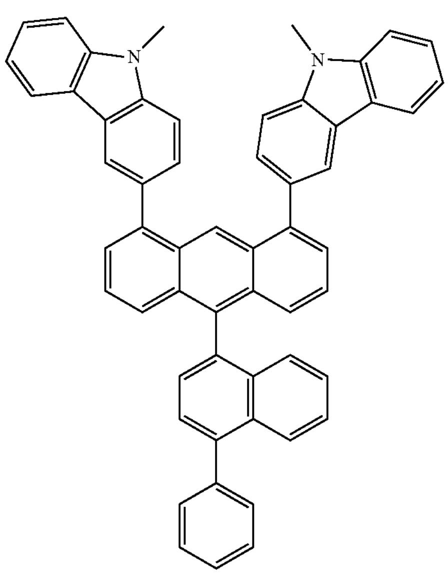
-continued
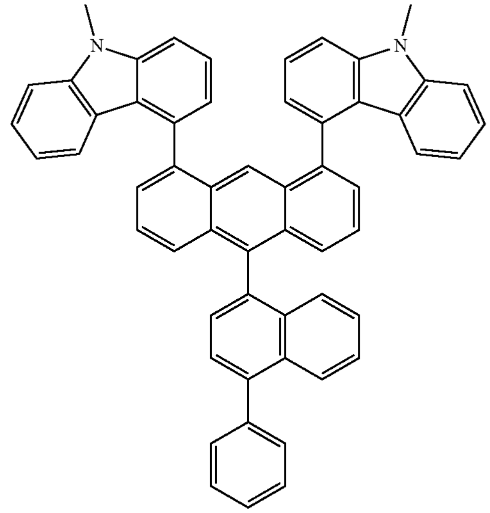
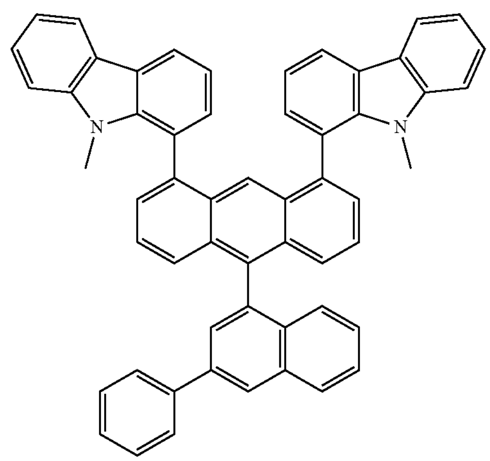
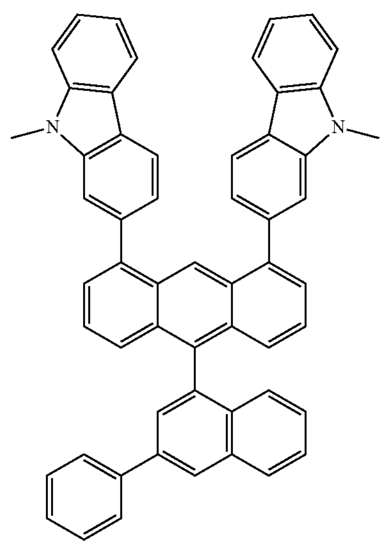

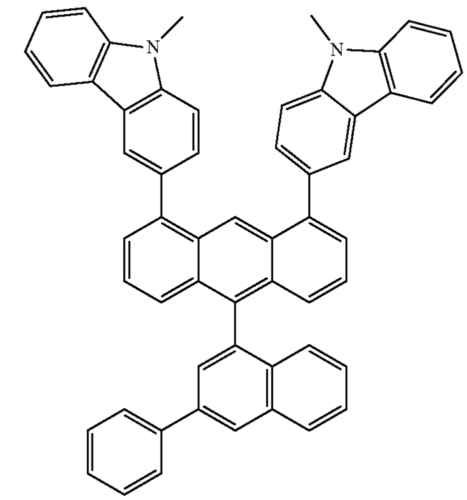
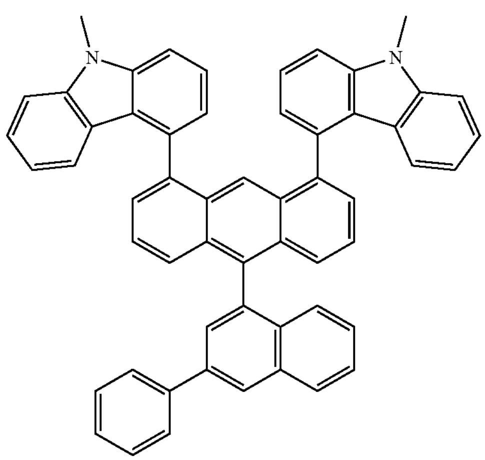
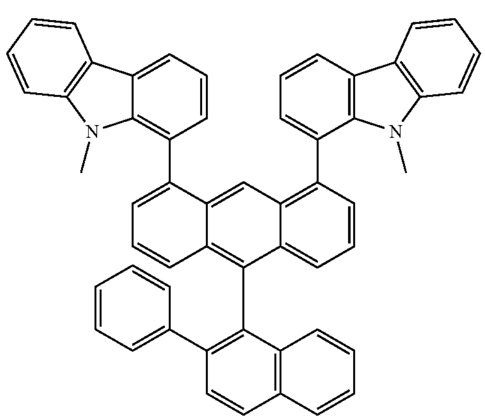
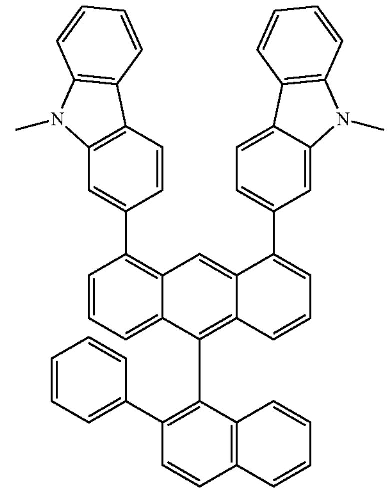
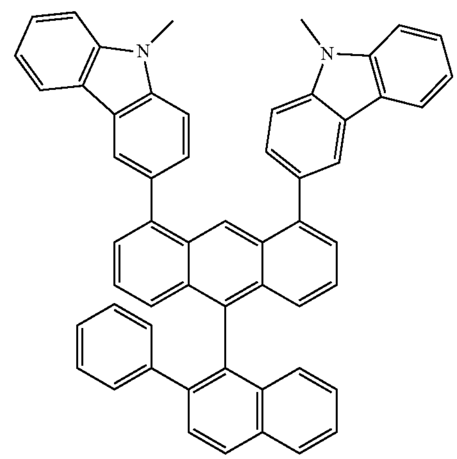
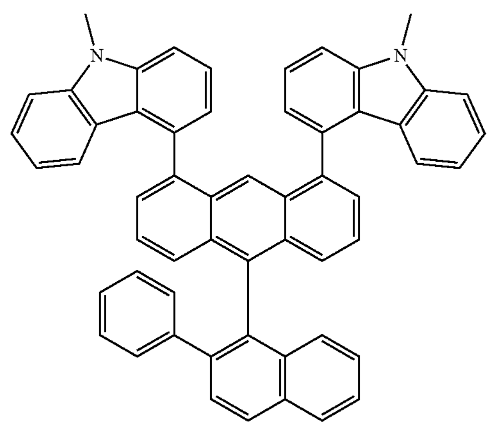

-continued
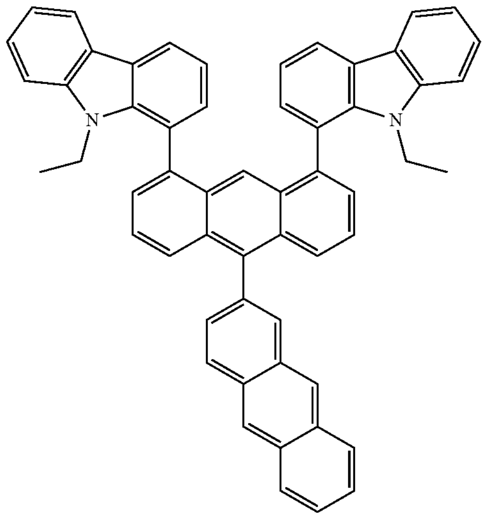
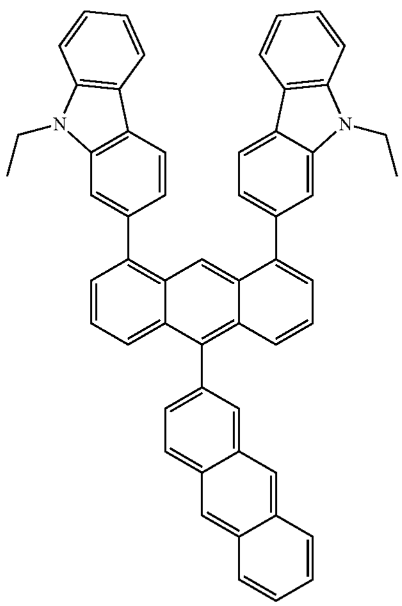
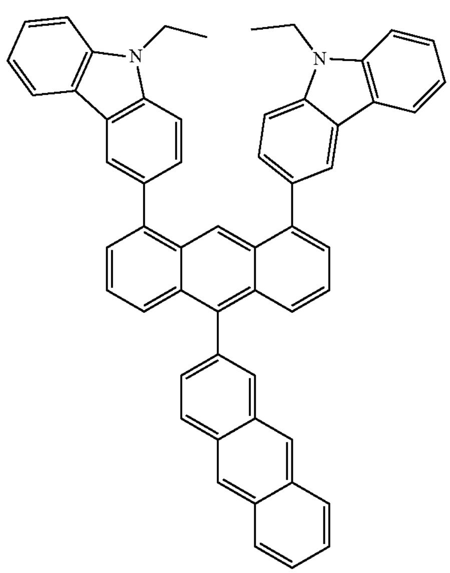
-continued
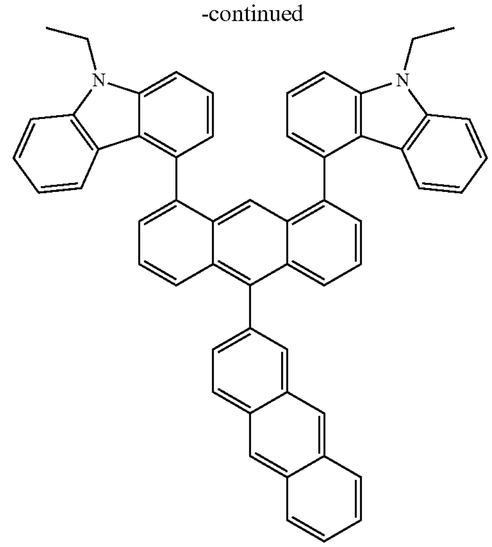
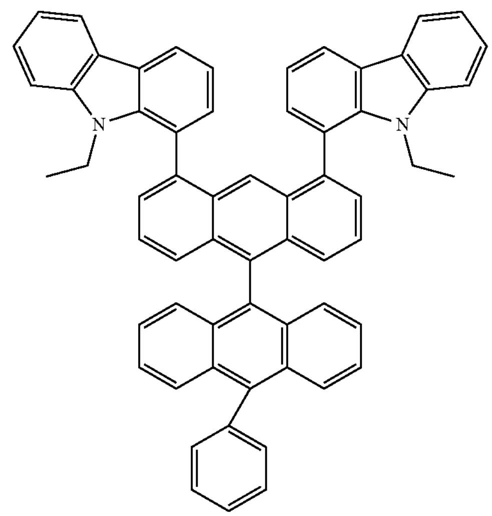
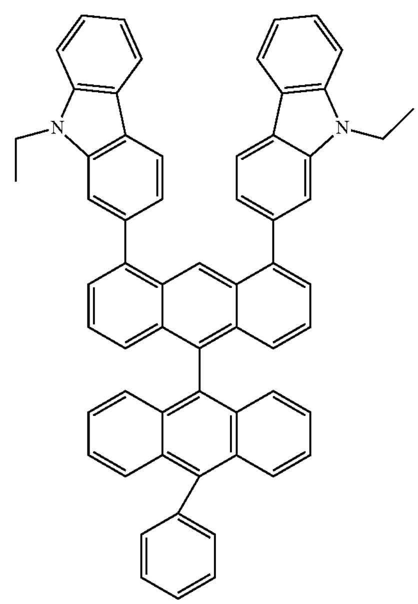

-continued
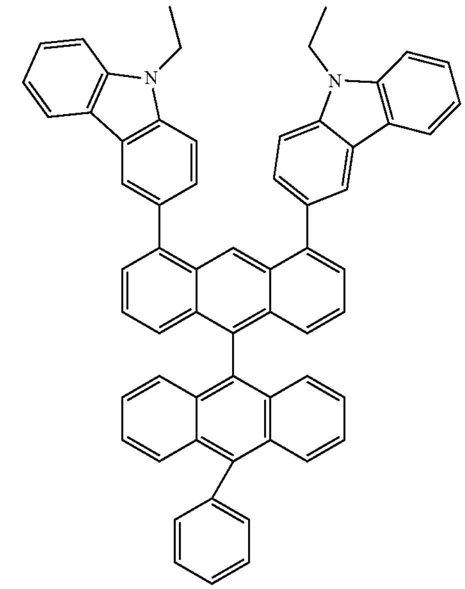
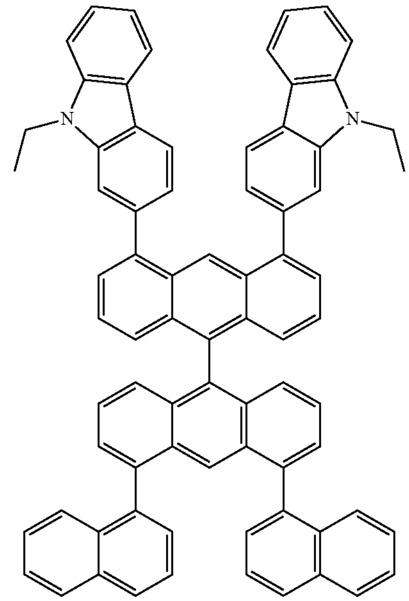
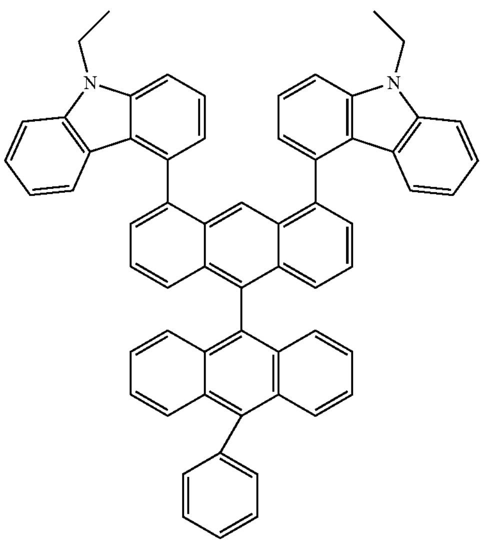
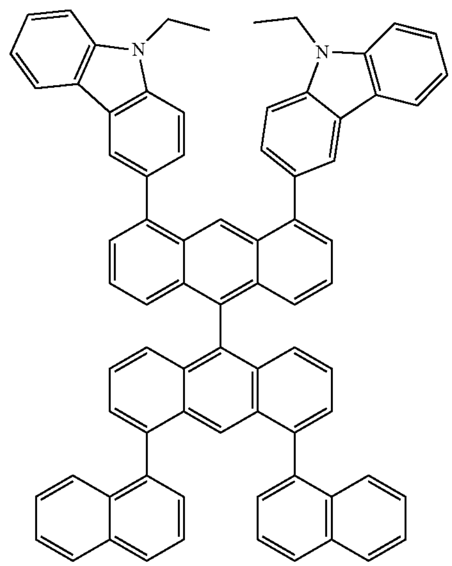
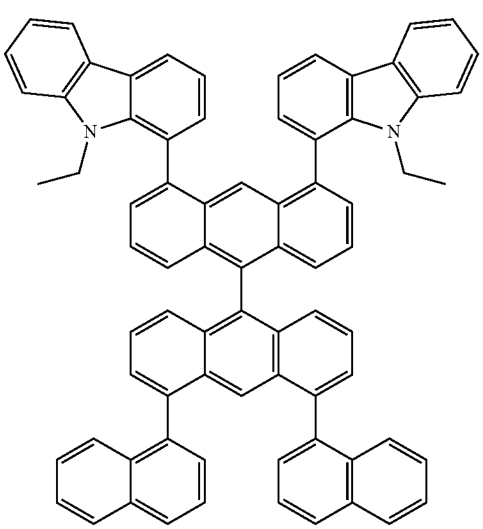
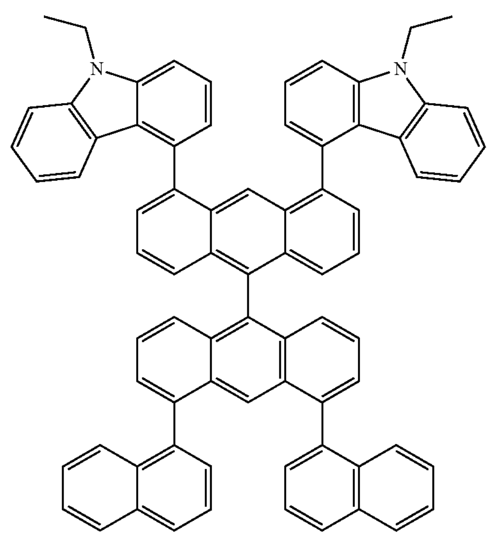

-continued
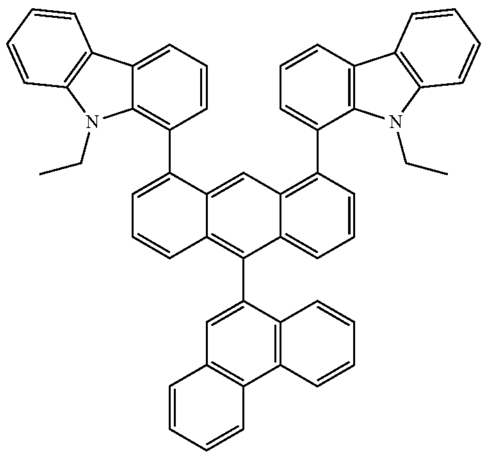
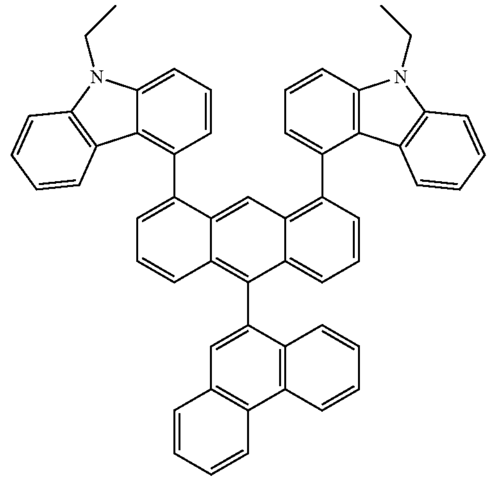
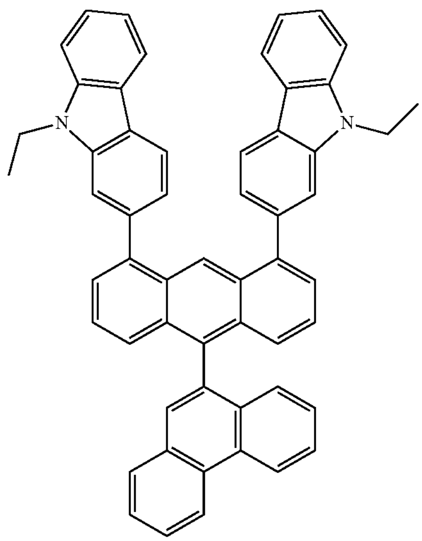
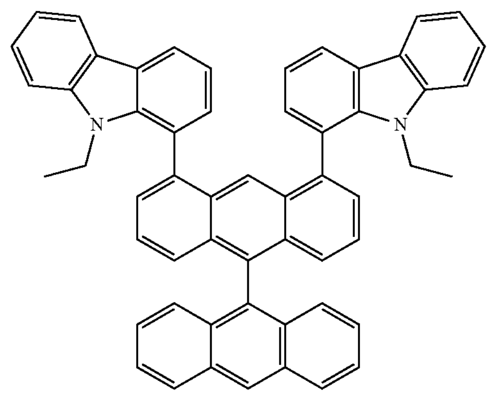
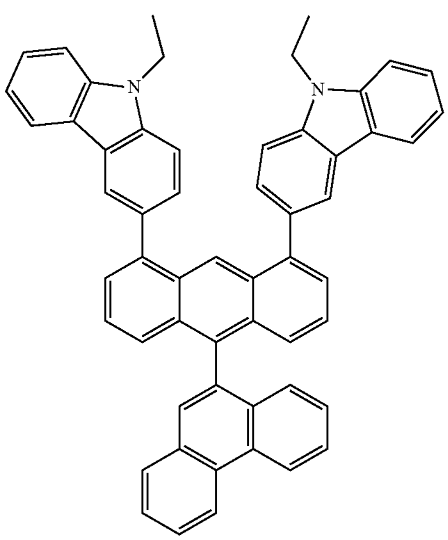
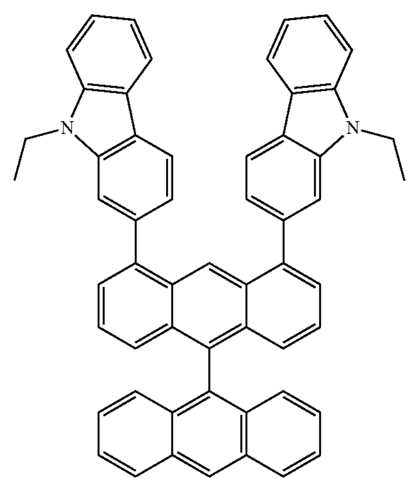

-continued
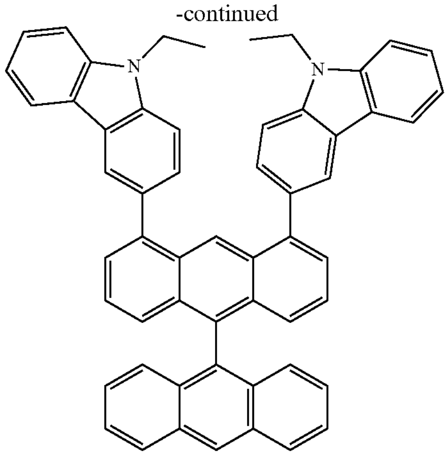
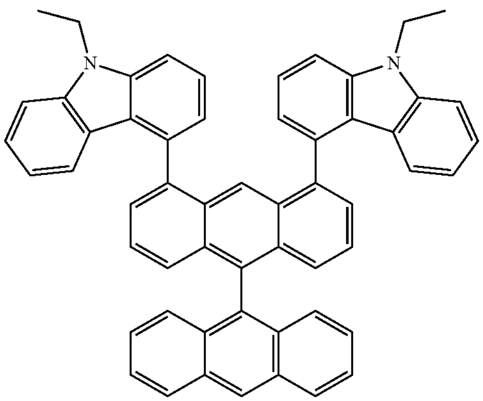
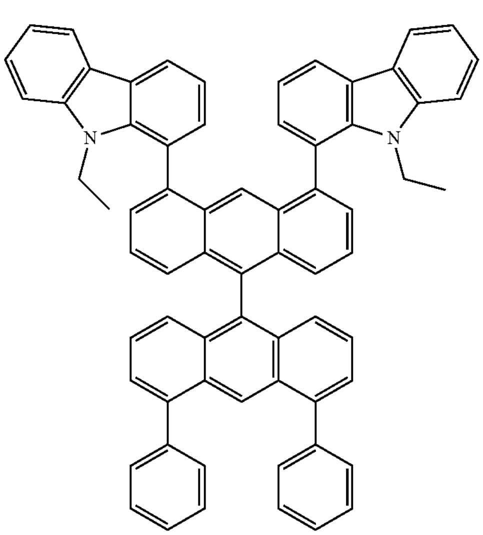
-continued
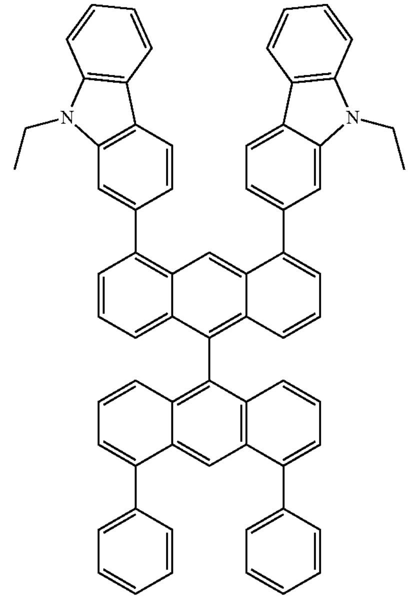
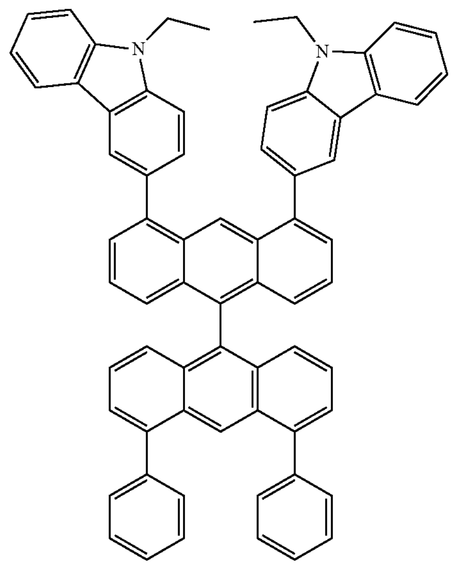
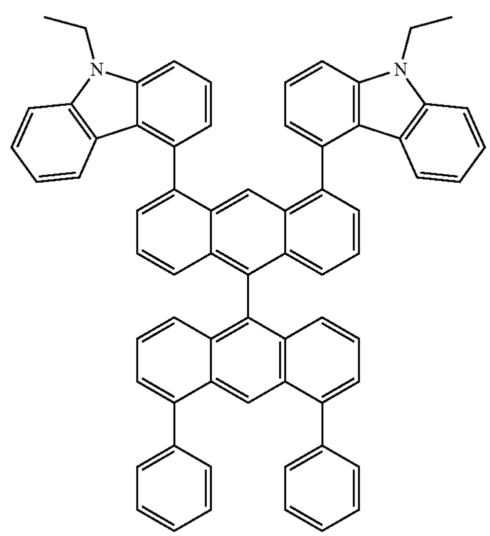

-continued
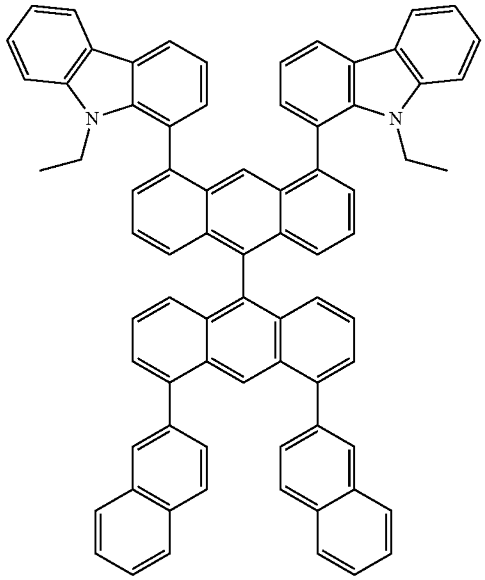
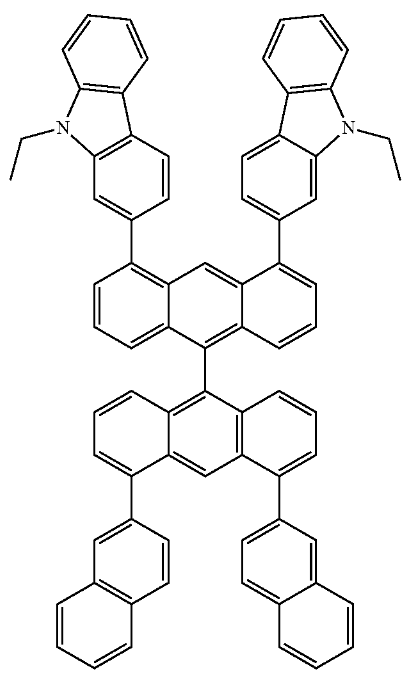
-continued
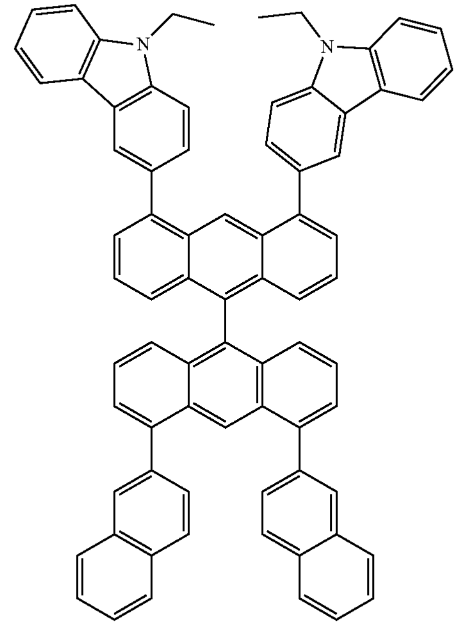
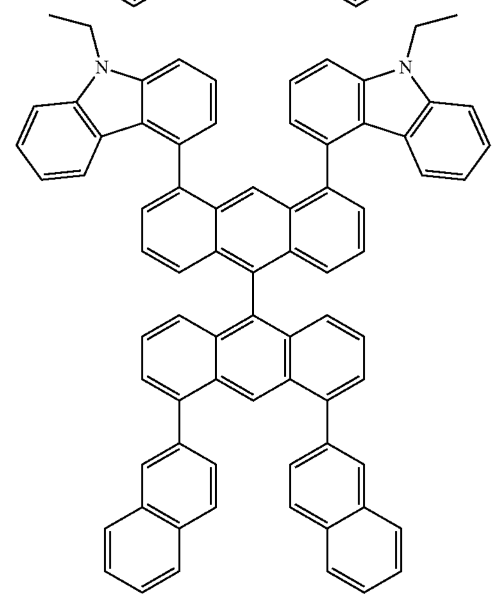
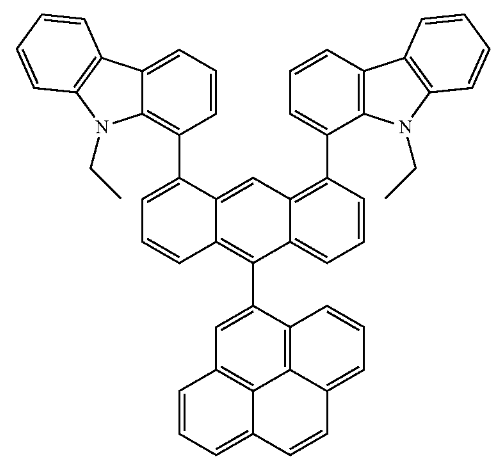

-continued
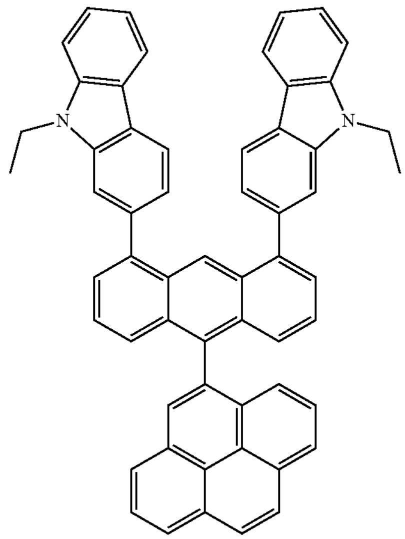
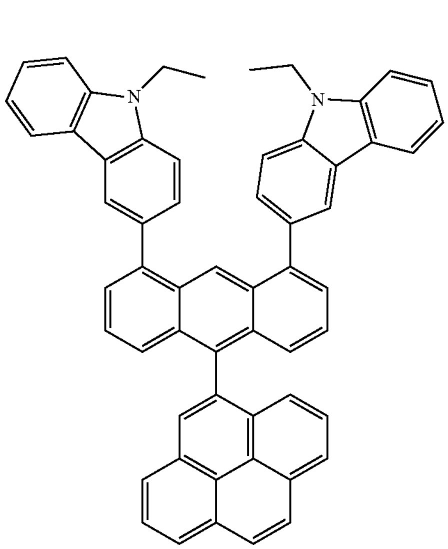
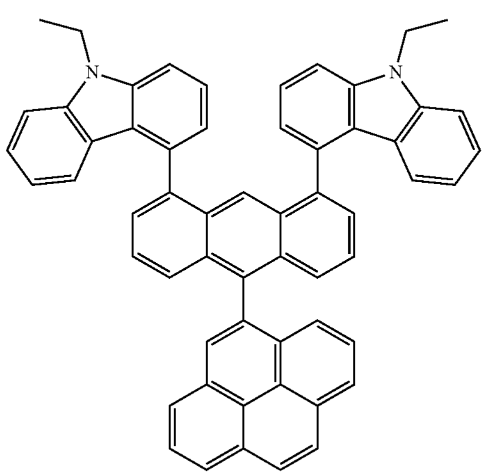
-continued
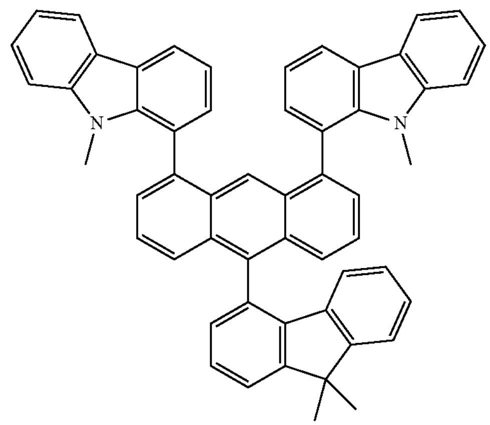
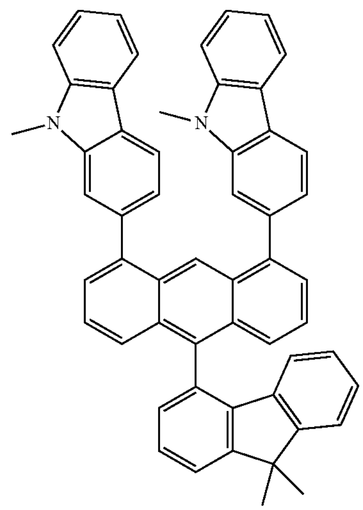
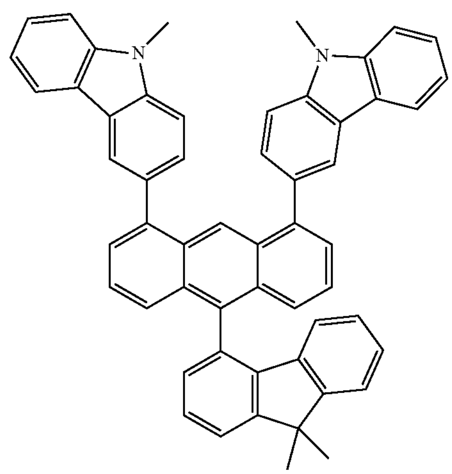

-continued
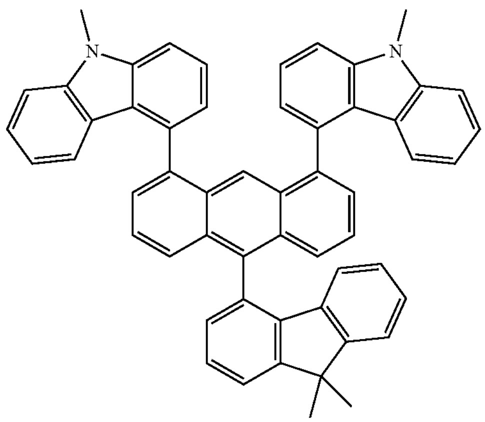
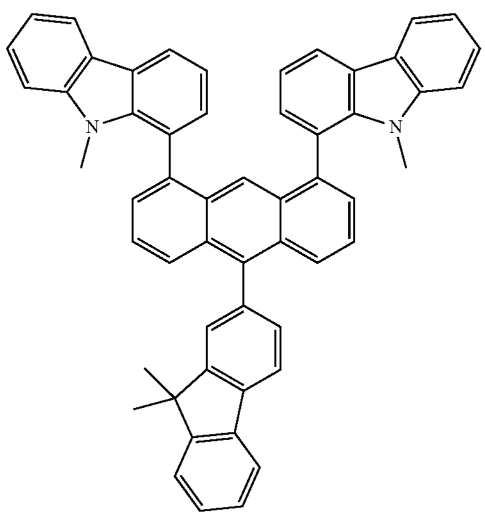
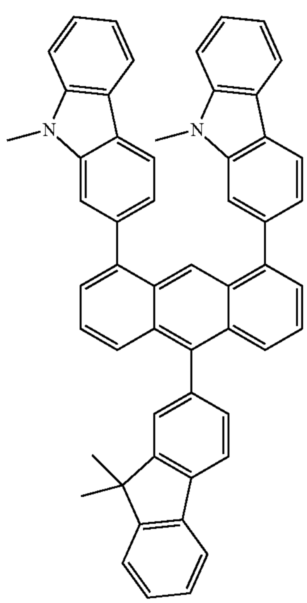
-continued
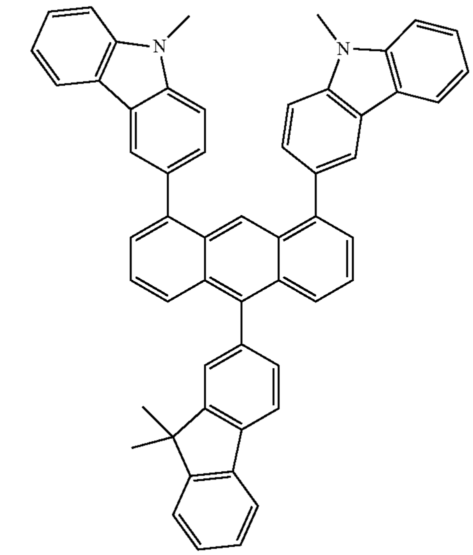
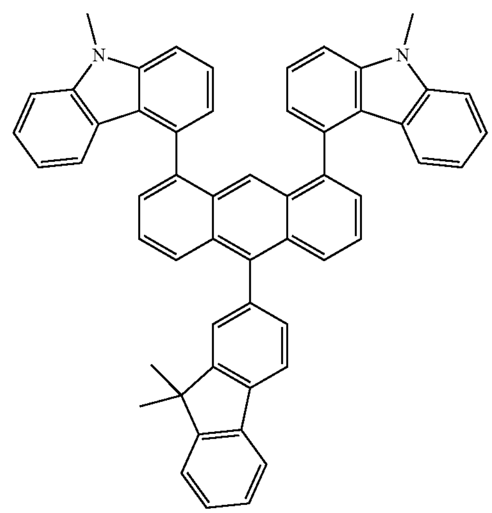
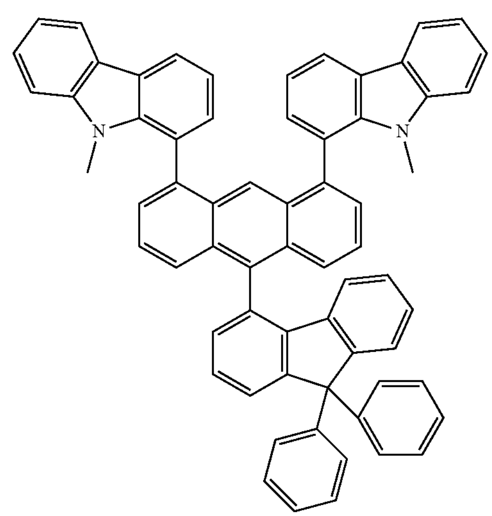

-continued
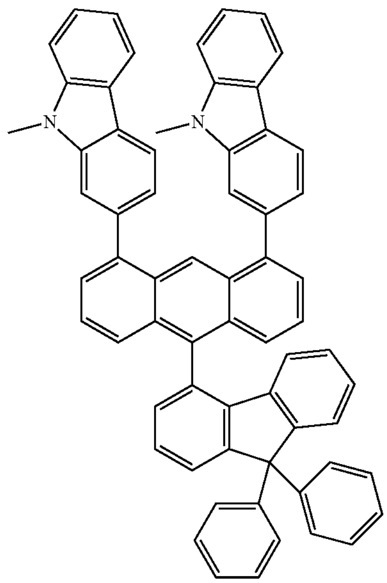
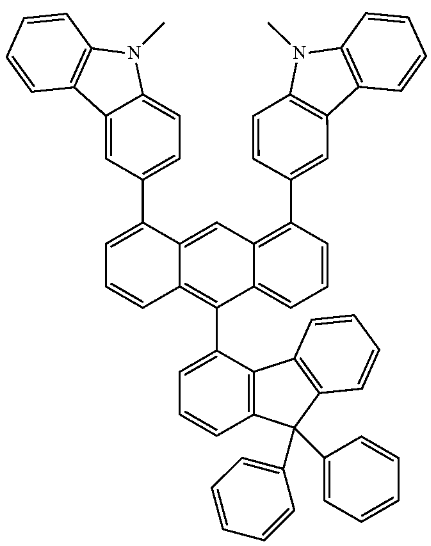
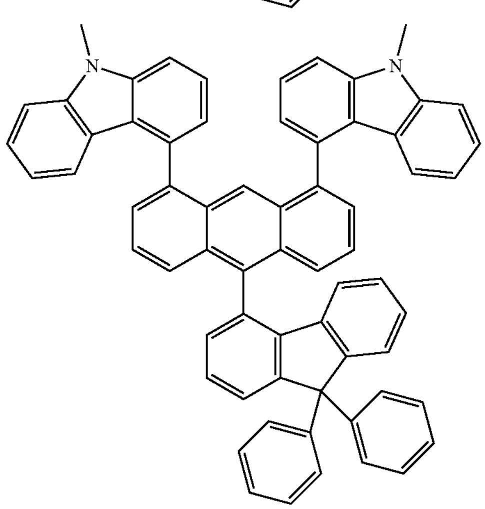
-continued
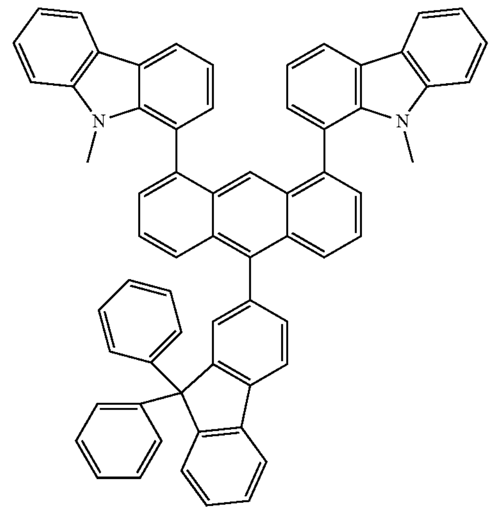
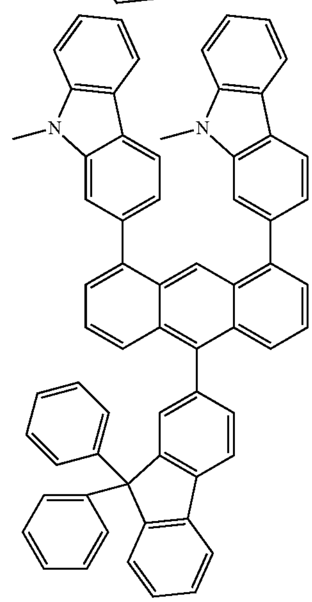
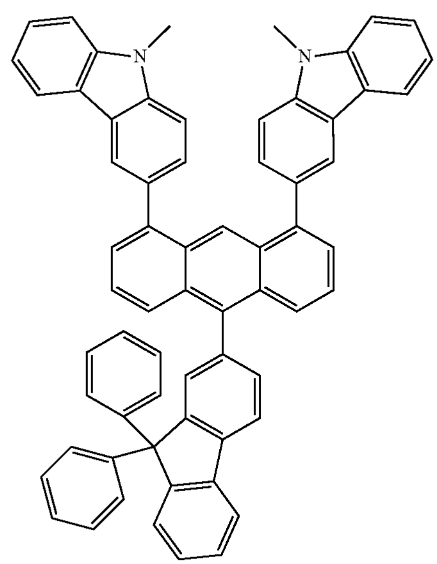

-continued
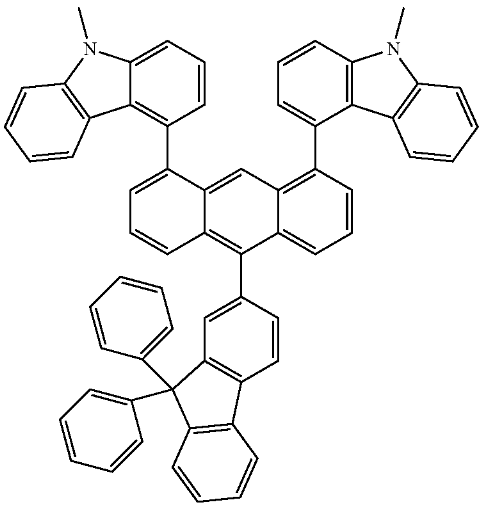
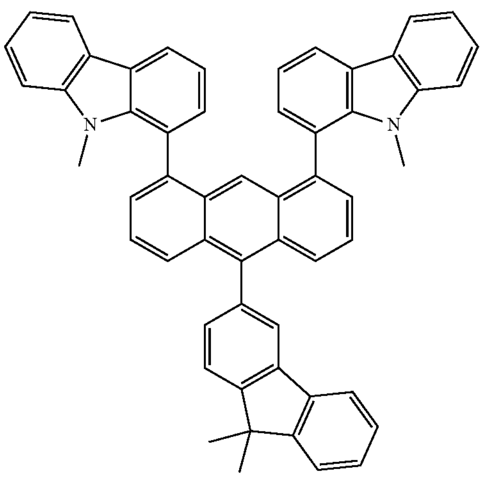
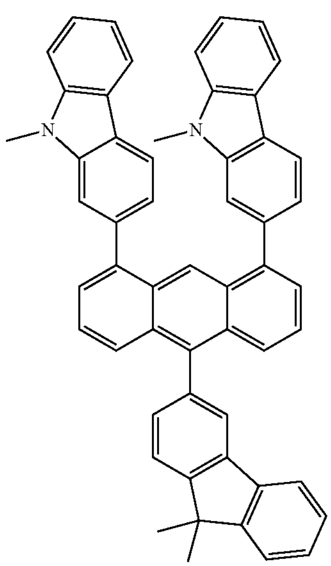
-continued
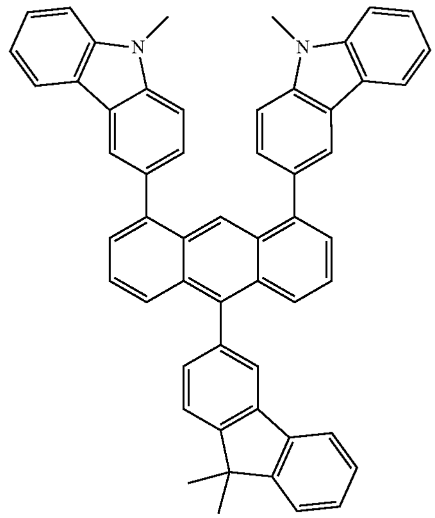
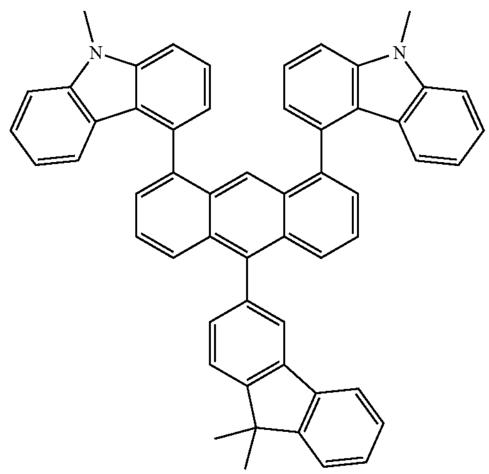
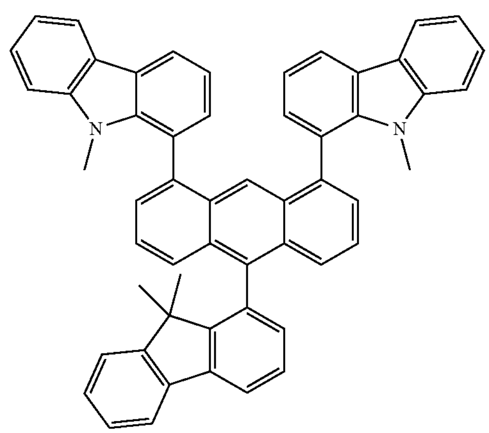

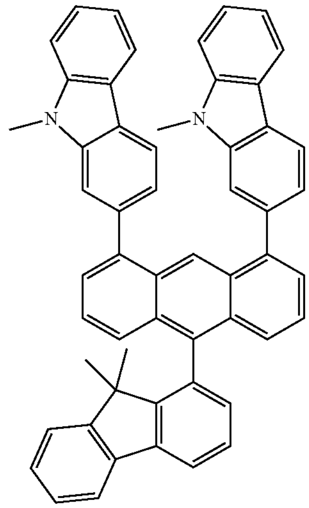
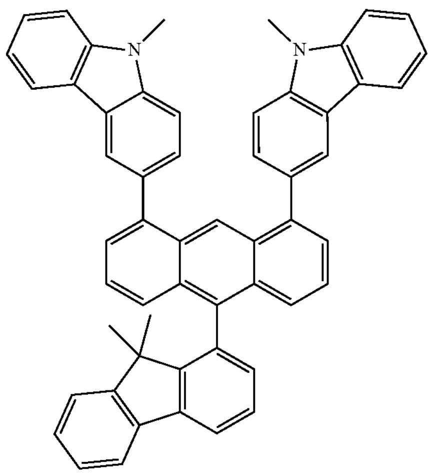
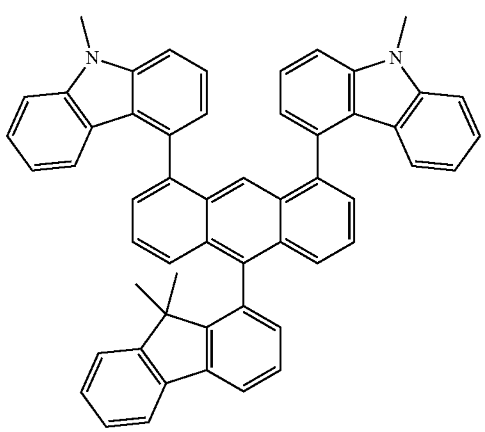
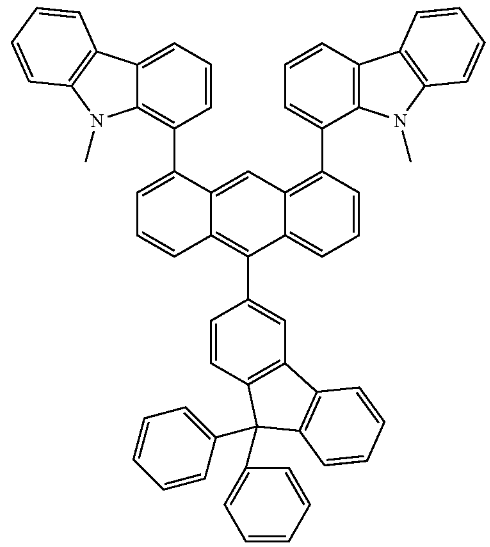
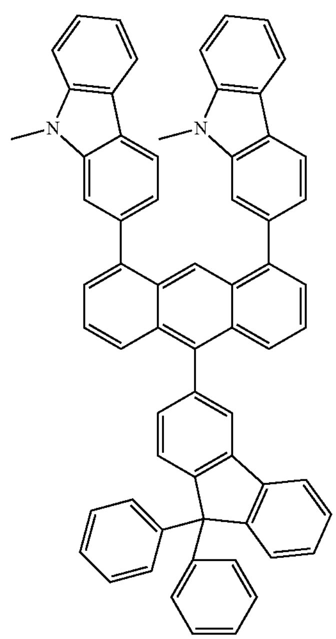

-continued
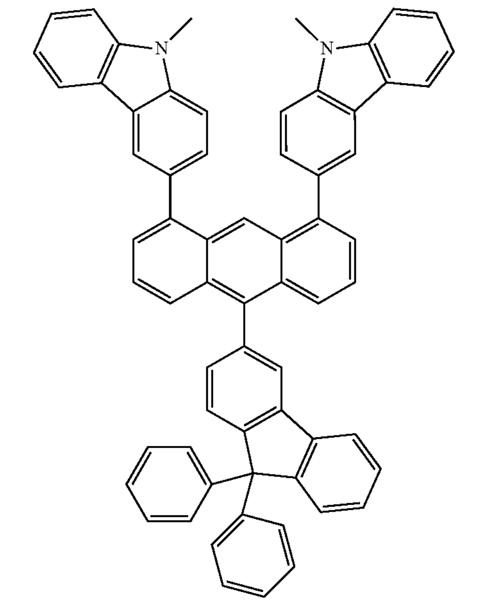
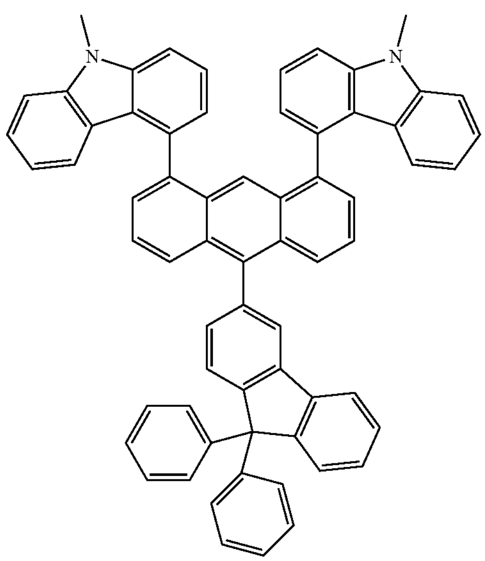
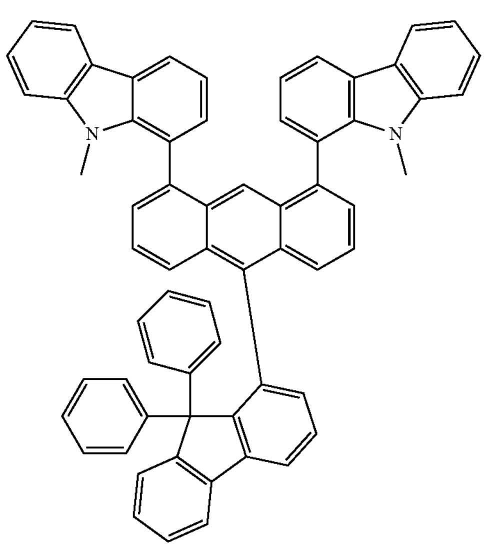
-continued
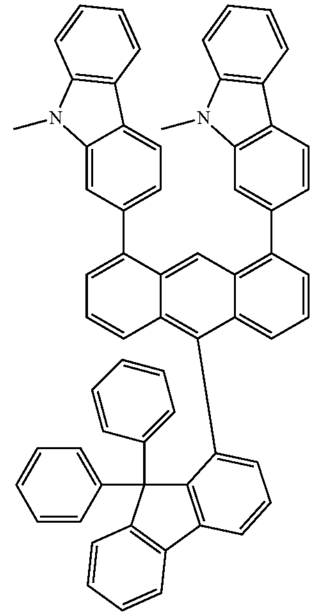
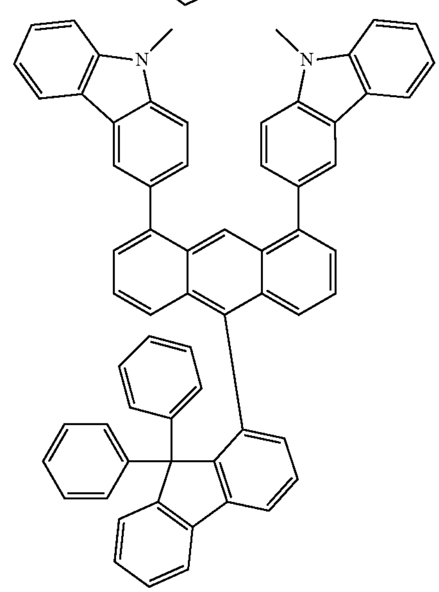
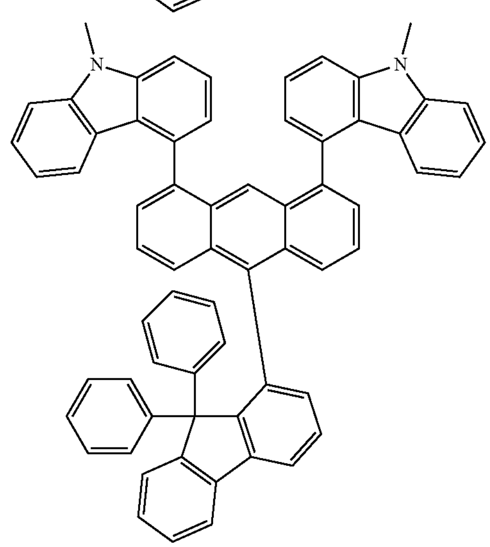

-continued
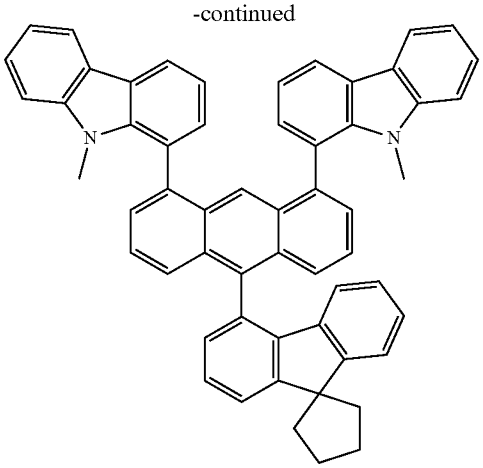
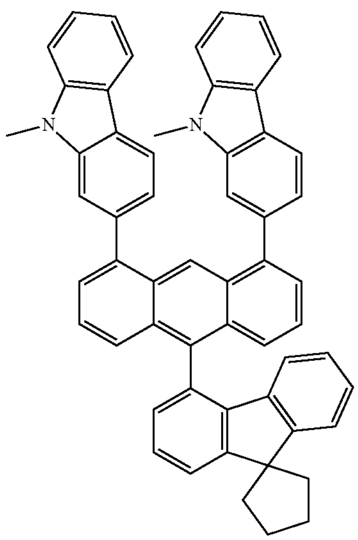
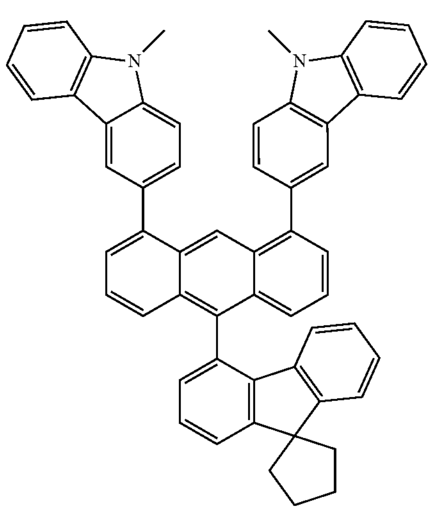
-continued
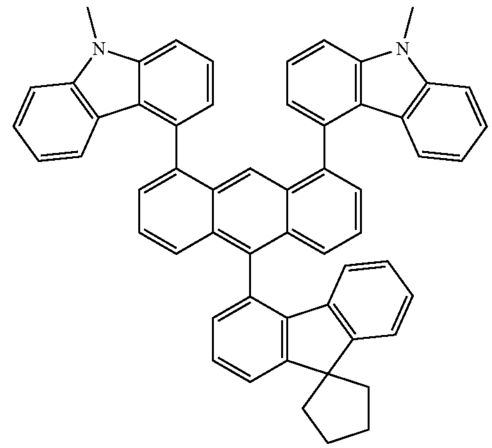
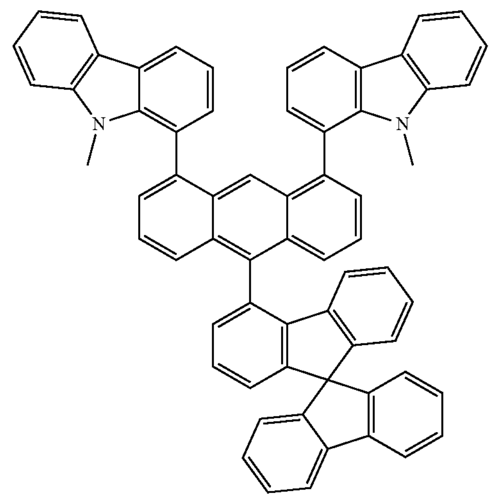
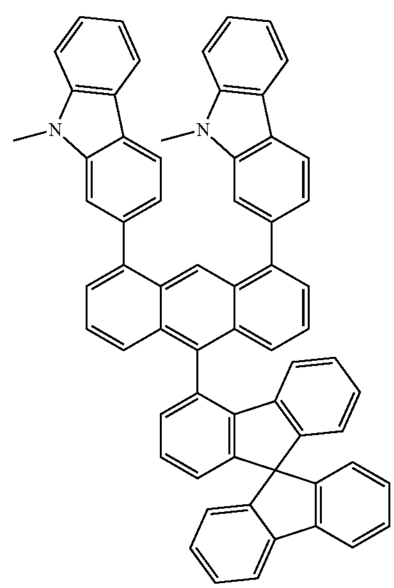

-continued
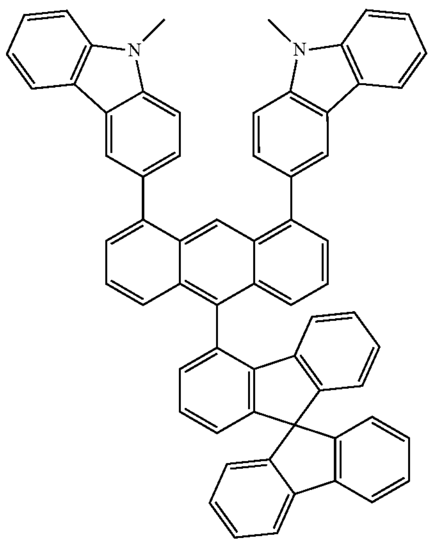
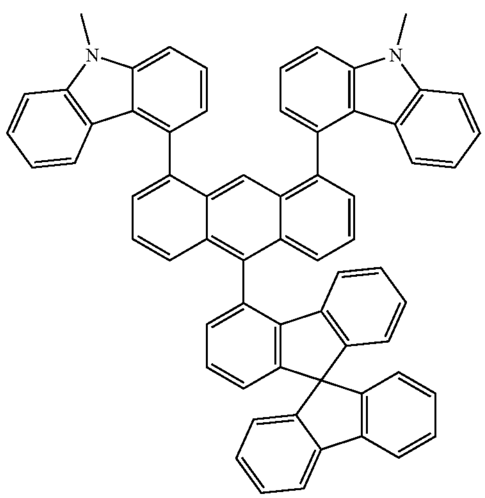
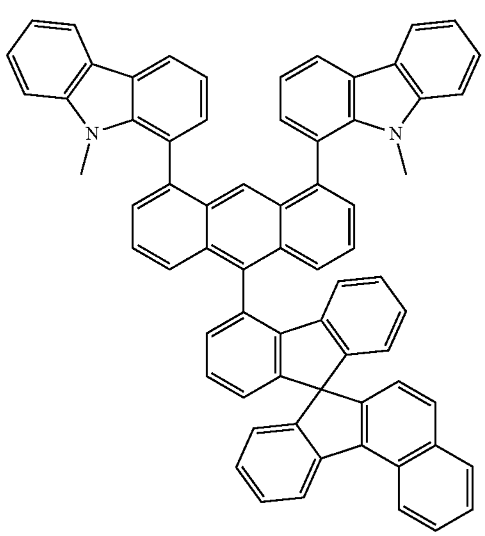
-continued
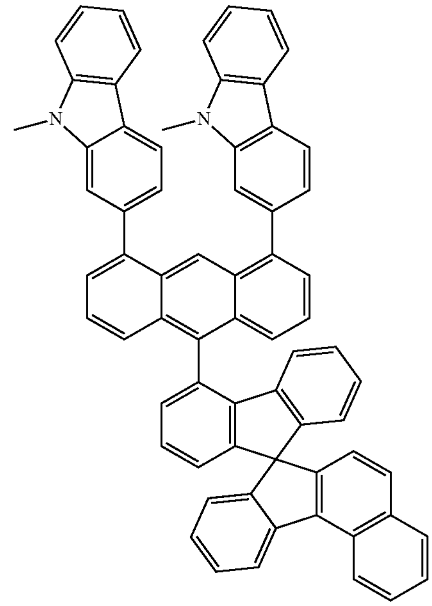
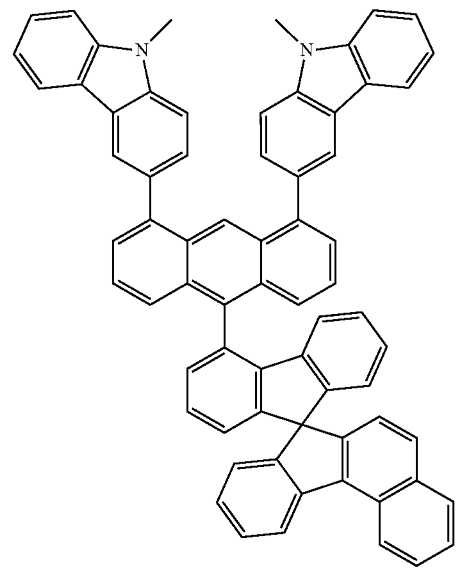
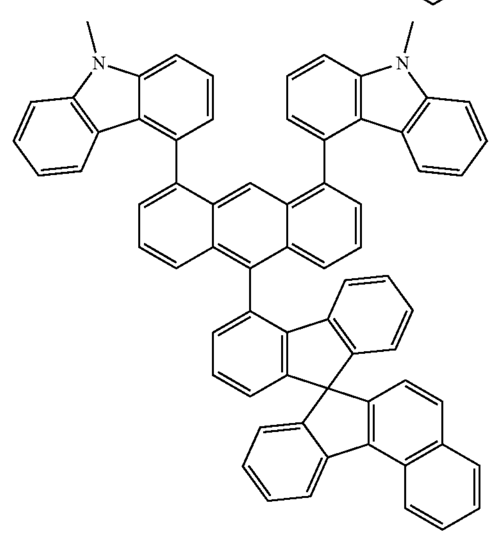

-continued
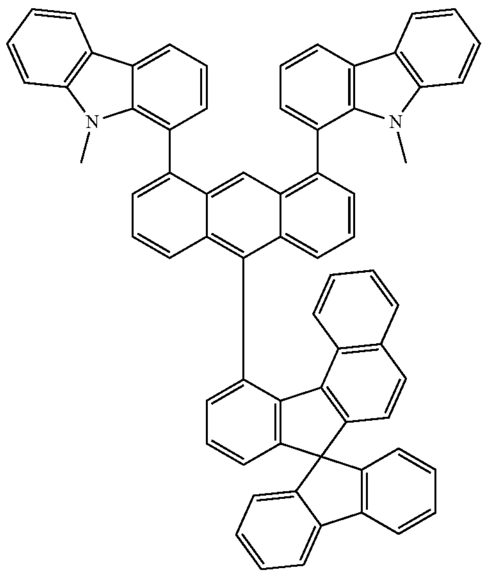
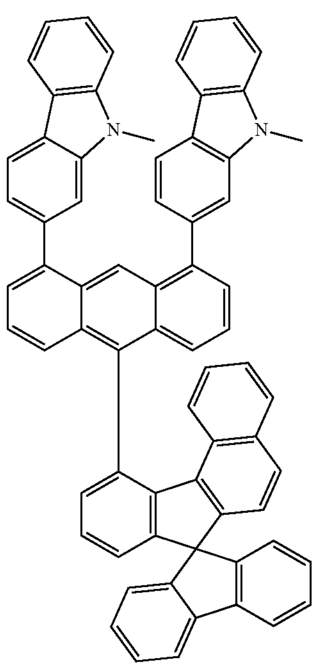
-continued
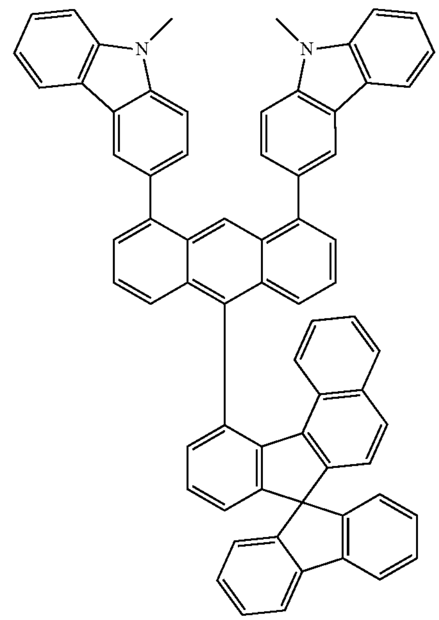
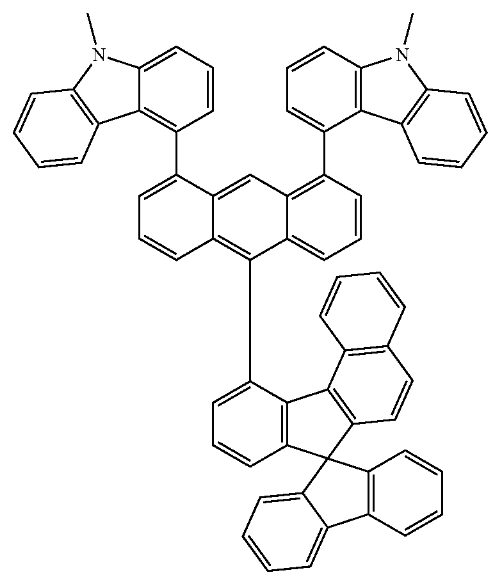
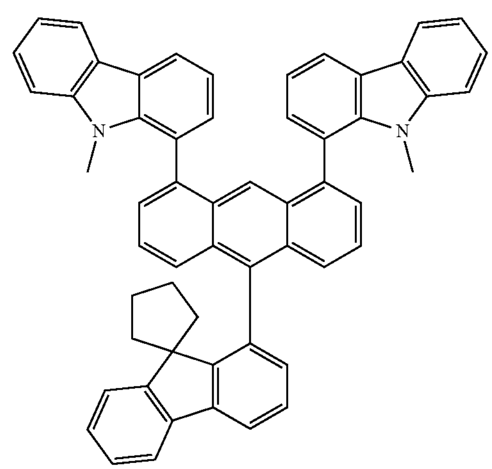

-continued
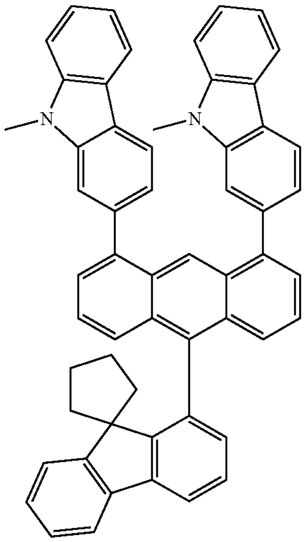
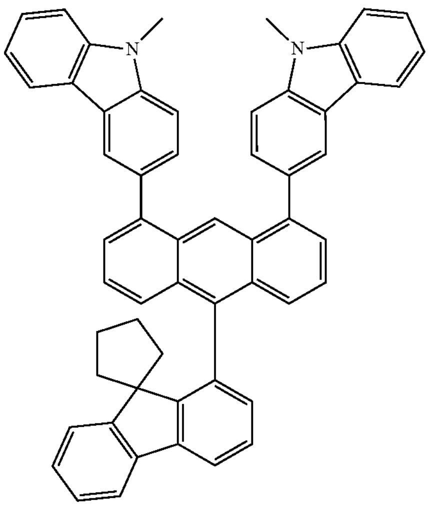
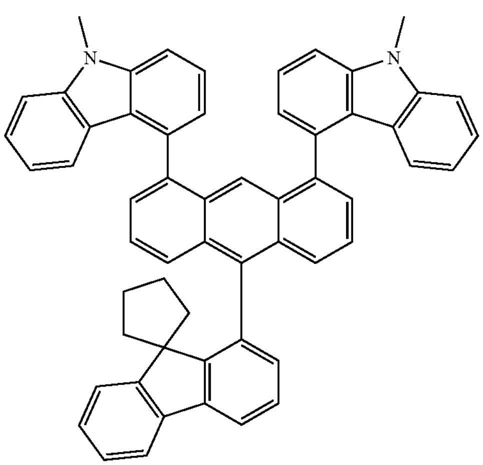
-continued
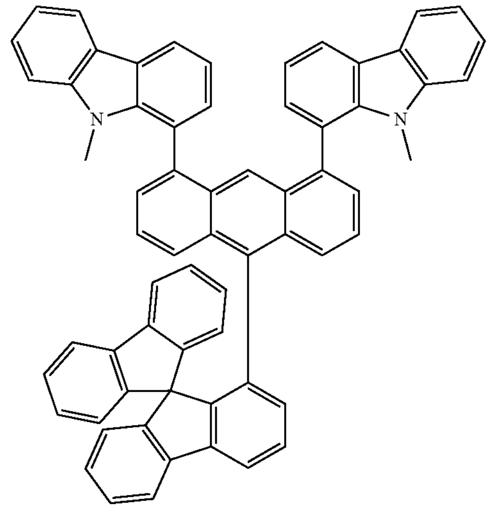
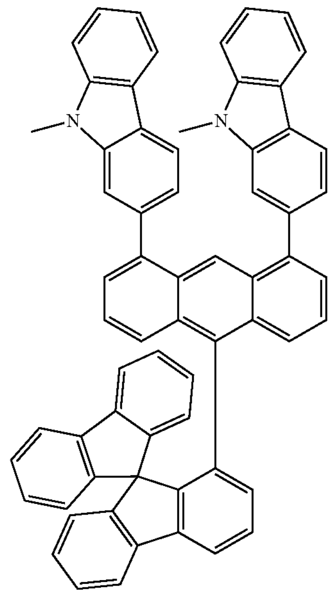
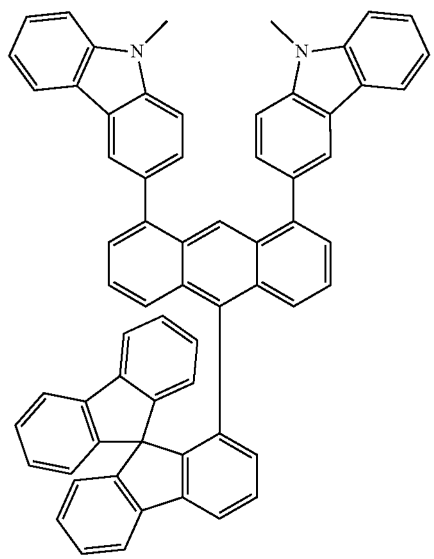

-continued
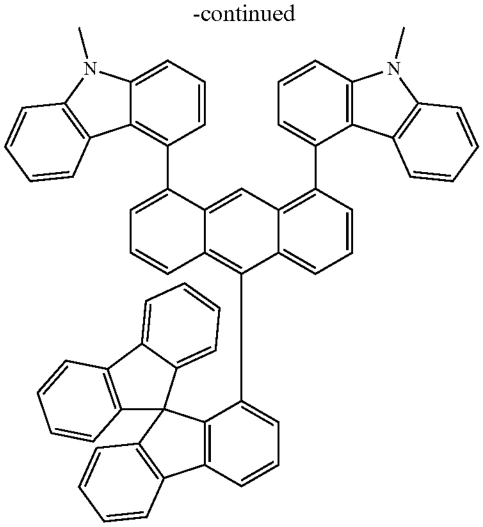
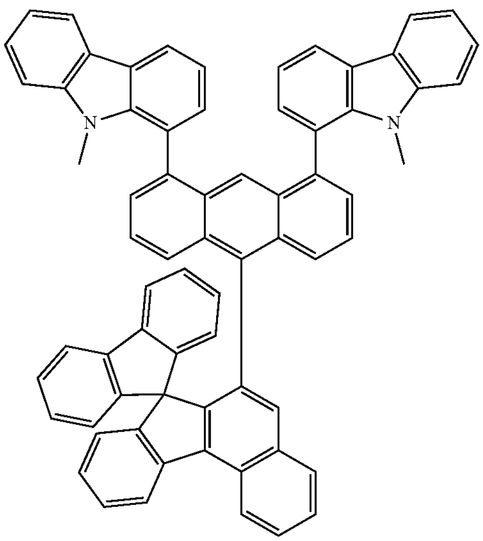
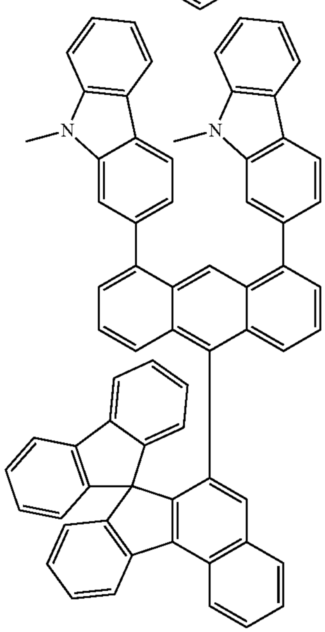
-continued
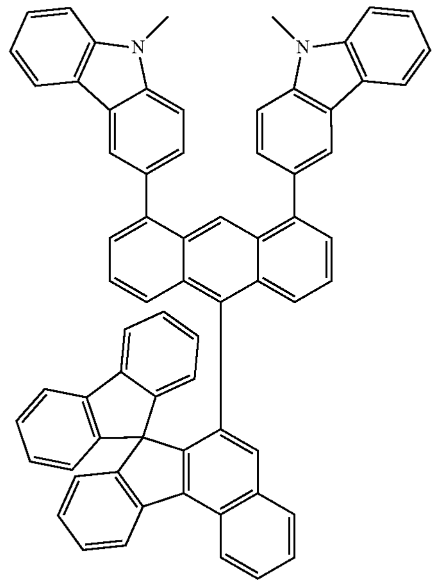
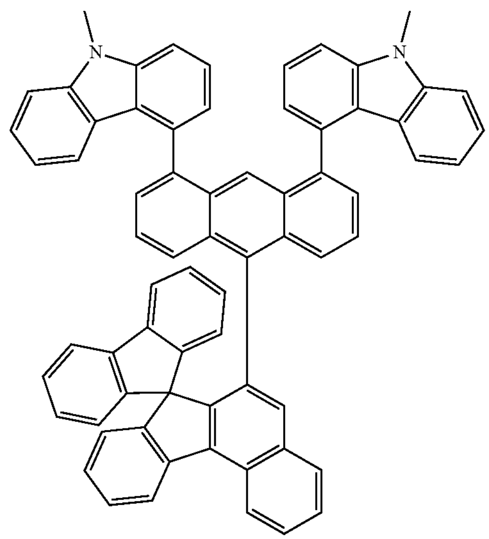
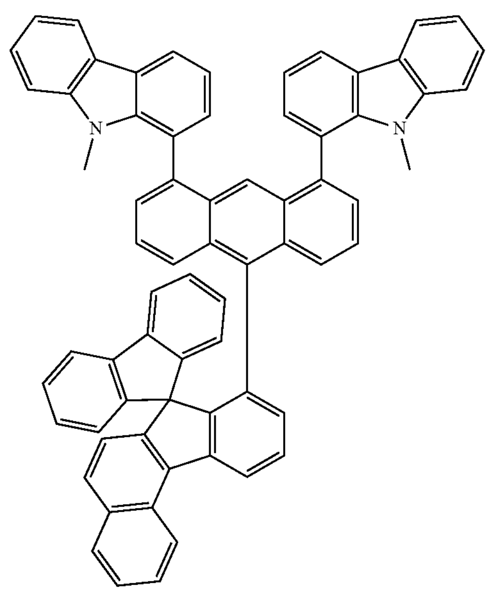

-continued
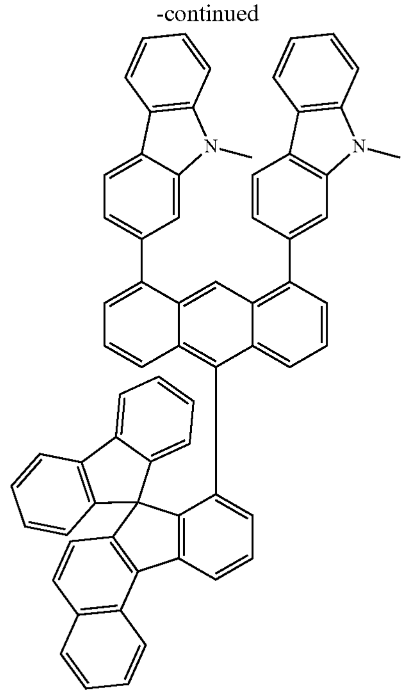
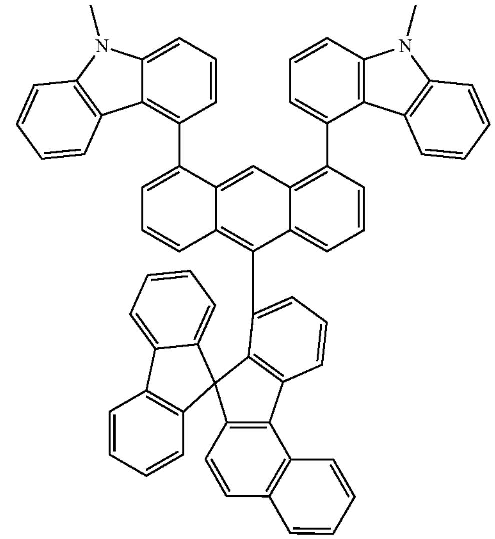
-continued
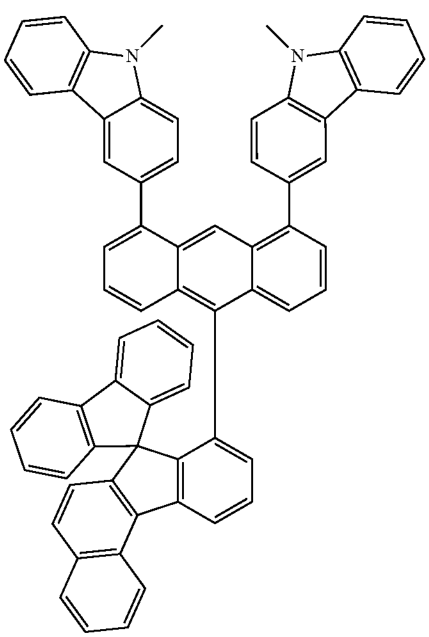
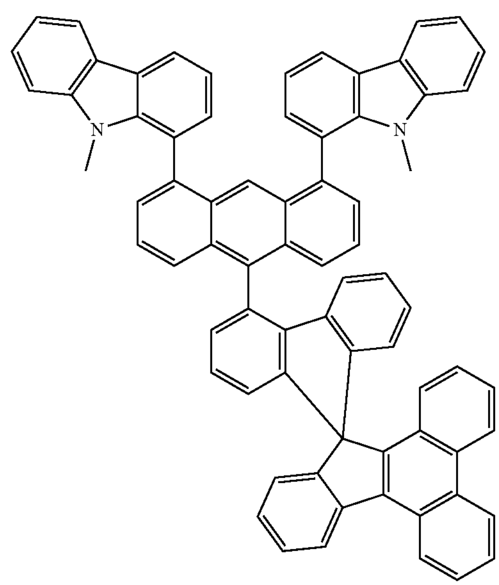

-continued
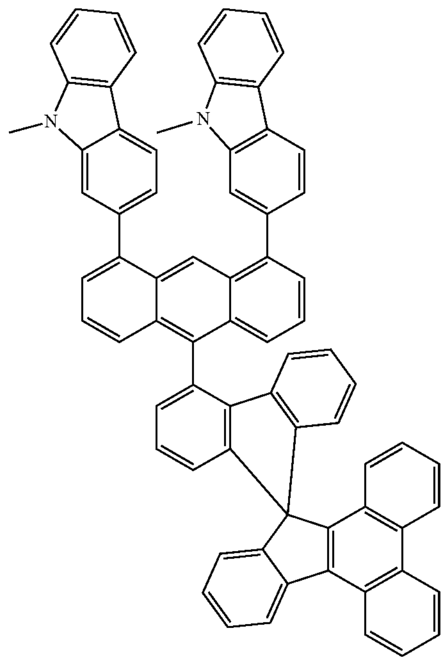
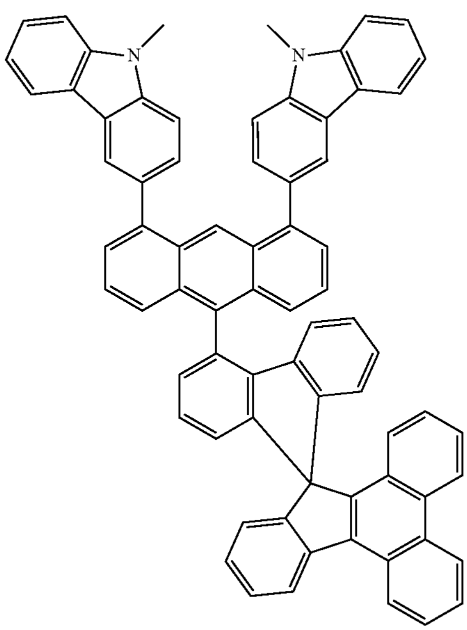
-continued
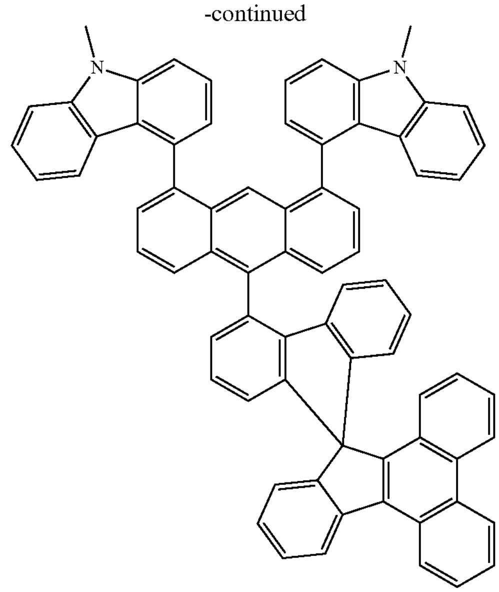
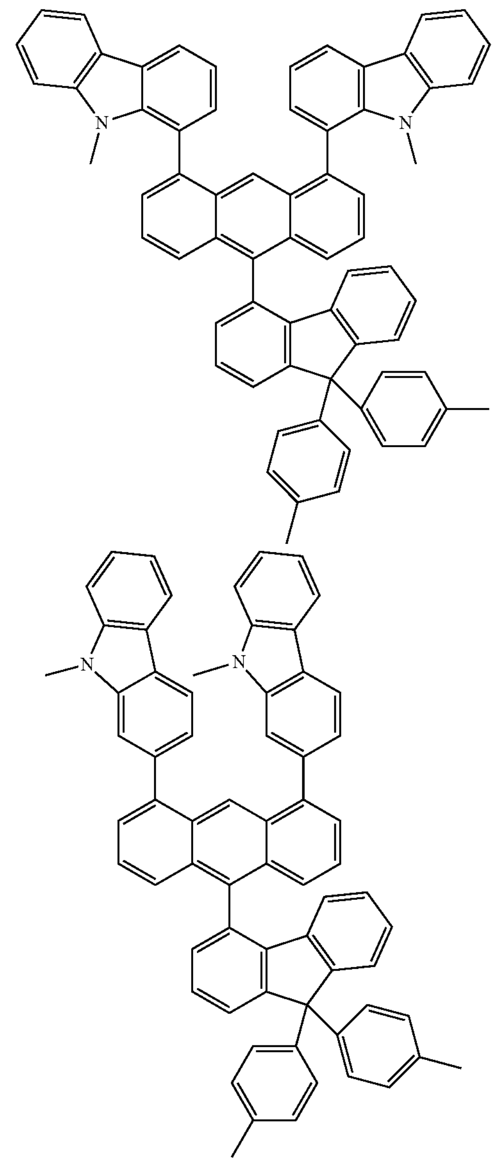

-continued
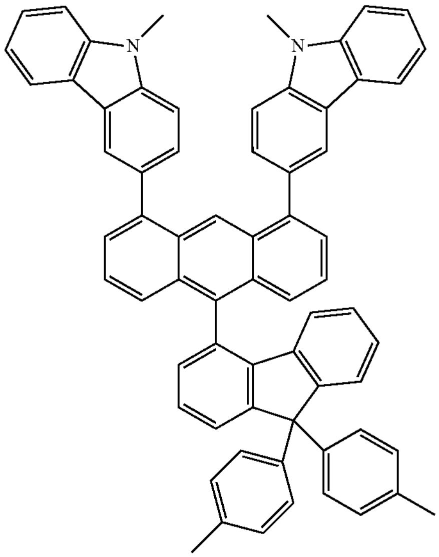
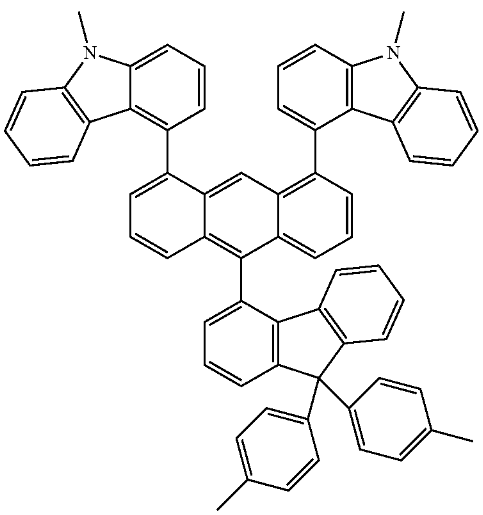
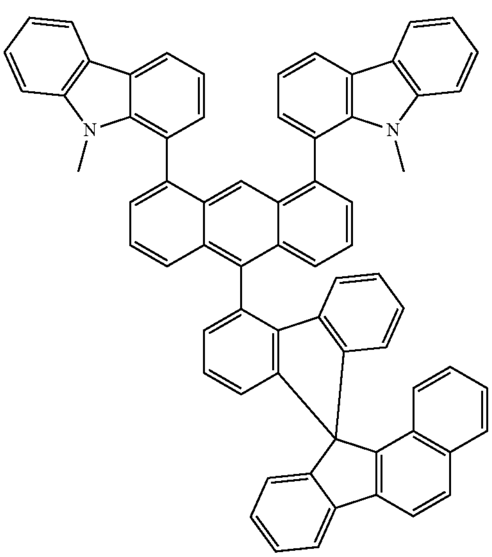
-continued
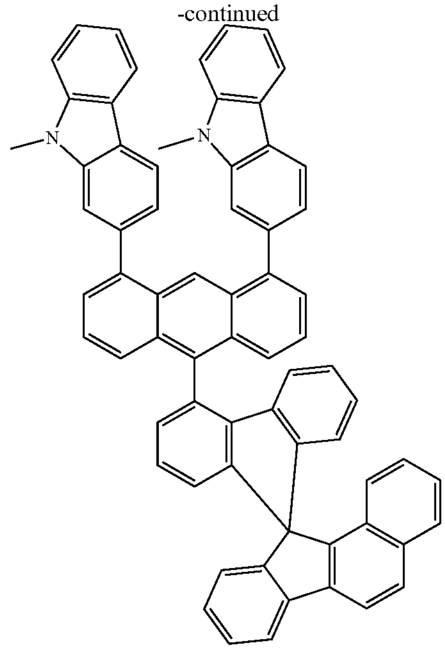
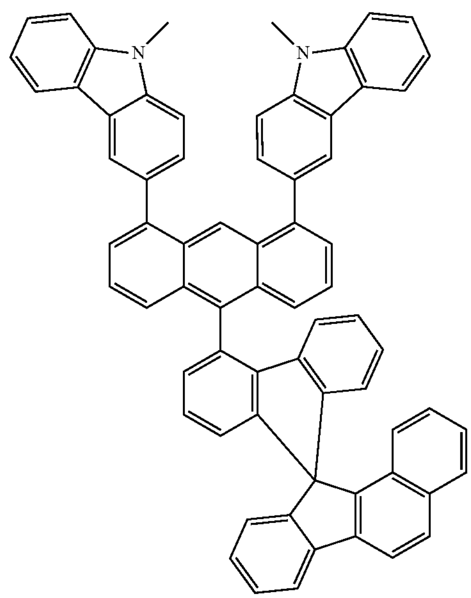

-continued
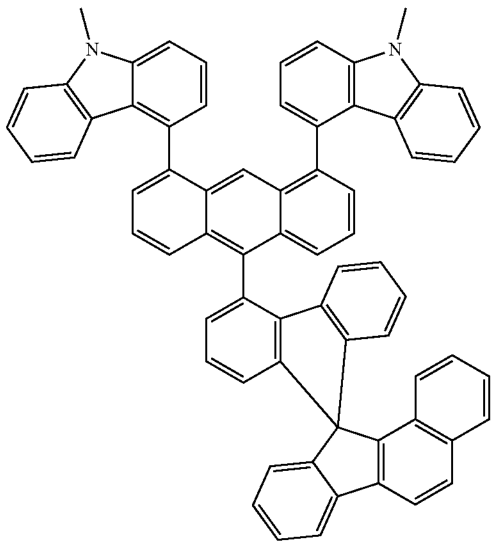
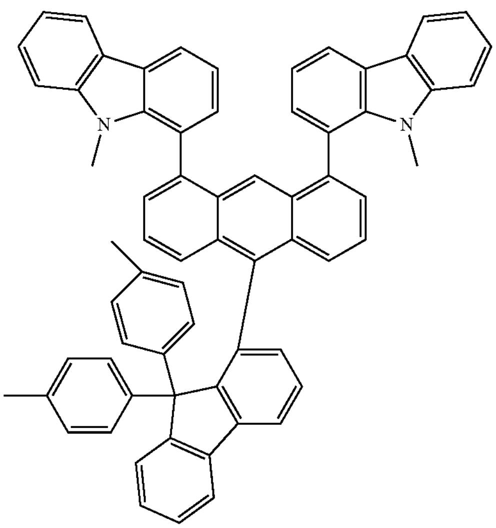
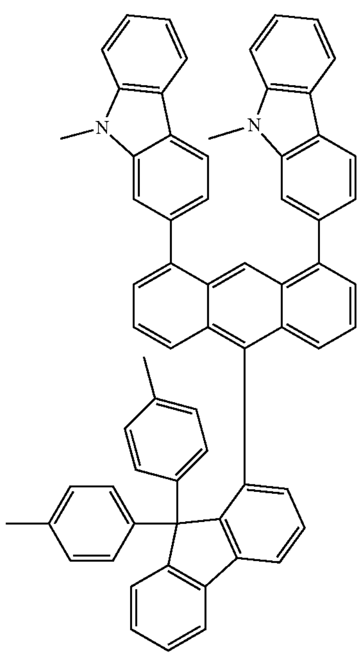
-continued
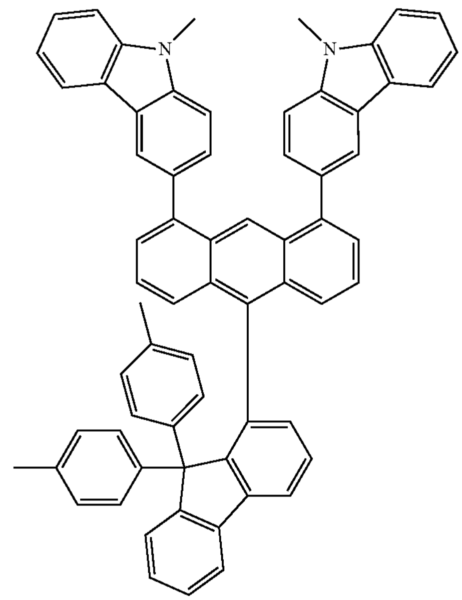
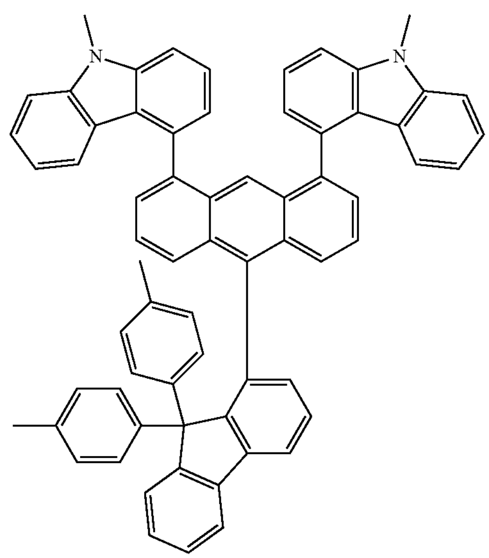 [SMILES: Cc1ccc(C2(c3ccc(C)cc3)c3ccccc3-c3cccc(-c4c5cccc(-c6cccc7c6c6ccccc6n7C)c5cc5c(-c6cccc7c6c6ccccc6n7C)cccc45)c32)cc1]
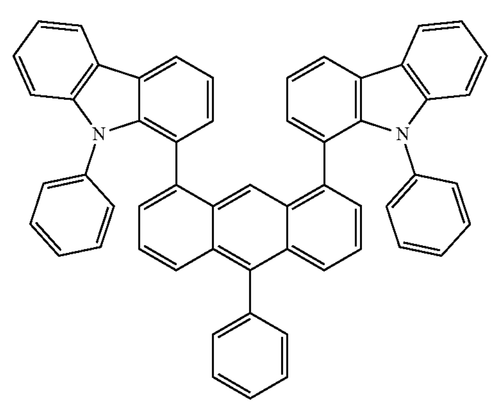

-continued
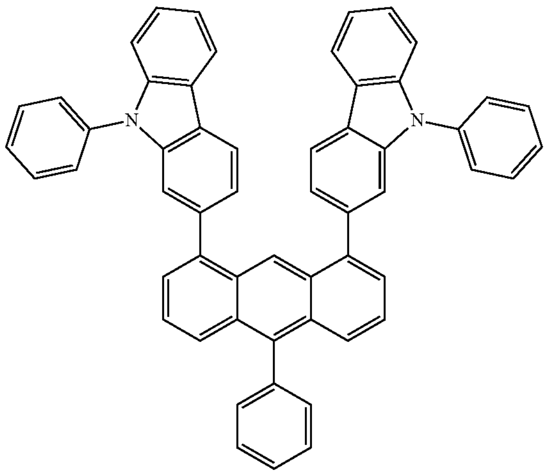
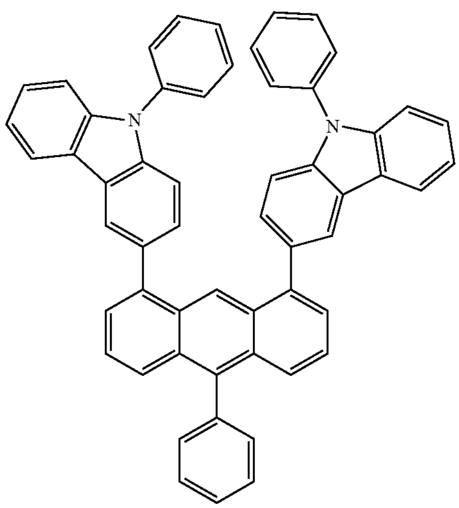
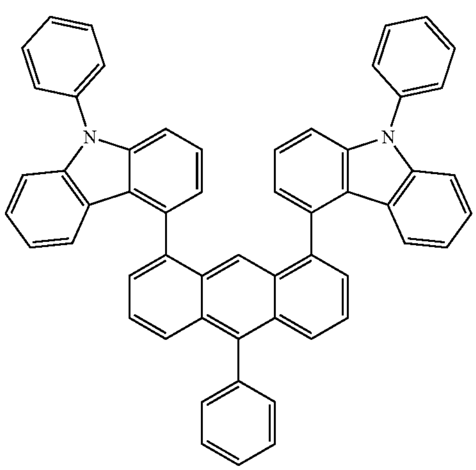
-continued
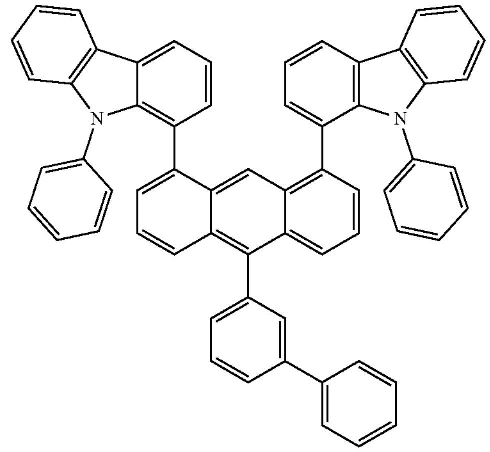
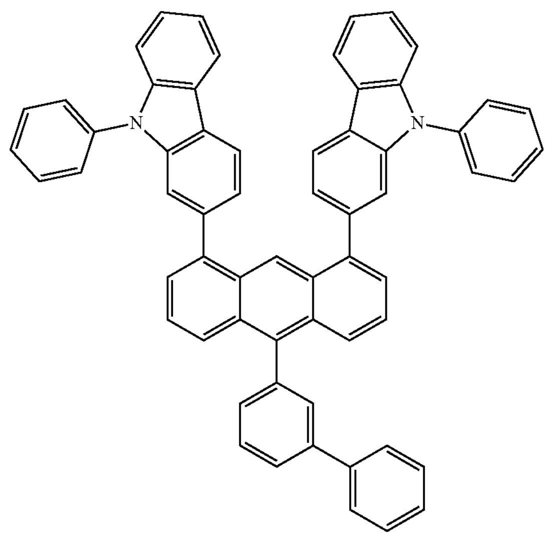
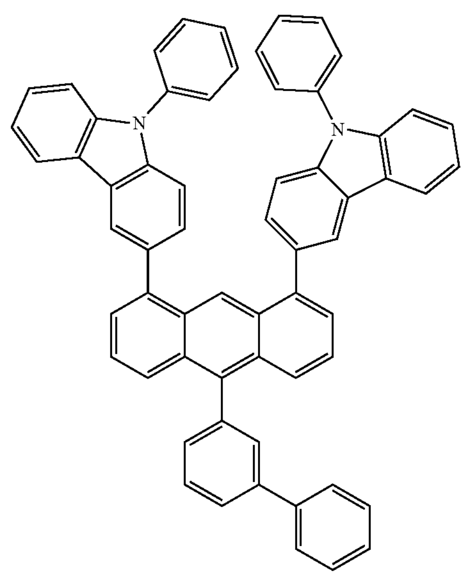

-continued
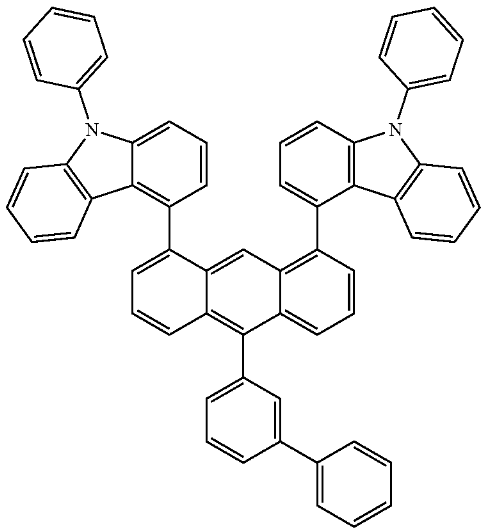
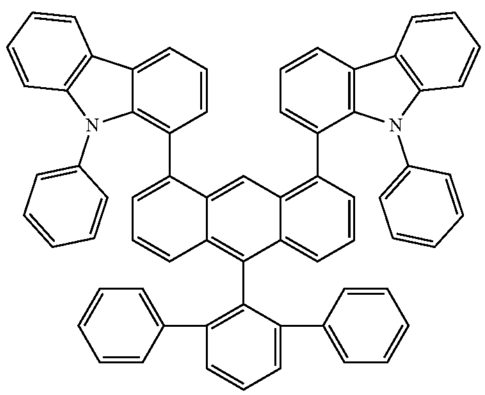
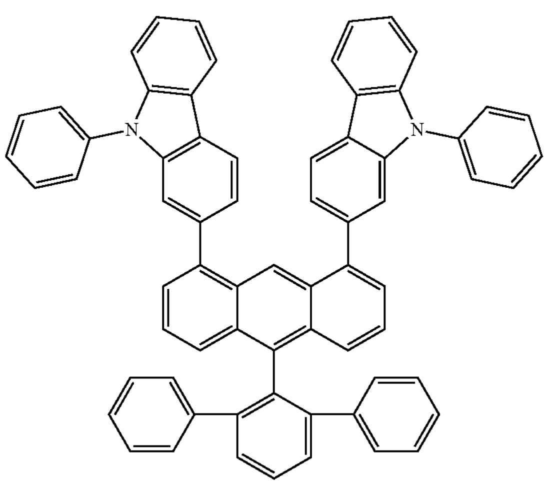
-continued
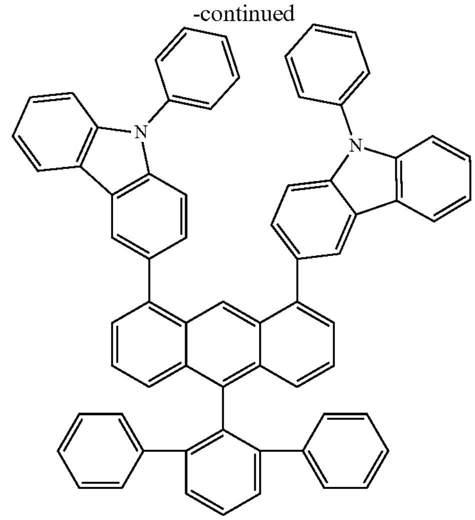
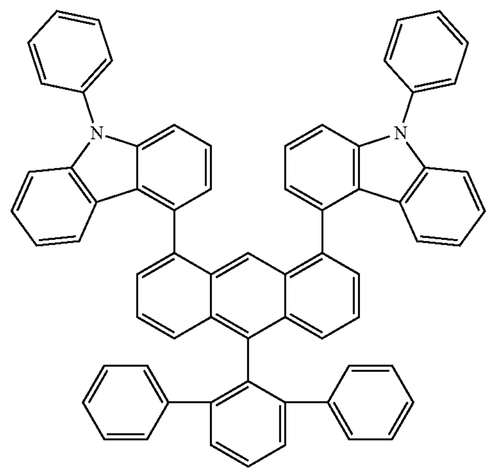
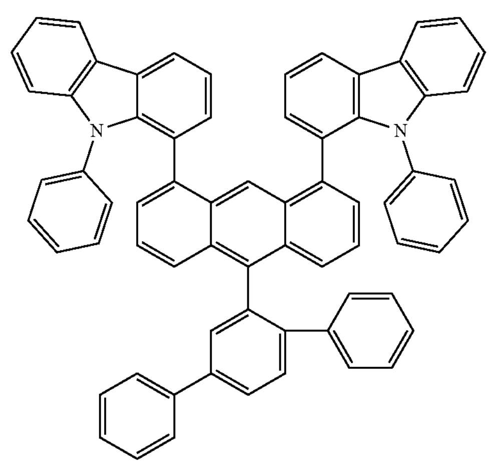

-continued
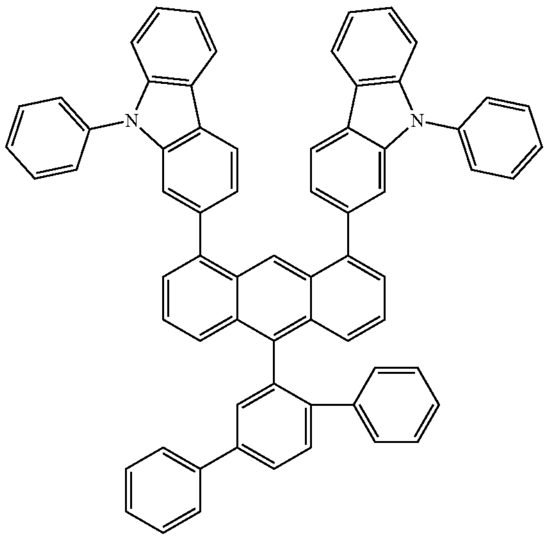
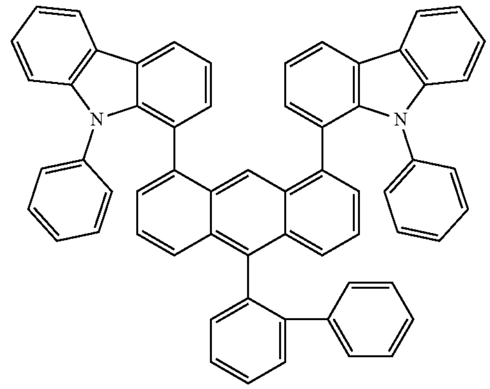
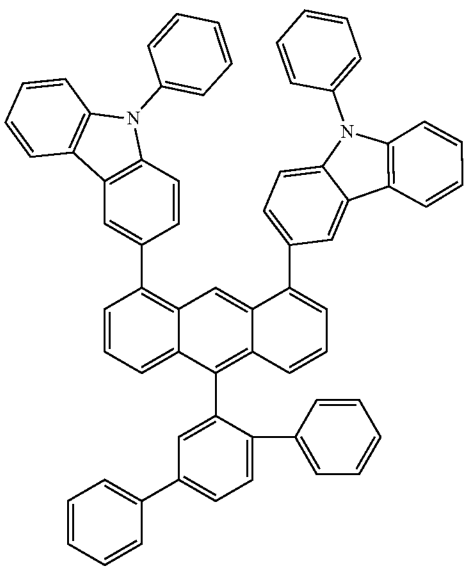
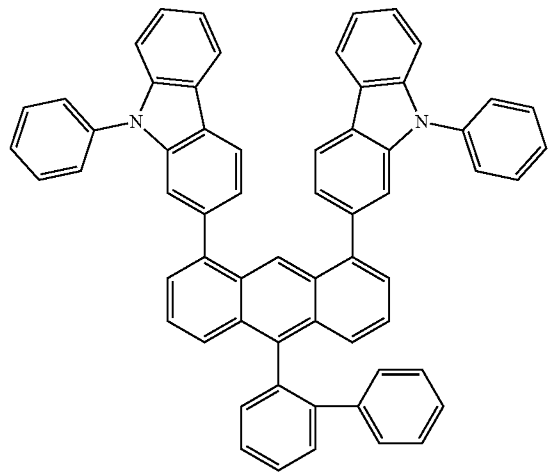
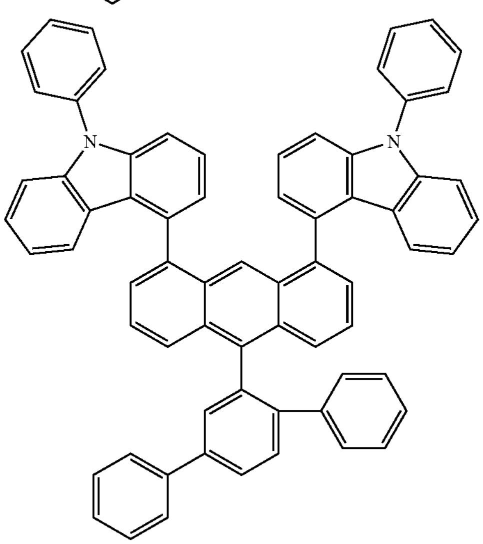
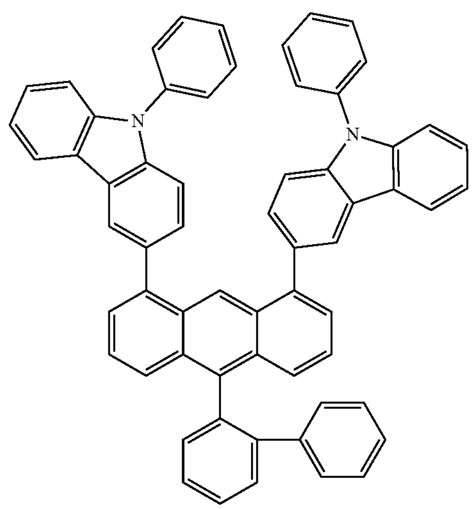
-continued -continued
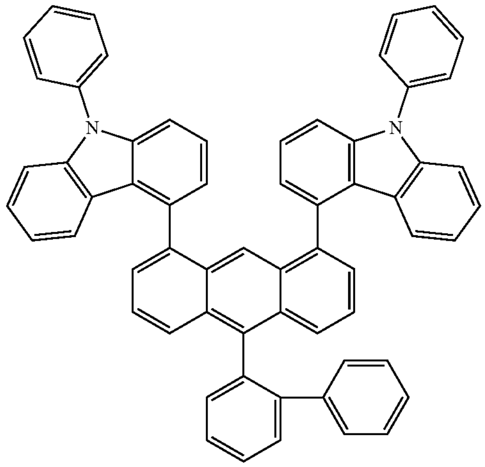
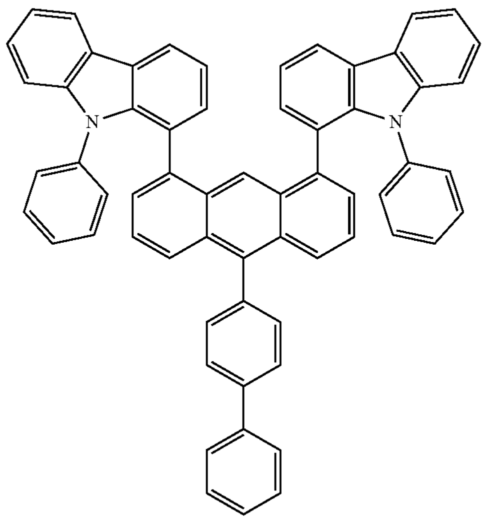
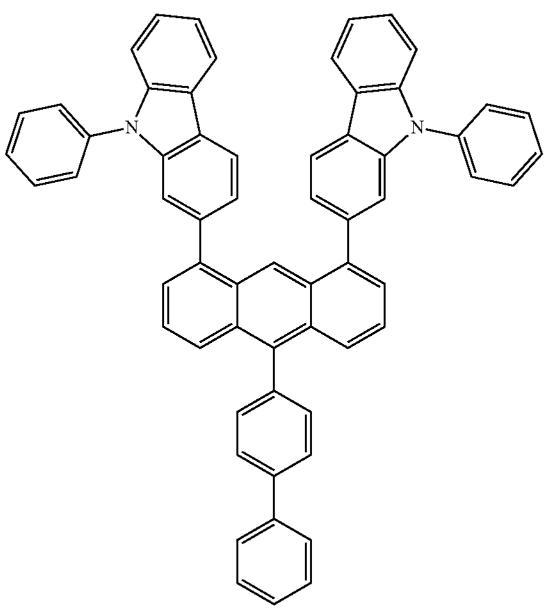
-continued
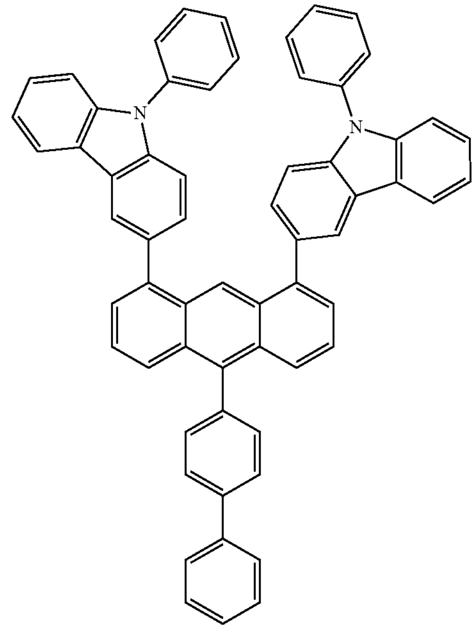
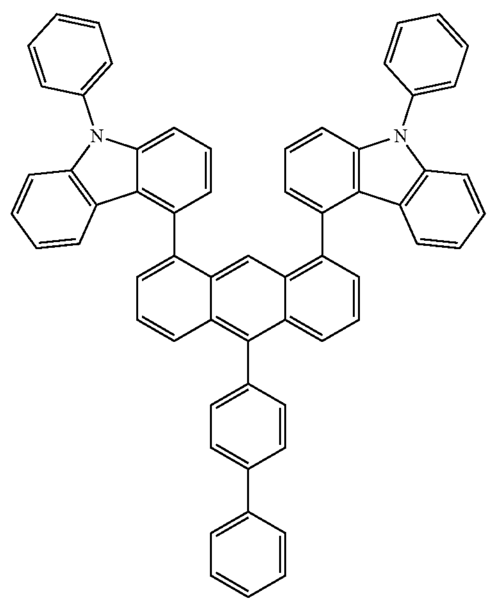

-continued
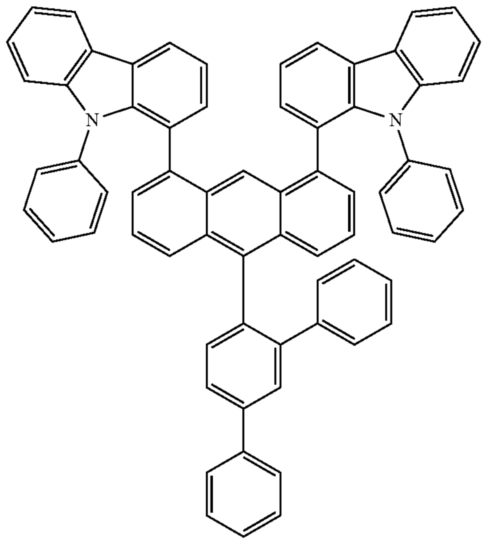
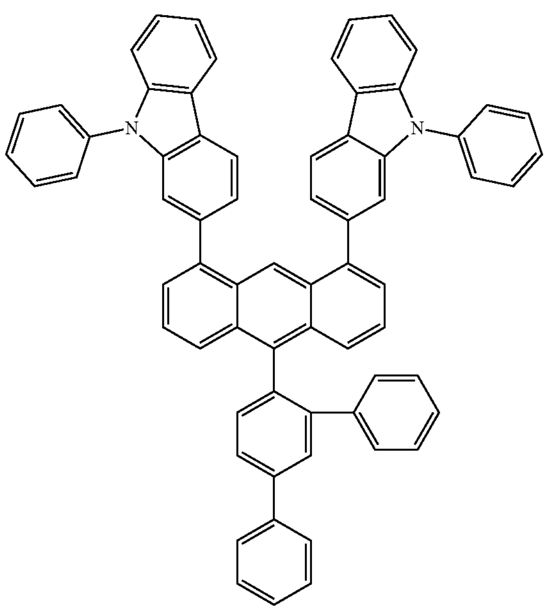
-continued
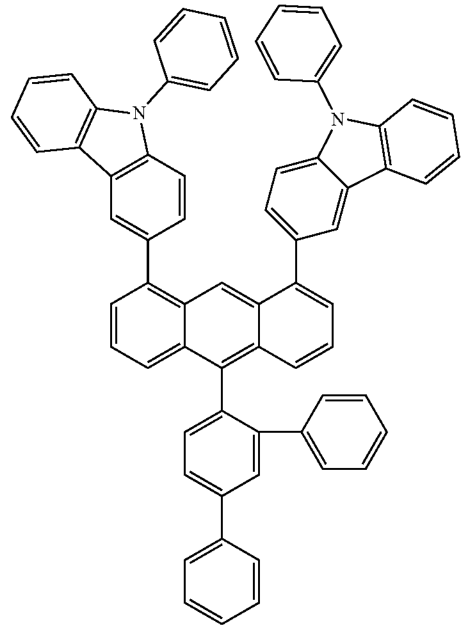
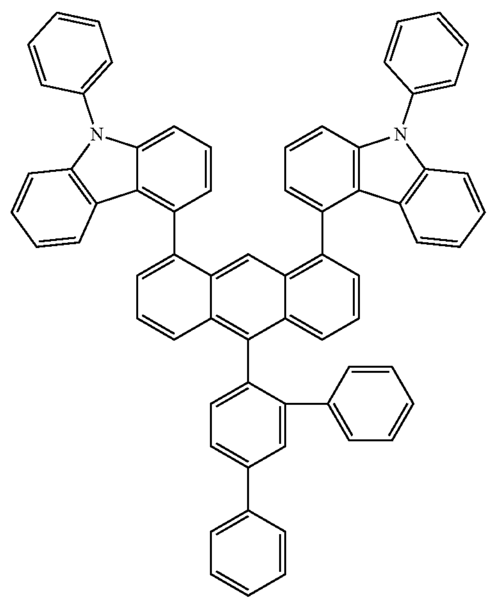
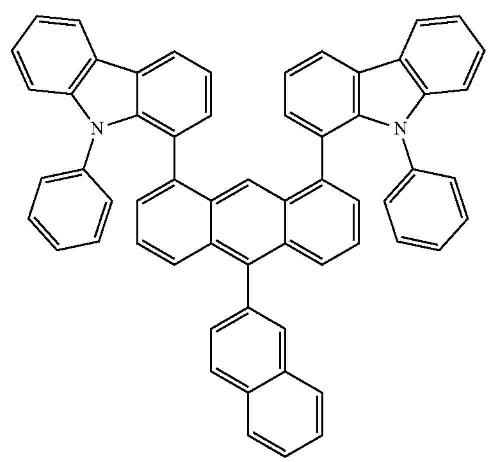

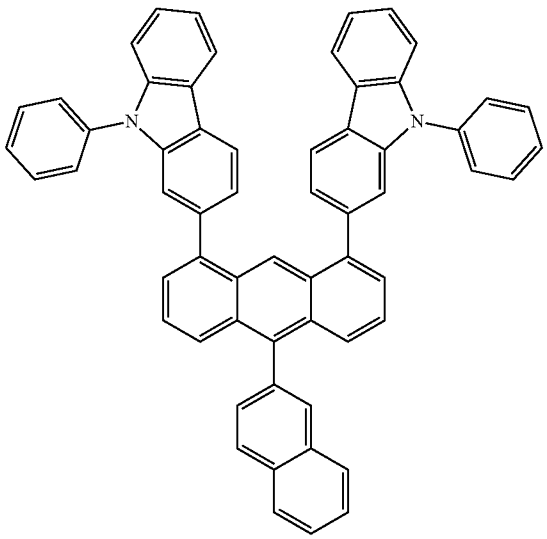
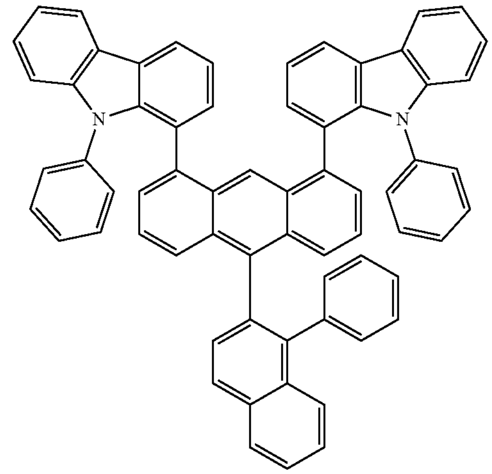
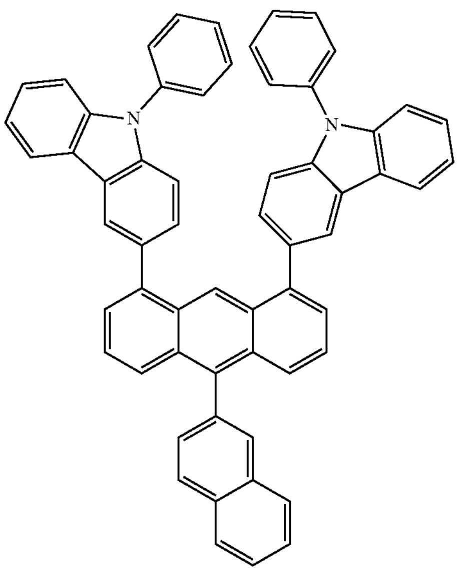
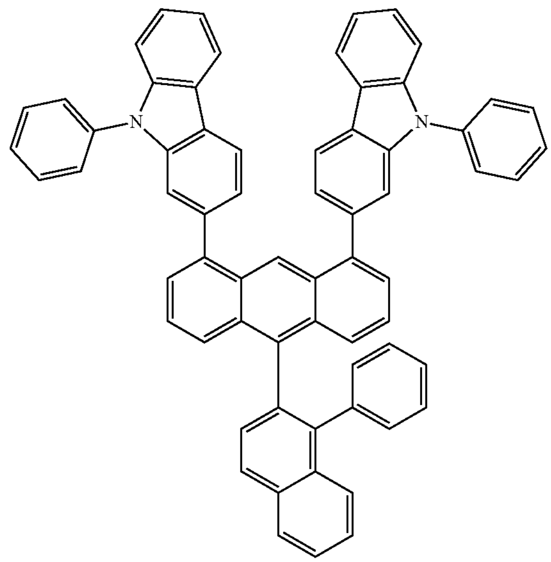
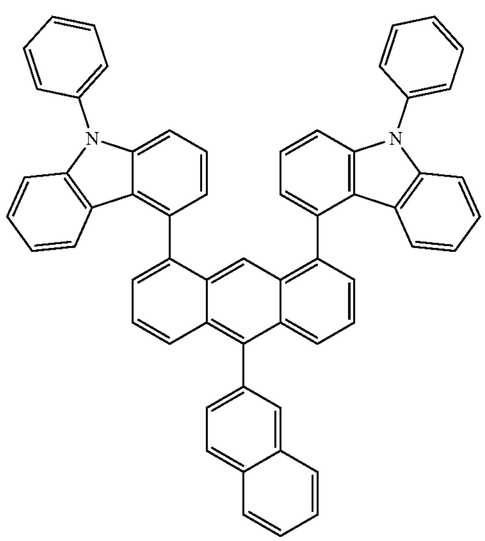
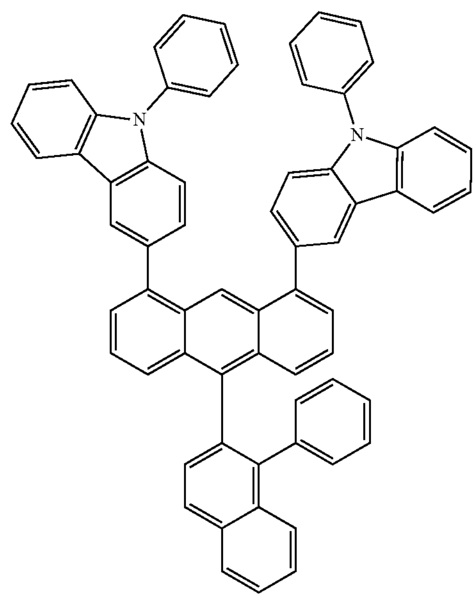

-continued
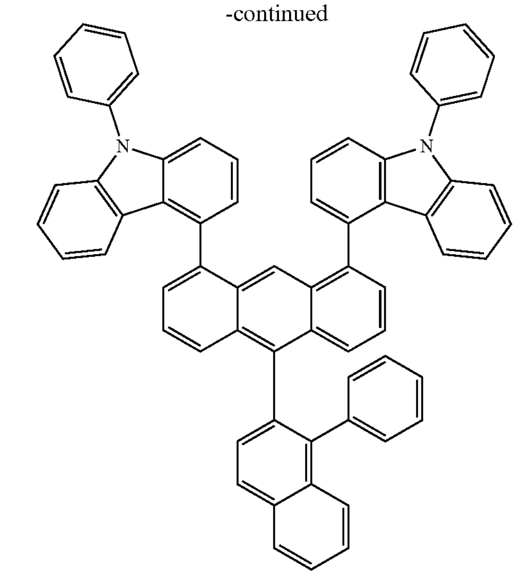
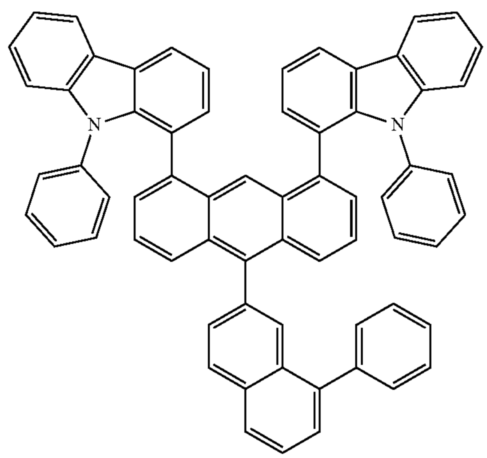
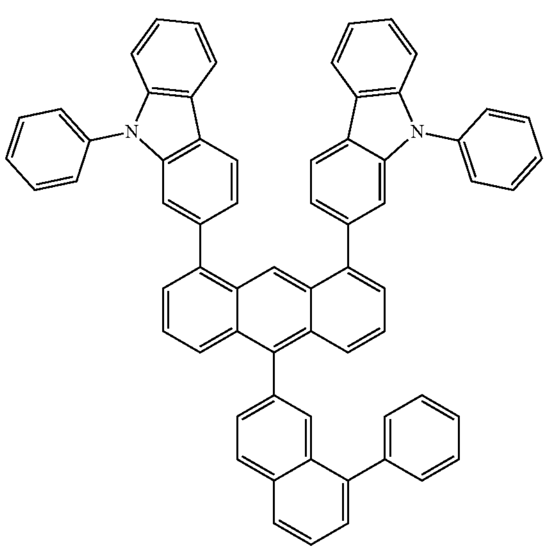
-continued
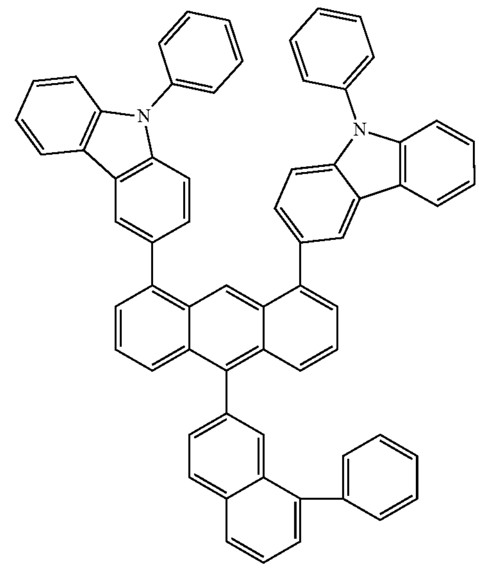
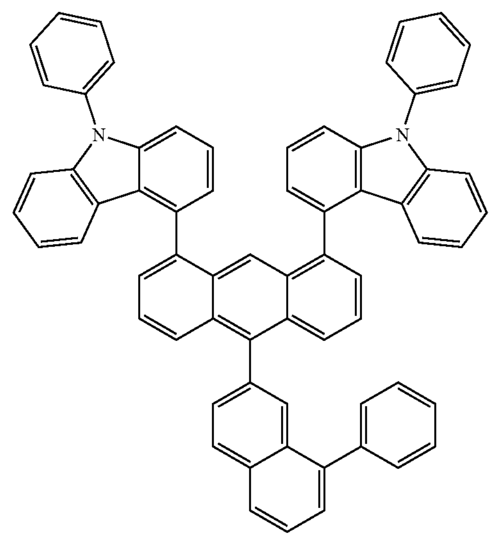
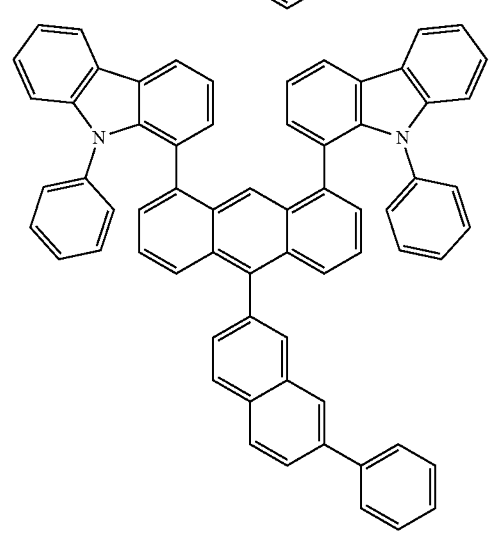

-continued
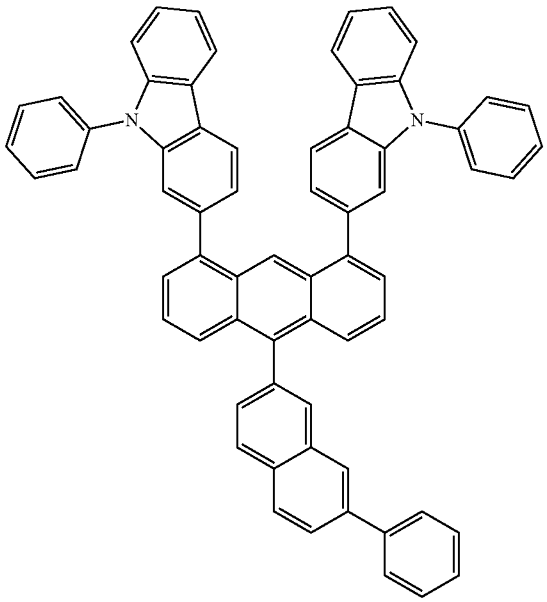
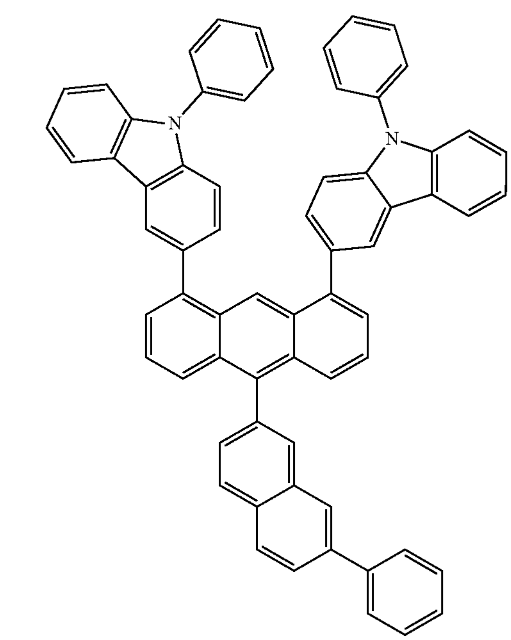
-continued
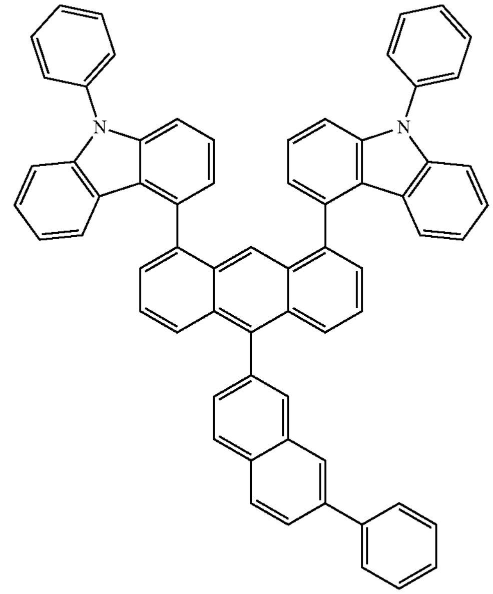
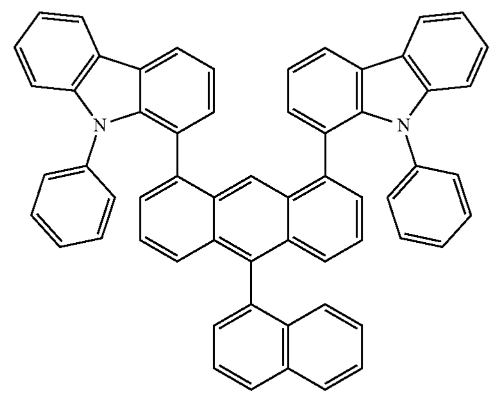
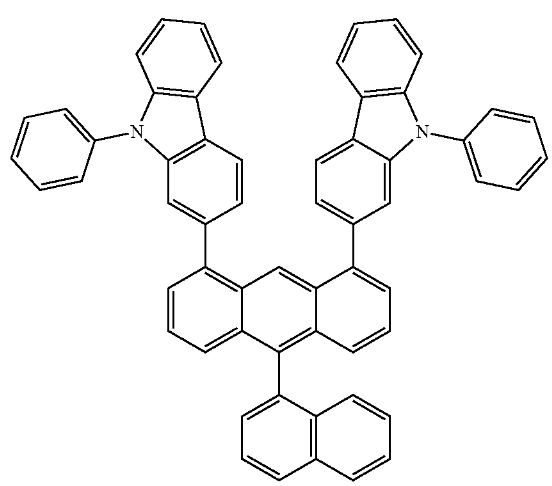

-continued
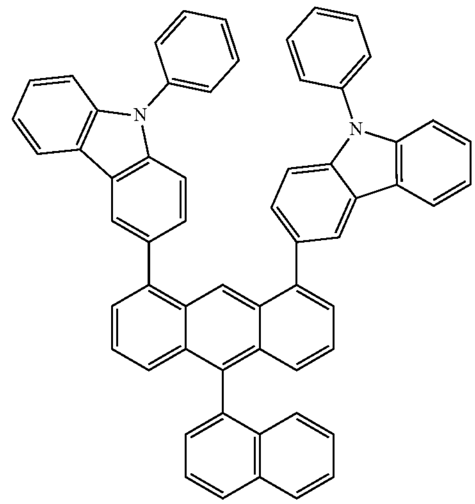
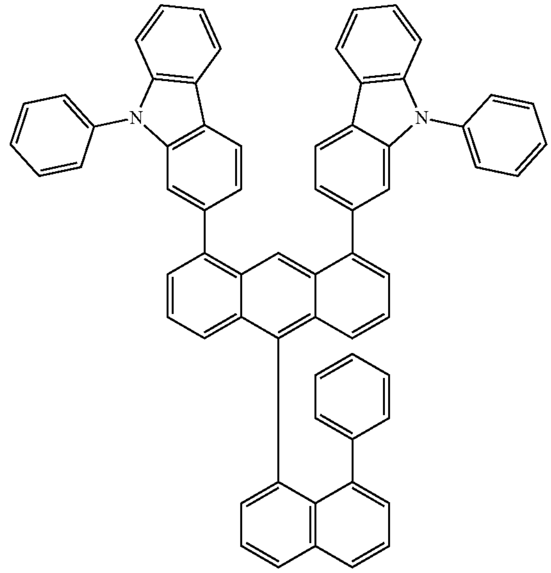
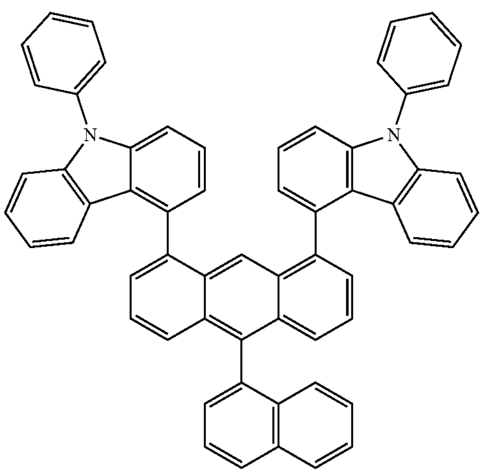
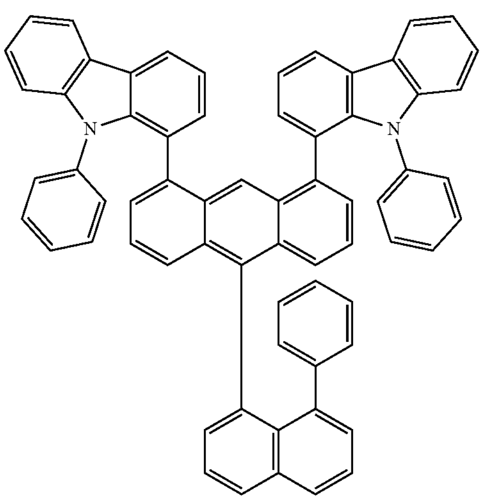
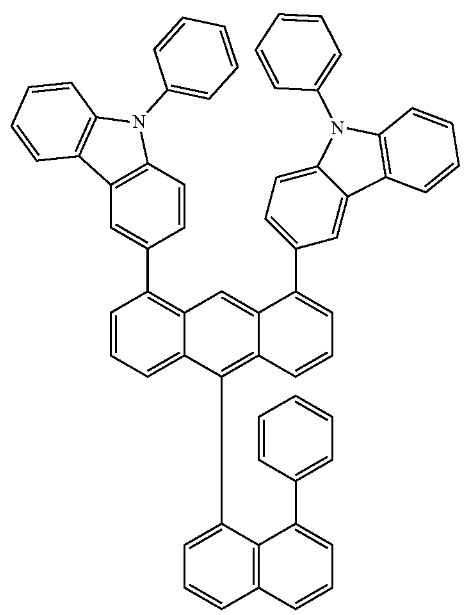

-continued
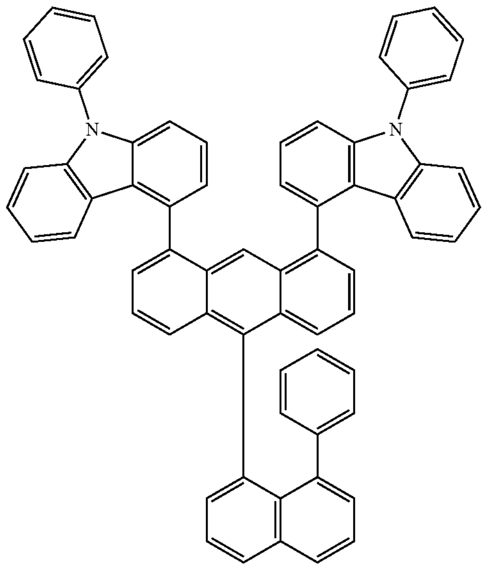
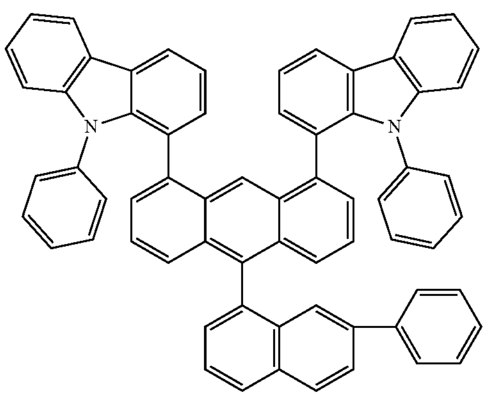
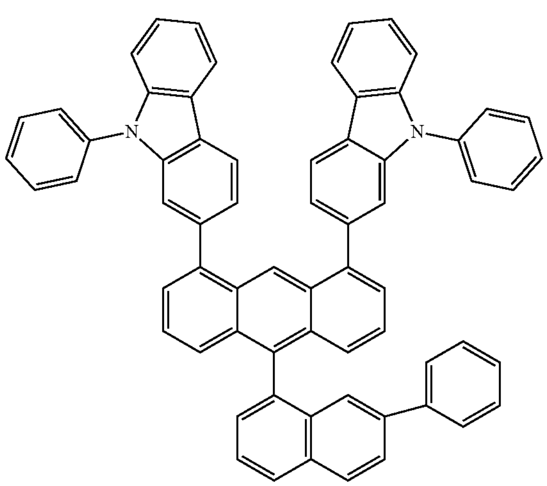
-continued
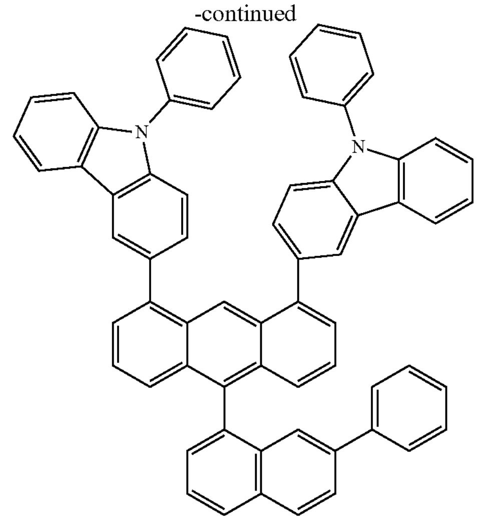
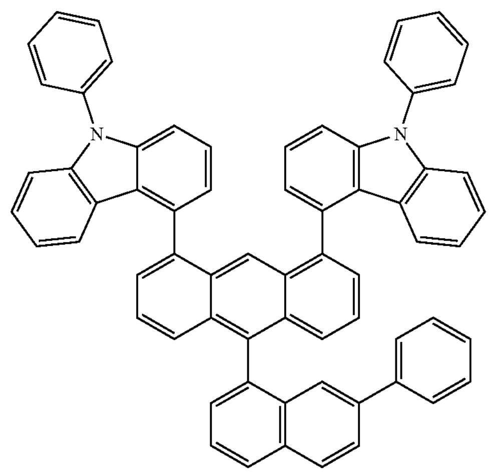
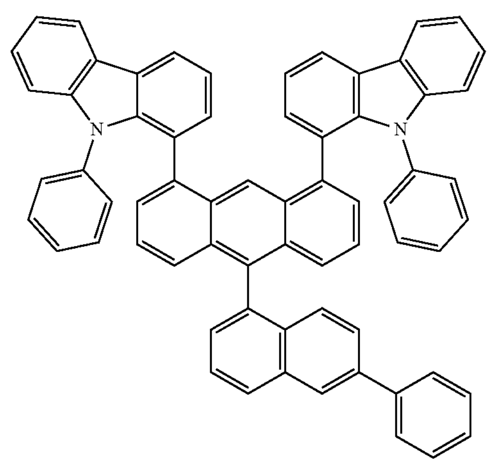

-continued
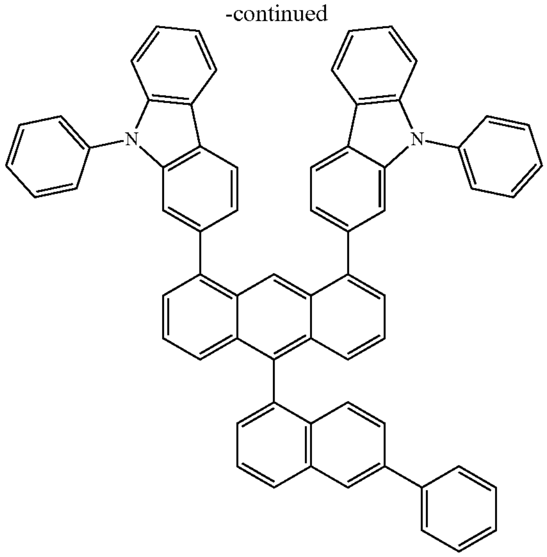
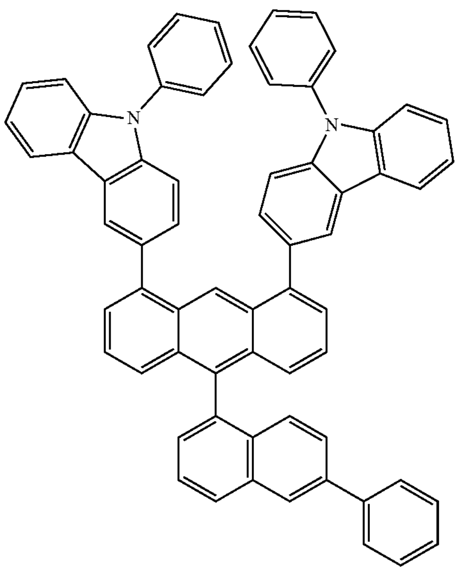
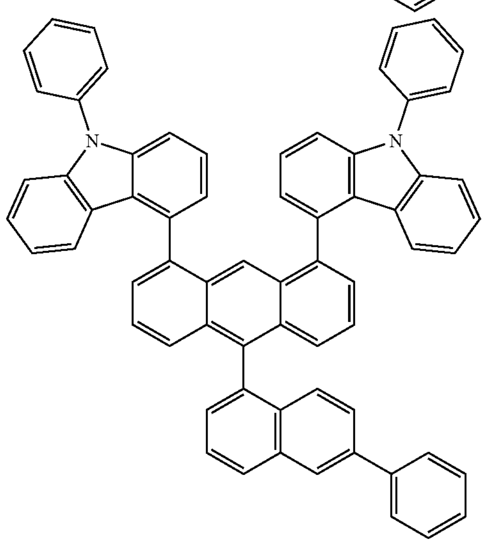
-continued
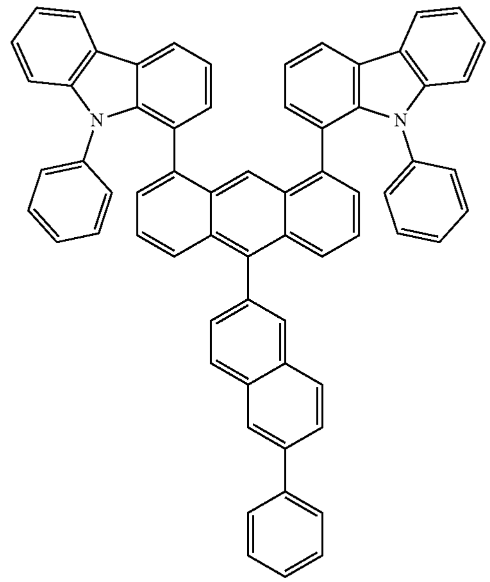
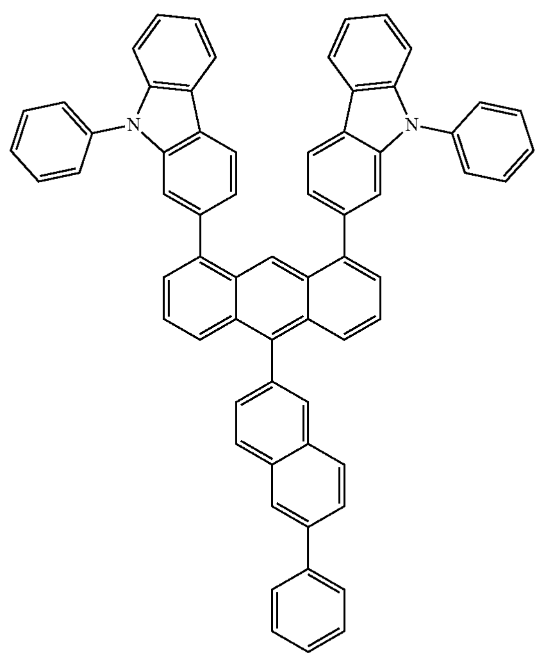

-continued
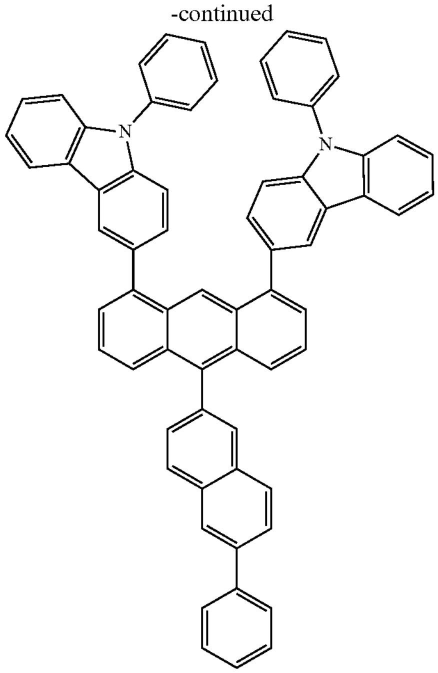
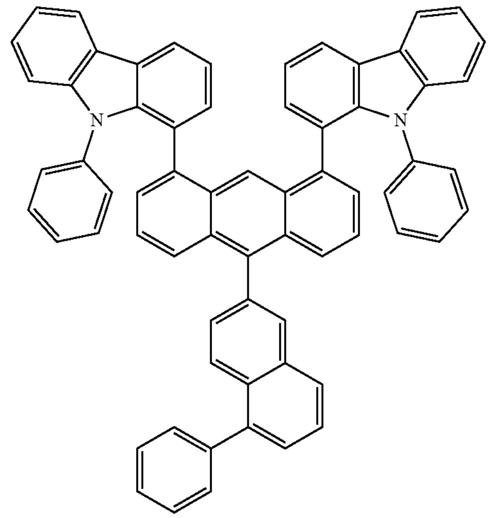
-continued
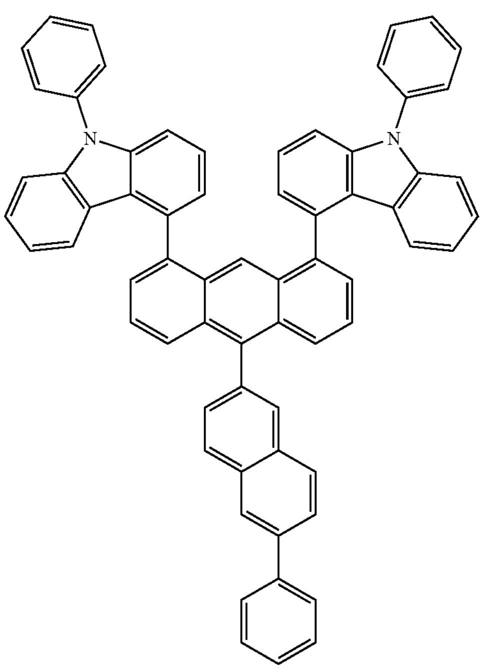
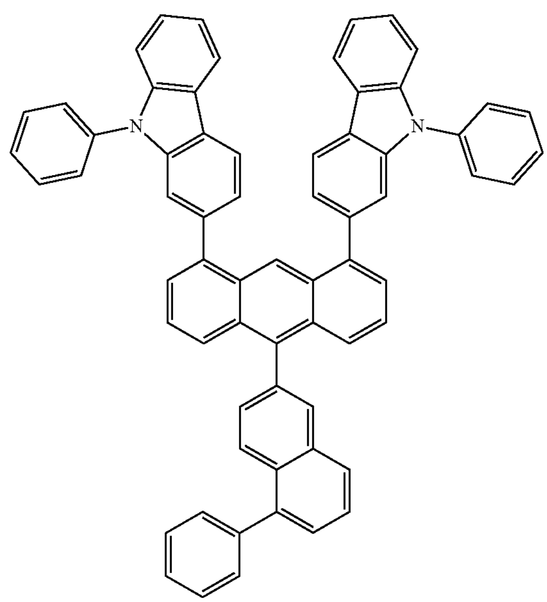

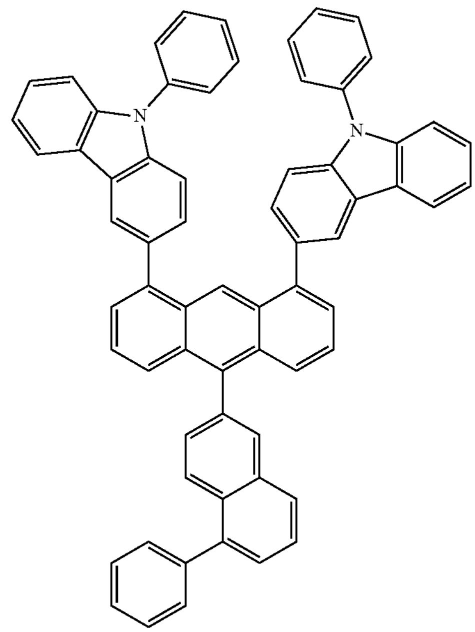
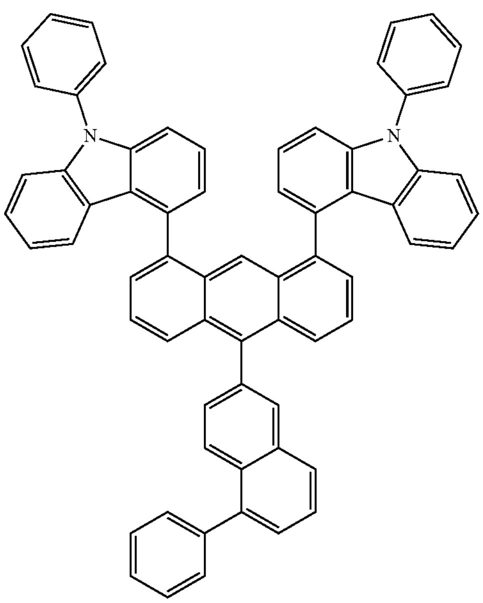
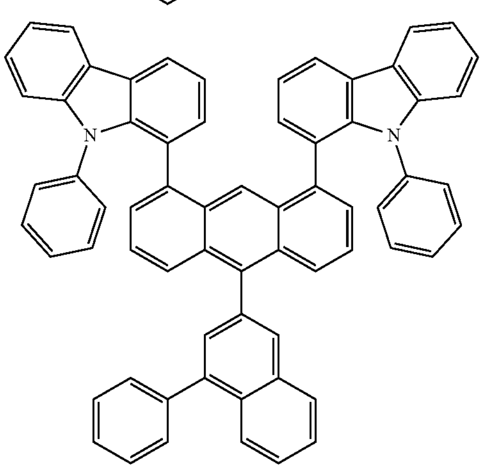
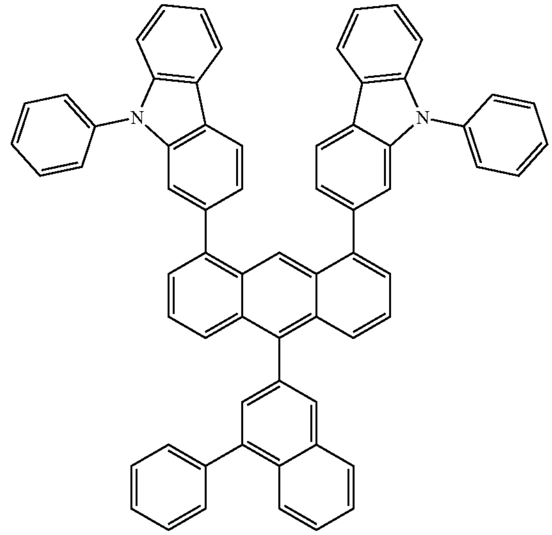
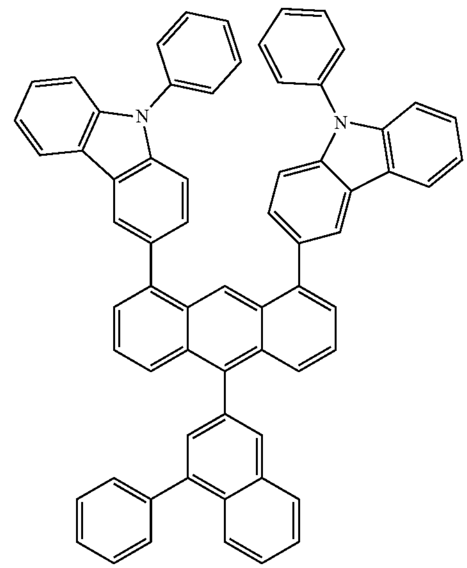
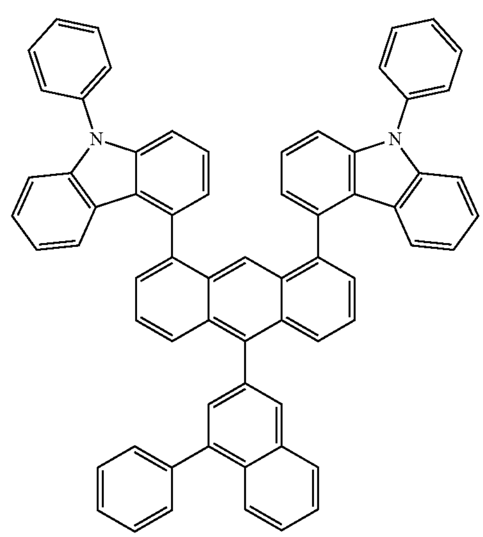

-continued
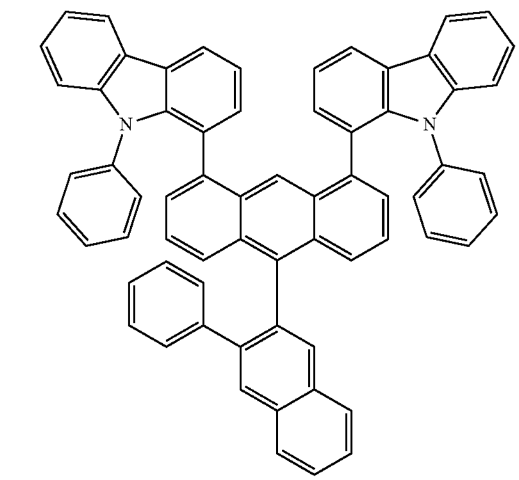
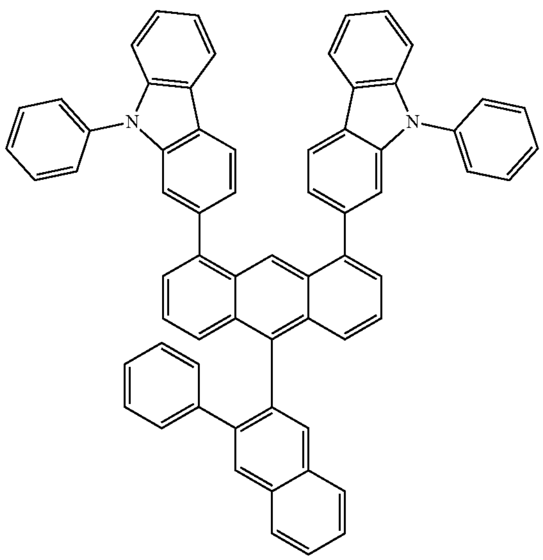
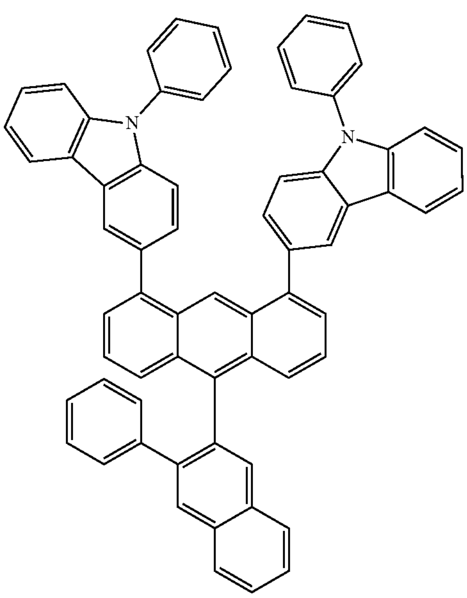
-continued
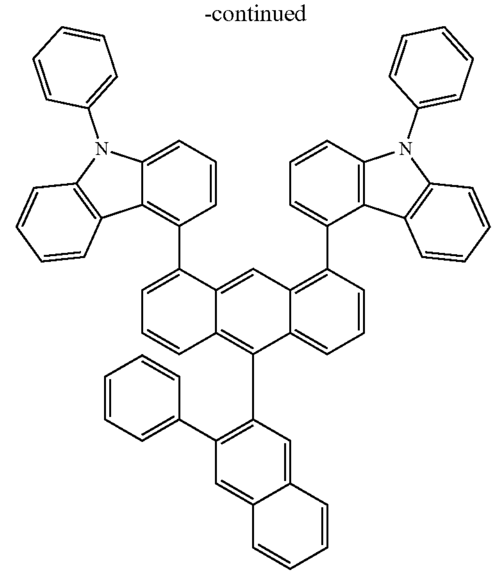
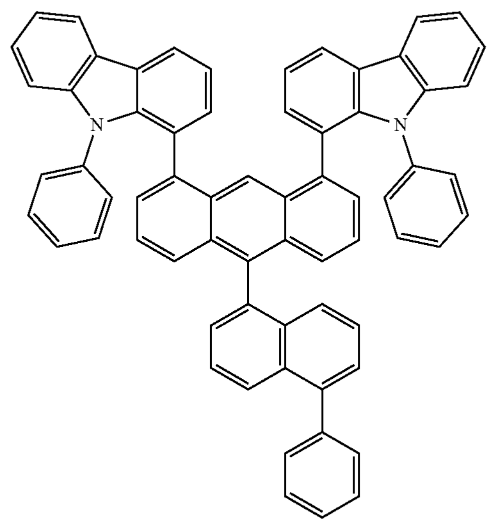
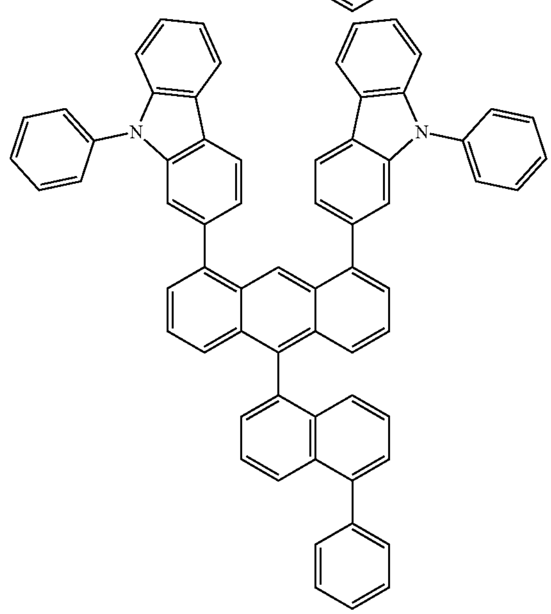

-continued
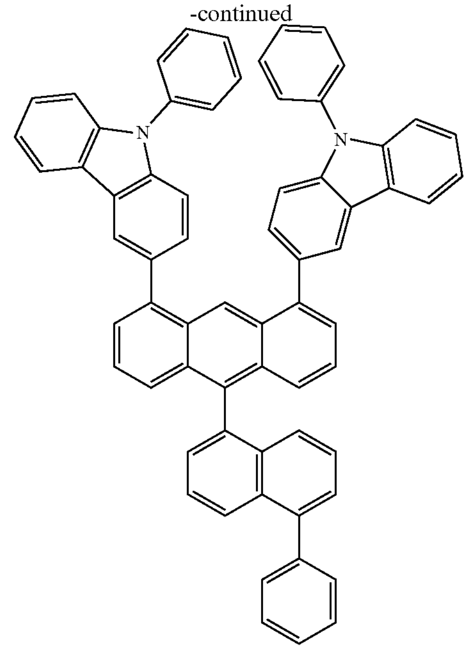
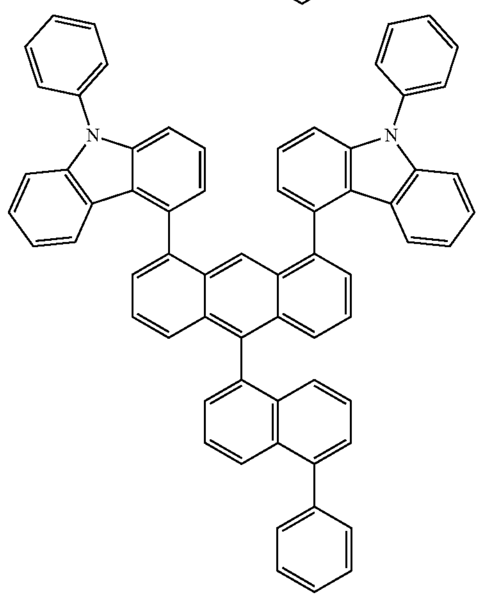
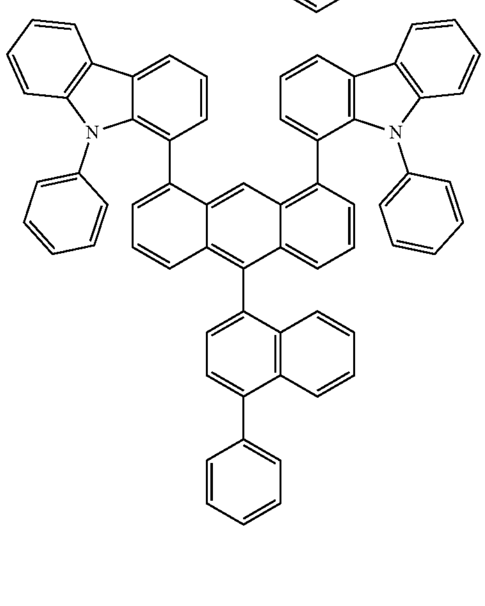
-continued
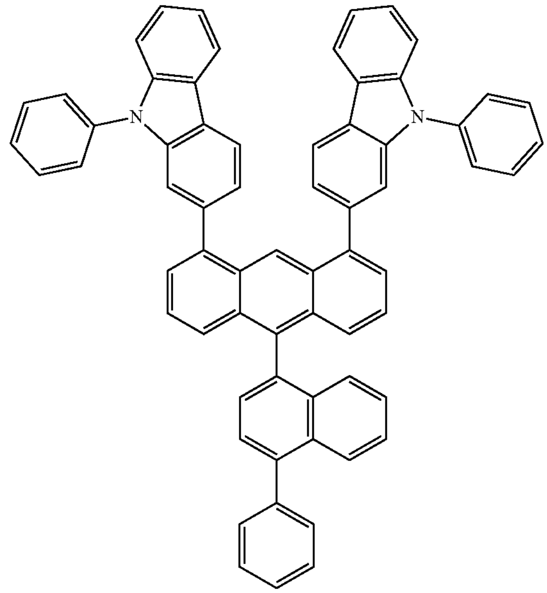
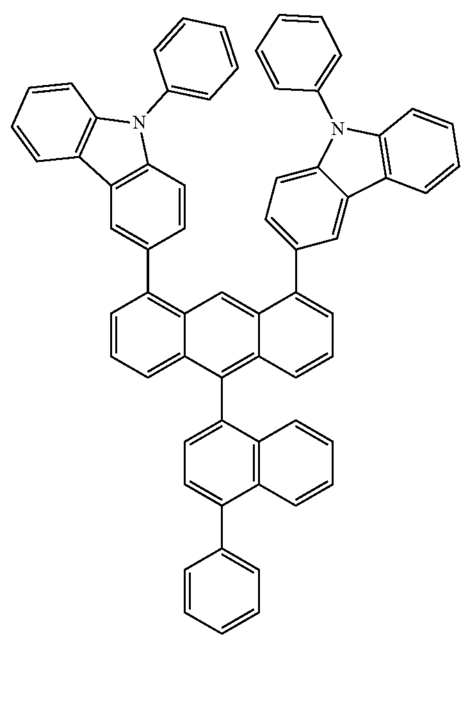

-continued
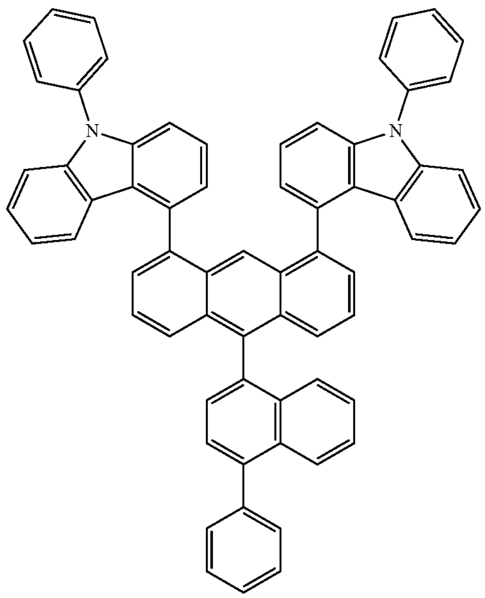
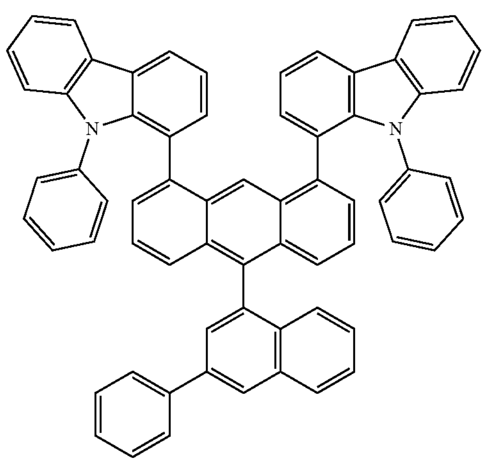
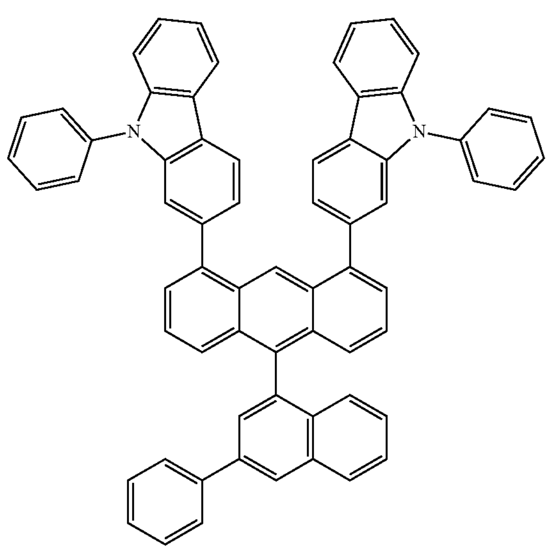
-continued
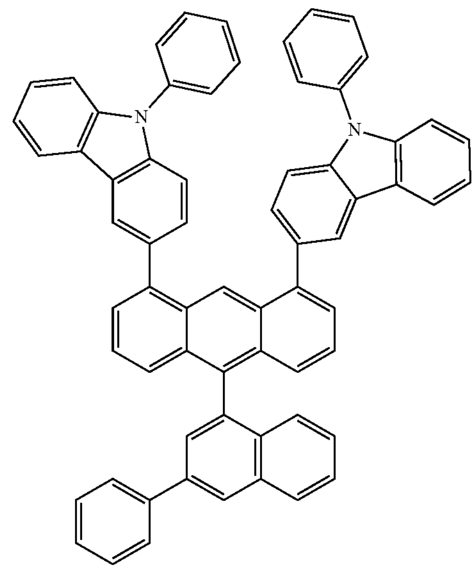
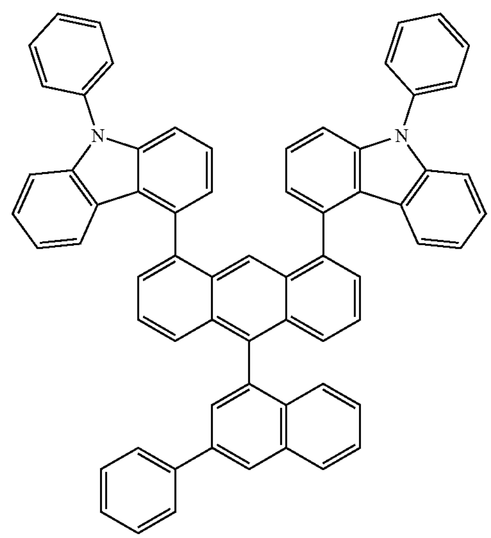
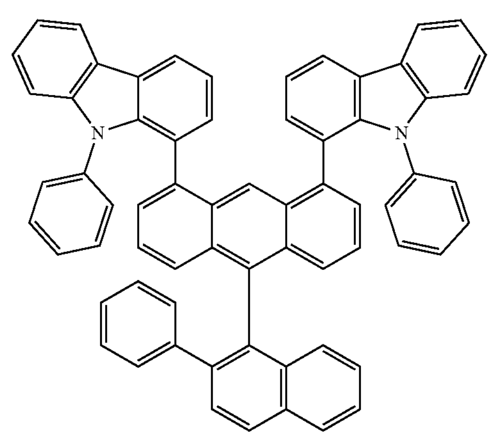

-continued
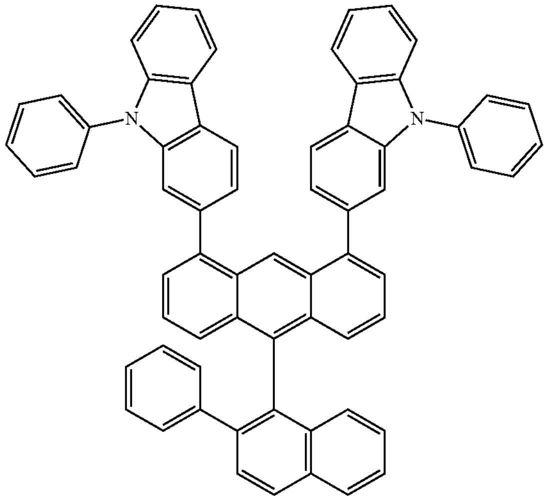
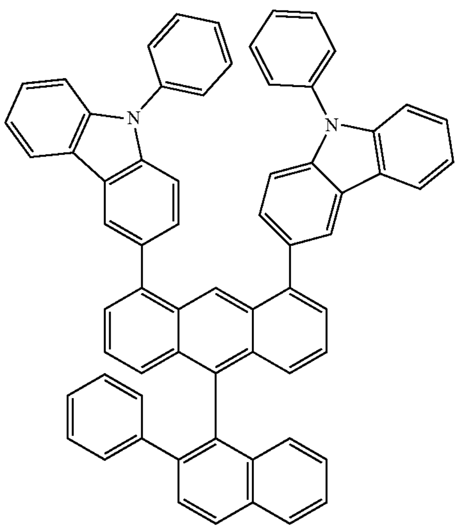
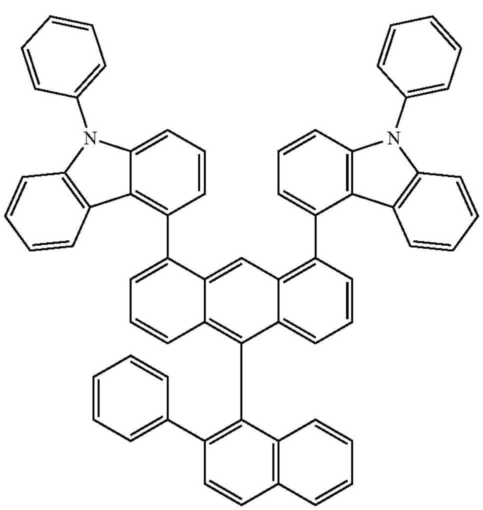
-continued
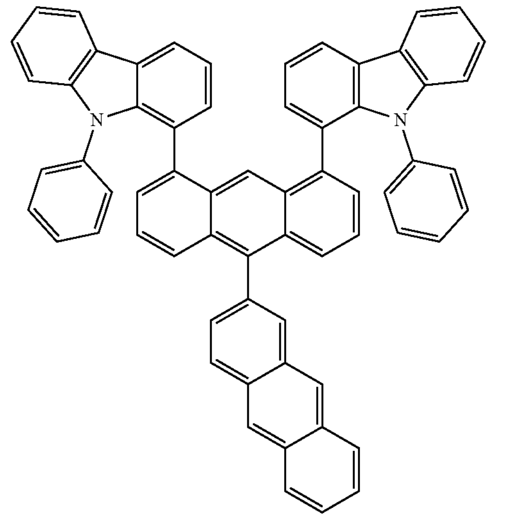
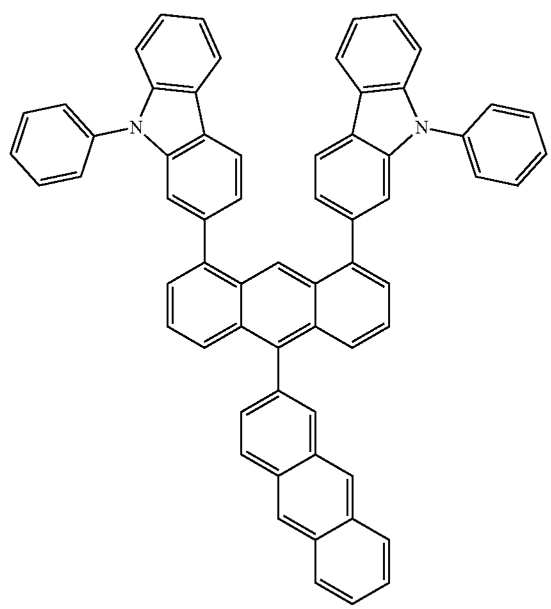

-continued
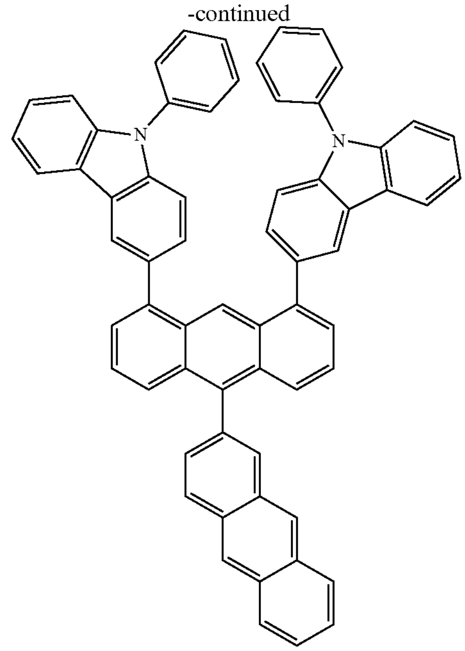
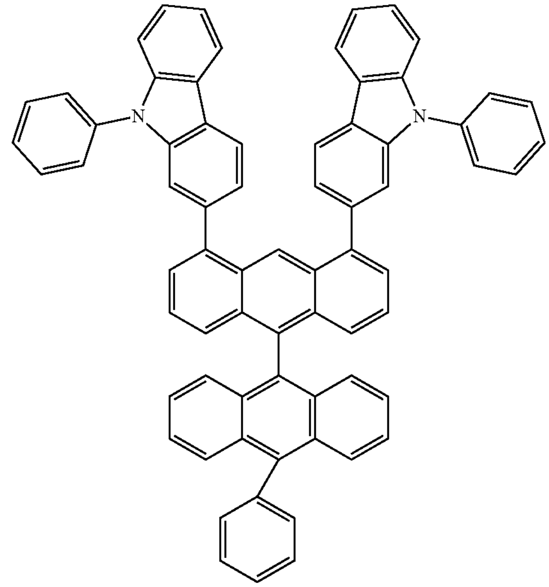
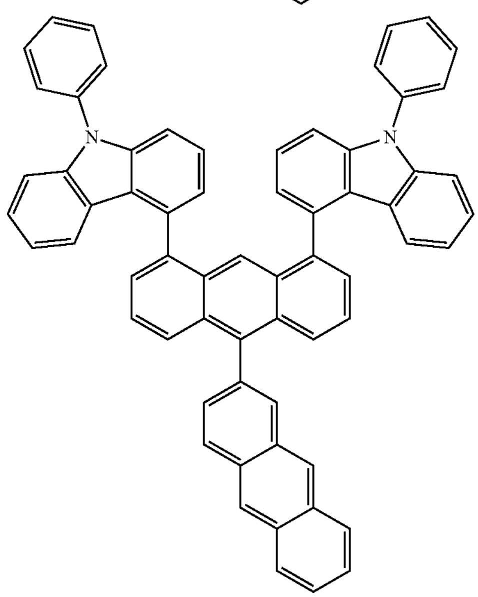
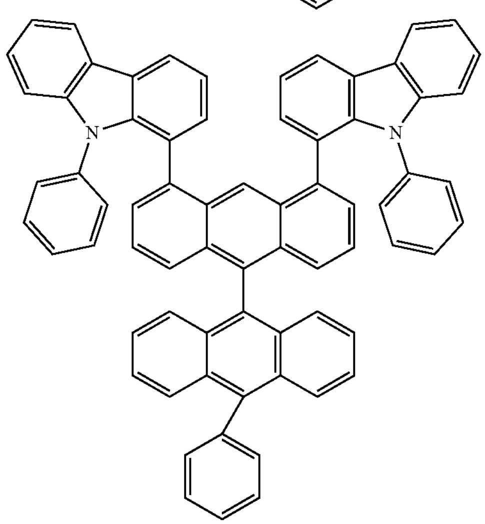
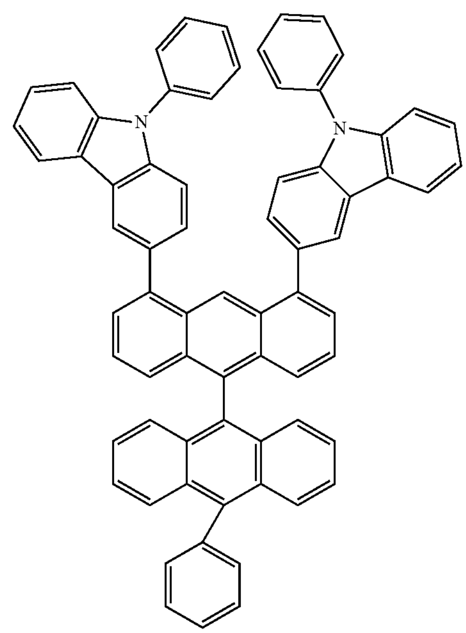

-continued
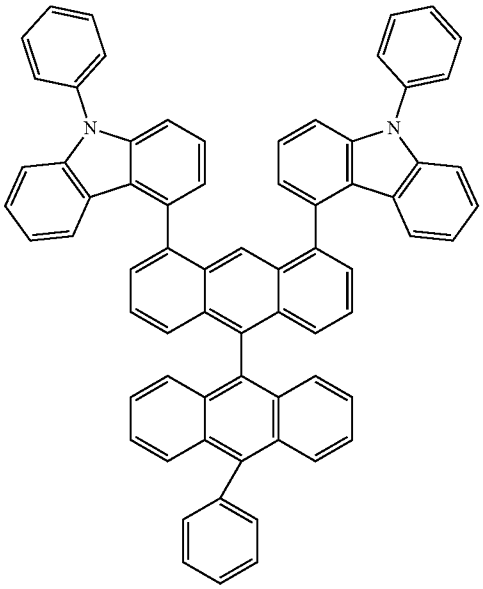
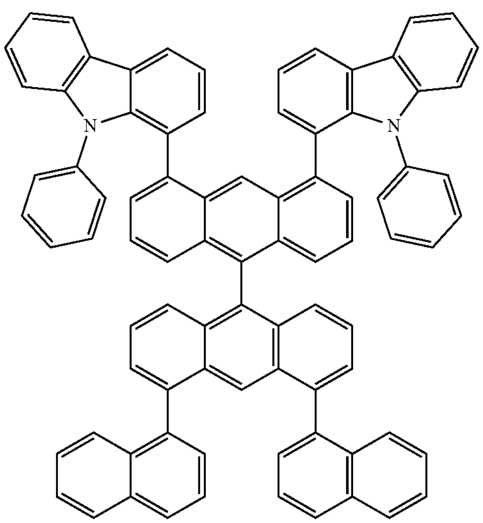
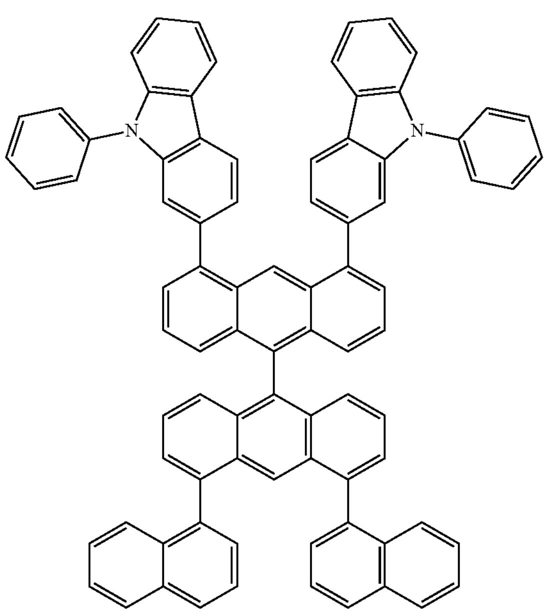
-continued
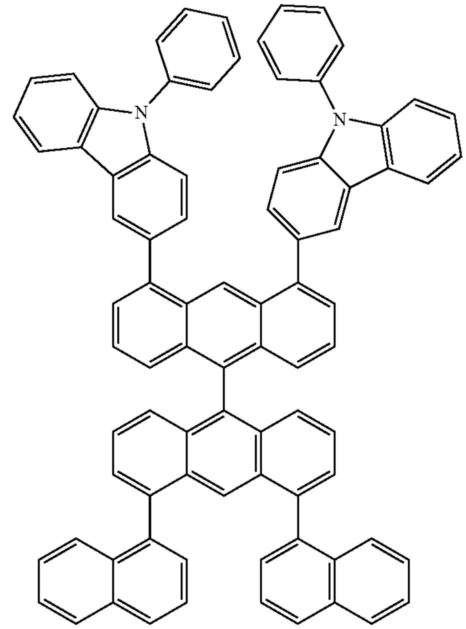
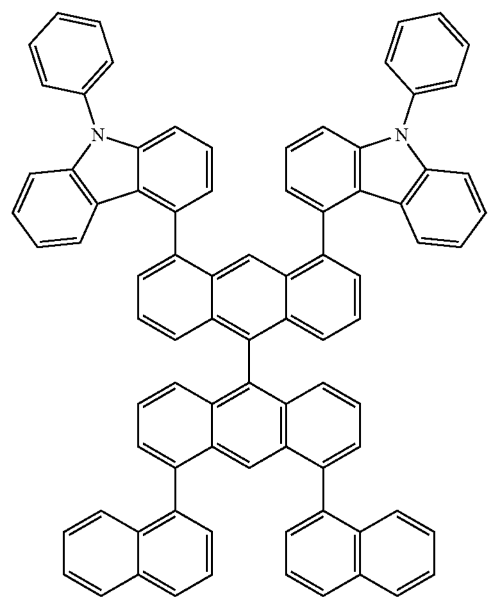
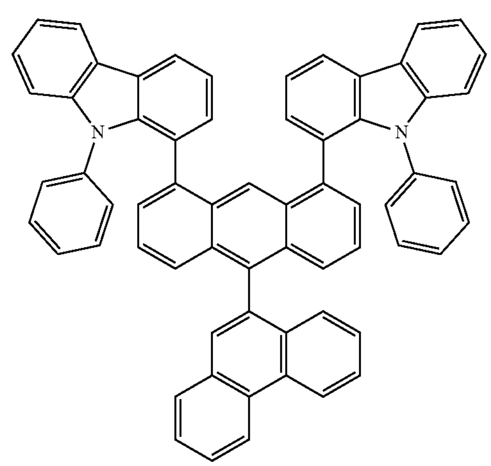

-continued
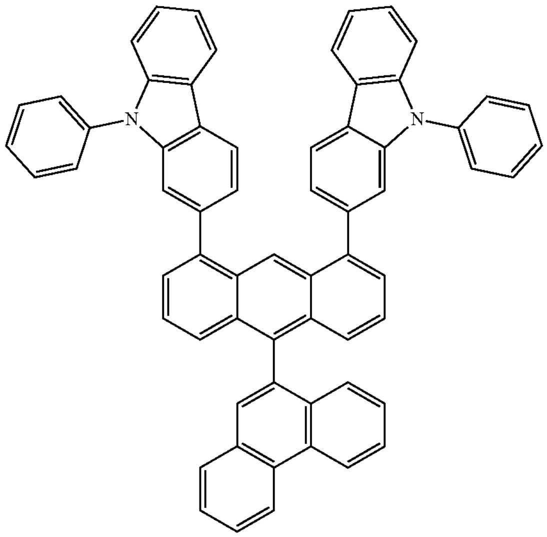
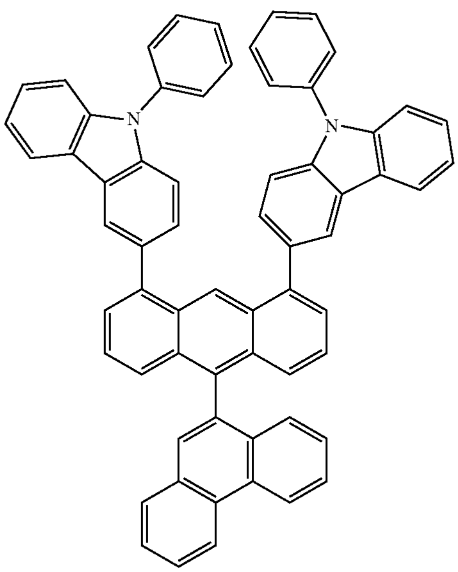
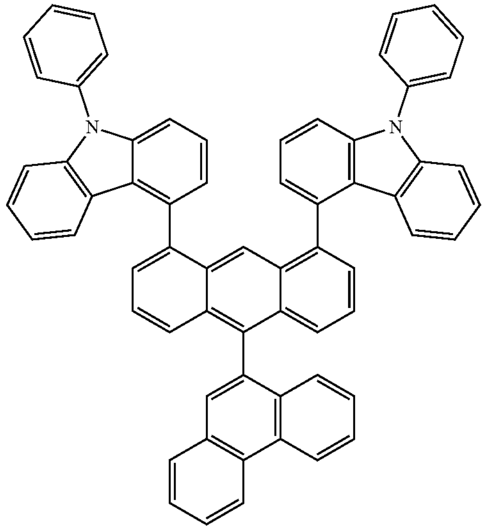
-continued
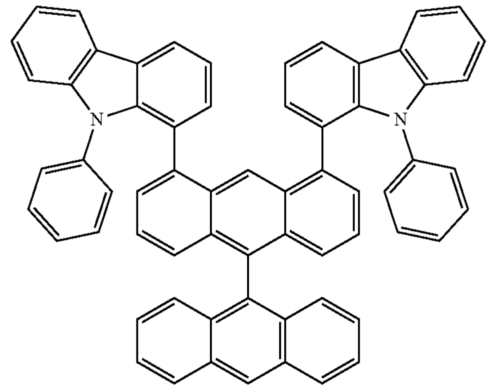
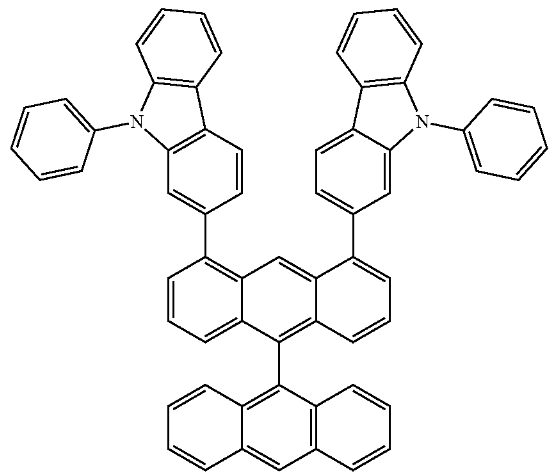
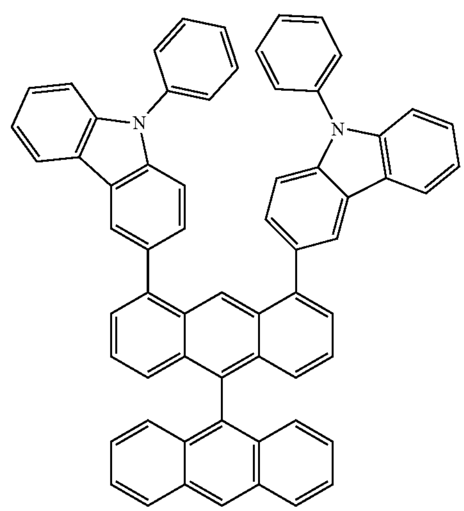

-continued
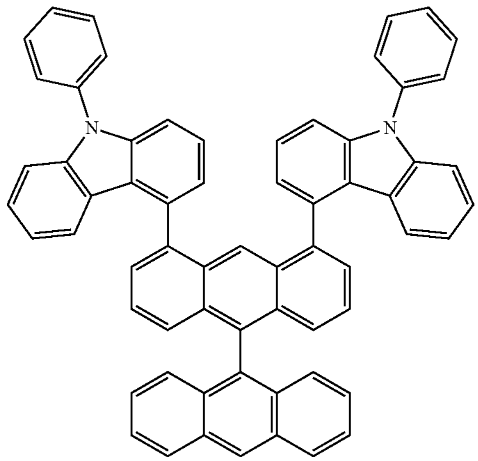
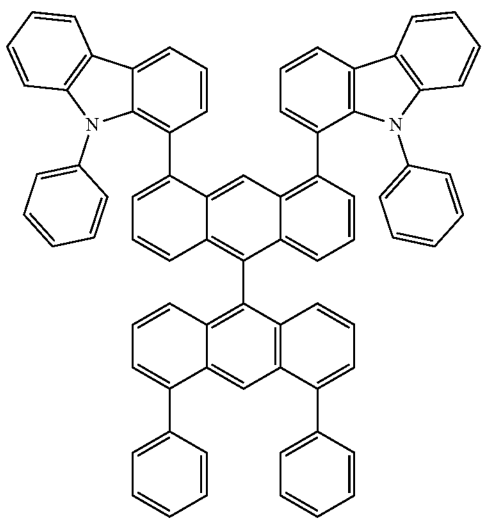
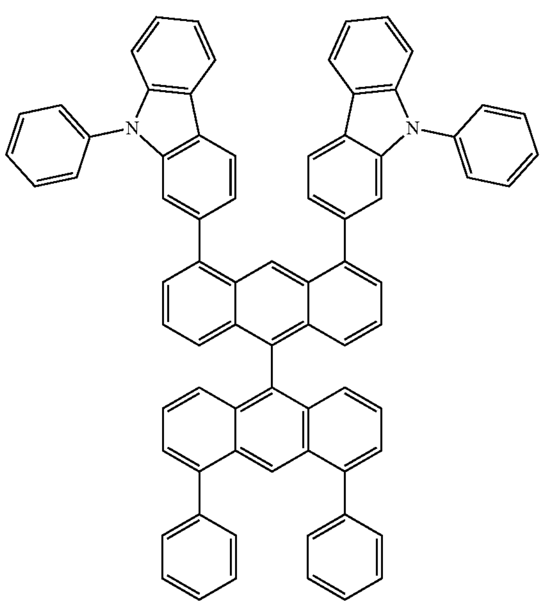
-continued
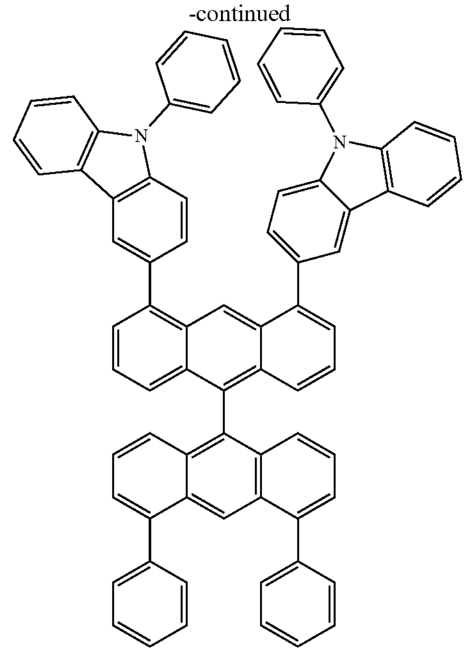
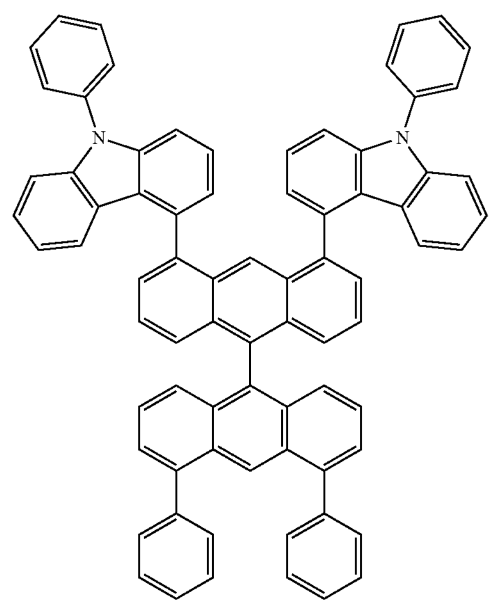

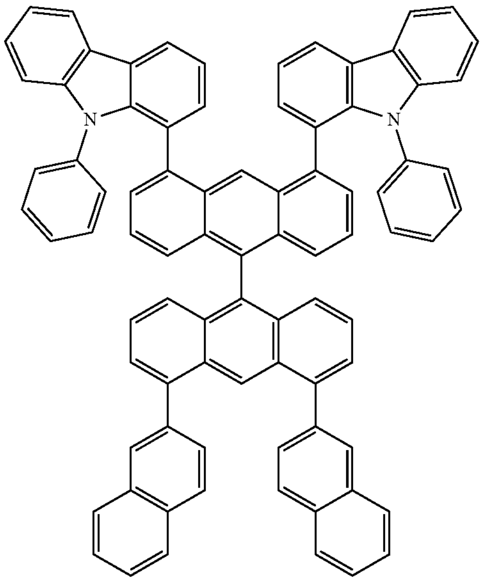
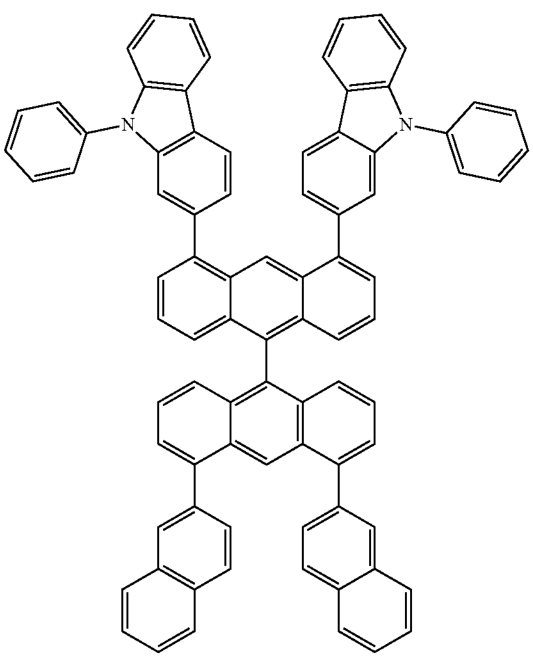
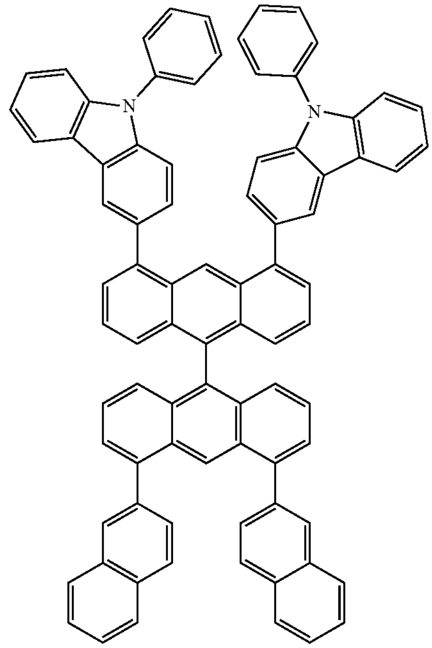 [SMILES: c1ccc(-n2c3ccccc3c3cc(-c4cccc5c(-c6c7cccc(-c8ccc9ccccc9c8)c7cc7c(-c8ccc9ccccc9c8)cccc67)c6cccc(-c7ccc8c(c7)c7ccccc7n8-c7ccccc7)c6cc45)ccc32)cc1]
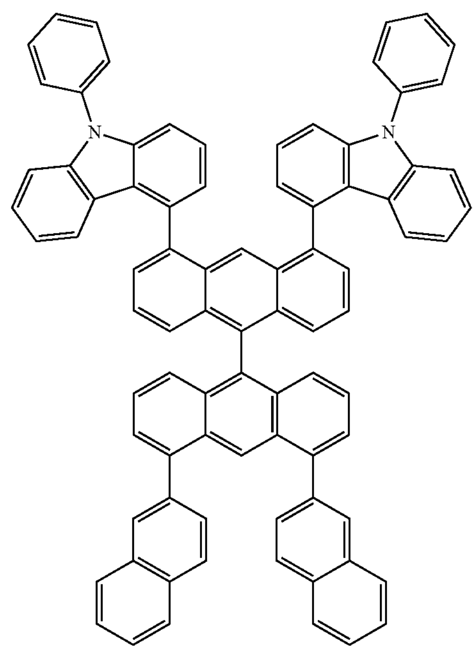

-continued
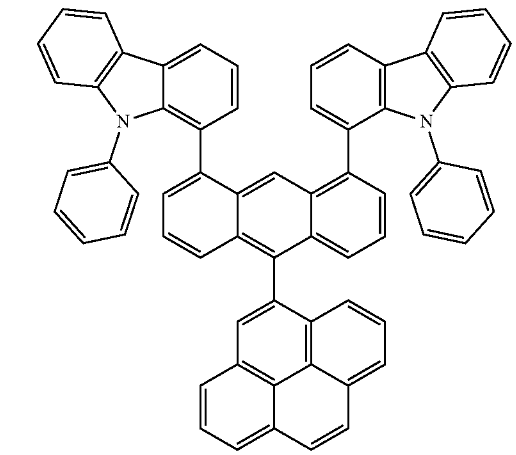
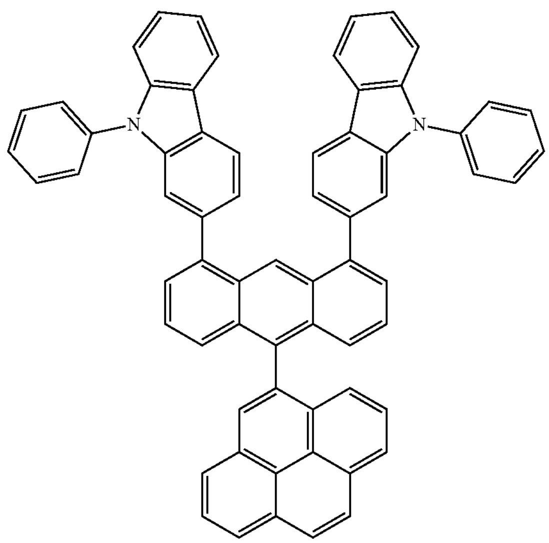
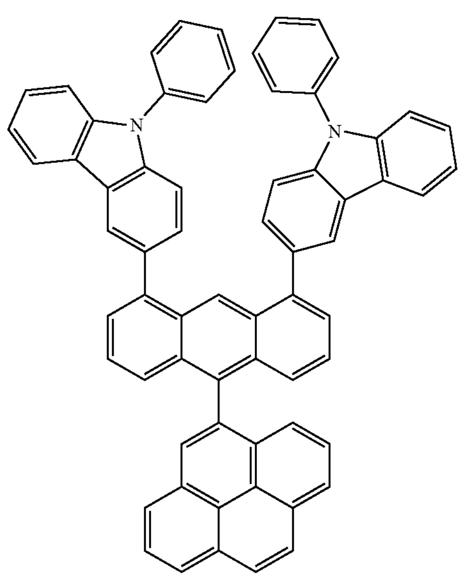
-continued
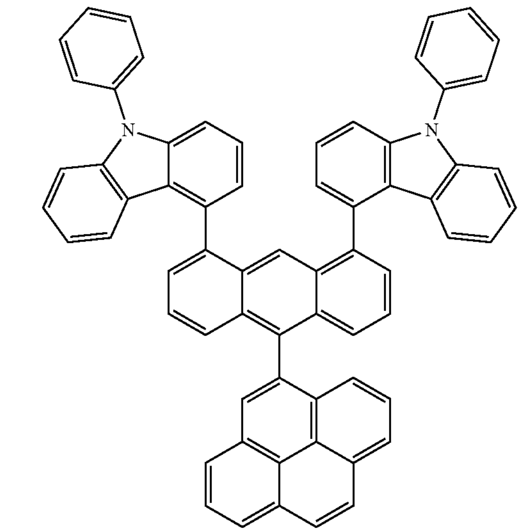
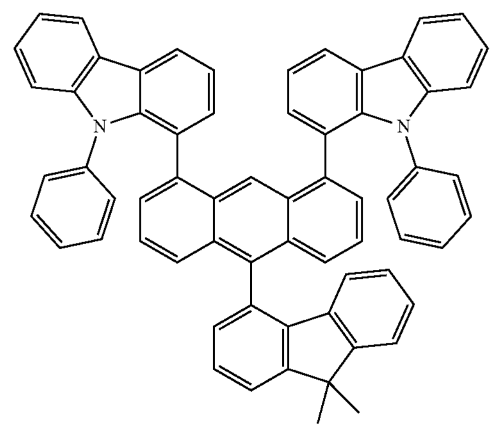
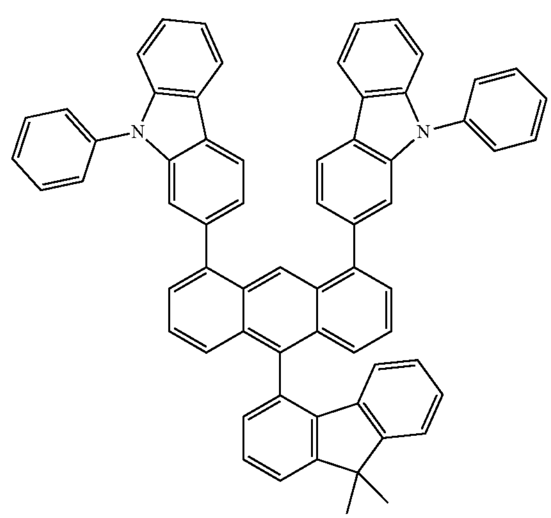

-continued
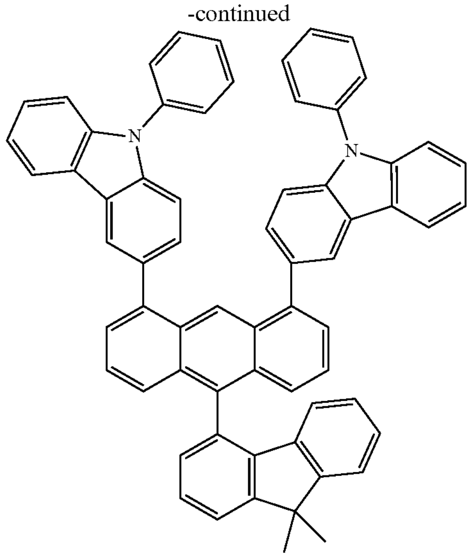
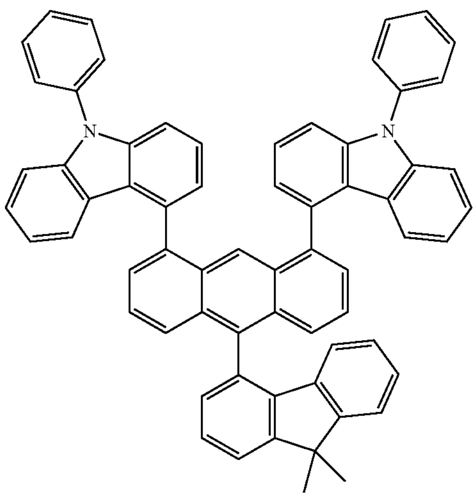
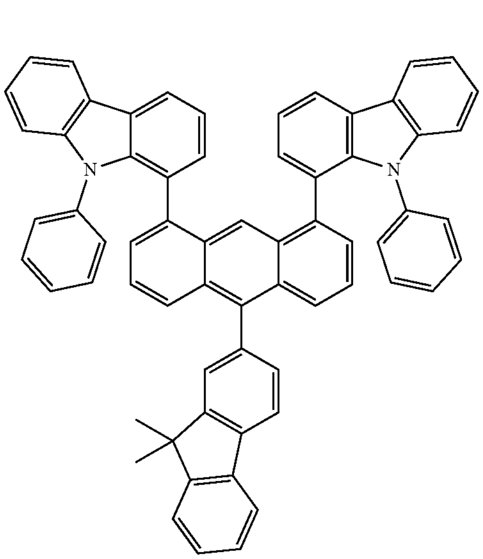
-continued
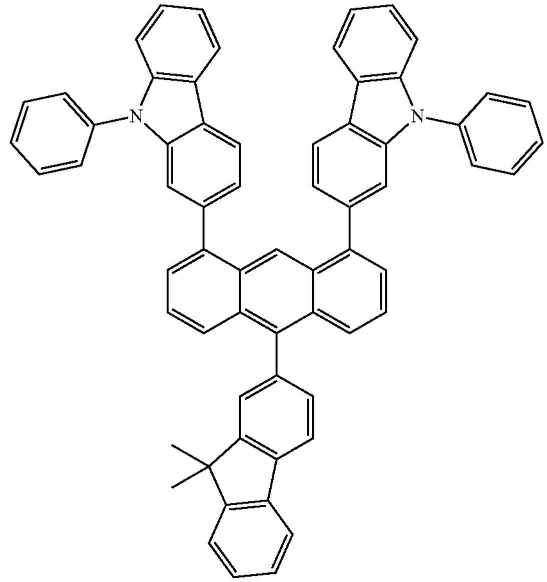
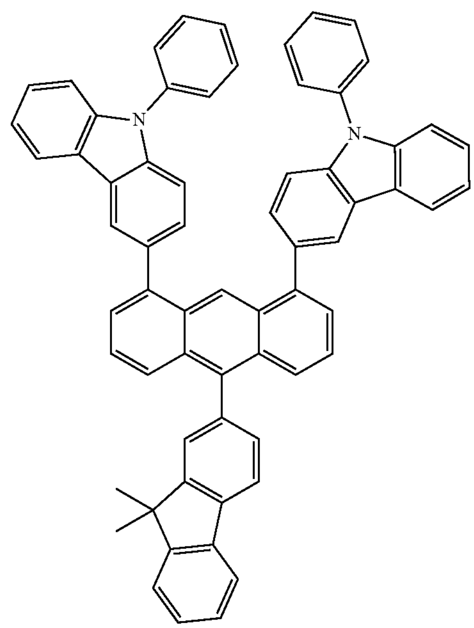

-continued
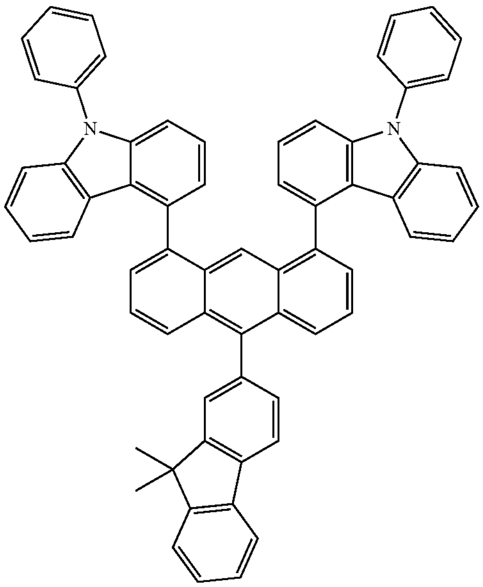
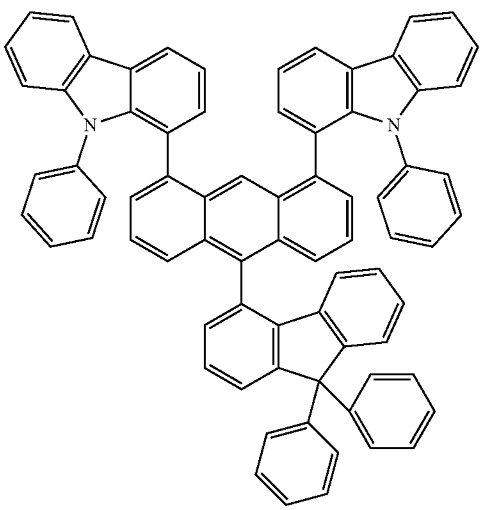
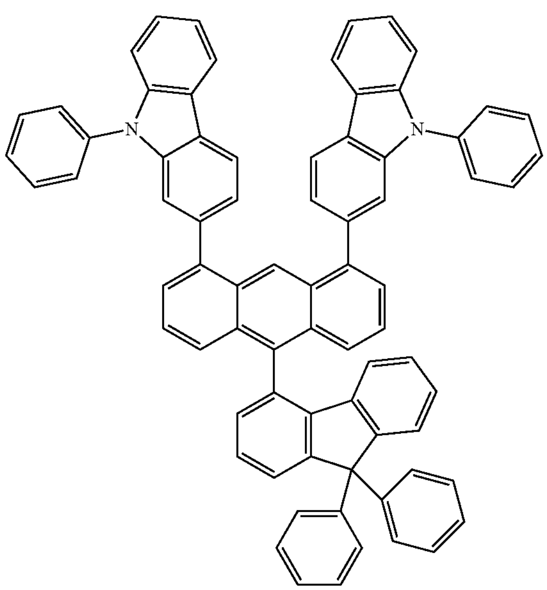
-continued
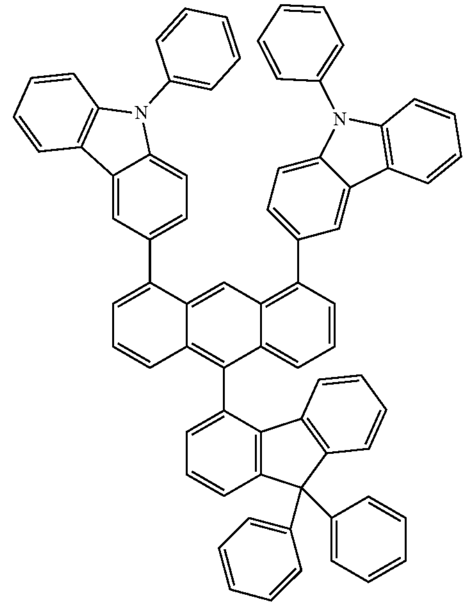
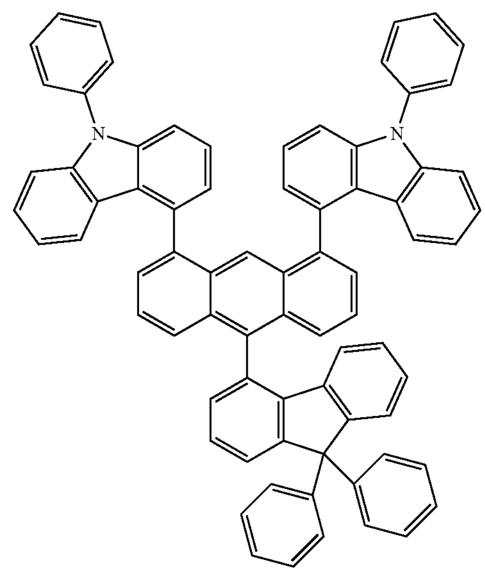
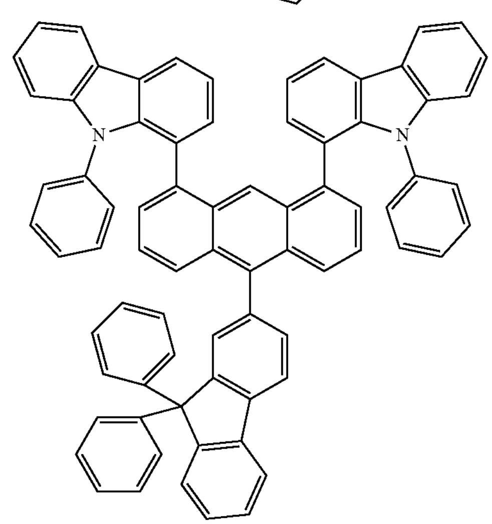

-continued
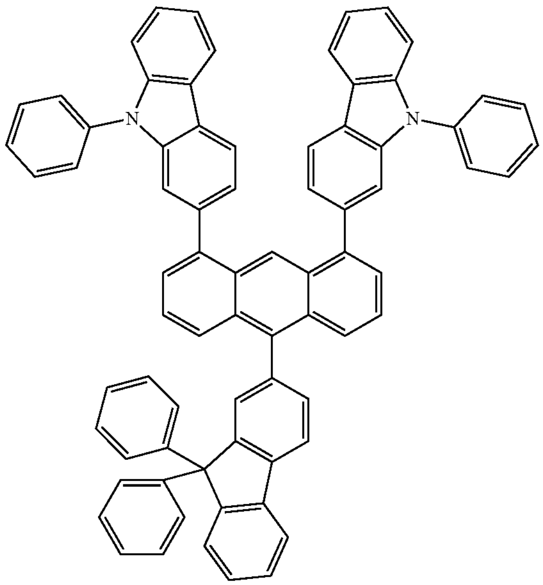
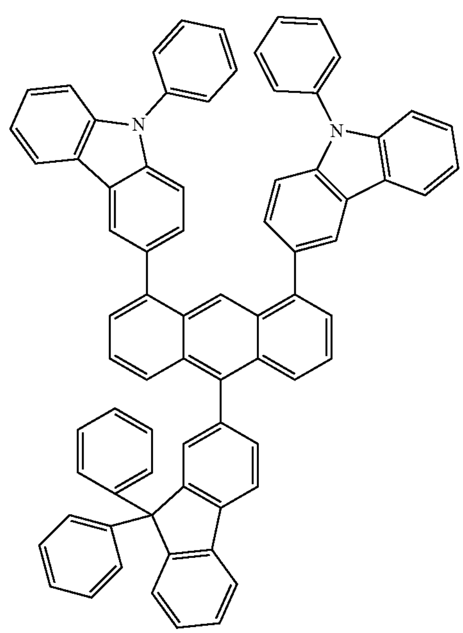
-continued
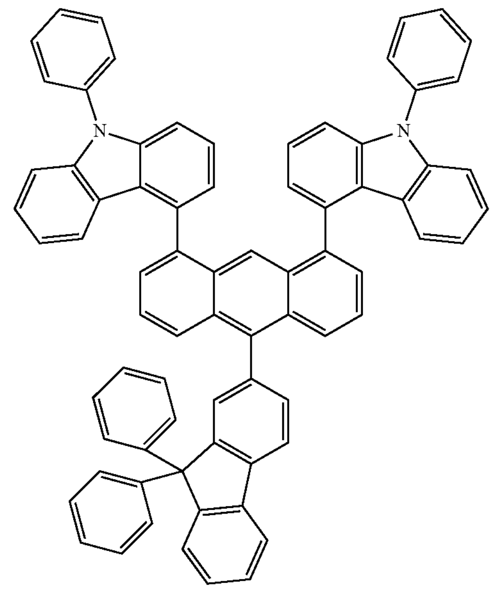
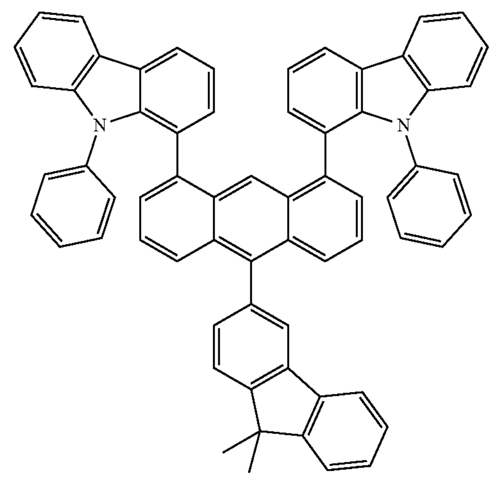
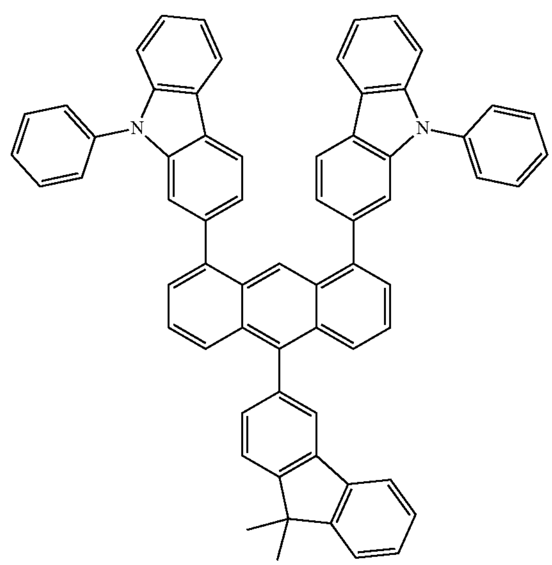

-continued
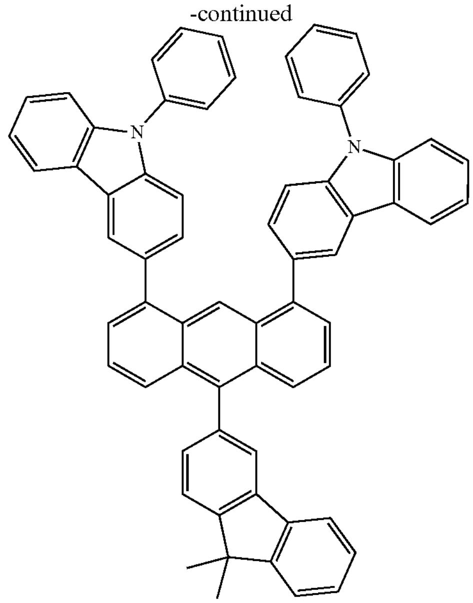
-continued
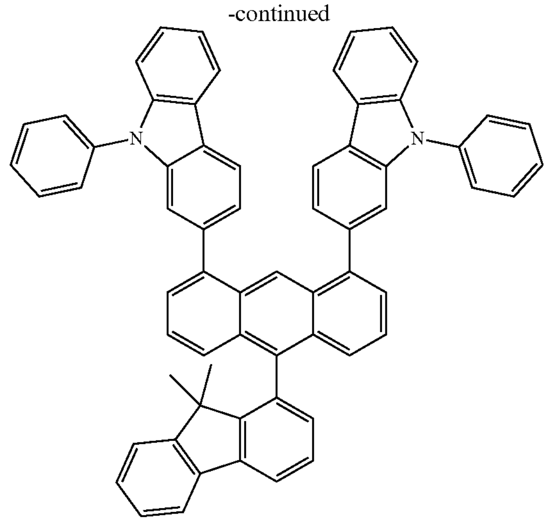
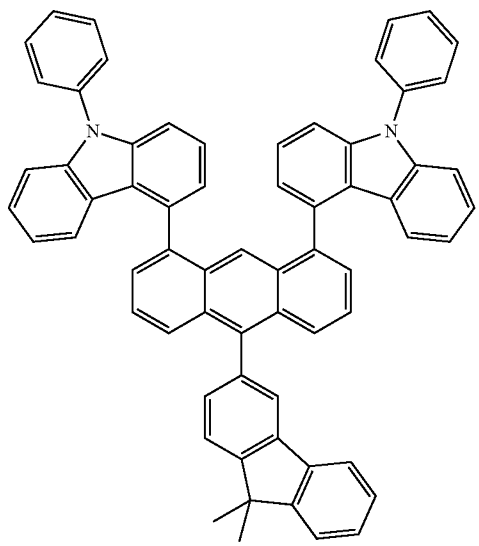
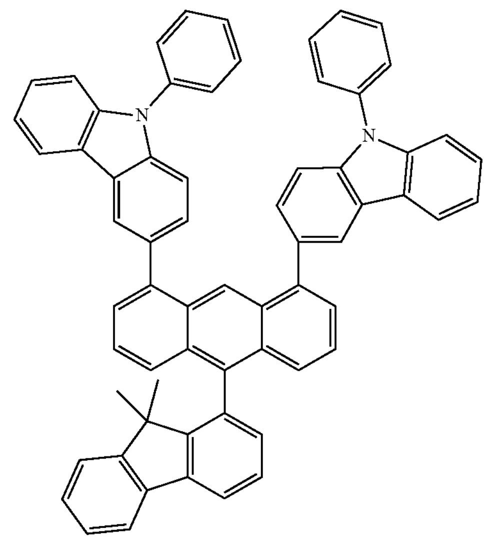
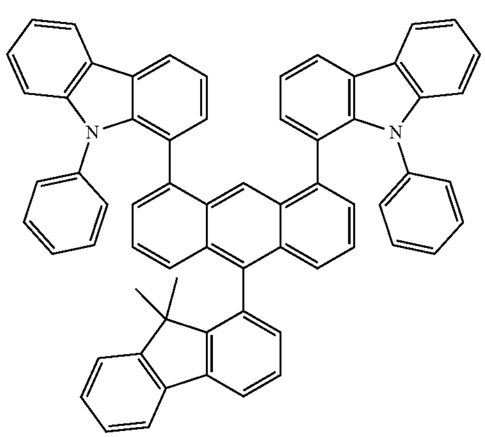
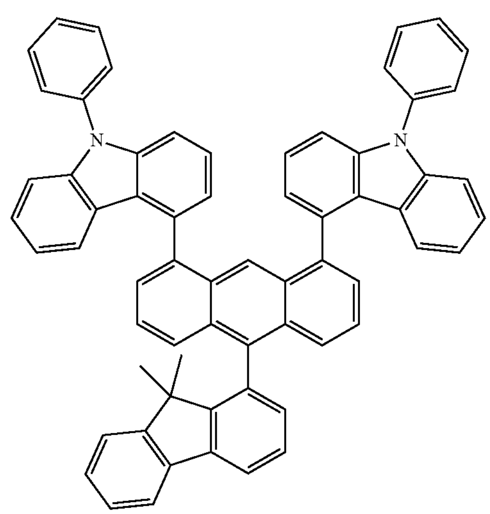

-continued
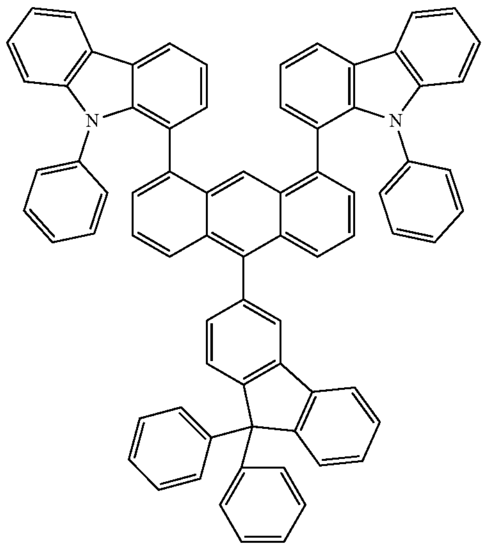
-continued
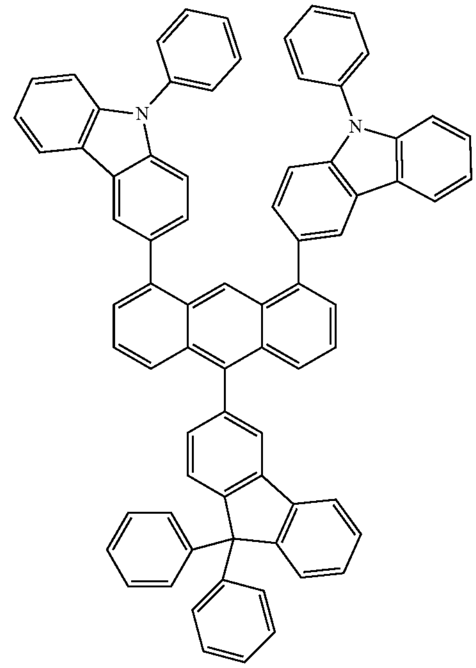
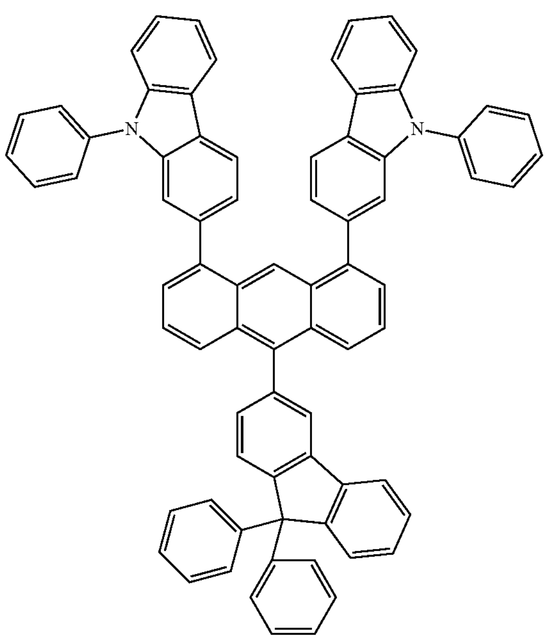
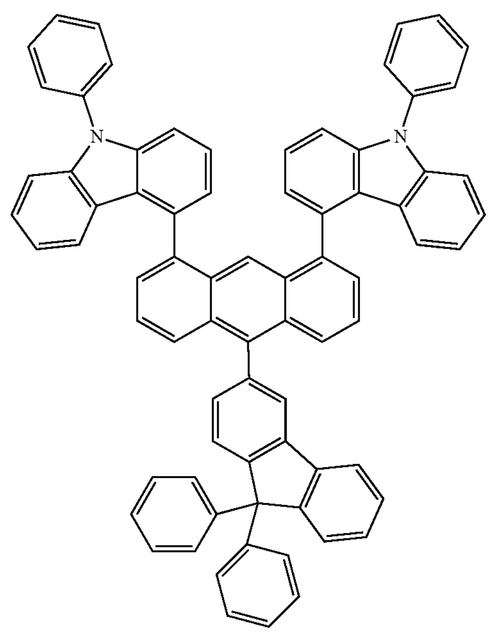

-continued
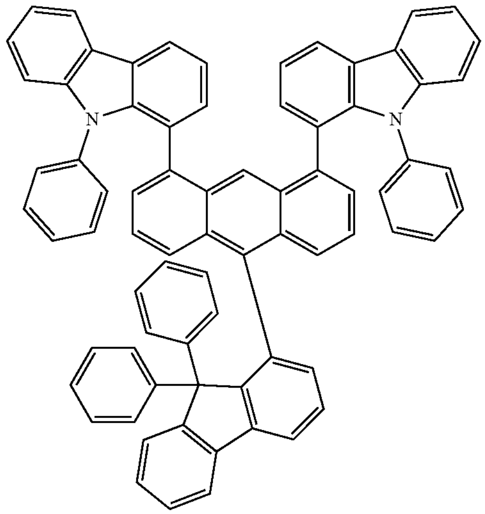
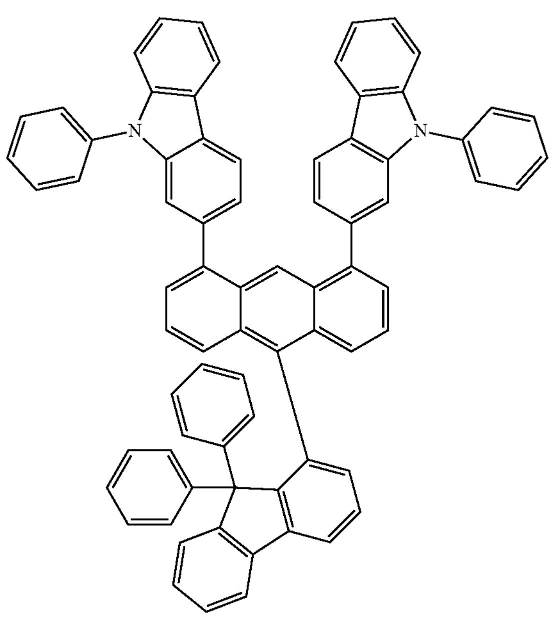
-continued
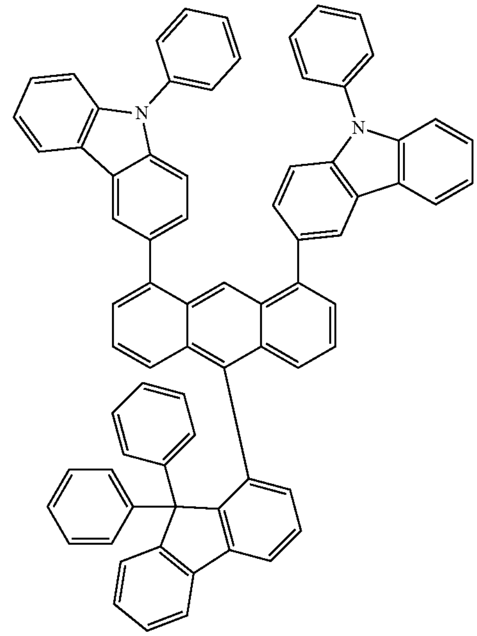
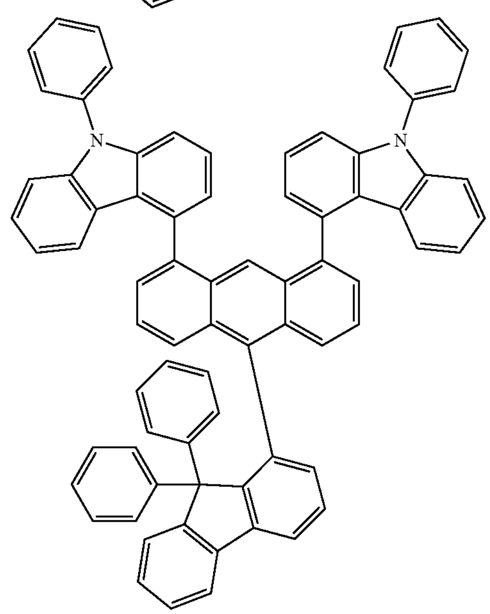
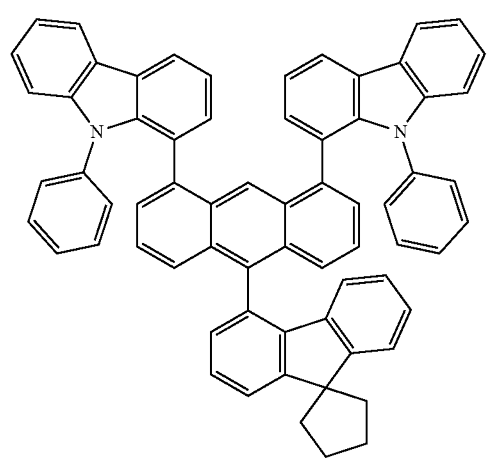

-continued
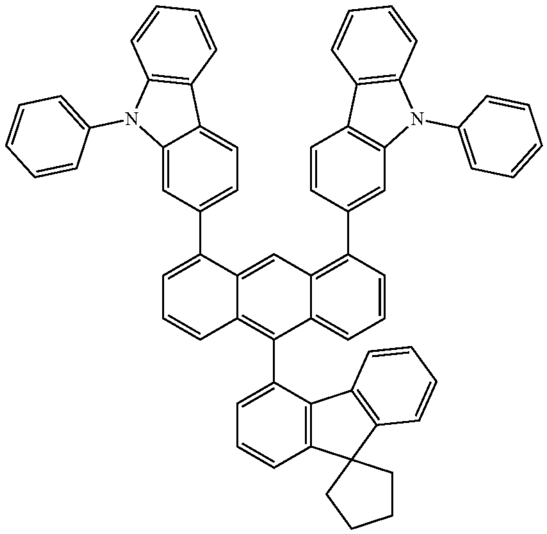
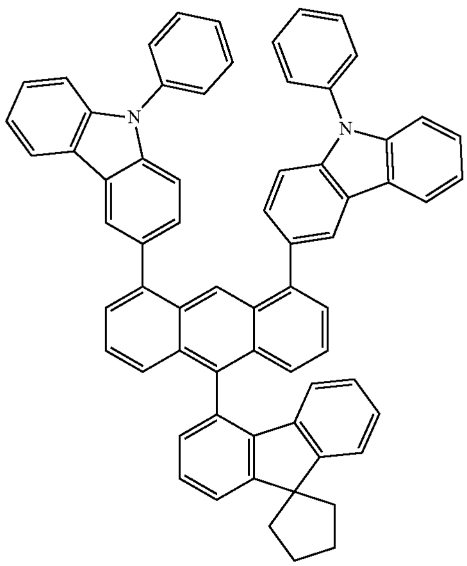
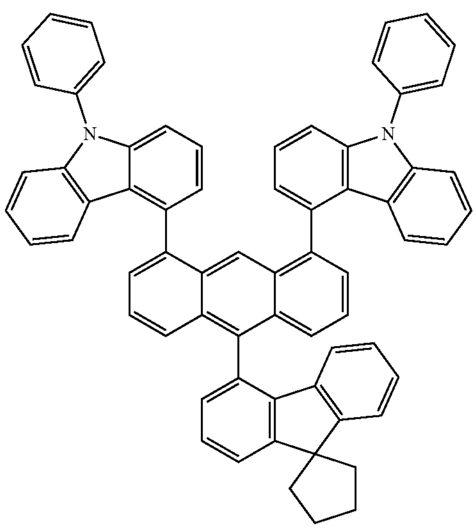
-continued
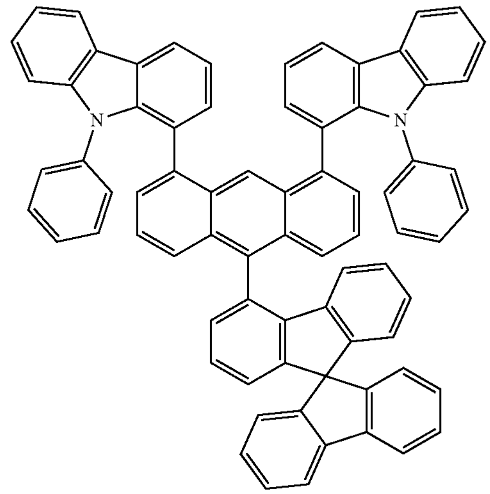
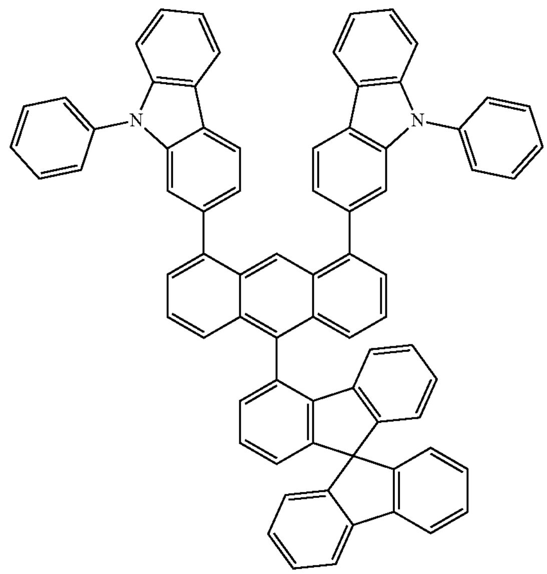
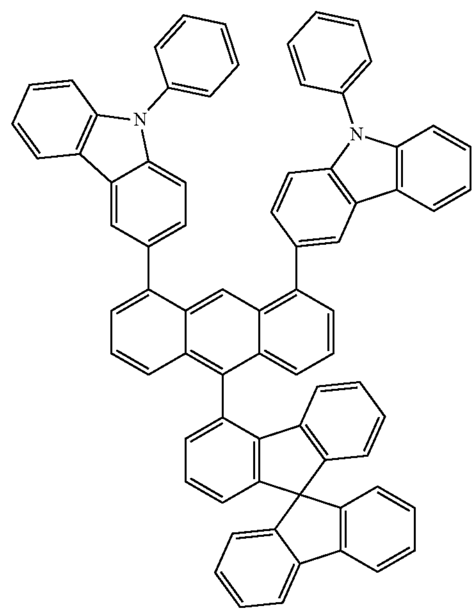

-continued
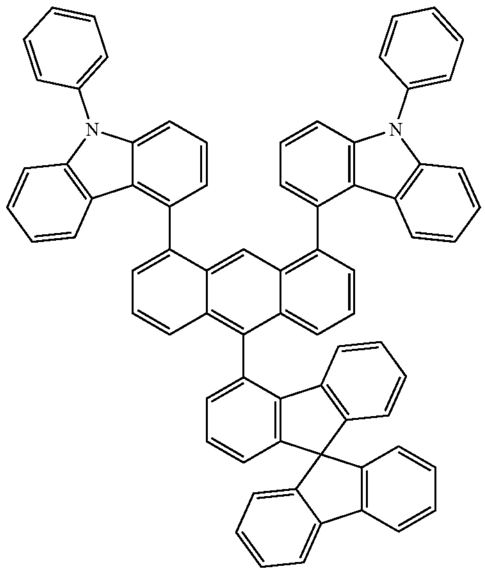
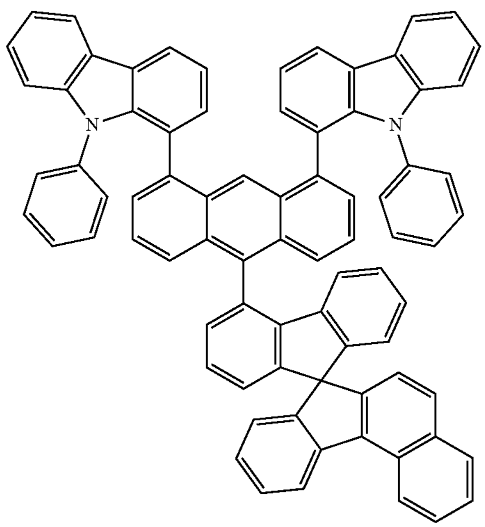
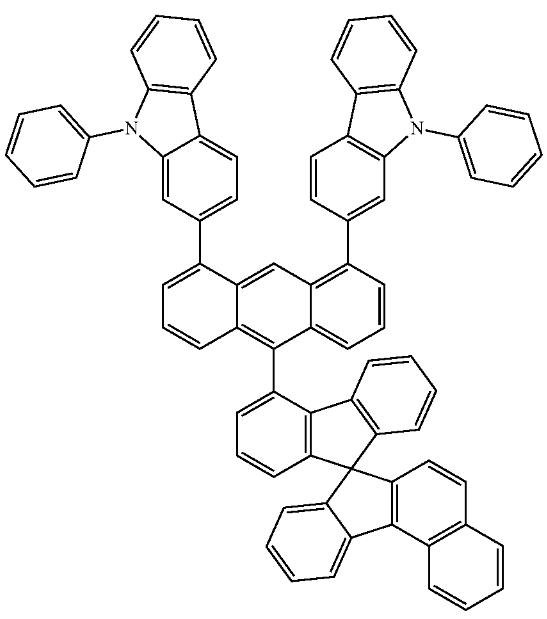
-continued
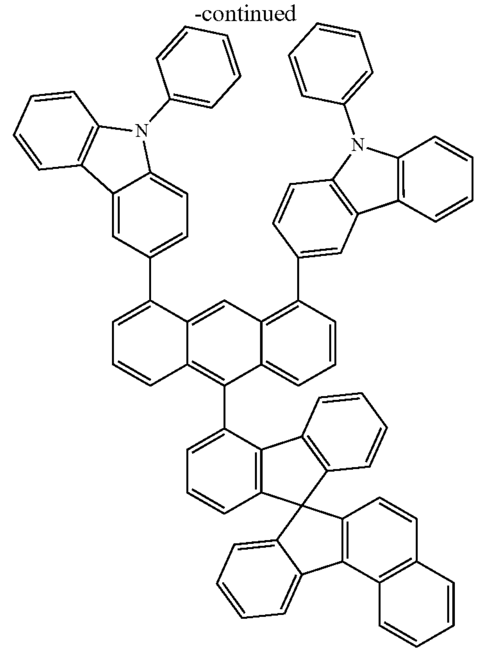
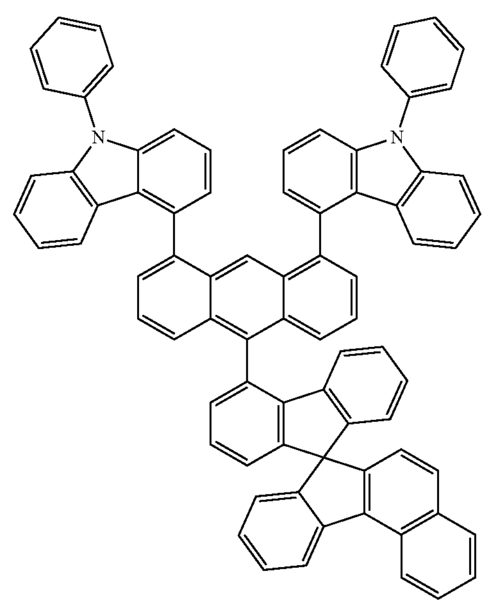

-continued
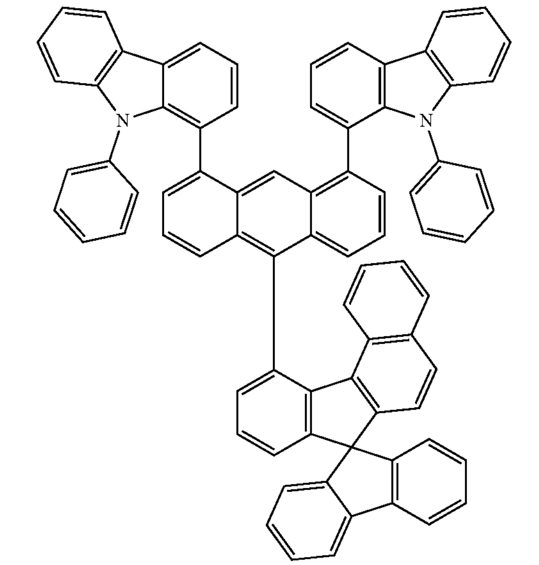
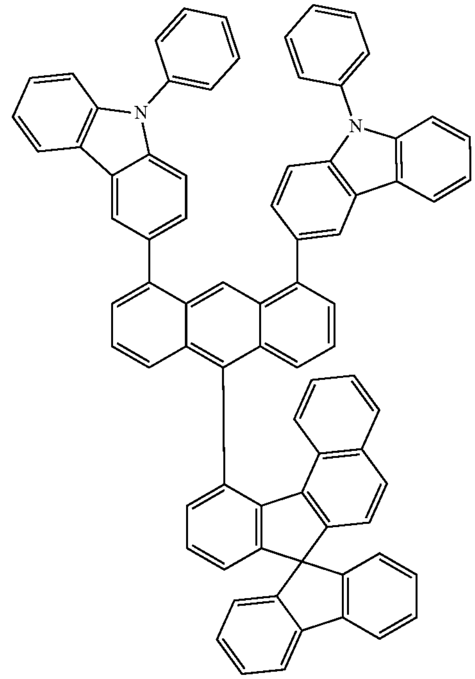
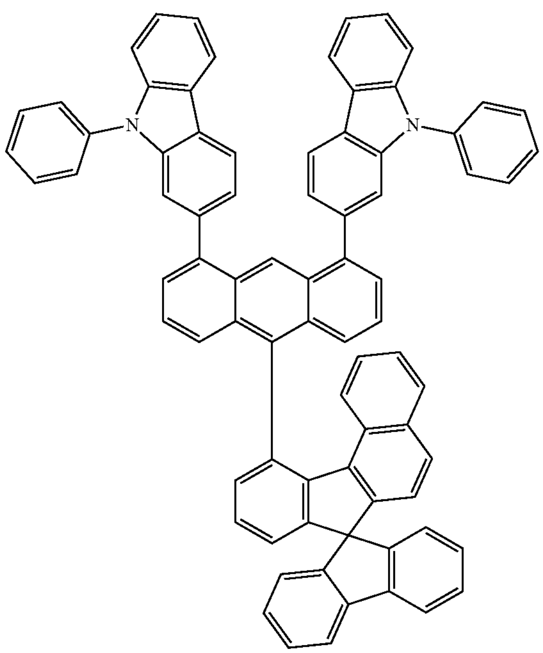
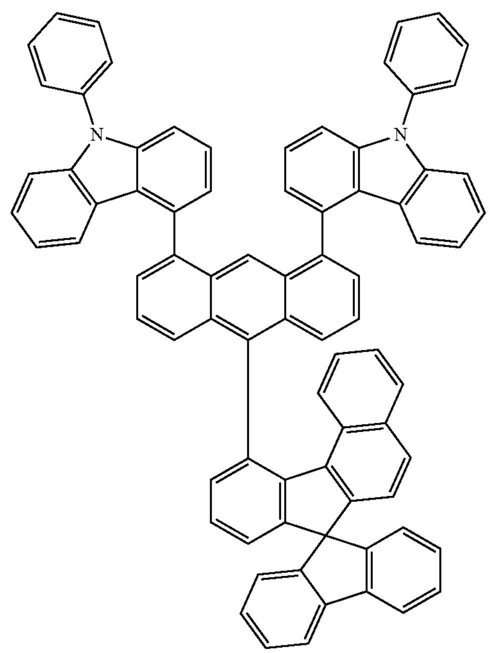

-continued
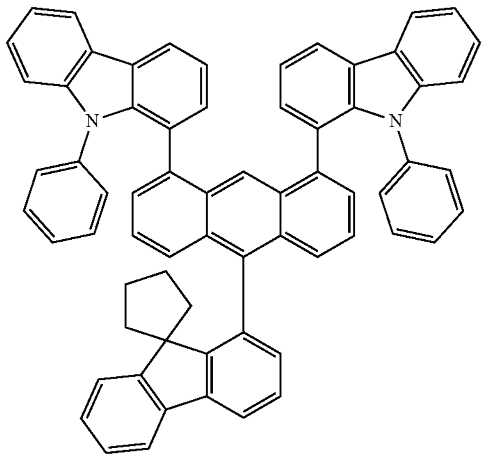
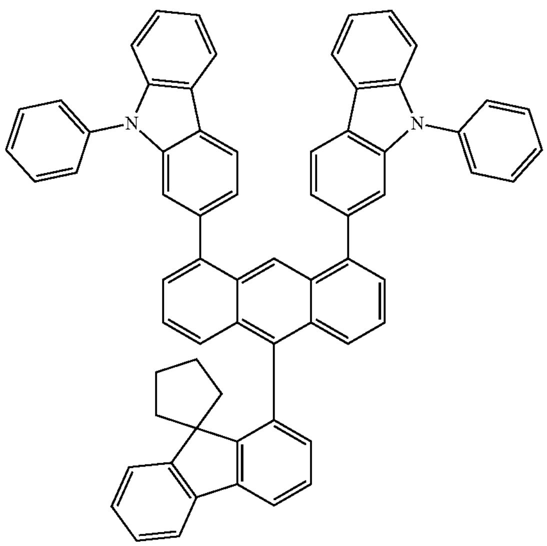
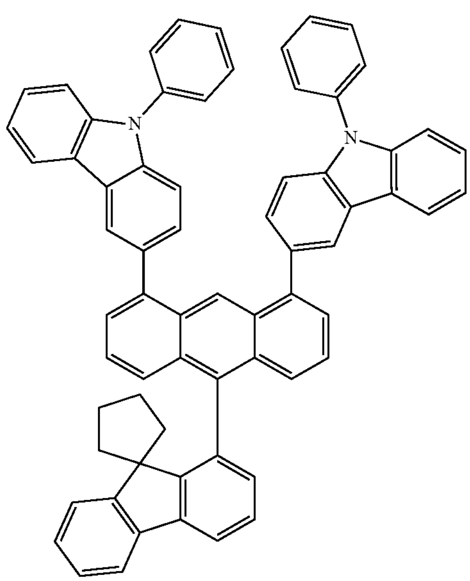
-continued
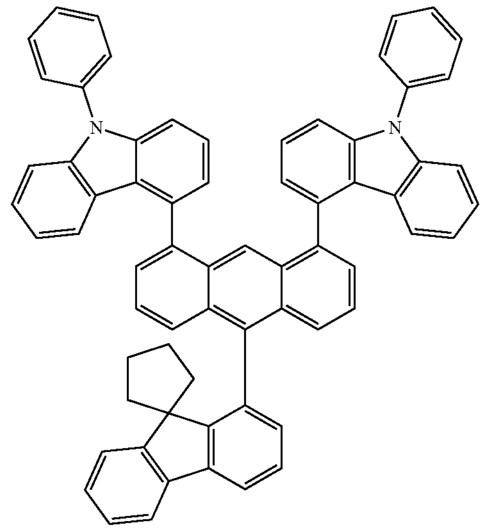
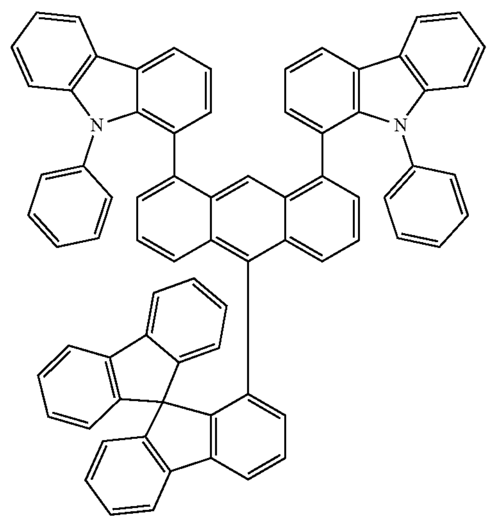
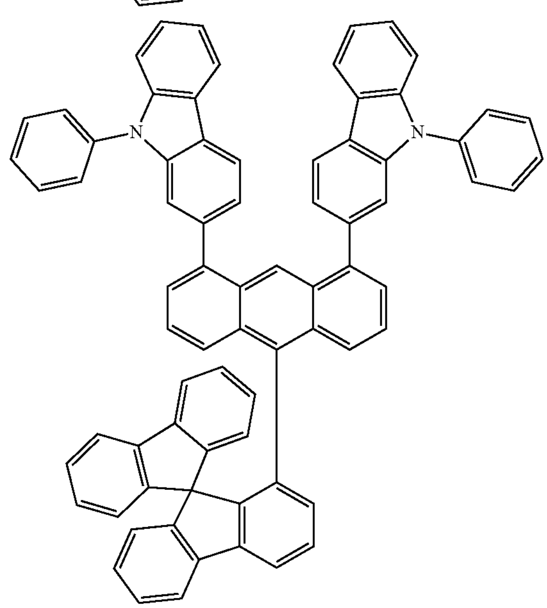

-continued
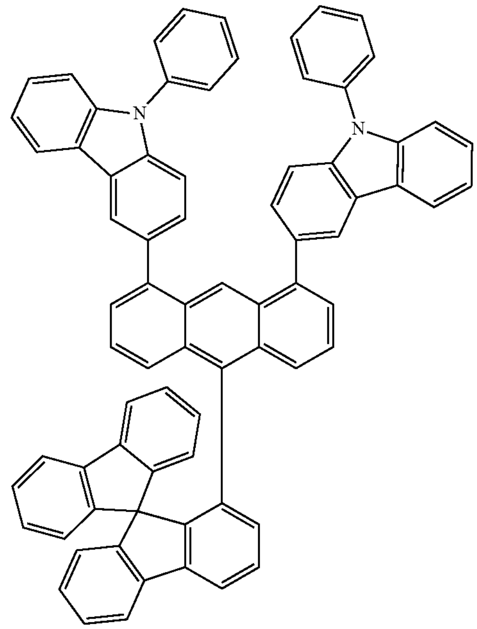
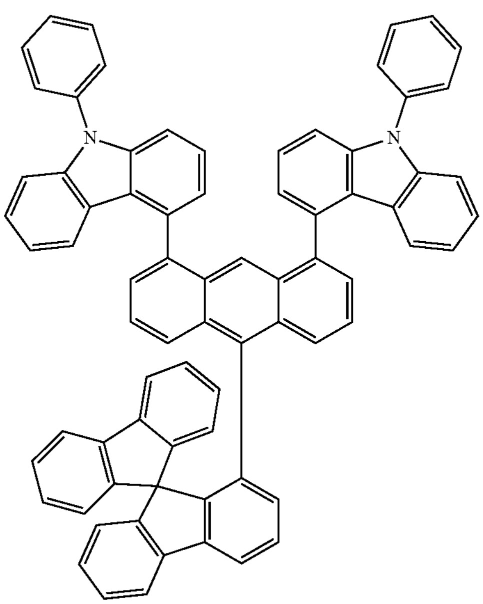
-continued
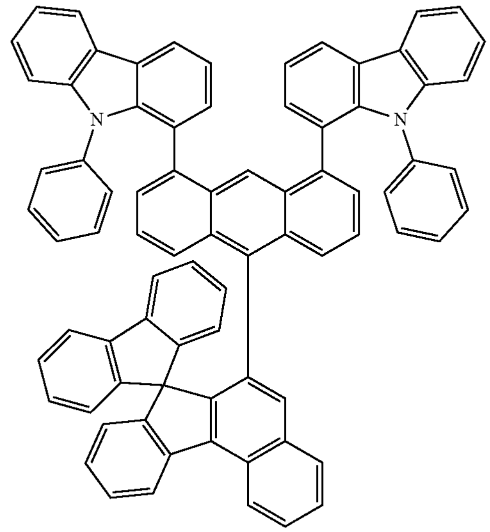
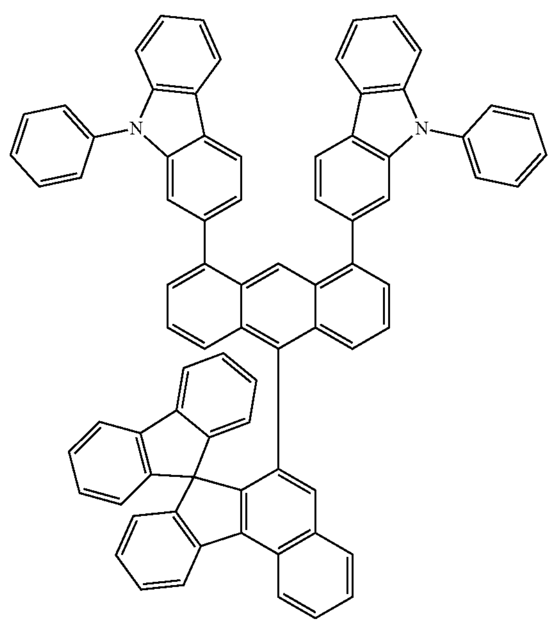

-continued
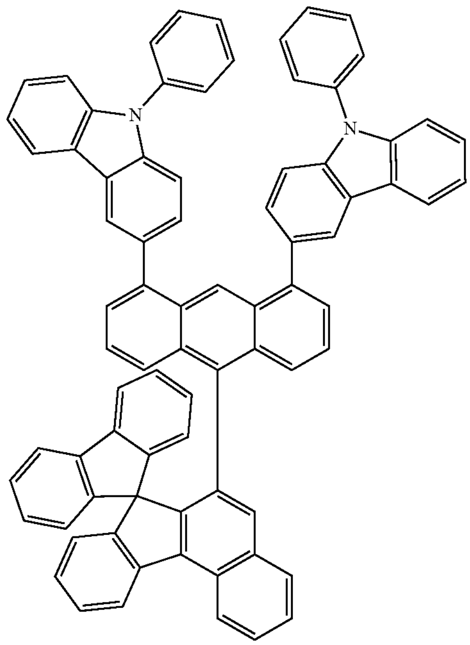
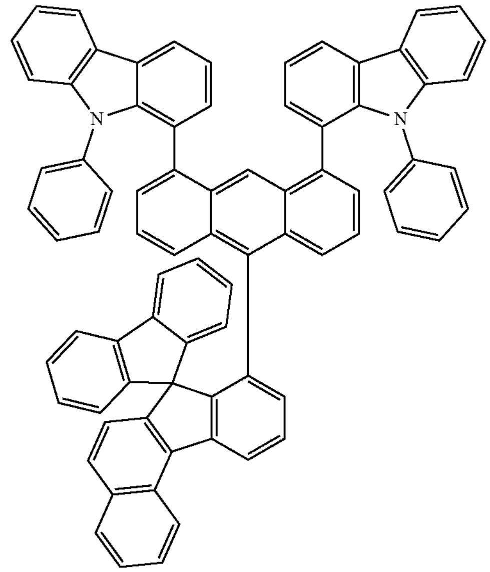
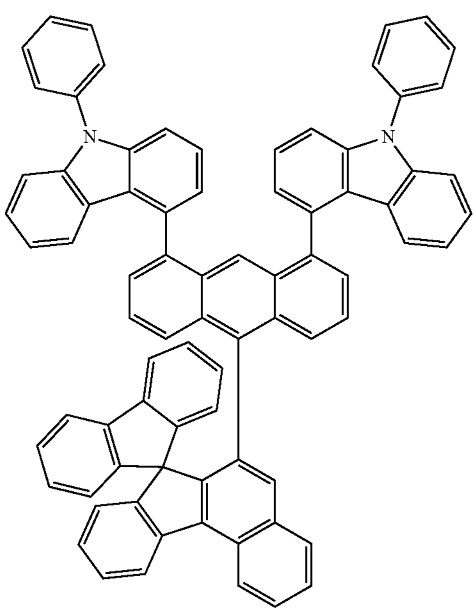
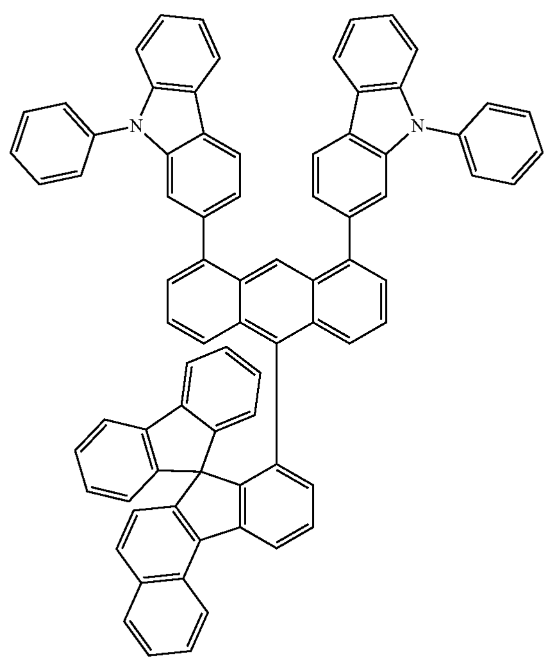

-continued
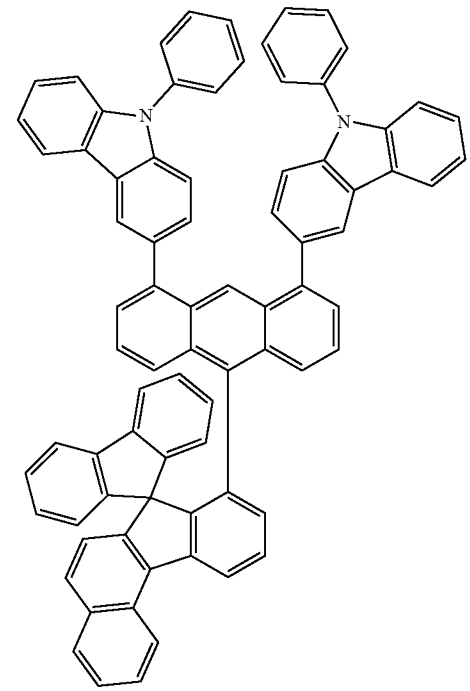
-continued
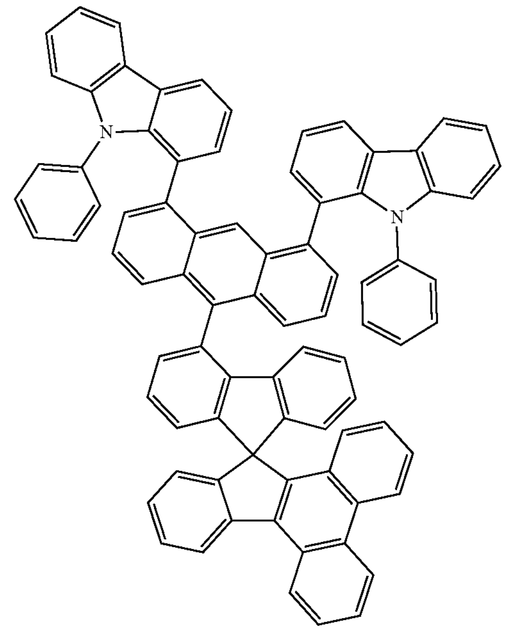
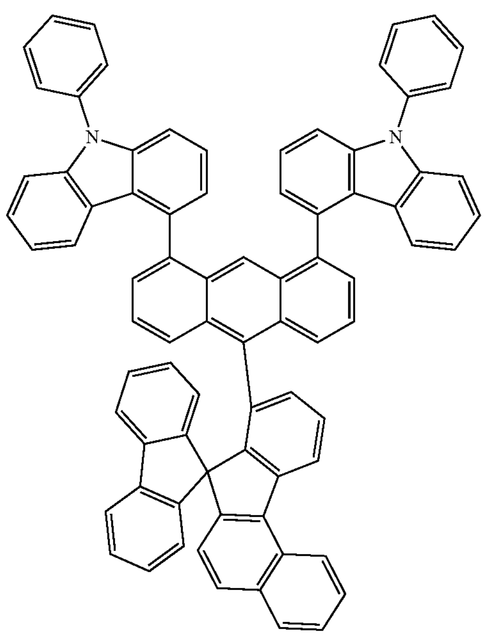
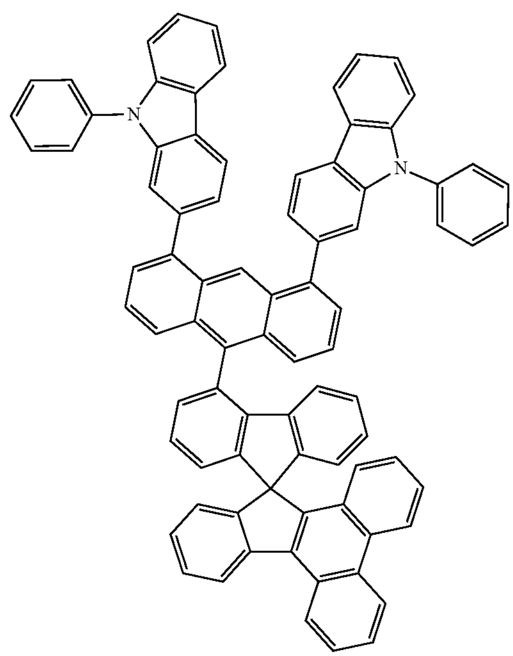

-continued
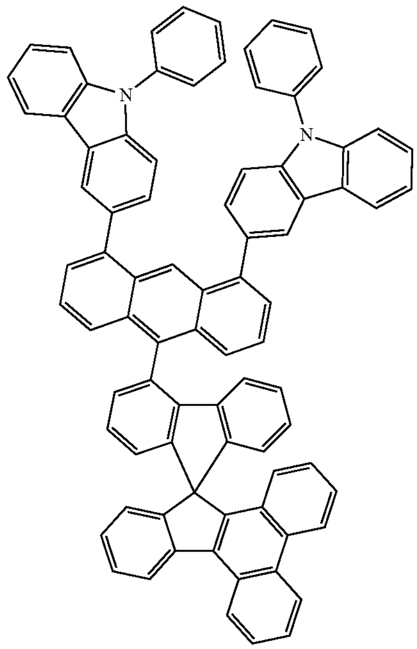
-continued
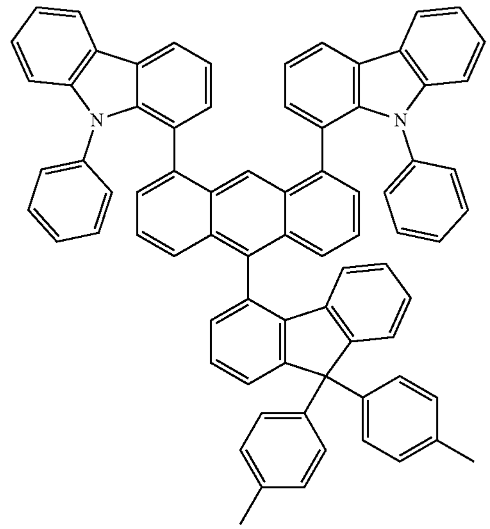
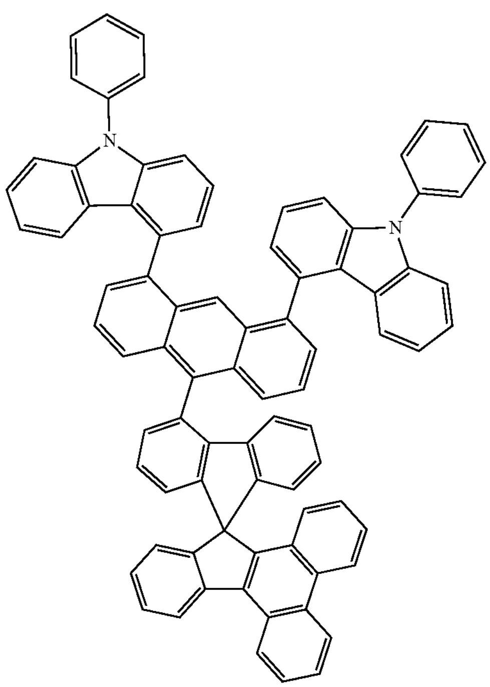
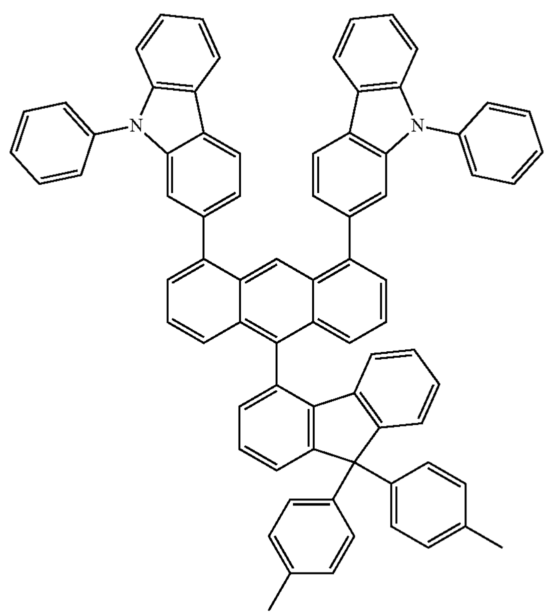

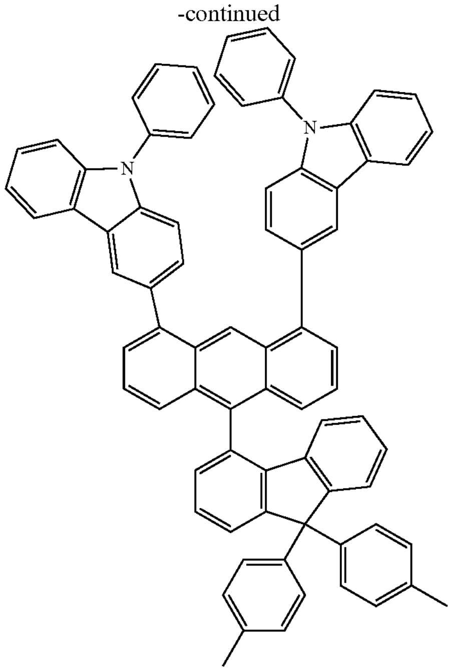
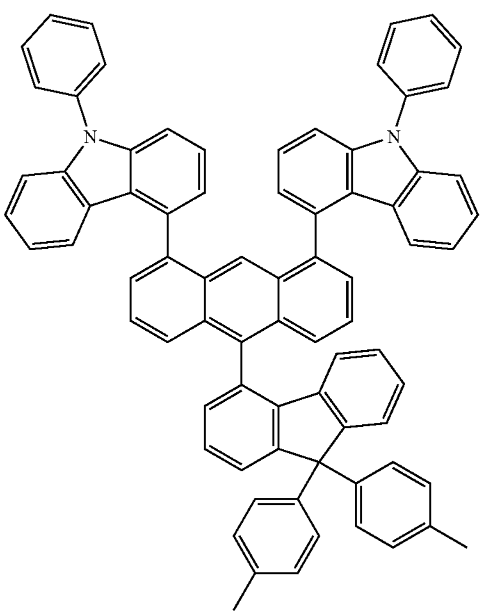
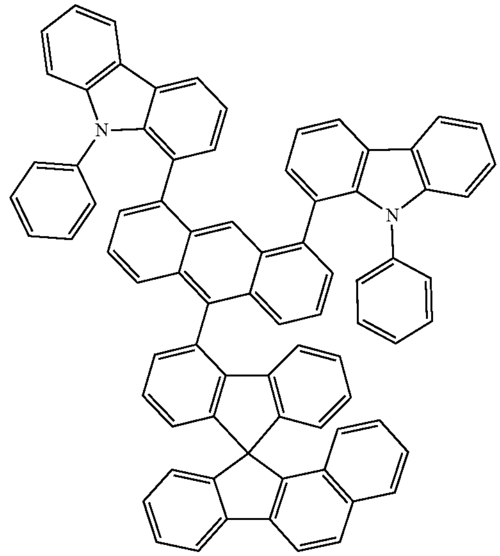
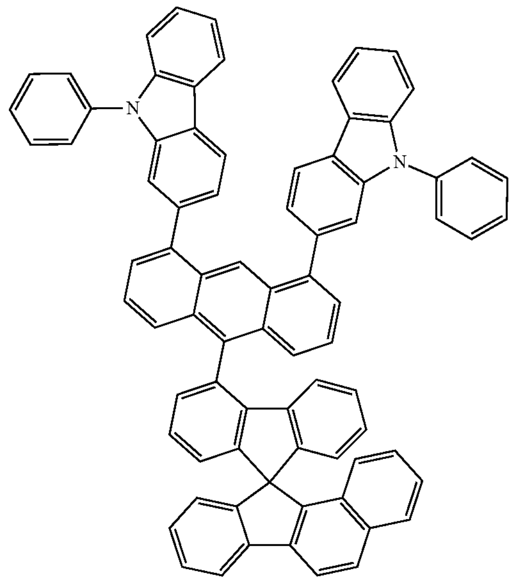
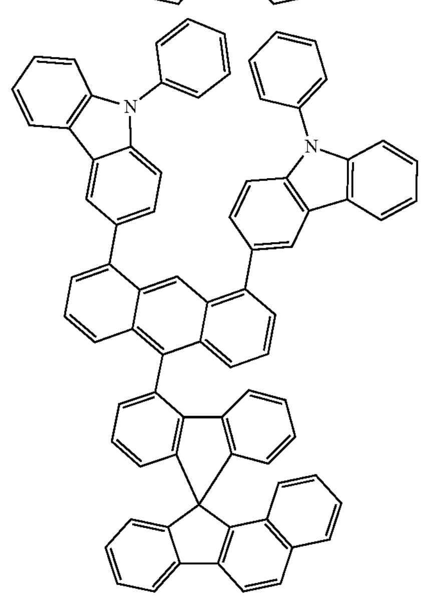

-continued
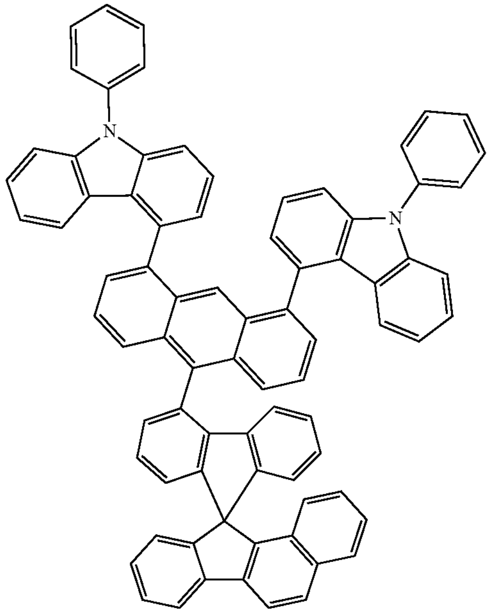
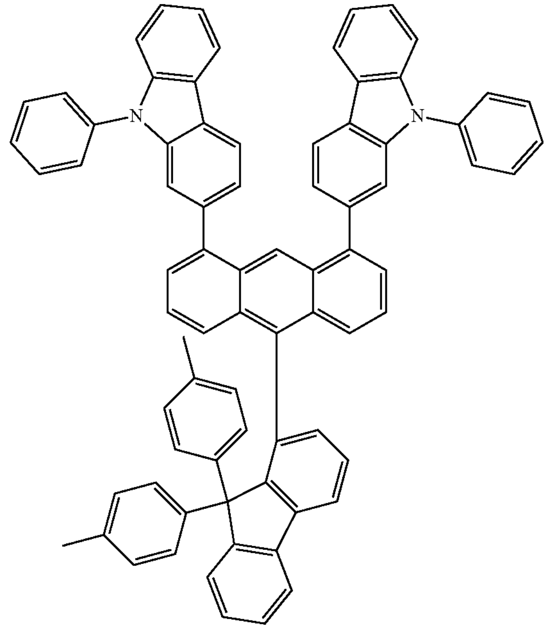
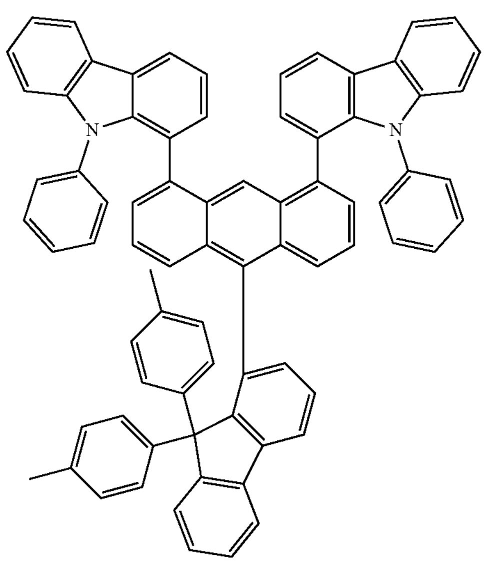
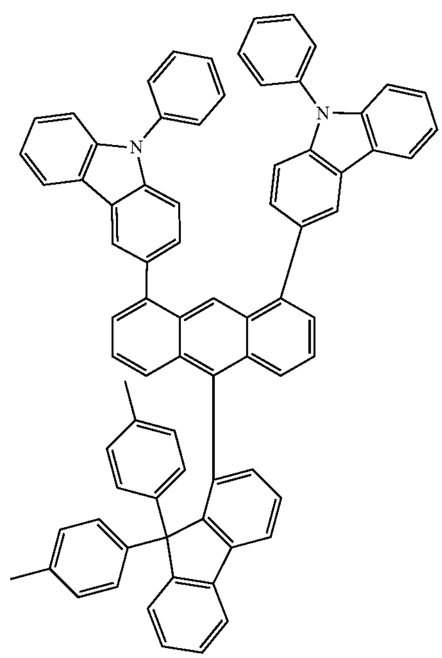

-continued
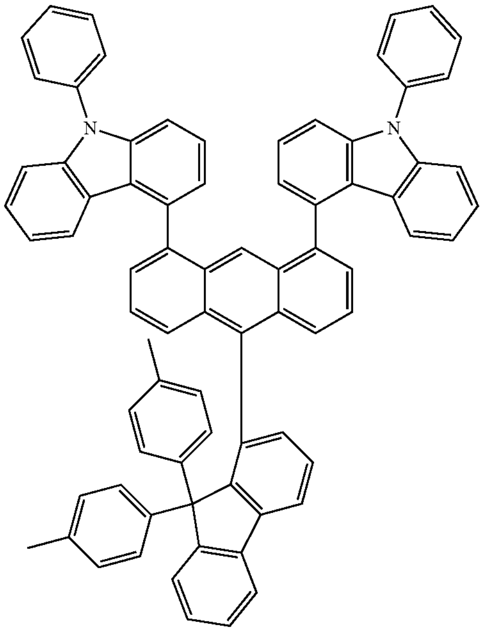
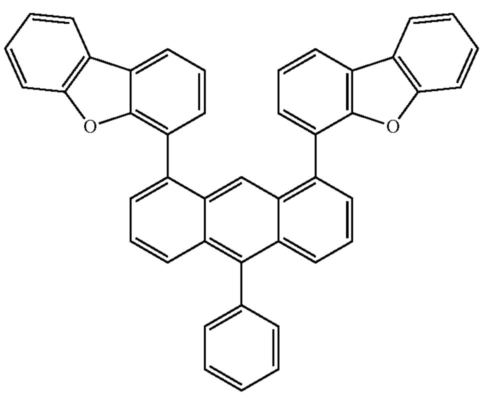
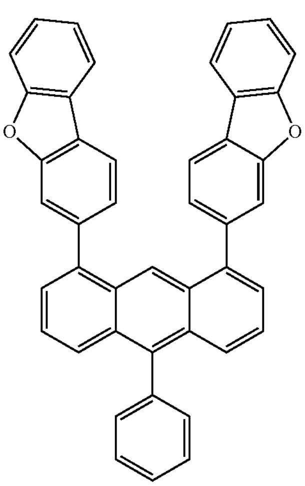
-continued
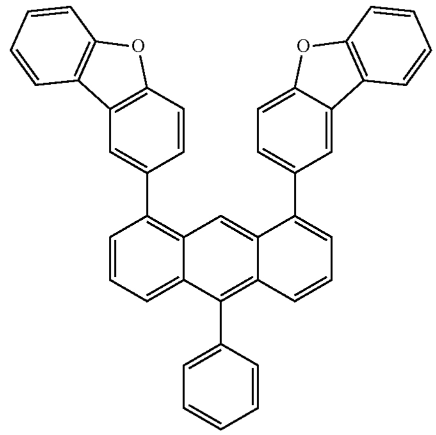
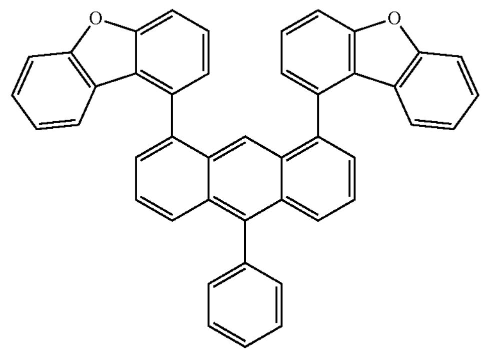
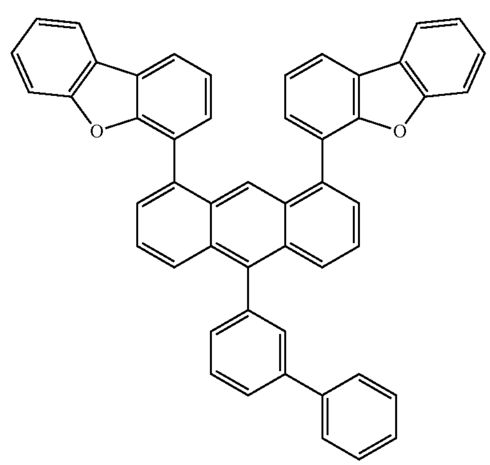

-continued
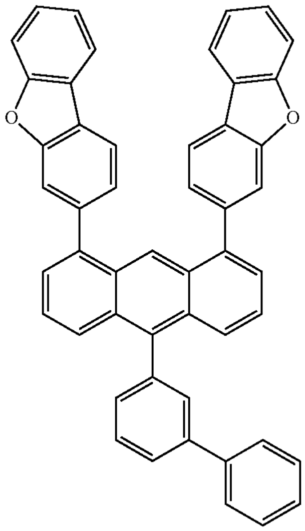
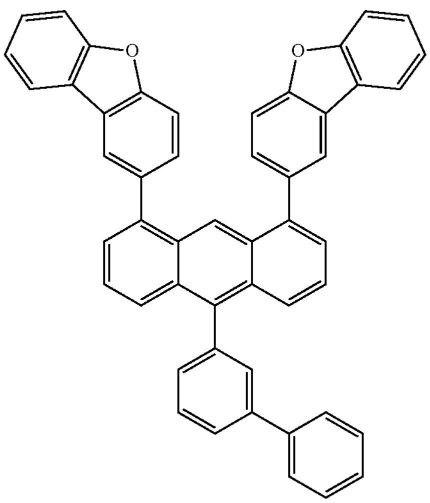
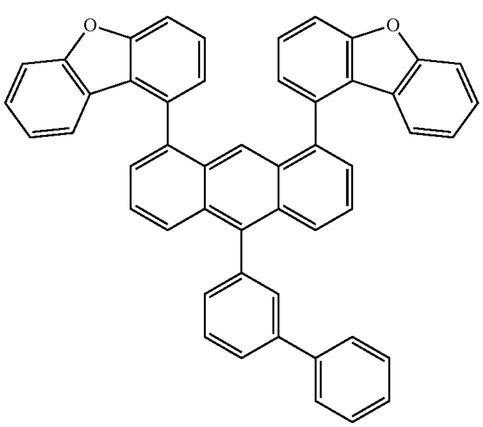
-continued
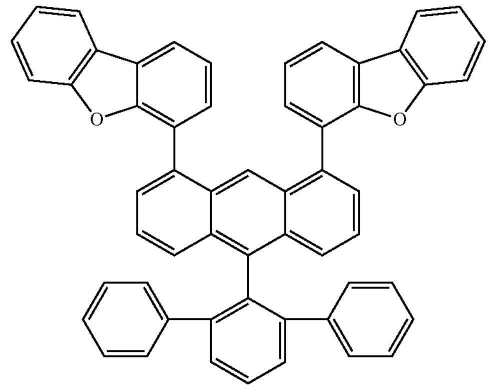
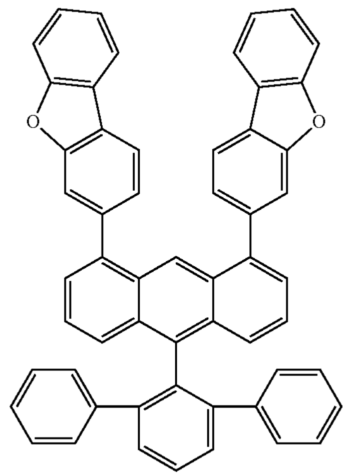
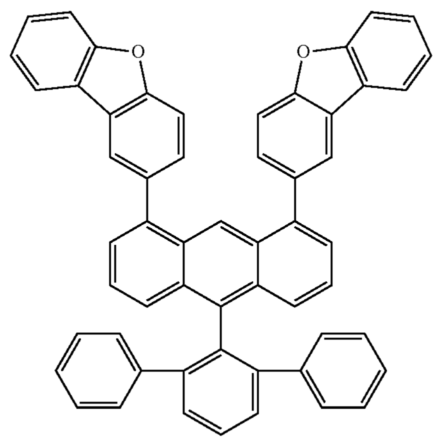
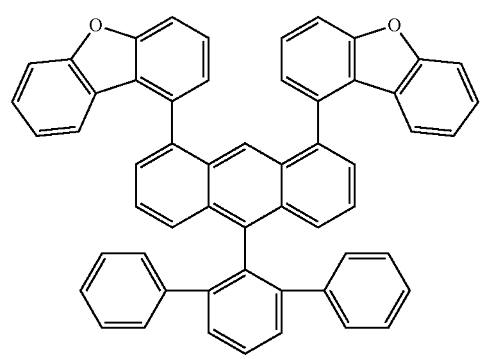

-continued
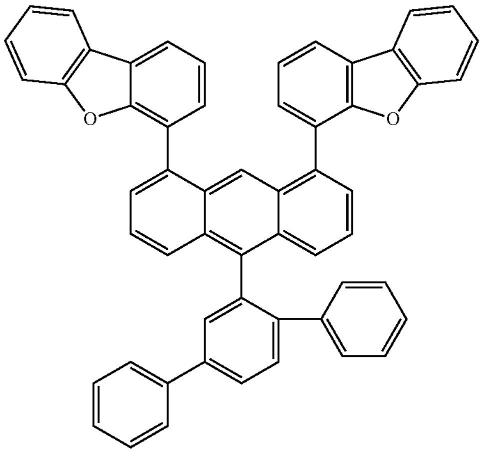
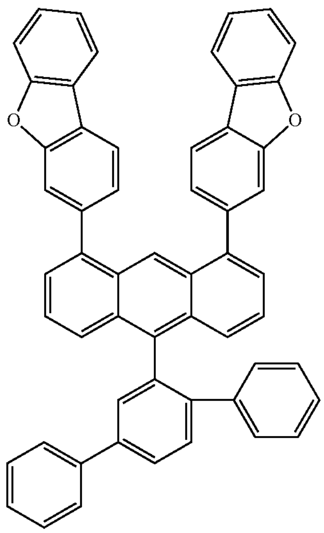
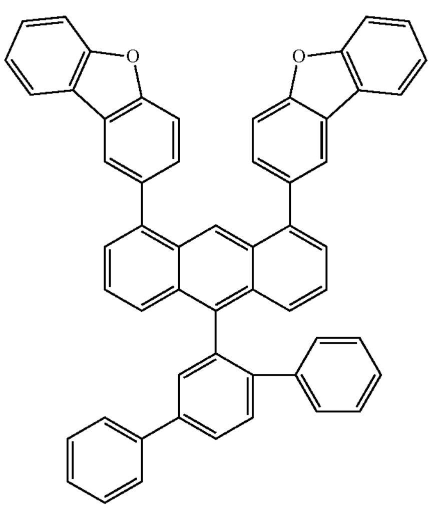
-continued
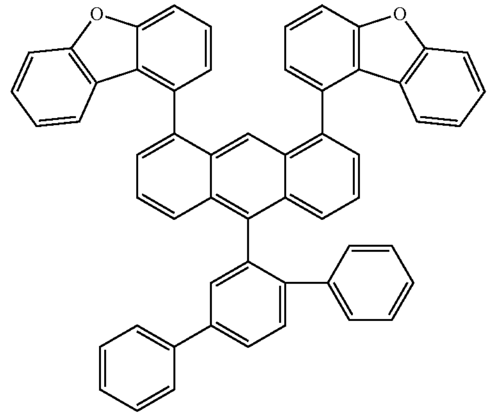
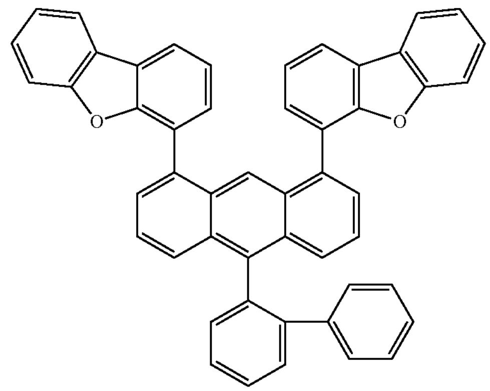
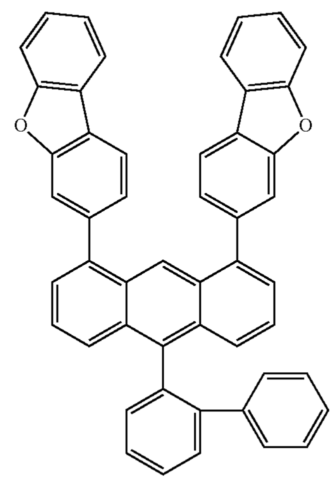
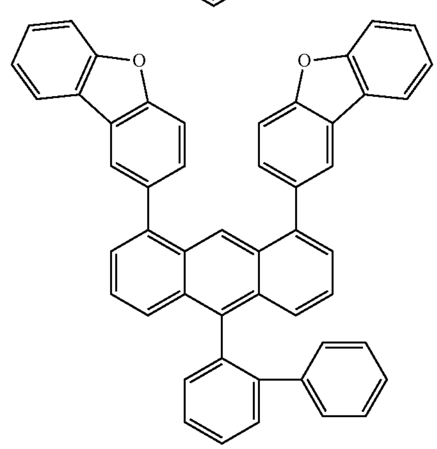

-continued
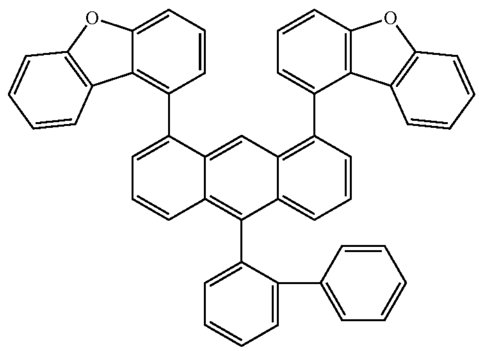
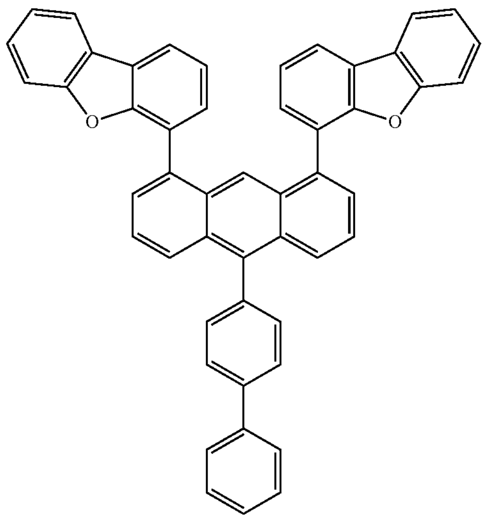
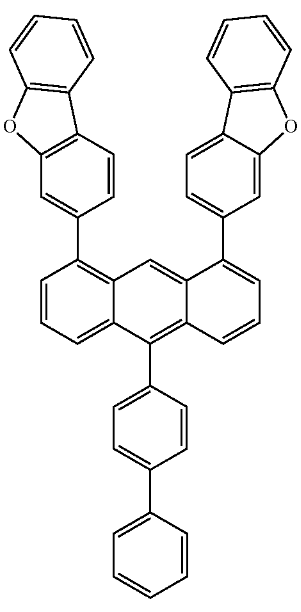
-continued
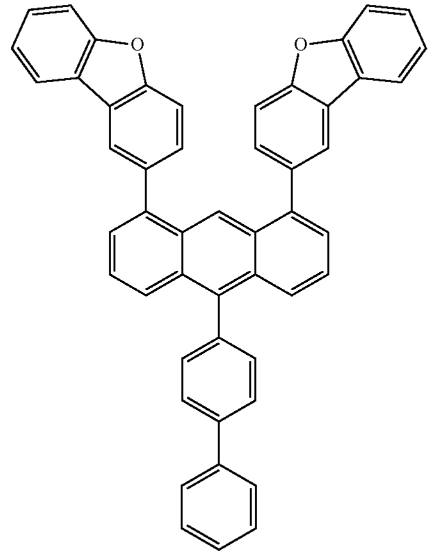
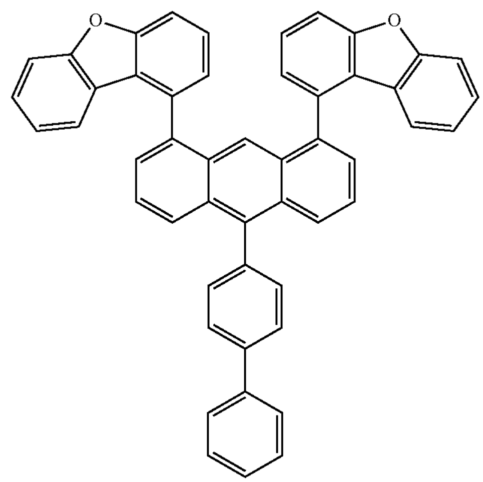
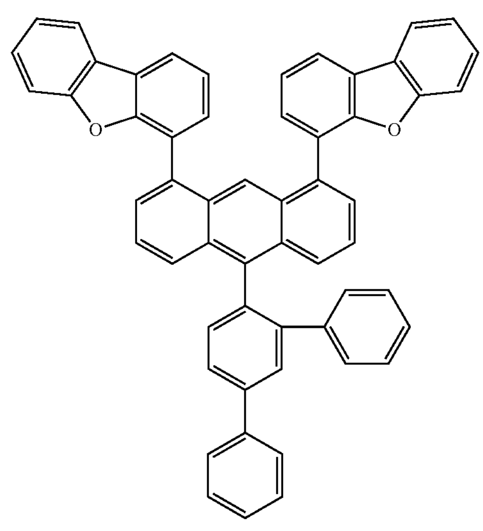

-continued
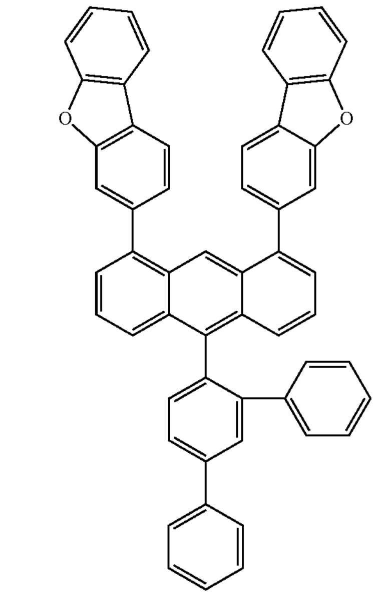
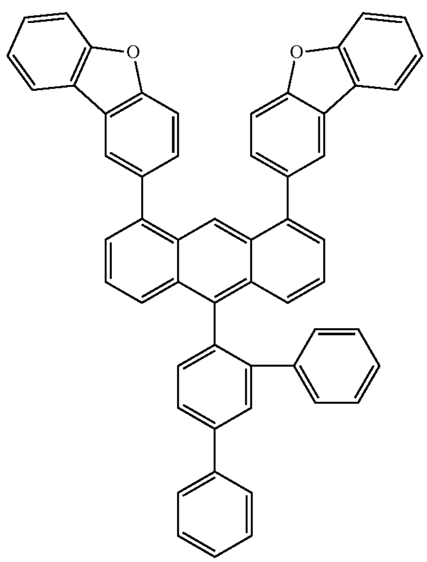
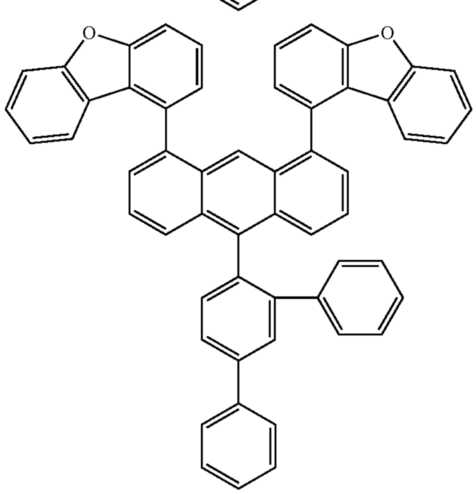
-continued
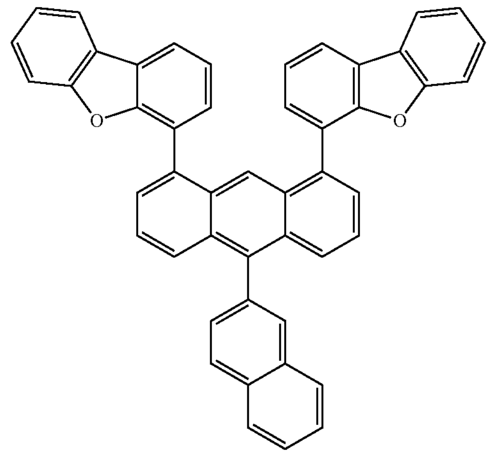
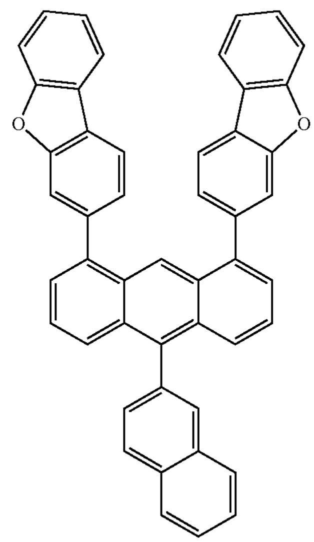
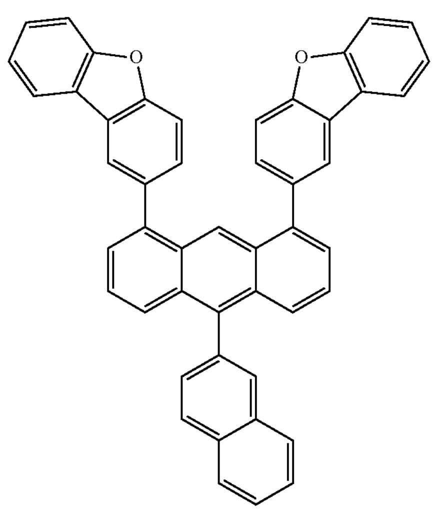

-continued
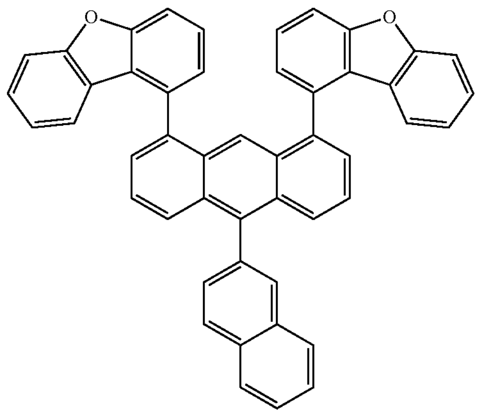
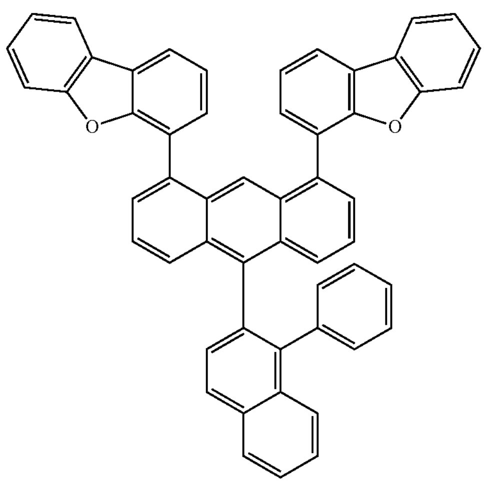
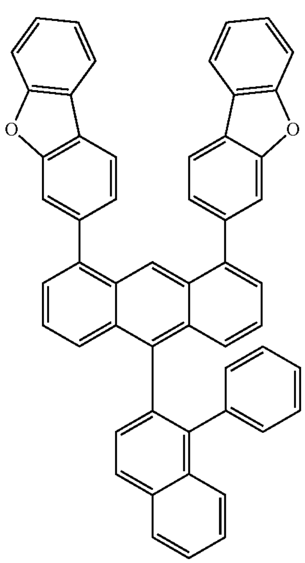
-continued
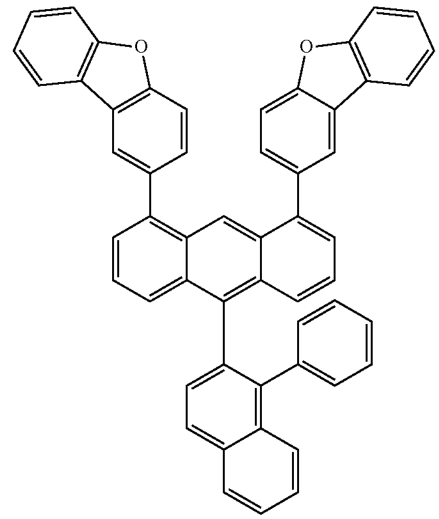
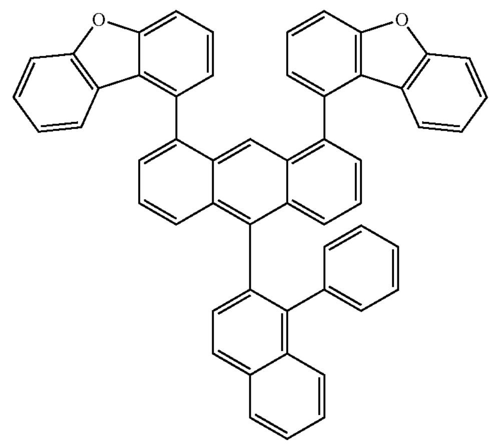
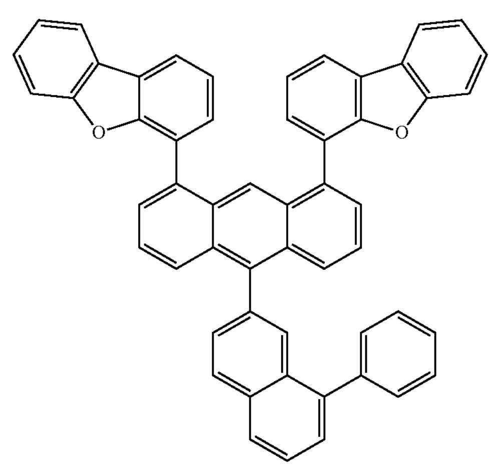

-continued
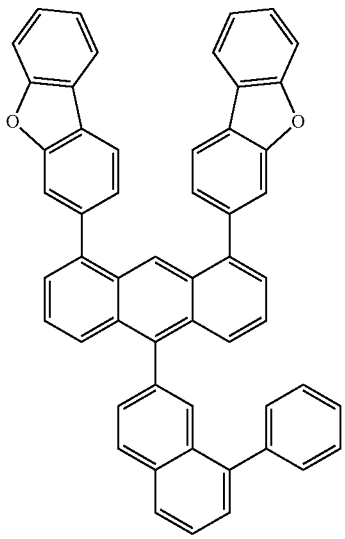
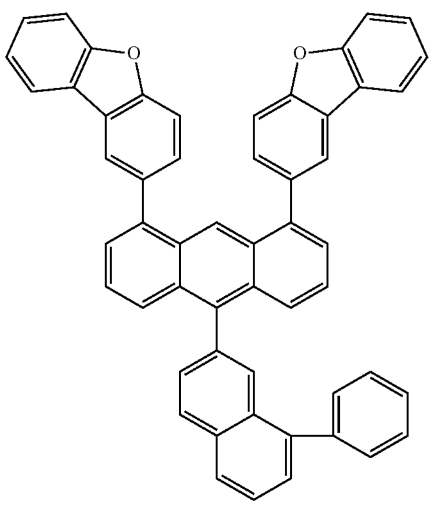
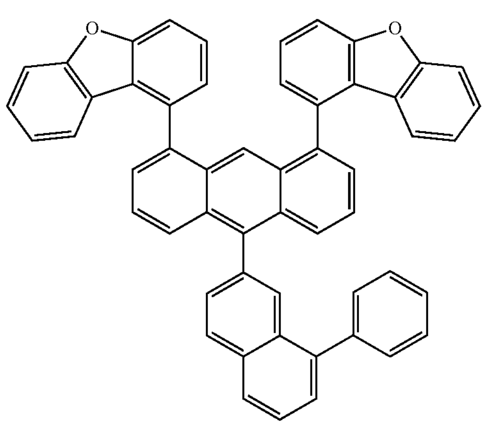
-continued
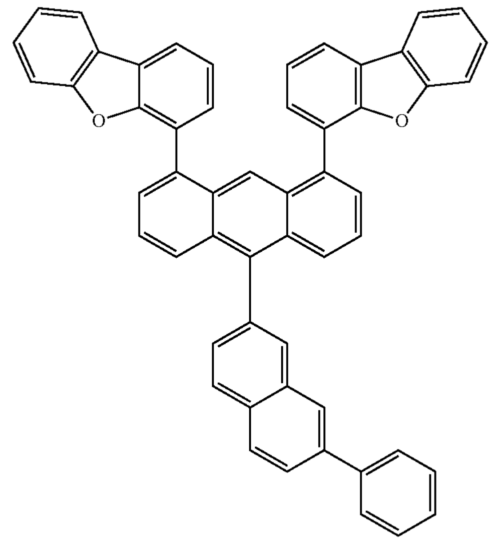
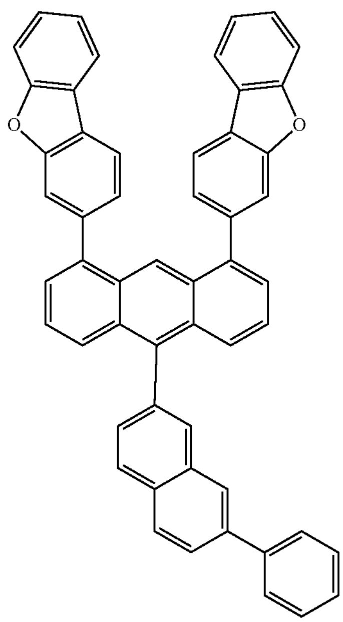
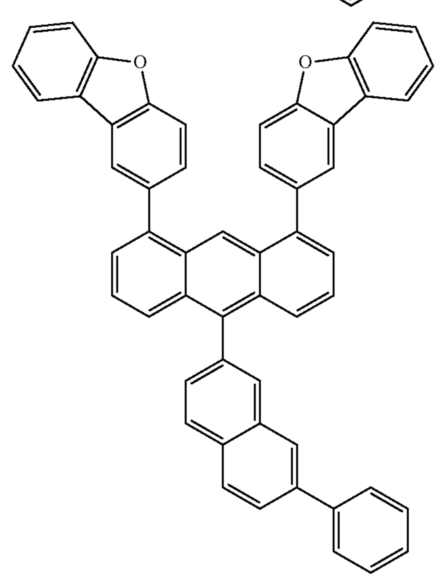

-continued
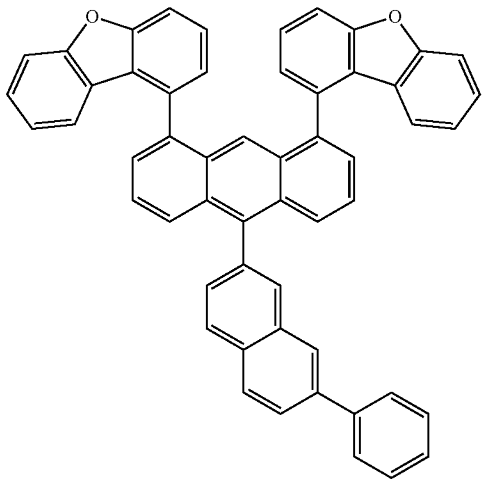
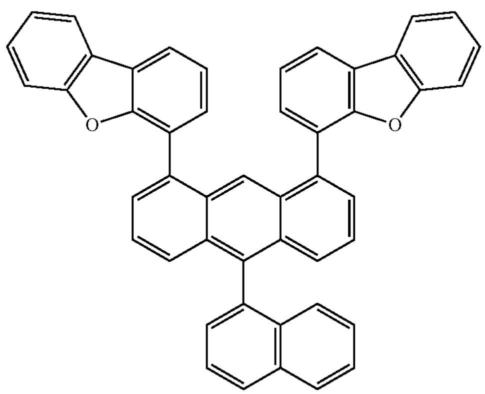
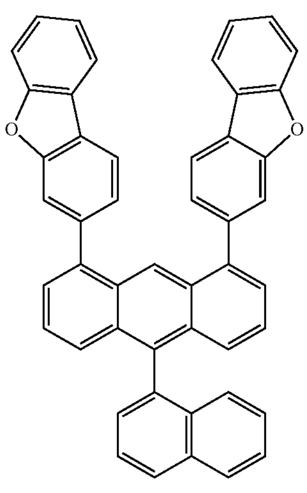
-continued
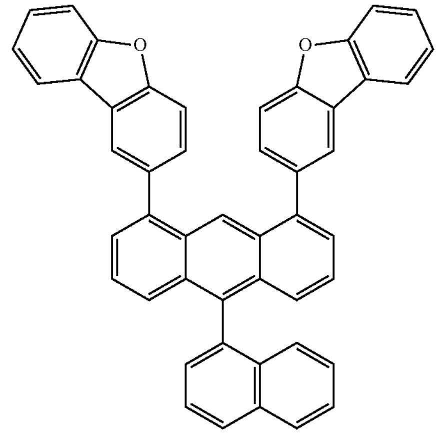
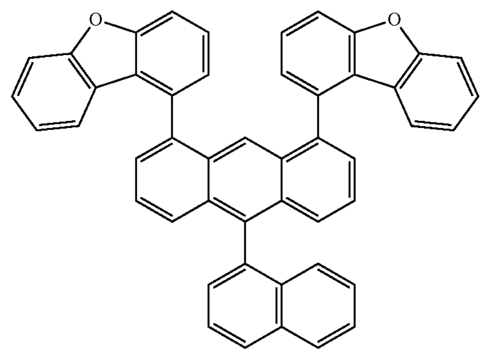
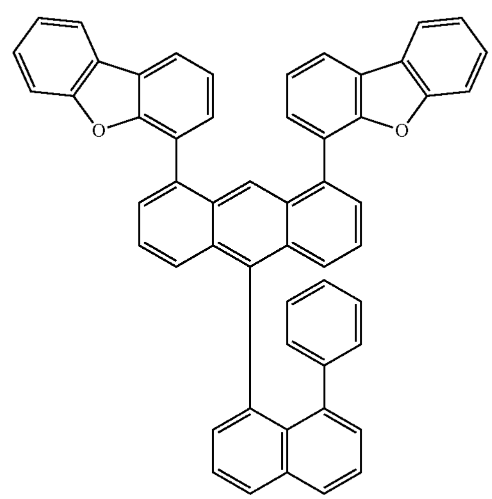

-continued
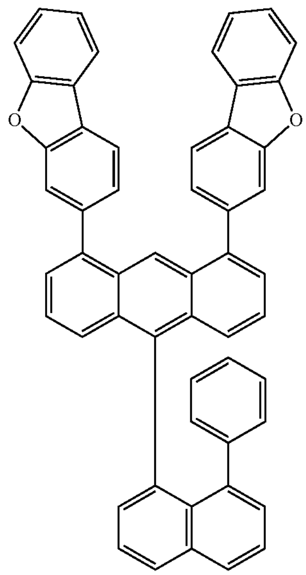
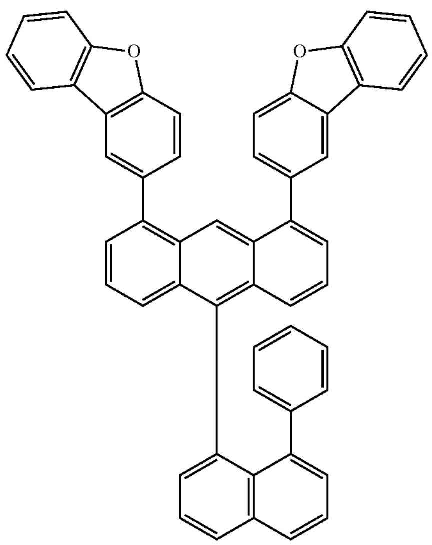
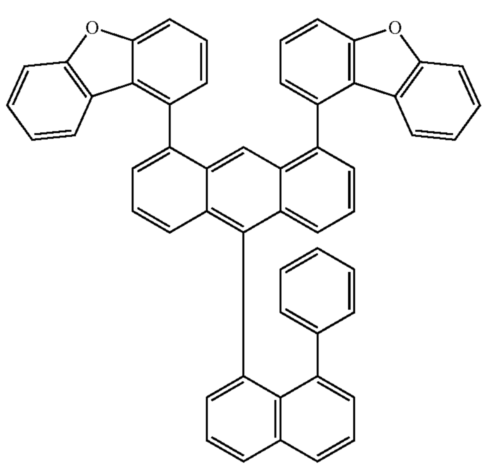
-continued
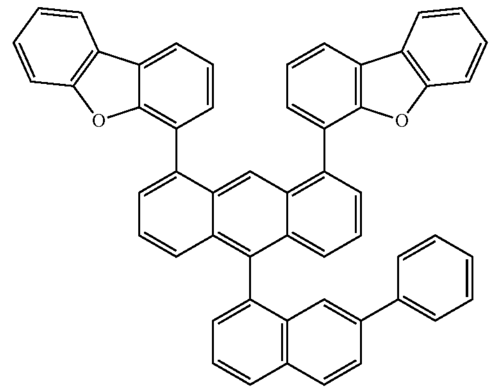
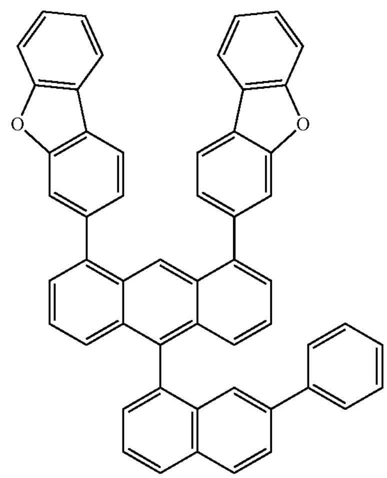
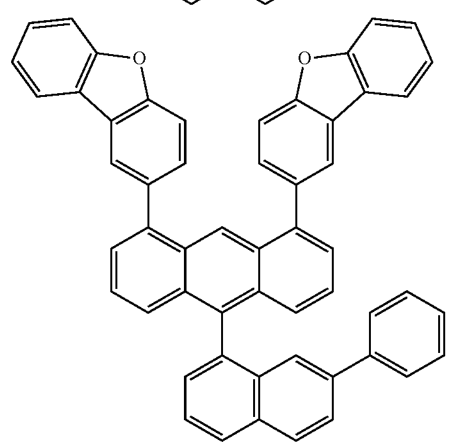
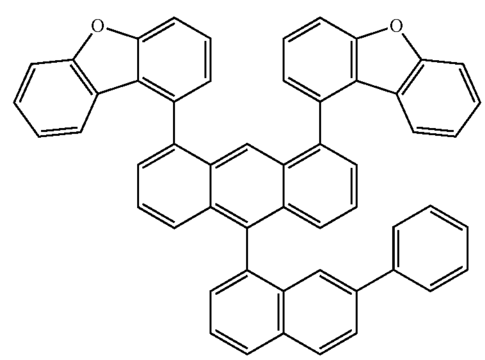

-continued
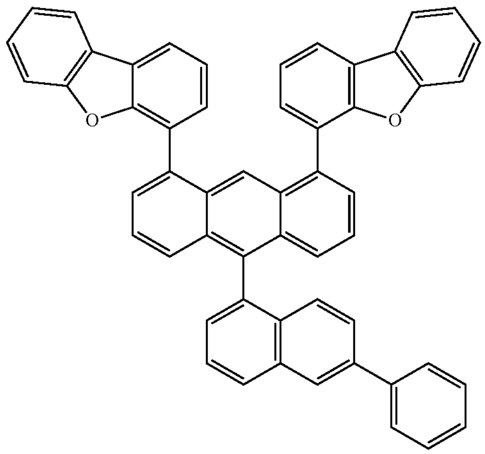
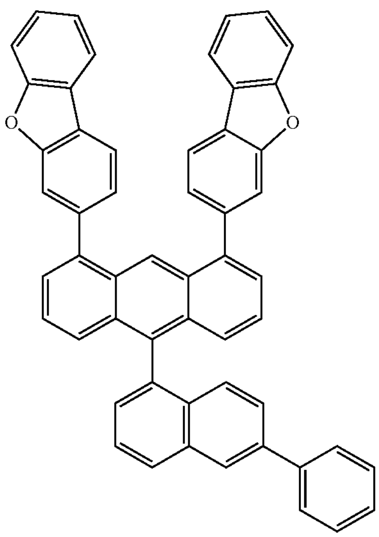
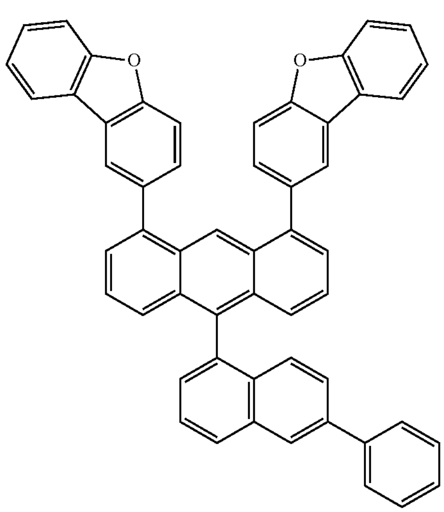
-continued
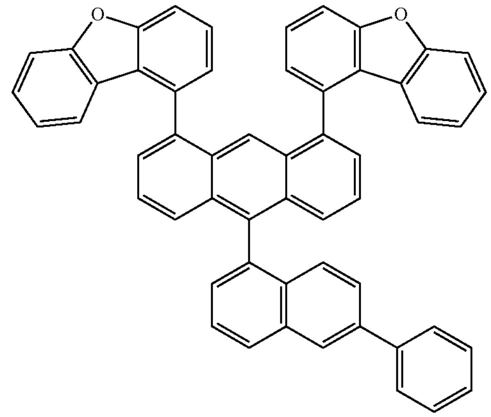
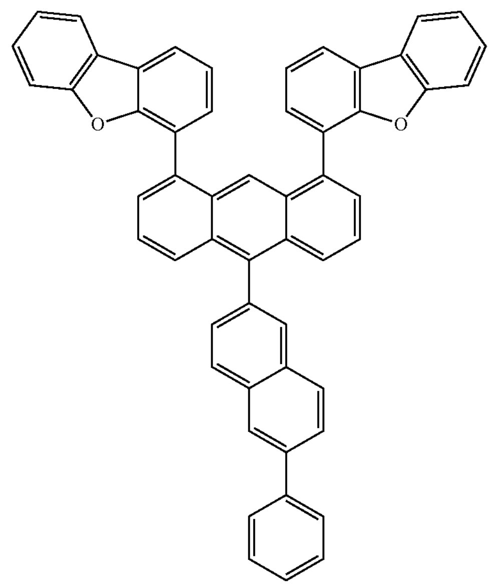
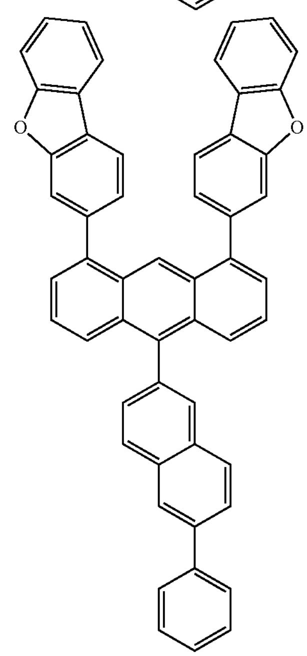

-continued
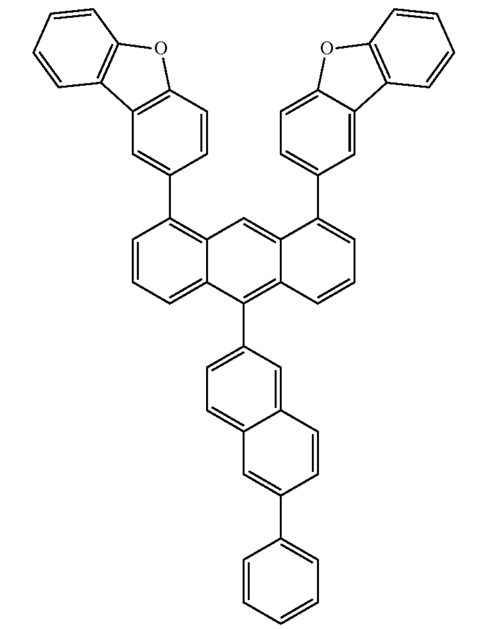
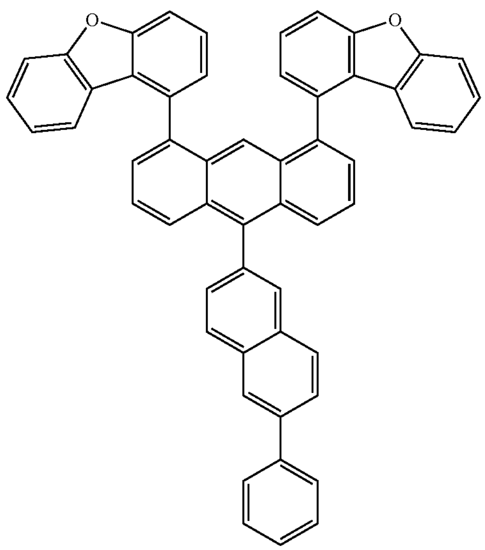
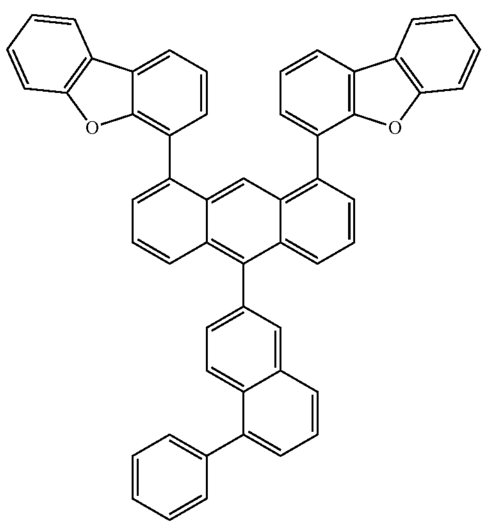
-continued
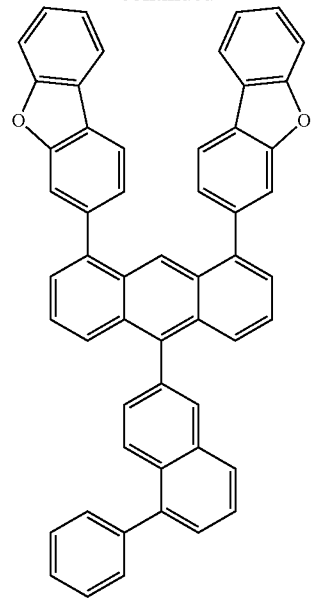
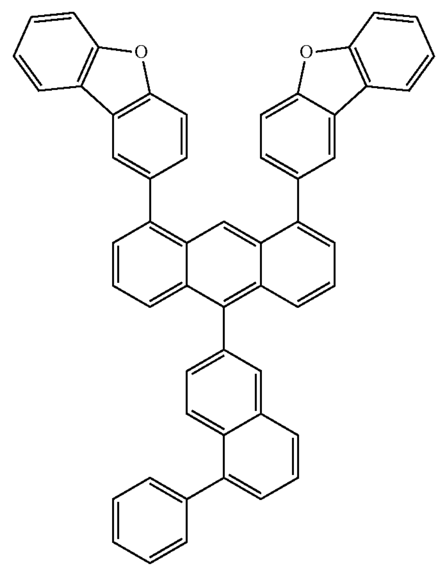
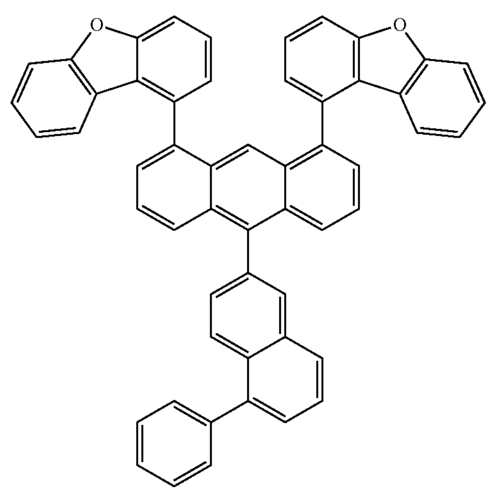

-continued
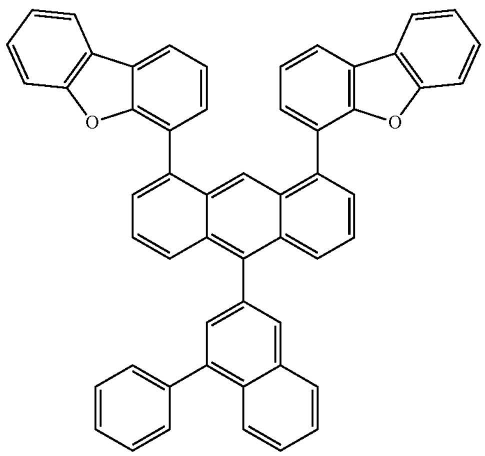
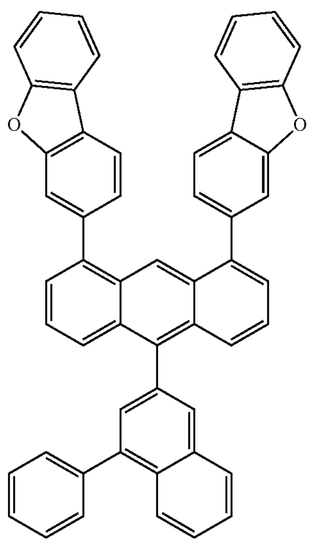
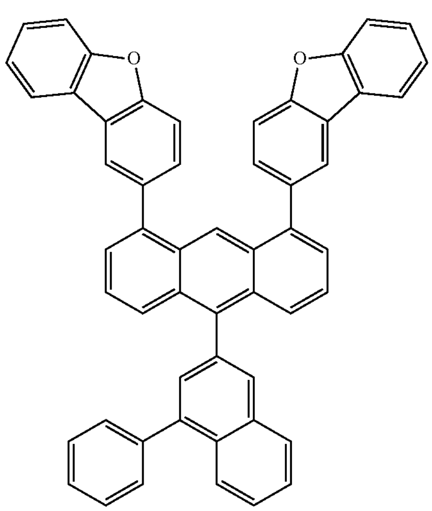
-continued
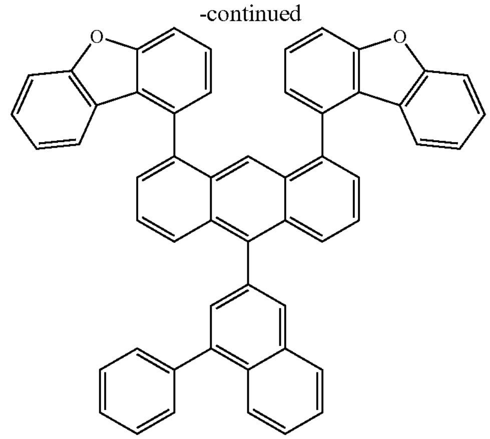
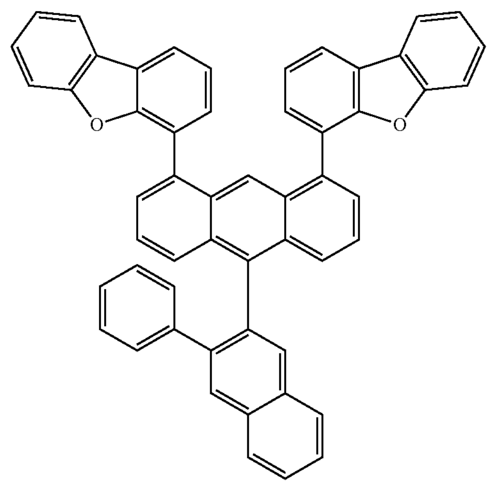
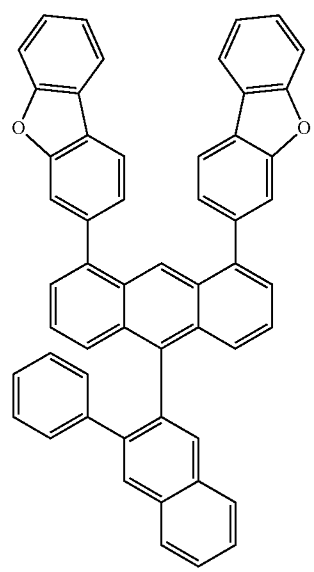

-continued
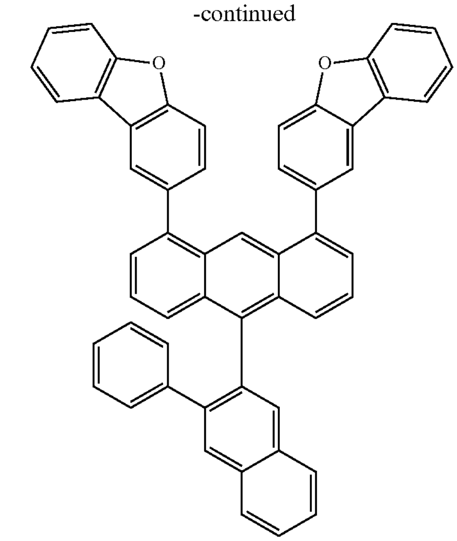
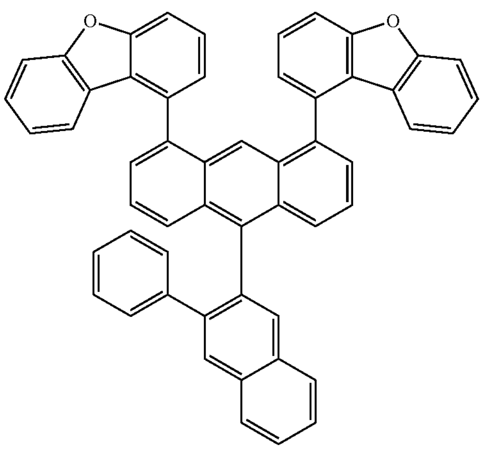
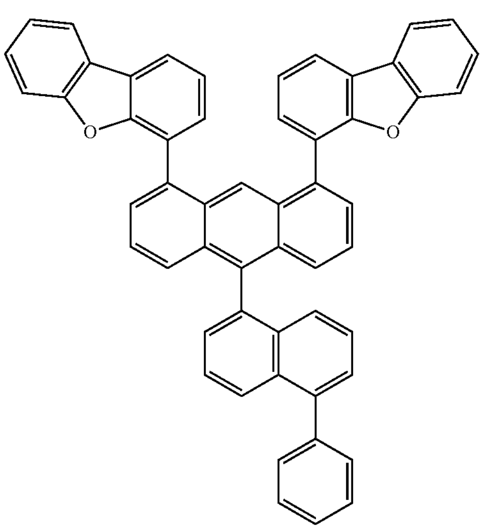
-continued
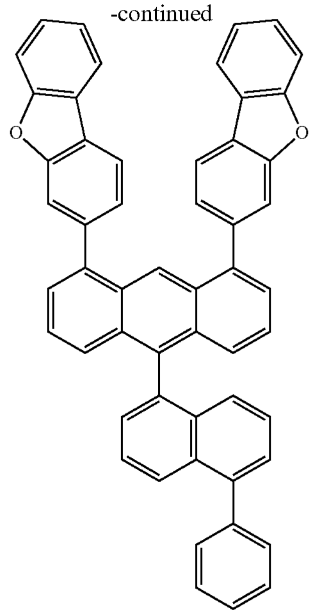
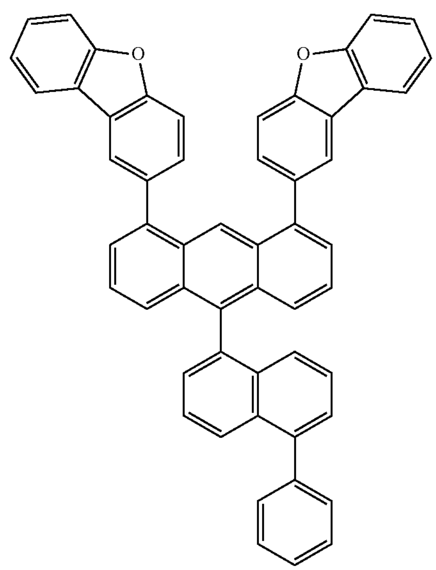
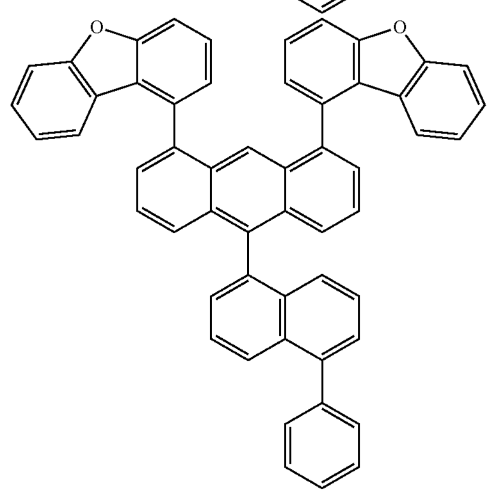

-continued
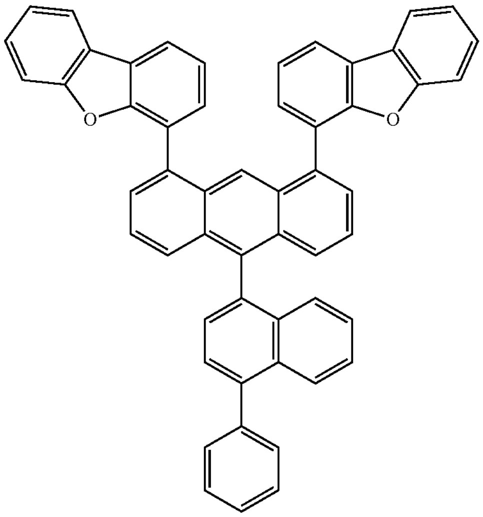
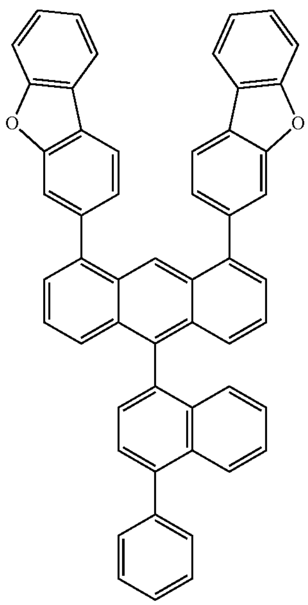
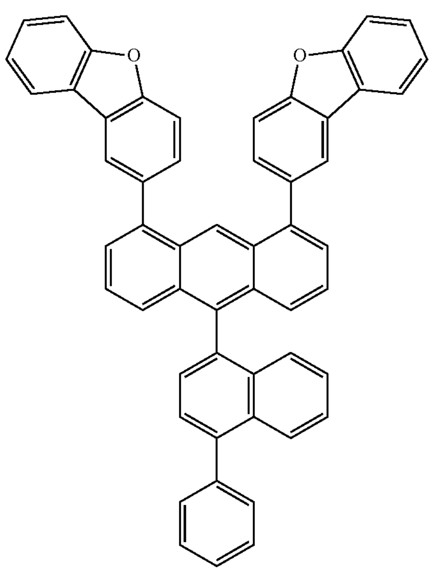
-continued
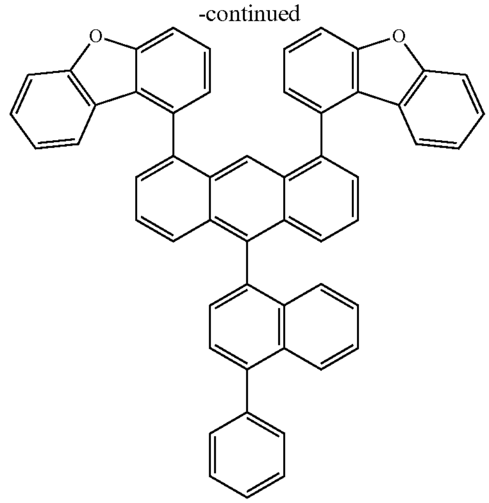
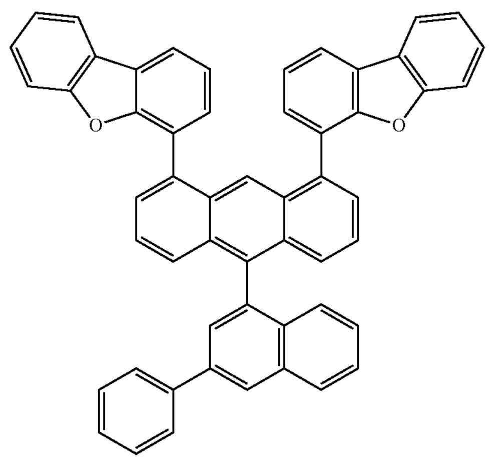
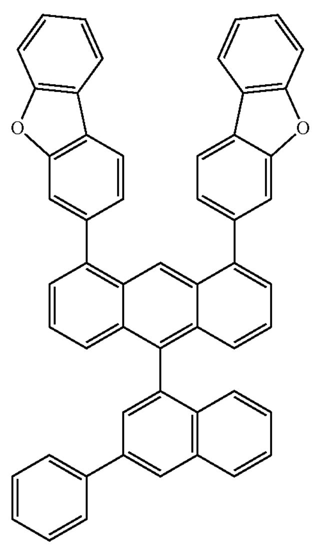

-continued
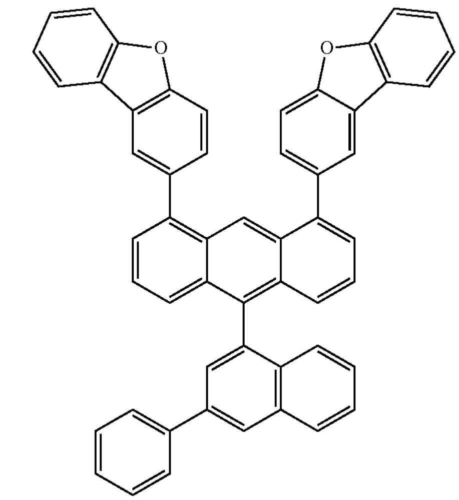
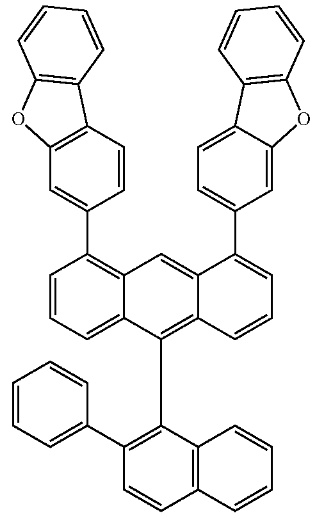
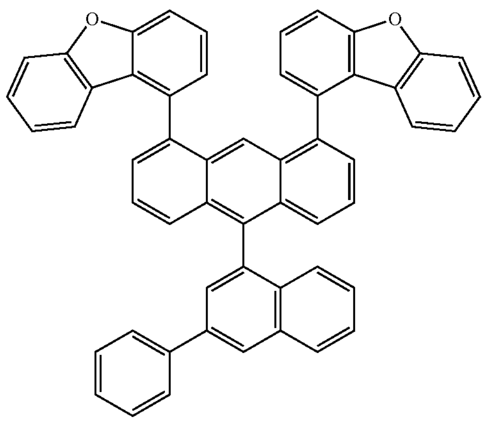
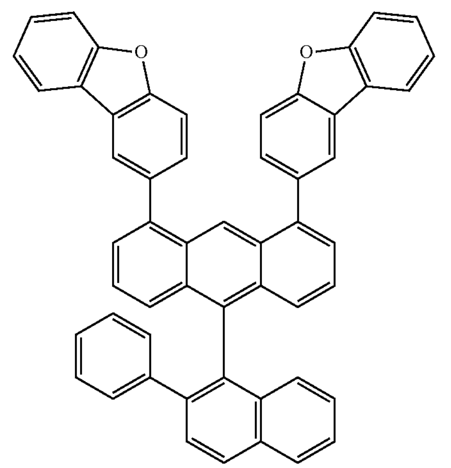
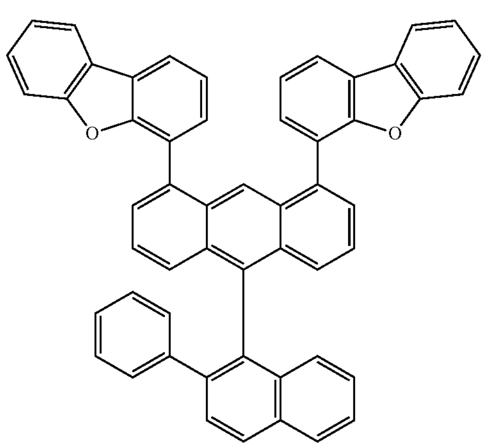
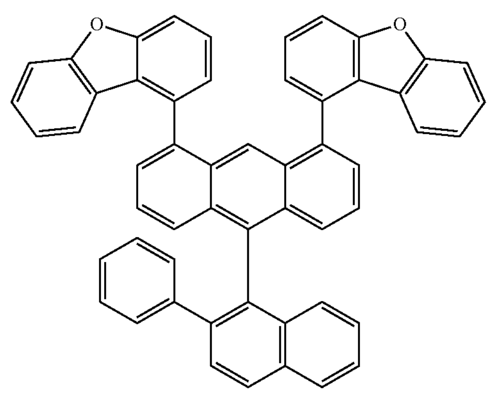

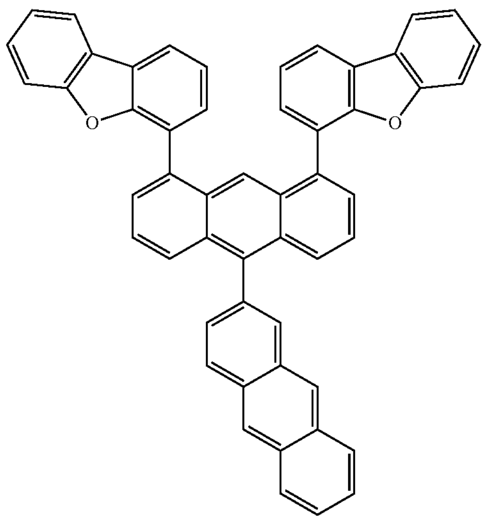
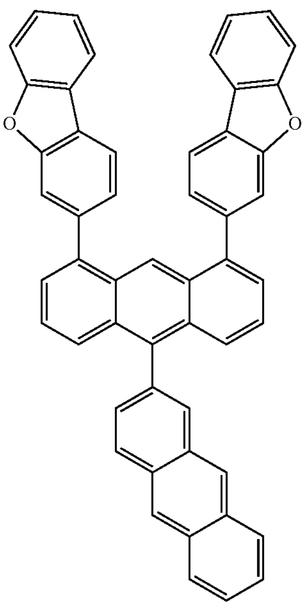
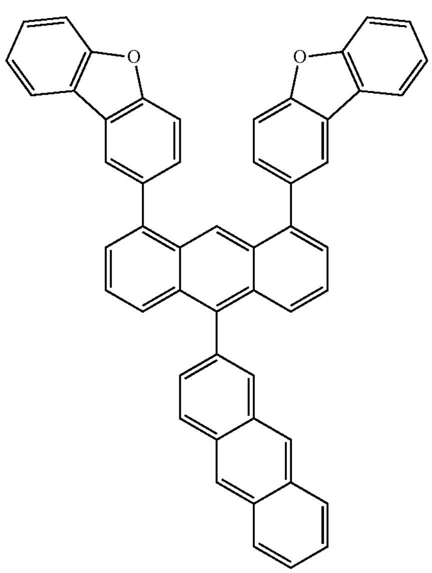
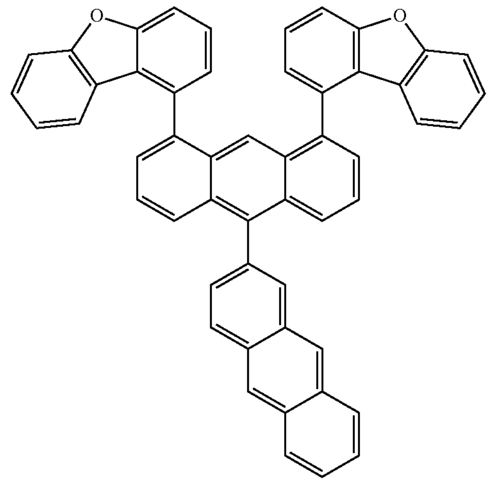
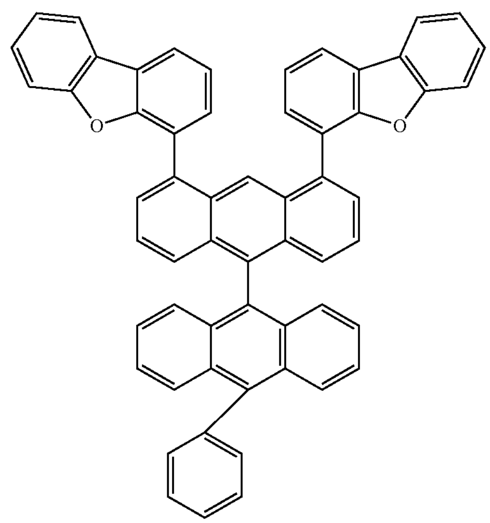
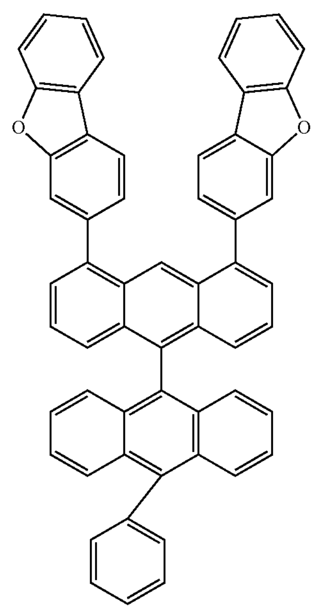

-continued
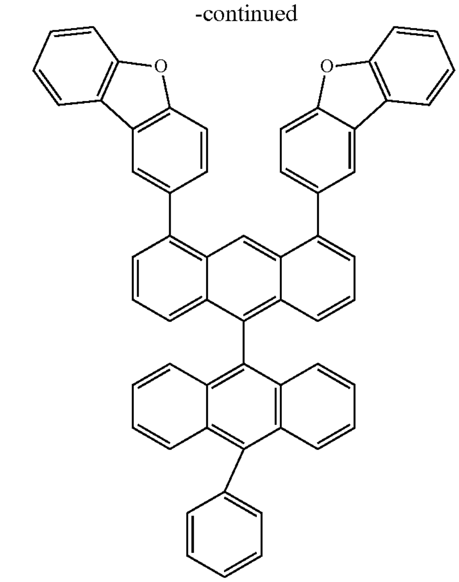
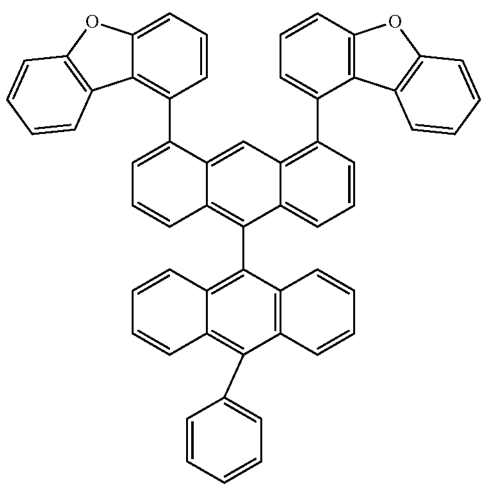
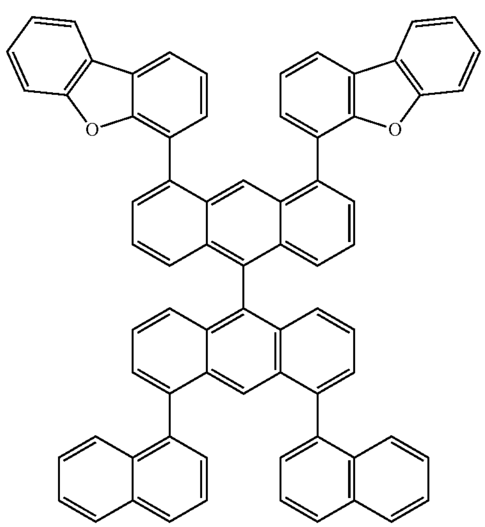
-continued
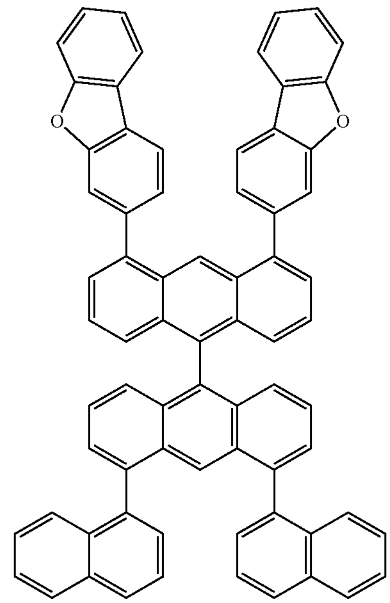
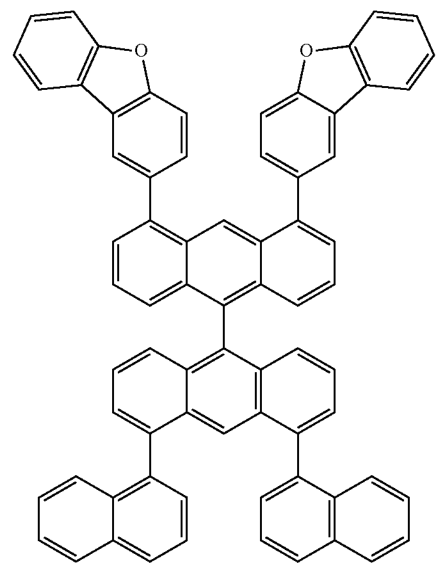
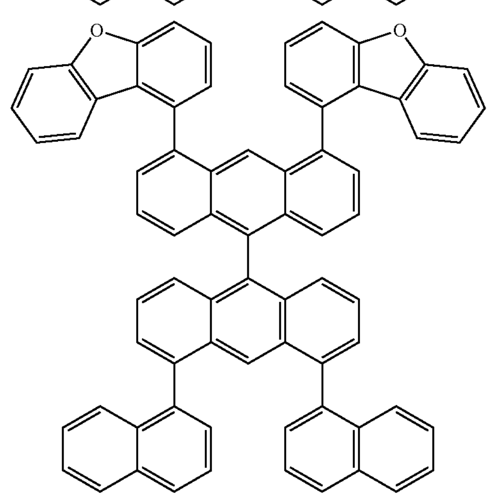

-continued
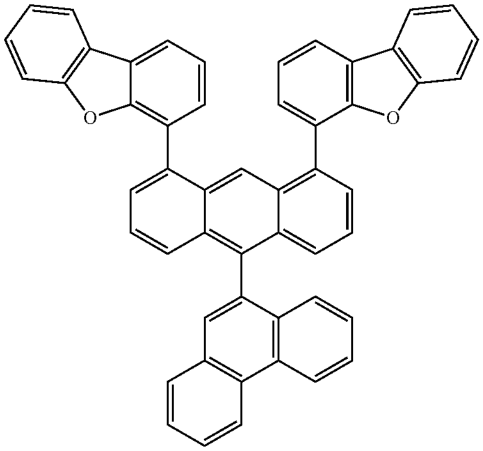
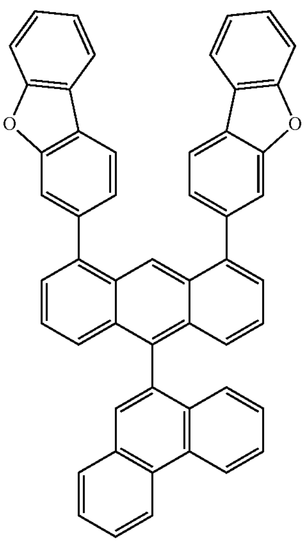
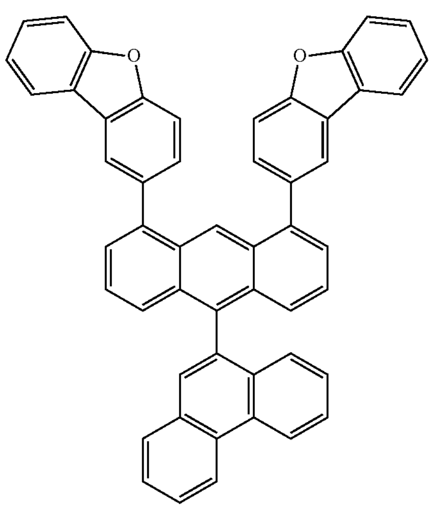
-continued
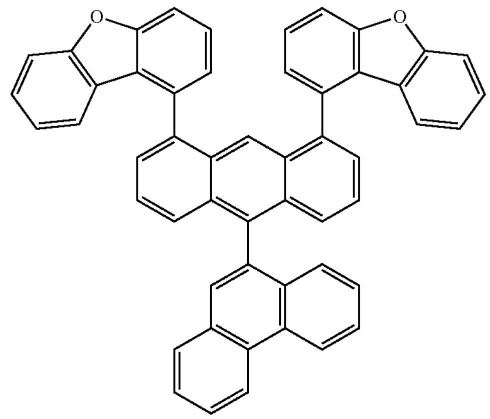
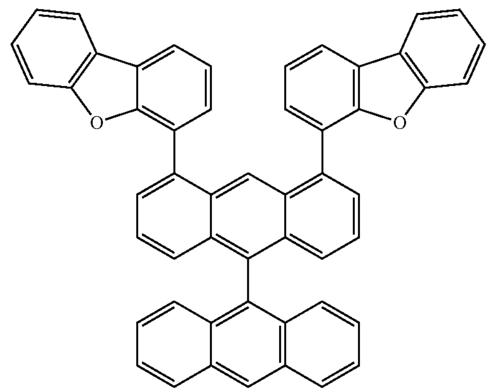
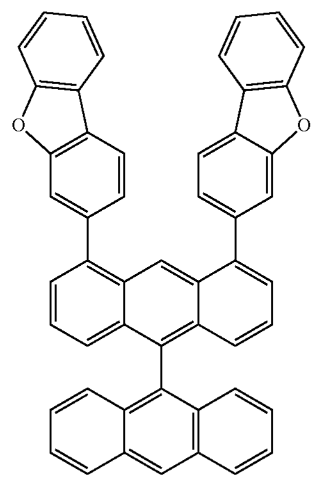
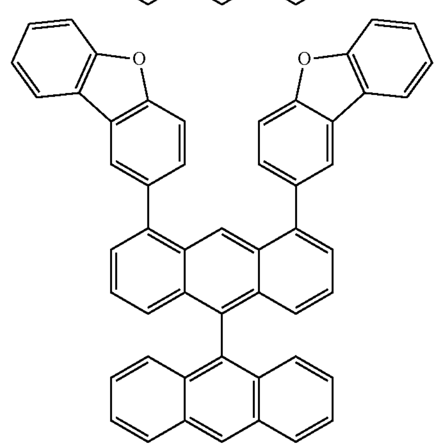

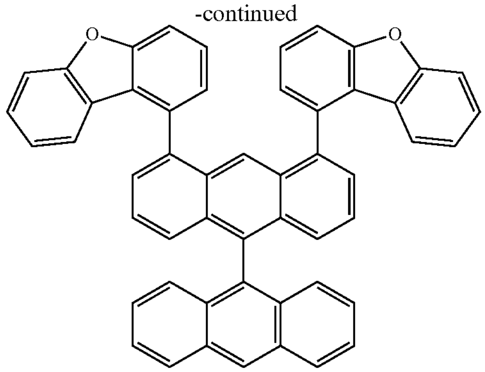
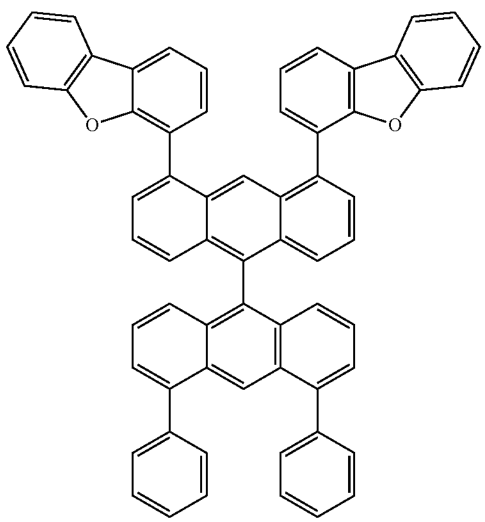
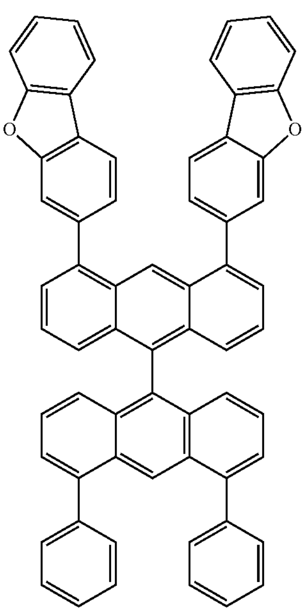
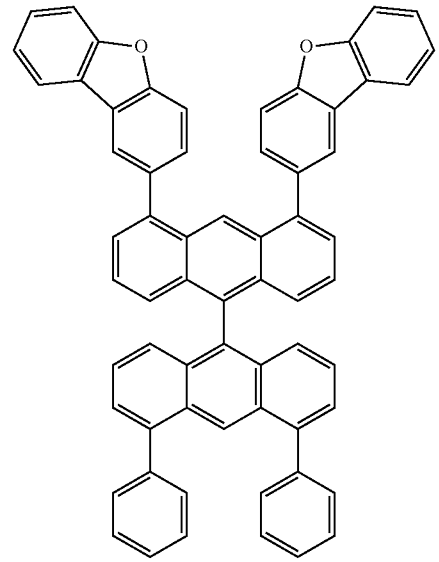
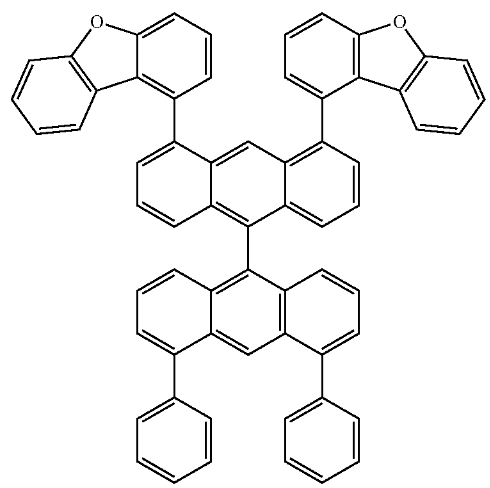
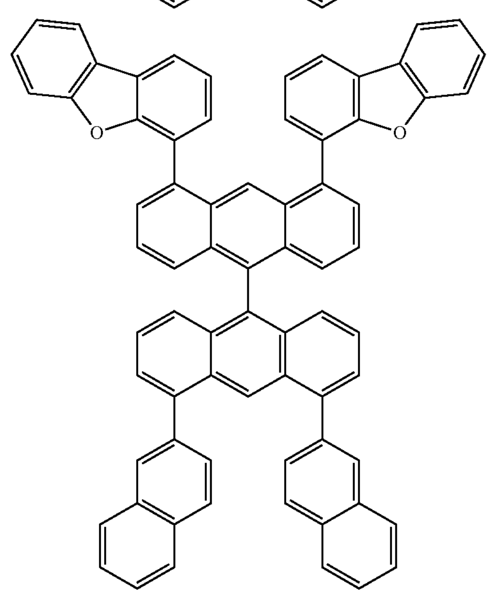

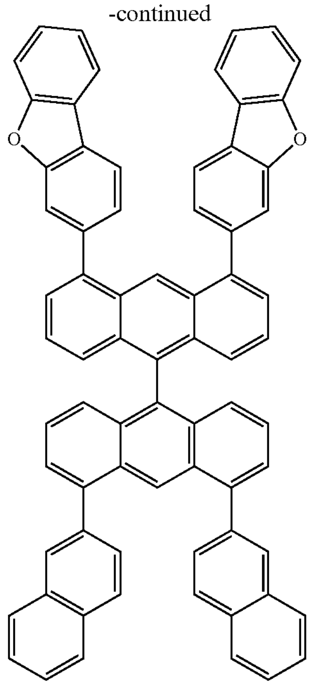
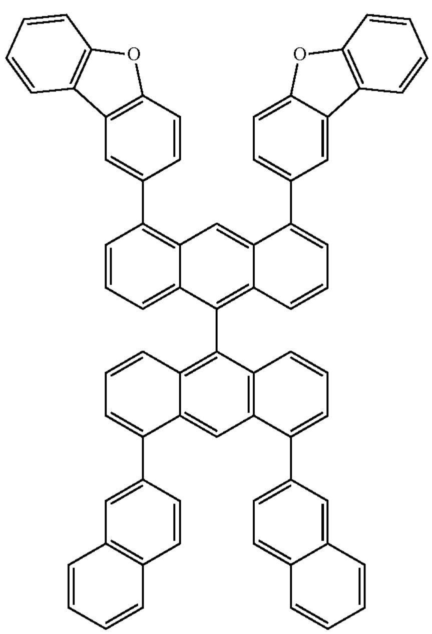
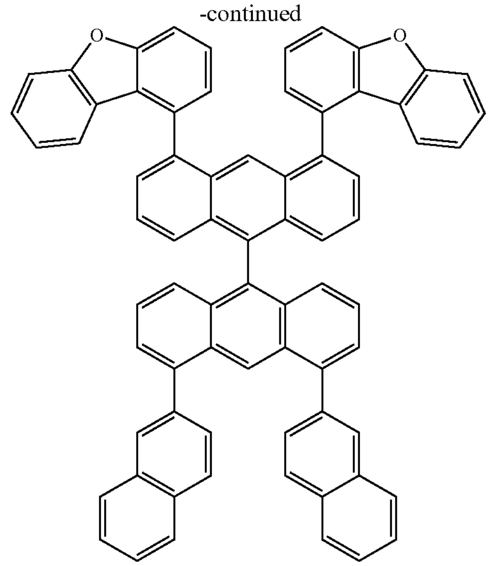
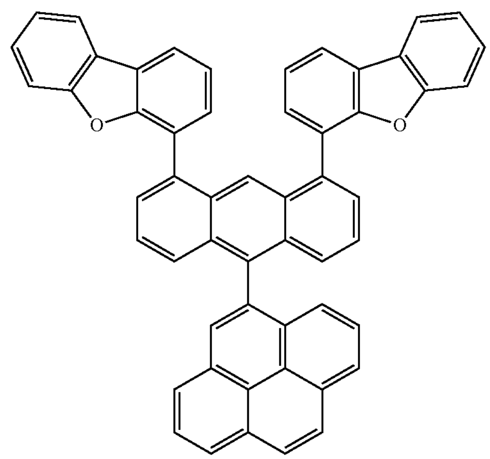
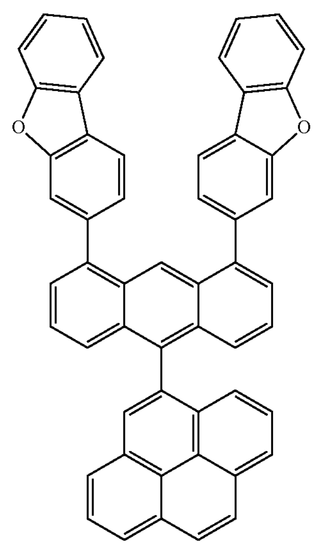

-continued
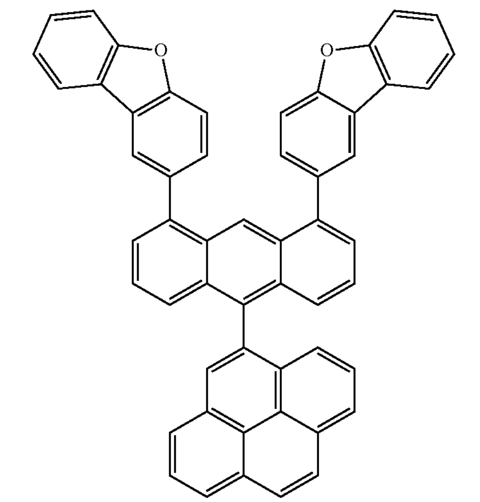
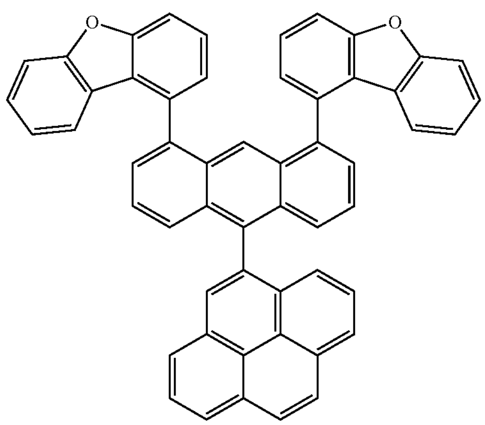
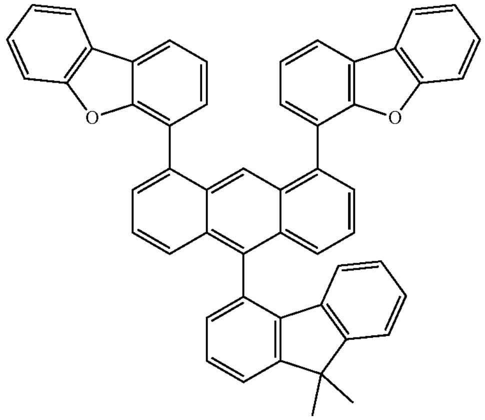
-continued
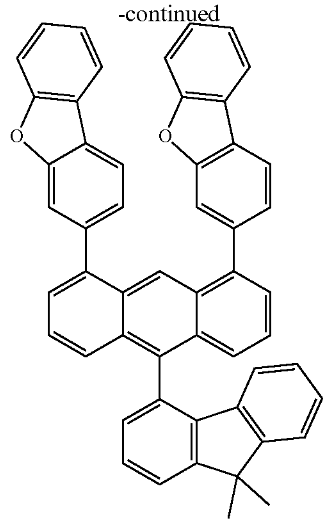
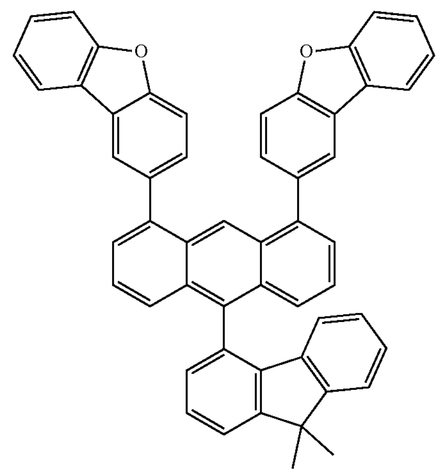
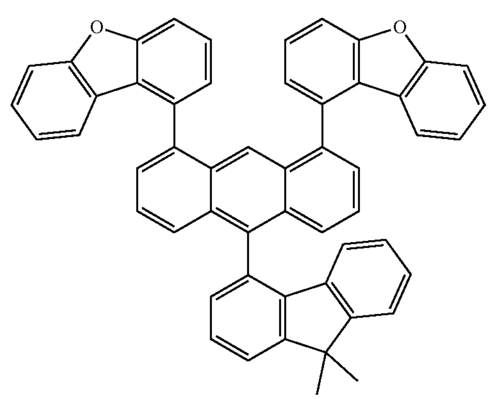

-continued
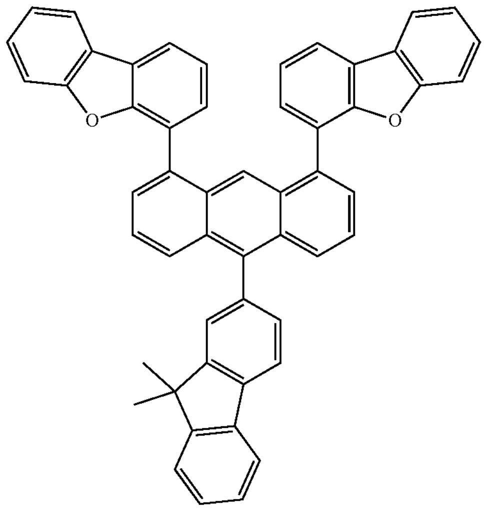
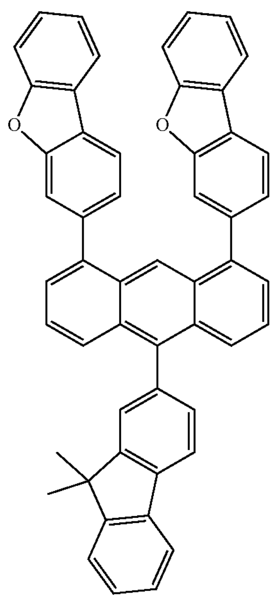
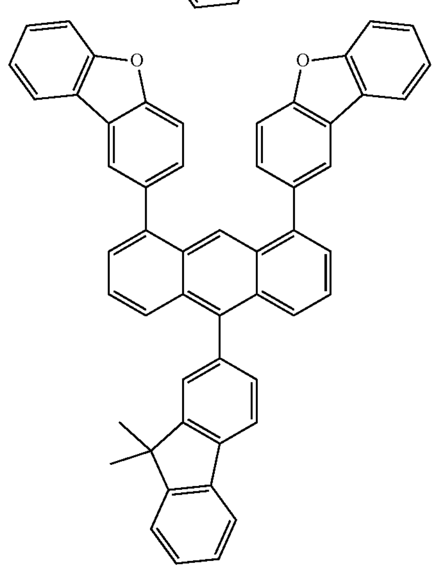
-continued
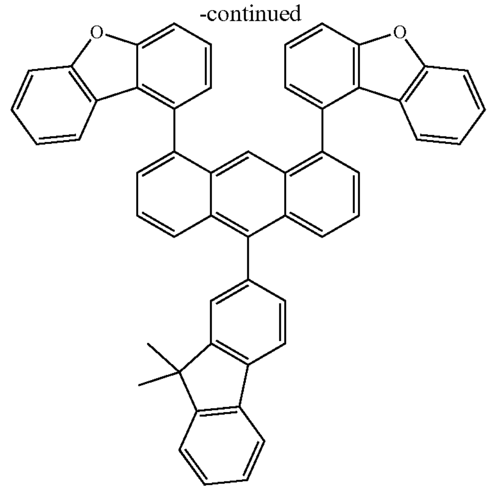
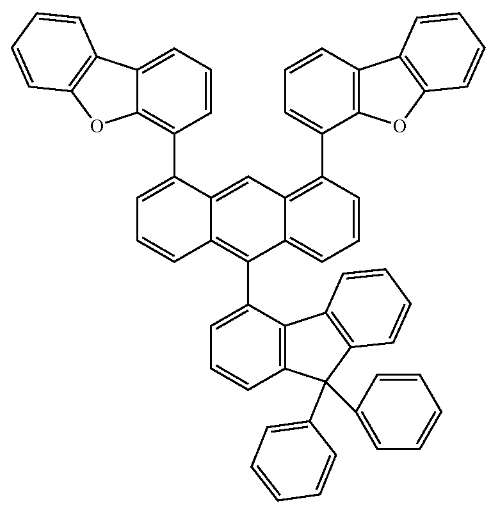
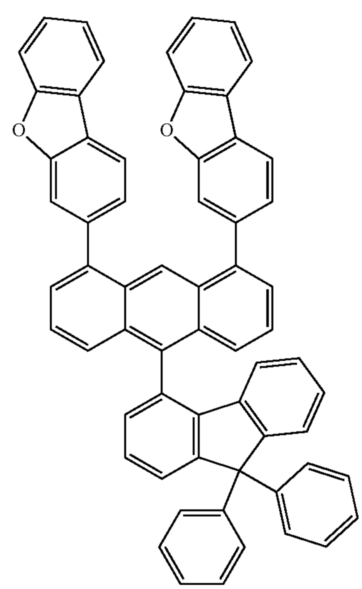

-continued
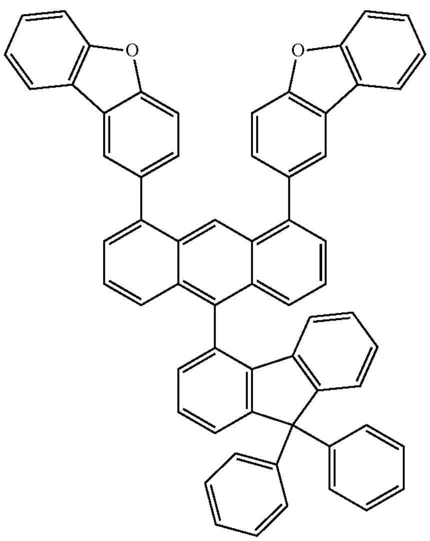
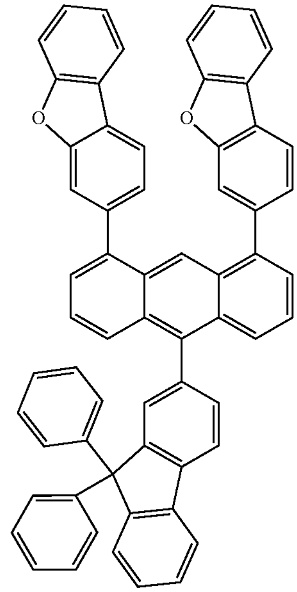
-continued
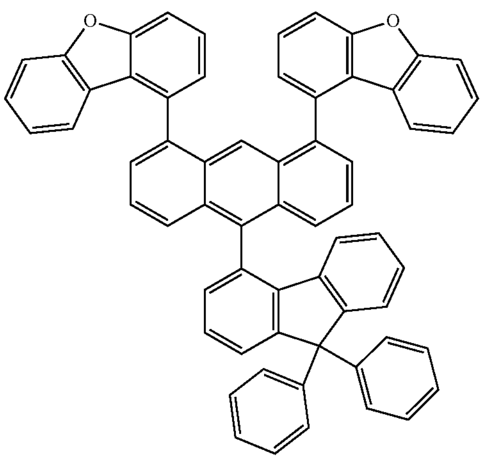
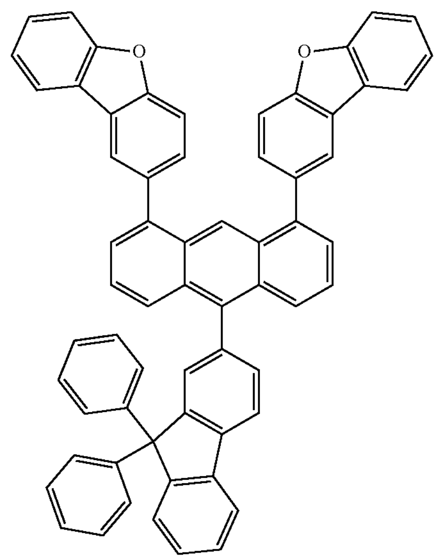
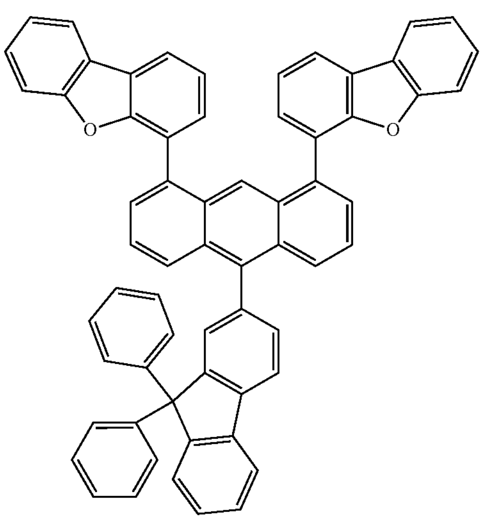
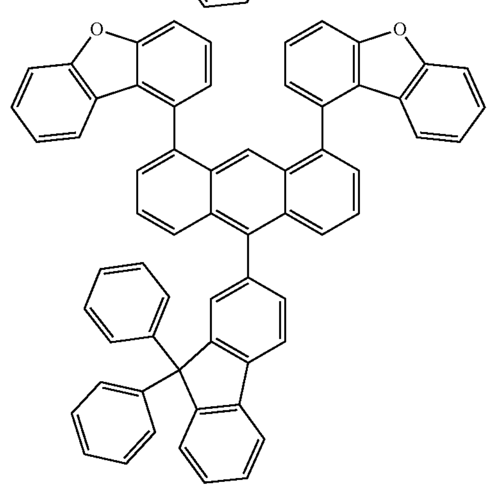

-continued
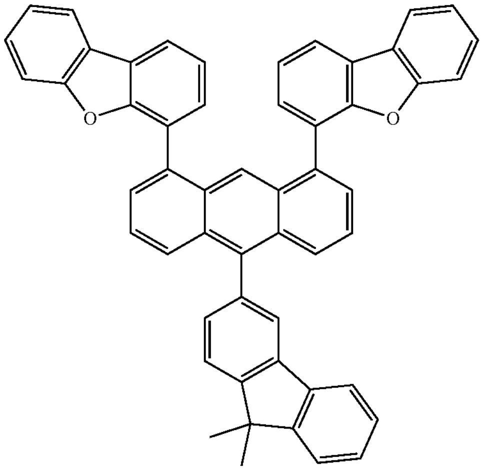
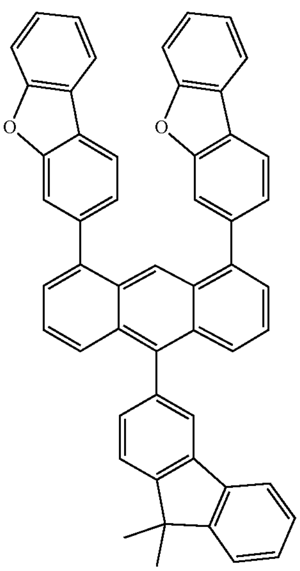
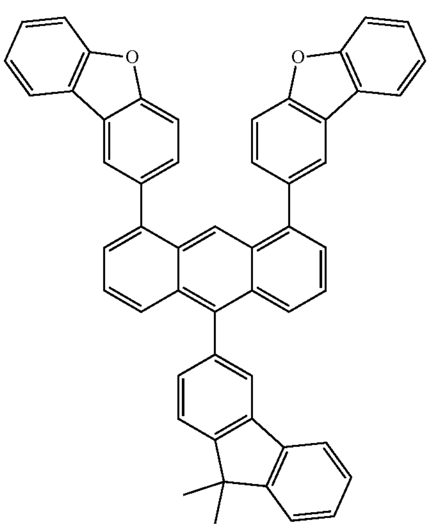
-continued
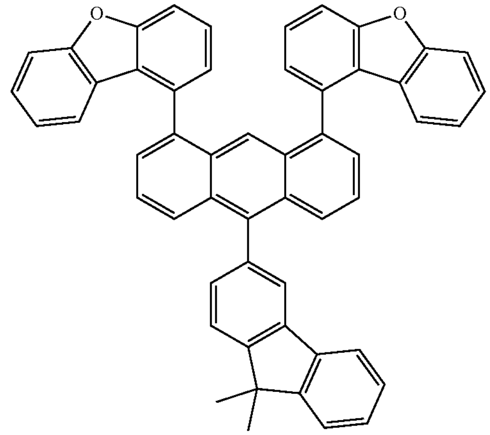
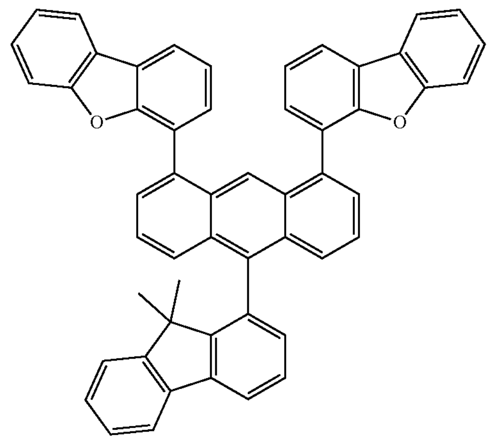
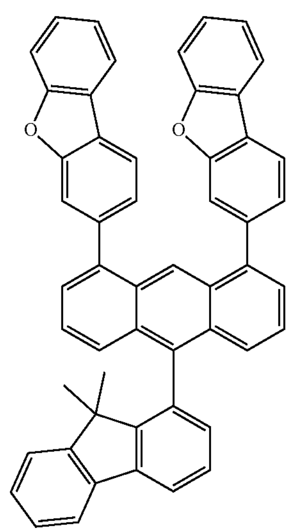

-continued
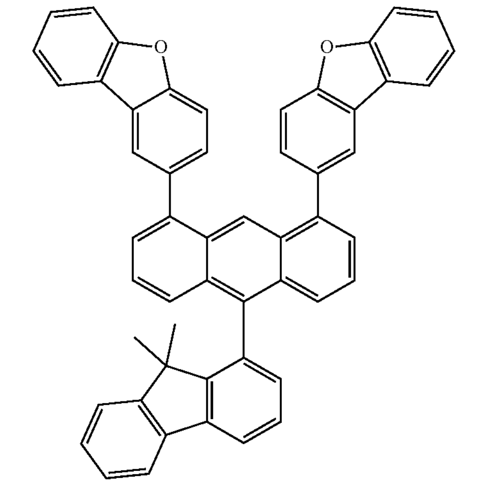
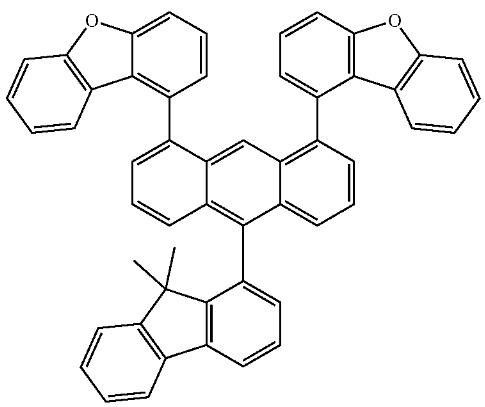
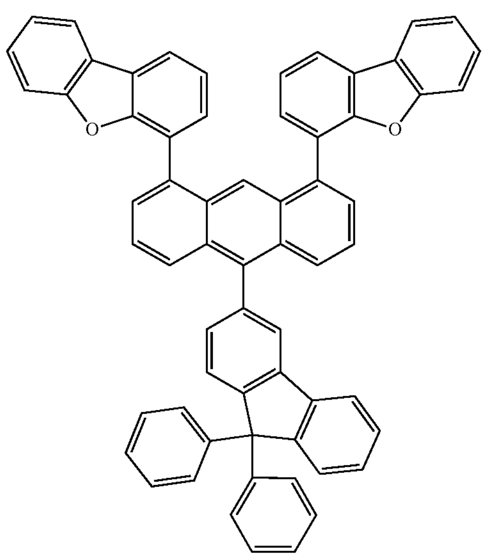
-continued
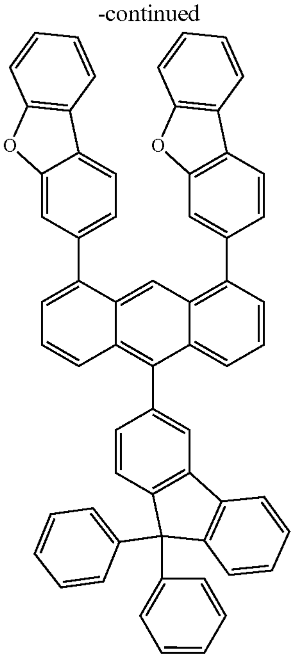
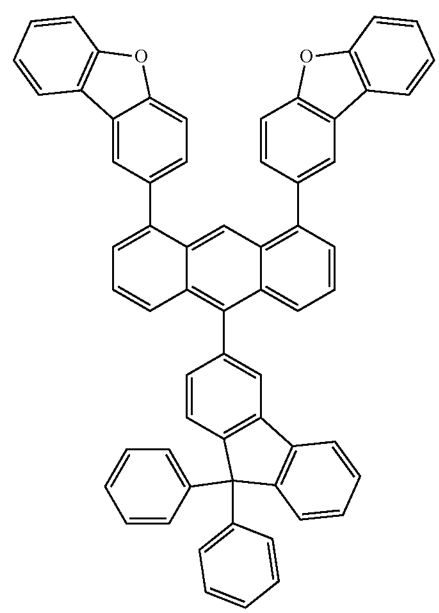

-continued
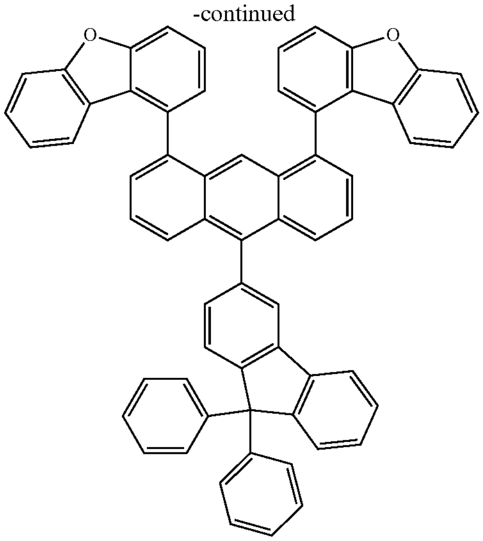
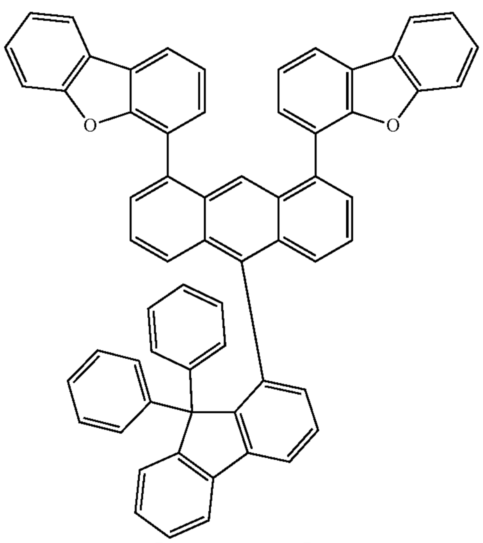
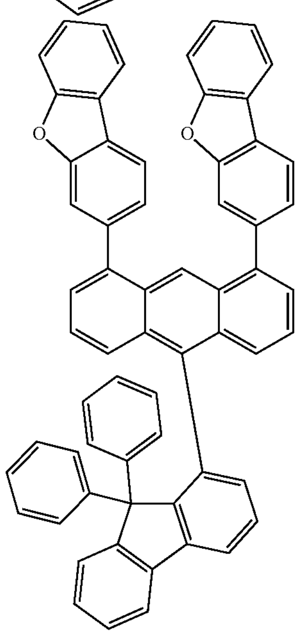
-continued
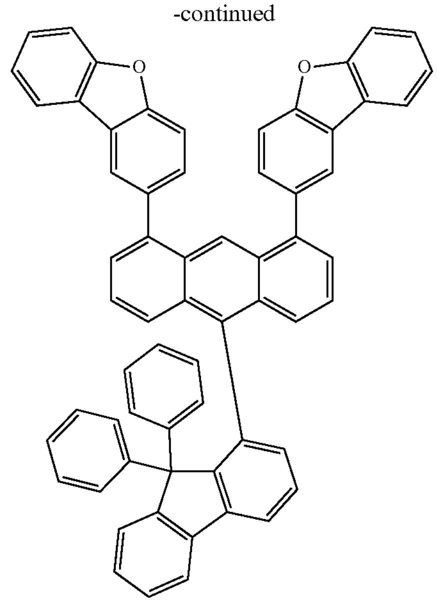
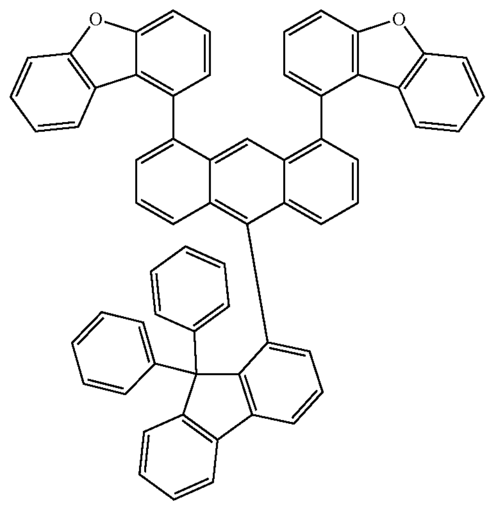
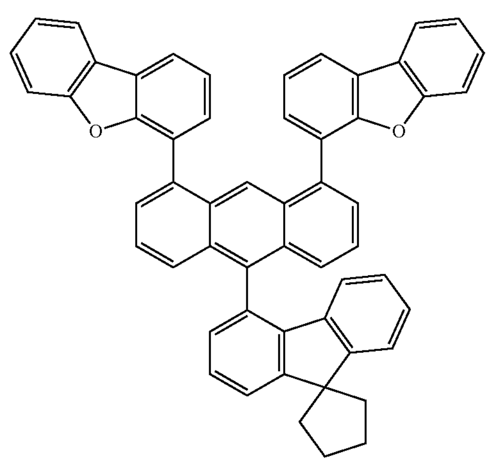

-continued
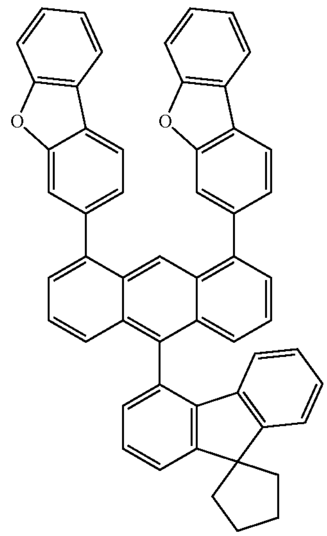
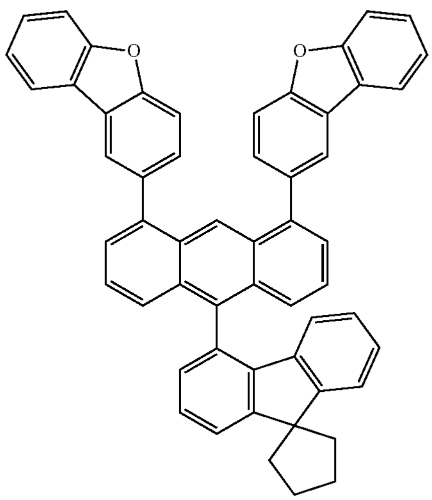
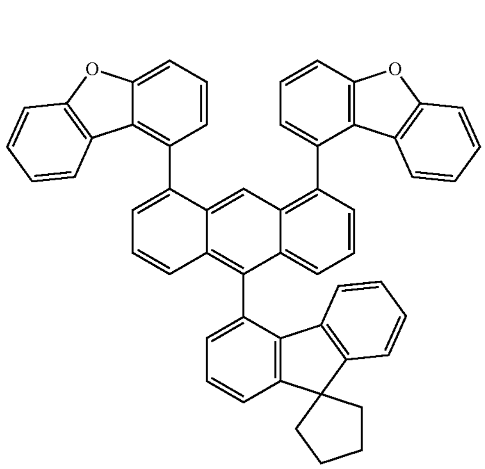
-continued
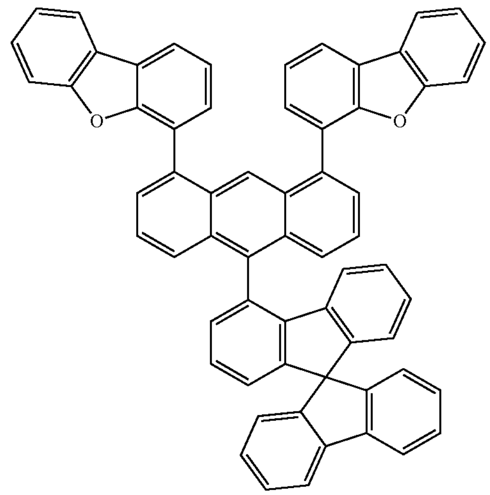
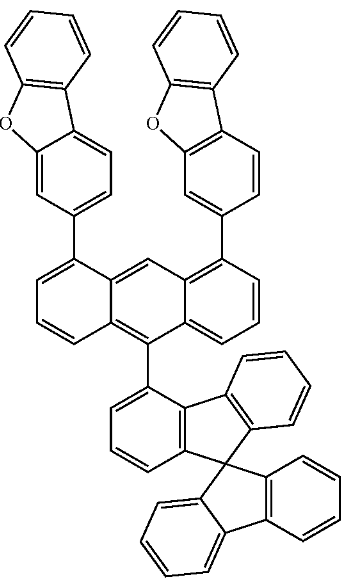
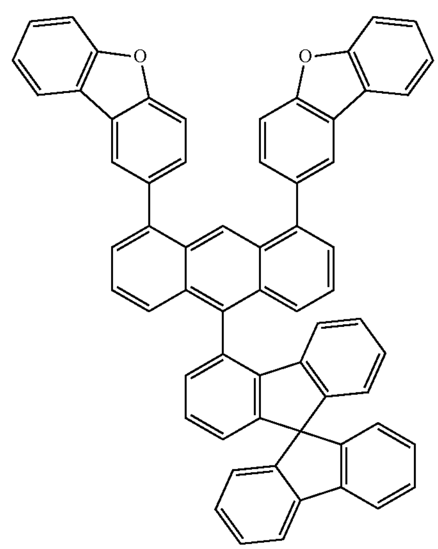

-continued
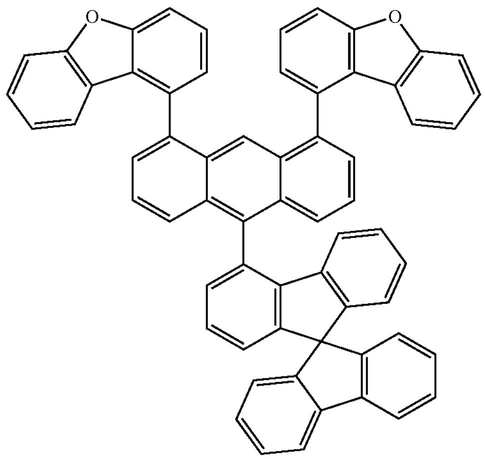
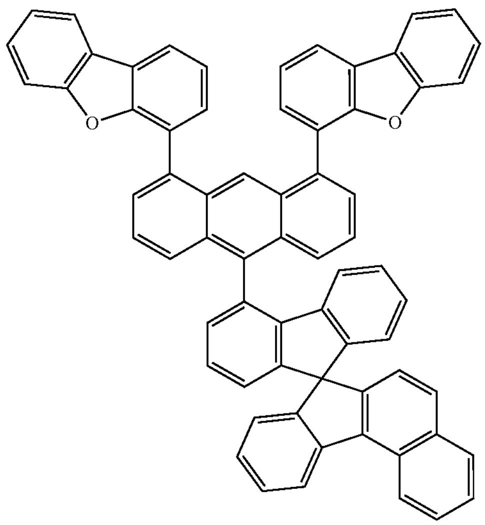
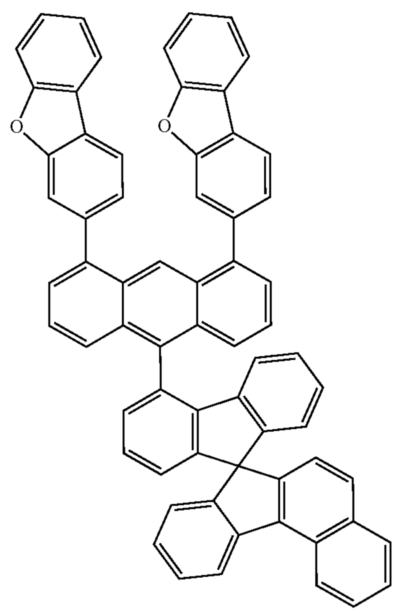
-continued
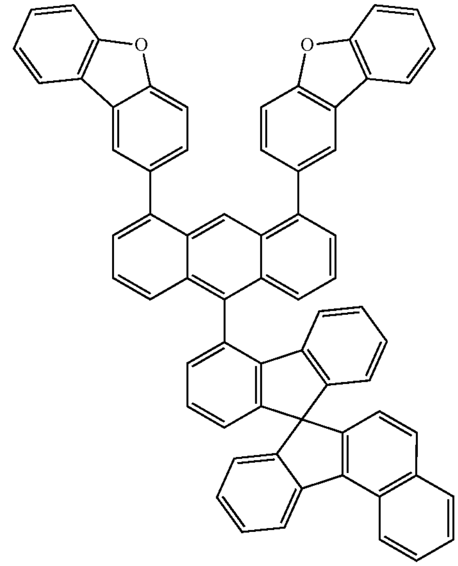
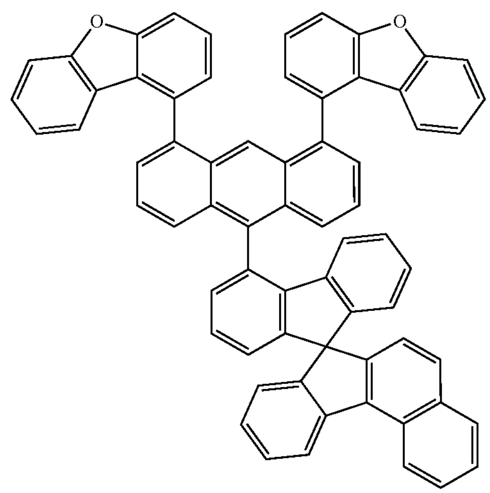
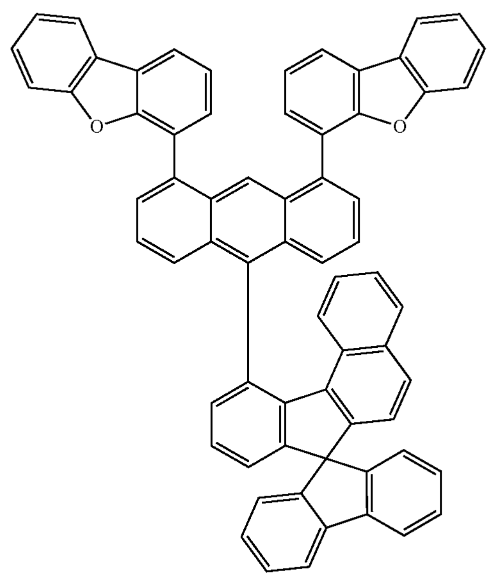

-continued
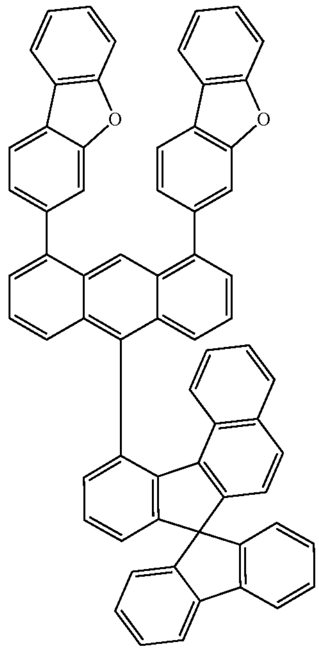
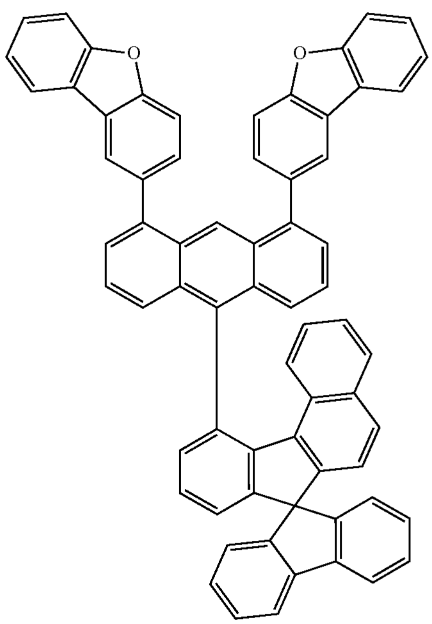
-continued
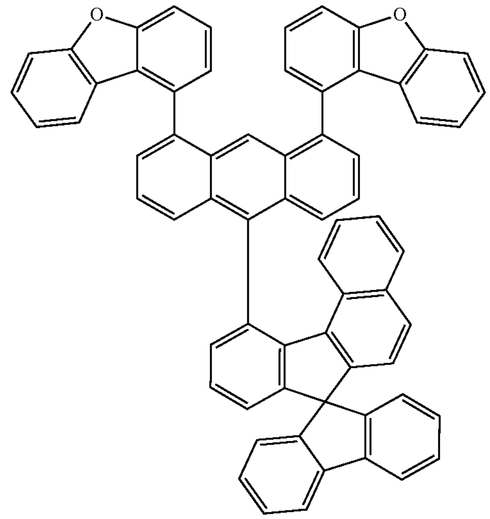
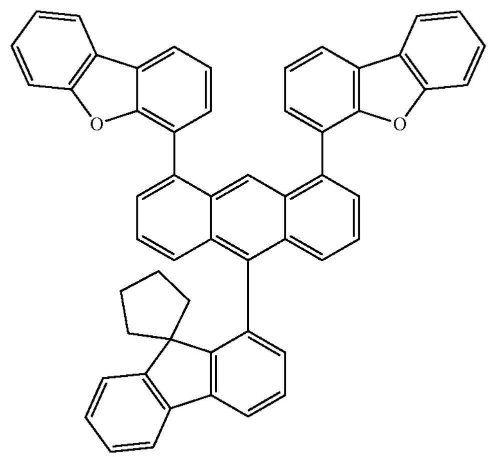
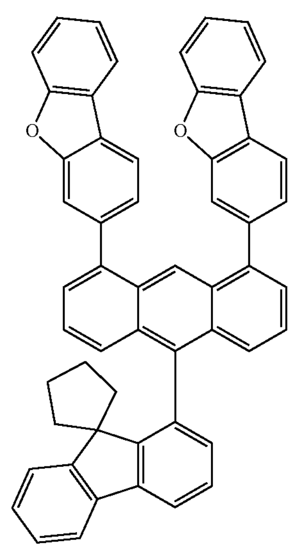

-continued
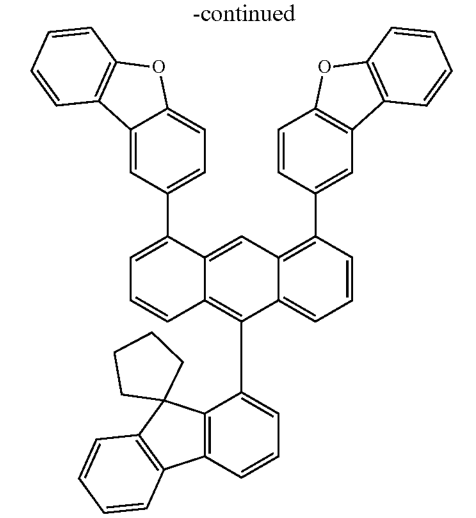
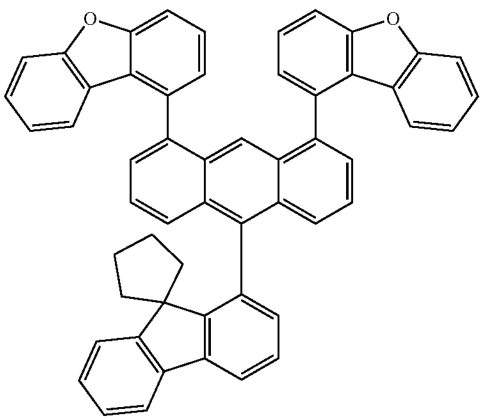
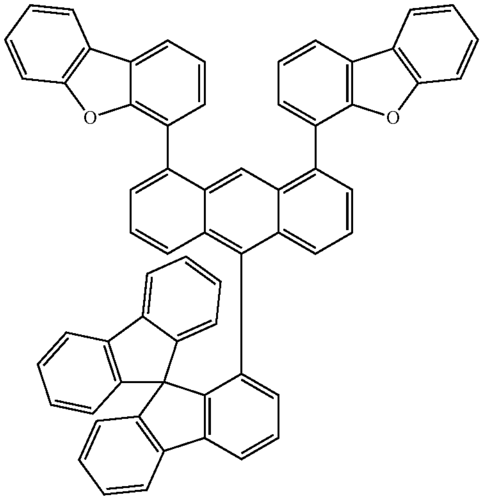
-continued
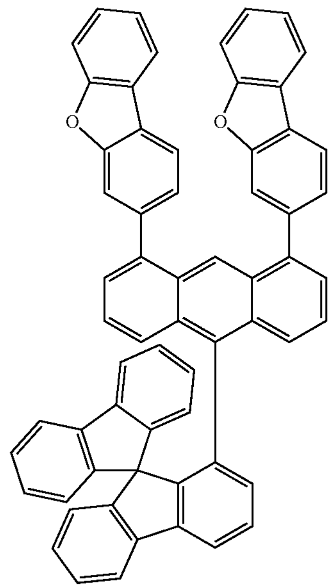
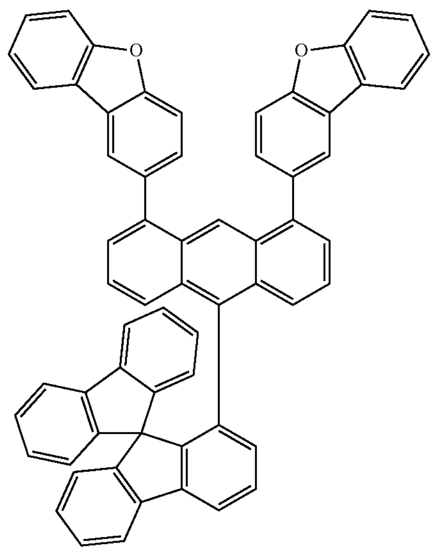
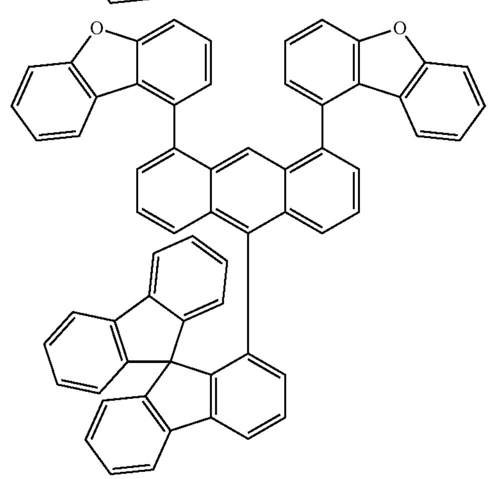

-continued
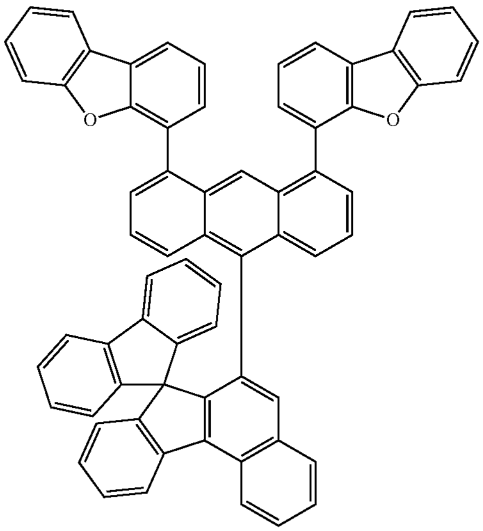
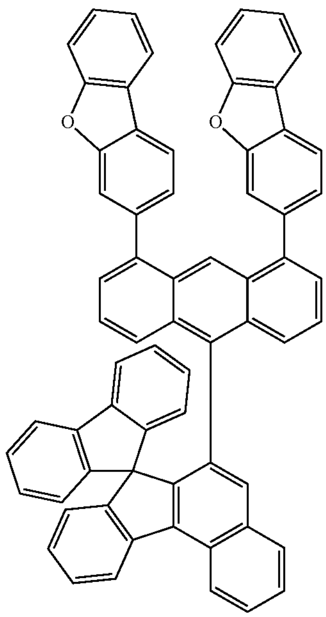
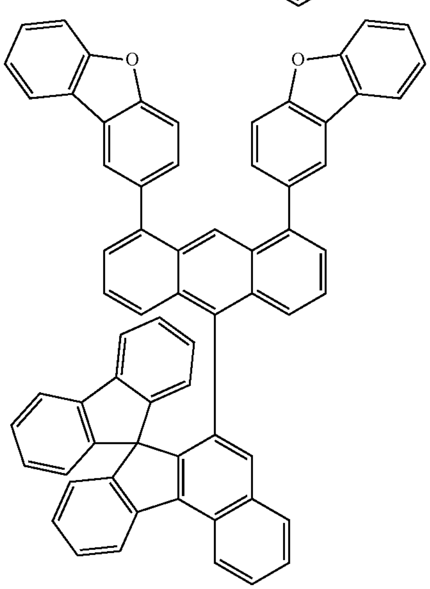
-continued
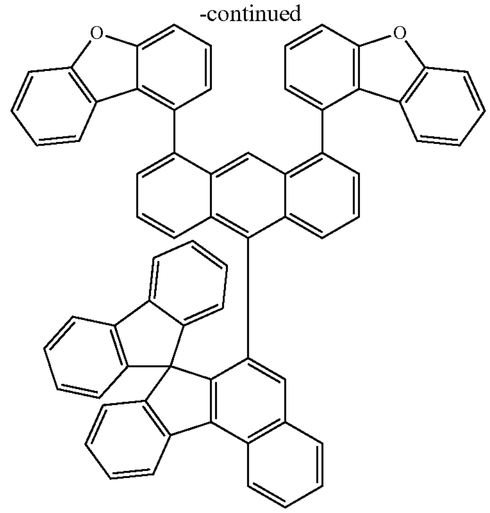
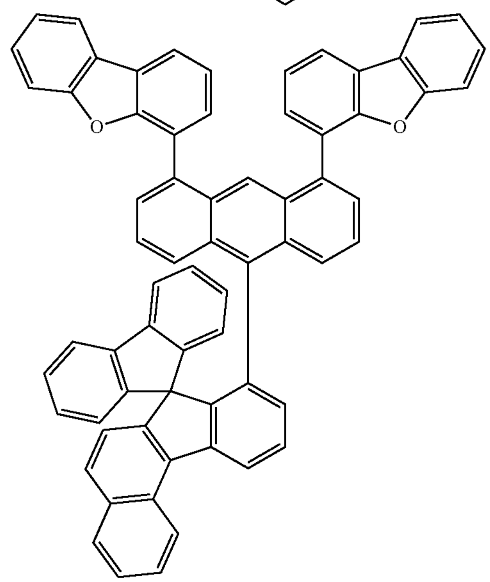
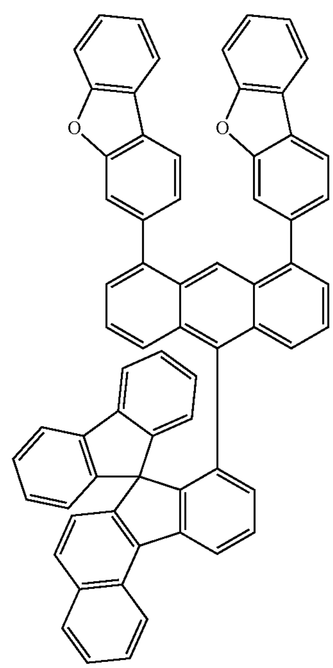

-continued
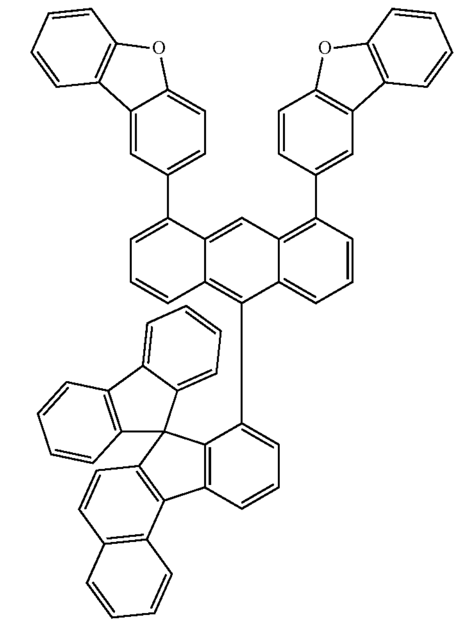
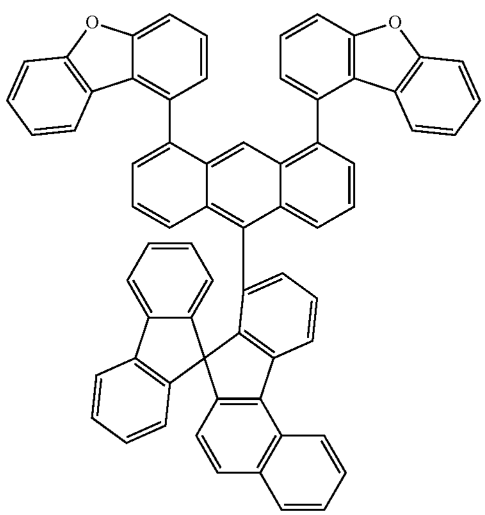
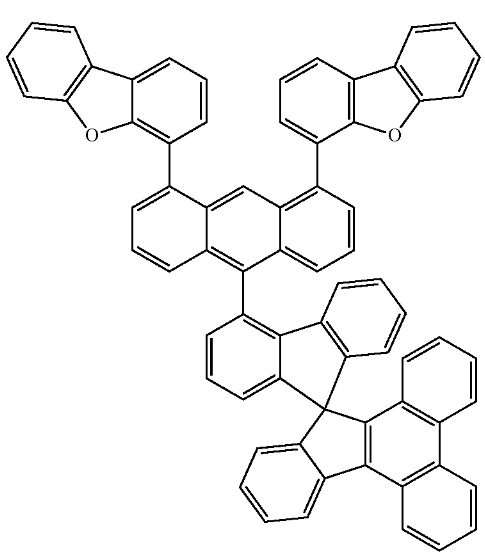
-continued
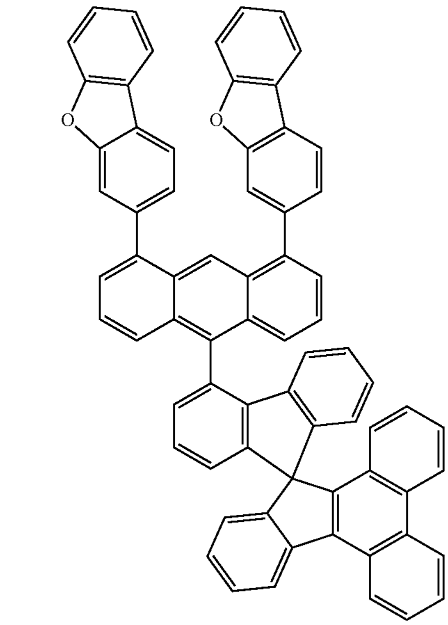
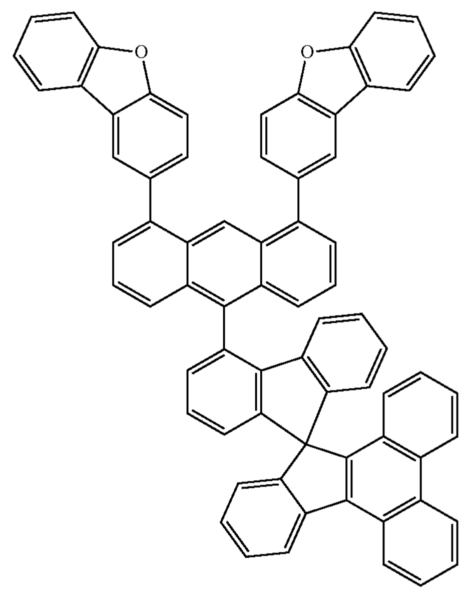
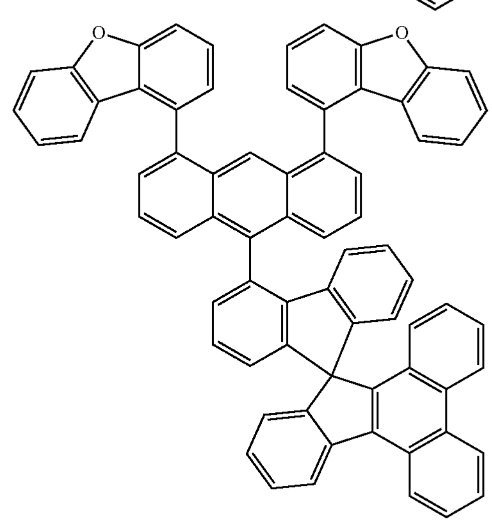

-continued
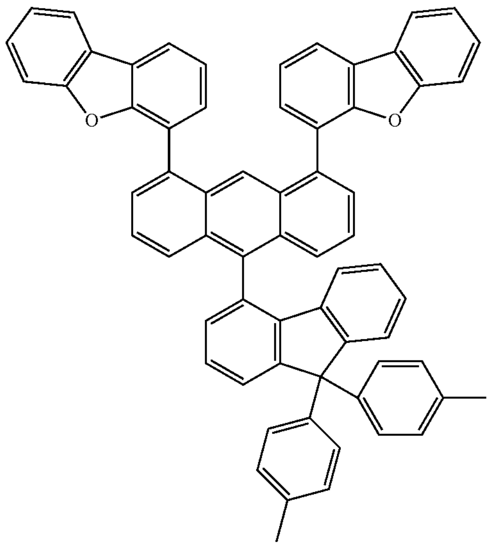
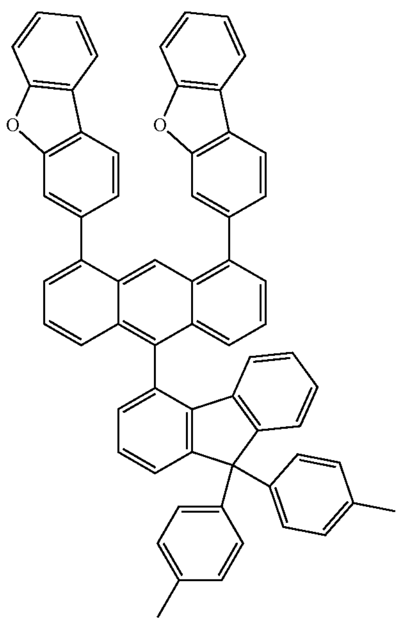
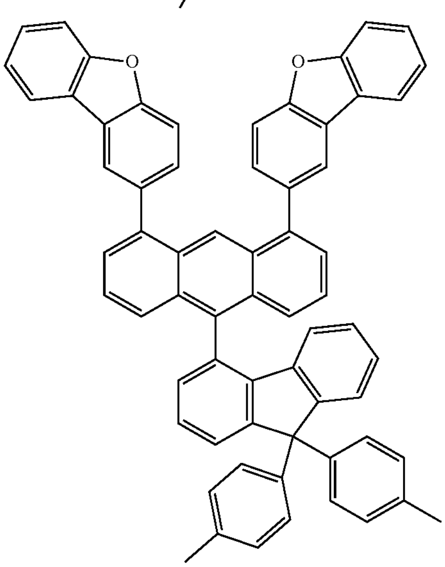
-continued
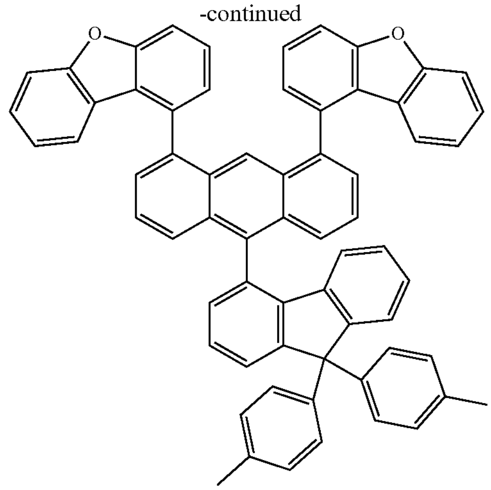
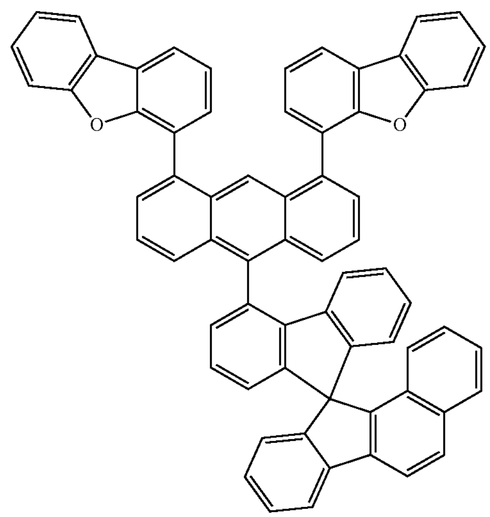
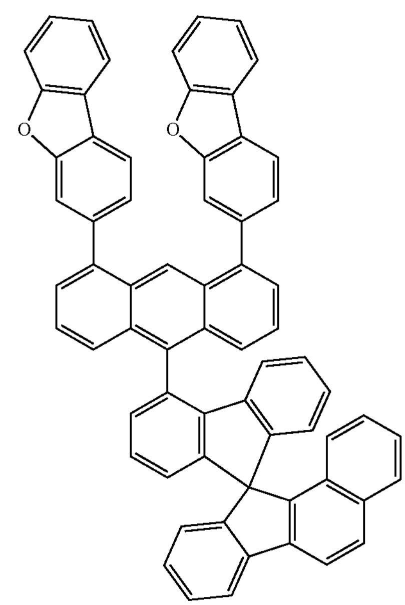

-continued
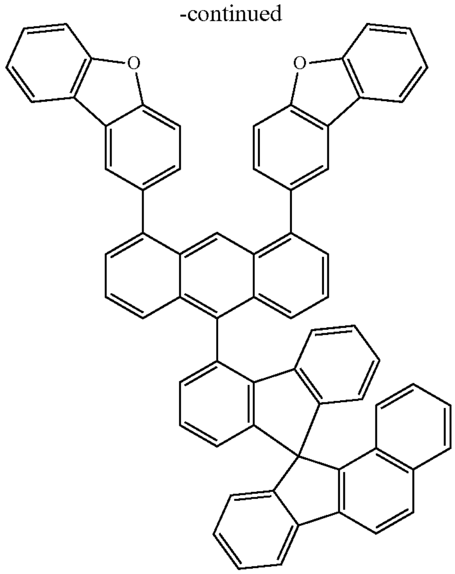
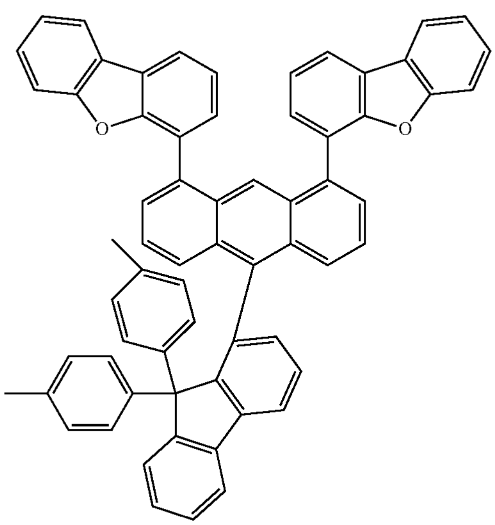
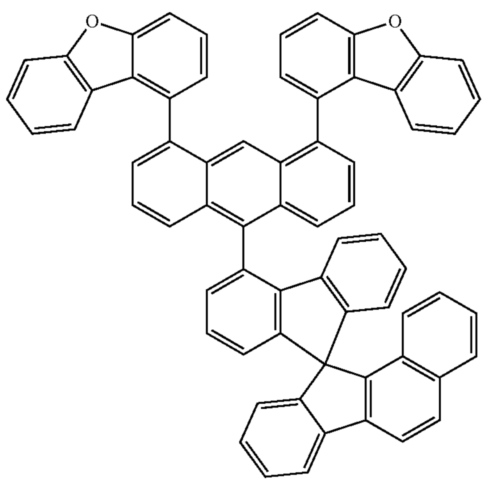
-continued
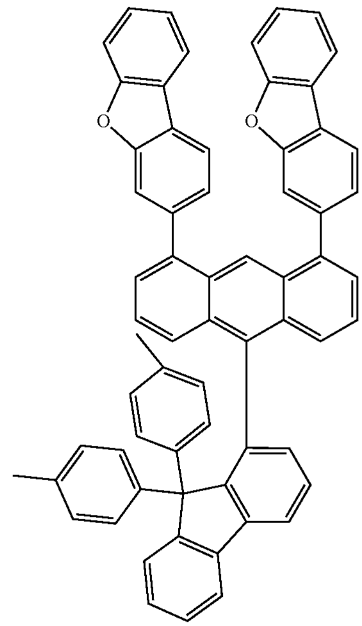
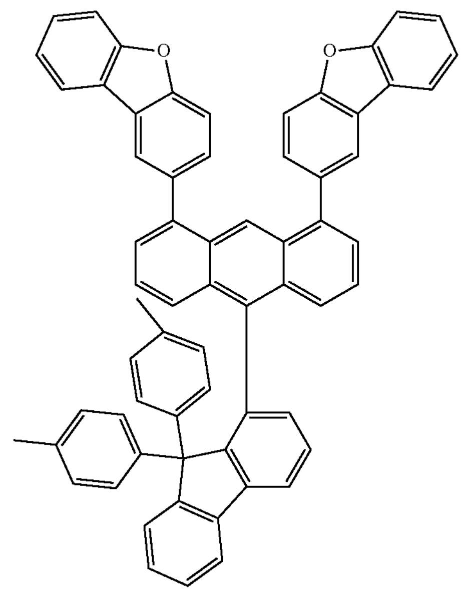
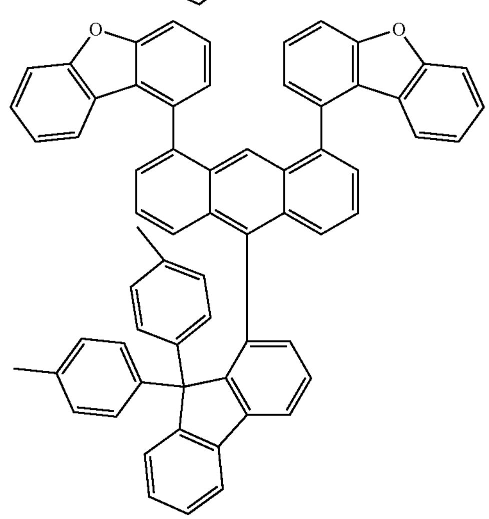

-continued
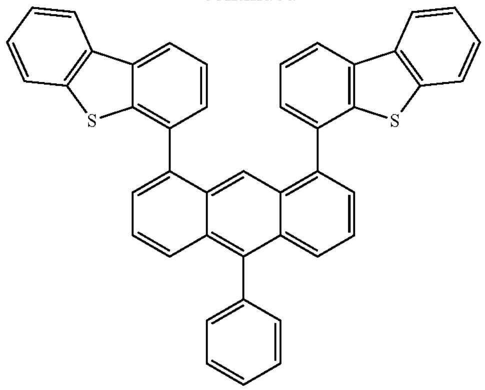
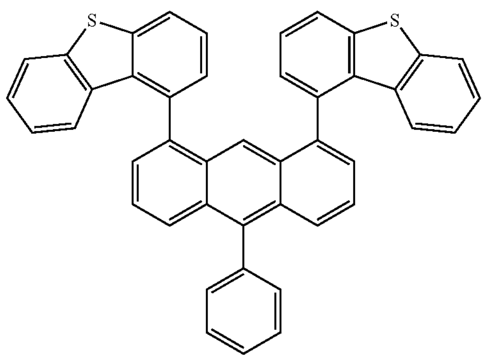
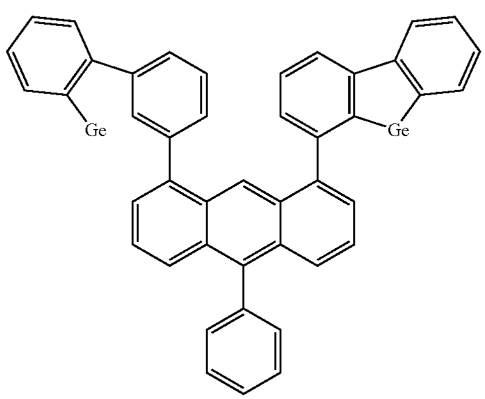
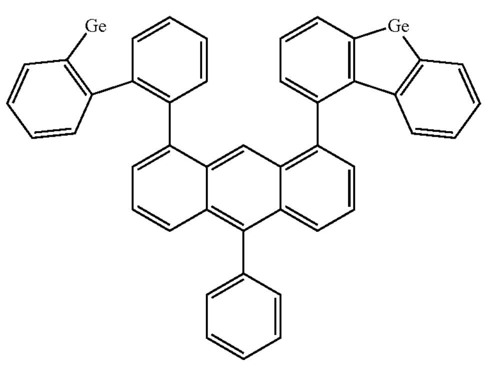
-continued
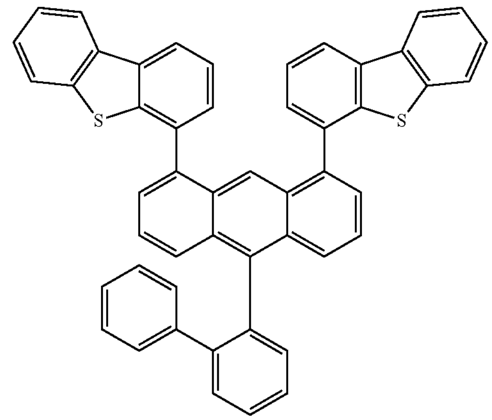
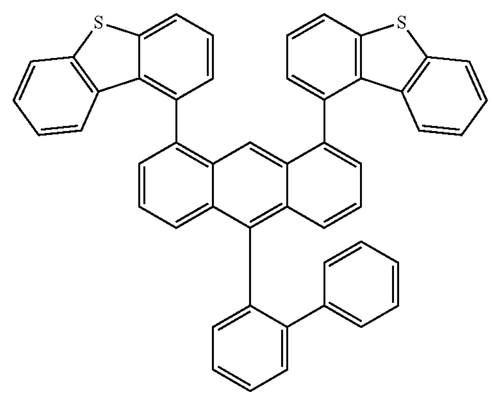
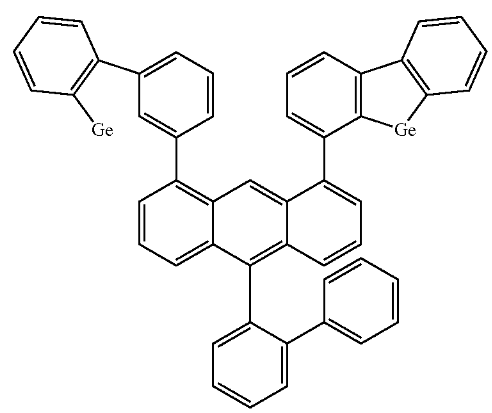
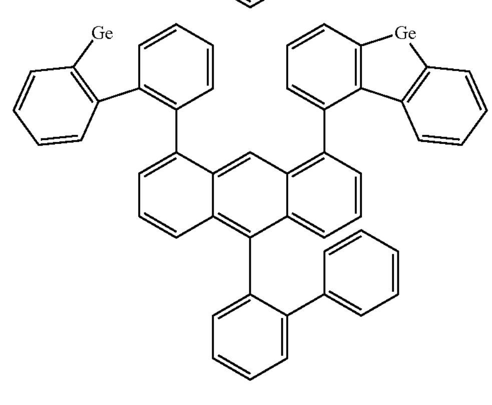

-continued
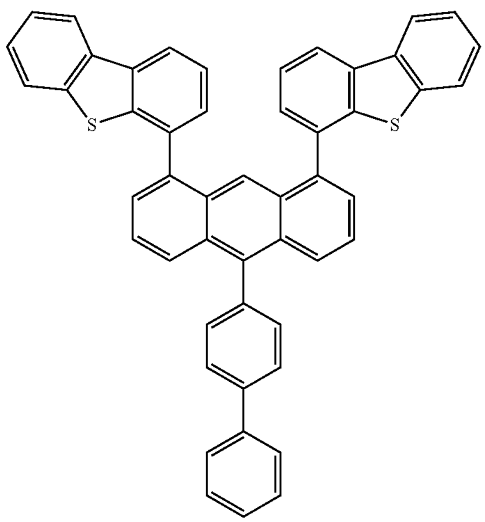
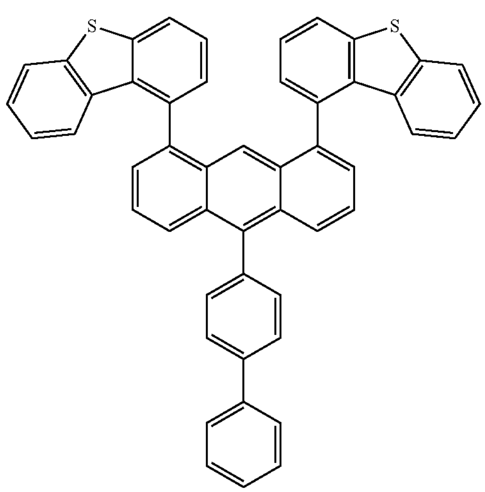
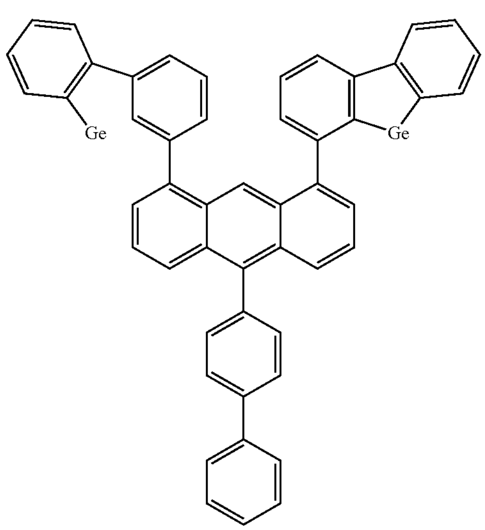
-continued
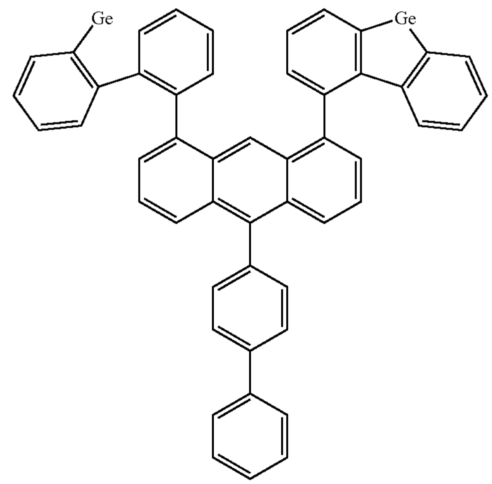
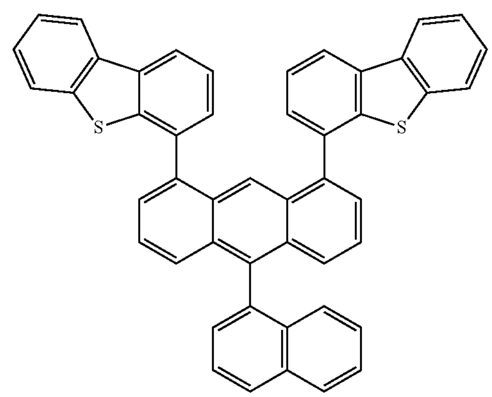
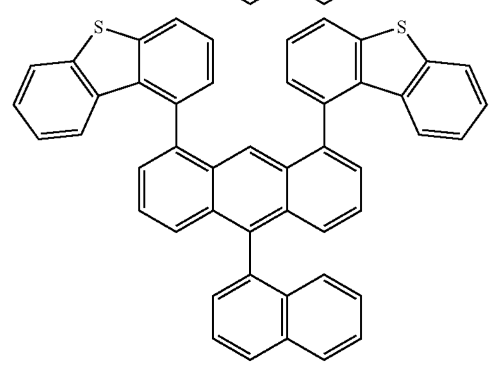
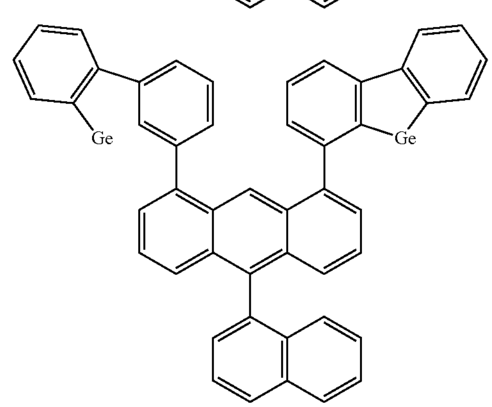

-continued
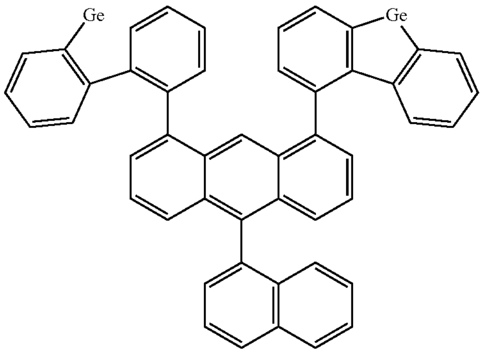
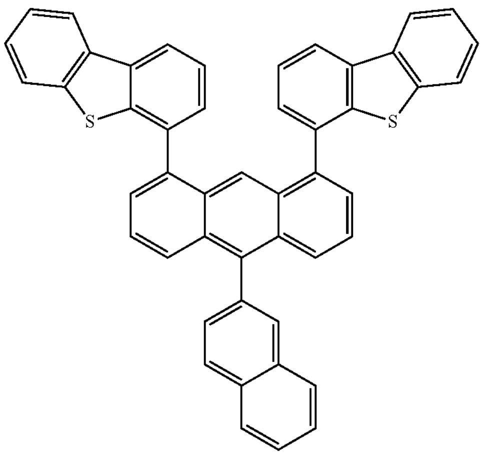
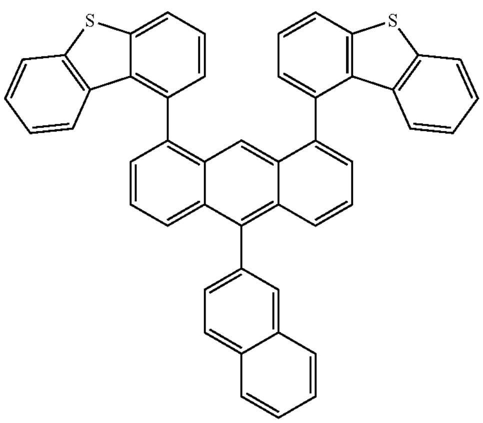
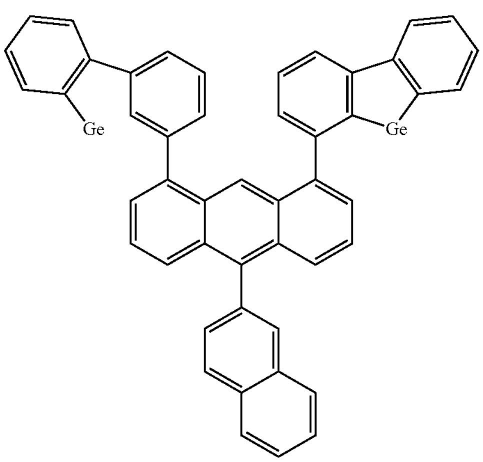
-continued
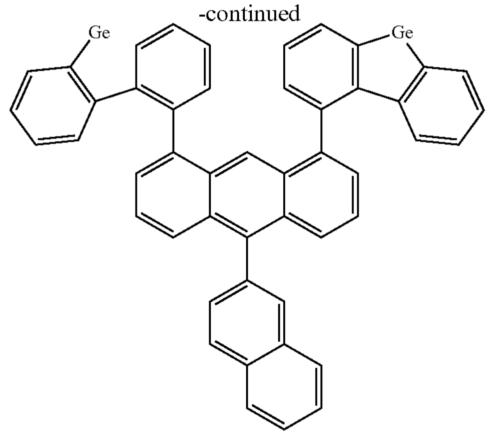
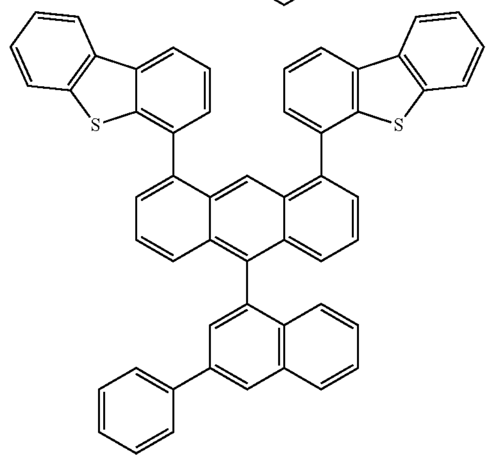
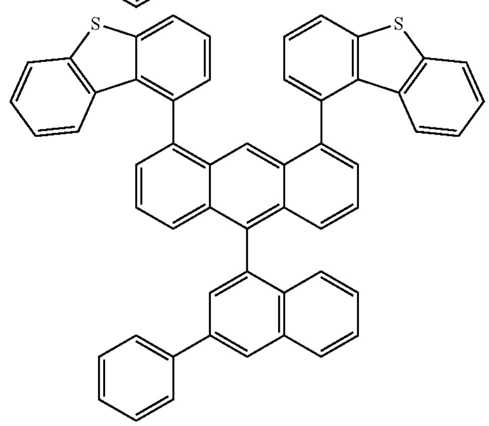
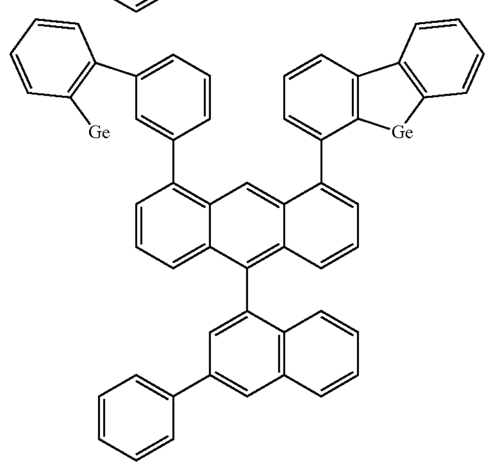

-continued
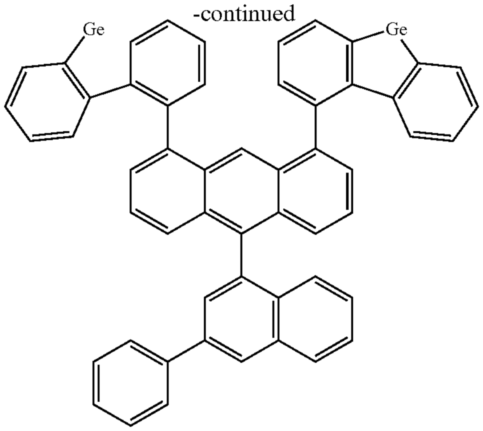
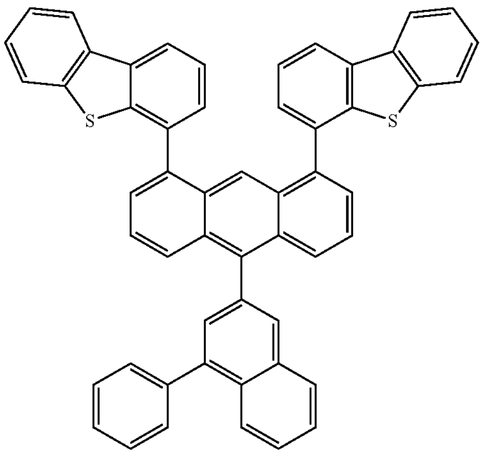
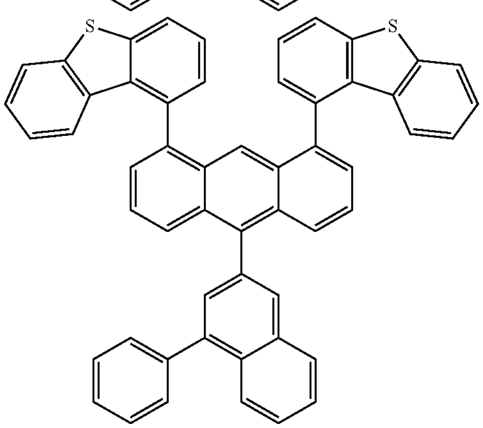
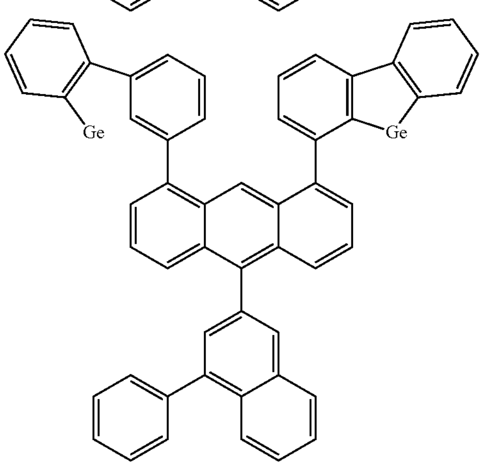
-continued
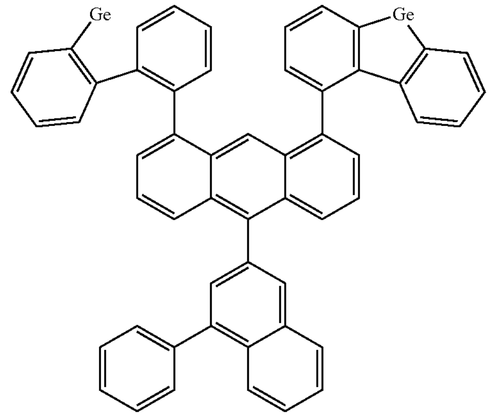
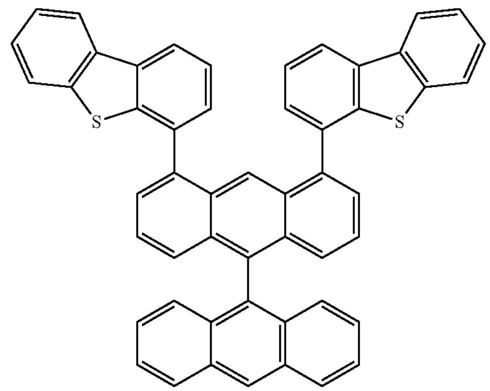
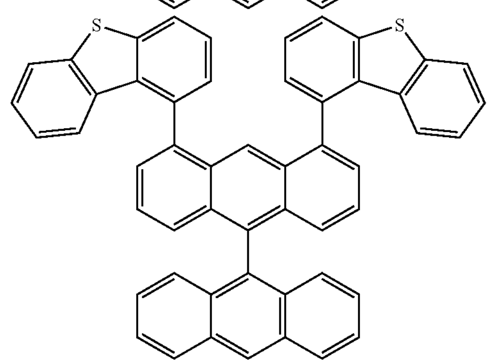
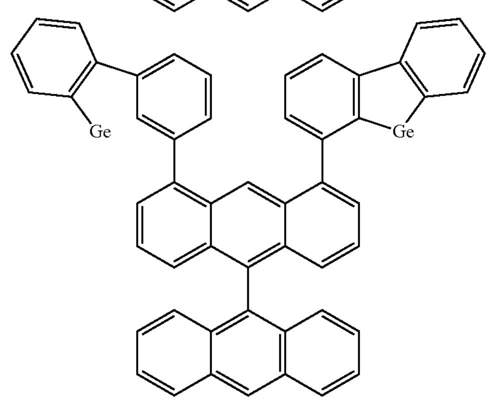

-continued
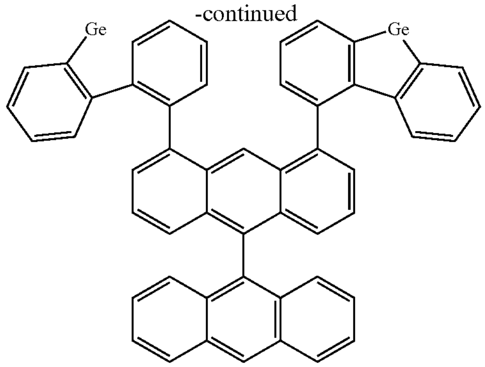
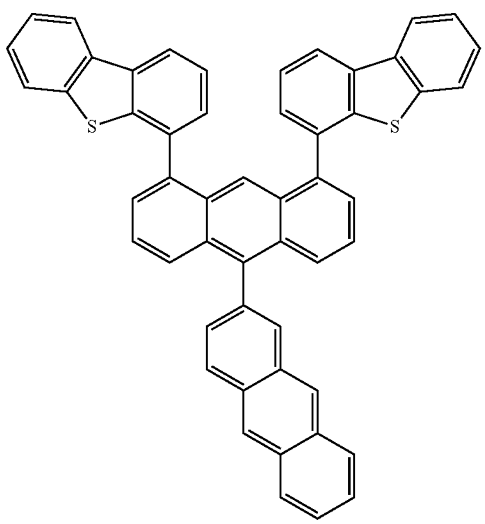
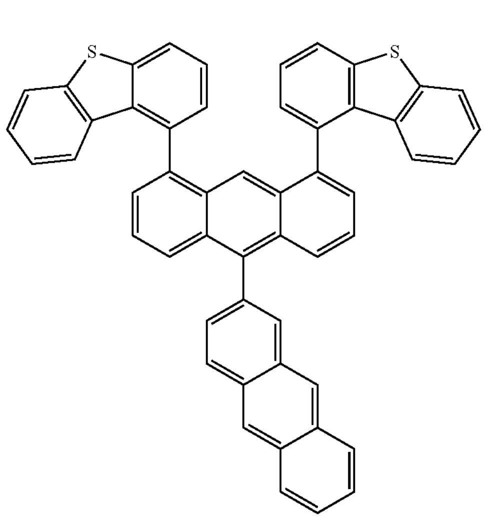
-continued
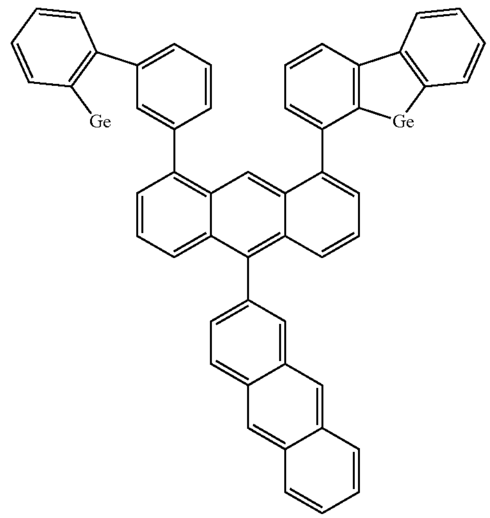
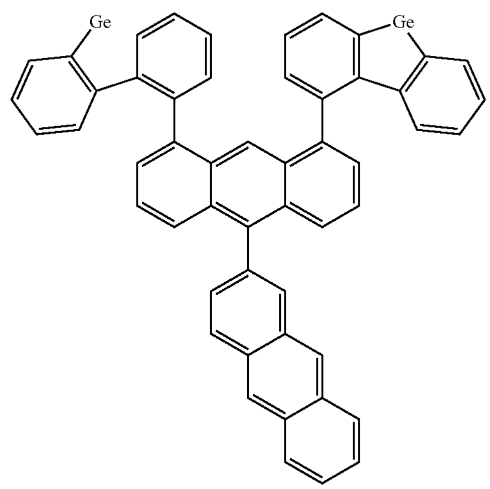
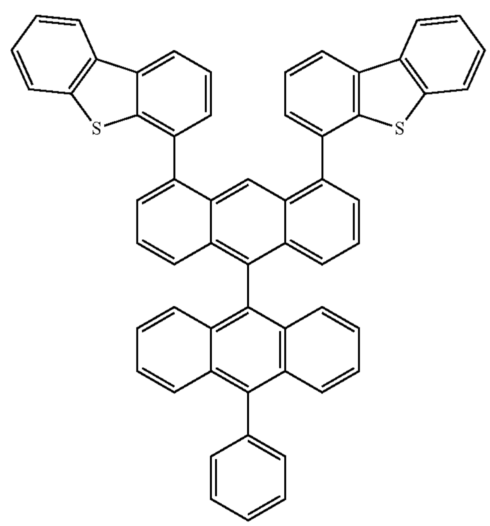

-continued
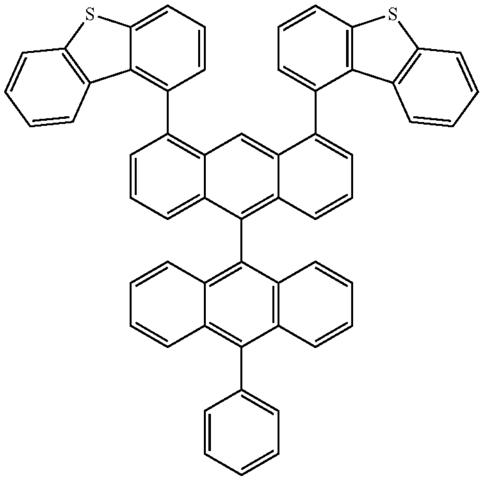
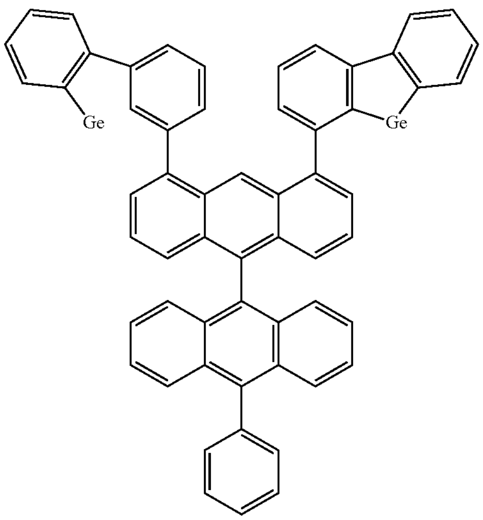
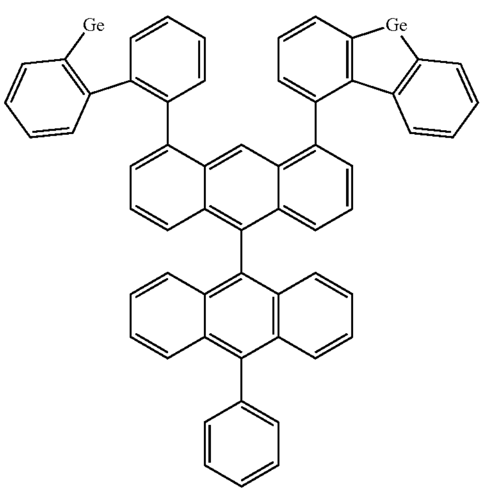
-continued
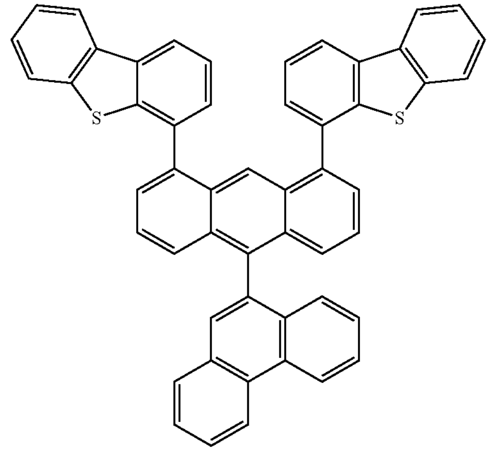
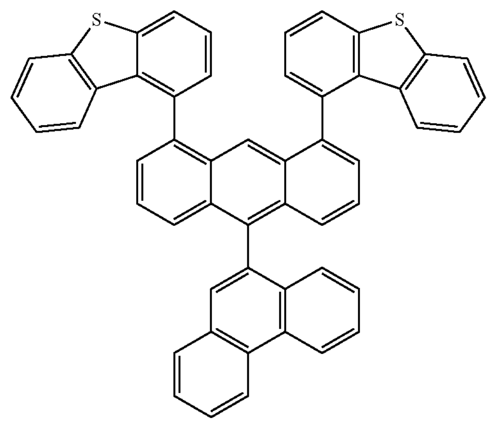
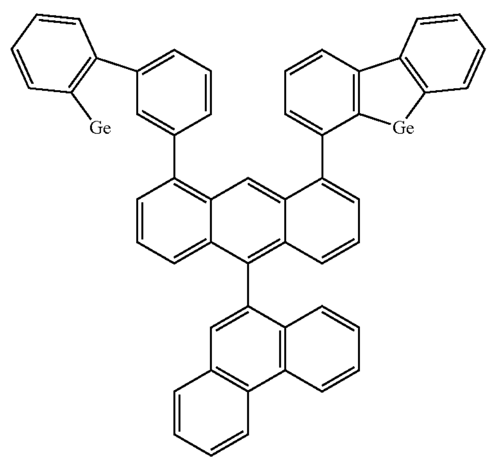

-continued
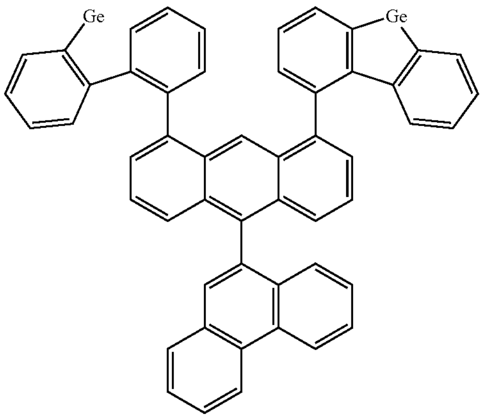
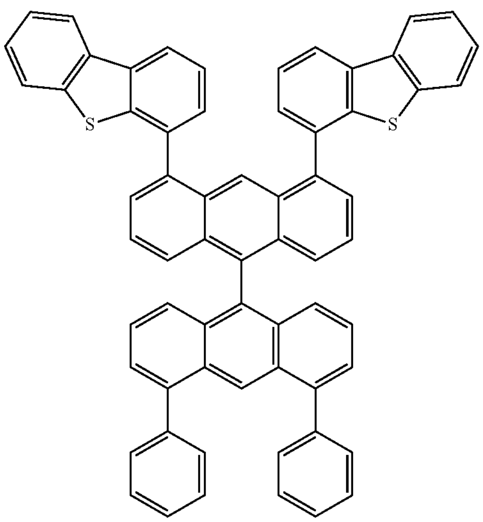
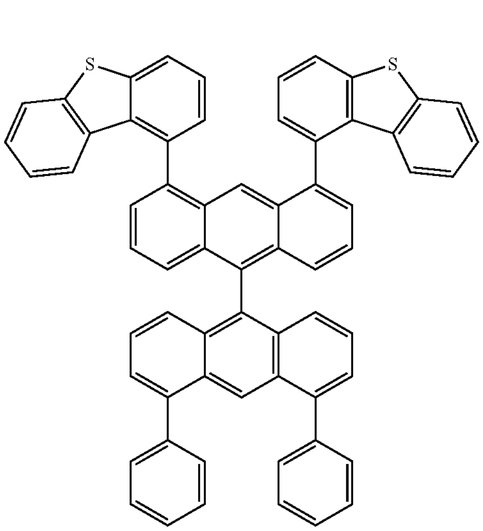
-continued
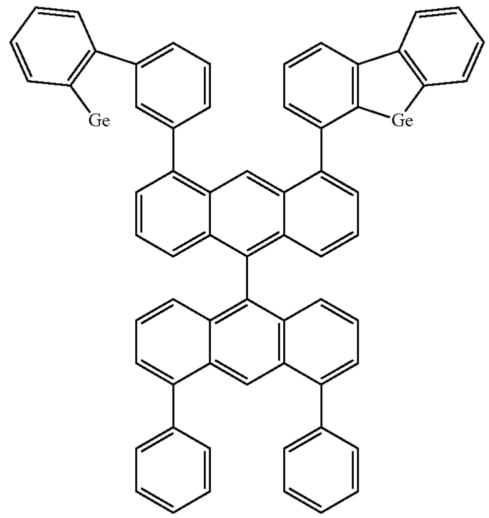
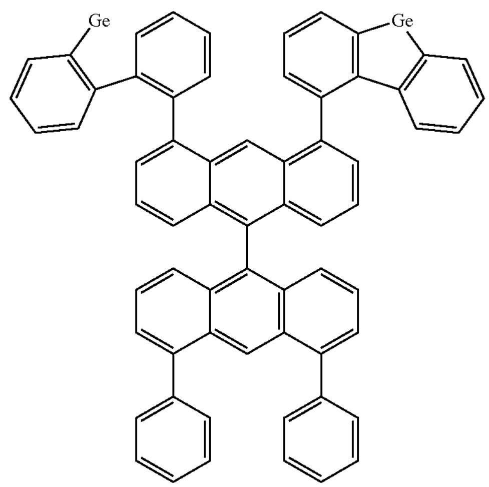
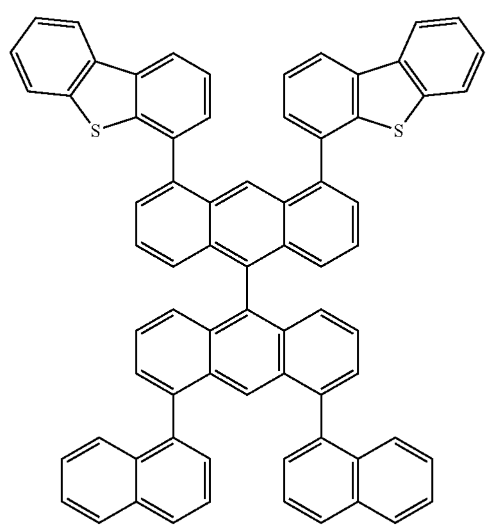

-continued
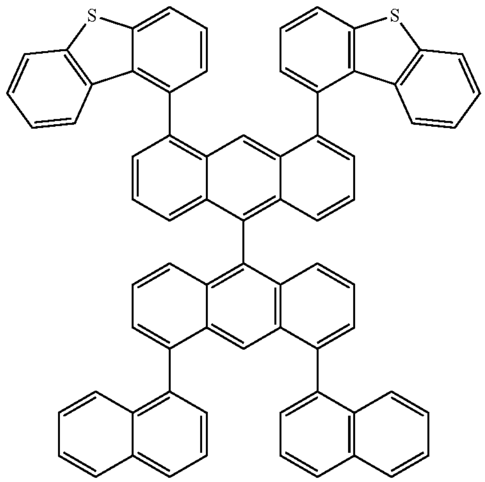
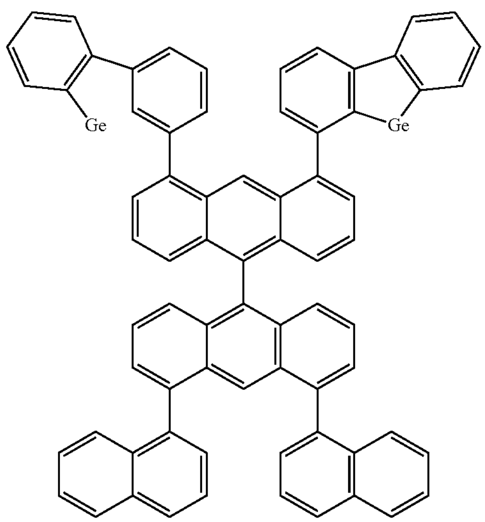
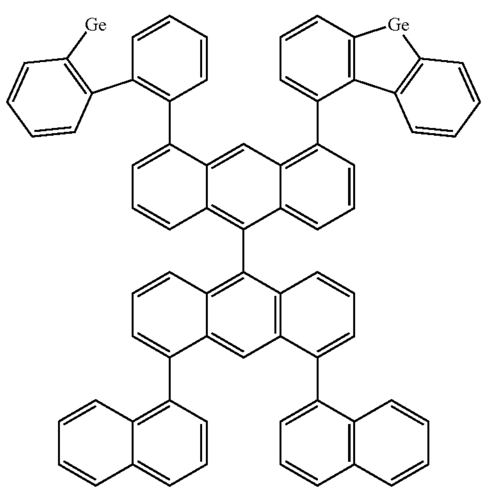
-continued
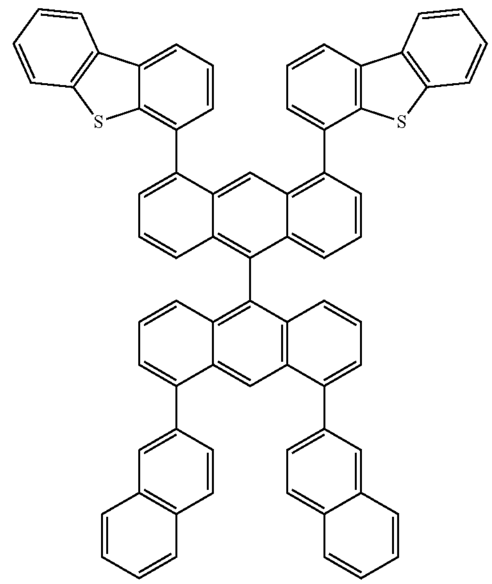
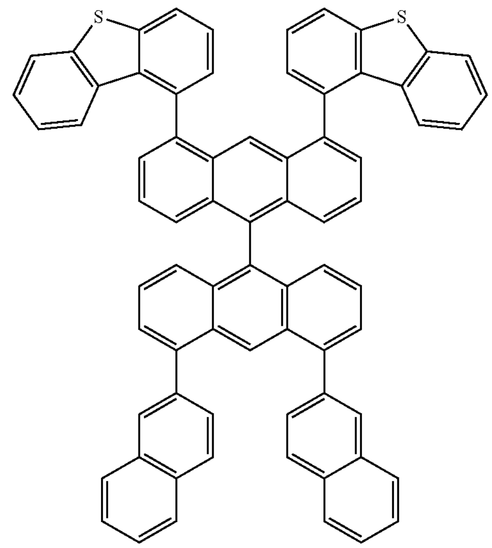
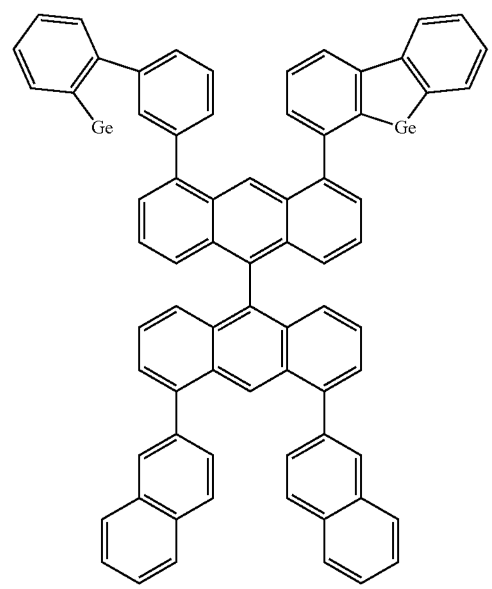

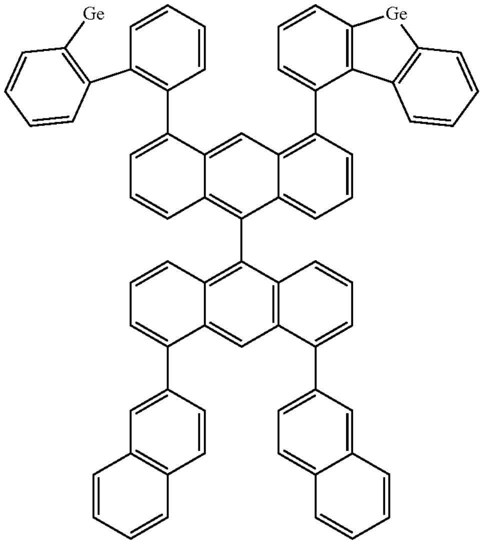
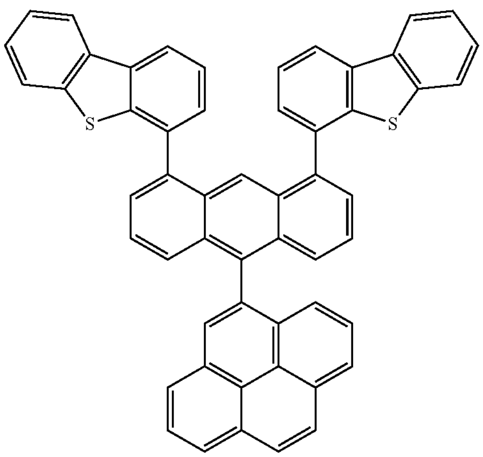
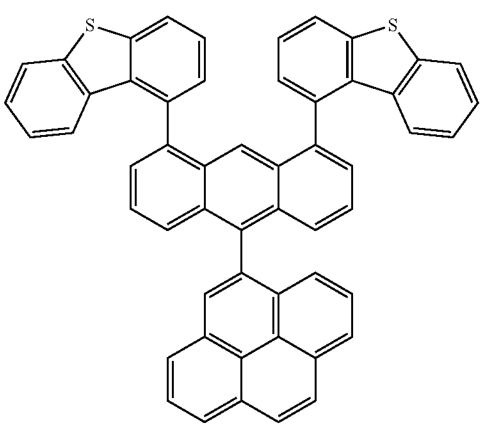
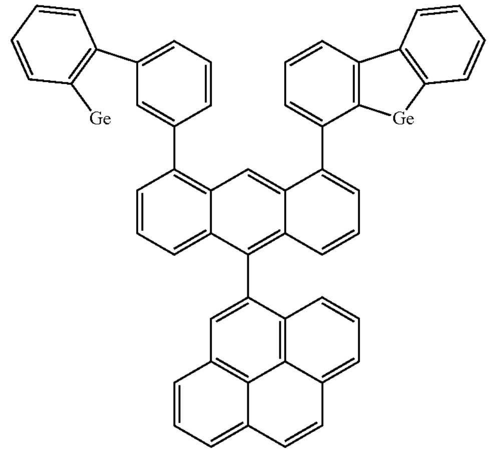
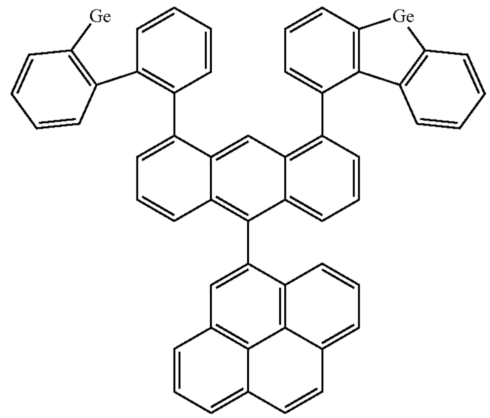
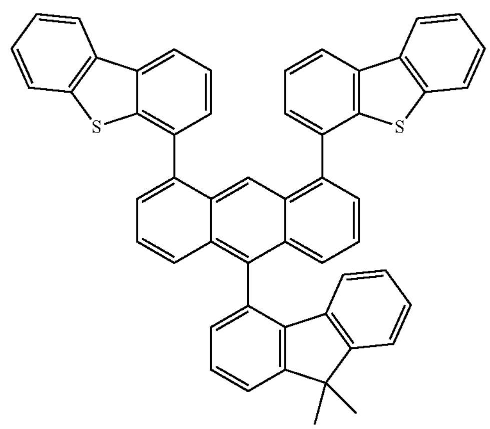
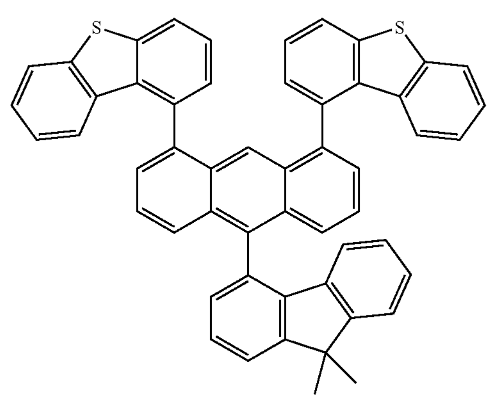

-continued
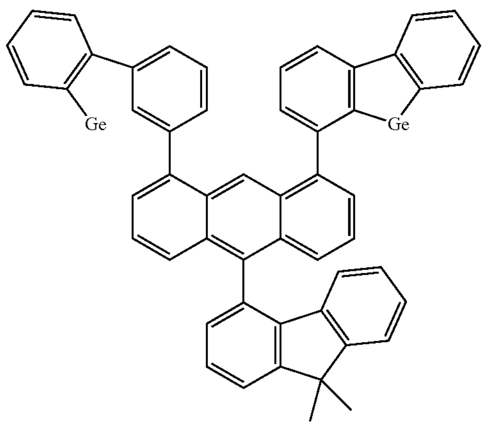
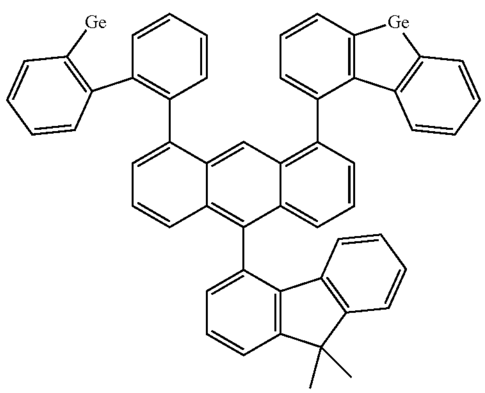
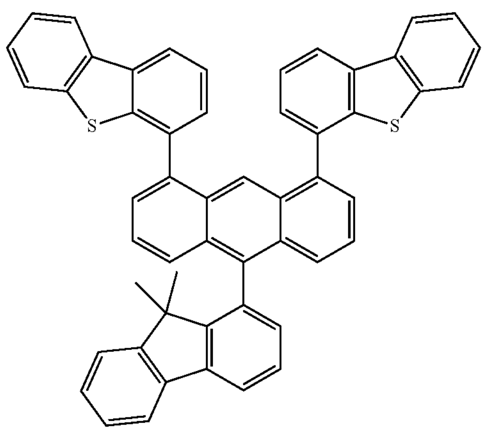
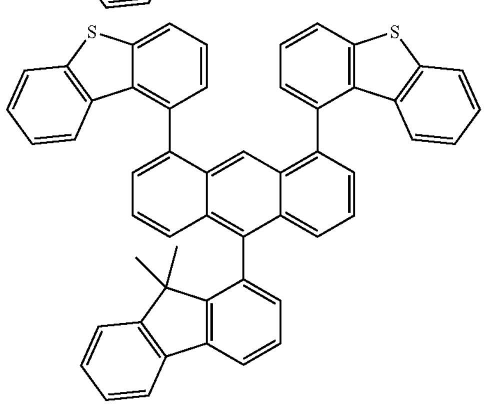
-continued
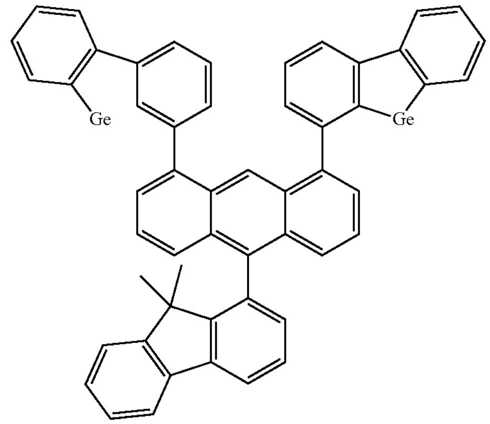
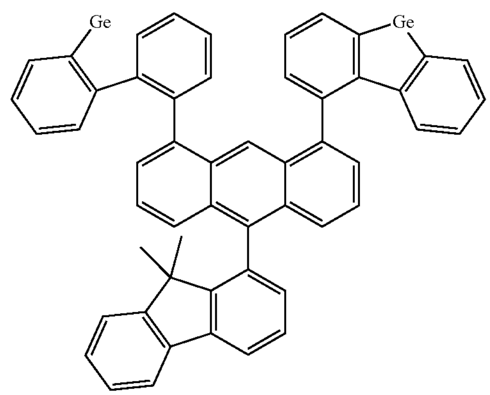
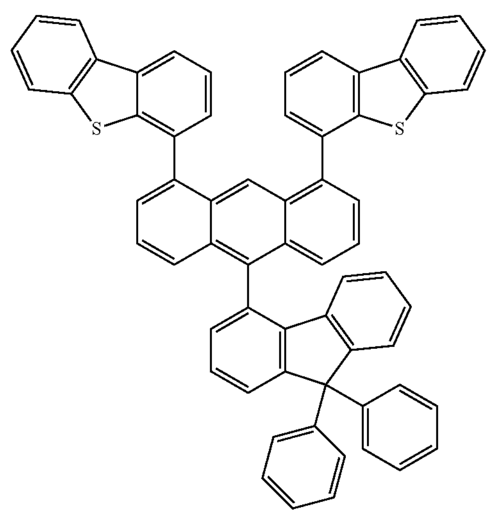

-continued
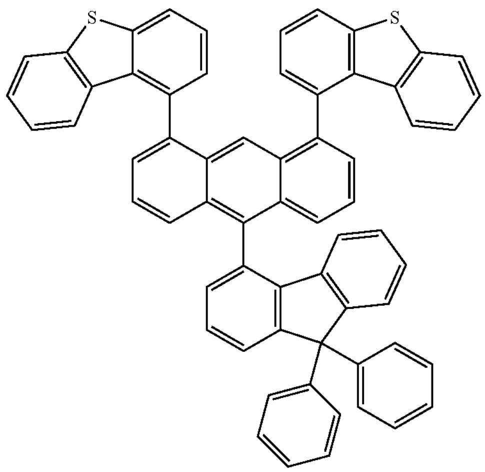
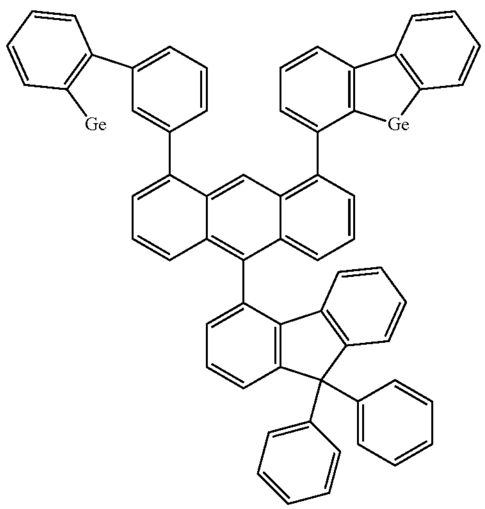
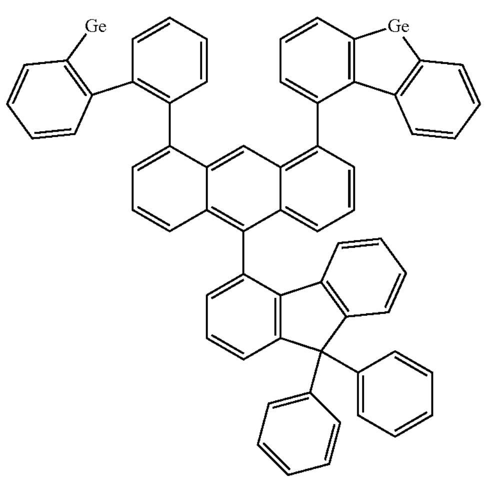
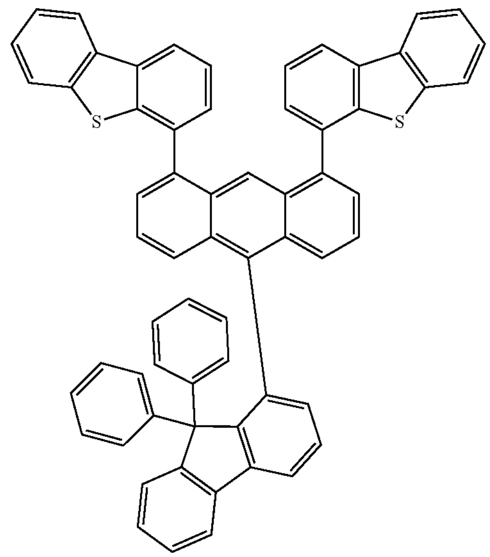
-continued
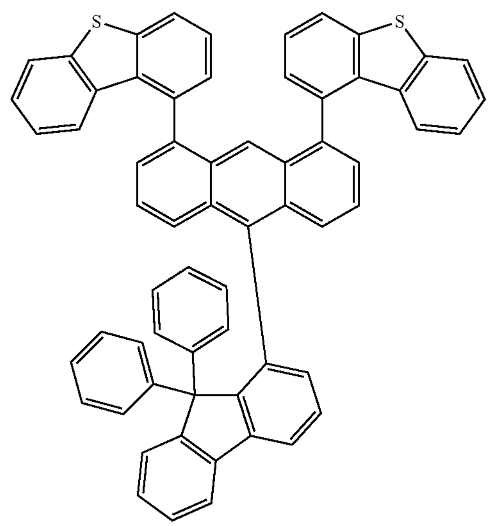
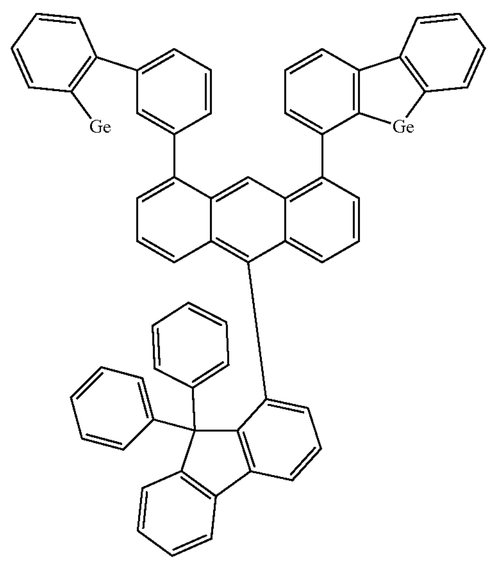

-continued
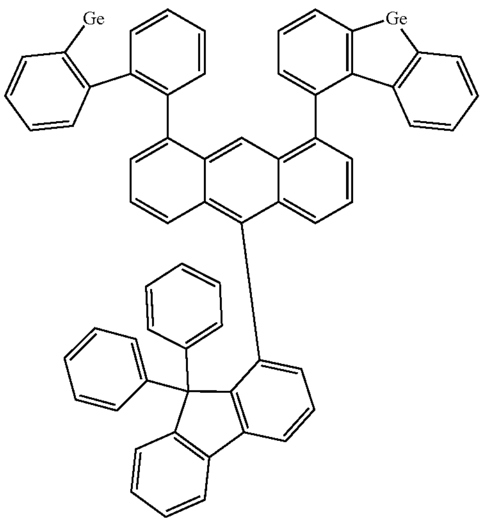
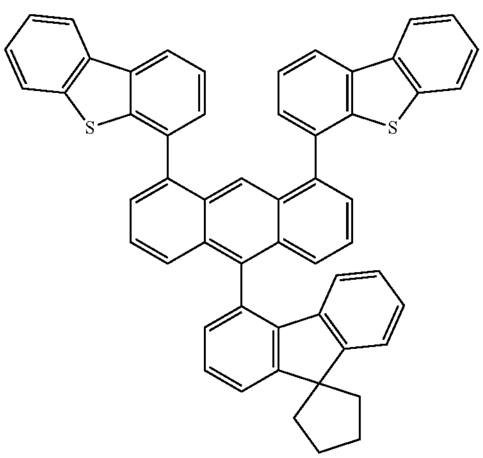
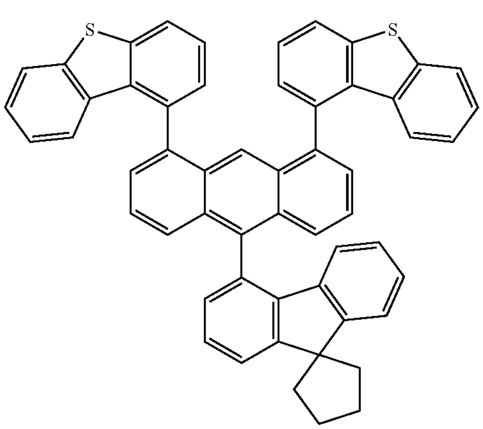
-continued
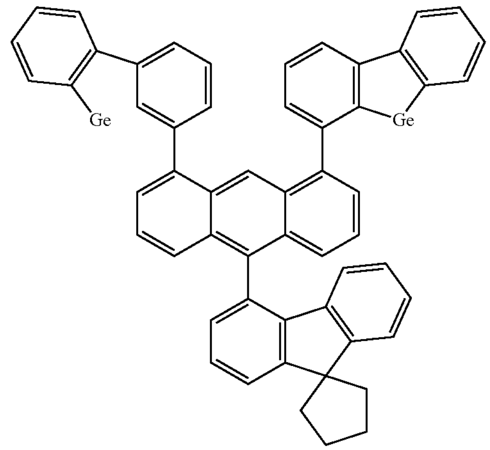
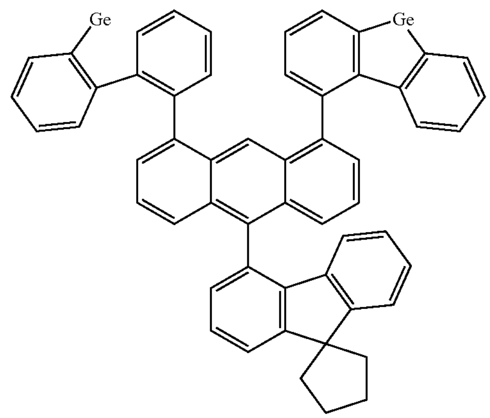
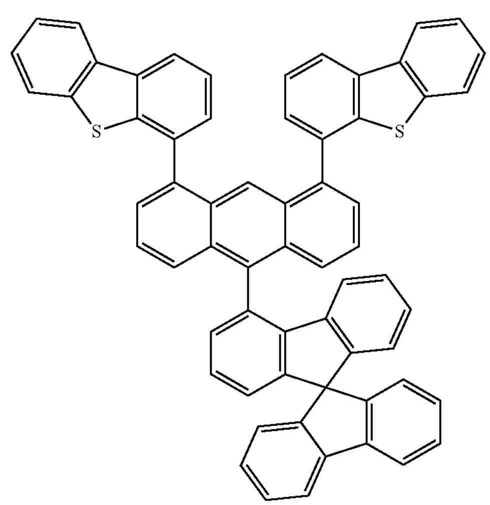

-continued
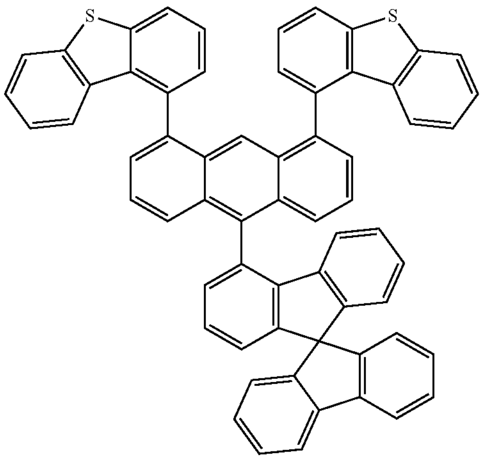
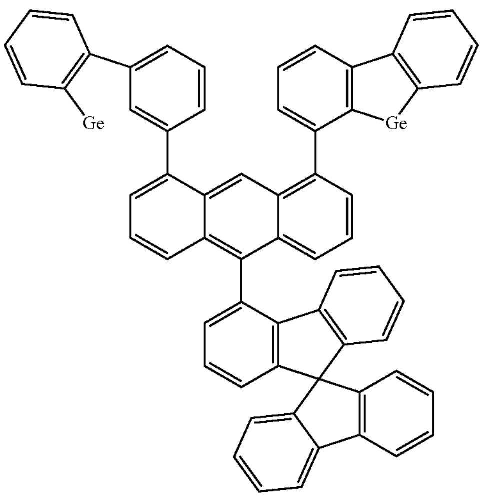
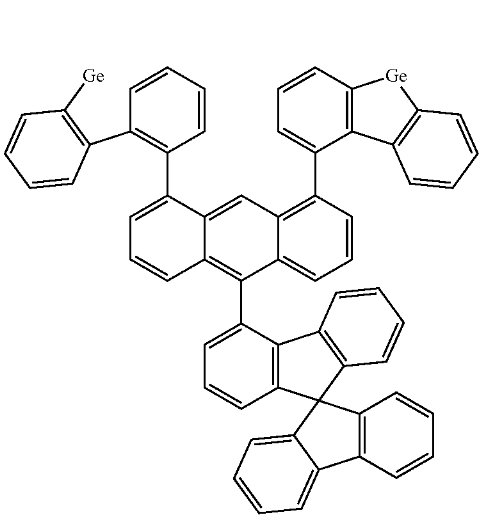
-continued
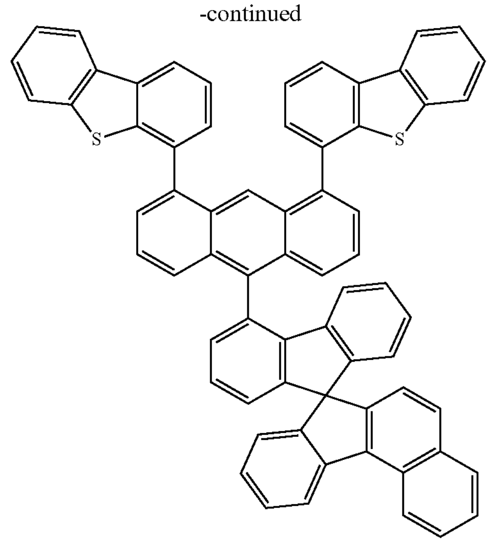
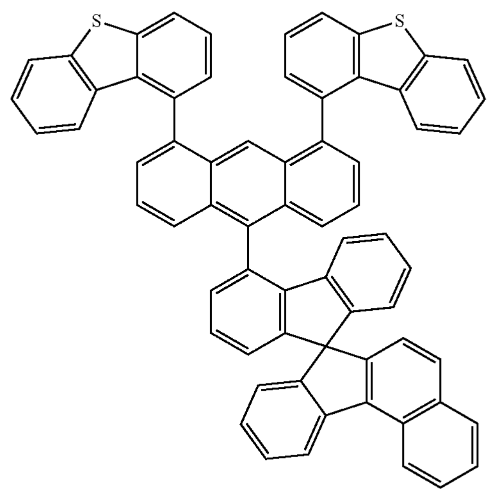
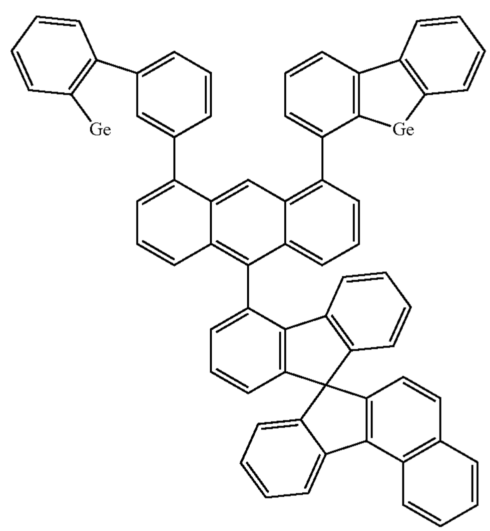

-continued
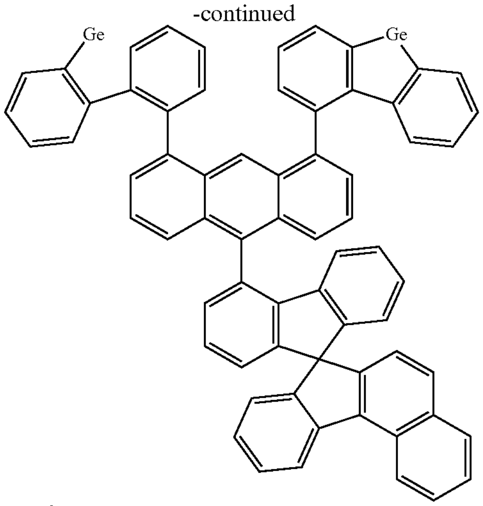
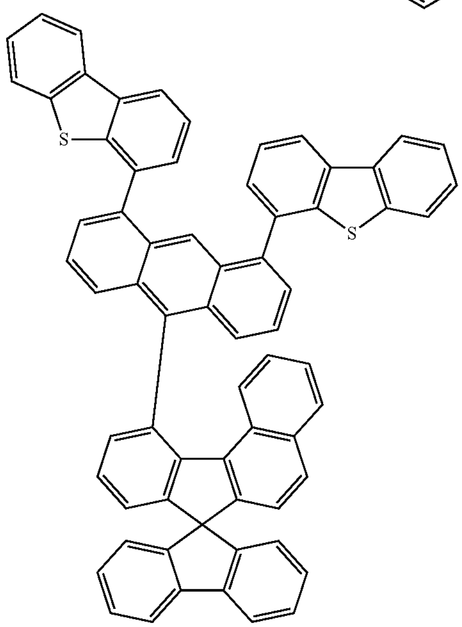
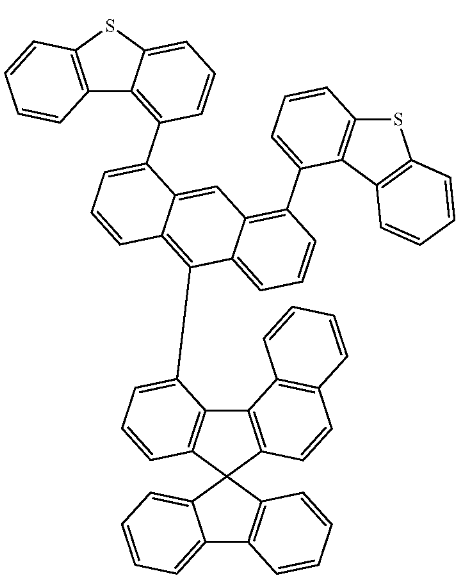
-continued
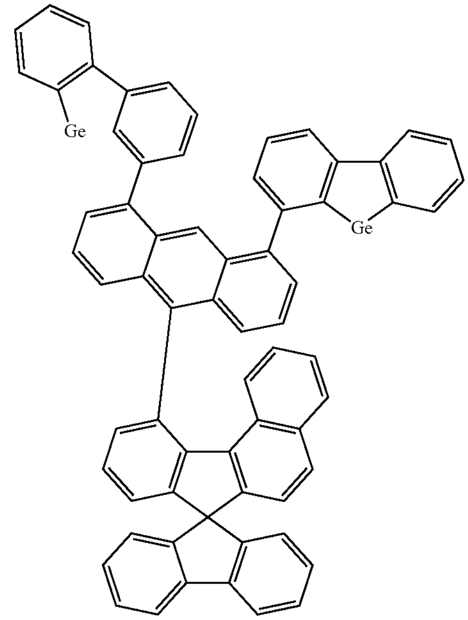
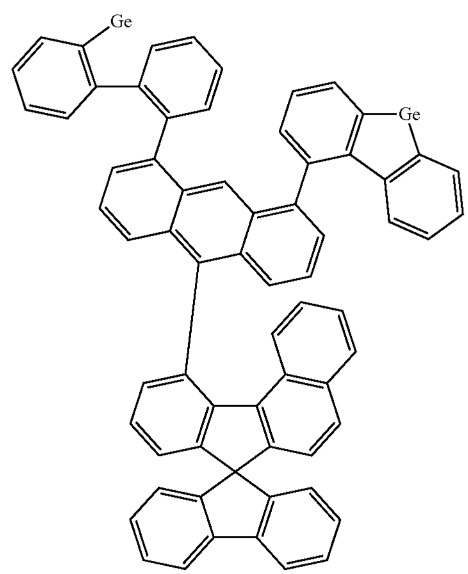
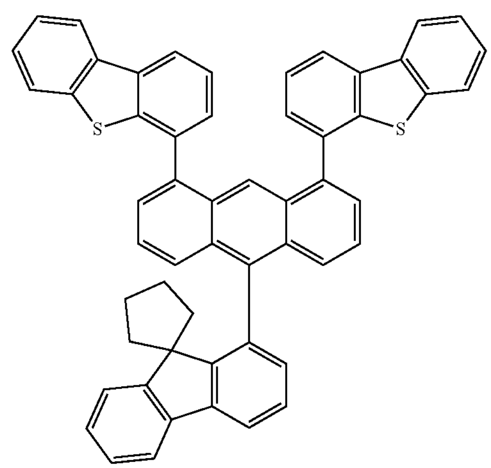

-continued
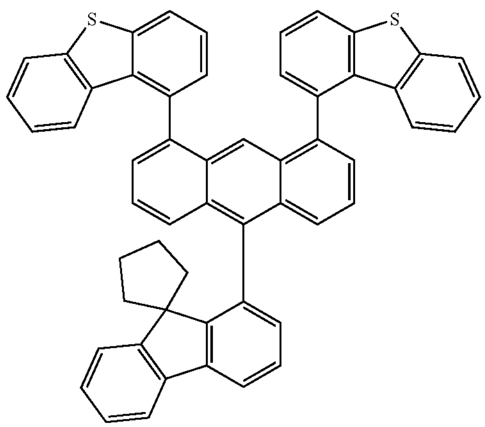
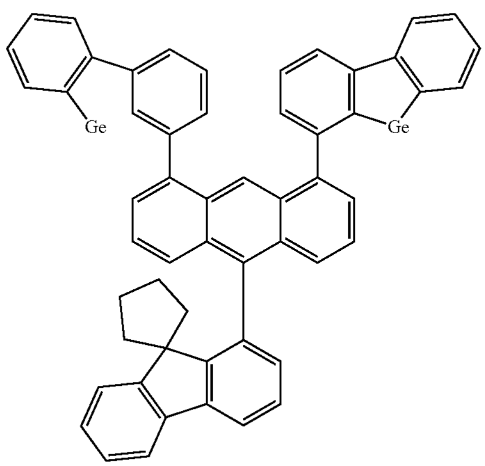
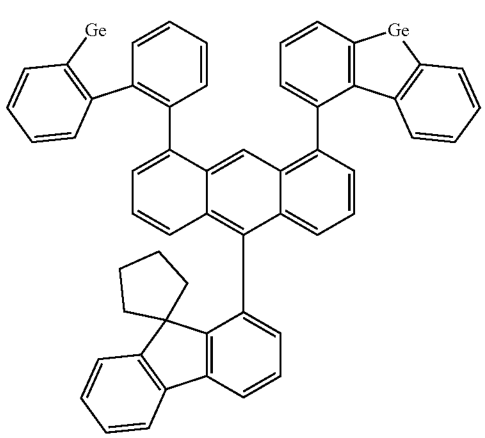
-continued
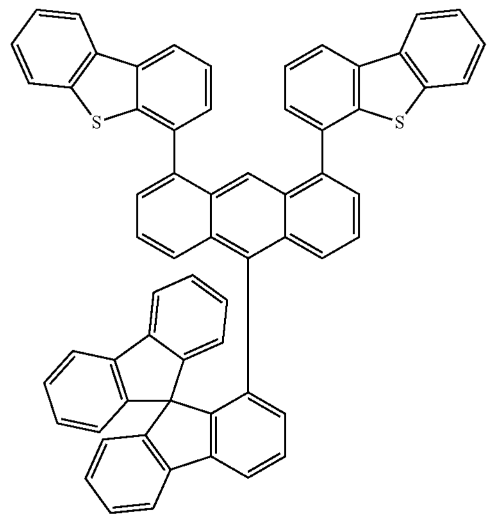
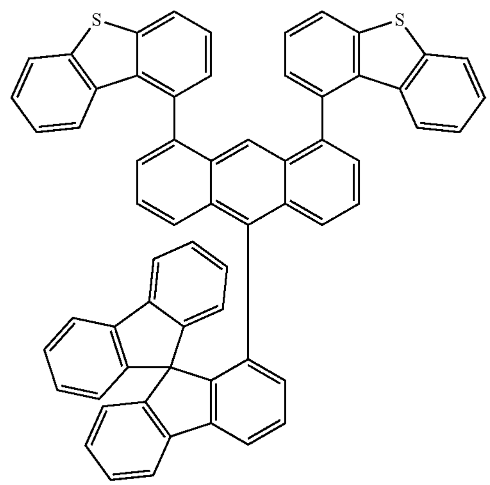
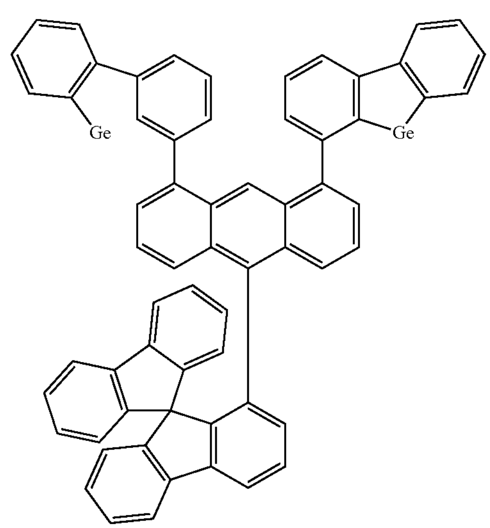

-continued
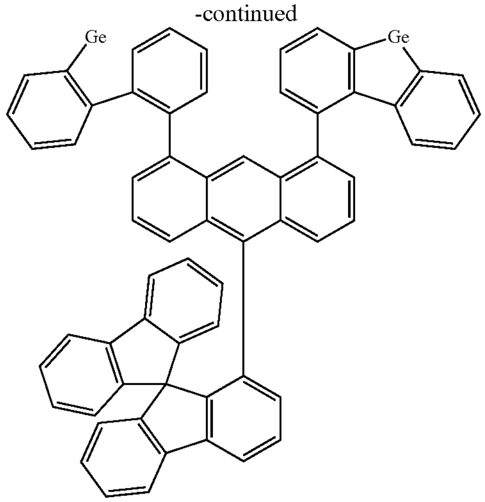
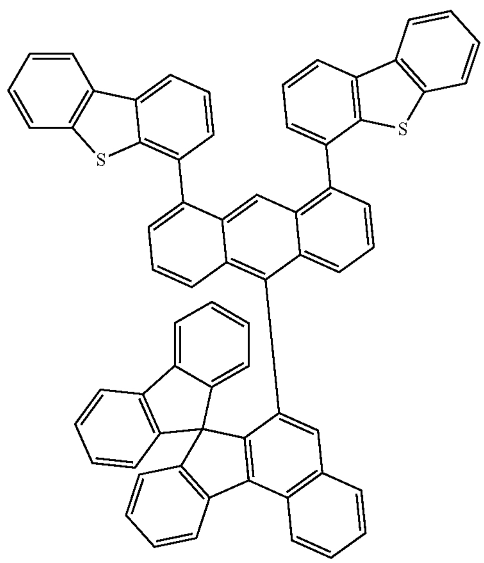
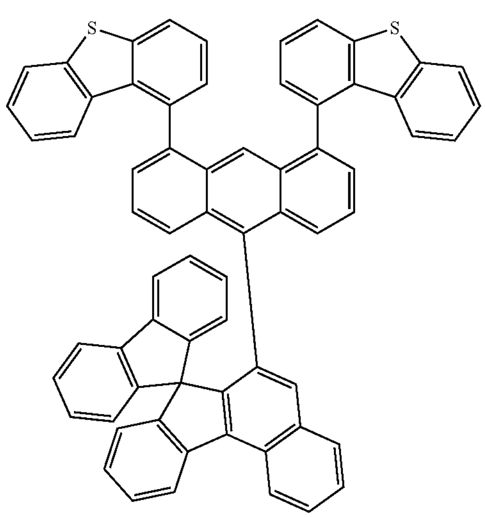
-continued
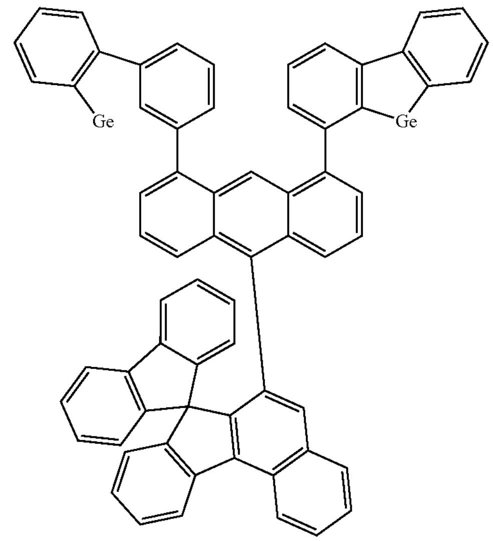
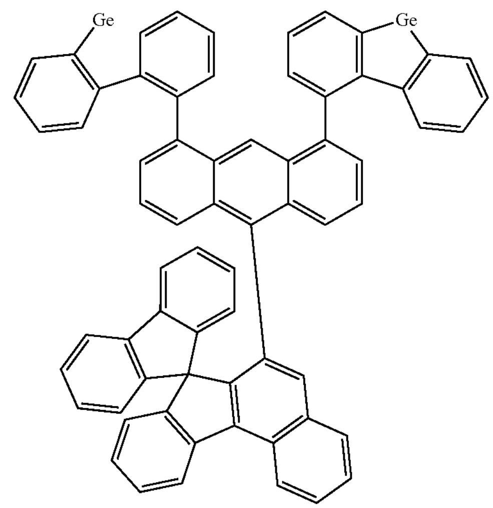
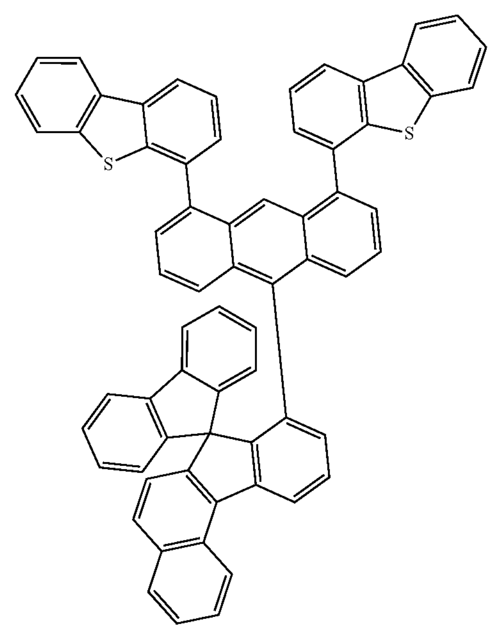

-continued
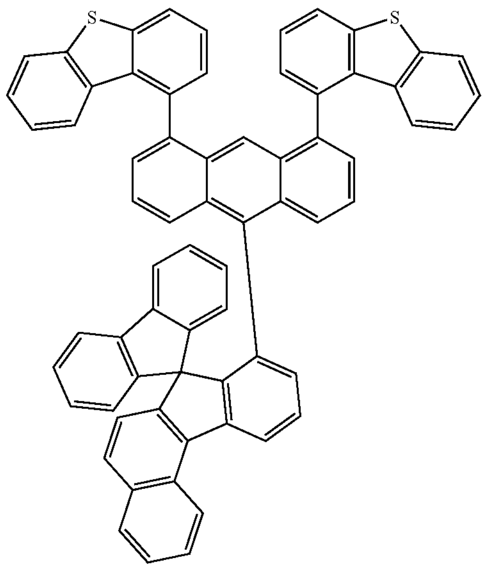
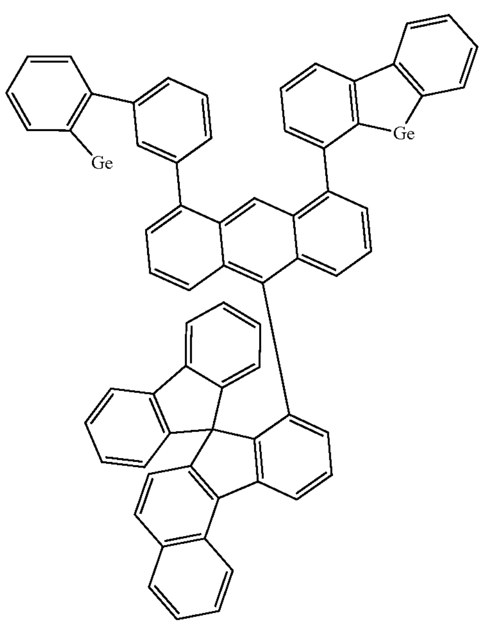
-continued
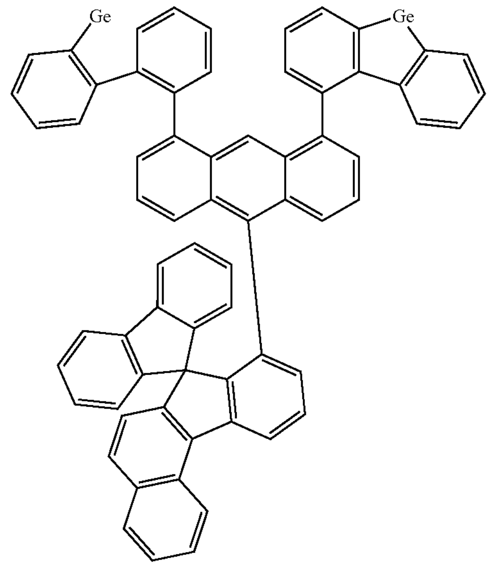
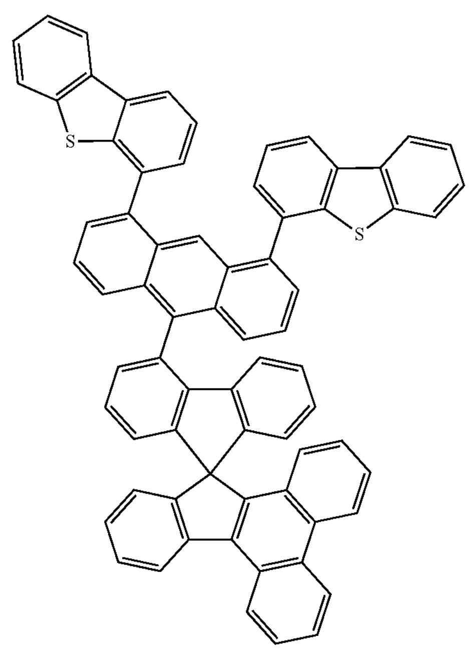

-continued
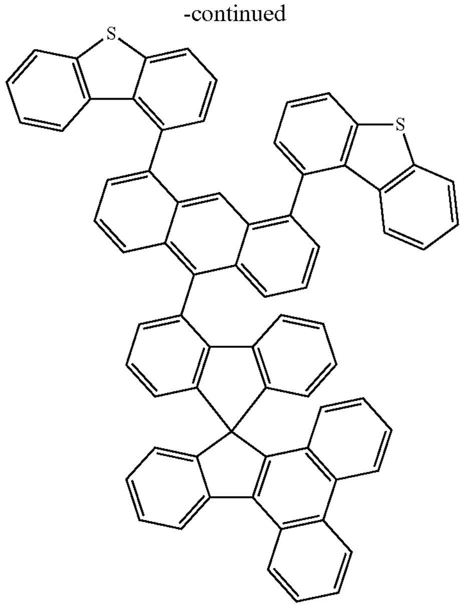
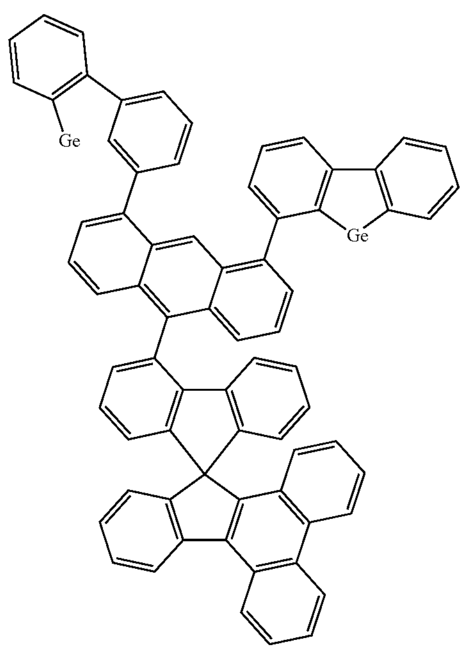
-continued
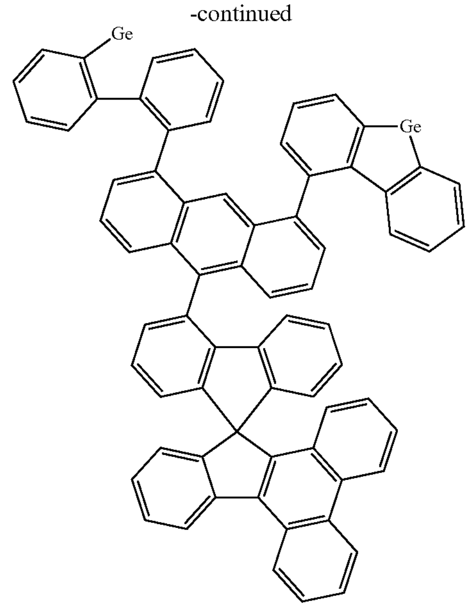
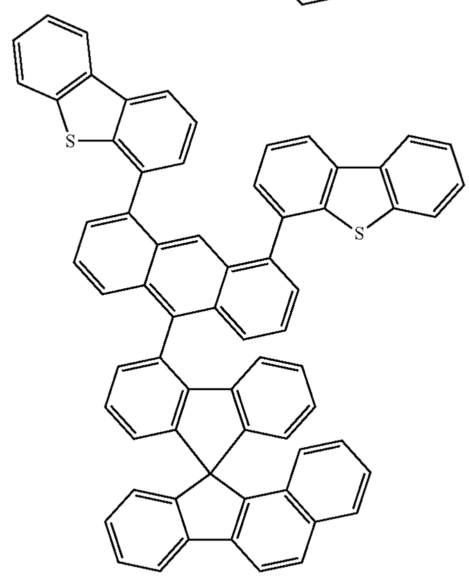
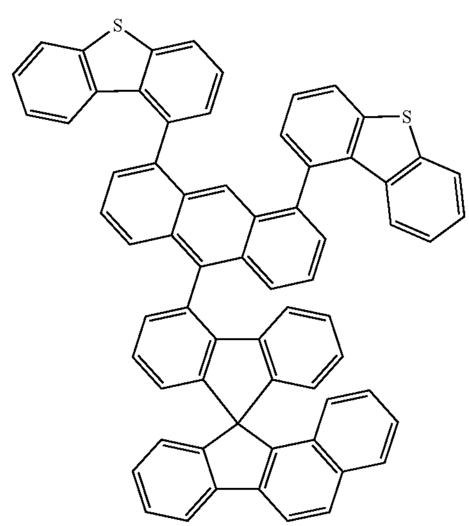

-continued
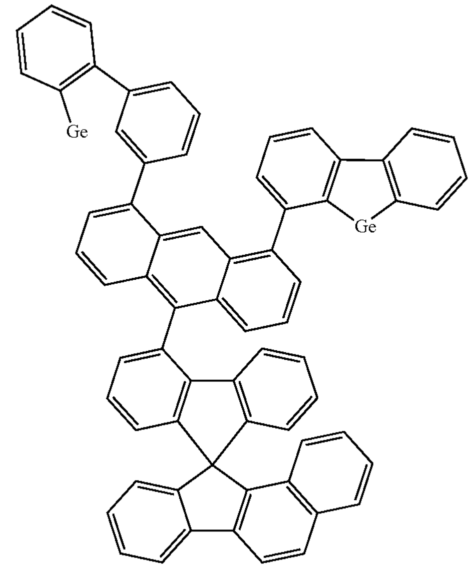
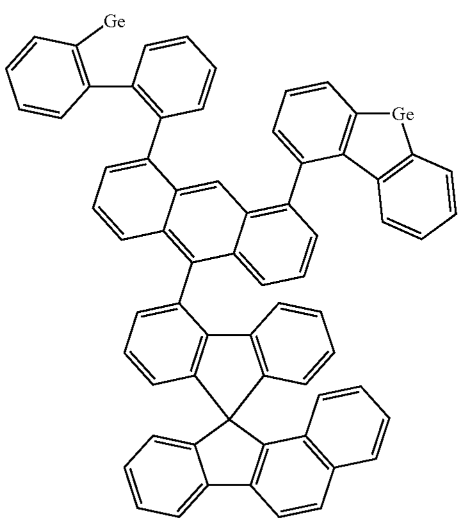
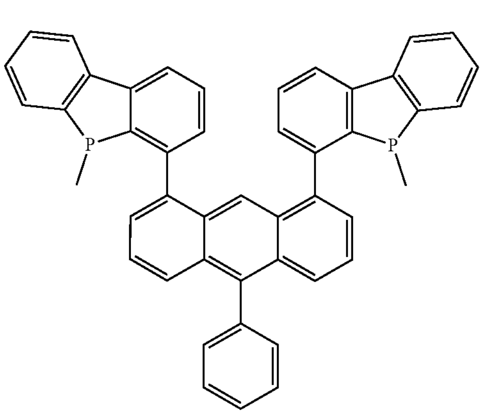
-continued
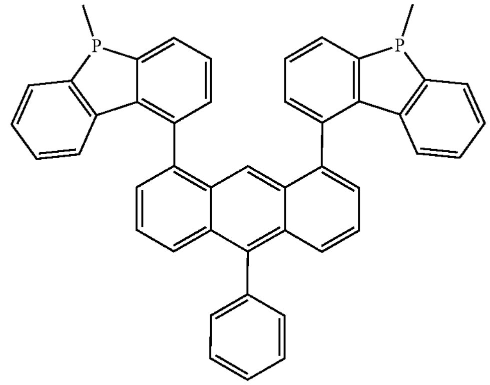
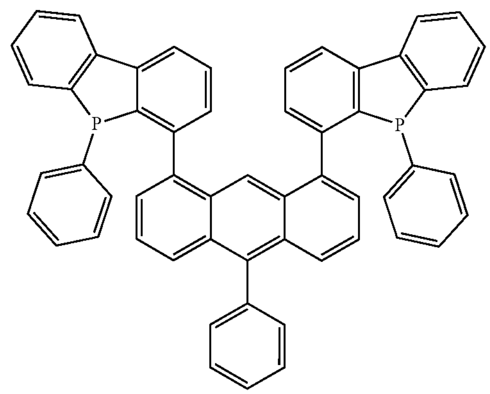
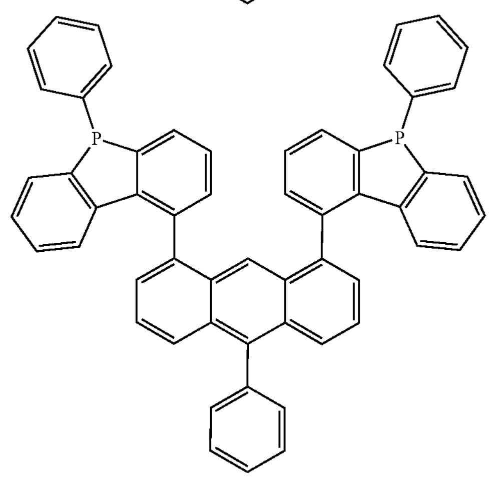
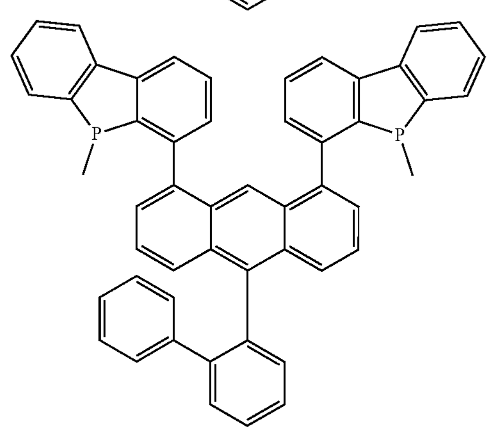

-continued
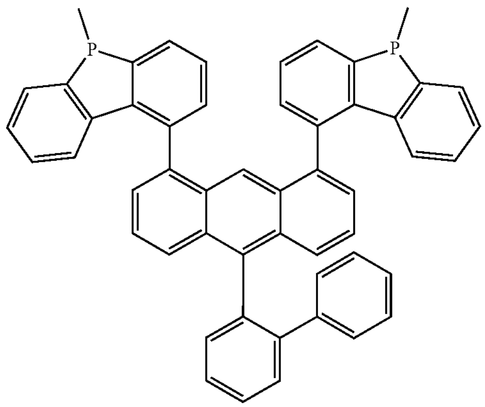
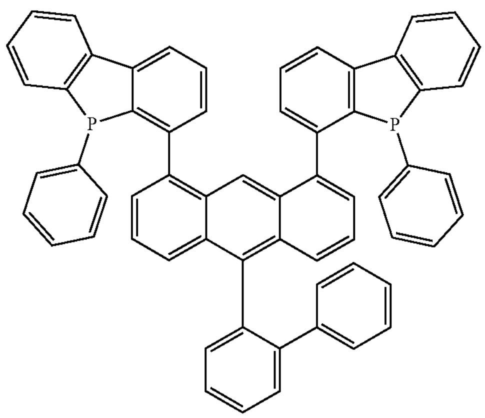
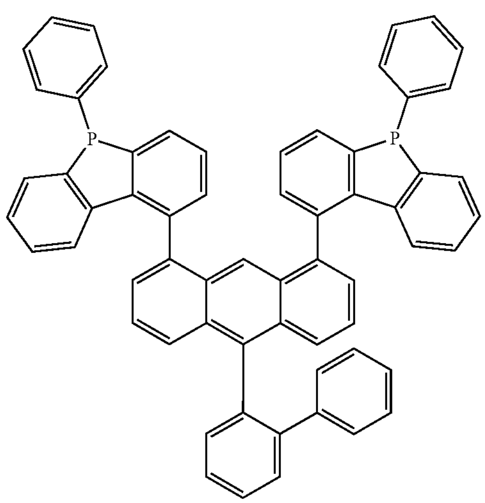
-continued
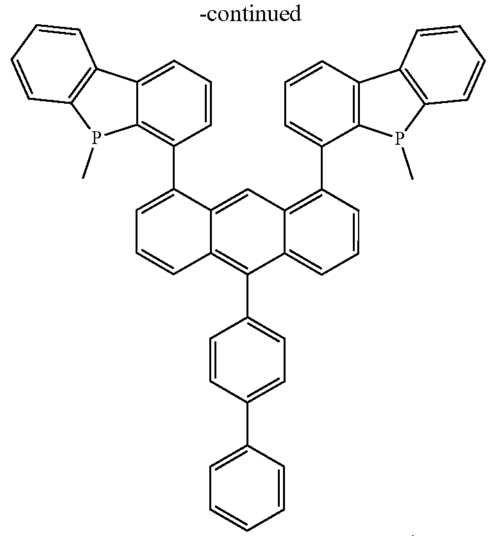
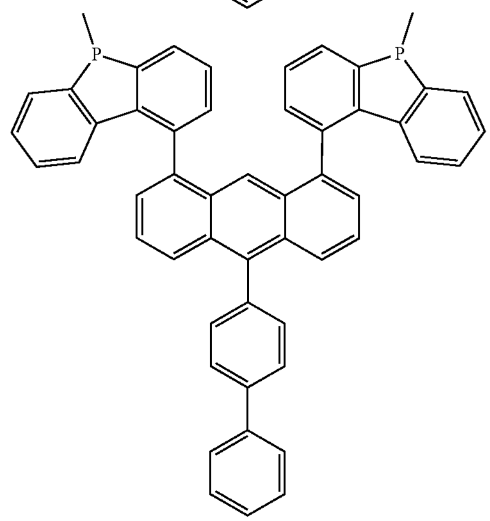
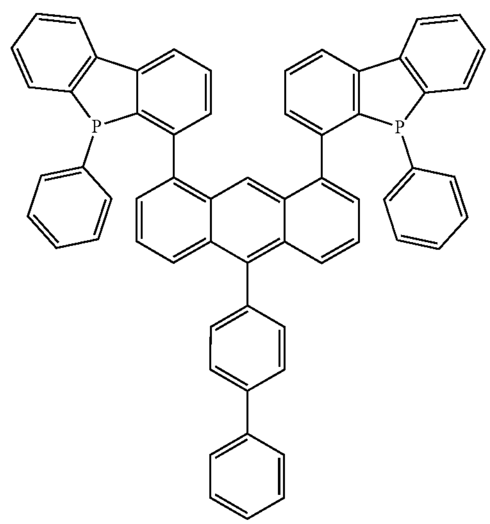

-continued
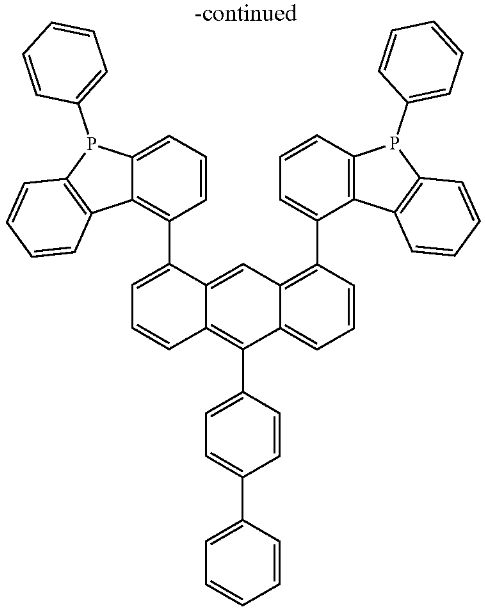
-continued
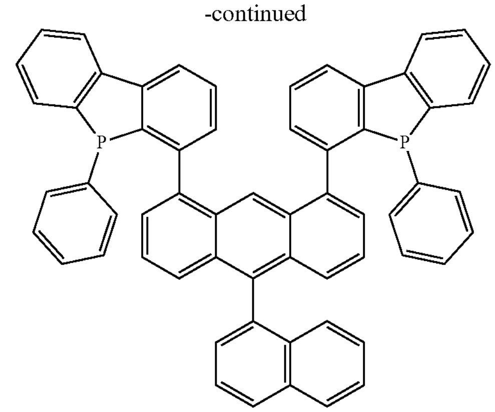
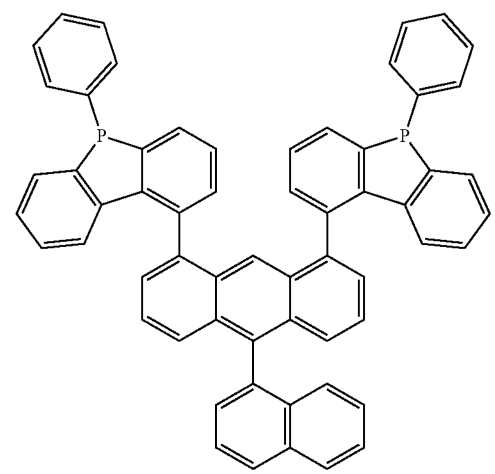
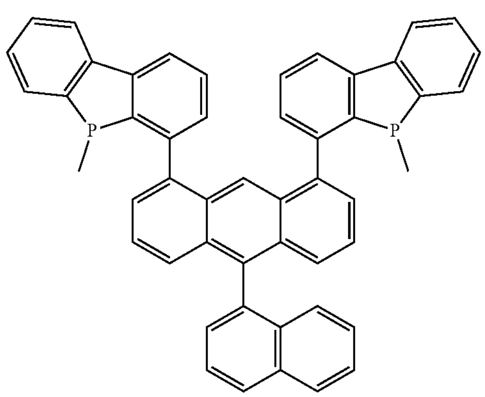
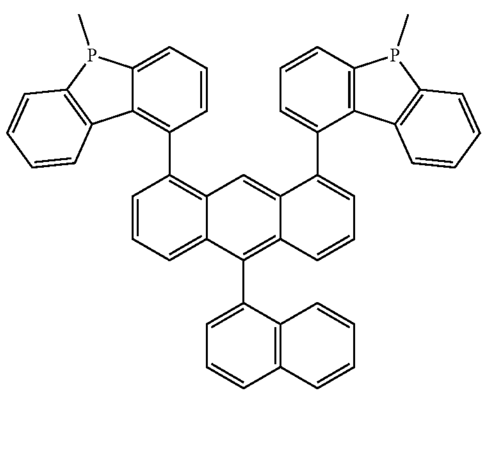
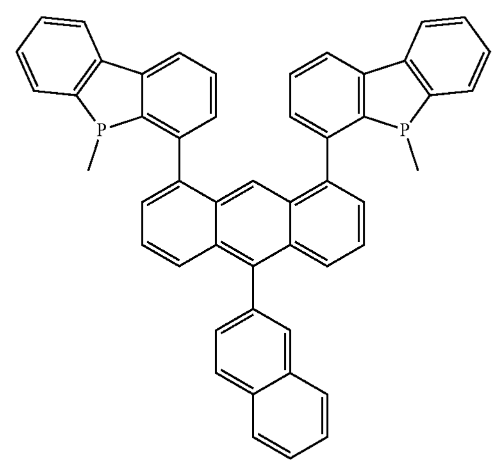

-continued
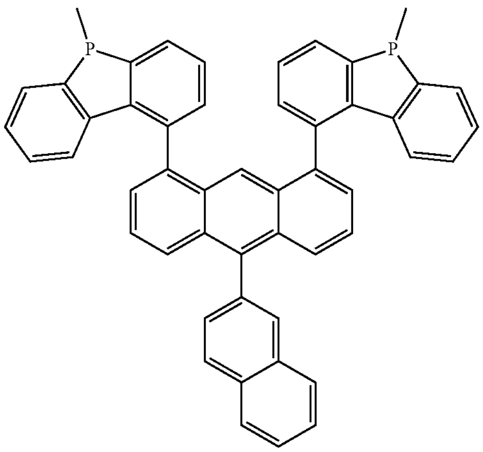
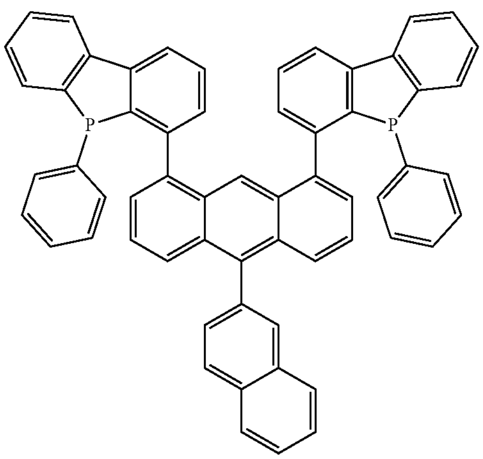
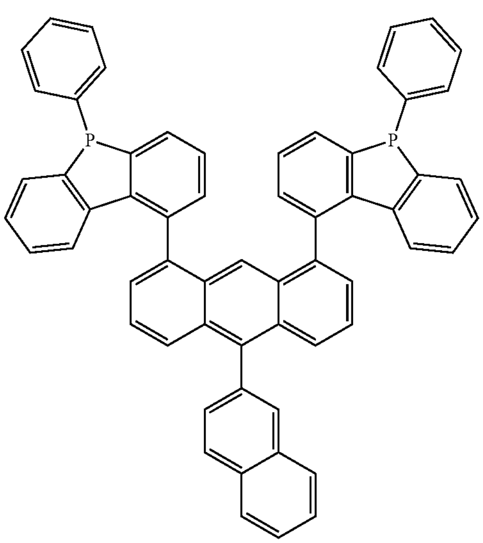
-continued
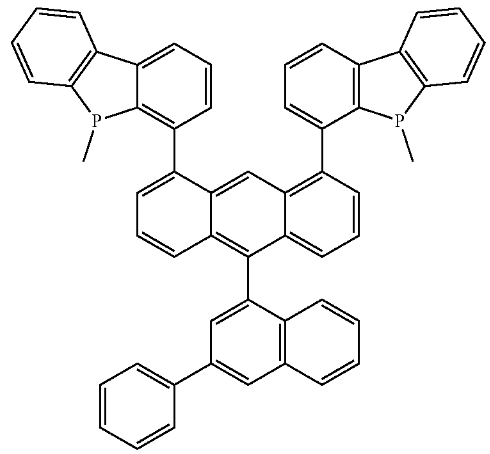
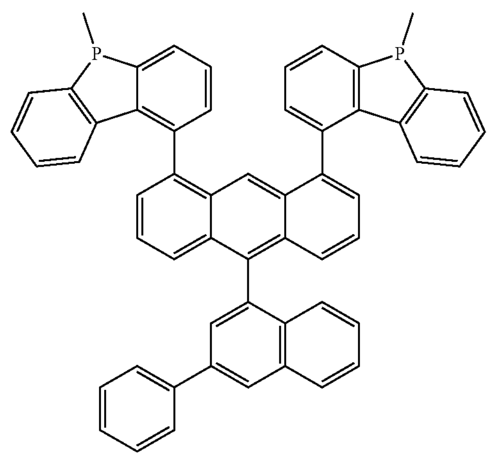
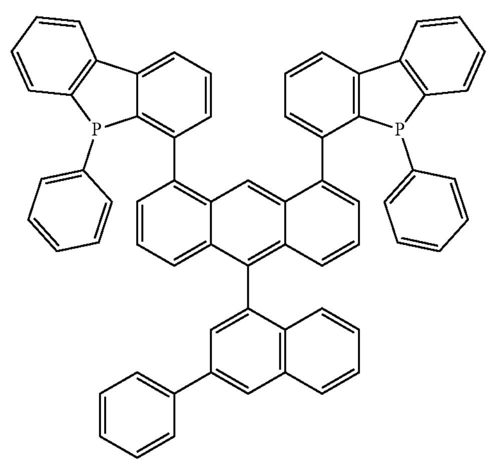

-continued
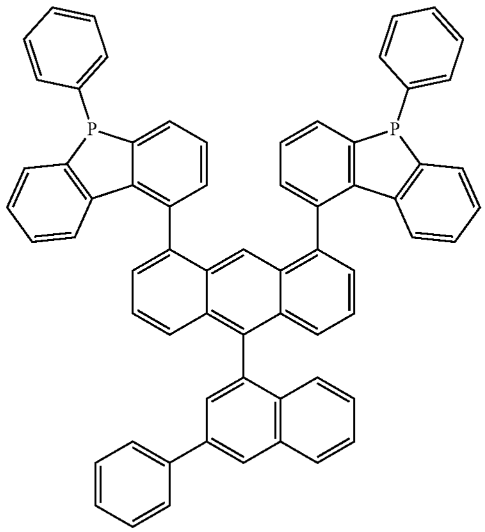
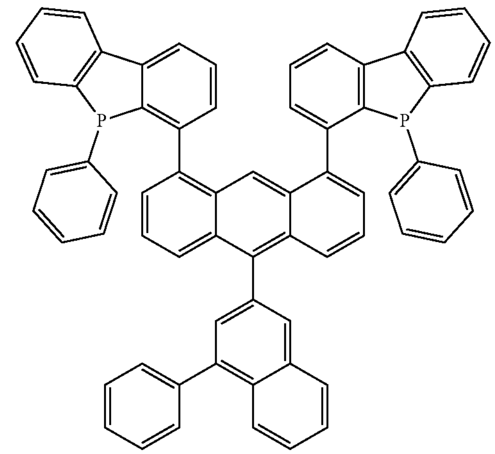
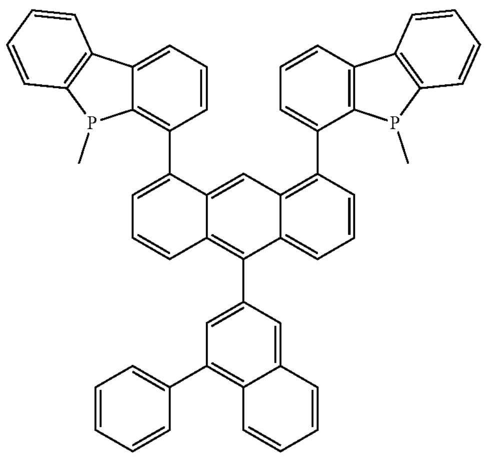
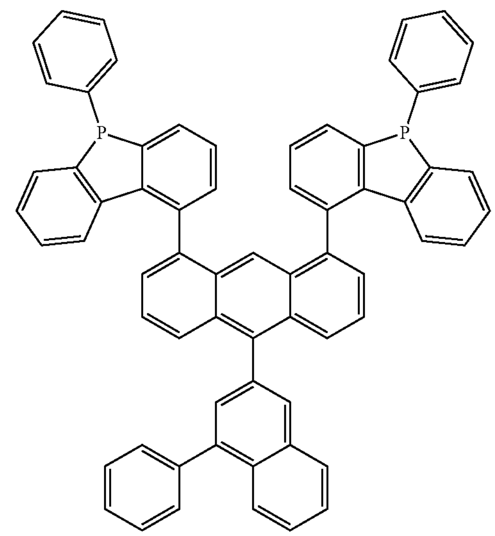
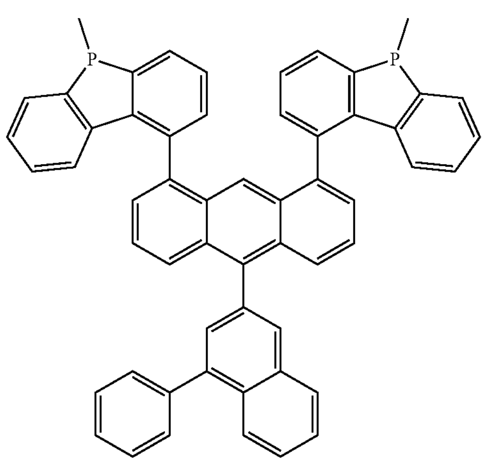
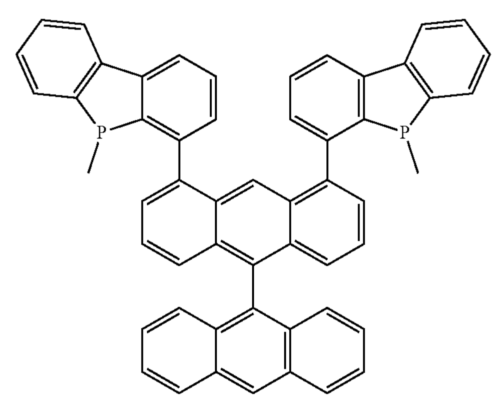
-continued -continued
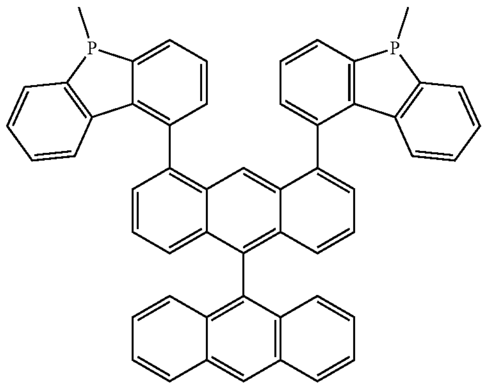
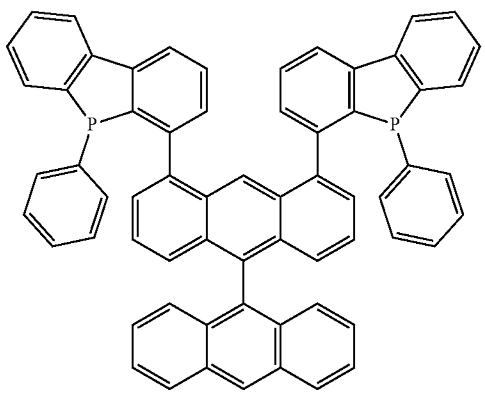
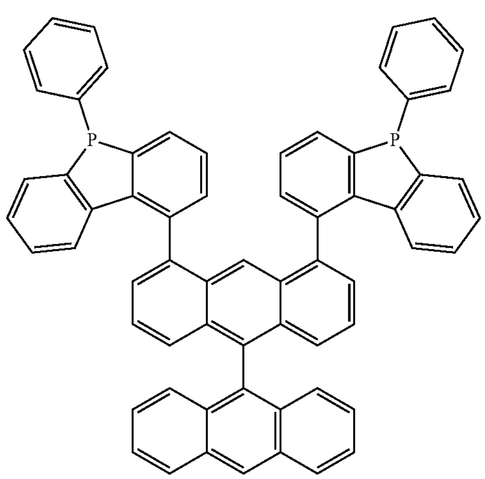
-continued
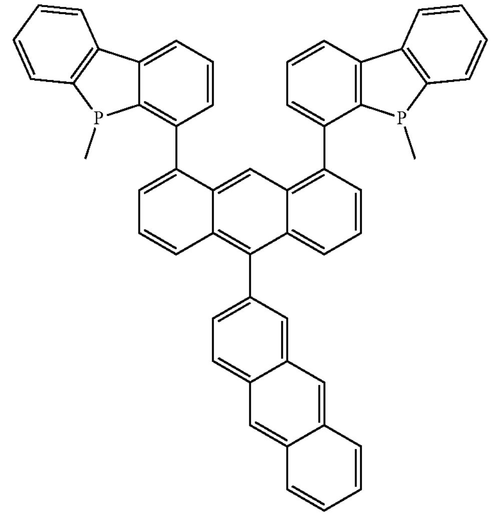
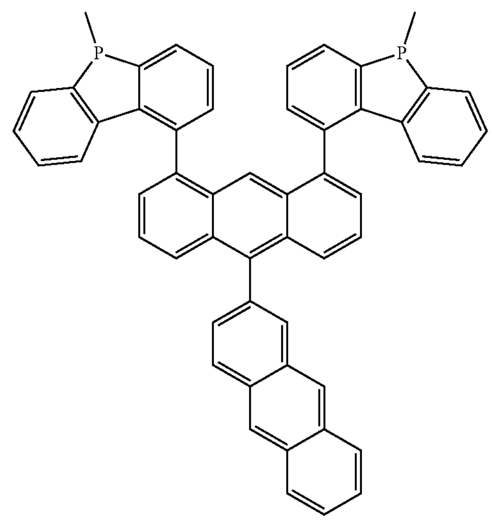
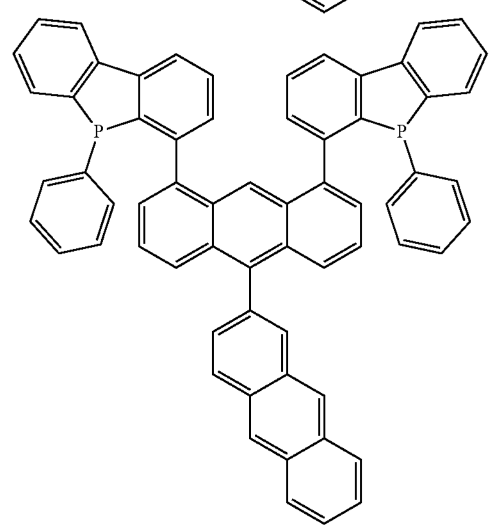

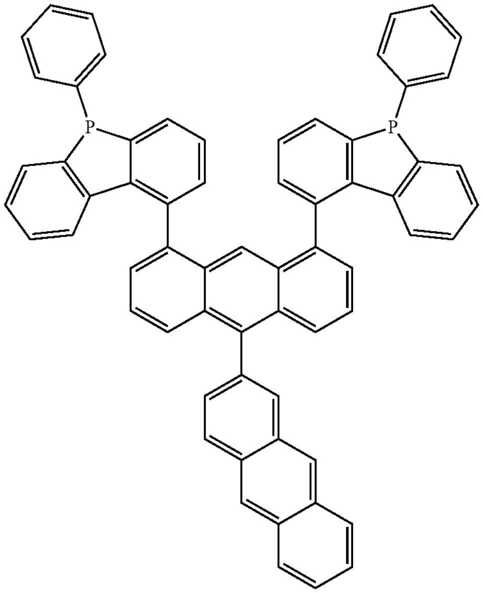
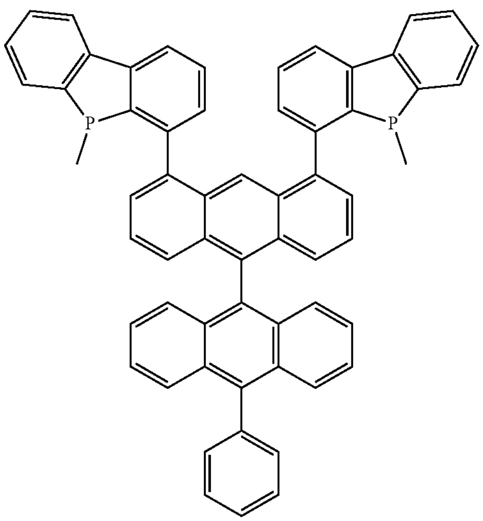
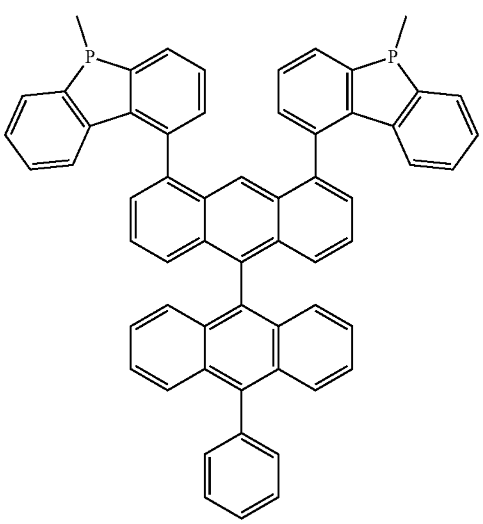
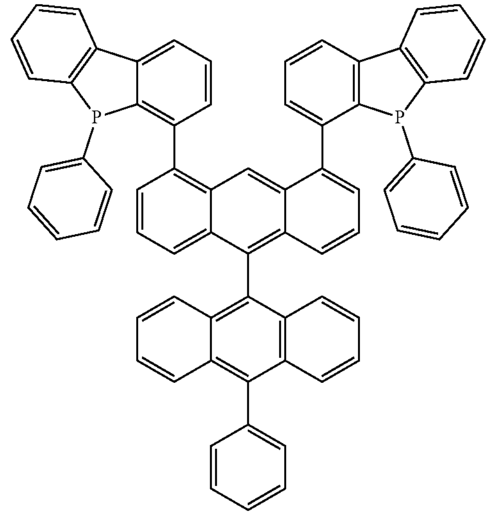
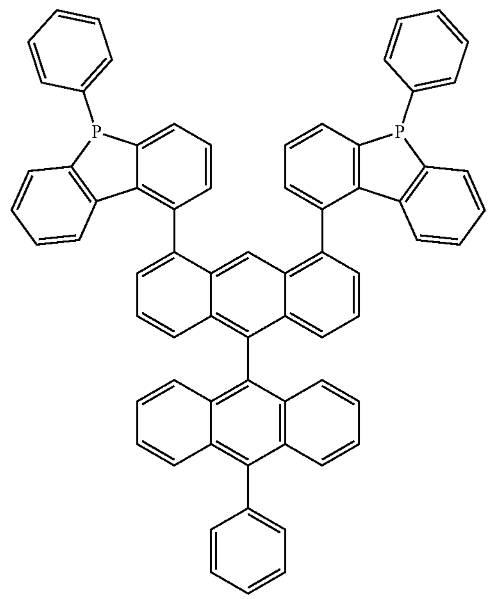
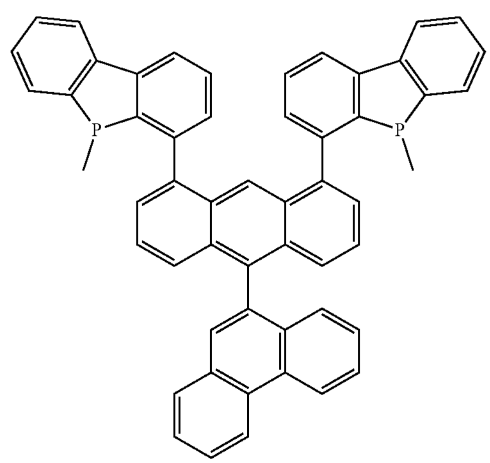

-continued
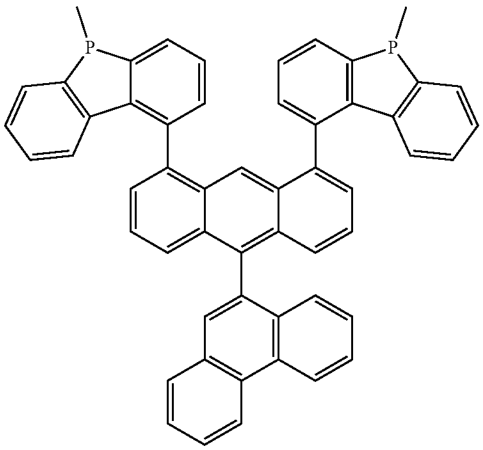
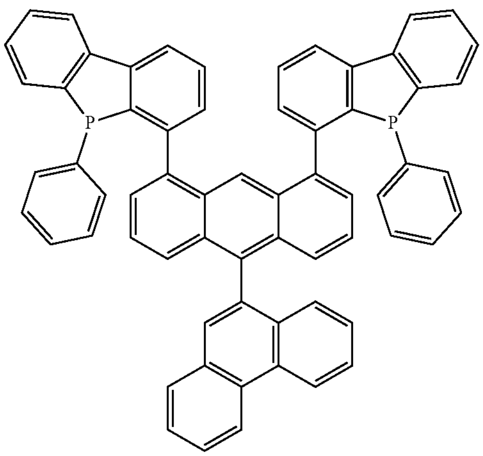
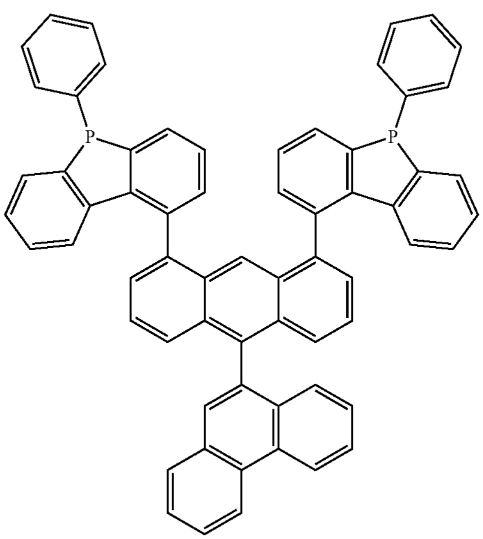
-continued
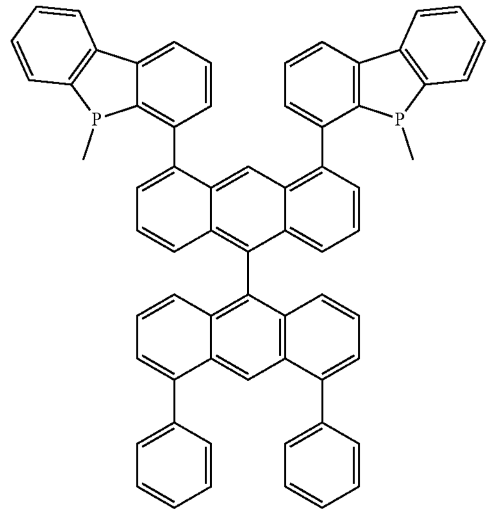
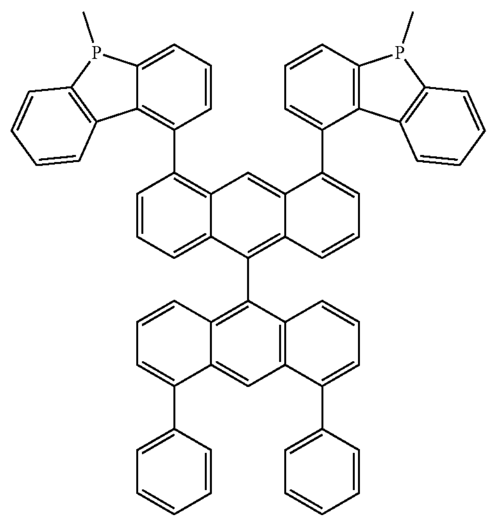
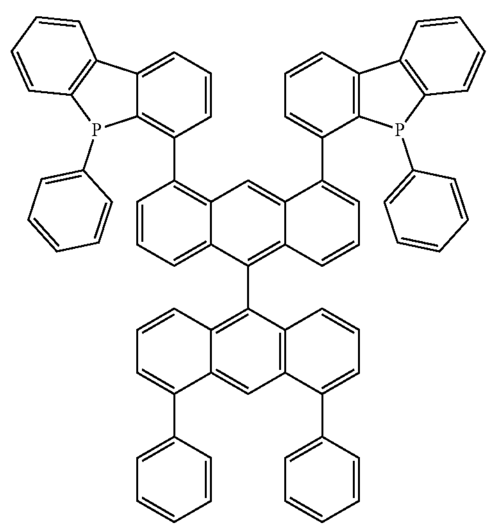

-continued
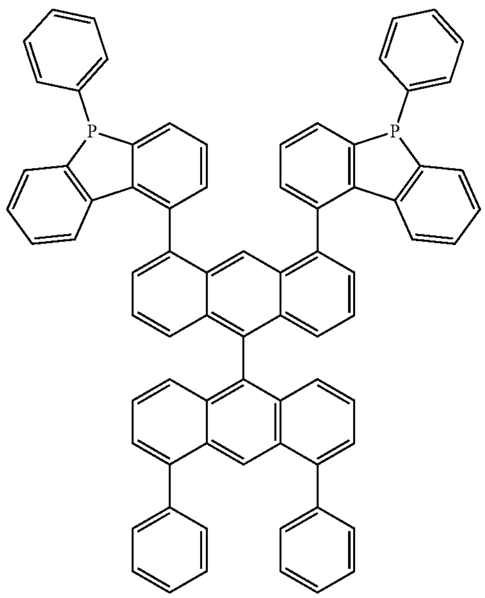
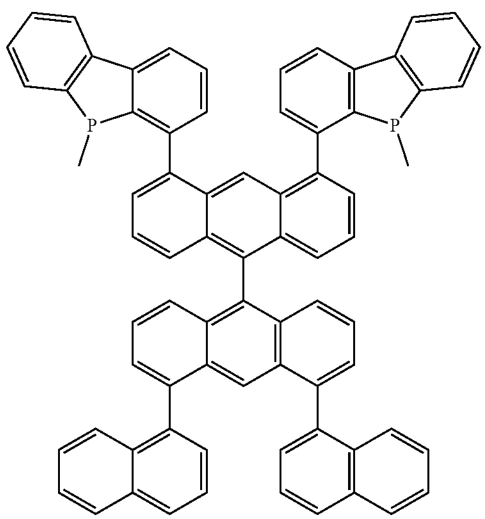
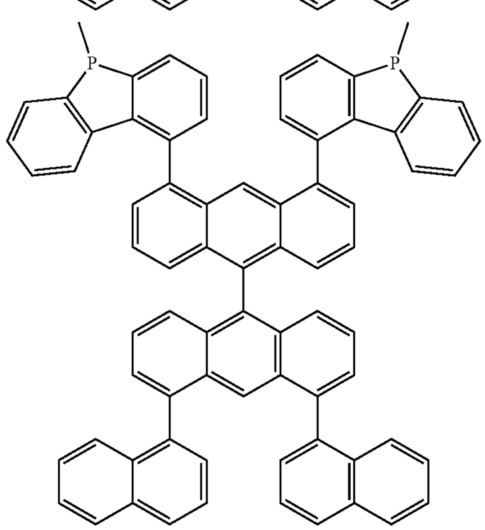
-continued
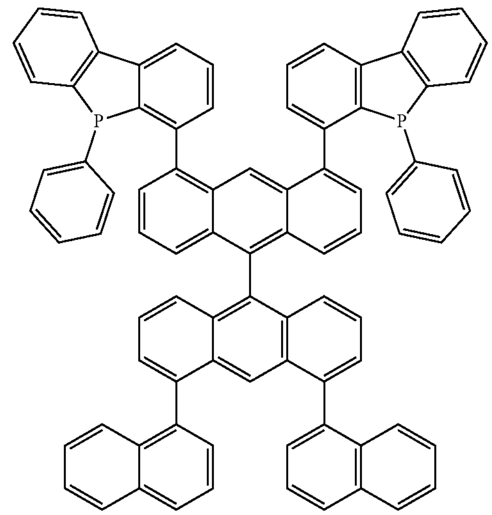
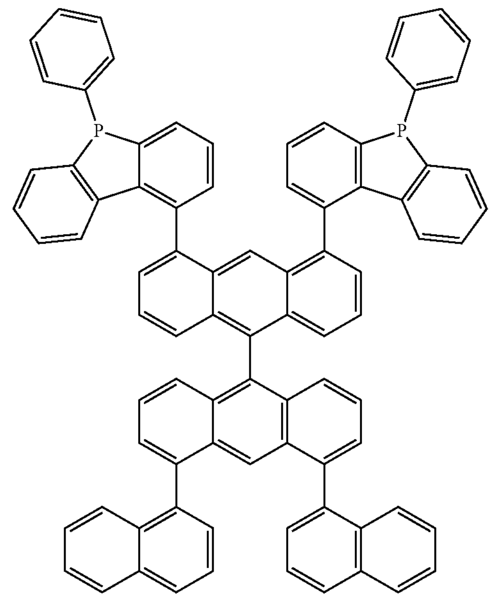
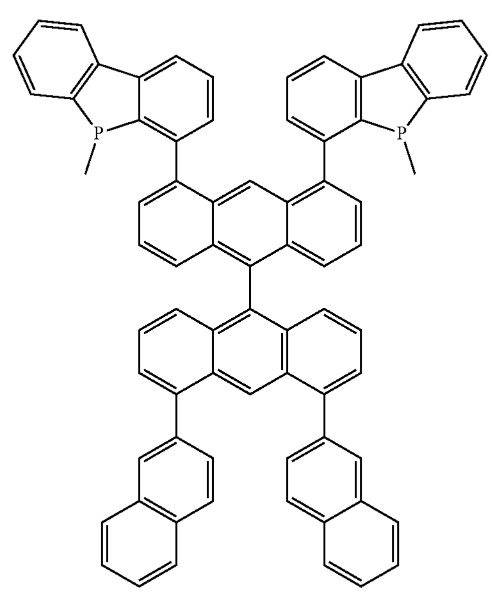

-continued
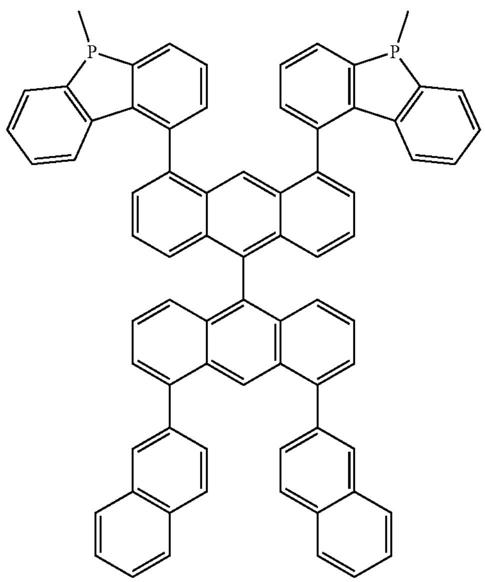
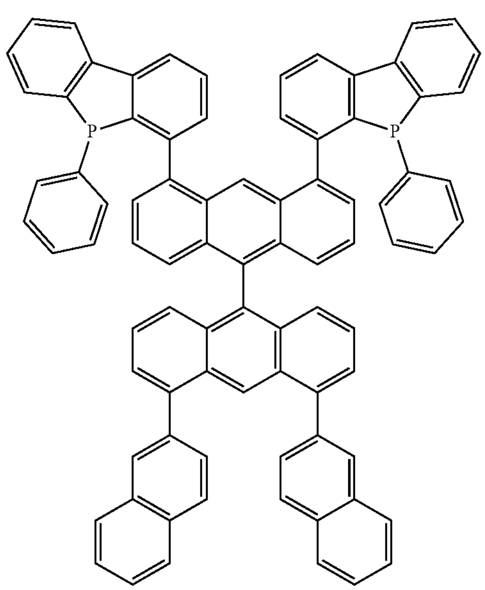
-continued
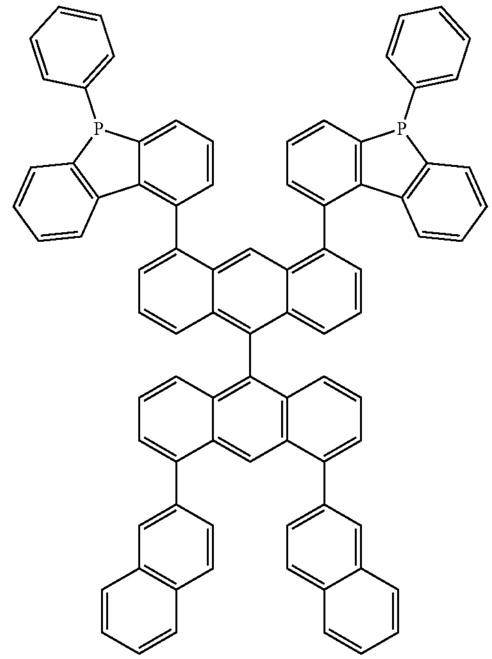
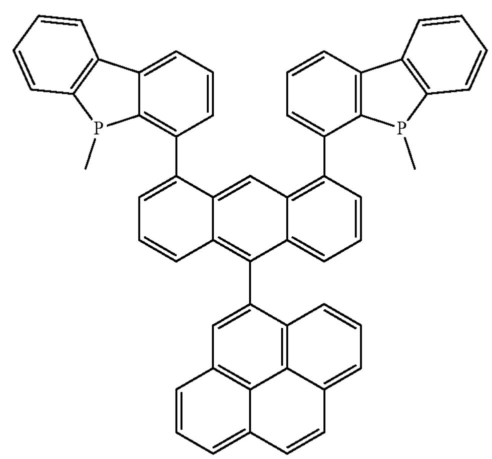
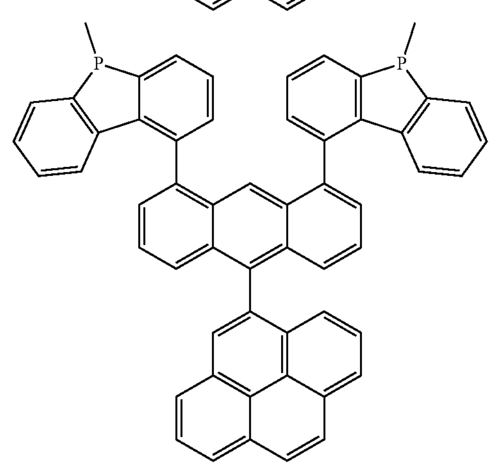

-continued
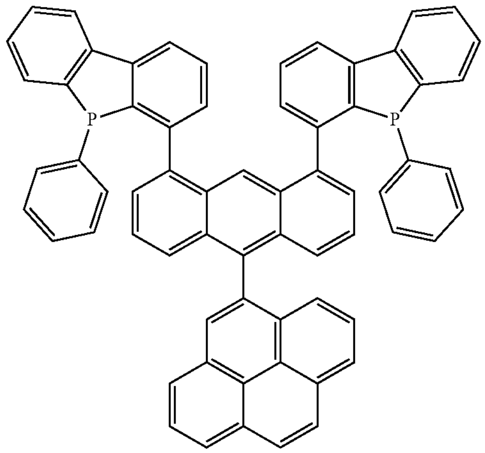
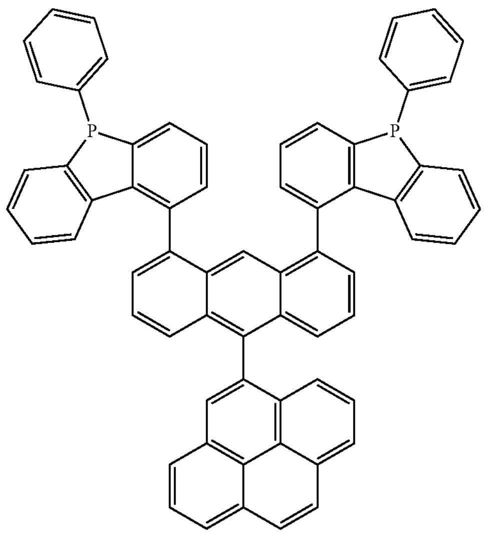 [SMILES: c1ccc(-p2c3ccccc3c3c(-c4cccc5c(-c6cc7cccc8ccc9cccc6c9c87)c6cccc(-c7cccc8c7c7ccccc7p8-c7ccccc7)c6cc45)cccc32)cc1]
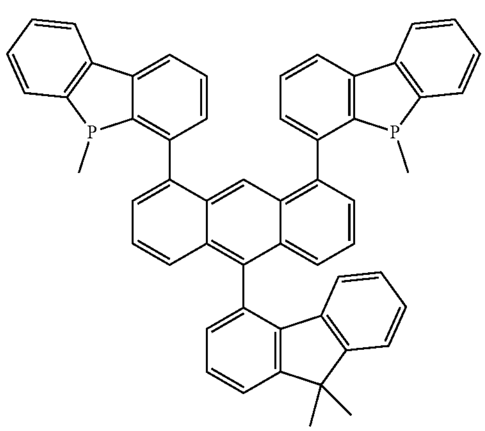
-continued
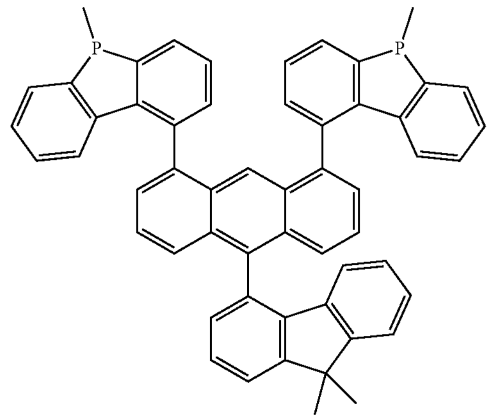
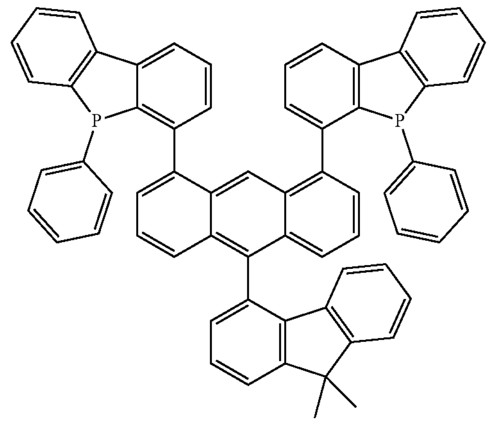
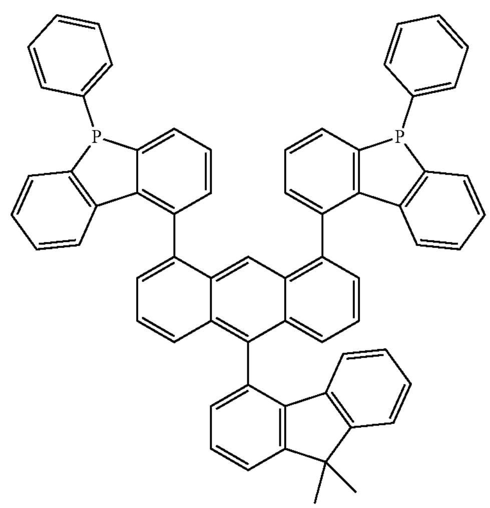

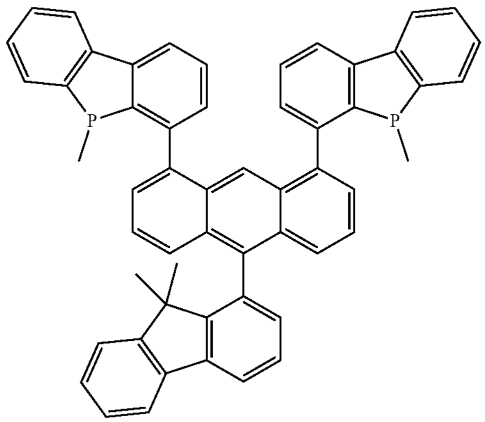
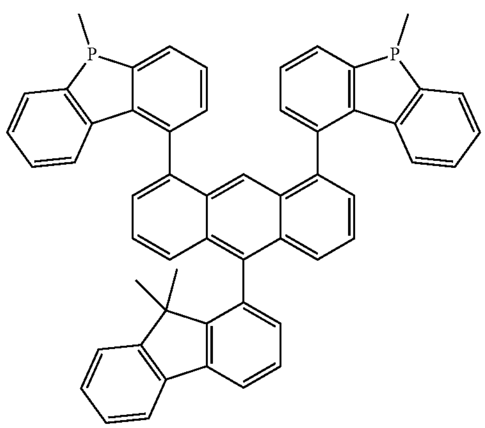
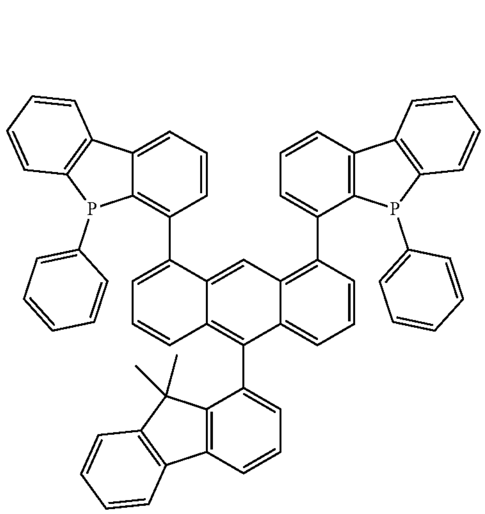
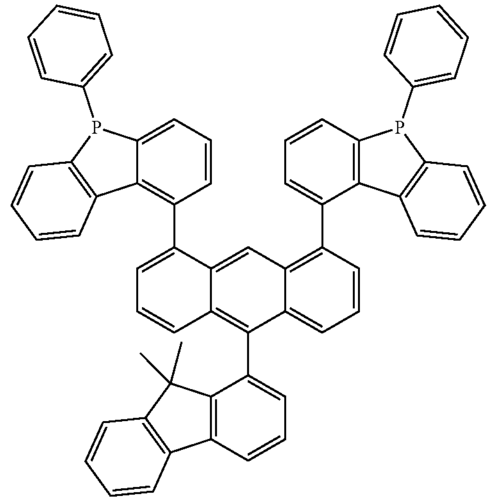
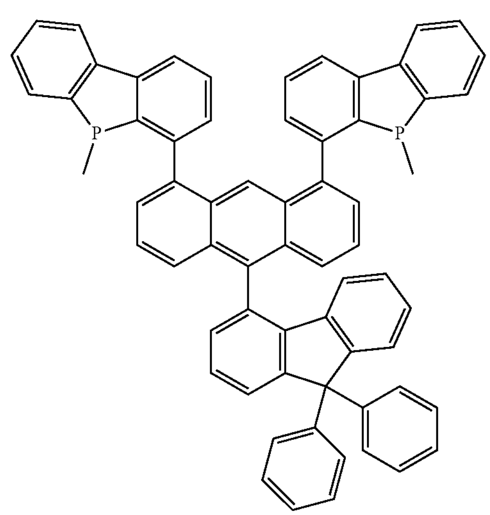
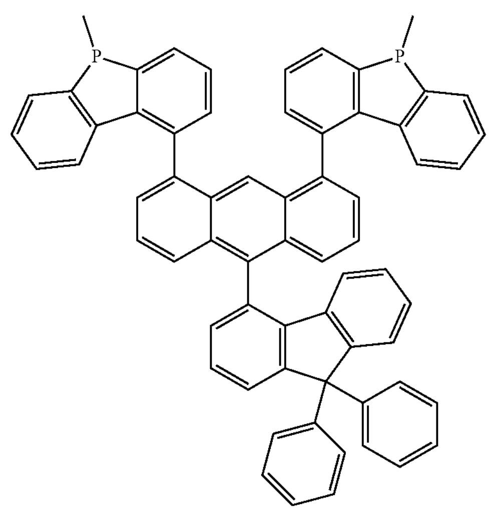

-continued
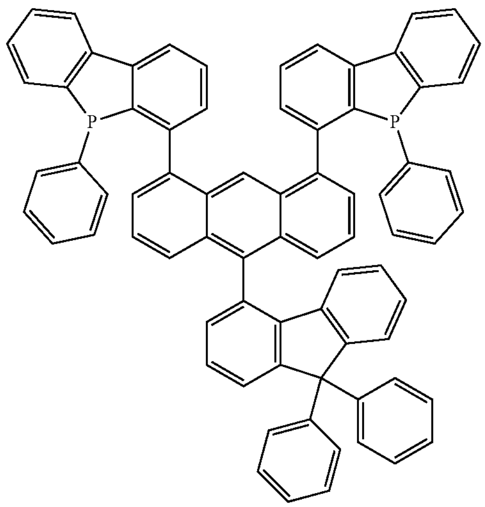
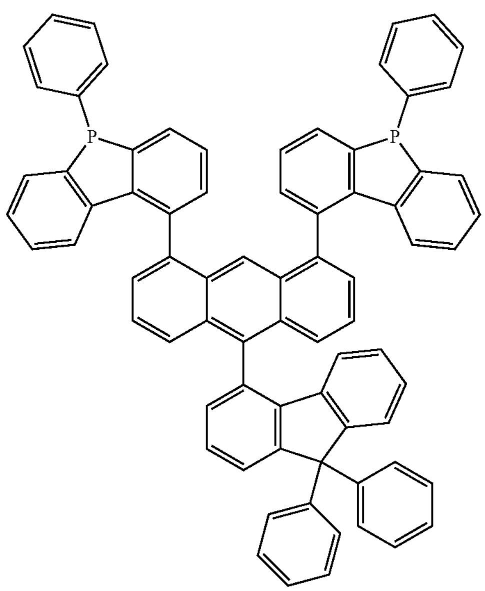
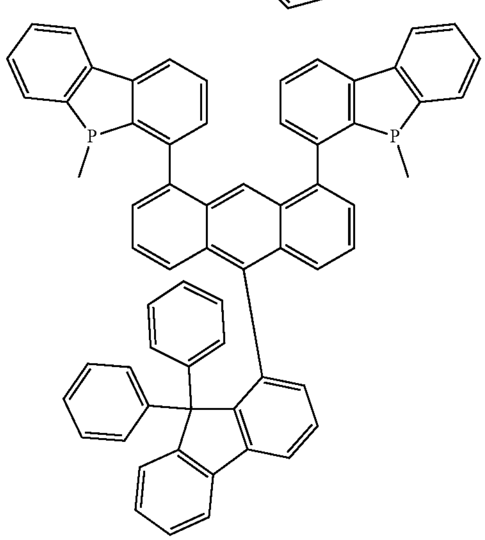
-continued
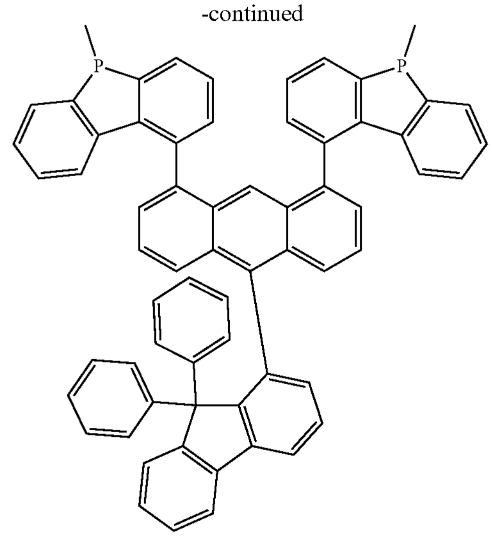
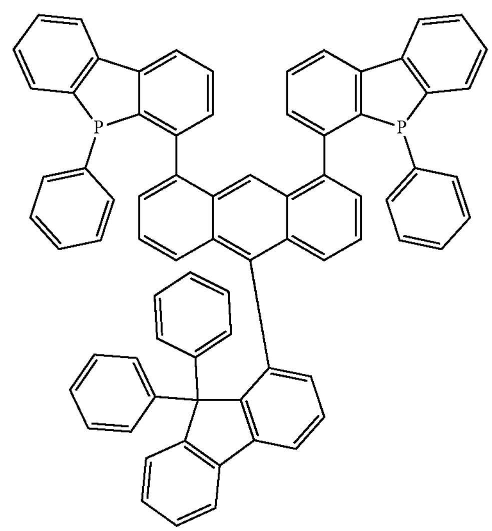
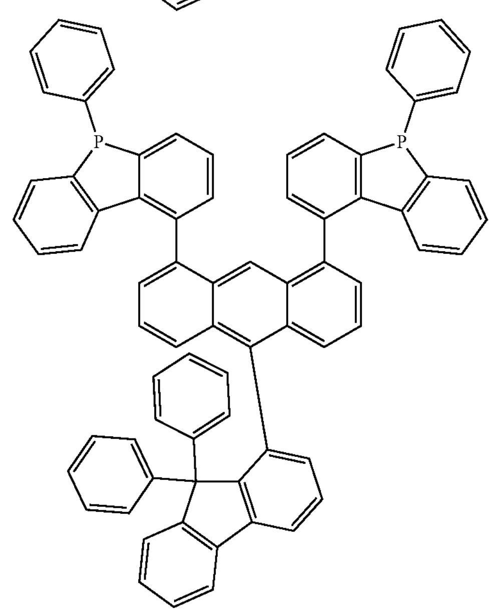

-continued
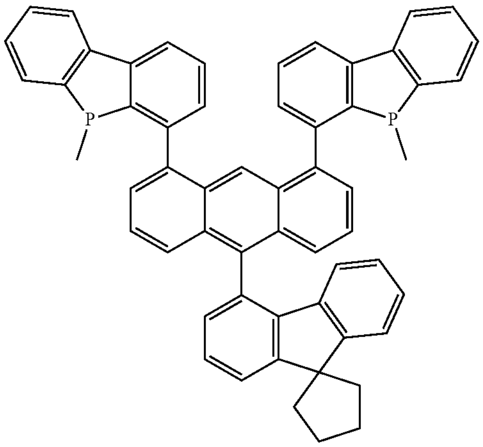
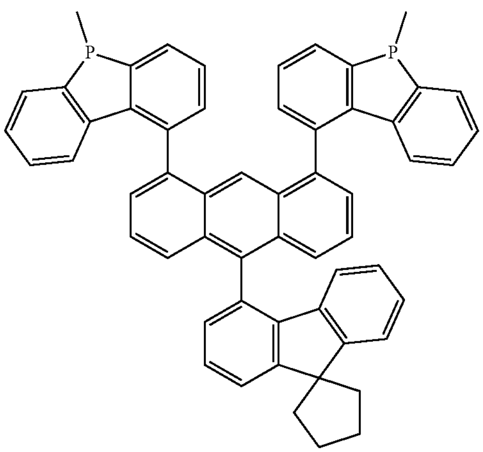
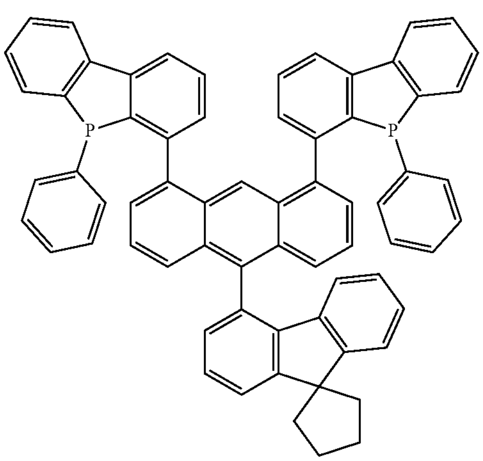
-continued
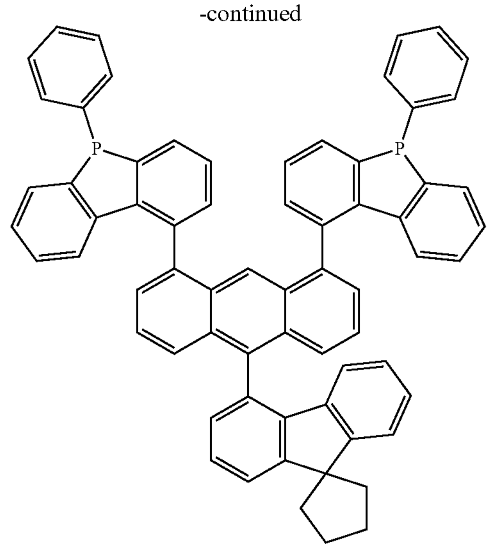
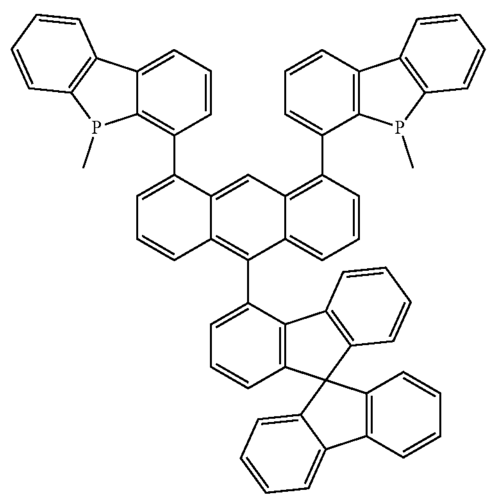
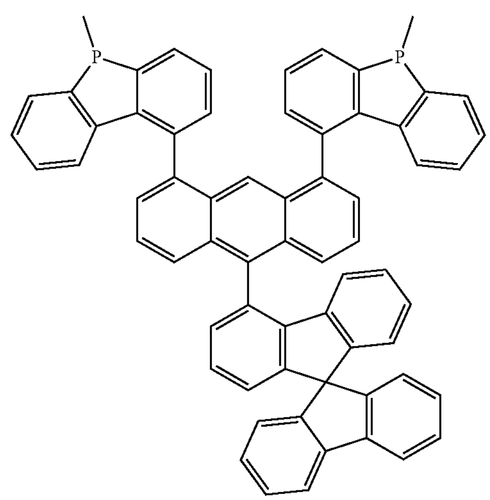

-continued
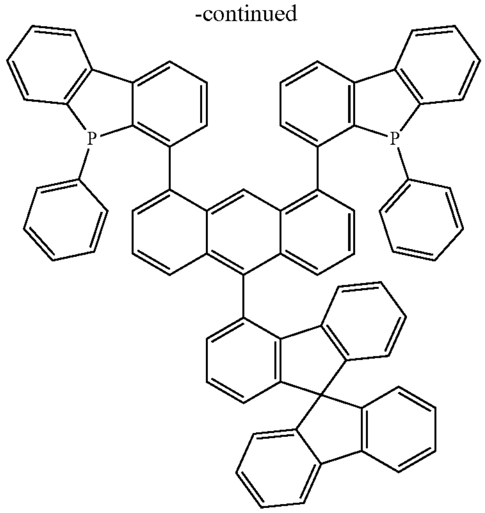
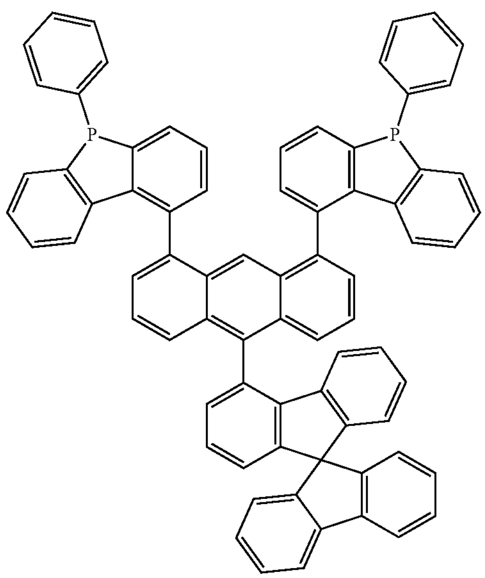
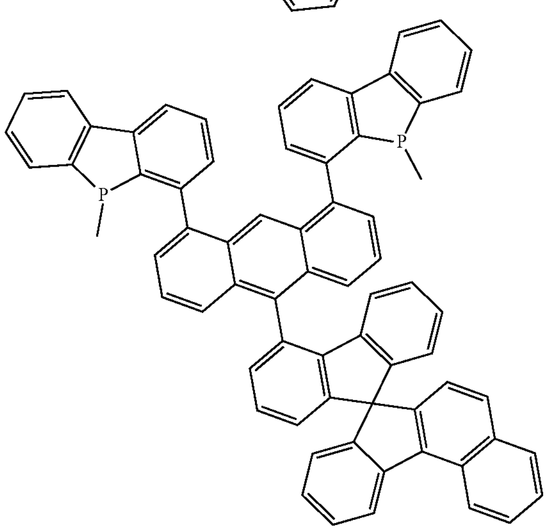
-continued
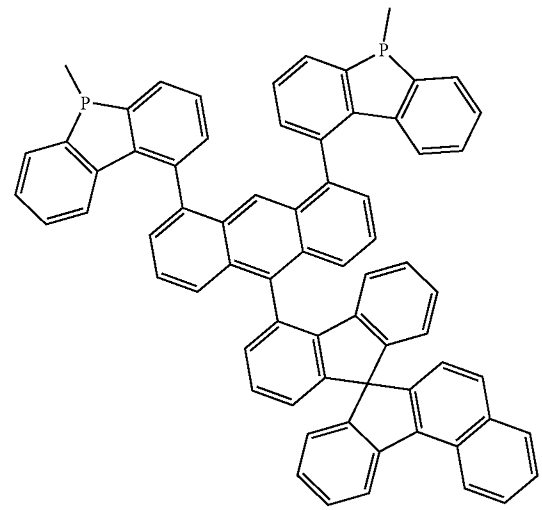
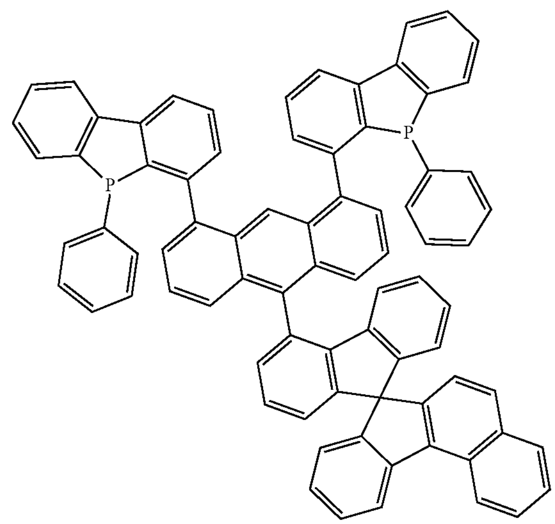
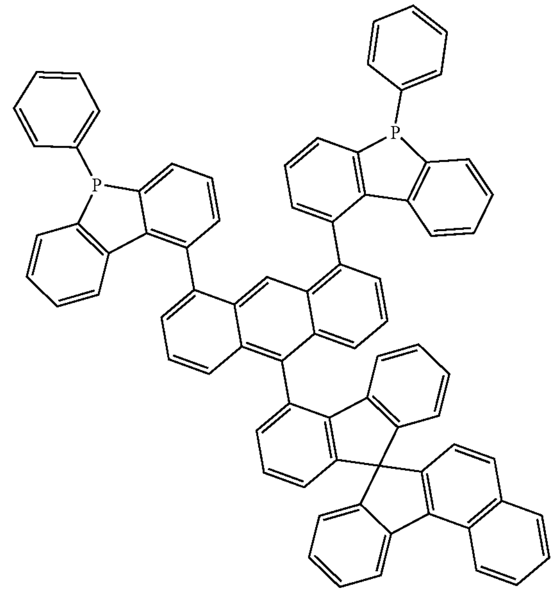

-continued
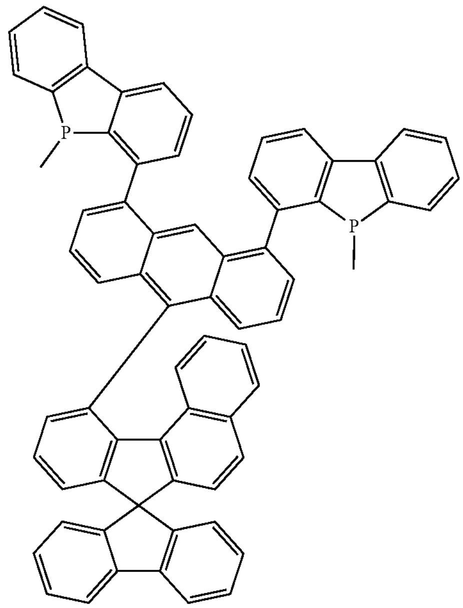
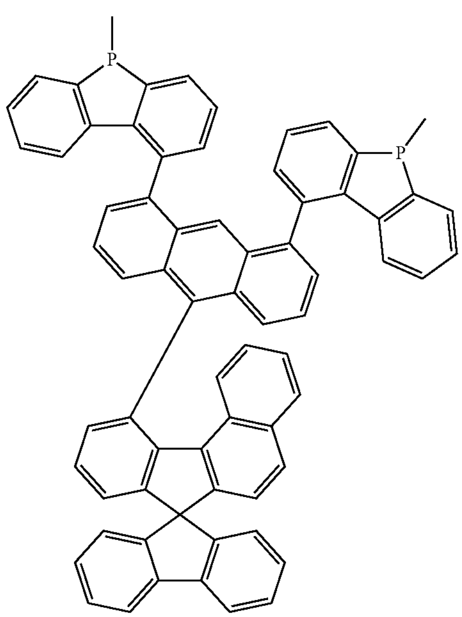
-continued
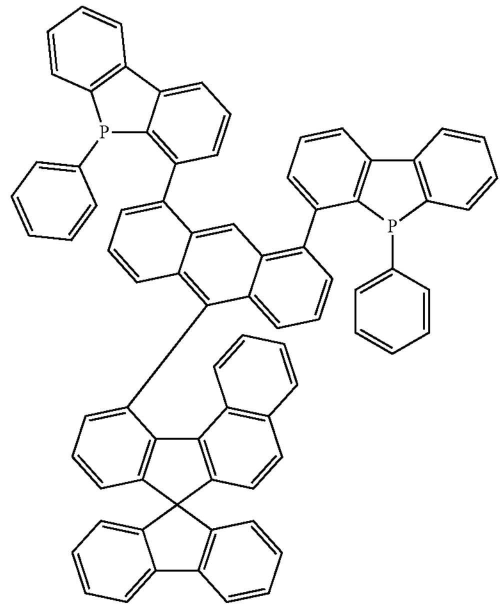
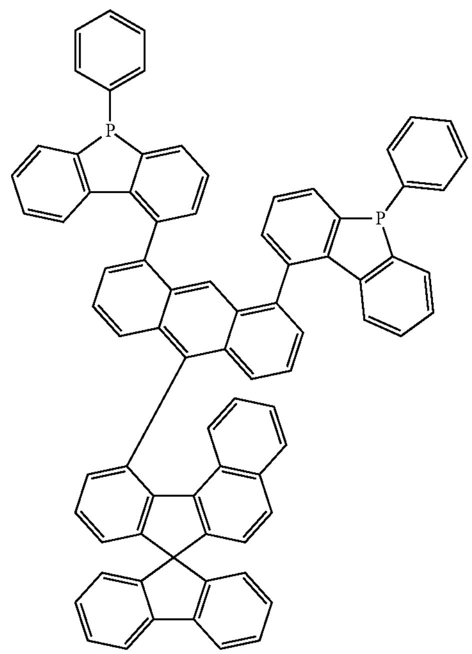
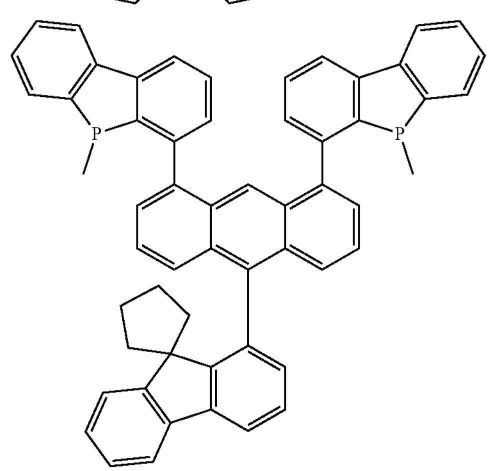

-continued
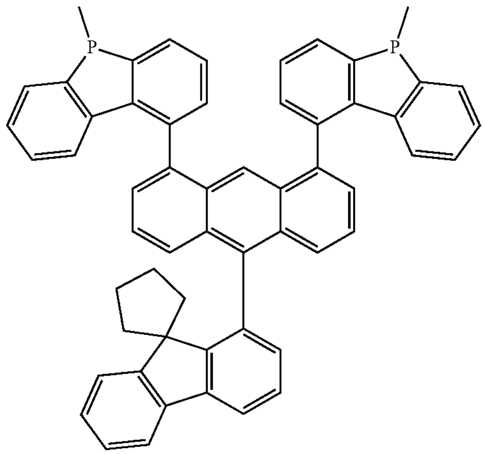
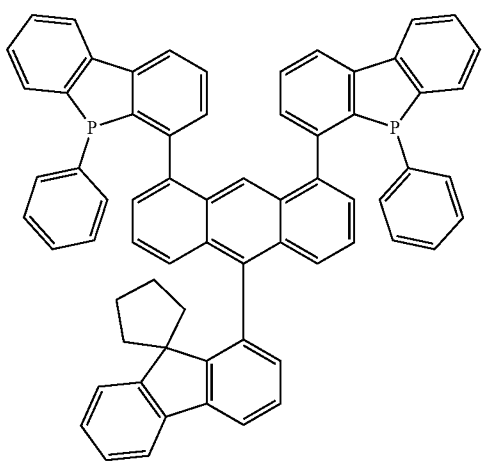
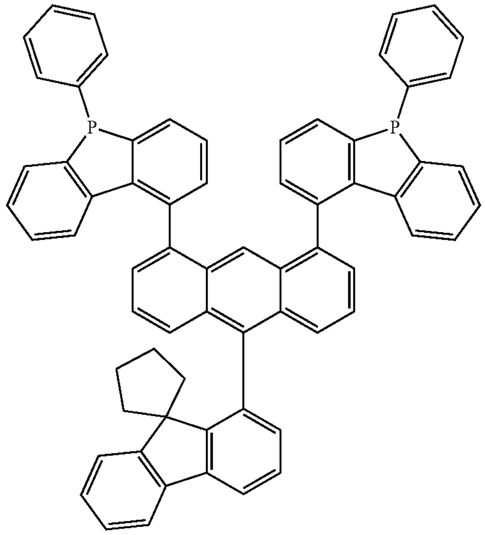
-continued
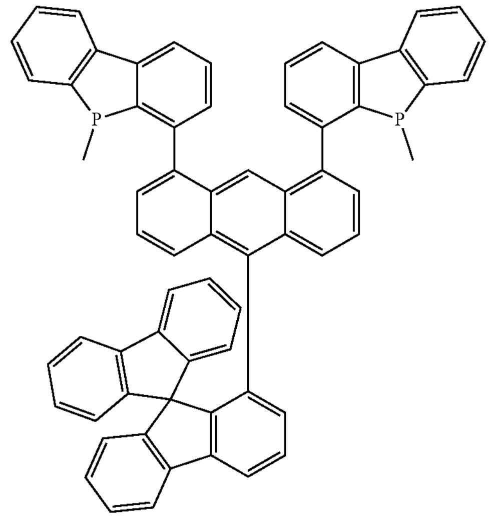
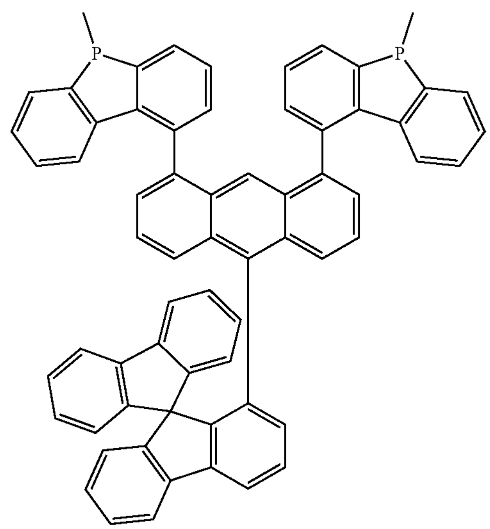
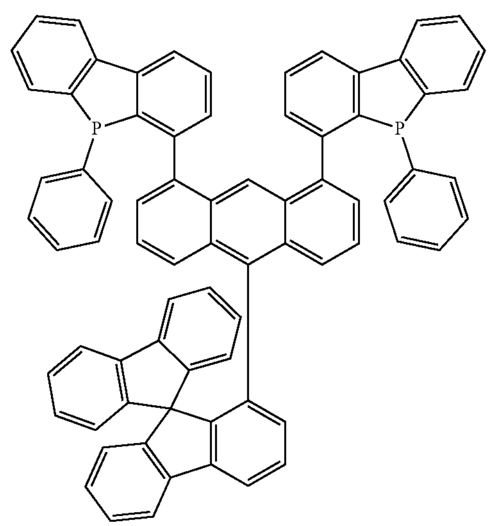

-continued
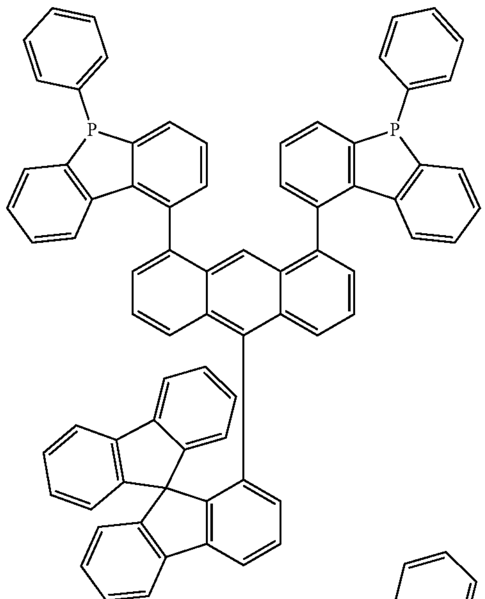
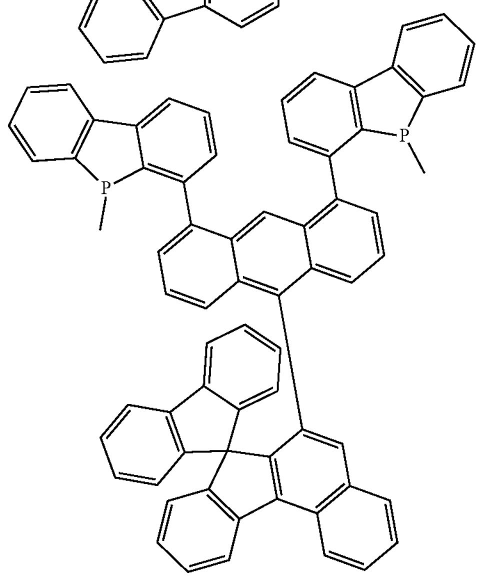
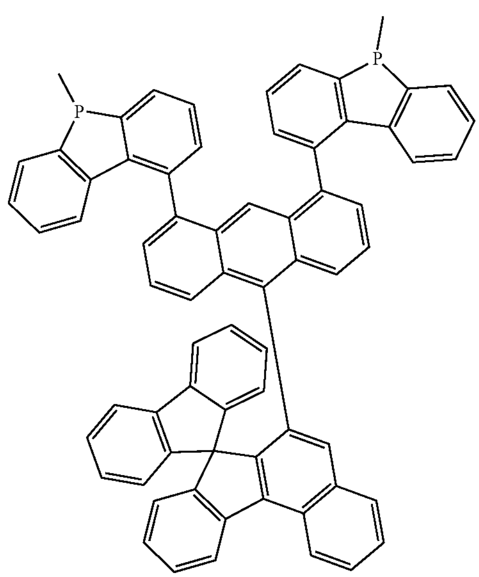
-continued
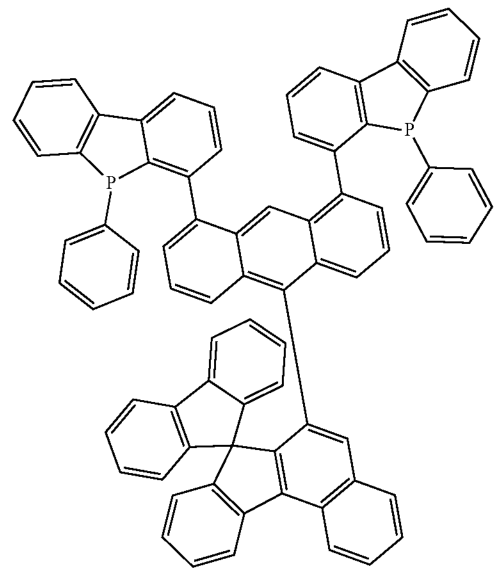
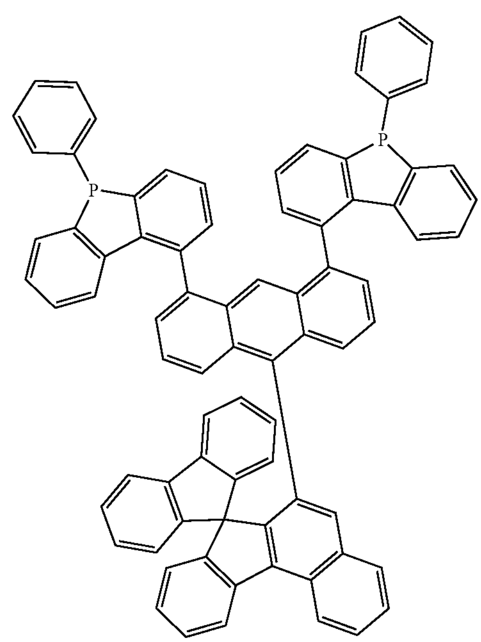

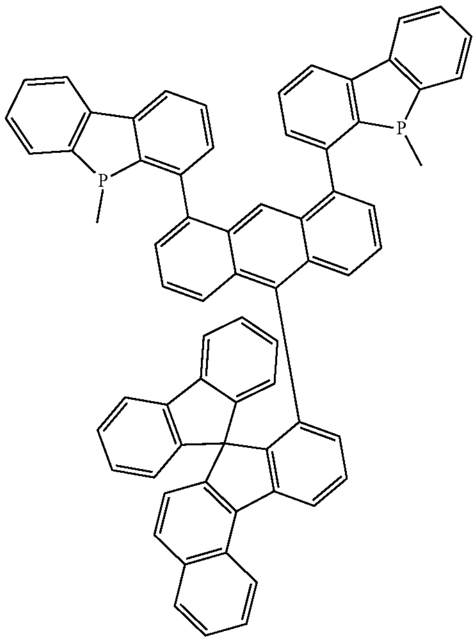
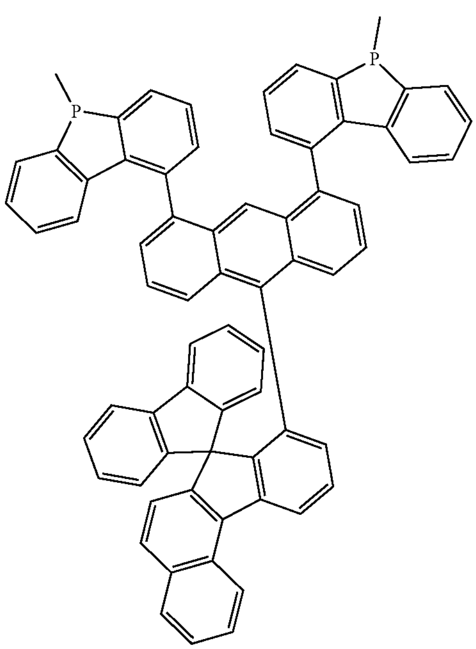
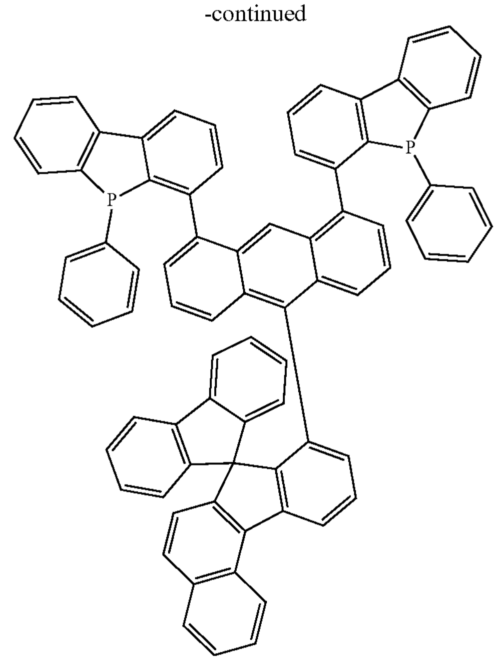
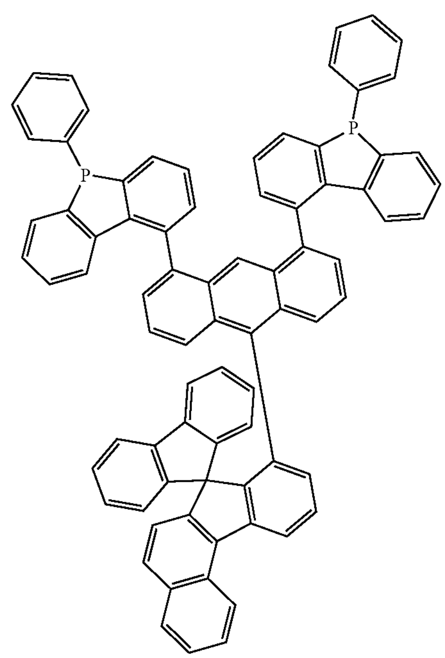

-continued
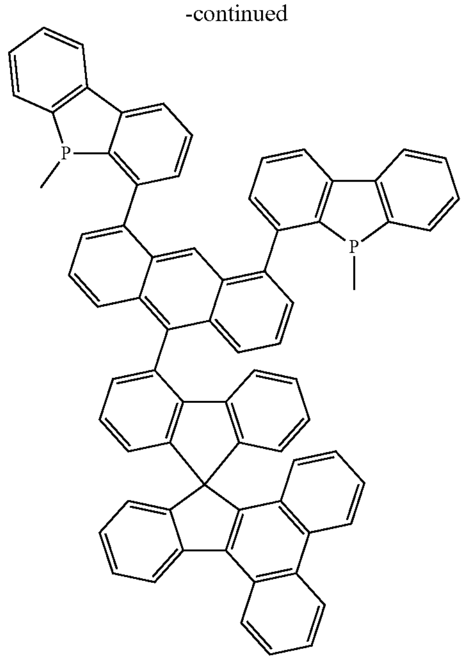
-continued
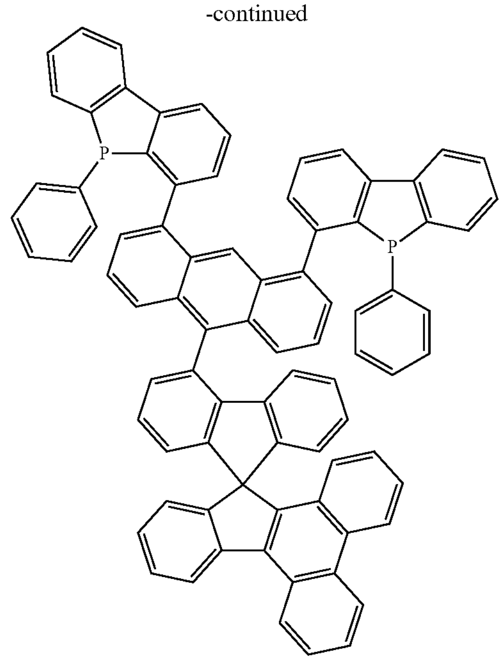
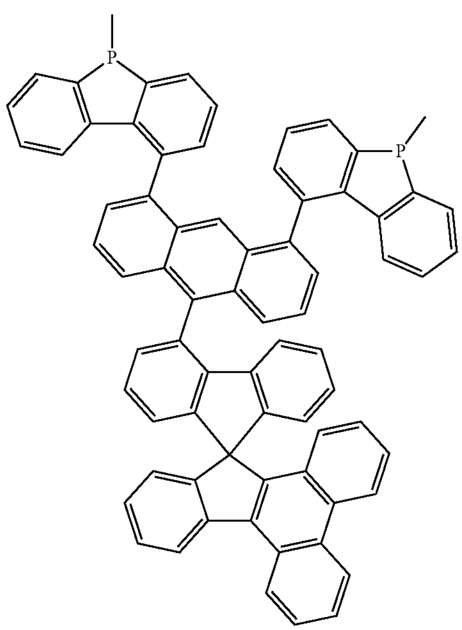
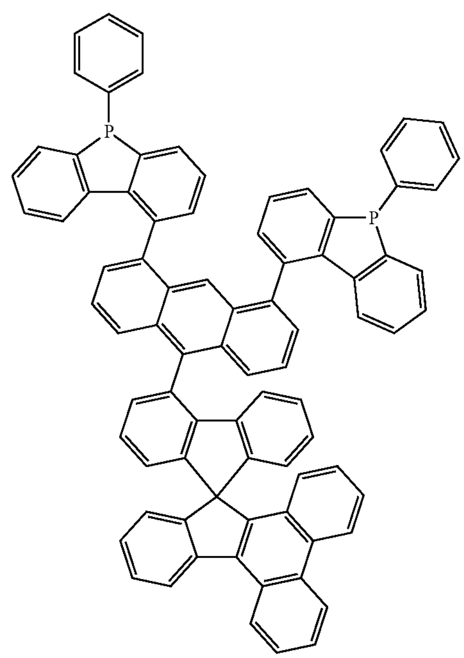

-continued
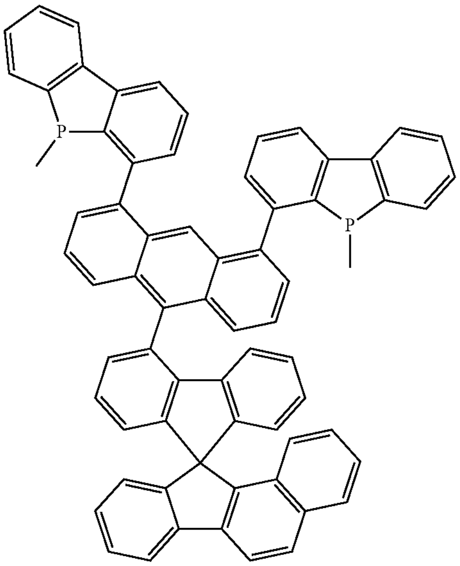
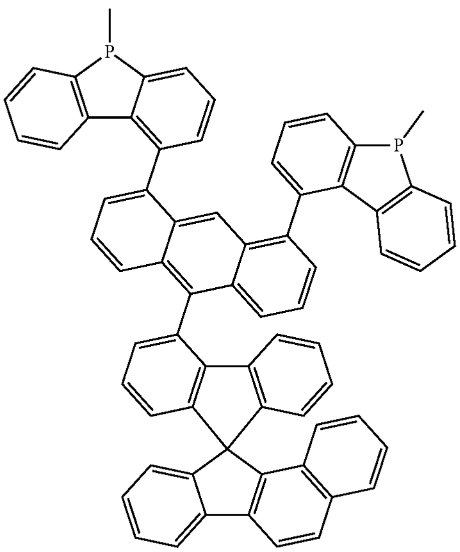
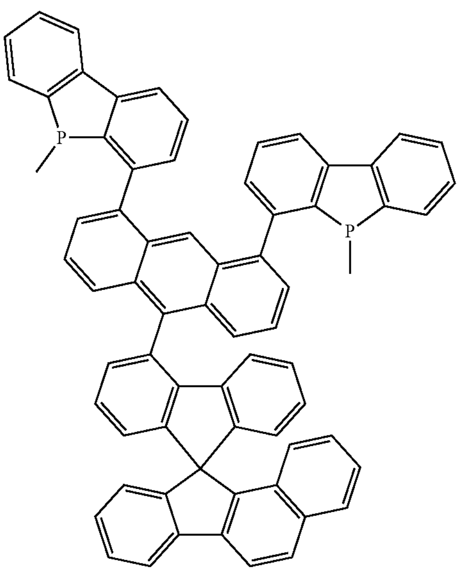
-continued
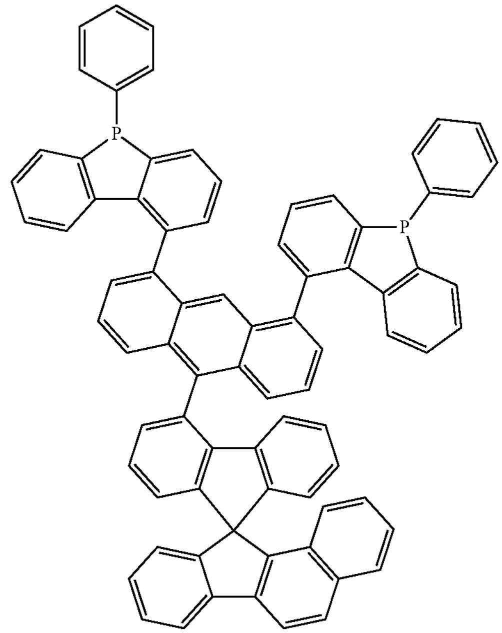
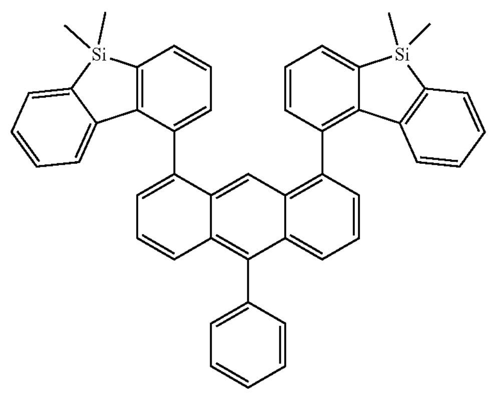
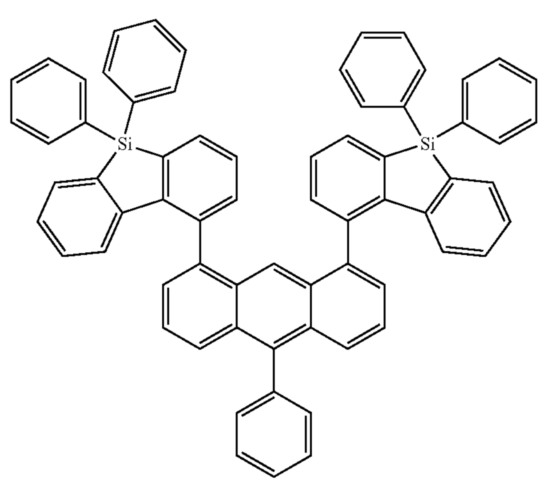

-continued
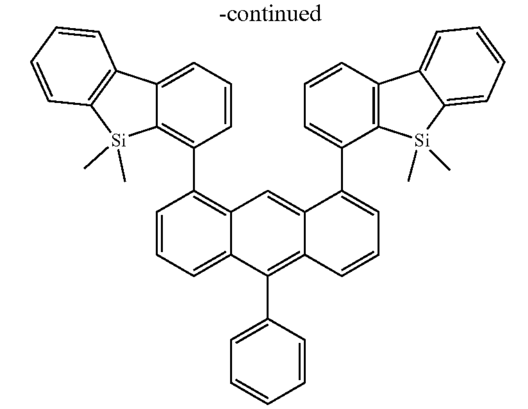
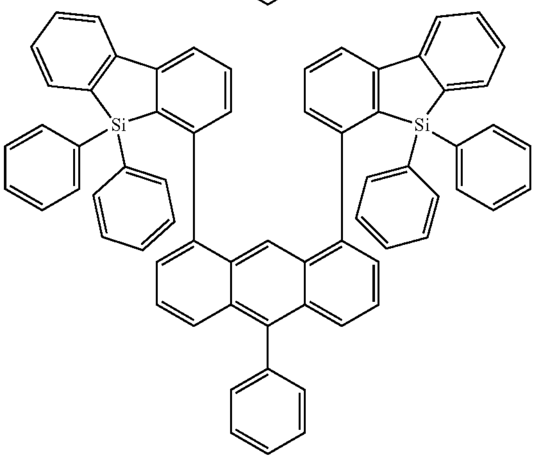
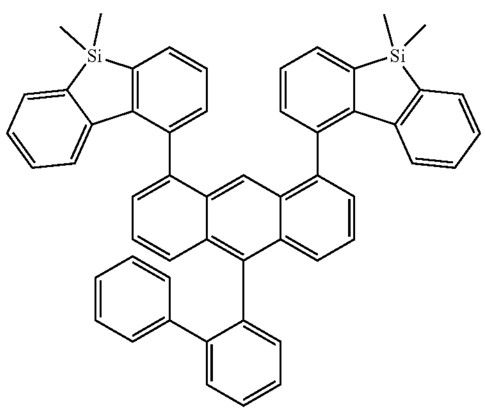
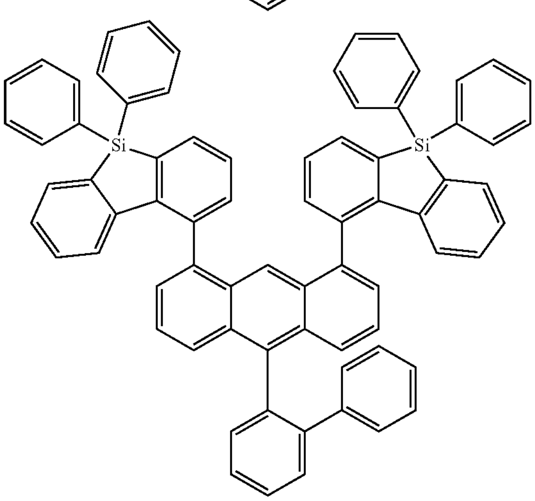
-continued
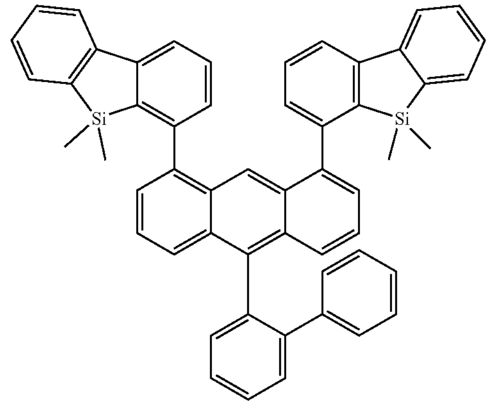
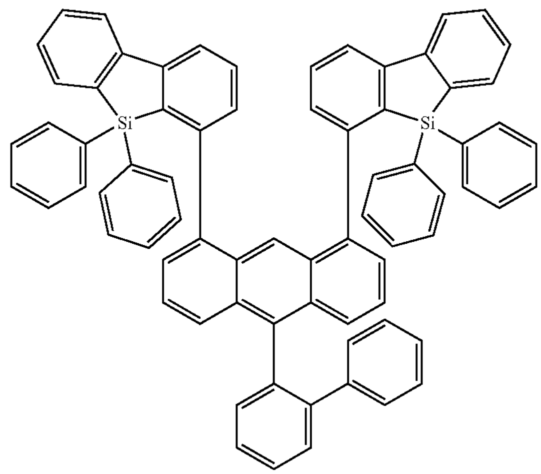
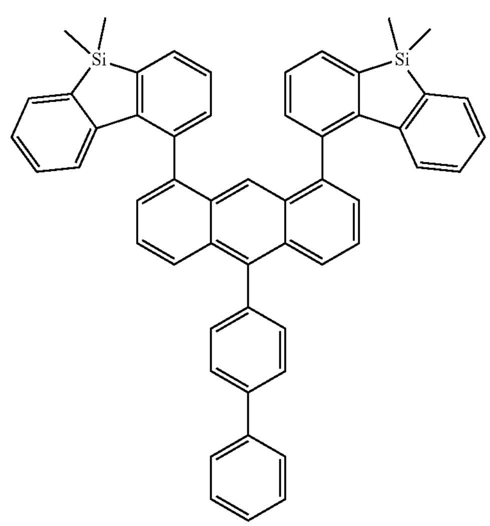

-continued
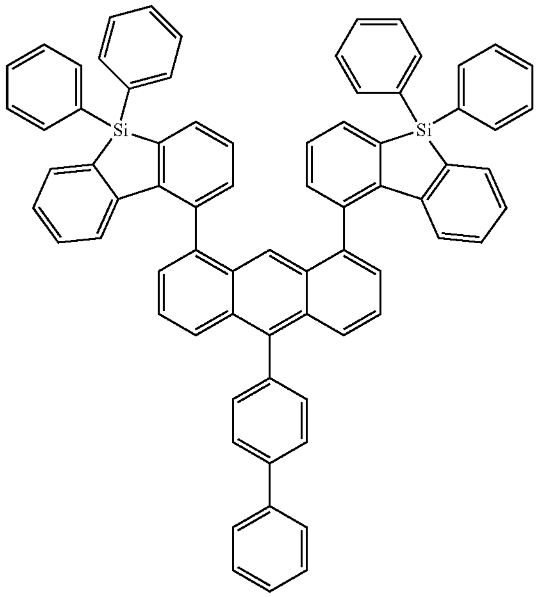
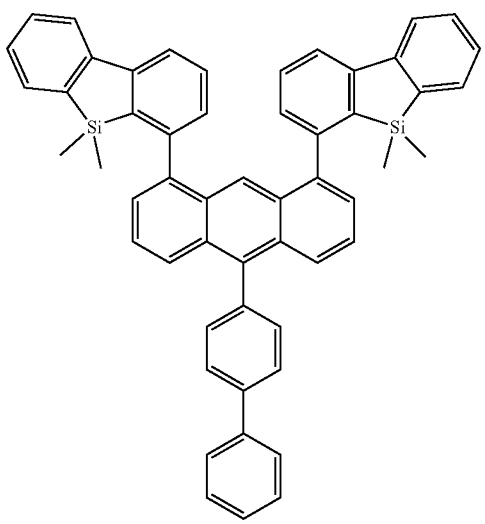
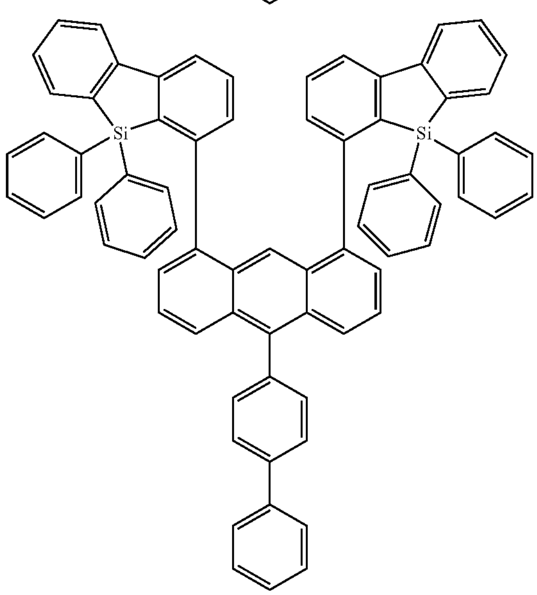
-continued
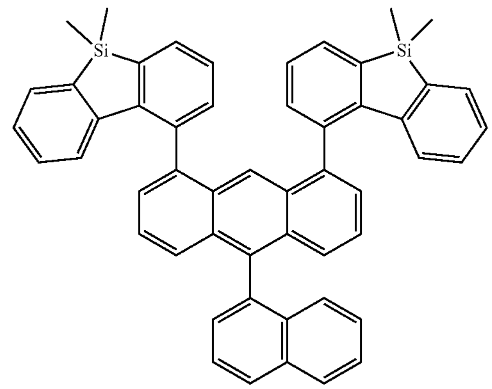
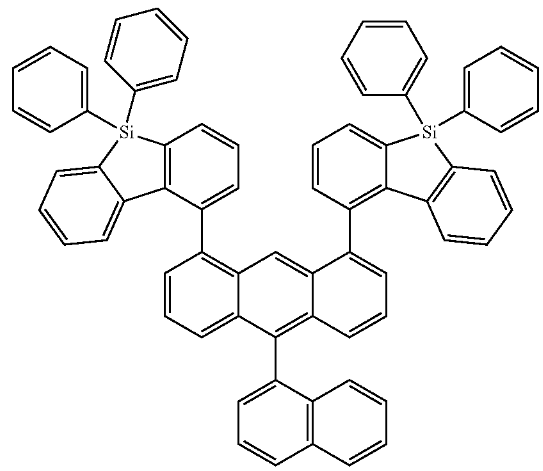
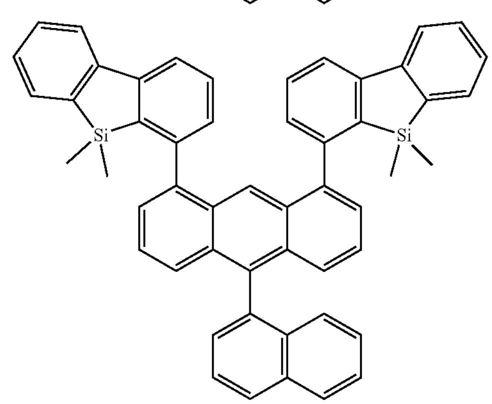
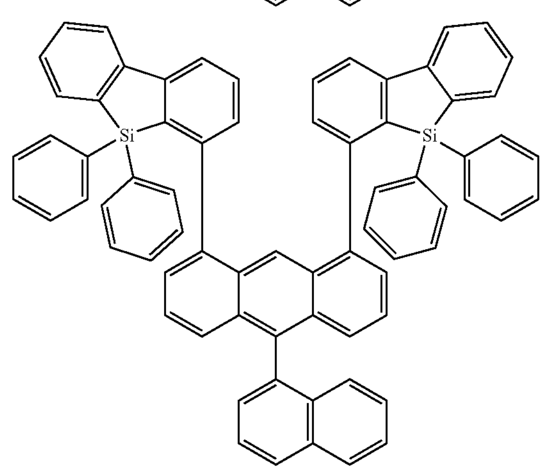

-continued
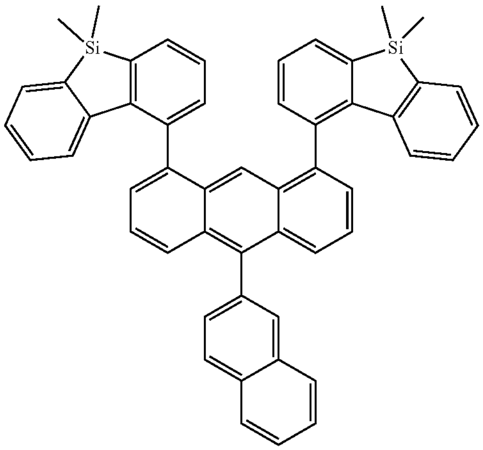
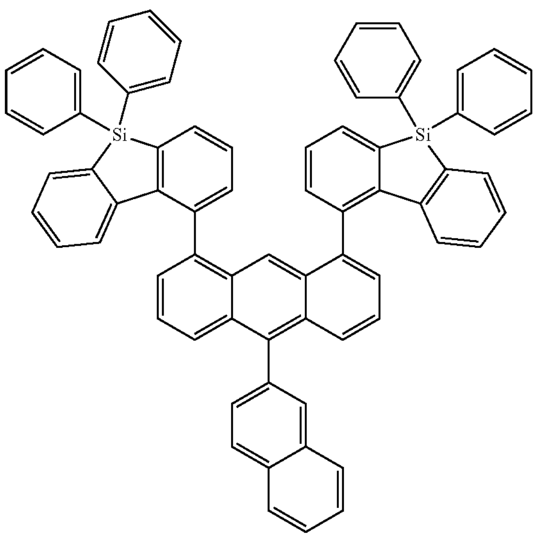
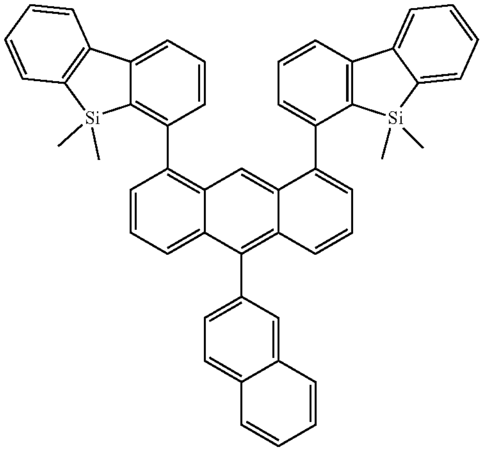
-continued
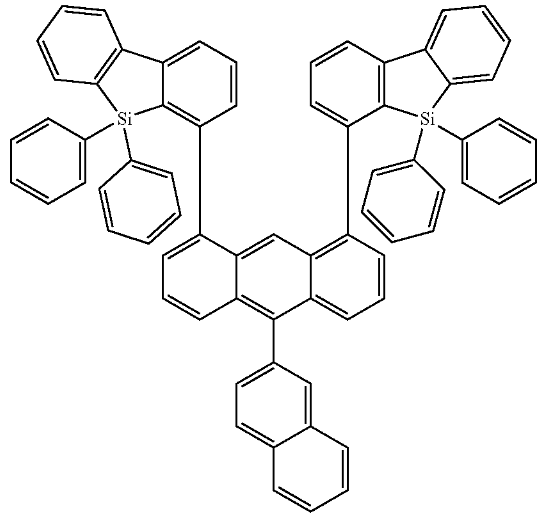
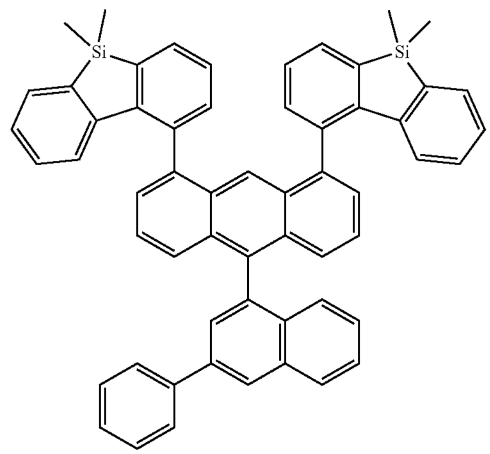
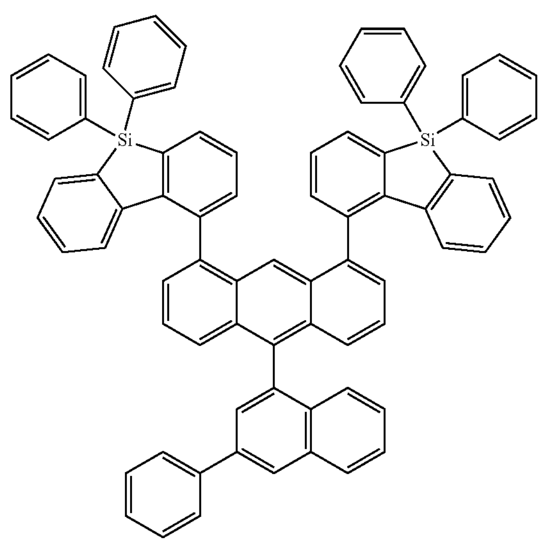

-continued
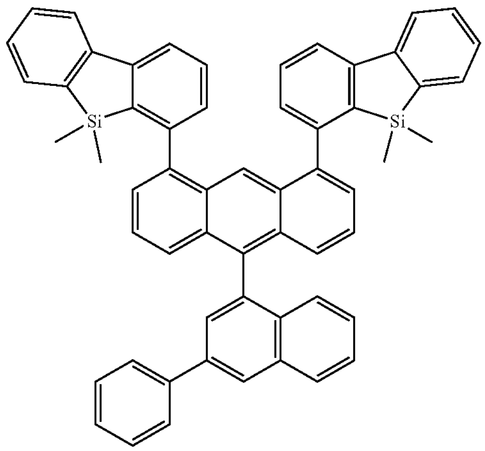
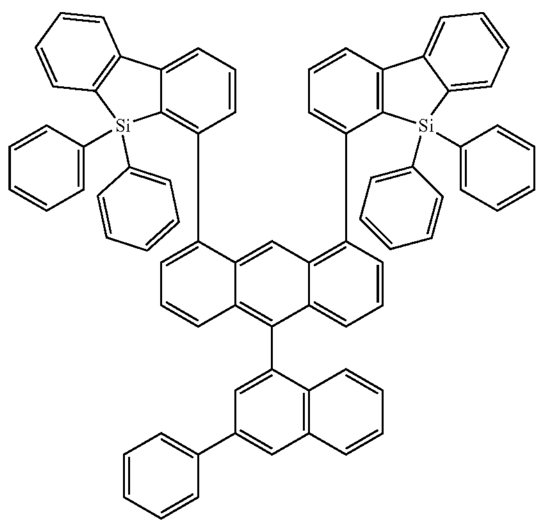
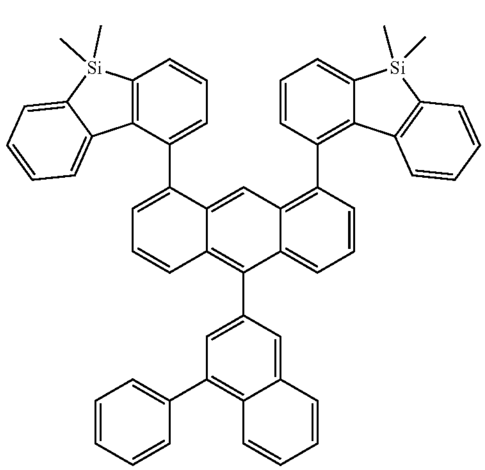
-continued
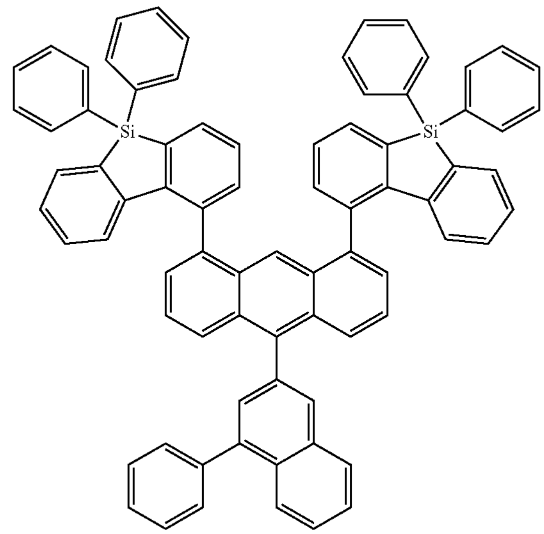
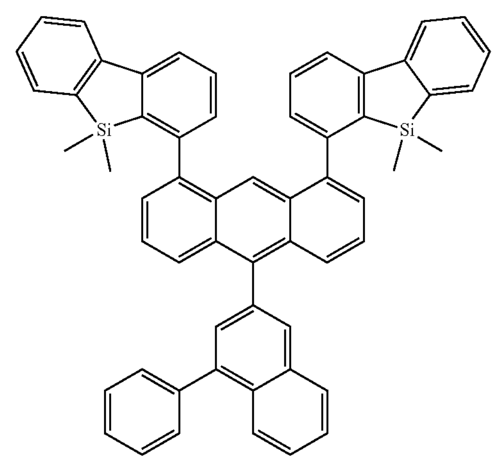
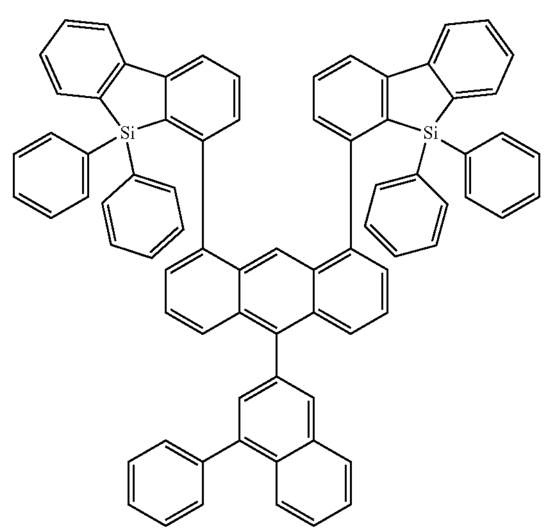

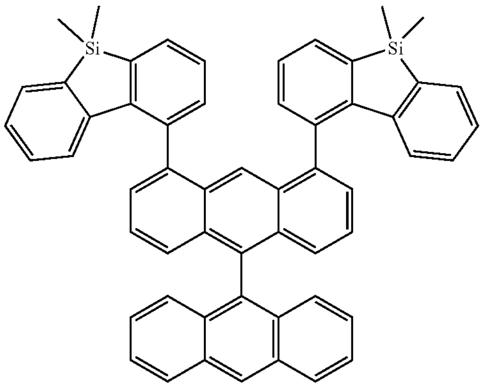
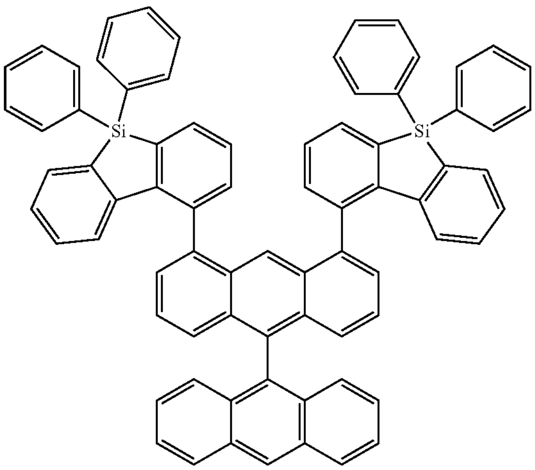
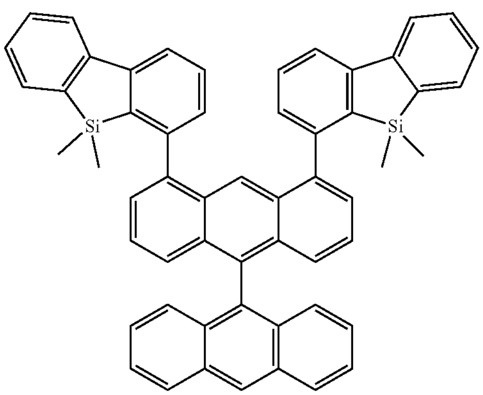
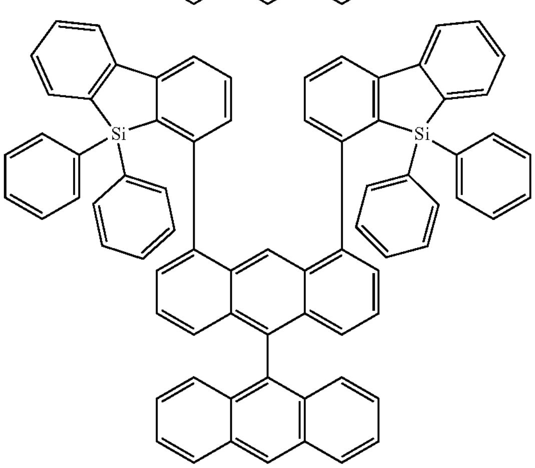
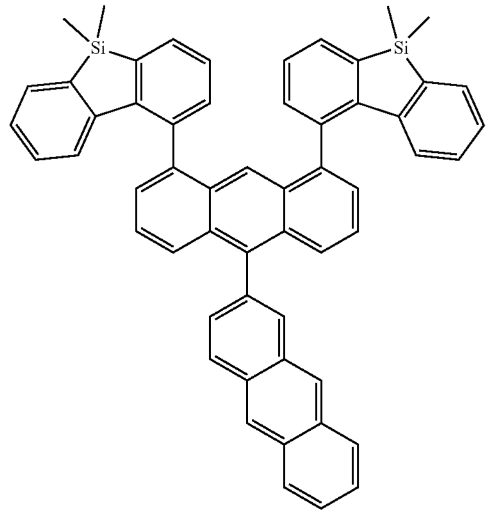
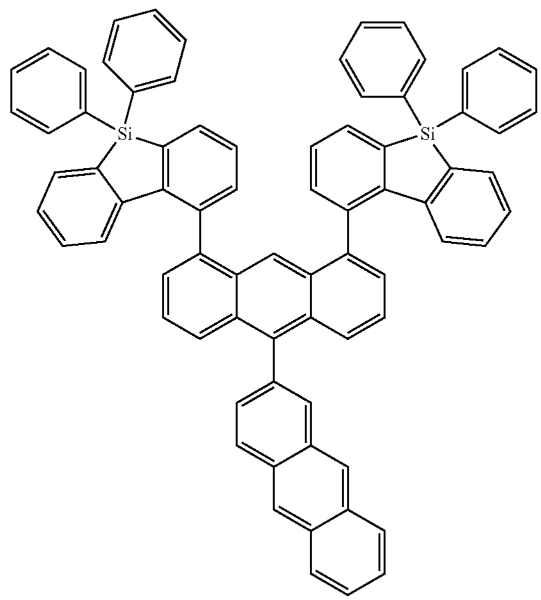
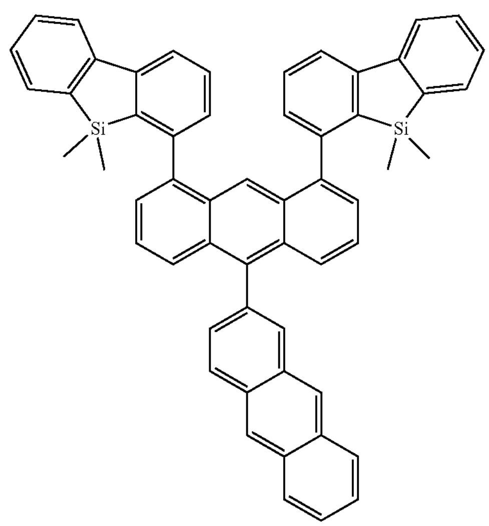

-continued
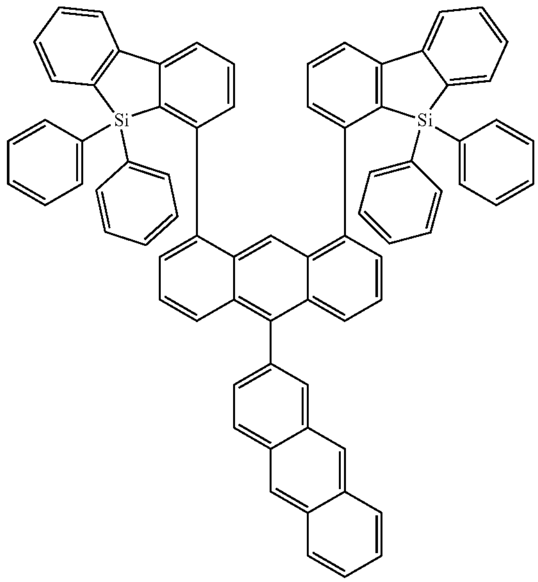
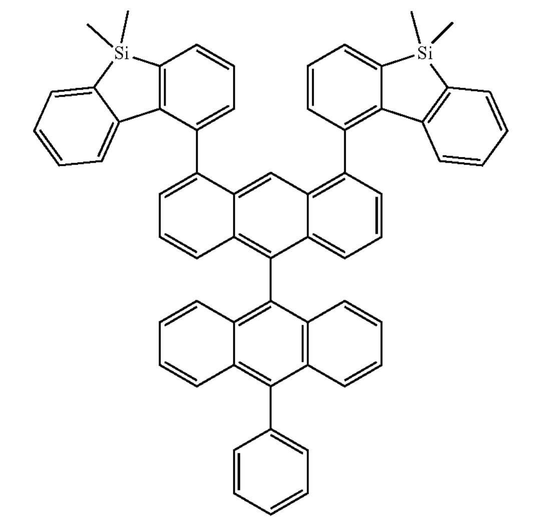
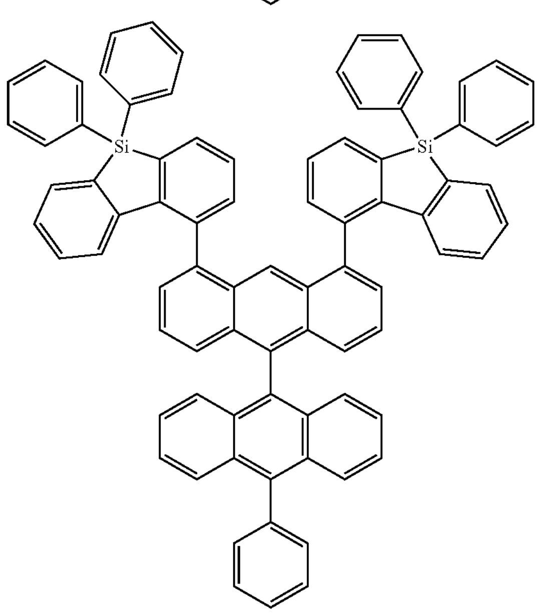
-continued
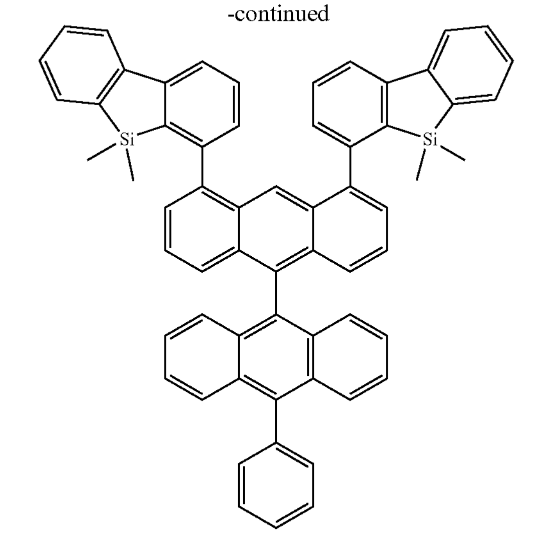
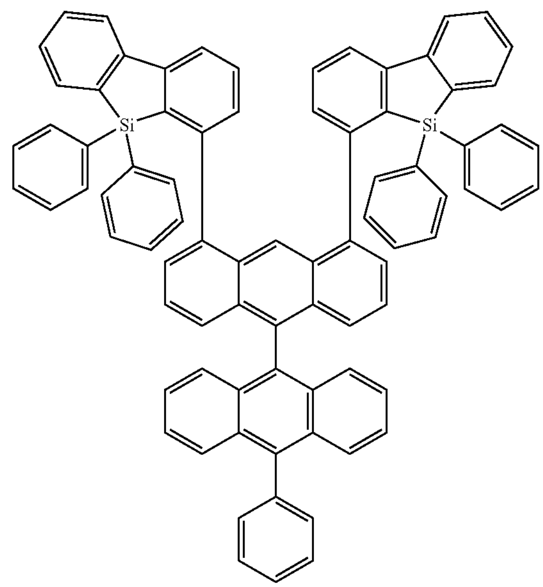
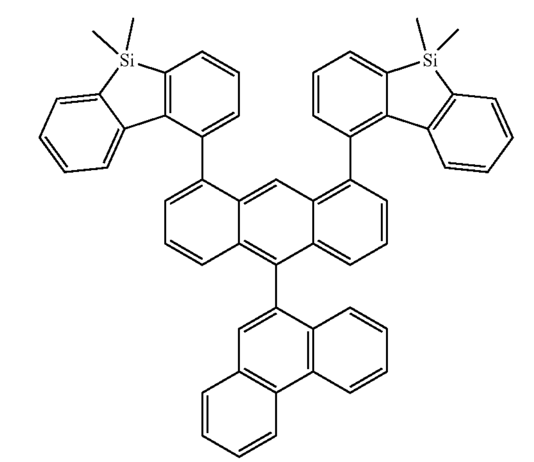

-continued
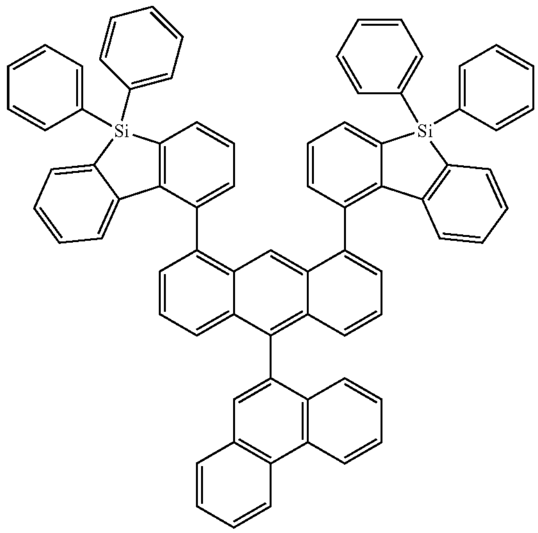
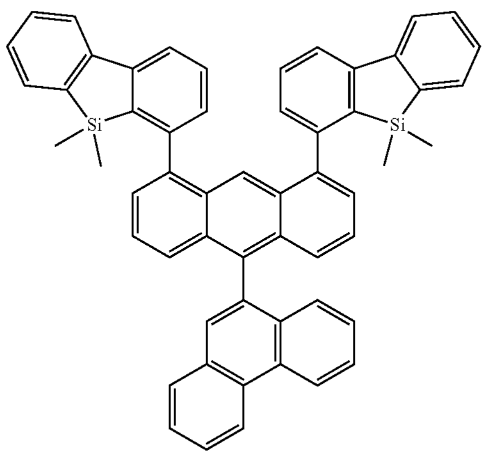
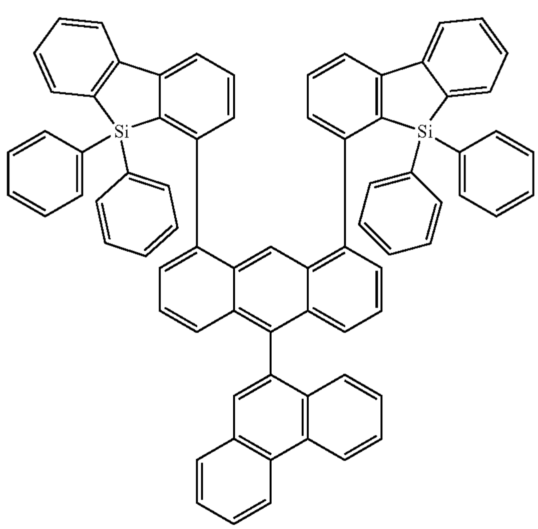
-continued
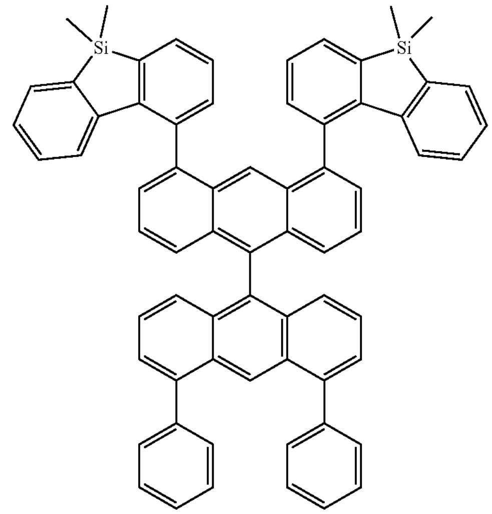
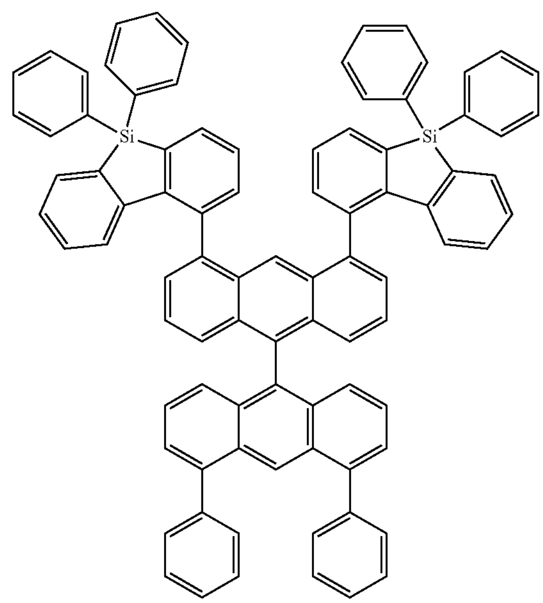
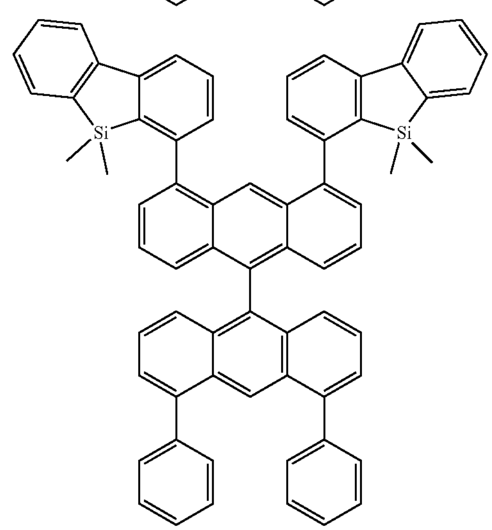

-continued
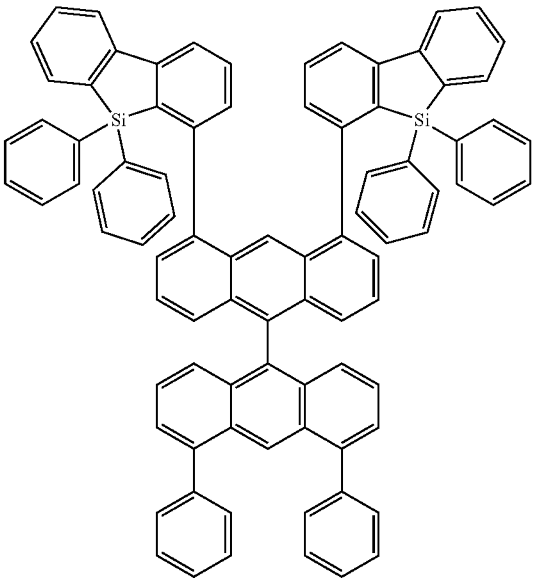
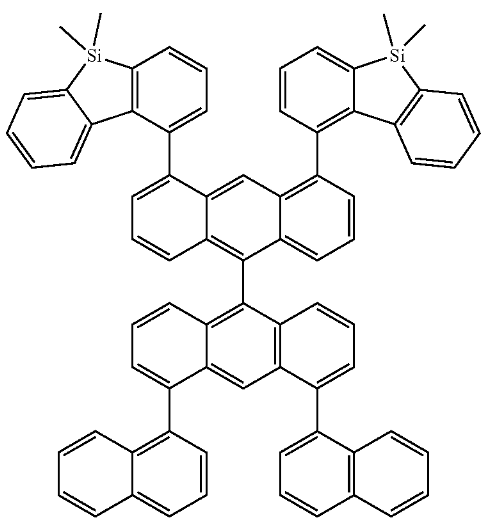
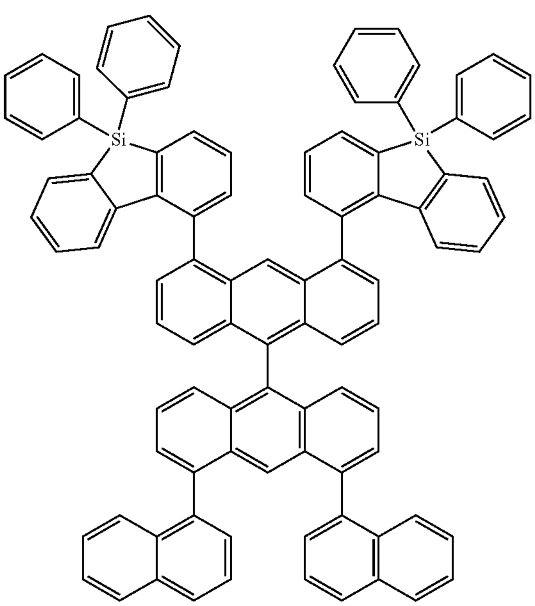
-continued
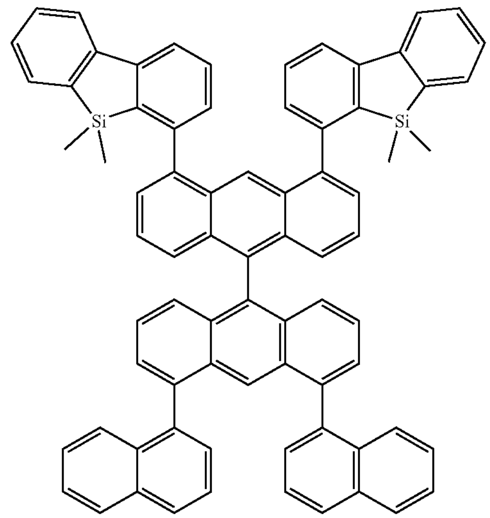
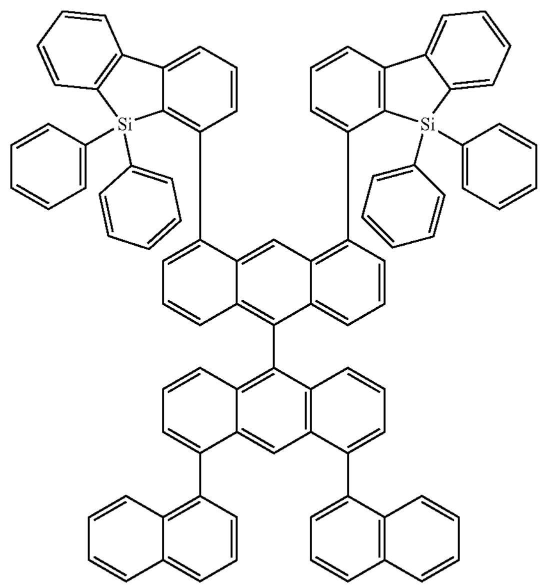
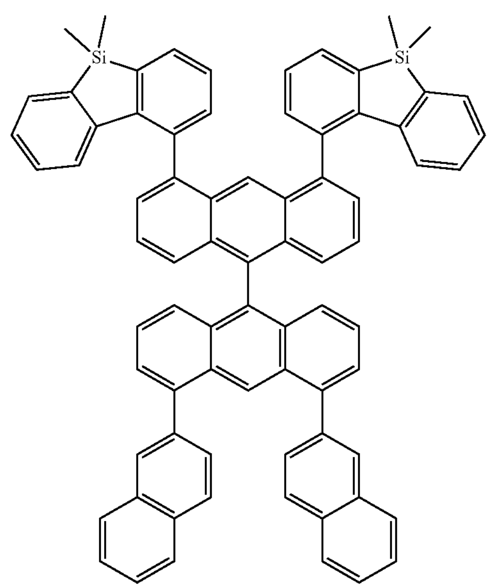

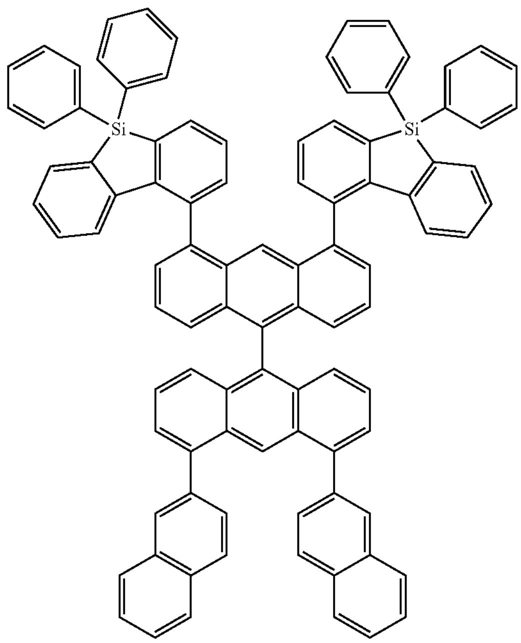
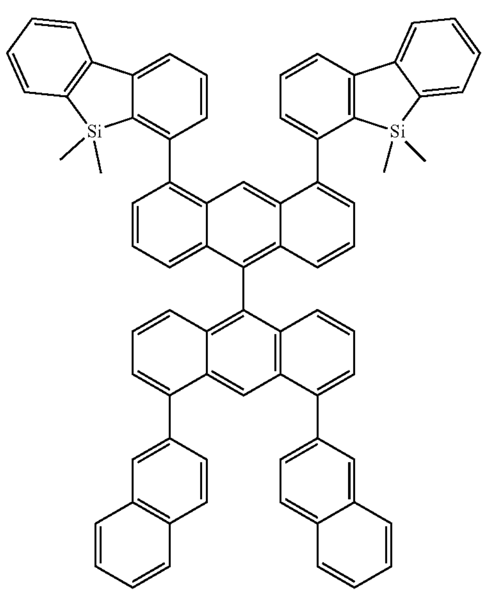
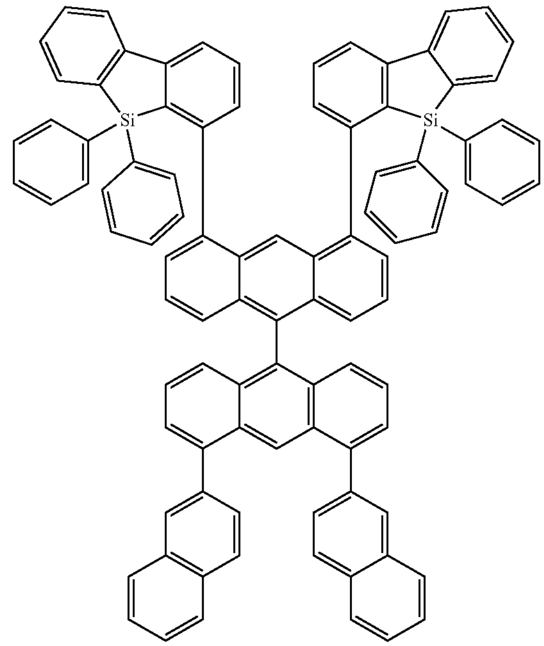
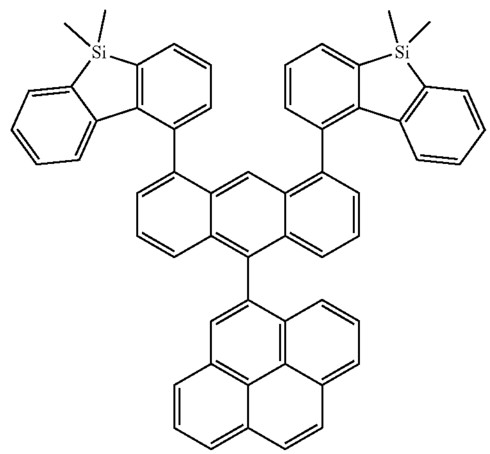
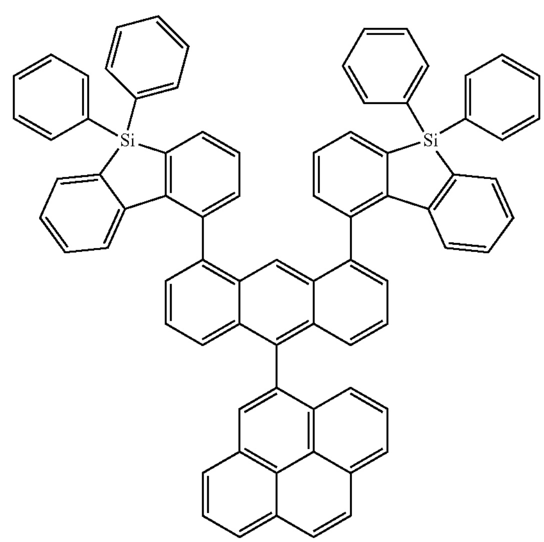

-continued
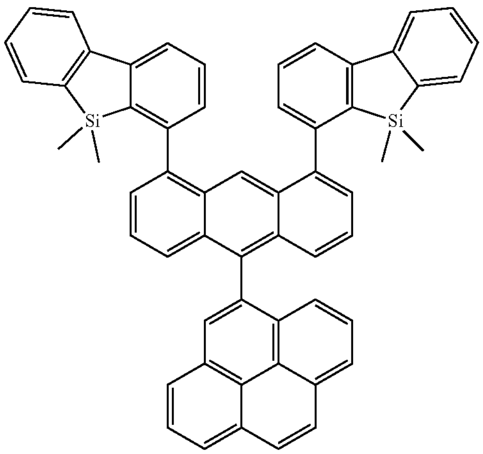
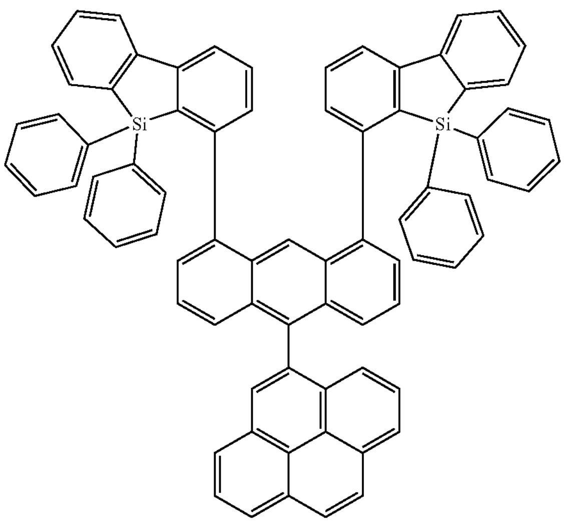 [SMILES: c1ccc([Si]2(c3ccccc3)c3ccccc3-c3cccc(-c4cccc5c(-c6cc7cccc8ccc9cccc6c9c87)c6cccc(-c7cccc8c7[Si](c7ccccc7)(c7ccccc7)c7ccccc7-8)c6cc45)c32)cc1]
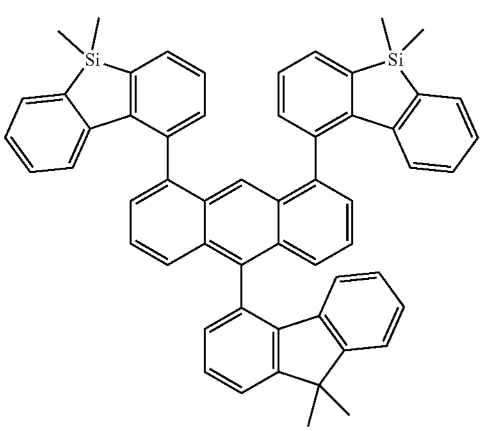
-continued
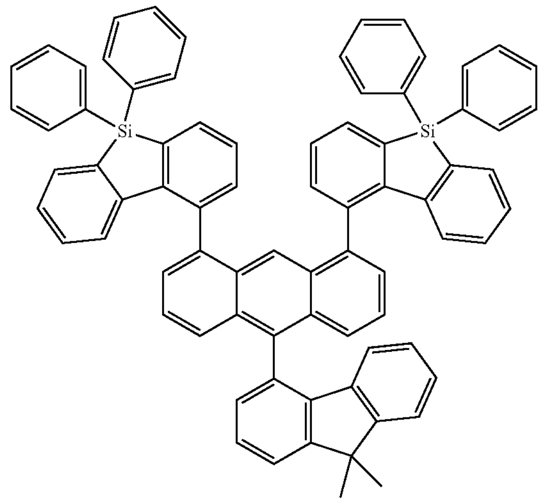
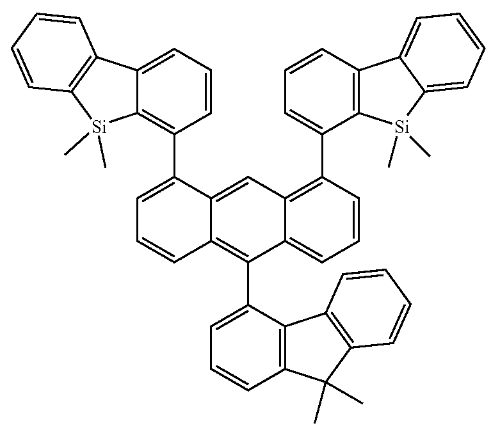
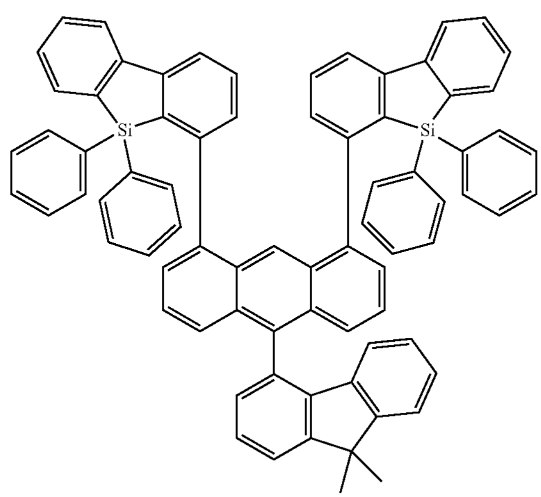

-continued
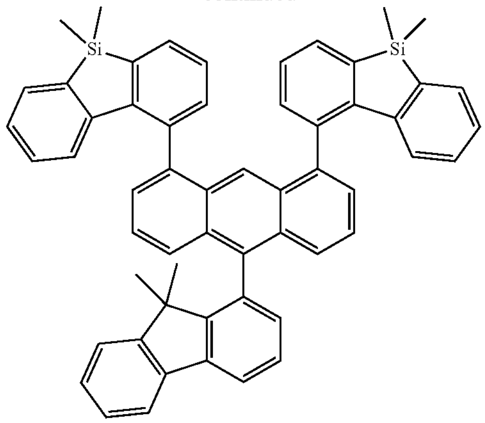
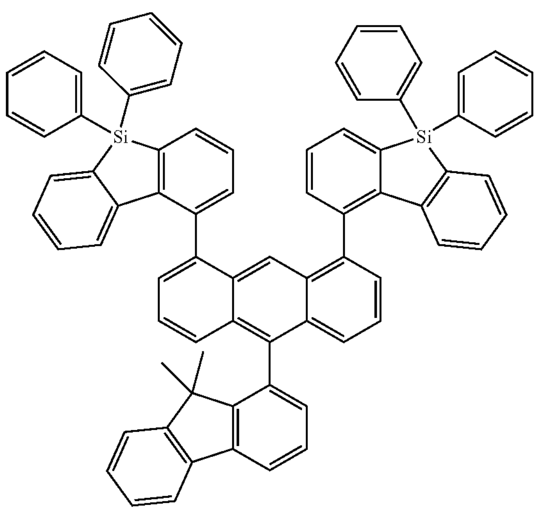
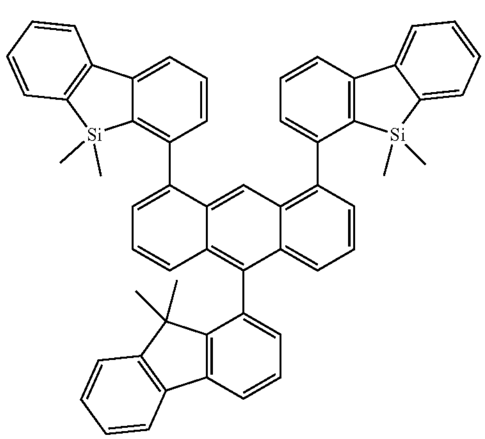
-continued
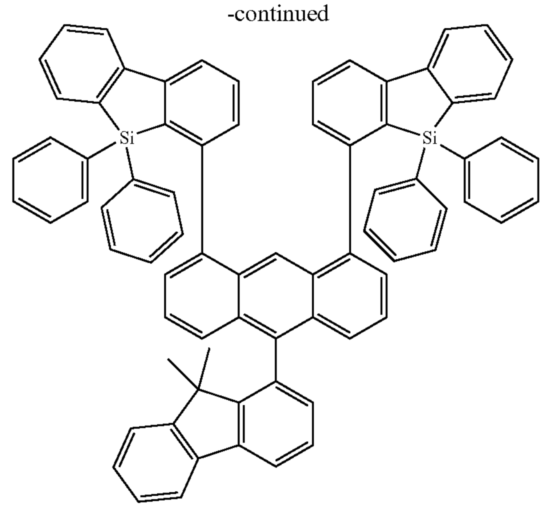
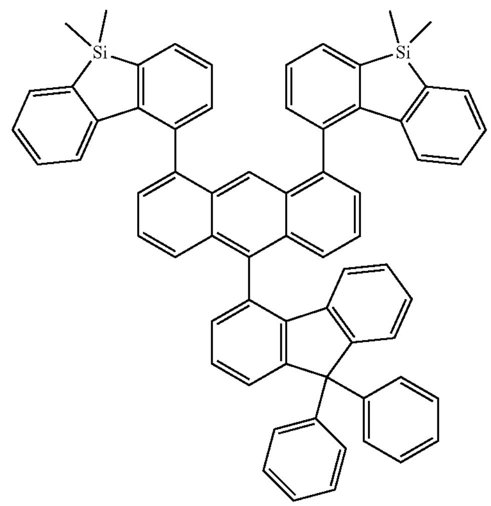
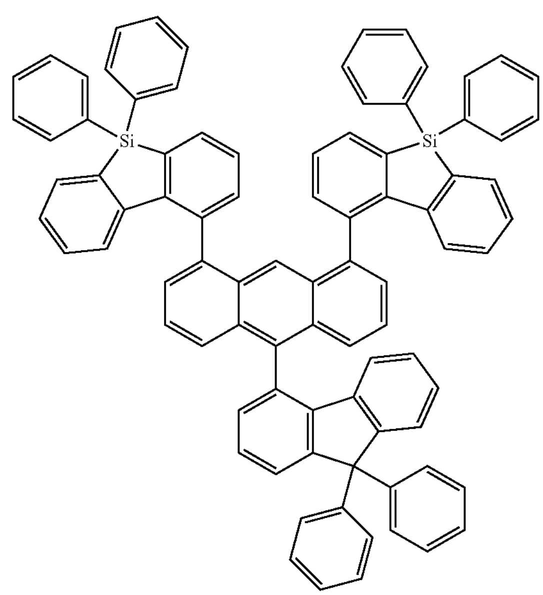

-continued
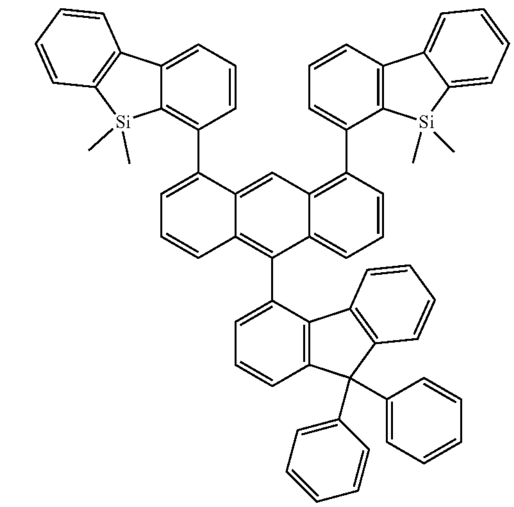
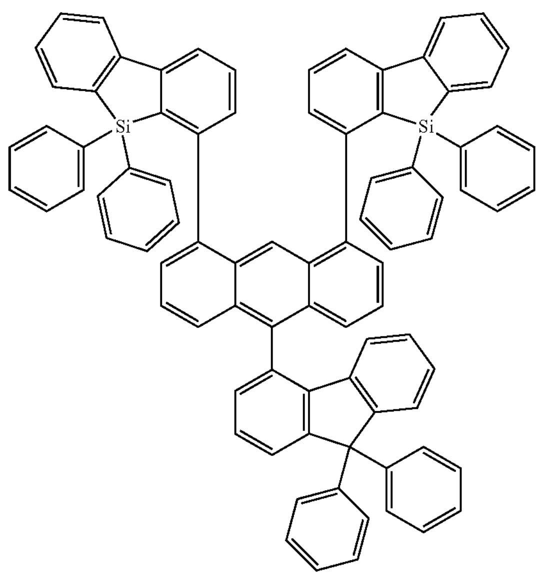
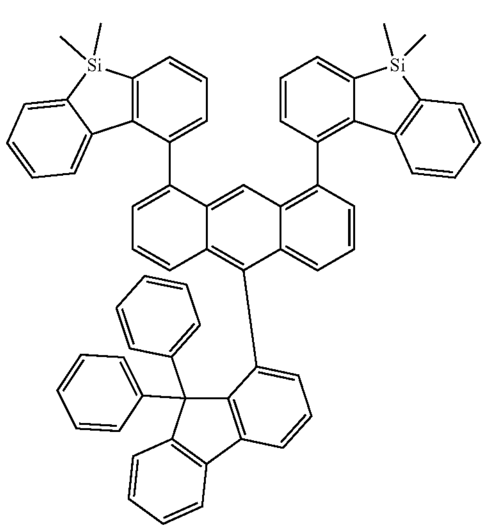
-continued
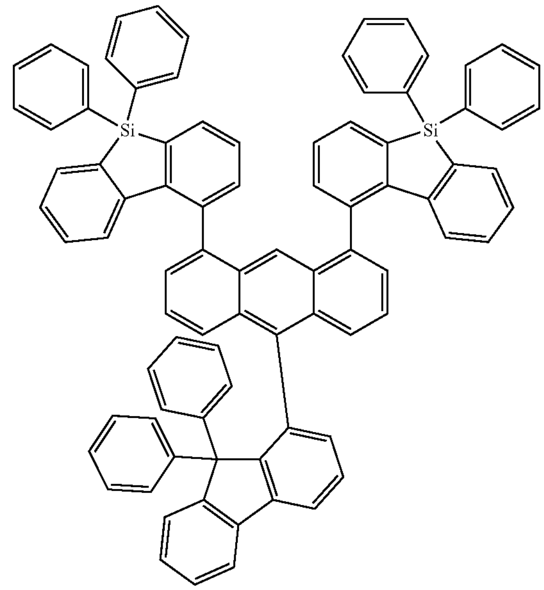
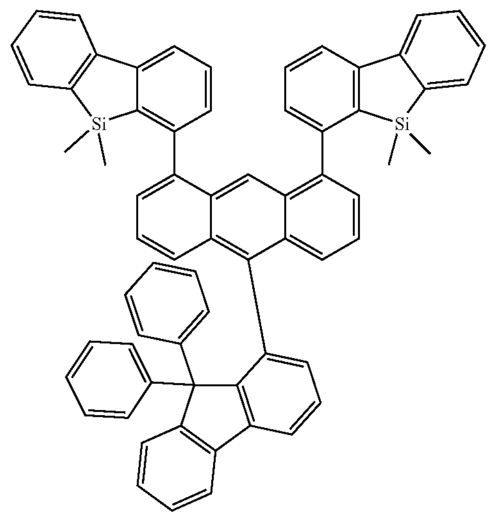
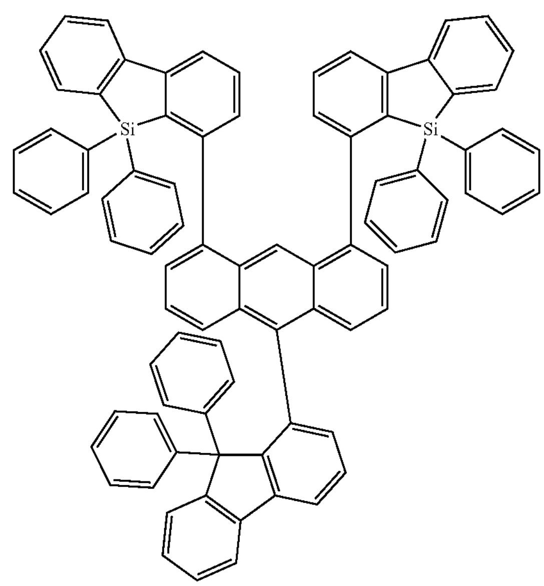

-continued
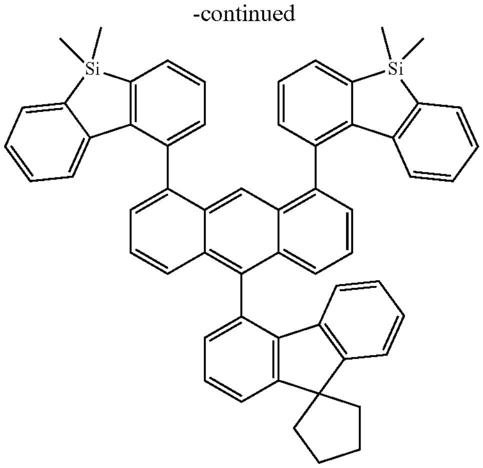
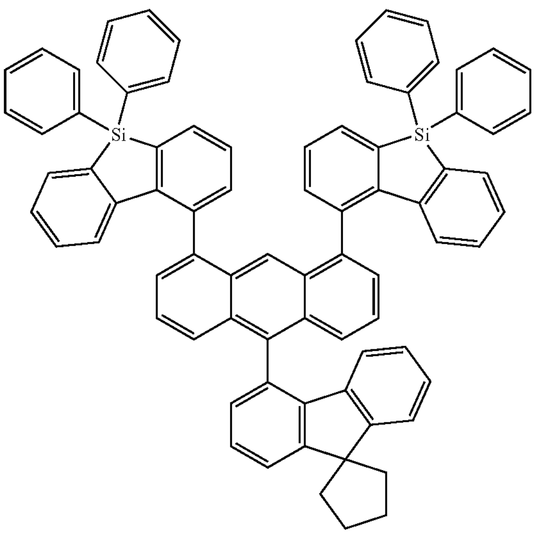
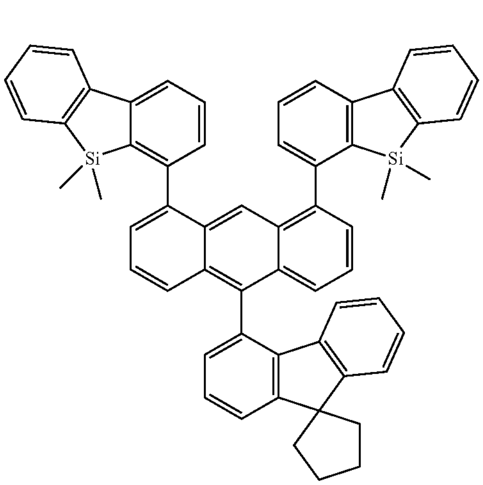
-continued
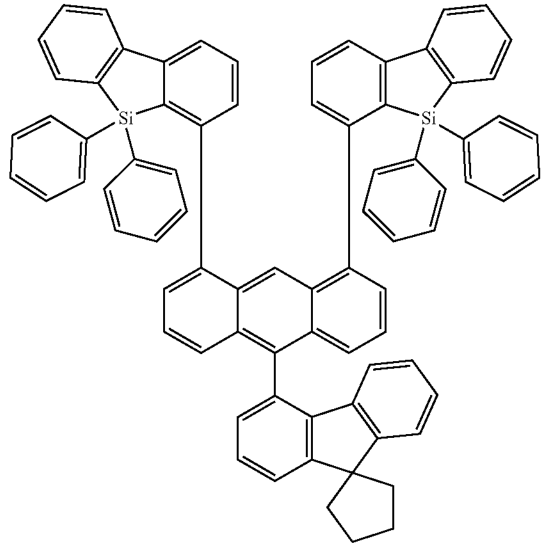
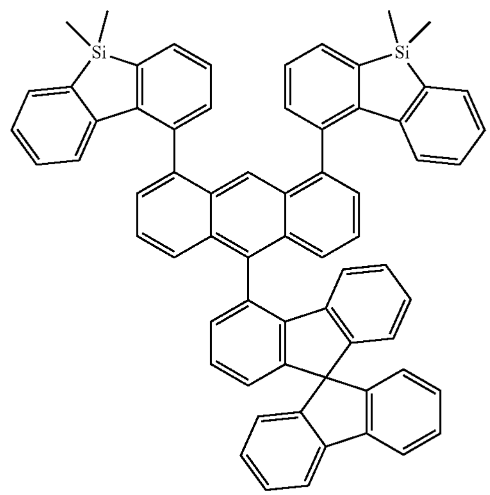
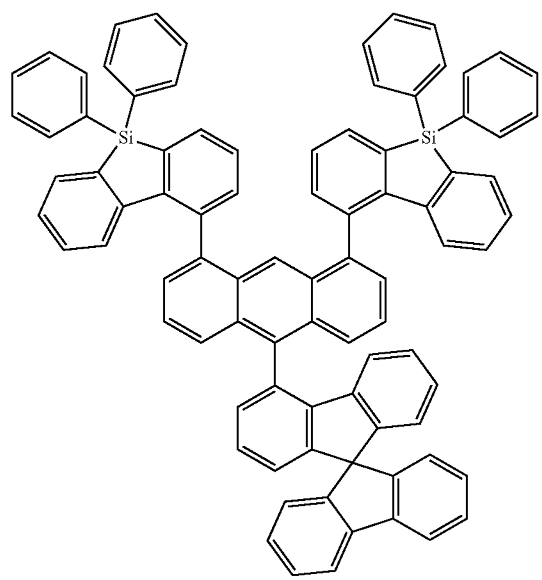

-continued
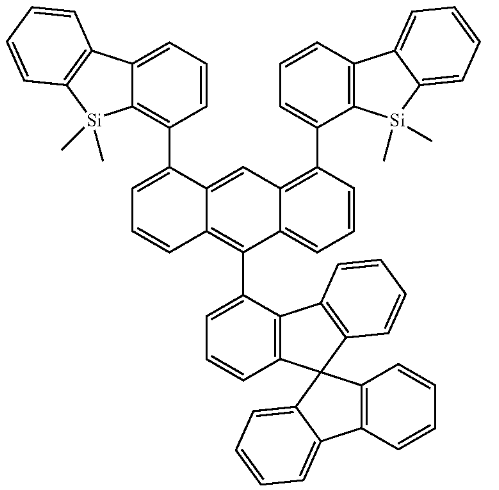
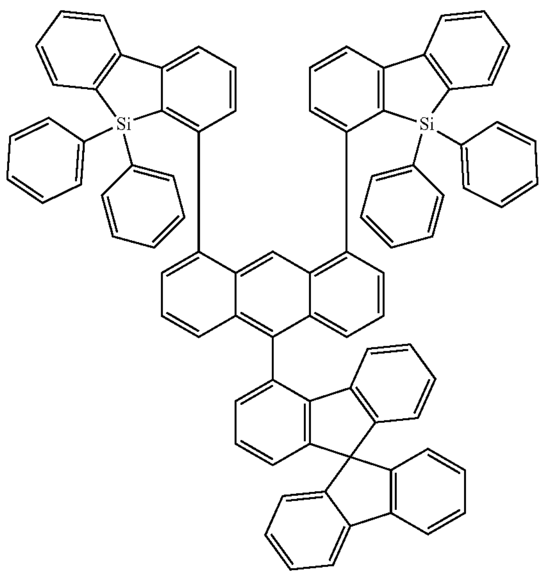
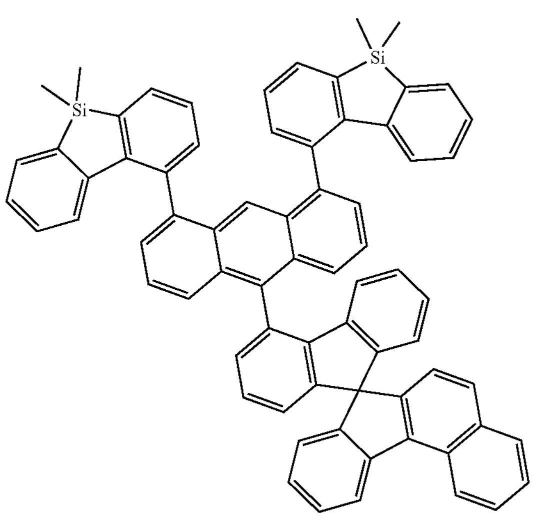
-continued
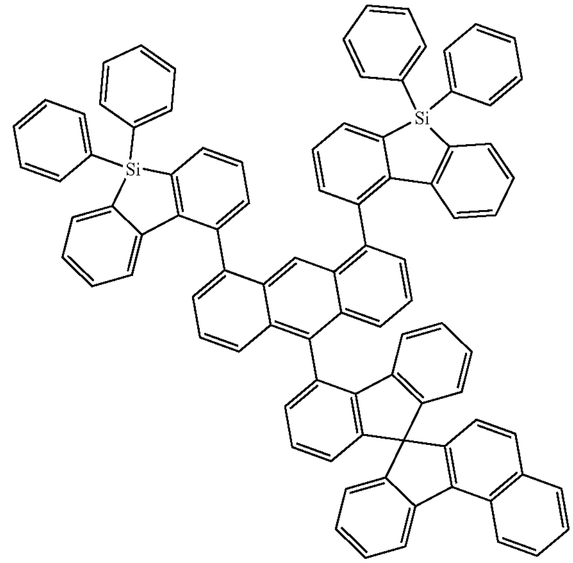
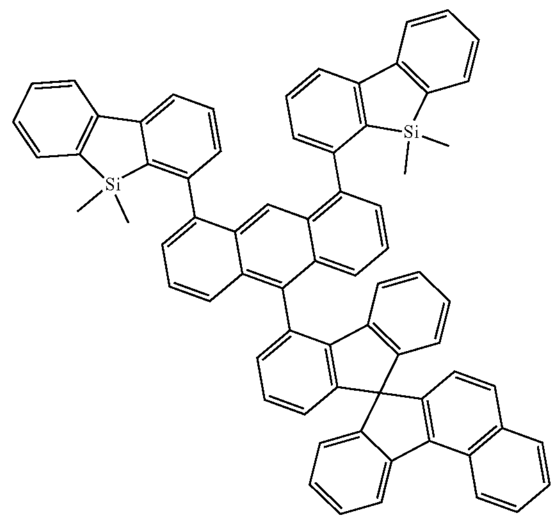
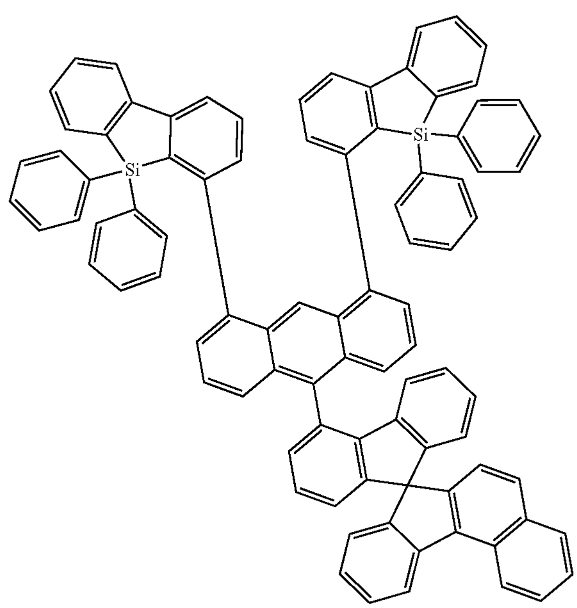

-continued
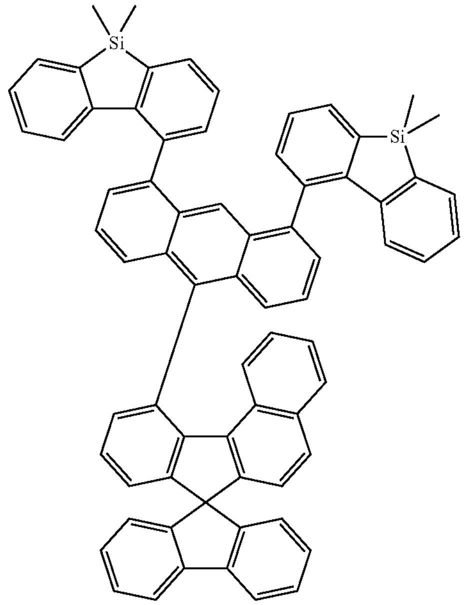
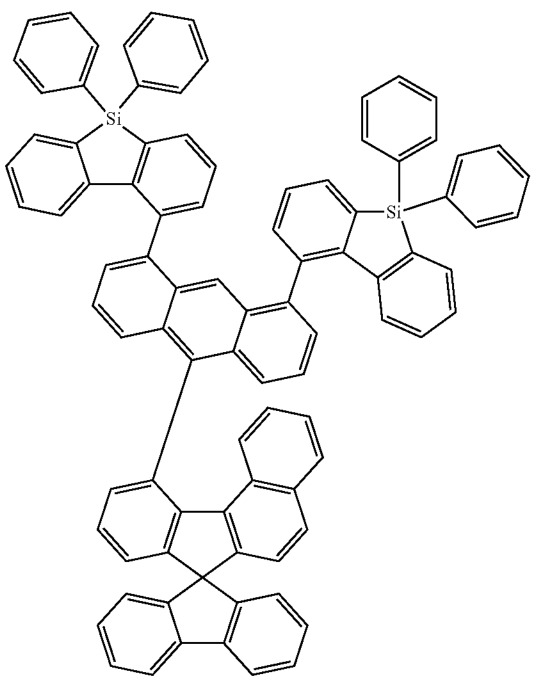
-continued
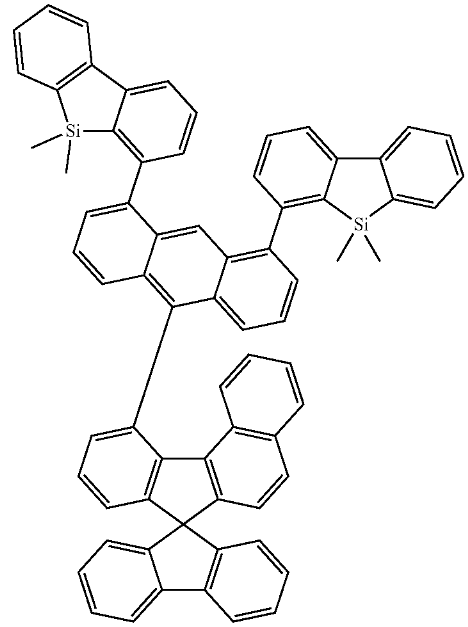
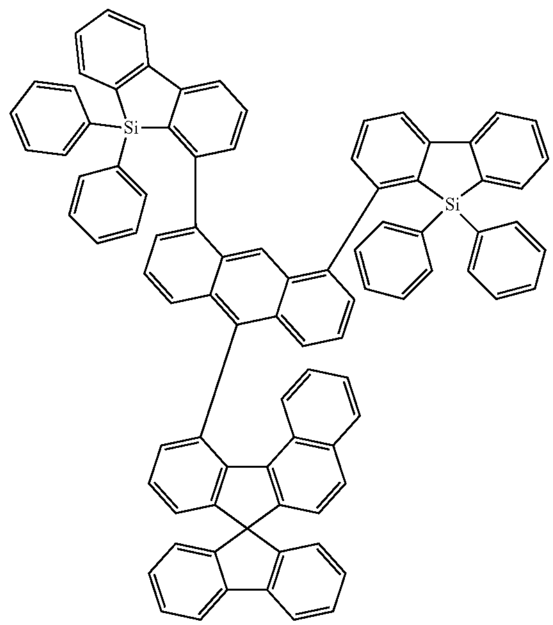
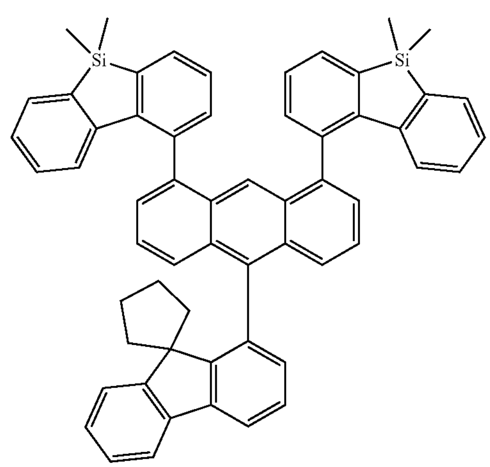

-continued
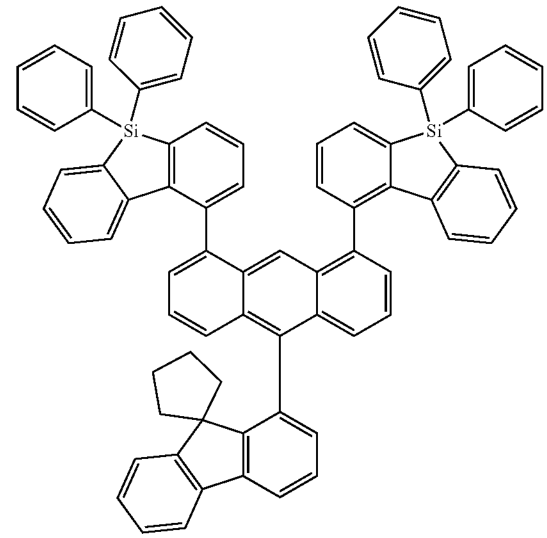
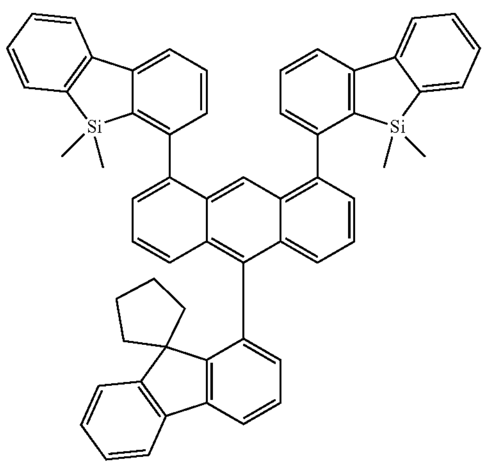
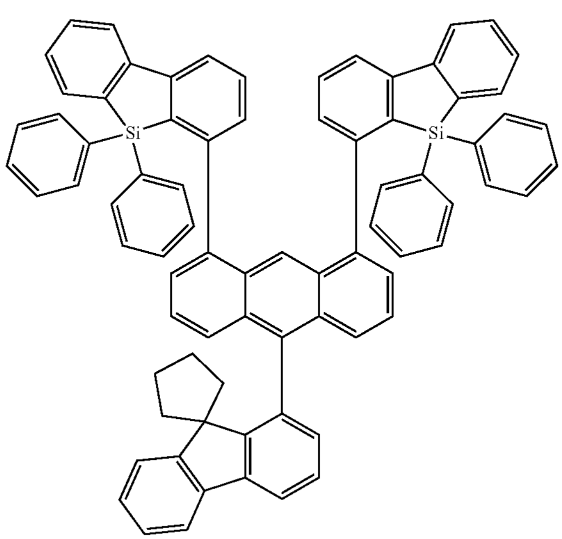
-continued
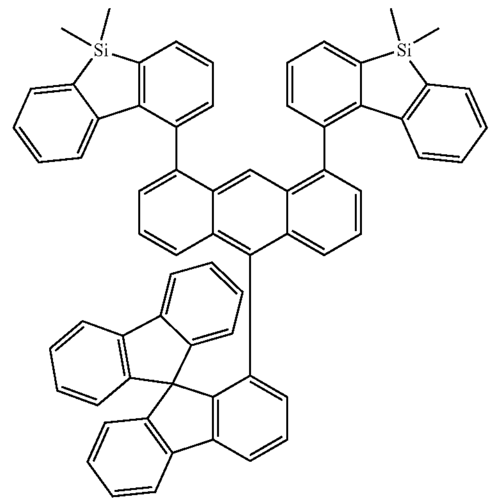
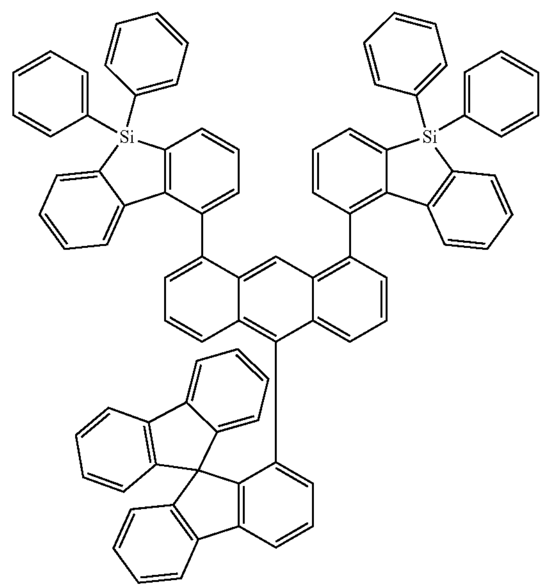
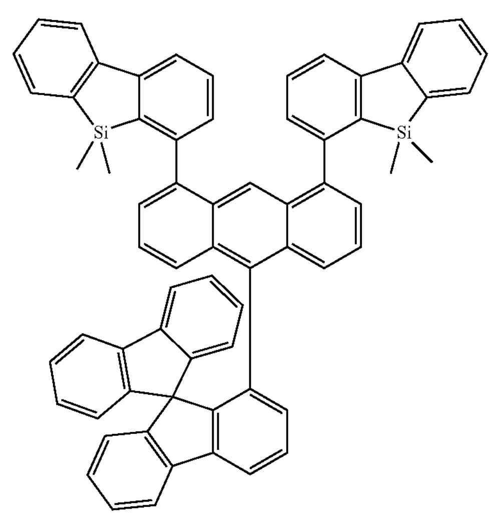

-continued
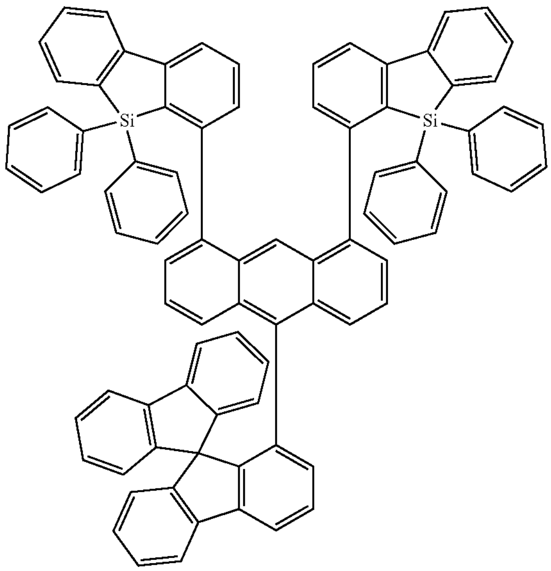
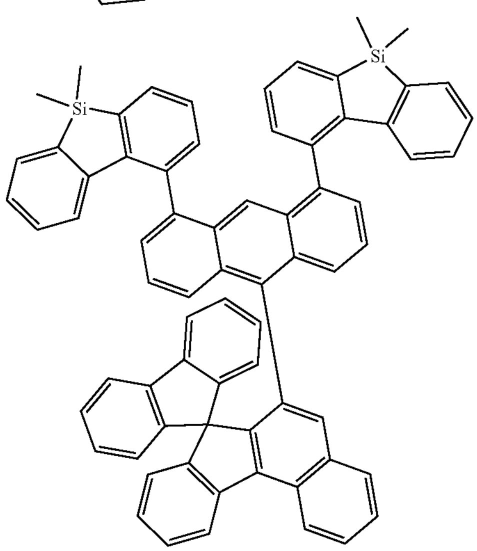
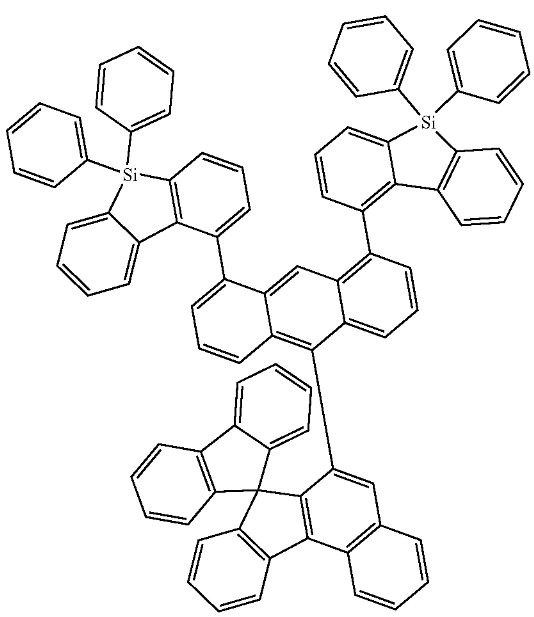
-continued
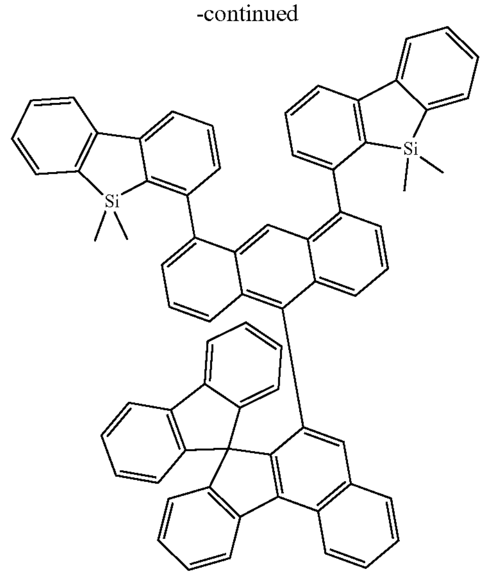
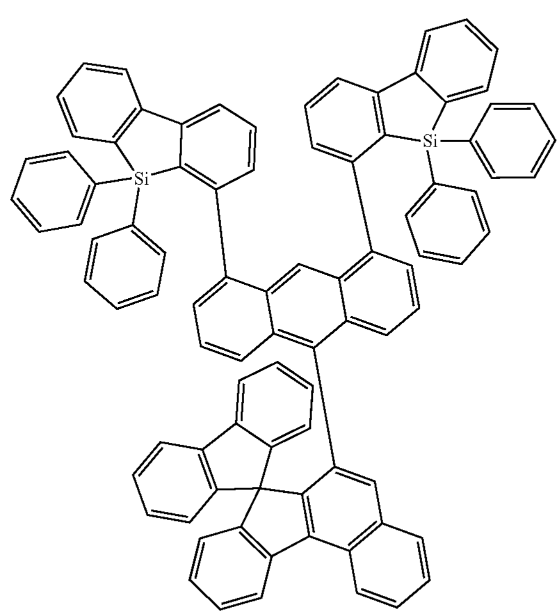

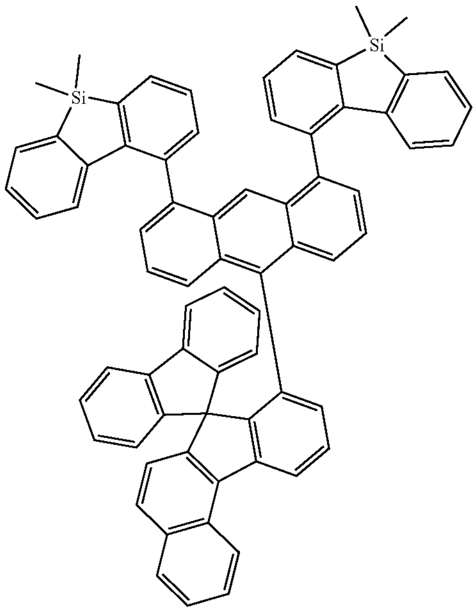
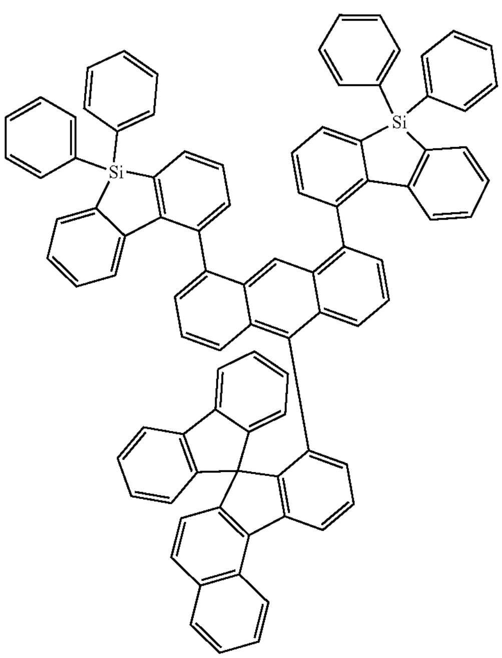
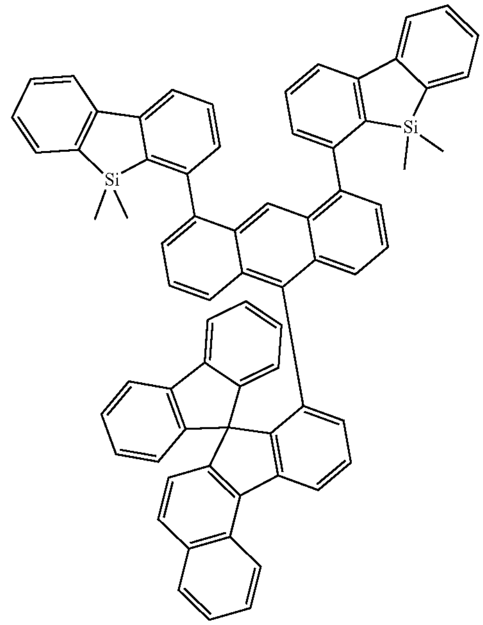
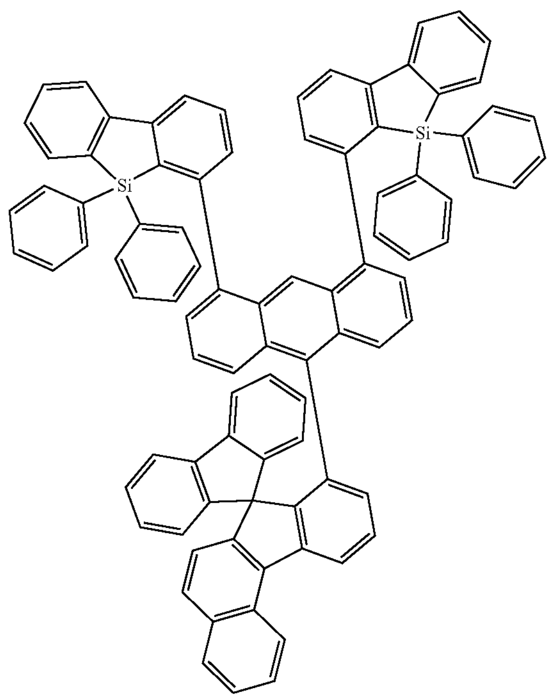

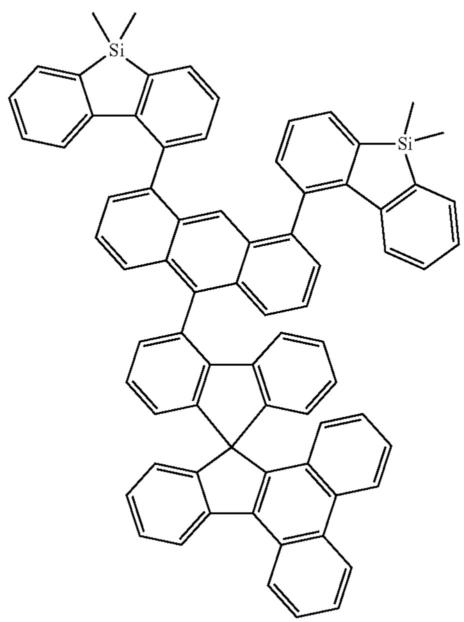
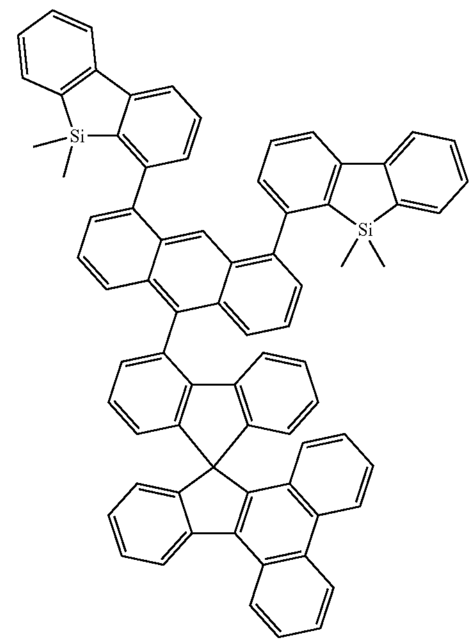
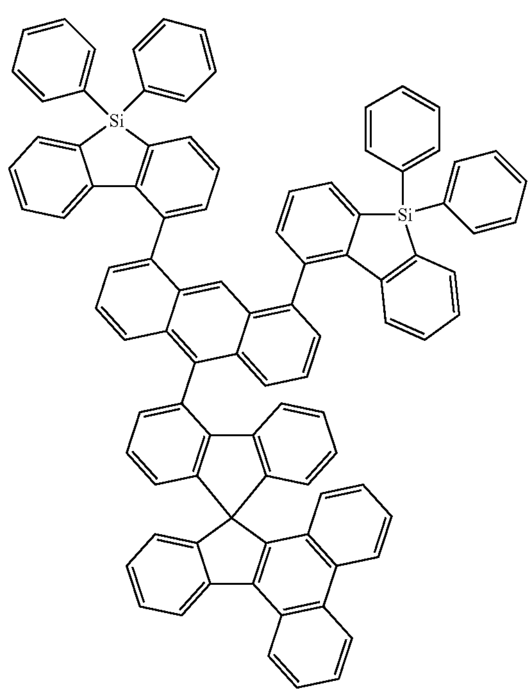
Si
Si
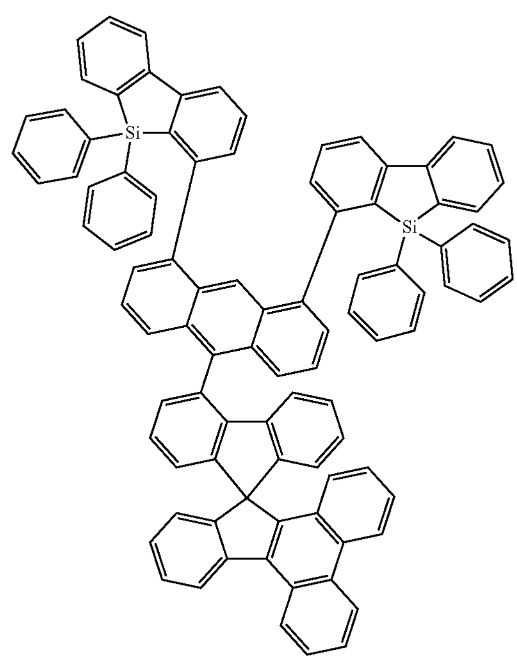
Si
Si

-continued
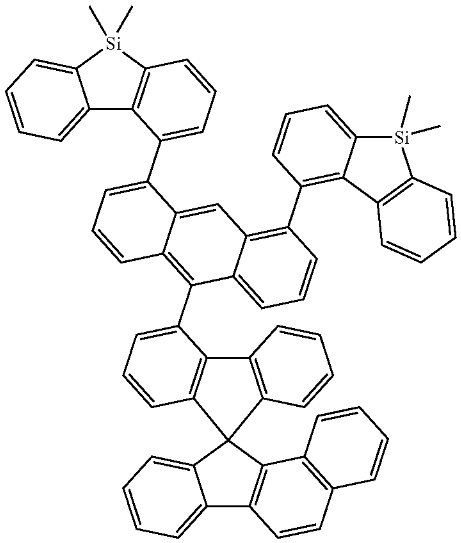
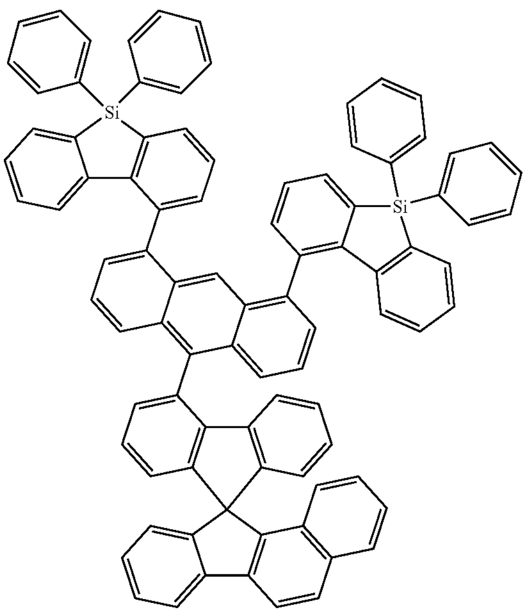
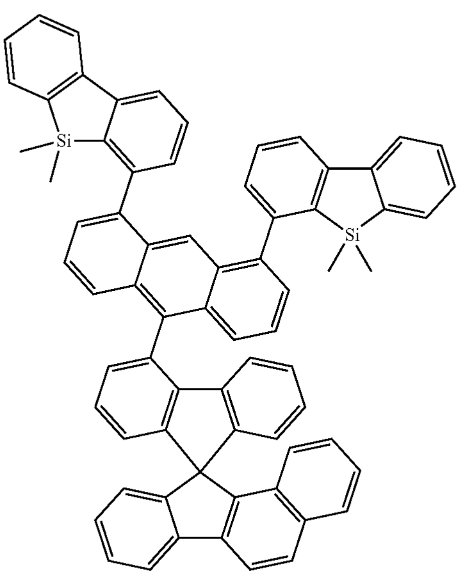
-continued
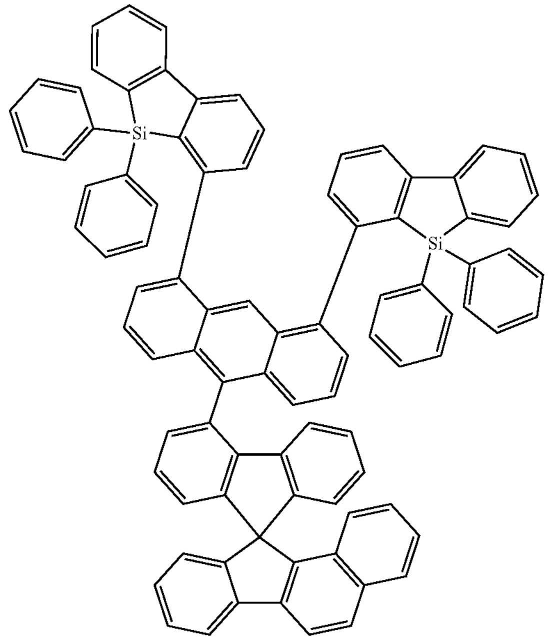
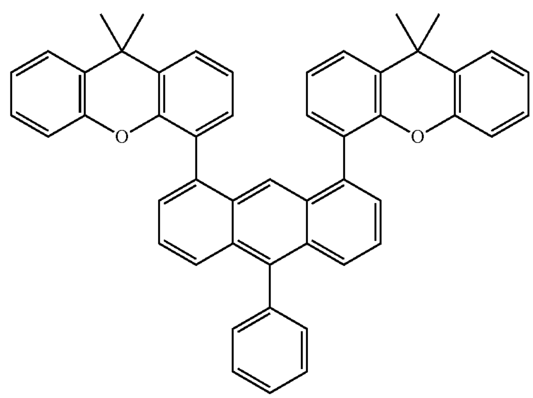
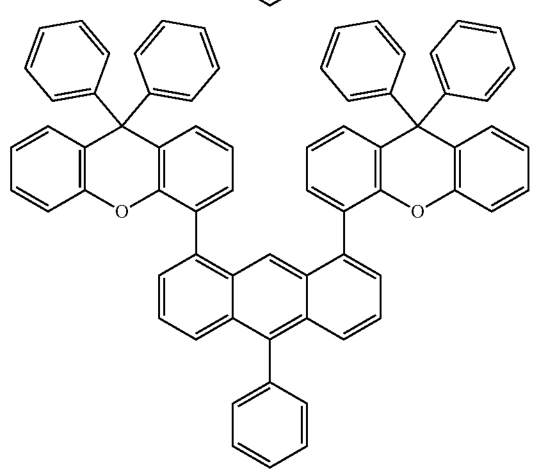

-continued
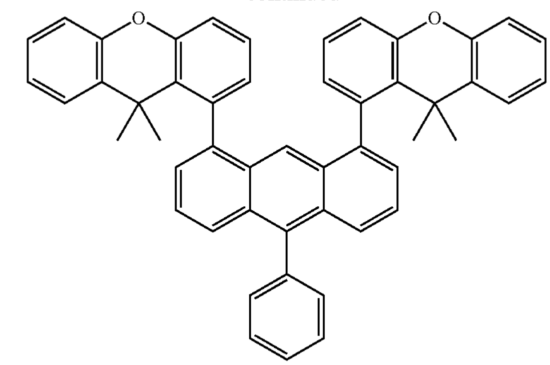
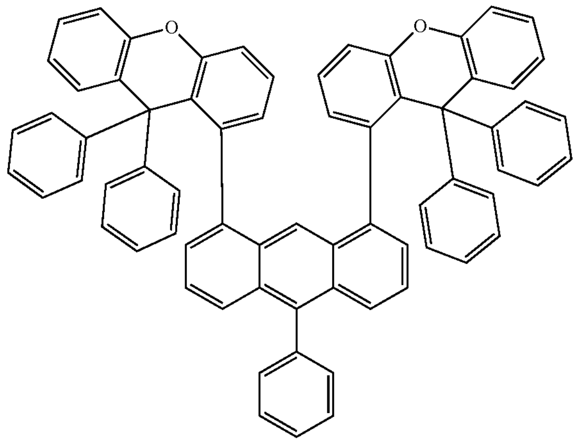
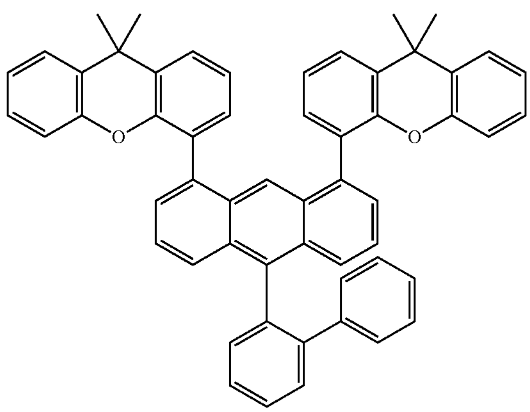
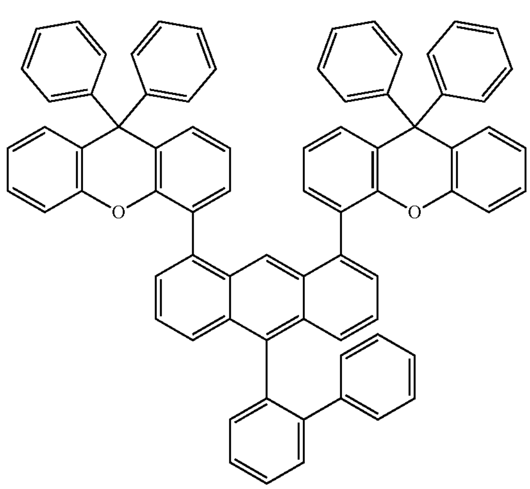
-continued
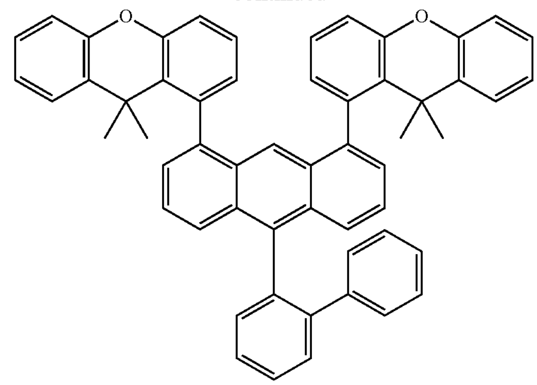
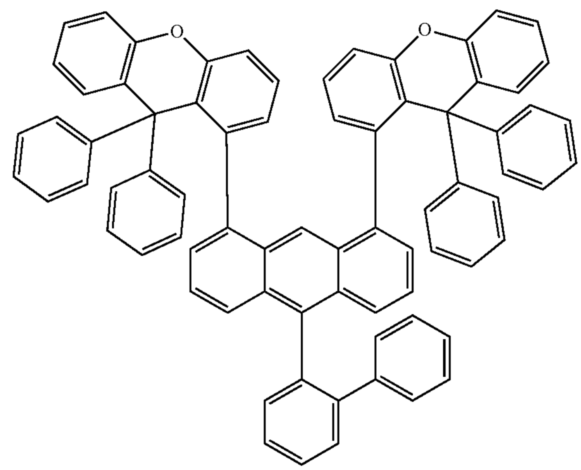
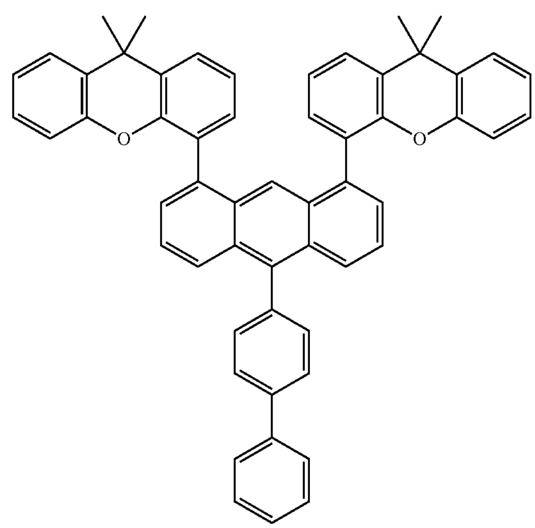

-continued
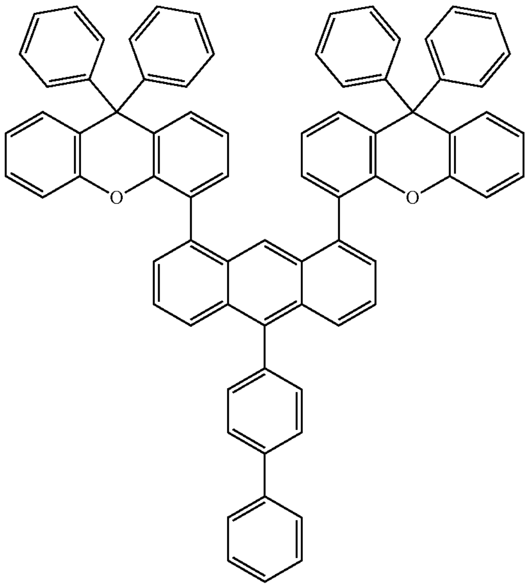
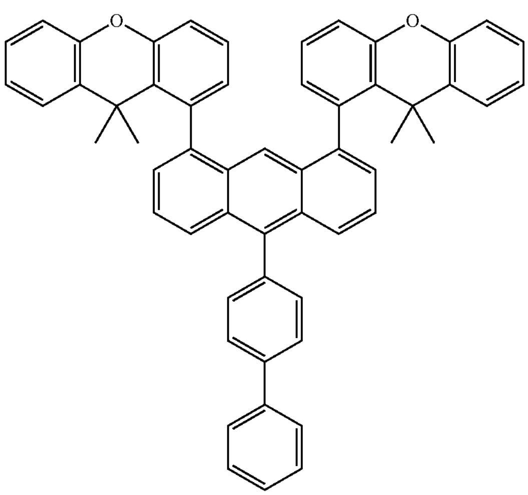
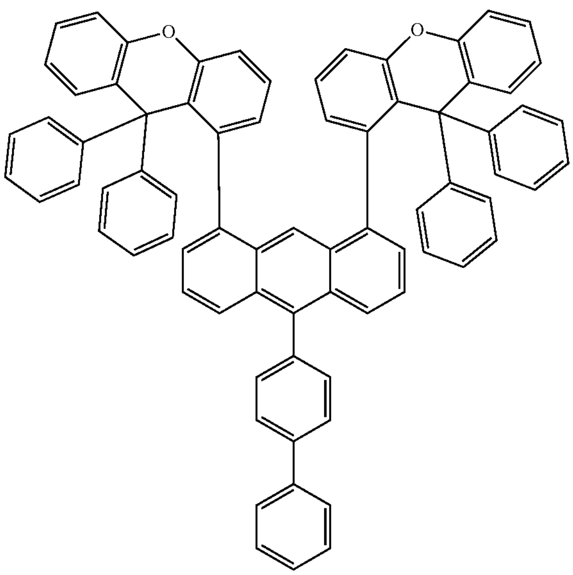
-continued
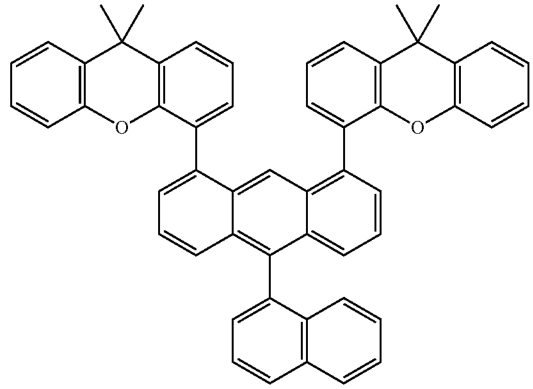
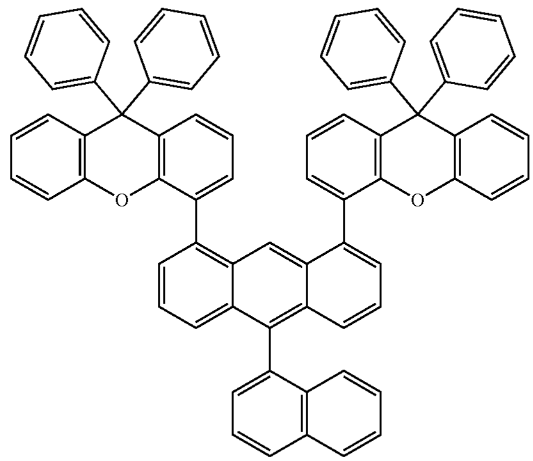
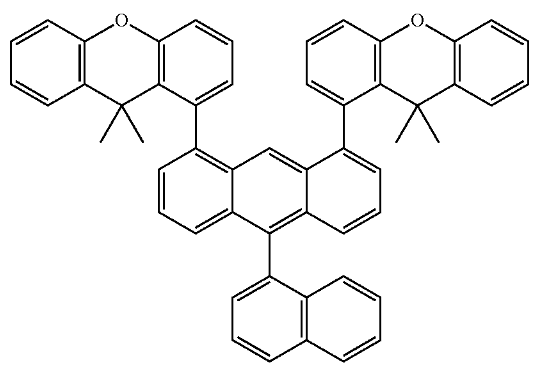
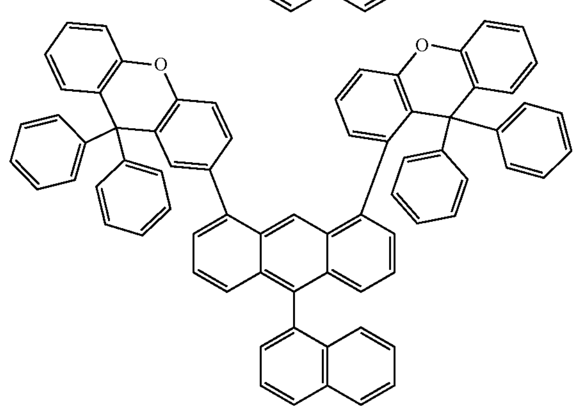

-continued
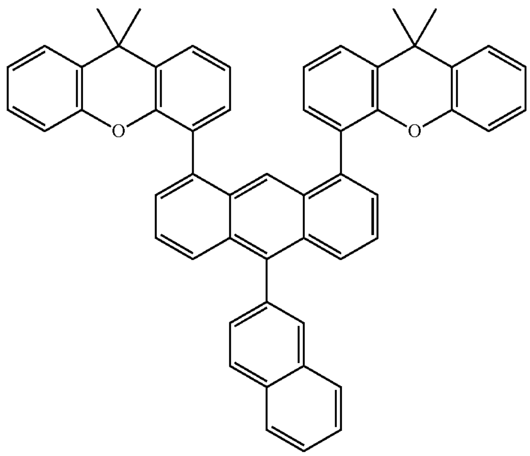
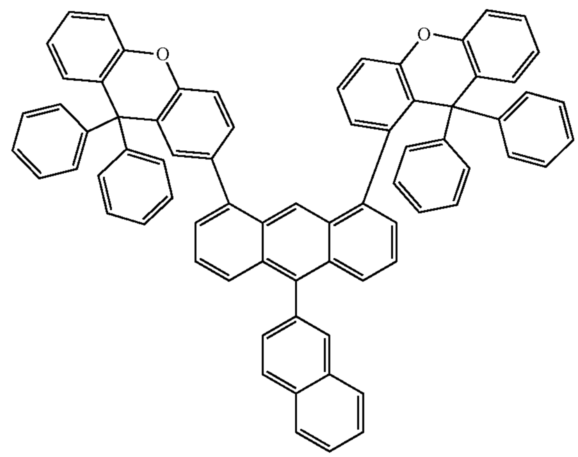
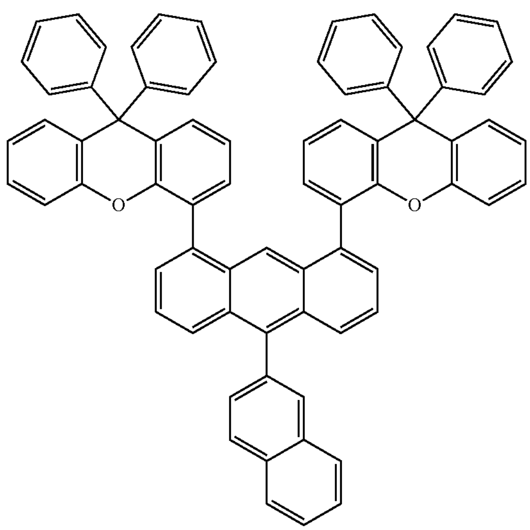
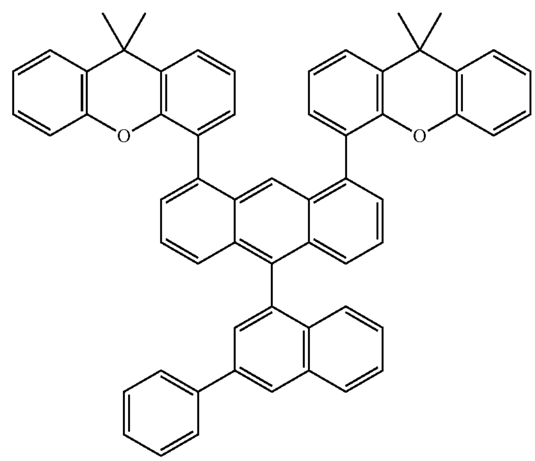
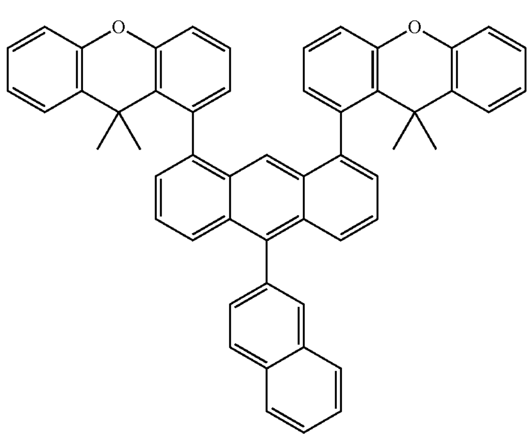
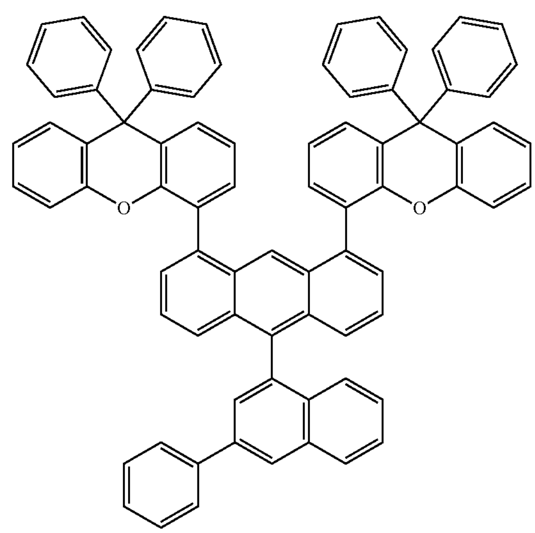
-continued -continued
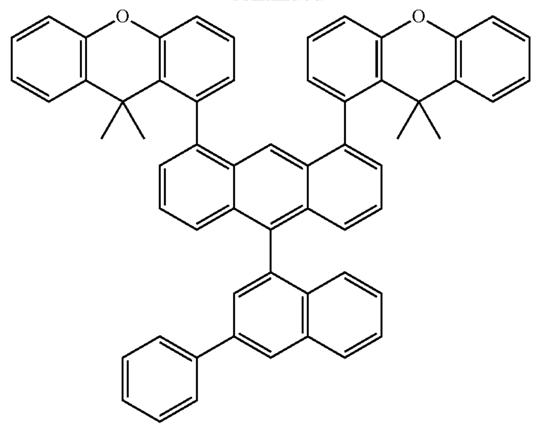
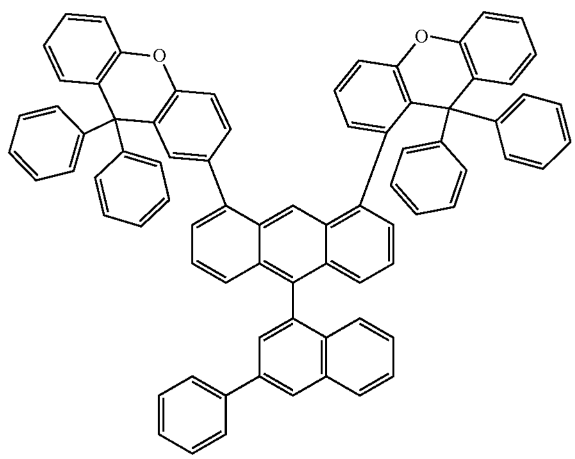
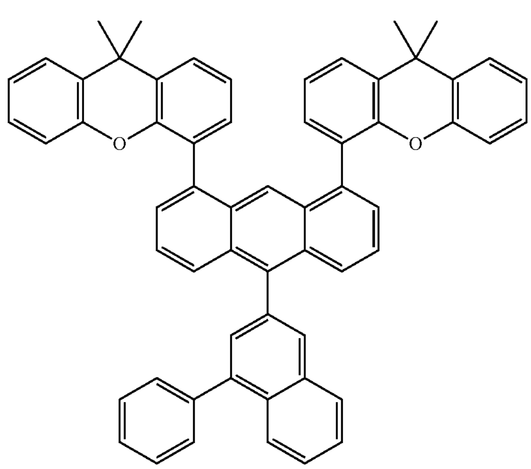
-continued
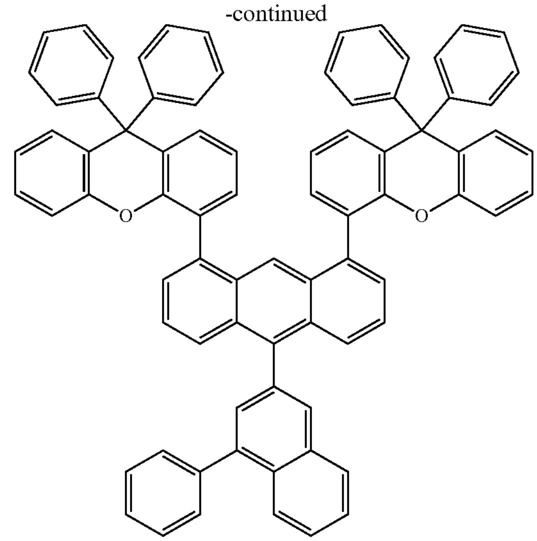
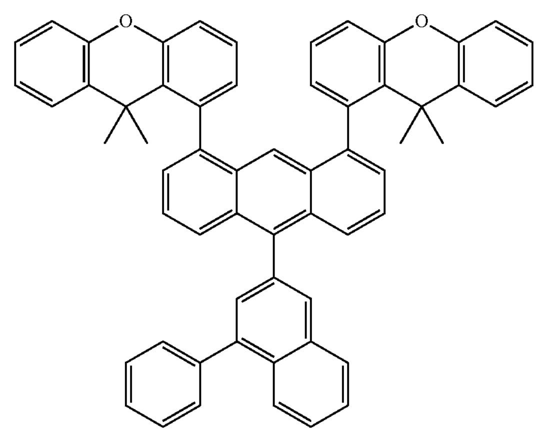
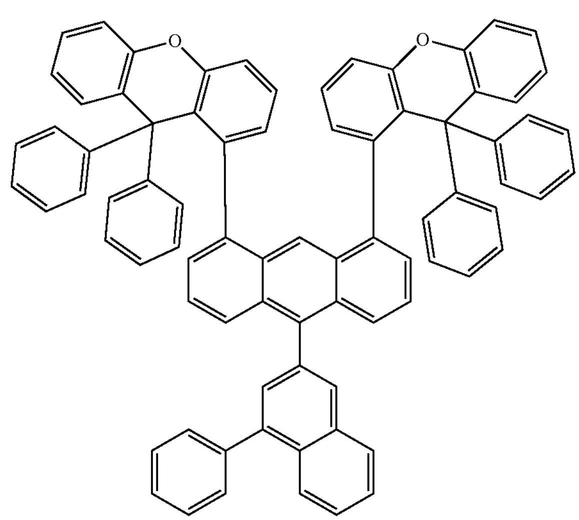

-continued
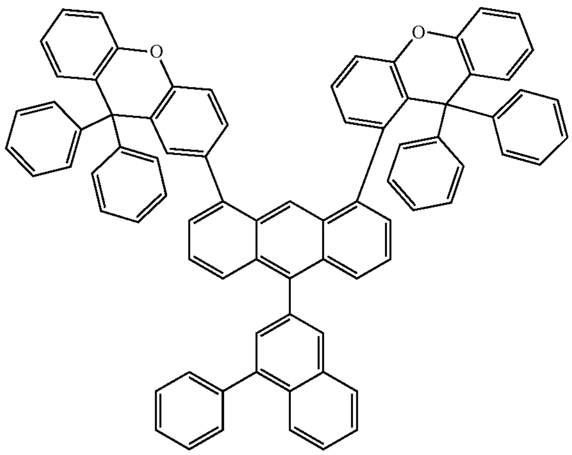
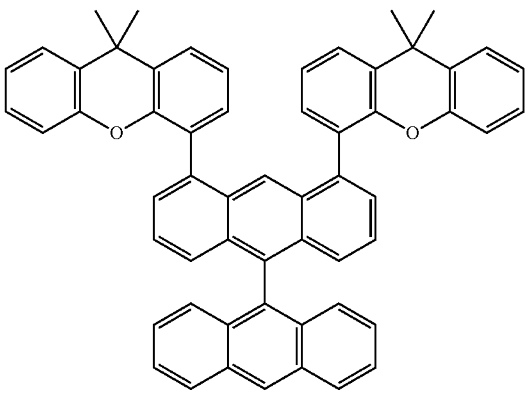
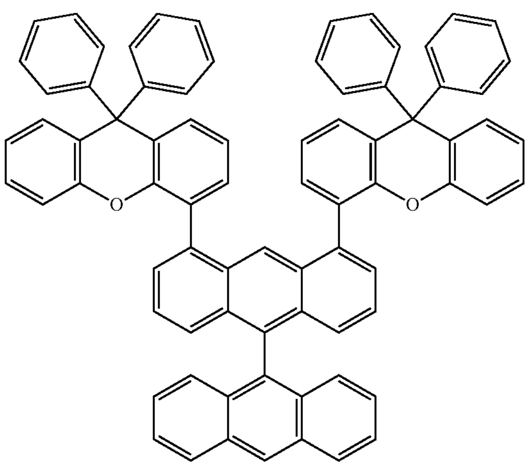
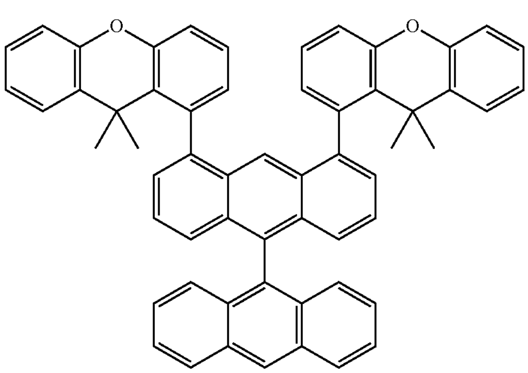
-continued
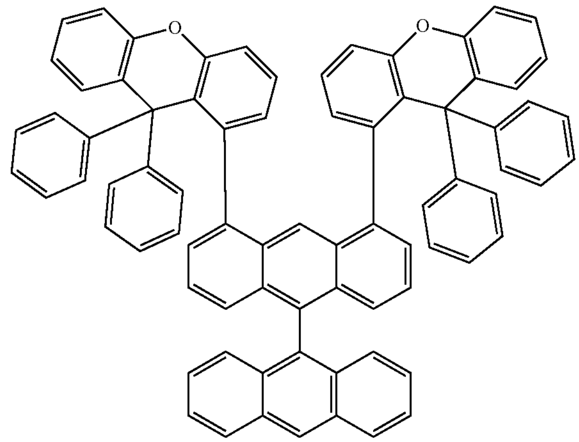
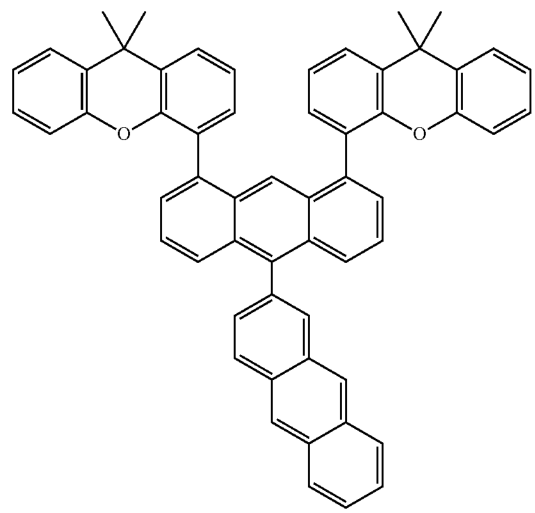
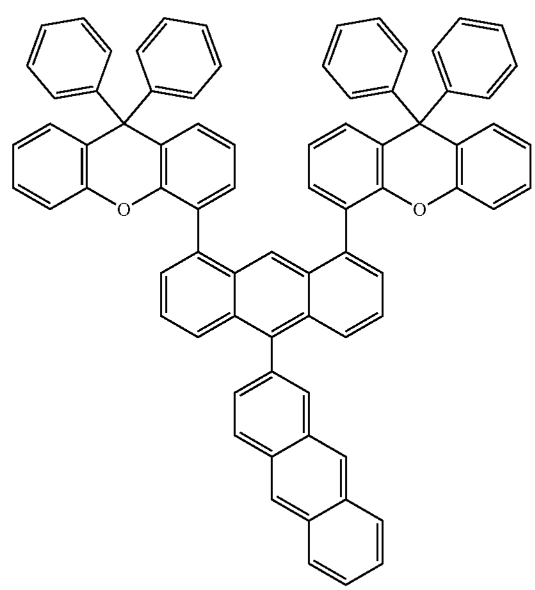

-continued
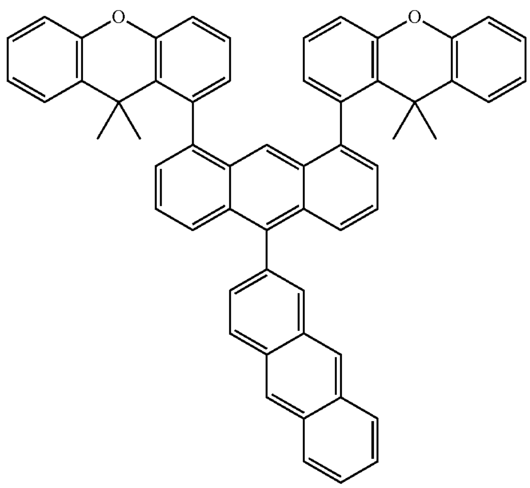
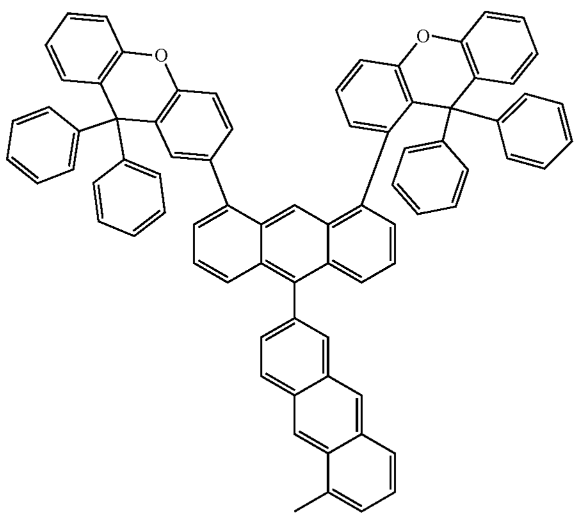
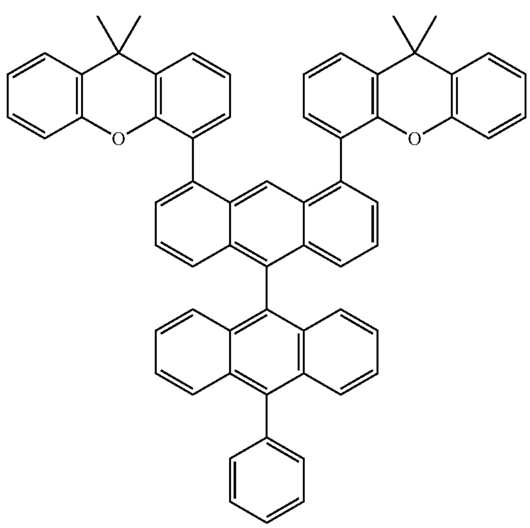
-continued
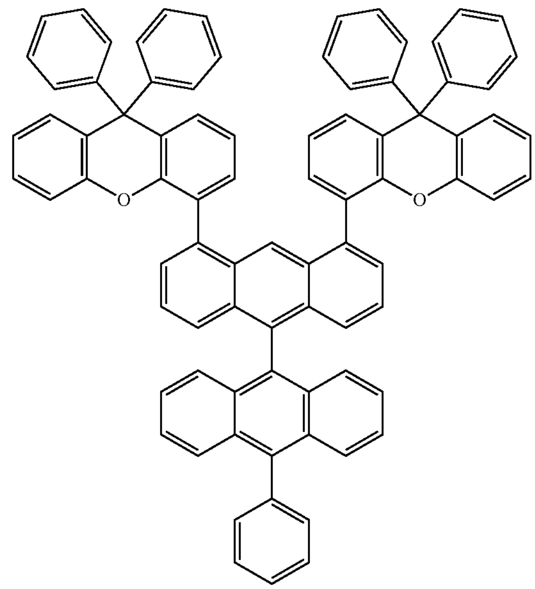
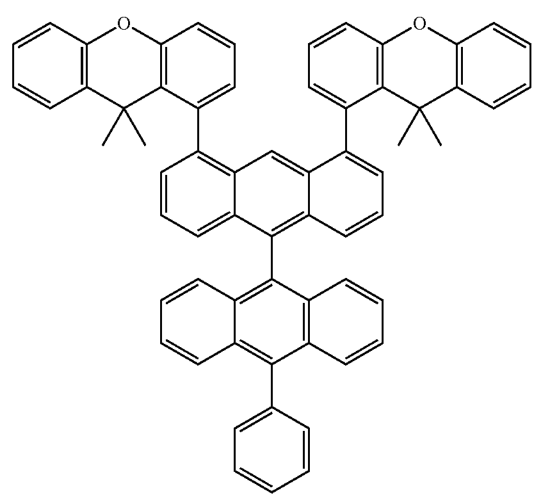
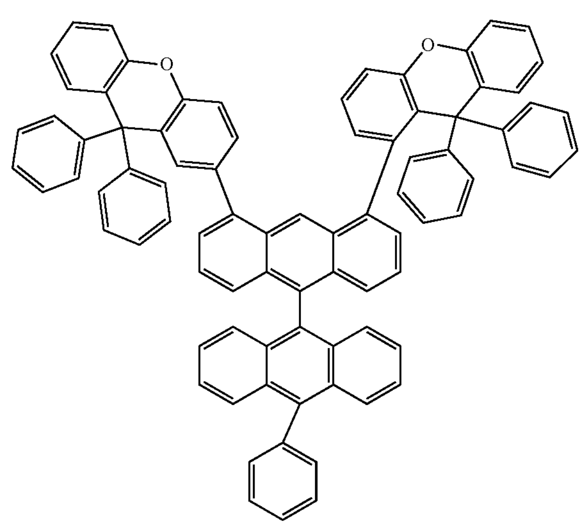

-continued
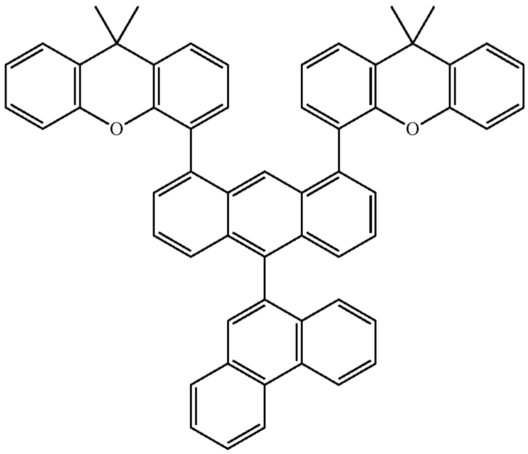
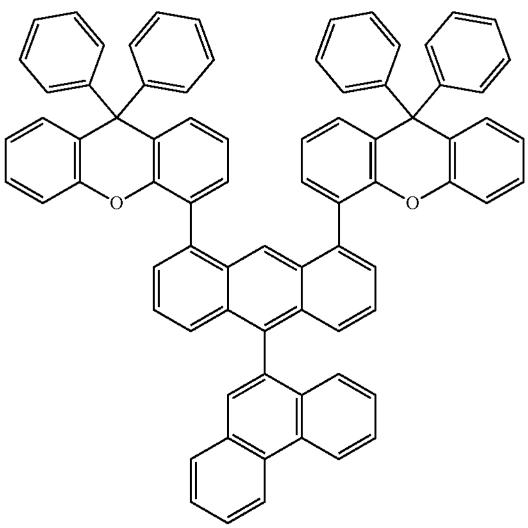
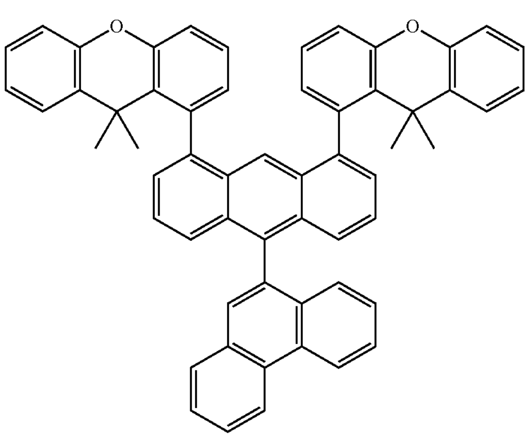
-continued
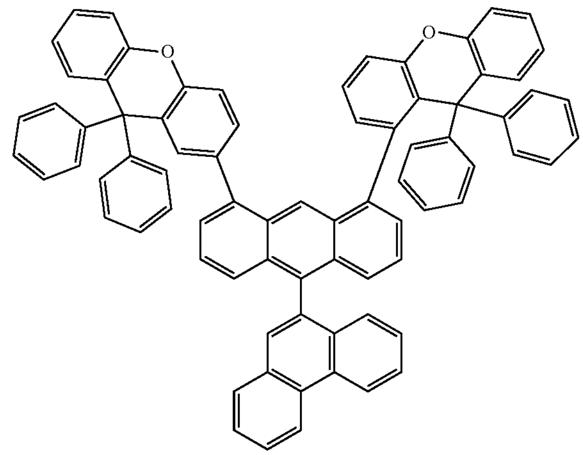
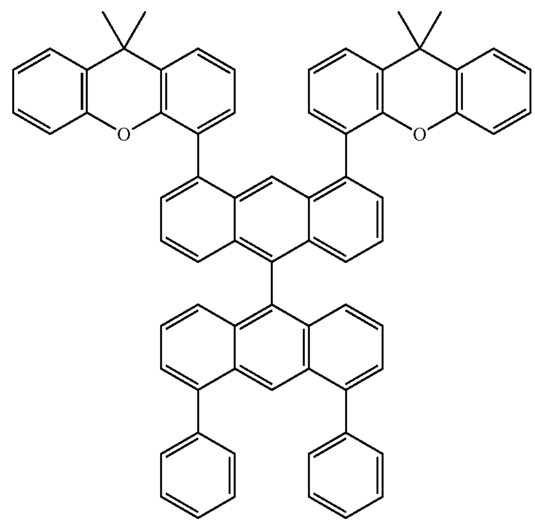
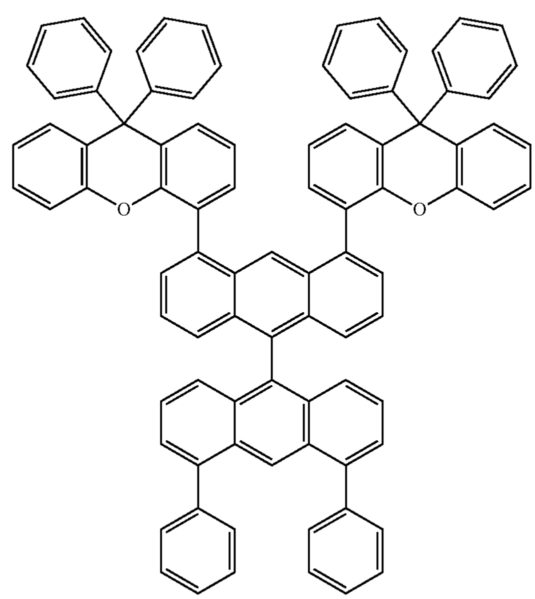

-continued
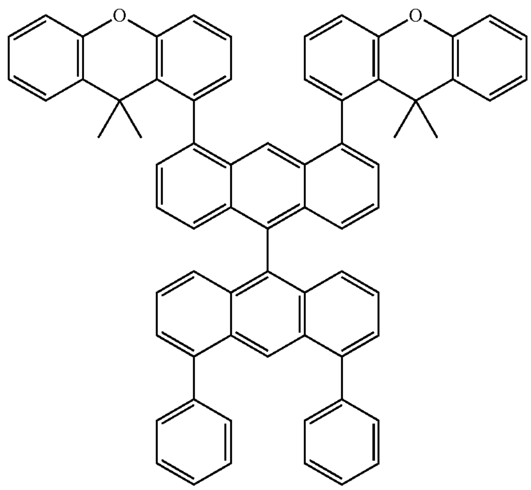
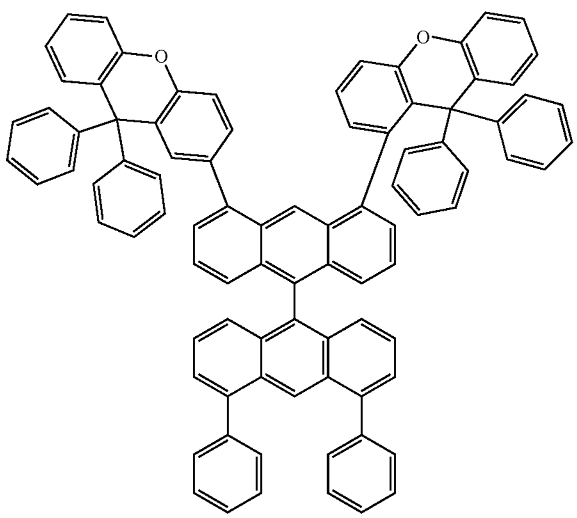
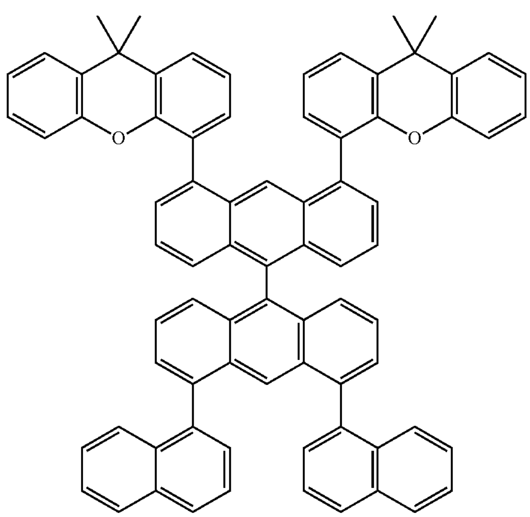
-continued
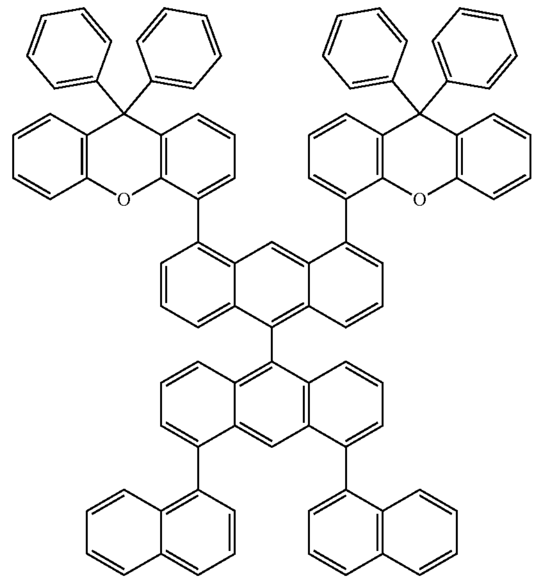
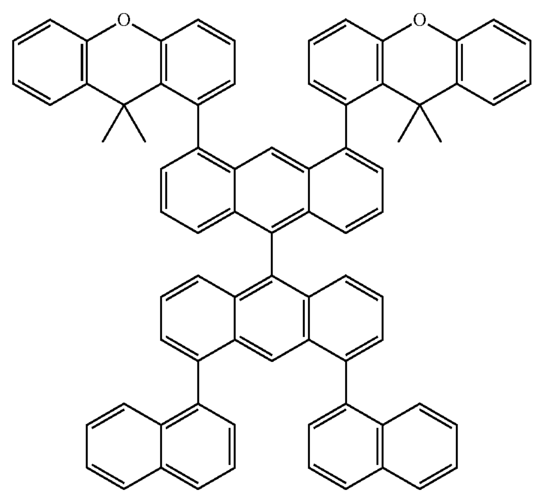
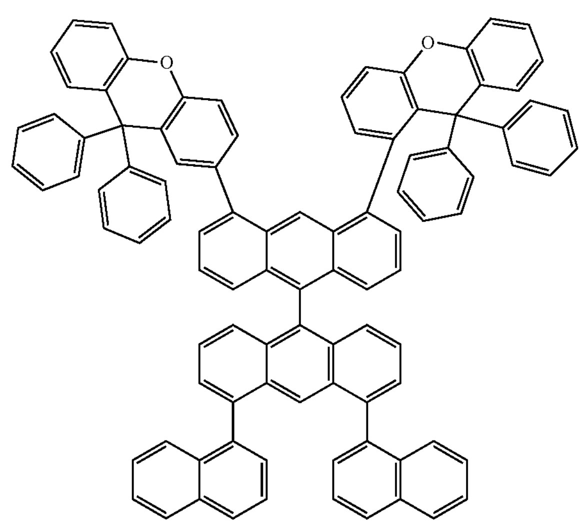

-continued
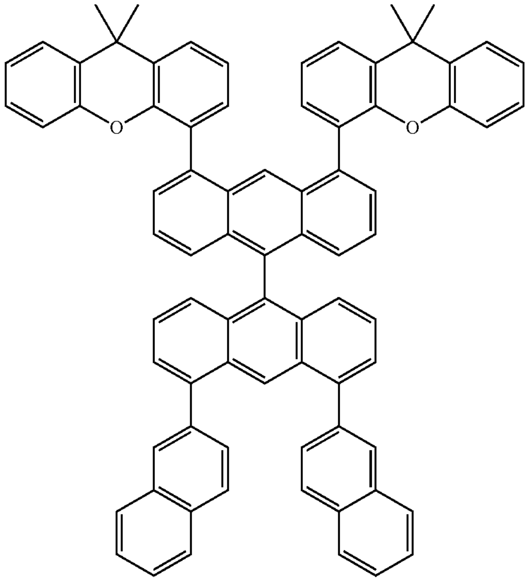
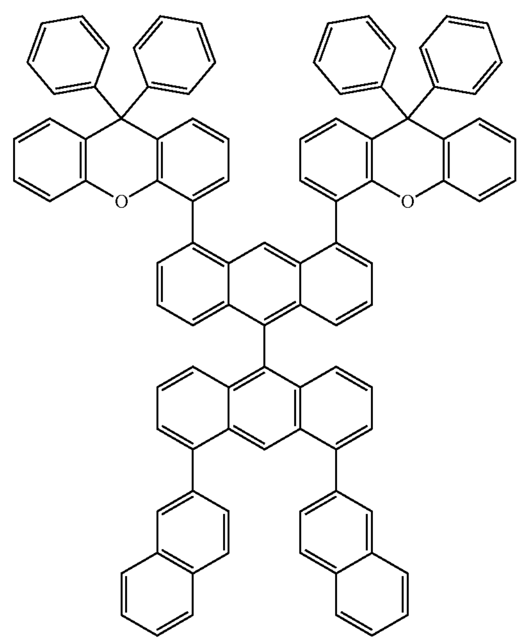
-continued
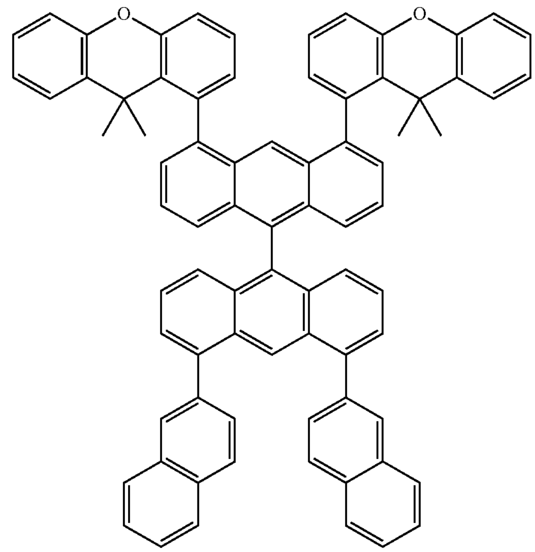
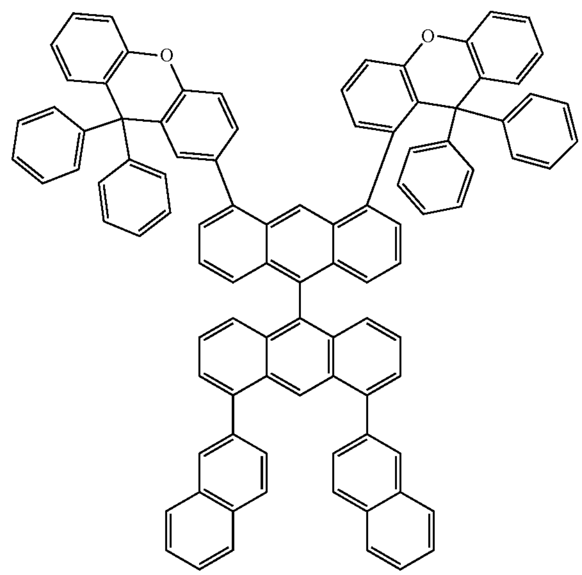
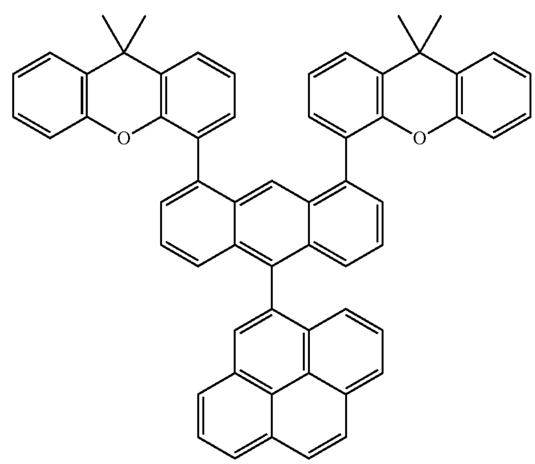

-continued
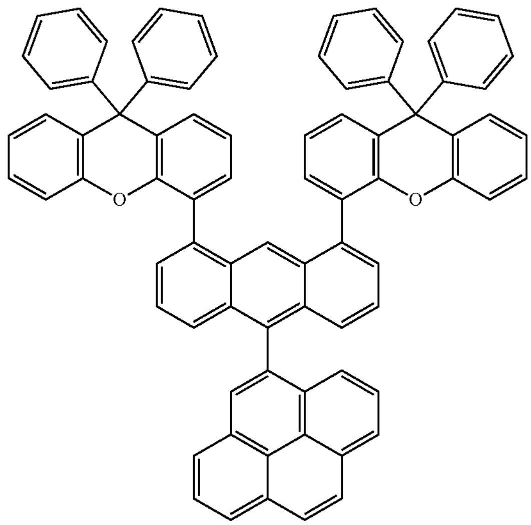
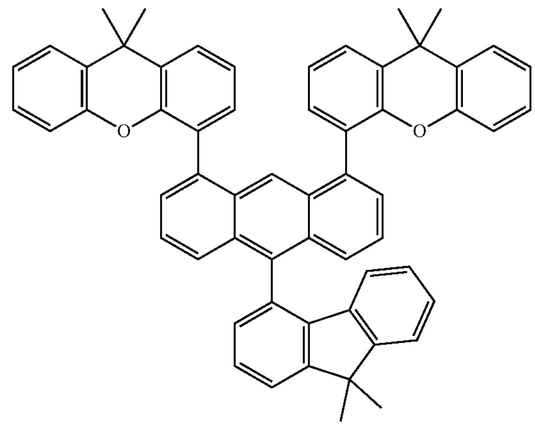
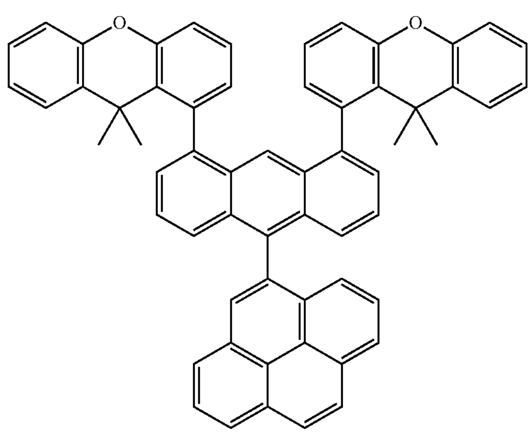
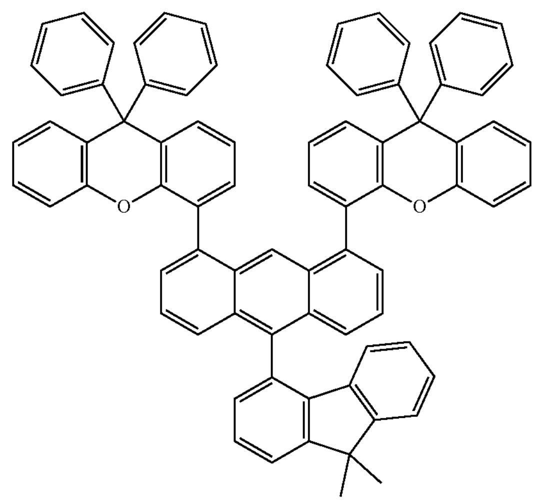
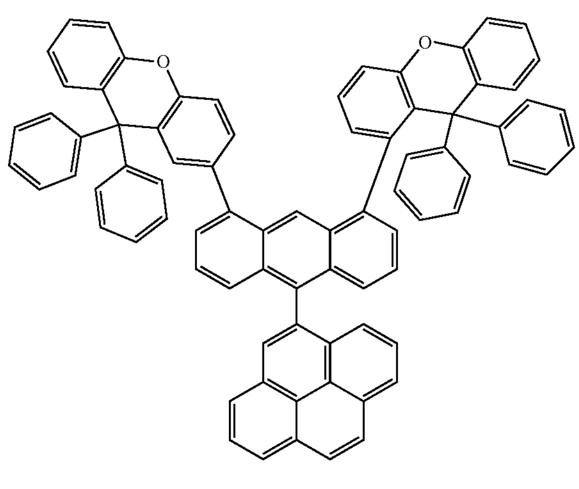 [SMILES: c1ccc(C2(c3ccccc3)c3ccccc3Oc3ccc(-c4cccc5c(-c6cc7cccc8ccc9cccc6c9c87)c6cccc(-c7cccc8c7C(c7ccccc7)(c7ccccc7)c7ccccc7O8)c6cc45)cc32)cc1]
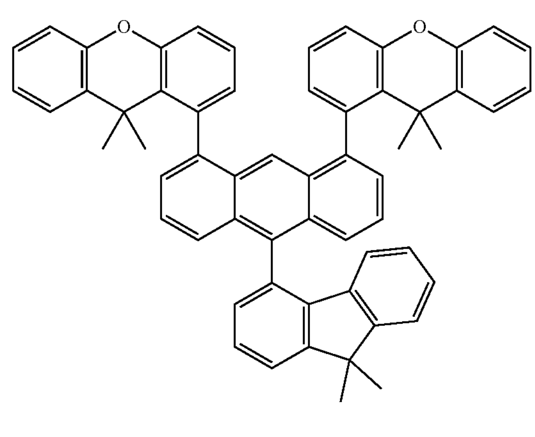

-continued
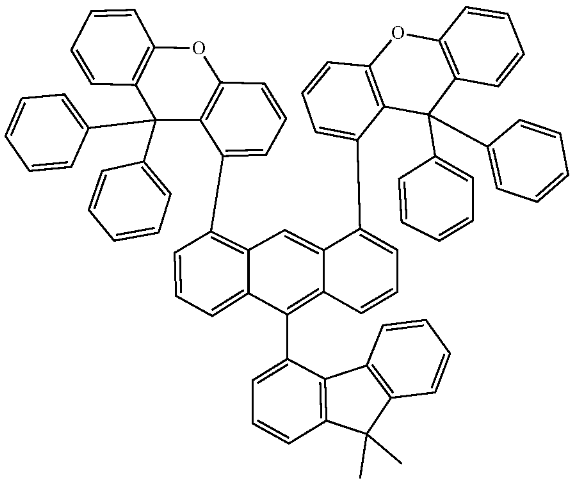
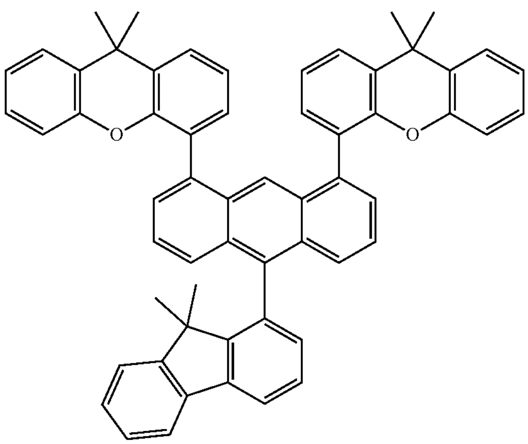
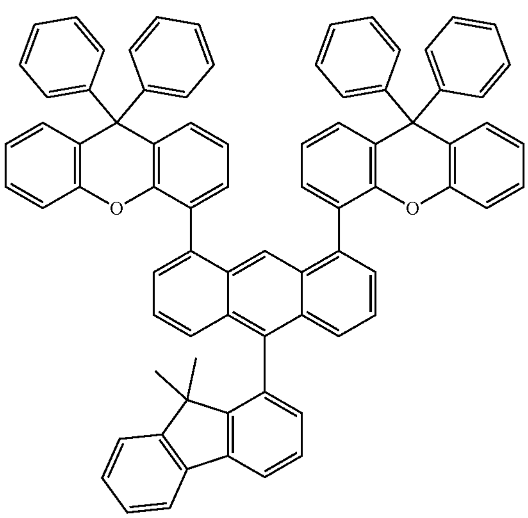
-continued
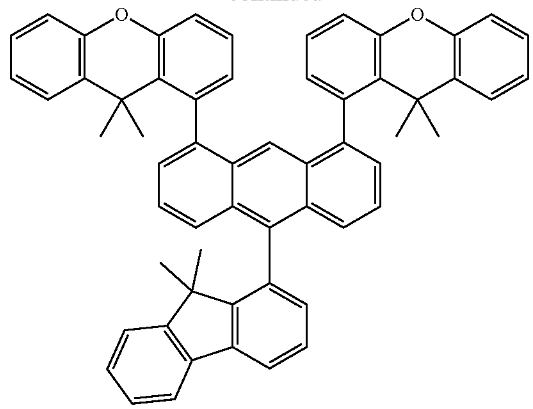
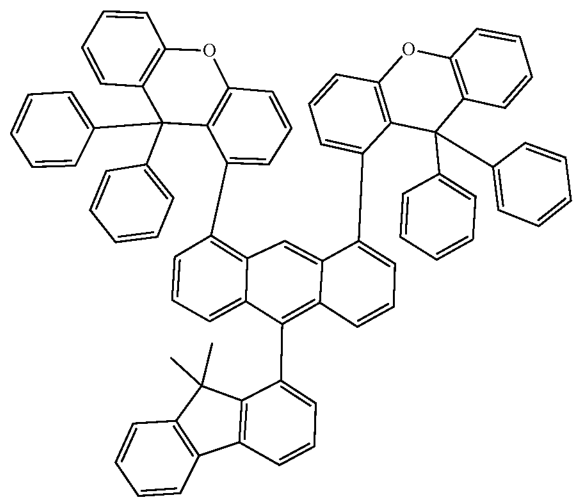
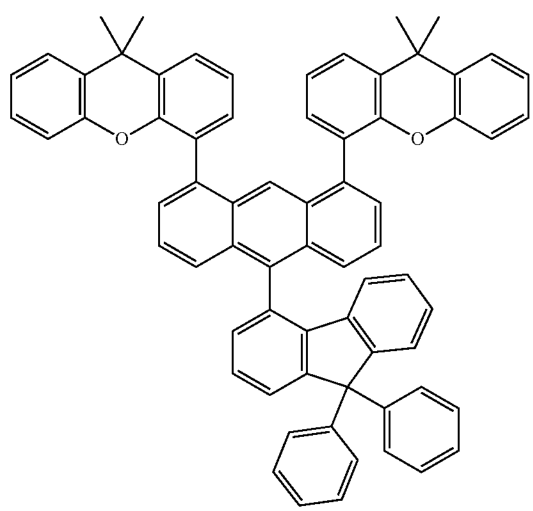

-continued
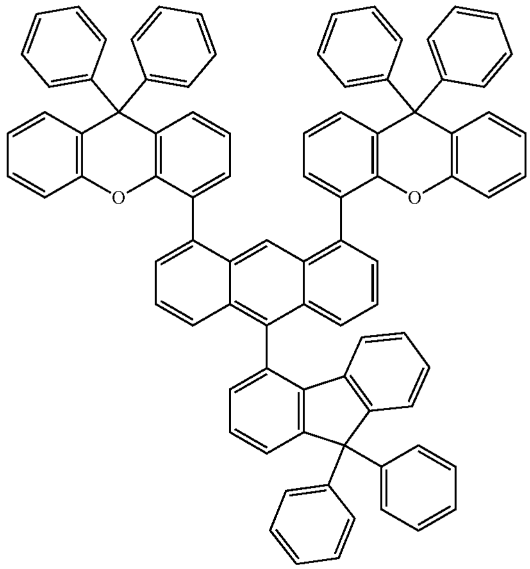
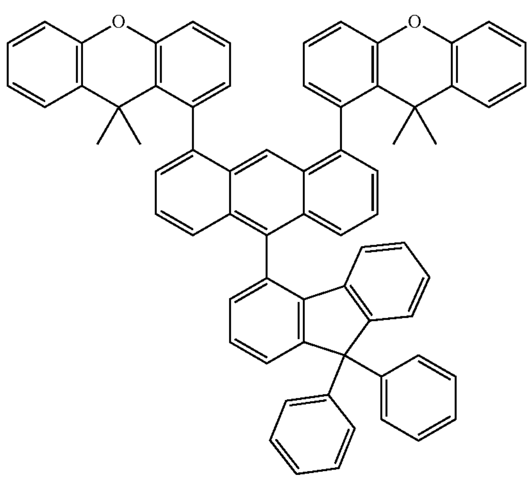
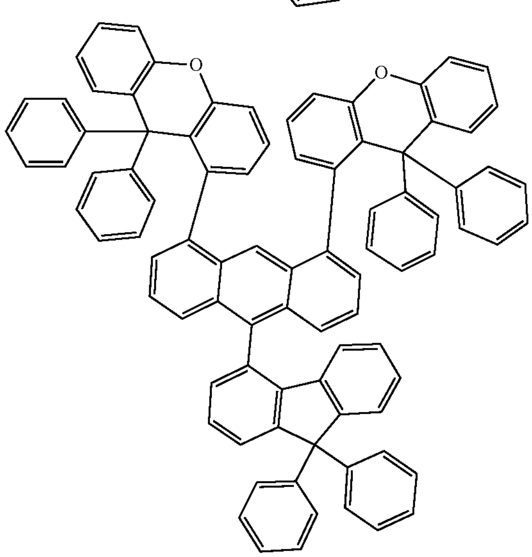
-continued
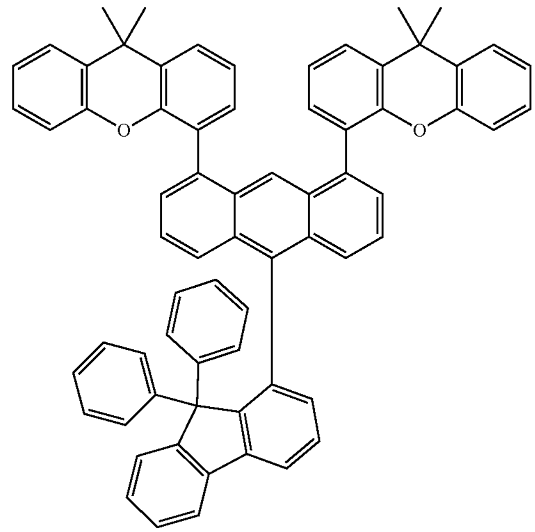
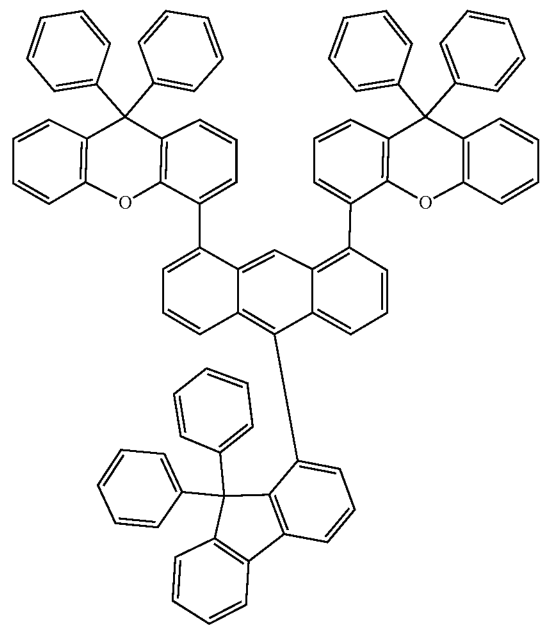
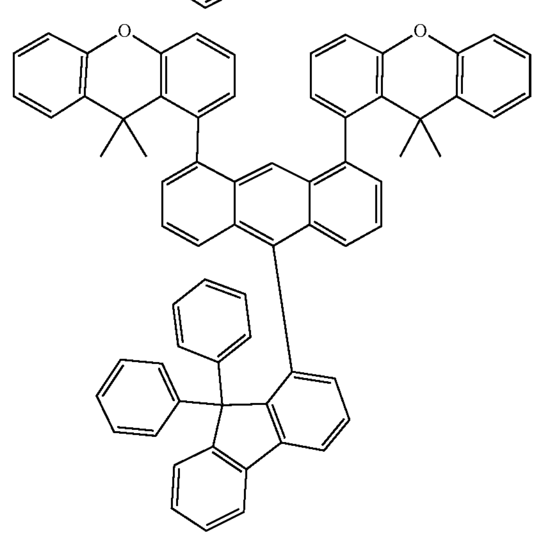

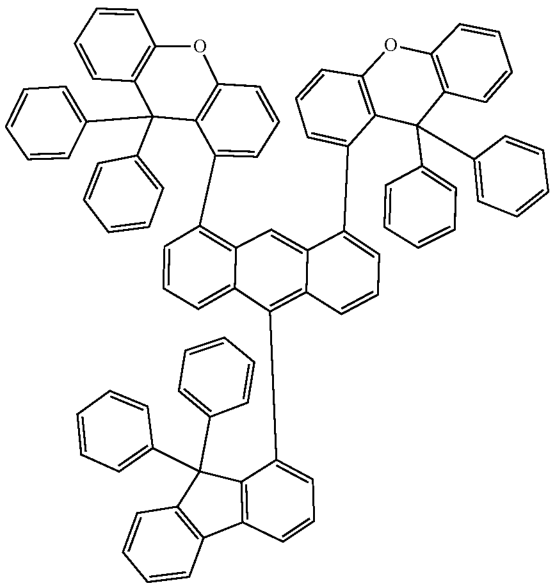
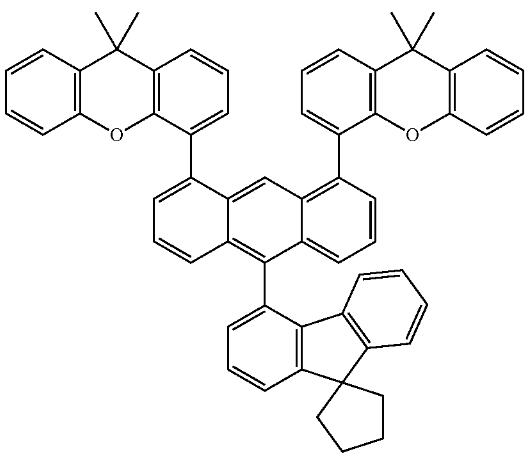
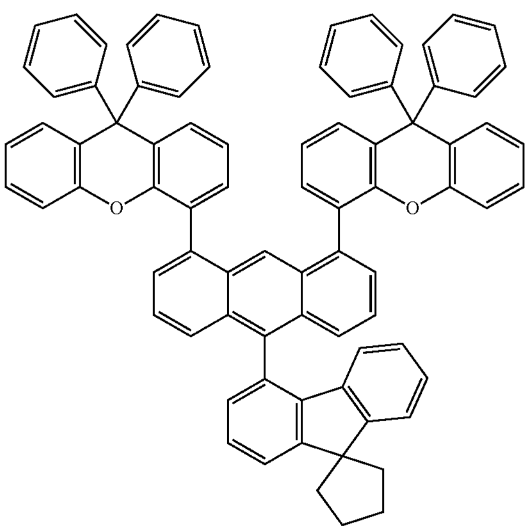
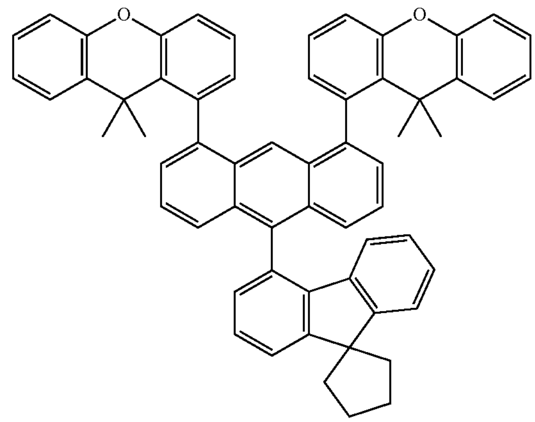
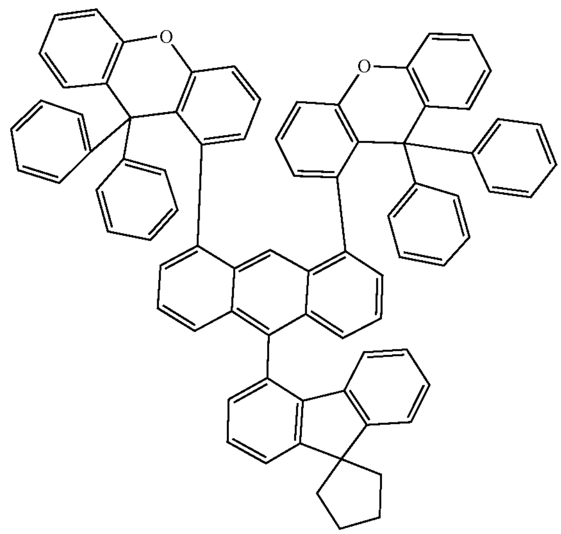
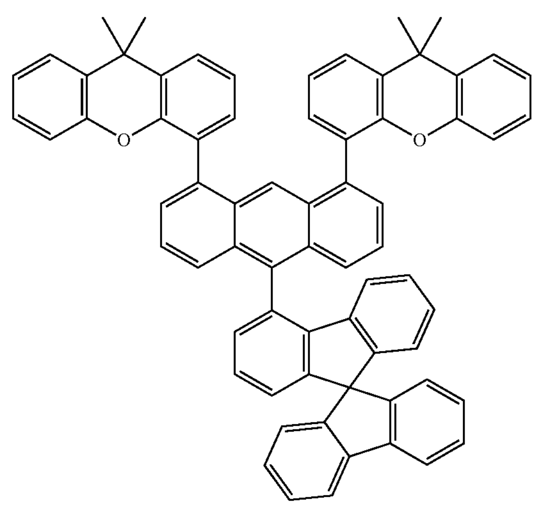

-continued
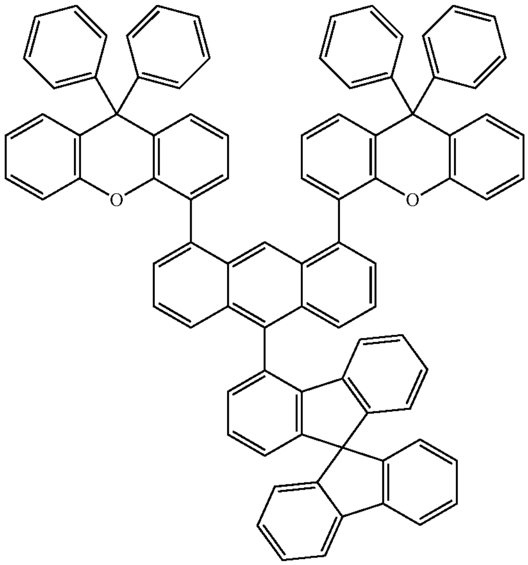
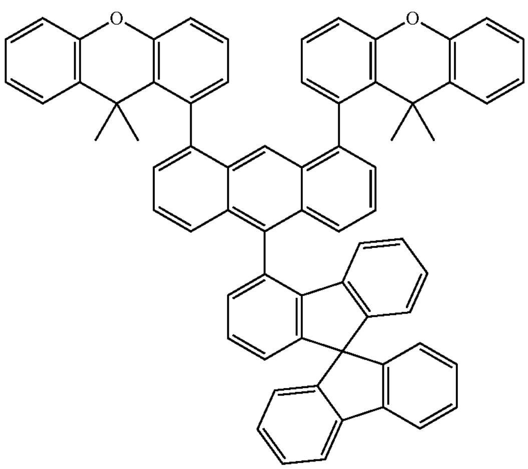
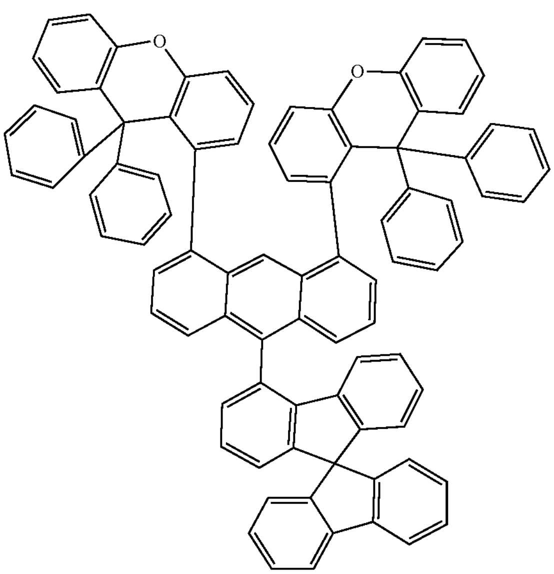
-continued
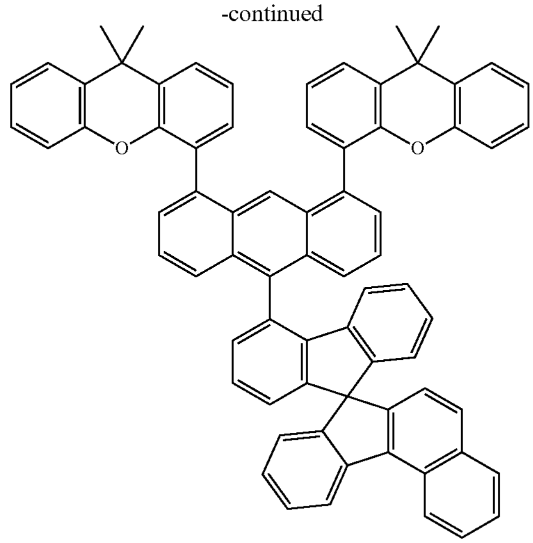
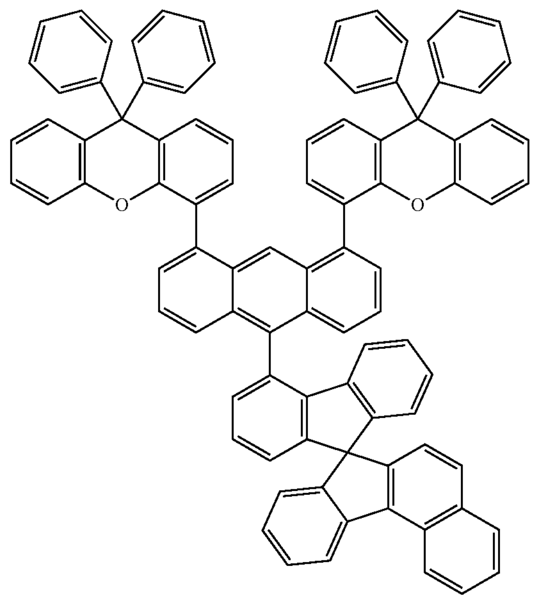
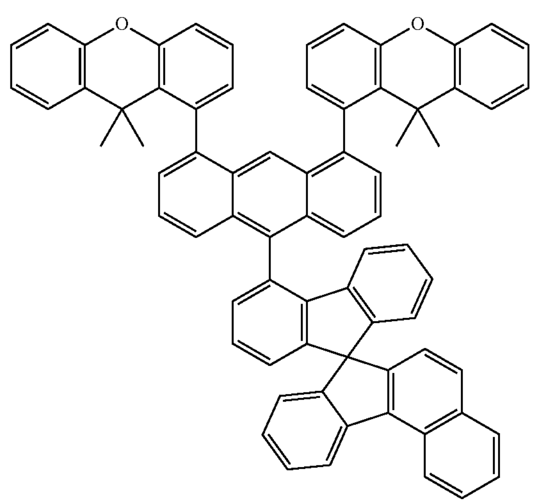

-continued
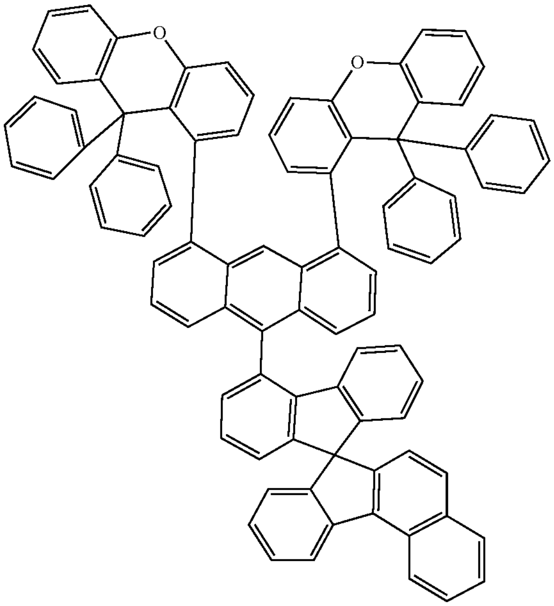
-continued
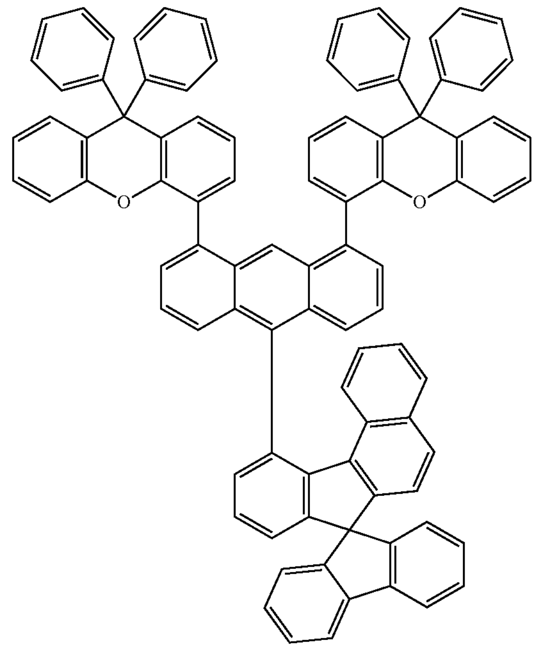
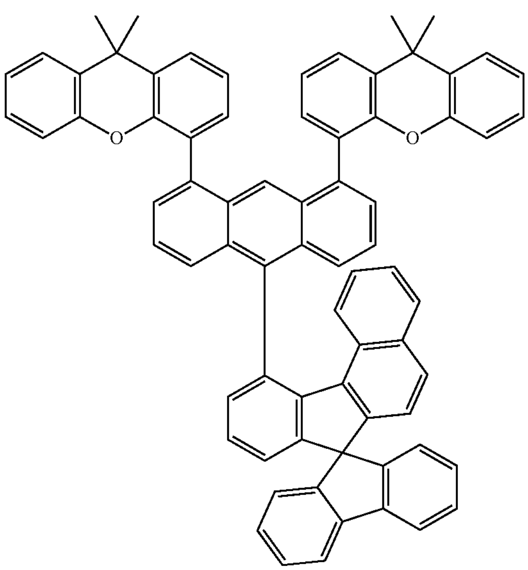
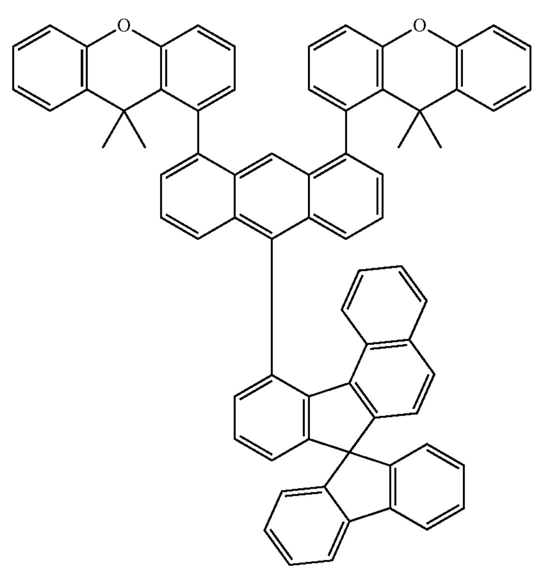

-continued
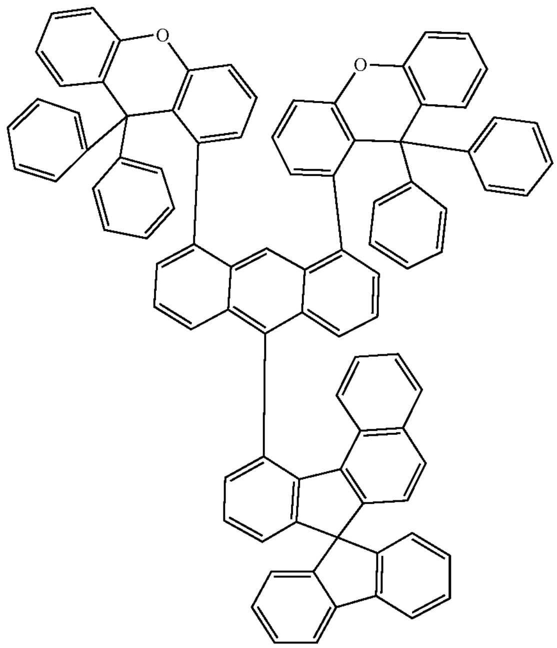
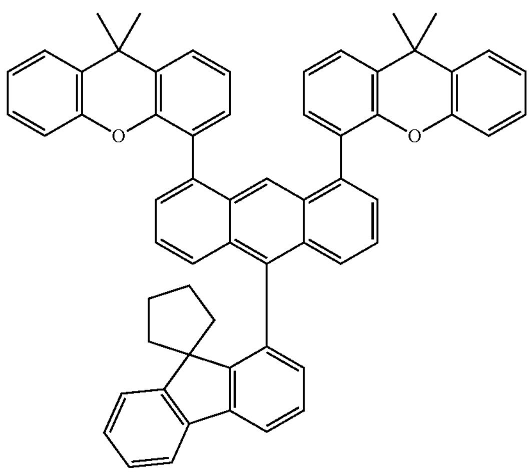
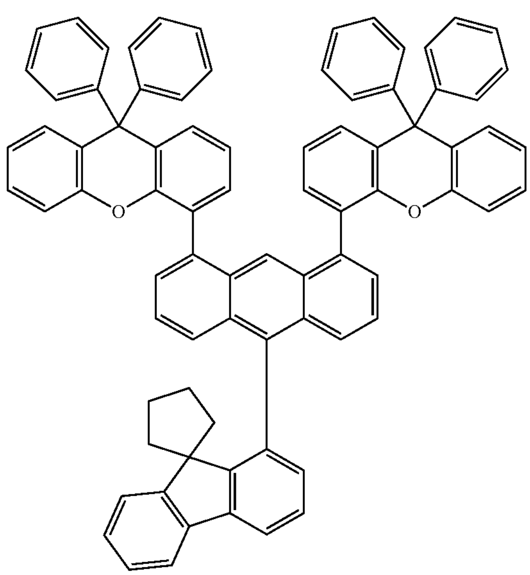
-continued
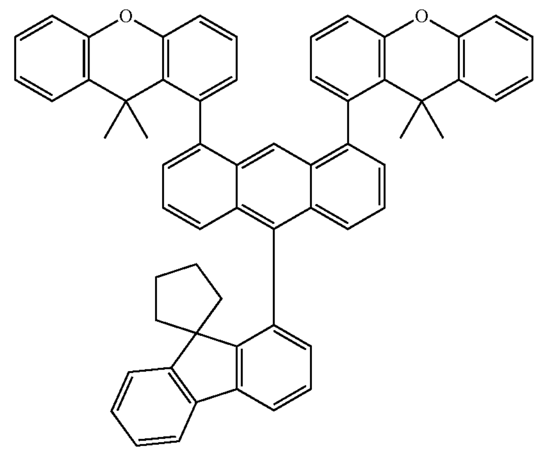
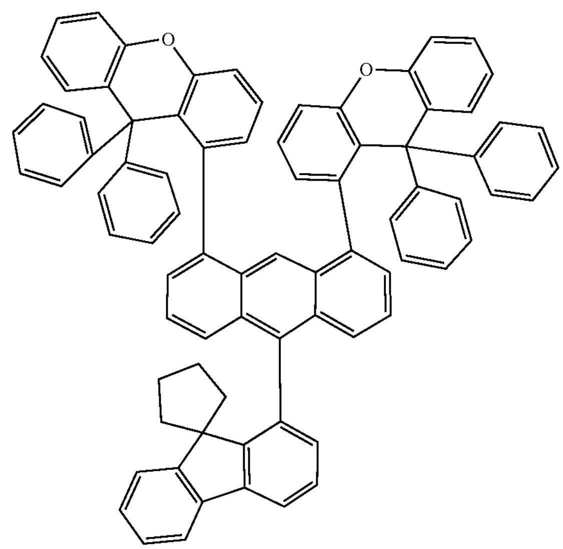
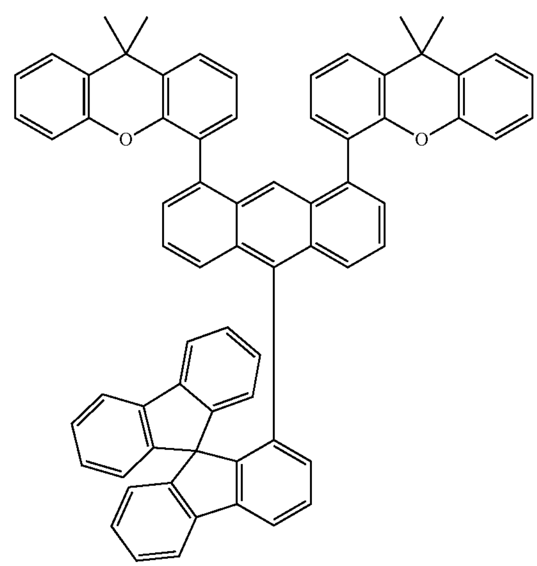

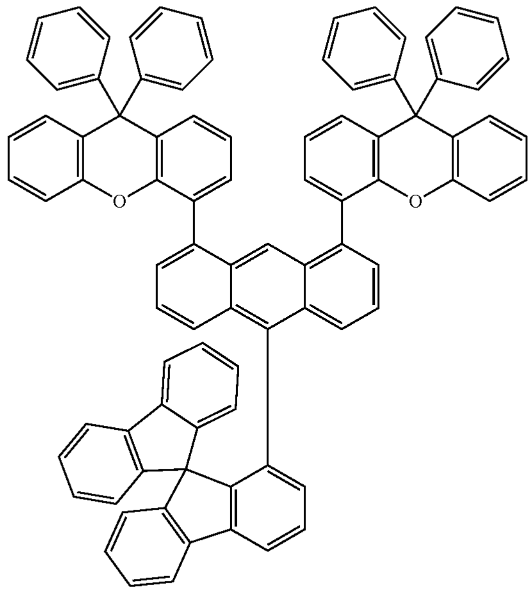
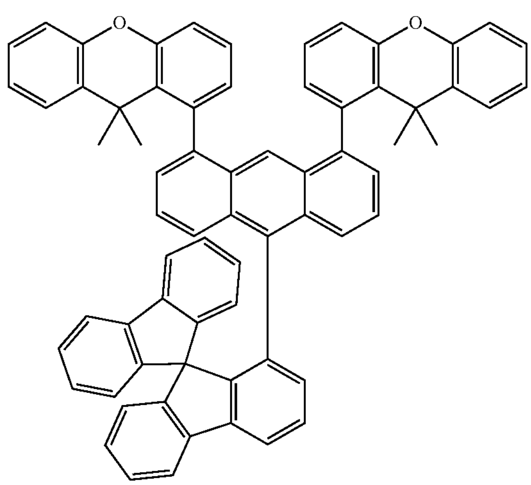
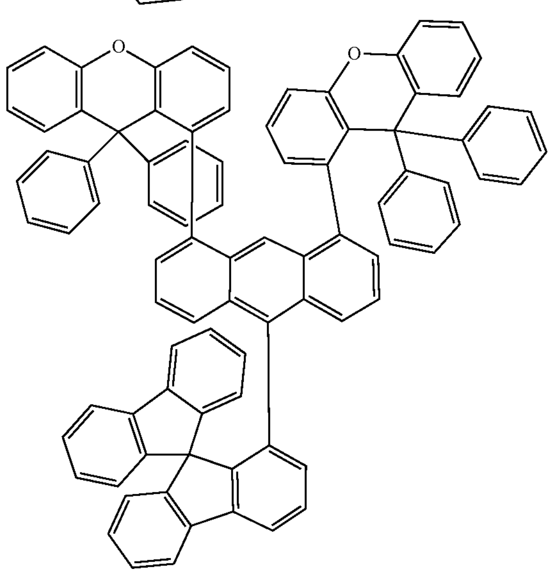
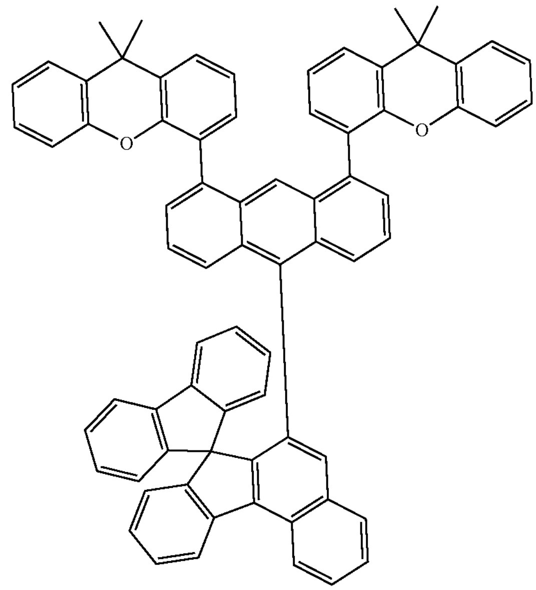
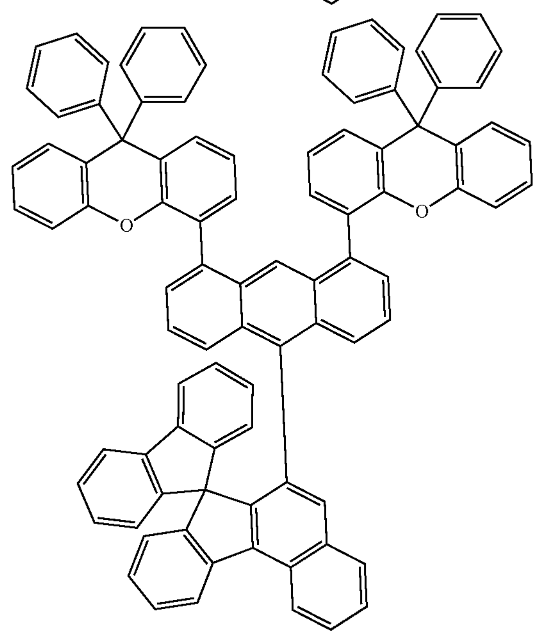
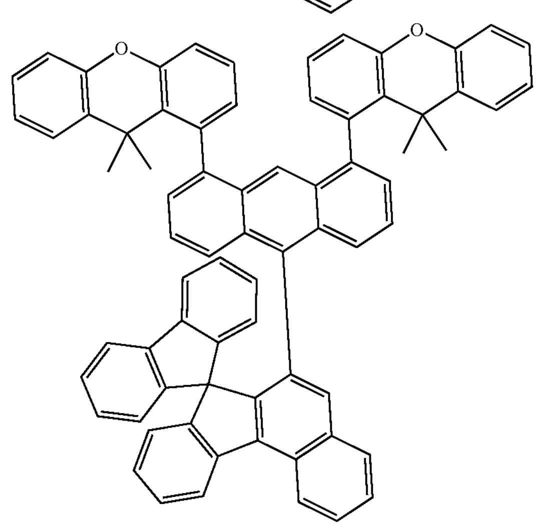

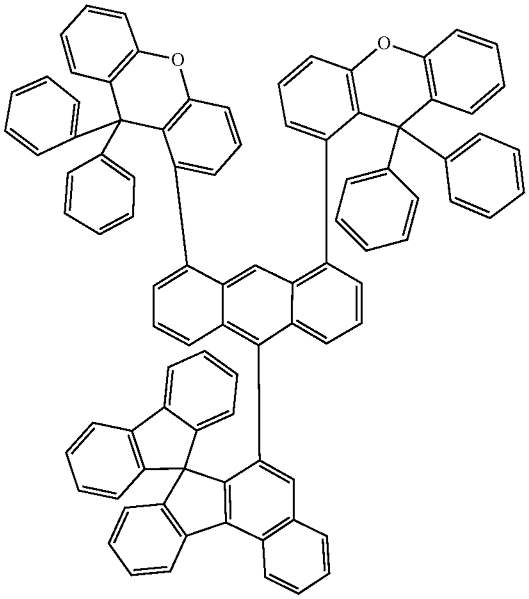
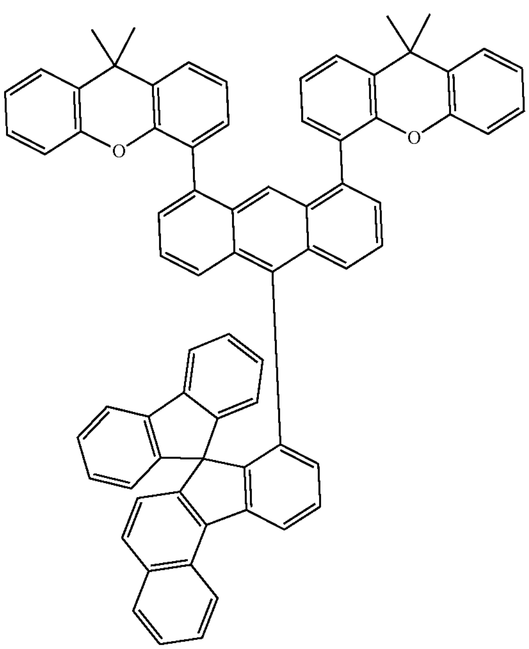
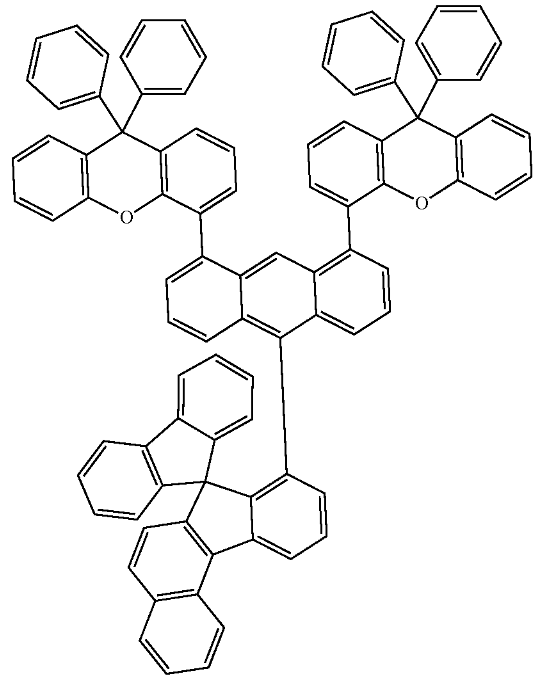
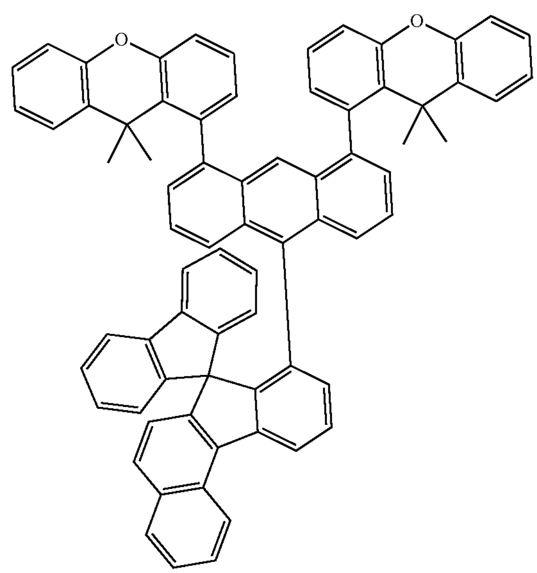

-continued
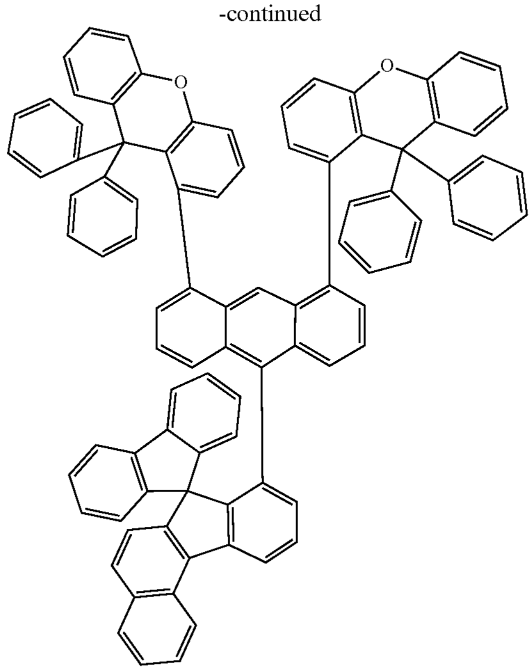
-continued
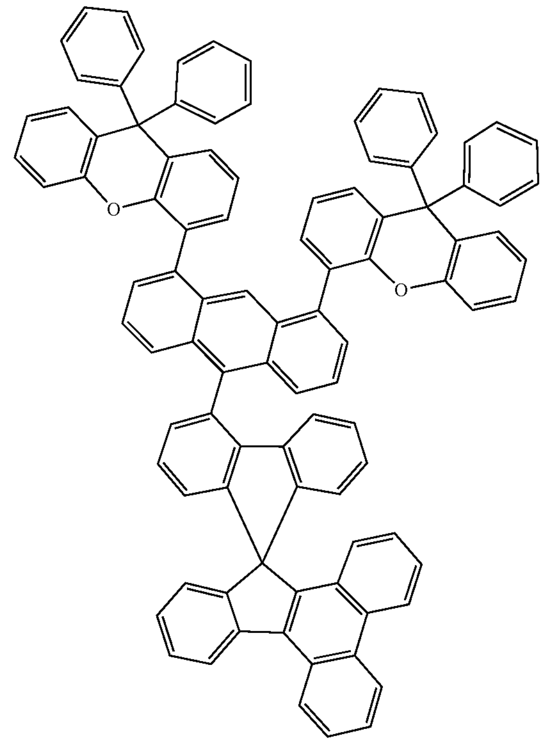
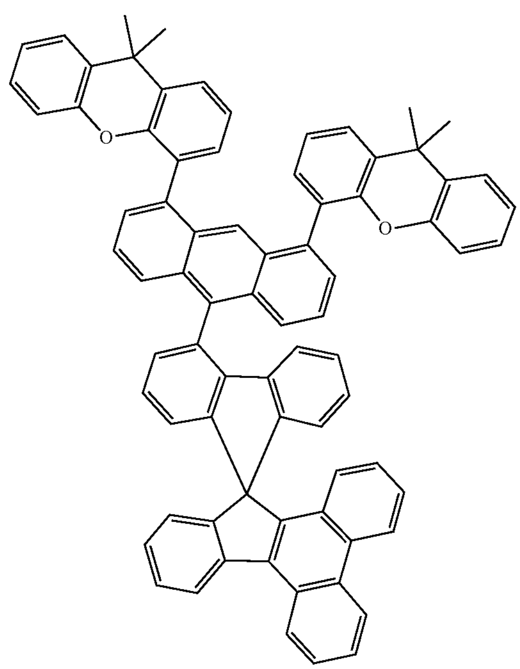
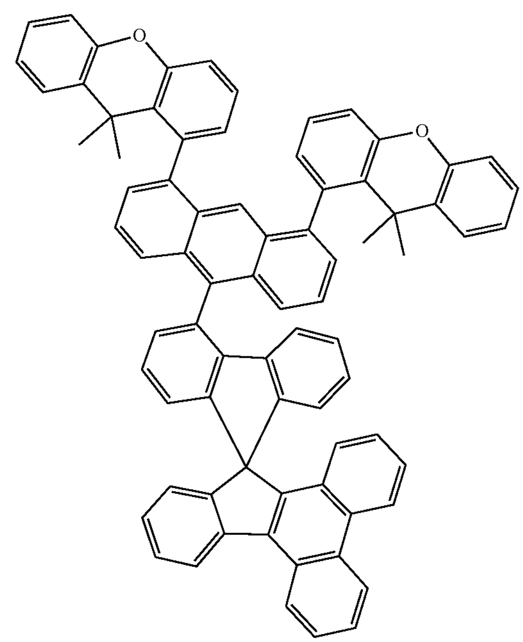

-continued
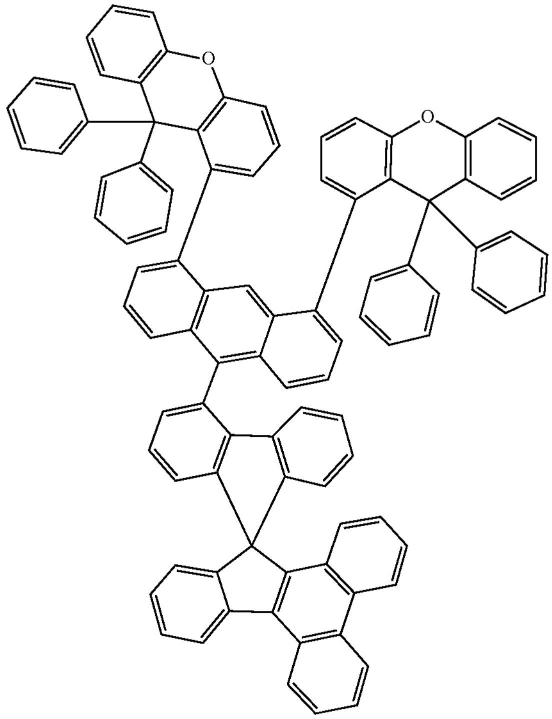
-continued
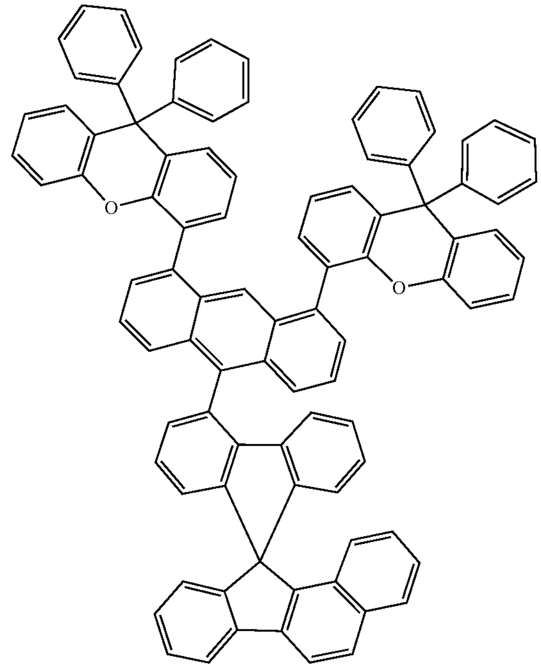
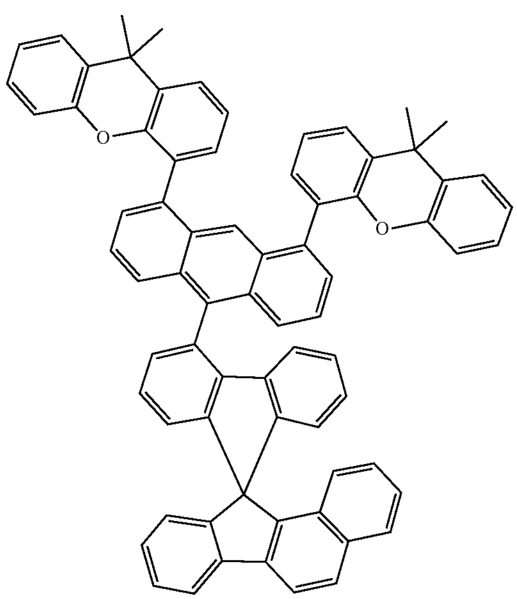
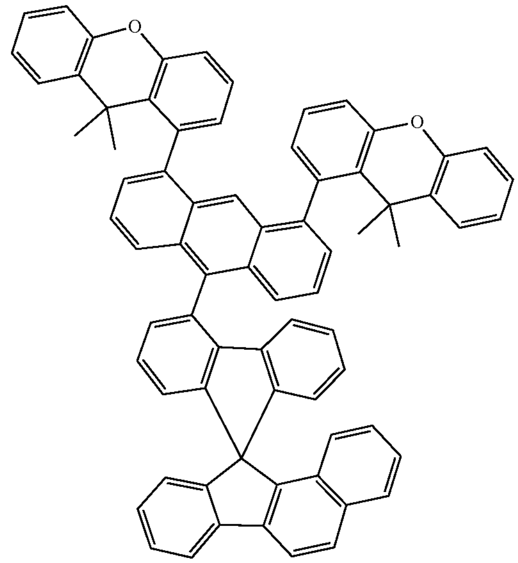

-continued
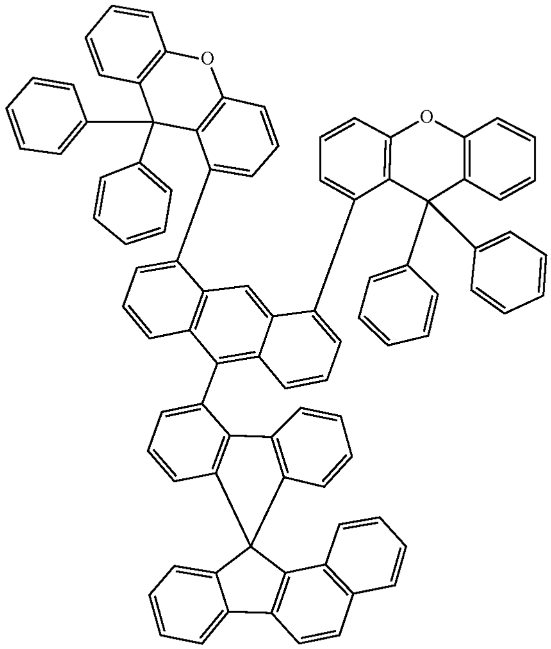
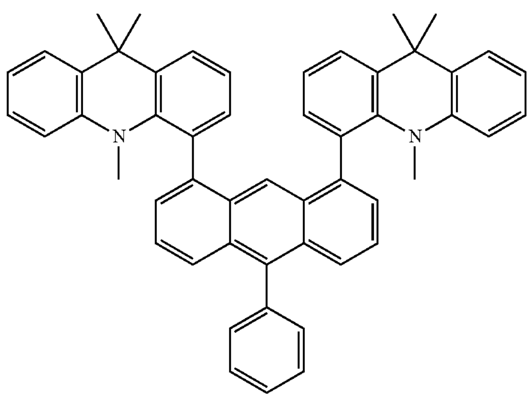
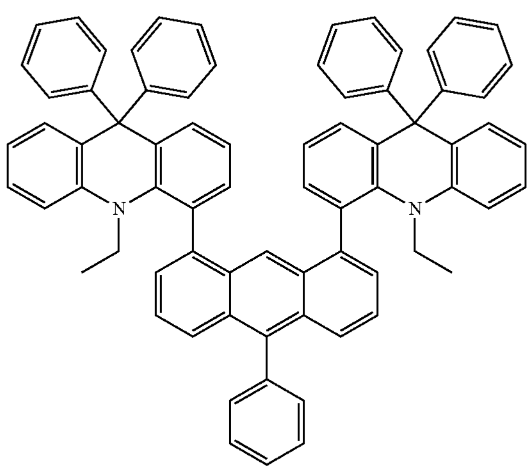
-continued
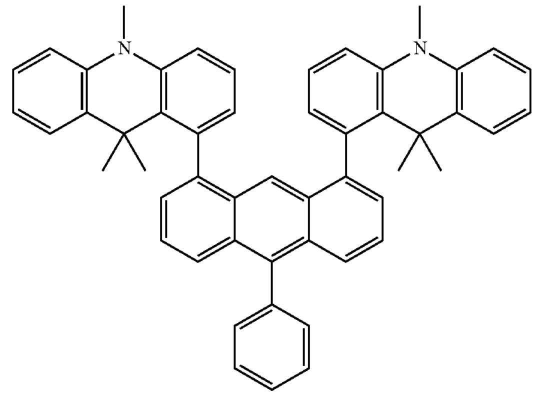
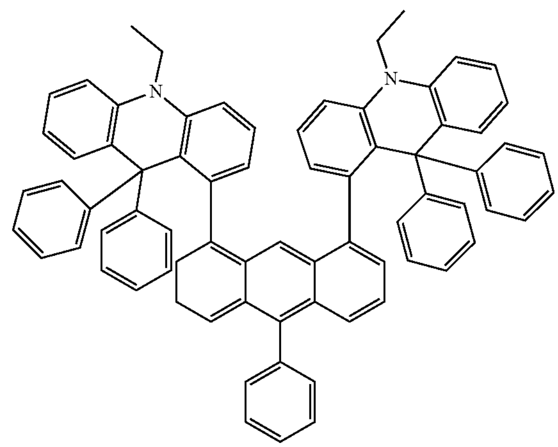
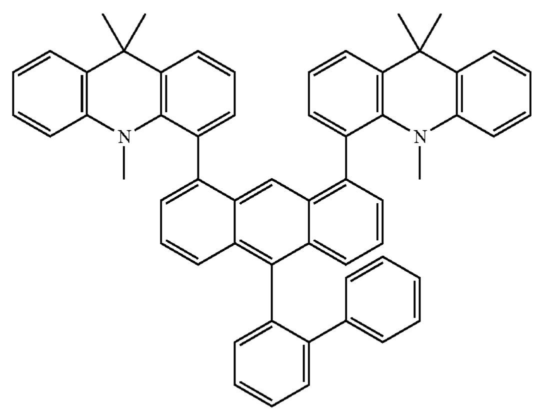
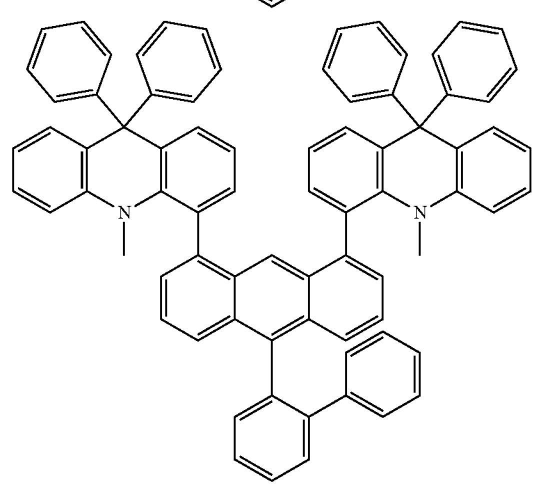

-continued
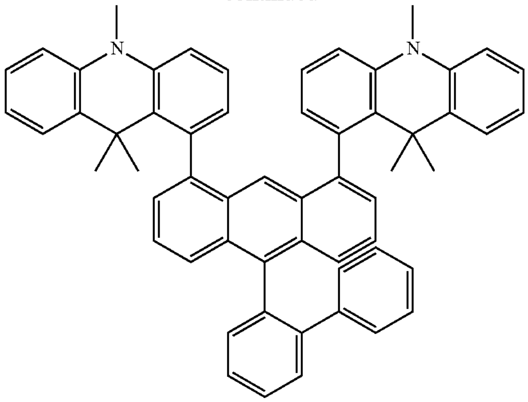
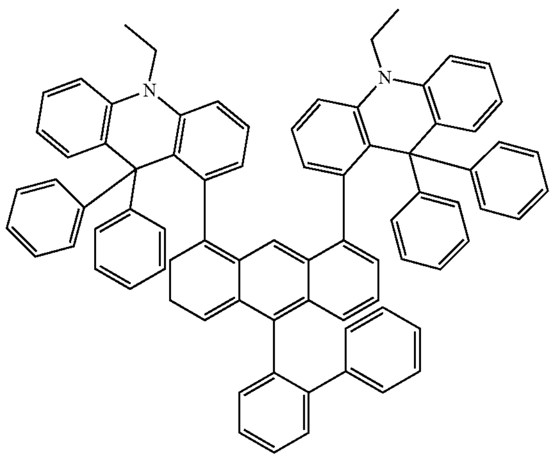
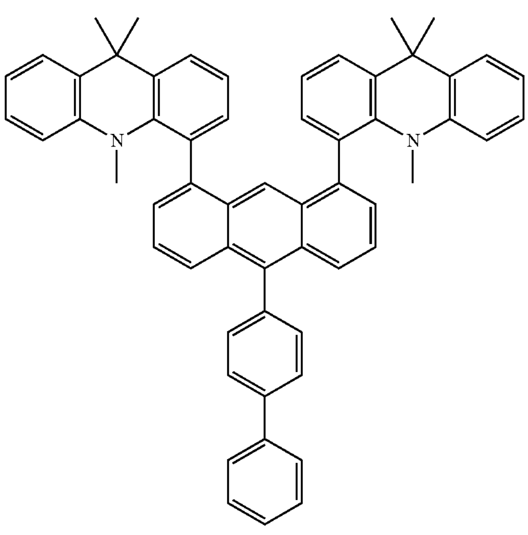
-continued
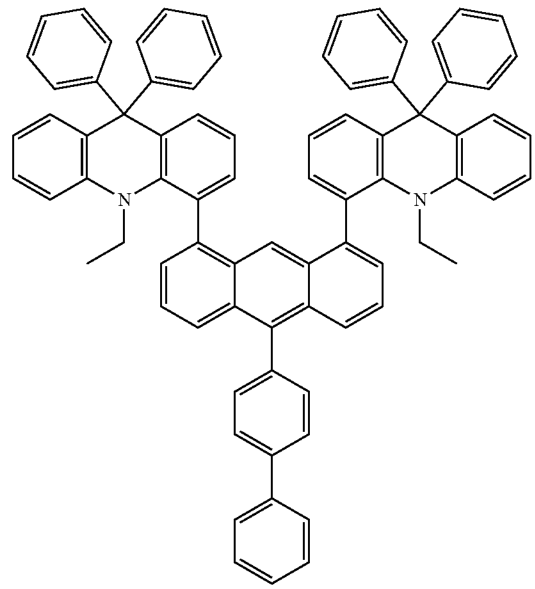
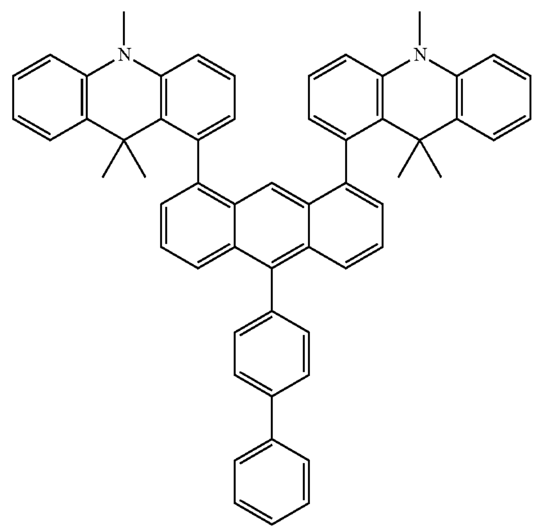
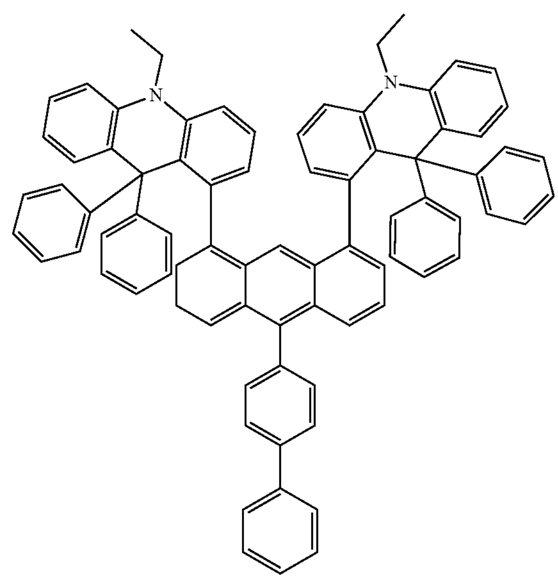

-continued
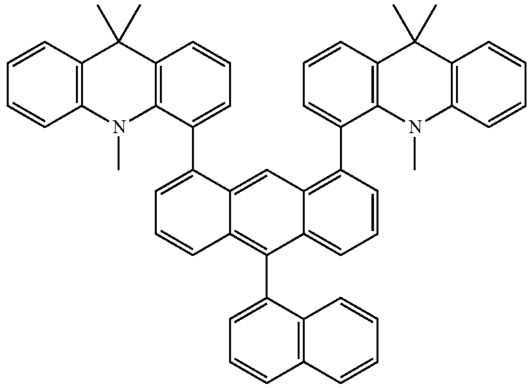
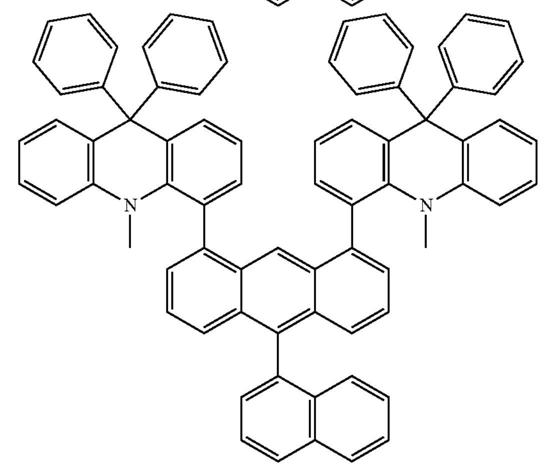
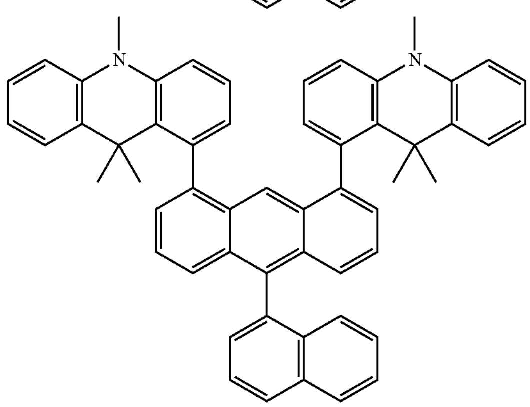
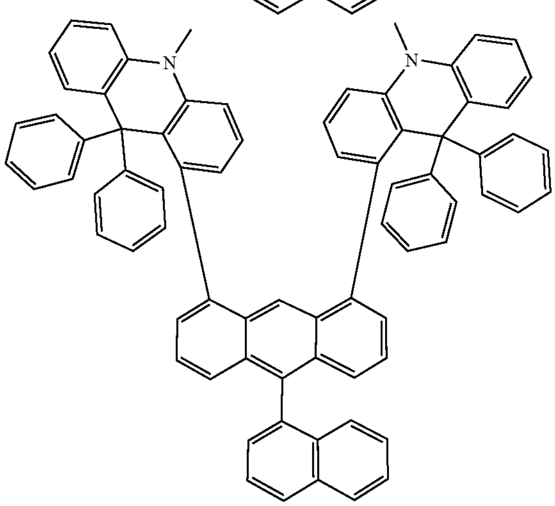
-continued
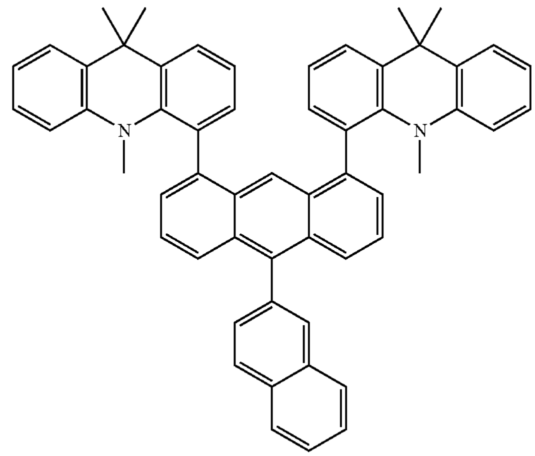
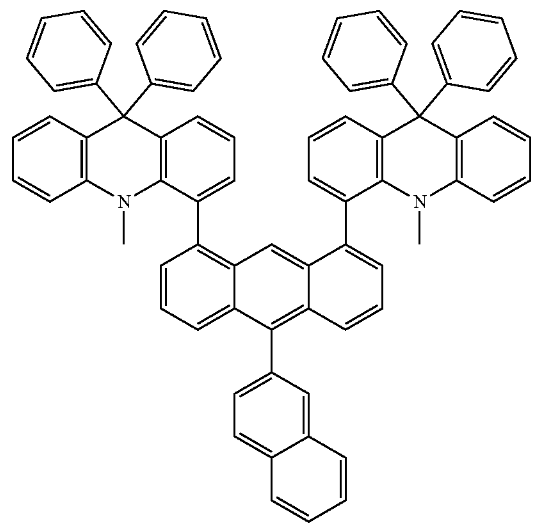
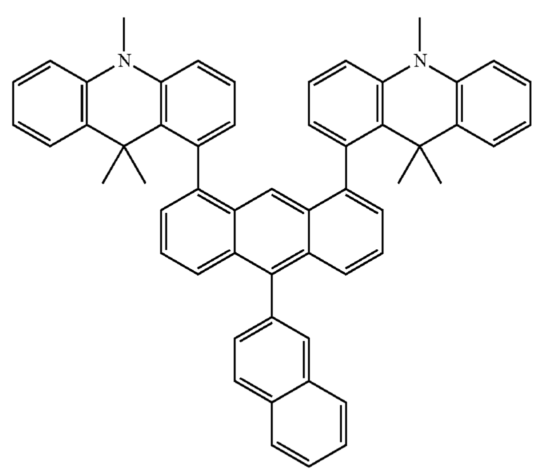

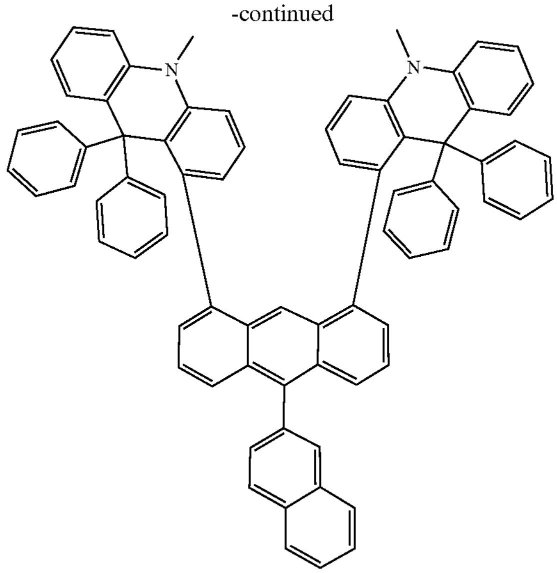
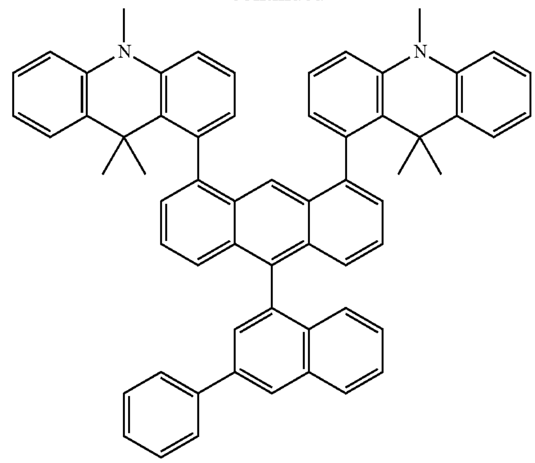
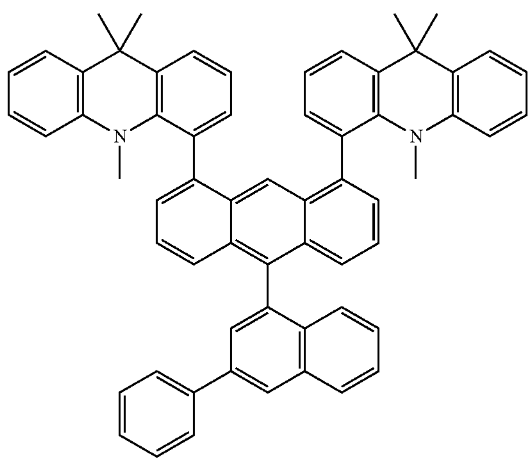
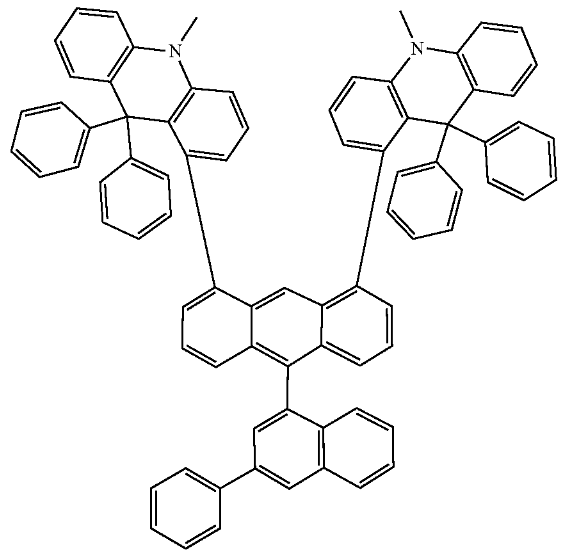
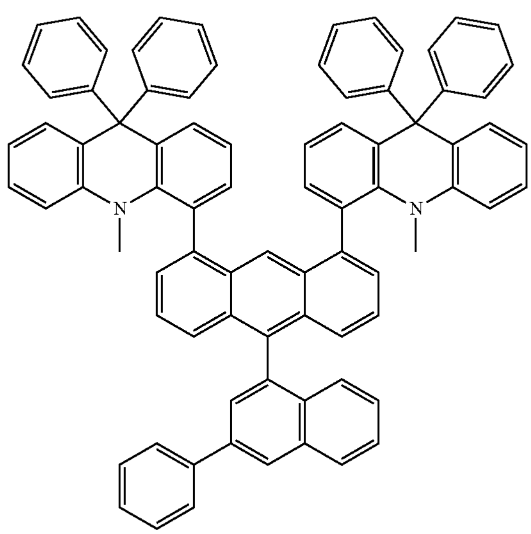
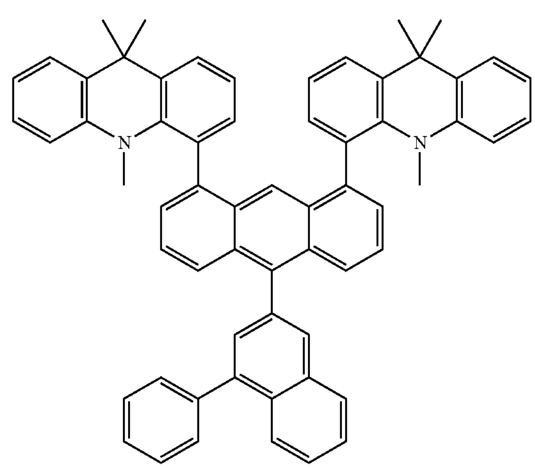

-continued
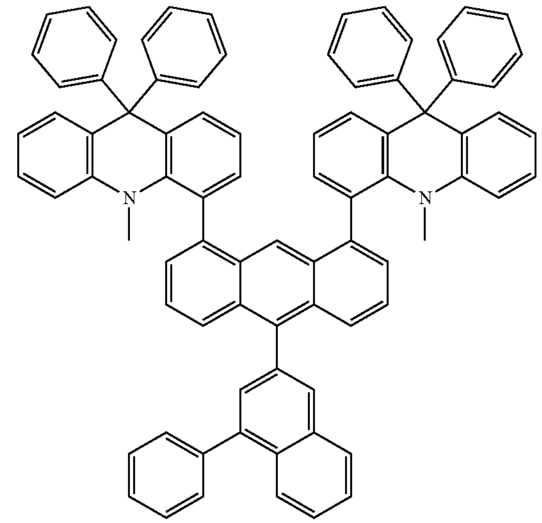
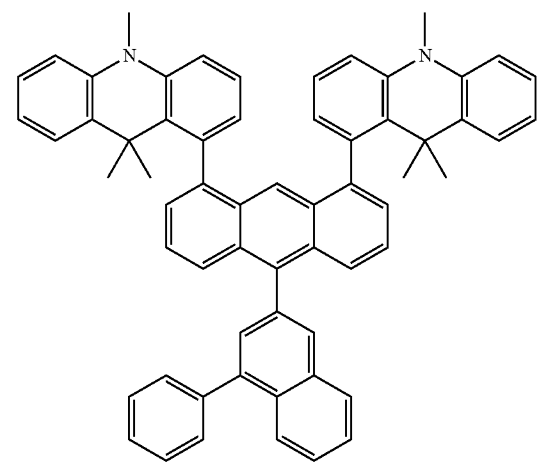
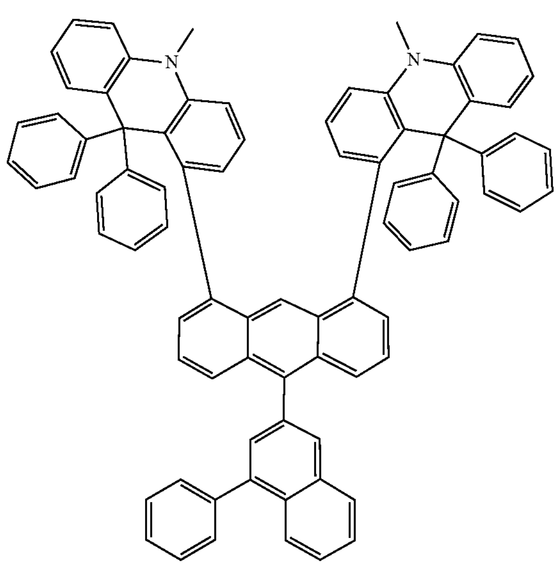
-continued
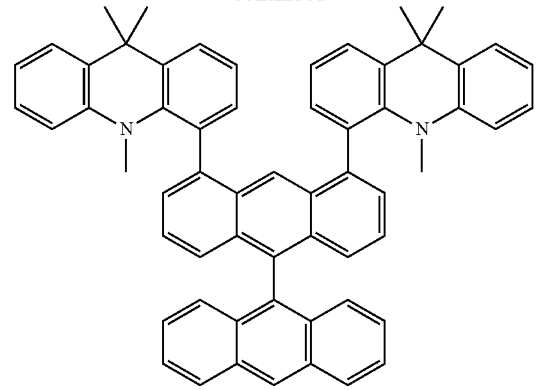
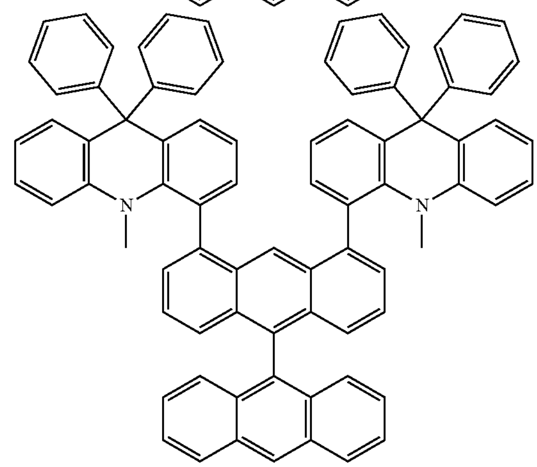
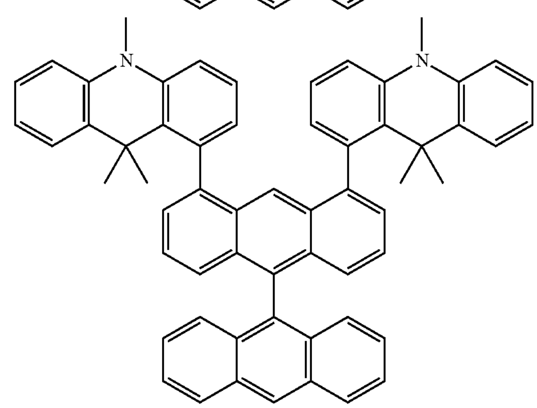
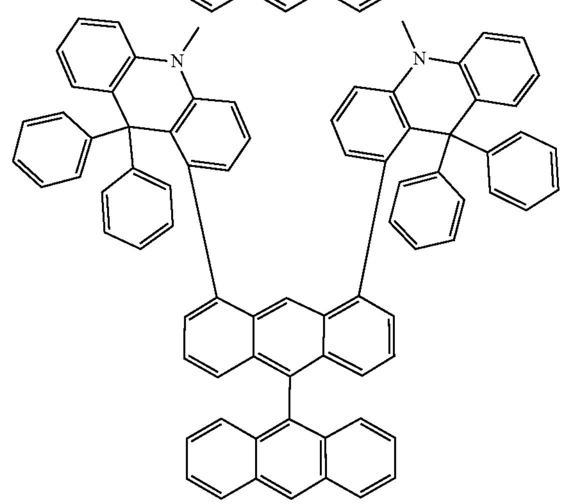

-continued
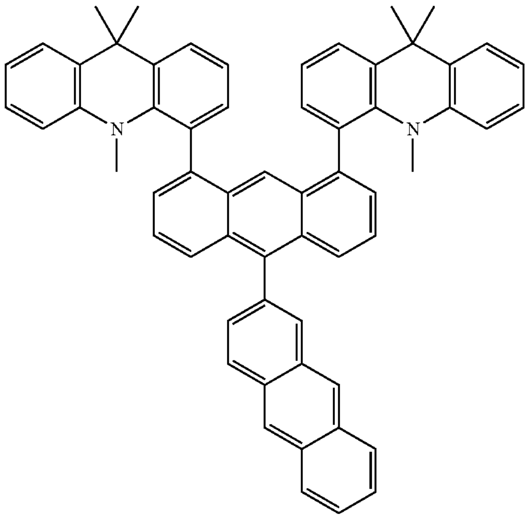
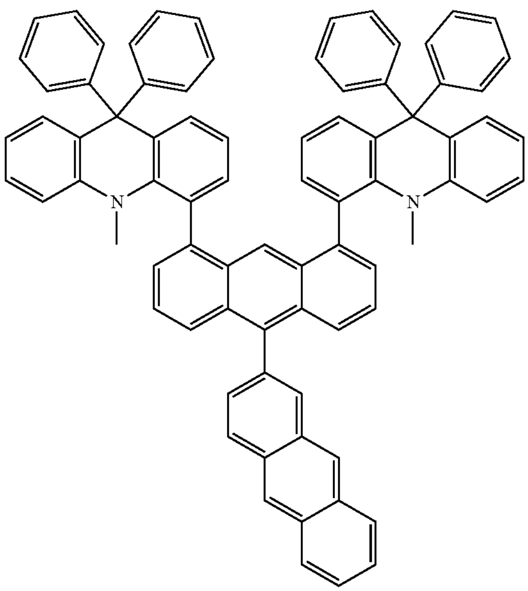
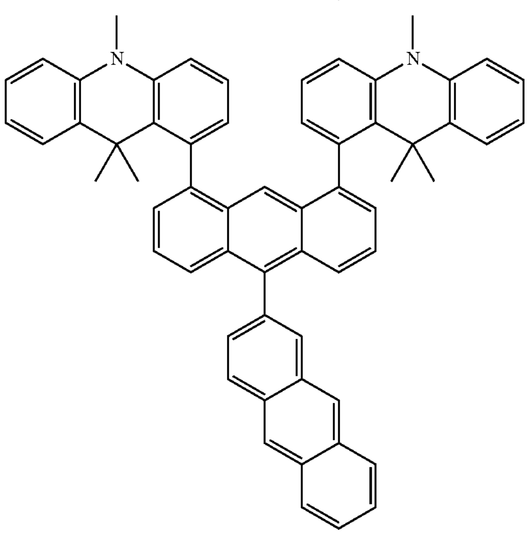
-continued
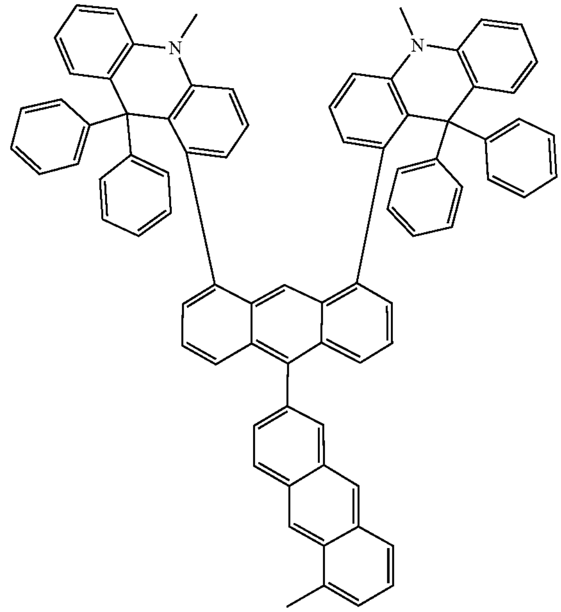
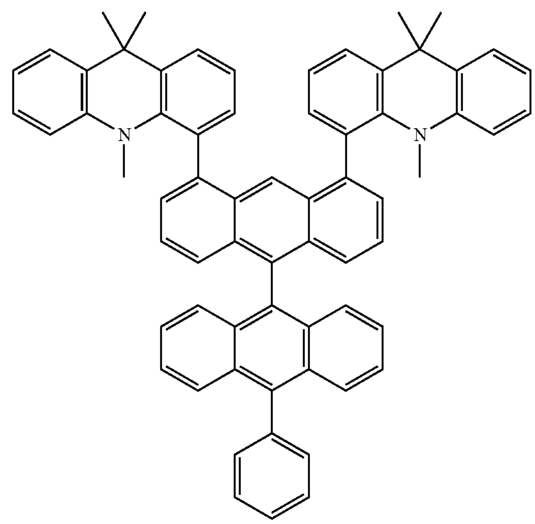
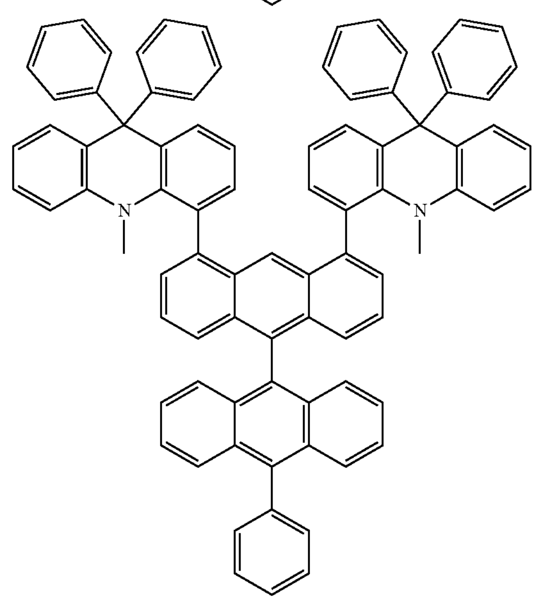

-continued
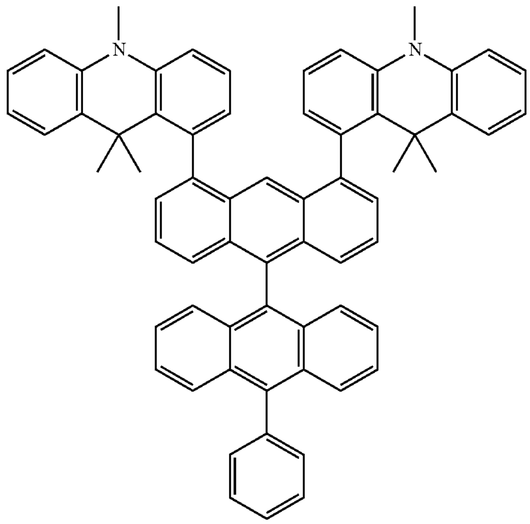
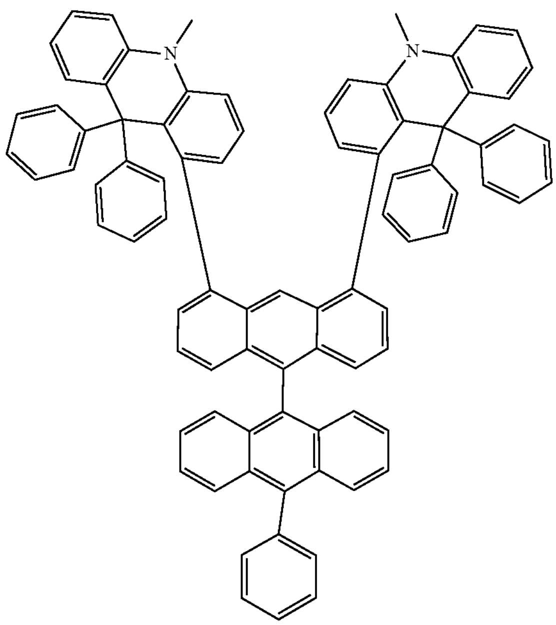
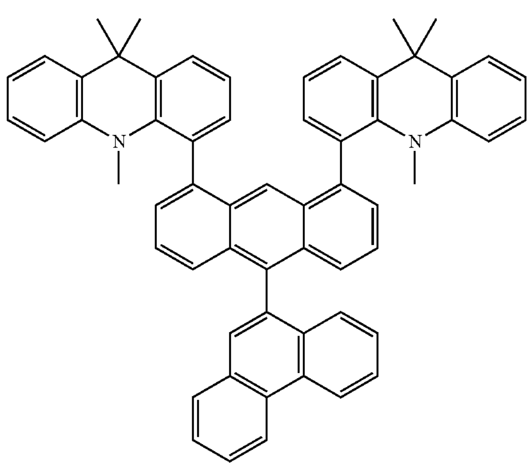
-continued
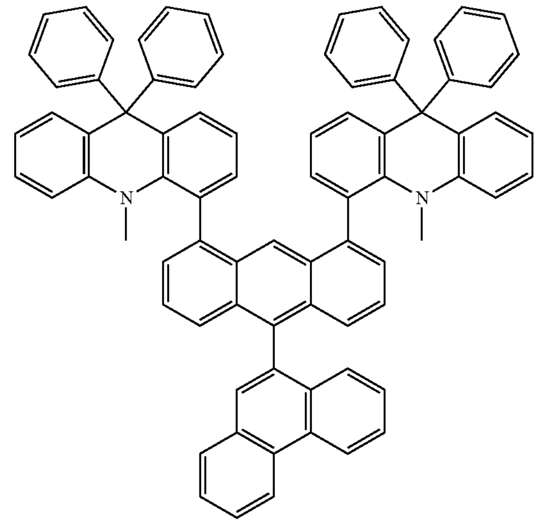
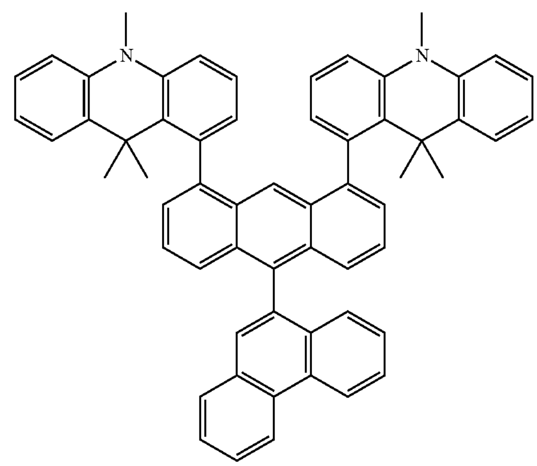
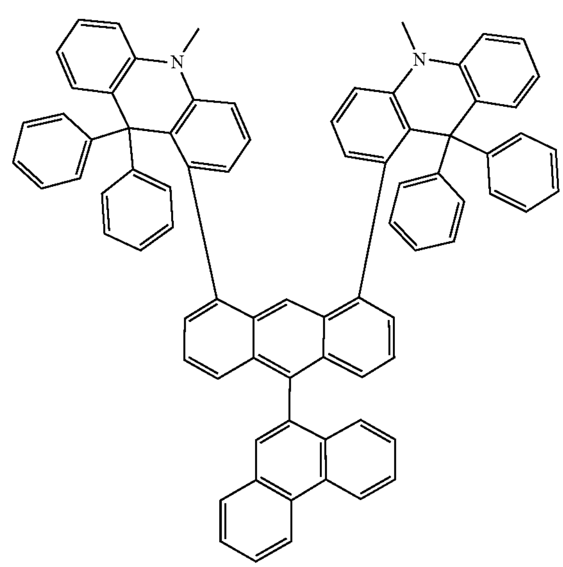

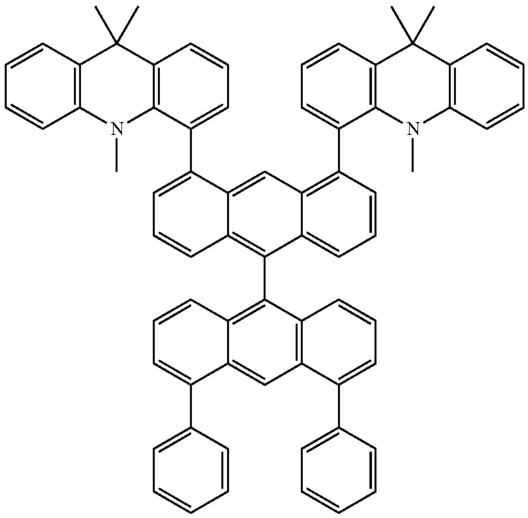
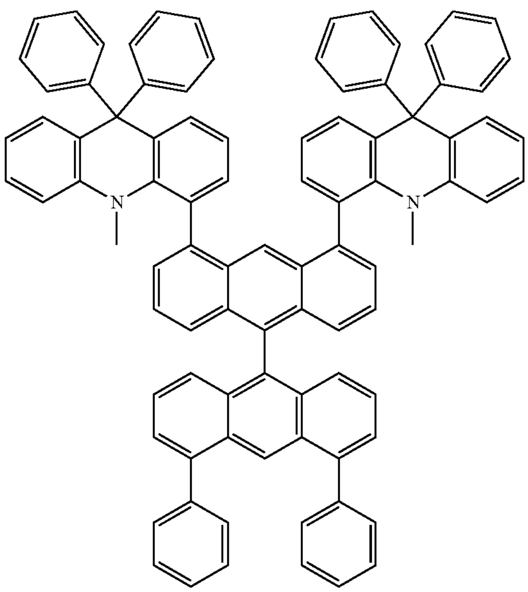
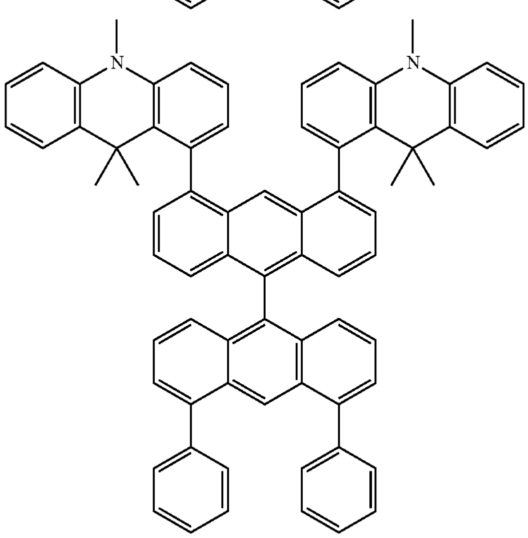
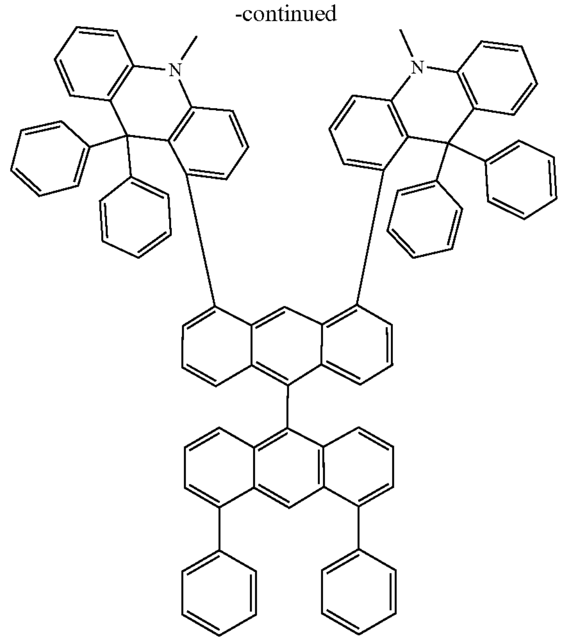
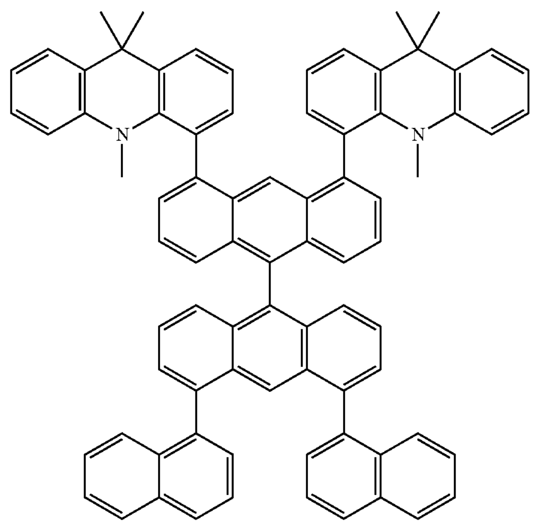
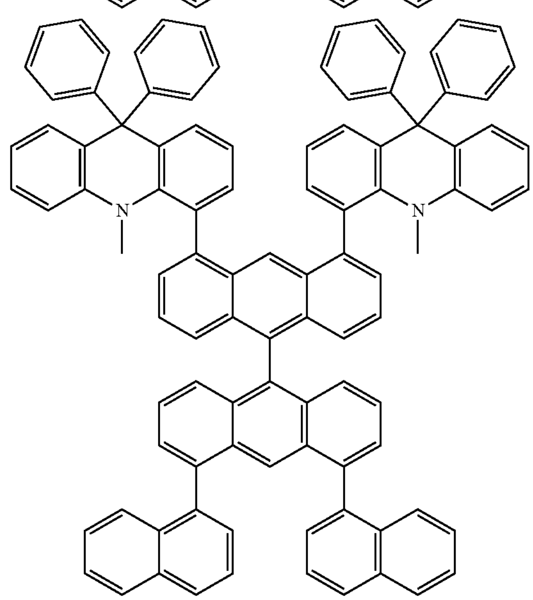

-continued
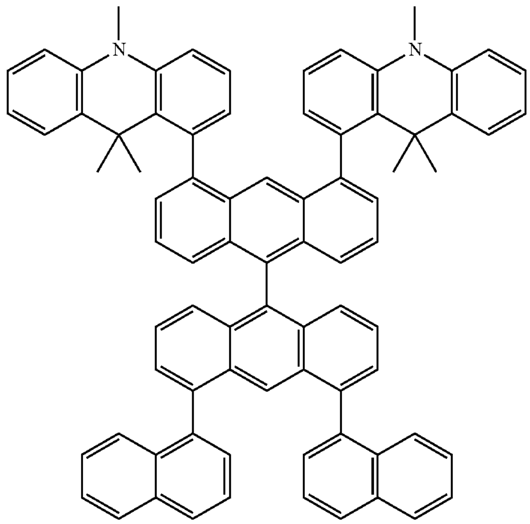
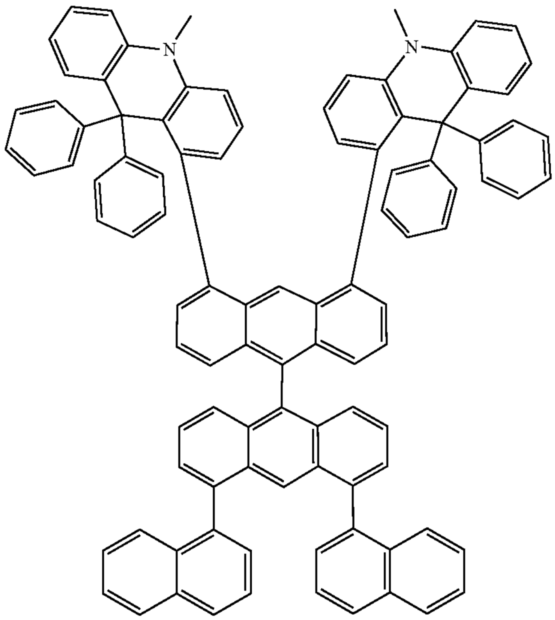
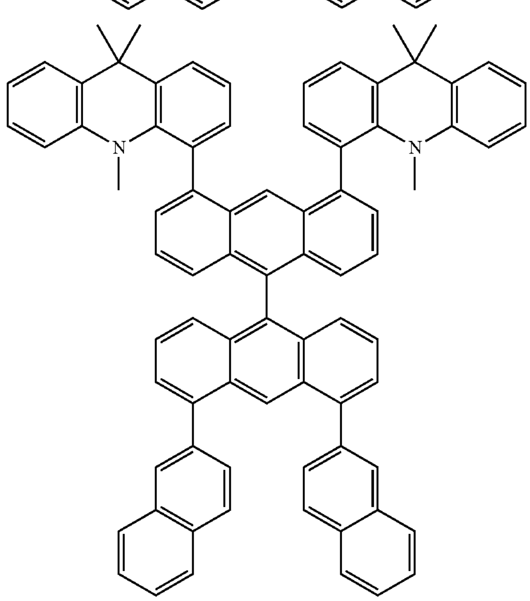
-continued
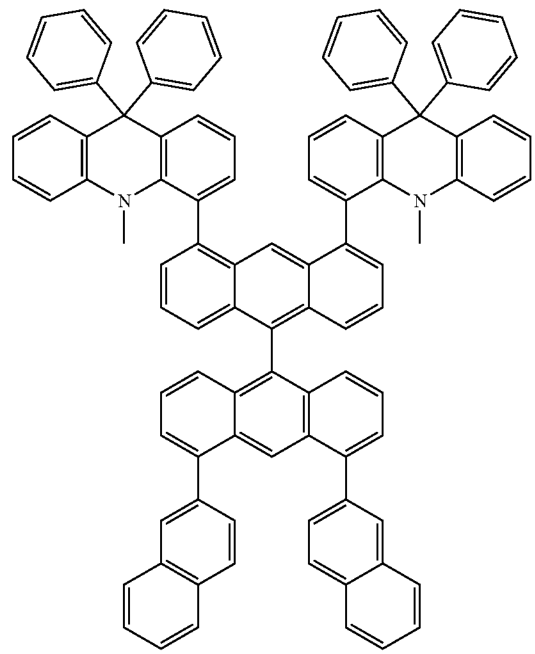
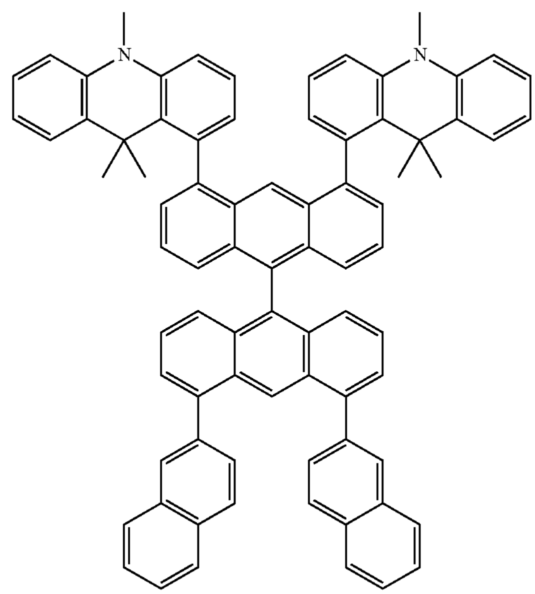

-continued
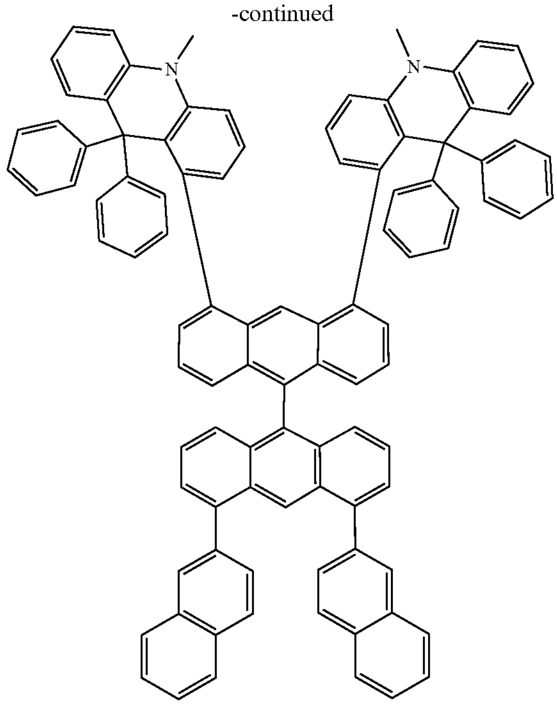
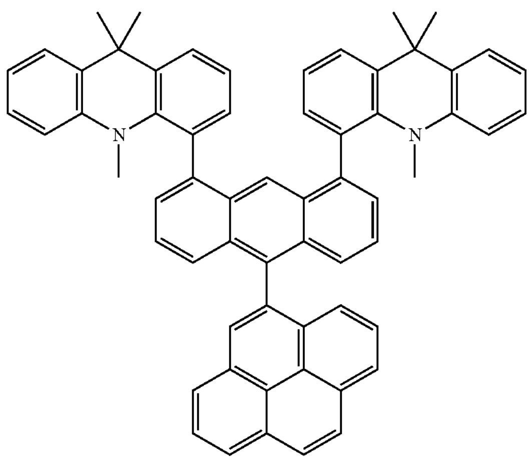
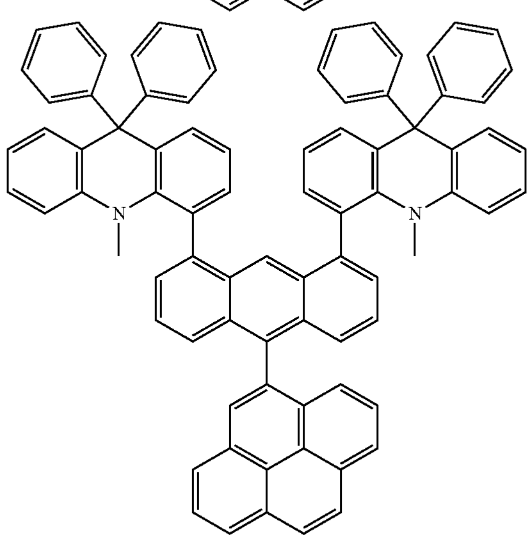
-continued
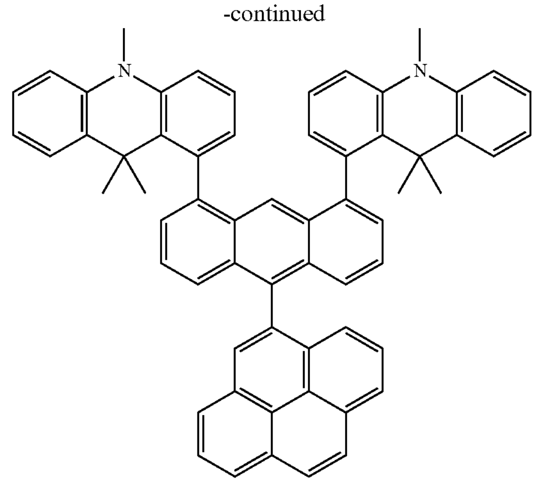
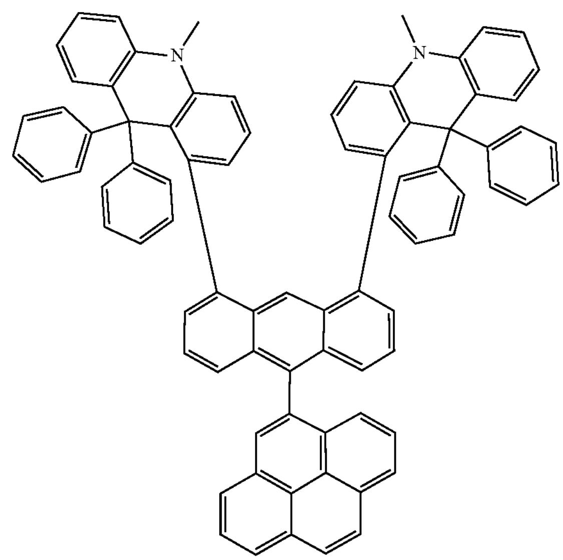
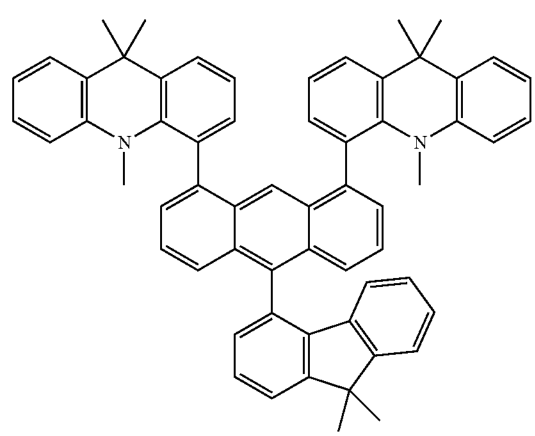

-continued
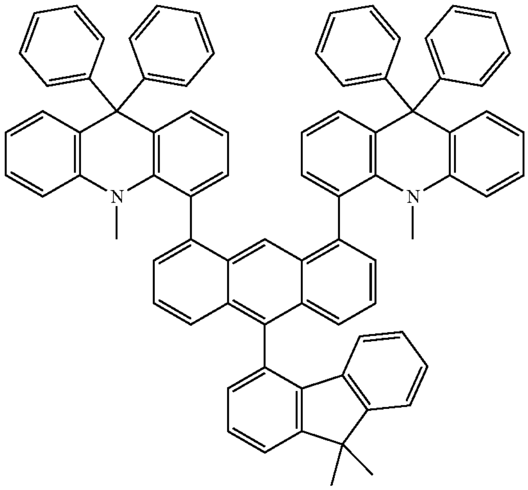
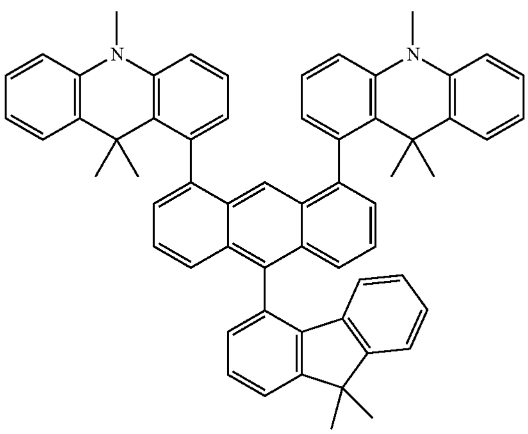
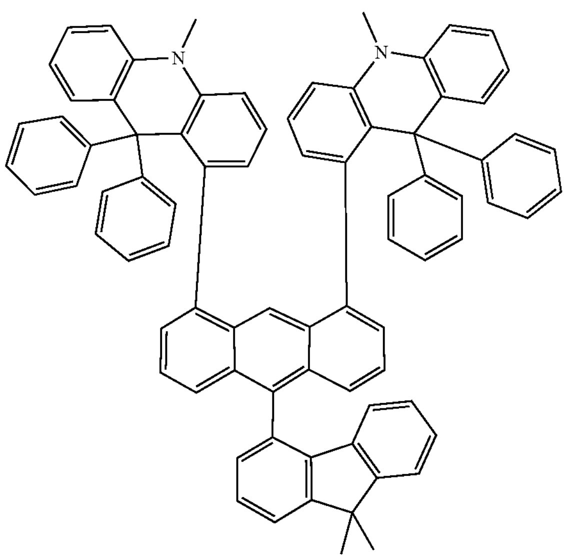
-continued
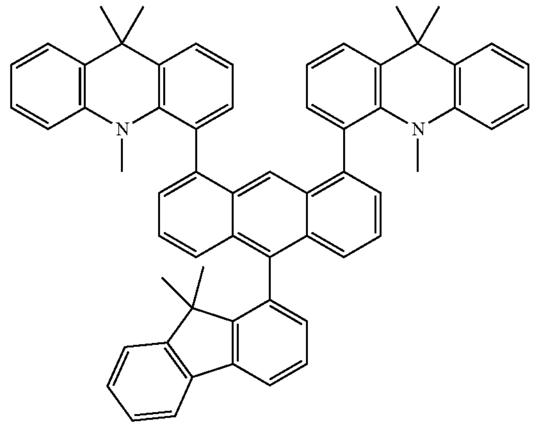
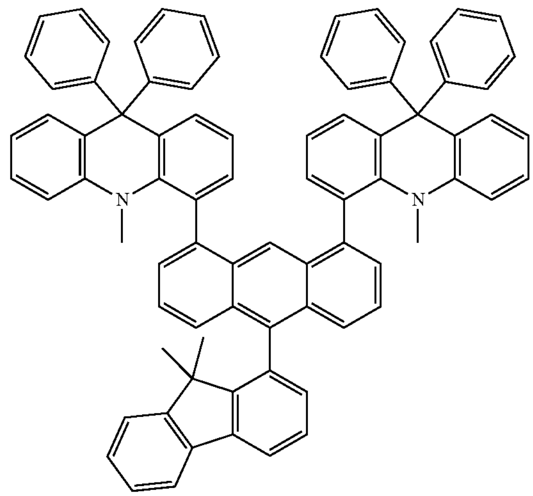
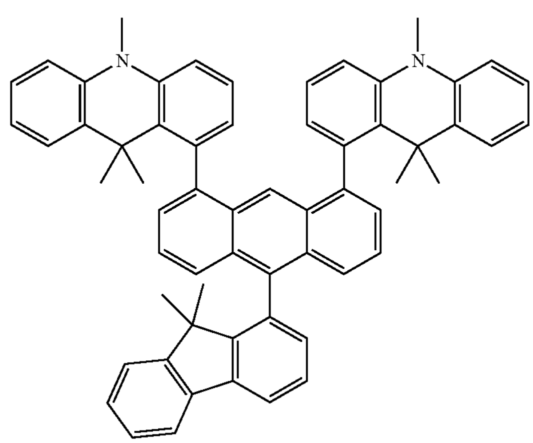

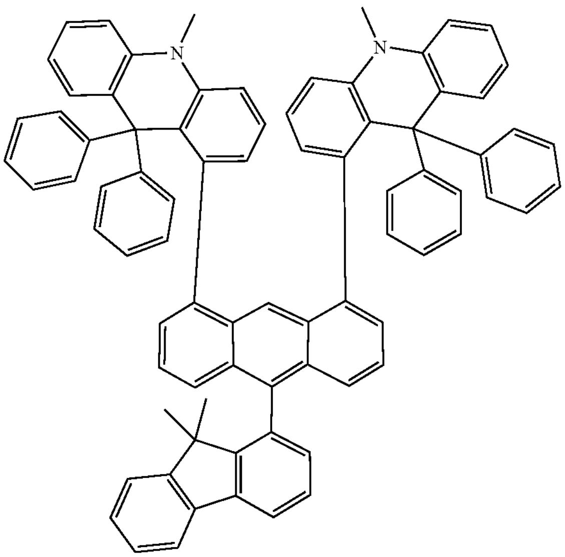
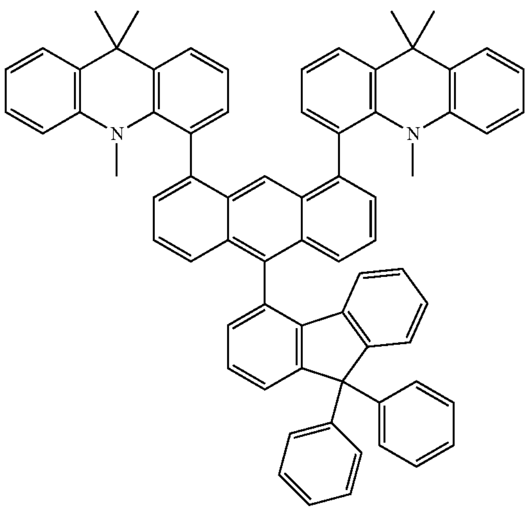
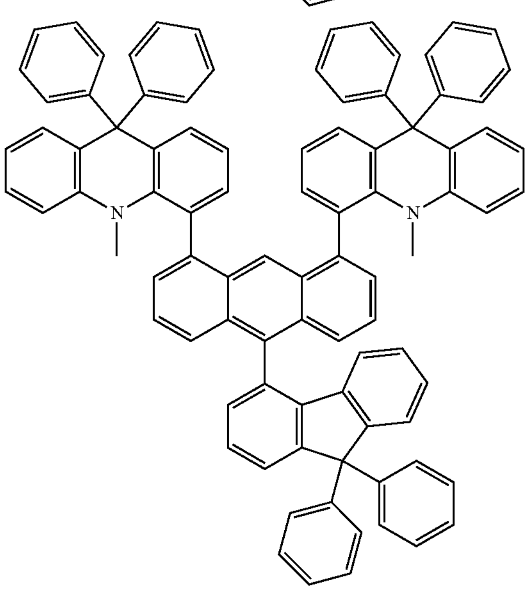
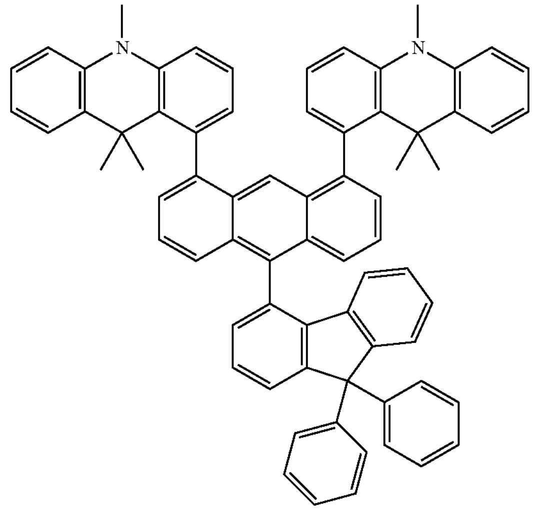
N
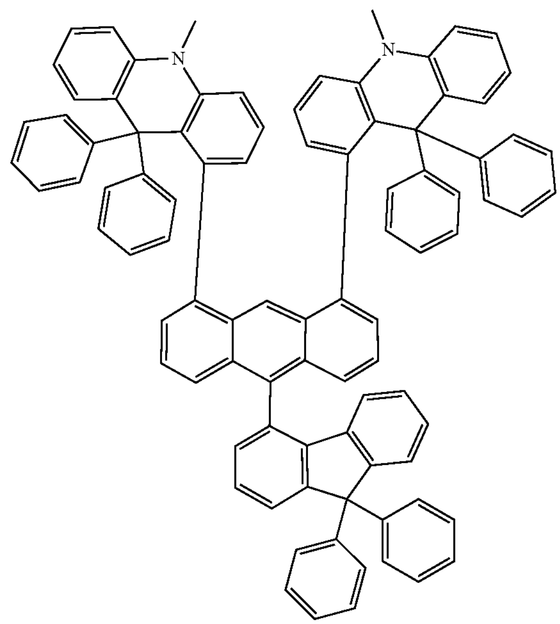
N
N
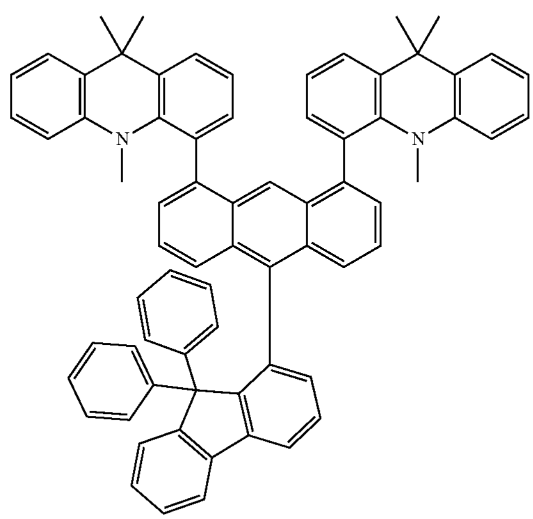
N
N -continued
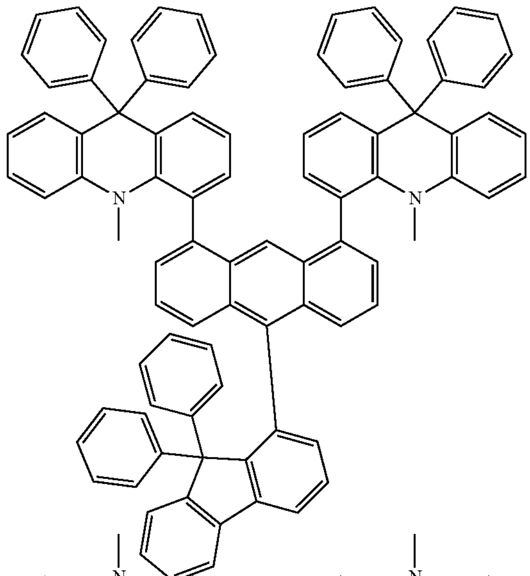
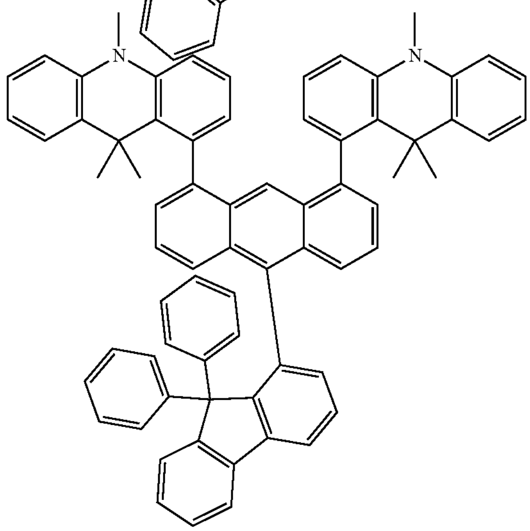
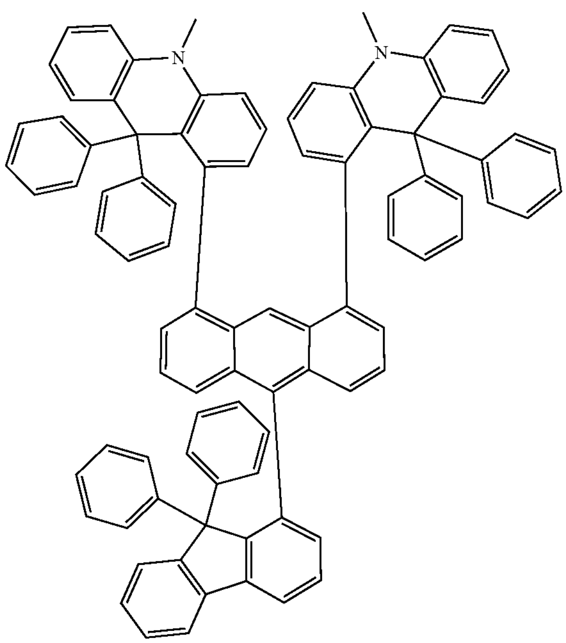
-continued
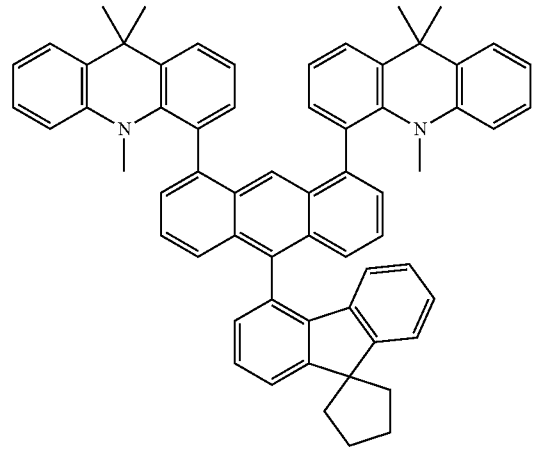
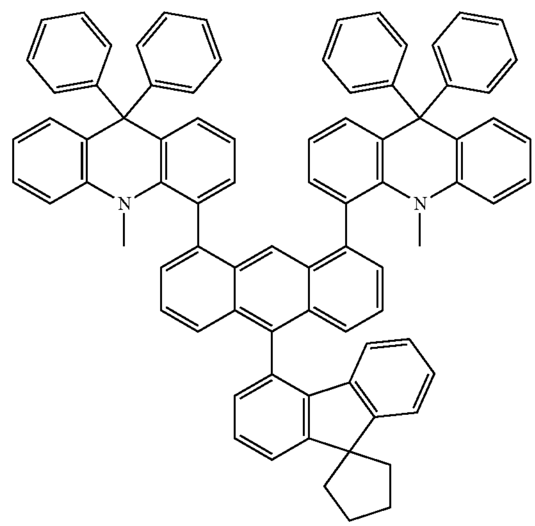
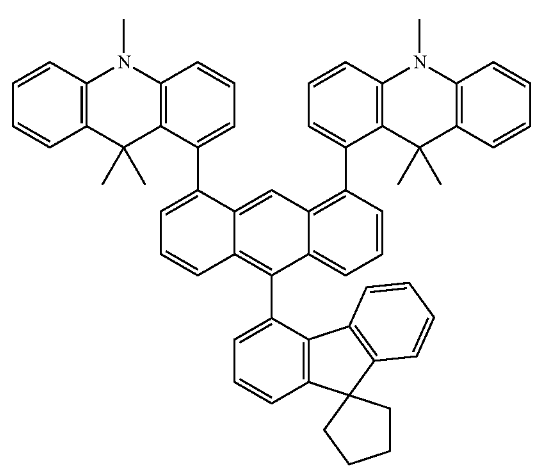

-continued
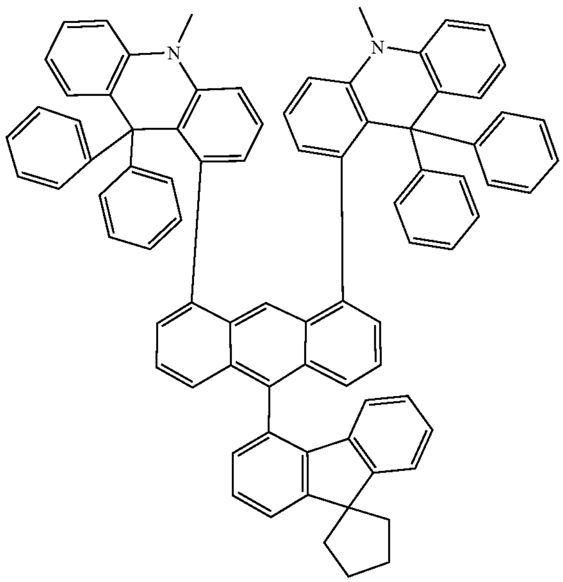
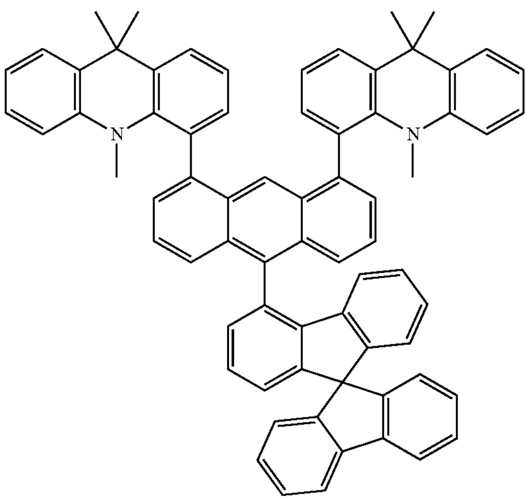
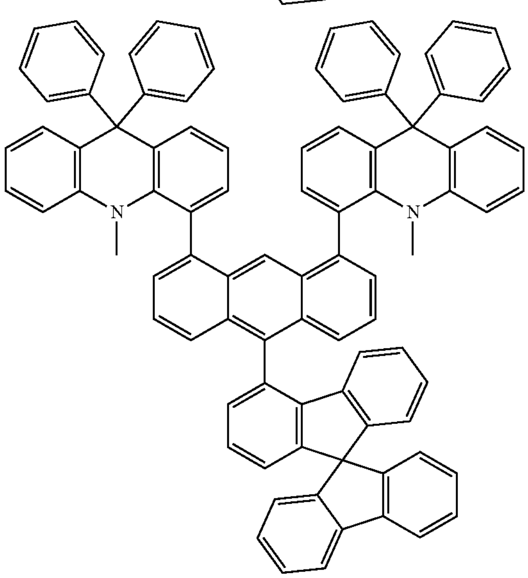
-continued
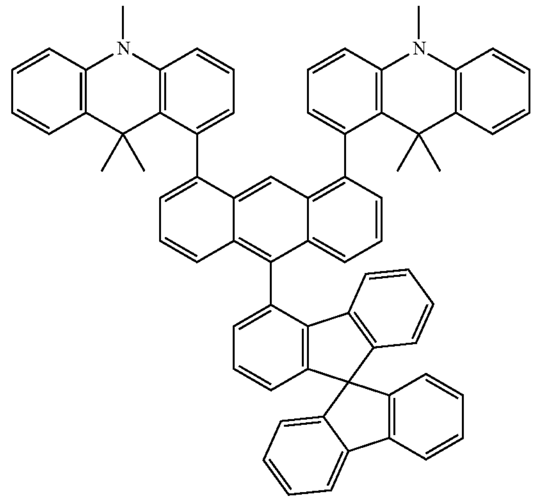
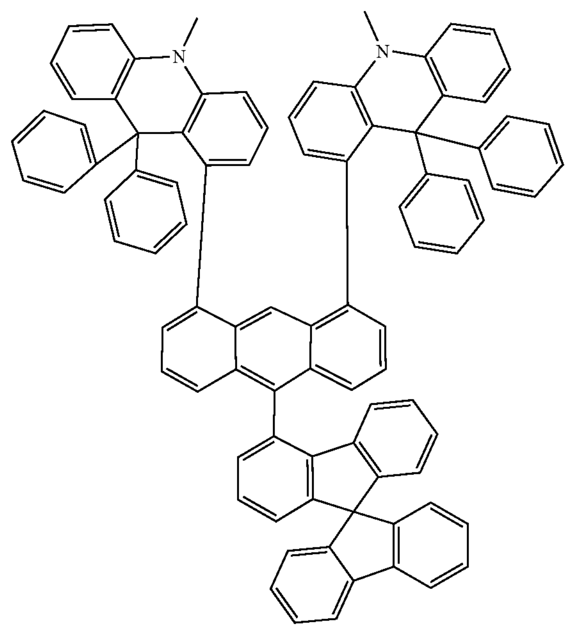
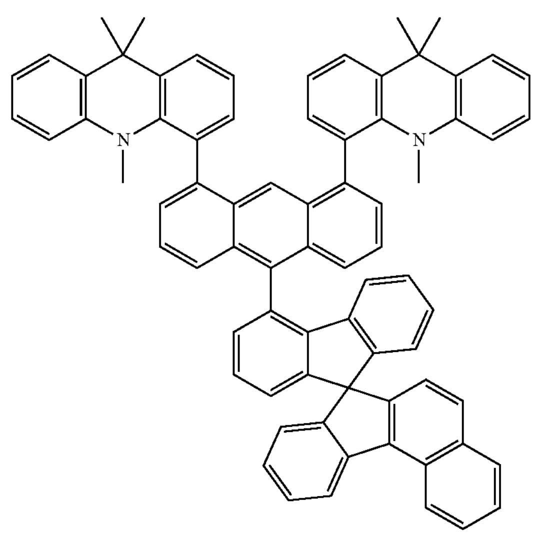

-continued
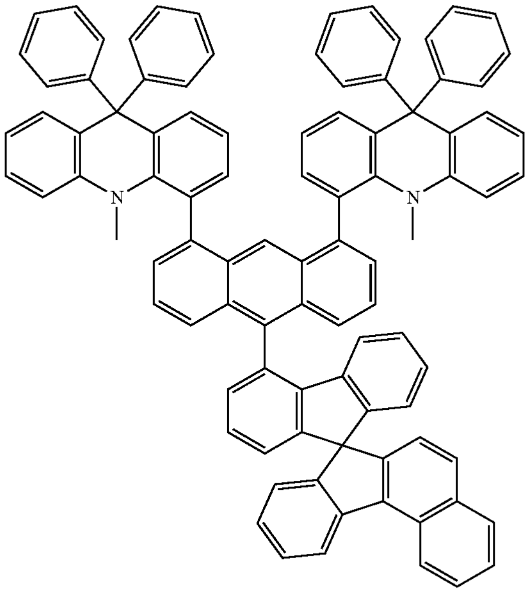
-continued
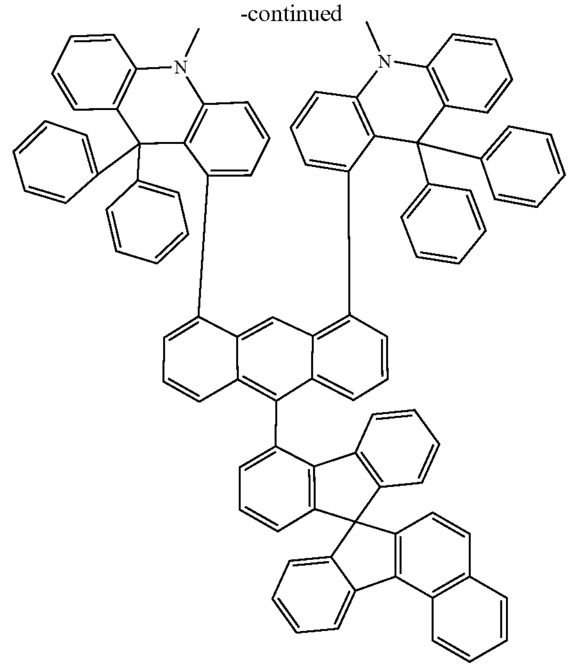
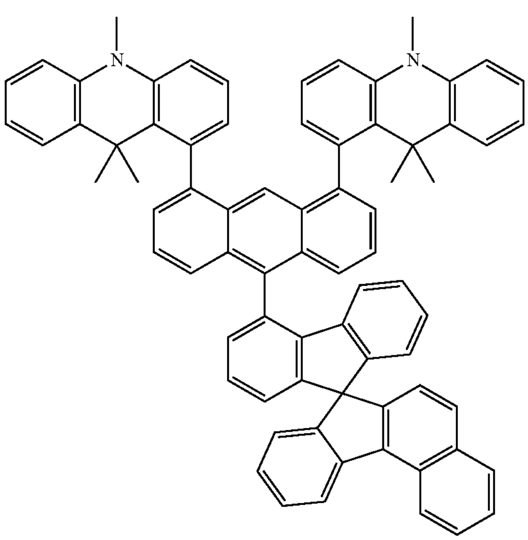
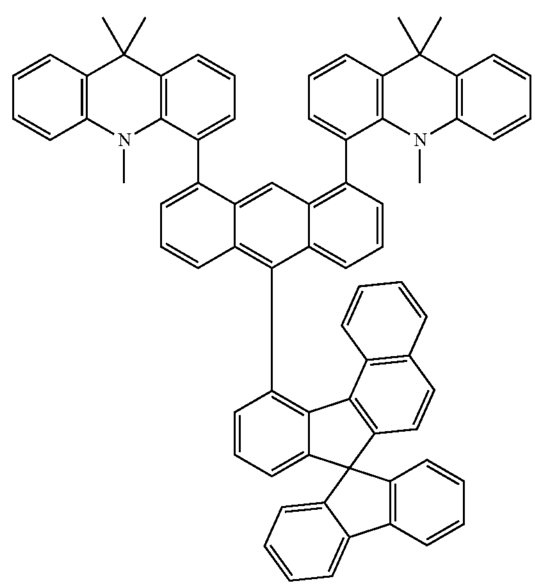

-continued
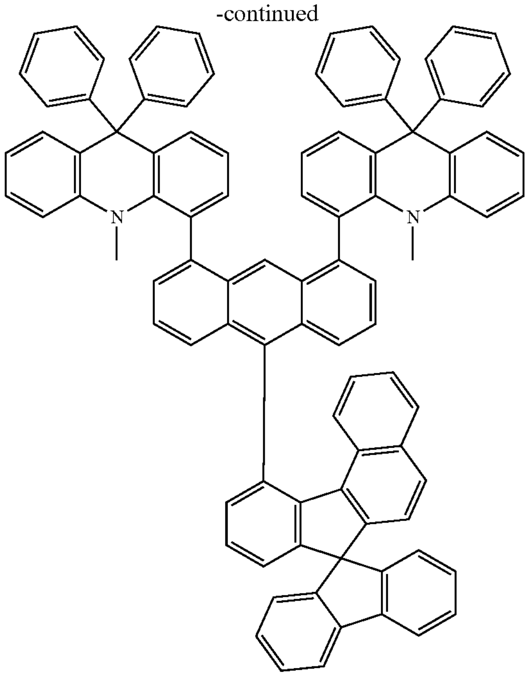
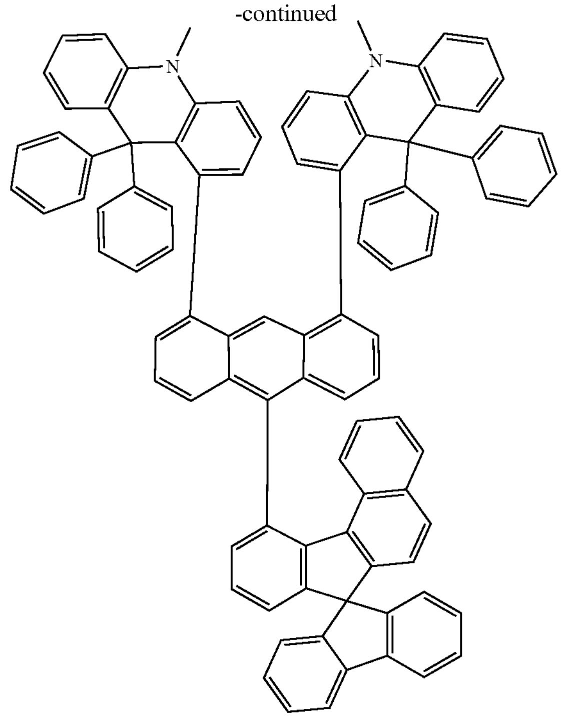
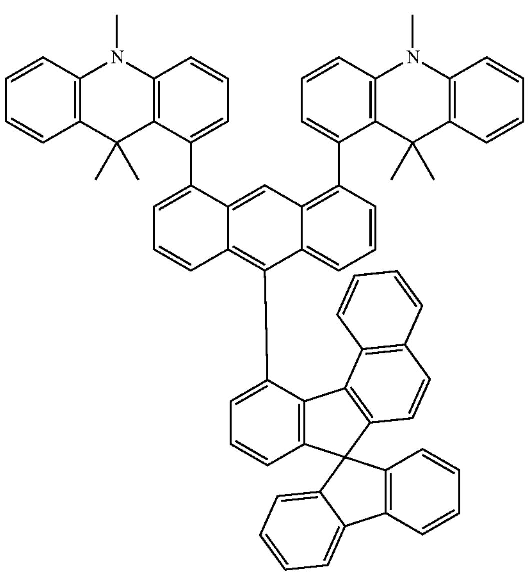
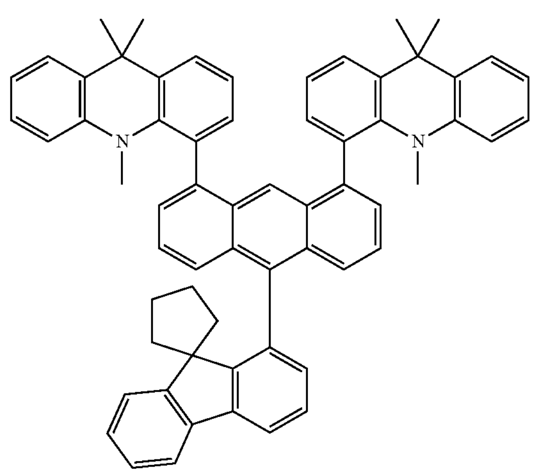

-continued
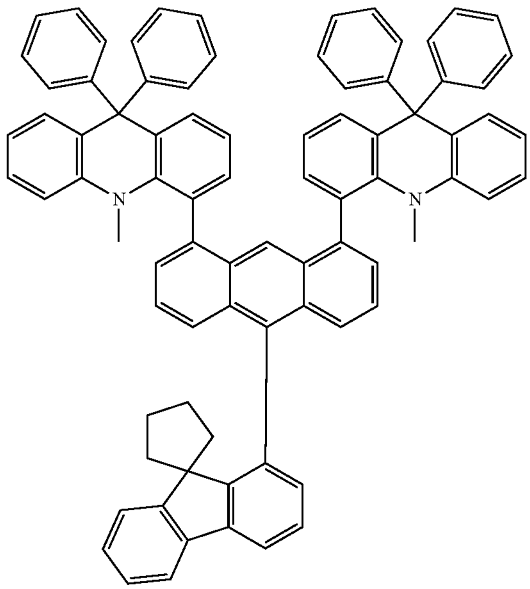
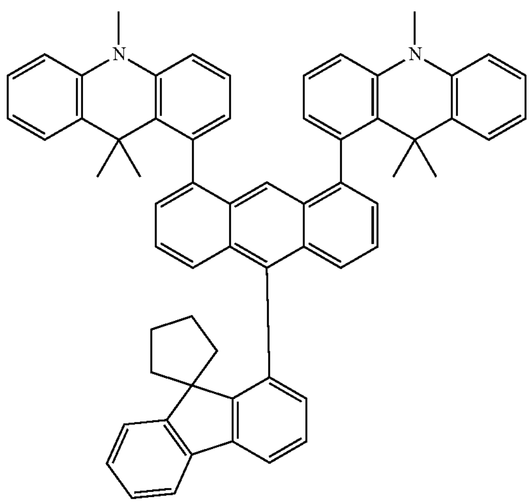
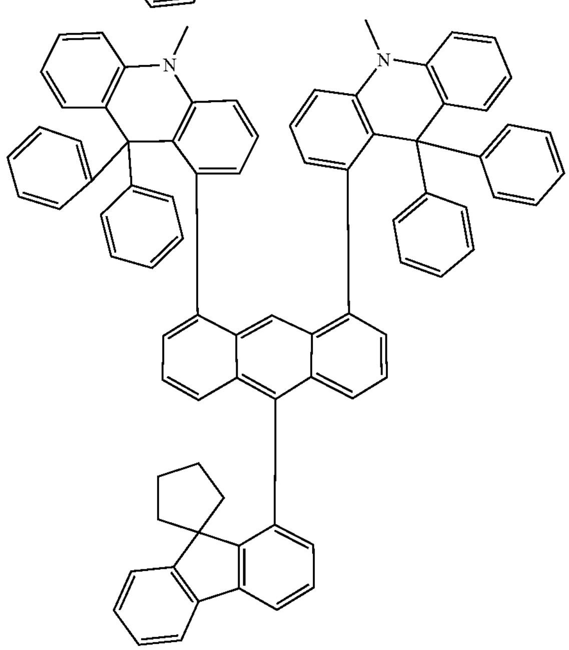
-continued
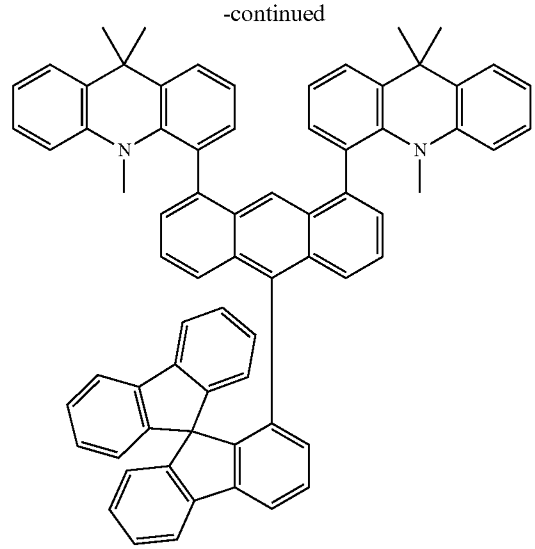
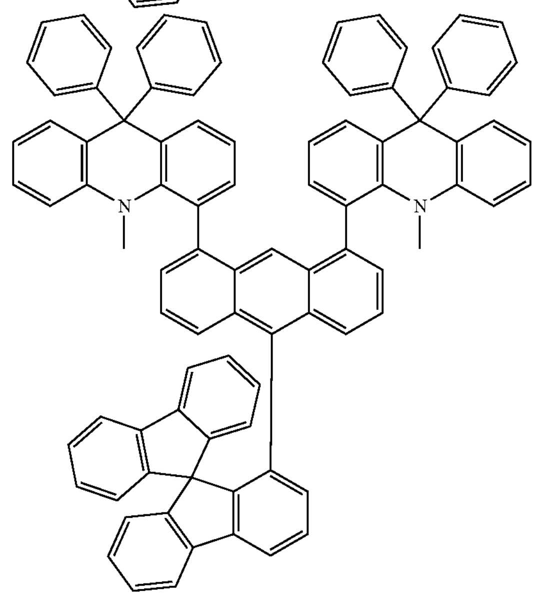
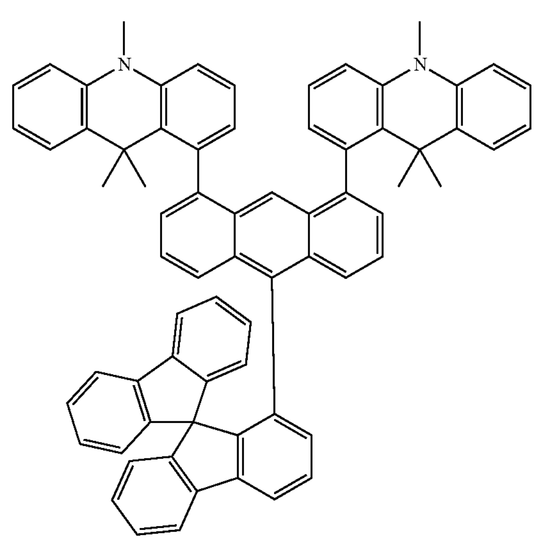

-continued
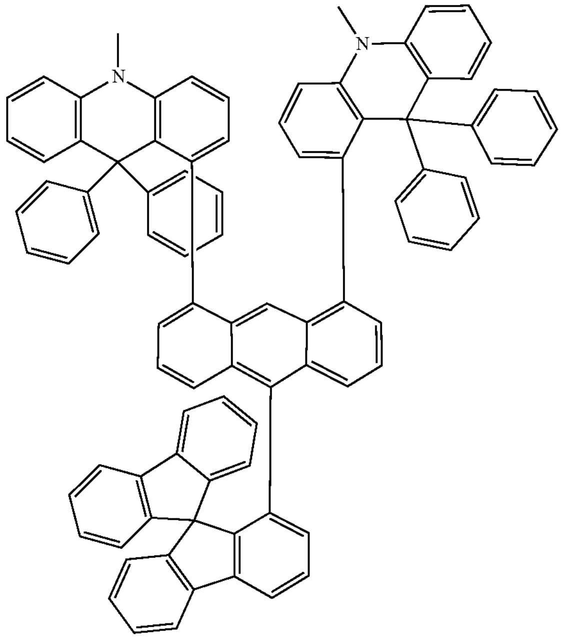
-continued
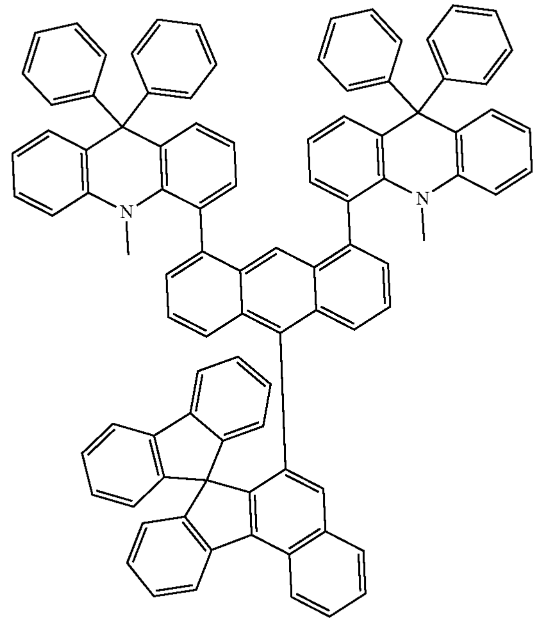
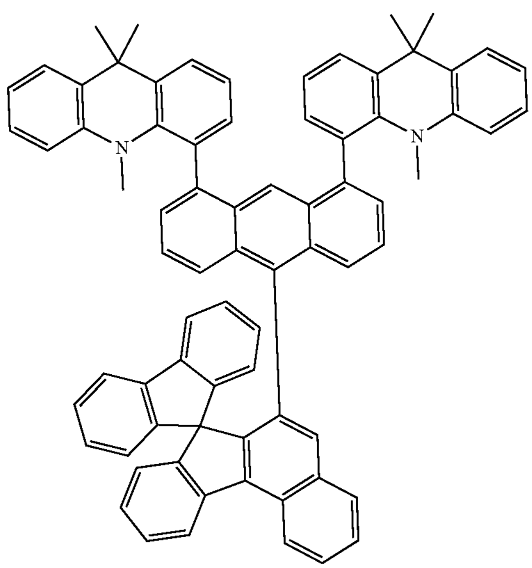
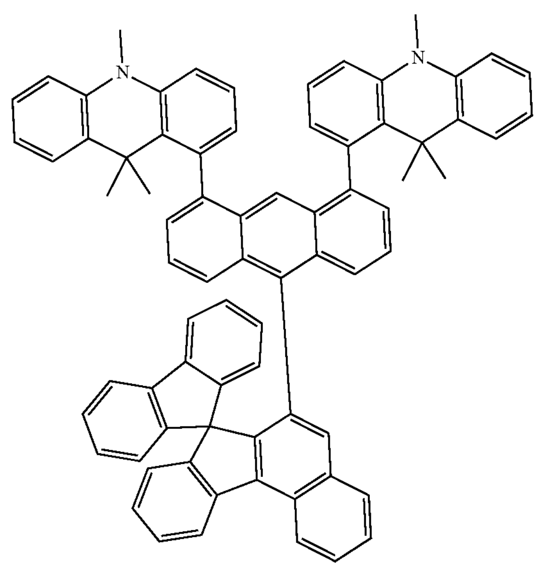

-continued
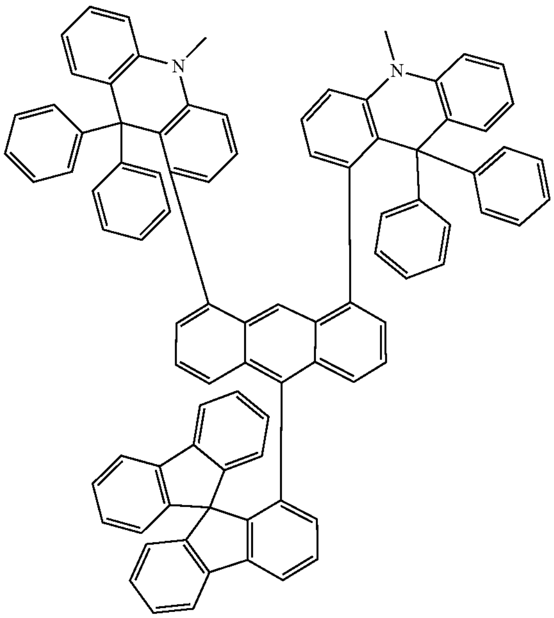
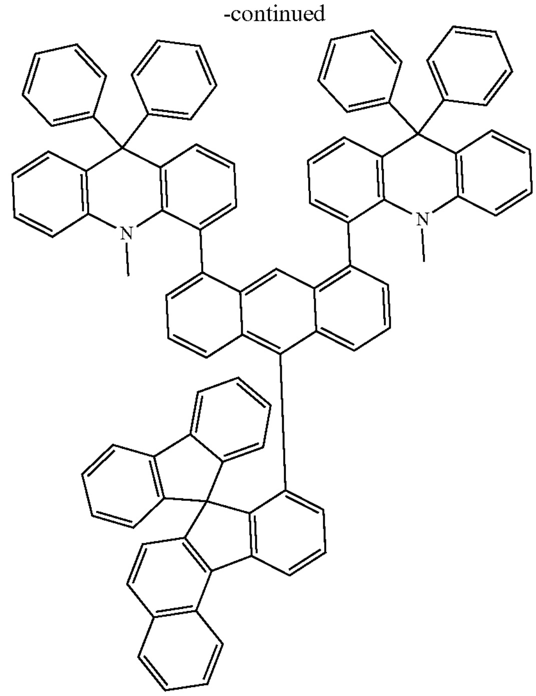
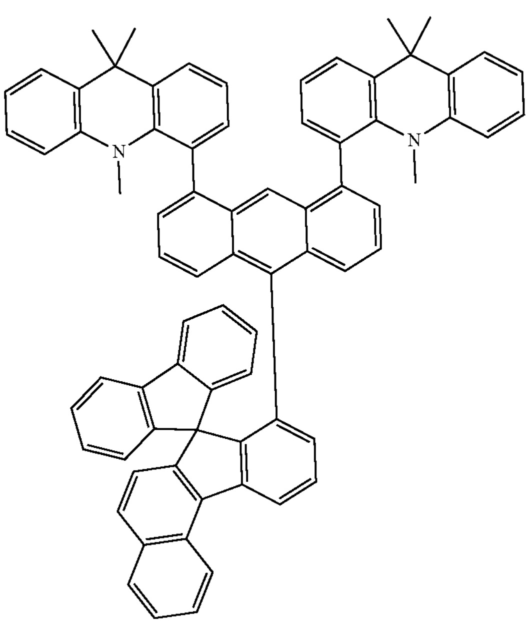
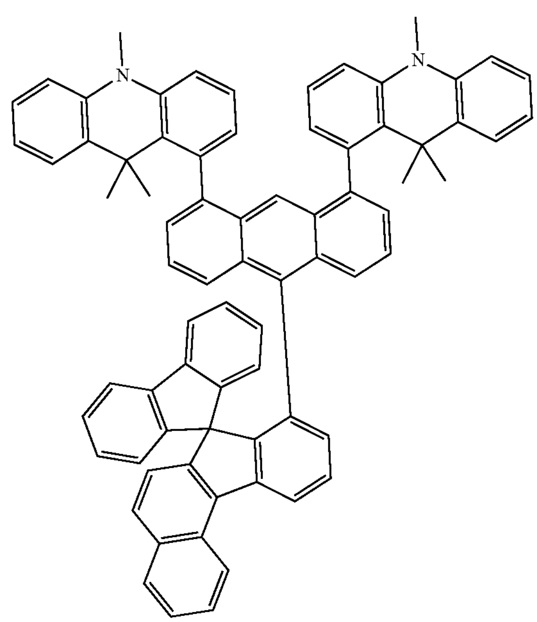
-continued

-continued
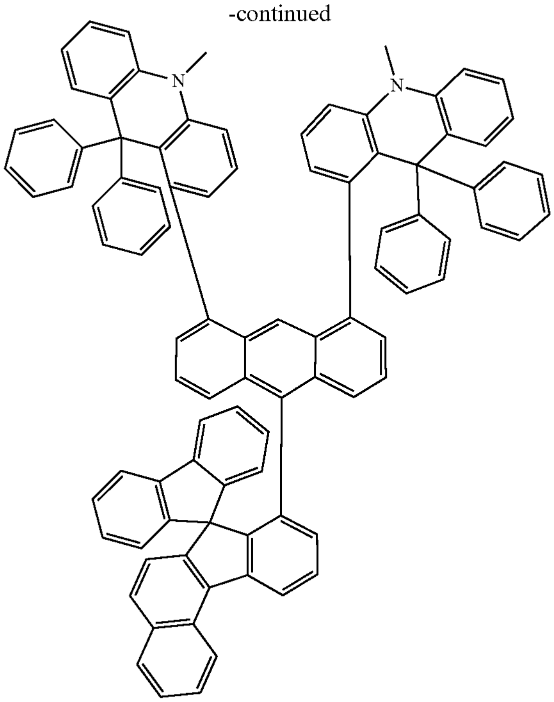
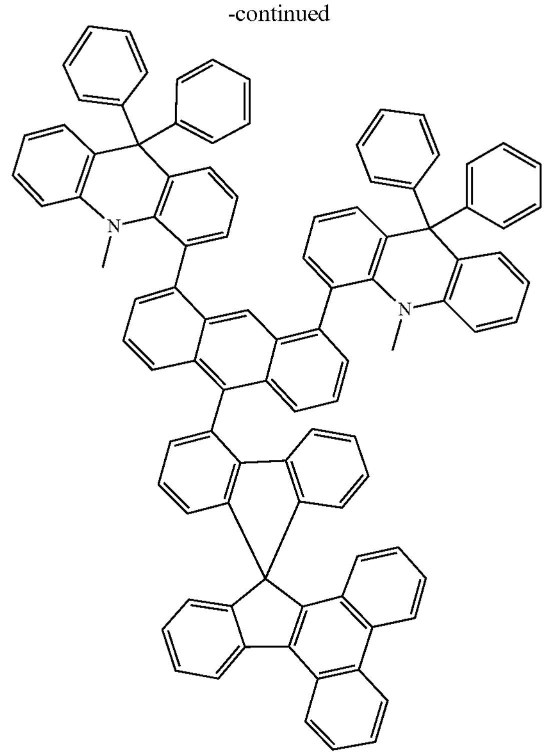
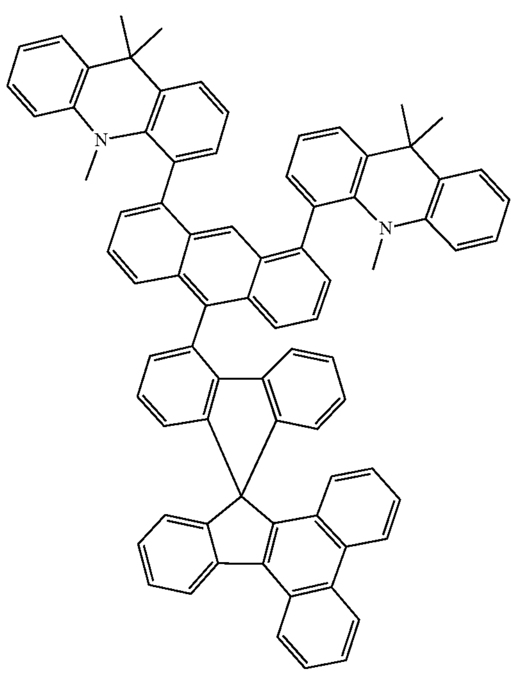
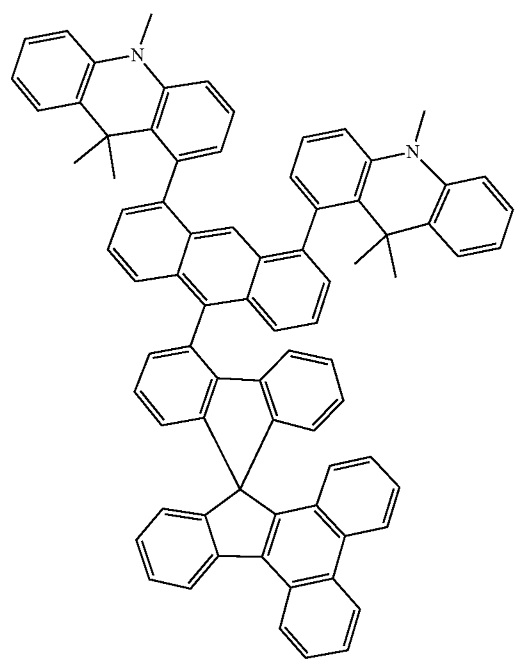

-continued
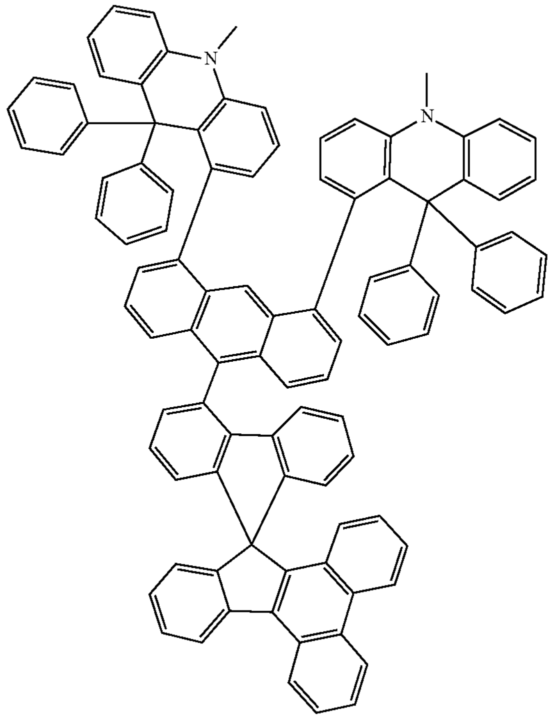
-continued
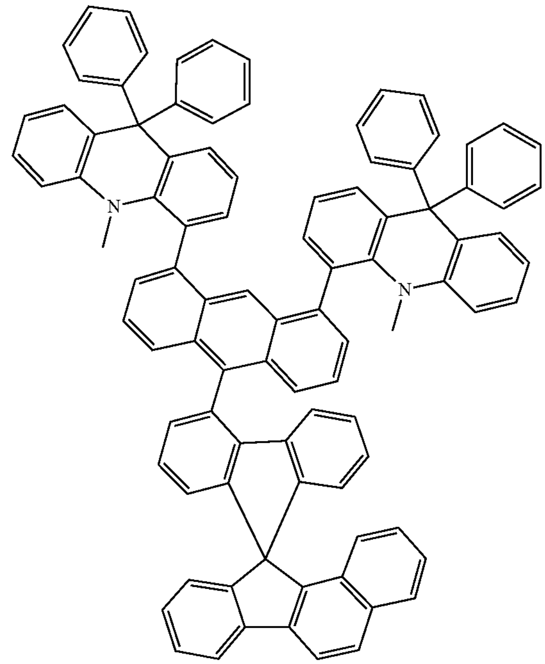
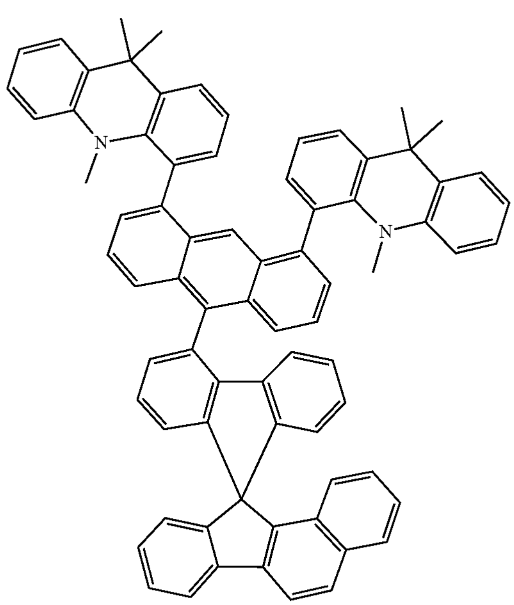
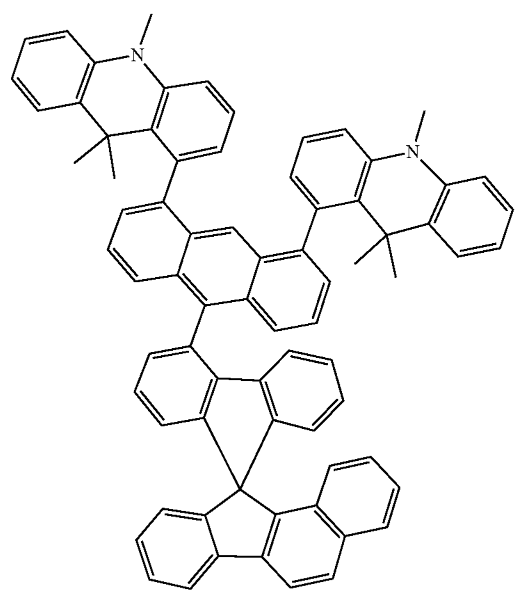

-continued
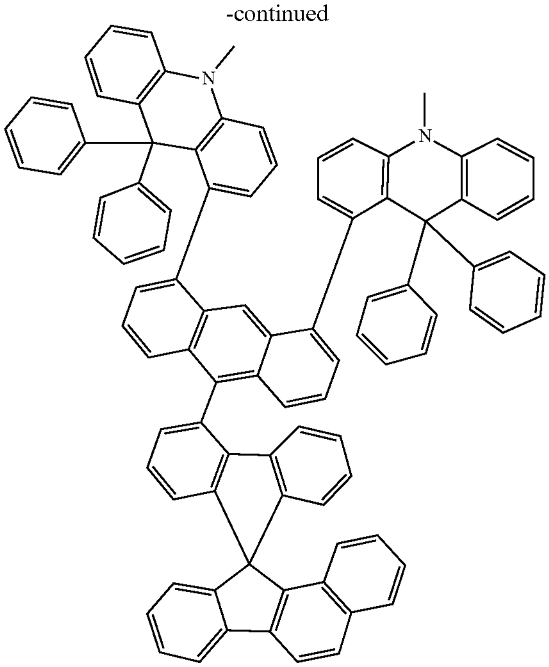
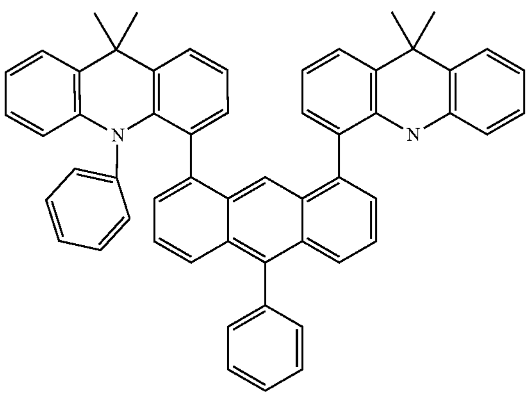
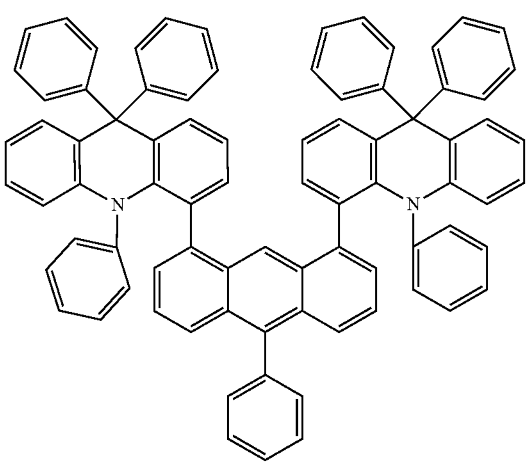
-continued
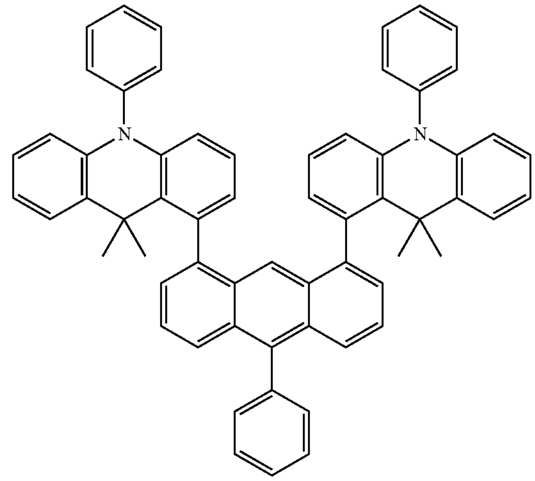
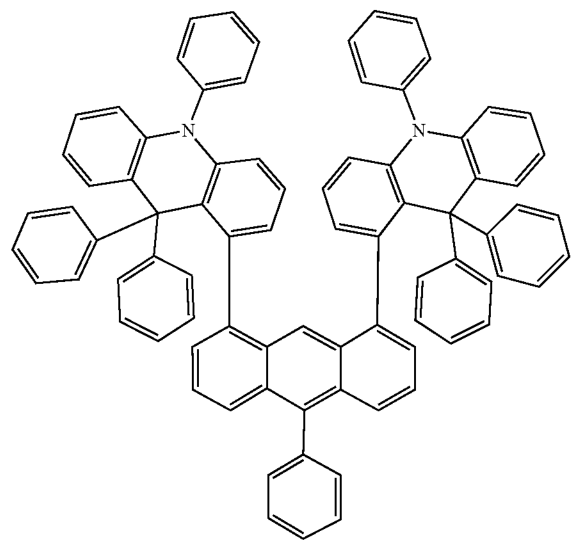
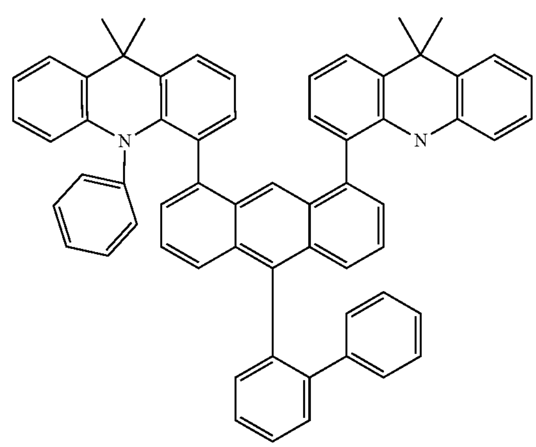

-continued
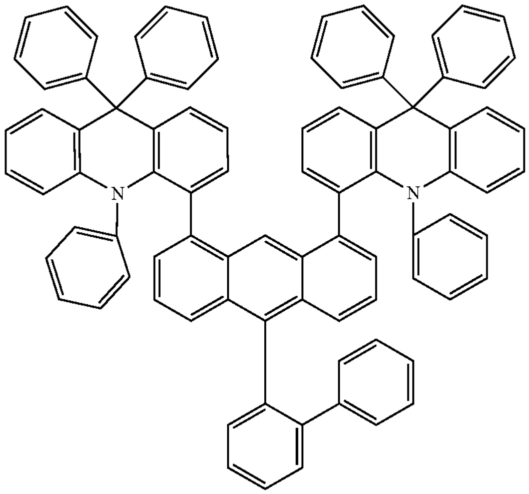
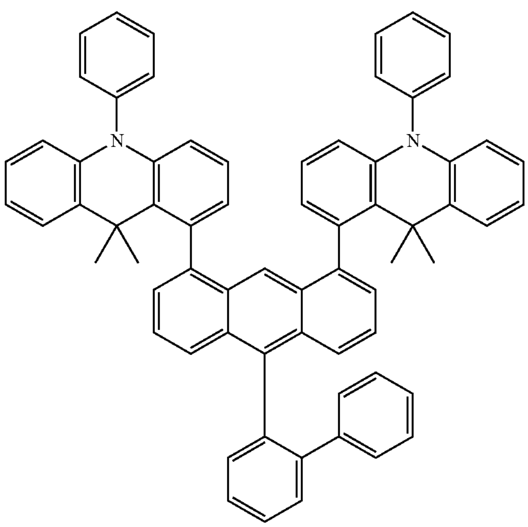
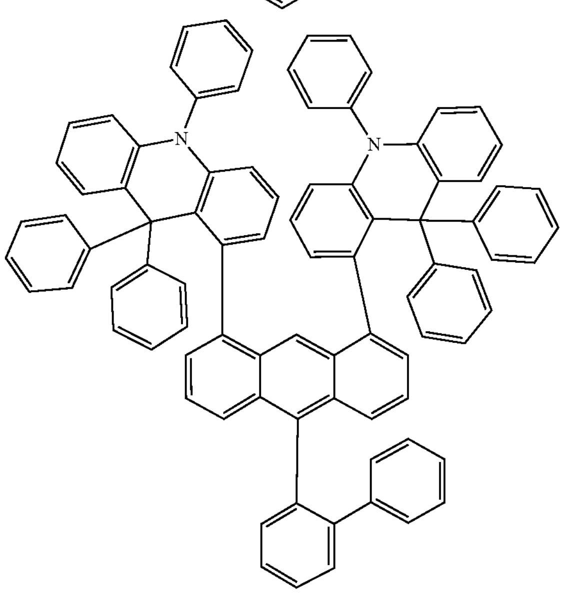
-continued
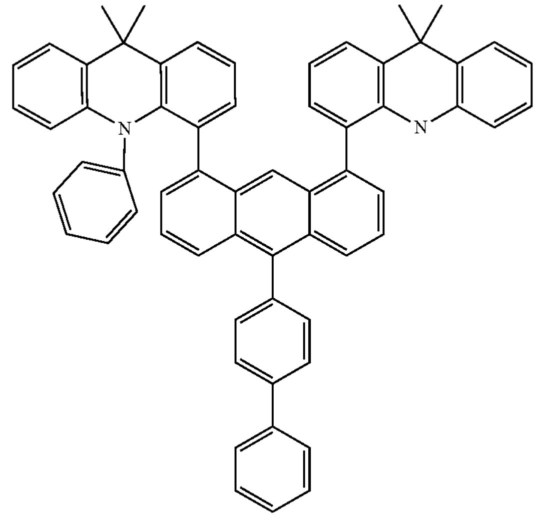
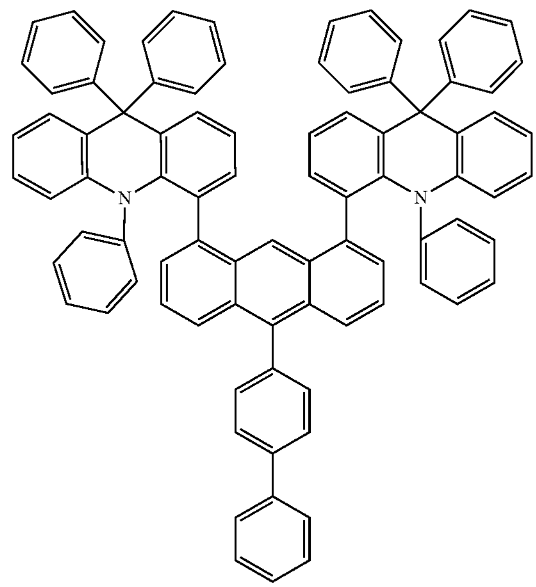
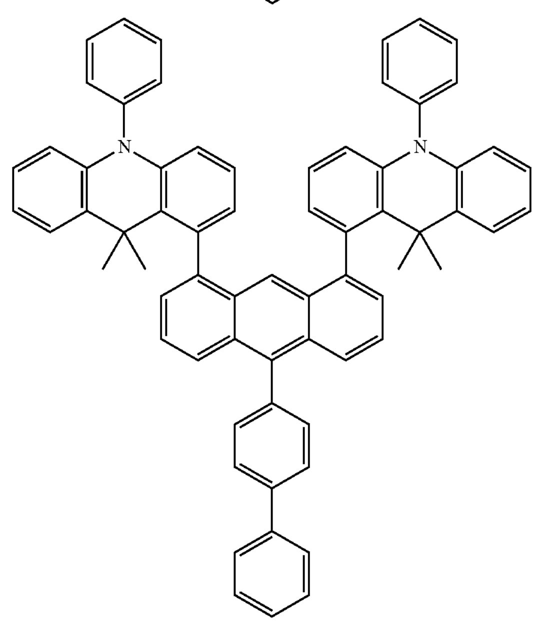

-continued
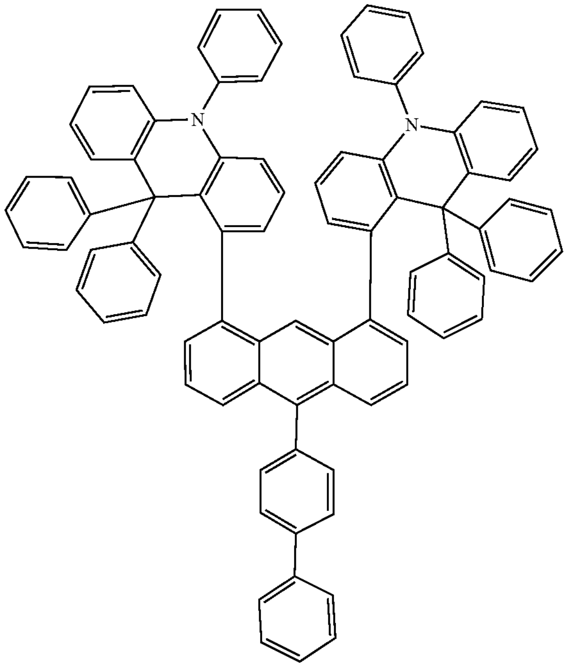
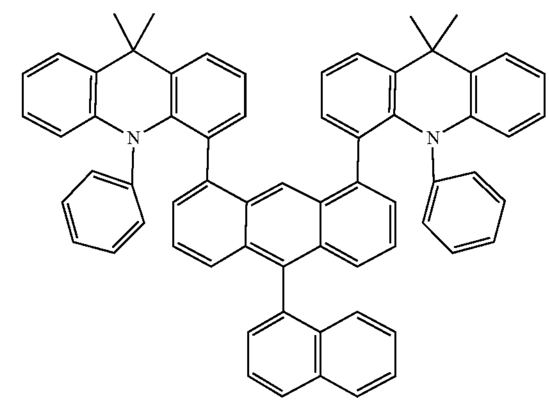
-continued
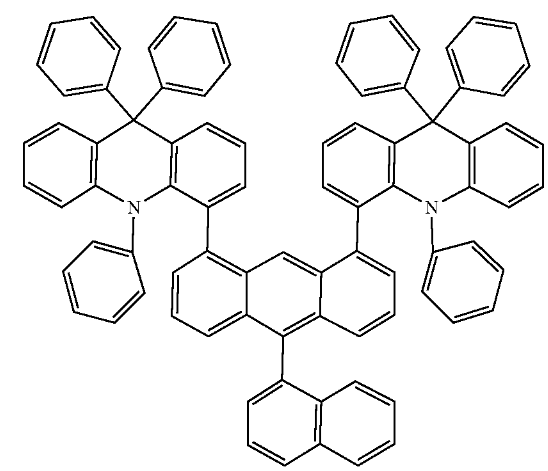
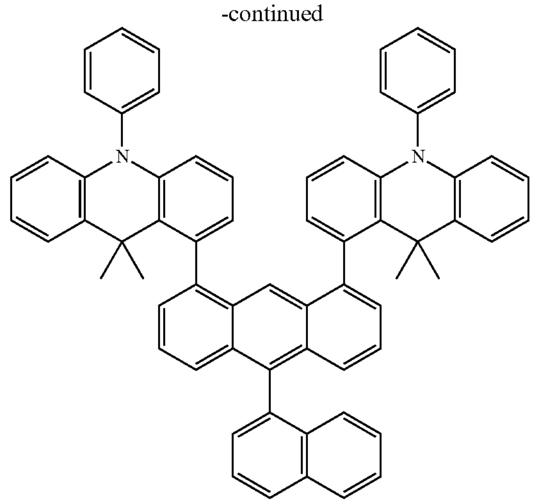
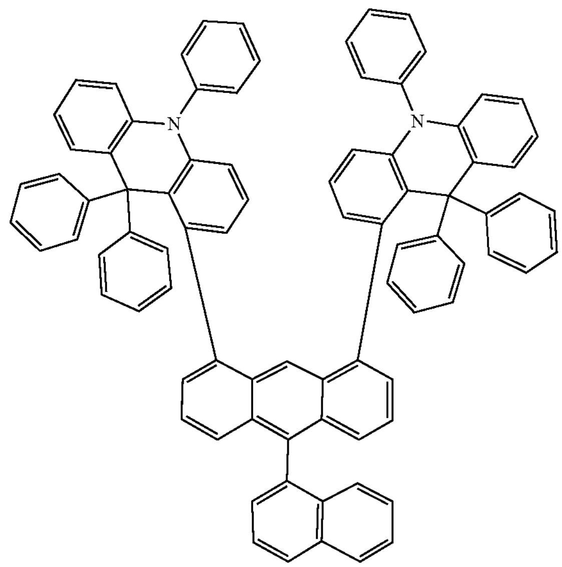
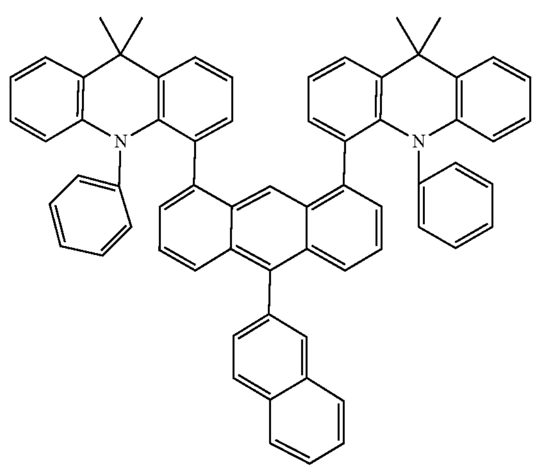

-continued
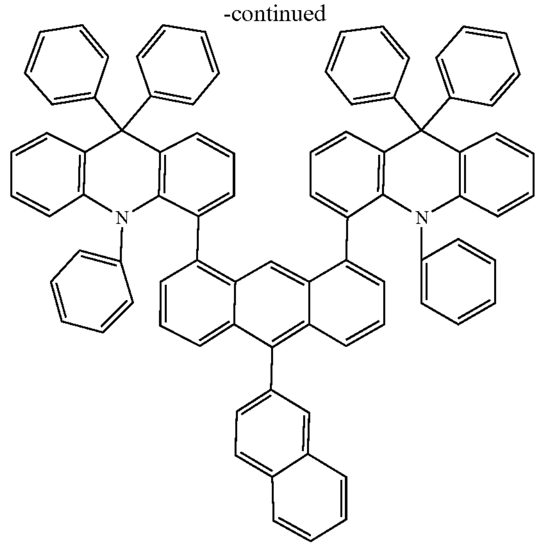
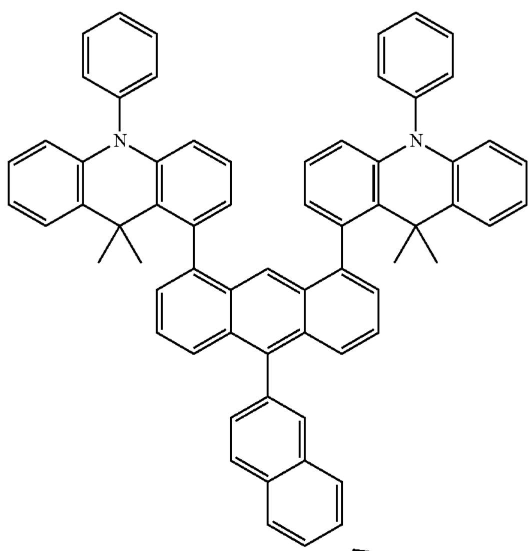
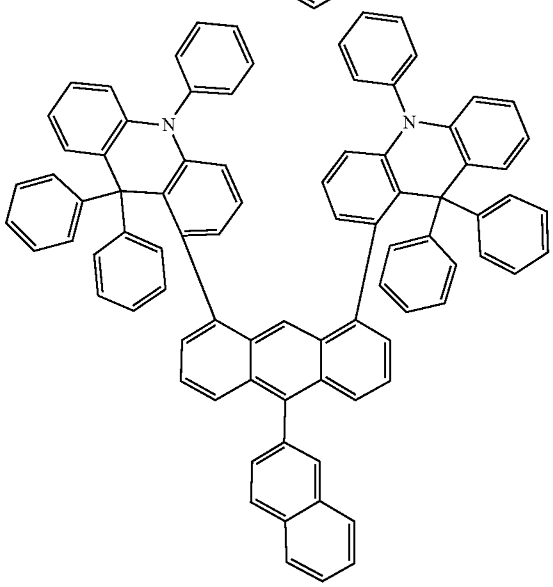
-continued
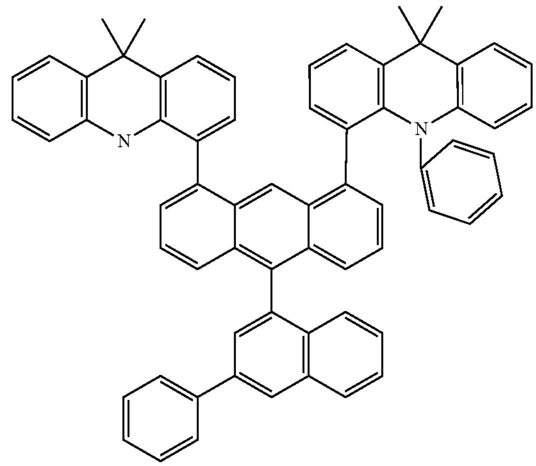
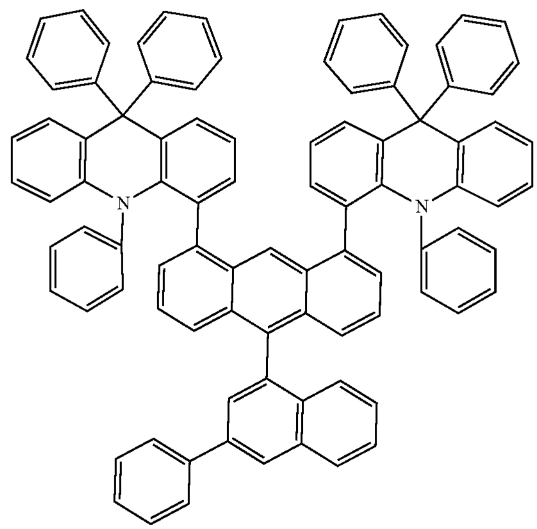
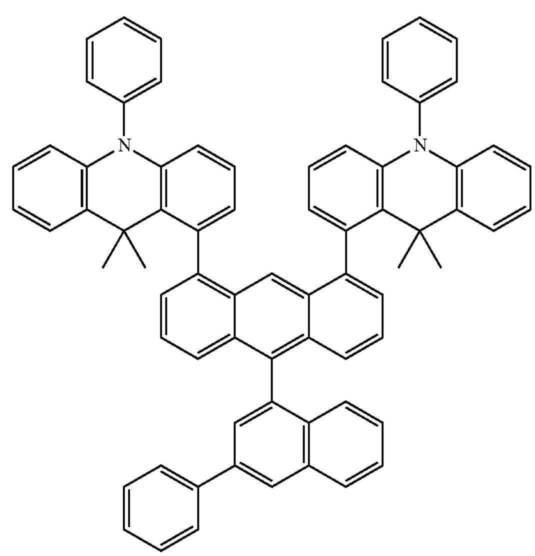

-continued
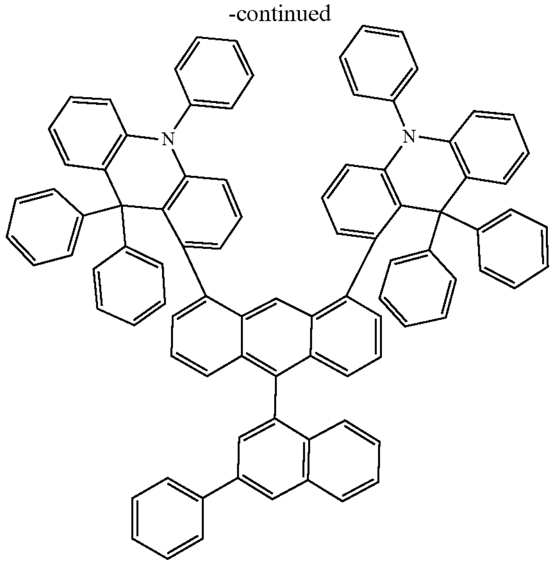
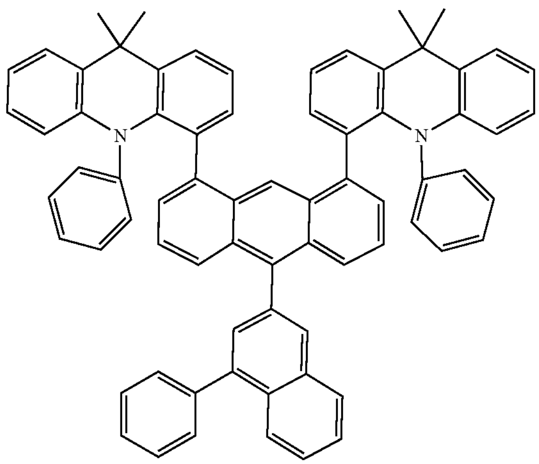
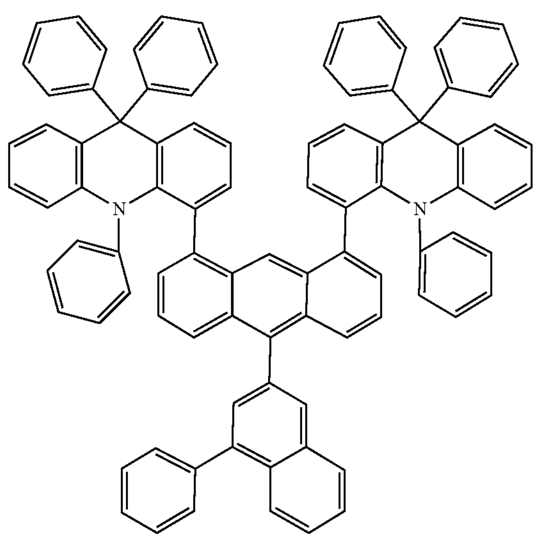
-continued
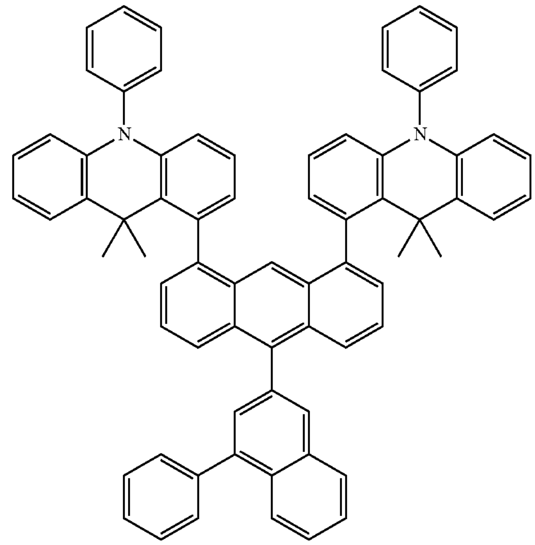
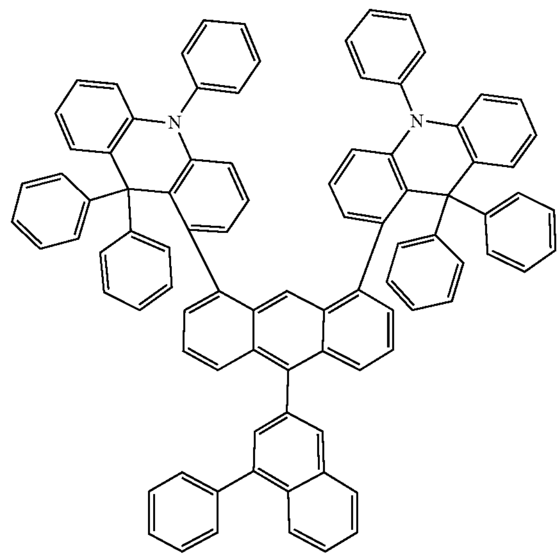
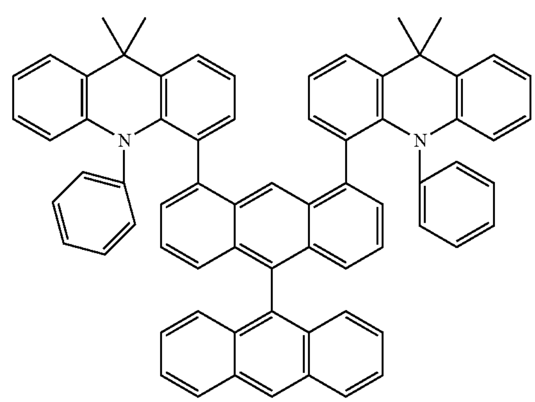

-continued
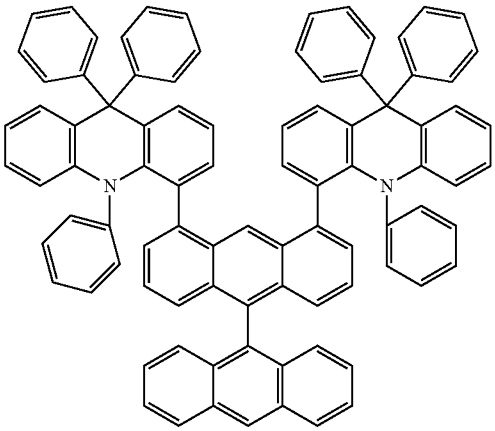
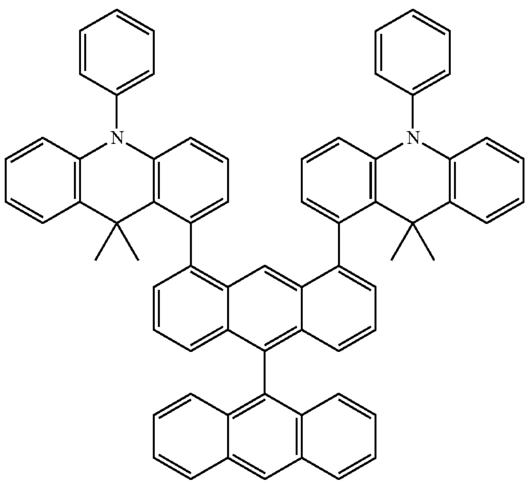
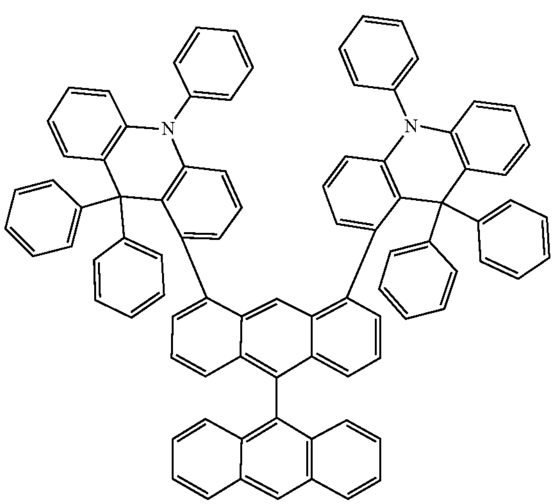
-continued
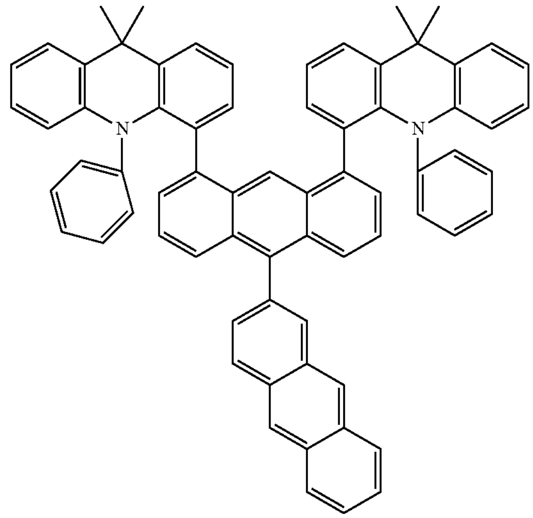
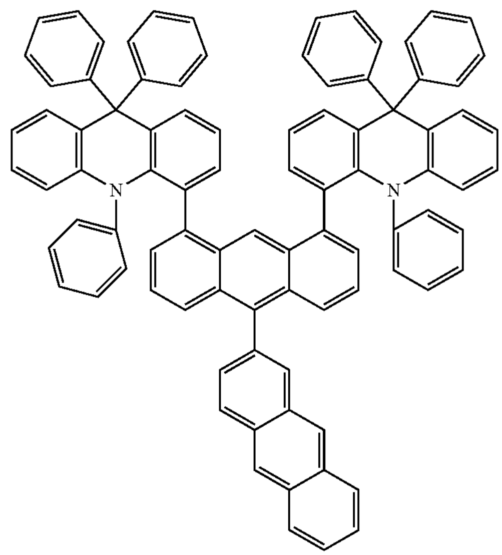
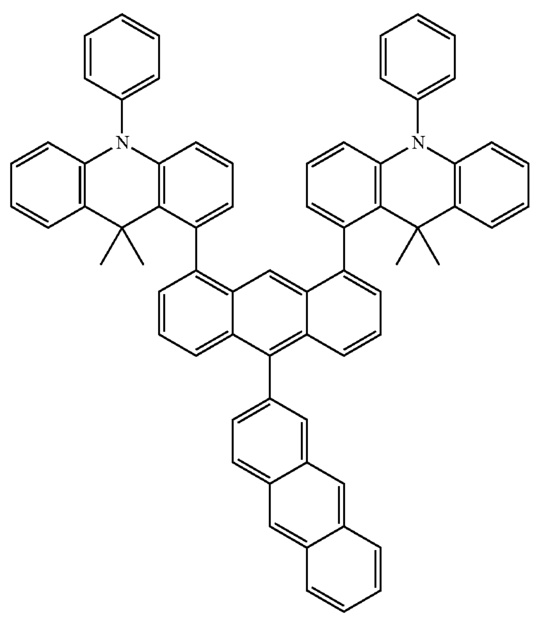

-continued
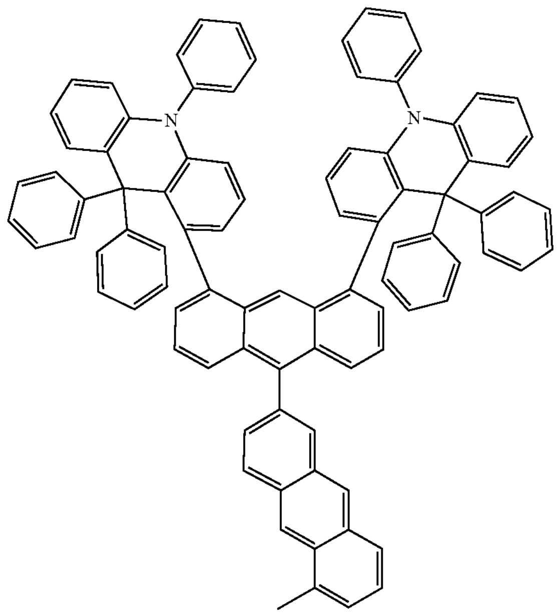
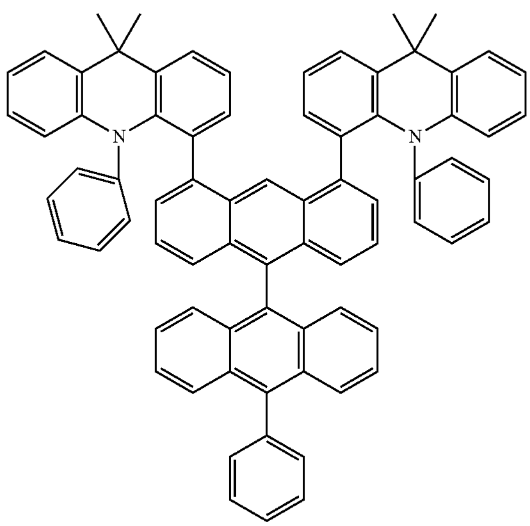
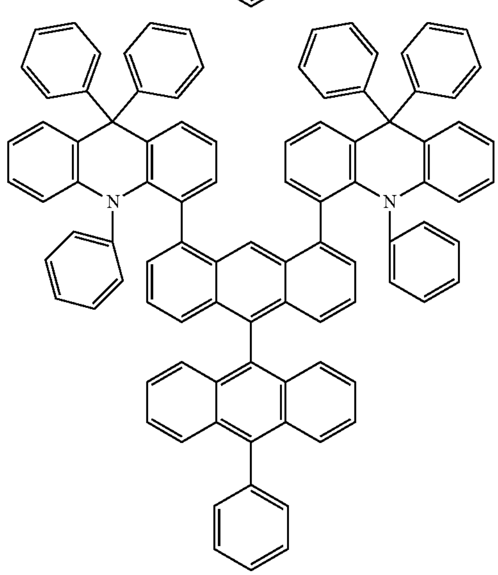
-continued
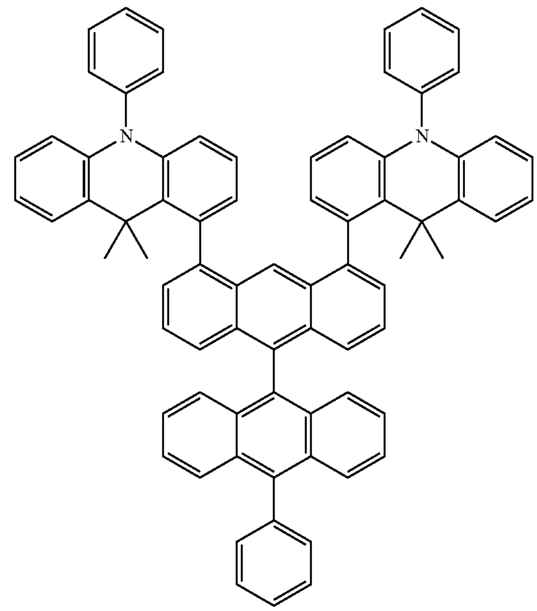
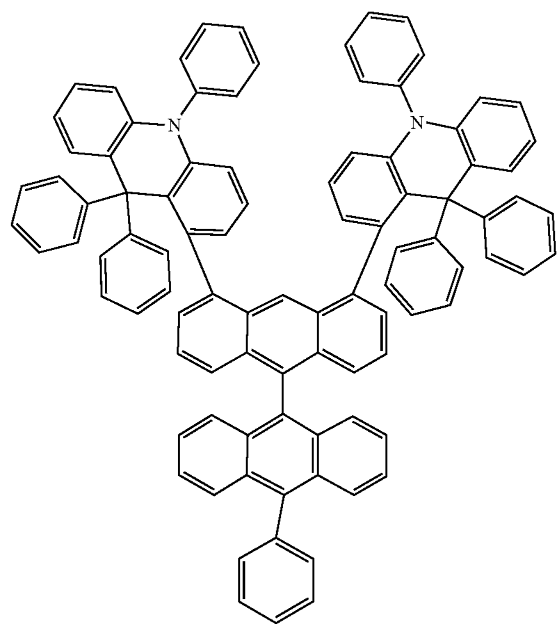
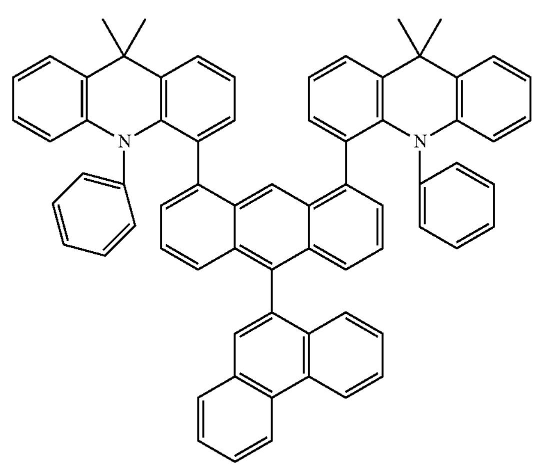

-continued
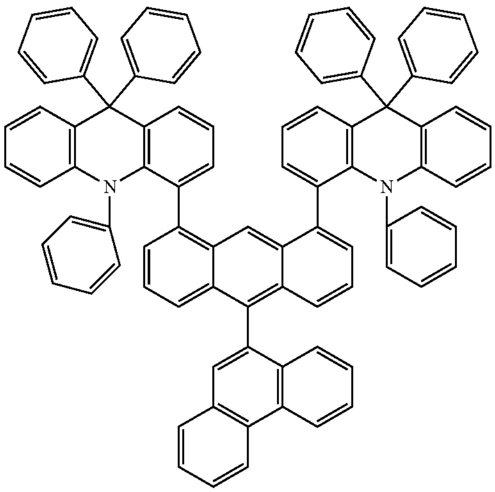
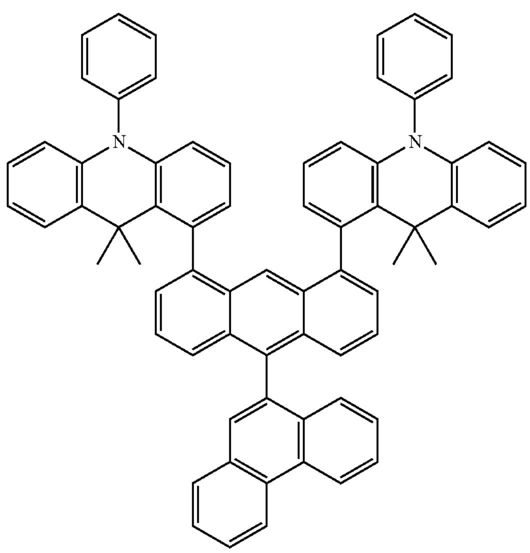
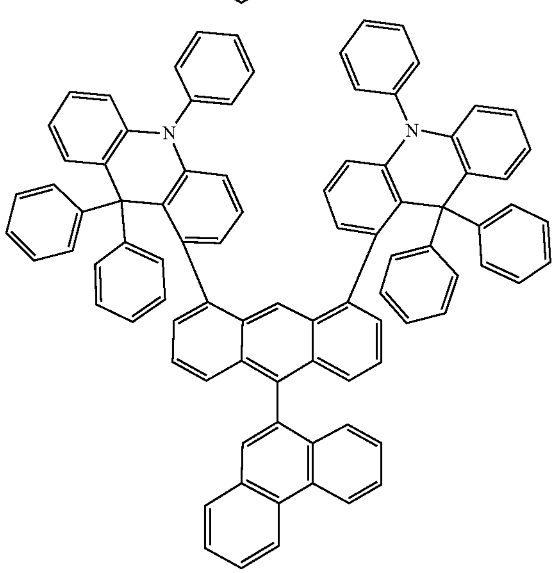
-continued
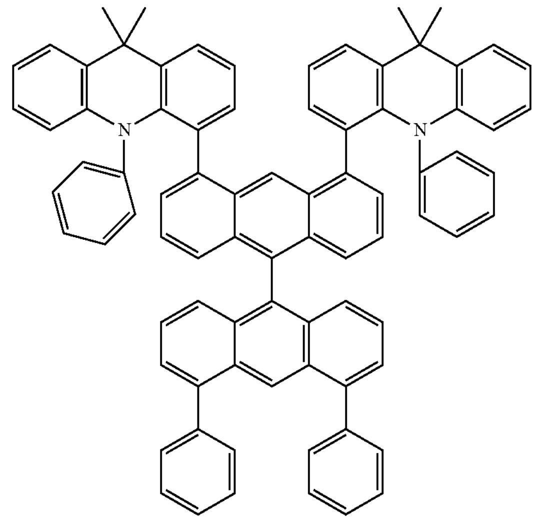
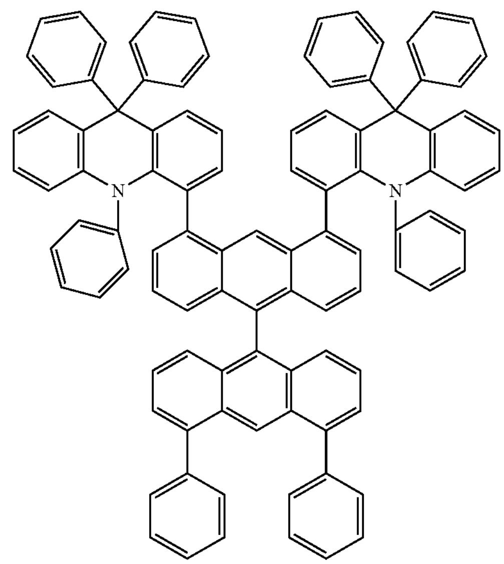
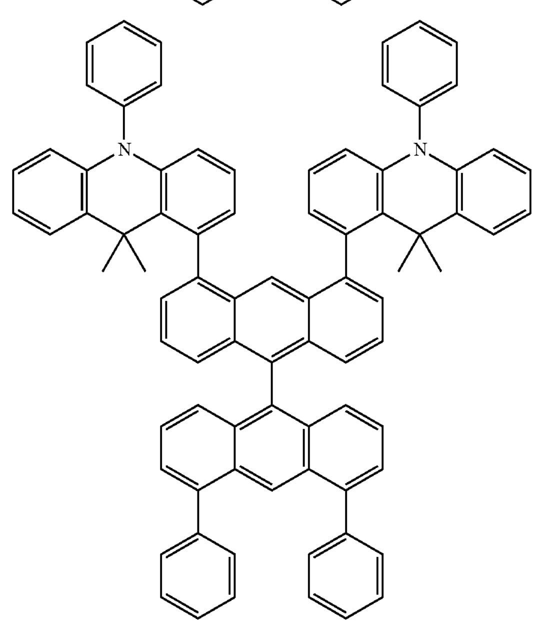

-continued
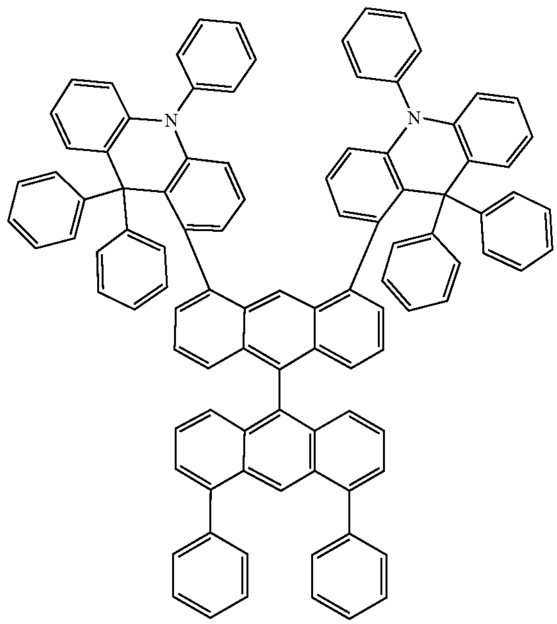
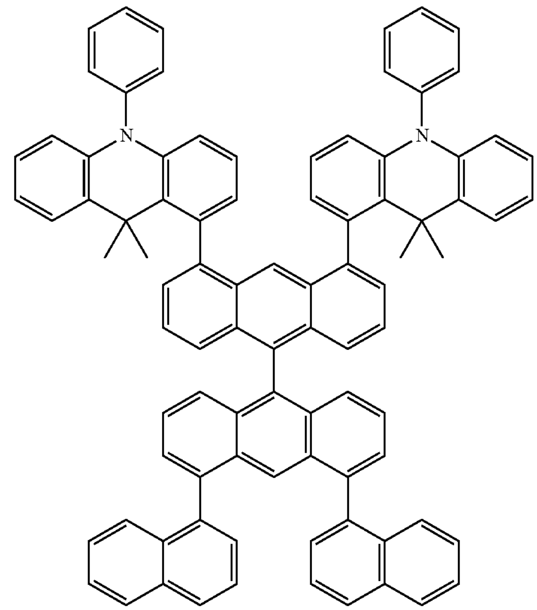
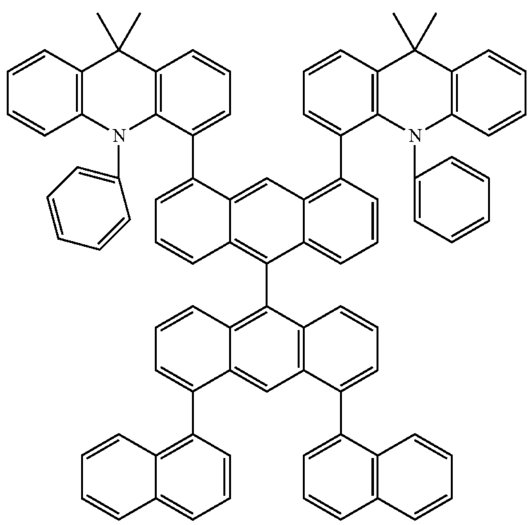
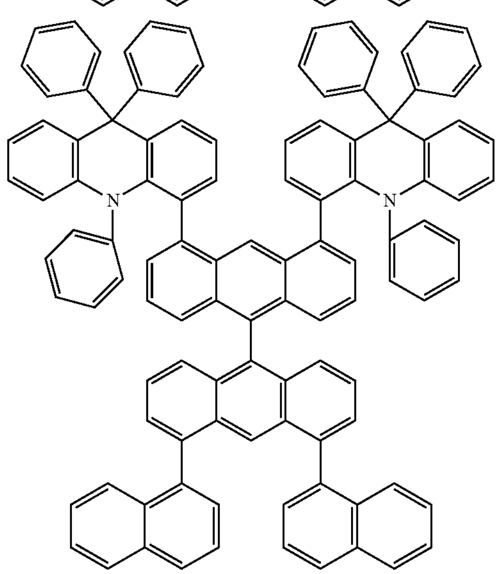
-continued
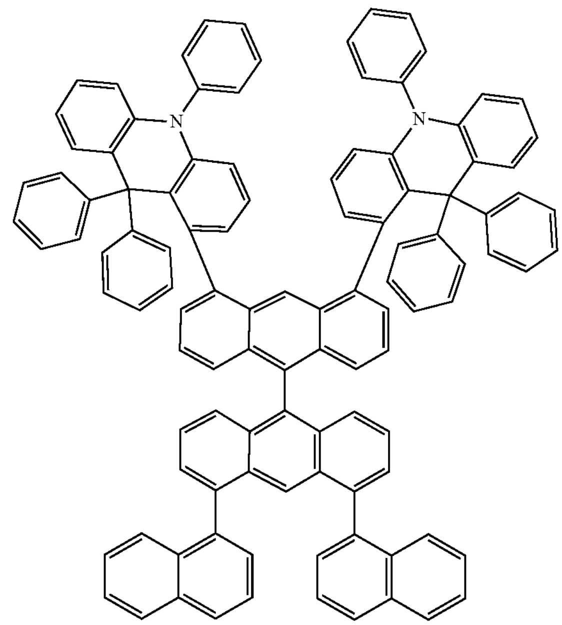

-continued
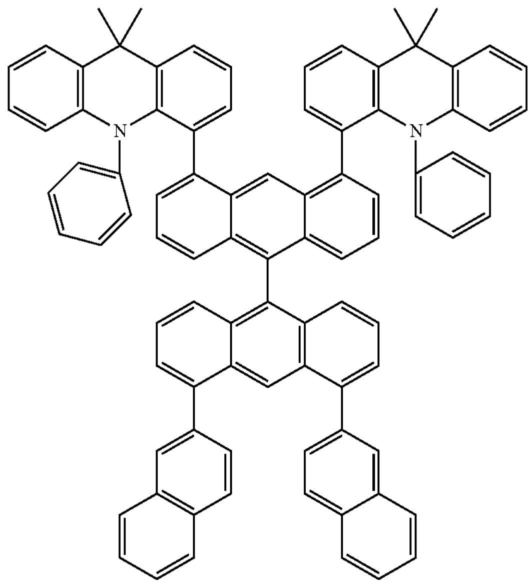
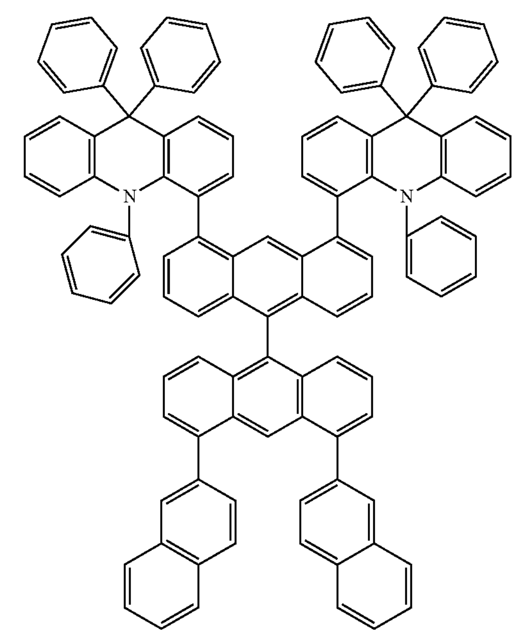
-continued
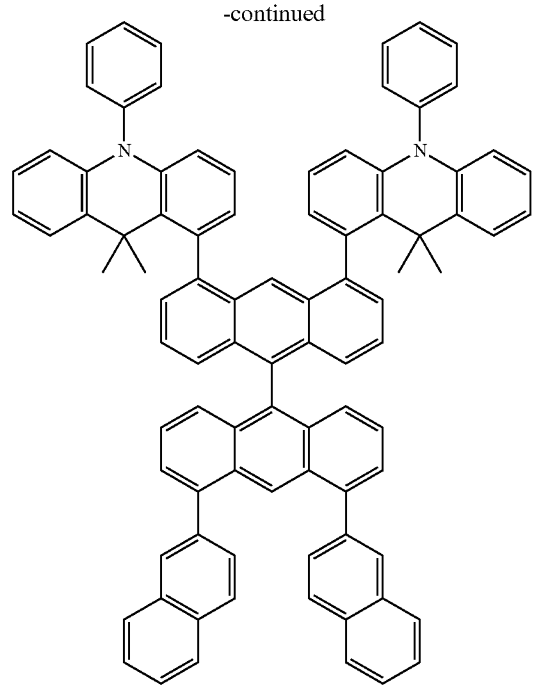
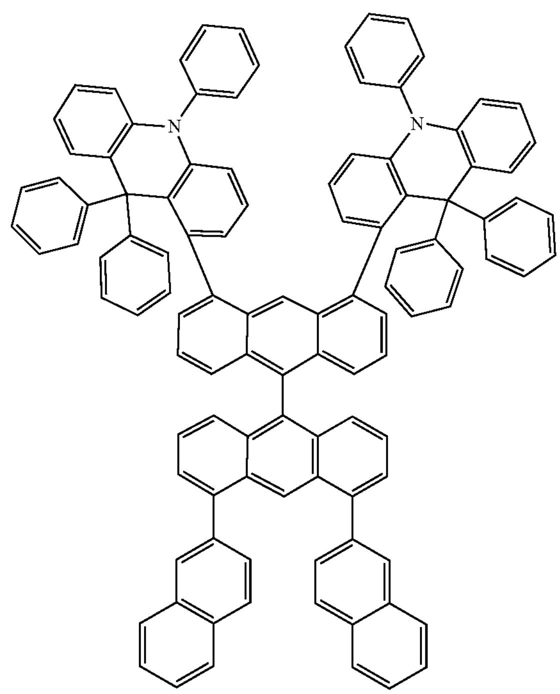

-continued
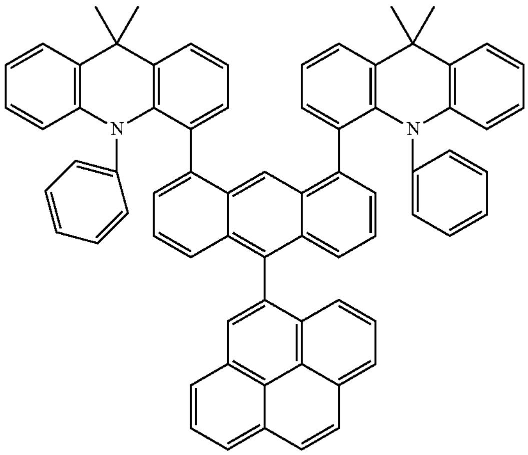
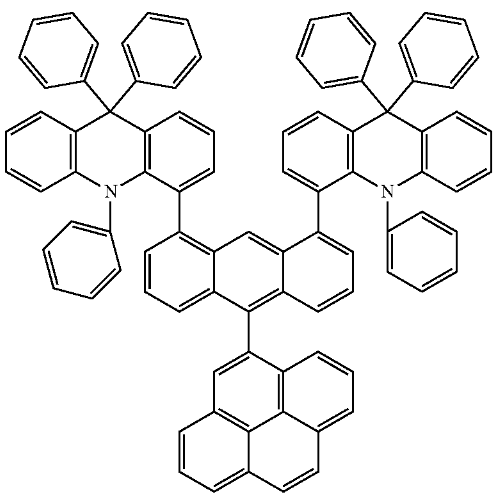
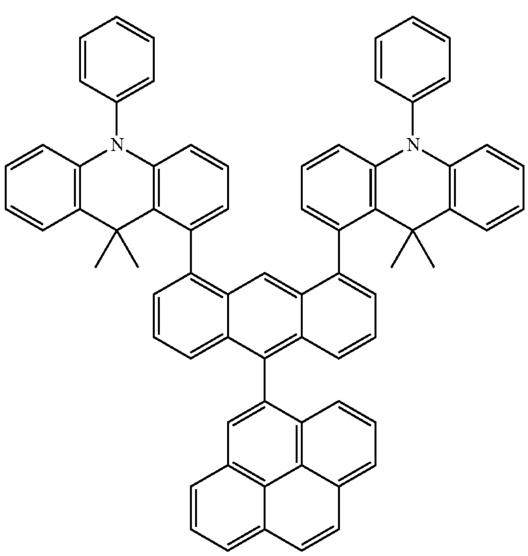
-continued
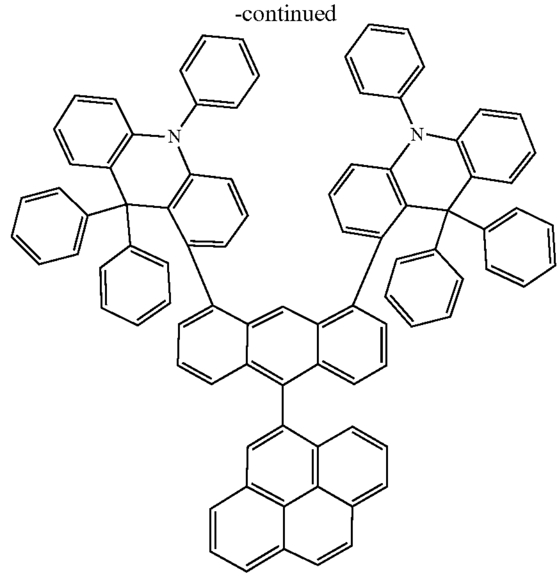
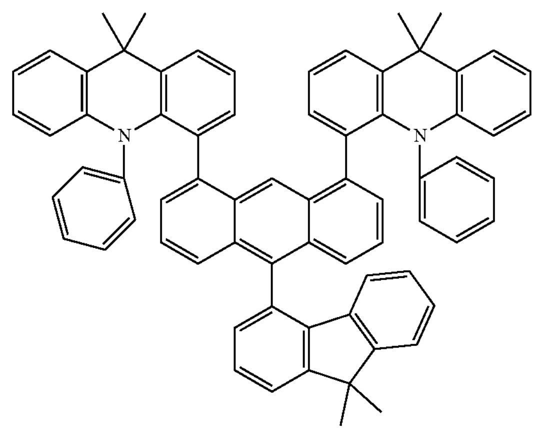
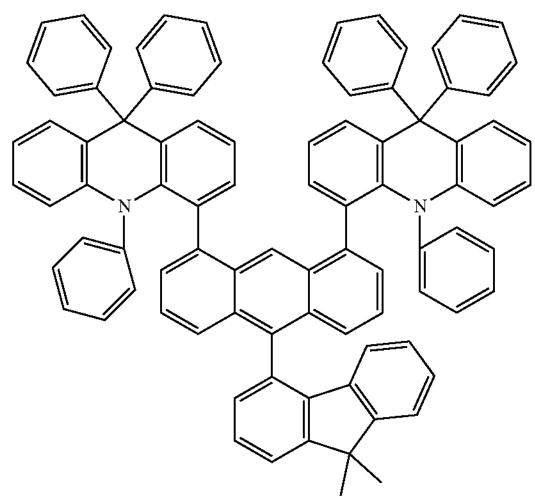

-continued
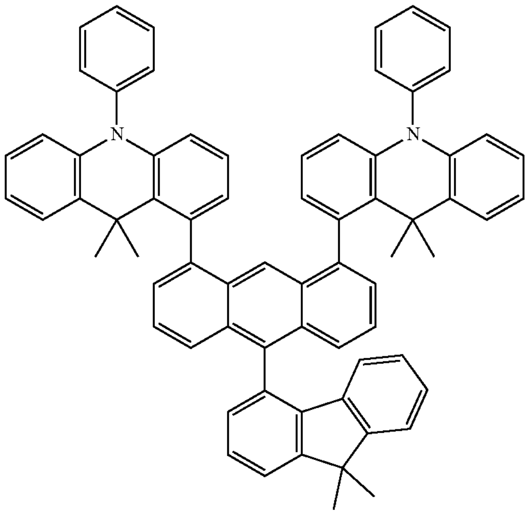
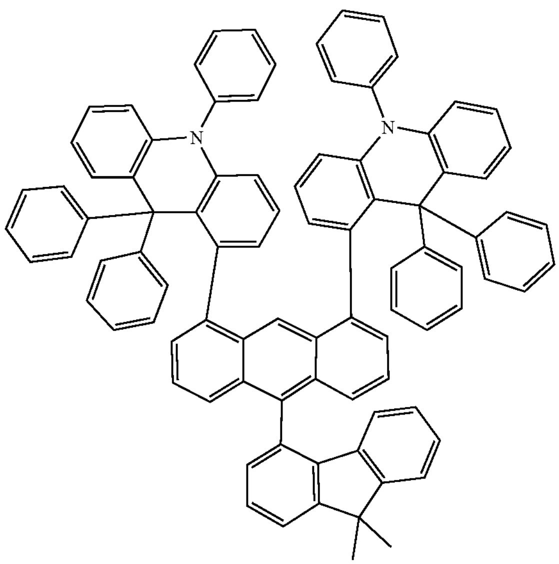
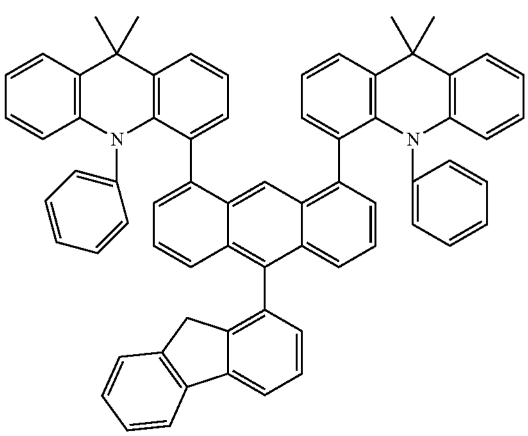
-continued
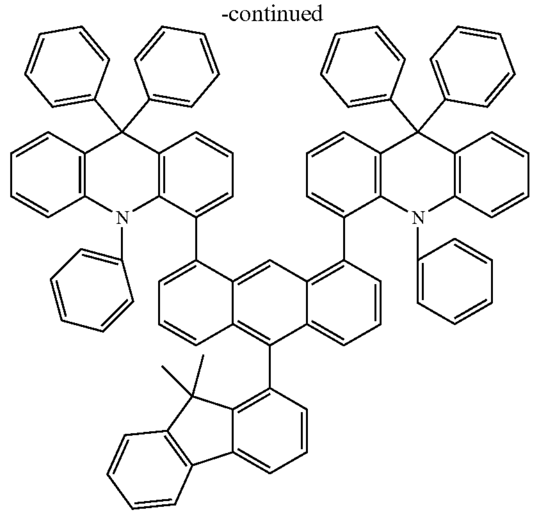
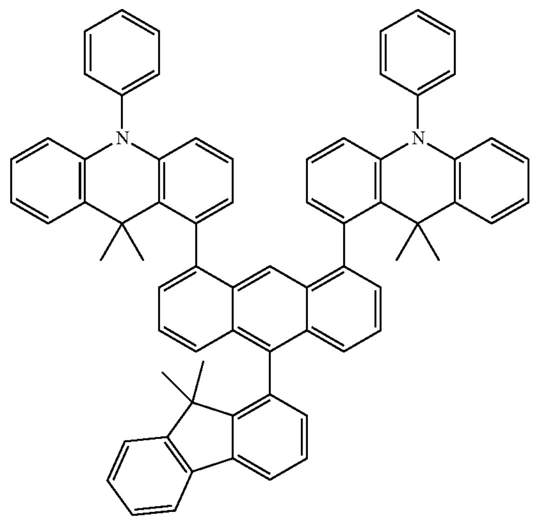
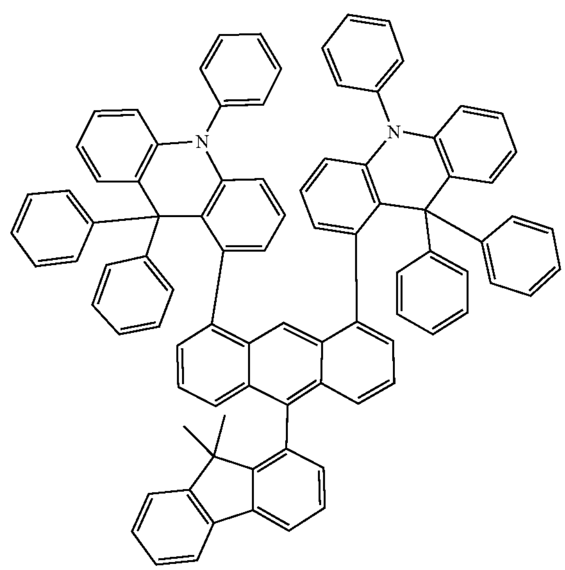

-continued
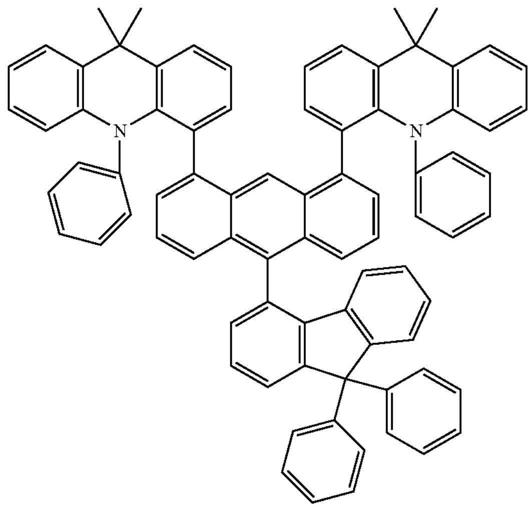
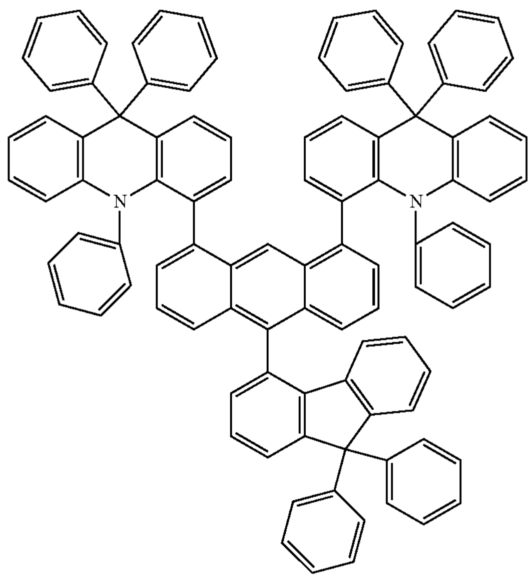
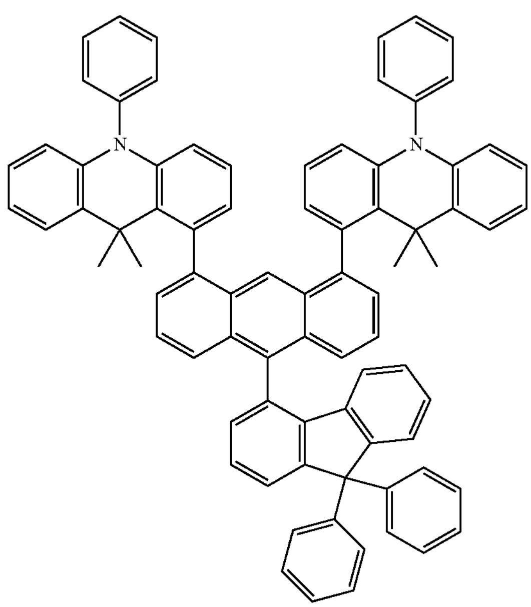
-continued
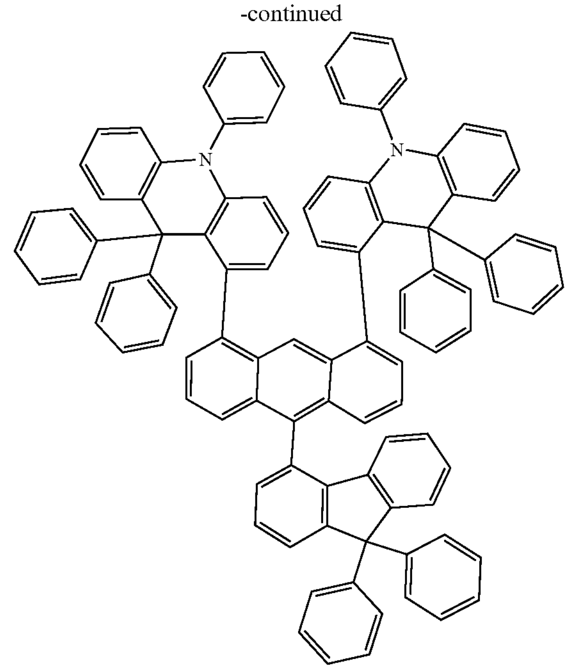
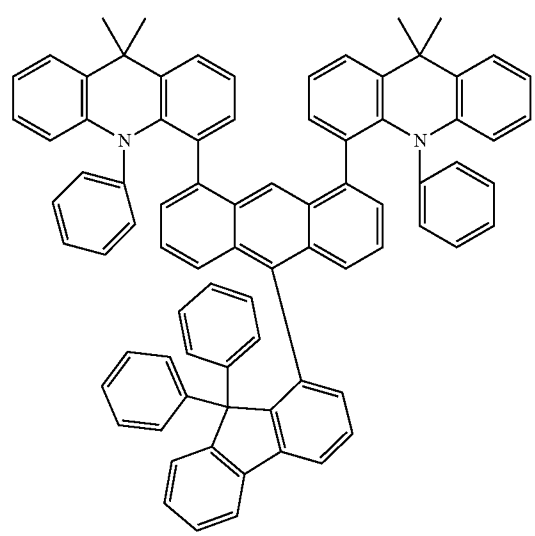

-continued
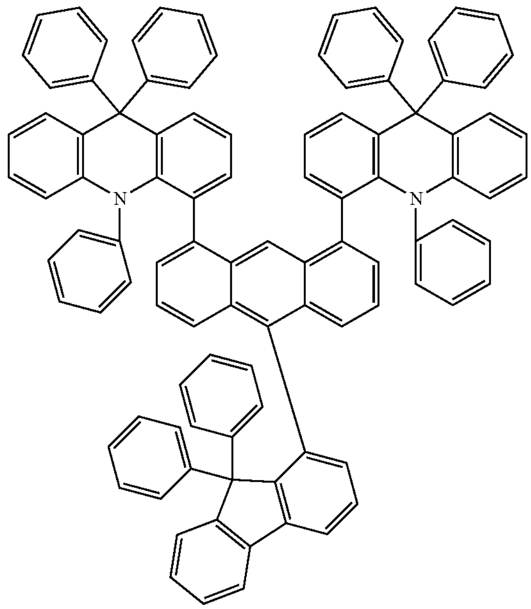
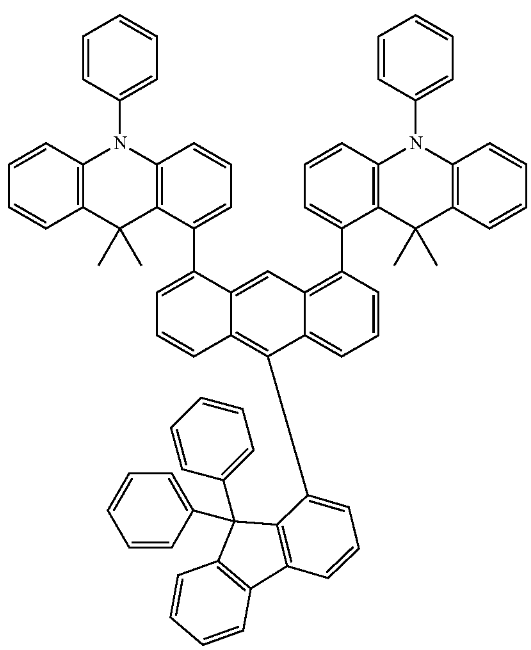
-continued
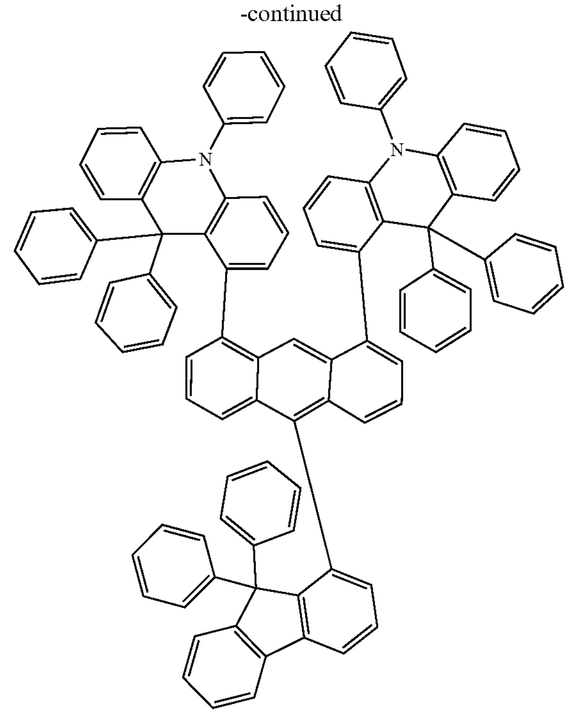
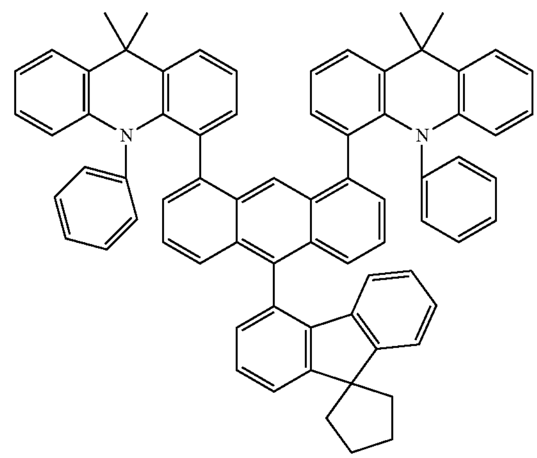
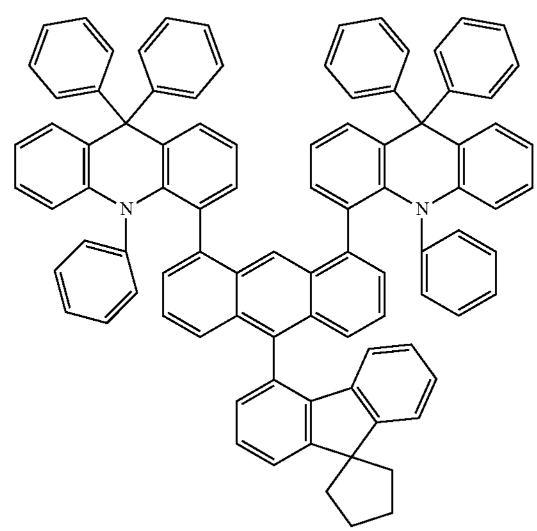

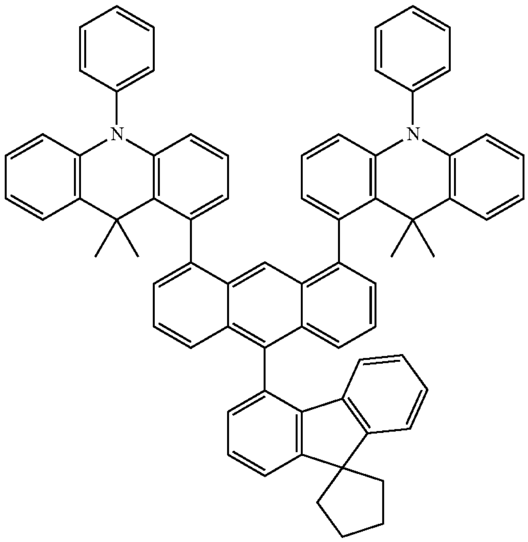
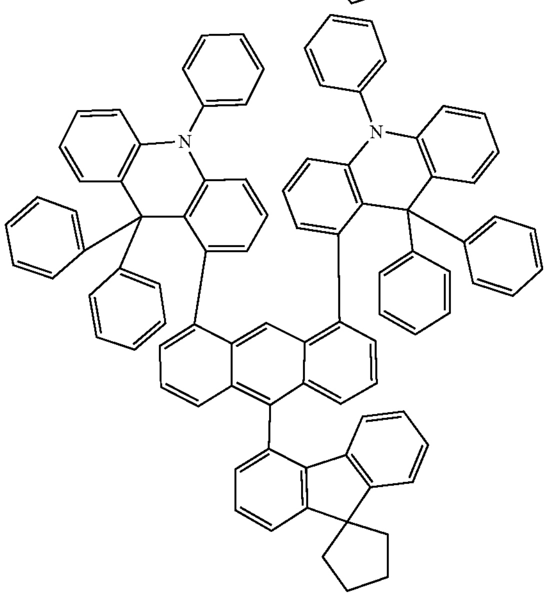
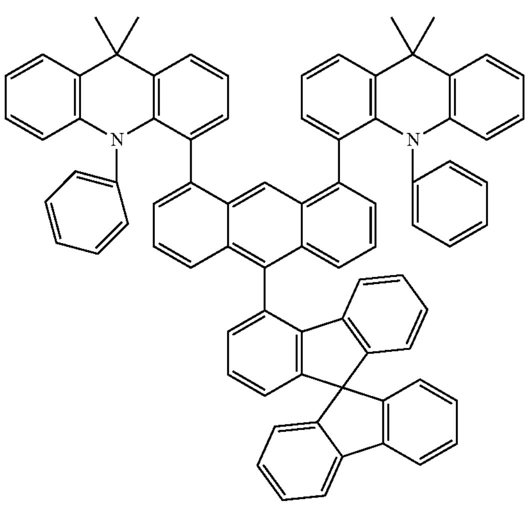
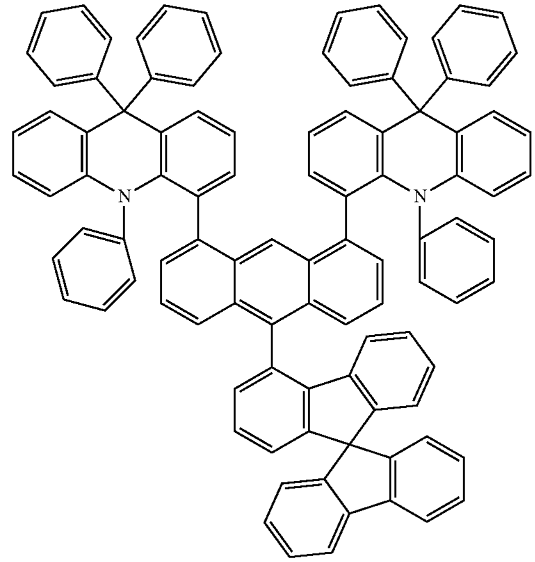
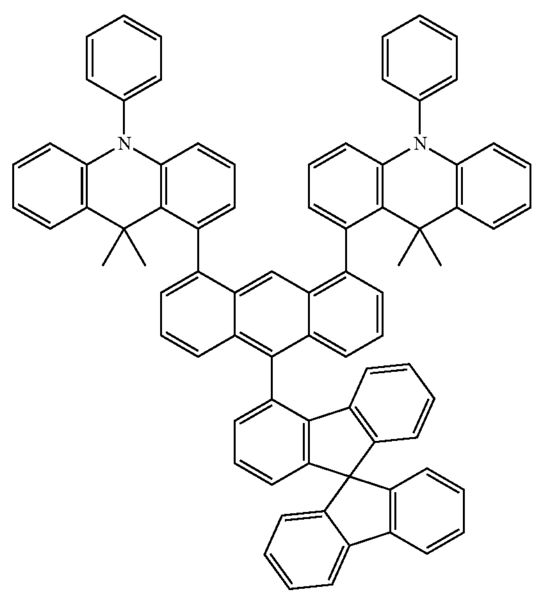

-continued
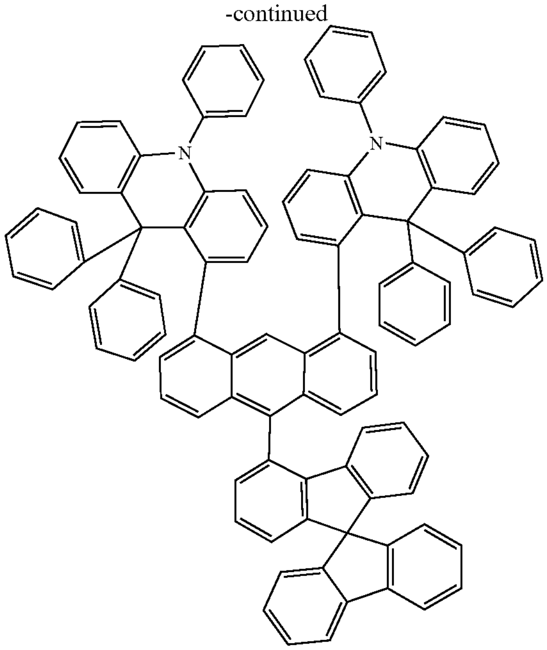
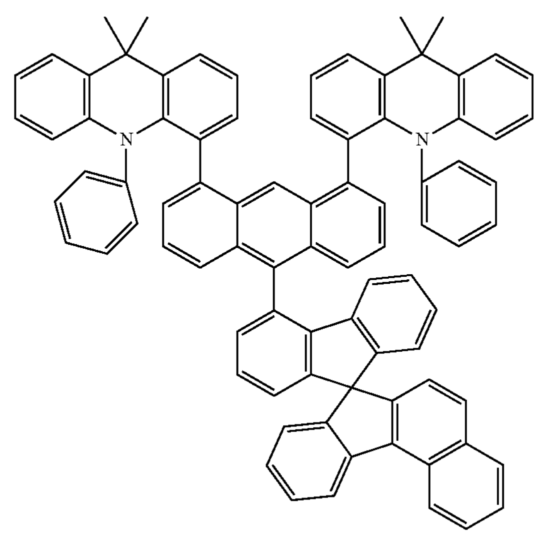
-continued
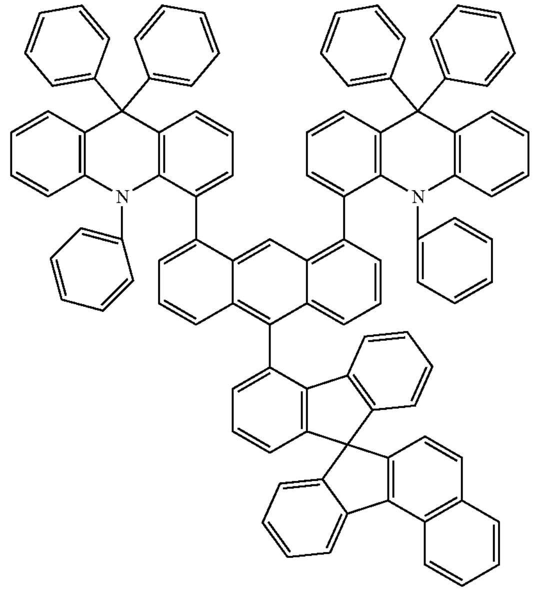
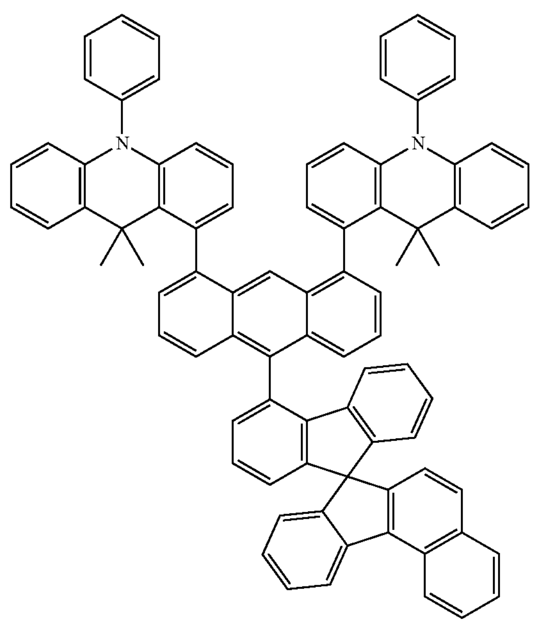

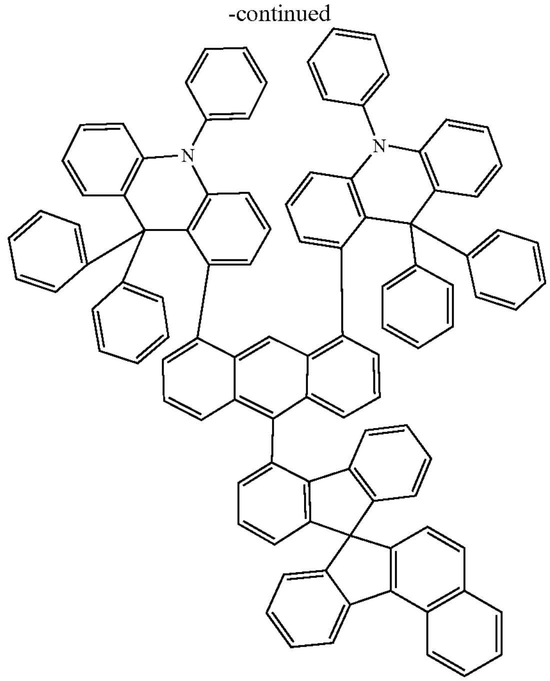
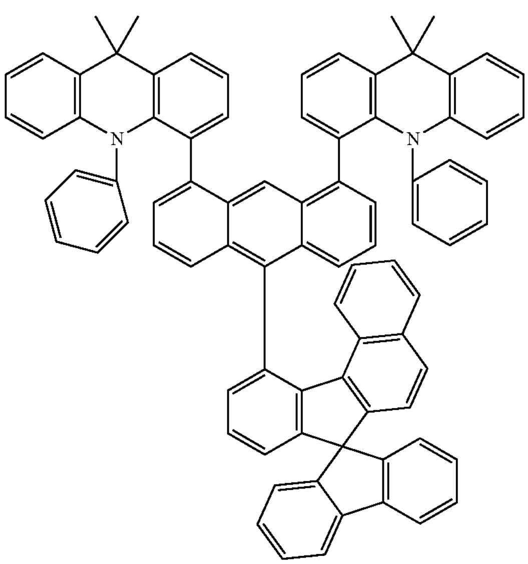
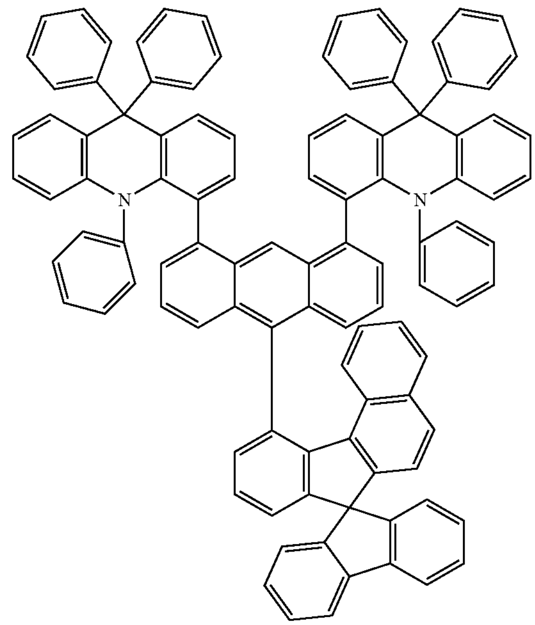
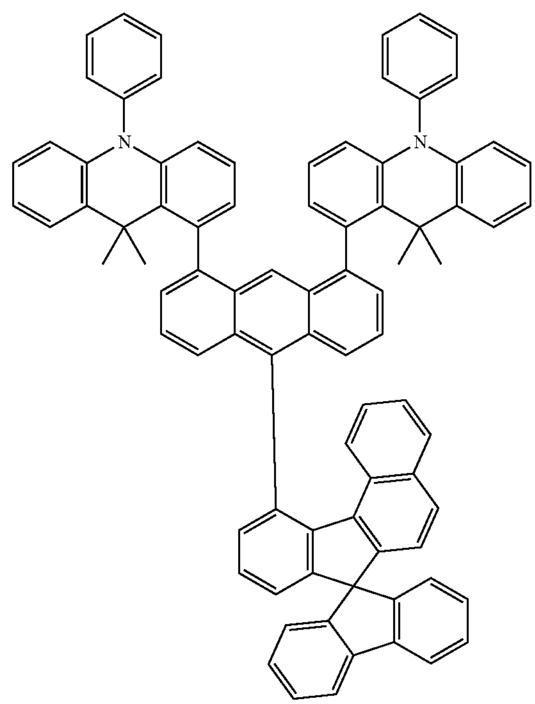

-continued
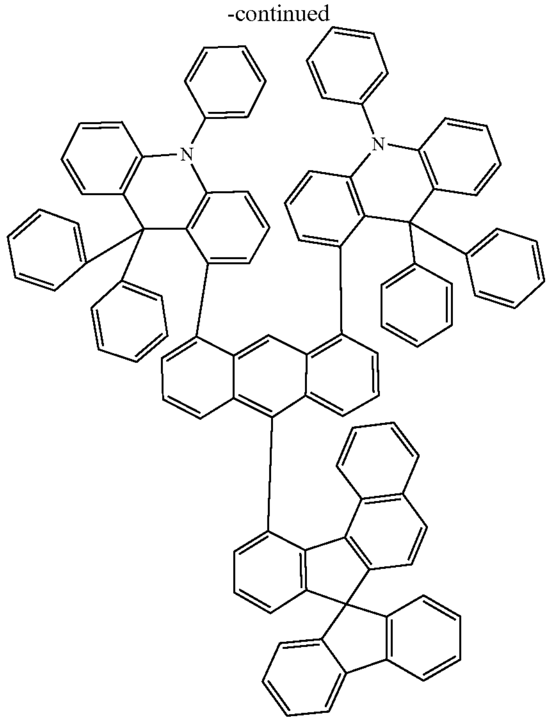
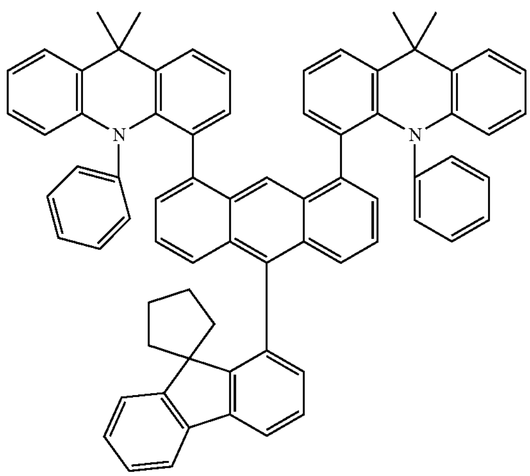
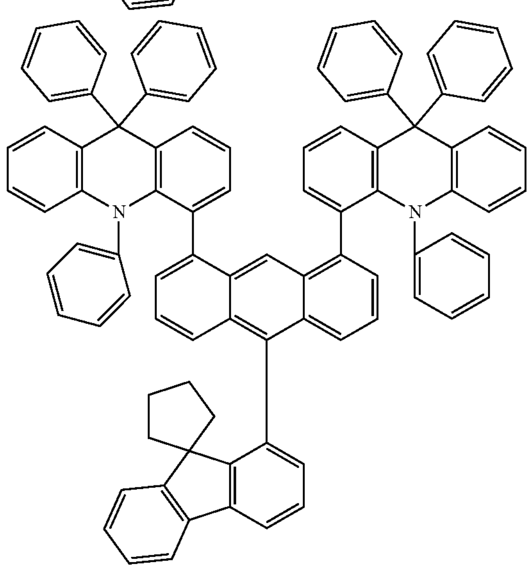
-continued
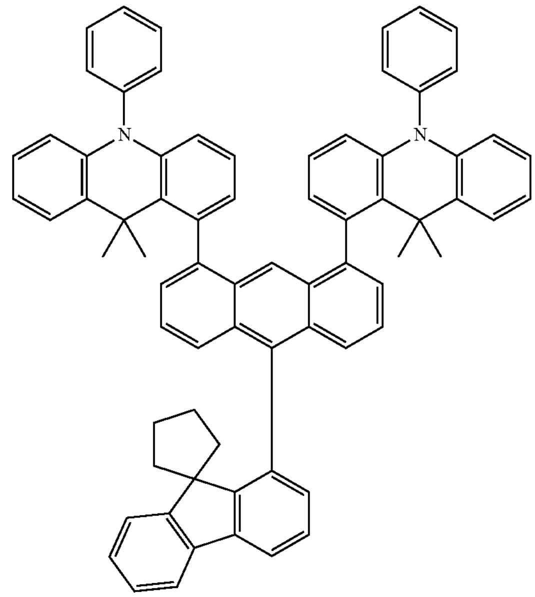
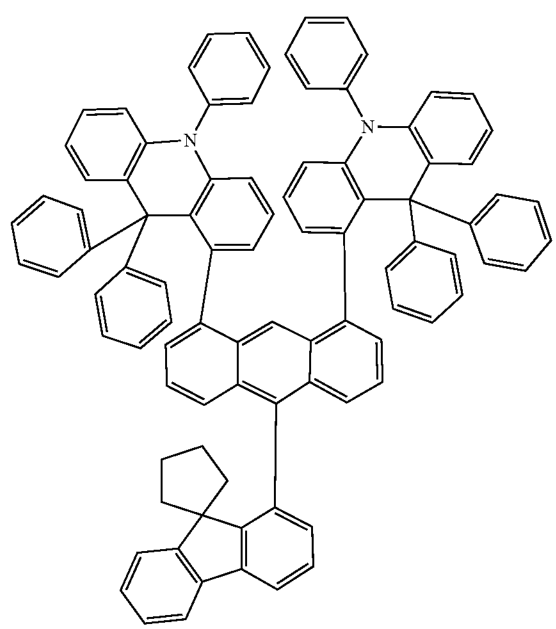

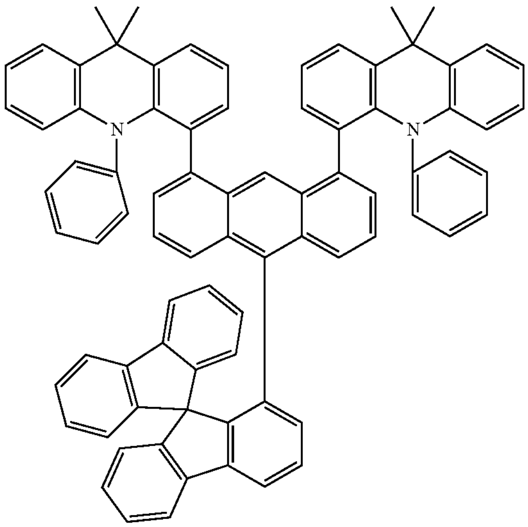
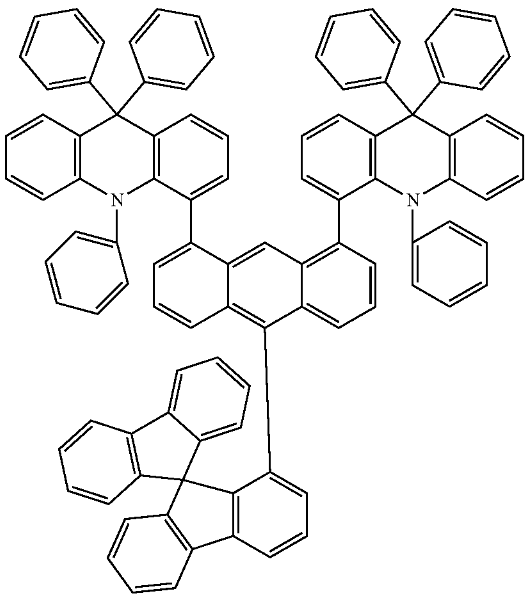
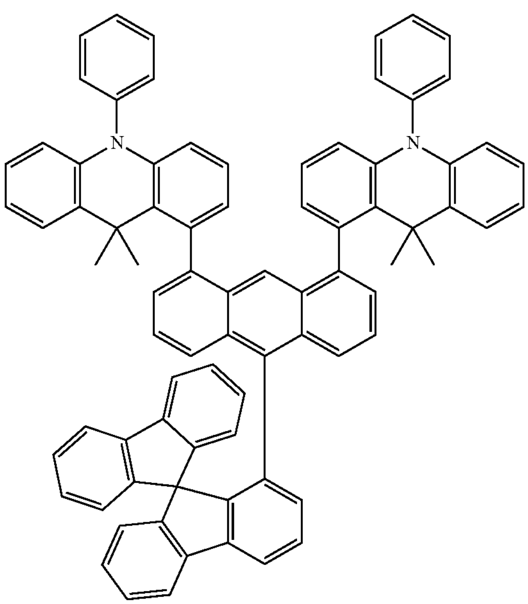
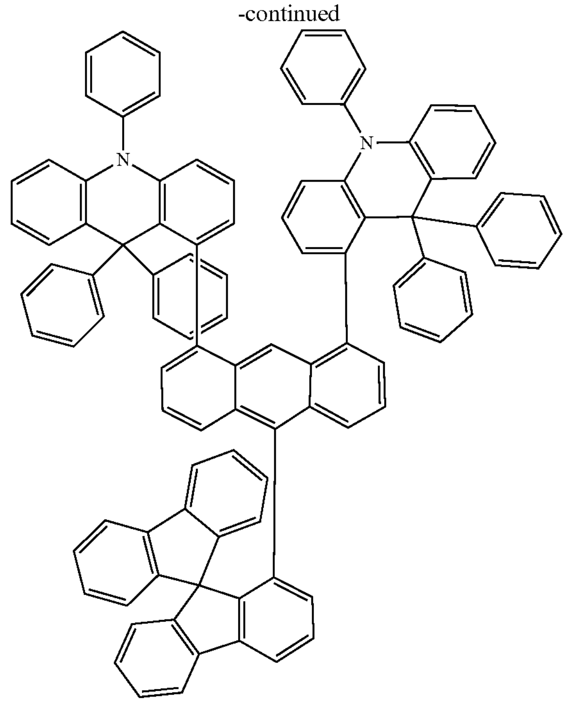
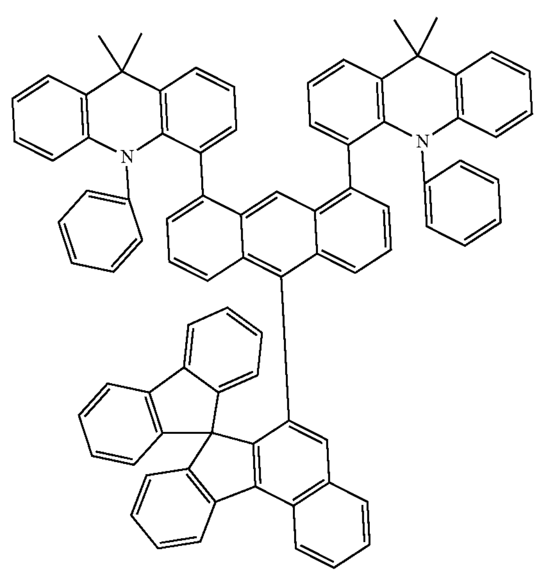
N
N

-continued
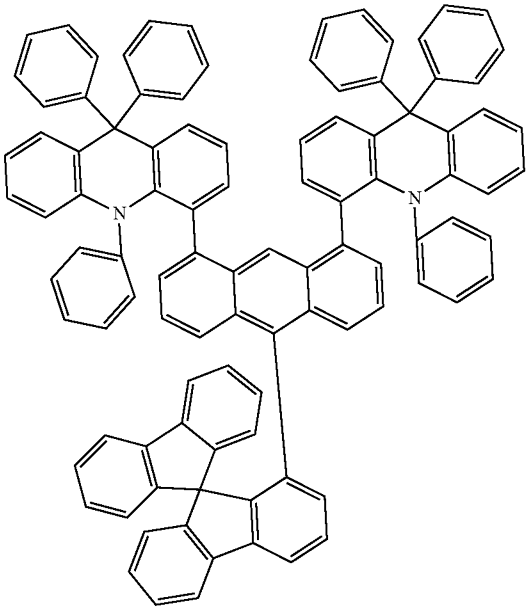
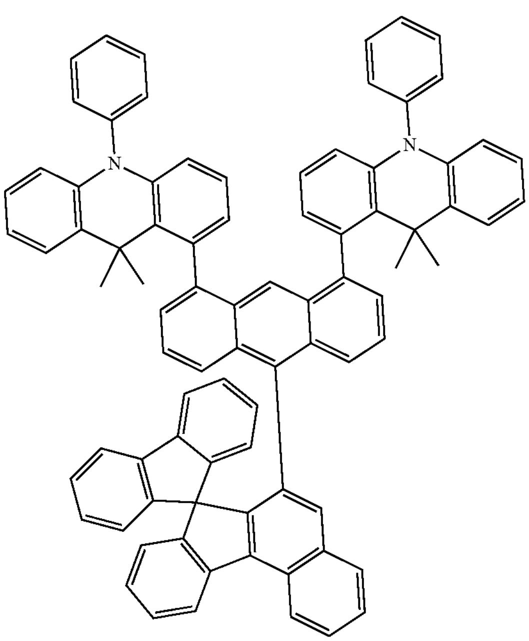
-continued
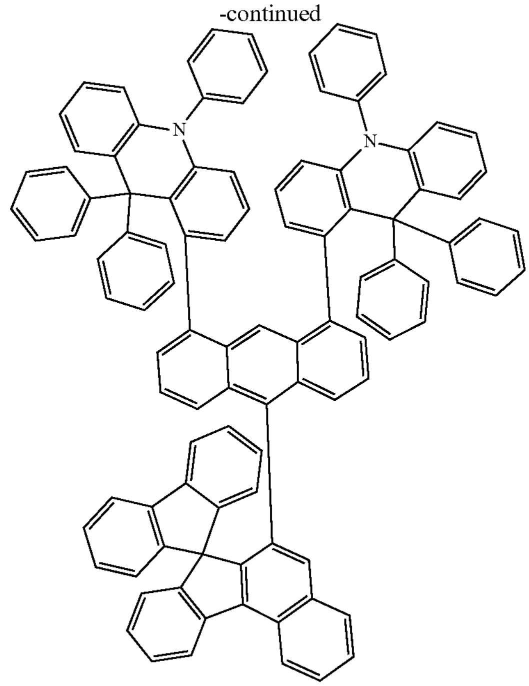
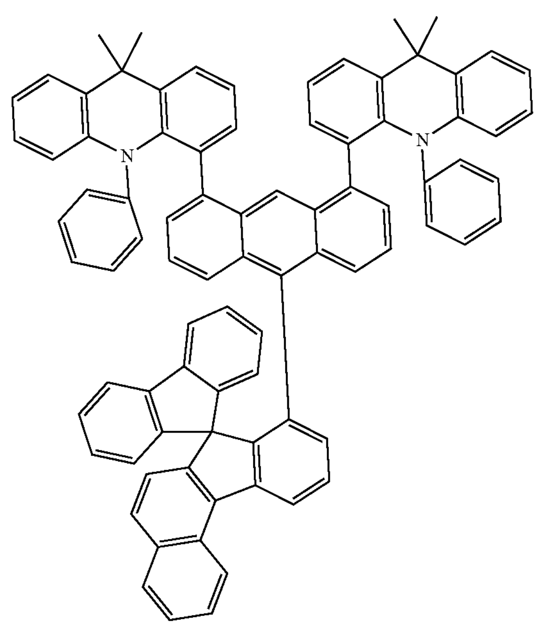

-continued
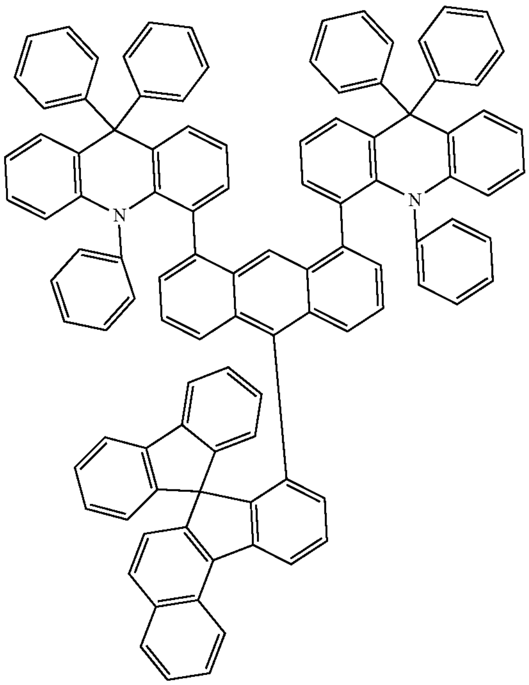
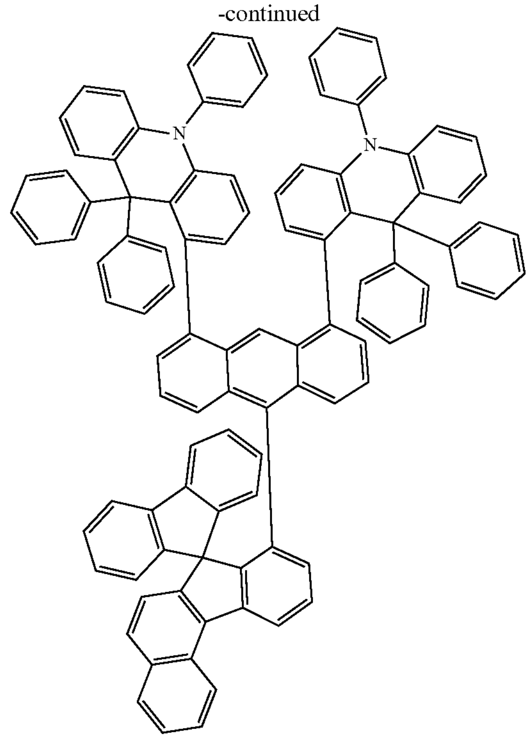
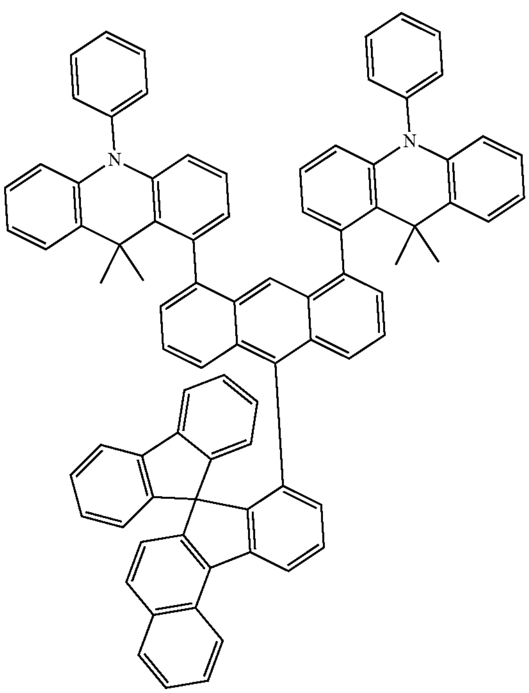
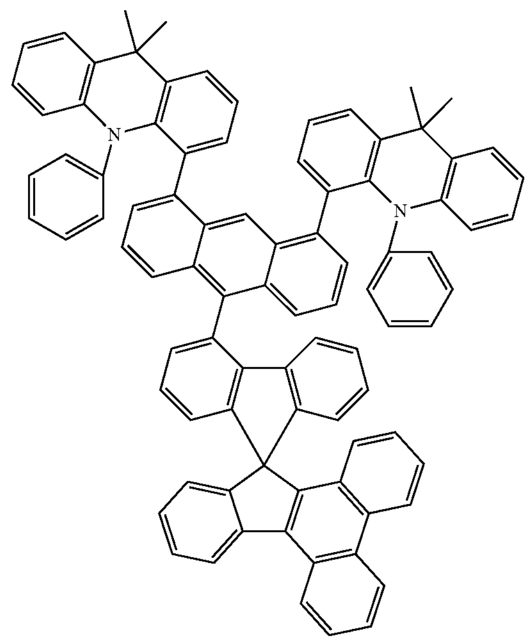
-continued

-continued
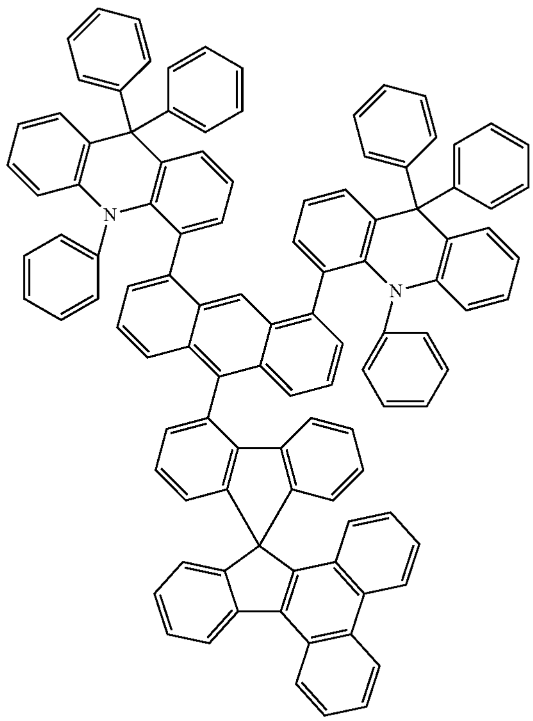
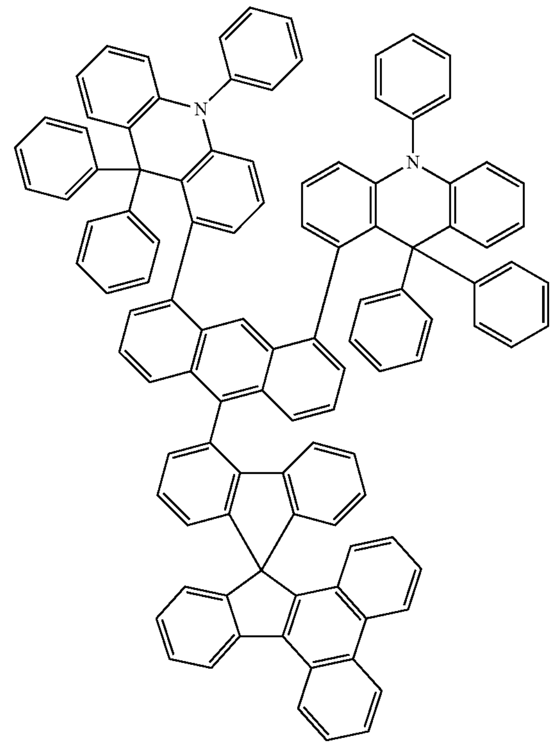
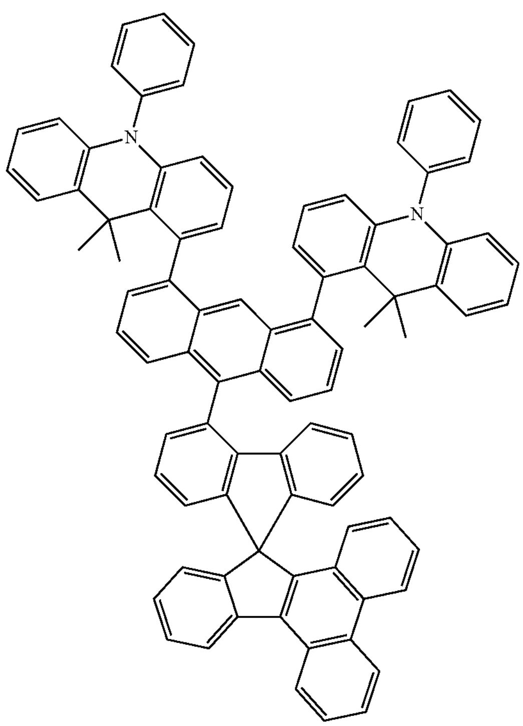
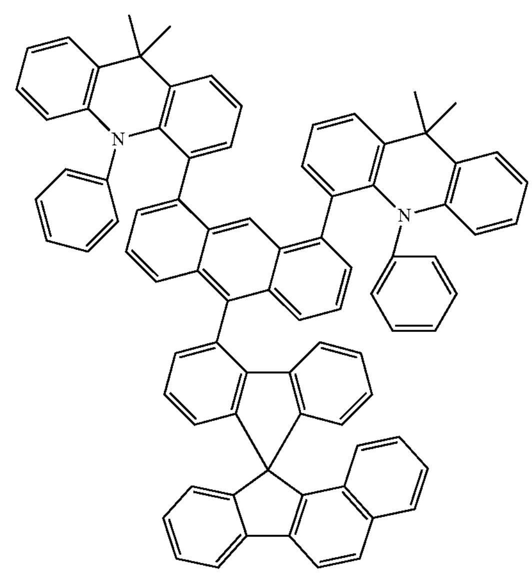

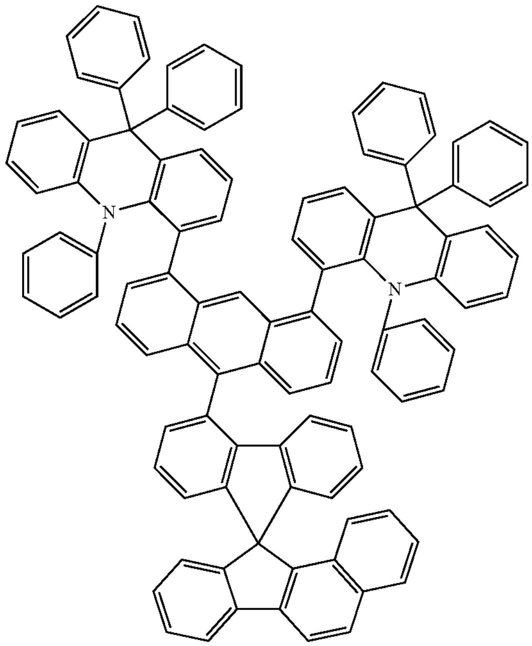
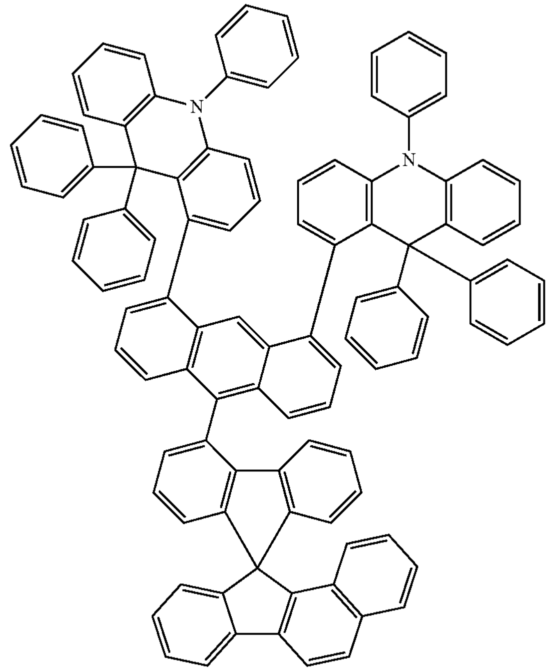
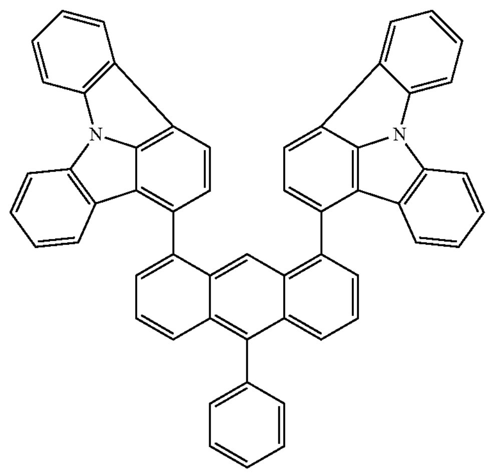
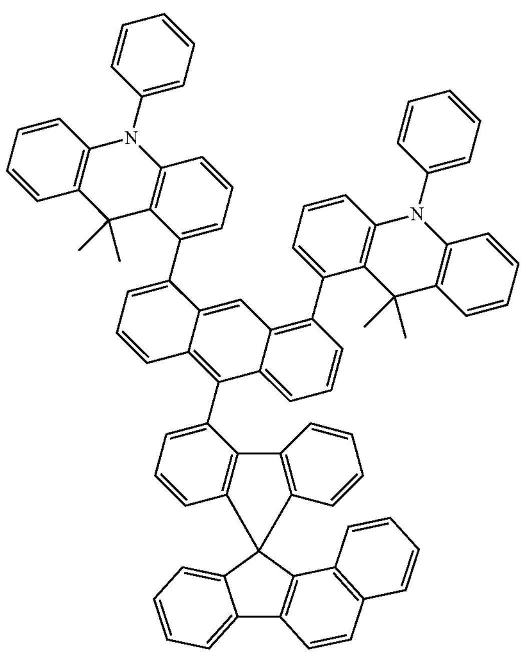
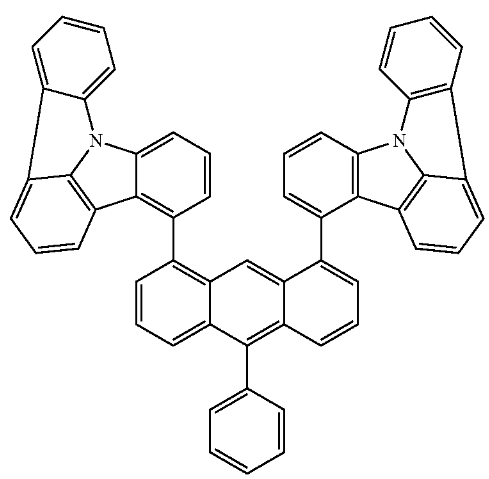

-continued
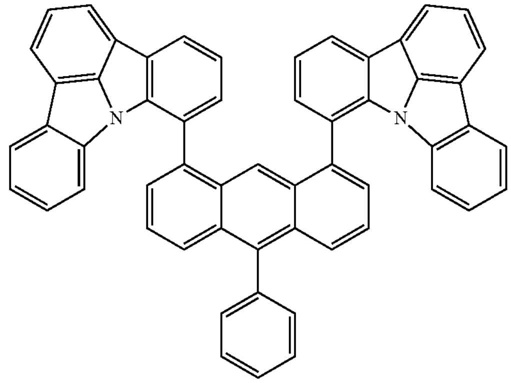
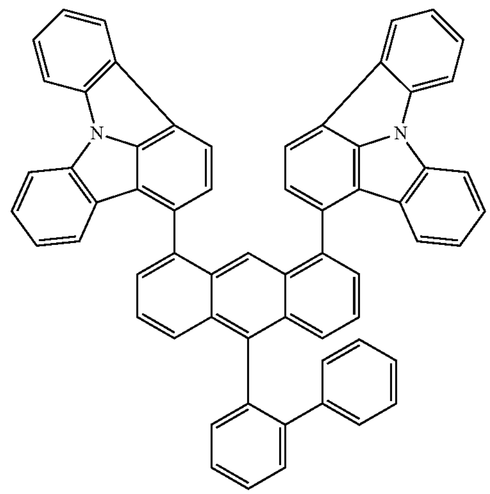
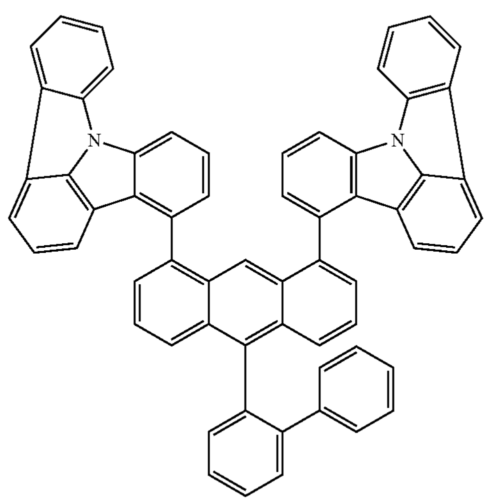
-continued
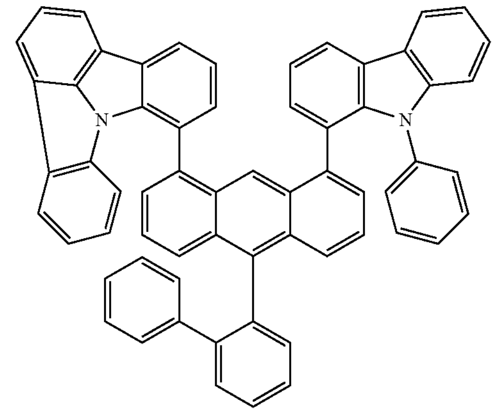
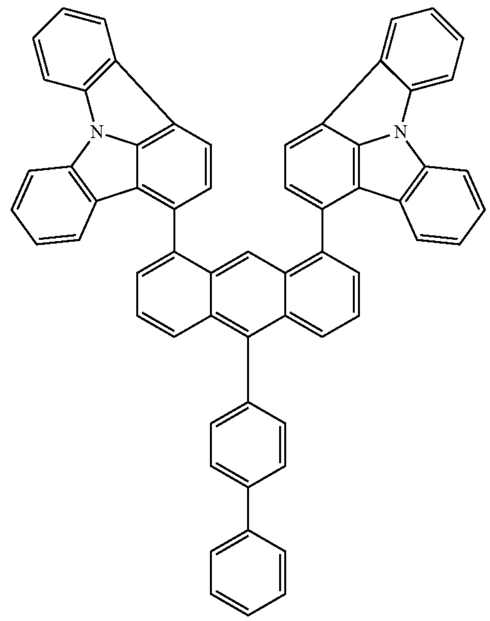
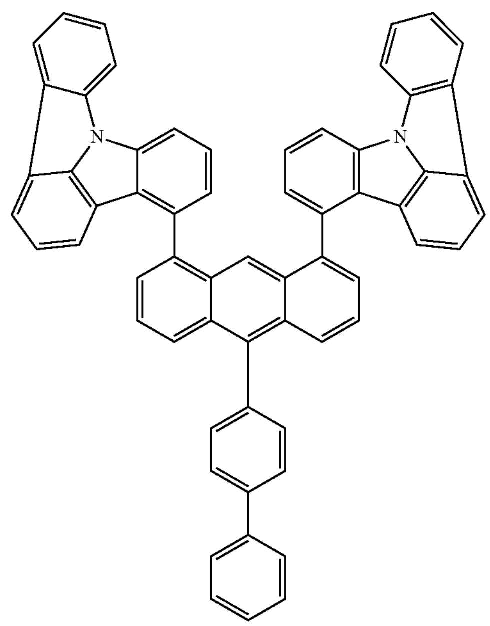

-continued
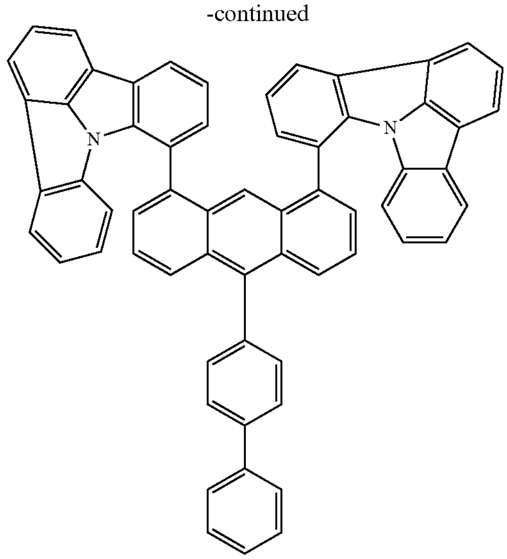
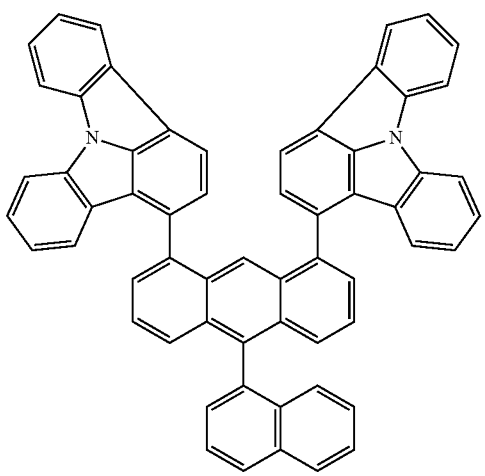
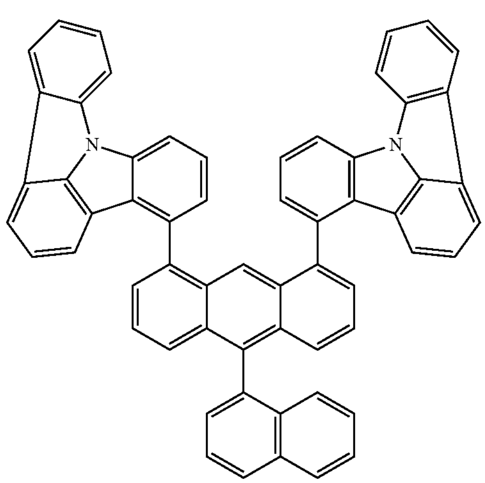
-continued
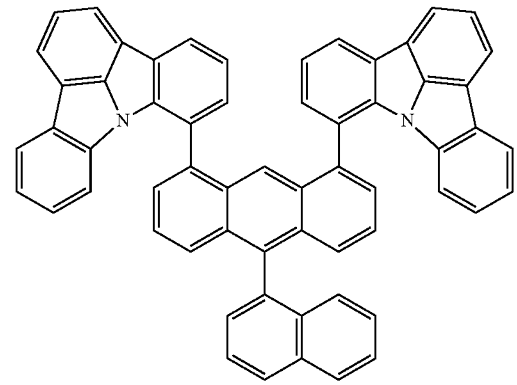
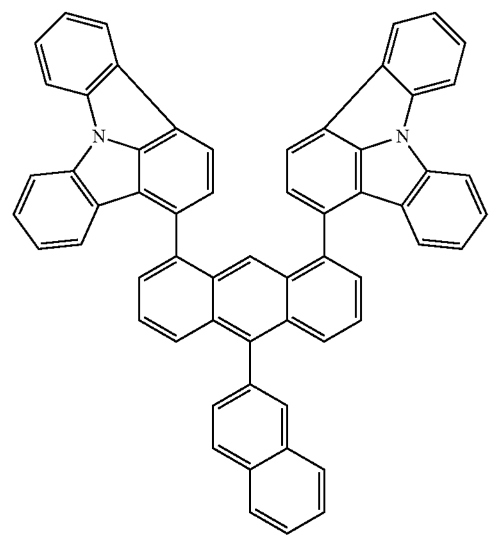
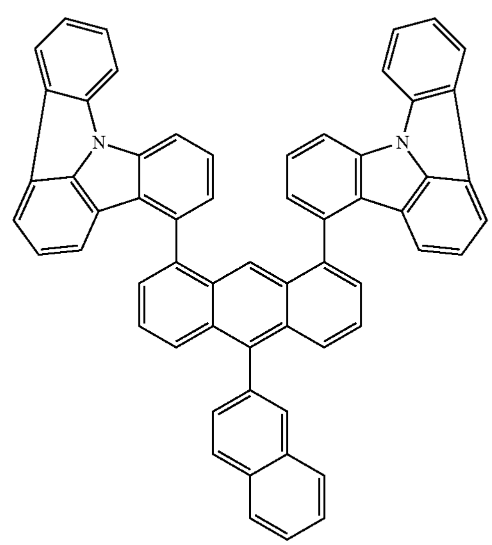

-continued
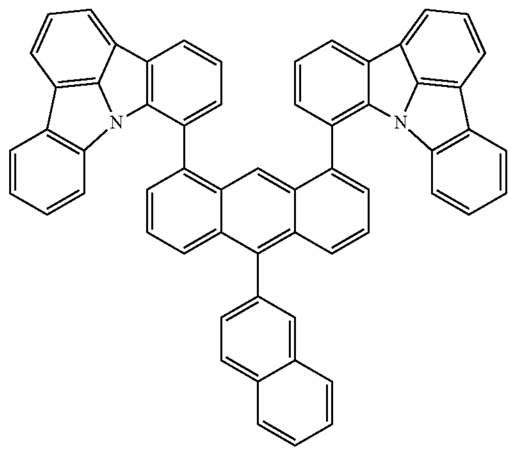
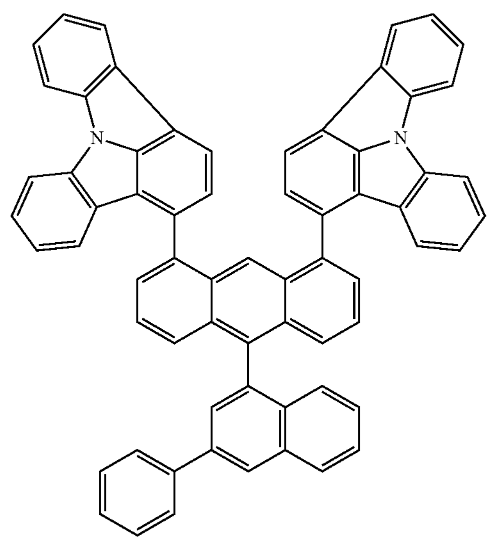
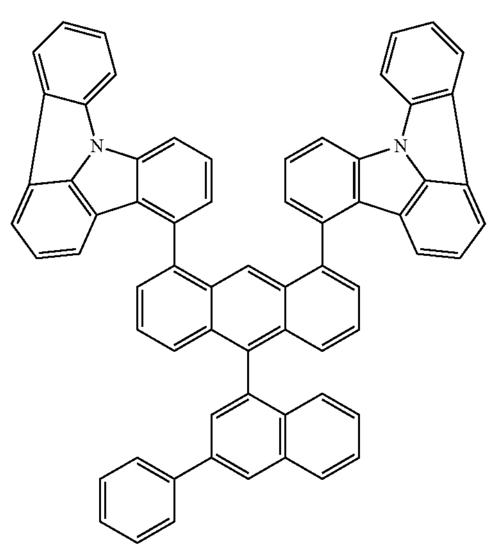
-continued
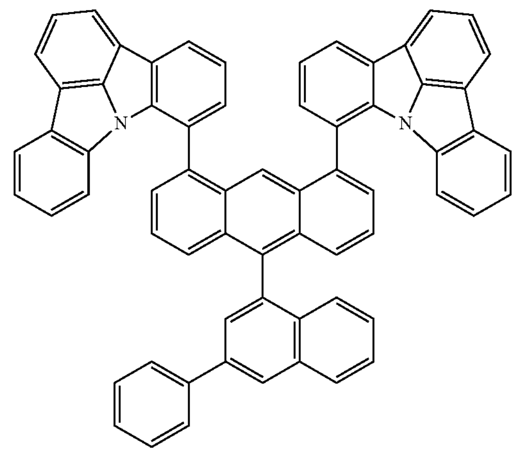
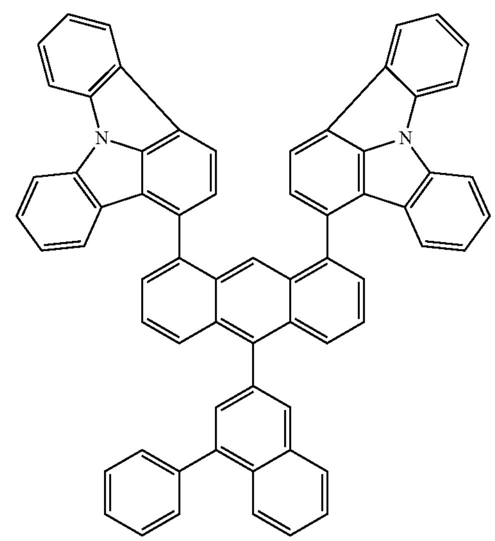
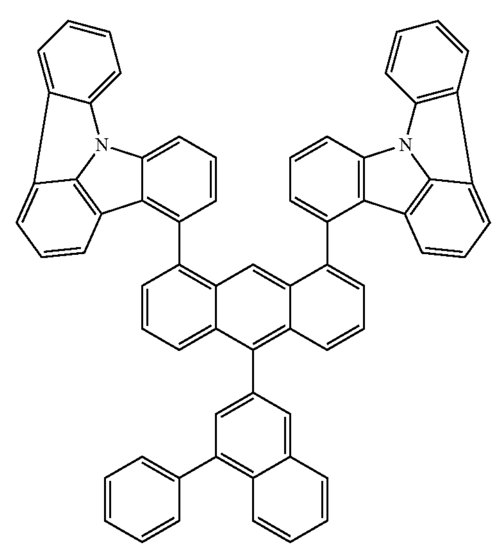

-continued
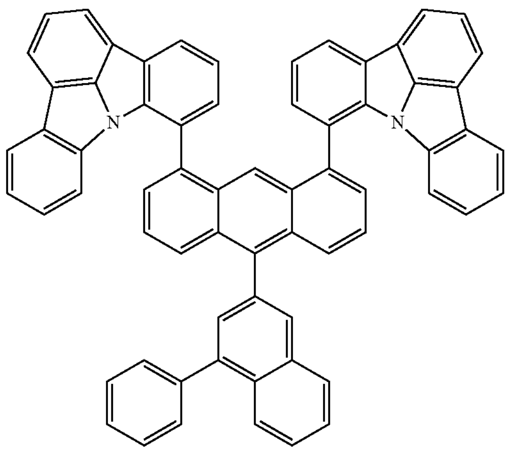
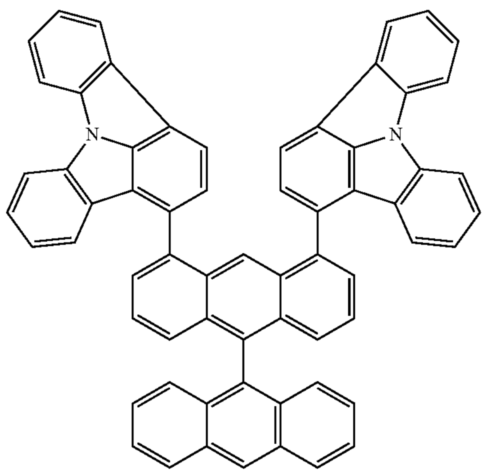
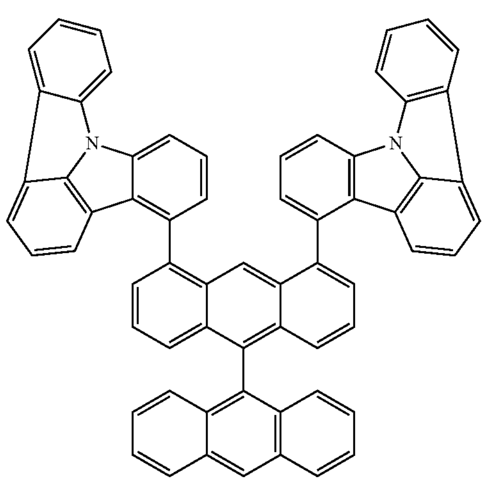
-continued
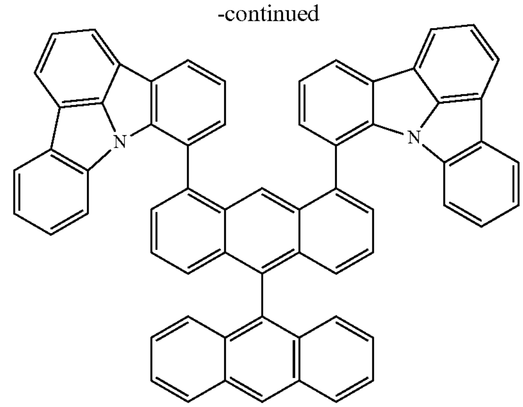
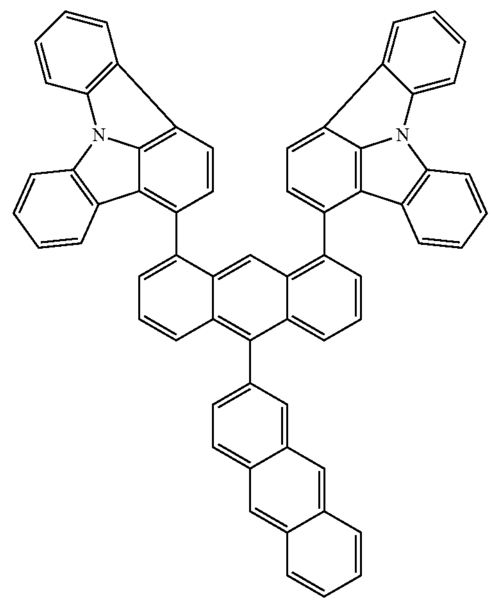
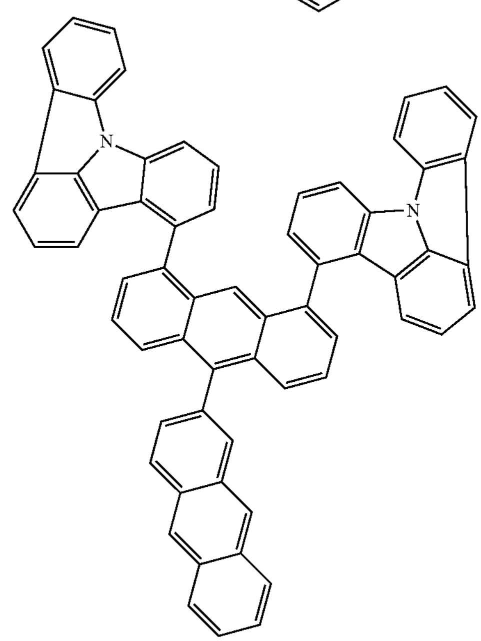

-continued
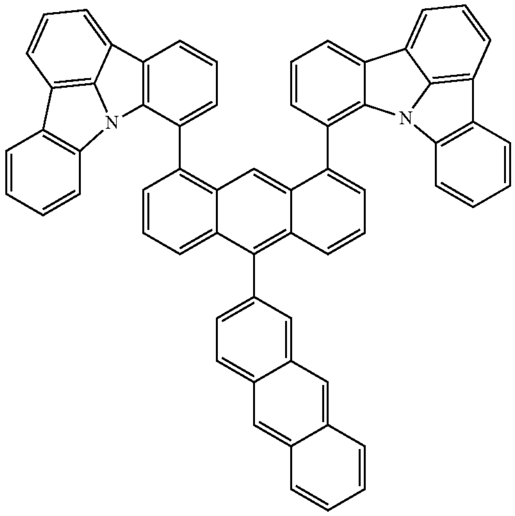
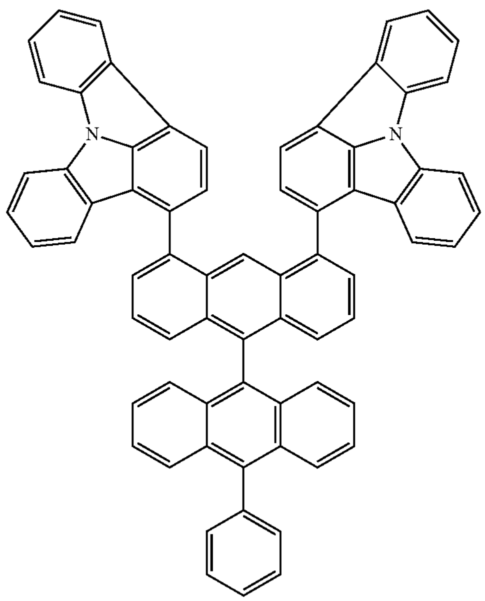
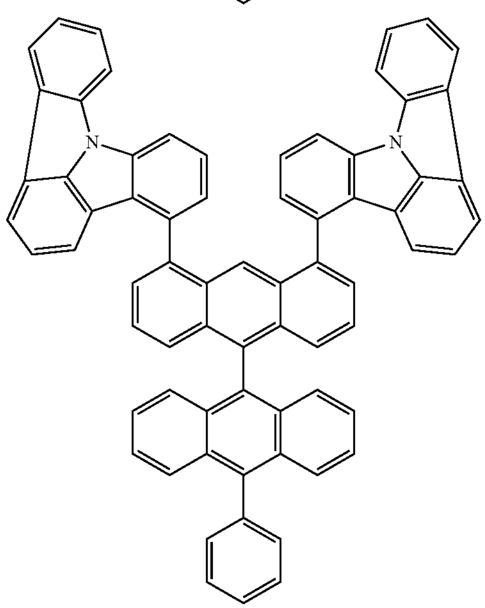
-continued
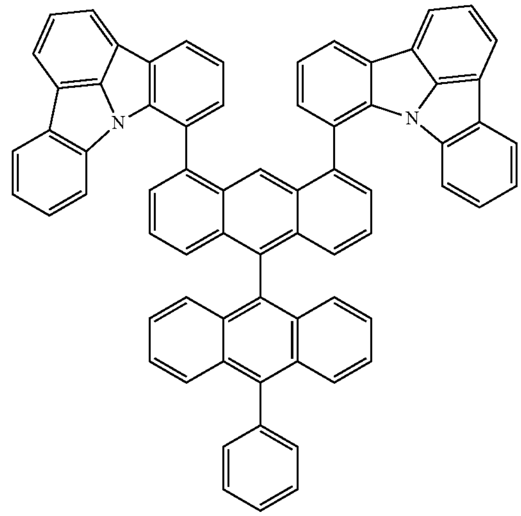
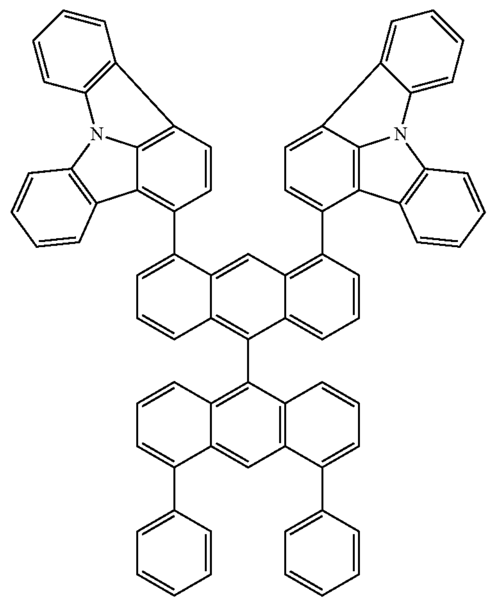
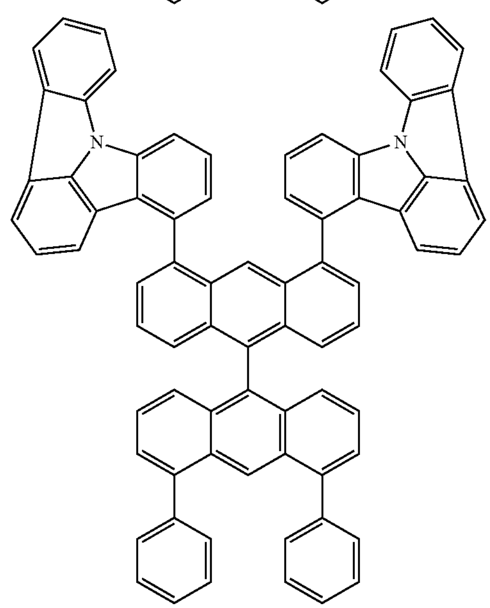

-continued
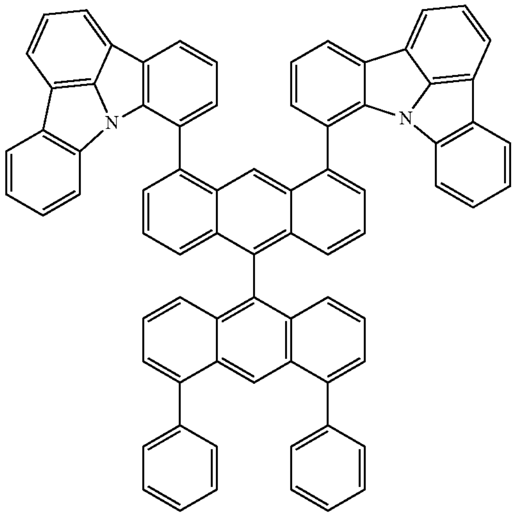
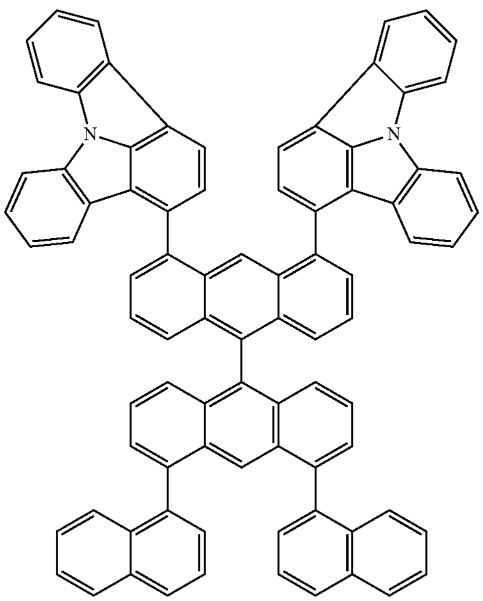
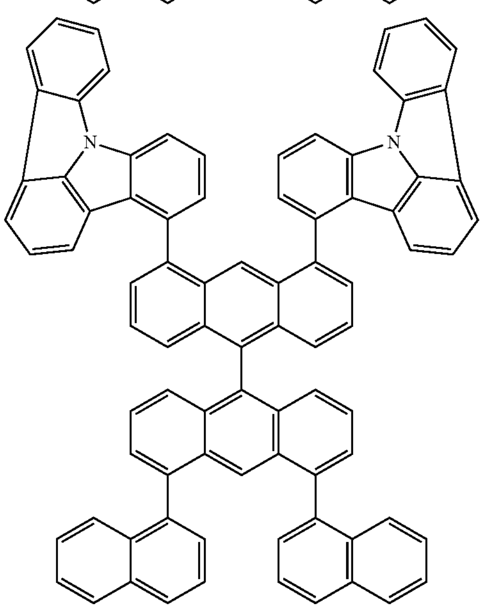
-continued
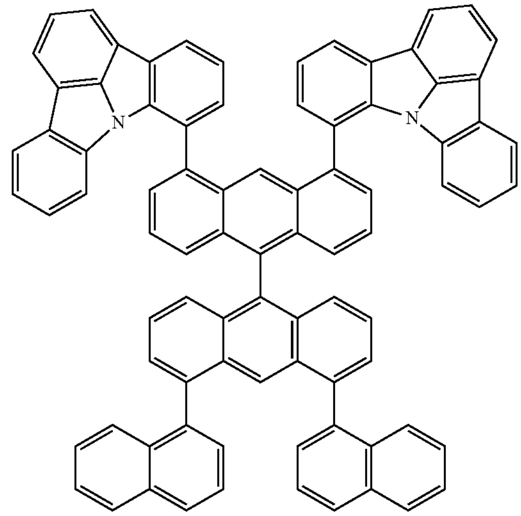
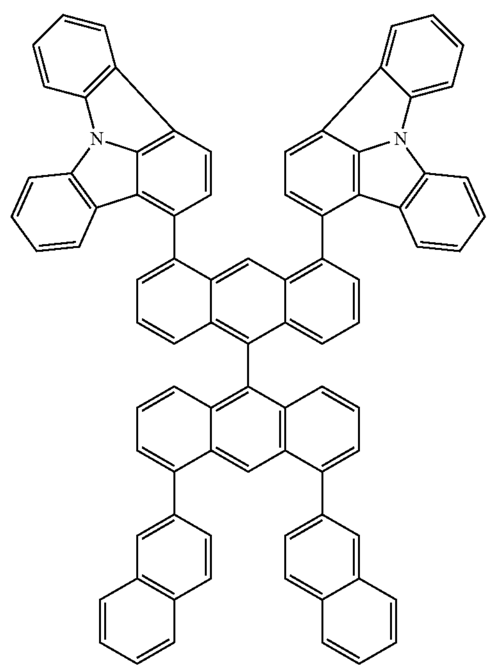

-continued
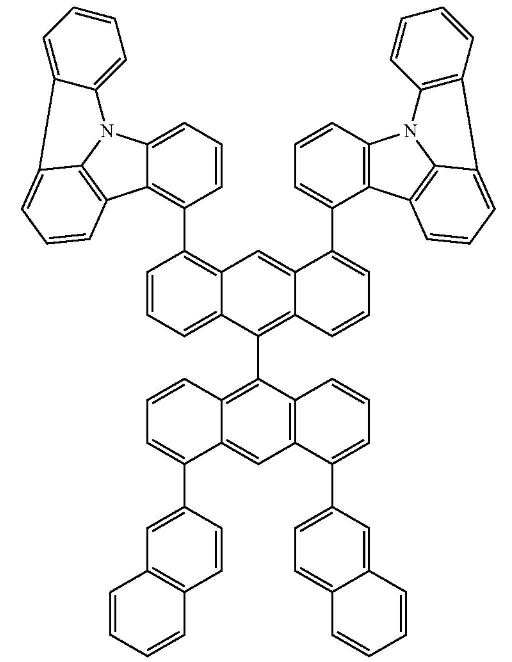
-continued
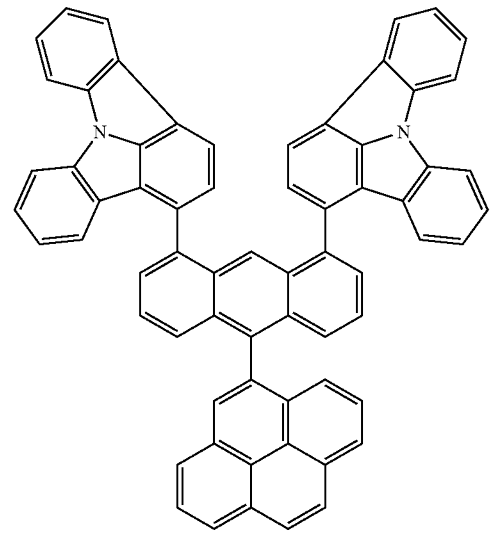
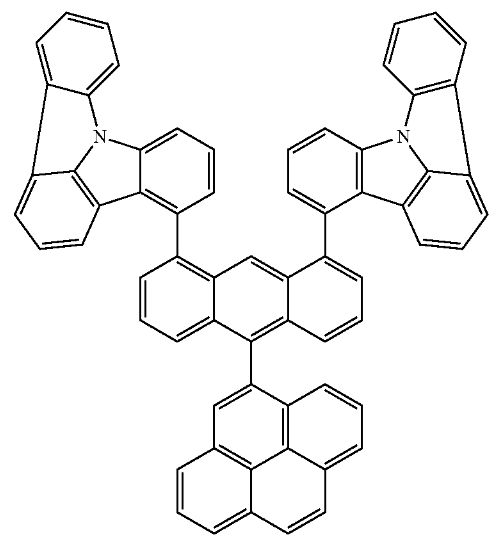
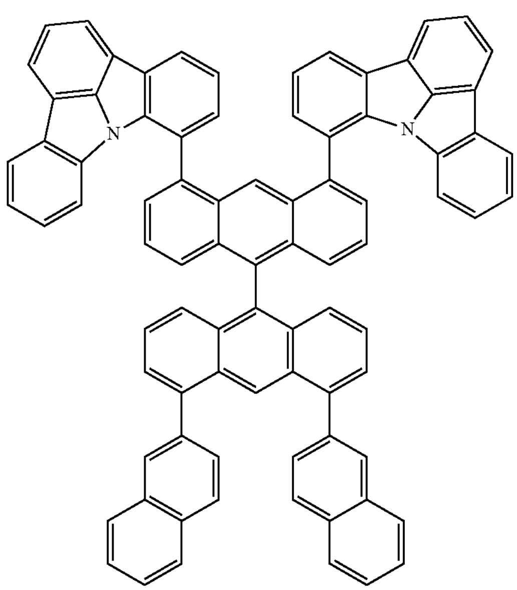 [SMILES: c1ccc2cc(-c3cccc4c(-c5c6cccc(-c7cccc8c9cccc%10c%11ccccc%11n(c78)c%109)c6cc6c(-c7cccc8c9cccc%10c%11ccccc%11n(c78)c%109)cccc56)c5cccc(-c6ccc7ccccc7c6)c5cc34)ccc2c1]
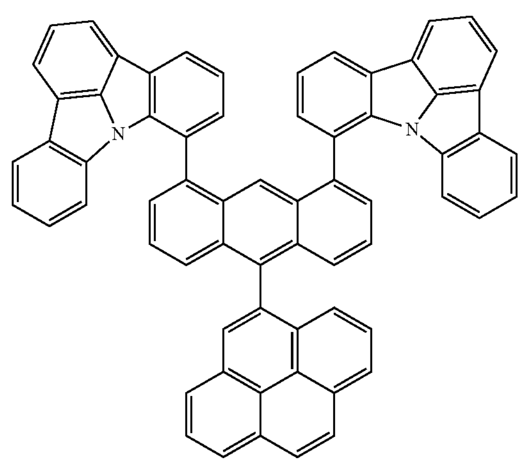

-continued
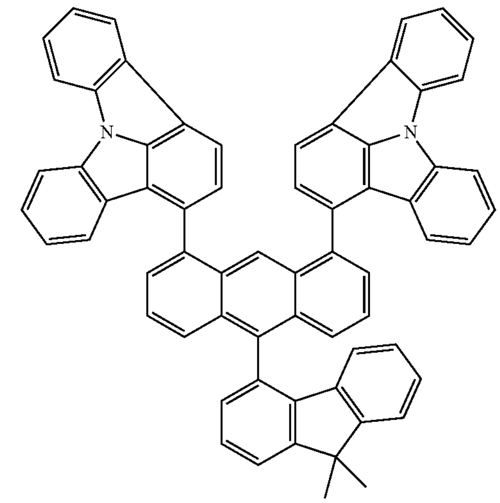
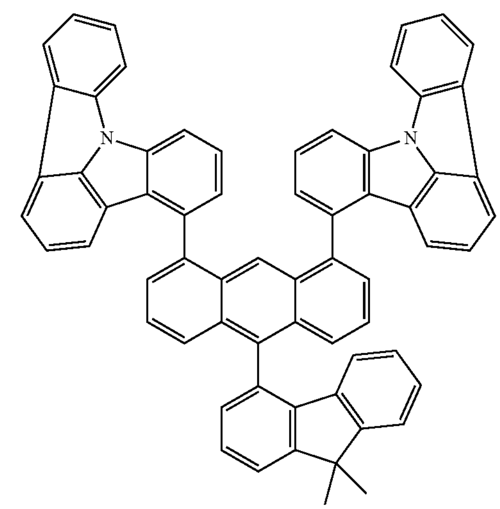
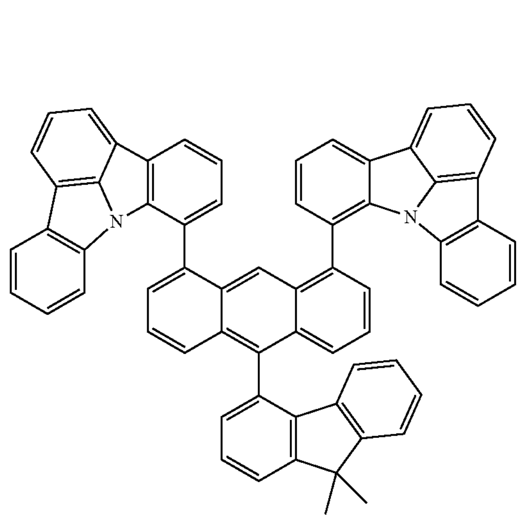
-continued
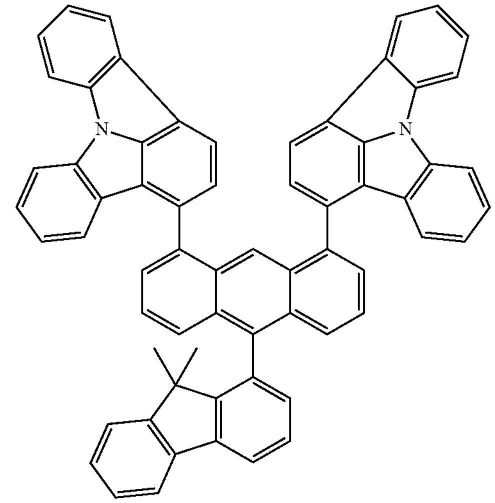
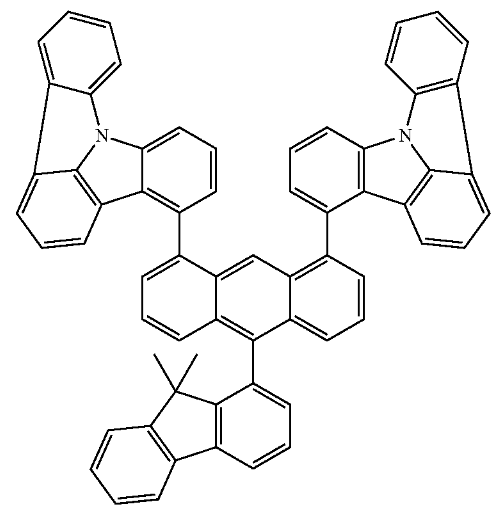
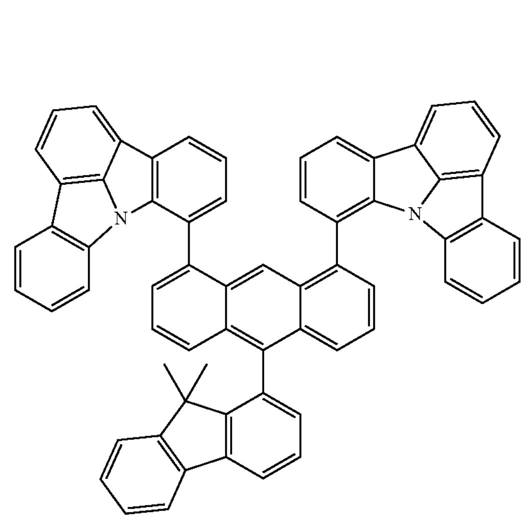

-continued
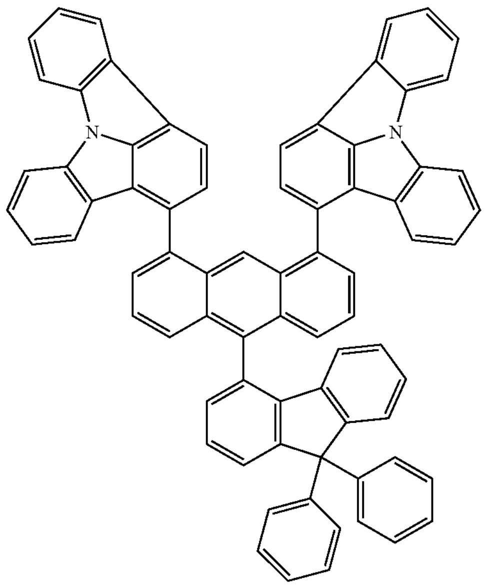
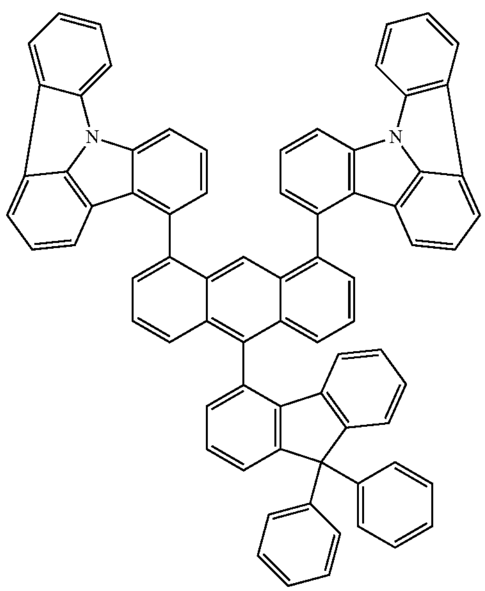
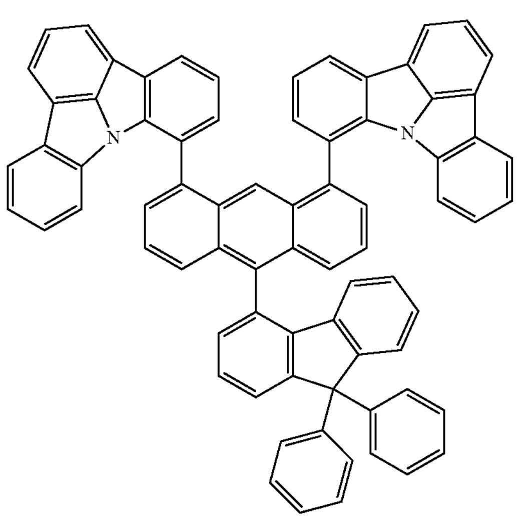
-continued
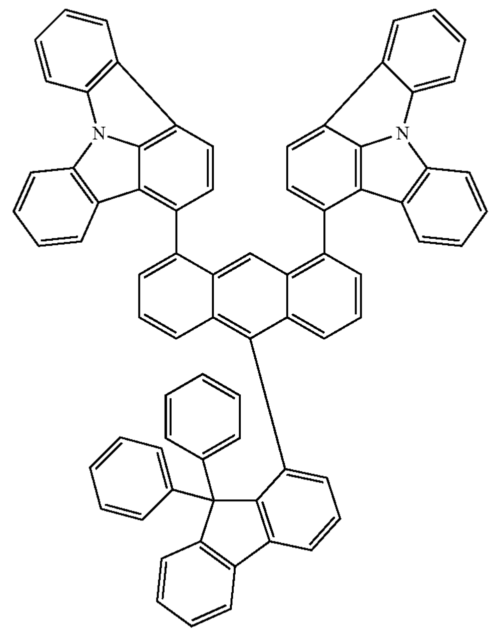
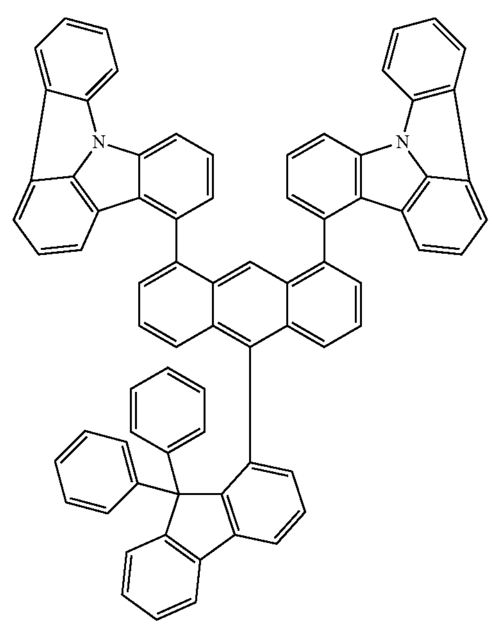

-continued
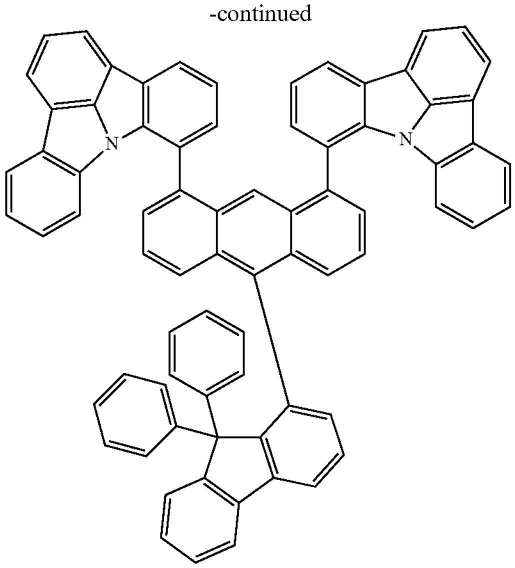
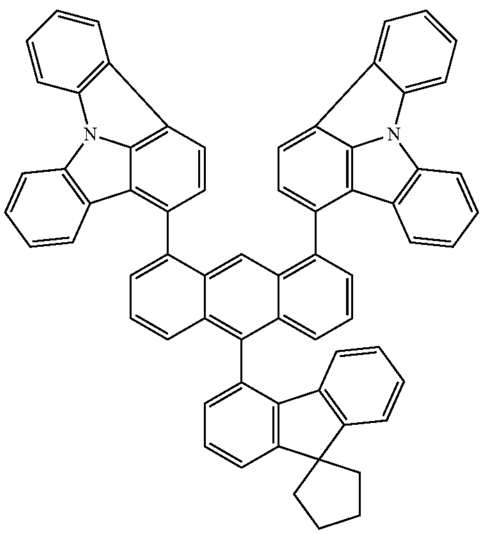
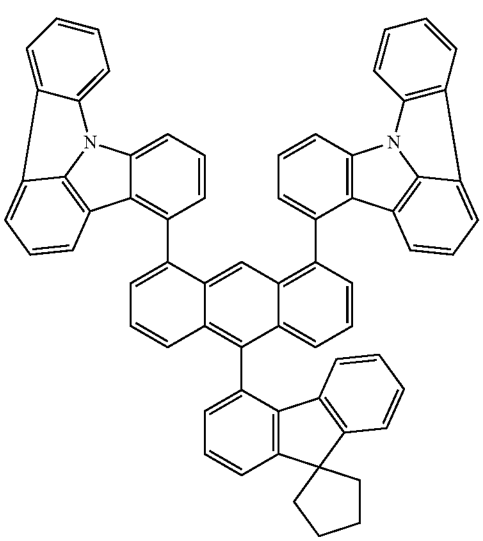
-continued
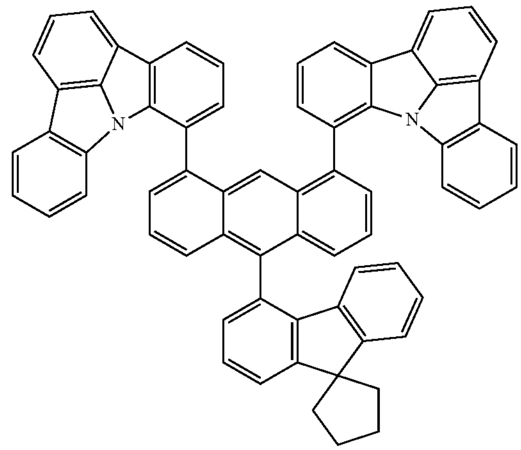
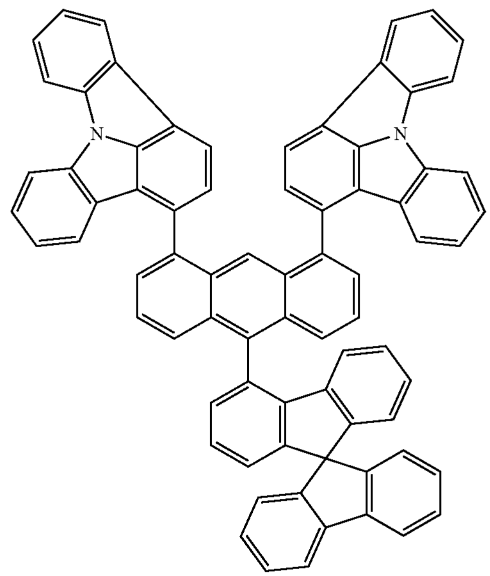
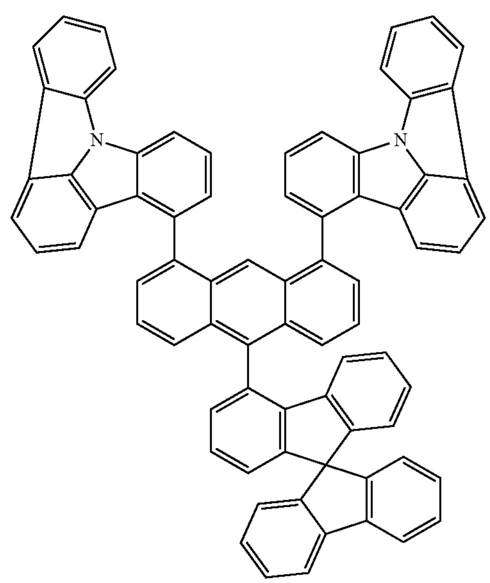

-continued
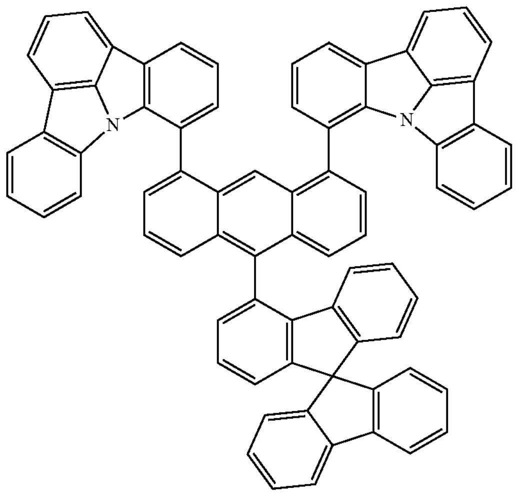
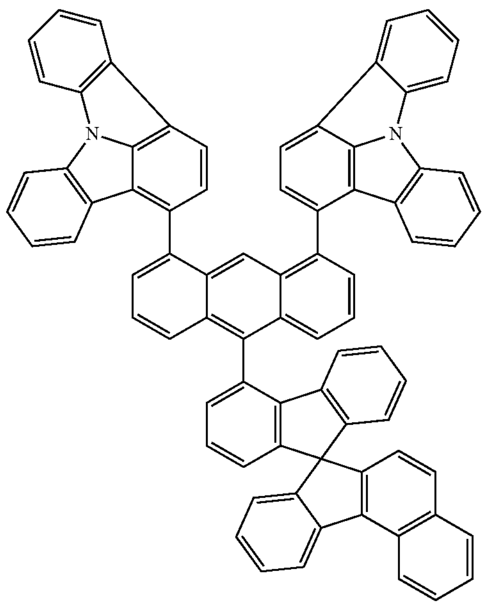
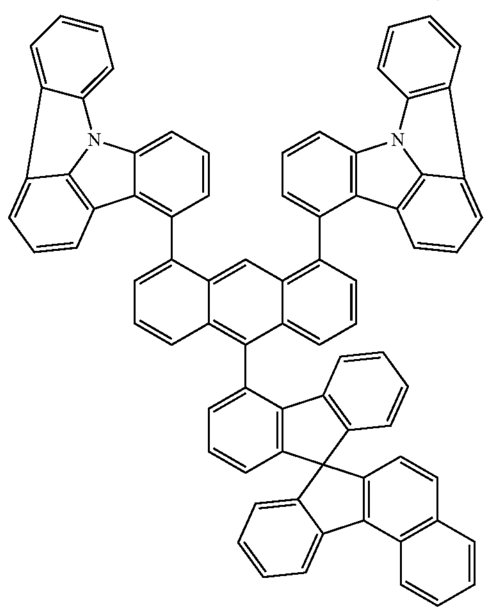
-continued
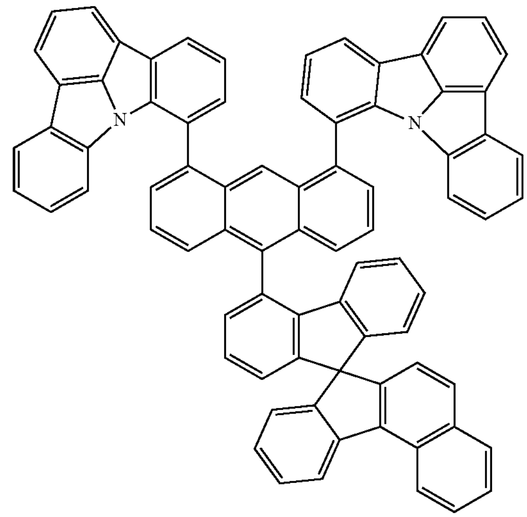
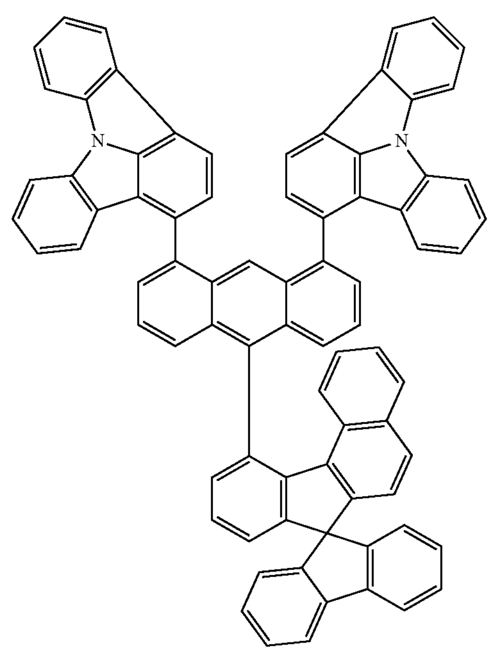

-continued
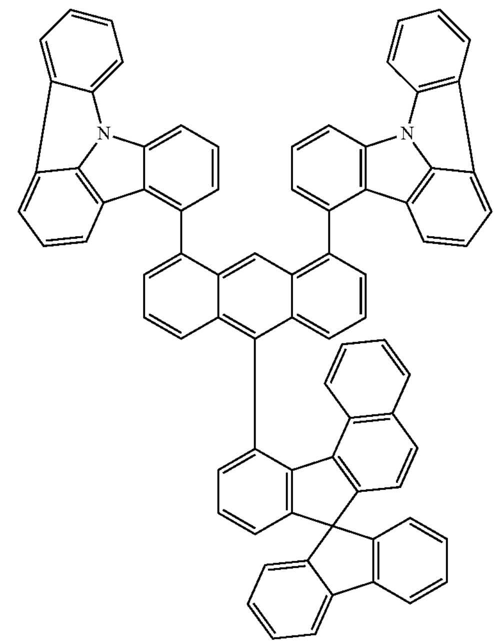
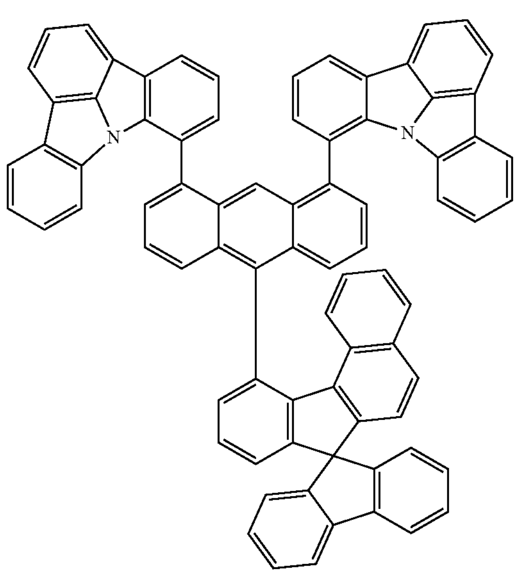 [SMILES: c1ccc2c(c1)-c1ccccc1C21c2cccc(-c3c4cccc(-c5cccc6c7cccc8c9ccccc9n(c56)c87)c4cc4c(-c5cccc6c7cccc8c9ccccc9n(c56)c87)cccc34)c2-c2c1ccc1ccccc21]
-continued
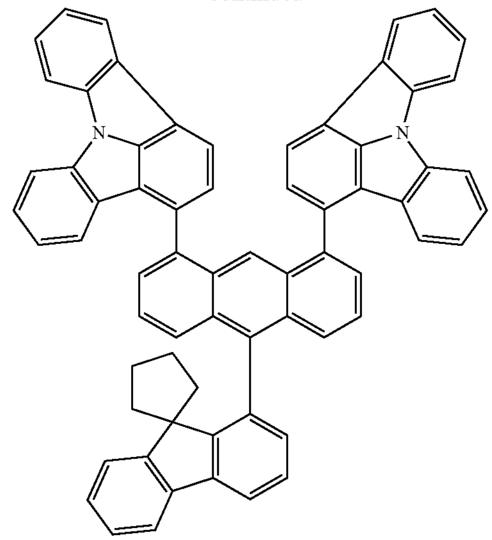
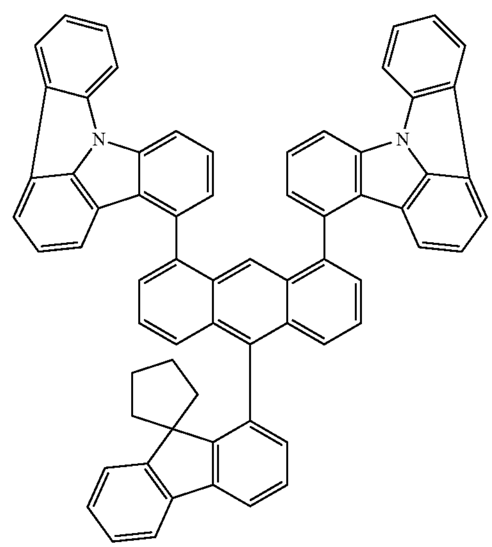
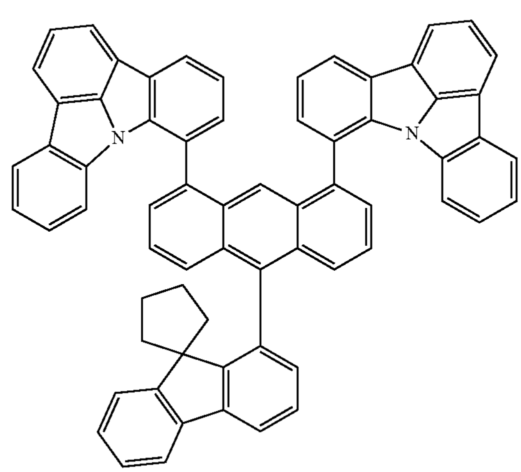

-continued
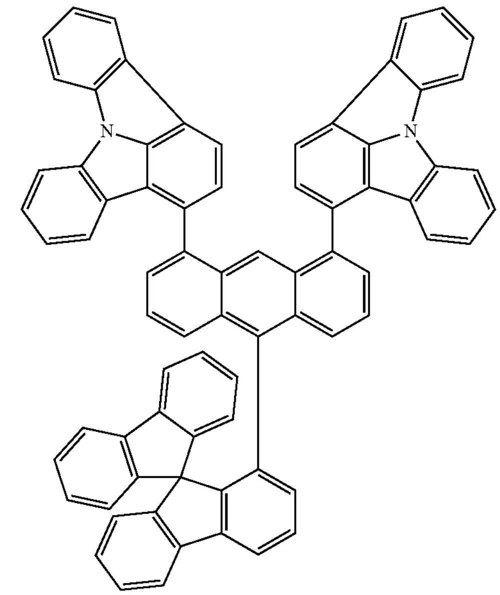
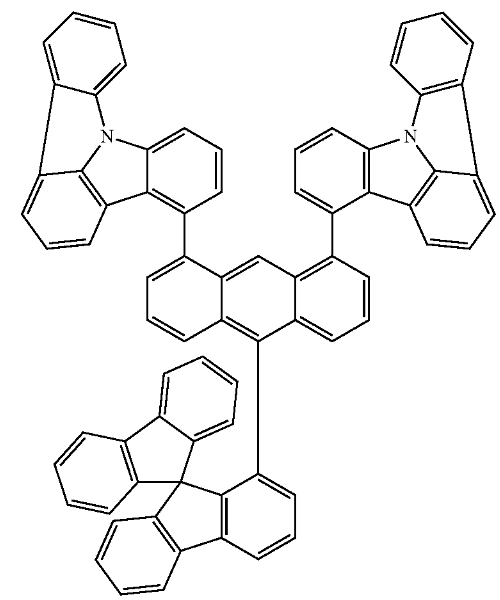
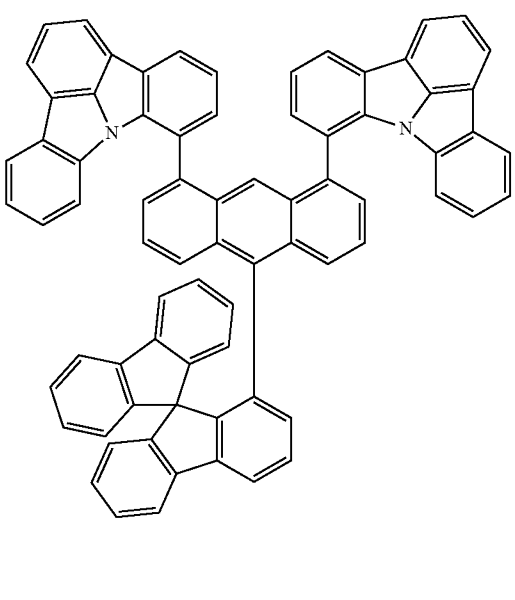
-continued
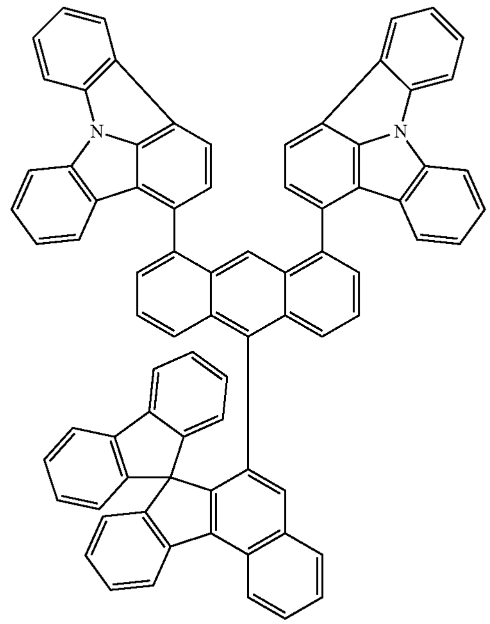
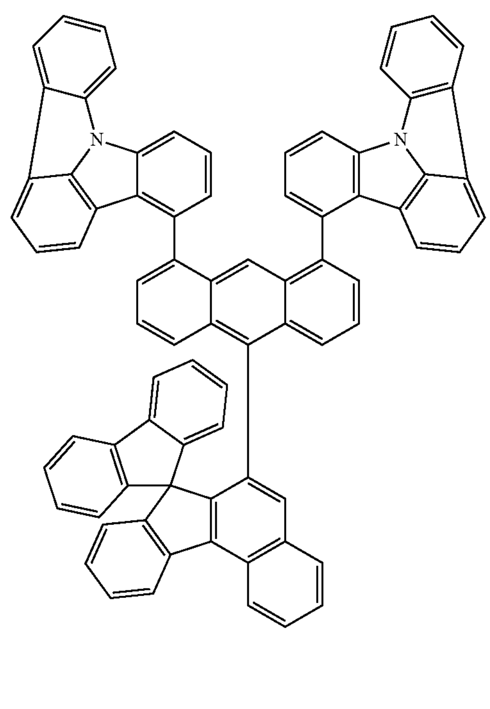

-continued
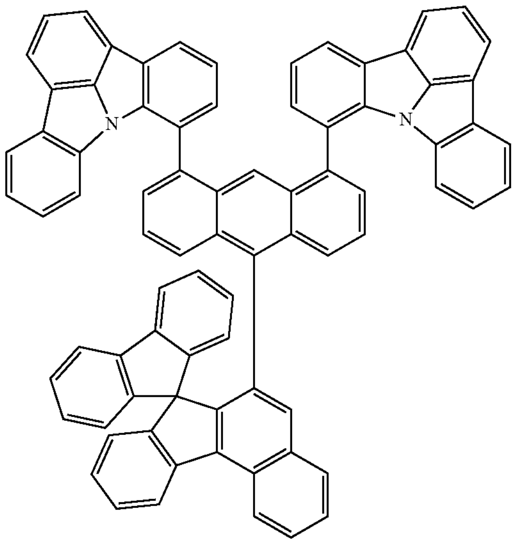
-continued
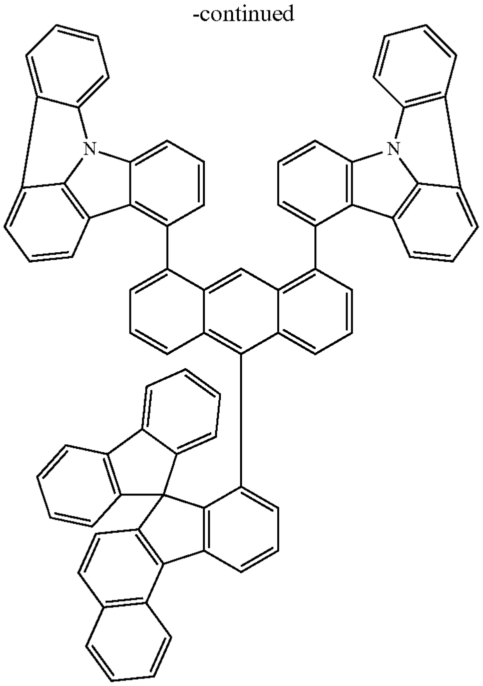
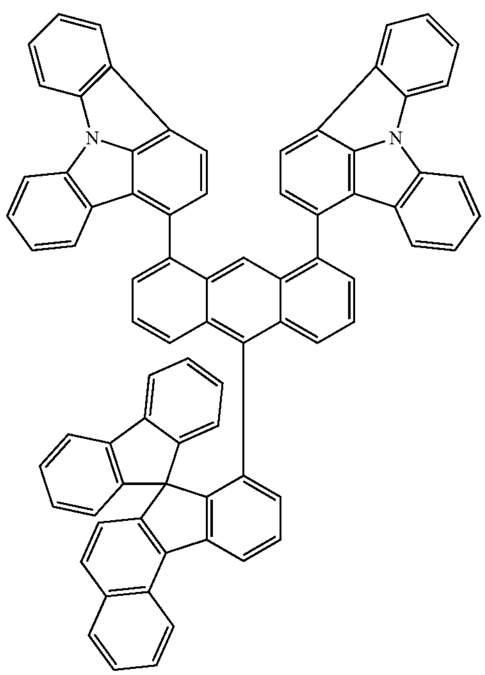
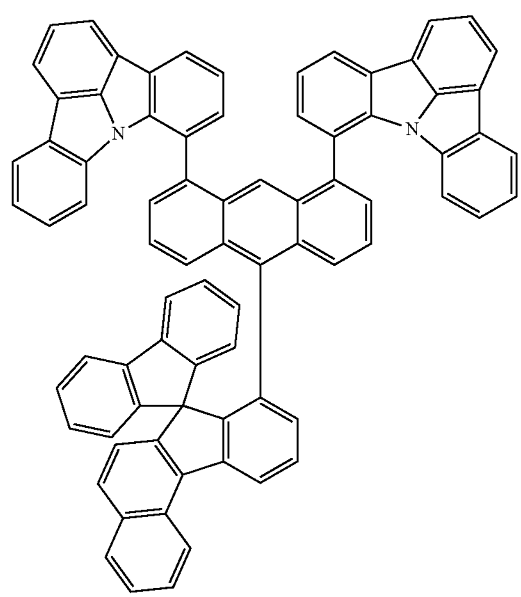 [SMILES: c1ccc2c(c1)-c1ccccc1C21c2ccc3ccccc3c2-c2cccc(-c3c4cccc(-c5cccc6c7cccc8c9ccccc9n(c56)c87)c4cc4c(-c5cccc6c7cccc8c9ccccc9n(c56)c87)cccc34)c21]

-continued
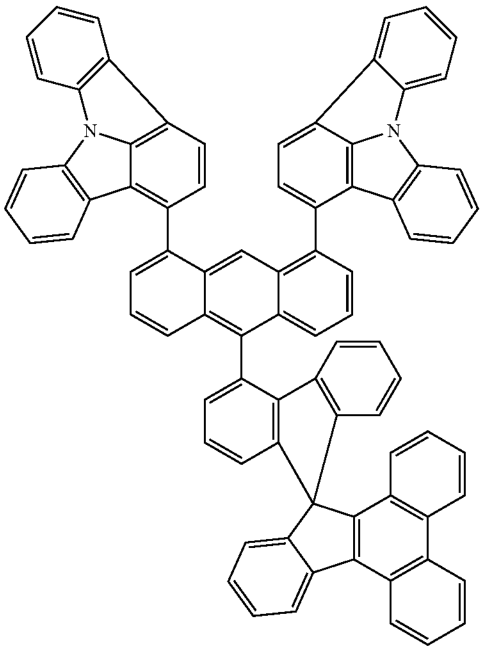
-continued
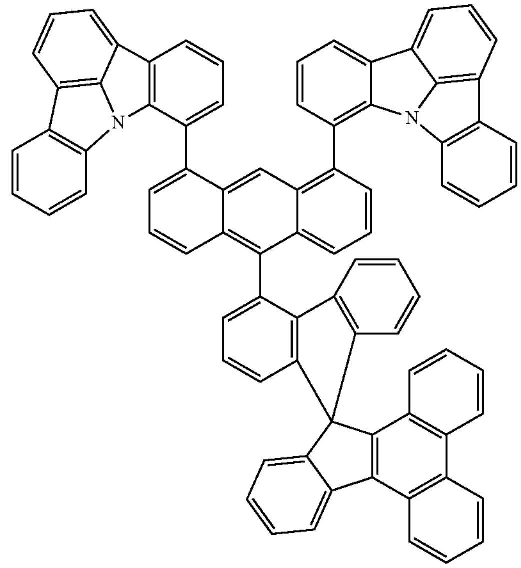 [SMILES: c1ccc2c(c1)-c1c(-c3c4cccc(-c5cccc6c7cccc8c9ccccc9n(c56)c87)c4cc4c(-c5cccc6c7cccc8c9ccccc9n(c56)c87)cccc34)cccc1C21c2ccccc2-c2c1c1ccccc1c1ccccc21]
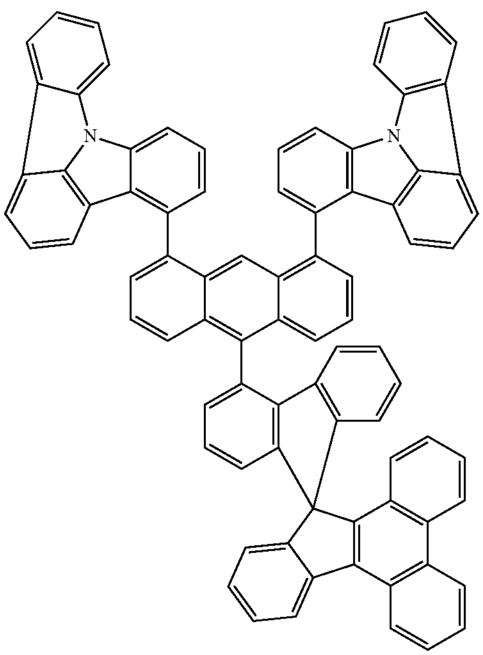
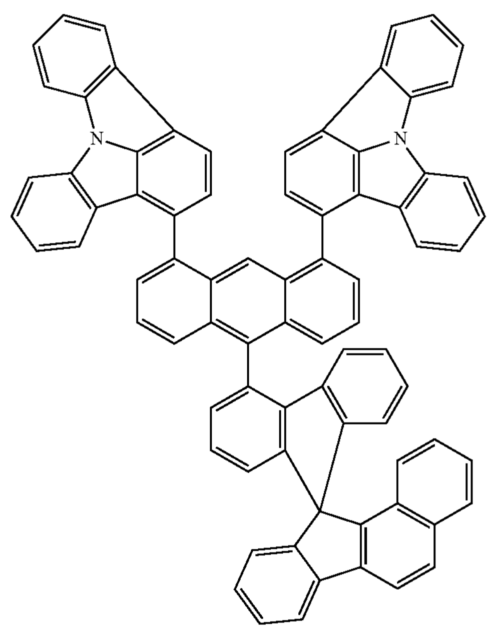

-continued
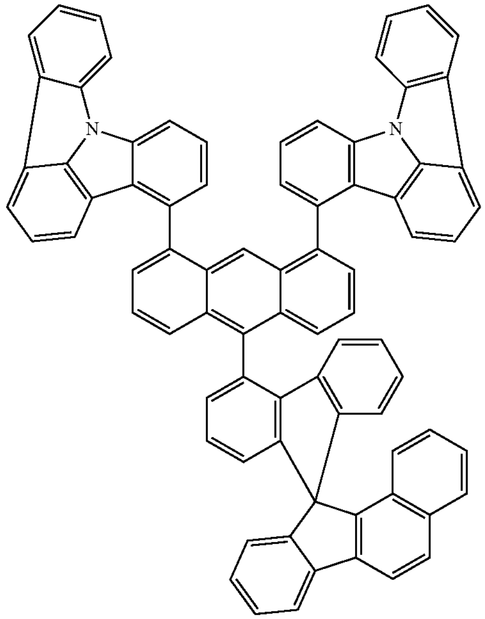
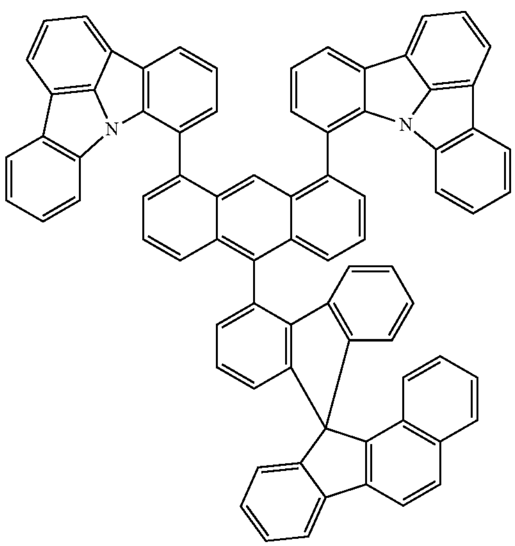
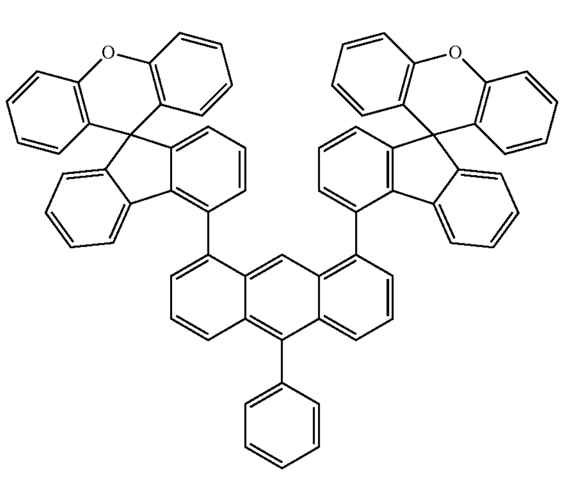
-continued
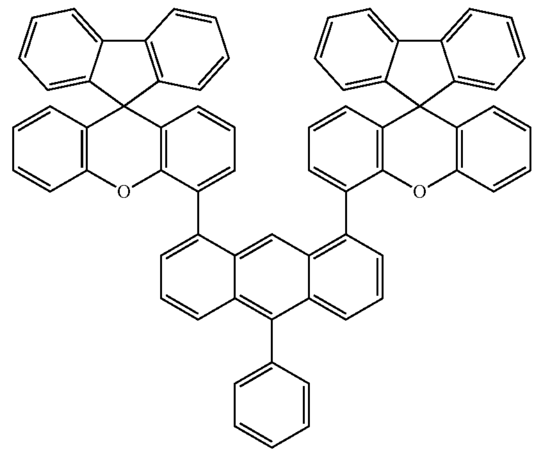
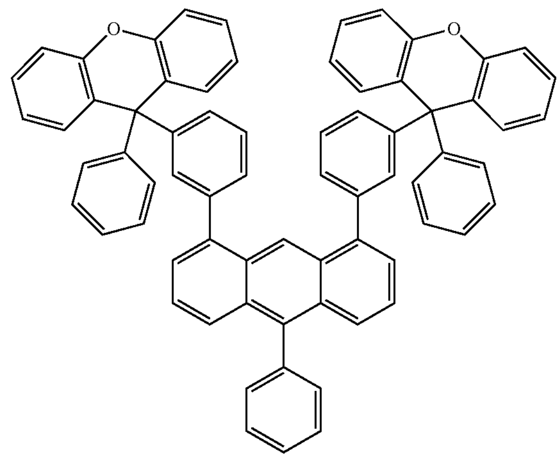
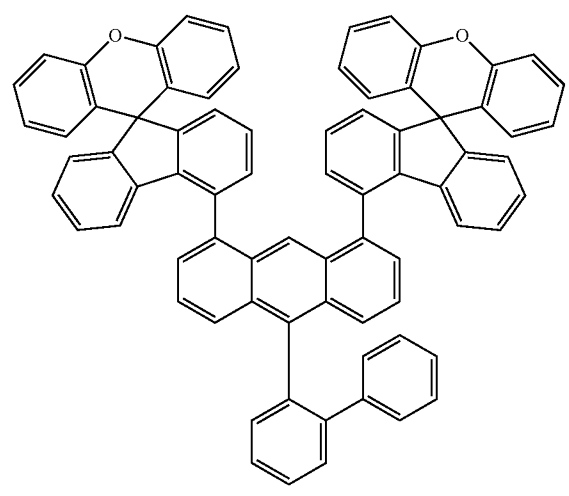

-continued
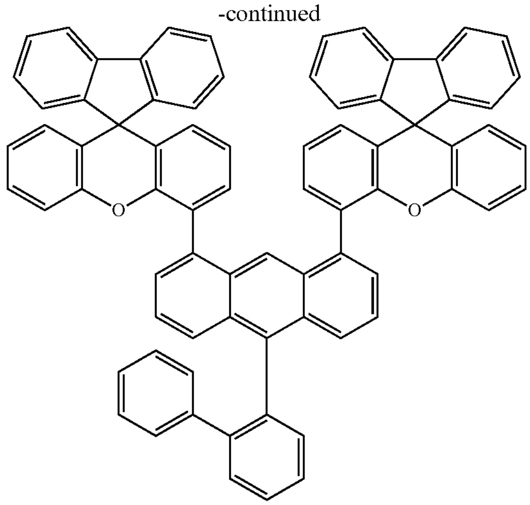
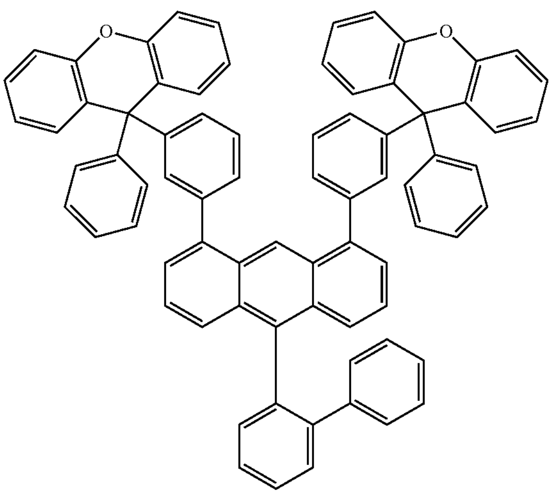
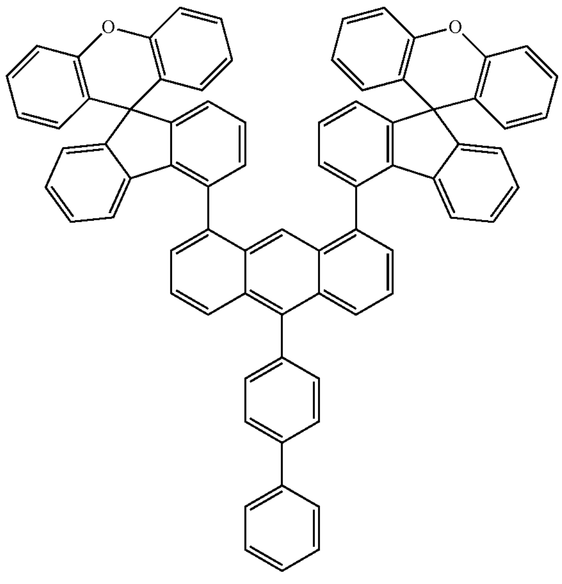
-continued
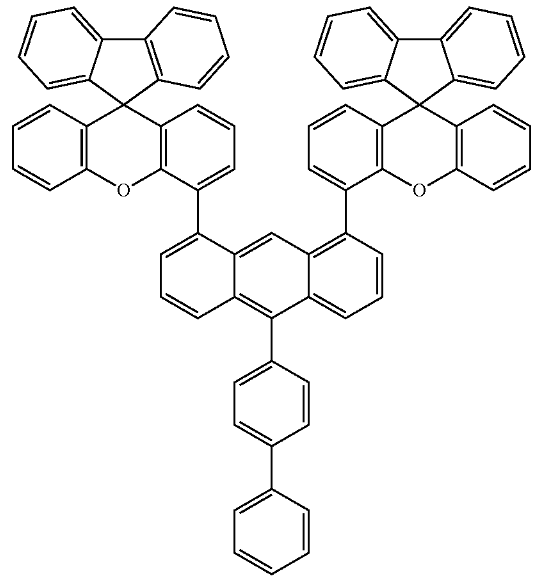
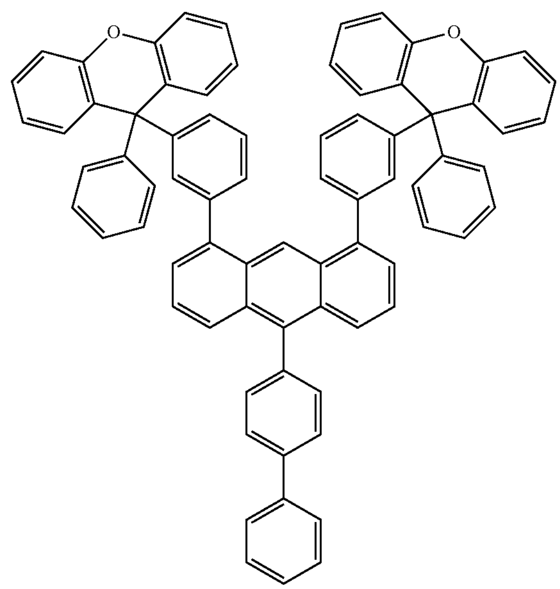
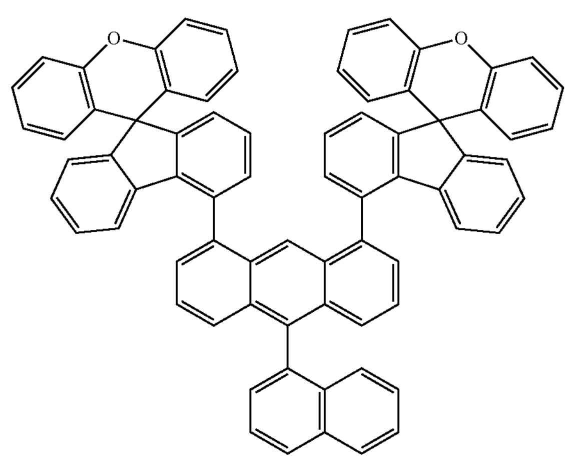

-continued
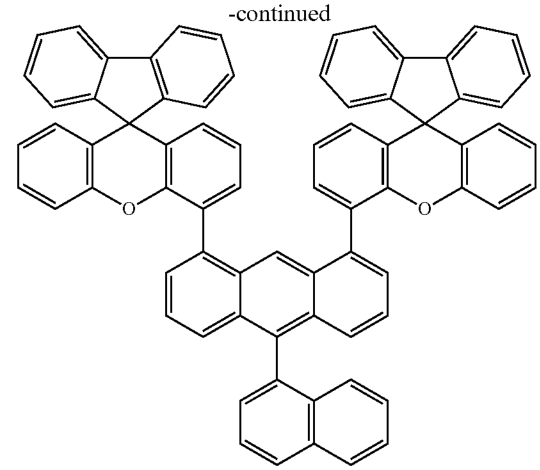
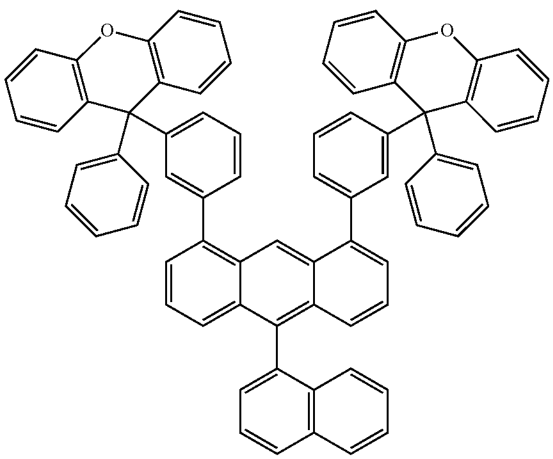
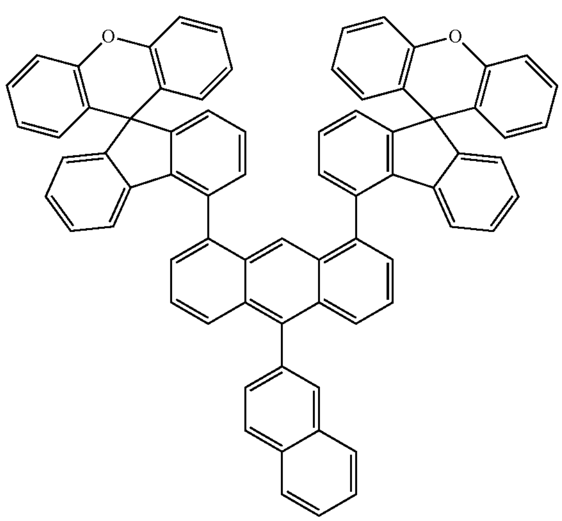
-continued
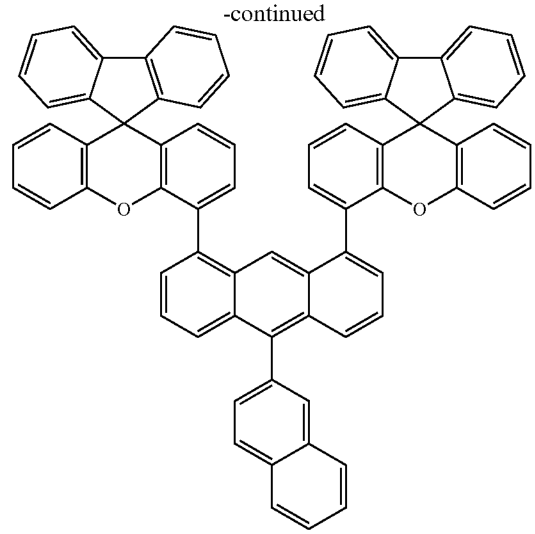
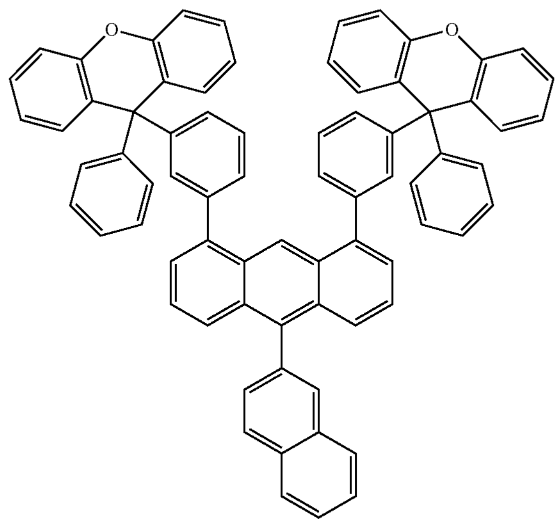
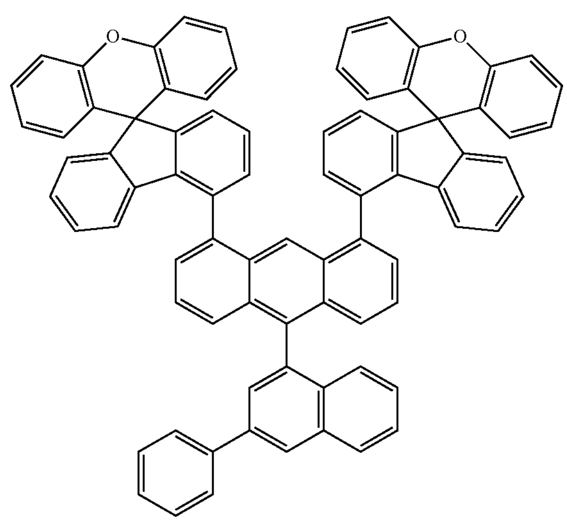

-continued
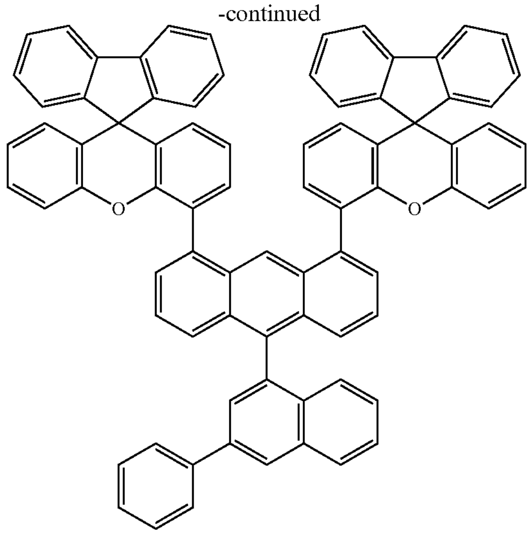
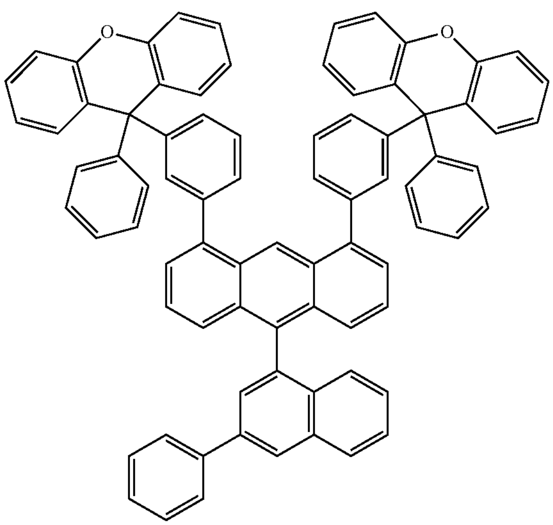
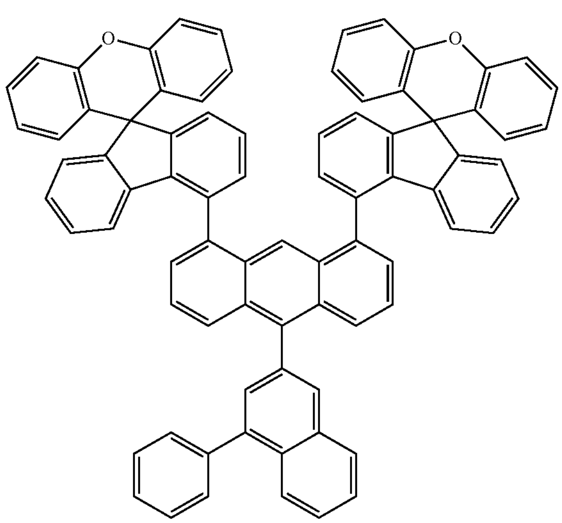
-continued
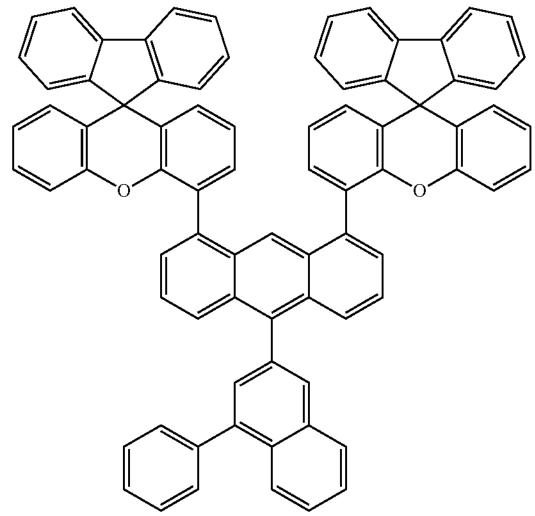
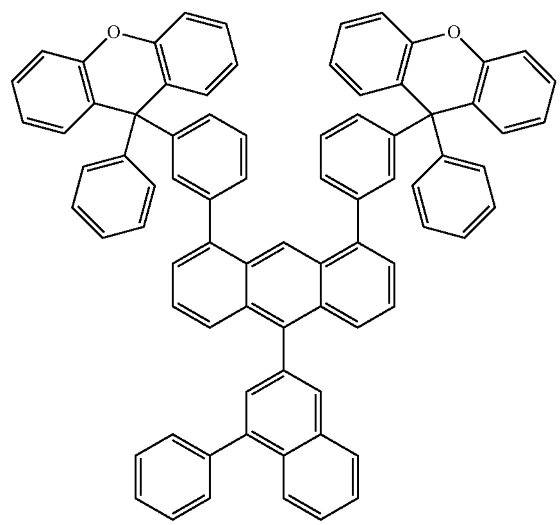
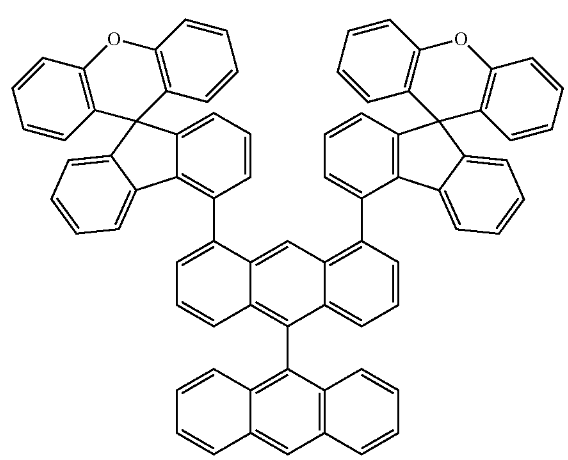

-continued
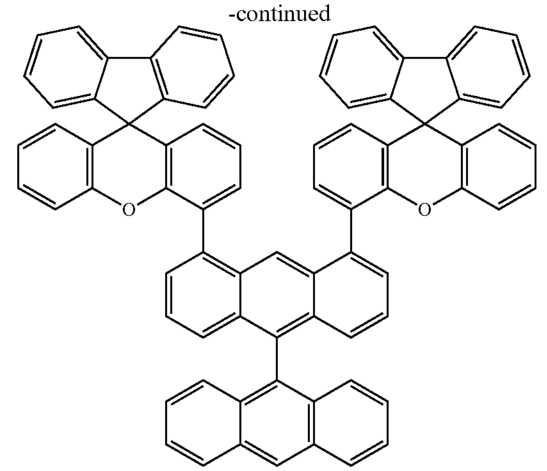
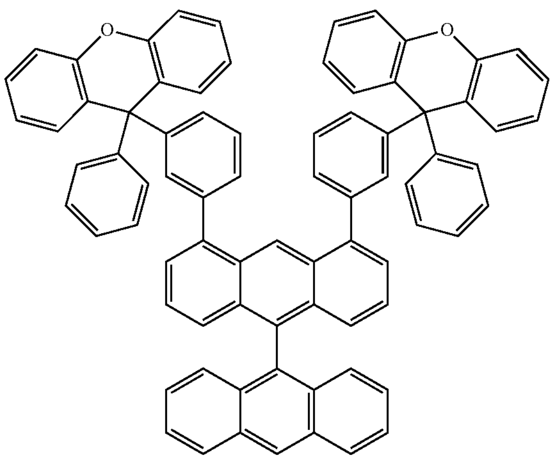
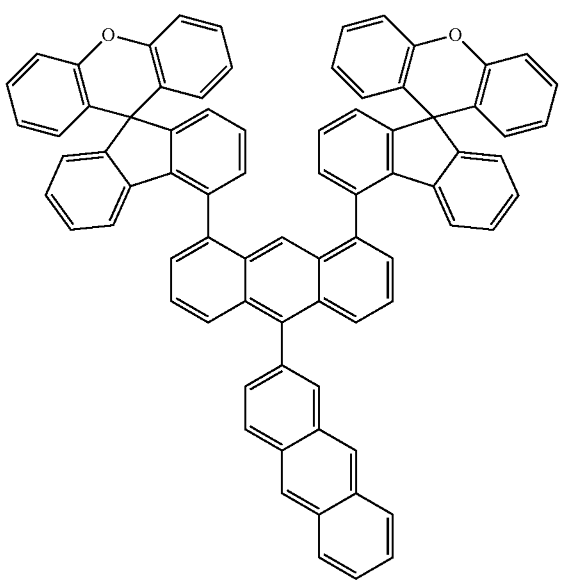
-continued
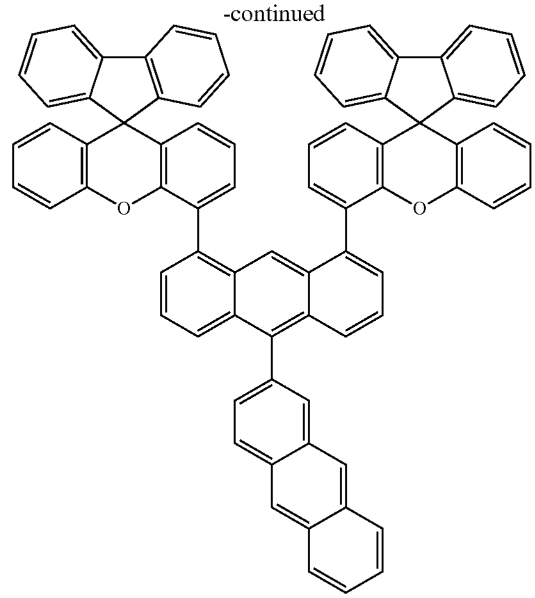
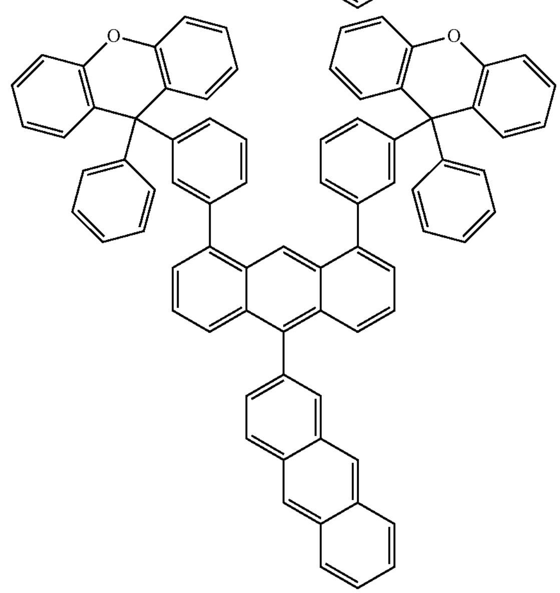
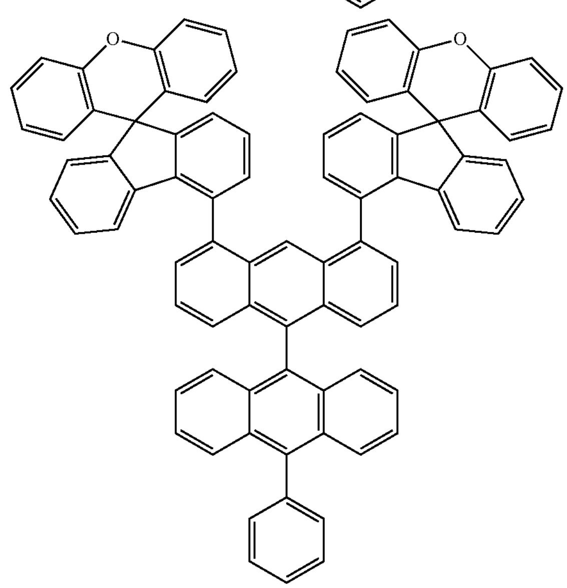

-continued
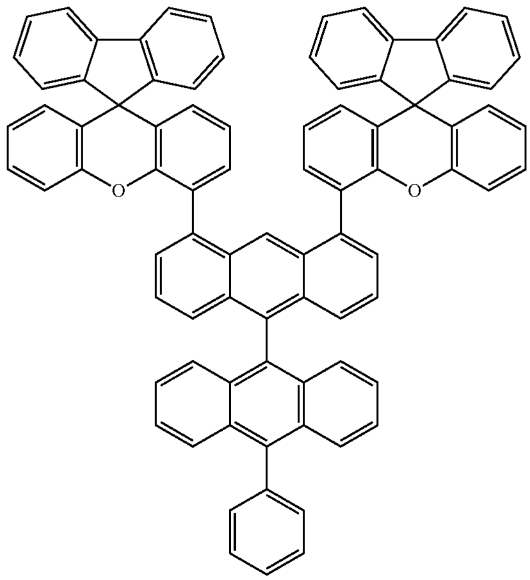
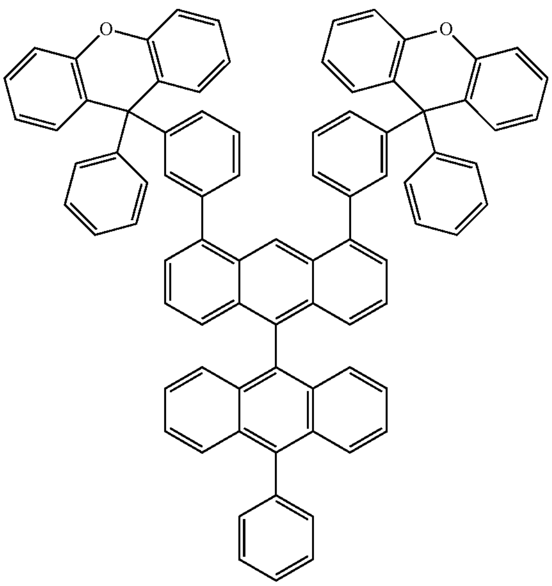
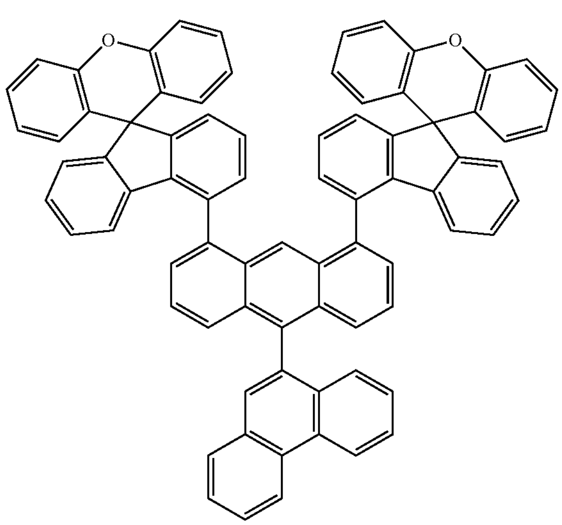
-continued
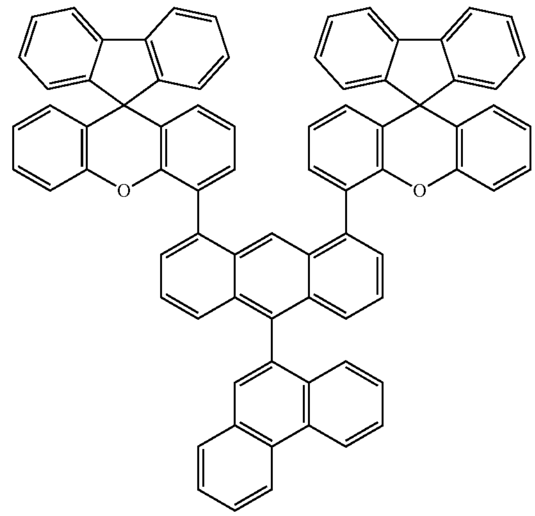
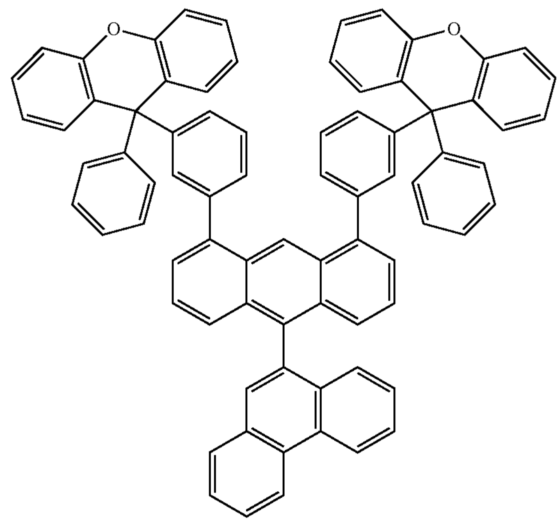
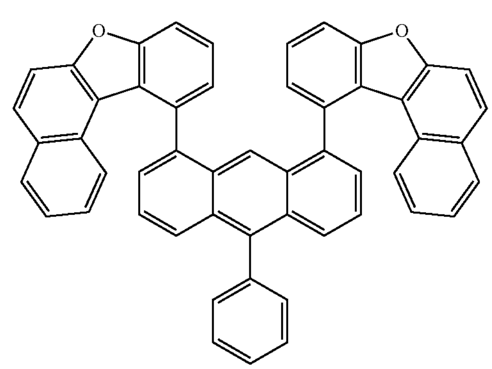

-continued
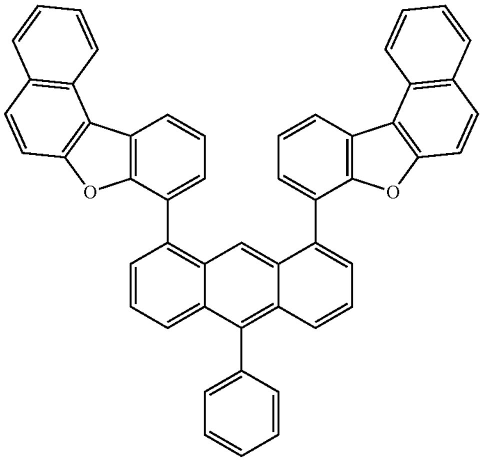
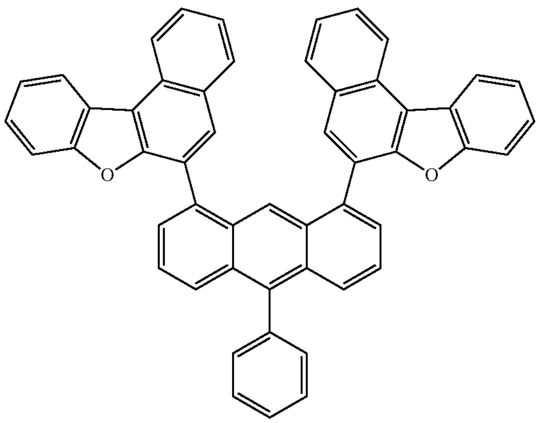
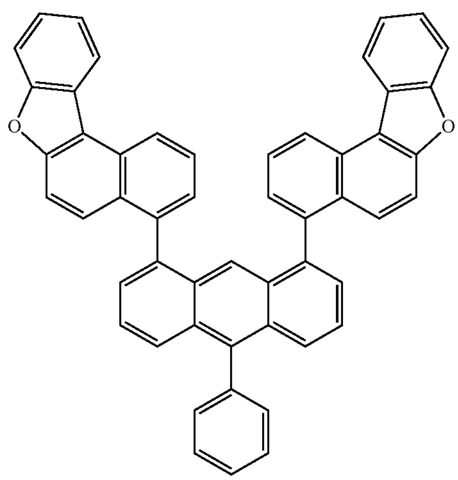
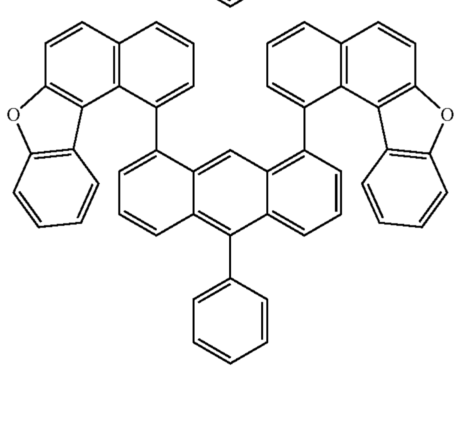
-continued
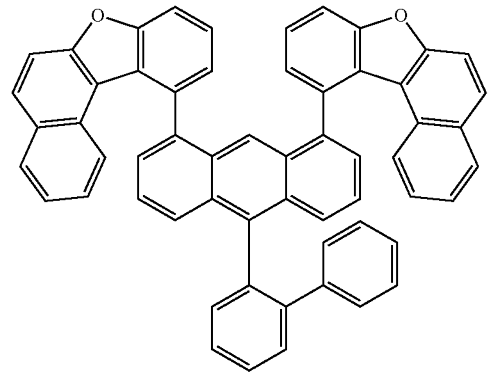
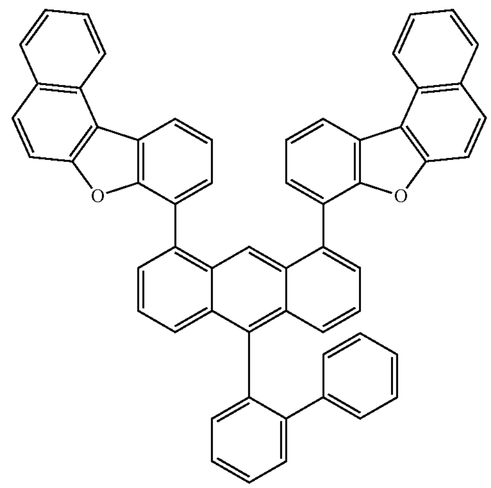
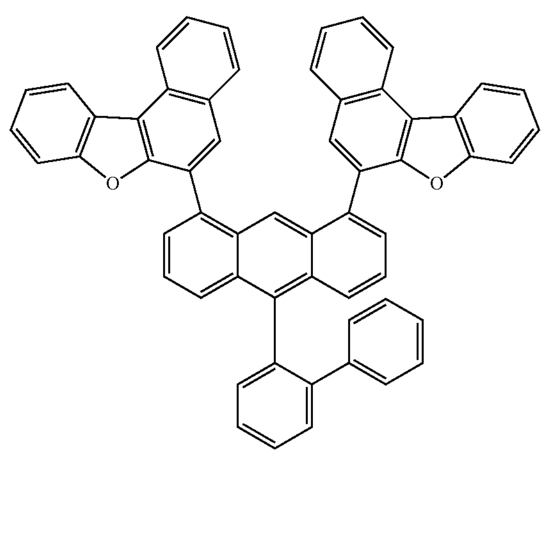

-continued
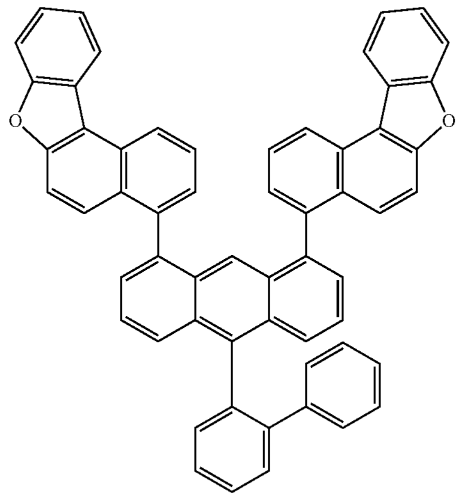
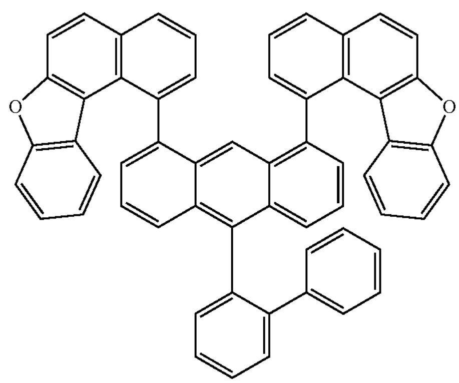
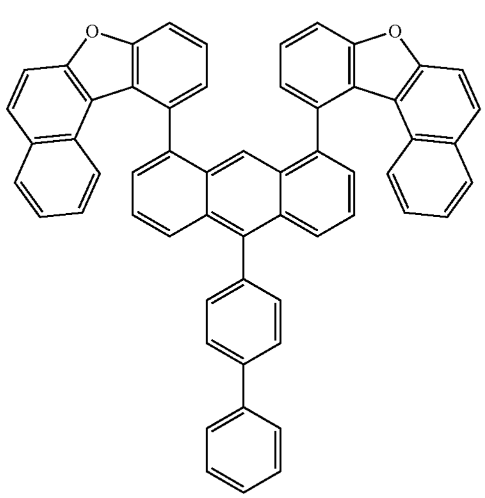
-continued
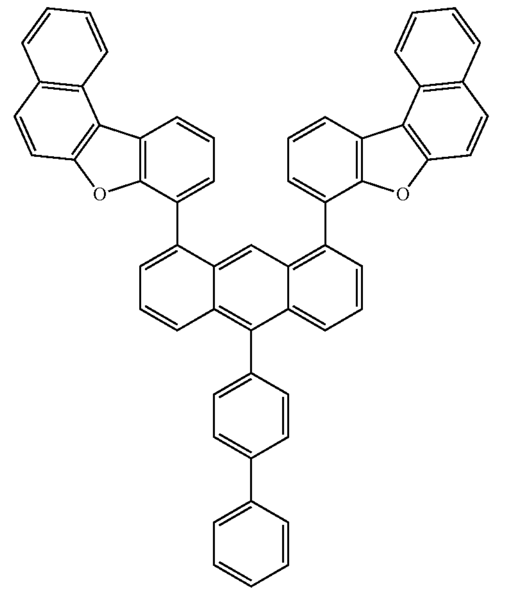
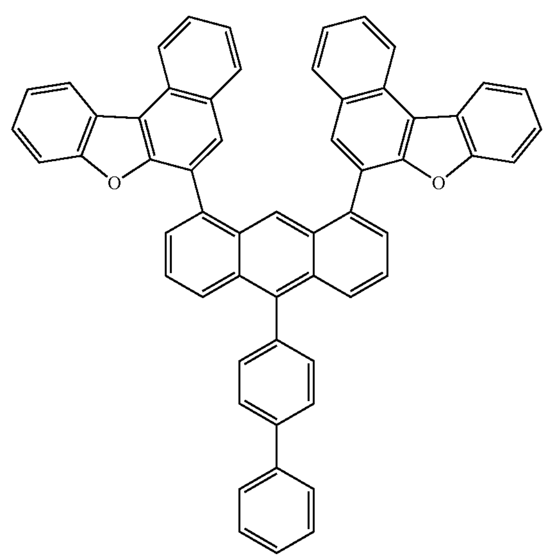

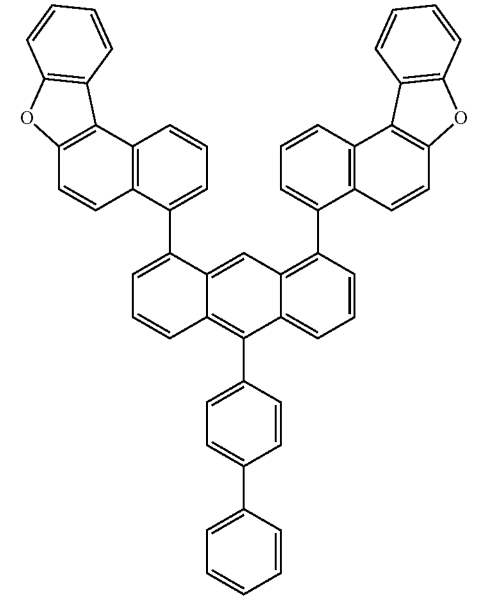
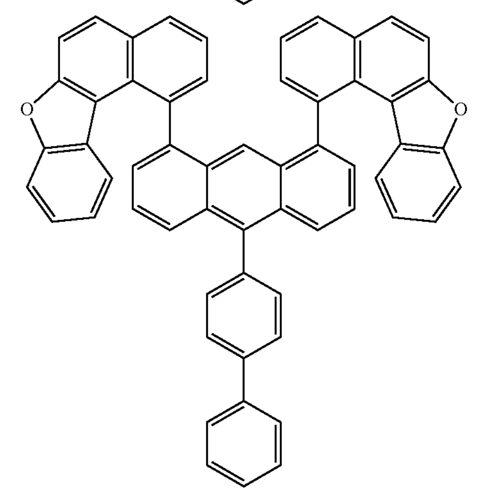
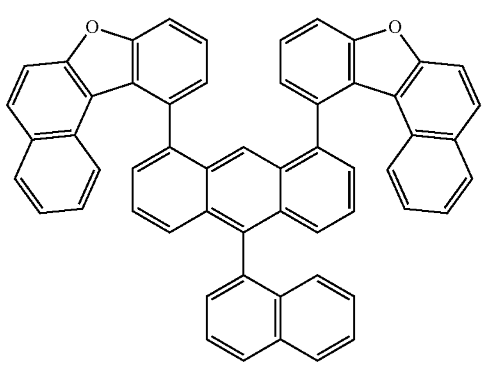
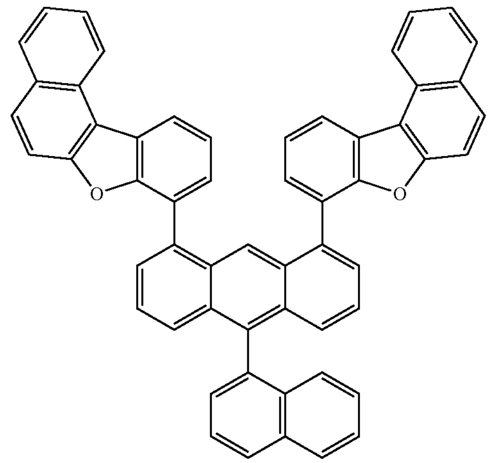
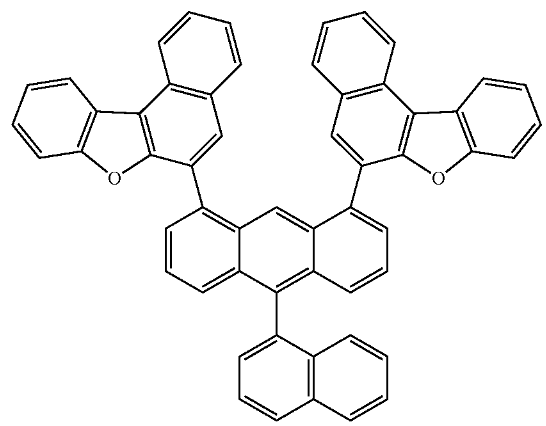
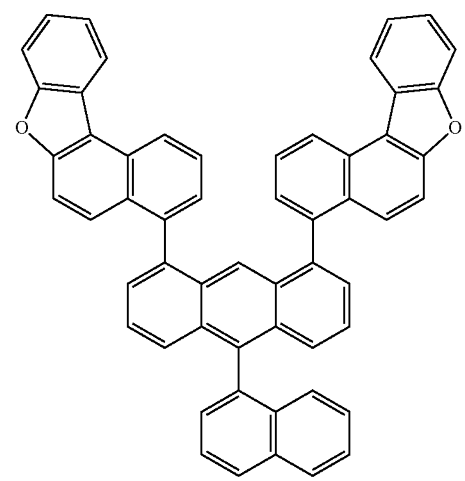
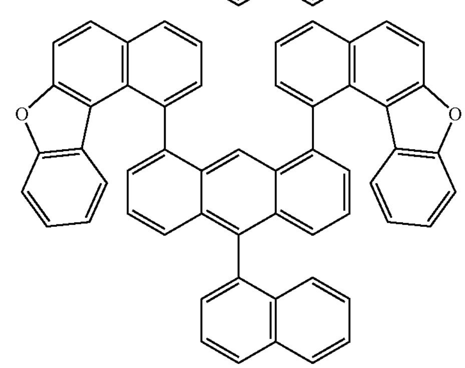

-continued
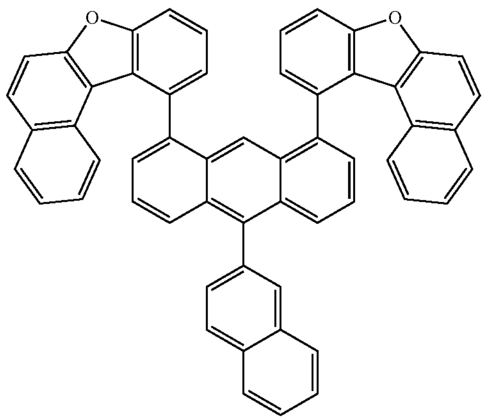
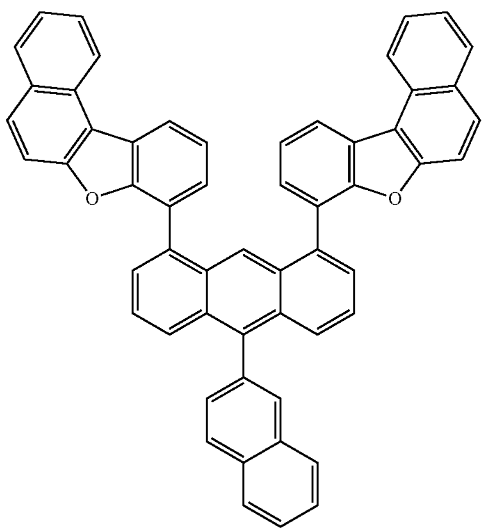
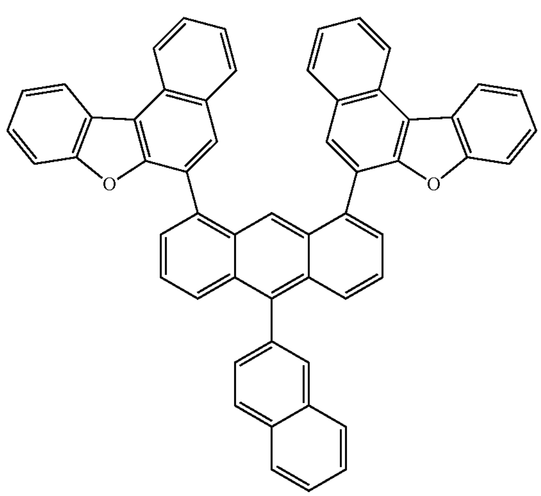
-continued
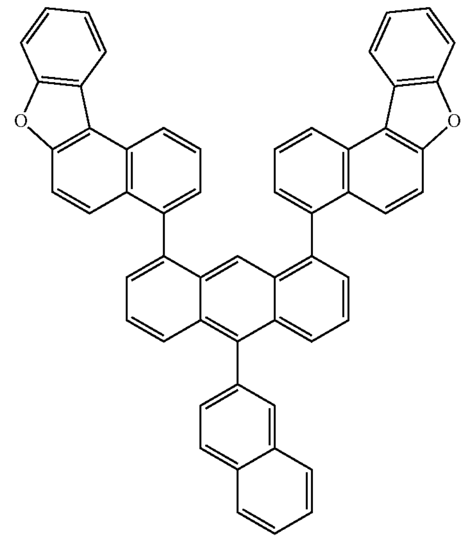
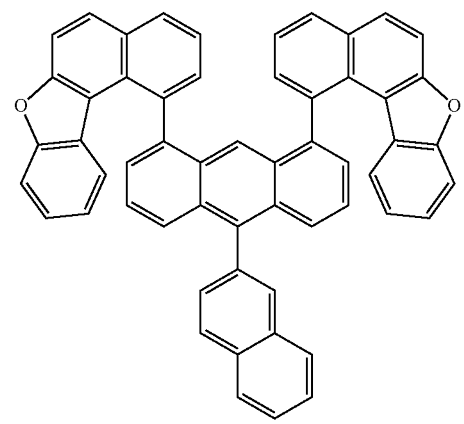
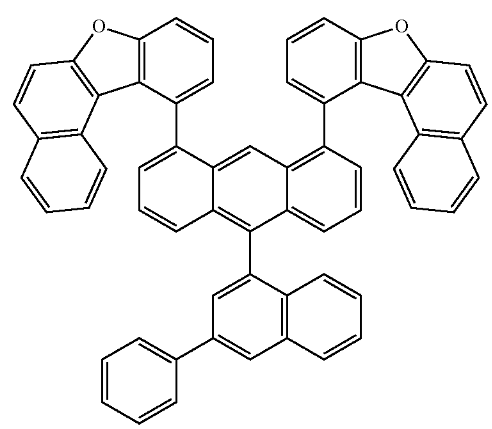

-continued
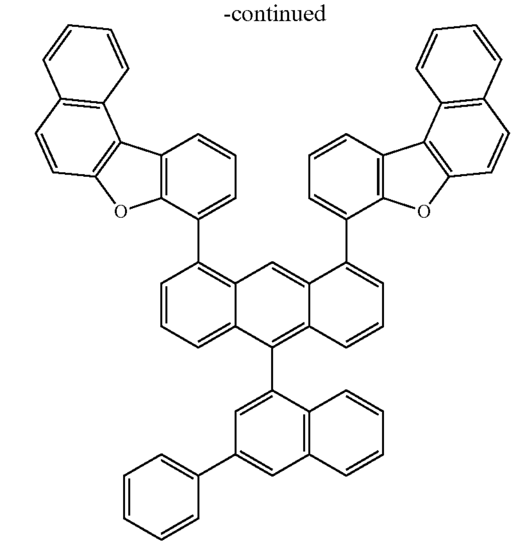
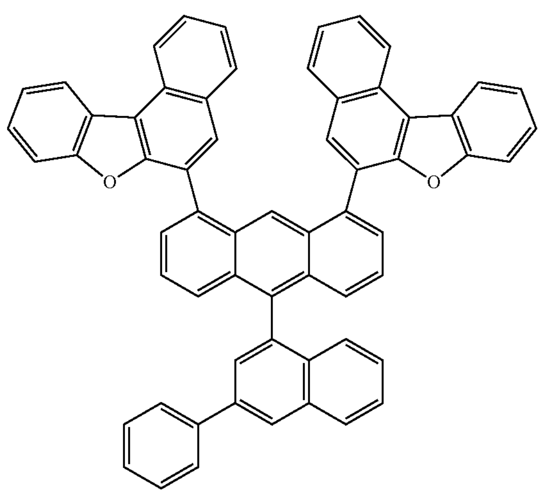
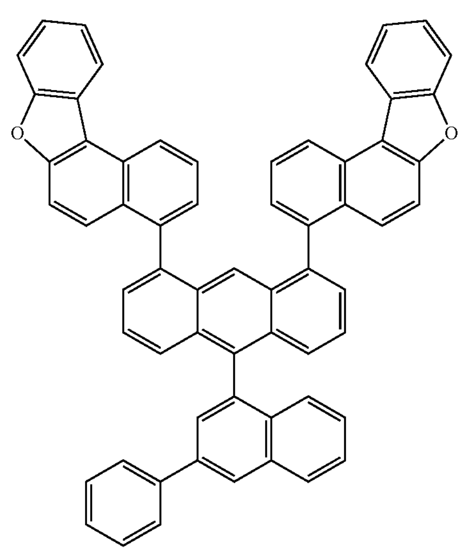
-continued
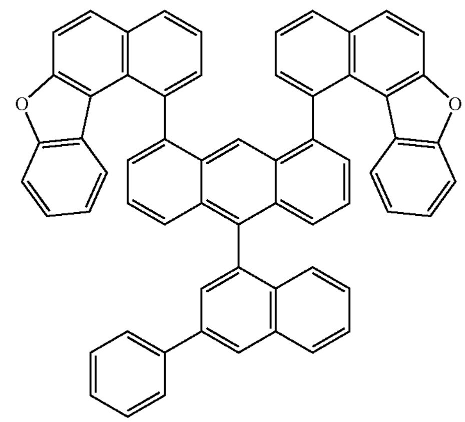
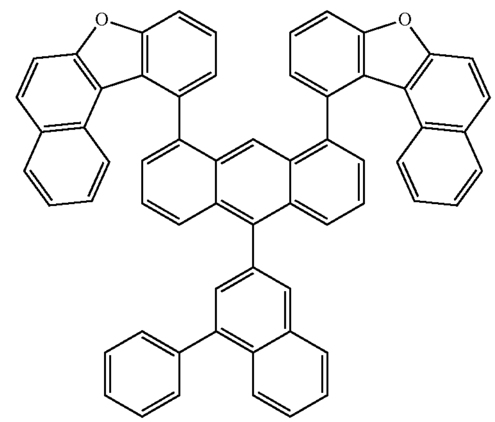
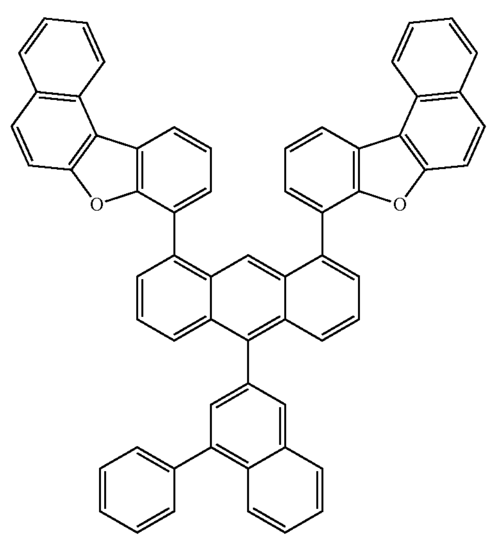

-continued
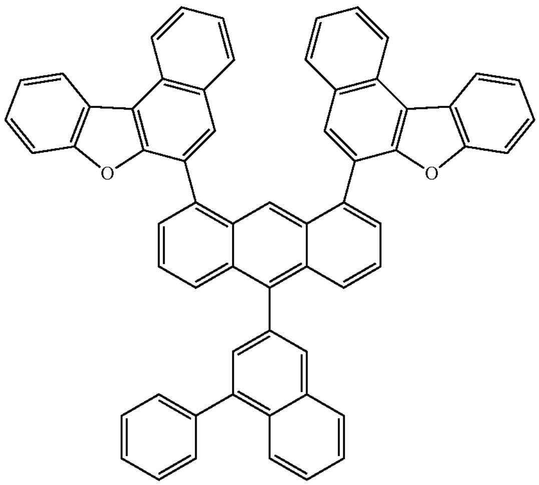
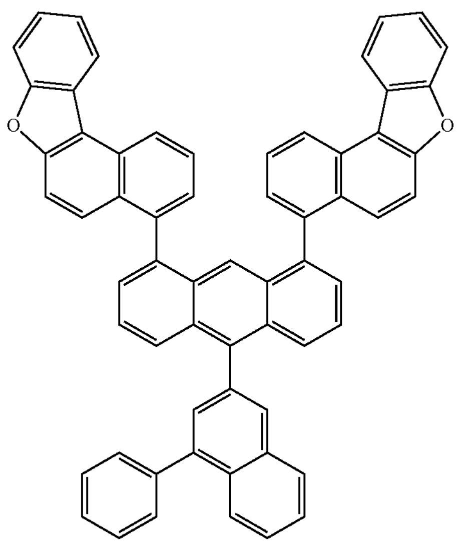
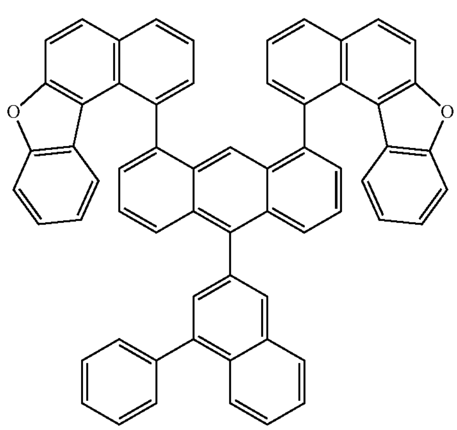
-continued
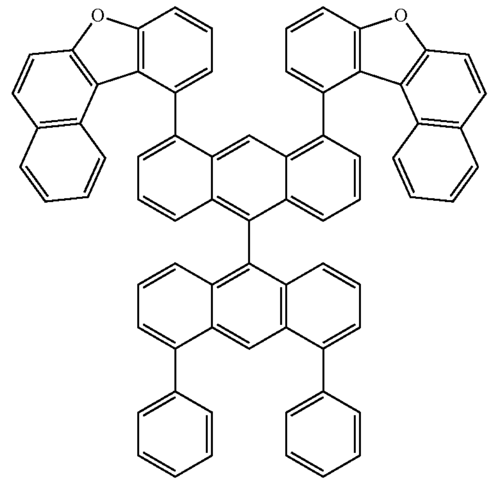
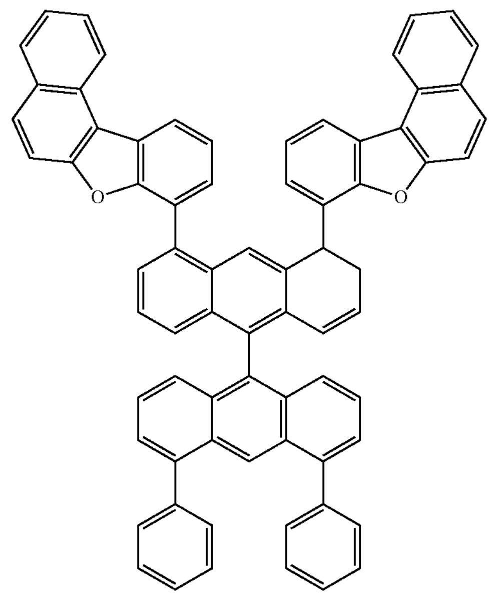
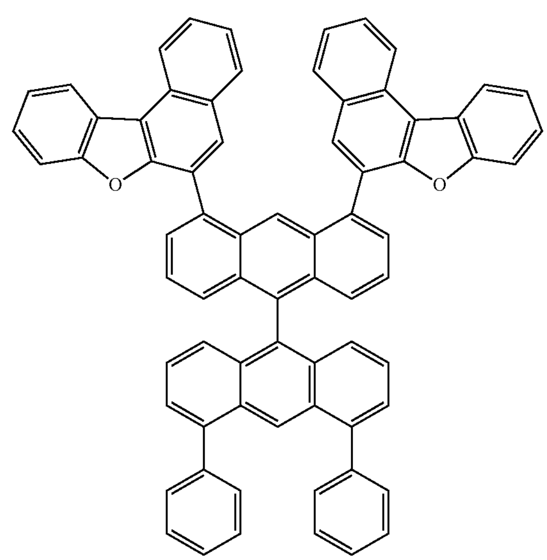

-continued
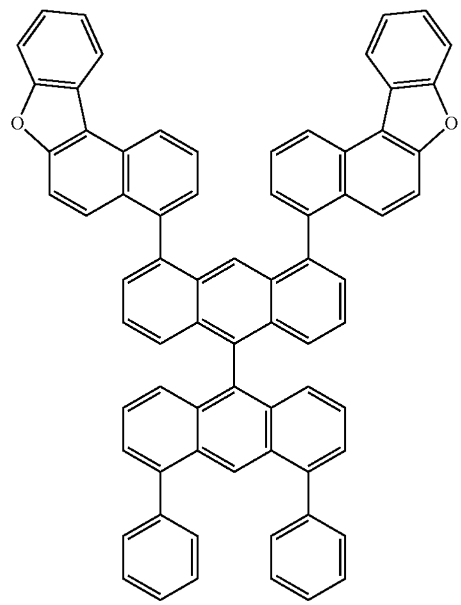
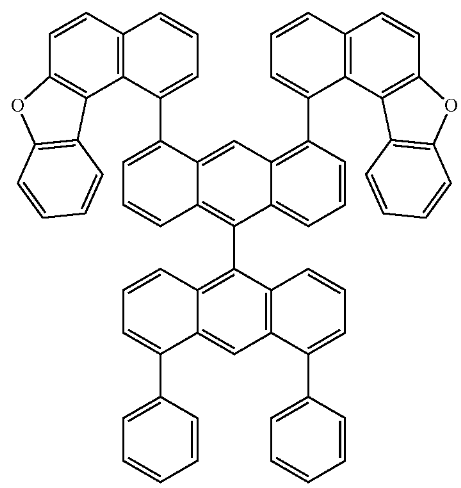
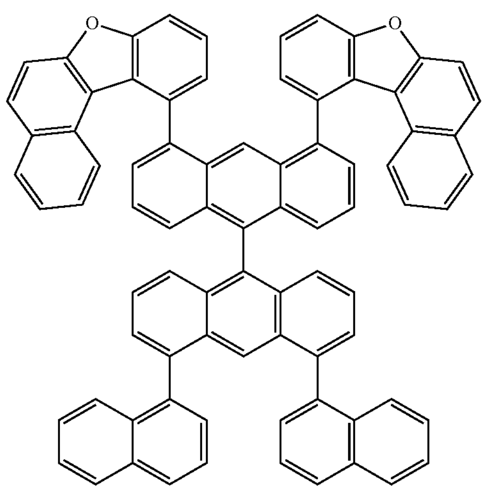
-continued
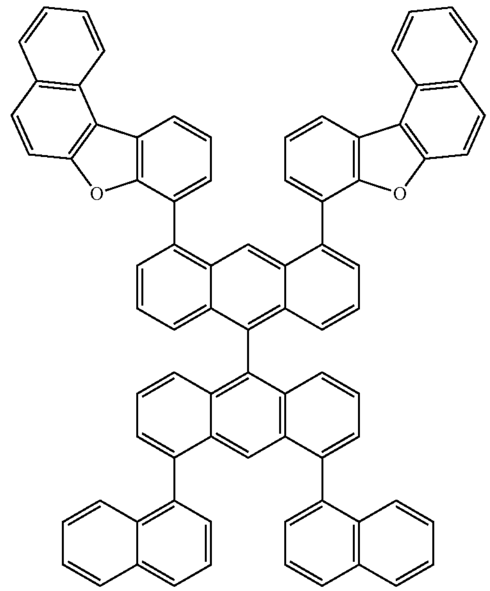
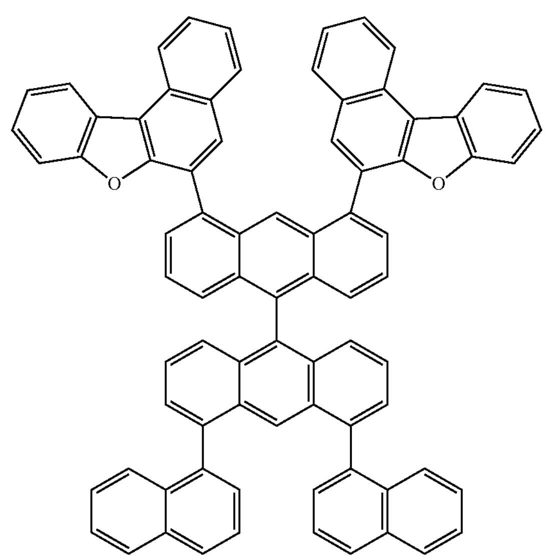

-continued
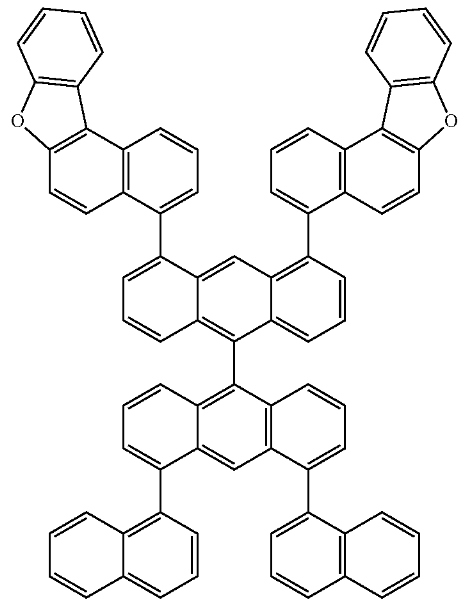
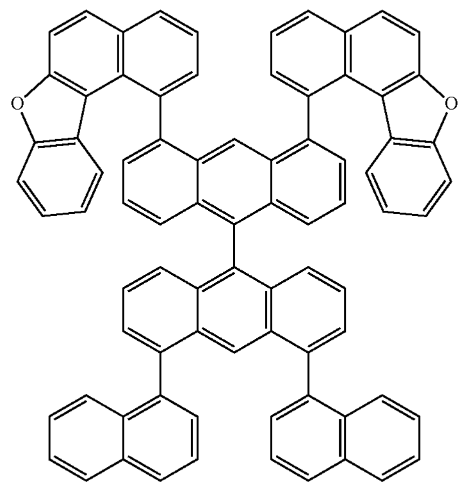
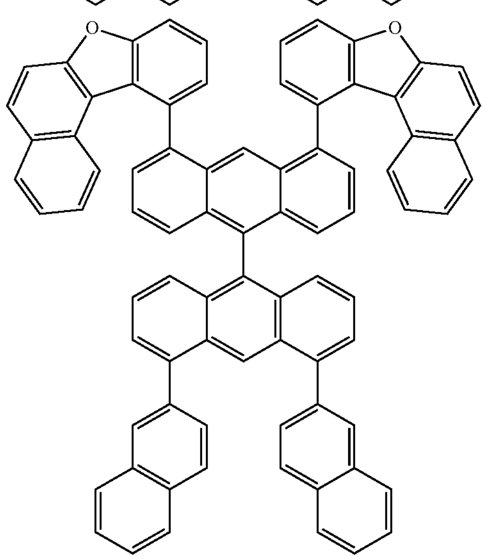
-continued
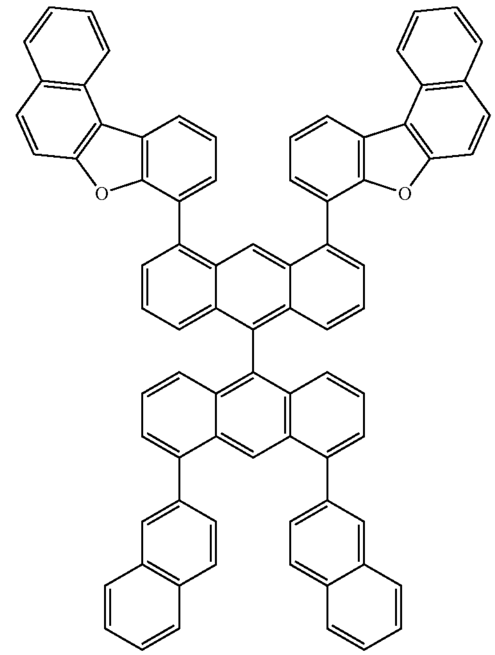
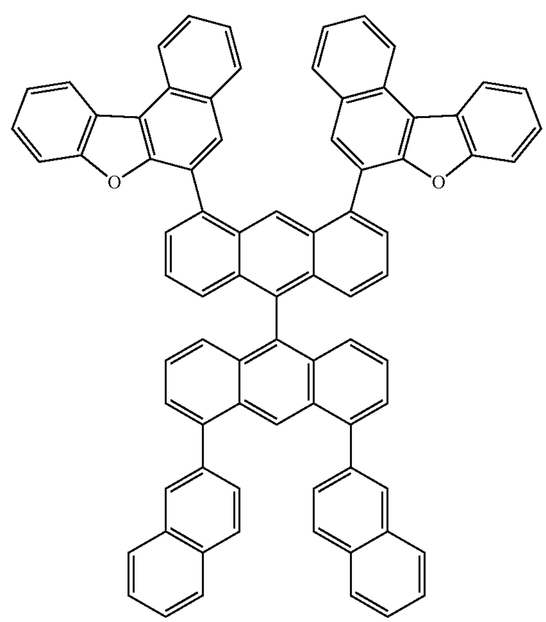

-continued
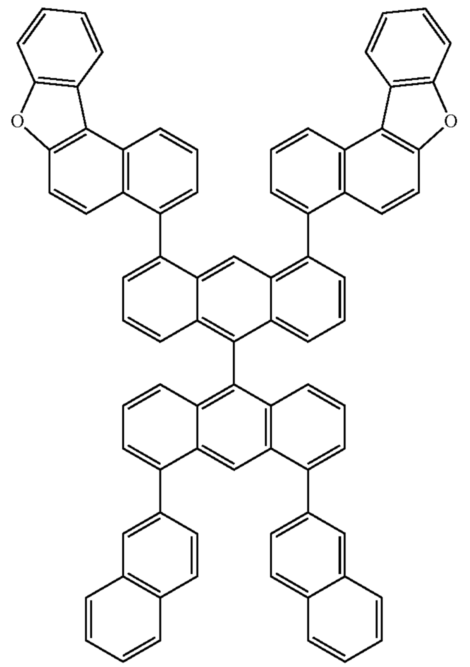
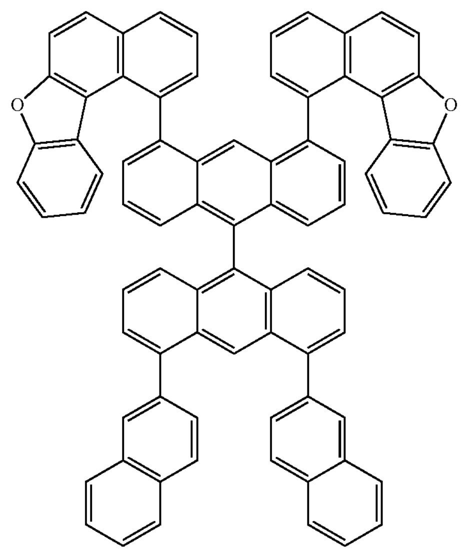
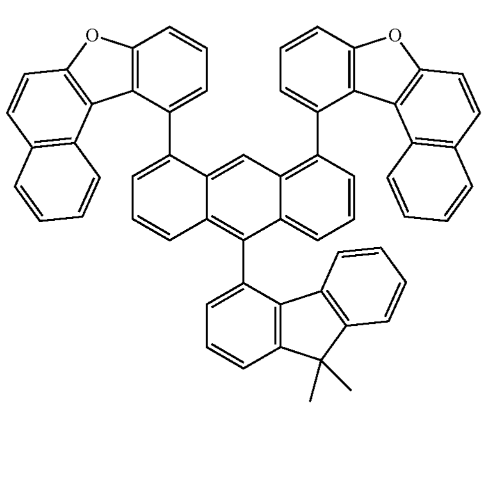
-continued
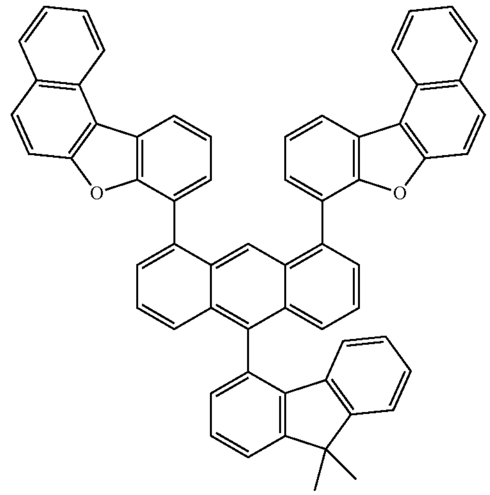
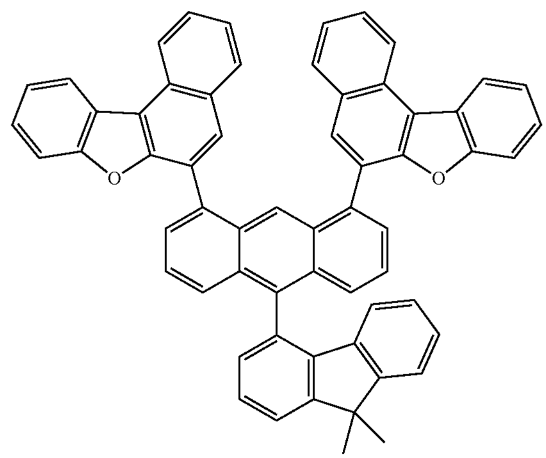
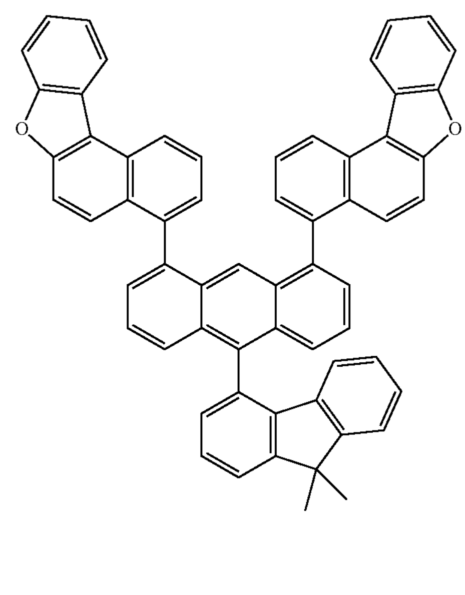

-continued
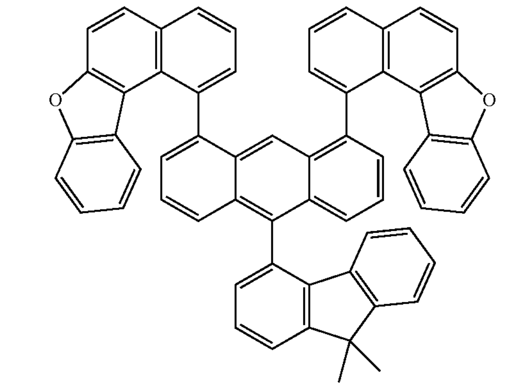
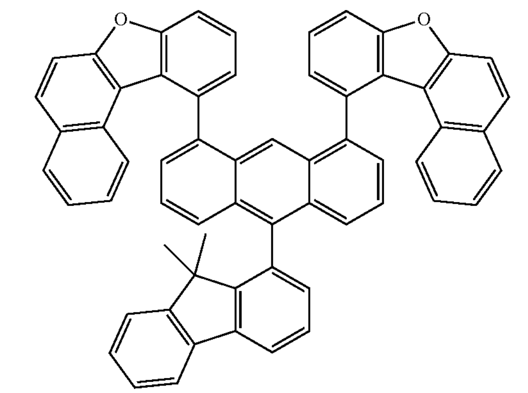
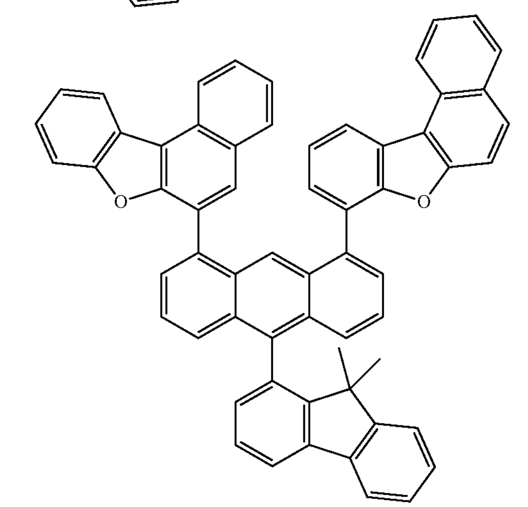
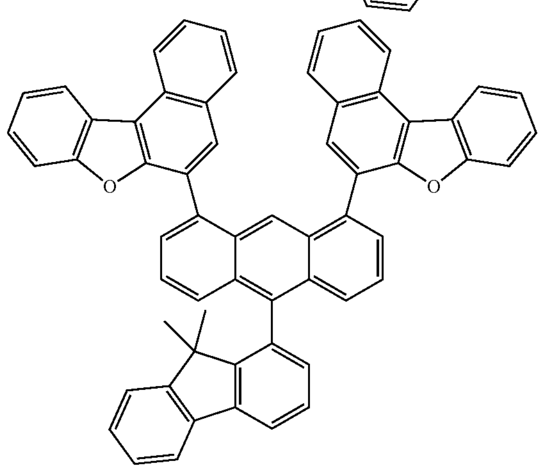
-continued
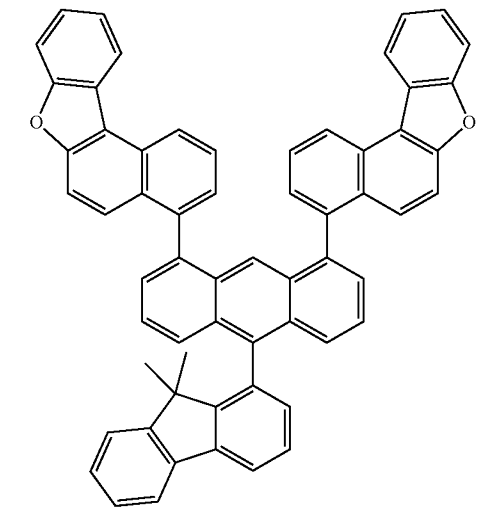
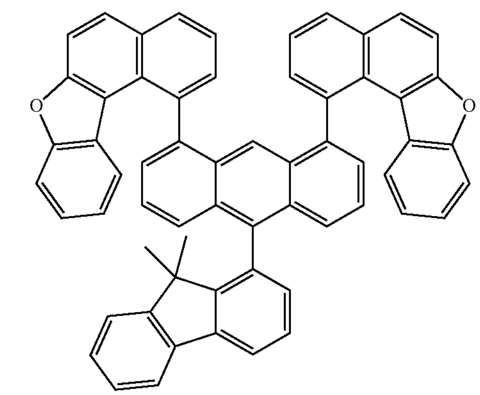
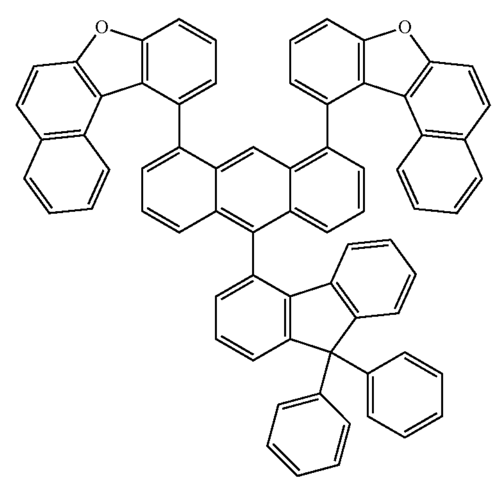

-continued
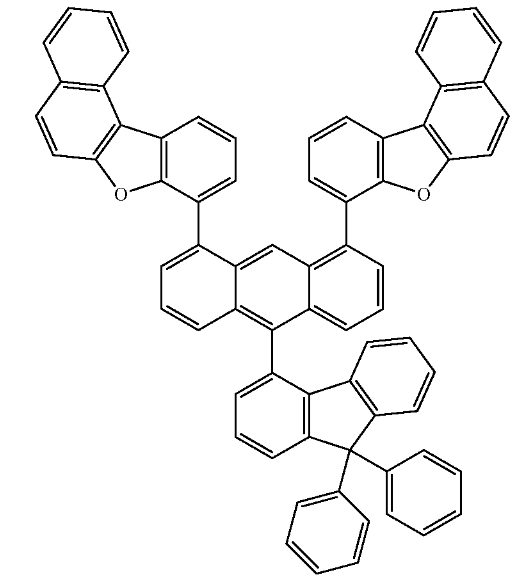
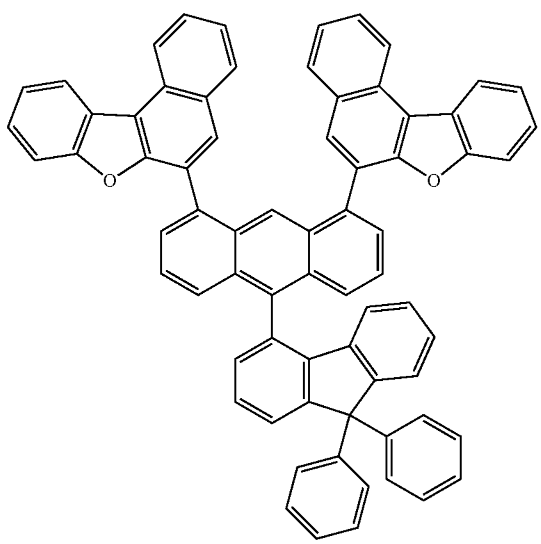
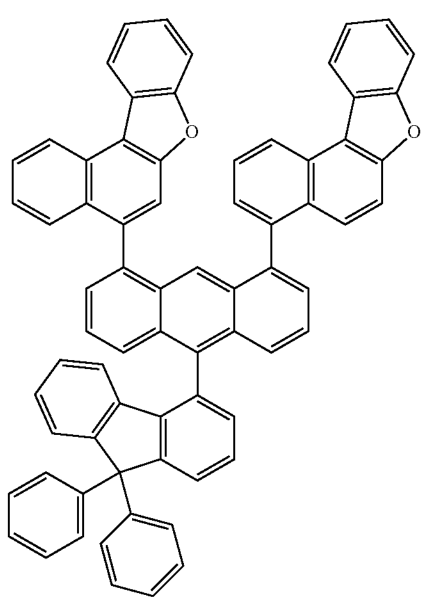
-continued
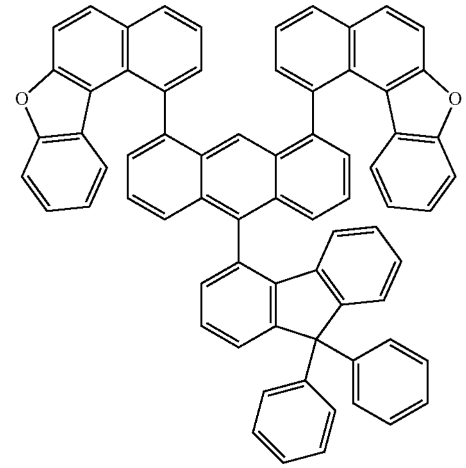
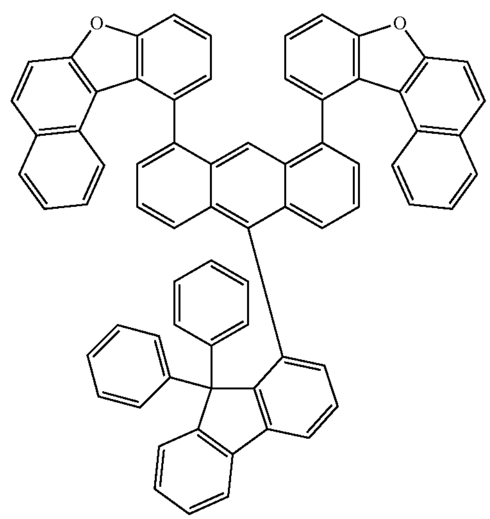
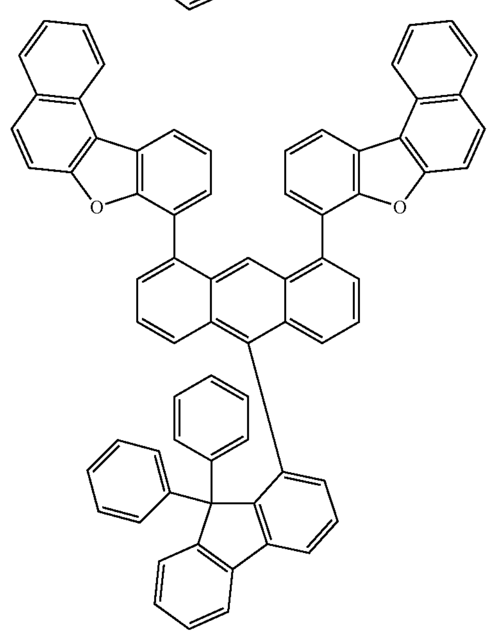

-continued
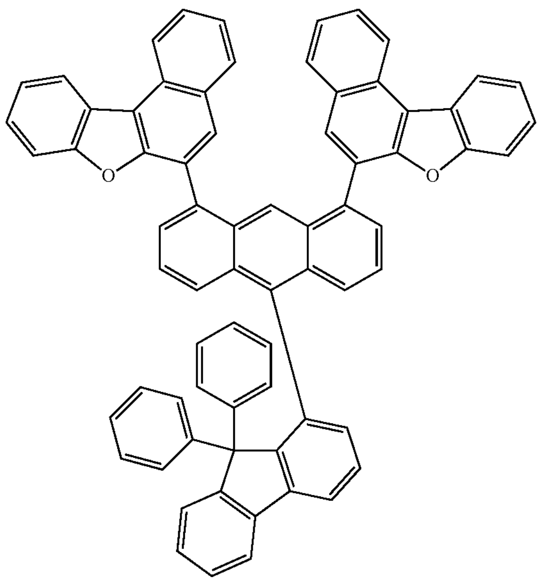
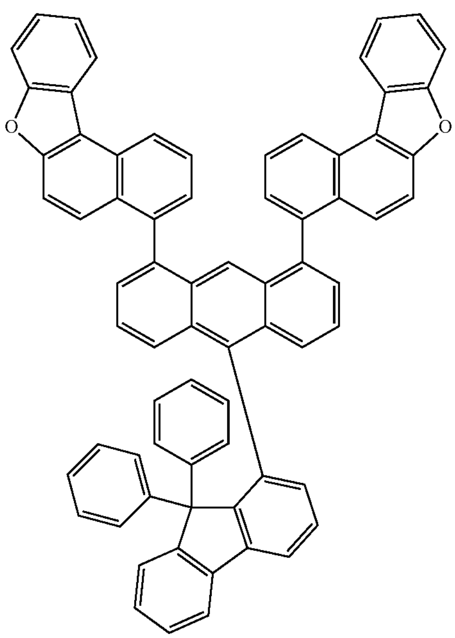
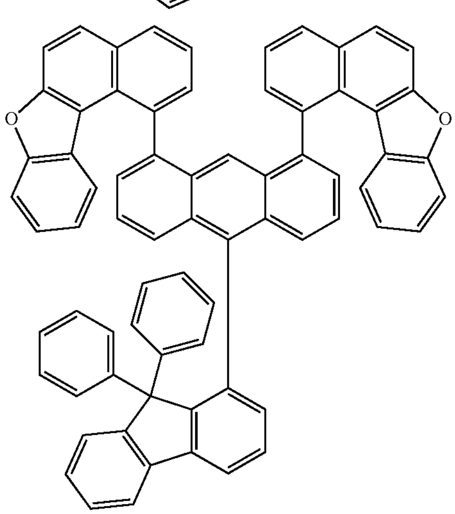
-continued
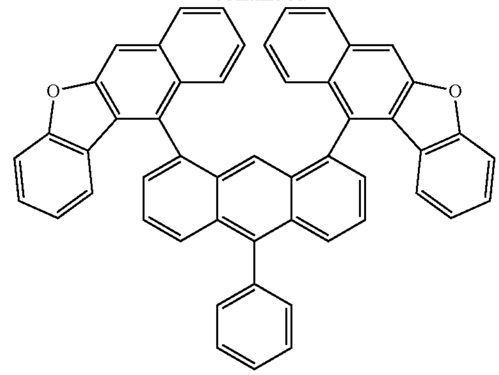
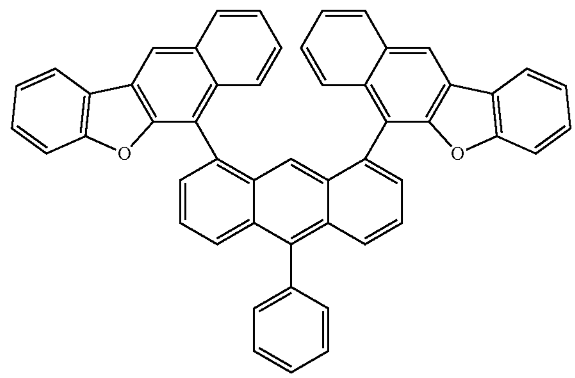
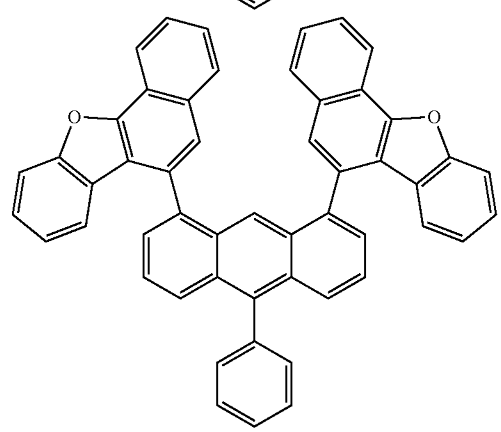
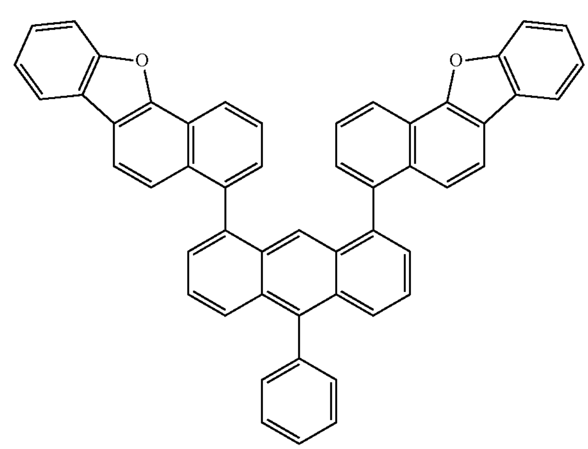

-continued
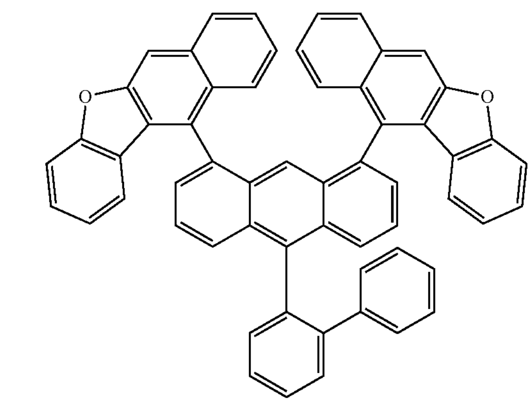
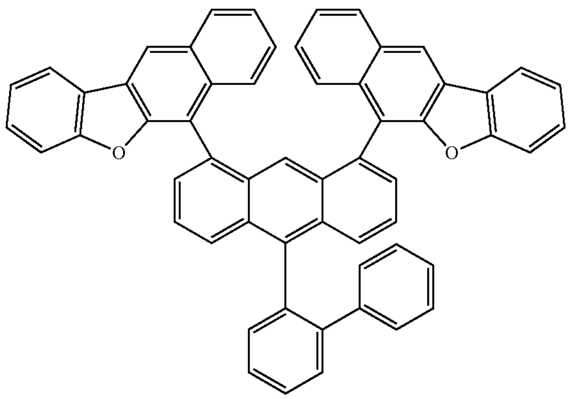
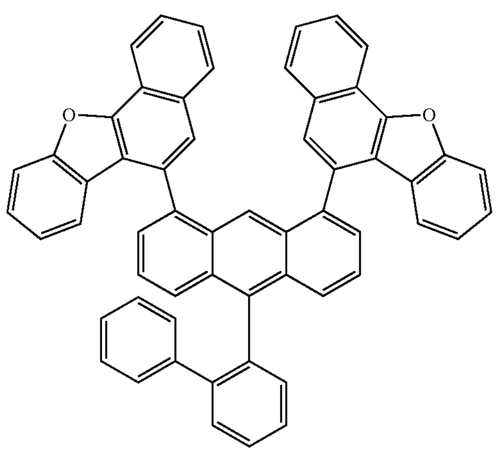
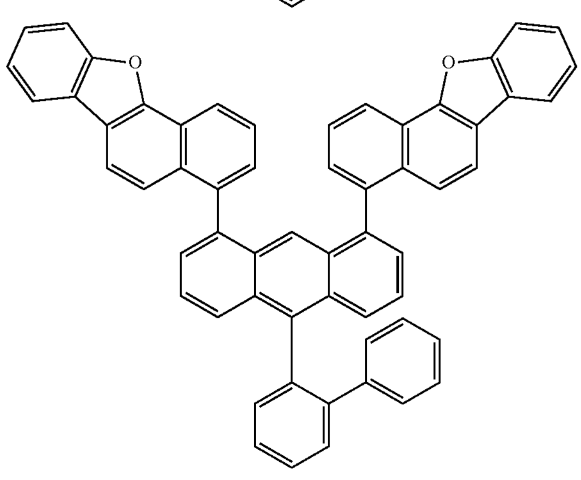
-continued
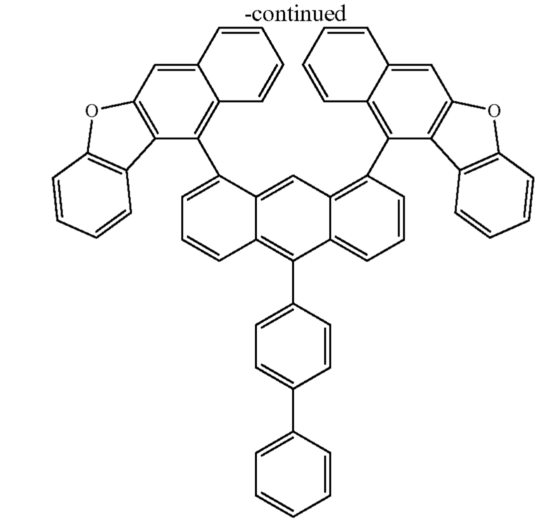
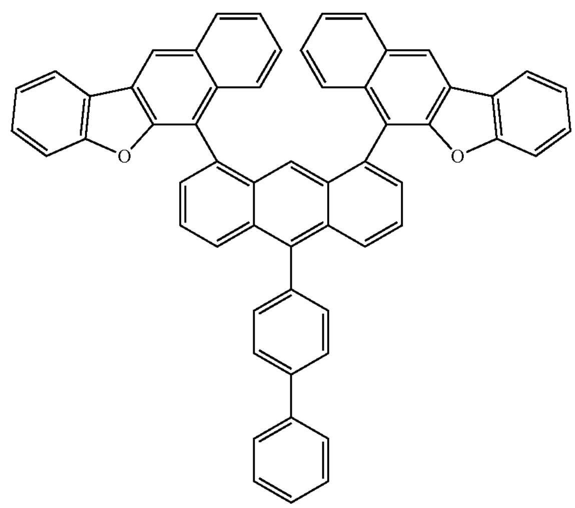
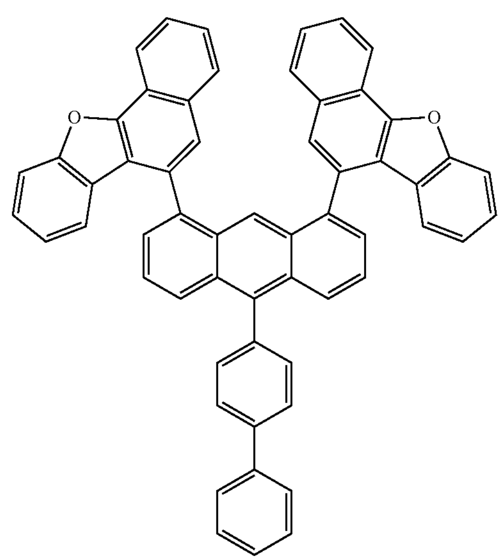

-continued
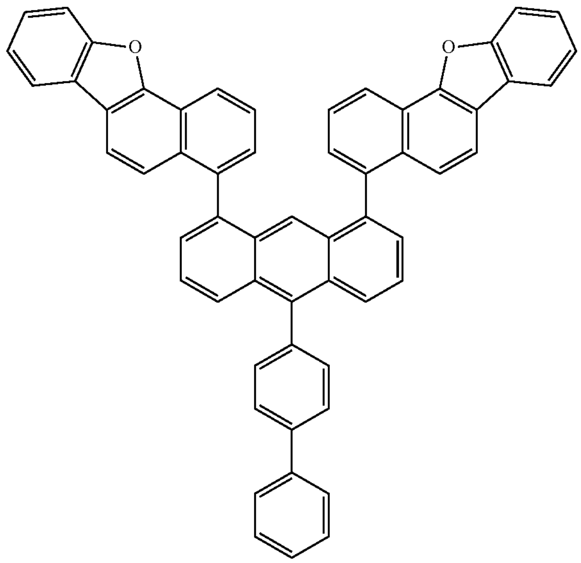
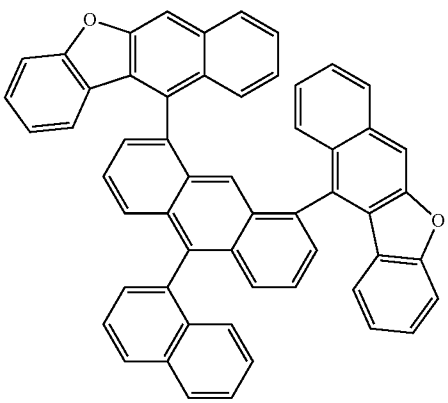
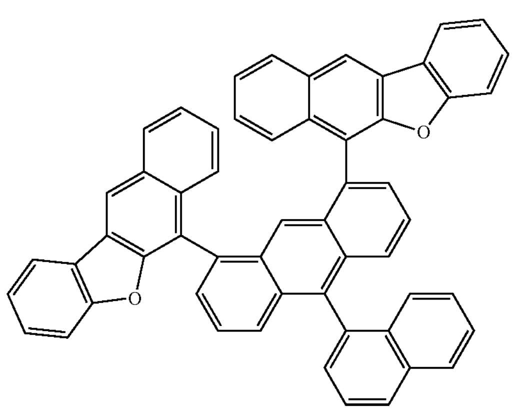
-continued
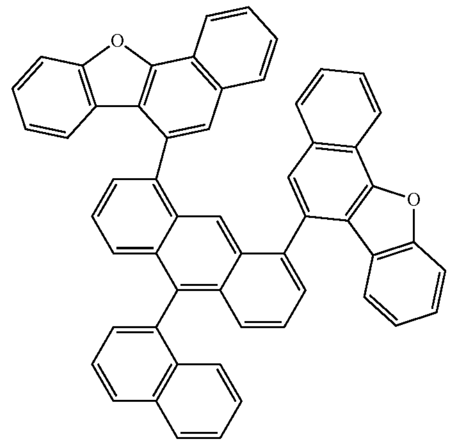
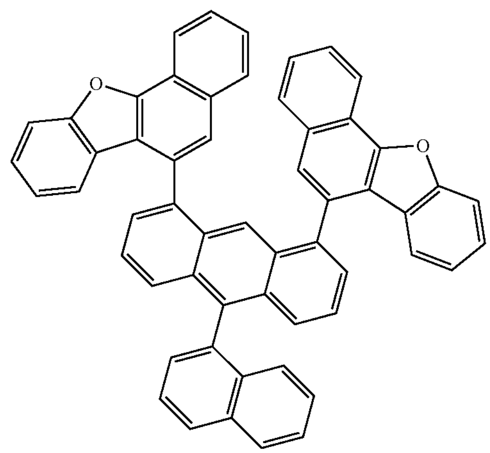
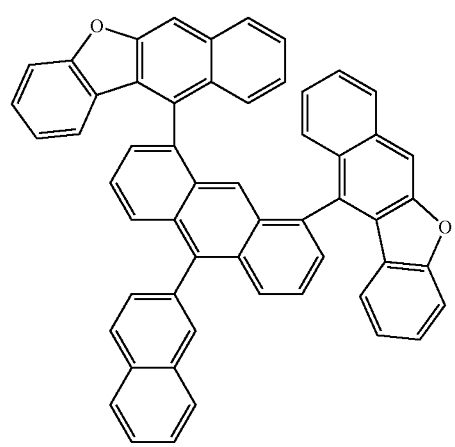

-continued
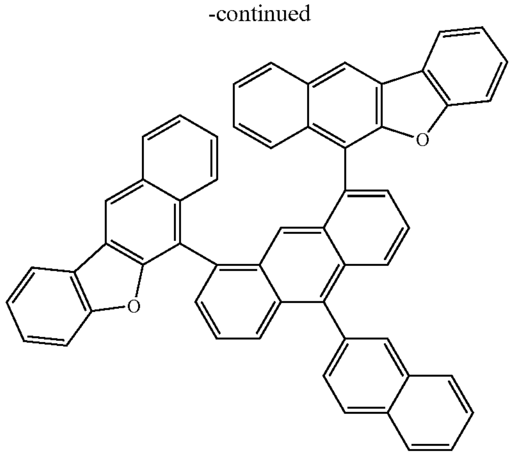
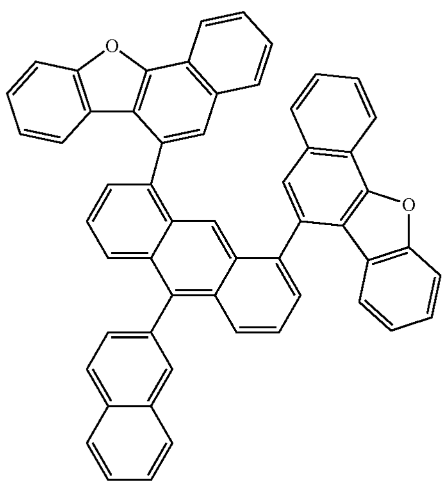
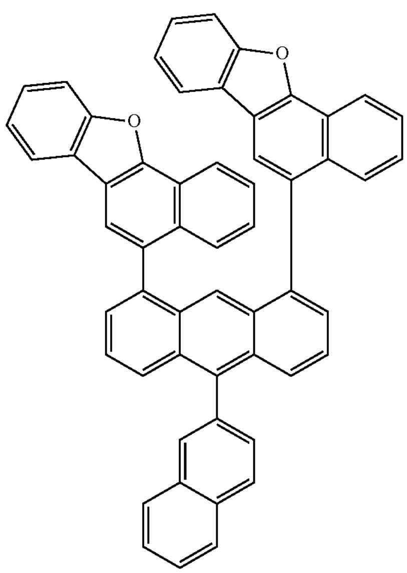
-continued
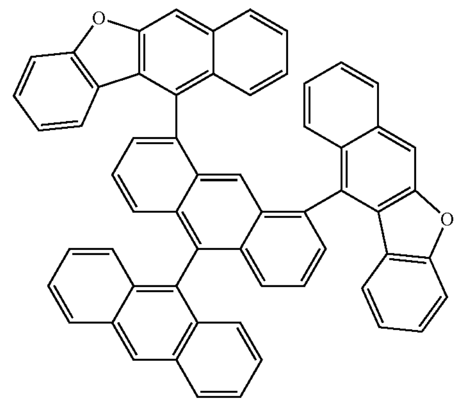
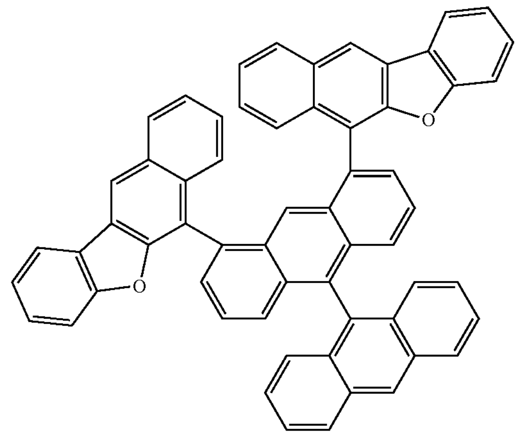
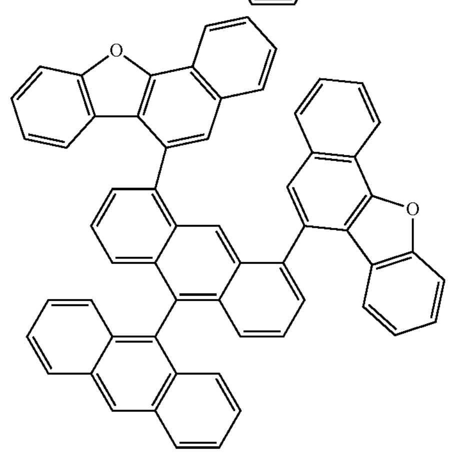
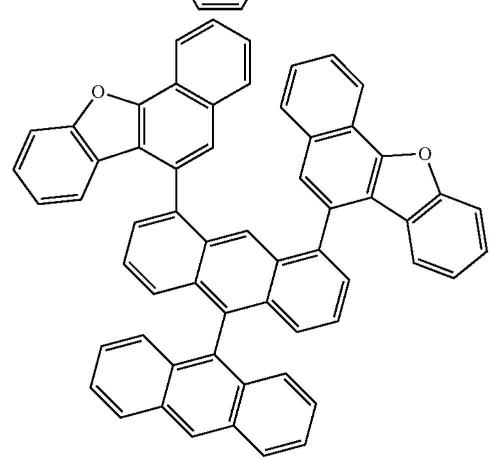

-continued
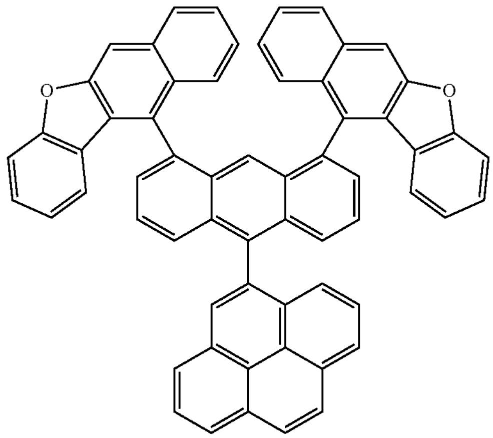
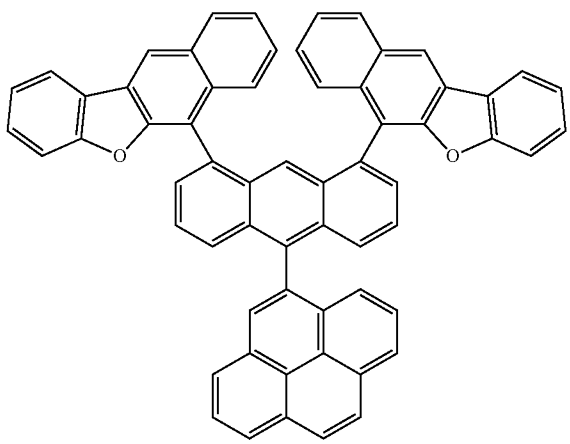
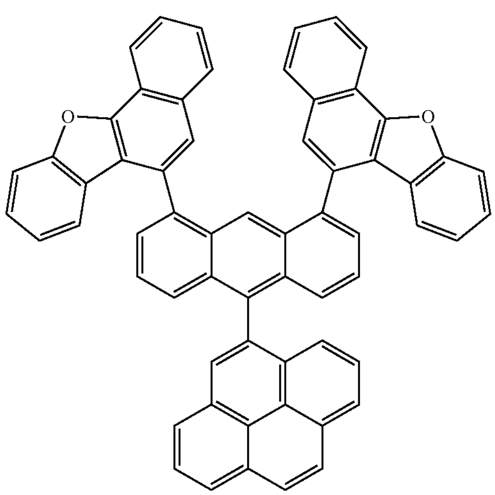
-continued
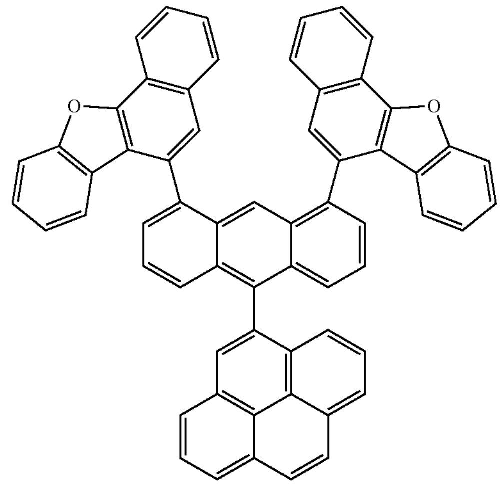
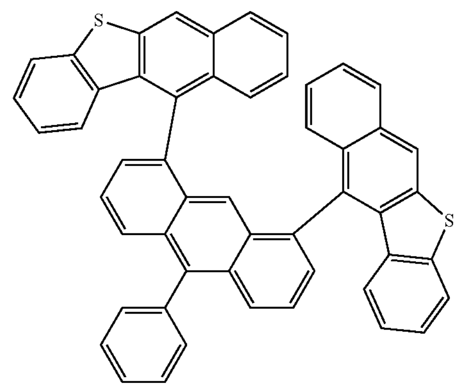
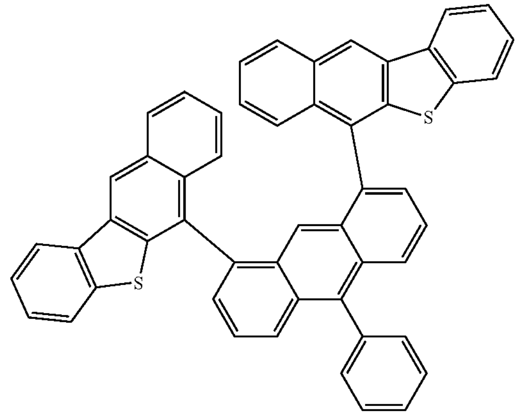

-continued
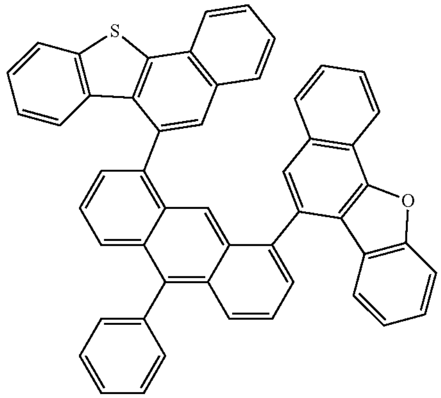
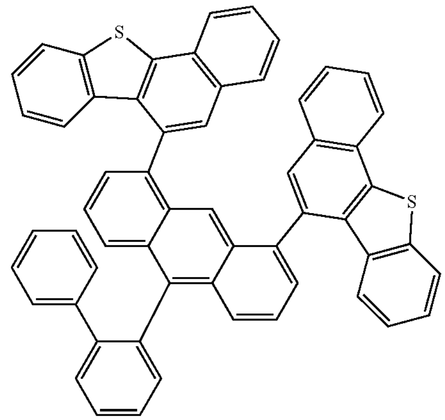
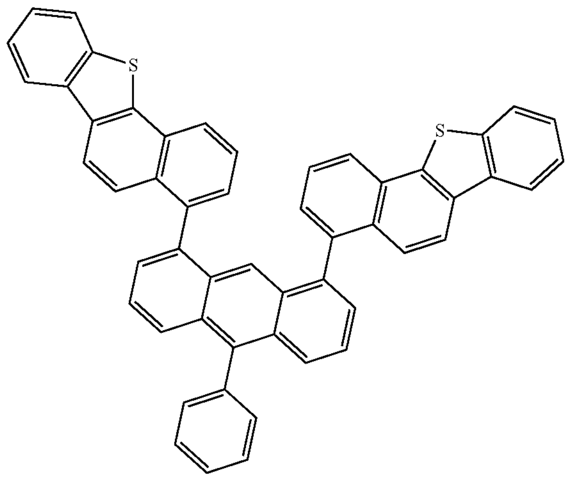
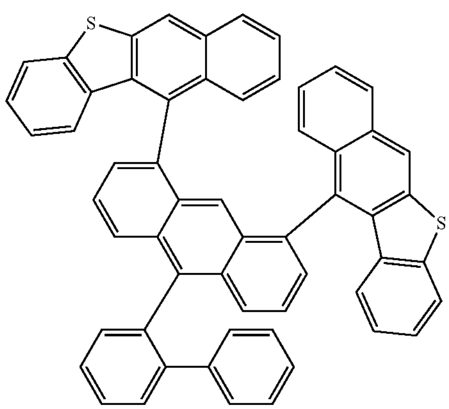
-continued
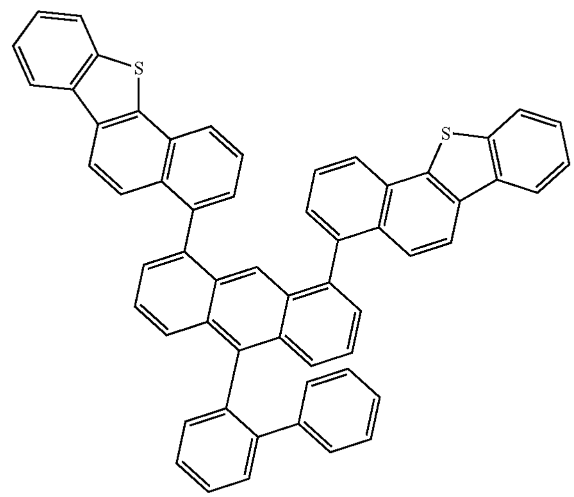
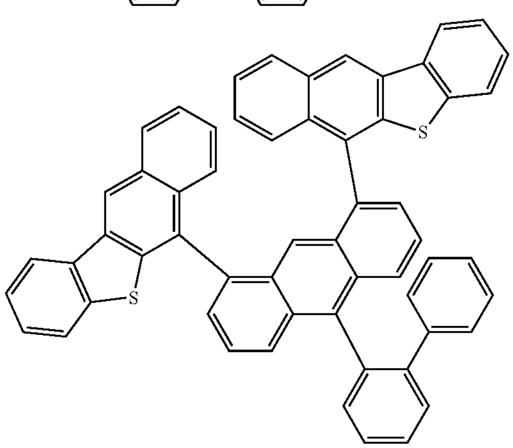
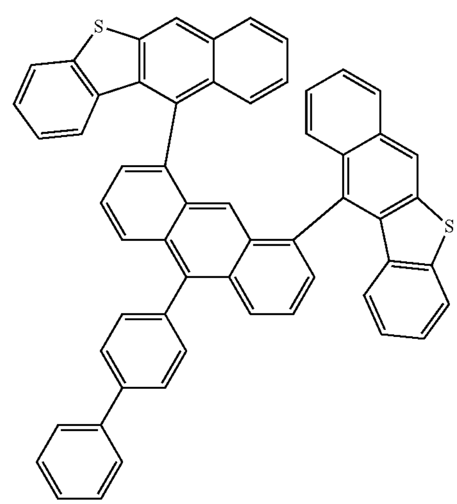

-continued
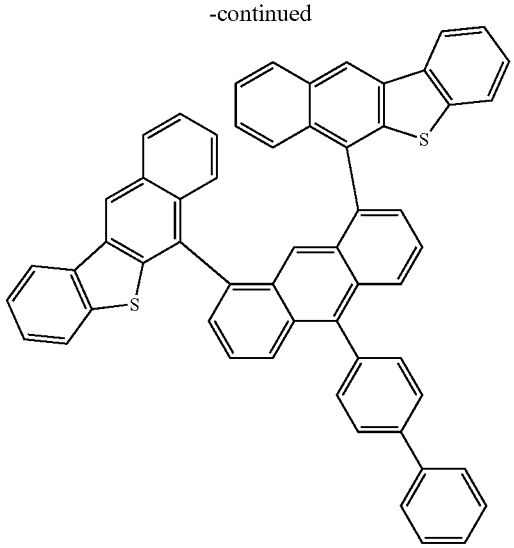
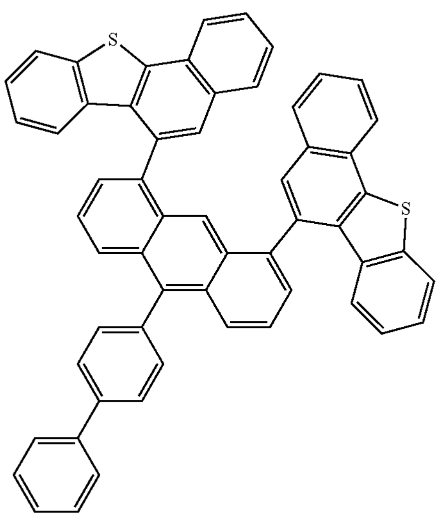
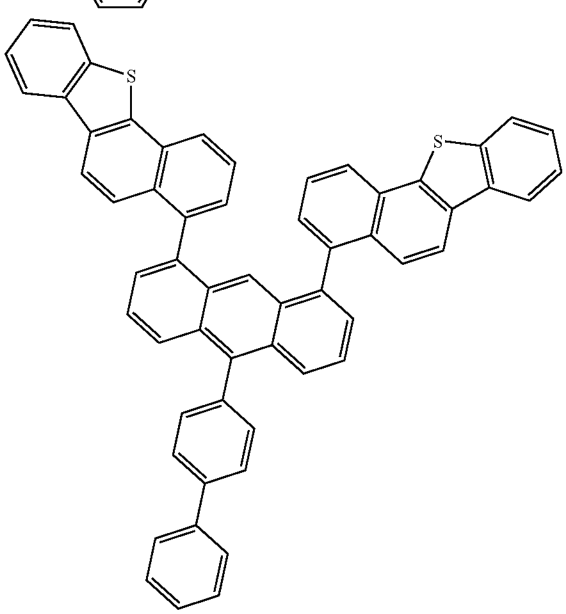
-continued
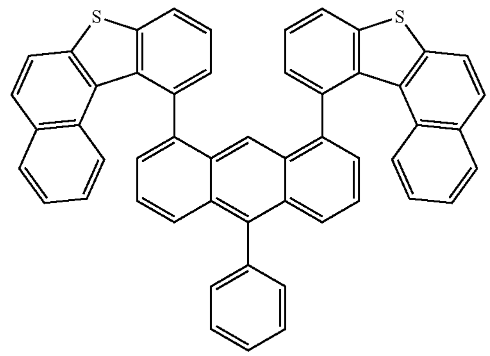
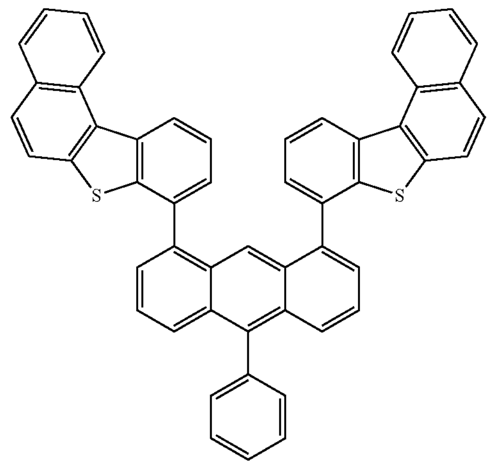
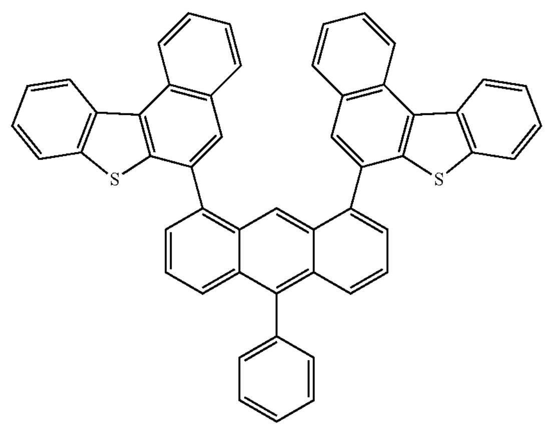
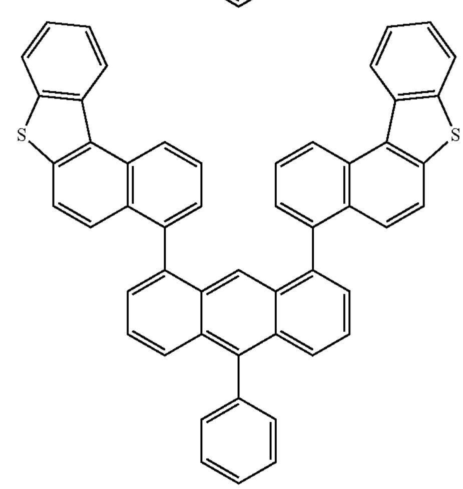

-continued
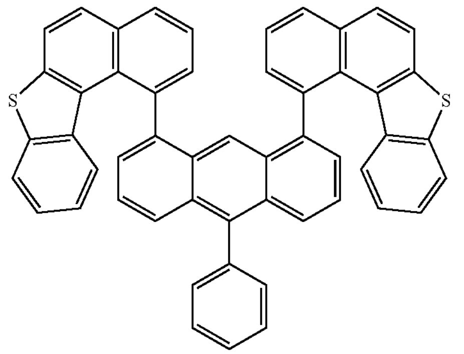
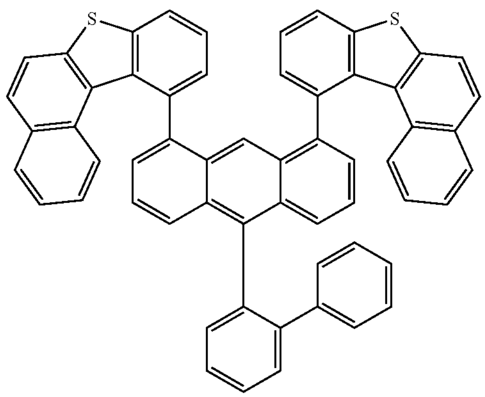
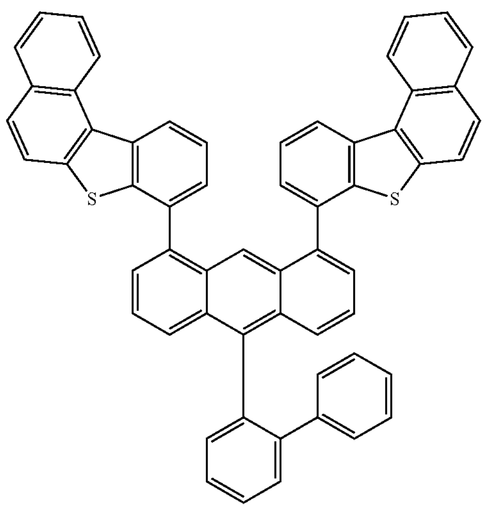
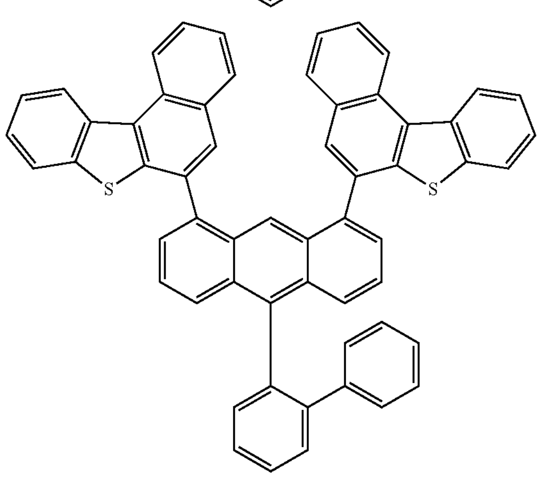
-continued
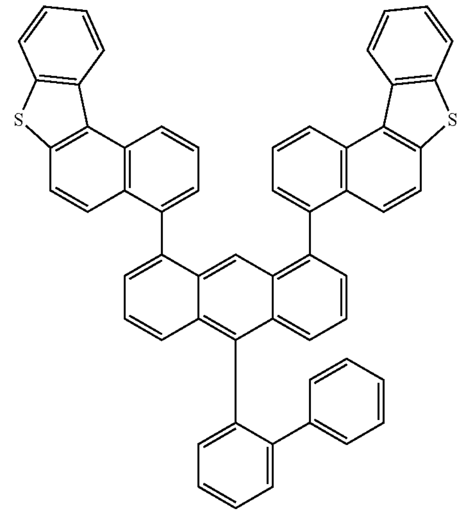
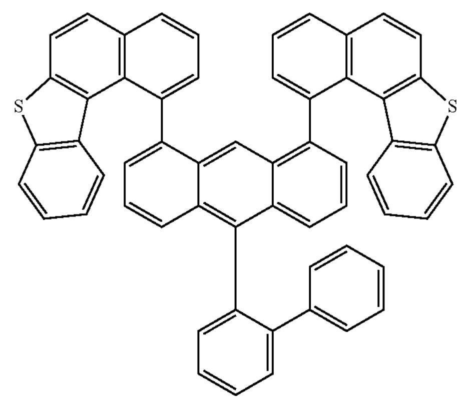
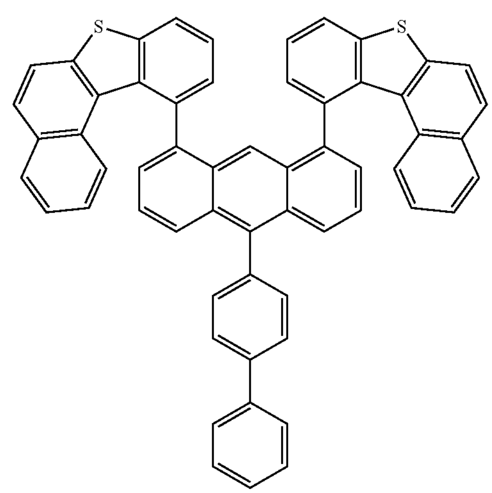

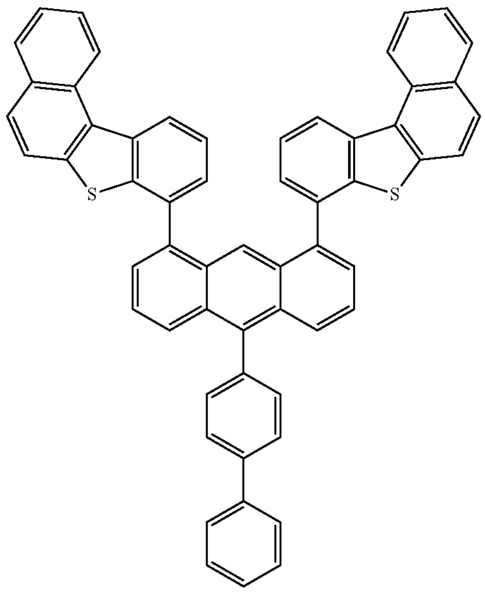
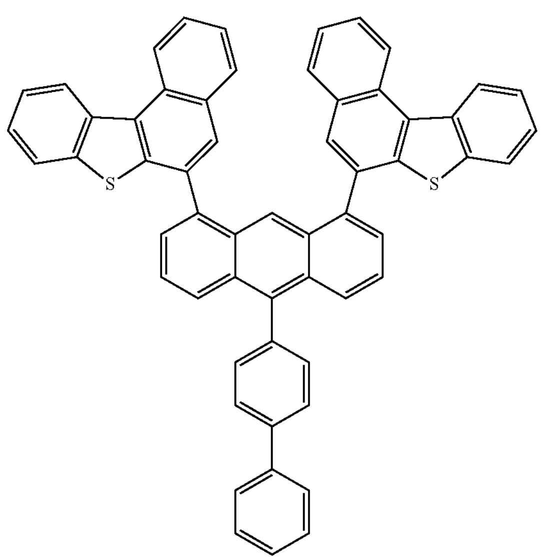
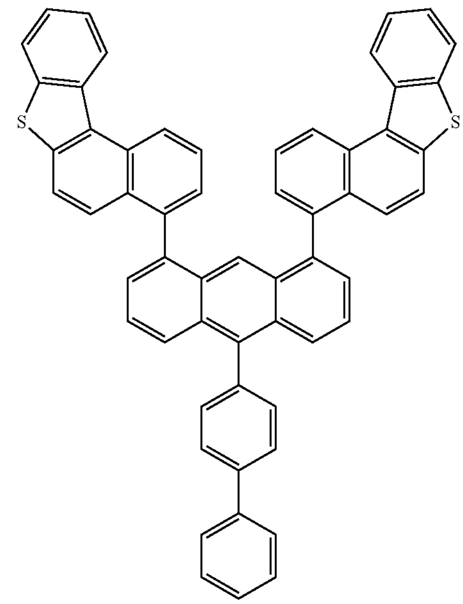
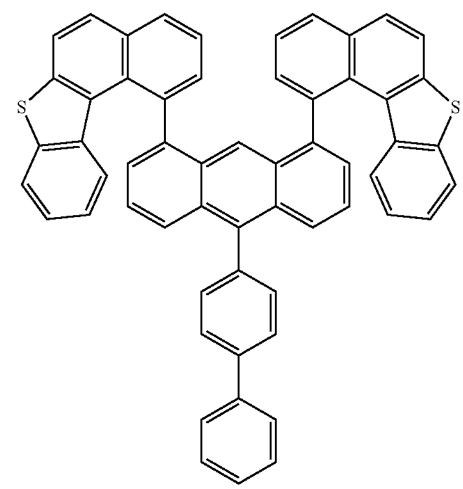
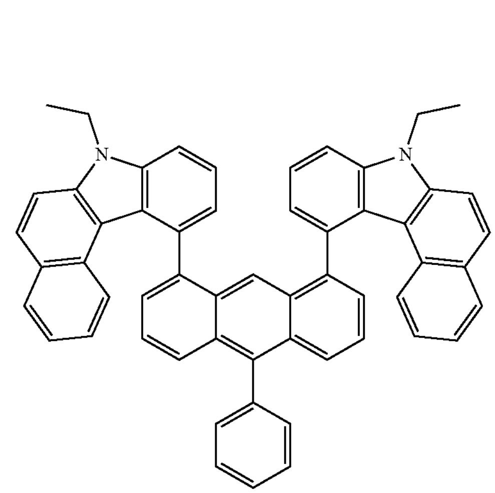

-continued
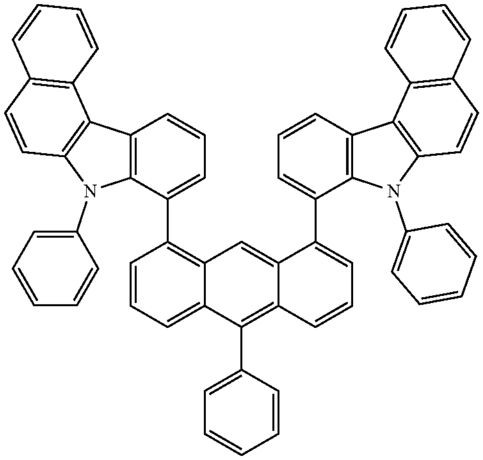
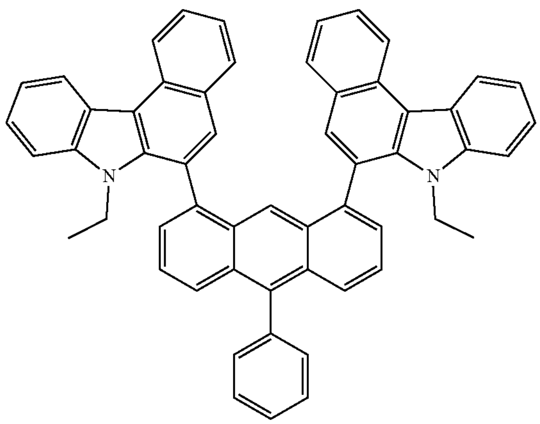
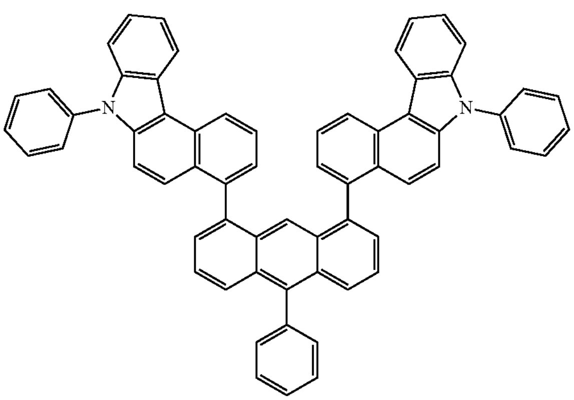
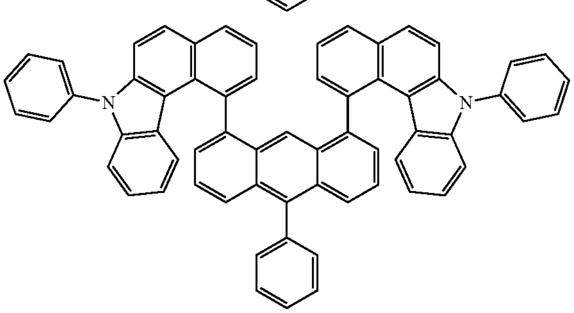
-continued
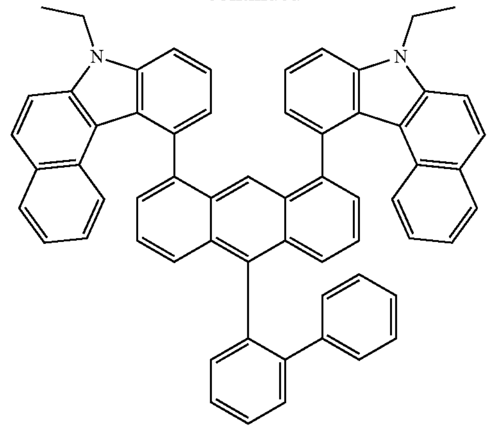
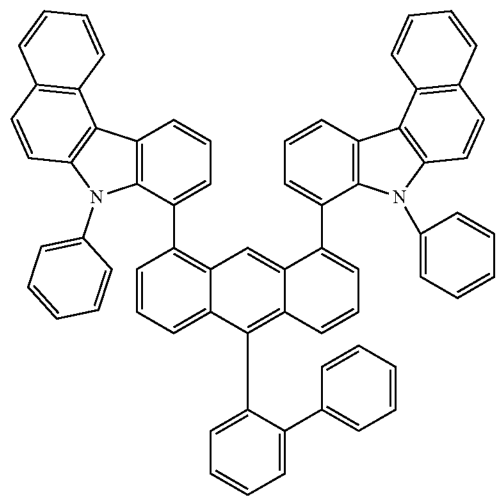
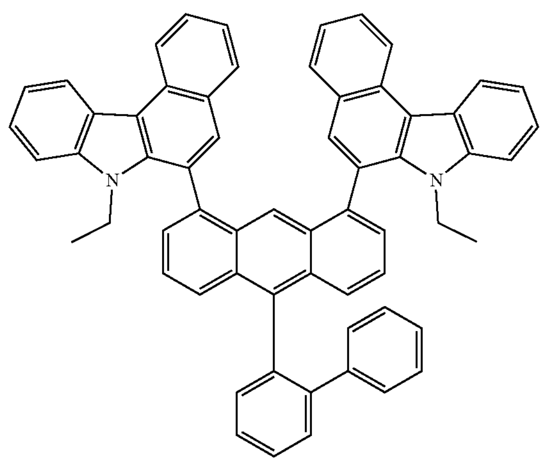

-continued
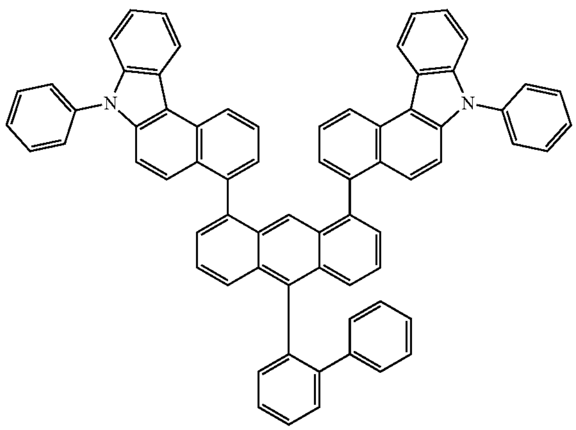
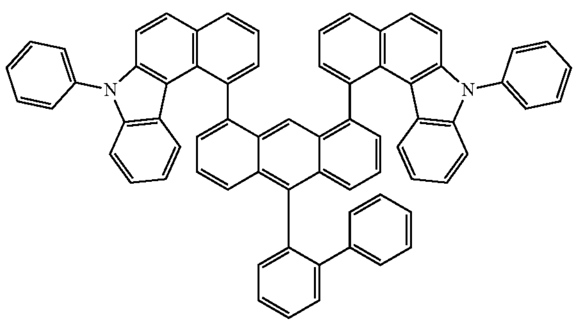
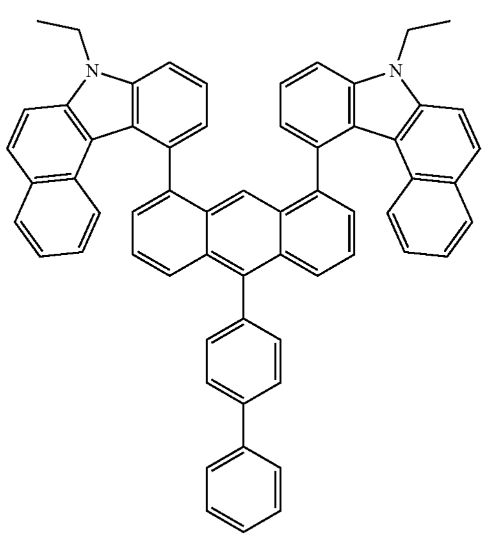
-continued
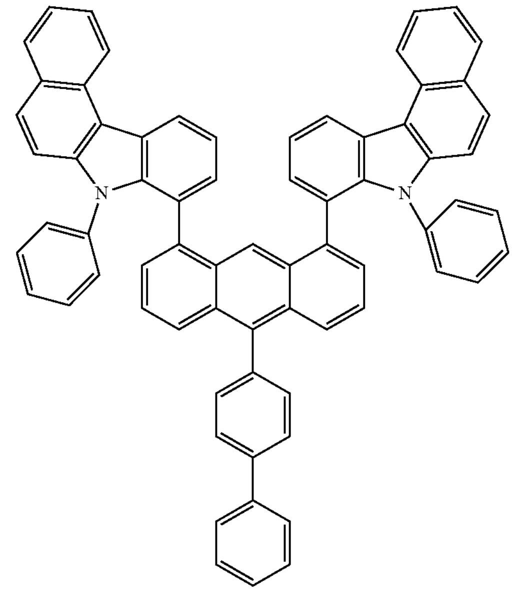
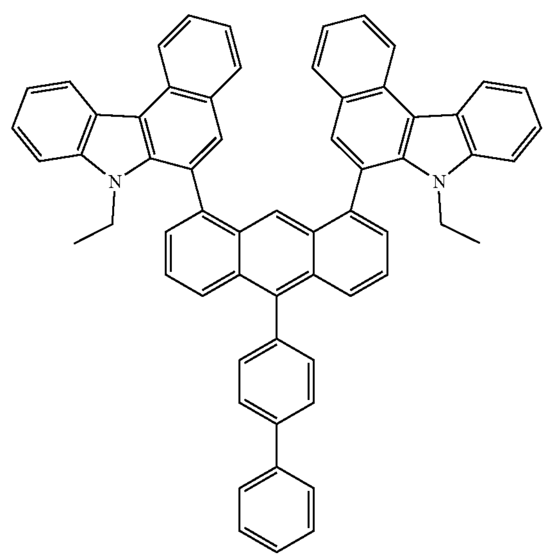
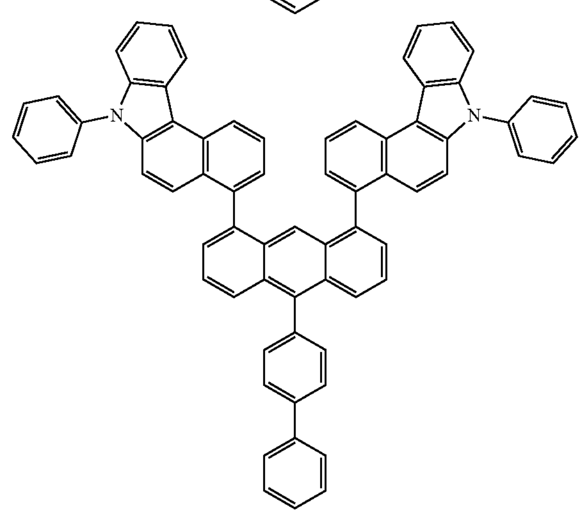

-continued
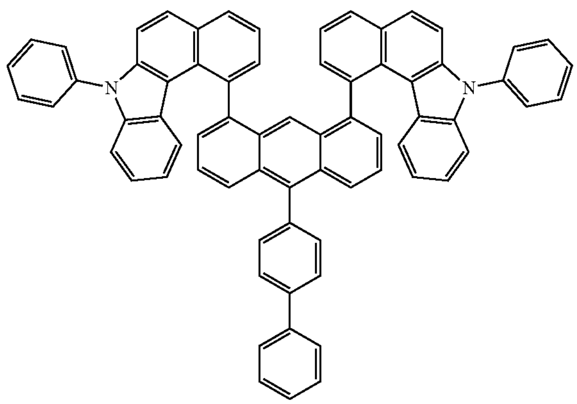
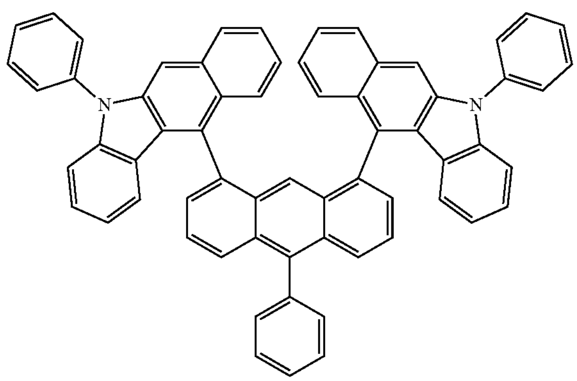
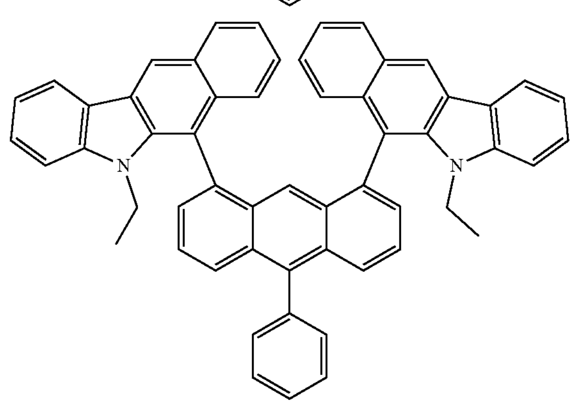
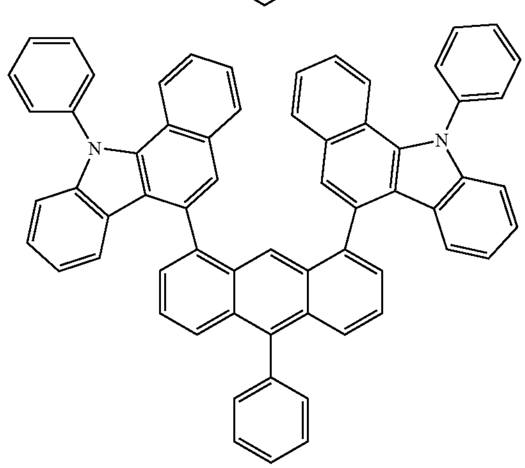
-continued
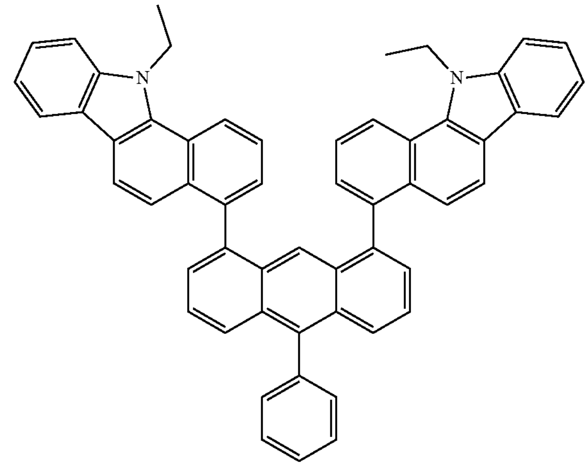
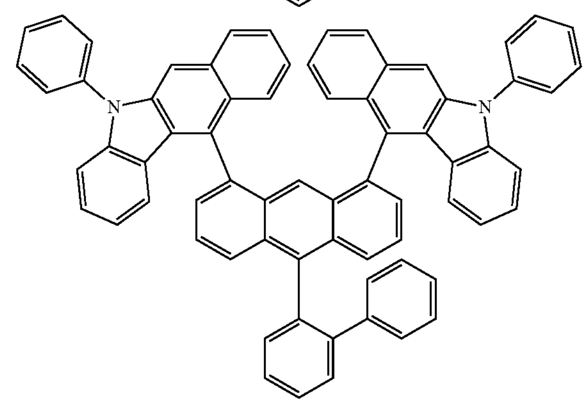
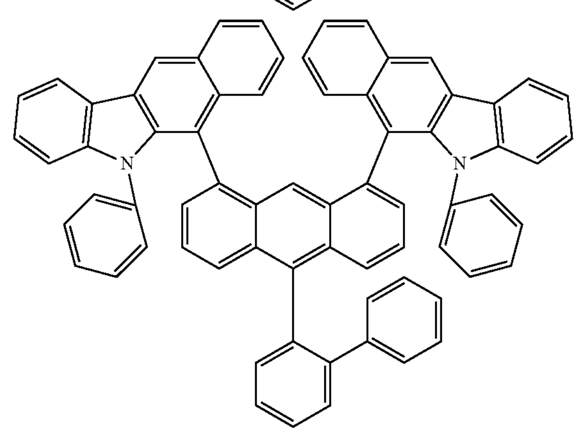
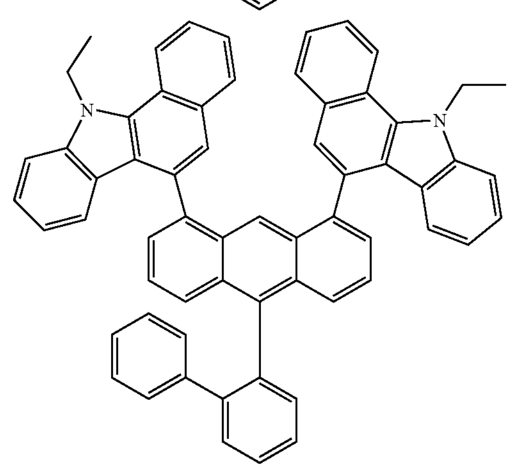

-continued
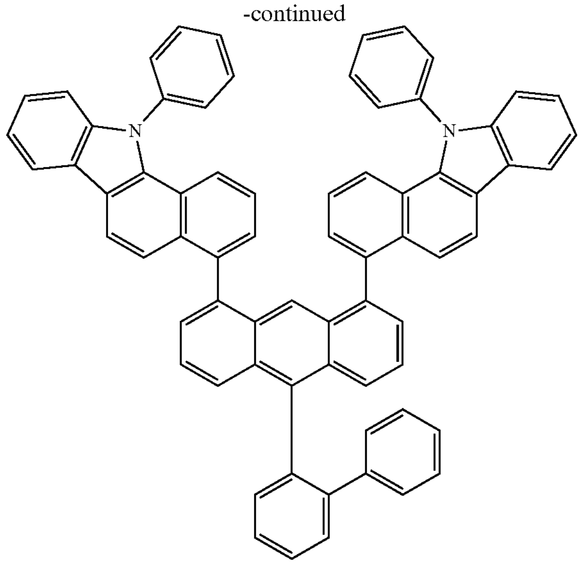
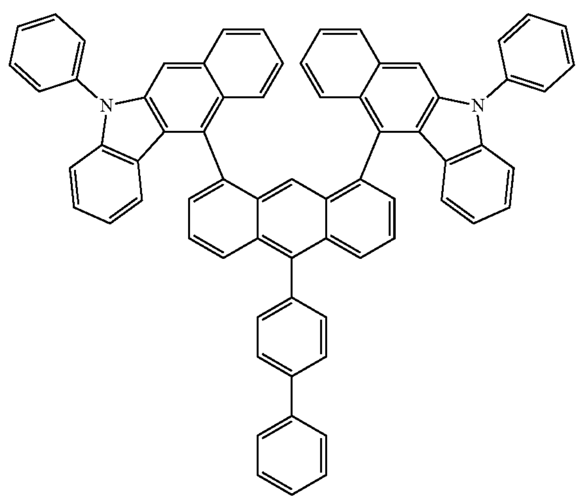
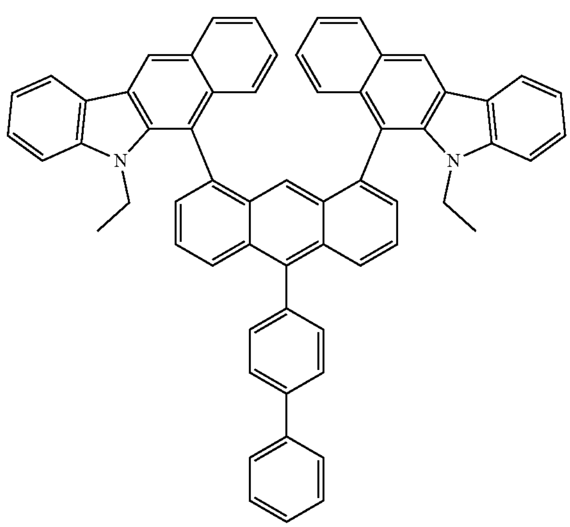
-continued
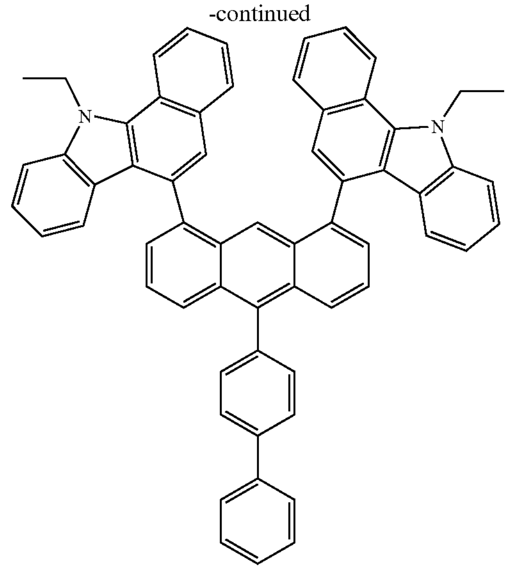
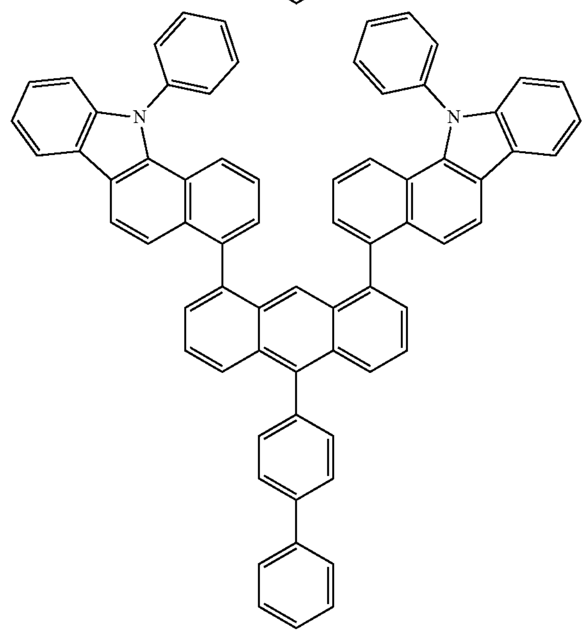
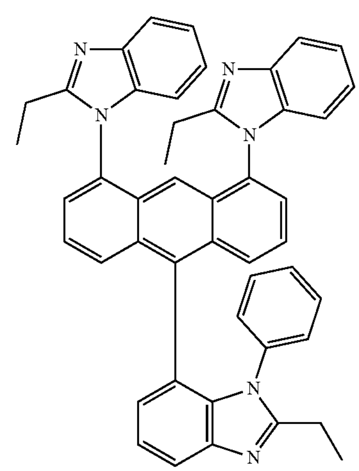

-continued
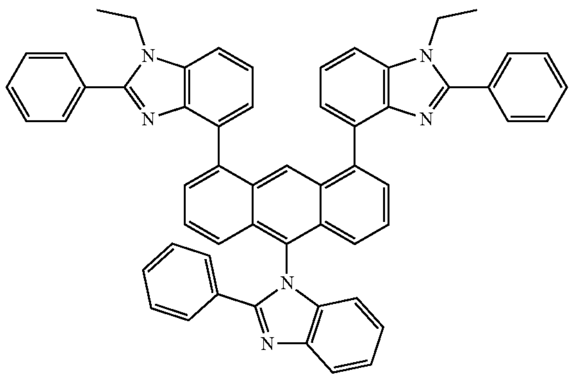
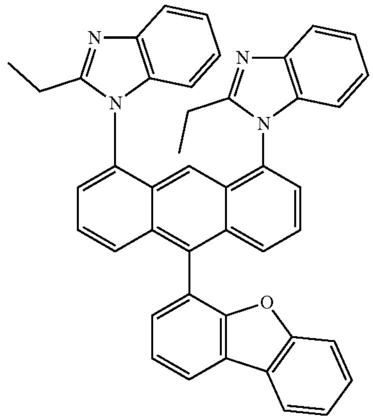
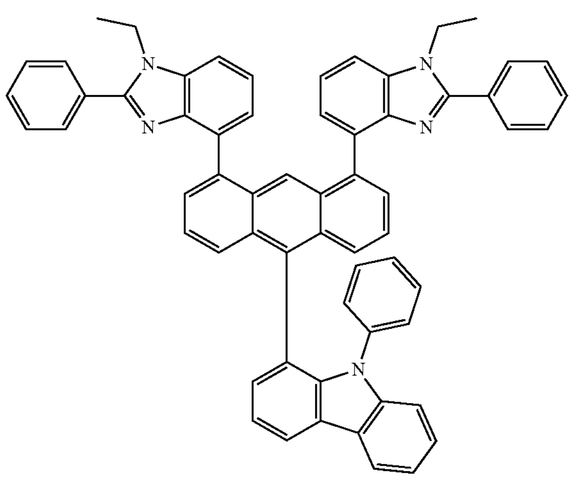
-continued
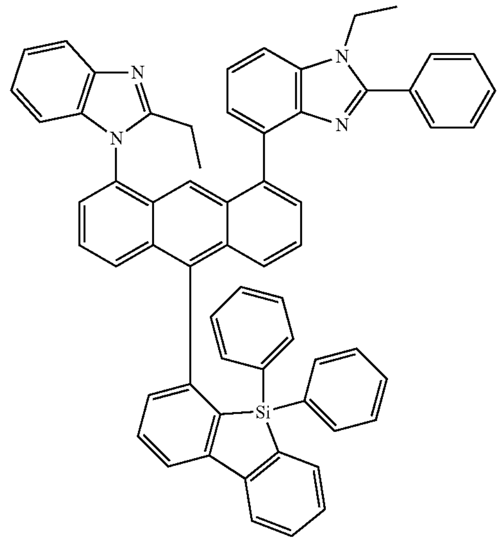
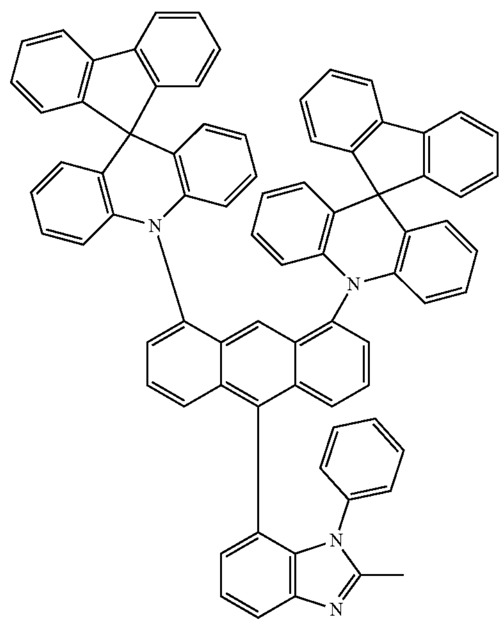
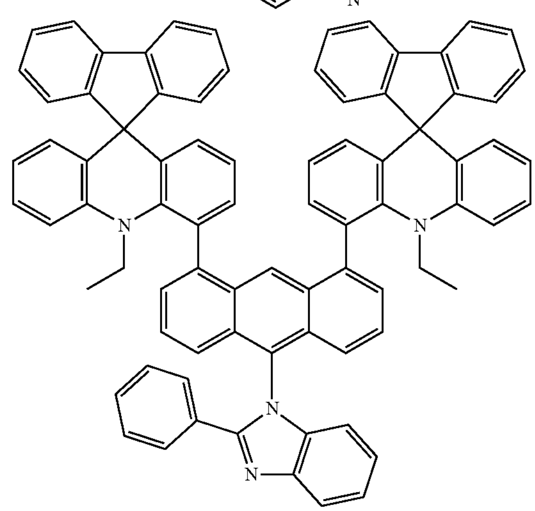

-continued
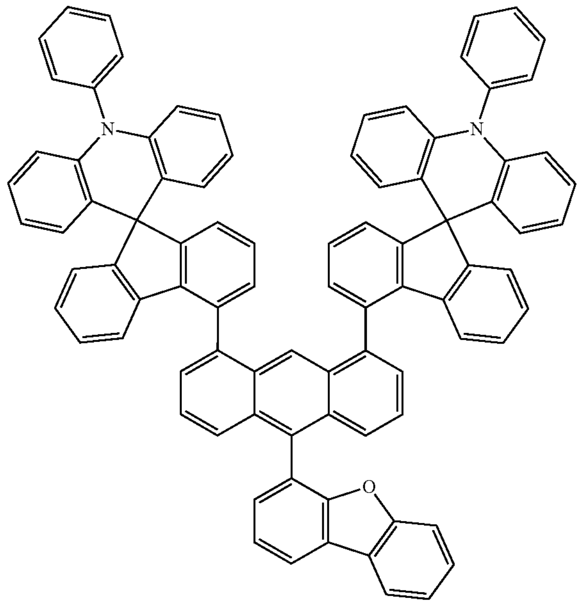
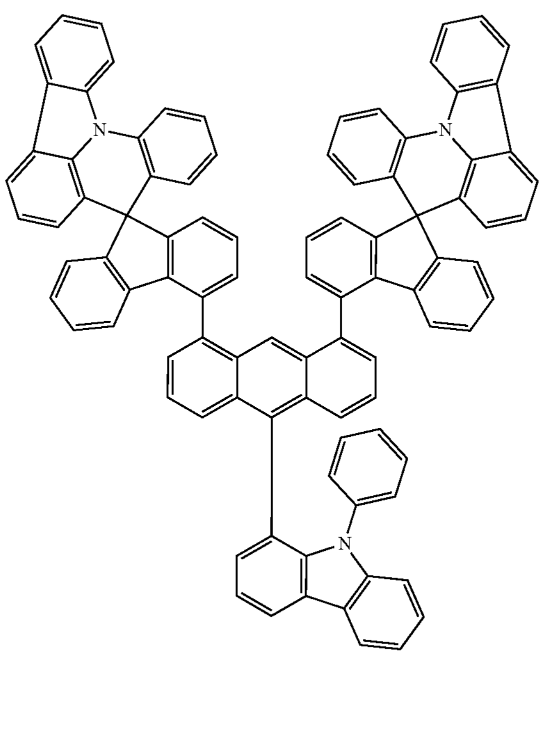
-continued
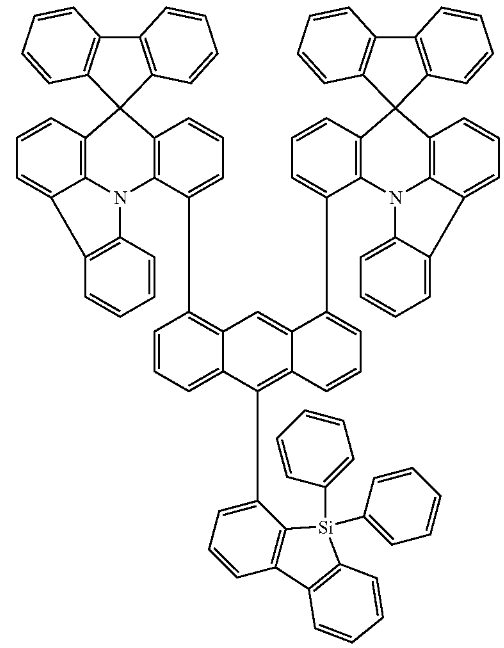
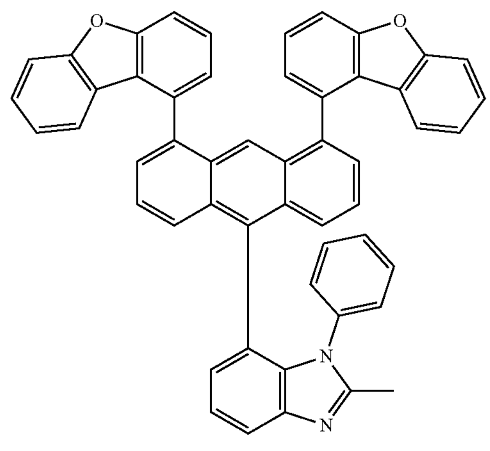
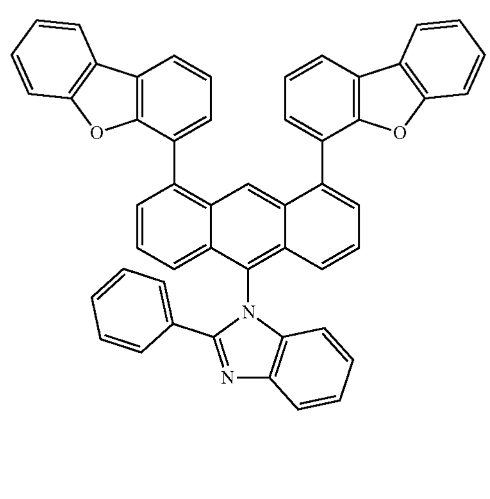

-continued
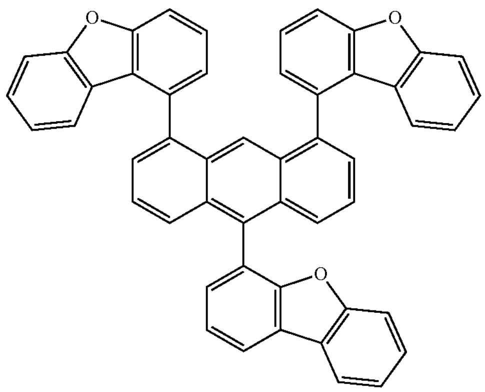
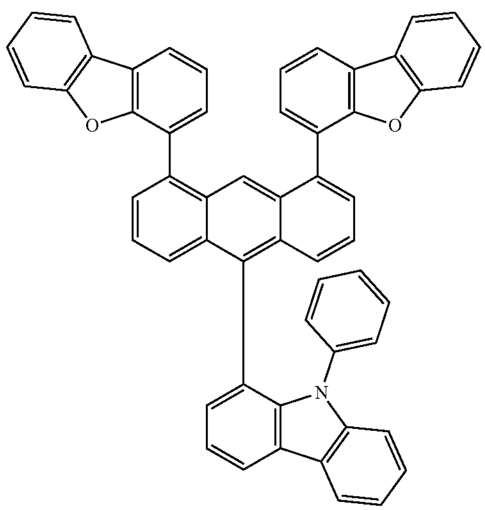
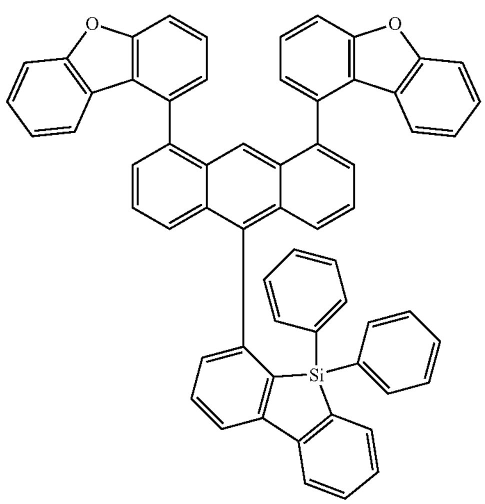
-continued
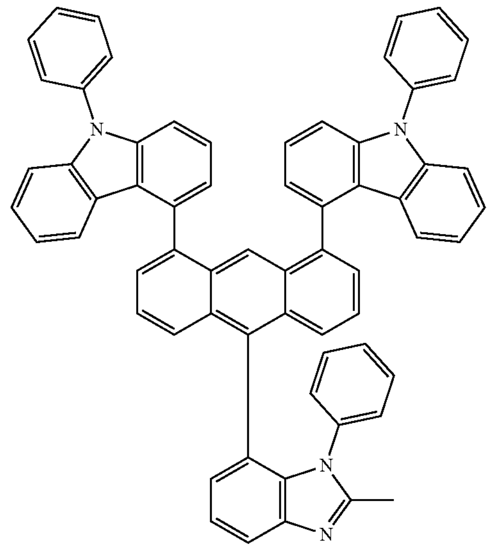
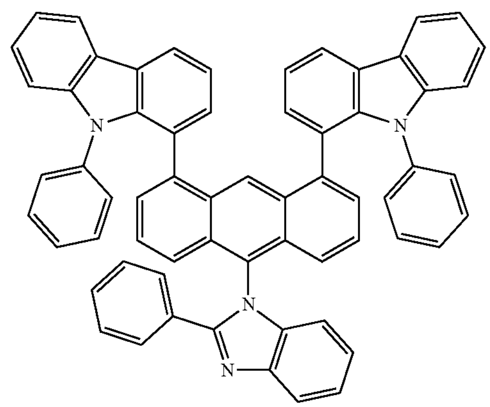
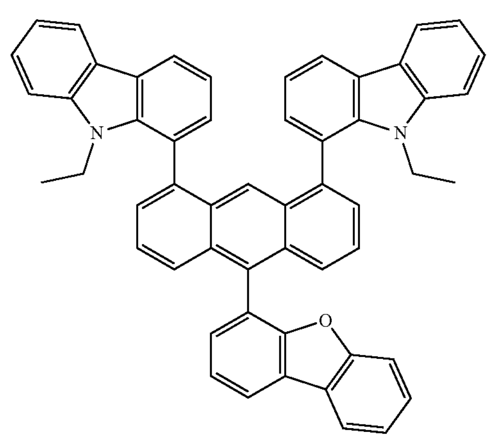

-continued
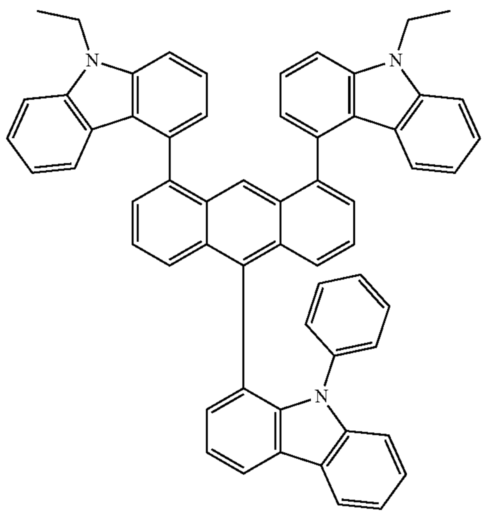
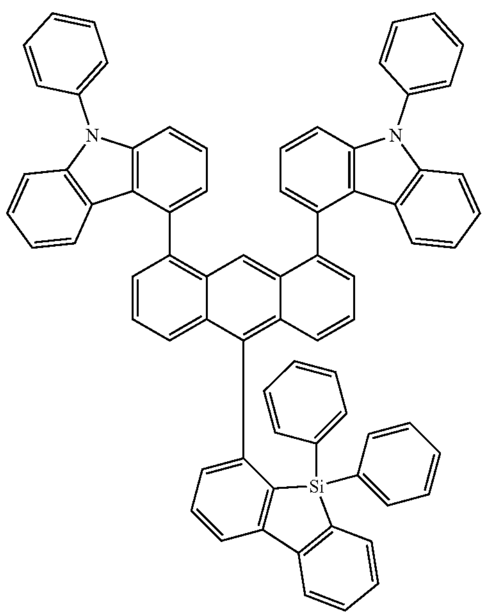
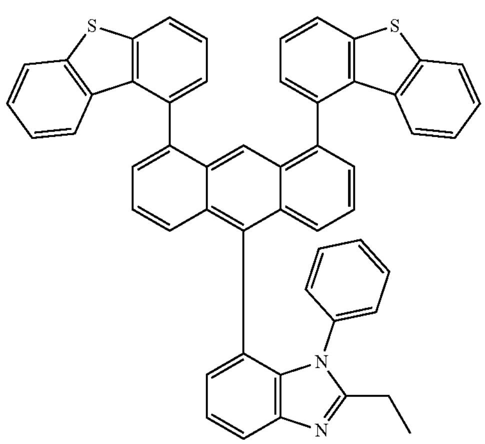
-continued
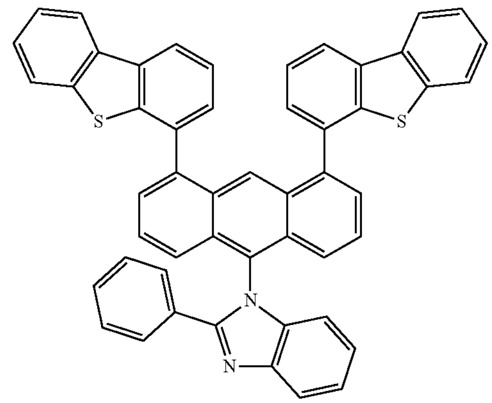
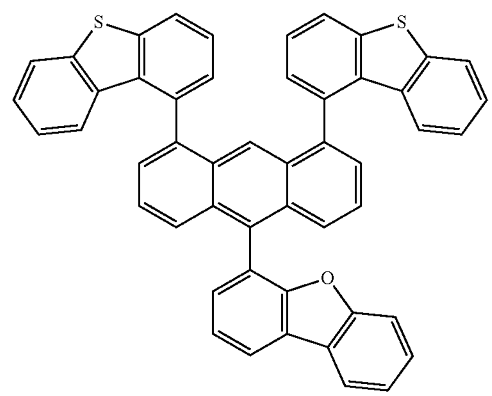
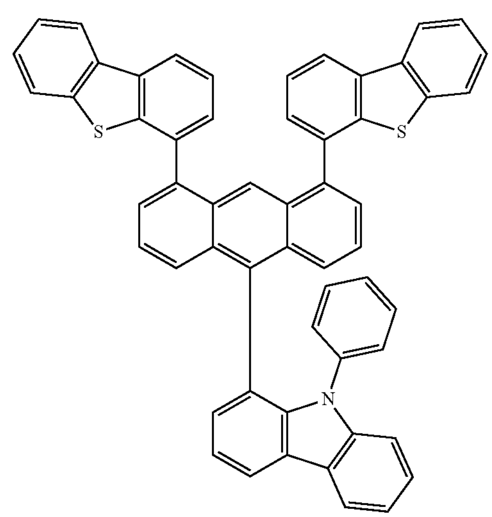

-continued
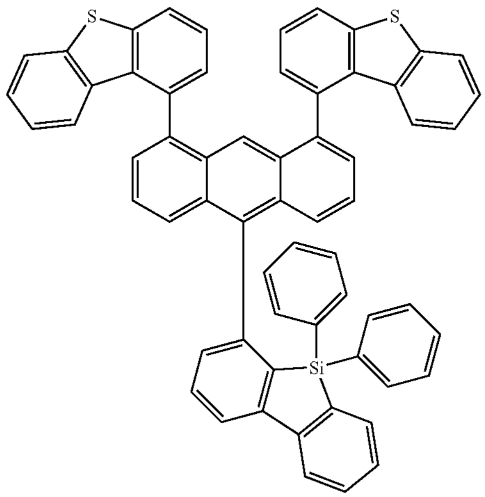
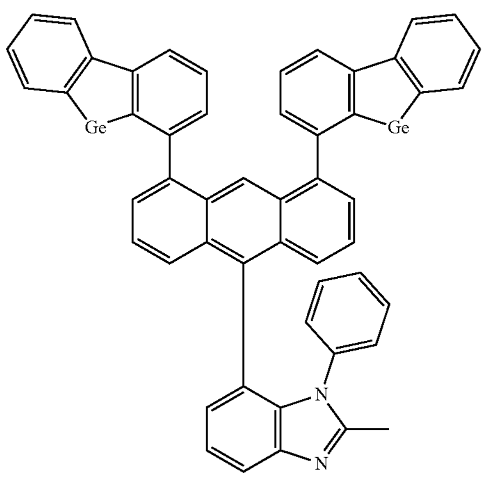
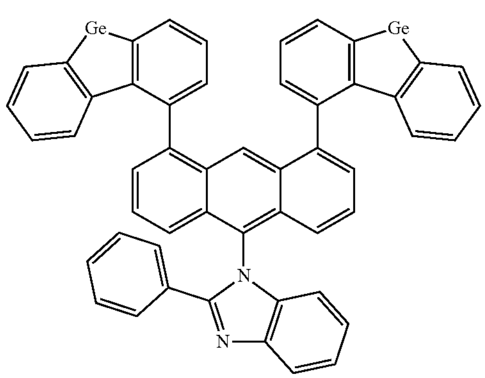
-continued
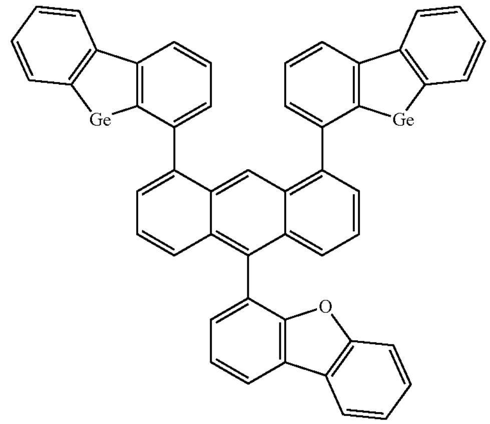
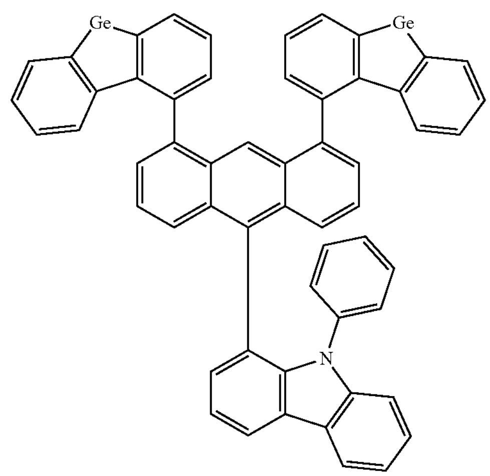
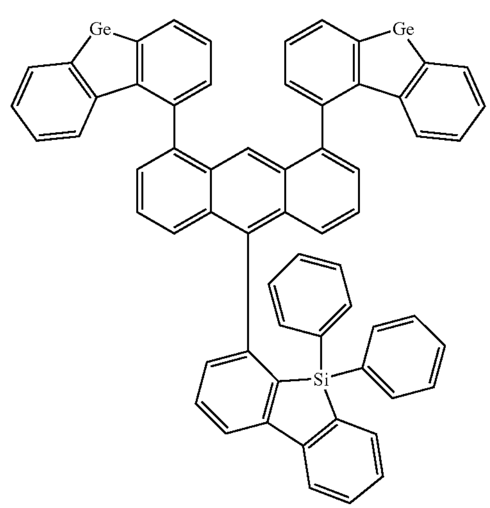

-continued
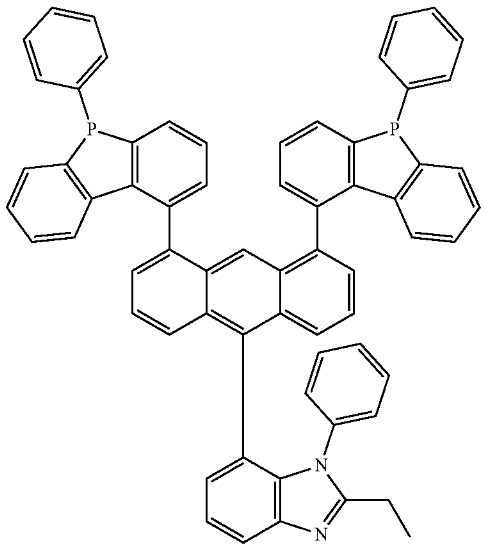
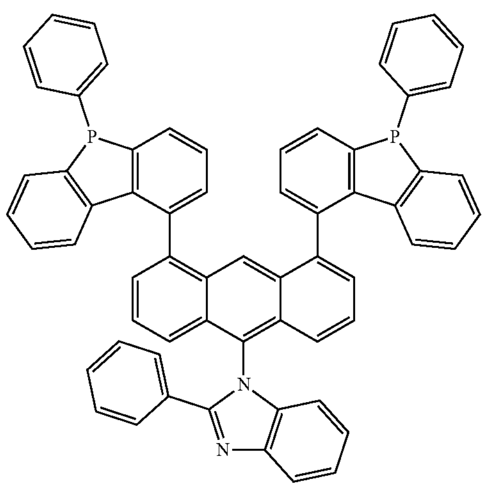
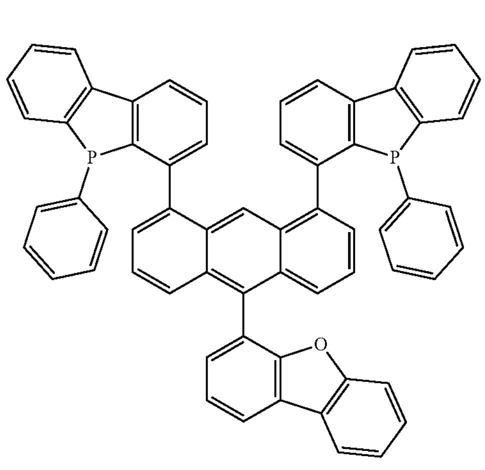
-continued
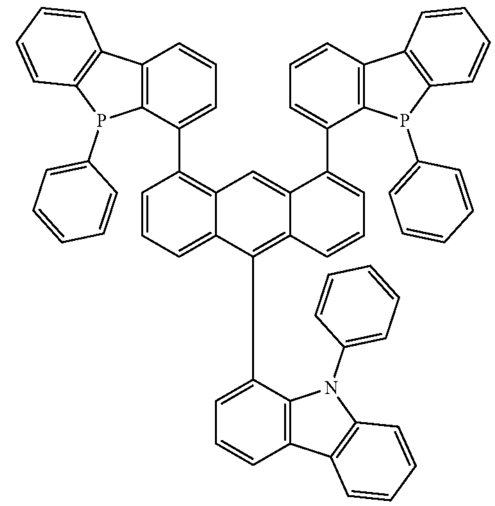
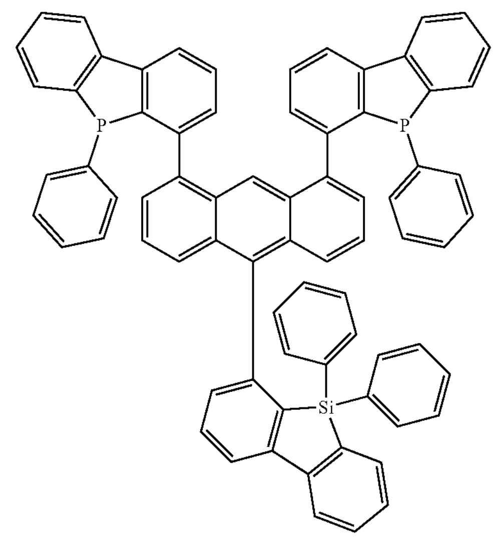
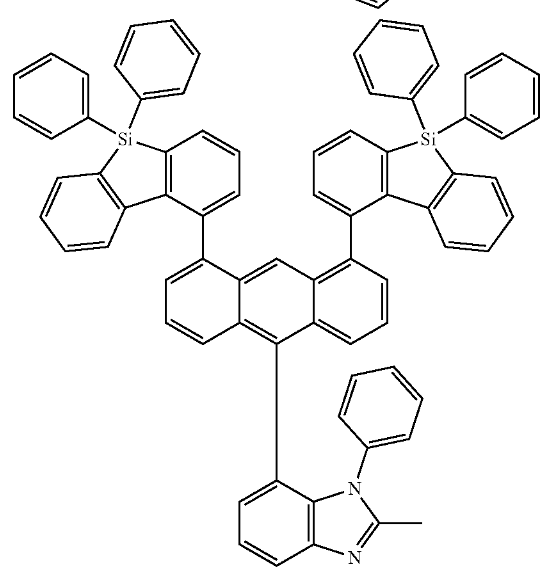

-continued
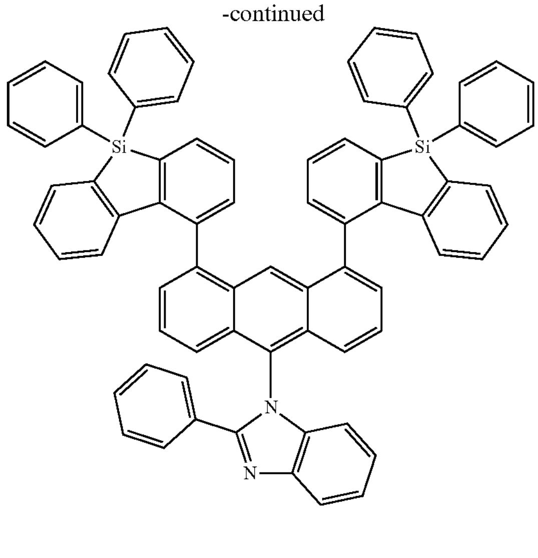
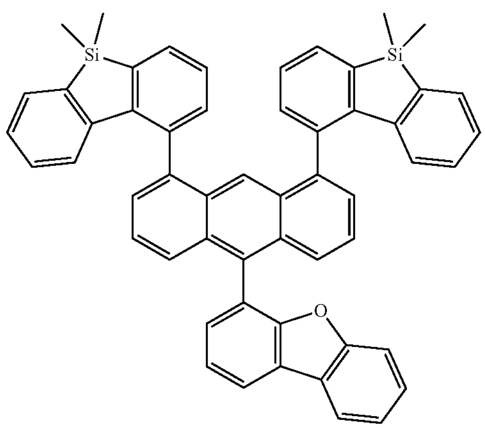
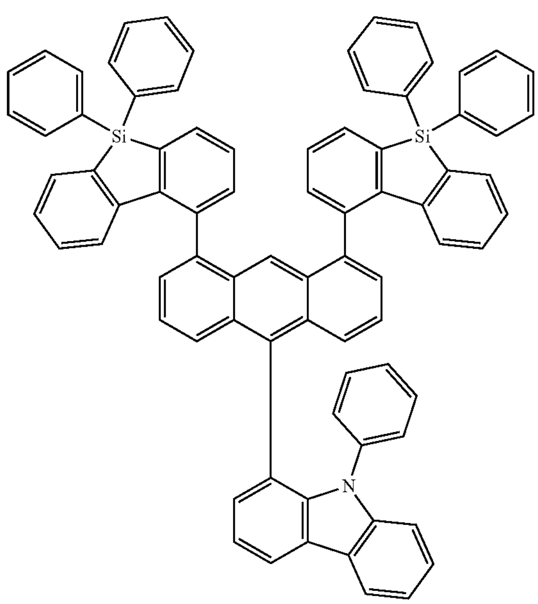
-continued
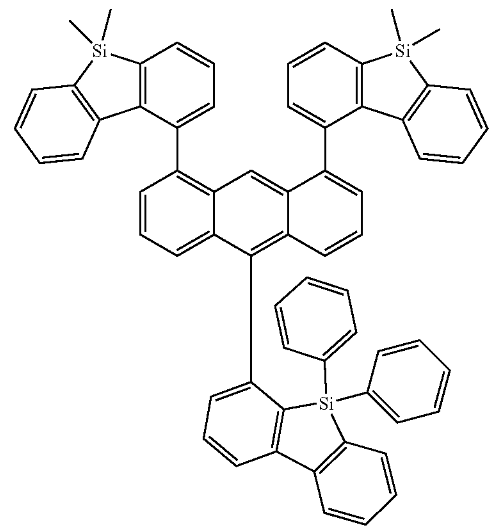
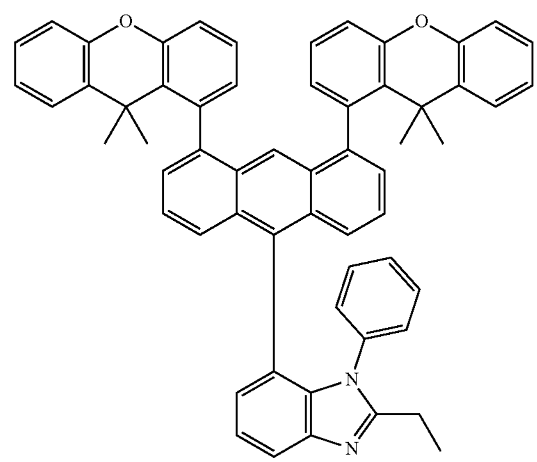
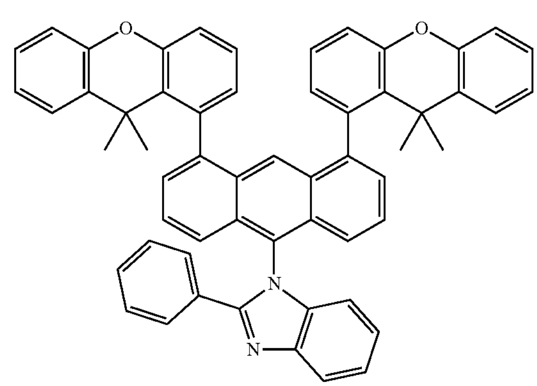

-continued
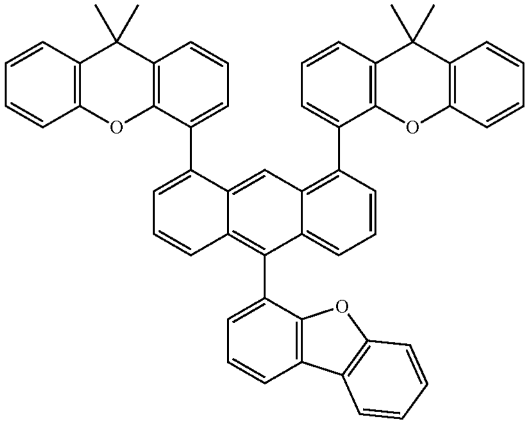
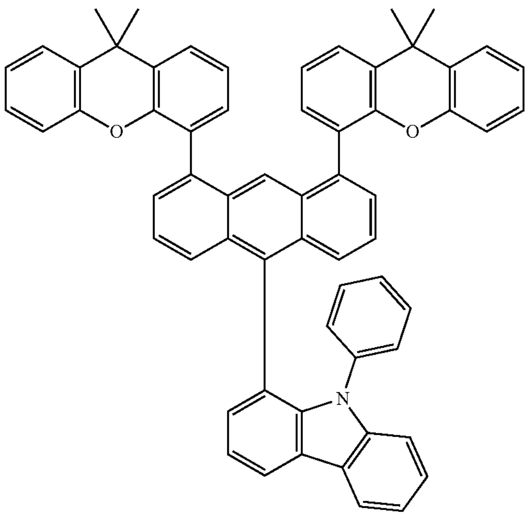
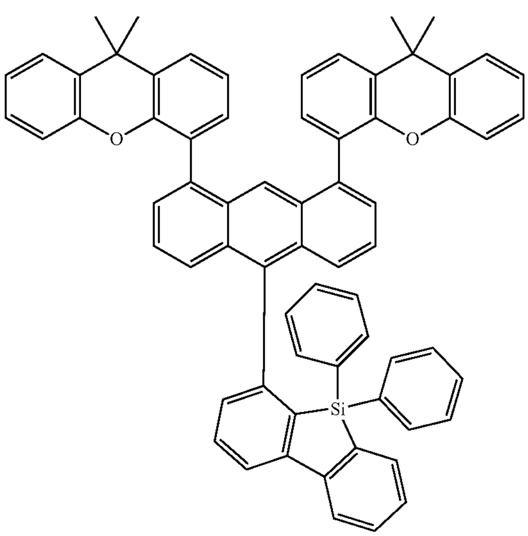
-continued
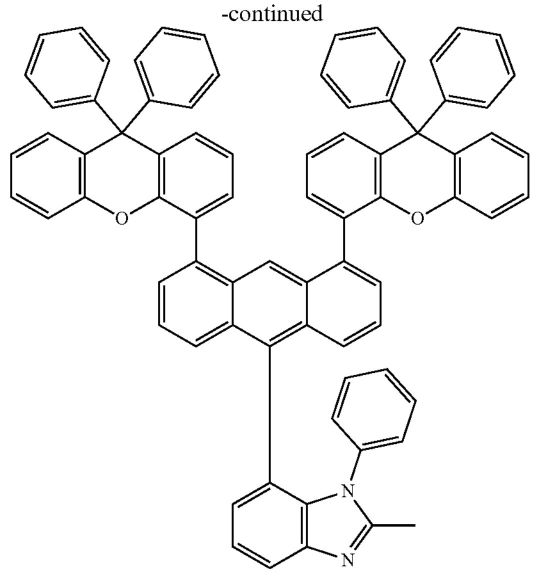
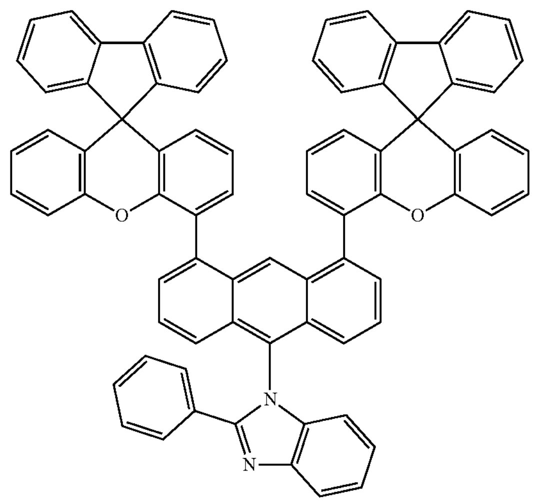
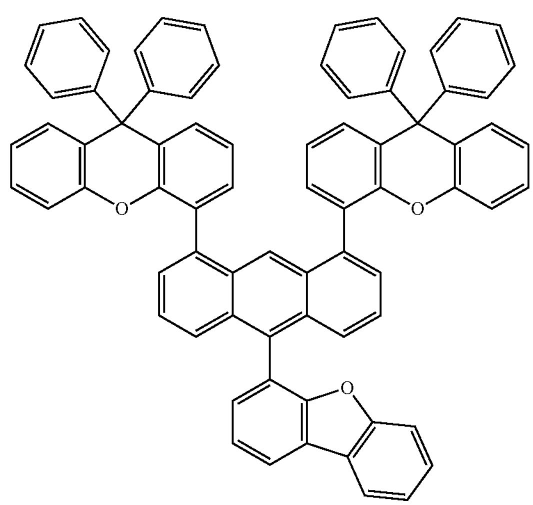

-continued
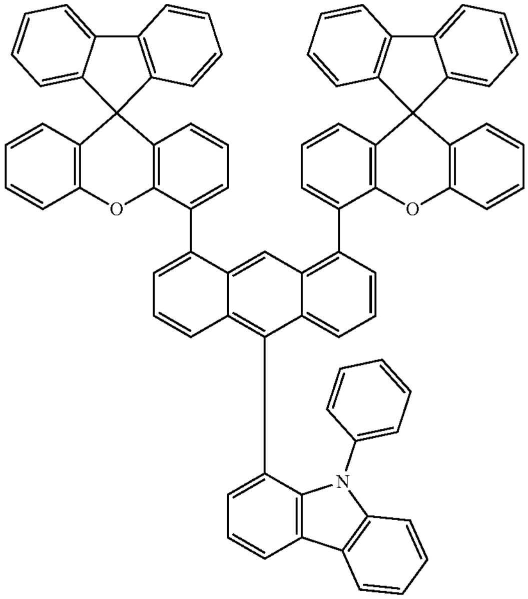
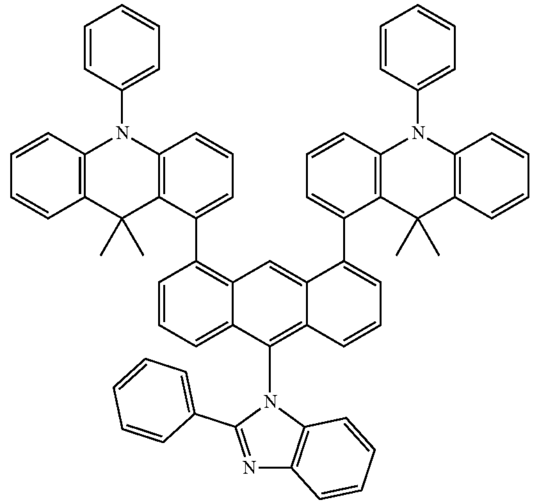
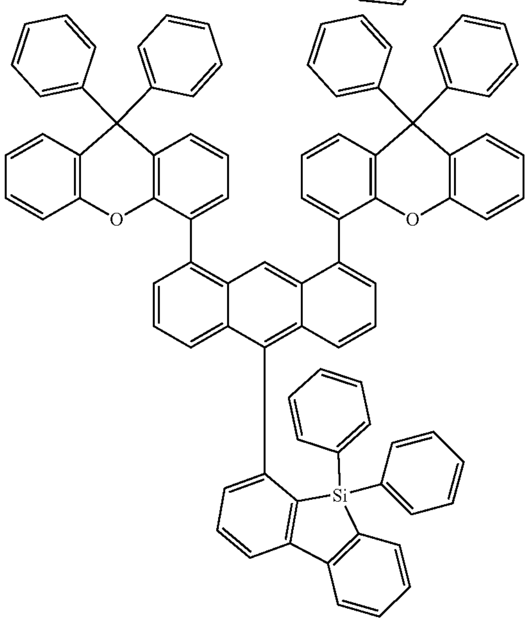
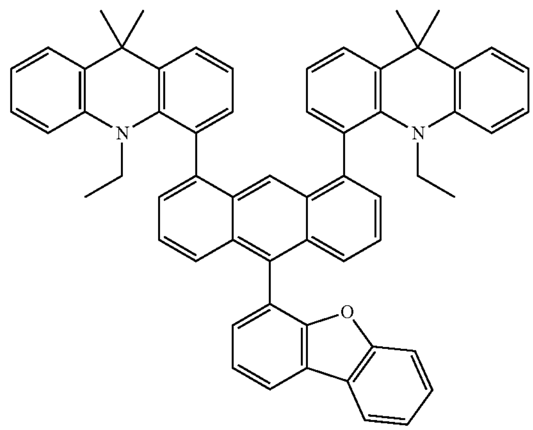
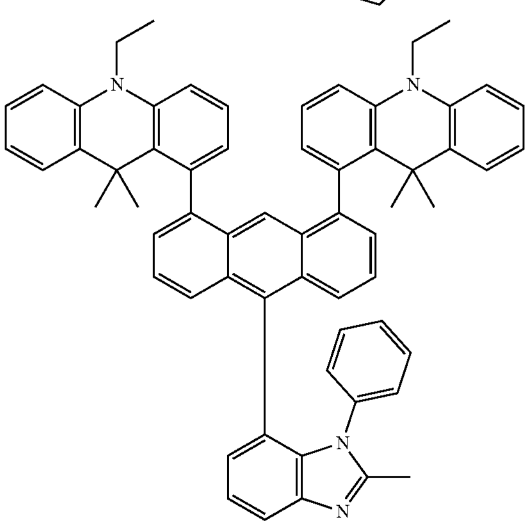
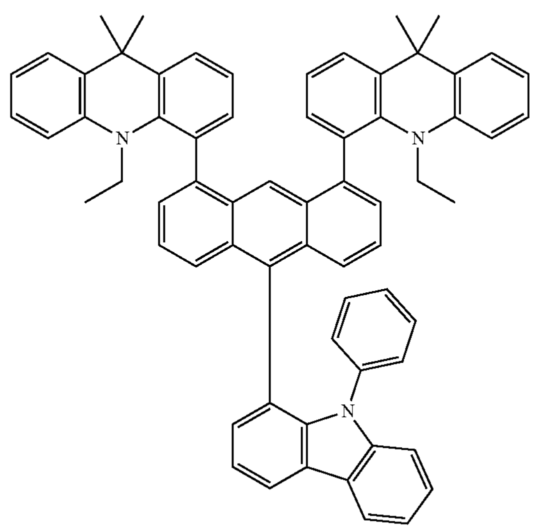

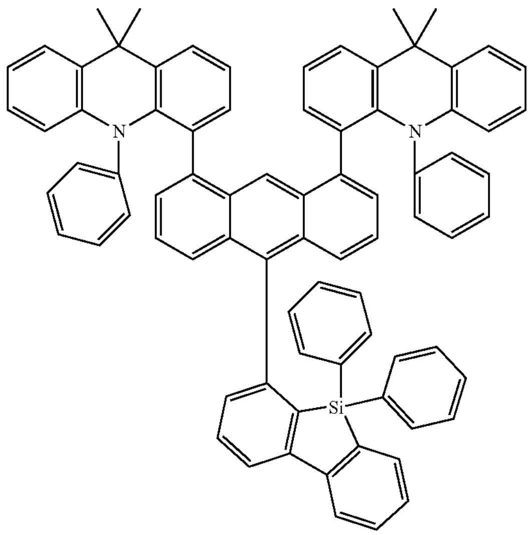
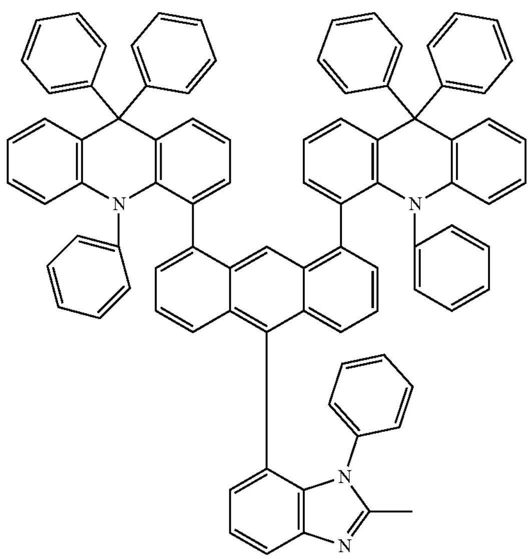
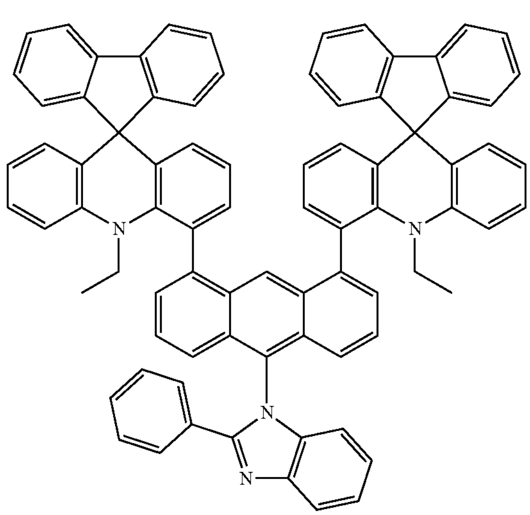
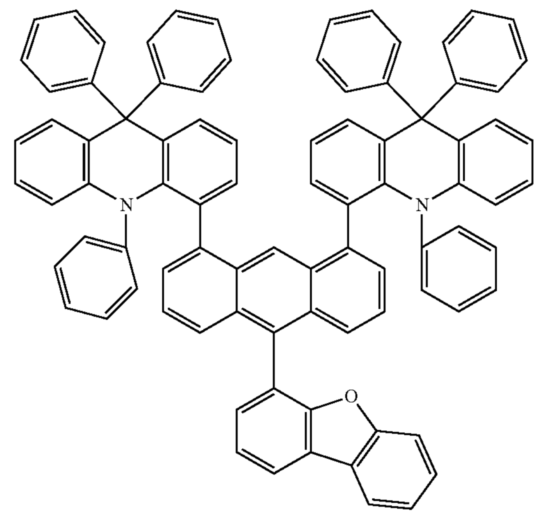
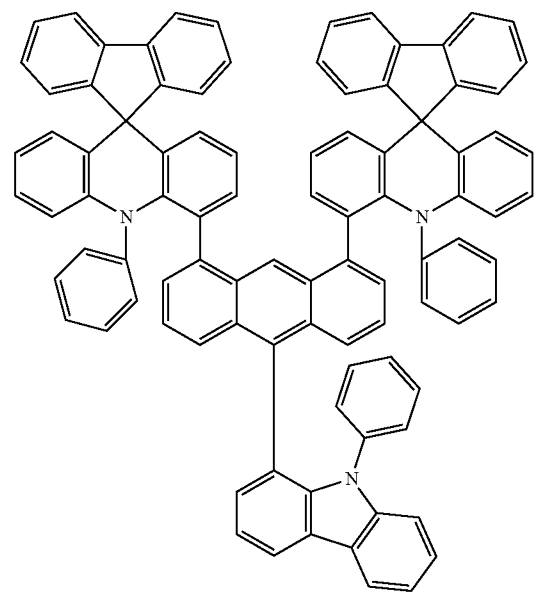
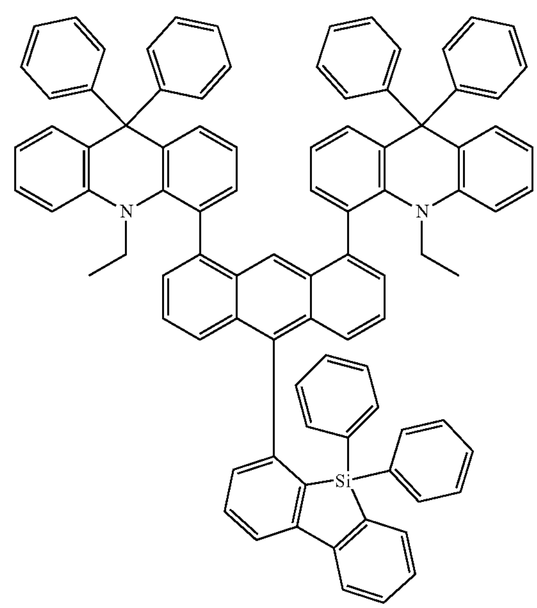

-continued
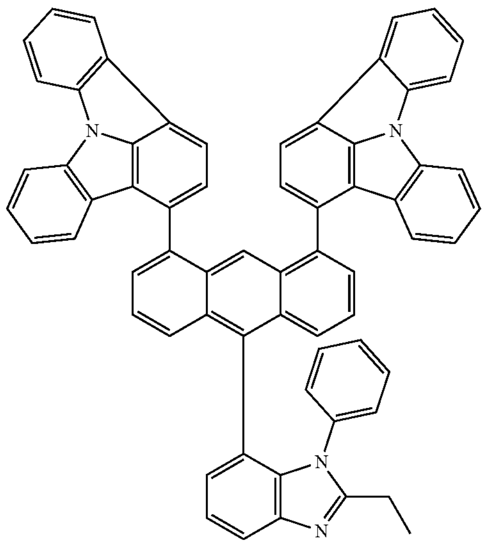
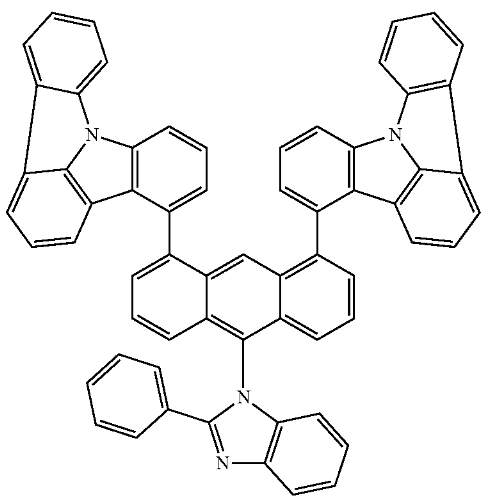
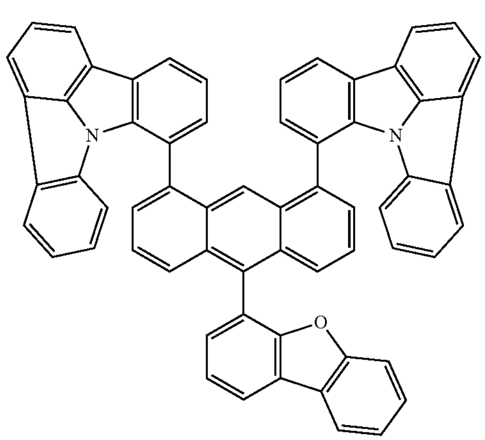
-continued
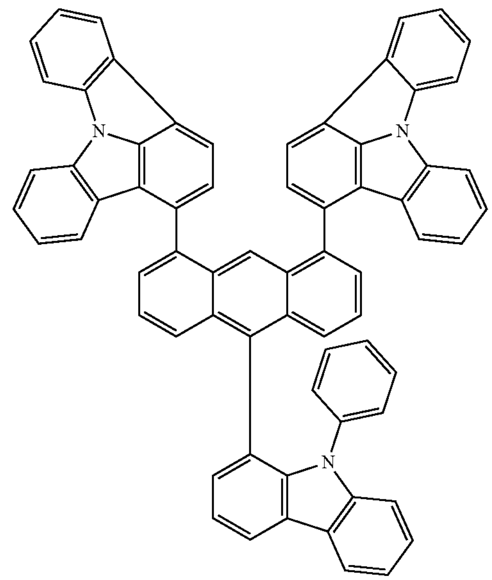
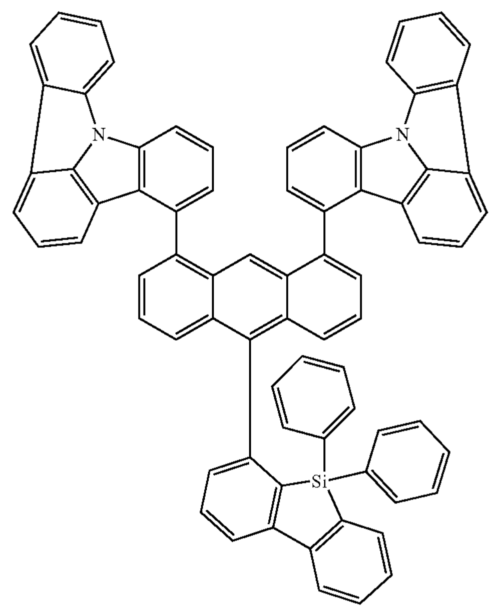
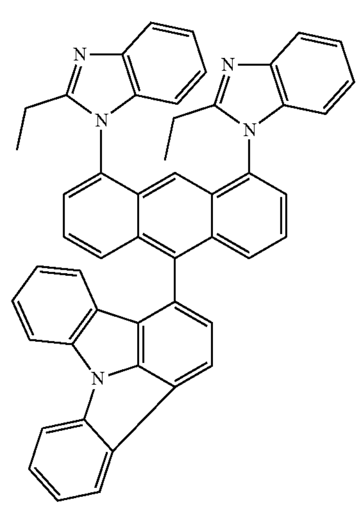

-continued
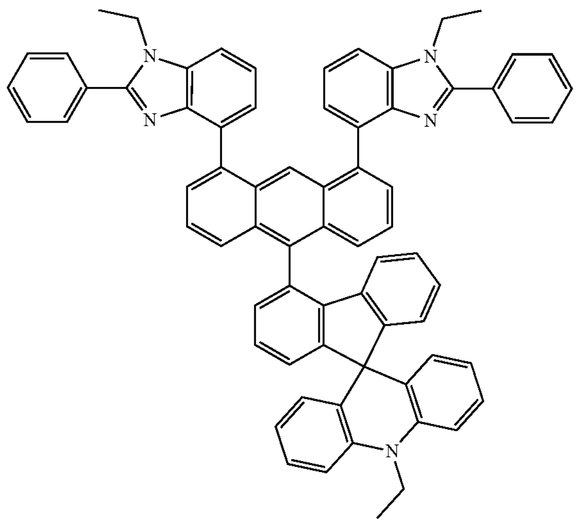
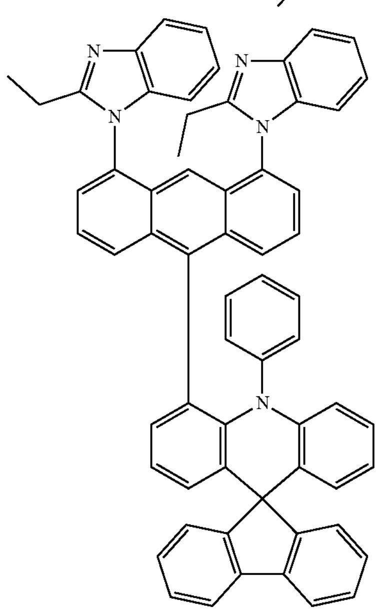
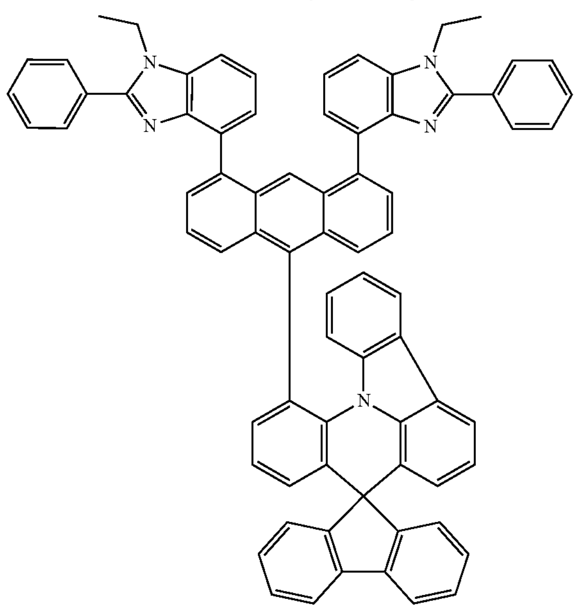
-continued
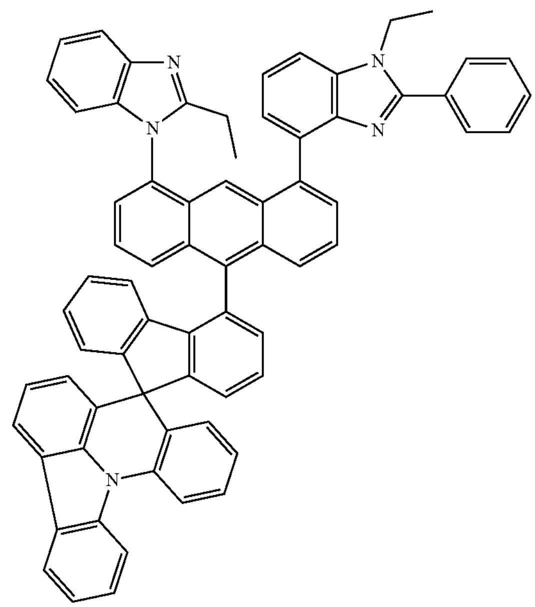
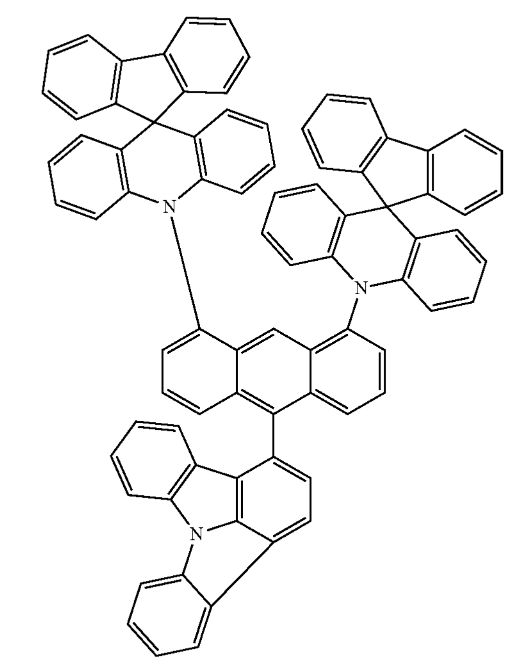

-continued
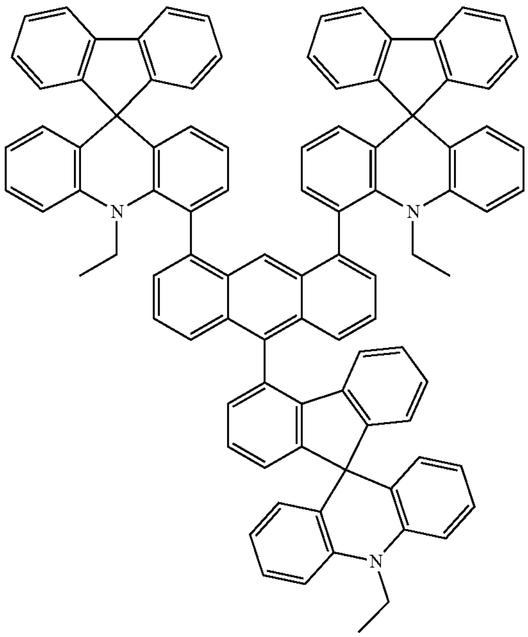
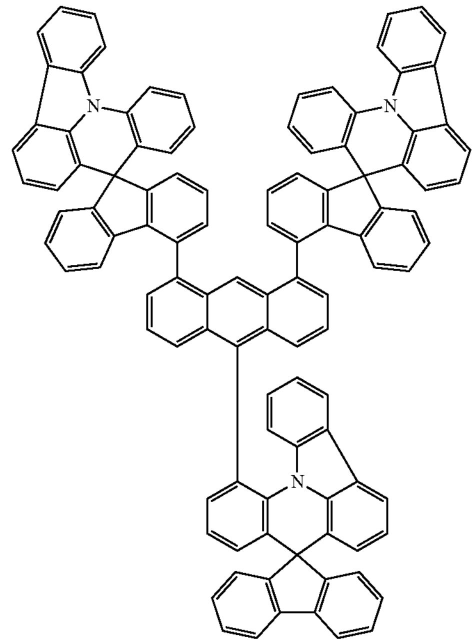
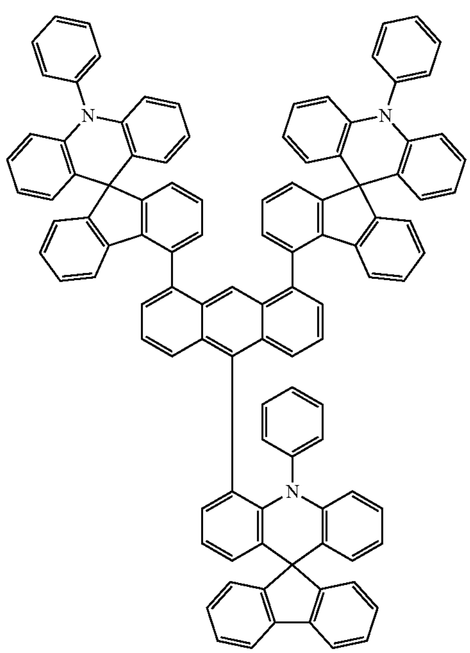
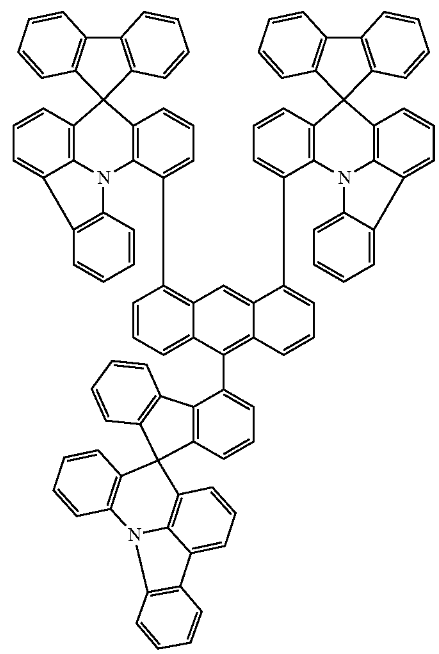

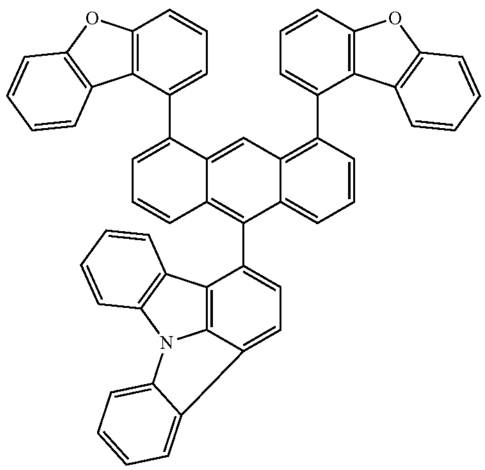
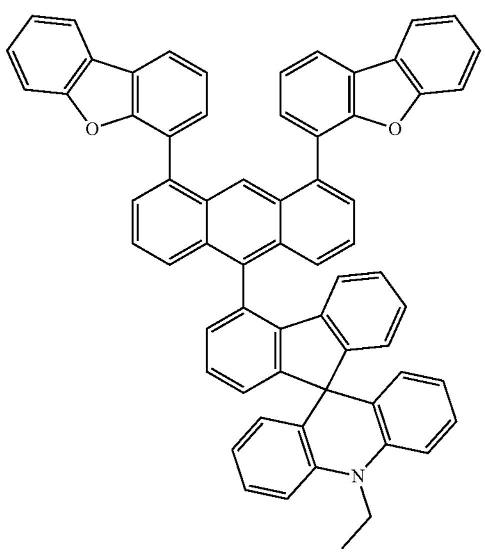
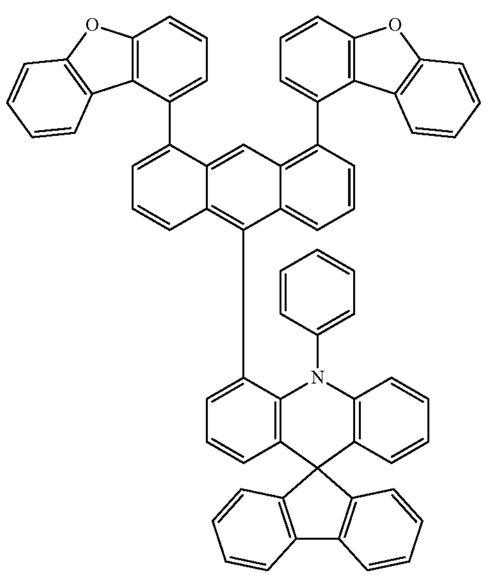
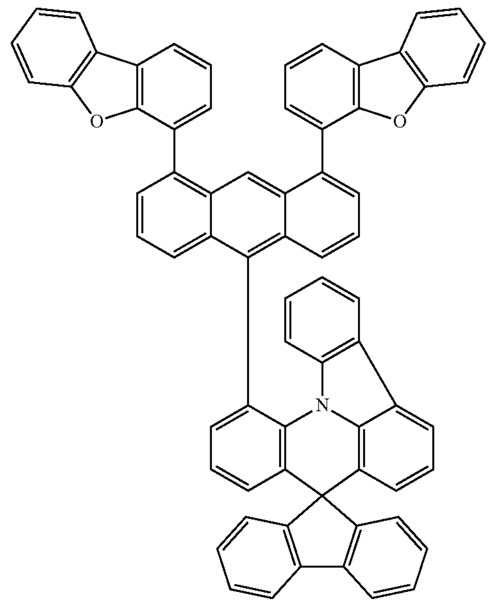
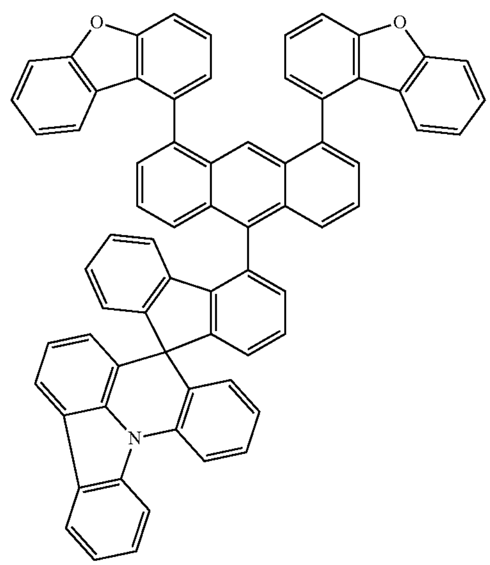

-continued
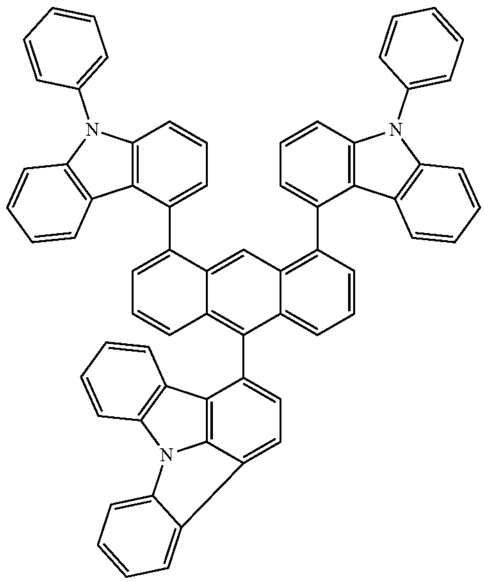
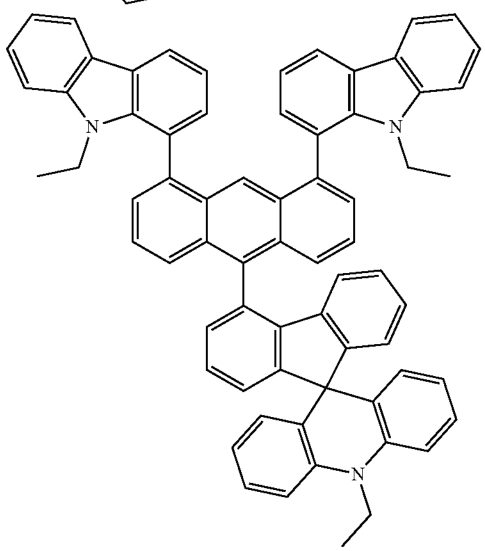
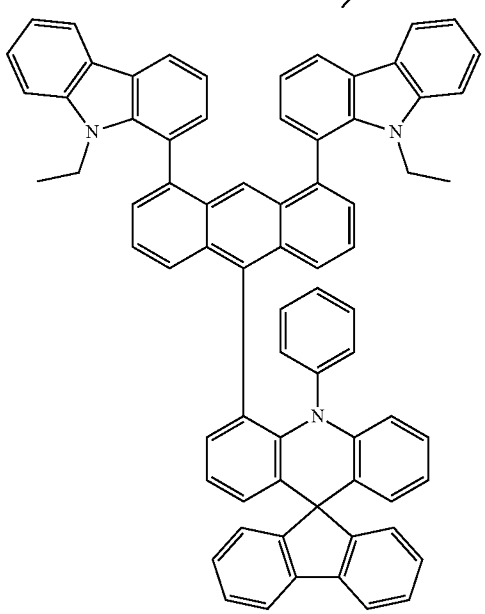
-continued
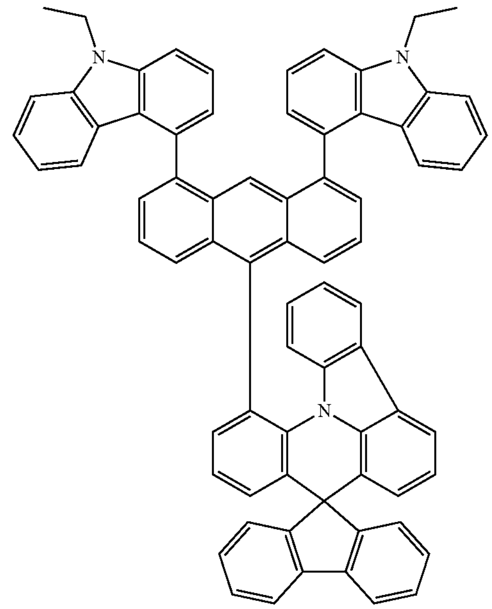
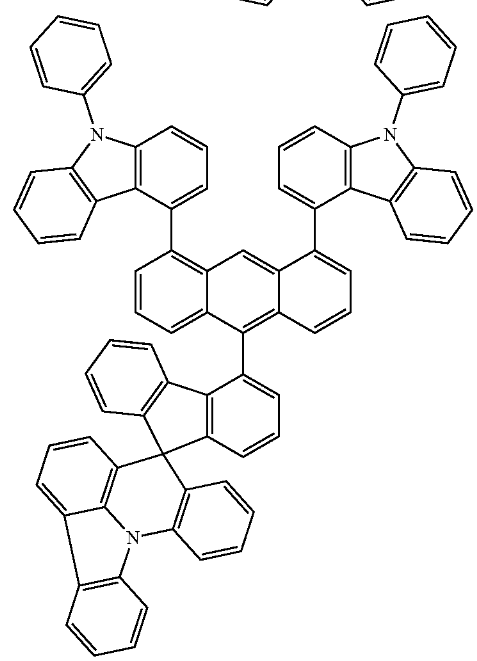
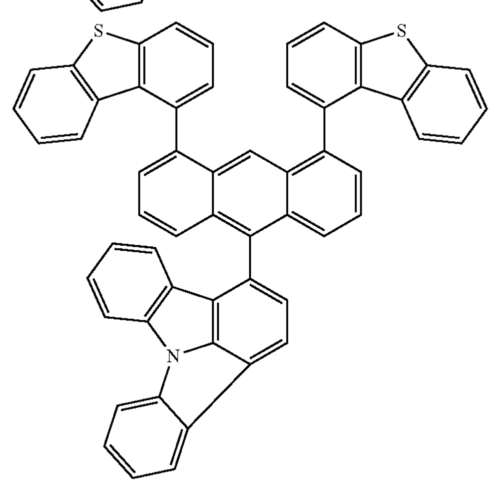

-continued
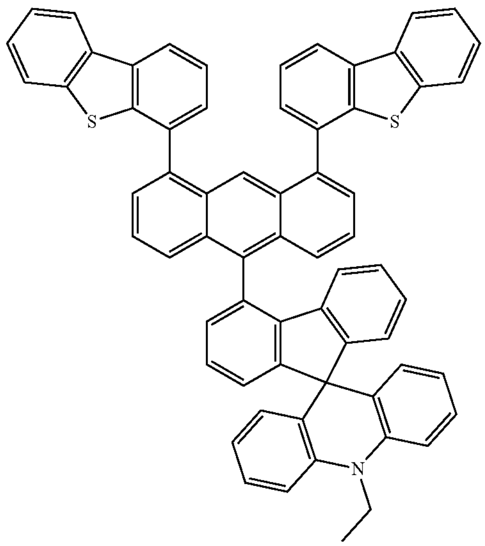
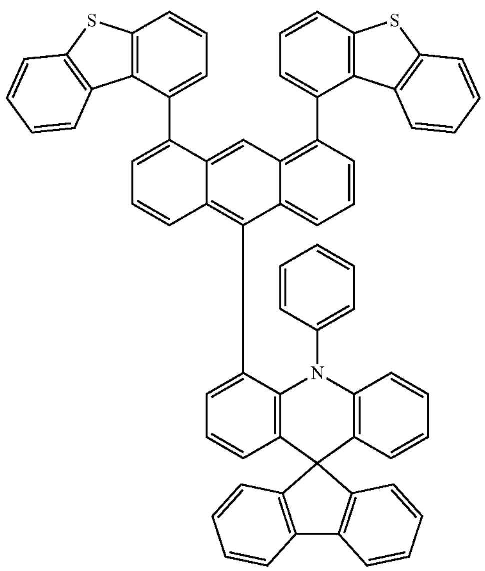
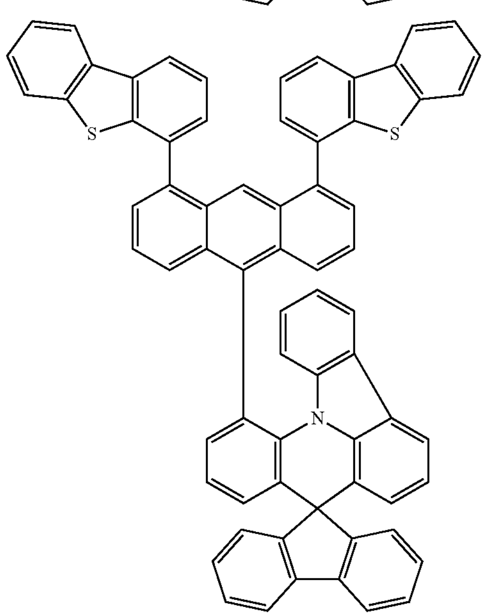
-continued
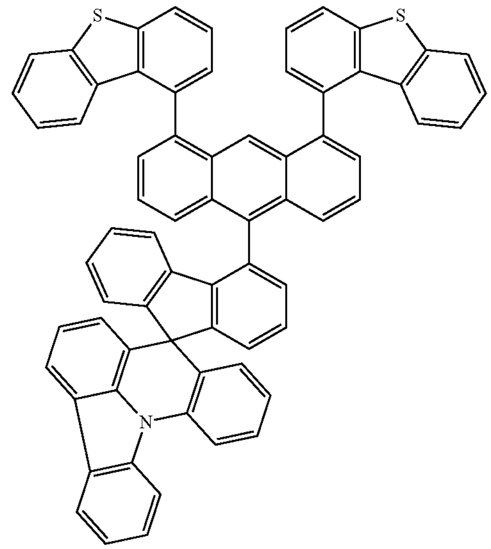
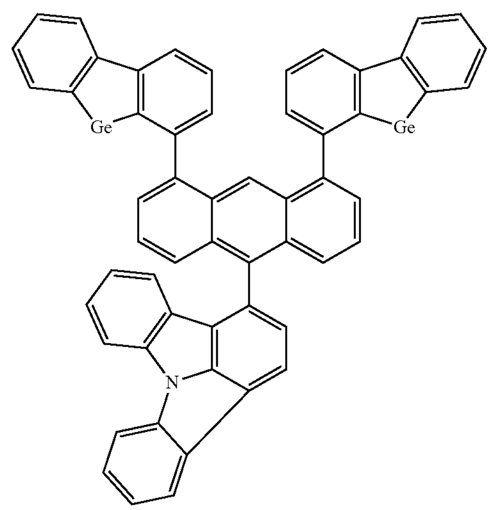
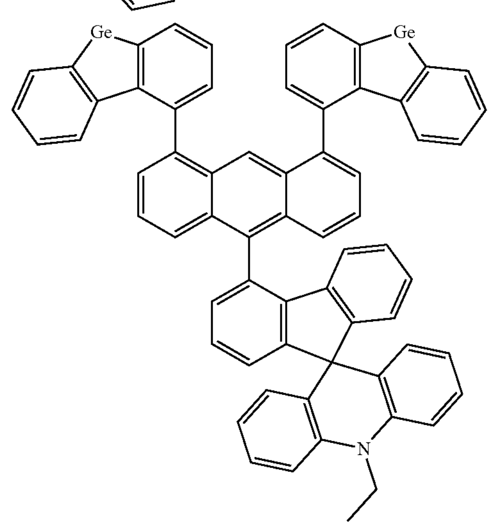

-continued
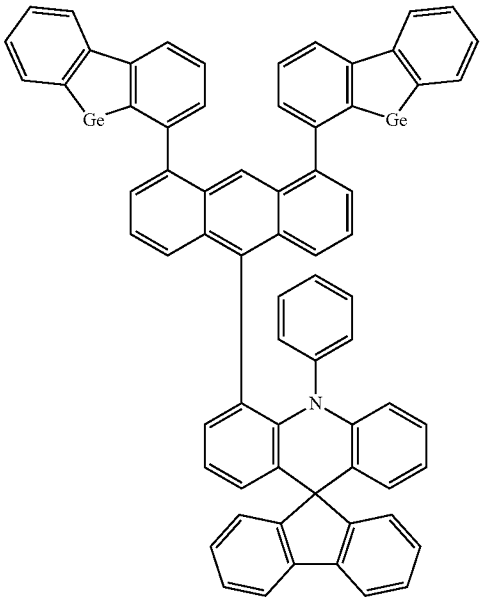
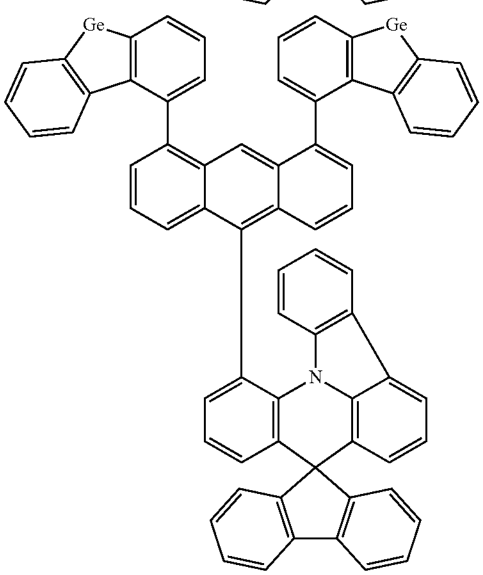
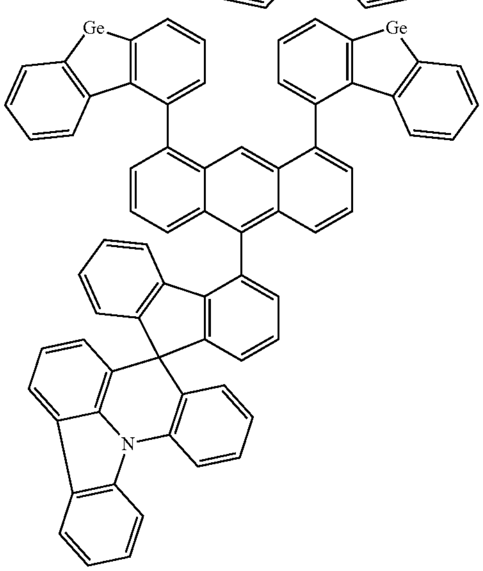
-continued
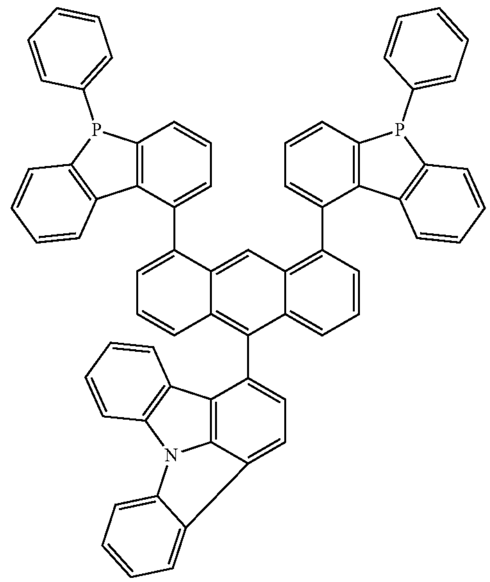
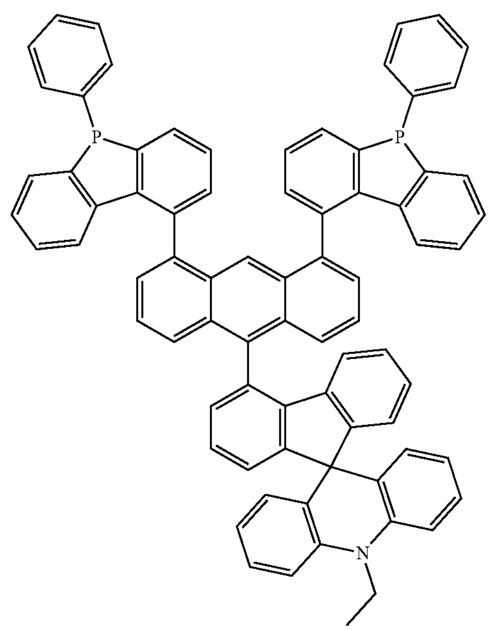

-continued
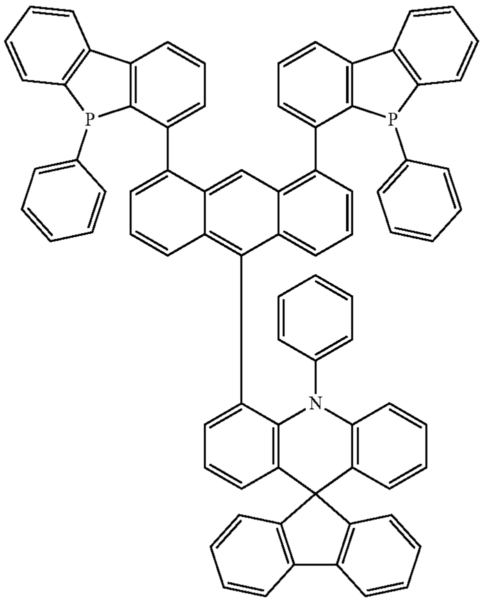
-continued
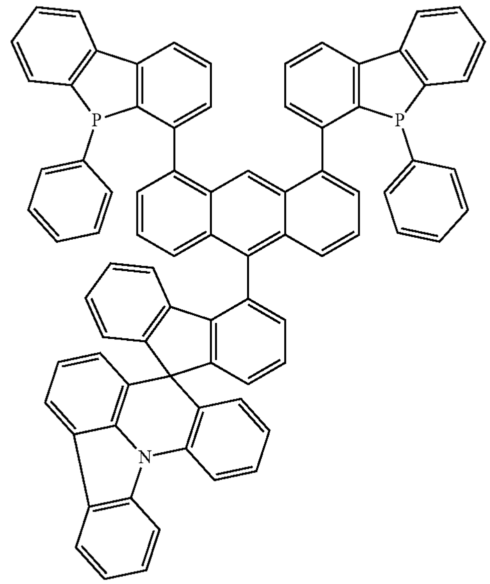
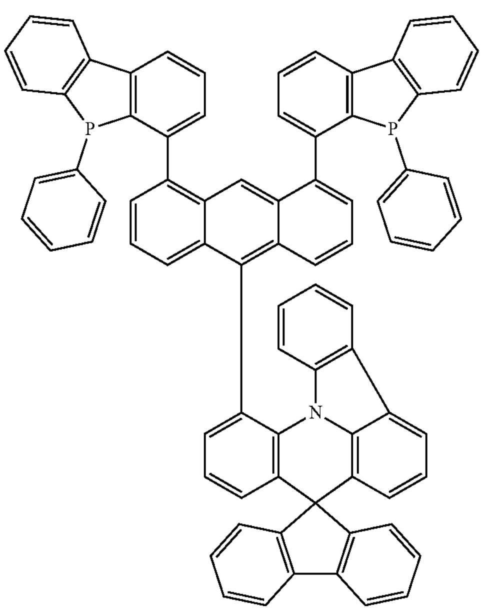
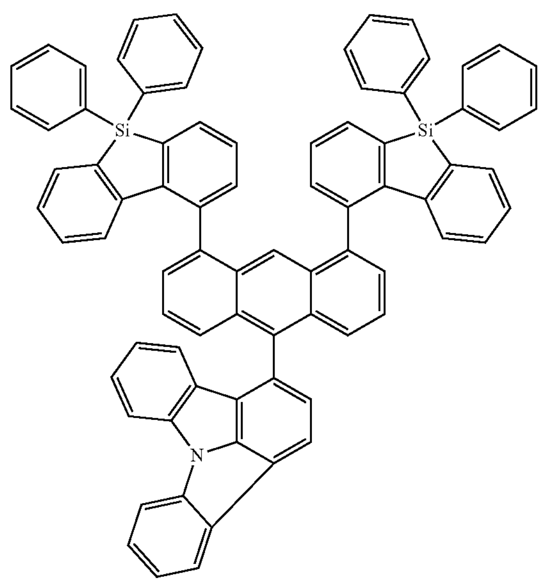

-continued
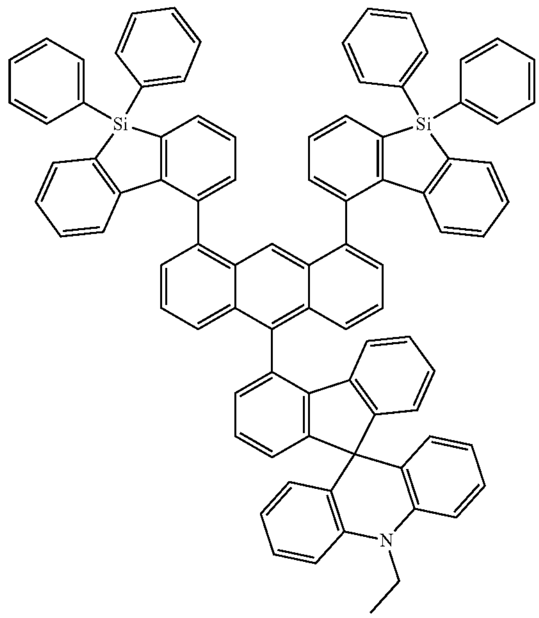
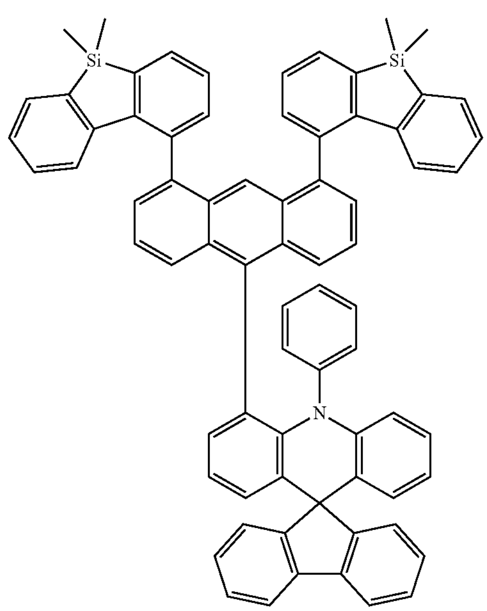
-continued
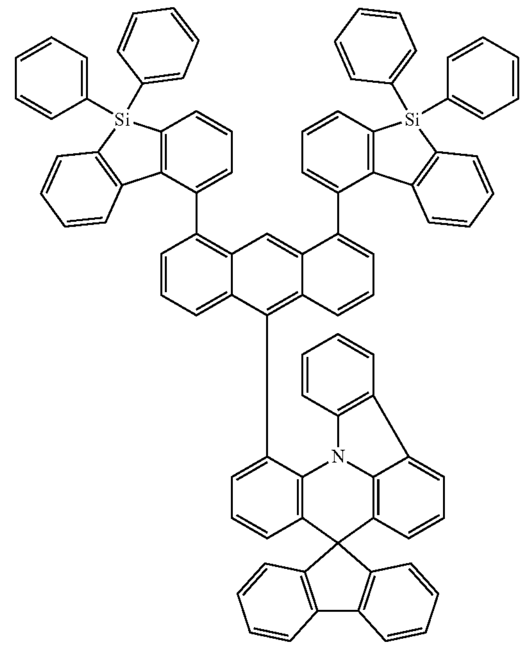
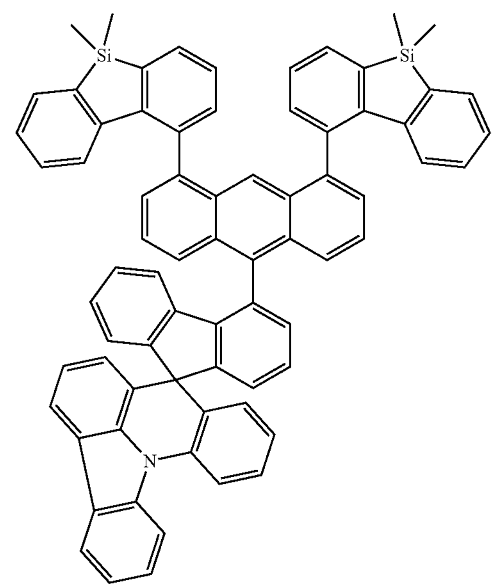
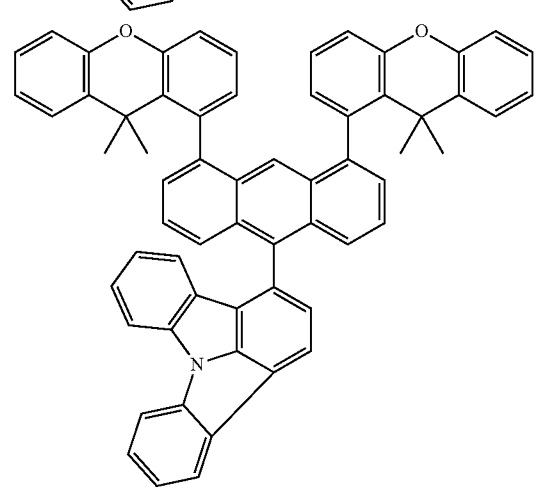

-continued
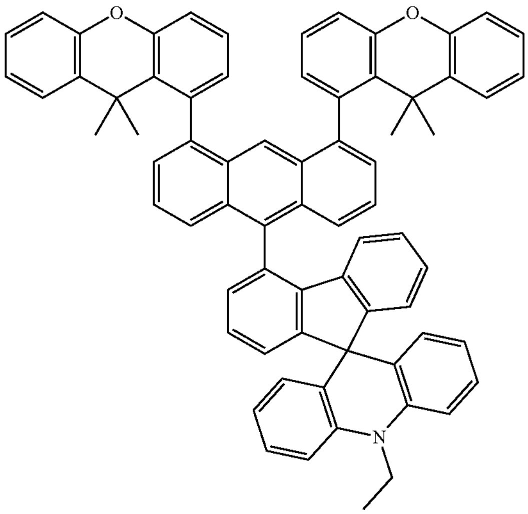
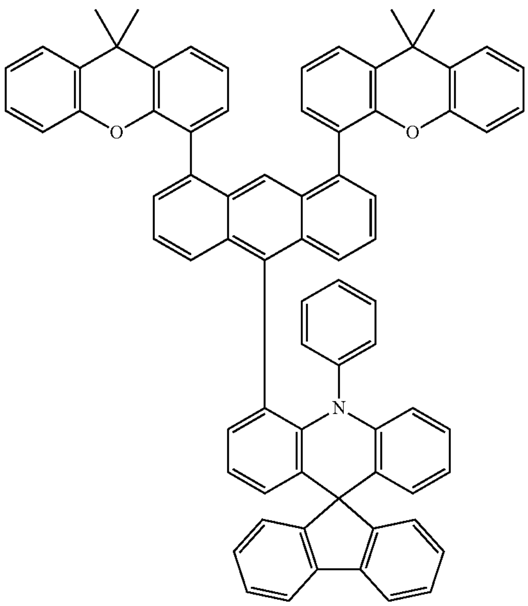
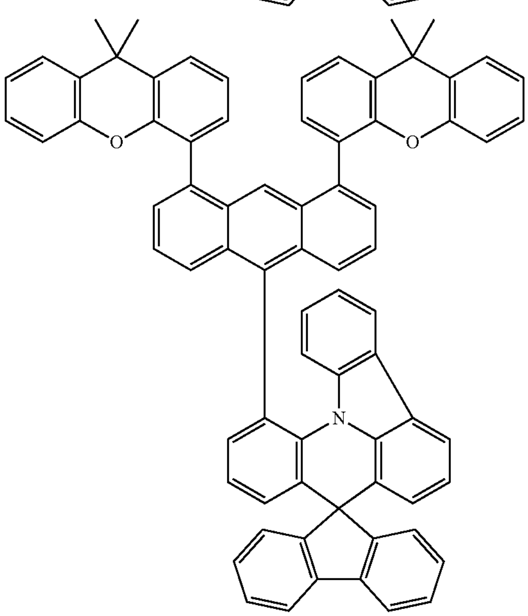
-continued
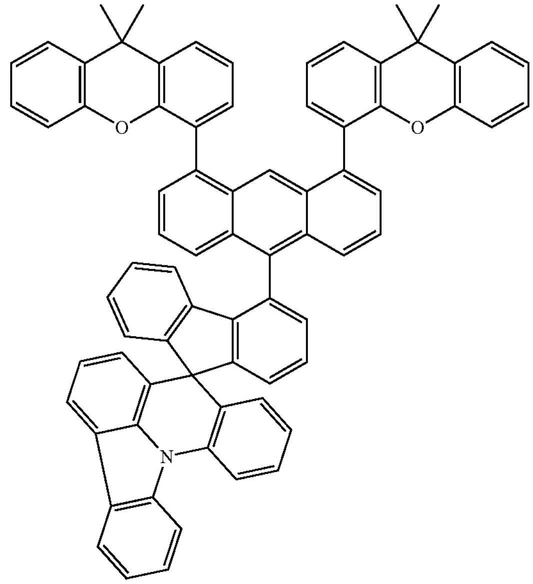
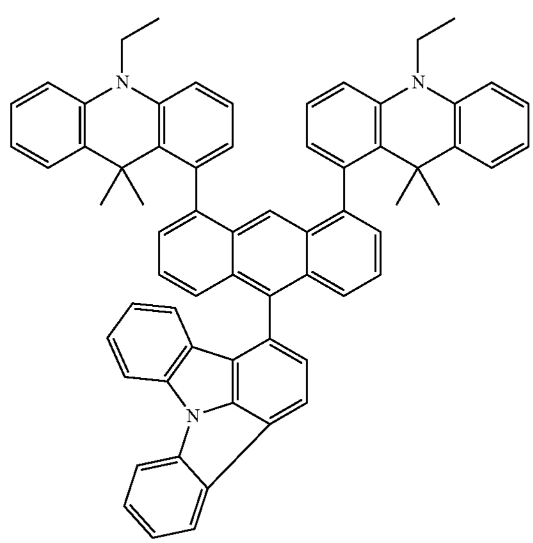

-continued
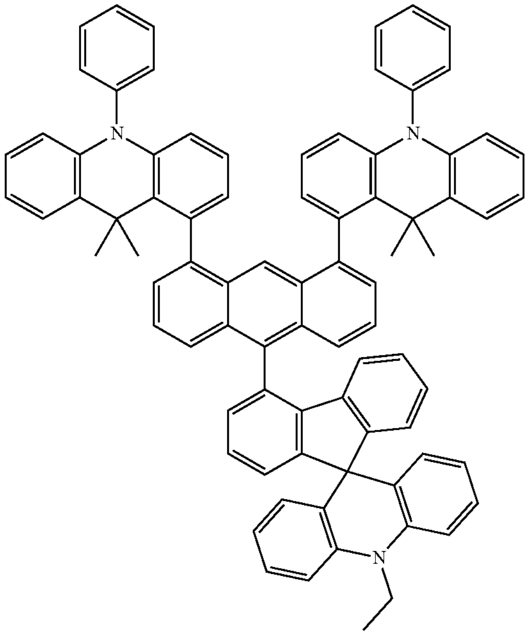
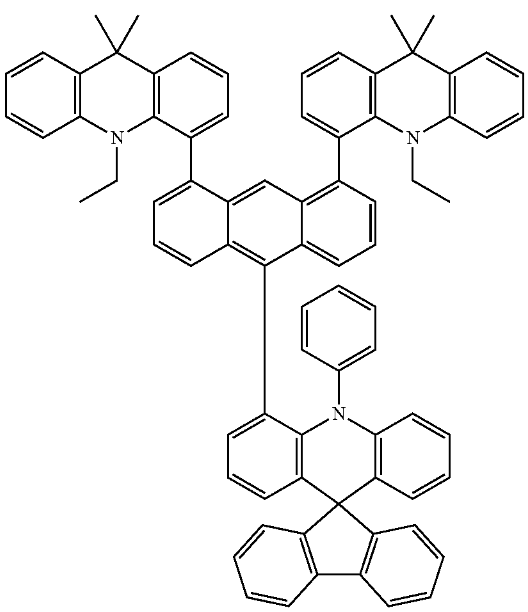
-continued
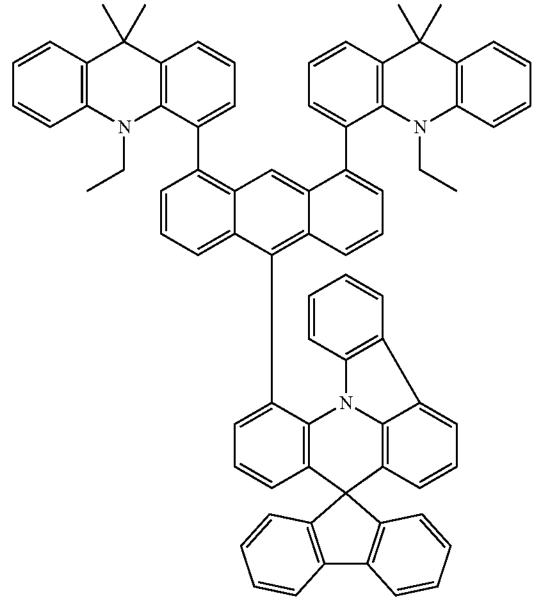
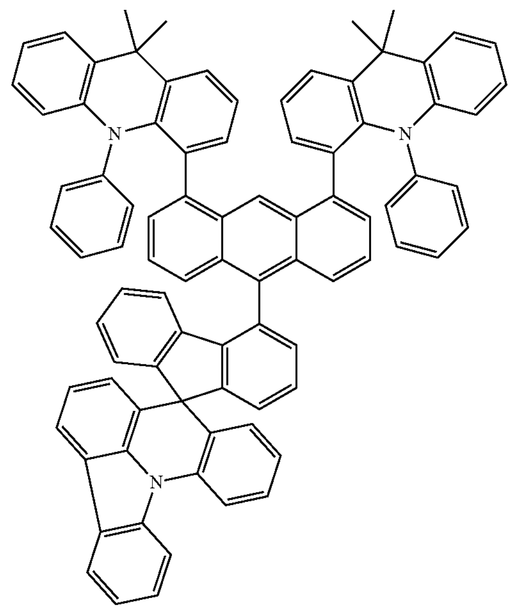
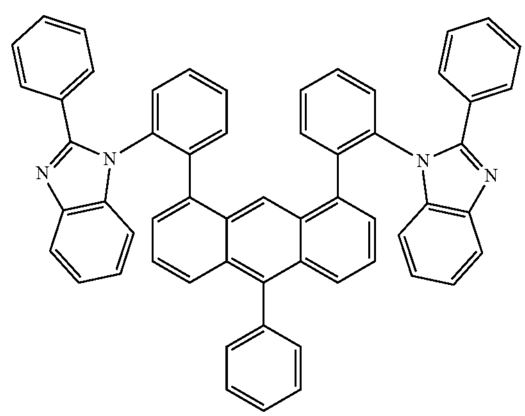

-continued
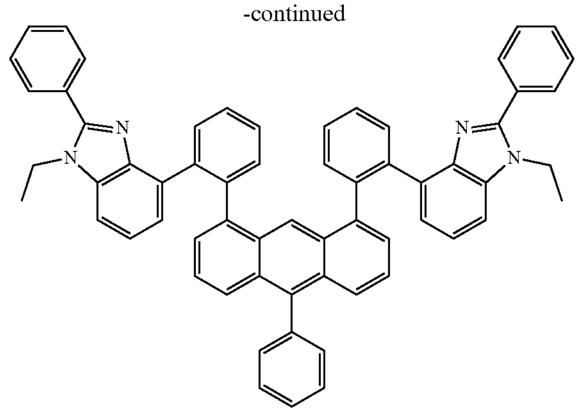
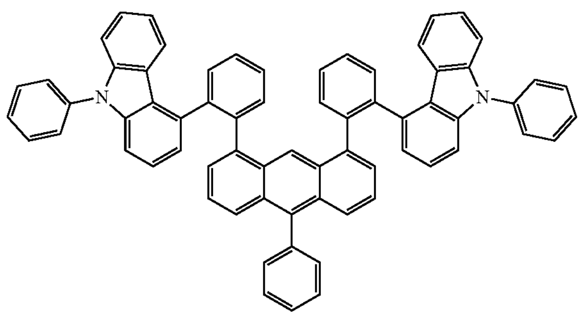
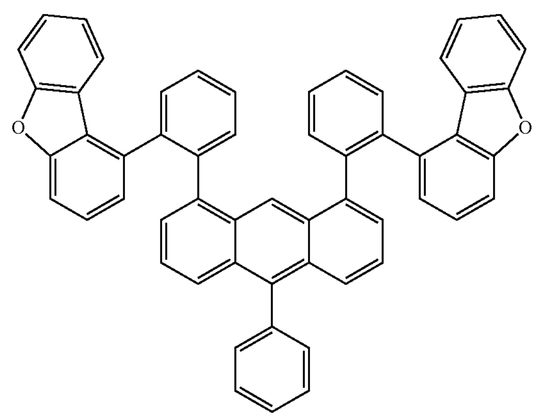
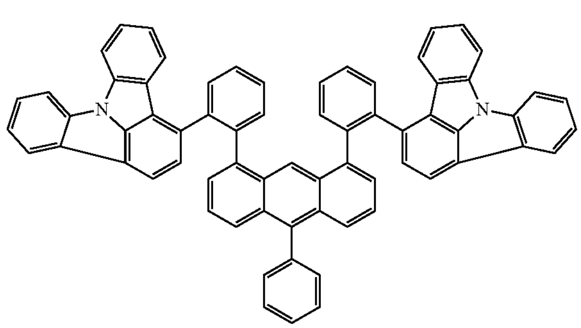
-continued
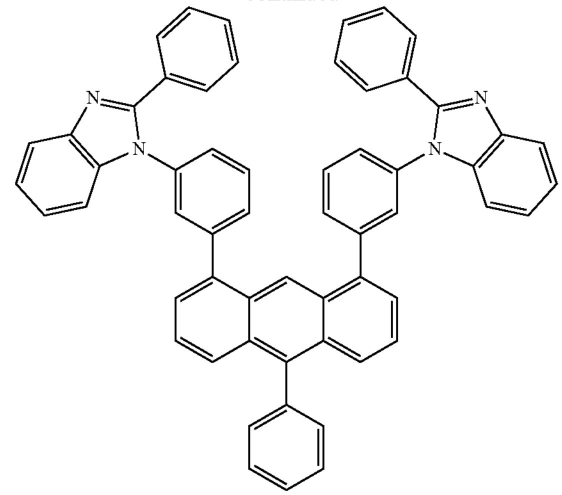
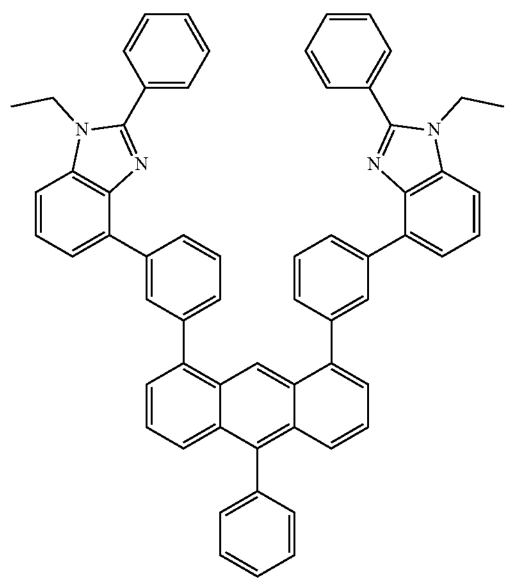
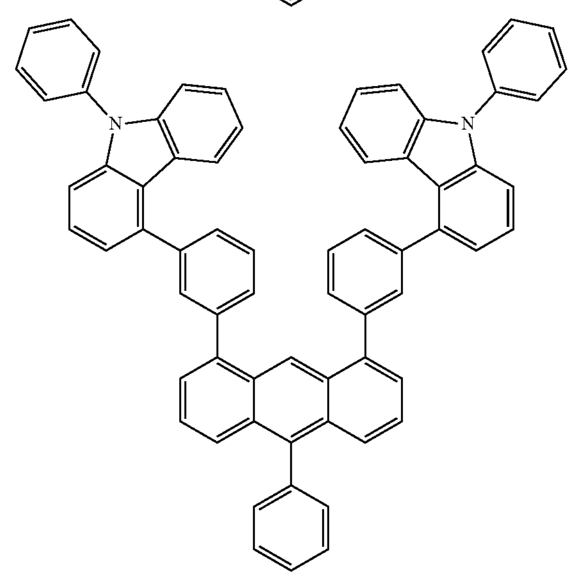

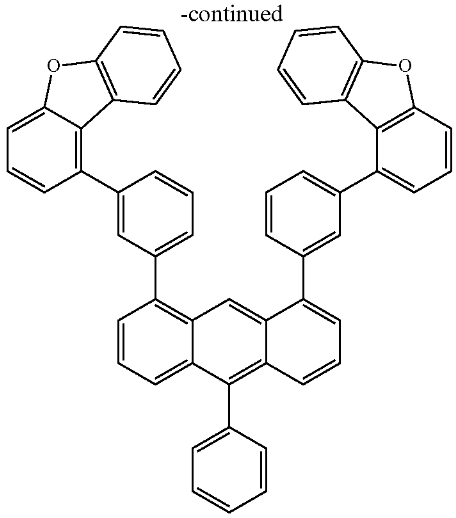
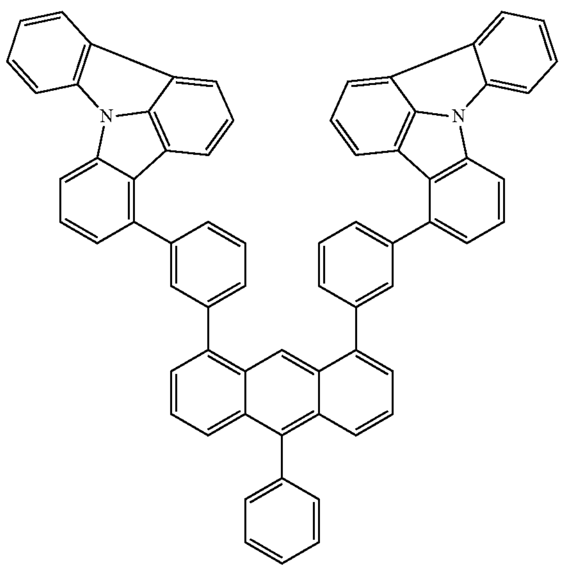 [SMILES: c1ccc(-c2c3cccc(-c4cccc(-c5cccc6c5c5ccccc5n6-c5ccccc5)c4)c3cc3c(-c4cccc(-c5cccc6c5c5ccccc5n6-c5ccccc5)c4)cccc23)cc1]
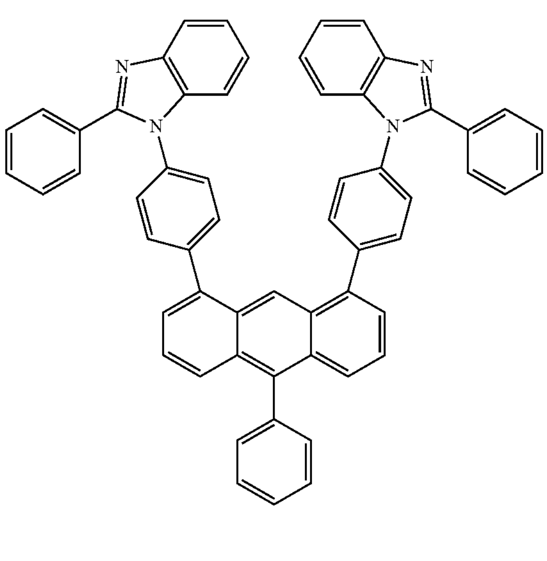
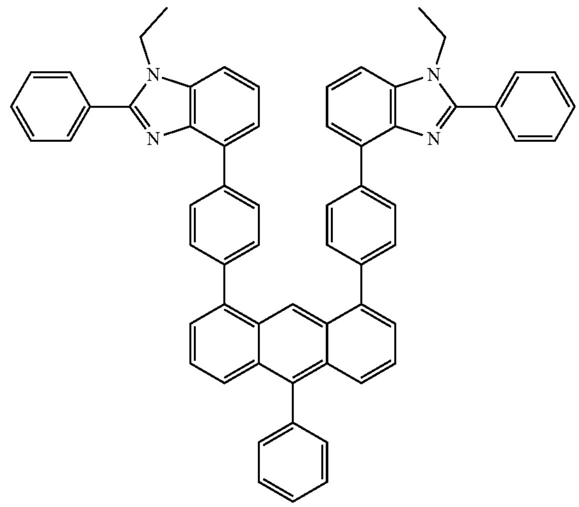
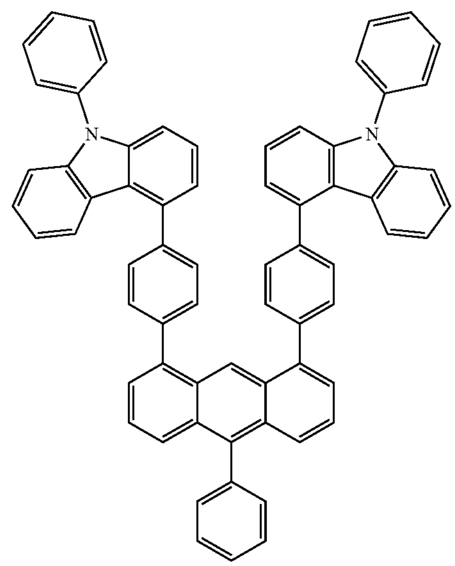
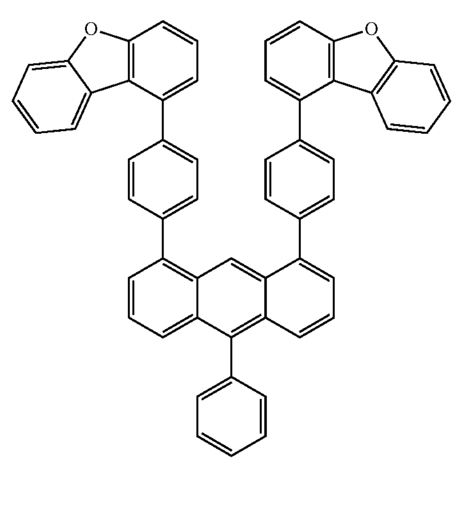

-continued
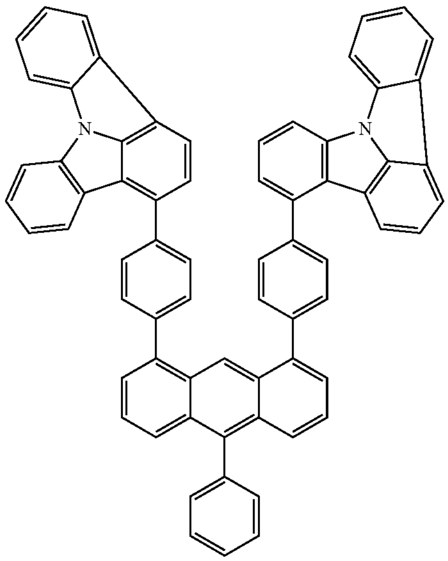
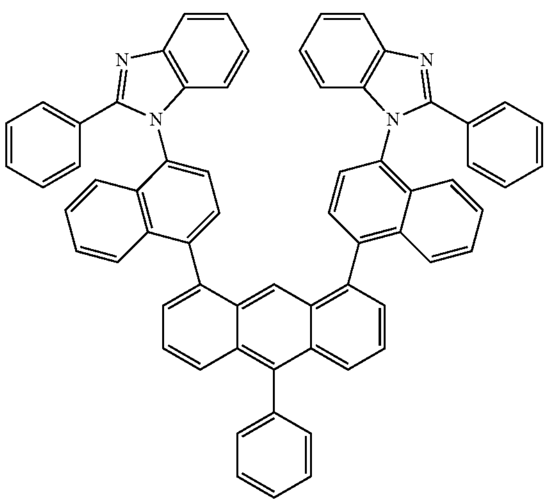
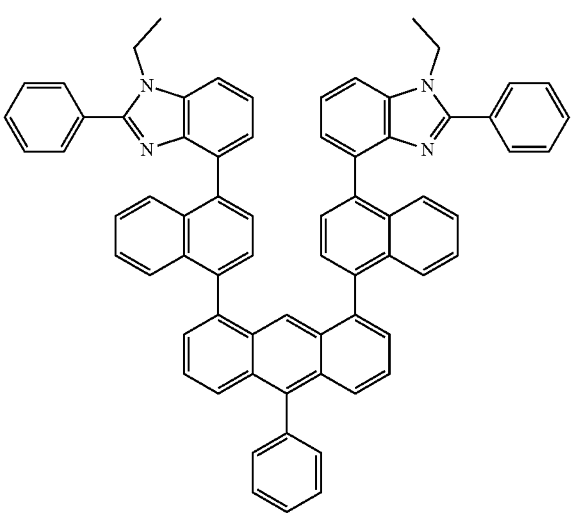
-continued
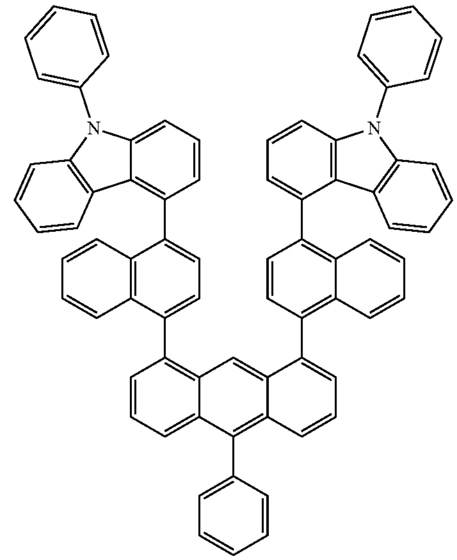
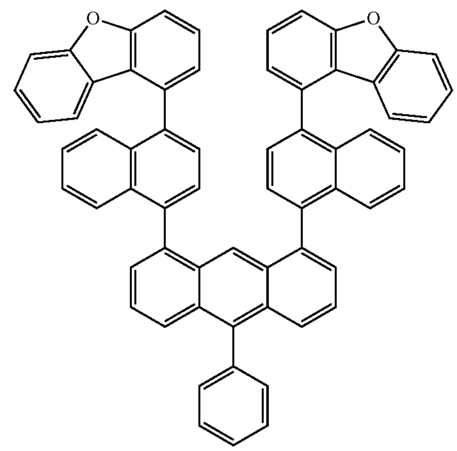
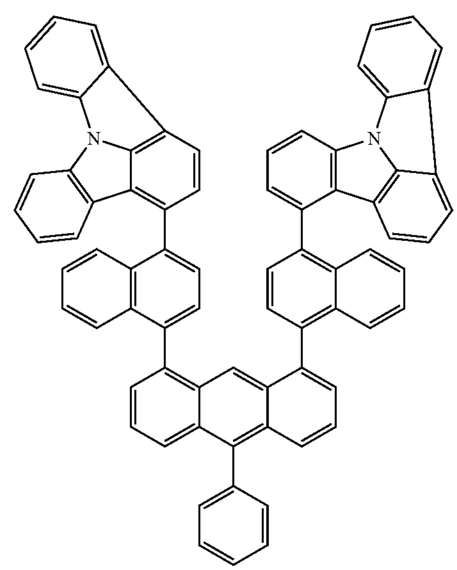

-continued
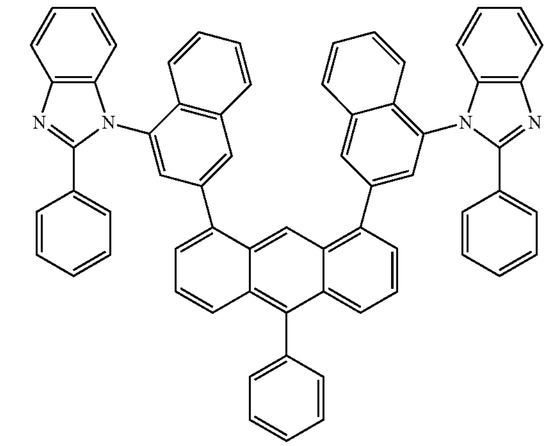
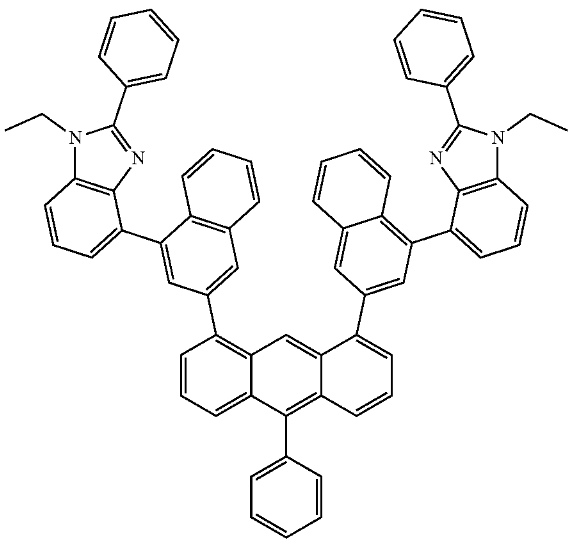
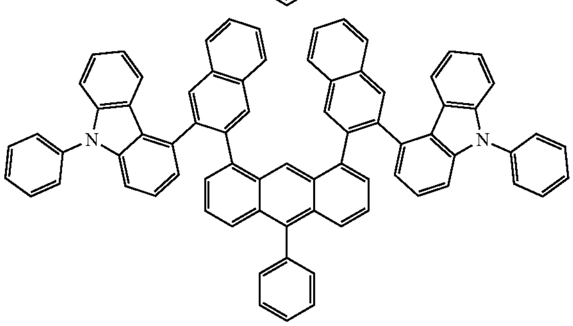
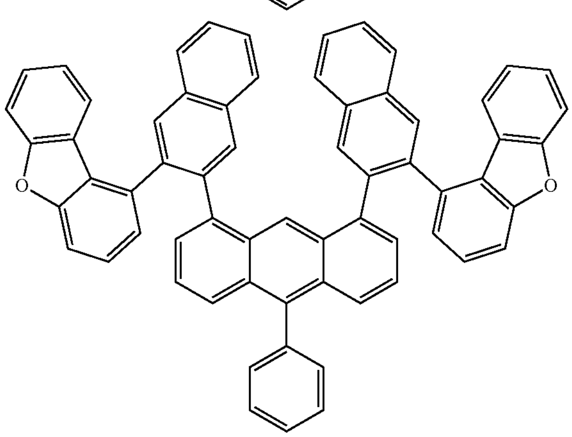
-continued
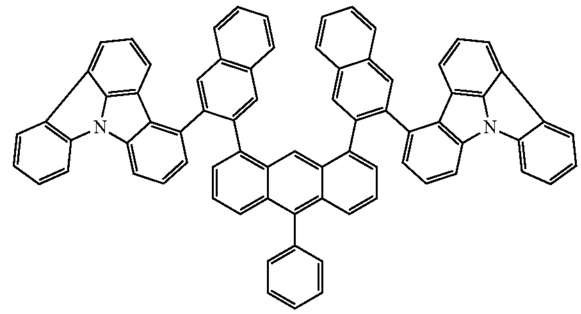
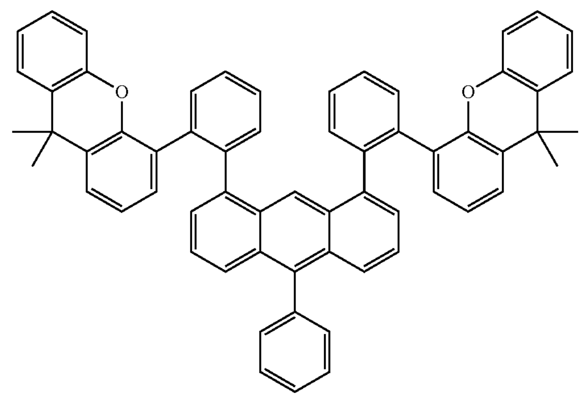
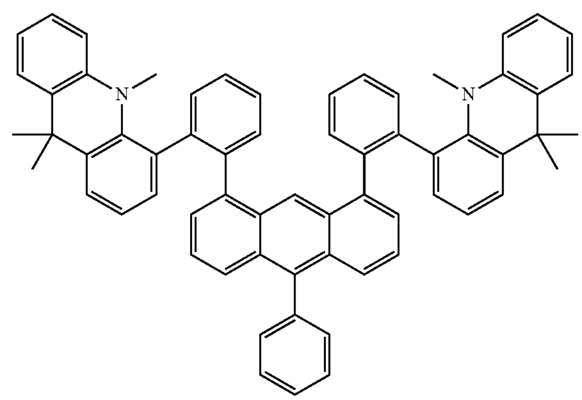
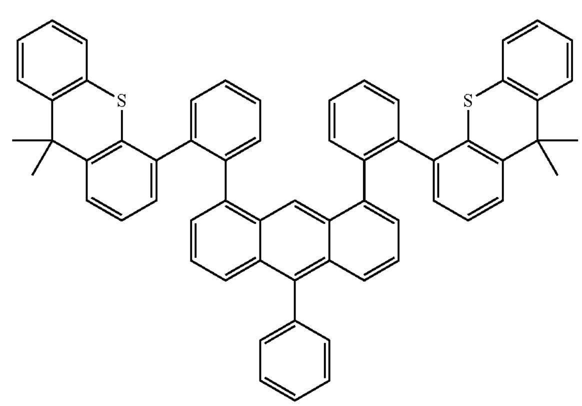

-continued
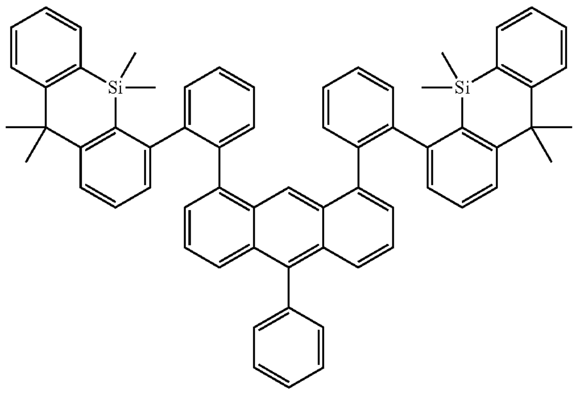
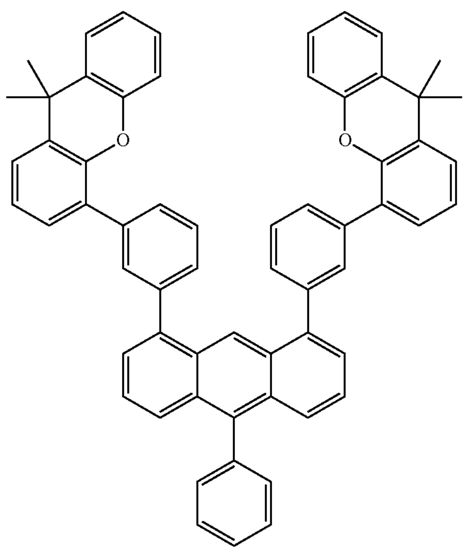
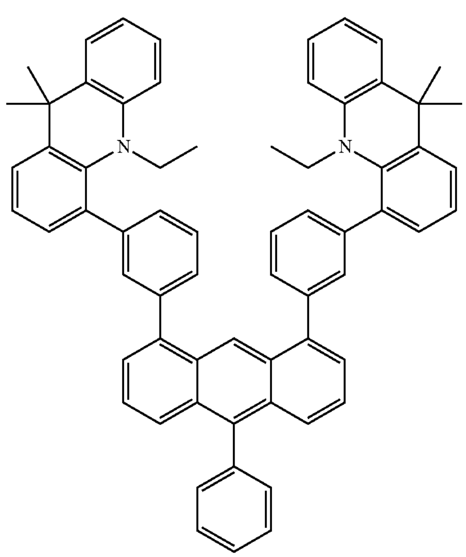
-continued
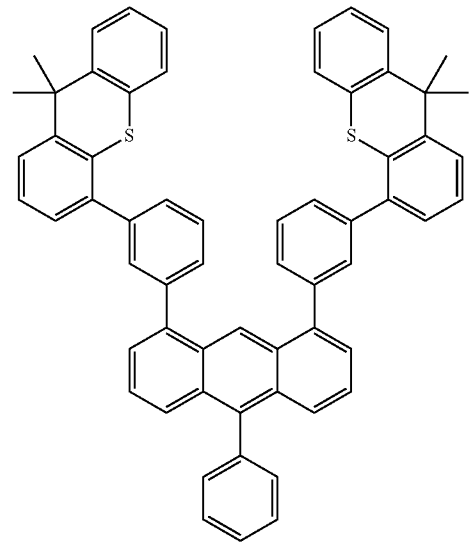
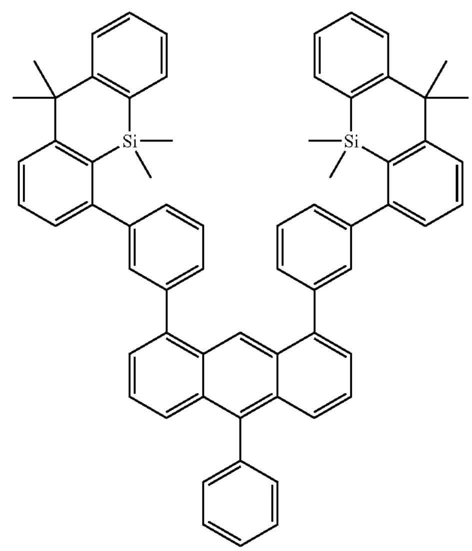
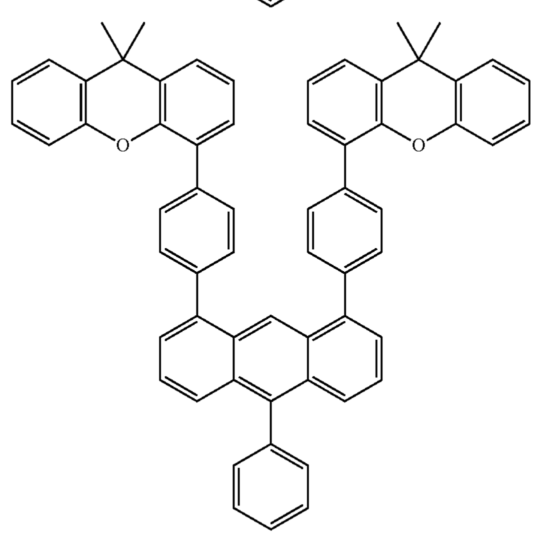

-continued
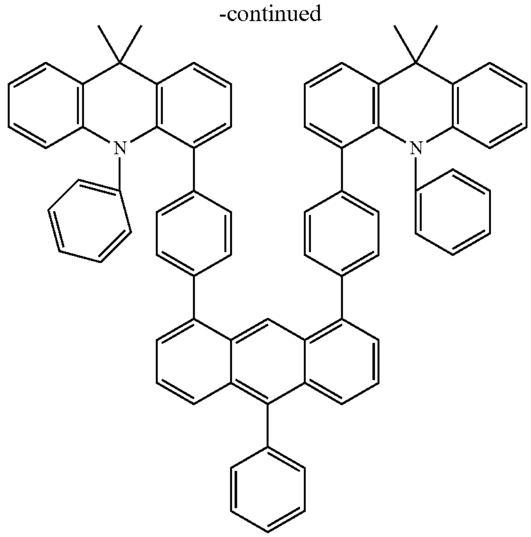
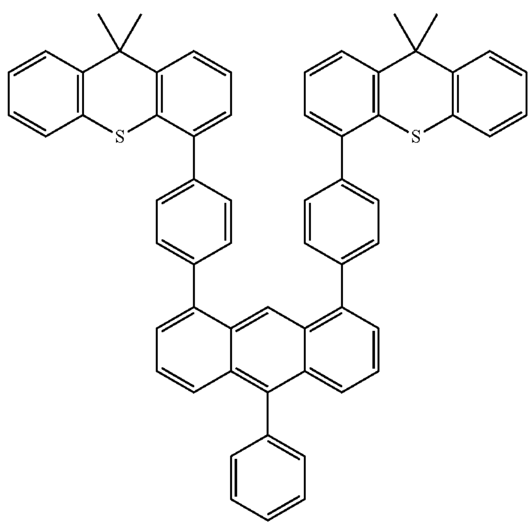
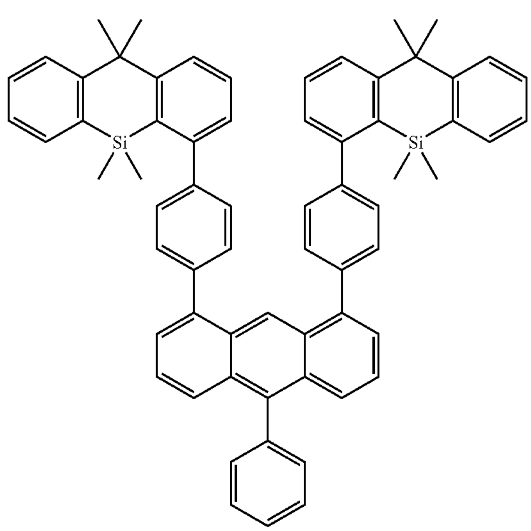
-continued
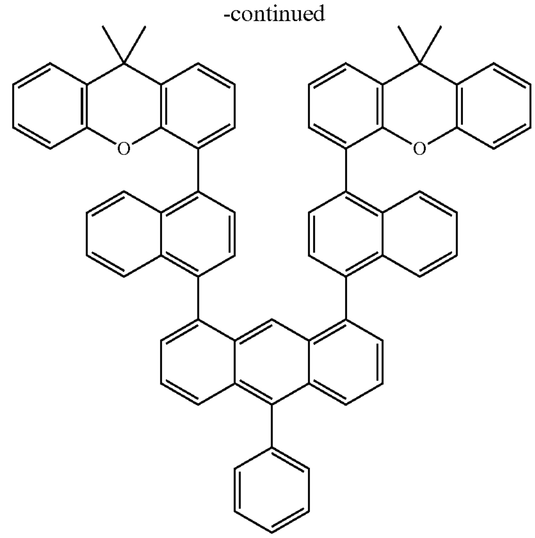
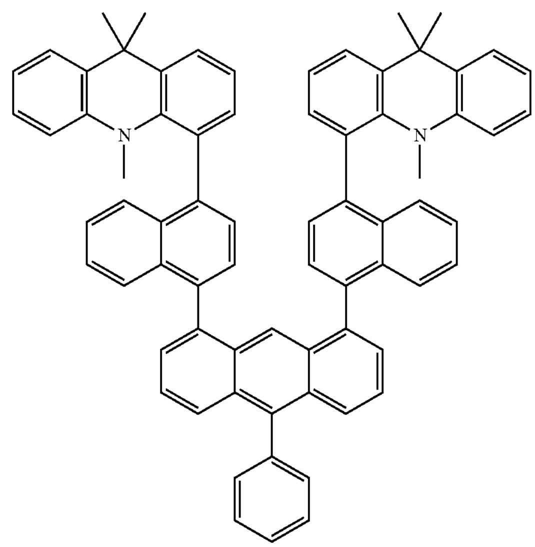
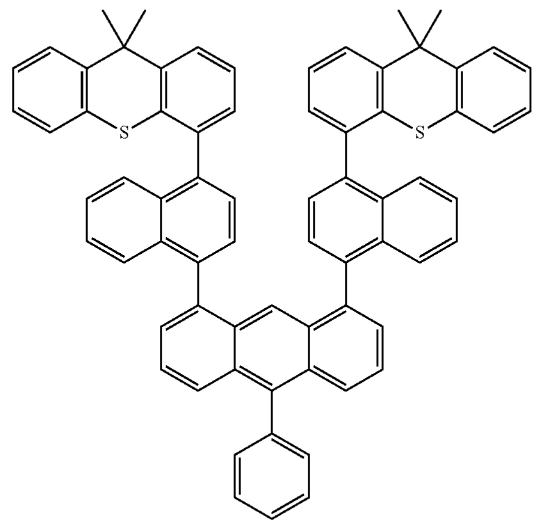

-continued
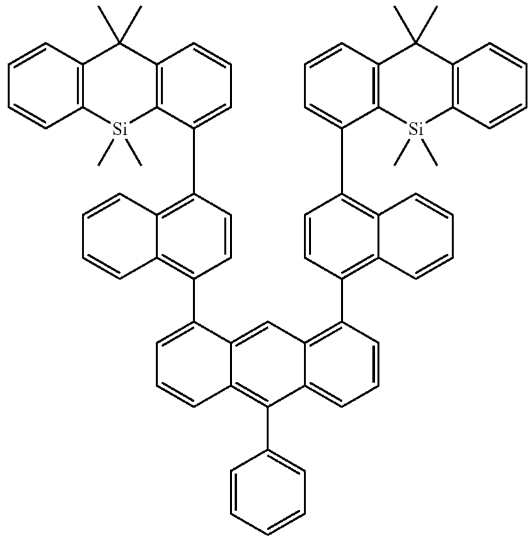
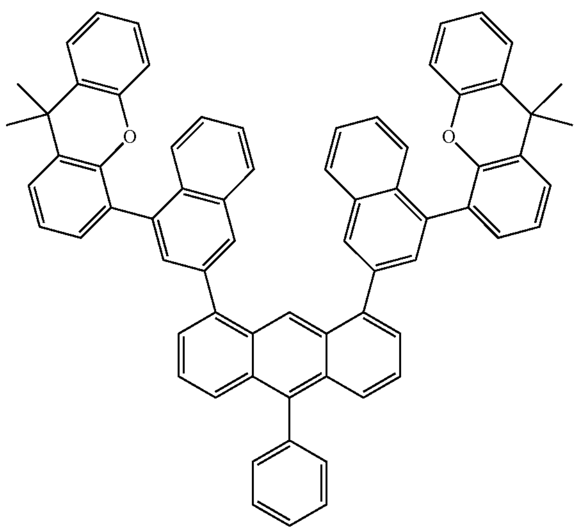
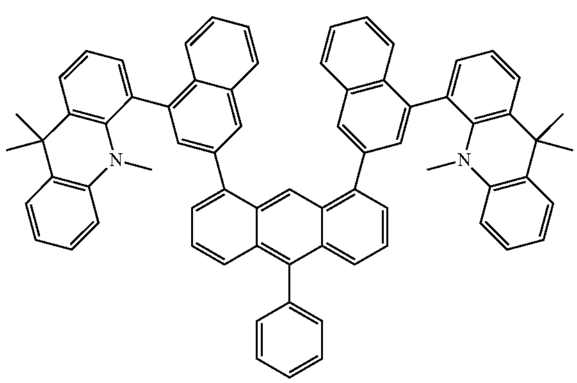
-continued
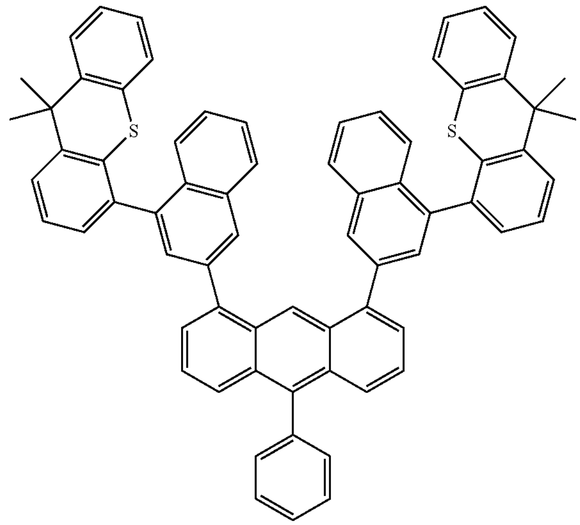
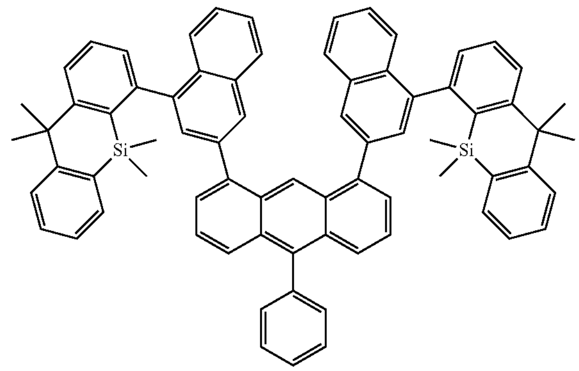
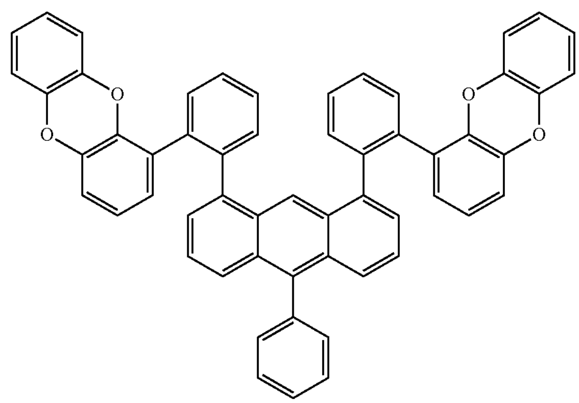
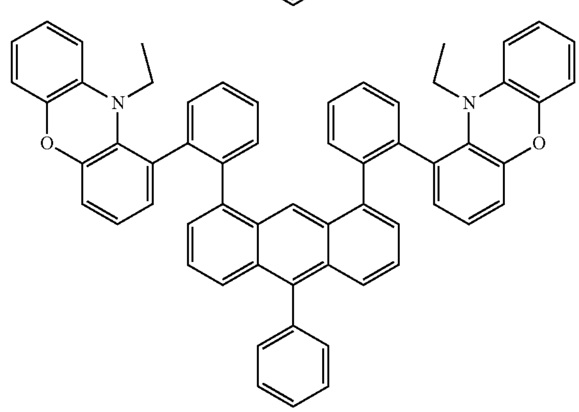

-continued
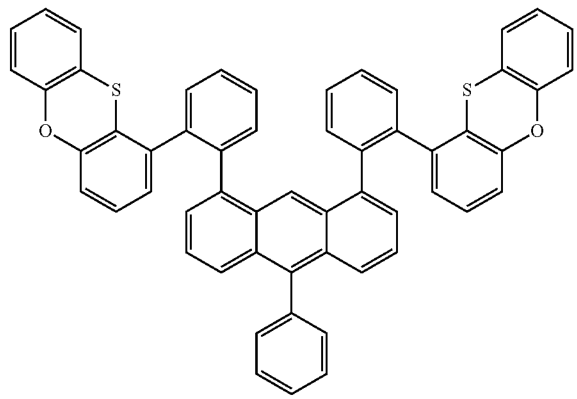
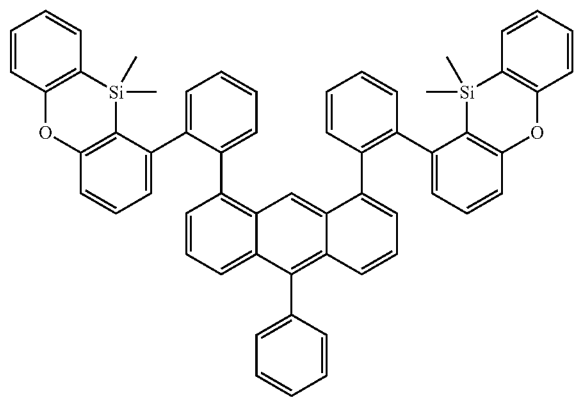
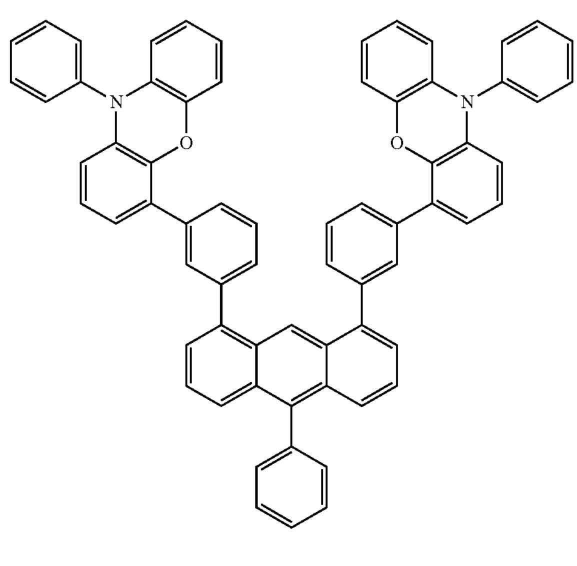
-continued
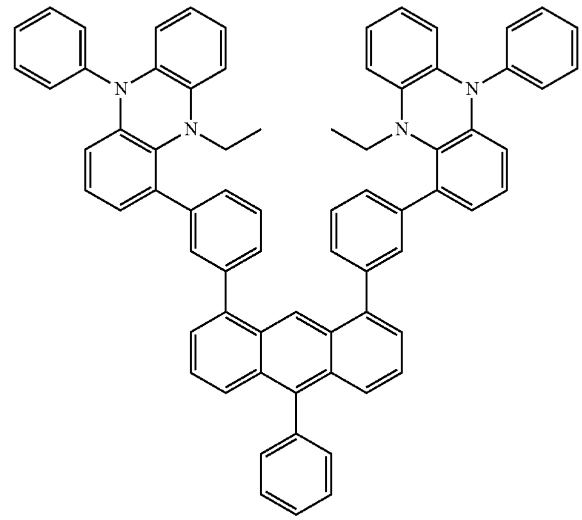
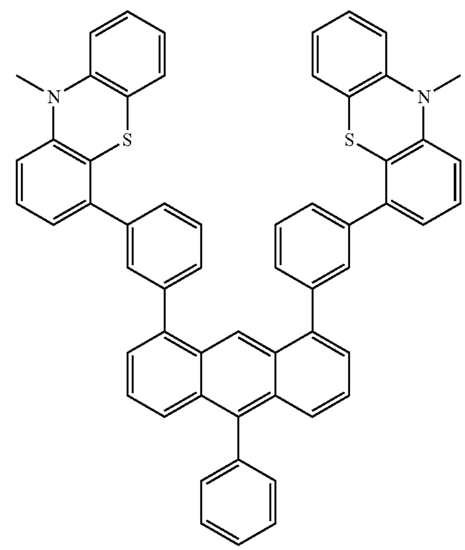
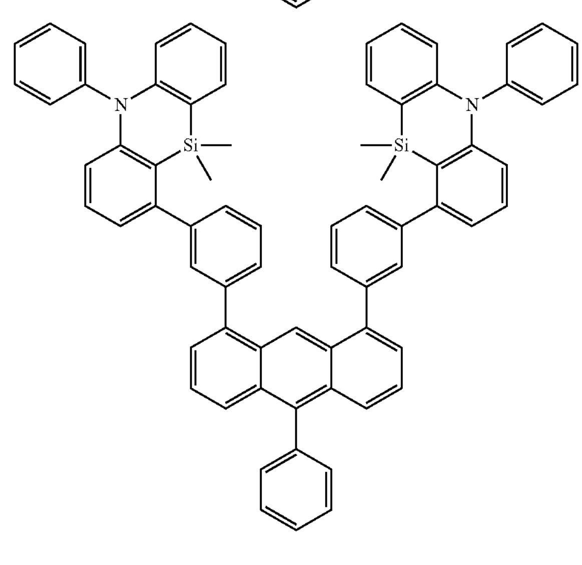

-continued
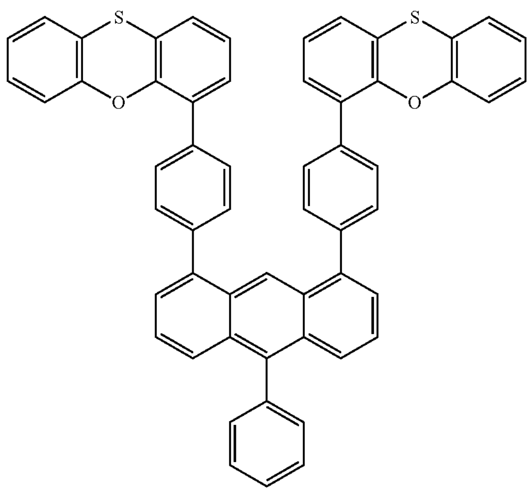
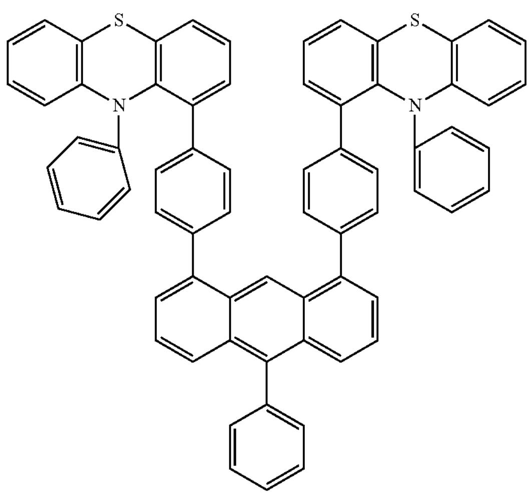
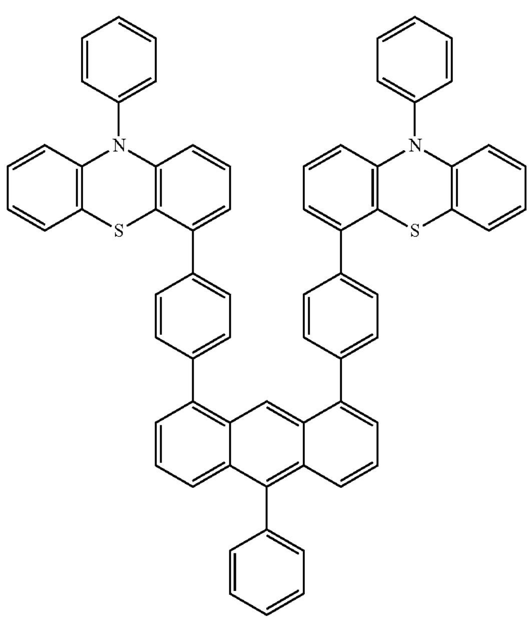
-continued
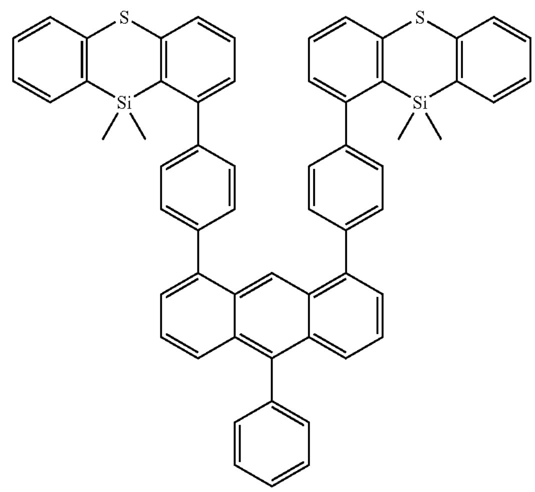
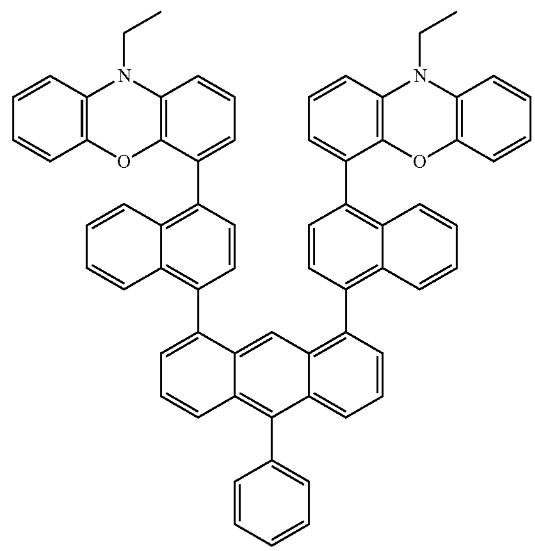
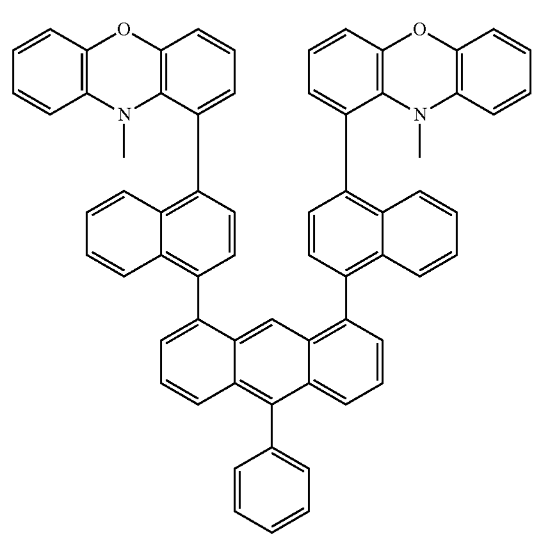

-continued
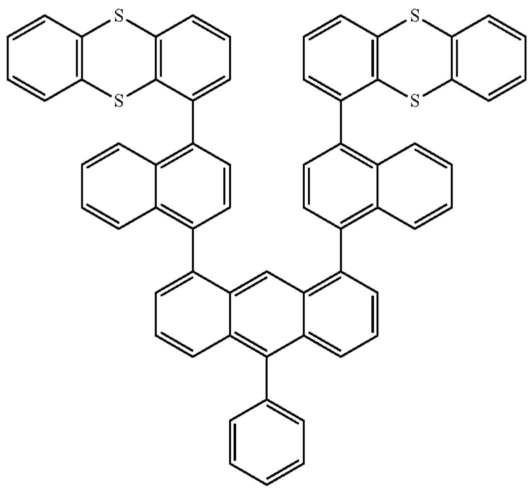
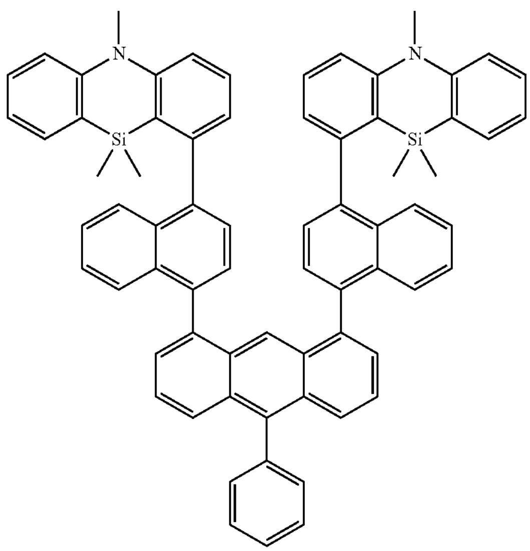
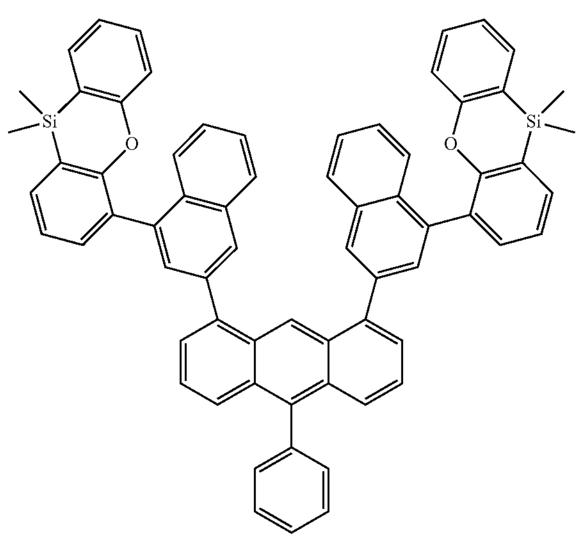
-continued
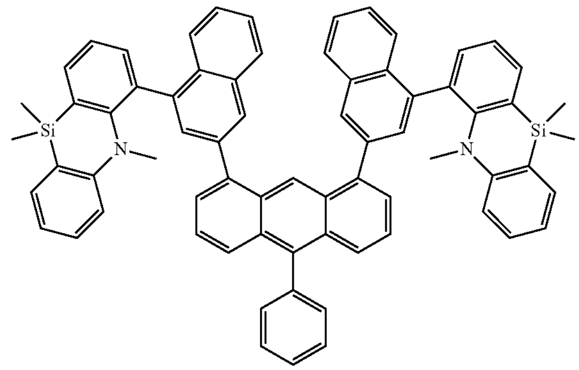
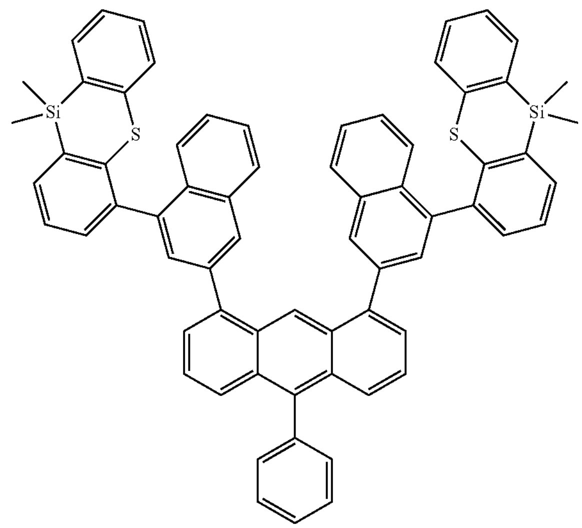
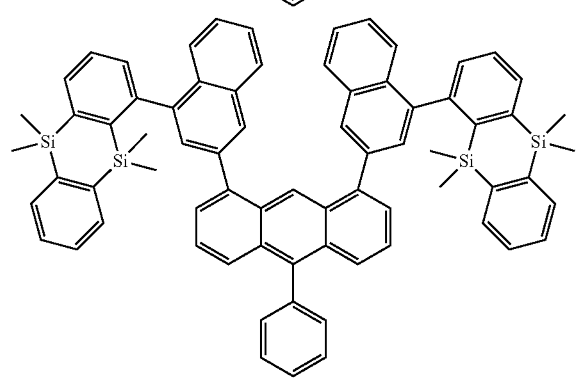
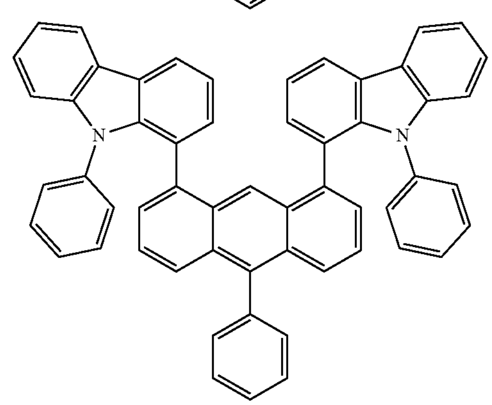

-continued
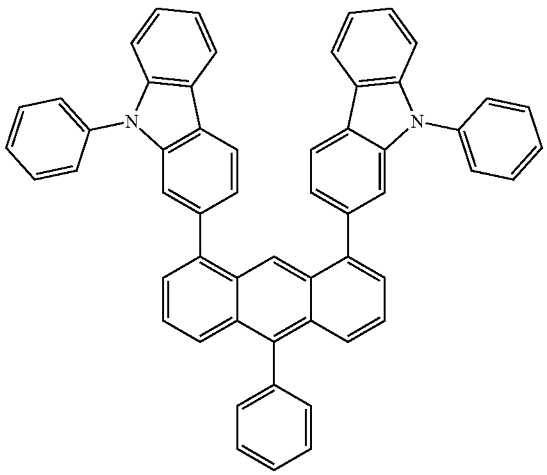
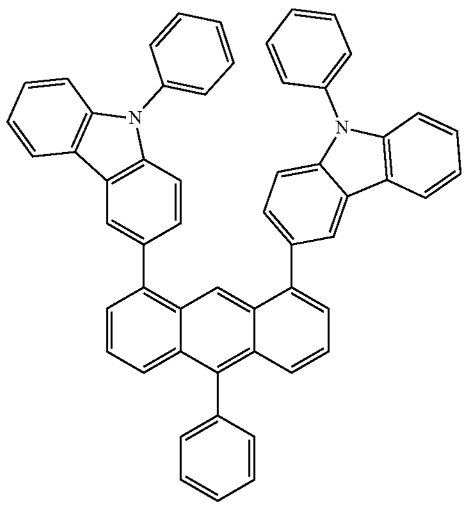
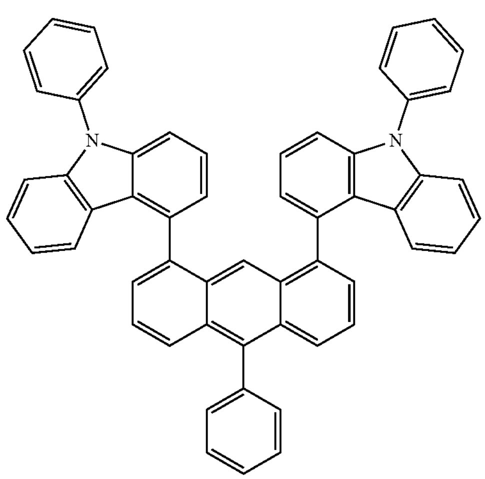
-continued
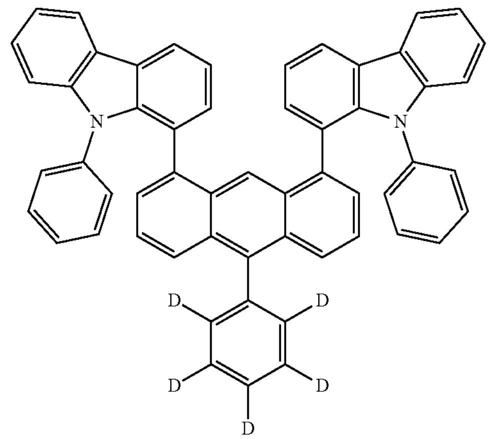
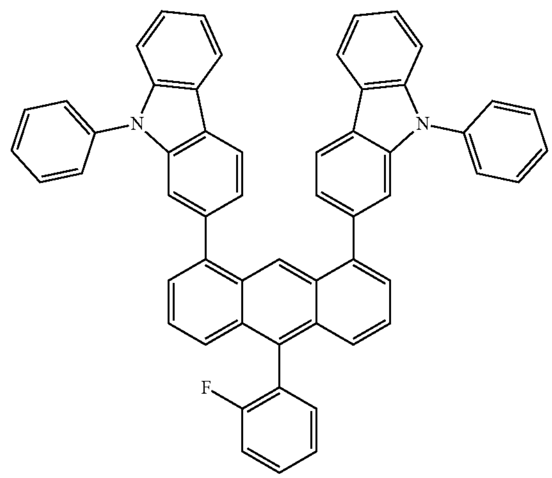
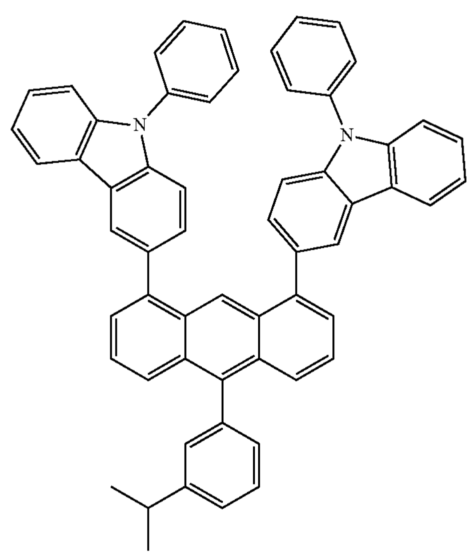

-continued
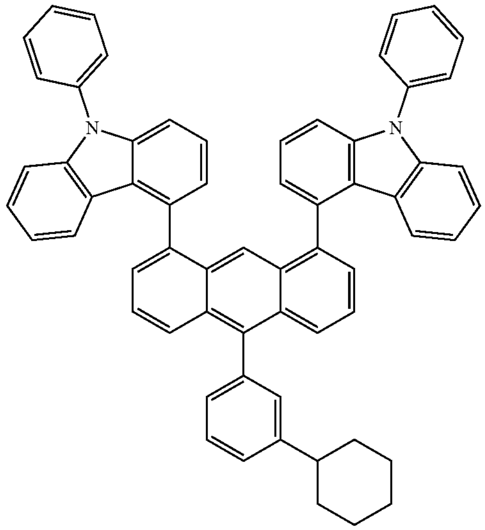
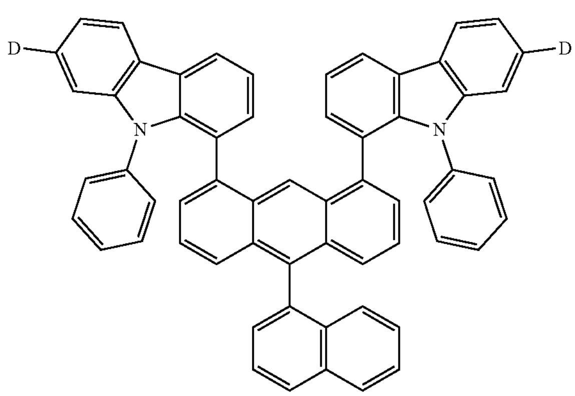
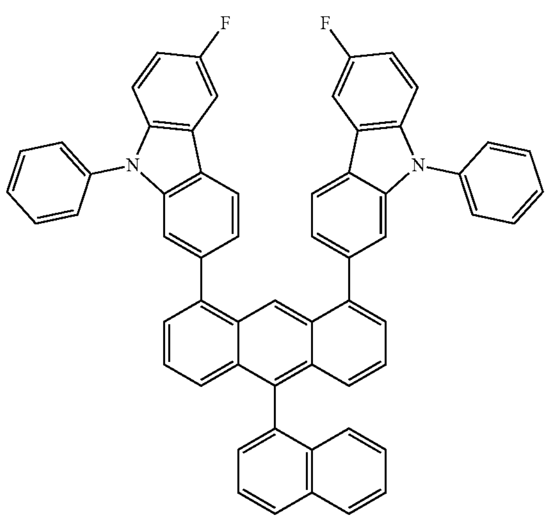
-continued
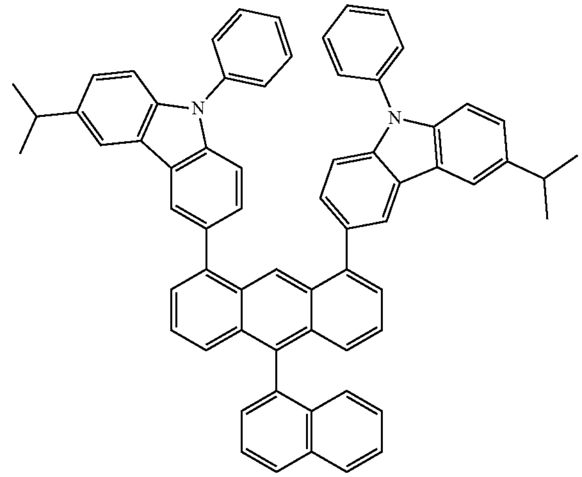
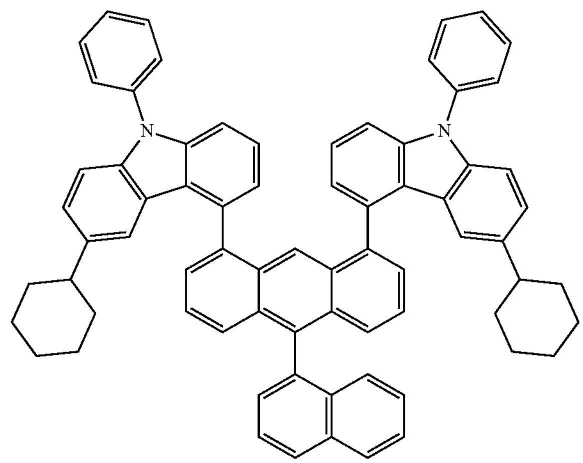
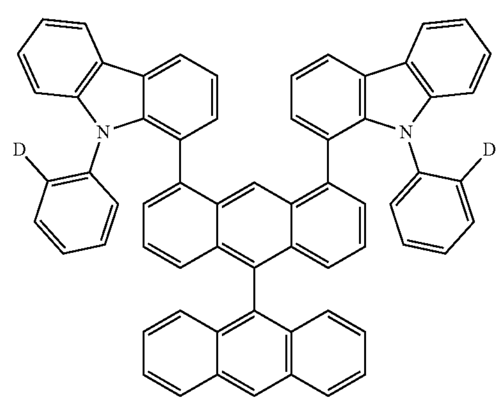

-continued
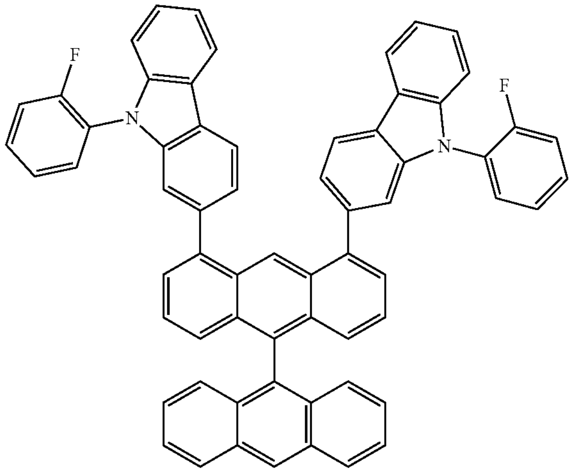
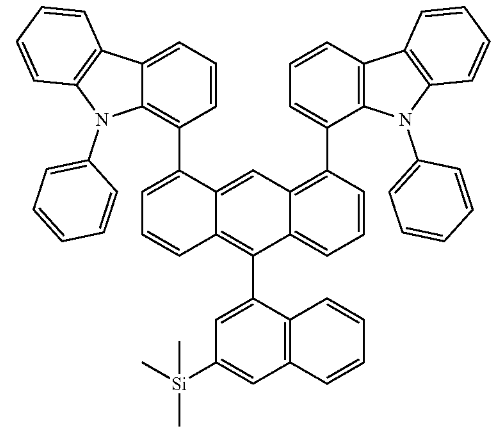
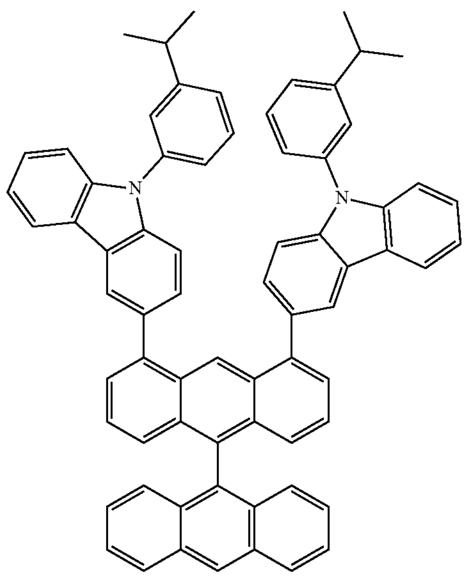
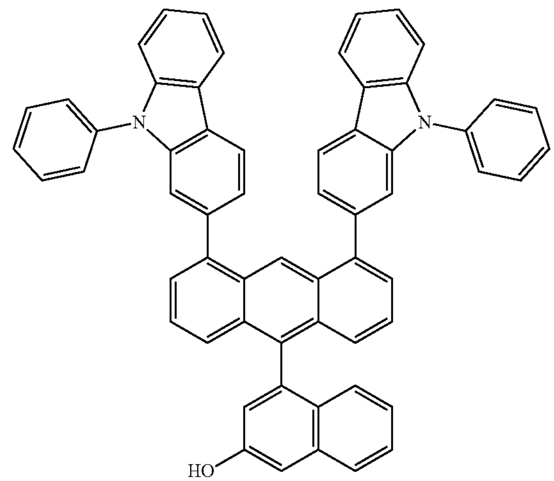
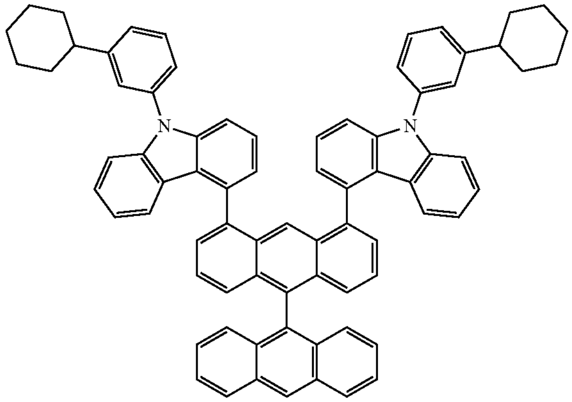
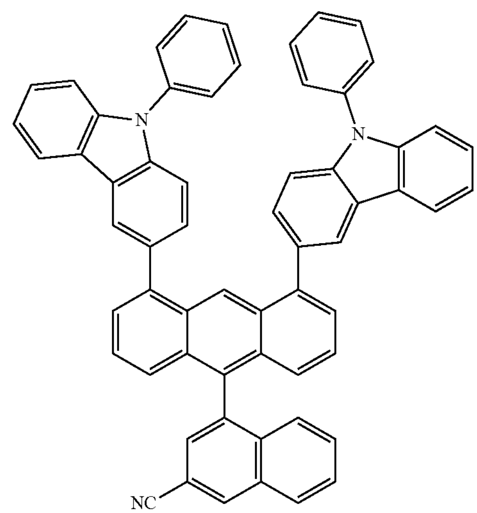

-continued
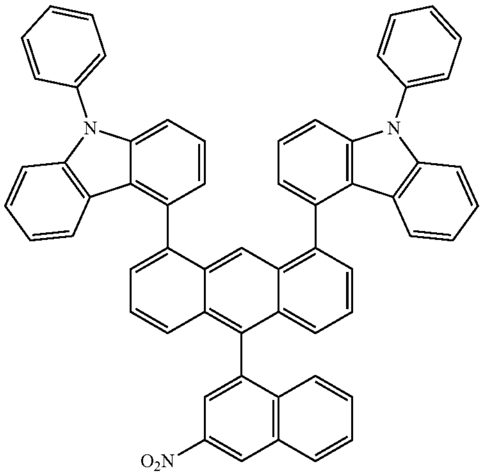
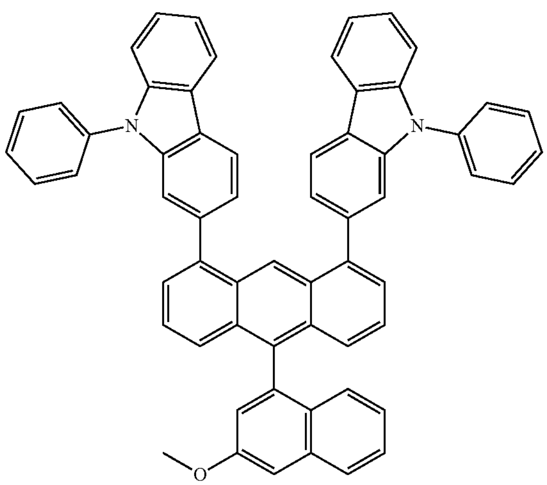
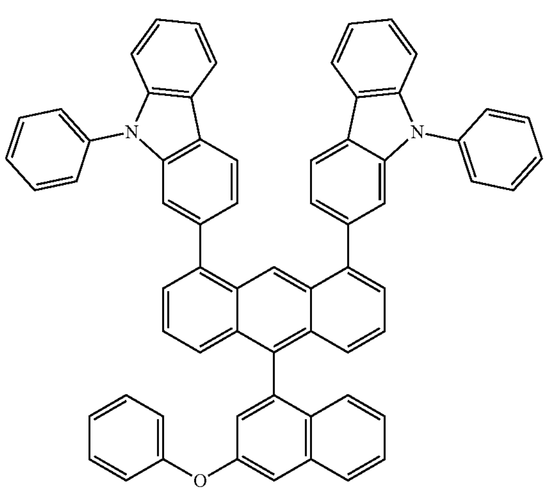
-continued
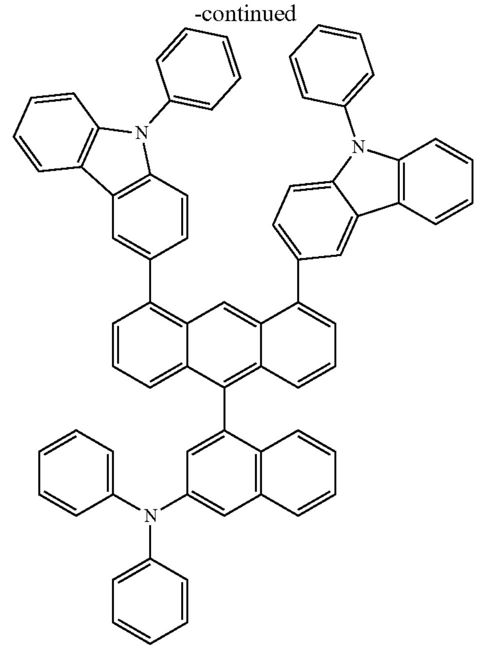
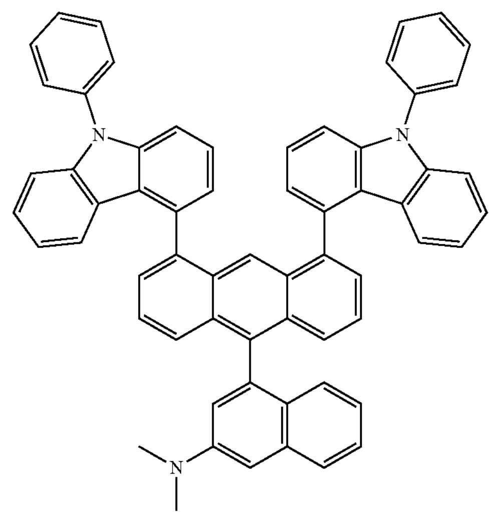
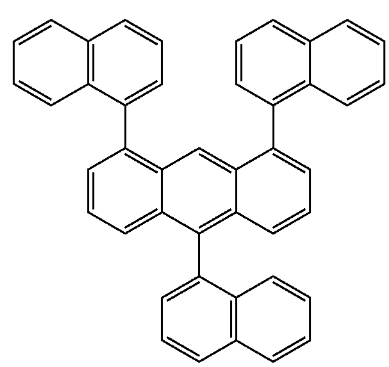

-continued
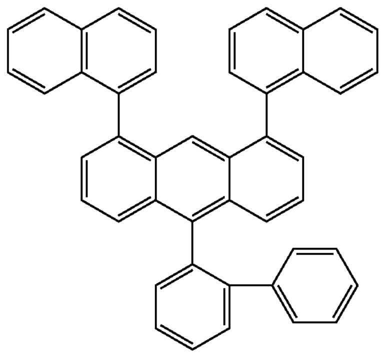
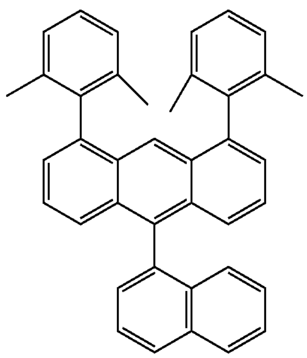
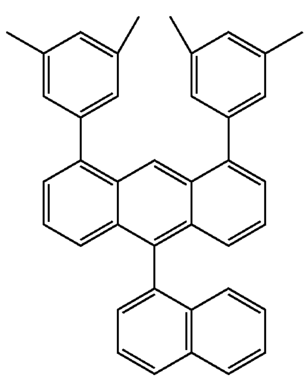
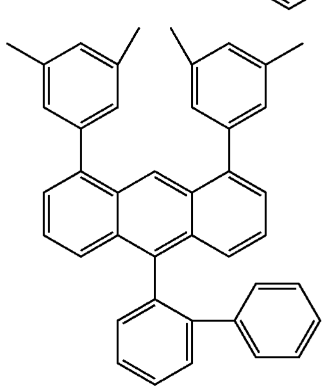
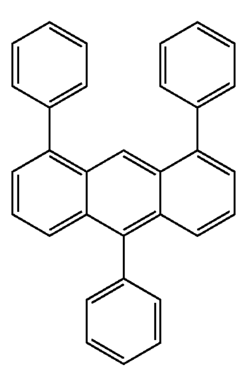
-continued
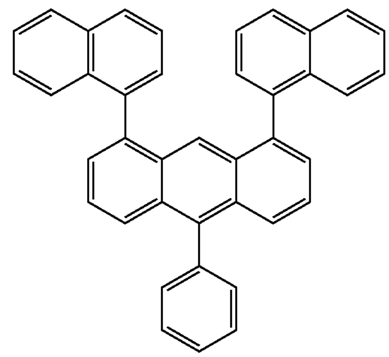
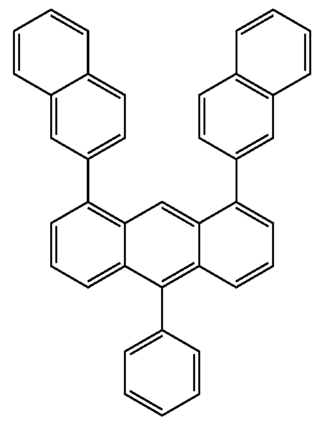
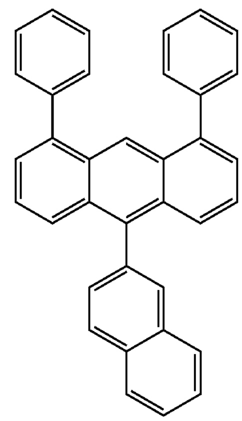
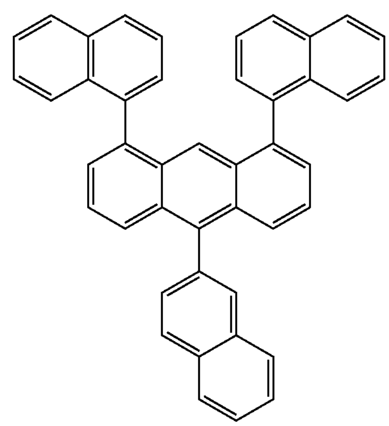
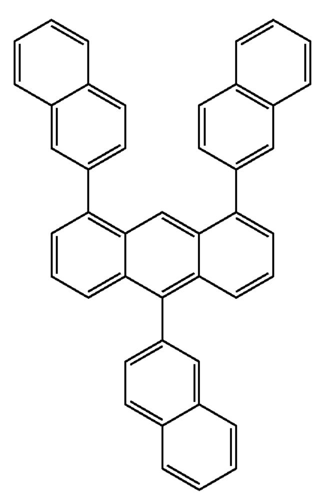
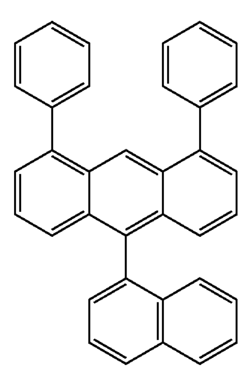

-continued
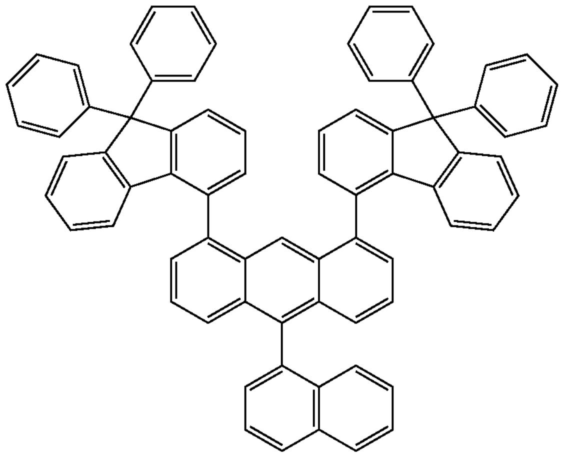
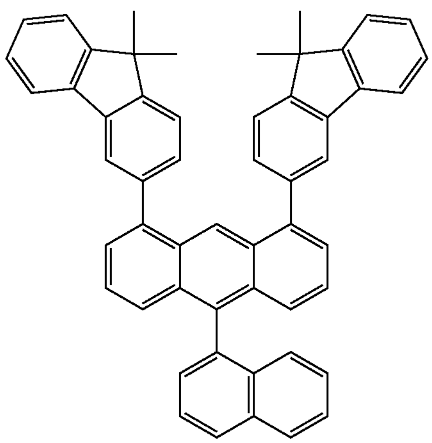
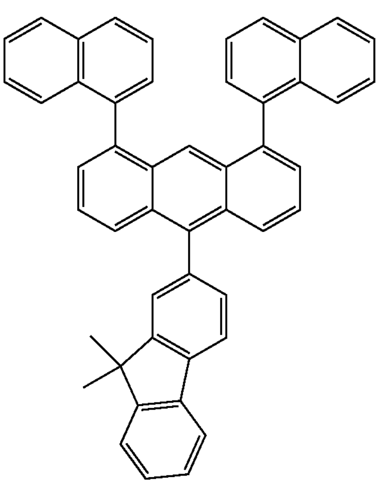
-continued
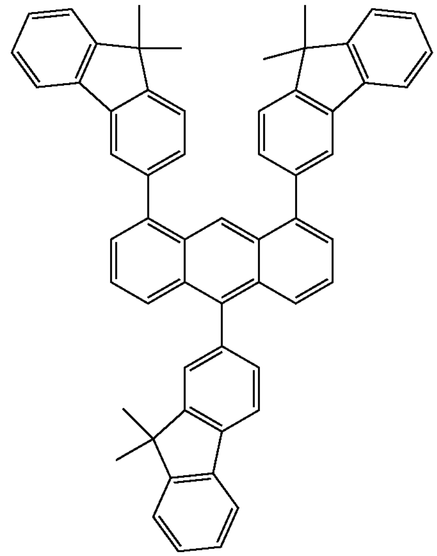
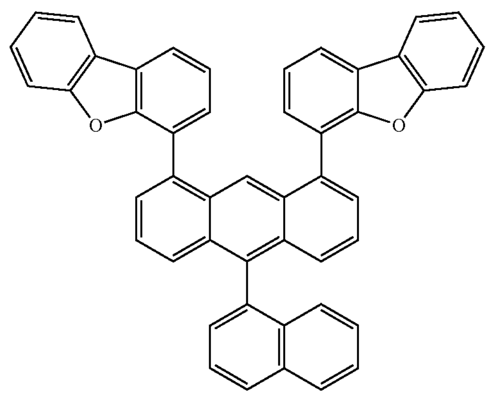
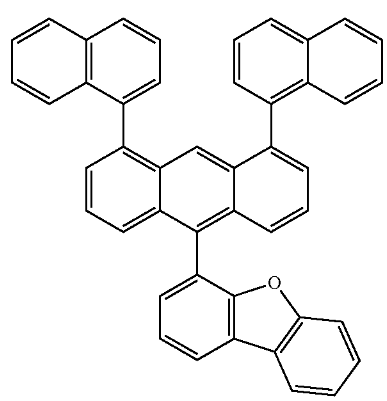

-continued
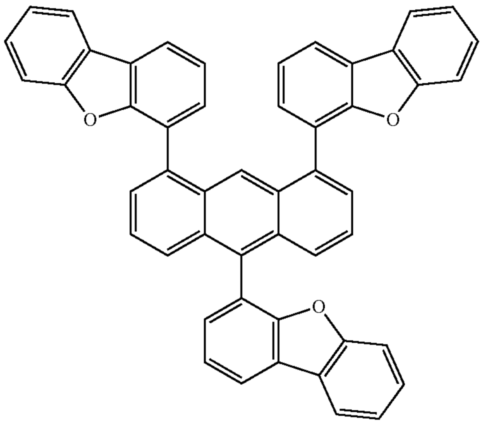
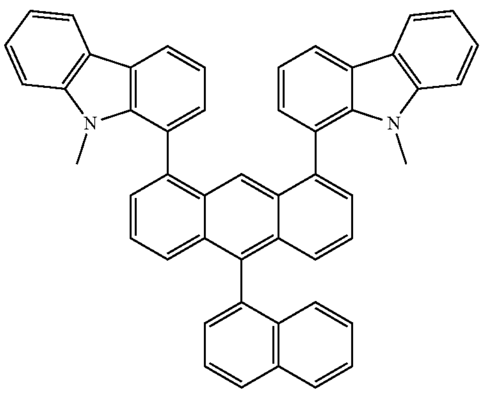
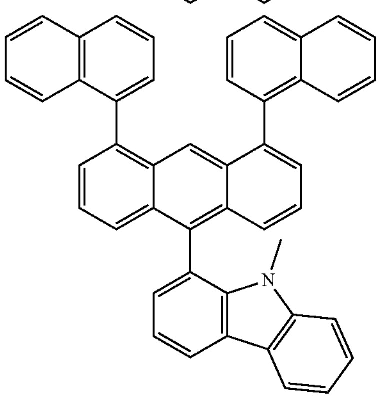
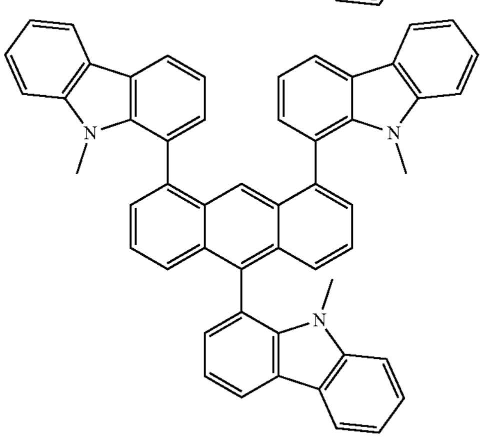
-continued
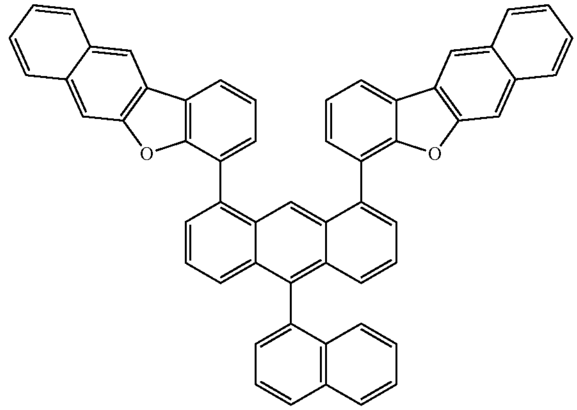
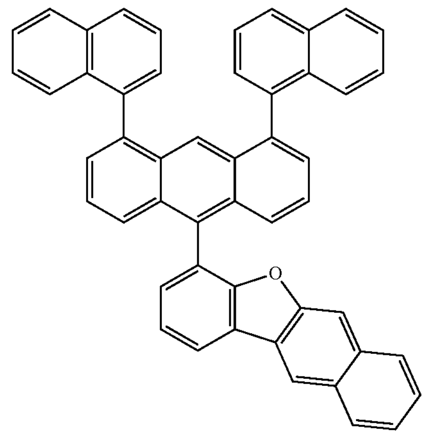
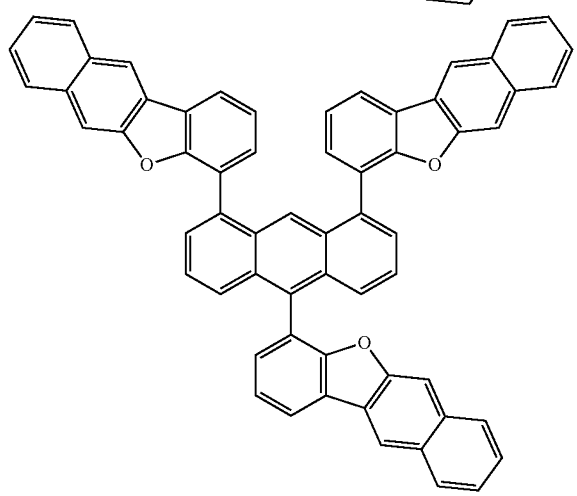
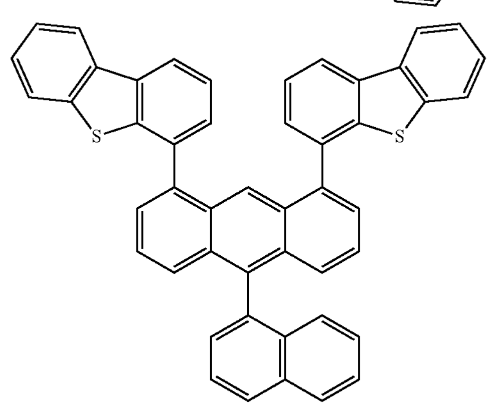

-continued
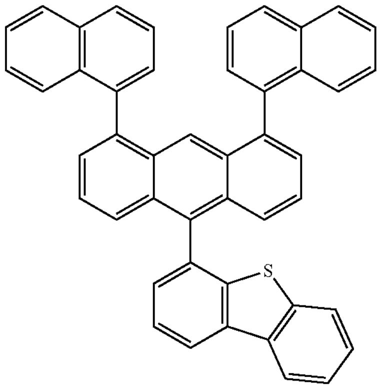
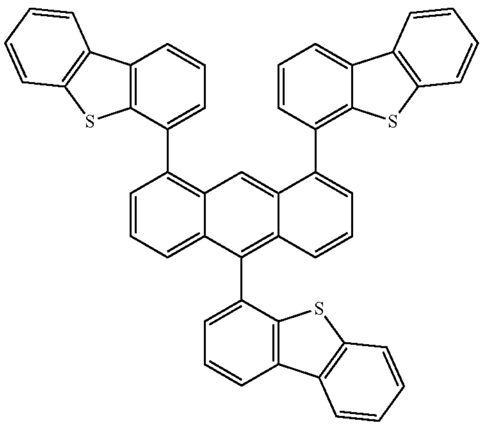
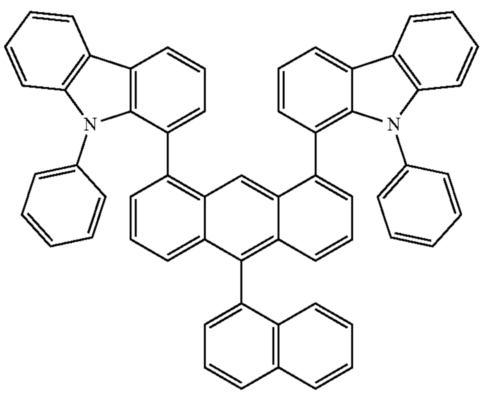
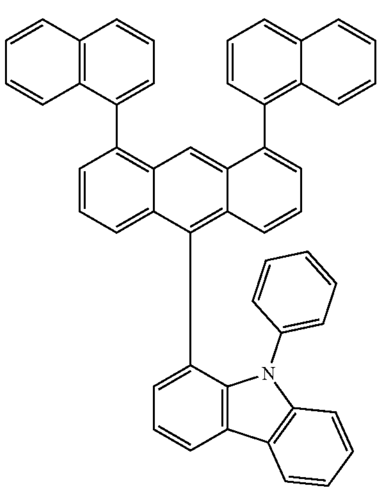
-continued
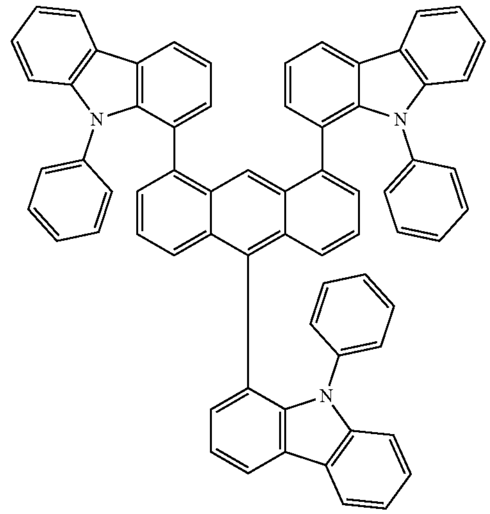
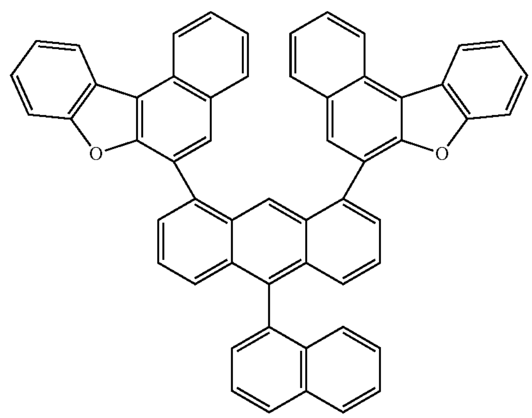
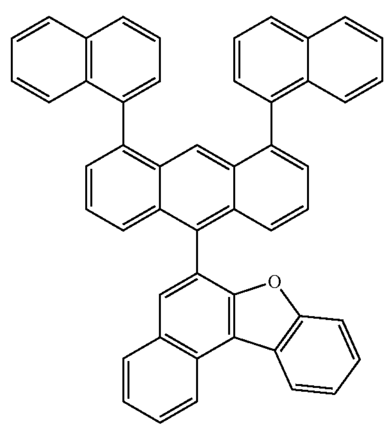

-continued
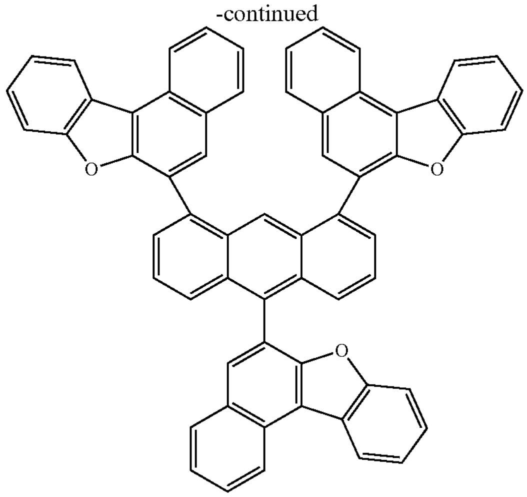
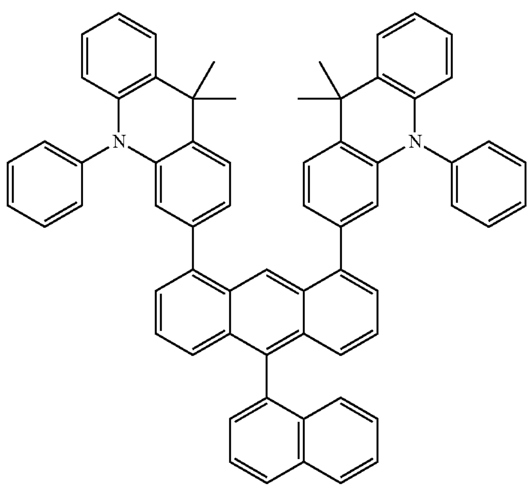
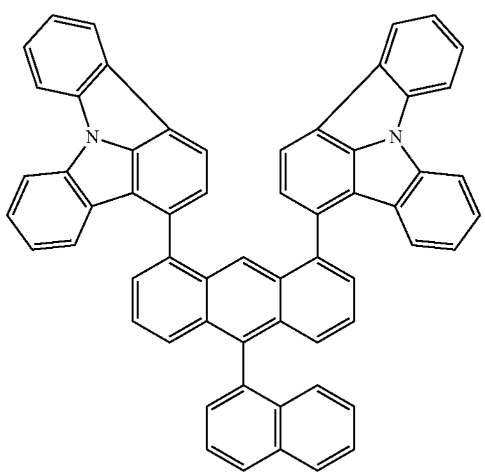
-continued
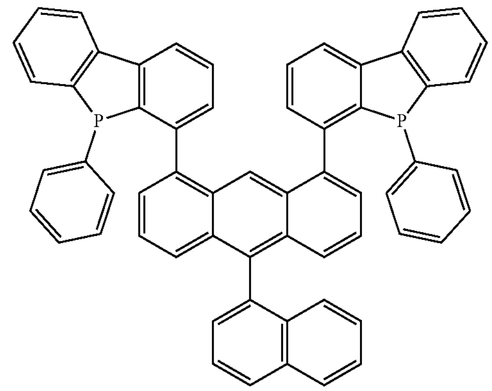
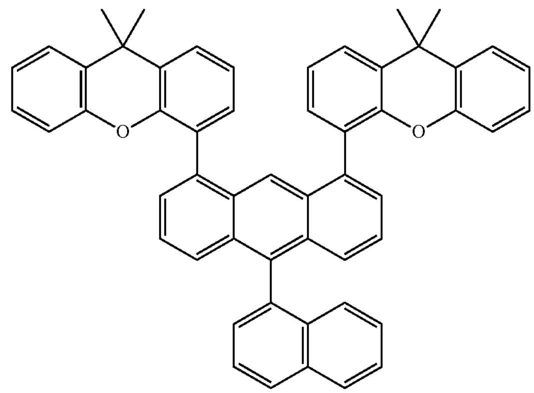
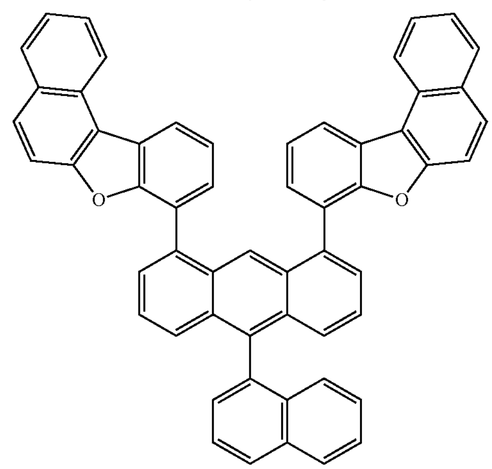
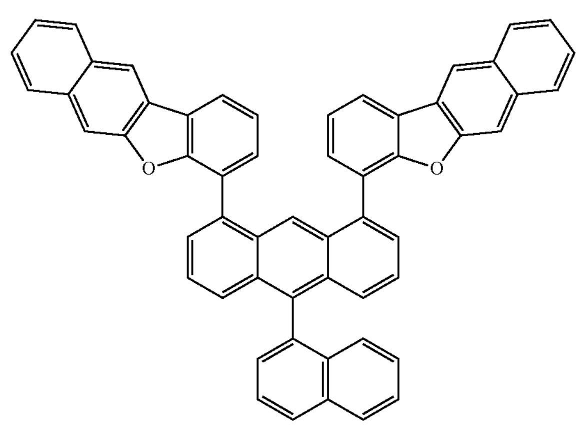

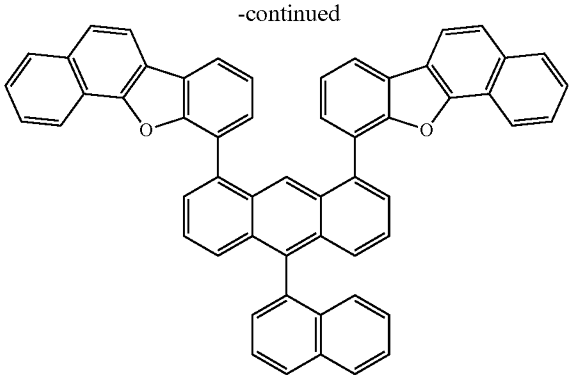
O
O
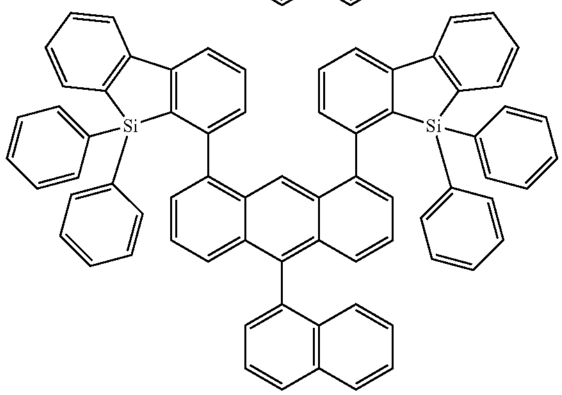
Si
Si
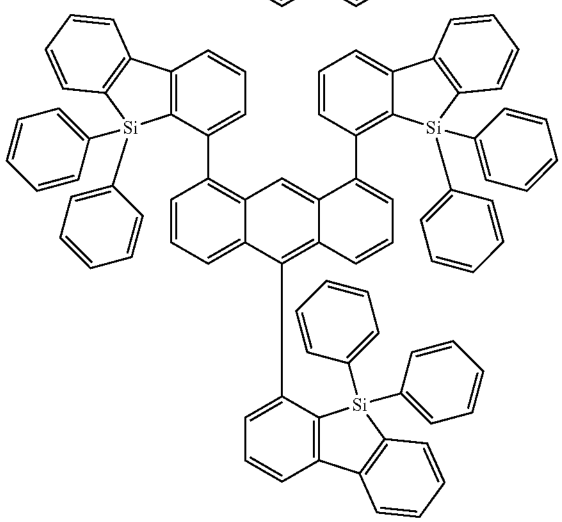
Si
Si
Si
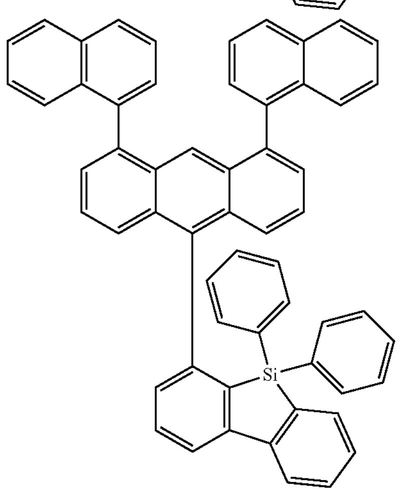
Si
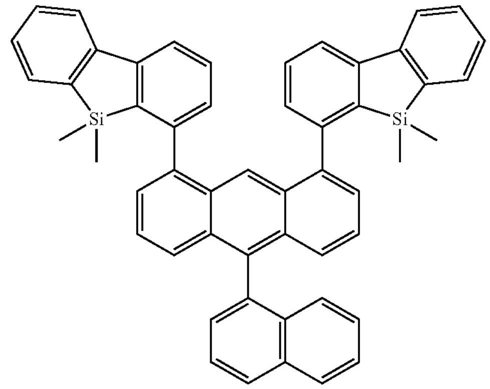
Si
Si
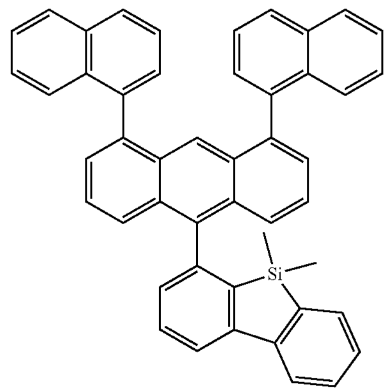
Si
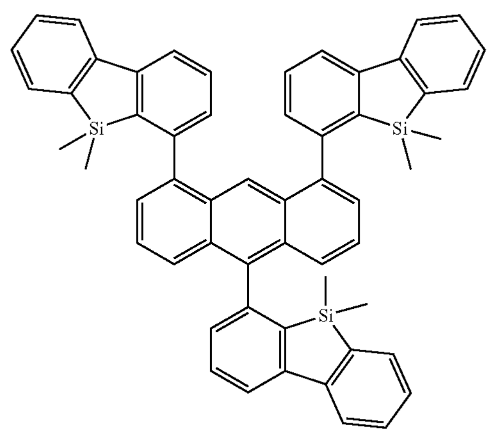
Si
Si
Si
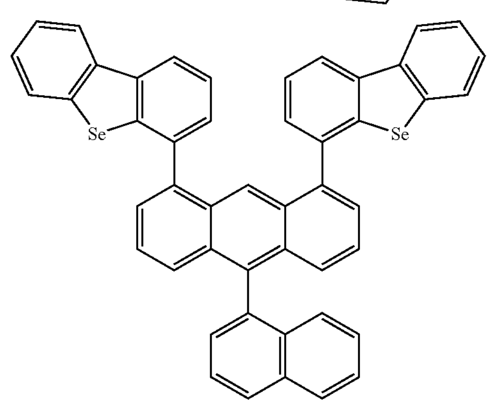
Se
Se -continued
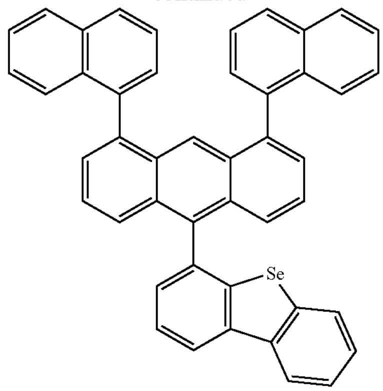
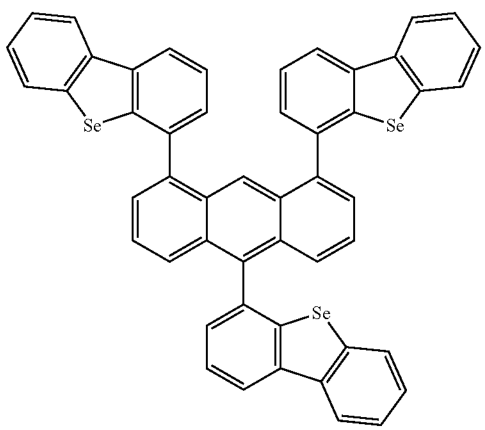
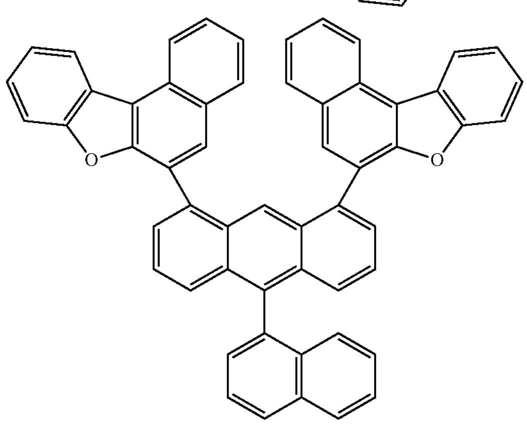
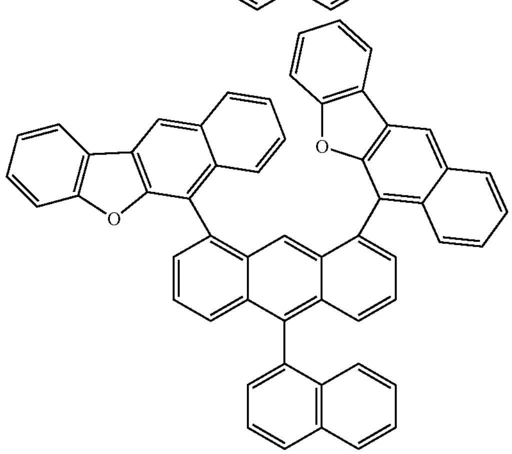
-continued
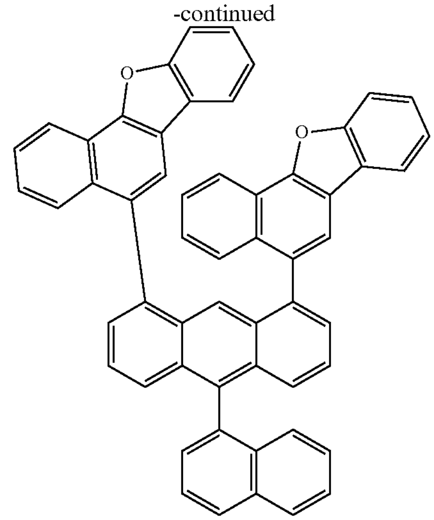
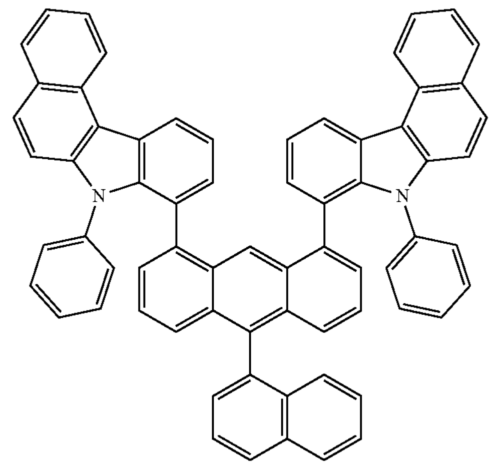
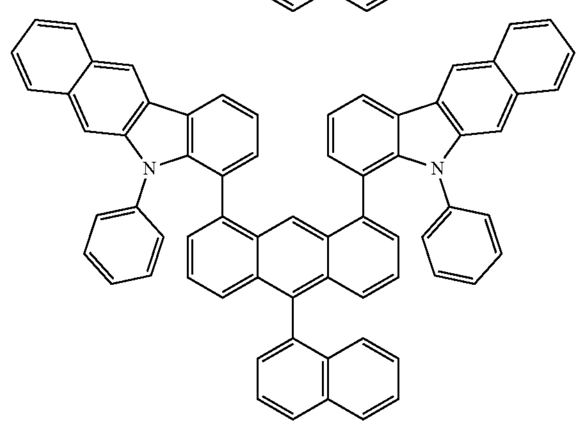
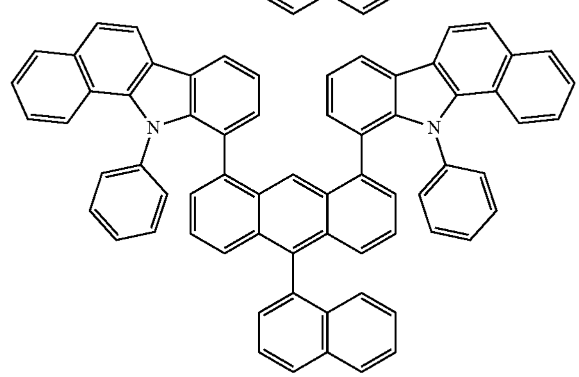

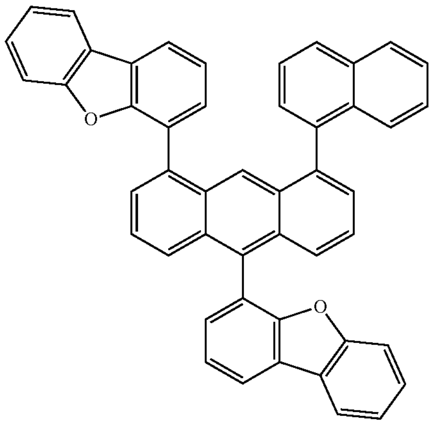
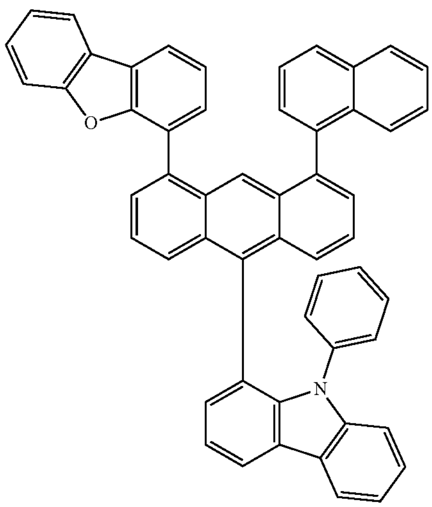
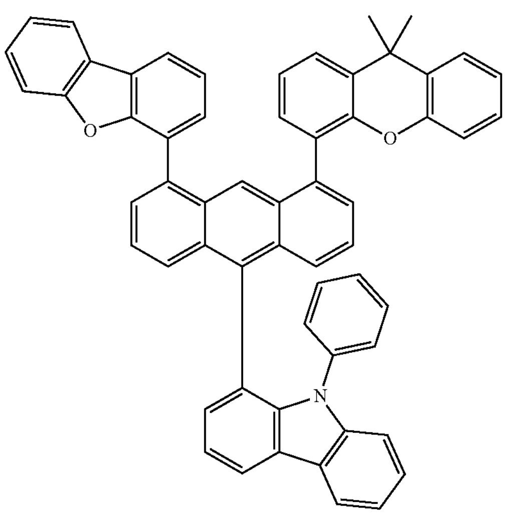
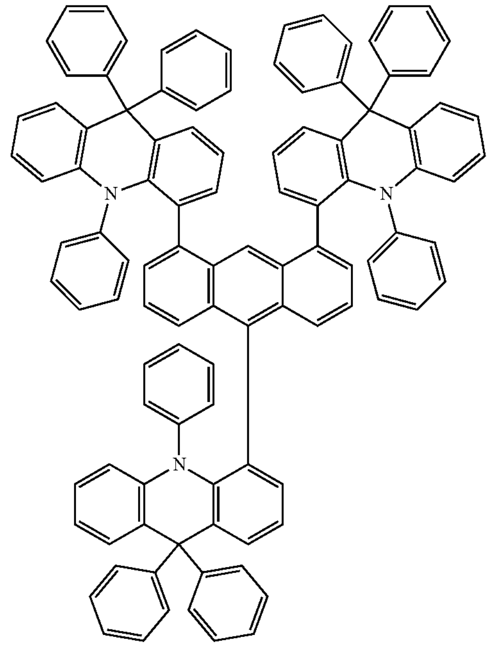
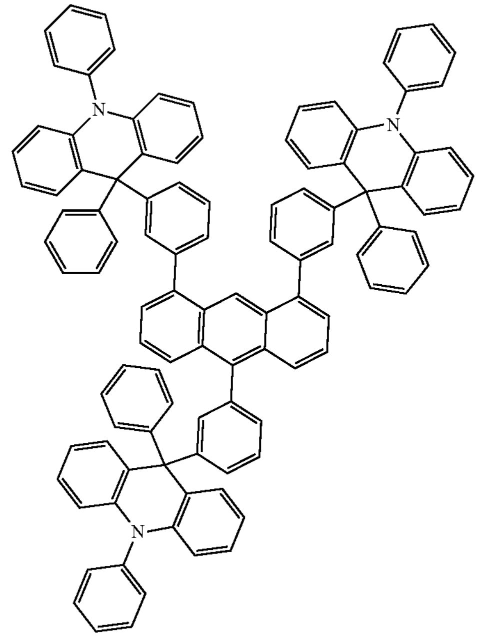
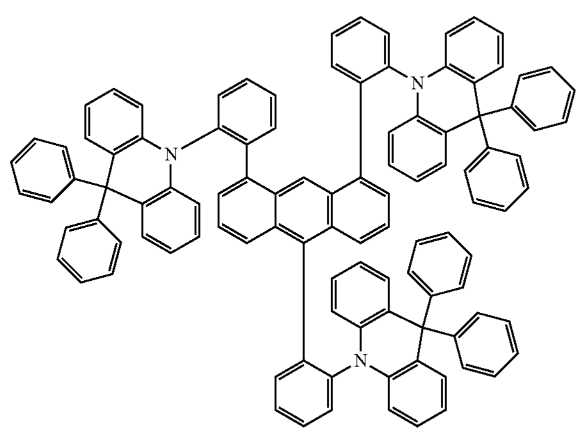

-continued
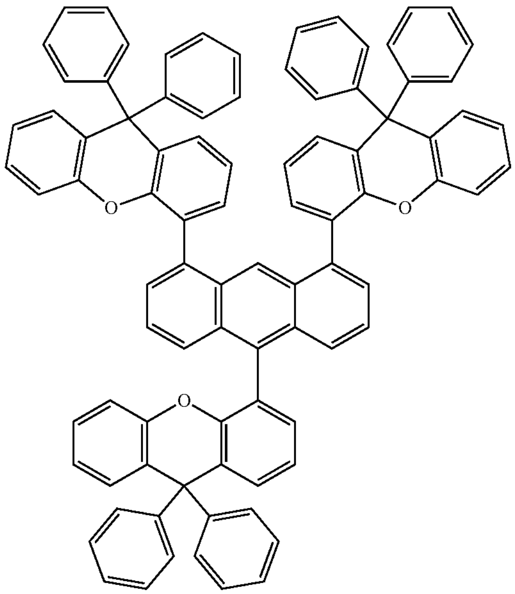
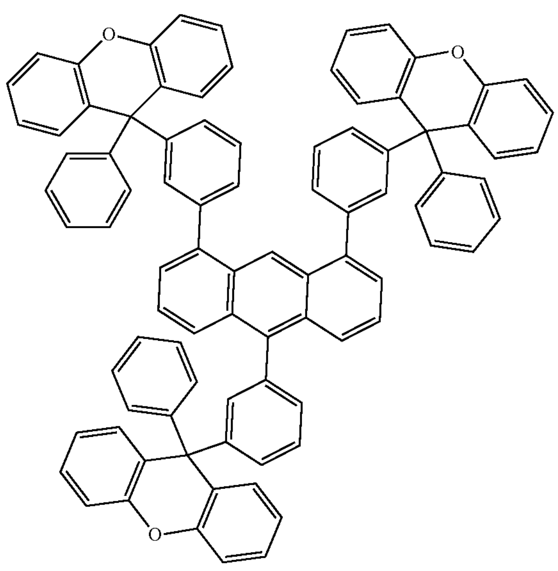
-continued
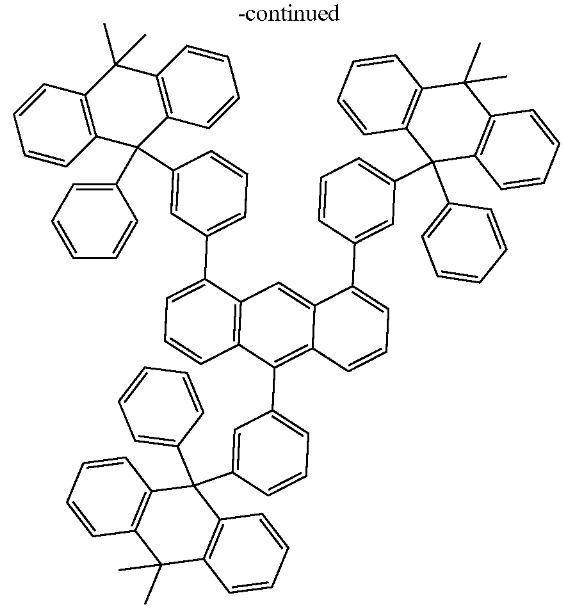
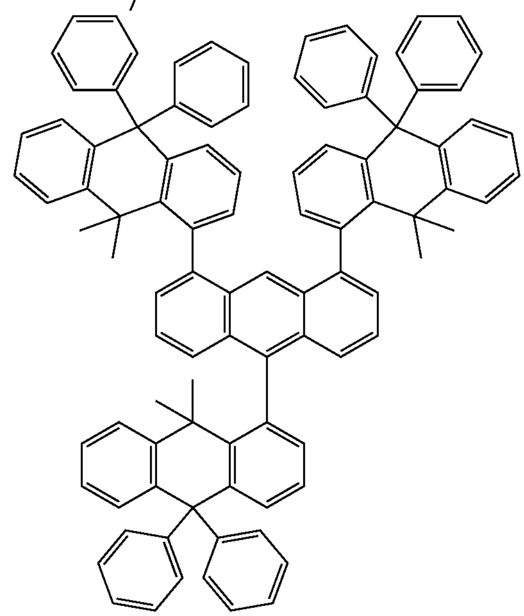
[Chemical Formula B]
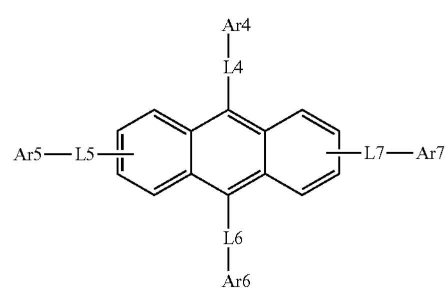
wherein in Chemical Formula B:
(a) Ar4 to Ar7 are the same as or different from each other, and each independently is hydrogen, an aryl group, or a substituted or unsubstituted tetracyclic or higher heterocyclic group, wherein at least one of Ar4 and Ar6 is a substituted or unsubstituted tetracyclic or higher heterocyclic group; and L4 to L7 are the same as or different from each other, and each independently is a direct bond, a substituted or unsubstituted arylene group, or a substituted or unsubstituted divalent heterocyclic group; or (b) Ar4 to Ar7 are the same as or different from each other, and each independently is hydrogen, an unsubstituted aryl group, or a substituted or unsubstituted tetracyclic or higher heterocyclic group; and L4 to L7 are the same as or different from each other, and each independently is a direct bond, a phenylene group or a naphthylene group;

[Chemical Formula C]

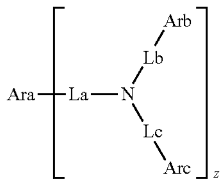

wherein in Chemical Formula C:

Ara to Arc are the same as or different from each other, and each independently is a substituted or unsubstituted aryl group, or a substituted or unsubstituted heterocyclic group;

La to Lc are the same as or different from each other, and each independently is a direct bond, a substituted or unsubstituted arylene group, or a substituted or unsubstituted divalent heterocyclic group; and z is an integer of 1 to 3, and when z is an integer of 2 or greater, structures in the parentheses are the same as or different from each other;

[Chemical Formula D]

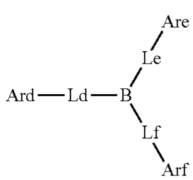

wherein in Chemical Formula D:

Ard to Arf are the same as or different from each other, and each independently is a substituted or unsubstituted aryl group, or a substituted or unsubstituted heterocyclic group, or adjacent groups bond to each other to form a substituted or unsubstituted ring; and Ld to Lf are the same as or different from each other, and each independently is a direct bond, a substituted or unsubstituted arylene group, or a substituted or unsubstituted divalent heterocyclic group.

3. The organic light emitting device of claim 2, wherein, in Chemical Formula B, L4 to L7 are the same as or different from each other, and each independently is a direct bond, a phenylene group or a naphthylene group.

4. The organic light emitting device of claim 2, wherein, in Chemical Formula B, Ar4 and Ar6 are the same as or different from each other, and each independently is an aryl group having 6 to 60 carbon atoms that is unsubstituted or substituted with hydrogen, deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group; or a substituted or unsubstituted heterocyclic group including at least one of O, S, Se, Ge, N, P and Si as a heteroatom.

5. The organic light emitting device of claim 2, wherein, in Chemical Formula B, at least one of Ar4 and Ar6 is a substituted or unsubstituted heterocyclic group including at least one of O, S, Se, Ge, N, P and Si as a heteroatom.

6. The organic light emitting device of claim 2, wherein Chemical Formula B is one compound selected from among the following compounds:

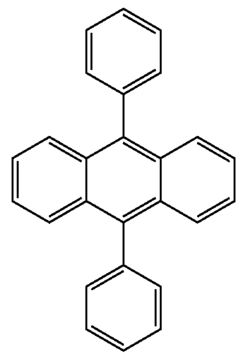

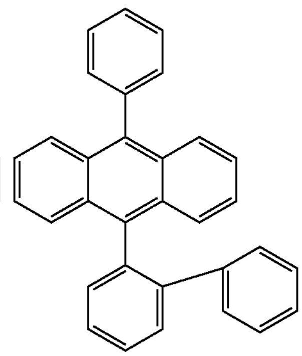

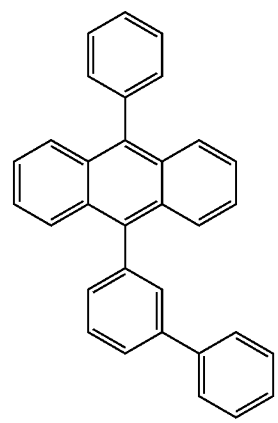

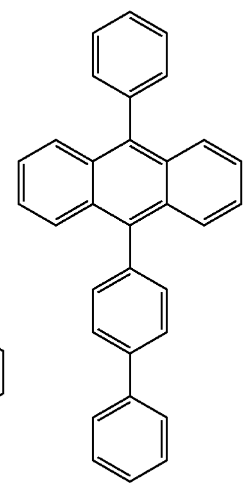

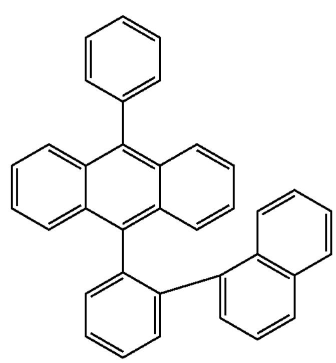

-continued
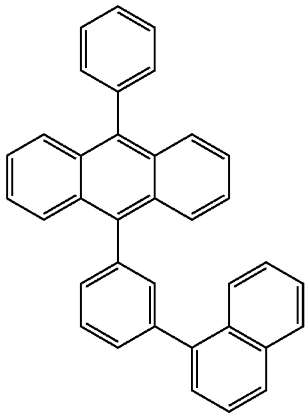
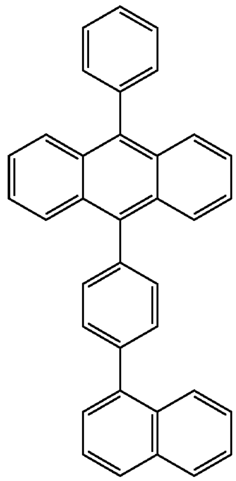
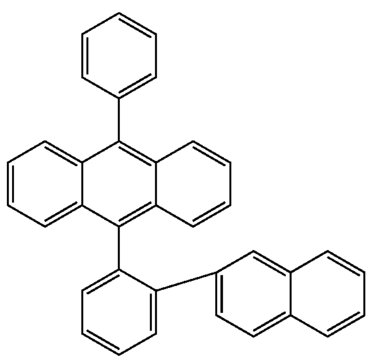
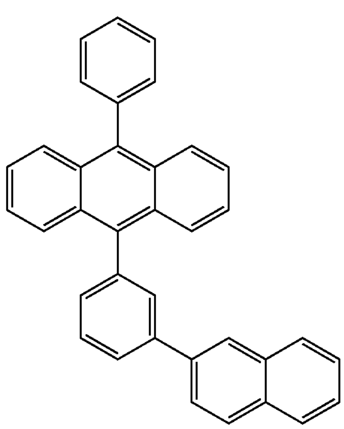
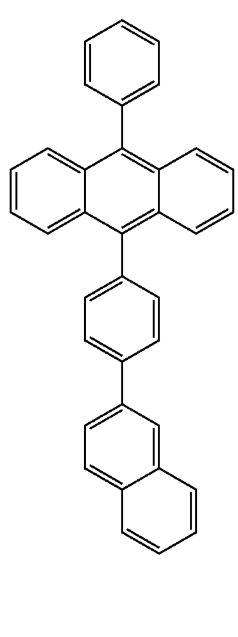
-continued
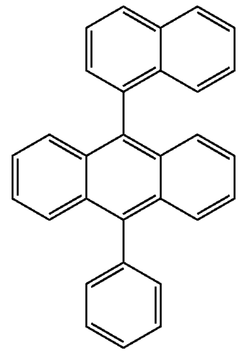
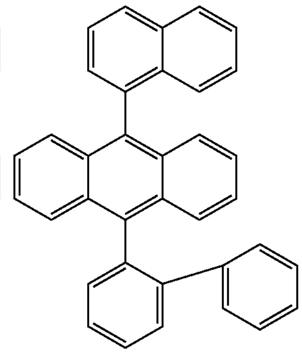
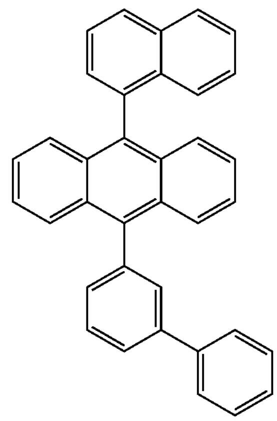
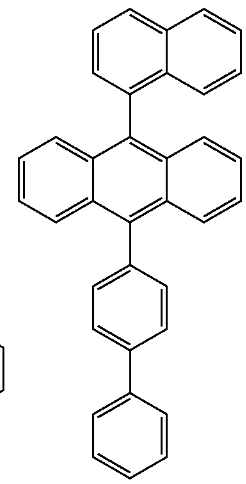
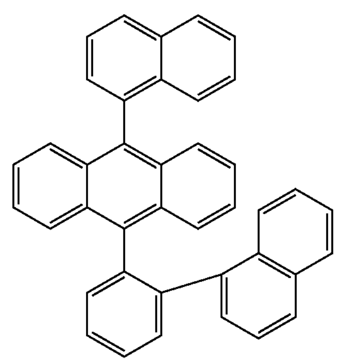
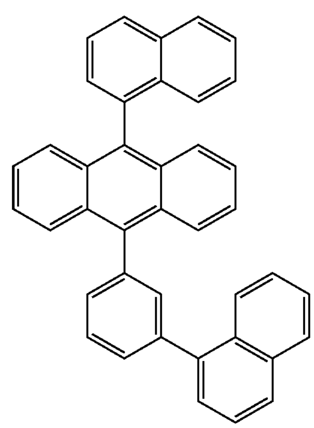
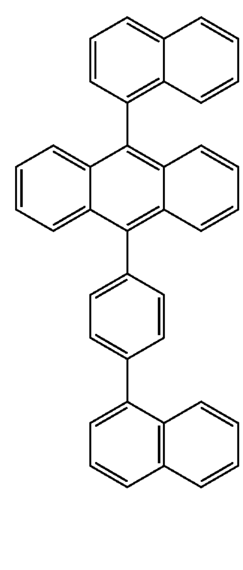

-continued
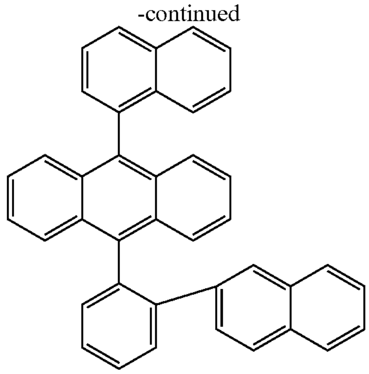
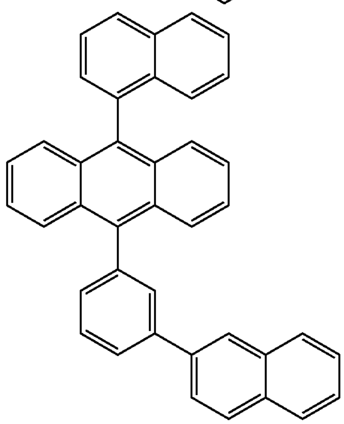
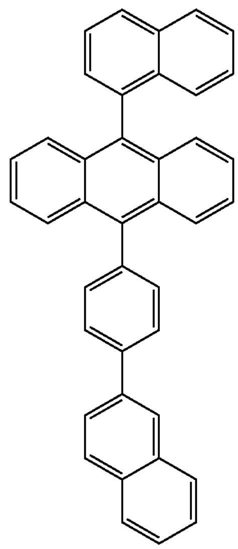
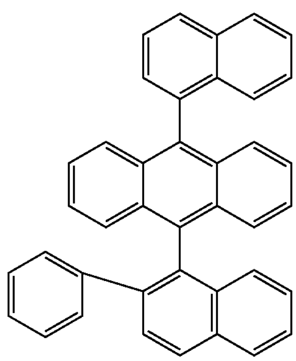
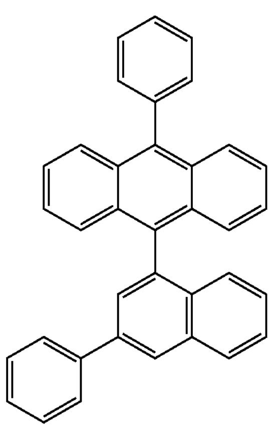
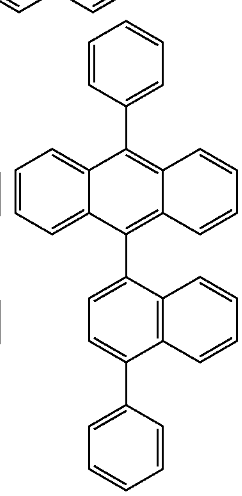
-continued
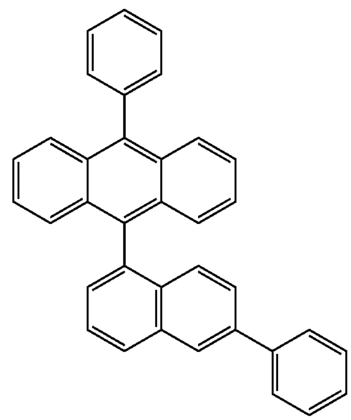
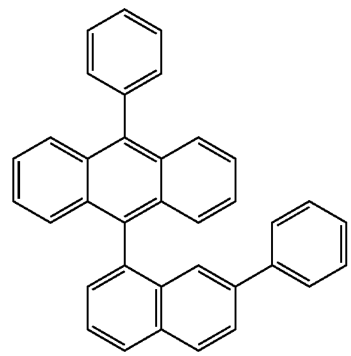
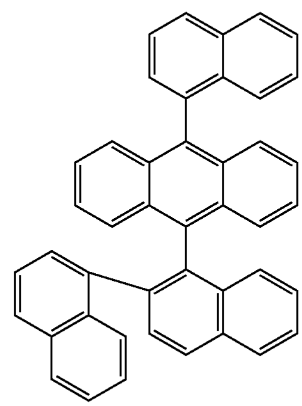
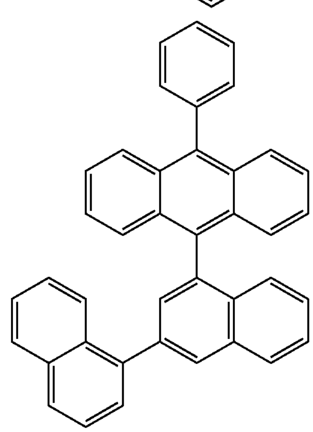
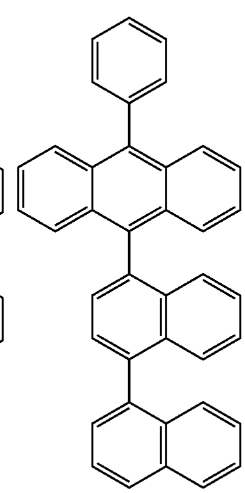

-continued
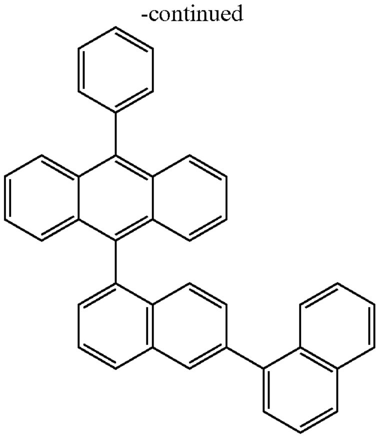
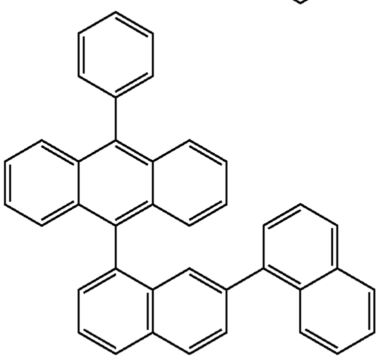
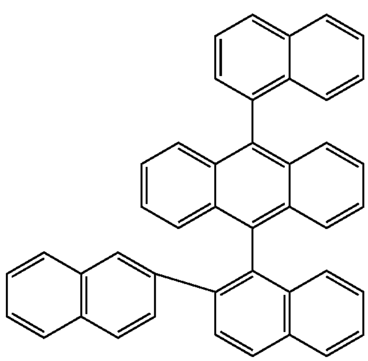
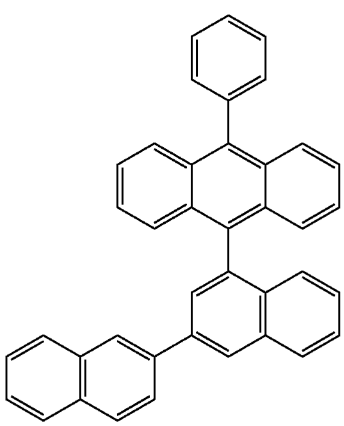
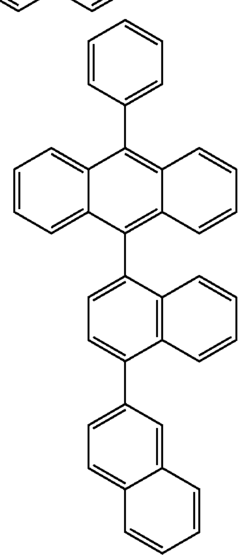
-continued
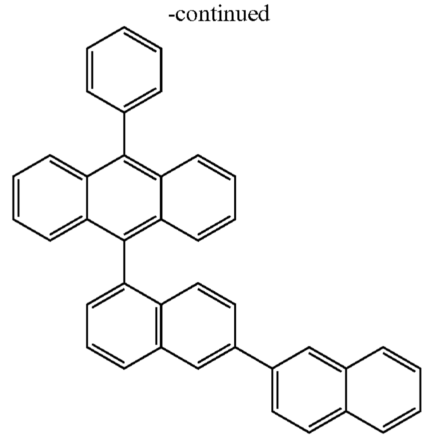
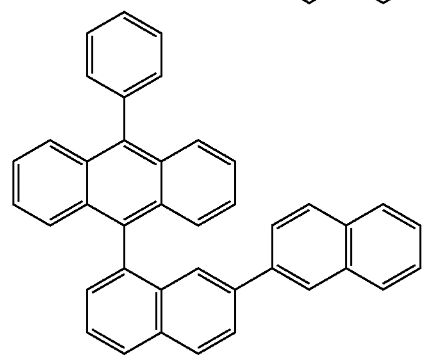
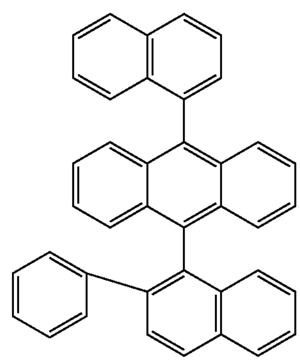
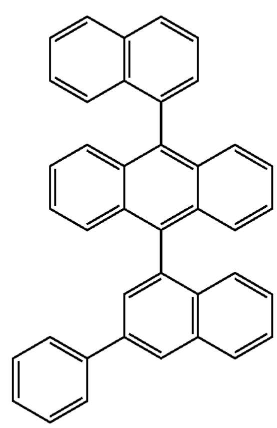
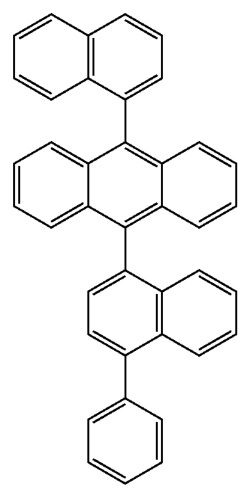

-continued
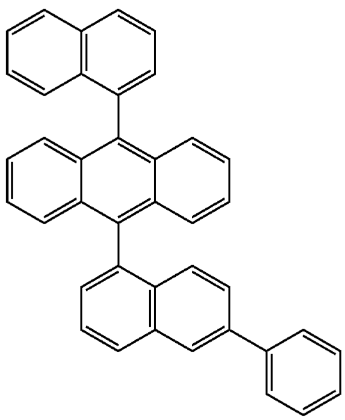
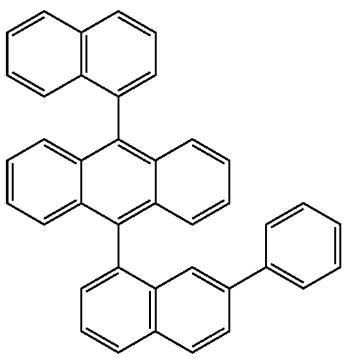
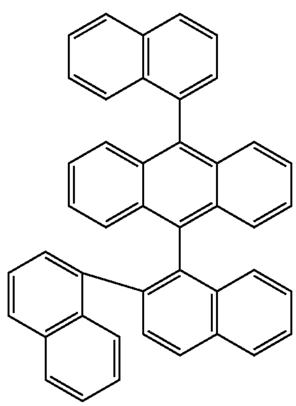
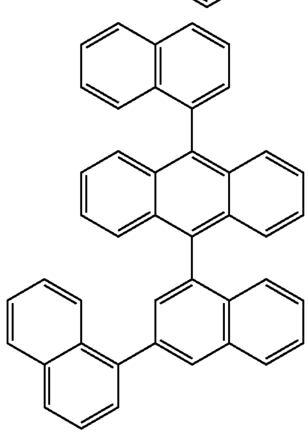
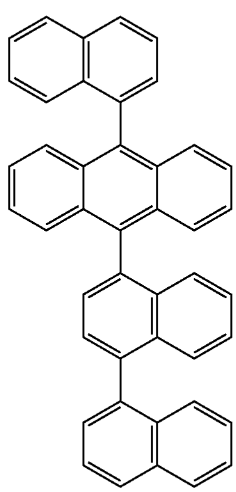
-continued
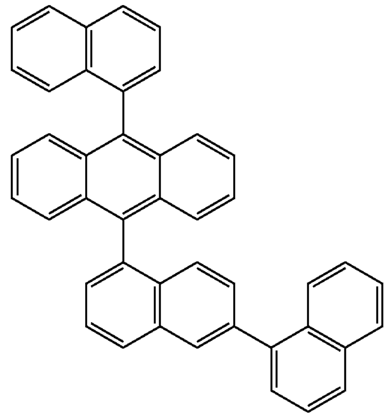
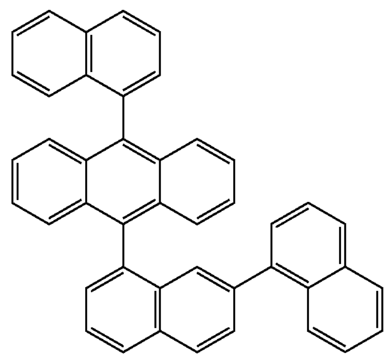
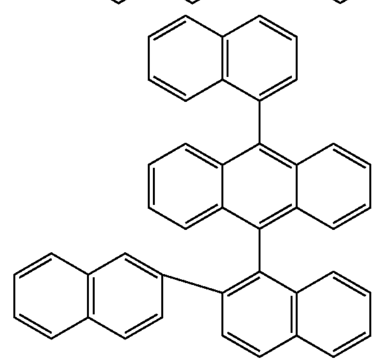
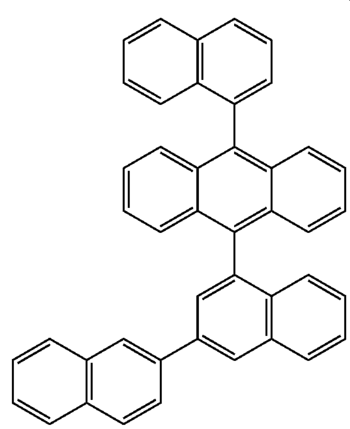
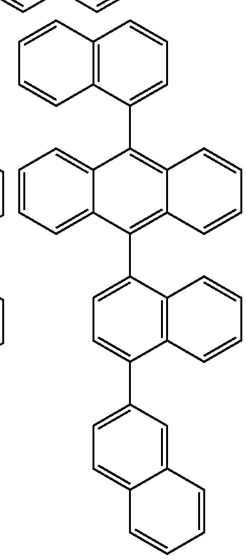

-continued
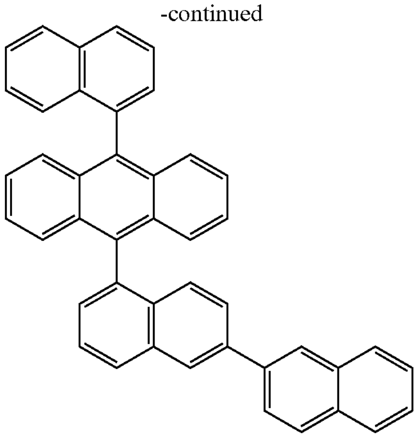
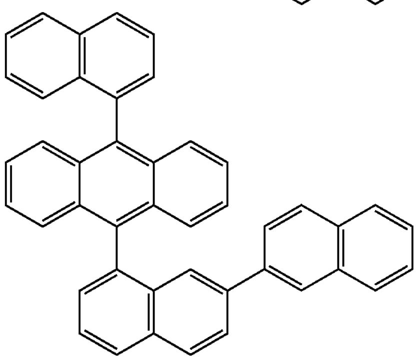
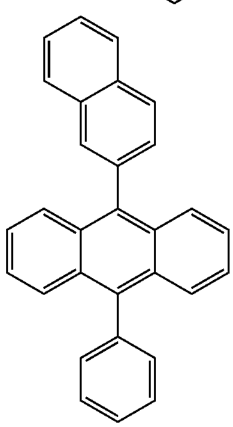
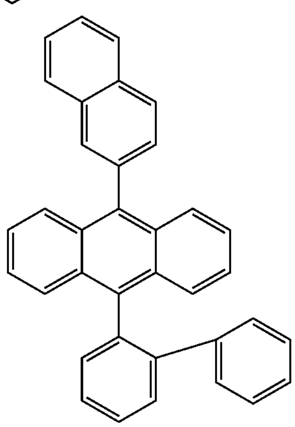
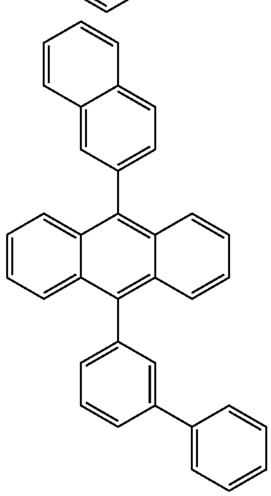
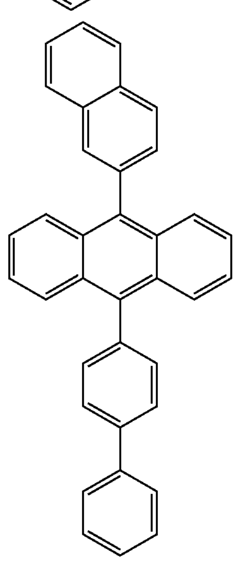
-continued
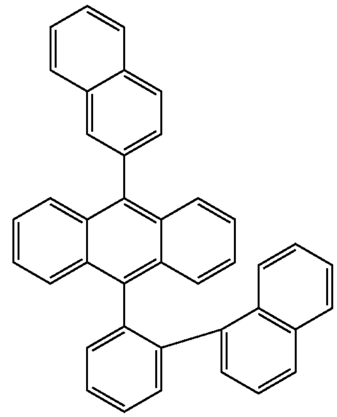
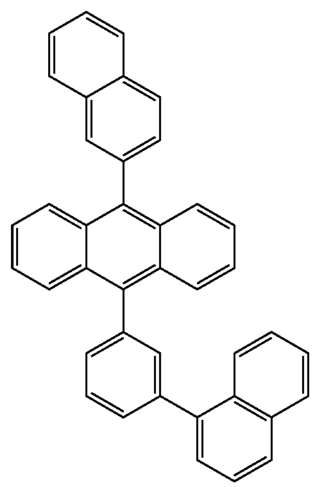
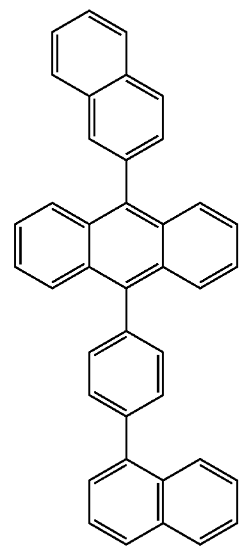
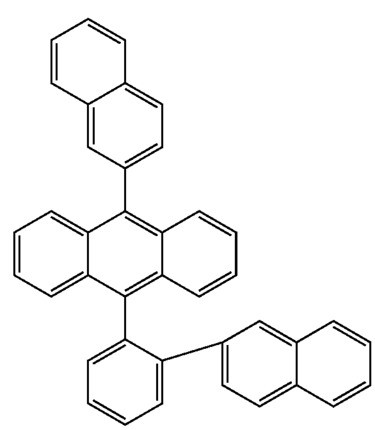

-continued
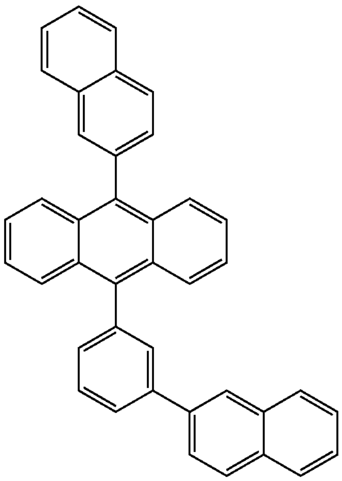
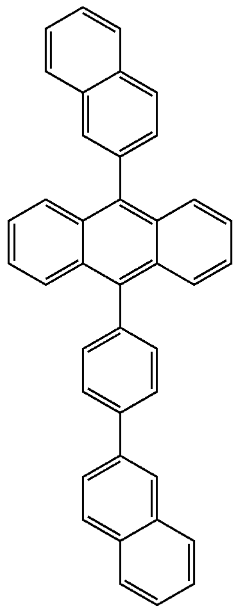
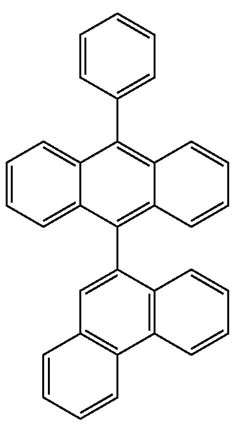
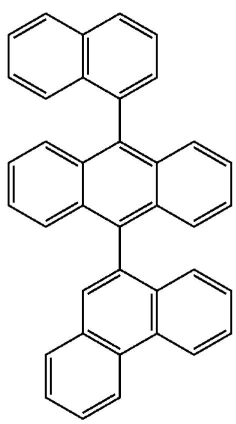
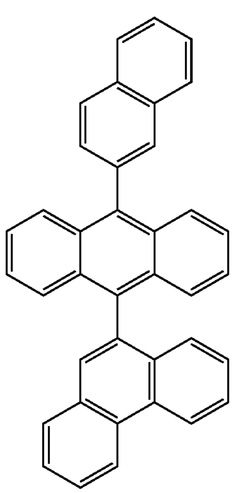
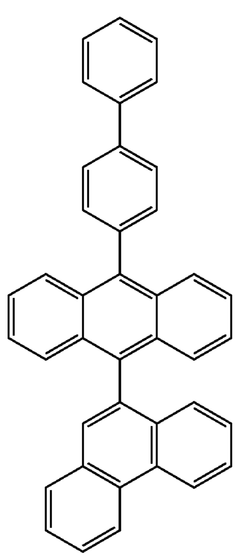
-continued
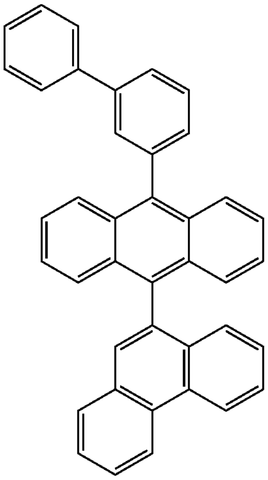
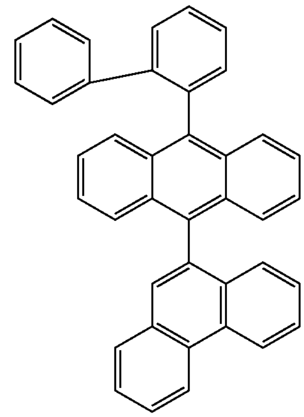
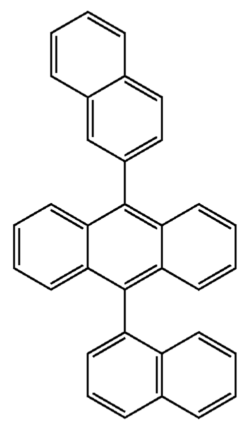
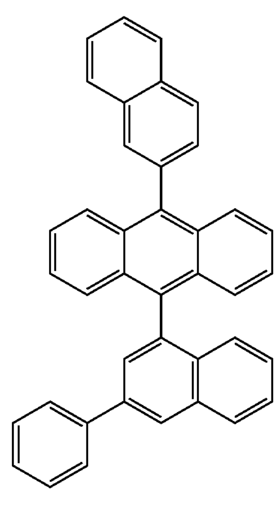
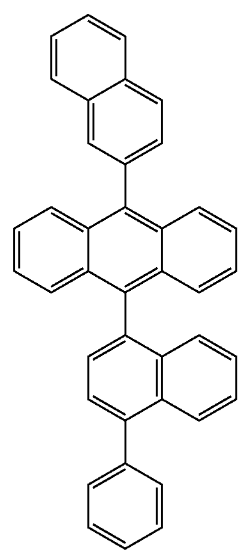

-continued
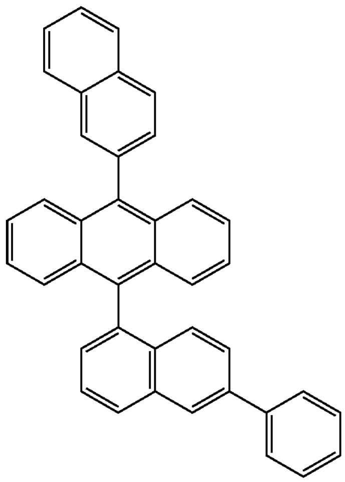
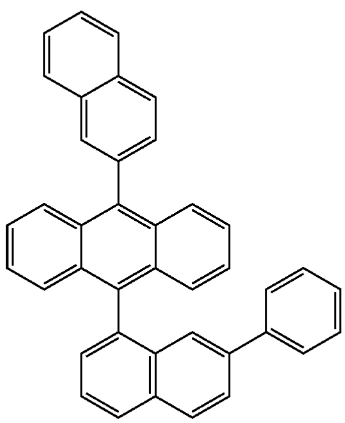
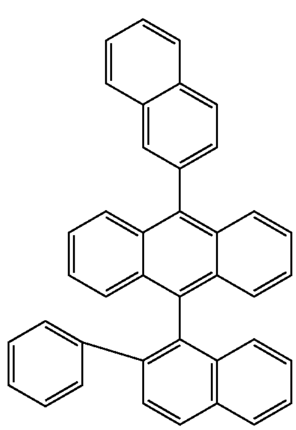
-continued
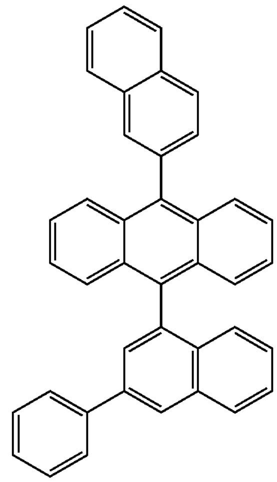
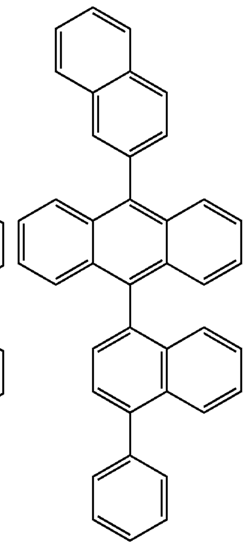
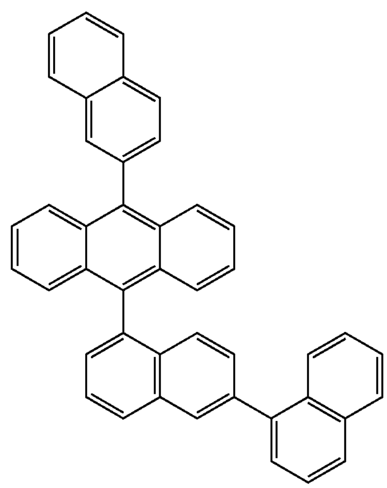
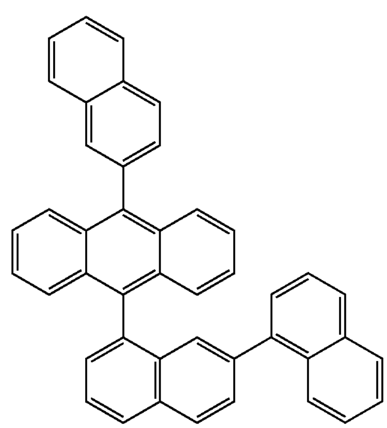

-continued
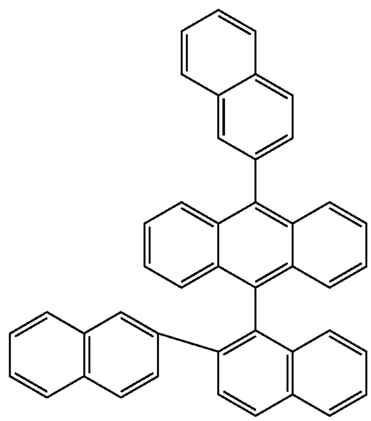
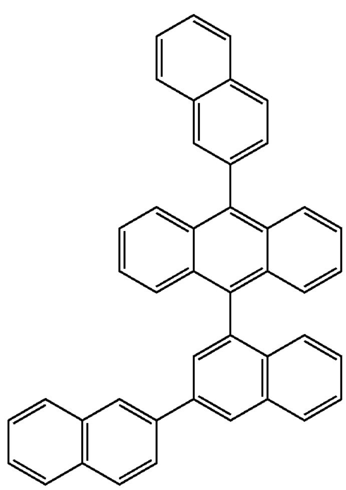
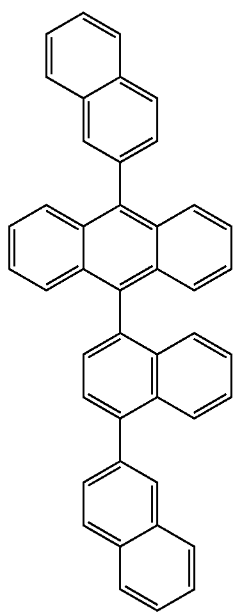
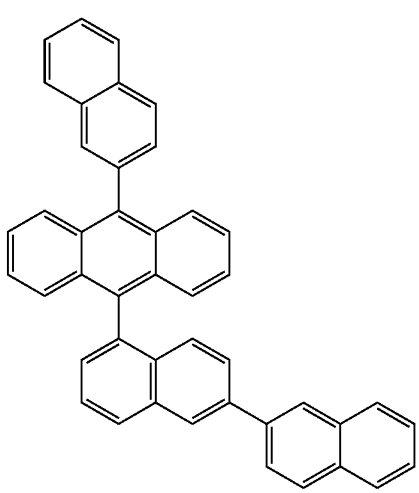
-continued
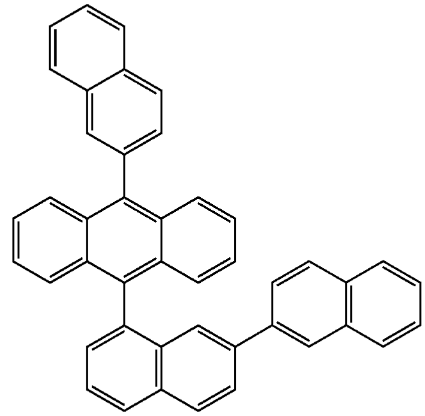
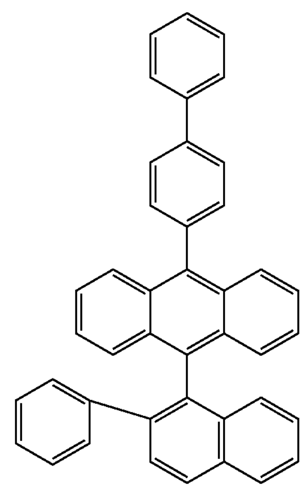
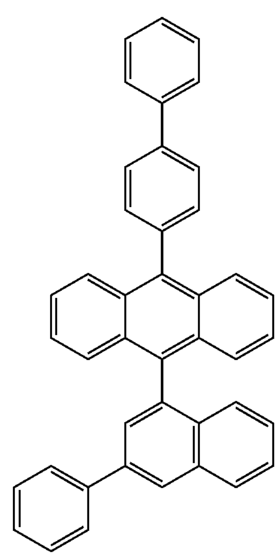
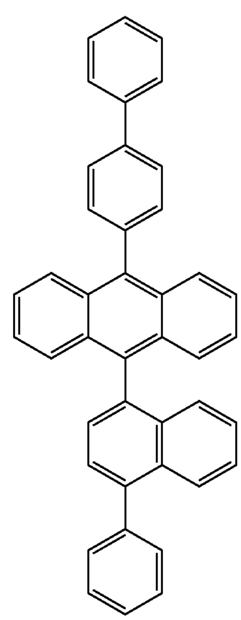

-continued
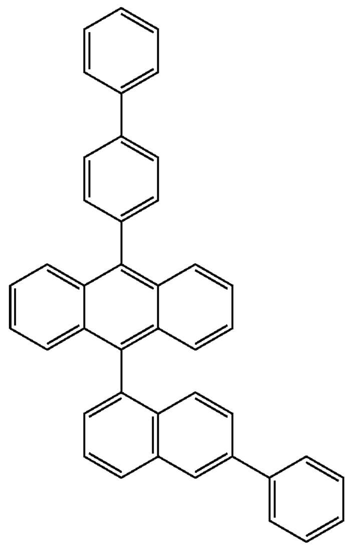
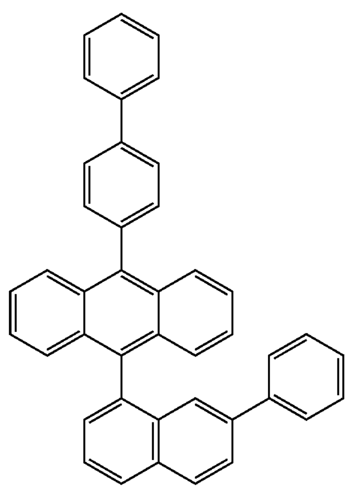
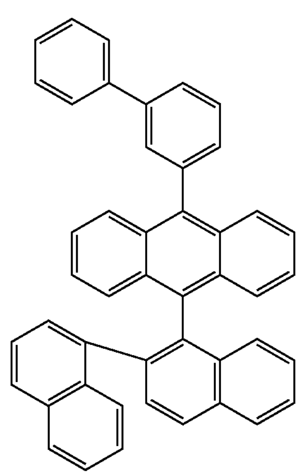
-continued
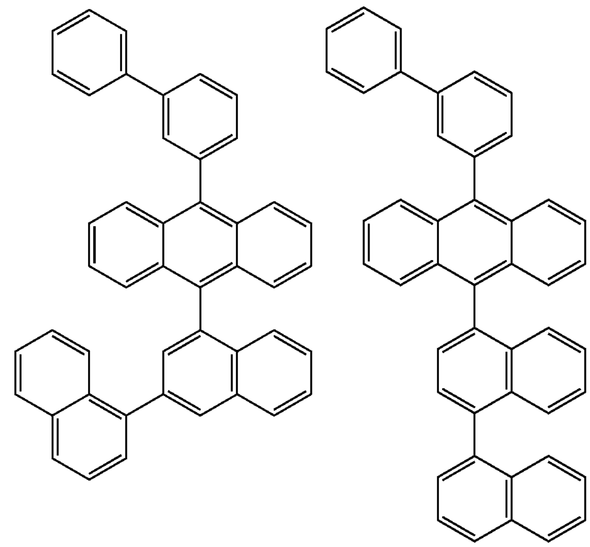
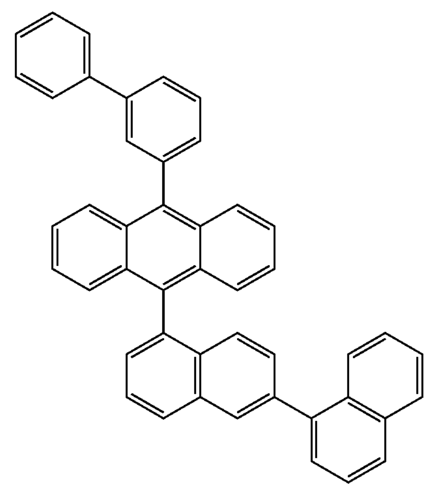
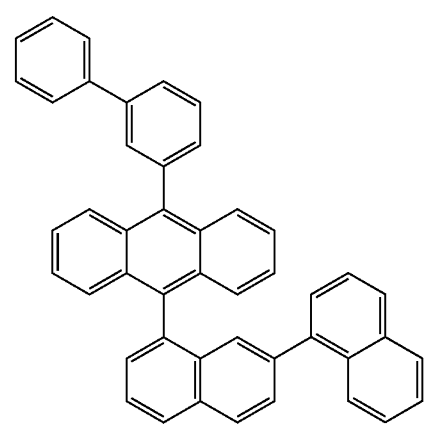

-continued
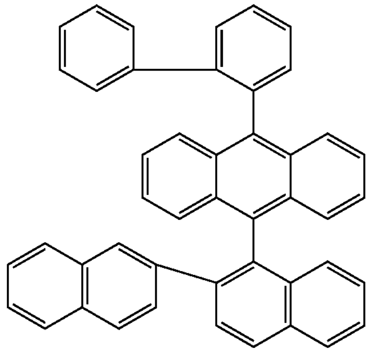
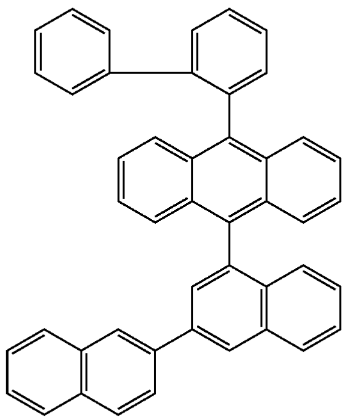
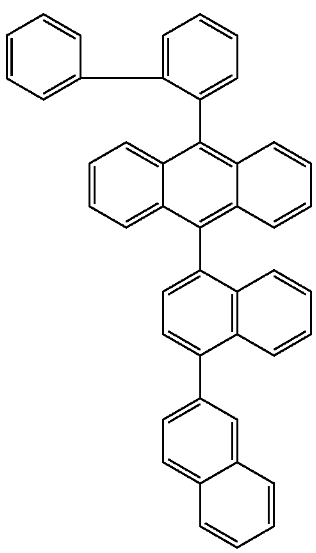
-continued
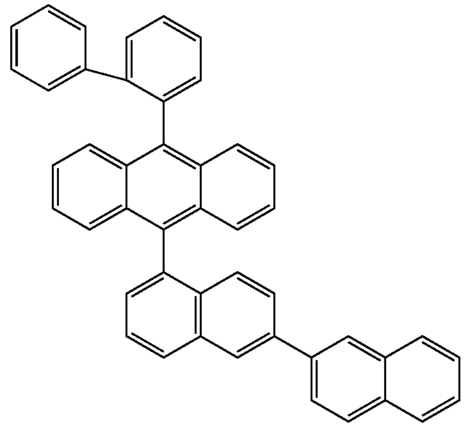
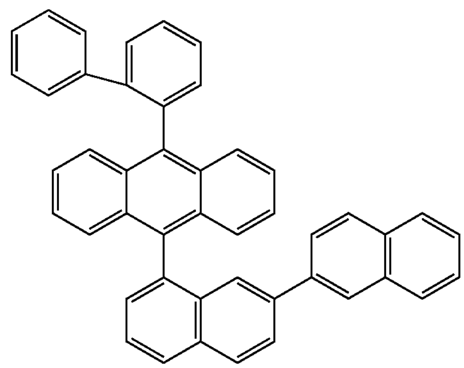
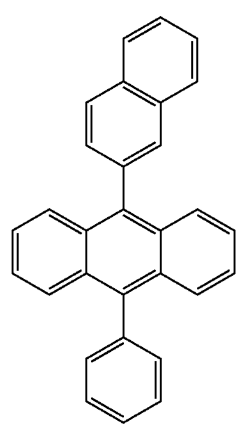
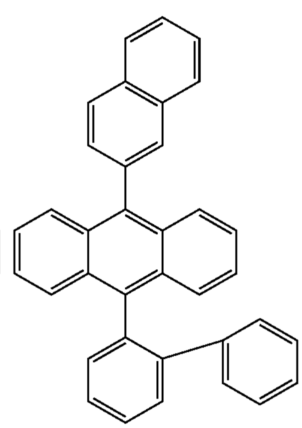

-continued
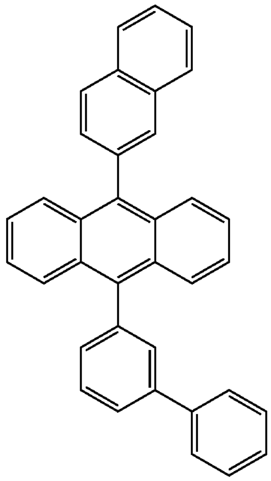
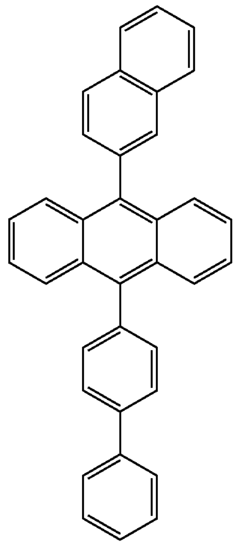
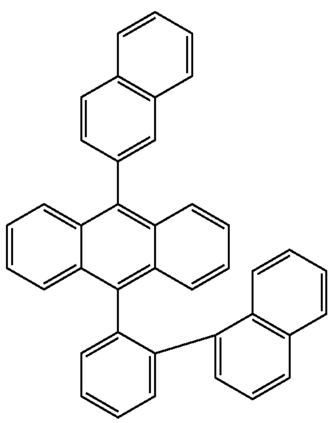
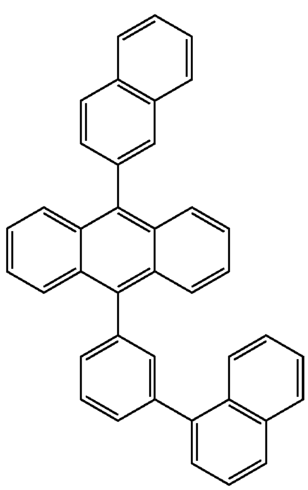
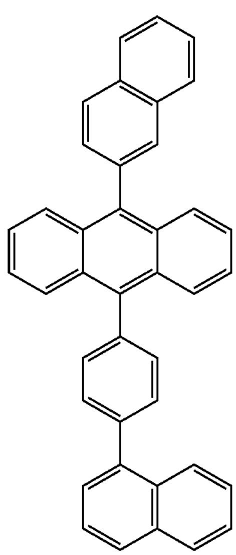
-continued
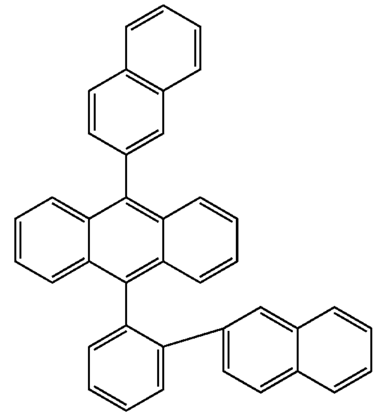
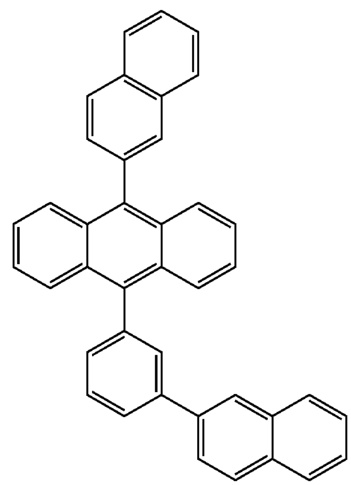
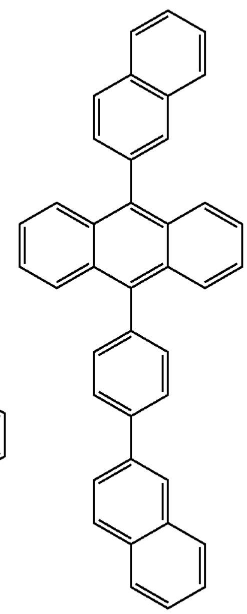
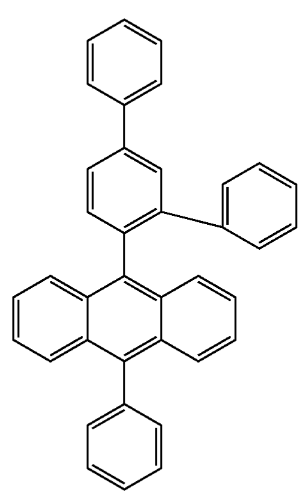

-continued
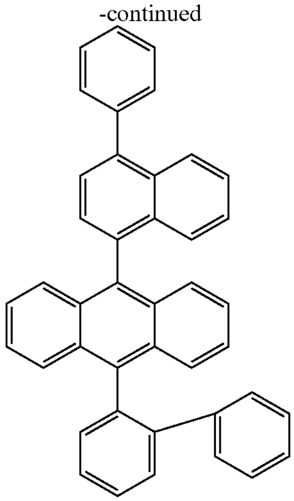
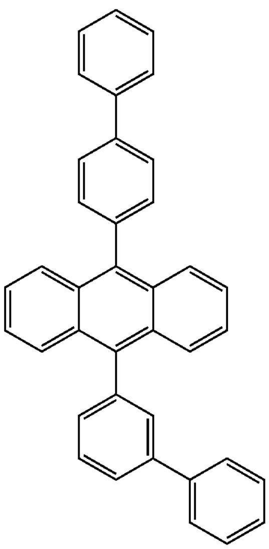
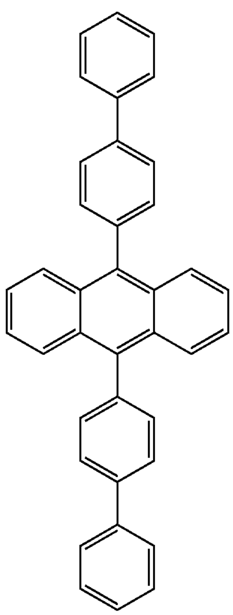
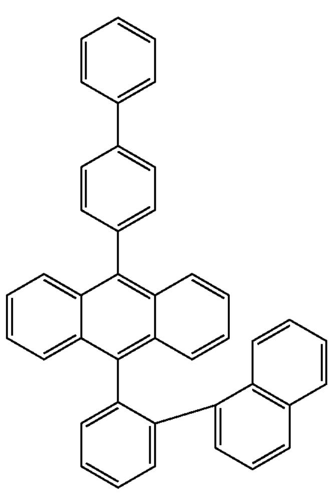
-continued
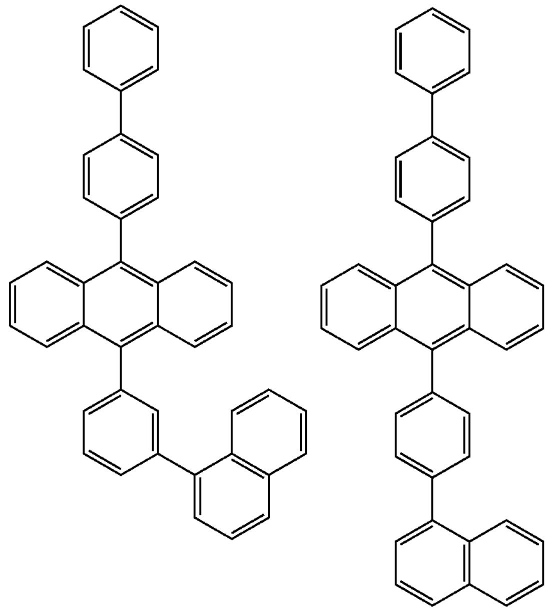
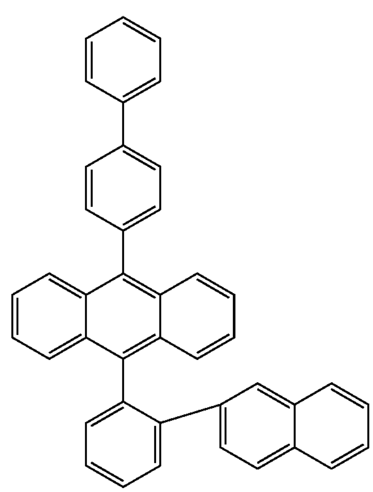

-continued
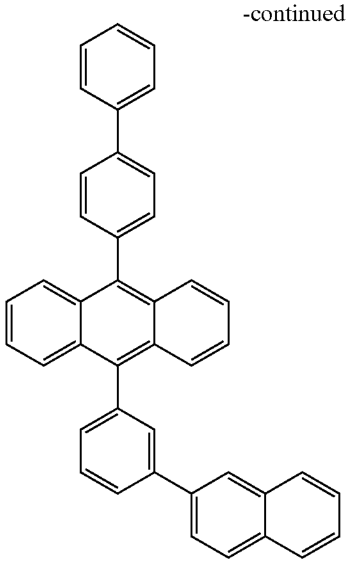
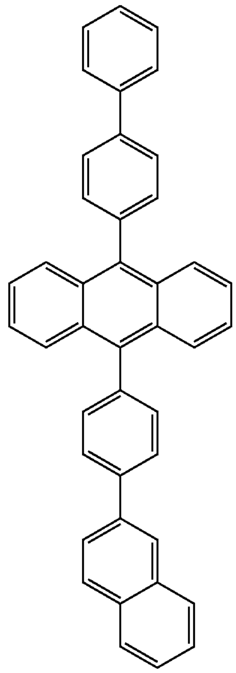
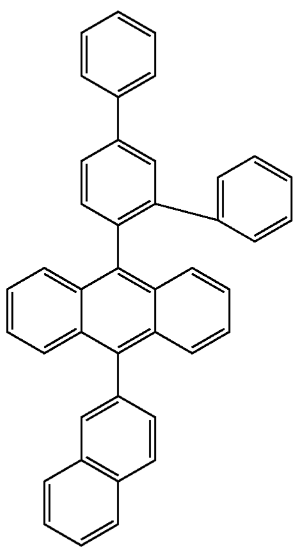
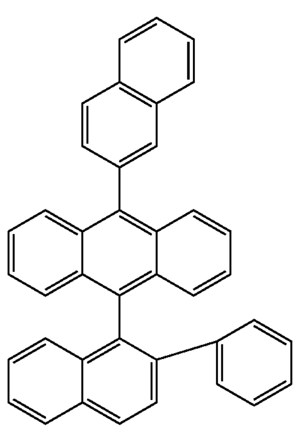
-continued
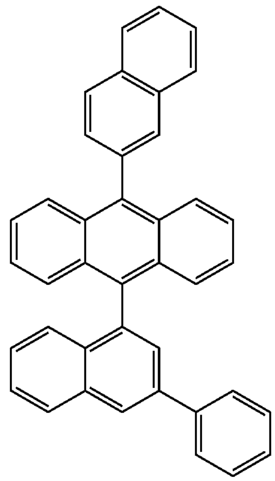
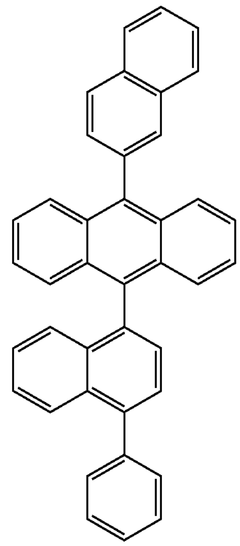
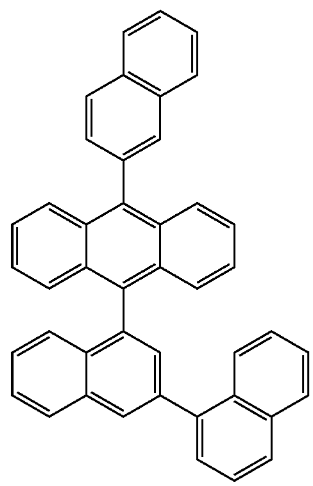
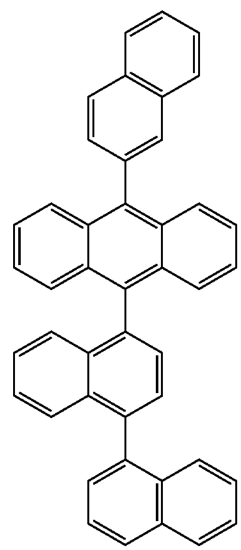
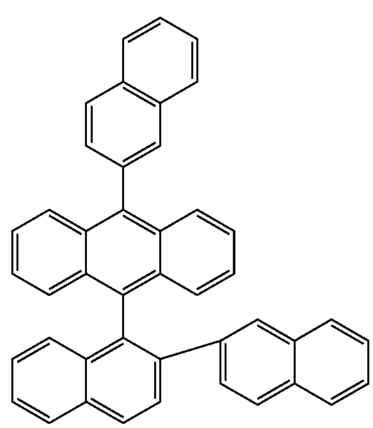

-continued
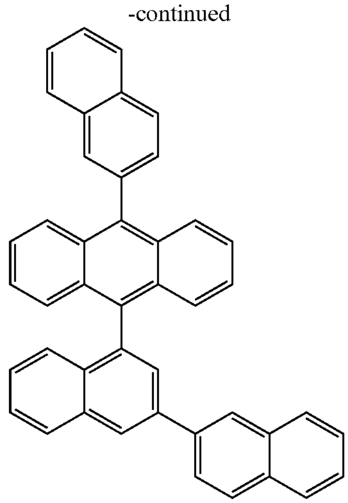
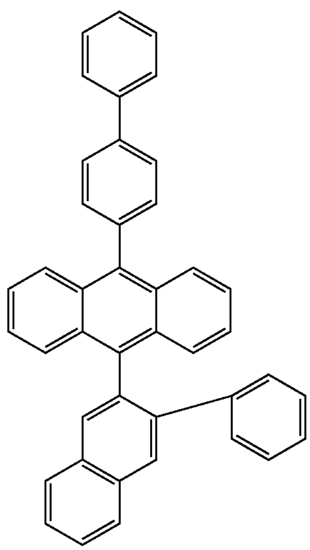
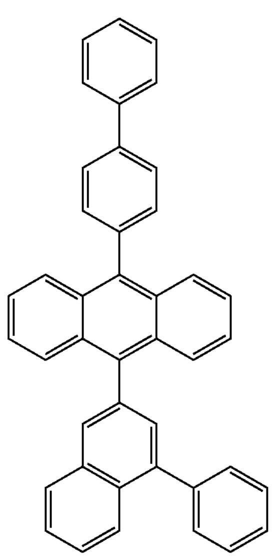
-continued
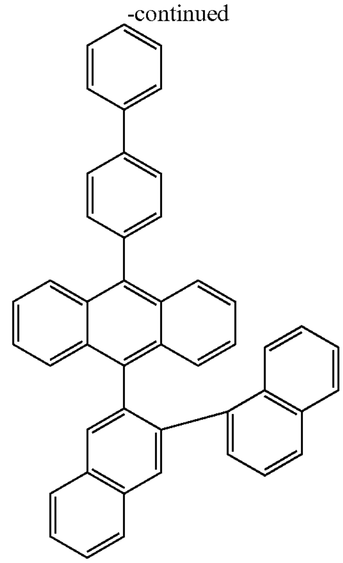
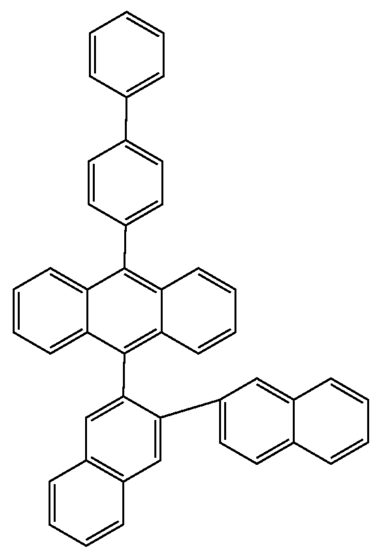
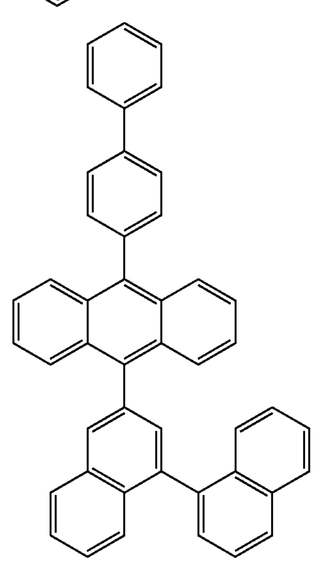

-continued
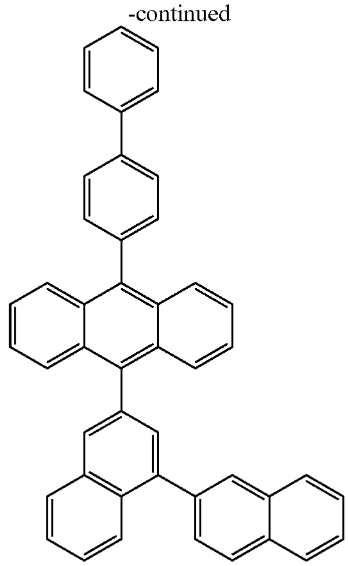
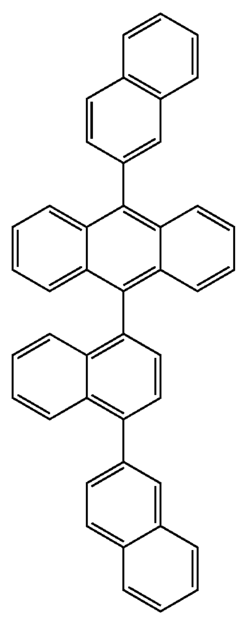
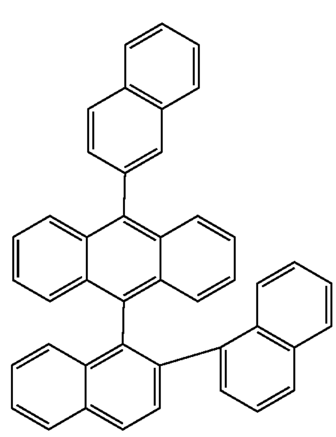
-continued
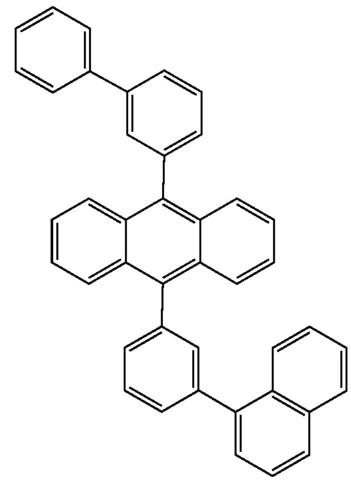
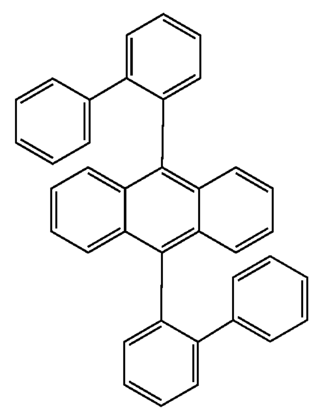
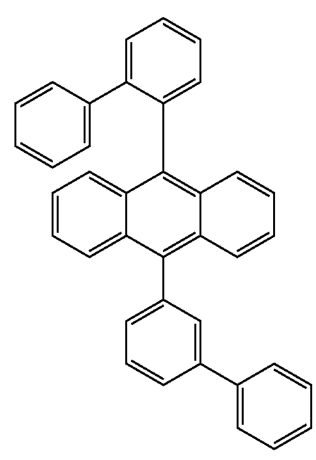

-continued
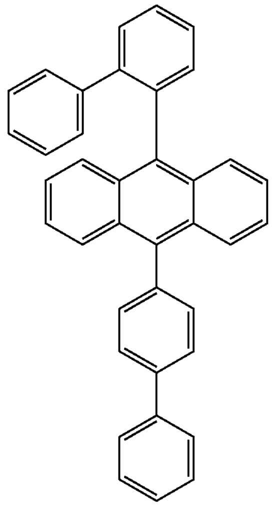
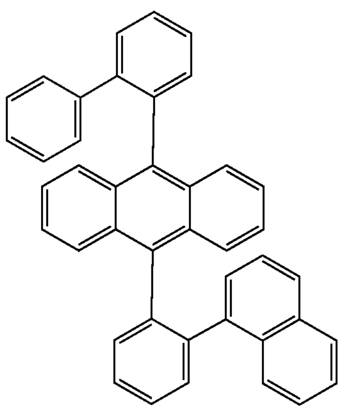
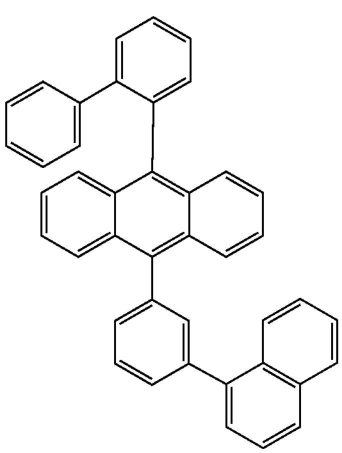
-continued
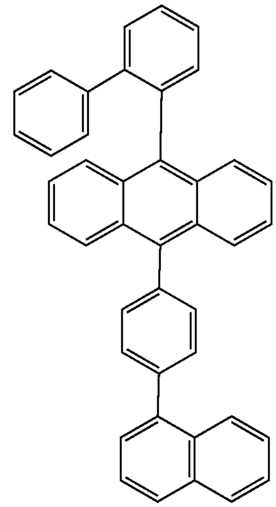
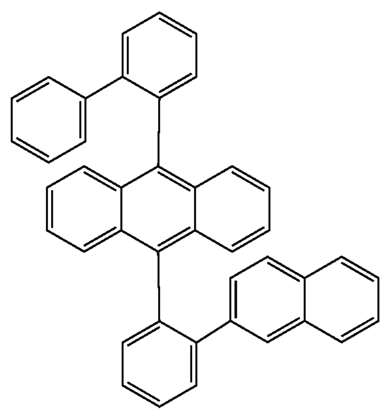
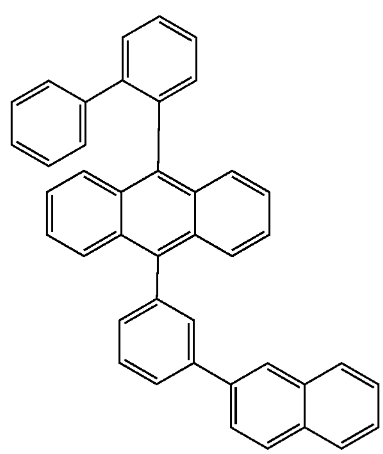

-continued
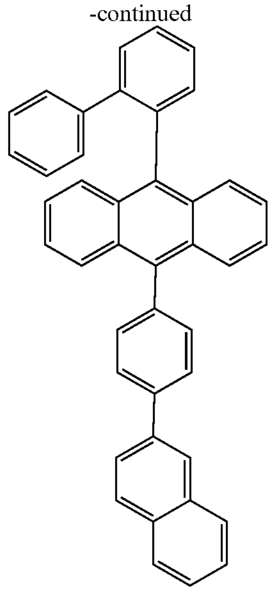
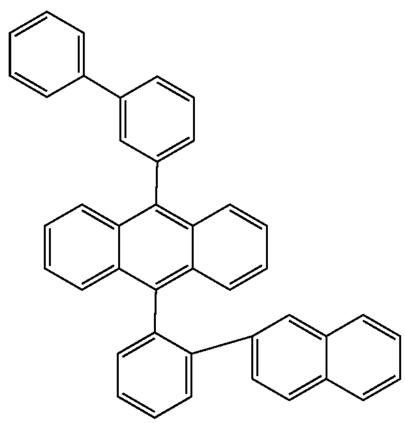
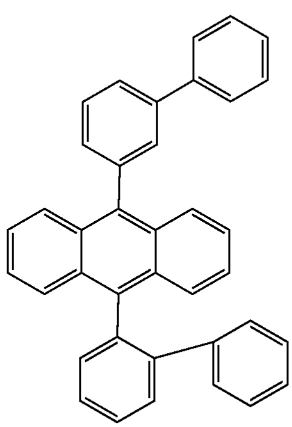
-continued
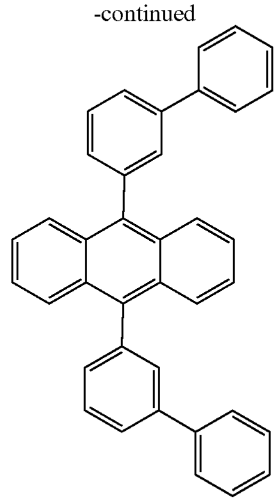
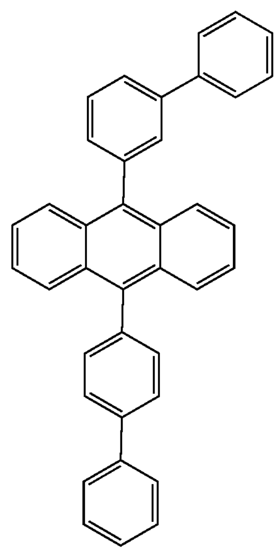
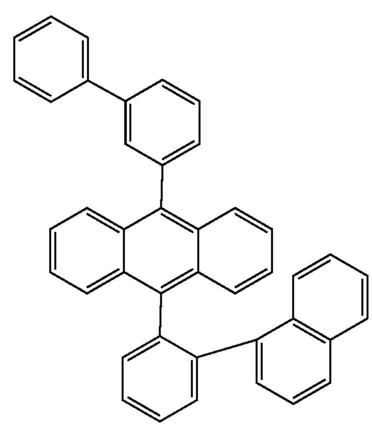

-continued
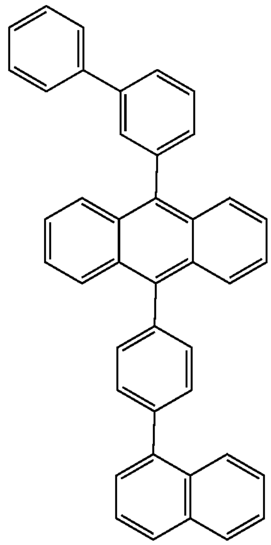
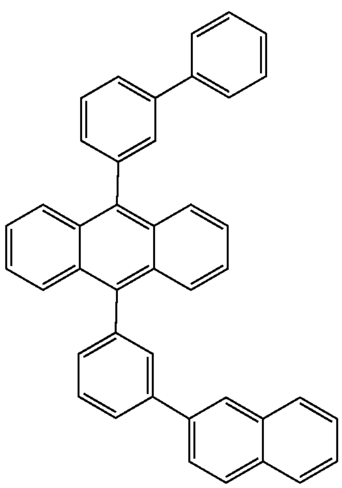
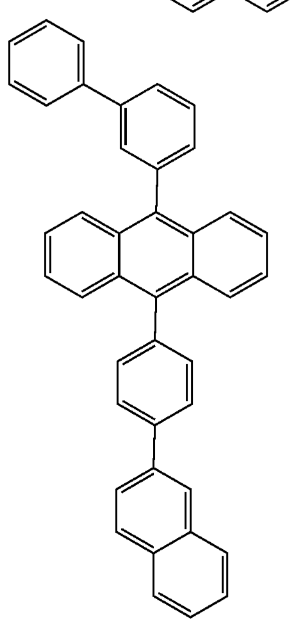
-continued
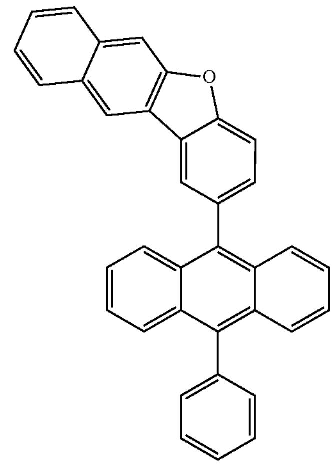
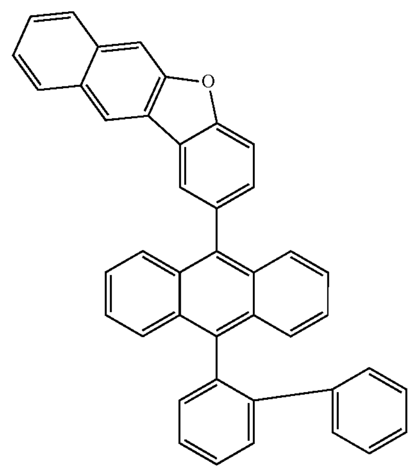
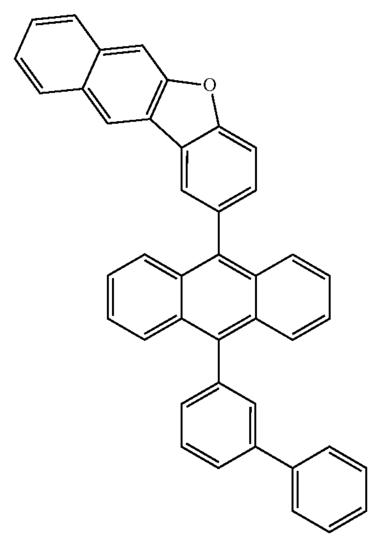

-continued
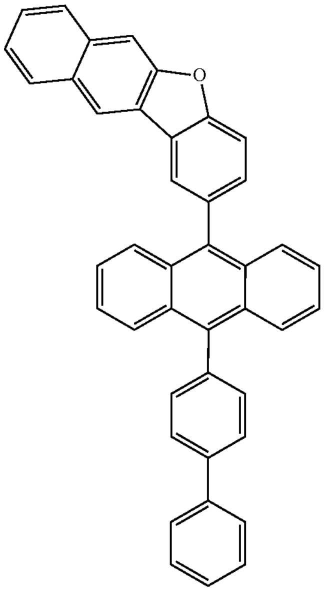
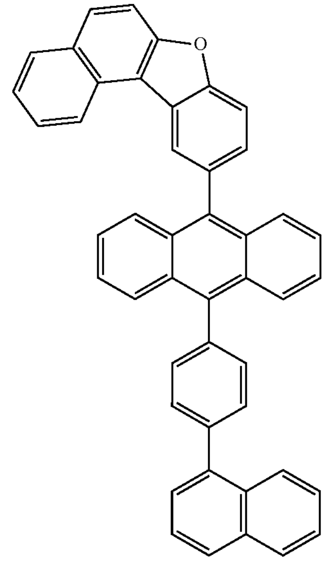
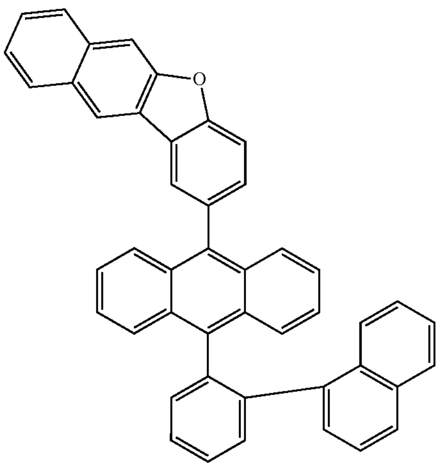
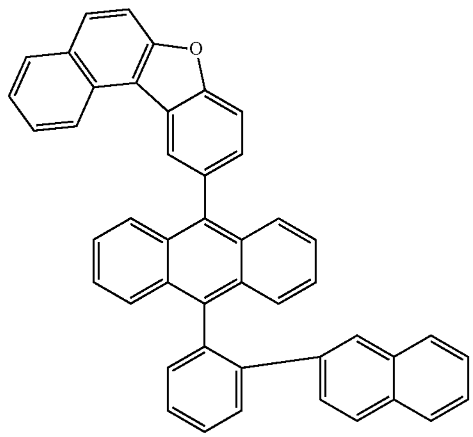
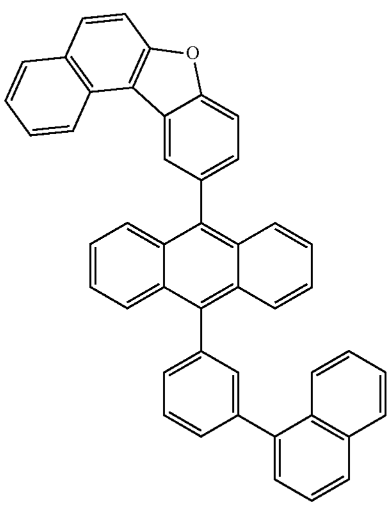
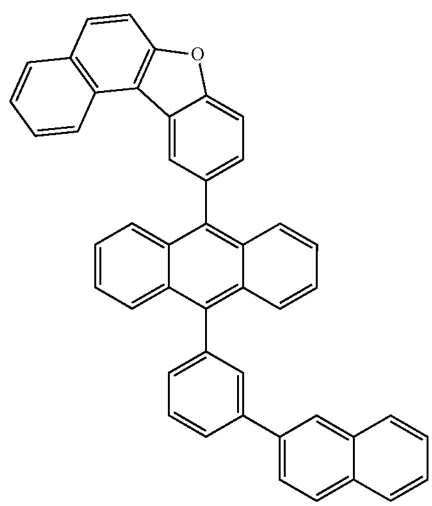

-continued
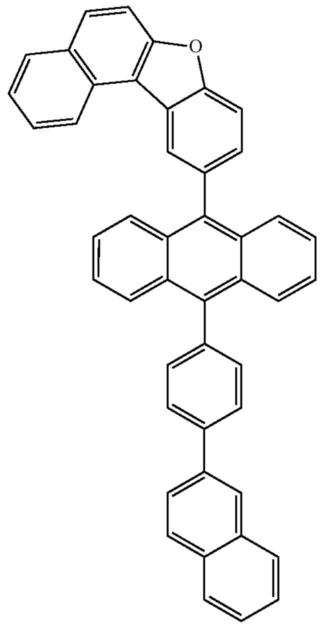
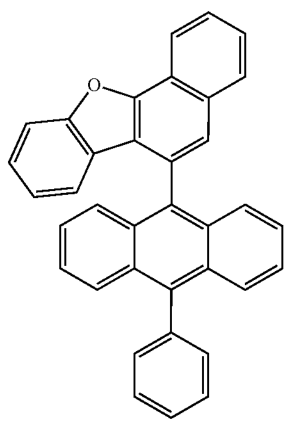
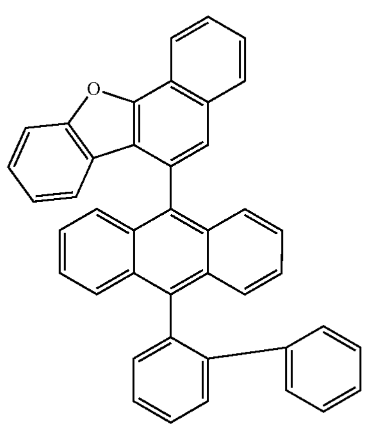
-continued
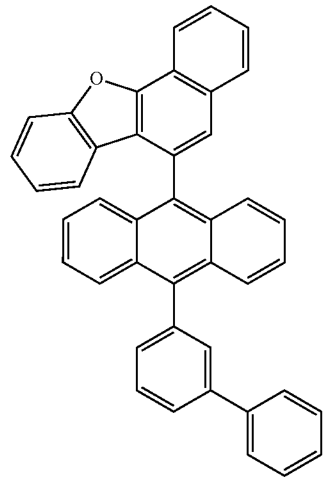
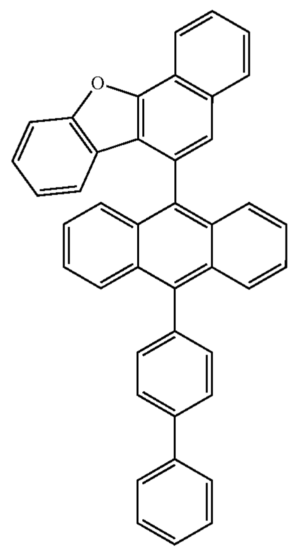
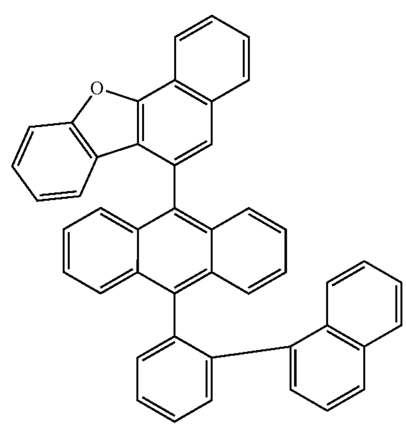

-continued
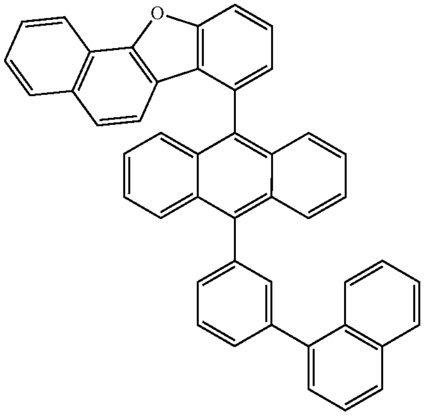
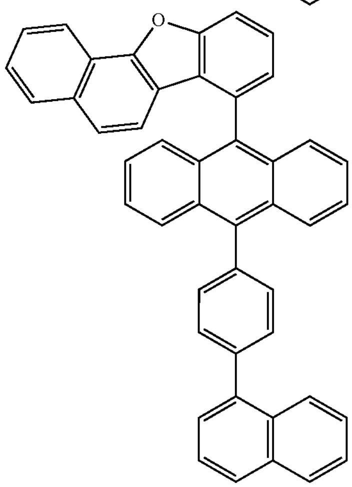
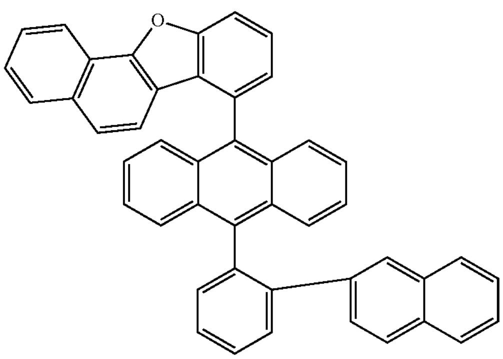
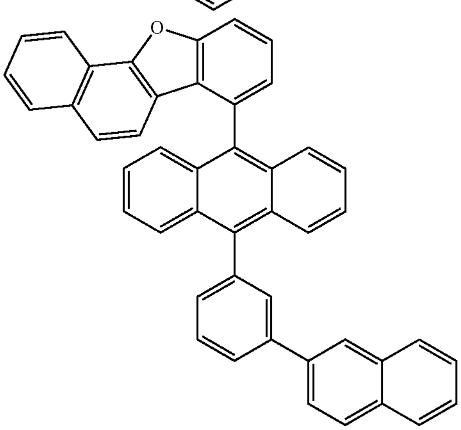
-continued
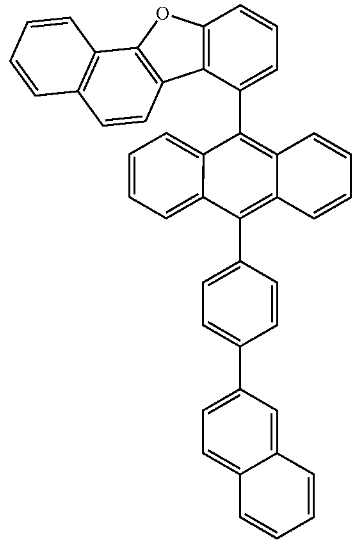
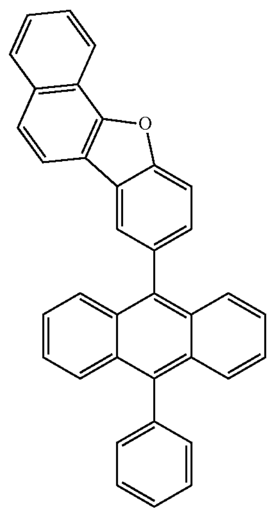
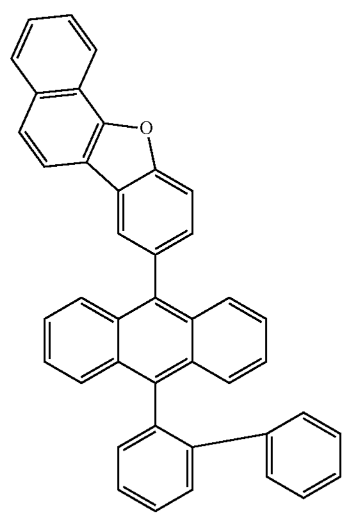

-continued
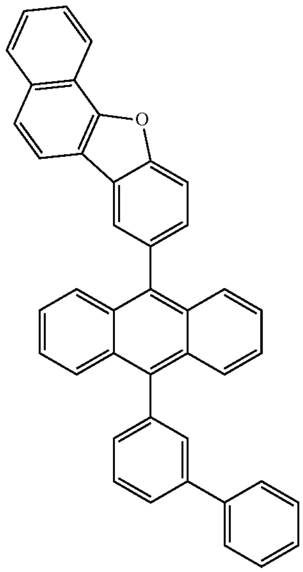
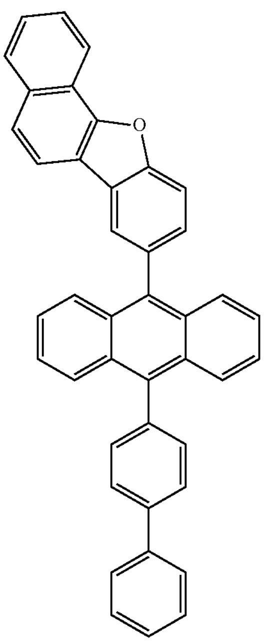
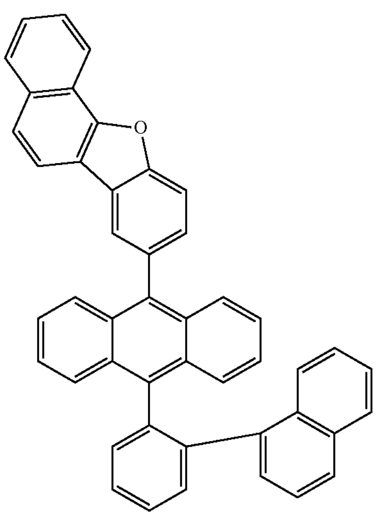
-continued
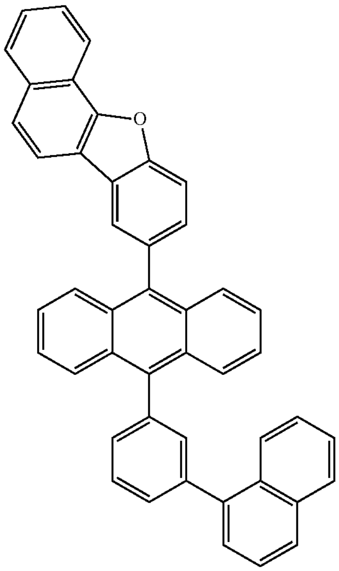
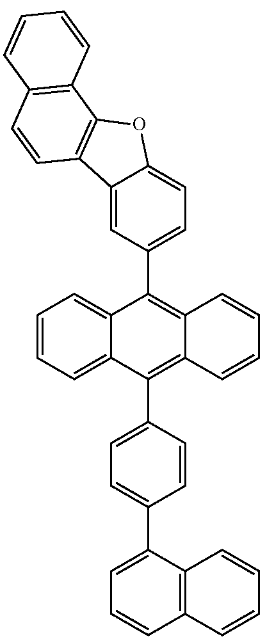
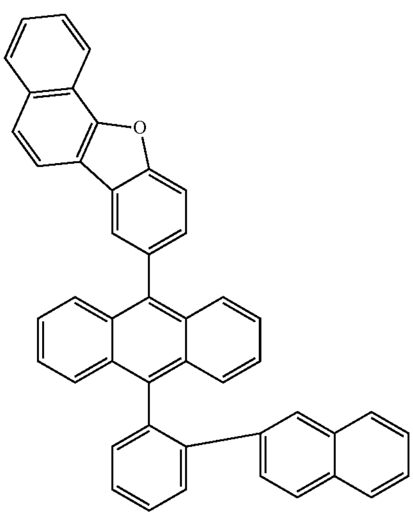

-continued
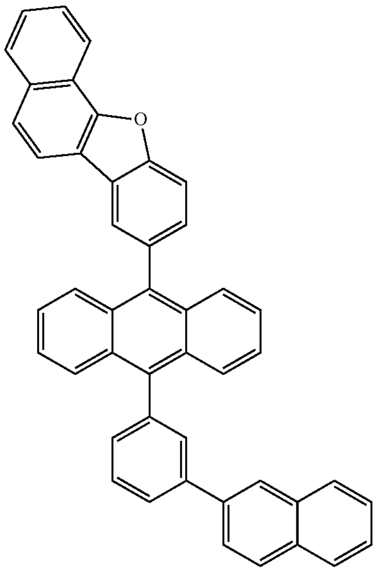
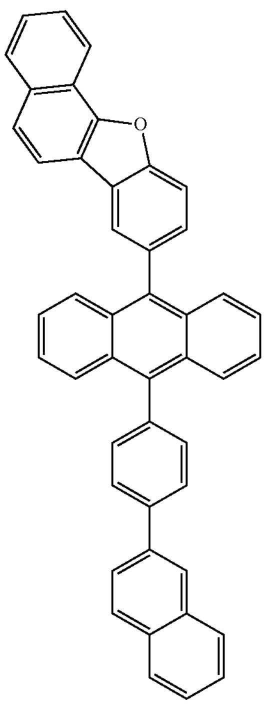
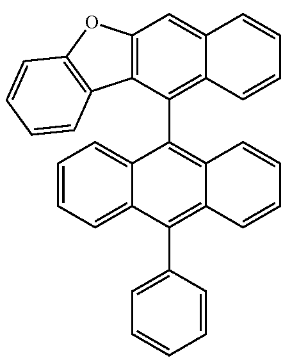
-continued
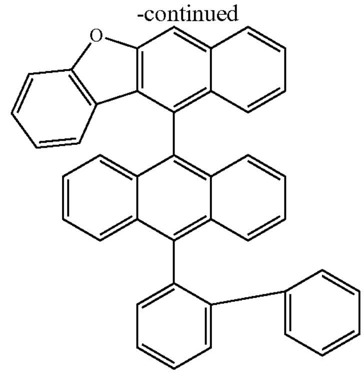
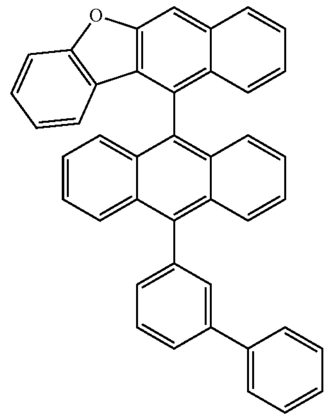
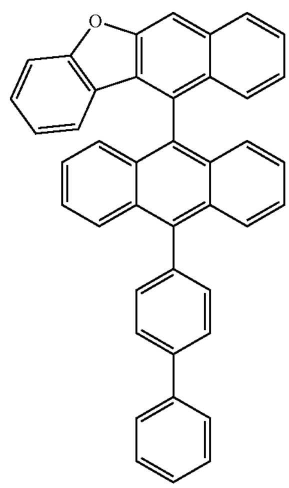
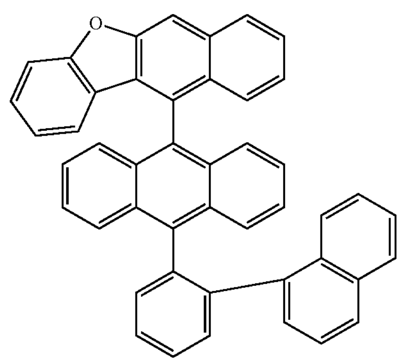

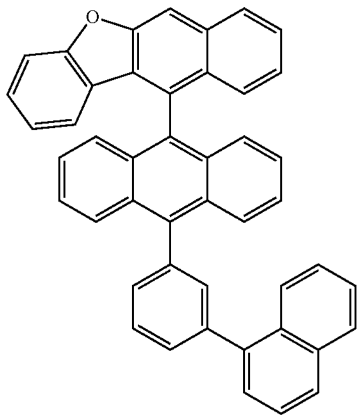
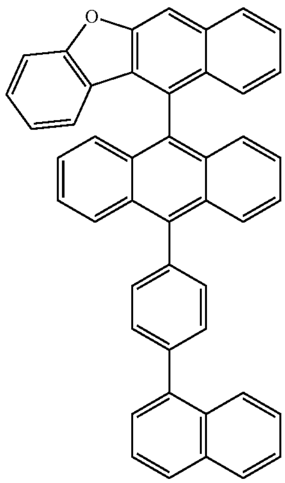
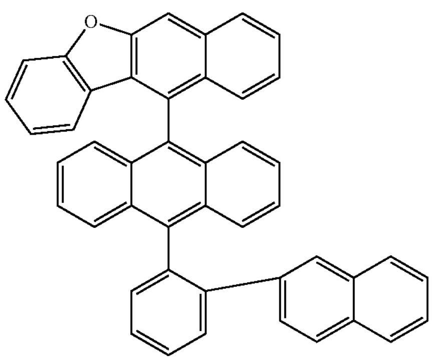
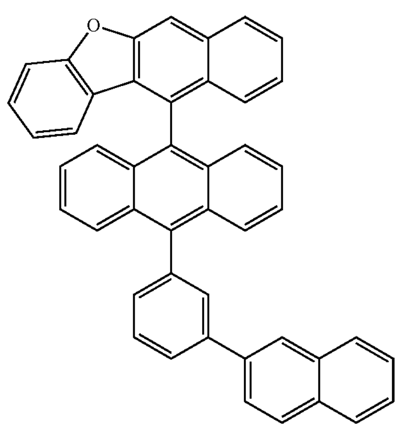
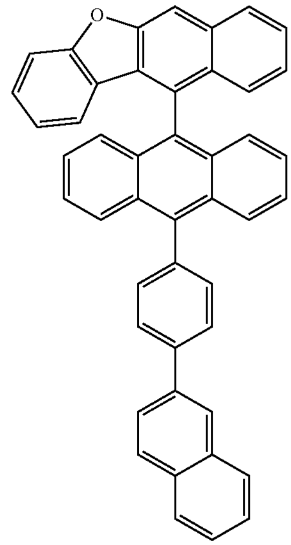
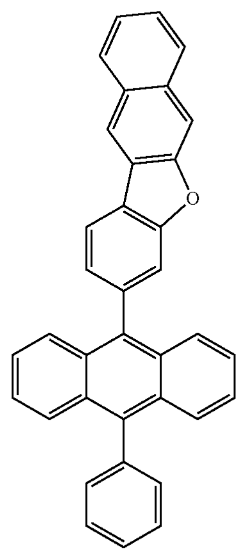
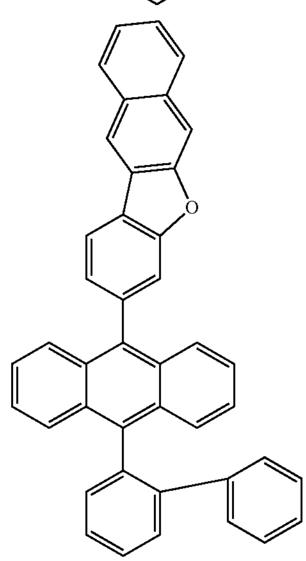

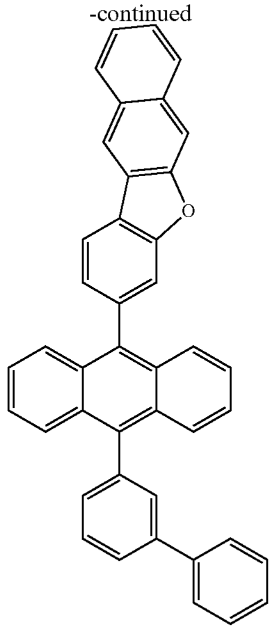
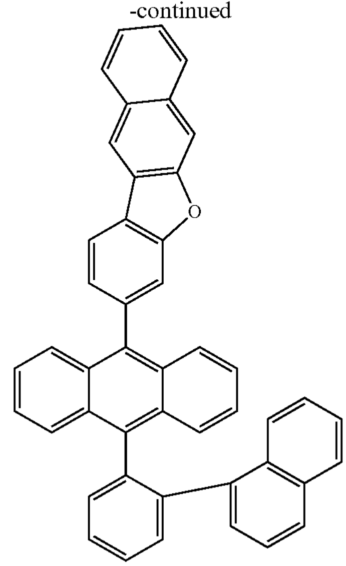
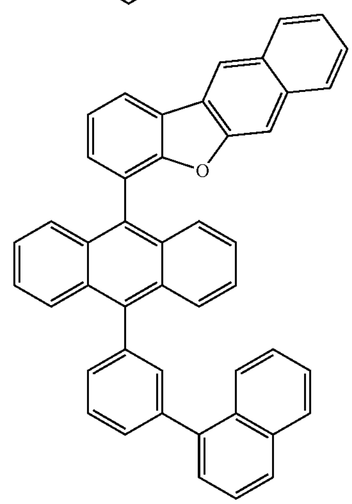
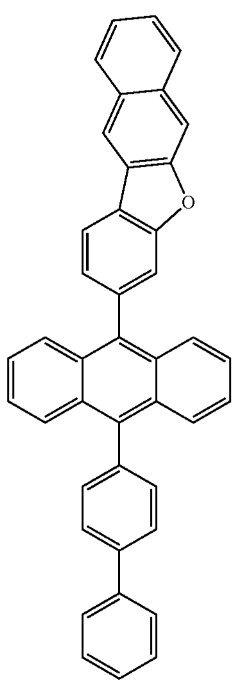
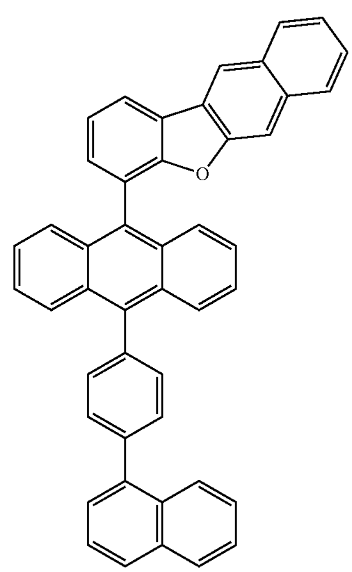

-continued
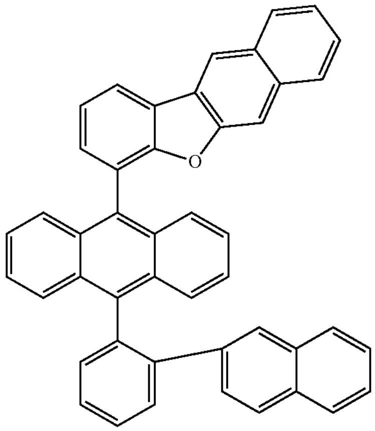
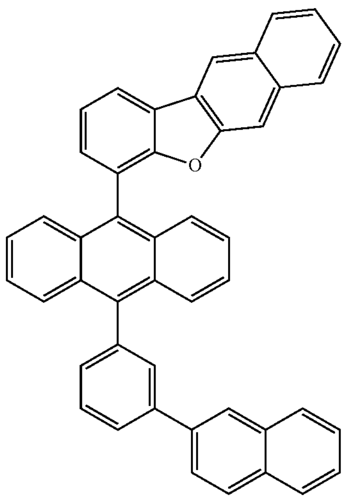
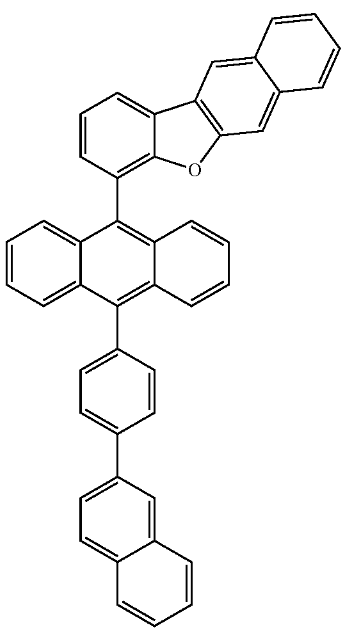
-continued
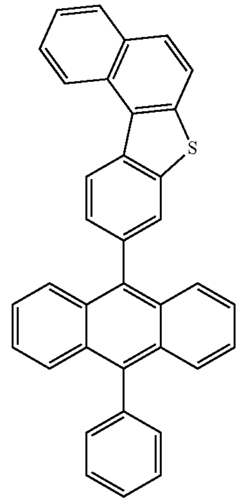
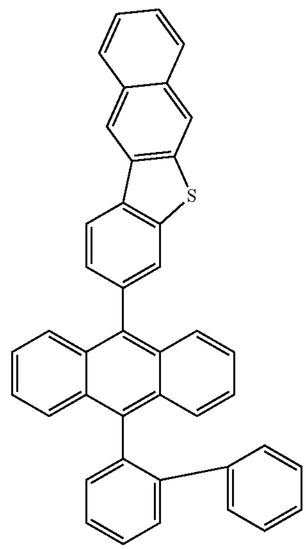
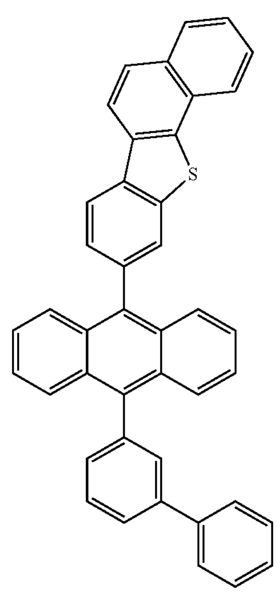

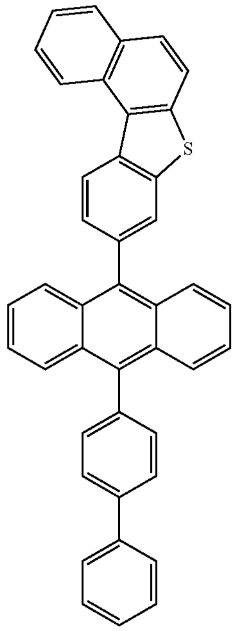
S
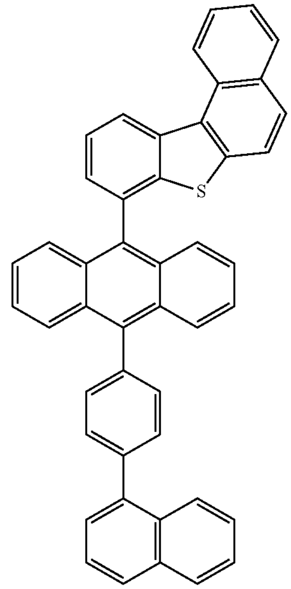
S
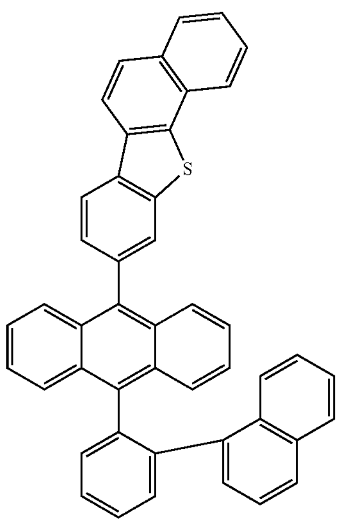
S
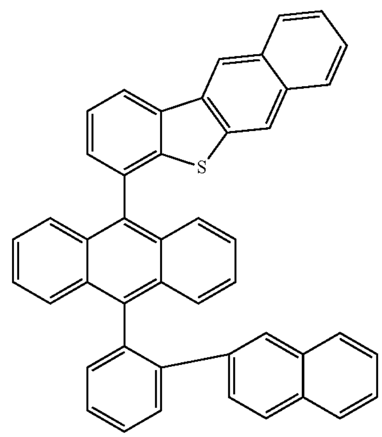
S
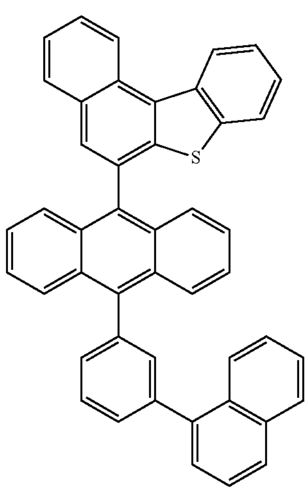
S
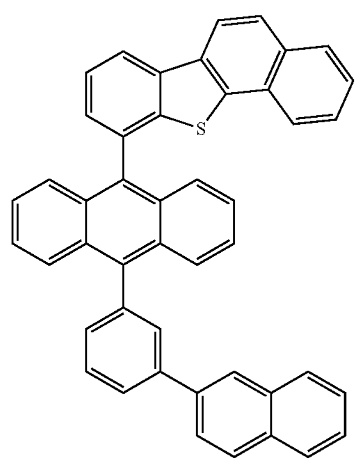
S -continued

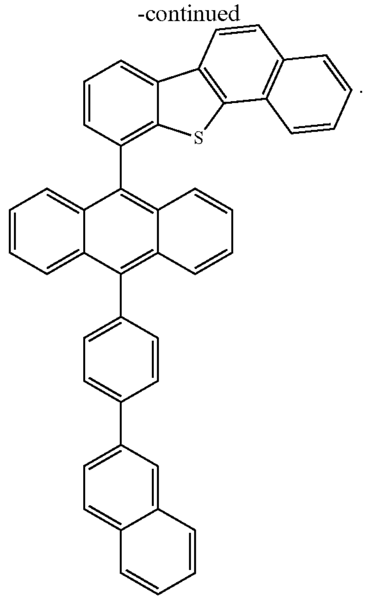

7. The organic light emitting device of claim 2, wherein, in Chemical Formula C, La to Lc are the same as or different from each other, and each independently is a direct bond; a phenylene group; a biphenylene group; or a terphenylene group.

8. The organic light emitting device of claim 2, wherein, in Chemical Formula C, Ara is a monovalent or higher benzofluorene group that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group; a monovalent or higher fluoranthene group that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group; a monovalent or higher pyrene group that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group; or a monovalent or higher chrysene group that is unsubstituted or substituted with deuterium, a halogen group, an alkyl group, a cycloalkyl group, a hydroxyl group, a silyl group, a nitrile group, a nitro group, an alkoxy group, an aryloxy group, an arylamine group, an alkylamine group, an alkylaryl group or an aryl group.

9. The organic light emitting device of claim 2, wherein, in Chemical Formula C, Arb and Arc are the same as or different from each other, and each independently is a phenyl group that is unsubstituted or substituted with deuterium, a methyl group, an ethyl group, an iso-propyl group, a tert-butyl group, a nitrile group, a phenyl group, a trimethylsilyl group or a trimethylgermanium group; a biphenyl group that is unsubstituted or substituted with deuterium, a methyl group, an ethyl group, an iso-propyl group, a tert-butyl group, a nitrile group, a phenyl group, a trimethylsilyl group or a trimethylgermanium group; a terphenyl group that is unsubstituted or substituted with deuterium, a methyl group, an ethyl group, an iso-propyl group, a tert-butyl group, a nitrile group, a phenyl group, a trimethylsilyl group or a trimethylgermanium group; or a dibenzofuran group that is unsubstituted or substituted with deuterium, a methyl group, an ethyl group, an iso-propyl group, a tert-butyl group, a nitrile group, a phenyl group, a trimethylsilyl group or a trimethylgermanium group.

10. The organic light emitting device of claim 2, wherein Chemical Formula C is one compound selected from among the following compounds:

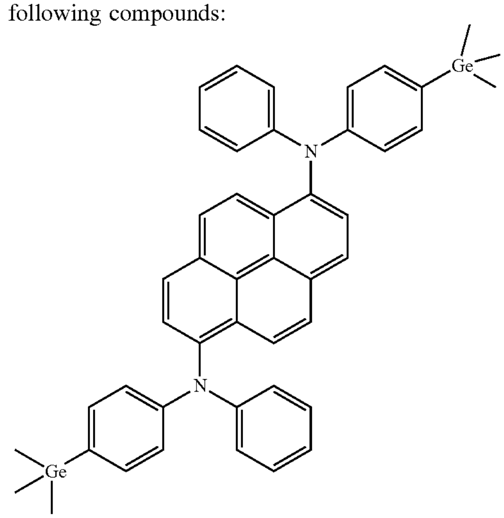

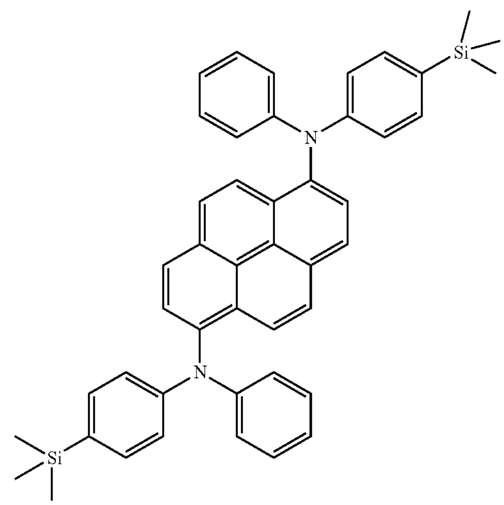

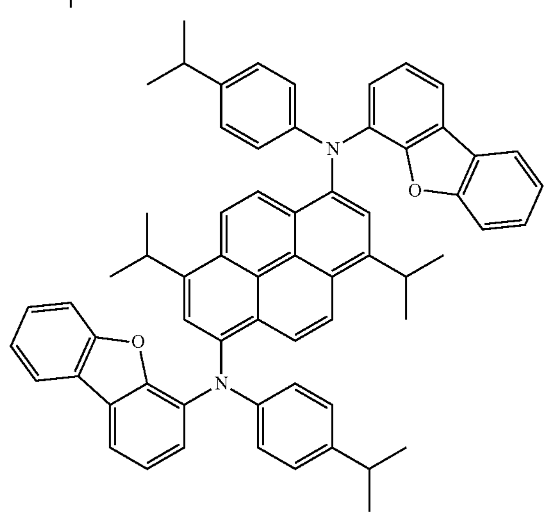

-continued
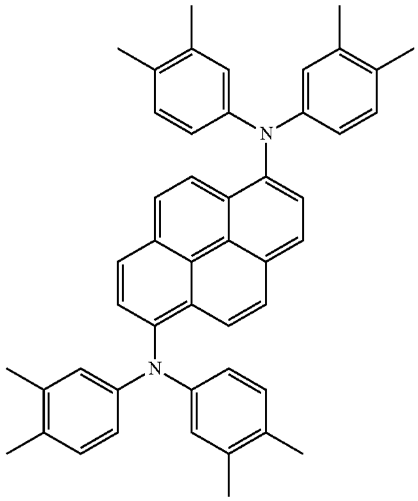
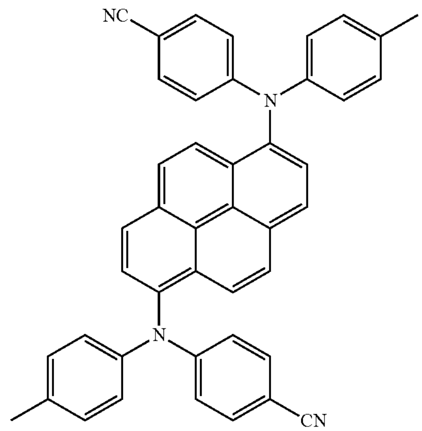
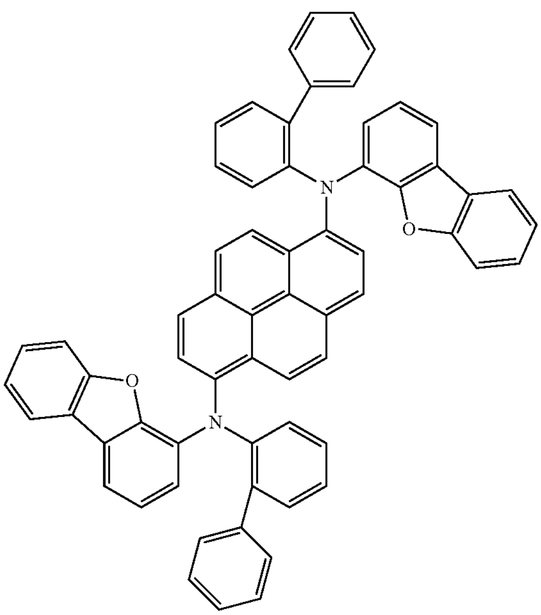
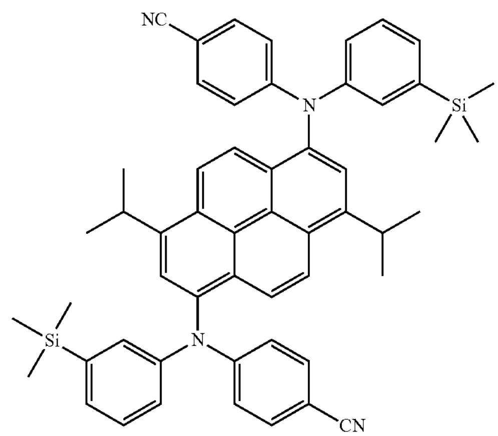
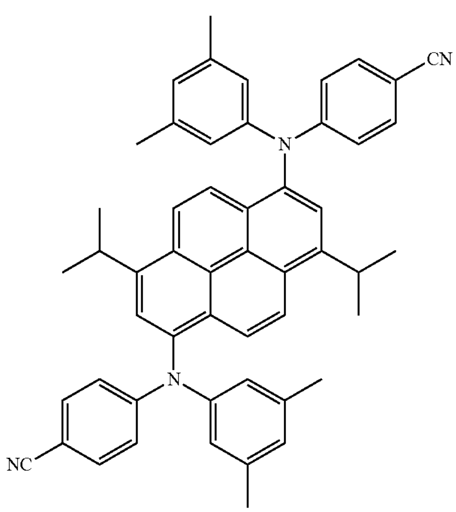
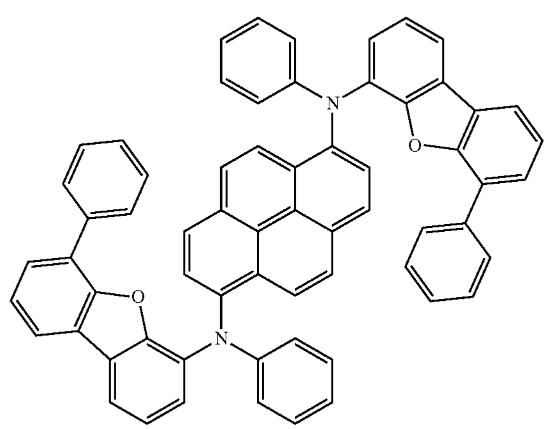

-continued

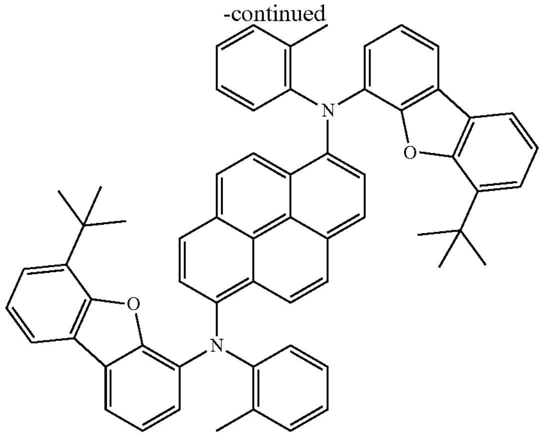

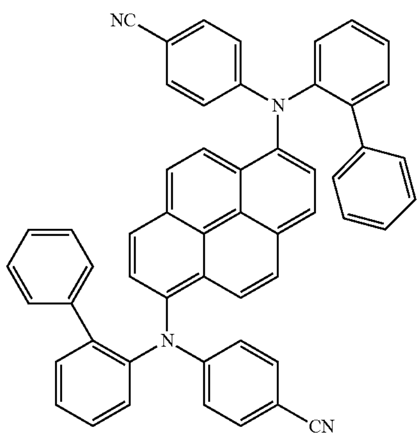

-continued

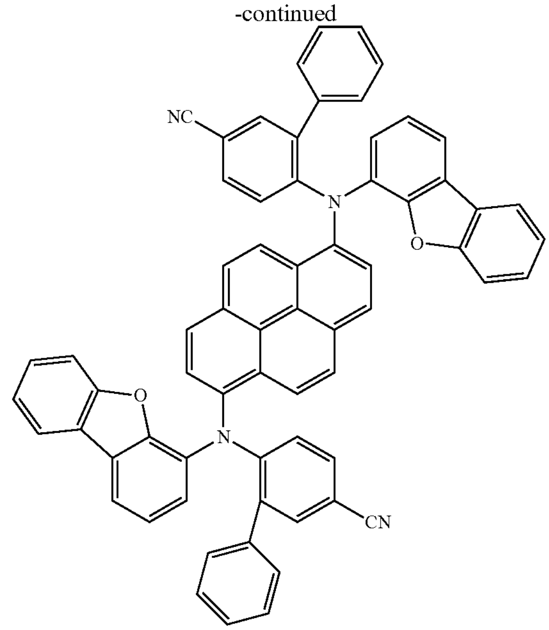

11. The organic light emitting device of claim 2, wherein, in Chemical Formula D, Ld to Lf are the same as or different from each other, and each independently is a direct bond, a phenylene group, a biphenylene group, or a terphenylene group.

12. The organic light emitting device of claim 2, wherein, in Chemical Formula D, Ard to Arf are the same as or different from each other, and each independently is hydrogen, a substituted or unsubstituted aryl group having 6 to 50 carbon atoms, or a substituted or unsubstituted heterocyclic group having 2 to 50 carbon atoms.

13. The organic light emitting device of claim 2, wherein the light emitting layer comprises the dopant material comprising the compound of Chemical Formula C or D in 0.5% by weight to 20% by weight based on the whole host material and dopant material included in the light emitting layer.

* * * * *